US012628551B2

(12) United States Patent
Ha et al.

(10) Patent No.: US 12,628,551 B2
(45) Date of Patent: May 12, 2026

(54) ORGANIC LIGHT-EMITTING DEVICE

(71) Applicant: LG CHEM, LTD., Seoul (KR)

(72) Inventors: Jae Seung Ha, Daejeon (KR); Dong Uk Heo, Daejeon (KR); Min Woo Lee, Daejeon (KR); Sung Jae Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 230 days.

(21) Appl. No.: 16/760,173

(22) PCT Filed: Feb. 22, 2019

(86) PCT No.: PCT/KR2019/002196
§ 371 (c)(1),
(2) Date: Apr. 29, 2020

(87) PCT Pub. No.: WO2019/164327
PCT Pub. Date: Aug. 29, 2019

(65) Prior Publication Data

US 2020/0365814 A1 Nov. 19, 2020

(30) Foreign Application Priority Data

Feb. 23, 2018 (KR) ........................ 10-2018-0022088

(51) Int. Cl.
*H10K 85/60* (2023.01)
*H10K 50/18* (2023.01)
*H10K 50/16* (2023.01)

(52) U.S. Cl.
CPC ......... *H10K 85/615* (2023.02); *H10K 85/622* (2023.02); *H10K 85/633* (2023.02);
(Continued)

(58) Field of Classification Search
CPC ............. H01L 51/0052; H01L 51/0054; H01L 51/0059; H01L 51/006; H01L 51/0061;
(Continued)

(56) References Cited

U.S. PATENT DOCUMENTS

| | | | | |
|---|---|---|---|---|
| 2004/0100190 A1* | 5/2004 | Kim | H10K 50/18 313/504 |
| 2004/0251816 A1 | 12/2004 | Leo et al. | |

(Continued)

FOREIGN PATENT DOCUMENTS

| | | |
|---|---|---|
| CN | 104981471 A | 10/2015 |
| CN | 105399658 A | 3/2016 |

(Continued)

OTHER PUBLICATIONS

Machine translation of JP-2006083073-A (Year: 2006).*
WO 2019135665 A1 machine translation (Year: 2019).*

*Primary Examiner* — Elizabeth M. Dahlburg
(74) *Attorney, Agent, or Firm* — Bryan Cave Leighton Paisner LLP

(57) ABSTRACT

Provided is an organic light-emitting device including: a first electrode; a second electrode provided to face the first electrode; and a first organic material layer and a second
(Continued)

organic material layer provided between the first electrode and the second electrode, in which the first organic material layer includes a compound of Formula 1:

[Formula 1]

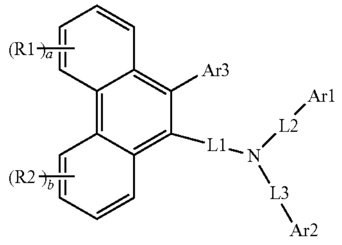

wherein L1 to L3 are each independently a direct bond or a substituted or unsubstituted arylene group; and Ar1 to Ar3 are each independently a hydrogen, deuterium, or a substituted or unsubstituted aryl or heterocyclic group;

and the second organic material layer includes a compound represented by of Formula 2:

[Formula 2]

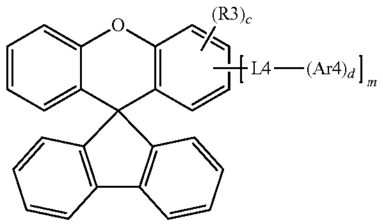

wherein L4 is a direct bond, or a substituted or unsubstituted arylene or divalent heterocyclic group; and Ar4 is a substituted or unsubstituted aryl, phosphine oxide or heterocyclic group.

18 Claims, 2 Drawing Sheets

(52) U.S. Cl.
CPC ......... *H10K 85/654* (2023.02); *H10K 85/656* (2023.02); *H10K 85/6572* (2023.02); *H10K 85/6574* (2023.02); *H10K 85/6576* (2023.02); *H10K 50/16* (2023.02); *H10K 50/18* (2023.02)

(58) Field of Classification Search
CPC ............. H01L 51/0067; H01L 51/0069; H01L 51/0071; H01L 51/0072; H01L 51/0073; H01L 51/0074; H01L 51/5012; H01L 51/5064; H01L 51/5072; H01L 51/5076; H01L 51/508; H01L 51/5096
See application file for complete search history.

(56) References Cited

U.S. PATENT DOCUMENTS

| | | | | |
|---|---|---|---|---|
| 2013/0105771 | A1* | 5/2013 | Ryu | C09B 57/00 548/440 |
| 2015/0259347 | A1 | 9/2015 | Park et al. | |
| 2016/0043316 | A1* | 2/2016 | Takada | C09K 11/06 546/281.1 |
| 2016/0072079 | A1 | 3/2016 | Cho et al. | |
| 2016/0093810 | A1* | 3/2016 | Miyake | H10K 85/6574 548/440 |
| 2016/0118599 | A1* | 4/2016 | Jeong | C07F 9/65586 546/276.7 |
| 2017/0222157 | A1* | 8/2017 | Jatsch | C07D 403/14 |
| 2018/0090688 | A1 | 3/2018 | Cha et al. | |
| 2018/0114907 | A1* | 4/2018 | Takada | H10K 85/636 |
| 2018/0337341 | A1 | 11/2018 | Heo et al. | |
| 2019/0296238 | A1 | 9/2019 | Cha et al. | |

FOREIGN PATENT DOCUMENTS

| | | | | |
|---|---|---|---|---|
| CN | 106164215 | A | 11/2016 | |
| CN | 109314189 | A | 2/2019 | |
| EP | 3 127 901 | A1 | 2/2017 | |
| JP | 2006083073 | | 3/2006 | |
| KR | 10-20110047803 | | 5/2011 | |
| KR | 10-20150144487 | | 12/2015 | |
| KR | 10-20170036641 | | 4/2017 | |
| KR | 10-1755986 | | 7/2017 | |
| KR | 10-20170138799 | | 12/2017 | |
| KR | 10-2018-0004033 | A | 1/2018 | |
| WO | 2003012890 | | 2/2003 | |
| WO | 2017/146367 | A1 | 8/2017 | |
| WO | WO-2017146466 | A1 * | 8/2017 | C07D 251/24 |
| WO | WO-2019135665 | A1 * | 7/2019 | H01L 51/006 |

* cited by examiner

[Figure 1]
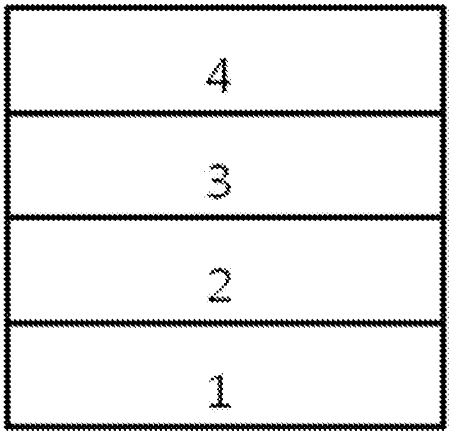
[Figure 2]
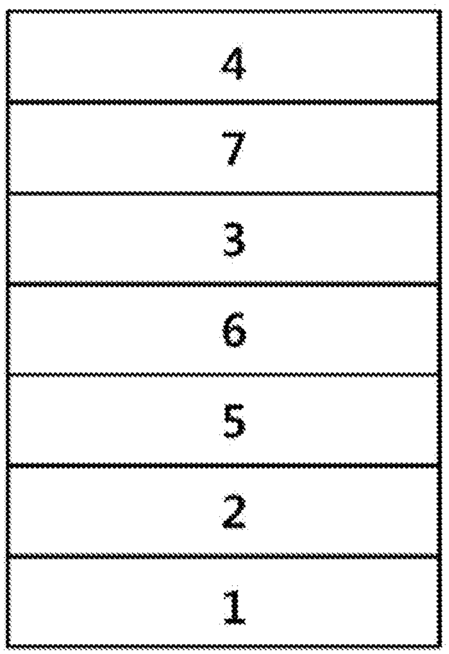

[Figure 3]
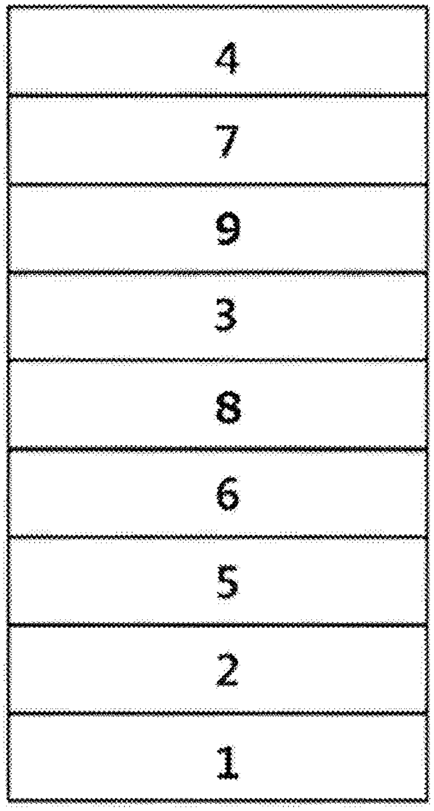

ORGANIC LIGHT-EMITTING DEVICE

This application is a National Stage Application of International Application No. PCT/KR2019/002196 filed on Feb. 22, 2019, which claims priority to and the benefit of Korean Patent Application No. 10-2018-0022088 filed in the Korean Intellectual Property Office on Feb. 23, 2018, the entire contents of which are incorporated herein by reference.

TECHNICAL FIELD

Technical Field

The present application relates to an organic light emitting device.

Background

In general, an organic light emitting phenomenon refers to a phenomenon in which electric energy is converted into light energy by using an organic material. An organic light emitting device using the organic light emitting phenomenon usually has a structure including a positive electrode, a negative electrode, and an organic material layer interposed therebetween. Here, the organic material layer has in many cases a multi-layered structure composed of different materials in order to improve the efficiency and stability of the organic light emitting device, and for example, can be composed of a hole injection layer, a hole transport layer, a light emitting layer, an electron transport layer, an electron injection layer, and the like. In the structure of the organic light emitting device, if a voltage is applied between the two electrodes, holes are injected from the positive electrode into the organic material layer and electrons are injected from the negative electrode into the organic material layer, and when the injected holes and electrons meet each other, an exciton is formed, and light is emitted when the exciton falls down again to a ground state.

There is a continuous need for developing a new material for the aforementioned organic light emitting device.

BRIEF DESCRIPTION

Technical Problem

The present application has been made in an effort to provide an organic light emitting device.

Technical Solution

The present application provides an organic light emitting device including: a first electrode; a second electrode provided to face the first electrode; and a first organic material layer and a second organic material layer provided between the first electrode and the second electrode, in which the first organic material layer includes a compound of the following Formula 1, and the second organic material layer includes a compound of the following Formula 2:

[Formula 1]

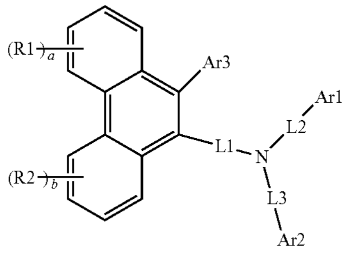

wherein in Formula 1:

L1 to L3 are each independently a direct bond, or a substituted or unsubstituted arylene group;

Ar1 to Ar3 are each independently hydrogen, deuterium, a substituted or unsubstituted aryl group, or a substituted or unsubstituted heterocyclic group;

R1 and R2 are each independently hydrogen, deuterium, a halogen group, a cyano group, a nitro group, a substituted or unsubstituted alkyl group, a substituted or unsubstituted haloalkyl group, a substituted or unsubstituted haloalkoxy group, a substituted or unsubstituted cycloalkyl group, a substituted or unsubstituted alkenyl group, a substituted or unsubstituted aryl group, or a substituted or unsubstituted heterocyclic group;

a and b are each independently an integer from 0 to 4;

when a and b are each independently 2 or more, the substituents in the parenthesis are the same as or different from each other;

[Formula 2]

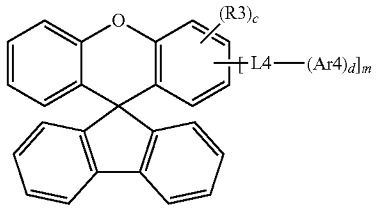

wherein in Formula 2:

L4 is a direct bond, a substituted or unsubstituted arylene group, or a substituted or unsubstituted divalent heterocyclic group;

Ar4 is a substituted or unsubstituted aryl group, a substituted or unsubstituted phosphine oxide group, or a substituted or unsubstituted heterocyclic group;

R3 is hydrogen, deuterium, a halogen group, a cyano group, a nitro group, a substituted or unsubstituted alkyl group, a substituted or unsubstituted haloalkyl group, a substituted or unsubstituted haloalkoxy group, a substituted or unsubstituted cycloalkyl group, a substituted or unsubstituted alkenyl group, a substituted or unsubstituted aryl group, or a substituted or unsubstituted heterocyclic group;

c is an integer from 0 to 3;

d is an integer from 1 to 2;

m is an integer from 1 to 4; and when c, d, and m are each independently 2 or more, the substituents in the parenthesis are the same as or different from each other.

Advantageous Effects

An organic light emitting device using the compound according to an exemplary embodiment of the present application can implement a low driving voltage, high light emitting efficiency, or a long service life.

BRIEF DESCRIPTION OF DRAWINGS

FIG. 1 illustrates an example of an organic light emitting device in which a substrate 1, a positive electrode 2, a light emitting layer 3, and a negative electrode 4 are sequentially stacked.

FIG. 2 illustrates an example of an organic light emitting device in which a substrate 1, a positive electrode 2, a hole injection layer 5, a hole transport layer 6, a light emitting layer 3, an electron transport layer 7, and a negative electrode 4 are sequentially stacked.

FIG. 3 illustrates an example of an organic light emitting device in which a substrate 1, a positive electrode 2, a hole injection layer 5, a hole transport layer 6, a hole adjusting layer 8, a light emitting layer 3, an electron adjusting layer 9, an electron transport layer 7, and a negative electrode 4 are sequentially stacked.

EXPLANATION OF REFERENCE NUMERALS AND SYMBOLS

1: Substrate
2: Positive electrode
3: Light emitting layer
4: Negative electrode
5: Hole injection layer
6: Hole transport layer
7: Electron transport layer
8: Hole adjusting layer
9: Electron adjusting layer

DETAILED DESCRIPTION

Hereinafter, the present specification will be described in more detail.

The present application provides an organic light emitting device including: a first electrode; a second electrode provided to face the first electrode; and a first organic material layer and a second organic material layer provided between the first electrode and the second electrode, in which the first organic material layer includes a compound of the Formula 1, and the second organic material layer includes a compound of the Formula 2.

Examples of the substituents in the present specification will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent can be substituted, and when two or more are substituted, the two or more substituents can be the same as or different from each other.

In the present specification, the term "substituted or unsubstituted" means being substituted with one or two or more substituents selected from the group consisting of hydrogen, a halogen group, a nitrile group, a nitro group, a hydroxyl group, a substituted or unsubstituted alkyl group, a substituted or unsubstituted cycloalkyl group, a substituted or unsubstituted alkenyl group, a substituted or unsubstituted amine group, a substituted or unsubstituted haloalkoxy group, a substituted or unsubstituted aryl group, and a substituted or unsubstituted heterocyclic group or being substituted with a substituent to which two or more substituents are linked among the substituents exemplified above, or having no substituent. For example, "the substituent to which two or more substituents are linked" can be a biphenyl group. That is, the biphenyl group can also be an aryl group, and can be interpreted as a substituent to which two phenyl groups are linked.

In the present specification, an example of a haloalkoxy group can be —$OCF_3$.

In the present specification, examples of a halogen group include fluorine, chlorine, bromine or iodine.

In the present specification, the number of carbon atoms of an ester group is not particularly limited, but is preferably 1 to 50. Specifically, the ester group can be a compound having the following structural formulae, but is not limited thereto:

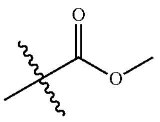
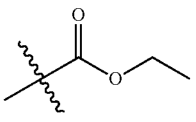
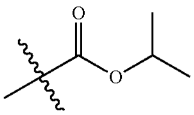
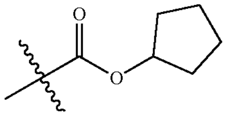
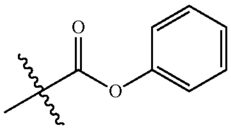
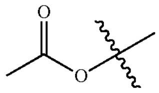
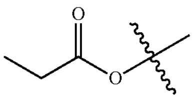
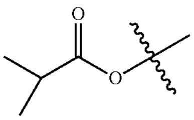
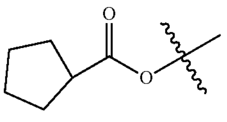
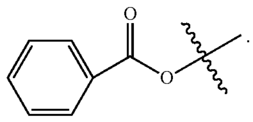

In the present specification, the number of carbon atoms of a carbonyl group is not particularly limited, but is preferably 1 to 50. Specifically, the carbonyl group can be a compound having the following structures, but is not limited thereto:

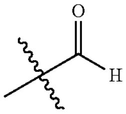
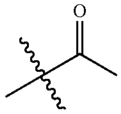
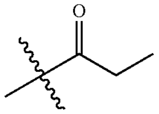
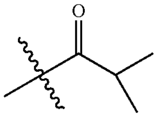
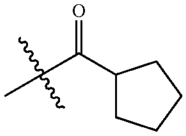

-continued

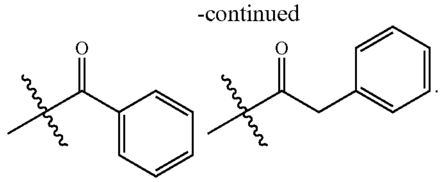

In the present specification, the alkyl group can be straight-chained or branched, and the number of carbon atoms thereof is not particularly limited, but is preferably 1 to 60. Specific examples thereof include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methyl-pentyl, 2-methyl-pentyl, 4-methyl-2-pentyl, 3,3-dimethylbutyl, 2-ethyl-butyl, heptyl, n-heptyl, 1-methylhexyl, cyclopentyl-methyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethylpropyl, isohexyl, 2-methylpentyl, 4-methylhexyl, 5-methylhexyl, and the like, but are not limited thereto.

In the present specification, the cycloalkyl group is not particularly limited, but has preferably 3 to 60 carbon atoms, and specific examples thereof include cyclopropyl, cyclobutyl, cyclopentyl, 3-methyl-cyclopentyl, 2,3-dimethylcyclopentyl, cyclohexyl, 3-methylcyclohexyl, 4-methylcyclohexyl, 2,3-dimethyl-cyclohexyl, 3,4,5-trimethylcyclohexyl, 4-tert-butyl-cyclohexyl, cycloheptyl, cyclooctyl, and the like, but are not limited thereto.

In the present specification, the alkoxy group can be straight-chained, branched, or cyclic. The number of carbon atoms of the alkoxy group is not particularly limited, but is preferably 1 to 20. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methyl-benzyloxy, and the like, but are not limited thereto.

In the present specification, the alkenyl group can be straight-chained or branched, and the number of carbon atoms thereof is not particularly limited, but is preferably 2 to 40. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, when the aryl group is a monocyclic aryl group, the number of carbon atoms thereof is not particularly limited, but is preferably 6 to 25. Specific examples of the monocyclic aryl group include a phenyl group, a biphenyl group, a terphenyl group, and the like, but are not limited thereto.

When the aryl group is a polycyclic aryl group, the number of carbon atoms thereof is not particularly limited, but is preferably 10 to 24. Specific examples of the polycyclic aryl group include a naphthyl group, an anthracenyl group, a phenanthryl group, a pyrenyl group, a perylenyl group, a chrysenyl group, a fluorenyl group, and the like, but are not limited thereto.

In the present specification, the fluorenyl group can be substituted, and adjacent substituents can be bonded to each other to form a ring.

When the fluorenyl group is substituted, the substituent can be

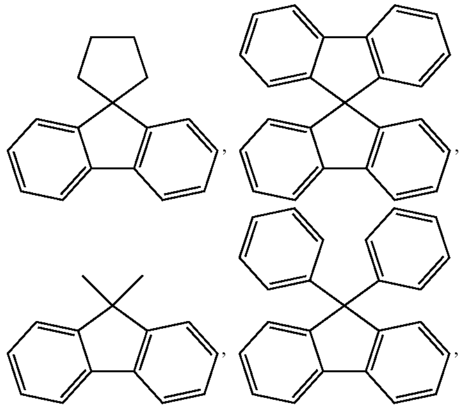

and the like, but is not limited thereto.

In the present specification, a heterocyclic group includes one or more atoms other than carbon, that is, one or more heteroatoms, and specifically, the heteroatom can include one or more atoms selected from the group consisting of O, N, Se, S, and the like. The number of carbon atoms of the heterocyclic group is not particularly limited, but is preferably 2 to 60. Examples of the heterocyclic group include a thiophene group, a furan group, a pyrrole group, an imidazole group, a triazole group, an oxazole group, an oxadiazole group, a triazole group, a pyridyl group, a bipyridyl group, a pyrimidyl group, a triazine group, a triazole group, an acridyl group, a pyridazine group, a pyrazinyl group, a quinolinyl group, a quinazoline group, a quinoxalinyl group, a phthalazinyl group, a pyrido-pyrimidinyl group, a pyridopyrazinyl group, a pyrazino-pyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a benzothiazolyl group, a phenothiazinyl group, a dibenzofuranyl group, and the like, but are not limited thereto.

In an exemplary embodiment of the present application, L1 to L3 are each independently a direct bond, or a substituted or unsubstituted arylene group having 6 to 60 carbon atoms.

In an exemplary embodiment of the present application, L1 to L3 are each independently a direct bond, or a substituted or unsubstituted arylene group having 6 to 30 carbon atoms.

In an exemplary embodiment of the present application, L1 to L3 are each independently a direct bond, a phenylene group, a biphenylene group, a terphenylene group, a 1-naphthylenyl group, or a 2-naphthylenyl group.

In an exemplary embodiment of the present application, Ar1 to Ar3 are each independently hydrogen, deuterium, a substituted or unsubstituted aryl group having 6 to 60 carbon atoms, or a substituted or unsubstituted heterocyclic group having 2 to 60 carbon atoms.

In an exemplary embodiment of the present application, Ar1 to Ar3 are each independently hydrogen, deuterium, a substituted or unsubstituted aryl group having 6 to 30 carbon atoms, or a substituted or unsubstituted heterocyclic group having 2 to 30 carbon atoms.

In an exemplary embodiment of the present application, when Ar1 to Ar3 are each independently an aryl group, Ar1 to Ar3 are each a phenyl group, a biphenyl group, a terphenyl group, a quaterphenyl group, a fluorene group, a naphthyl group, a phenanthrene group, or a triphenylene group.

In an exemplary embodiment of the present application, R1 and R2 are each independently hydrogen, deuterium, a substituted or unsubstituted alkyl group, a substituted or unsubstituted haloalkyl group, a substituted or unsubstituted haloalkoxy group, a substituted or unsubstituted cycloalkyl group, a substituted or unsubstituted alkenyl group, a substituted or unsubstituted aryl group, or a substituted or unsubstituted heterocyclic group.

In an exemplary embodiment of the present application, R1 and R2 are each independently hydrogen, deuterium, a substituted or unsubstituted aryl group, or a substituted or unsubstituted heterocyclic group.

In an exemplary embodiment of the present application, R1 and R2 are each independently hydrogen, deuterium, a substituted or unsubstituted aryl group having 6 to 60 carbon atoms, or a substituted or unsubstituted heterocyclic group having 2 to 60 carbon atoms.

In an exemplary embodiment of the present application, R1 and R2 are each independently hydrogen, deuterium, a substituted or unsubstituted aryl group having 6 to 30 carbon atoms, or a substituted or unsubstituted heterocyclic group having 2 to 30 carbon atoms.

In an exemplary embodiment of the present application, R1 and R2 are each independently hydrogen, or deuterium.

In an exemplary embodiment of the present application, Formula 2 is any one of the following Formulae 2-1 to 2-3:

[Formula 2-1]

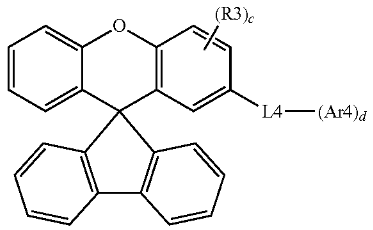

[Formula 2-2]

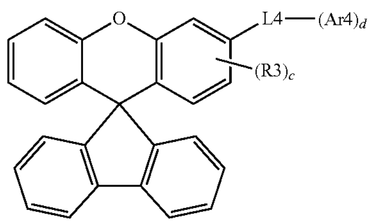

[Formula 2-3]

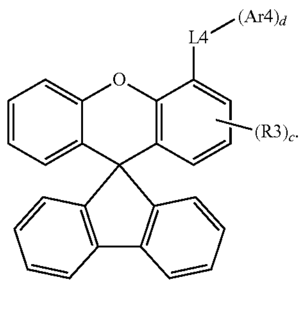

In Formulae 2-1 to 2-3, R3, L4, Ar4, c, and d are the same as the definitions in Formula 2.

In an exemplary embodiment of the present application, L4 is a direct bond, a substituted or unsubstituted arylene group having 6 to 60 carbon atoms, or a substituted or unsubstituted divalent heterocyclic group having 2 to 60 carbon atoms.

In an exemplary embodiment of the present application, L4 is a direct bond, a substituted or unsubstituted arylene group having 6 to 30 carbon atoms, or a substituted or unsubstituted divalent heterocyclic group having 2 to 30 carbon atoms.

In an exemplary embodiment of the present application, L4 is a substituted or unsubstituted divalent heterocyclic group having 2 to 30 carbon atoms.

In an exemplary embodiment of the present application, when L4 is a substituted or unsubstituted heterocyclic group, L4 is a substituted or unsubstituted divalent heterocyclic group including N.

In an exemplary embodiment of the present application, Ar4 is a substituted or unsubstituted aryl group having 6 to 60 carbon atoms, a substituted or unsubstituted phosphine oxide group having 6 to 60 carbon atoms, or a substituted or unsubstituted heterocyclic group having 2 to 60 carbon atoms.

In an exemplary embodiment of the present application, Ar4 is hydrogen, deuterium, a substituted or unsubstituted aryl group having 6 to 30 carbon atoms, a substituted or unsubstituted phosphine oxide group having 6 to 30 carbon atoms, or a substituted or unsubstituted heterocyclic group having 2 to 30 carbon atoms.

In an exemplary embodiment of the present application, Ar4 is hydrogen, deuterium, a substituted or unsubstituted phenyl group, a substituted or unsubstituted biphenyl group, a substituted or unsubstituted terphenyl group, a substituted or unsubstituted naphthylene group, a substituted or unsubstituted fluorene group, a substituted or unsubstituted phenanthrene group, a substituted or unsubstituted triphenylene group, a substituted or unsubstituted dibenzofuran group, a substituted or unsubstituted dibenzothiophene group, substituted or unsubstituted carbazole, a substituted or unsubstituted benzocarbazole, or a substituted or unsubstituted phosphine oxide group.

In an exemplary embodiment of the present application, R3 is hydrogen, deuterium, a substituted or unsubstituted alkyl group, a substituted or unsubstituted haloalkyl group, a substituted or unsubstituted haloalkoxy group, a substituted or unsubstituted cycloalkyl group, a substituted or unsubstituted alkenyl group, a substituted or unsubstituted aryl group, or a substituted or unsubstituted heterocyclic group.

In an exemplary embodiment of the present application, R3 is hydrogen, deuterium, a substituted or unsubstituted aryl group, or a substituted or unsubstituted heterocyclic group.

In an exemplary embodiment of the present application, R3 is hydrogen, deuterium, a substituted or unsubstituted aryl group having 6 to 60 carbon atoms, or a substituted or unsubstituted heterocyclic group having 2 to 60 carbon atoms.

In an exemplary embodiment of the present application, R3 is hydrogen, deuterium, a substituted or unsubstituted aryl group having 6 to 30 carbon atoms, or a substituted or unsubstituted heterocyclic group having 2 to 30 carbon atoms.

In an exemplary embodiment of the present application, R3 is hydrogen or deuterium.

Further, in an exemplary embodiment of the present application, the compound of Formula 1 is selected from the following compounds:
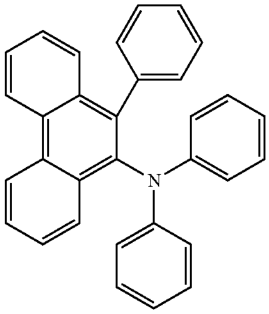
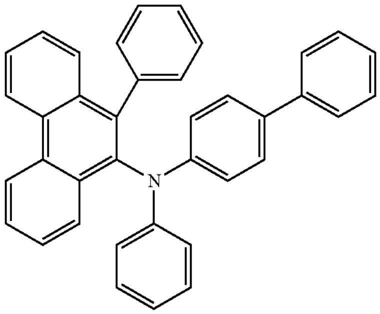
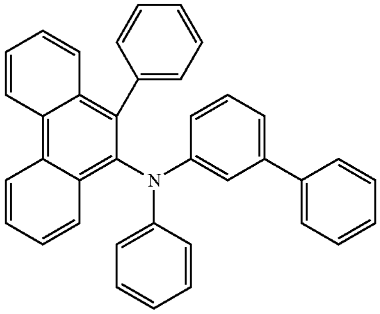
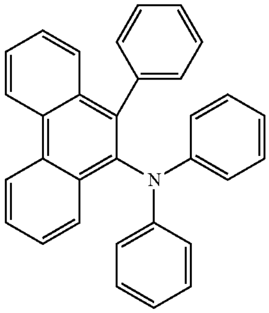
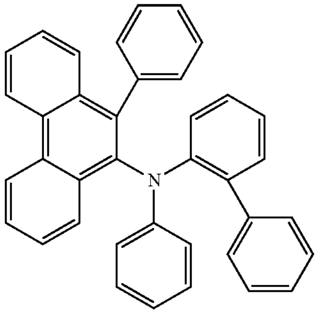
-continued
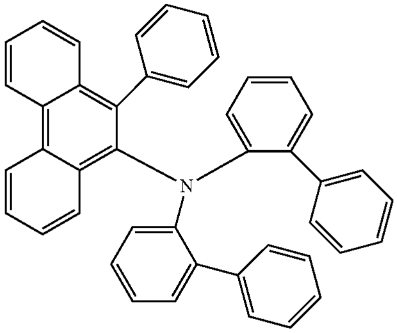
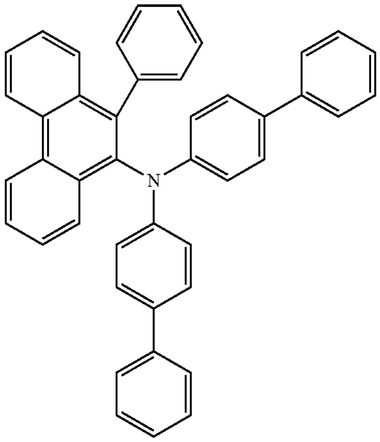
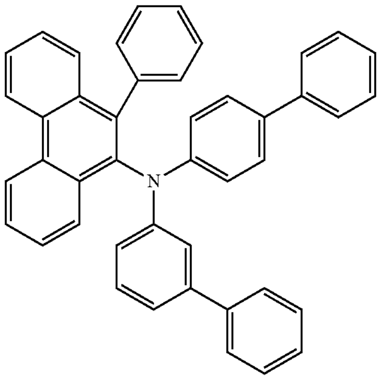
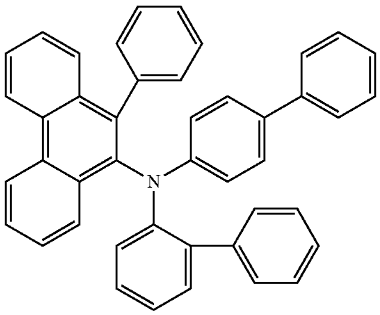

-continued
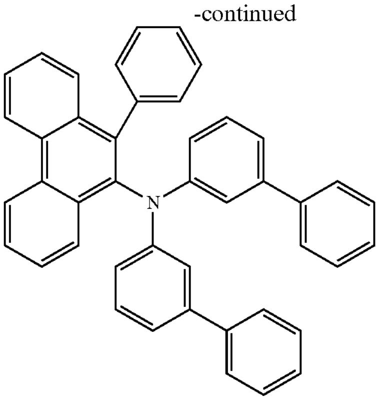
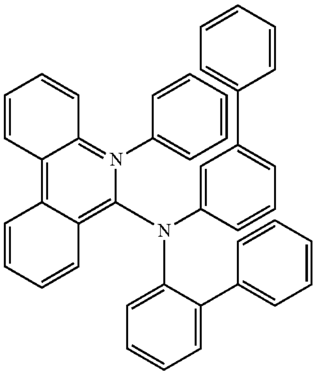
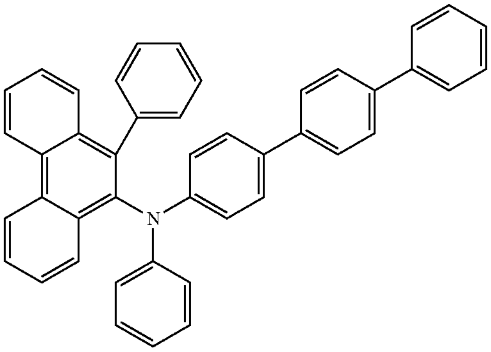
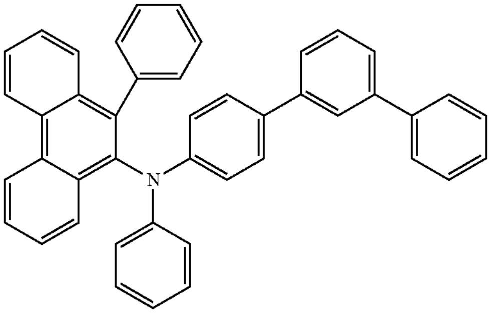
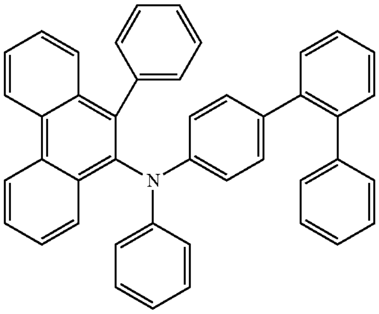
-continued
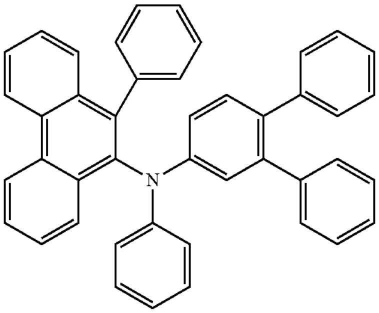
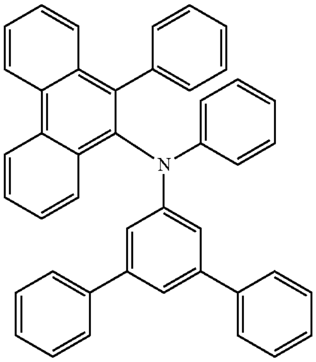
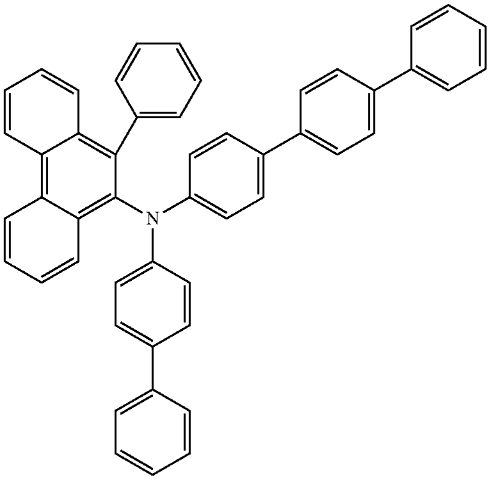
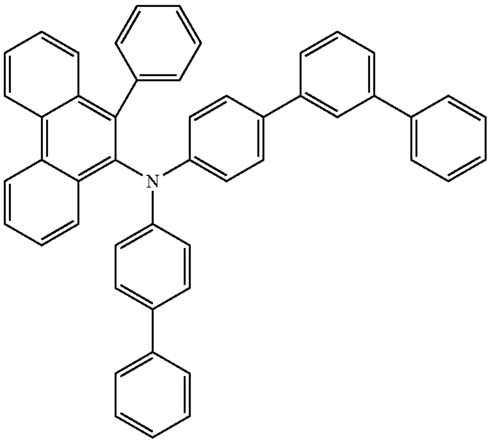

-continued
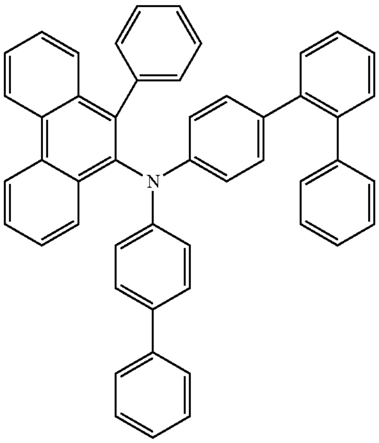
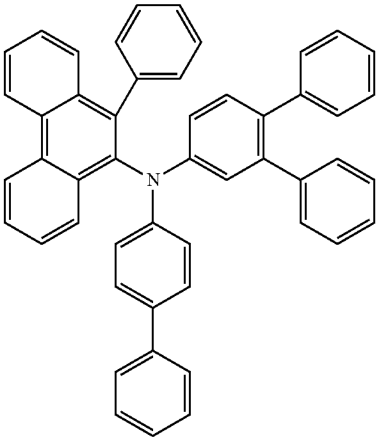
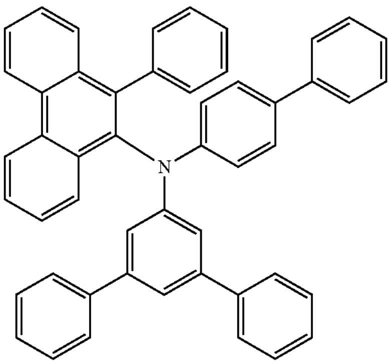
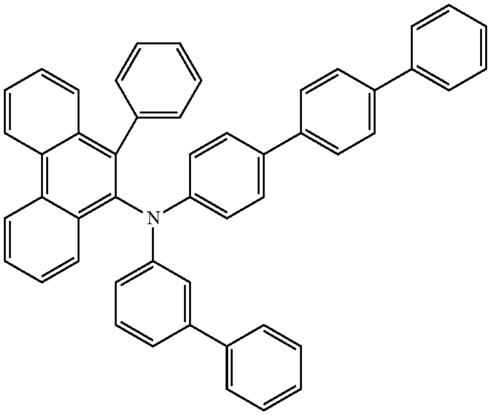
-continued
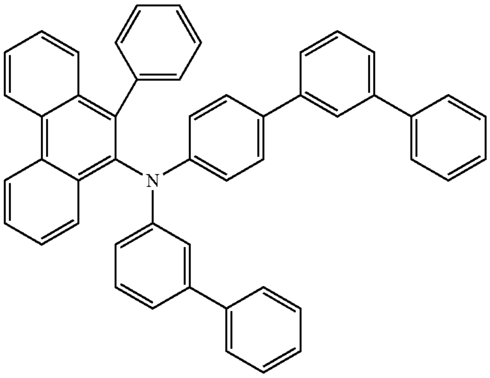
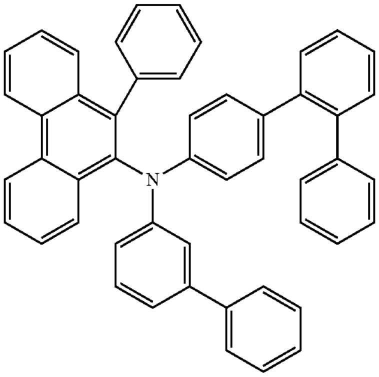
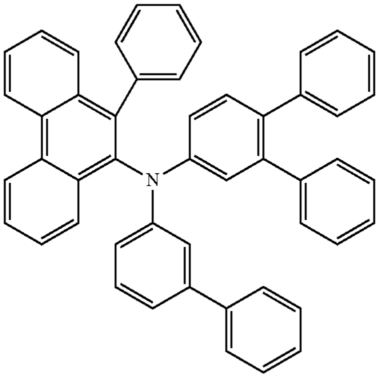
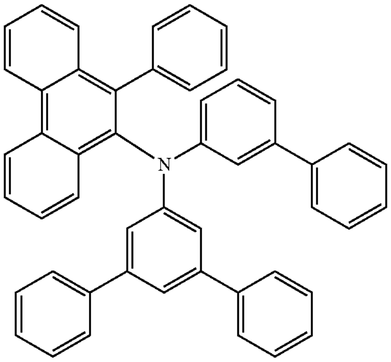

-continued
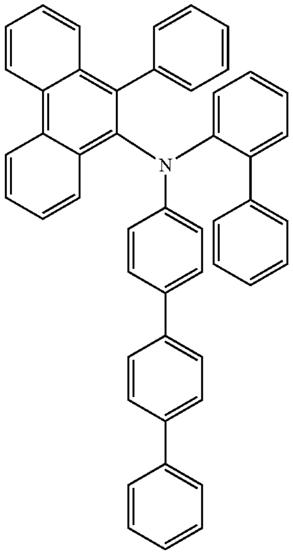
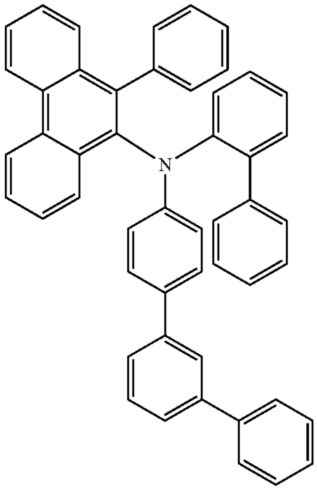
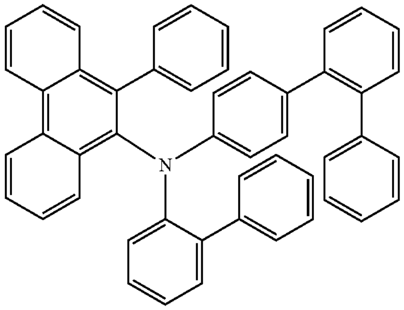
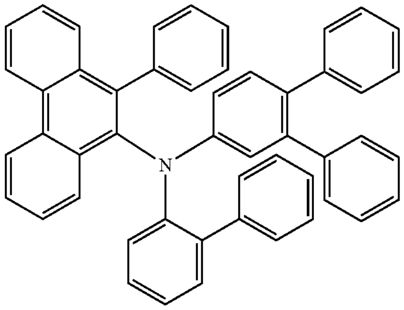
-continued
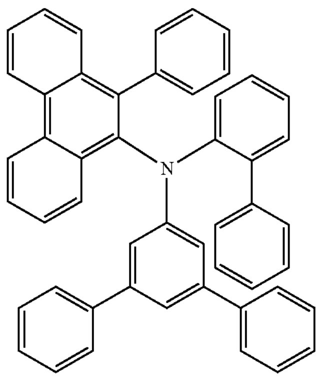
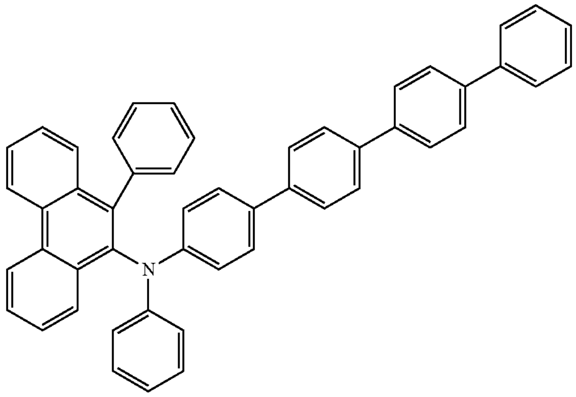
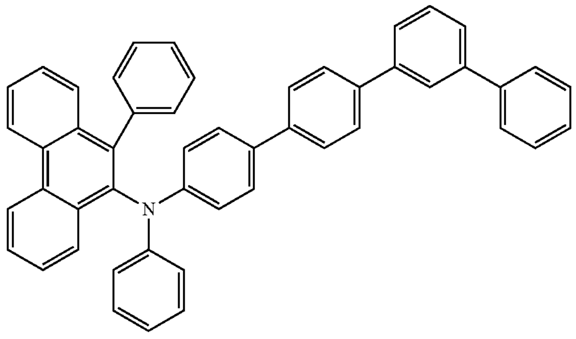
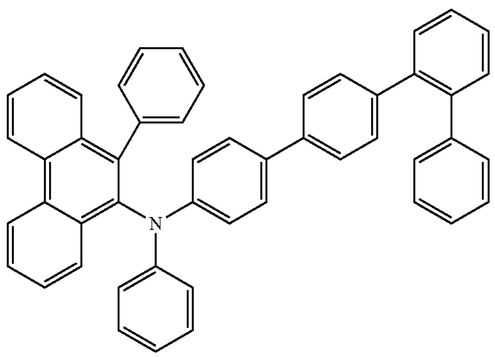

-continued
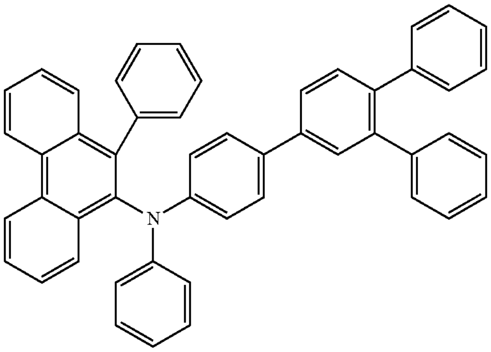
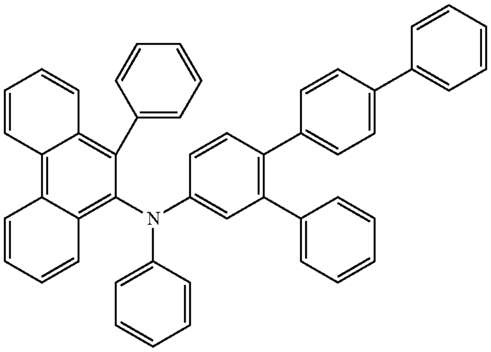
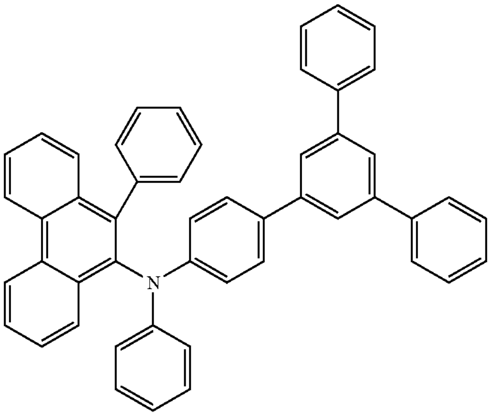
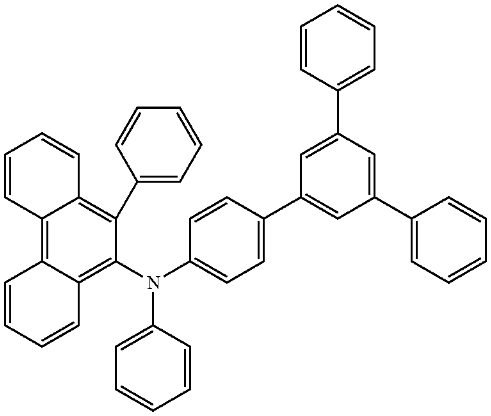
-continued
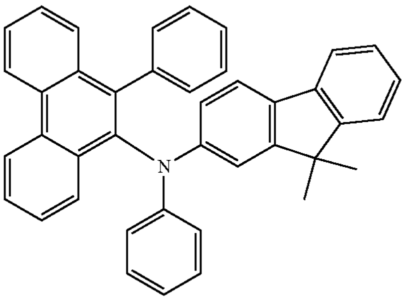
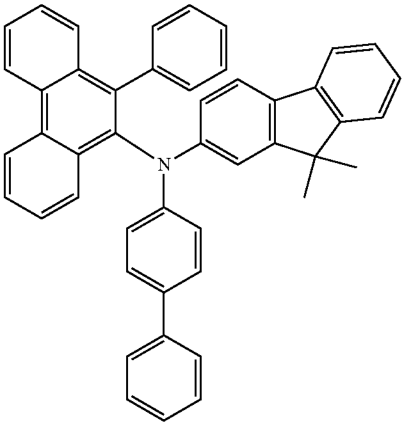
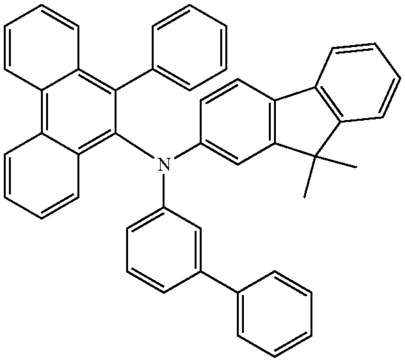
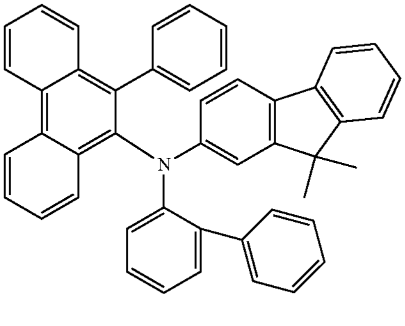

-continued
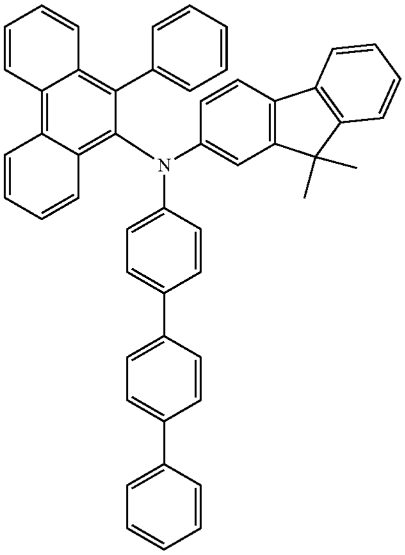
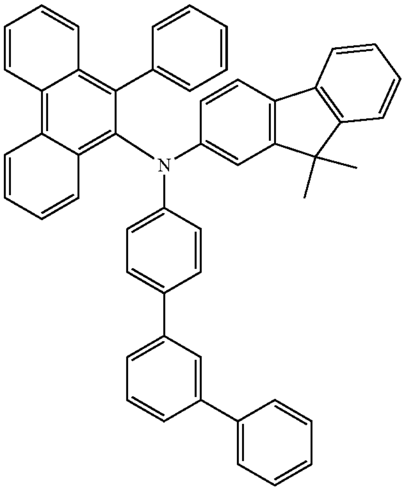
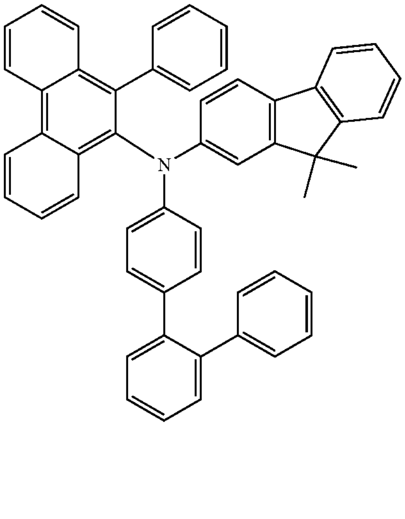
-continued
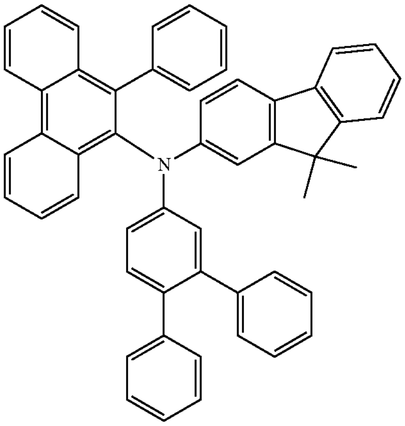
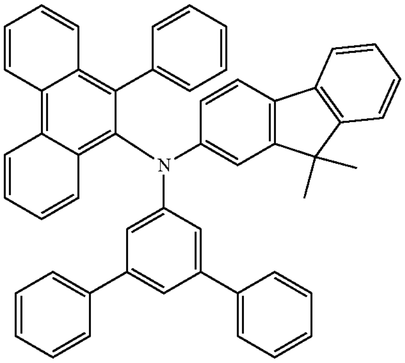
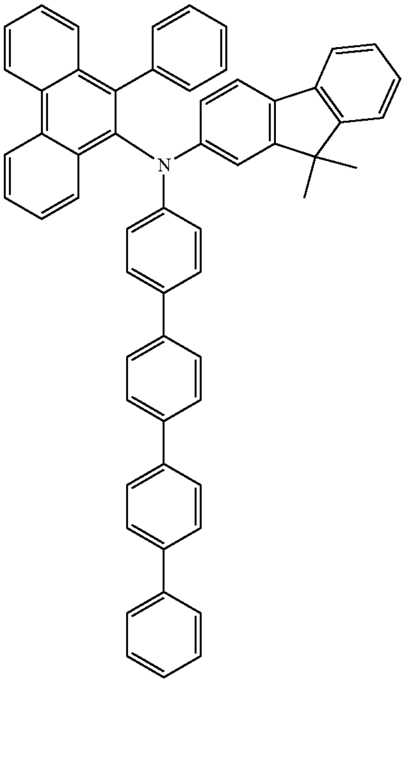

-continued
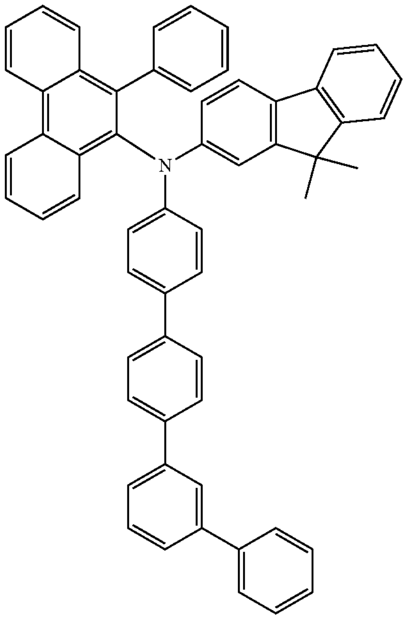
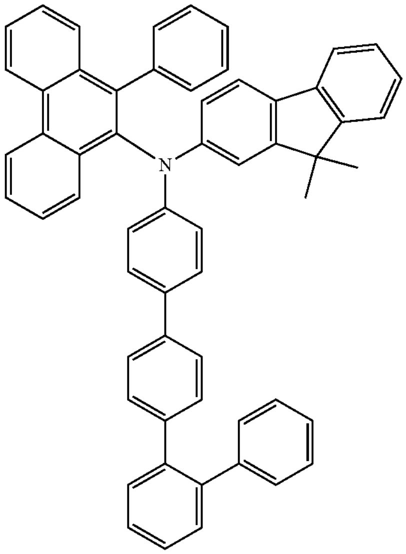
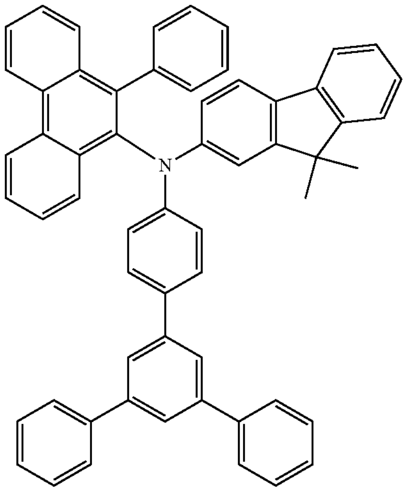
-continued
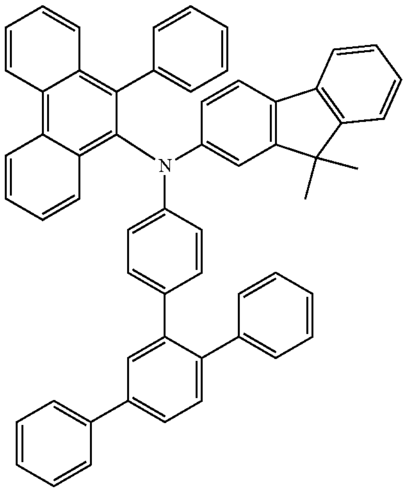
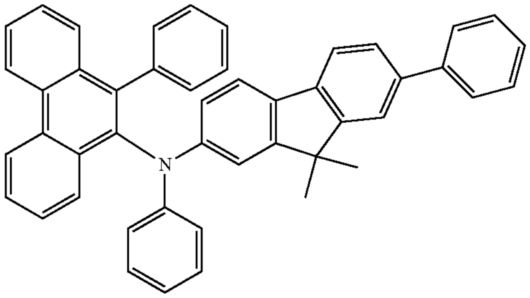
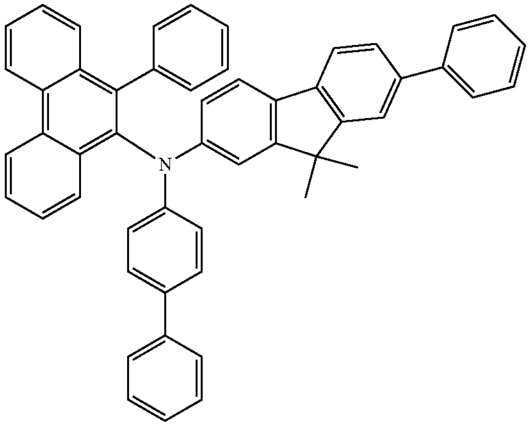
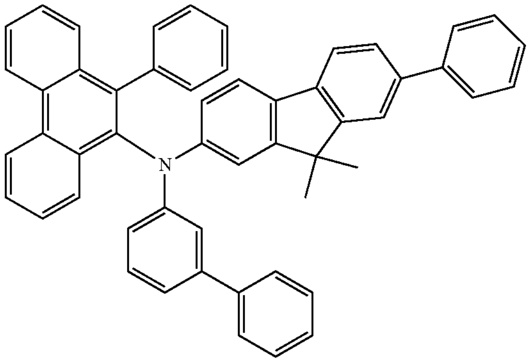

-continued
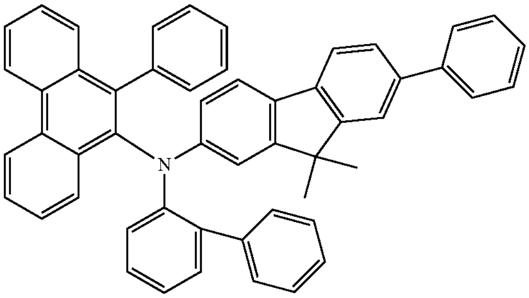
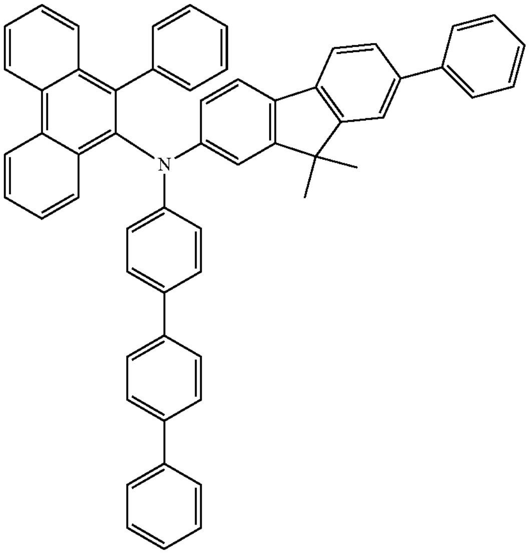
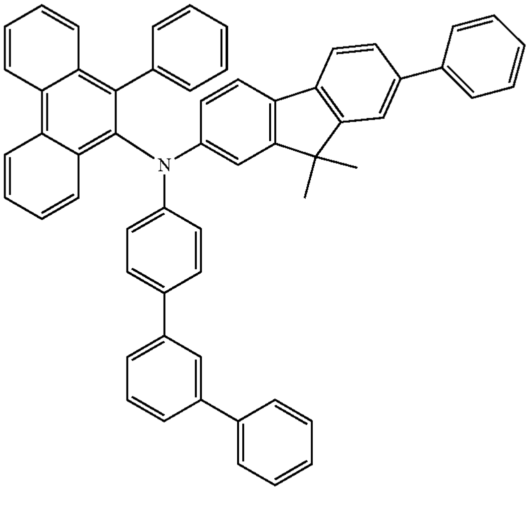
-continued
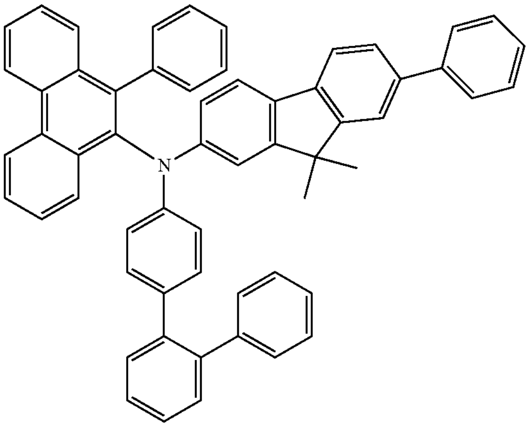
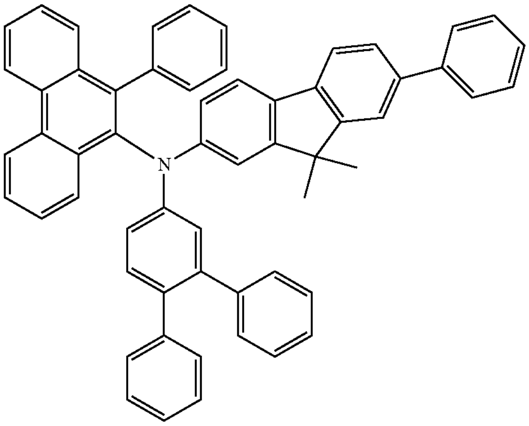
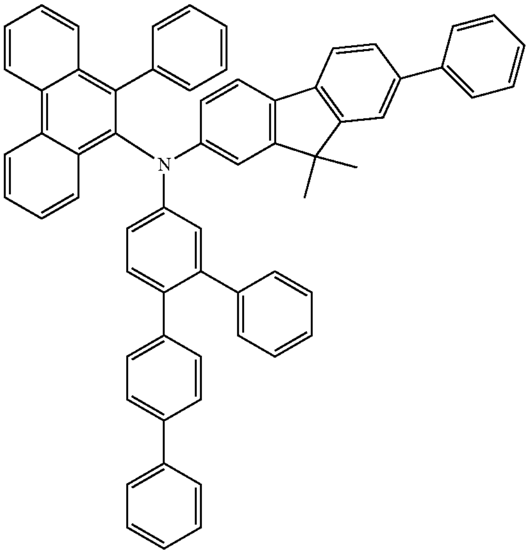

-continued
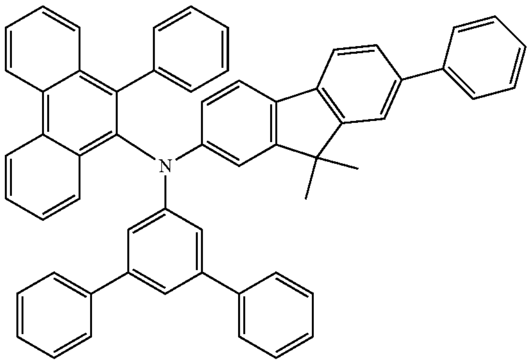
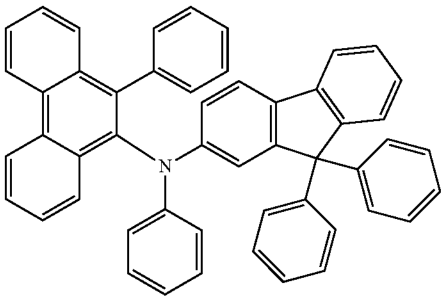
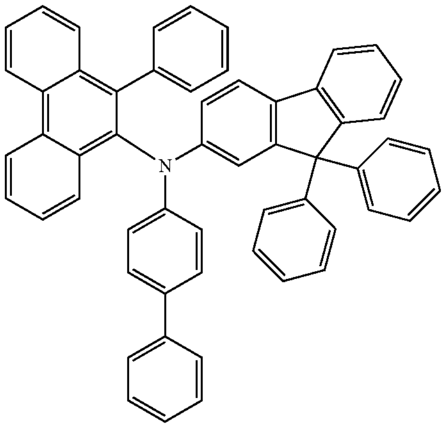
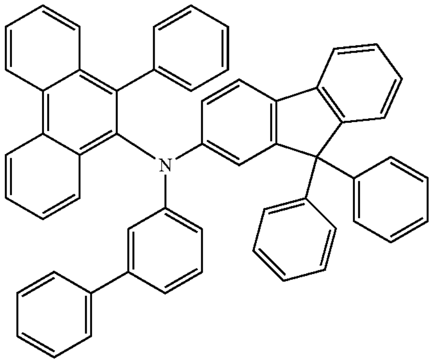
-continued
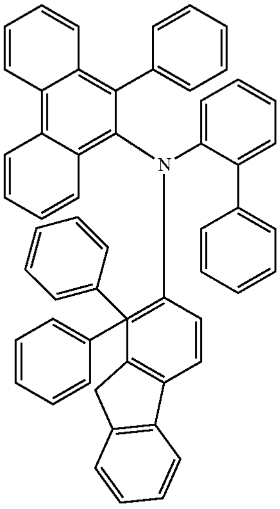
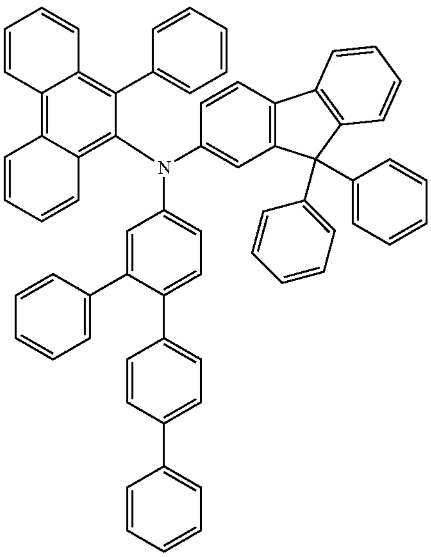
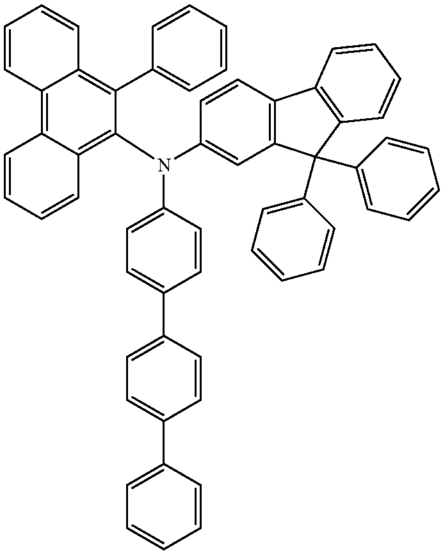

-continued
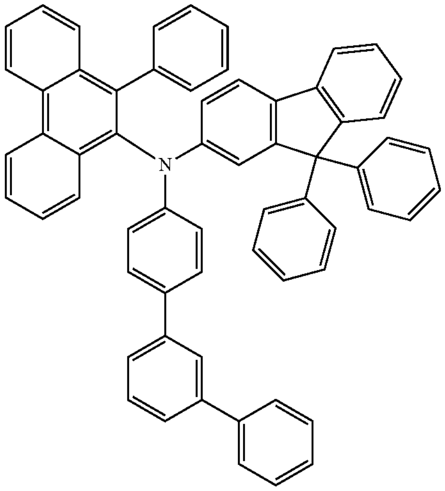
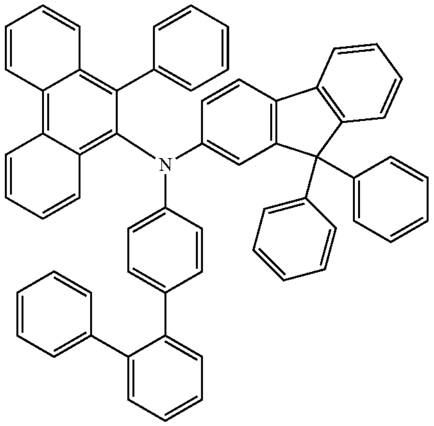
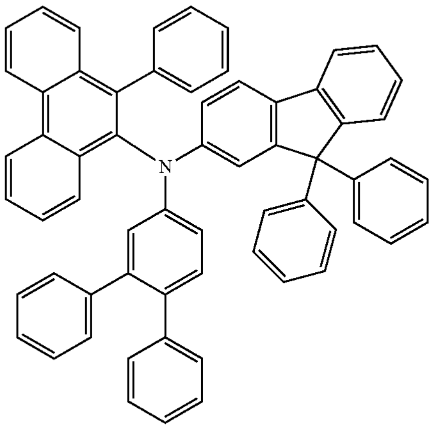
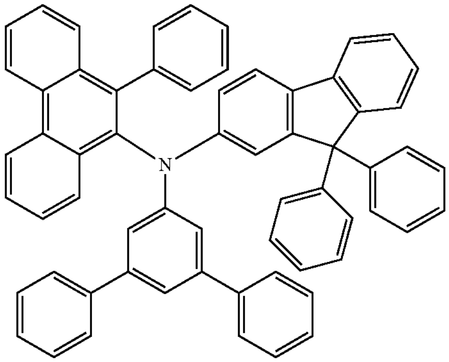
-continued
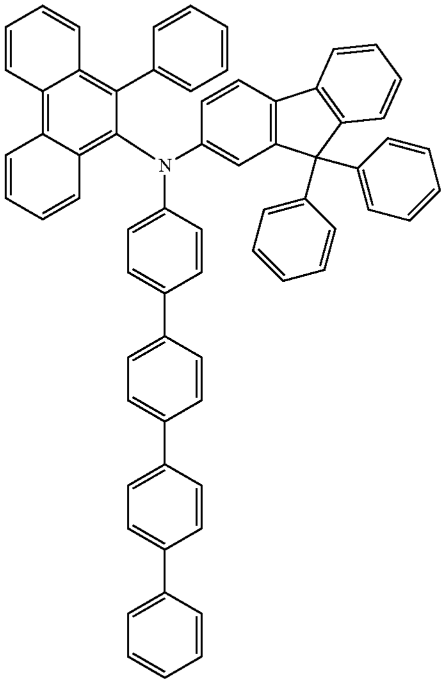
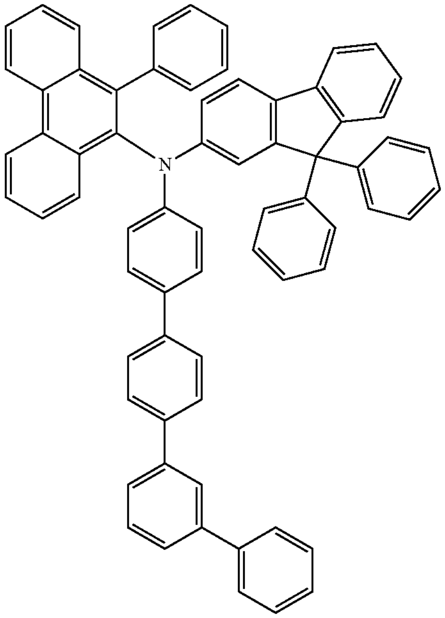

-continued
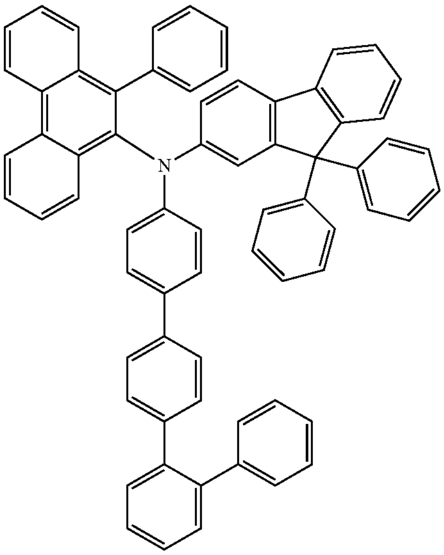
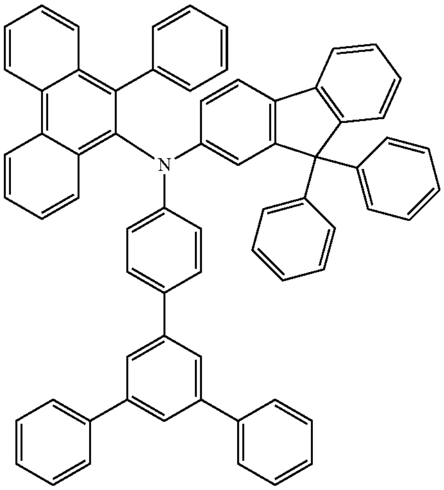
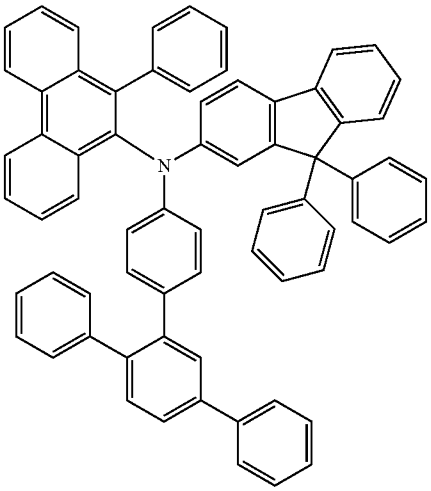
-continued
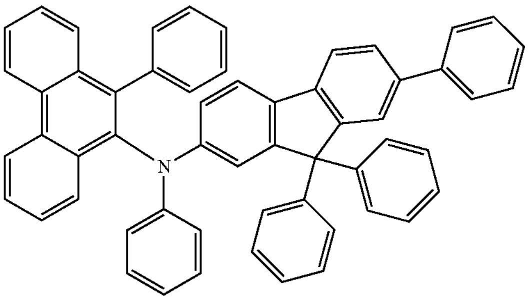
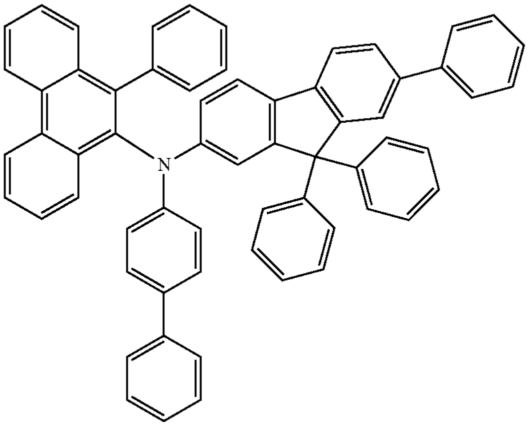
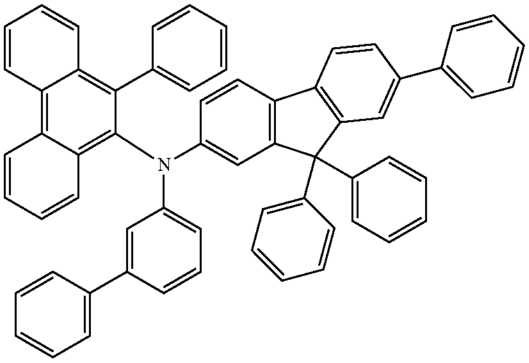
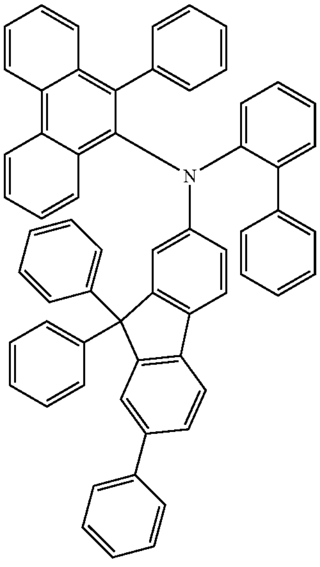

-continued
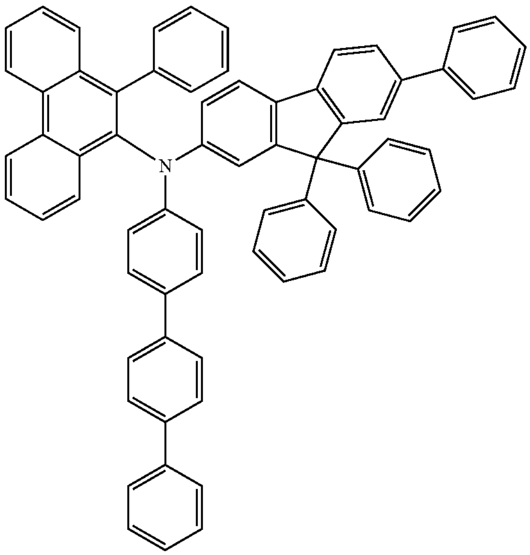
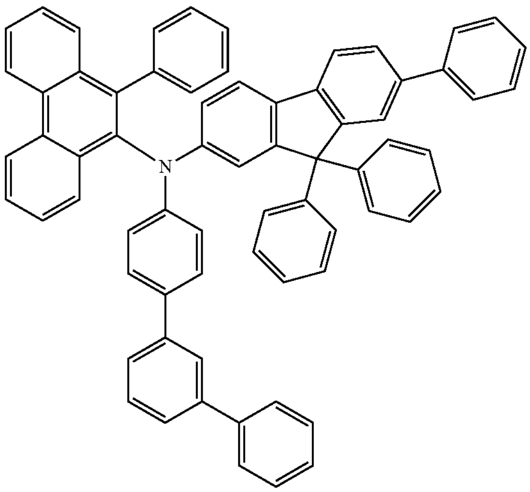
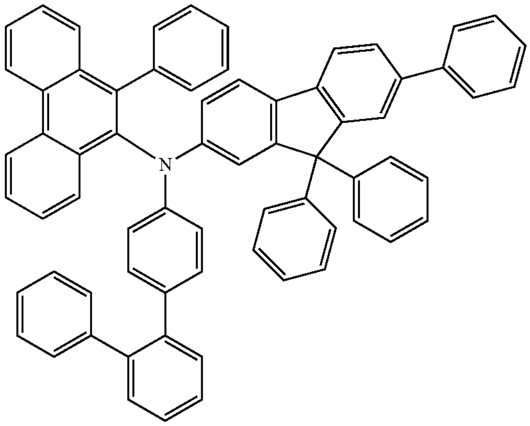
-continued
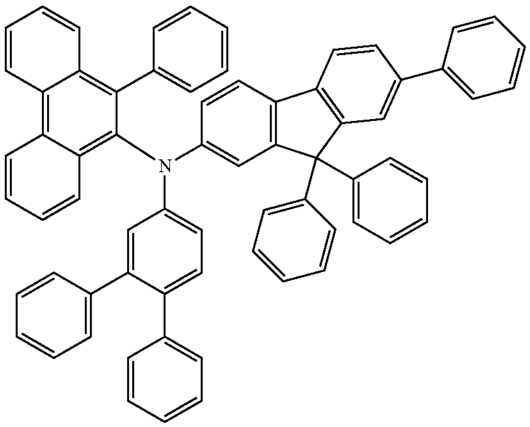
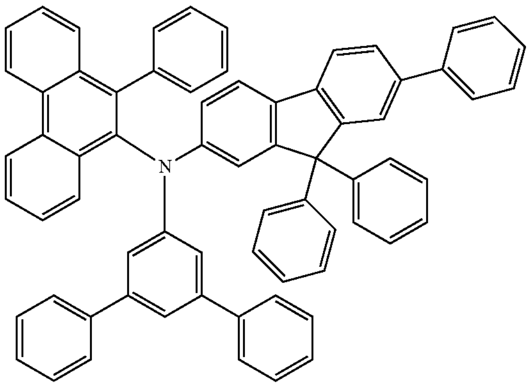
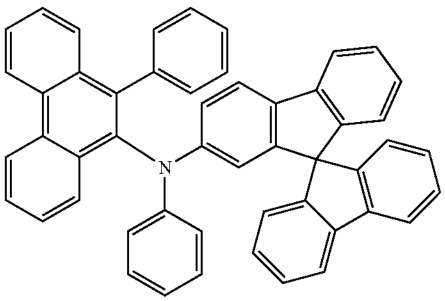
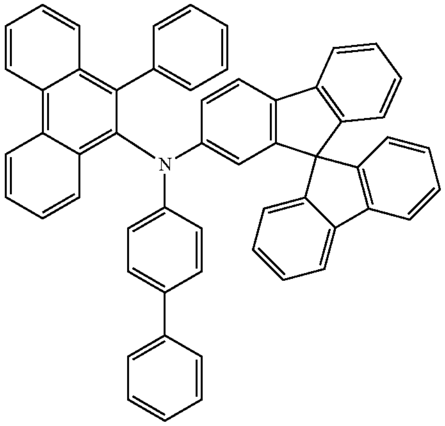

-continued
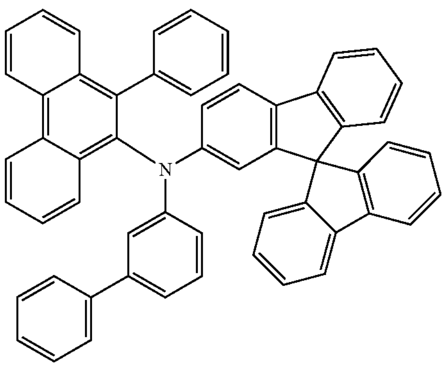
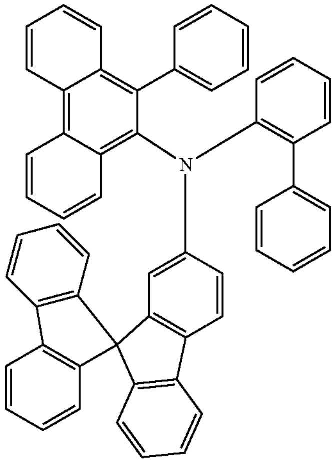
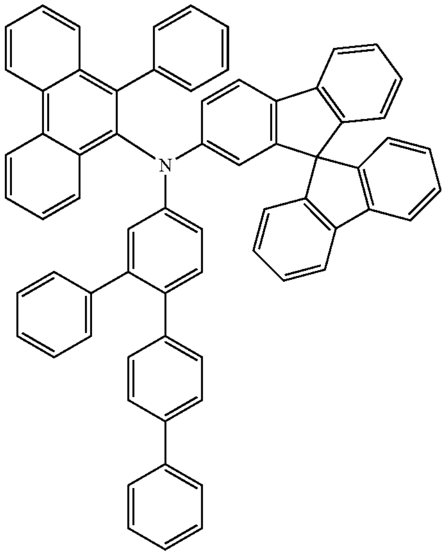
-continued
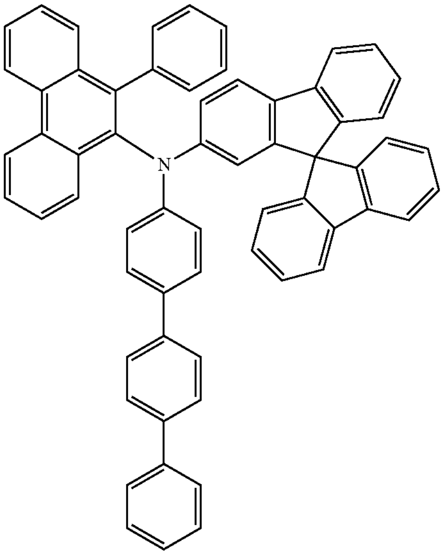
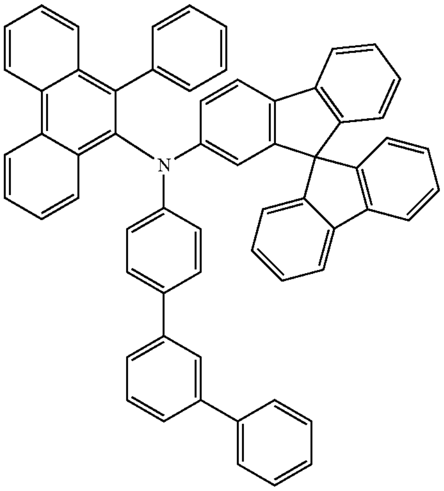
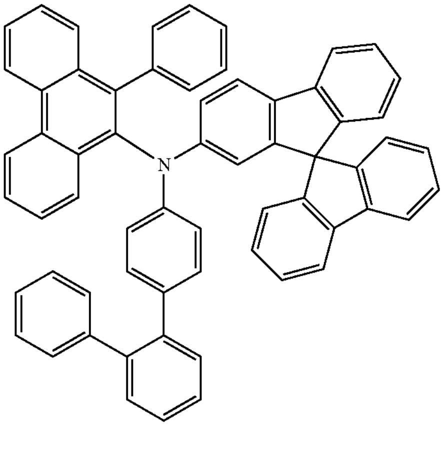

-continued
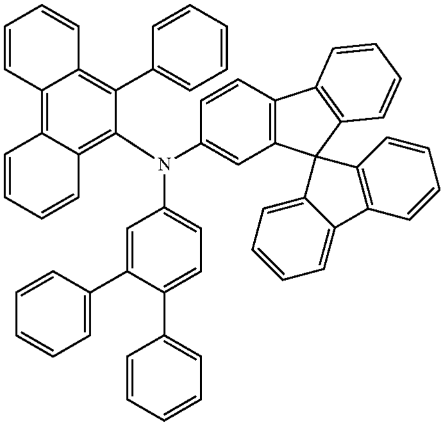
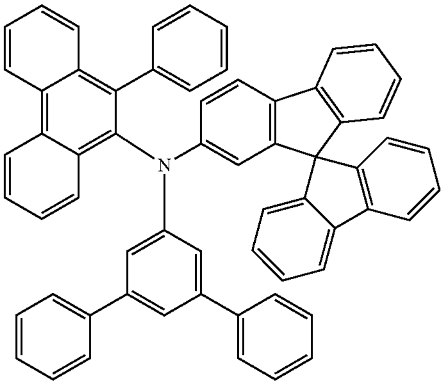
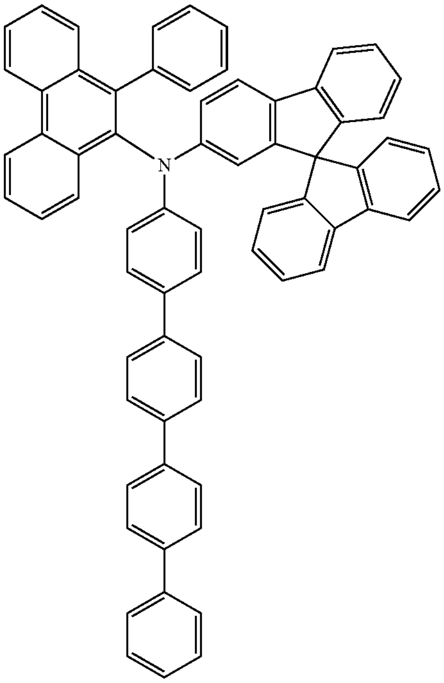
-continued
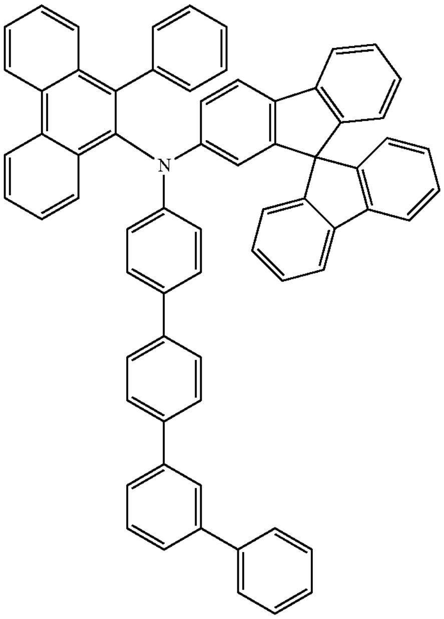
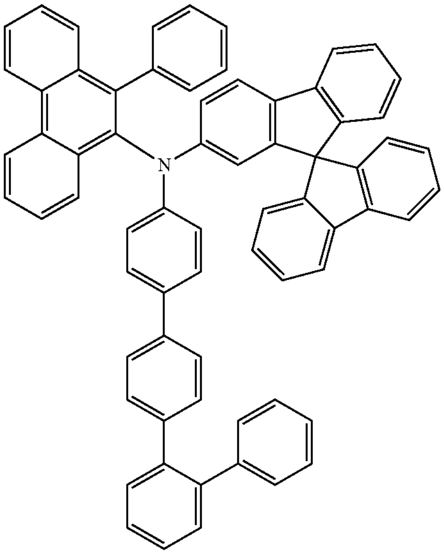
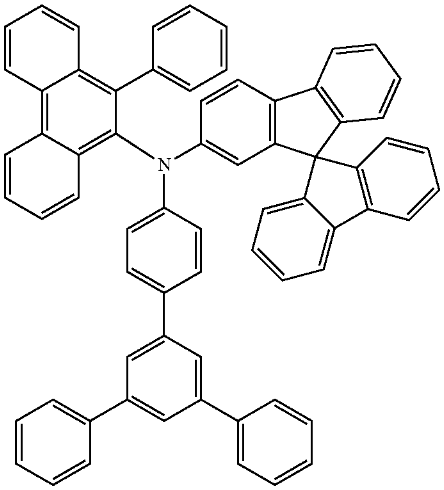

-continued
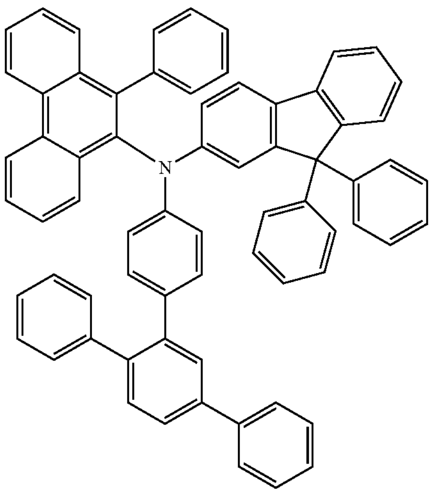 [SMILES: c1ccc(-c2ccc(-c3ccccc3)c(-c3ccc(N(c4ccc5c(c4)C(c4ccccc4)(c4ccccc4)c4ccccc4-5)c4c(-c5ccccc5)c5ccccc5c5ccccc45)cc3)c2)cc1]
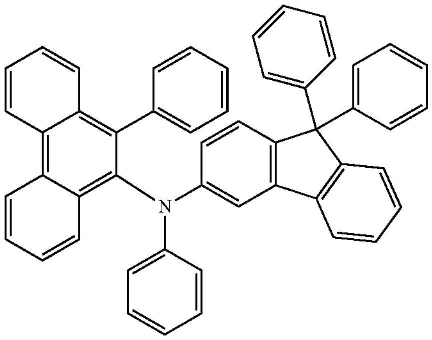
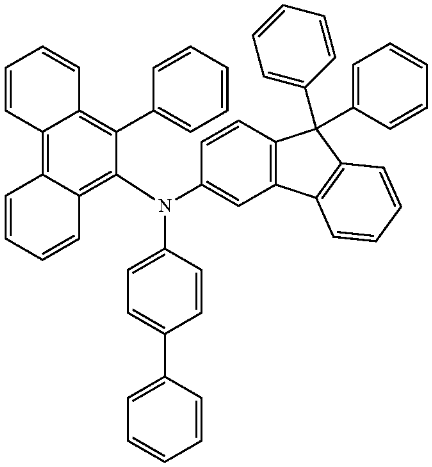
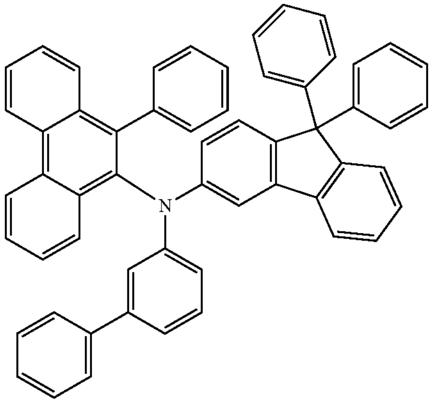
-continued
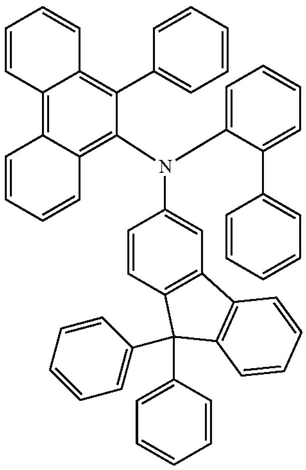
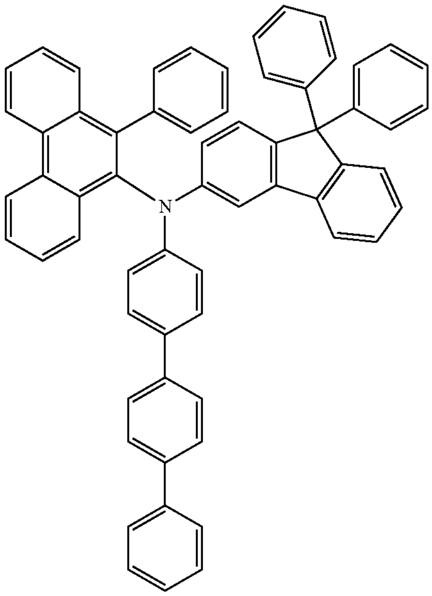
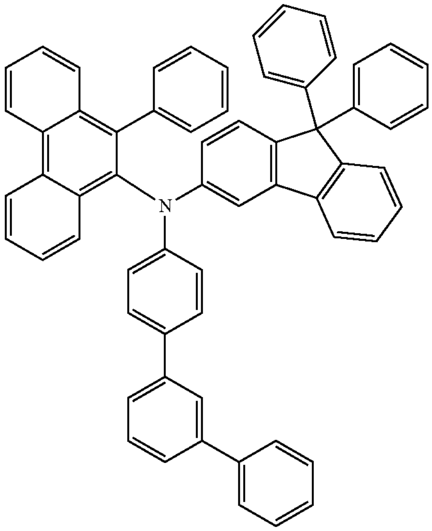

-continued
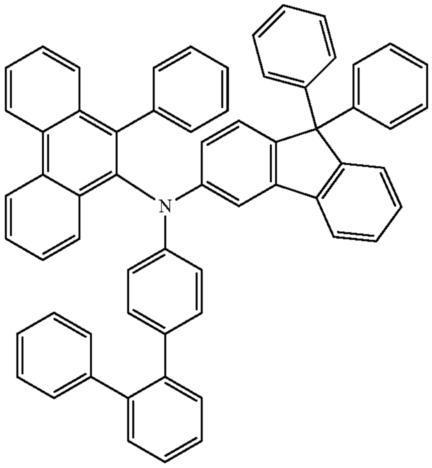
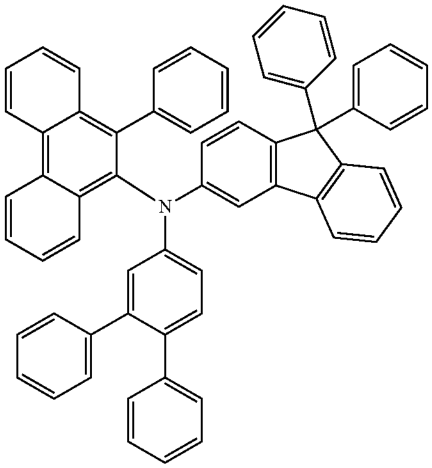
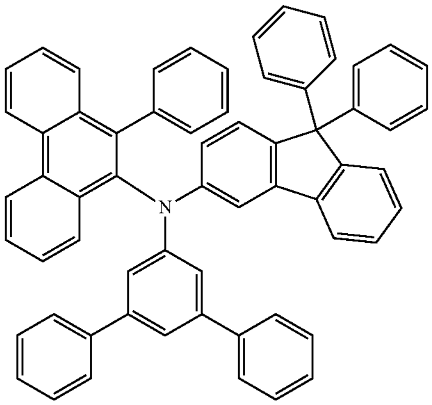
-continued
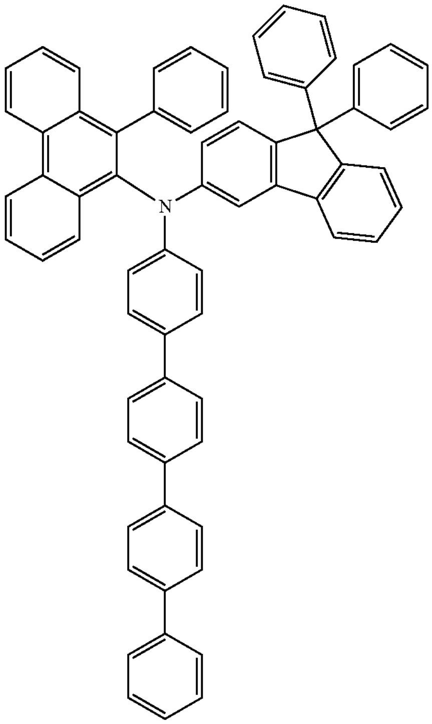
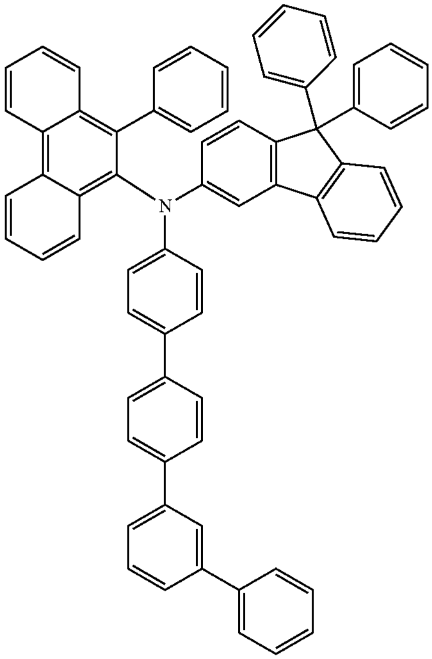

-continued
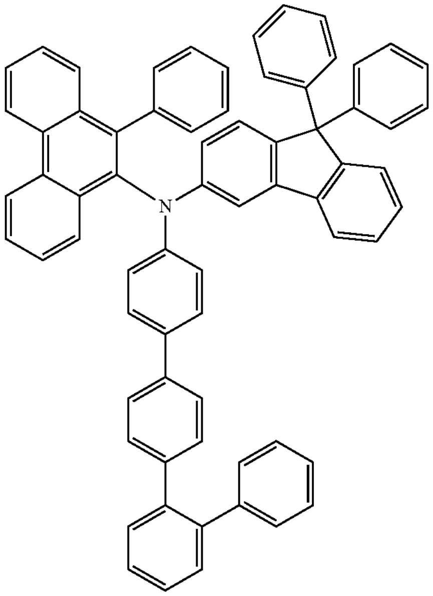
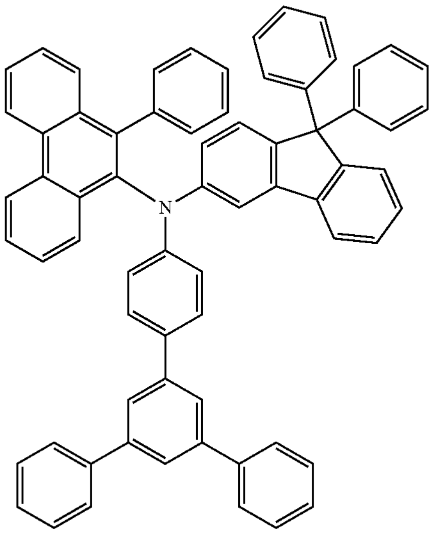
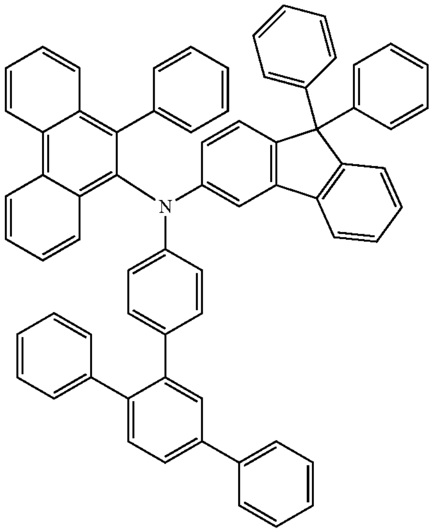
-continued
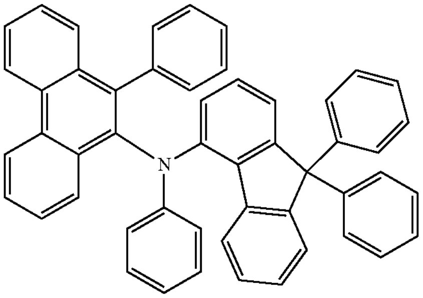
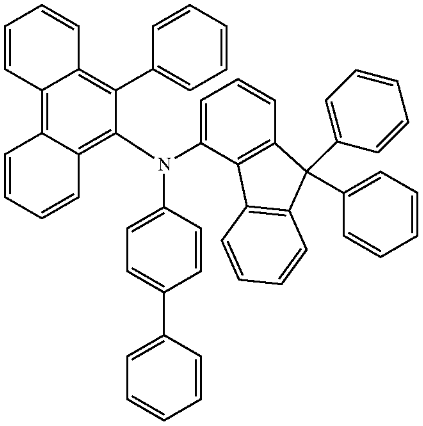
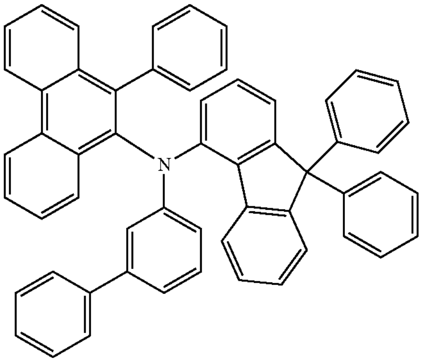
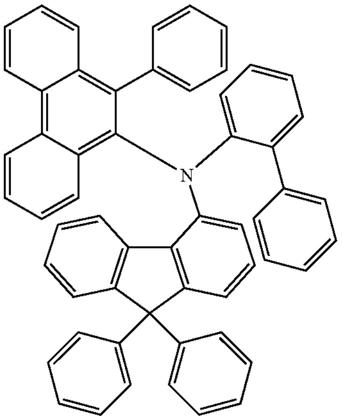

-continued
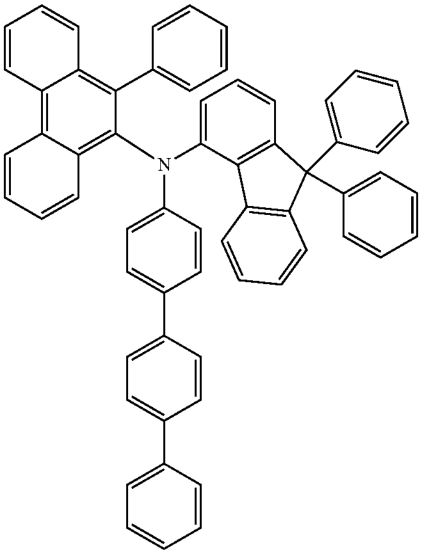
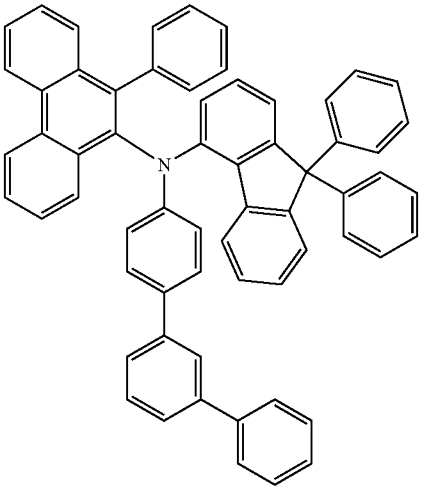
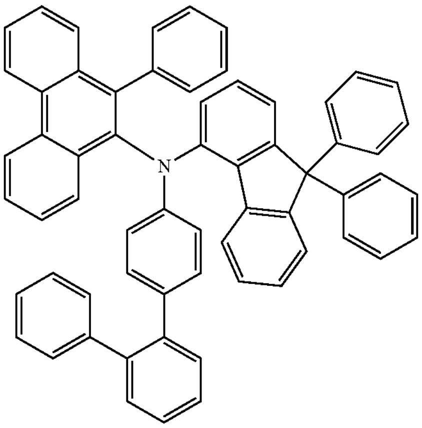
-continued
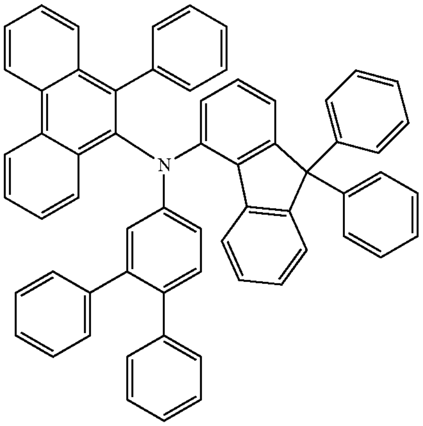
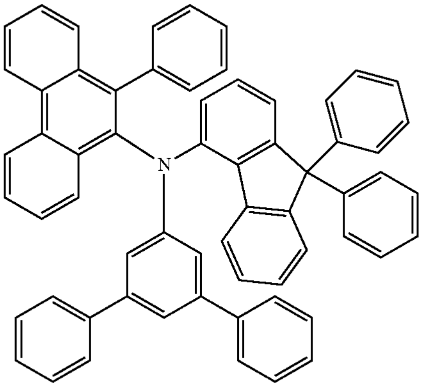
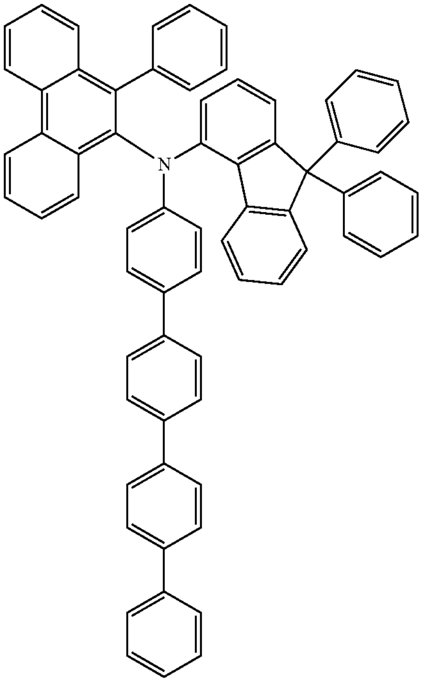

-continued
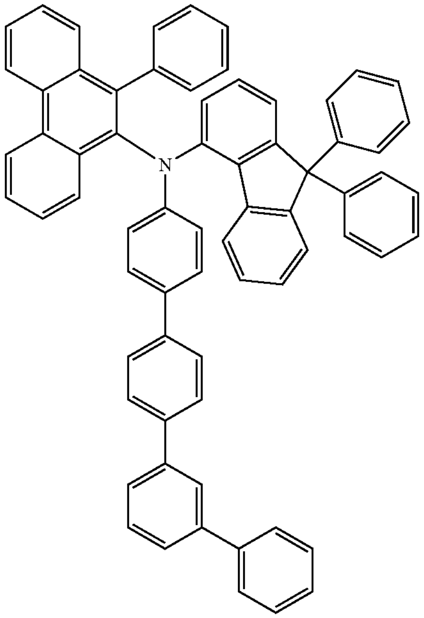
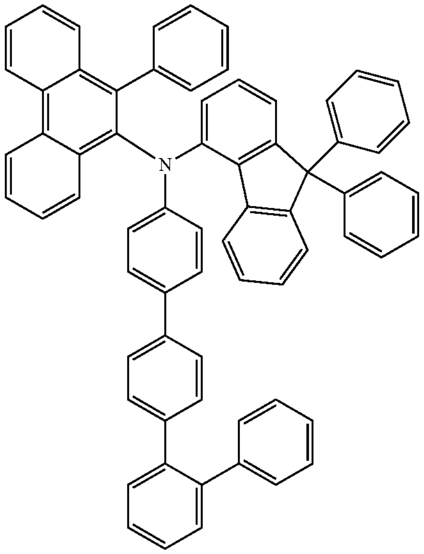
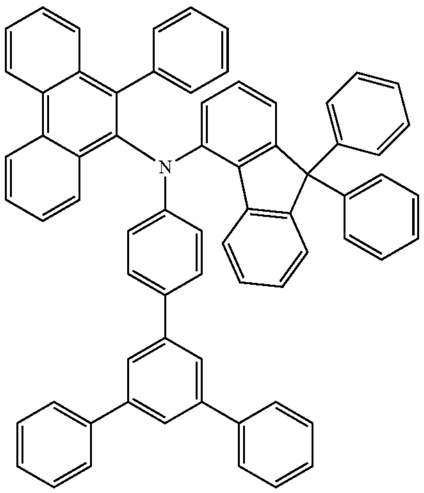
-continued
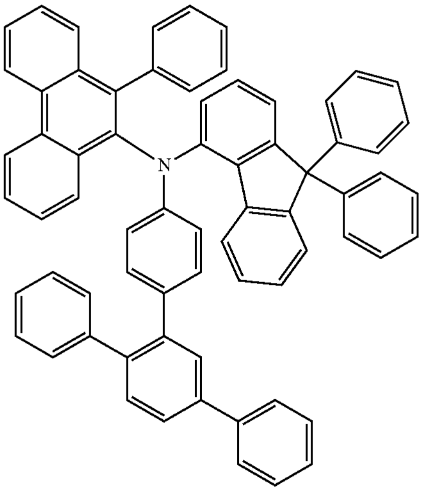
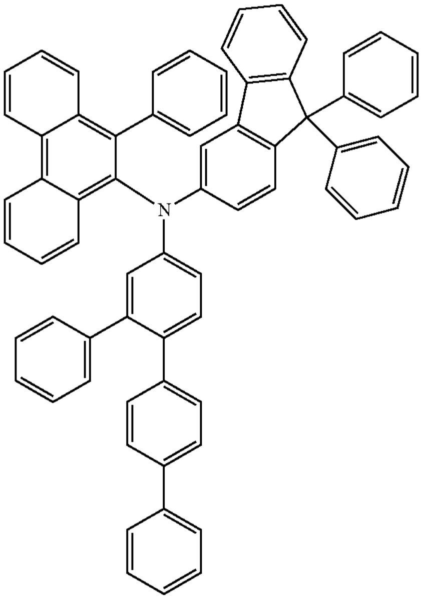
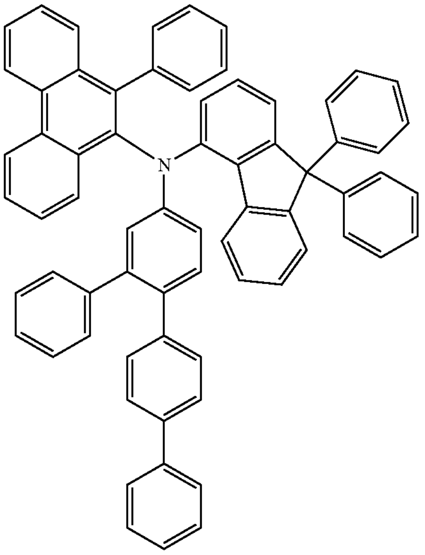

-continued
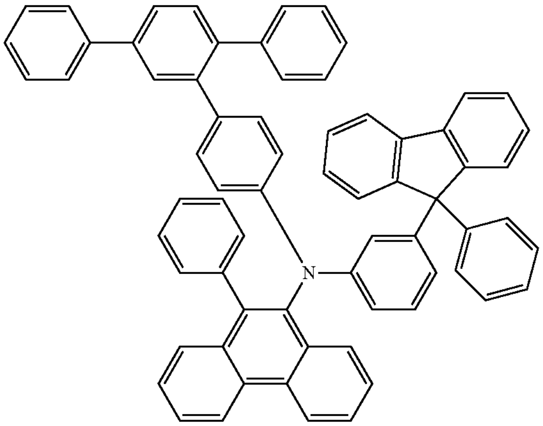
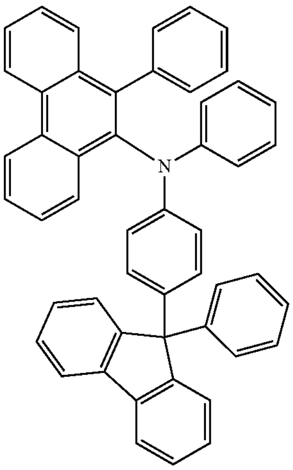
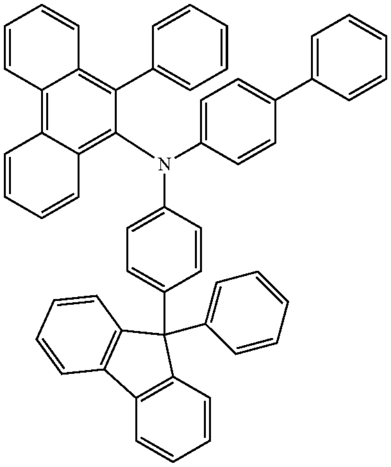
-continued
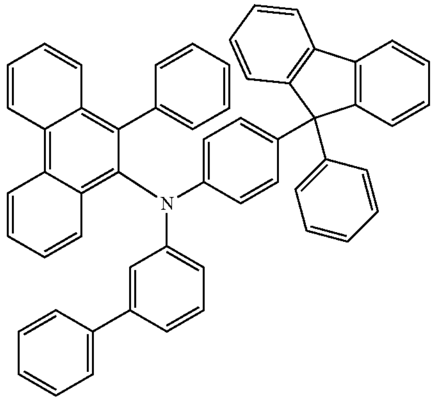
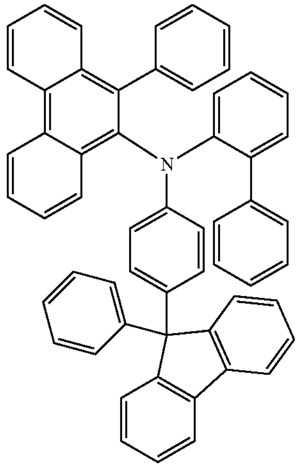
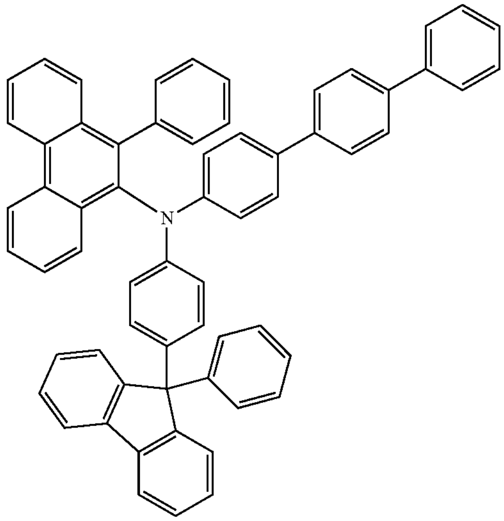

-continued
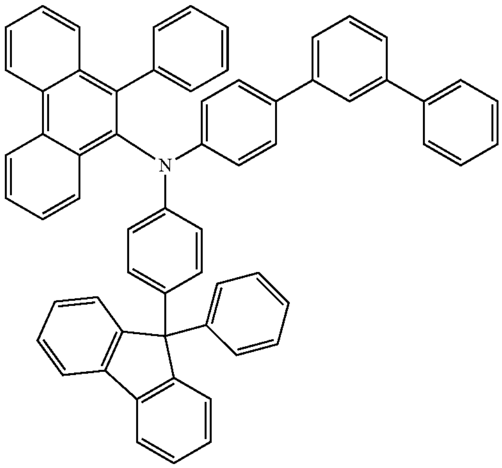
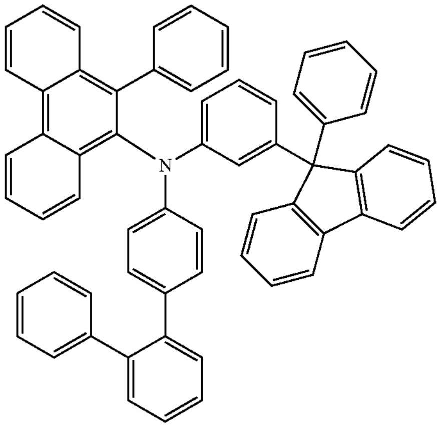
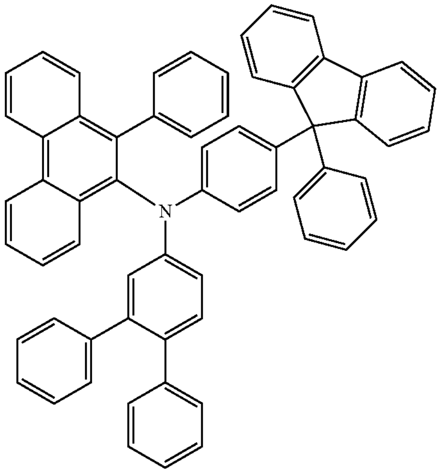
-continued
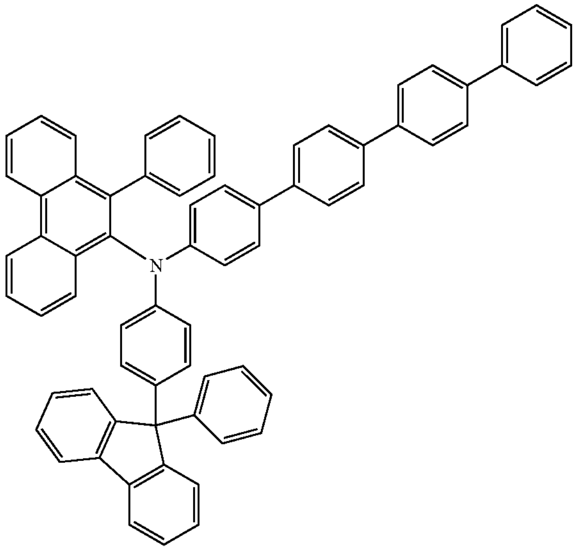
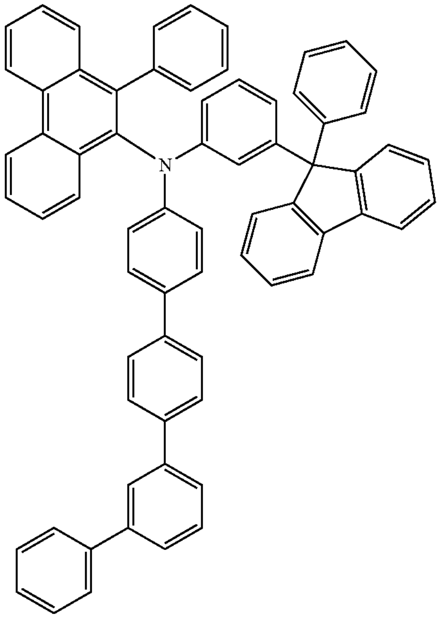
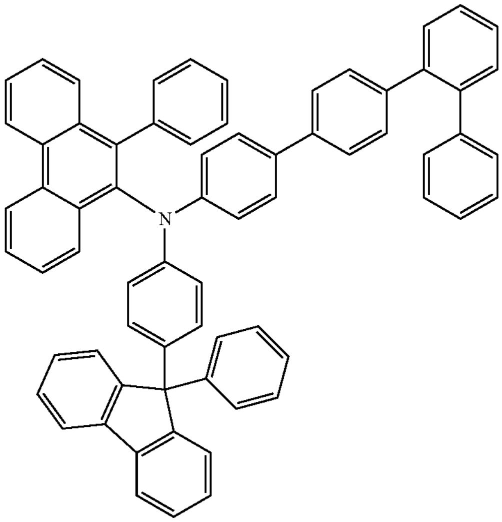

-continued
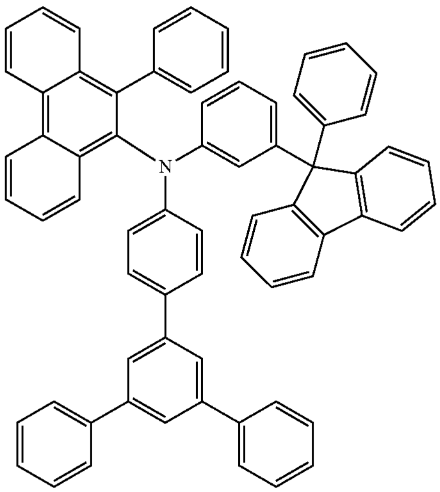
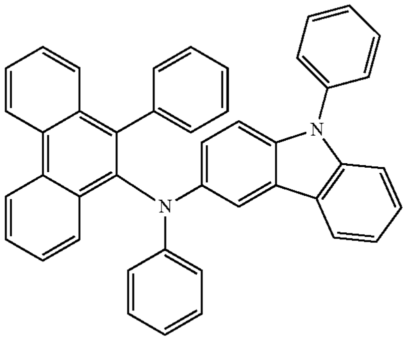
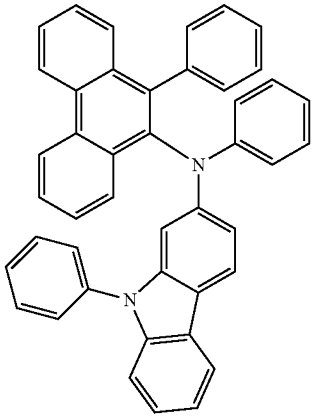
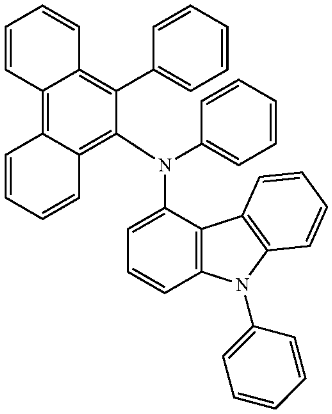
-continued
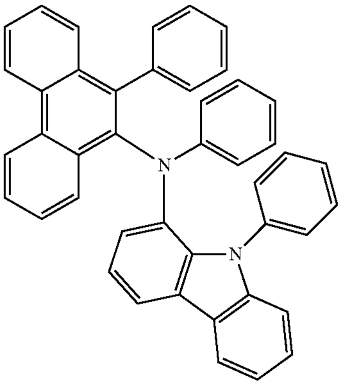
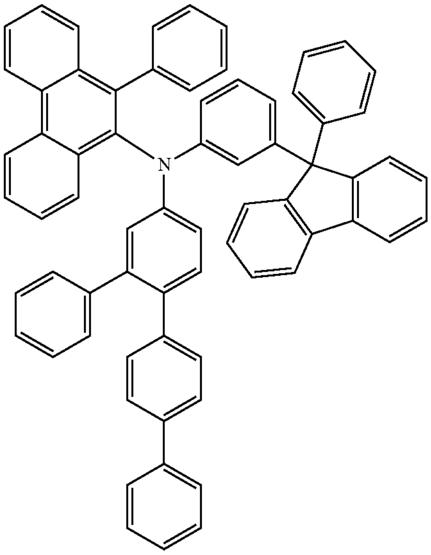
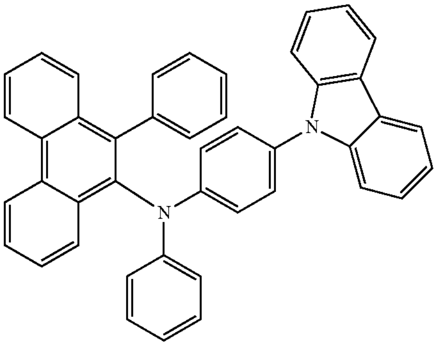
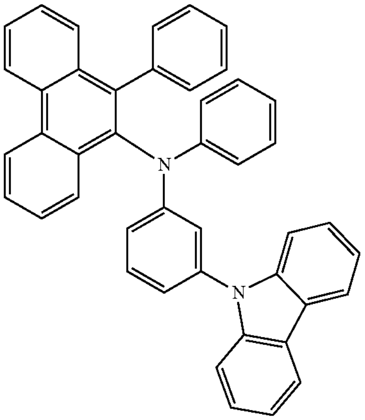

-continued
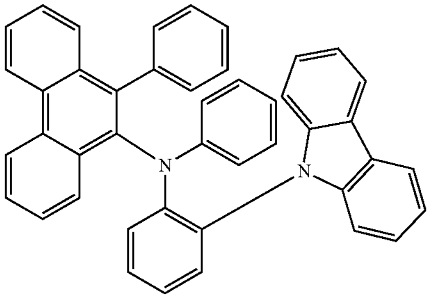
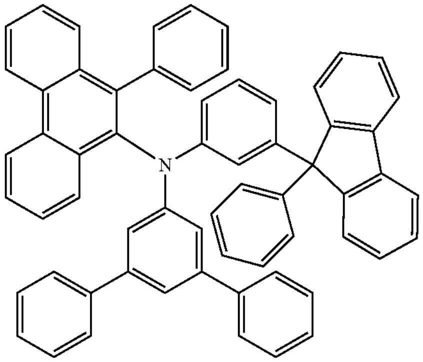
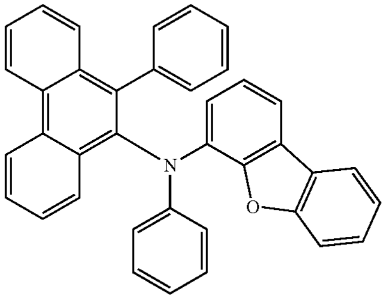
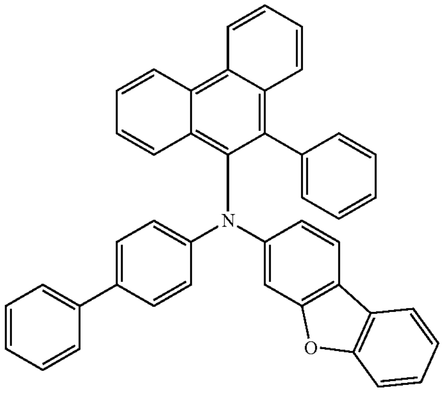
-continued
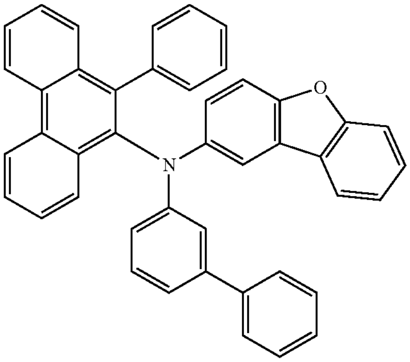
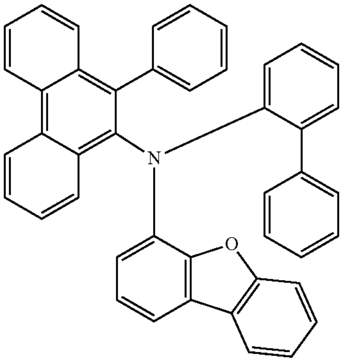
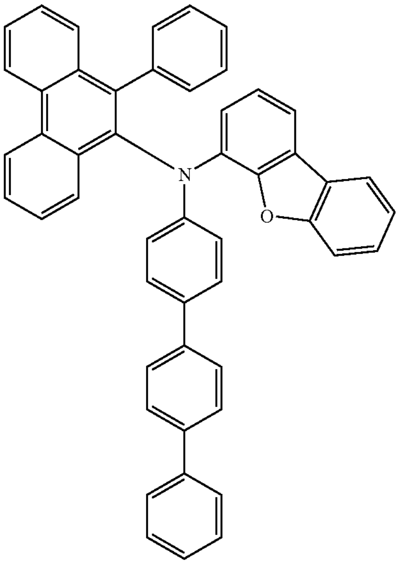

-continued
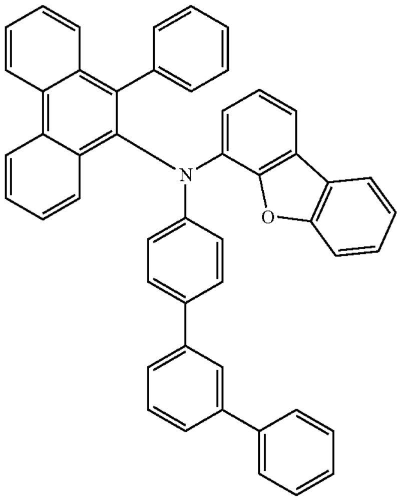
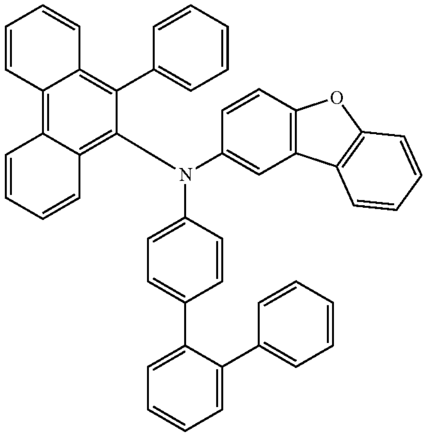
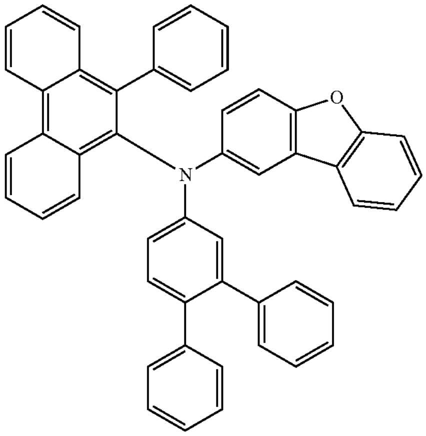
-continued
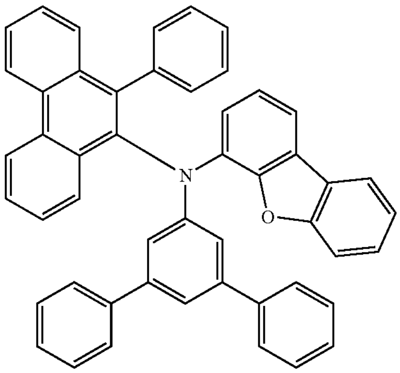
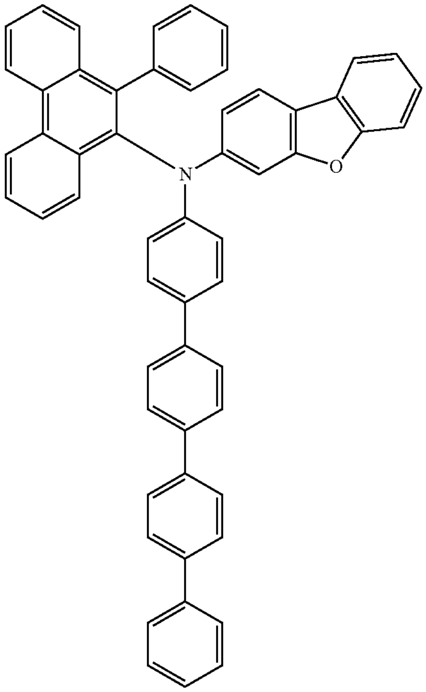
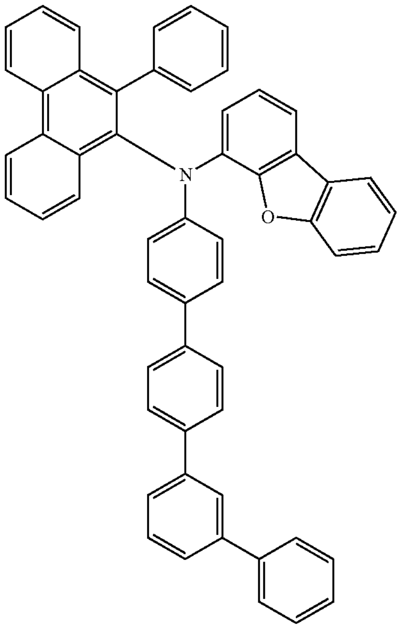

-continued
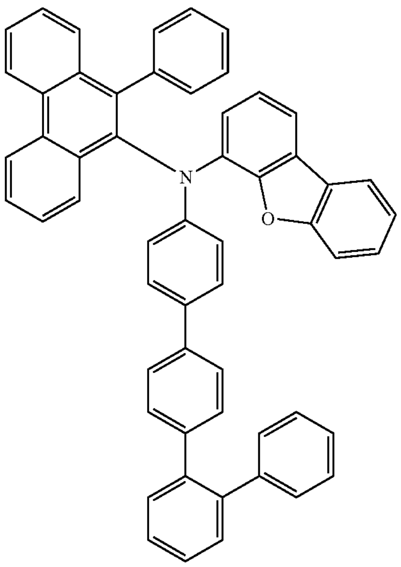
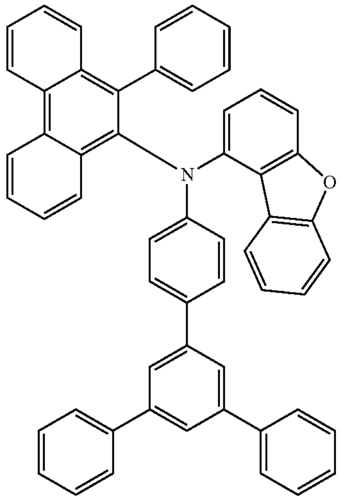
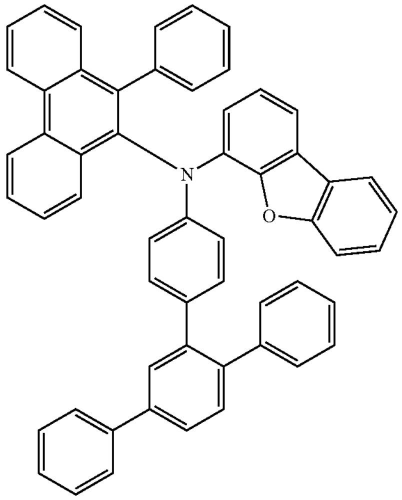
-continued
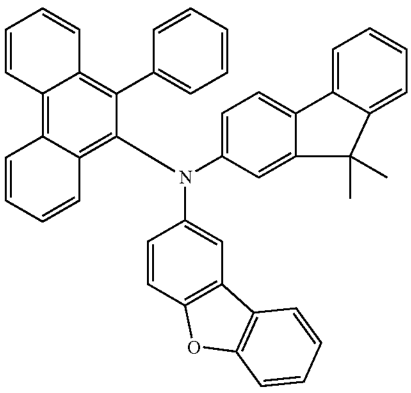
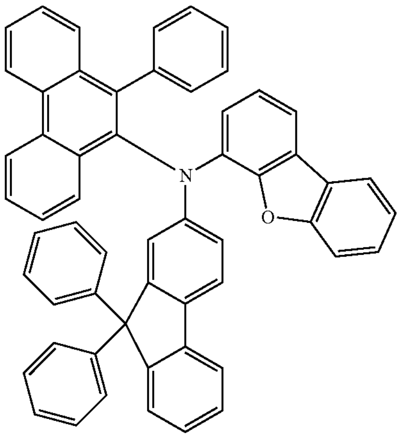
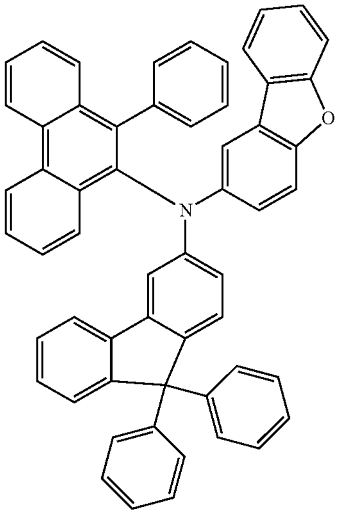
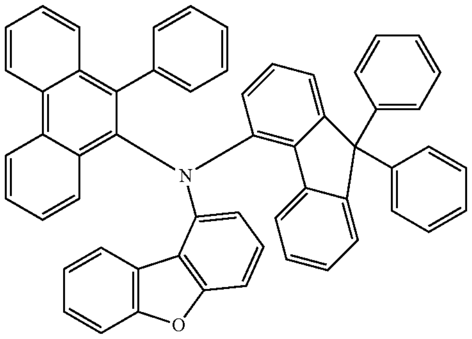

-continued
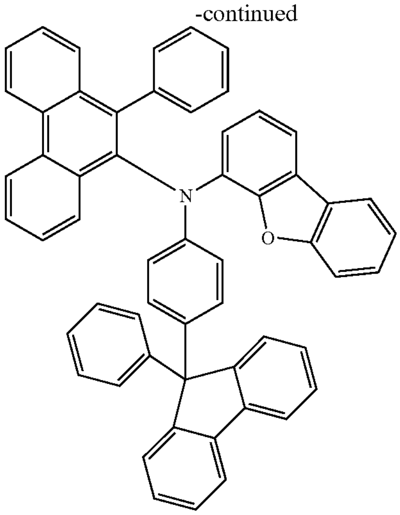
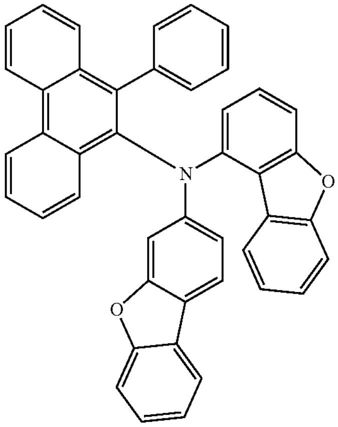
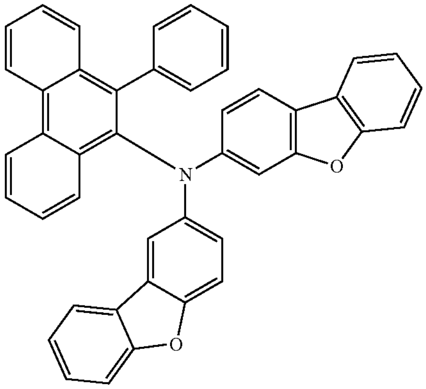
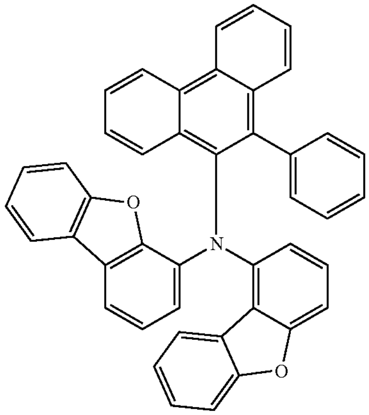
-continued
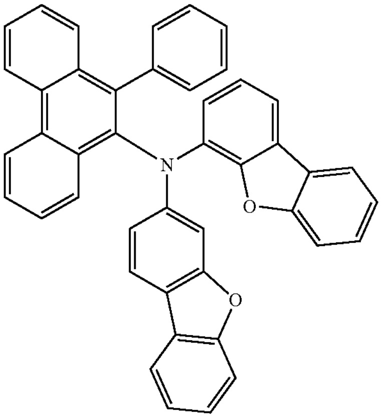
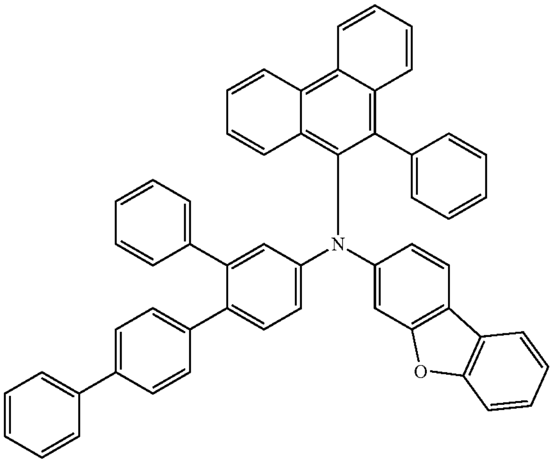
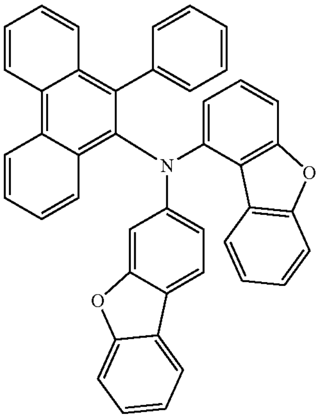
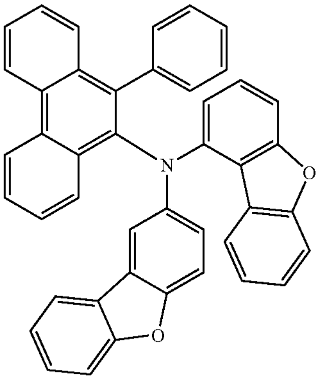

-continued
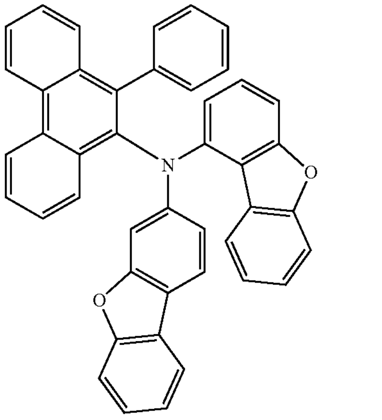
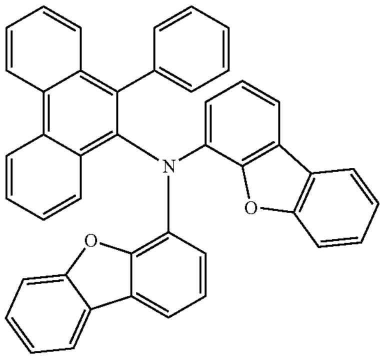
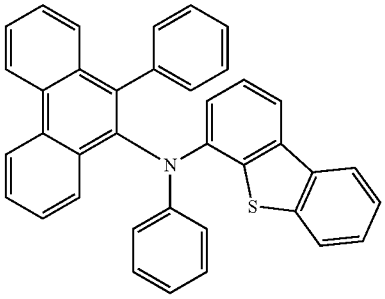
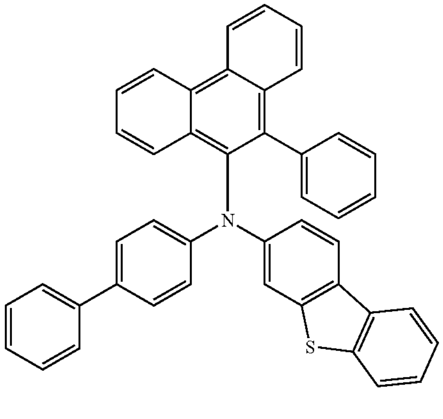
-continued
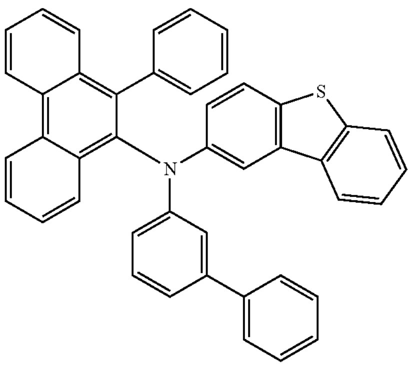
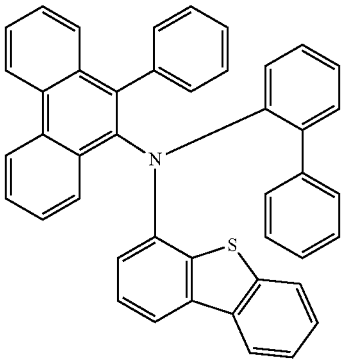
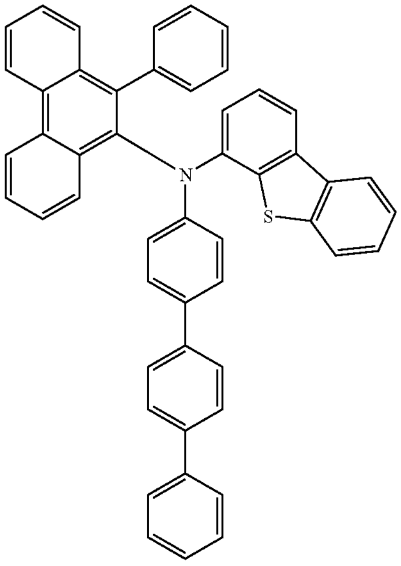

-continued
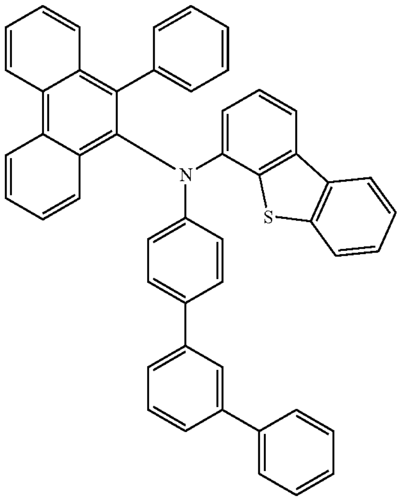
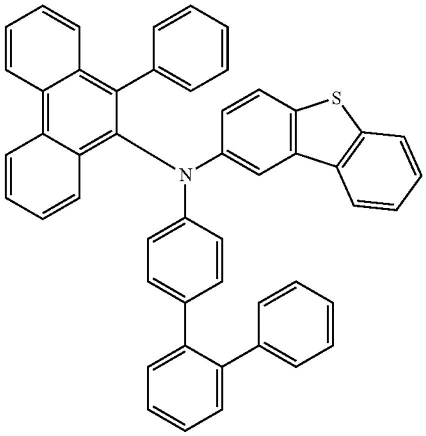
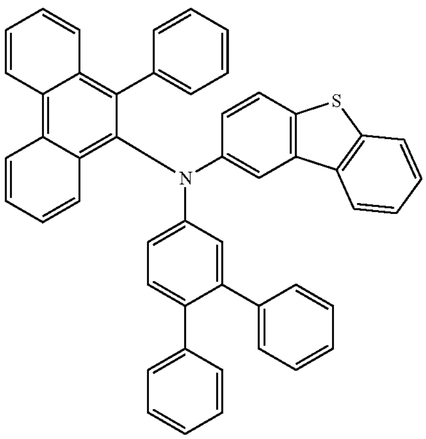
-continued
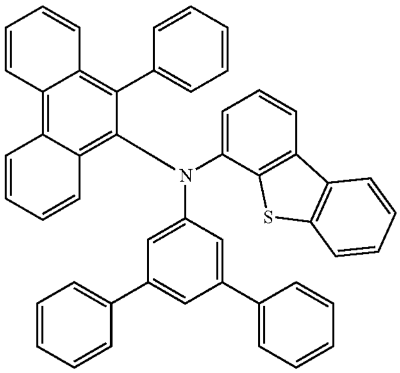
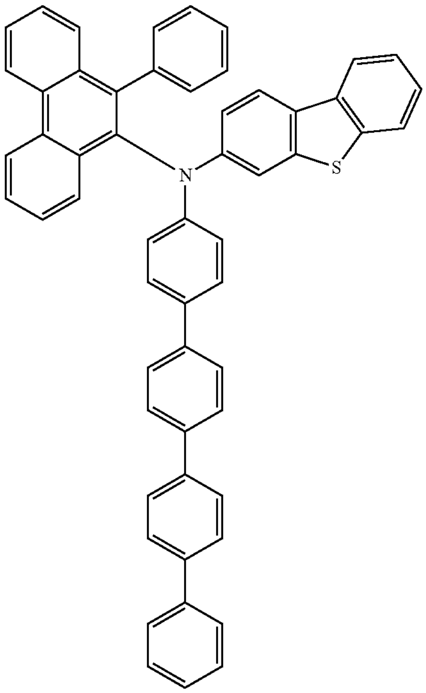
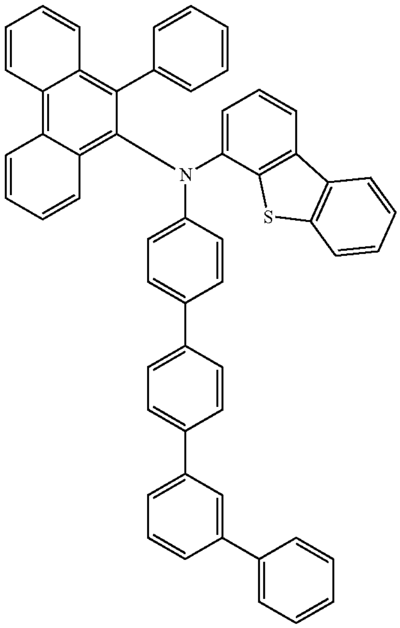

-continued
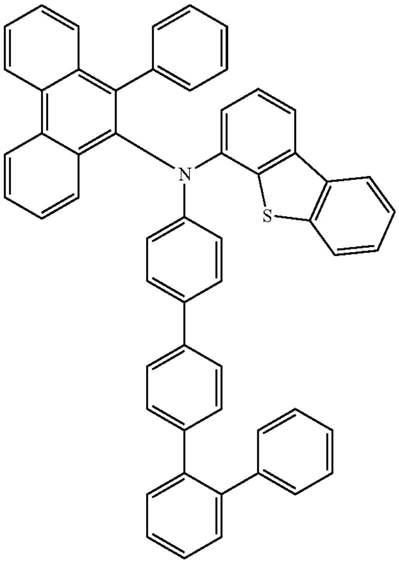
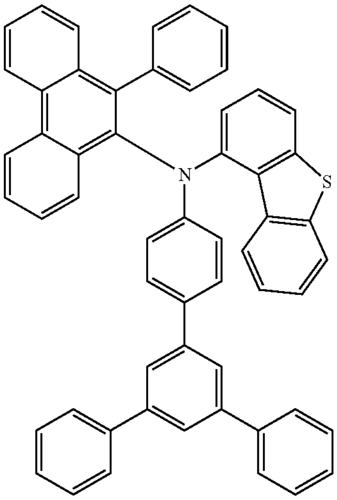
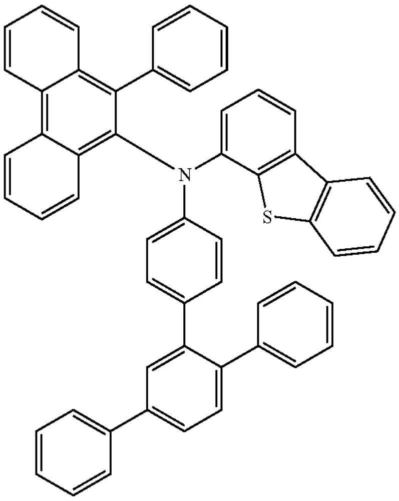
-continued
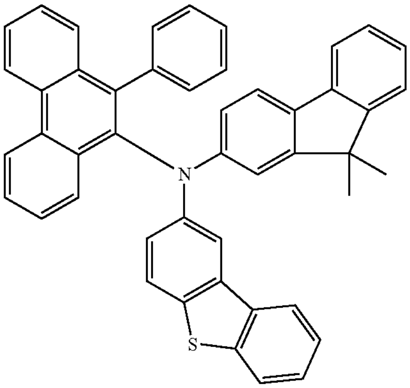
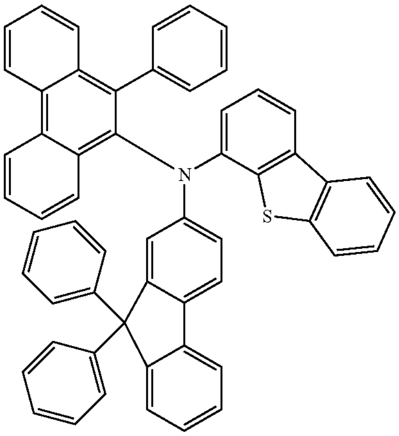 [SMILES: c1ccc(-c2c(N(c3ccc4c(c3)C(c3ccccc3)(c3ccccc3)c3ccccc3-4)c3cccc4c3oc3ccccc34)c3ccccc3c3ccccc23)cc1]
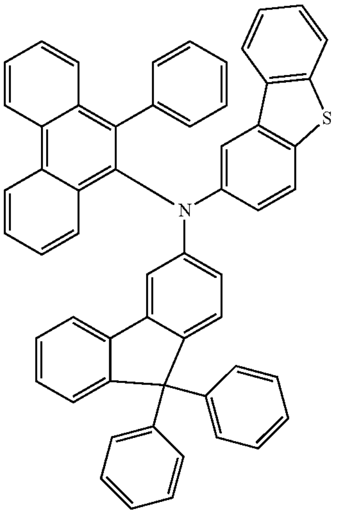
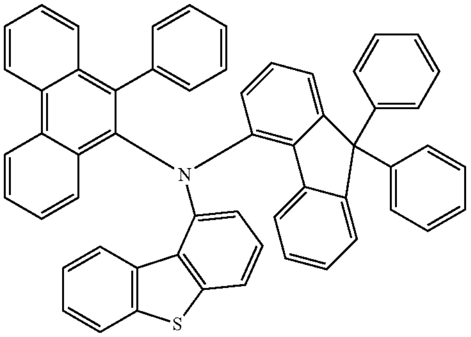

-continued
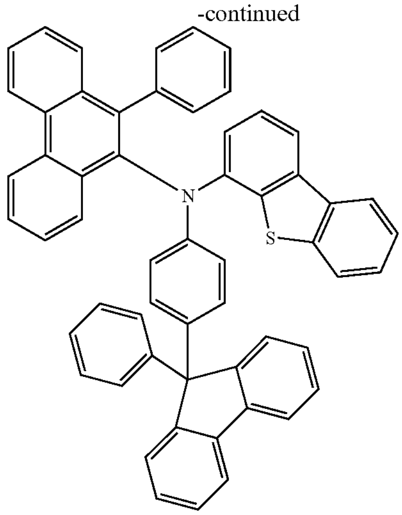
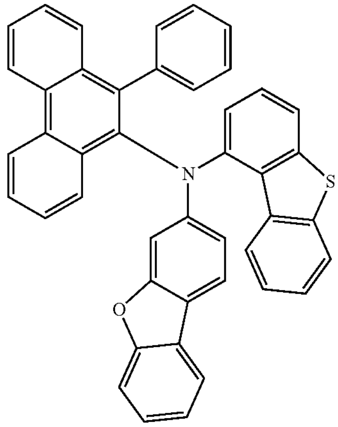
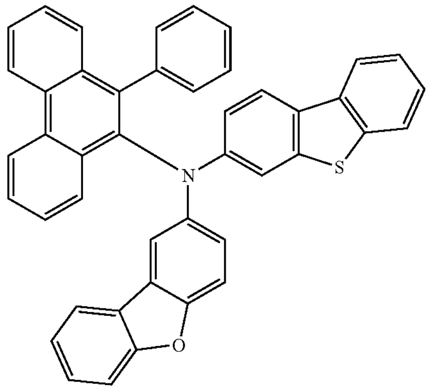
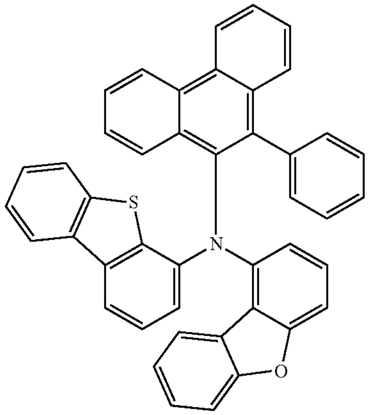
-continued
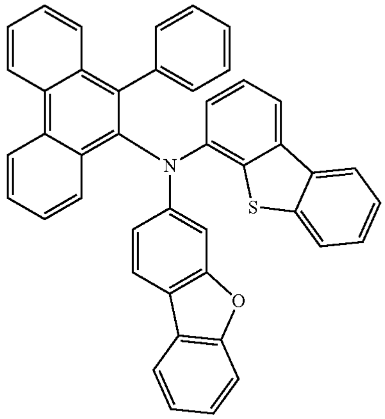
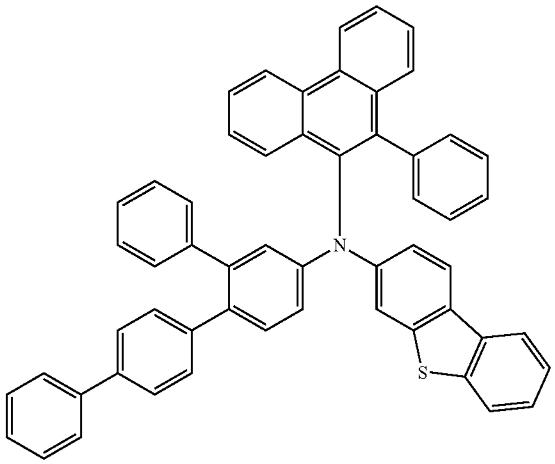
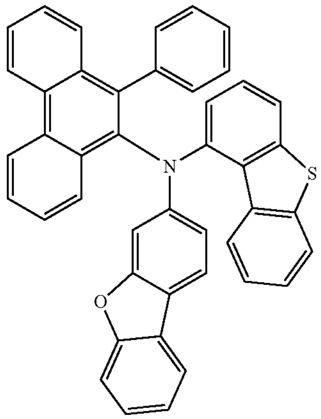
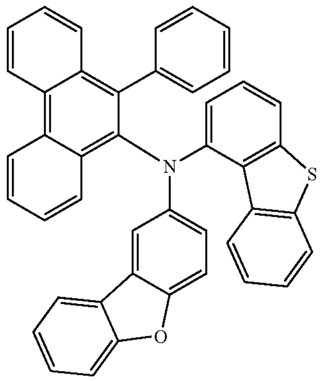

-continued
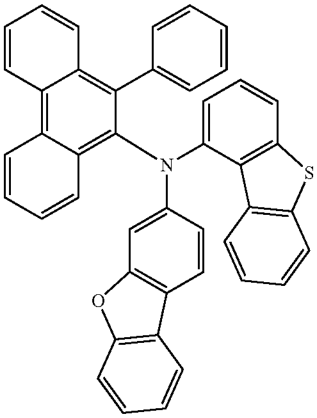
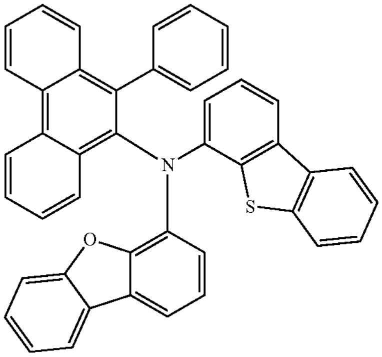
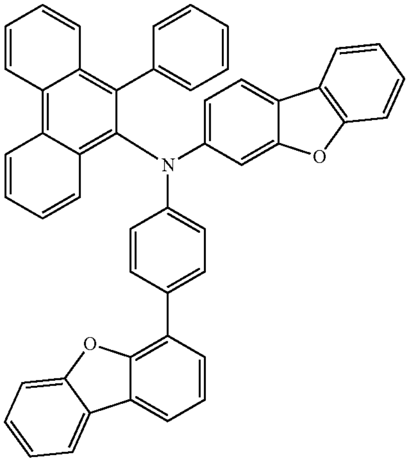
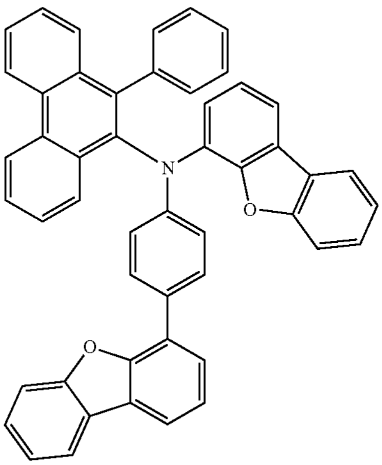
-continued
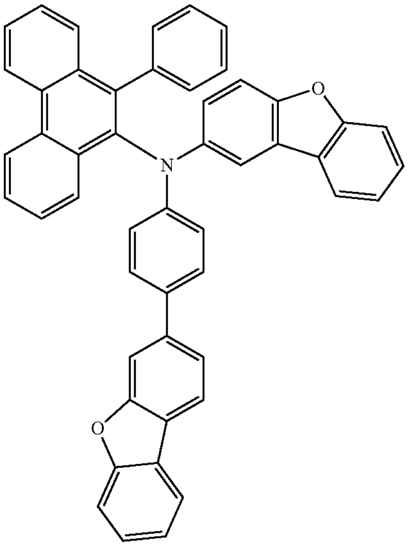
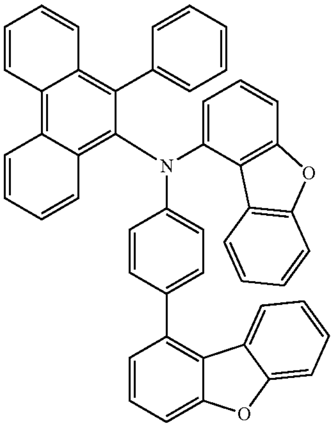
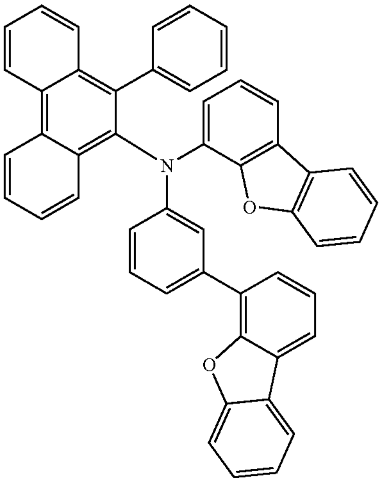

-continued
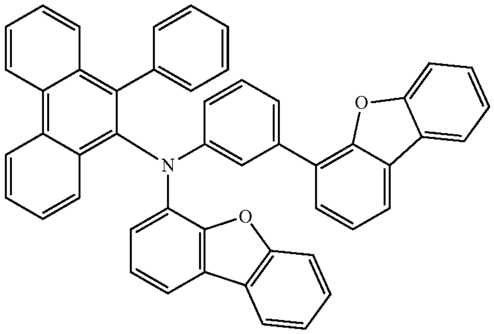
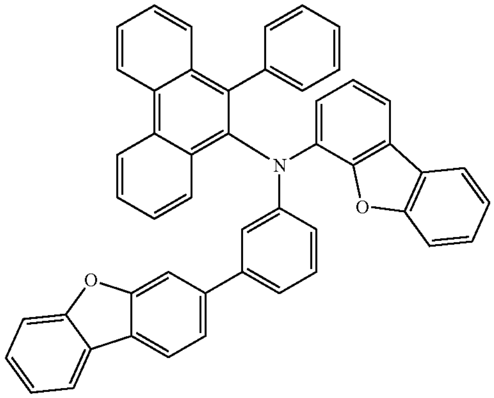
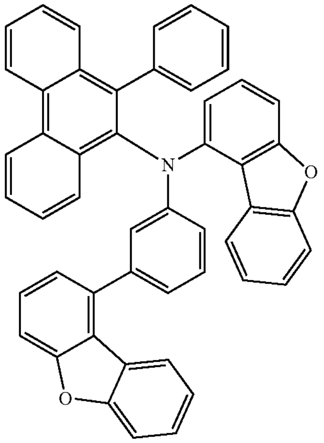
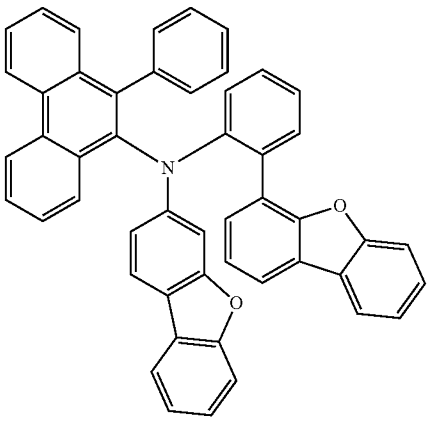
-continued
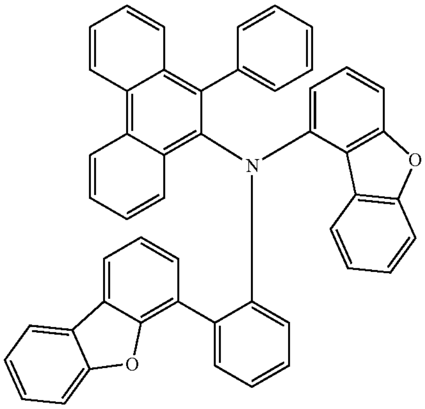
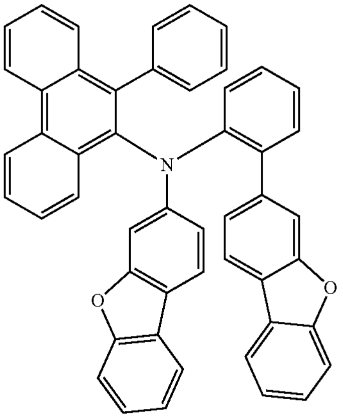
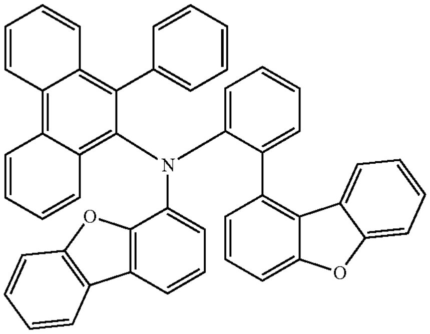
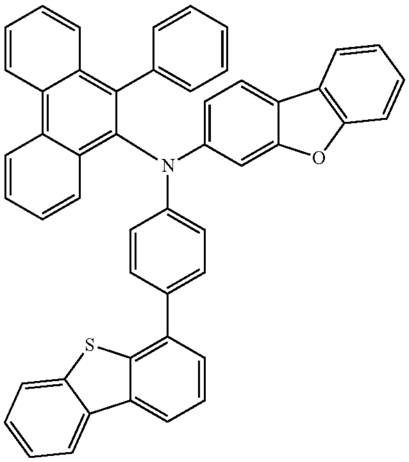

-continued
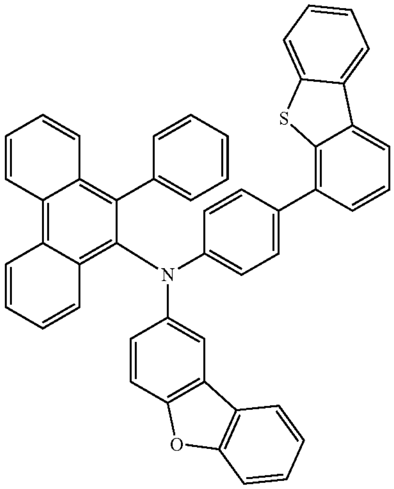
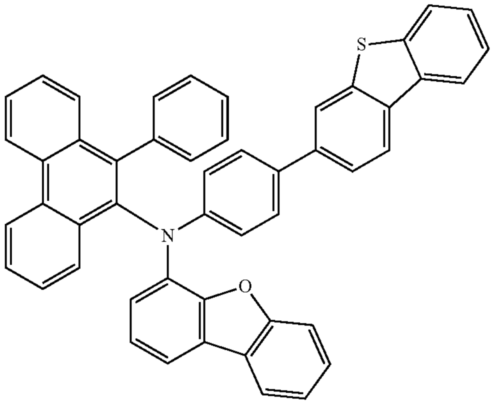
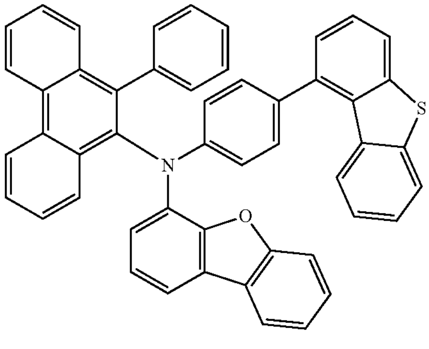
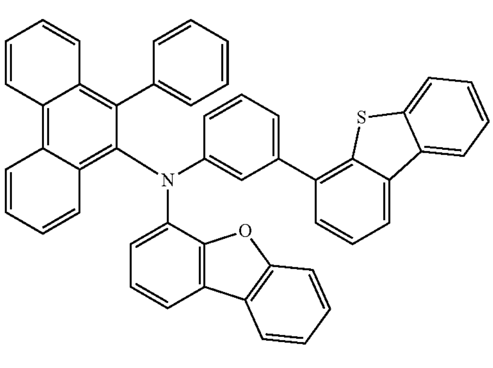
-continued
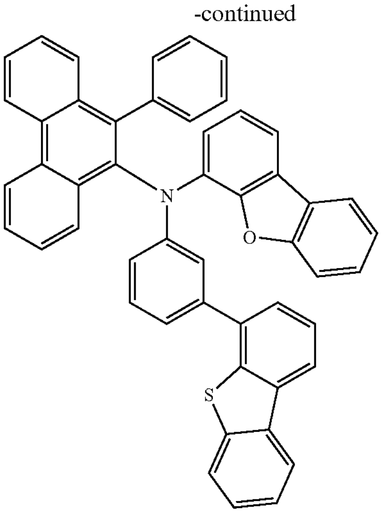
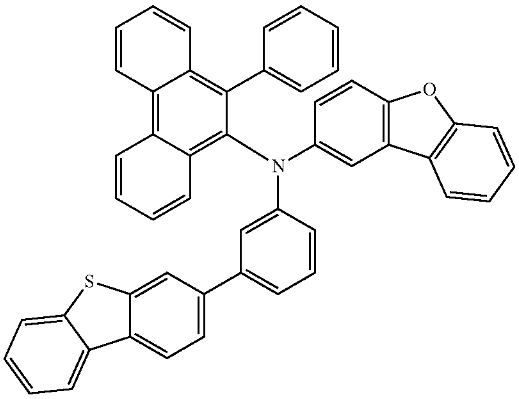
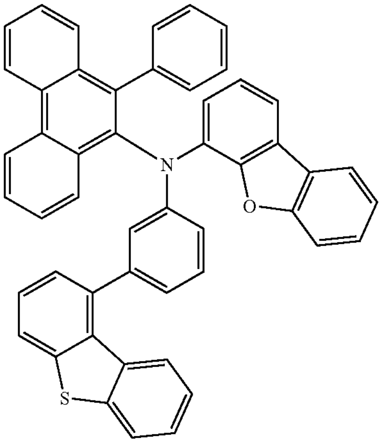

-continued
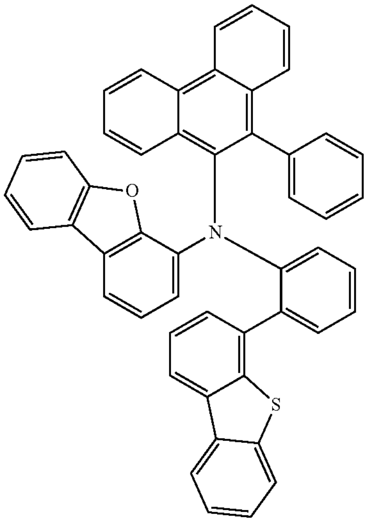
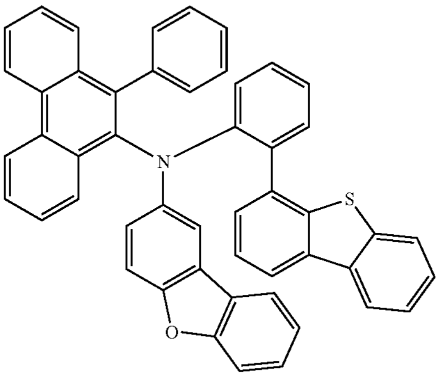
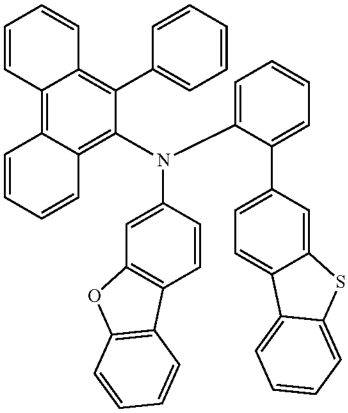
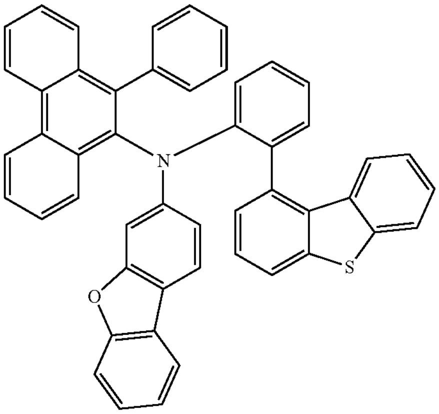
-continued
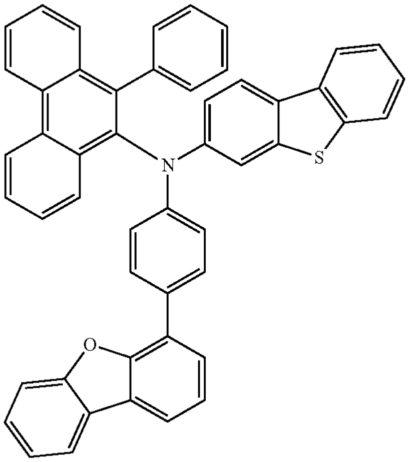
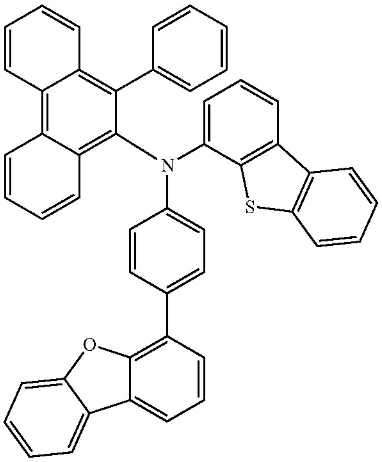
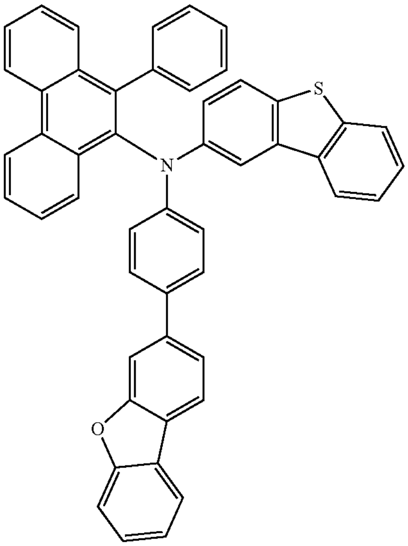

-continued
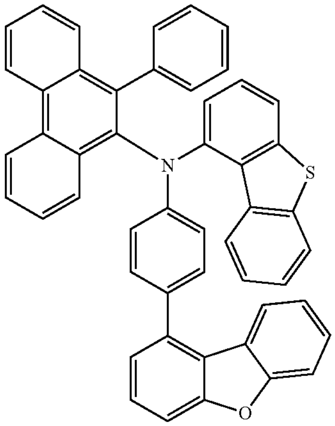
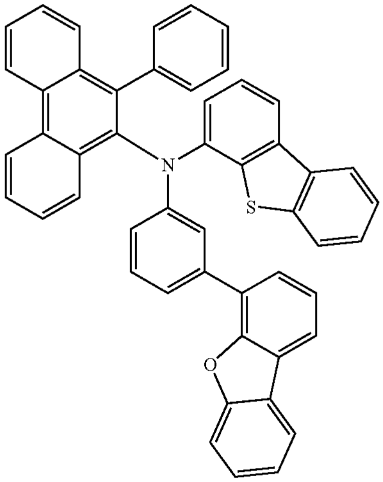
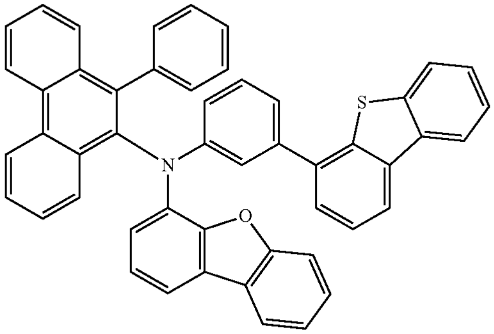
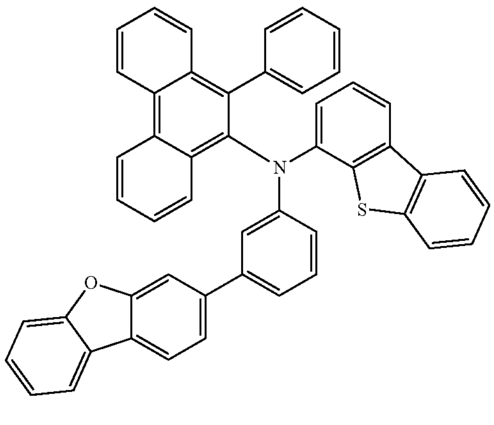
-continued
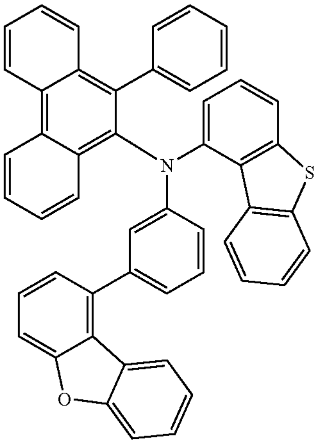
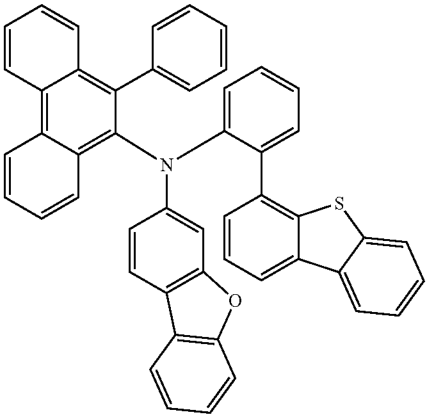
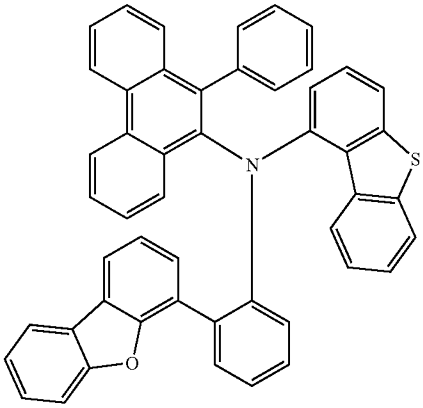
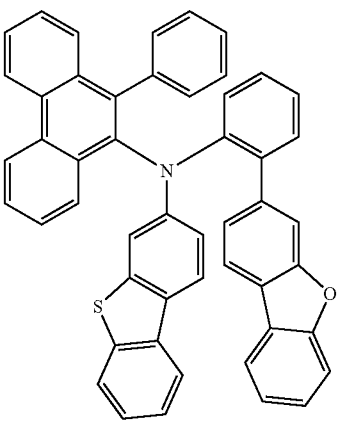

-continued
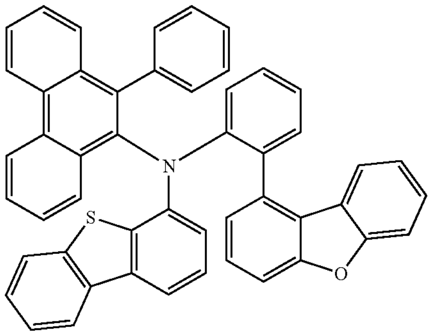
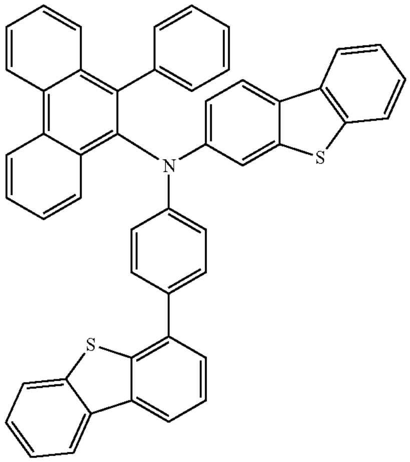
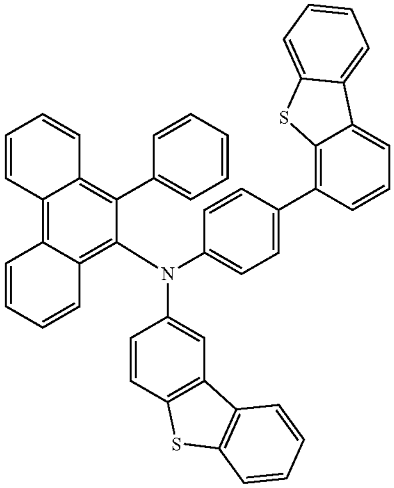
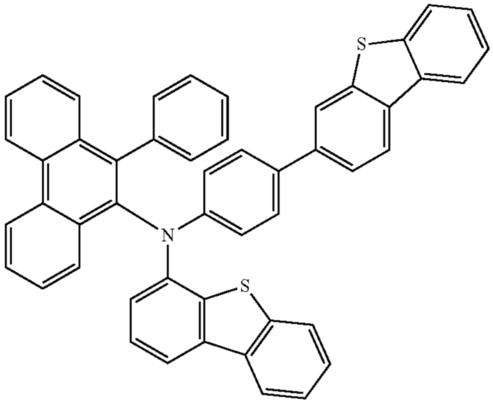
-continued
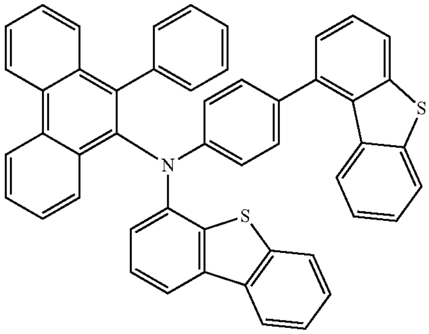
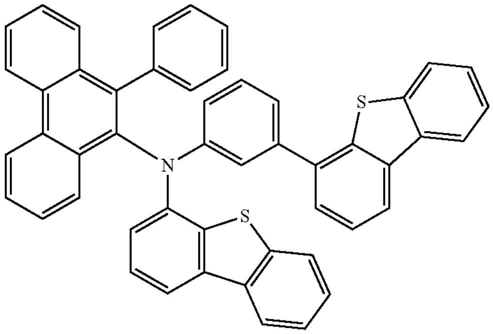
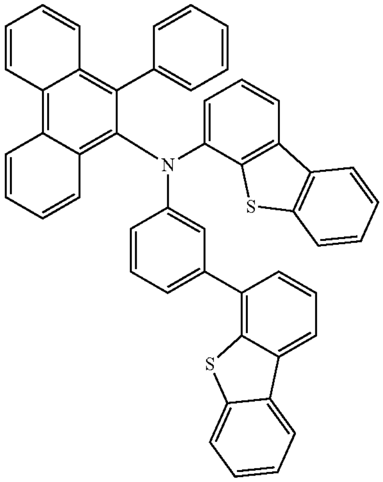
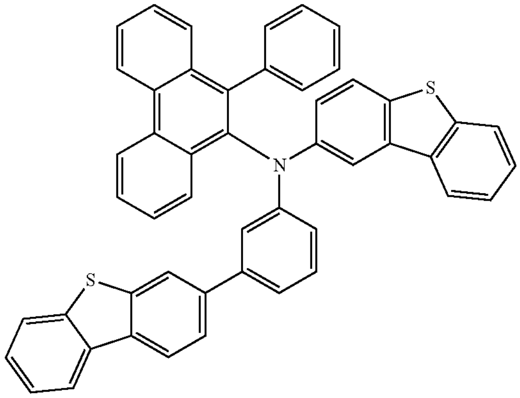

-continued
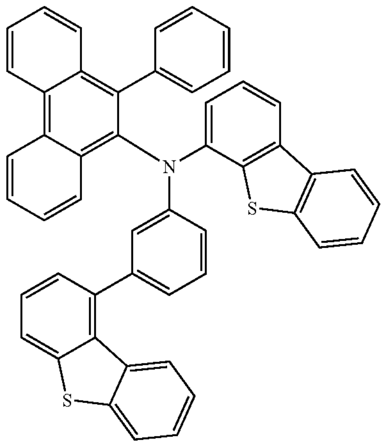
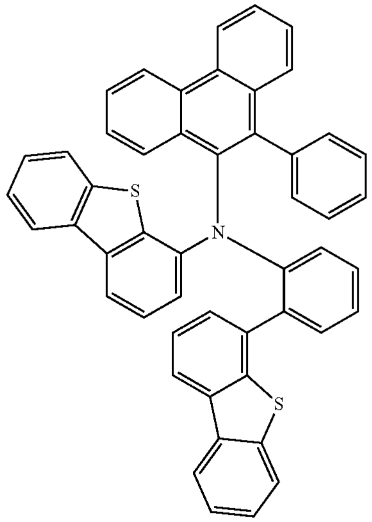
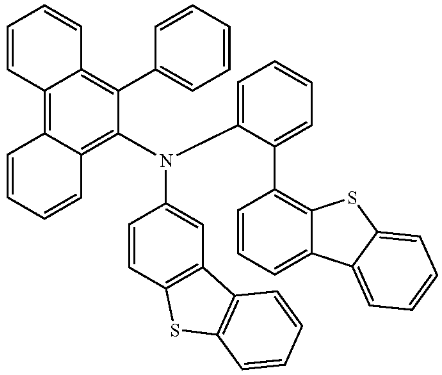
-continued
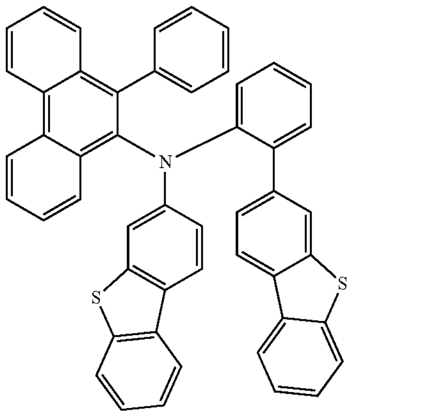
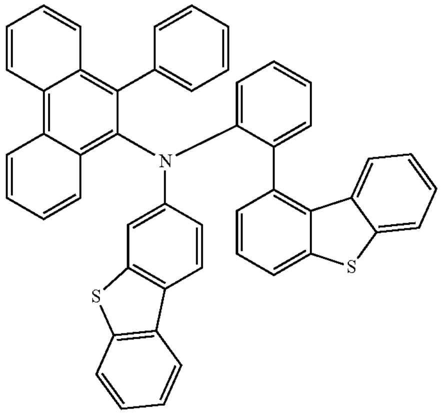
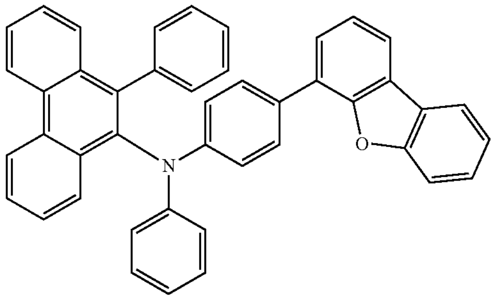
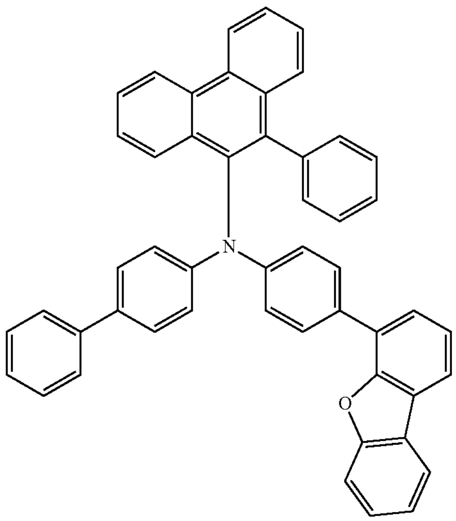

-continued
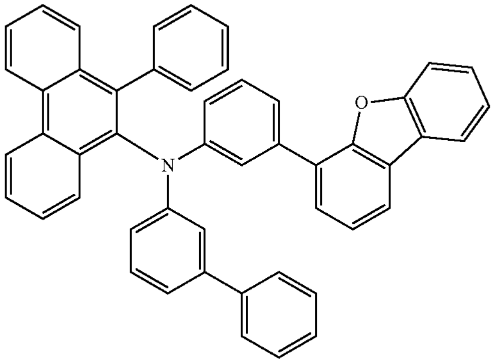
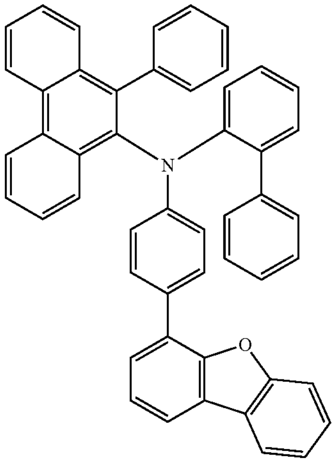
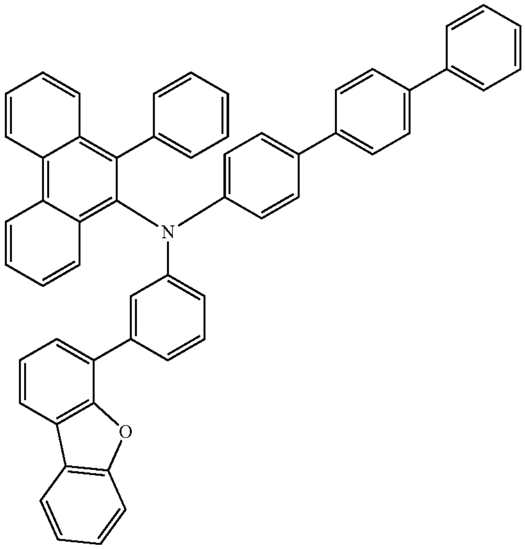
-continued
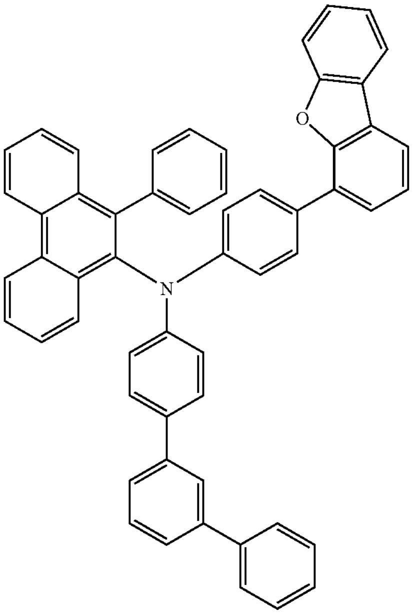
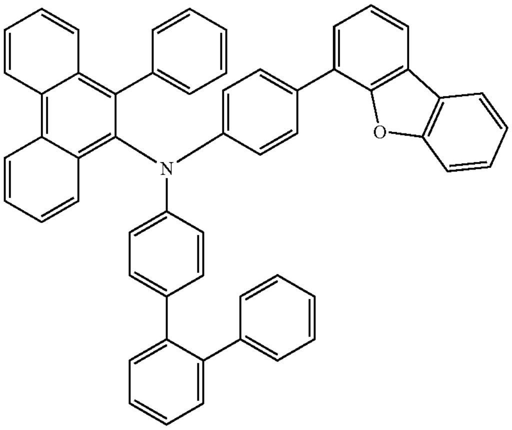
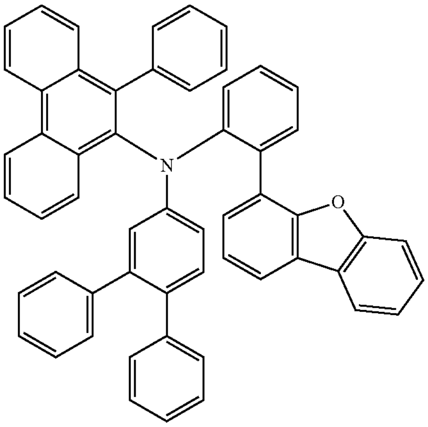

-continued
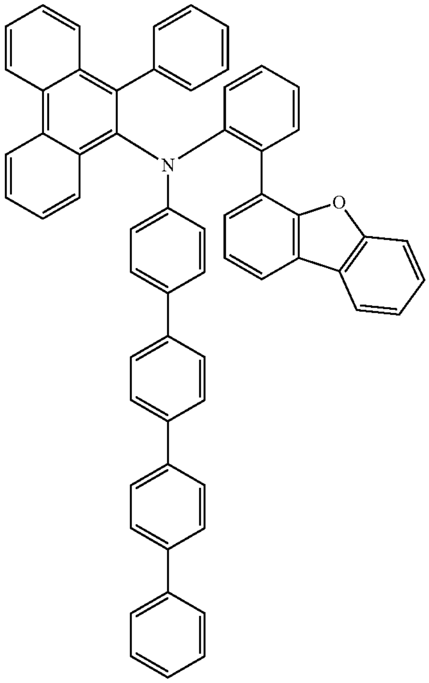
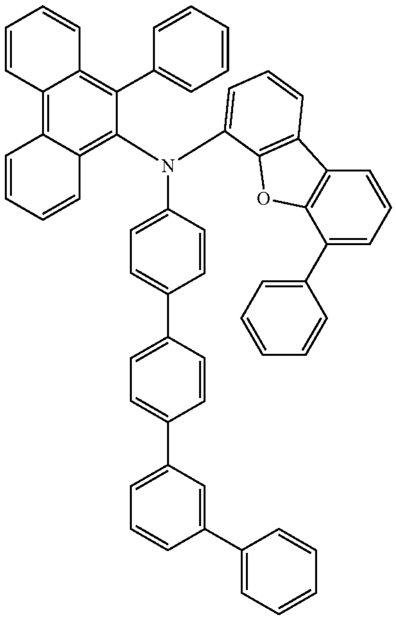
-continued
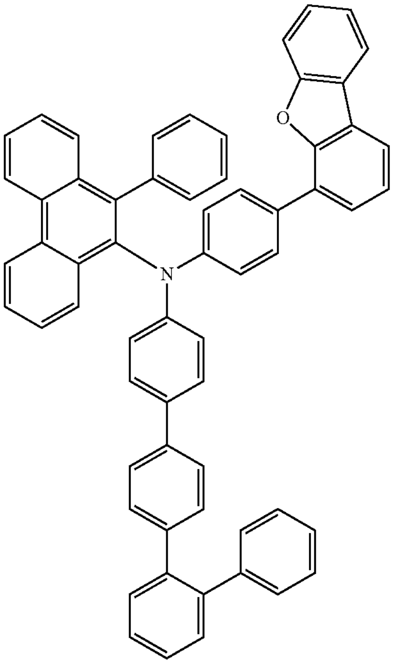
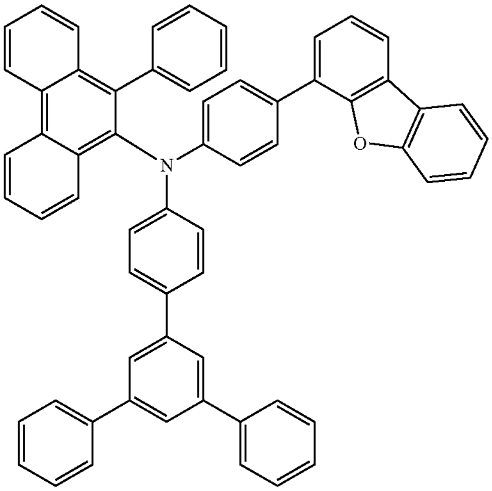
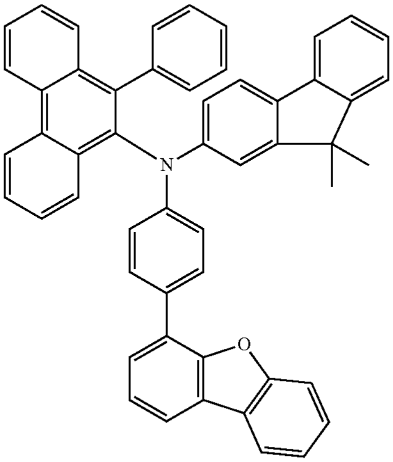

-continued
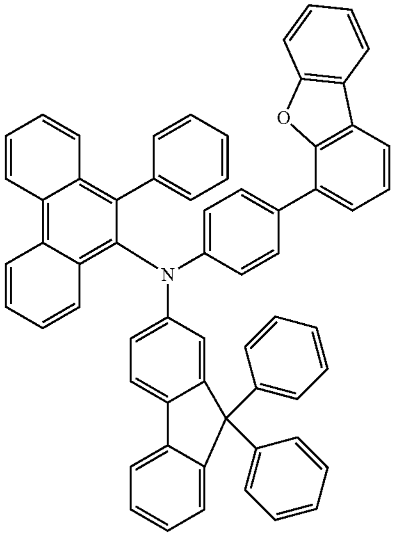
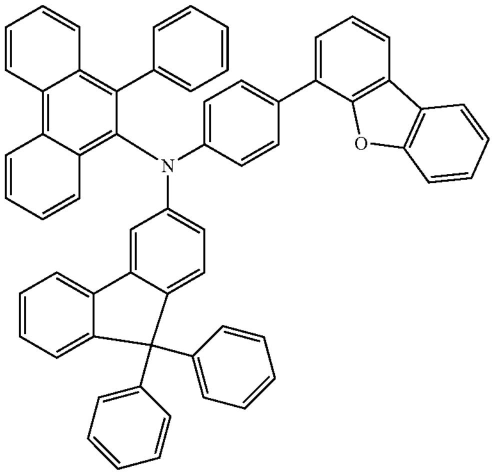
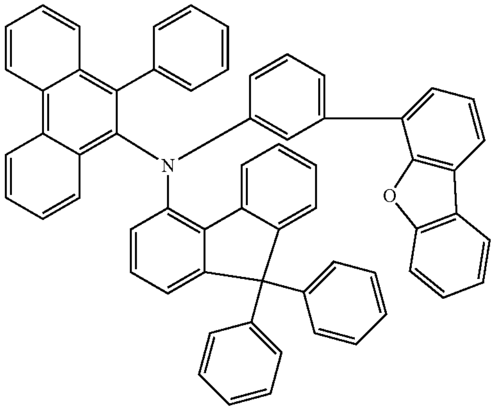
-continued
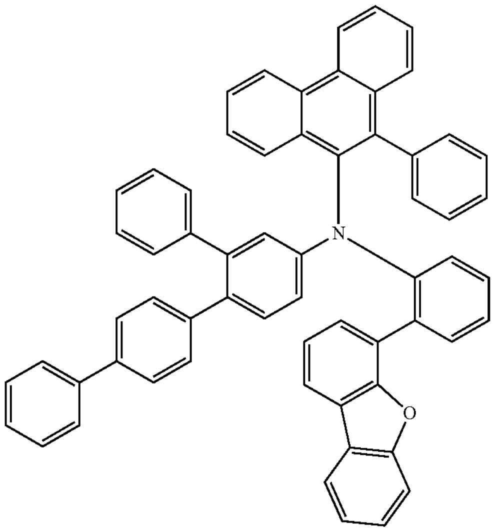
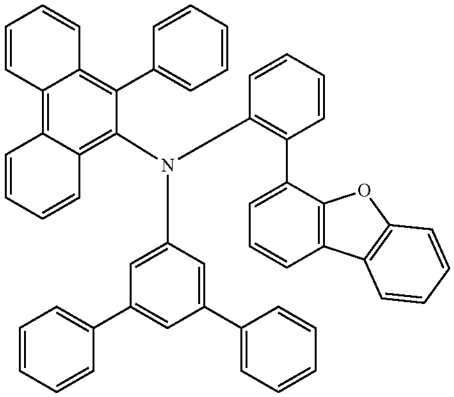
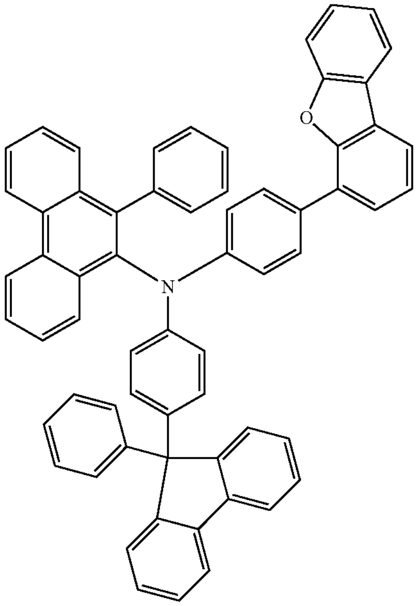

-continued
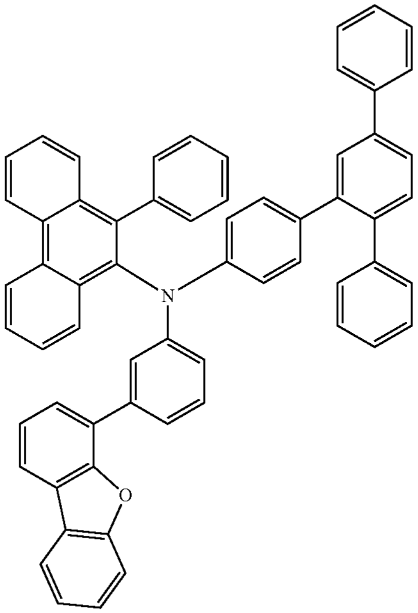
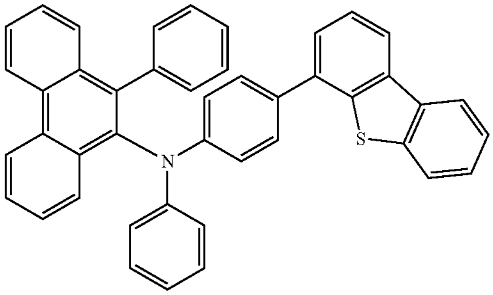
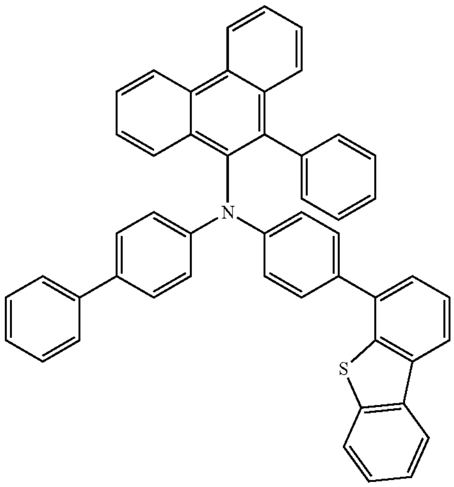
-continued
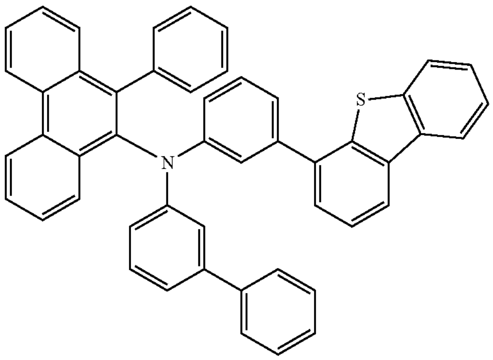
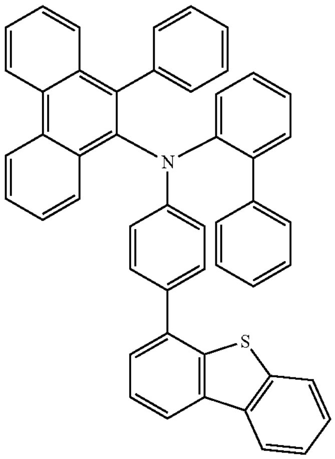
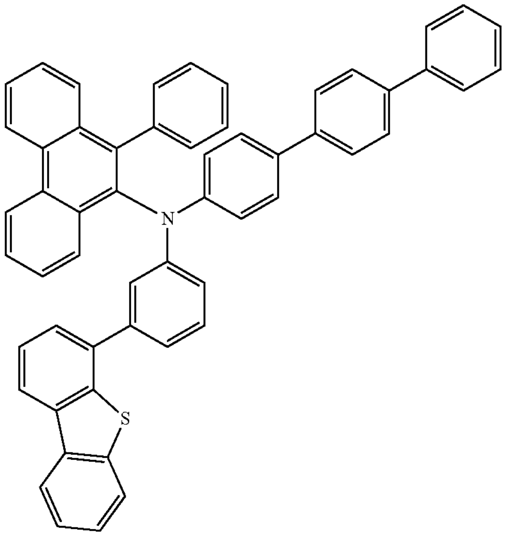

-continued
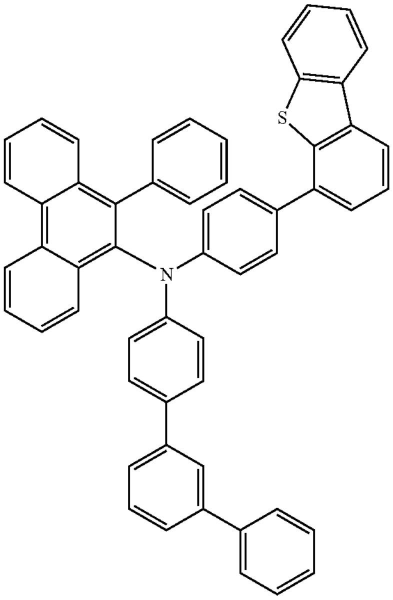
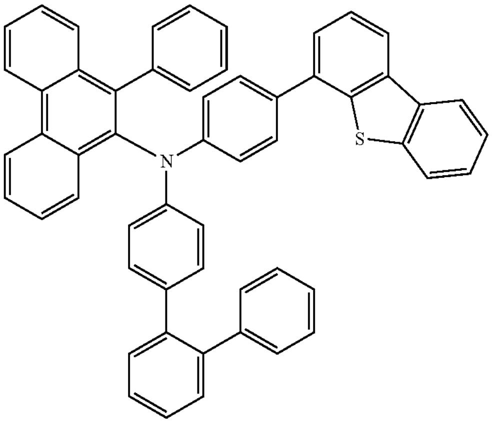
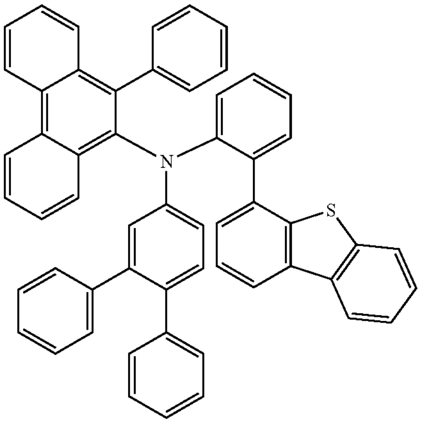
-continued
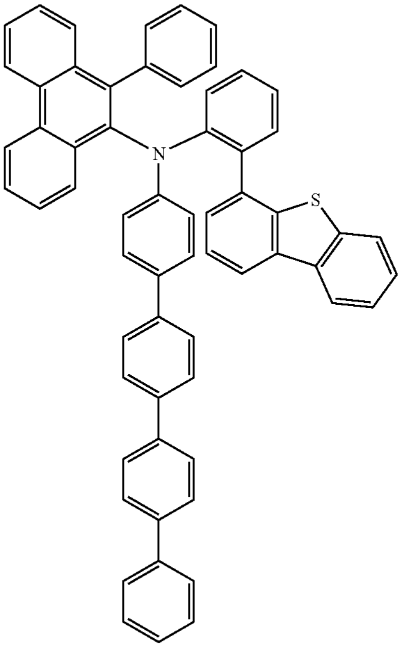
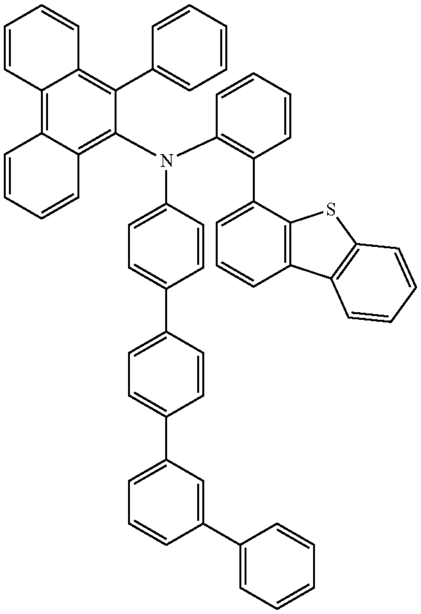

-continued
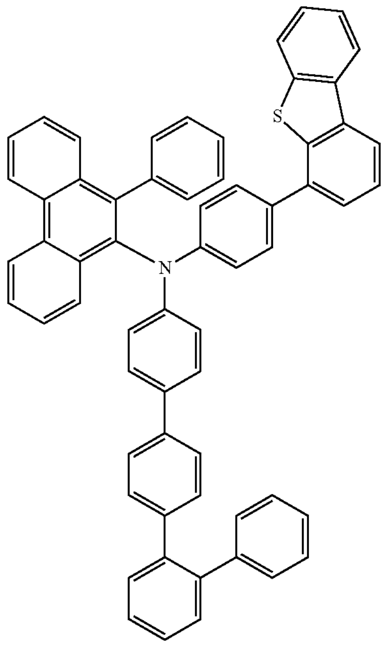
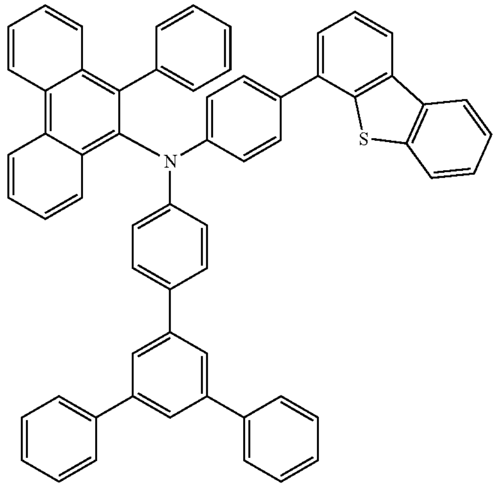
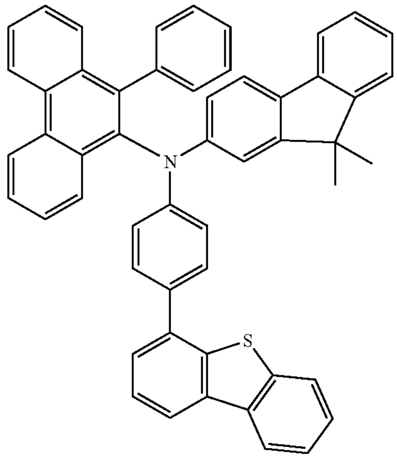
-continued
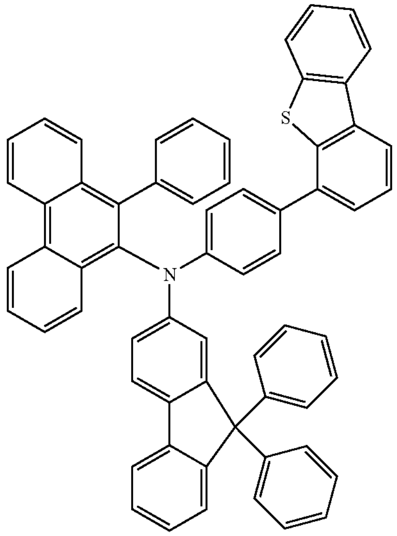
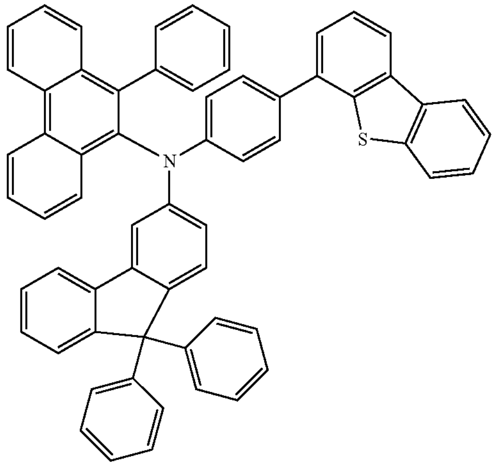
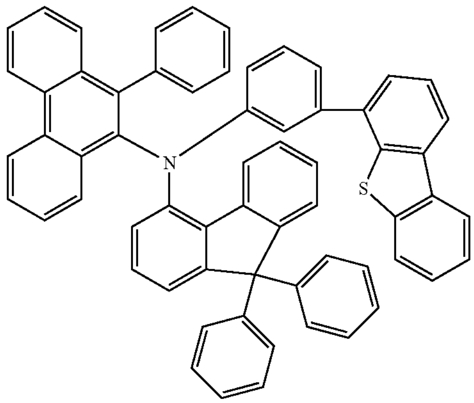

-continued
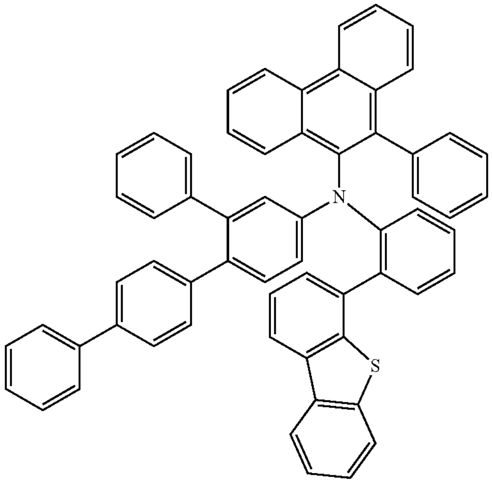
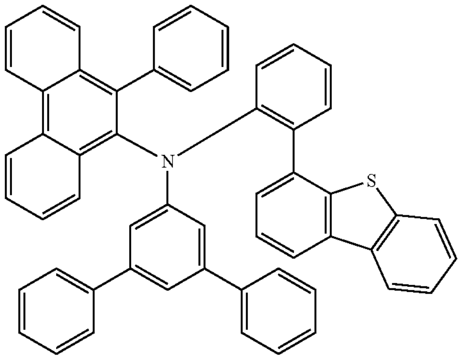
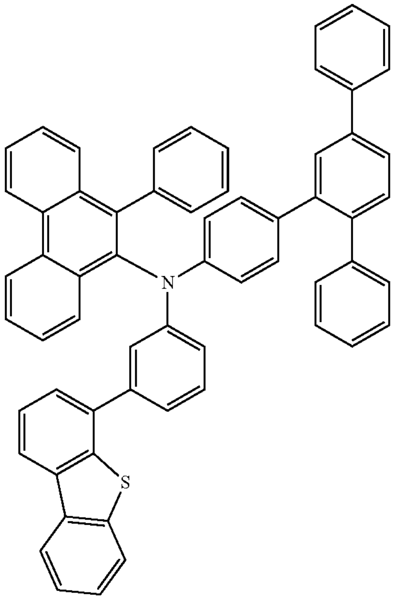
-continued
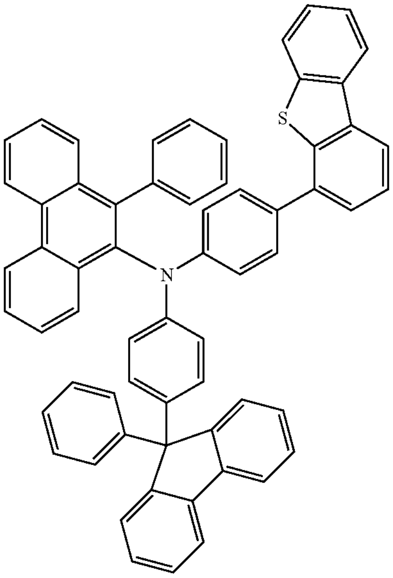
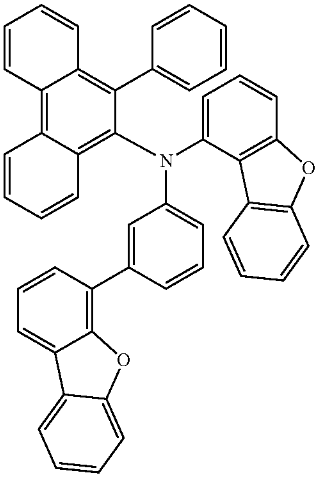
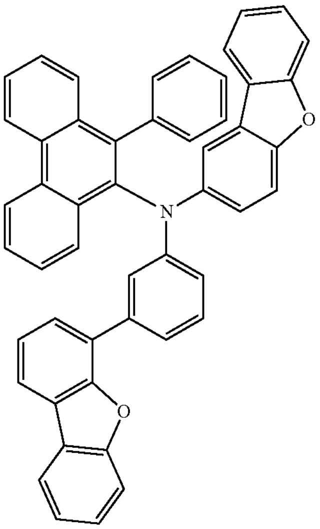

-continued
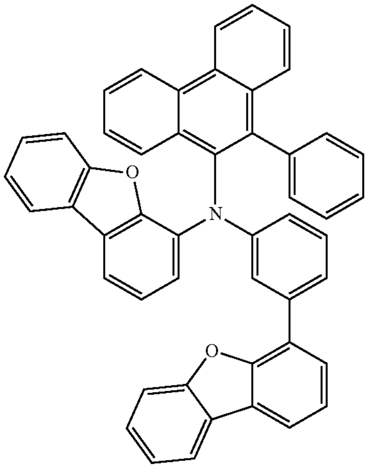
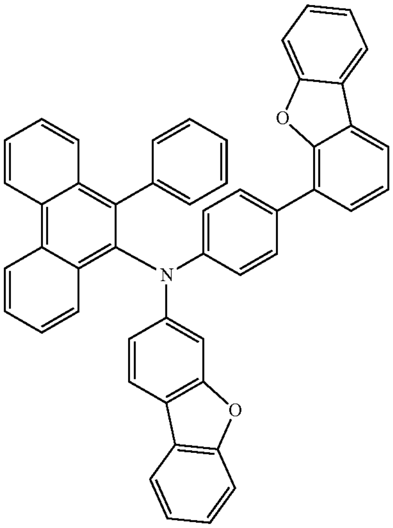
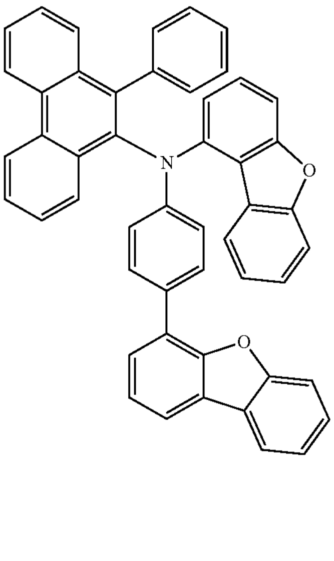
-continued
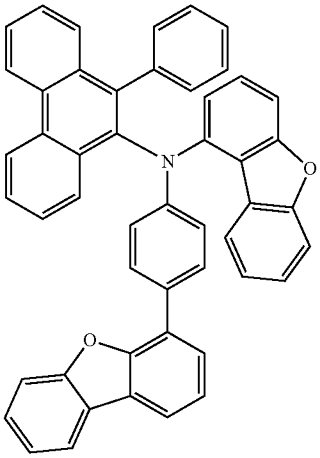
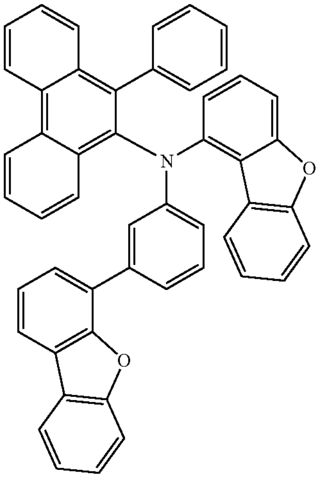
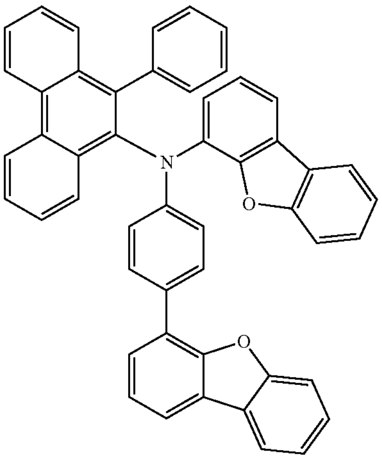

-continued
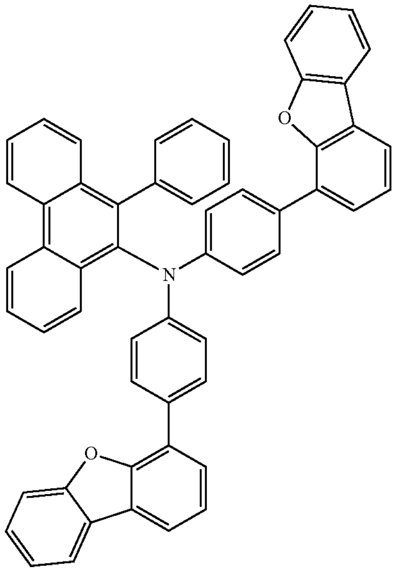
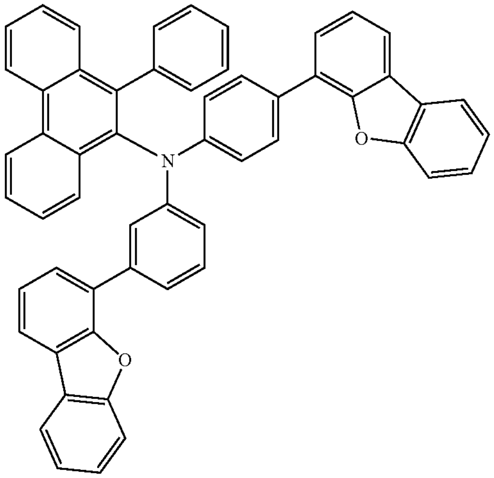
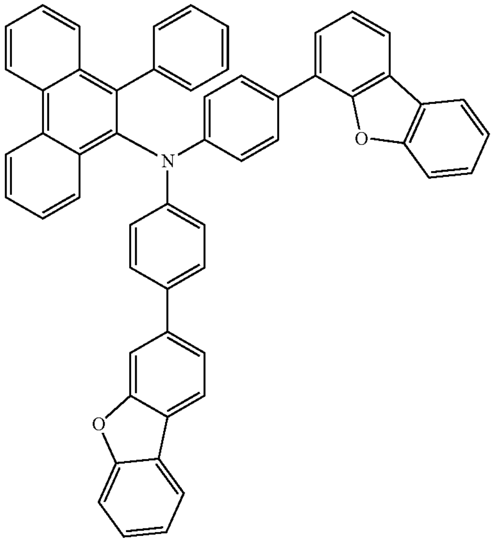
-continued
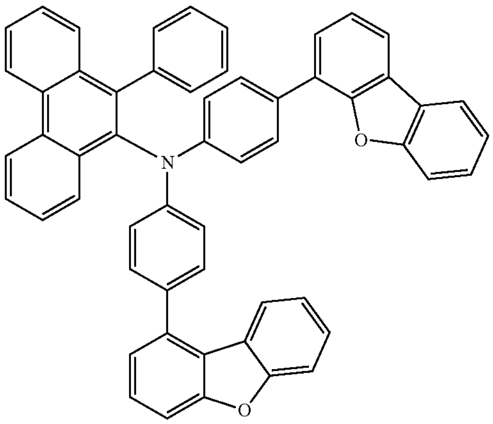
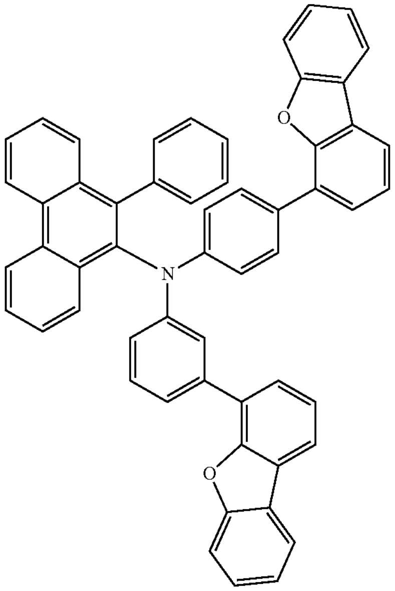
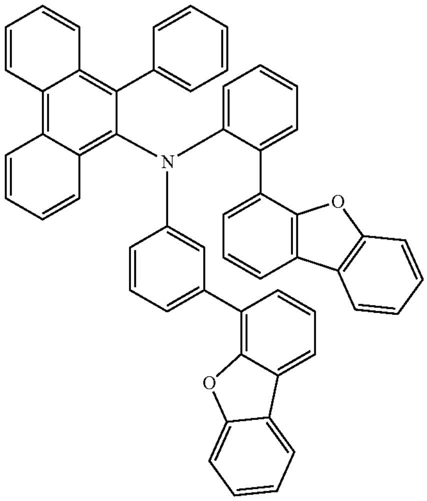

-continued
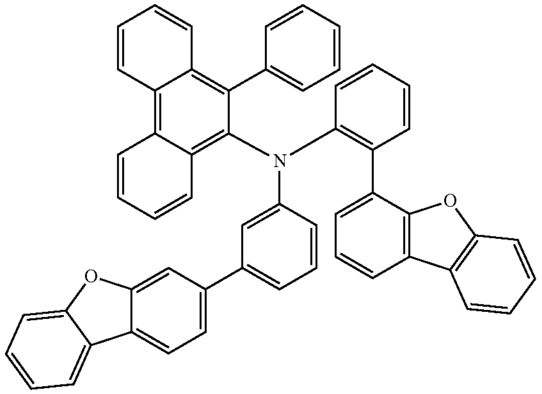
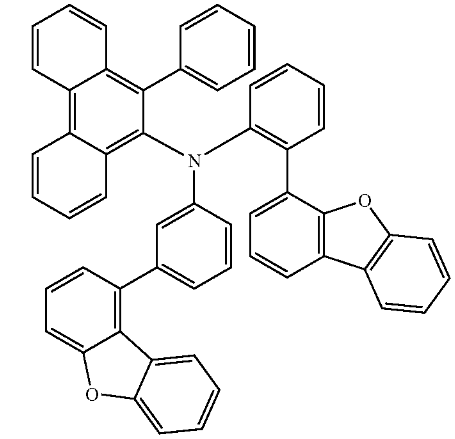
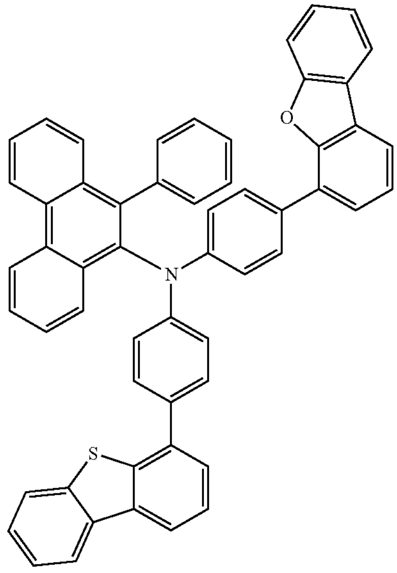
-continued
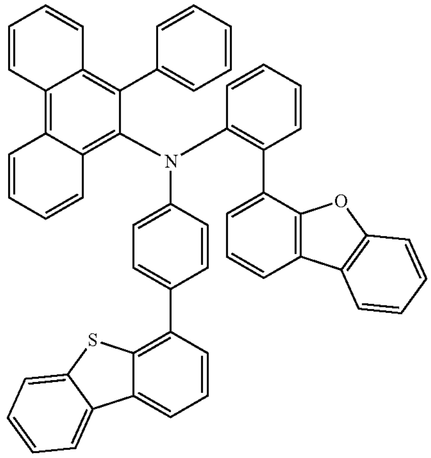
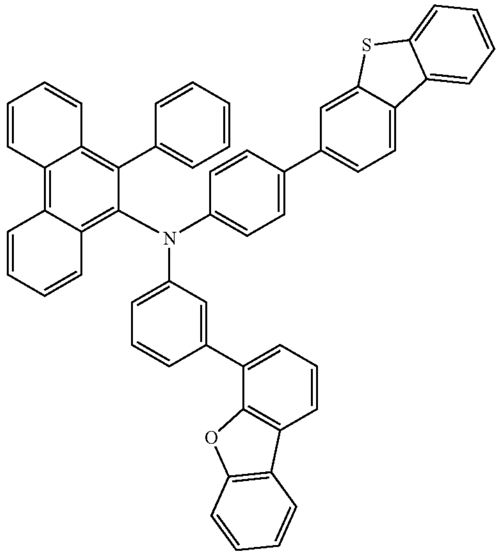
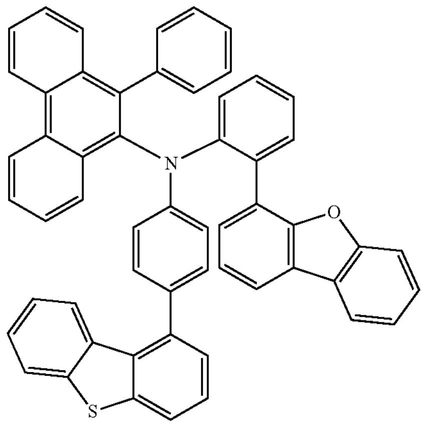

-continued
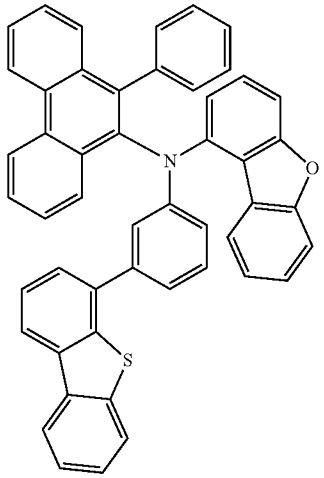
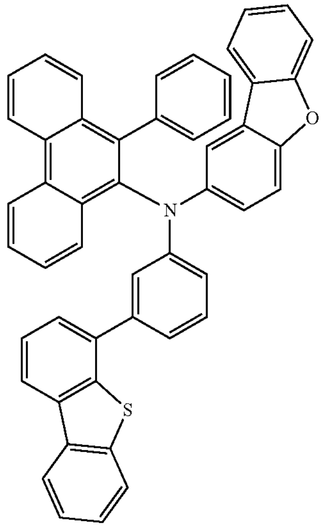
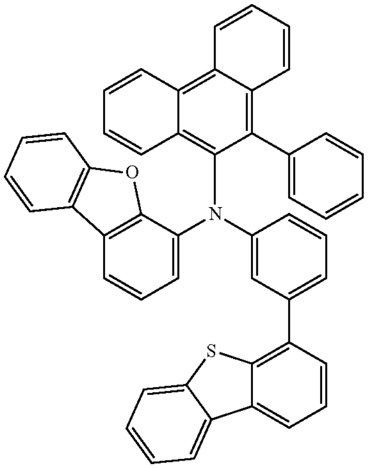
-continued
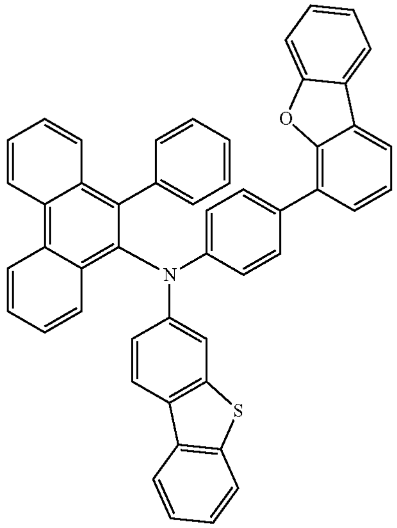
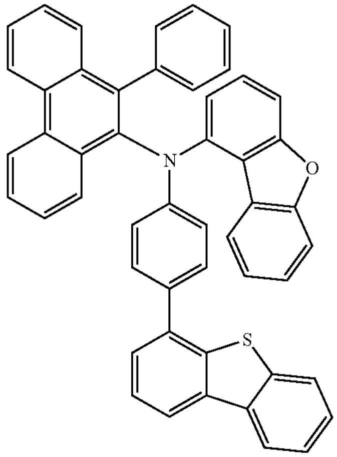
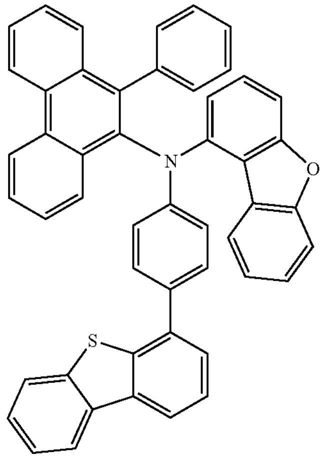

-continued
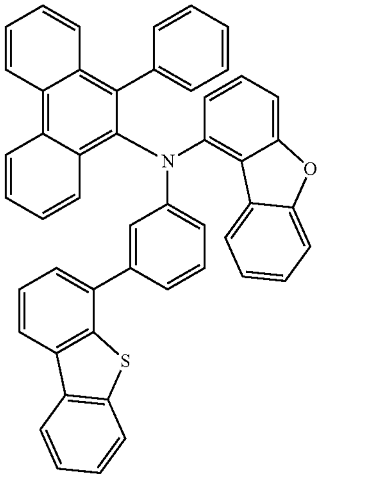
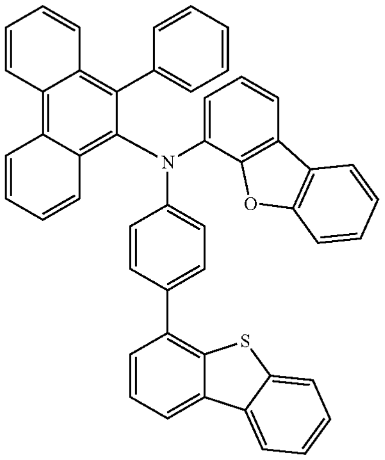
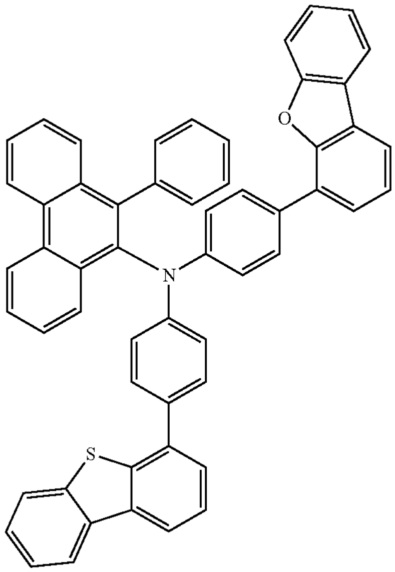
-continued
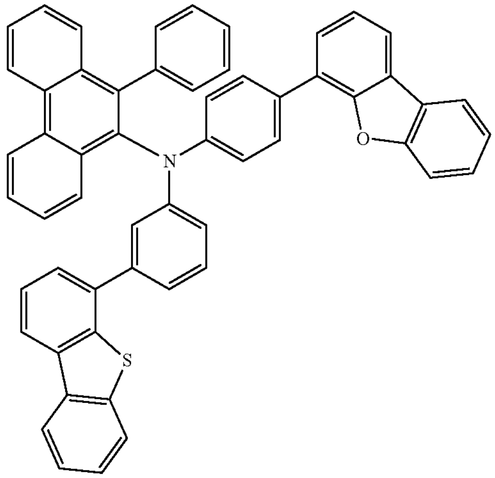
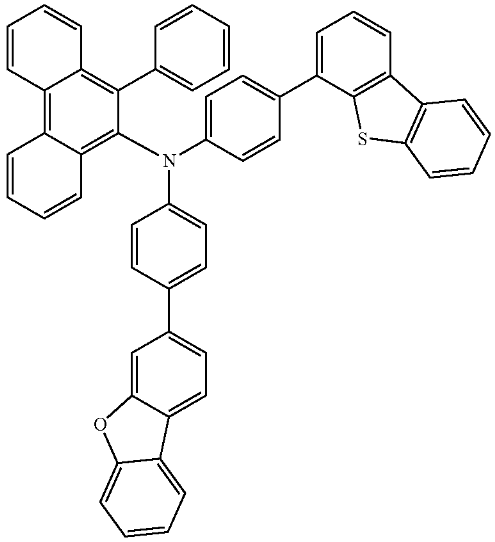
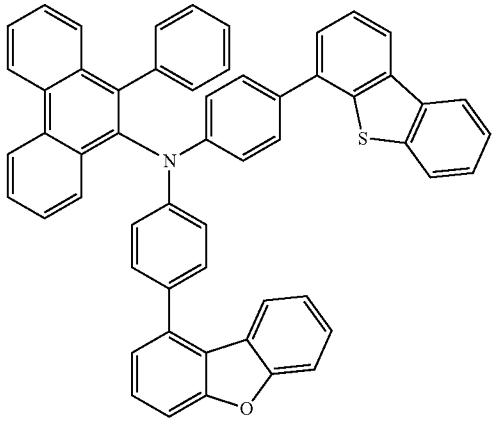

-continued
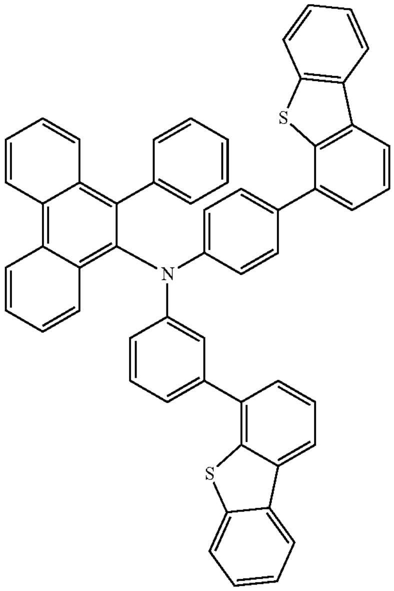
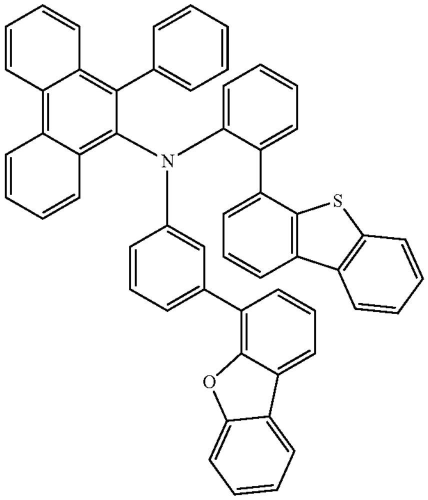
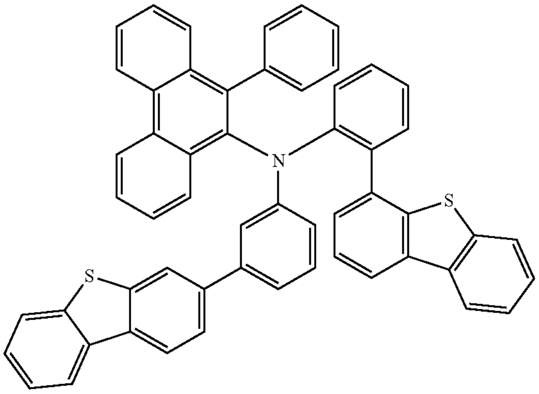
-continued
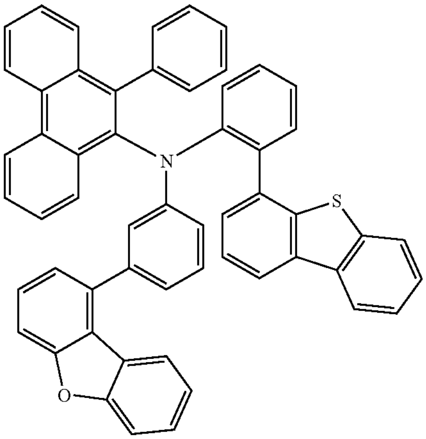
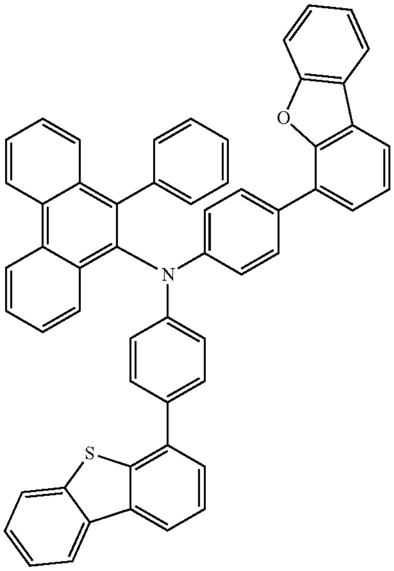
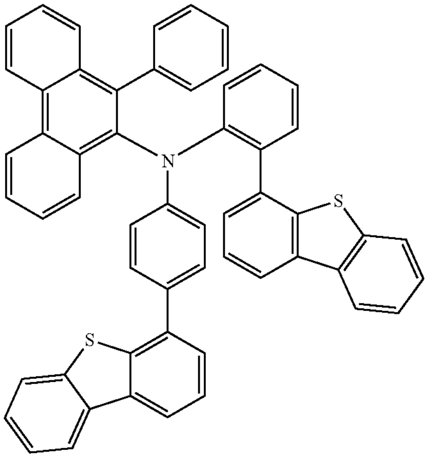

-continued
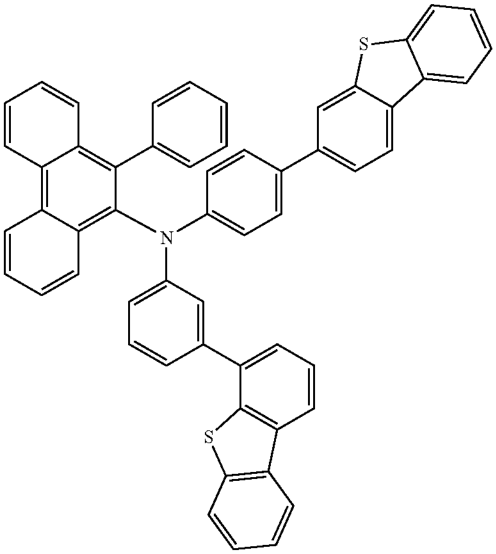
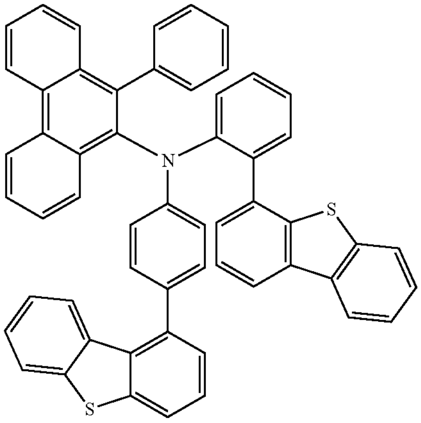
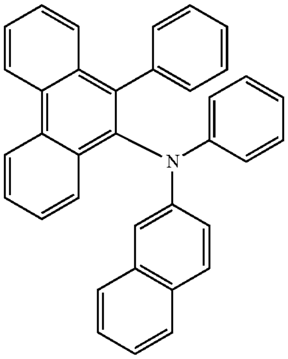
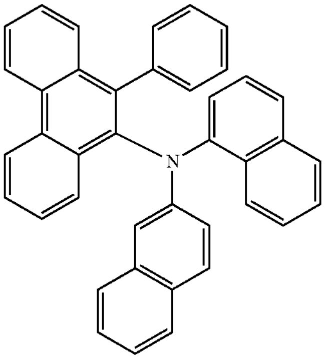
-continued
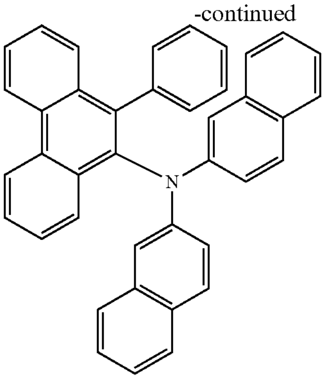
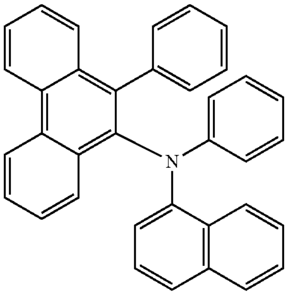
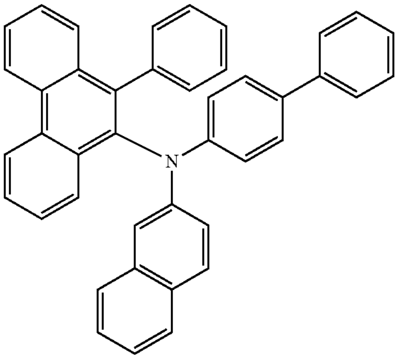
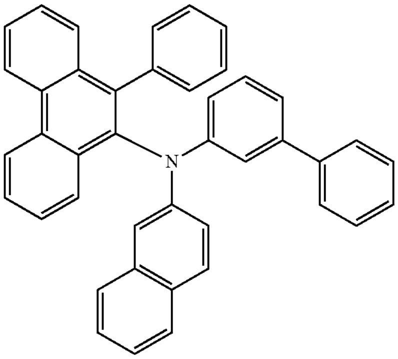
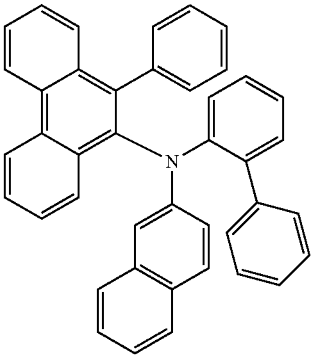

-continued
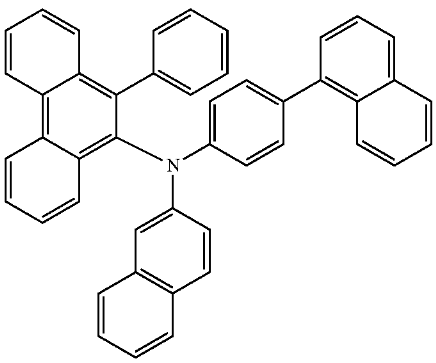
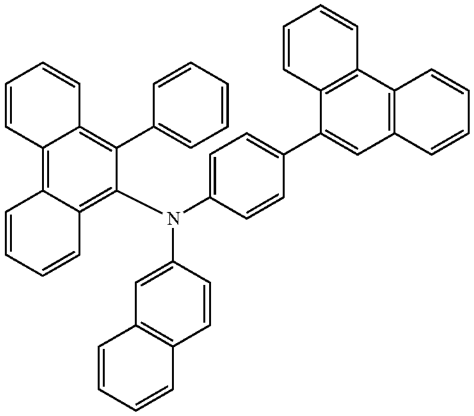
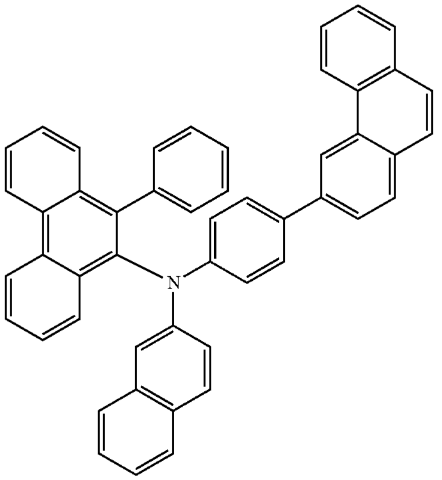
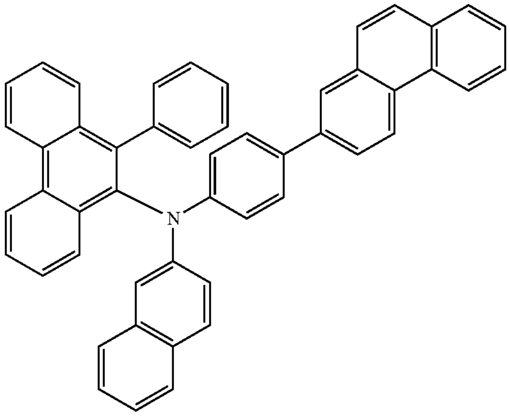
-continued
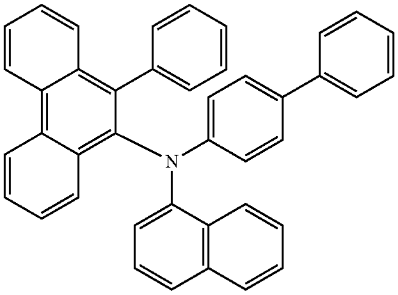
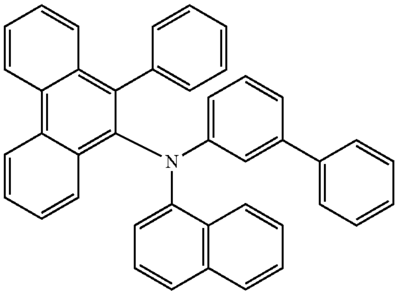
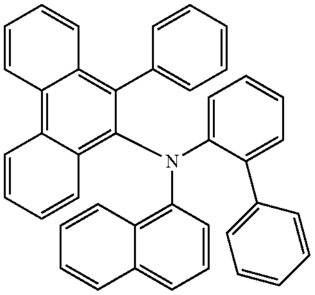
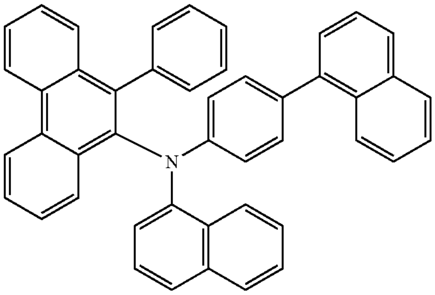
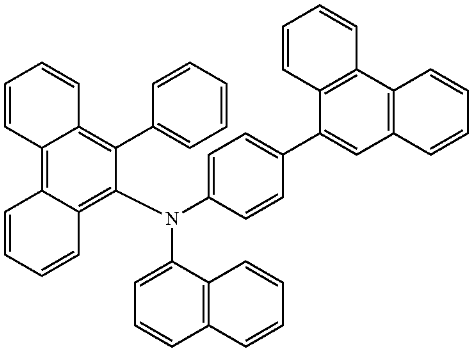

-continued
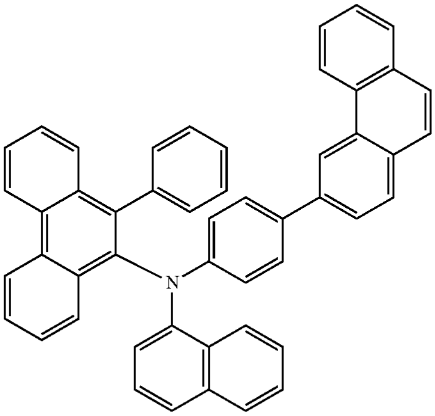
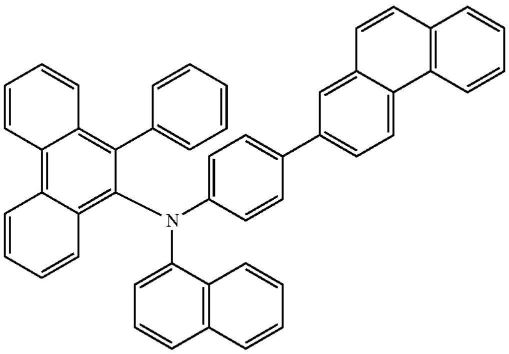
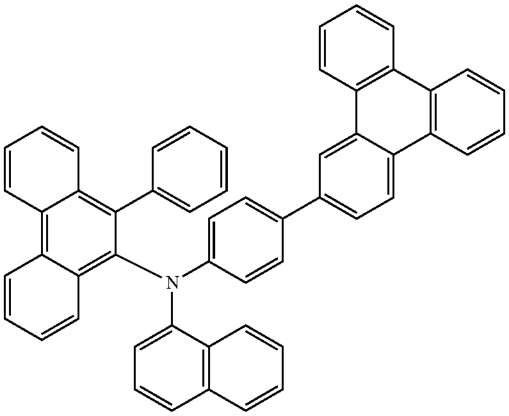
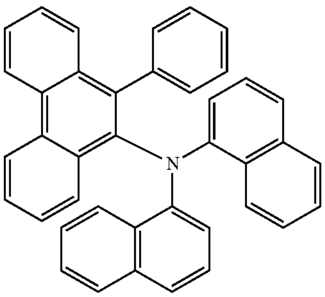
-continued
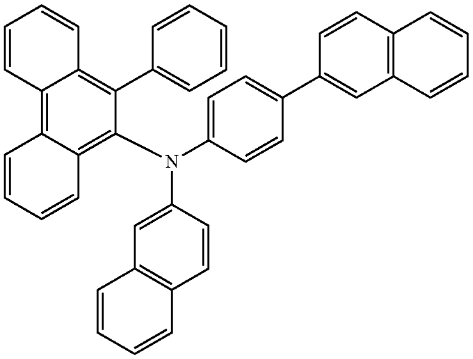
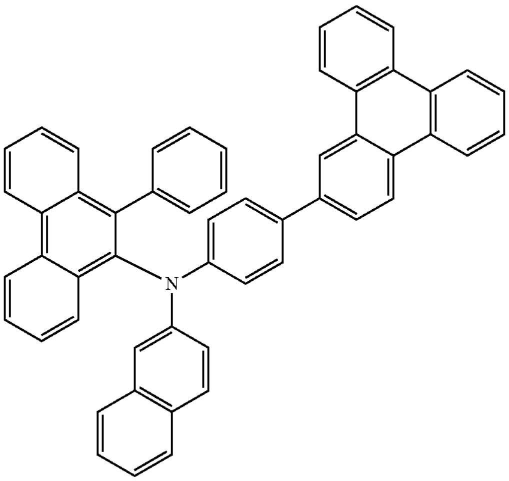
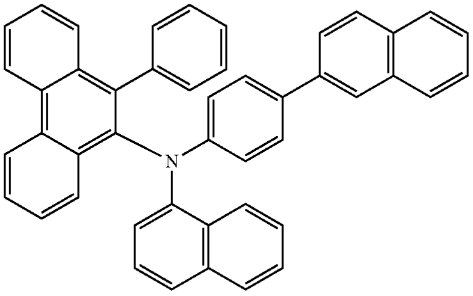
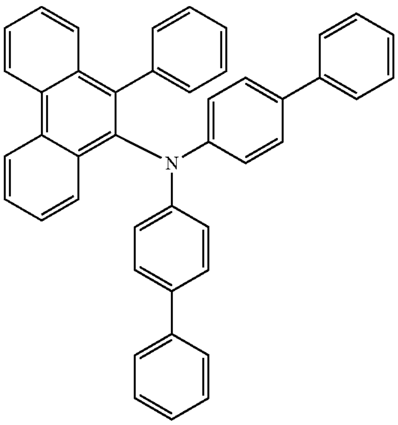

-continued
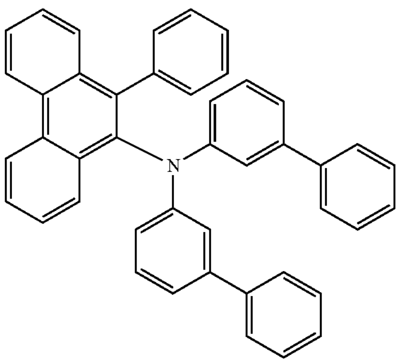
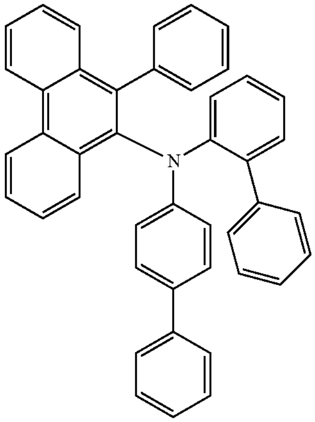
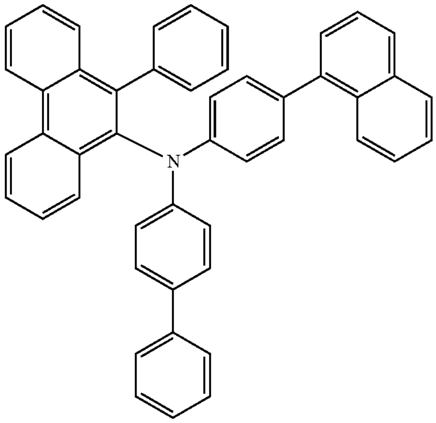
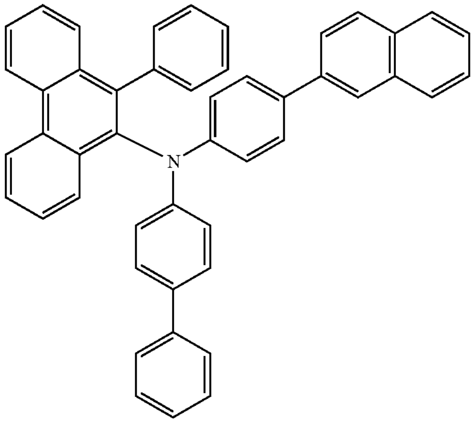
-continued
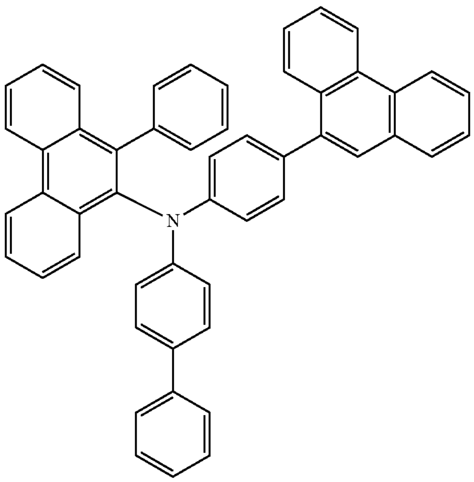
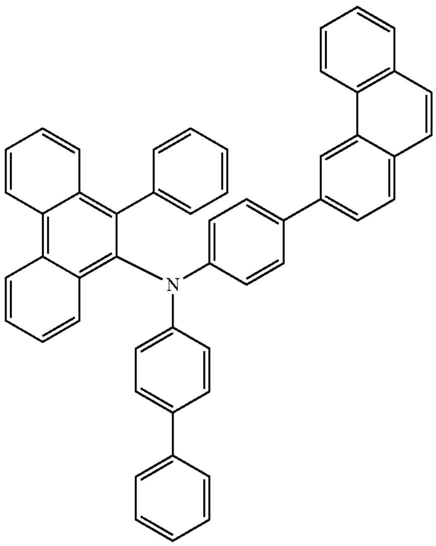
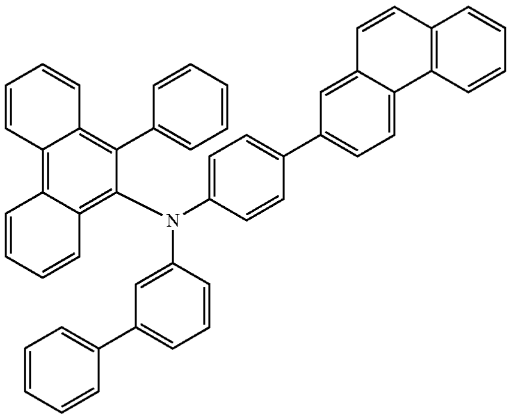

-continued
-continued
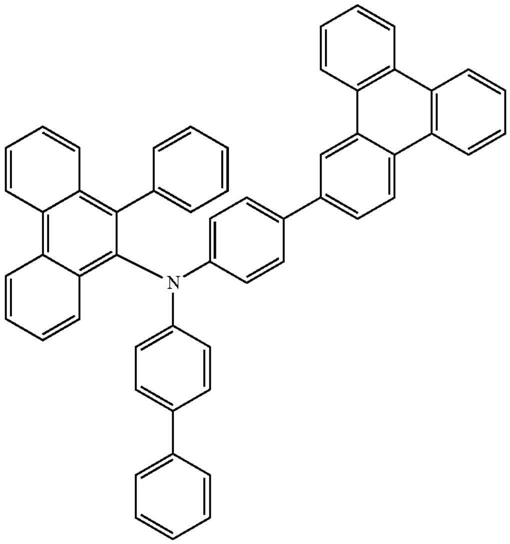
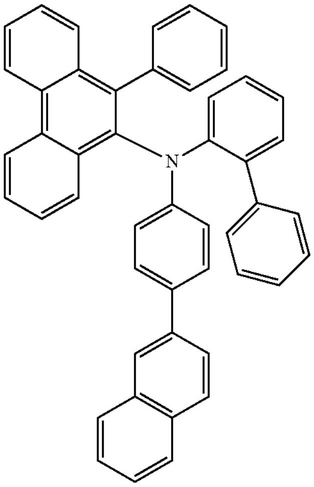
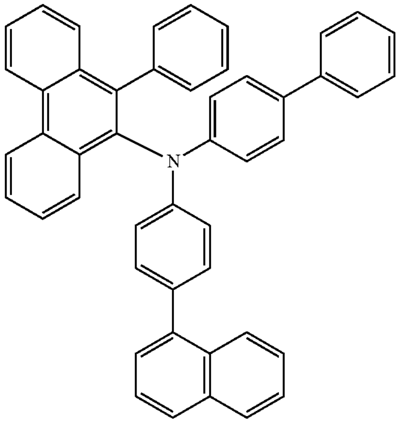
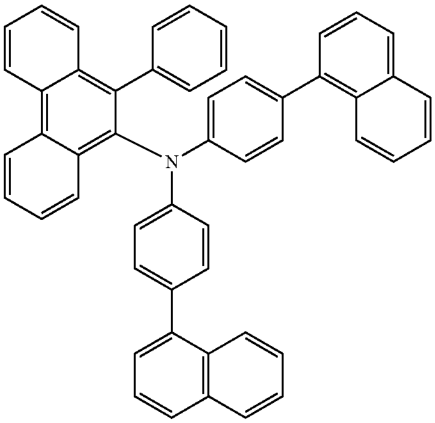
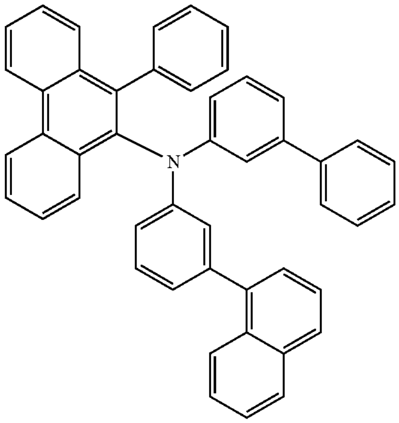
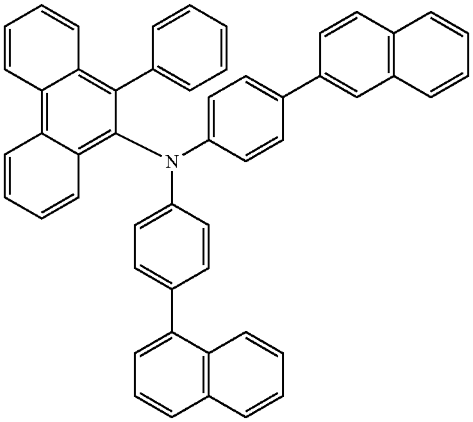

-continued
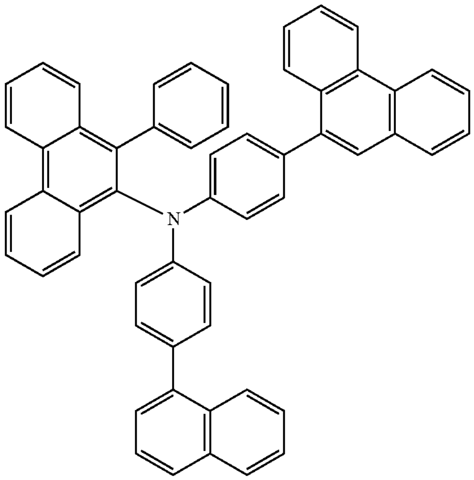
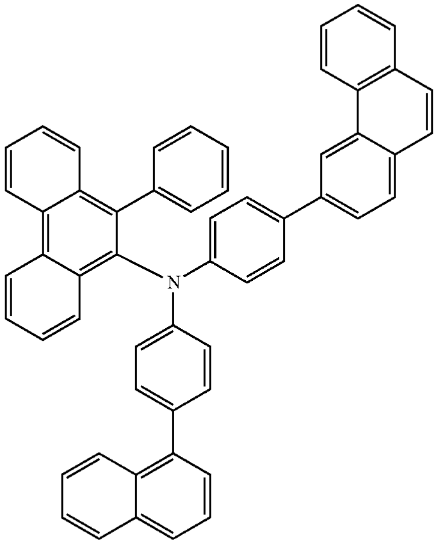
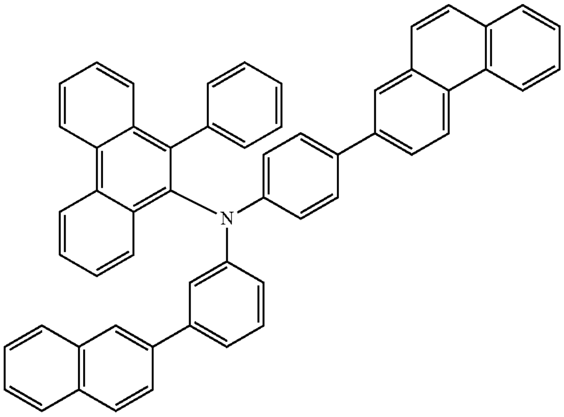
-continued
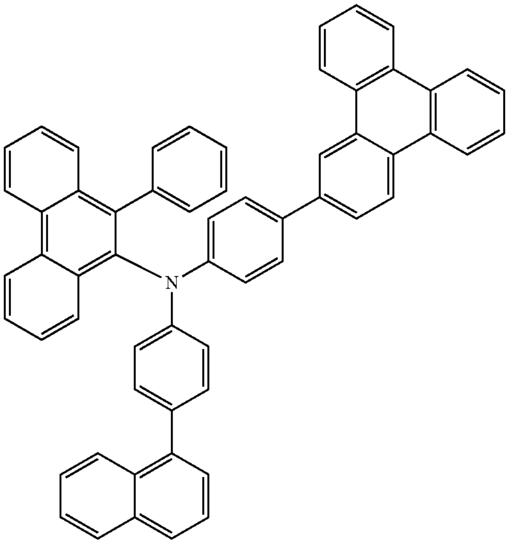
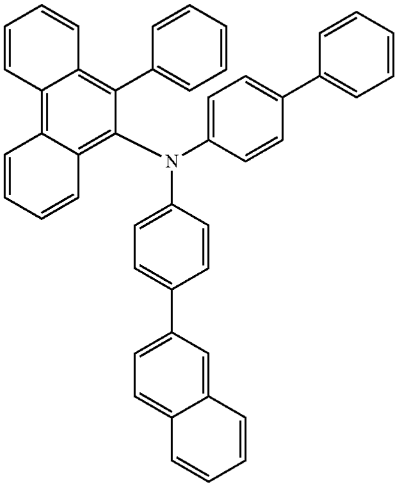
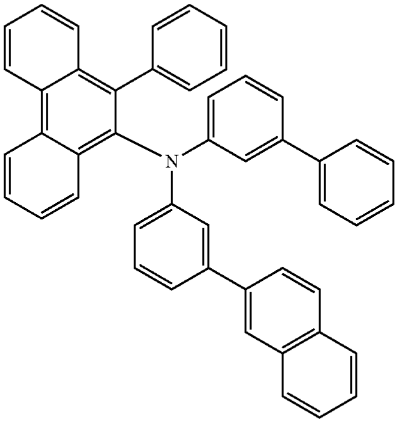

-continued
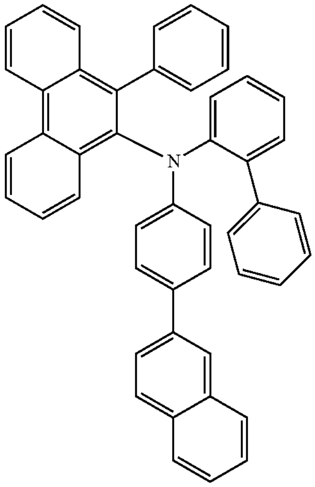
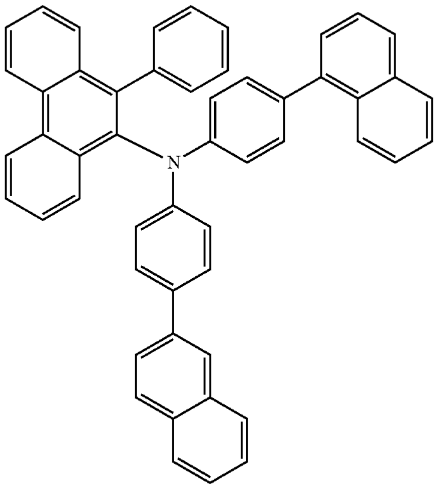
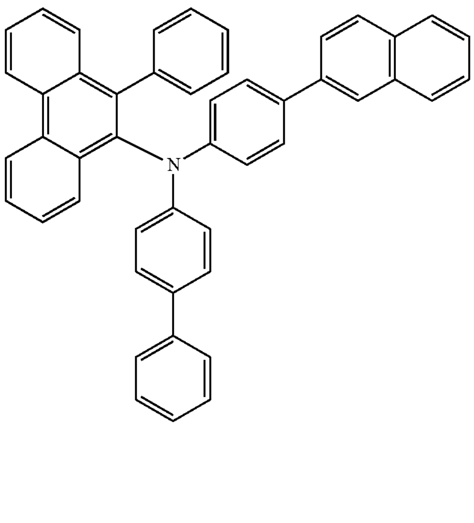
-continued
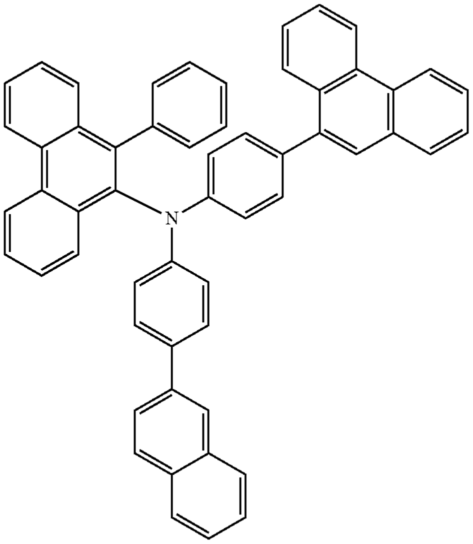
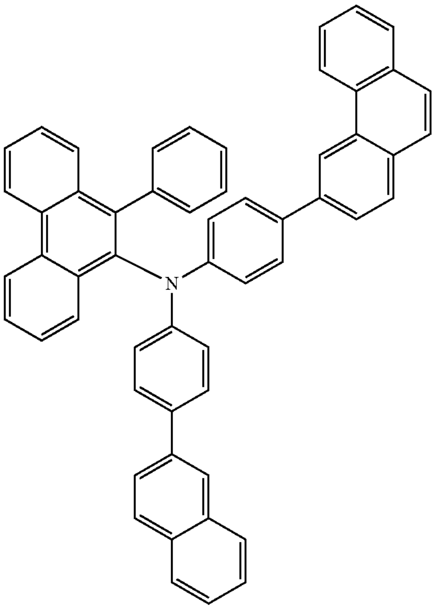
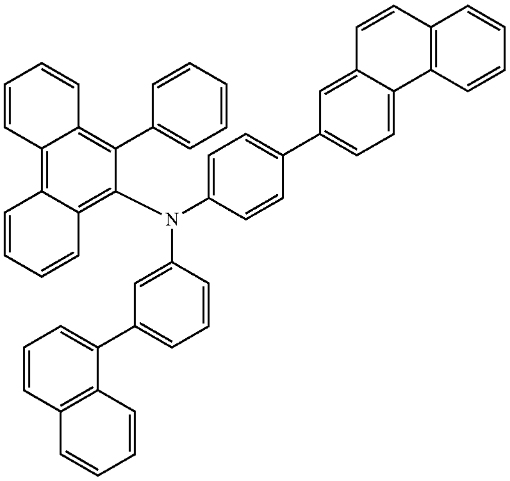

-continued
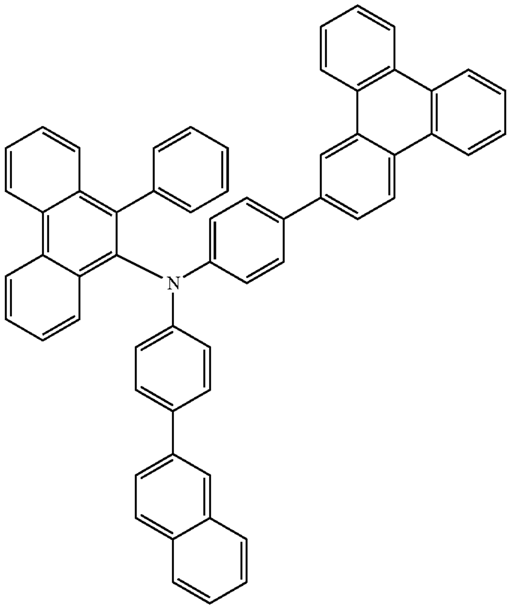 [SMILES: c1ccc(-c2c(N(c3ccc(-c4ccc5ccccc5c4)cc3)c3ccc(-c4ccc5c6ccccc6c6ccccc6c5c4)cc3)c3ccccc3c3ccccc23)cc1]
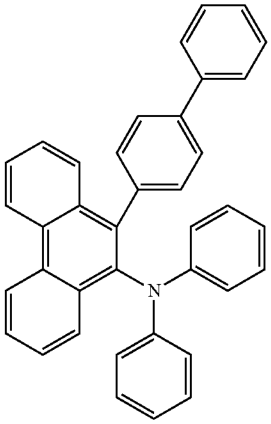
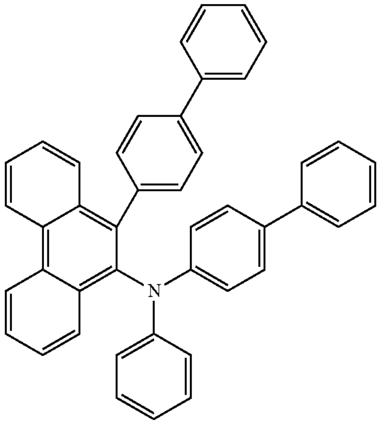
-continued
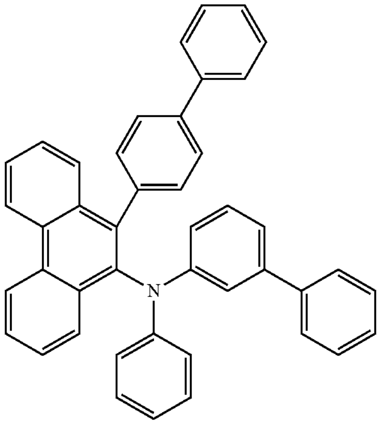
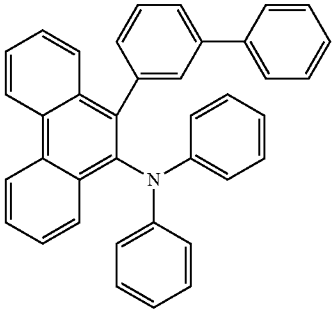
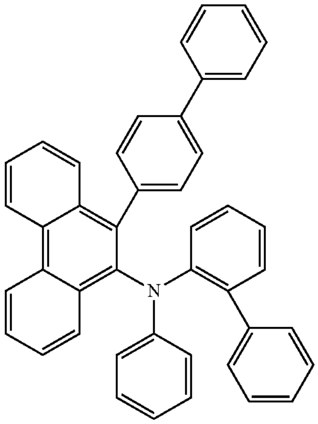
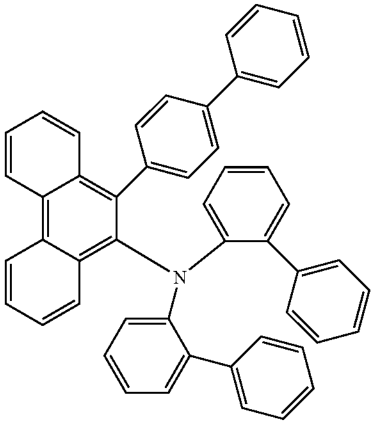

-continued
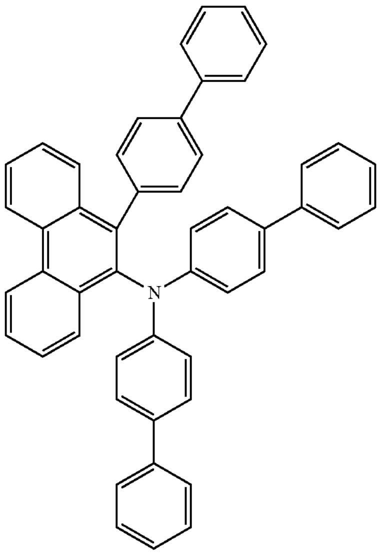
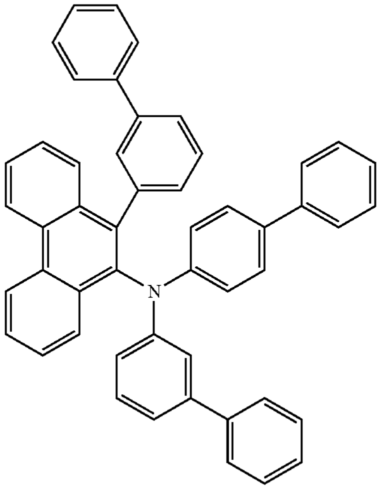
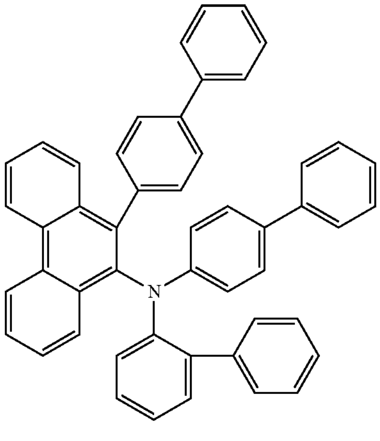
-continued
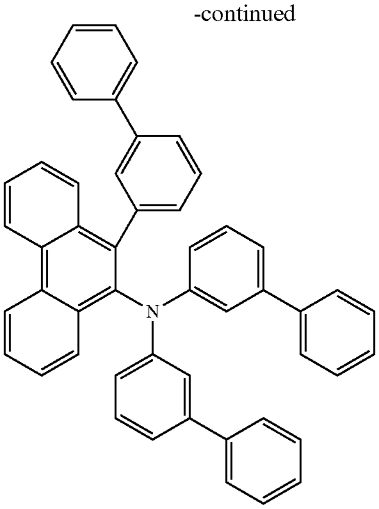
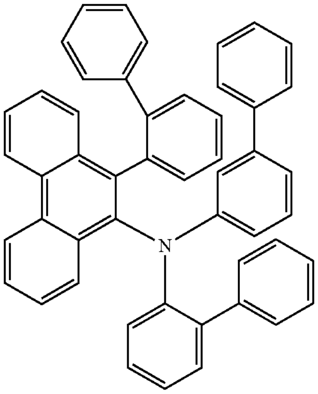
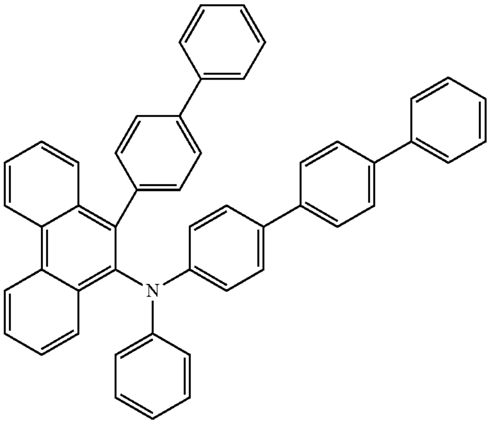
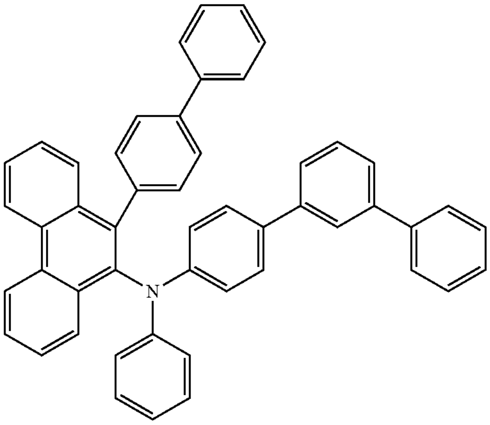

-continued
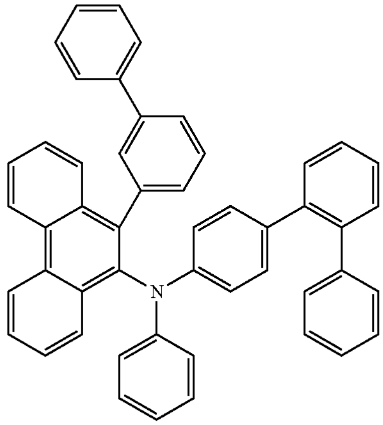
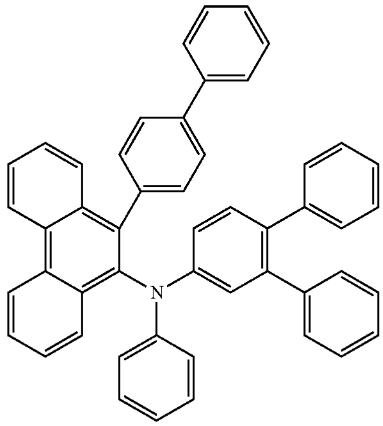
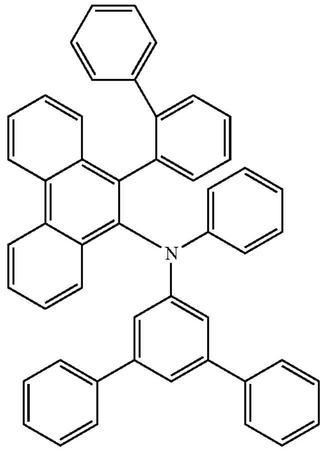
-continued
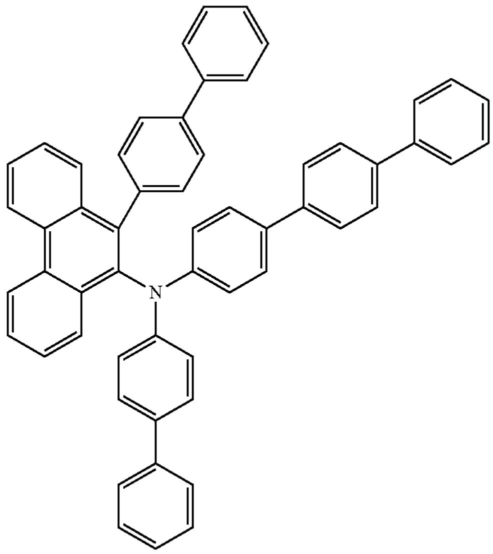
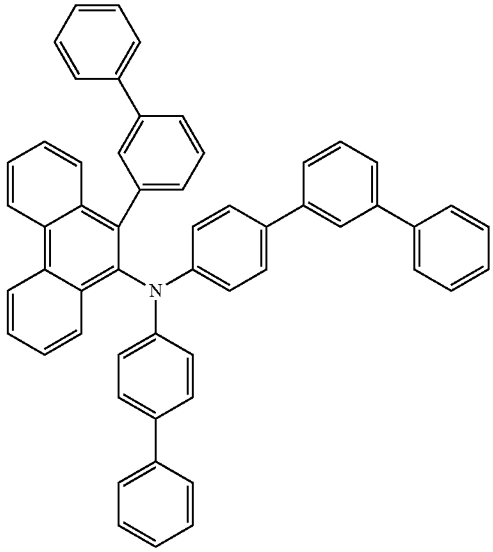
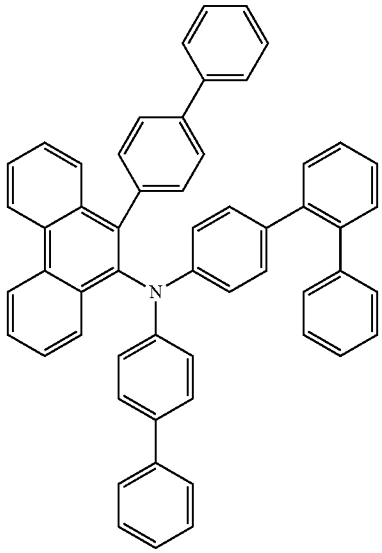

-continued
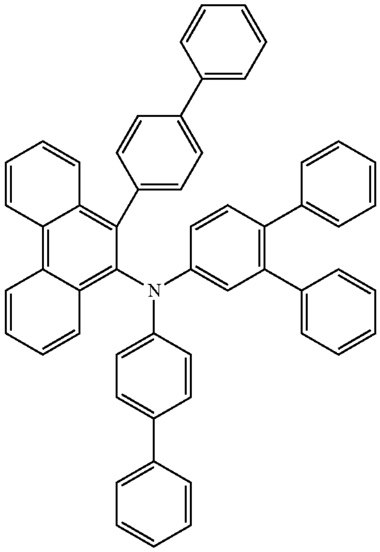
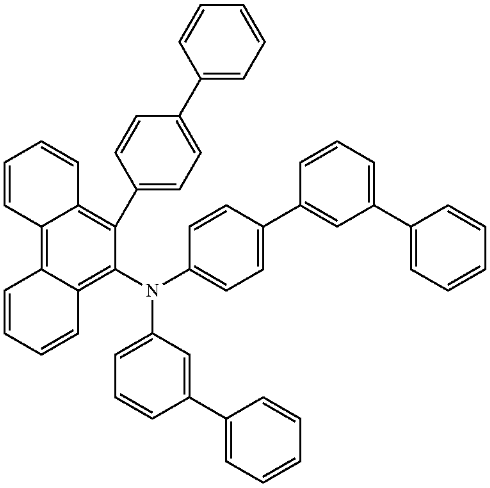
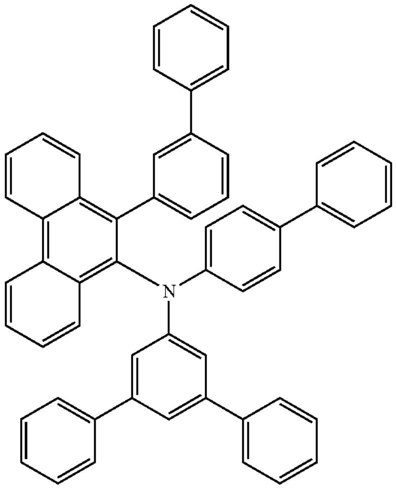
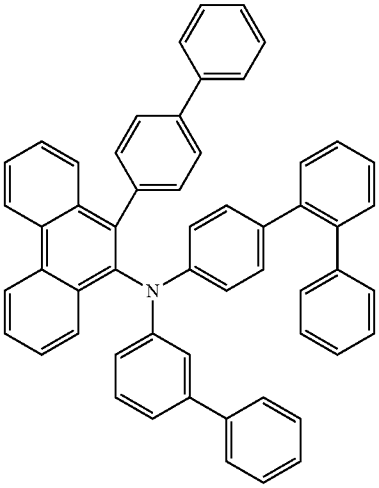
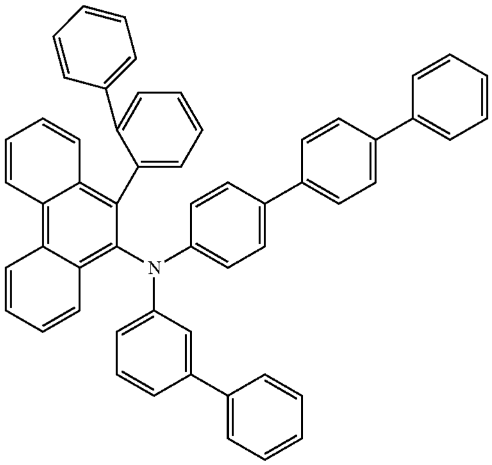
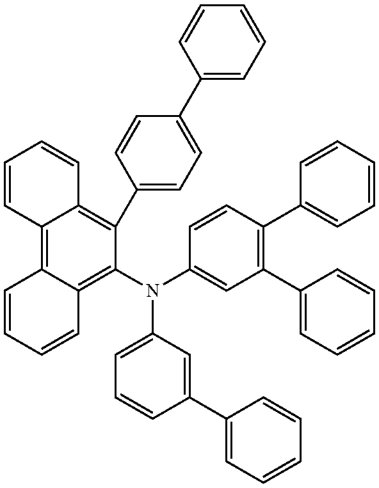
-continued -continued
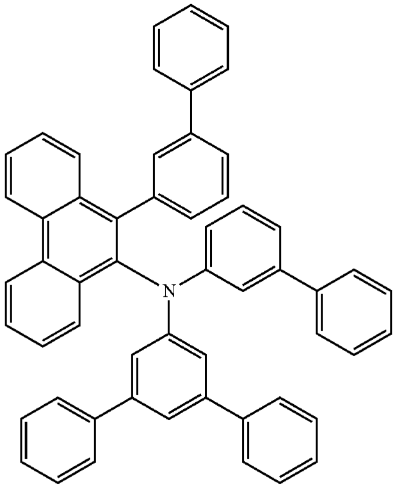
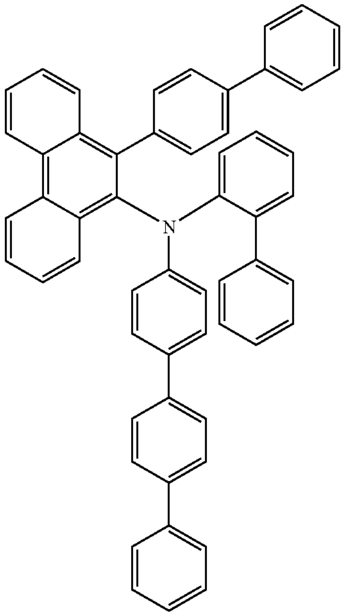
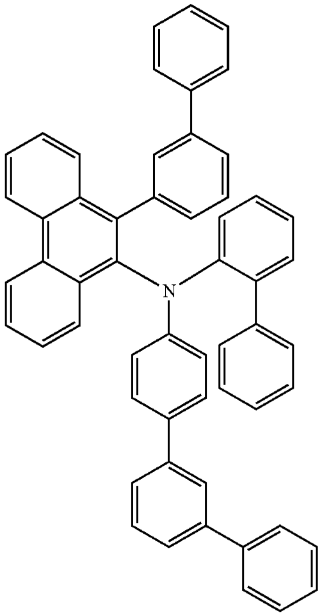
-continued
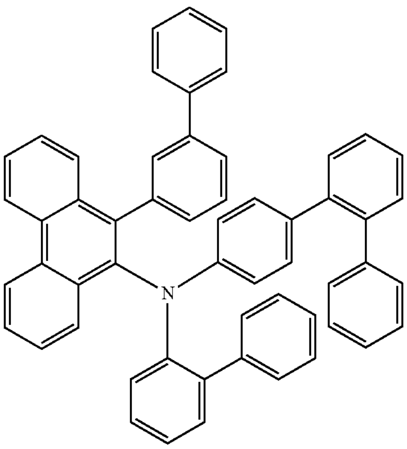
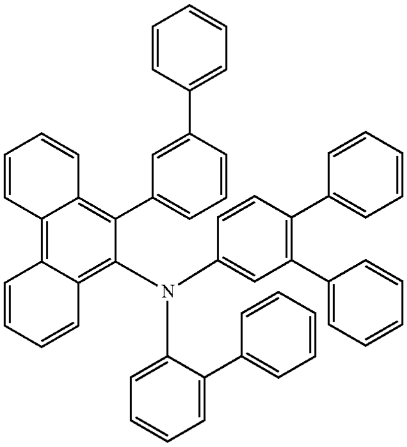
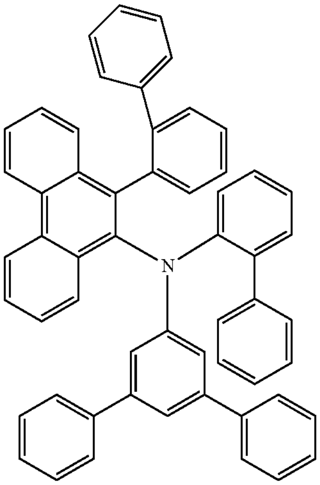

-continued
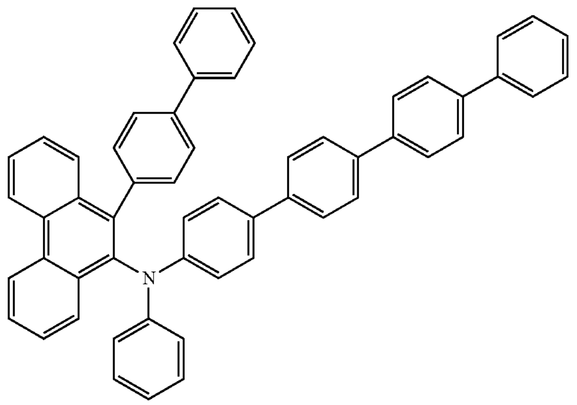
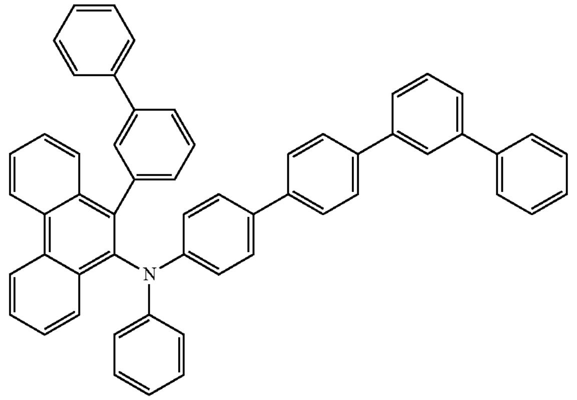
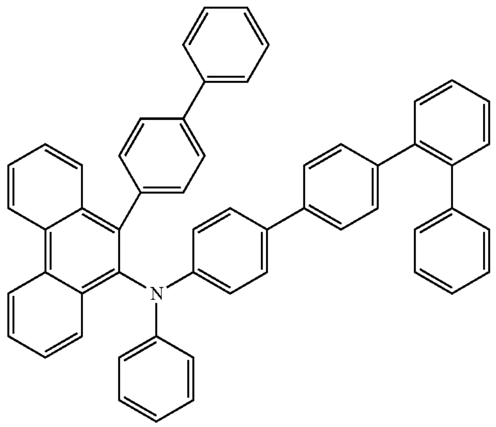
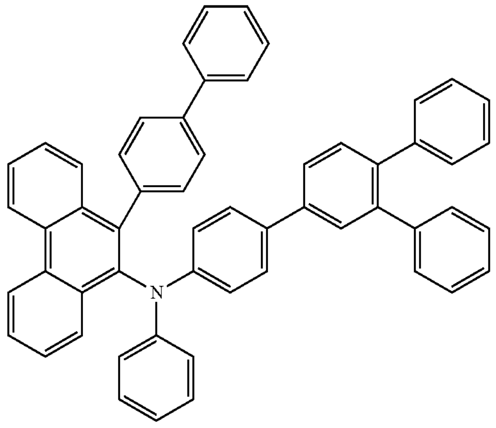
-continued
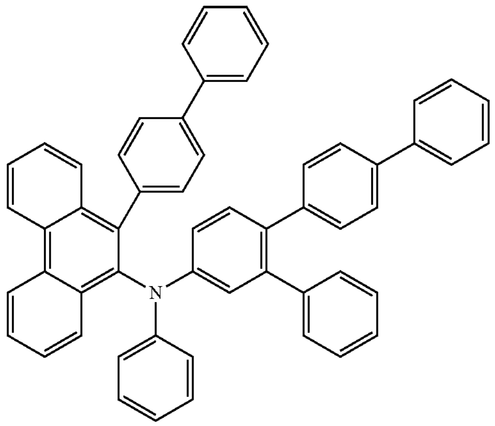
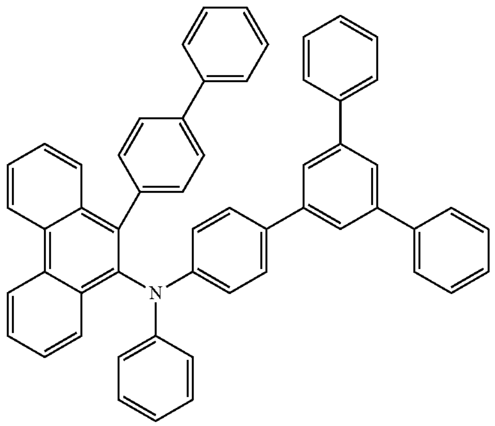
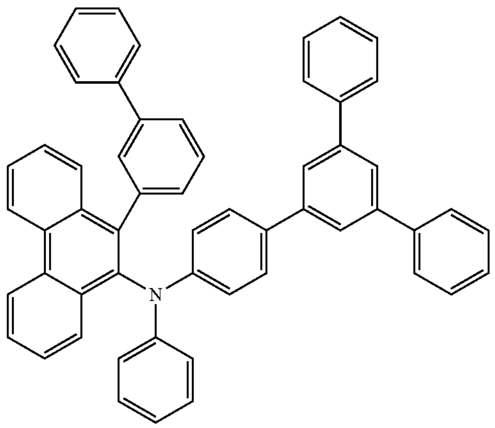
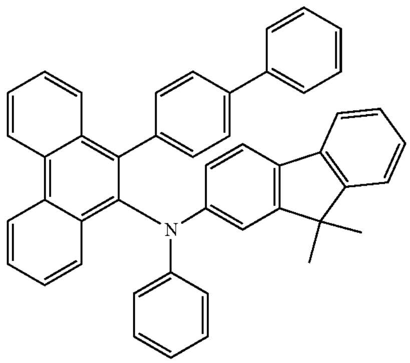

-continued
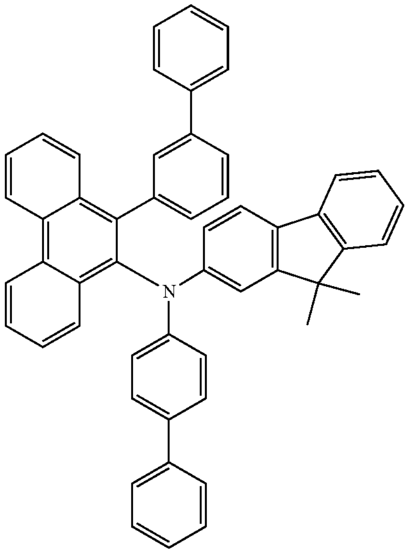
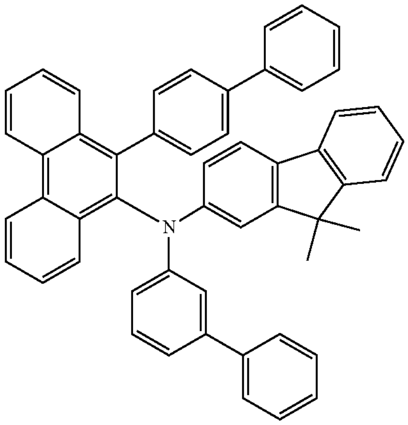
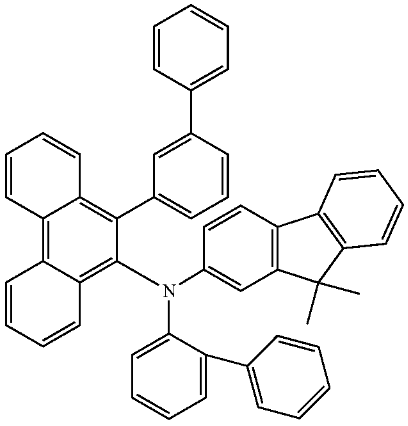
-continued
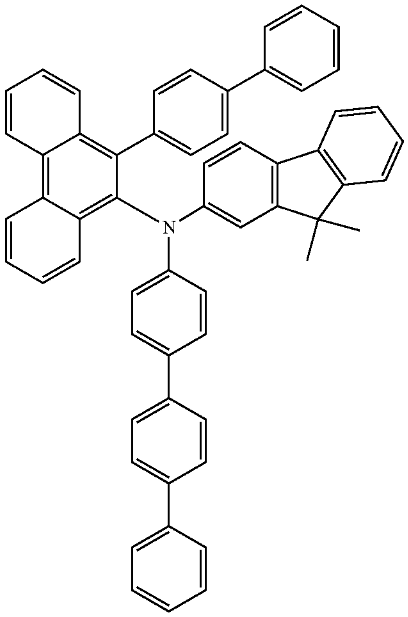
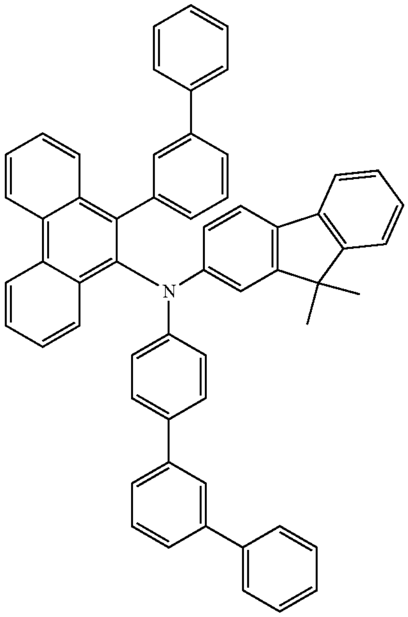
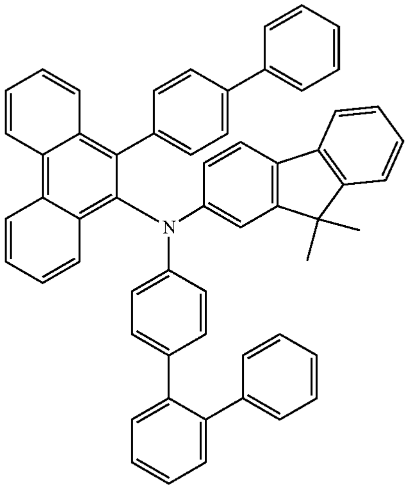

-continued
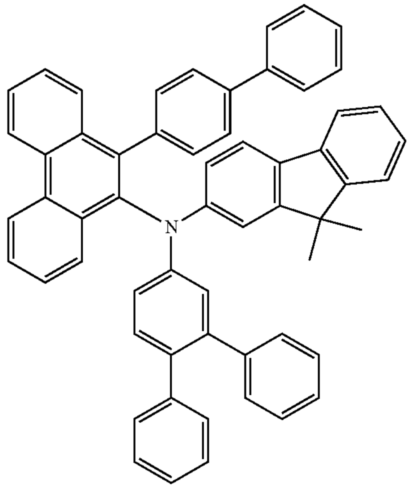
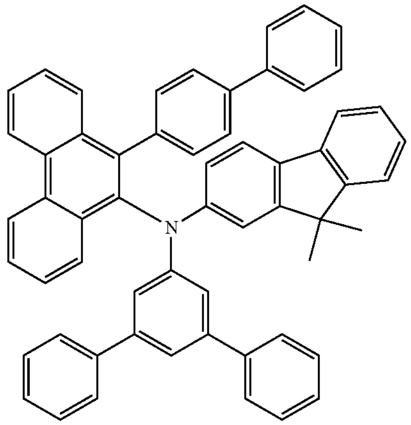
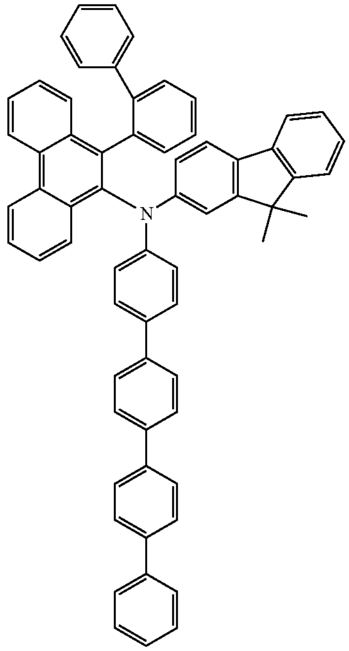
-continued
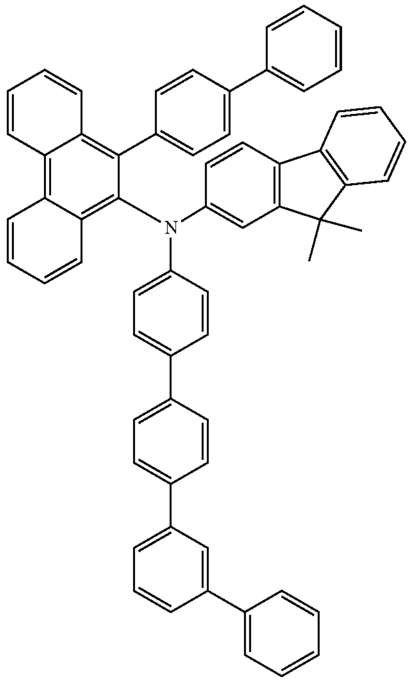
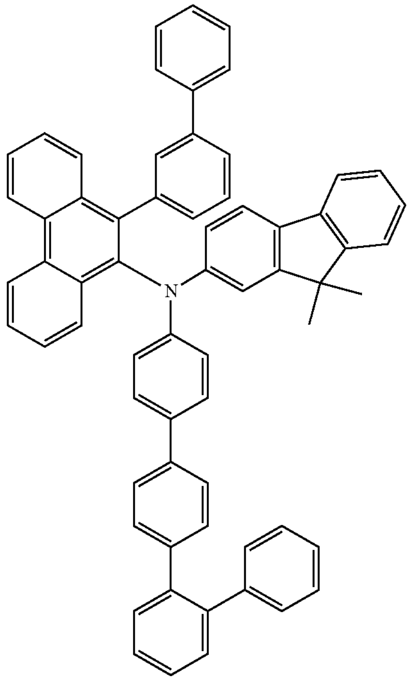

-continued
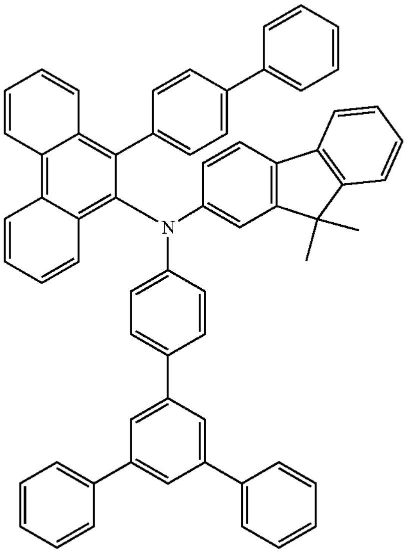
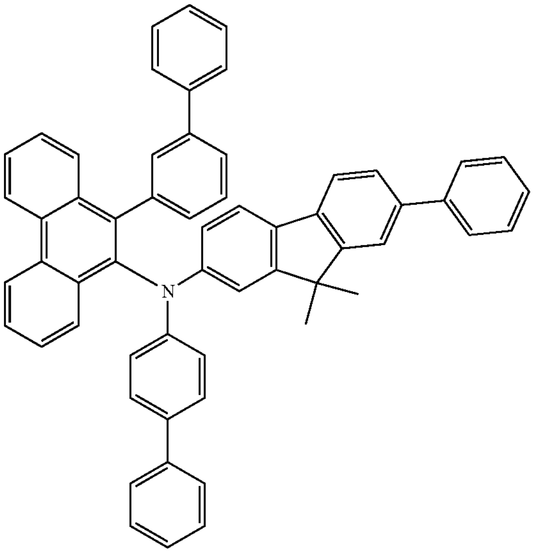
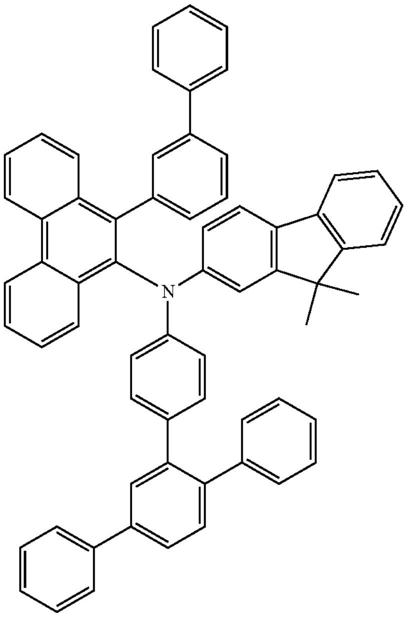
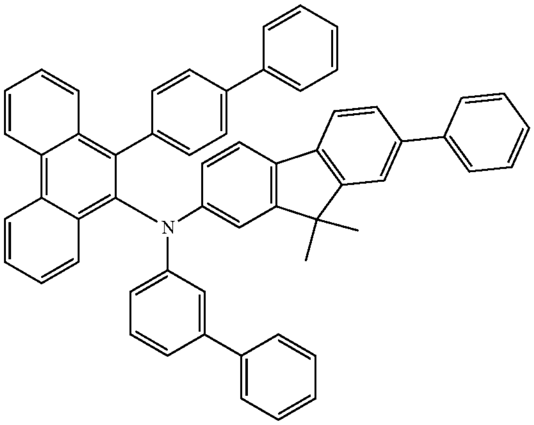
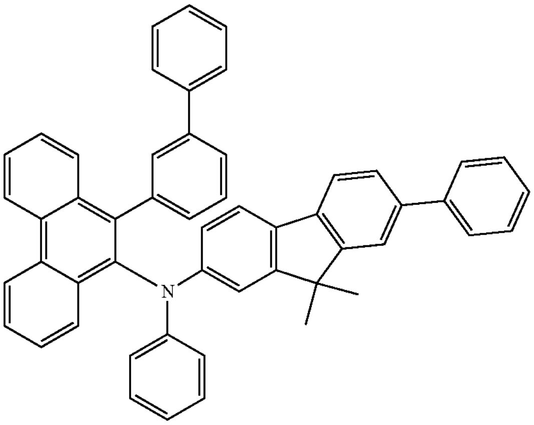
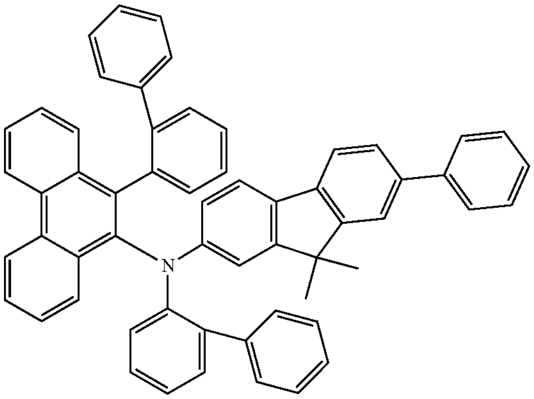
-continued -continued
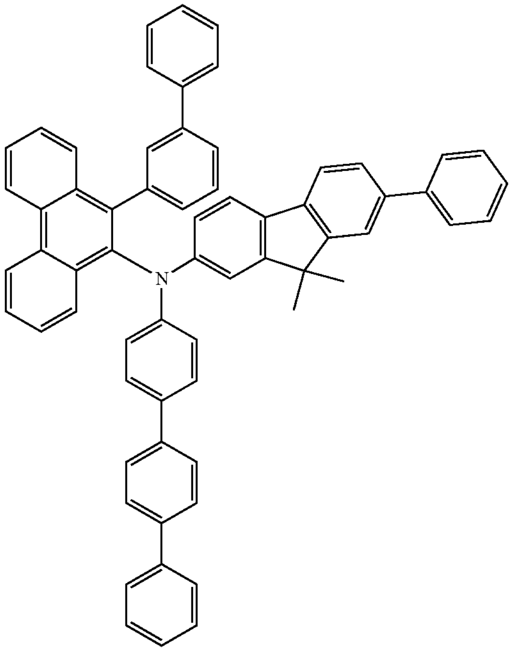
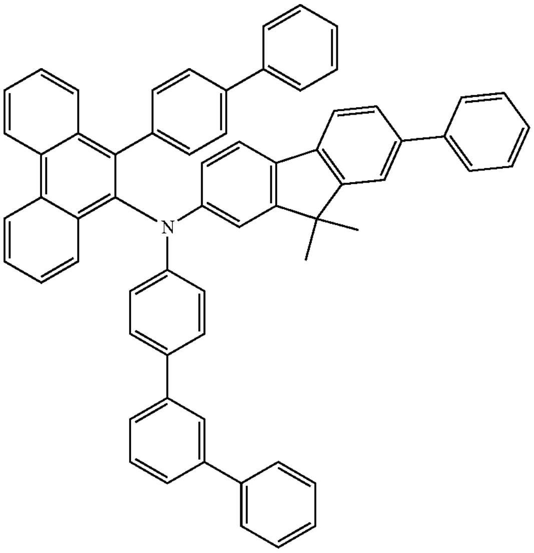
-continued
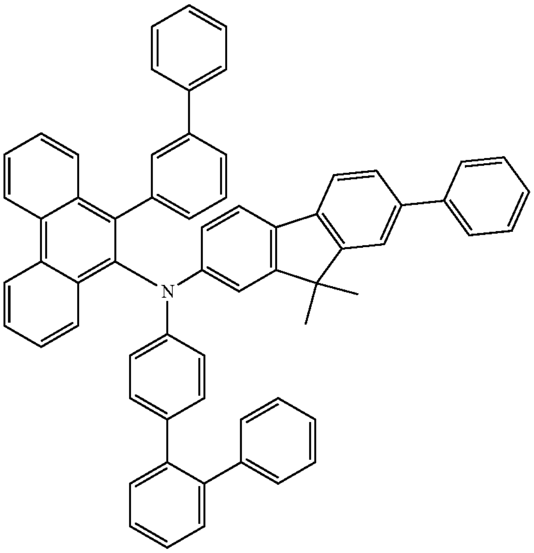
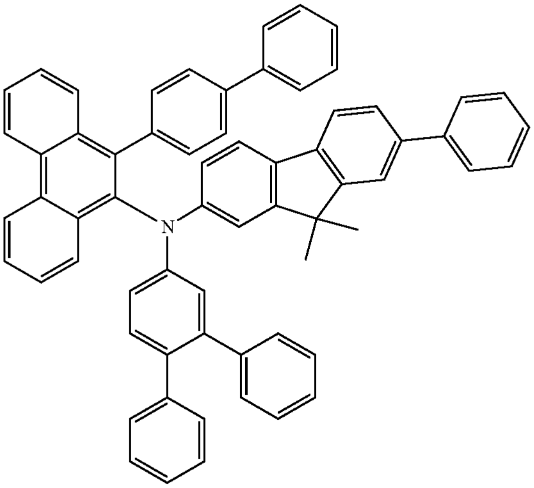
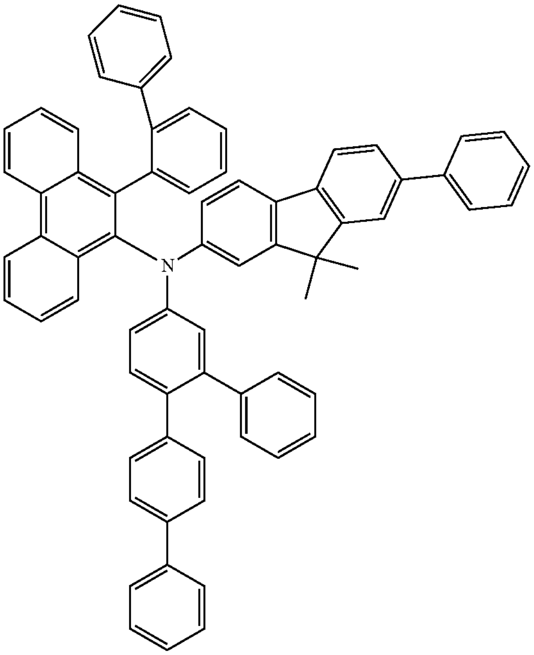

-continued
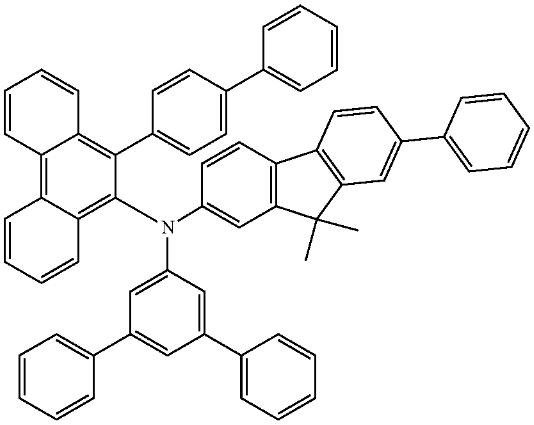
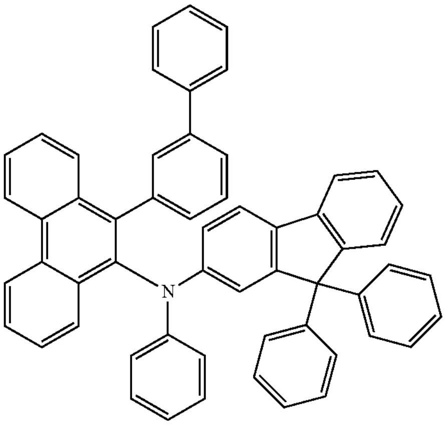
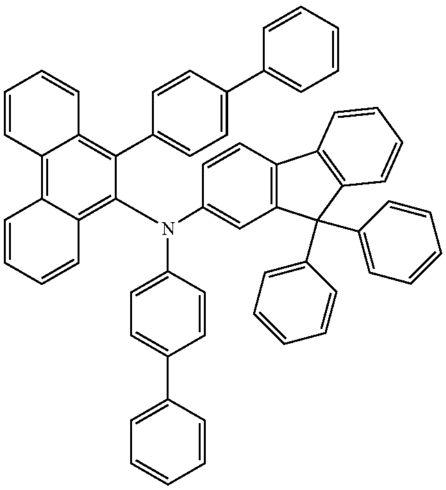
-continued
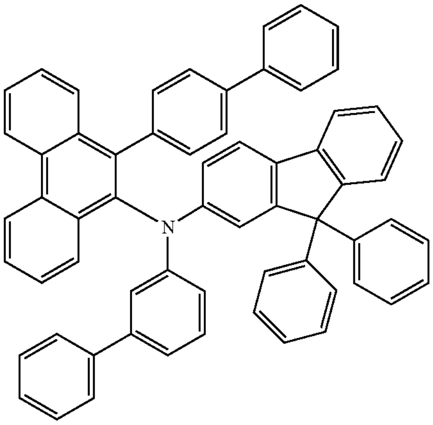
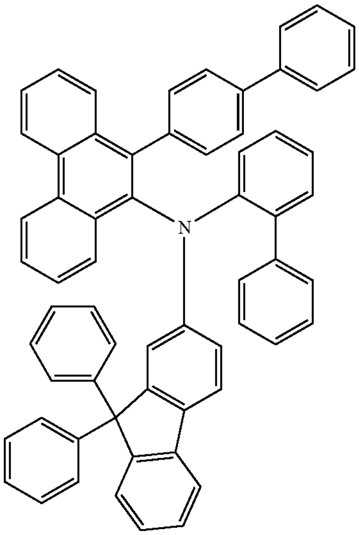
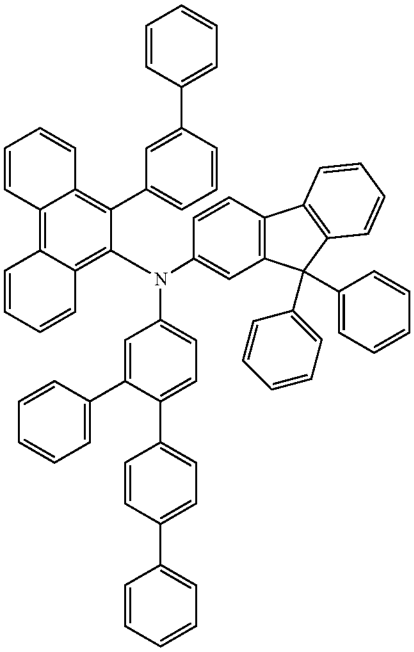

-continued
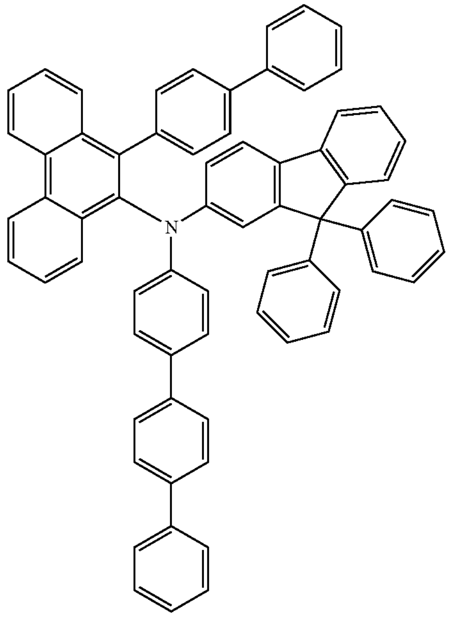
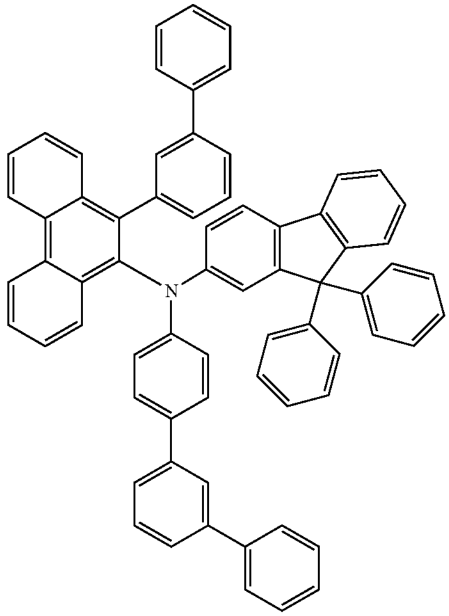
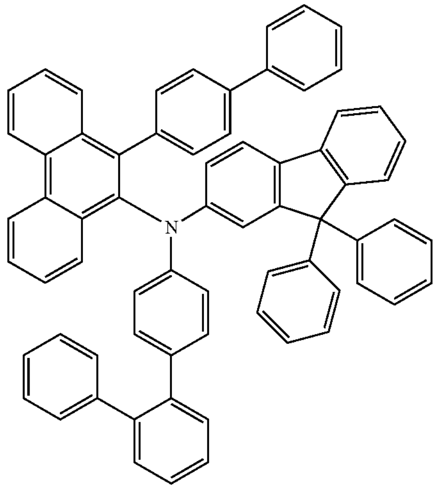
-continued
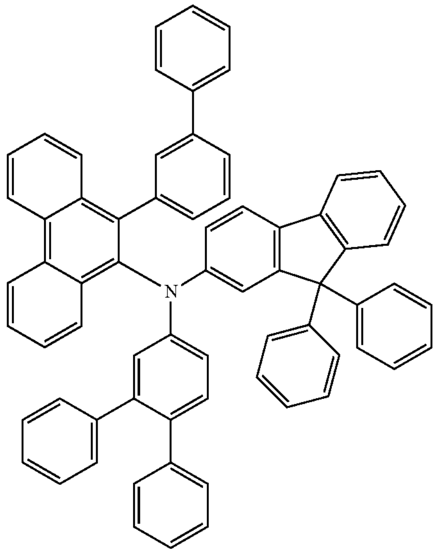
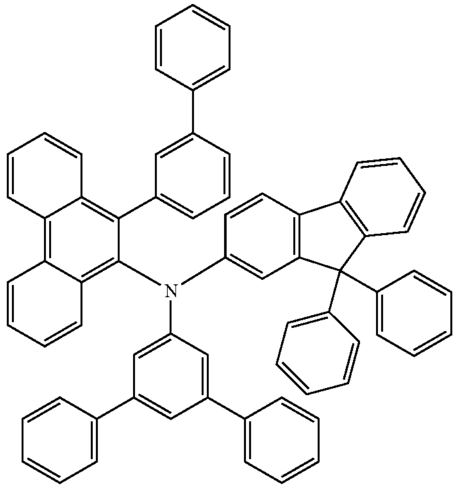
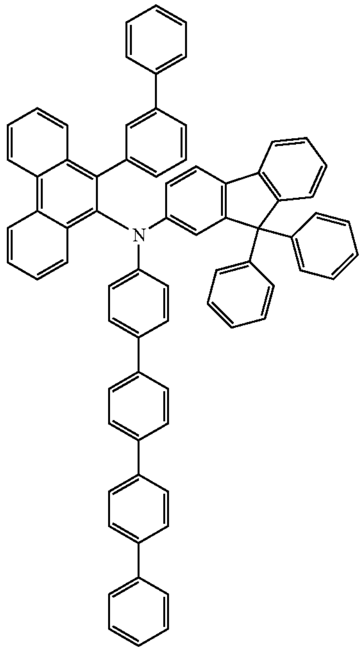

-continued
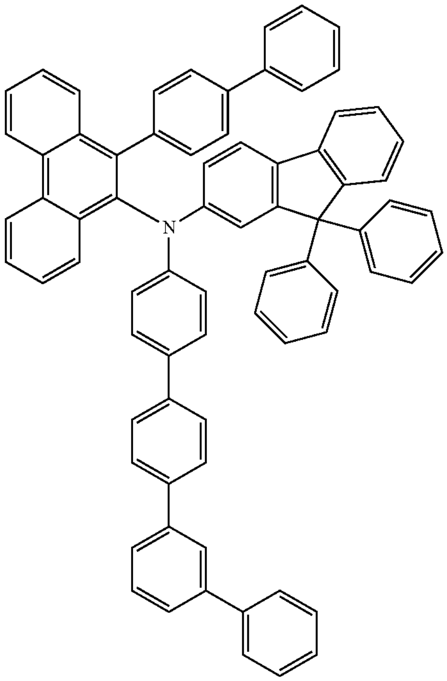
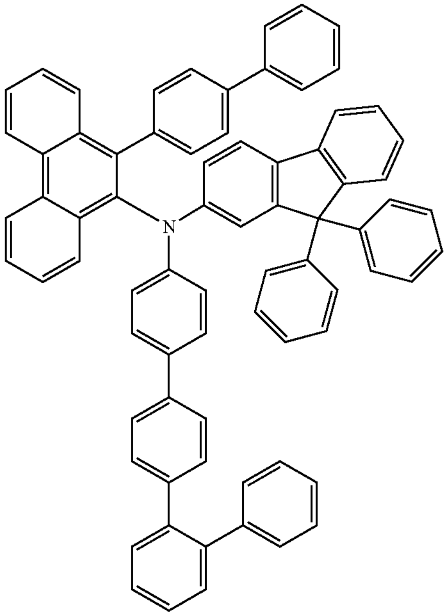
-continued
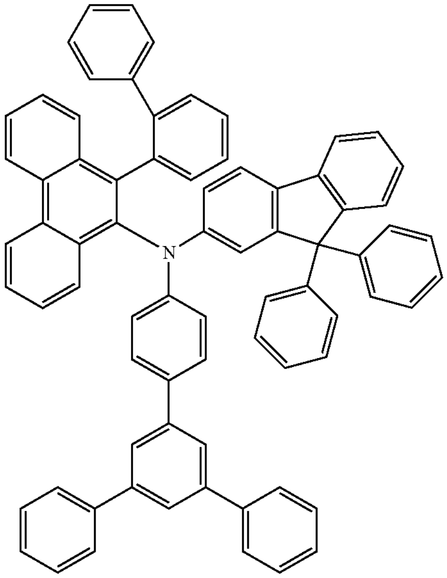
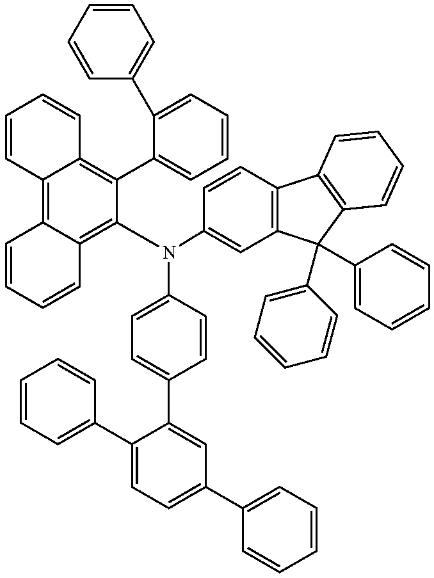
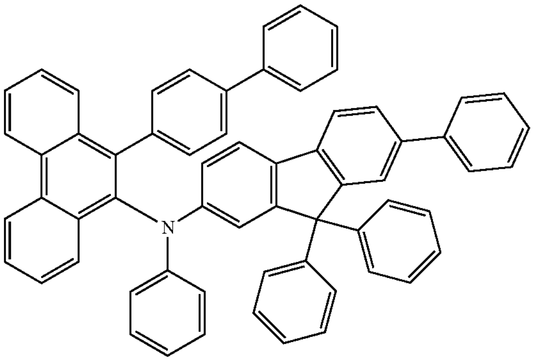

-continued
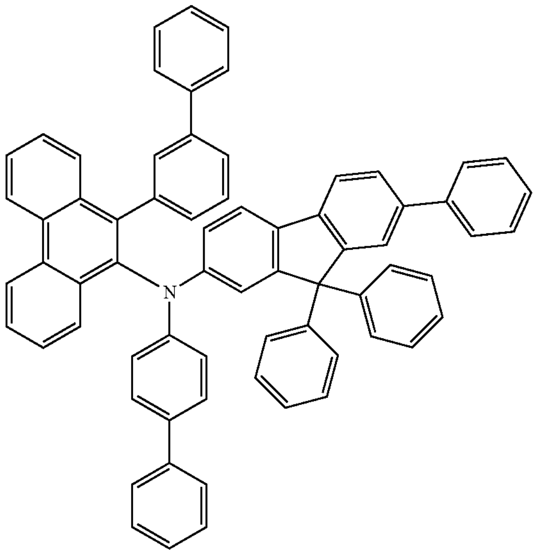
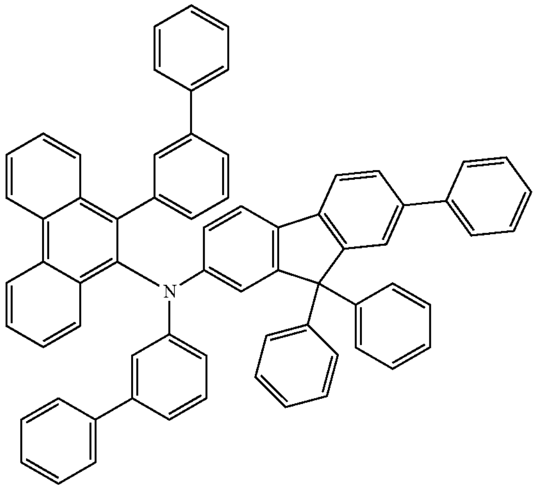
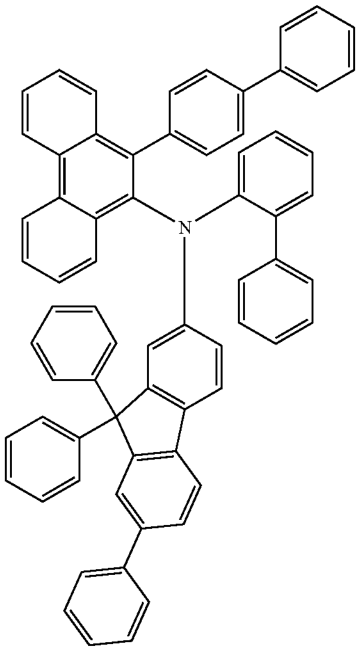
-continued
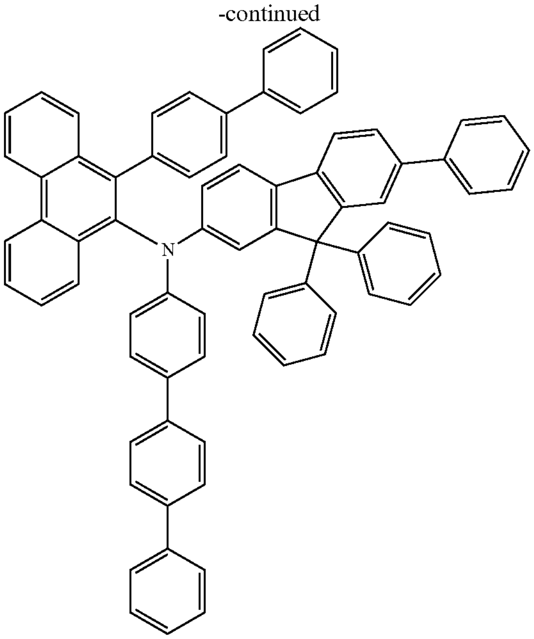
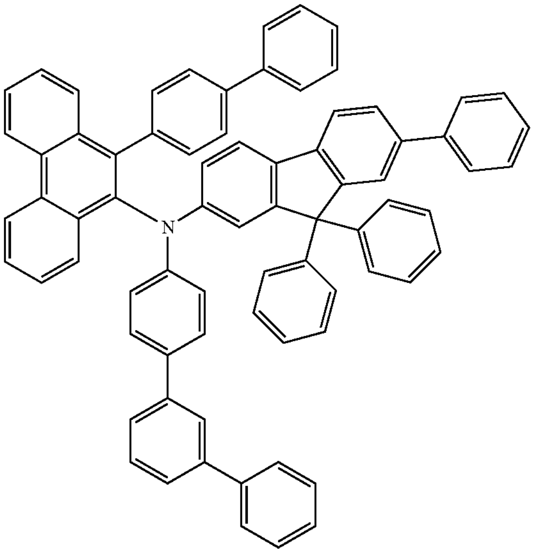
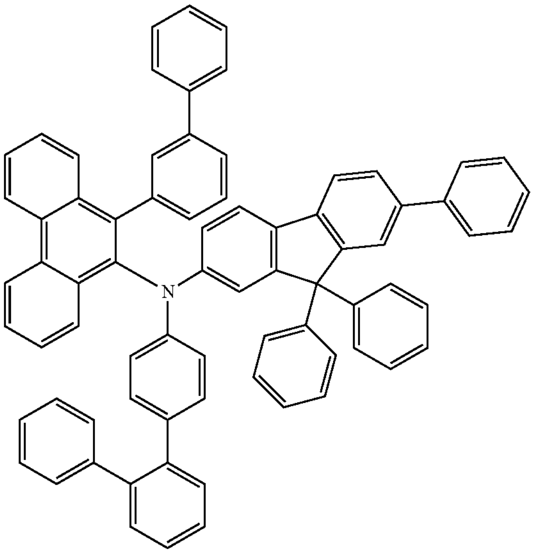

-continued
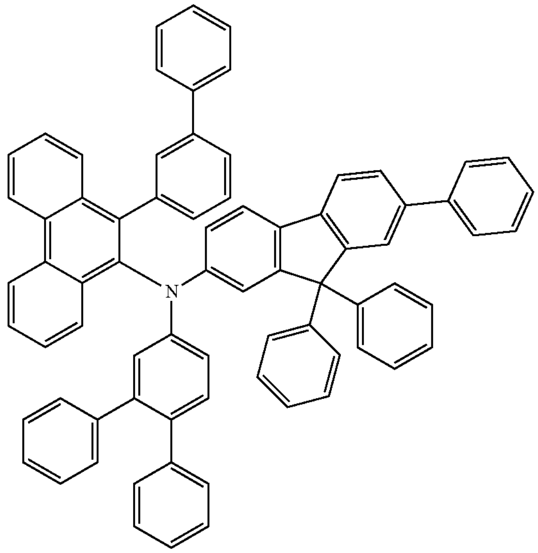
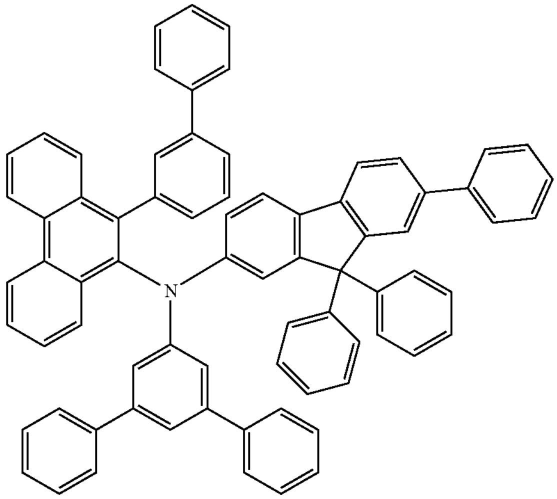
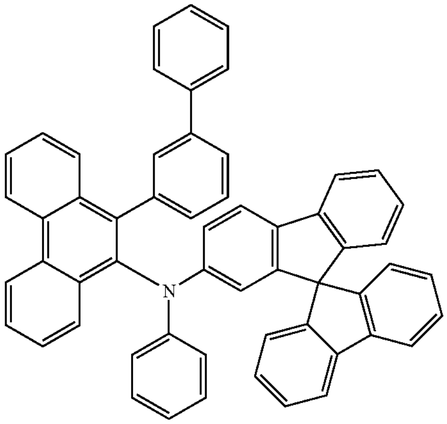
-continued
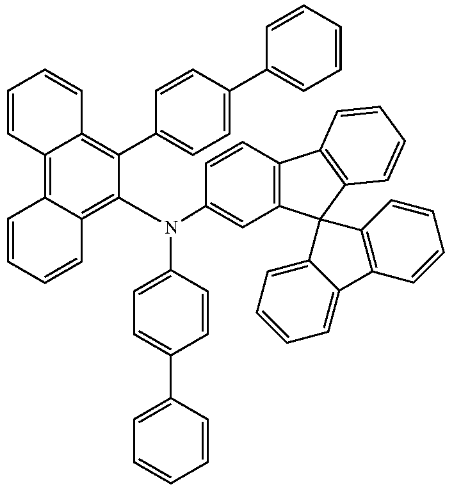
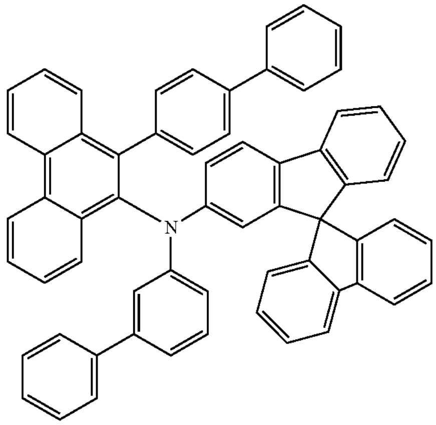
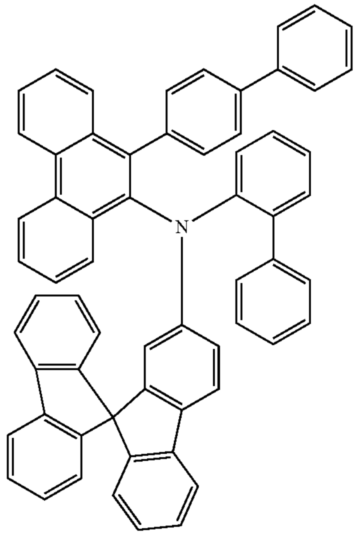

-continued
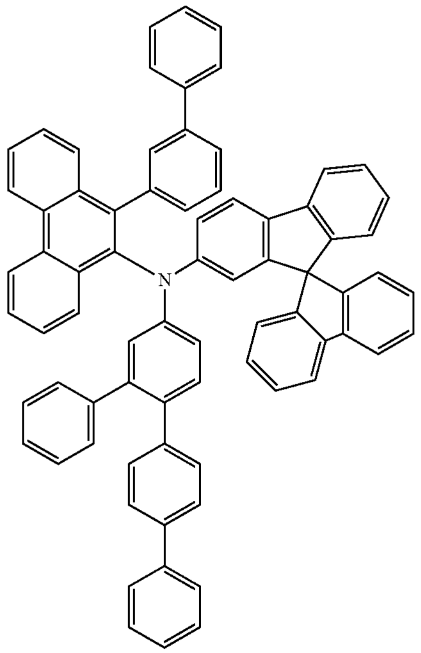
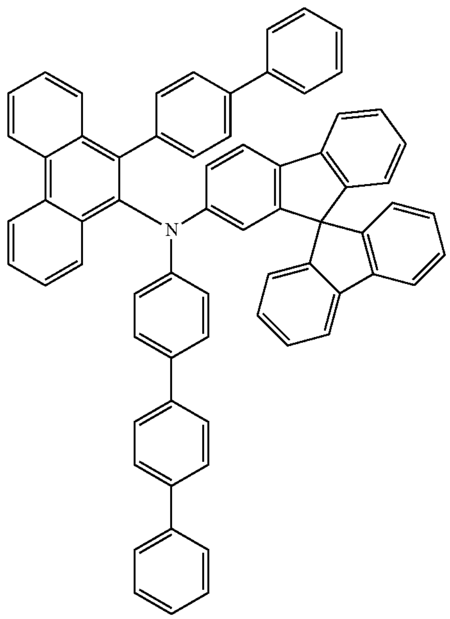
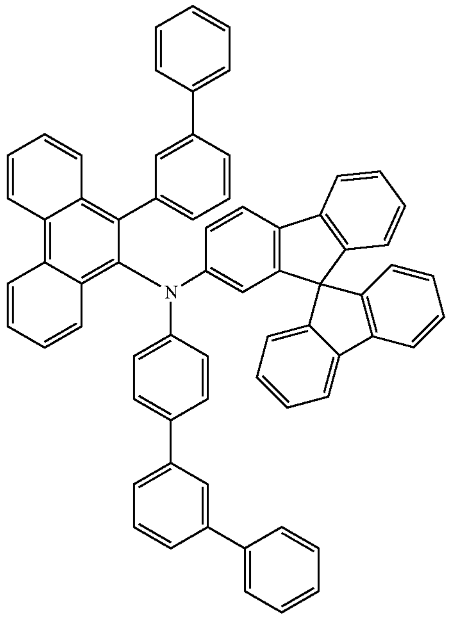
-continued
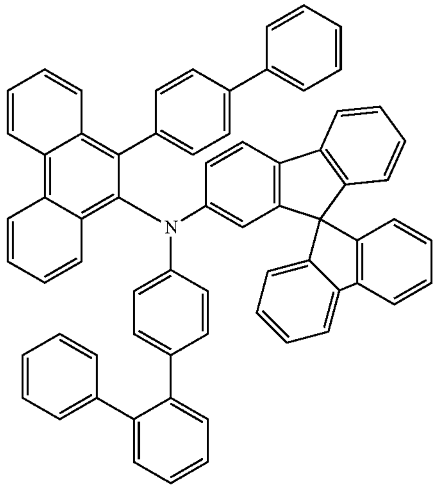
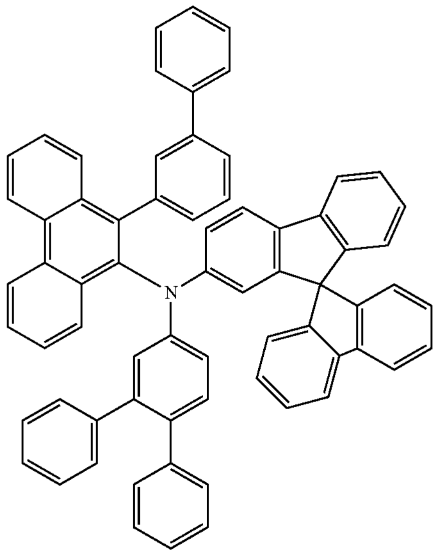

-continued
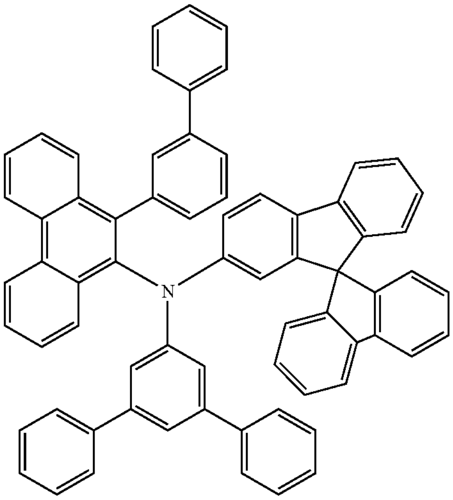
-continued
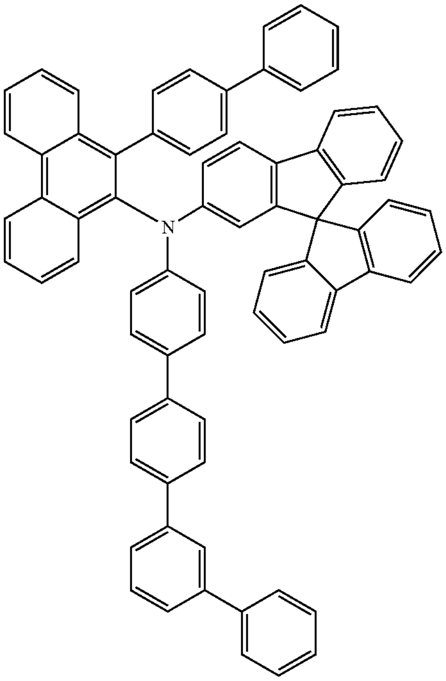
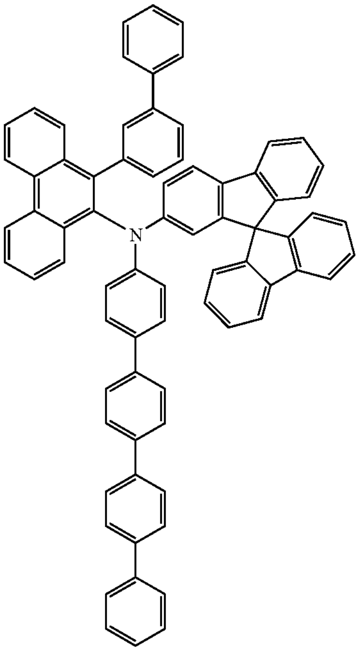
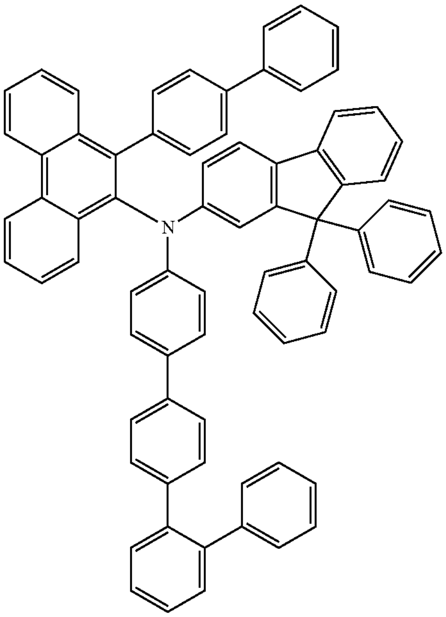

-continued
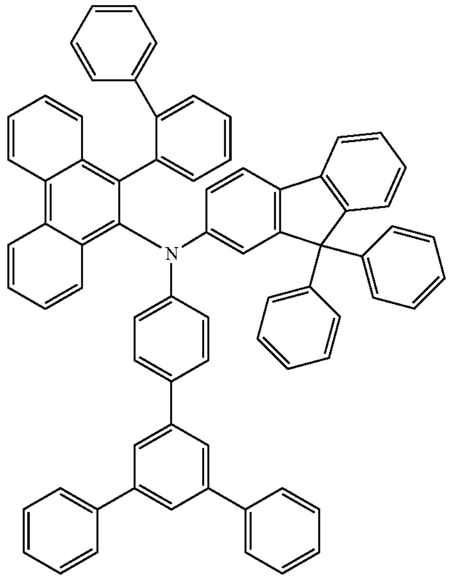
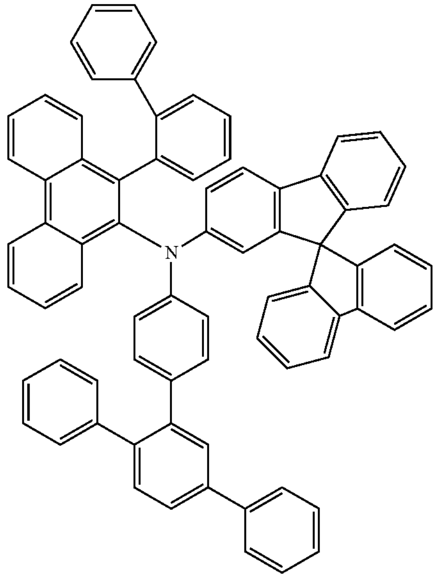
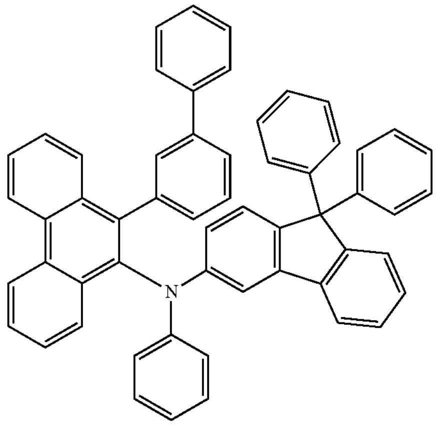
-continued
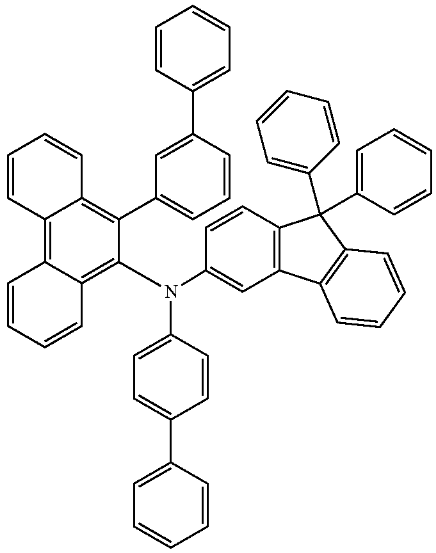
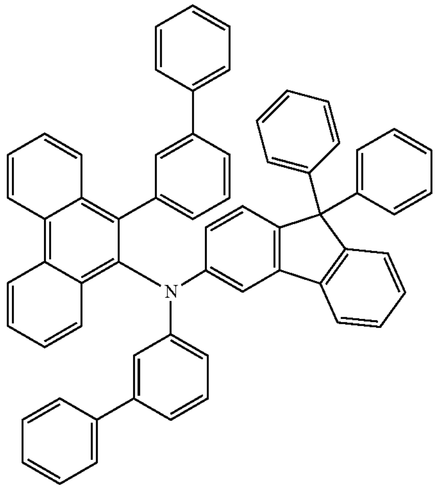
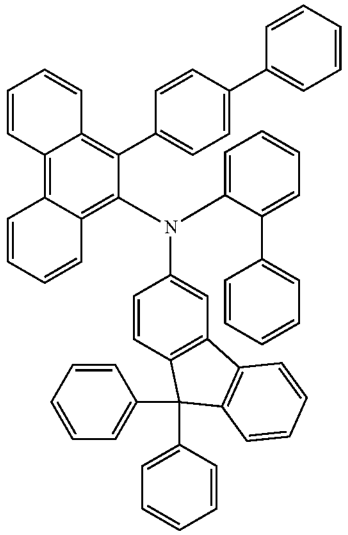

-continued
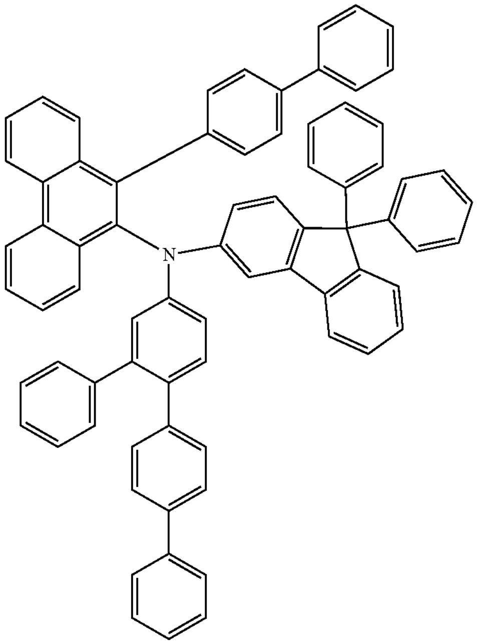
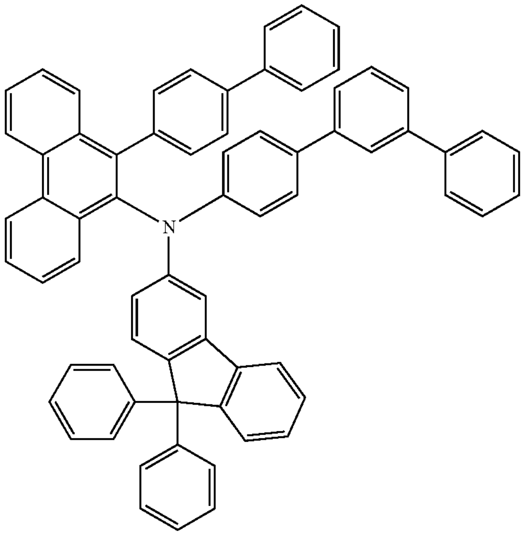
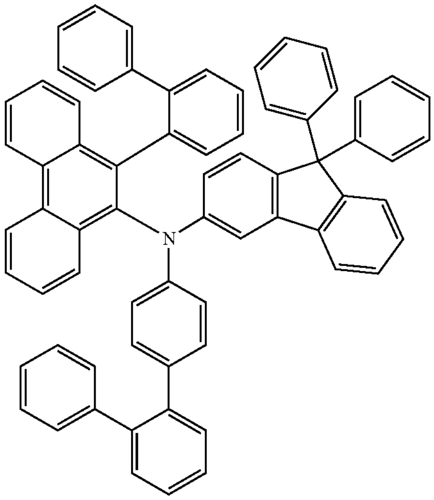
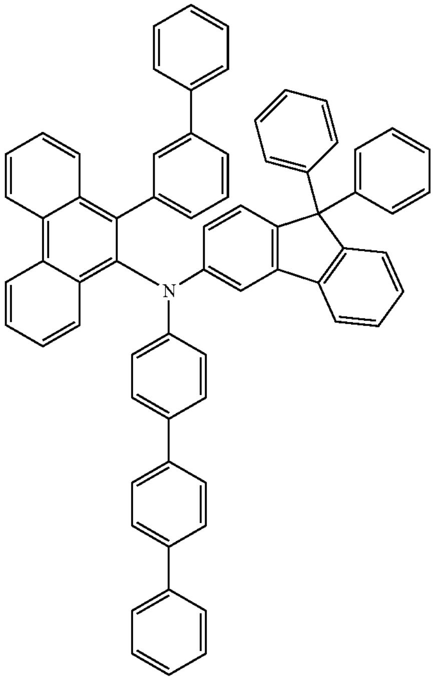
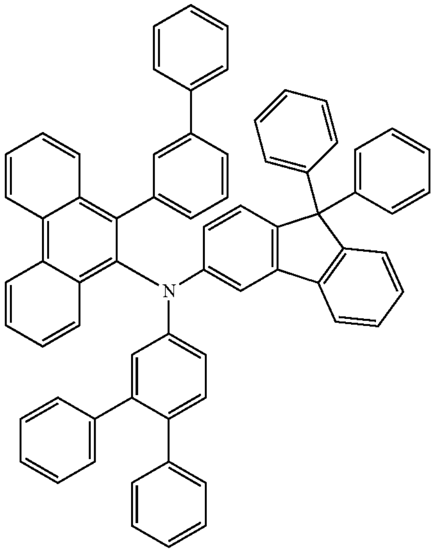

-continued
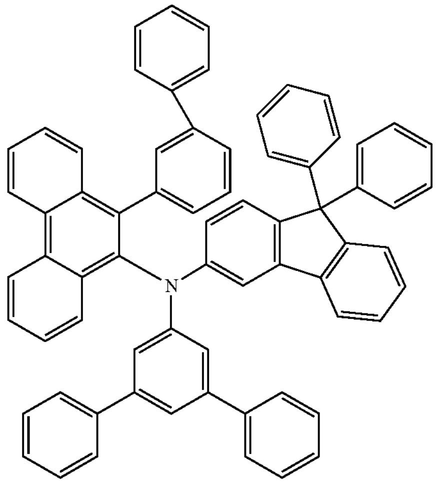
-continued
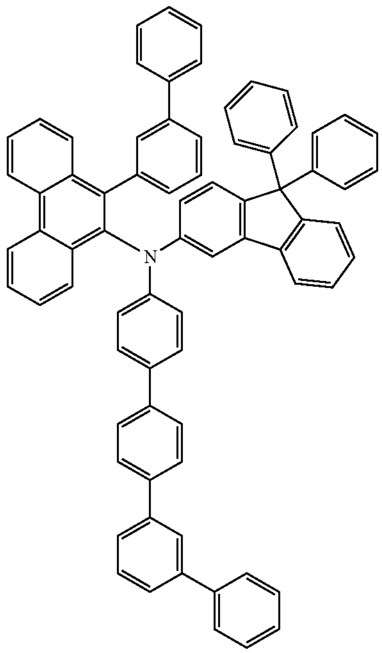
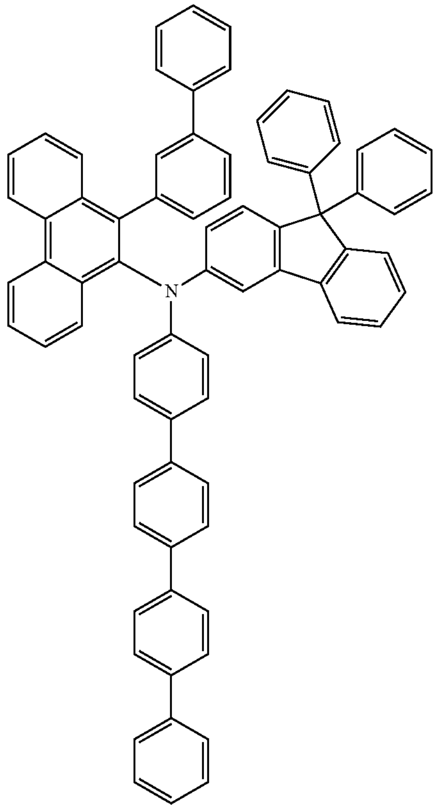
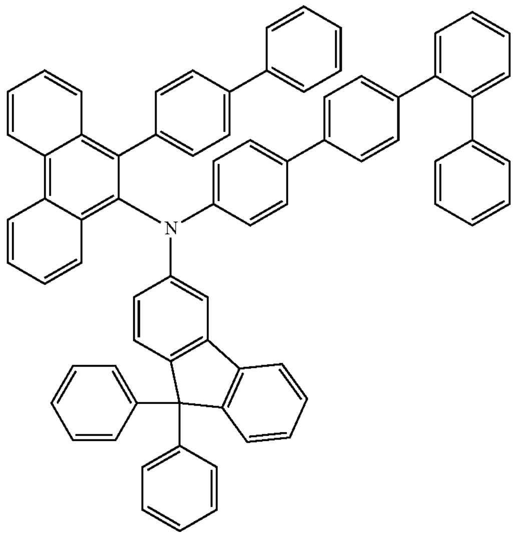

-continued
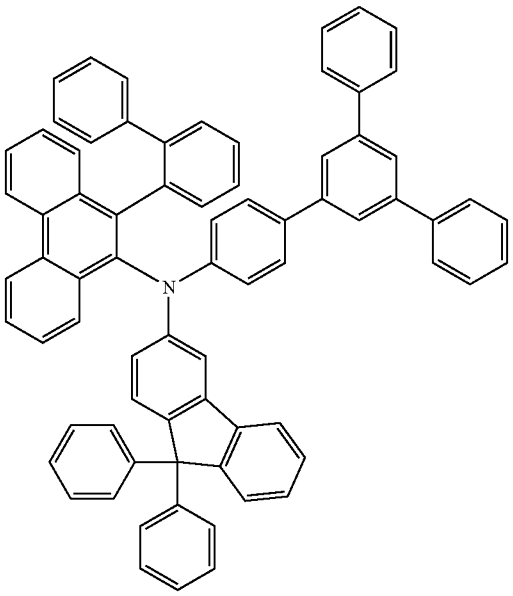
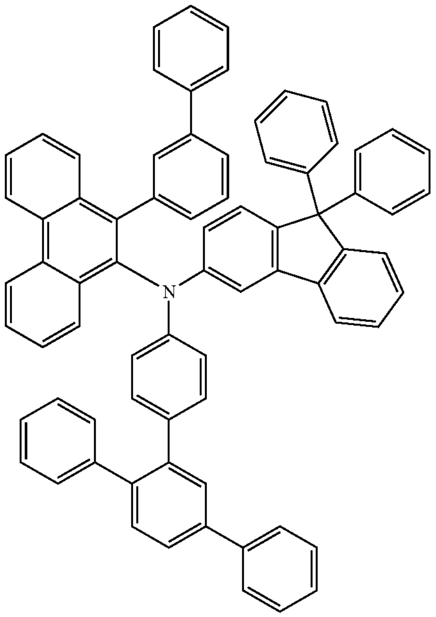
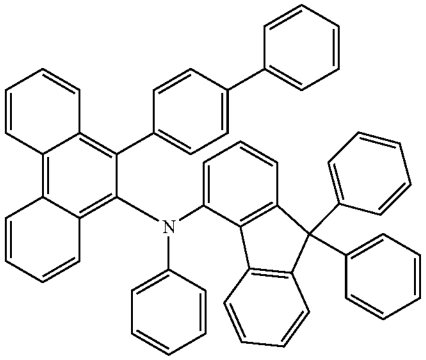
-continued
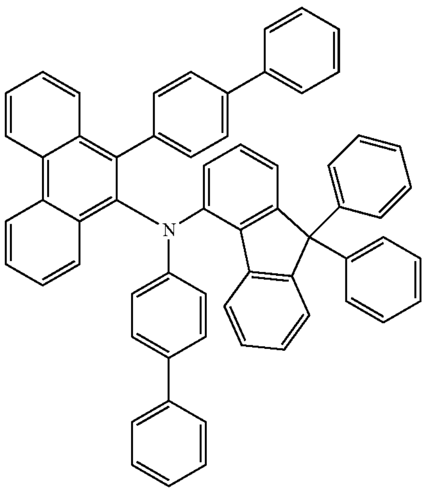
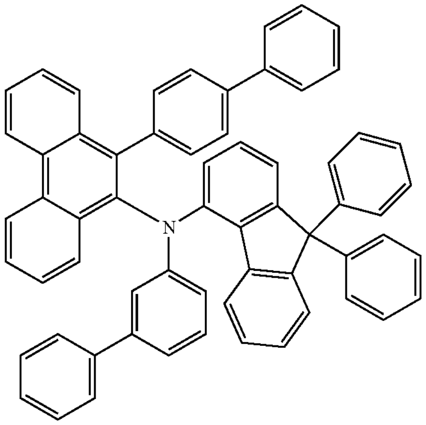
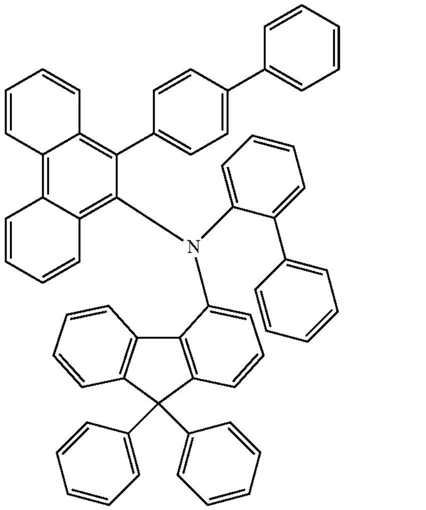

-continued
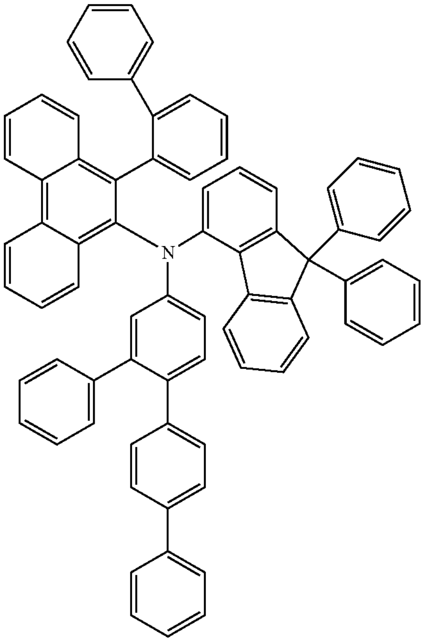
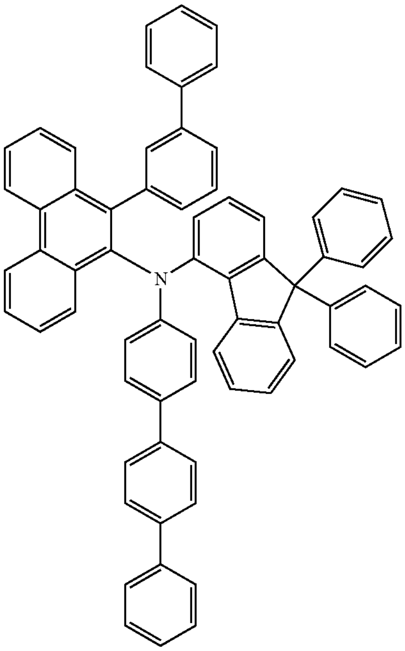
-continued
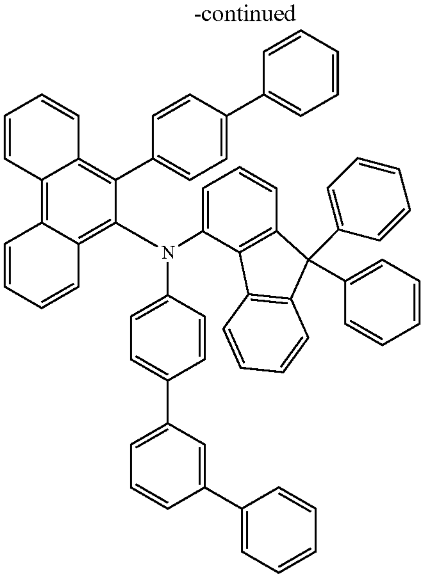
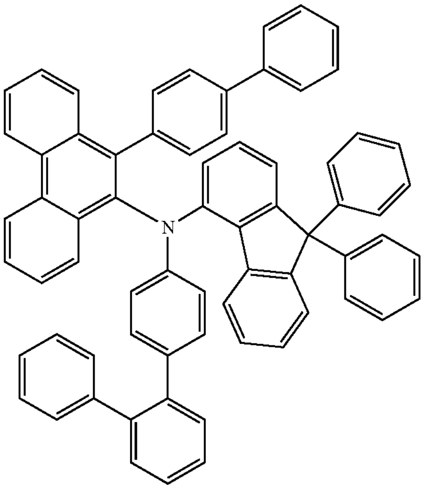
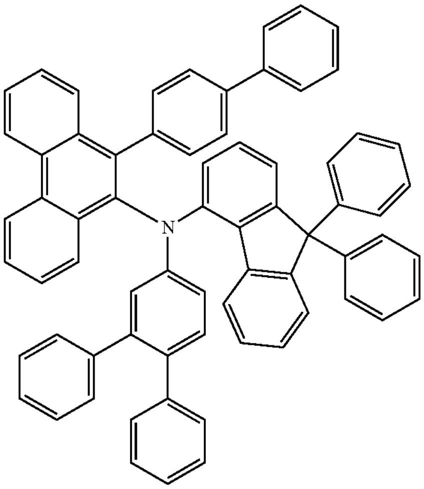

-continued
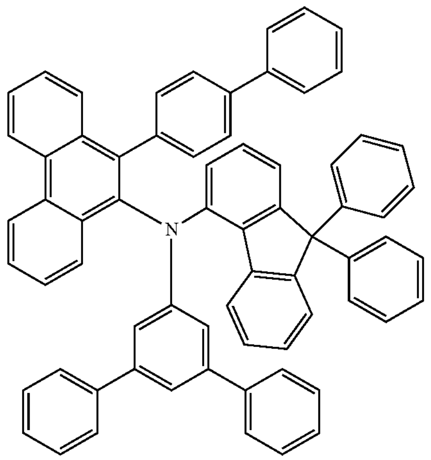
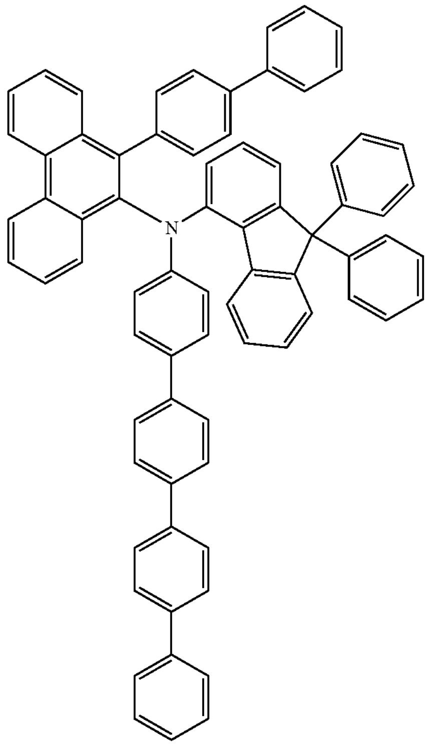
-continued
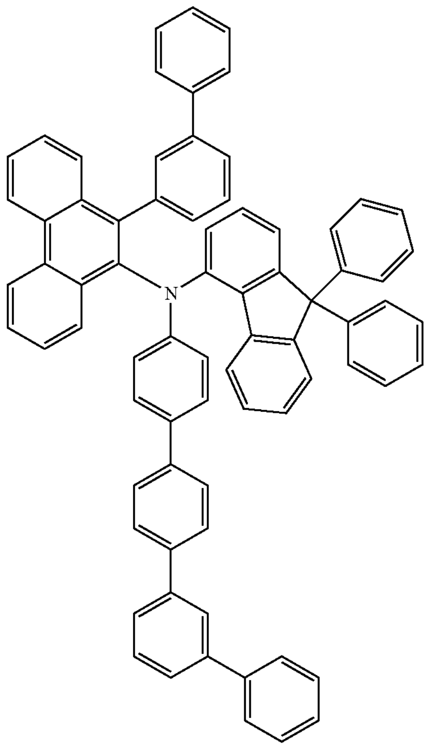
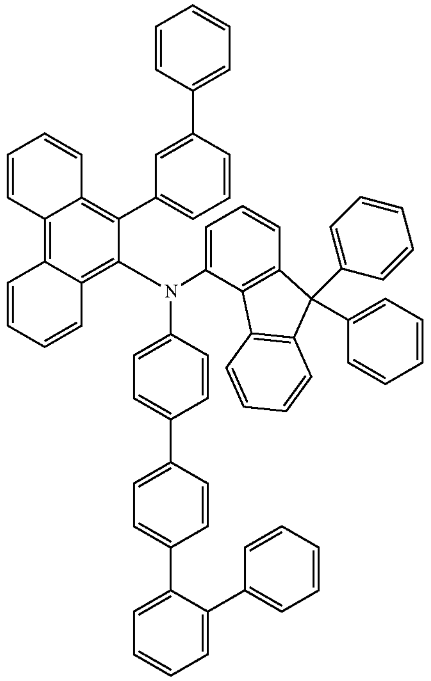

-continued
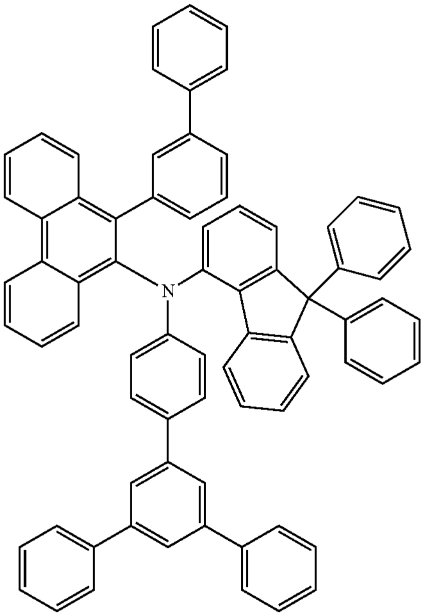
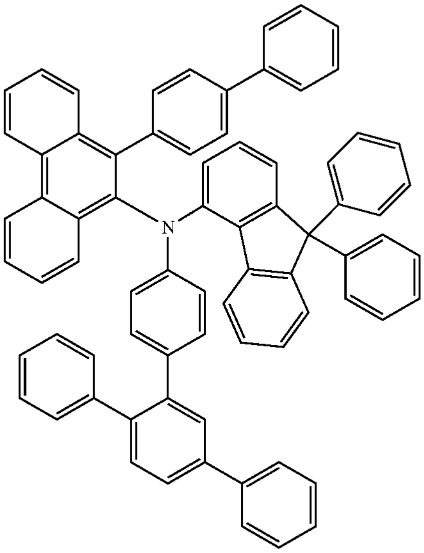
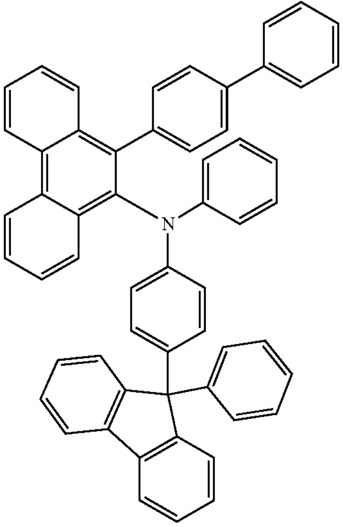
-continued
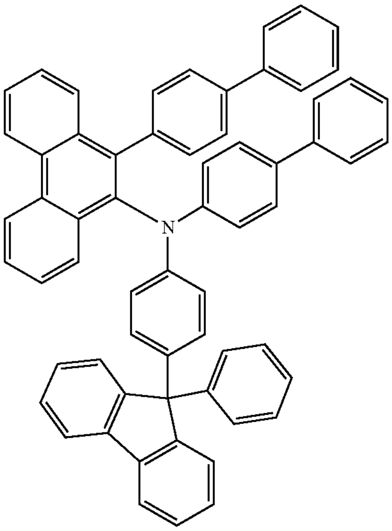
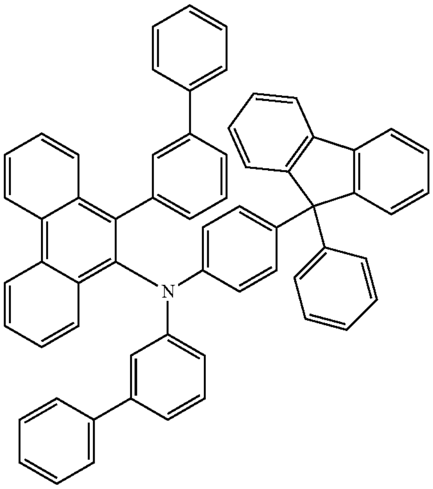
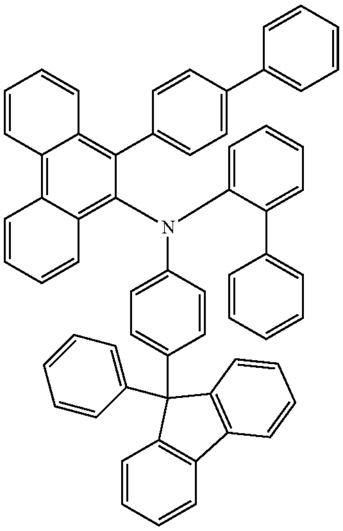

-continued
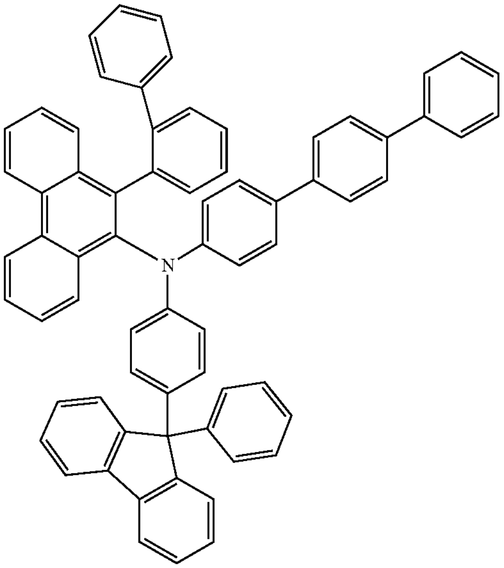
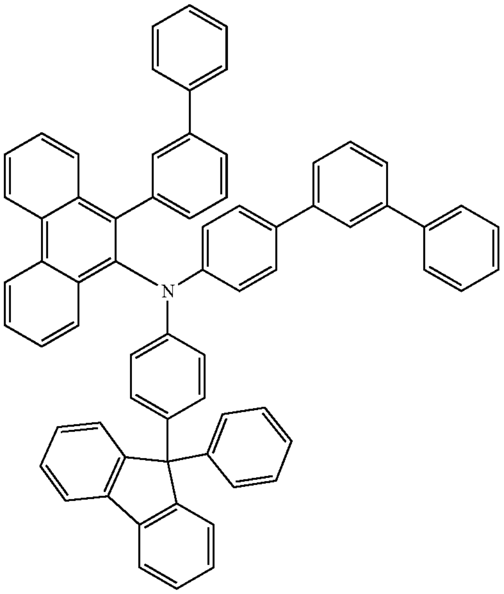
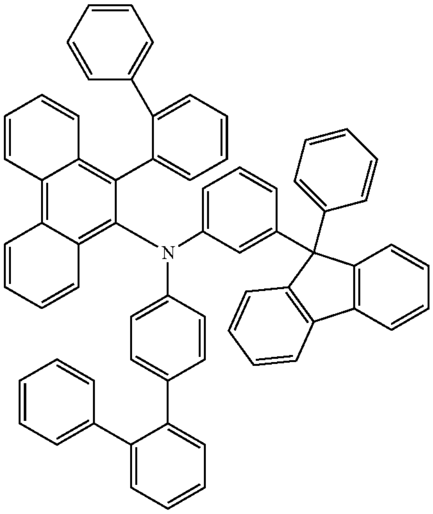
-continued
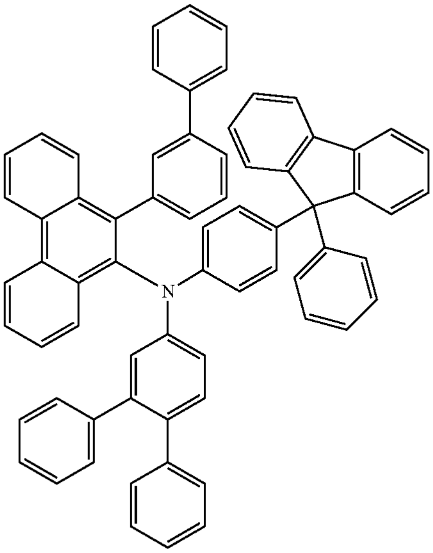
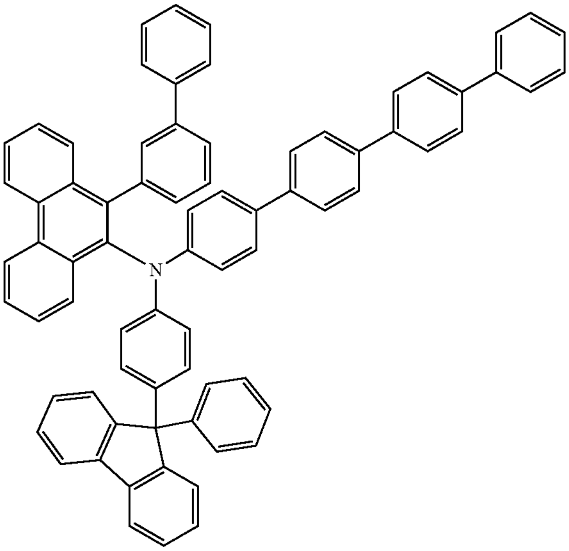

-continued
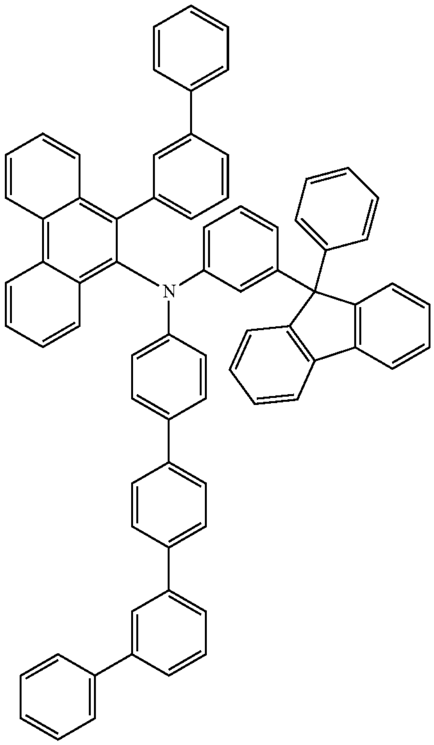
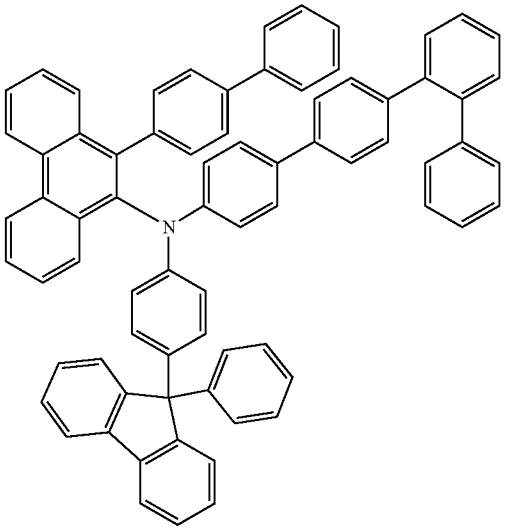
-continued
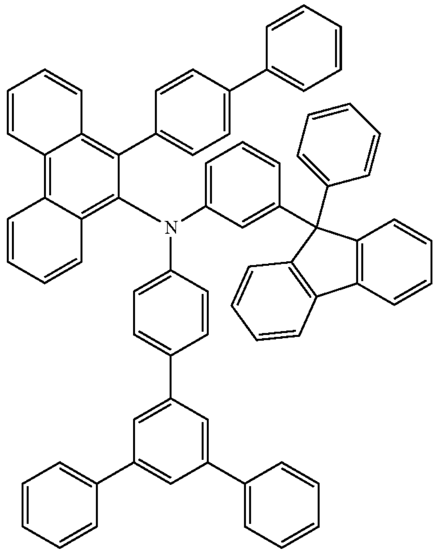
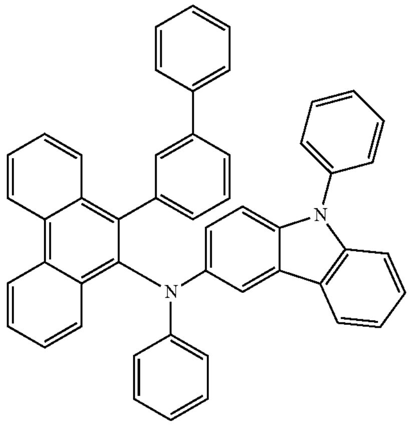
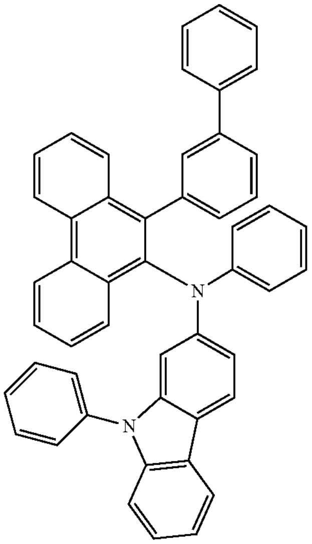

-continued
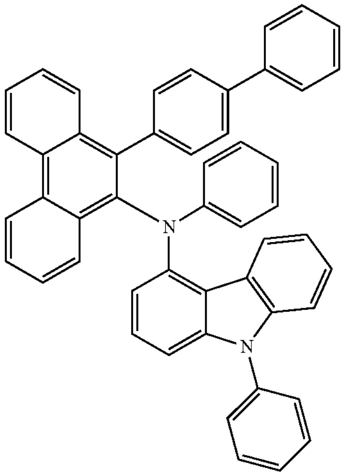
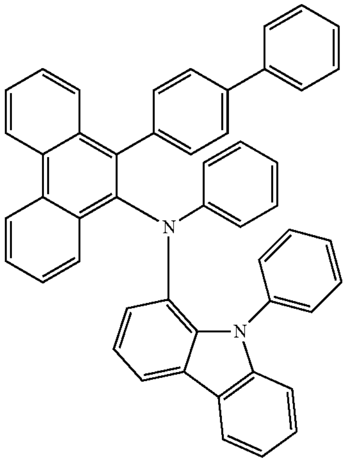
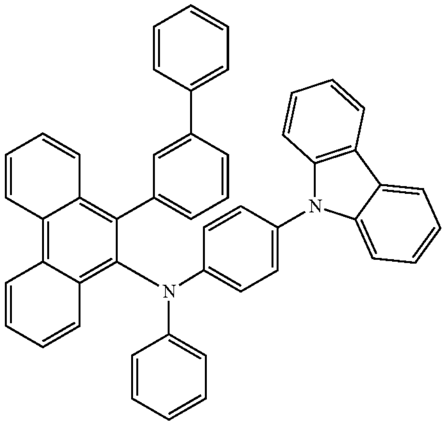
-continued
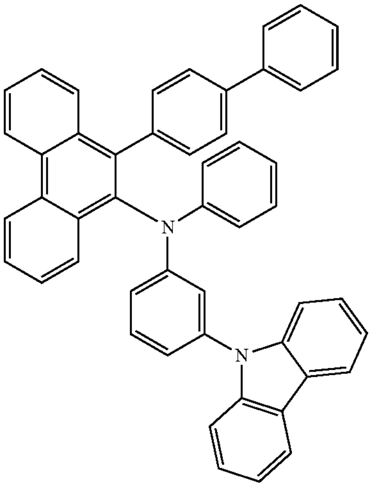
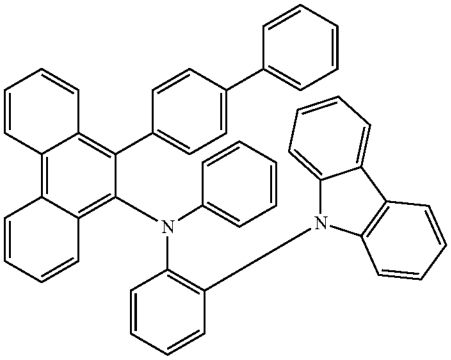
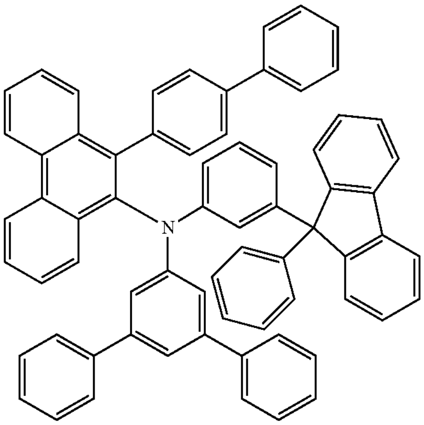
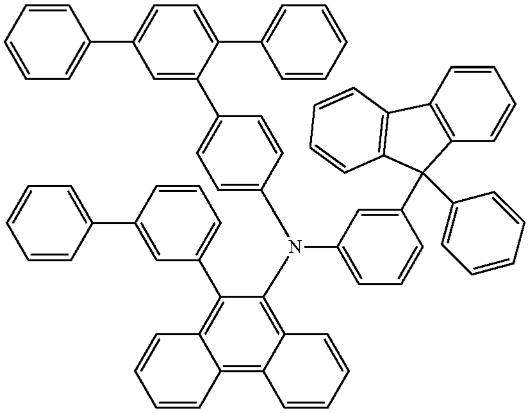

-continued
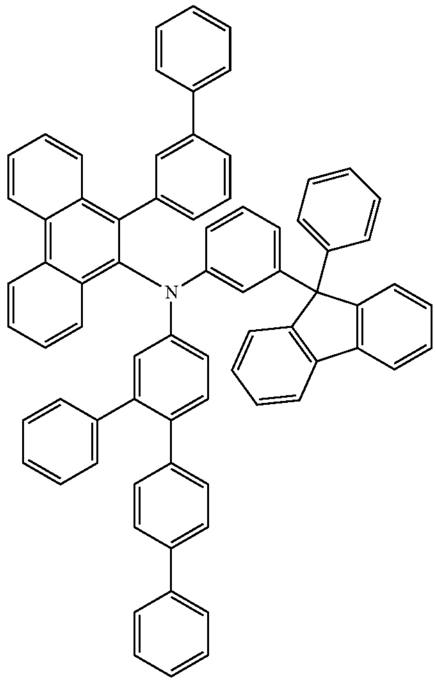
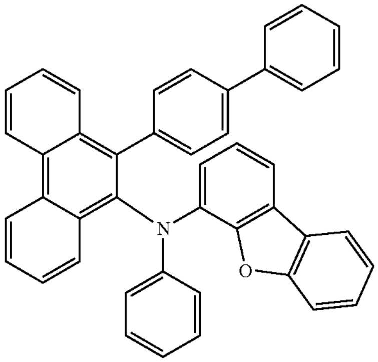
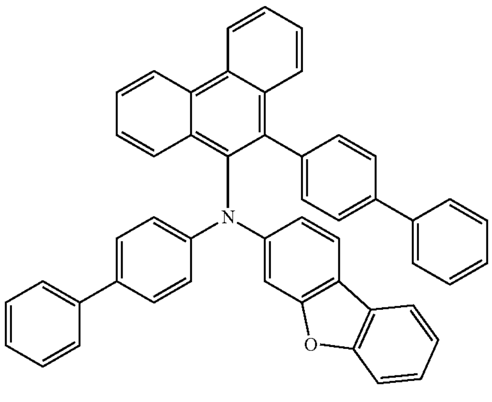
-continued
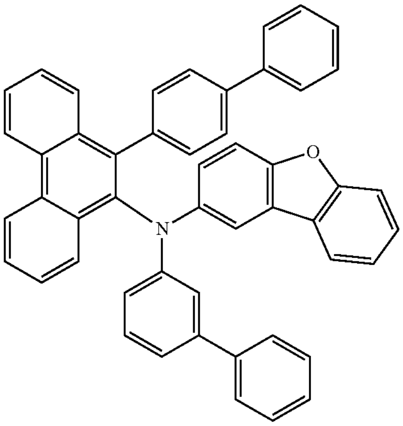
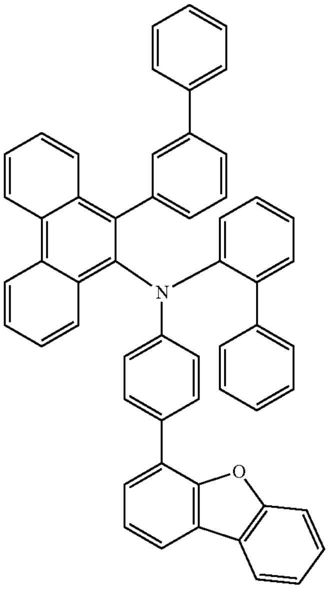
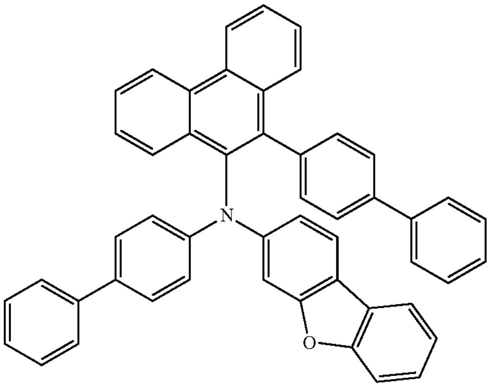

-continued
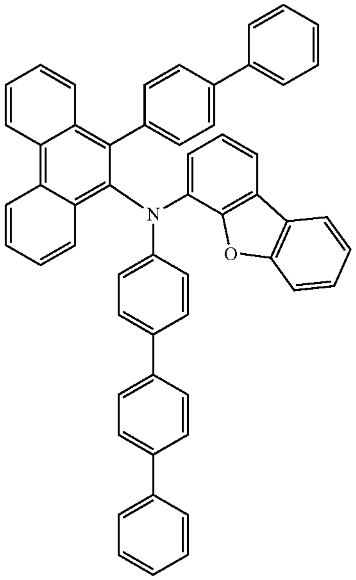
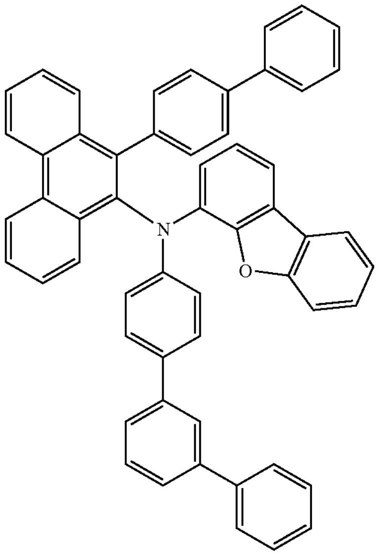
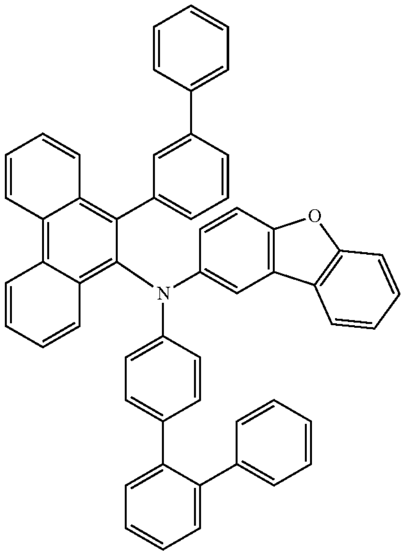
-continued
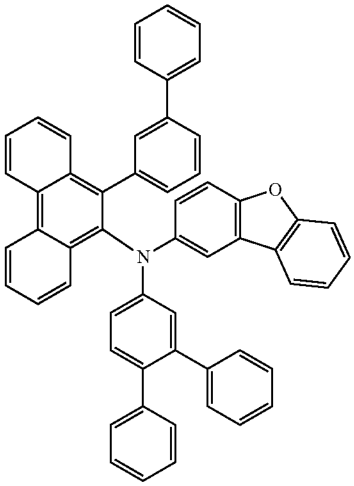
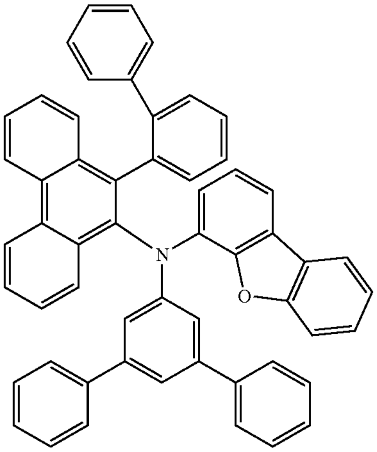
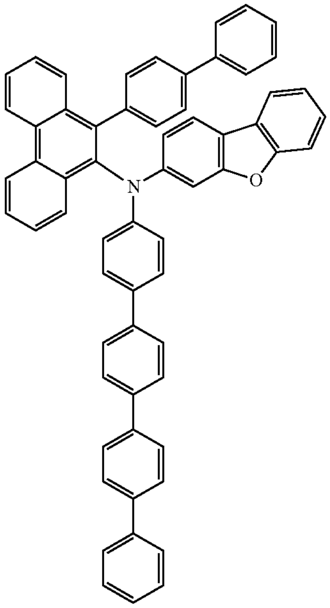

-continued
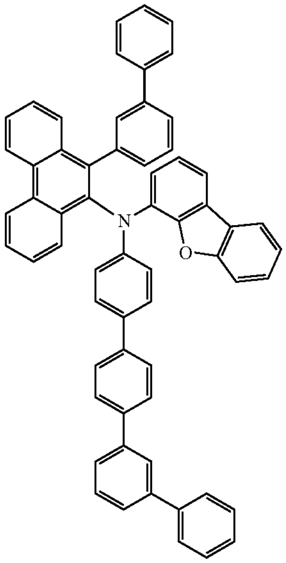
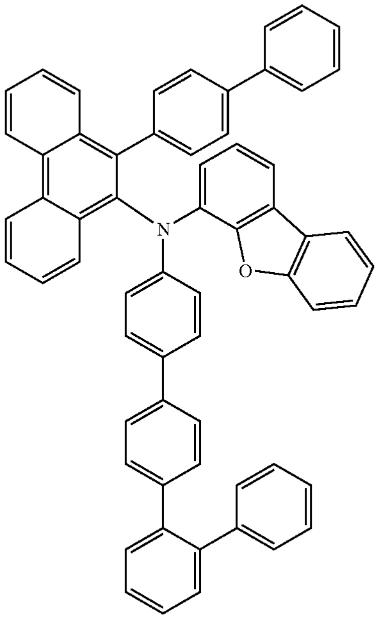
-continued
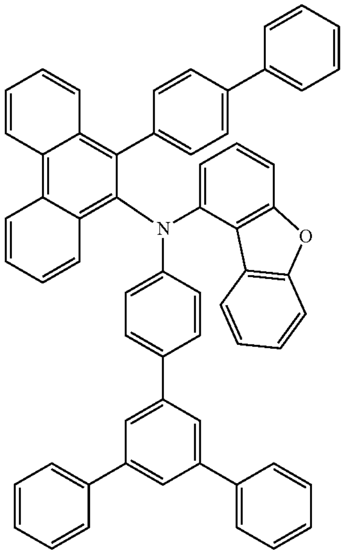
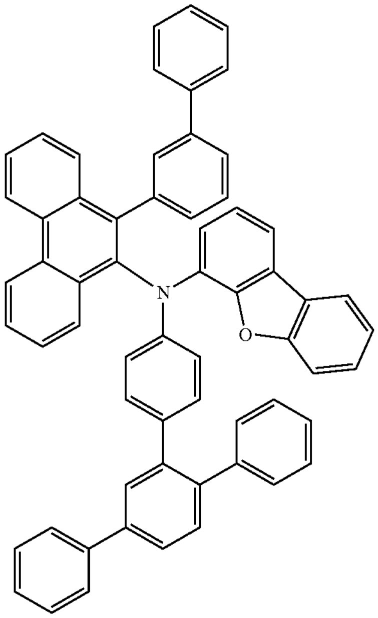
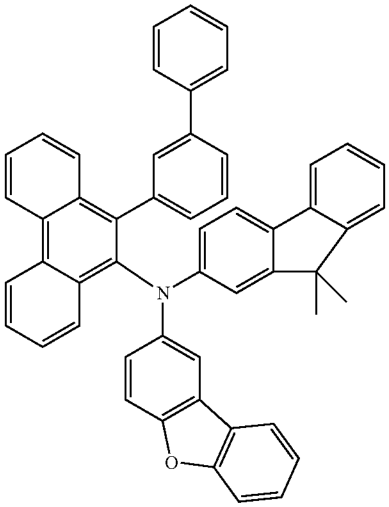

-continued
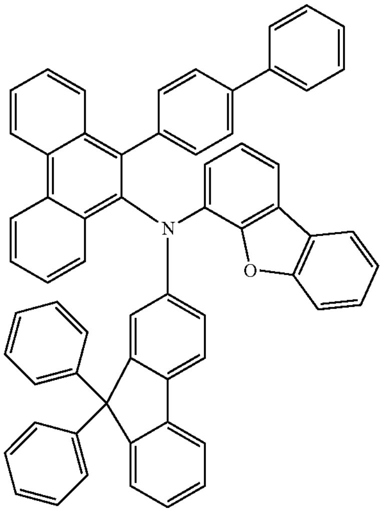
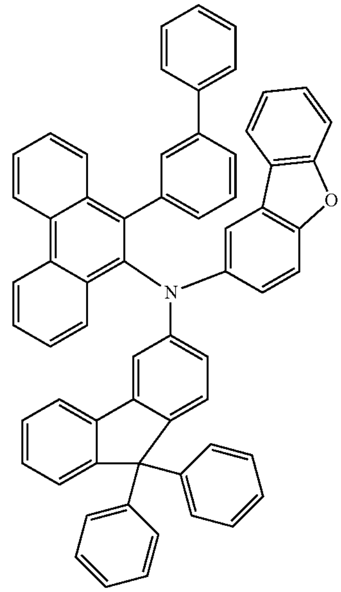
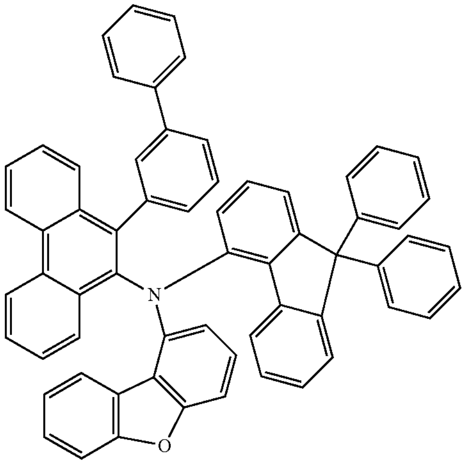
-continued
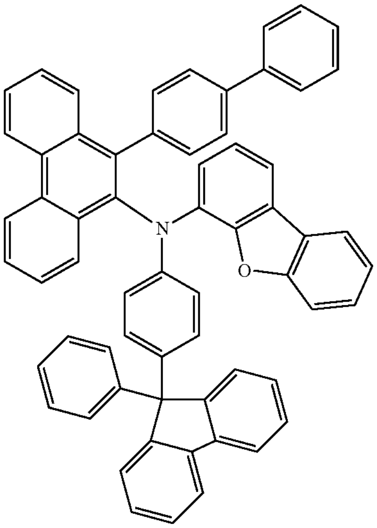
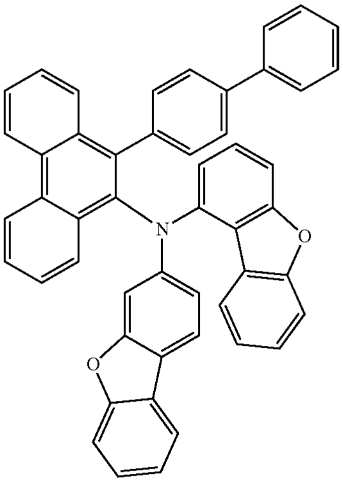
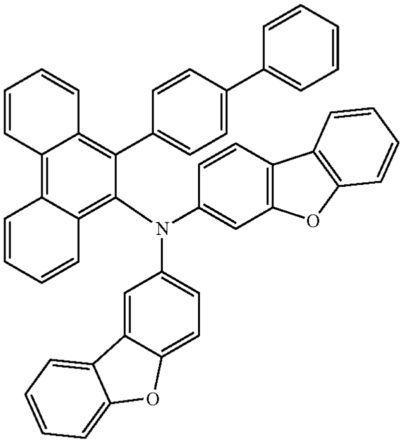

-continued
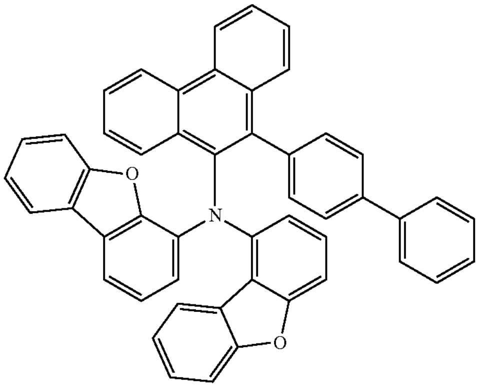
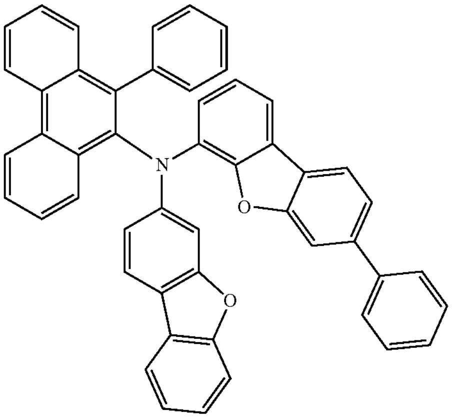
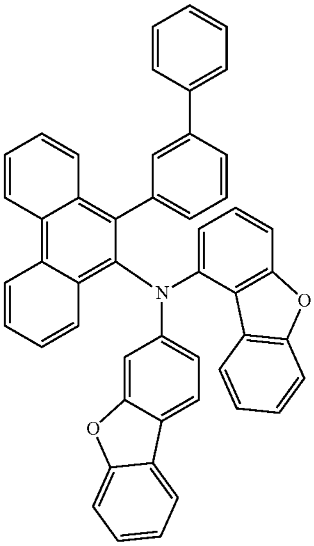
-continued
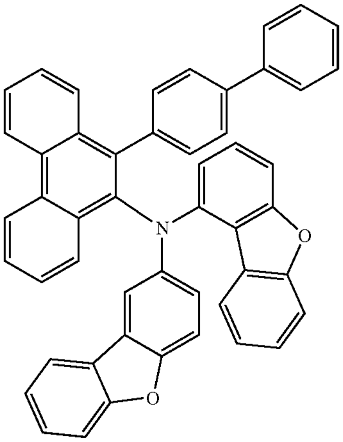
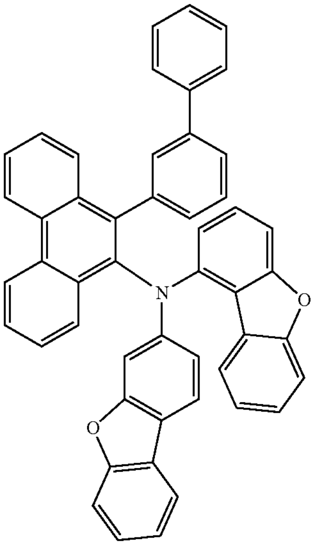
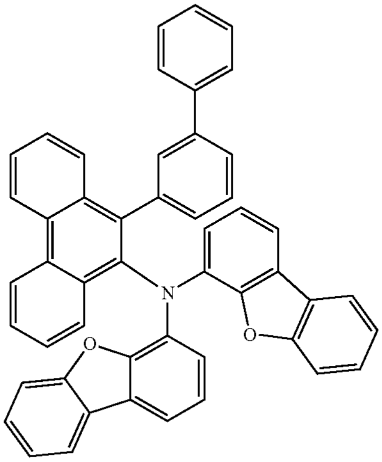

-continued
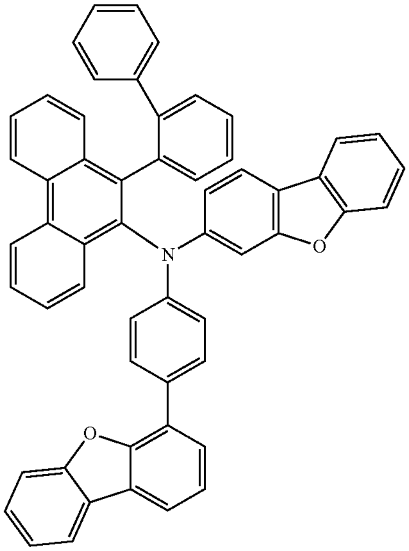
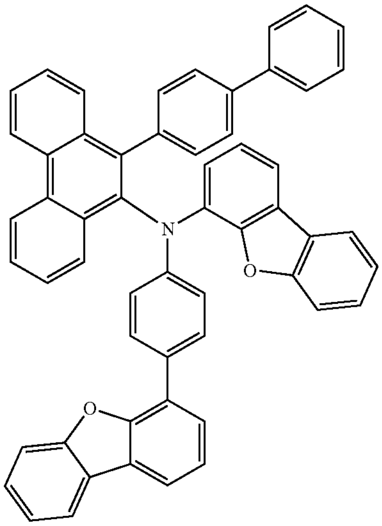
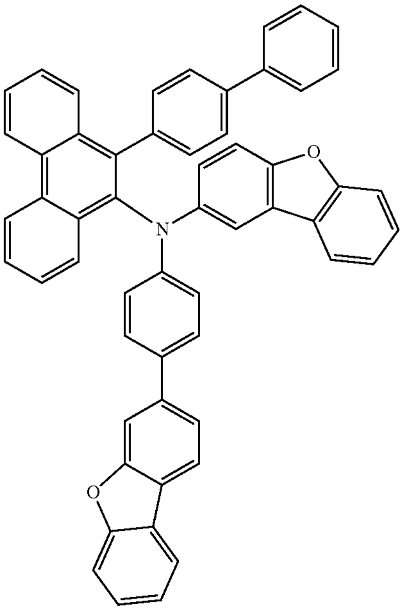
-continued
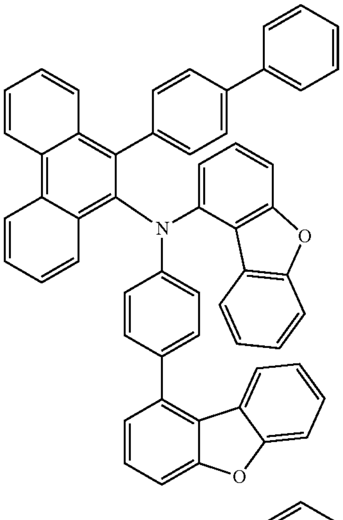
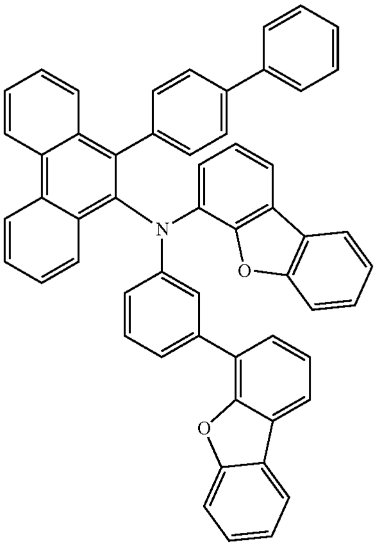
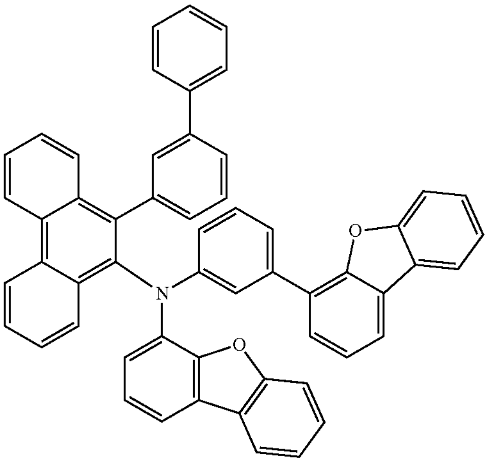

-continued
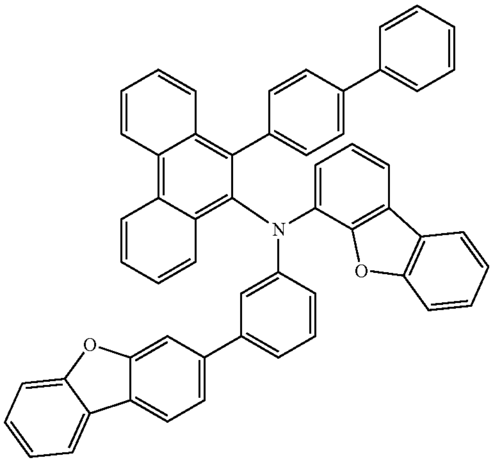
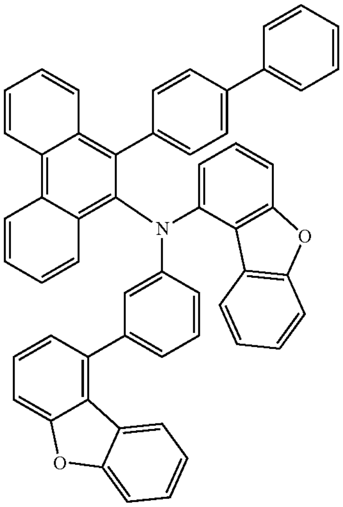
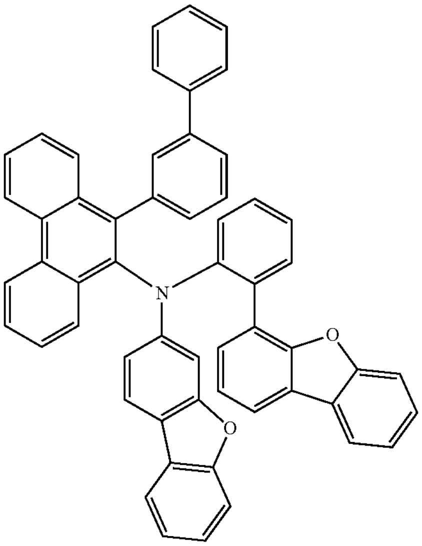
-continued
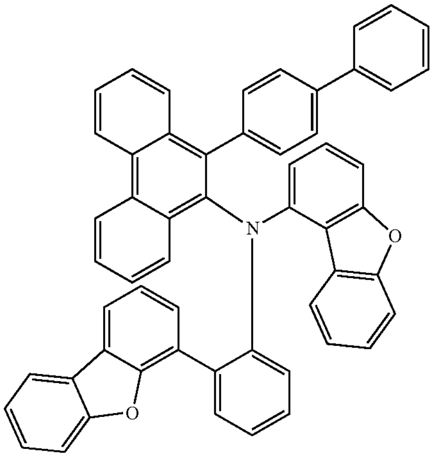
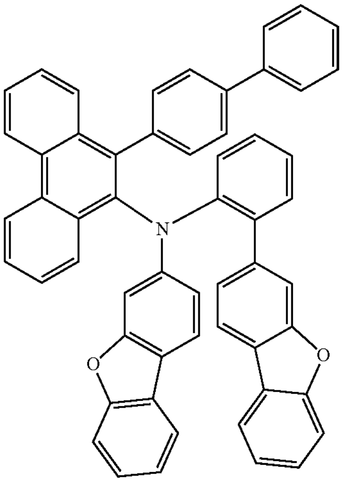
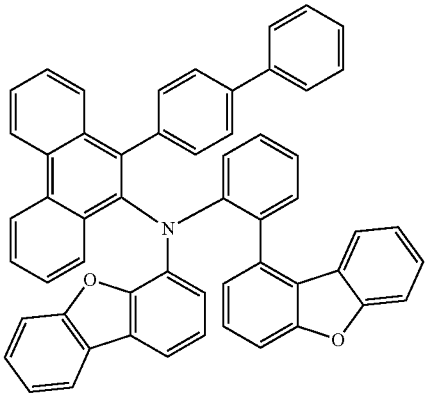

-continued
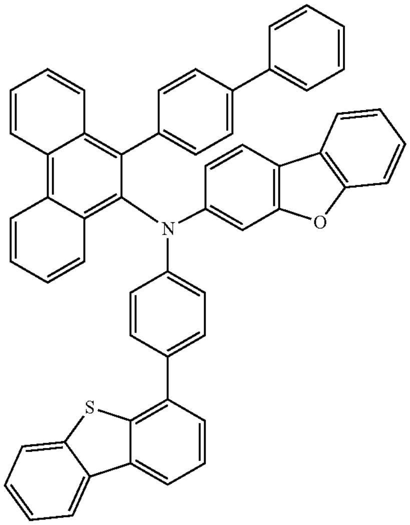
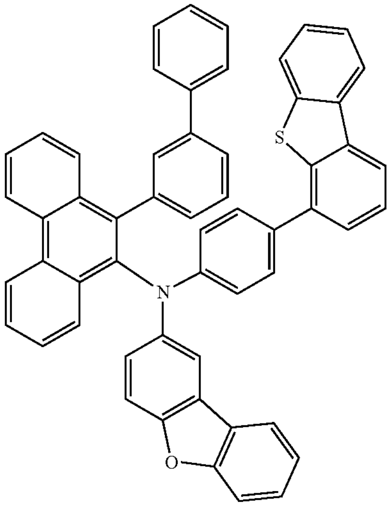
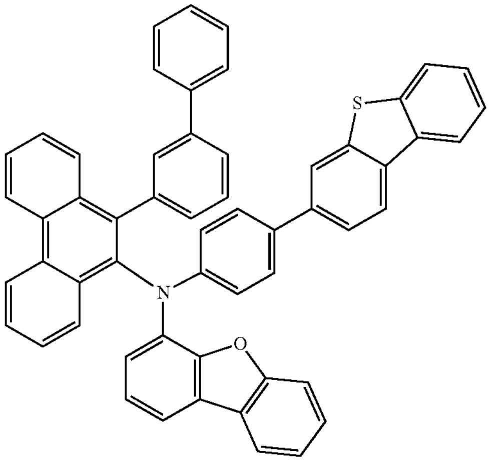
-continued
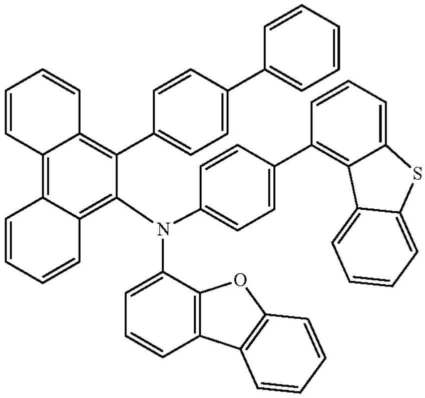
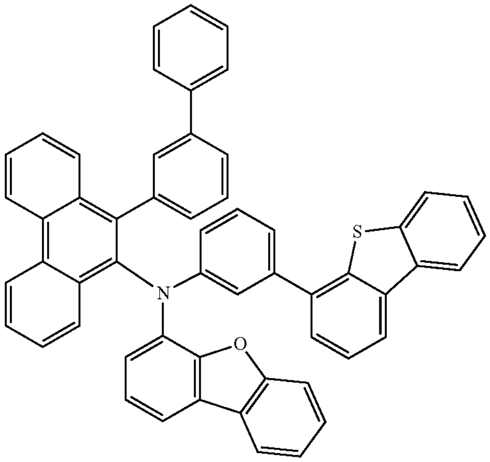
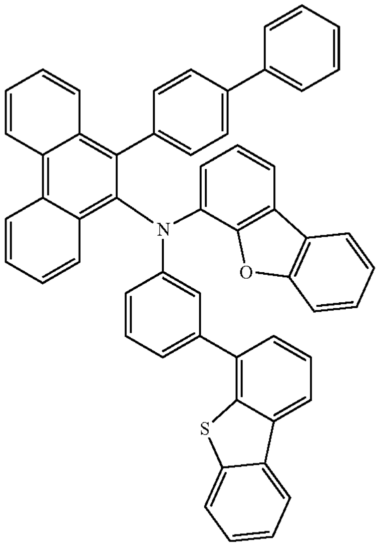

-continued
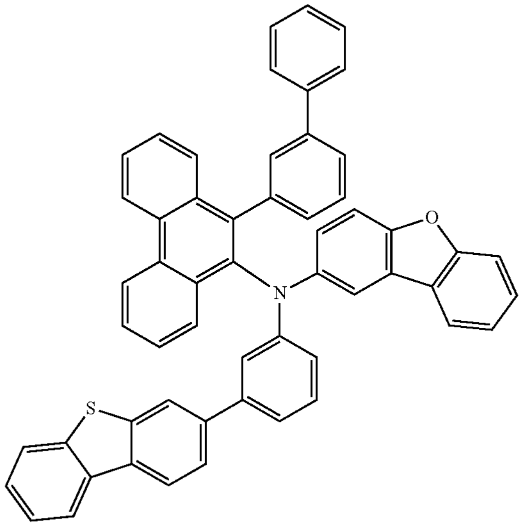
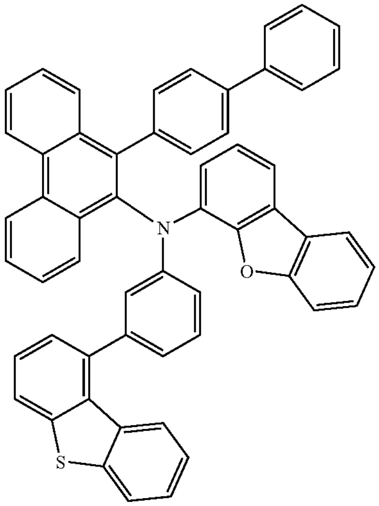
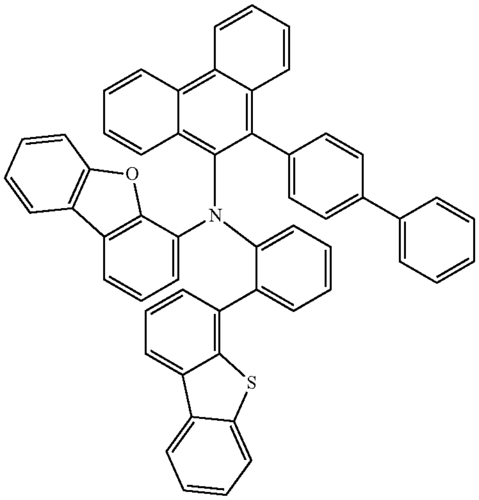
-continued
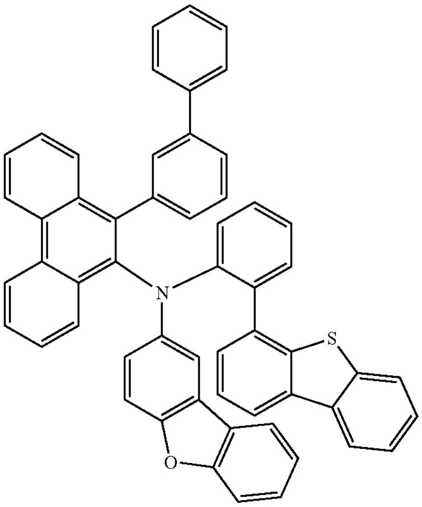
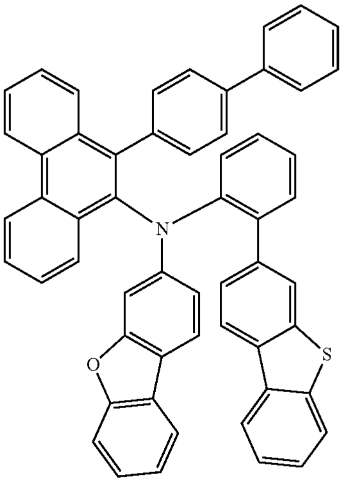
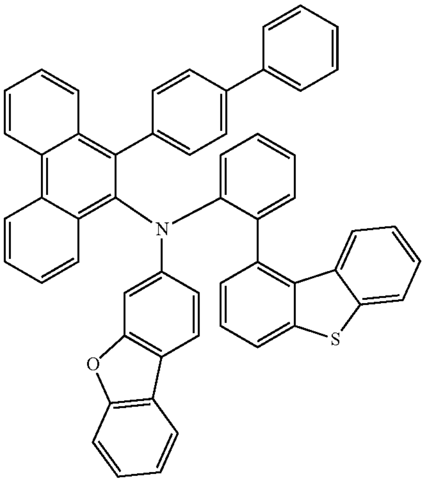 [SMILES: c1ccc(-c2ccc(-c3c(N(c4ccc5c(c4)oc4ccccc45)c4ccccc4-c4cccc5sc6ccccc6c45)c4ccccc4c4ccccc34)cc2)cc1]

-continued
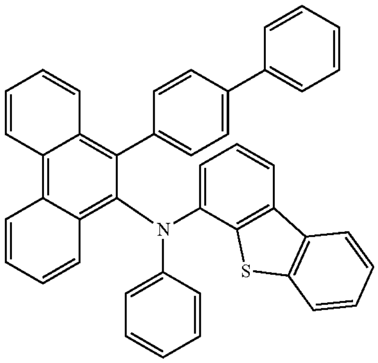
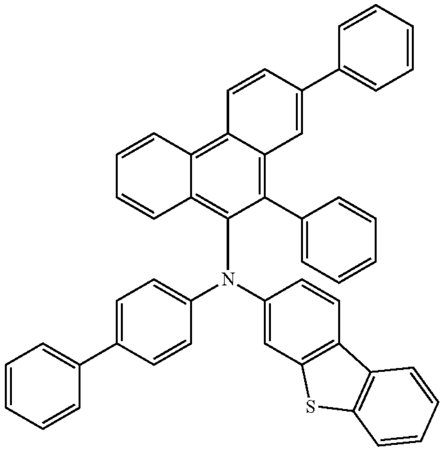
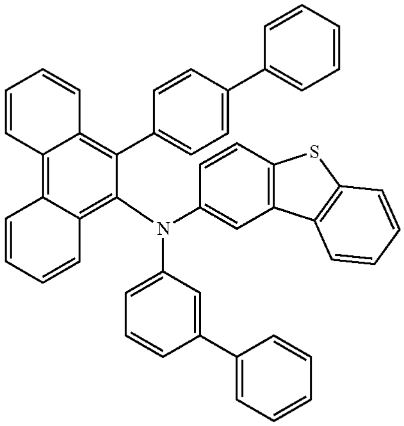
-continued
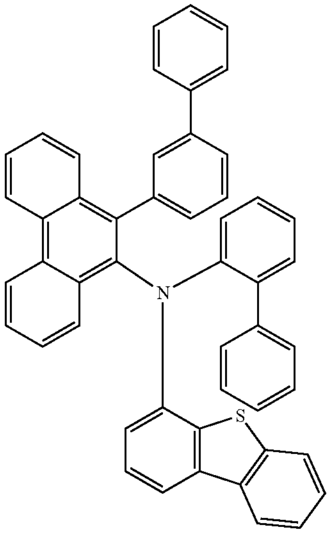
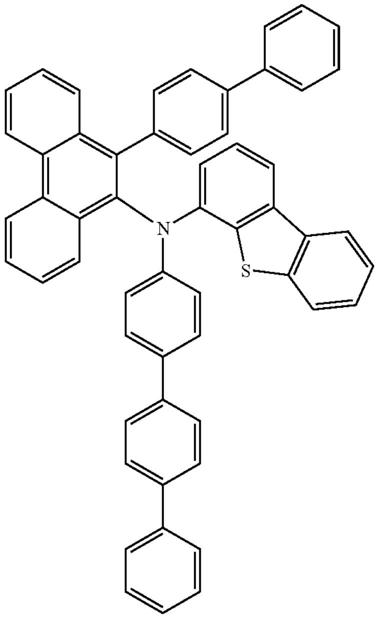

-continued
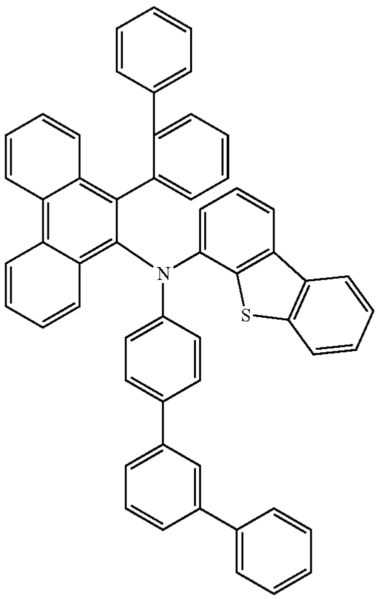
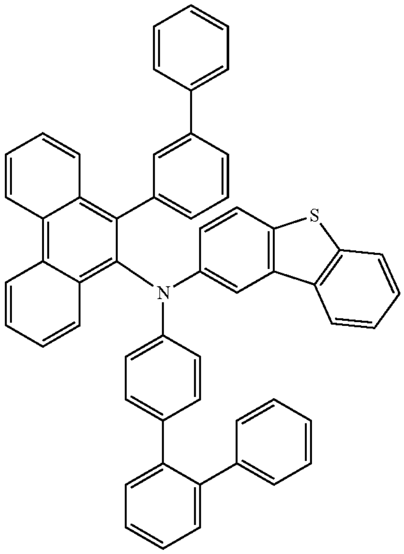
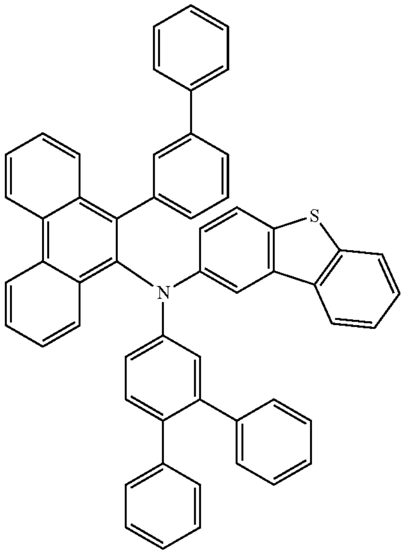
-continued
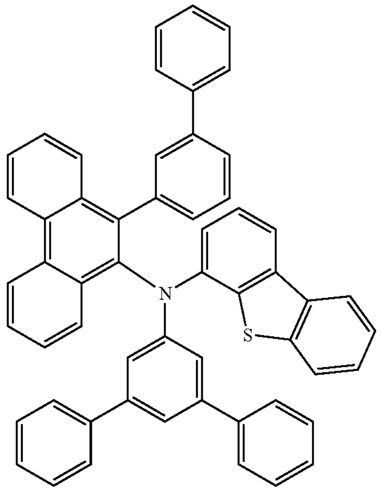
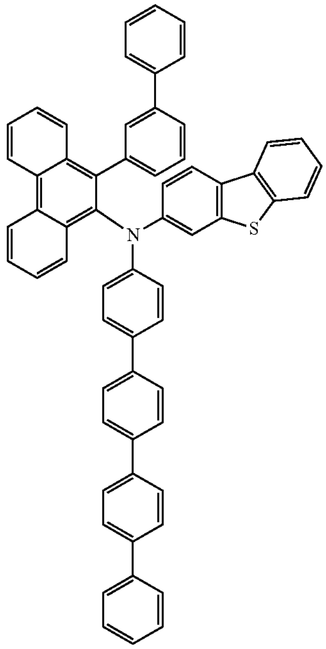
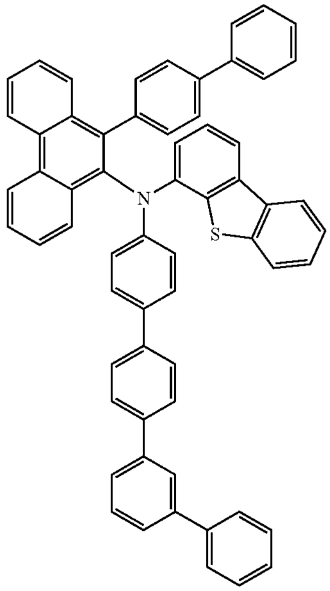

-continued
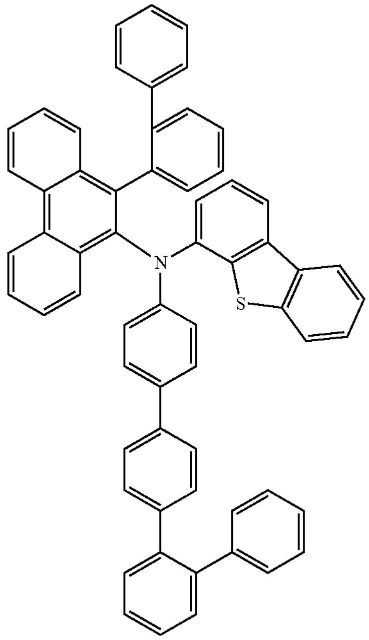
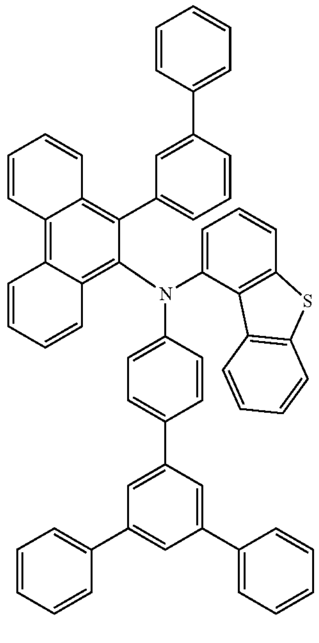
-continued
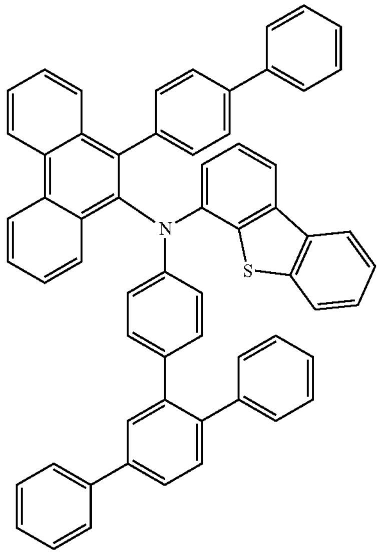
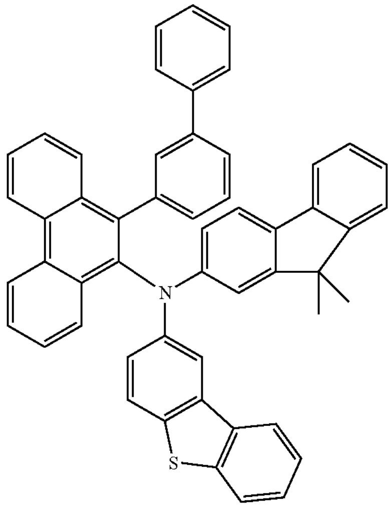
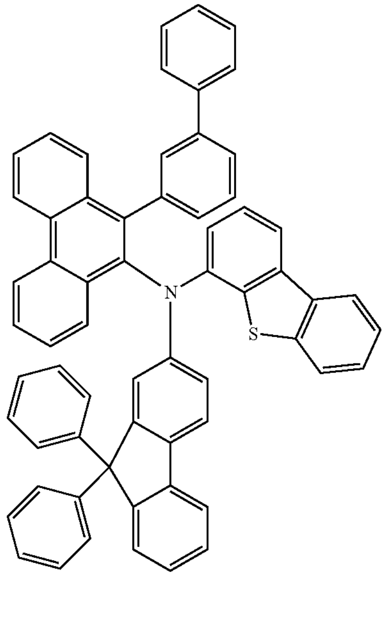

-continued
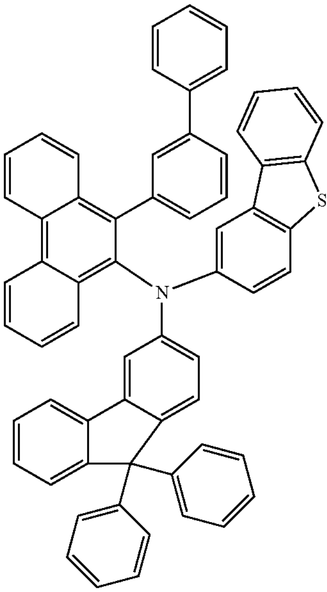
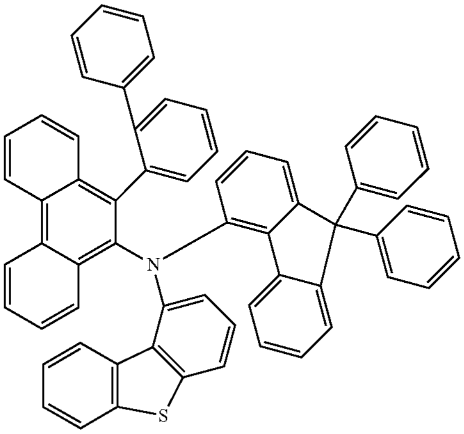
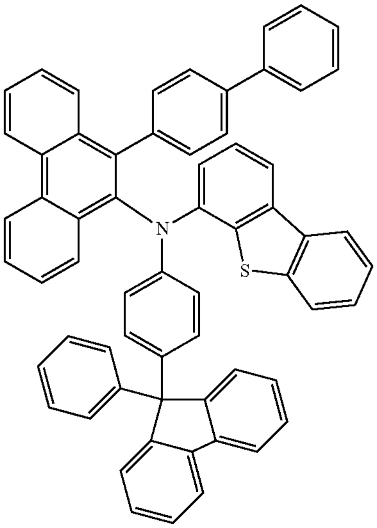
-continued
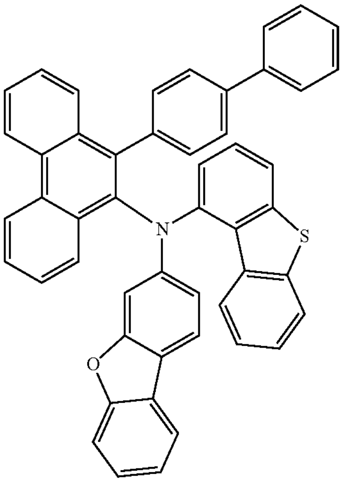
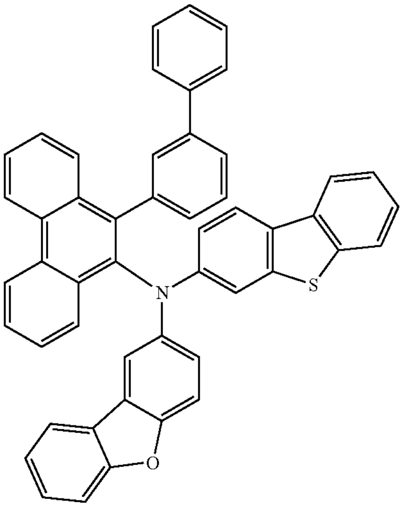
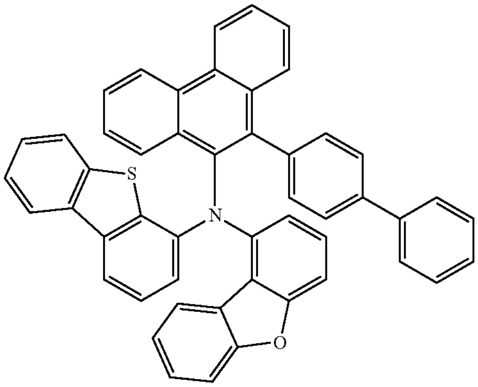

-continued
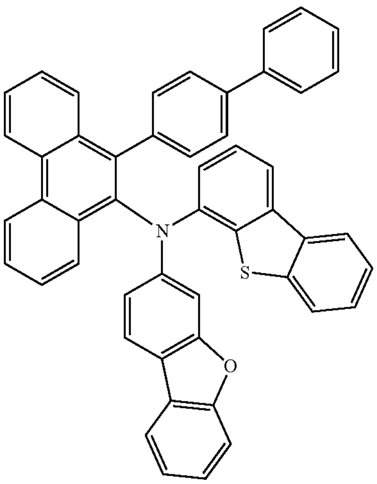
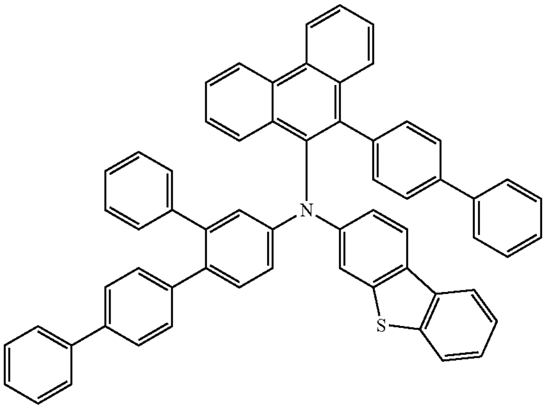
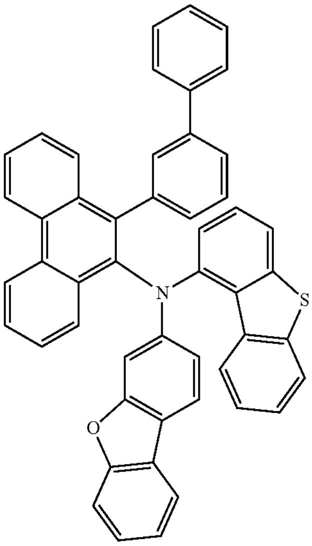
-continued
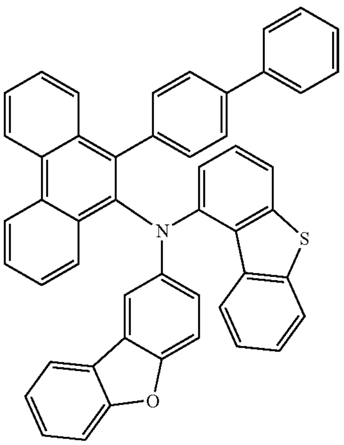
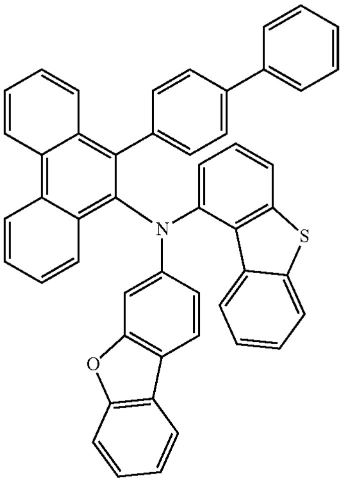
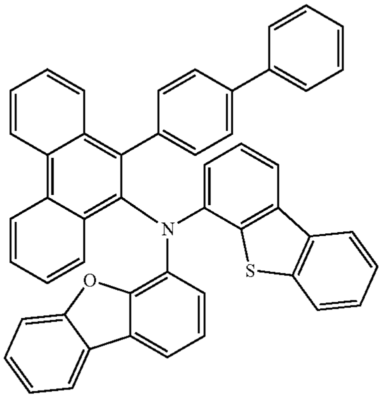

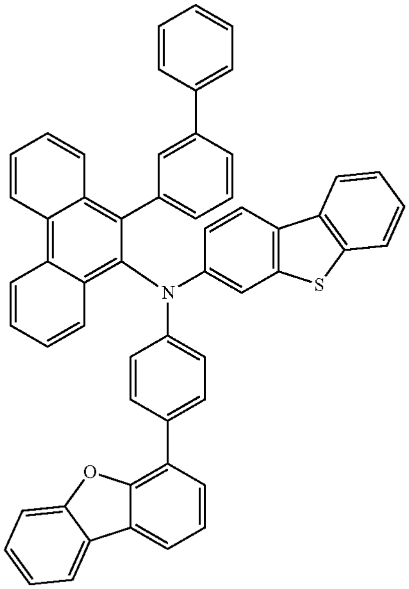
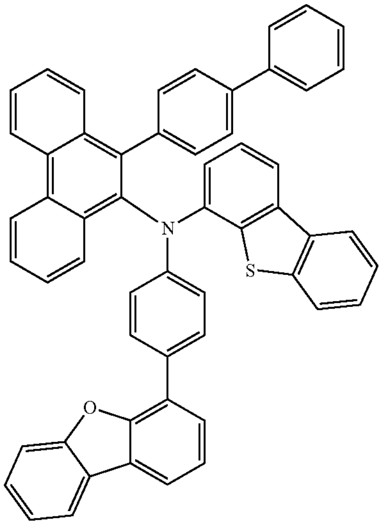
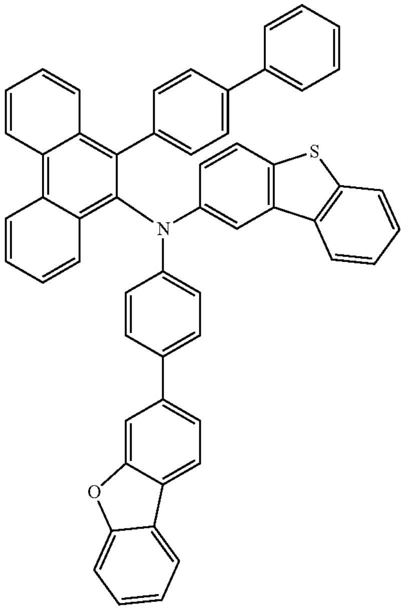
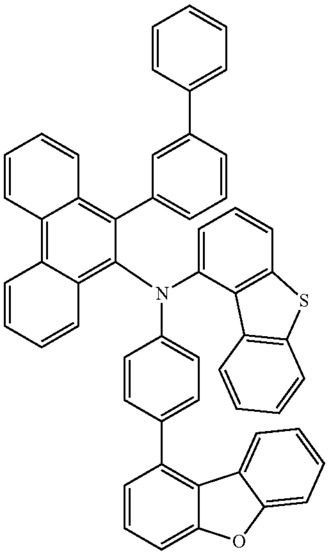
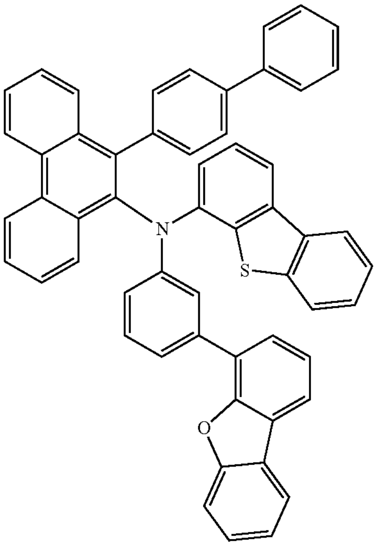
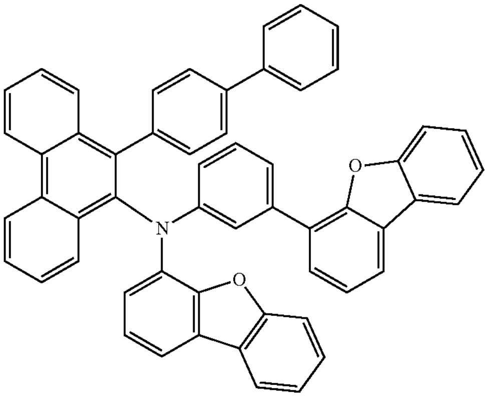

-continued
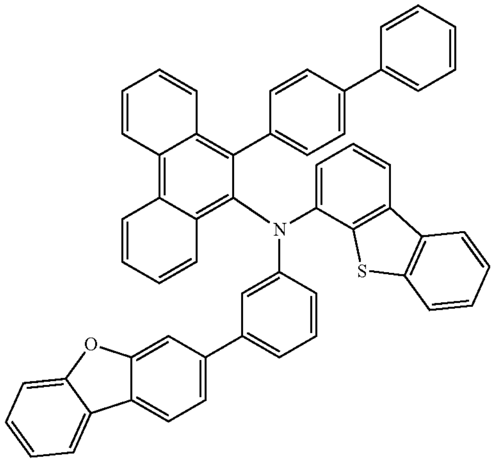
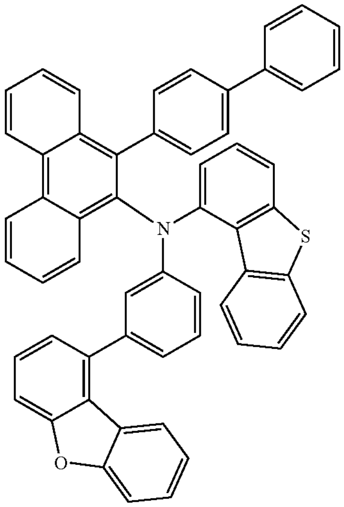
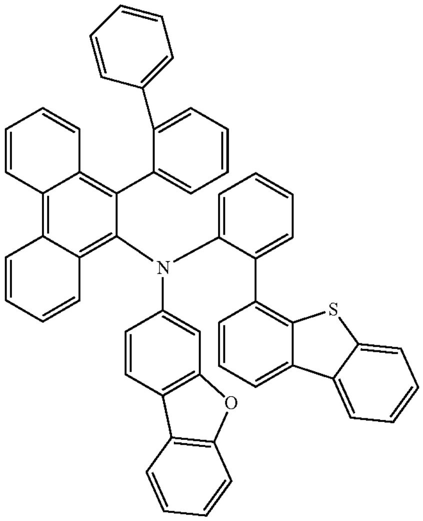
-continued
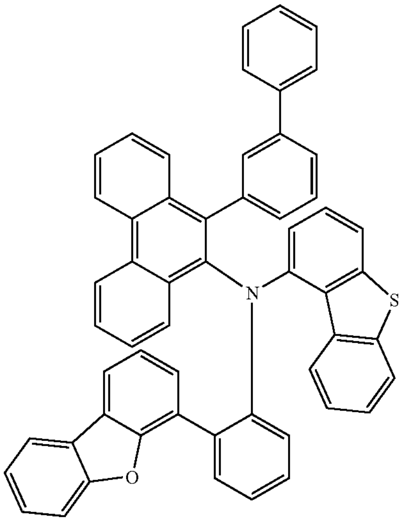
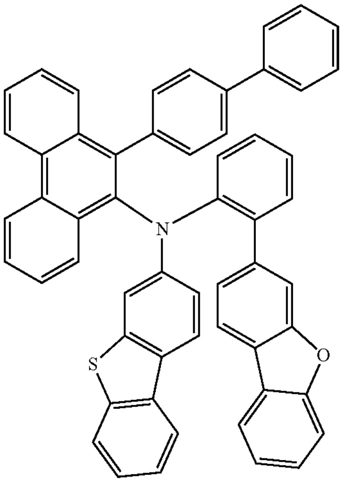
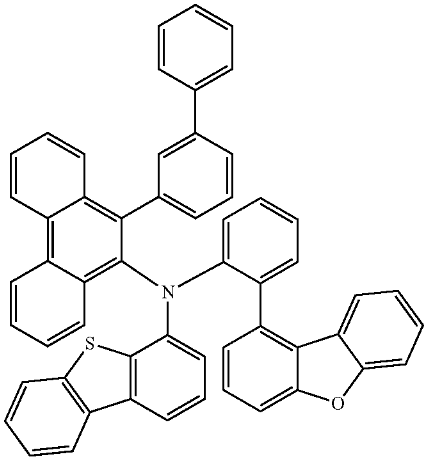

-continued
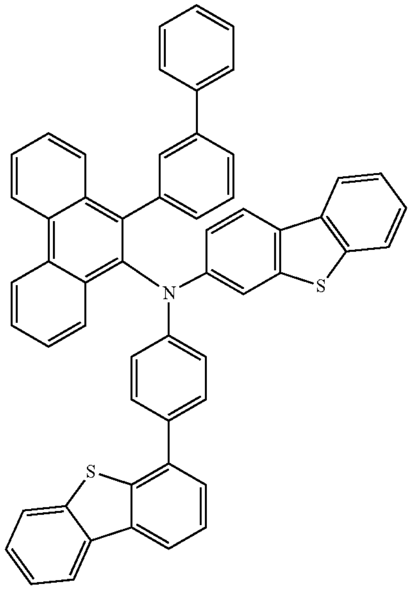
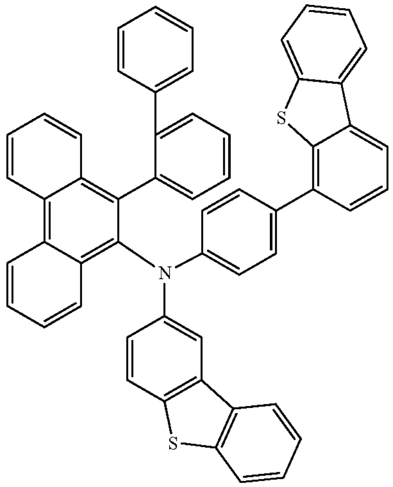
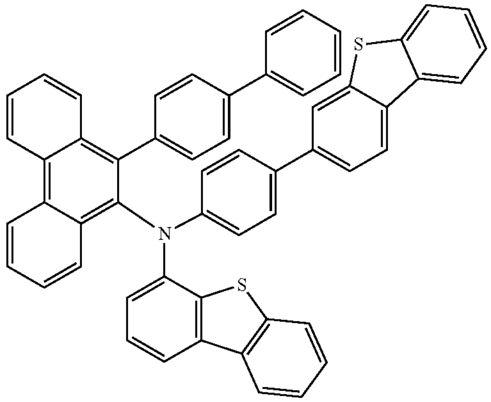
-continued
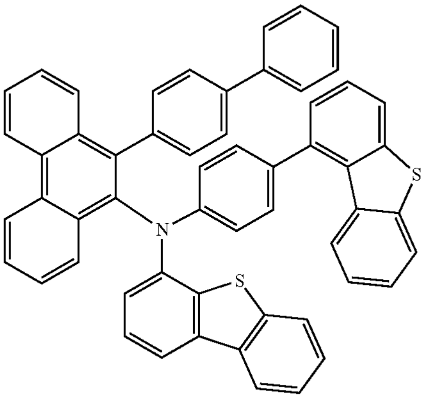
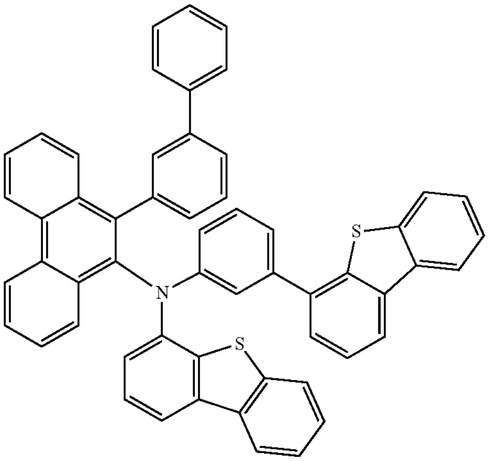
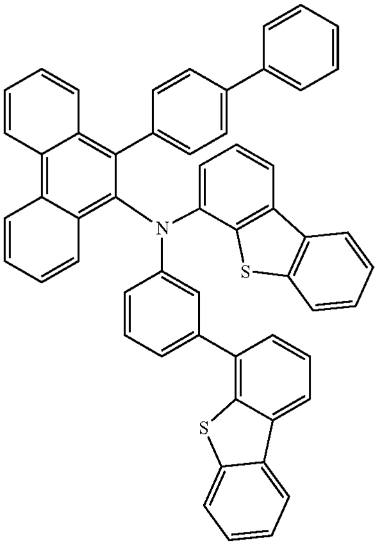

-continued
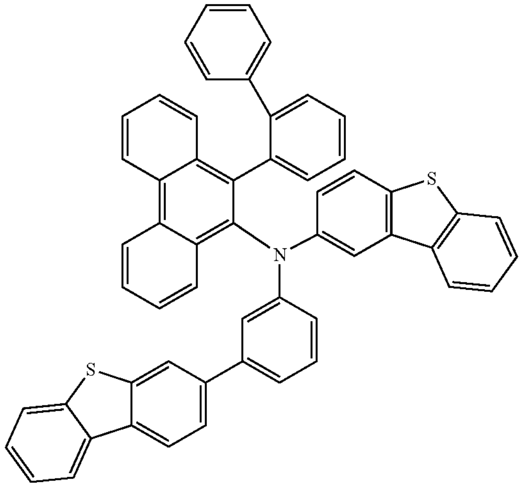
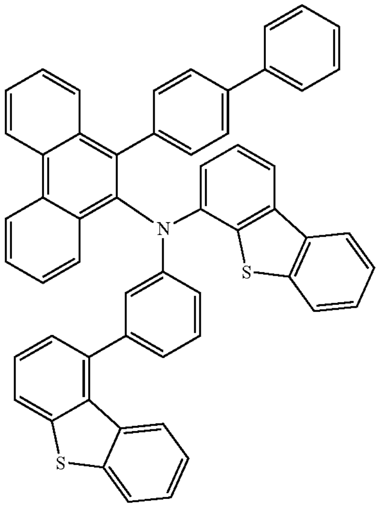
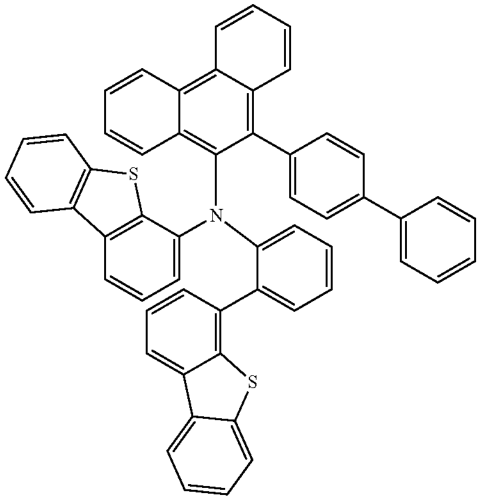
-continued
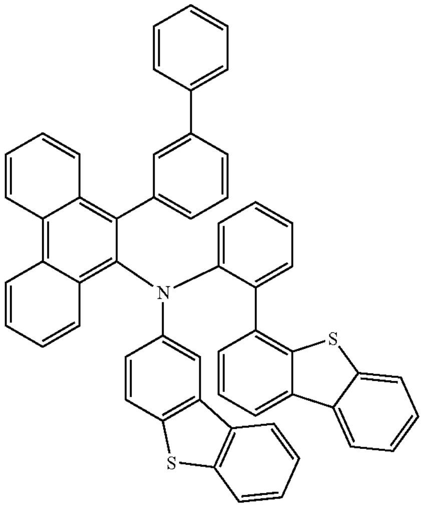
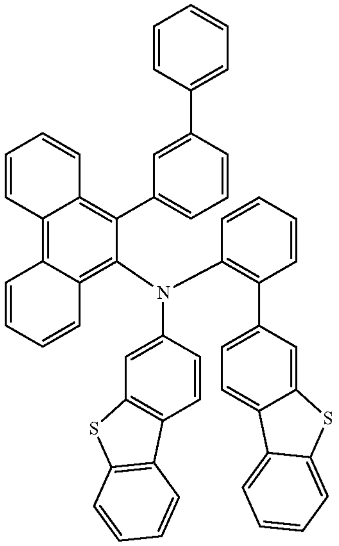
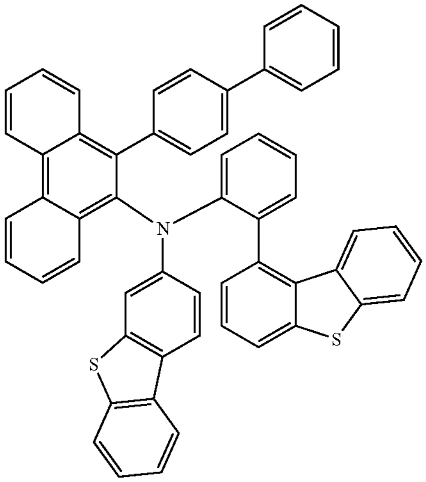 [SMILES: c1ccc(-c2ccc(-c3c(N(c4ccc5c(c4)sc4ccccc45)c4ccccc4-c4cccc5sc6ccccc6c45)c4ccccc4c4ccccc34)cc2)cc1]

-continued
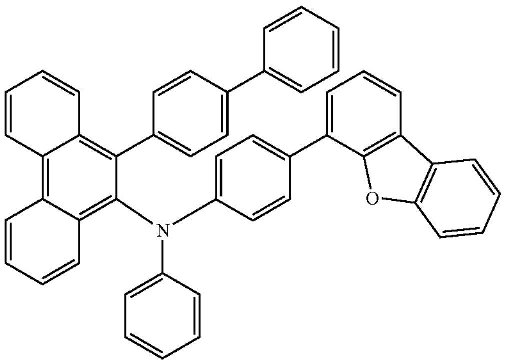
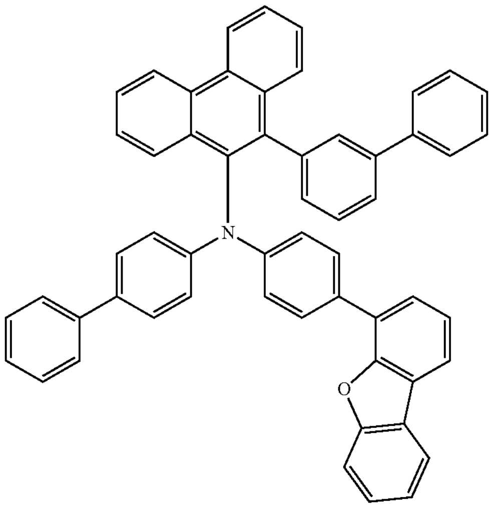
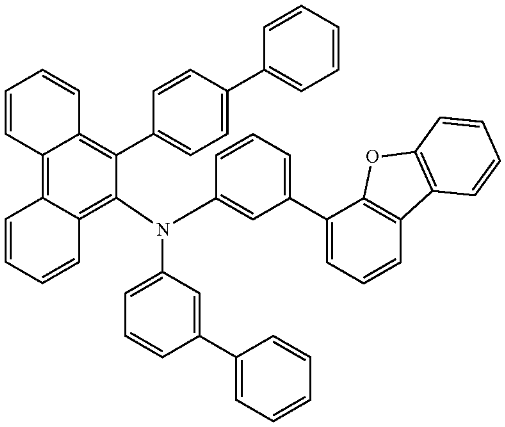
-continued
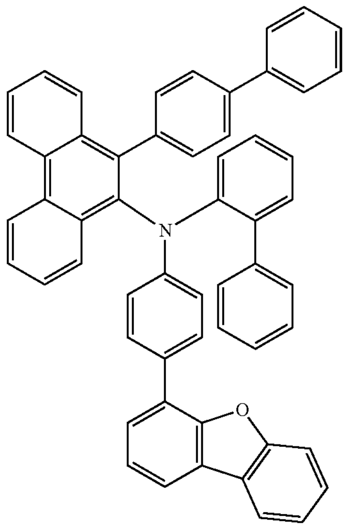
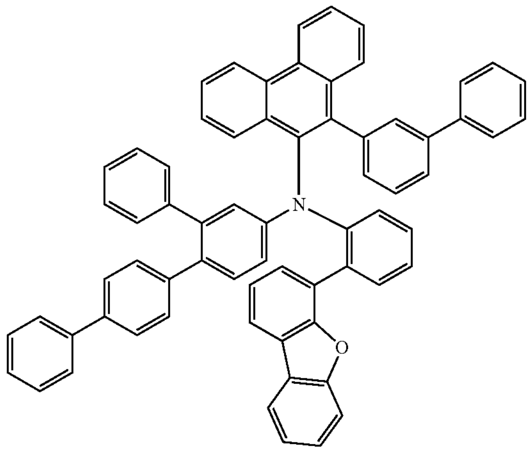
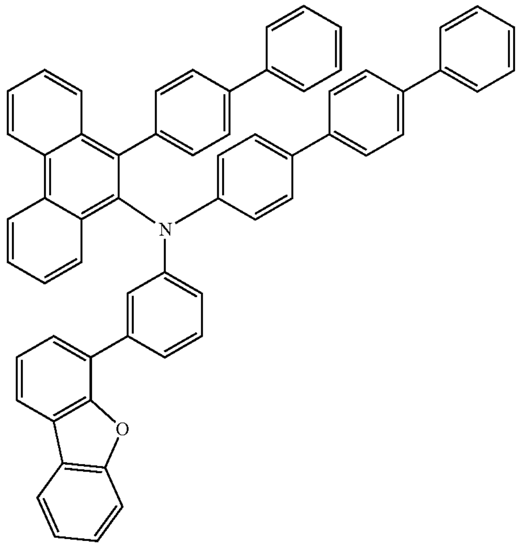

-continued
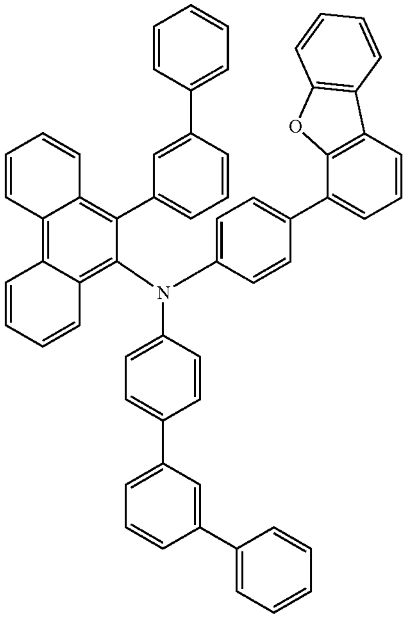
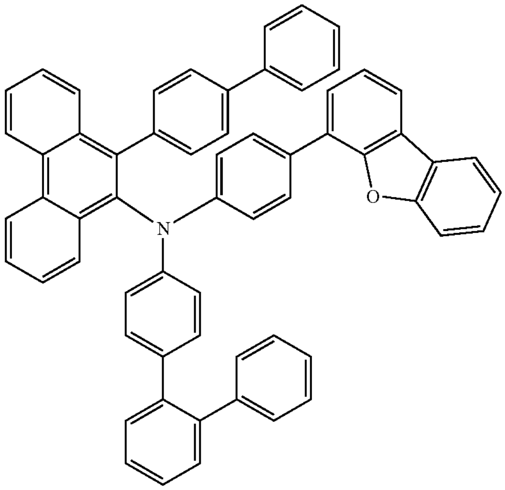
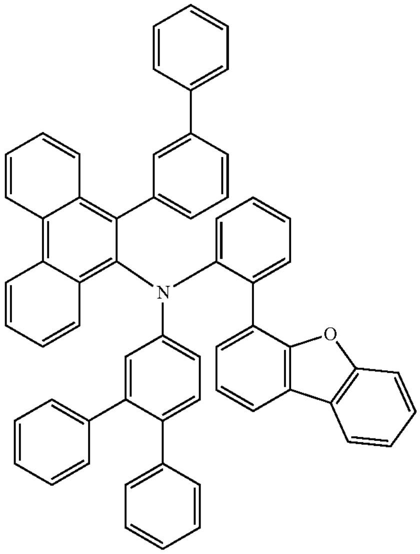
-continued
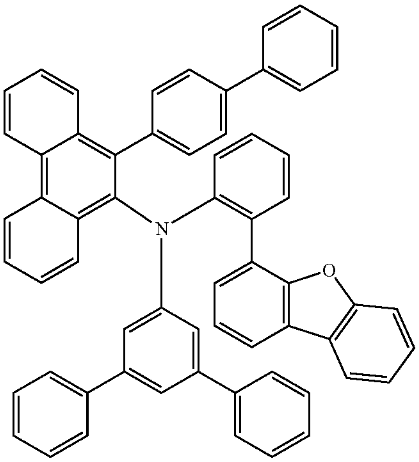
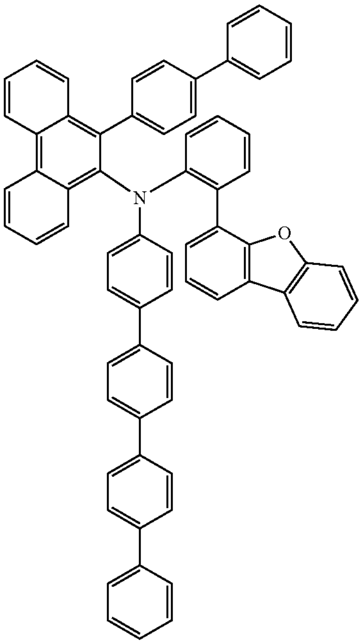

-continued
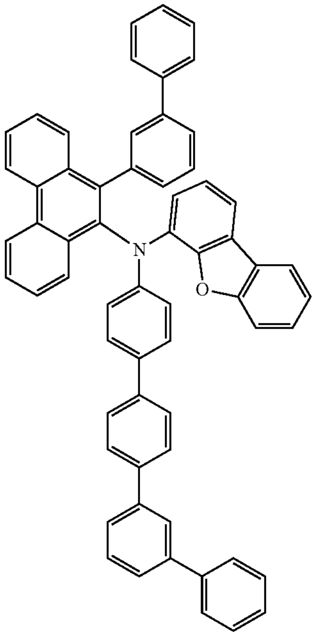
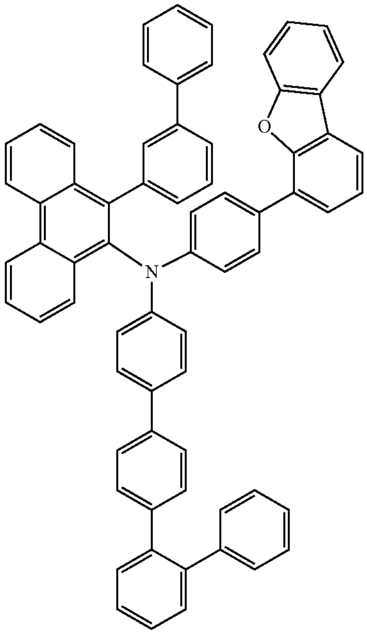
-continued
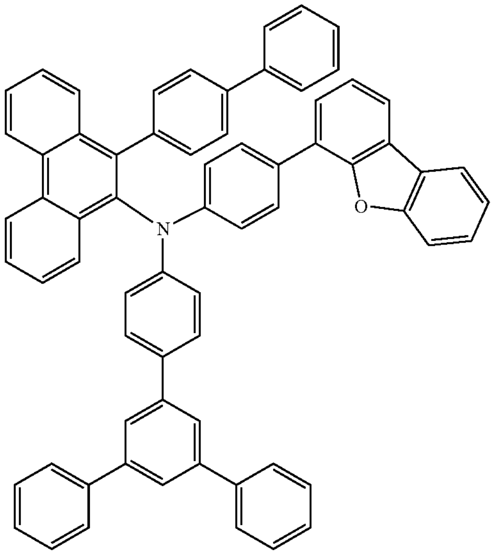
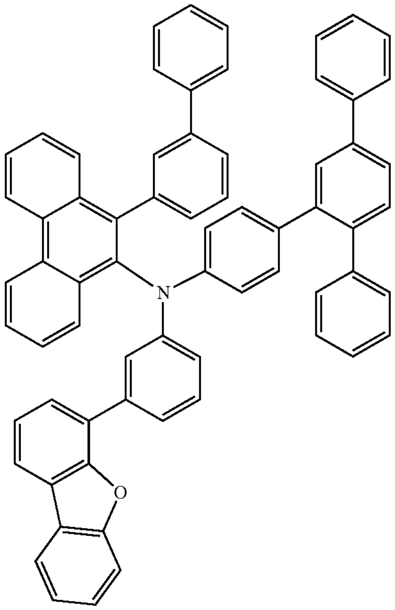
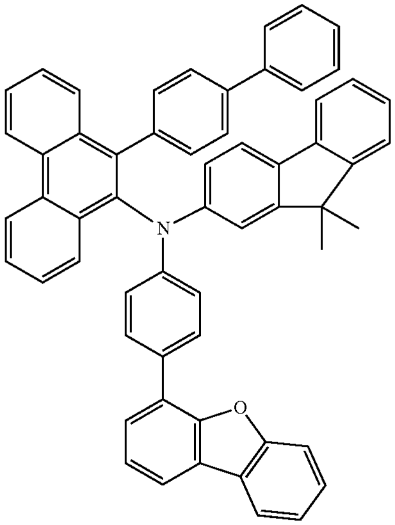

-continued
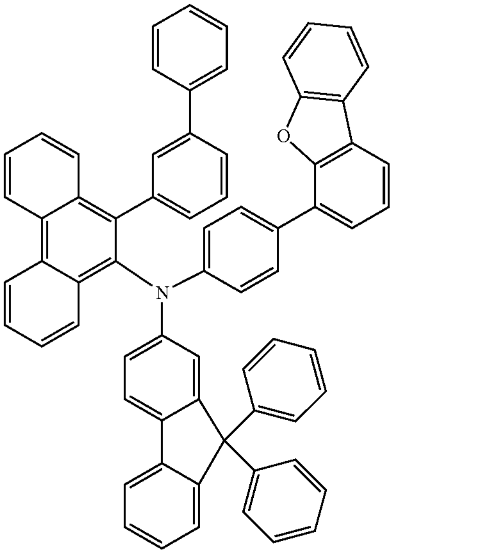
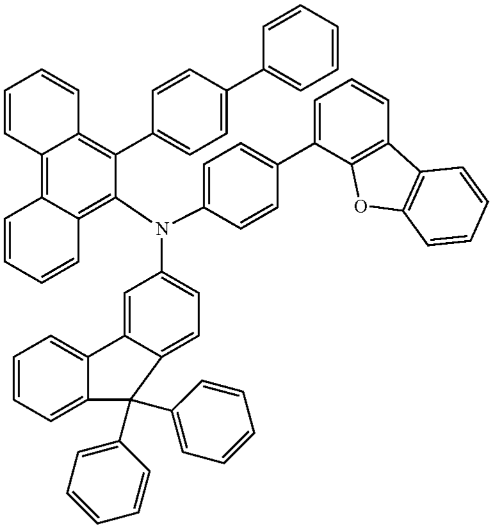
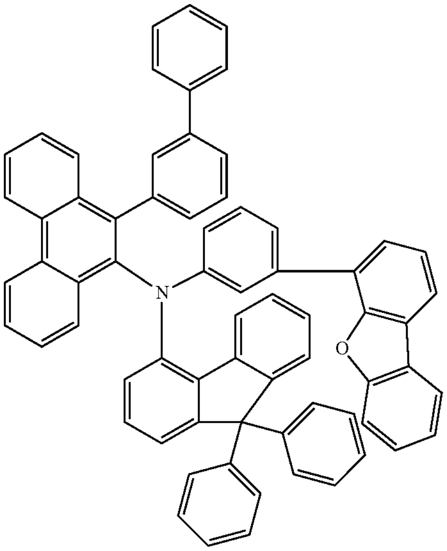
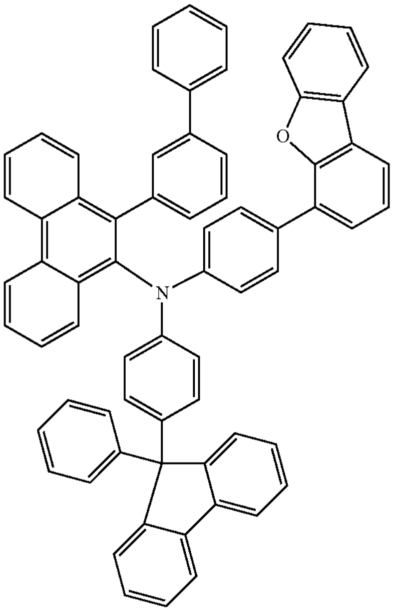
-continued
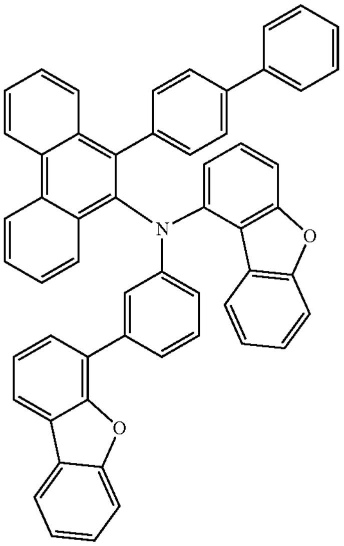

-continued
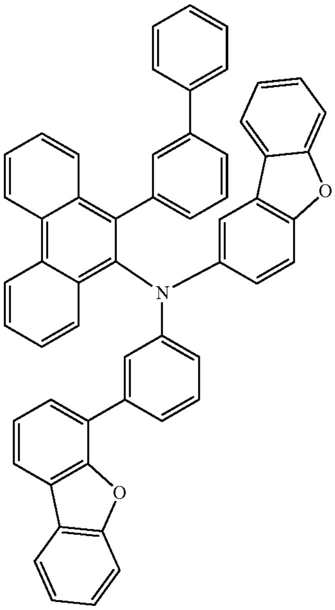
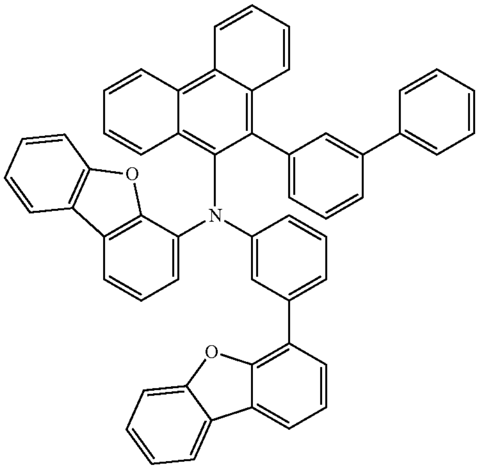
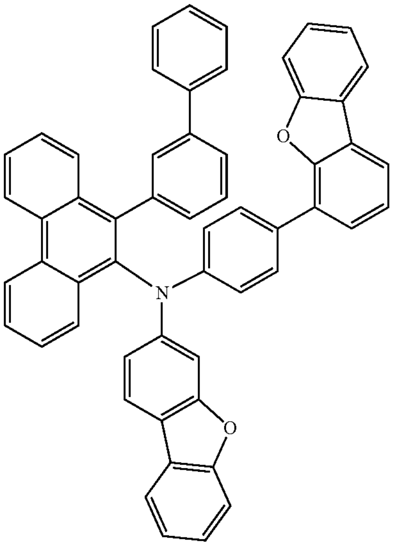
-continued
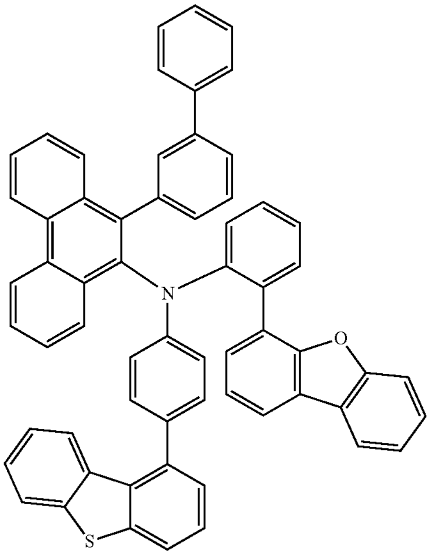
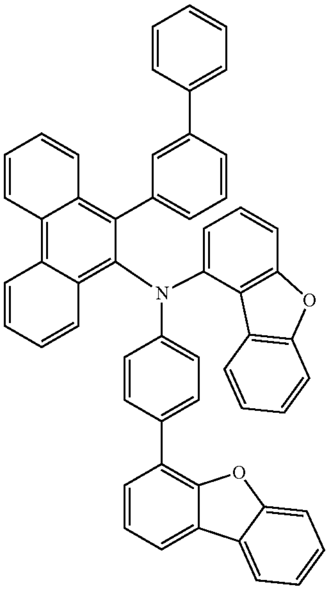
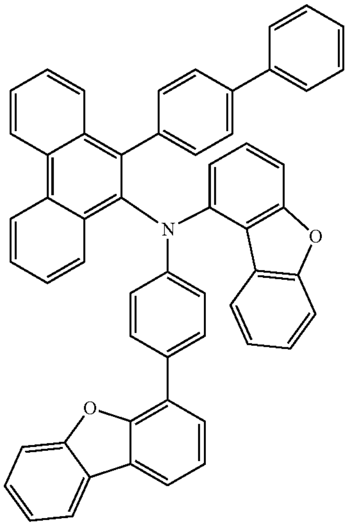

-continued
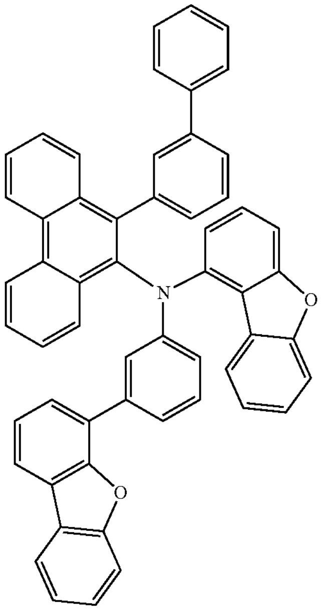
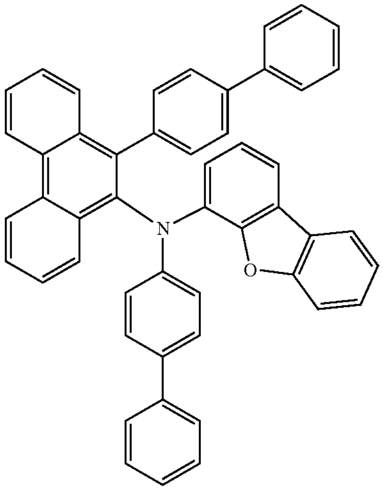
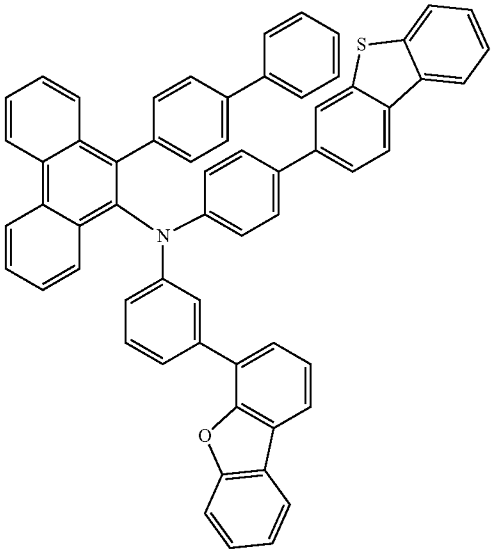
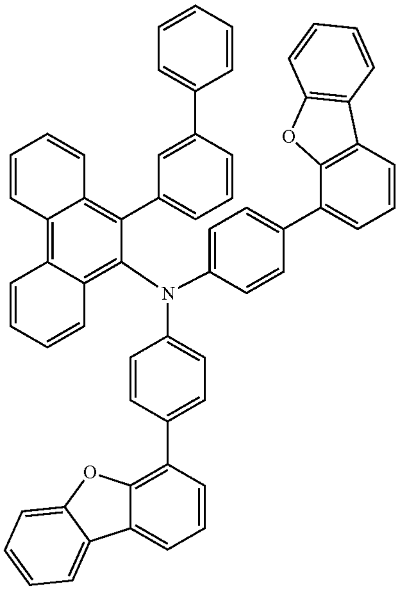
-continued
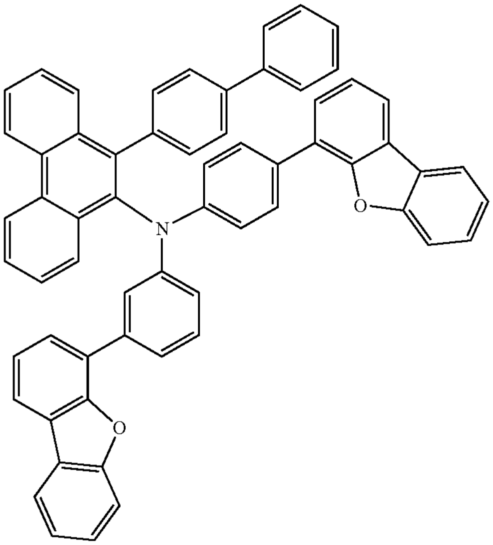

-continued
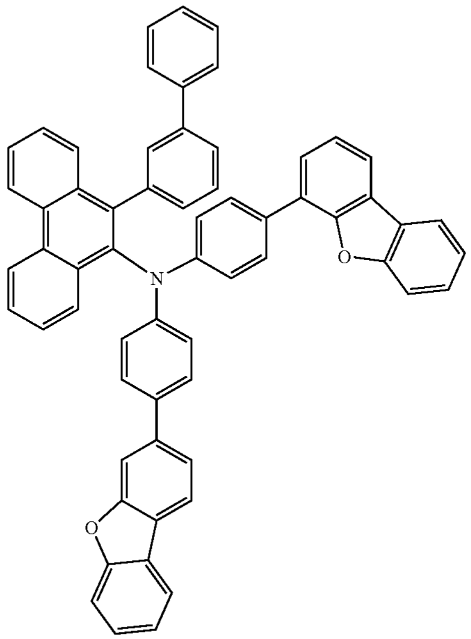
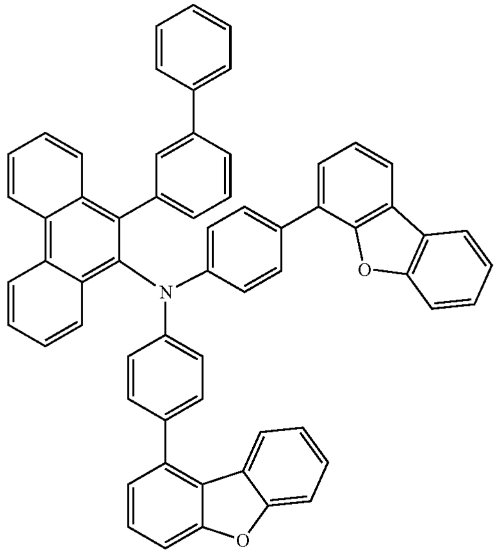
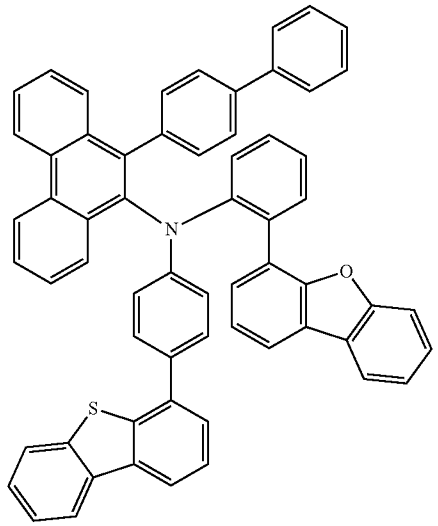
-continued
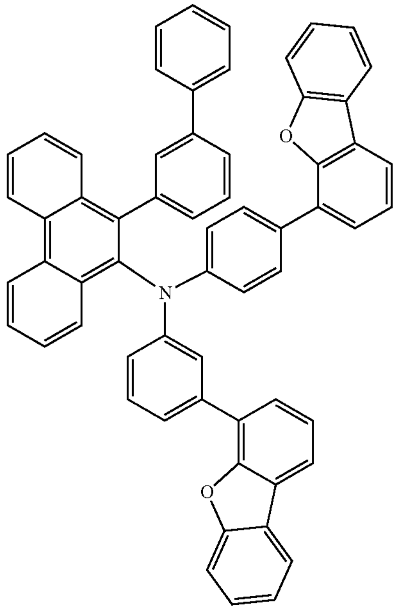
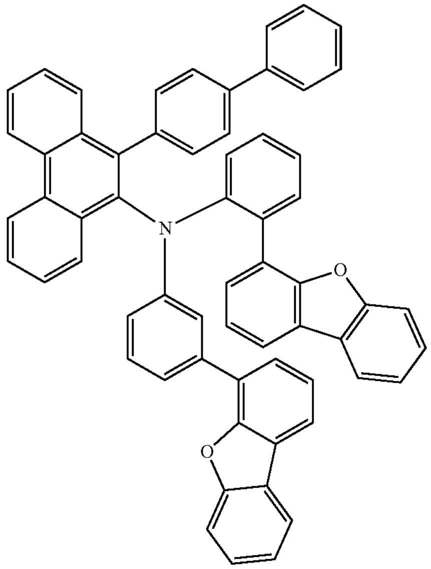
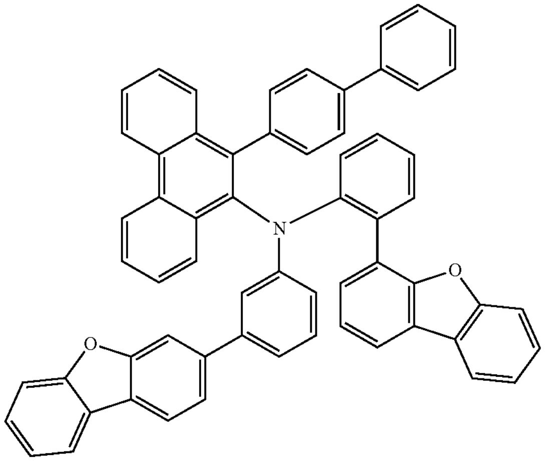

-continued
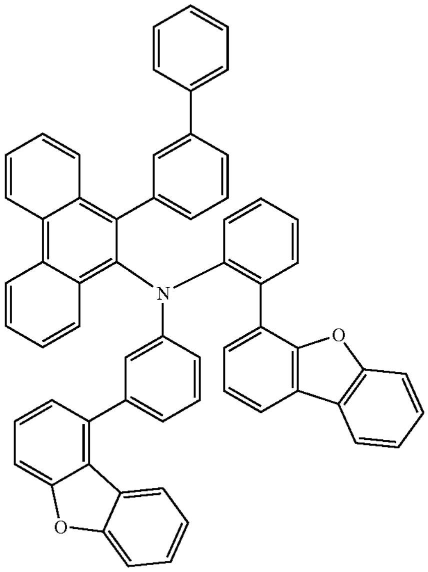
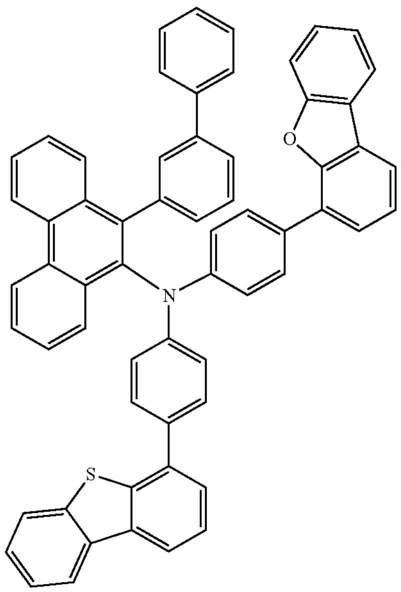
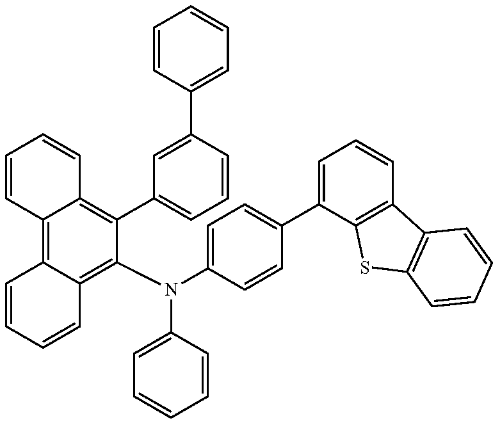
-continued
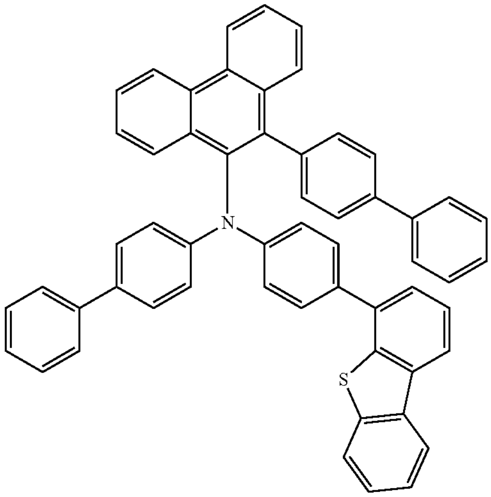
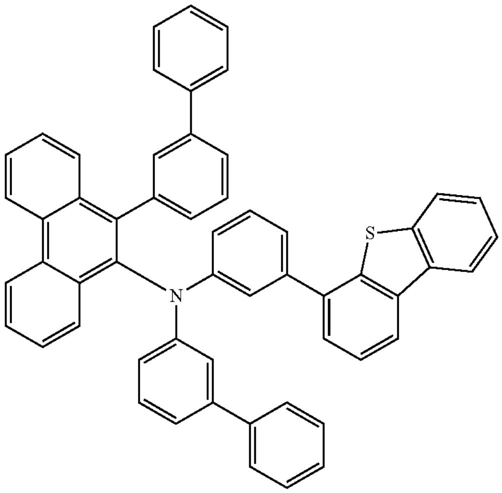
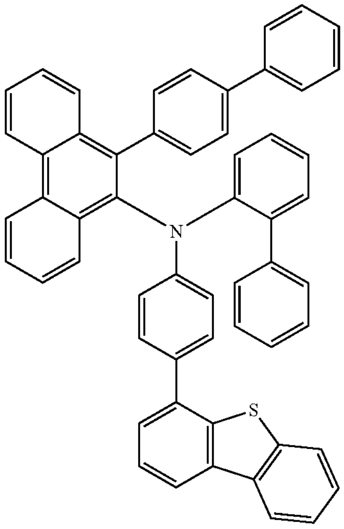

-continued
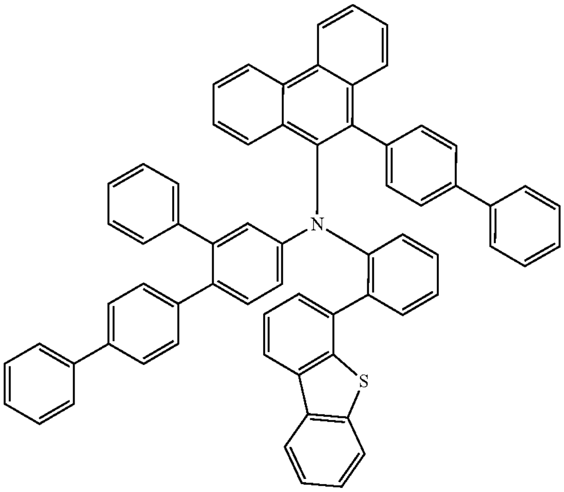
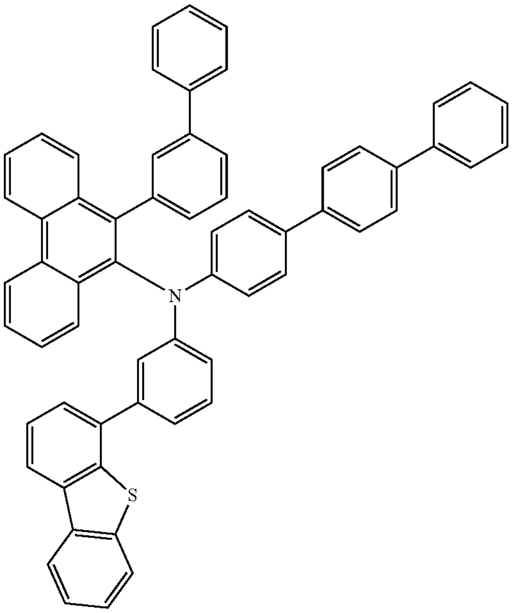
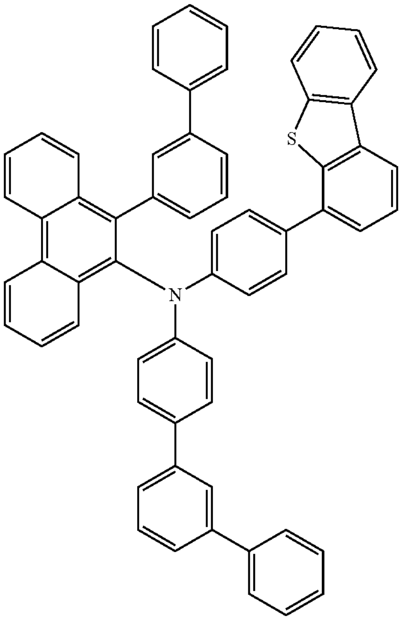
-continued
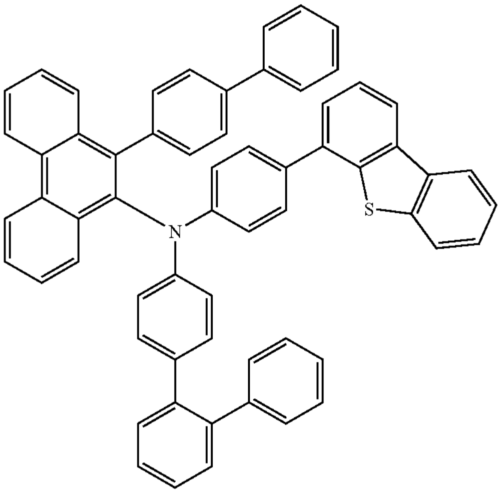
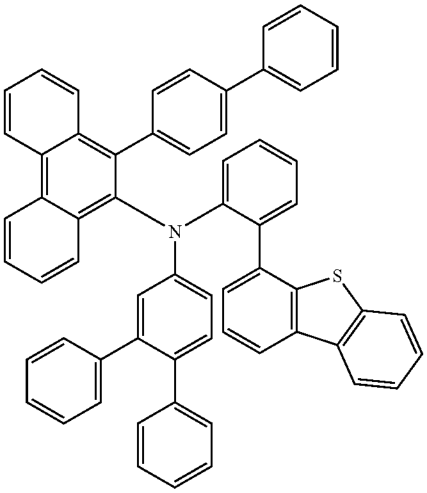
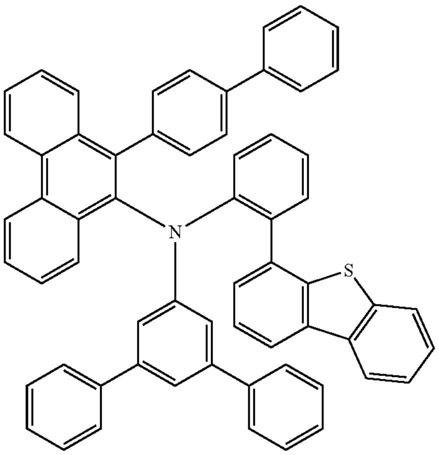

-continued
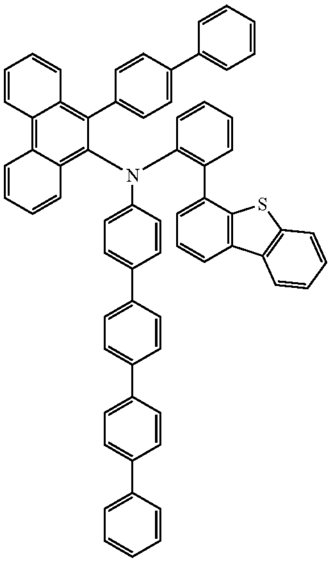
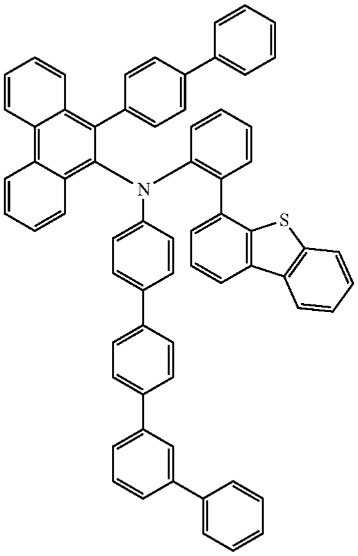
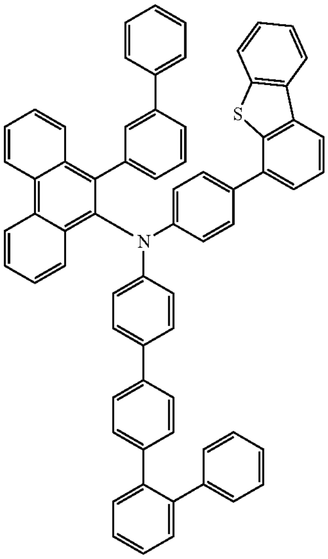
-continued
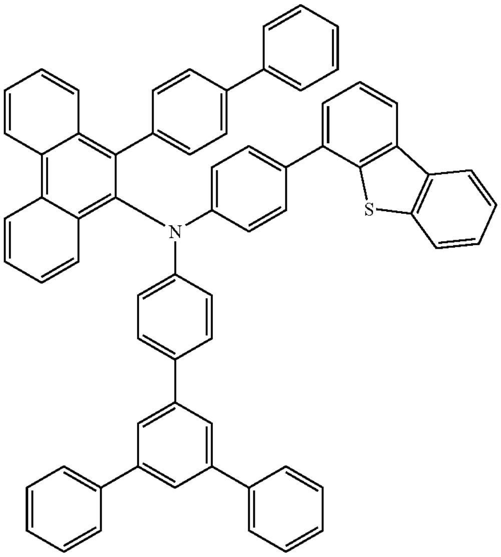
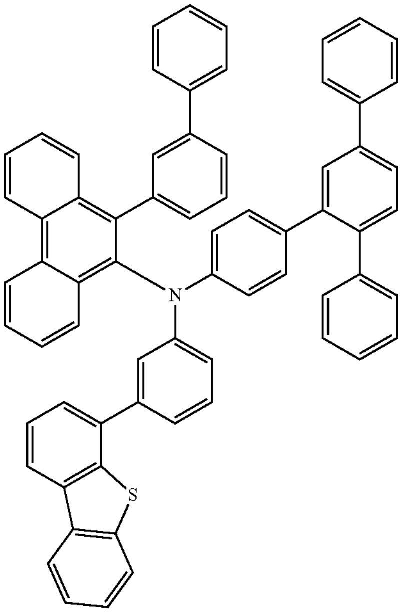

-continued
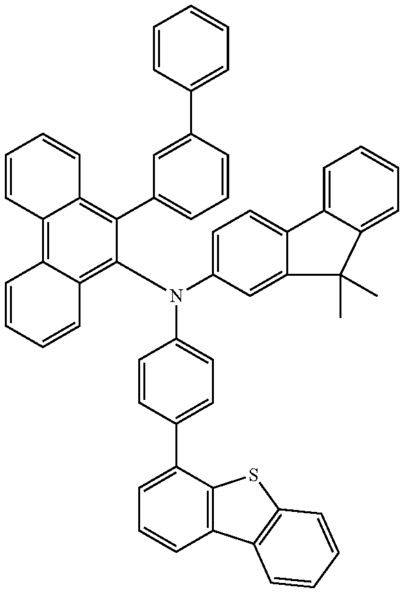
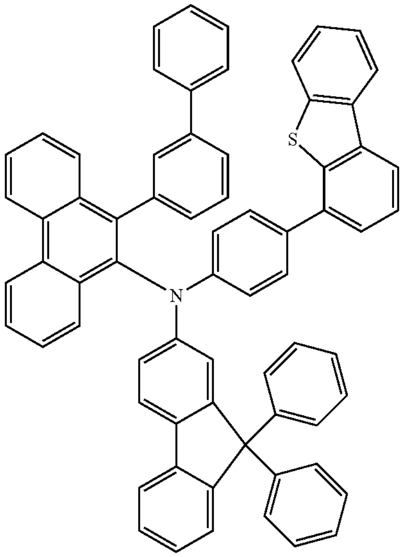
-continued
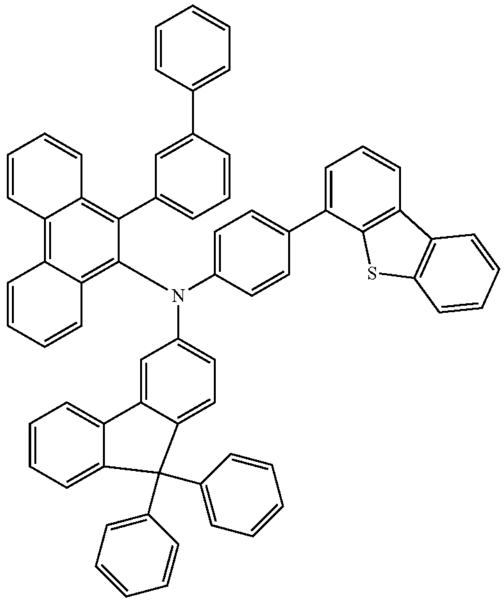
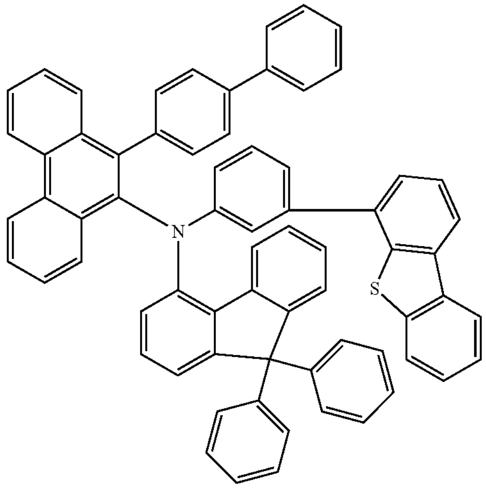
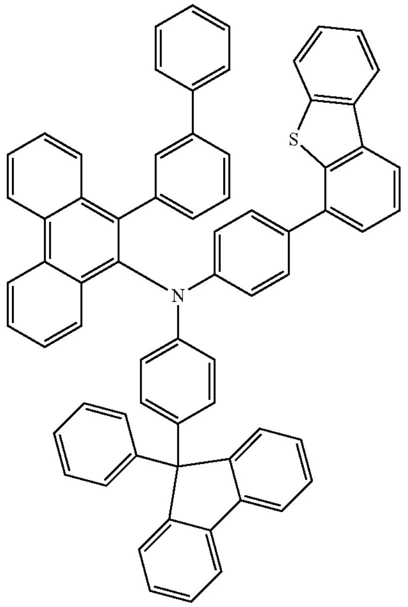

-continued
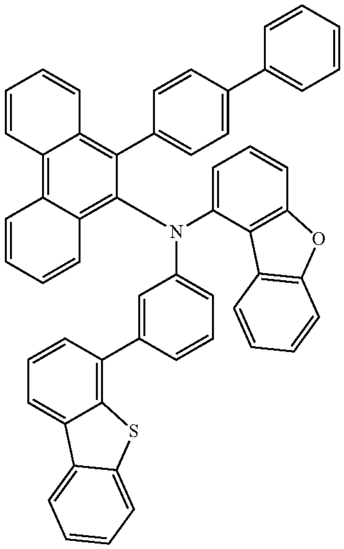
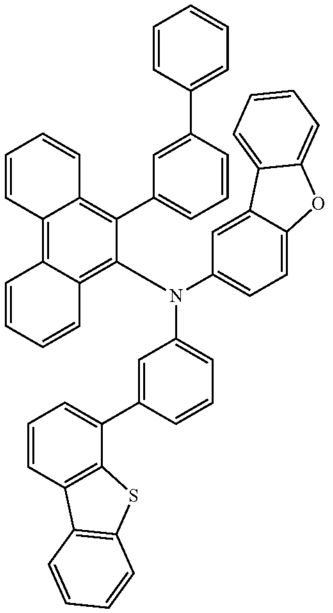
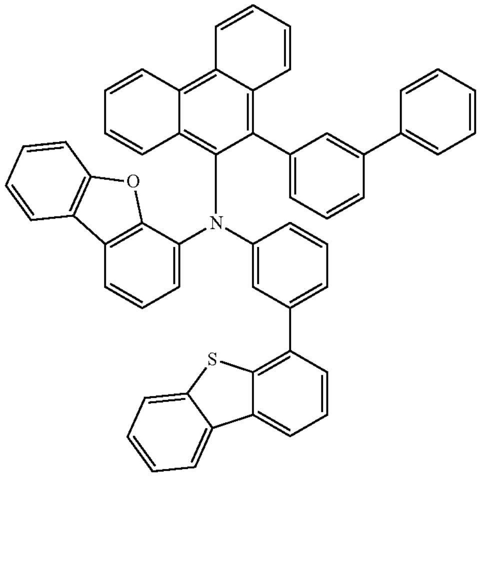
-continued
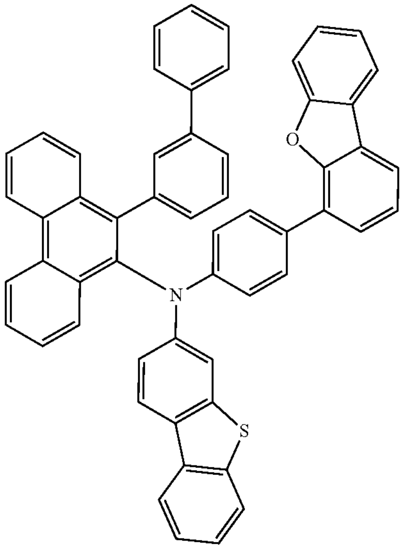
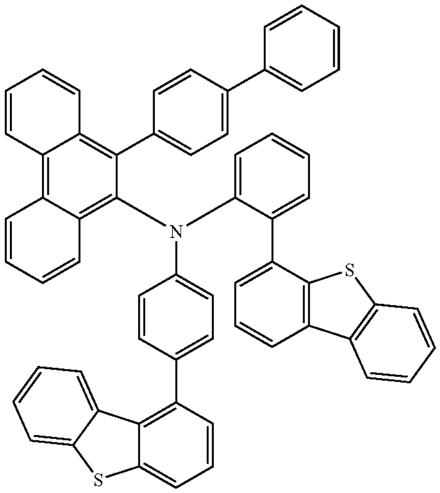
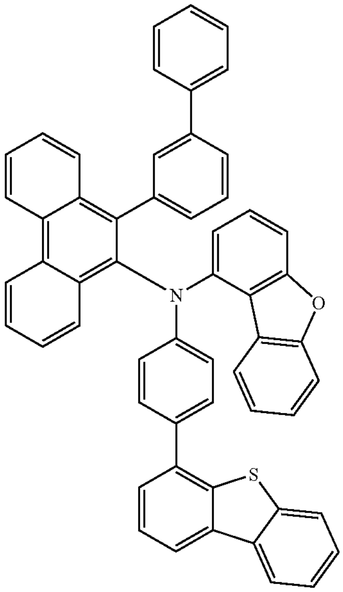

-continued
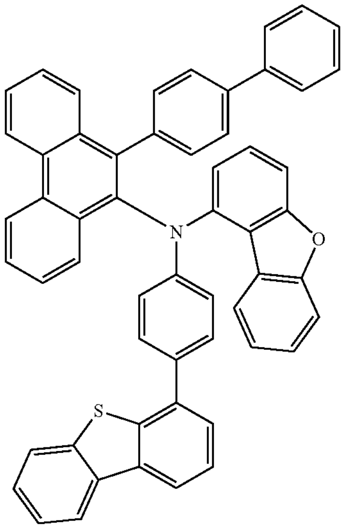
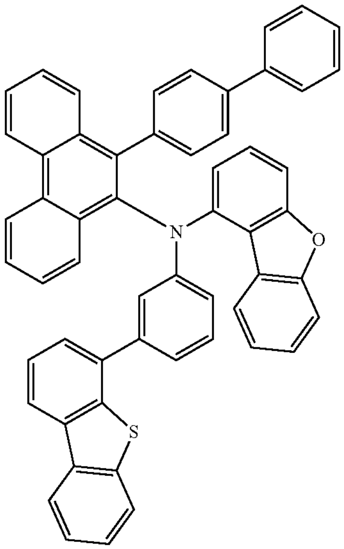
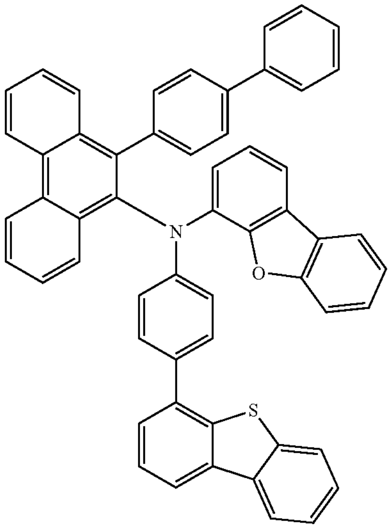
-continued
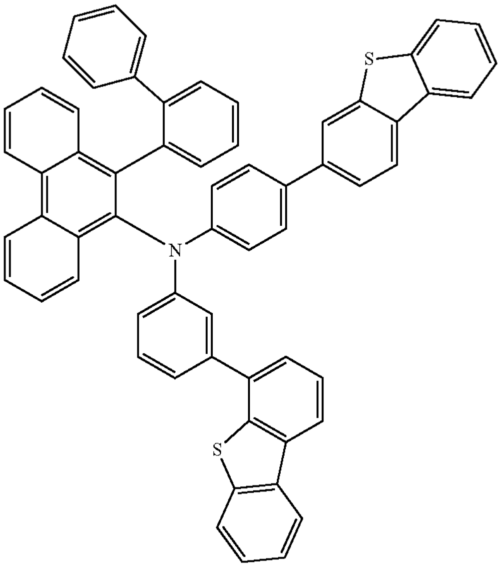
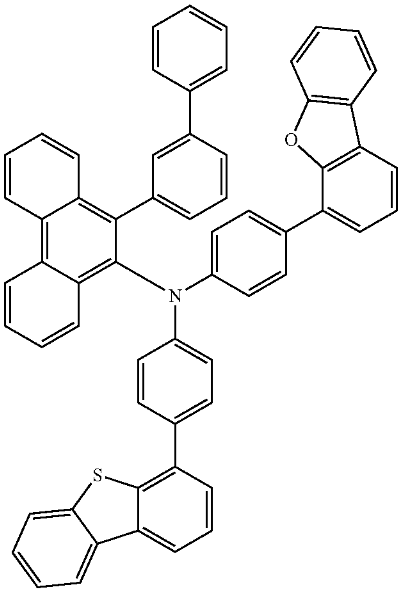
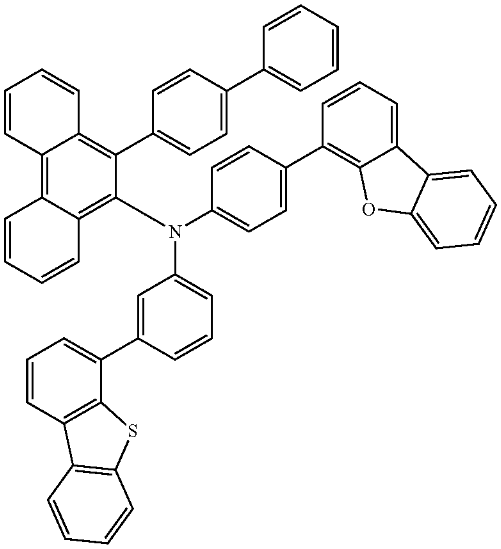

-continued
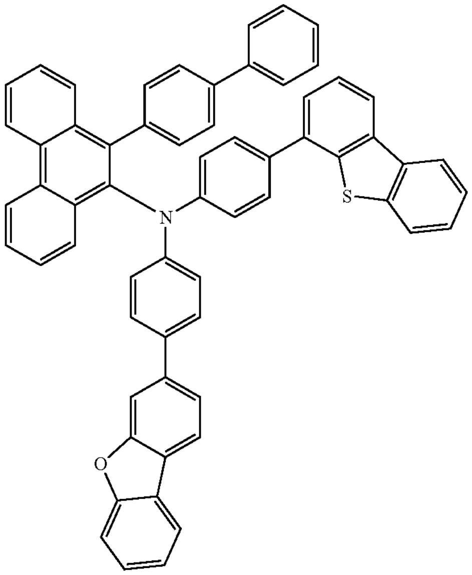
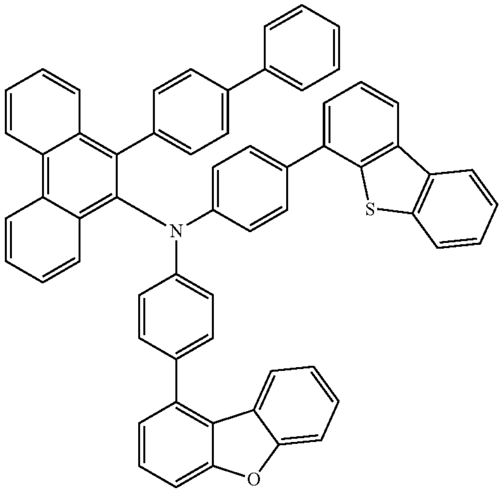
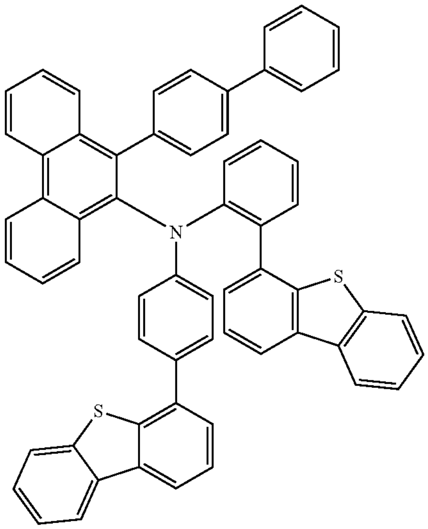
-continued
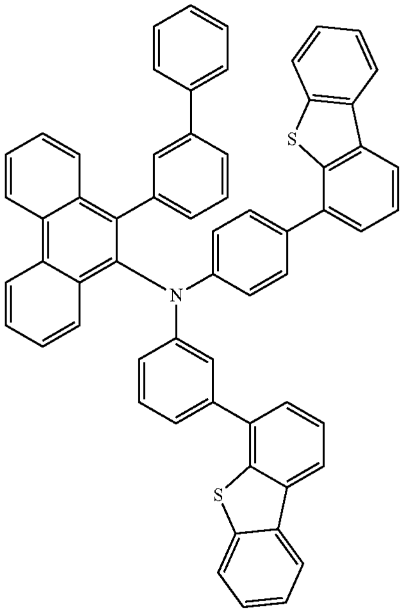
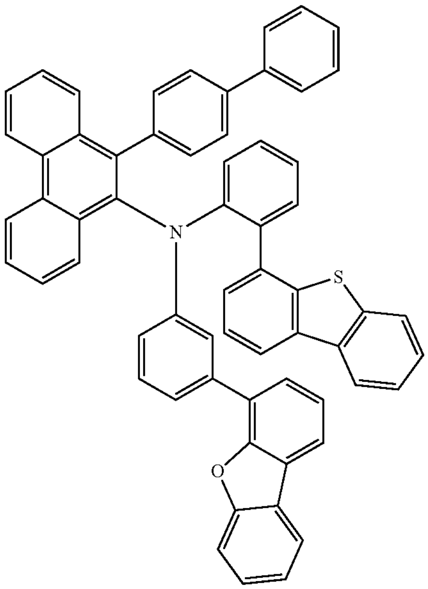
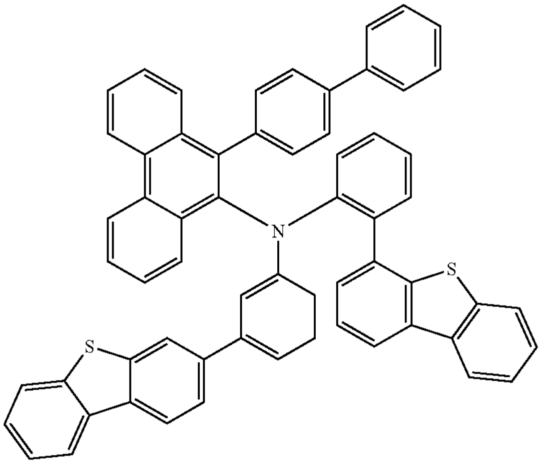

-continued
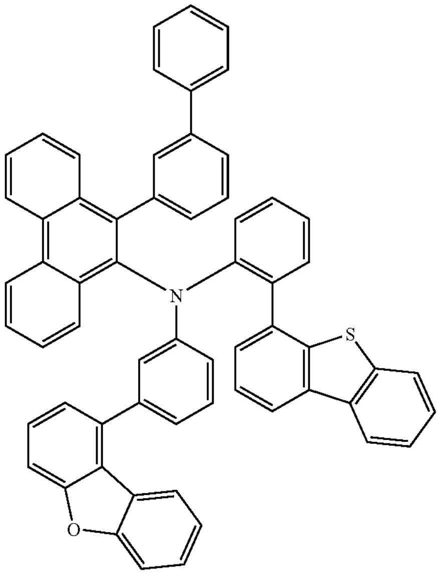
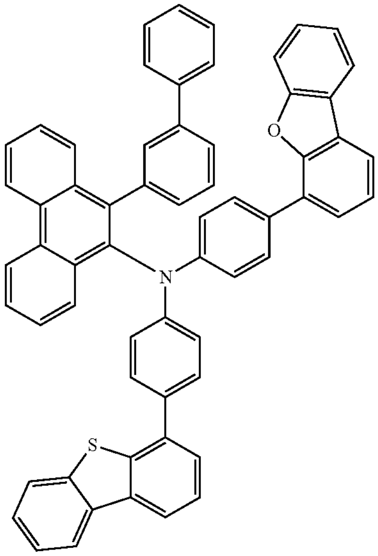
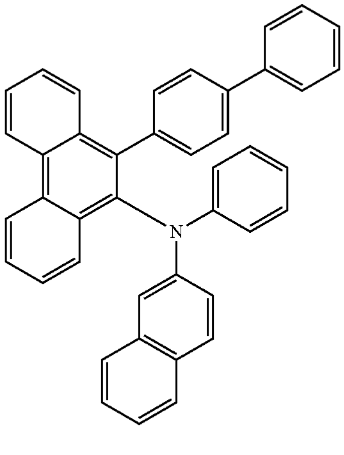
-continued
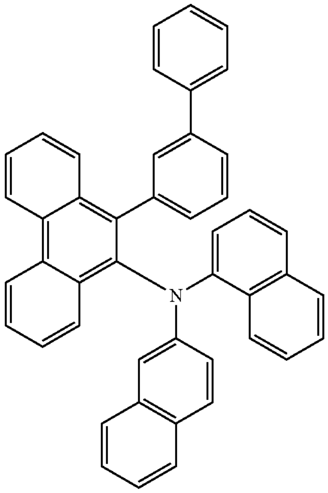
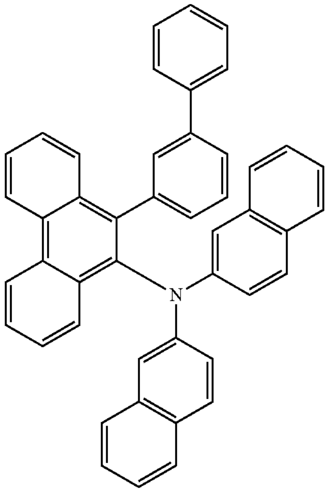
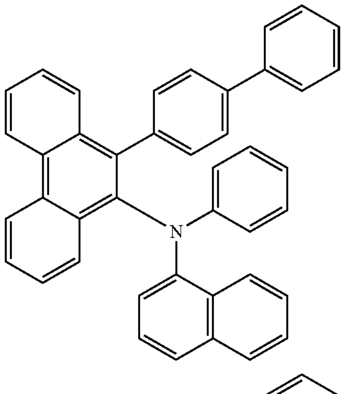
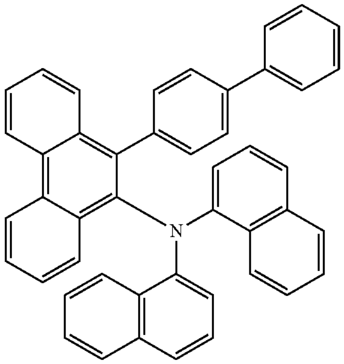

-continued
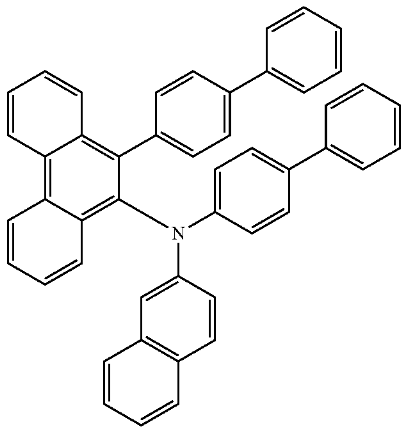
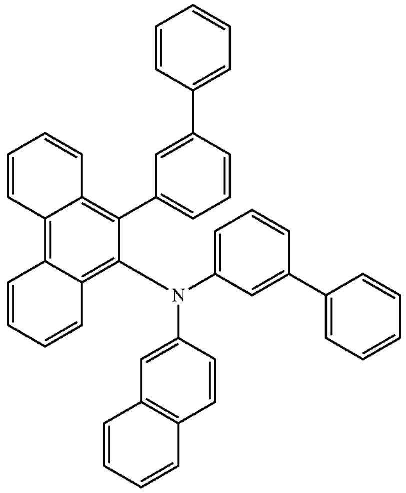
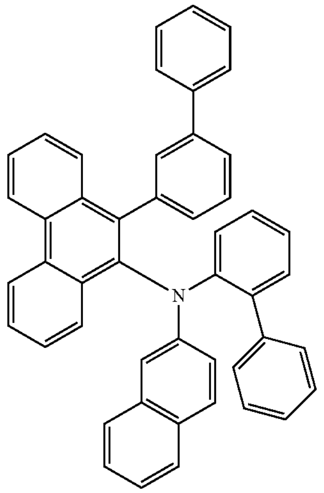
-continued
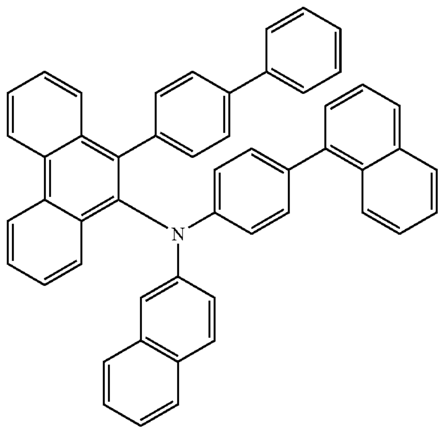
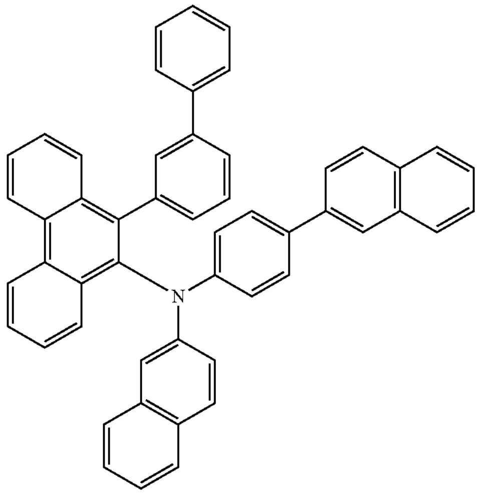
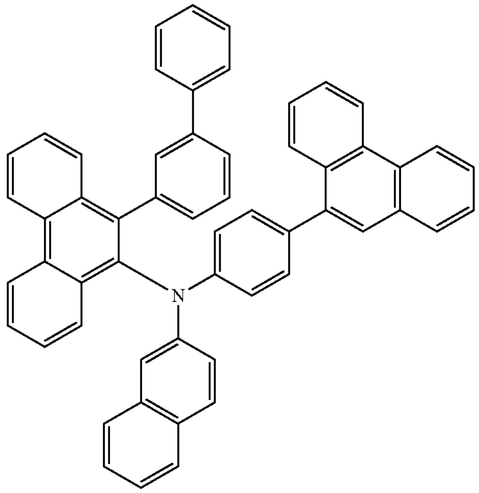

-continued
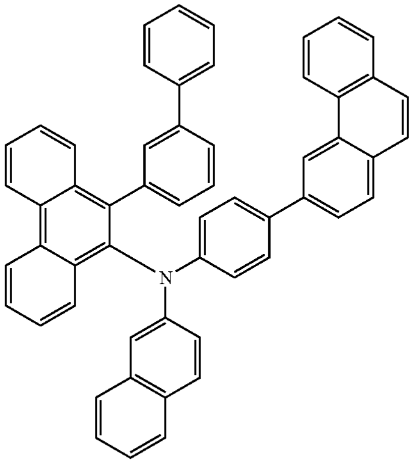
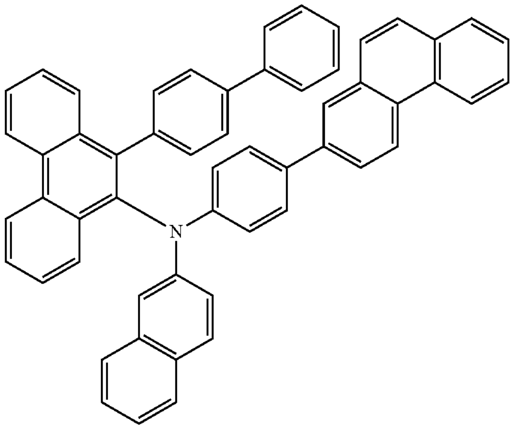
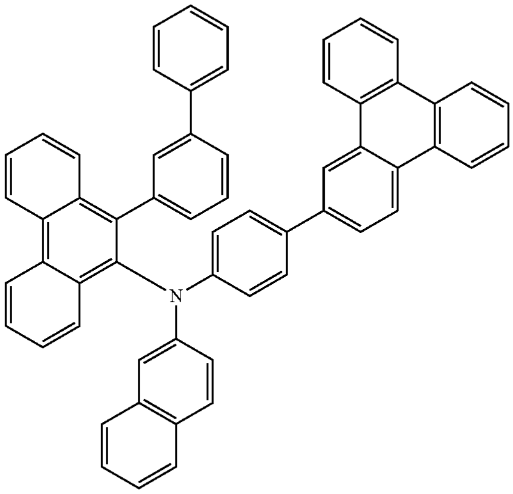
-continued
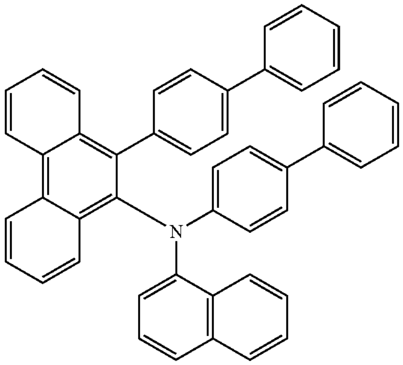
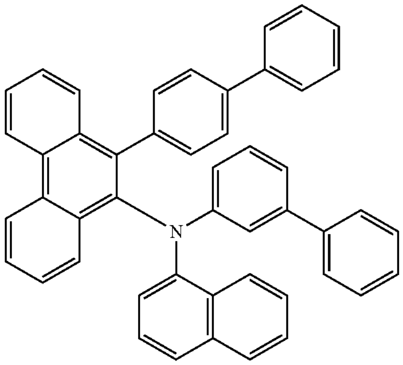
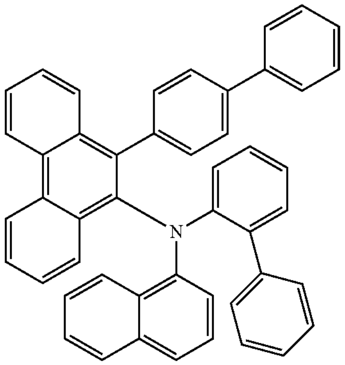
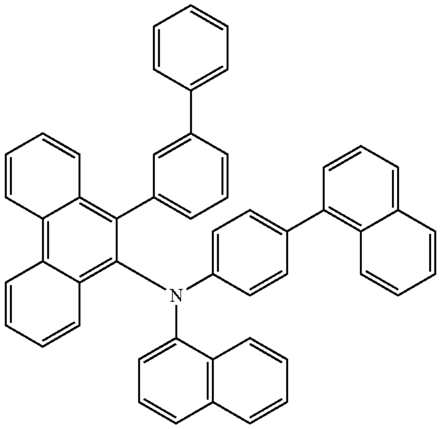

-continued
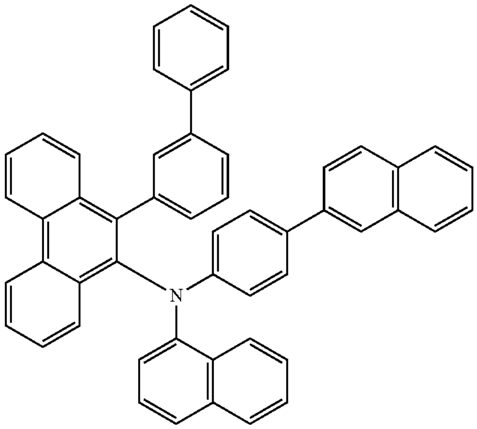
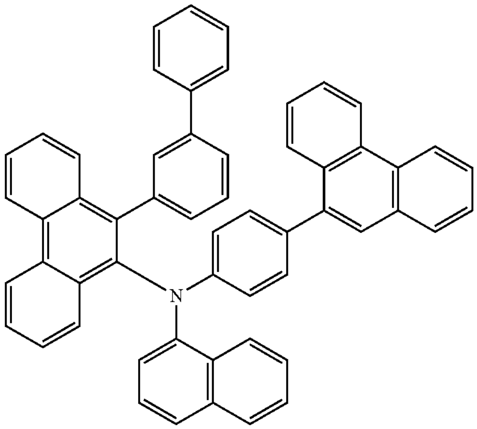
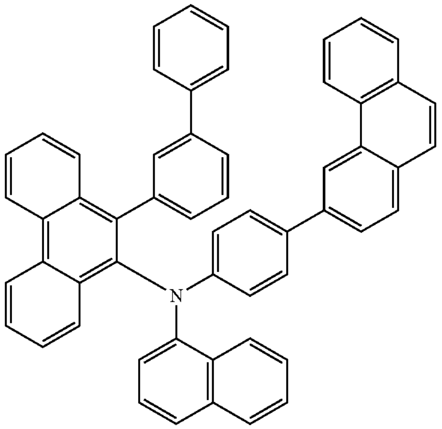
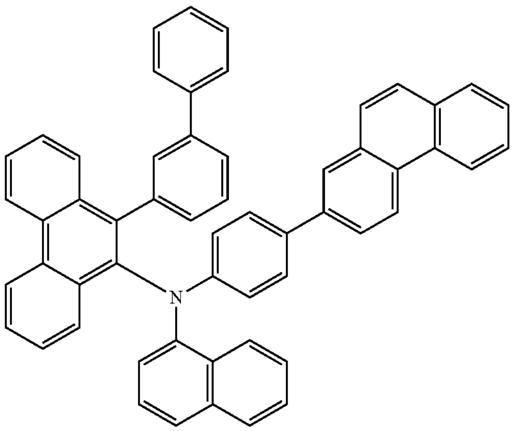
-continued
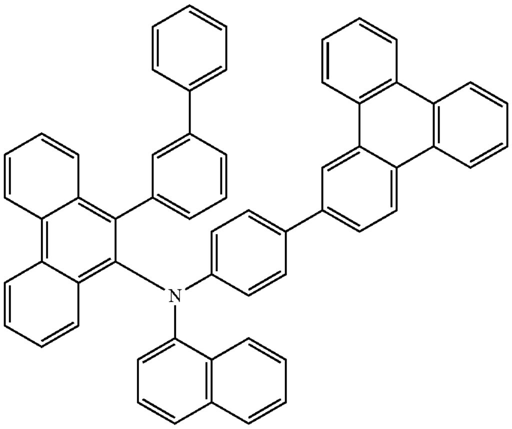
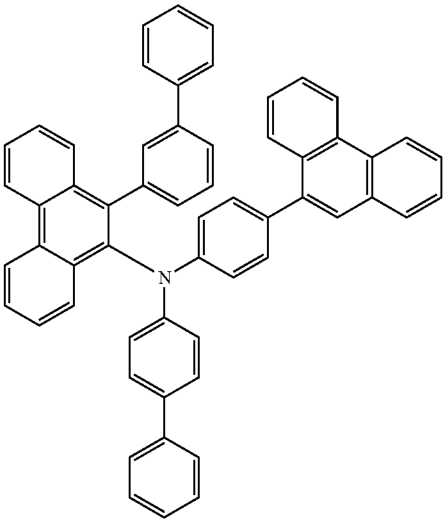
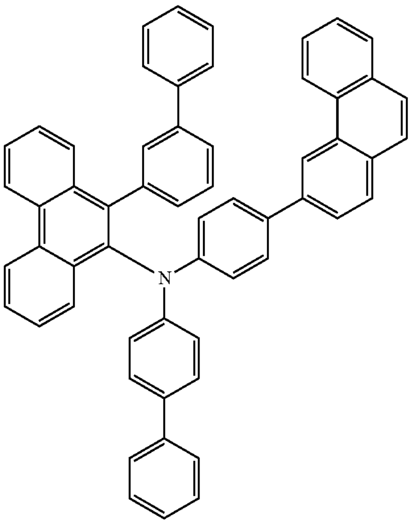

-continued
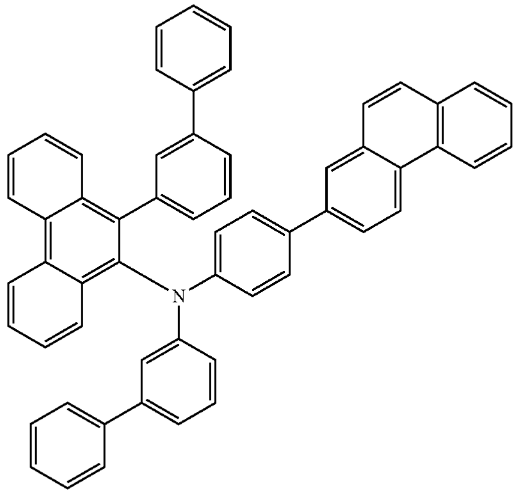
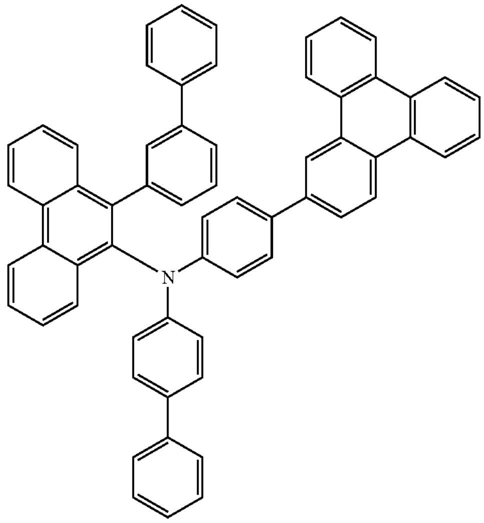
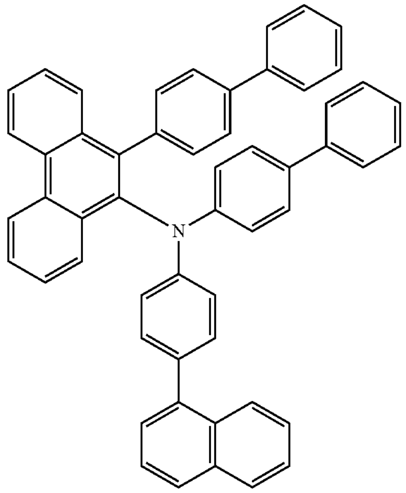
-continued
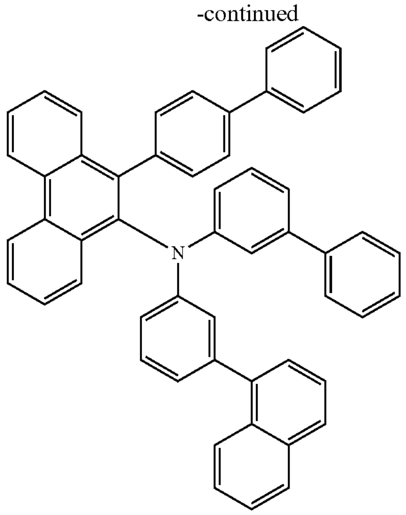
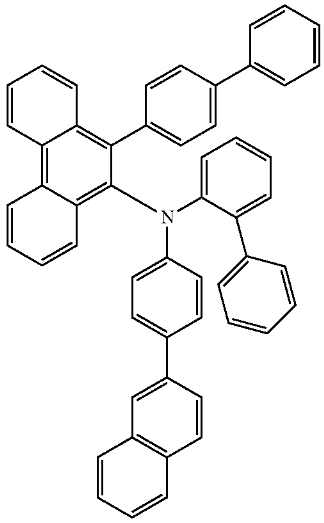
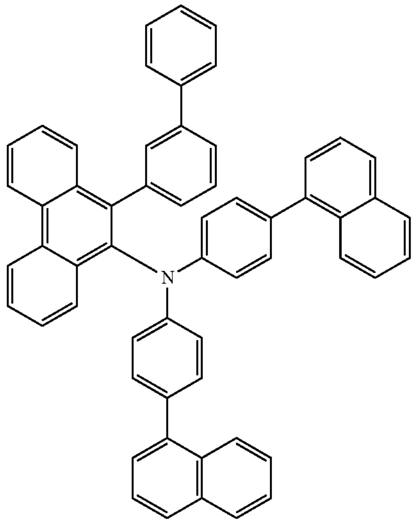

-continued
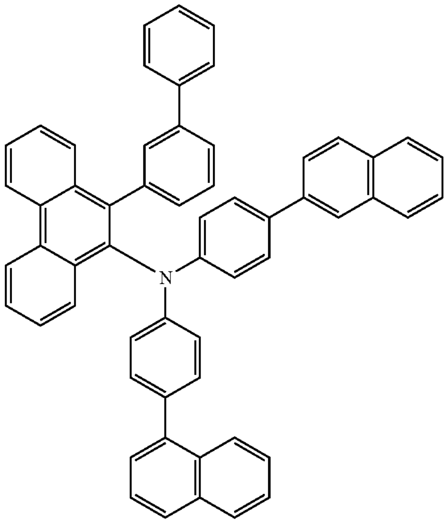
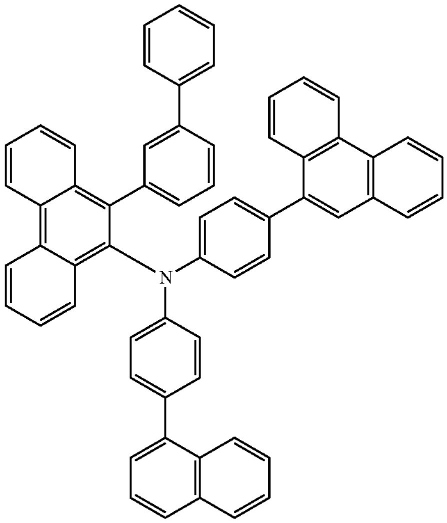
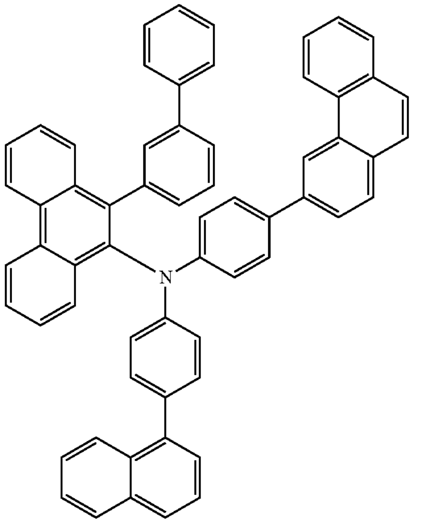
-continued
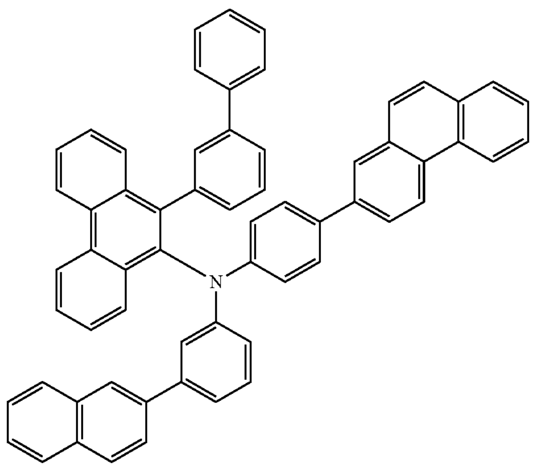
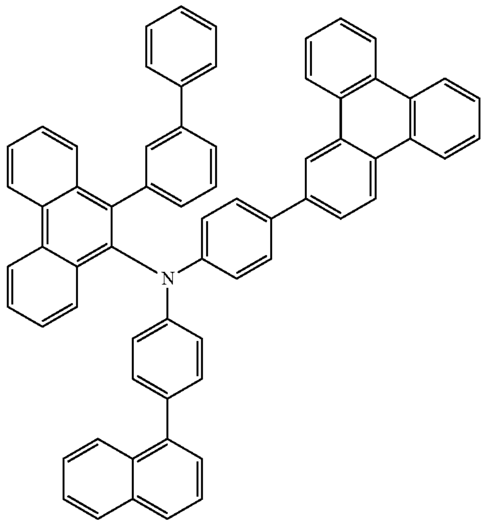
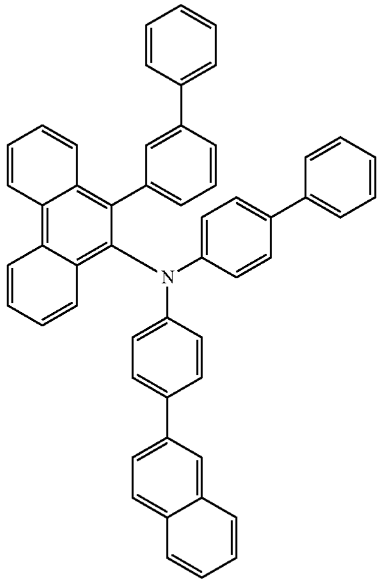

-continued
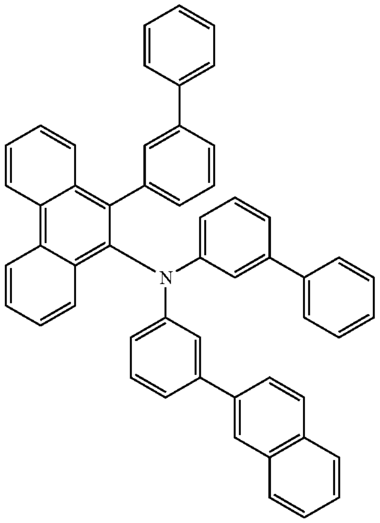
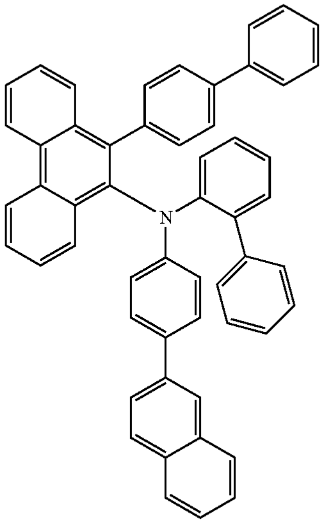
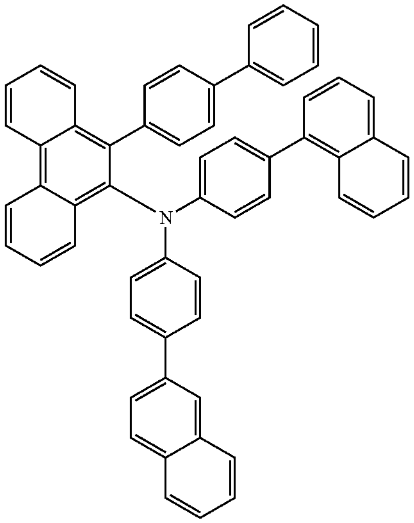
-continued
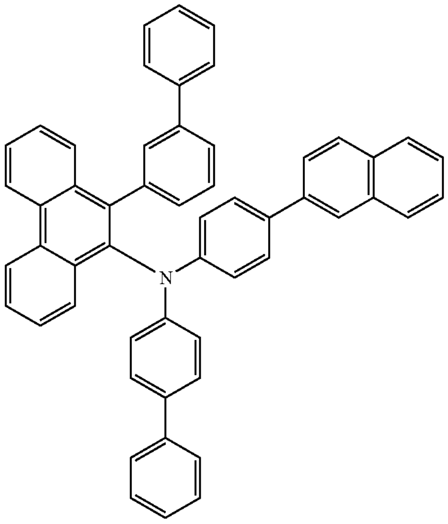
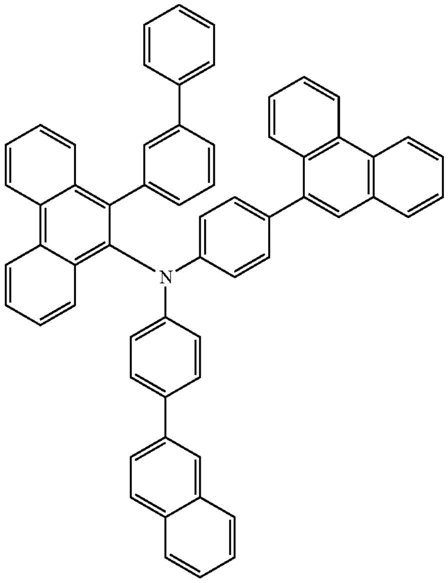
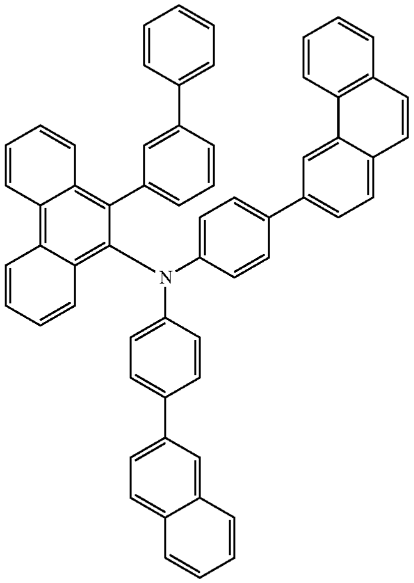

-continued
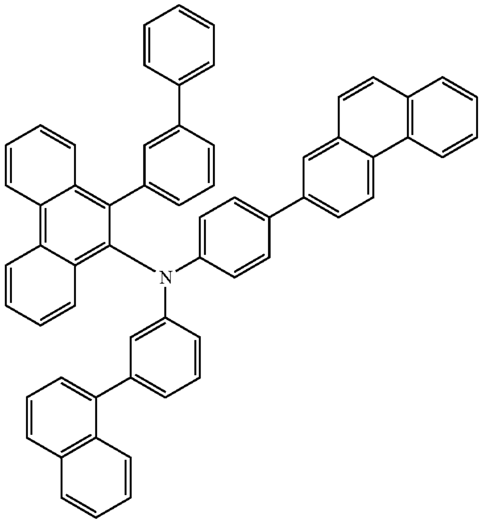
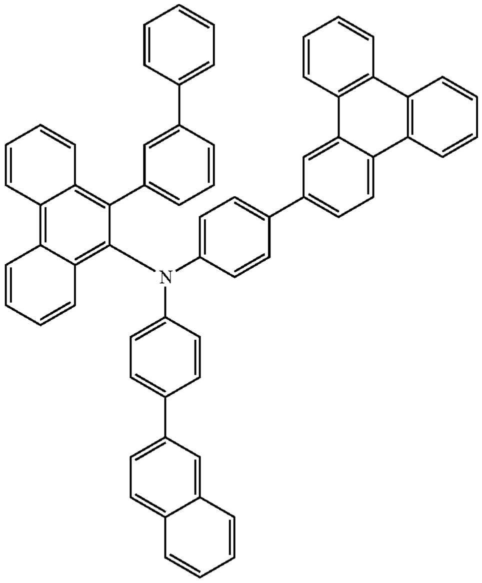
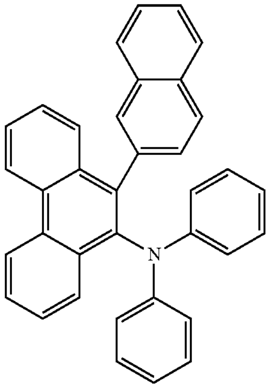
-continued
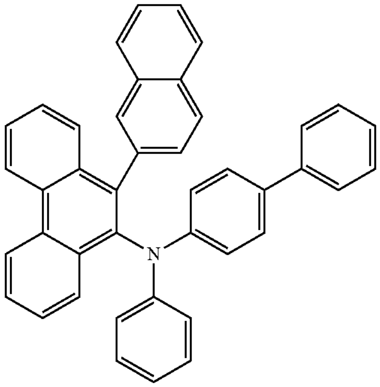
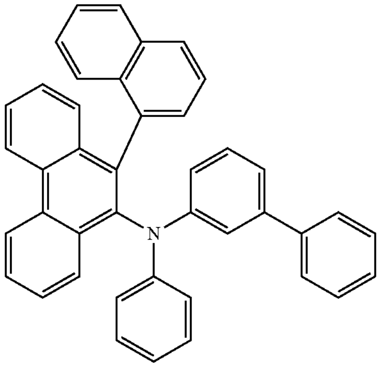
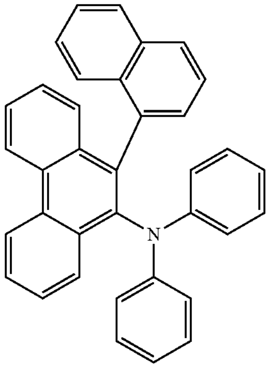
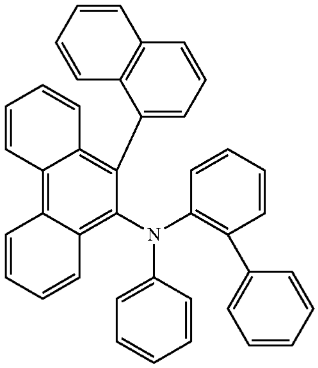

-continued
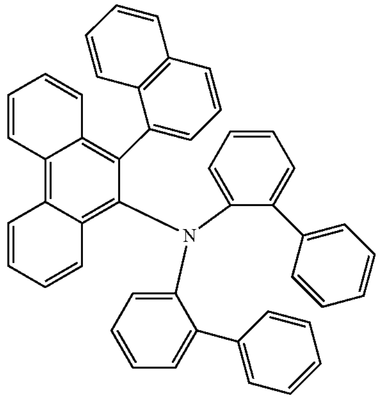
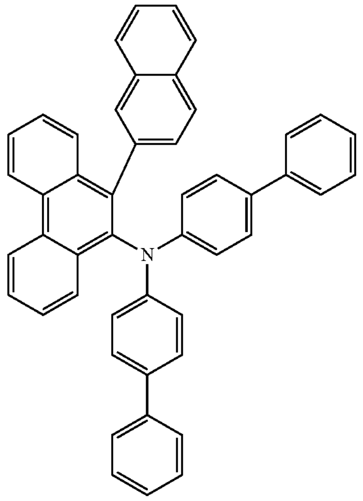
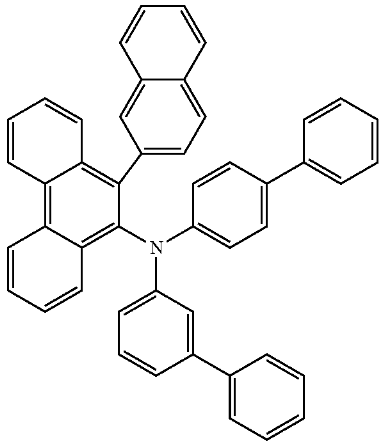
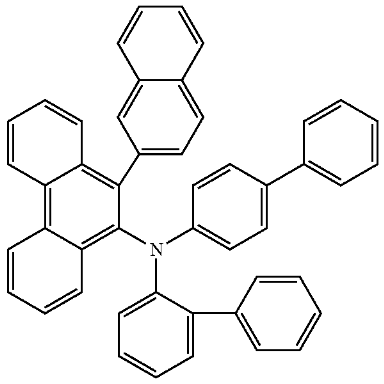
-continued
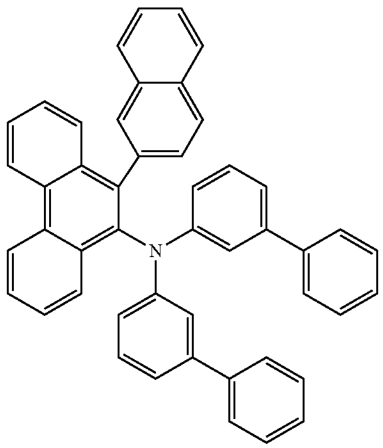
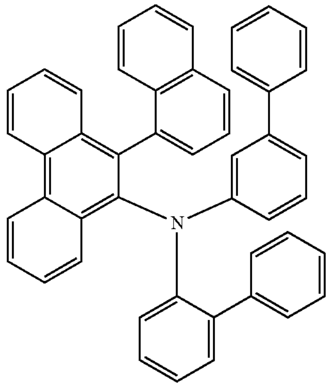
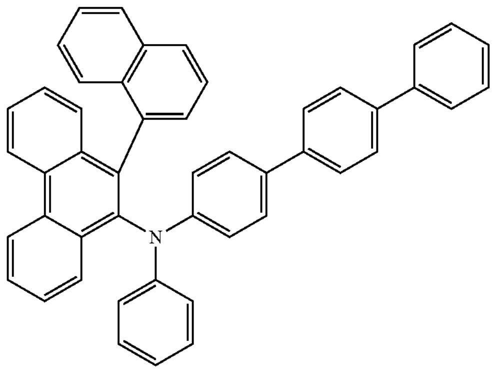
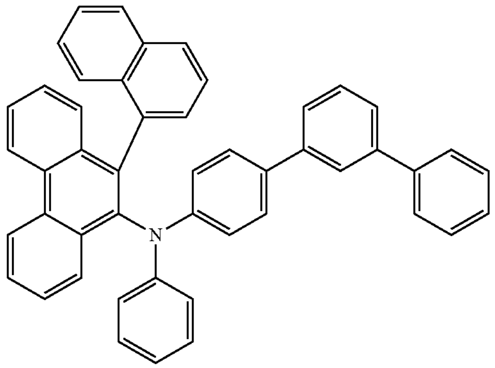

-continued
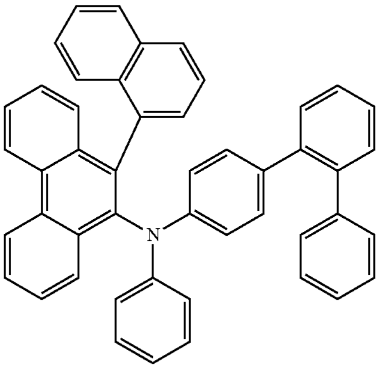
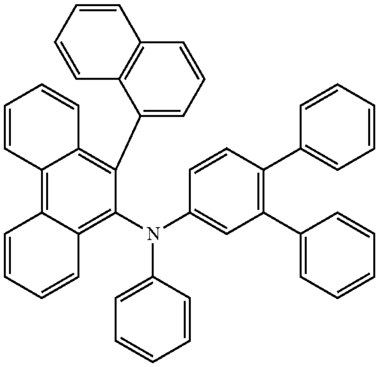
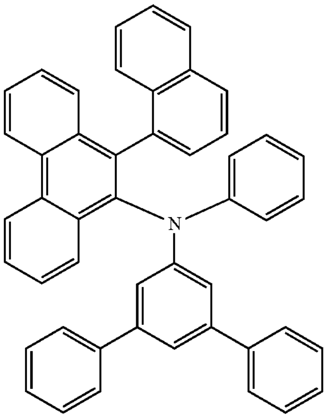
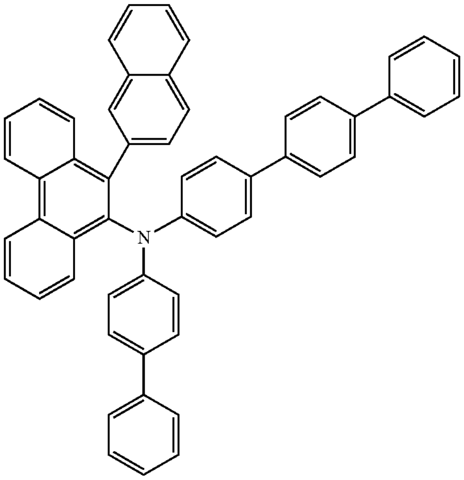
-continued
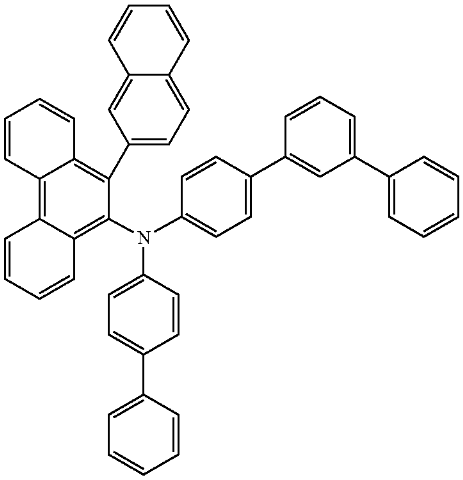
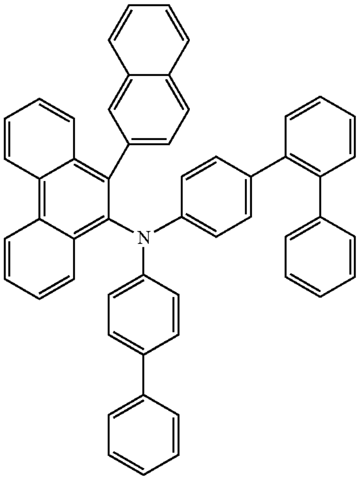
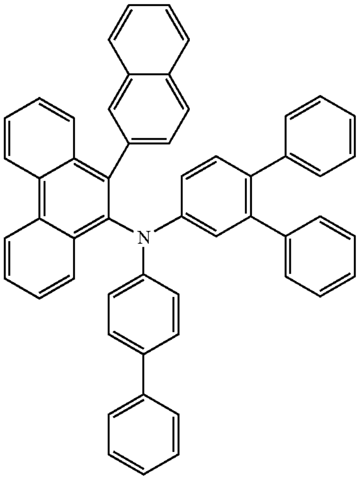

-continued
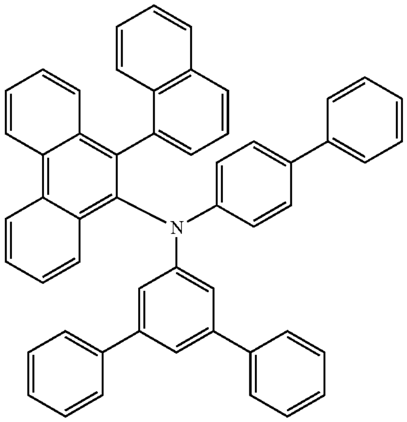
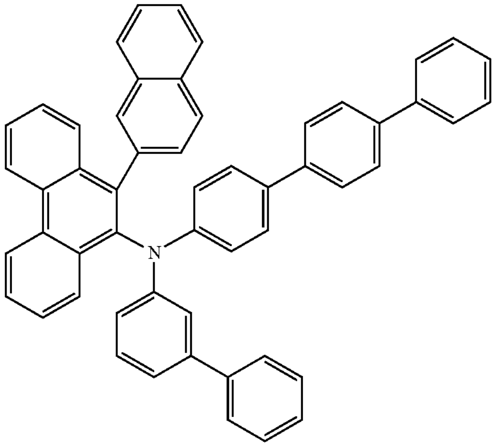
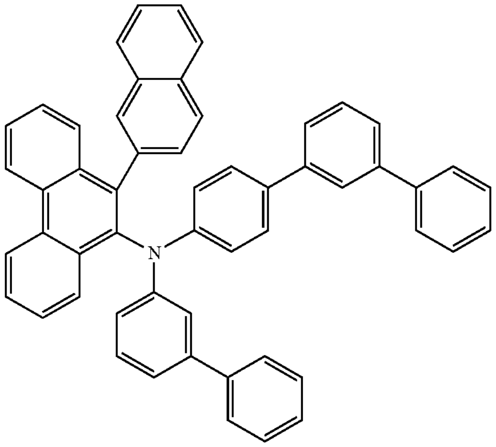
-continued
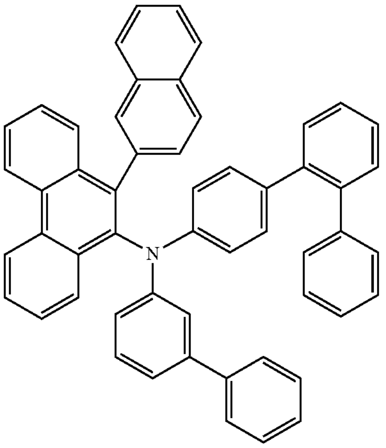
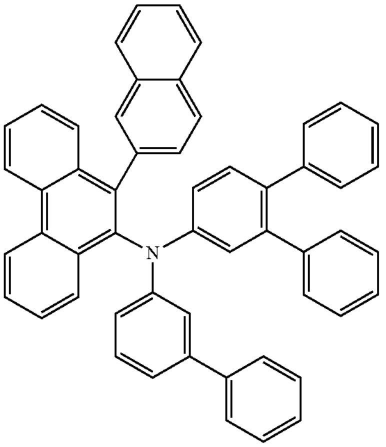
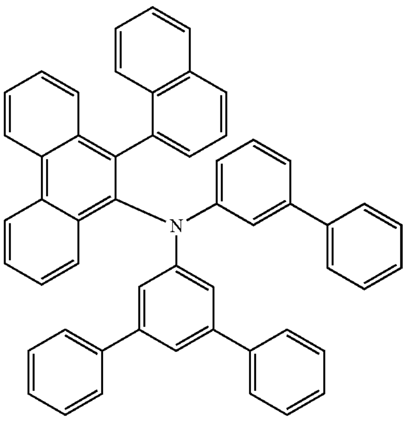

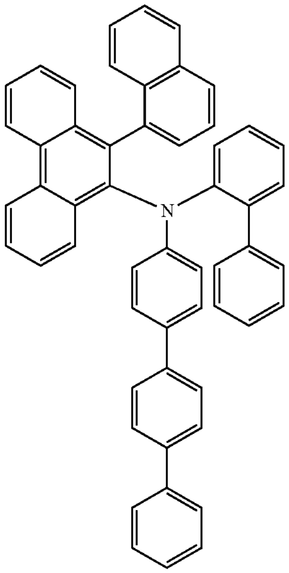
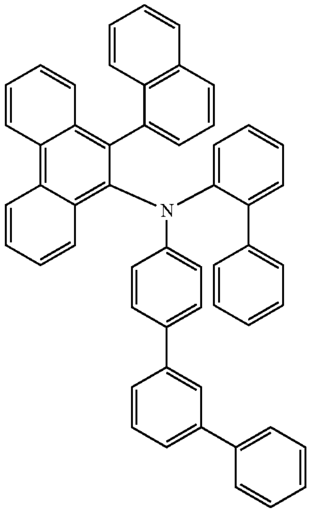
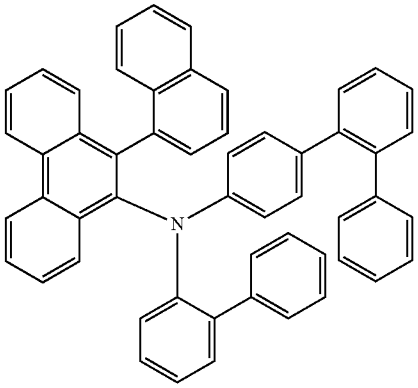
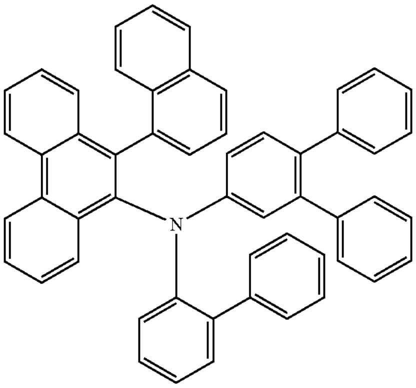
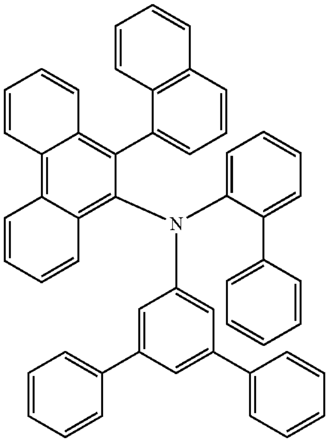
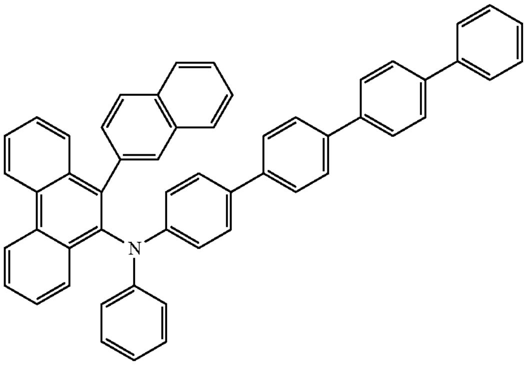
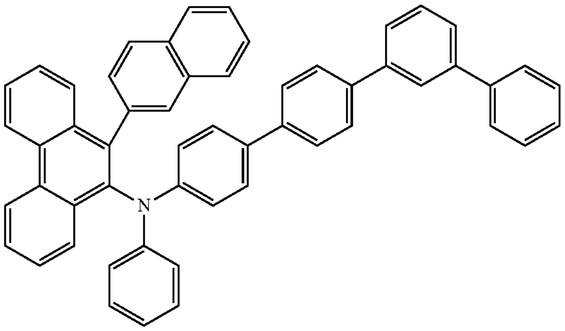

-continued
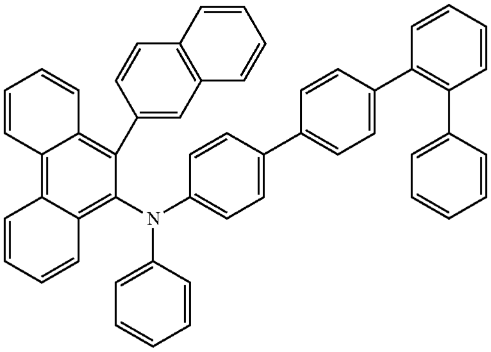
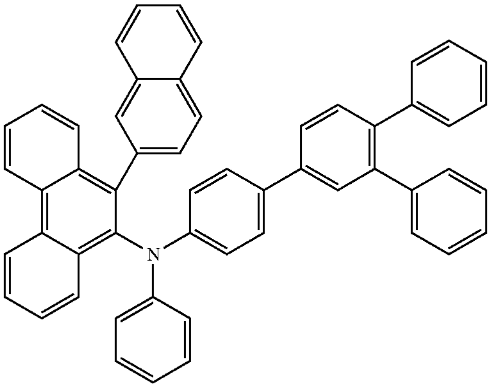
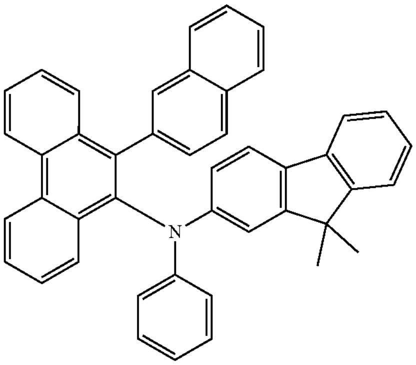
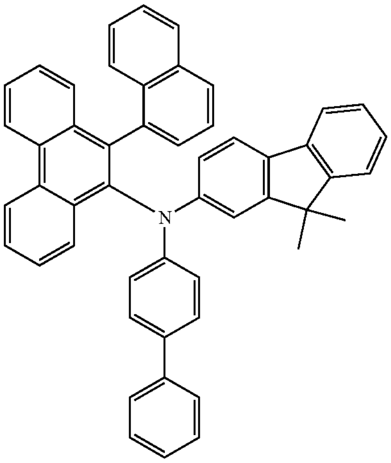
-continued
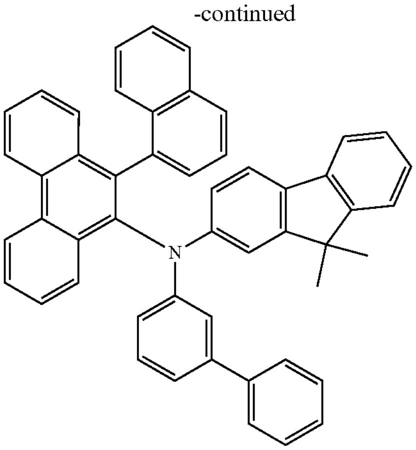
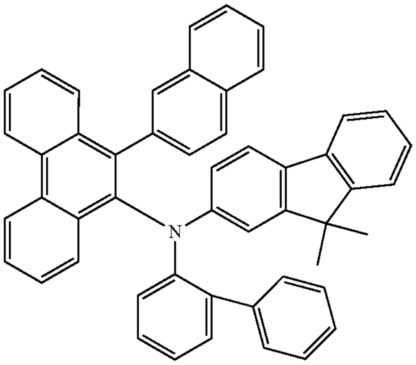
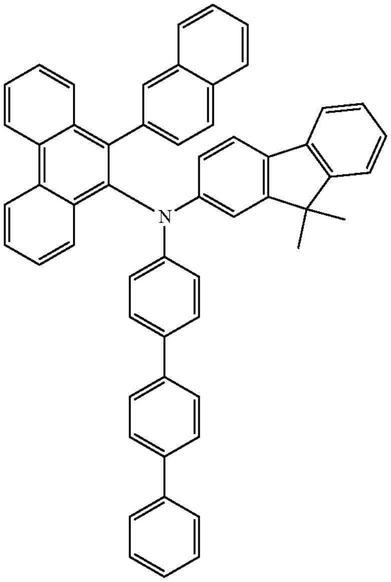

-continued
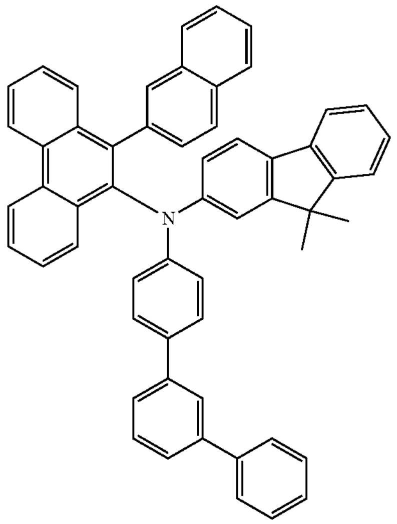
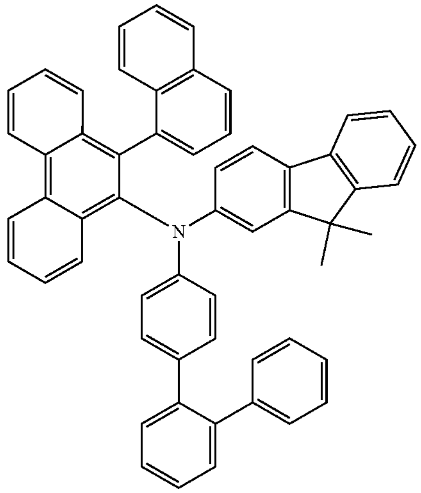
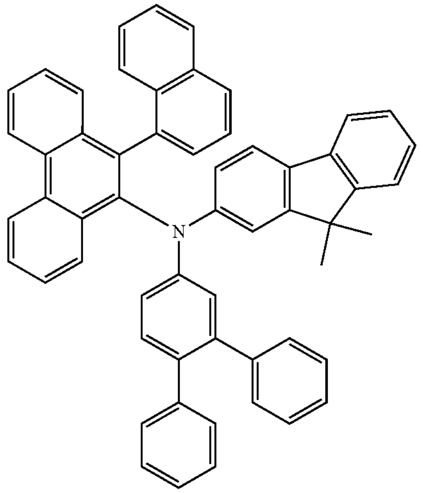
-continued
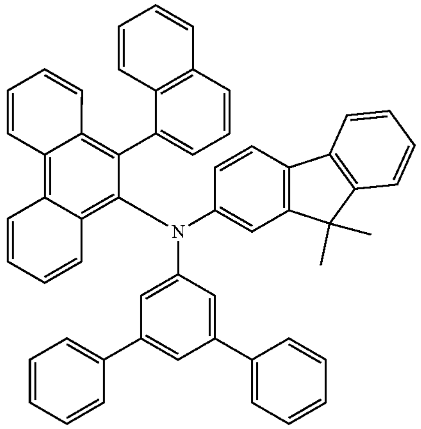
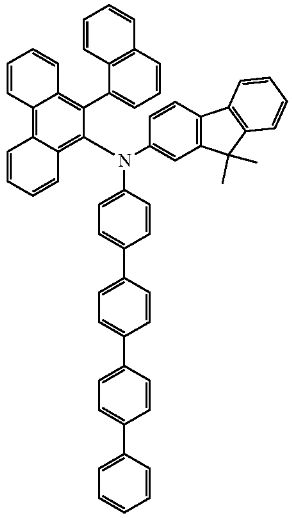
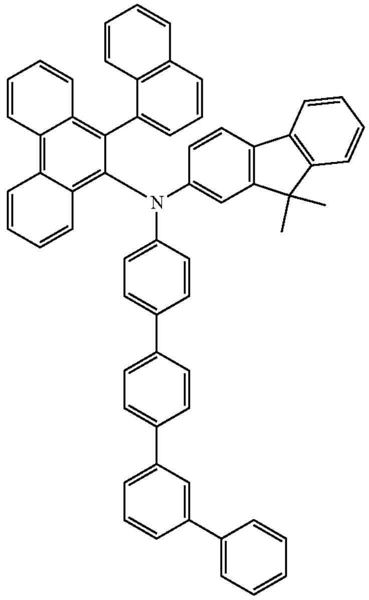

-continued
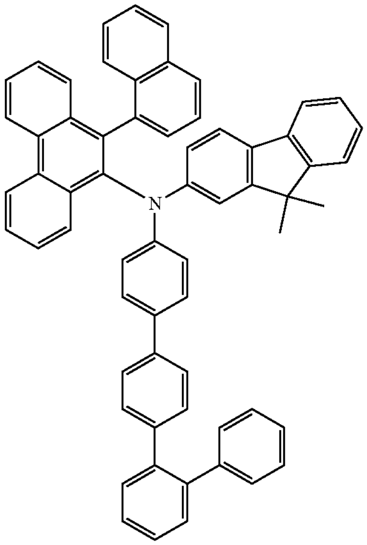
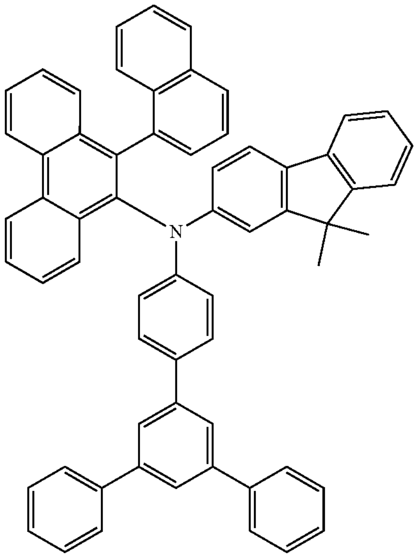
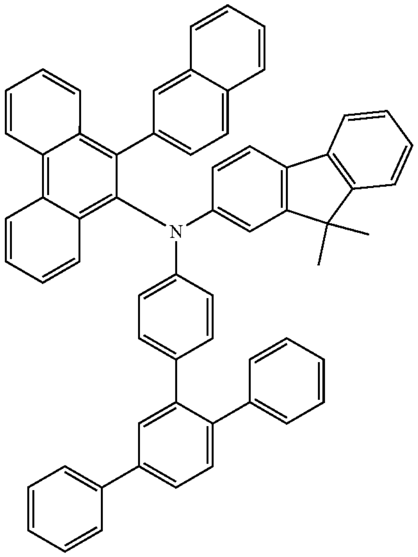
-continued
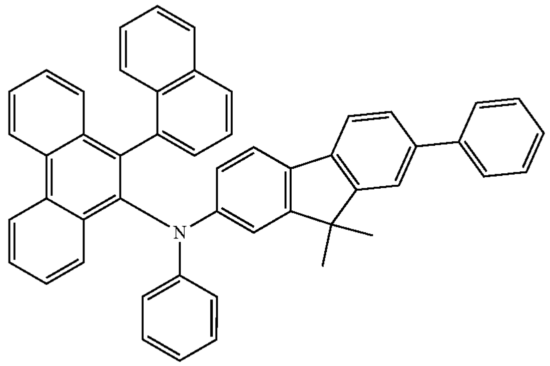
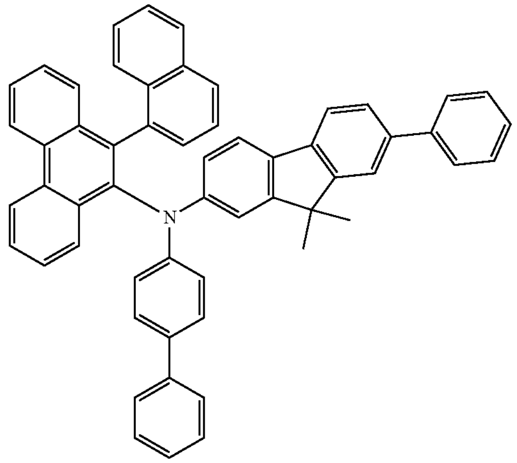
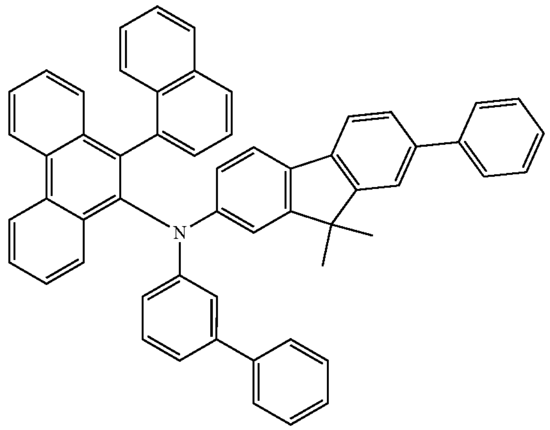
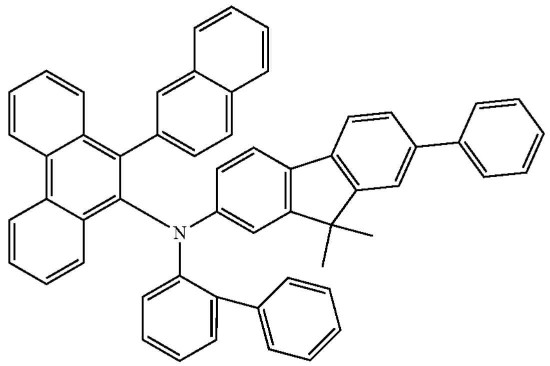

-continued
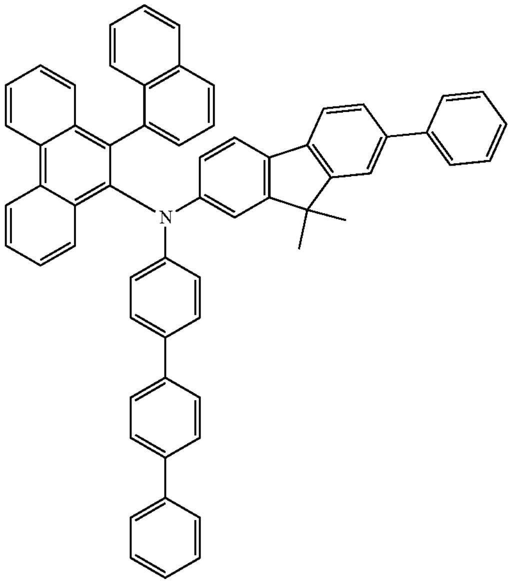
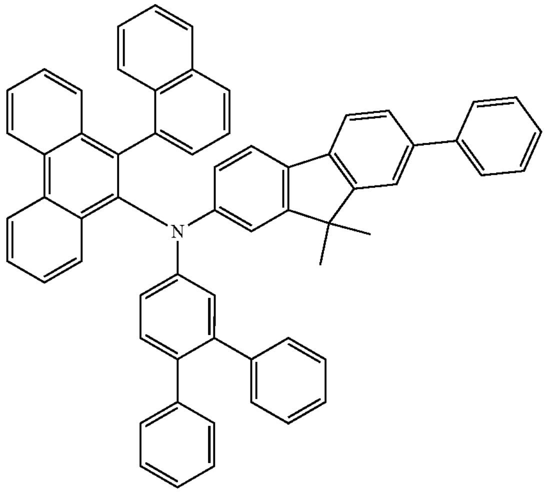
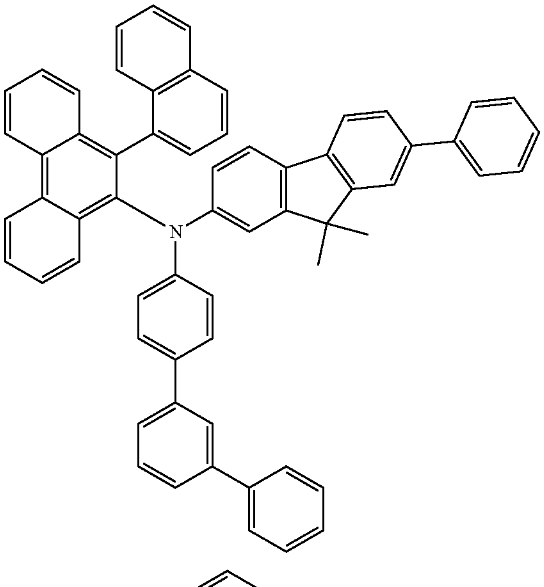
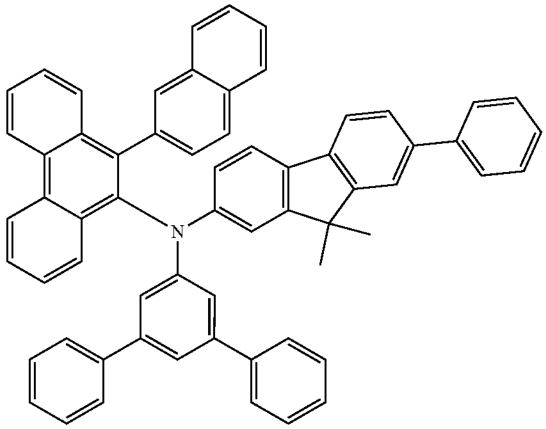
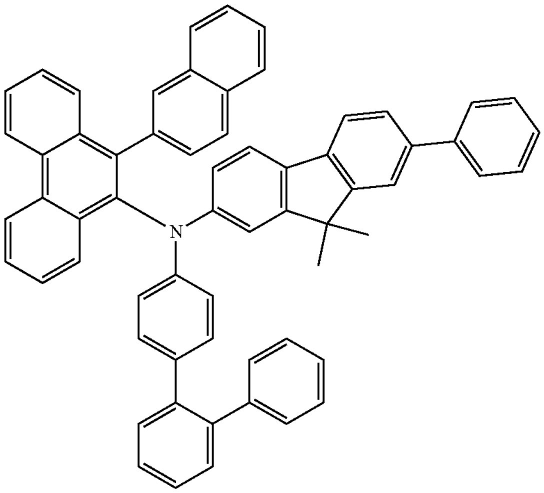
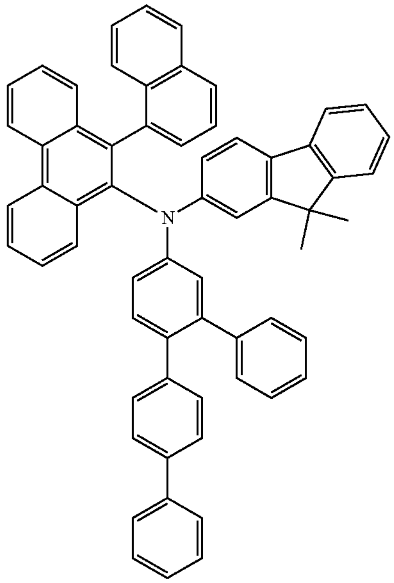 [SMILES: CC1(C)c2ccccc2-c2ccc(N(c3ccc(-c4ccc(-c5ccccc5)cc4)c(-c4ccccc4)c3)c3c(-c4cccc5ccccc45)c4ccccc4c4ccccc34)cc21]
-continued -continued
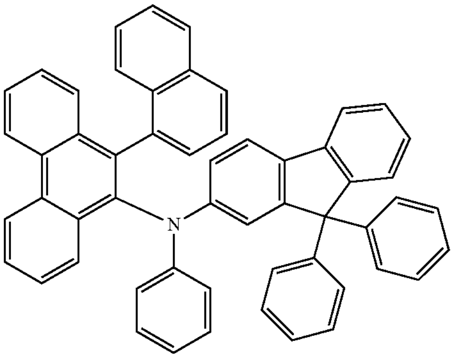
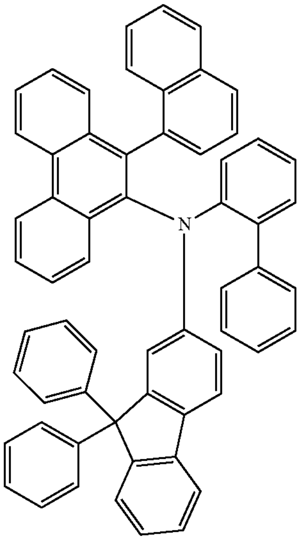
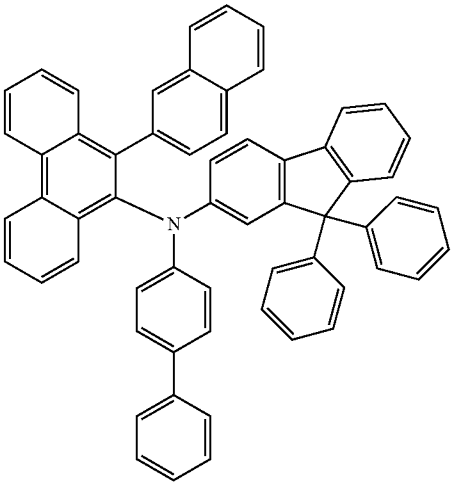
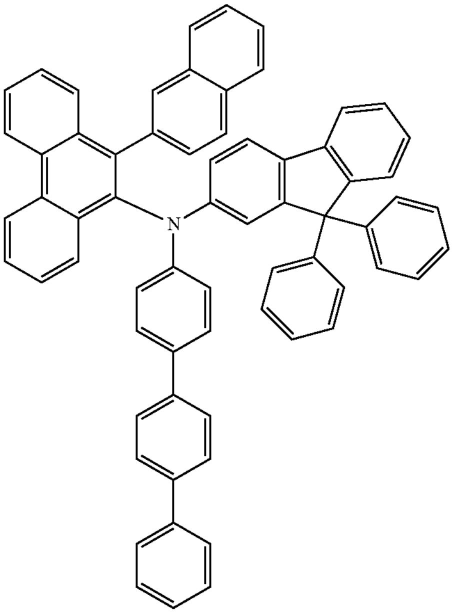
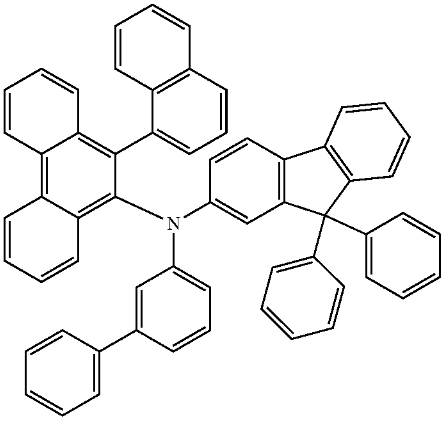
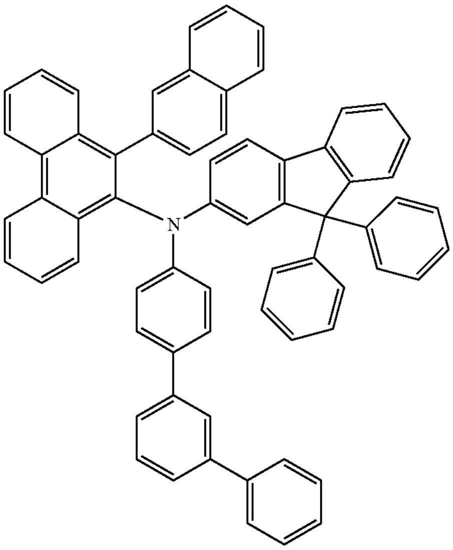

-continued
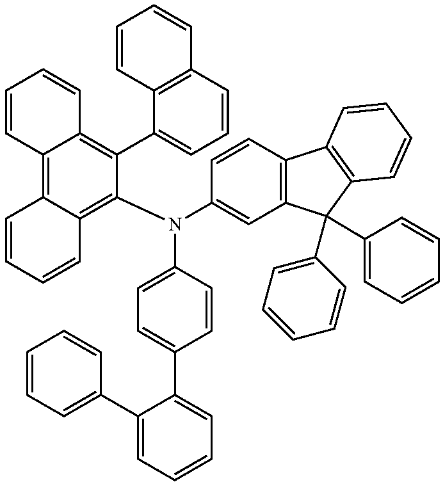
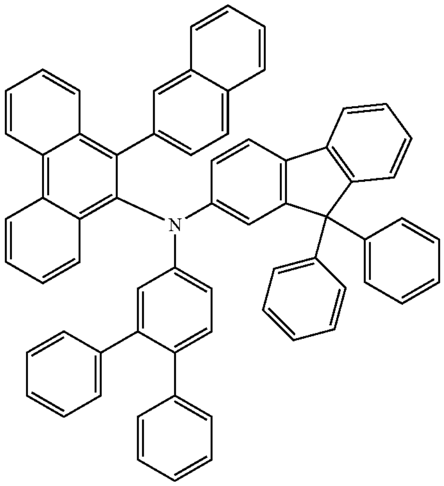
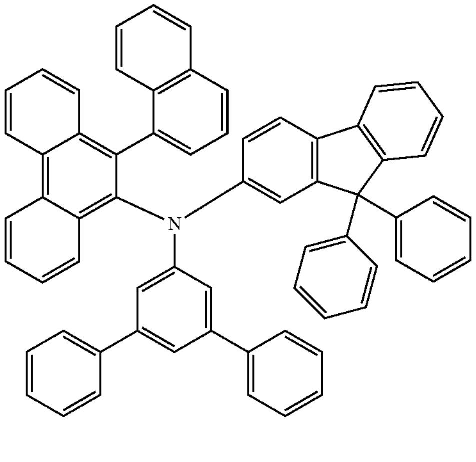
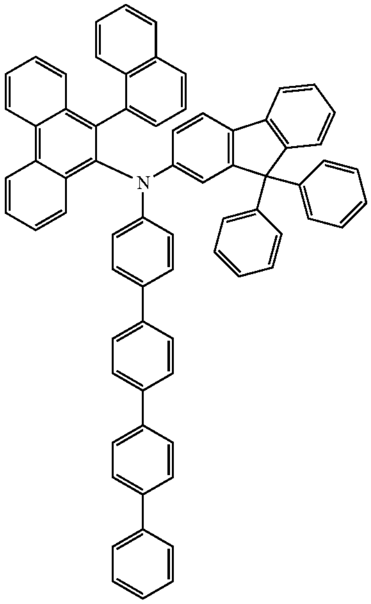
-continued
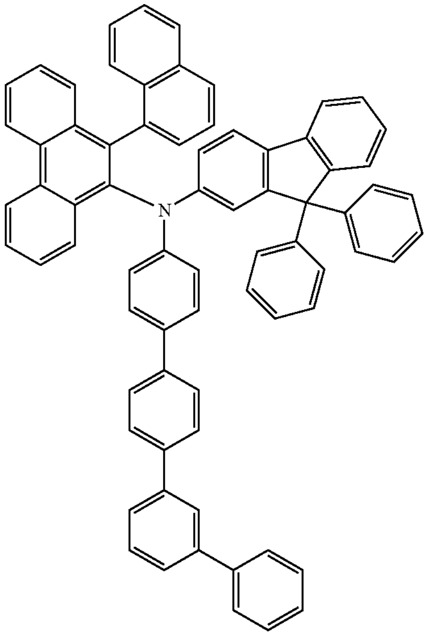

-continued
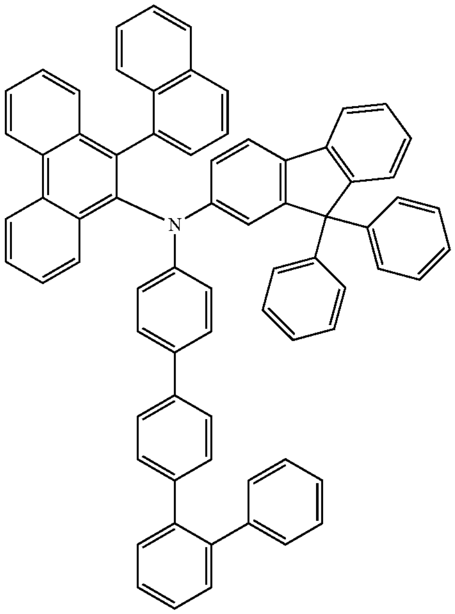
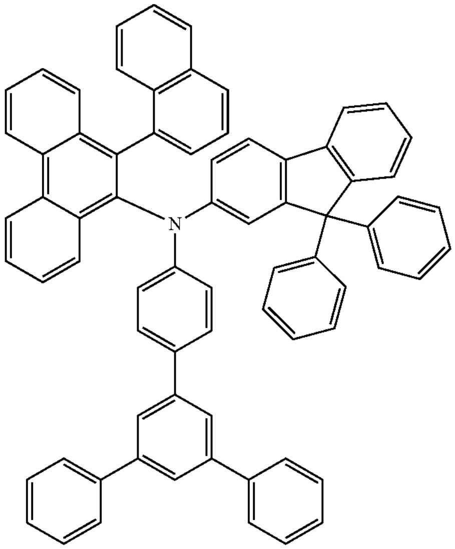
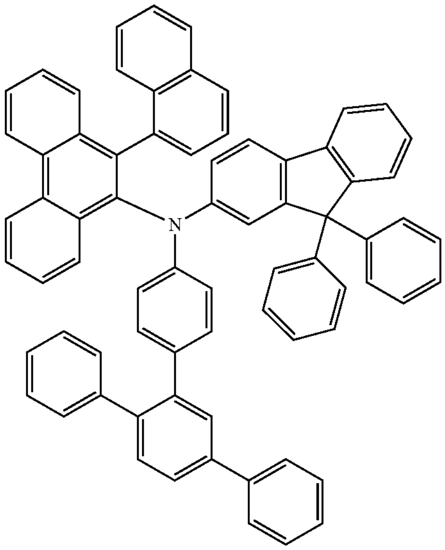
-continued
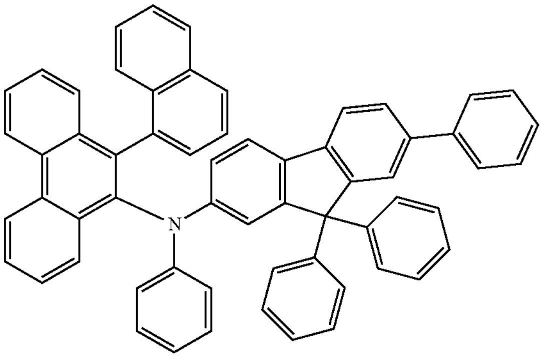
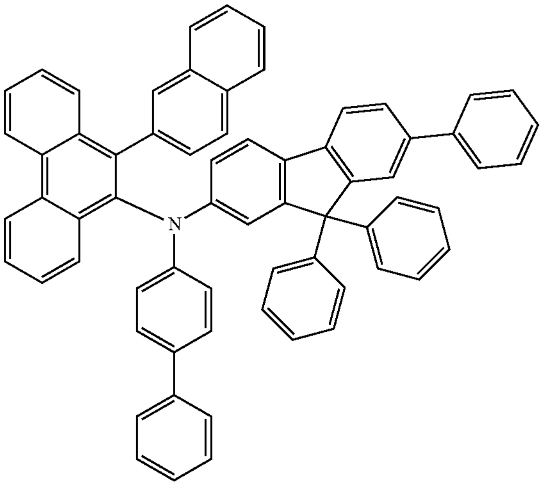
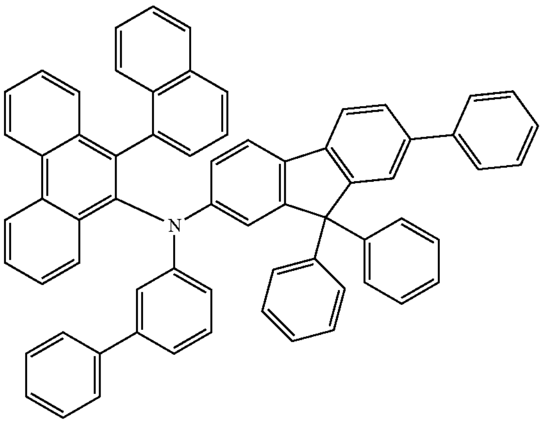

-continued
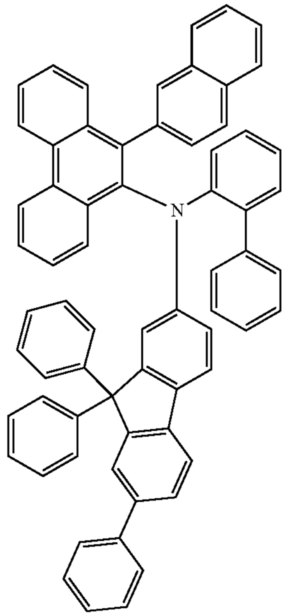
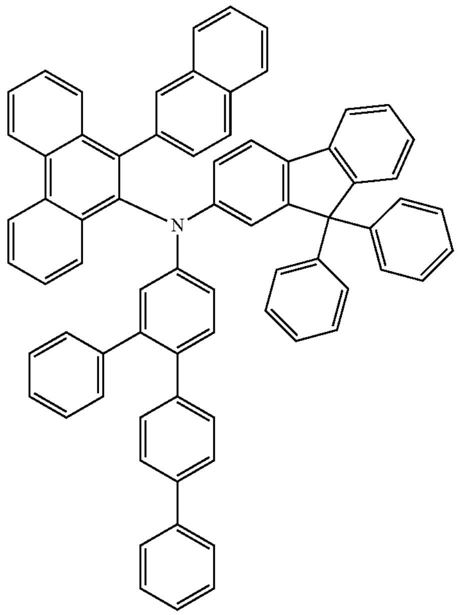
-continued
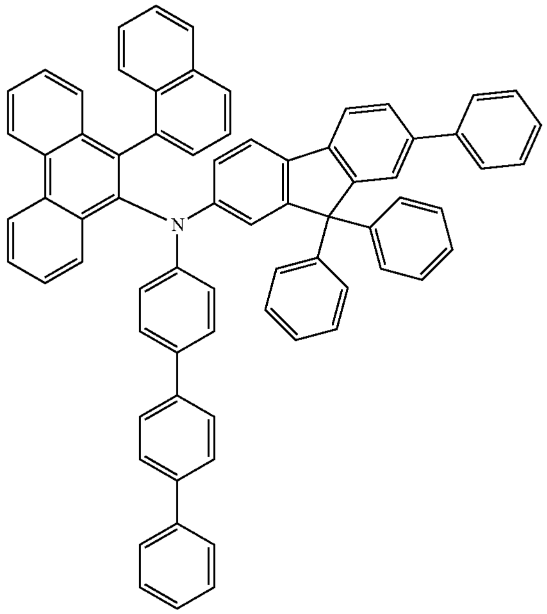
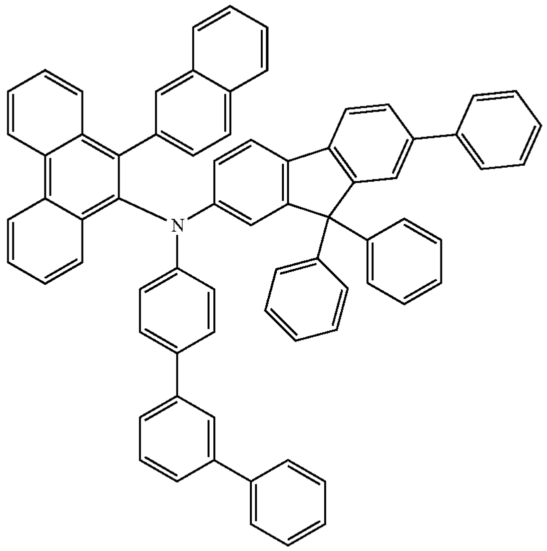
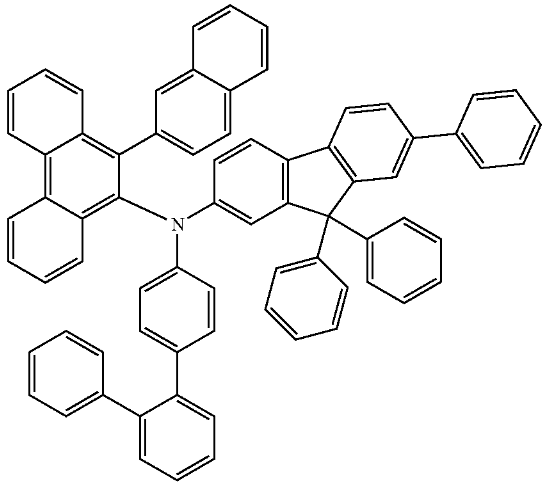

-continued
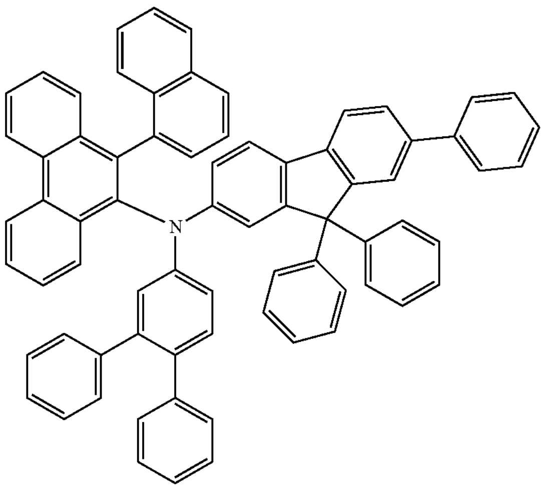
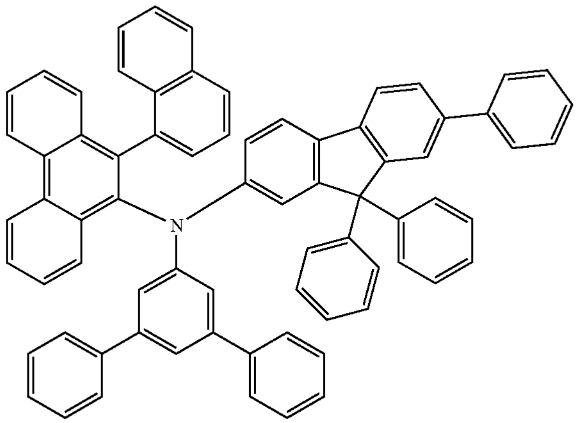
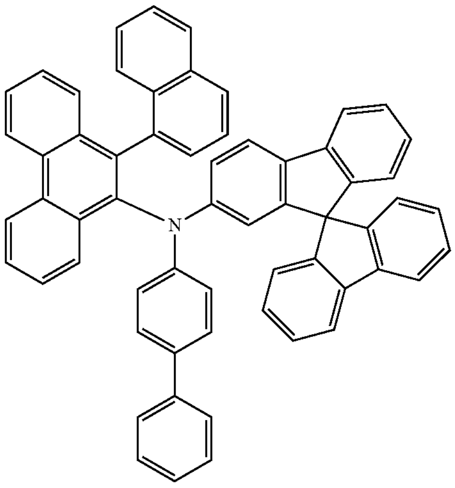
-continued
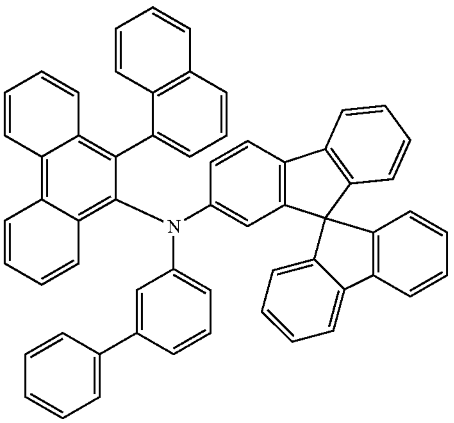
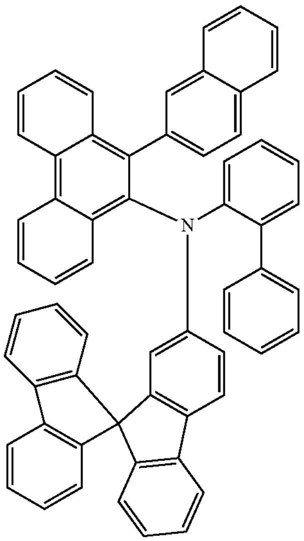
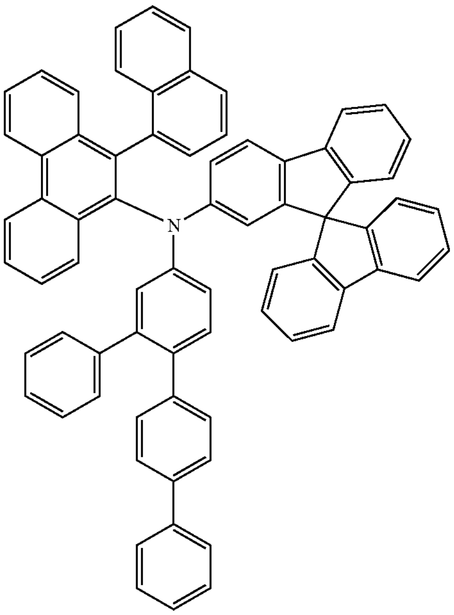

-continued
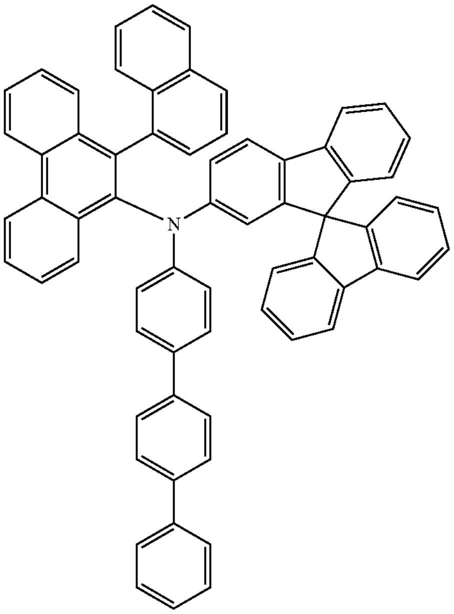
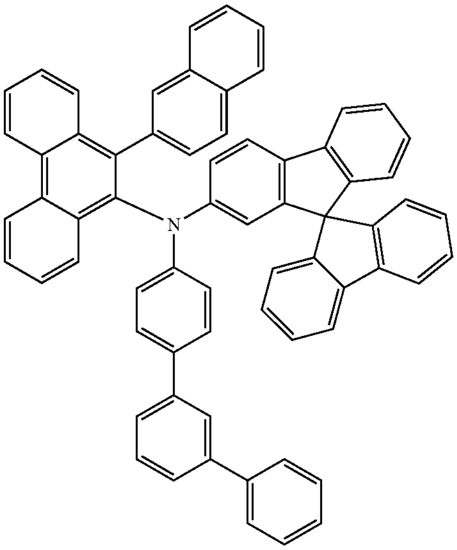
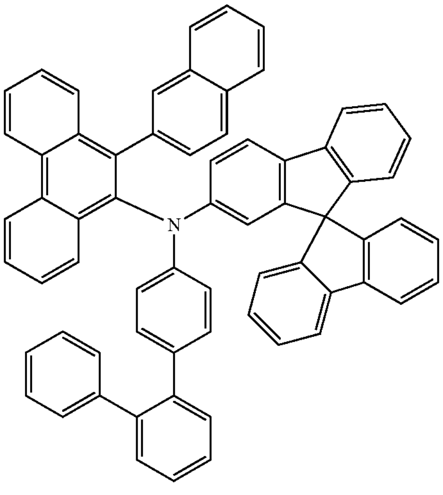
-continued
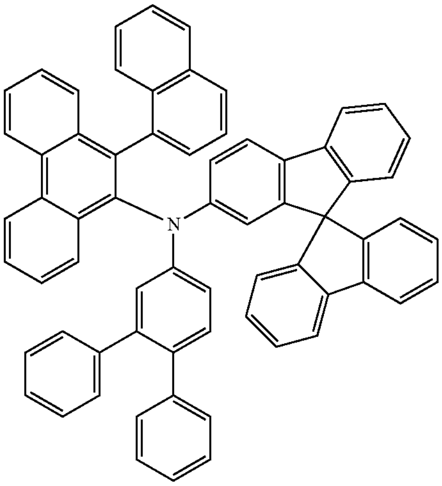
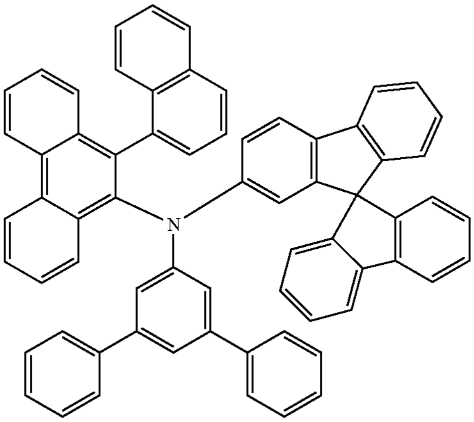
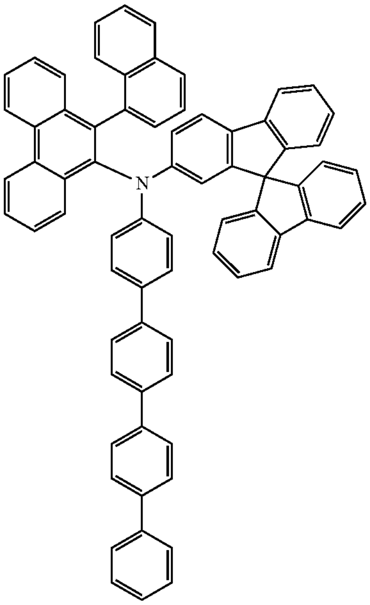

-continued
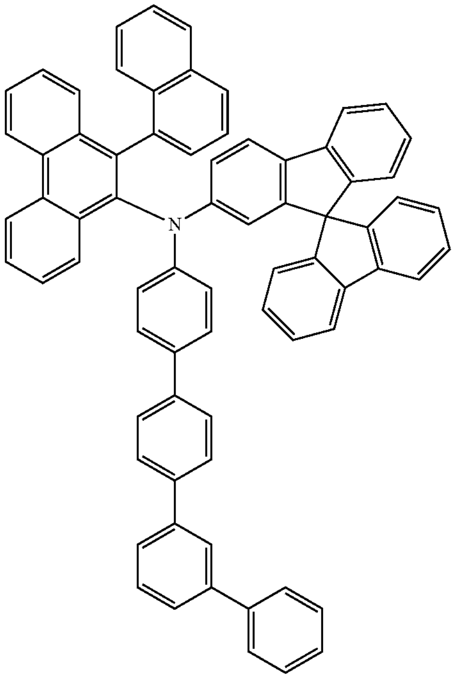
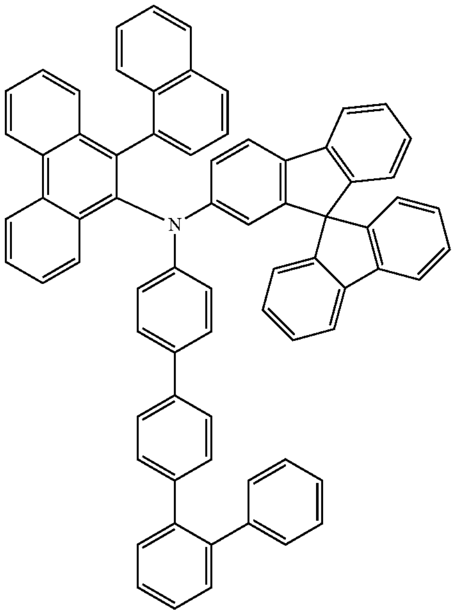
-continued
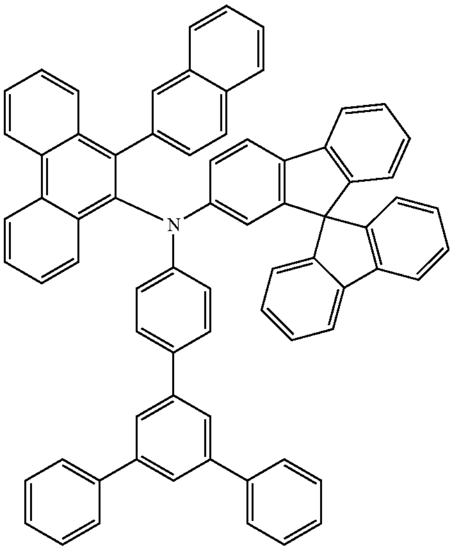
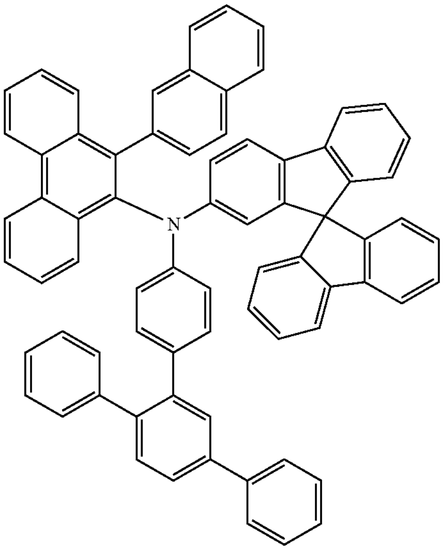
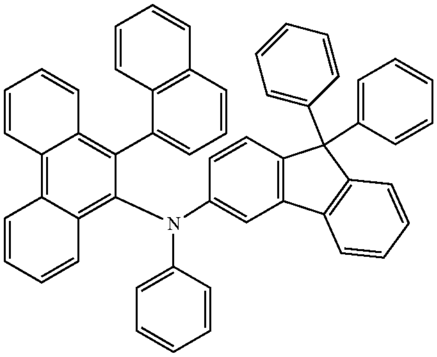

-continued
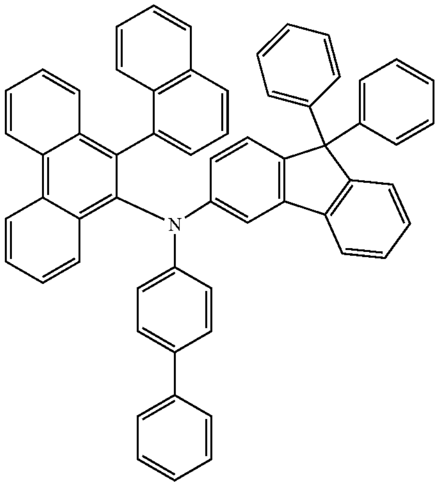
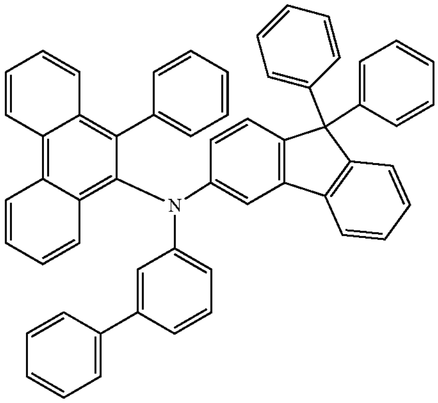
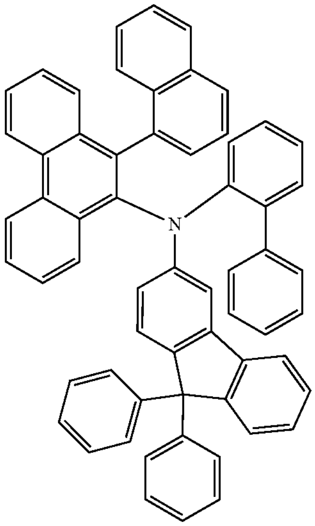
-continued
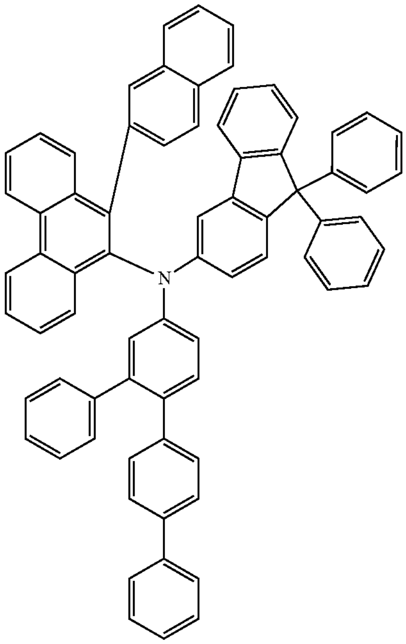
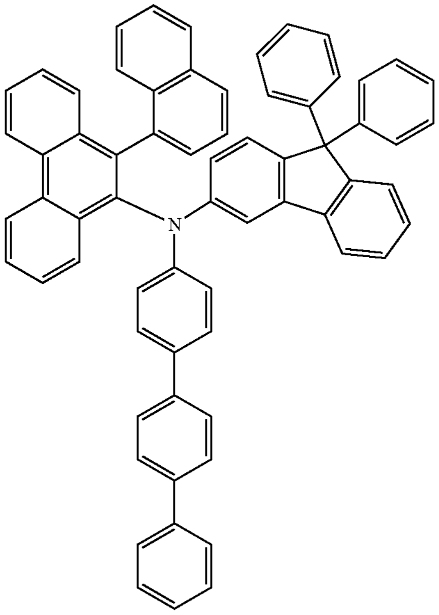

-continued
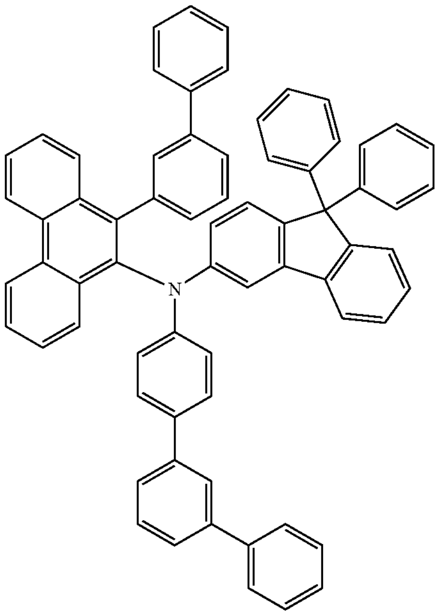
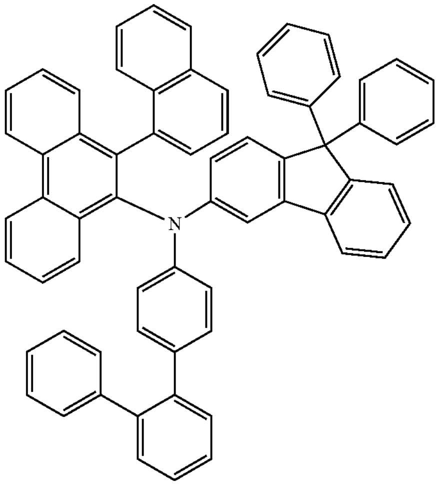
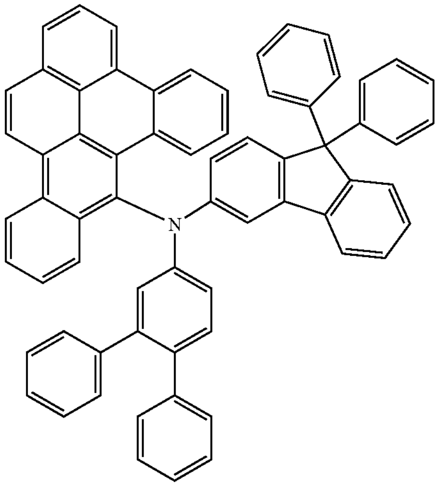
-continued
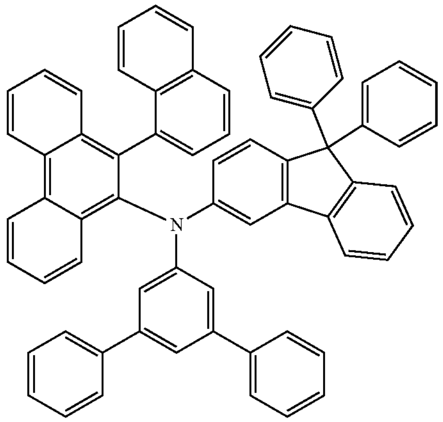
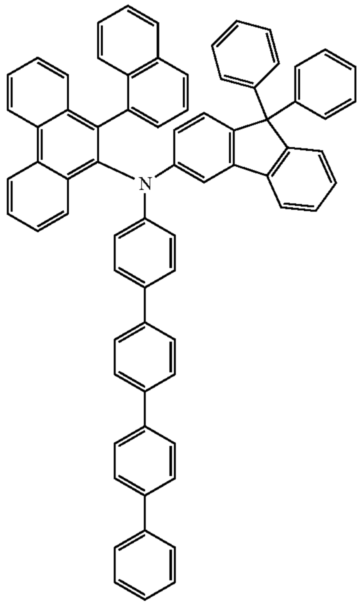
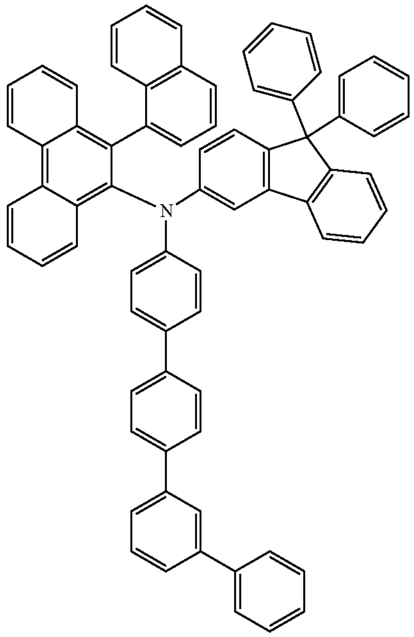

-continued
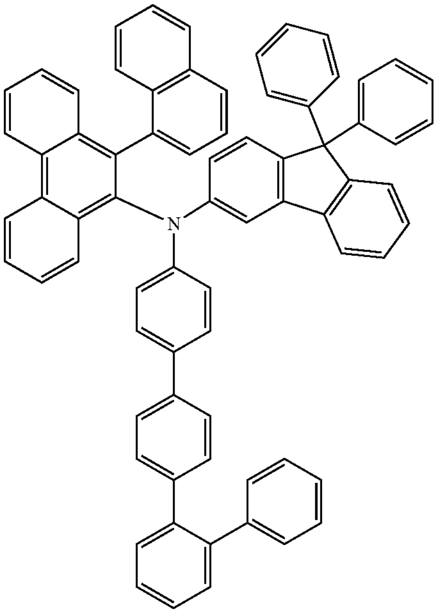
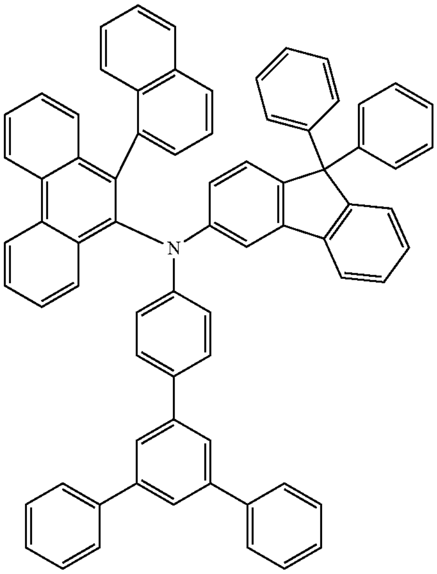
-continued
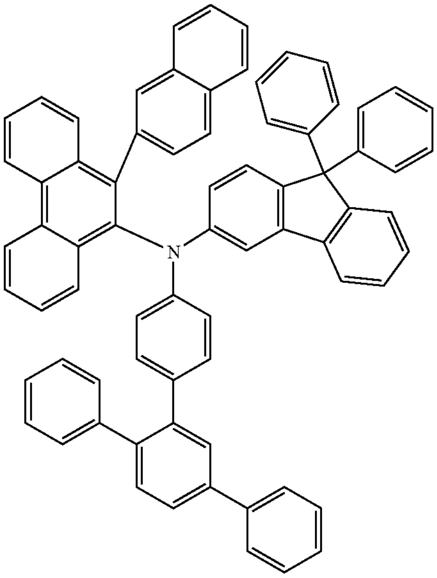
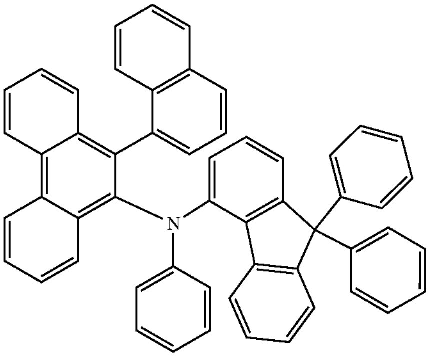
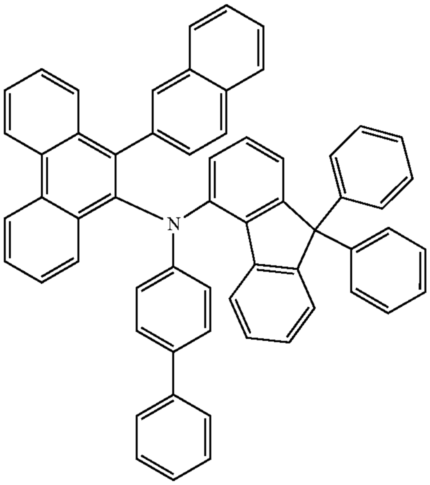

-continued
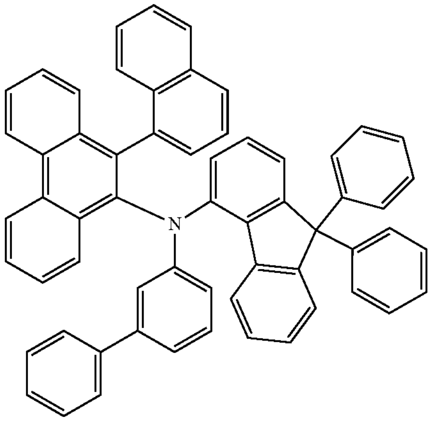
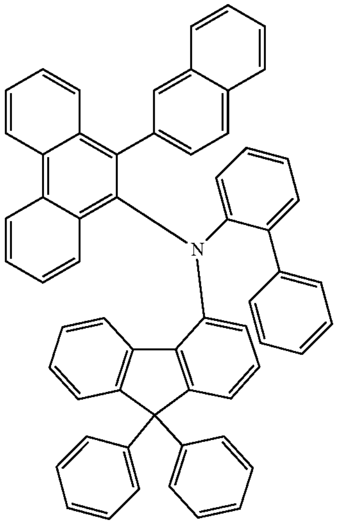
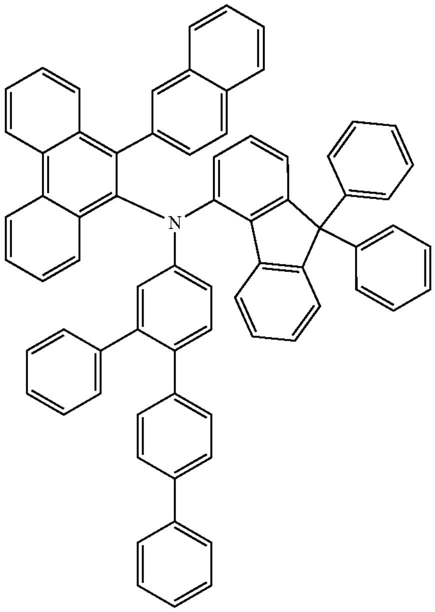
-continued
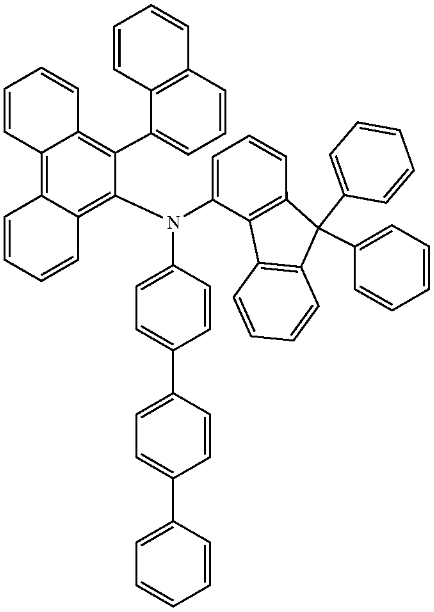
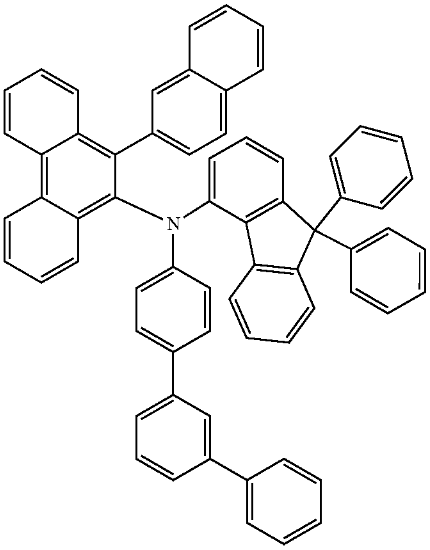
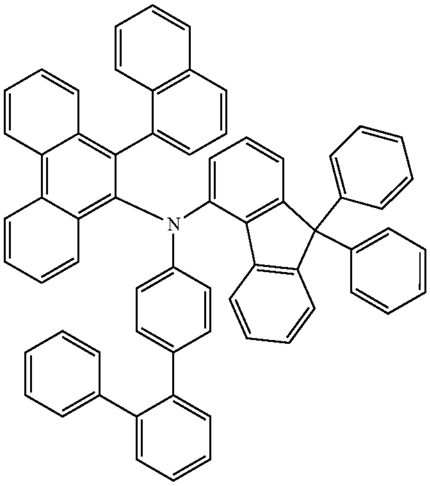

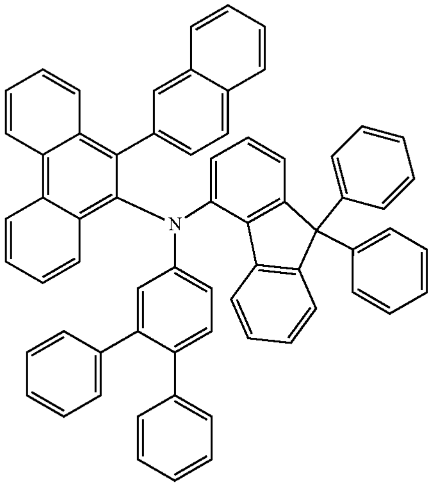
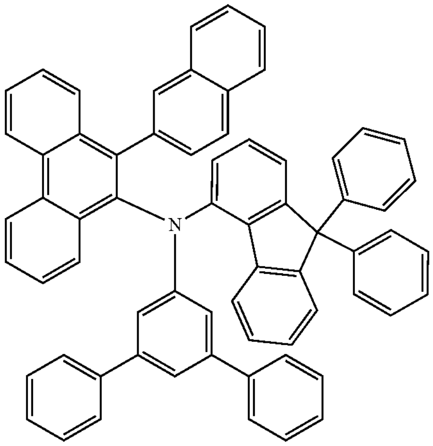
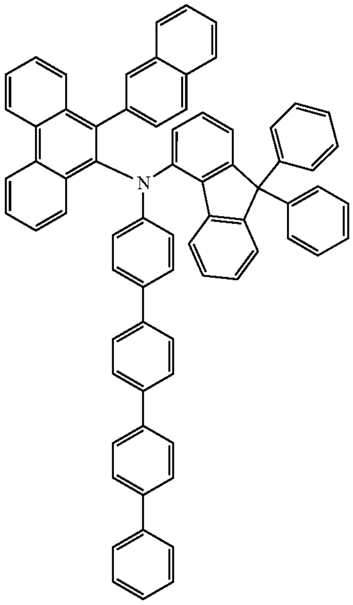
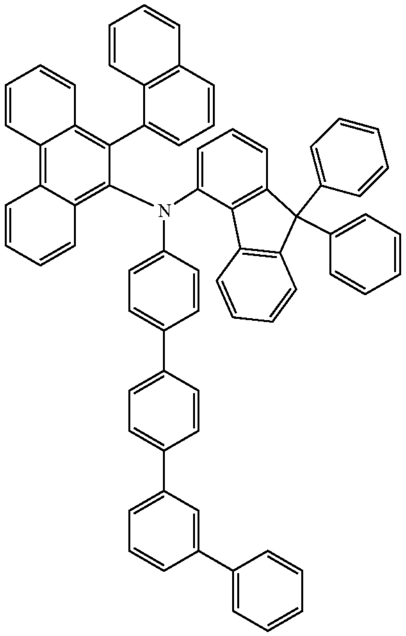
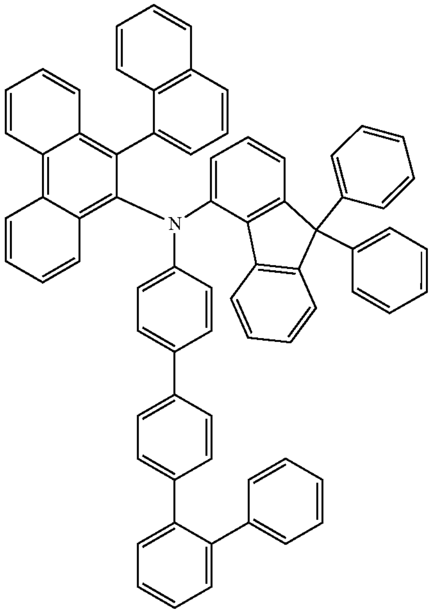

-continued
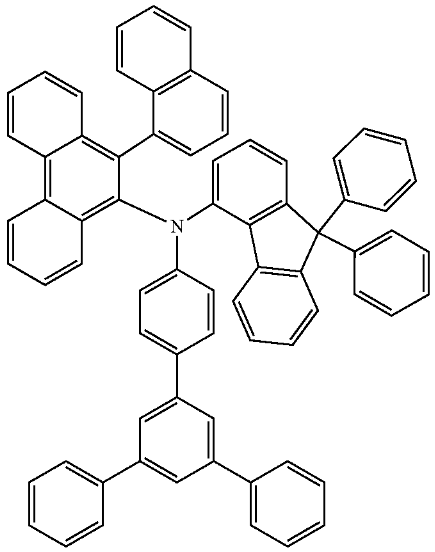
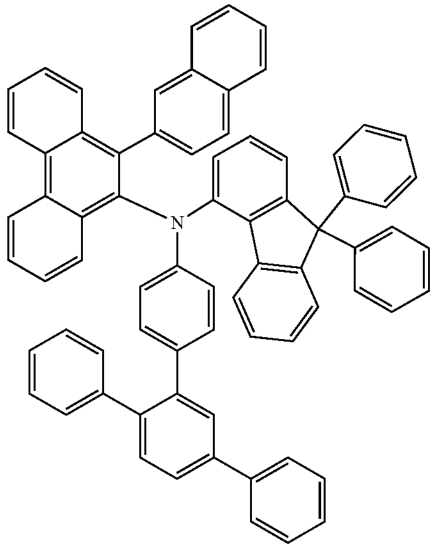
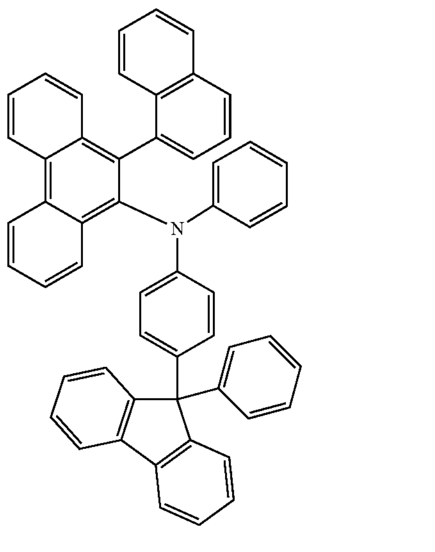
-continued
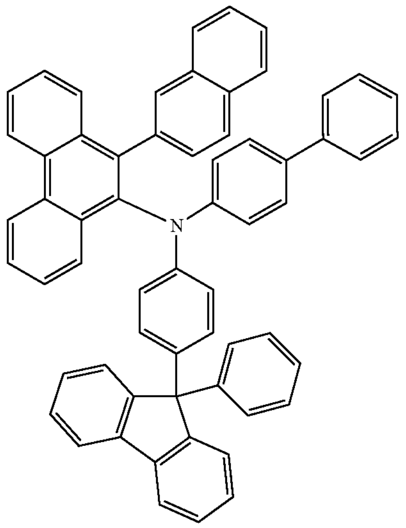
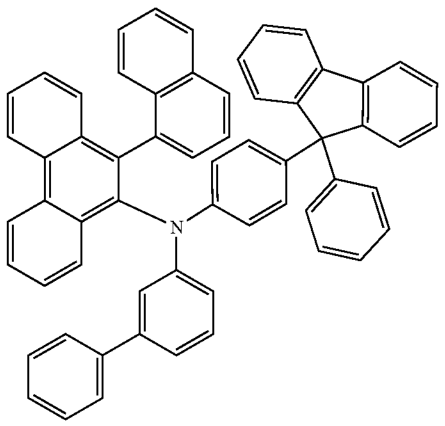
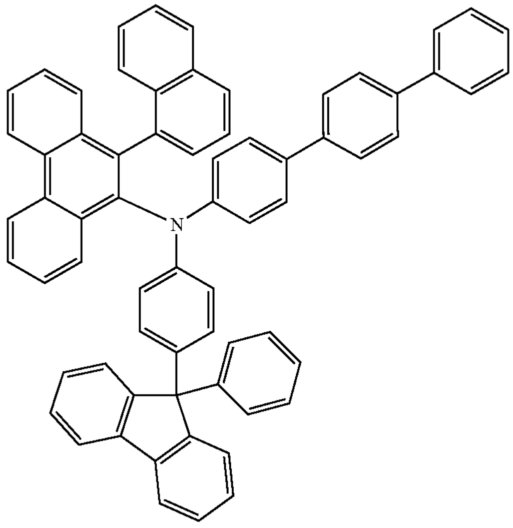

-continued
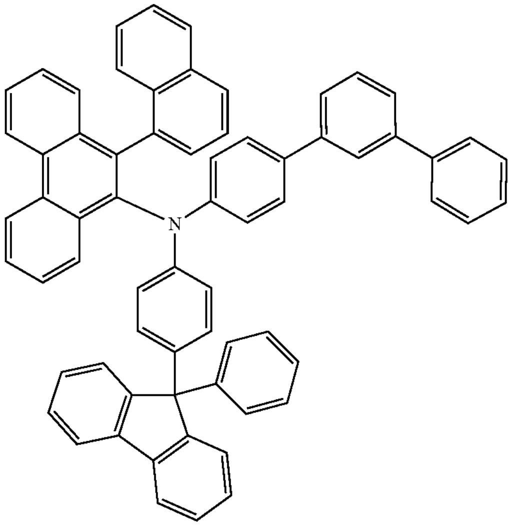
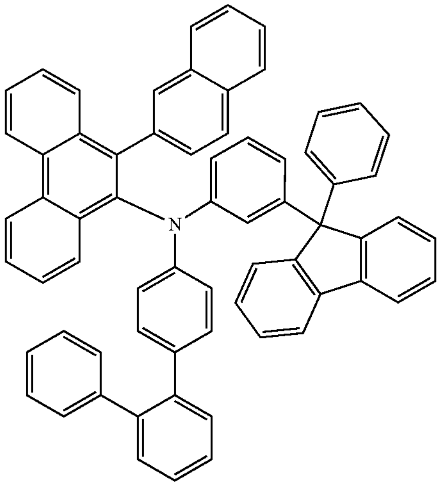
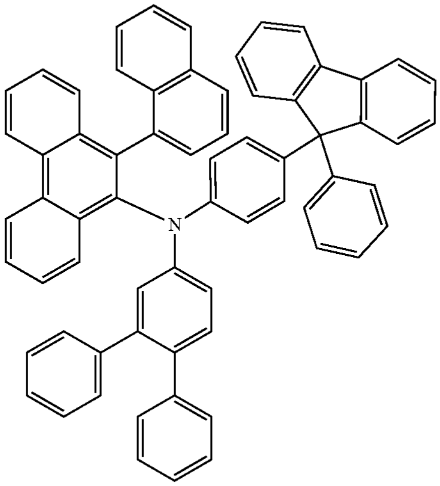
-continued
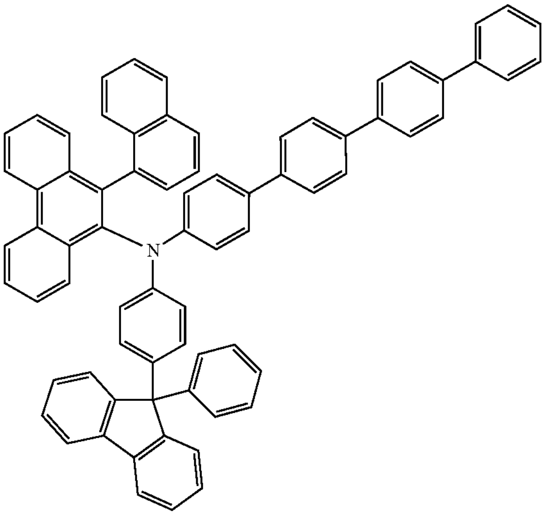
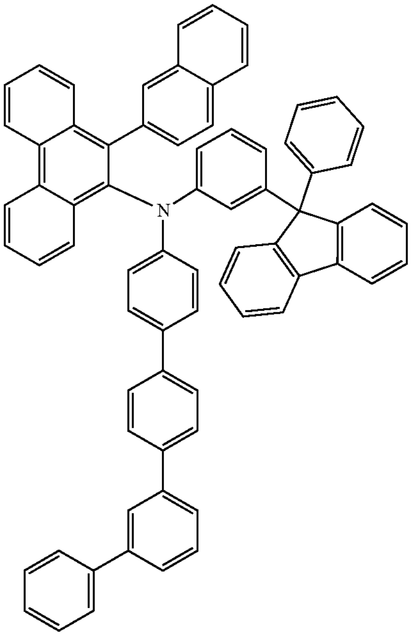
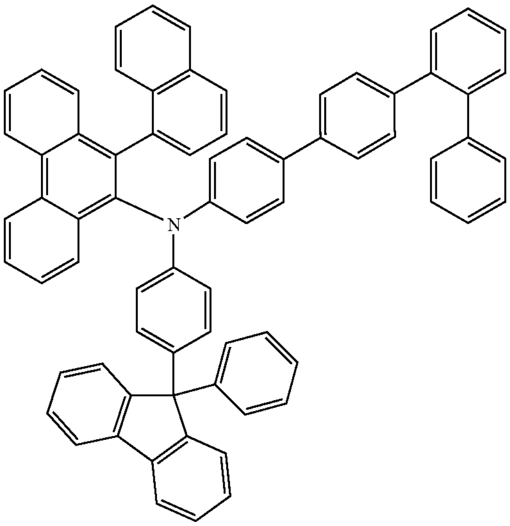

-continued
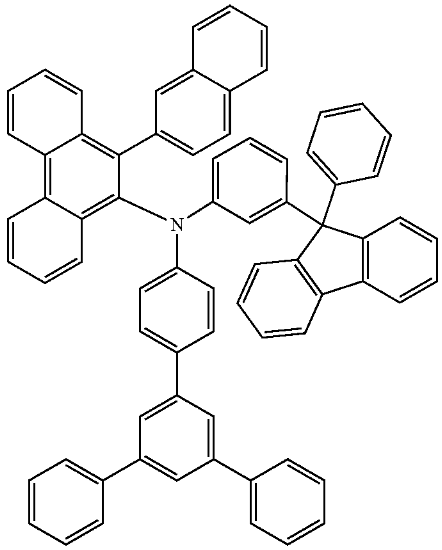
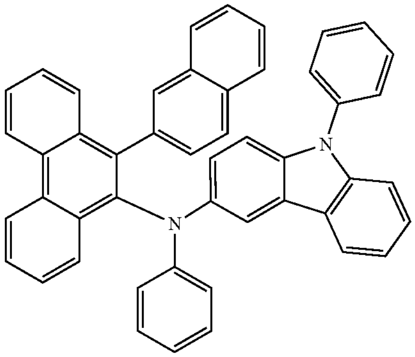
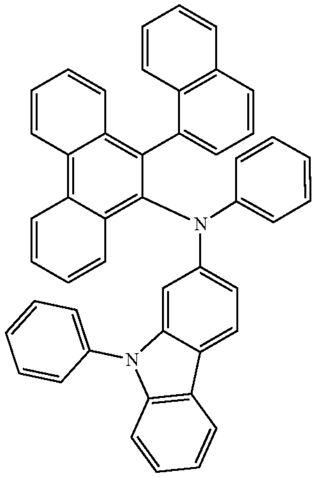
-continued
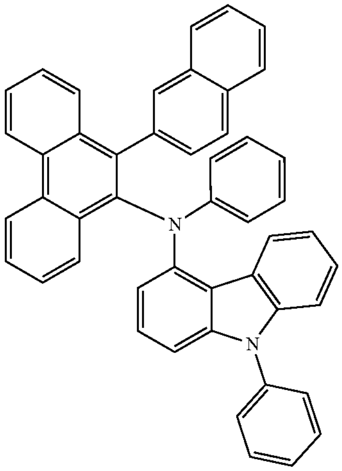
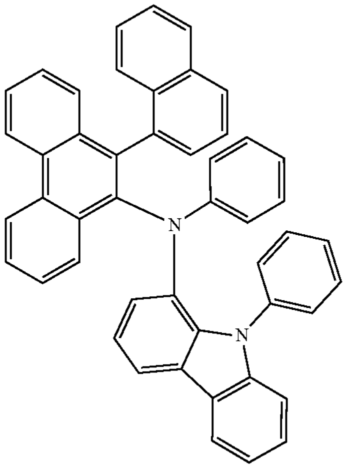
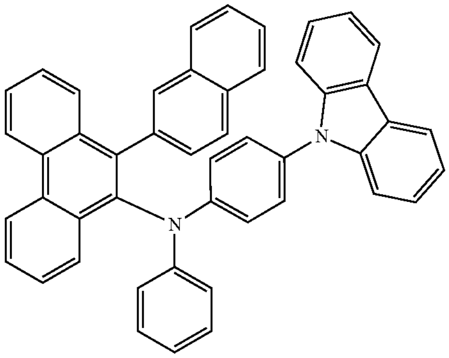

-continued
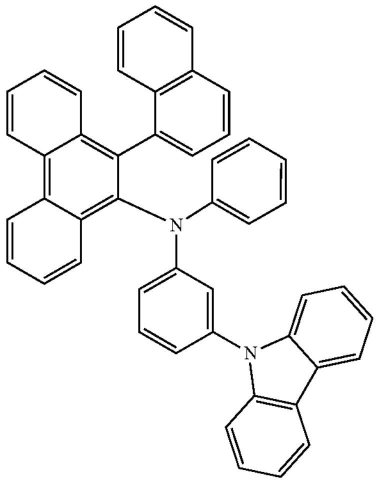
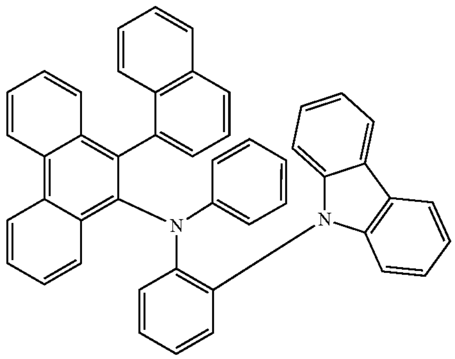
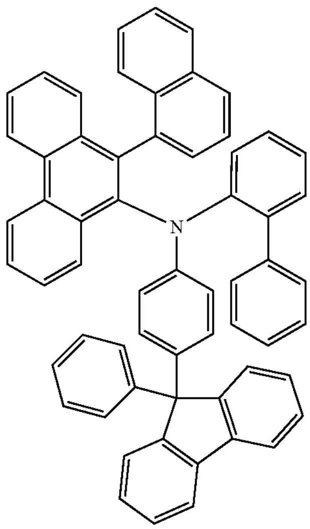
-continued
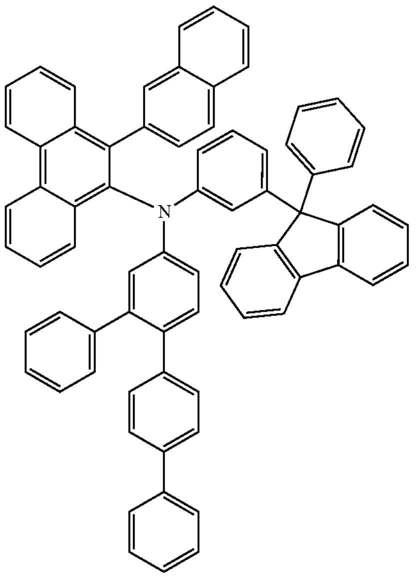
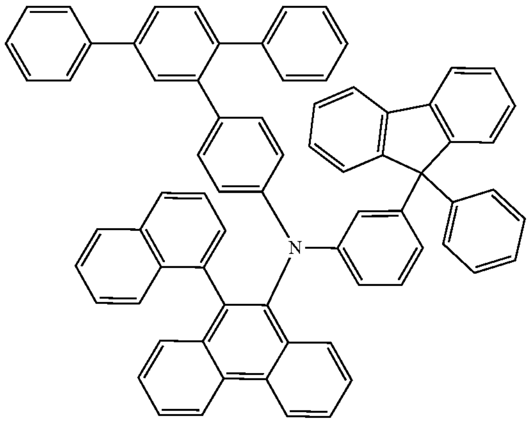
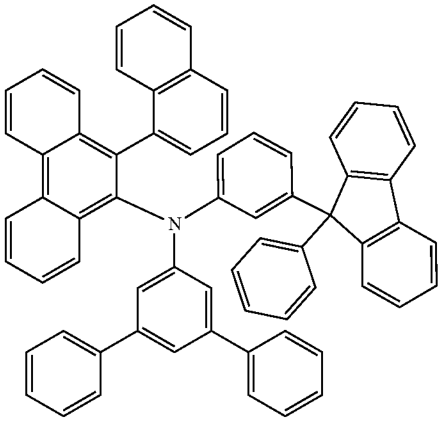

-continued
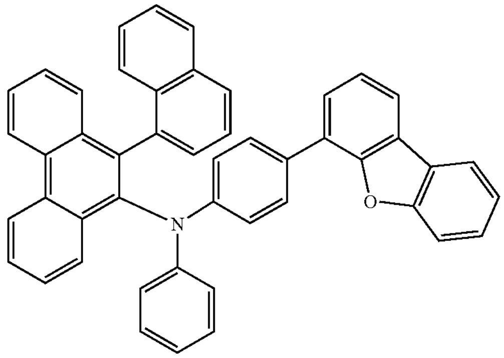
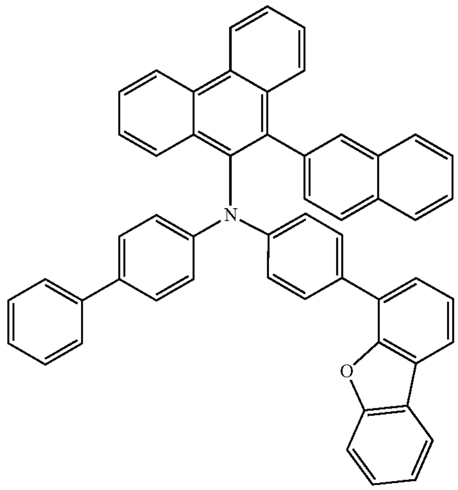
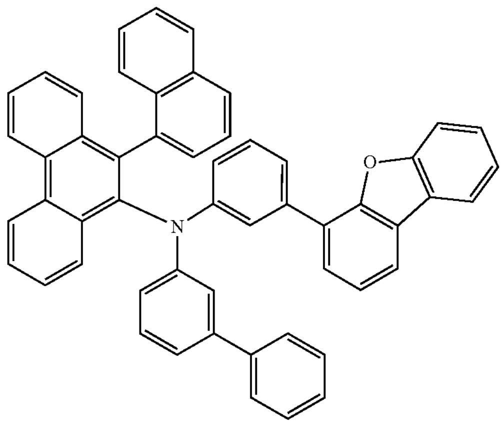
-continued
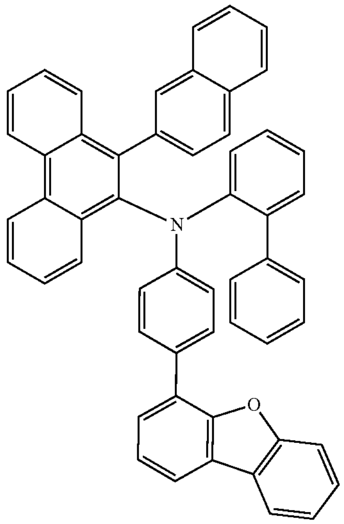
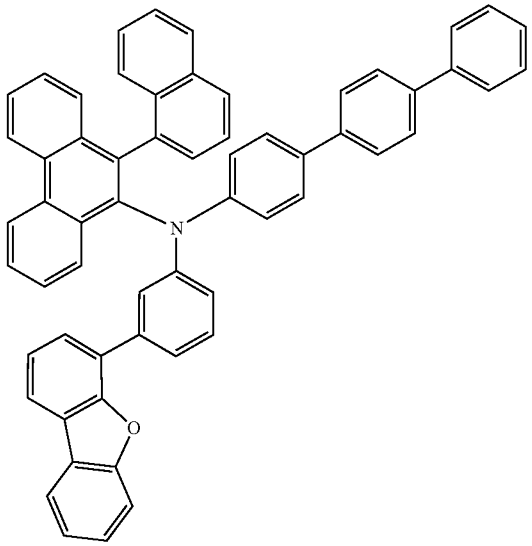
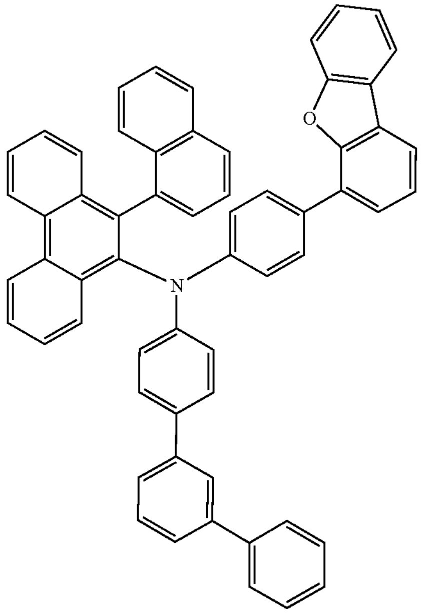

-continued
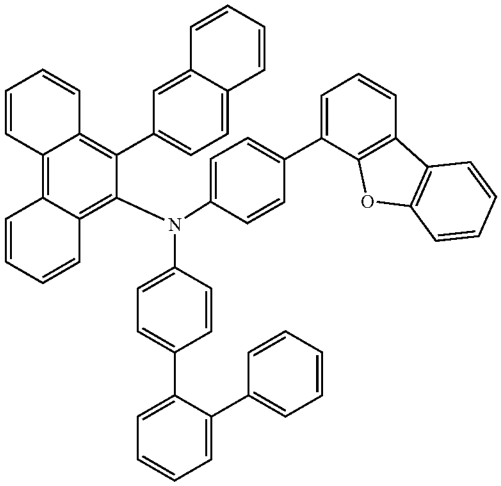
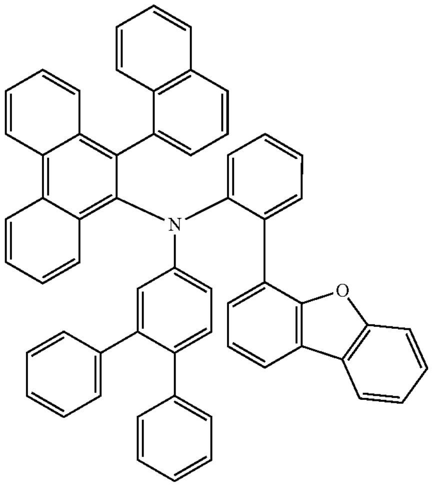
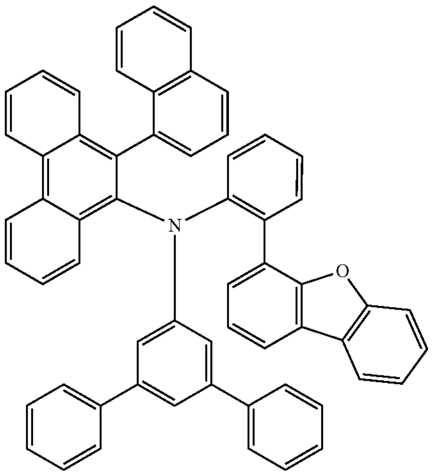
-continued
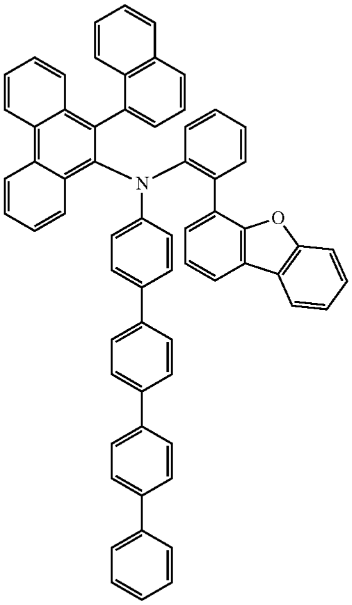
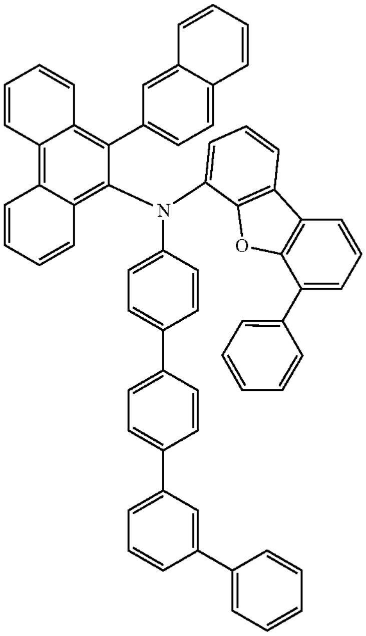

-continued
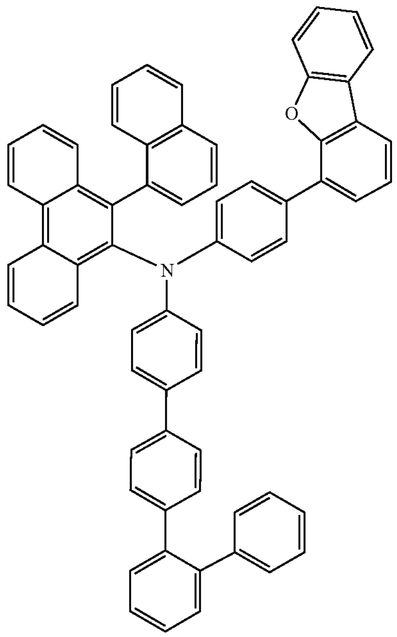
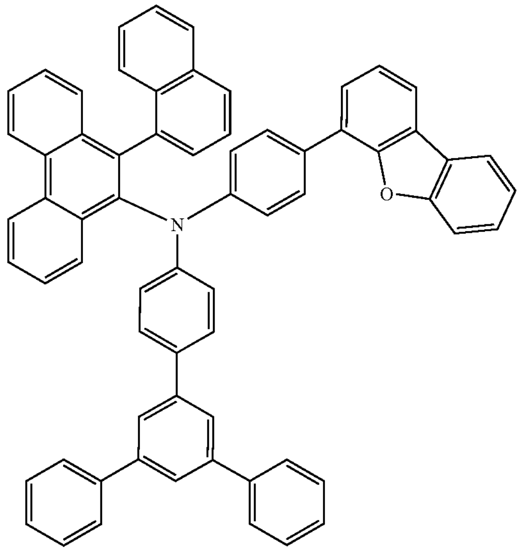
-continued
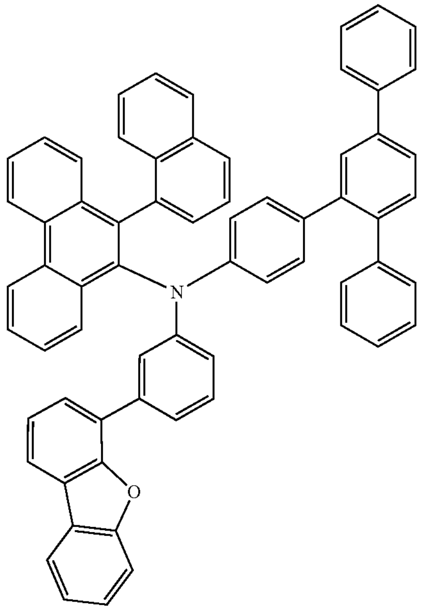
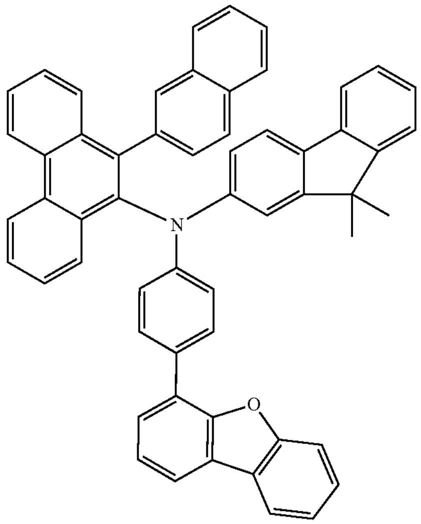
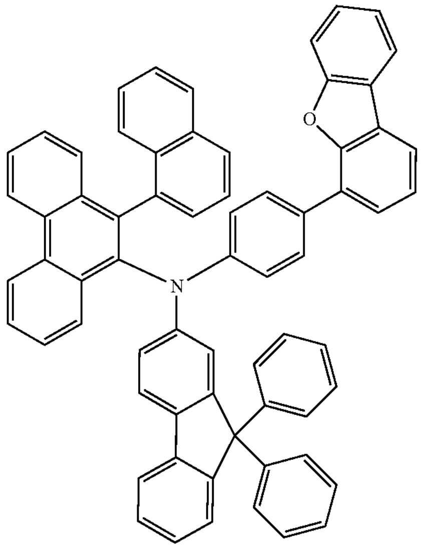

-continued
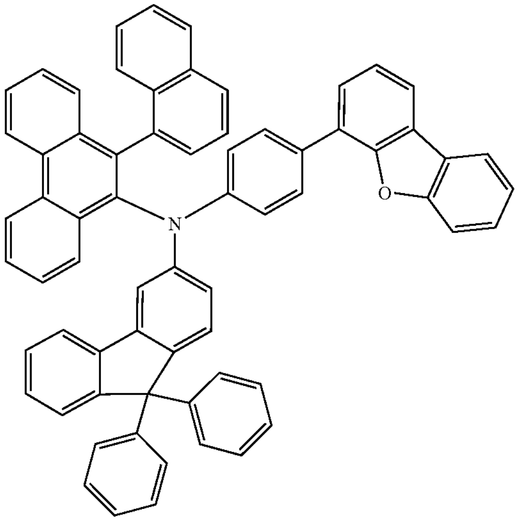
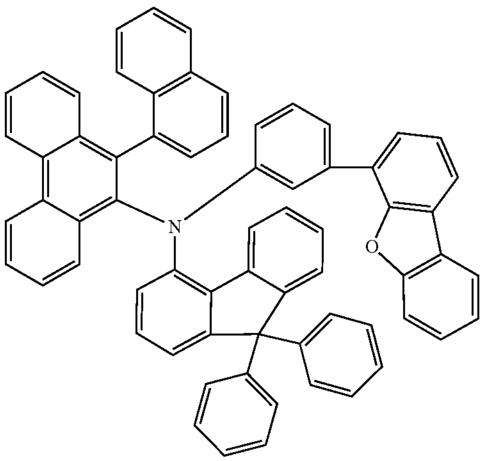
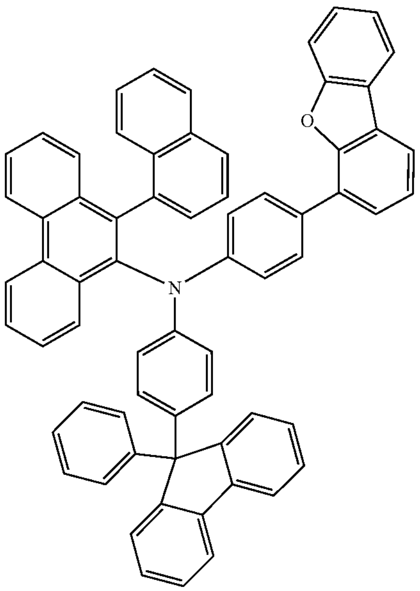
-continued
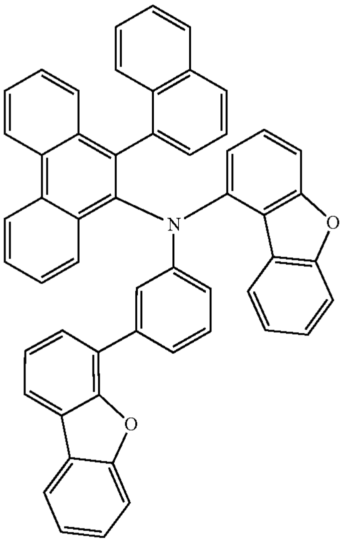
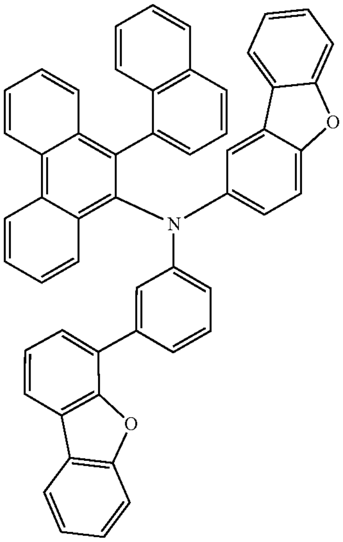
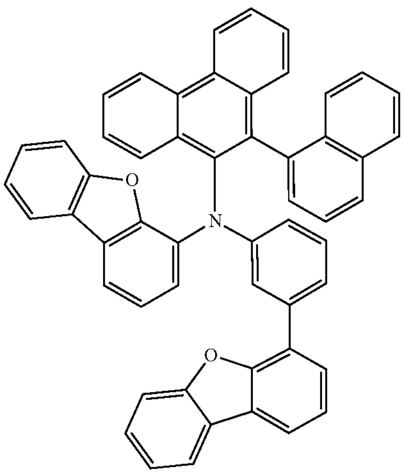

-continued
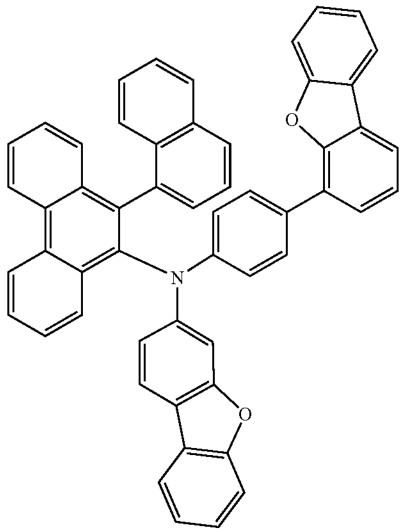
-continued
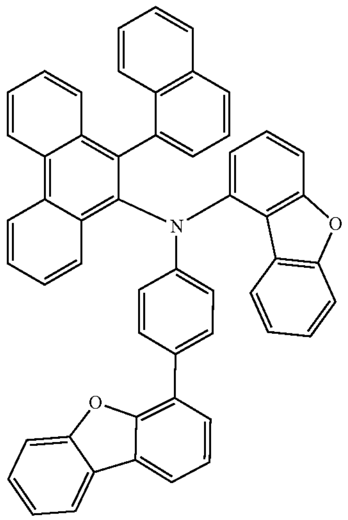
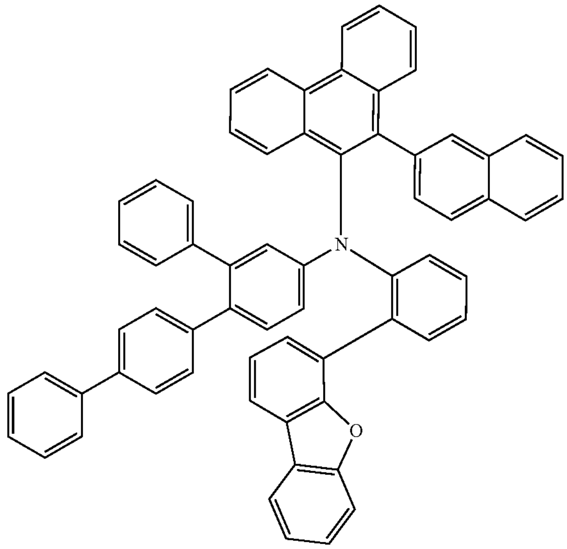
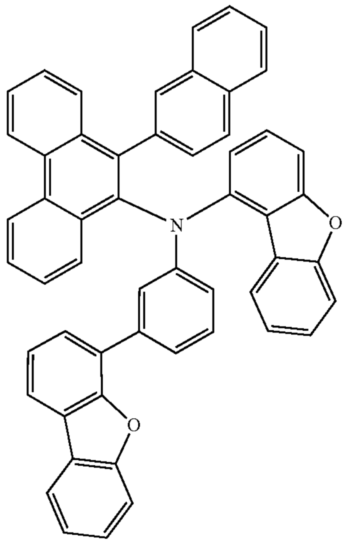
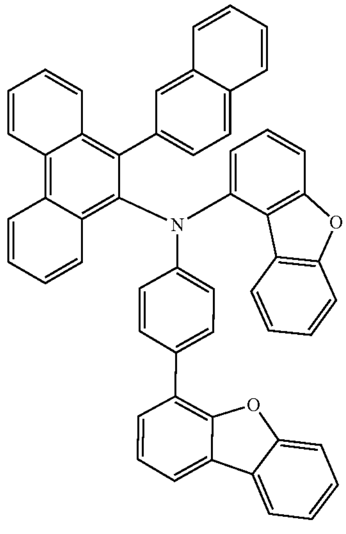
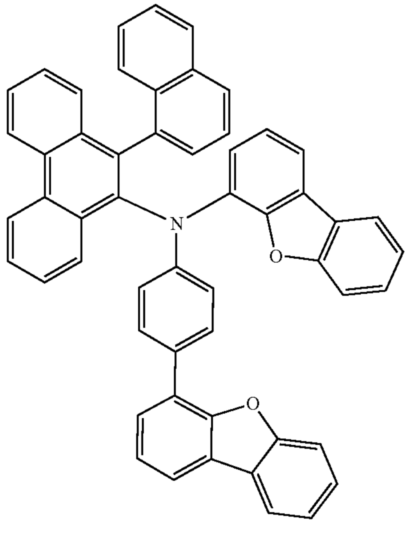

-continued
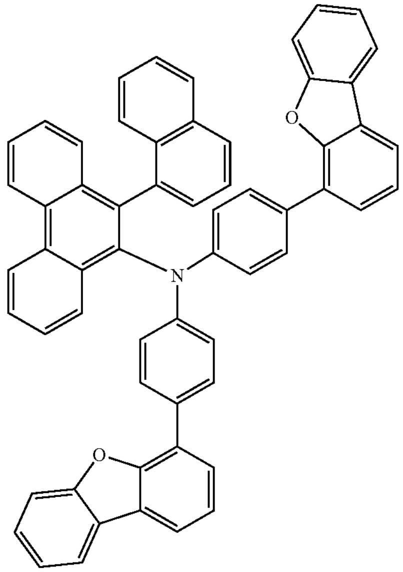
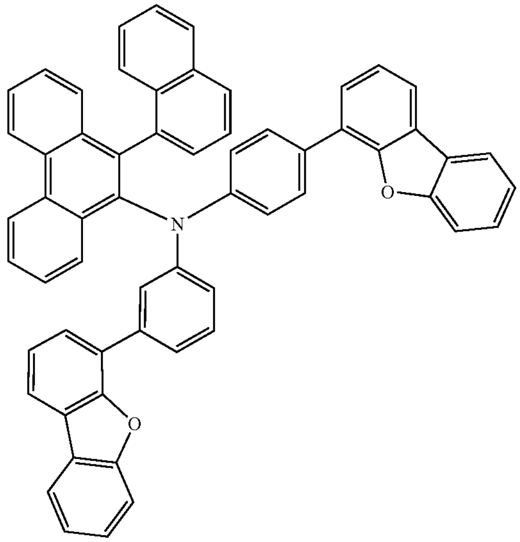
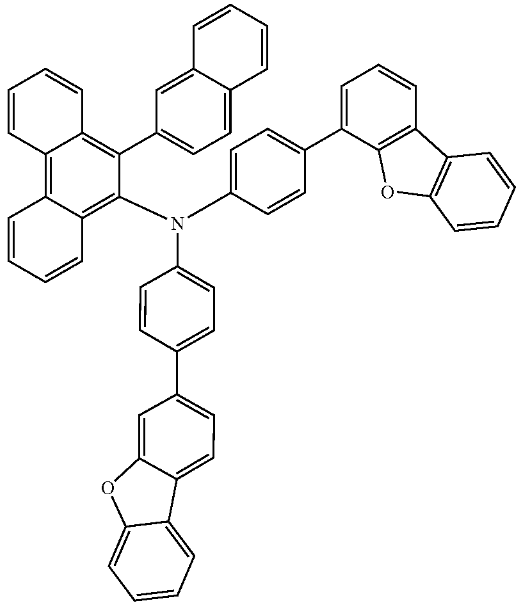
-continued
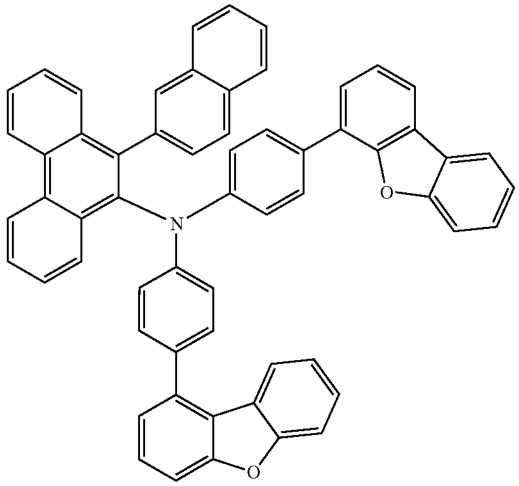
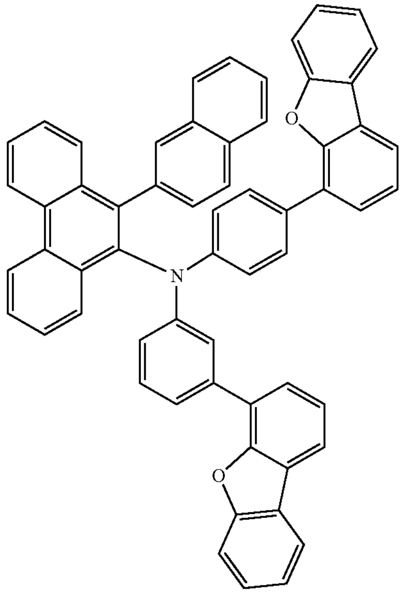
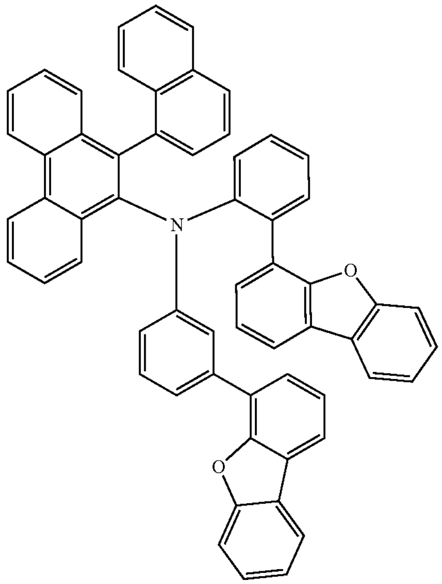

-continued
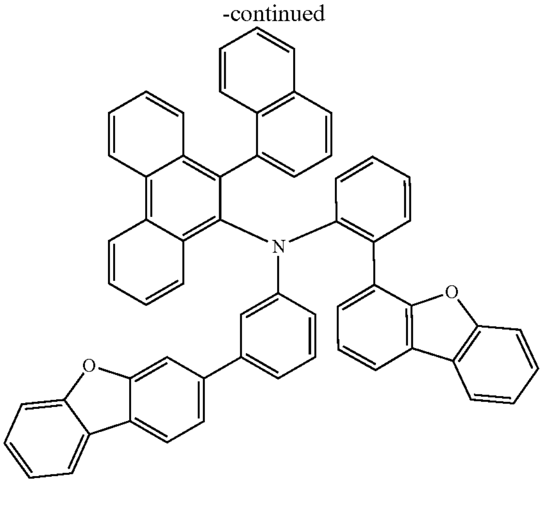
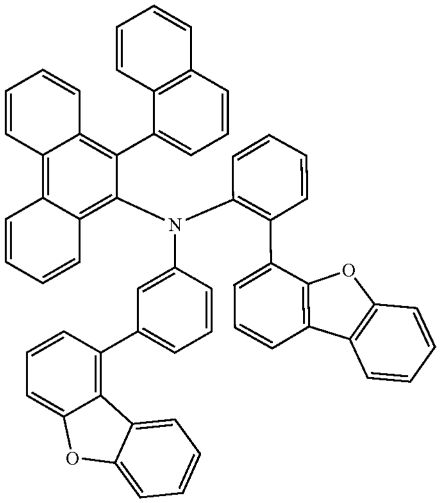
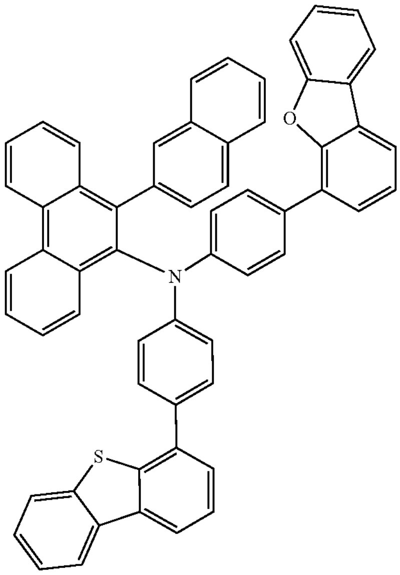
-continued
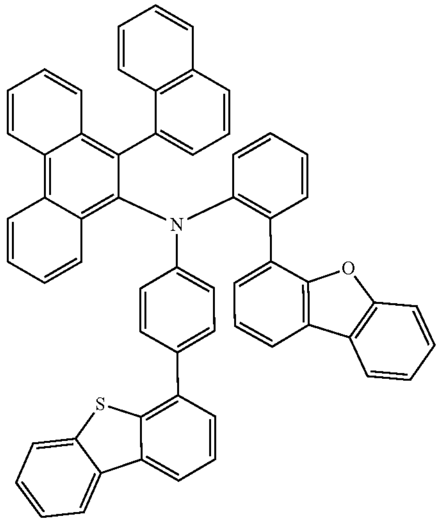
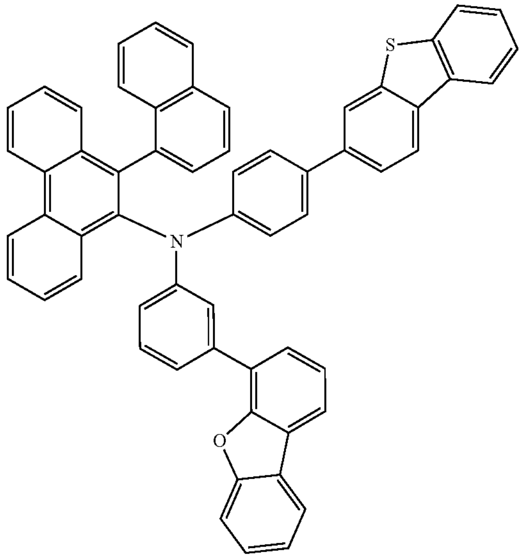
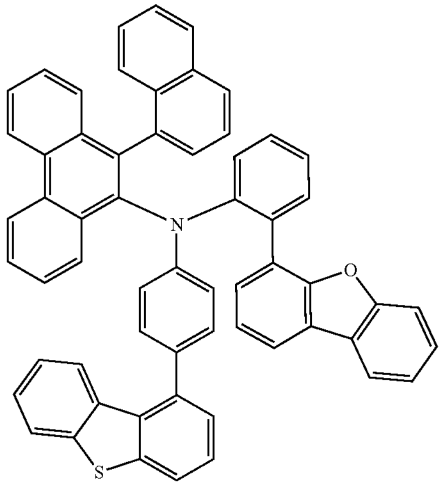 [SMILES: c1ccc(N(c2ccc(-c3cccc4sc5ccccc5c34)cc2)c2c(-c3cccc4ccccc34)c3ccccc3c3ccccc23)c(-c2cccc3c2sc2ccccc23)c1]

-continued
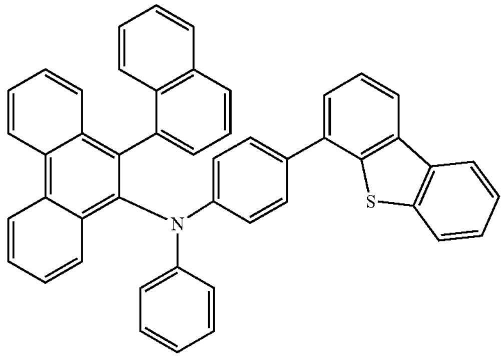
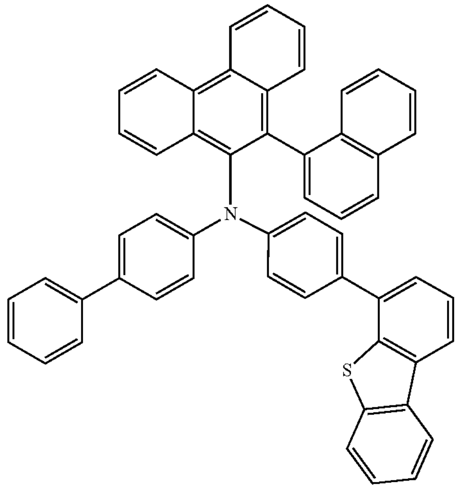
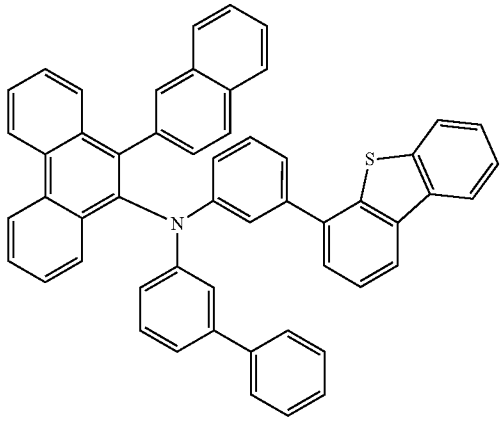
-continued
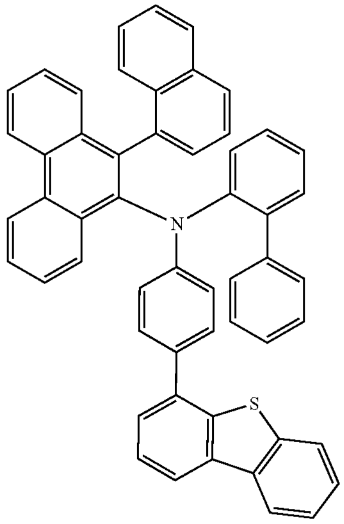
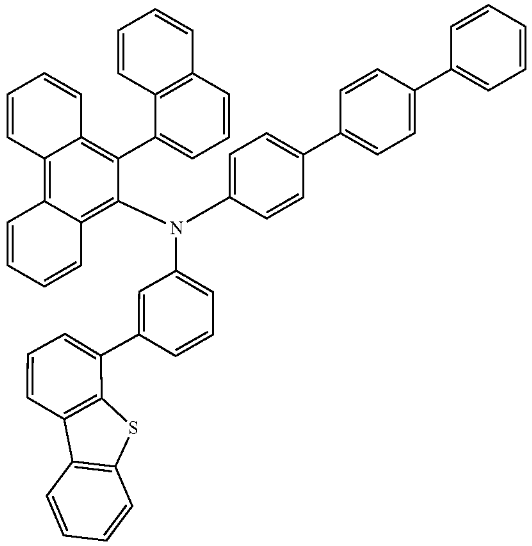
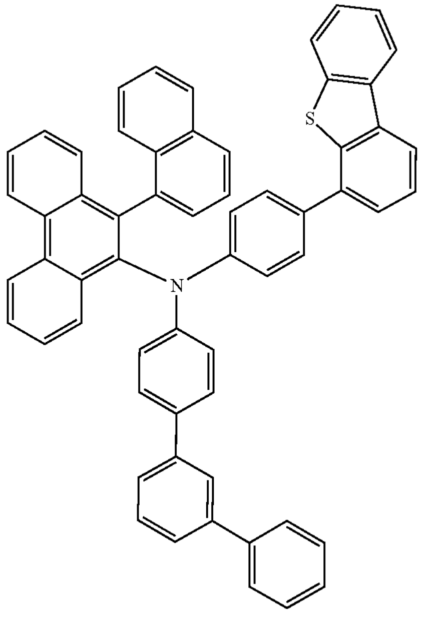

-continued
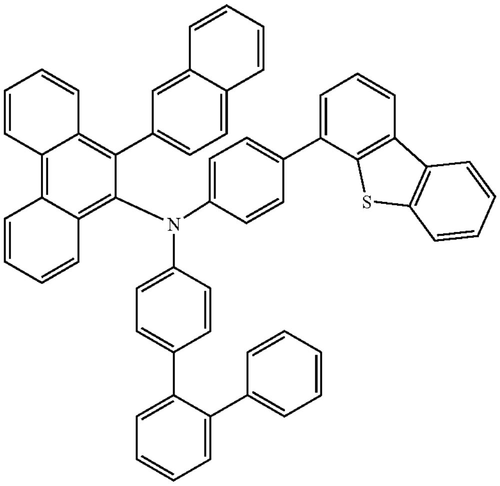
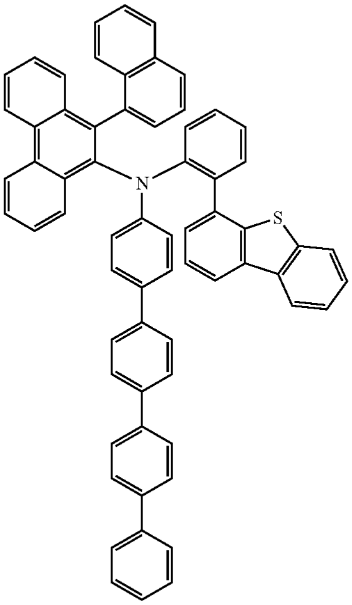
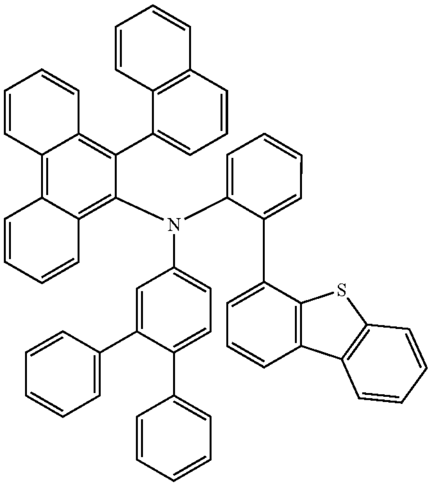
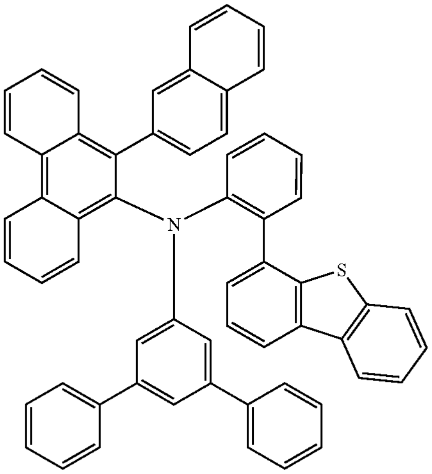
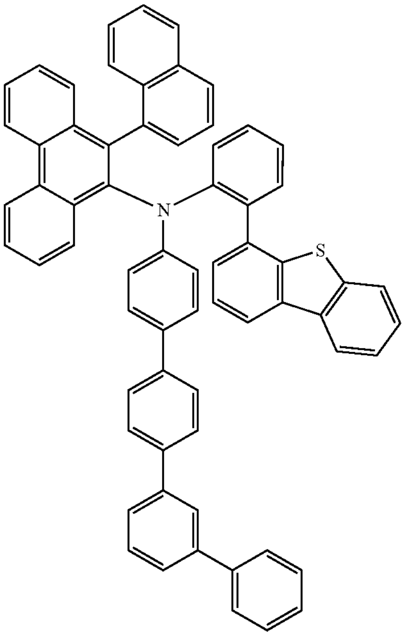

-continued
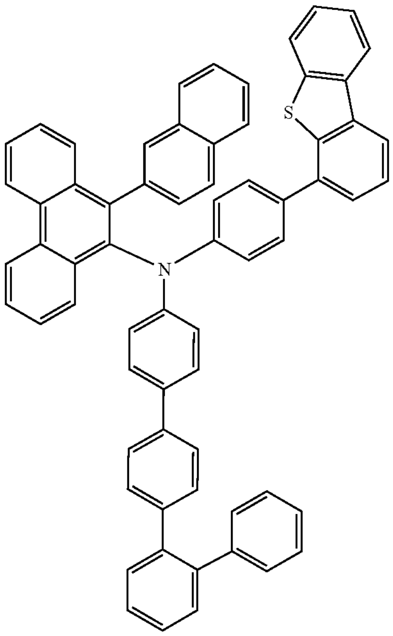
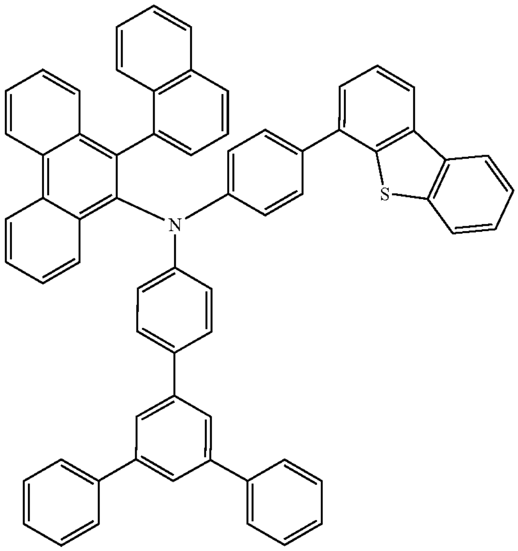
-continued
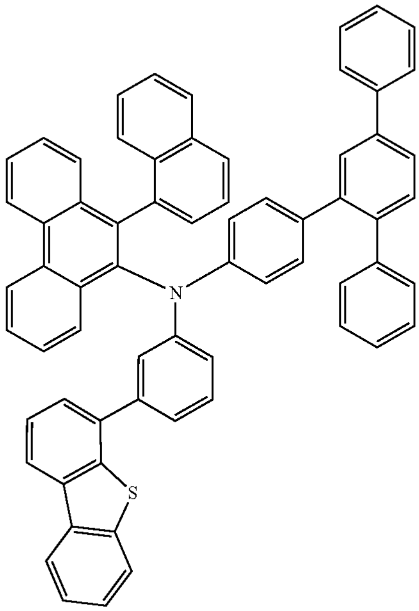
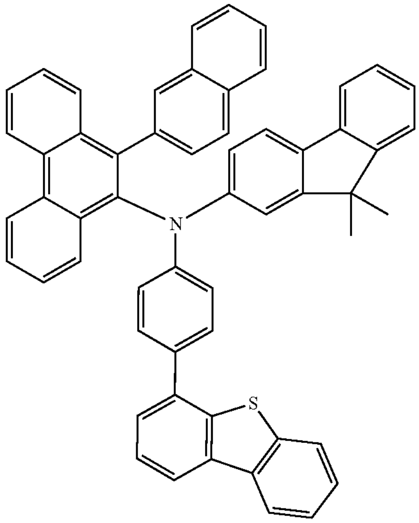
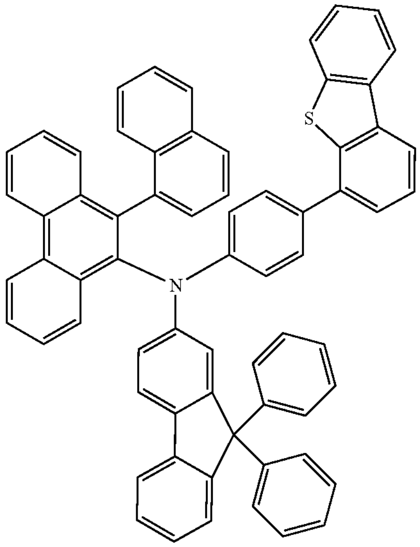

-continued
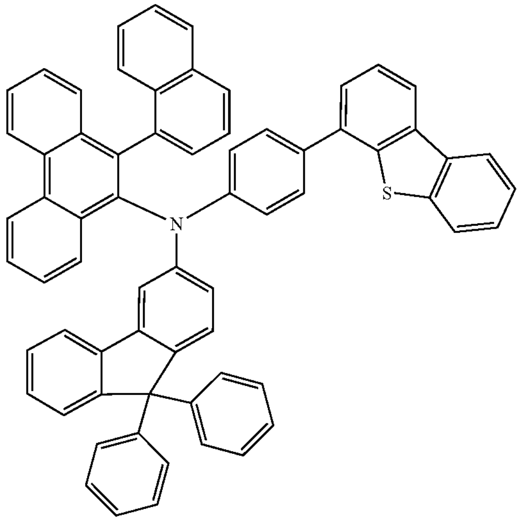
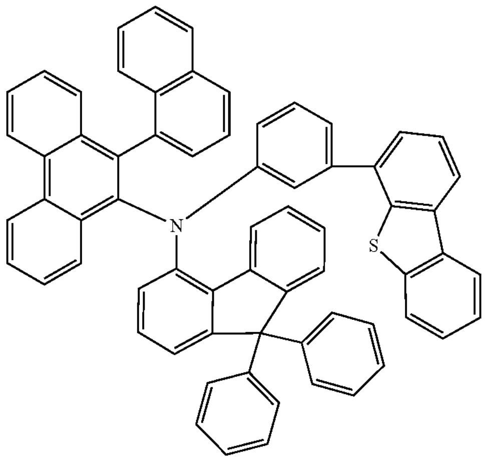
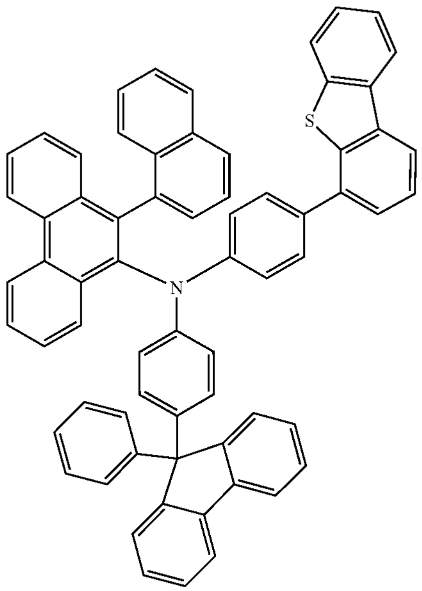
-continued
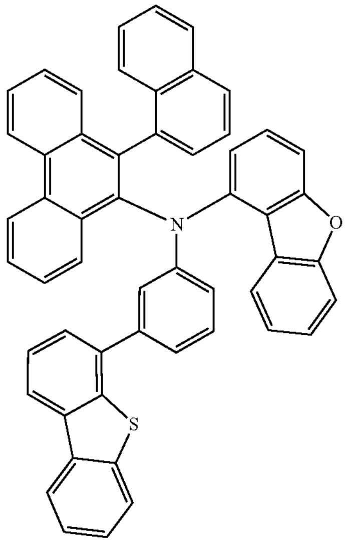
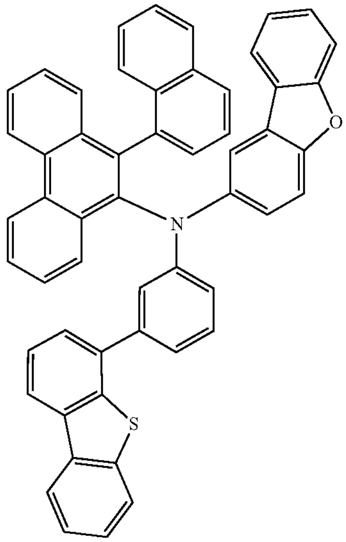
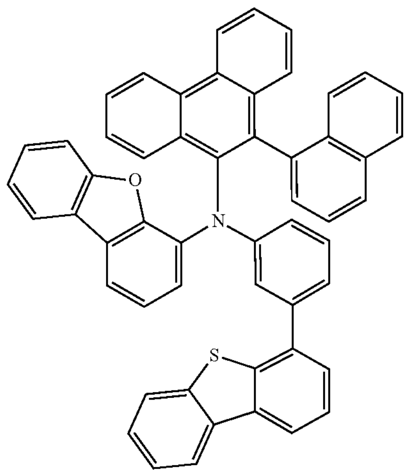

-continued
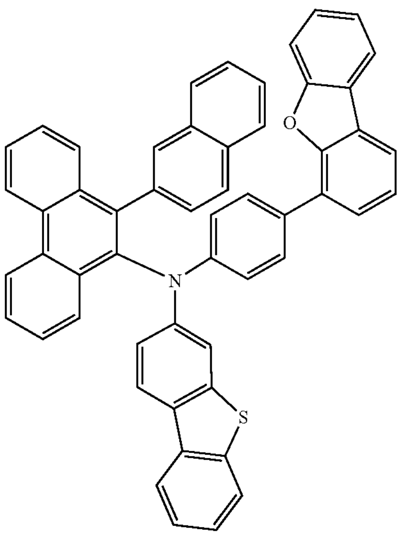
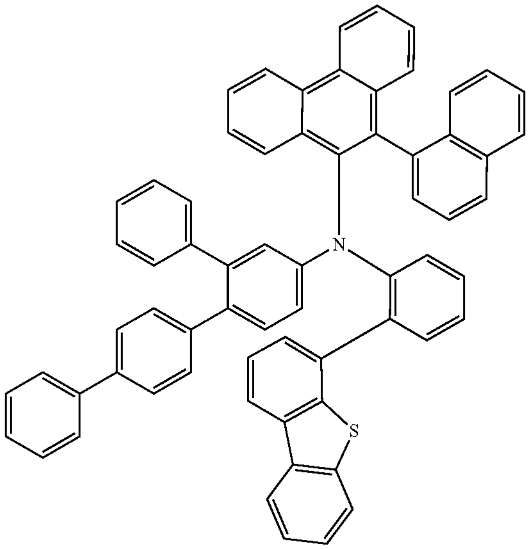
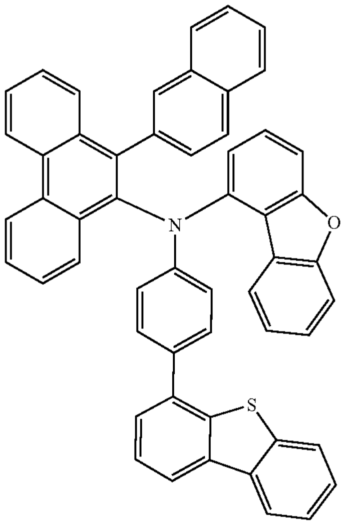
-continued
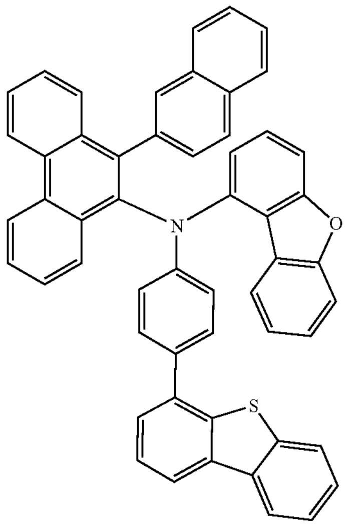
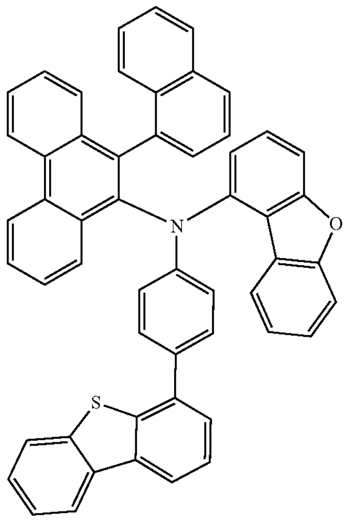
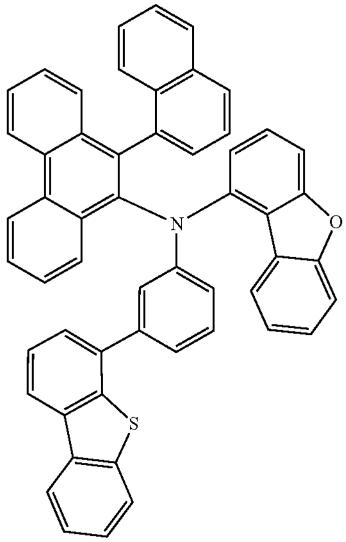

-continued
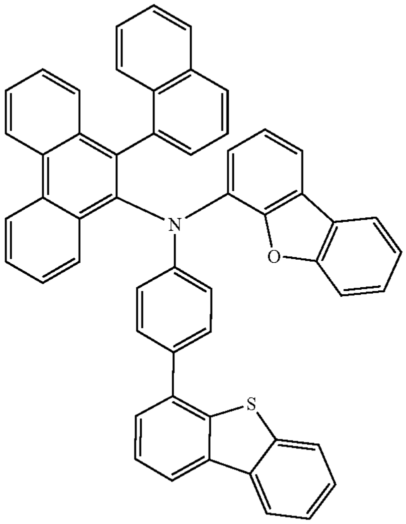
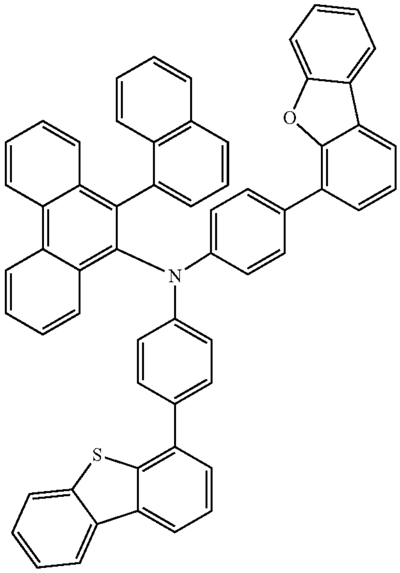
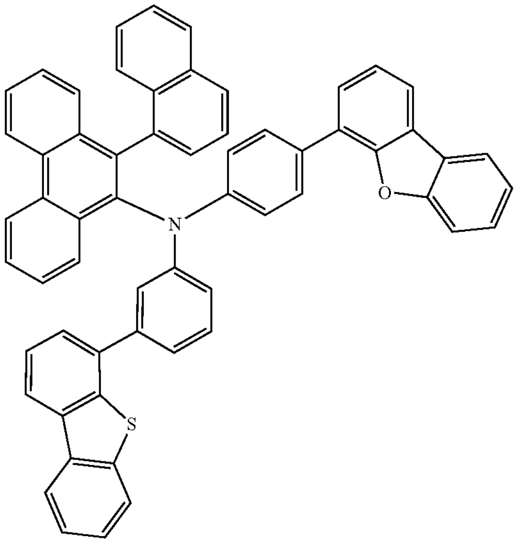
-continued
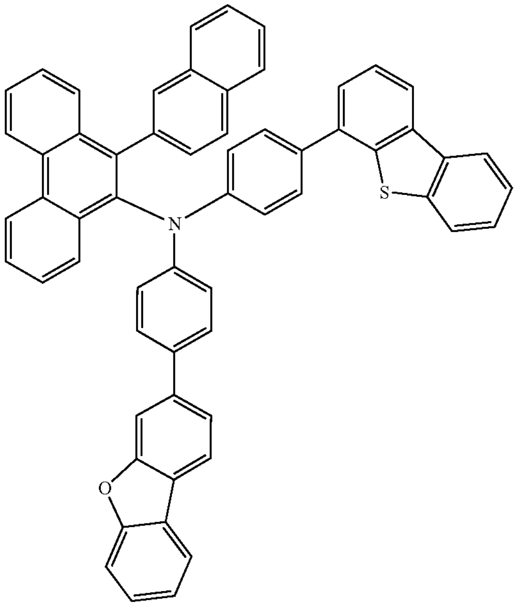
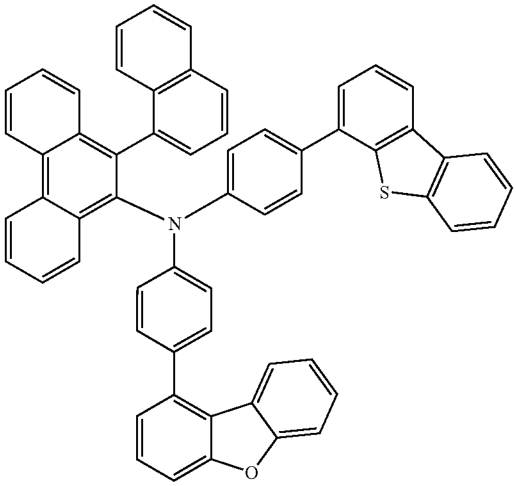
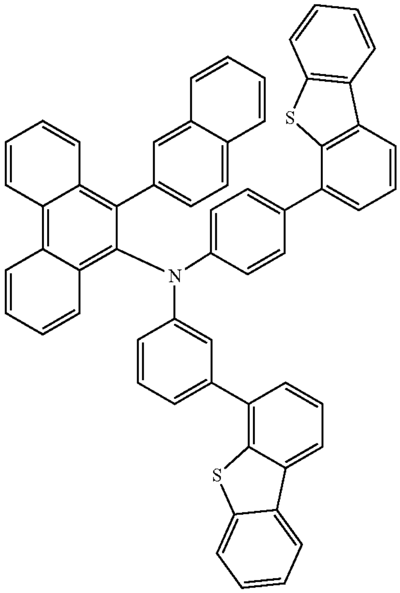

-continued
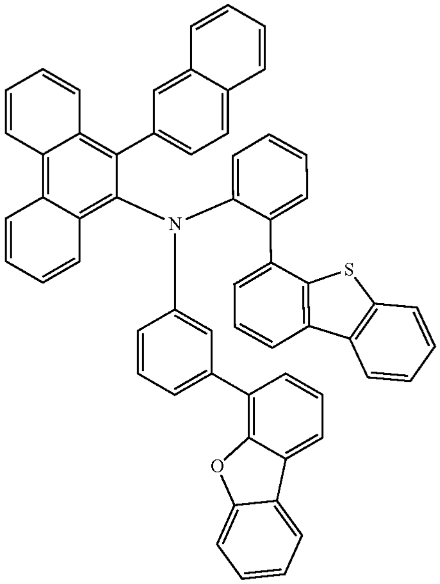
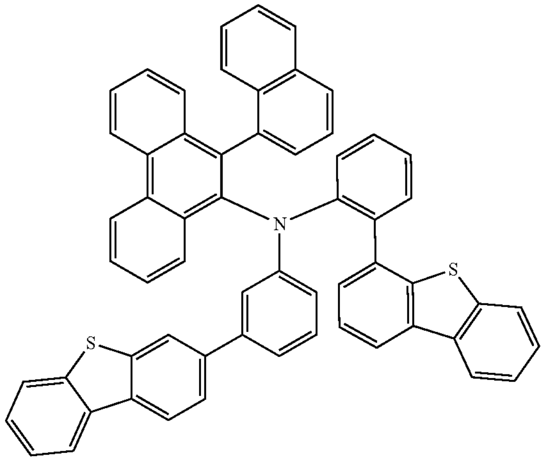
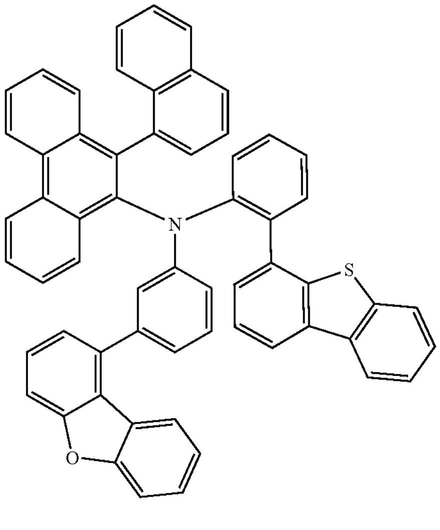
-continued
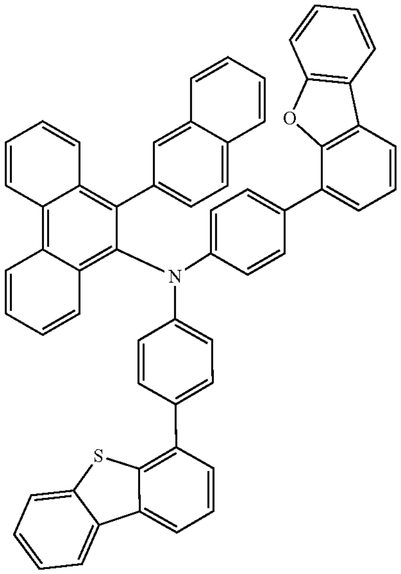
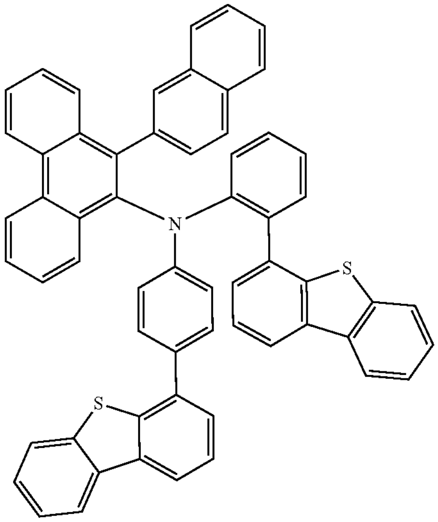
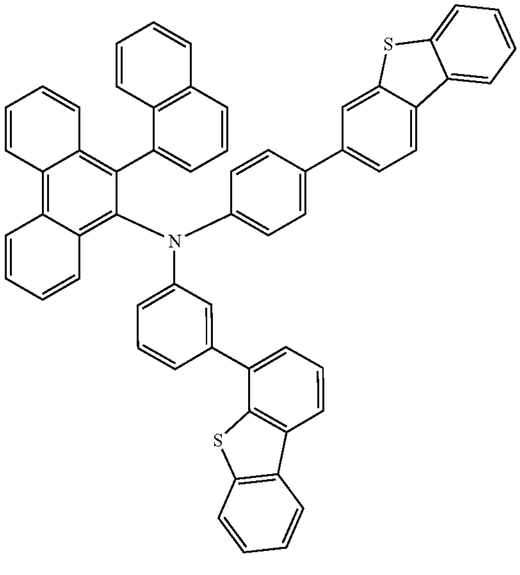

-continued
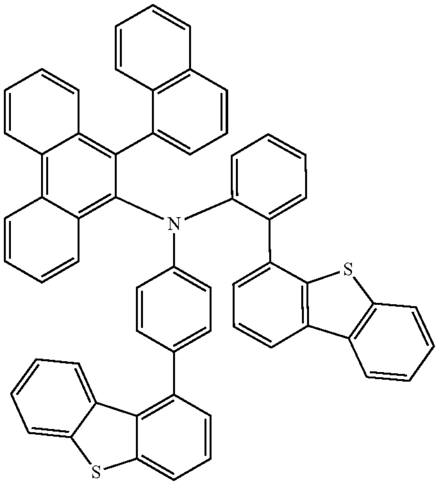
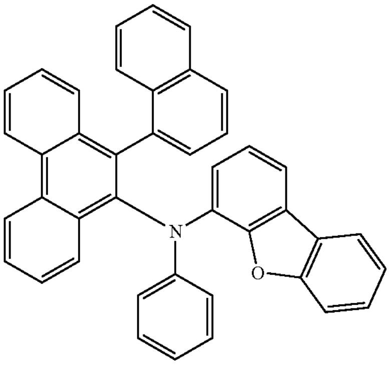
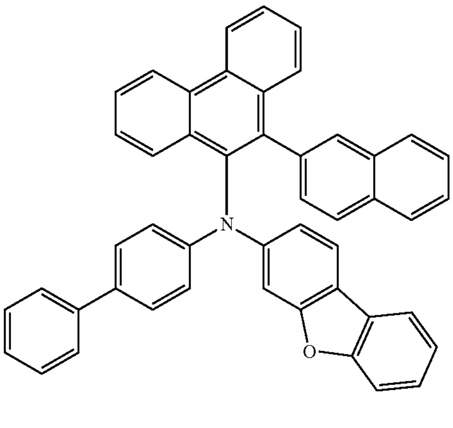
-continued
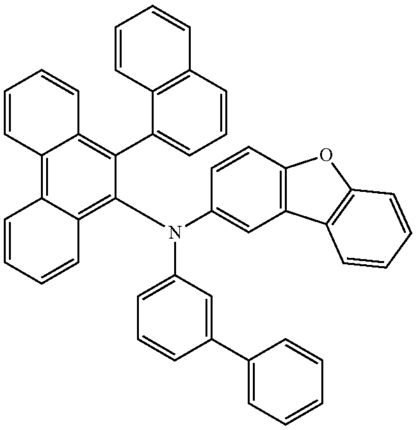
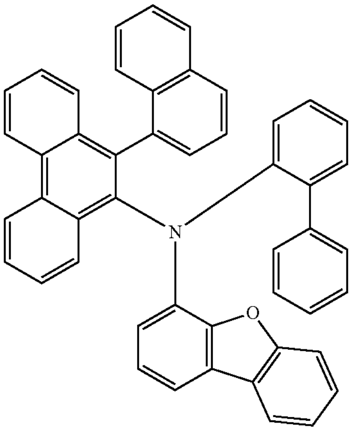
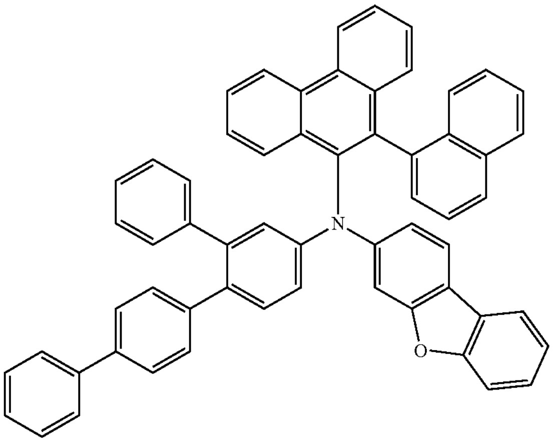

-continued
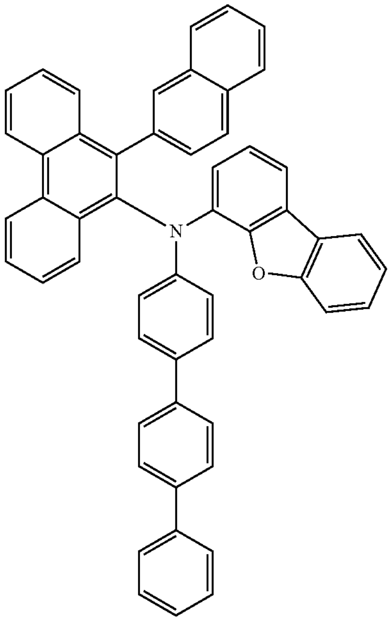
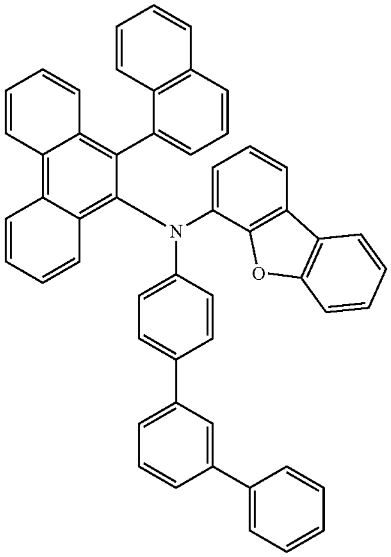
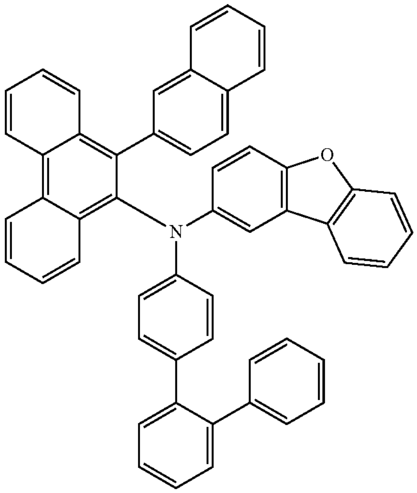
-continued
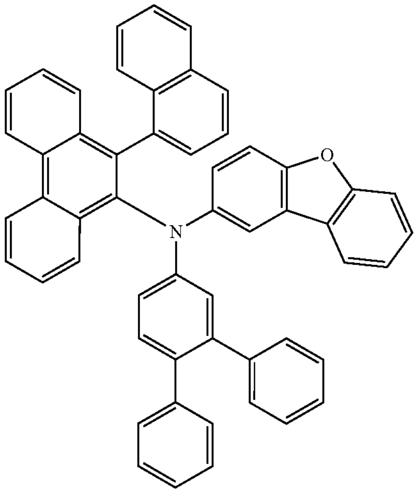
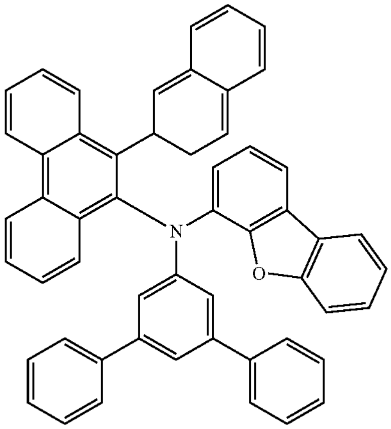
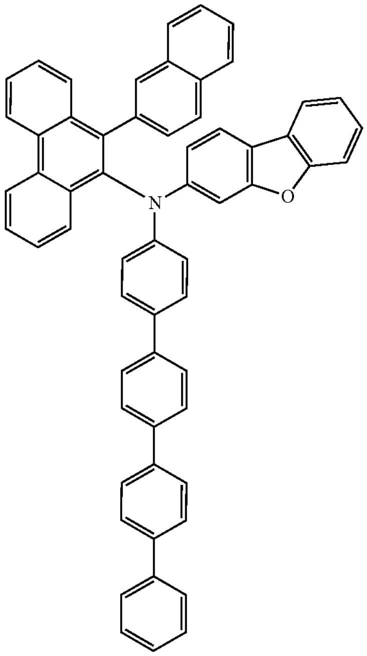

-continued
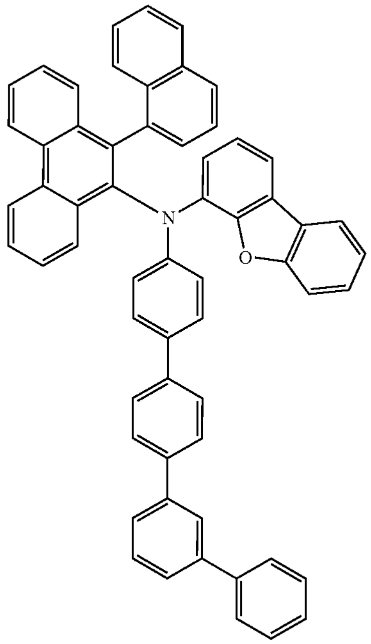
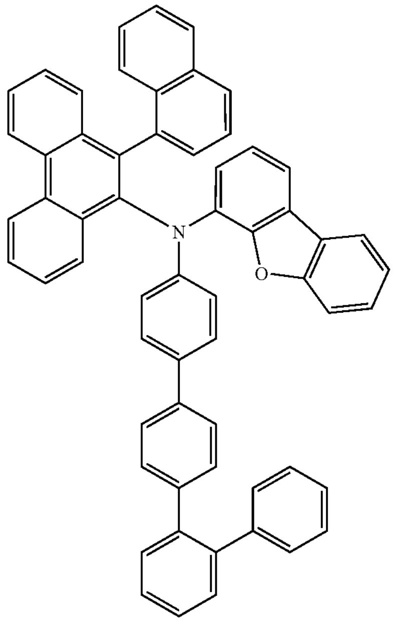
-continued
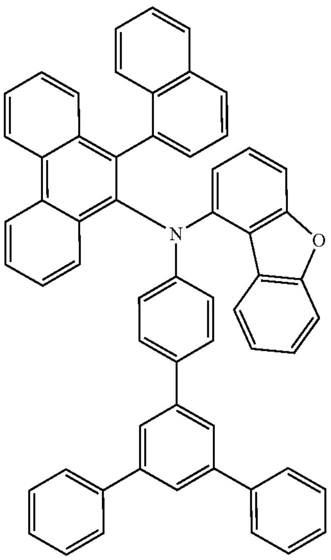
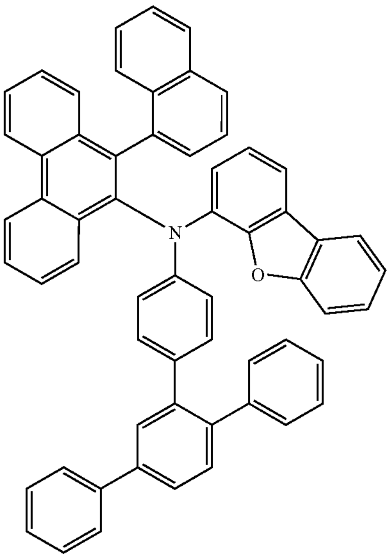
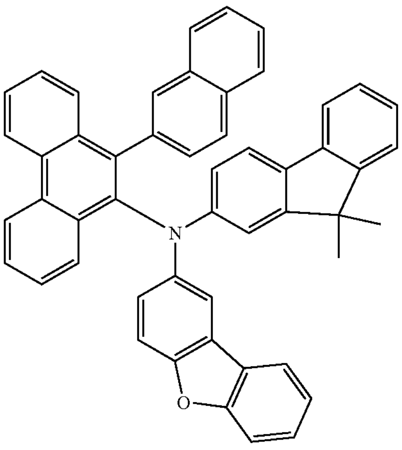

-continued
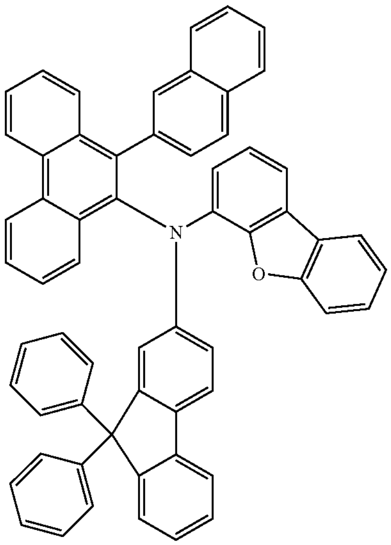
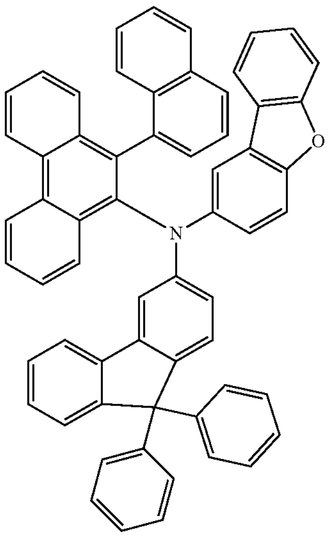
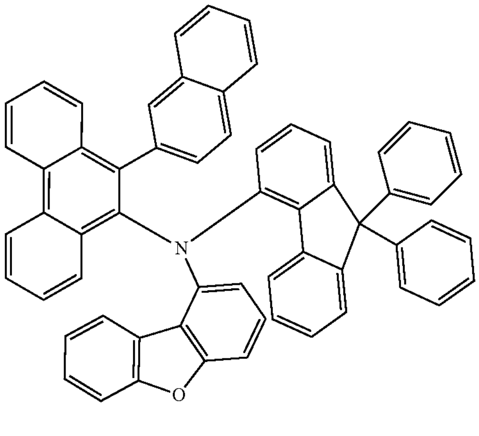
-continued
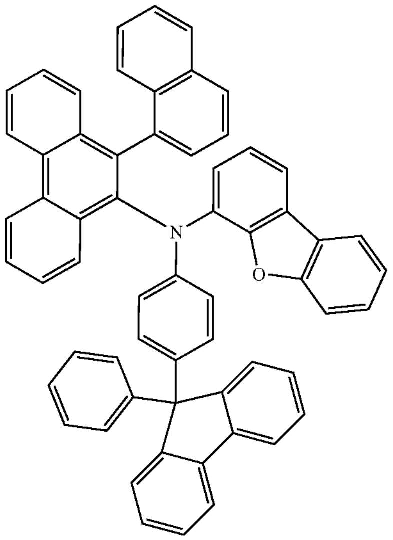
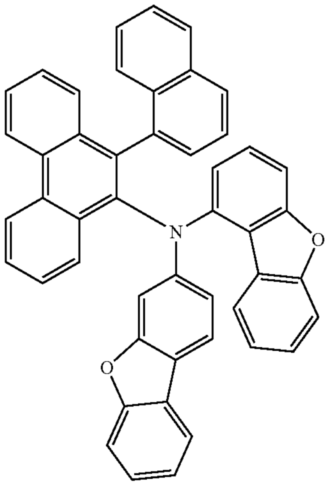
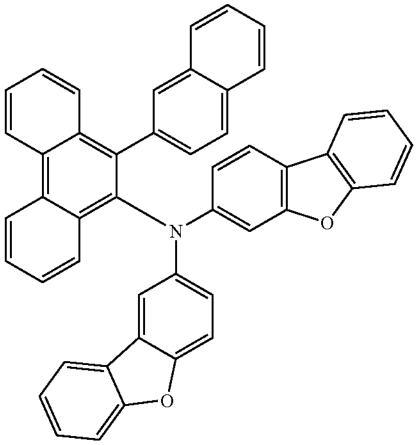

-continued
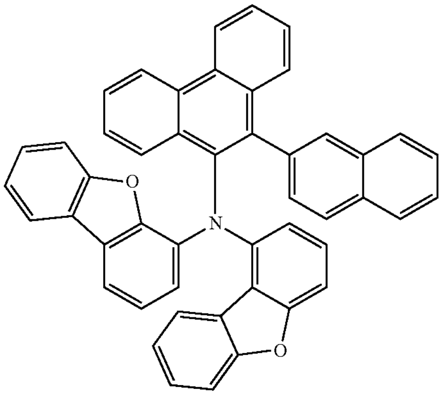
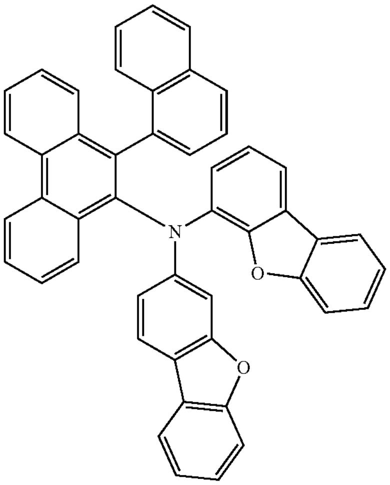
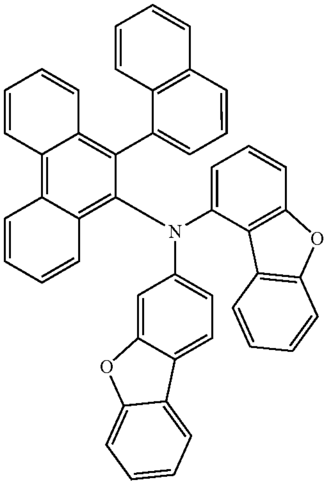
-continued
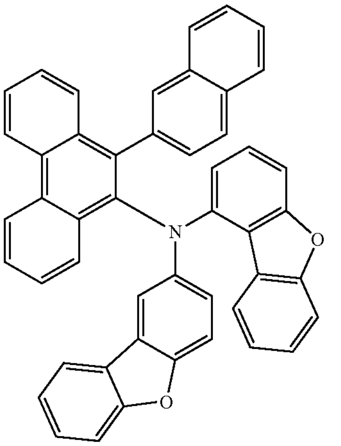
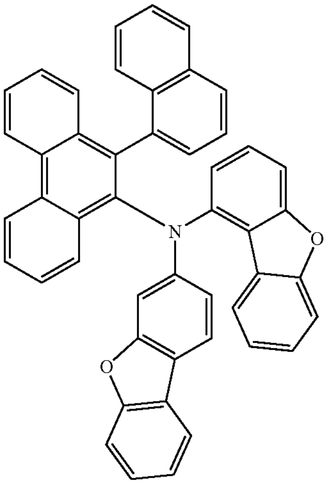
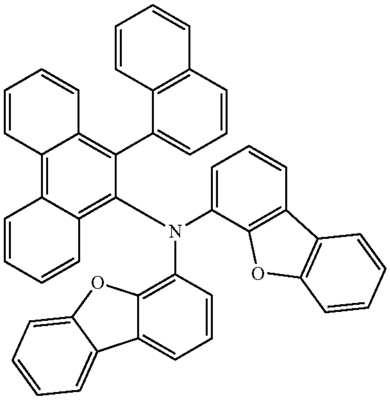

-continued
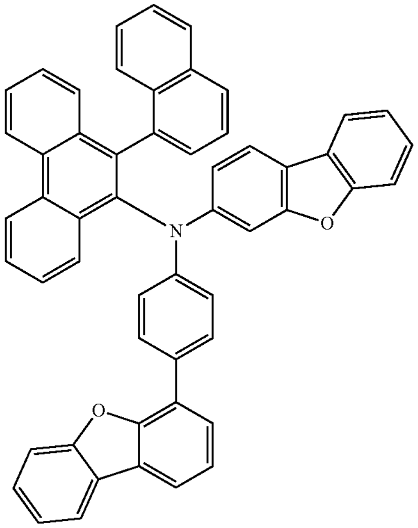
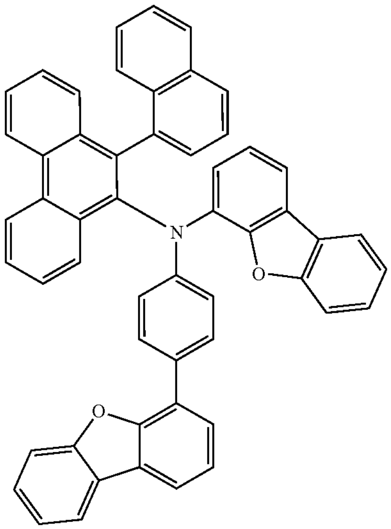
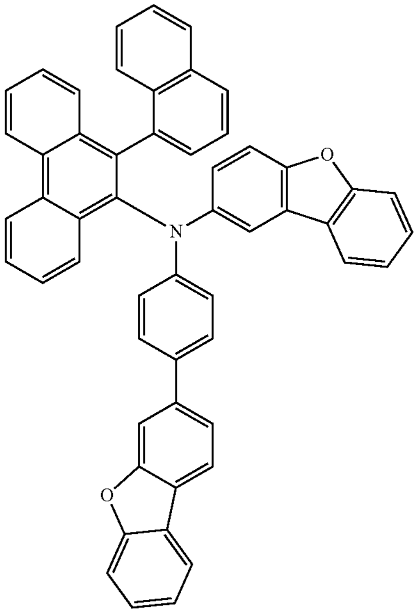
-continued
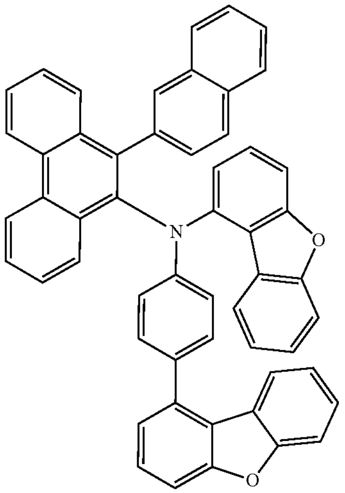
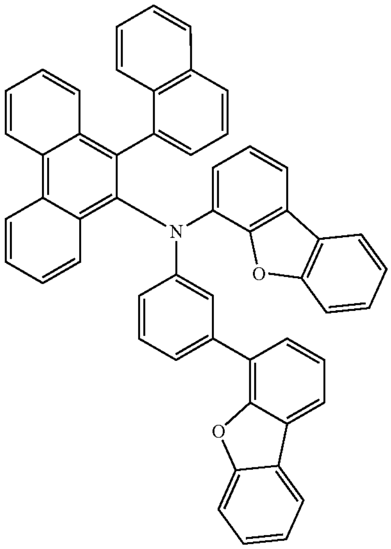
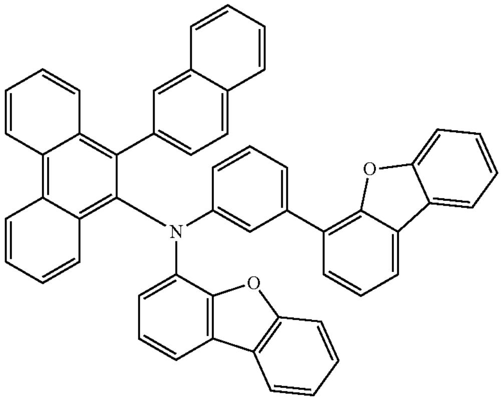

-continued
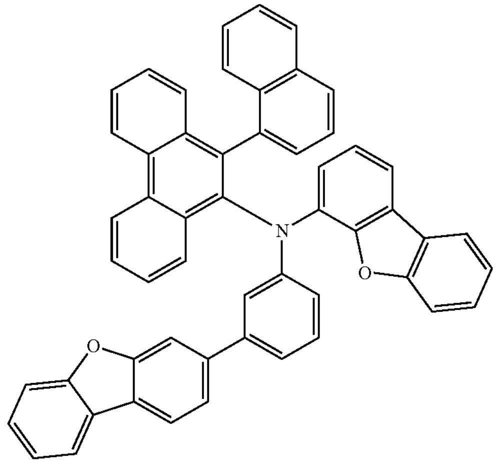
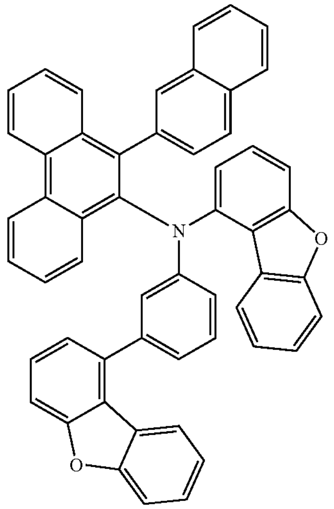
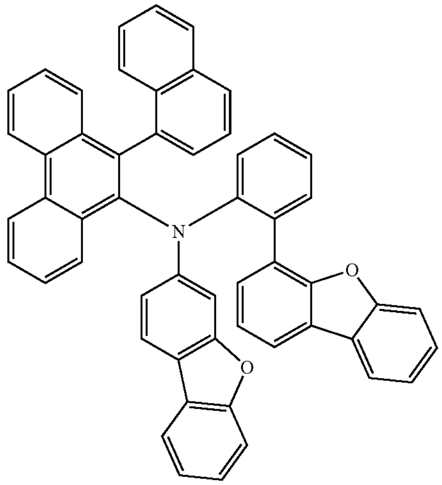
-continued
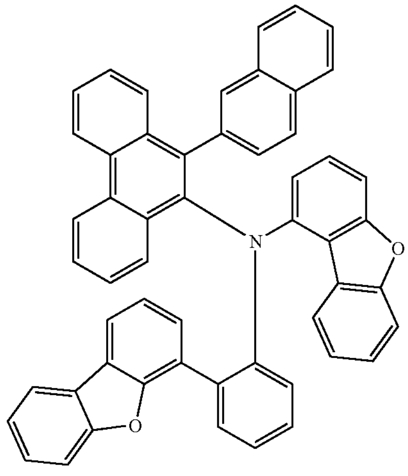
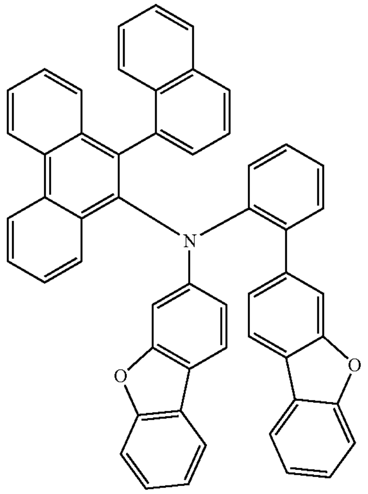
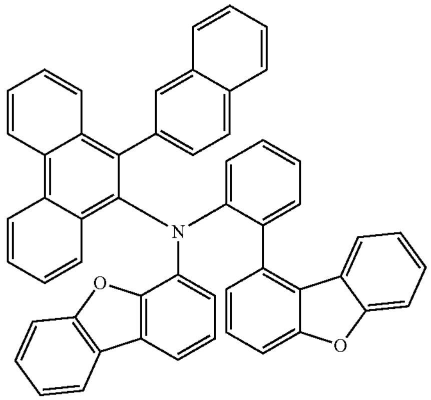

-continued
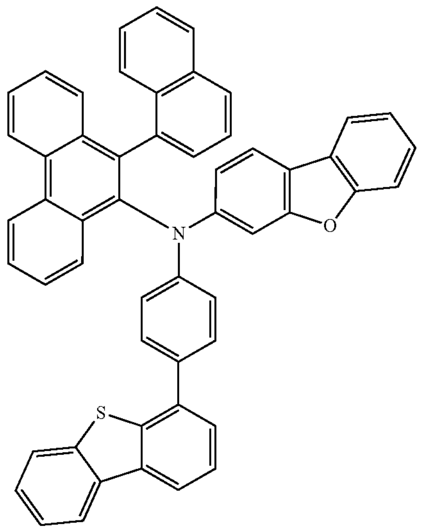
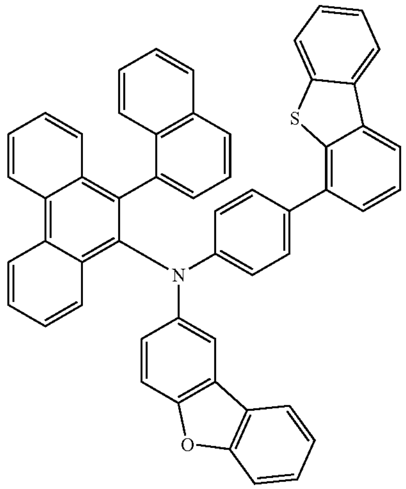
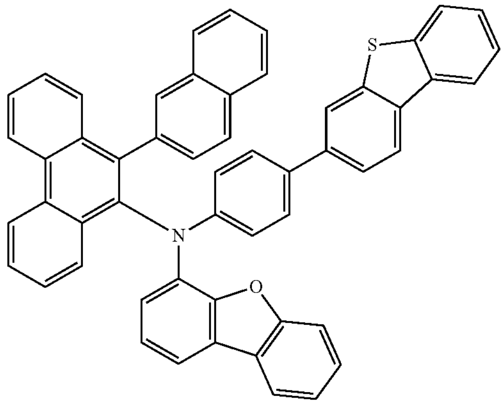
-continued
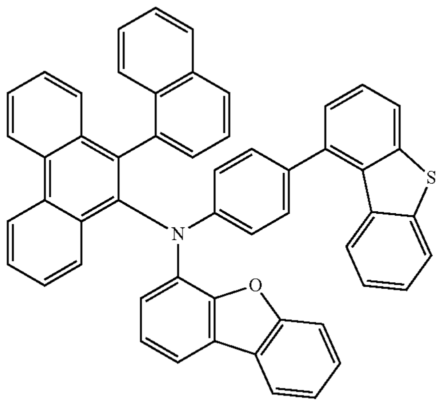
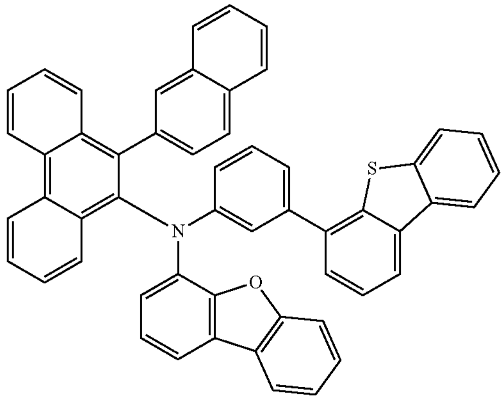
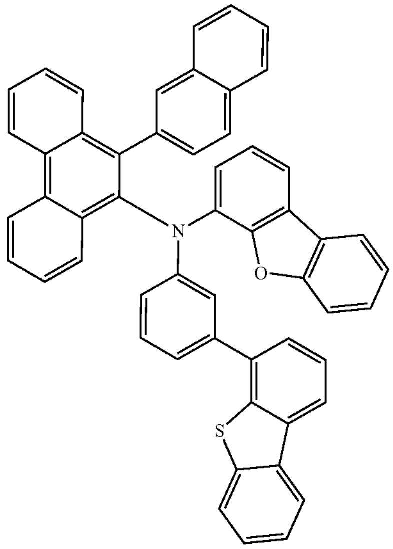

-continued
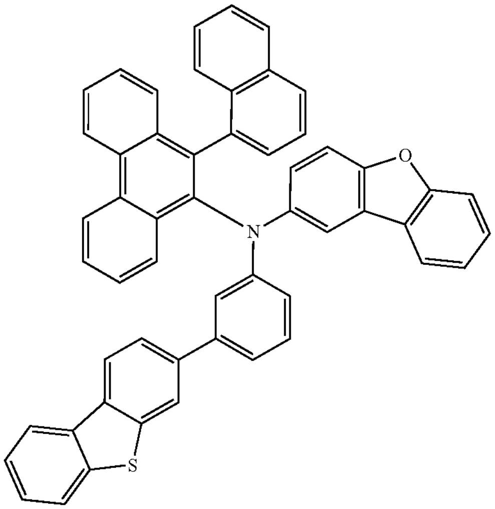
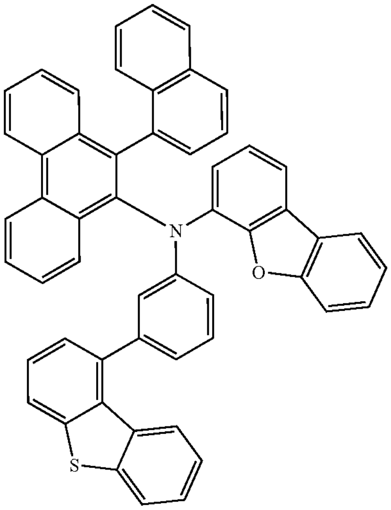
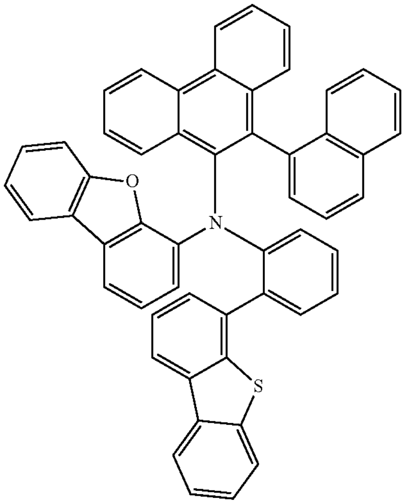
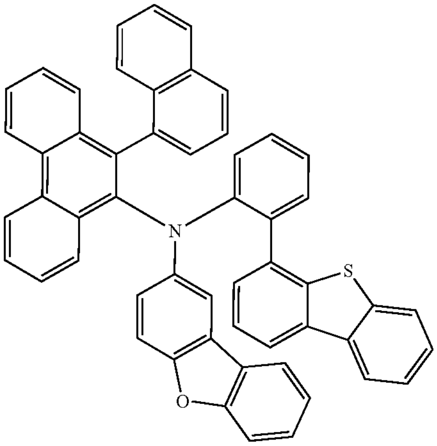
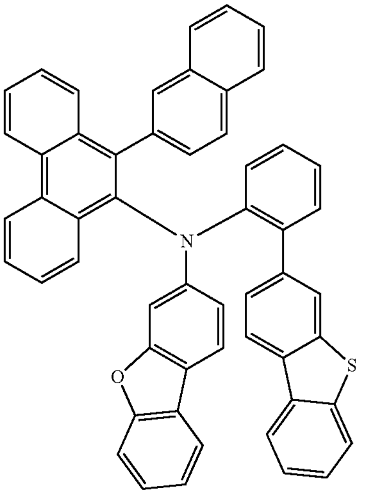
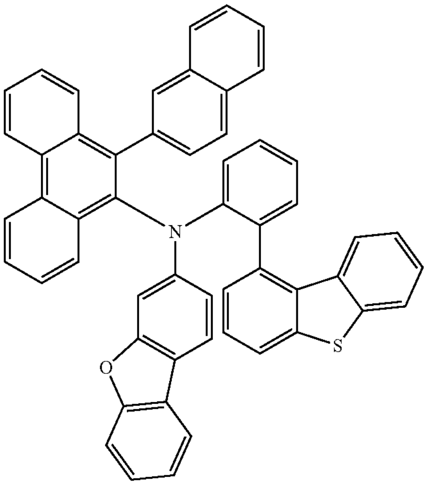
-continued -continued
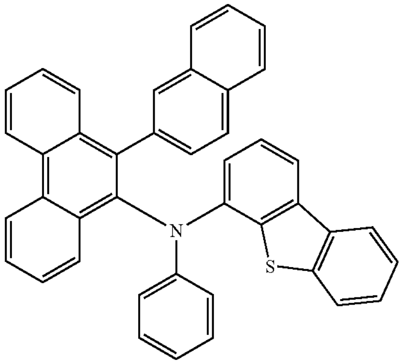
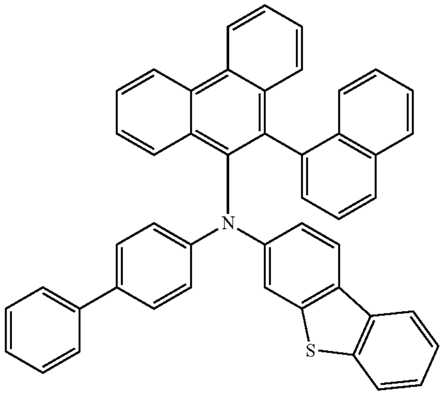
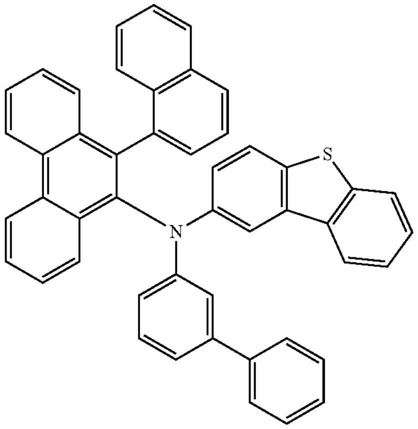
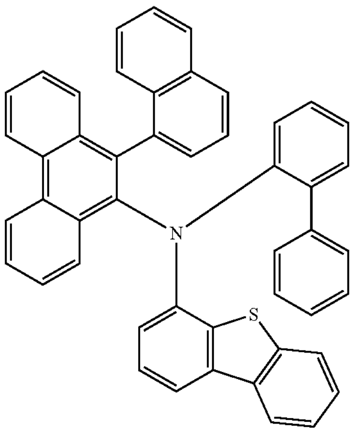
-continued
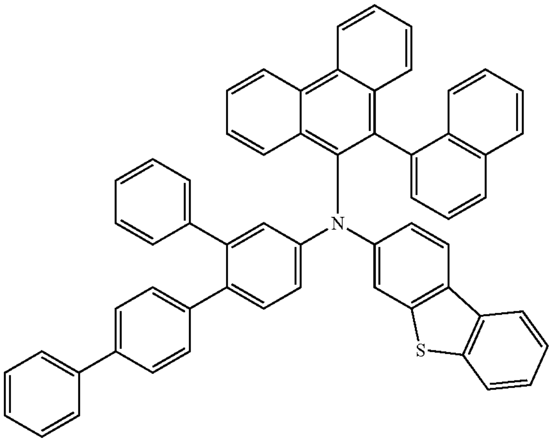
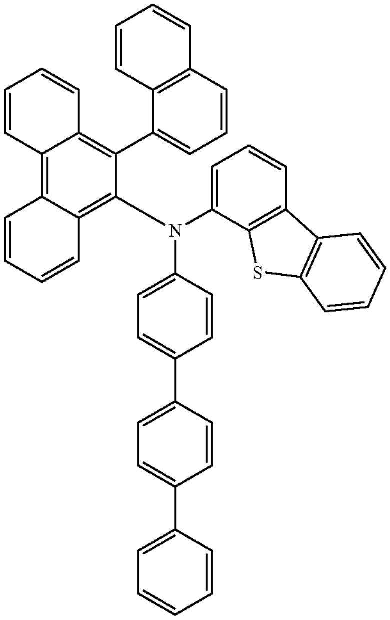
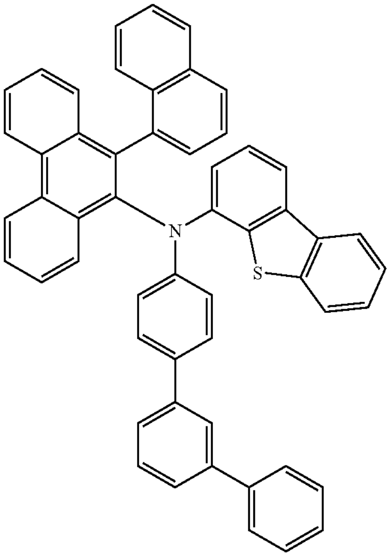

-continued
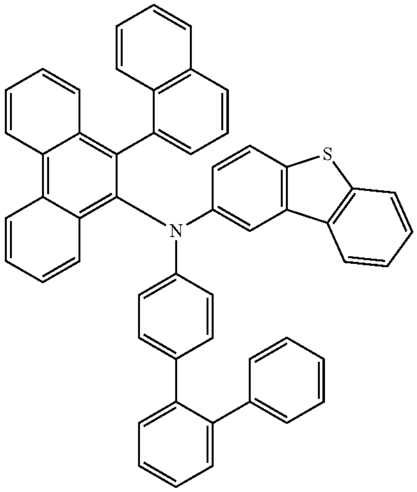
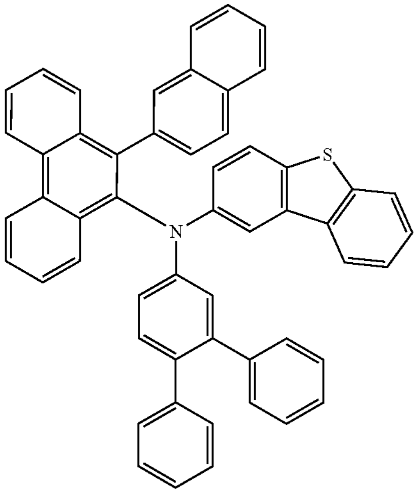
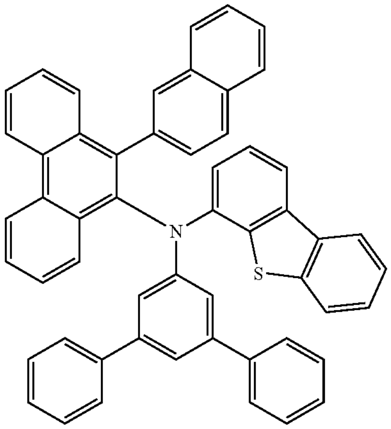
-continued
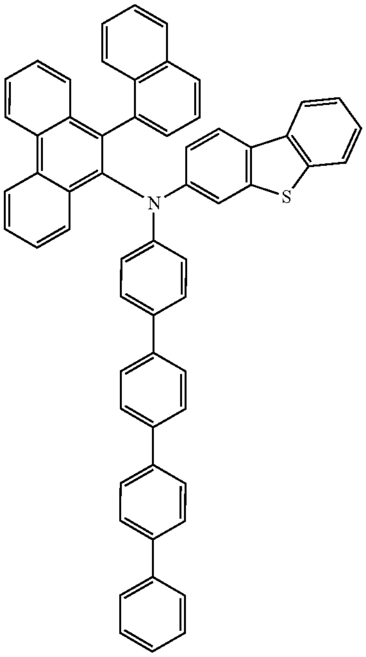
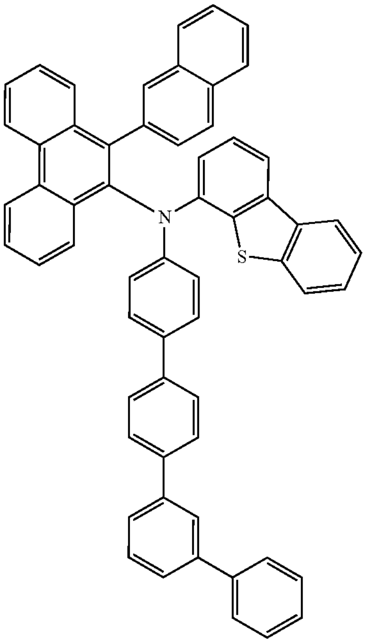

-continued
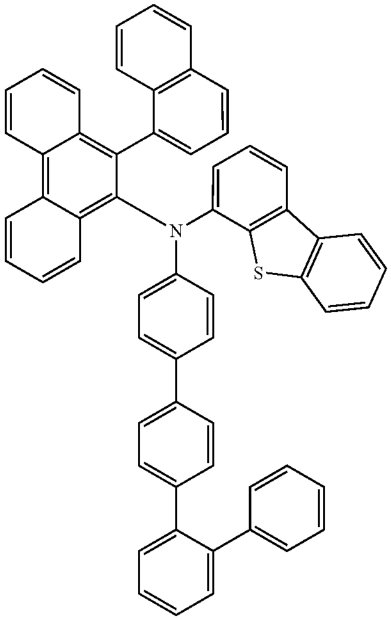
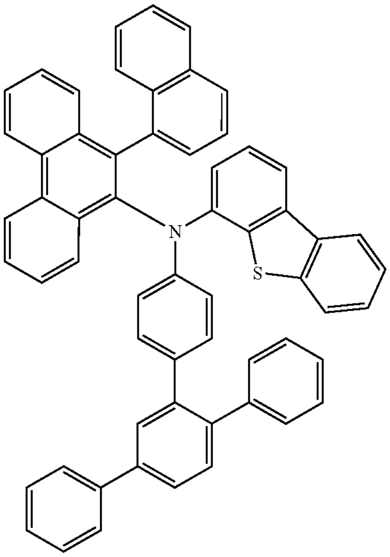
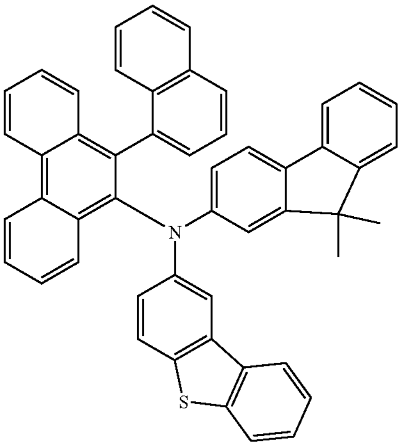
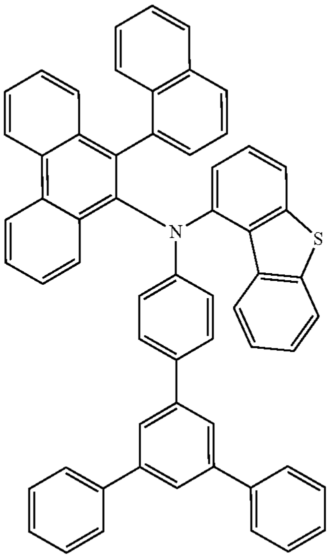
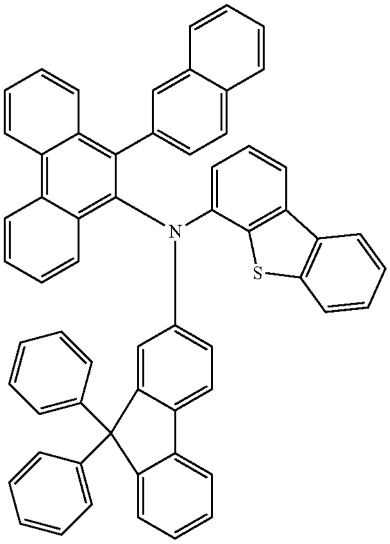
-continued -continued
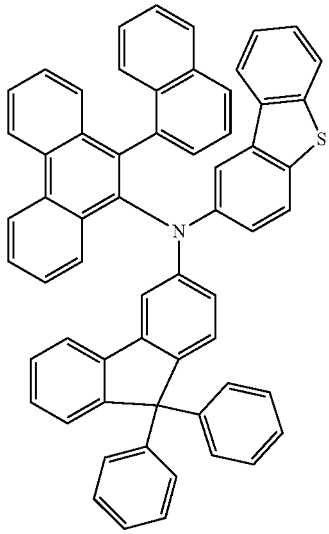
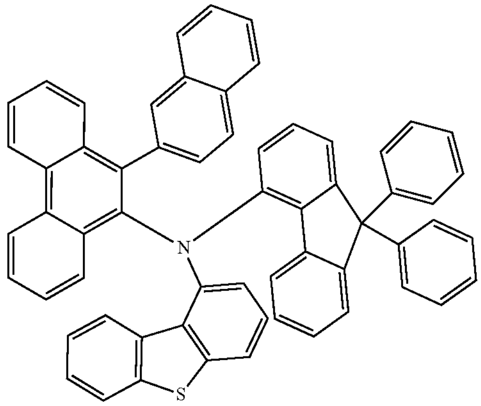
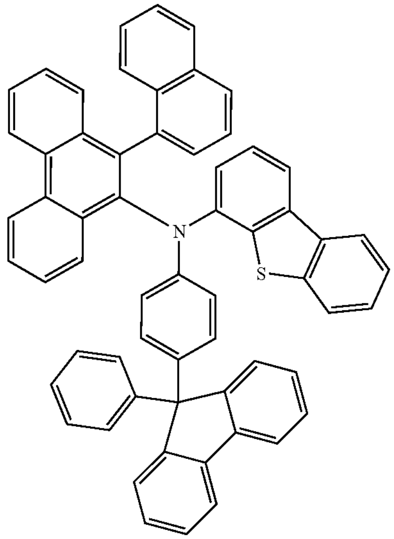
-continued
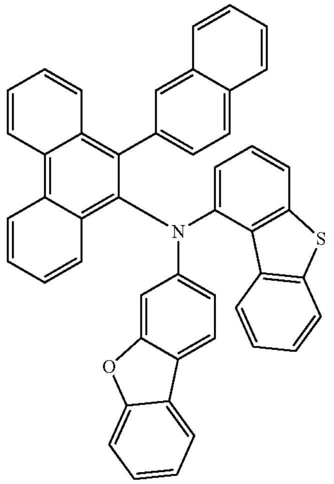
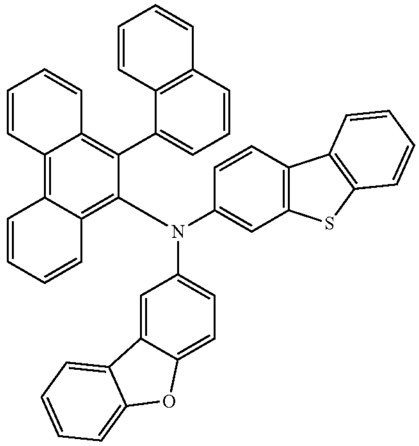
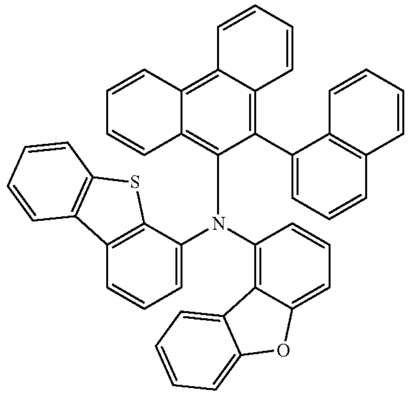

-continued
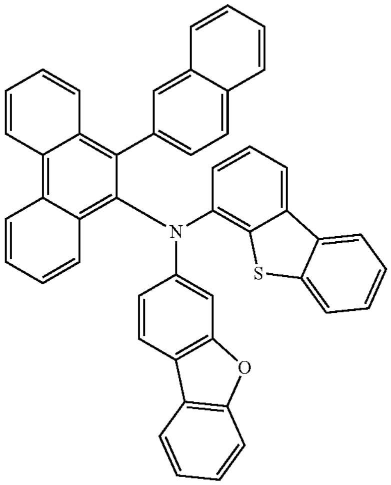
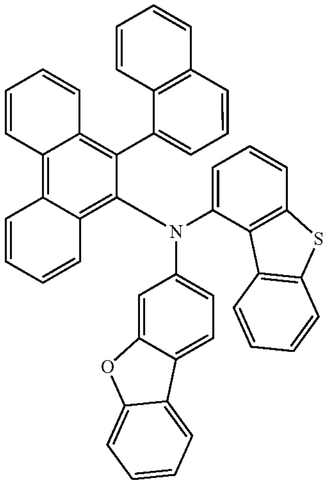
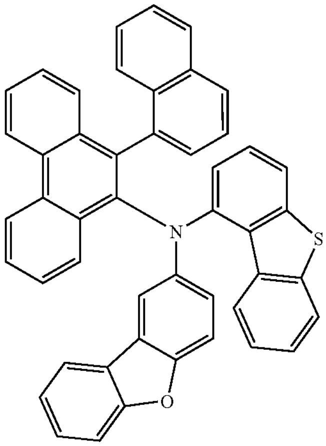
-continued
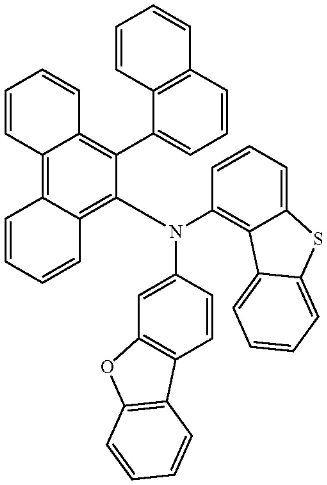
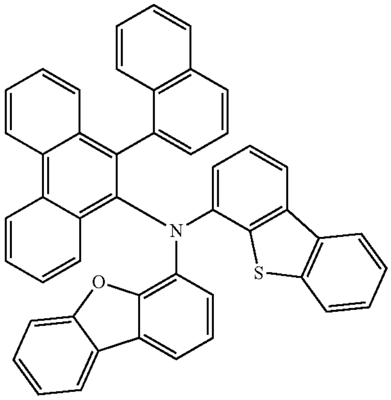
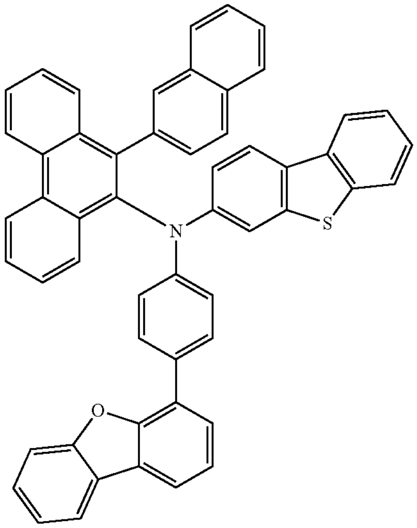

-continued
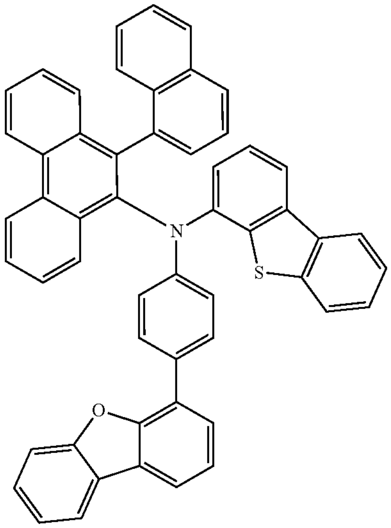
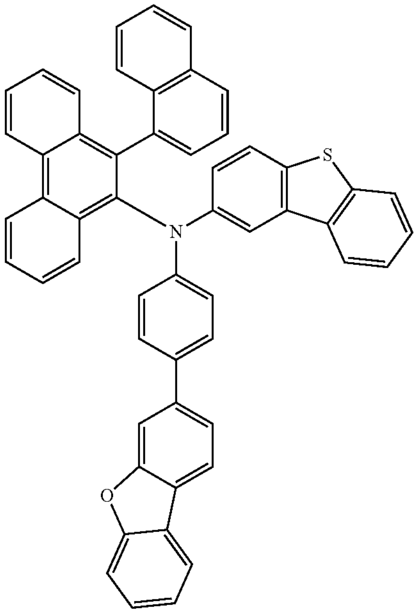
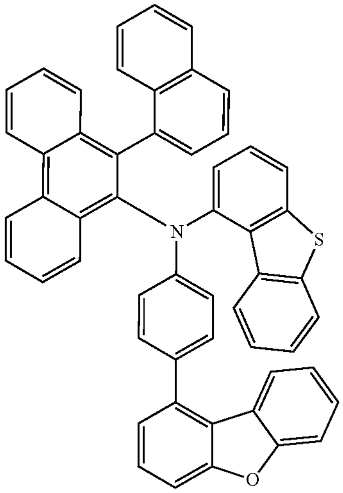
-continued
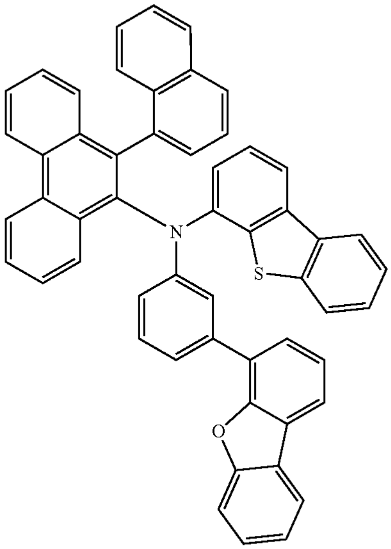
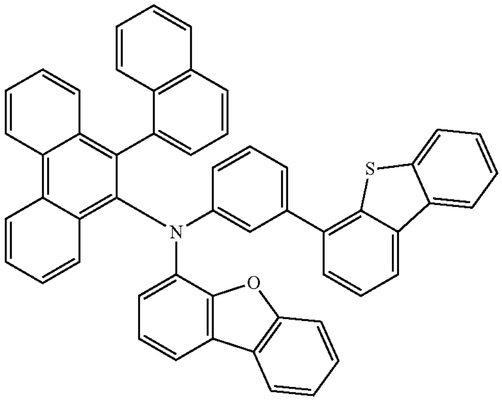
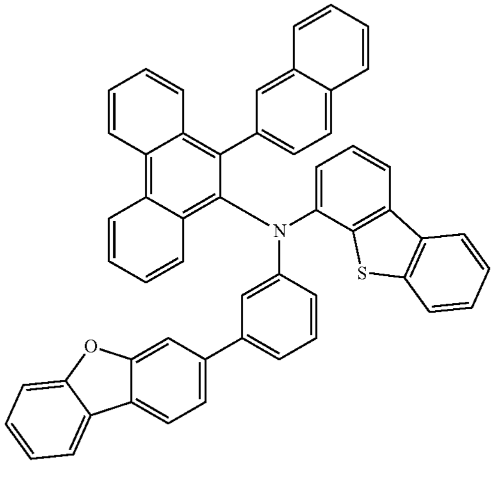

-continued
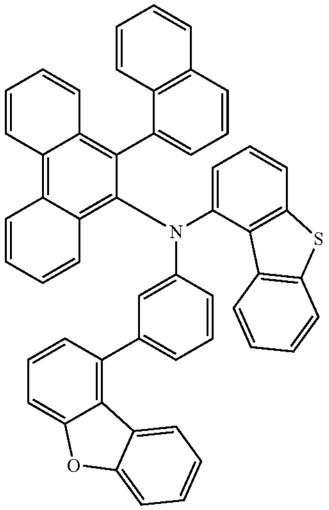
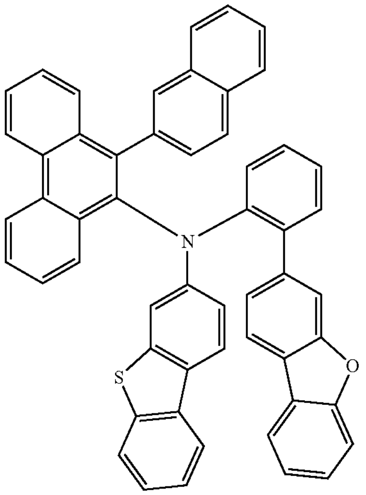
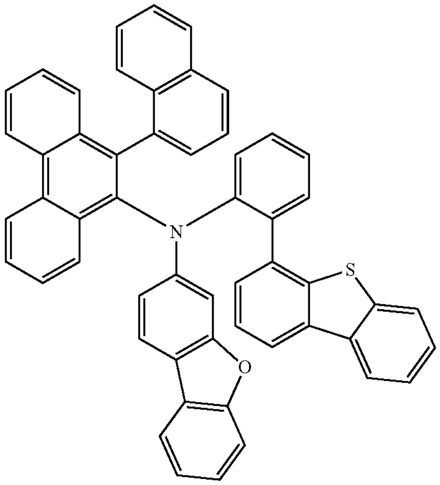
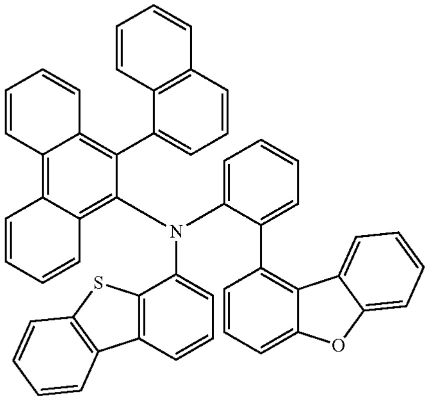
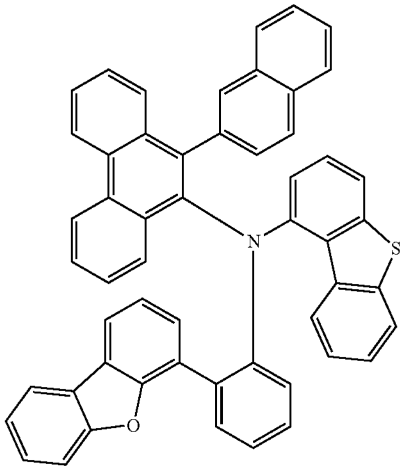
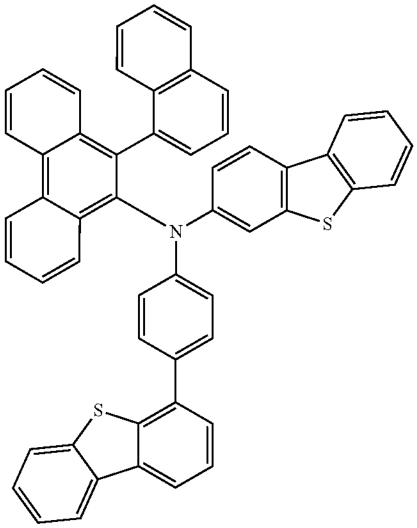
-continued -continued
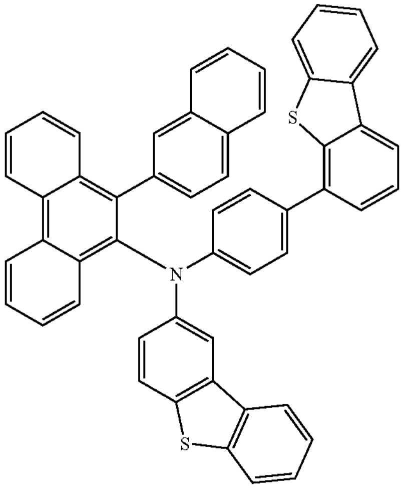
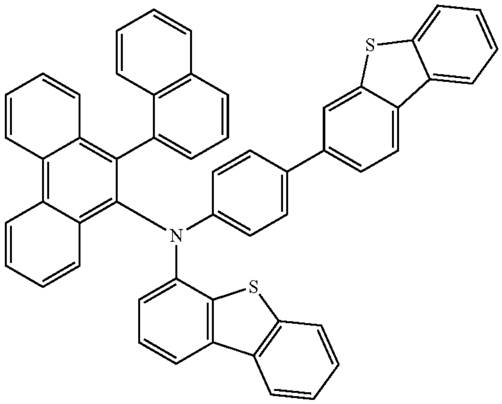
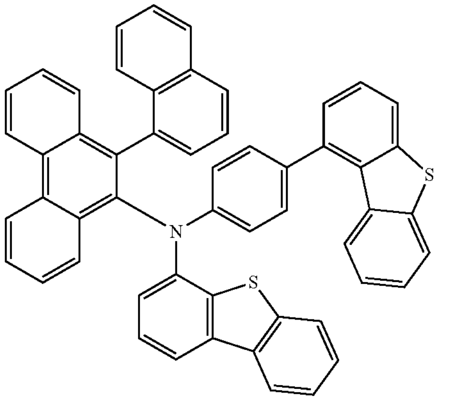
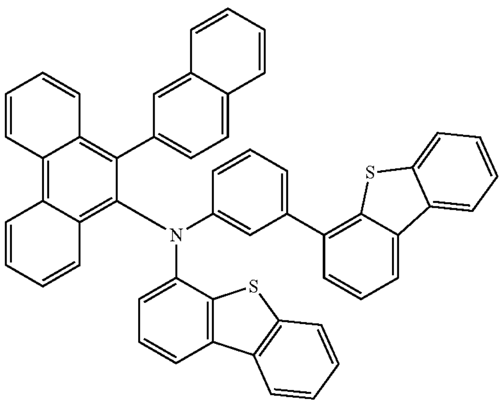
-continued
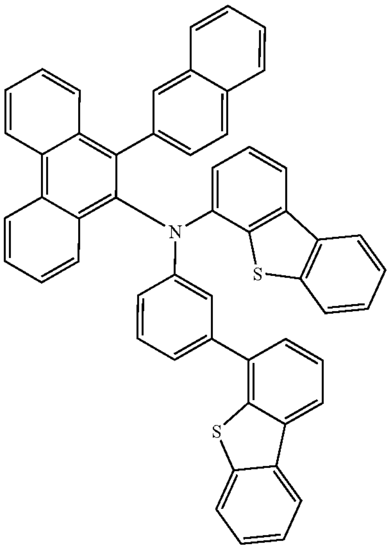
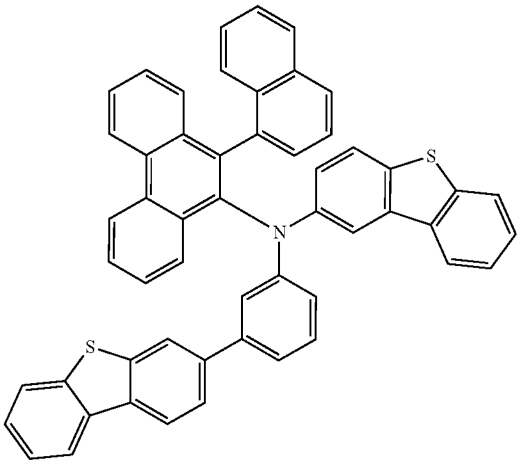
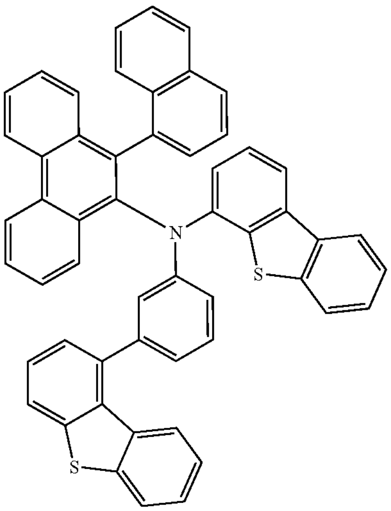

-continued
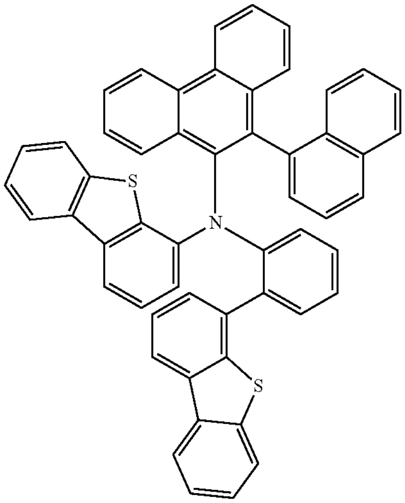
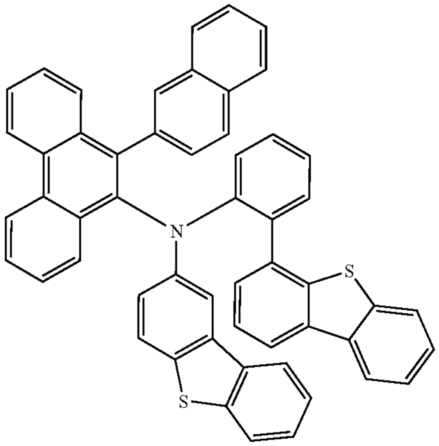
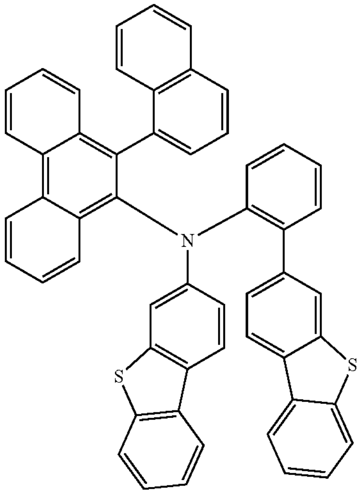
-continued
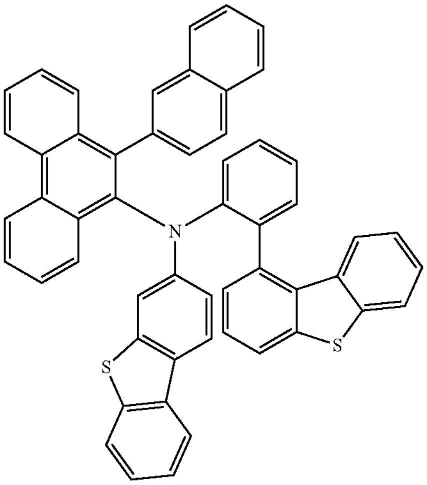
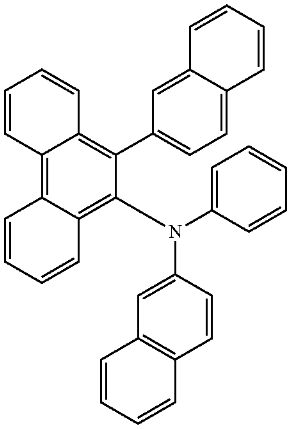
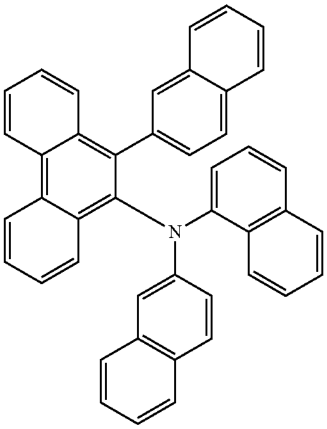

-continued
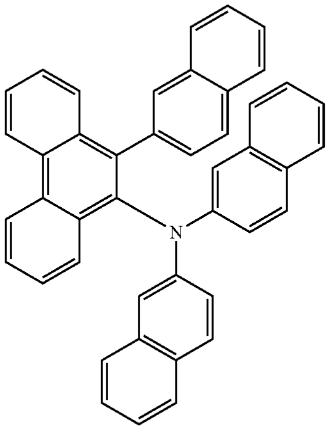
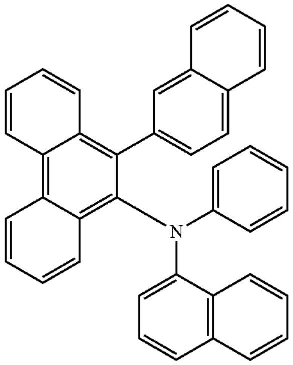
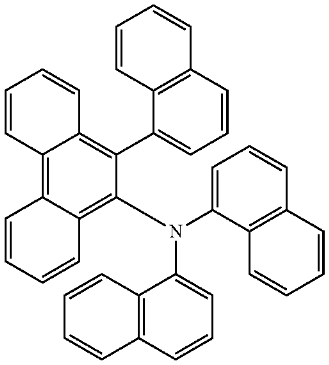
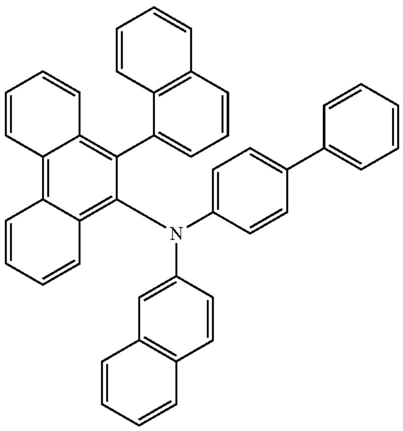
-continued
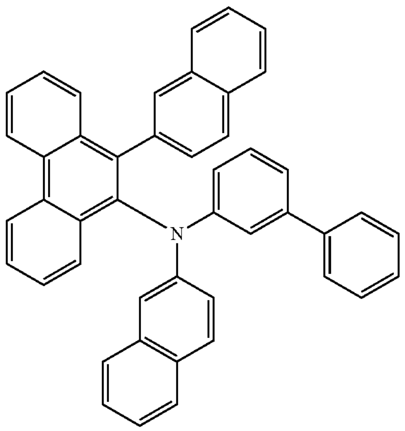
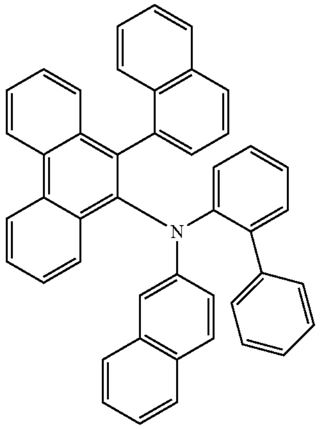
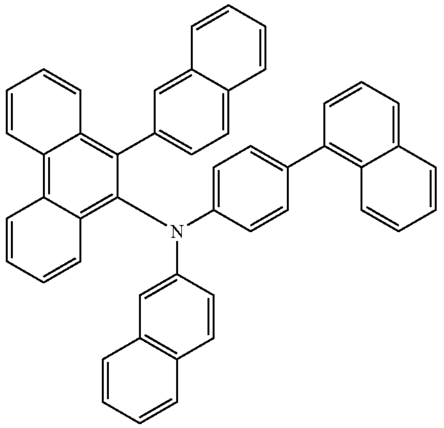
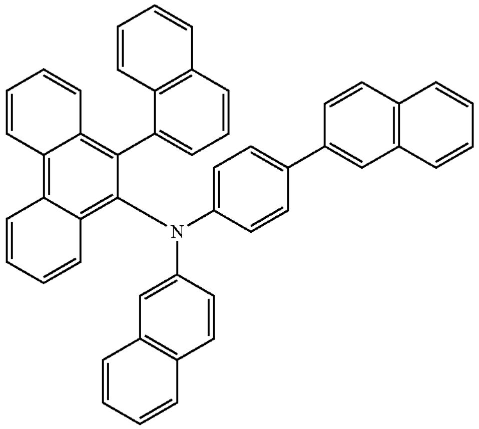

-continued
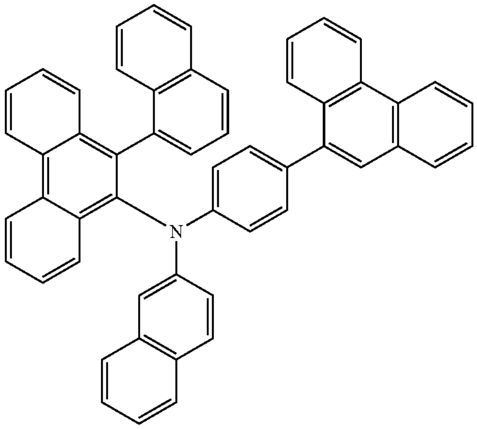
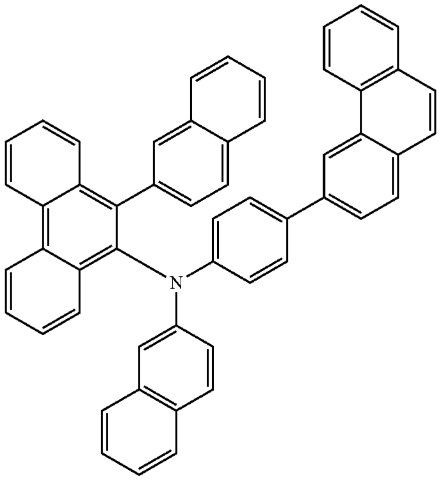
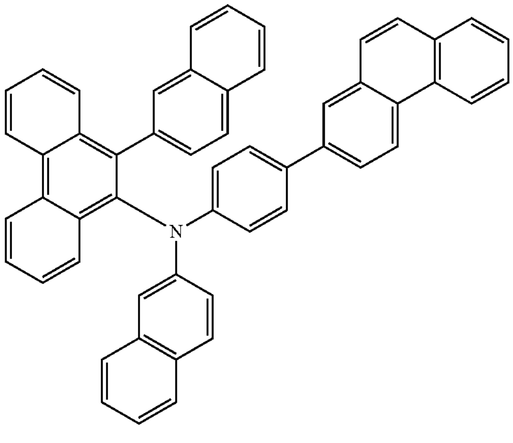
-continued
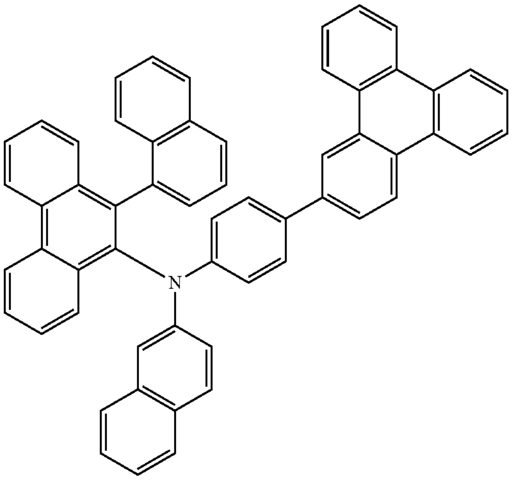
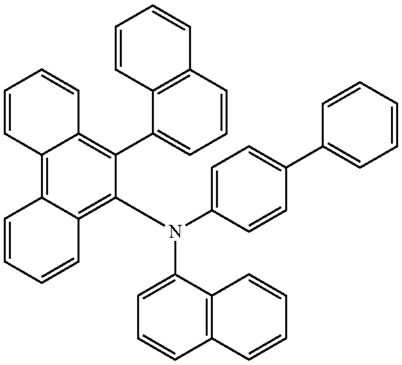
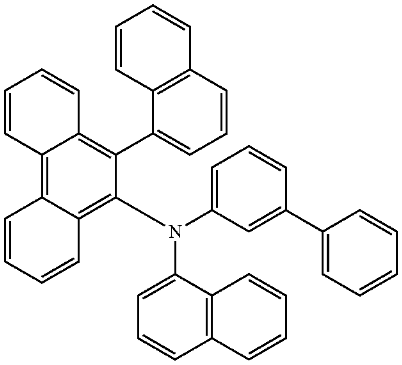
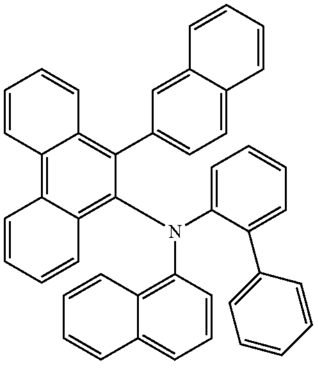

-continued
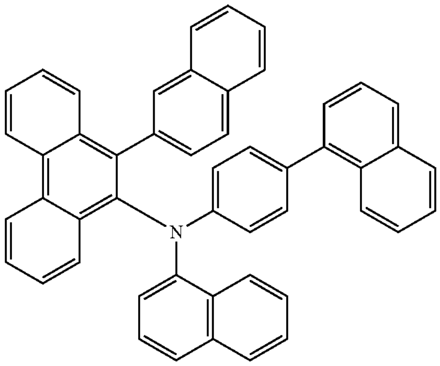
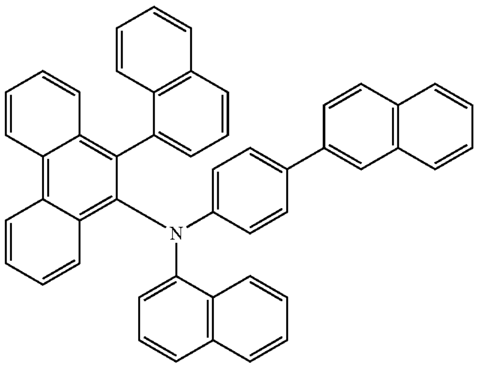
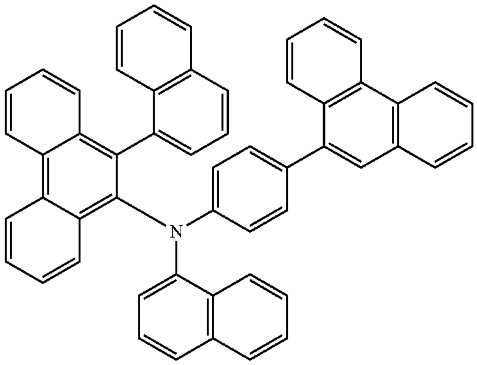
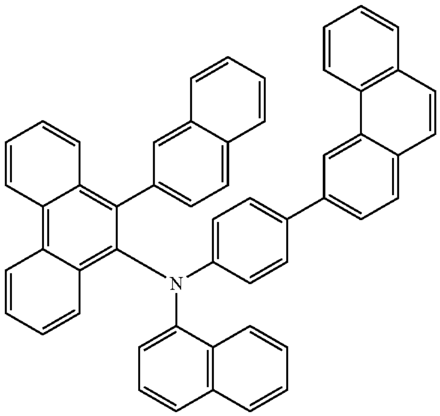
-continued
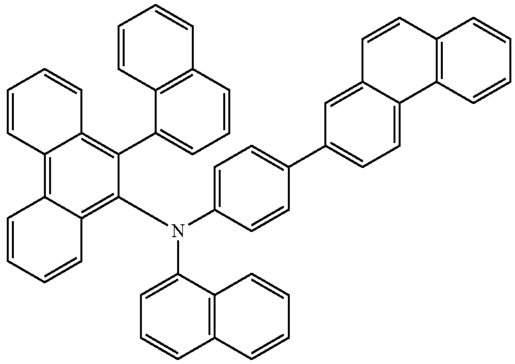
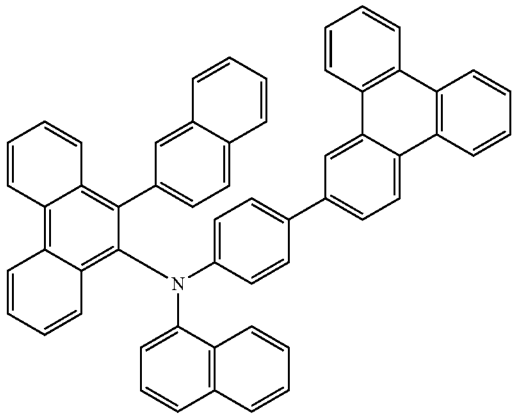
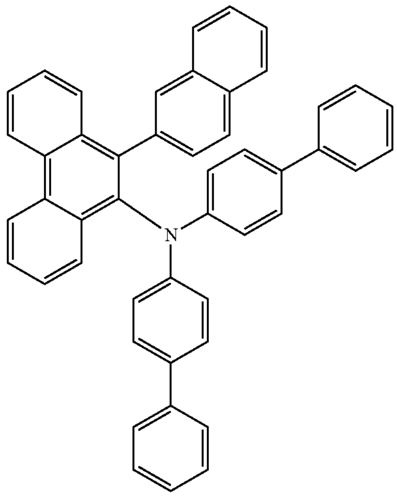

-continued
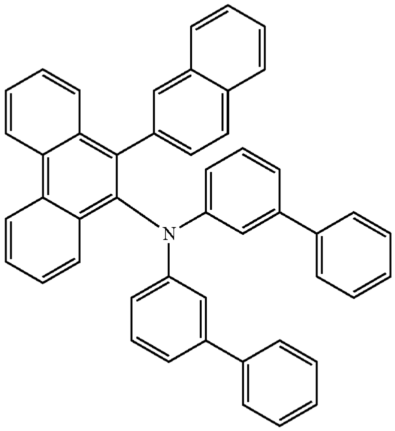
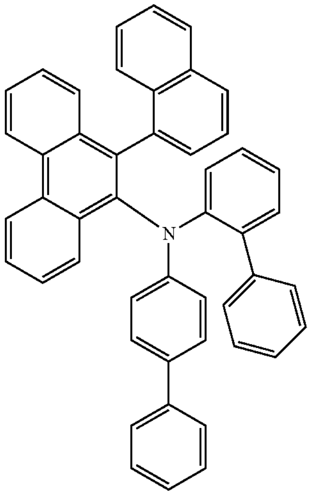
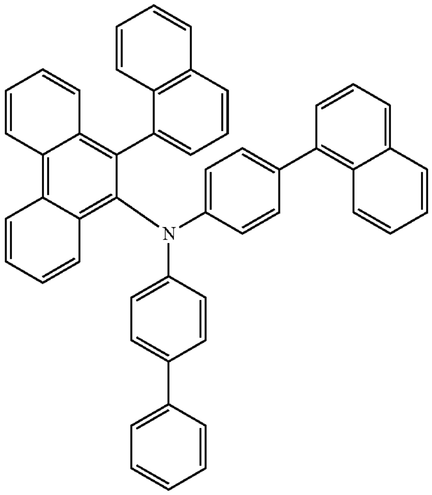
-continued
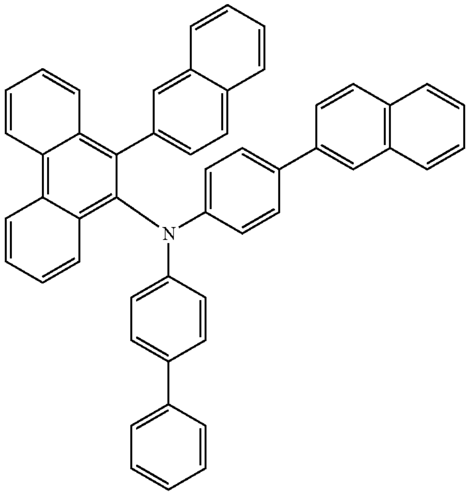
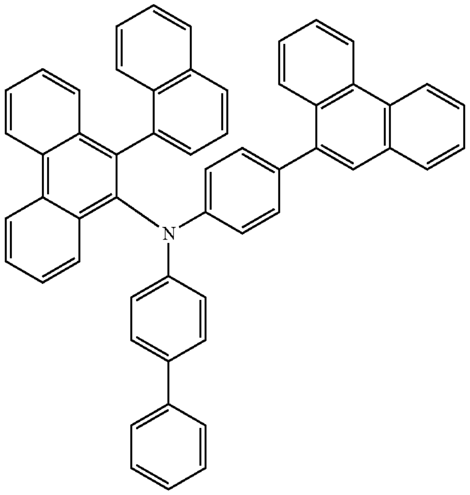
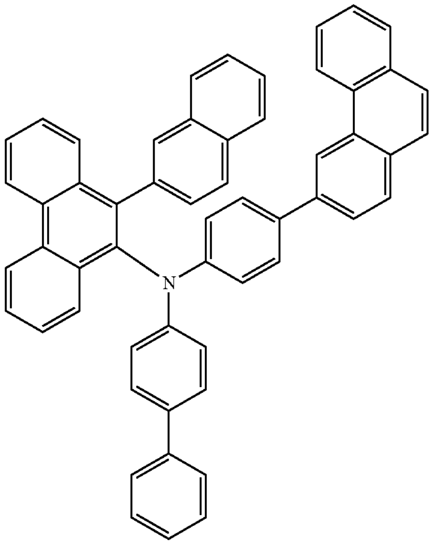

-continued
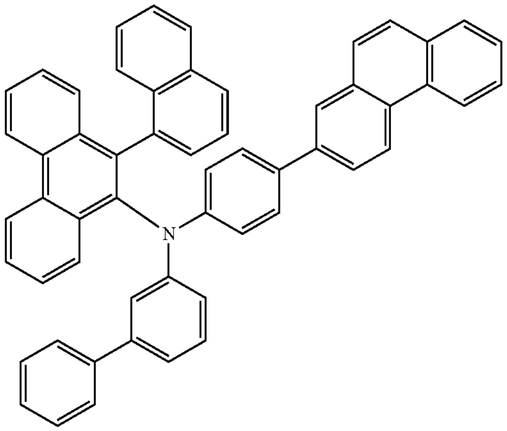
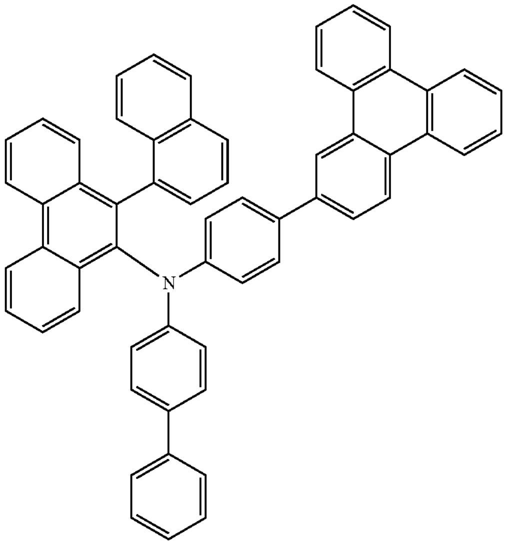
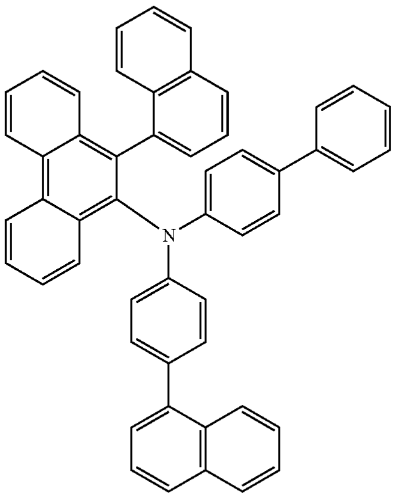
-continued
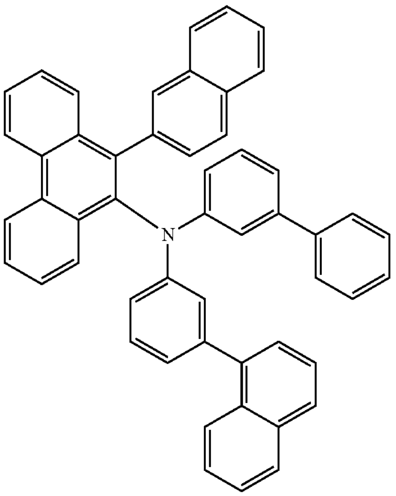
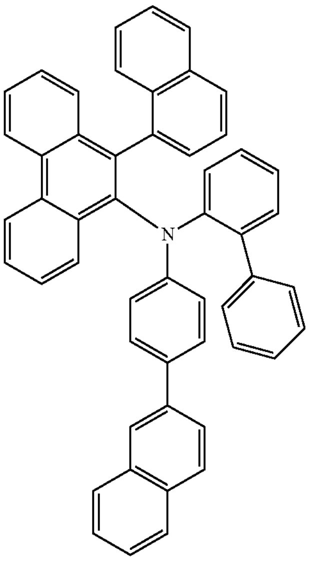
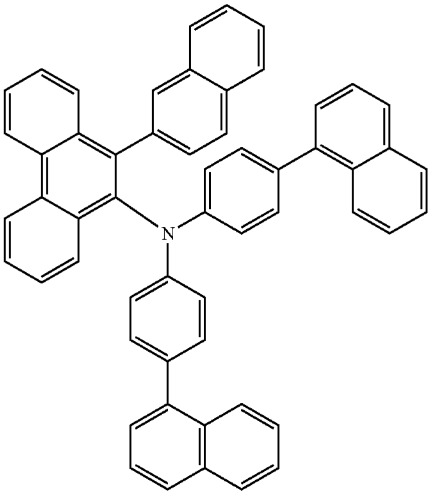

-continued
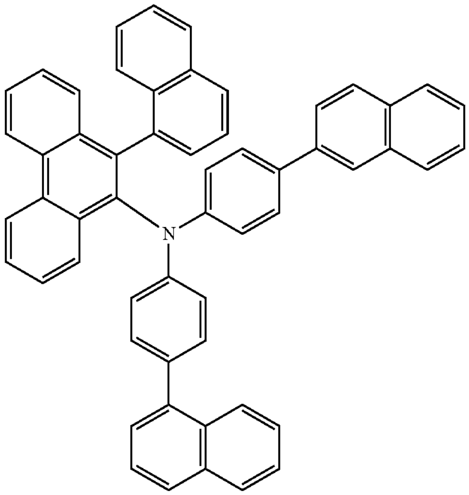
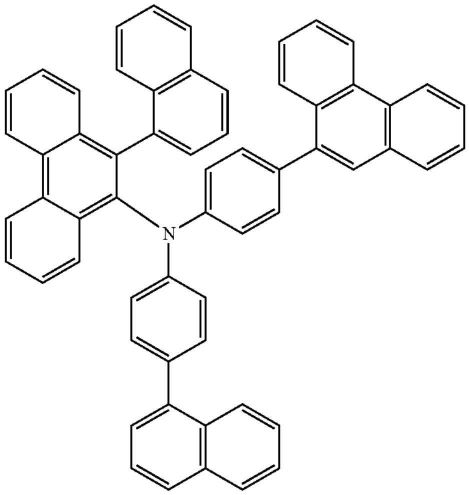
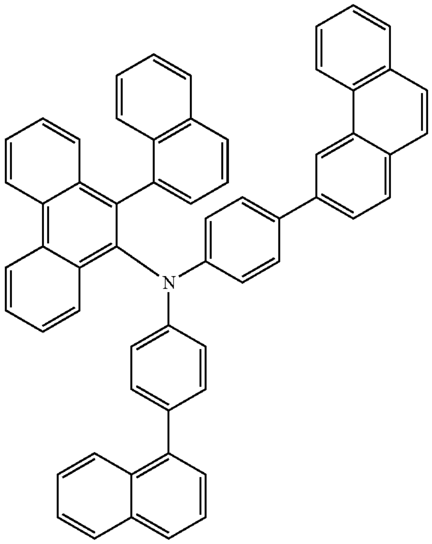
-continued
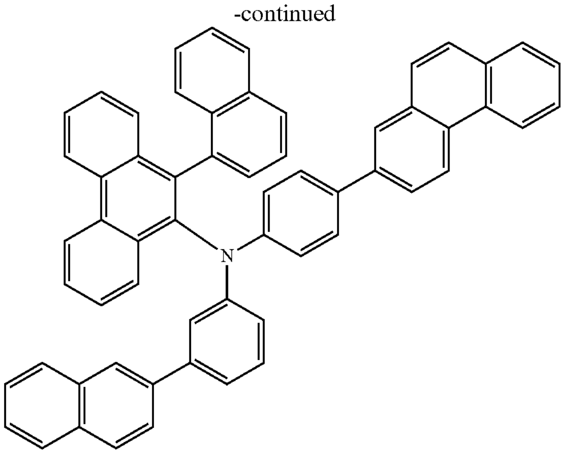
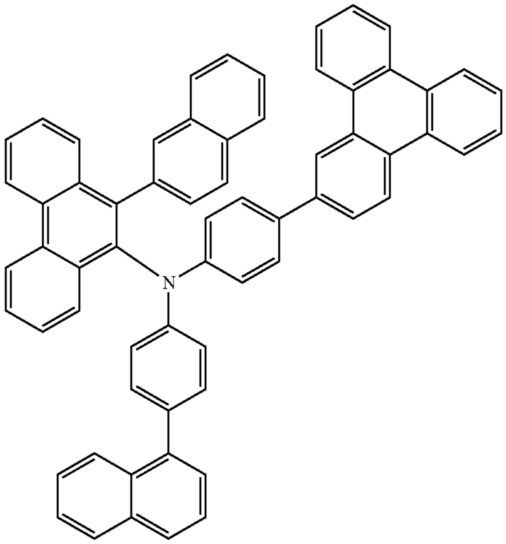
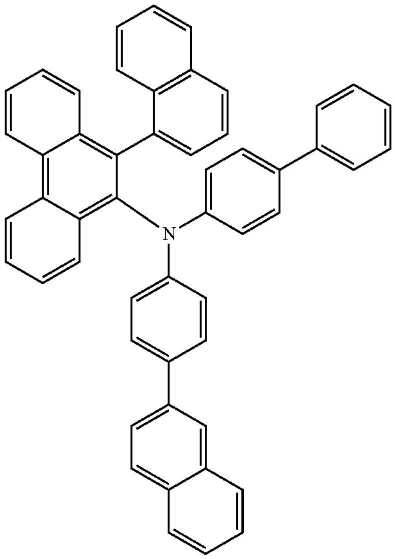

-continued
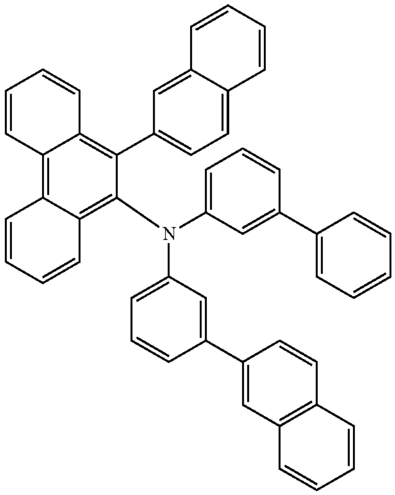
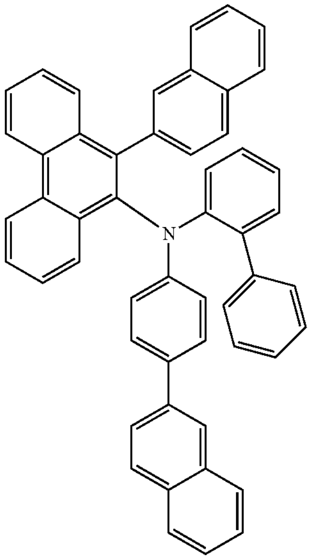
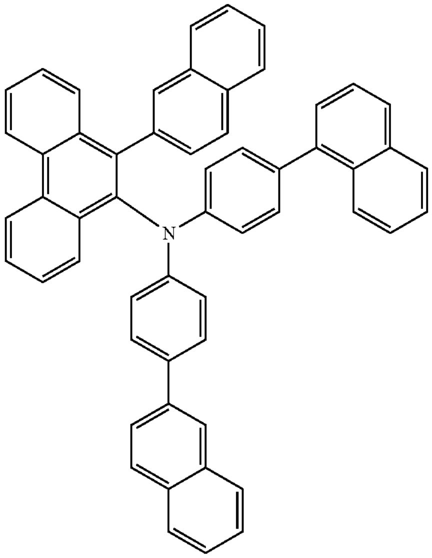
-continued
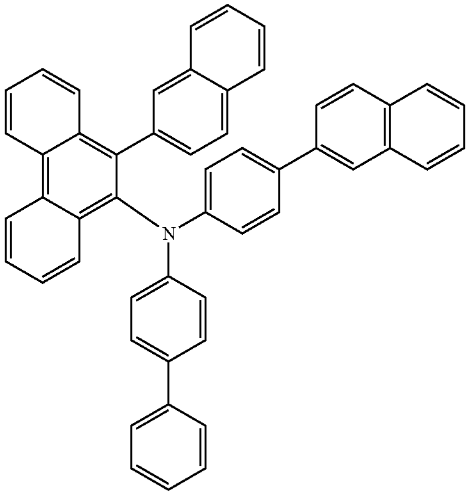
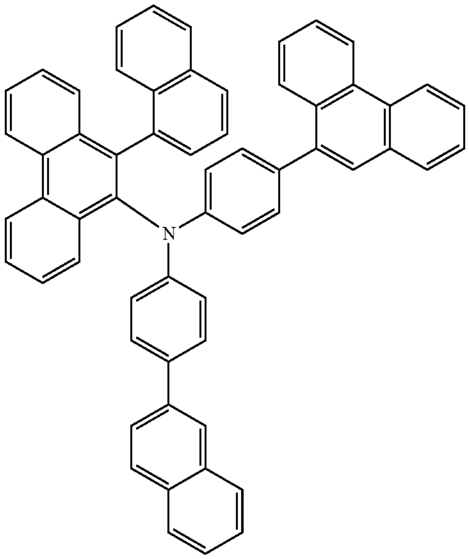
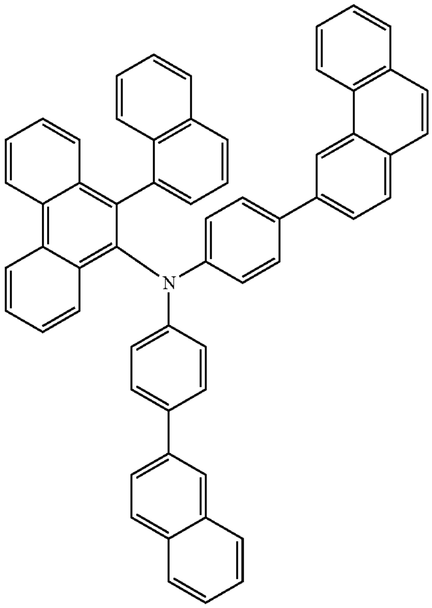

-continued
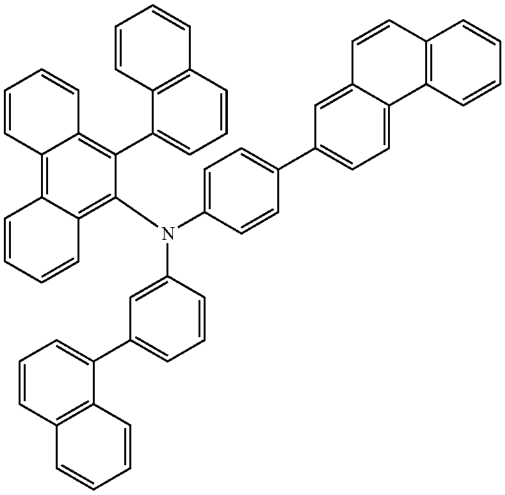
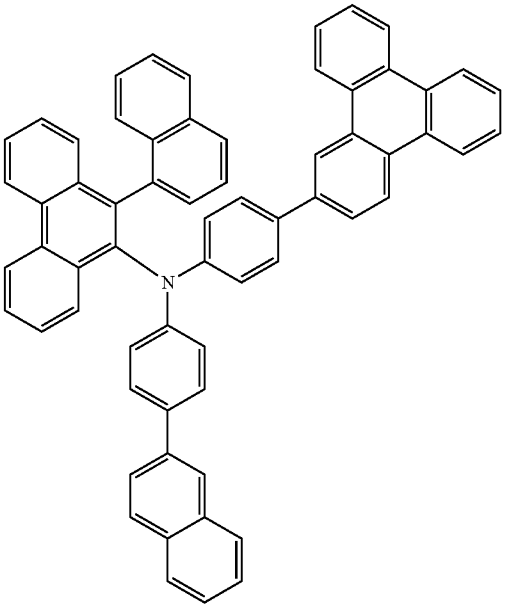
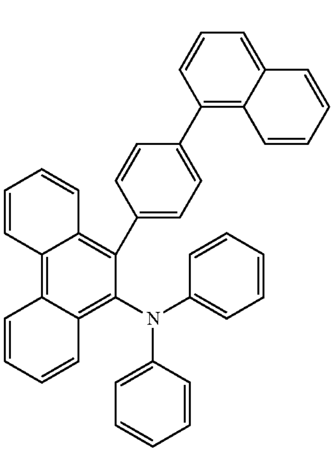
-continued
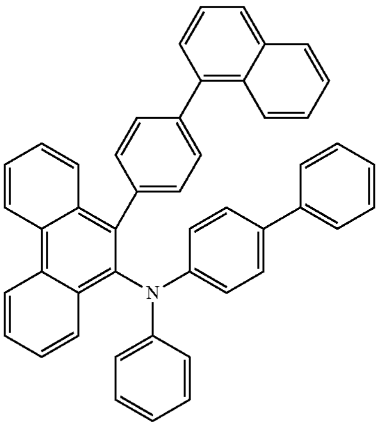
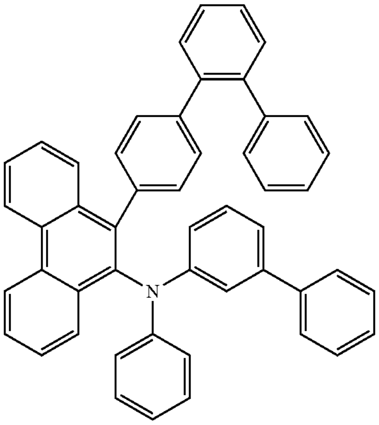
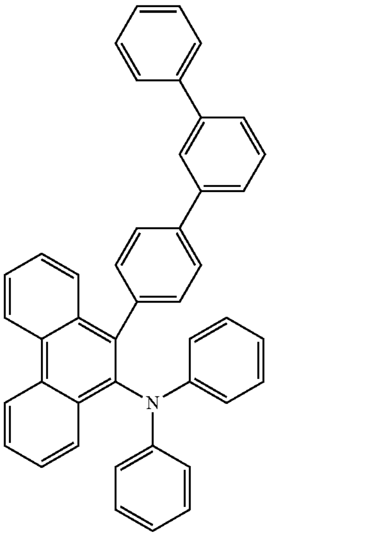

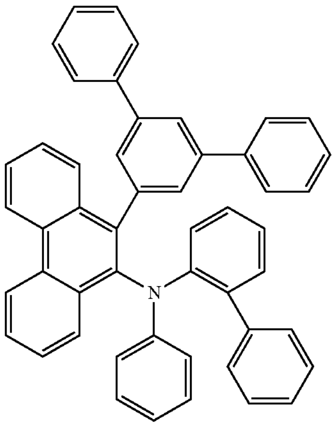
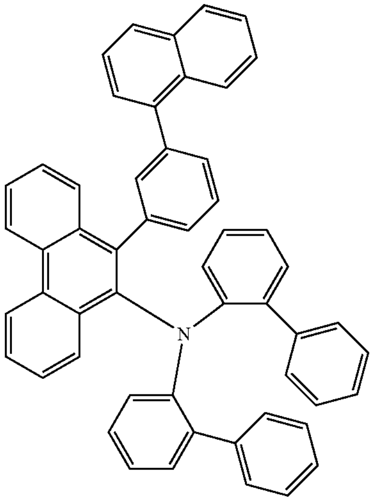
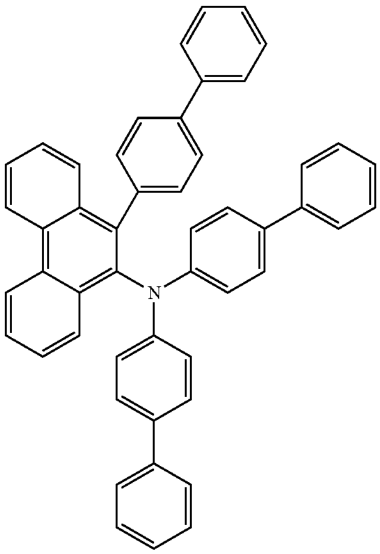
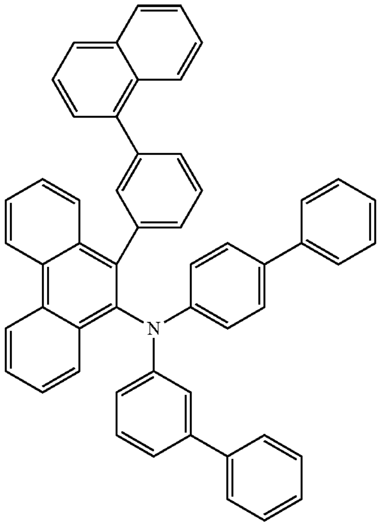
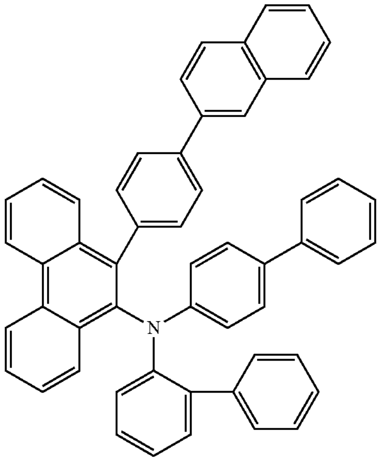
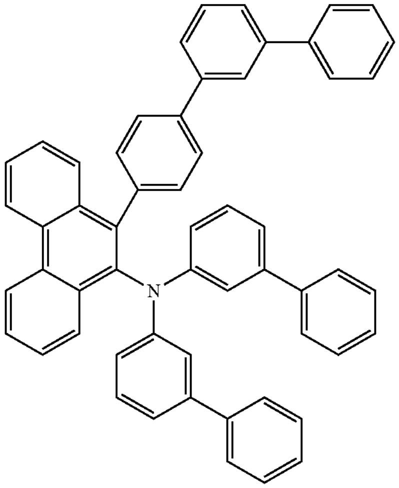

-continued
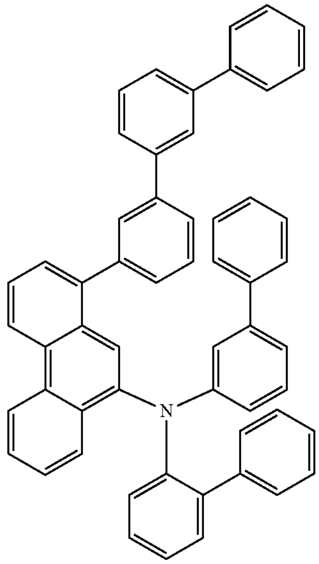
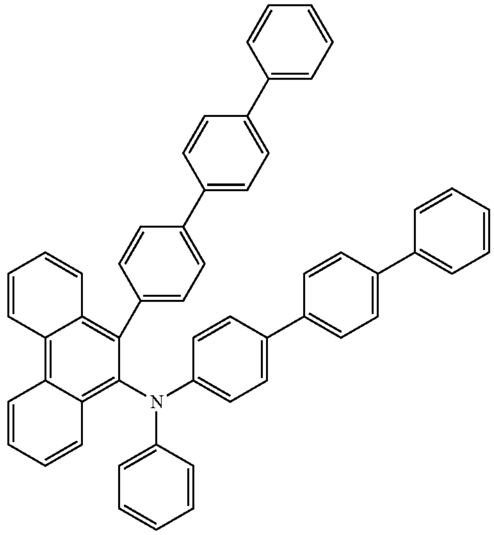
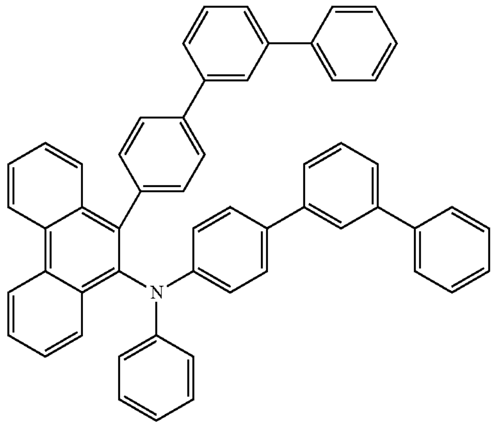
-continued
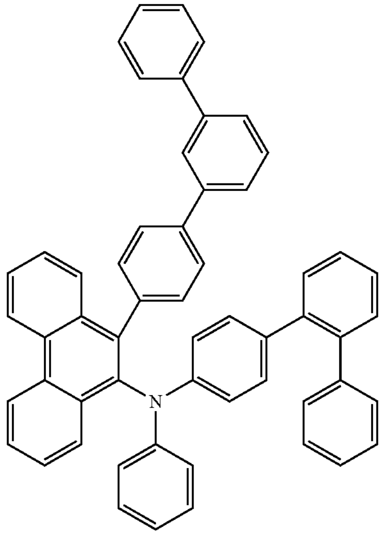
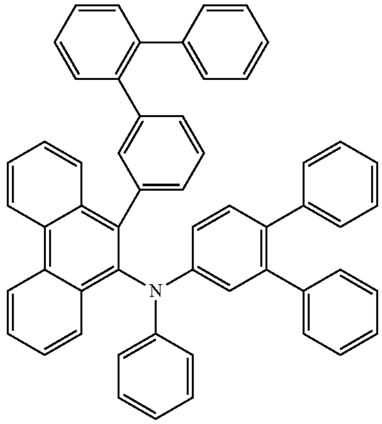
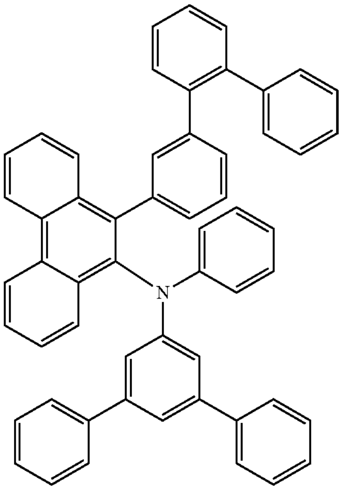

-continued
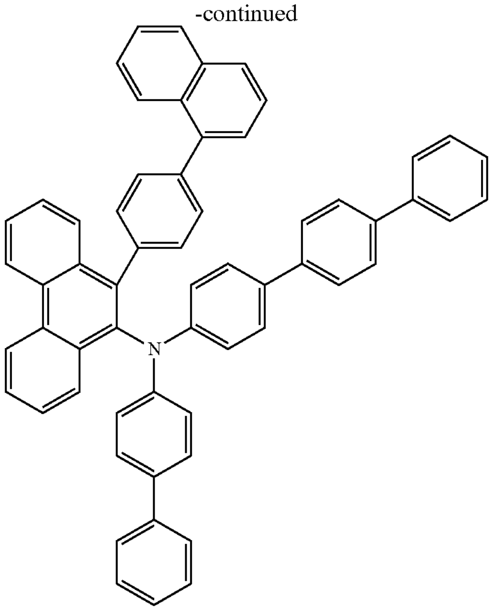
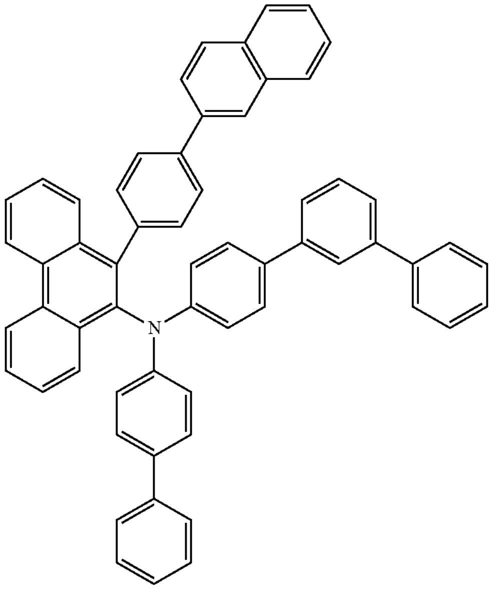
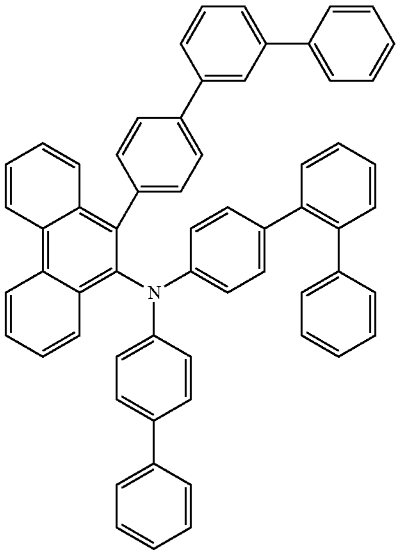
-continued
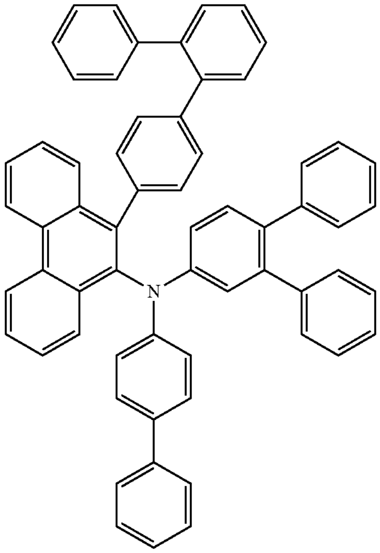
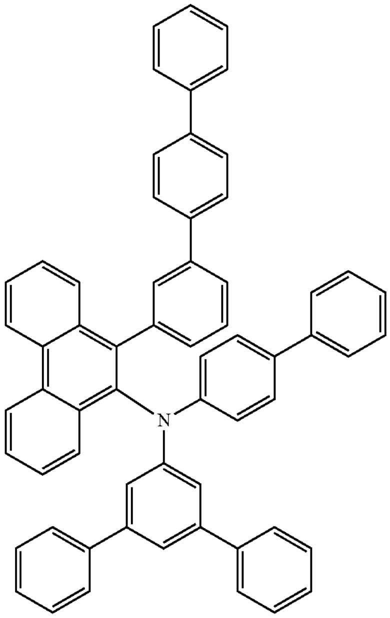
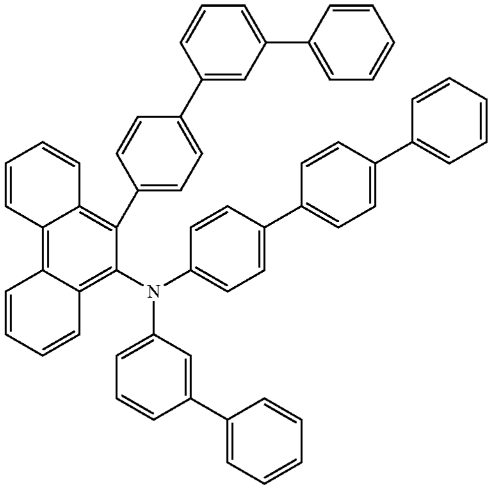

-continued
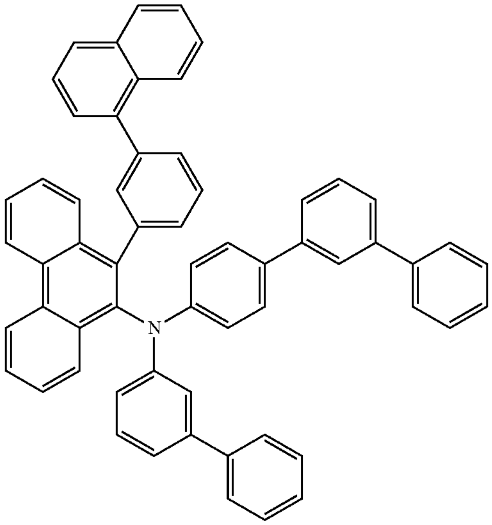
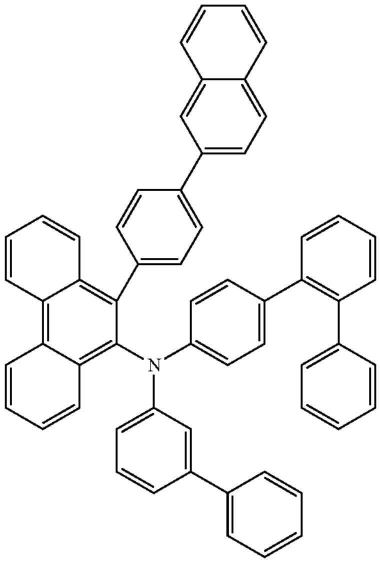
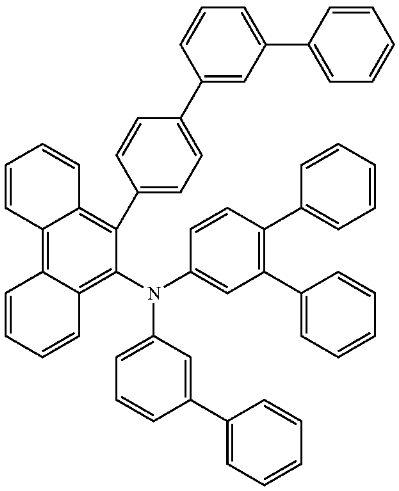
-continued
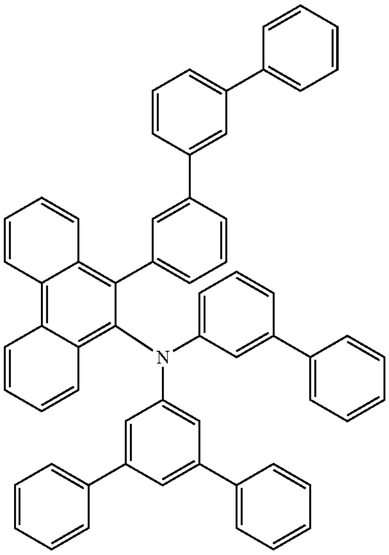
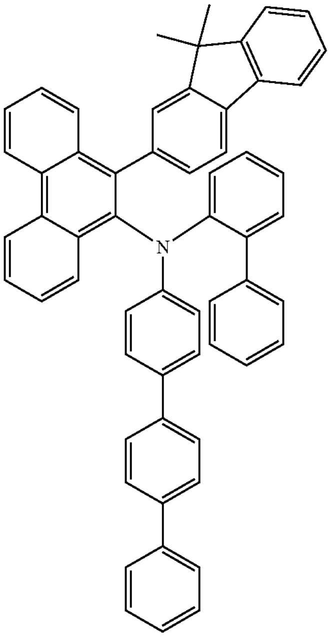
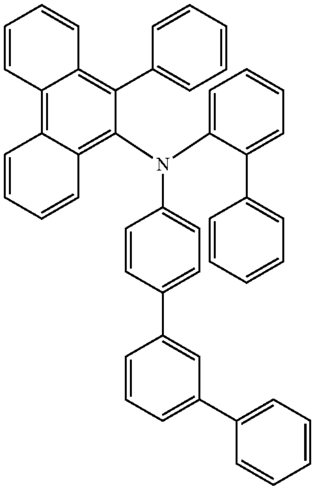

-continued
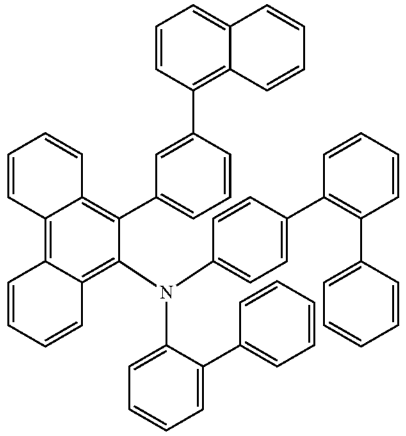
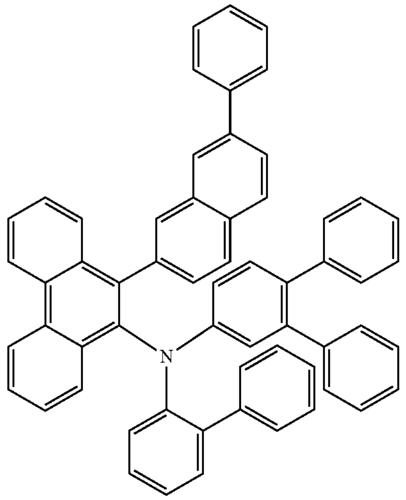
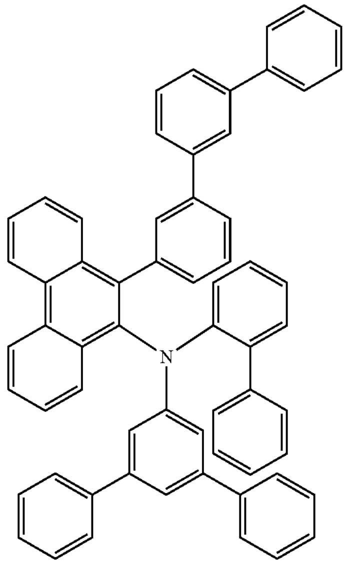
-continued
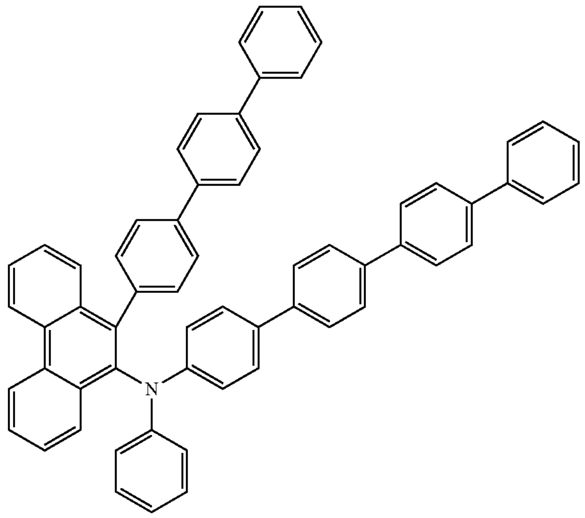
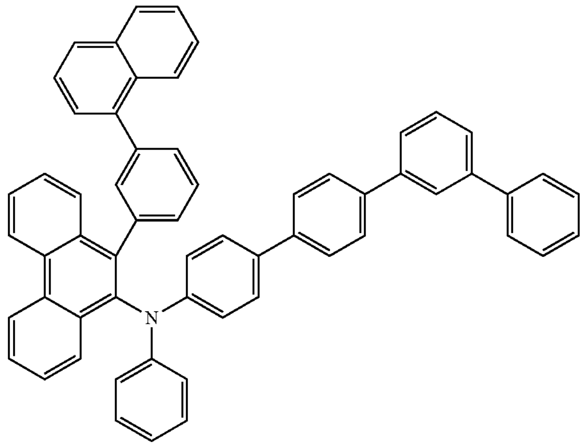
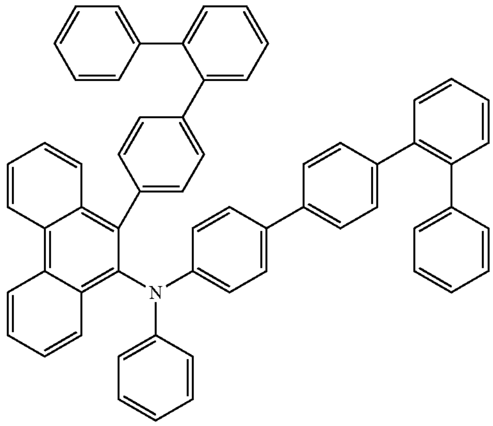

-continued
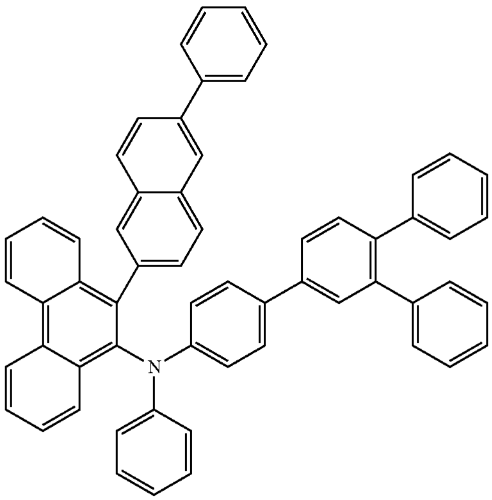
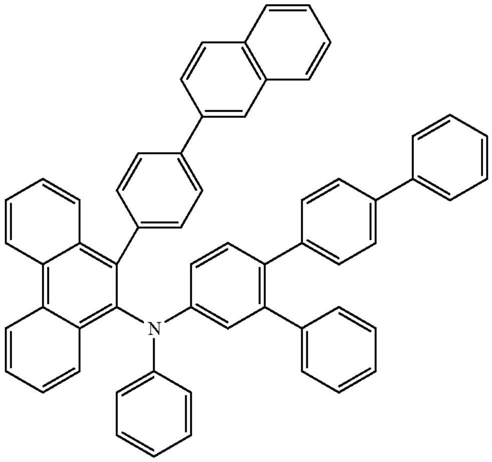
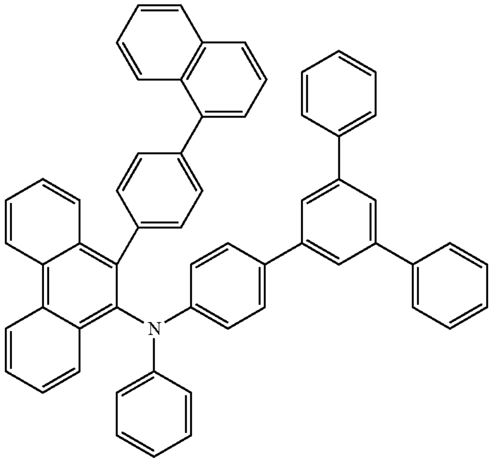
-continued
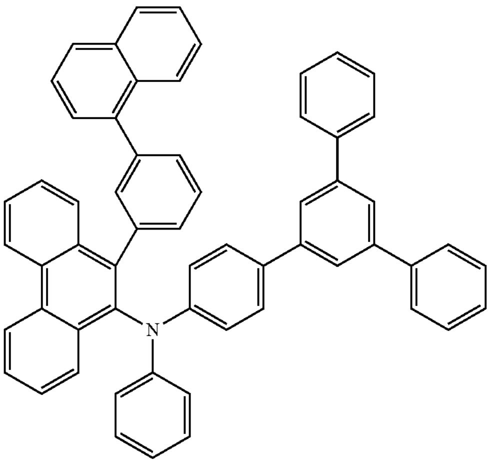
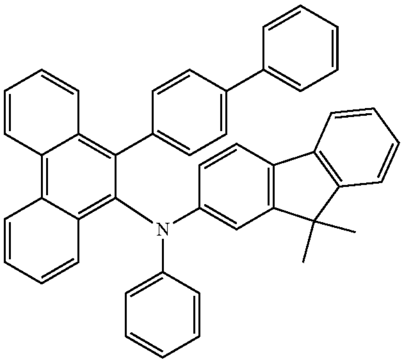
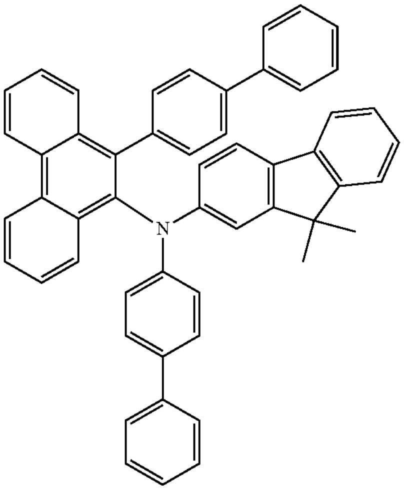

-continued
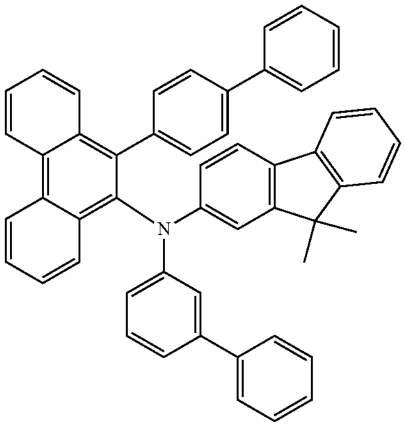
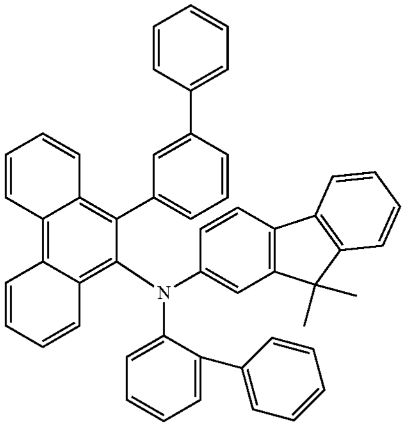
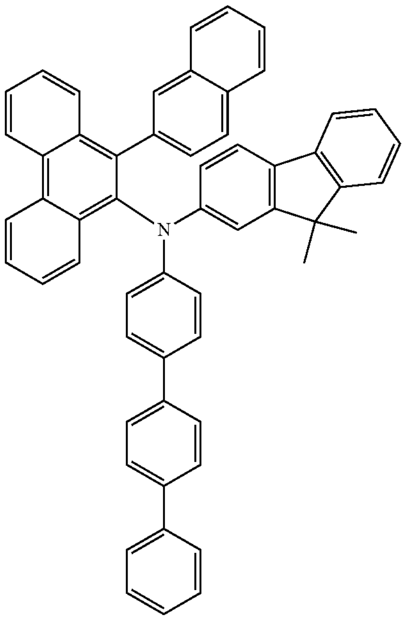
-continued
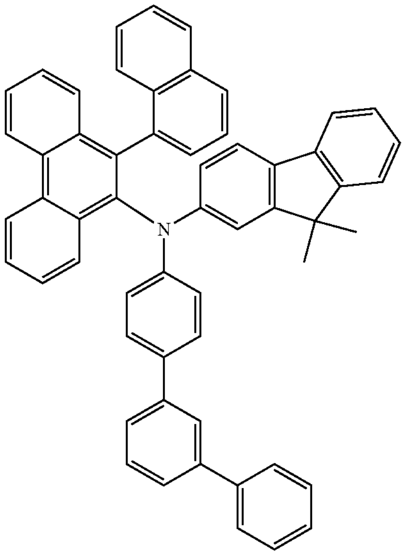
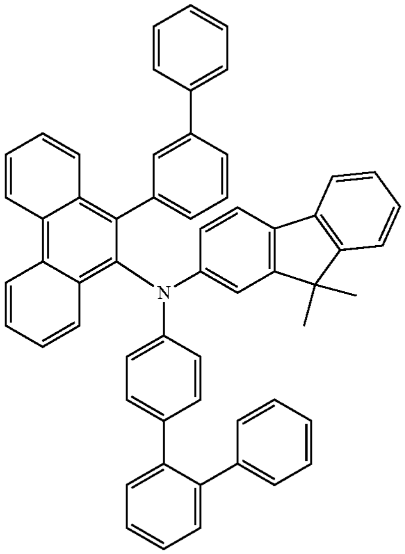
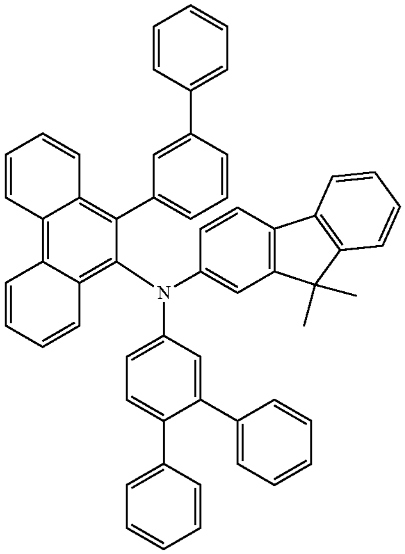

-continued
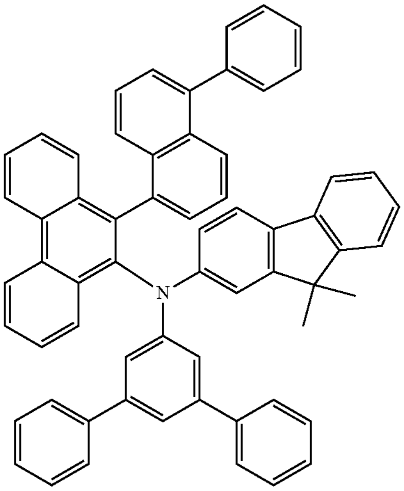
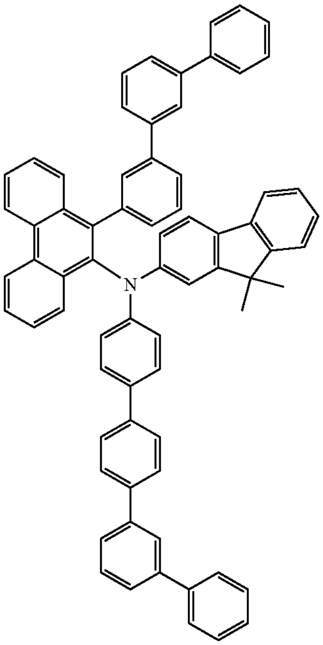
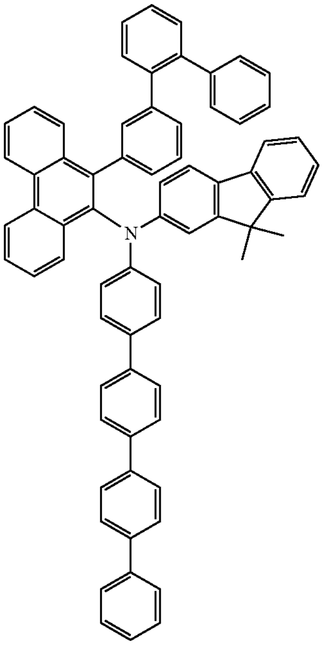
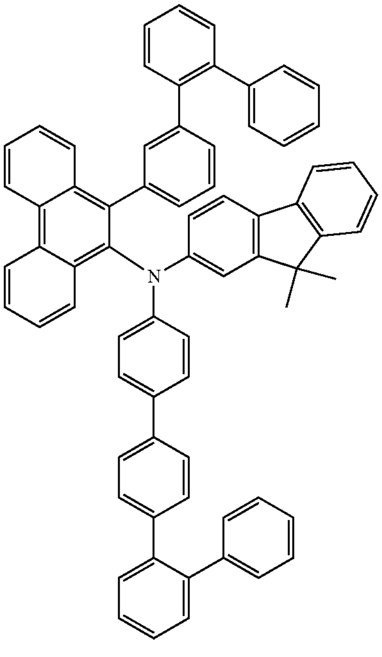

-continued
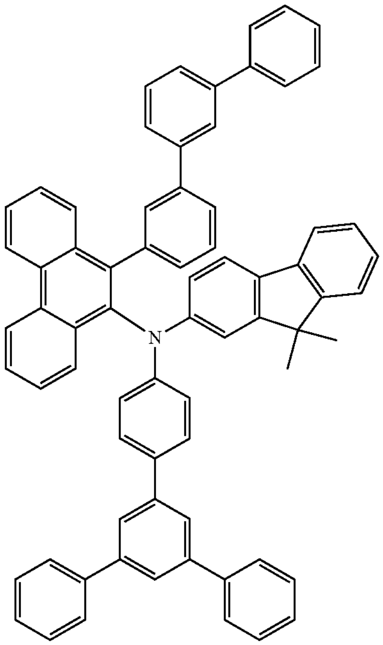
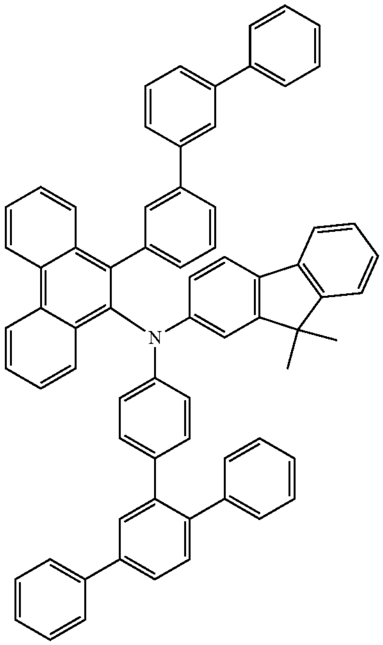
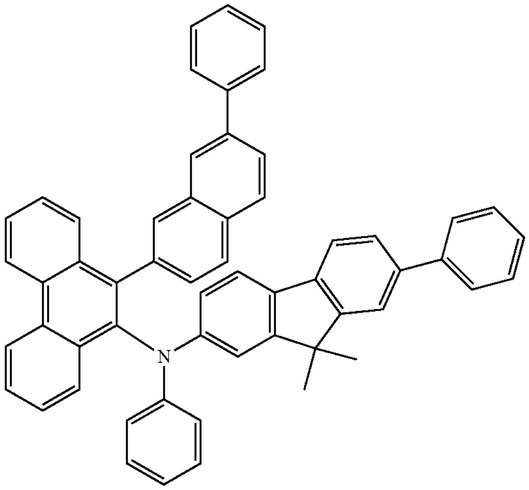
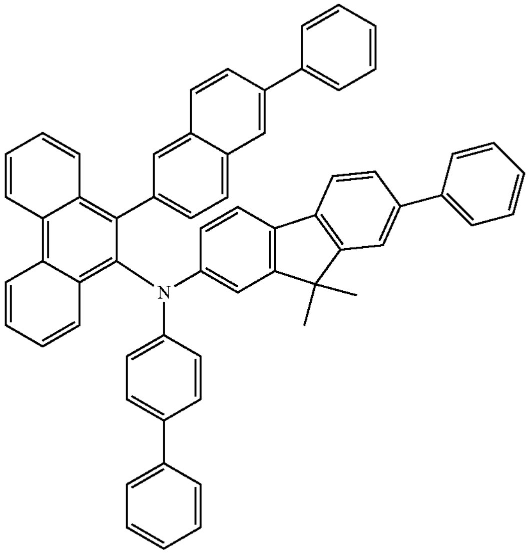
-continued
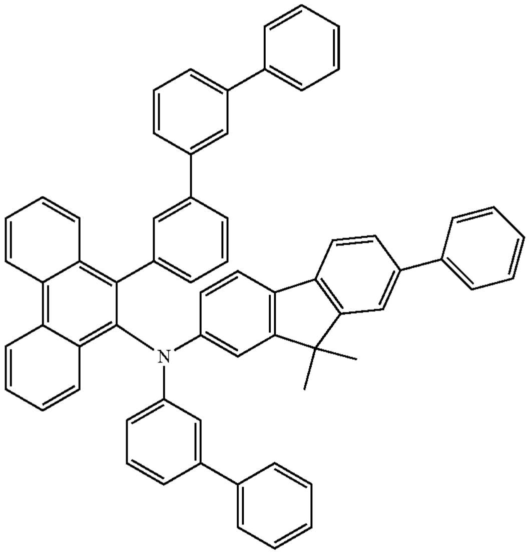

-continued
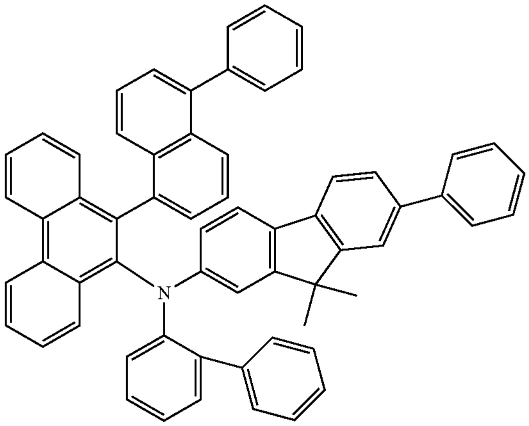
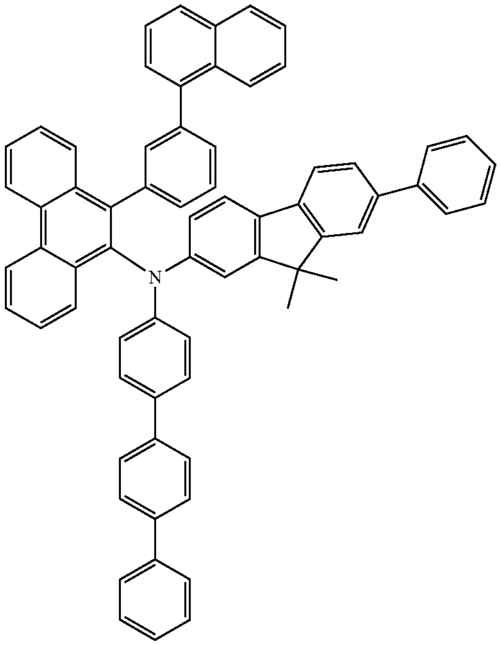
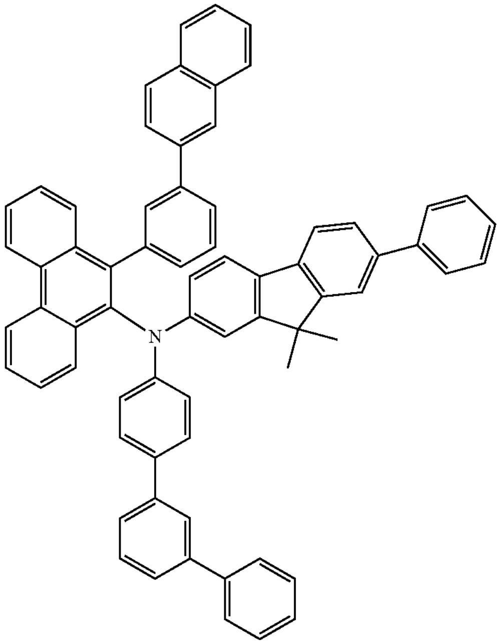
-continued
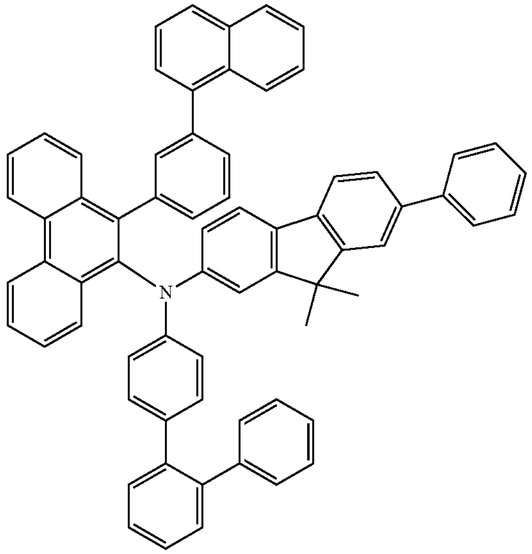
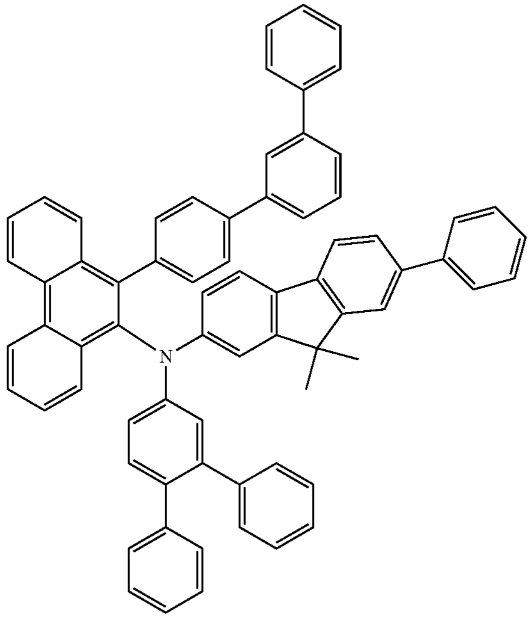
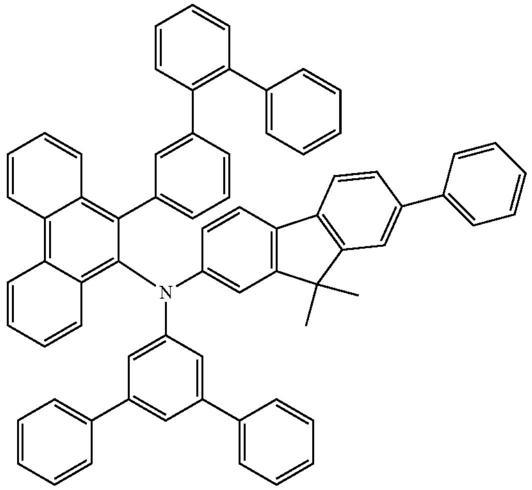

-continued
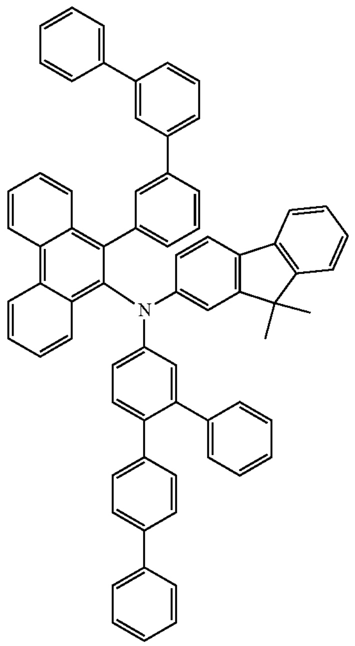
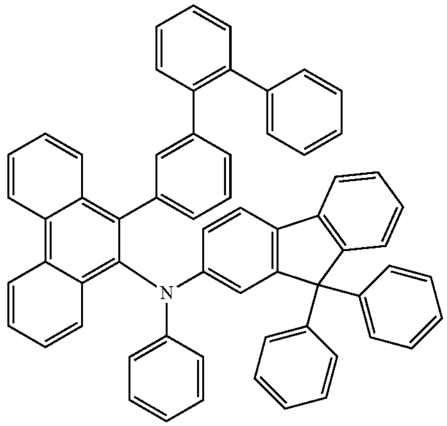
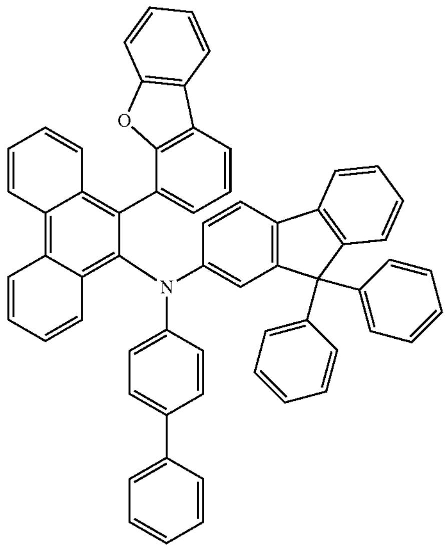
-continued
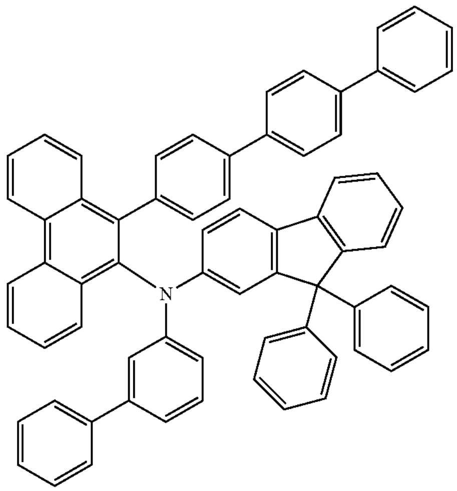
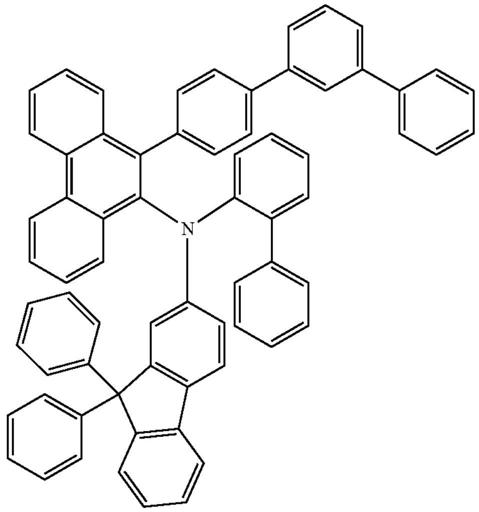
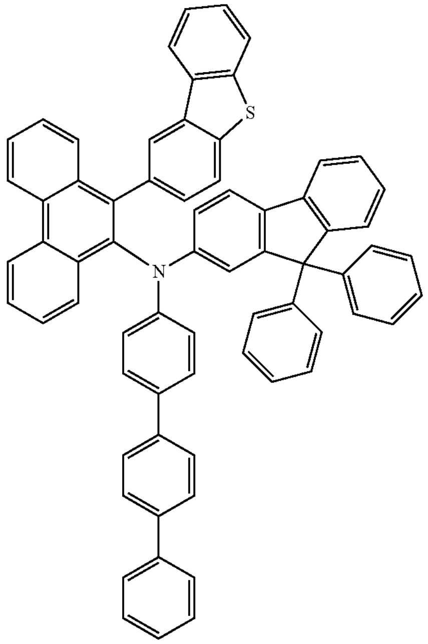

-continued
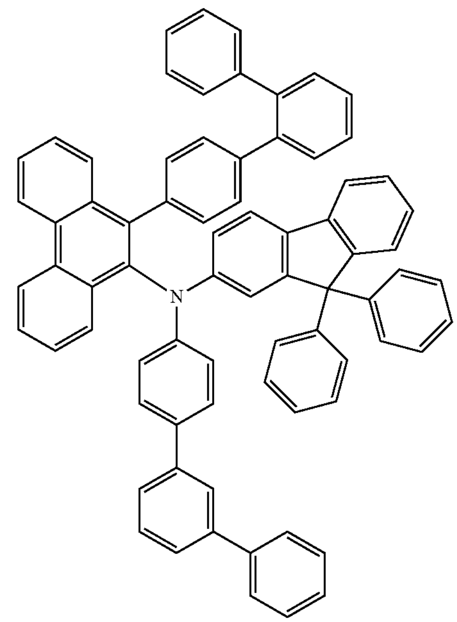
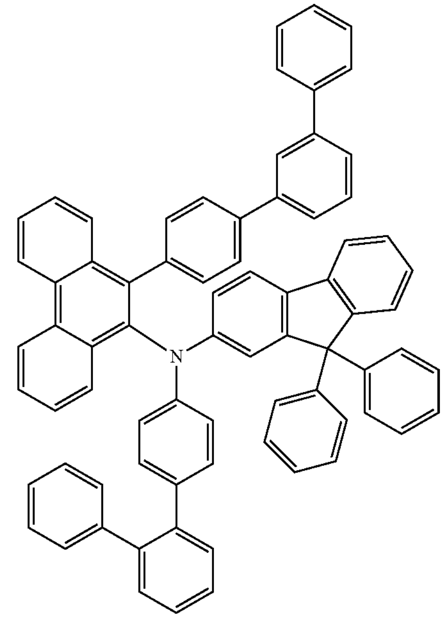
-continued
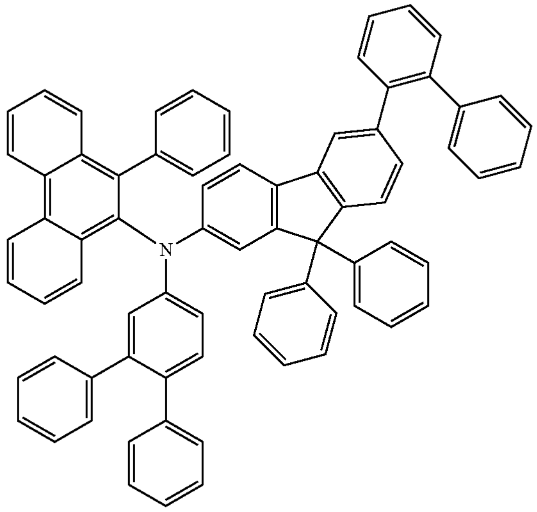
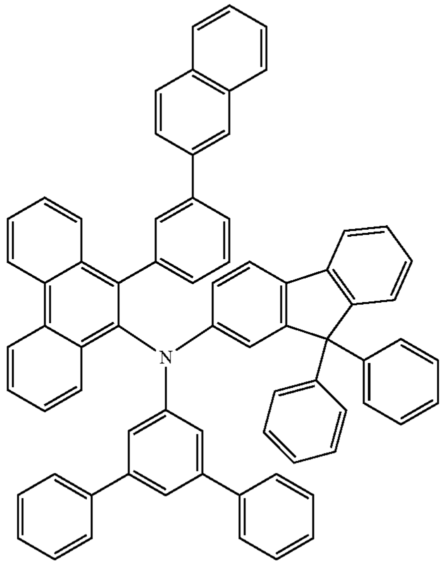
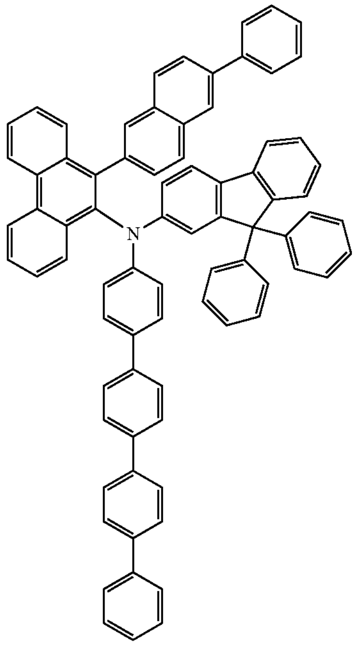

-continued
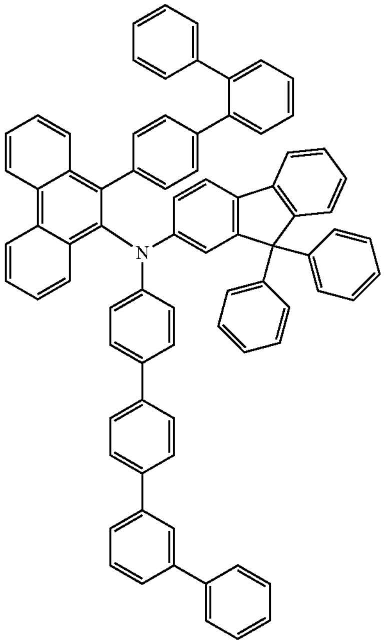
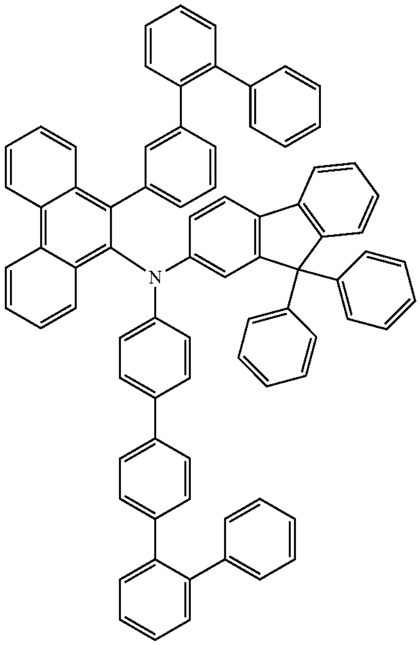
-continued
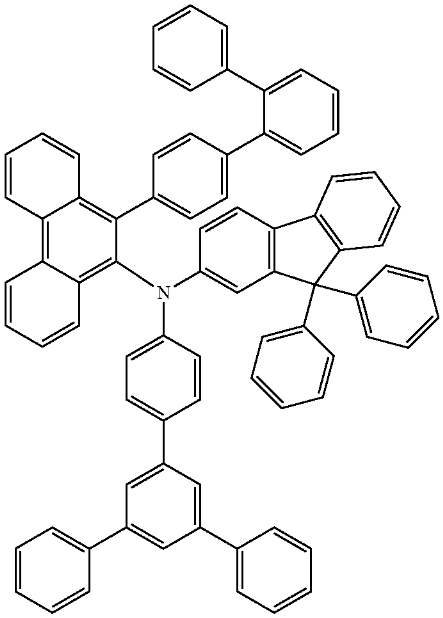
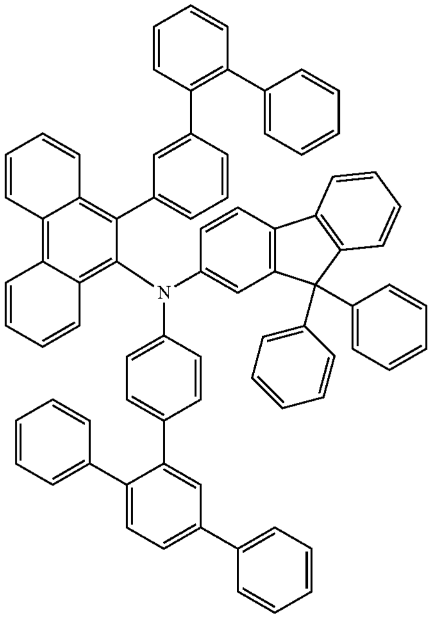
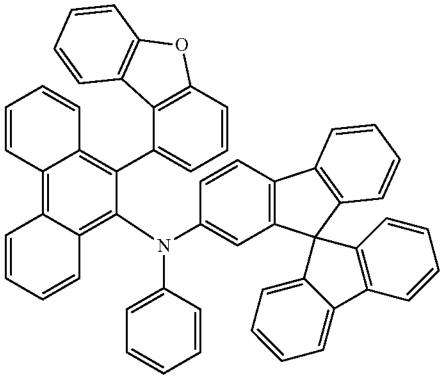

-continued
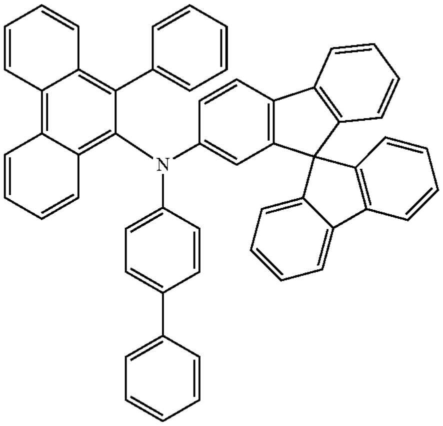
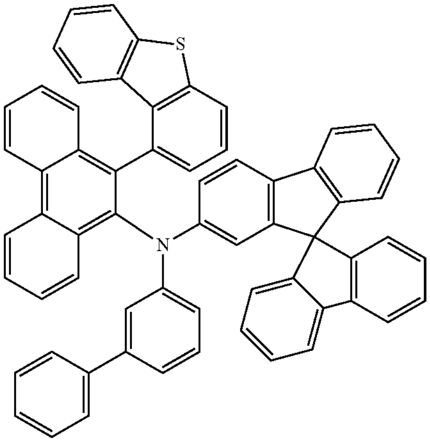
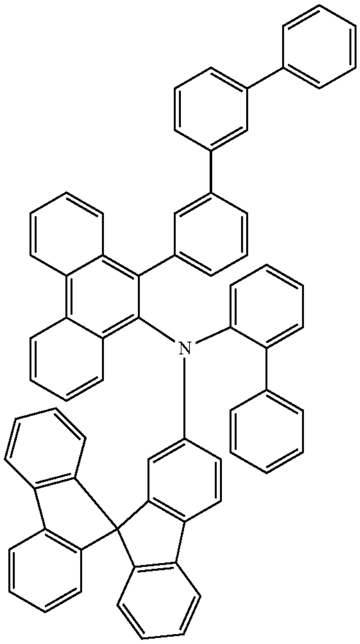
-continued
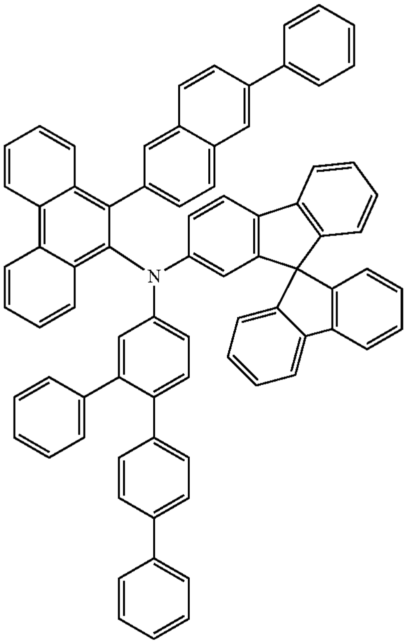
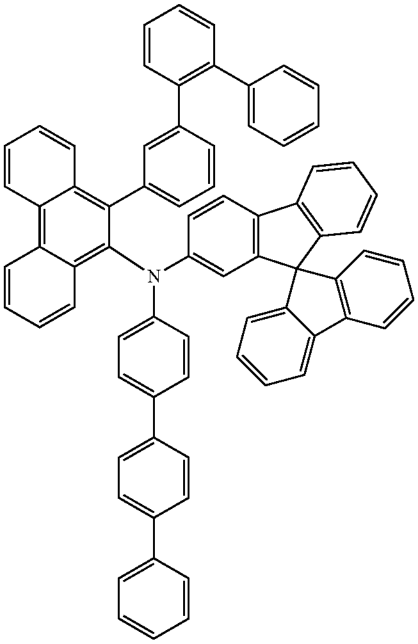

-continued
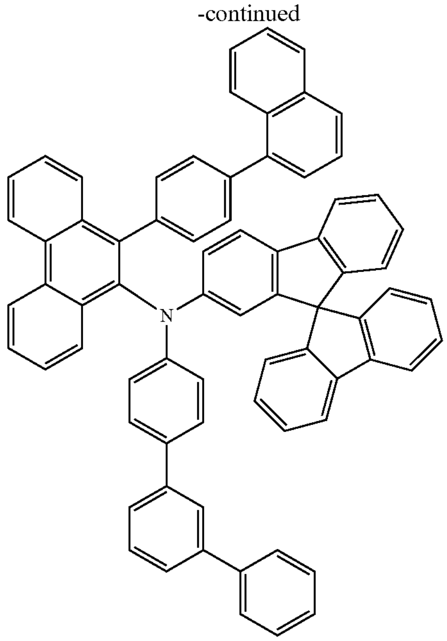
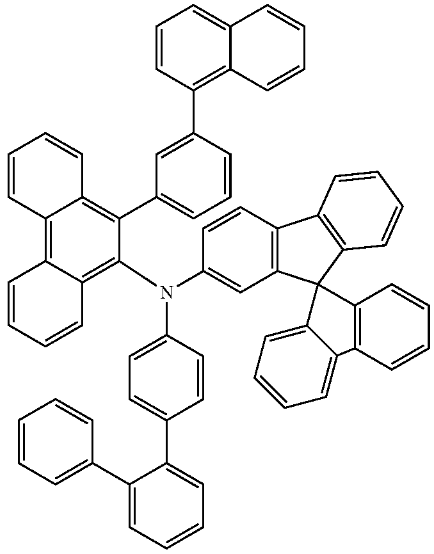
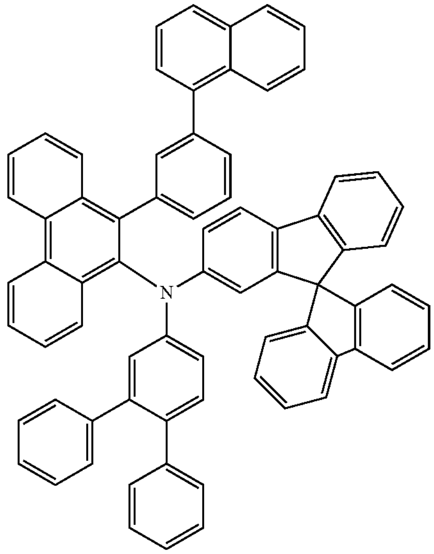
-continued
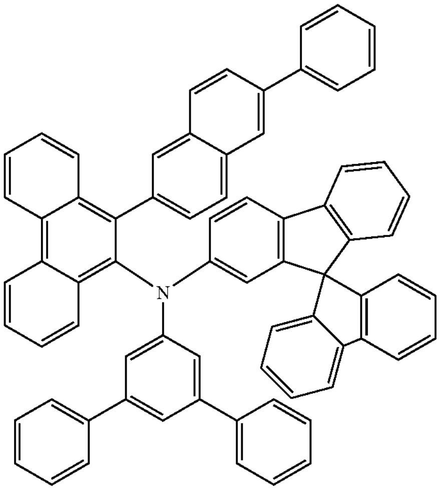
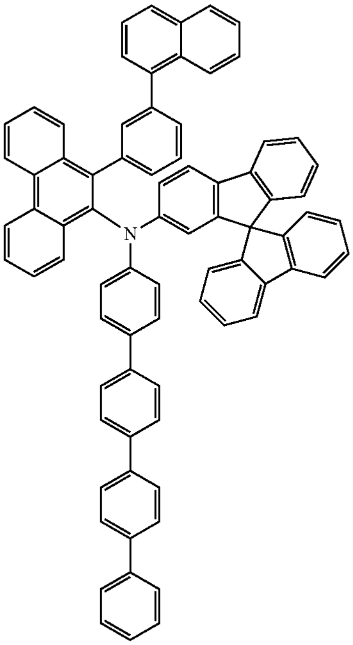

-continued
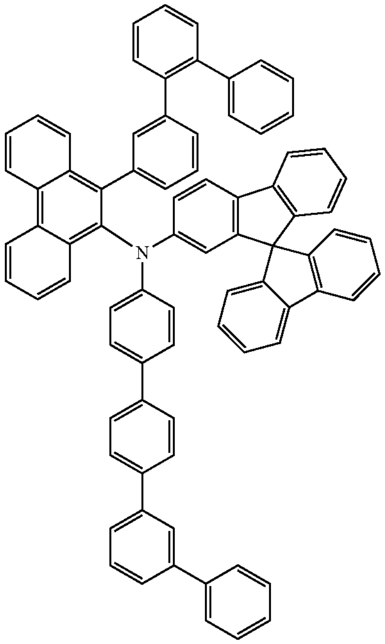
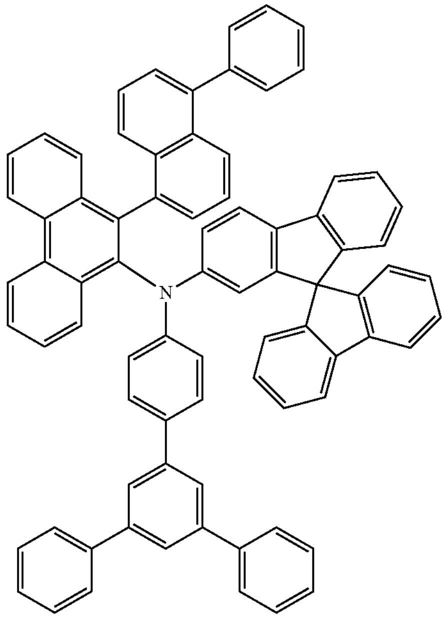
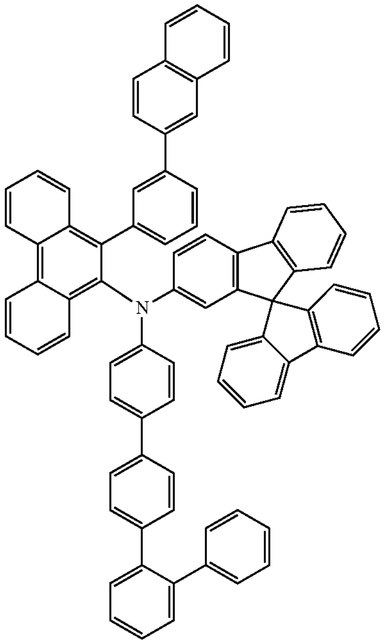
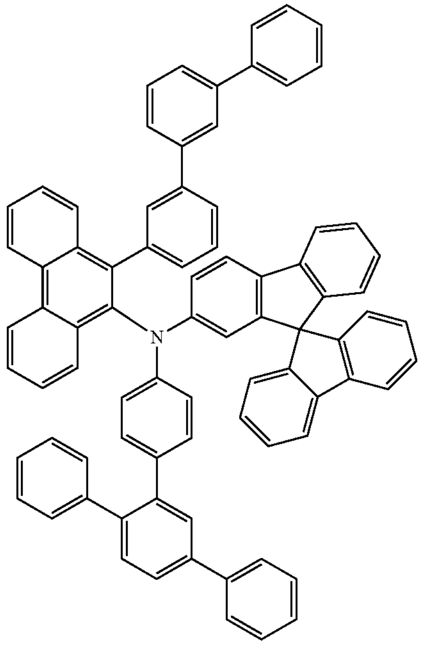

-continued
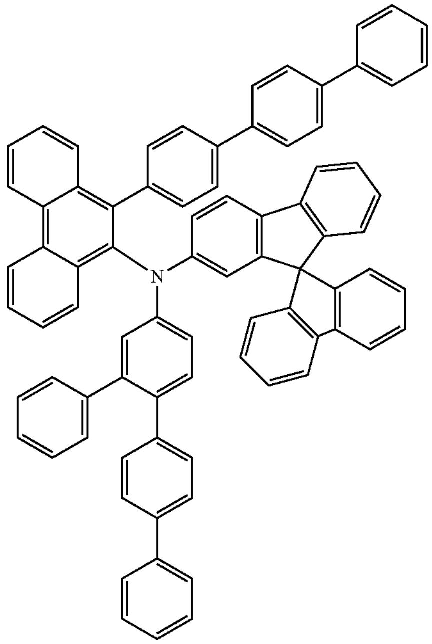
-continued
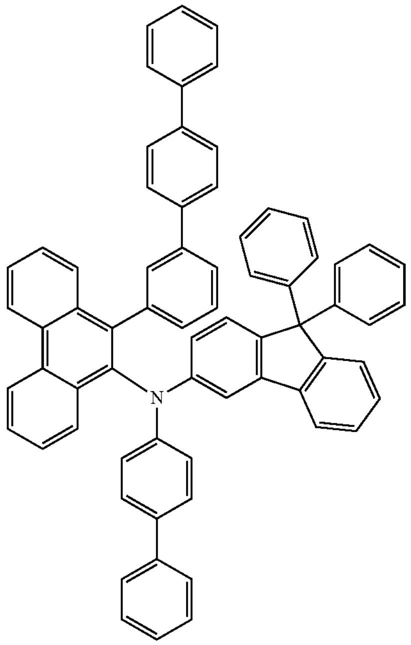
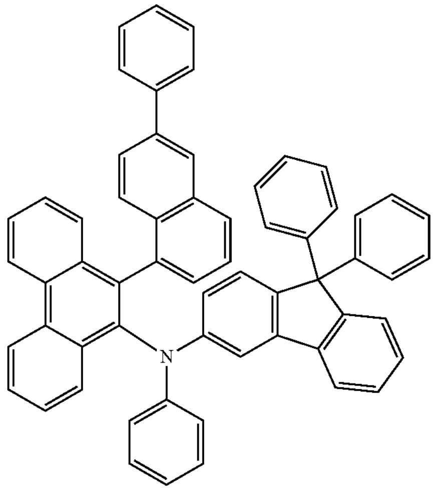
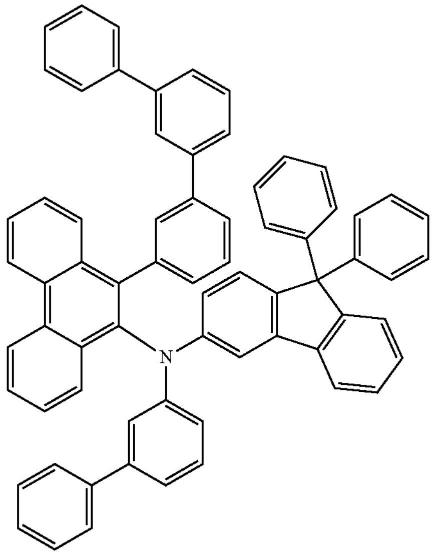

-continued
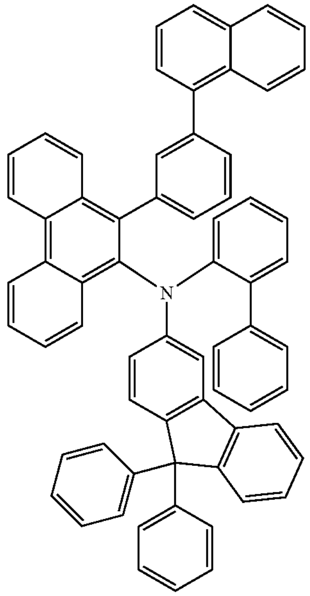
-continued
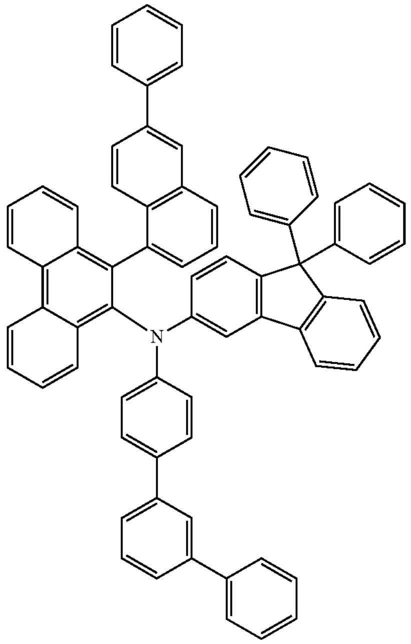
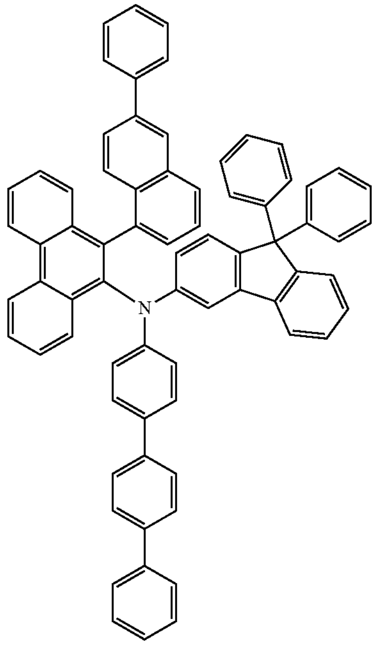
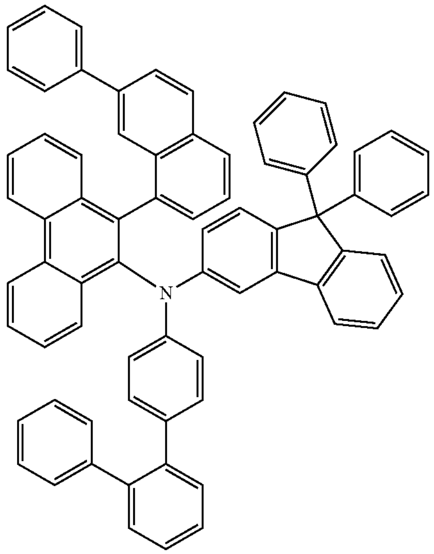

-continued
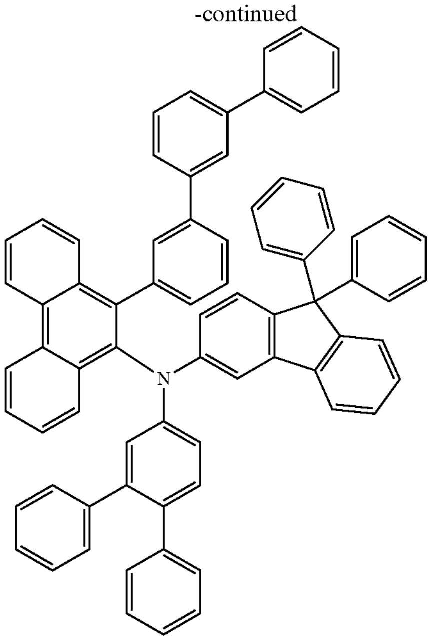
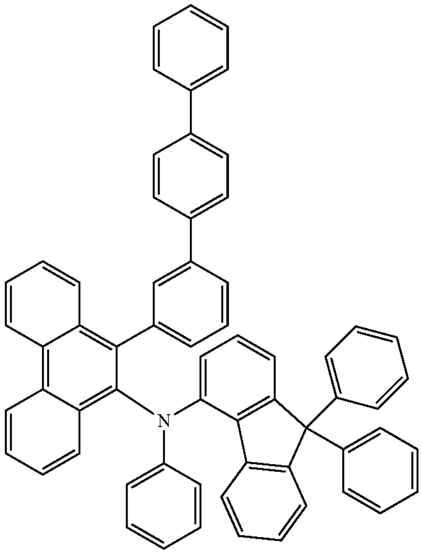
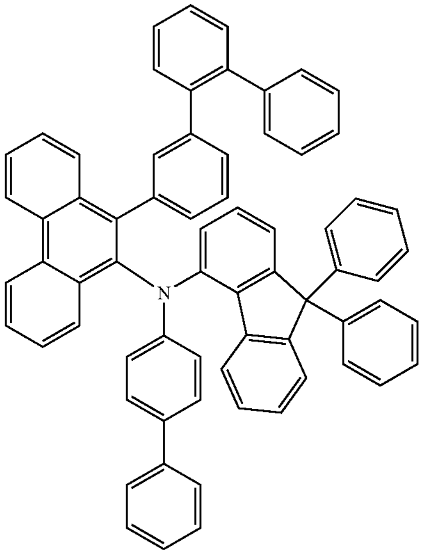
-continued
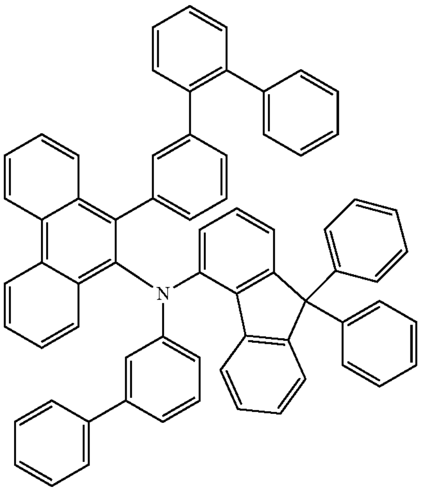
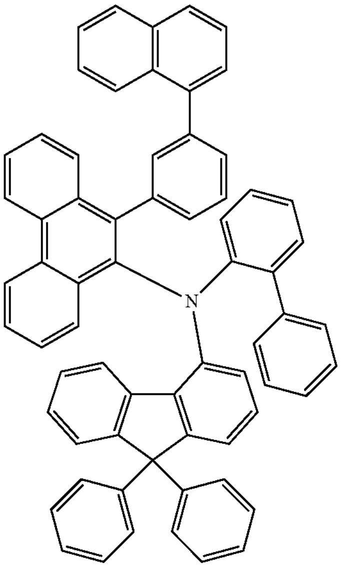
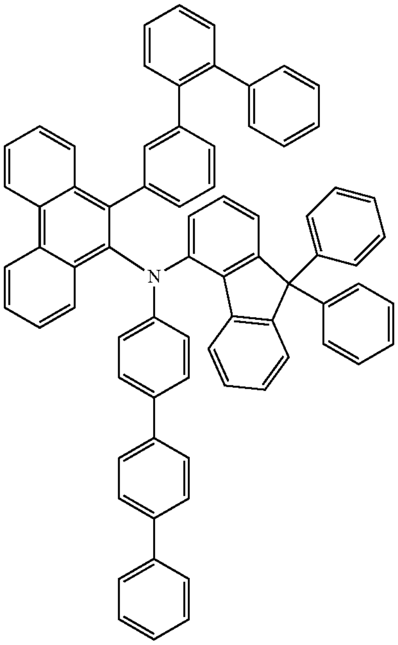

-continued
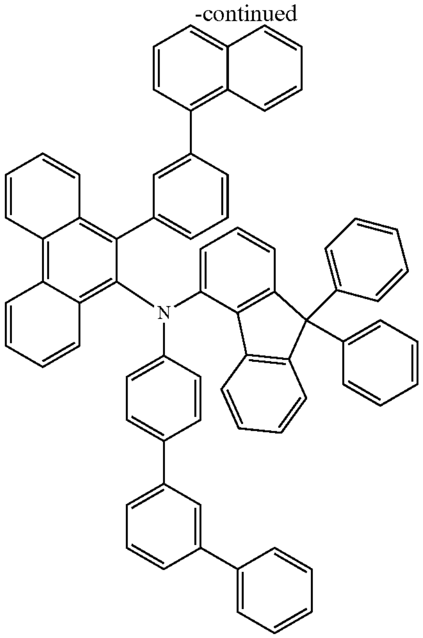
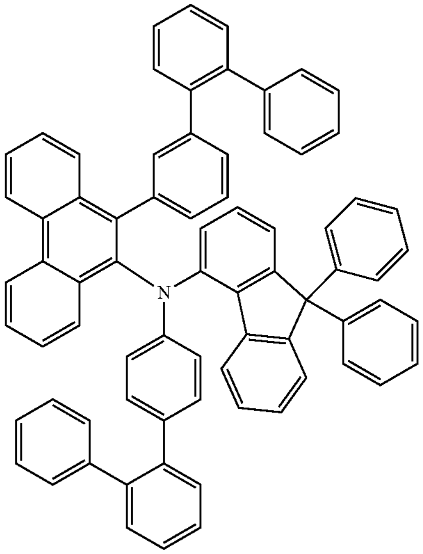
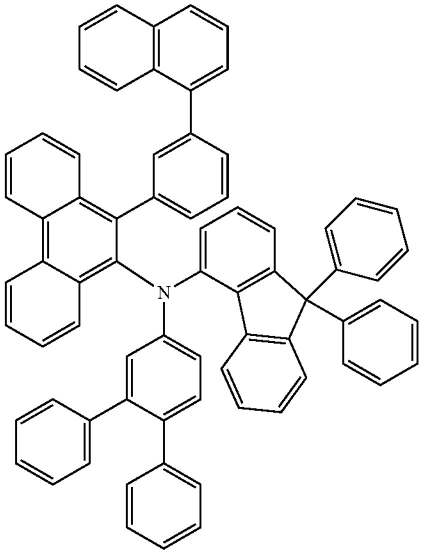
-continued
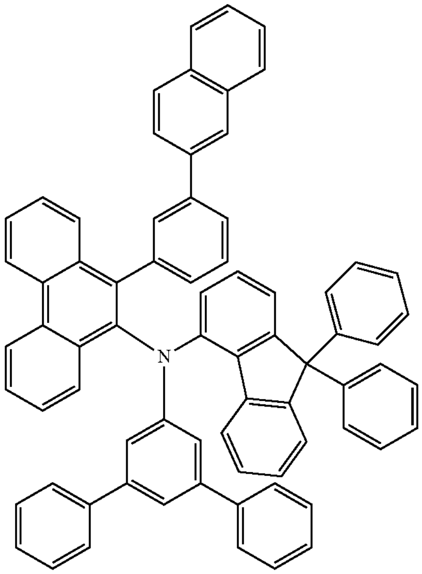
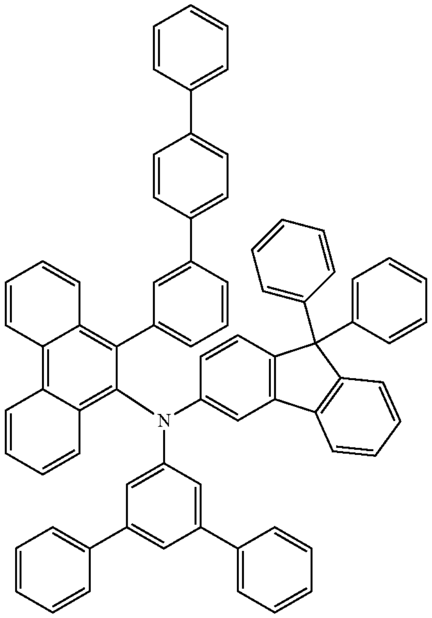
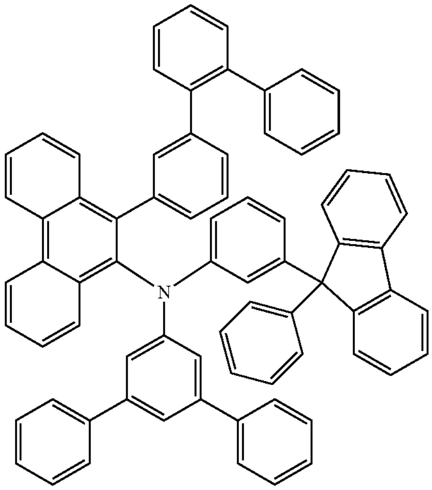

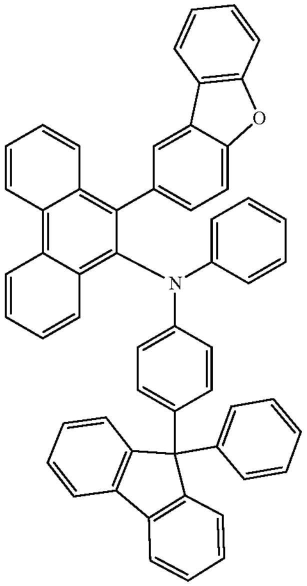
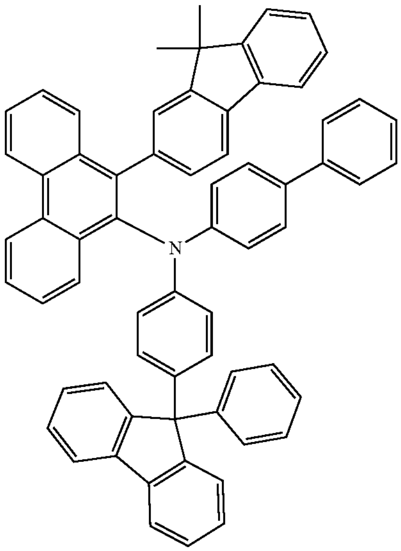
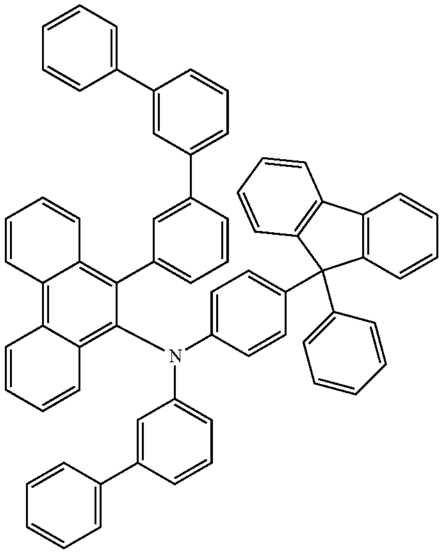
-continued
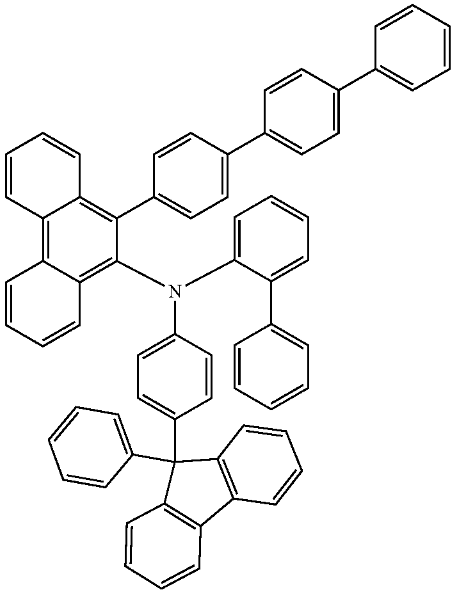
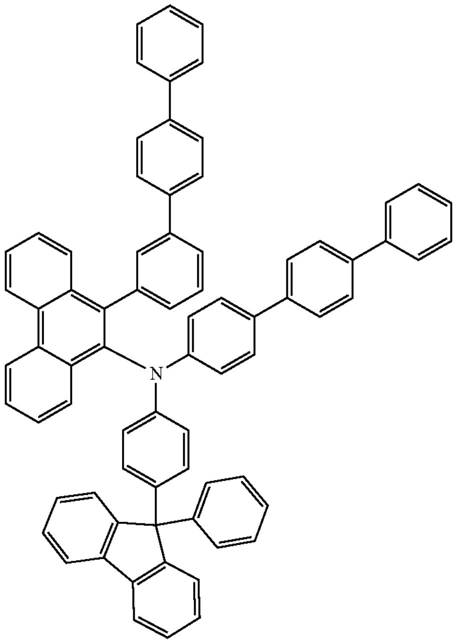

-continued
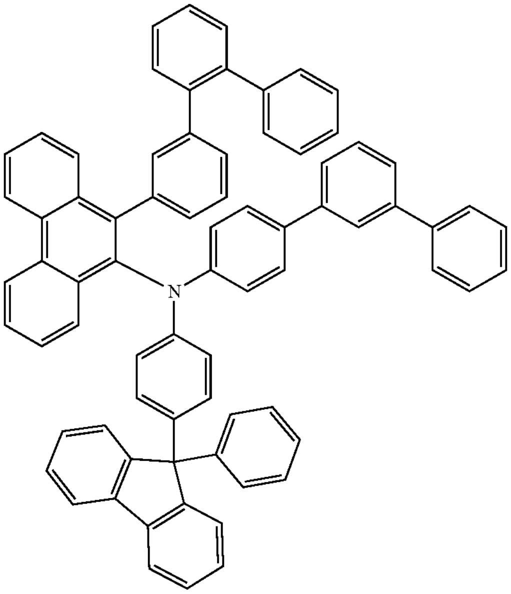
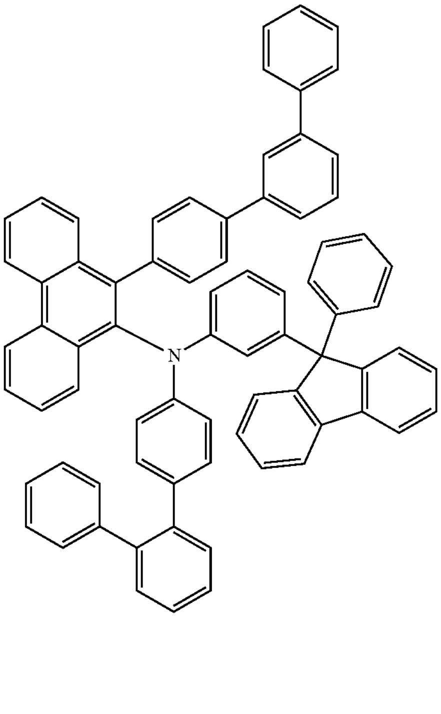
-continued
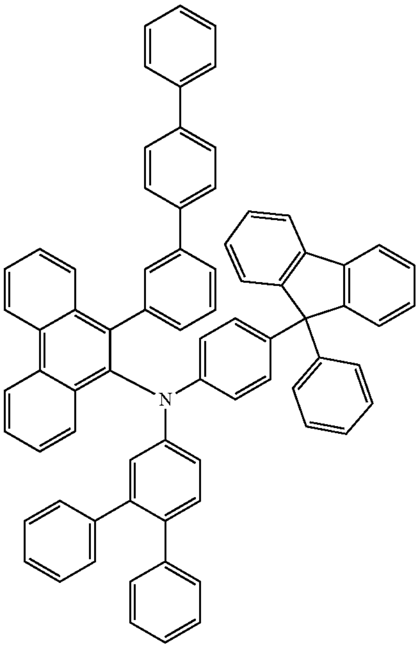
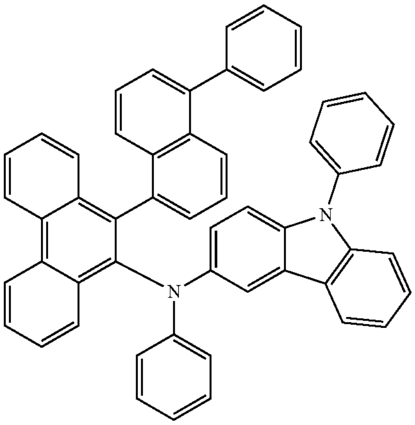
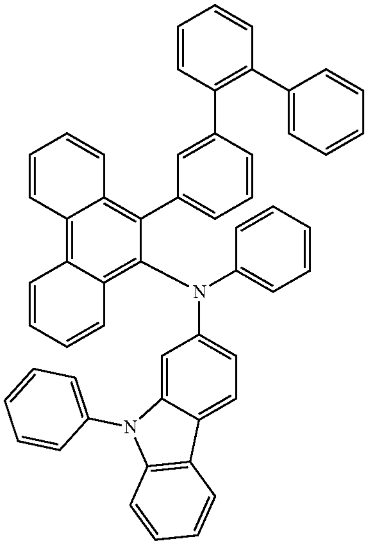

-continued
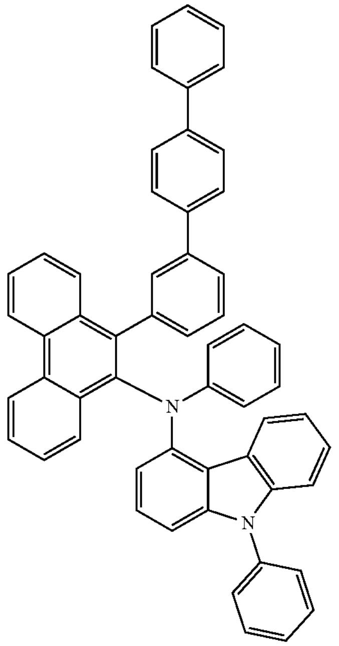
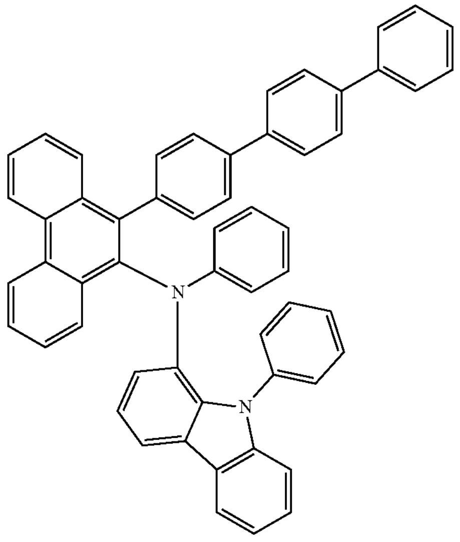
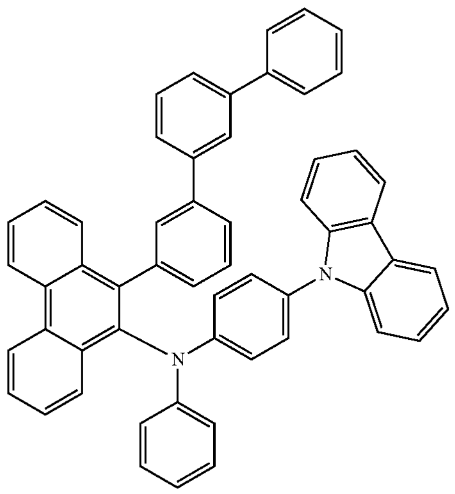
-continued
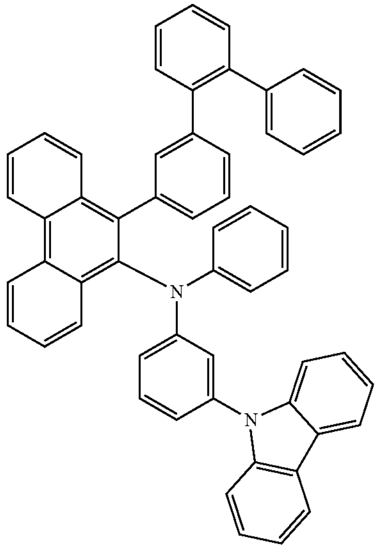
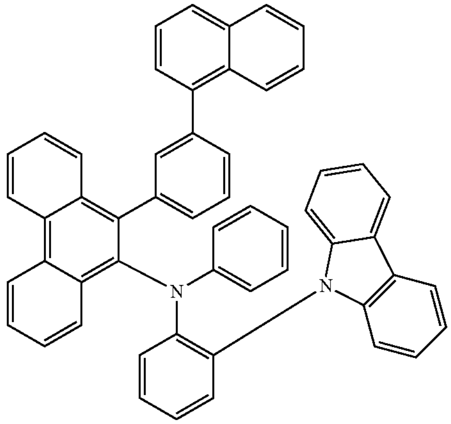
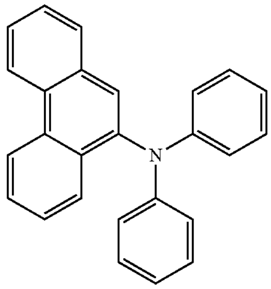
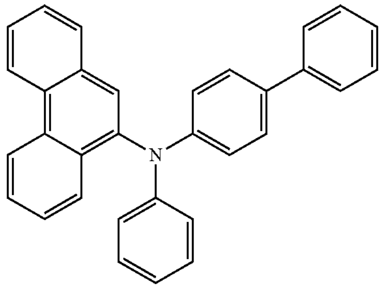

-continued
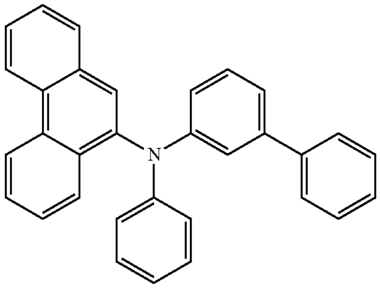
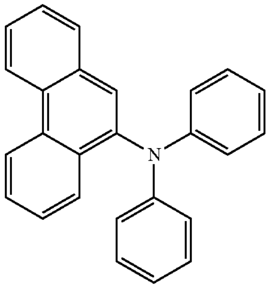
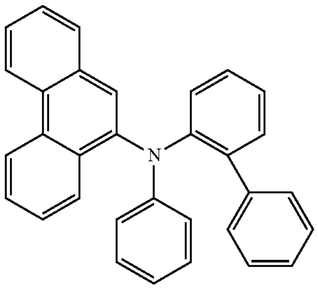
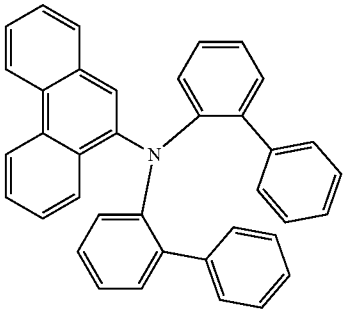
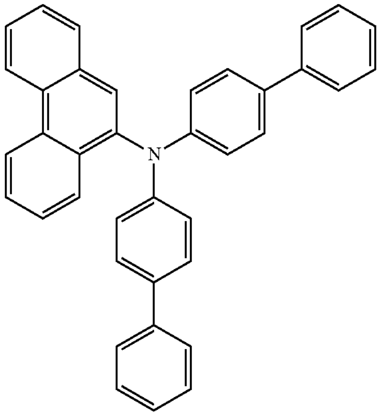
-continued
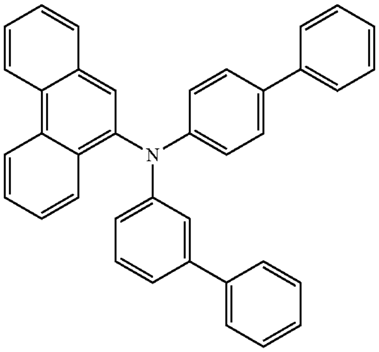
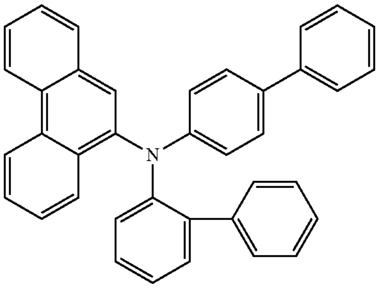
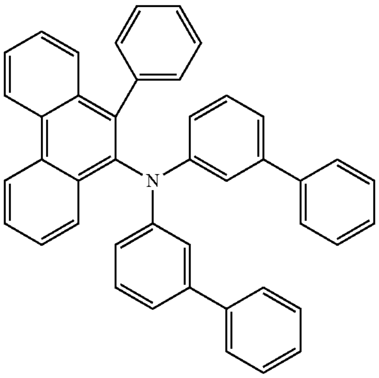
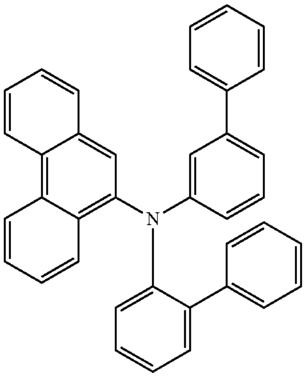

-continued
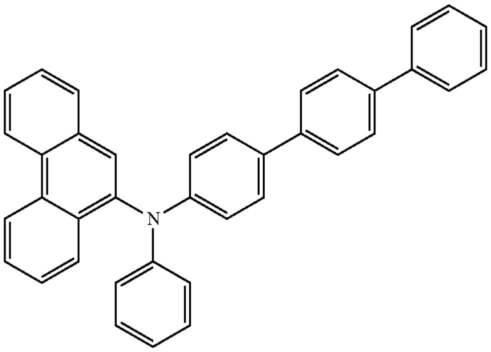
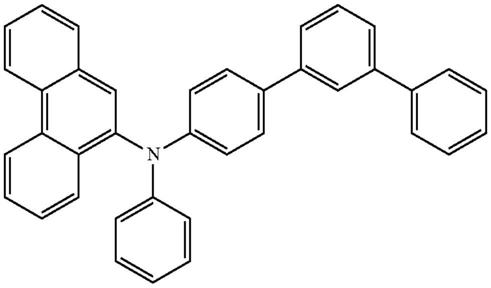
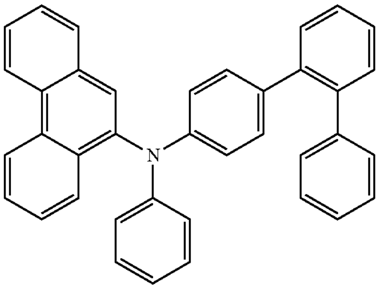
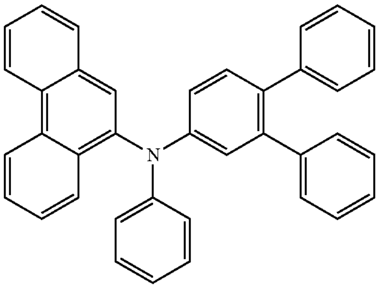
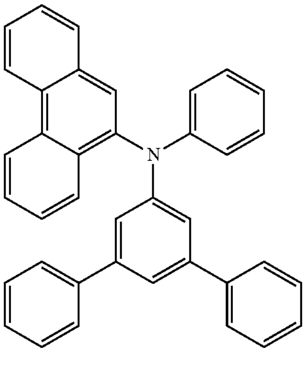
-continued
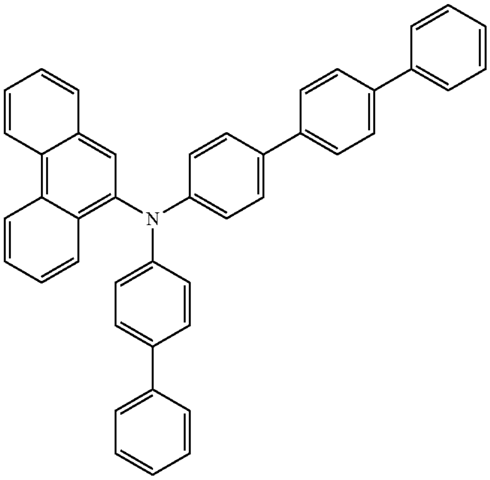
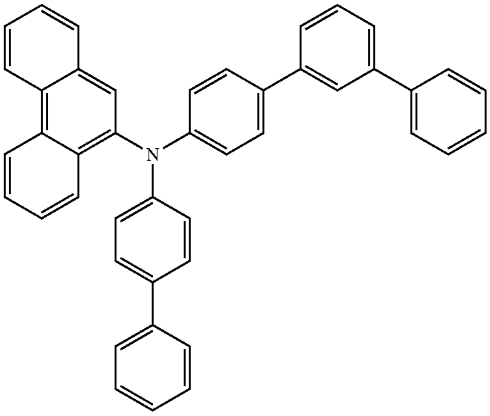
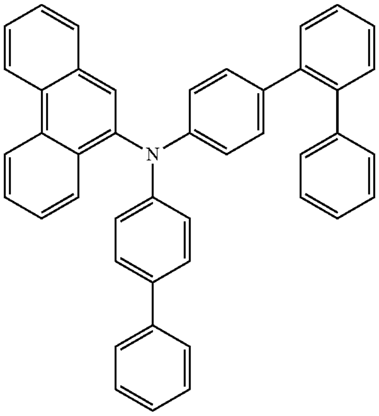
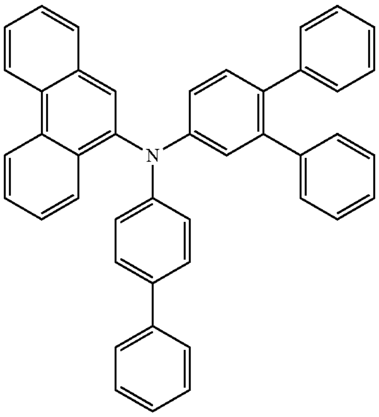

-continued
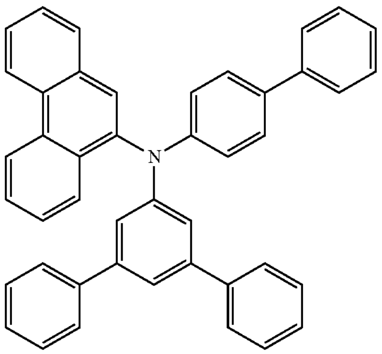
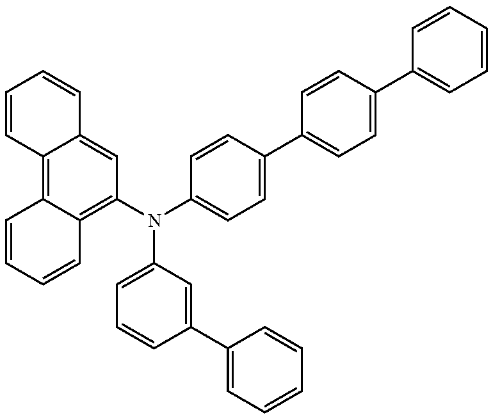
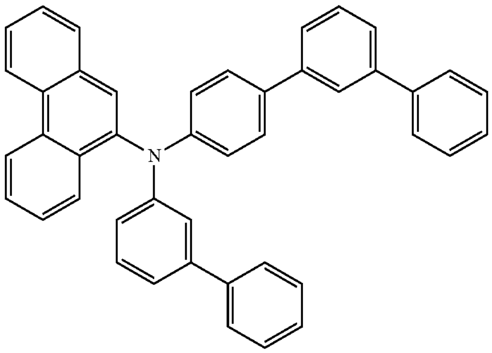
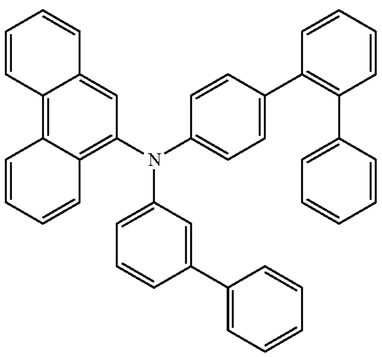
-continued
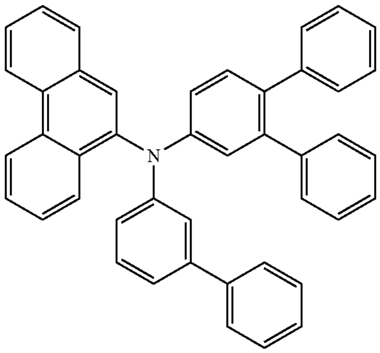
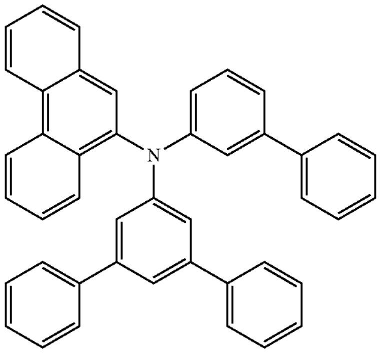
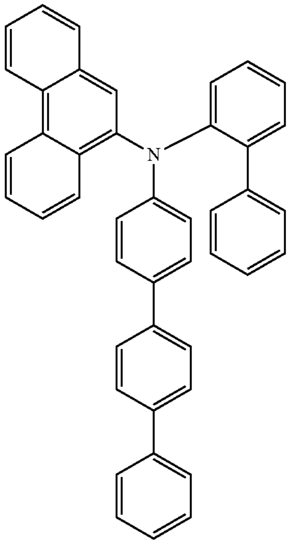
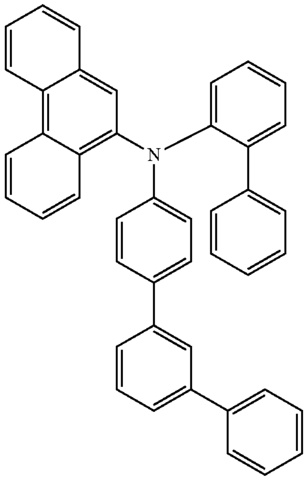

-continued
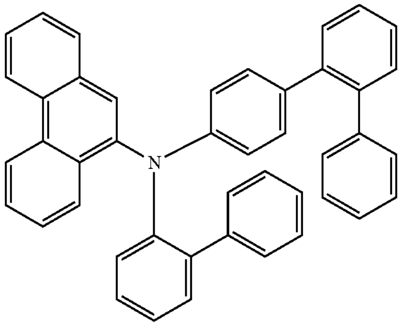
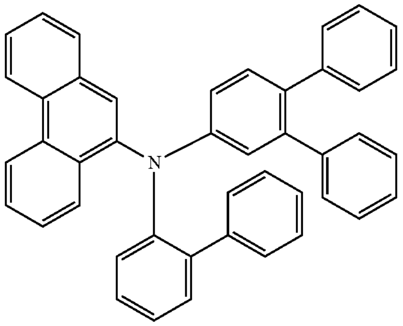
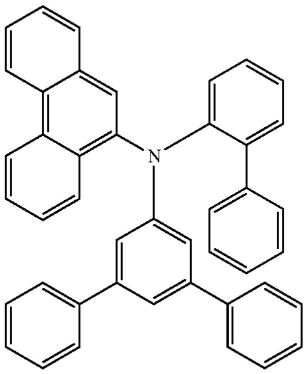
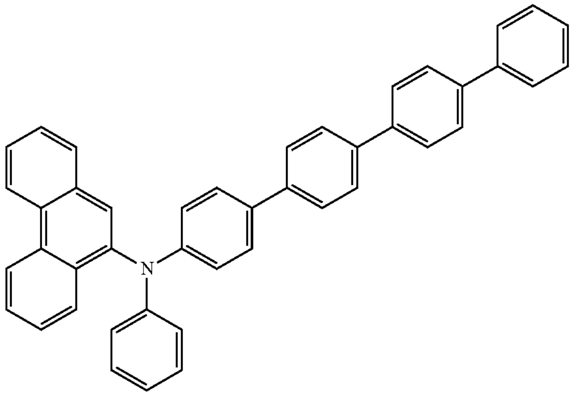
-continued
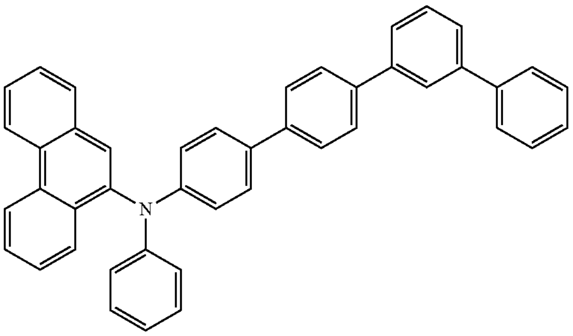
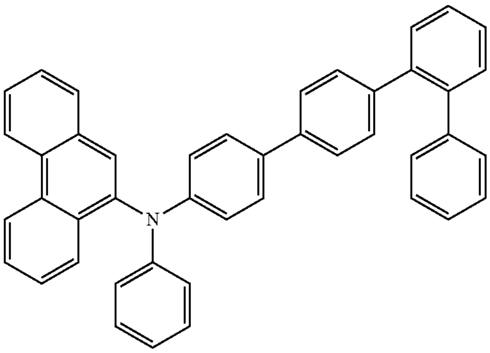
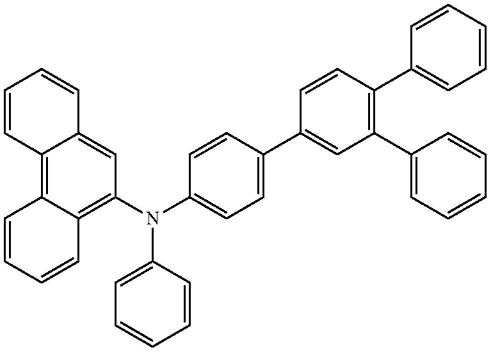
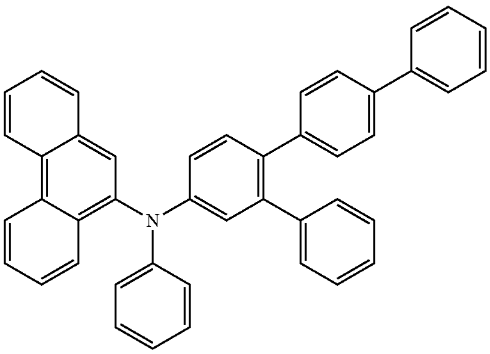

-continued
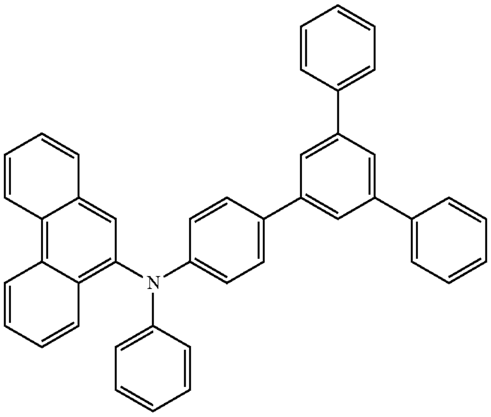
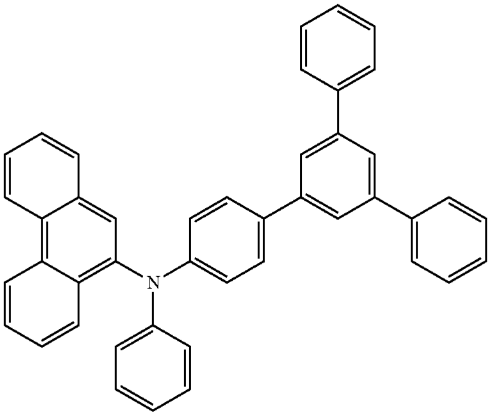
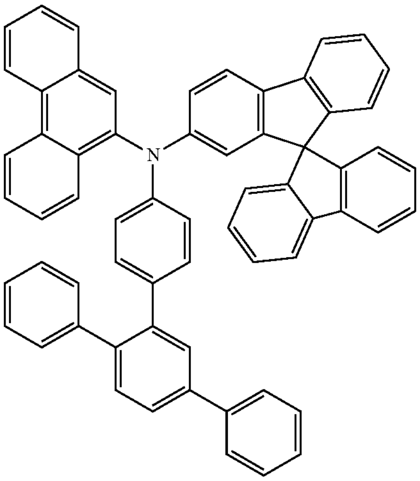
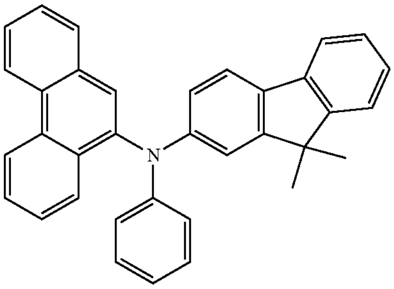
-continued
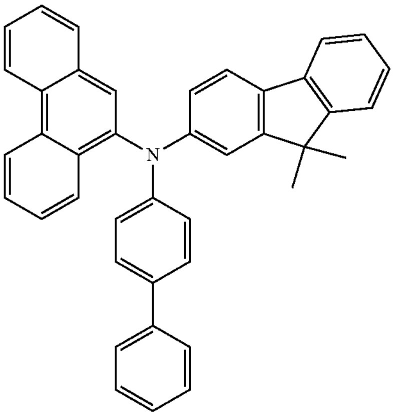
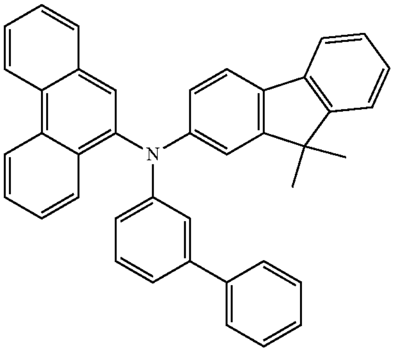
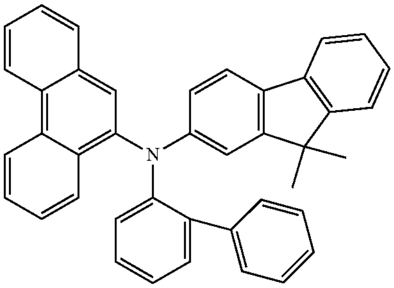
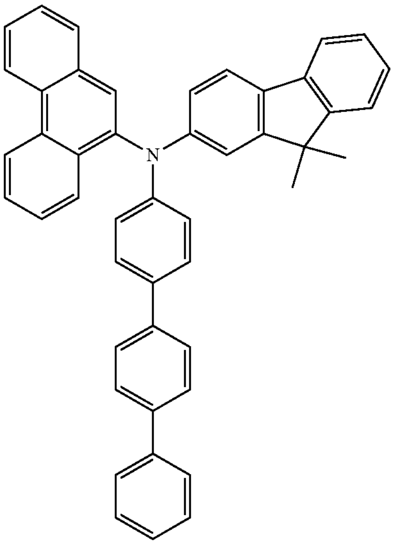

-continued
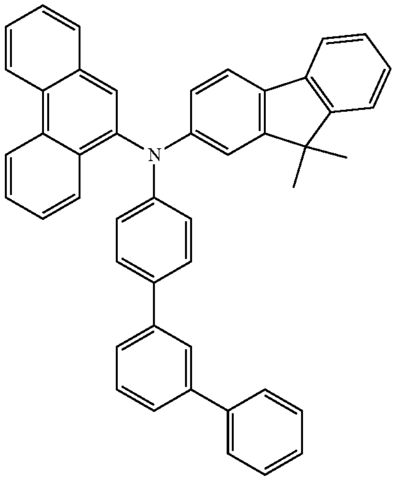
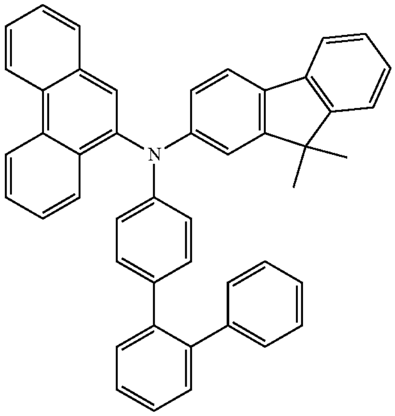
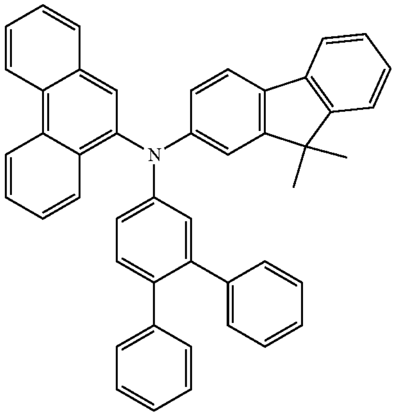
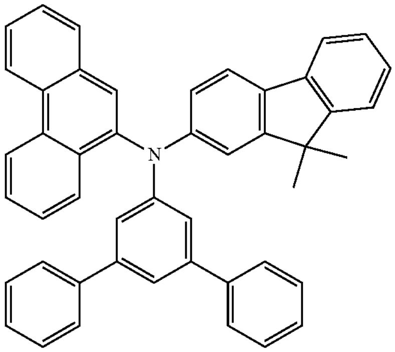
-continued
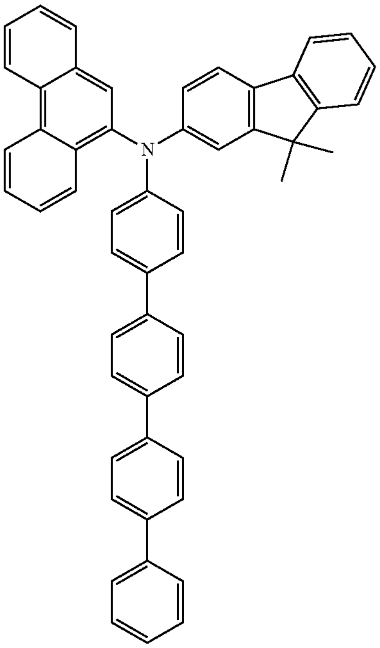
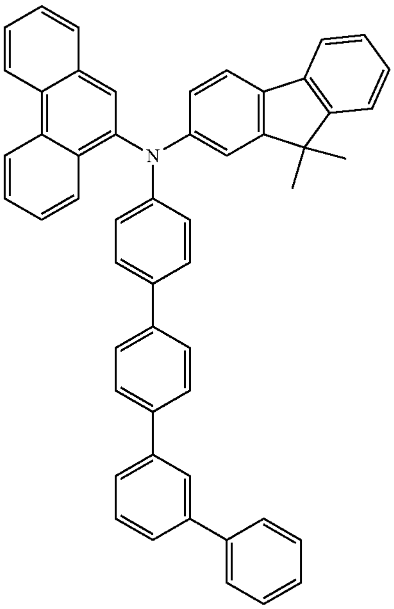

-continued
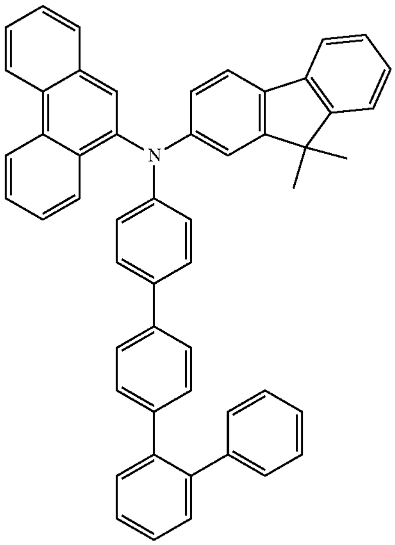
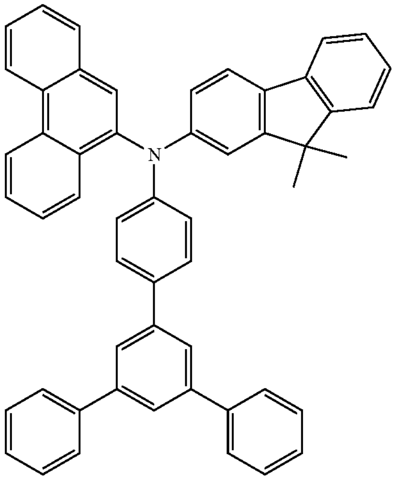
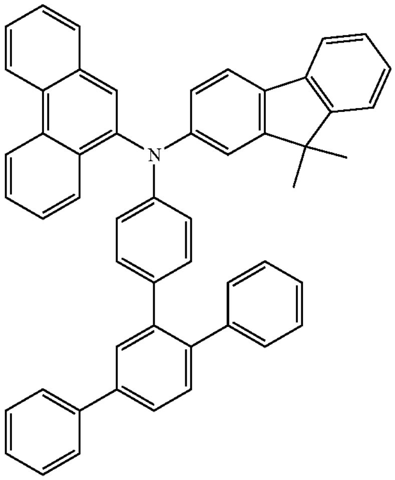
-continued
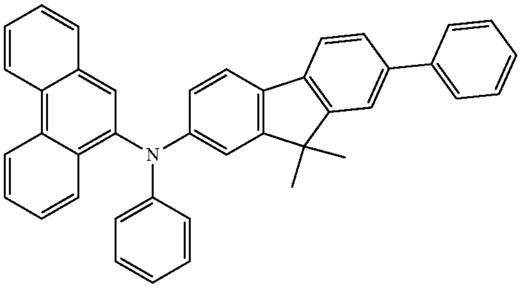
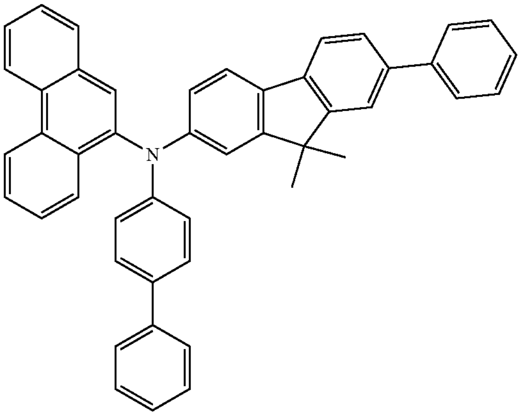
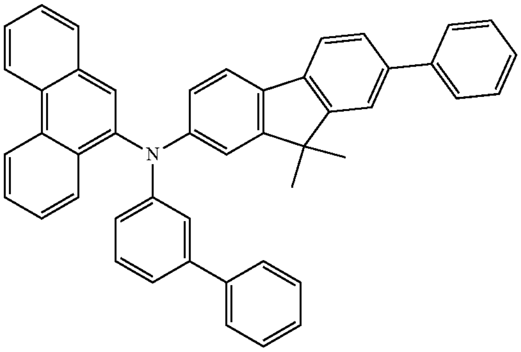
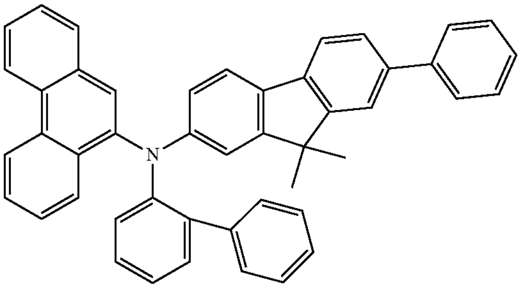

-continued
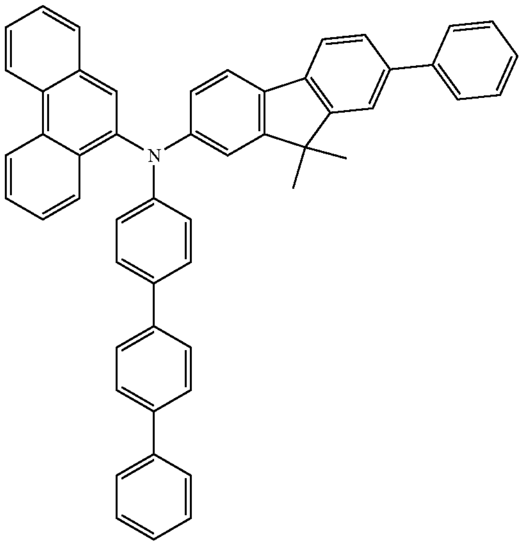
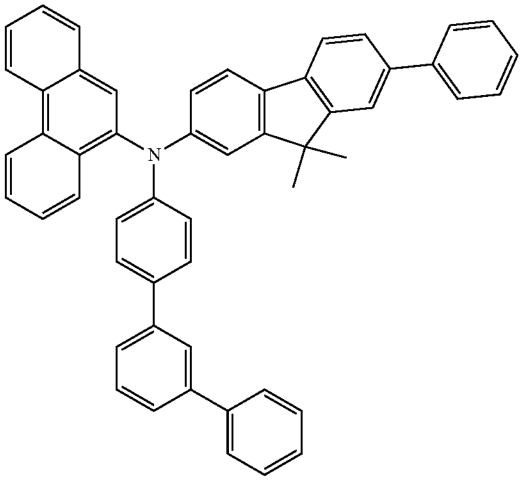
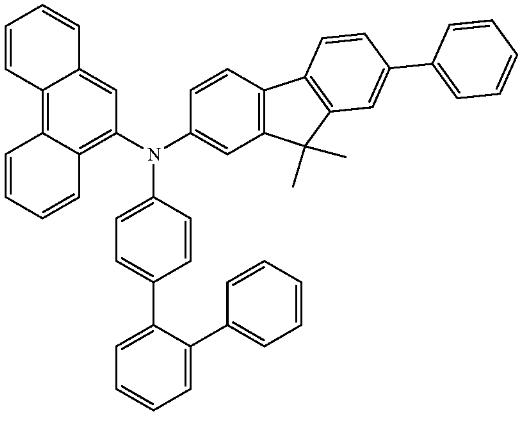
-continued
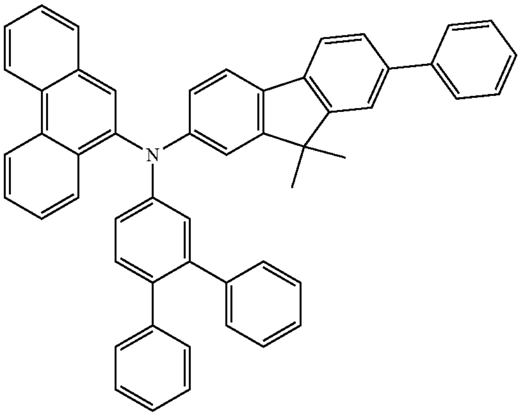
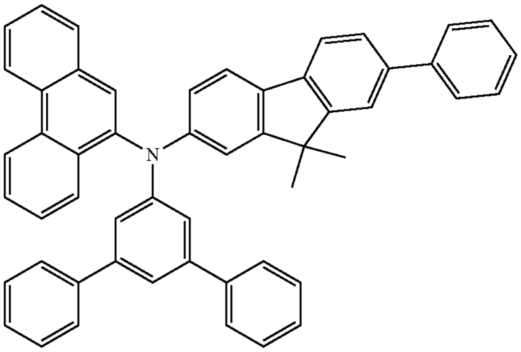
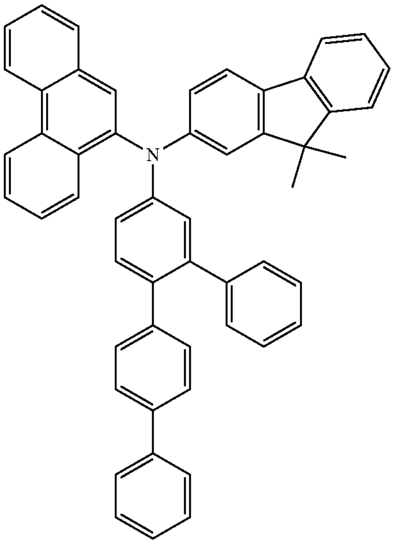
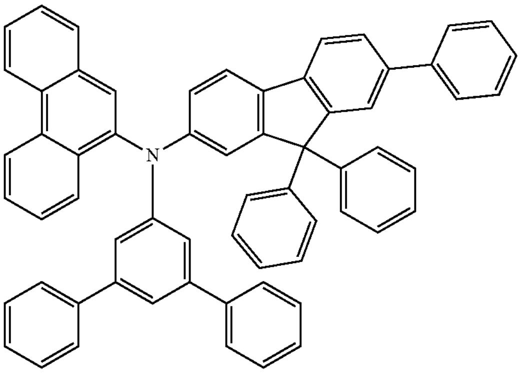

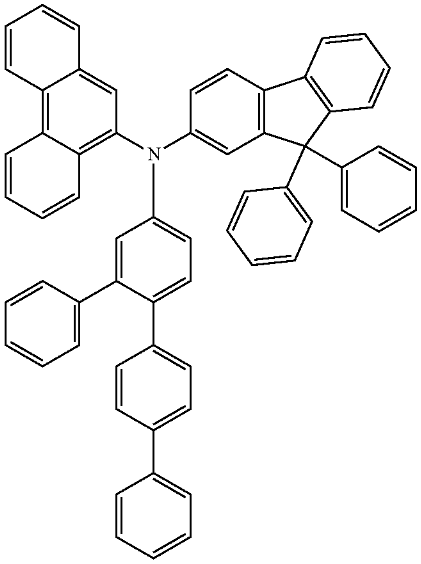
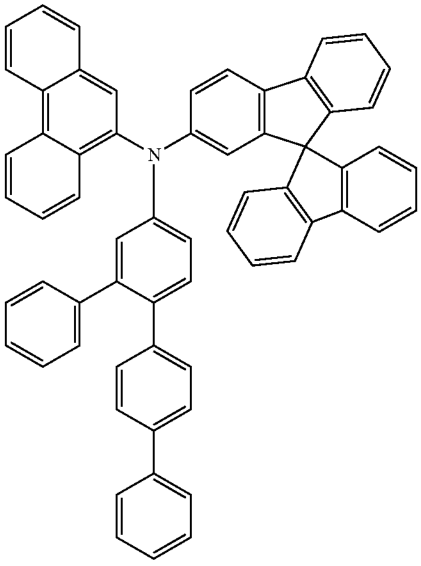
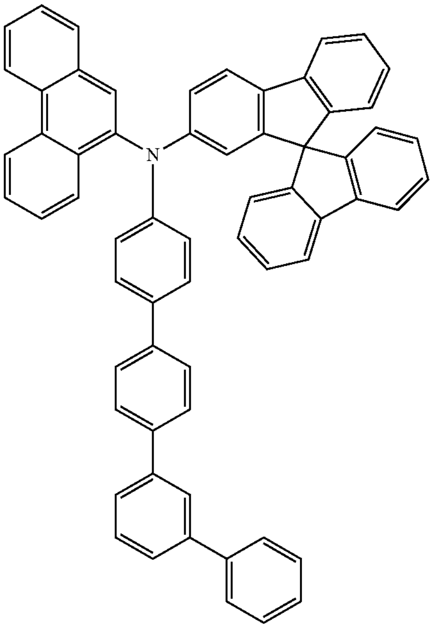
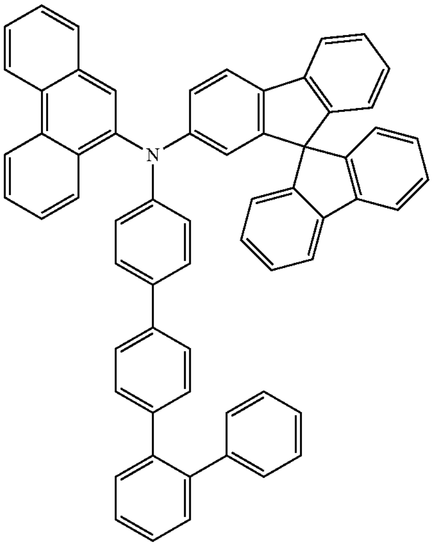
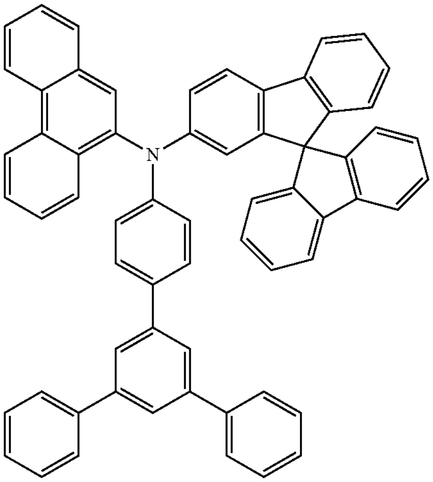

-continued
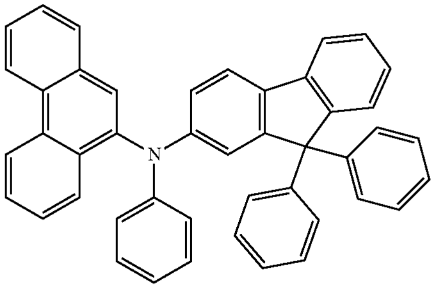
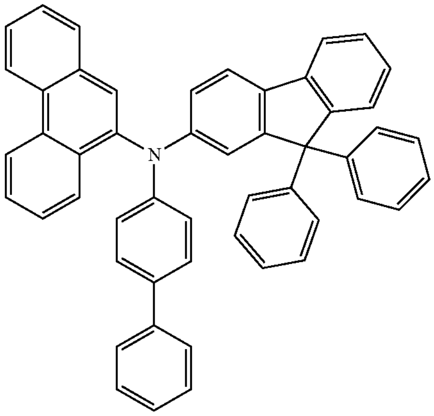
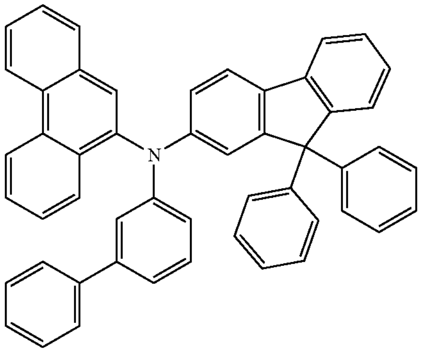
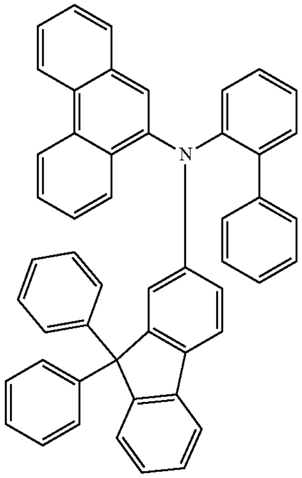
-continued
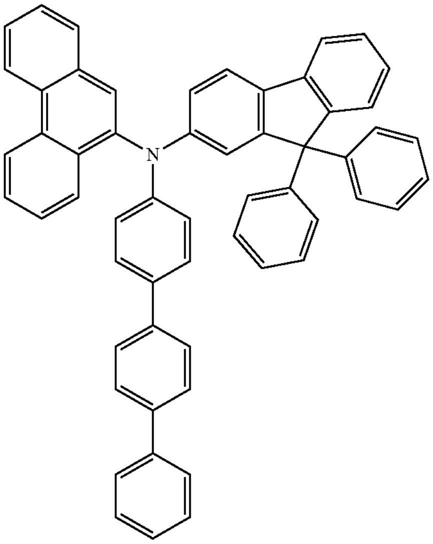
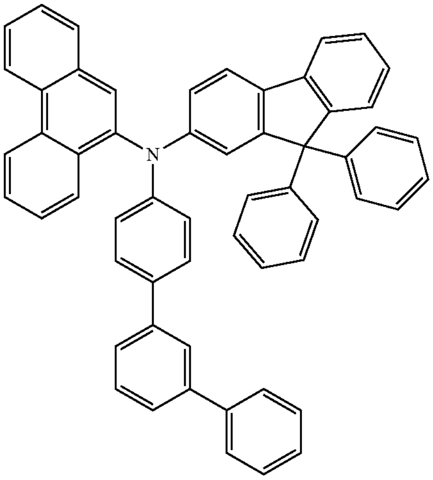
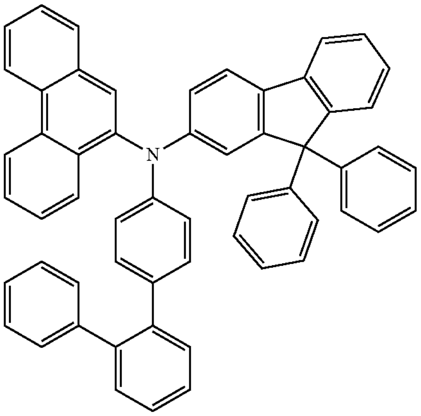

-continued
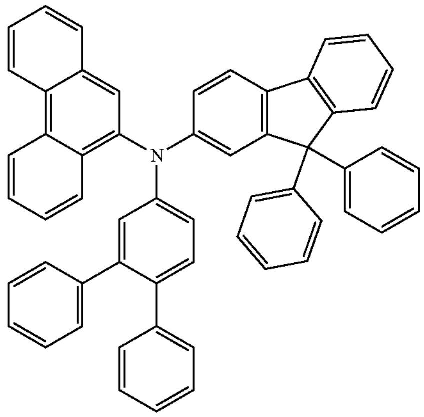
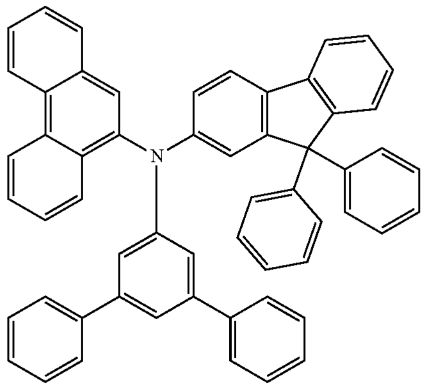
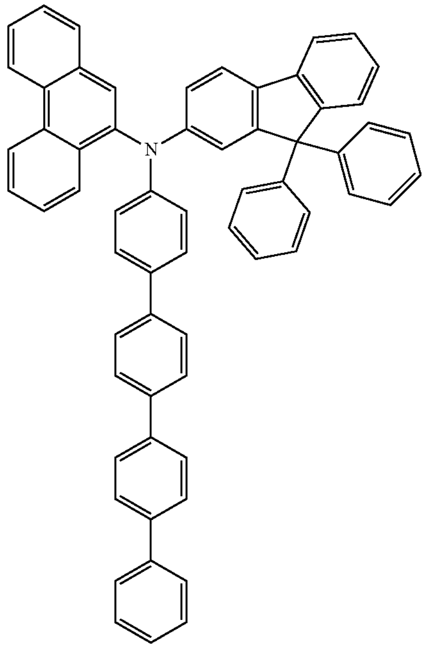
-continued
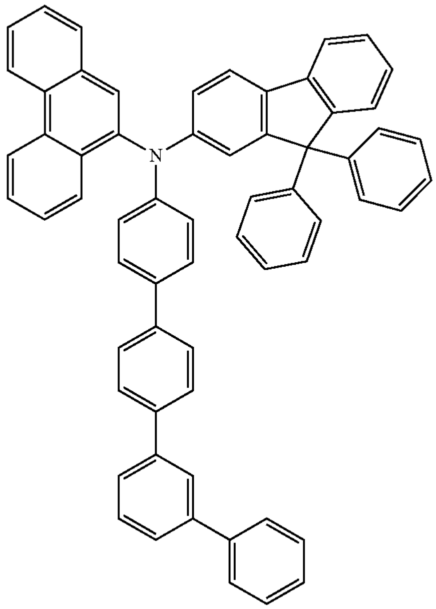
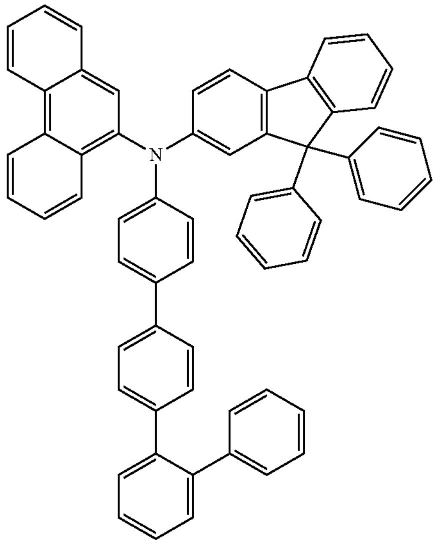
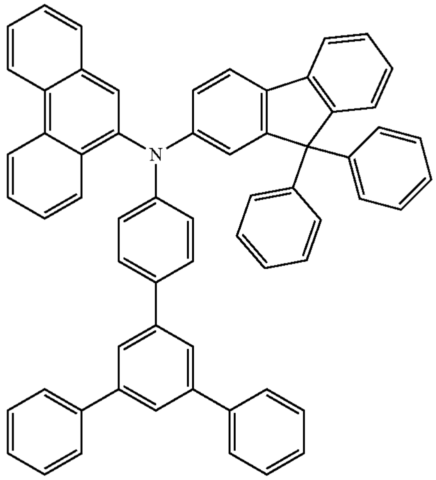

-continued
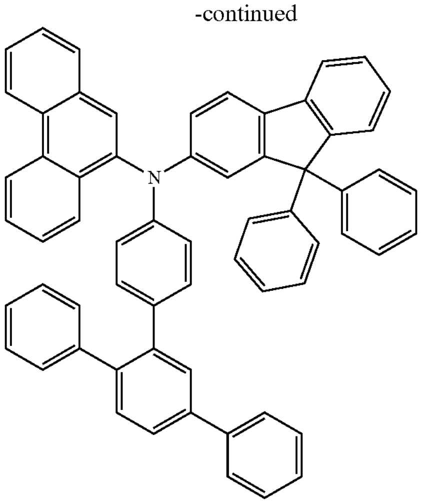
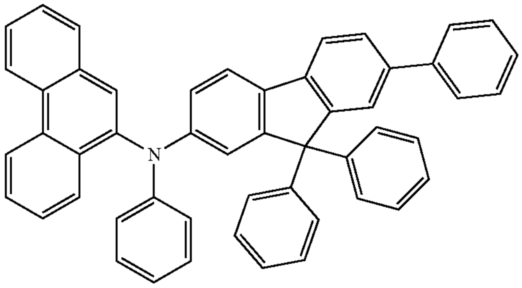
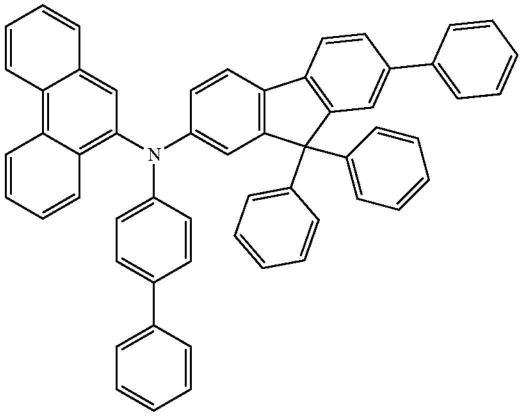
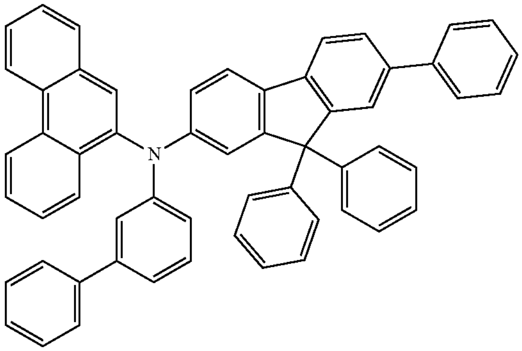
-continued
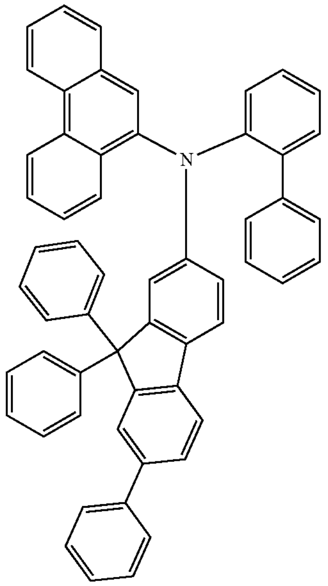
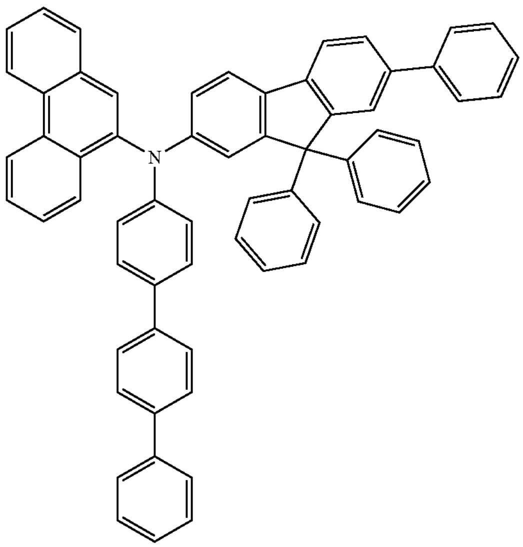
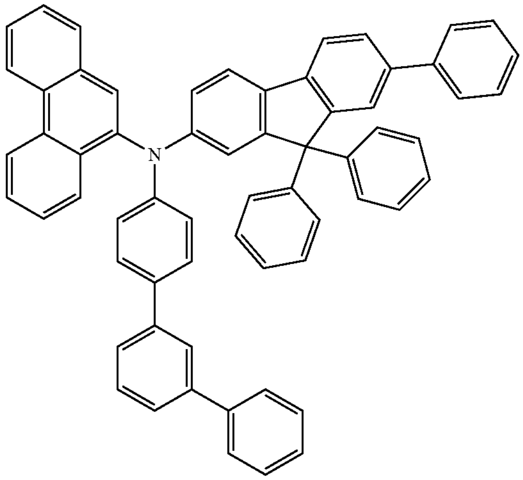

-continued
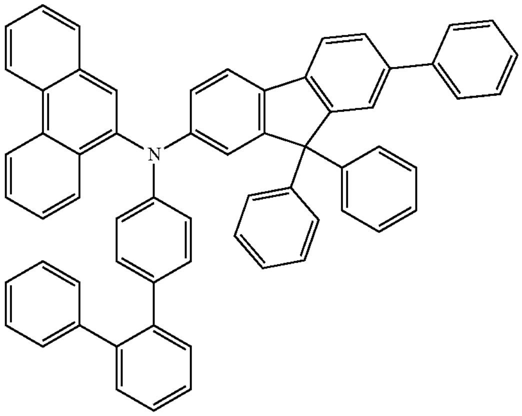
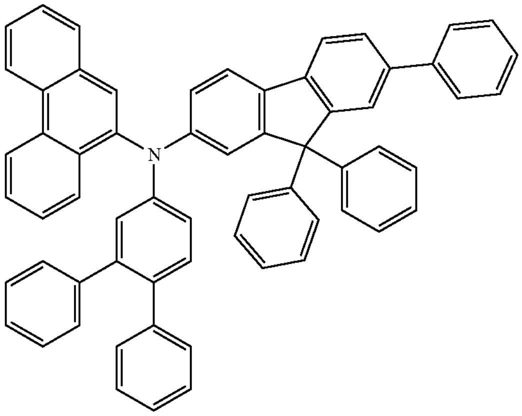
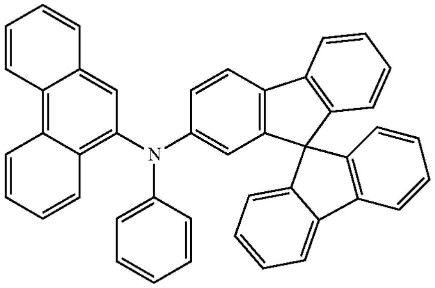
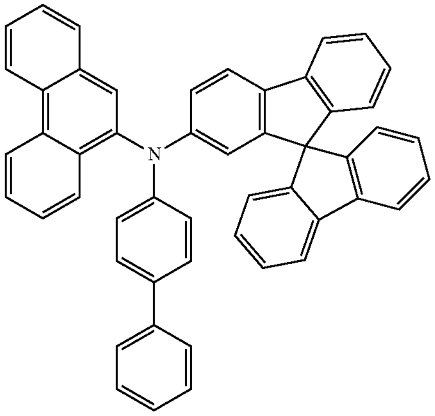
-continued
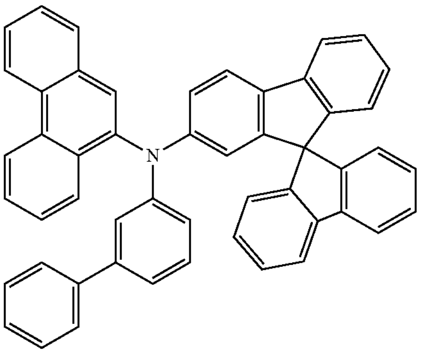
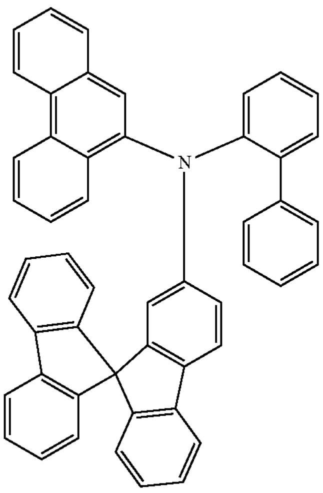
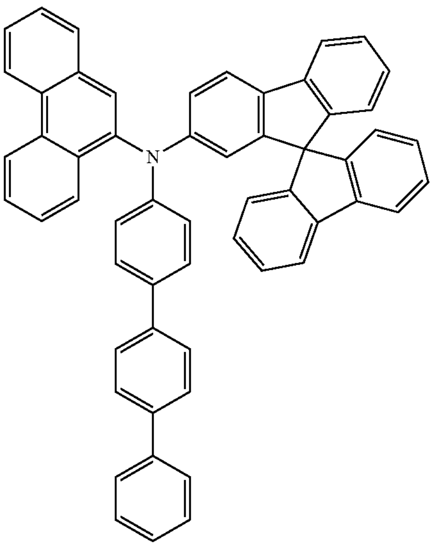

-continued
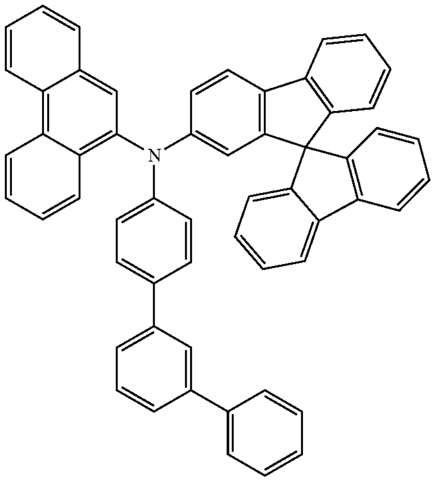
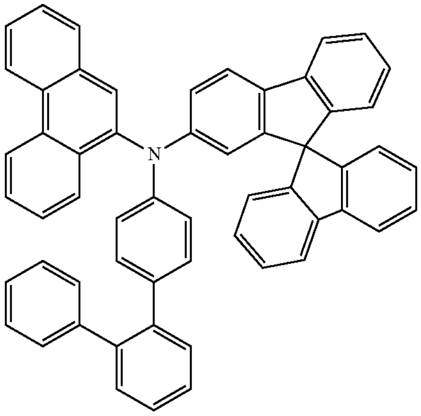
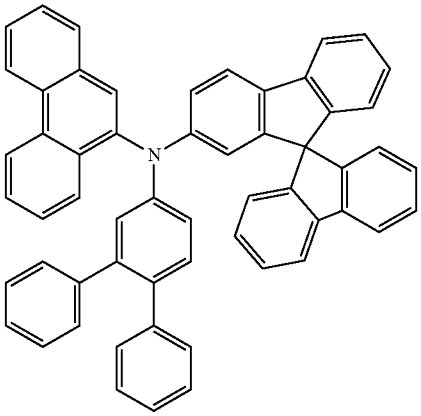
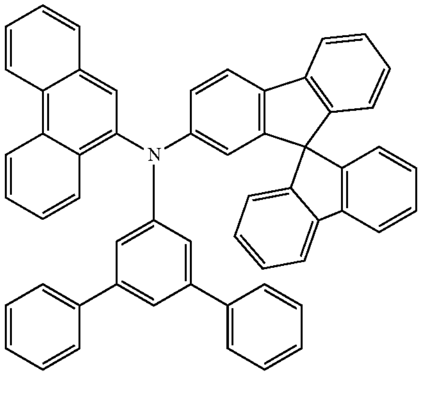
-continued
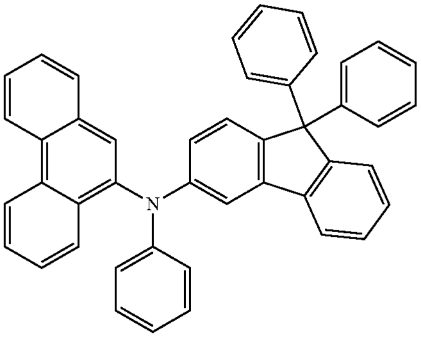
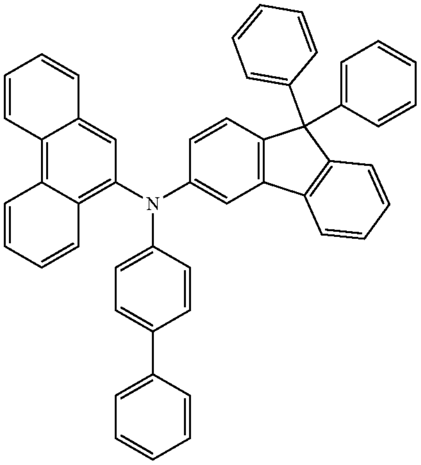
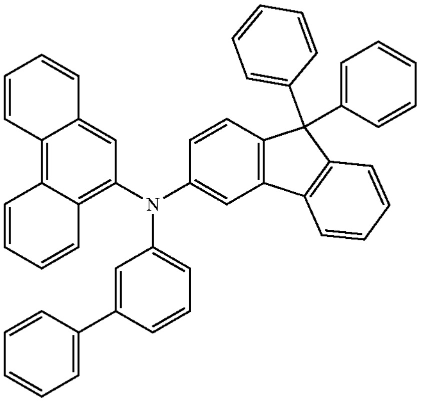
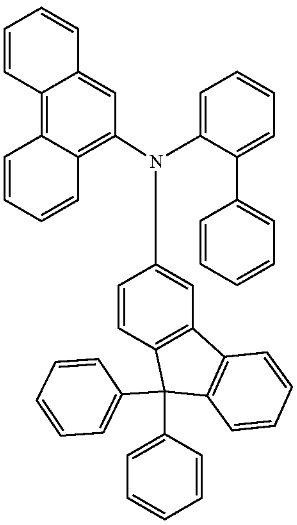

-continued
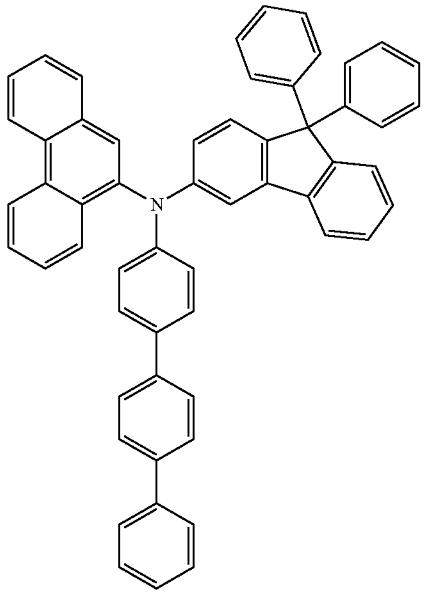
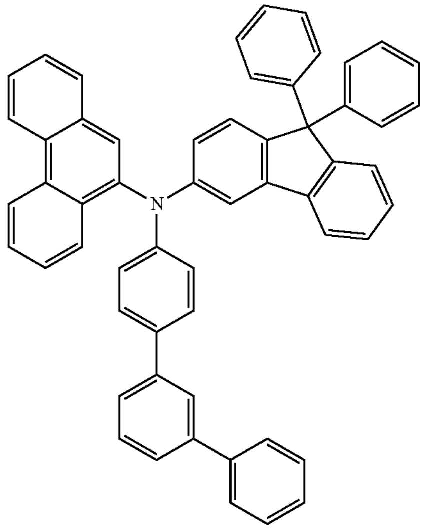
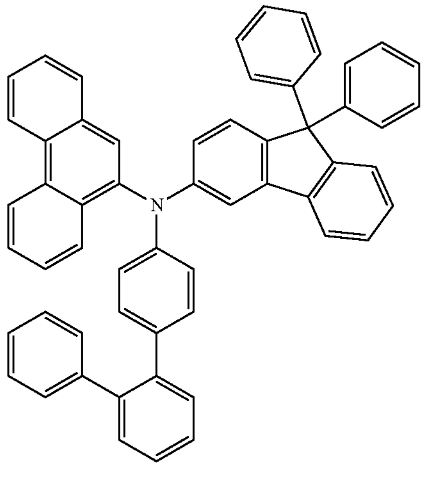
-continued
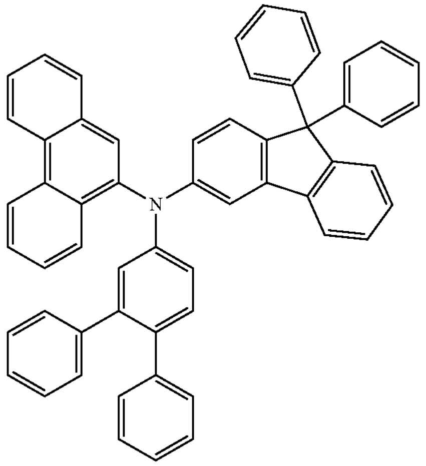
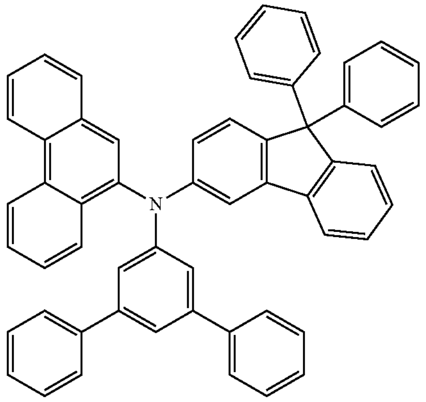
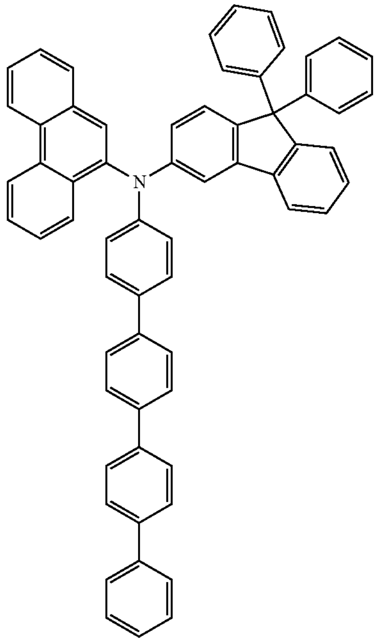

-continued
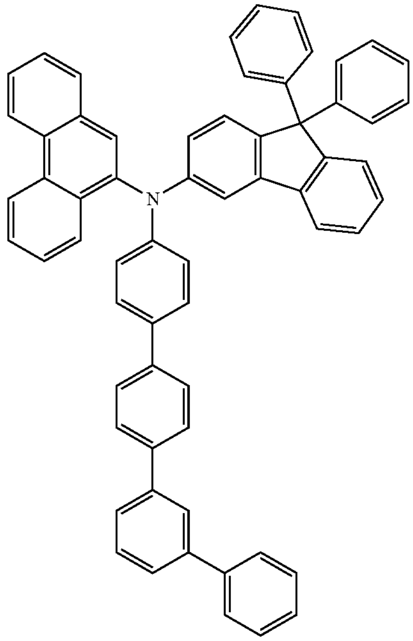
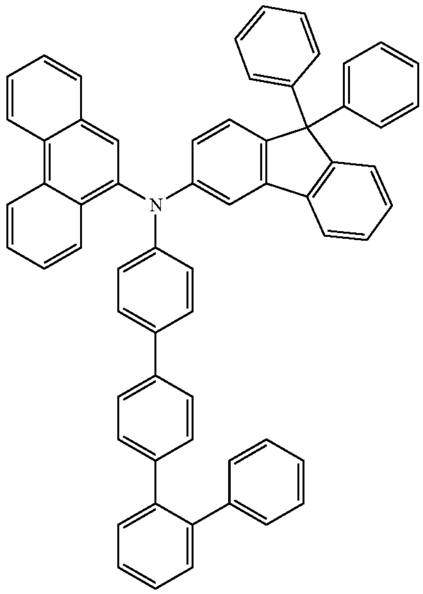
-continued
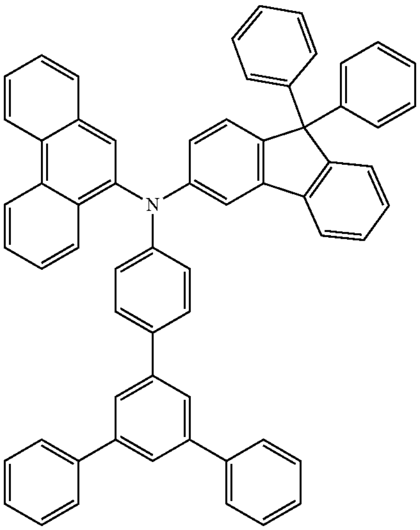
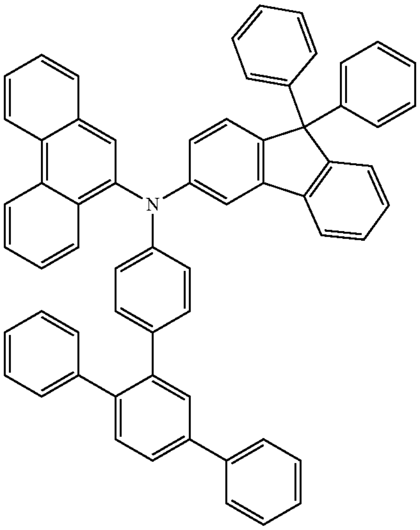
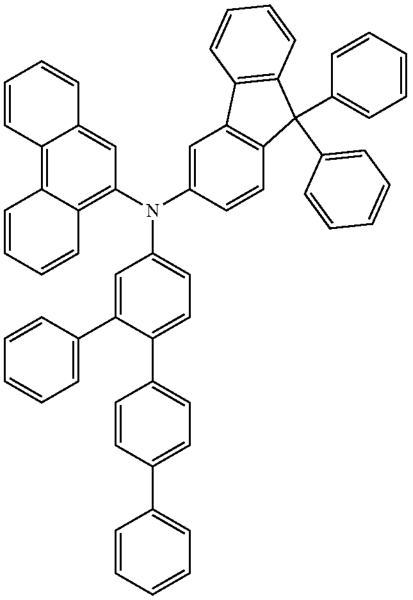

-continued
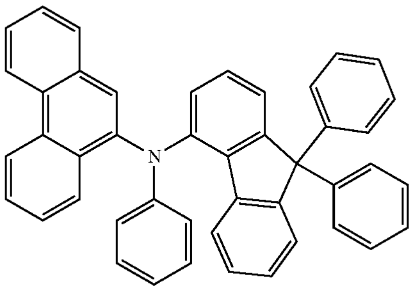
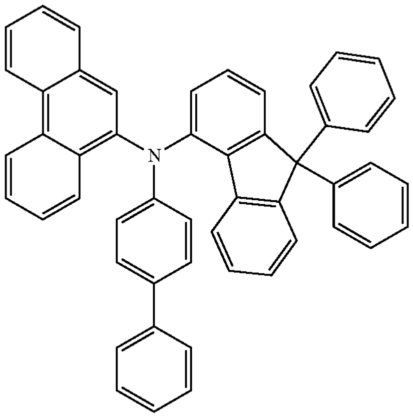
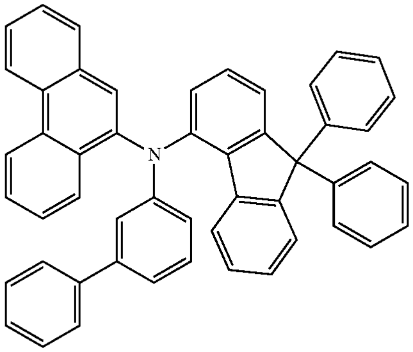
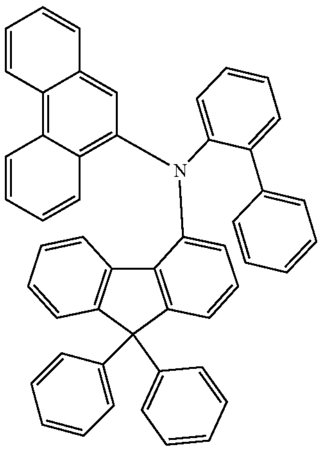
-continued
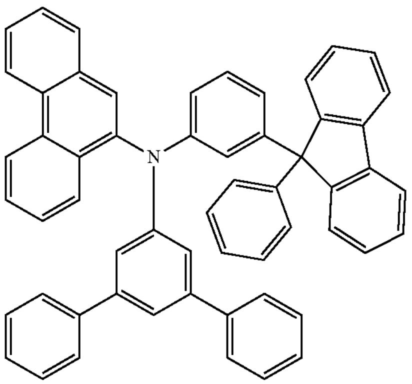
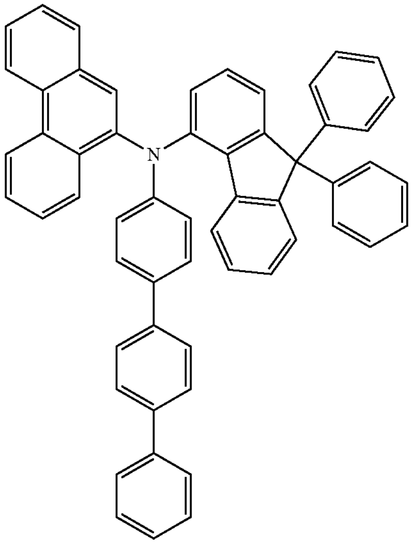
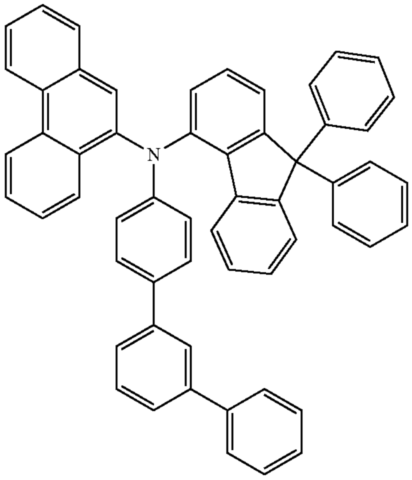

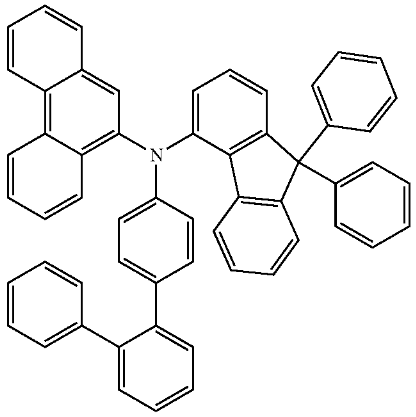
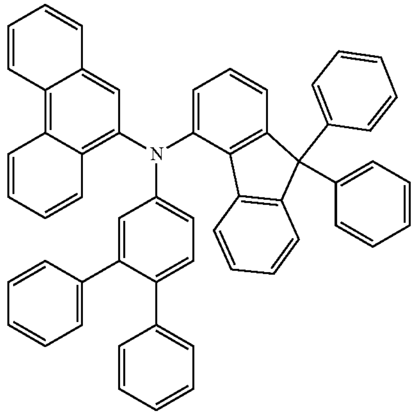
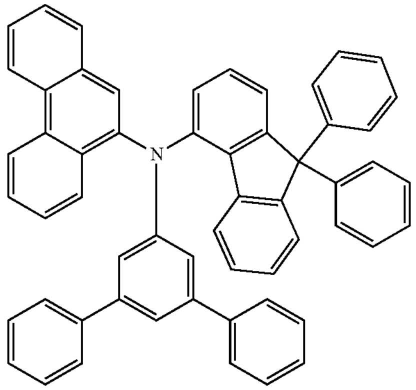
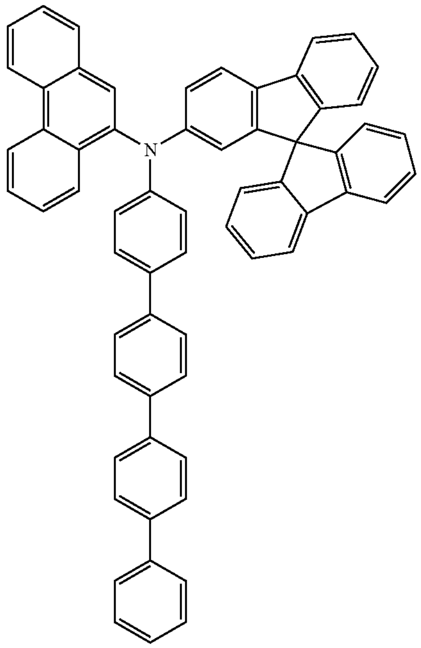
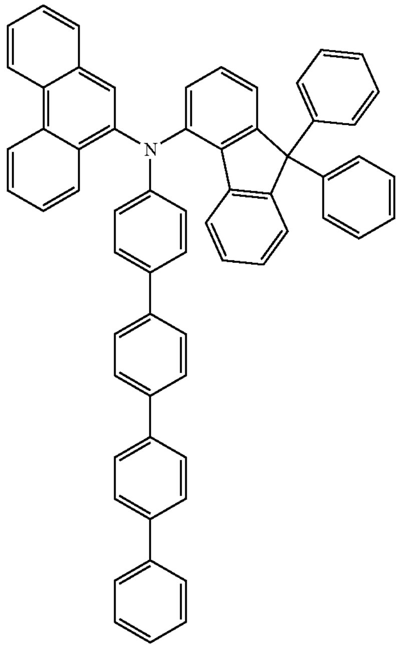

-continued
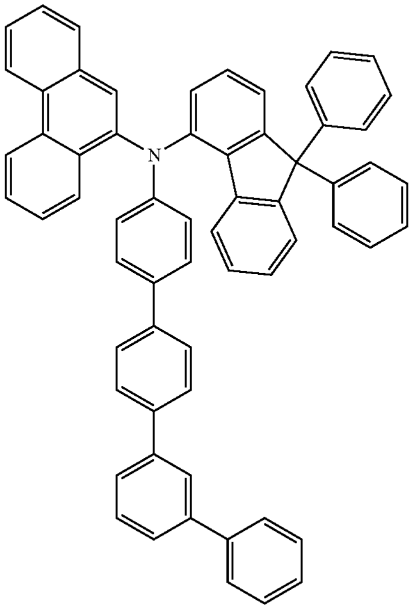
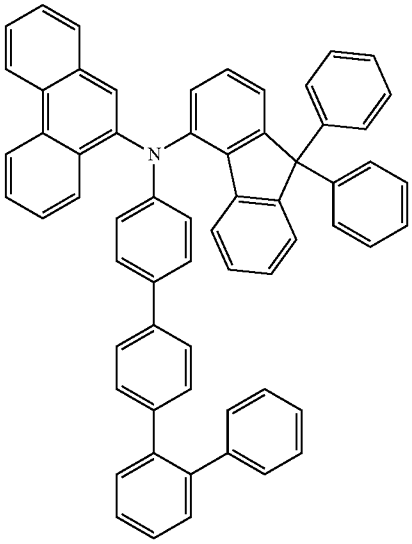
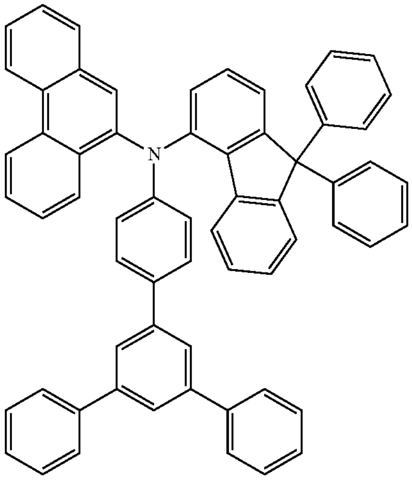
-continued
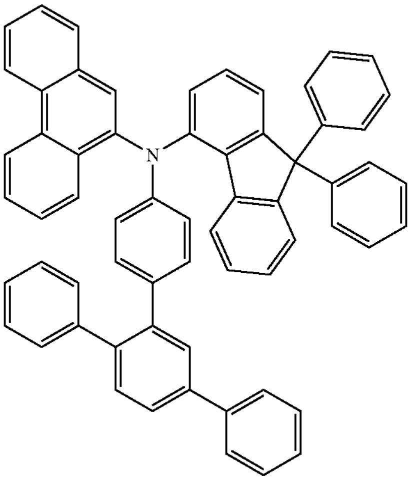
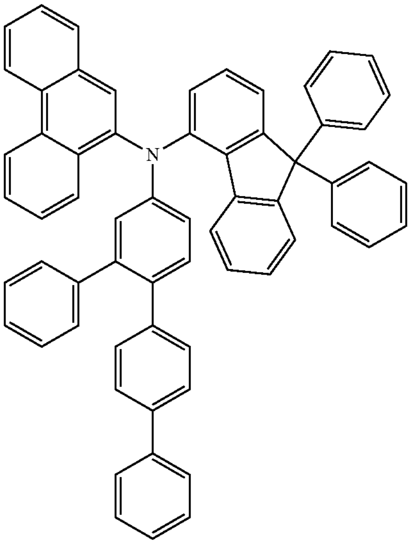
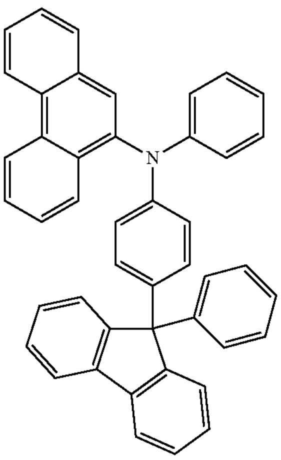

-continued
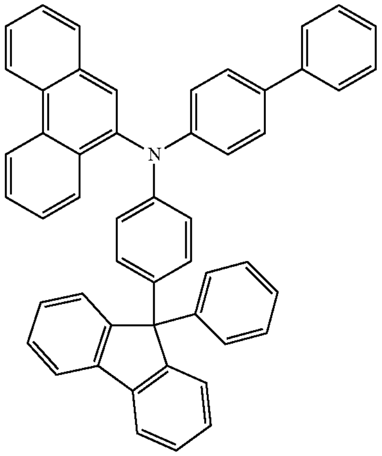
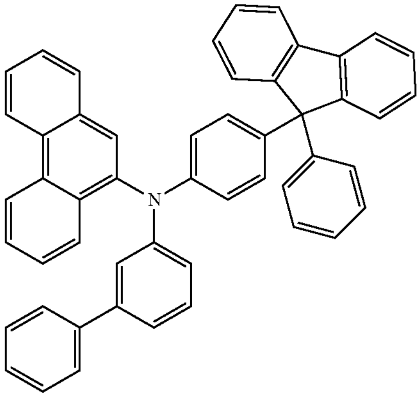
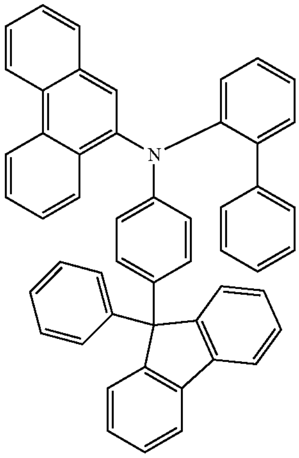
-continued
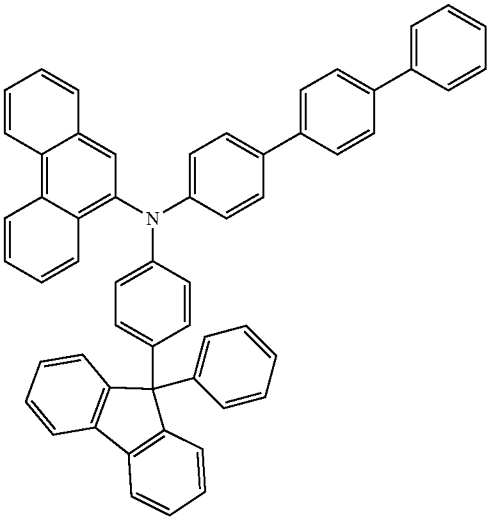
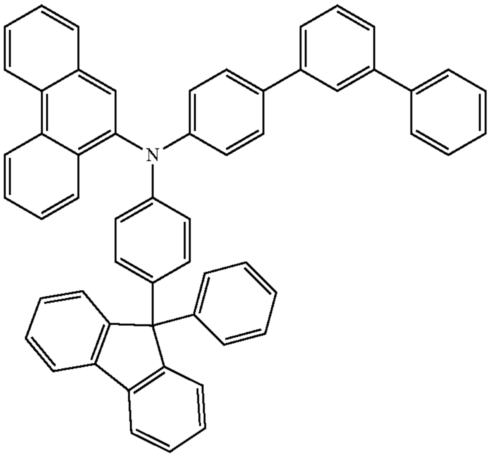
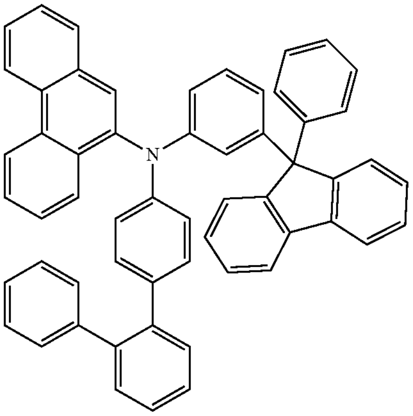

-continued
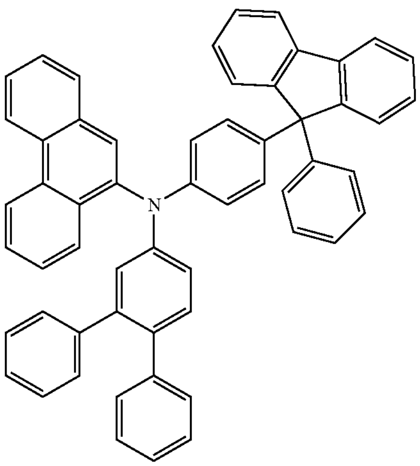
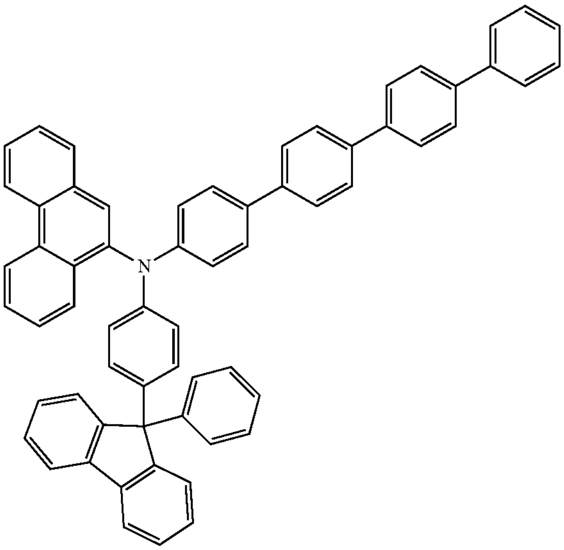
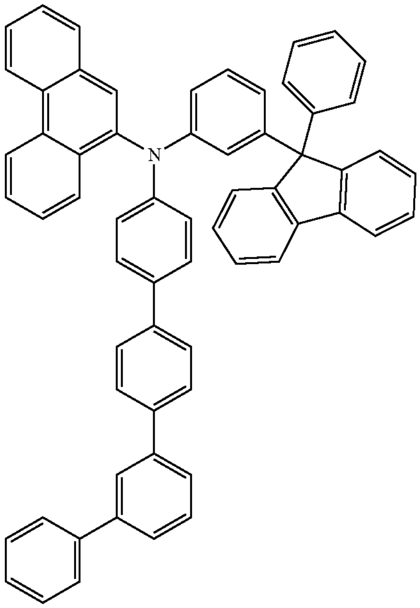
-continued
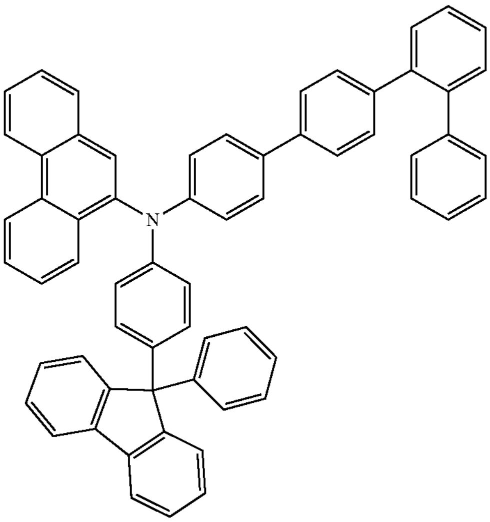
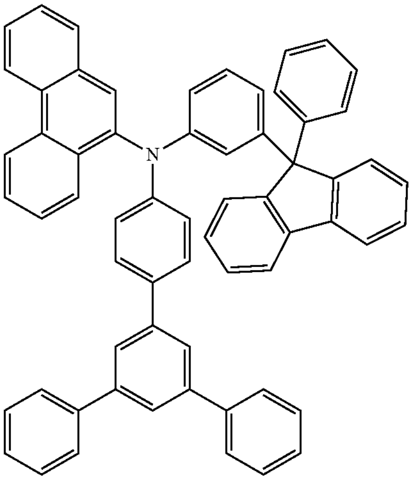
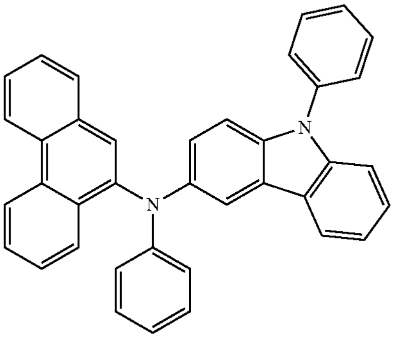

-continued
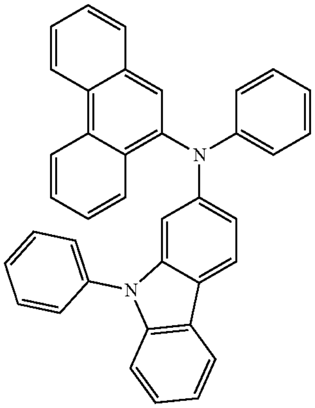
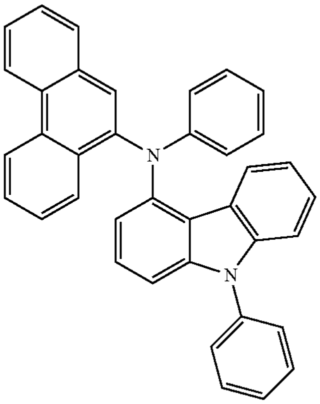
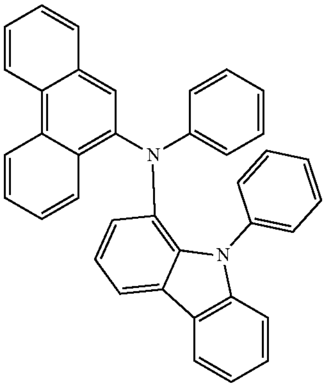
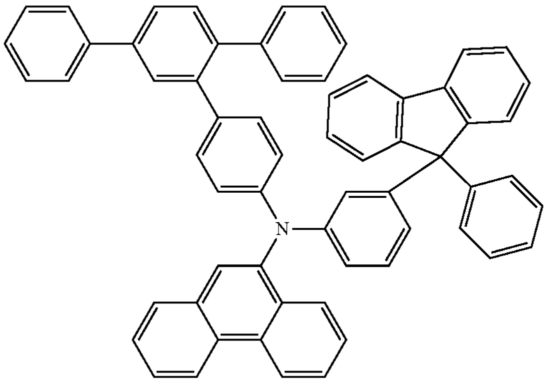
-continued
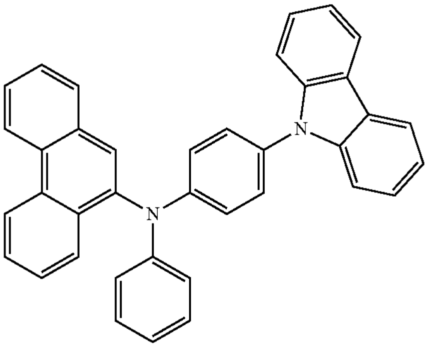
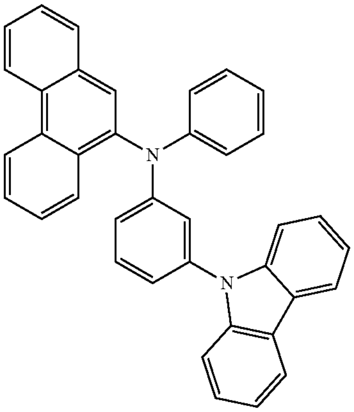
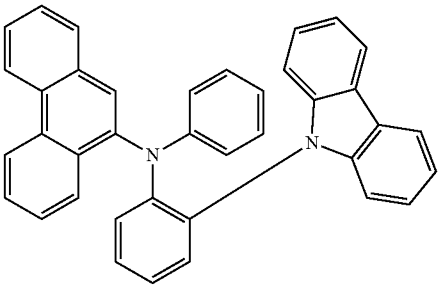
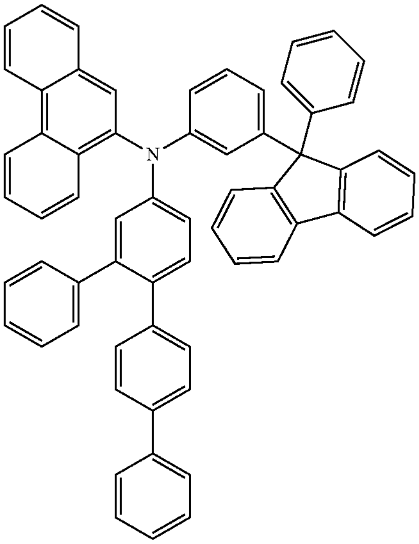

-continued
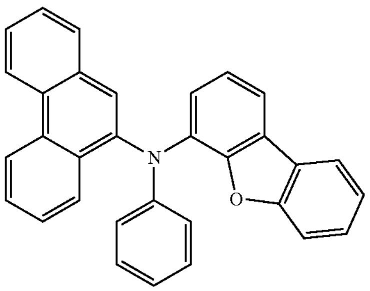
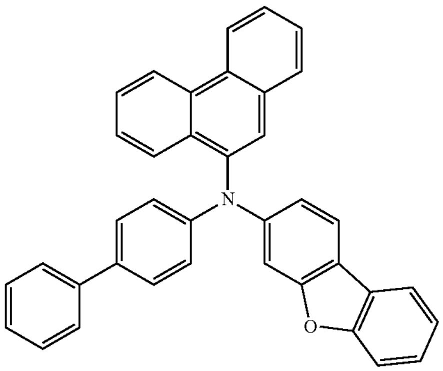
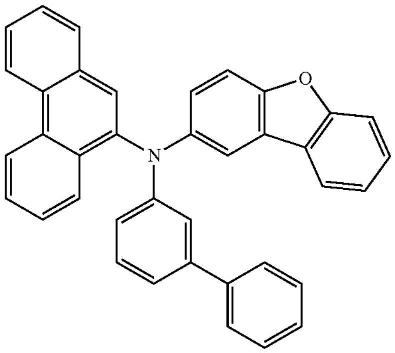
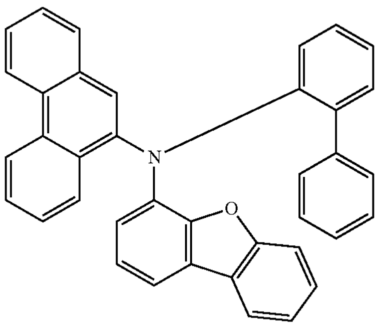
-continued
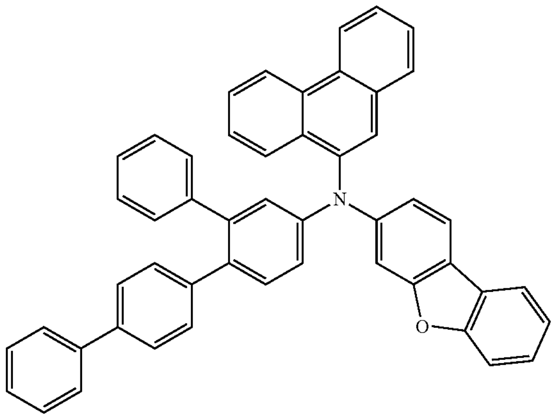
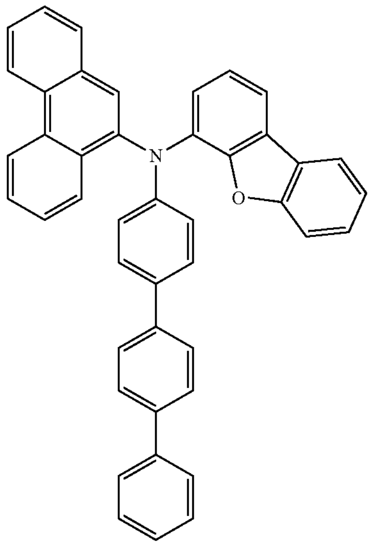
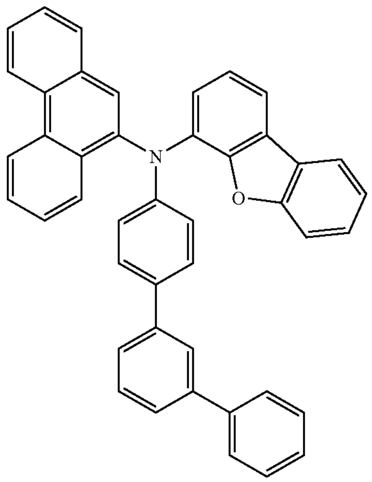

-continued
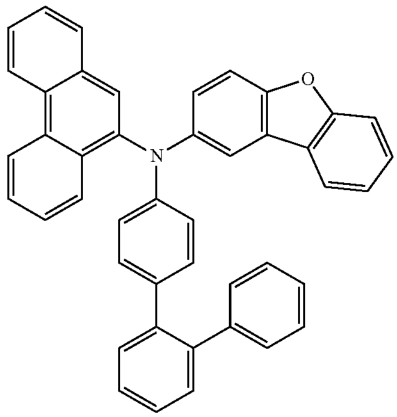
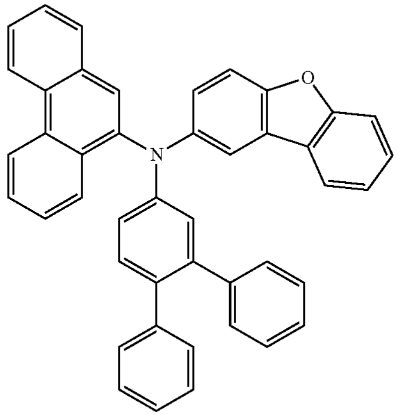
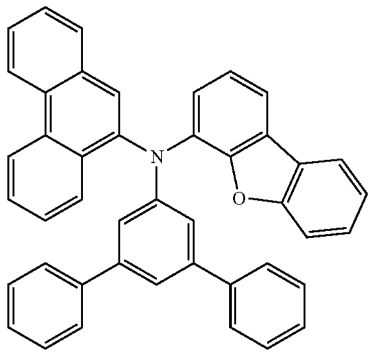
-continued
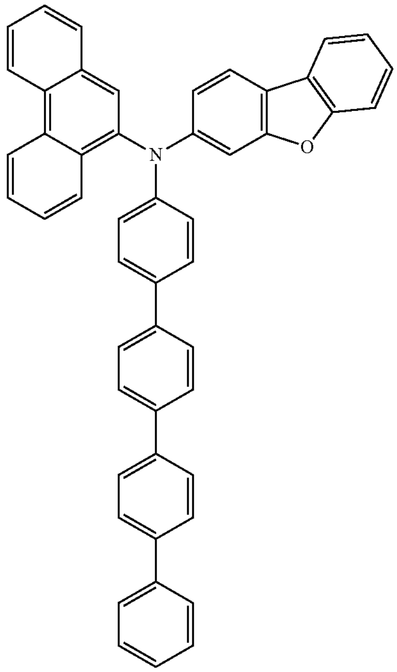
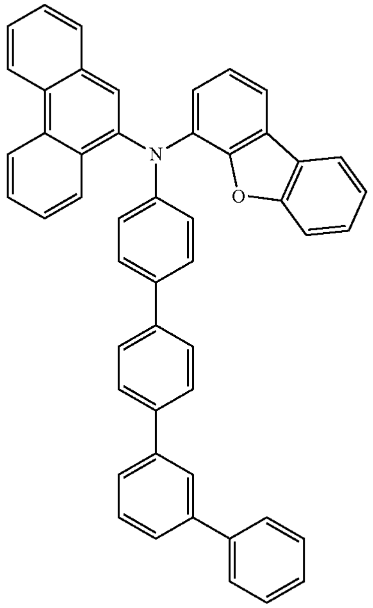

-continued
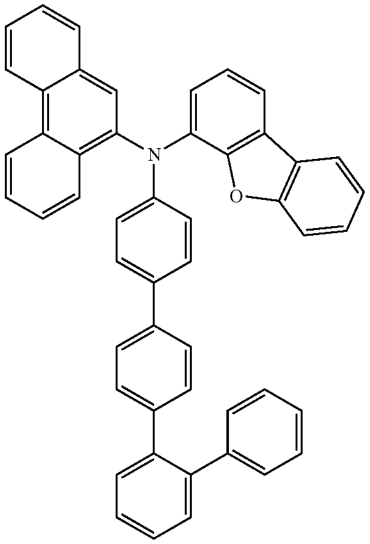
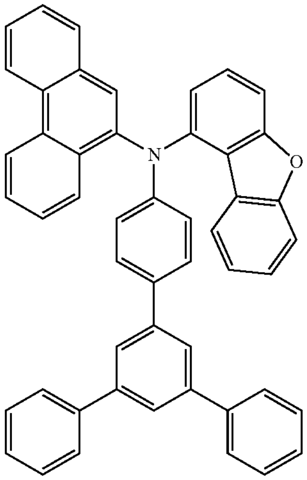
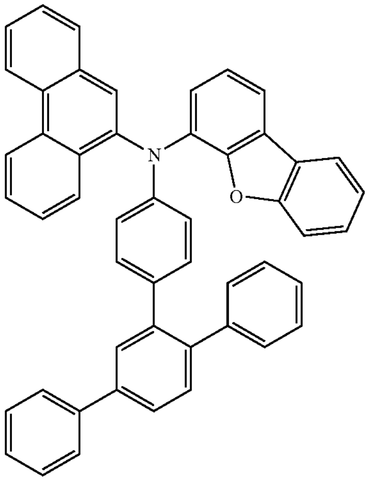
-continued
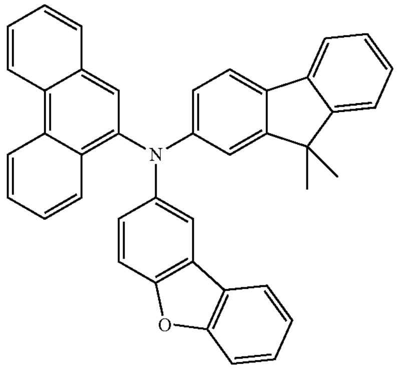
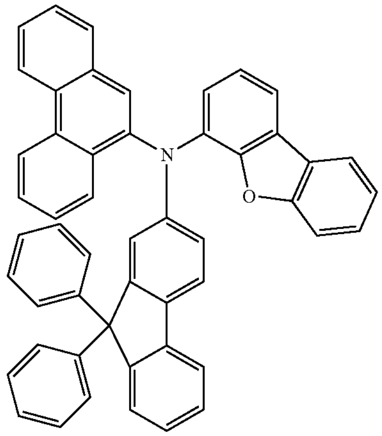
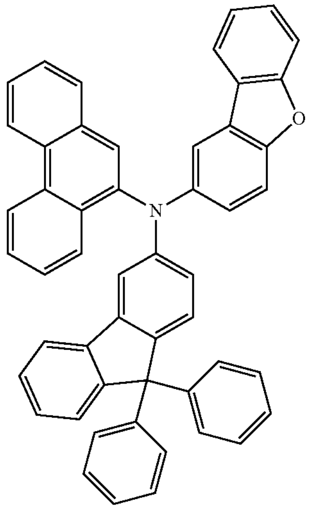
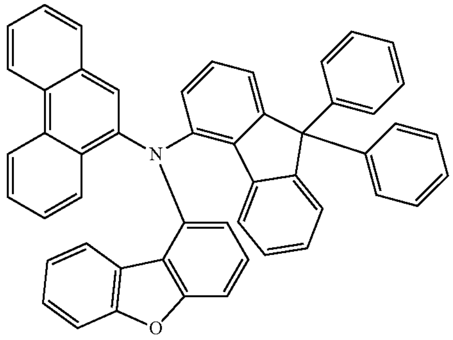

-continued
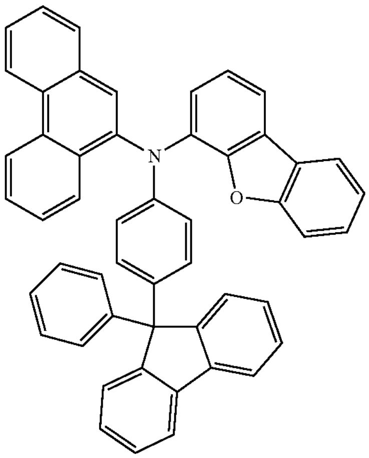
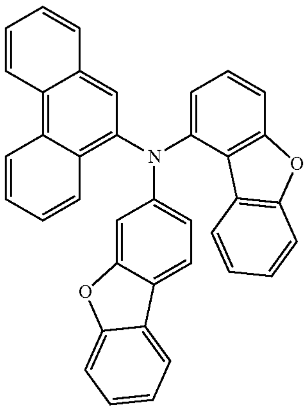
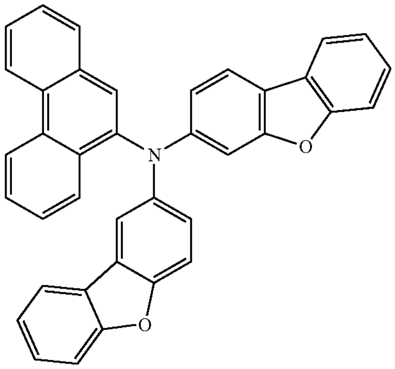
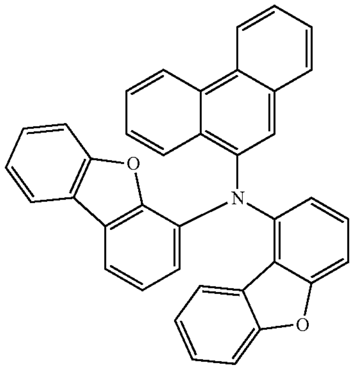
-continued
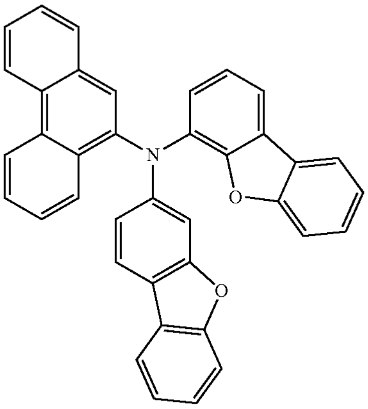
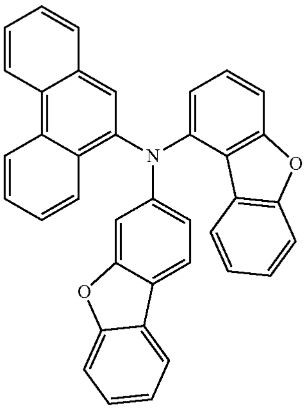
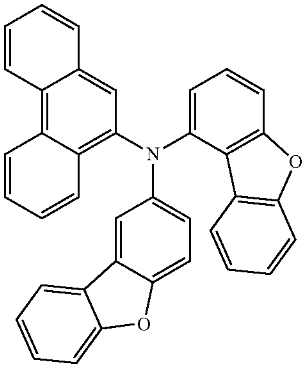
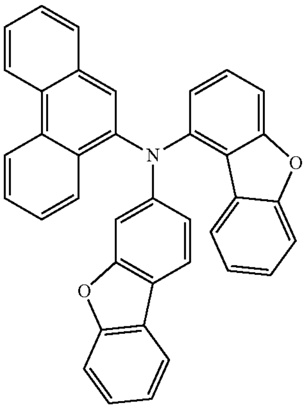

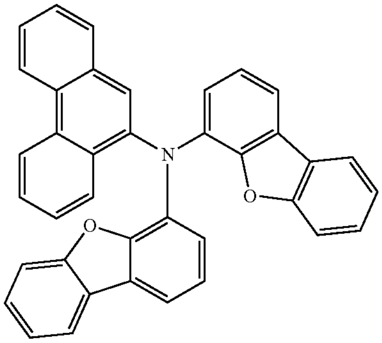
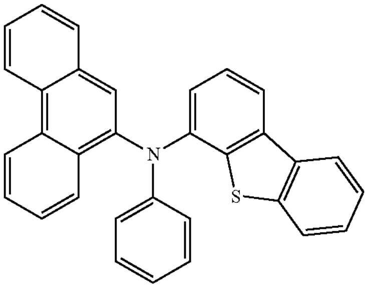
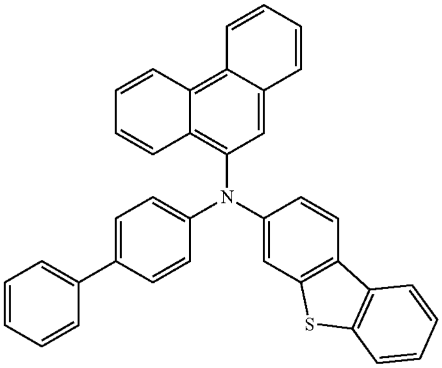
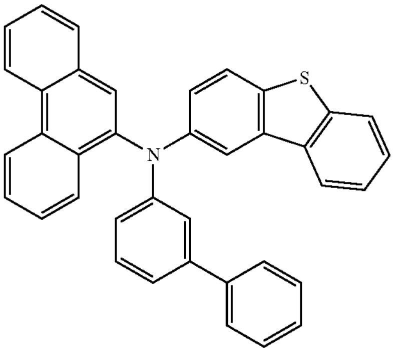
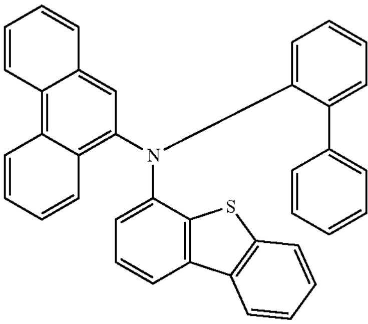
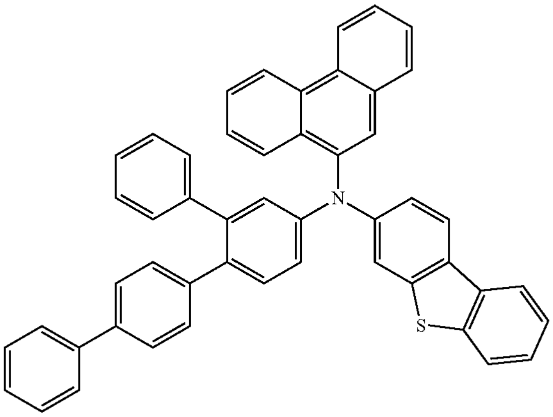
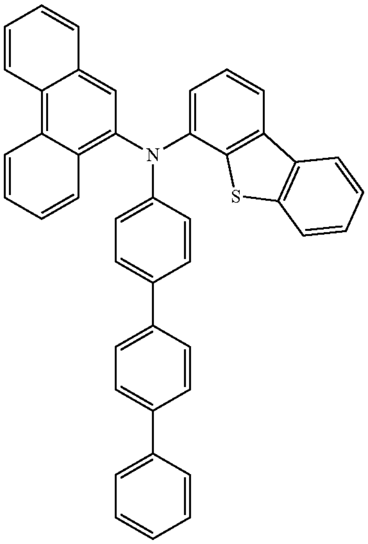
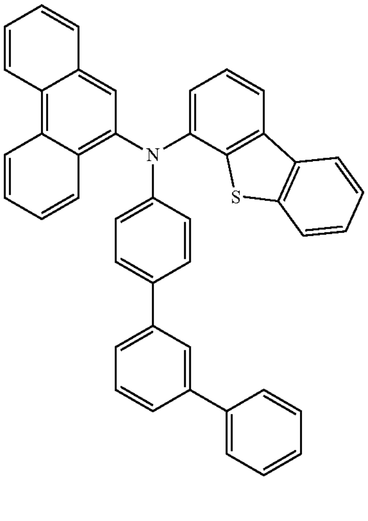

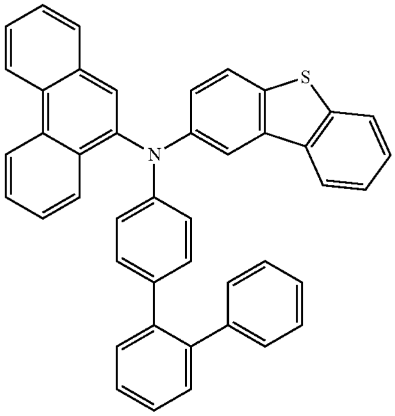
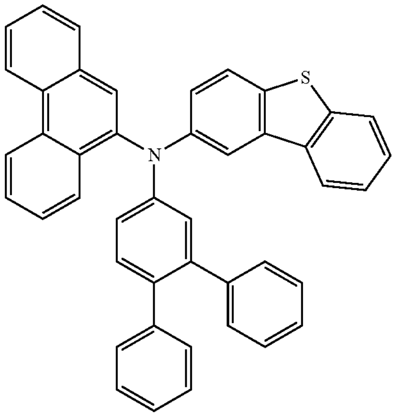
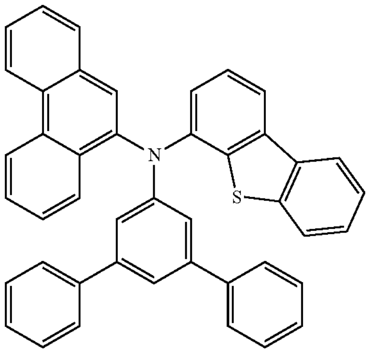
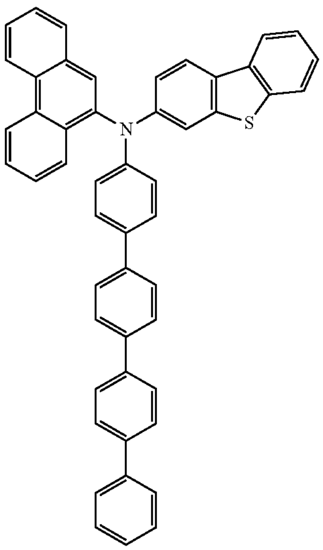
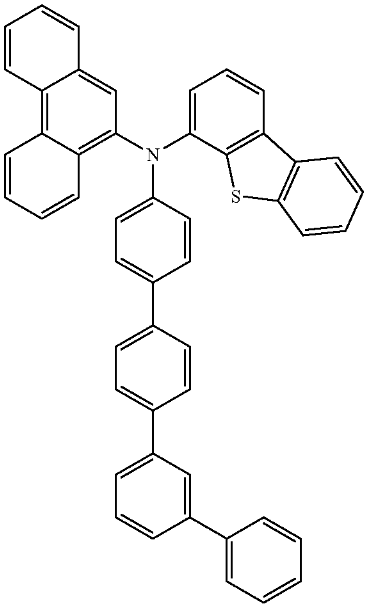
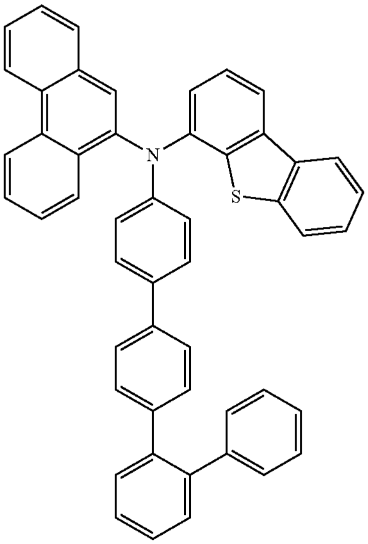
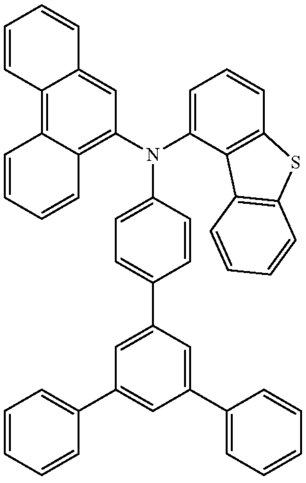

-continued
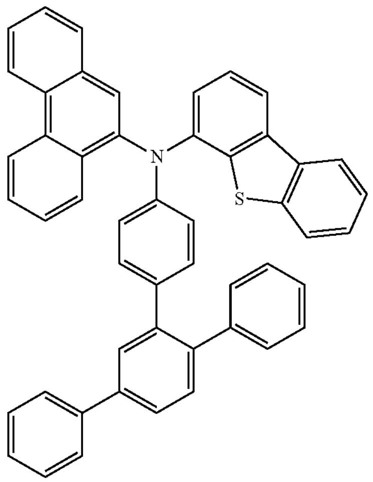
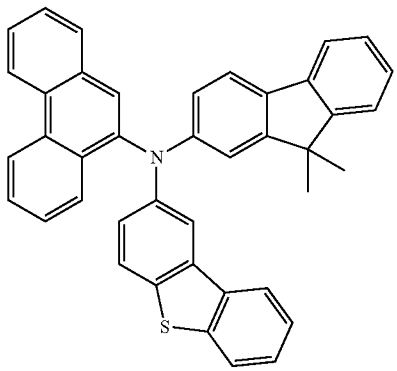
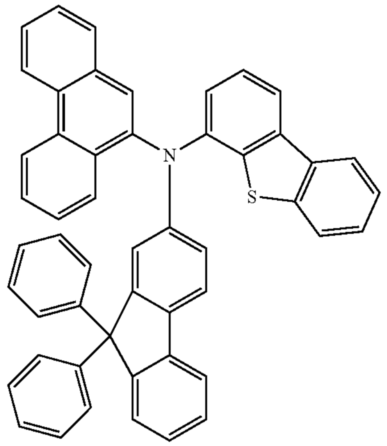
-continued
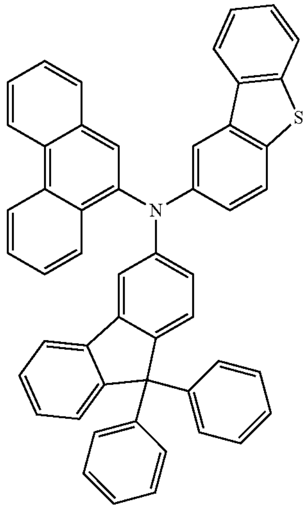
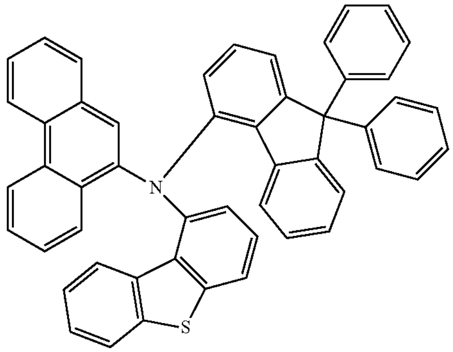
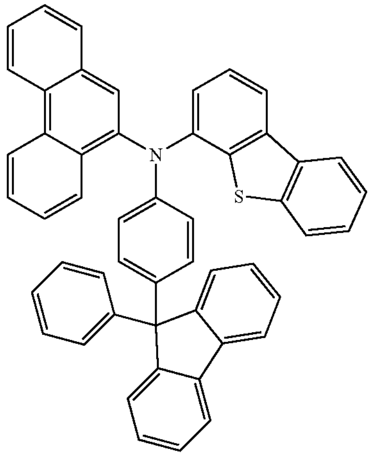
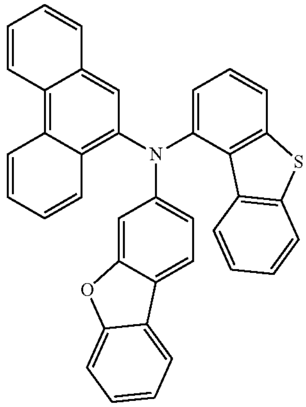

-continued
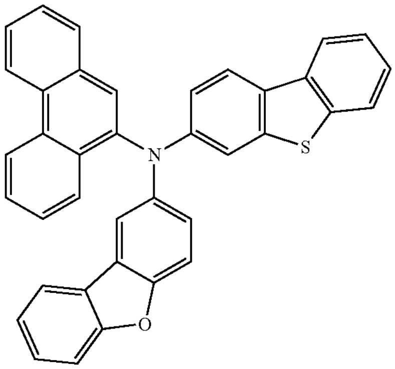
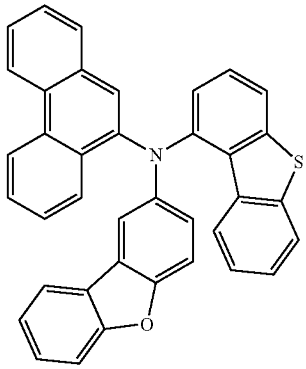
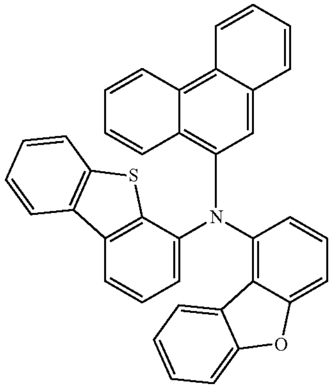
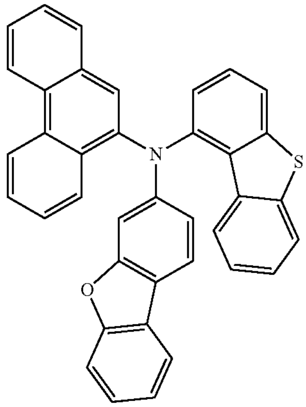
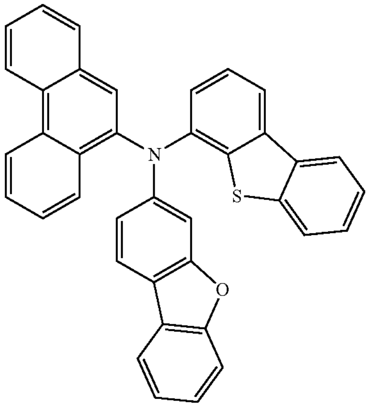
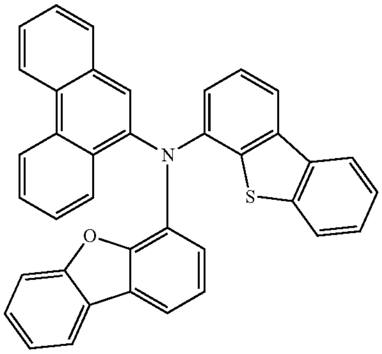
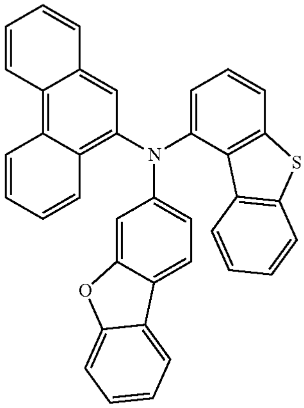
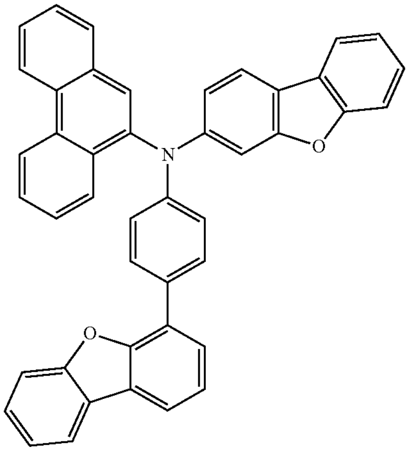
-continued -continued
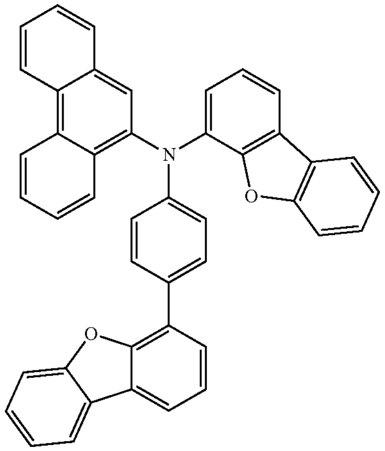
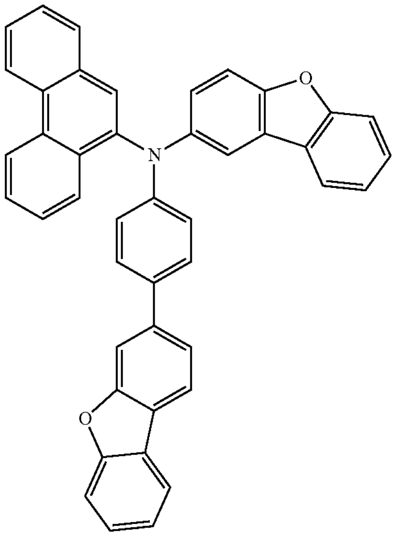
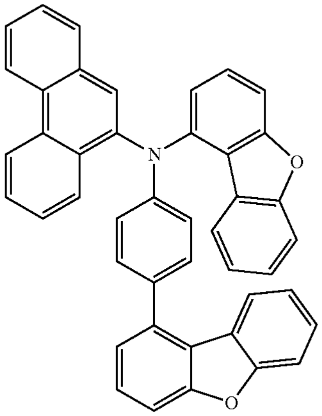
-continued
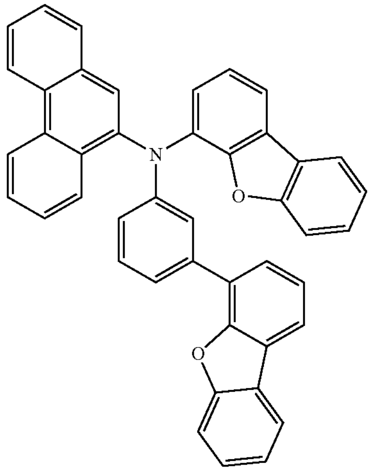
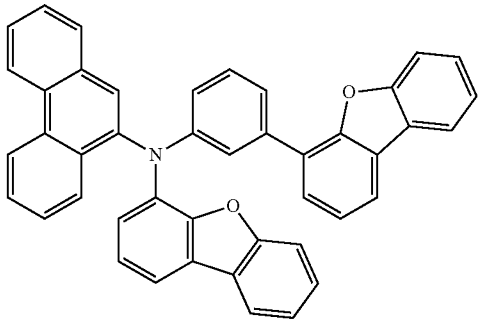
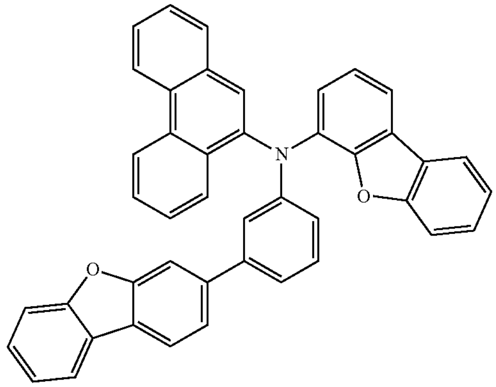
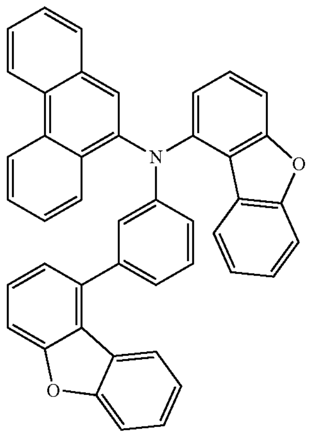

-continued
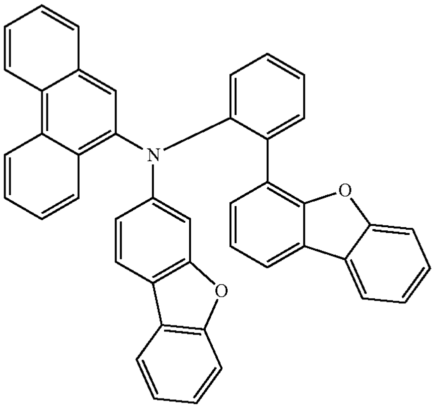
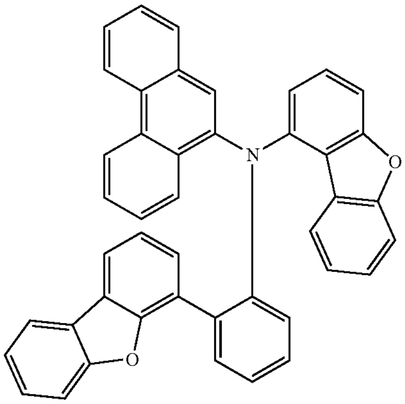
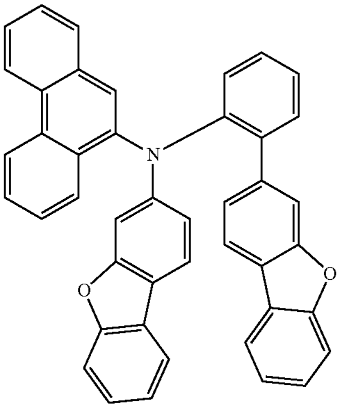
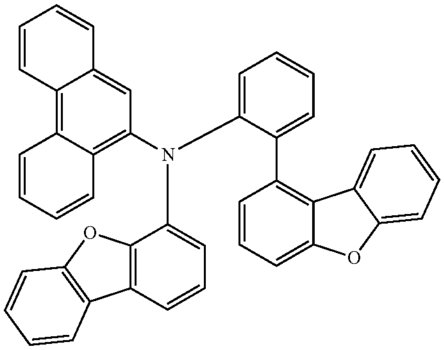
-continued
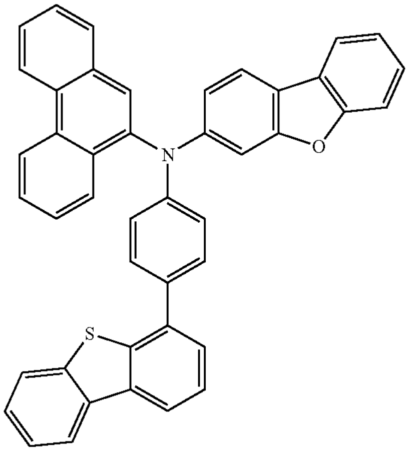
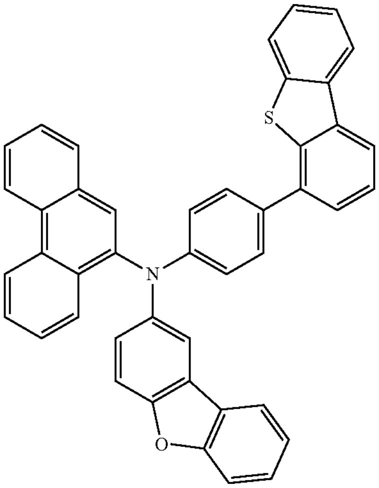
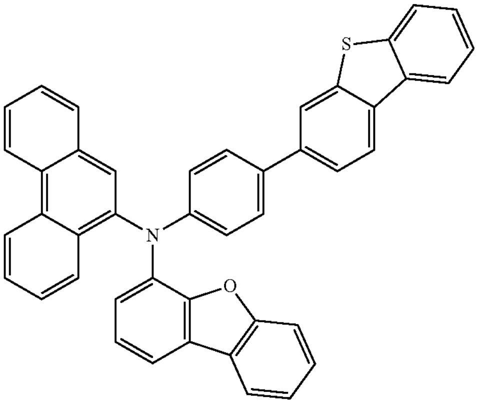
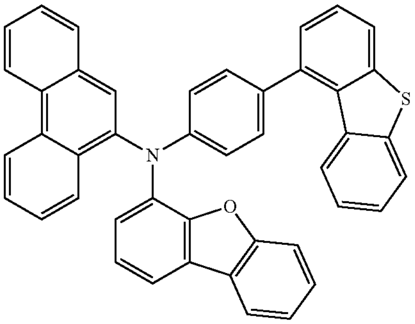

-continued
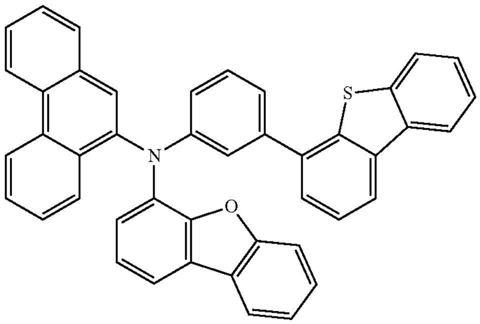
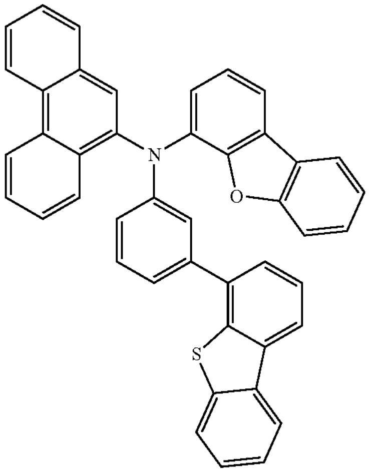
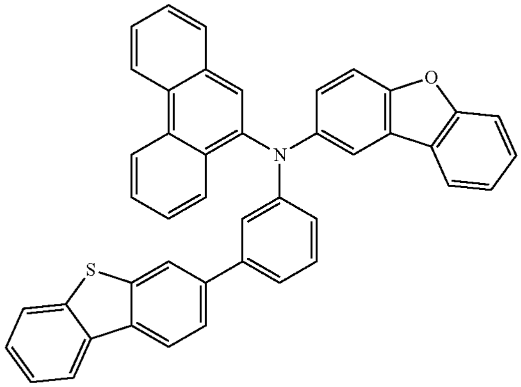
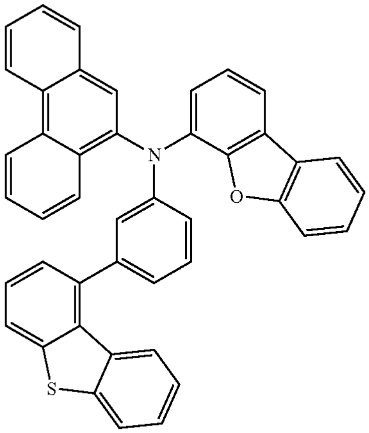
-continued
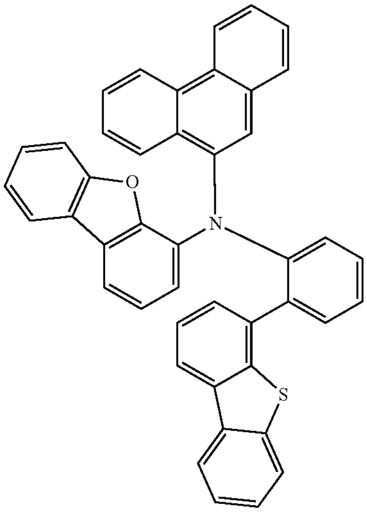
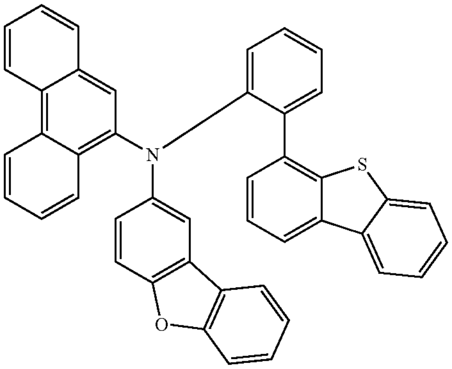
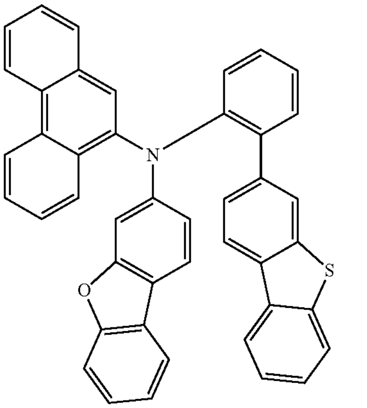
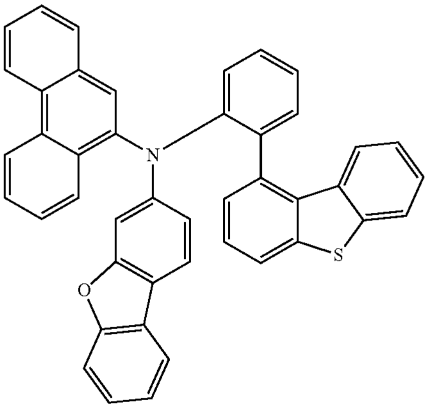

-continued
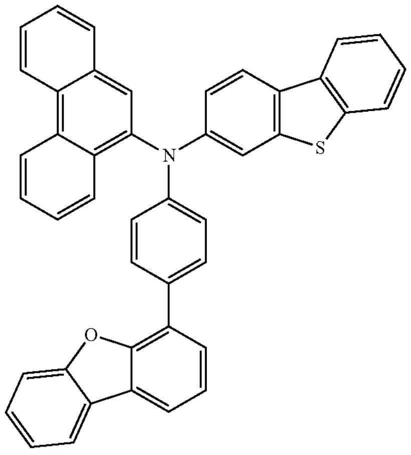
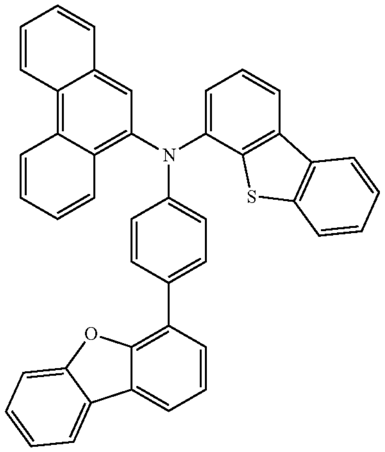
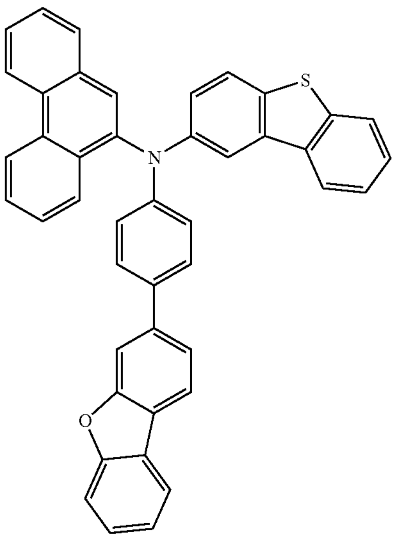
-continued
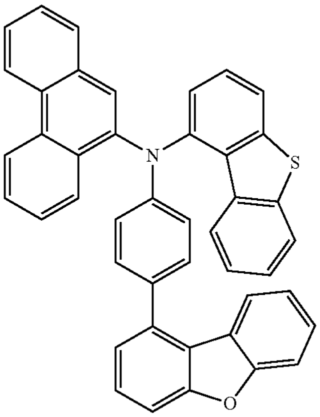
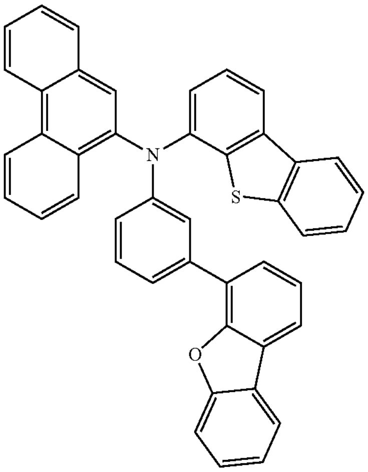
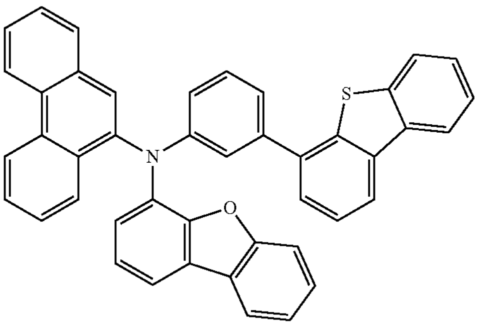
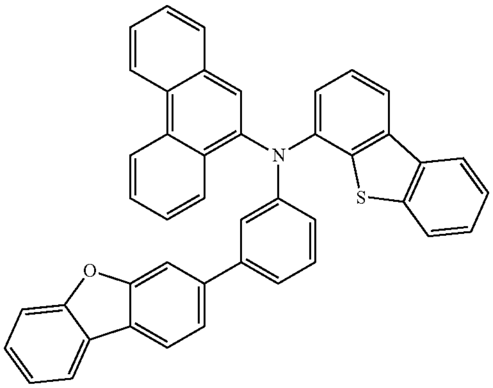

-continued
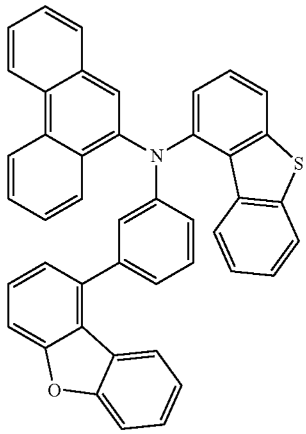
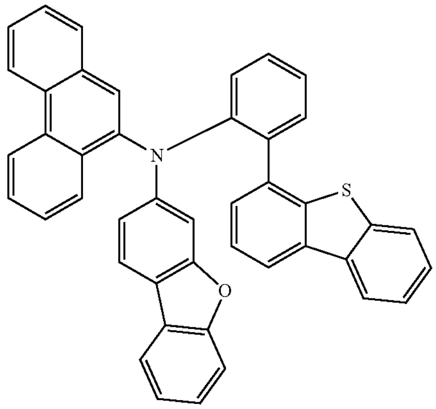
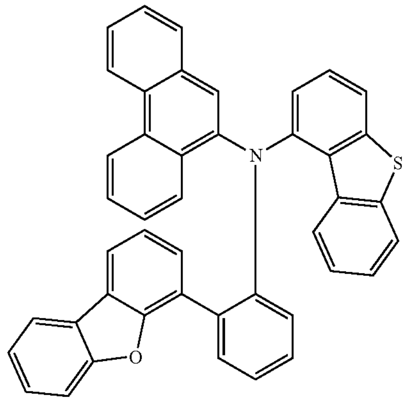
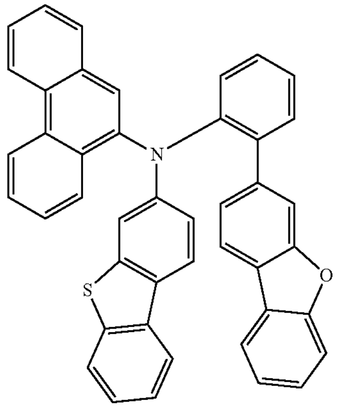
-continued
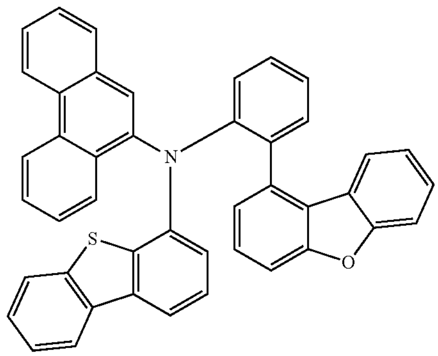
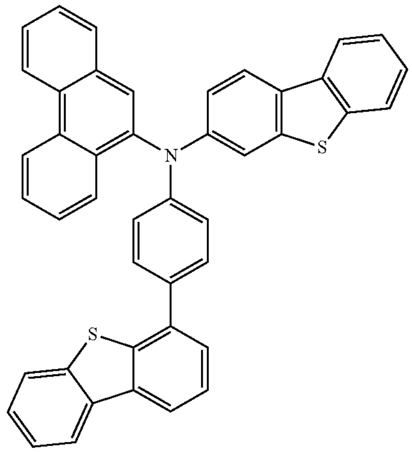
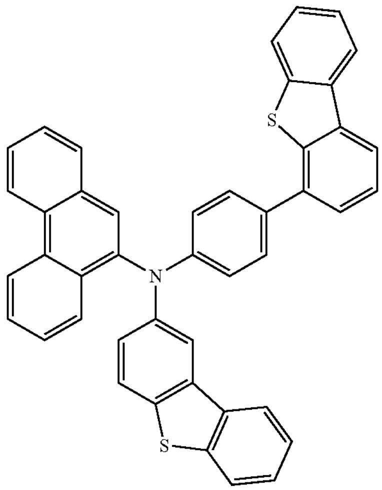
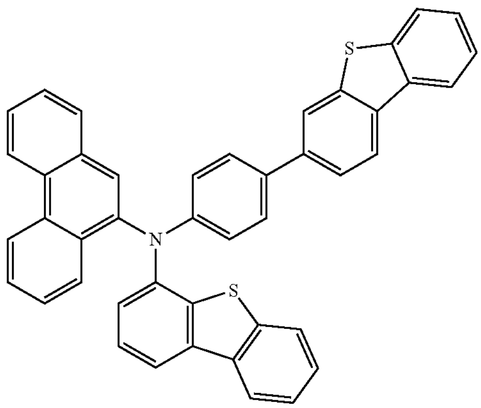

-continued
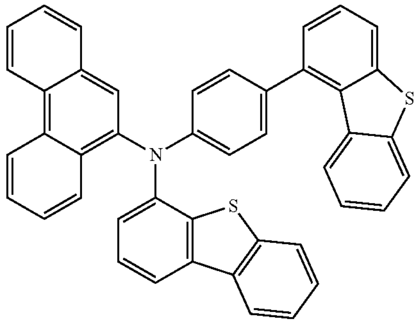
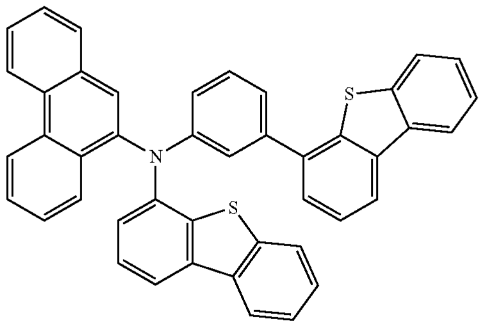
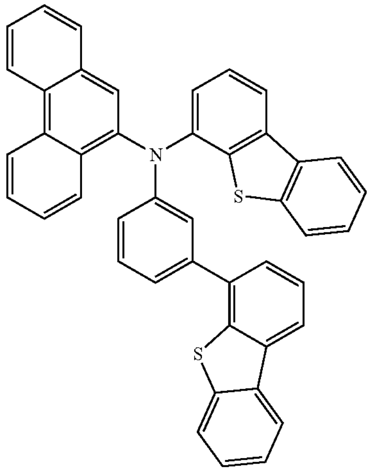
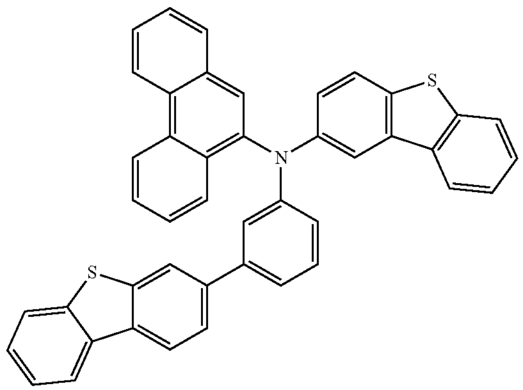
-continued
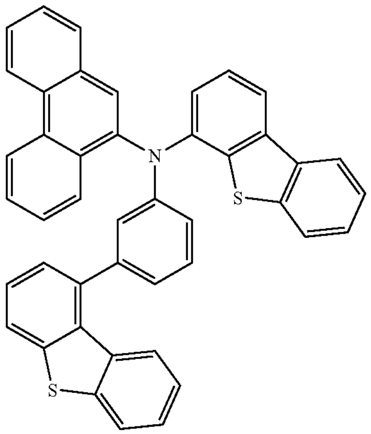
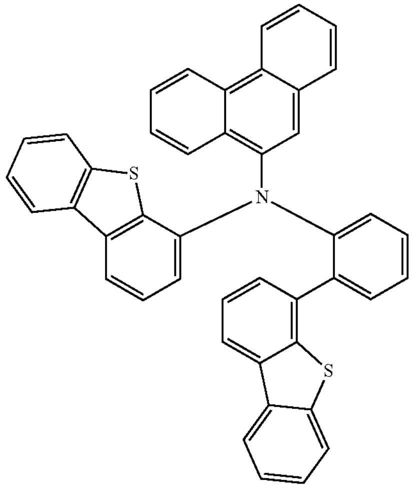
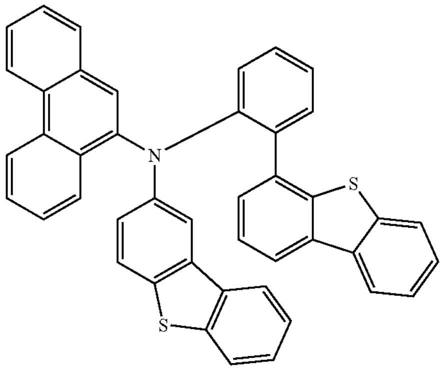
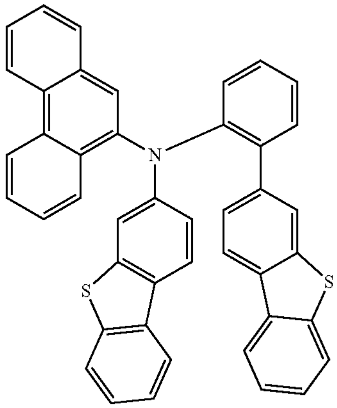

-continued
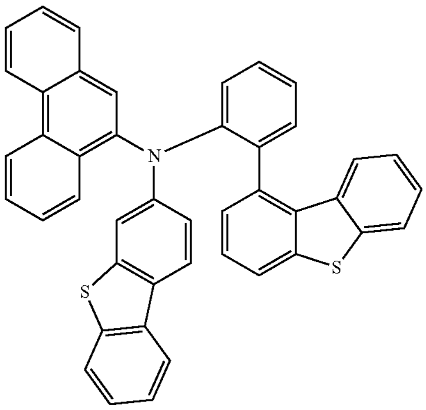
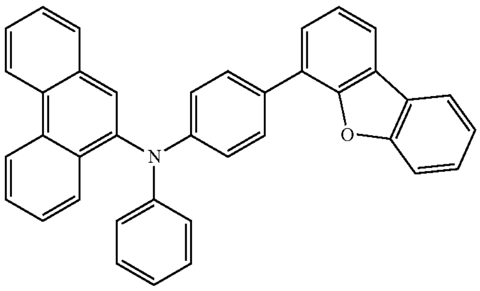
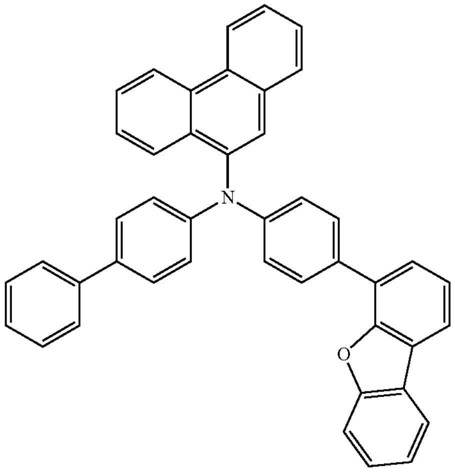
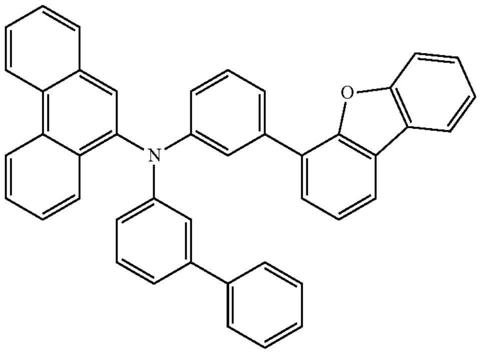
-continued
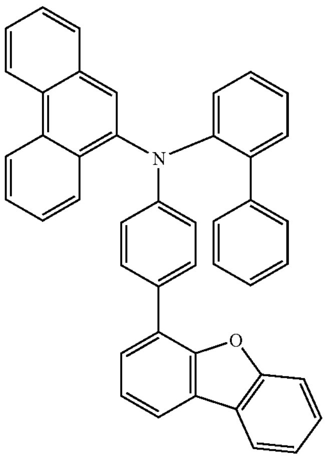
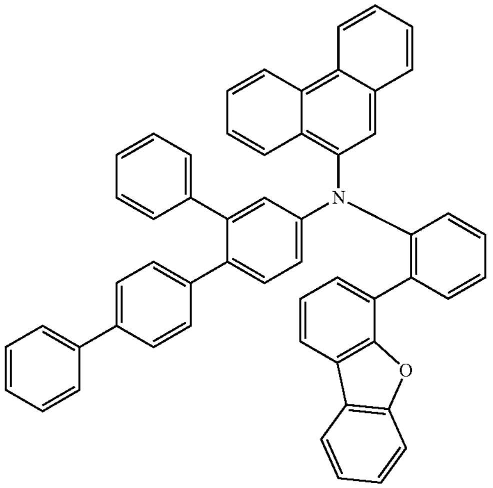
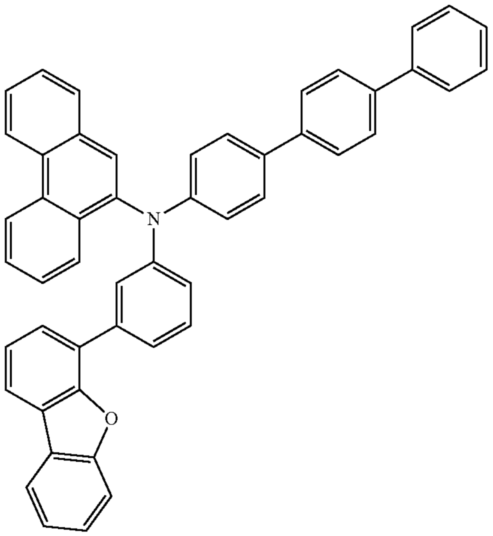

-continued
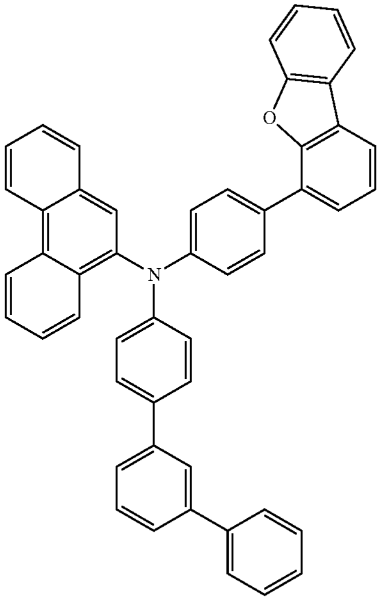
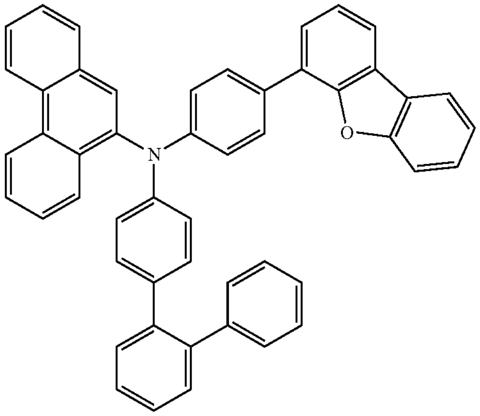
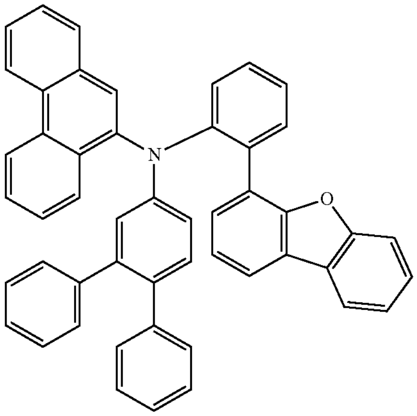
-continued
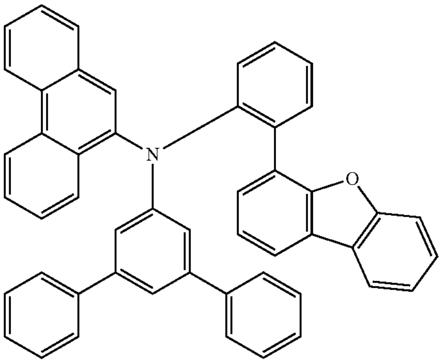
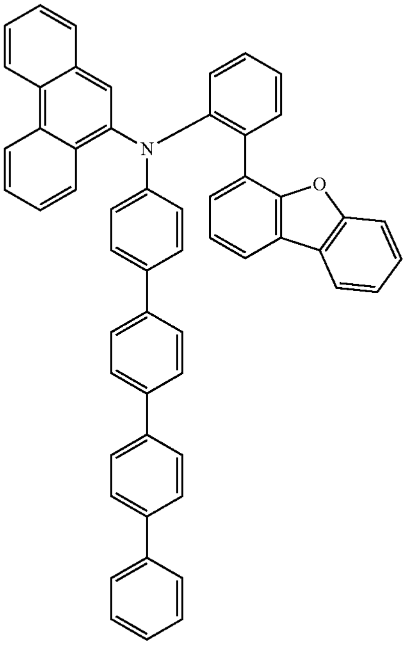
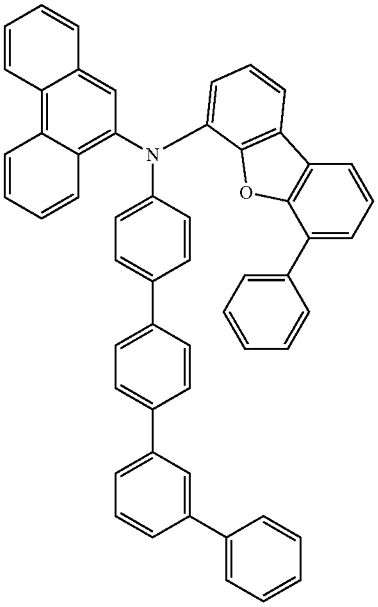

-continued
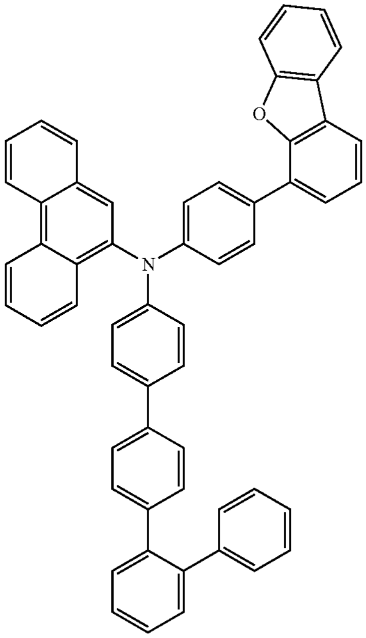
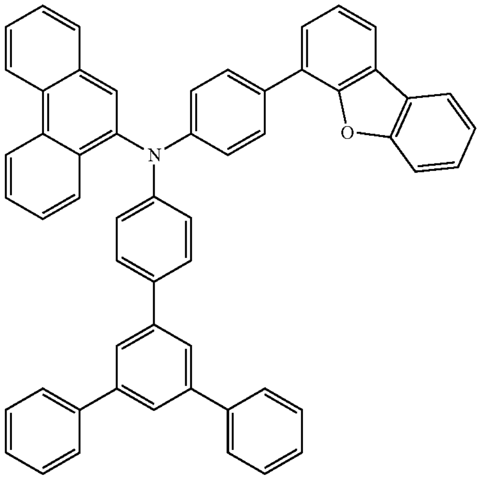
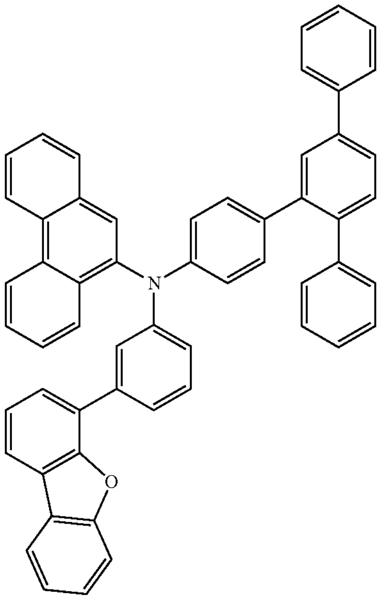
-continued
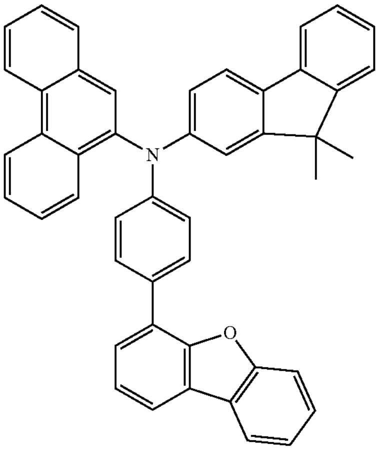
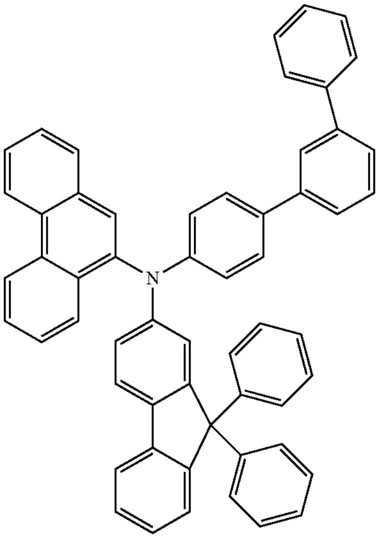
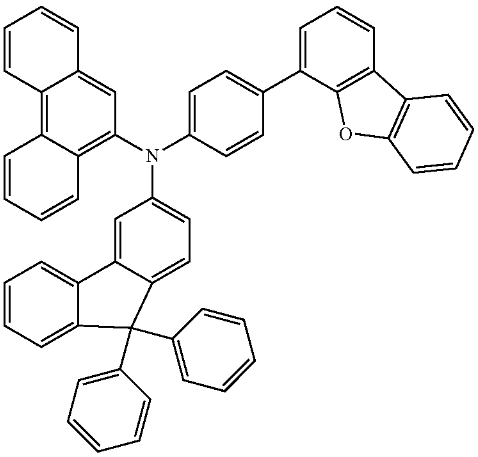

-continued
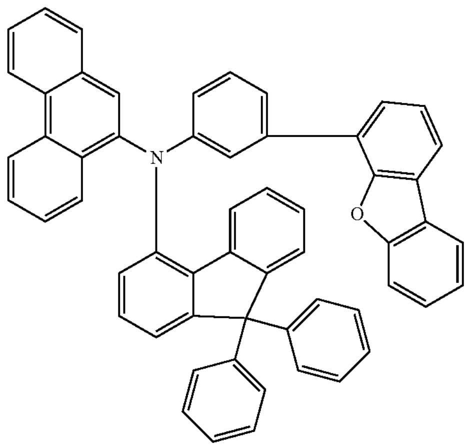
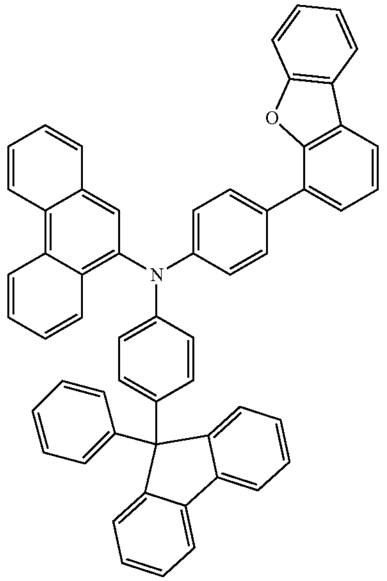
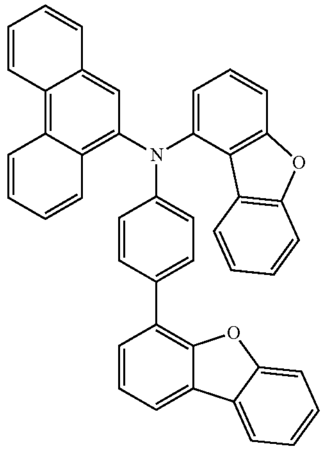
-continued
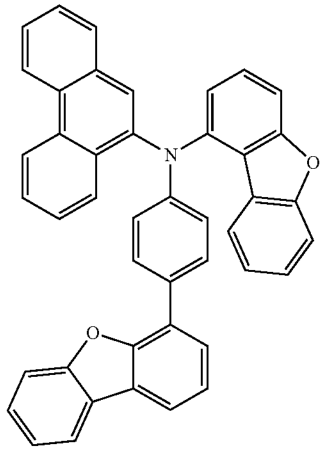
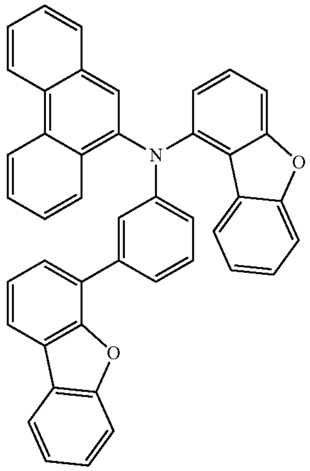
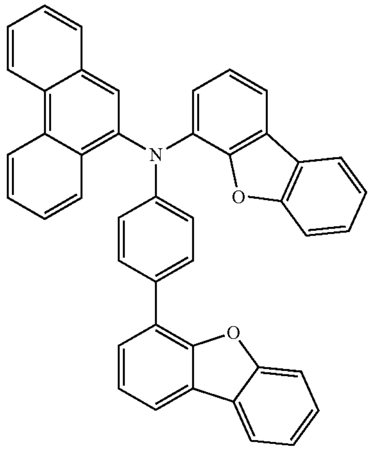

-continued
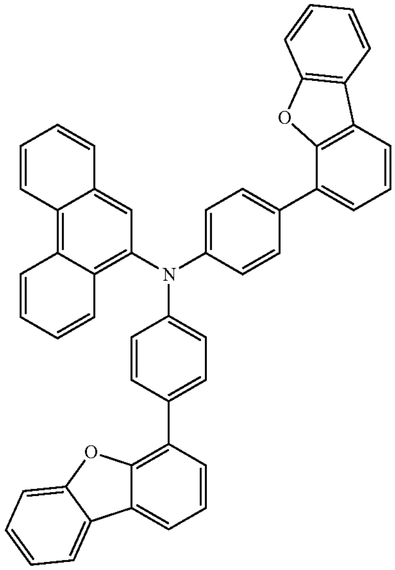
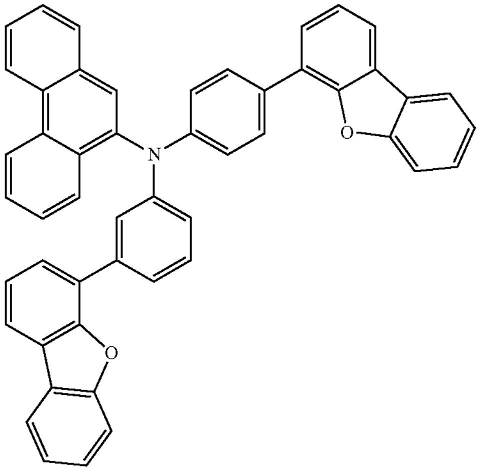
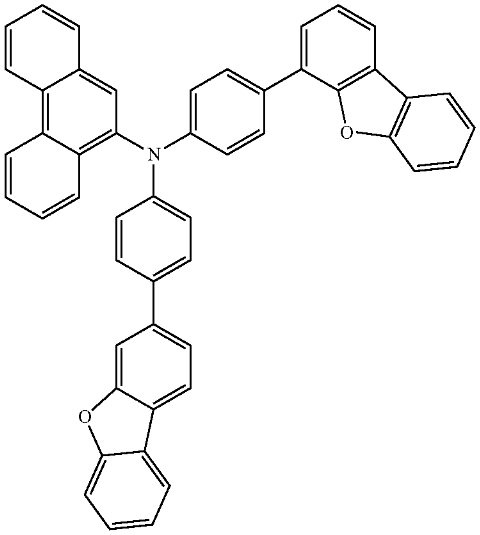
-continued
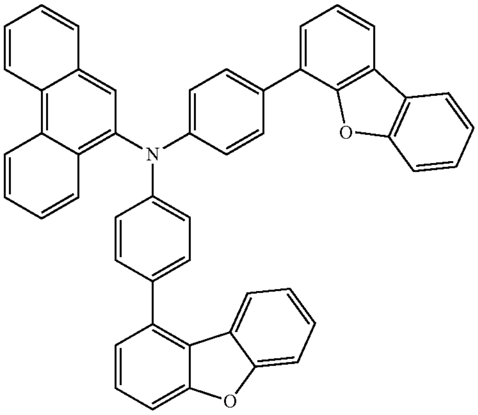
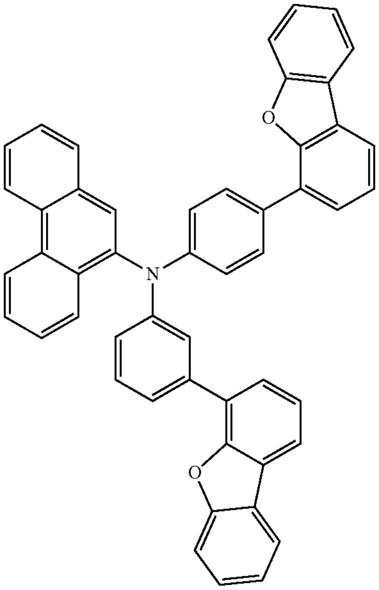
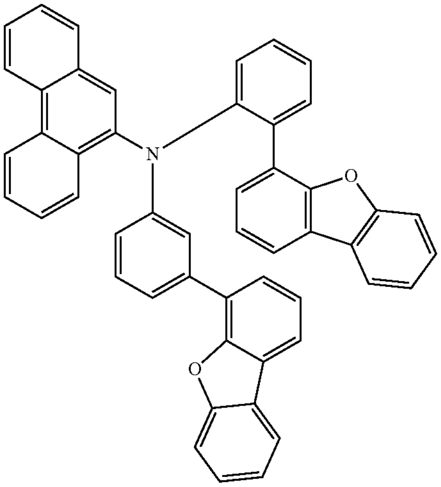

-continued
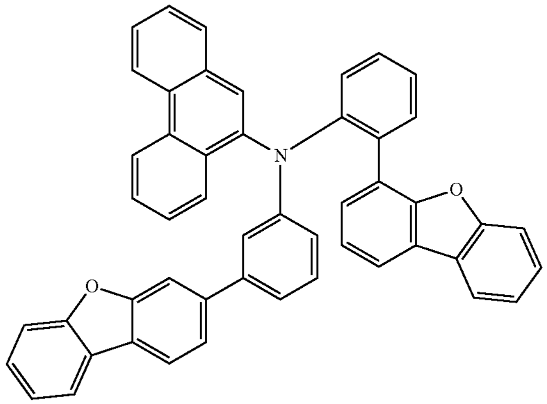
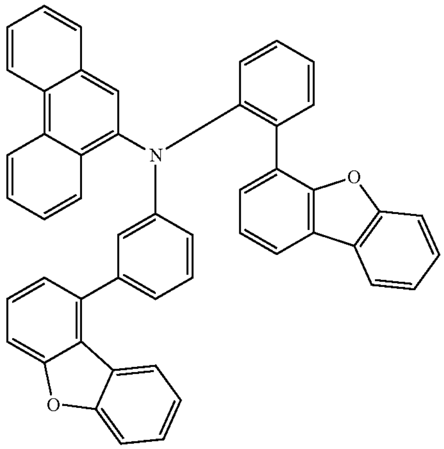
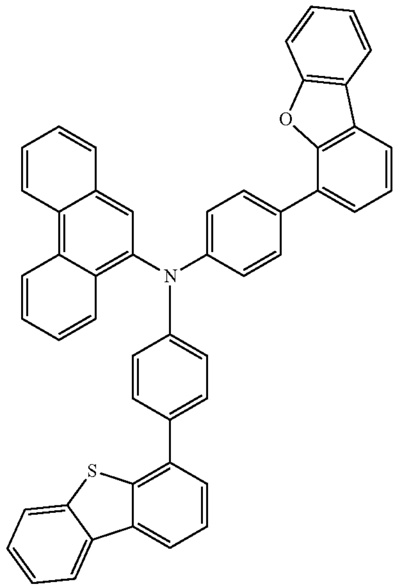
-continued
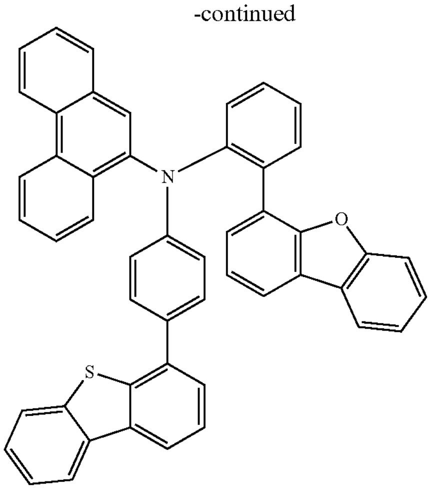
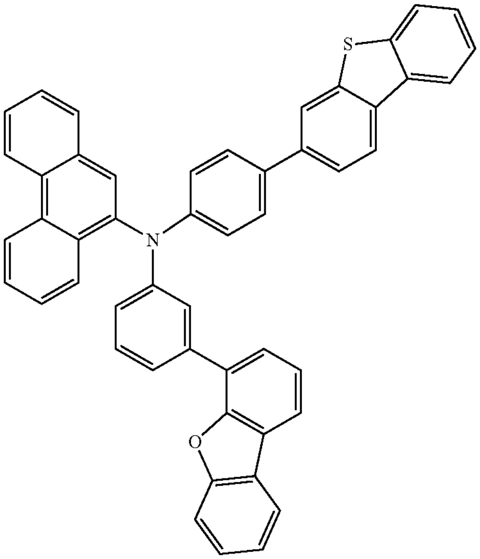
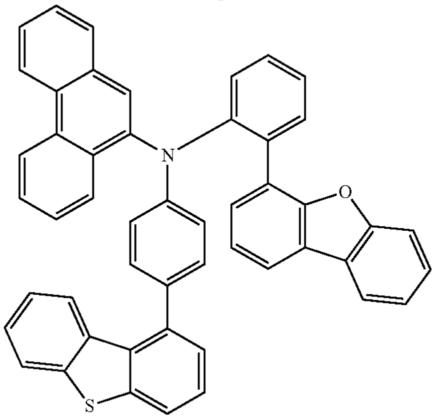
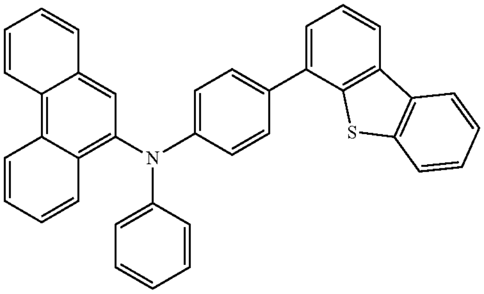

-continued
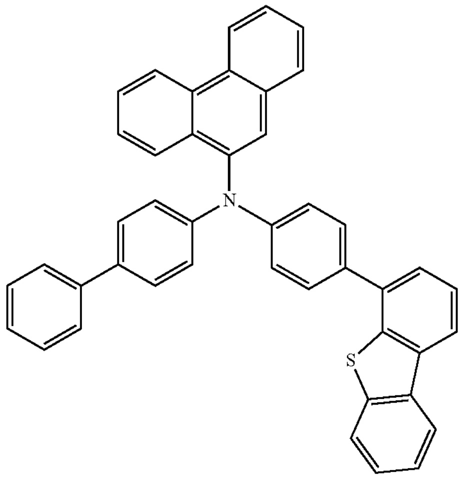
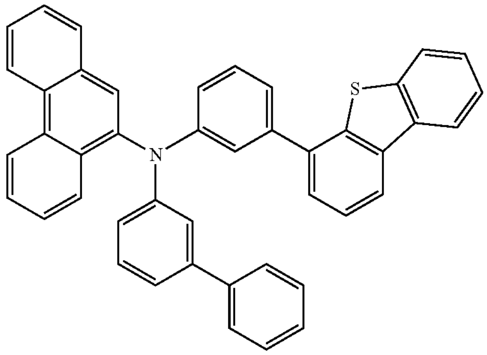
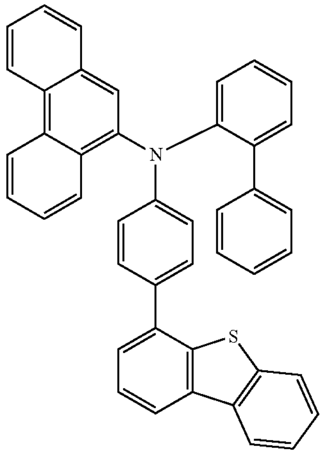
-continued
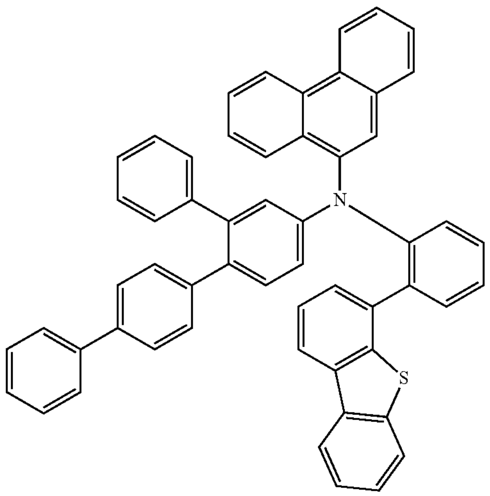
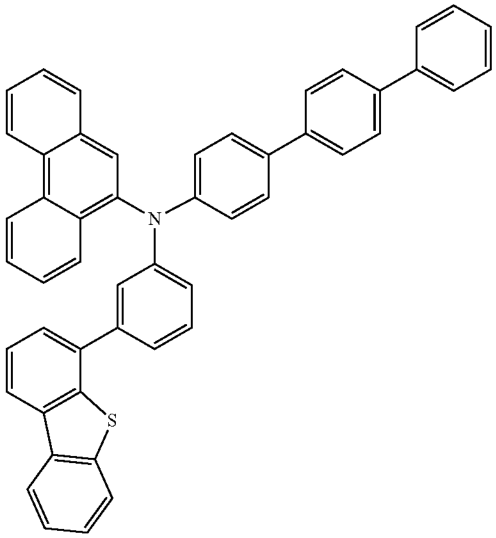
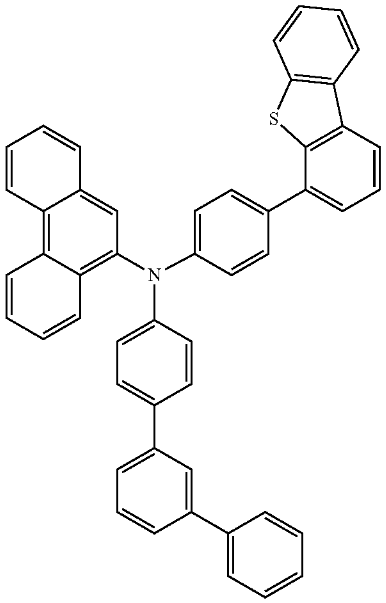

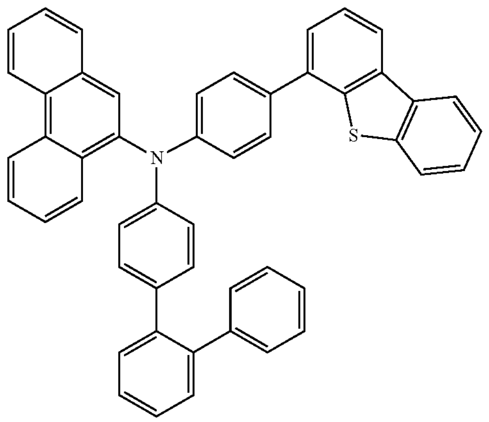
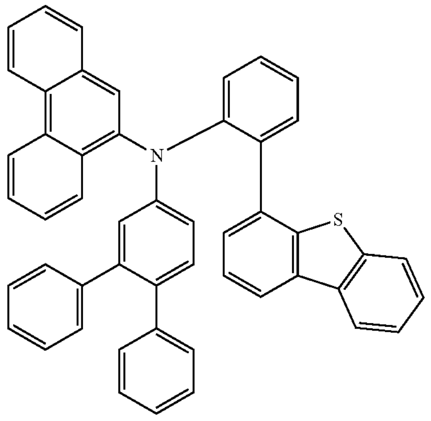
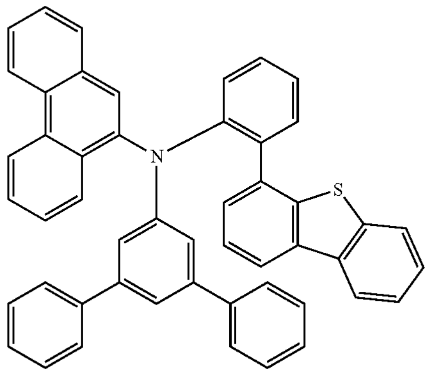
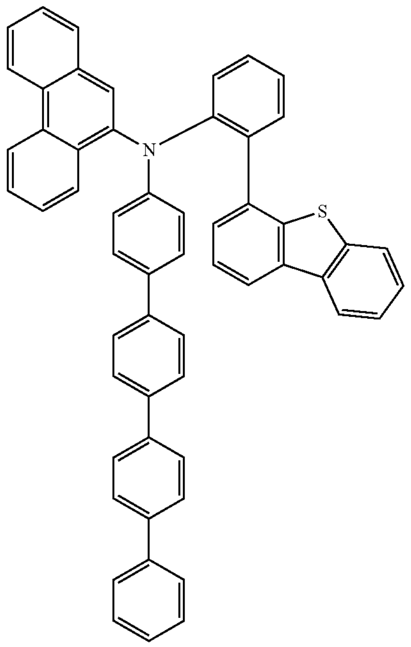
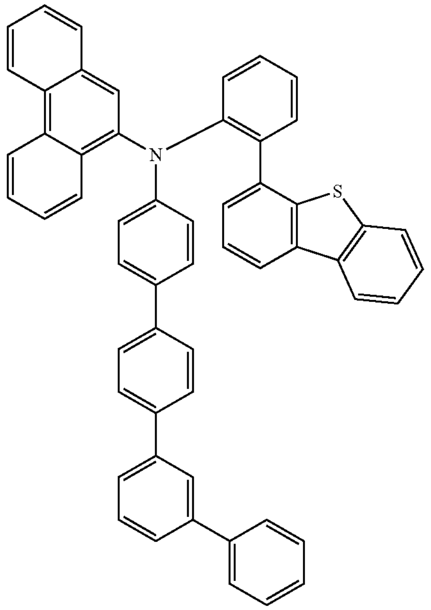

-continued
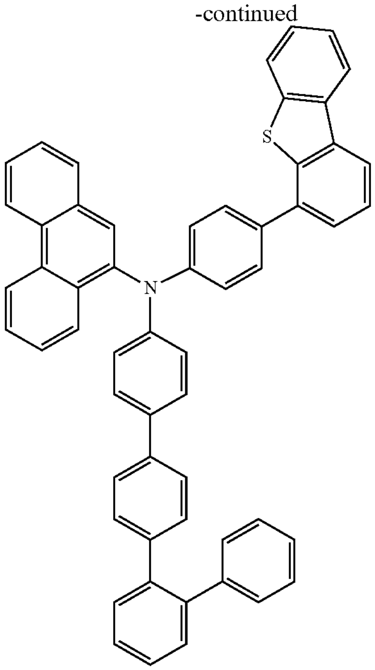
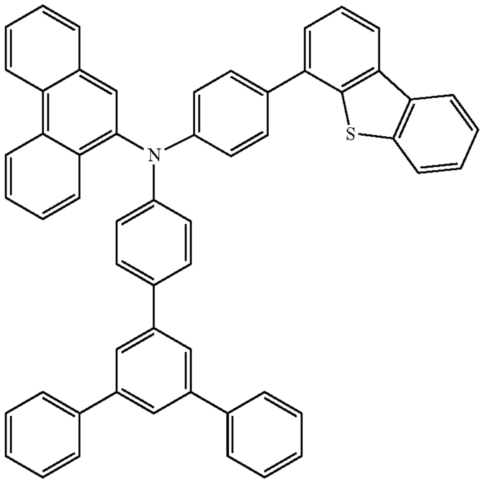
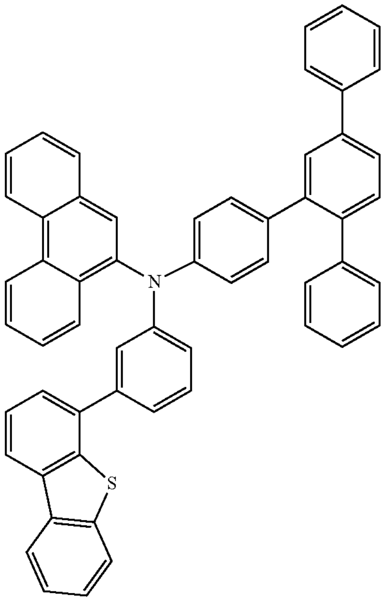
-continued
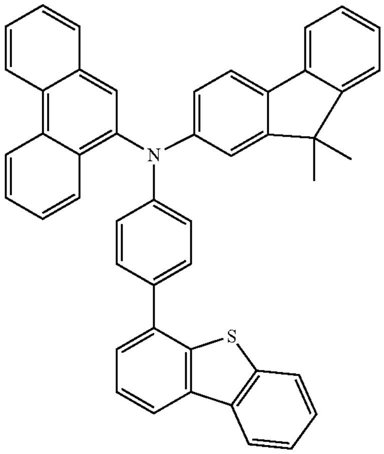
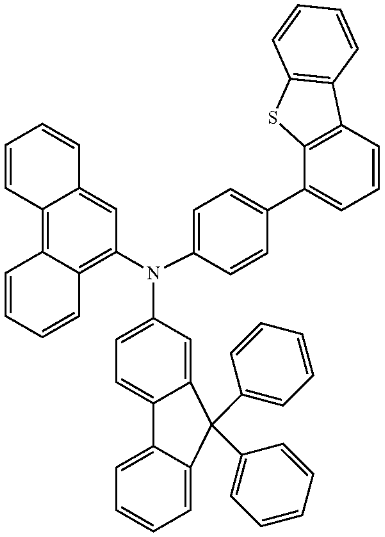
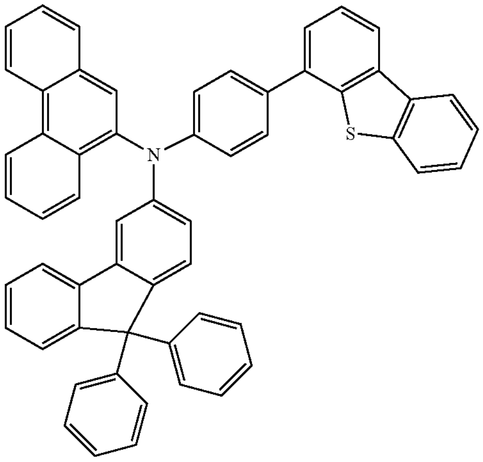

-continued
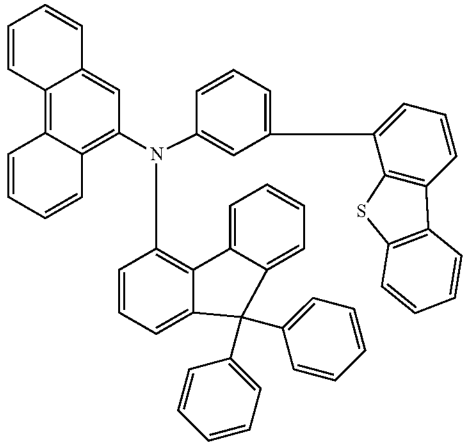
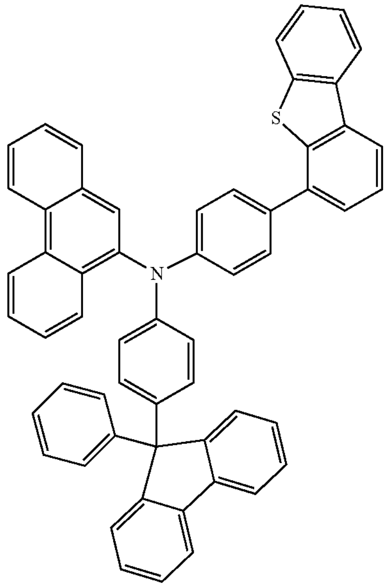
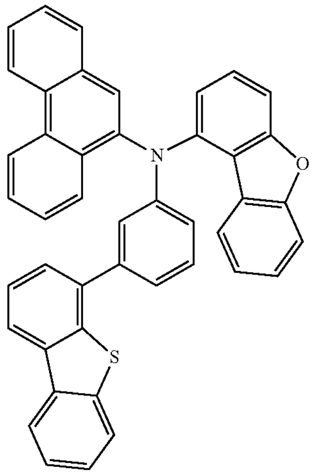
-continued
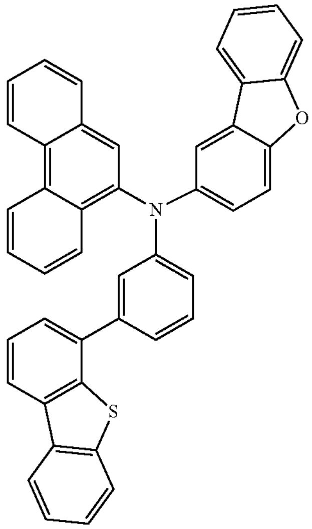
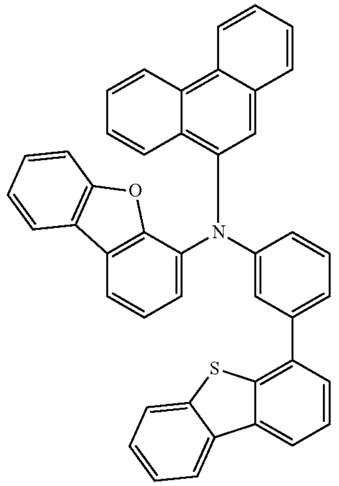
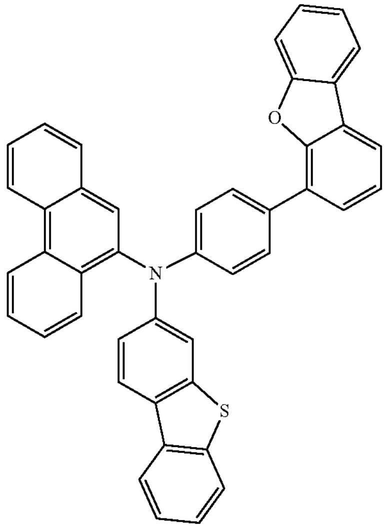

-continued
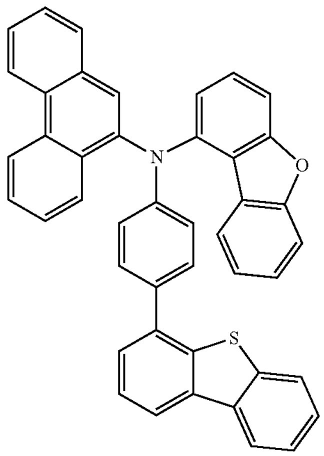
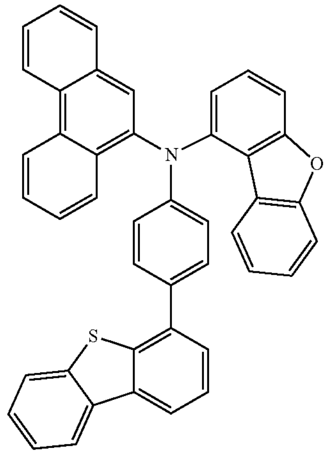
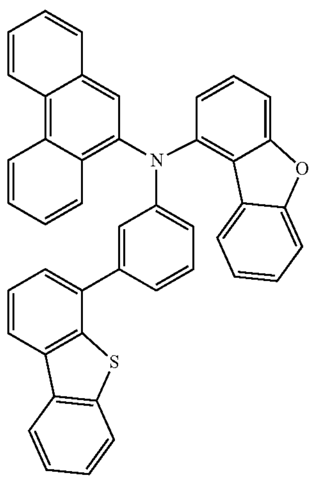
-continued
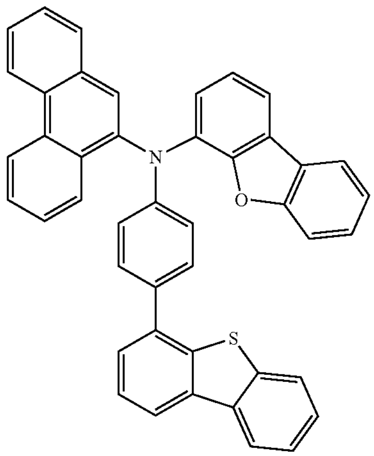
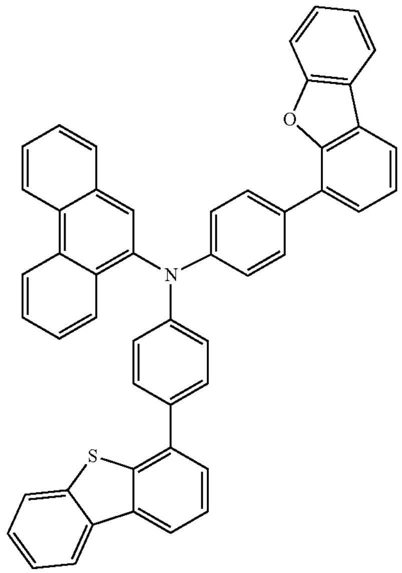
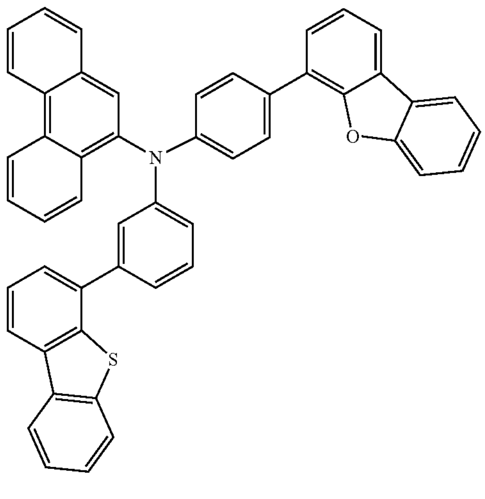

-continued
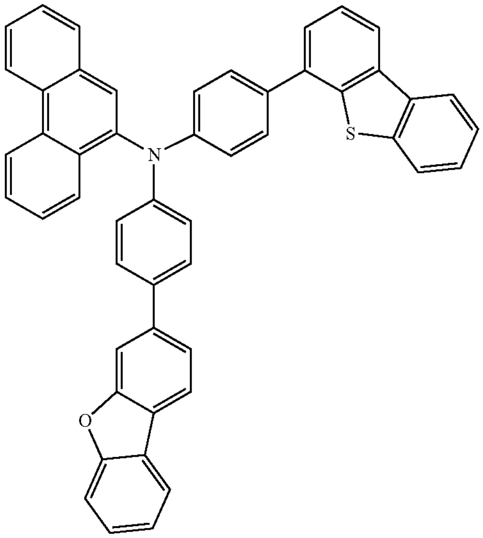
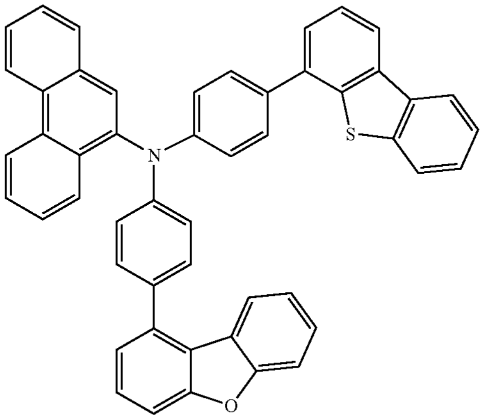
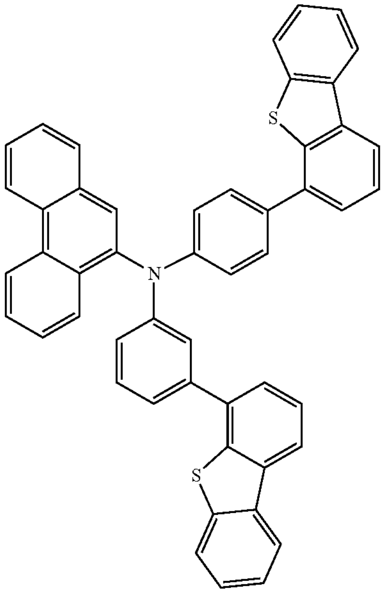
-continued
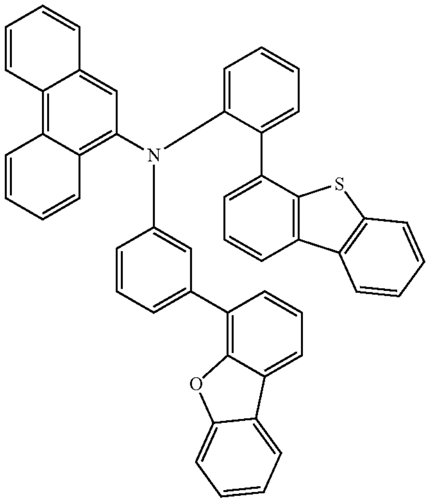
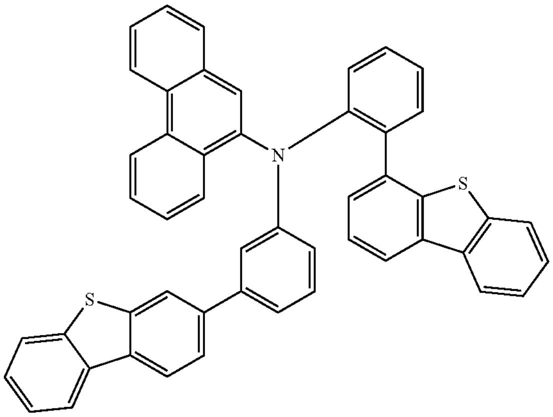
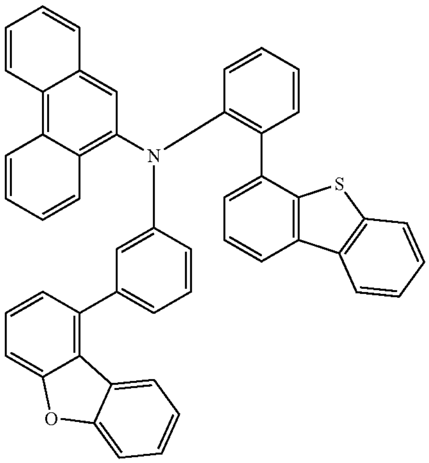

-continued
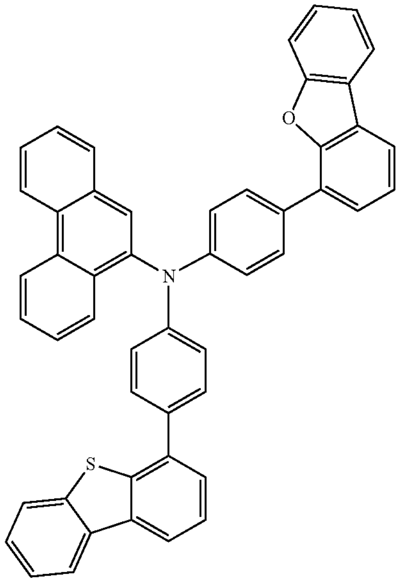
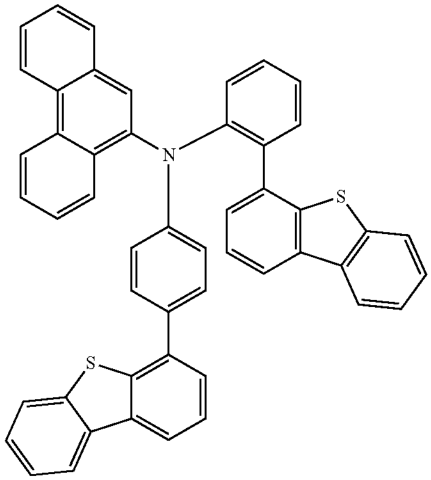
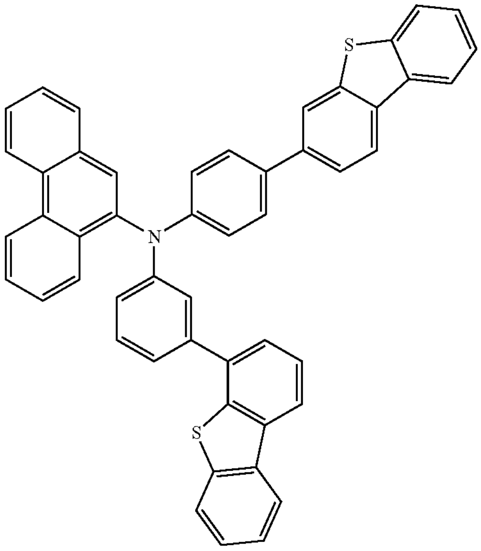
-continued
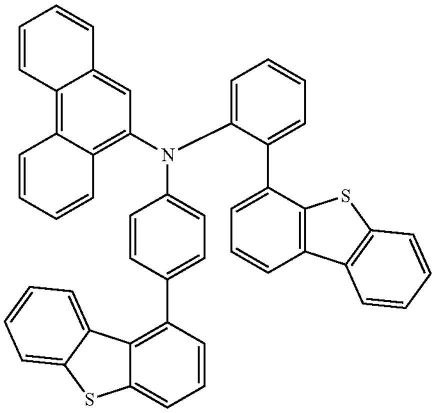
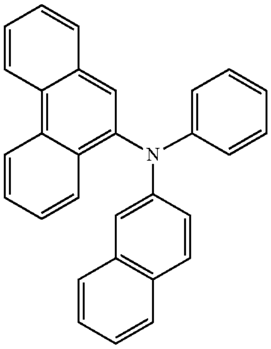
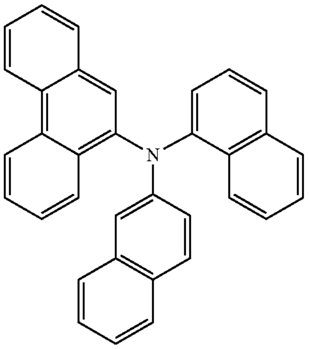
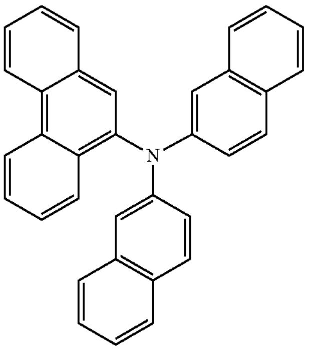

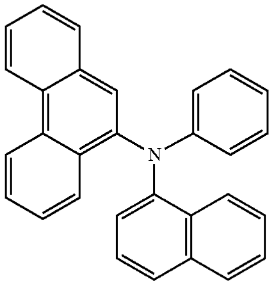
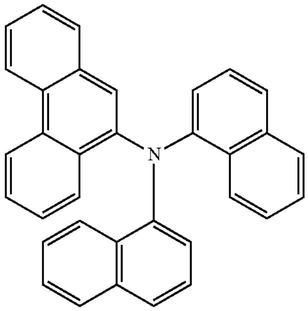
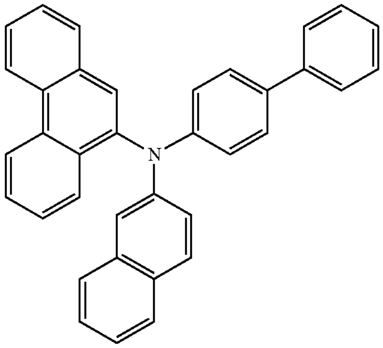
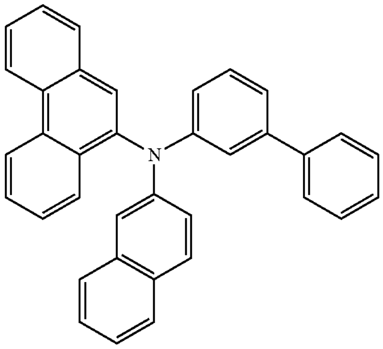
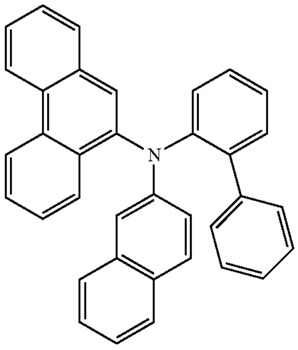
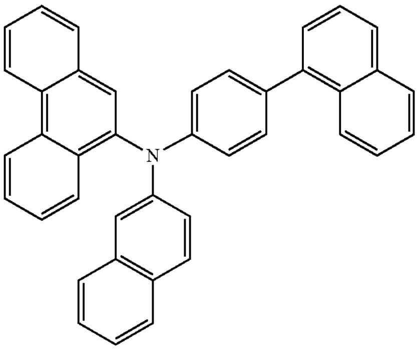
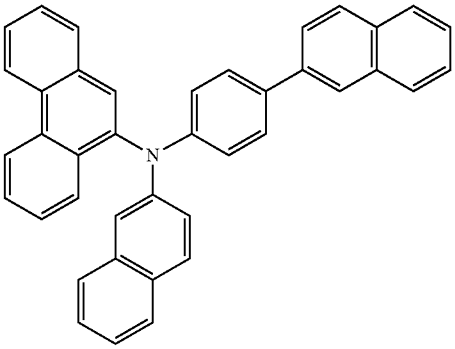
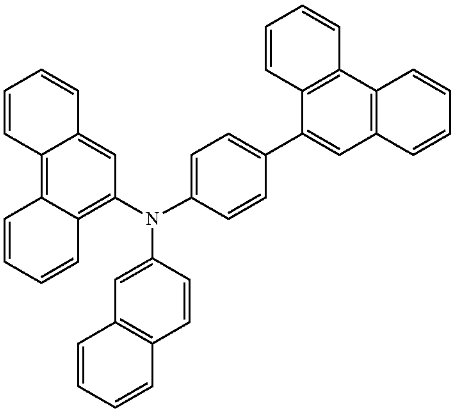
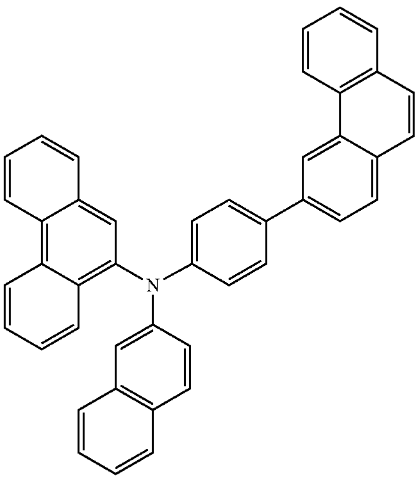

-continued
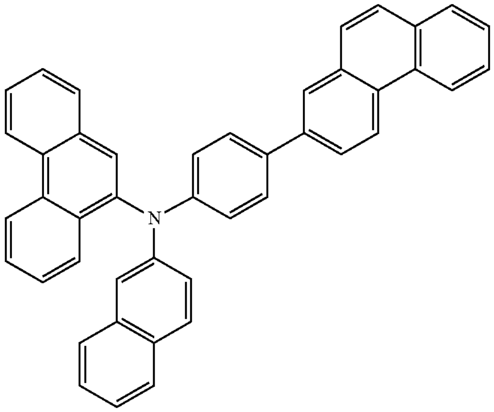
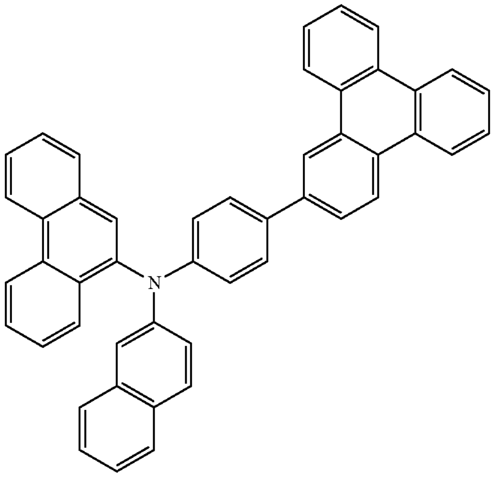
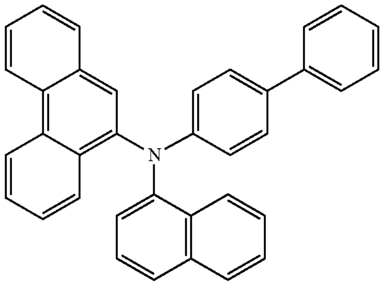
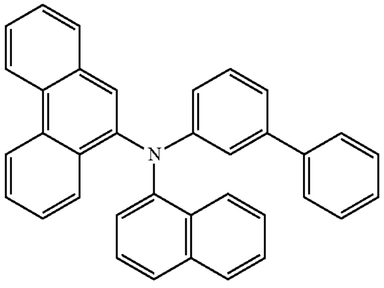
-continued
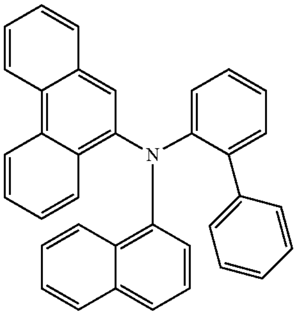
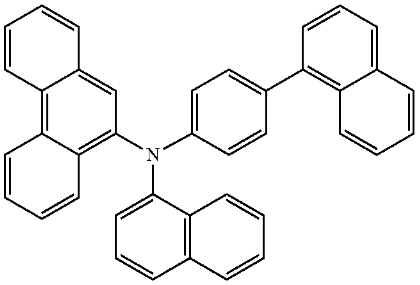
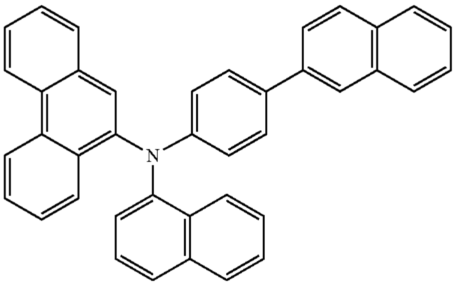
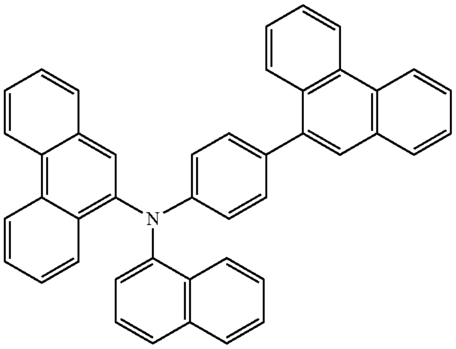
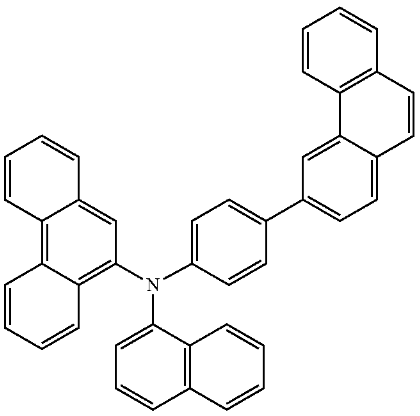

-continued
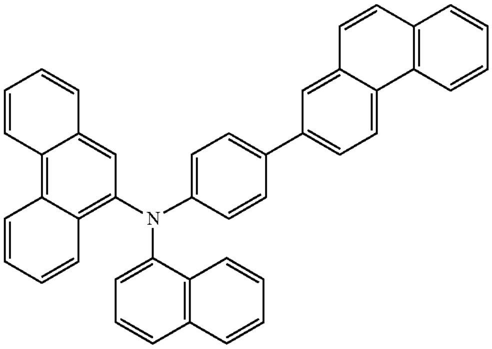
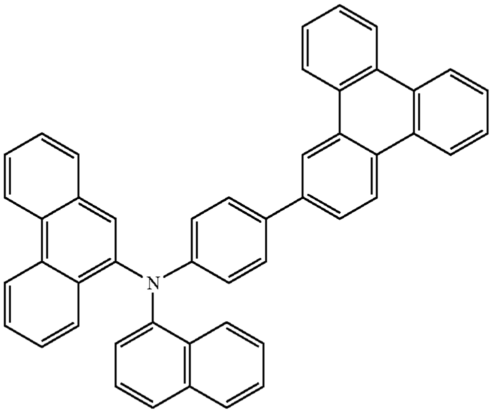
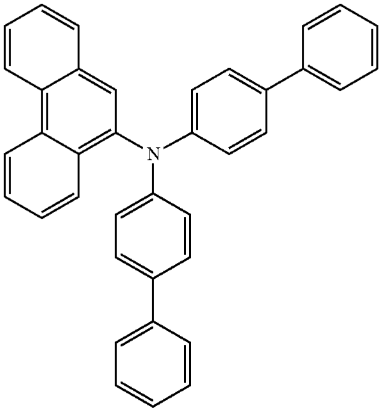
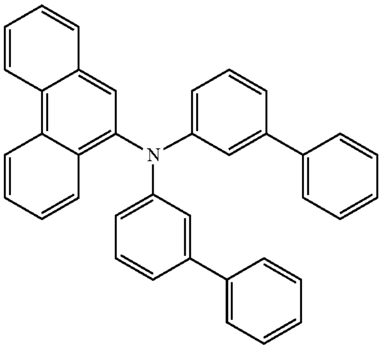
-continued
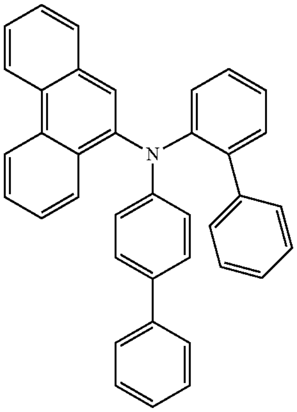
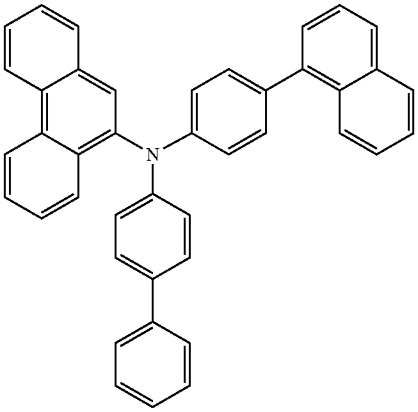
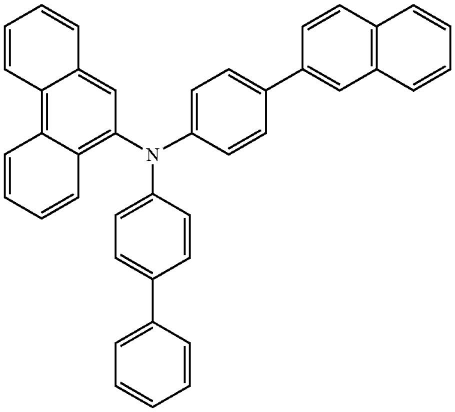
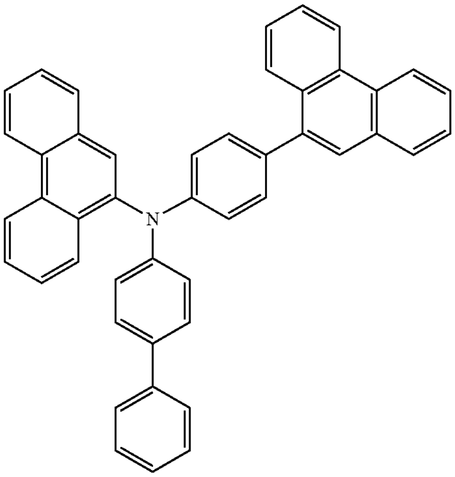

-continued
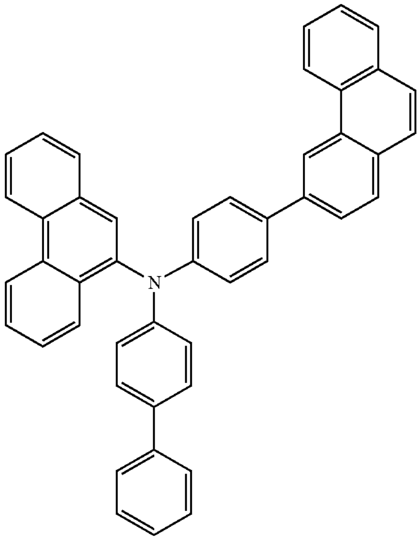
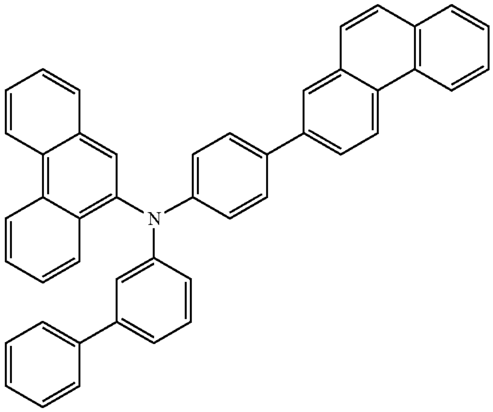
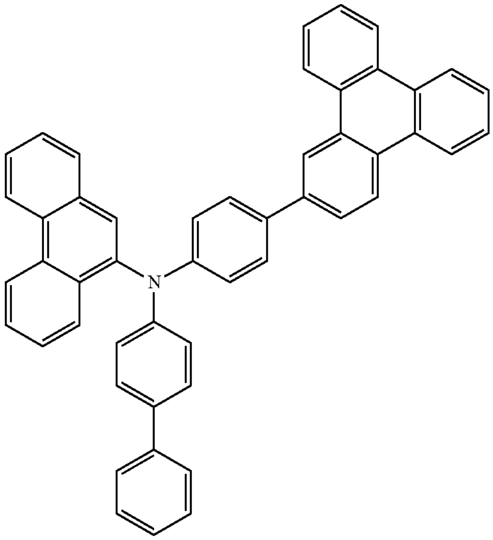
-continued
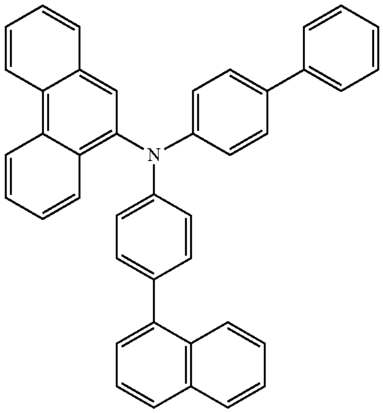
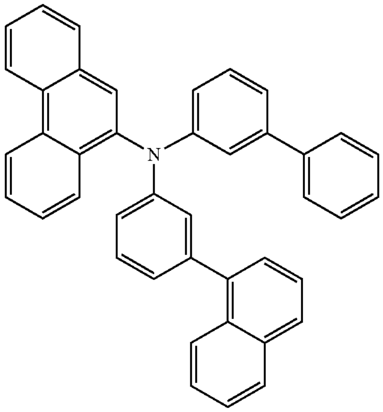
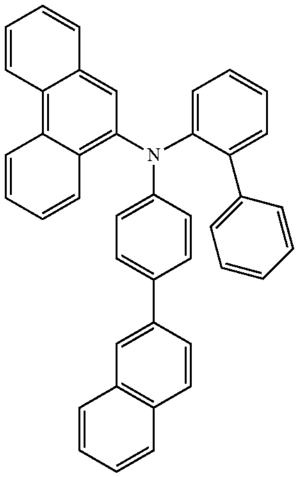
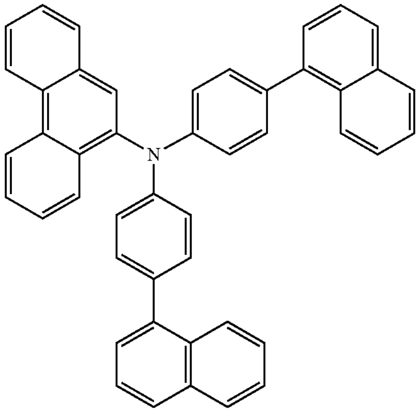

-continued
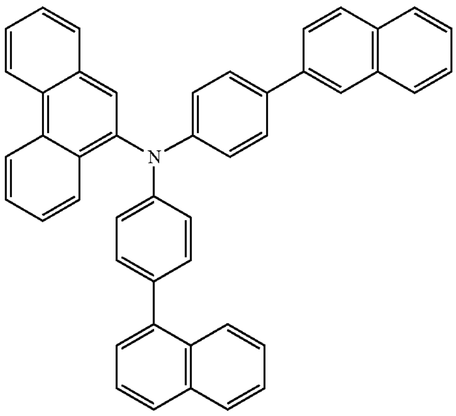
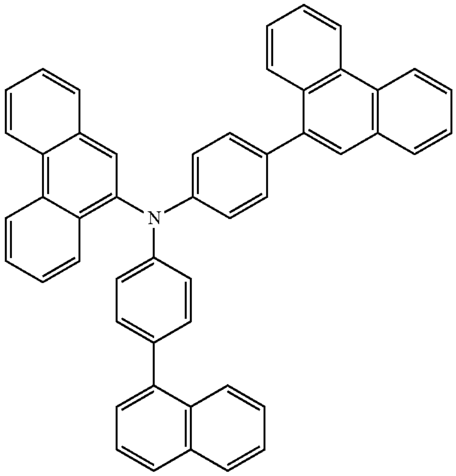
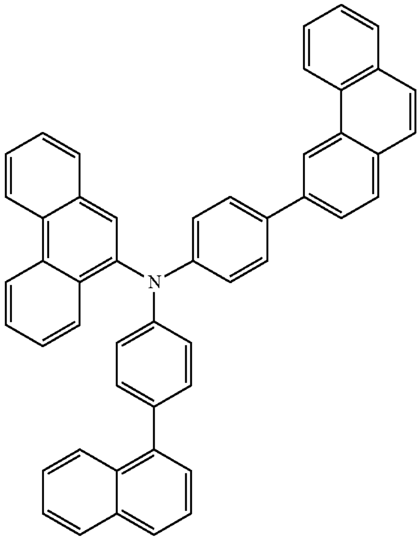
-continued
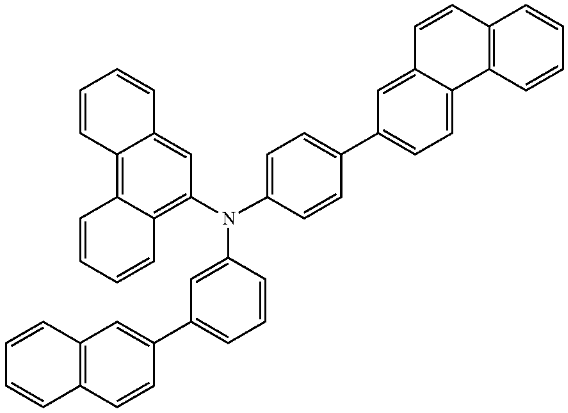
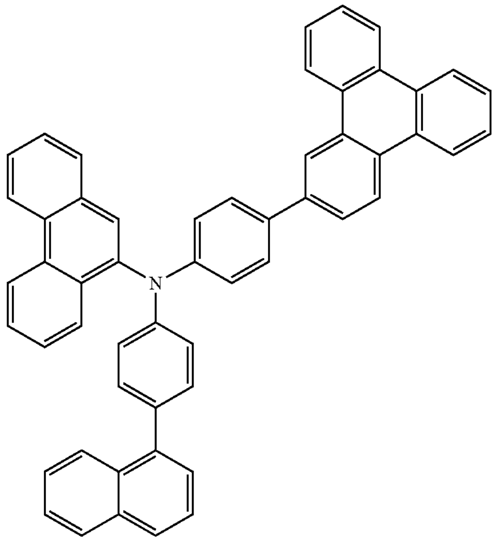
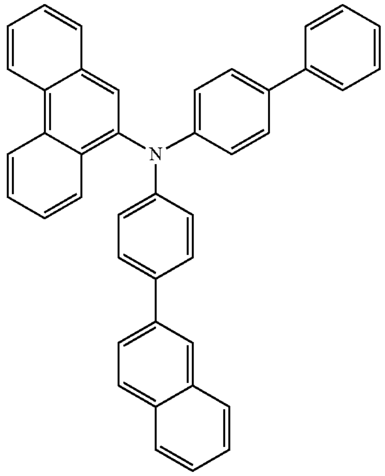

-continued
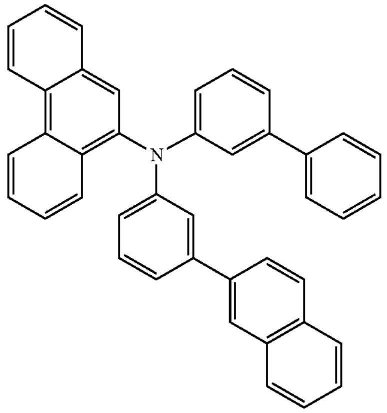
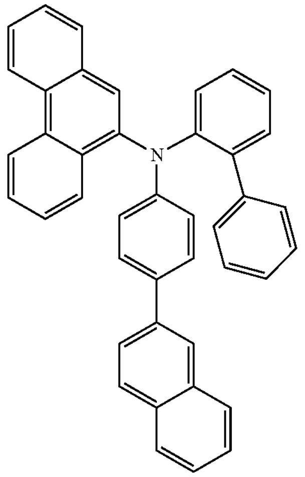
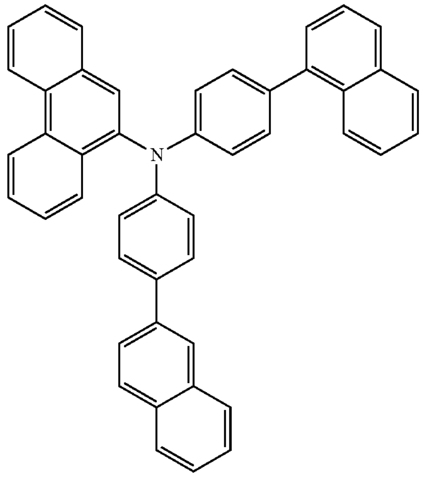
-continued
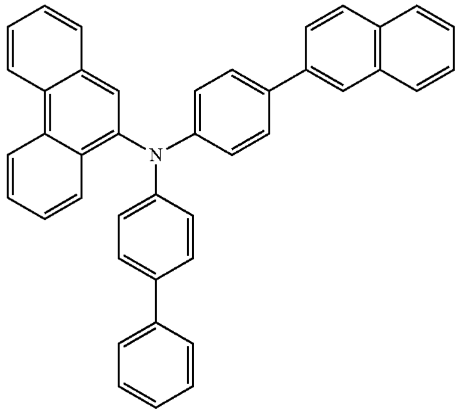
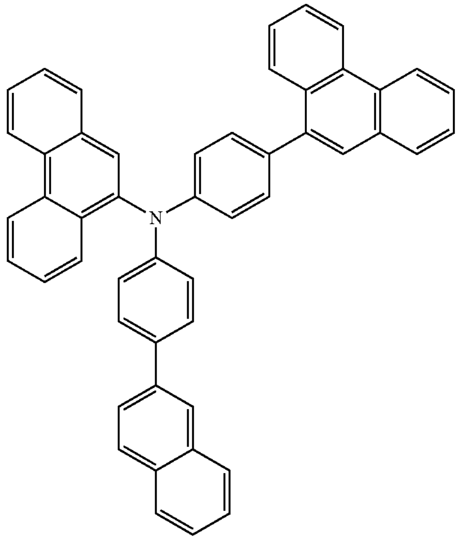
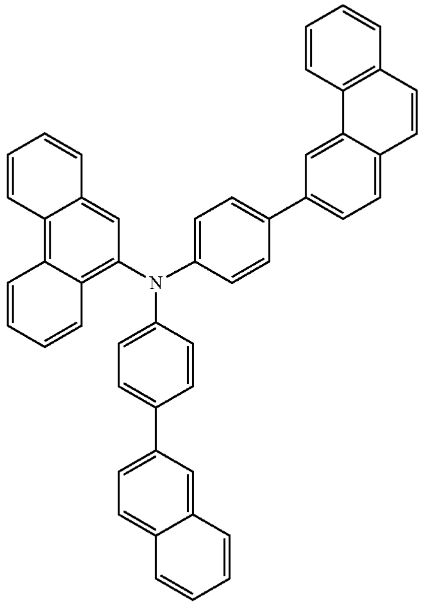

-continued
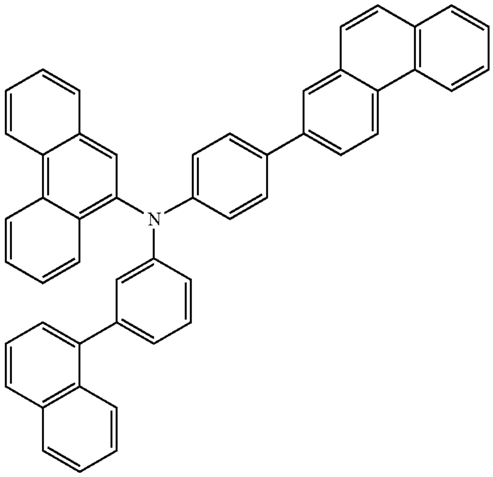
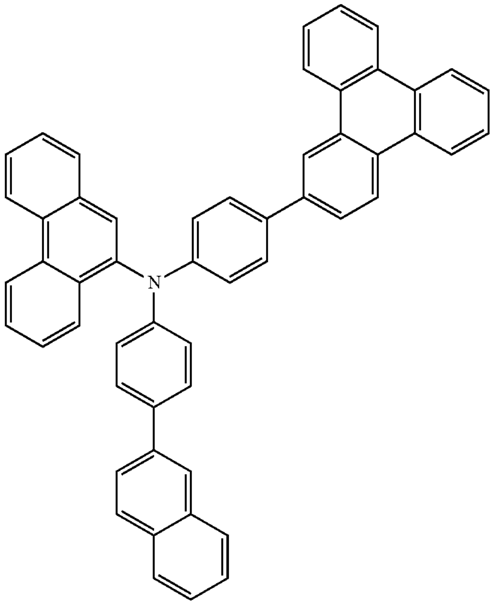
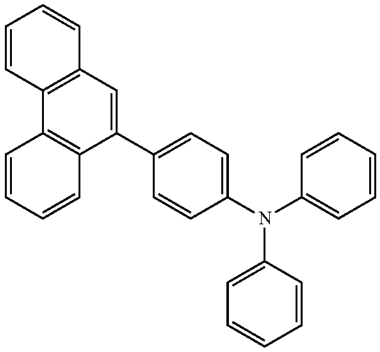
-continued
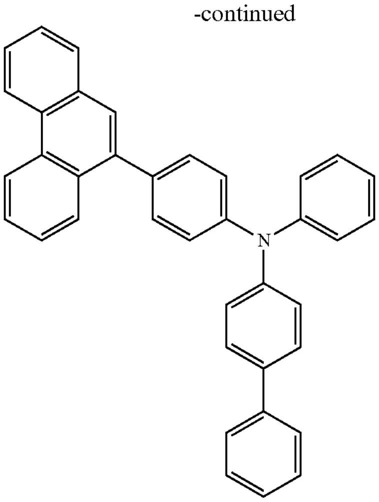
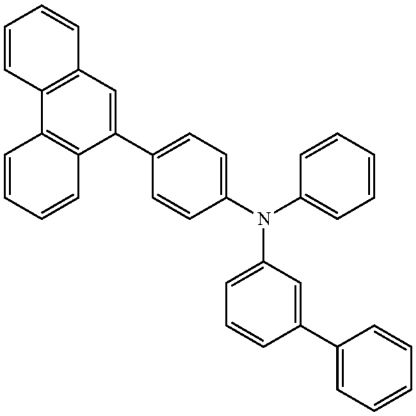
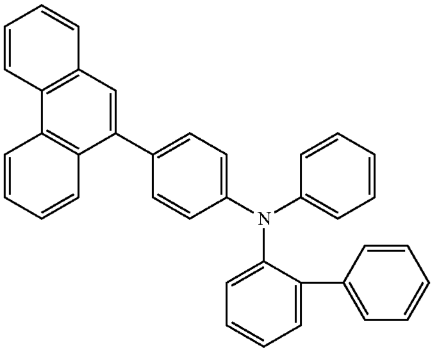
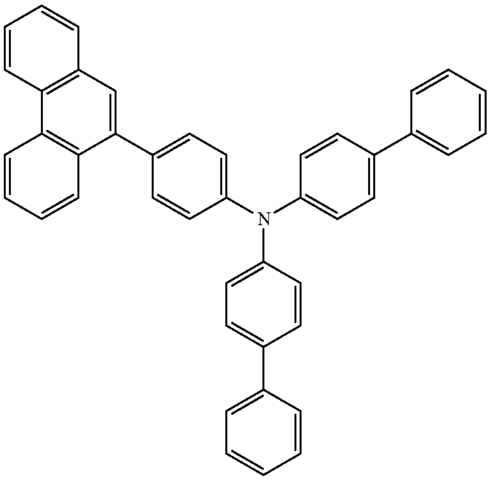

-continued
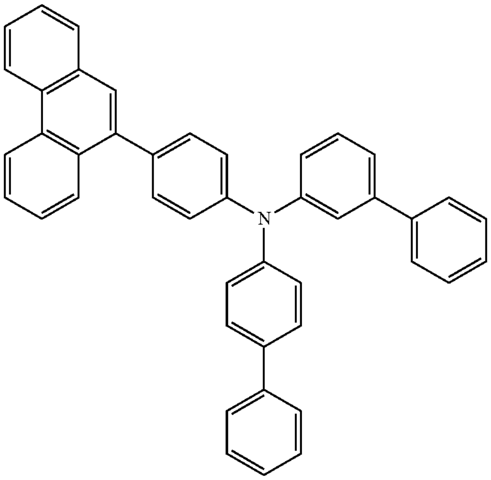
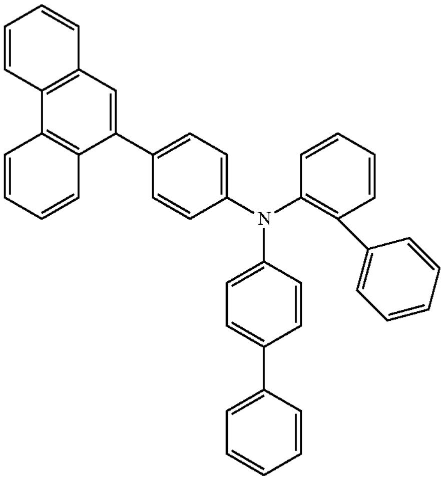
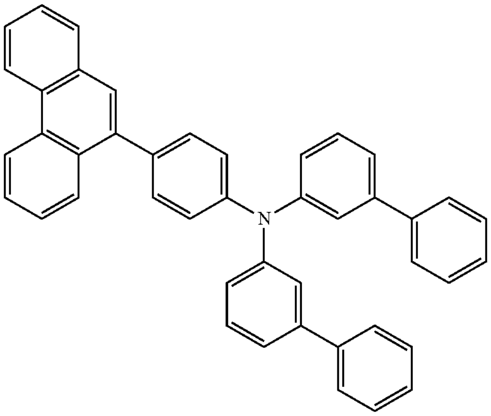
-continued
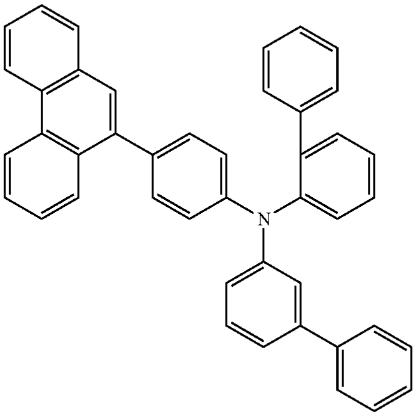
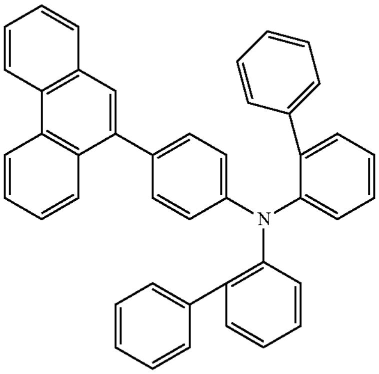
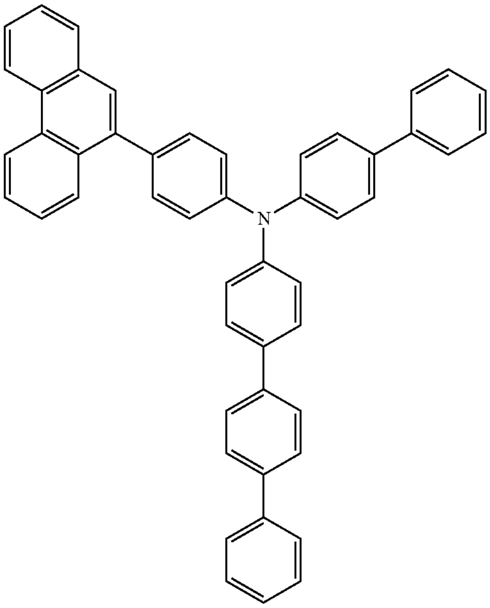

-continued
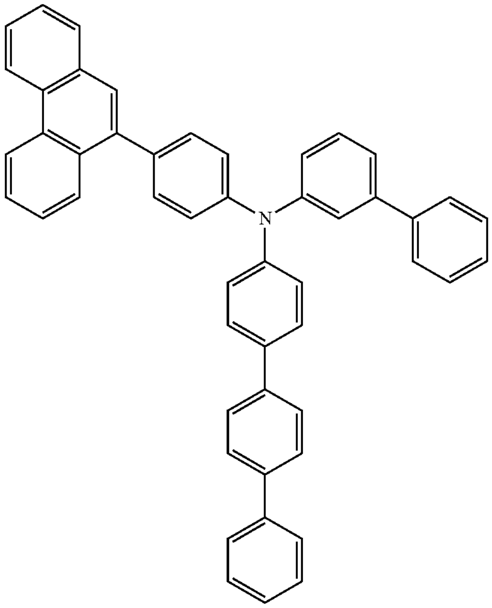
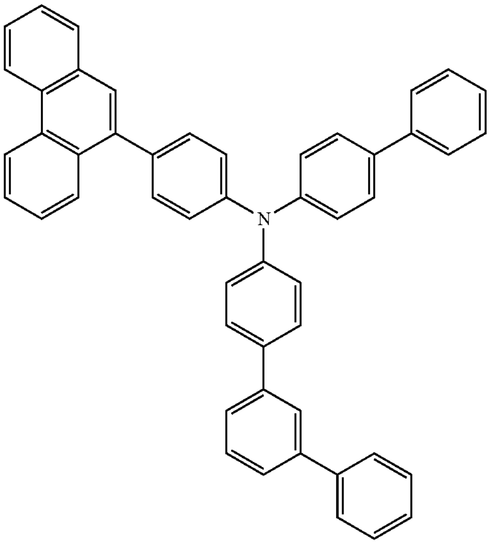
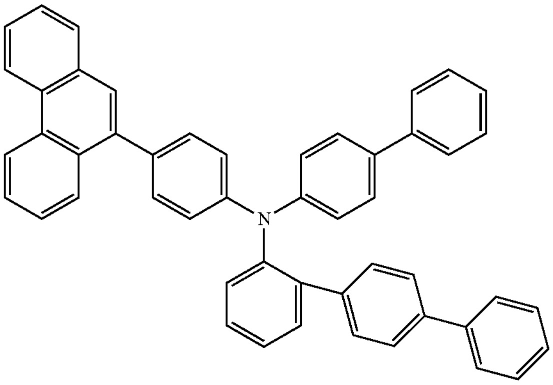
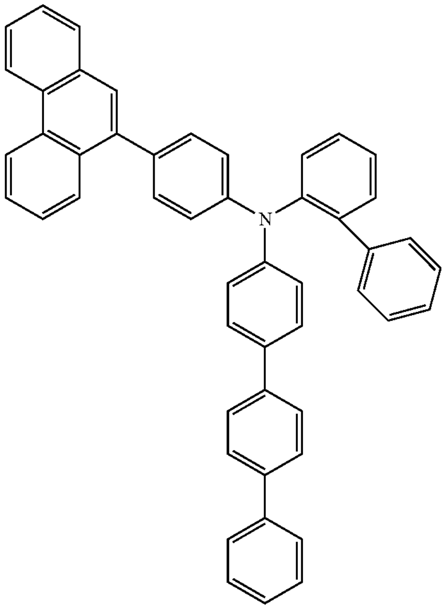
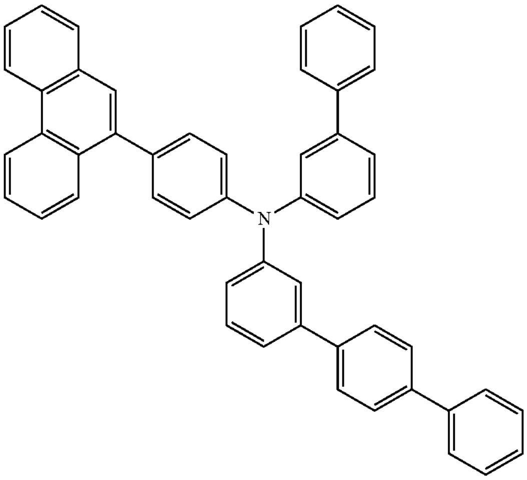

-continued
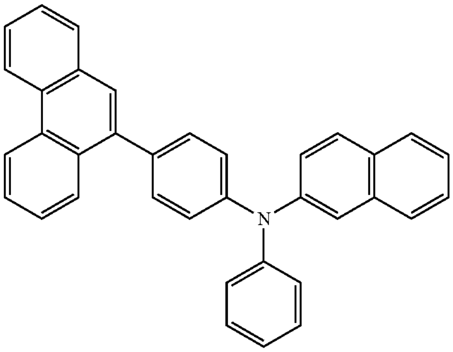
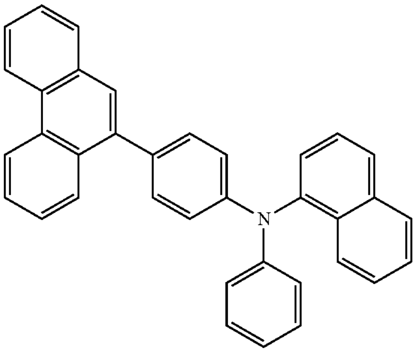
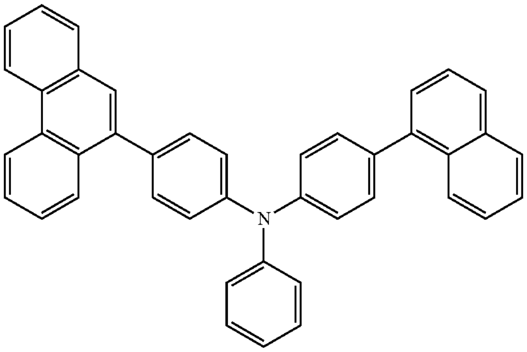
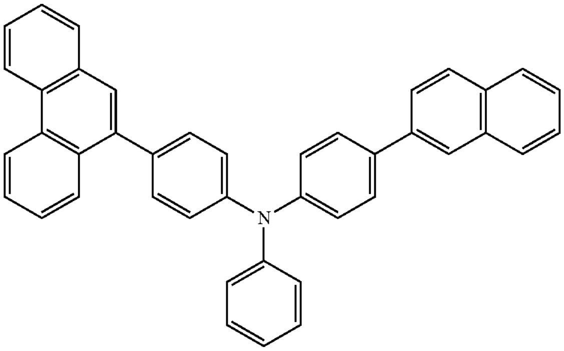
-continued
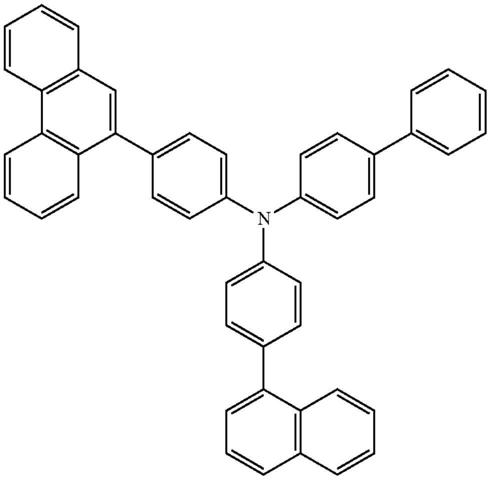
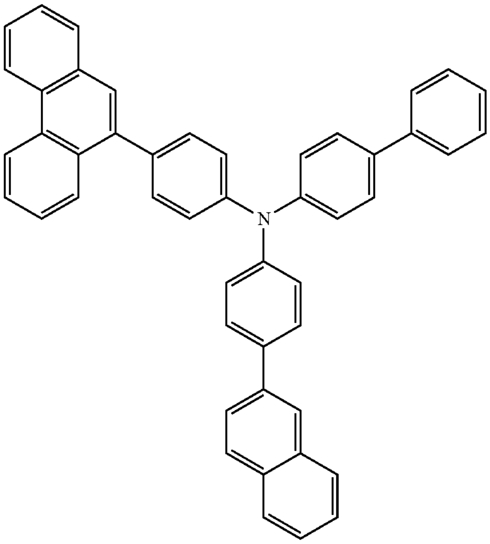
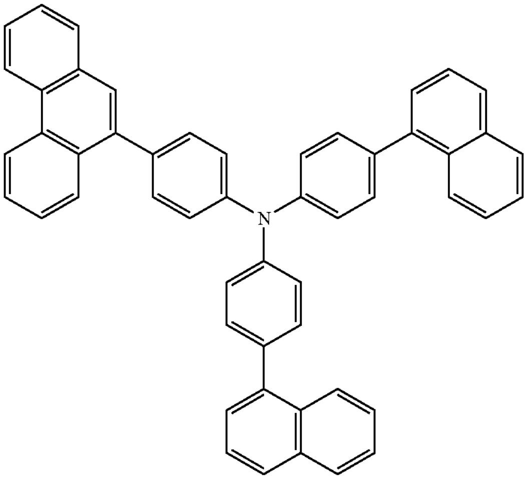

-continued
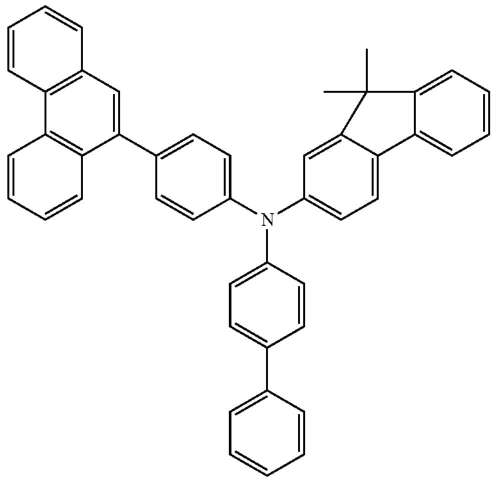
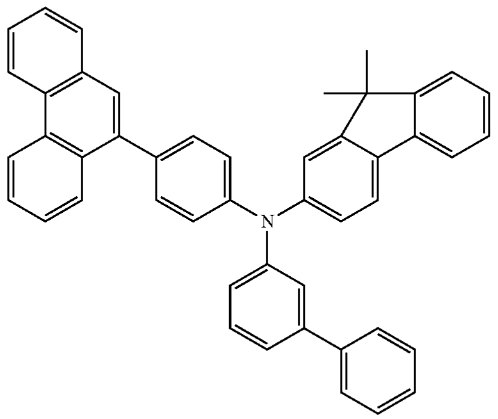
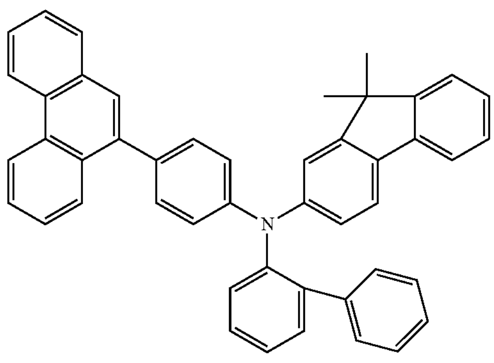
-continued
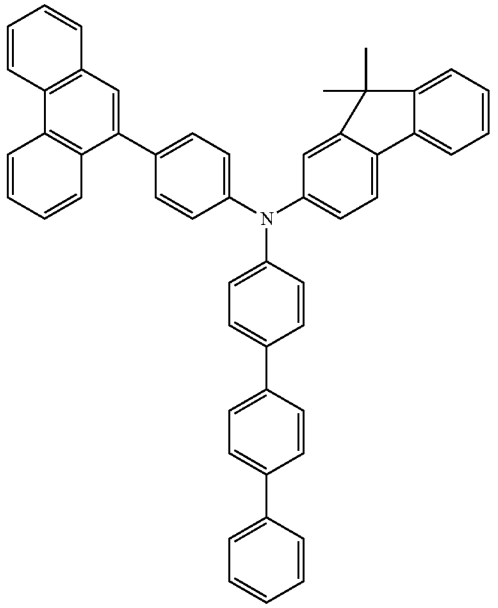 [SMILES: CC1(C)c2ccccc2-c2ccc(N(c3ccc(-c4ccc(-c5ccccc5)cc4)cc3)c3ccc(-c4cc5ccccc5c5ccccc45)cc3)cc21]
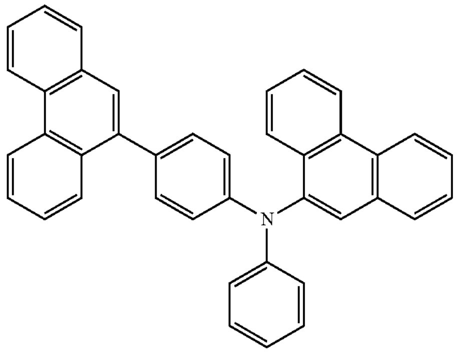
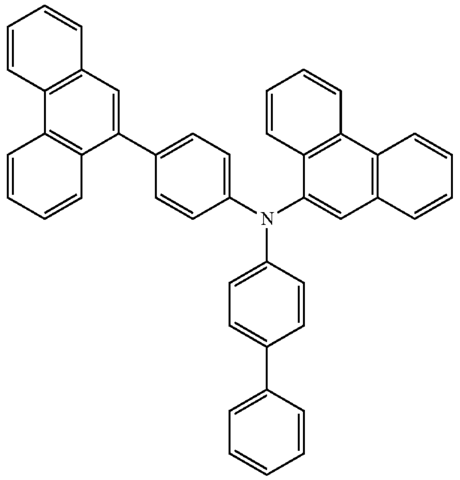

-continued
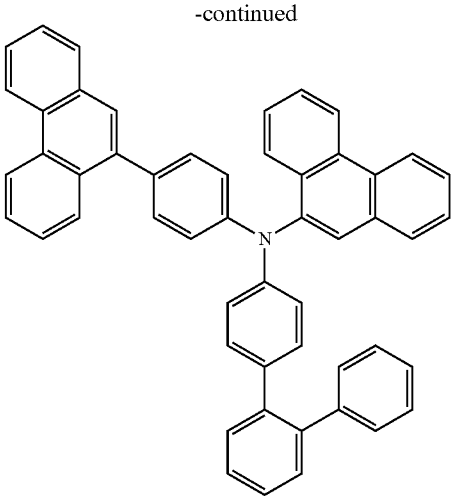
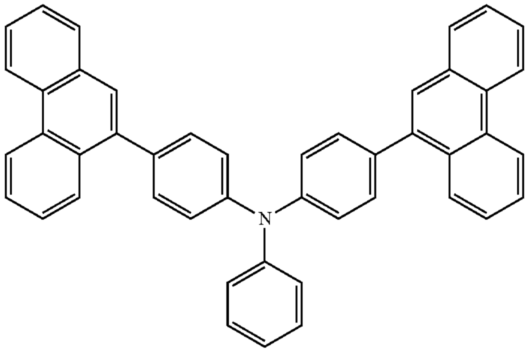
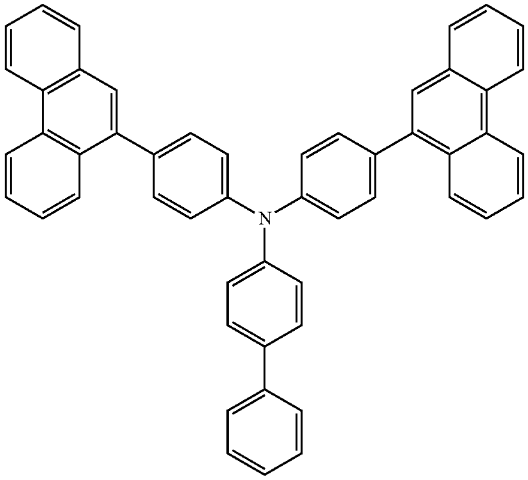
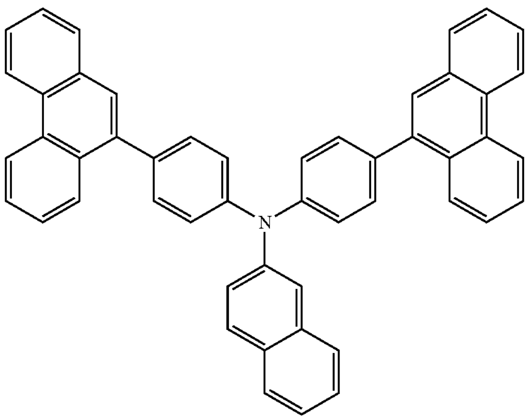
-continued
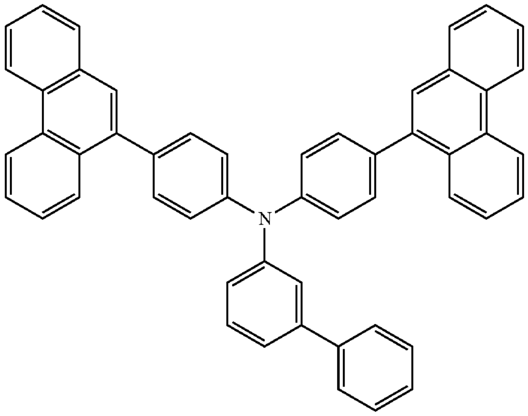
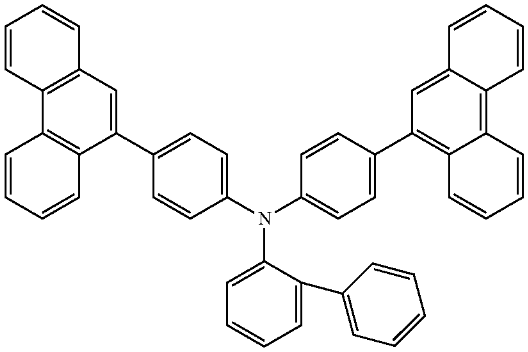
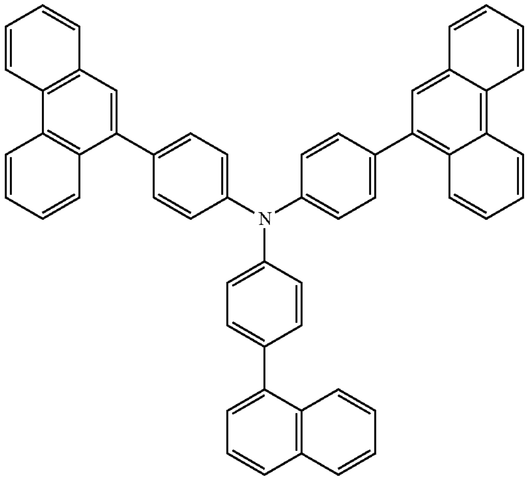
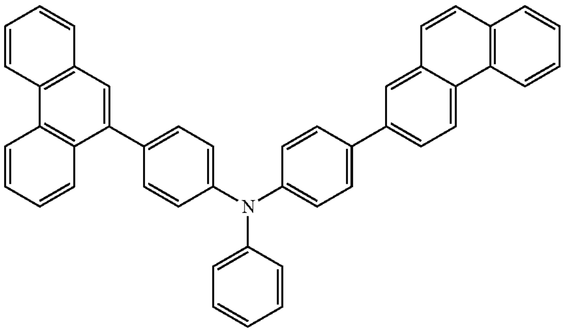

-continued
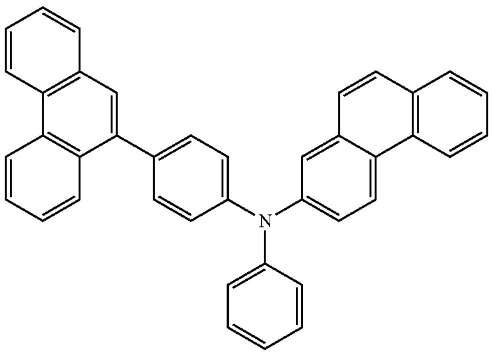
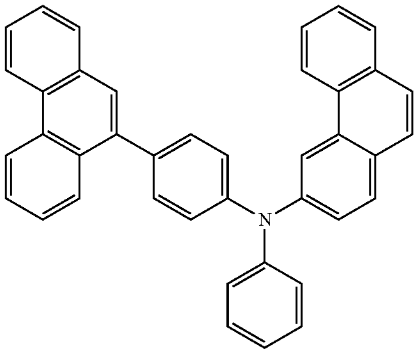
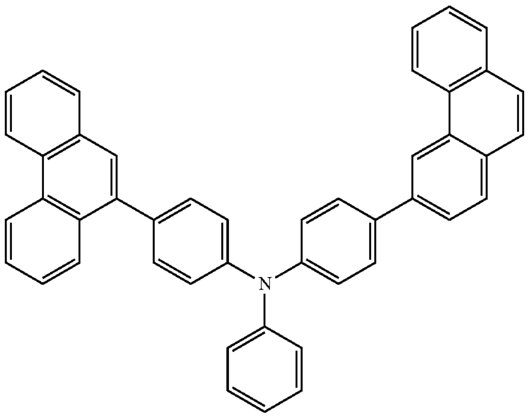
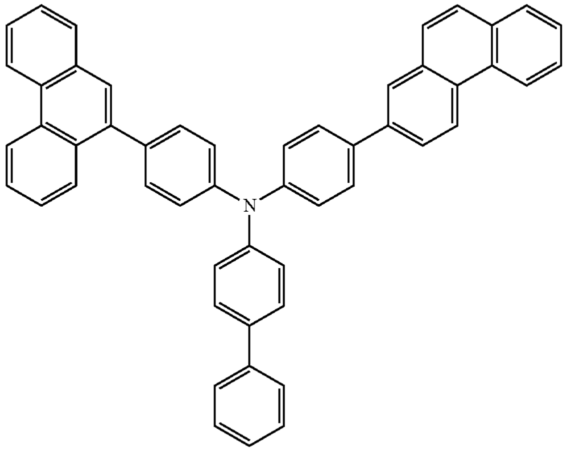
-continued
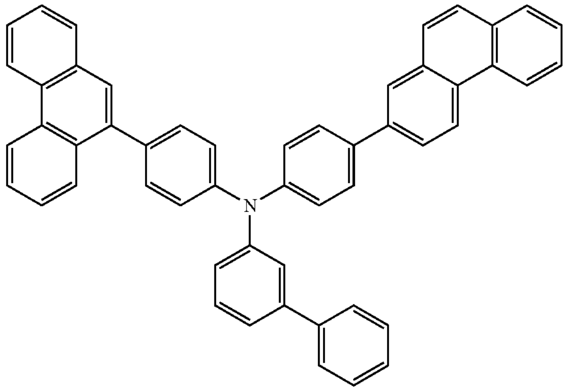
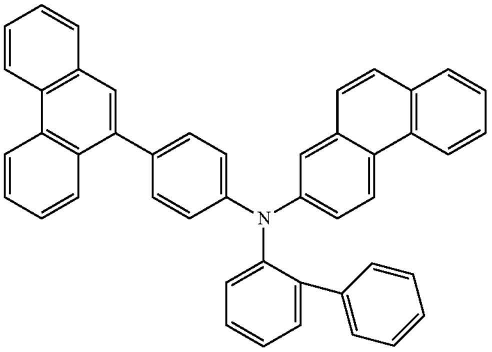
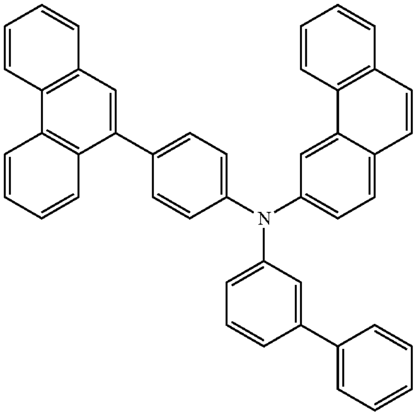
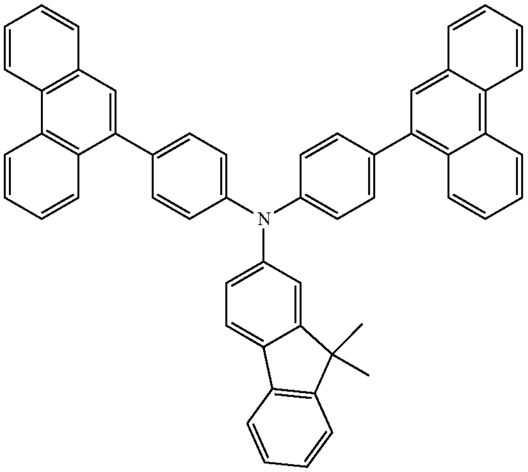

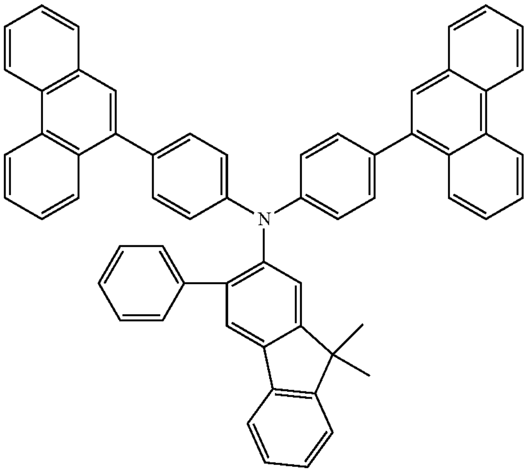
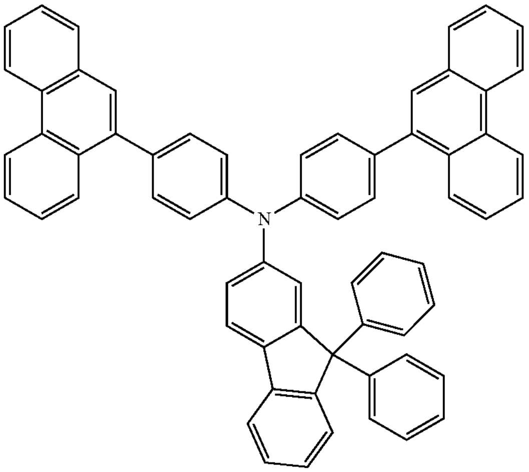
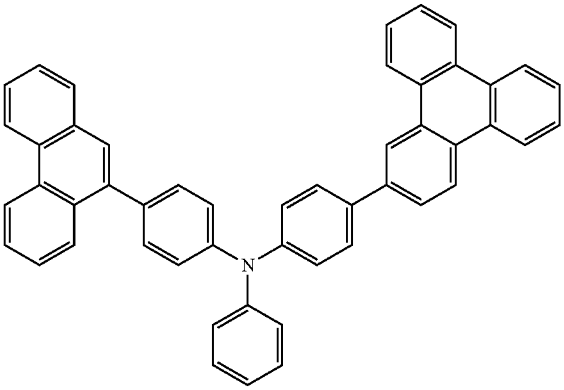
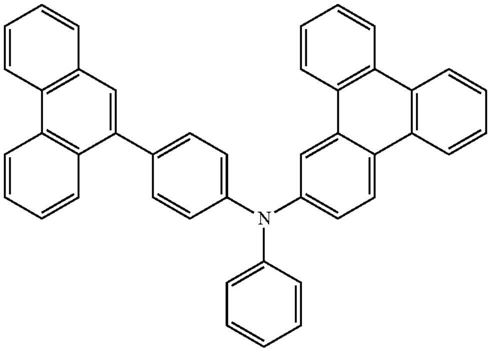
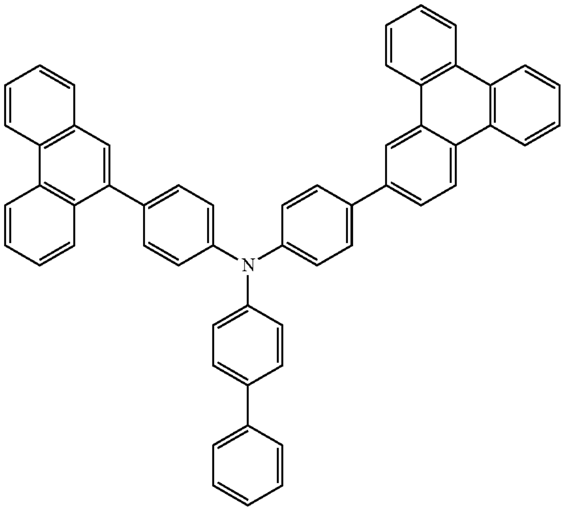
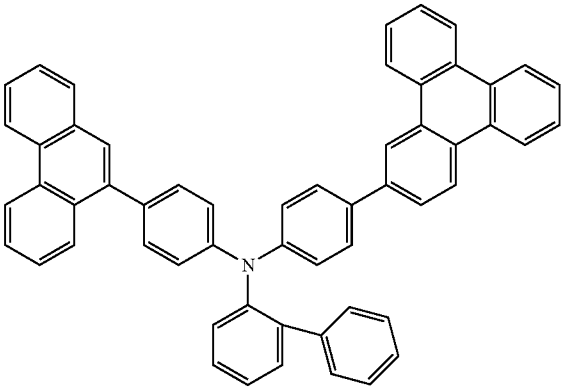
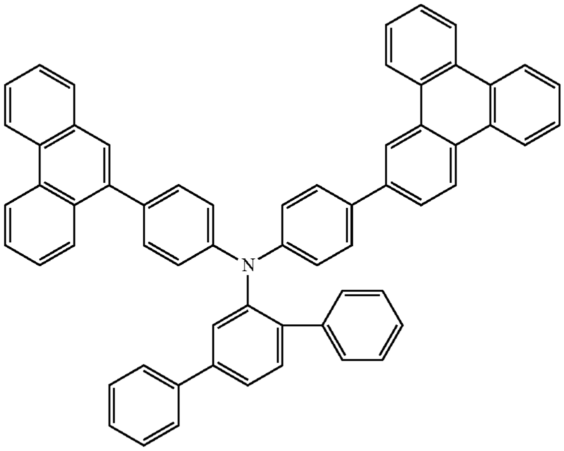
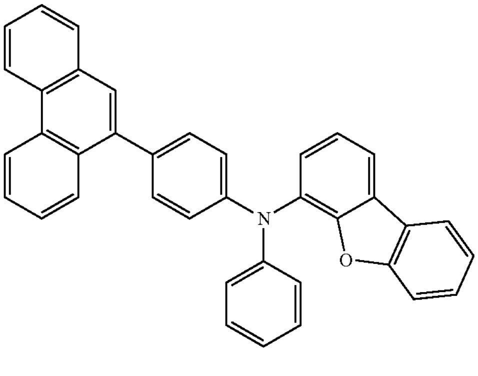

-continued
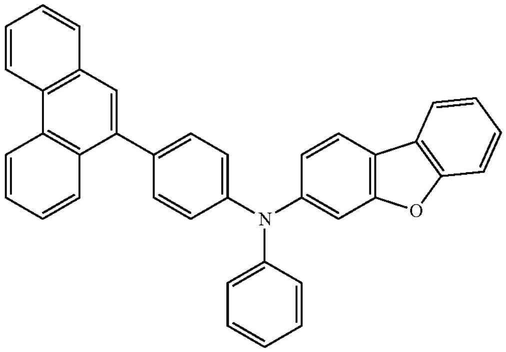
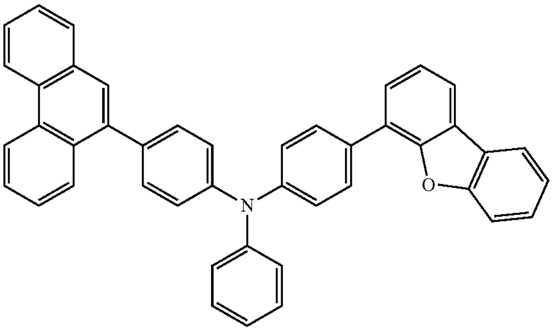
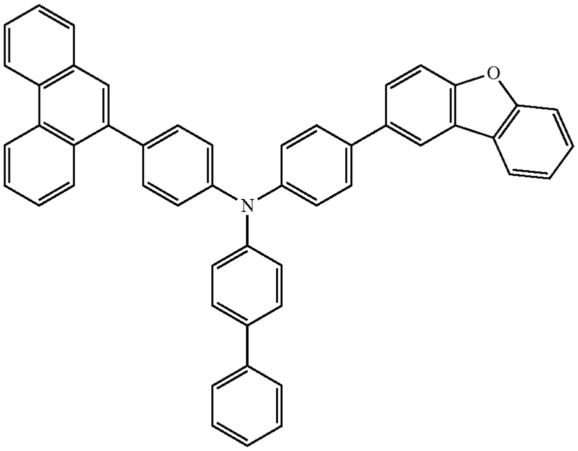
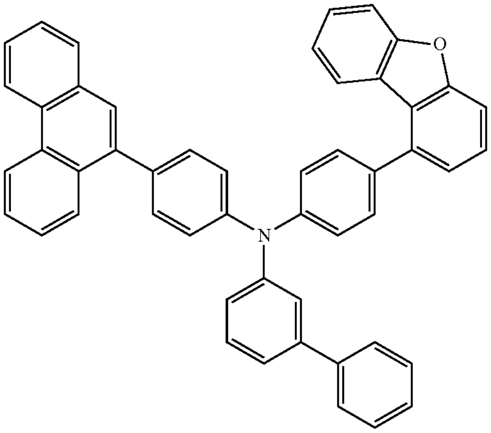
-continued
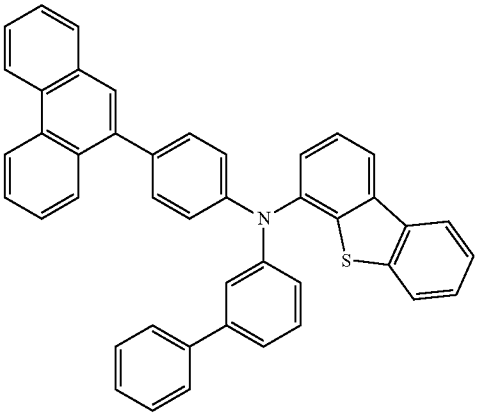
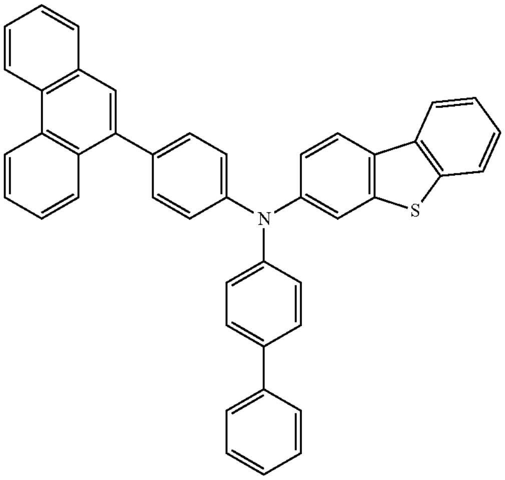
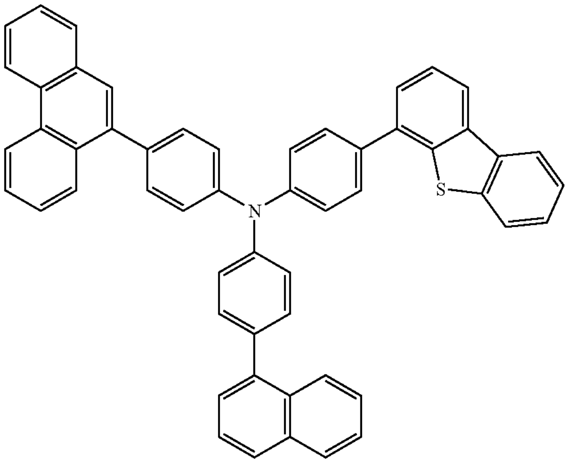

-continued
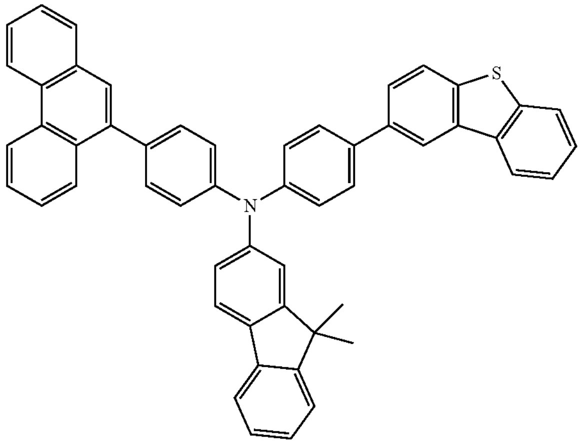
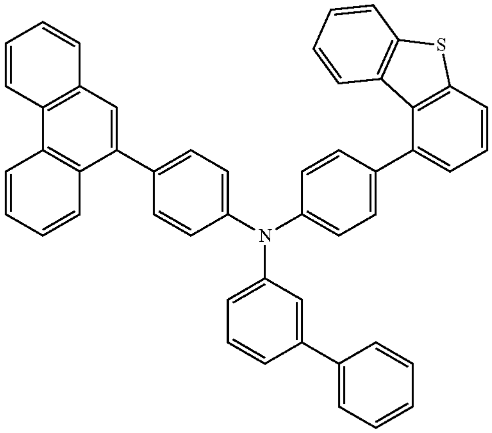
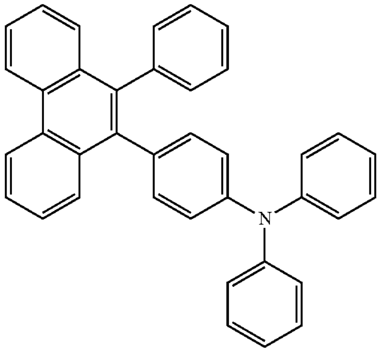
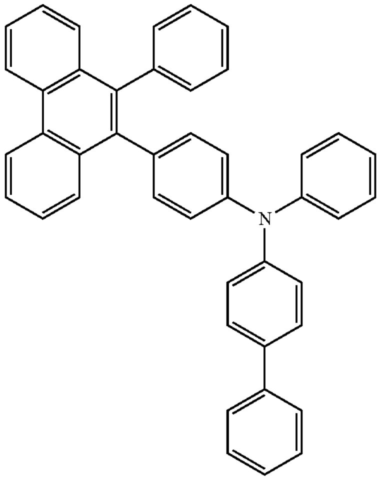
-continued
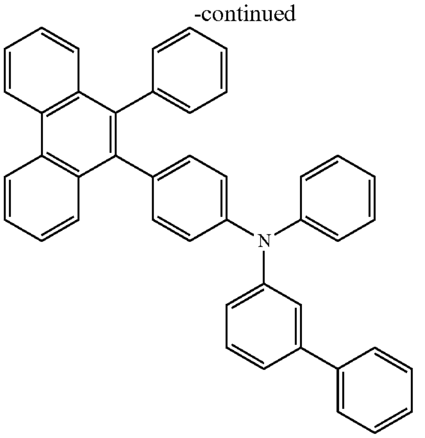
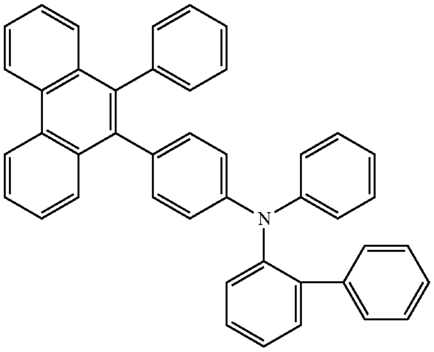
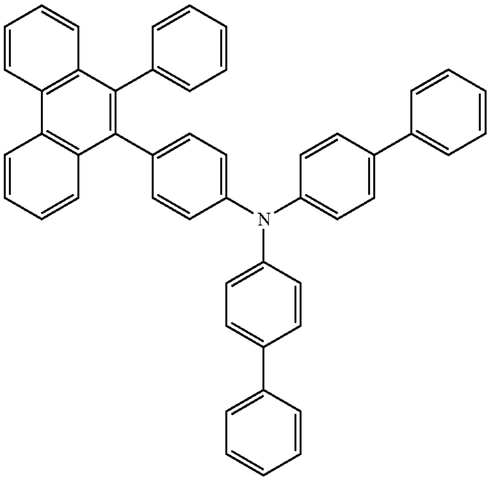
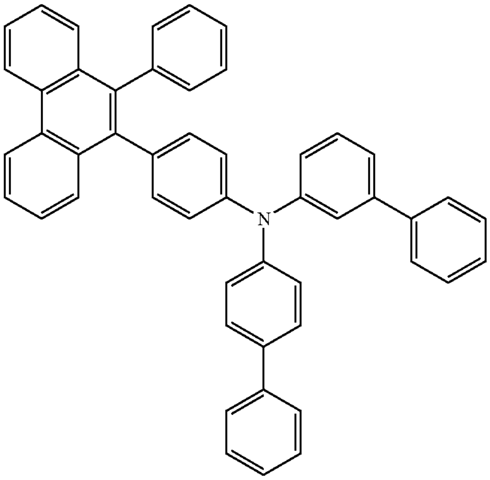

-continued
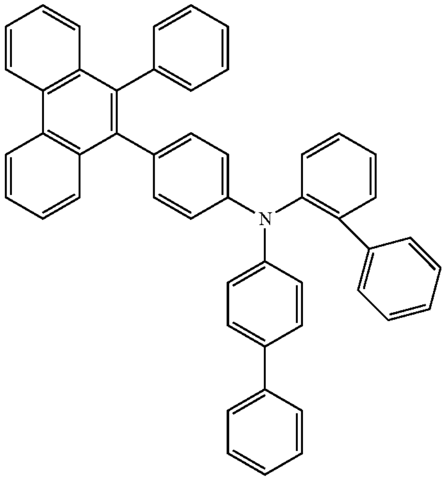
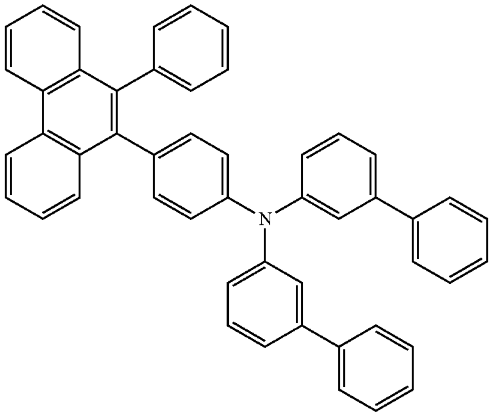
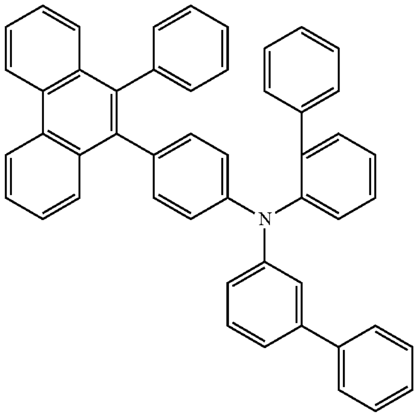
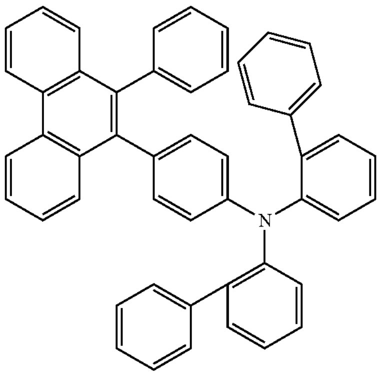
-continued
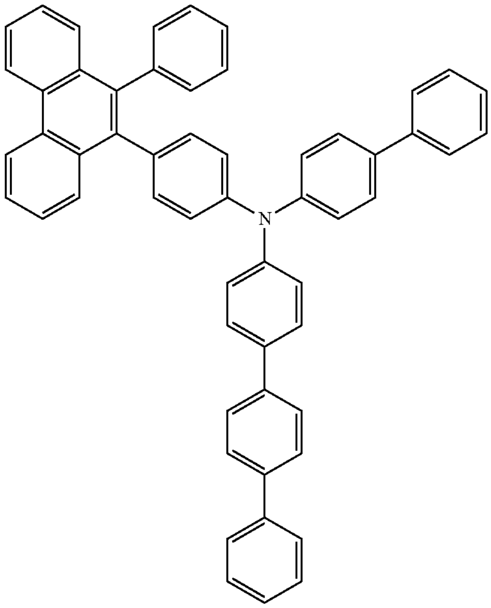
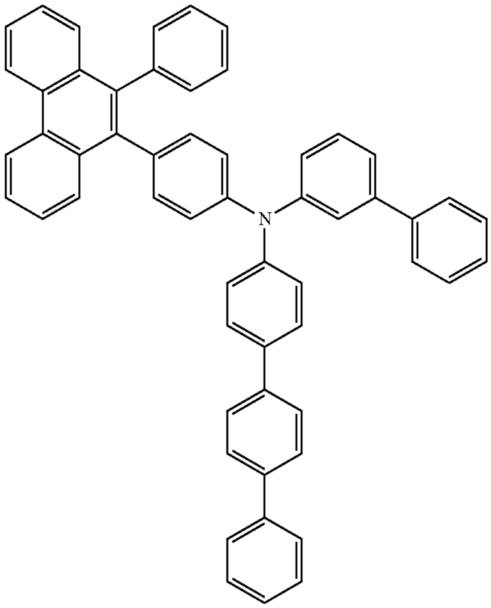

-continued
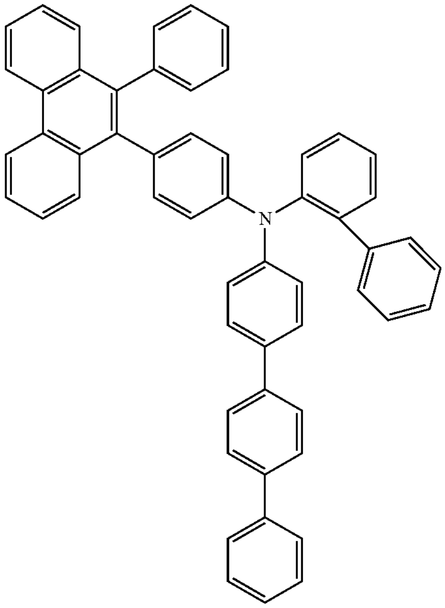
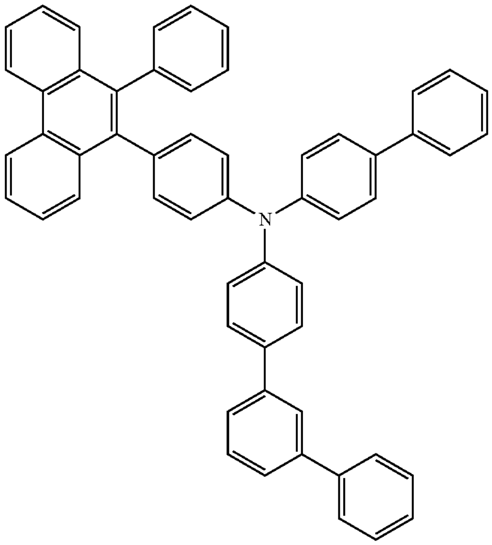
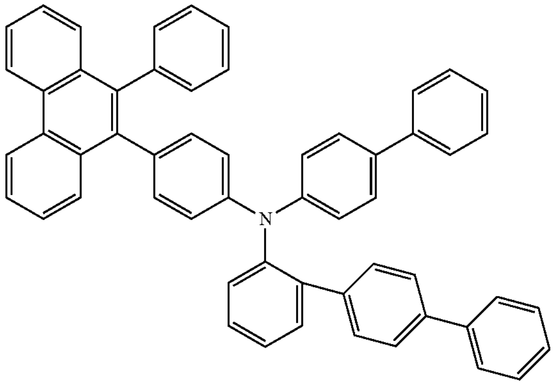
-continued
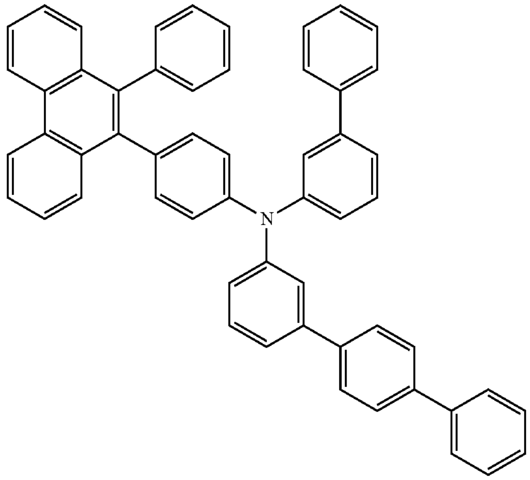
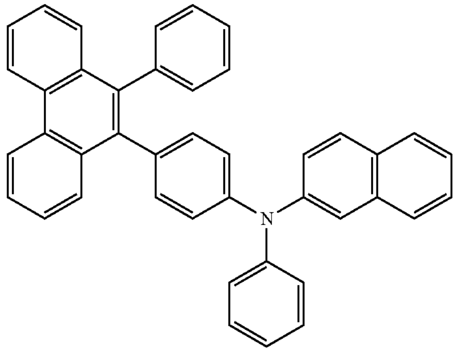
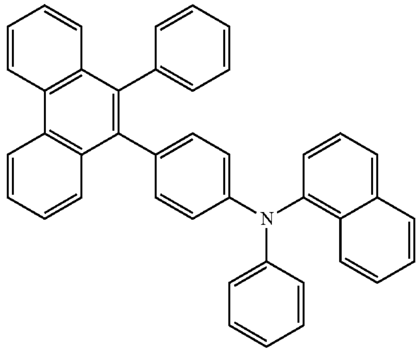
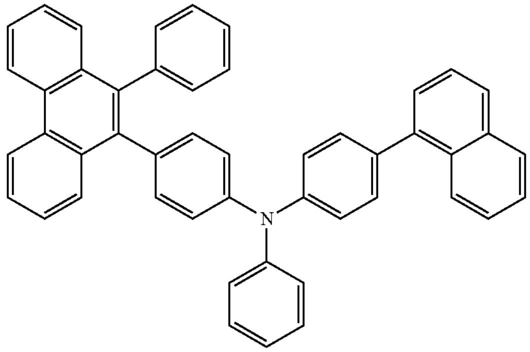

-continued
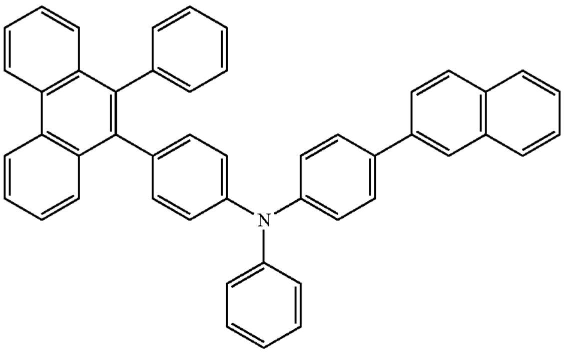
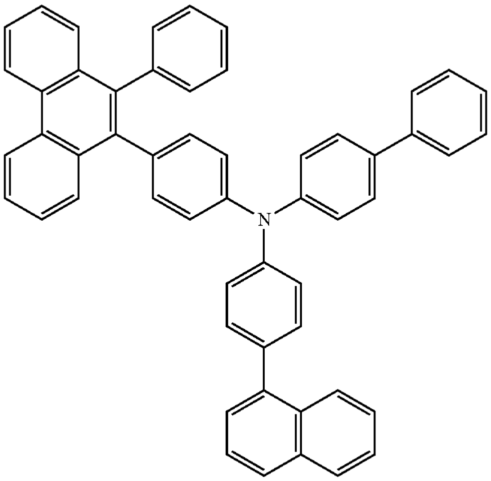
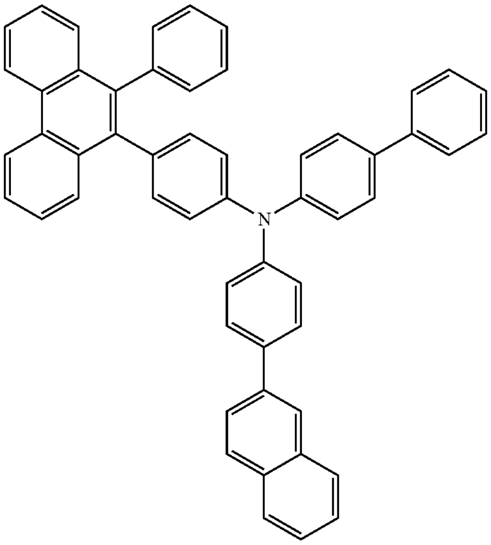
-continued
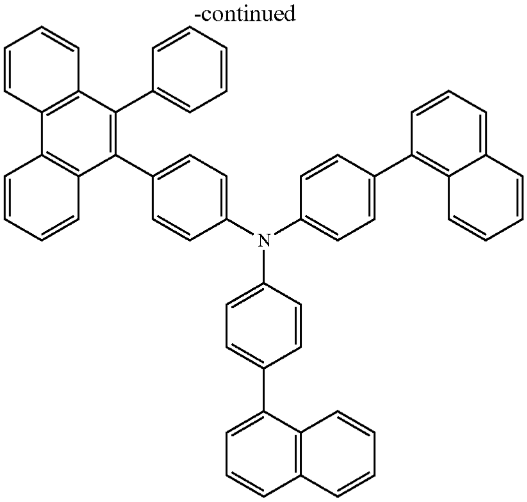
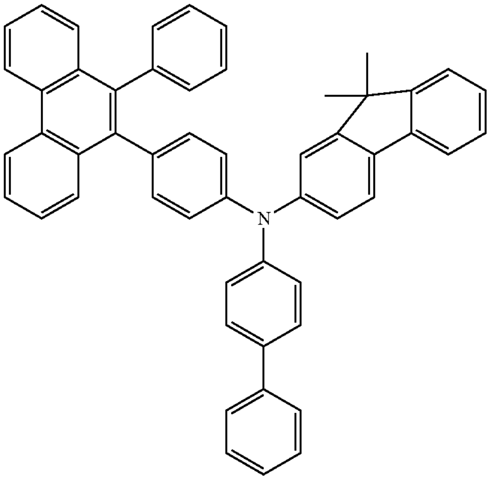
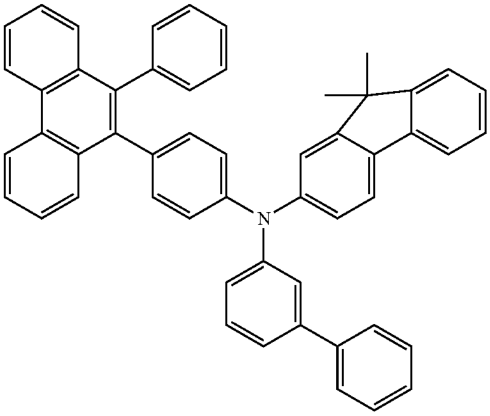
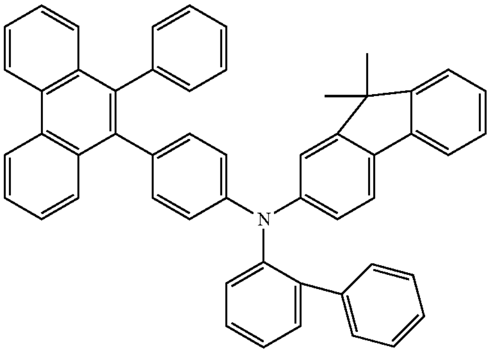

-continued
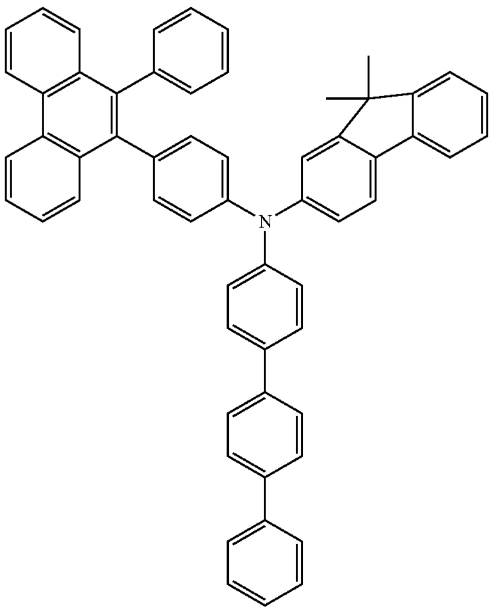
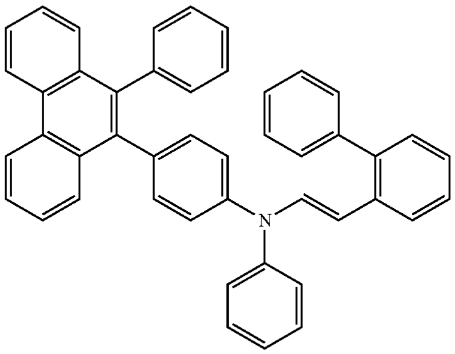
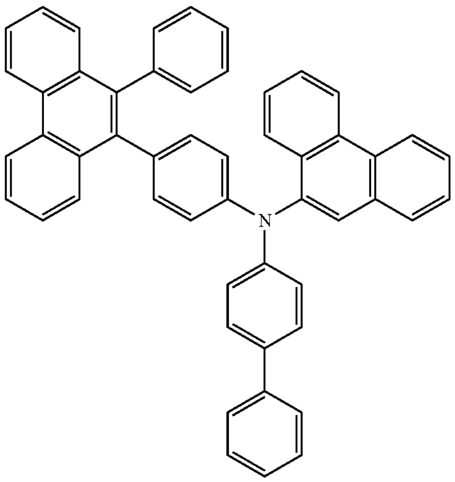
-continued
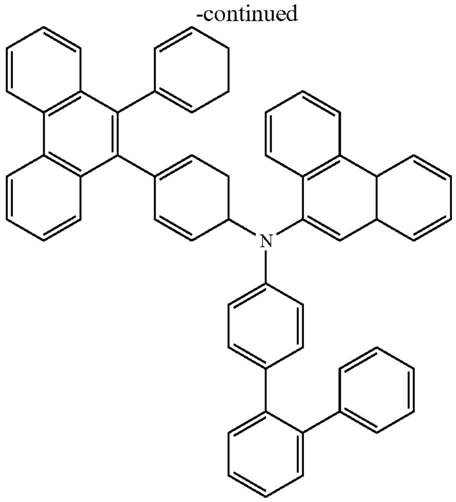
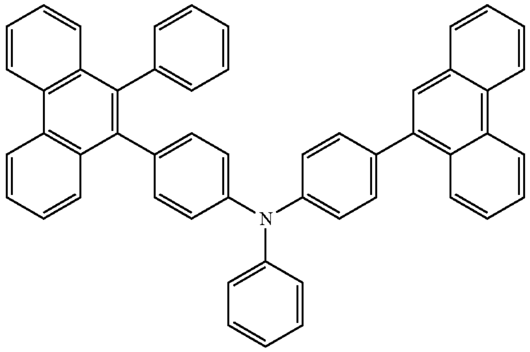
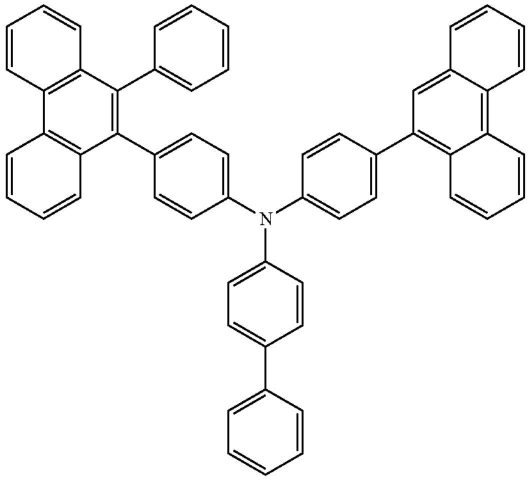
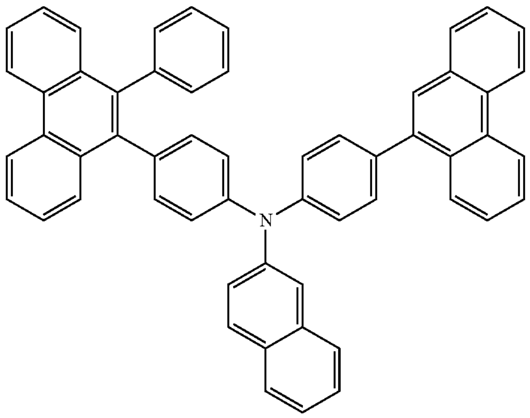

-continued
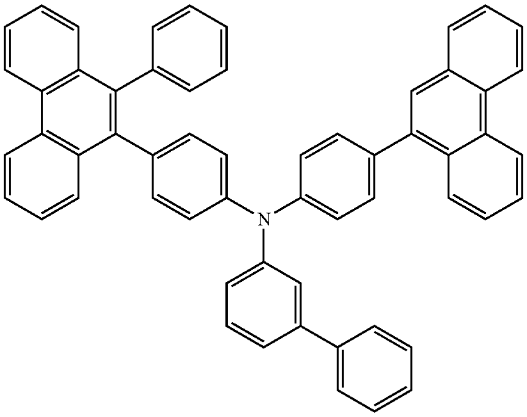
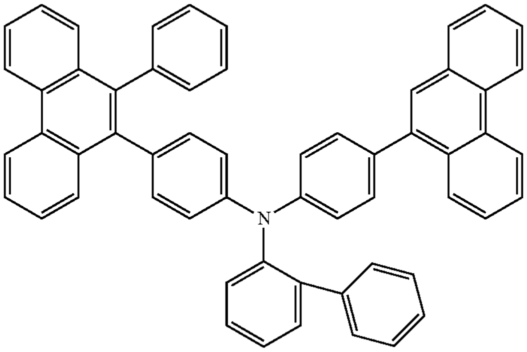
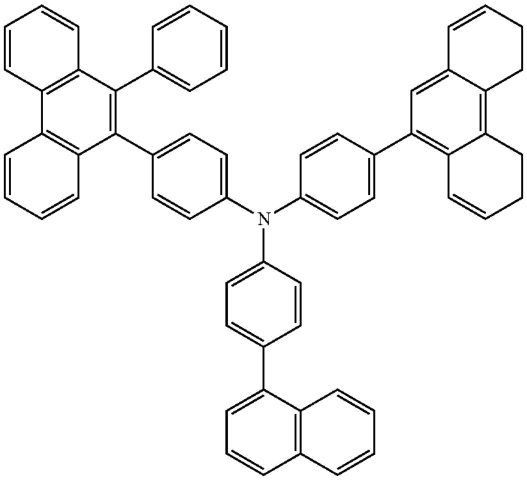
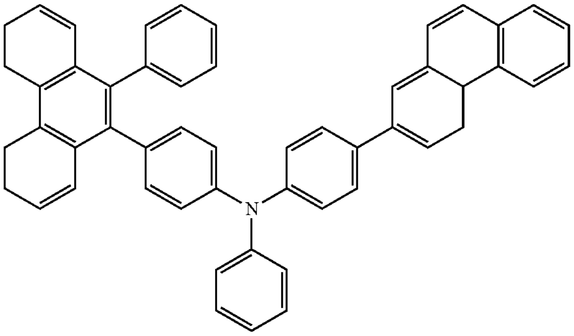
-continued
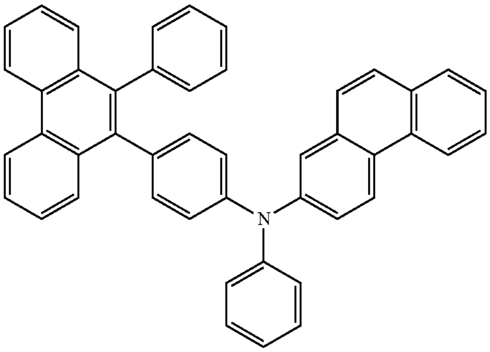
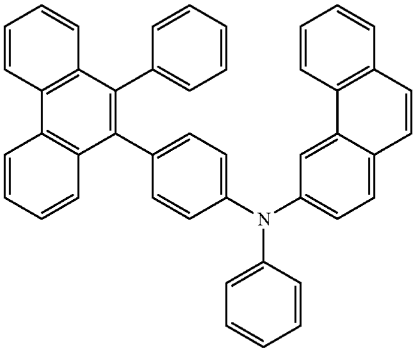
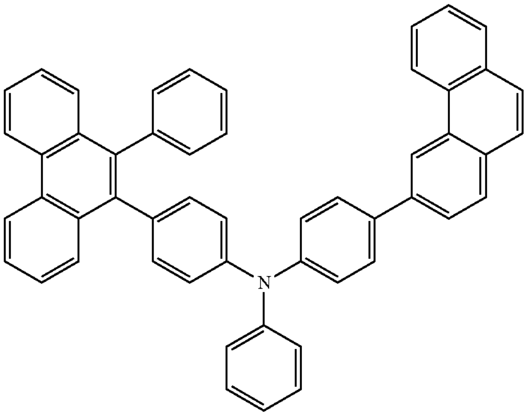
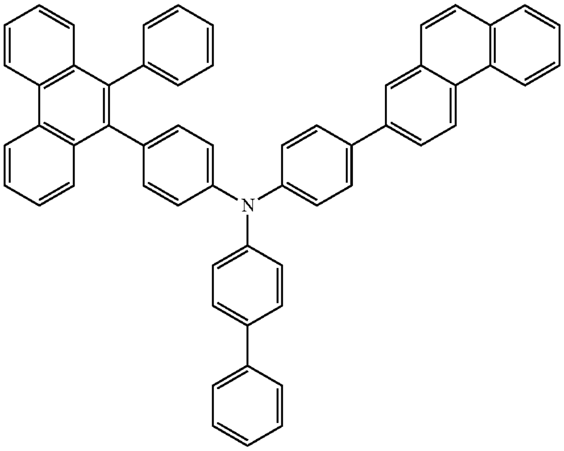

-continued
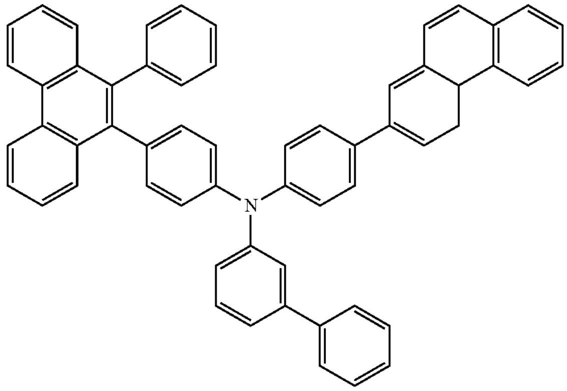
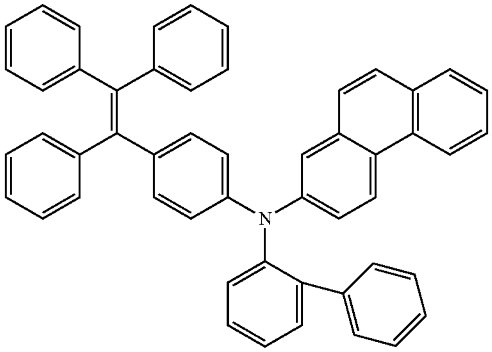
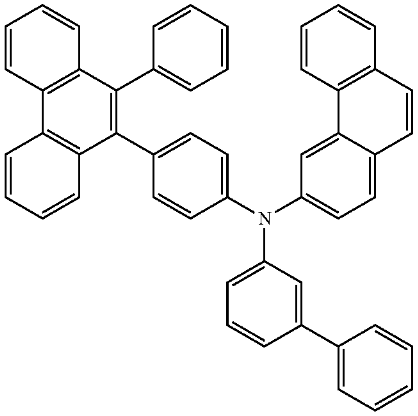
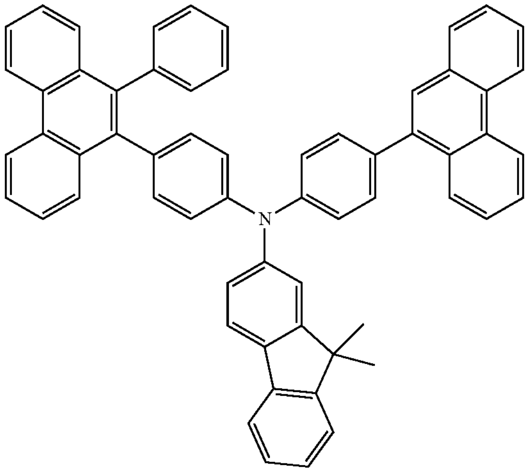
-continued
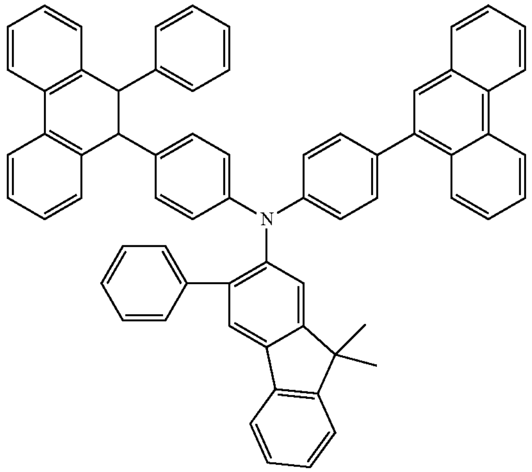
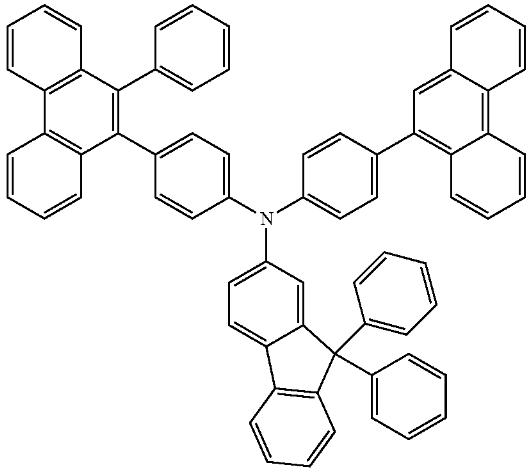
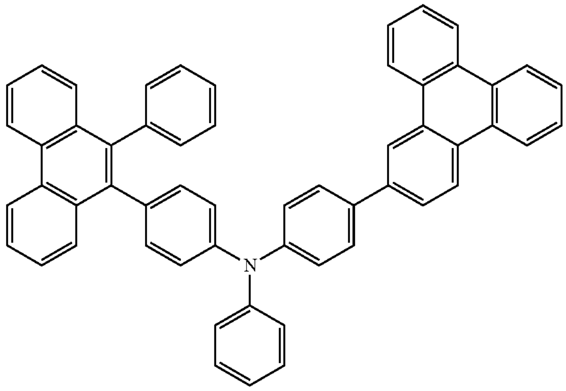
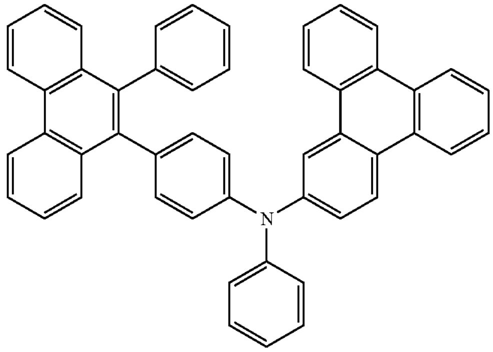

-continued
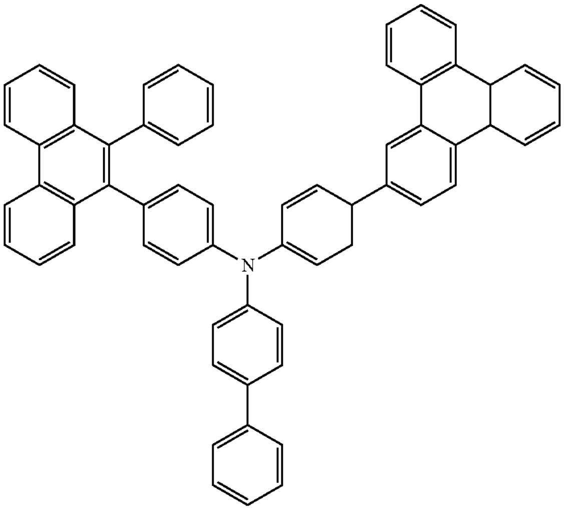
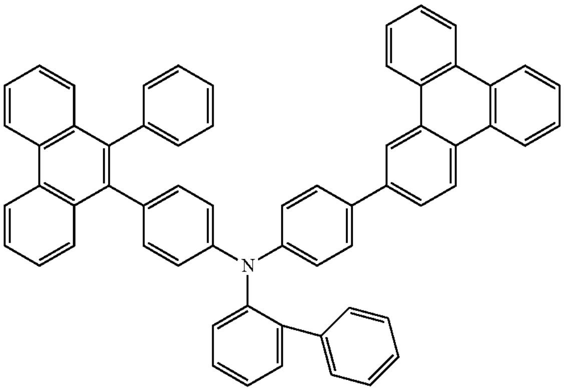
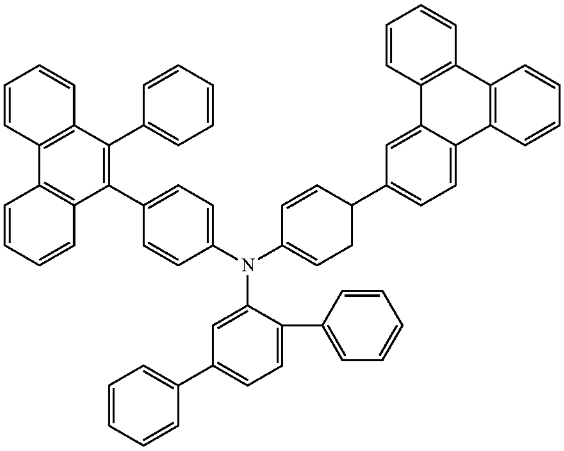
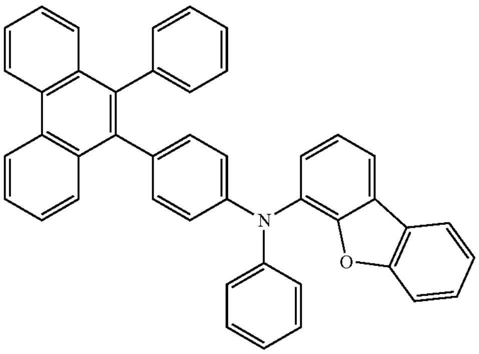
-continued
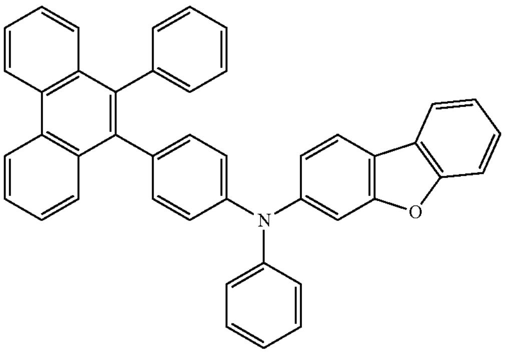
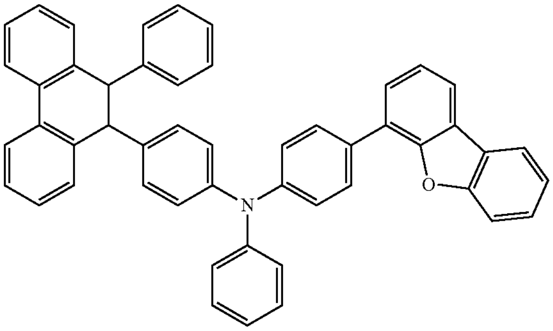
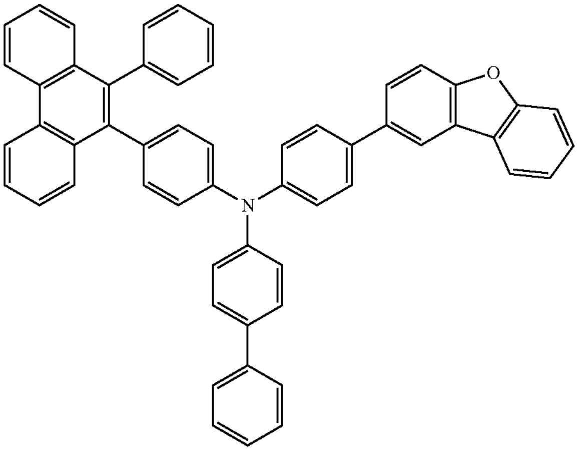
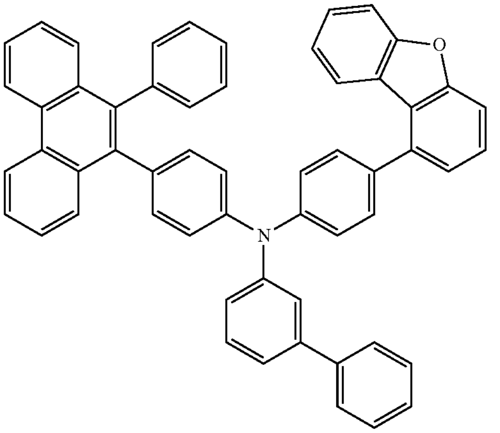

-continued
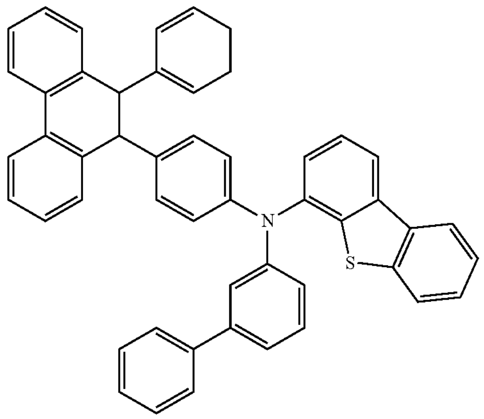
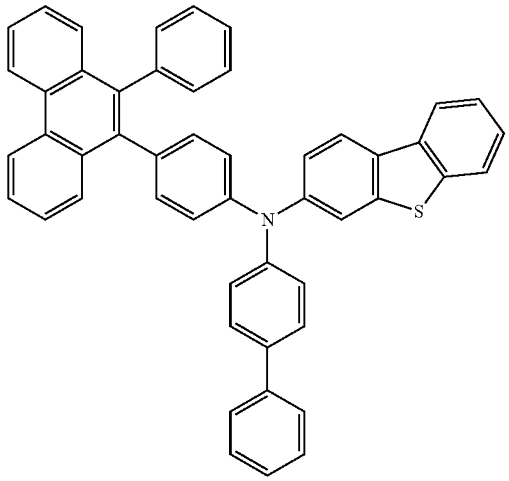
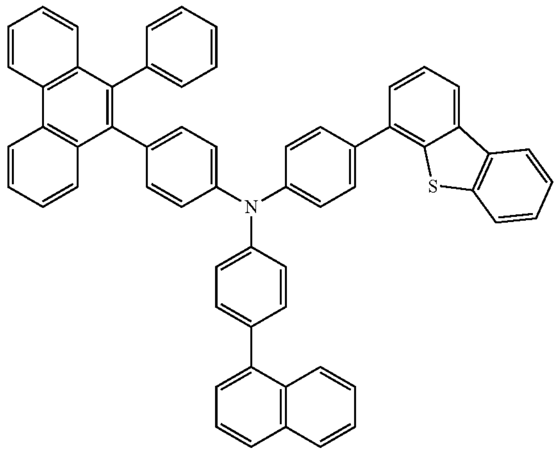
-continued
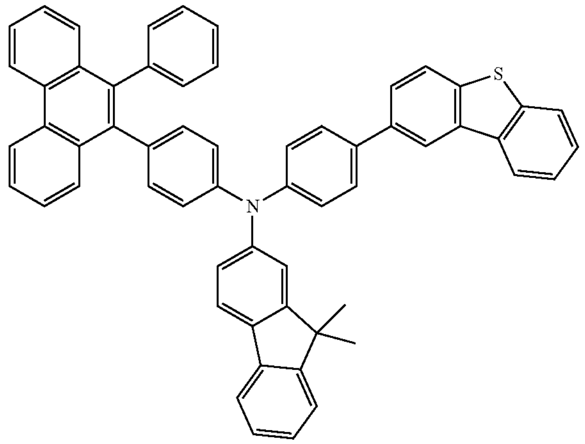
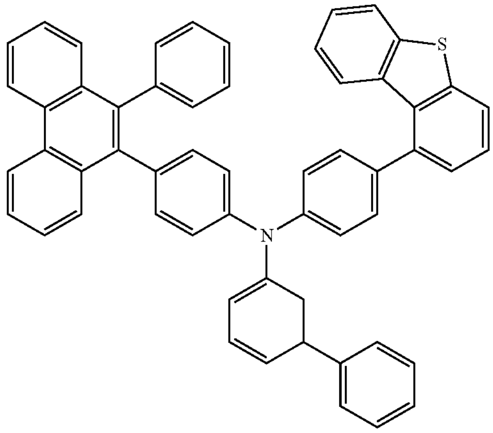
Further, in an exemplary embodiment of the present application, the compound of Formula 2 is selected from the following compounds:
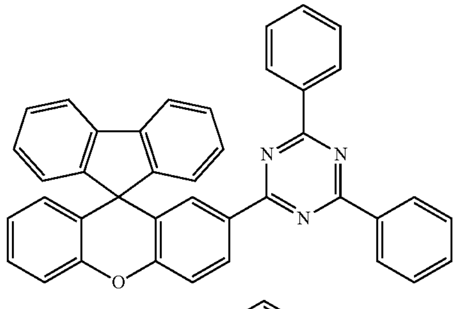
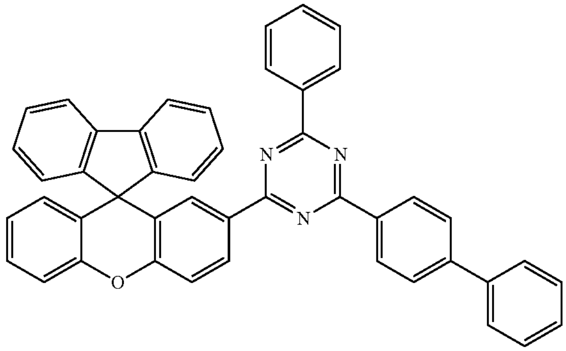

-continued
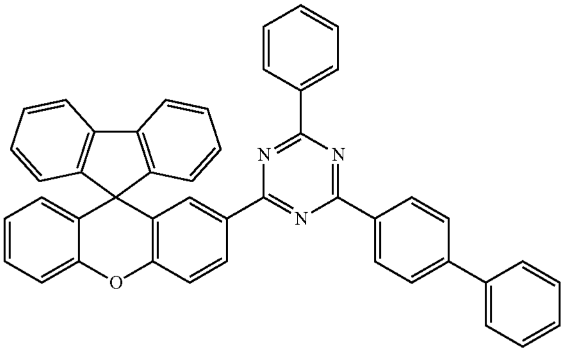
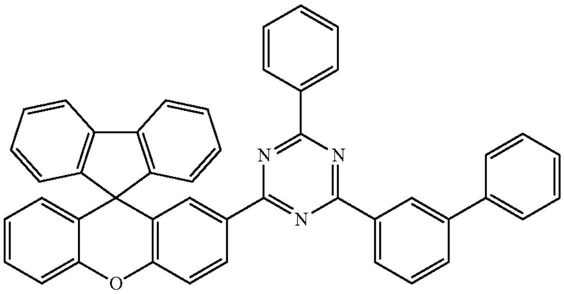
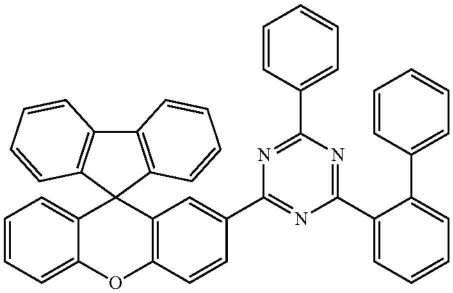
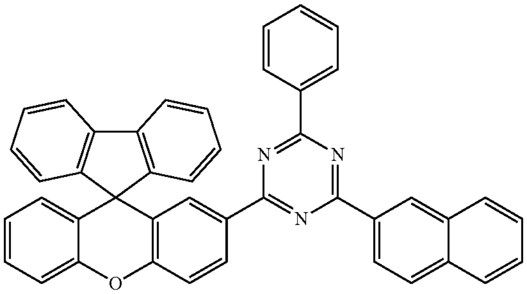
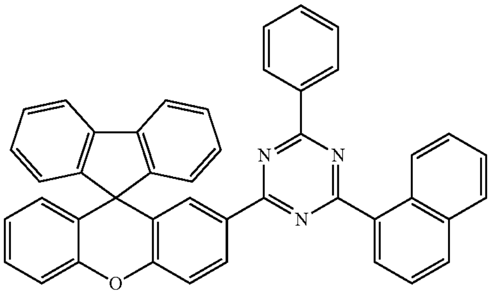
-continued
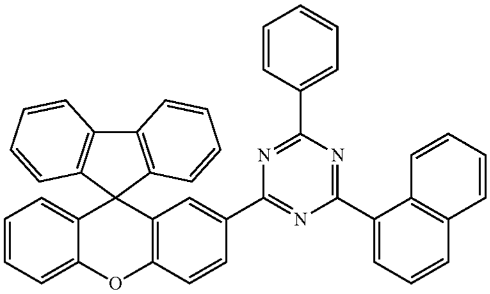
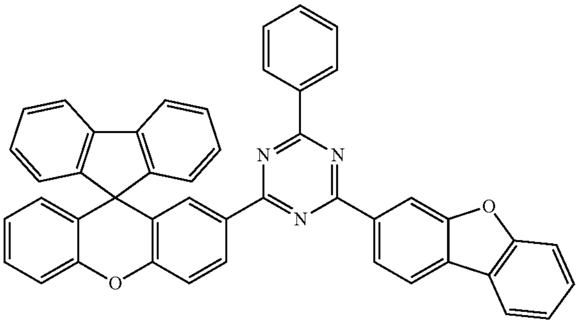
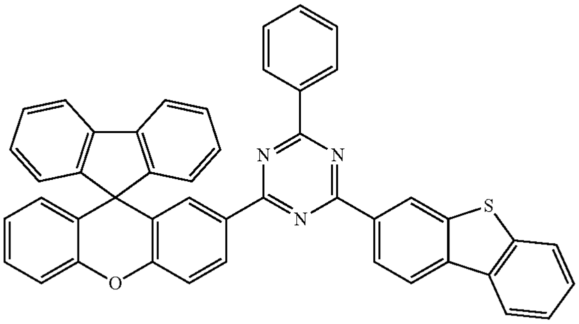
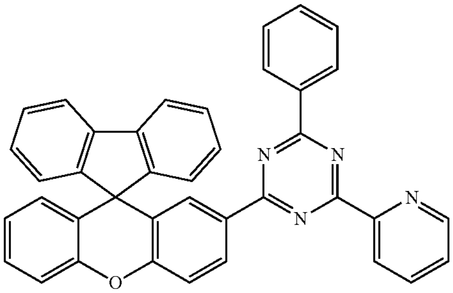
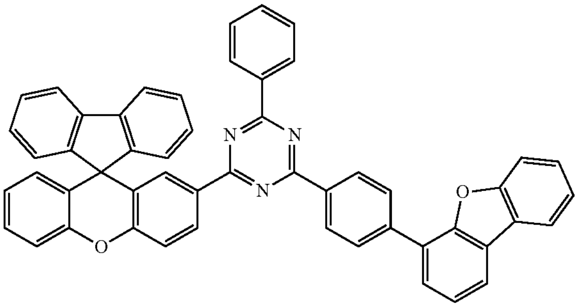

-continued
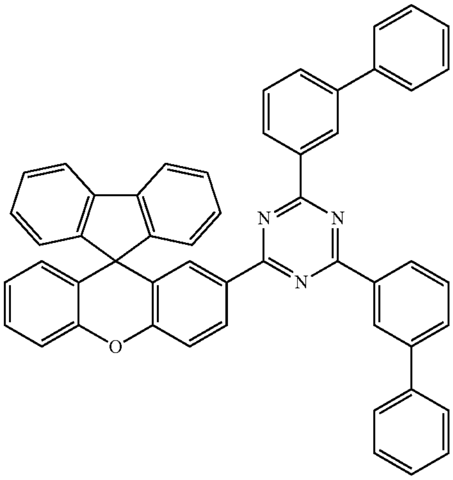
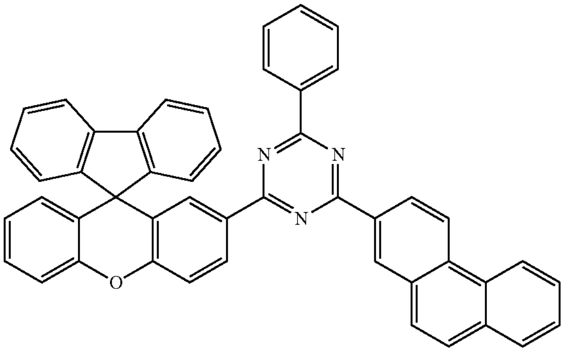
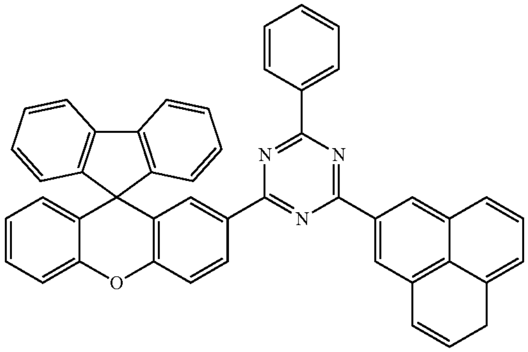
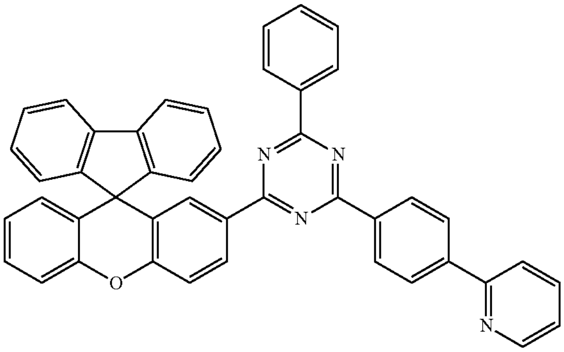
-continued
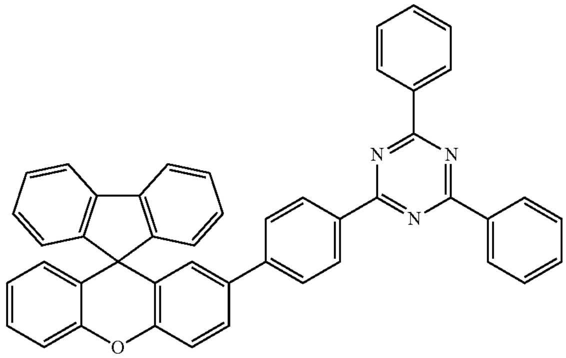
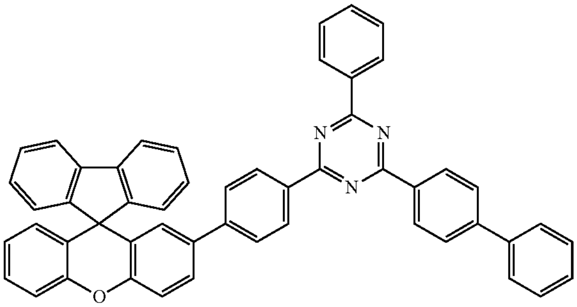
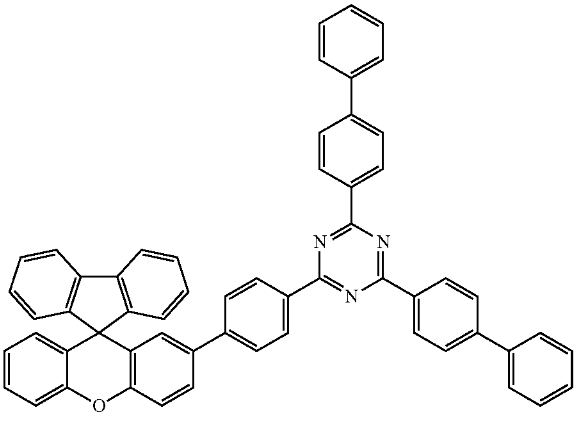
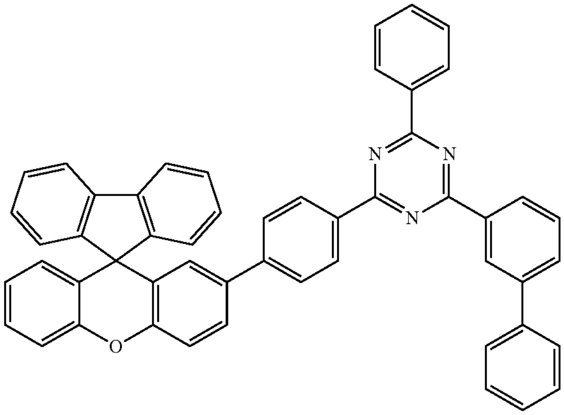

-continued
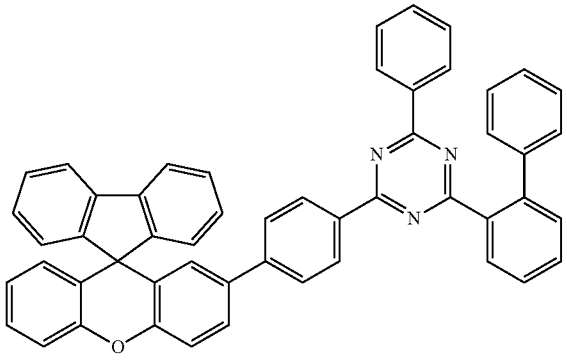
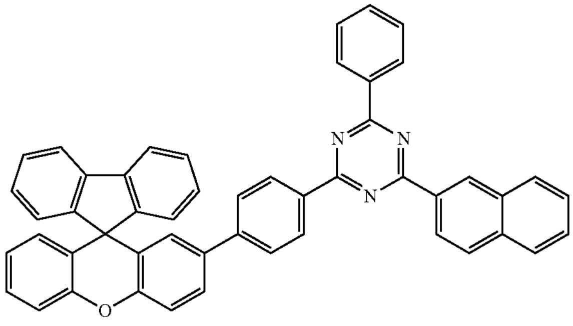
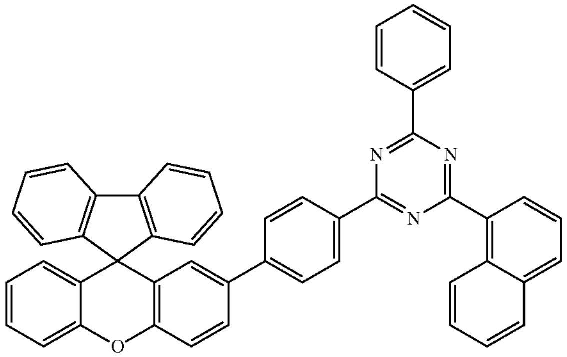
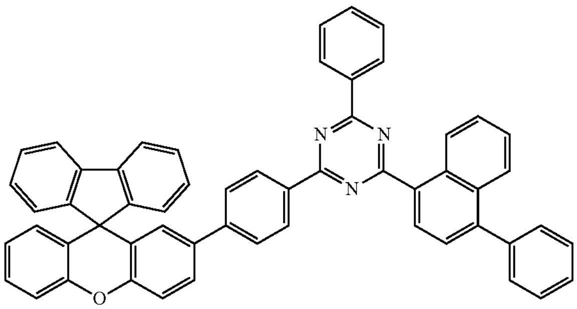
-continued
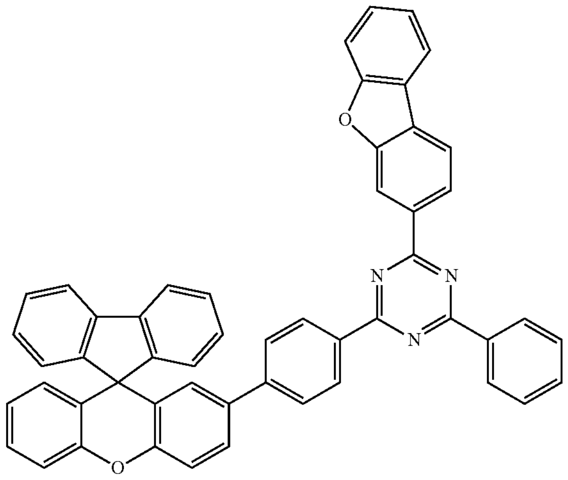
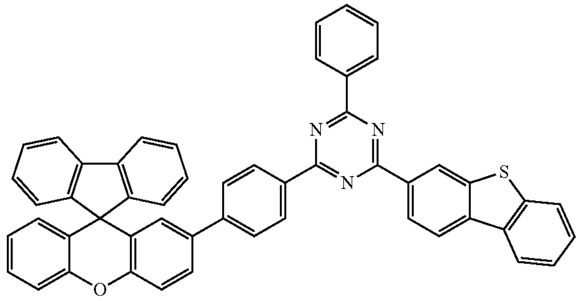
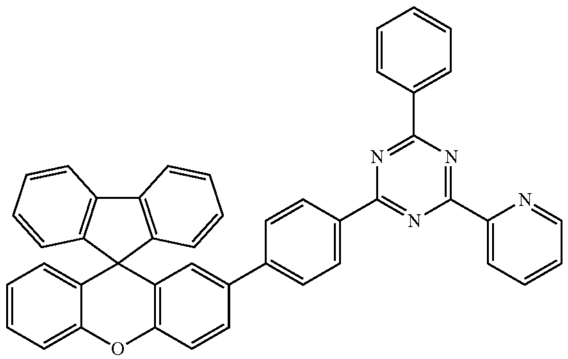
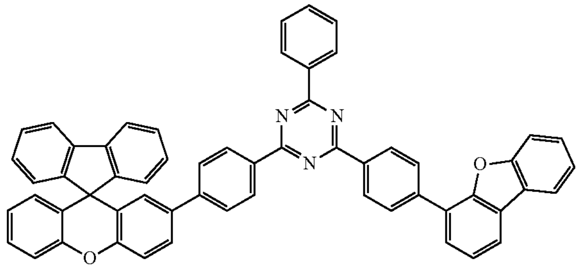

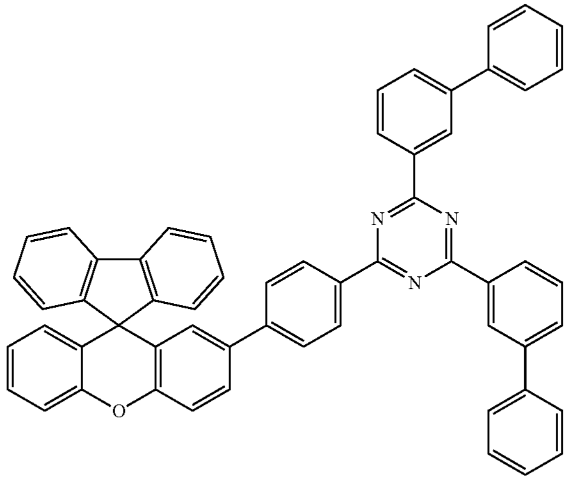
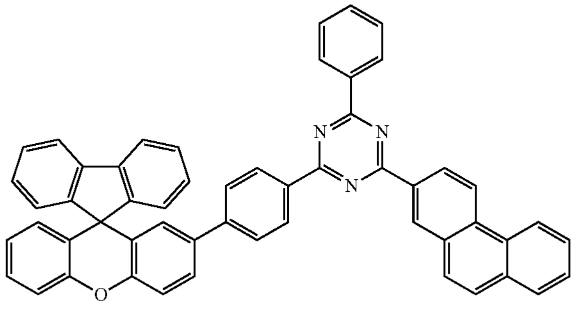
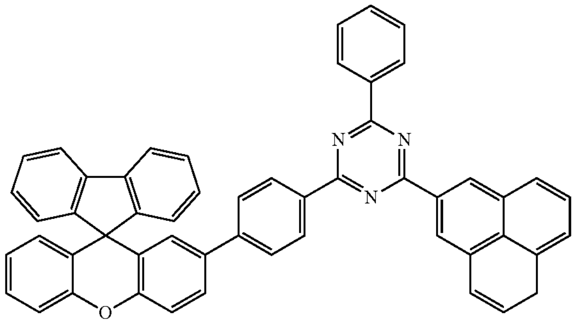
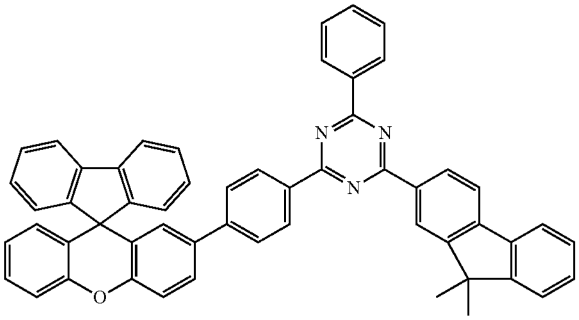
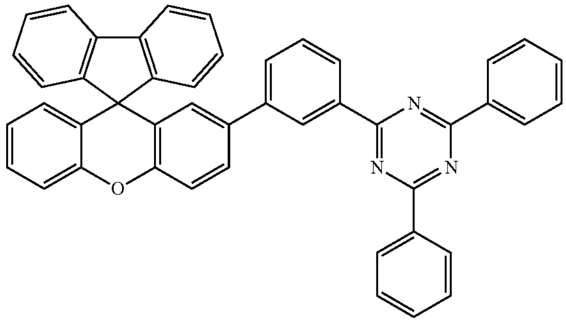
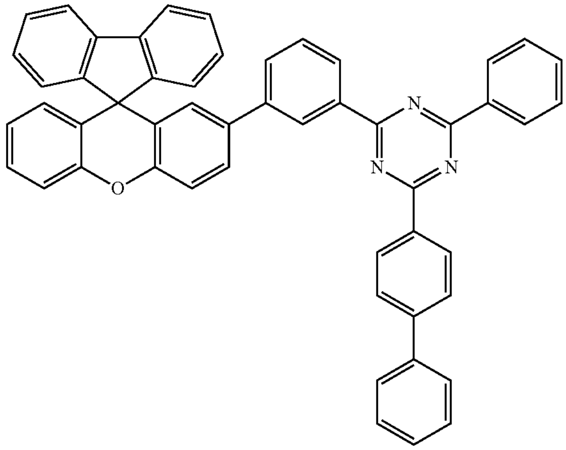
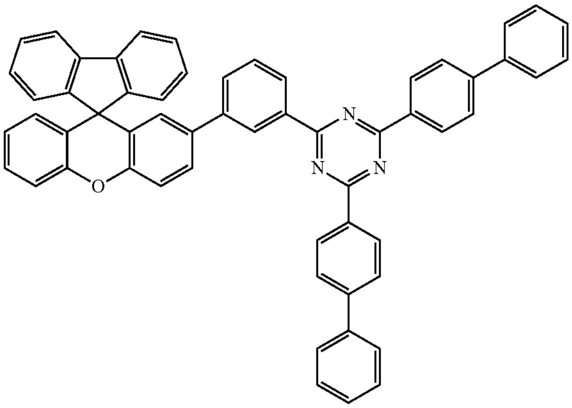
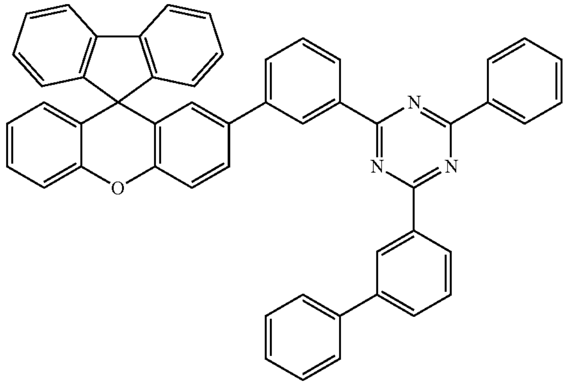

-continued
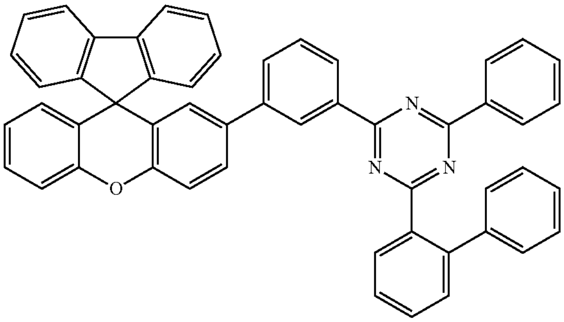
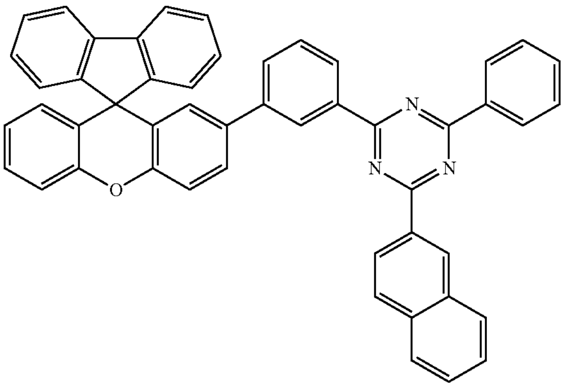
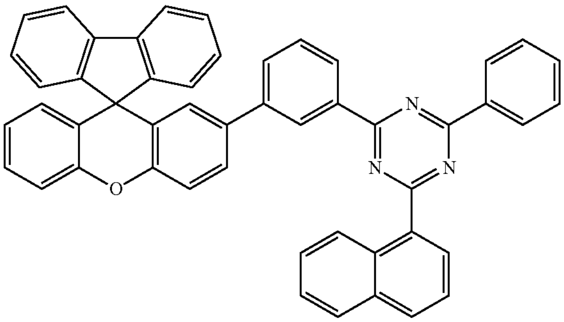
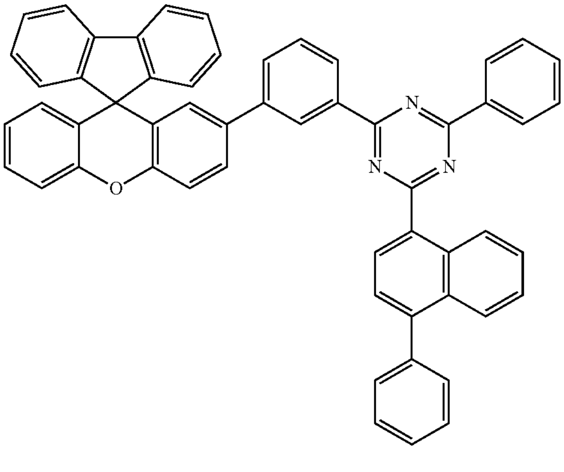
-continued
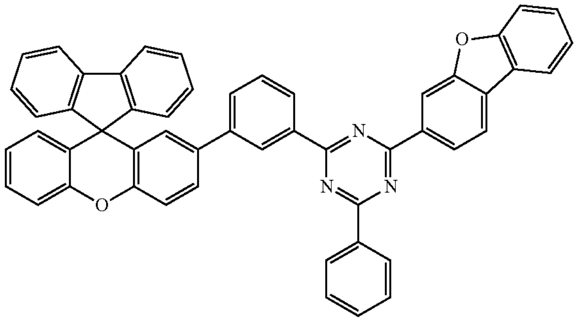
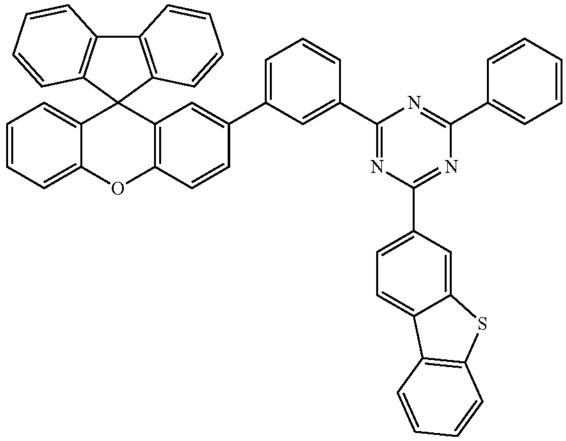
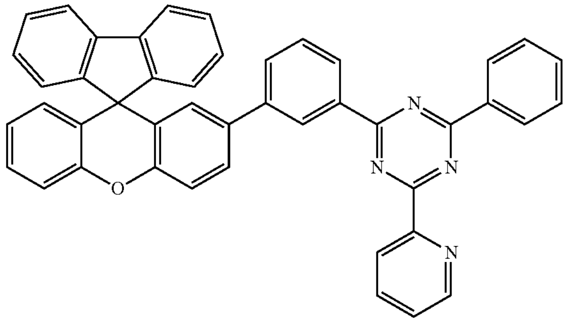
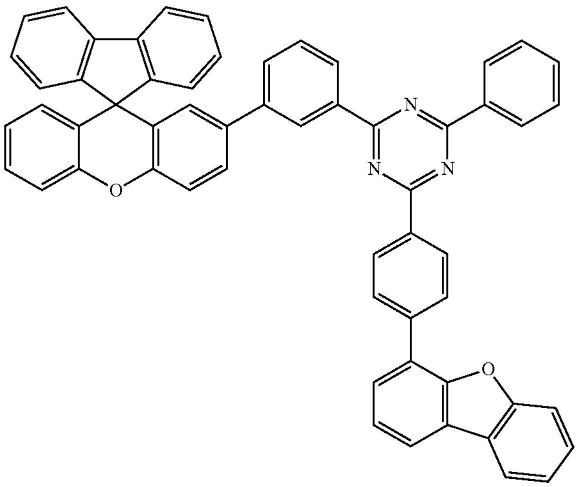

-continued
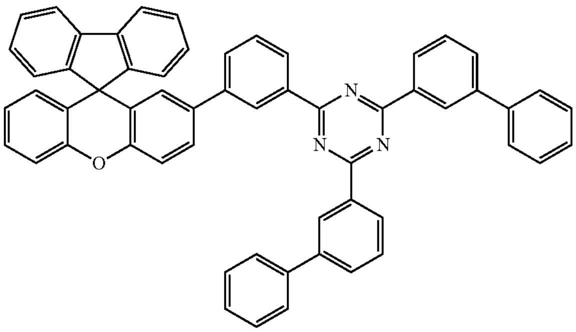
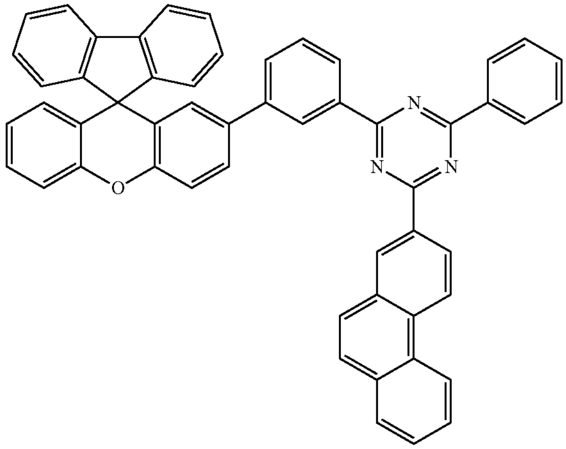
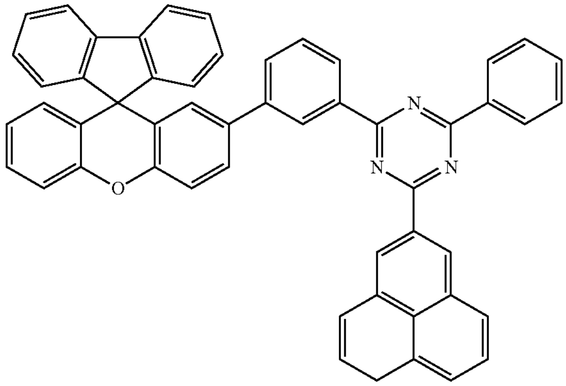
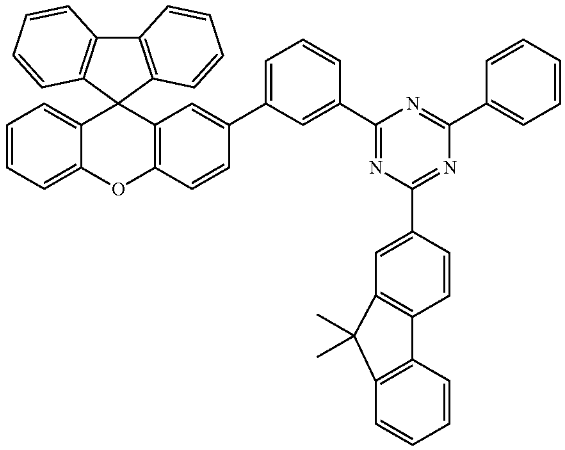
-continued
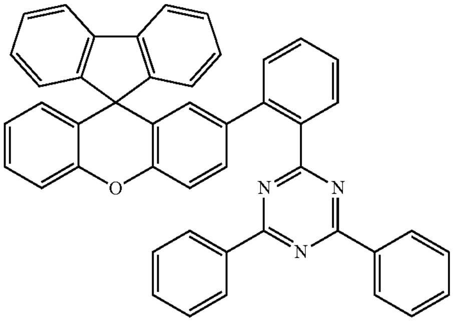
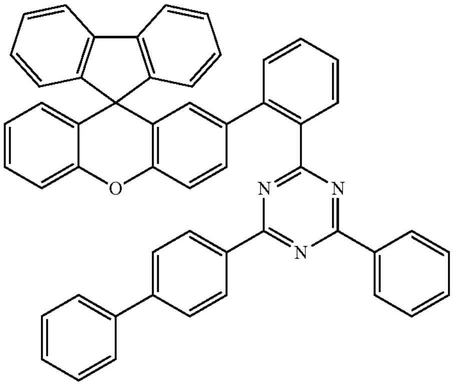
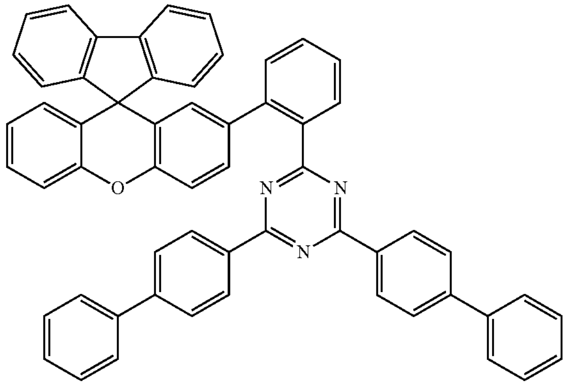
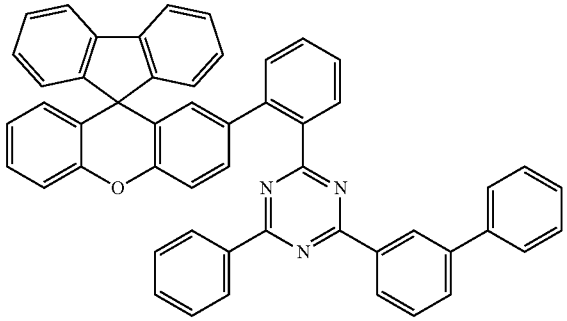

-continued
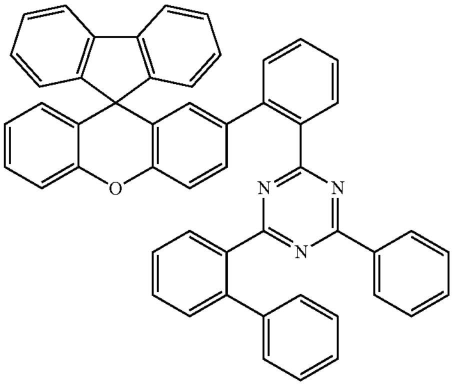
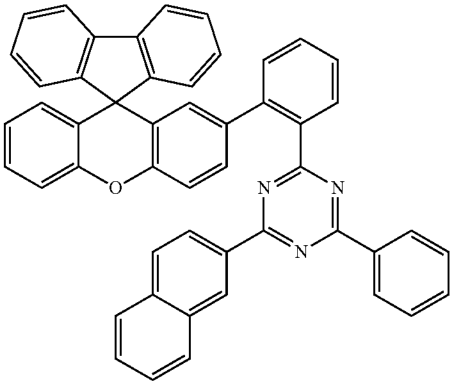
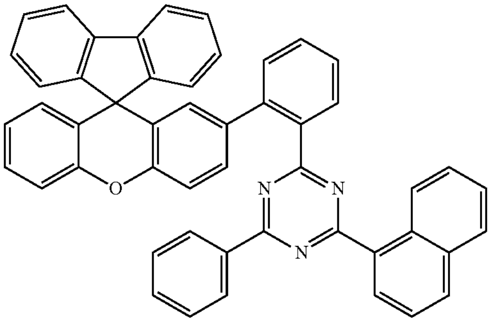
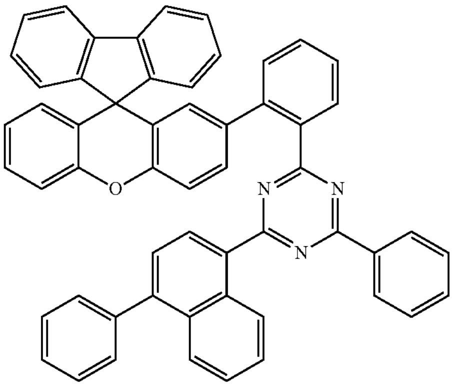
-continued
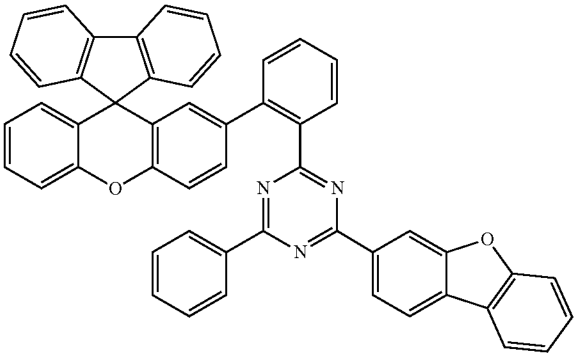
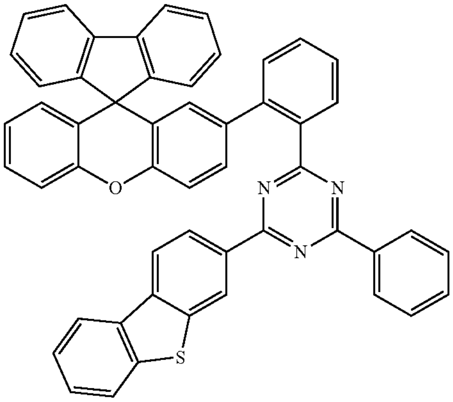
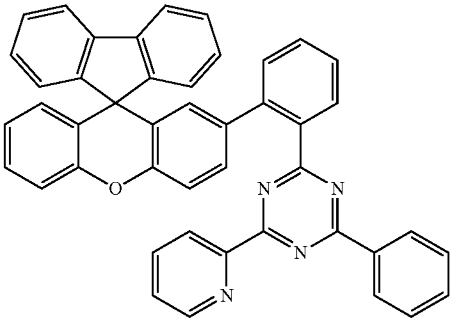
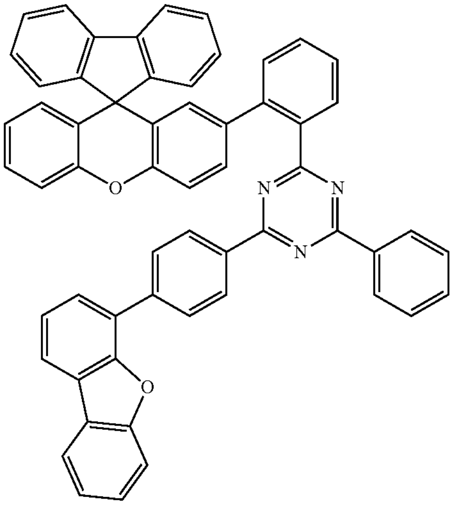

-continued
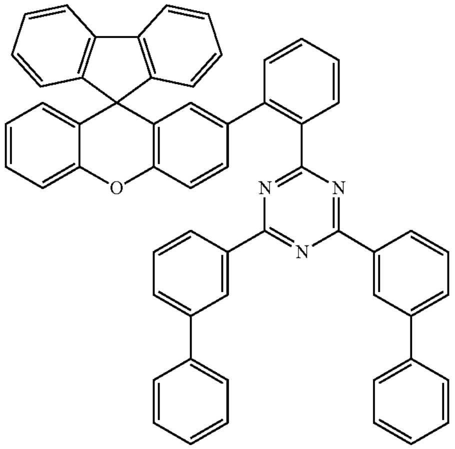
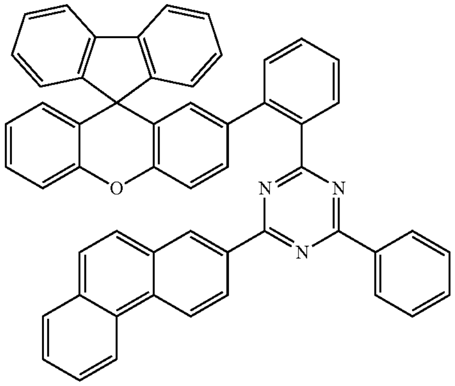
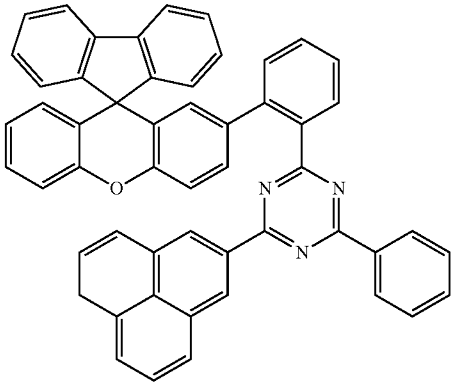
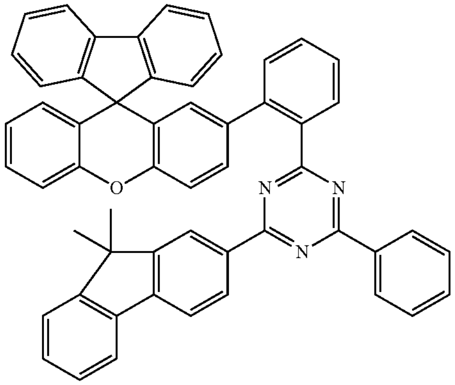
-continued
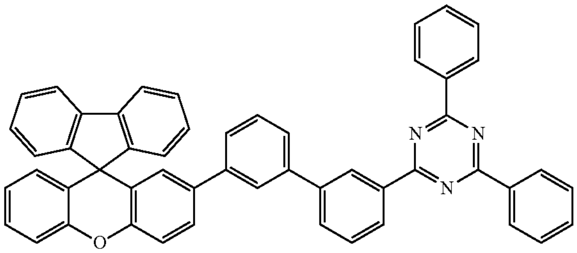
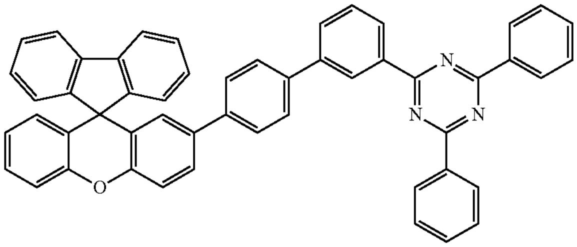
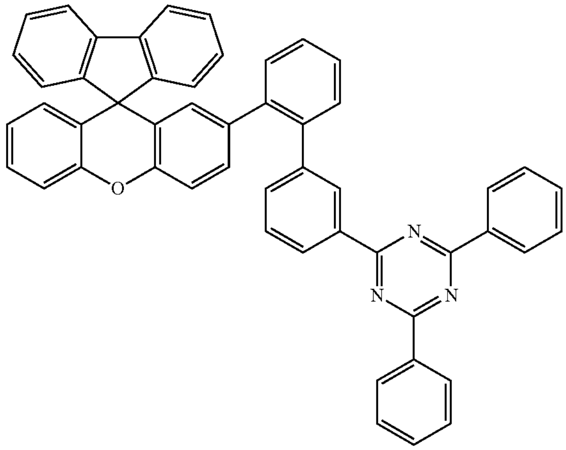
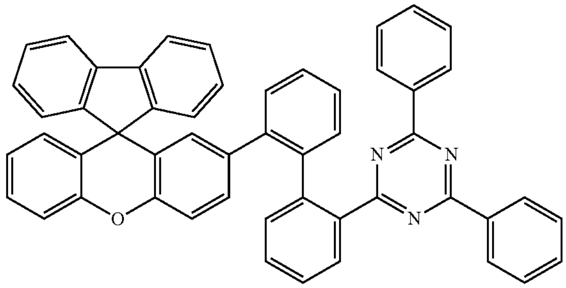

-continued
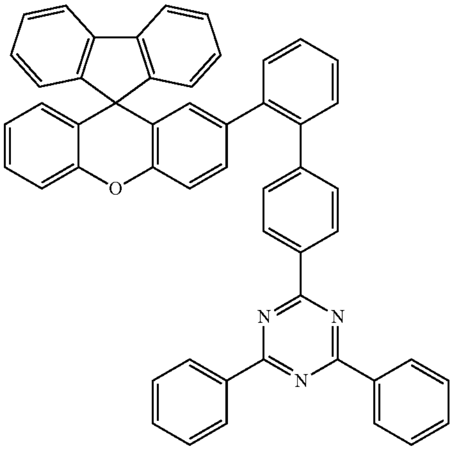
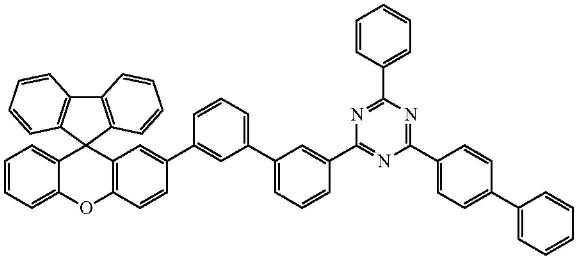
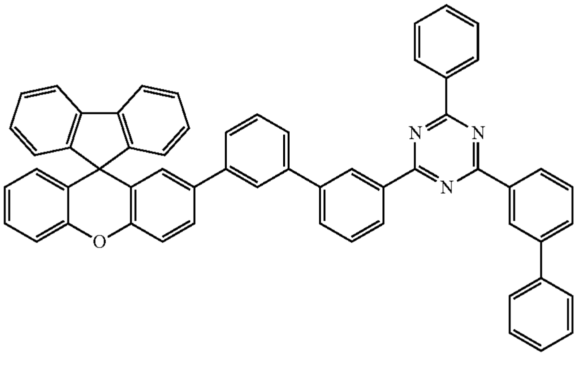
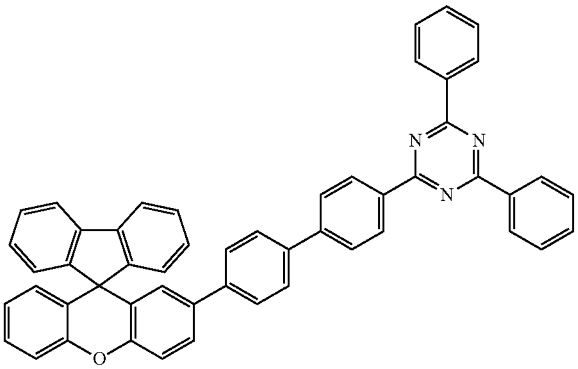
-continued
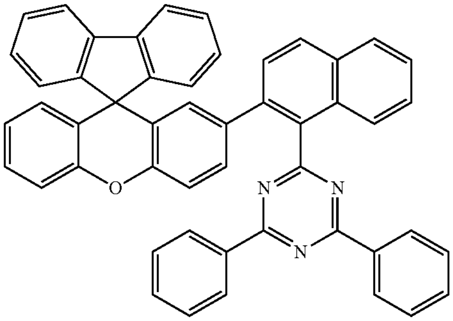
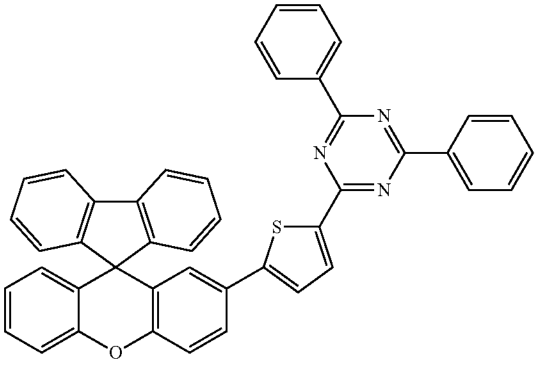
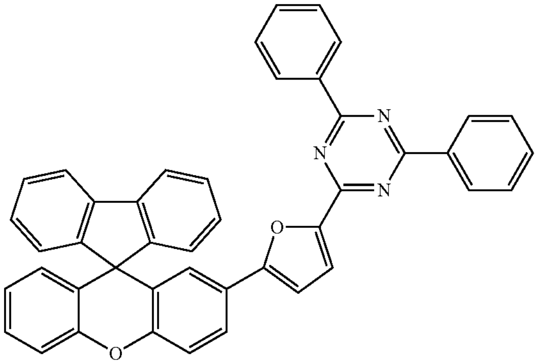
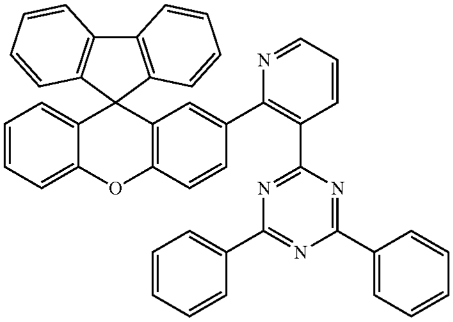
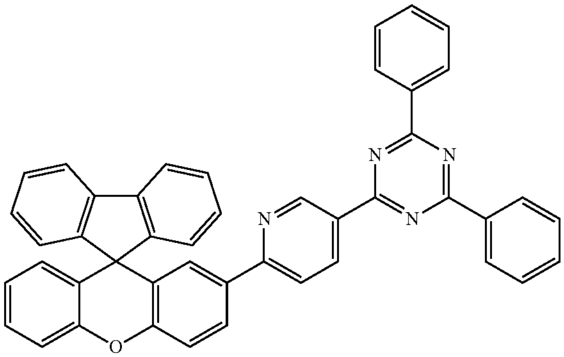

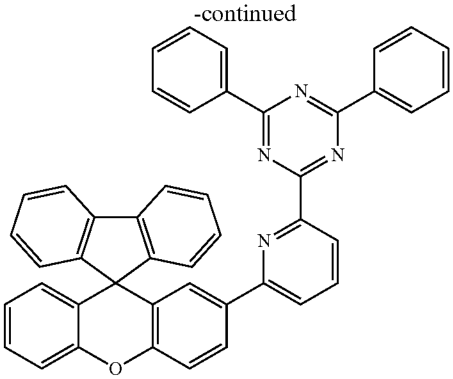
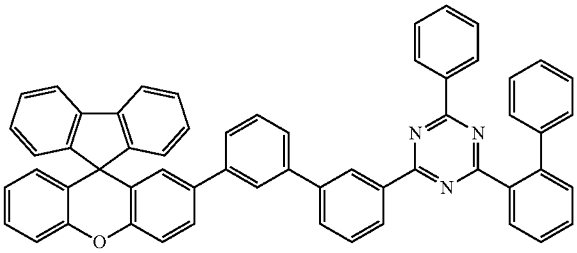
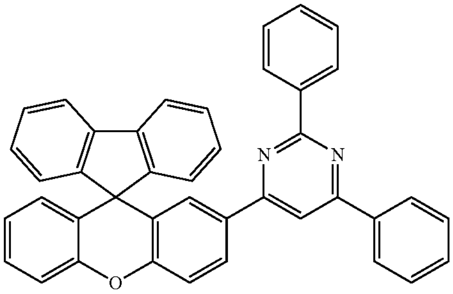
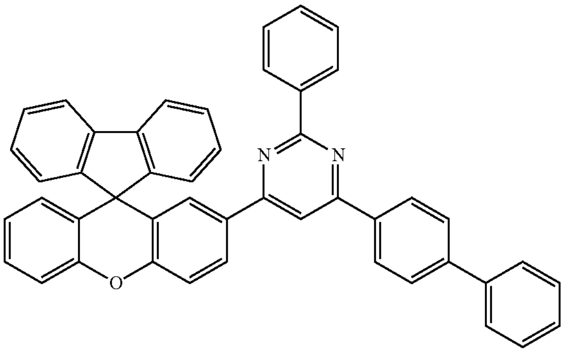
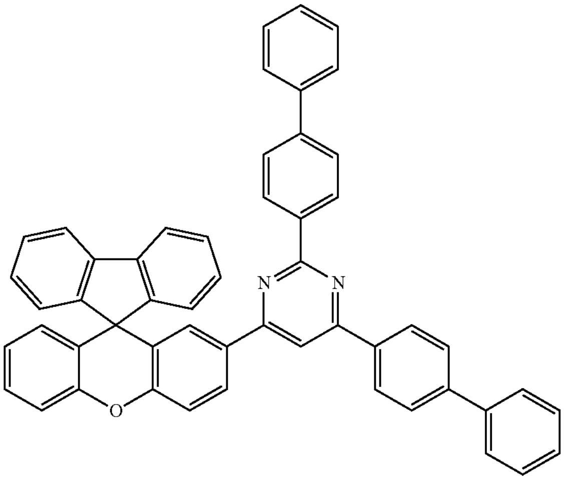
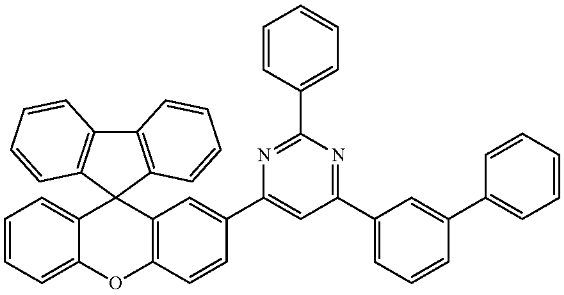
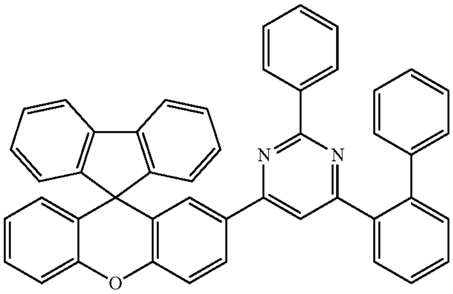
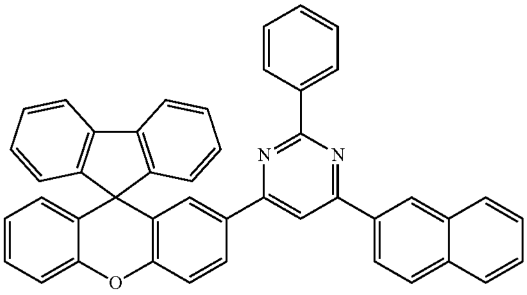
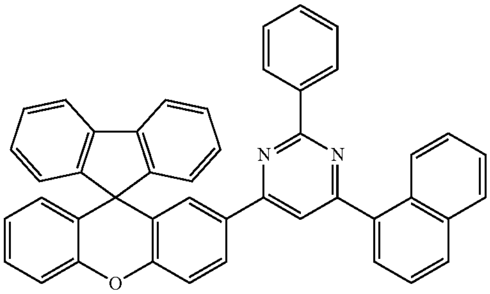
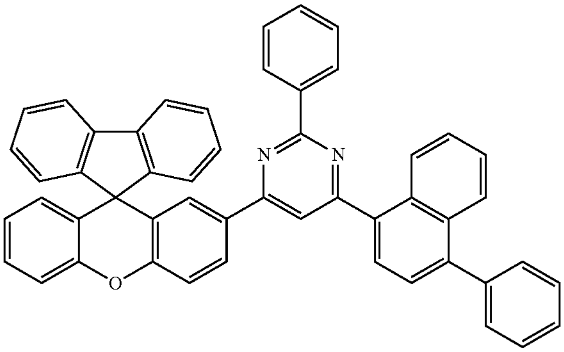

-continued
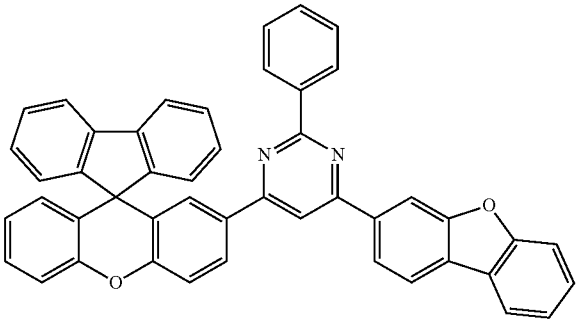
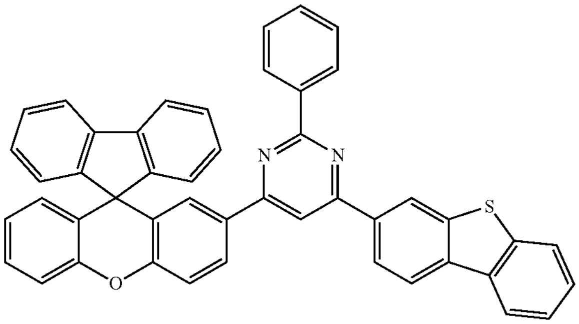
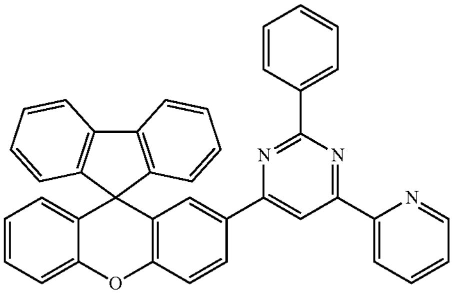
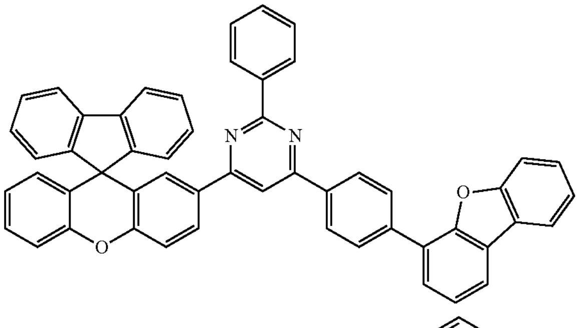
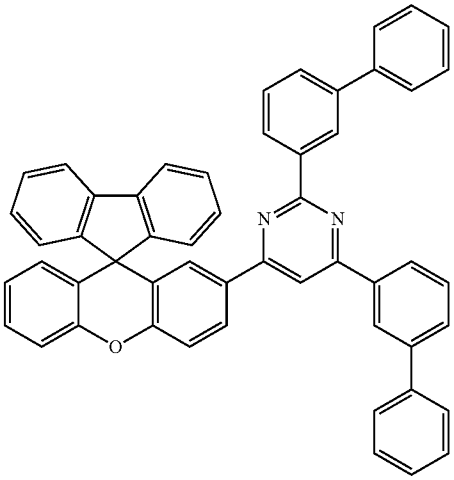
-continued
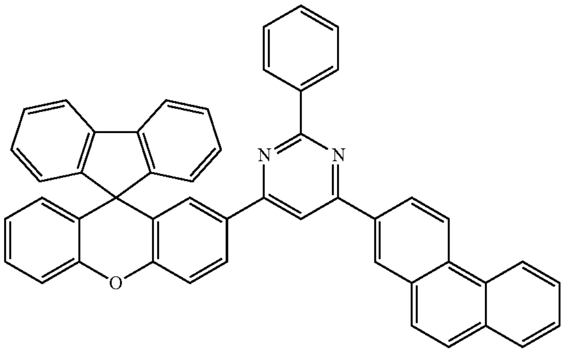
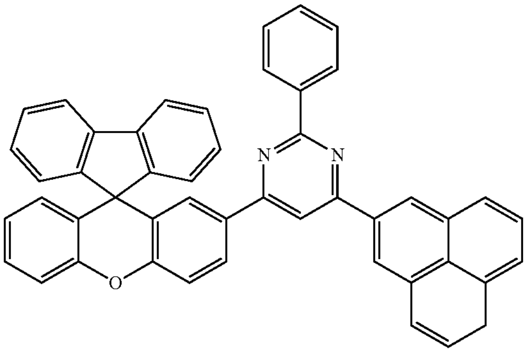
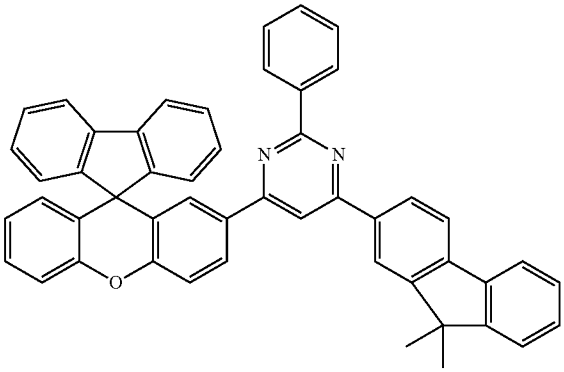
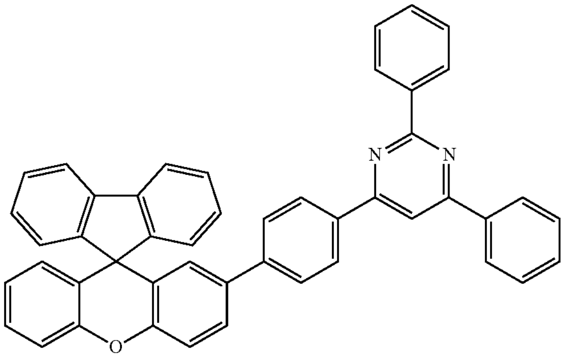

-continued
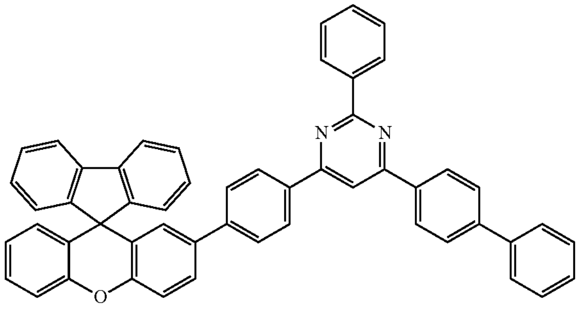
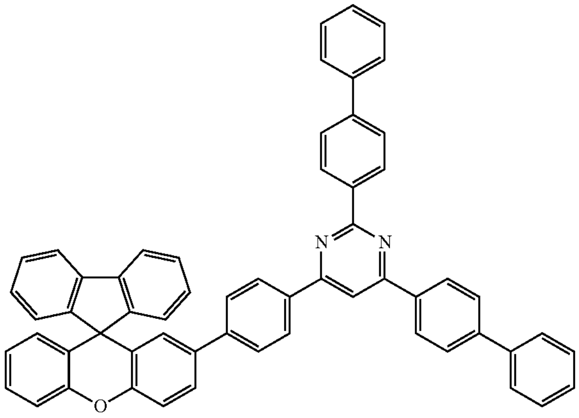
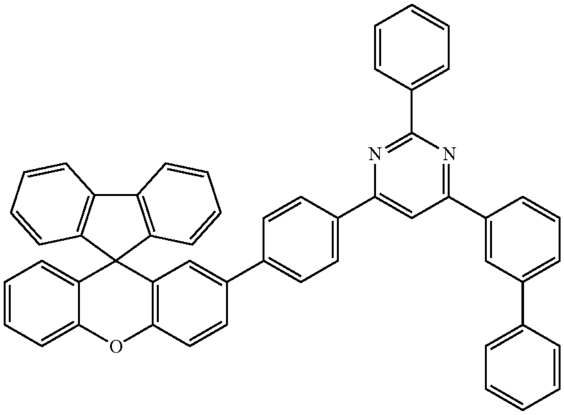
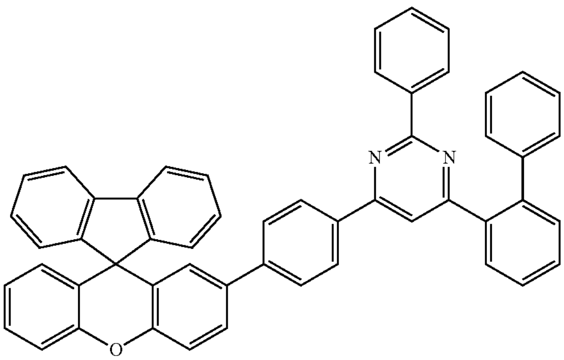
-continued
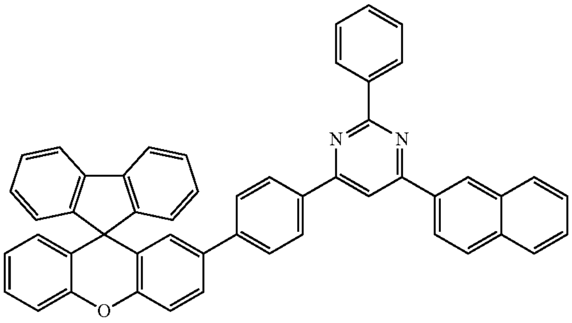
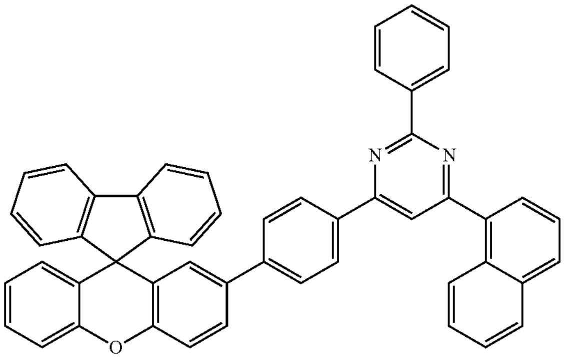
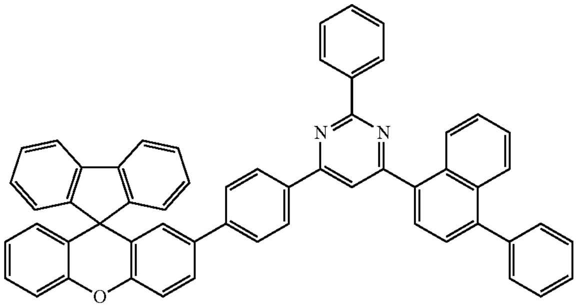
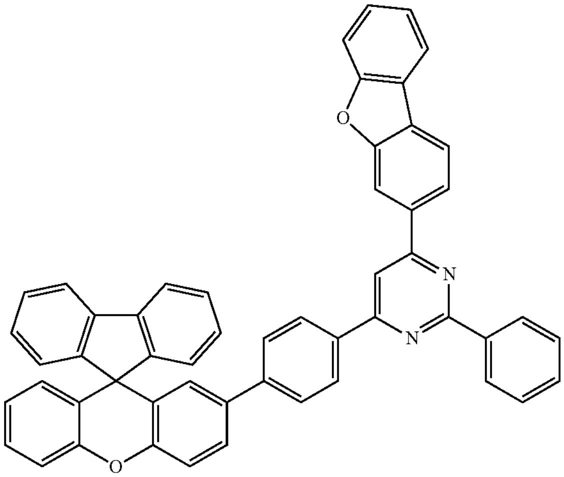

-continued
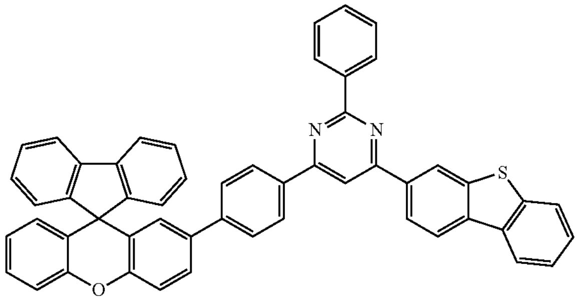
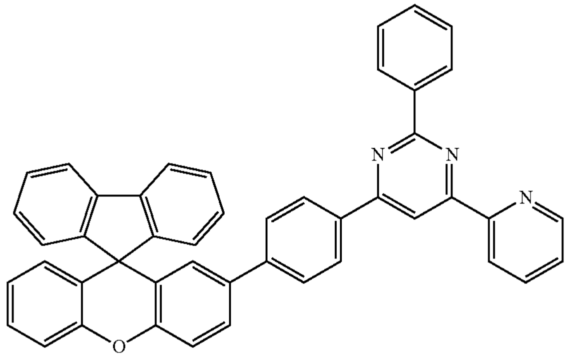
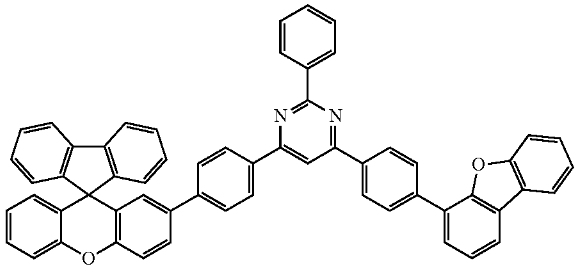
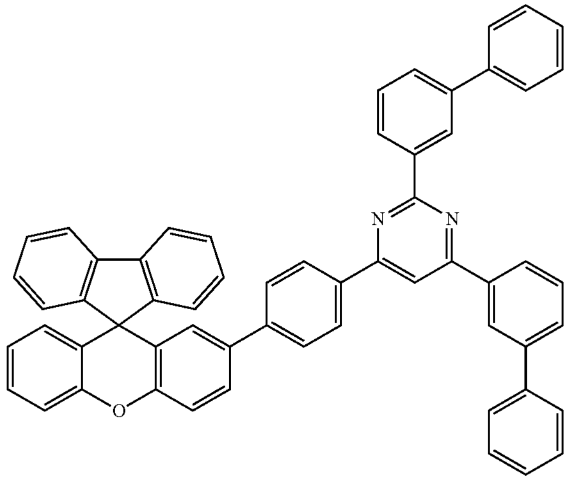
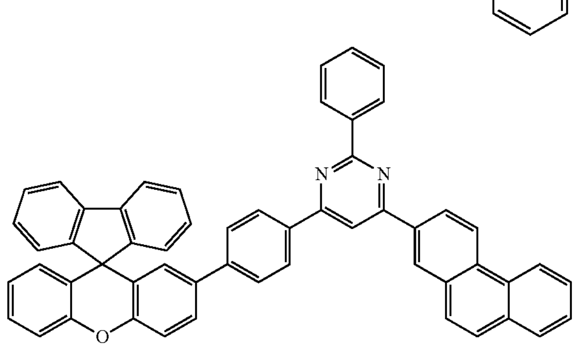
-continued
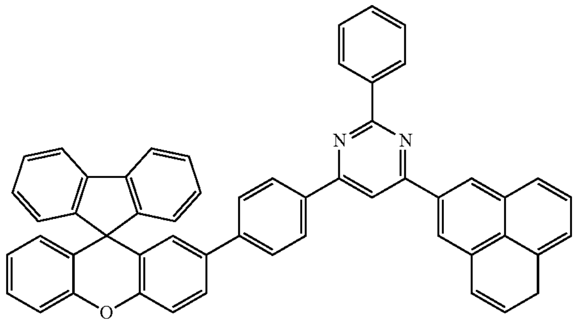
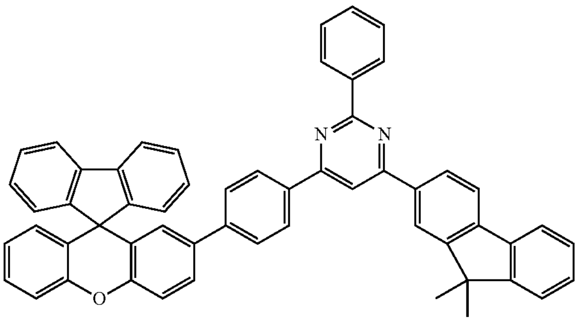
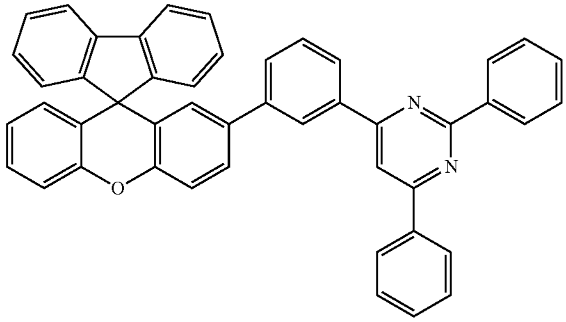
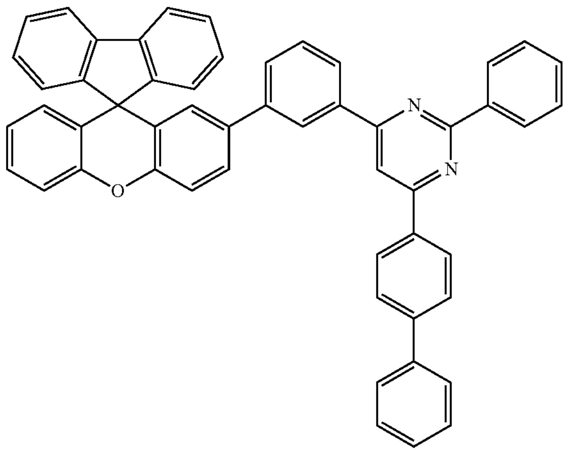

-continued
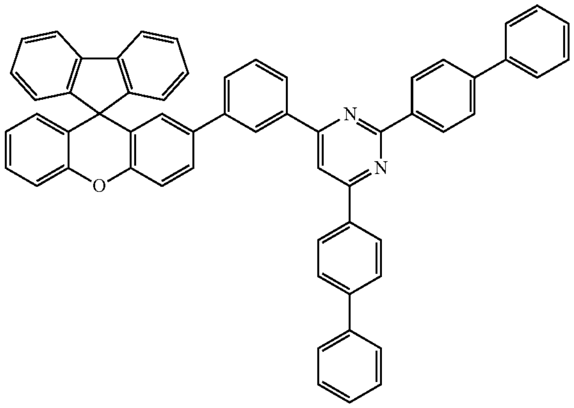
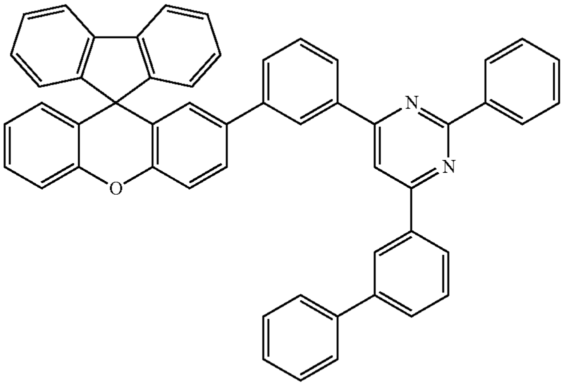
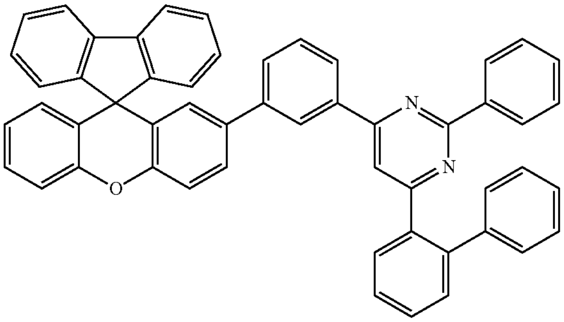
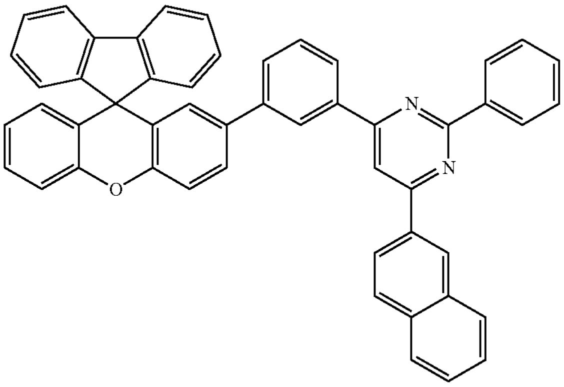
-continued
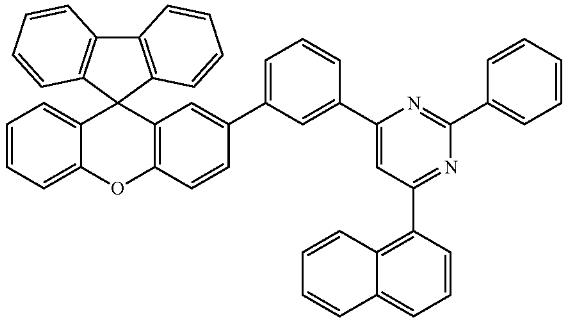
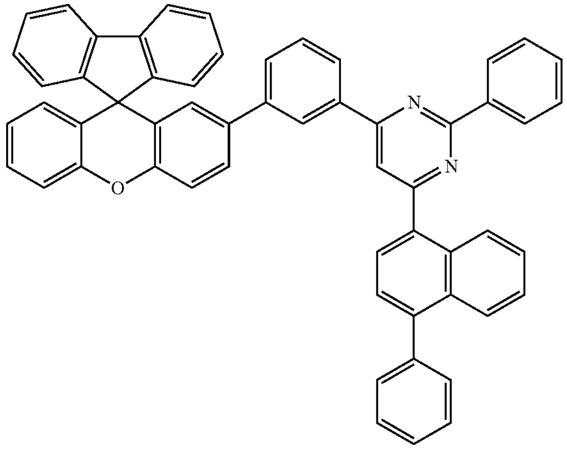
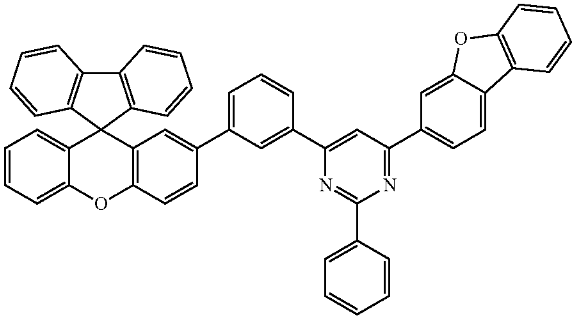
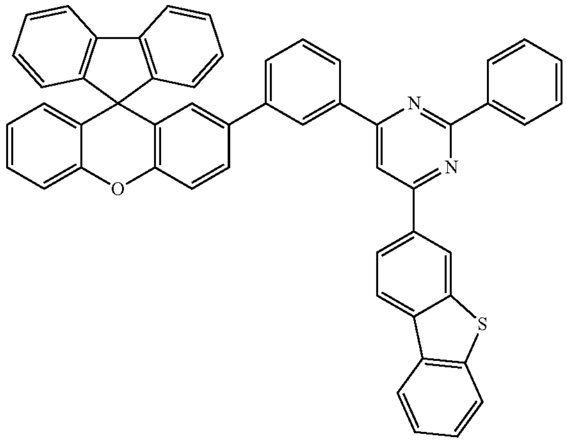

-continued
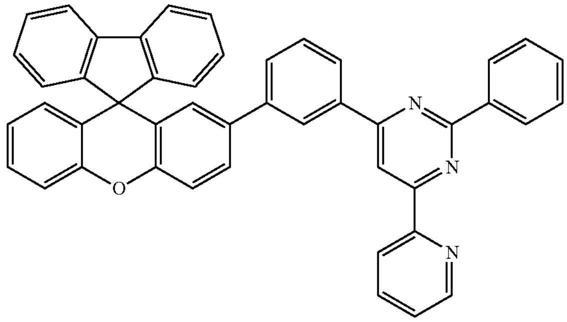
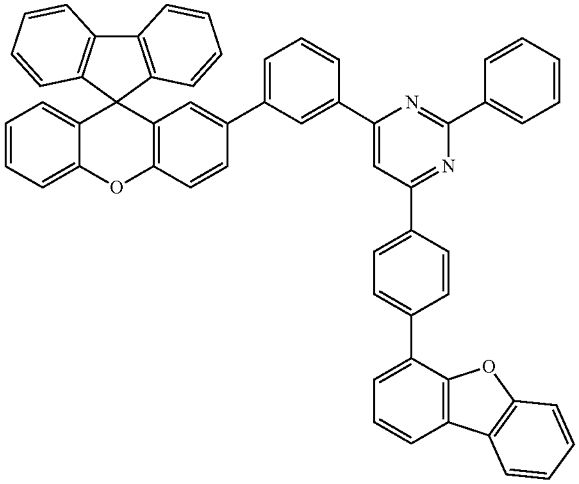
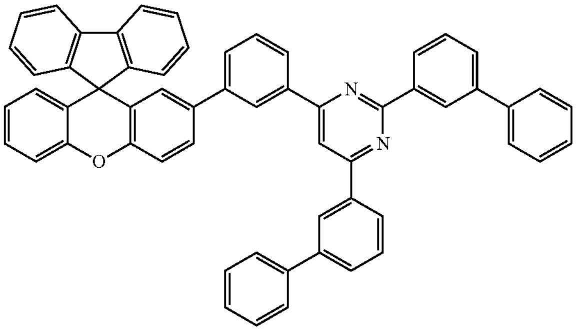
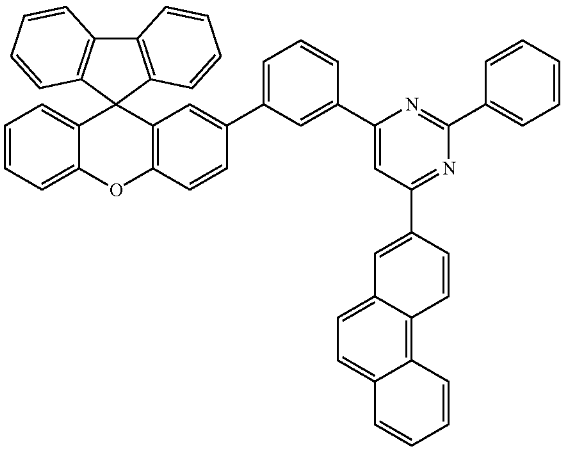
-continued
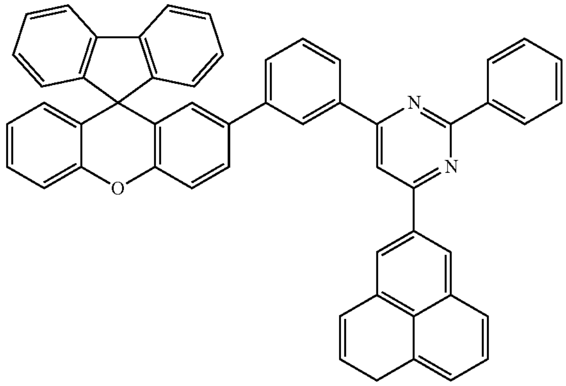
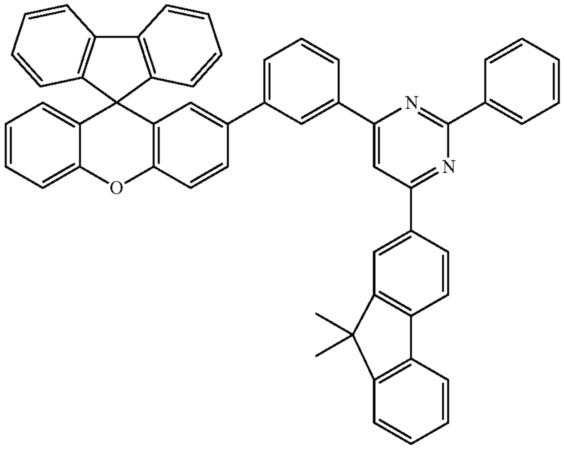
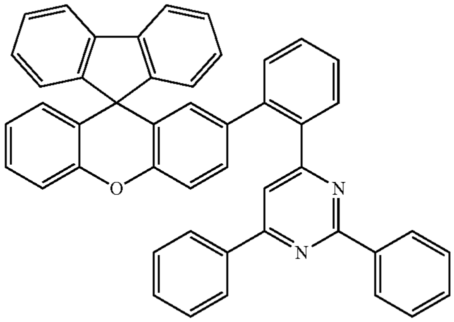
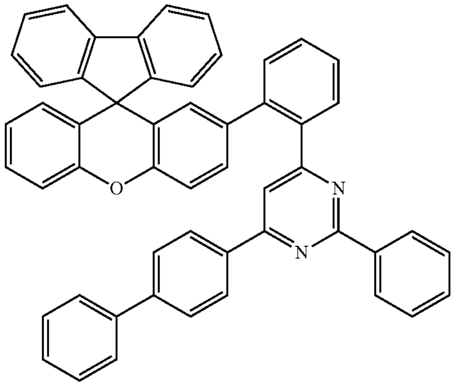

-continued
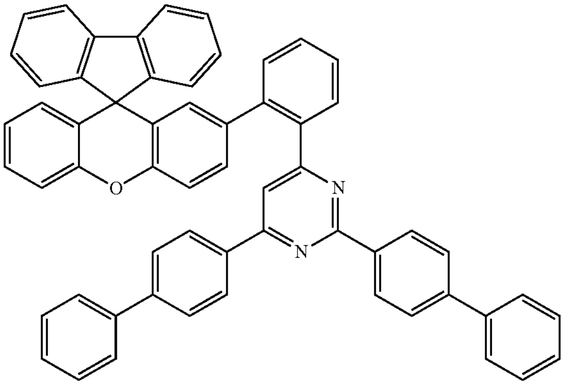
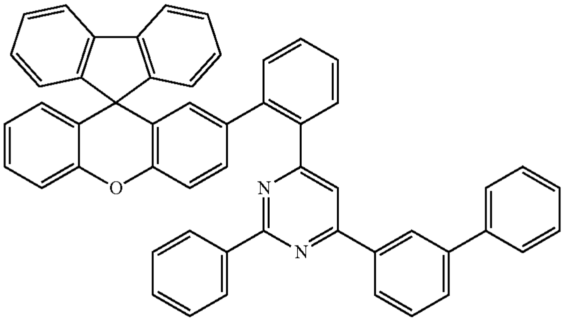
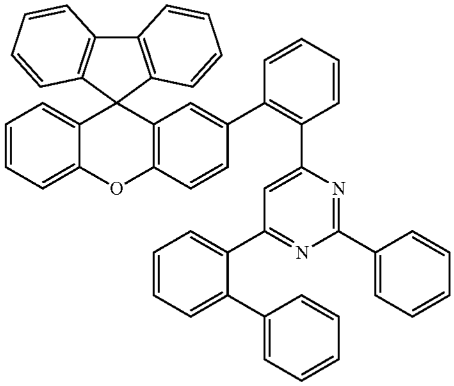
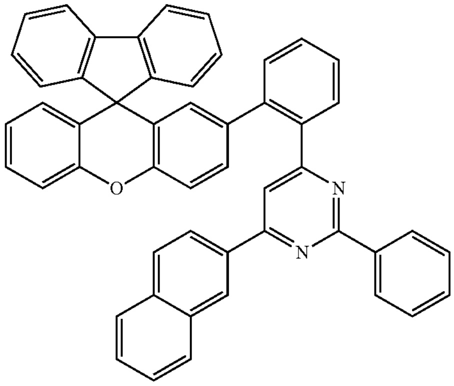
-continued
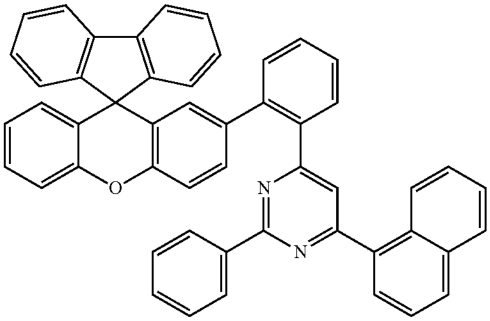
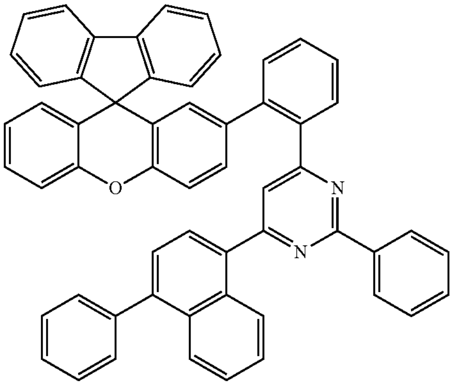
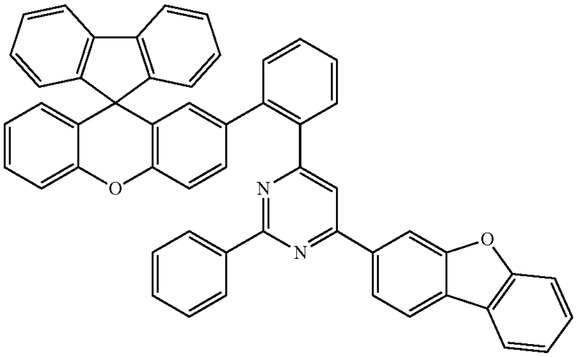
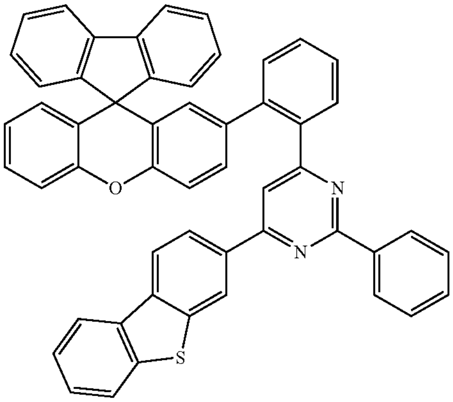

-continued
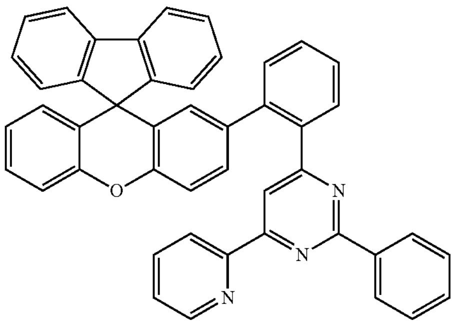
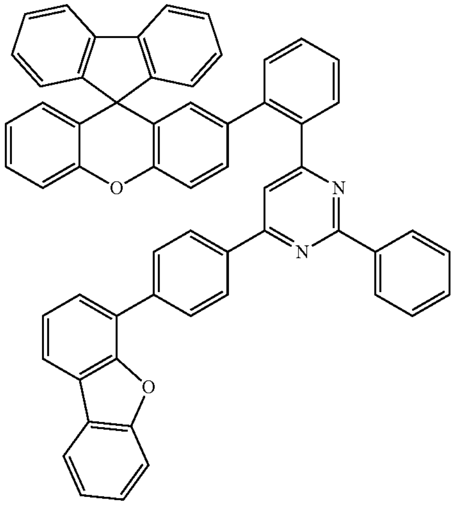
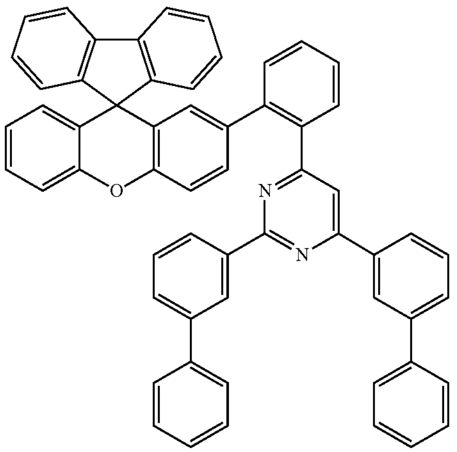
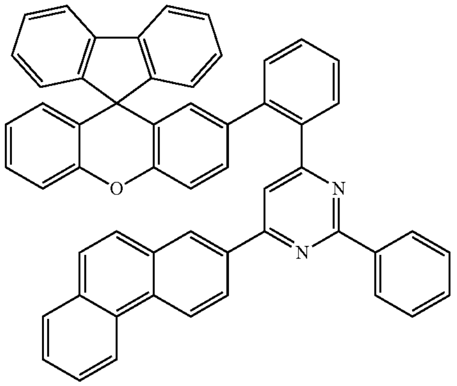
-continued
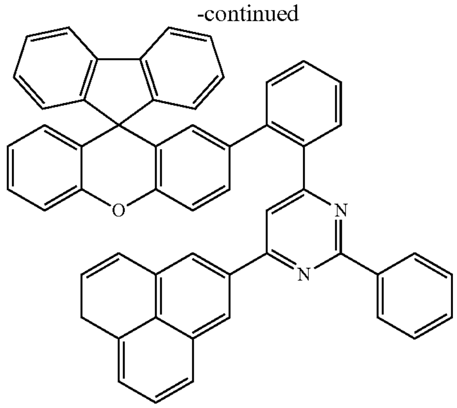
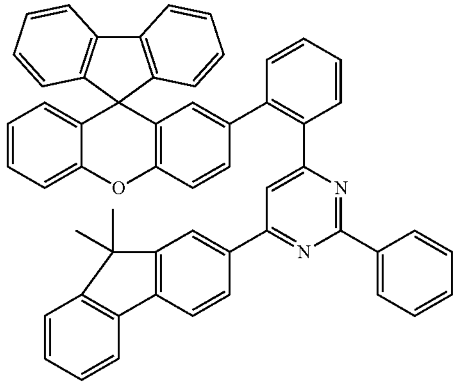
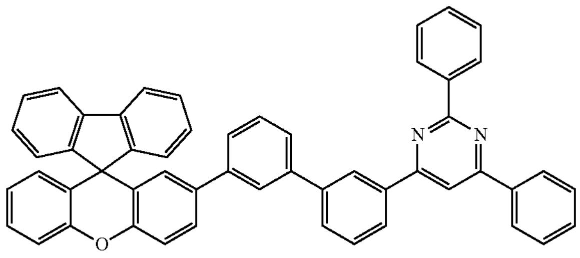
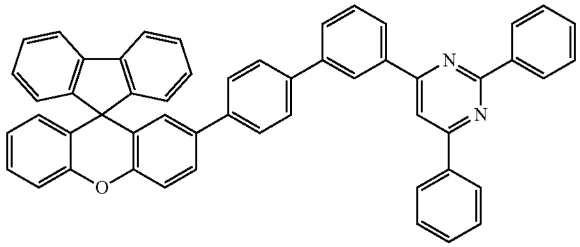
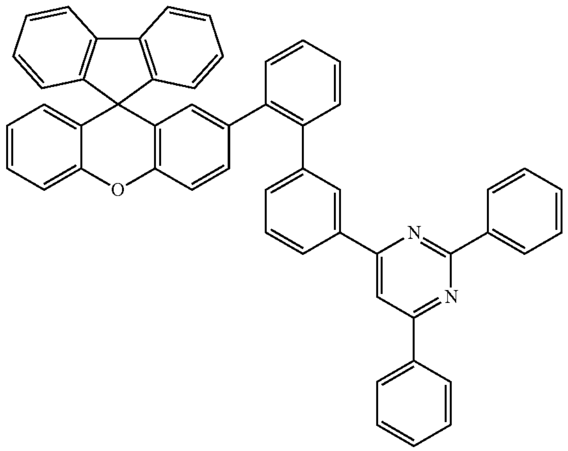

-continued
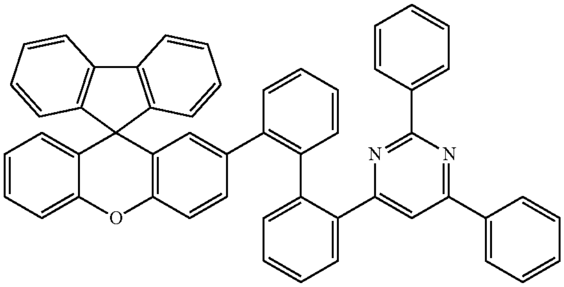
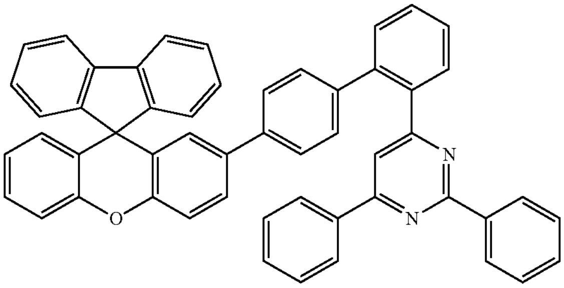
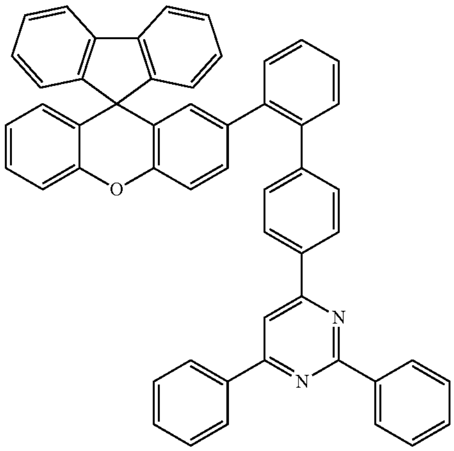
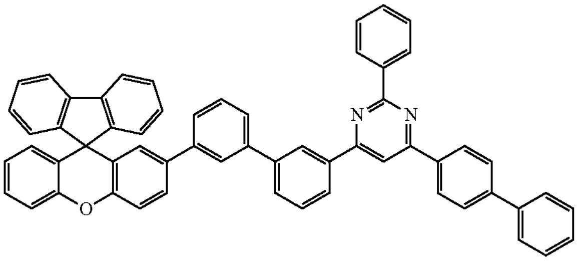
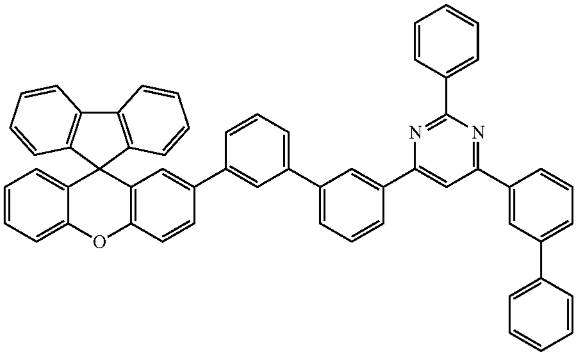
-continued
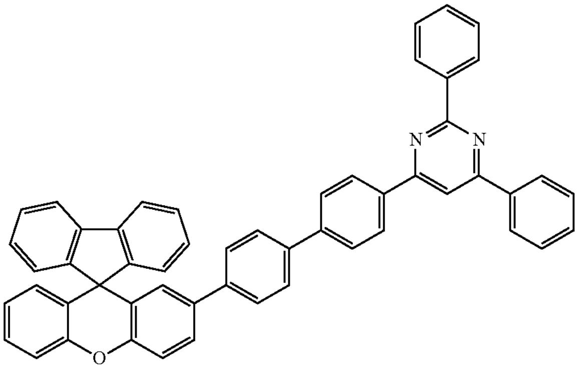
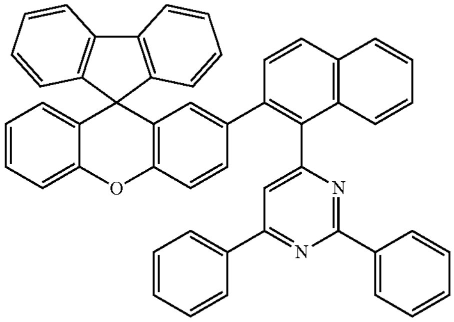
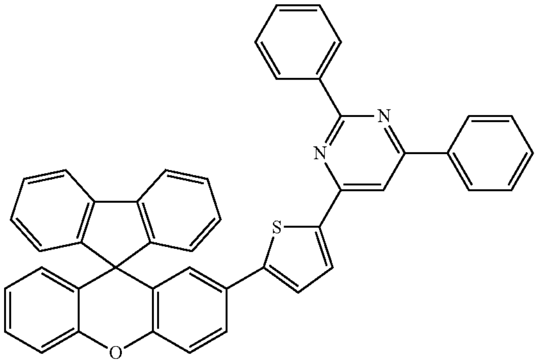
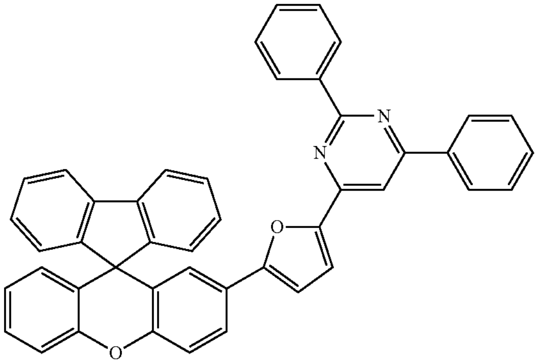

-continued
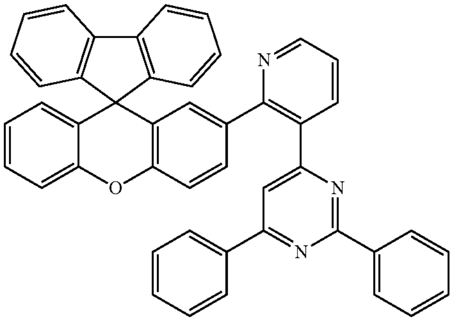
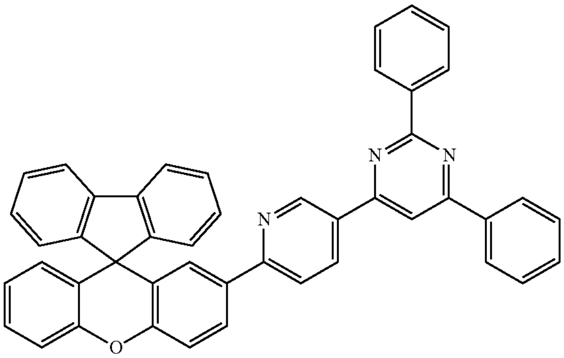
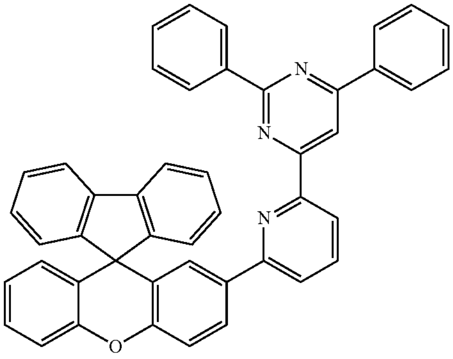
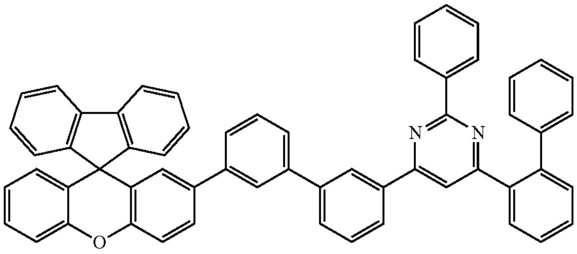
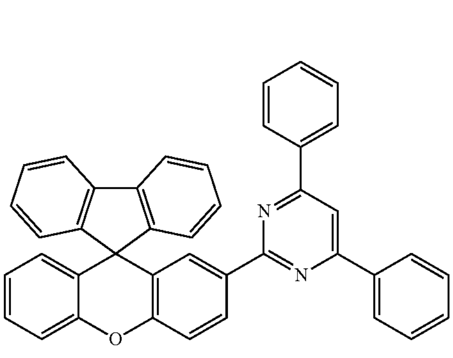
-continued
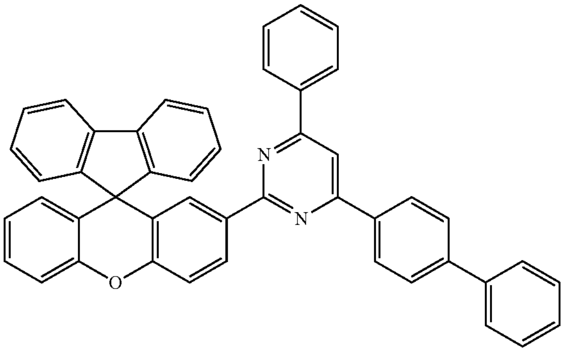
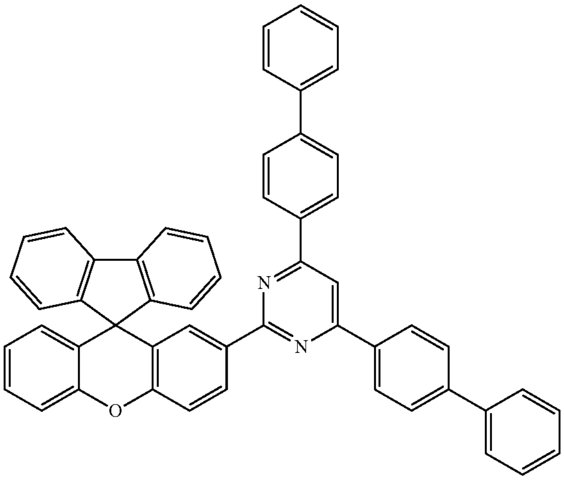
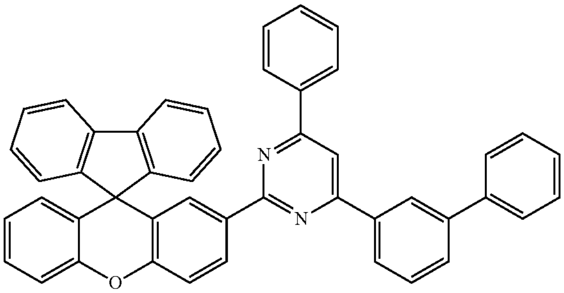
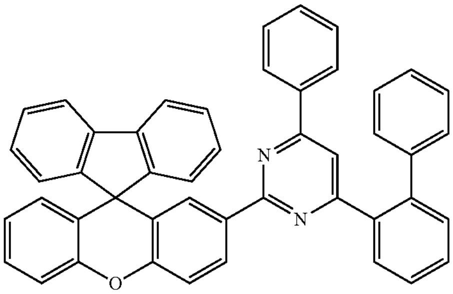
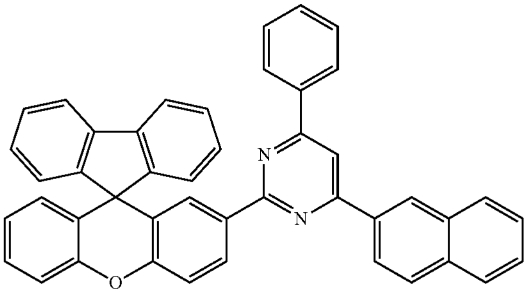

-continued
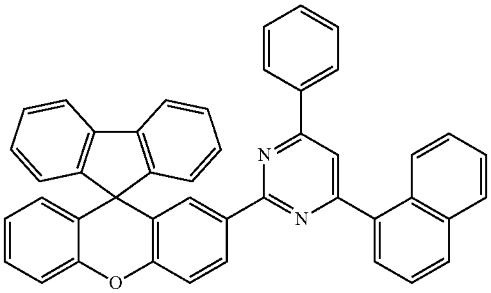
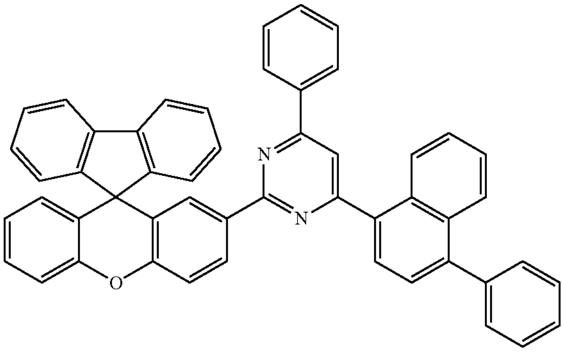
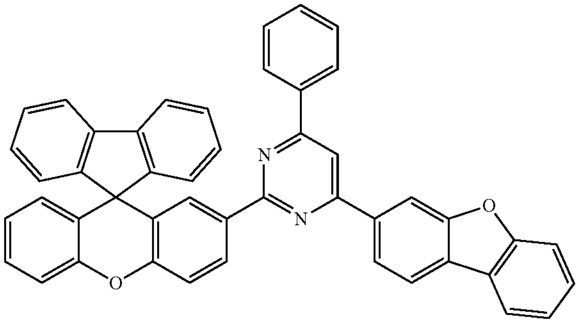
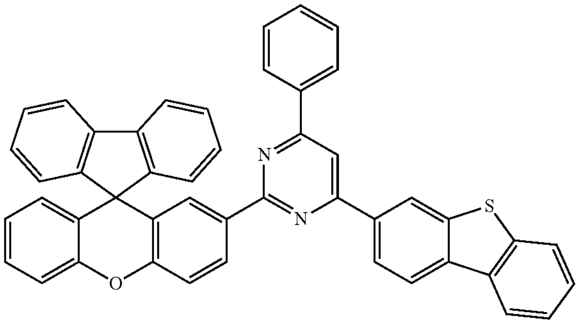
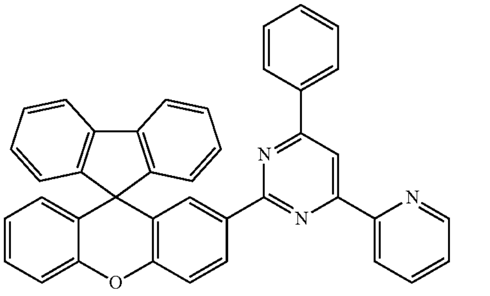
-continued
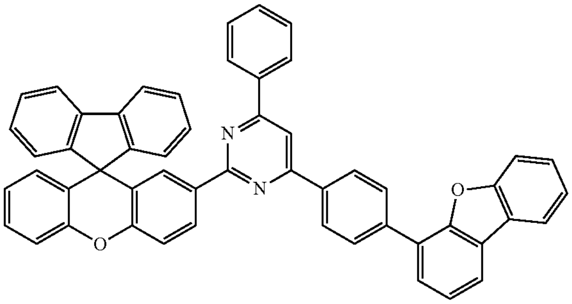
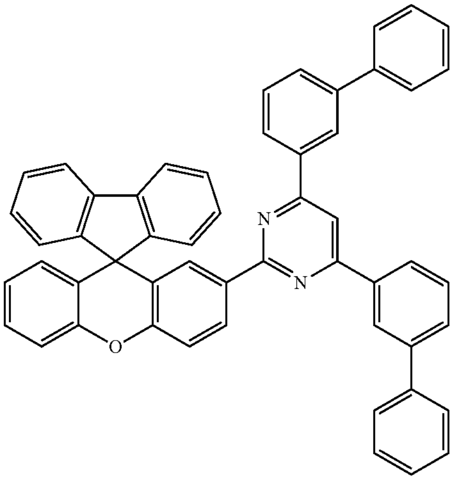
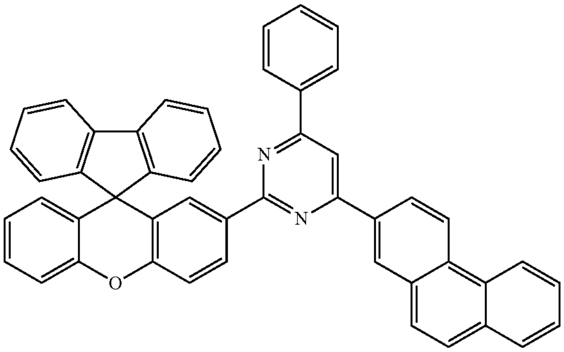
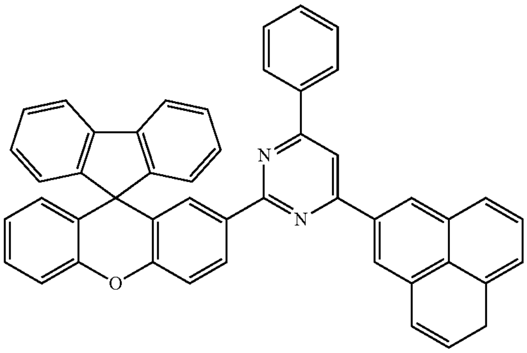

-continued
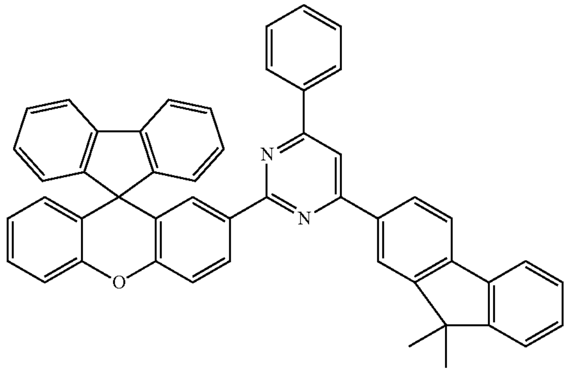
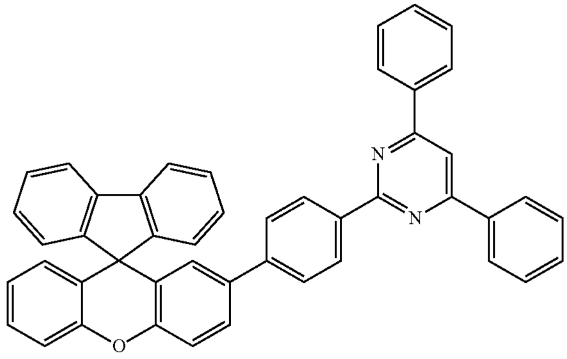
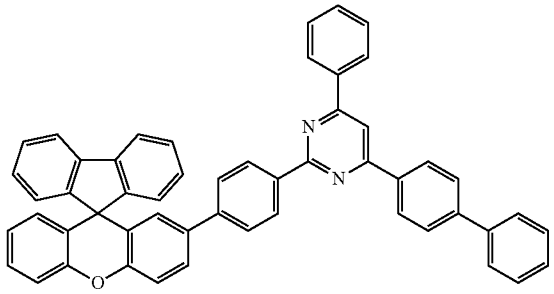
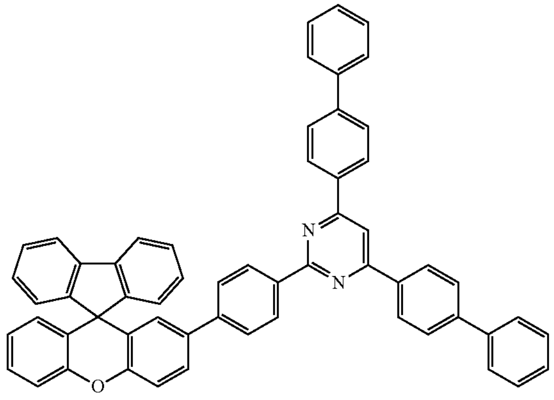
-continued
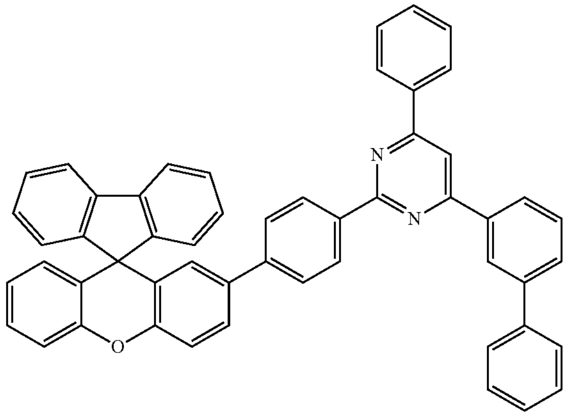
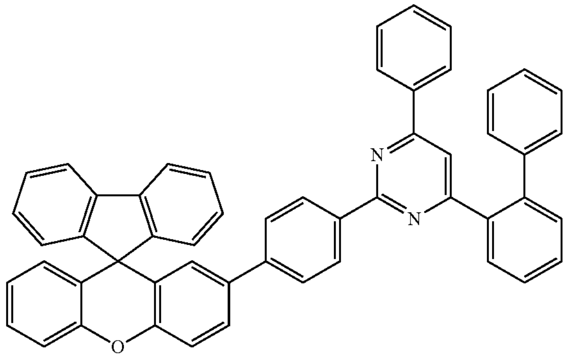
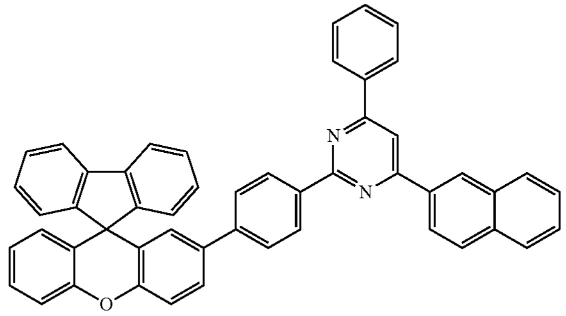
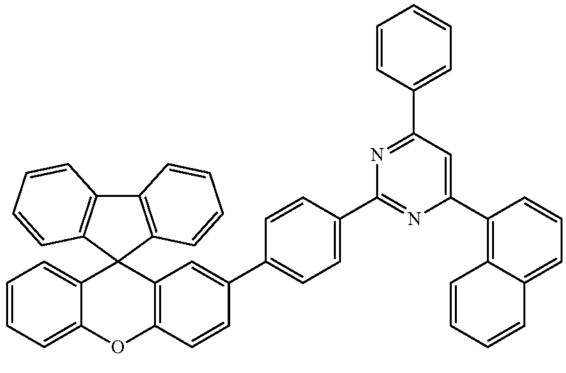

-continued
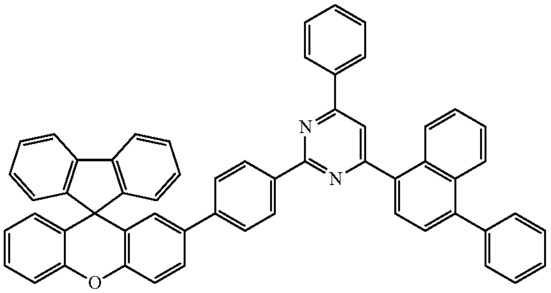
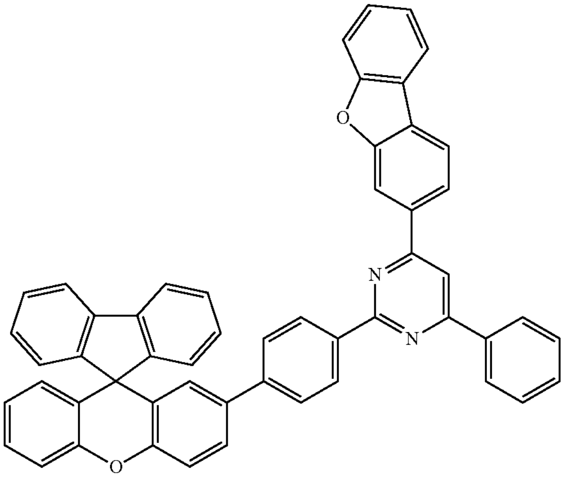
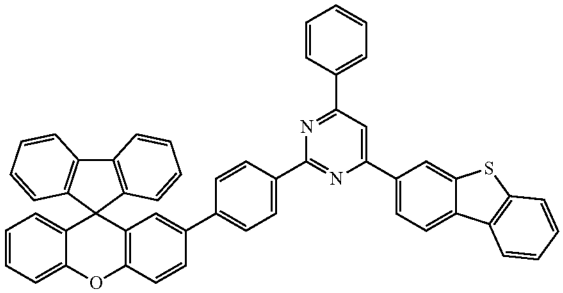
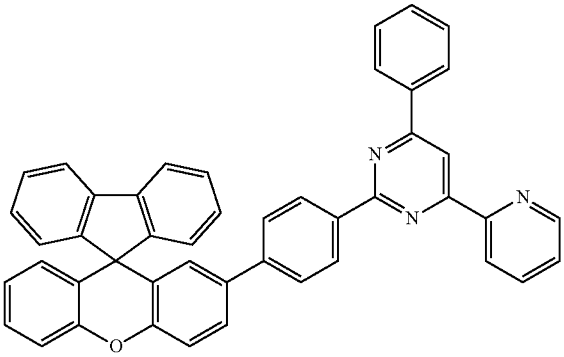
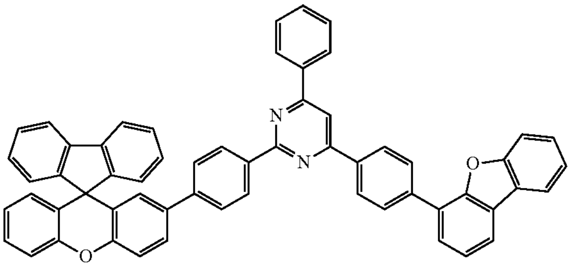
-continued
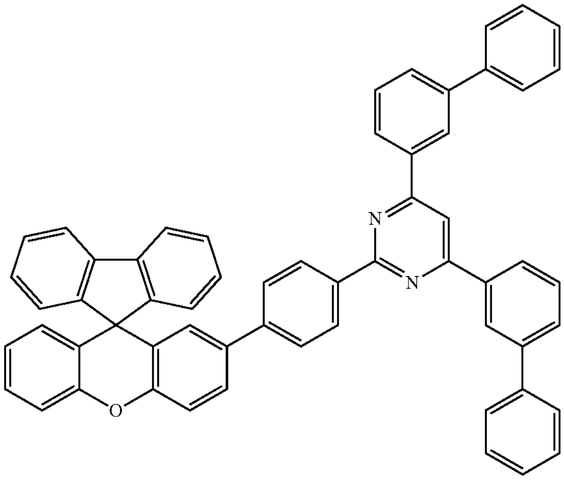
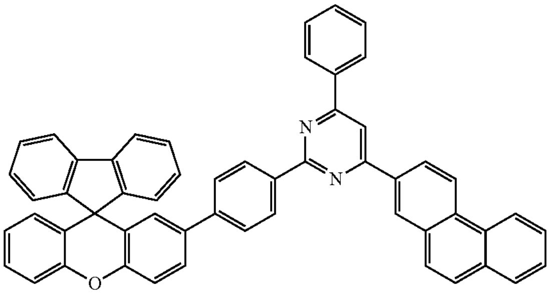
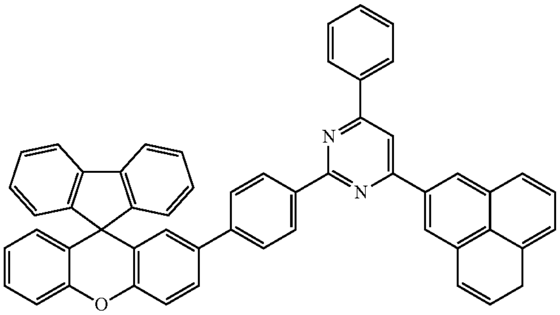
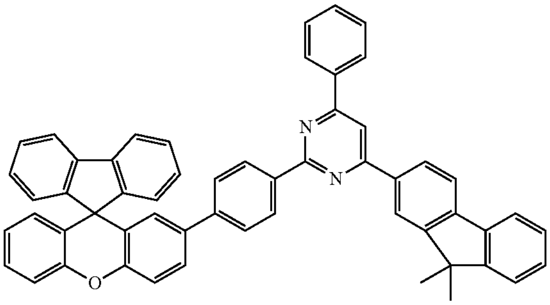
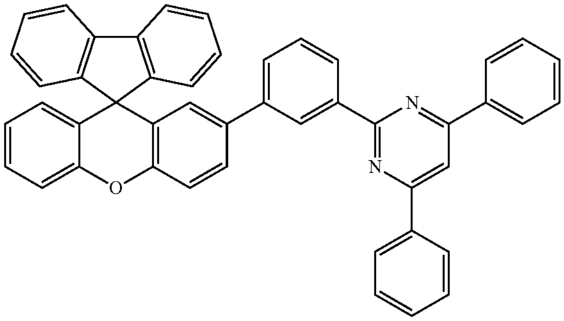

-continued
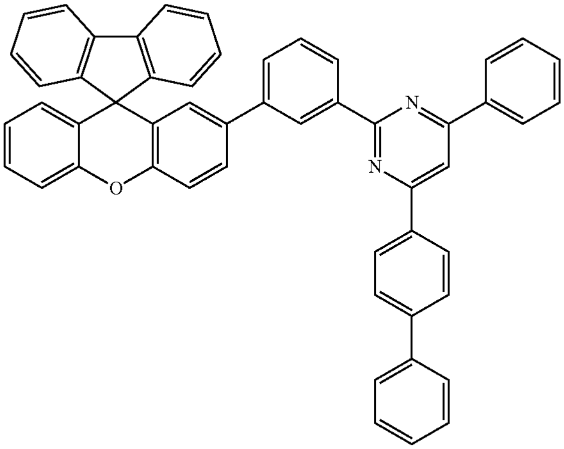
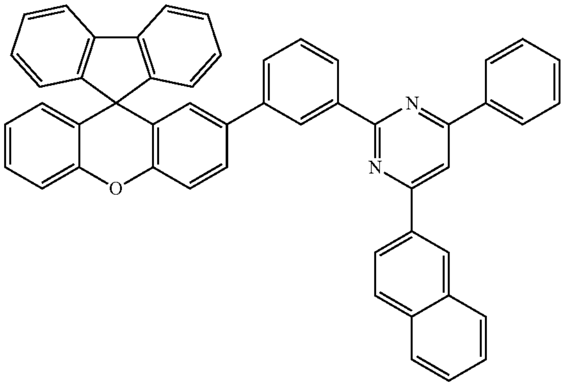
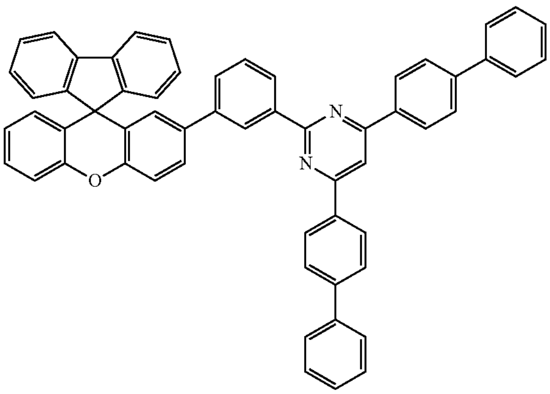
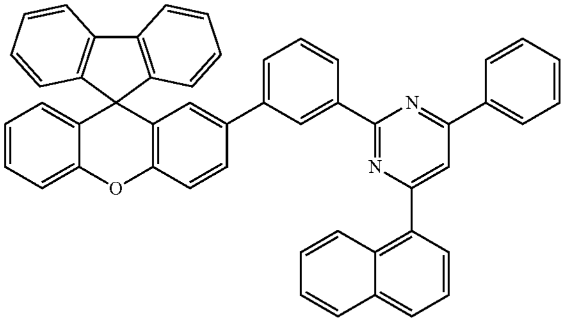
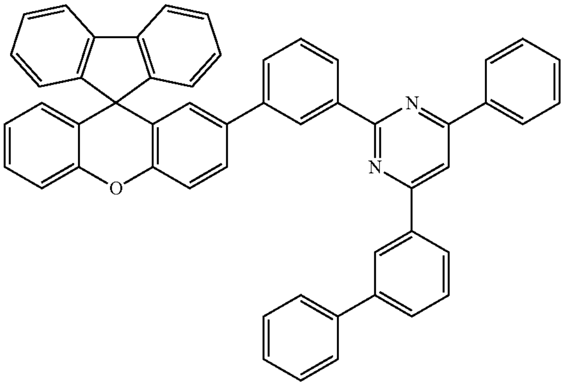
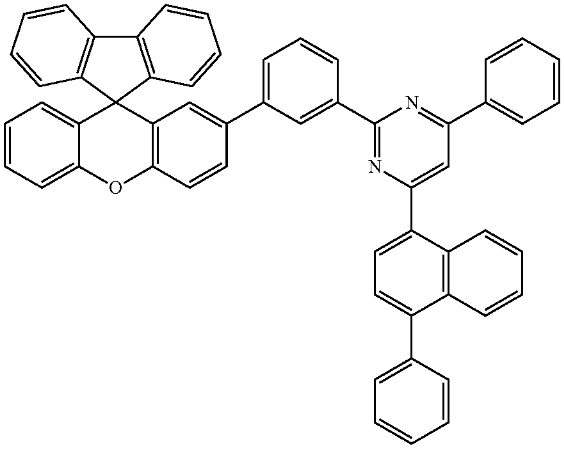
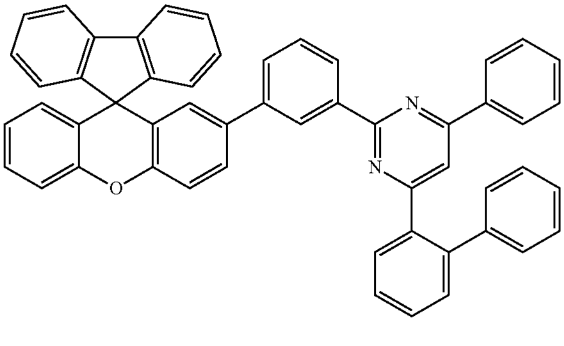
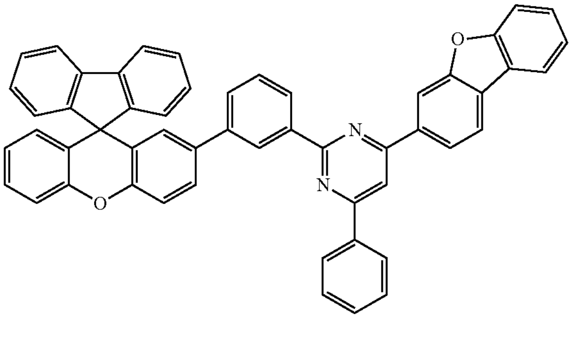
-continued -continued
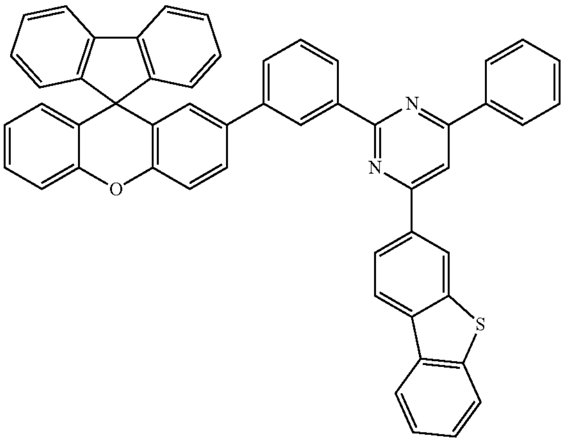
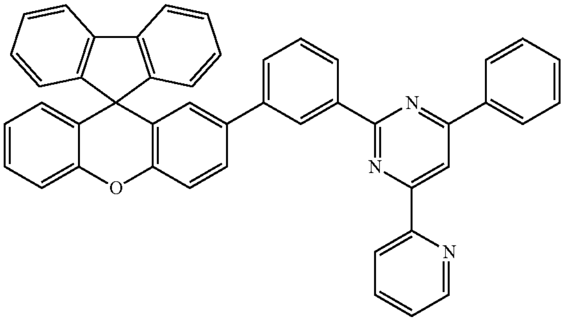
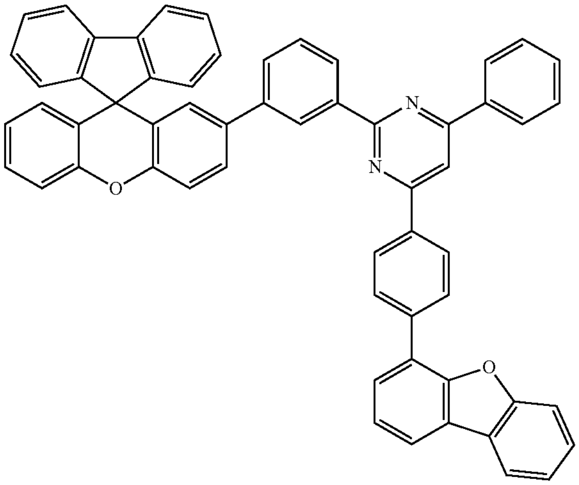
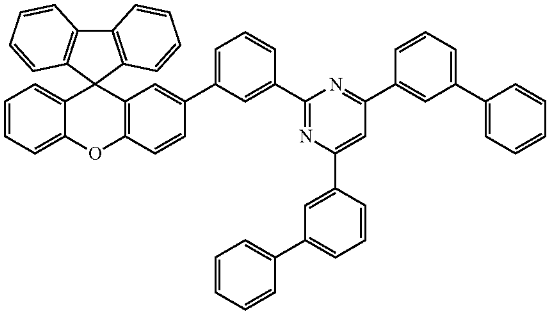
-continued
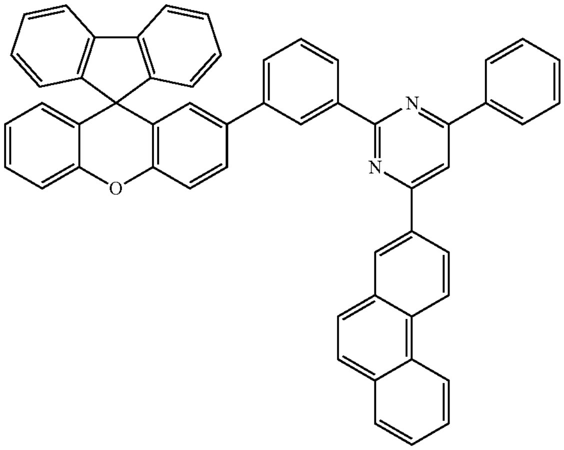
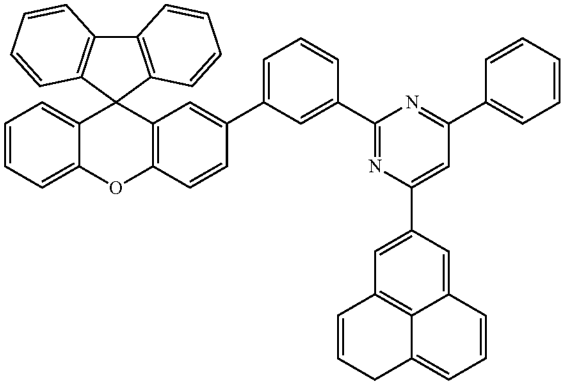
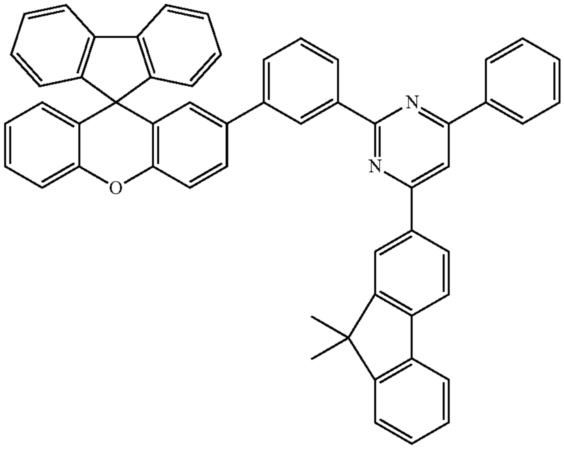
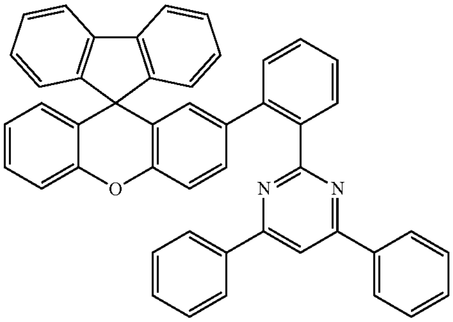

-continued
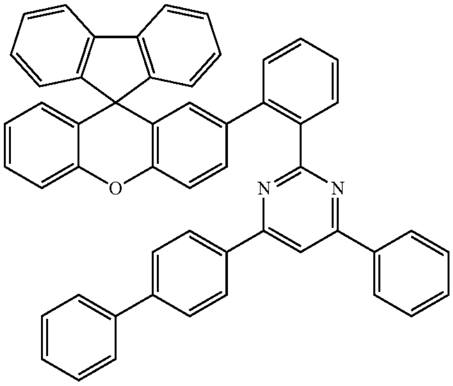
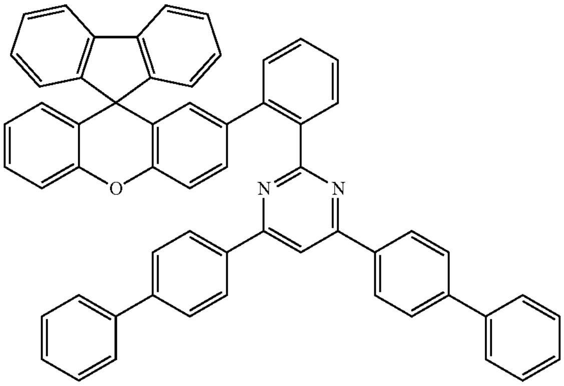
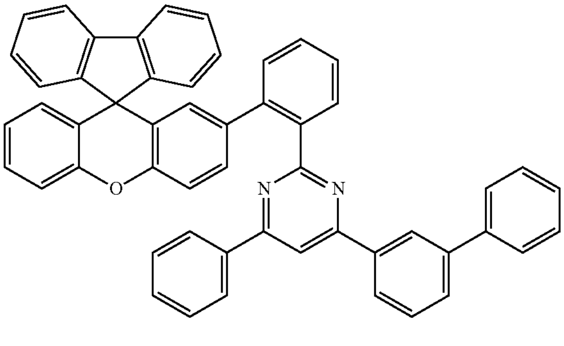
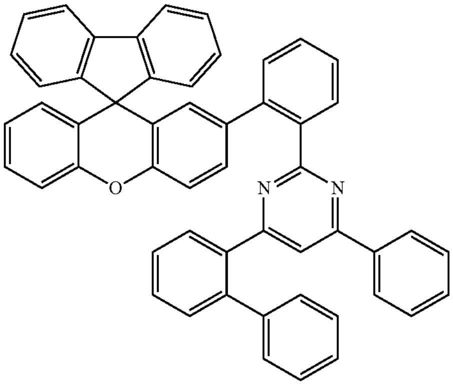
-continued
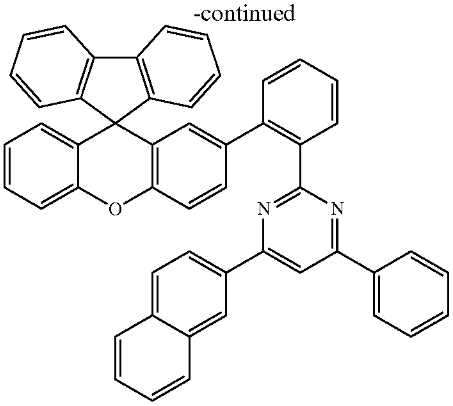
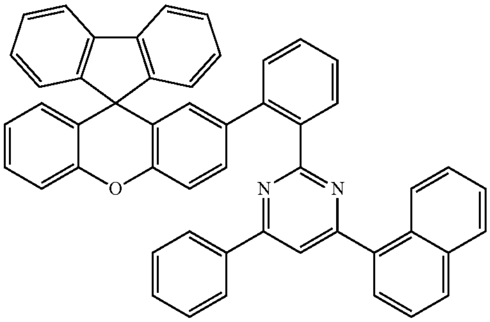
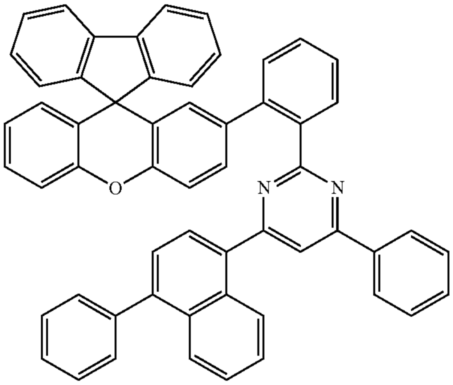
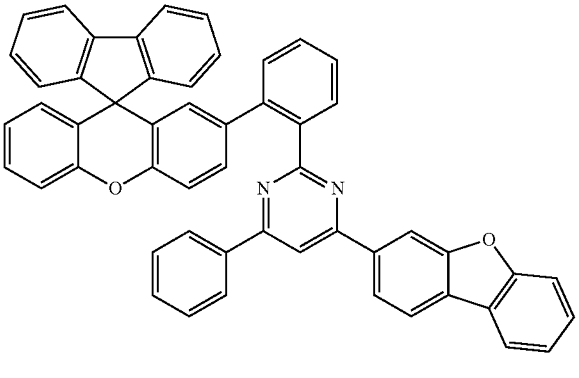

-continued
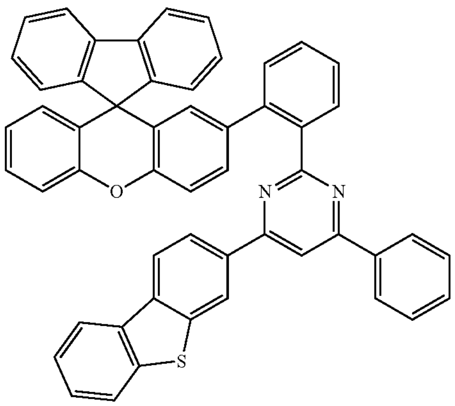
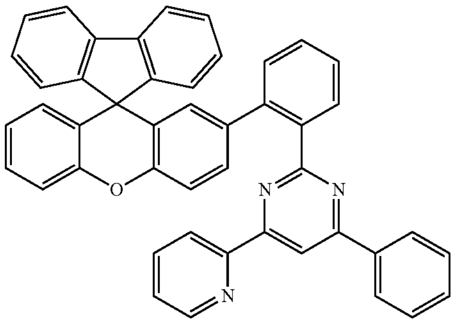
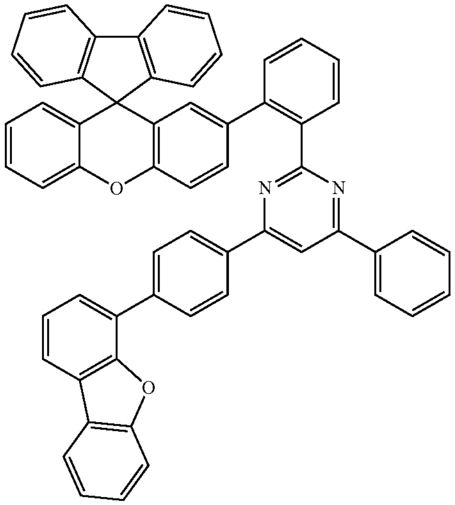
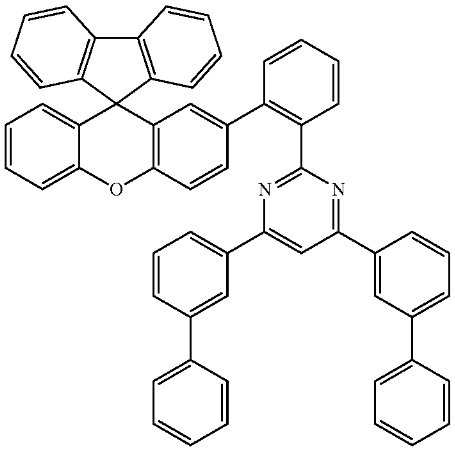
-continued
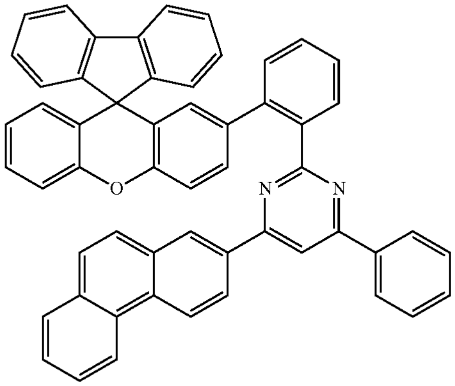
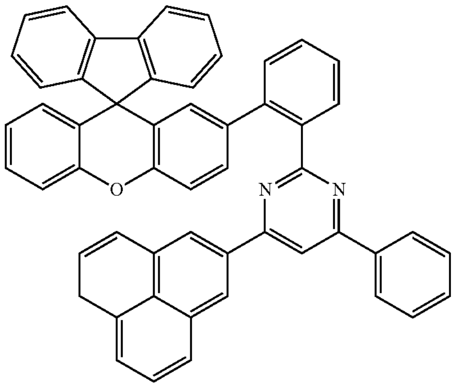
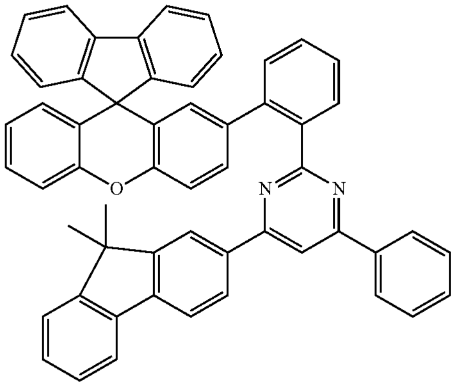
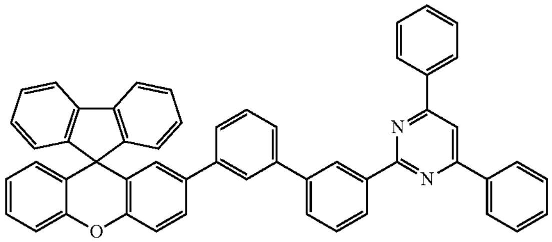
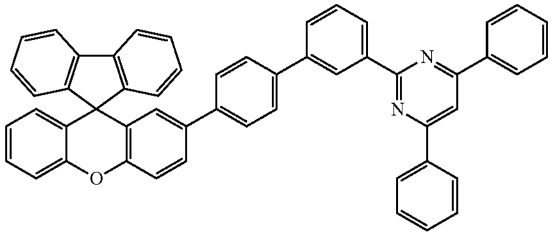

-continued
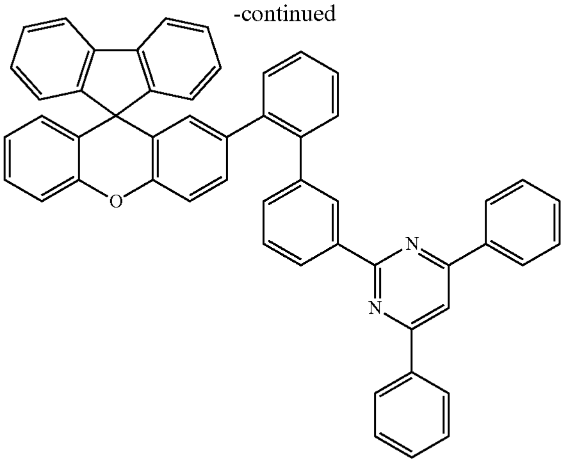
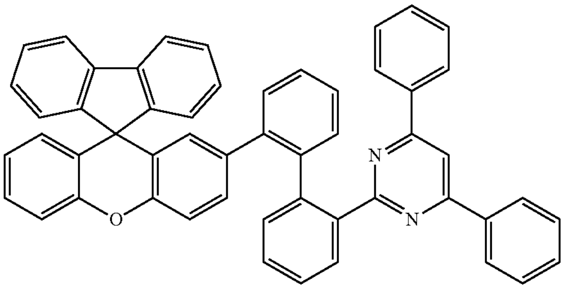
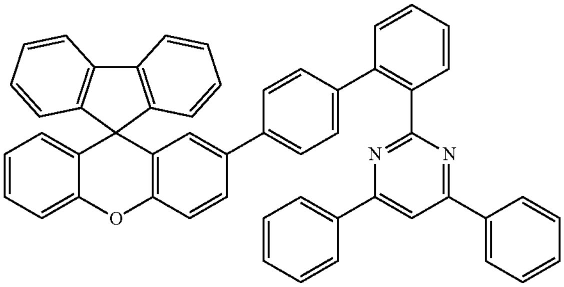
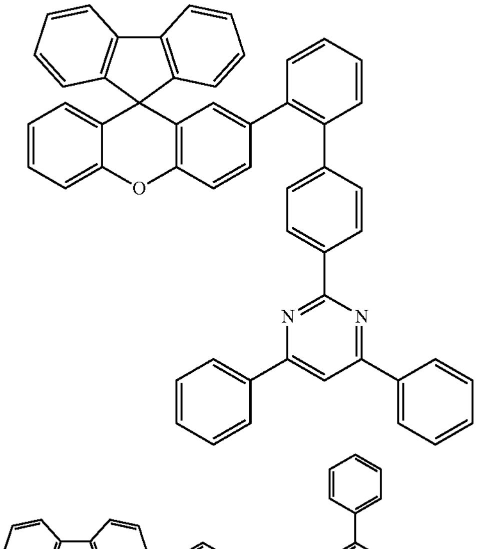
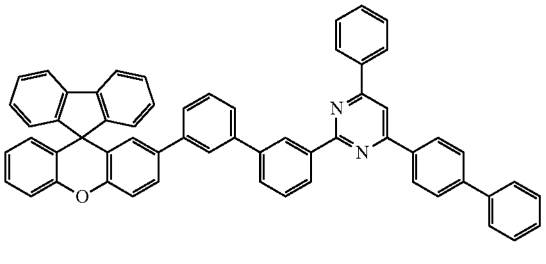
-continued
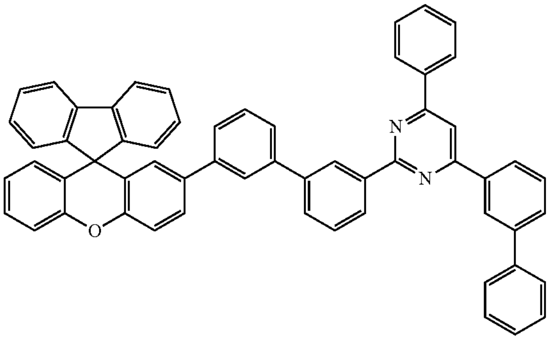
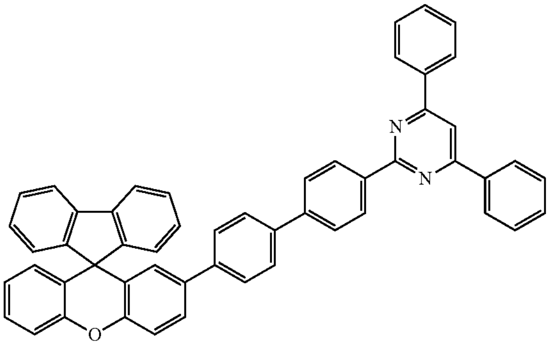
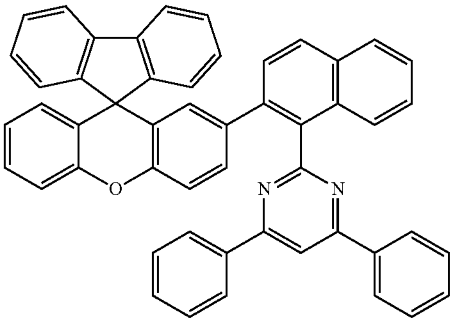
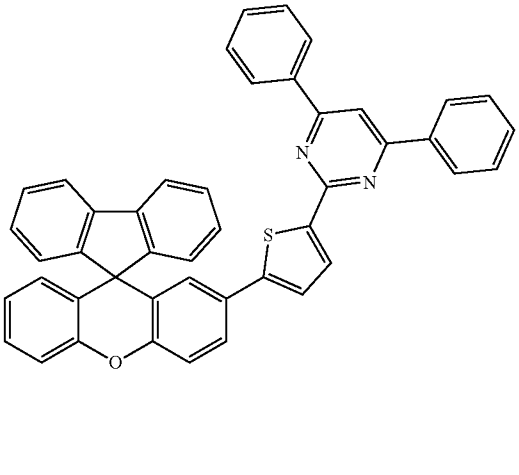

-continued
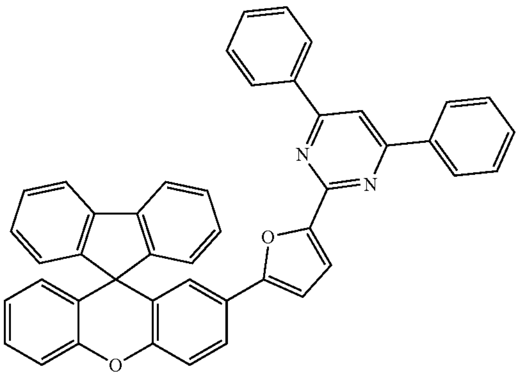
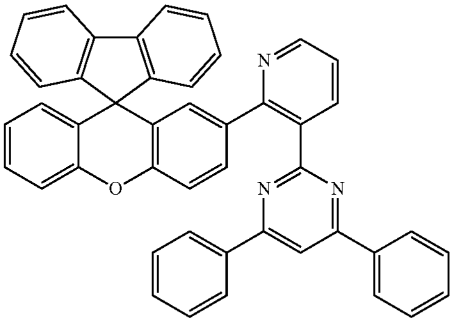
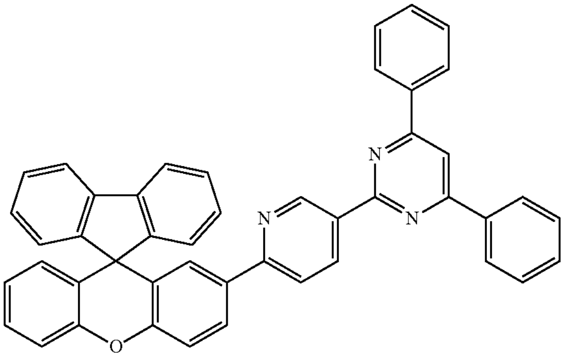
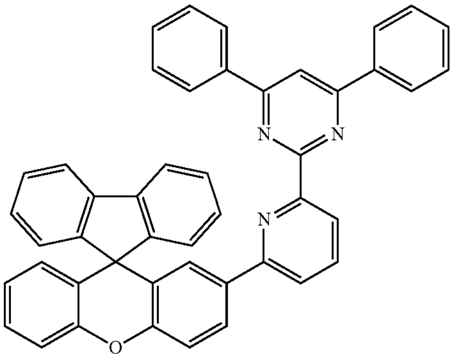
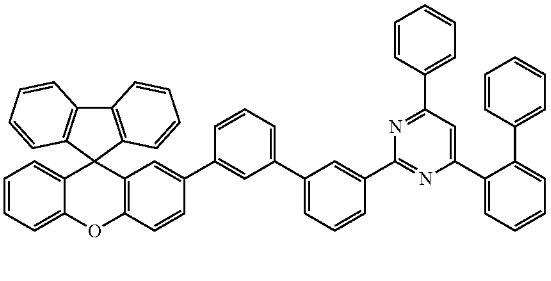
-continued
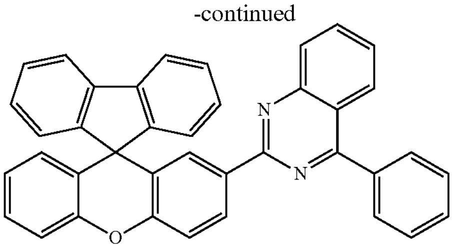
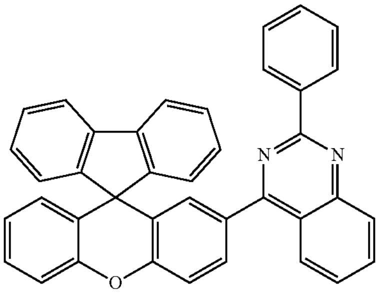
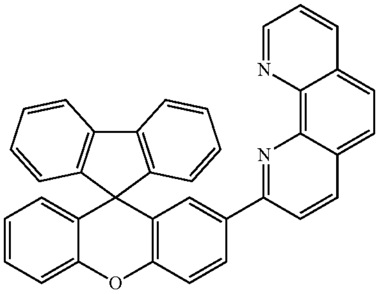
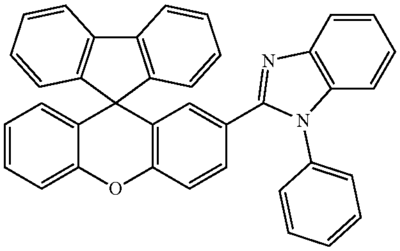
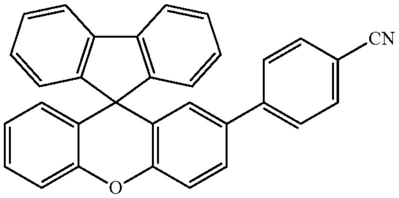
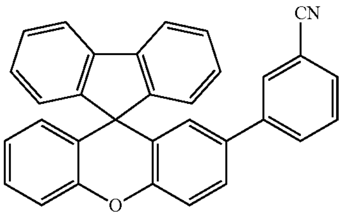
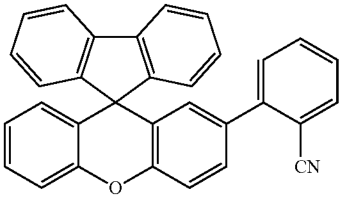

-continued
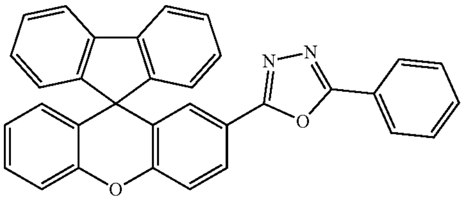
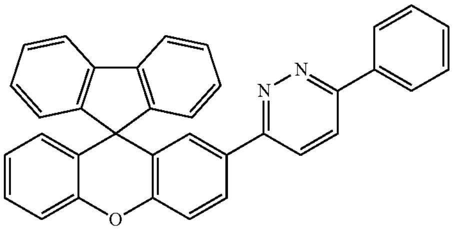
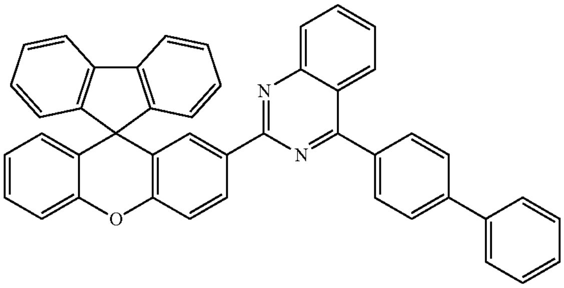
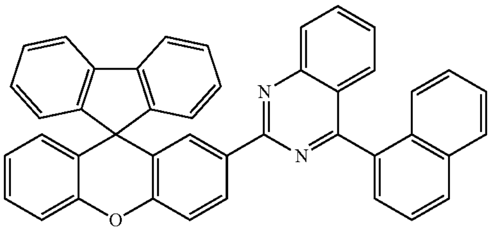
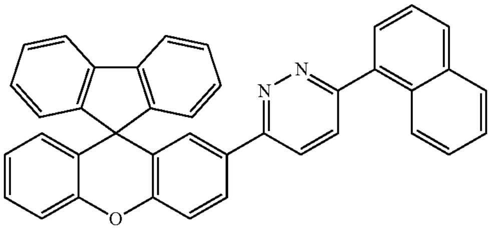
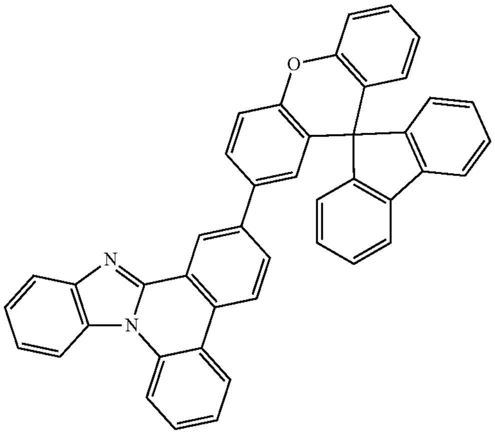
-continued
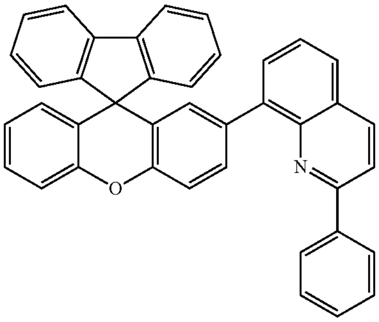
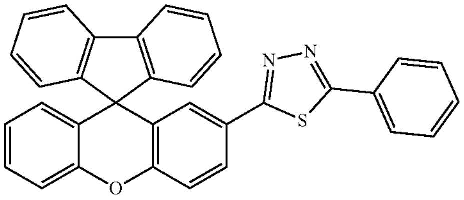
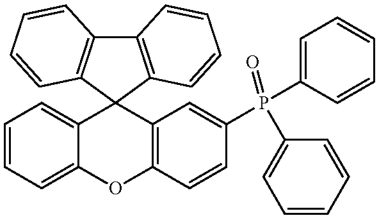
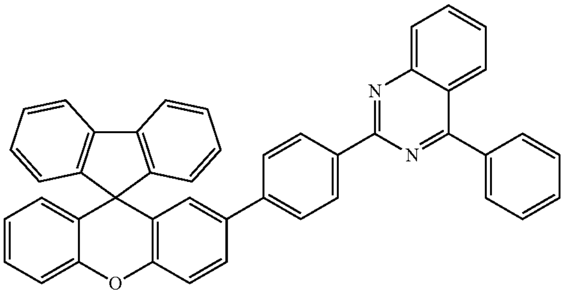
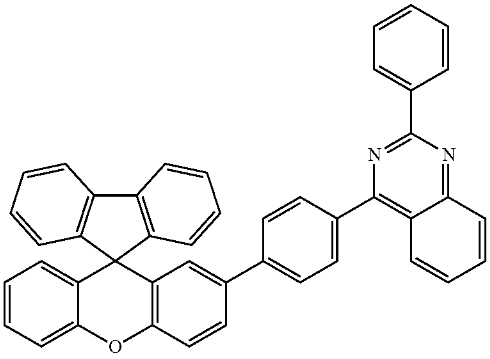

-continued
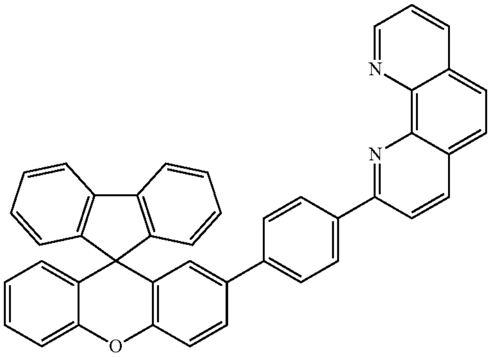
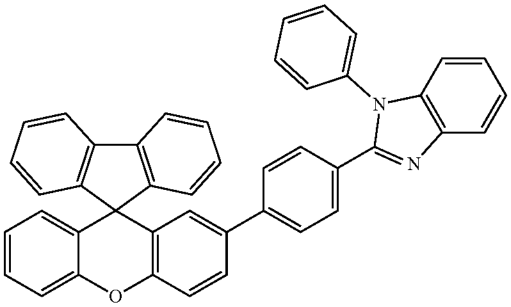
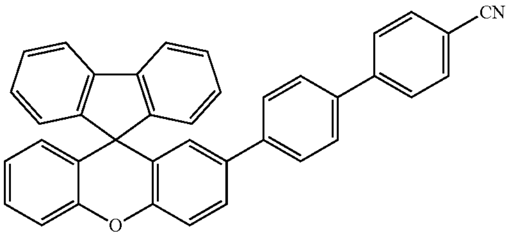
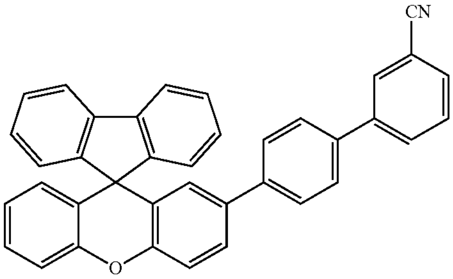
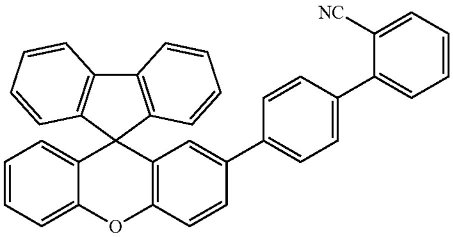
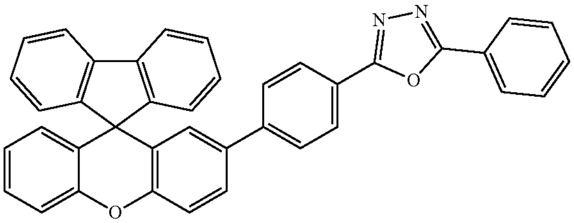
-continued
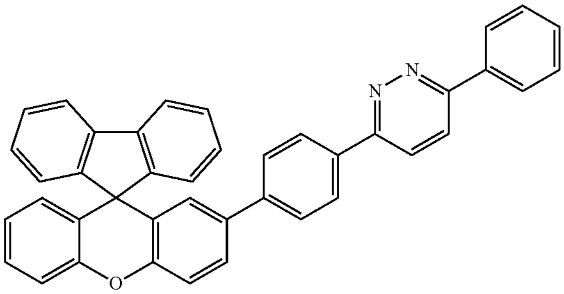
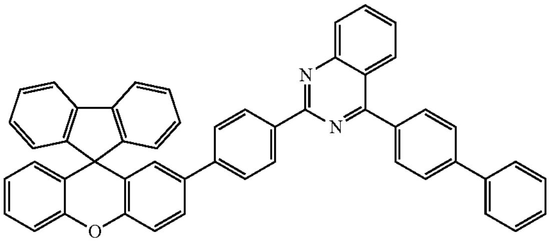
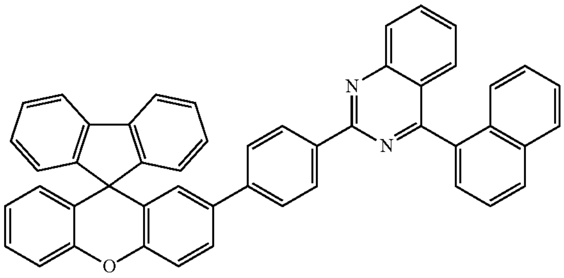
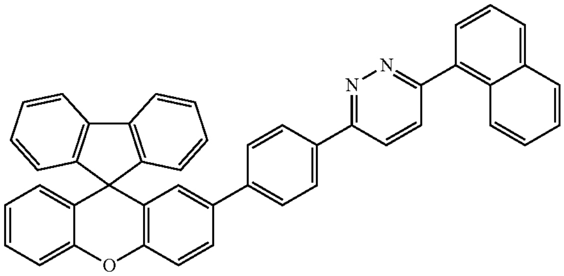
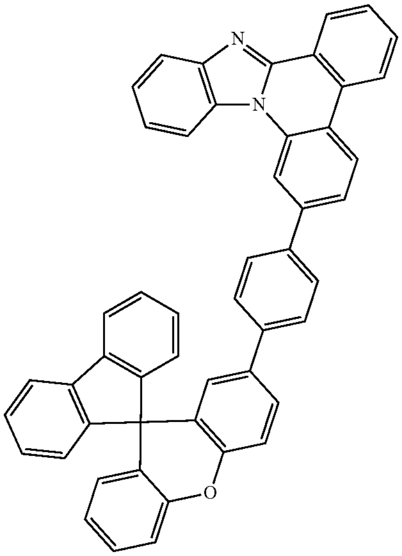

-continued
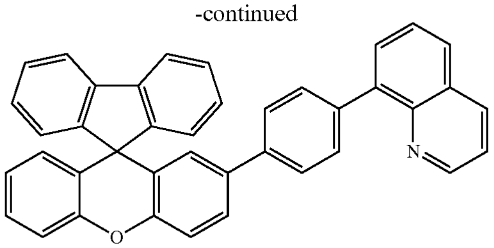
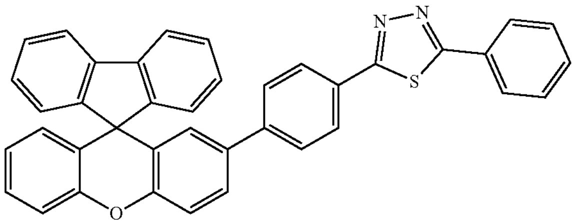
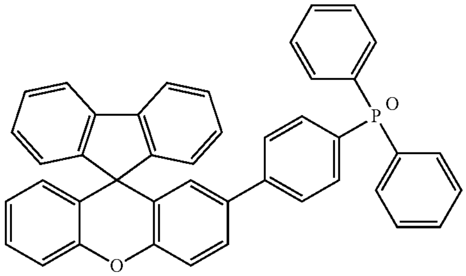
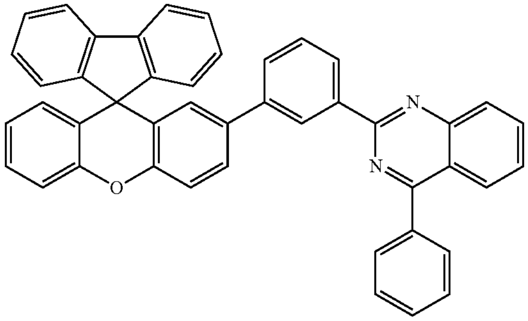
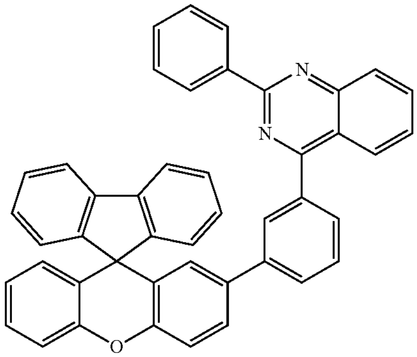
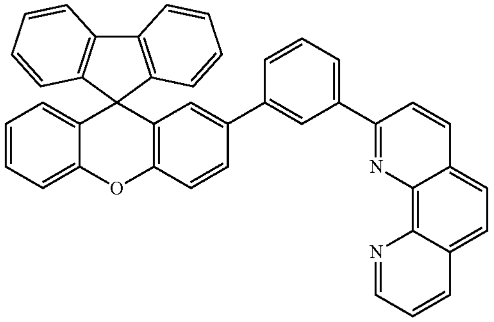
-continued
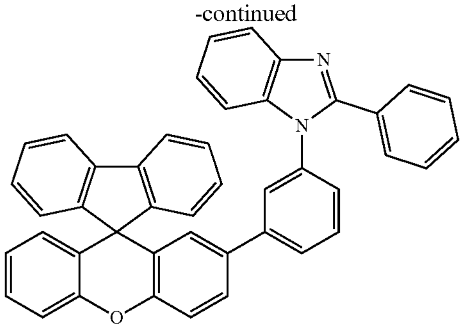
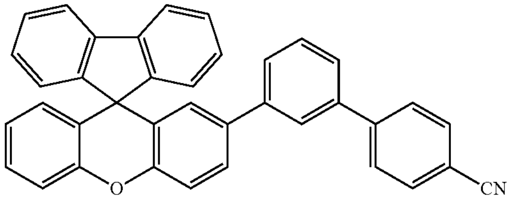
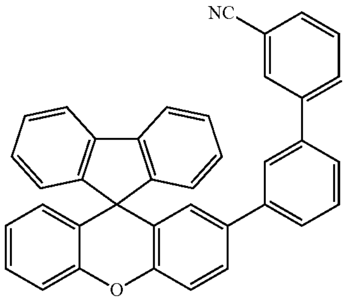
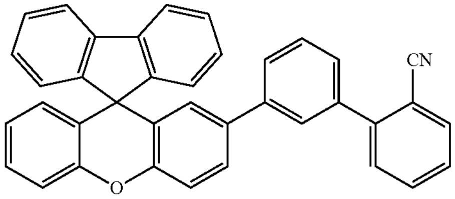
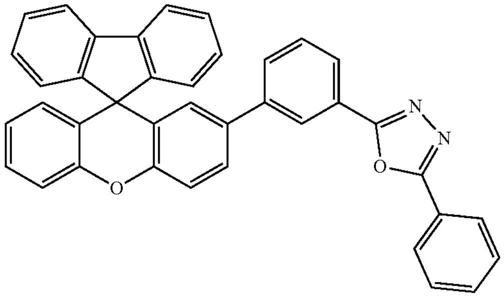
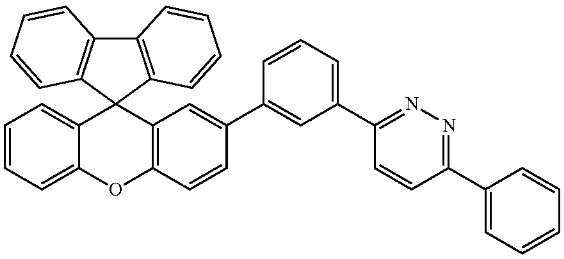

-continued
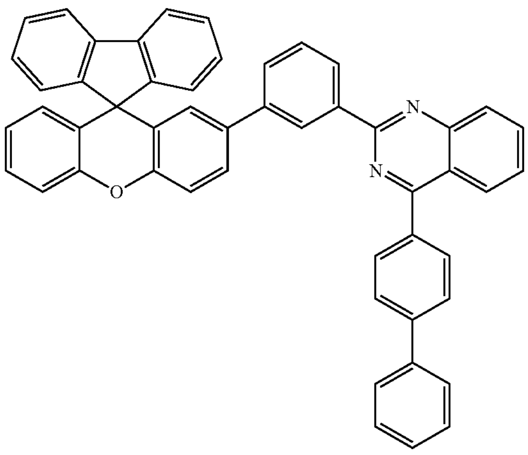
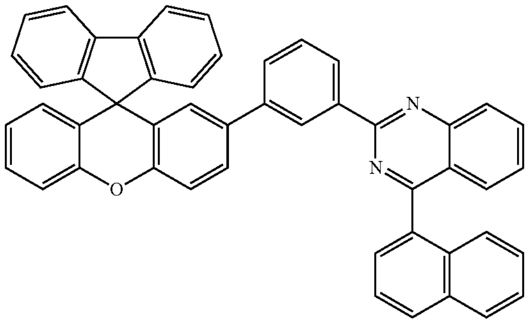
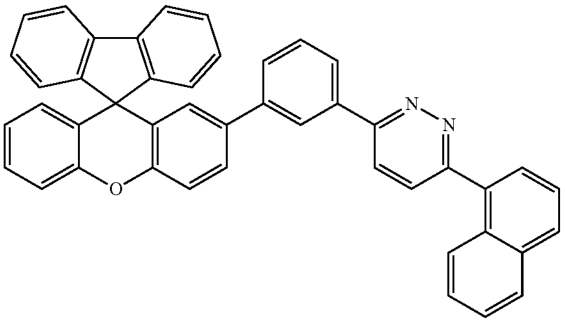
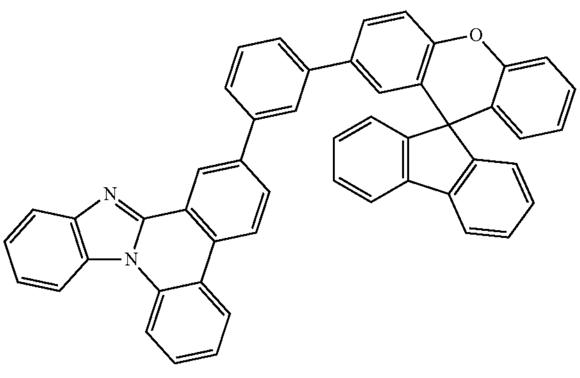
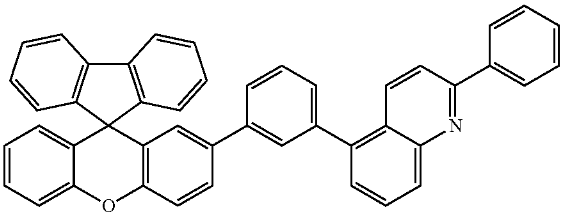
-continued
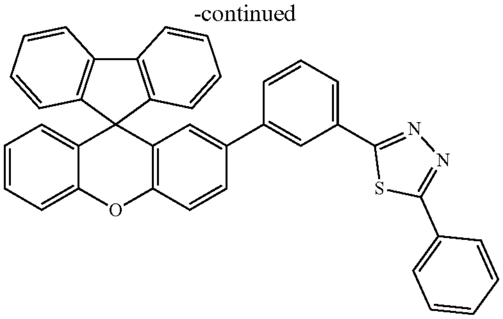
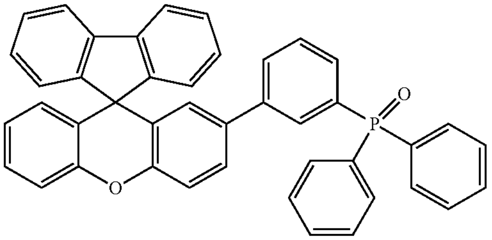
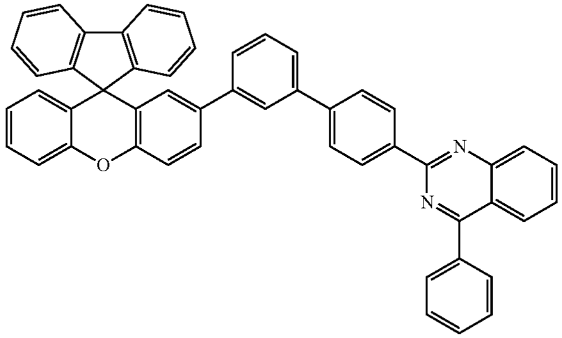
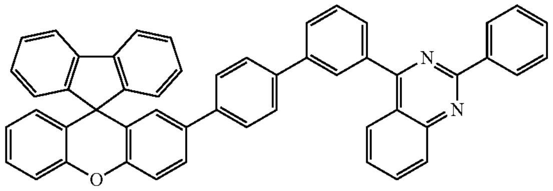
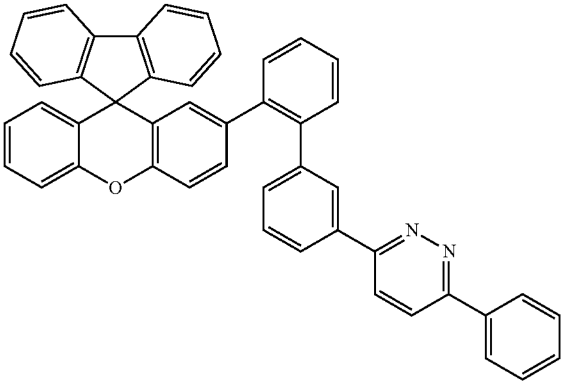
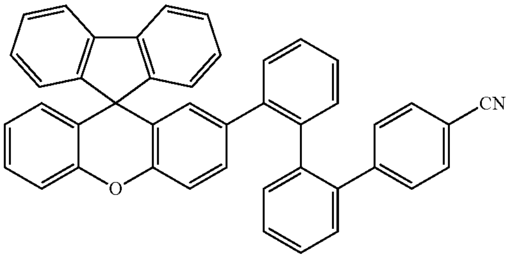

-continued
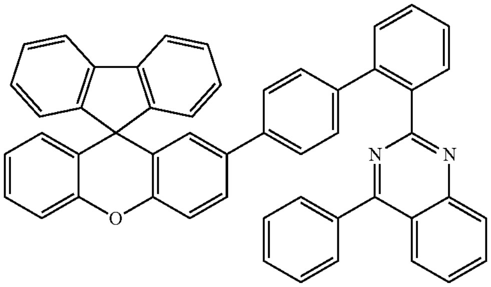
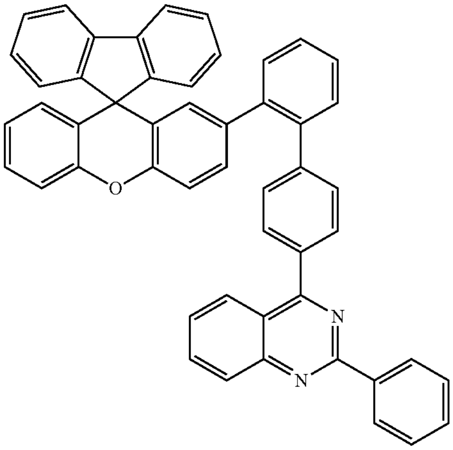
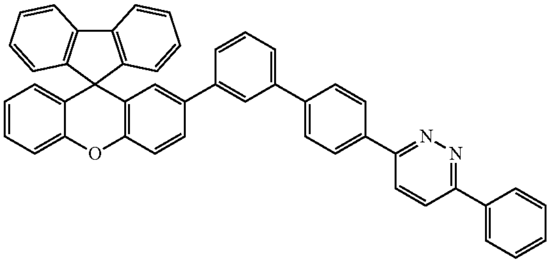
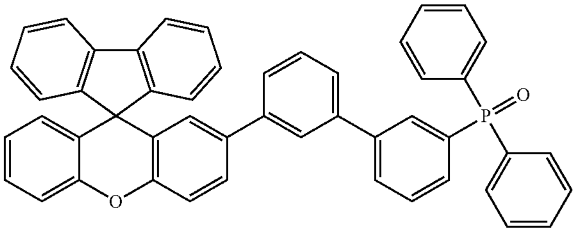
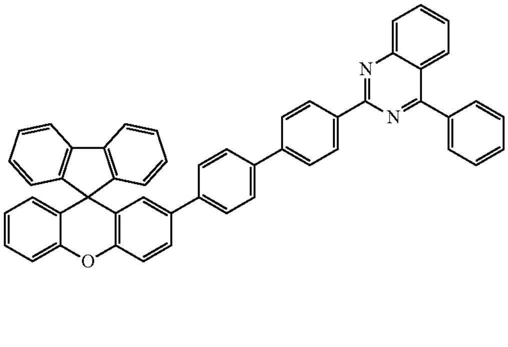
-continued
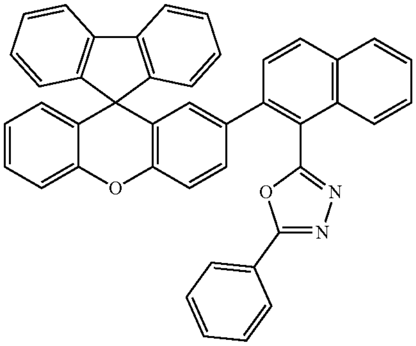
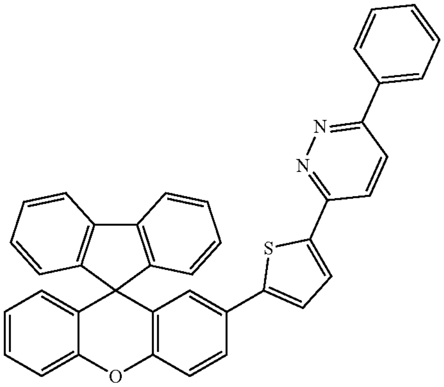
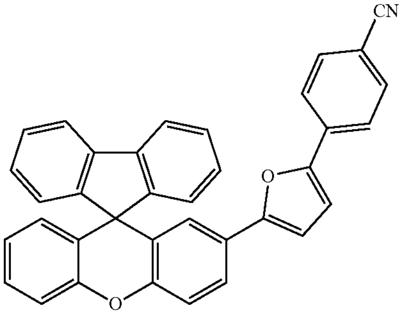
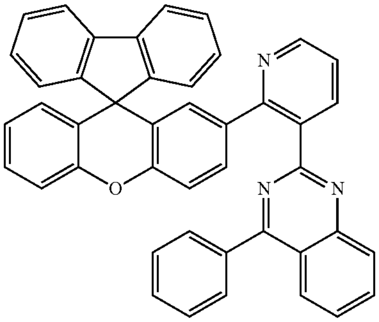
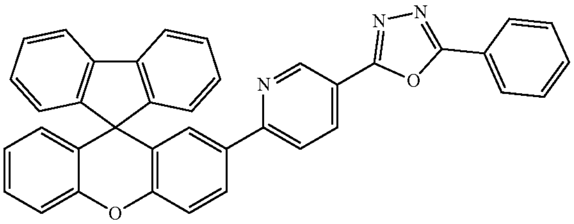

-continued
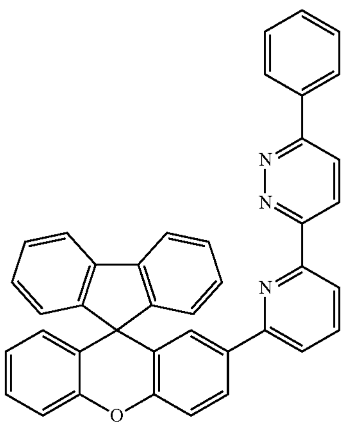
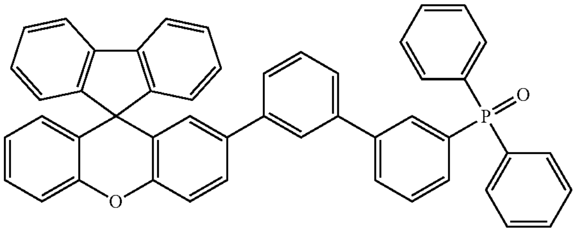
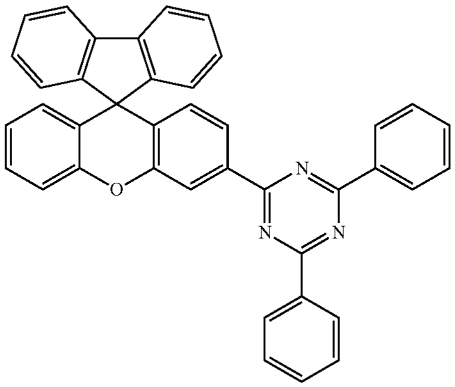
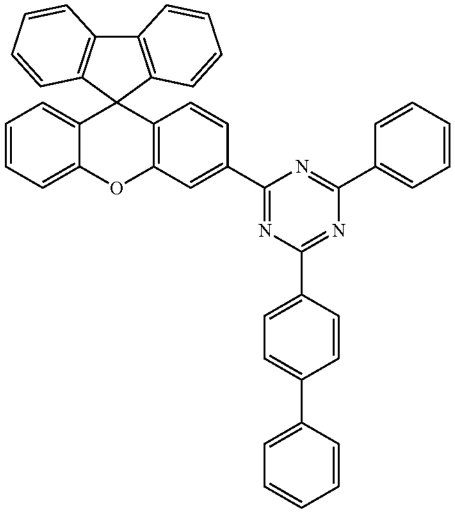
-continued
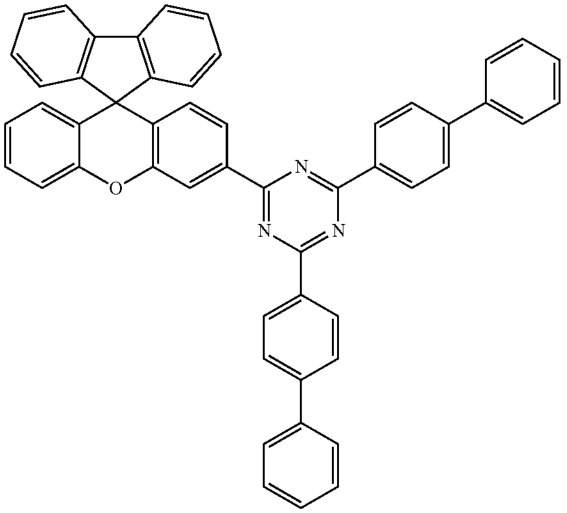
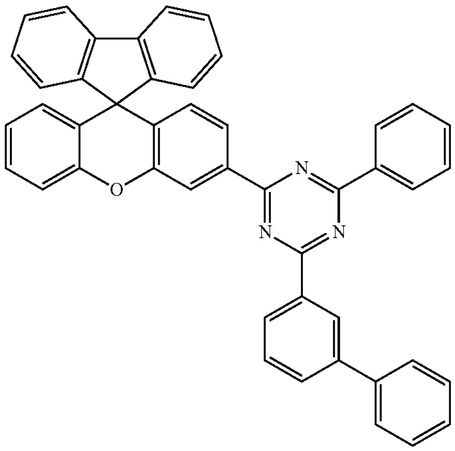
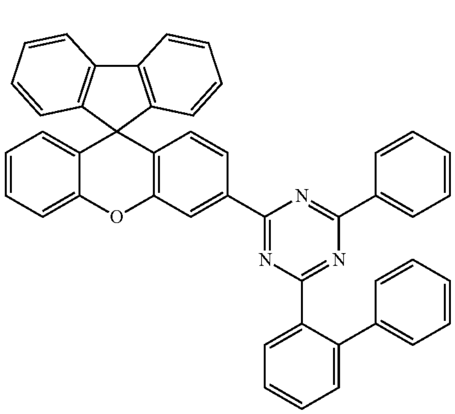

-continued
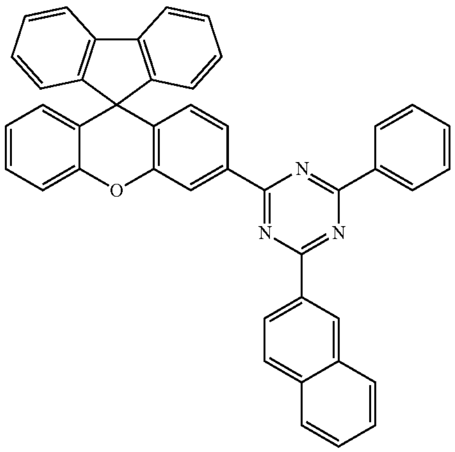
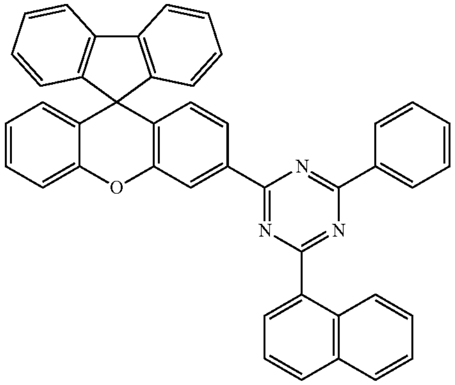
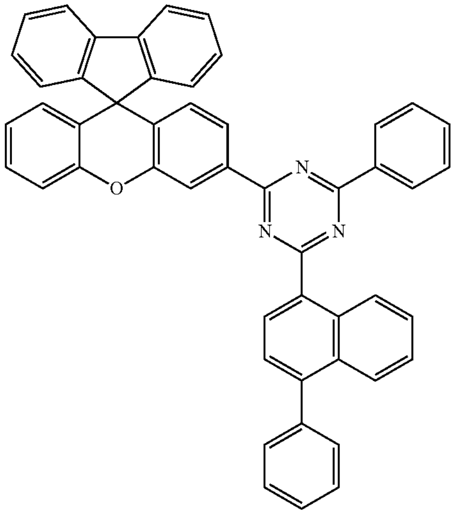
-continued
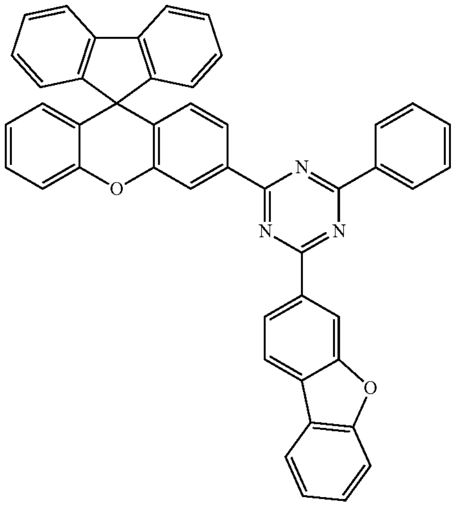
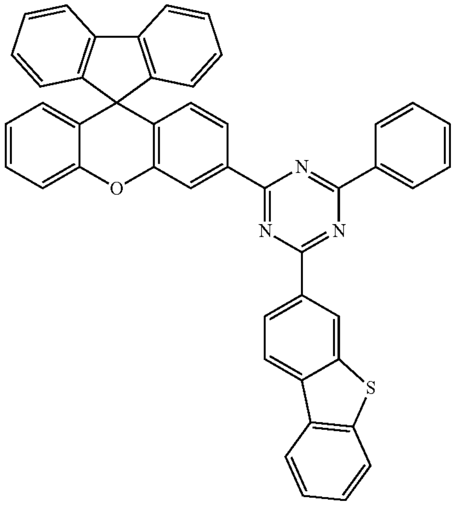
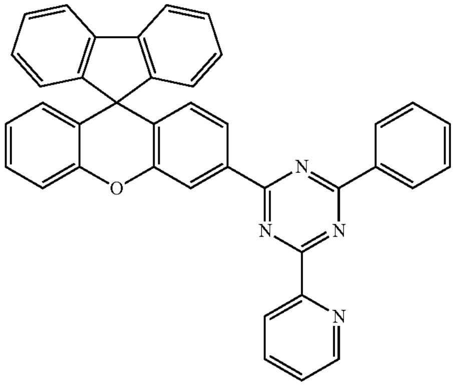

-continued
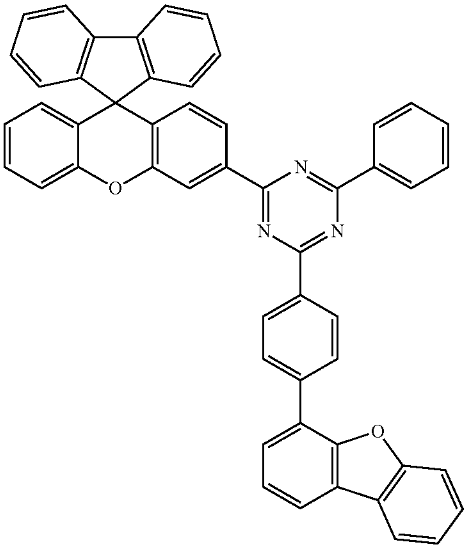
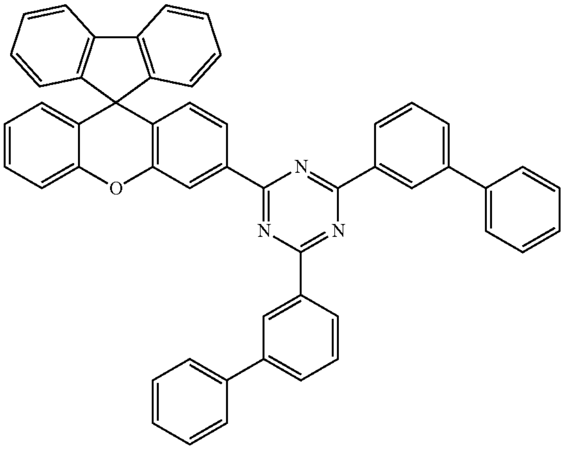
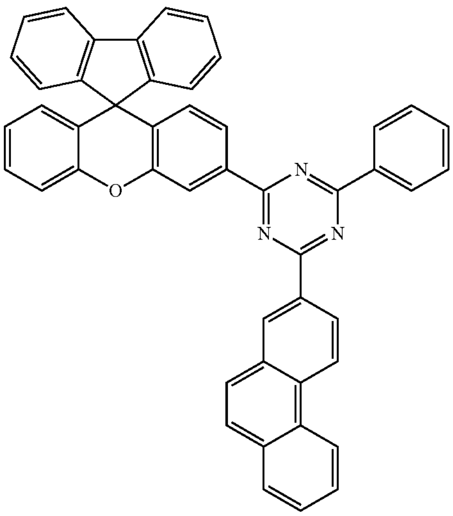
-continued
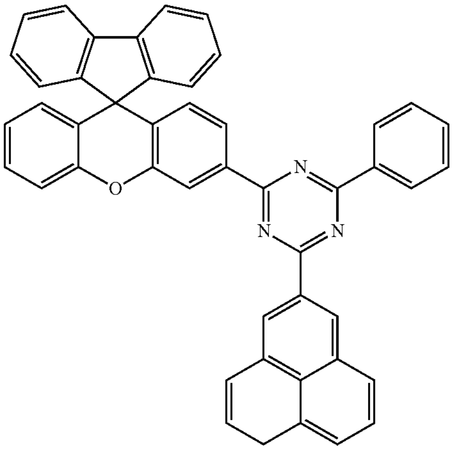
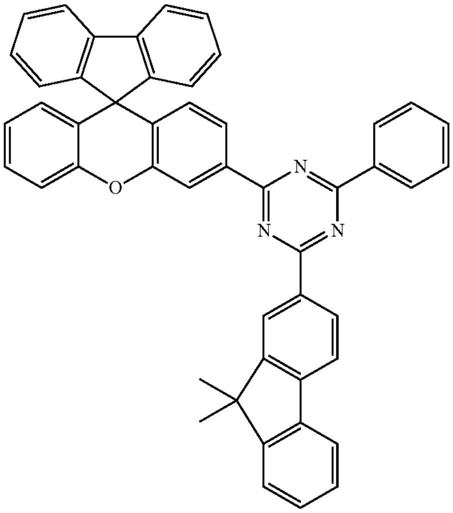
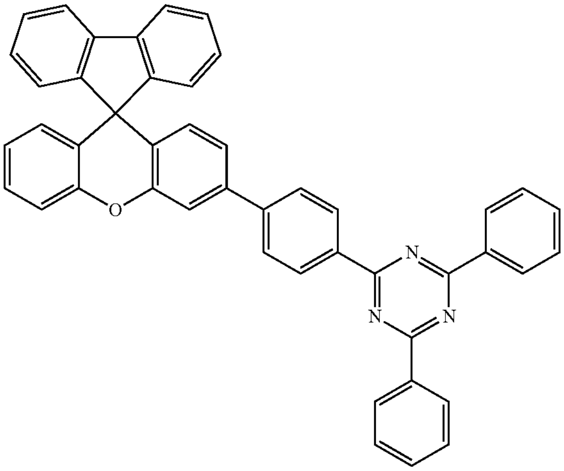

-continued
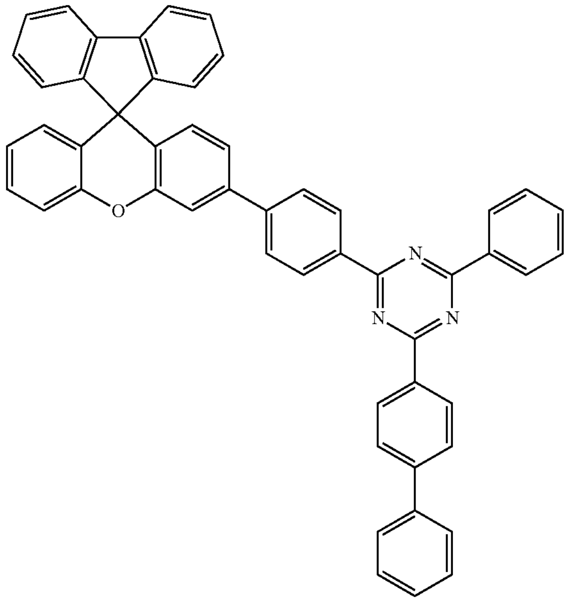
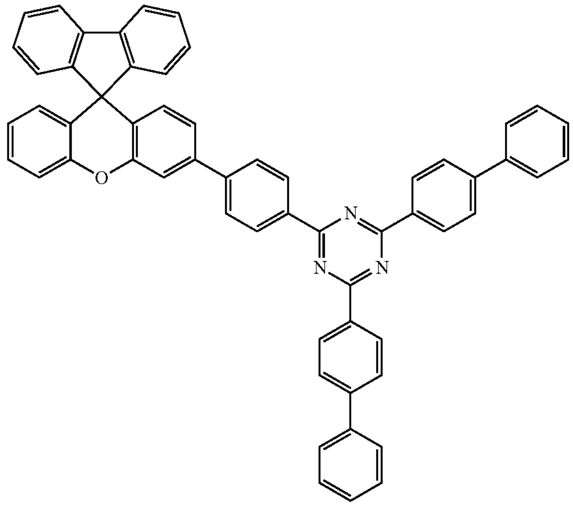
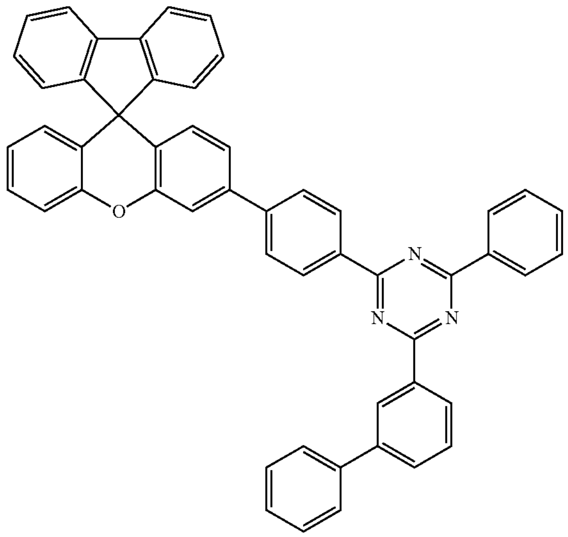
-continued
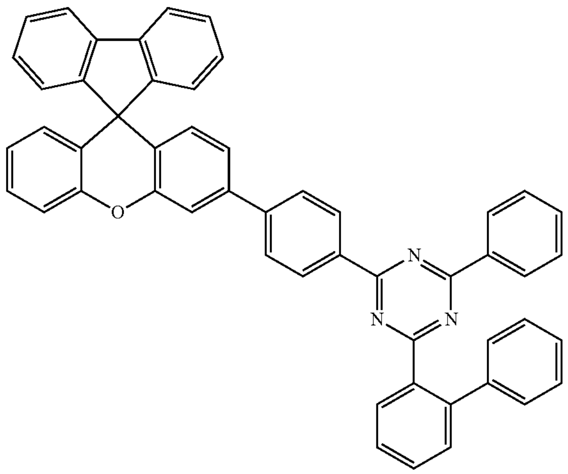
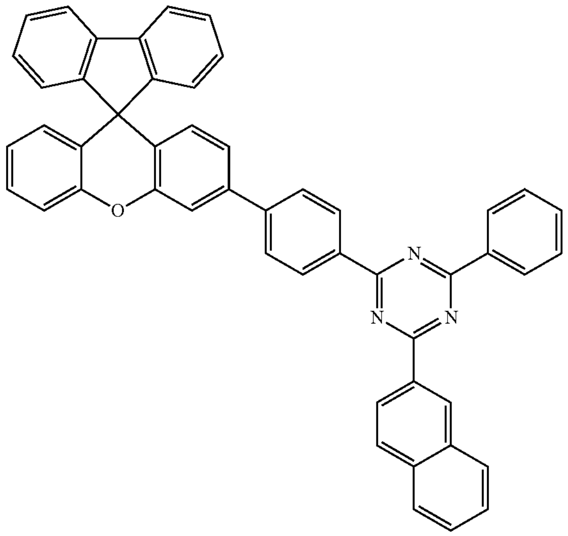
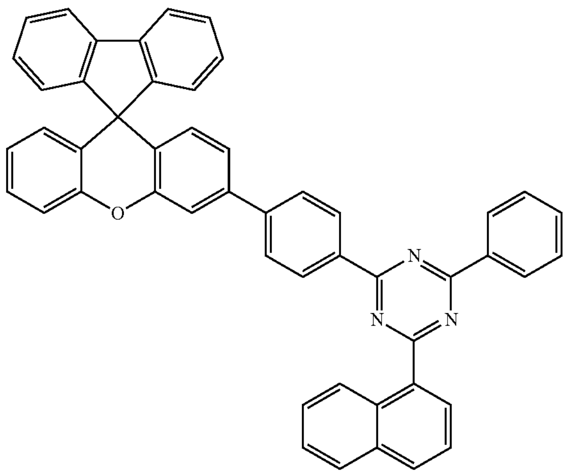

-continued
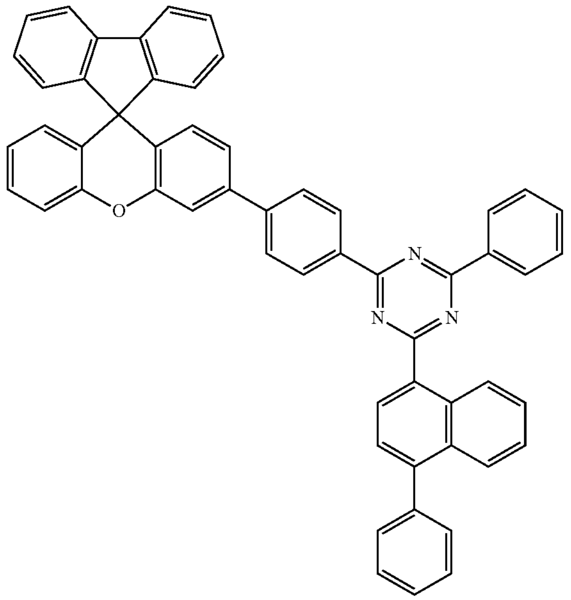
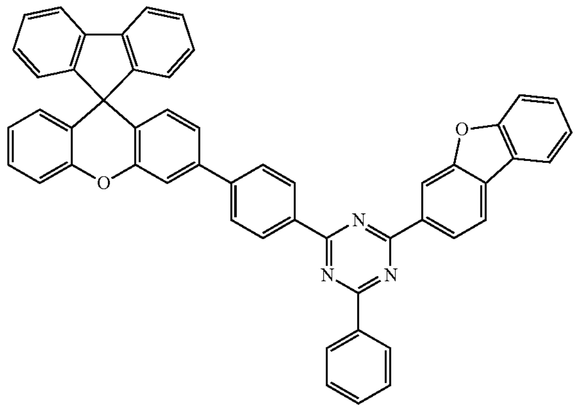
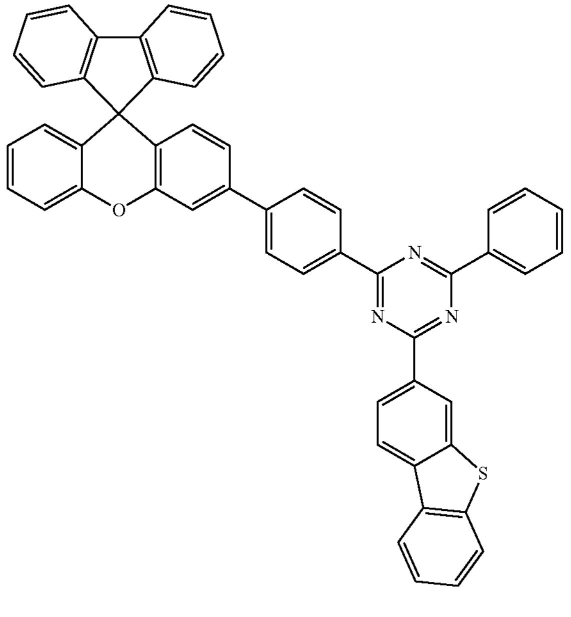
-continued
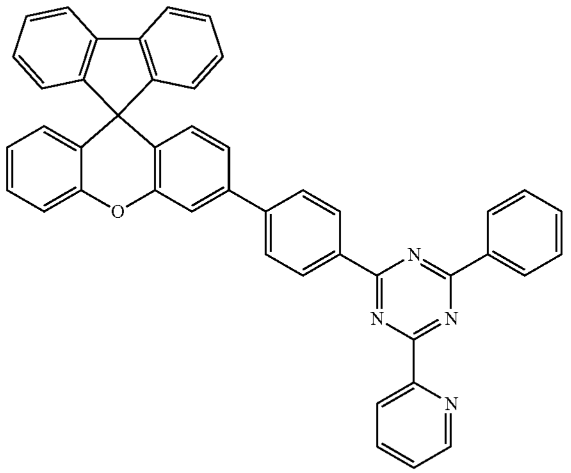
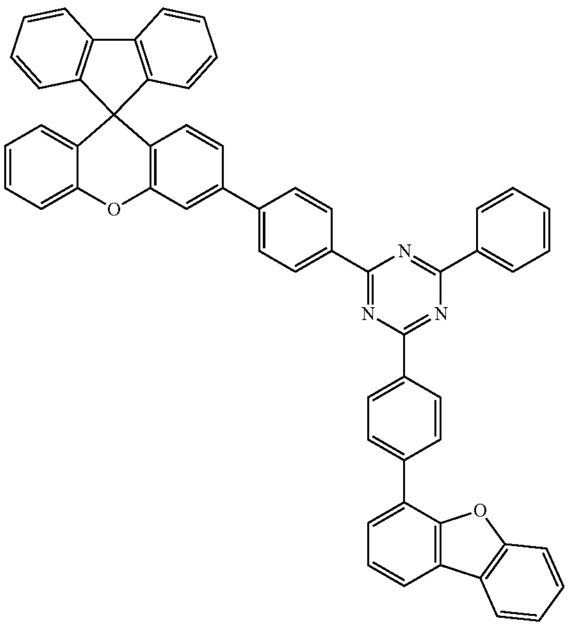
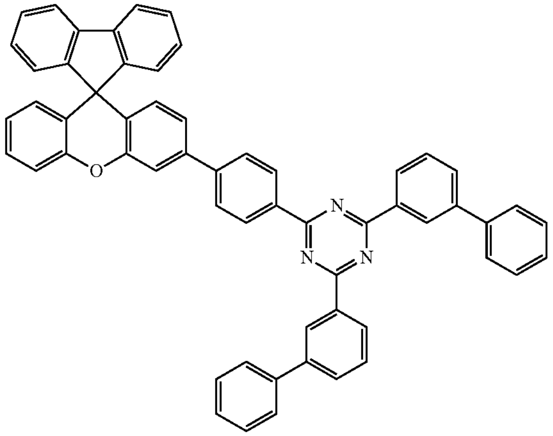

-continued
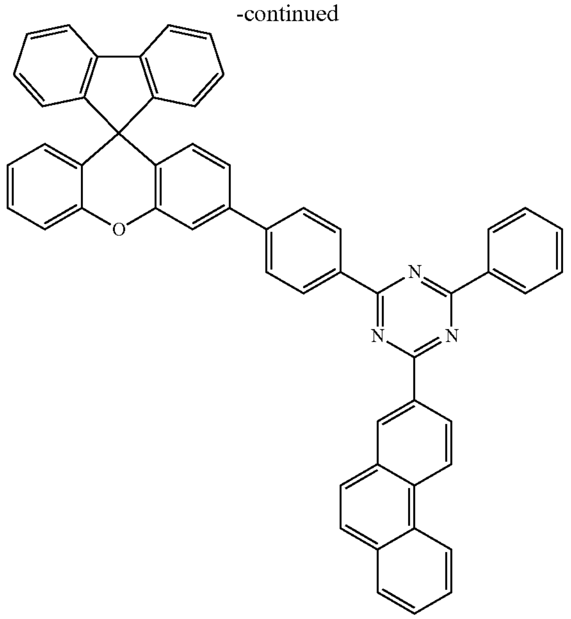
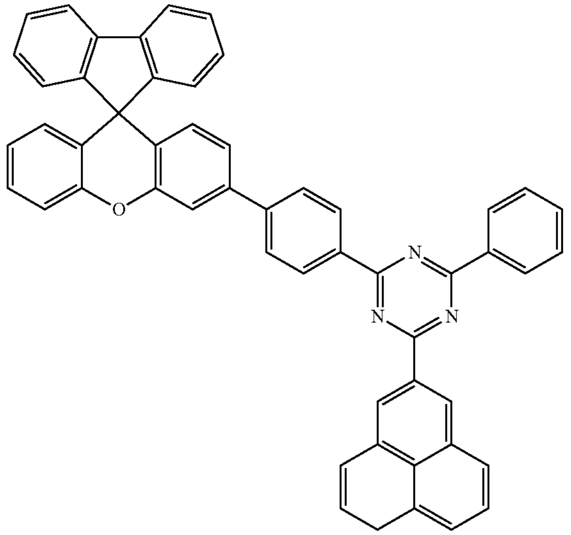
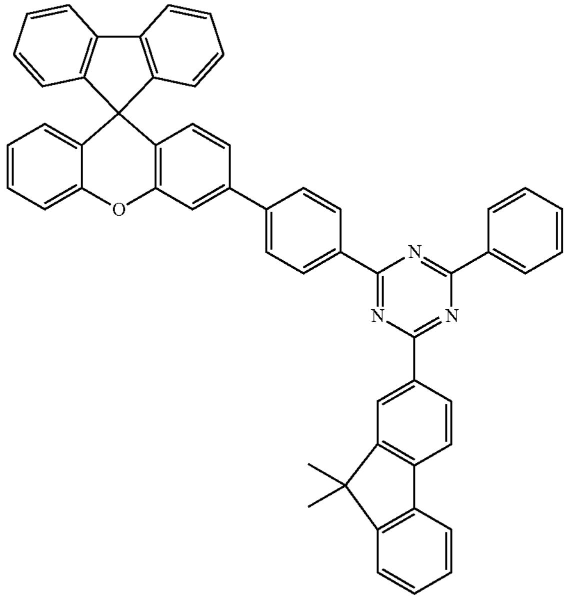
-continued
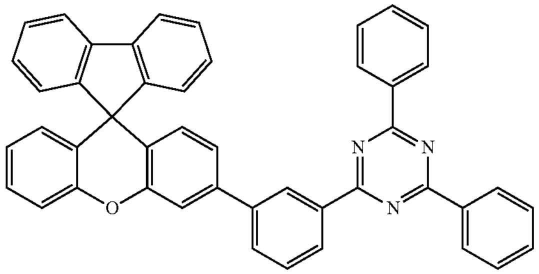
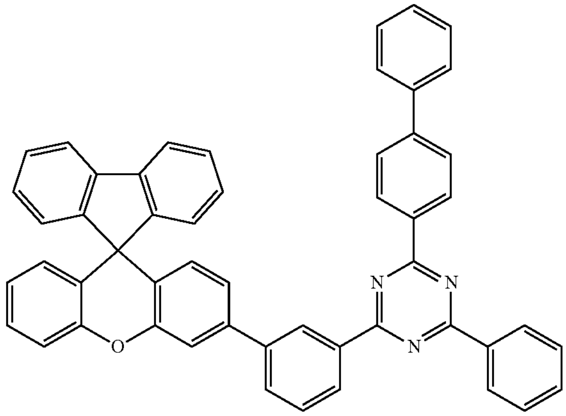
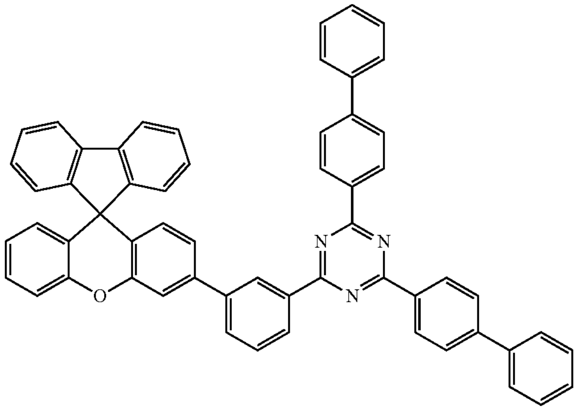
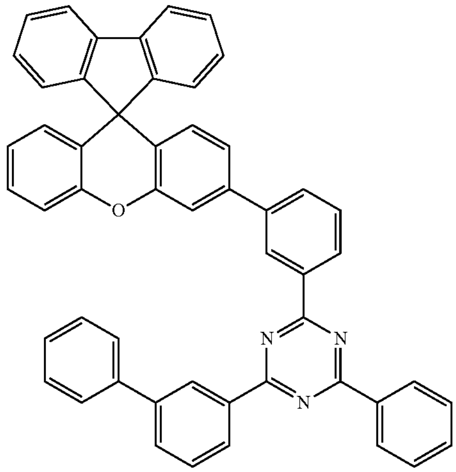

-continued
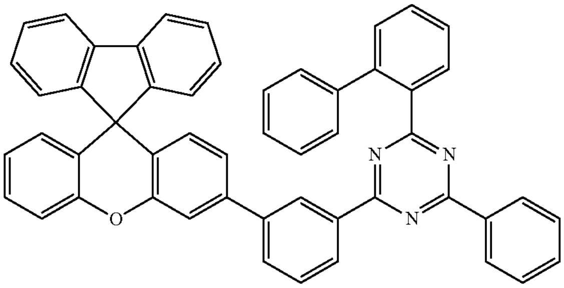
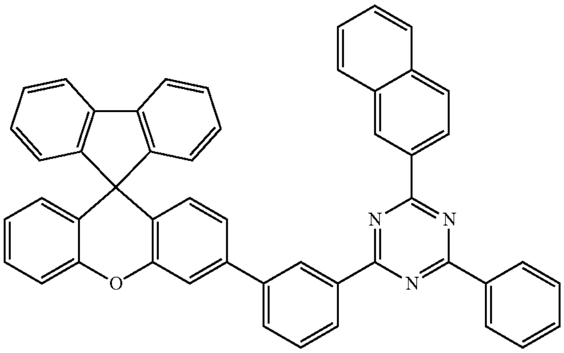
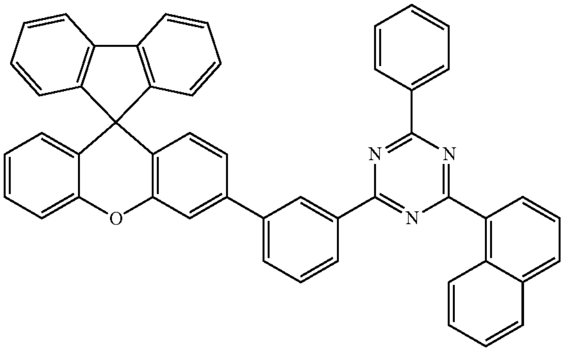
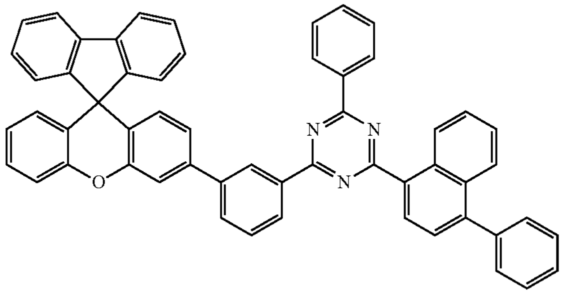
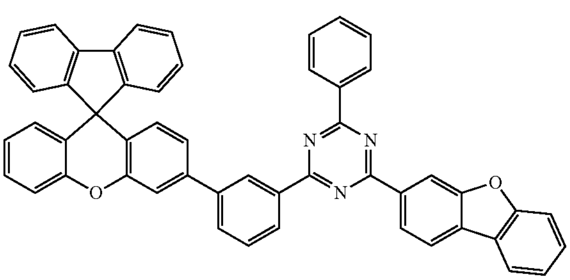
-continued
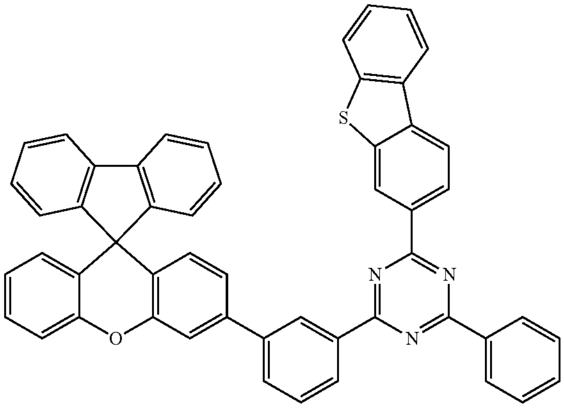
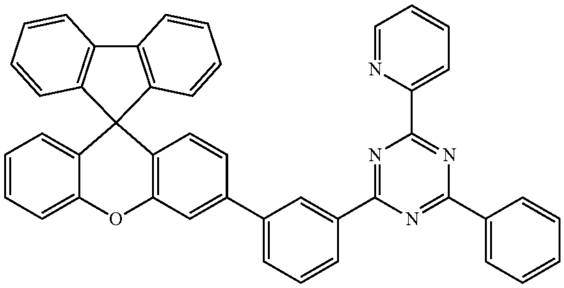
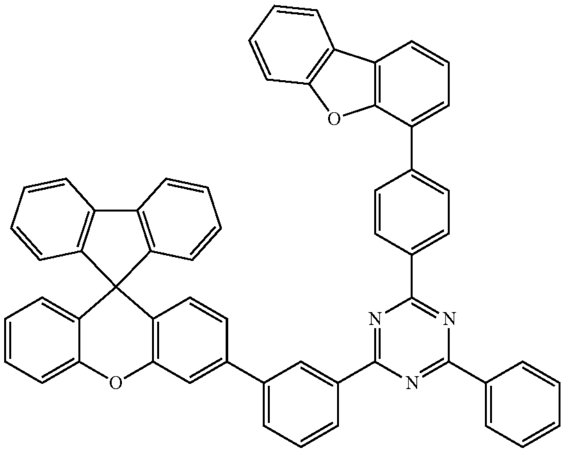
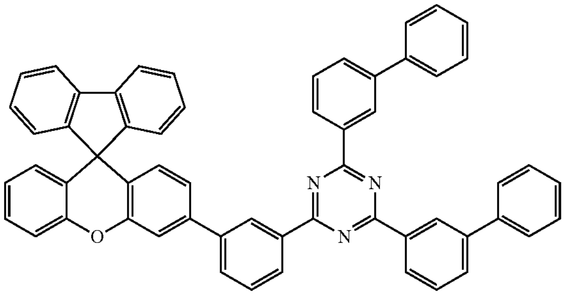

-continued
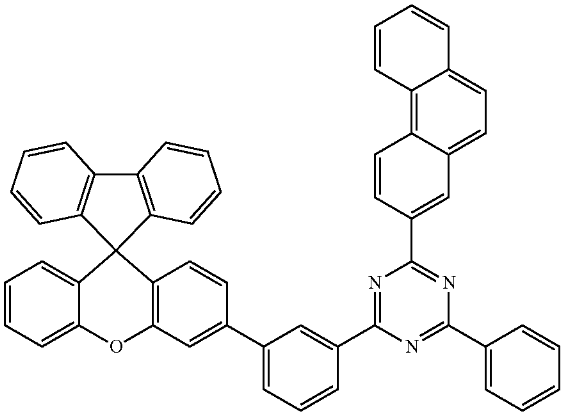
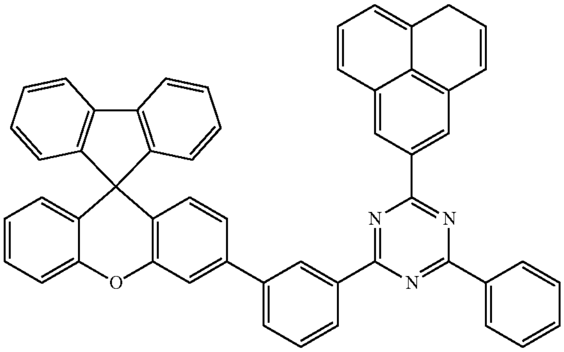
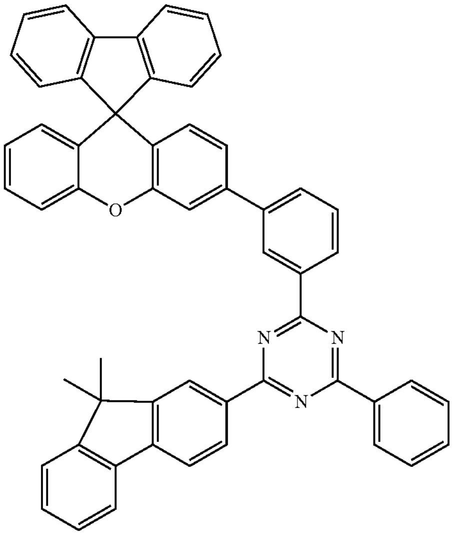
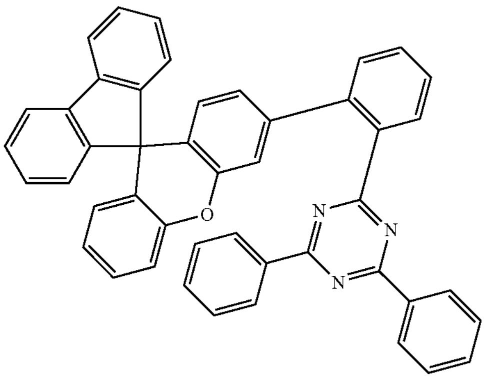
-continued
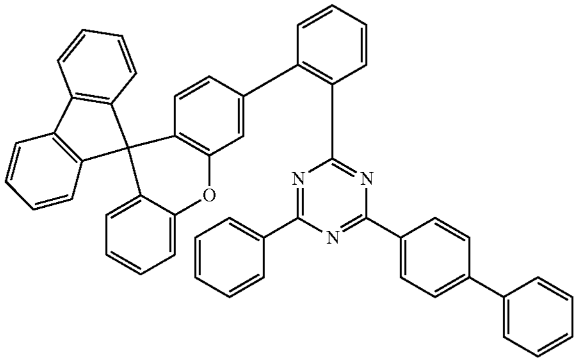
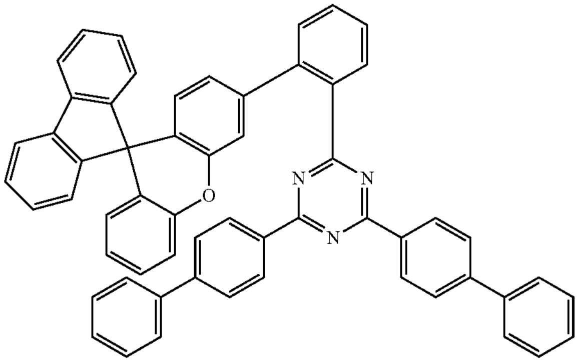
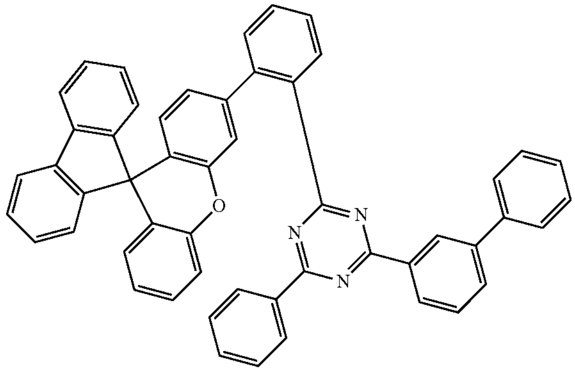
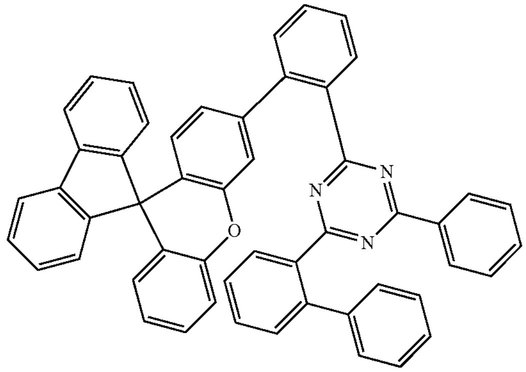

-continued
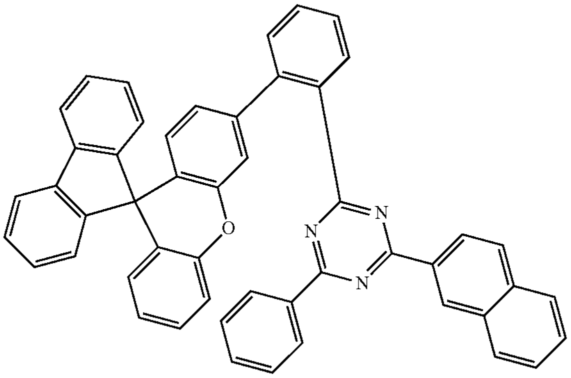
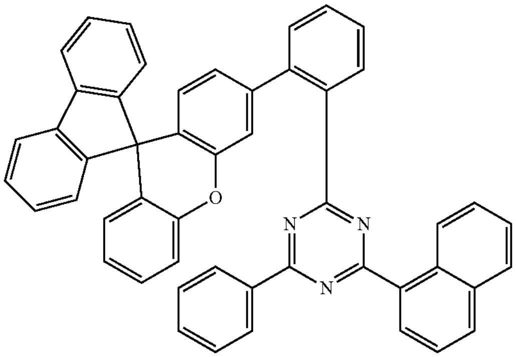
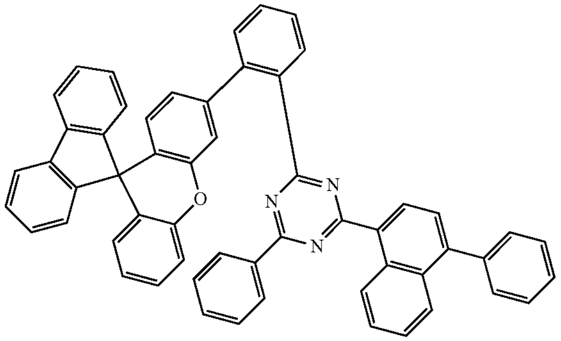
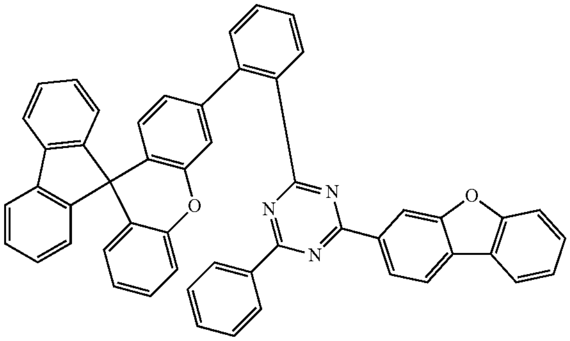
-continued
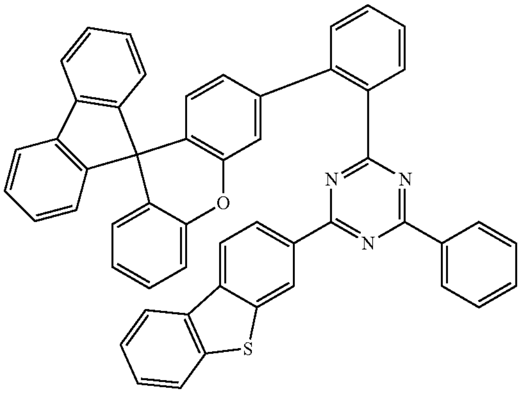
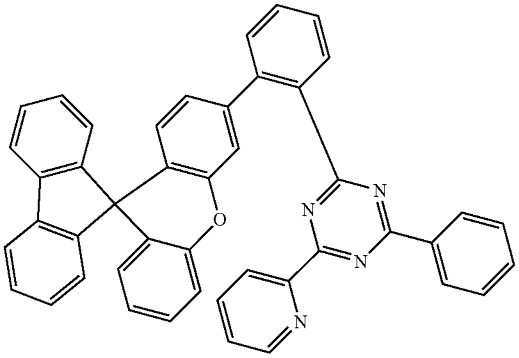
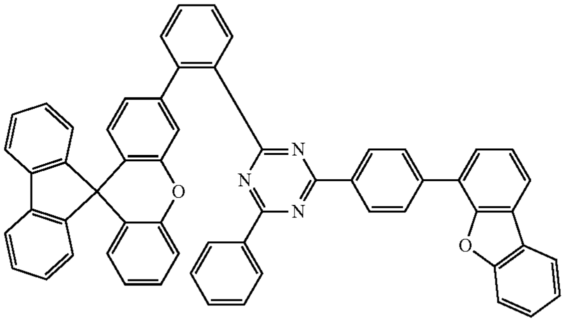
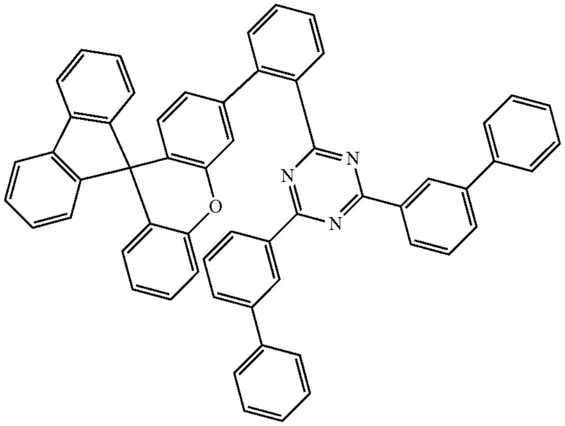

-continued
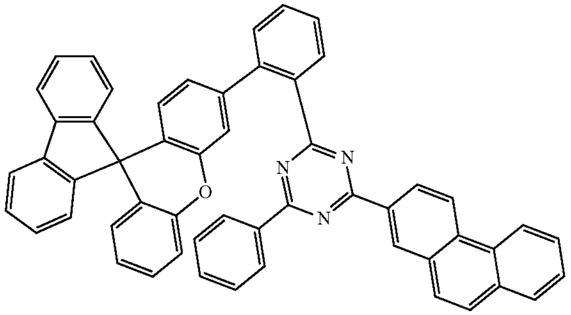
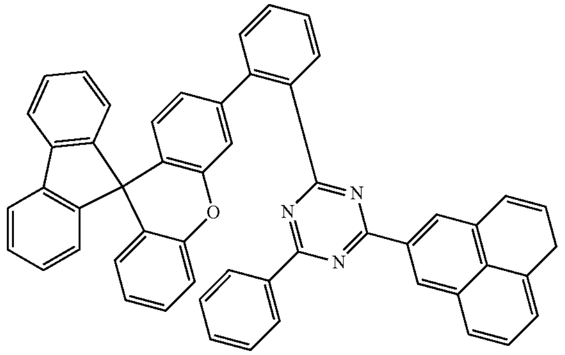
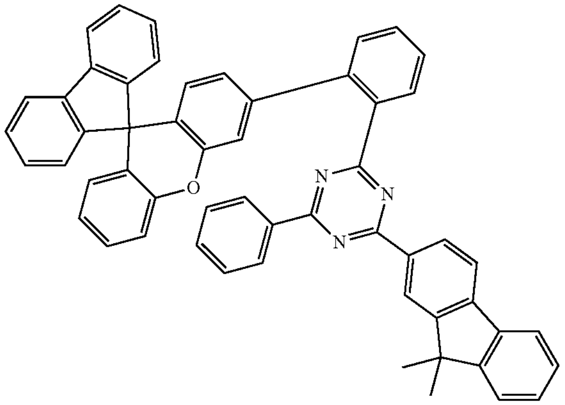
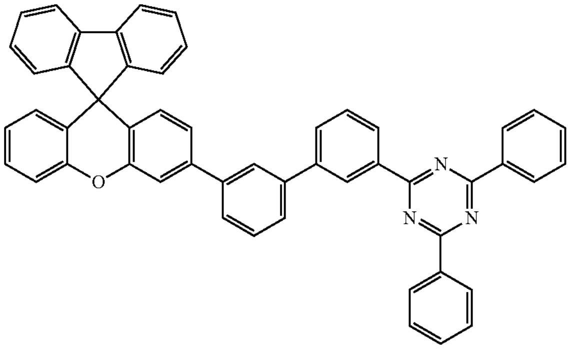
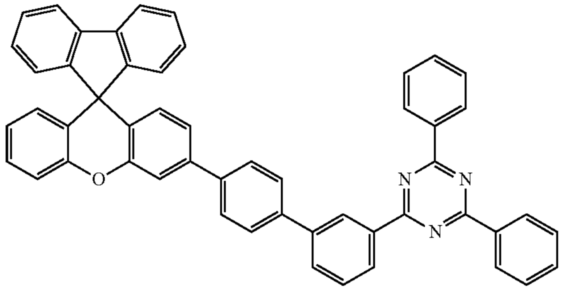
-continued
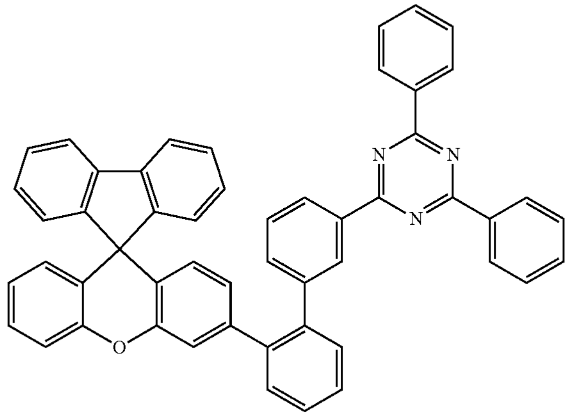
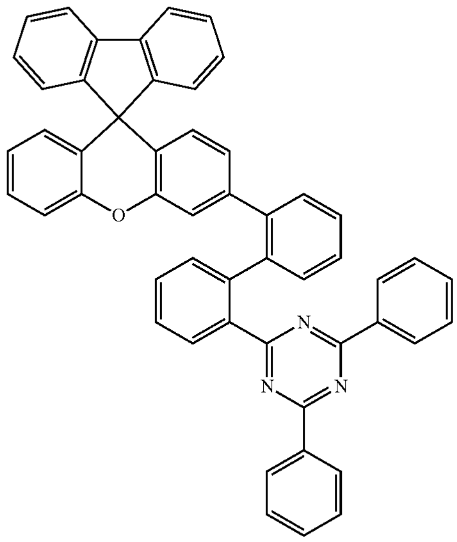
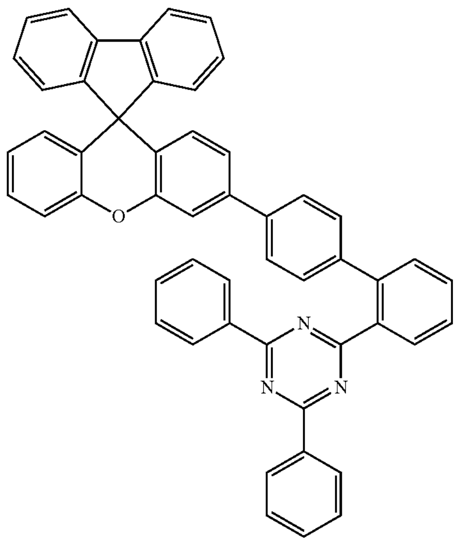

-continued
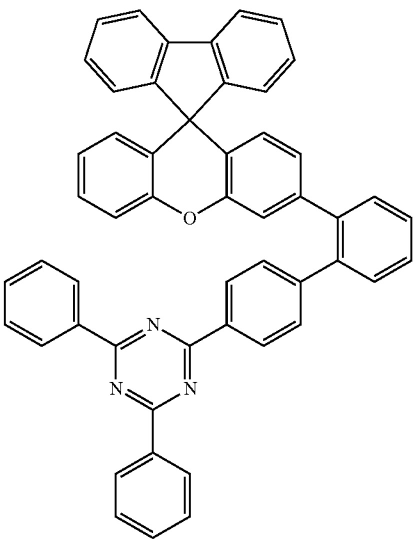
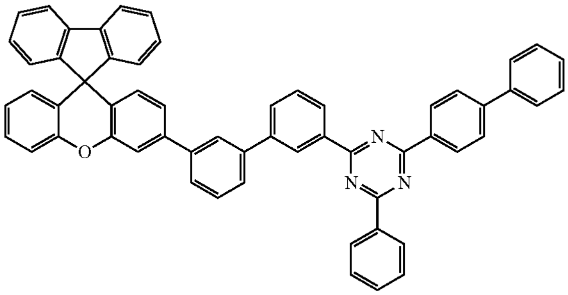
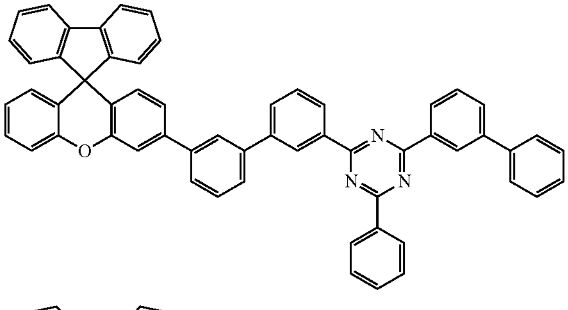
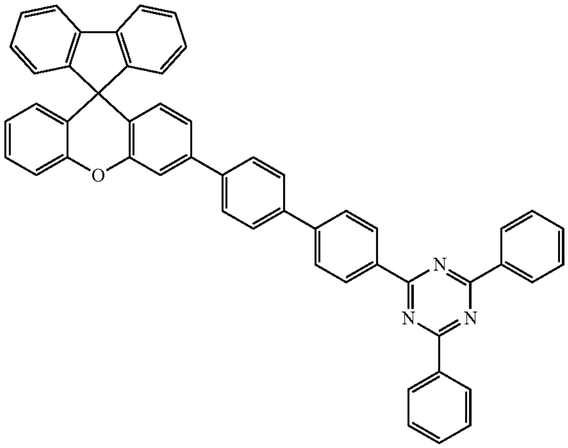
-continued
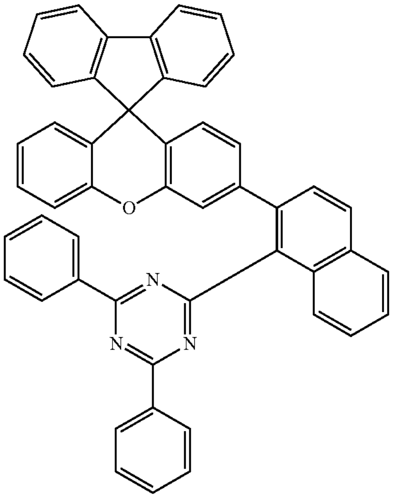
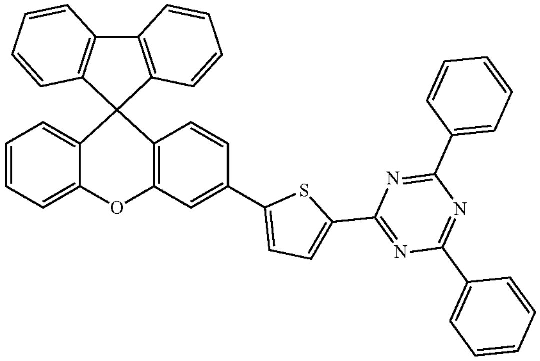
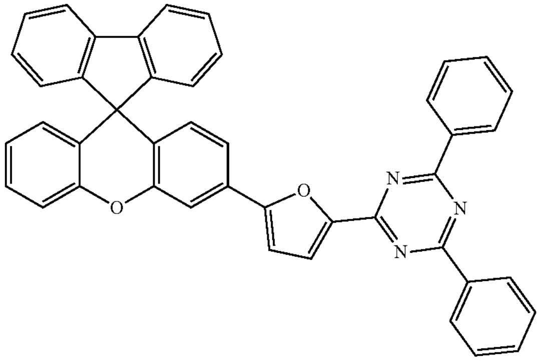
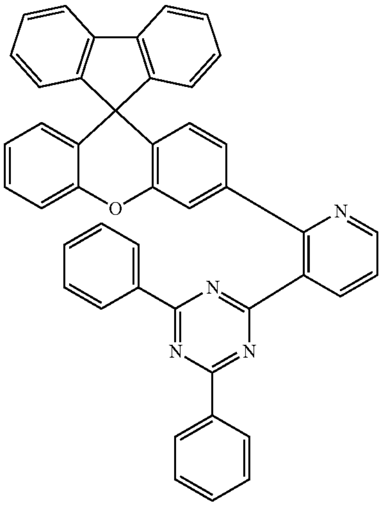

-continued
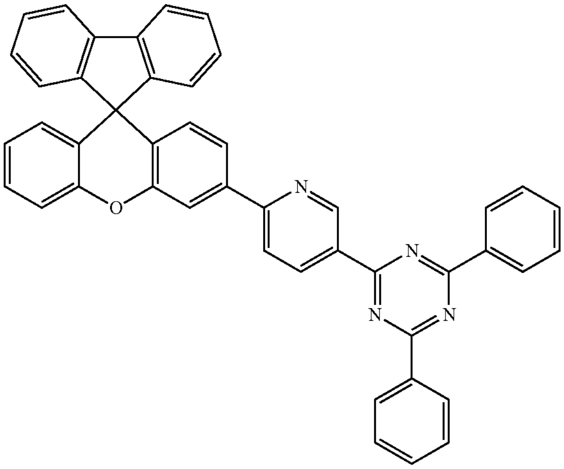
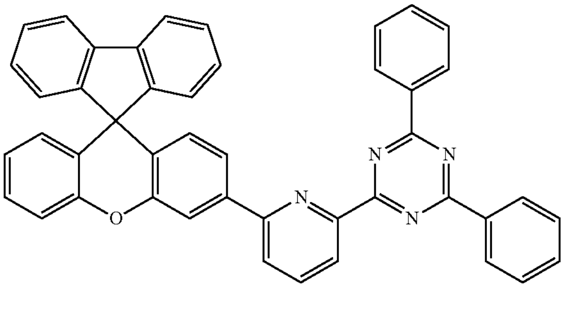
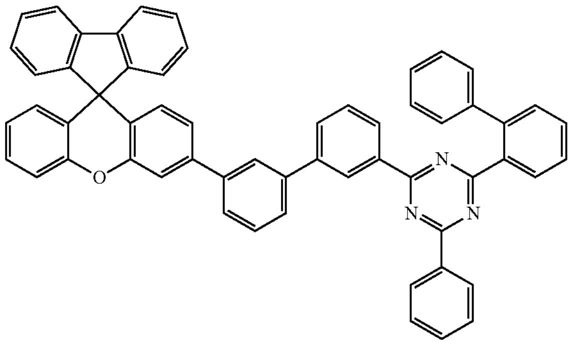
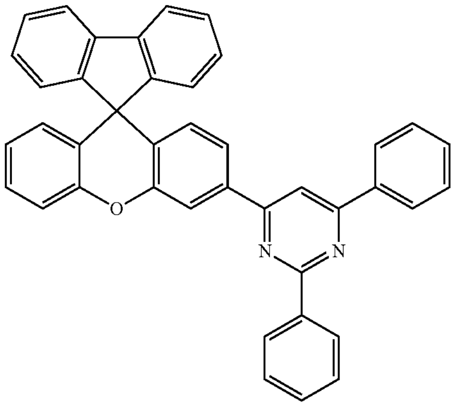
-continued
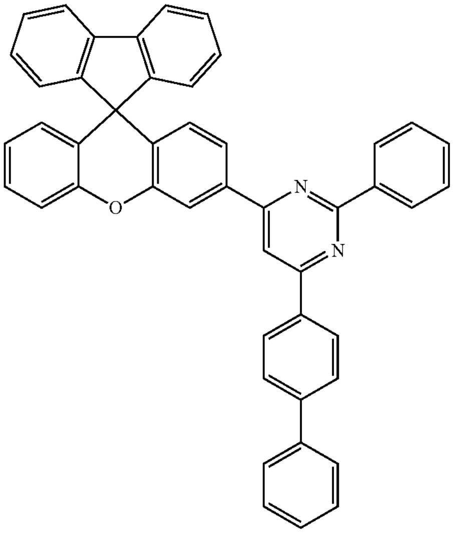
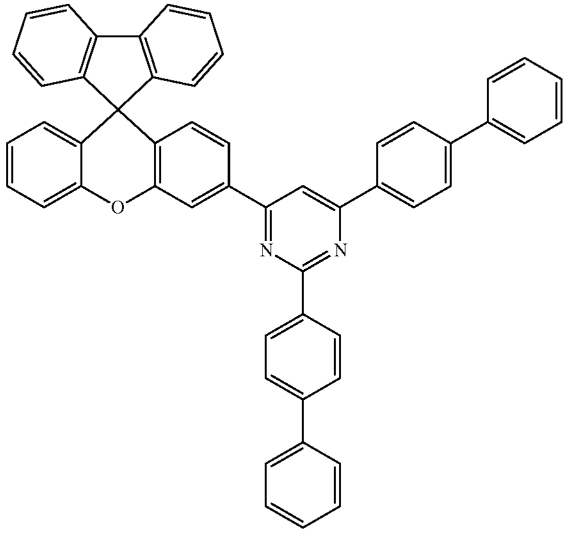
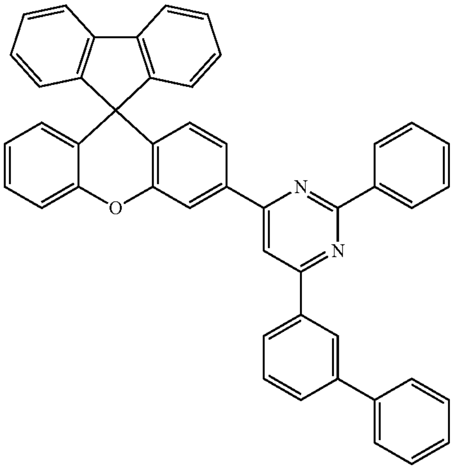

-continued
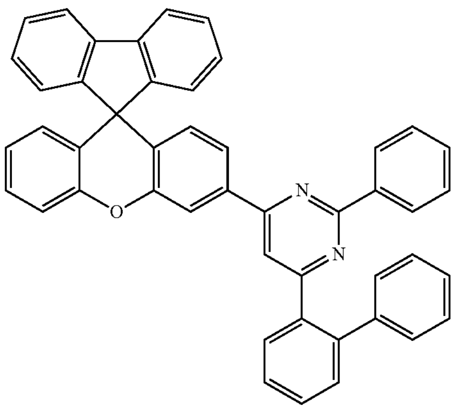
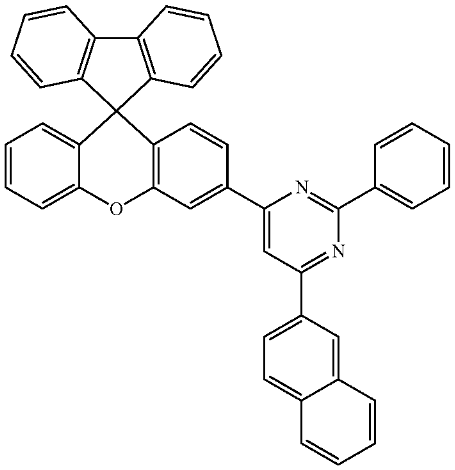
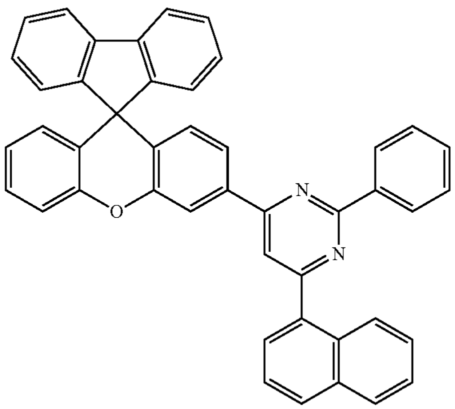
-continued
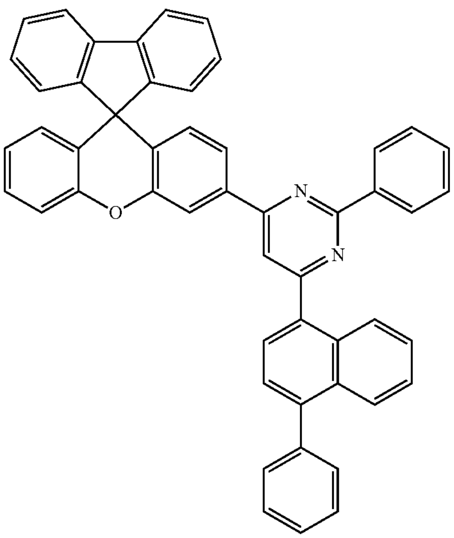
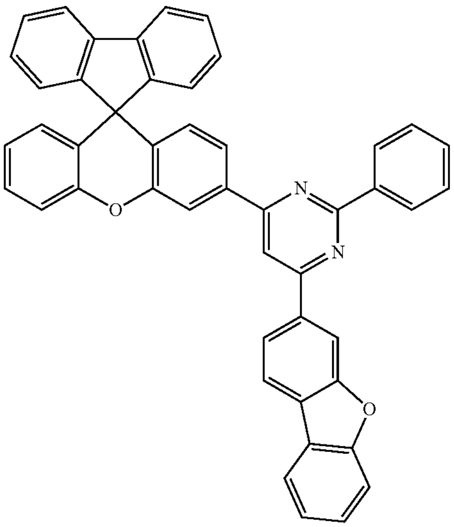
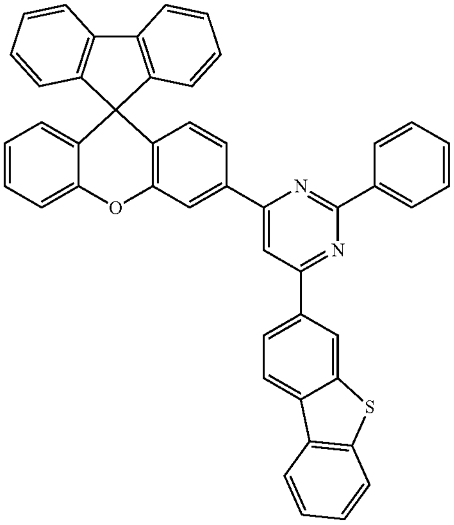

-continued
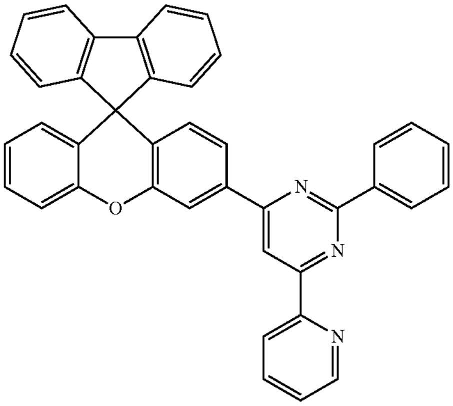
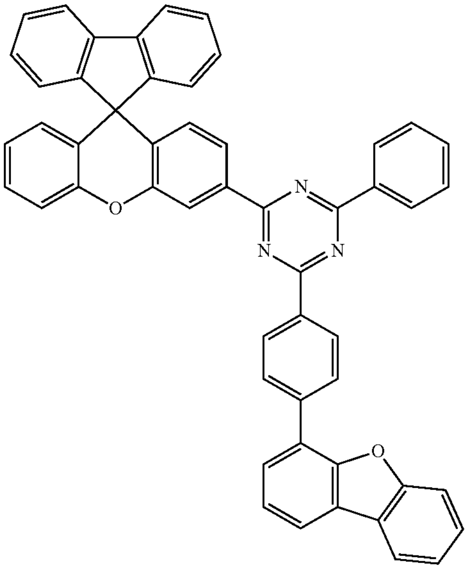
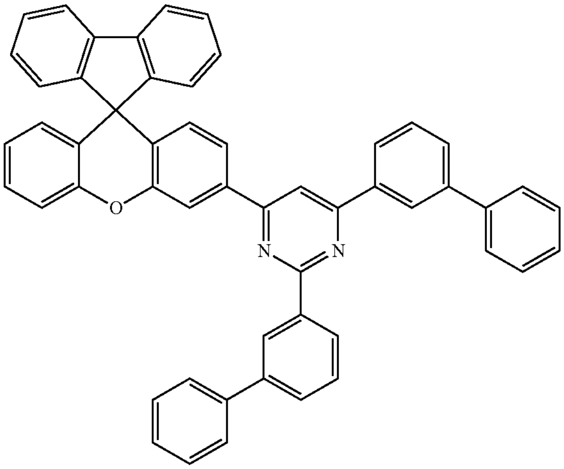
-continued
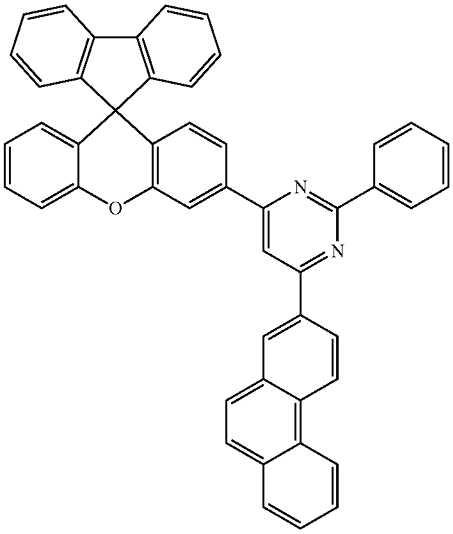
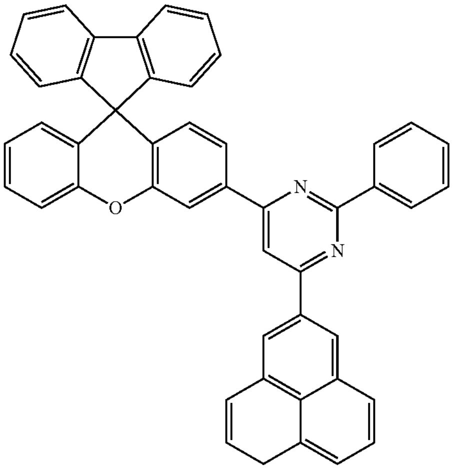
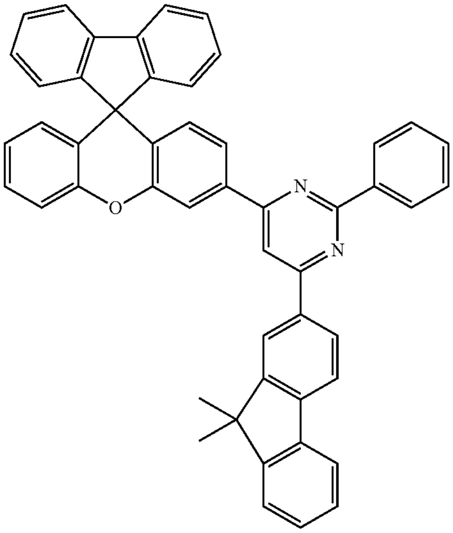

-continued
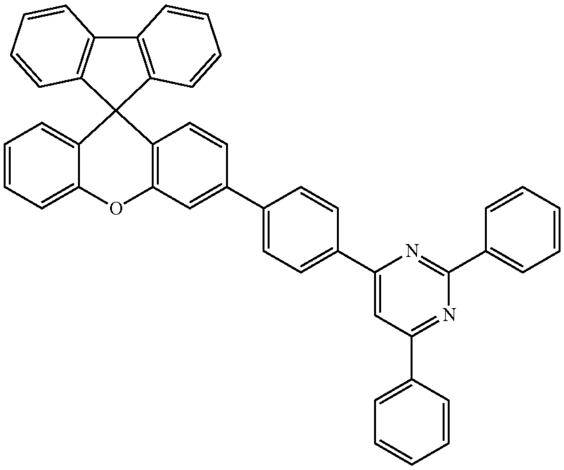
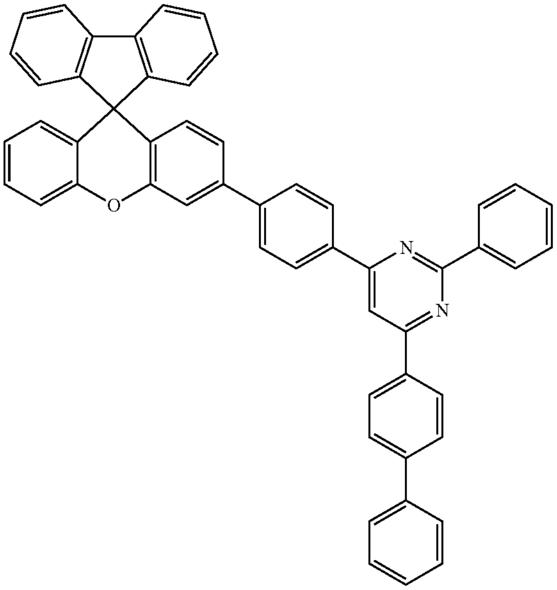
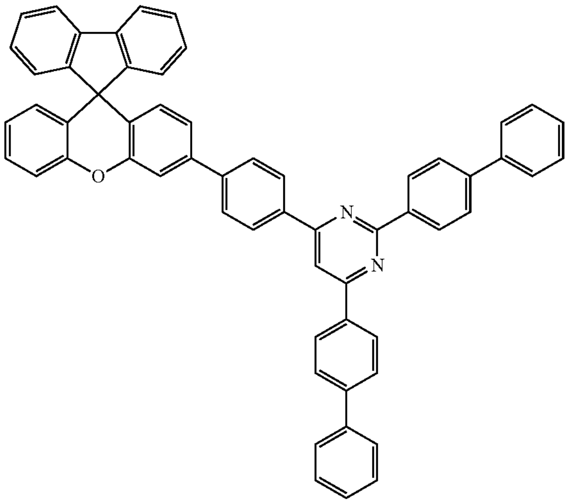
-continued
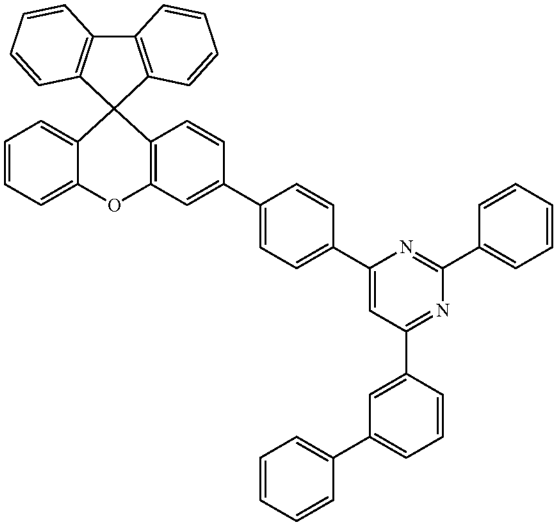
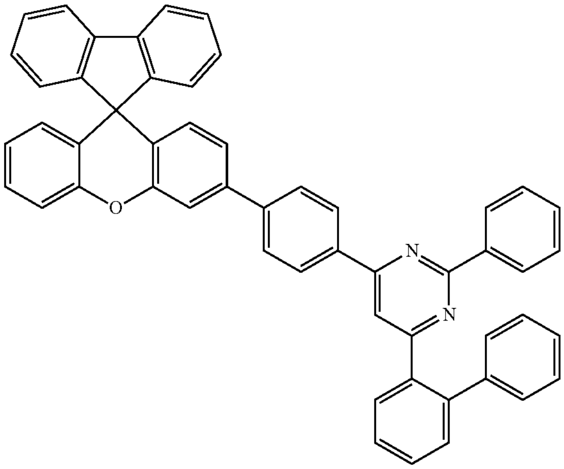
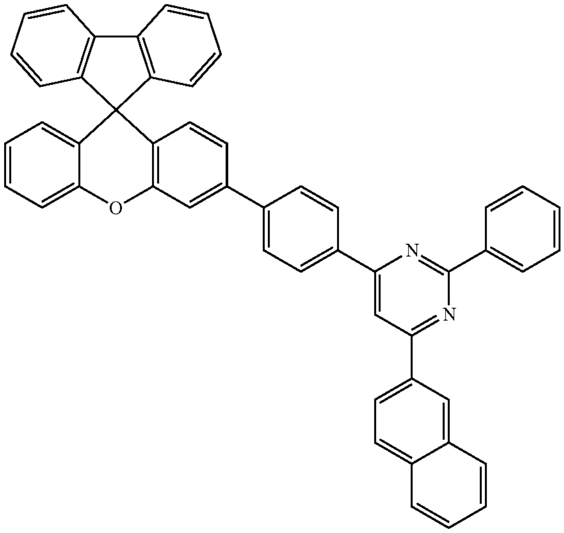

-continued
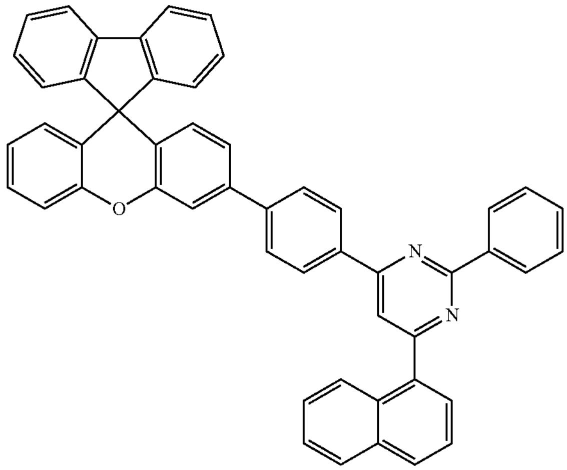
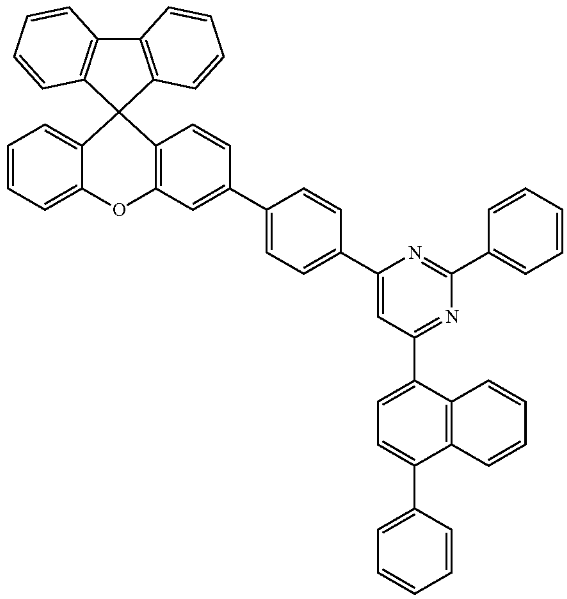
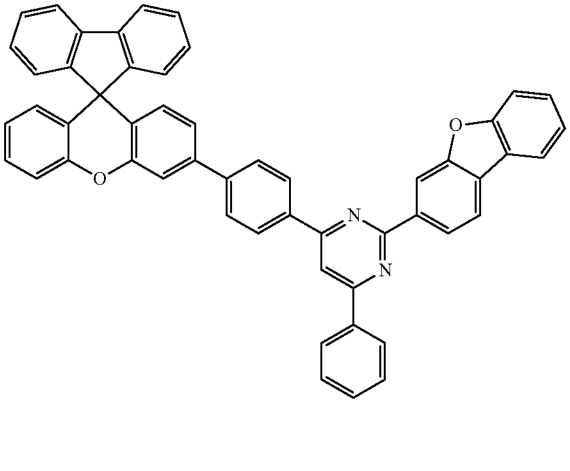
-continued
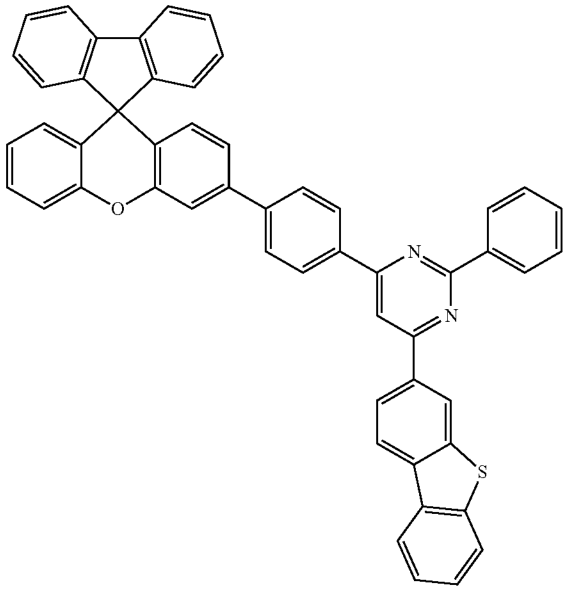
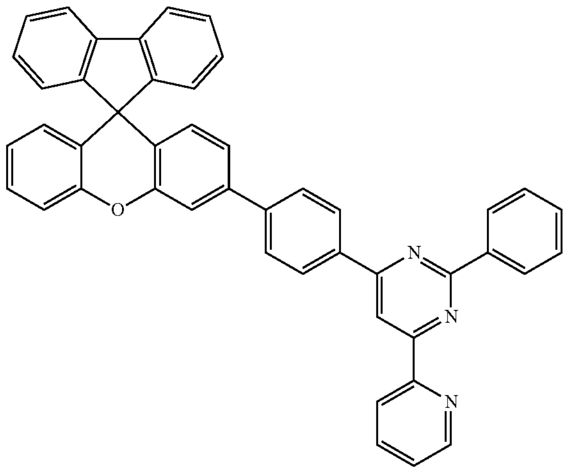
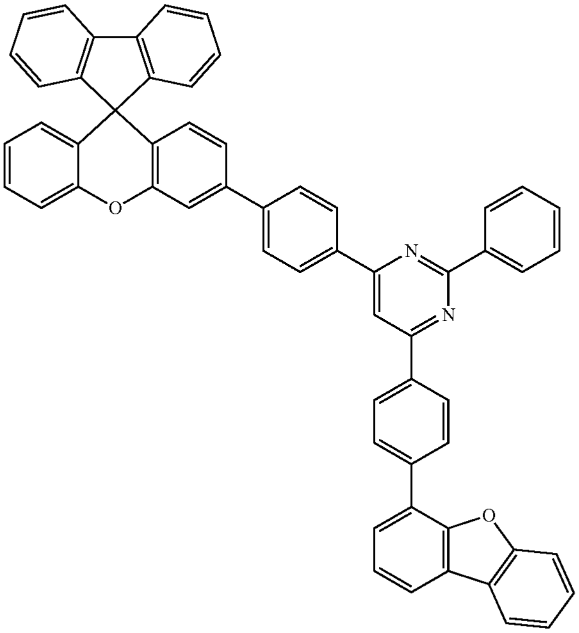

-continued
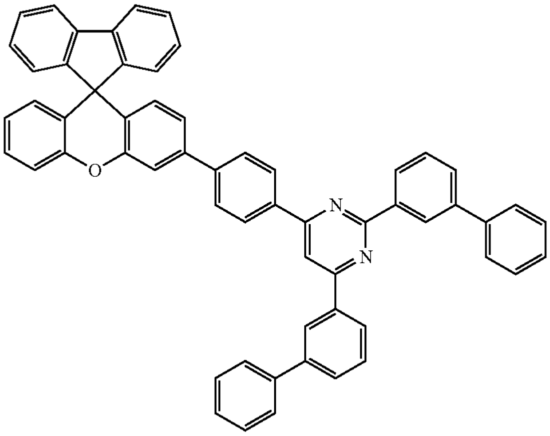
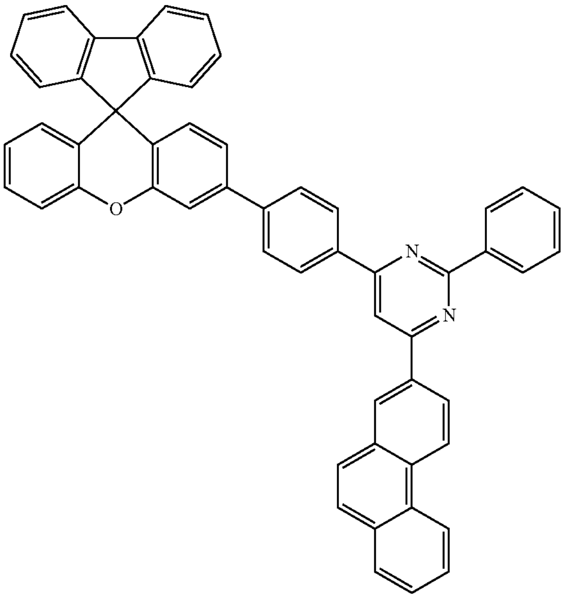
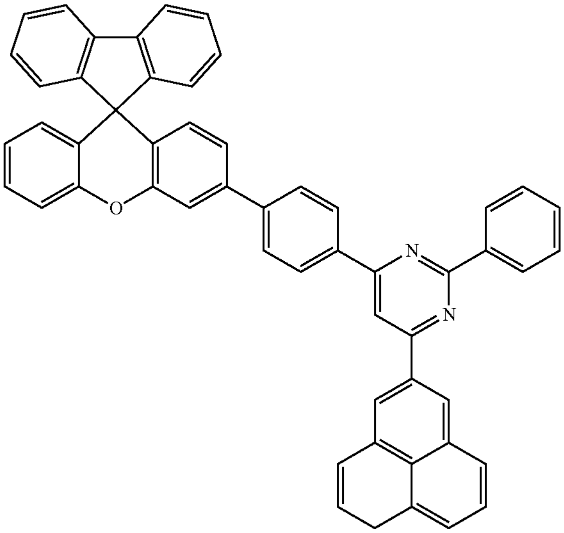
-continued
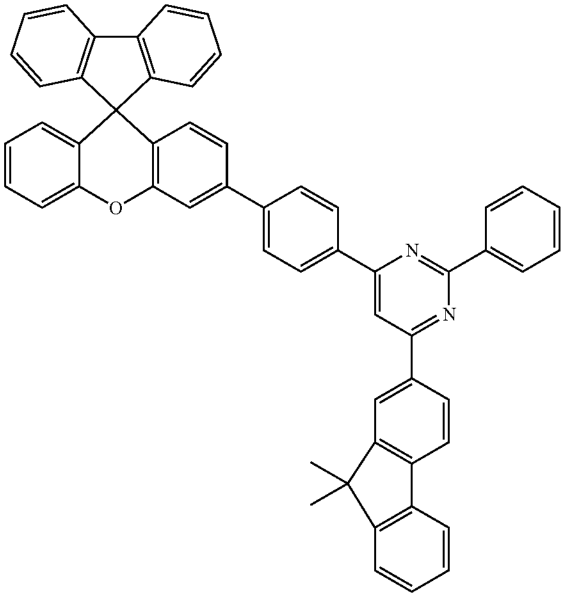
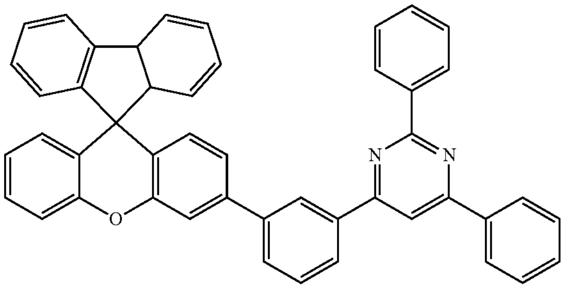
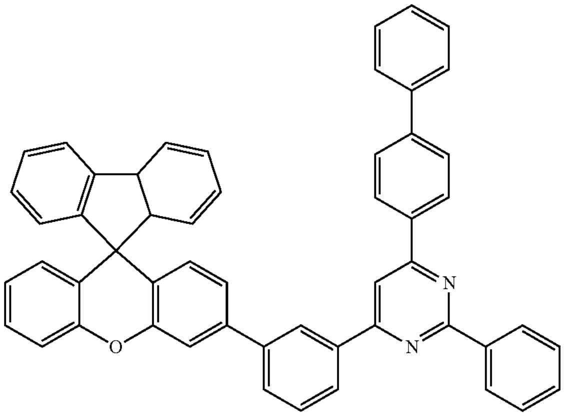
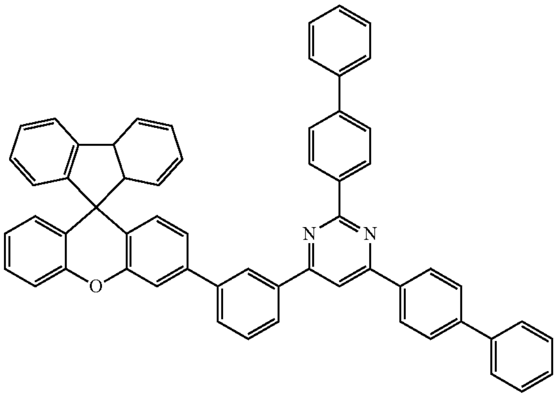

-continued
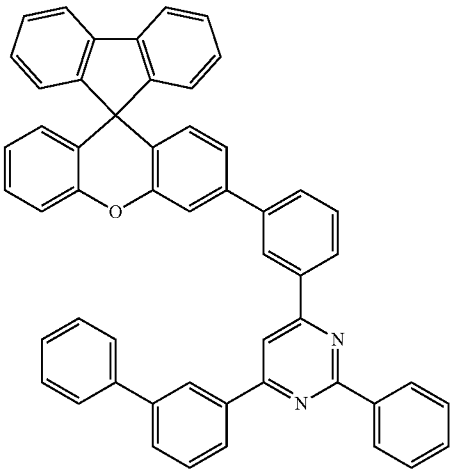
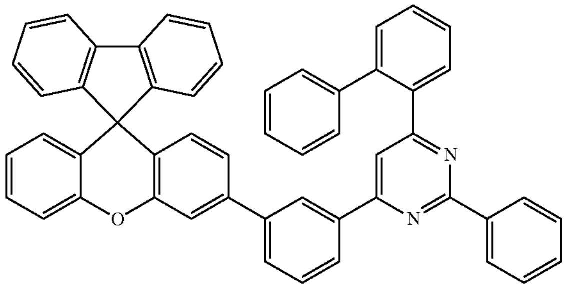
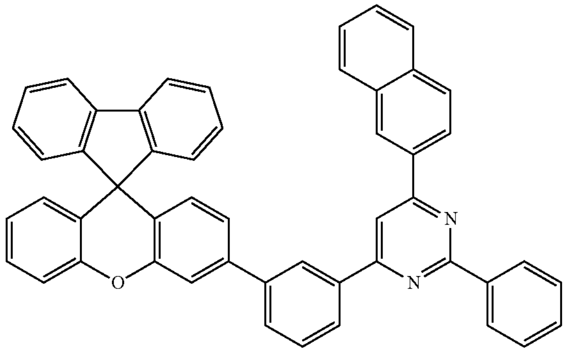
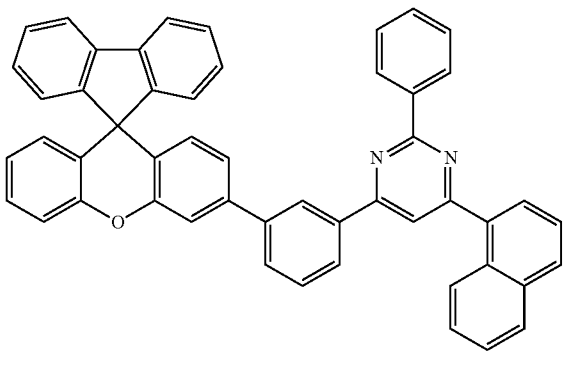
-continued
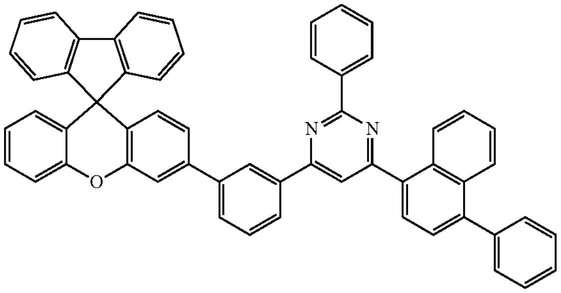
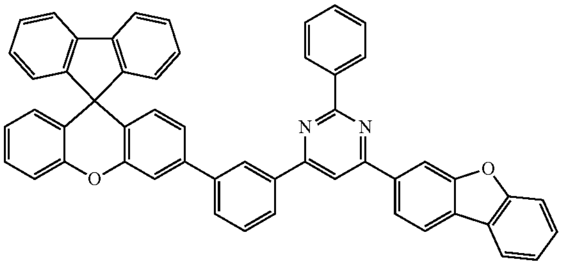
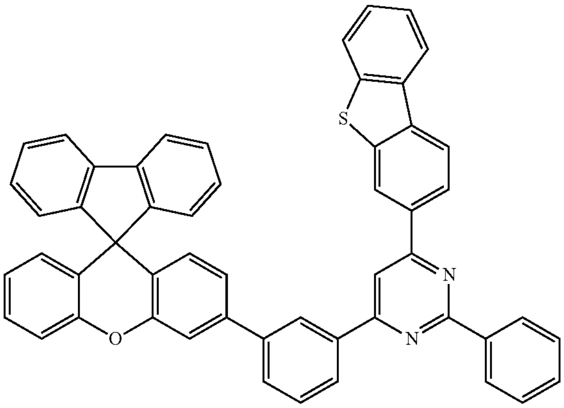
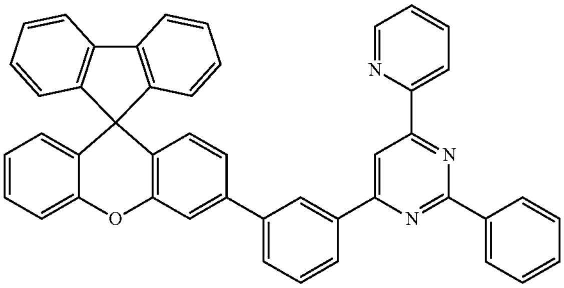
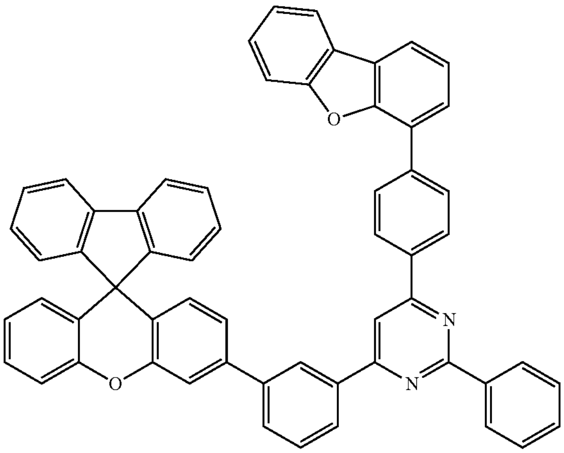

-continued
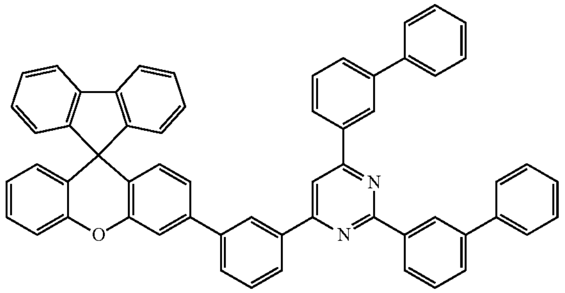
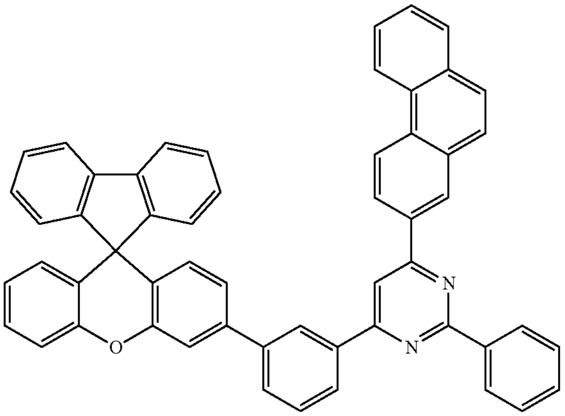
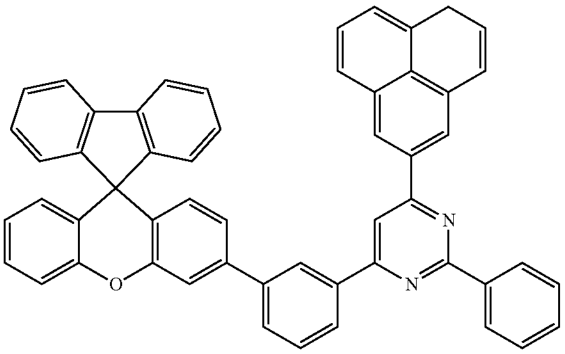
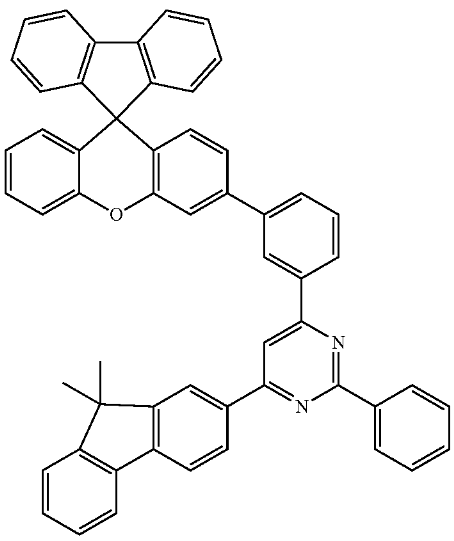
-continued
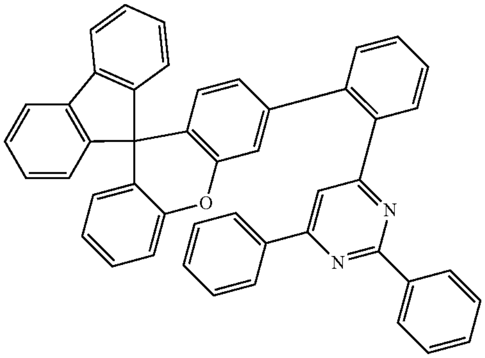
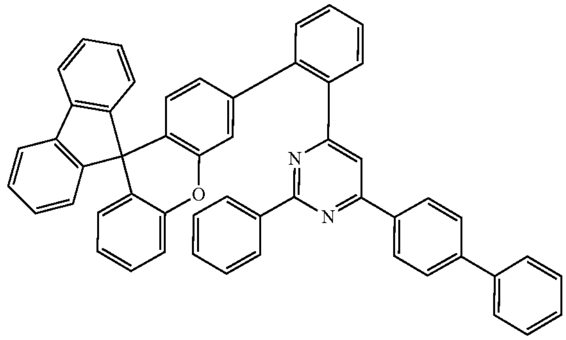
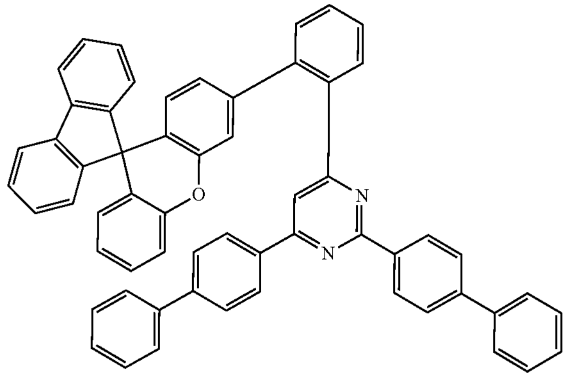
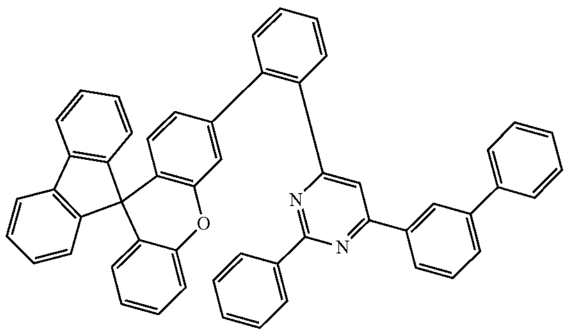

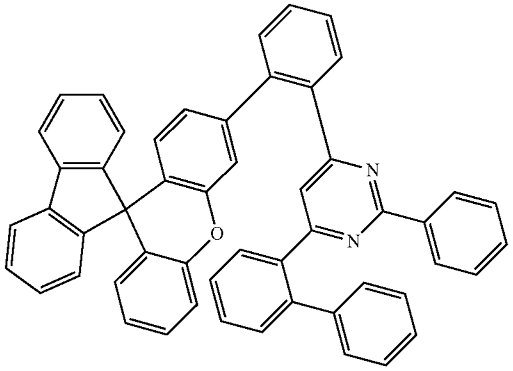
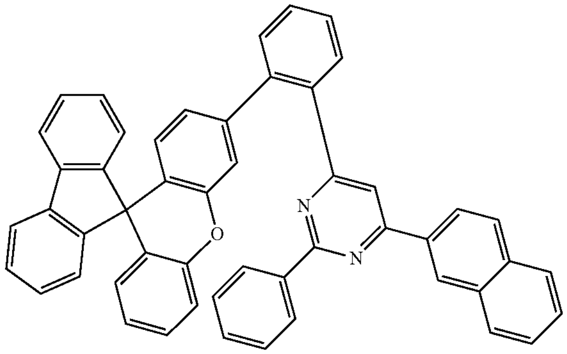
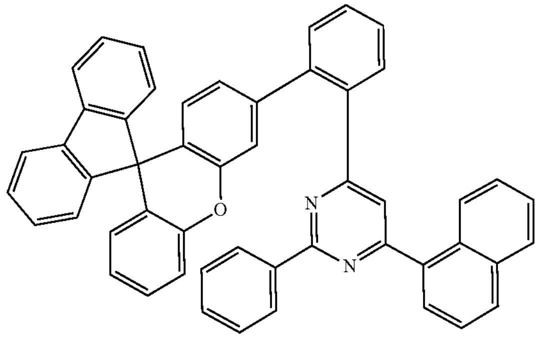
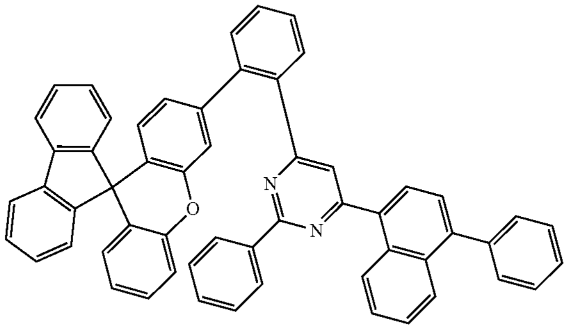
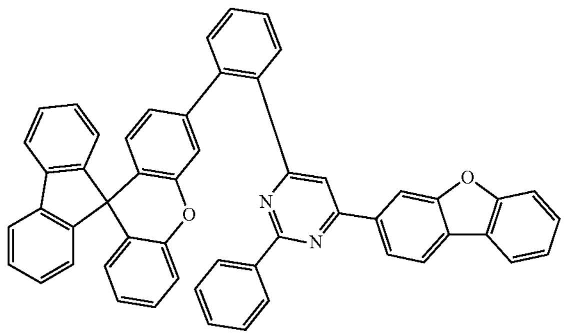
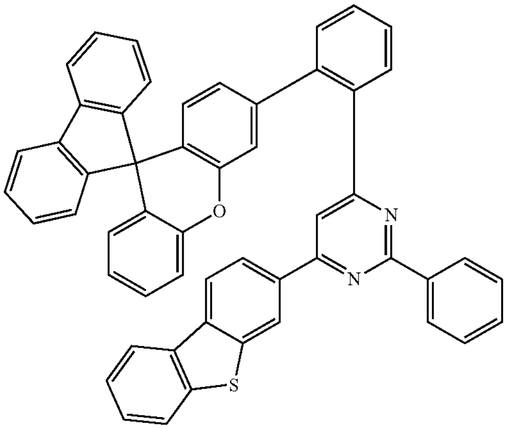
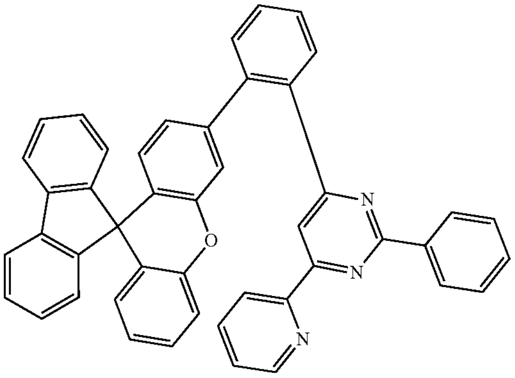
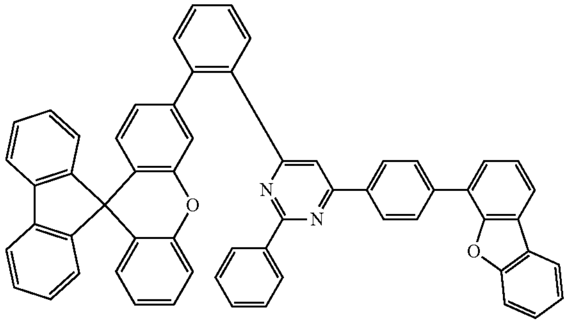
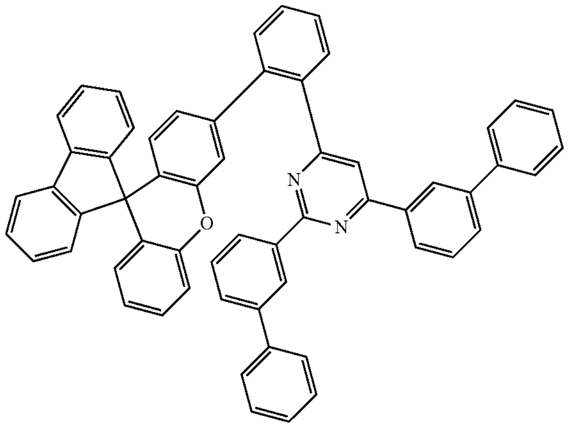

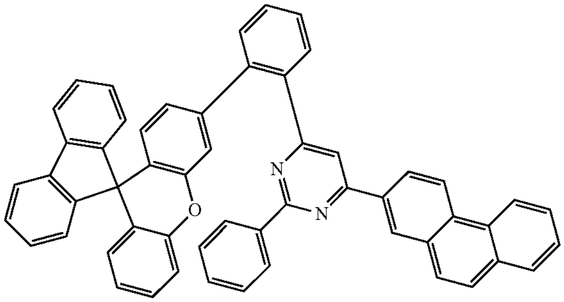
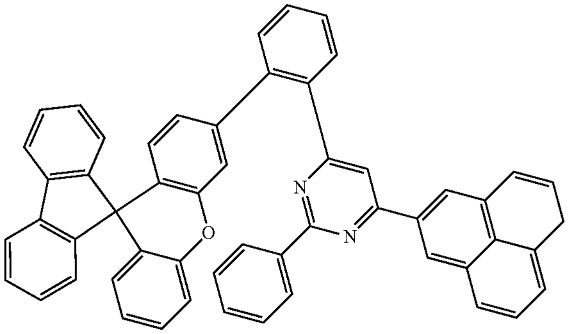
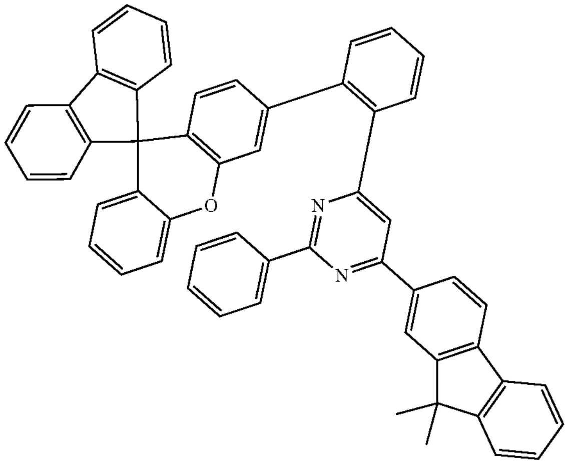
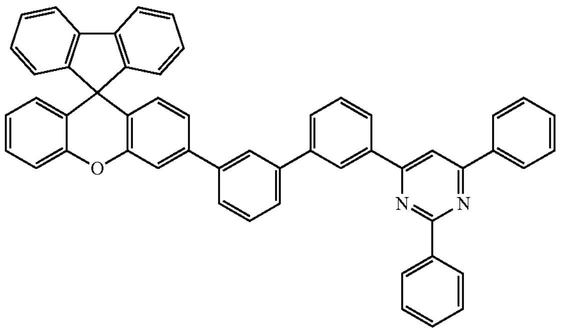
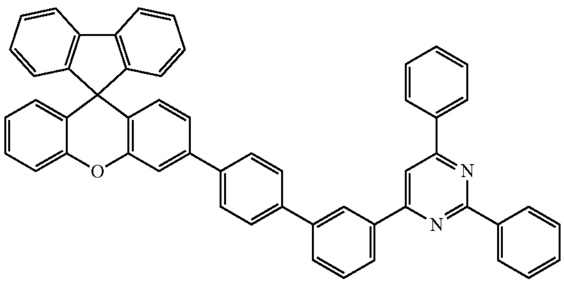
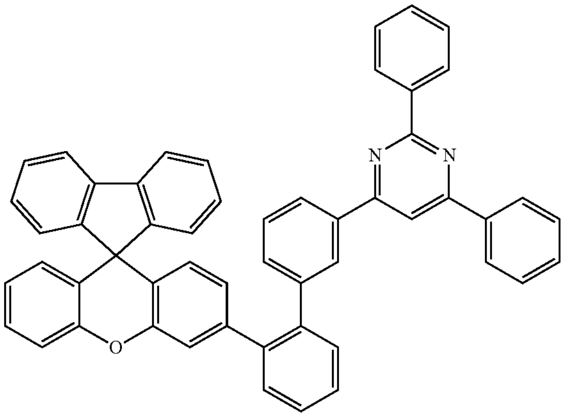
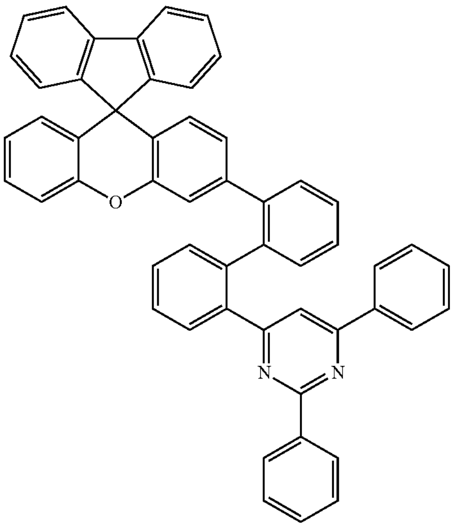
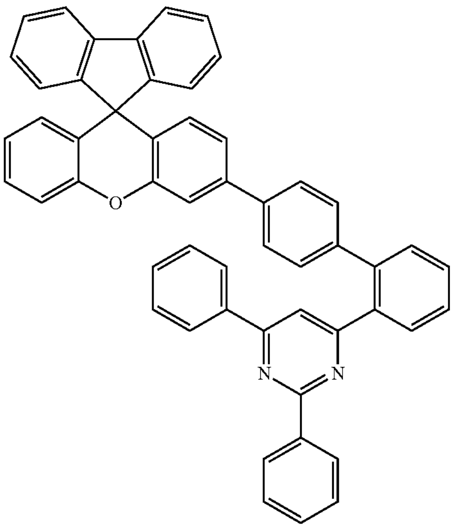

-continued
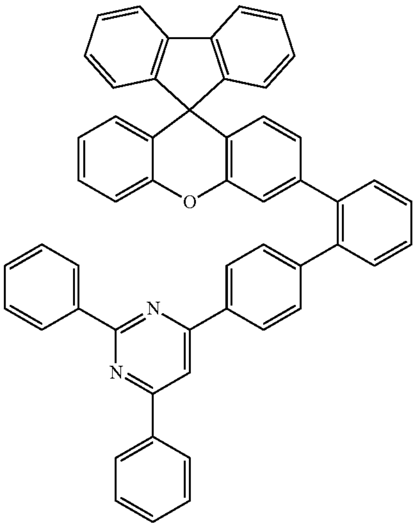
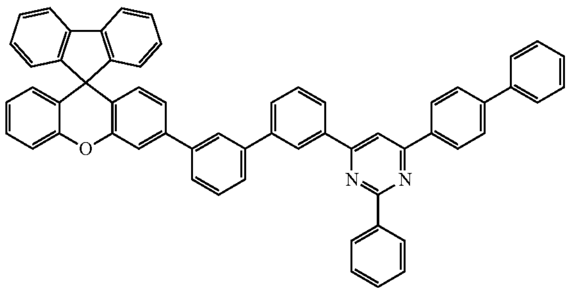
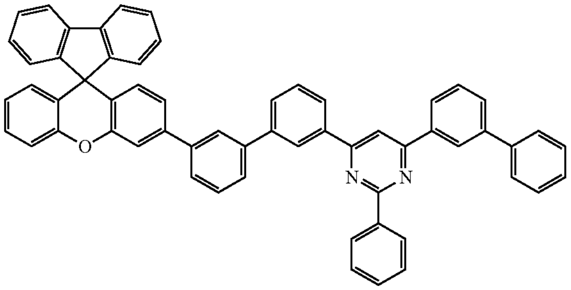
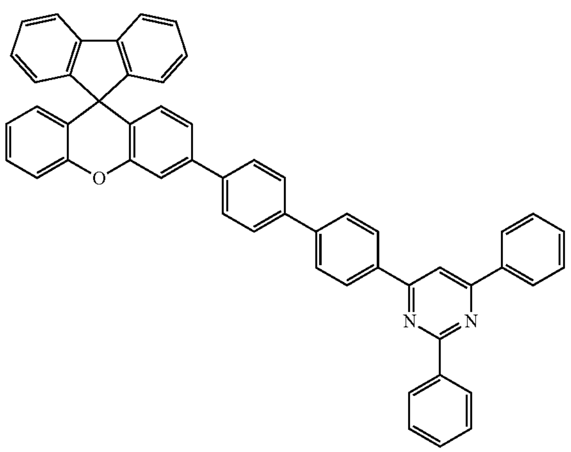
-continued
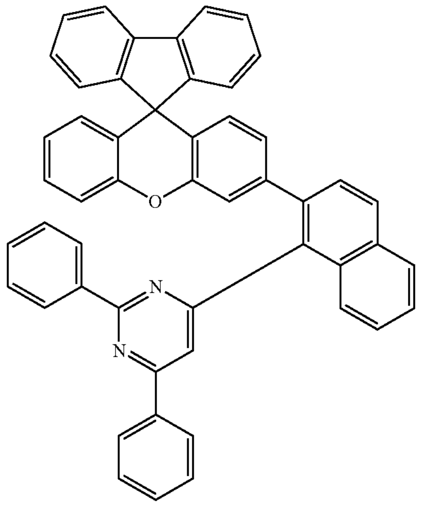
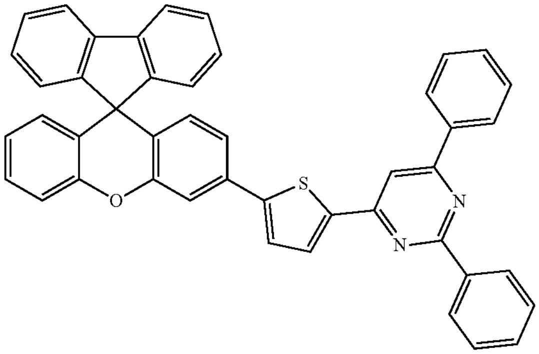
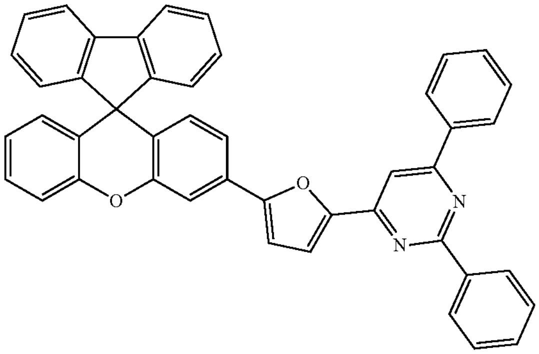
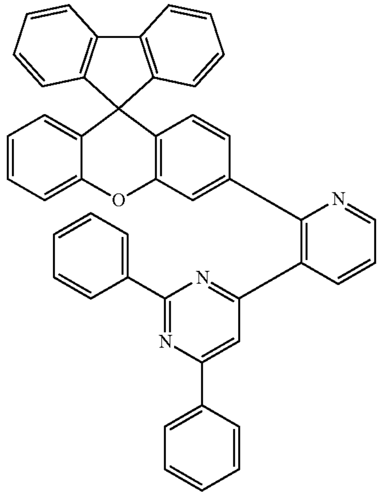

-continued
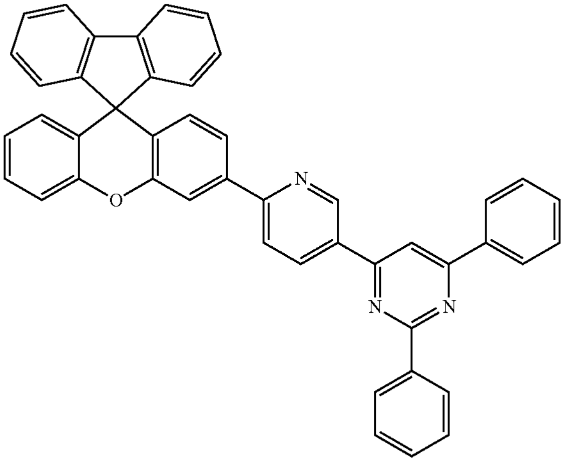
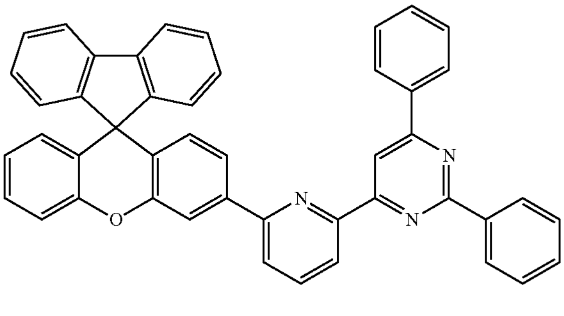
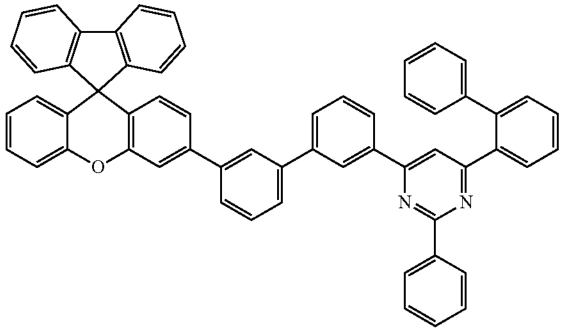
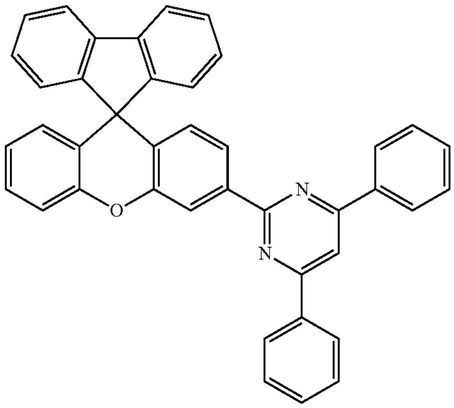
-continued
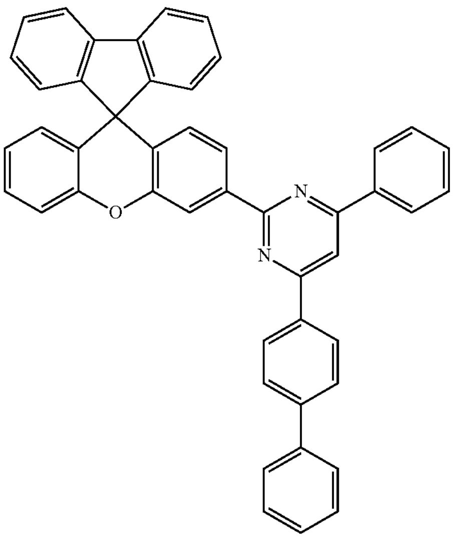
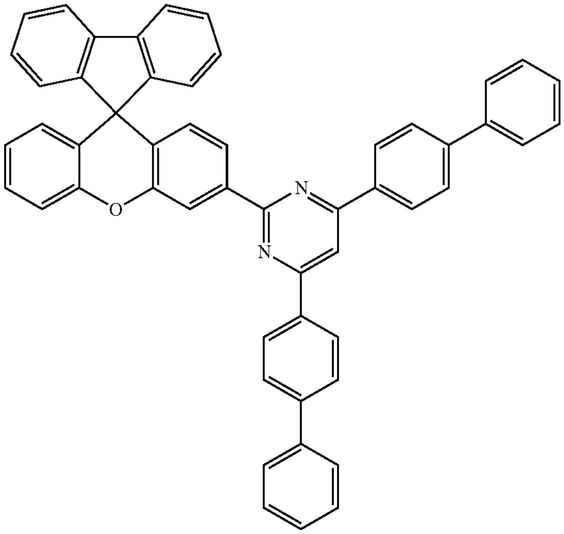
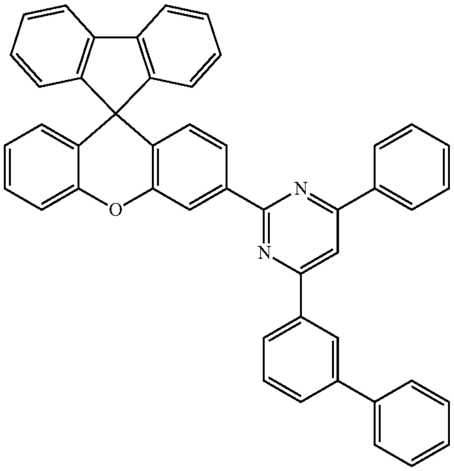

-continued
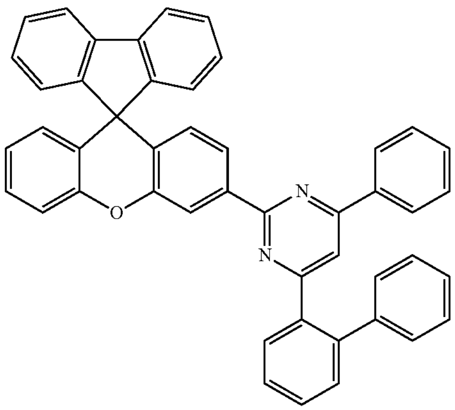
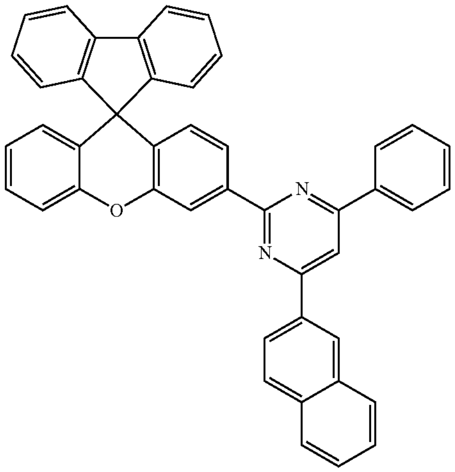
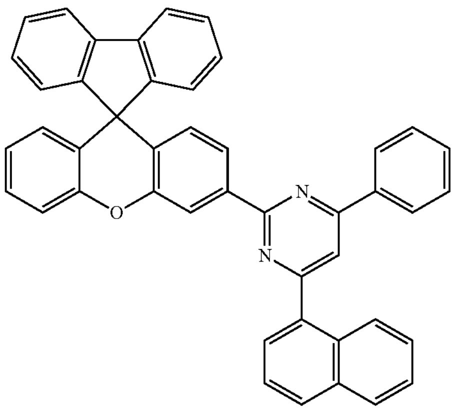
-continued
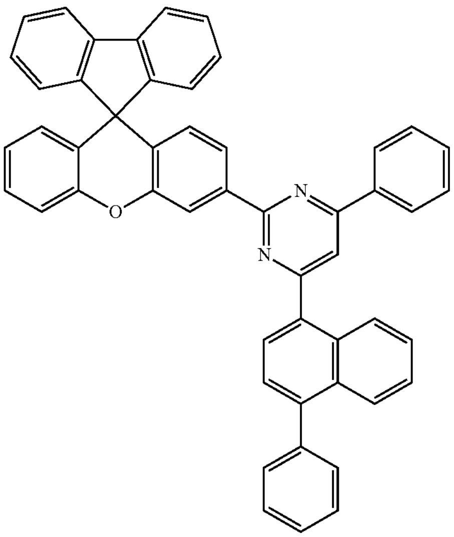
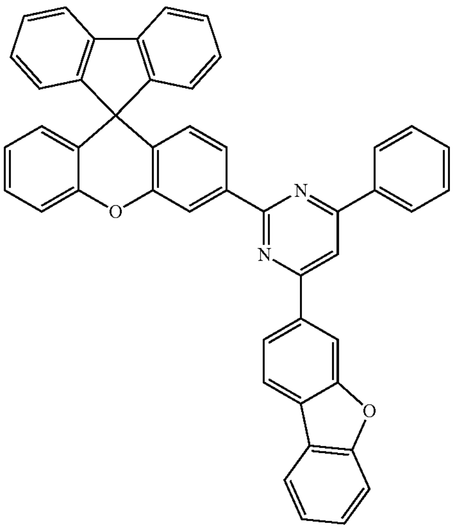
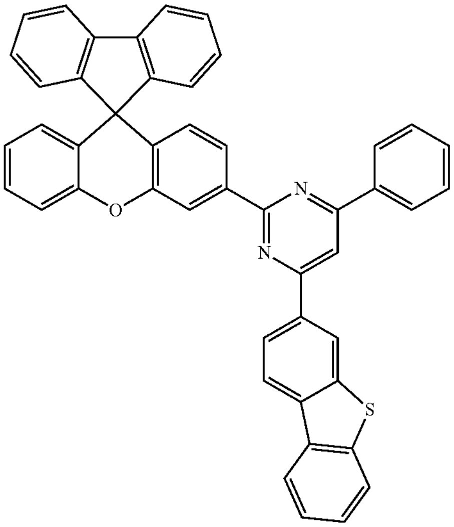

-continued
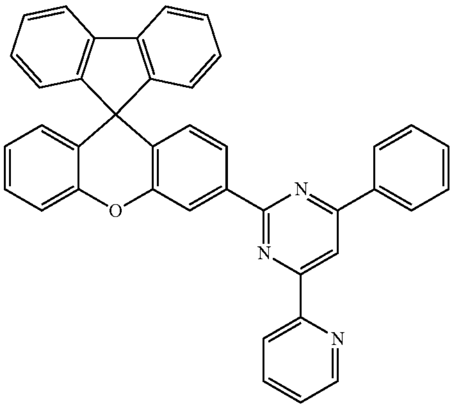
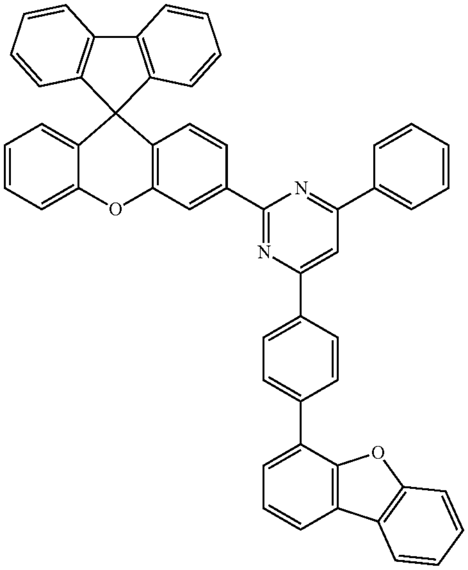
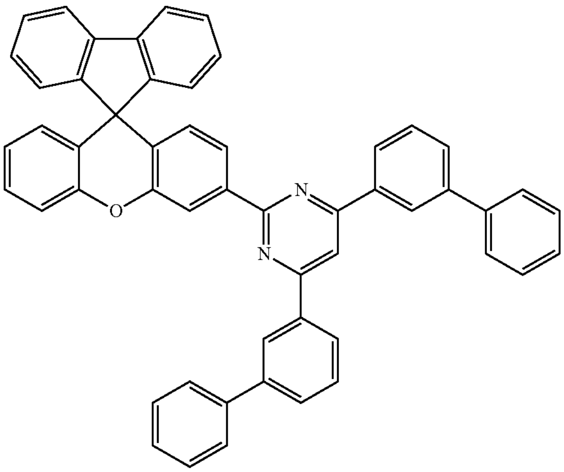
-continued
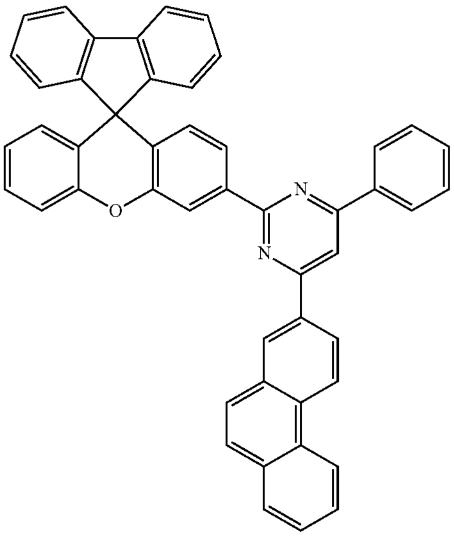
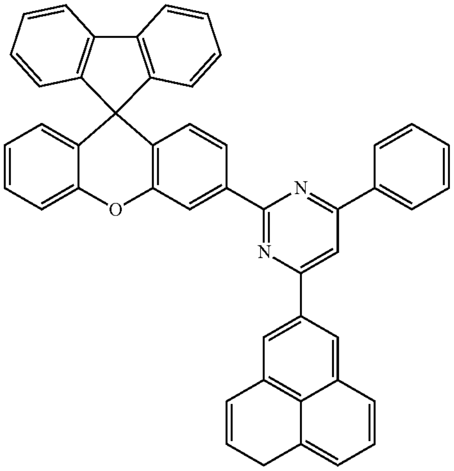
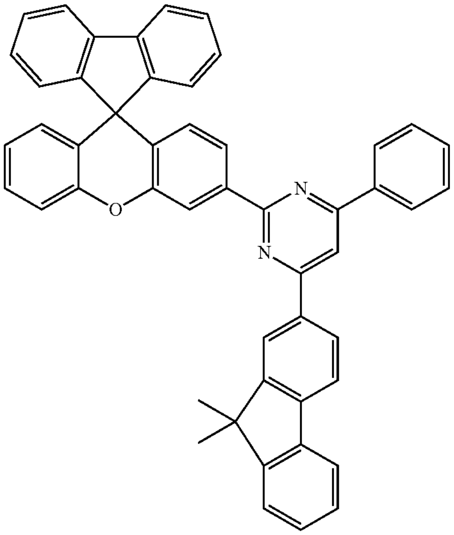

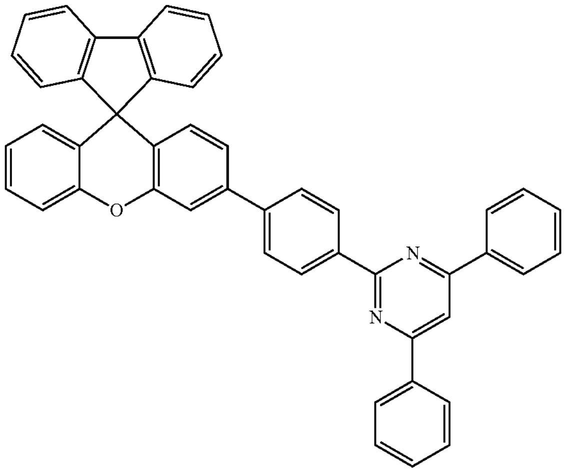
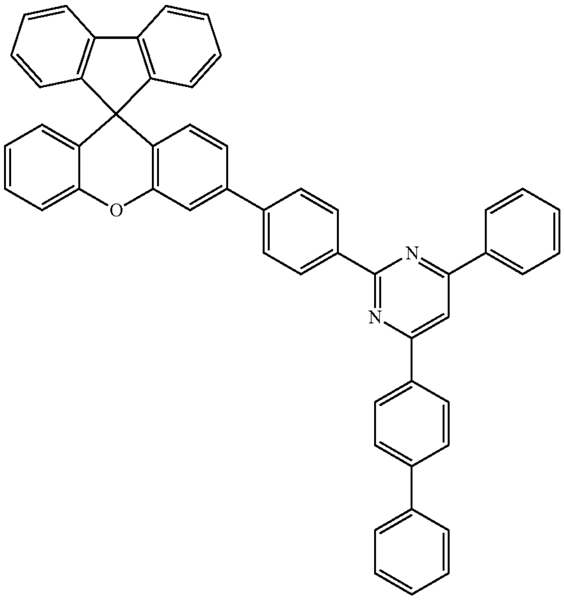
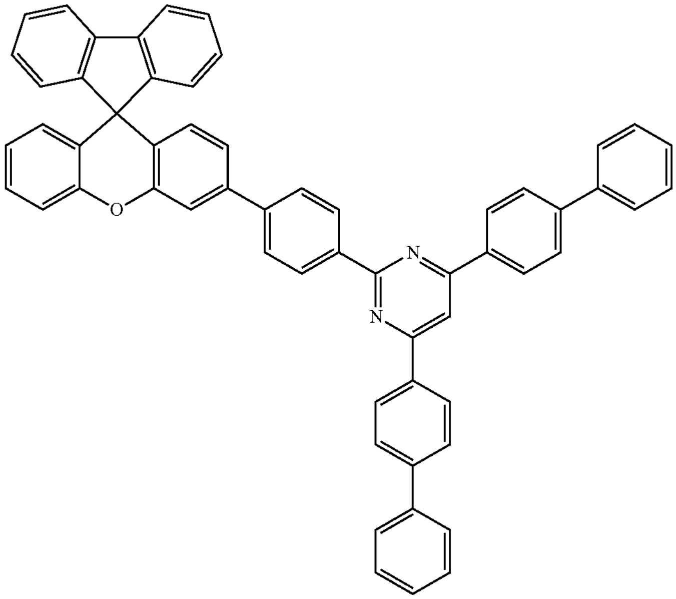
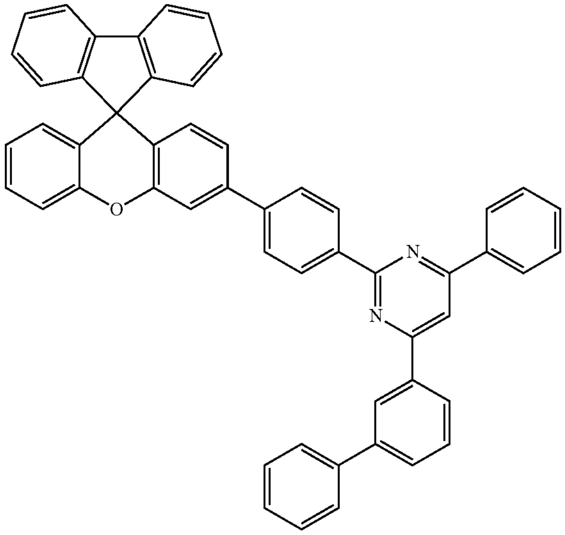
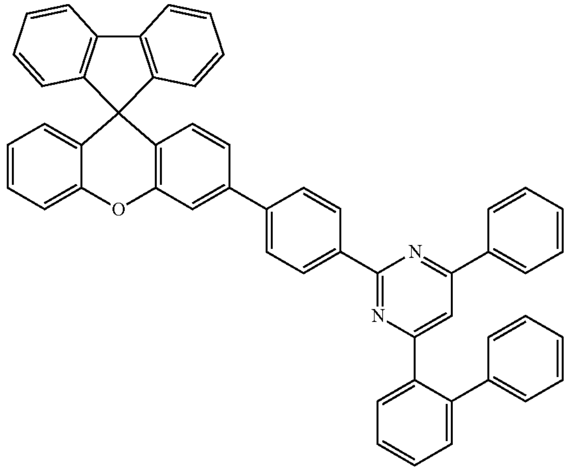

-continued
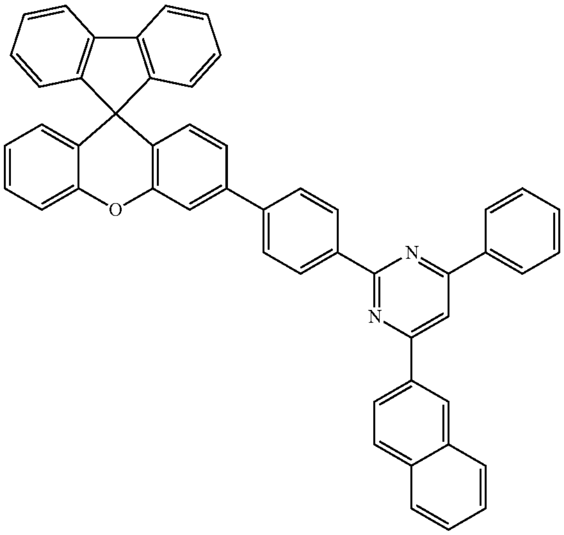
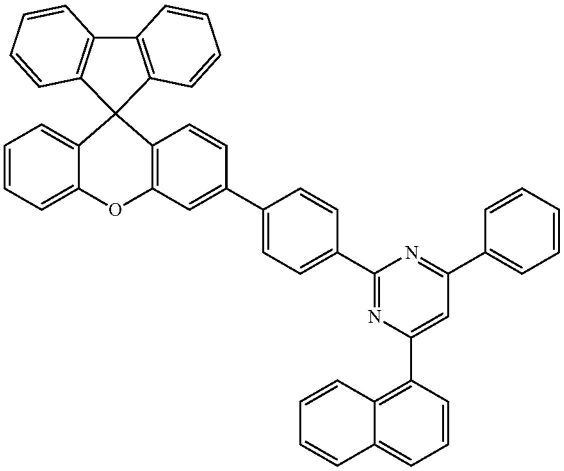
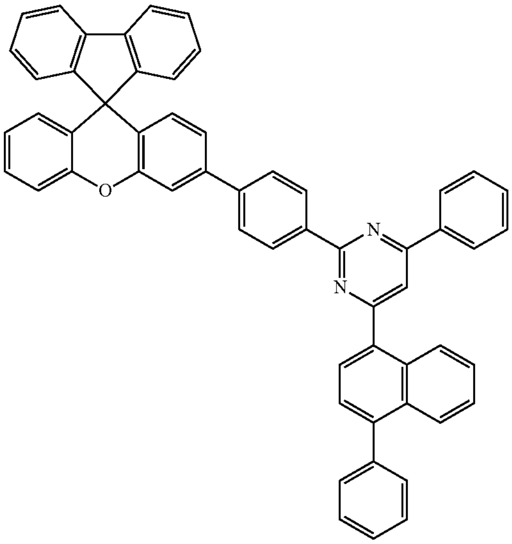
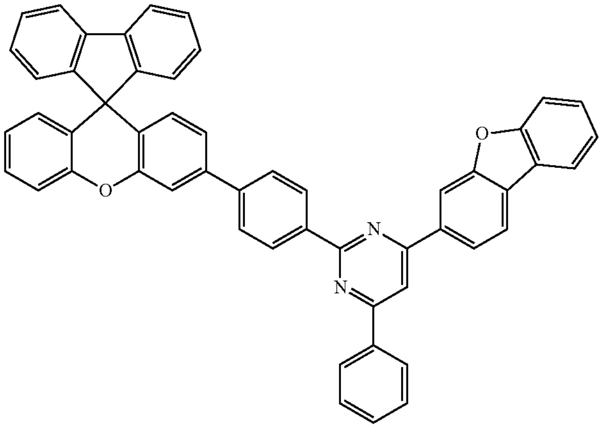
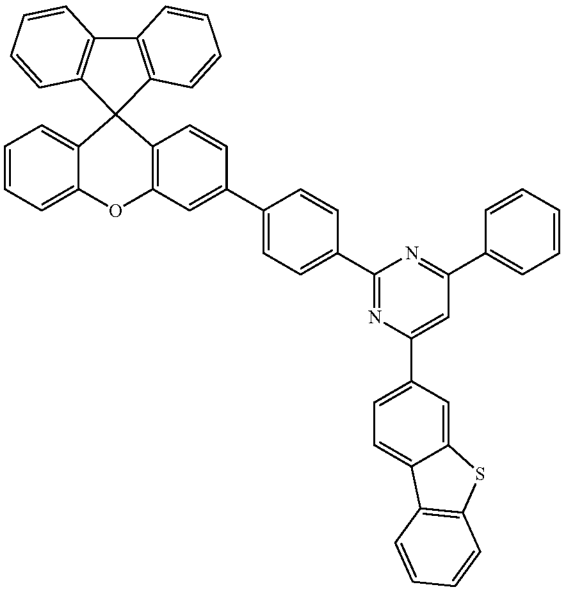
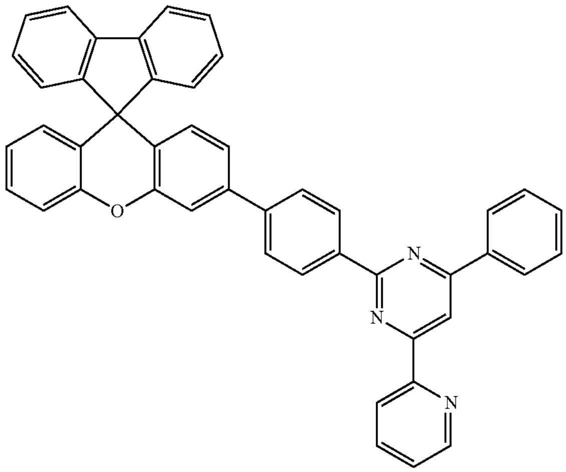

-continued
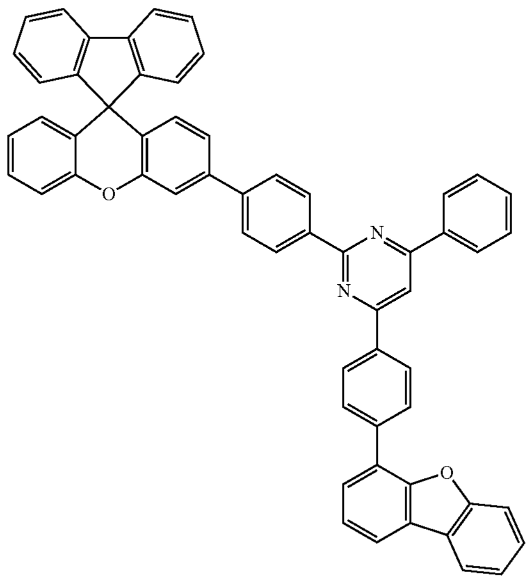
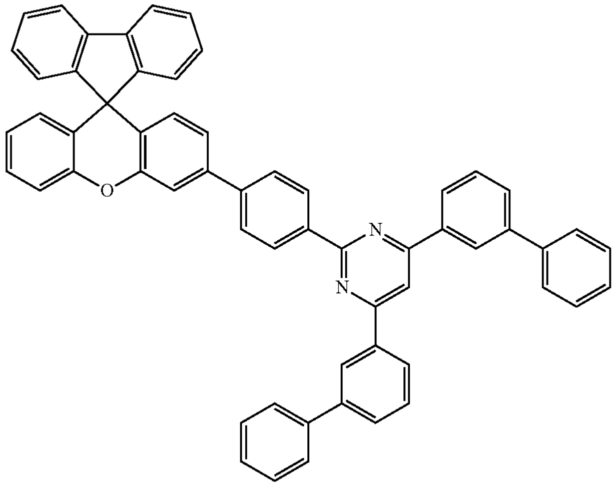
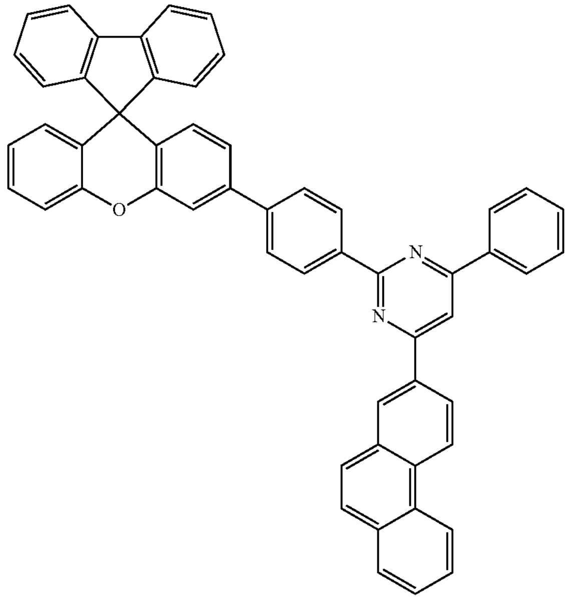
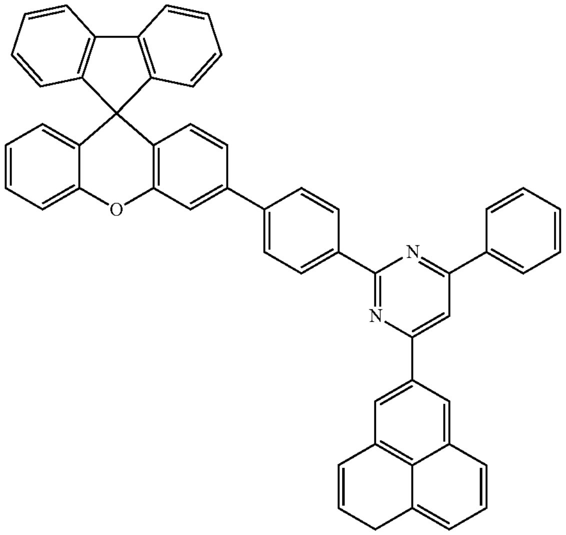

-continued
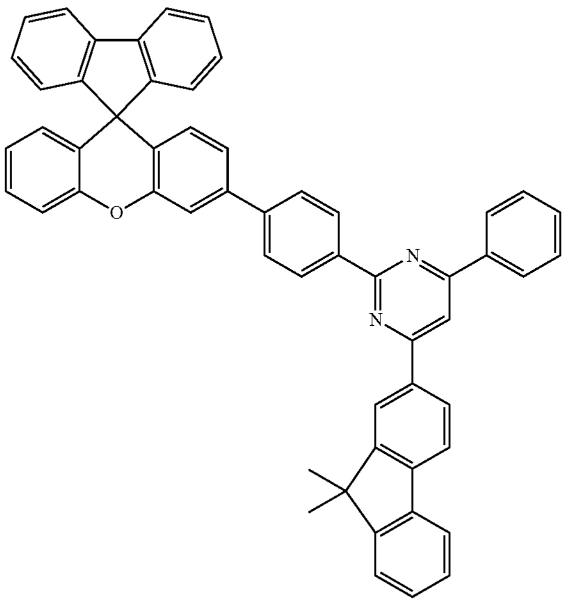
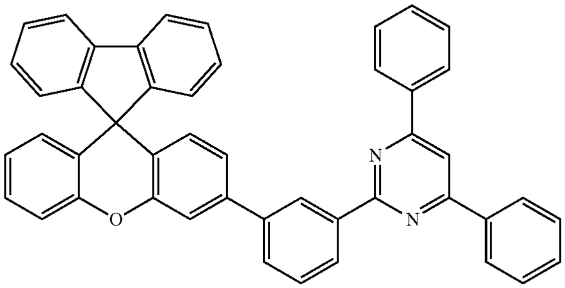
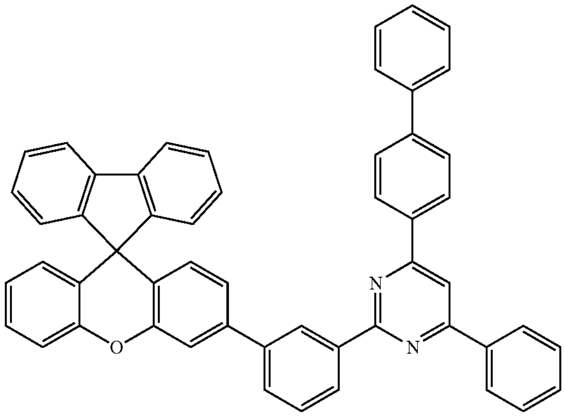
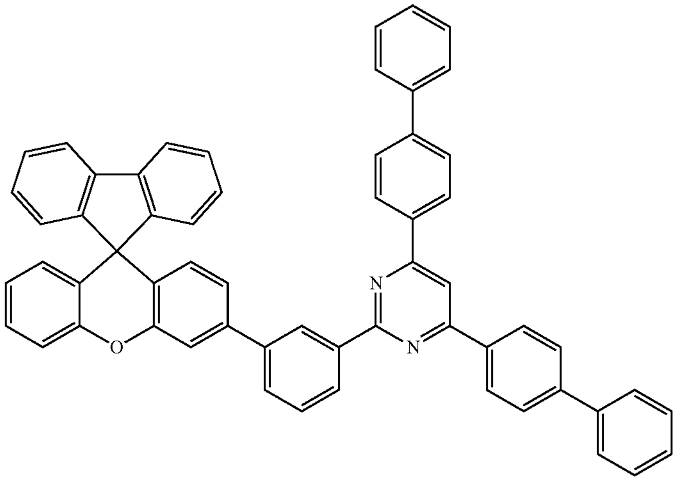
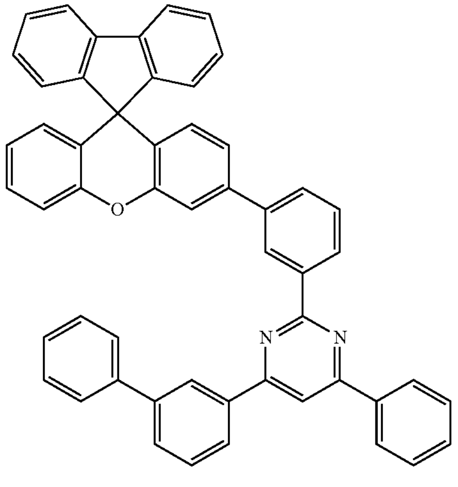

-continued
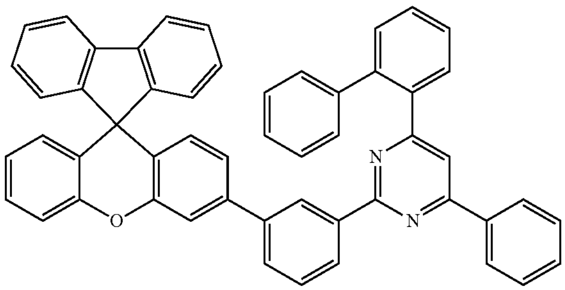
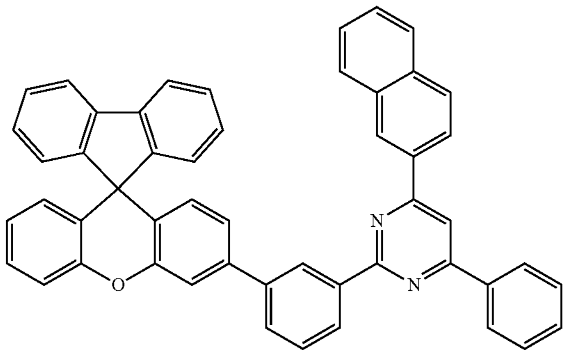
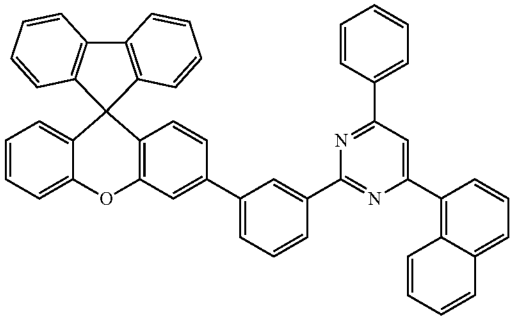
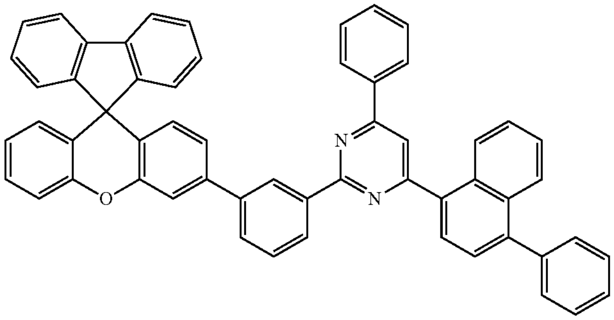
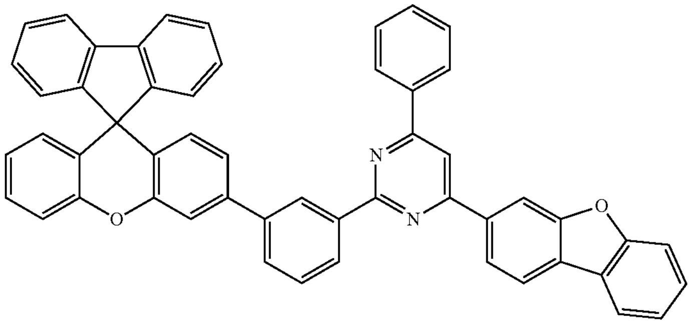
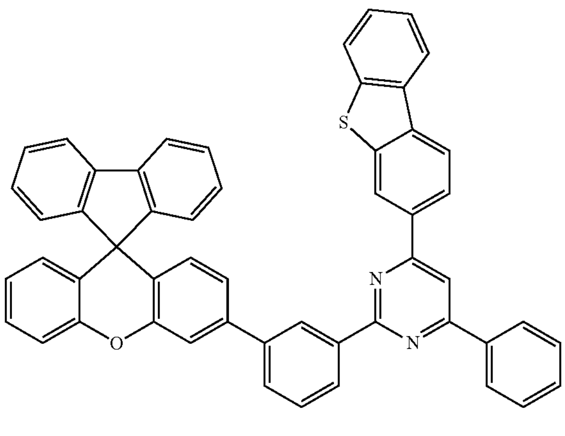
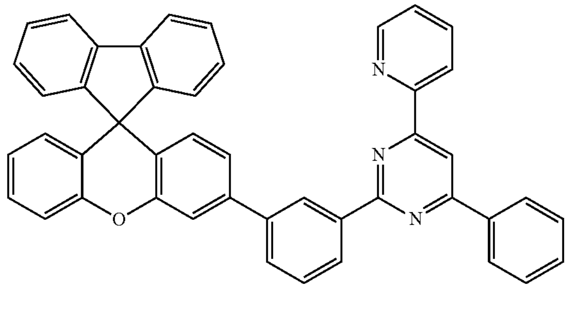

-continued
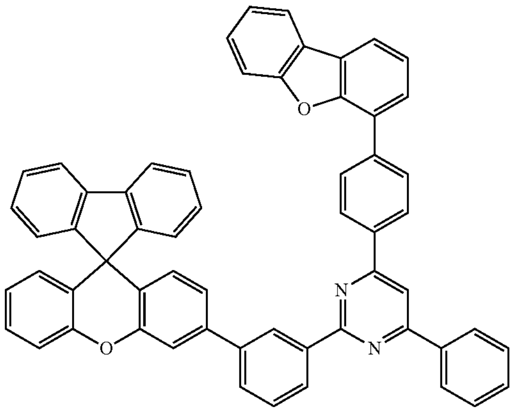
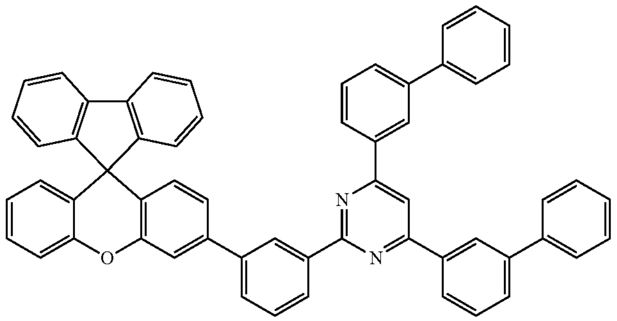
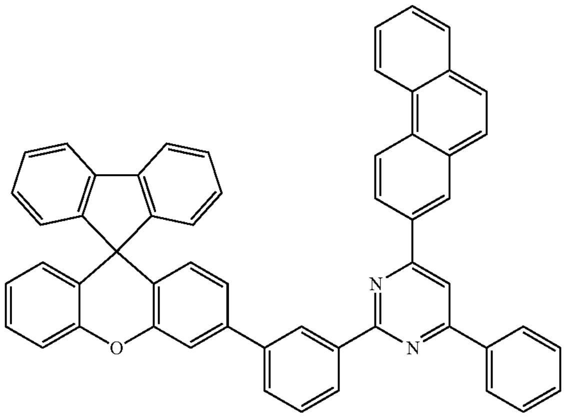
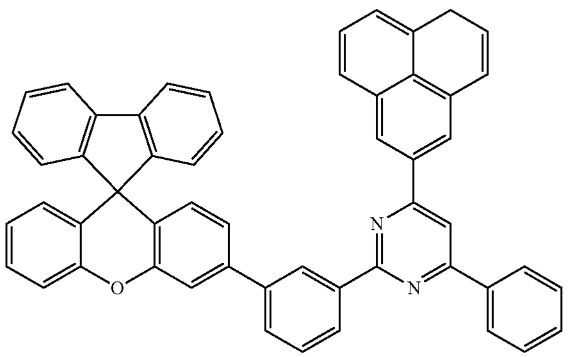
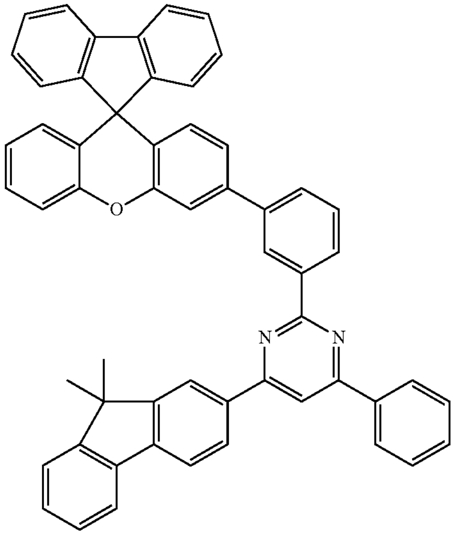
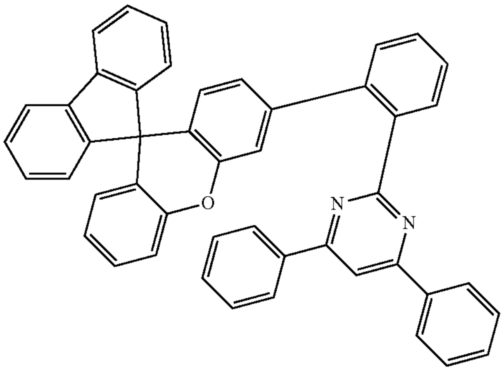
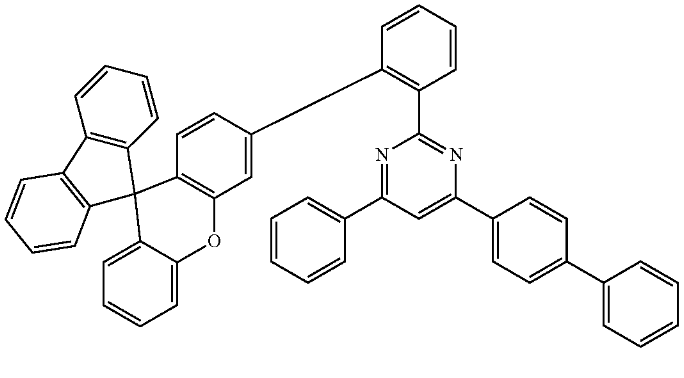

-continued
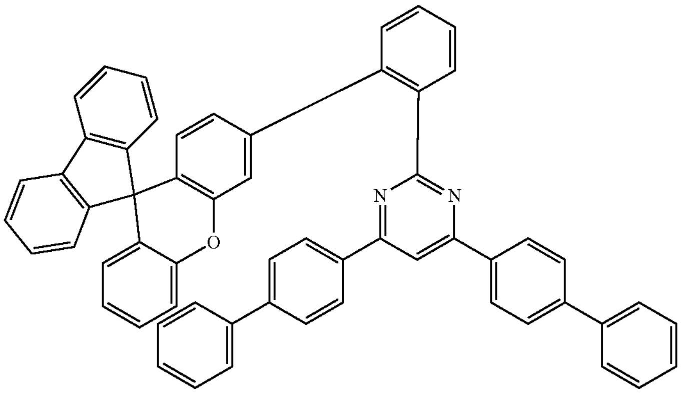
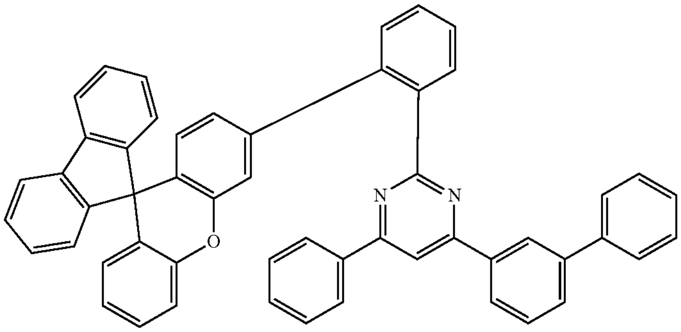
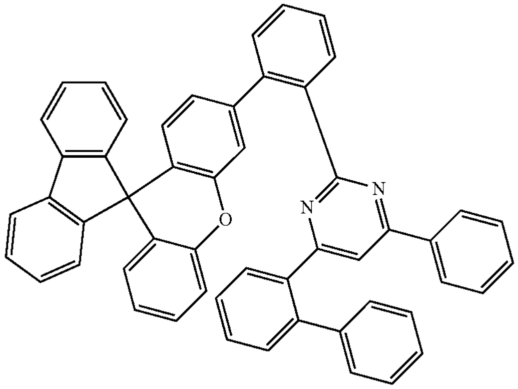
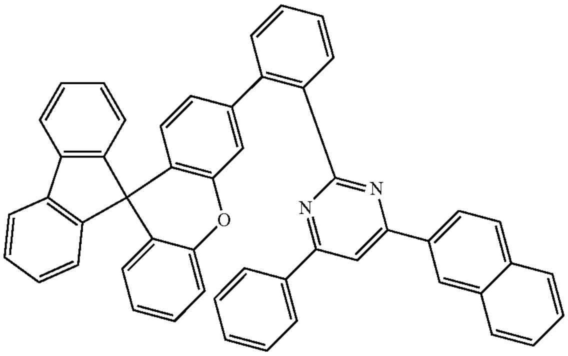
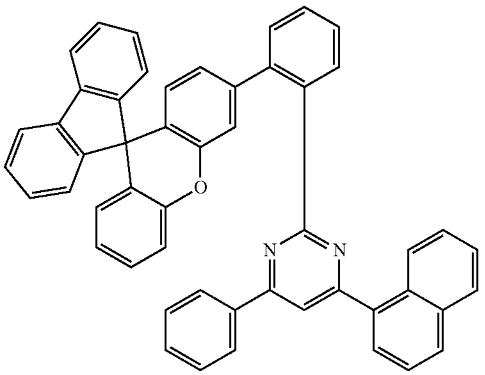
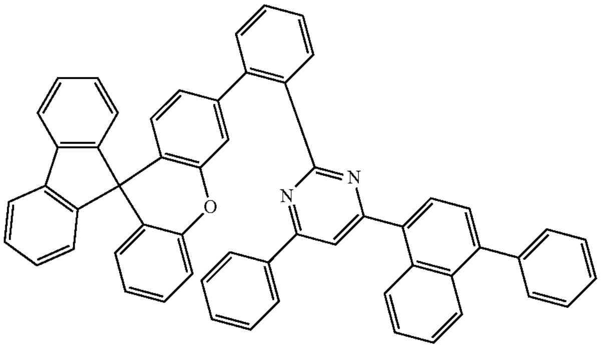

-continued
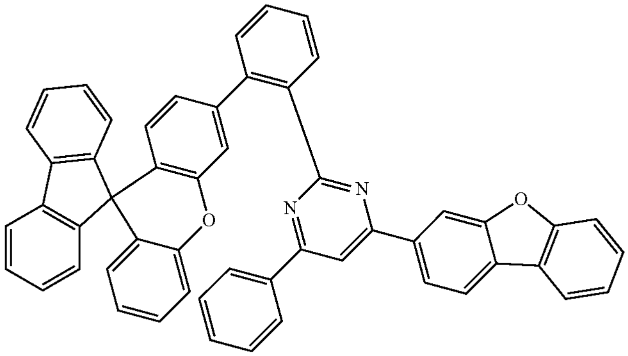
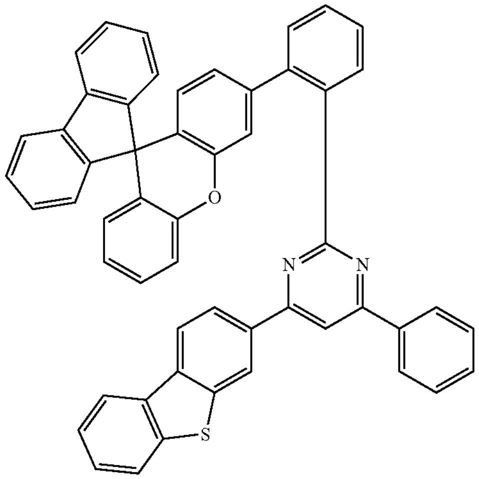
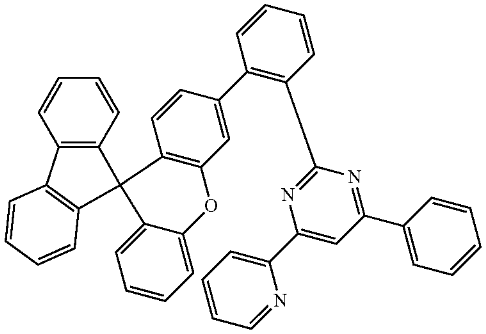
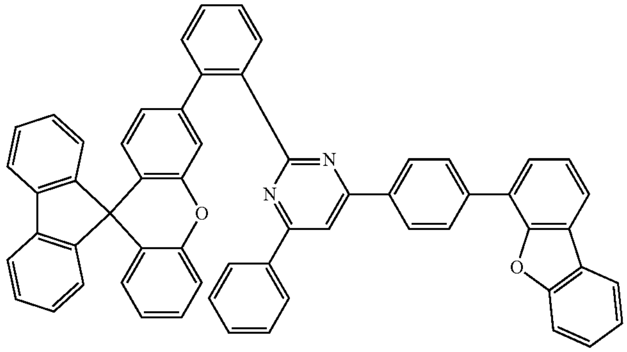
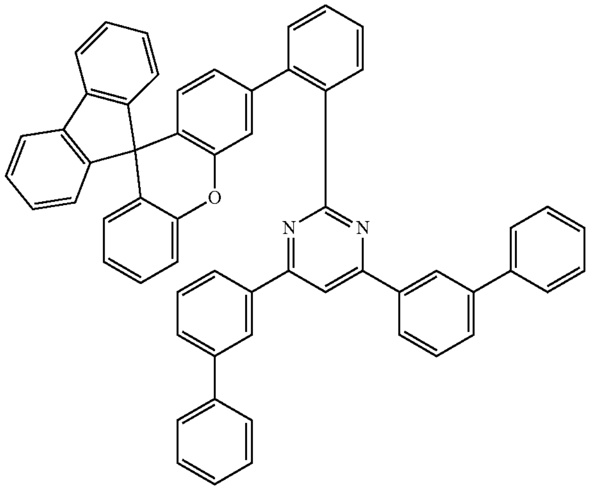
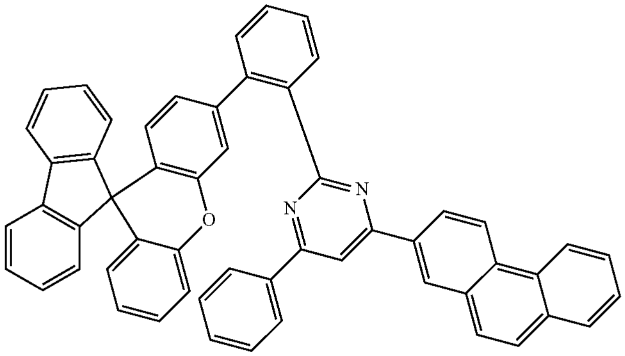

-continued
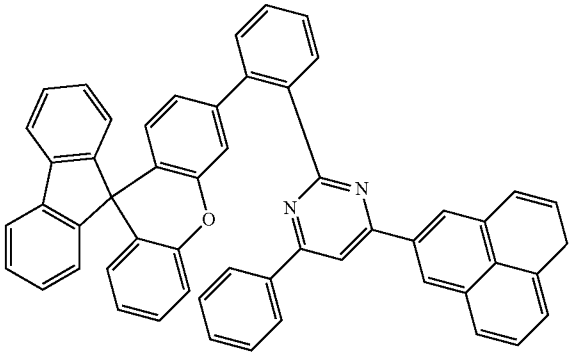
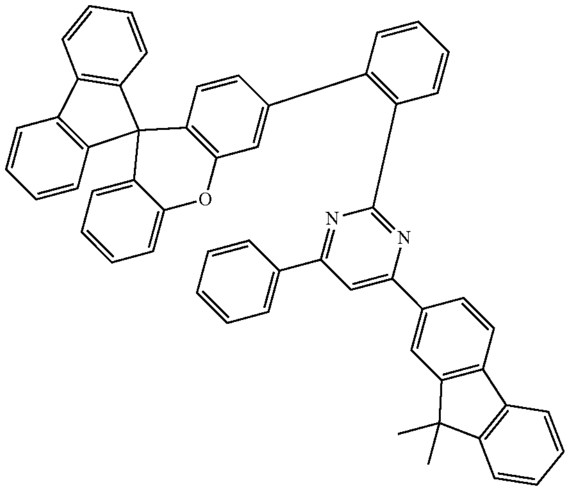
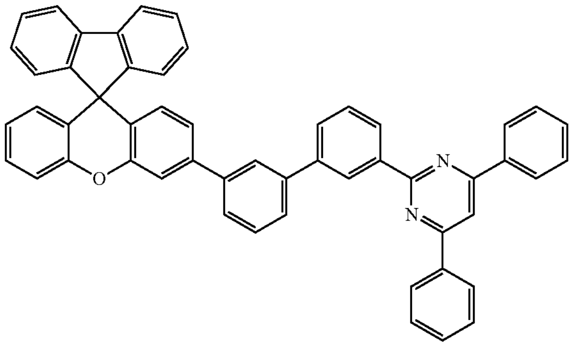
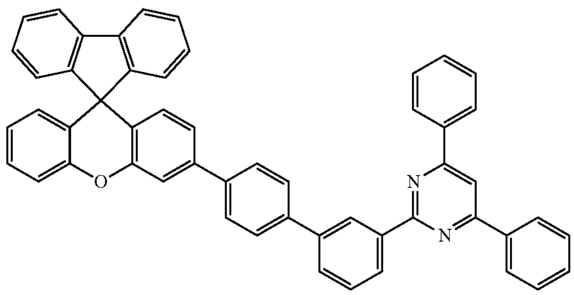
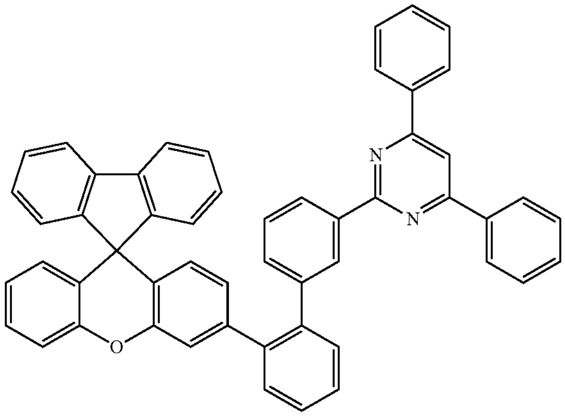
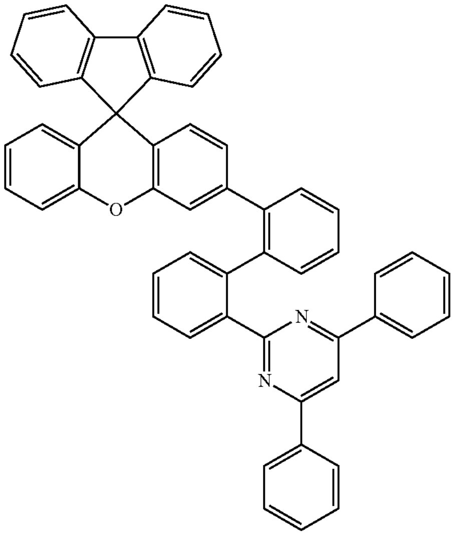

-continued
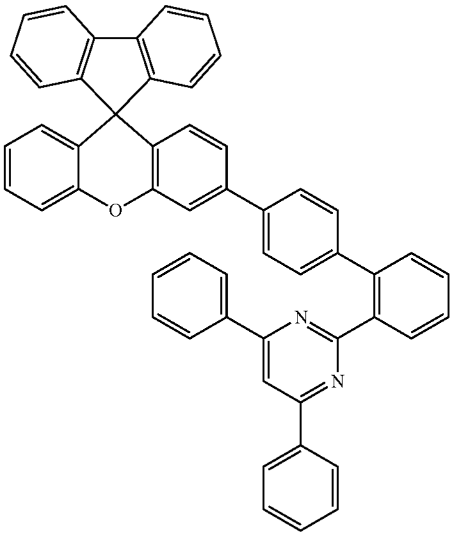
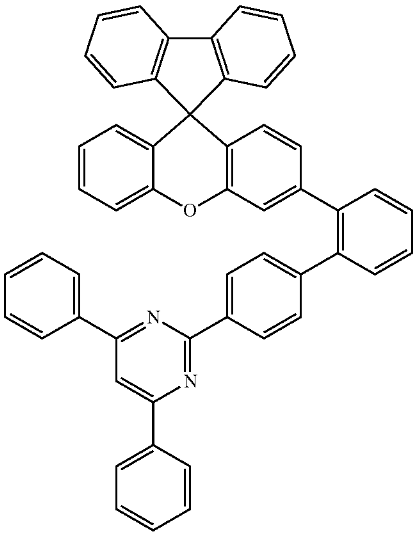
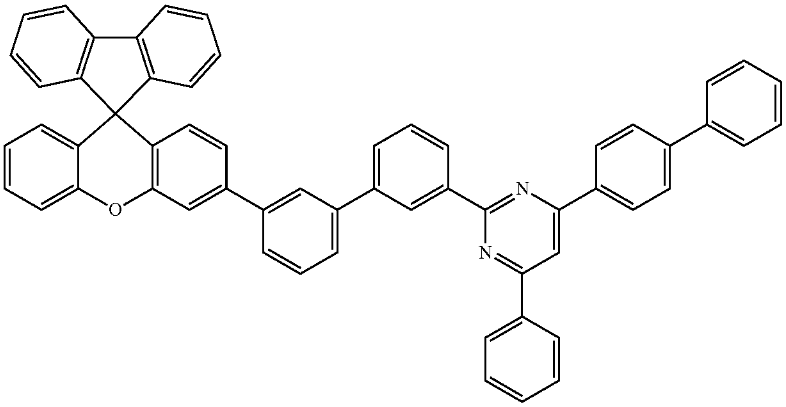
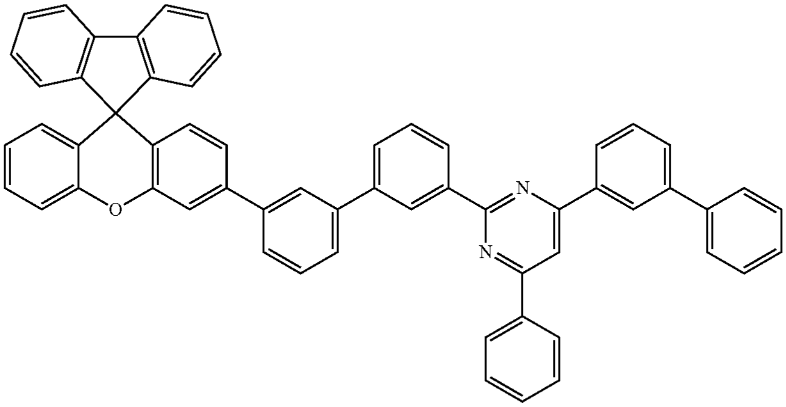

-continued
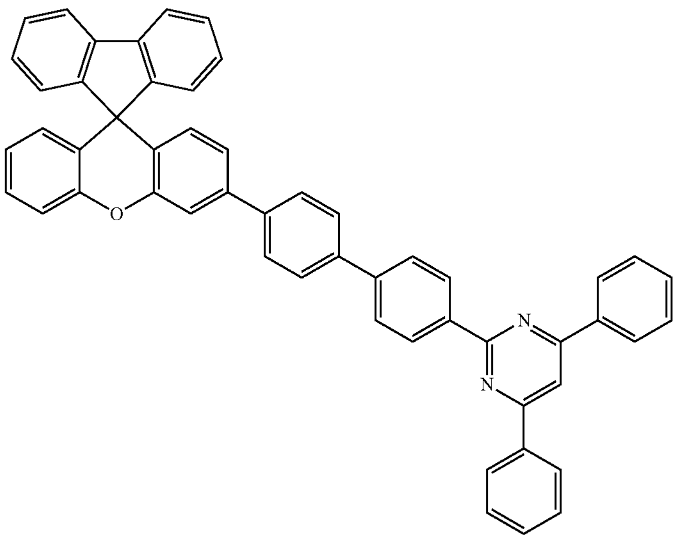
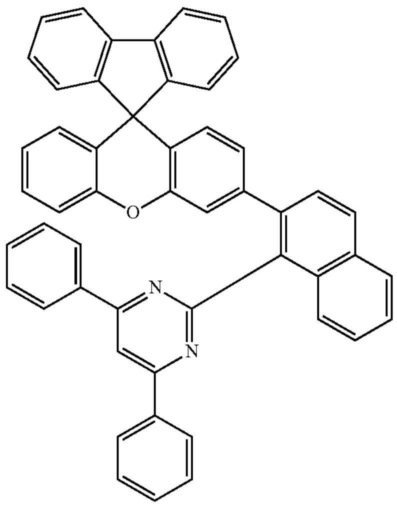
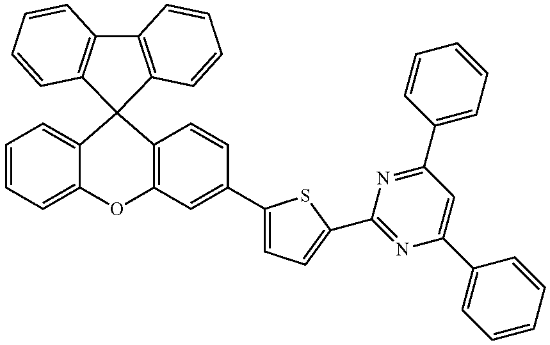
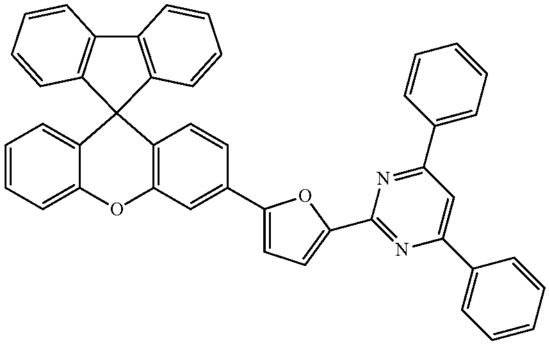
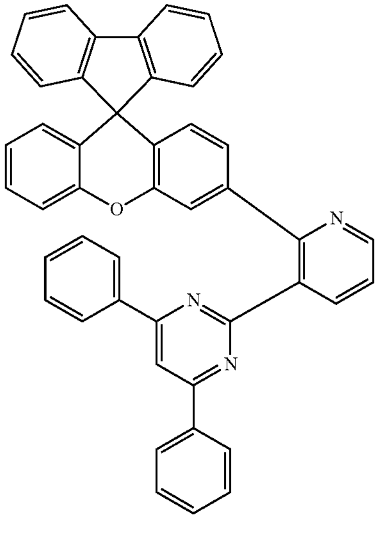
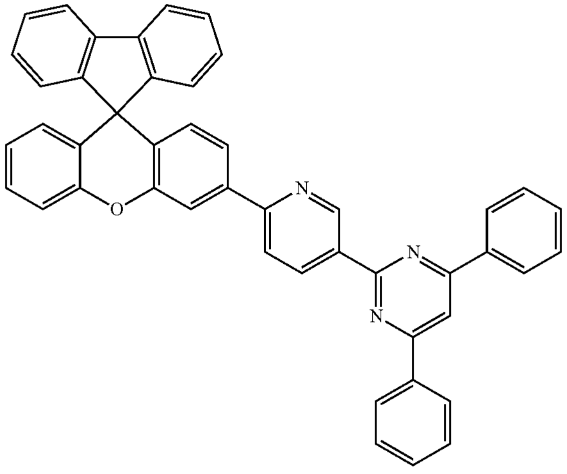

-continued
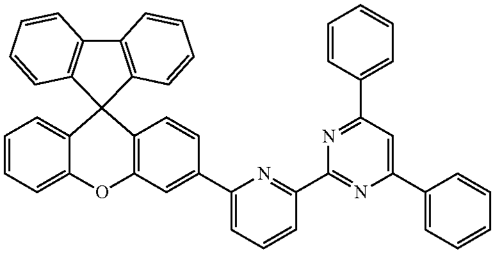
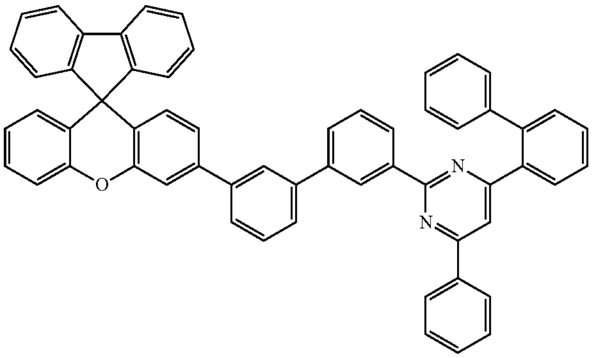
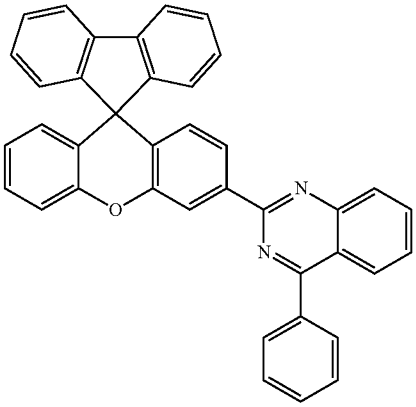
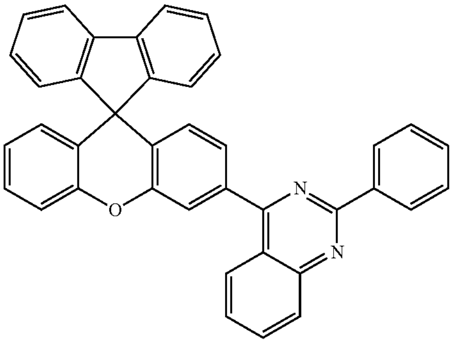
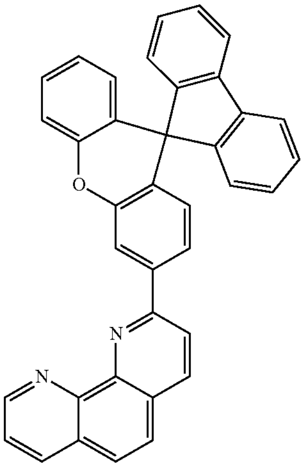
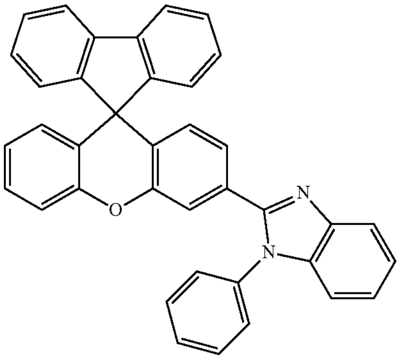
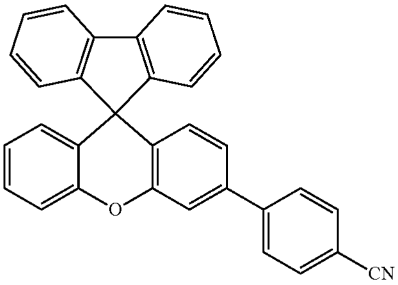
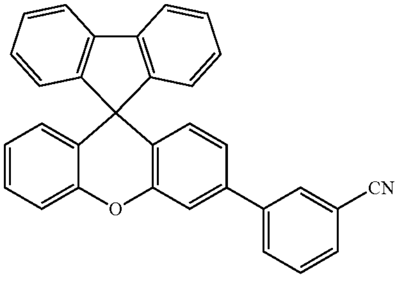
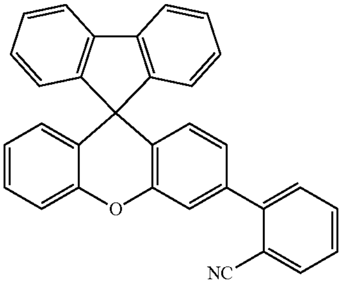

-continued
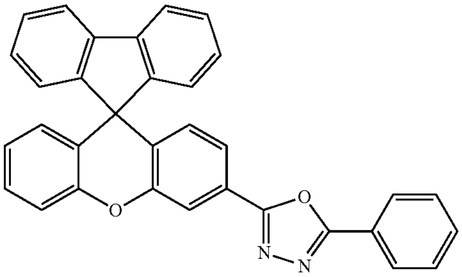
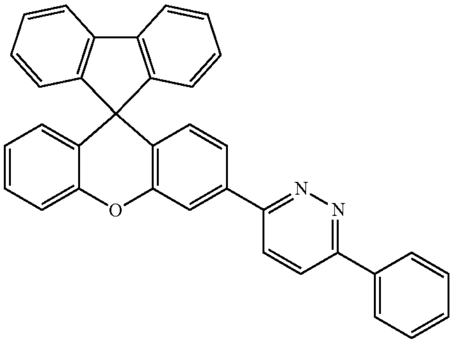
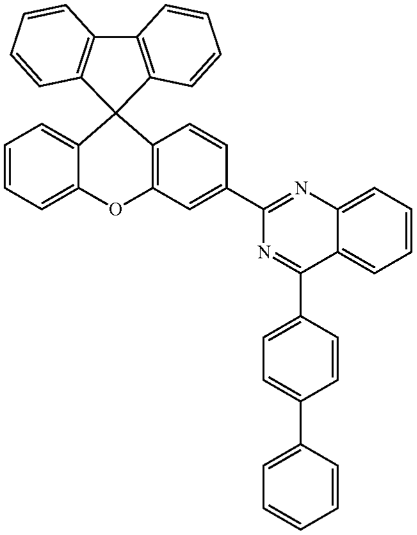
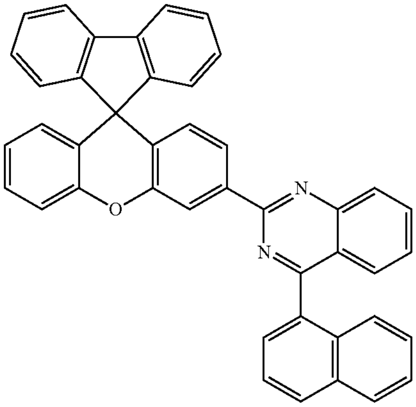
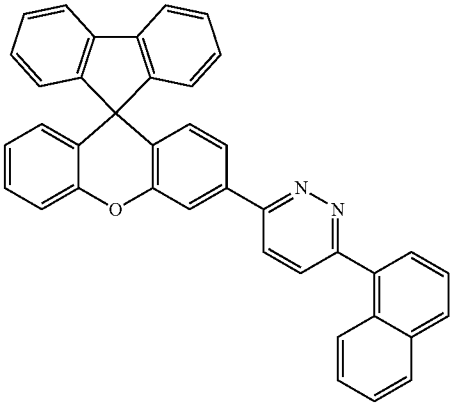
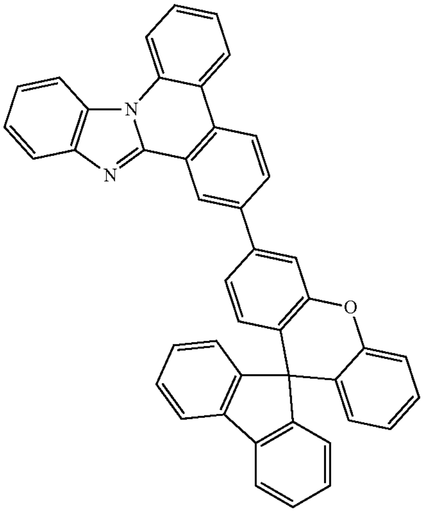

-continued
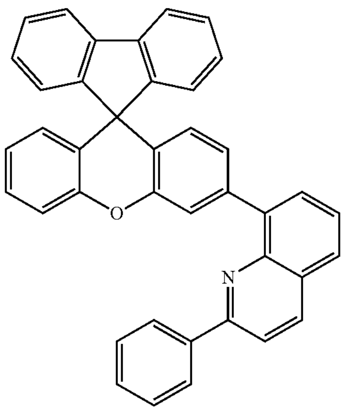
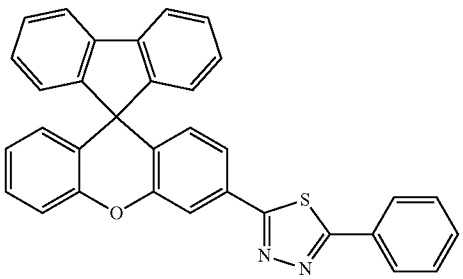
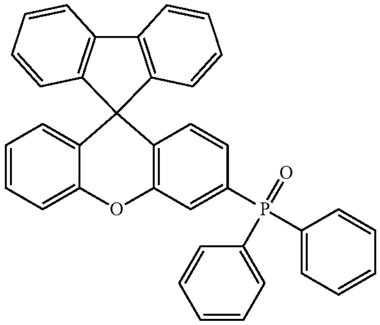
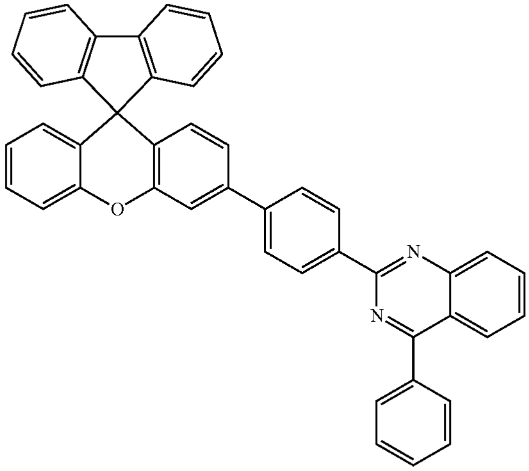
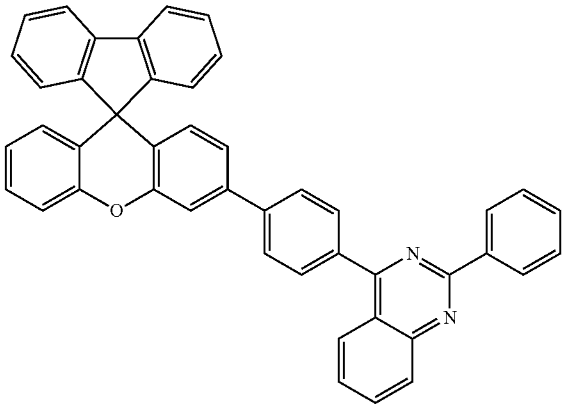
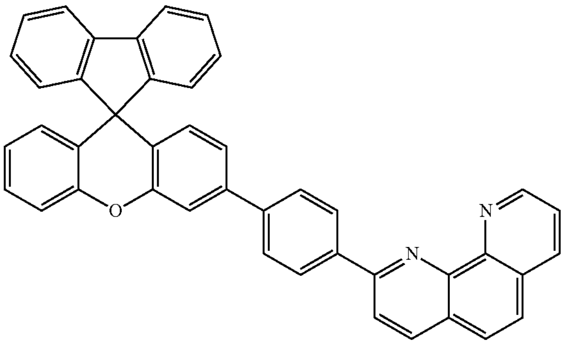
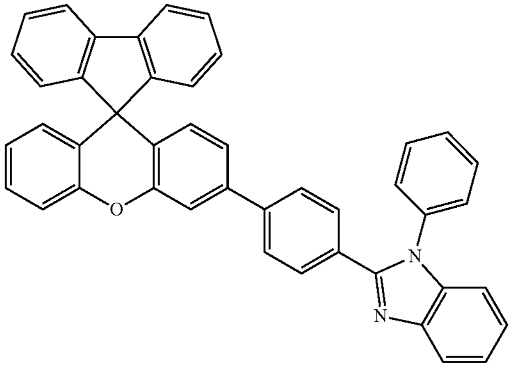
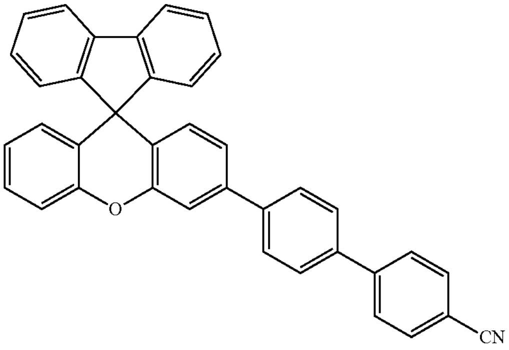

-continued
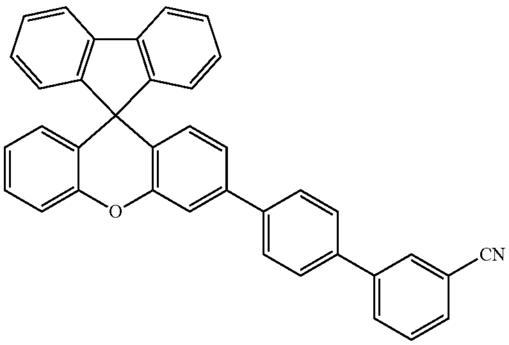
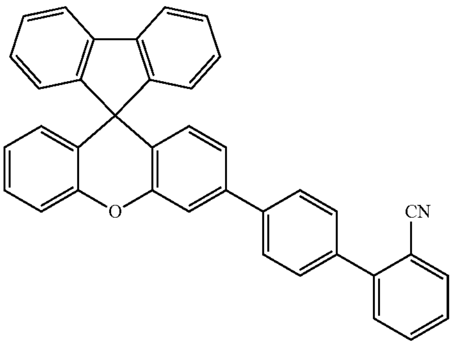
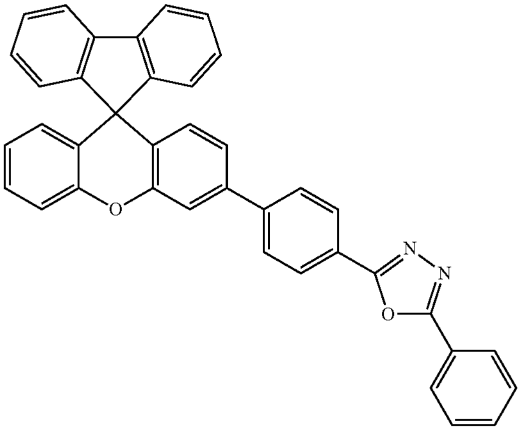
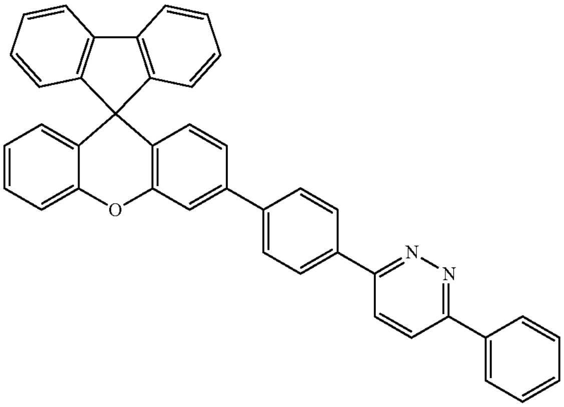
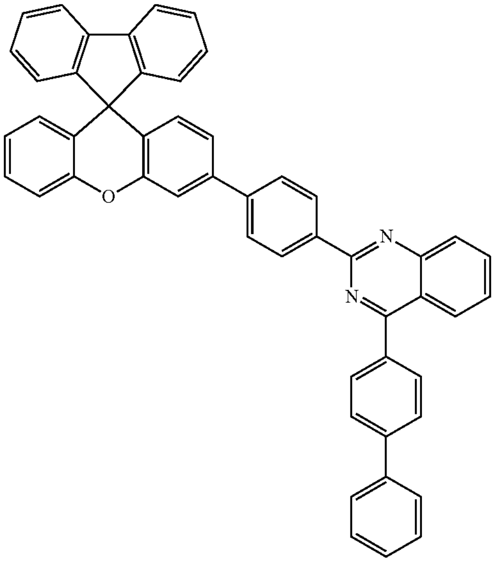
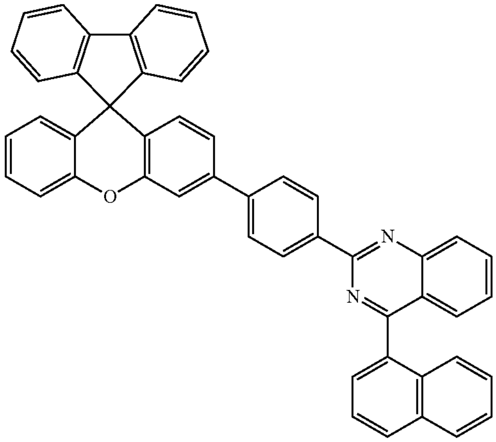

-continued
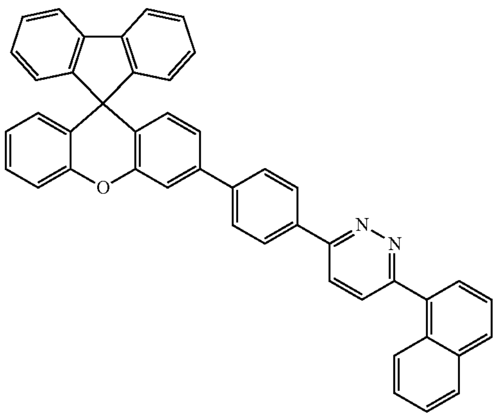
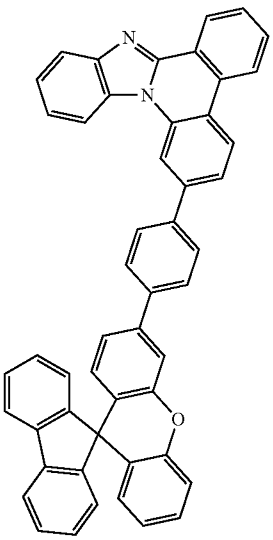
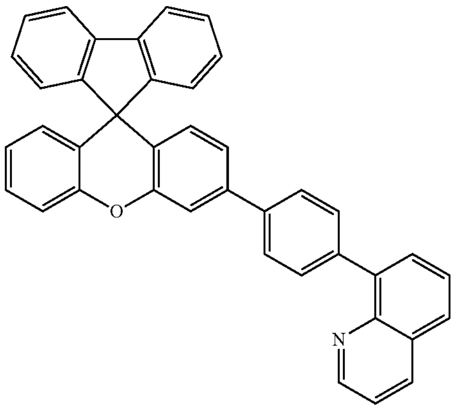
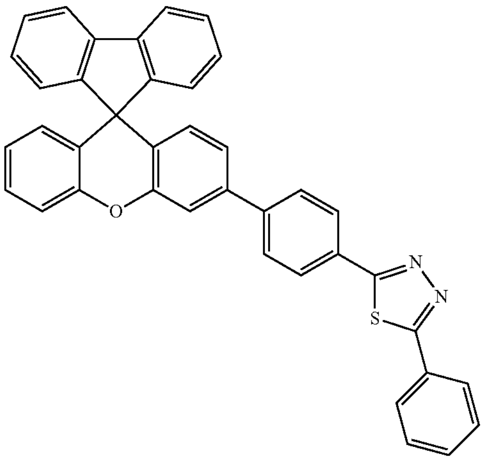
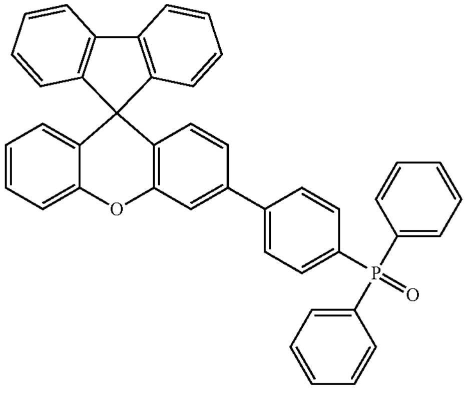
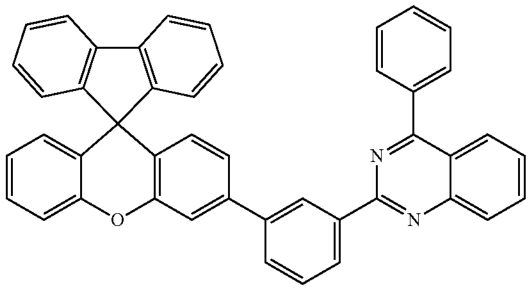

-continued
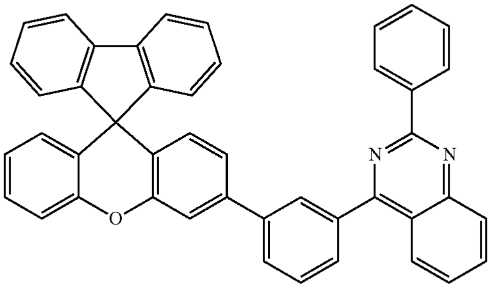
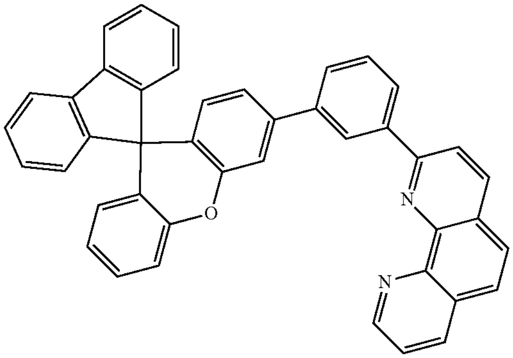
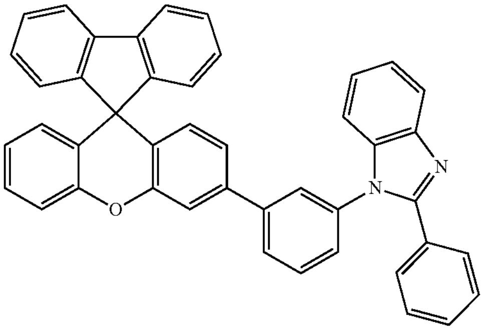
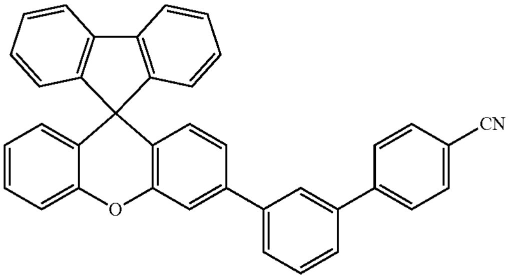
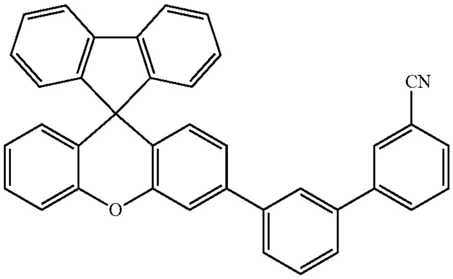
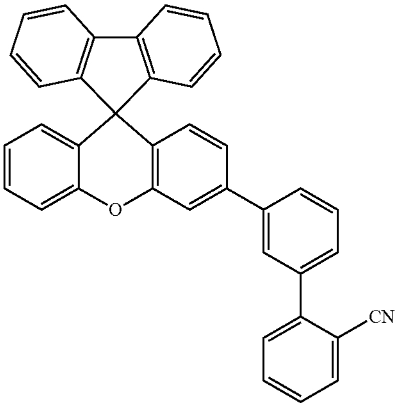
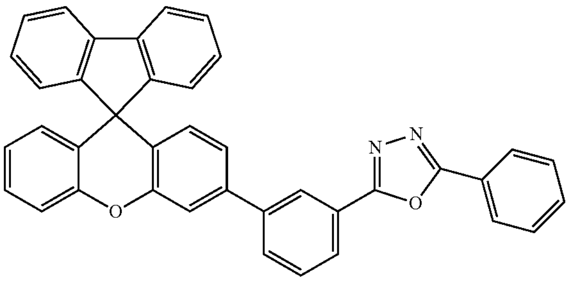
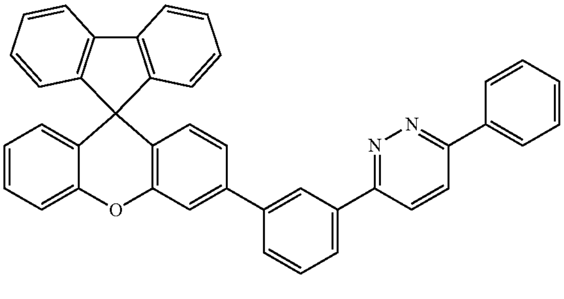

-continued
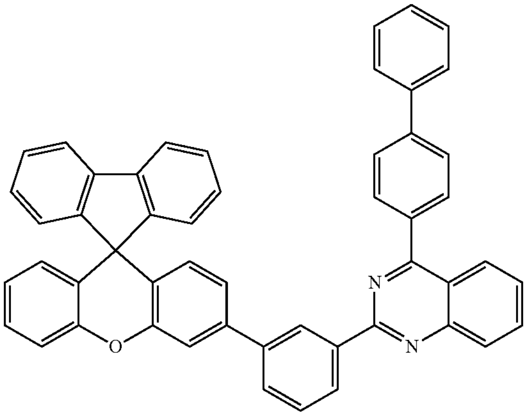
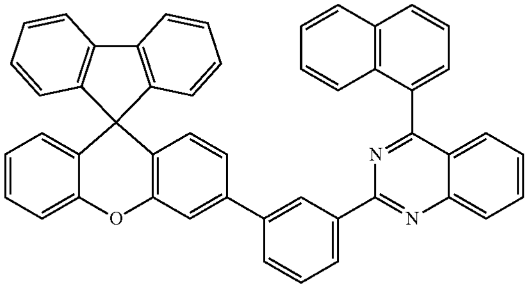
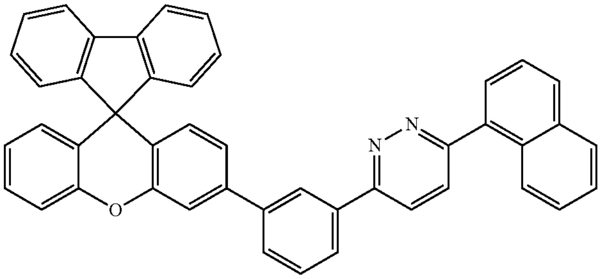
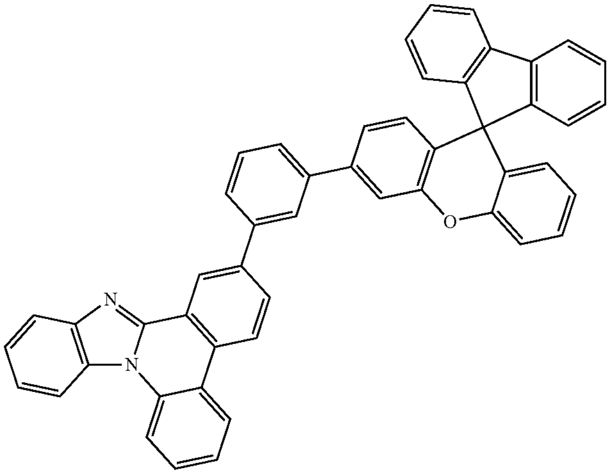
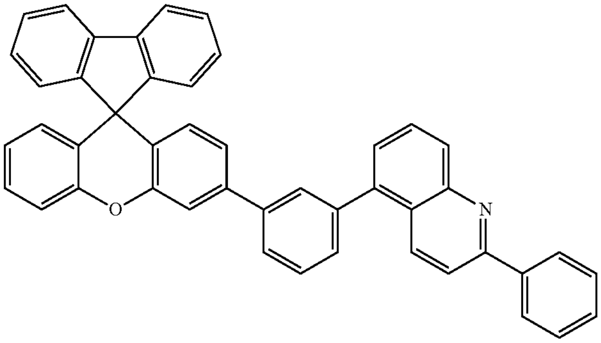

-continued
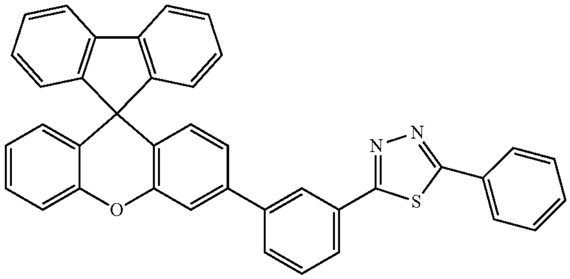
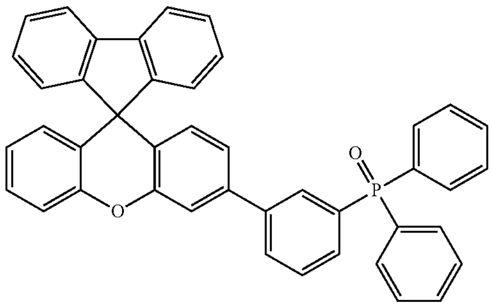
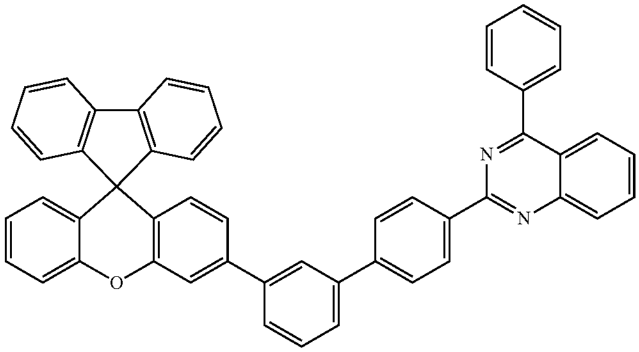
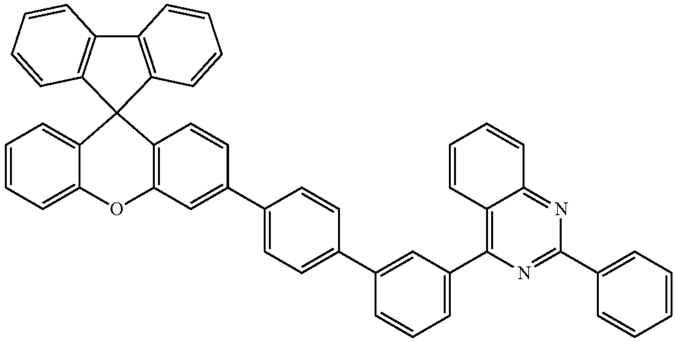
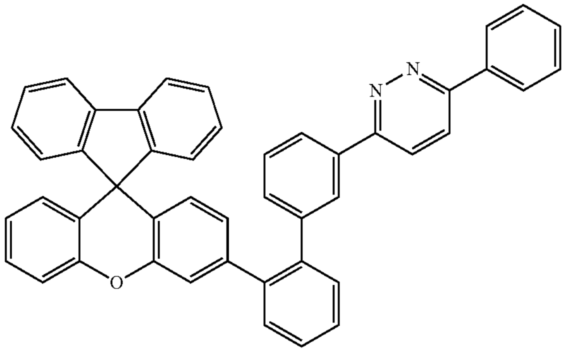
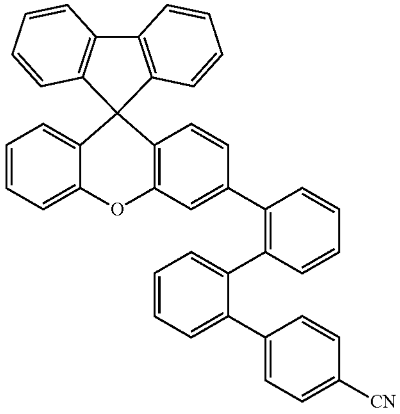

-continued
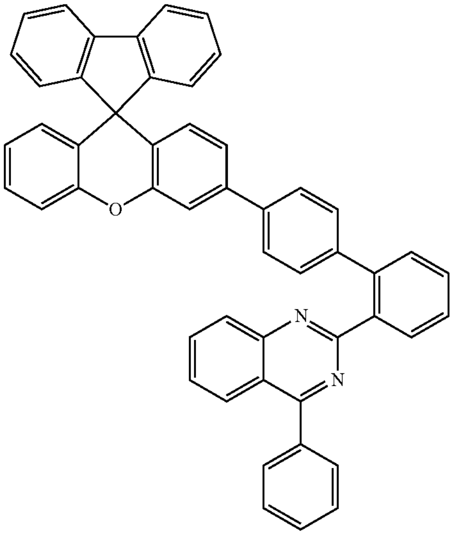
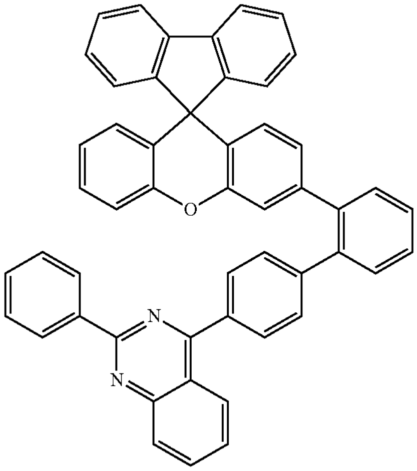
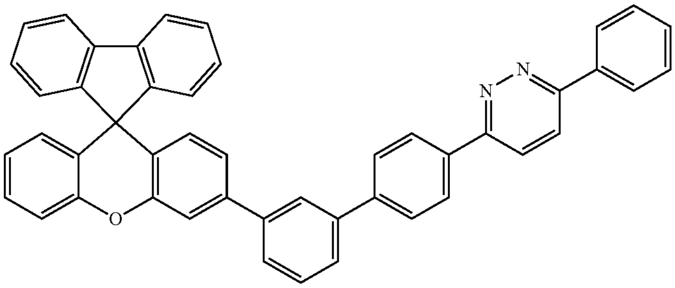
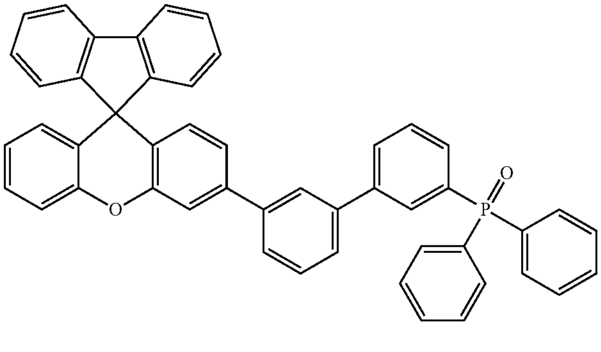
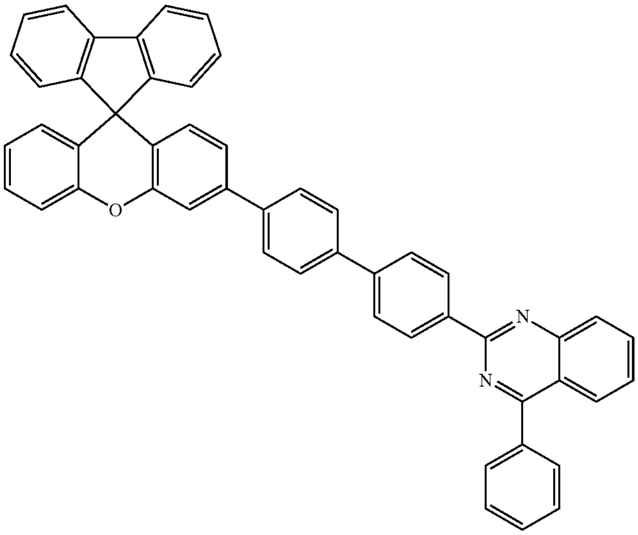
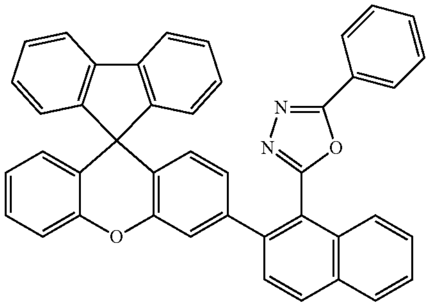

-continued
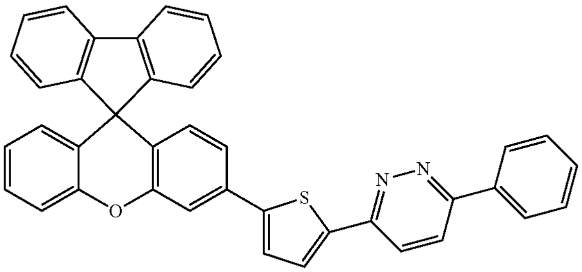
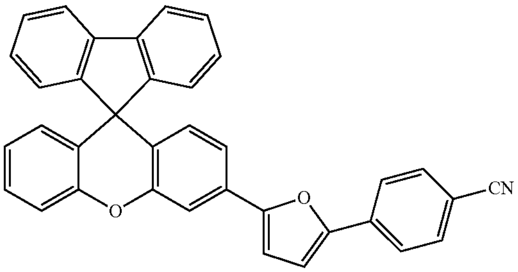
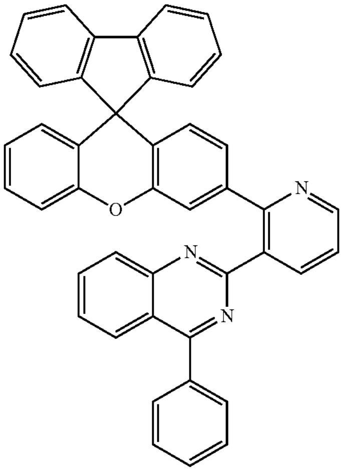
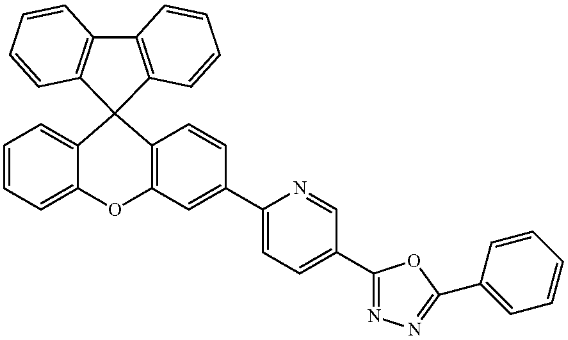
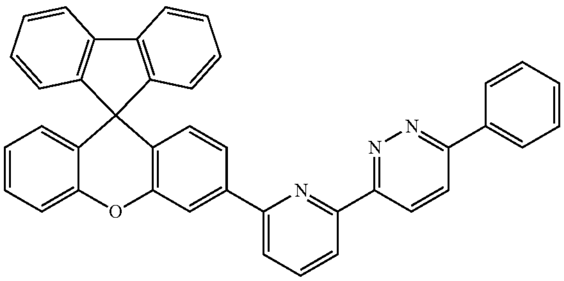
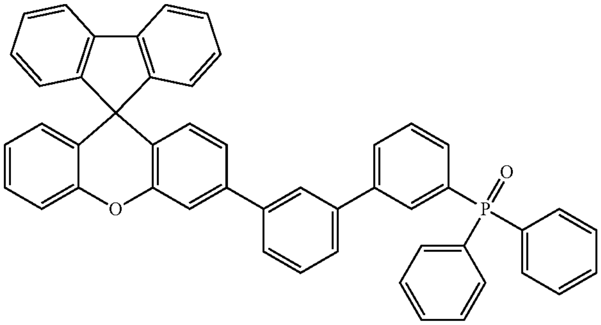
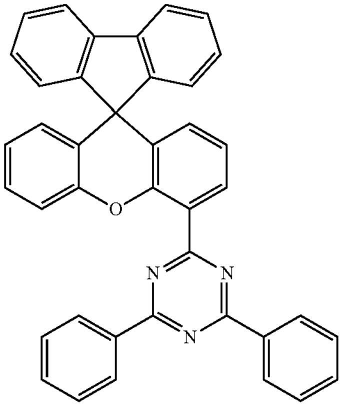

-continued
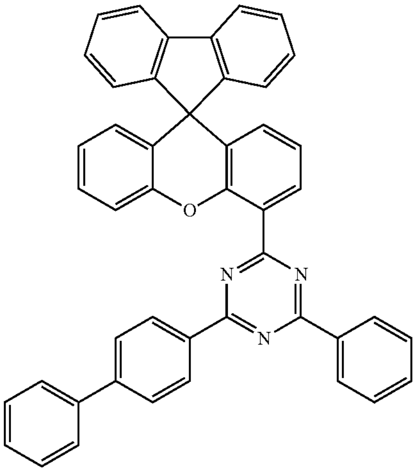
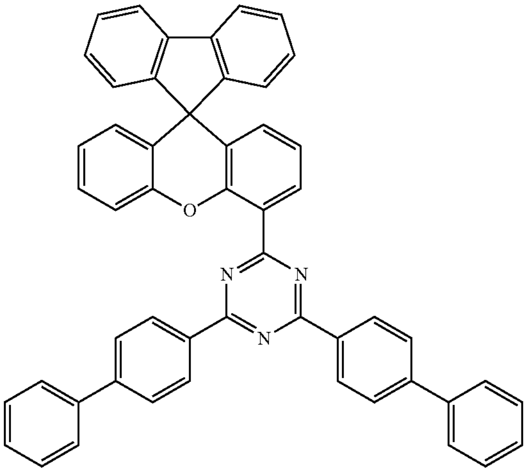
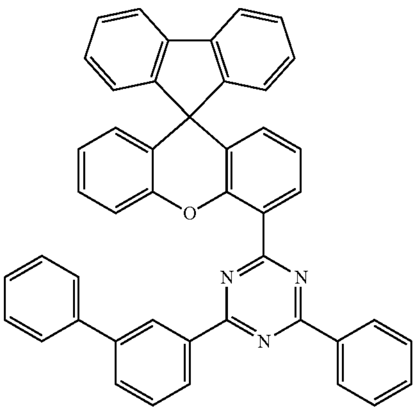
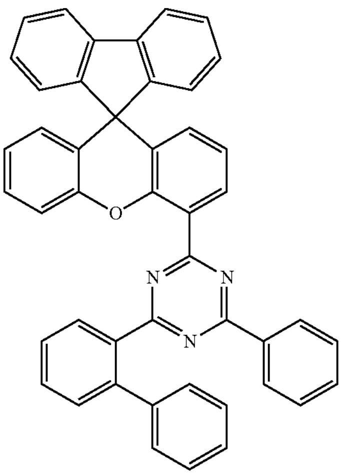
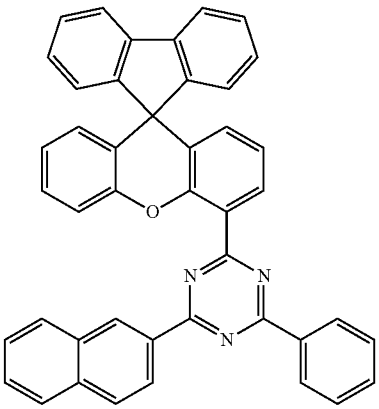
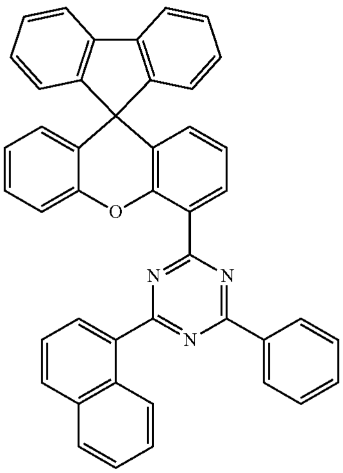

-continued
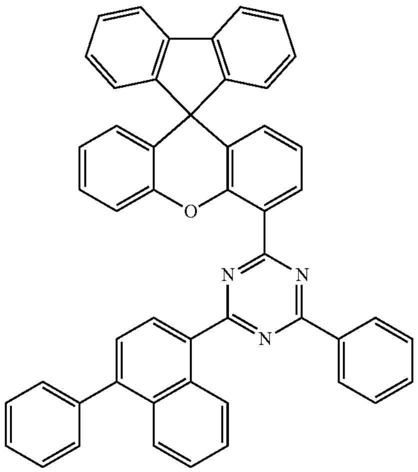
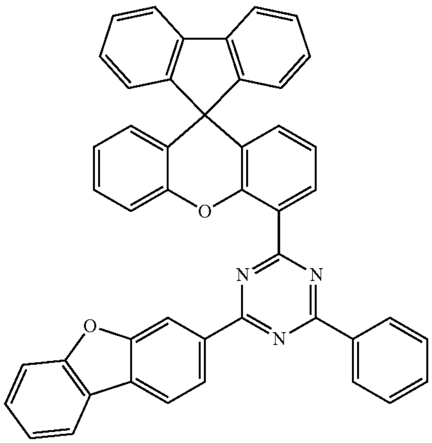
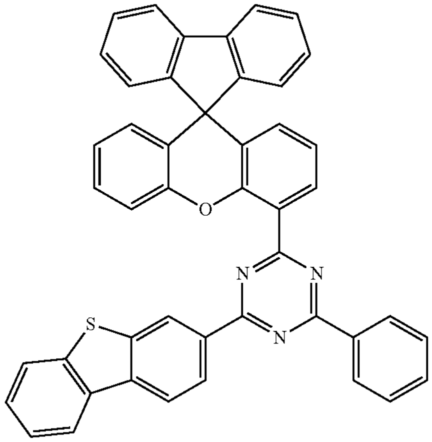
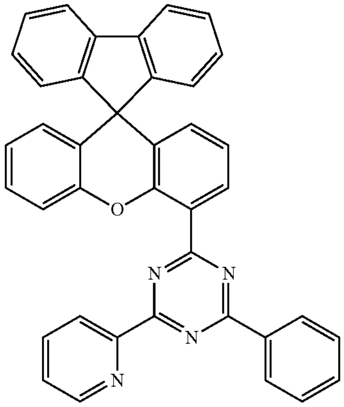
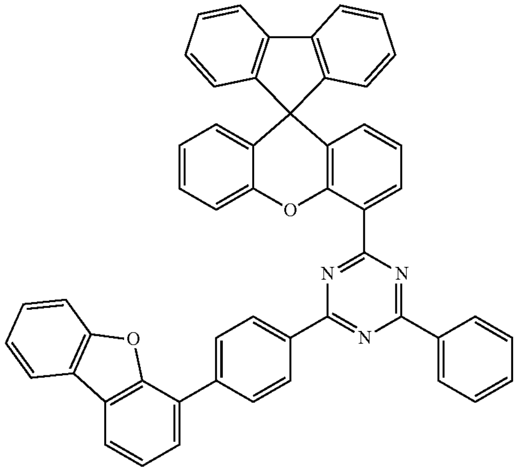
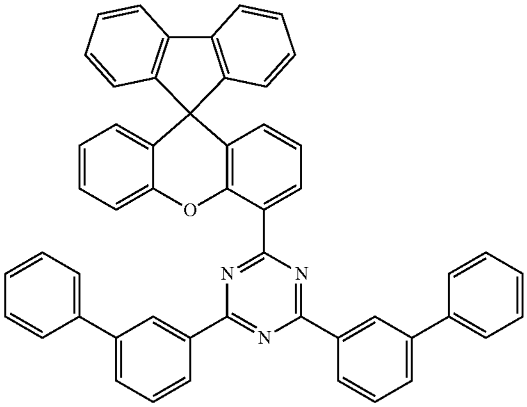

-continued
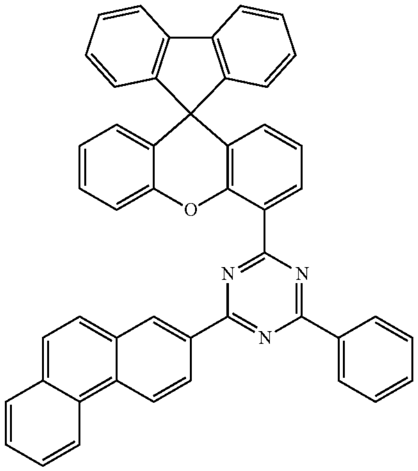
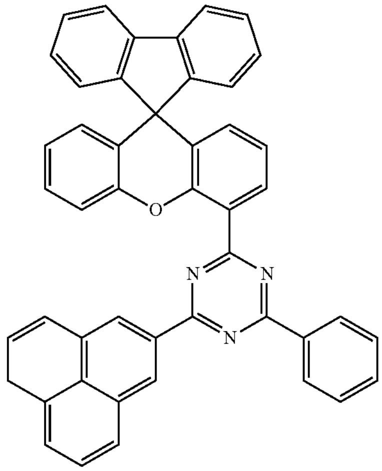
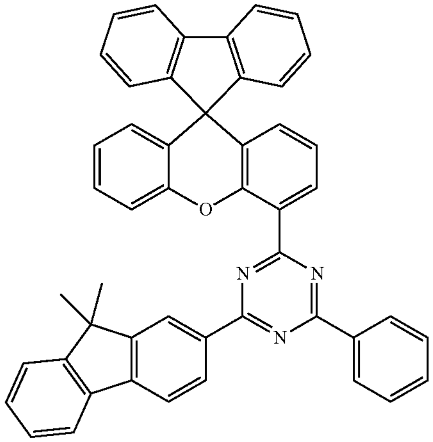
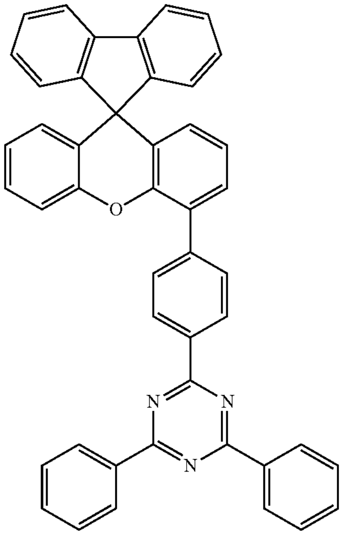
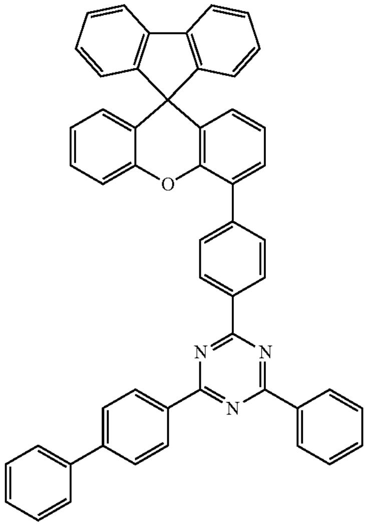
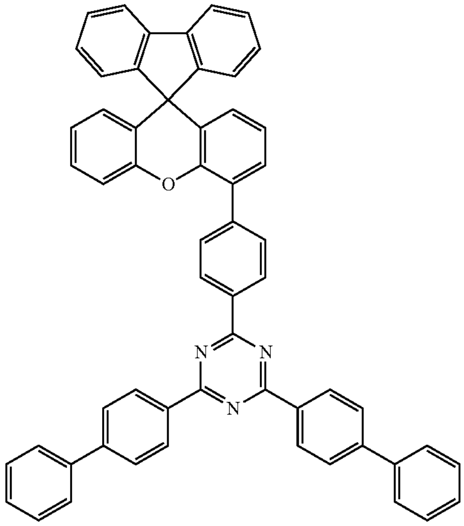

-continued
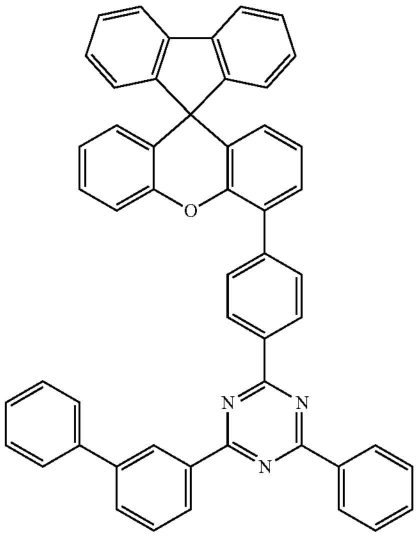
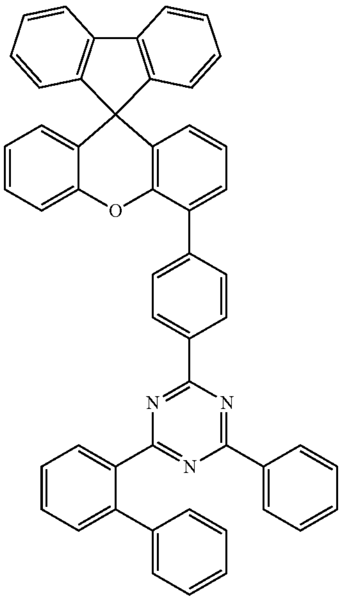
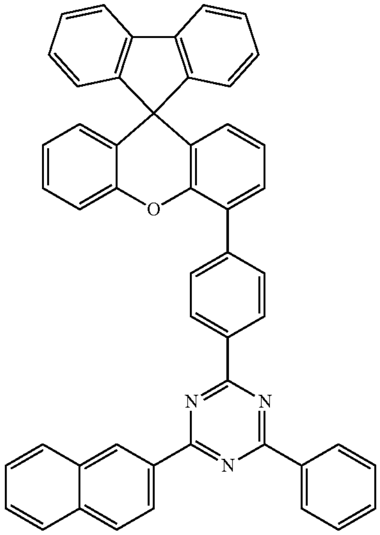
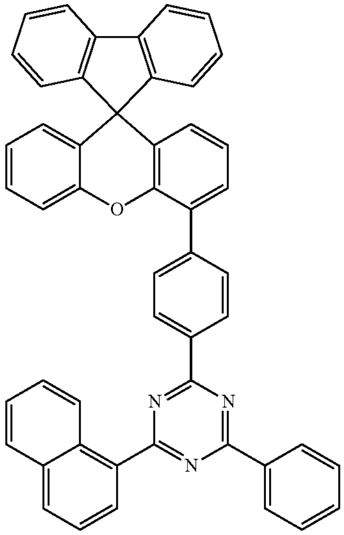

-continued
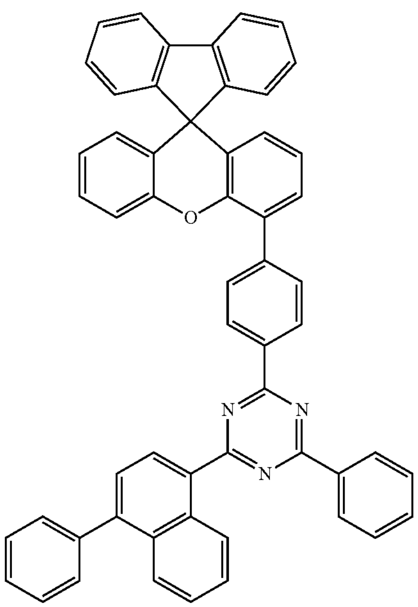
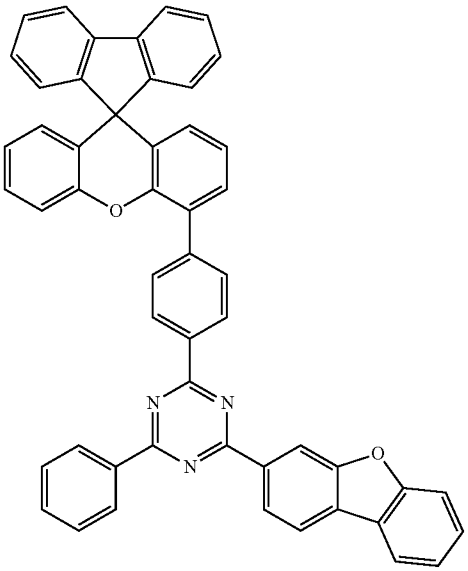
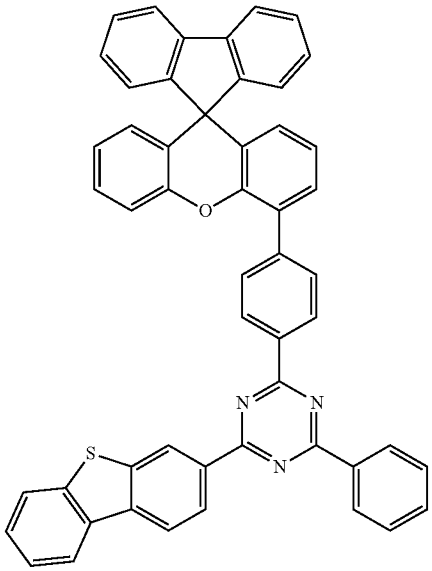
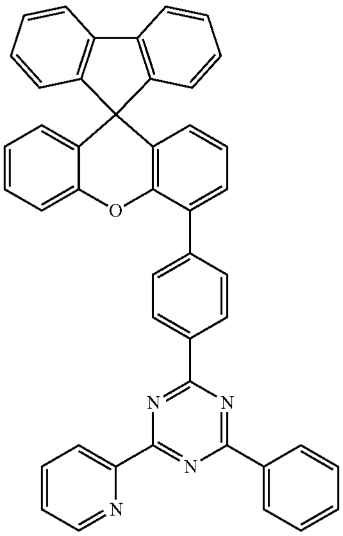

-continued
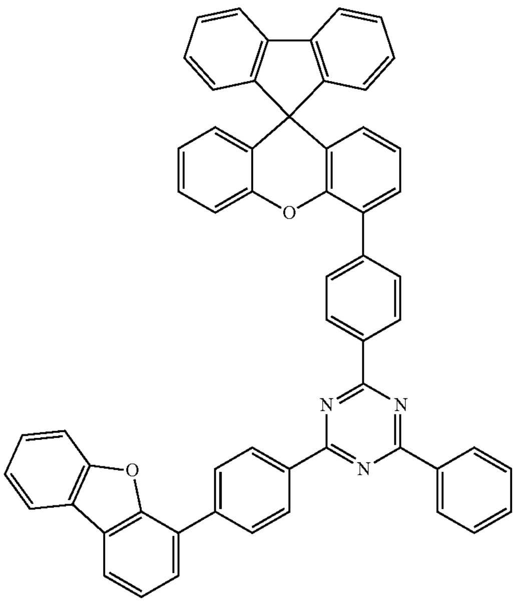
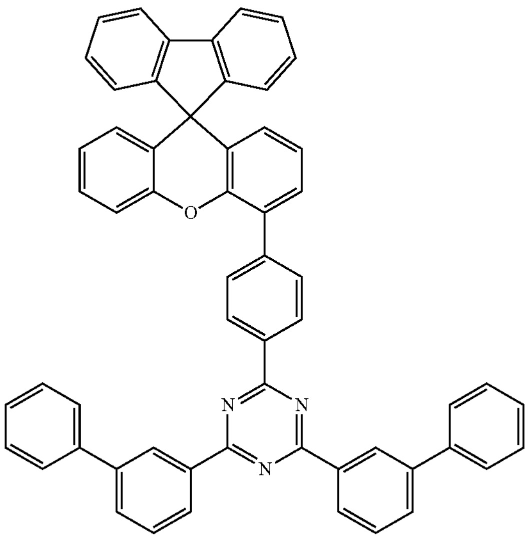
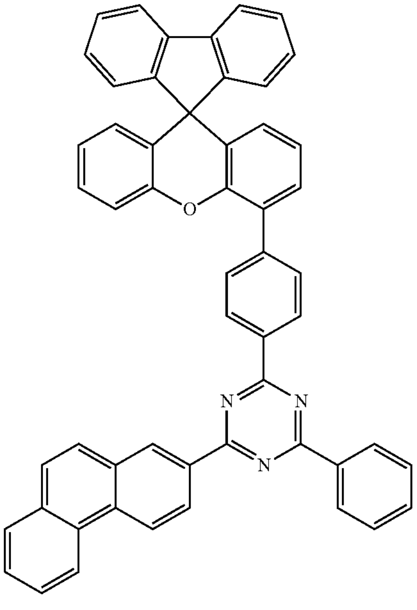
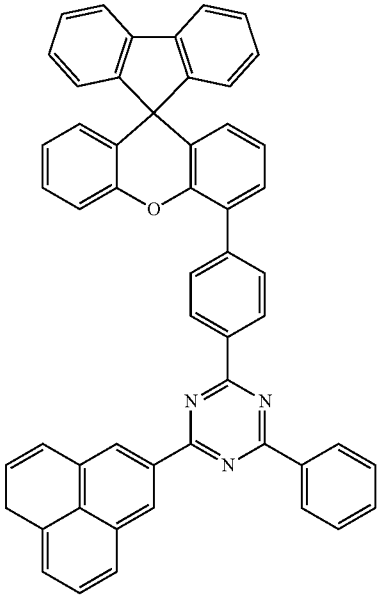

-continued
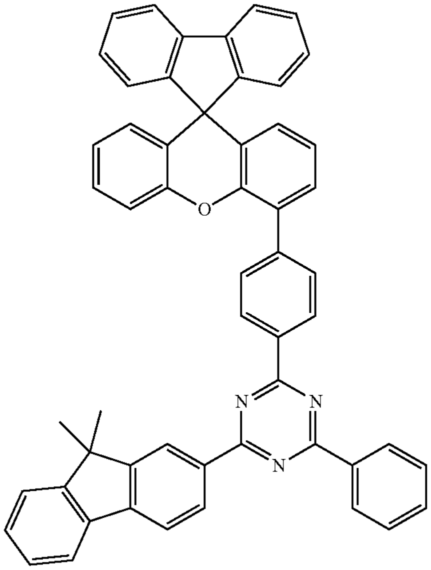
-continued
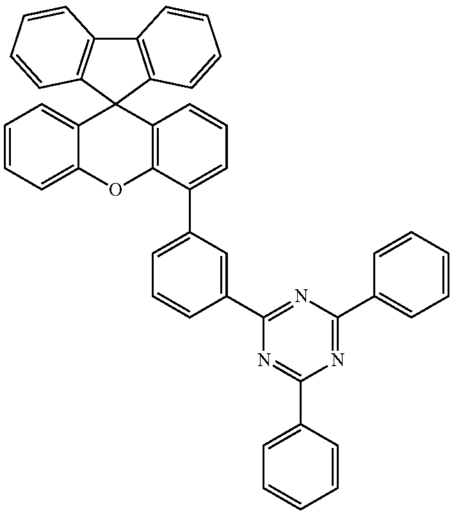
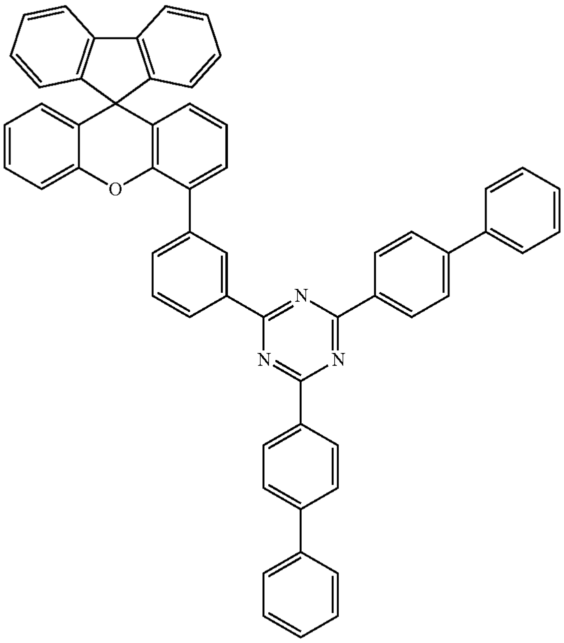
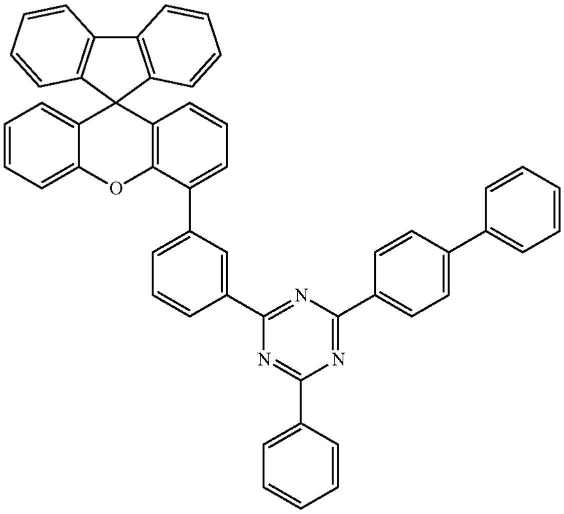

-continued
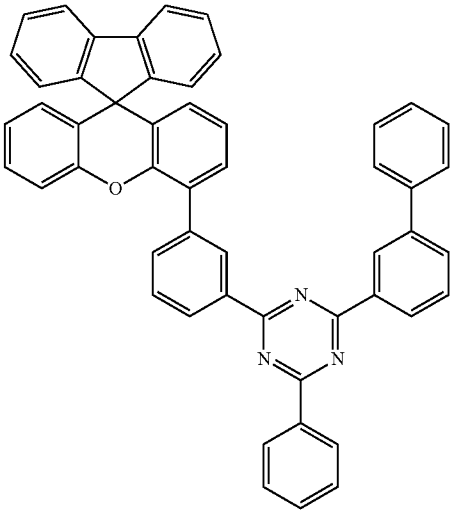
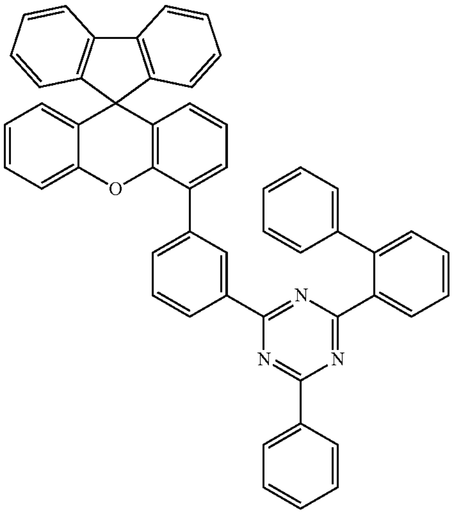
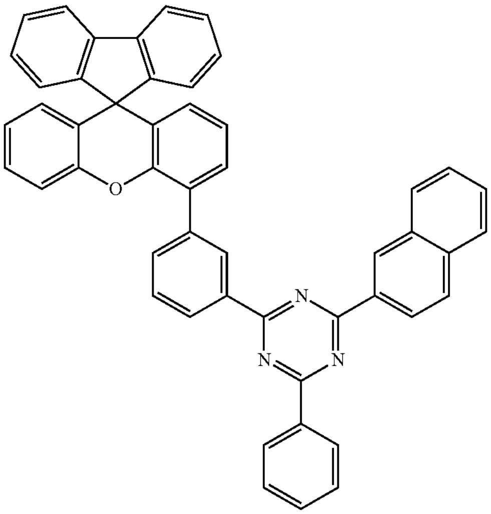
-continued
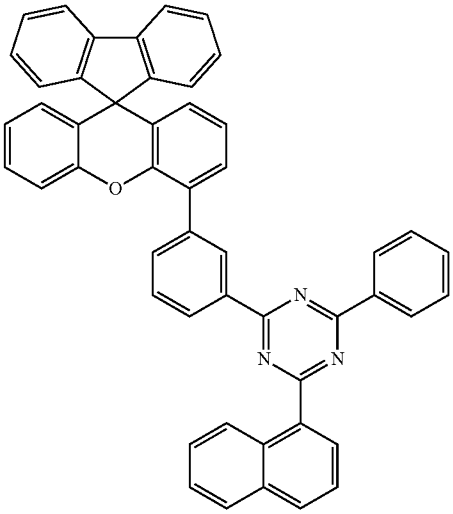
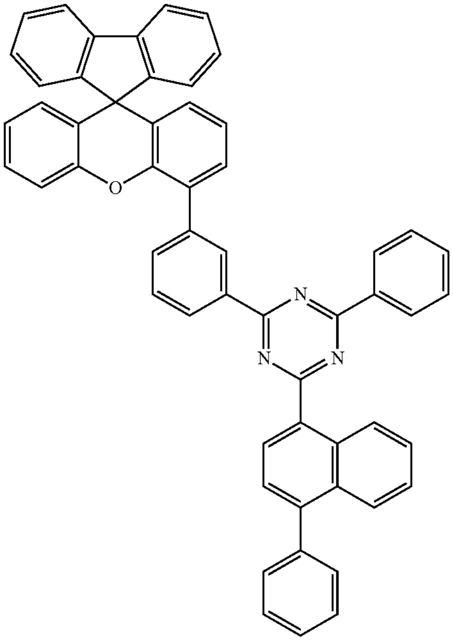

-continued
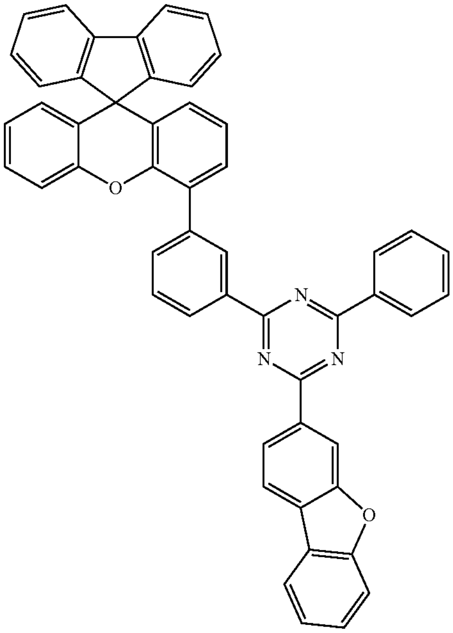
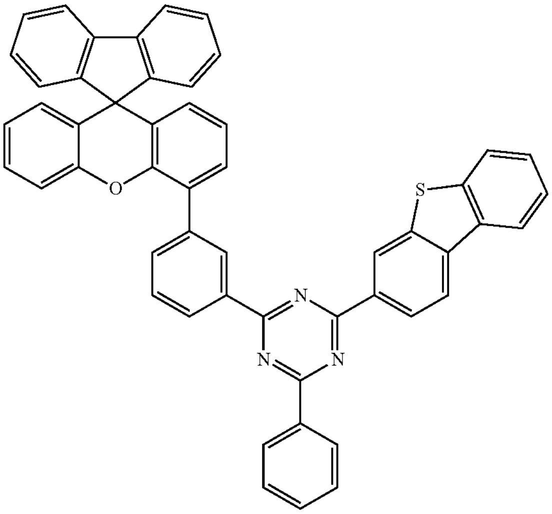
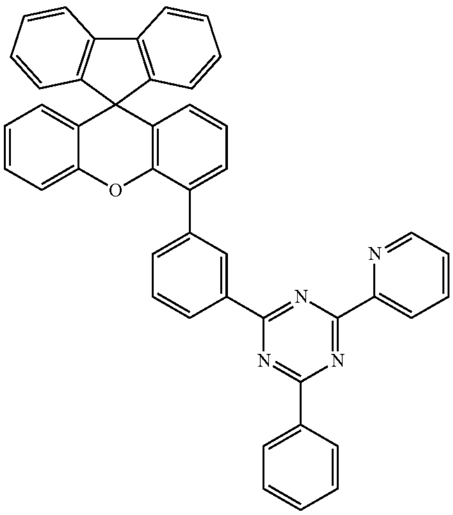 [SMILES: c1ccc(-c2nc(-c3cccc(-c4cccc5c4Oc4ccccc4C54c5ccccc5-c5ccccc54)c3)cc(-c3ccccn3)n2)cc1]
-continued
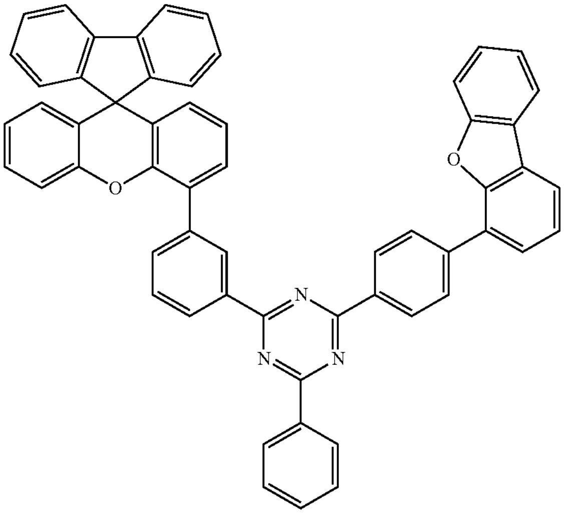
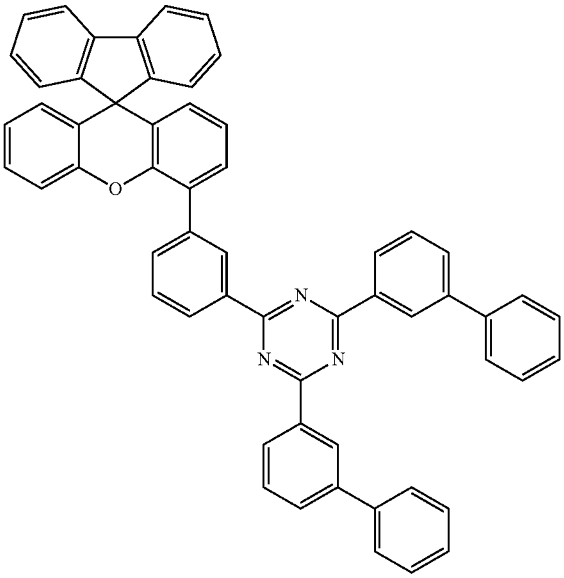
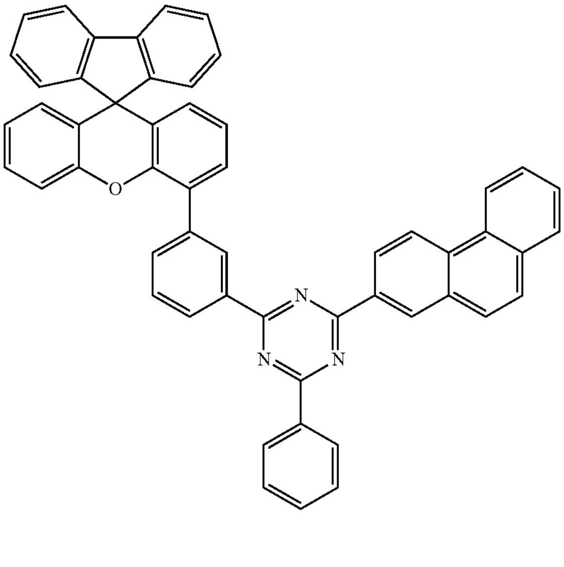

-continued
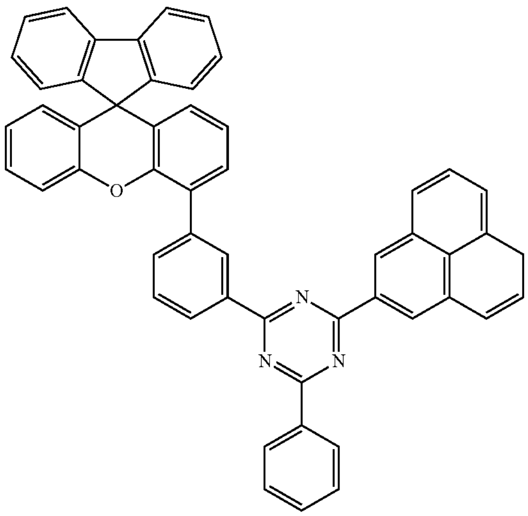
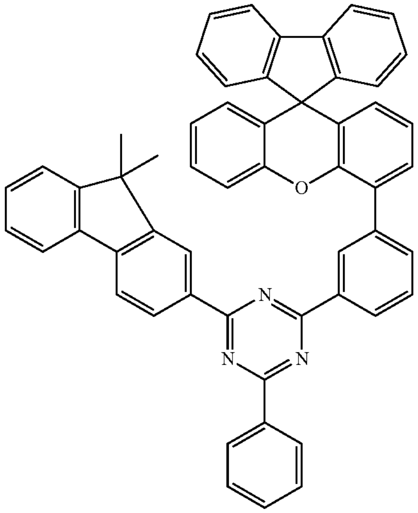
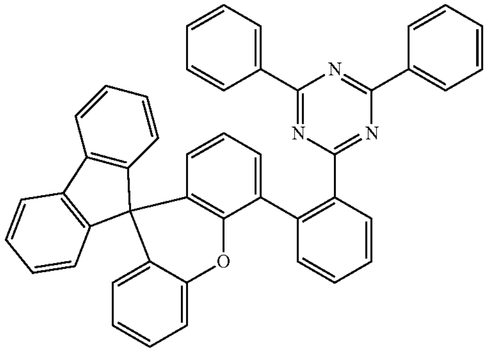
-continued
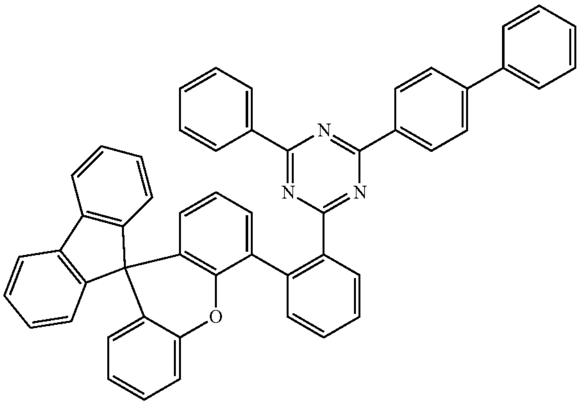
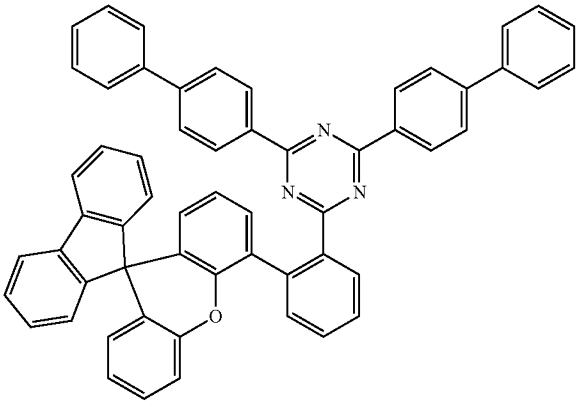
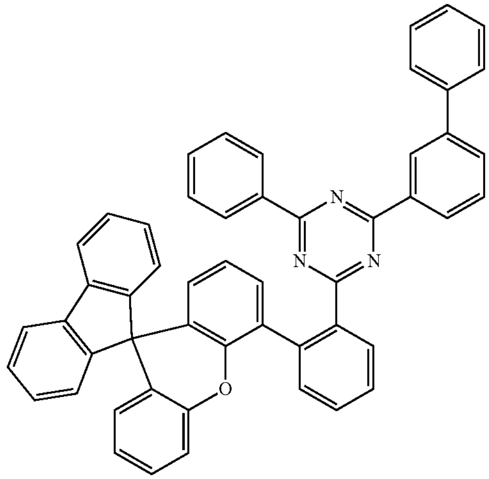

-continued
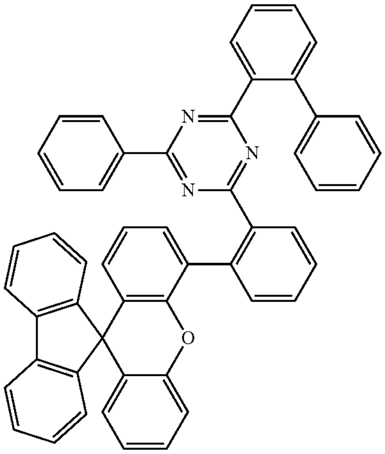
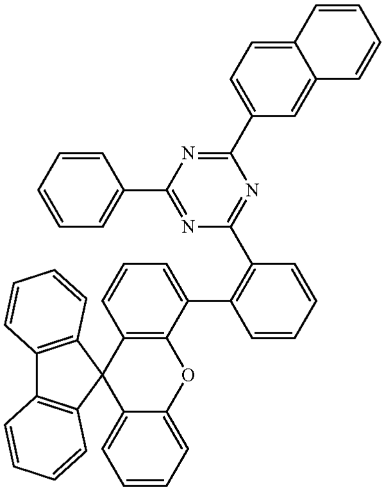
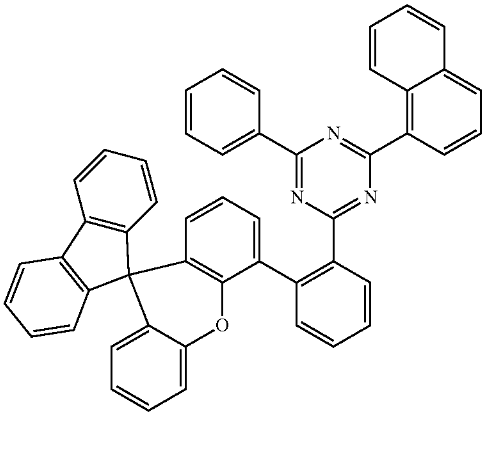
-continued
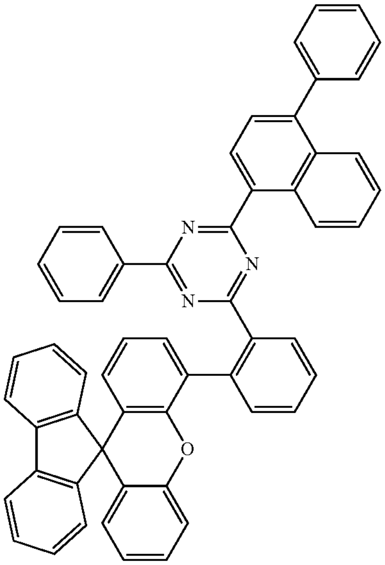
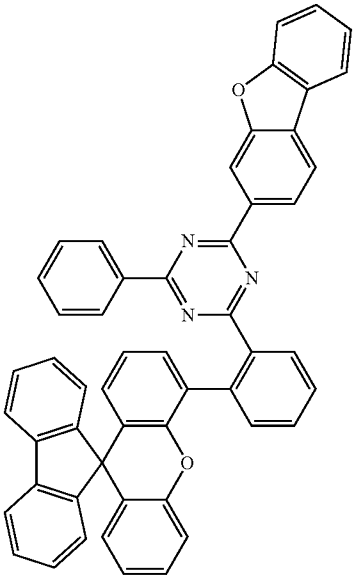
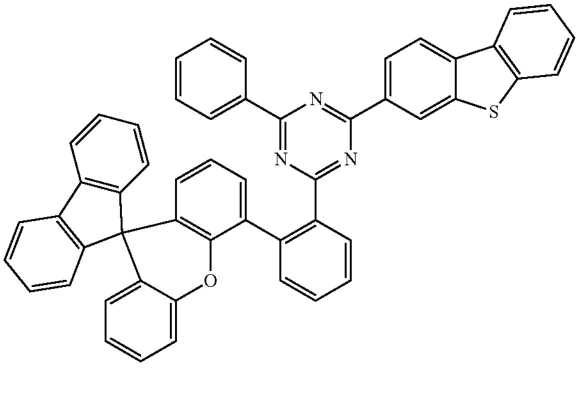

-continued
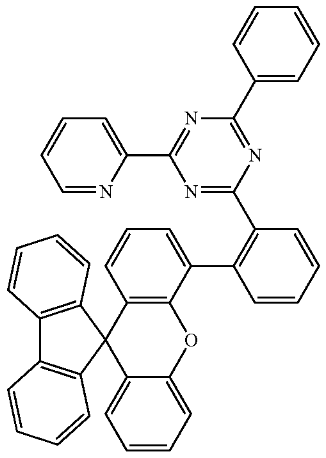
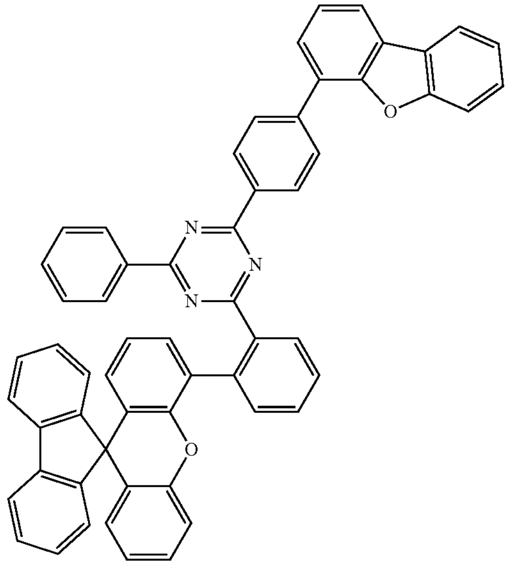
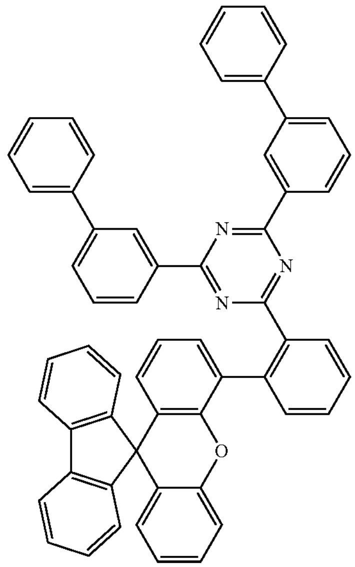
-continued
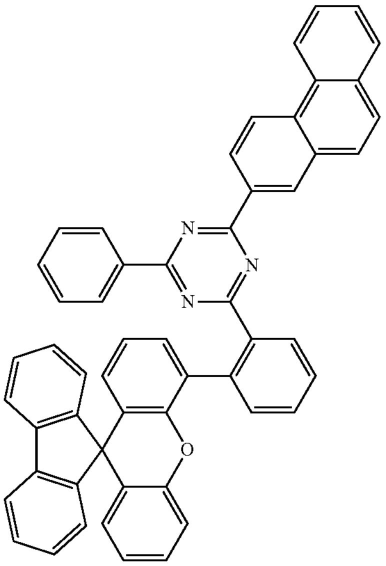
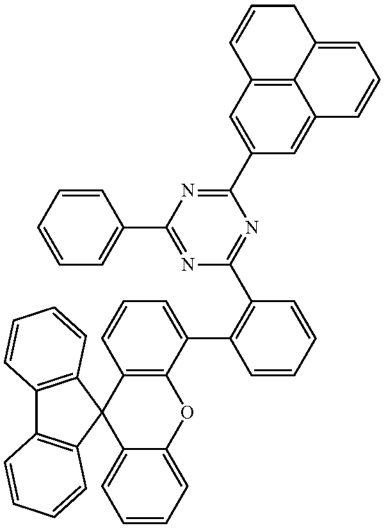
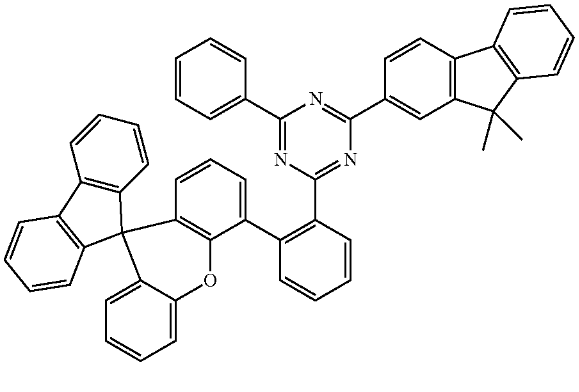

-continued
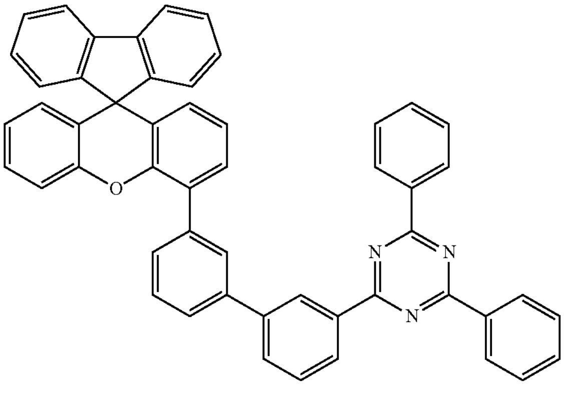
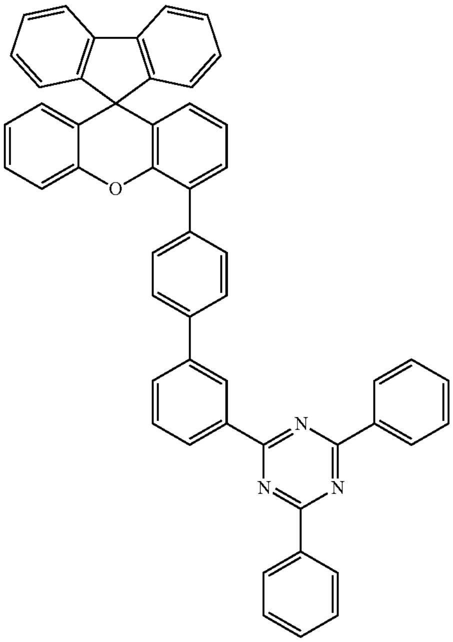
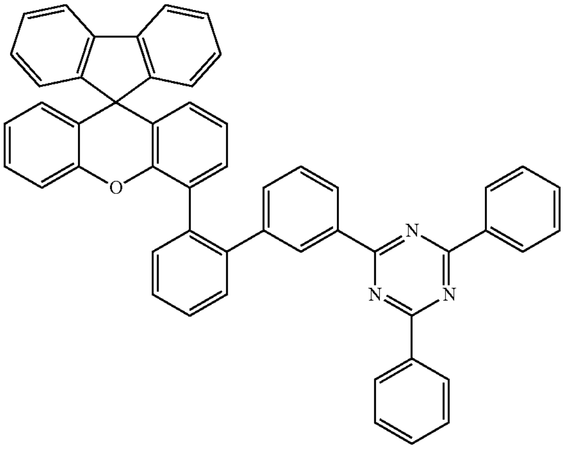
-continued
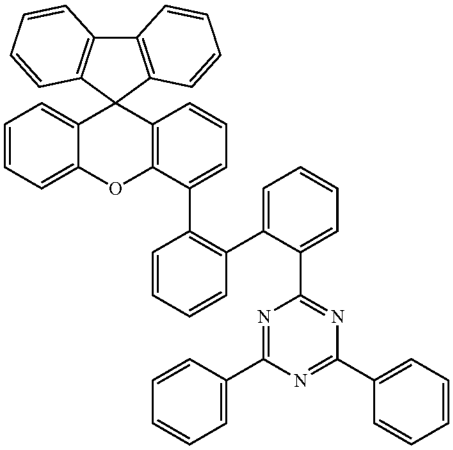
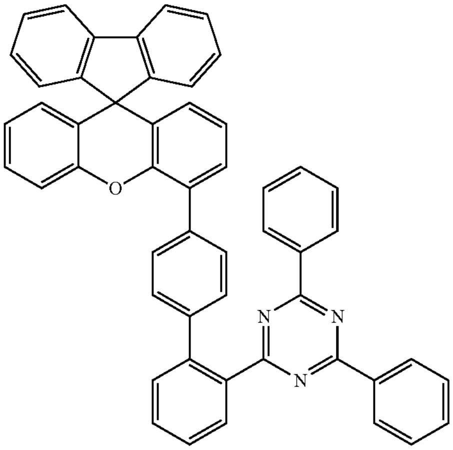
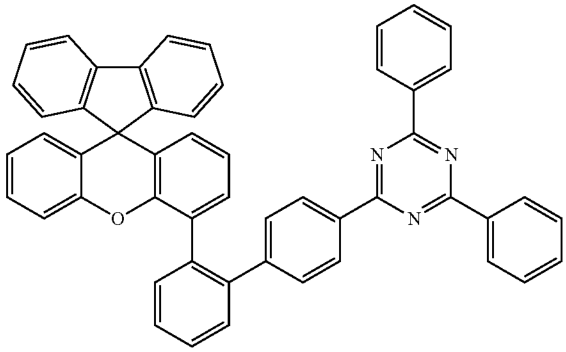
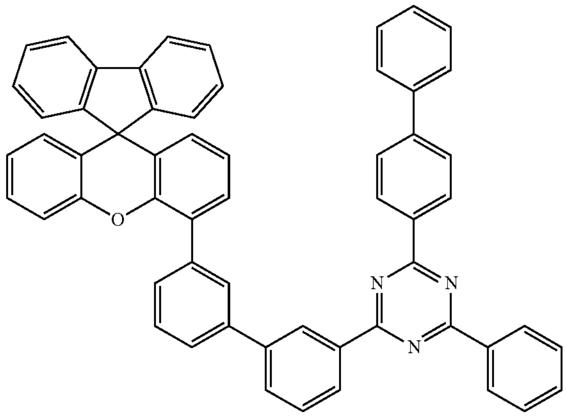

-continued
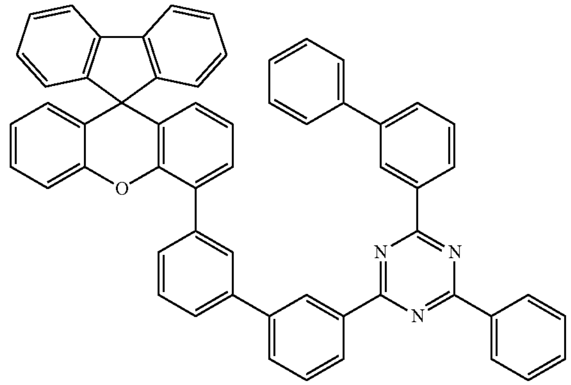
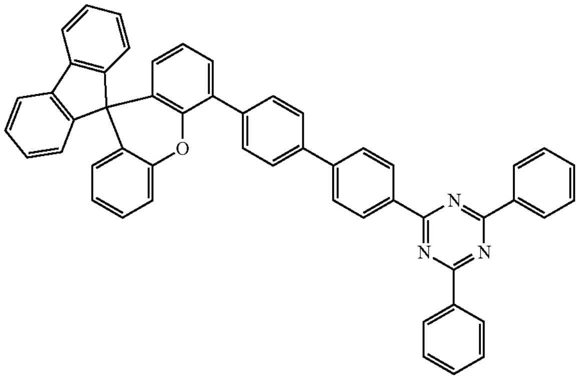
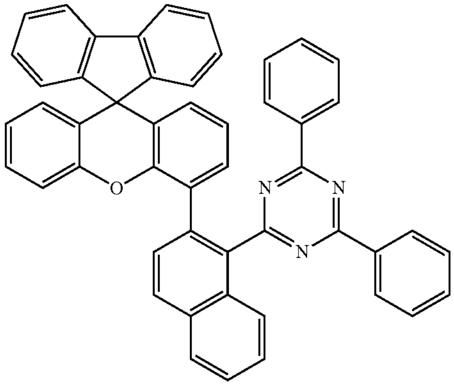
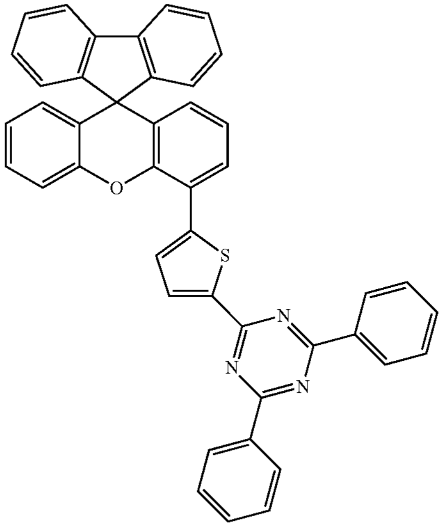
-continued
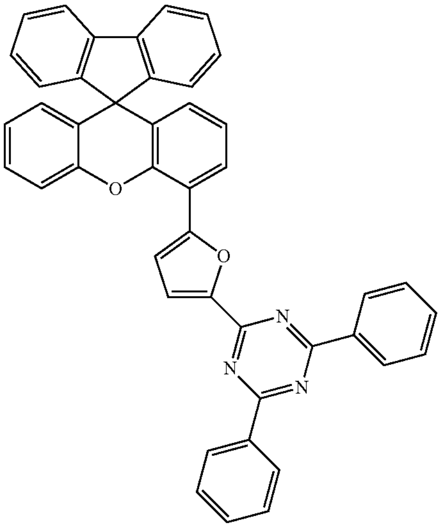
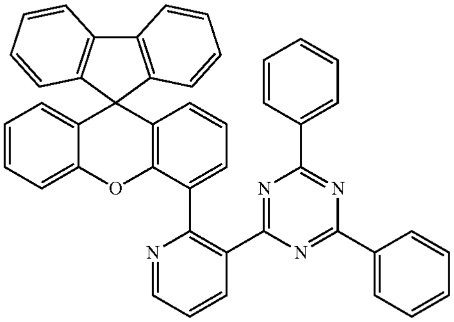
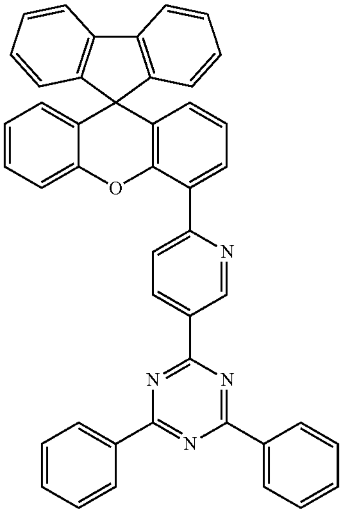

-continued
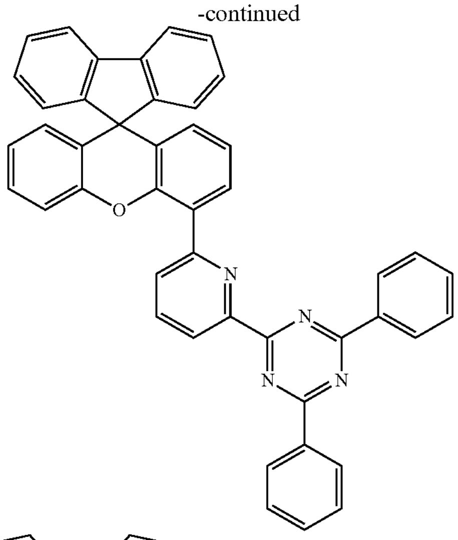
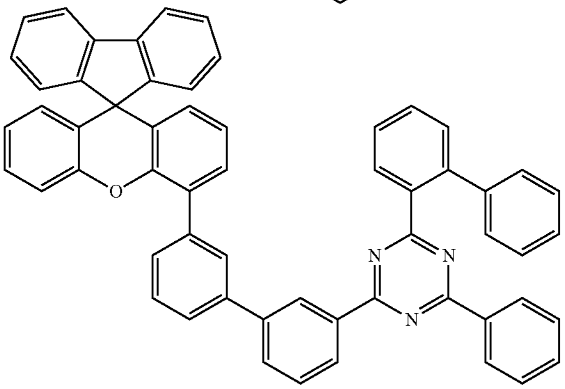
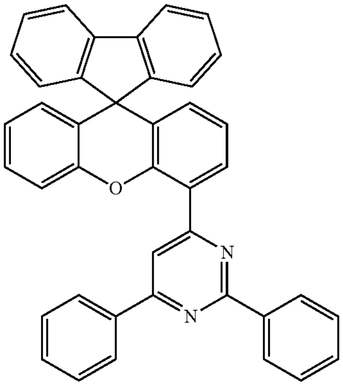
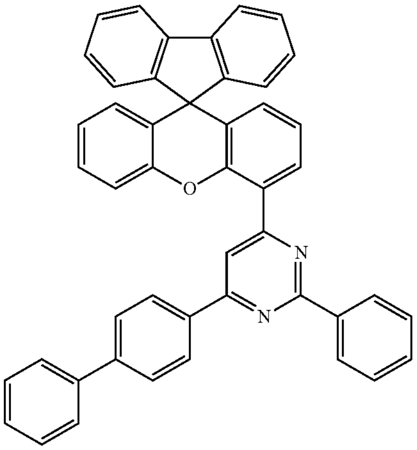
-continued
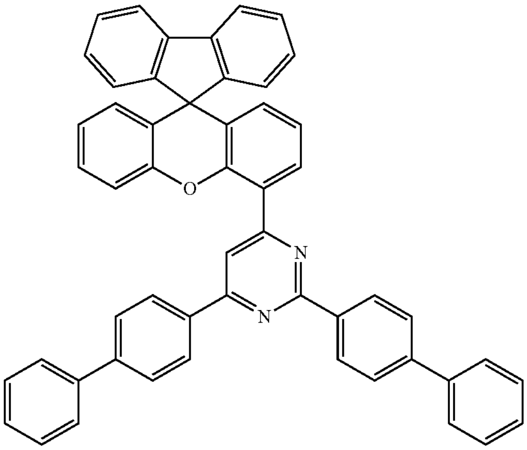
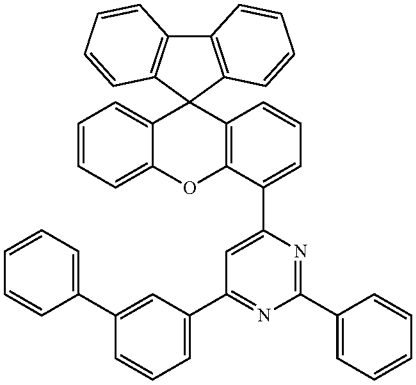
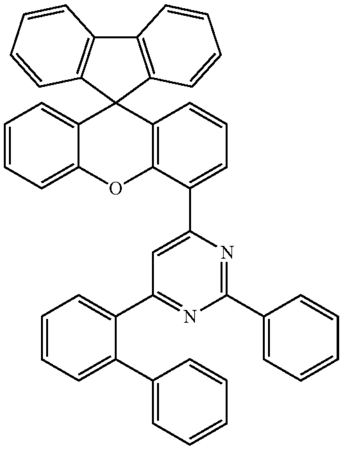
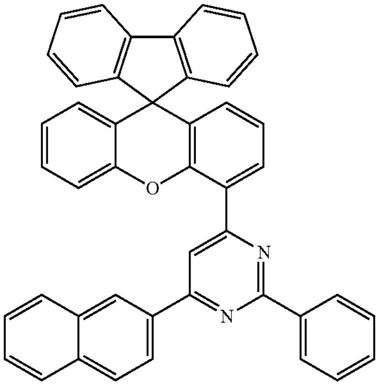

-continued
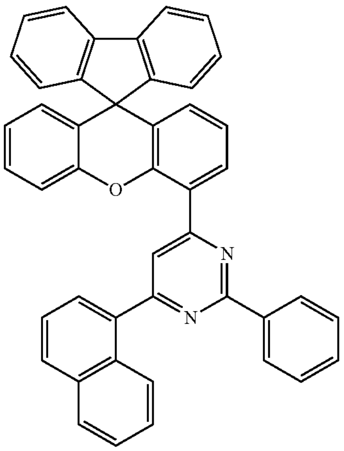
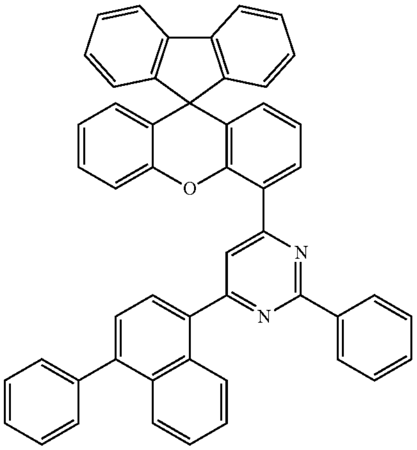
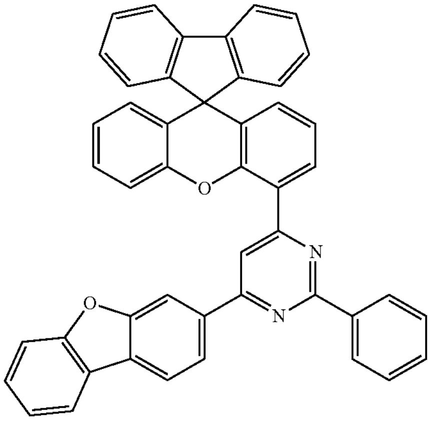
-continued
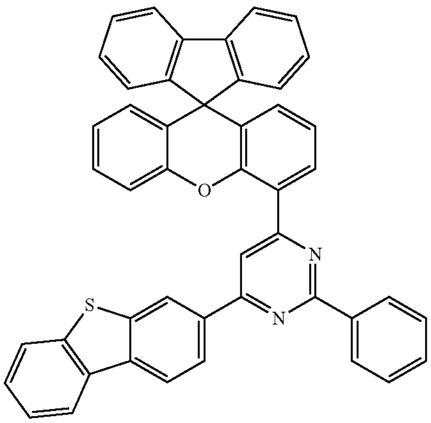
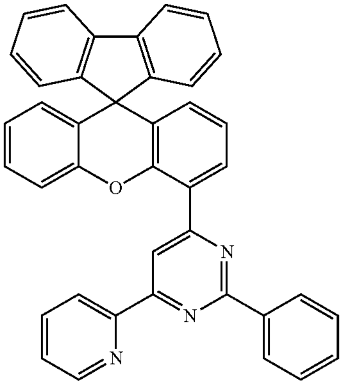
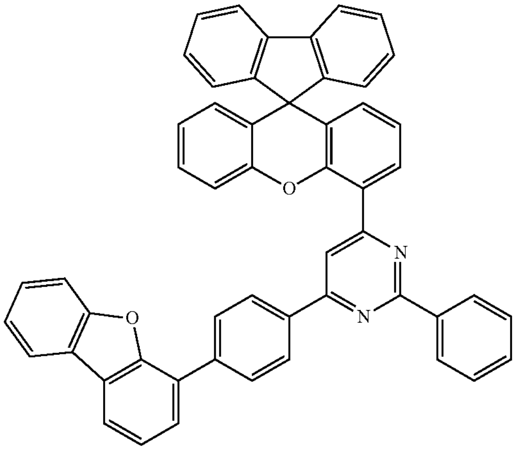
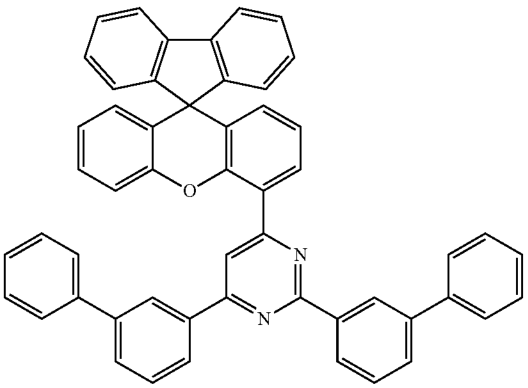

-continued
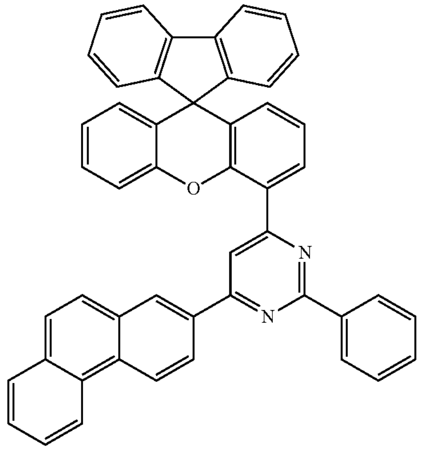
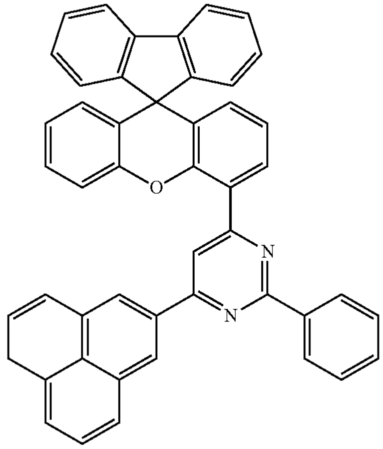
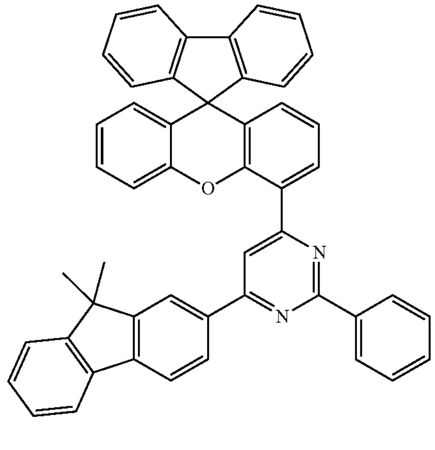
-continued
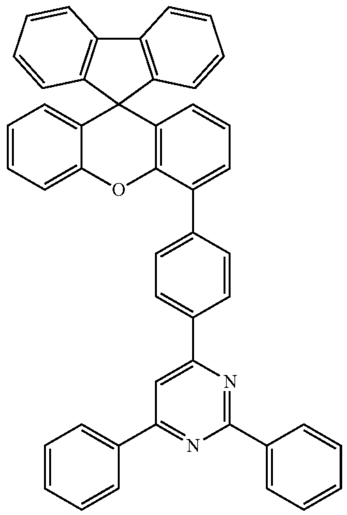
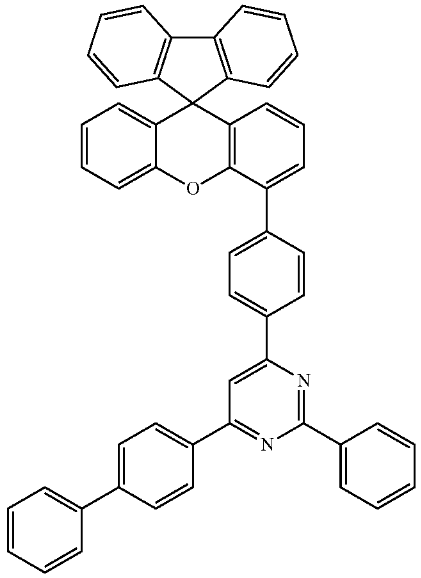
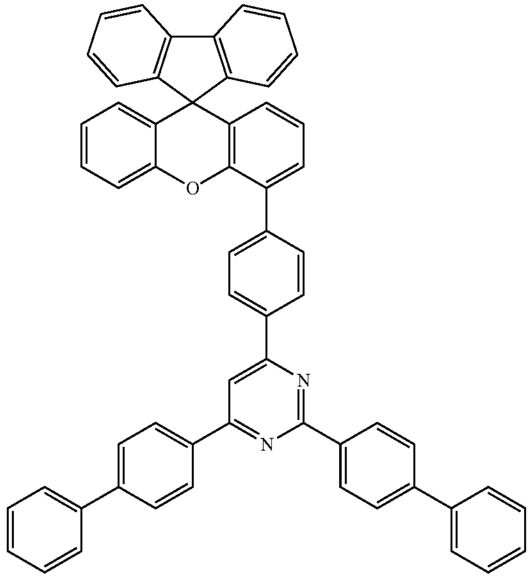

-continued
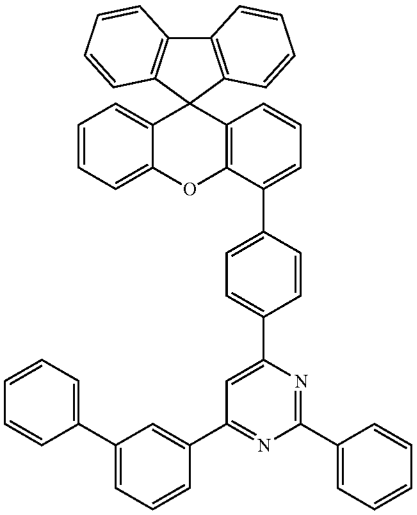
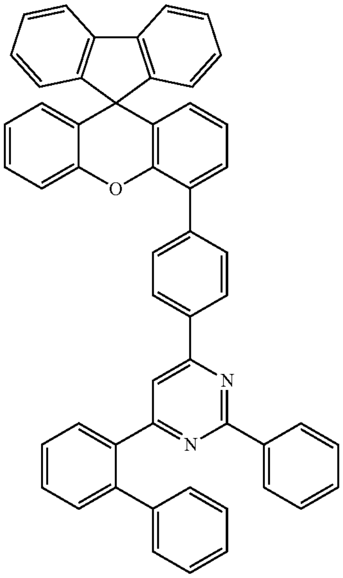
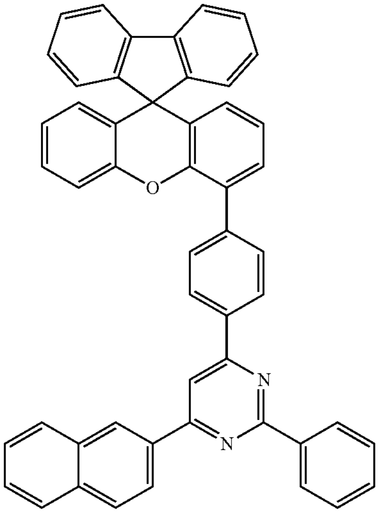
-continued
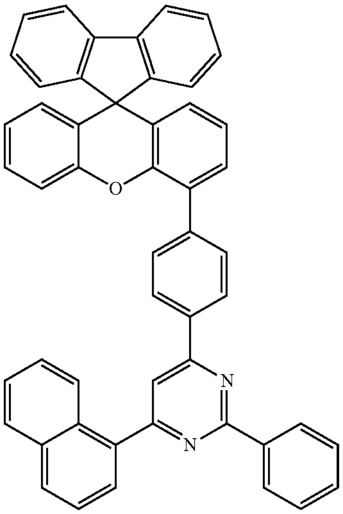
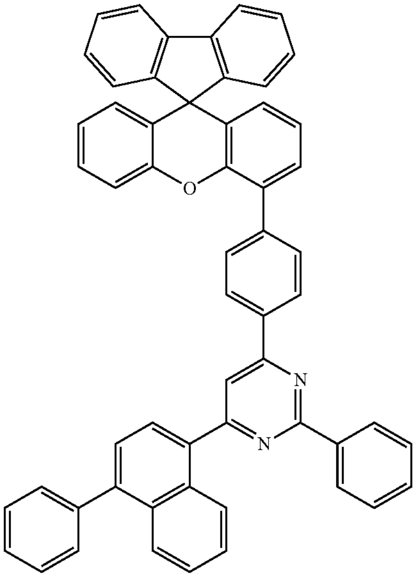
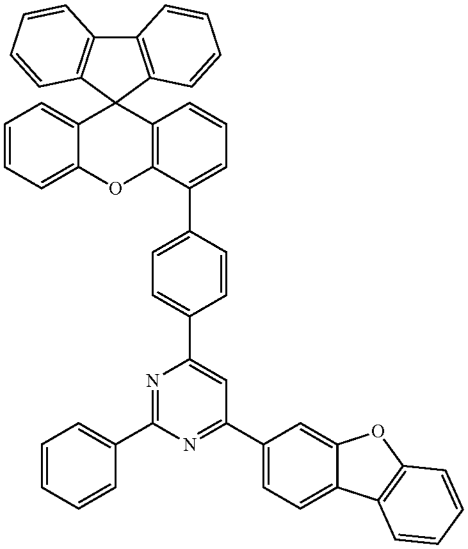

-continued
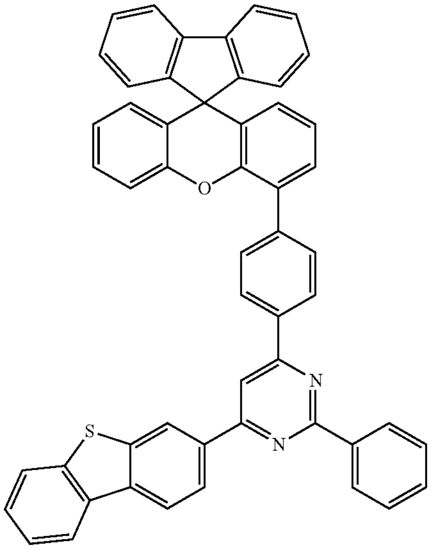
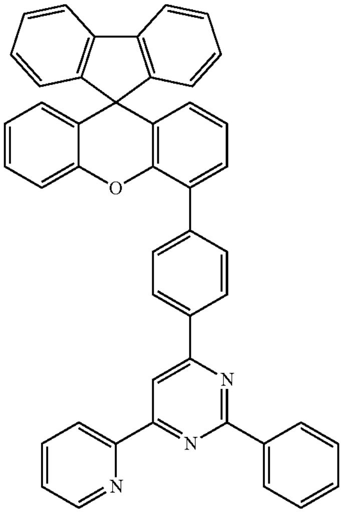
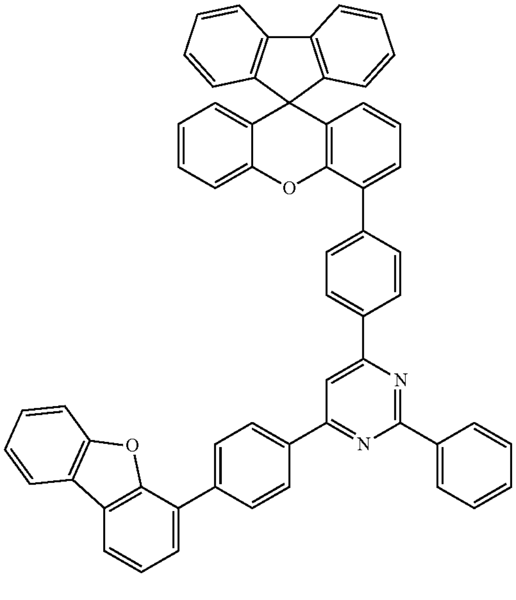
-continued
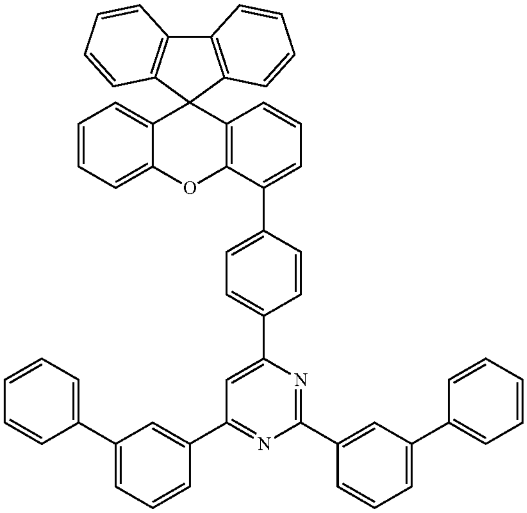
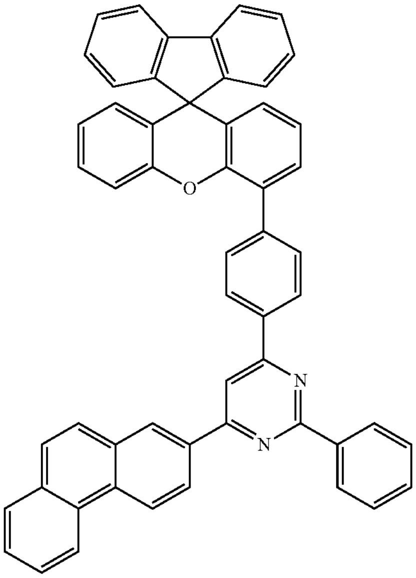
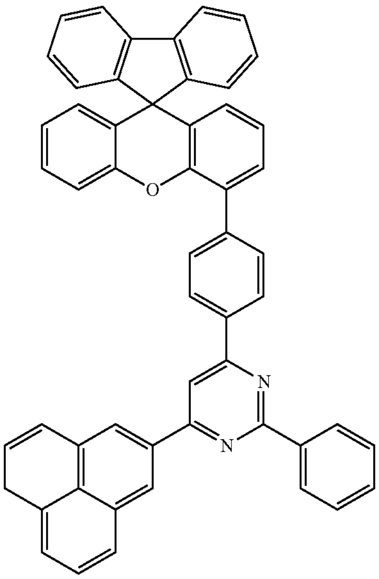

-continued
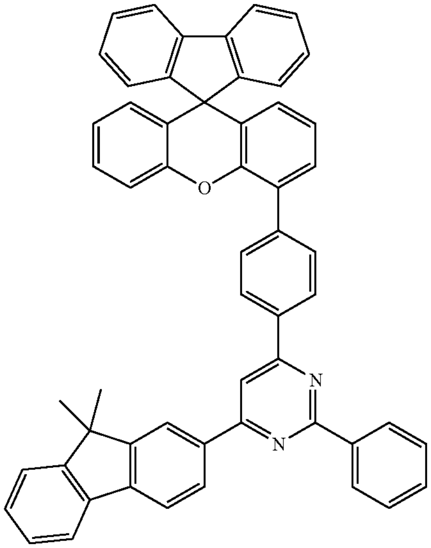
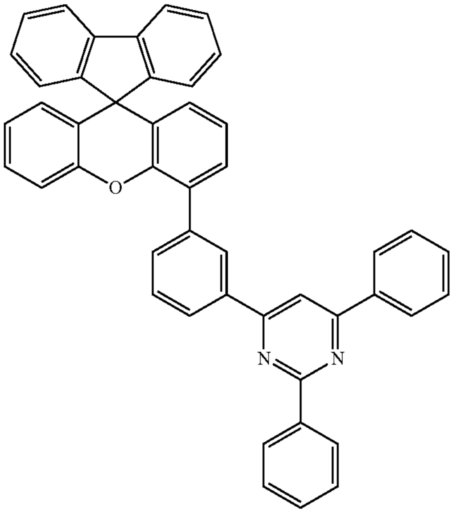
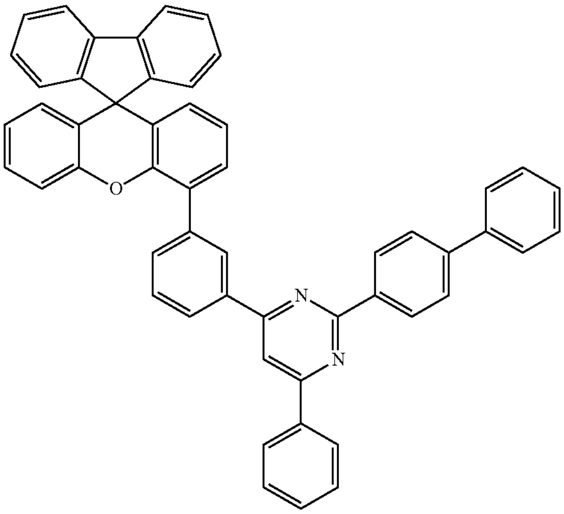
-continued
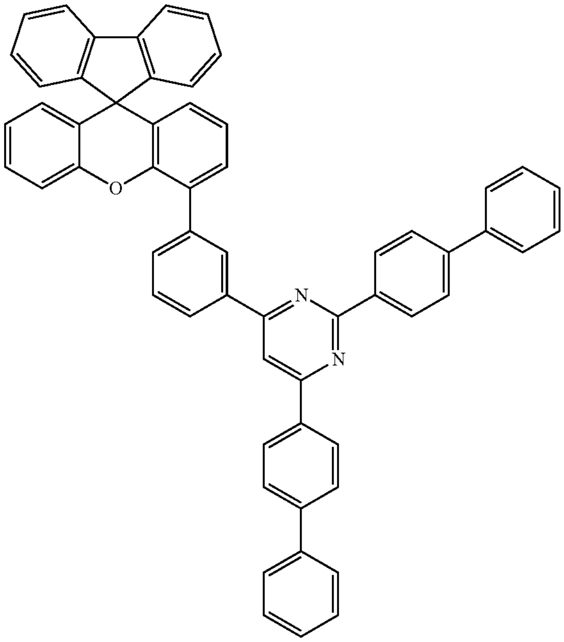
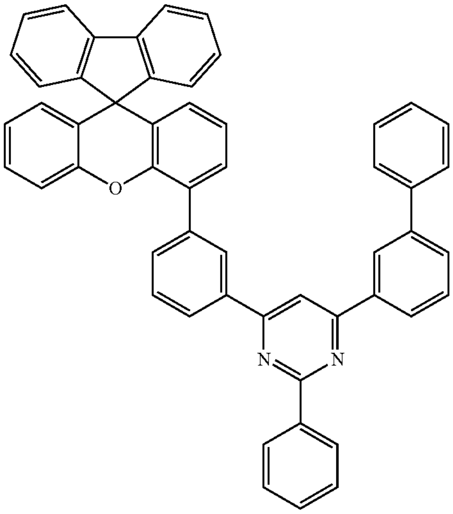
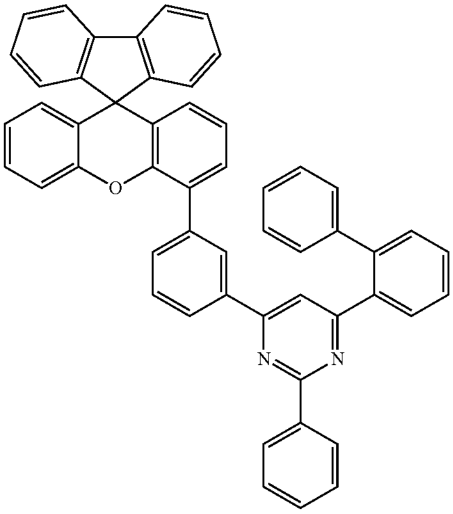

-continued
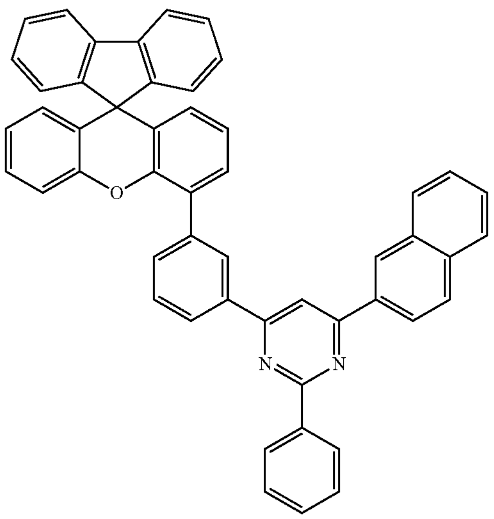
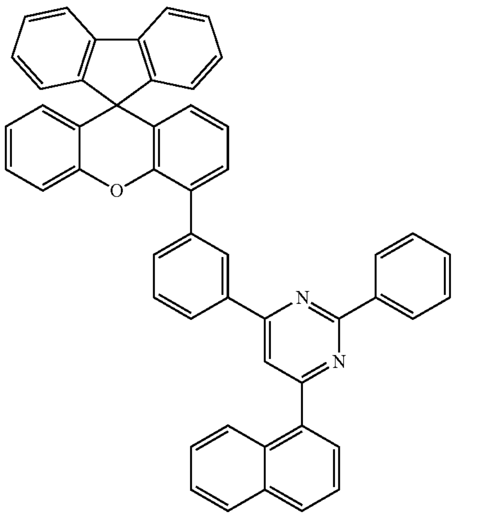
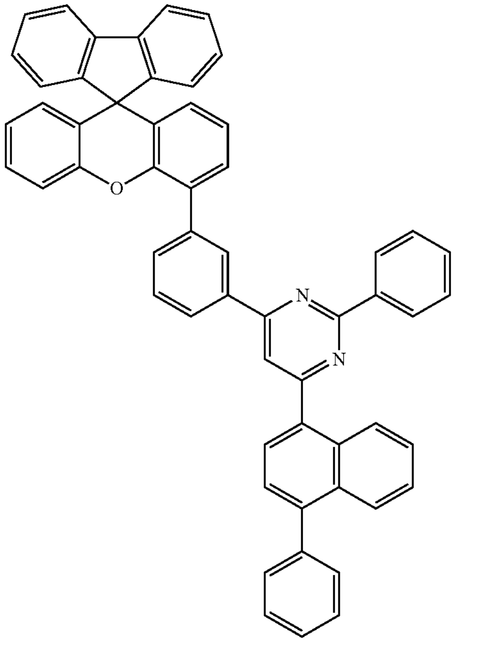
-continued
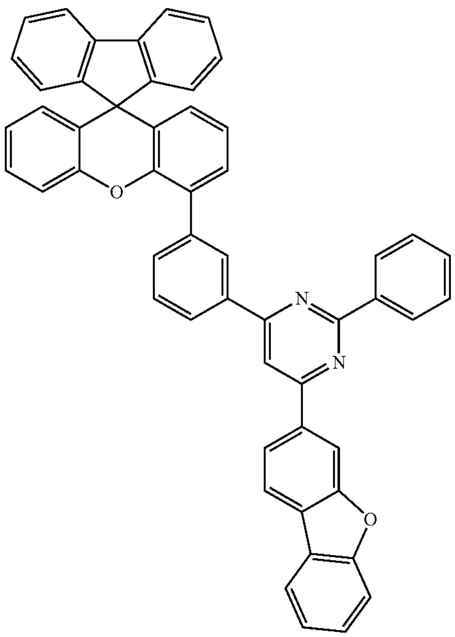
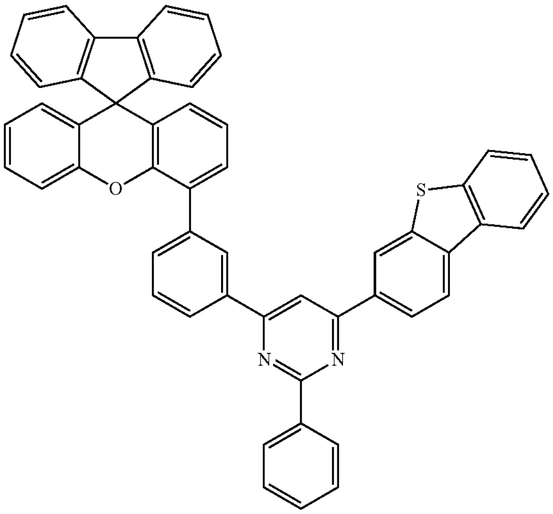
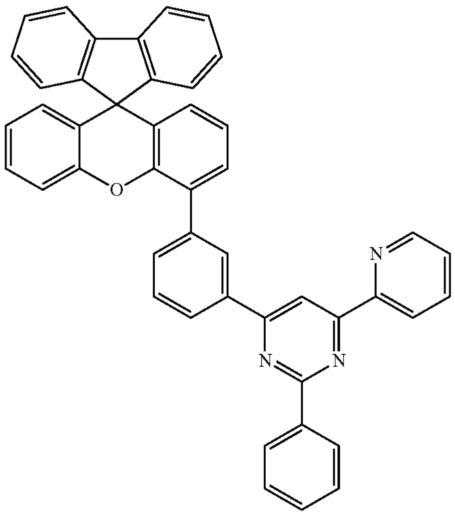

-continued
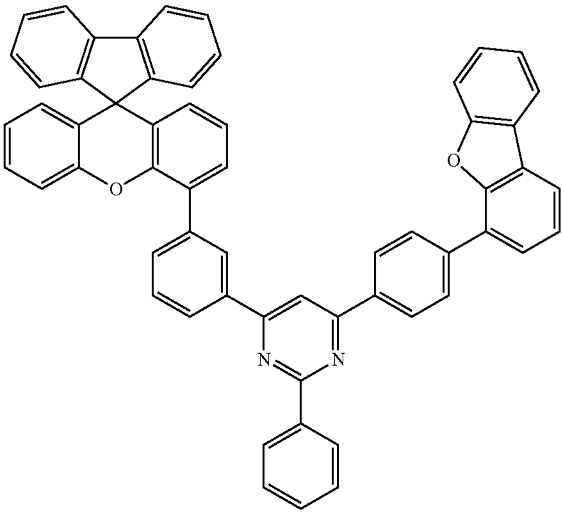
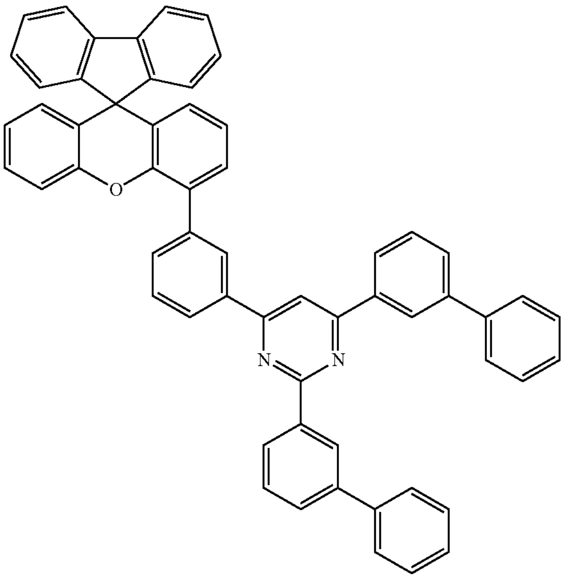
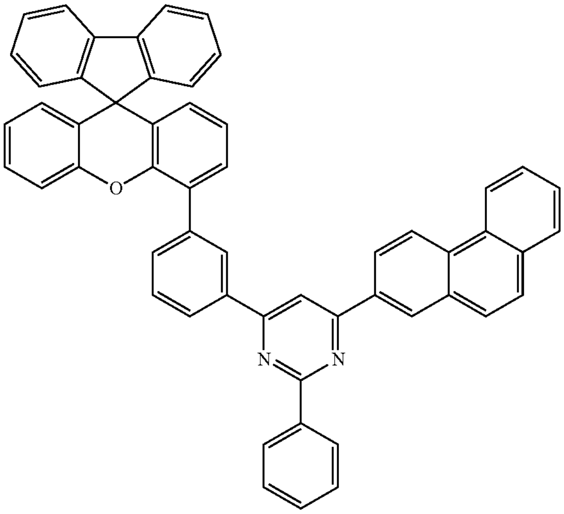
-continued
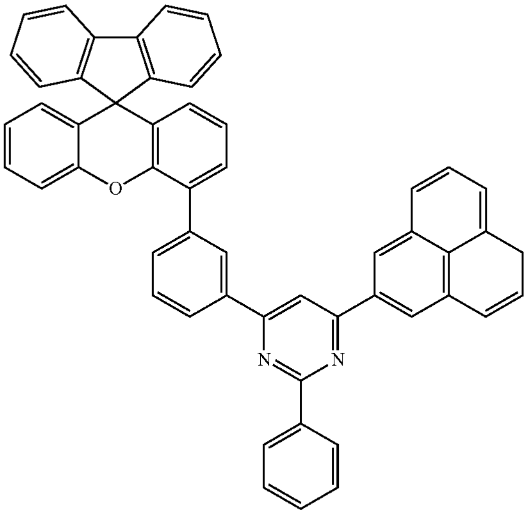
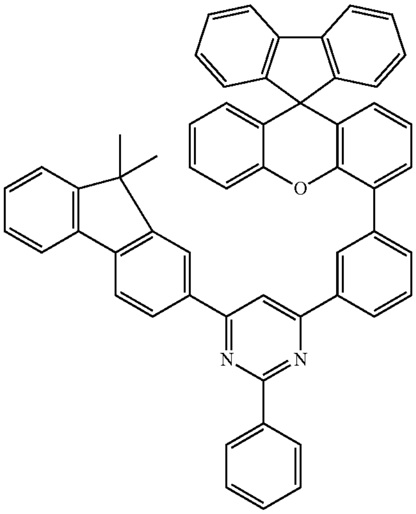
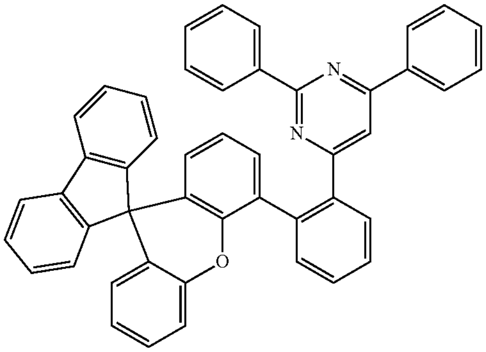

-continued
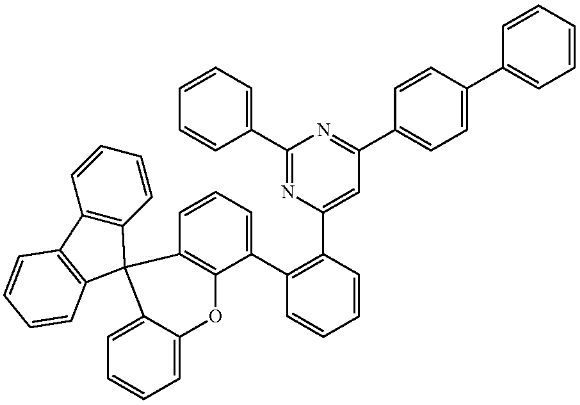
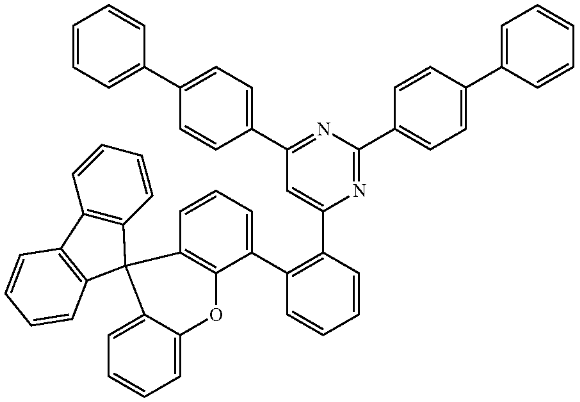
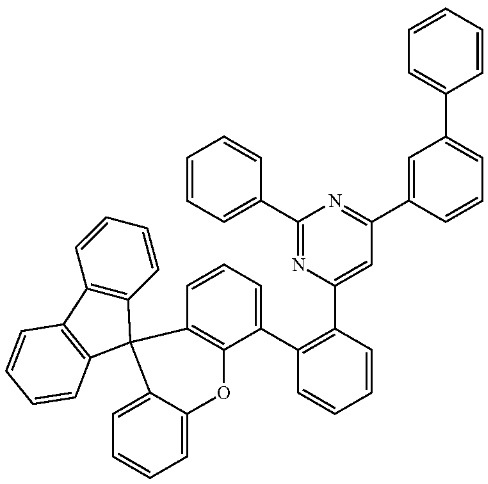
-continued
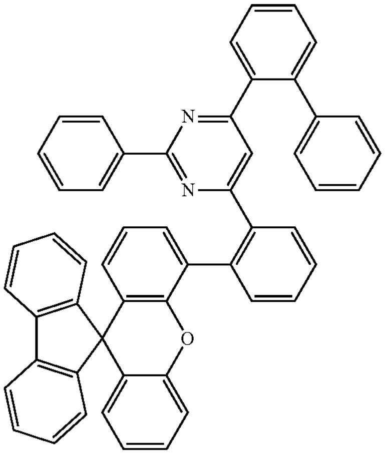
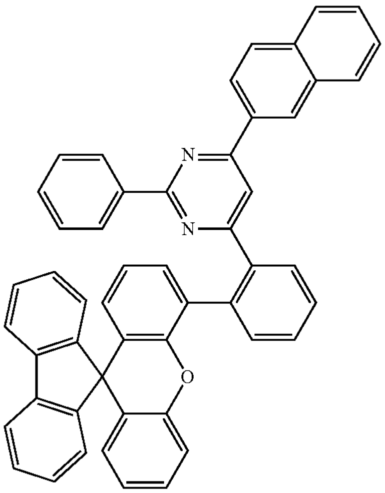
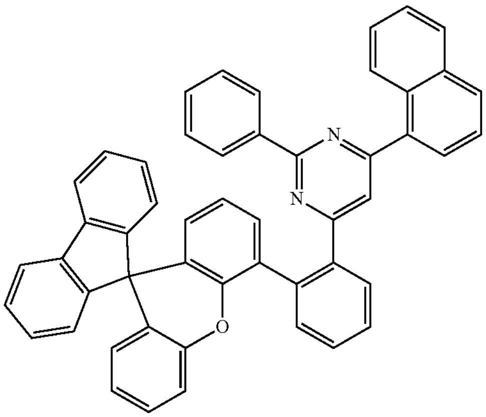

-continued
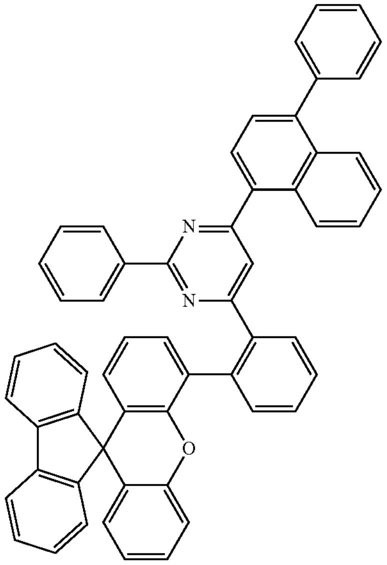
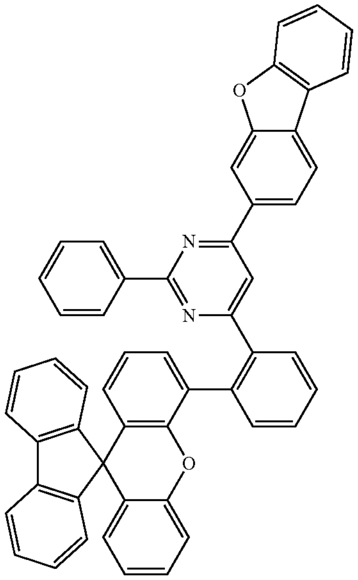
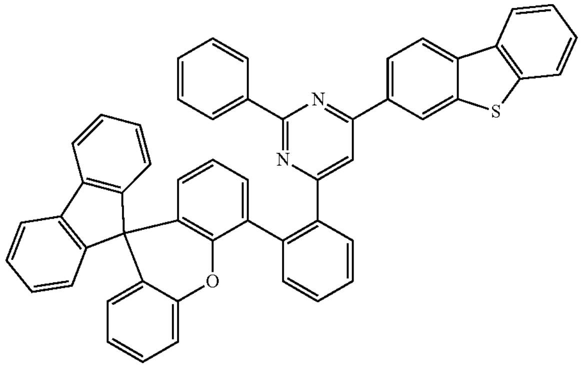
-continued
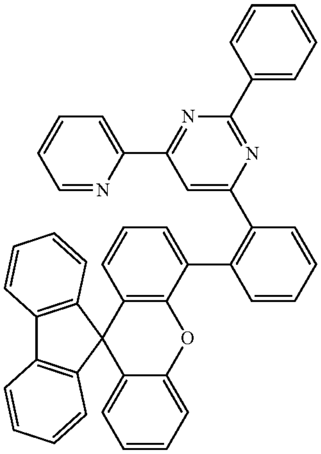
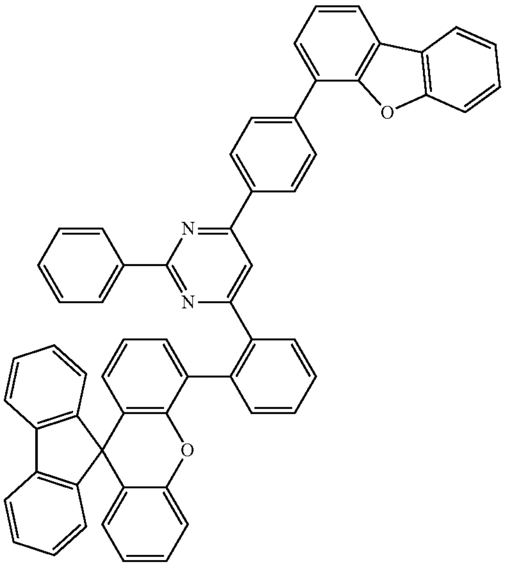
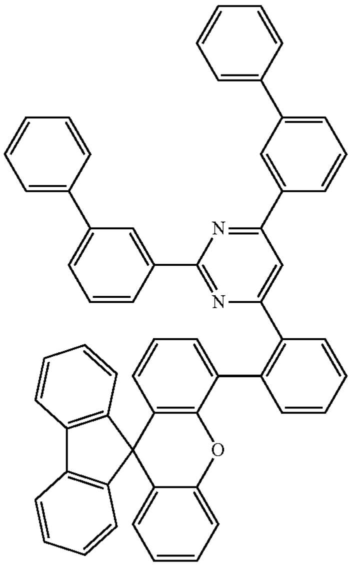

-continued
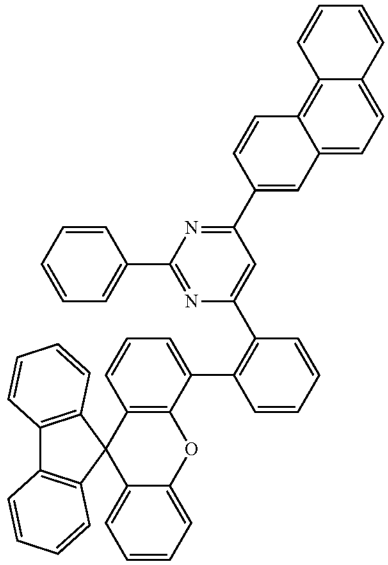
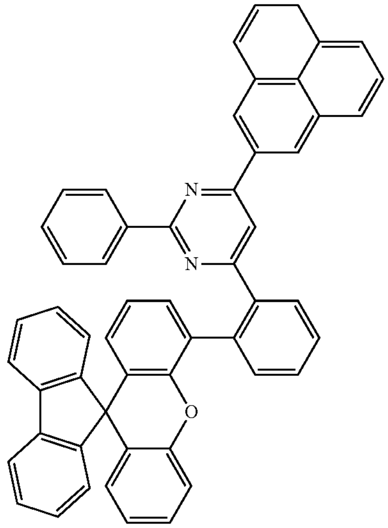
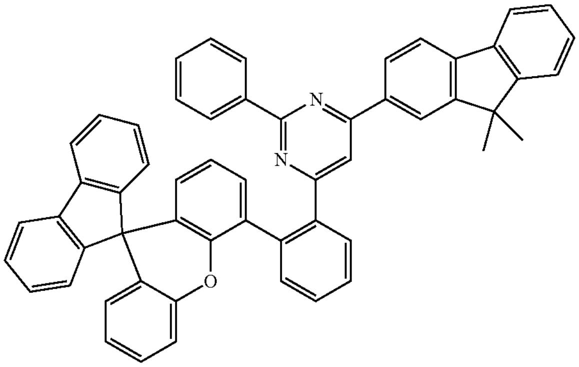
-continued
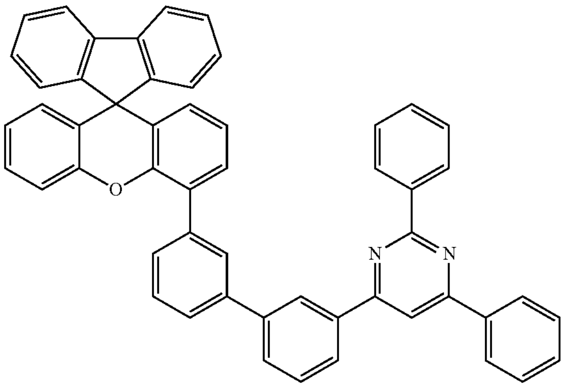
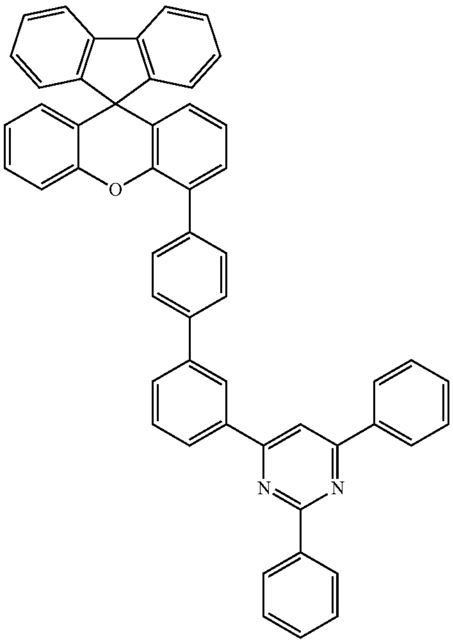
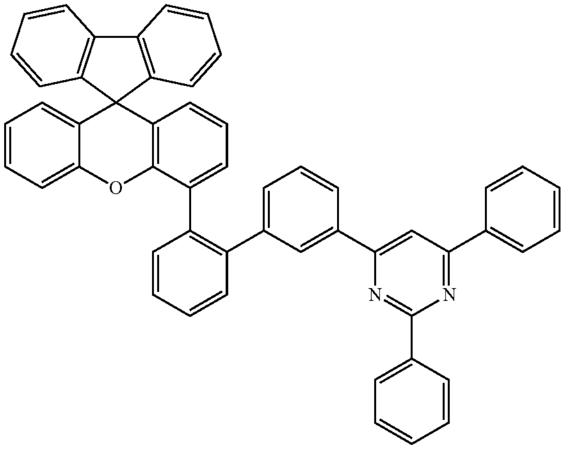

-continued
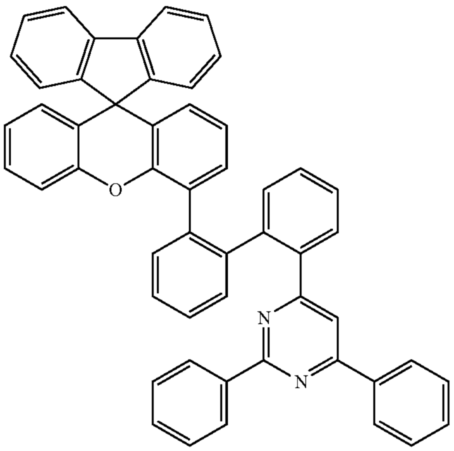
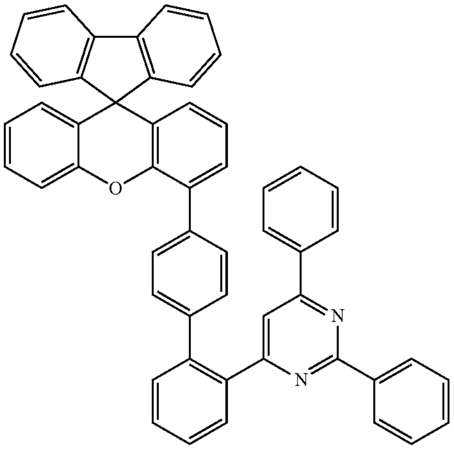
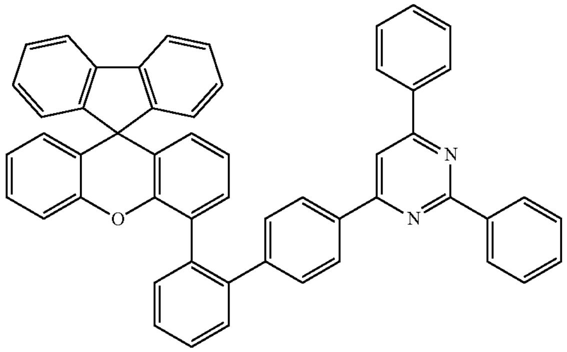
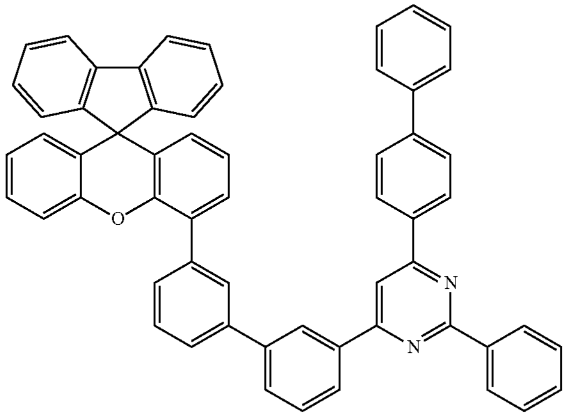
-continued
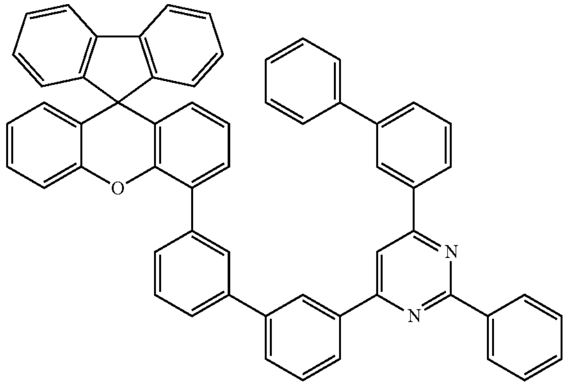
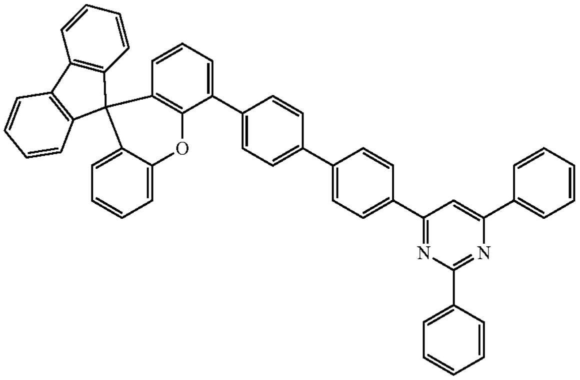
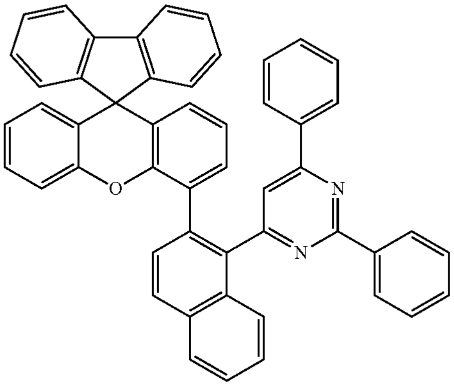
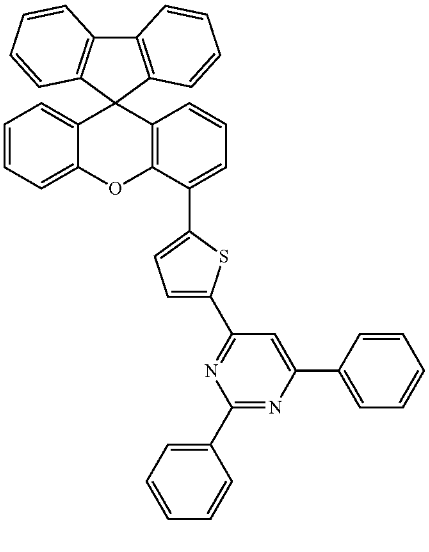

-continued
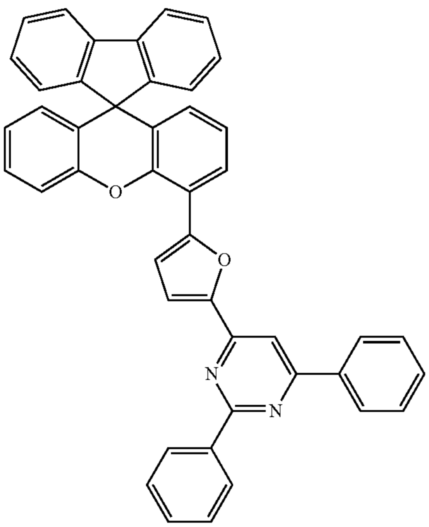
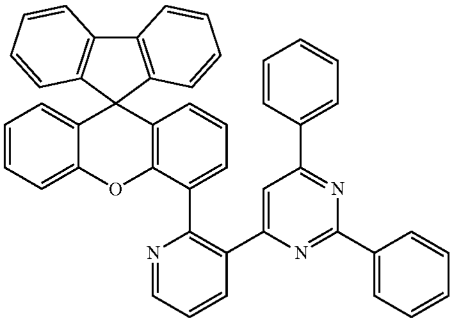
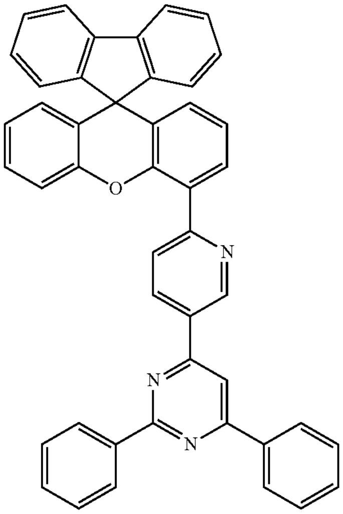
-continued
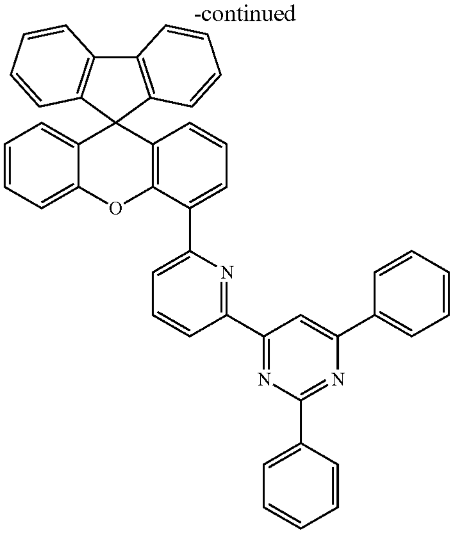
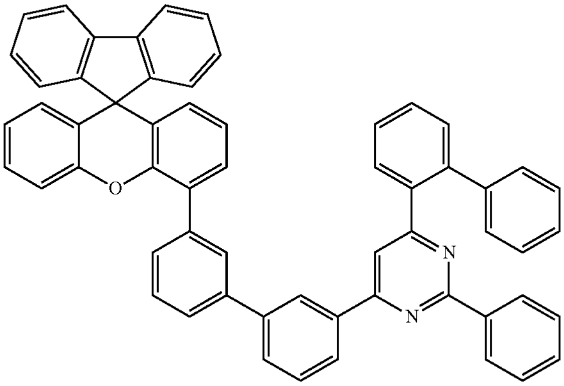
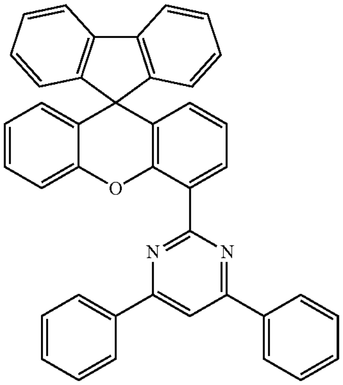
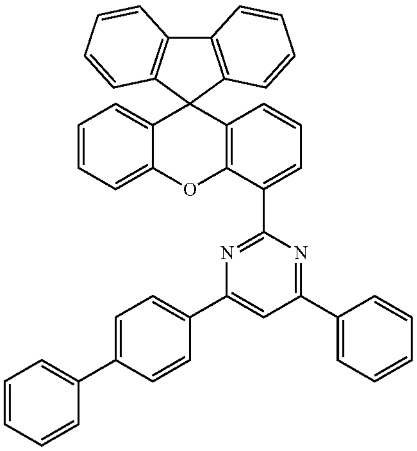

-continued
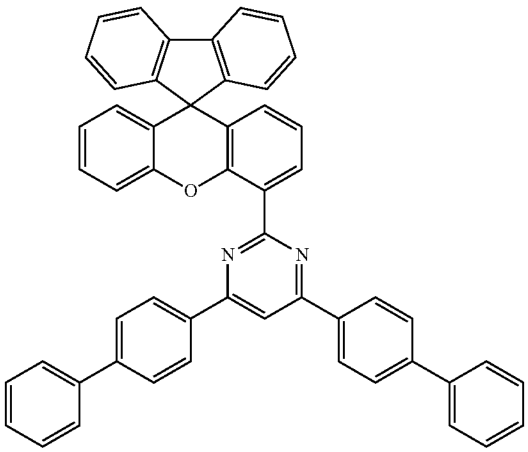
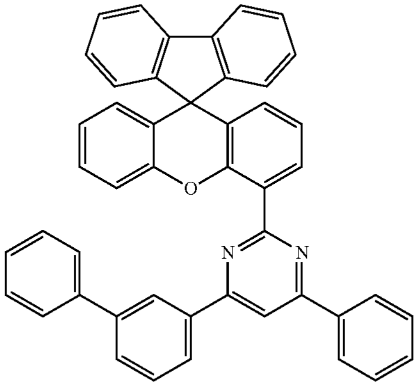
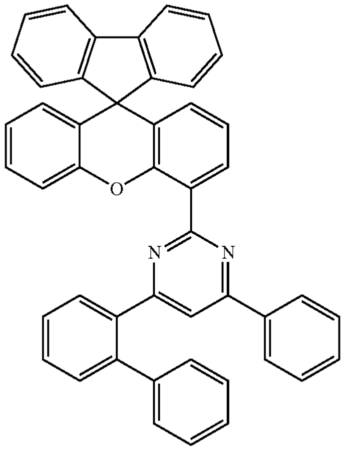
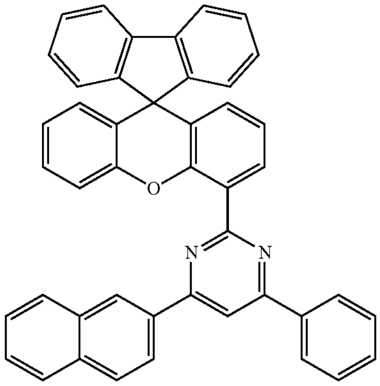
-continued
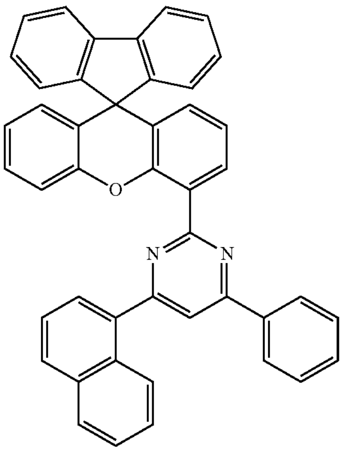
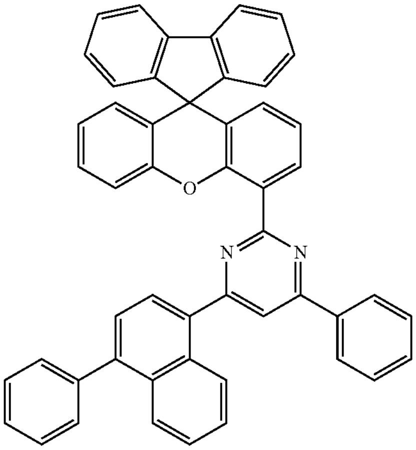
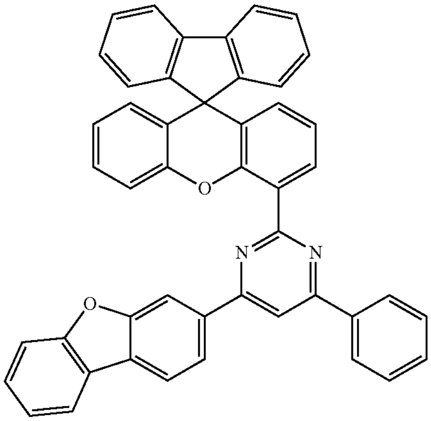

-continued
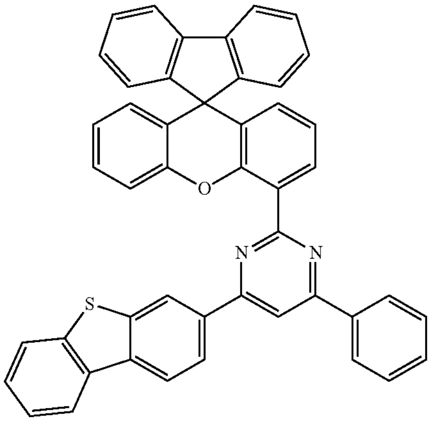
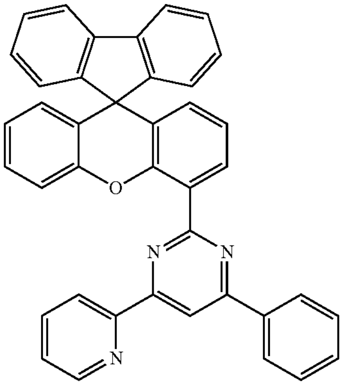
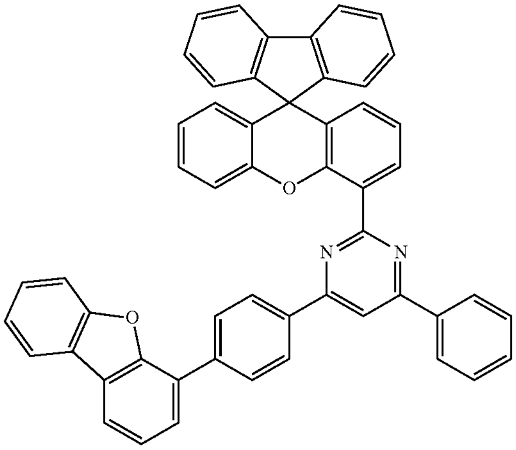
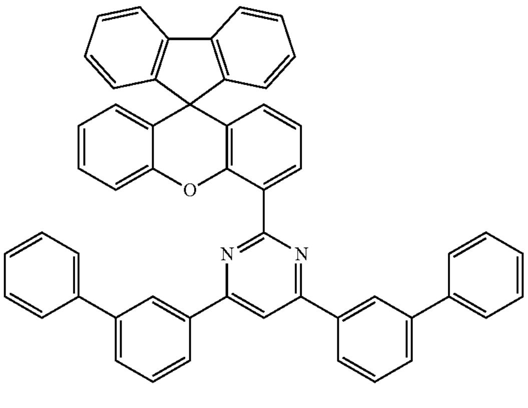
-continued
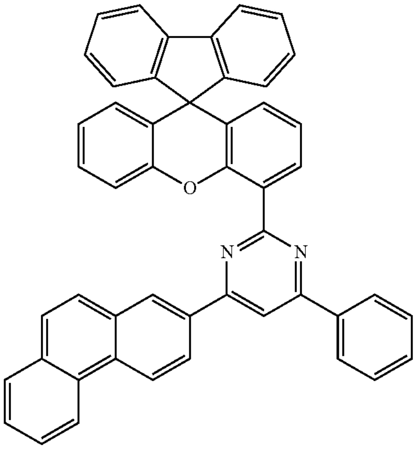
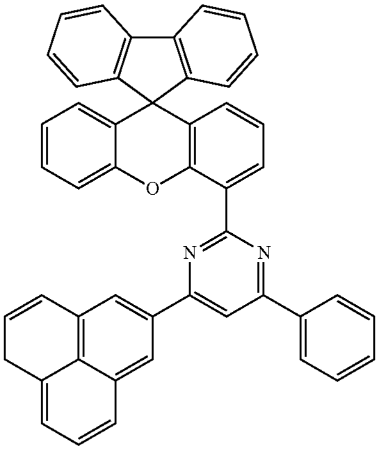
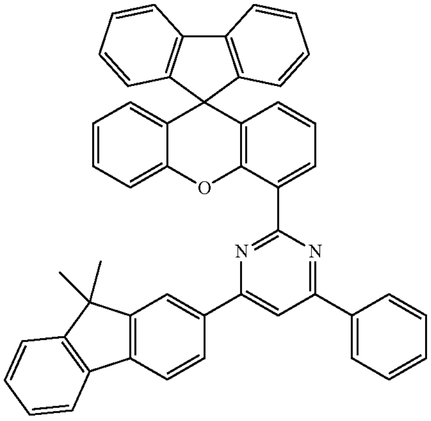

-continued
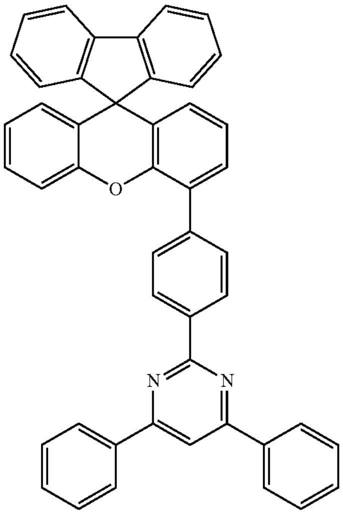
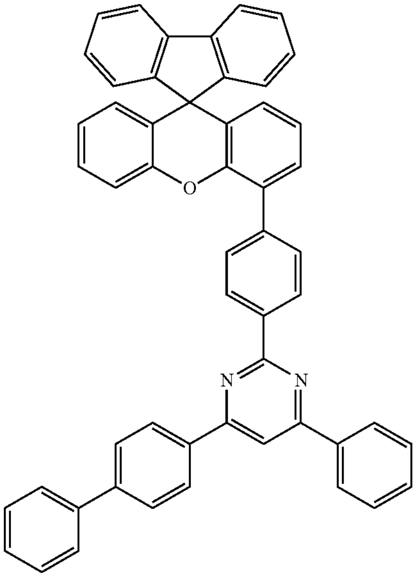
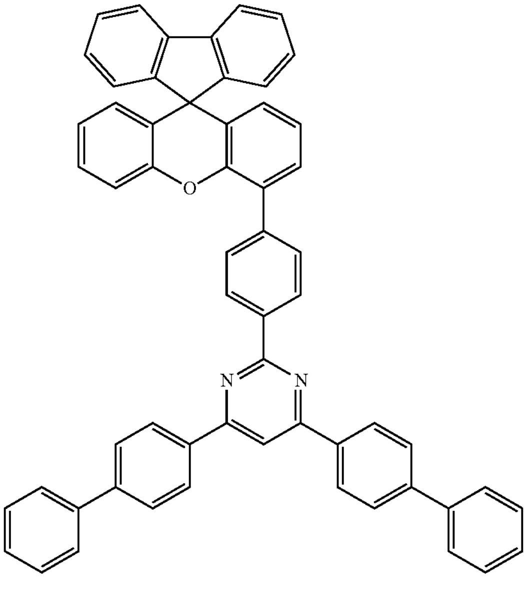
-continued
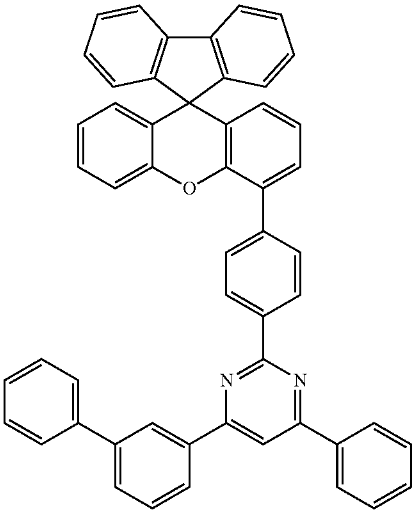
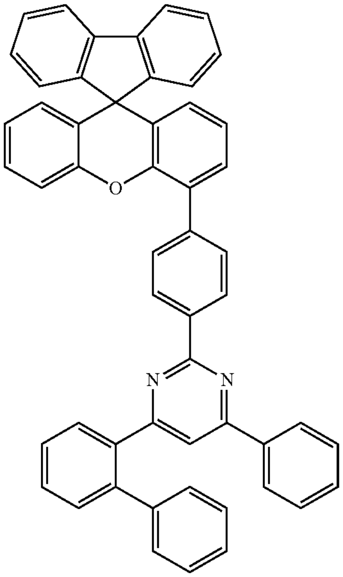
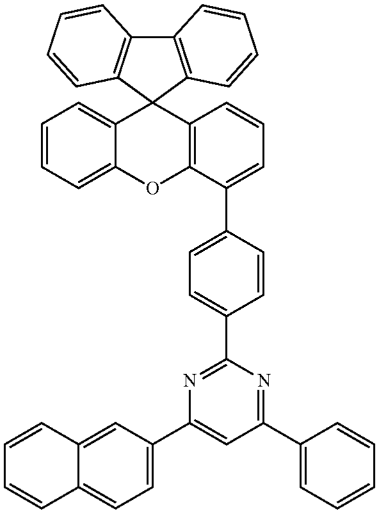

-continued
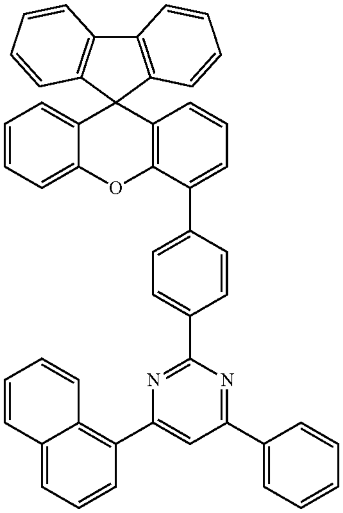
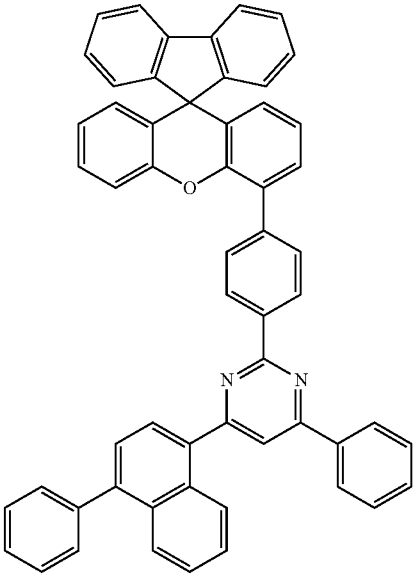
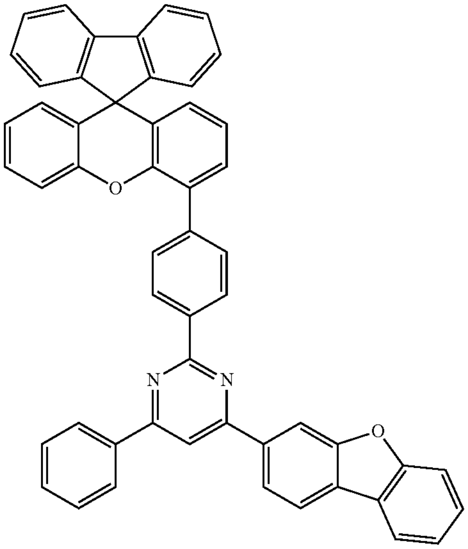
-continued
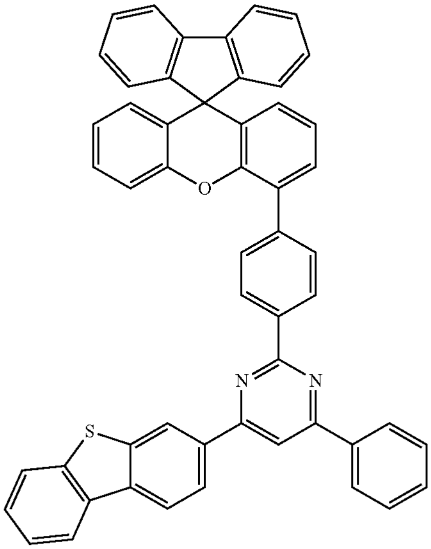
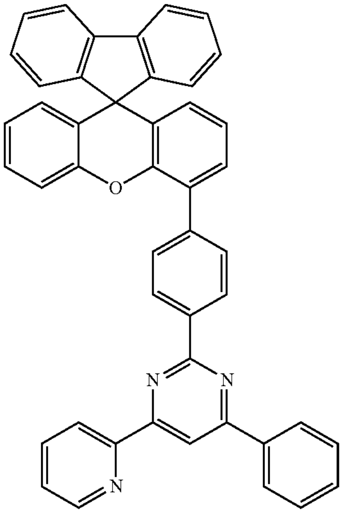
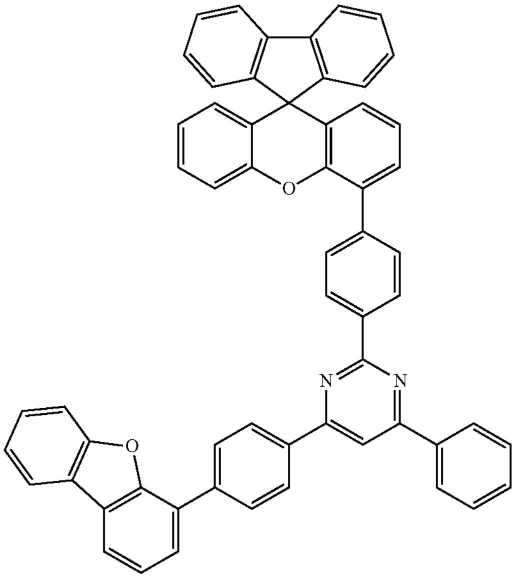

-continued
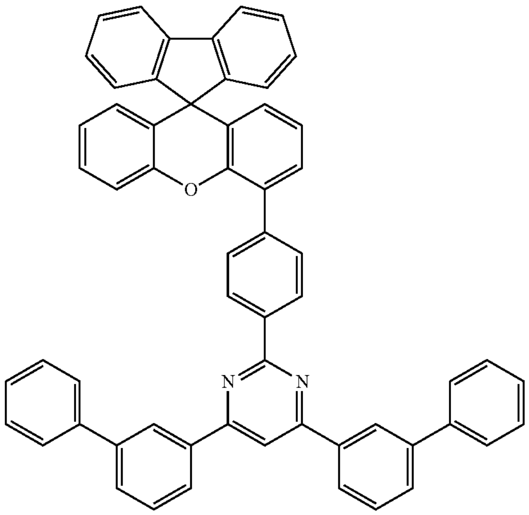
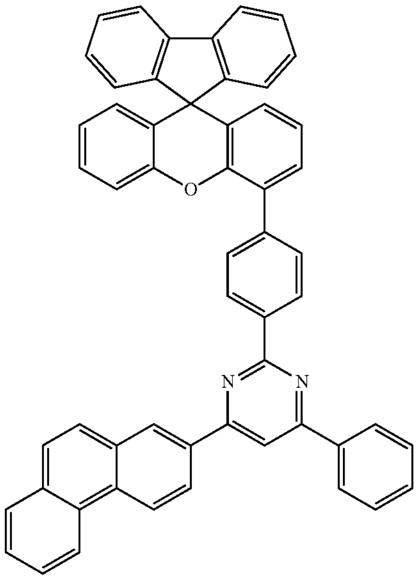
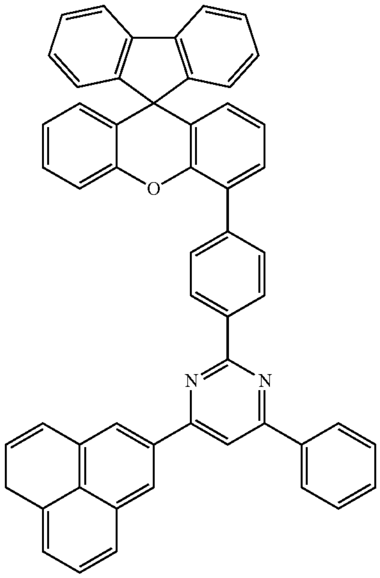
-continued
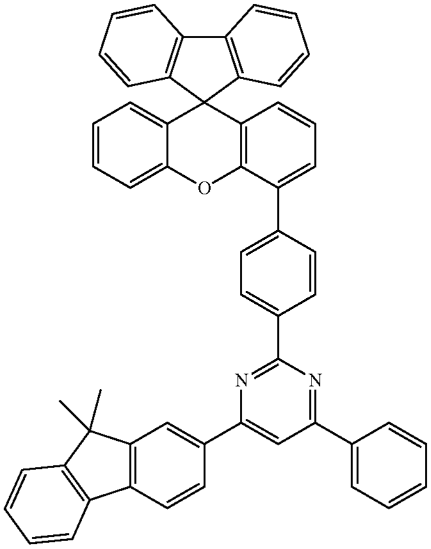 [SMILES: CC1(C)c2ccccc2-c2ccc(-c3cc(-c4ccccc4)nc(-c4ccc(-c5cccc6c5Oc5ccccc5C65c6ccccc6-c6ccccc65)cc4)n3)cc21]
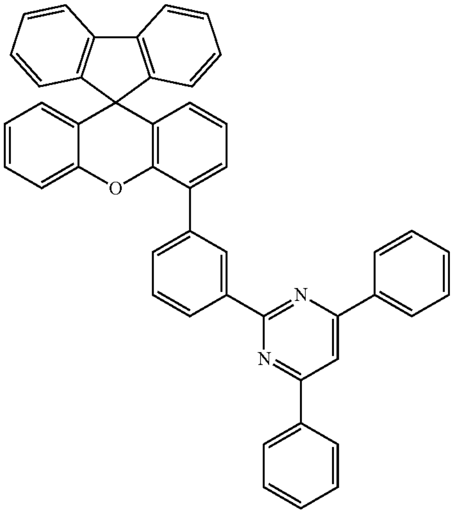
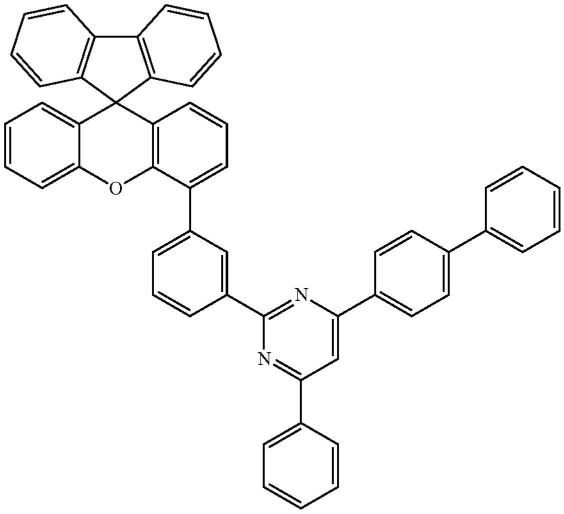

-continued
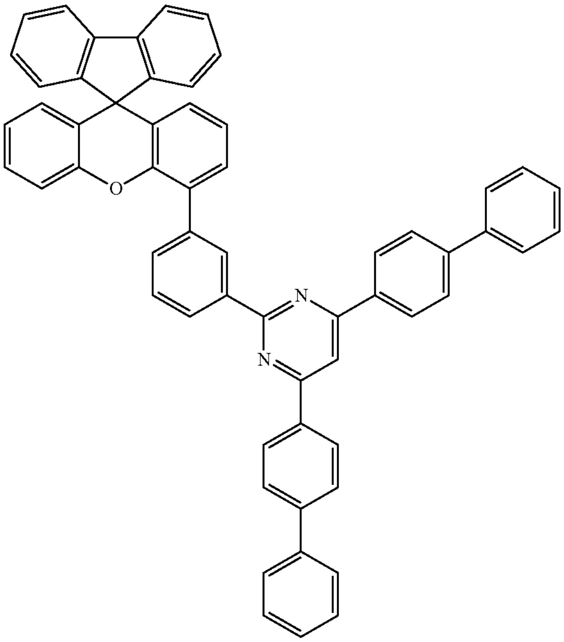
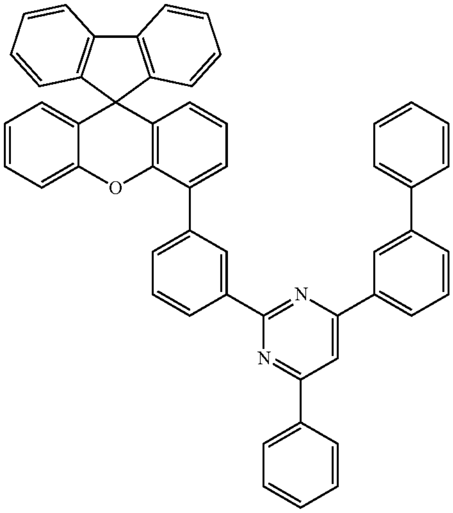
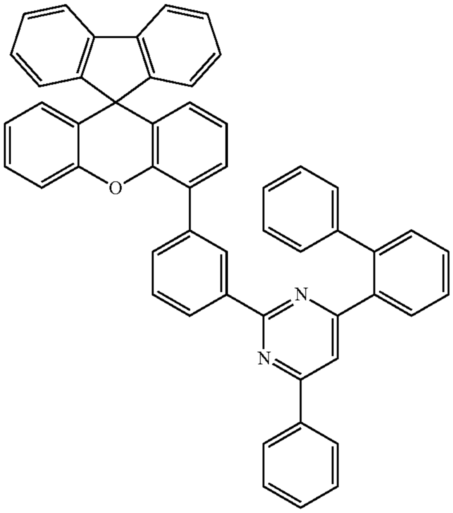
-continued
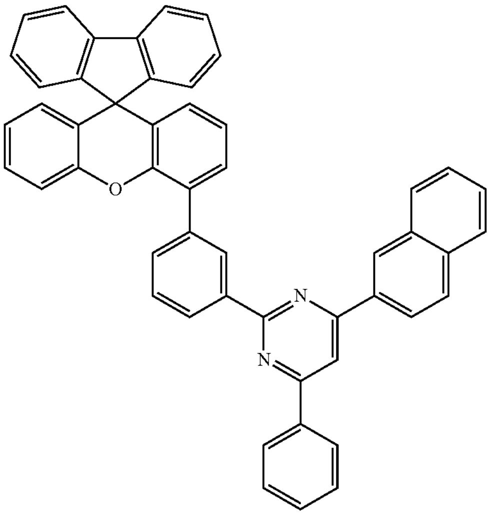
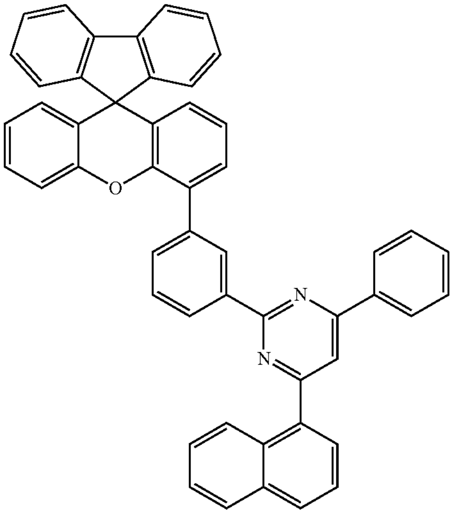
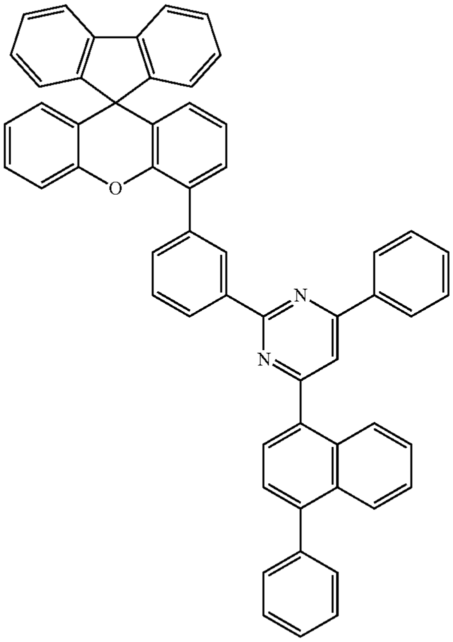

-continued
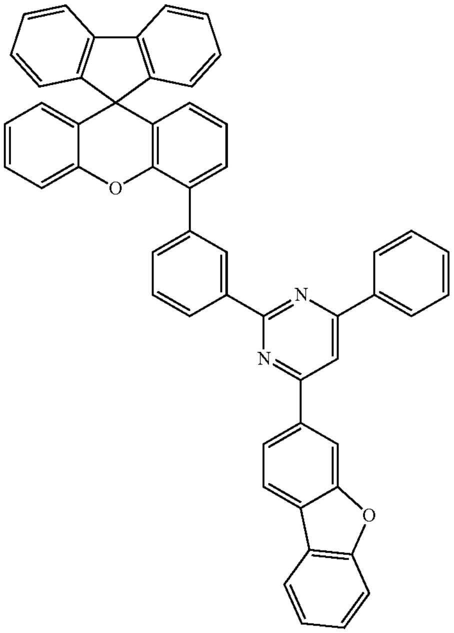
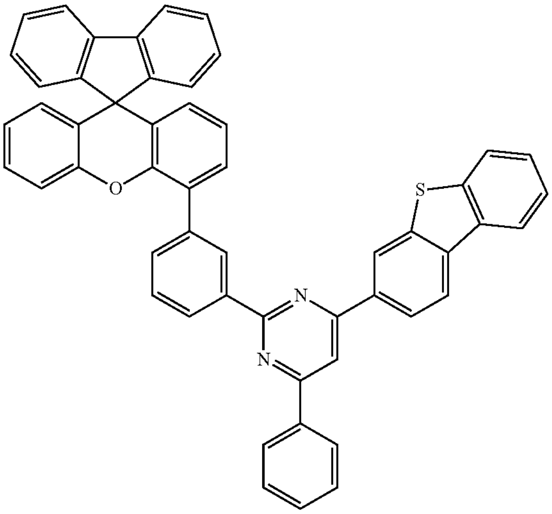
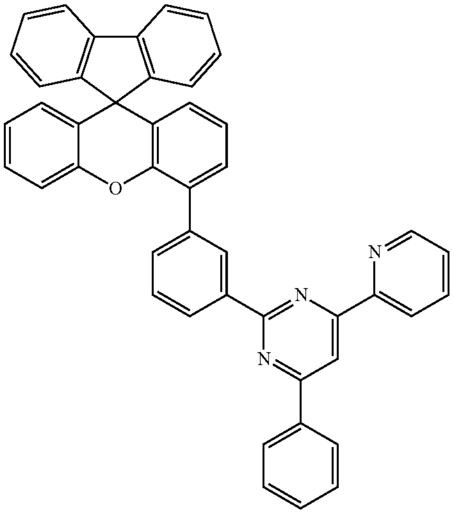
-continued
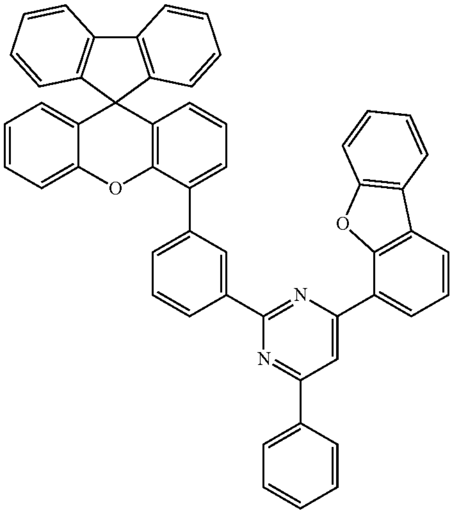
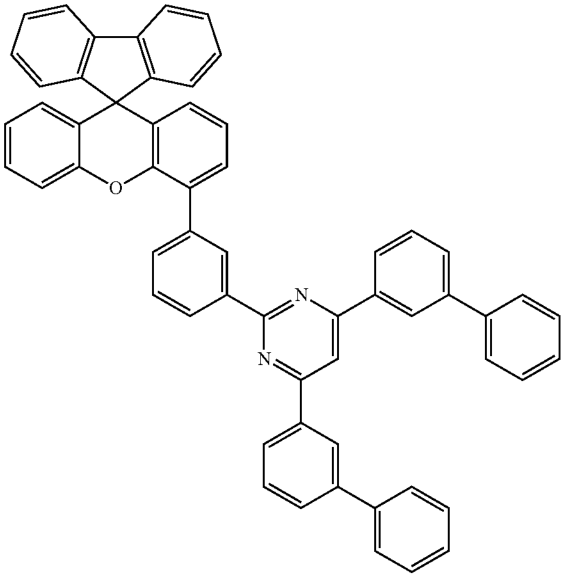
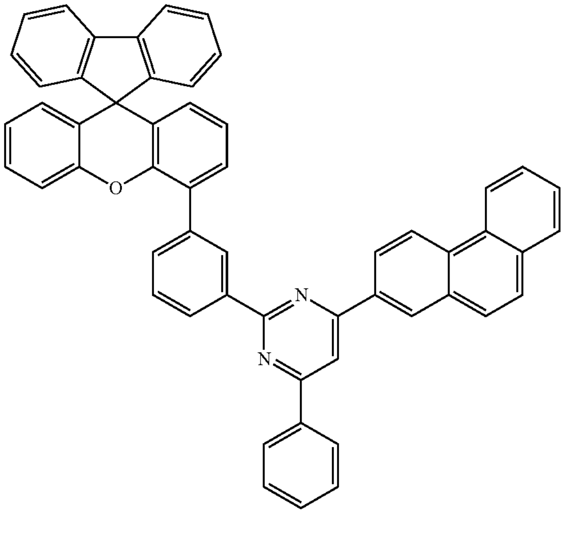

-continued
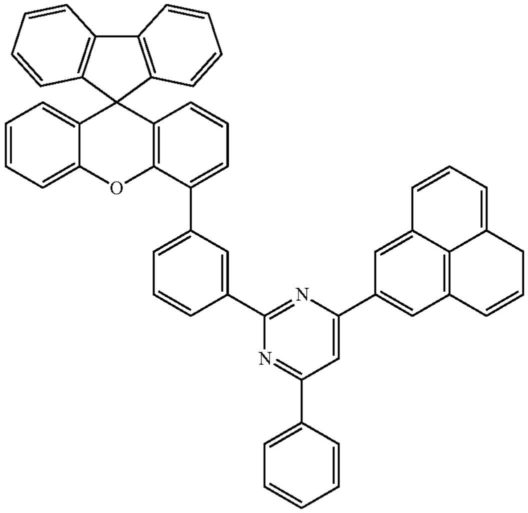
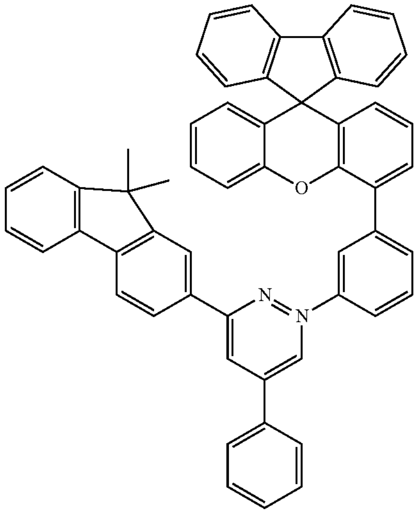
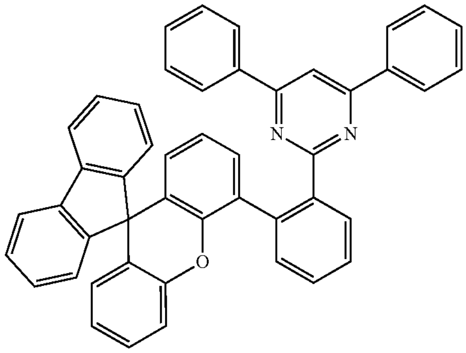
-continued
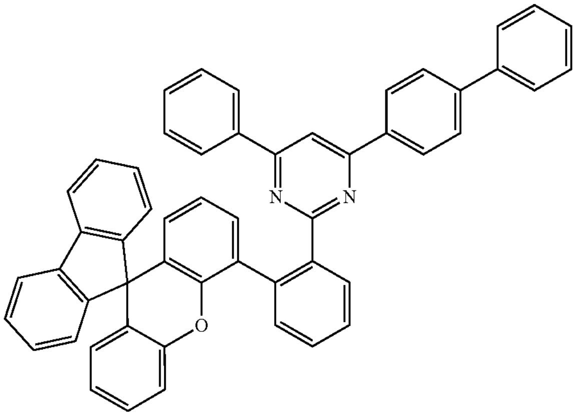
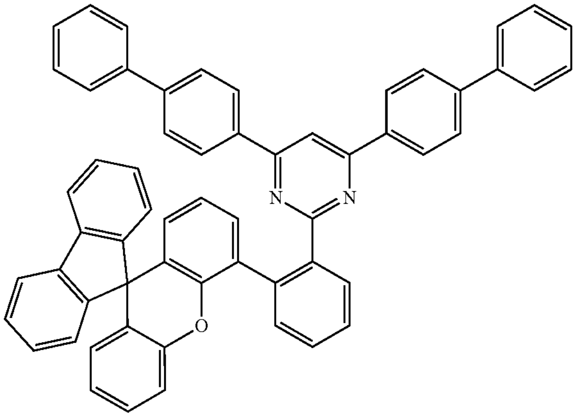
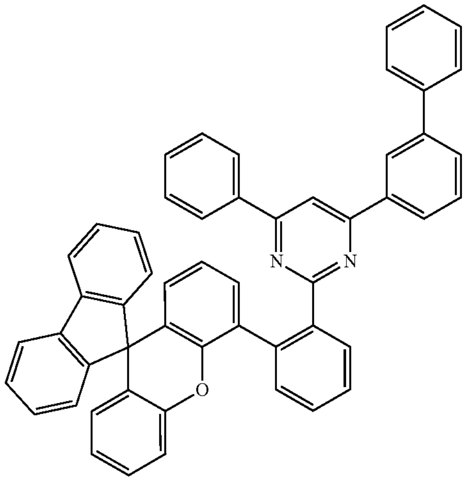

-continued
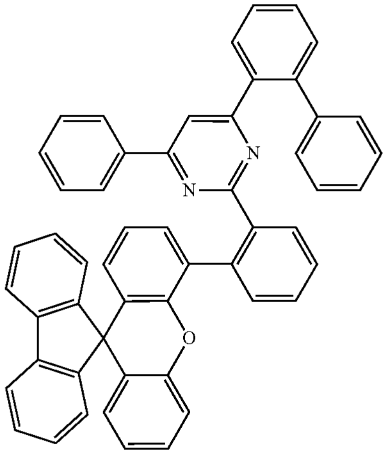
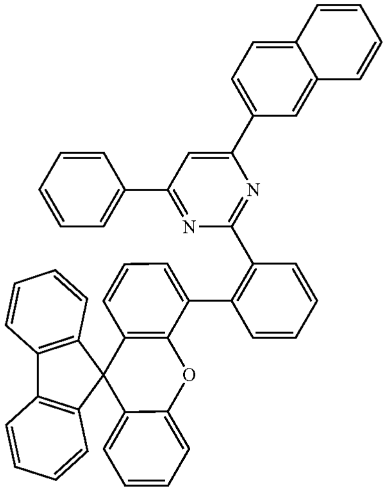
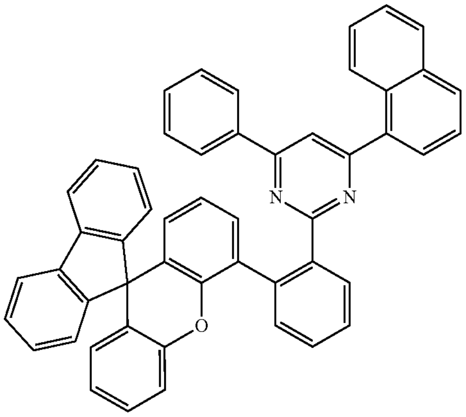
-continued
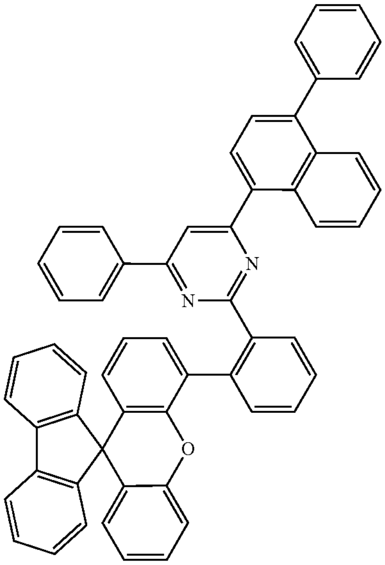
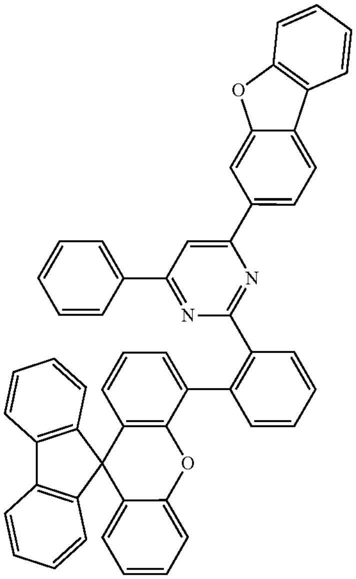
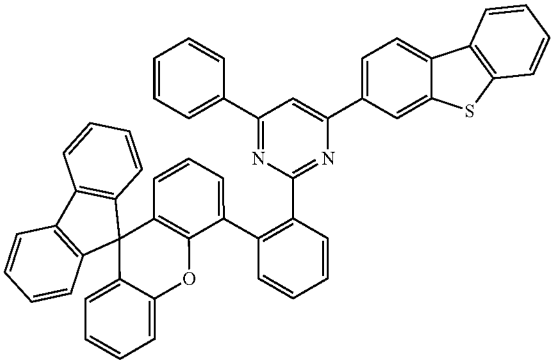

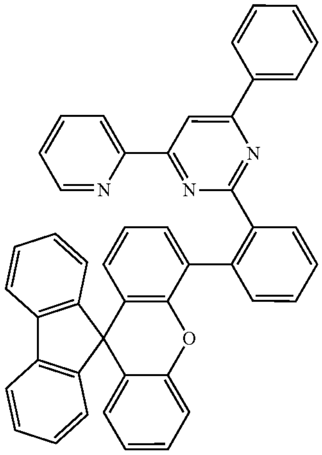
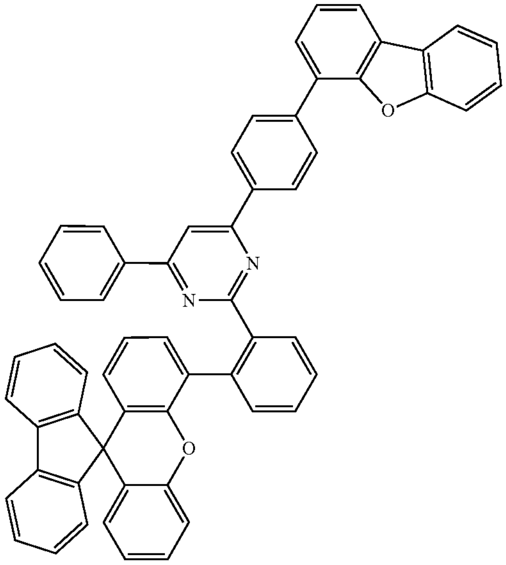
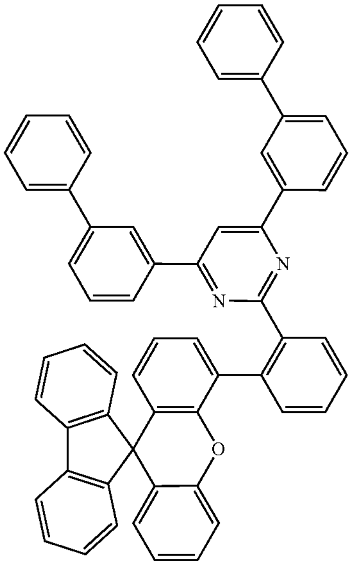
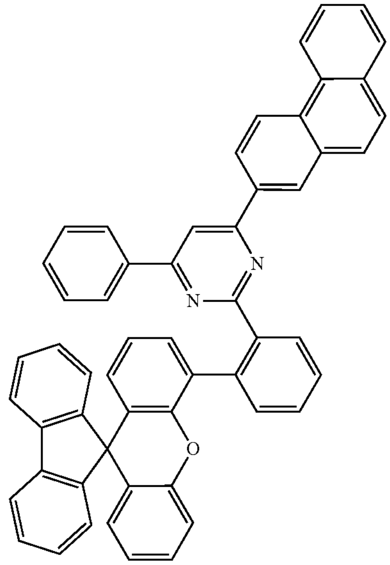
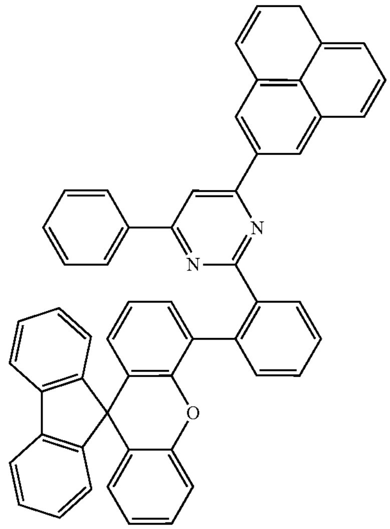
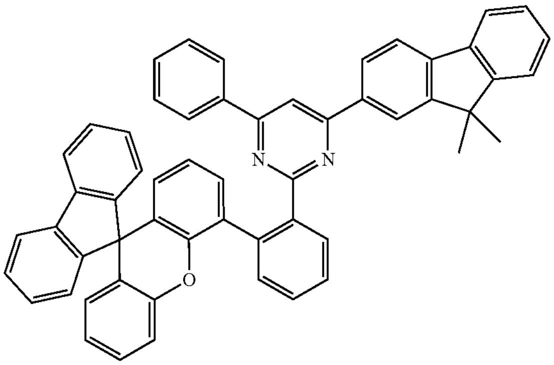

-continued
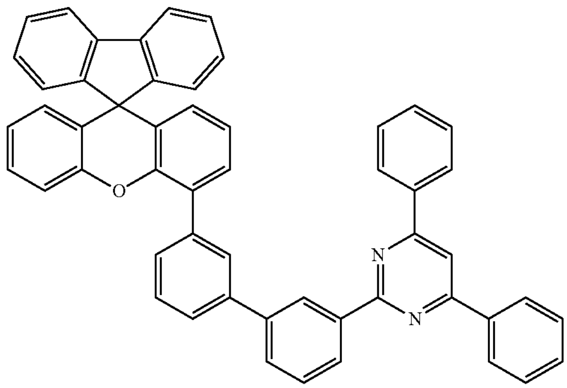
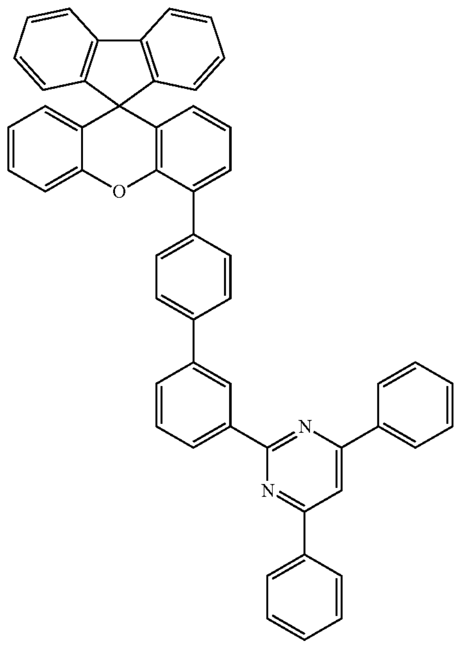
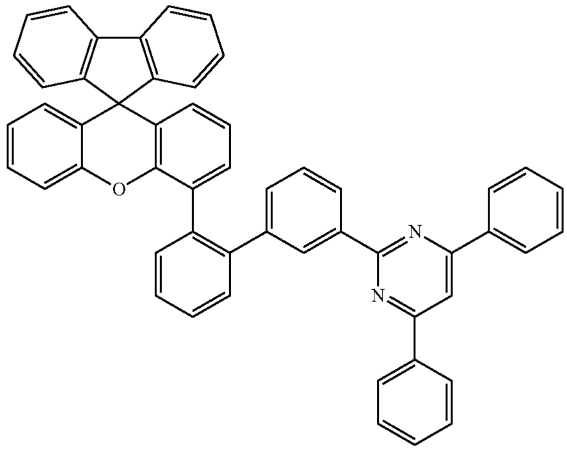
-continued
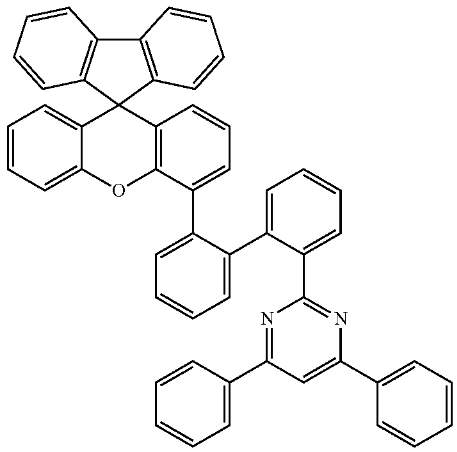
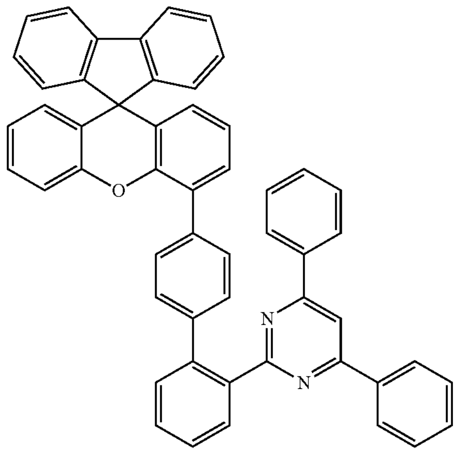
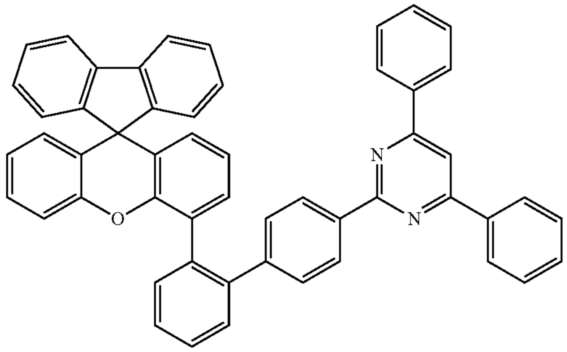
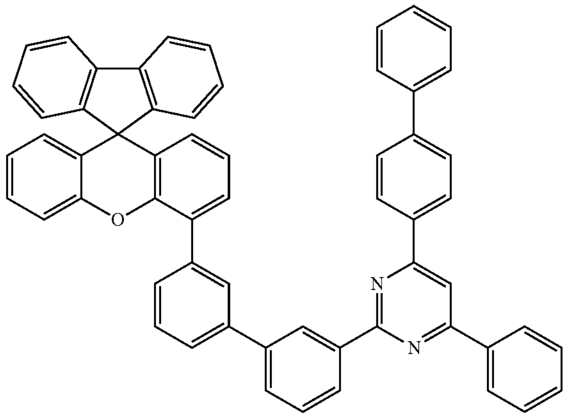

-continued
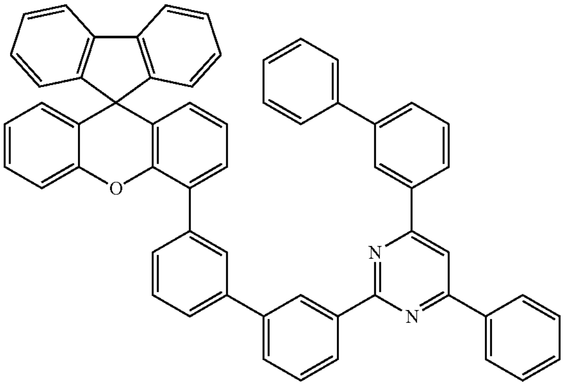
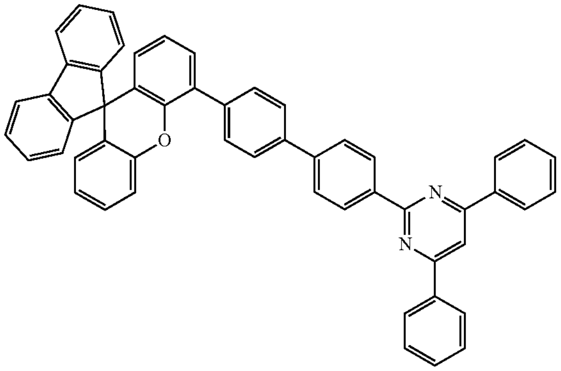
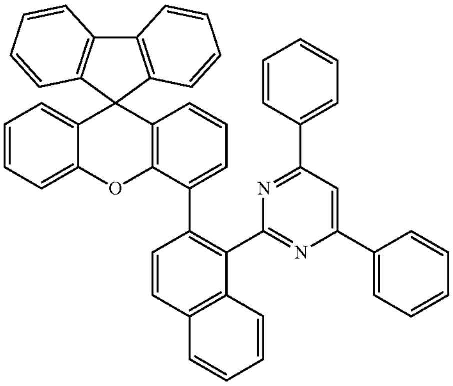
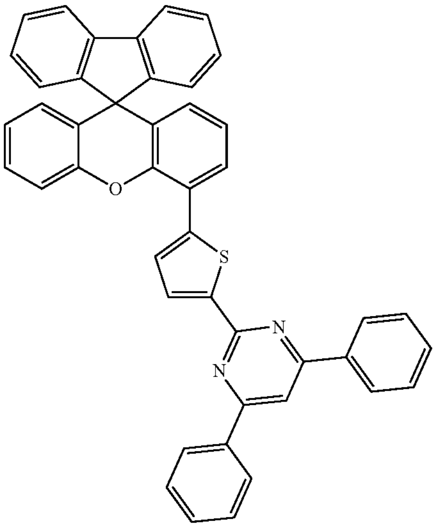
-continued
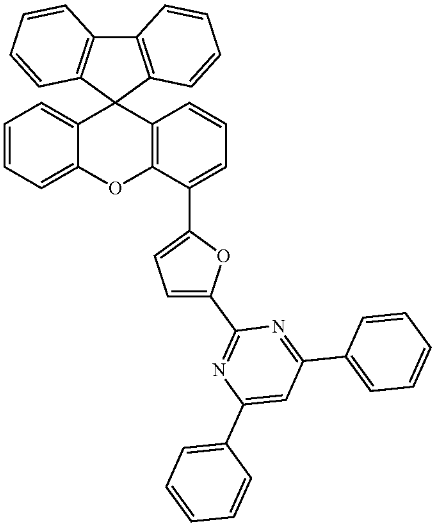
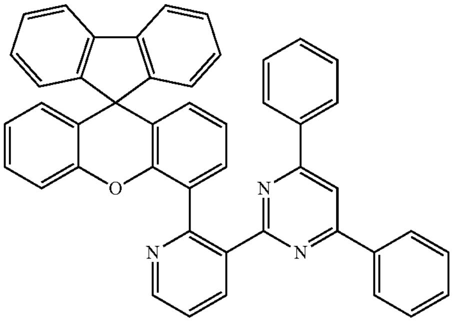
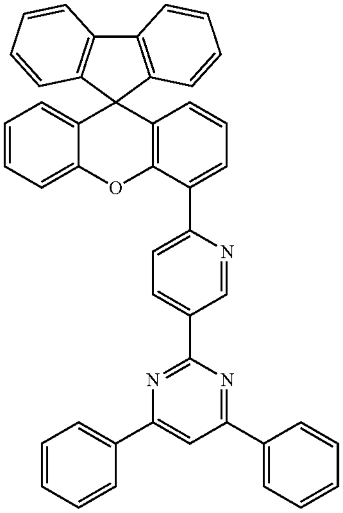

-continued
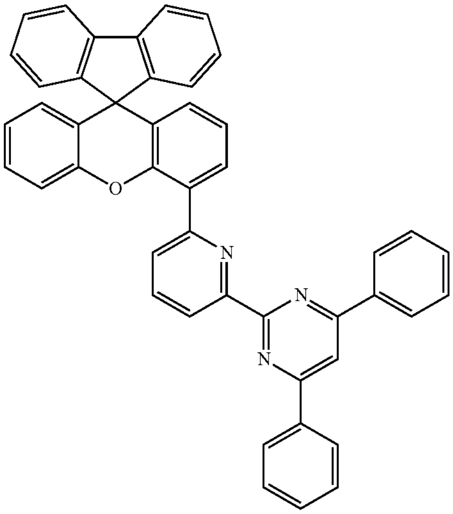
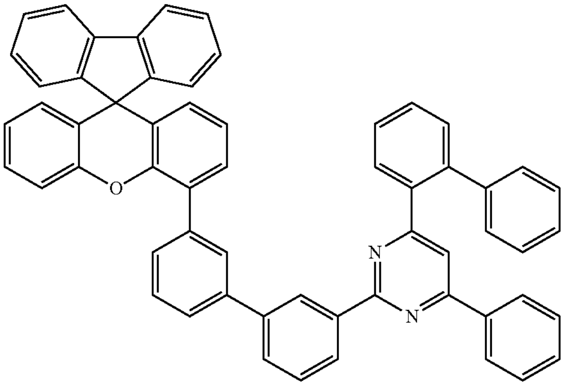
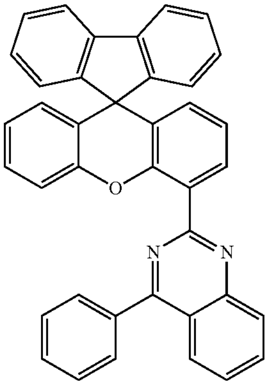
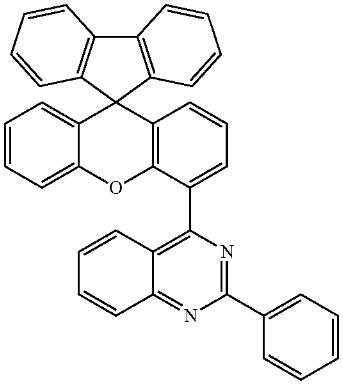
-continued
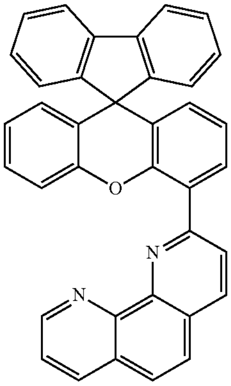
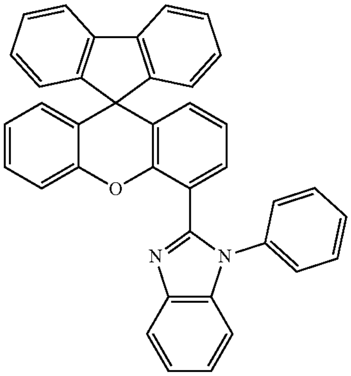
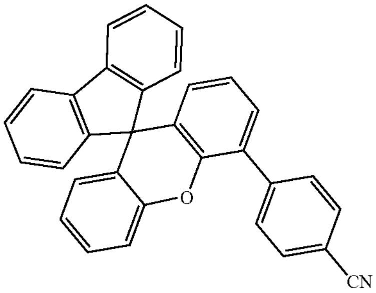
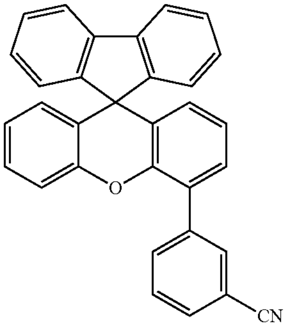
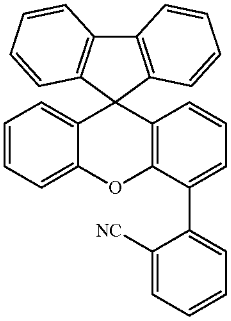

-continued
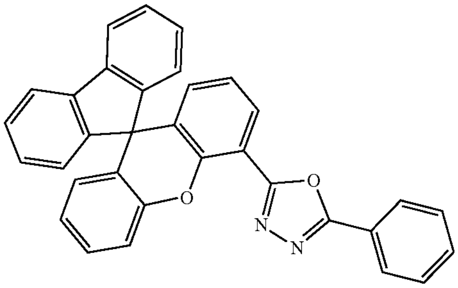
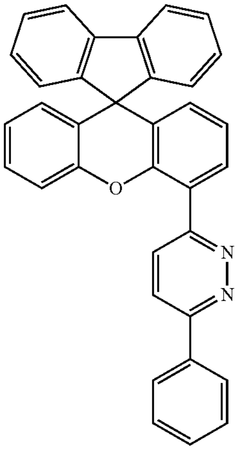
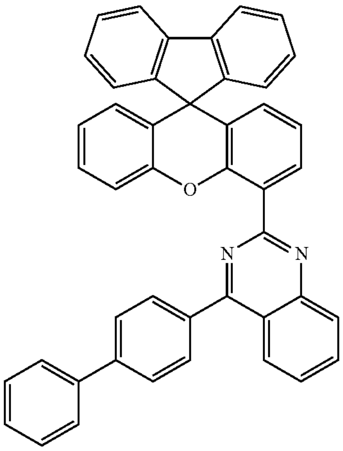
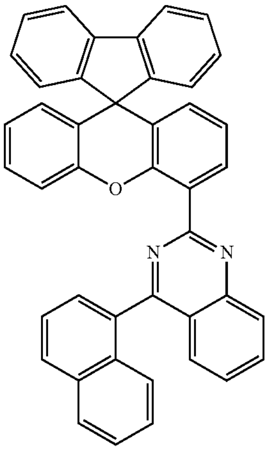
-continued
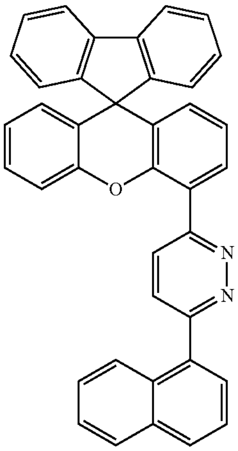
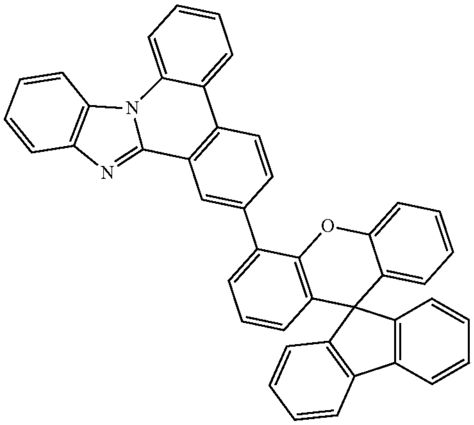
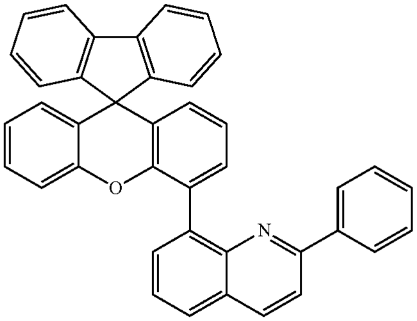
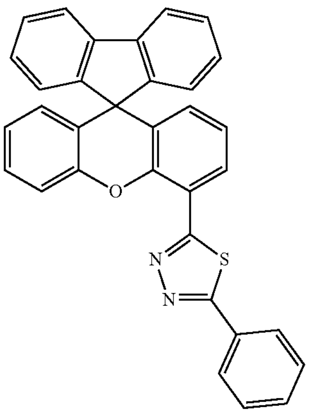

-continued
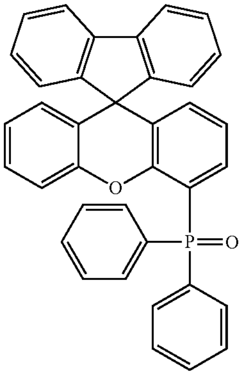
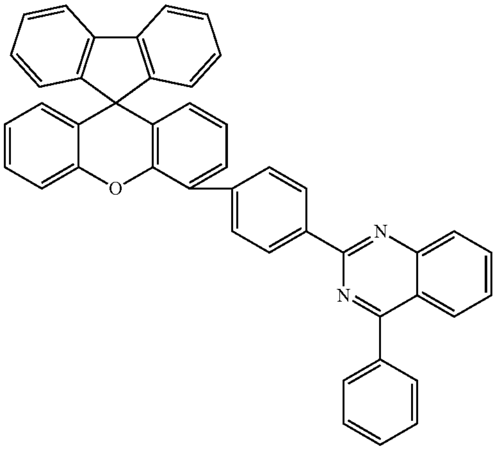
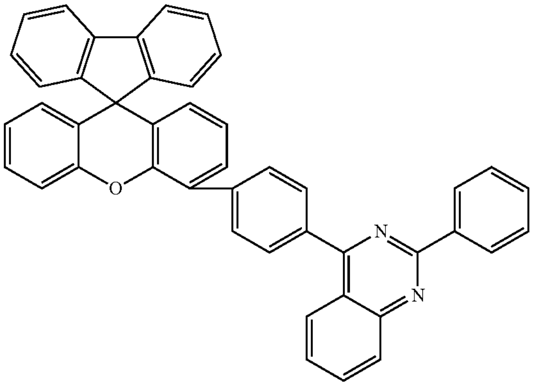
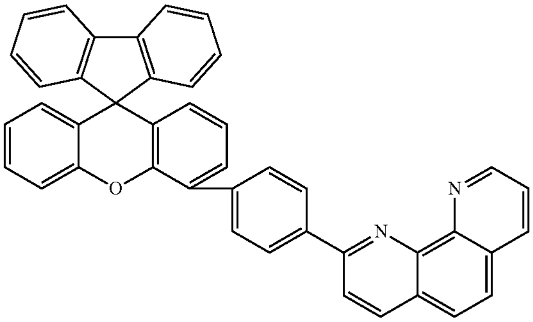
-continued
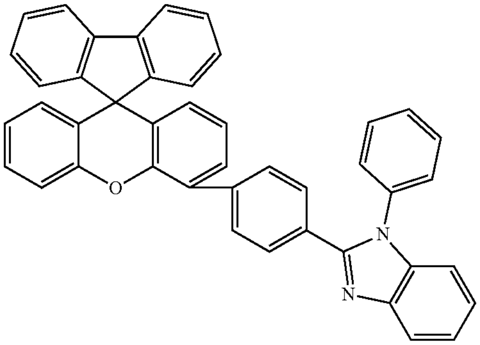
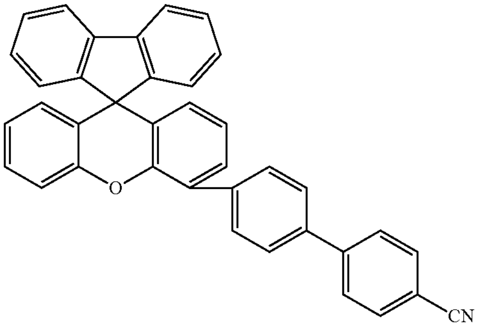
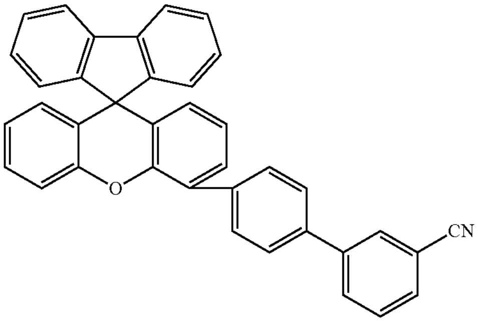
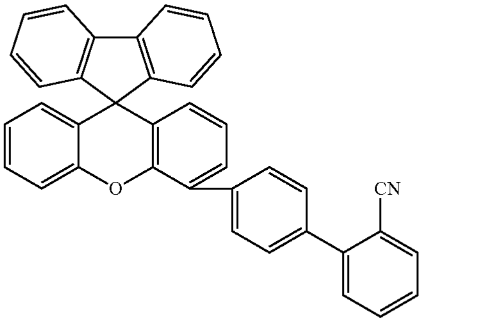

-continued
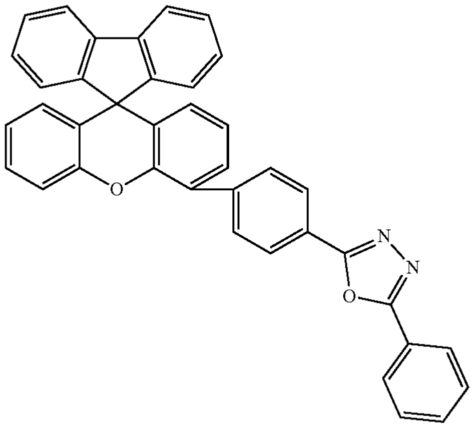
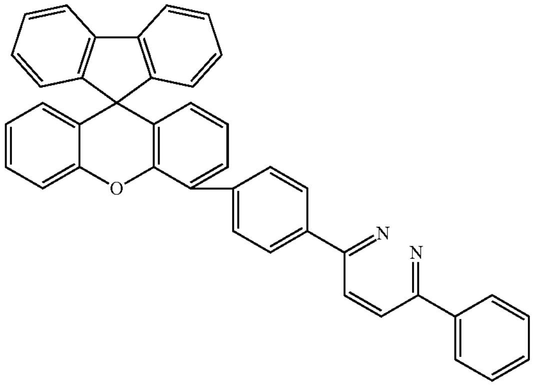
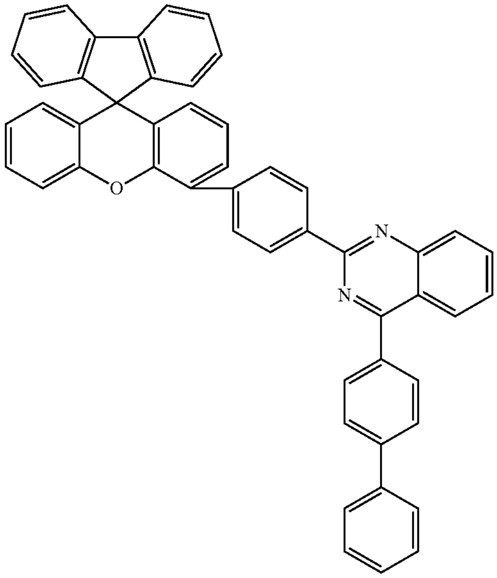
-continued
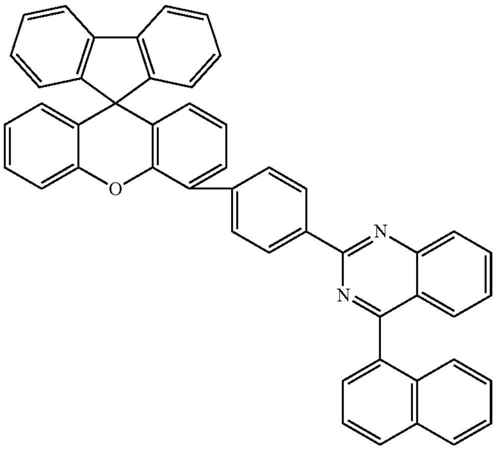
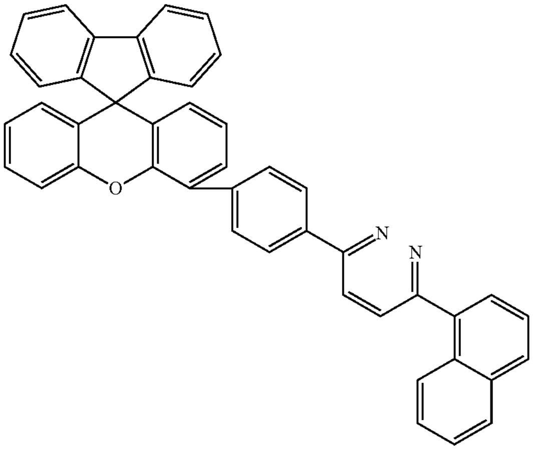
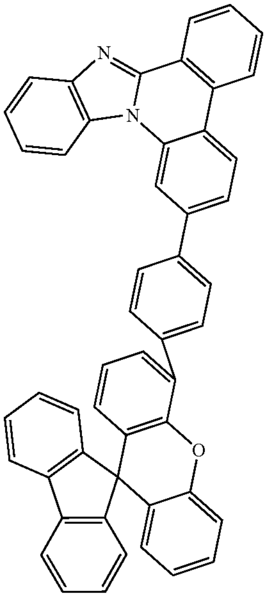

-continued
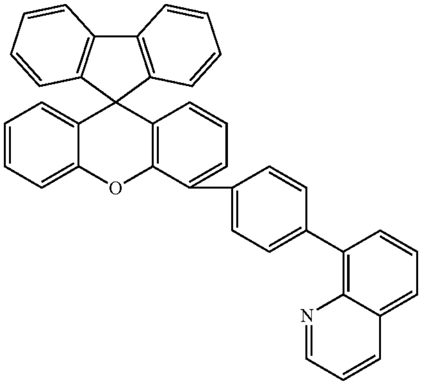
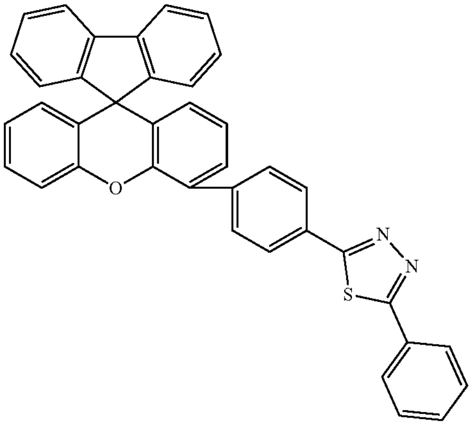
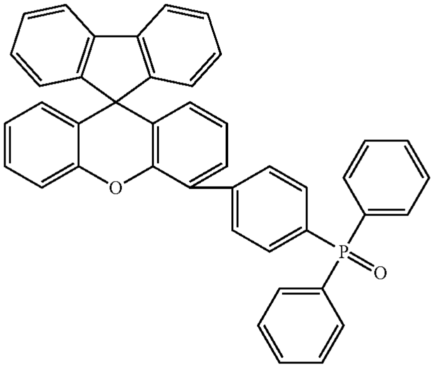
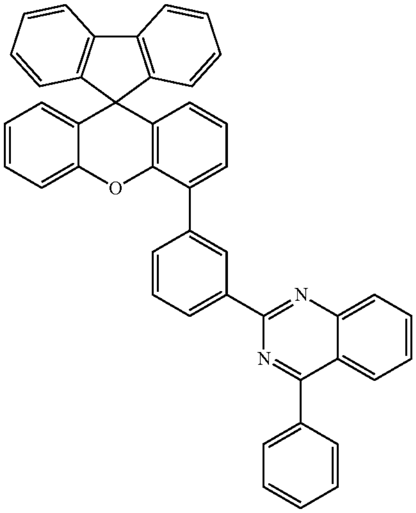
-continued
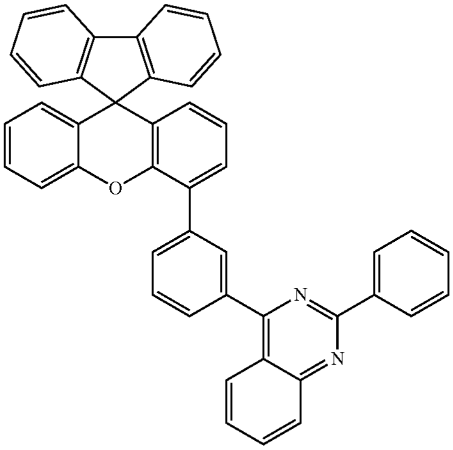
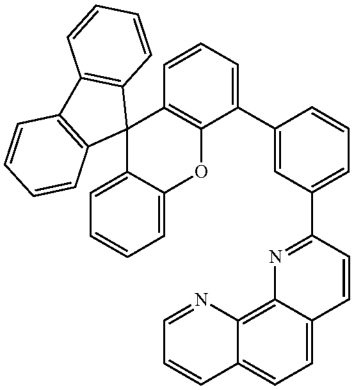
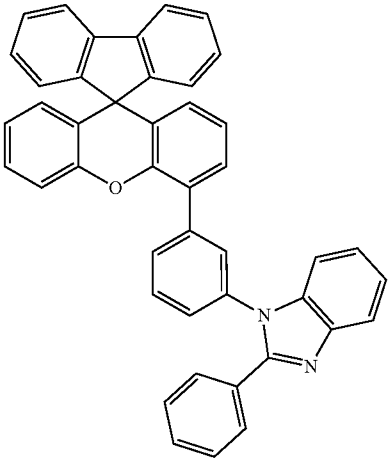
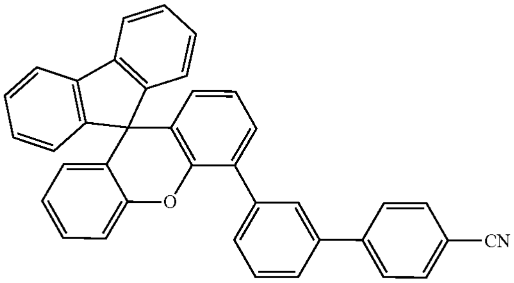

-continued
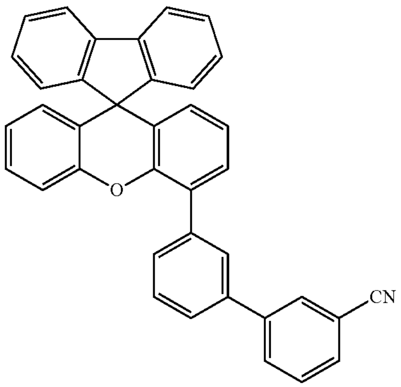
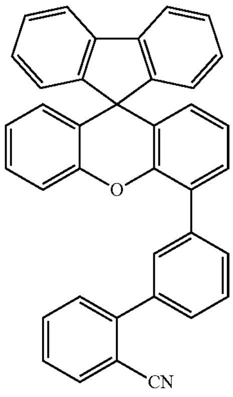
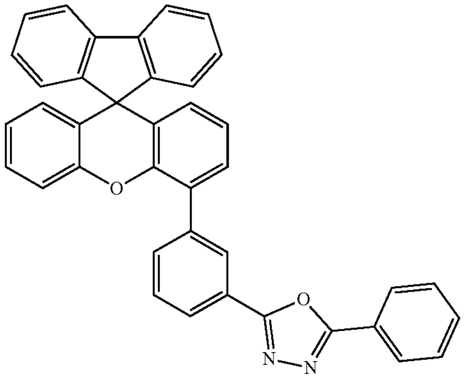
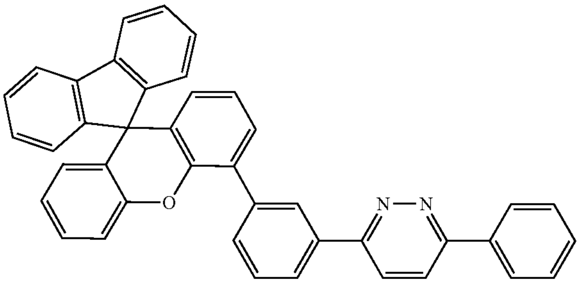
-continued
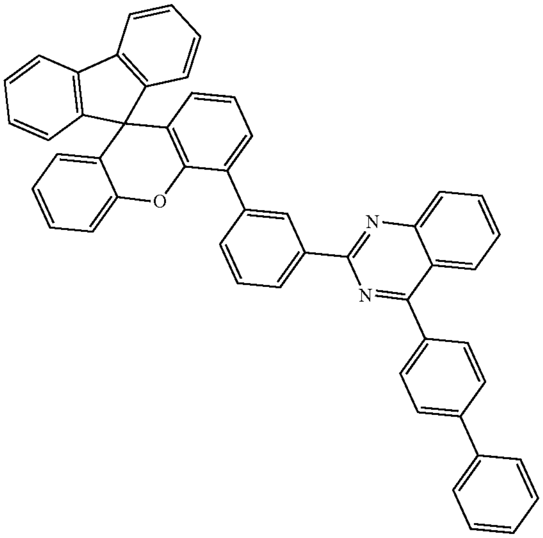
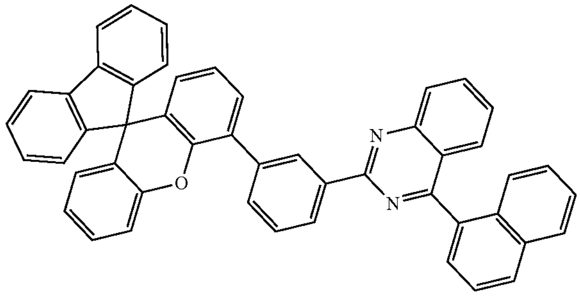
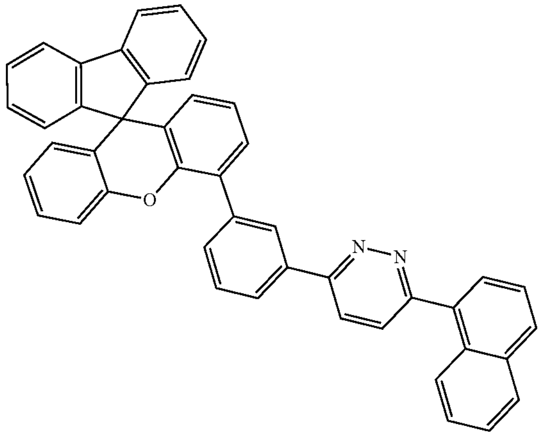

-continued
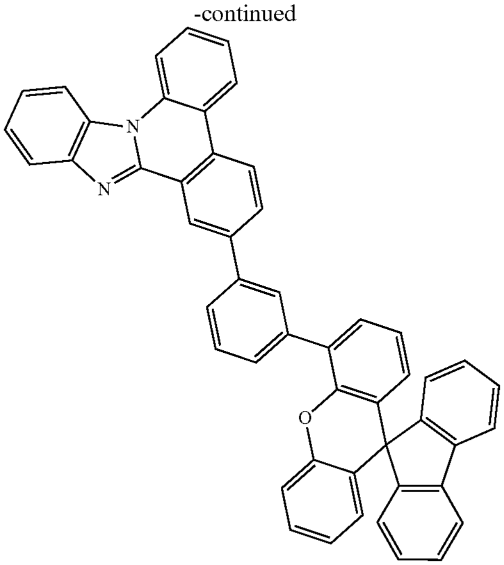
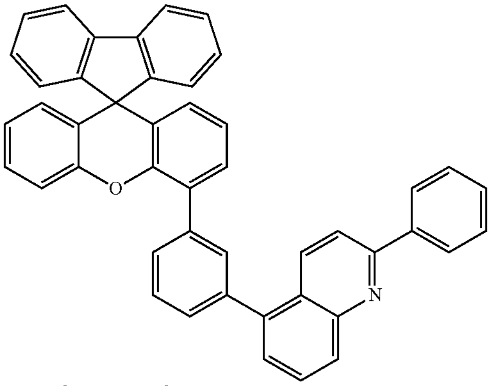
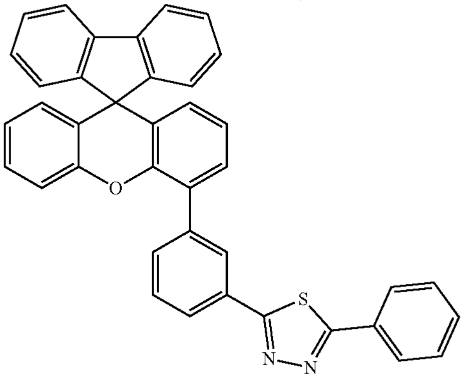
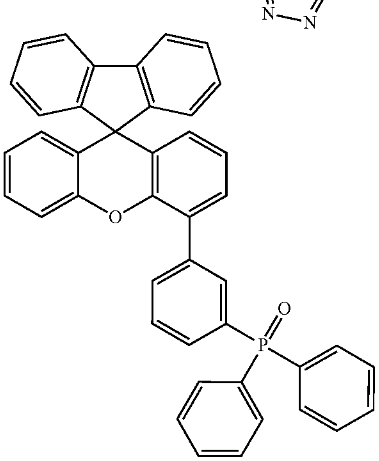
-continued
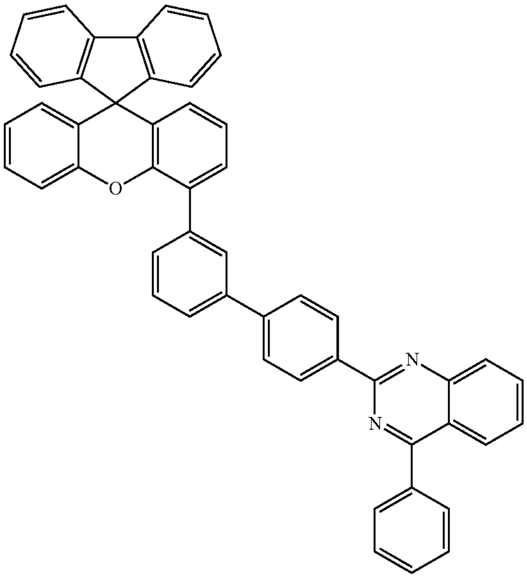
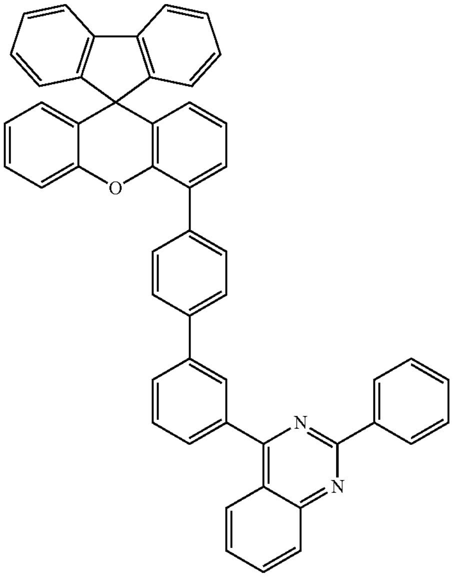
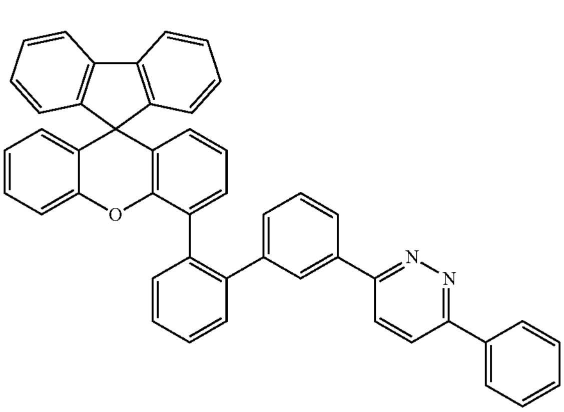

-continued
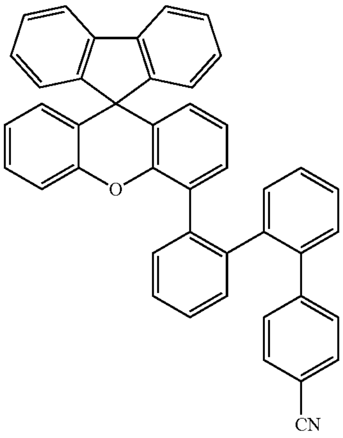 [SMILES: N#Cc1ccc(-c2ccccc2-c2ccccc2-c2cccc3c2Oc2ccccc2C32c3ccccc3-c3ccccc32)cc1]
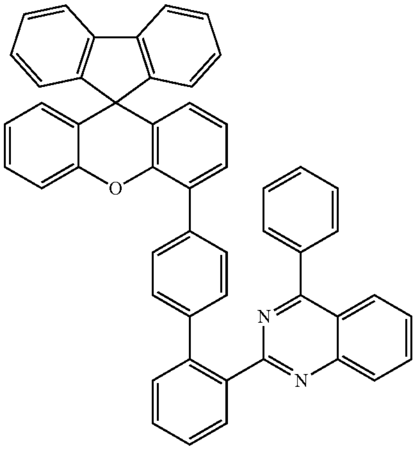
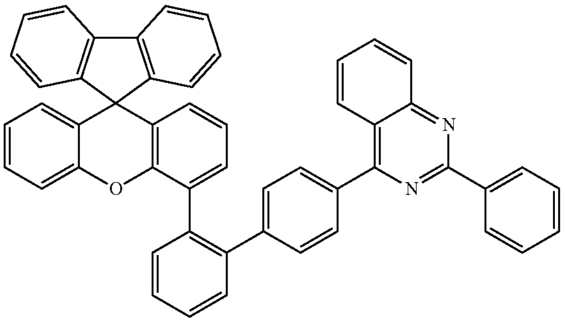
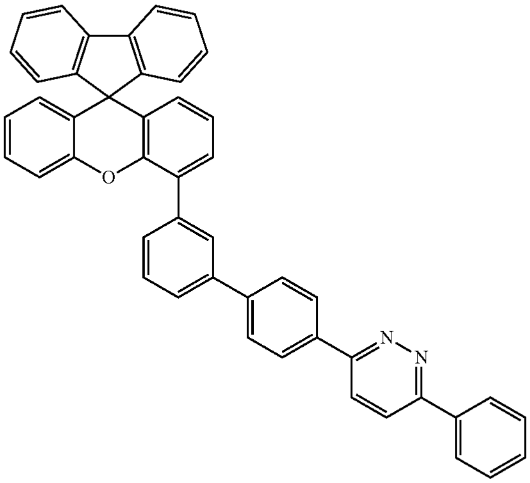
-continued
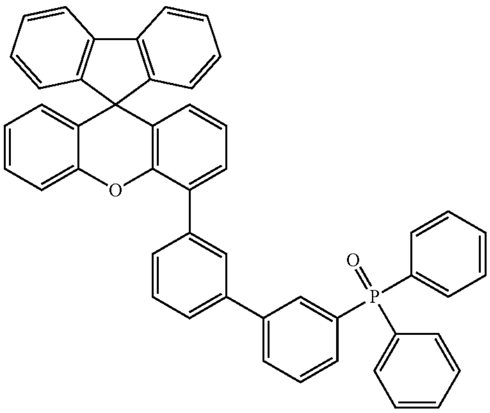
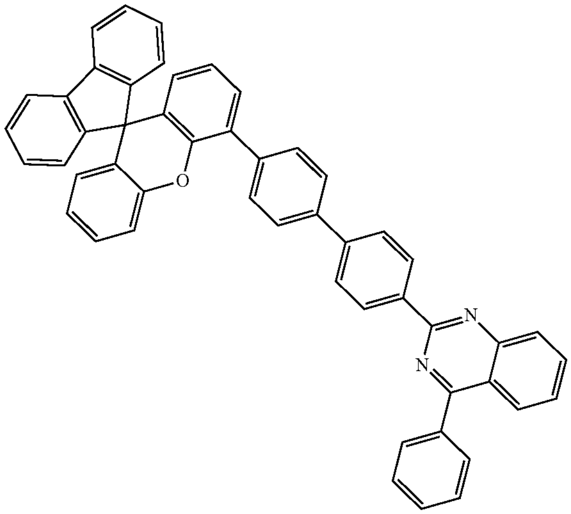
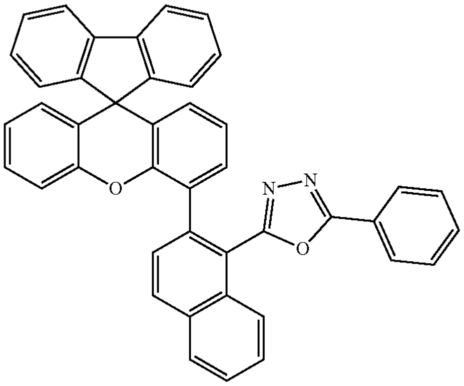

-continued
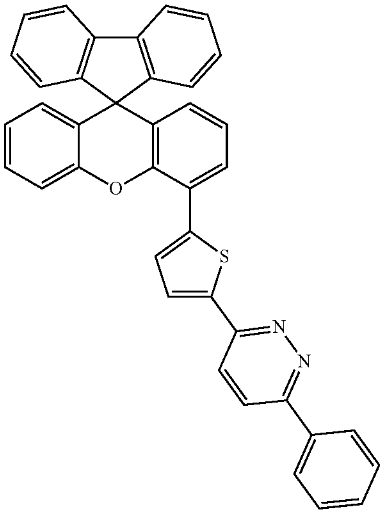
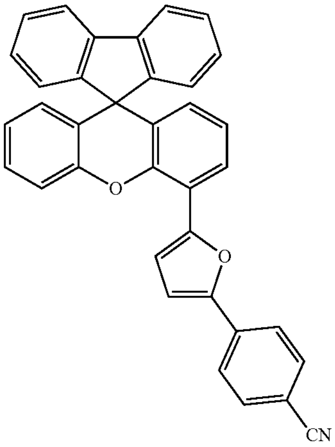
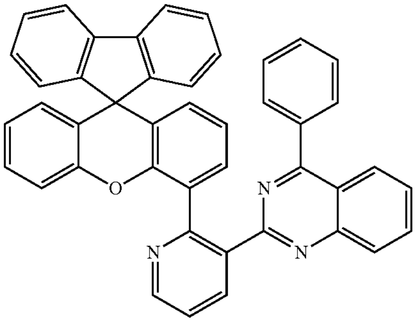
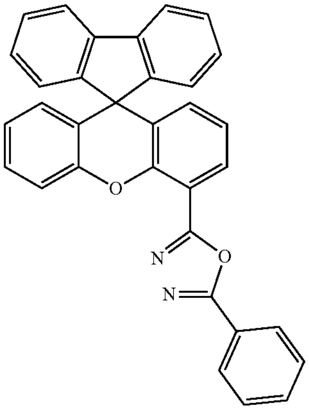
-continued
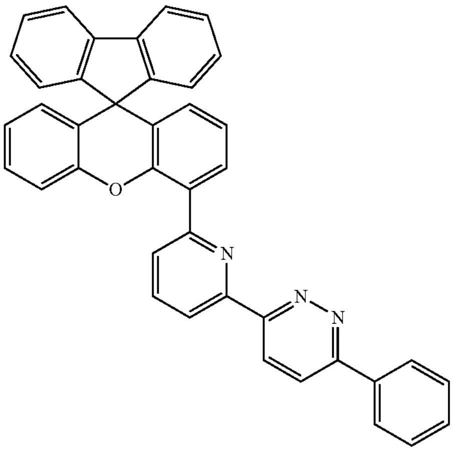
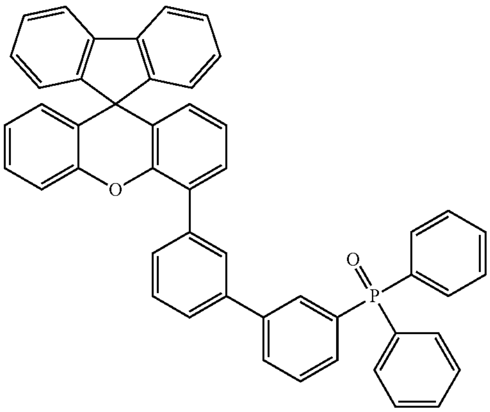
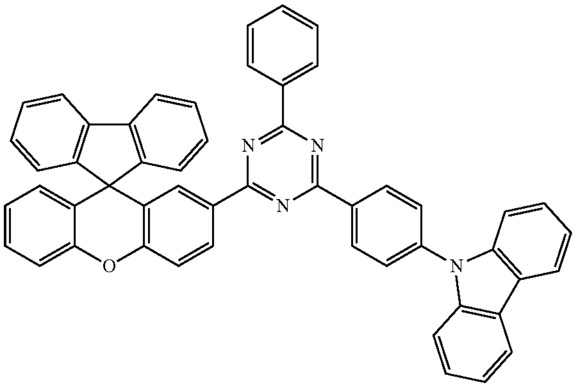
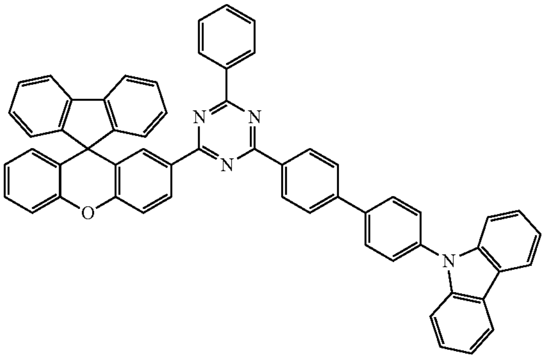

-continued
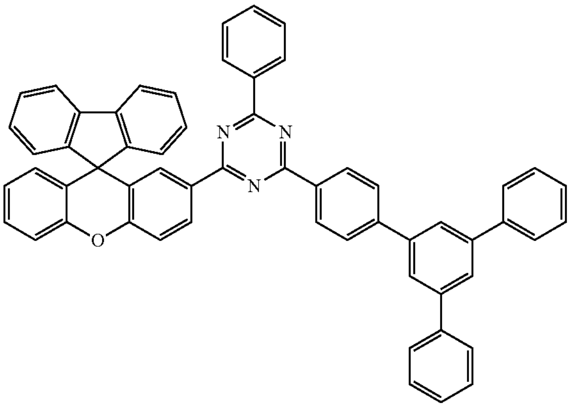
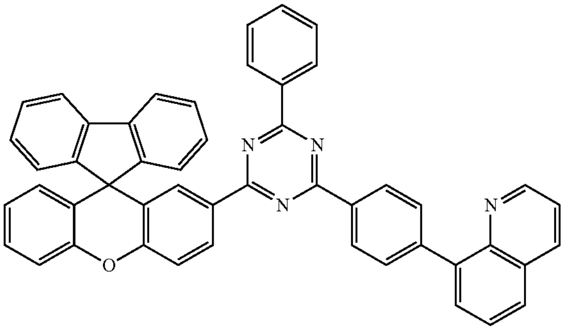
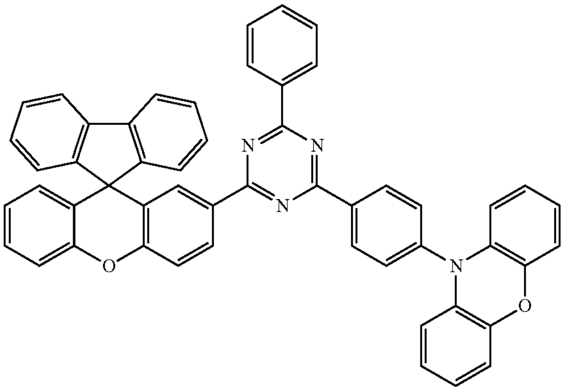
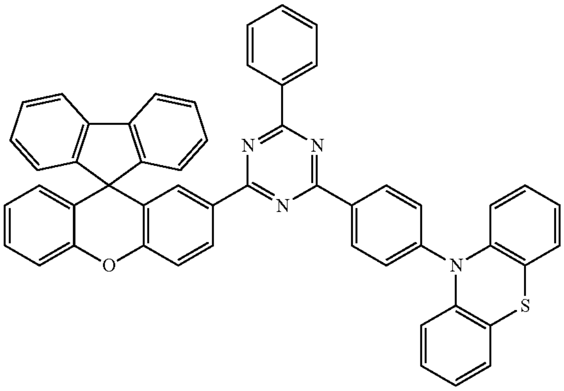
-continued
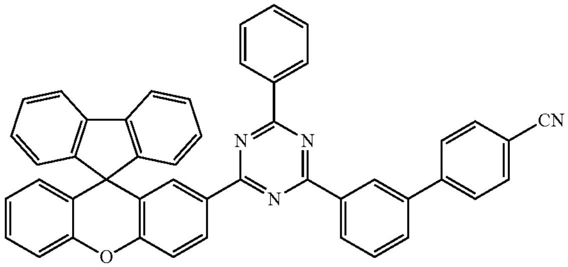
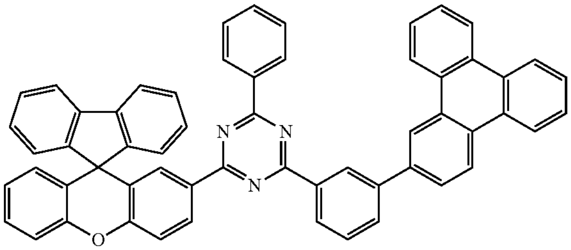
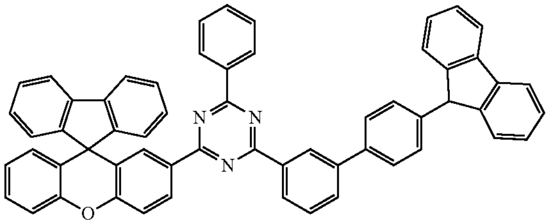
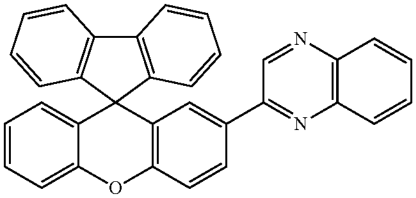
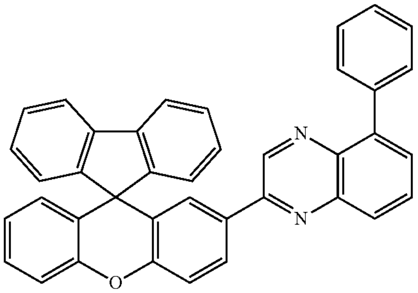
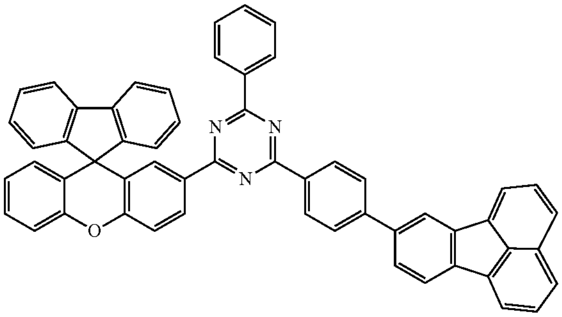

-continued
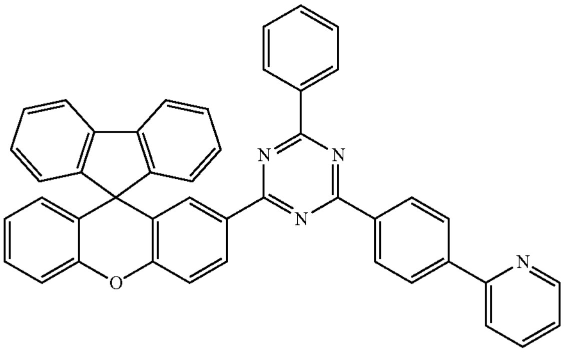
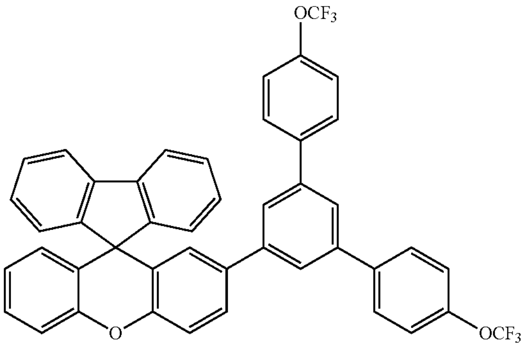
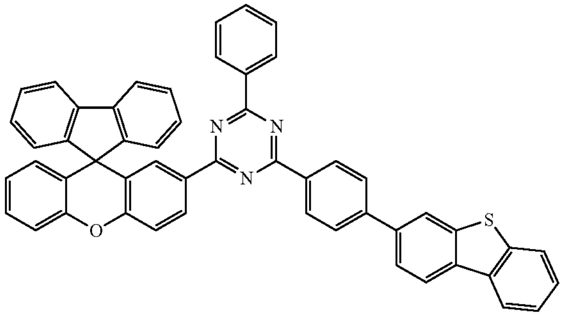
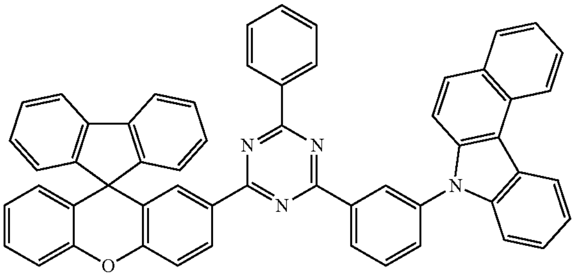
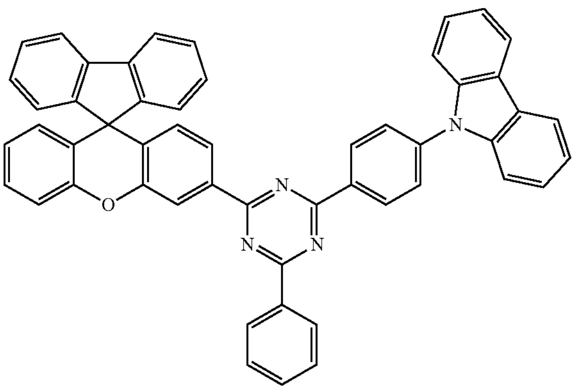
-continued
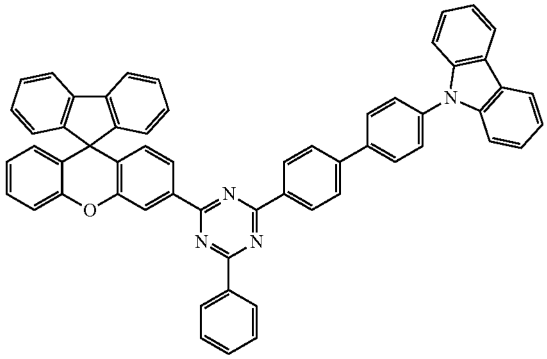
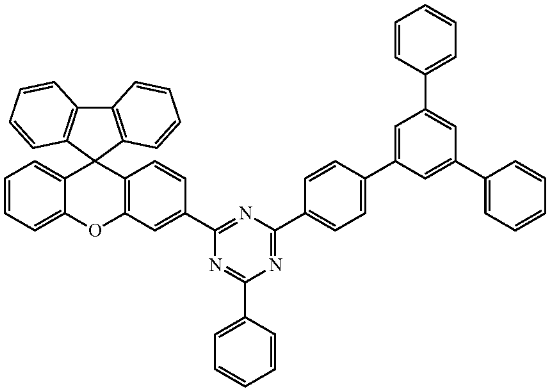
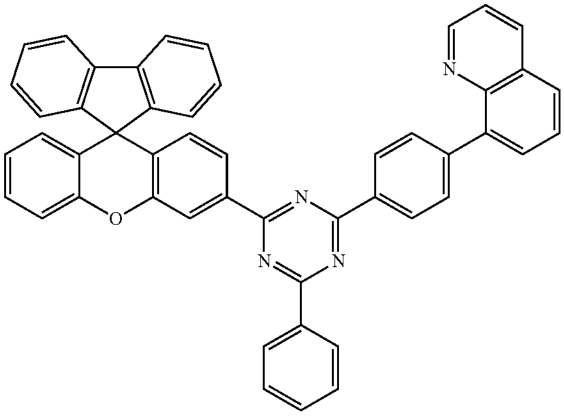
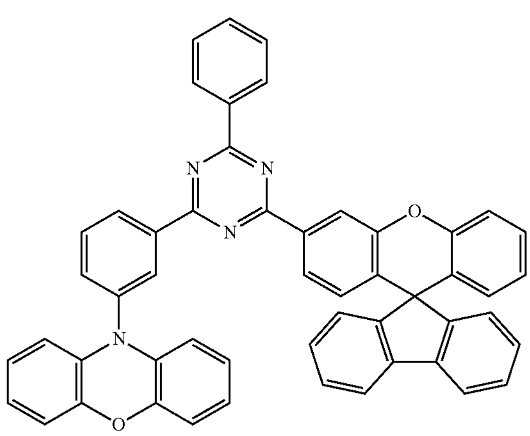

-continued
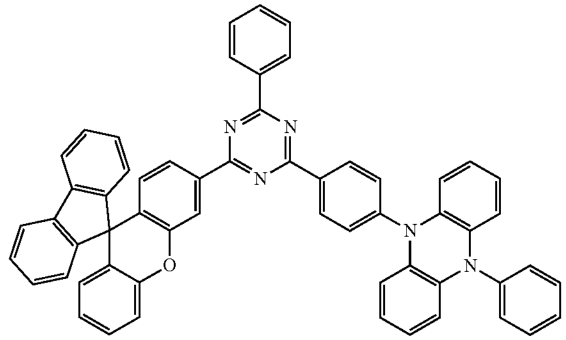
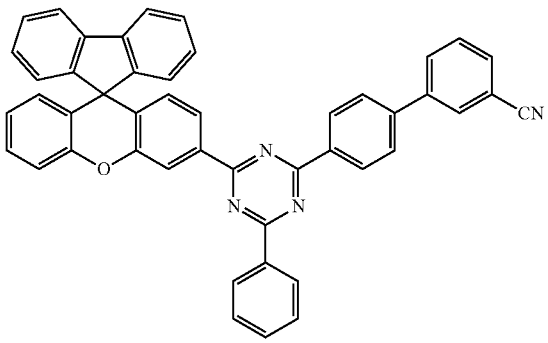
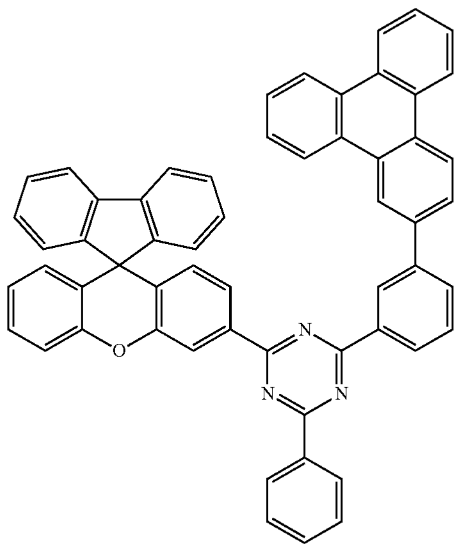
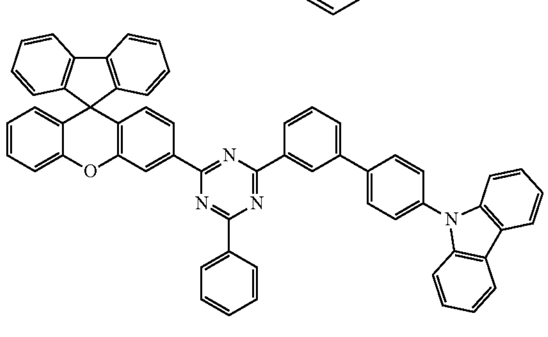
-continued
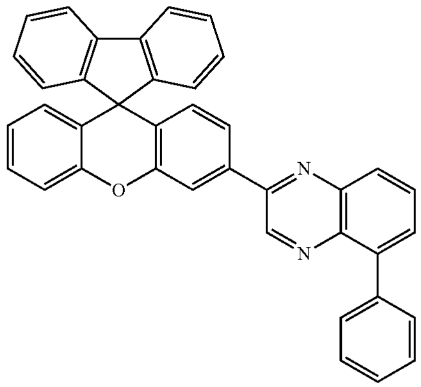
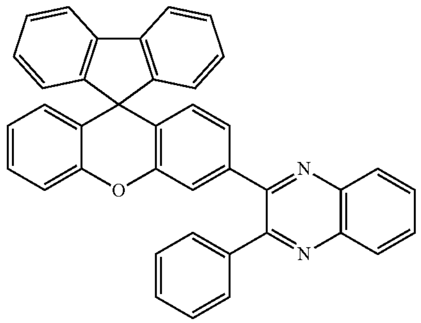
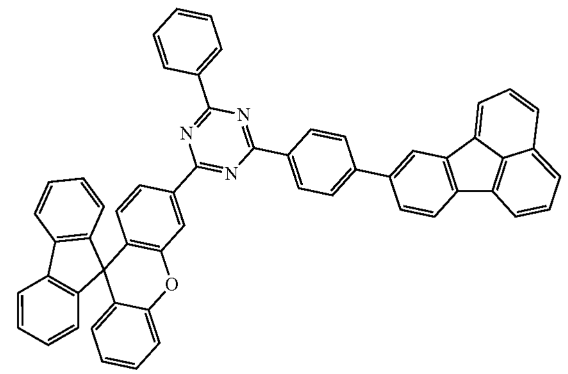
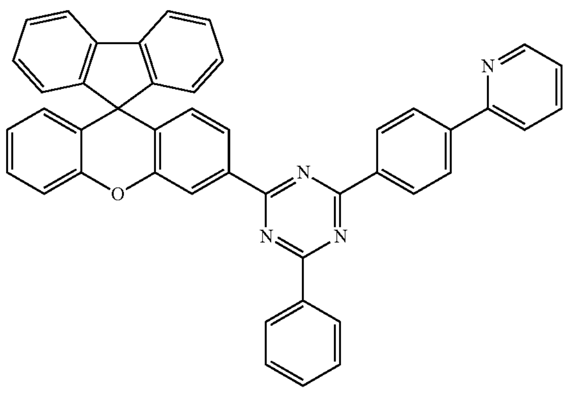

-continued
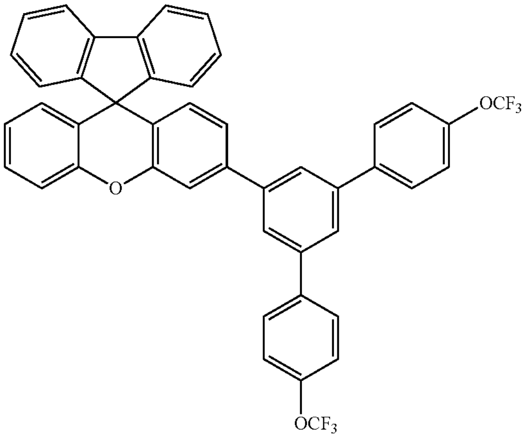
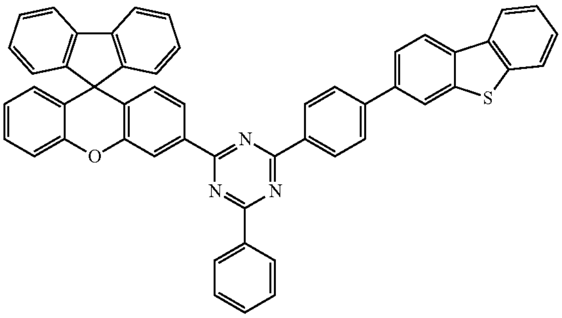
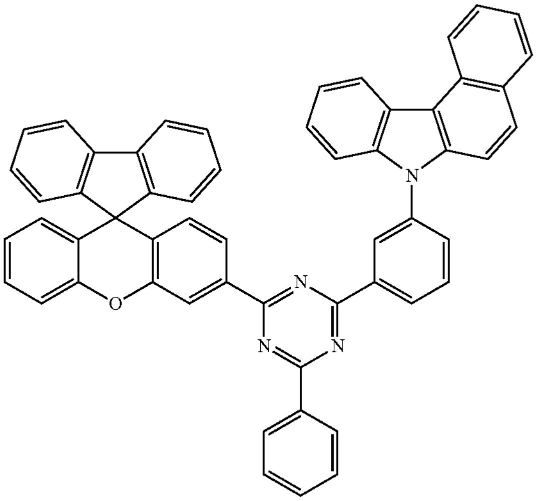
-continued
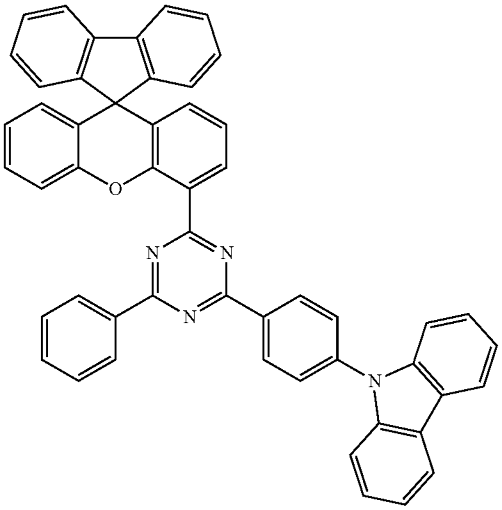
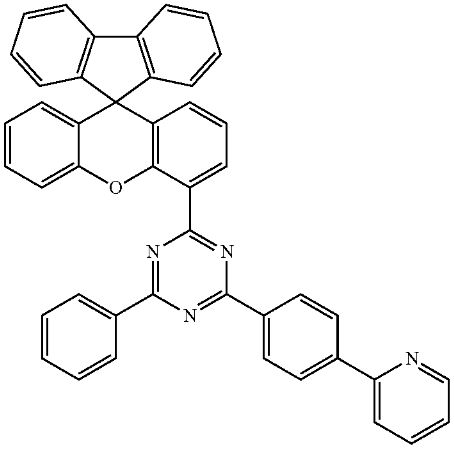
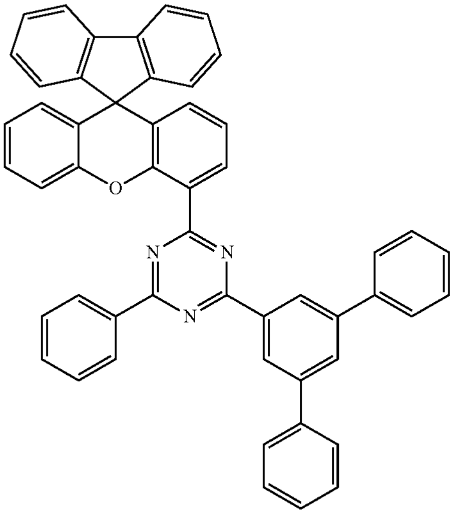

-continued
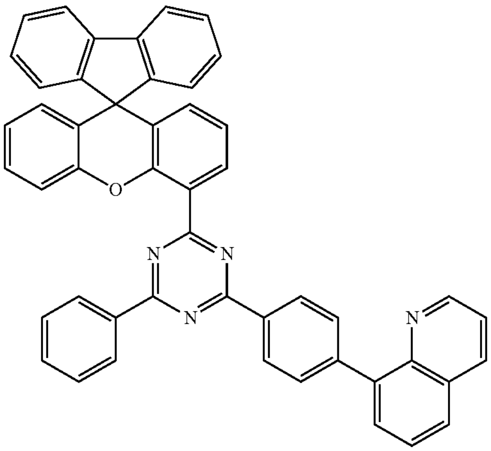
-continued
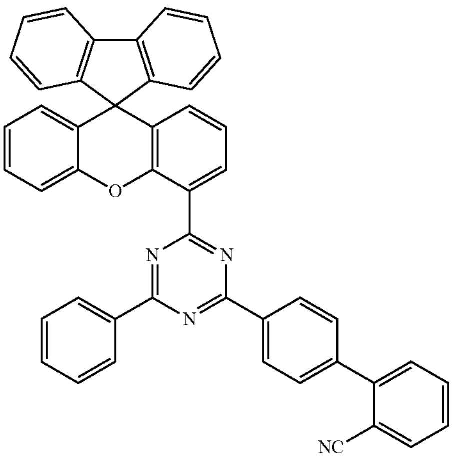
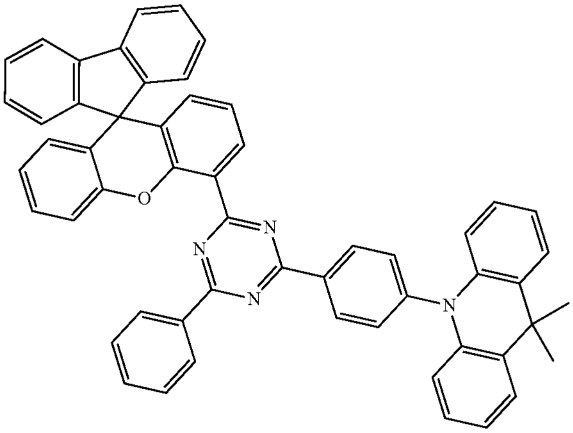
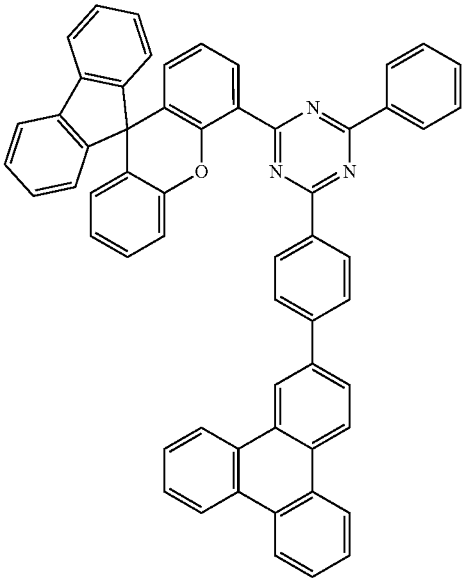
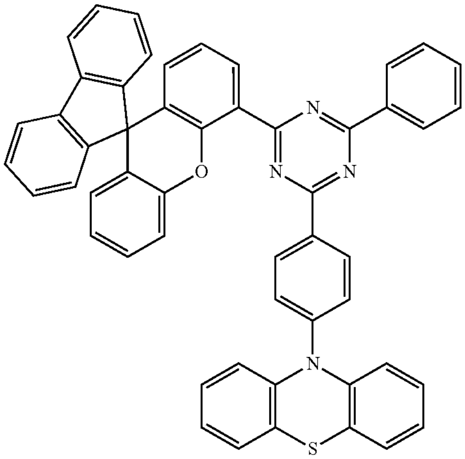
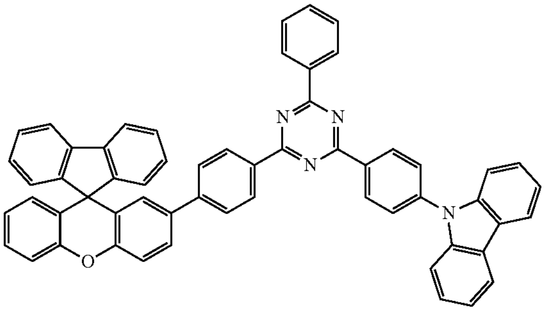

-continued
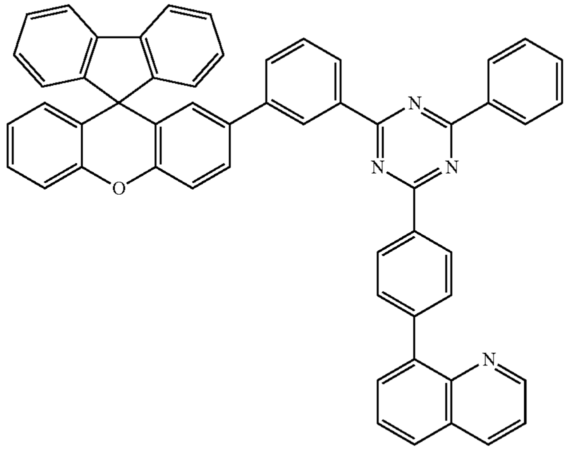
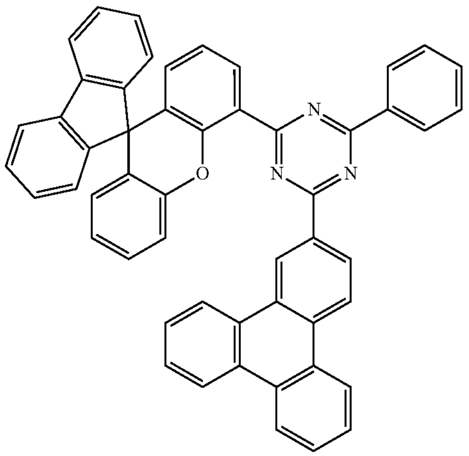
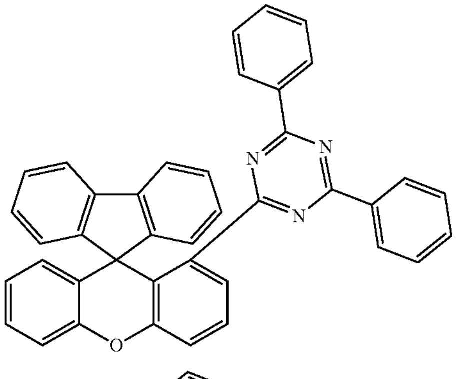
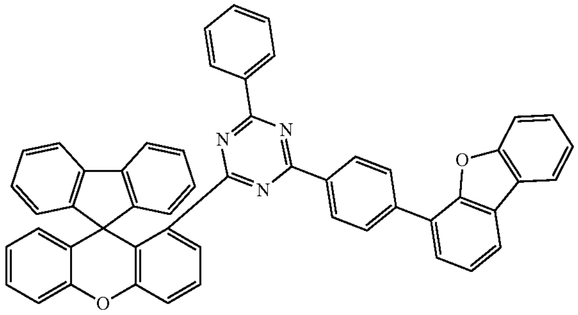
-continued
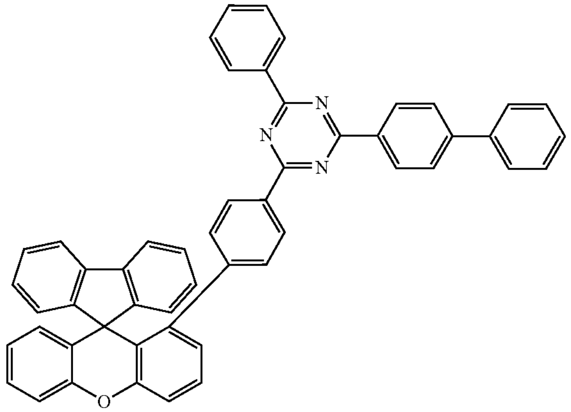
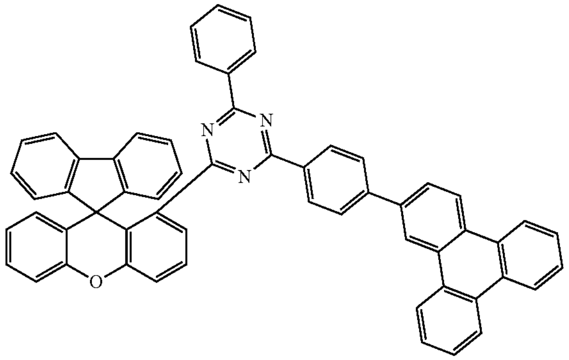
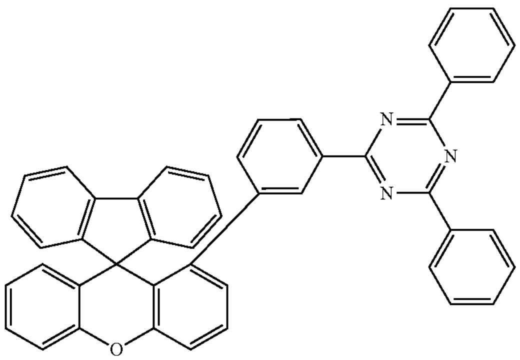
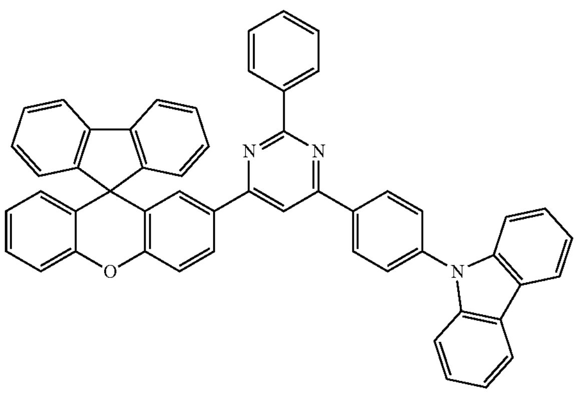

-continued
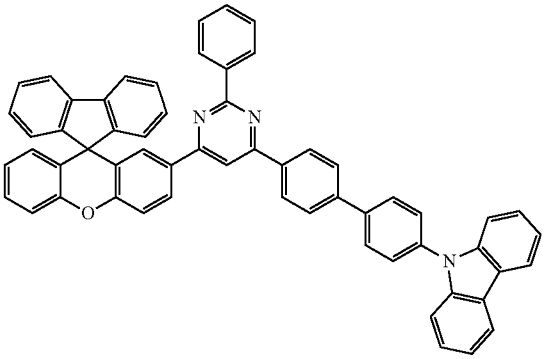
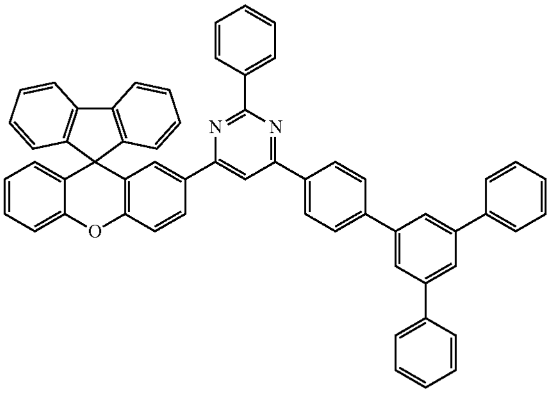
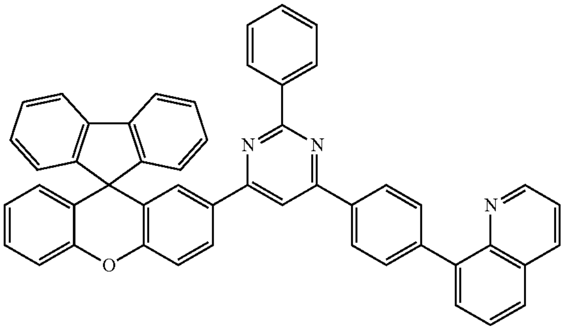
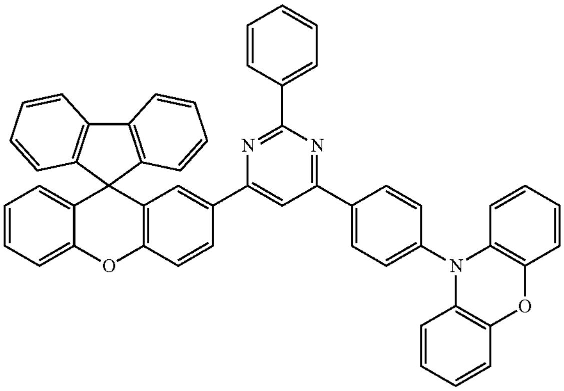
-continued
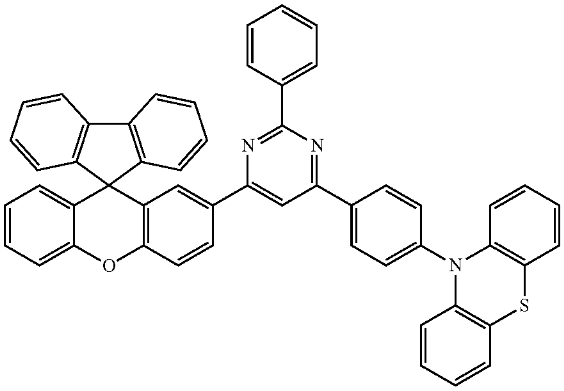
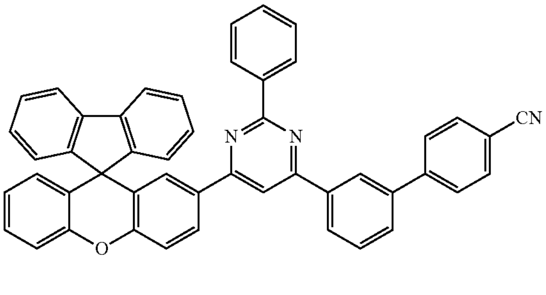
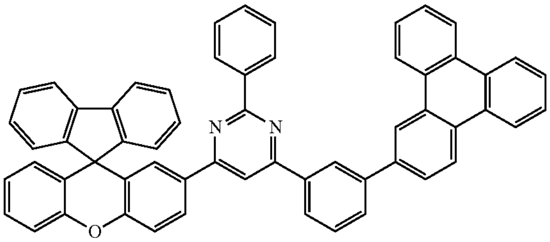
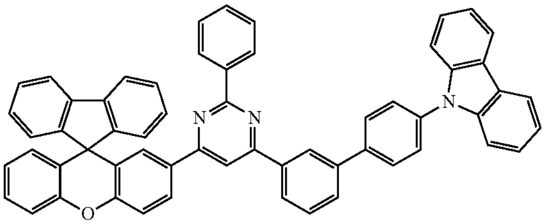
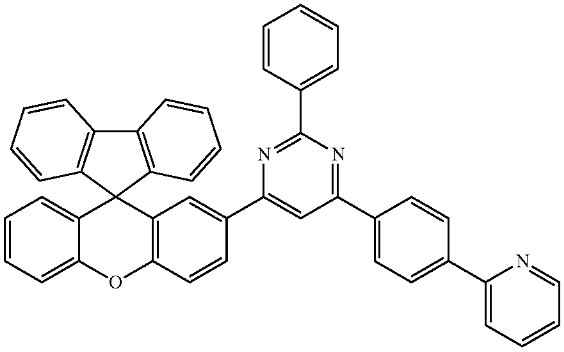

-continued
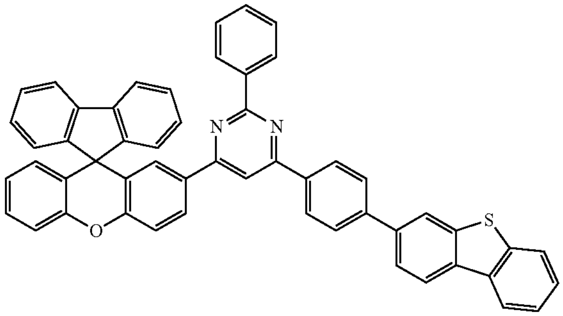
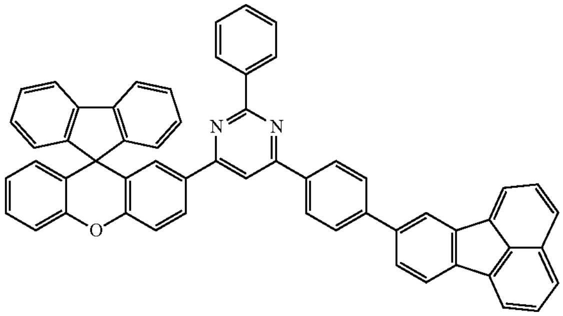
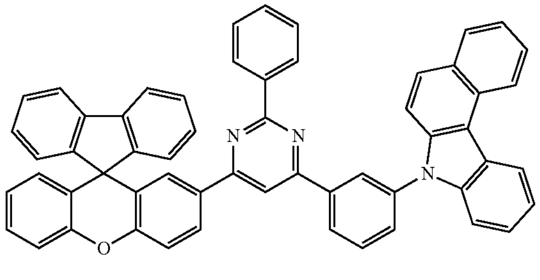
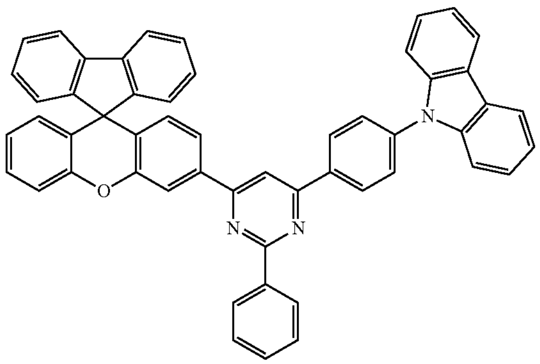
-continued
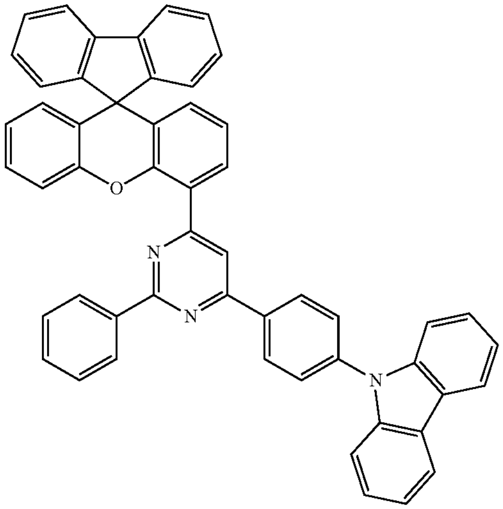
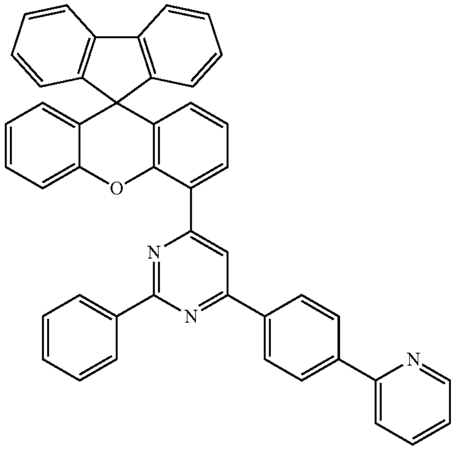
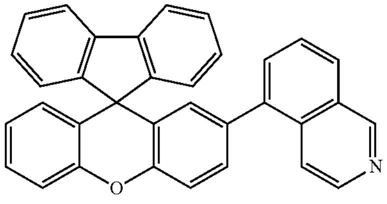
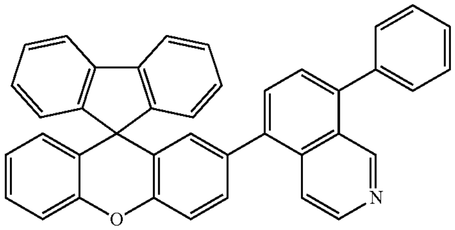
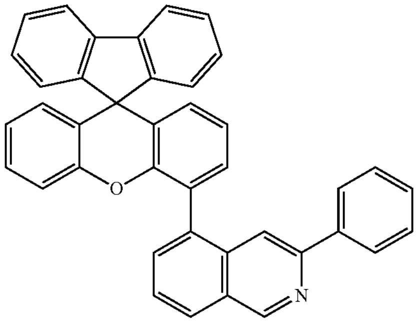

-continued

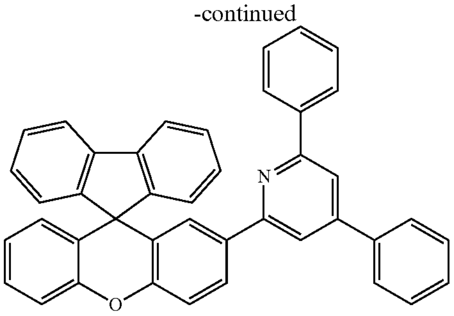

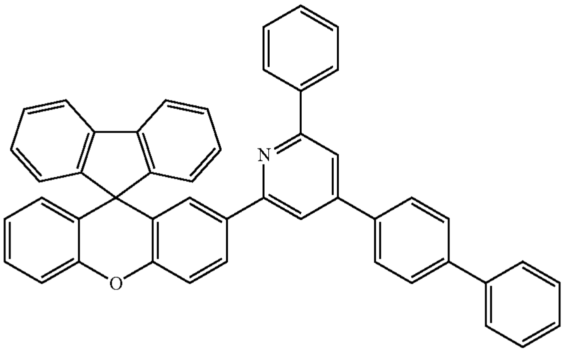

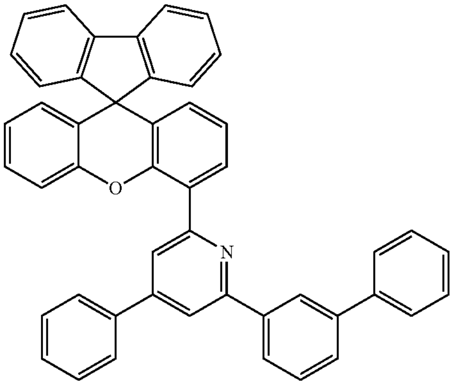

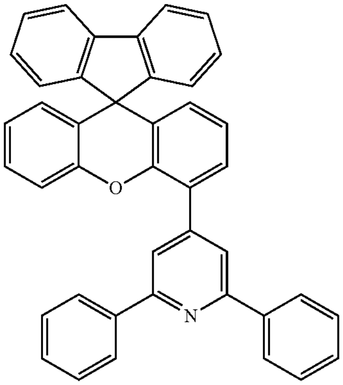

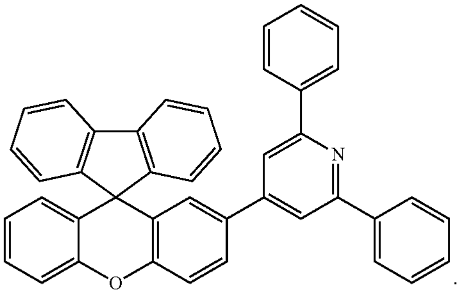
.

When one member is disposed "on" another member in the present application, this includes not only a case where the one member is brought into contact with another member, but also a case where still another member is present between the two members.

When one part "includes" one constituent element in the present application, unless otherwise specifically described, this does not mean that another constituent element is excluded, but means that another constituent element can be further included.

An exemplary embodiment of the present application includes: a first electrode; a second electrode provided to face the first electrode; and a first organic material layer and a second organic material layer provided between the first electrode and the second electrode, in which the first organic material layer includes a compound of Formula 1, and the second organic material layer includes a compound of Formula 2.

Each of the first and second organic material layers of the organic light emitting device of the present application can also be composed of a single-layered structure, but can be composed of a multi-layered structure in which organic material layers having two or more layers are stacked. For example, the first organic material layer of the present application can be composed of one to three layers. In addition, the organic light emitting device of the present application can have a structure including a hole injection layer, a light emitting layer, an electron transport layer, and the like as organic material layers. However, the structure of the organic light emitting device is not limited thereto, and can include a greater or fewer number of organic layers.

In an exemplary embodiment of the present application, the organic light emitting device further includes one or two or more layers selected from the group consisting of a hole injection layer, a hole transport layer, an electron transport layer, an electron injection layer, an electron blocking layer, and a hole blocking layer.

Specifically, in an exemplary embodiment of the present application, the first organic material layer includes a hole adjusting layer, the hole adjusting layer includes the compound of Formula 1, and when the hole adjusting layer is composed of two or more layers, the respective layers can each independently include the compound of Formula 1 identically or differently.

Furthermore, according to an exemplary embodiment of the present application, the second organic material layer includes an electron transport layer or an electron adjusting layer, and the electron transport layer or the electron adjusting layer can include the compound of Formula 2.

In an exemplary embodiment of the present application, the organic light emitting device further includes one or two or more layers selected from the group consisting of a hole injection layer, a hole transport layer, an electron transport layer, an electron injection layer, an electron blocking layer, and a hole blocking layer.

More specifically, the organic light emitting device includes: a first electrode; a second electrode provided to face the first electrode; a light emitting layer provided between the first electrode and the second electrode; and a first organic material layer having one to three layers provided between the light emitting layer and the first electrode, or between the light emitting layer and the second electrode, in which the first organic material layer includes the compound of Formula 1.

In an exemplary embodiment of the present application, the second organic material layer includes an electron transport layer or electron adjusting layer having one or more layers, and at least one of the electron transport layer or electron adjusting layer having one or more layers includes the compound of Formula 2. Specifically, in an exemplary embodiment of the present application, the compound can also be included in one layer of the electron transport layer or electron adjusting layer having one or more layers, and can be included in each of the electron transport layer or electron adjusting layer having one or more layers.

In addition, in an exemplary embodiment of the present application, when the compound of Formula 2 is included in each of the electron transport layer or electron adjusting layer having one or more layers, the other materials except for the compound can be the same as or different from each other.

In an exemplary embodiment of the present application, the organic material layer further includes a hole injection layer or a hole transport layer, which includes a compound including an arylamino group, a carbazole group, or a benzocarbazole group, in addition to the organic material layer including the compound.

In another exemplary embodiment, the organic light emitting device can be an organic light emitting device having a normal type structure in which a positive electrode, an organic material layer having one or more layers, and a negative electrode are sequentially stacked on a substrate.

In still another exemplary embodiment, the organic light emitting device can be an organic light emitting device having an inverted type structure in which a negative electrode, an organic material layer having one or more layers, and a positive electrode are sequentially stacked on a substrate.

For example, the structures of the organic light emitting device according to an exemplary embodiment of the present application are exemplified in FIGS. 1 and 2.

FIG. 1 exemplifies a structure of a general organic light emitting device in which a substrate 1, a positive electrode 2, a light emitting layer 3, and a negative electrode 4 are sequentially stacked.

FIG. 2 exemplifies a structure of an organic light emitting device in which a substrate 1, a positive electrode 2, a hole adjusting layer 5, a hole transport layer 6, a light emitting layer 3, an electron transport layer 7, and a negative electrode 4 are sequentially stacked.

FIG. 3 exemplifies a structure of an organic light emitting device in which a substrate 1, a positive electrode 2, a hole injection layer 5, a hole transport layer 6, a hole adjusting layer 8, a light emitting layer 3, an electron adjusting layer 9, an electron transport layer 7, and a negative electrode 4 are sequentially stacked. In the structure as described above, the compound of Formula 1 can be included in the hole adjusting layer 8, and the compound of Formula 2 can be included in the electron adjusting layer 9.

The organic light emitting device of the present application can be manufactured by the materials and methods known in the art, except that one or more layers of the first and second organic material layers include the compound of the present application, that is, the compound.

When the organic light emitting device includes a plurality of first or second organic material layers, the organic material layers can be formed of the same material or different materials.

The organic light emitting device of the present application can be manufactured by the materials and methods known in the art, except that one or more layers of the first and second organic material layers include the compound, that is, the compound of any one of Formulae 1 and 2.

For example, the organic light emitting device of the present application can be manufactured by sequentially stacking a first electrode, first and second organic material layers, and a second electrode on a substrate. In this case, the organic light emitting device can be manufactured by depositing a metal or a metal oxide having conductivity, or an alloy thereof on a substrate to form a positive electrode, forming an organic material layer including a hole injection layer, a hole transport layer, a light emitting layer, and an electron transport layer thereon, and then depositing a material, which can be used as a negative electrode, thereon, by using a physical vapor deposition (PVD) method such as sputtering or e-beam evaporation. In addition to the method as described above, an organic light emitting device can be made by sequentially depositing a negative electrode material, an organic material layer, and a positive electrode material on a substrate.

Further, the compound of Chemical Formulae 1 or 2 can be formed as an organic material layer by not only a vacuum deposition method, but also a solution application method when an organic light emitting device is manufactured. Here, the solution application method means spin coating, dip coating, doctor blading, inkjet printing, screen printing, a spray method, roll coating, and the like, but is not limited thereto.

In addition to the method described above, an organic light emitting device can also be made by sequentially depositing a negative electrode material, an organic material layer, and a positive electrode material on a substrate (International Publication No. WO2003/012890). However, the manufacturing method is not limited thereto.

In an exemplary embodiment of the present application, the first electrode is a positive electrode, and the second electrode is a negative electrode.

In another exemplary embodiment, the first electrode is a negative electrode, and the second electrode is a positive electrode.

As the positive electrode material, materials having a high work function are usually preferred so as to facilitate the injection of holes into a first or second organic material layer. Specific examples of the positive electrode material which can be used in the present invention include: a metal such as vanadium, chromium, copper, zinc, and gold, or an alloy thereof; a metal oxide such as zinc oxide, indium oxide, indium tin oxide (ITO), and indium zinc oxide (IZO); a combination of a metal and an oxide, such as ZnO:Al or $SnO_2$:Sb; a conductive polymer such as poly(3-methylthiophene), poly[3,4-(ethylene-1,2-dioxy)thiophene] (PEDOT), polypyrrole, and polyaniline; and the like, but are not limited thereto.

As the negative electrode material, materials having a low work function are usually preferred so as to facilitate the injection of electrons into an organic material layer. Specific examples of the negative electrode material include: a metal such as magnesium, calcium, sodium, potassium, titanium, indium, yttrium, lithium, gadolinium, aluminum, silver, tin, and lead, or an alloy thereof; a multi-layer structured material, such as LiF/Al or $LiO_2$/Al; and the like, but are not limited thereto.

The hole injection layer is a layer which injects holes from an electrode, and a hole injection material is preferably a compound which has a capability of transporting holes and thus has an effect of injecting holes at a positive electrode and an excellent effect of injecting holes for a light emitting layer or a light emitting material, prevents excitons produced from the light emitting layer from moving to an electron injection layer or an electron injection material, and is also excellent in the ability to form a thin film. The highest occupied molecular orbital (HOMO) of the hole injection material is preferably a value between the work function of the positive electrode material and the HOMO of the neighboring organic material layer. Specific examples of the hole injection material include metal porphyrin, oligothiophene, arylamine-based organic materials, hexanitrile hexaazatriphenylene-based organic materials, quinacridone-based organic materials, perylene-based organic materials, anthraquinone, polyaniline-based and polythiophene-based conductive polymers, and the like, but are not limited thereto.

The hole transport layer is a layer which accepts holes from a hole injection layer and transports the holes to a light emitting layer, and a hole transport material is suitably a material having high hole mobility which can accept holes from a positive electrode or a hole injection layer and transfer the holes to a light emitting layer. Specific examples thereof include arylamine-based organic materials, conductive polymers, block copolymers having both conjugated portions and non-conjugated portions, and the like, but are not limited thereto.

The light emitting material is a material which can emit light in a visible light region by accepting and combining holes and electrons from a hole transport layer and an electron transport layer, respectively, and preferably a material having high quantum efficiency for fluorescence or phosphorescence. Specific examples thereof include: an 8-hydroxy-quinoline aluminum complex ($Alq_3$), carbazole-based compounds, dimerized styryl compounds, BAlq, 10-hydroxybenzoquinoline-metal compounds, benzoxazole-based, benzothiazole-based and benzimidazole-based compounds, poly(p-phenylenevinylene) (PPV)-based polymers, spiro compounds, polyfluorene, rubrene, and the like, but are not limited thereto.

The electron transport layer is a layer which accepts electrons from an electron injection layer and transports the electrons to a light emitting layer, and an electron transport material is suitably a material having high electron mobility which can proficiently accept electrons from a negative electrode and transfer the electrons to a light emitting layer. Specific examples thereof include: an Al complex of 8-hydroxy-quinoline, a complex including $Alq_3$, an organic radical compound, a hydroxyflavone-metal complex, and the like, but are not limited thereto. The electron transport layer can be used with any desired cathode material, as used according to the related art. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

The electron injection layer is a layer which injects electrons from an electrode, and an electron injection material is preferably a compound which has a capability of transporting electrons, an effect of injecting electrons from a negative electrode, and an excellent effect of injecting electrons into a light emitting layer or a light emitting material, prevents excitons produced from the light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like, but are not limited thereto.

Examples of the metal complex compounds include 8-hydroxyquinolinato lithium, bis(8-hydroxyquinolinato) zinc, bis(8-hydroxyquinolinato) copper, bis(8-hydroxy-quinolinato) manganese, tris(8-hydroxyquinolinato) aluminum, tris (2-methyl-8-hydroxyquinolinato) aluminum, tris(8-hydroxy-quinolinato) gallium, bis(10-hydroxybenzo[h] quinolinato) beryllium, bis(10-hydroxybenzo[h]-quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

The hole blocking layer is a layer which blocks holes from reaching a negative electrode, and can be generally formed under the same conditions as those of the hole injection layer. Specific examples thereof include an oxadiazole derivative or a triazole derivative, a phenanthroline derivative, BCP, an aluminum complex, and the like, but are not limited thereto.

The organic light emitting device according to the present application can be a top emission type, a bottom emission type, or a dual emission type according to the material to be used.

EXAMPLES

The preparation of the organic light emitting device including the compounds of Formulae 1 and 2 will be specifically described in the following Examples. However, the following Examples are provided for exemplifying the present specification, and the scope of the present specification is not limited thereby.

[Preparation Example 1] Synthesis of Formula 1

Synthesis of Compound 1

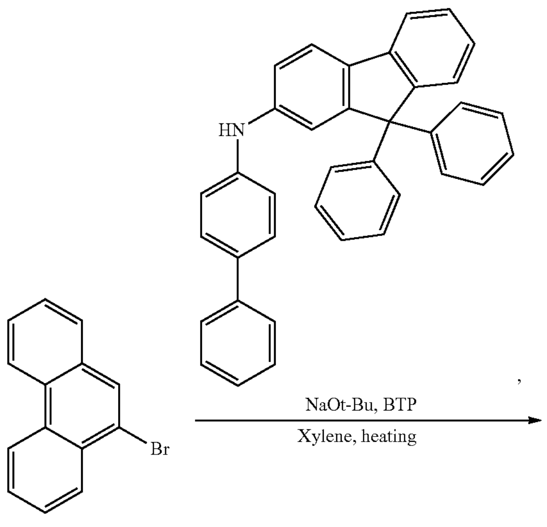

-continued

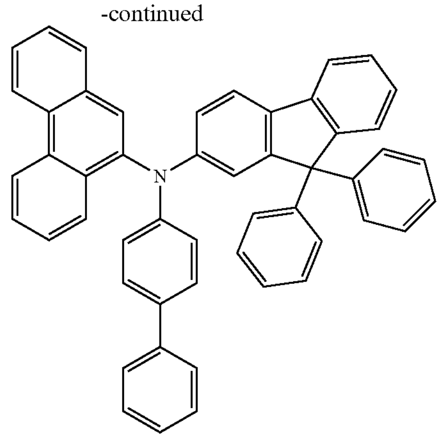

1

9-bromophenanthrene (15 g, 39.55 mmol) and N-([1,1'-biphenyl]-4-yl)-N-(9,9-diphenyl-9H-fluoren-2-yl)-phenanthren-2-amine (12.96 g, 40.34 mmol), and sodium-t-butoxide (5.3 g, 55.37 mol) were put into xylene, the resulting mixture was heated and stirred, and then refluxed, and [bis(tri-t-butylphosphine)]palladium (404 mg, 2 mmol %) was added thereto. The temperature was lowered to room temperature, the reaction was terminated, and then the resulting product was recrystallized by using tetrahydrofuran and ethyl acetate to prepare Compound 1 (19.6 g, 82%).

MS[M+H]$^+$=662.85

Synthesis of Compound 2

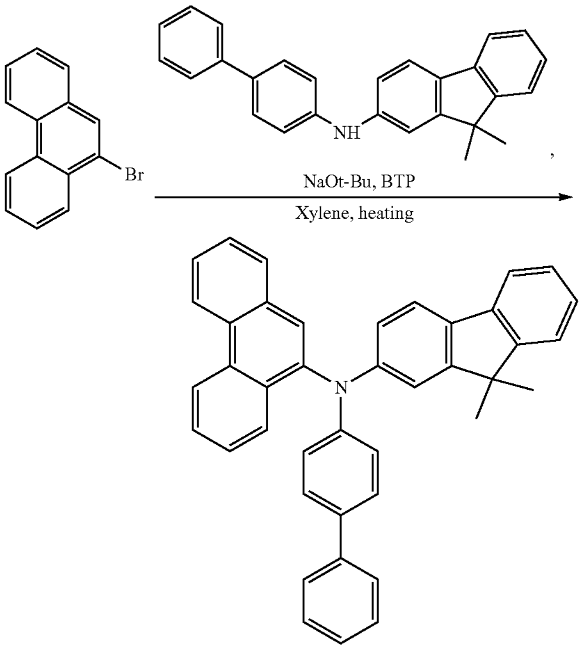

2

Compound 2 was prepared by performing synthesis in the same manner as in the synthesis of Compound 1, except that N-([1,1'-diphenyl]-4-yl)-9,9-dimethyl-9H-fluoren-2-amine was used instead of N-([1,1'-biphenyl]-4-yl)-N-(9,9-diphenyl-9H-fluoren-2-yl)phenanthren-2-amine.

MS[M+H]$^+$=538.71

Synthesis of Compound 3

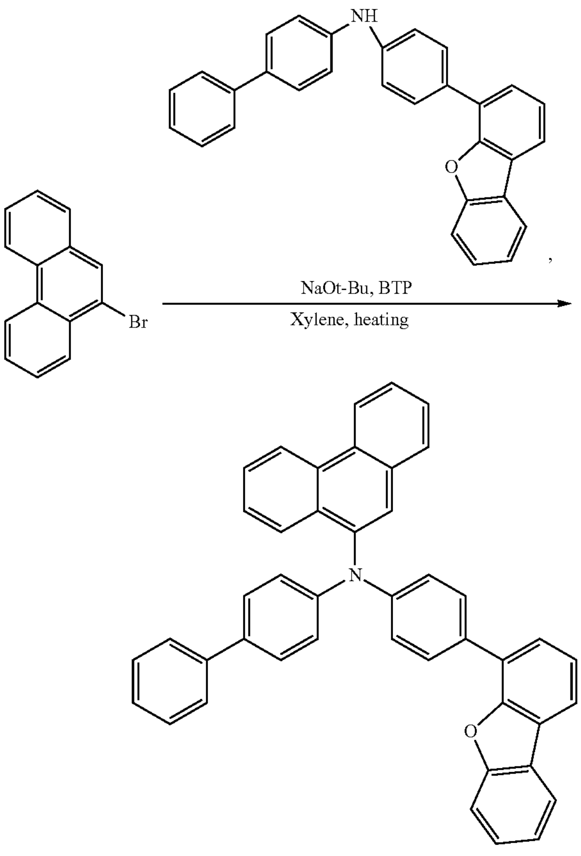

3

Compound 3 was prepared by performing synthesis in the same manner as in the synthesis of Compound 1, except that N-(4-(dibenzo[b,d]furan-4-yl)phenyl)-[1,1'-biphenyl]-4-amine was used instead of N-([1,1'-biphenyl]-4-yl)-N-(9,9-diphenyl-9H-fluoren-2-yl)phenanthren-2-amine.

MS[M+H]$^+$=588.72

Synthesis of Compound 4

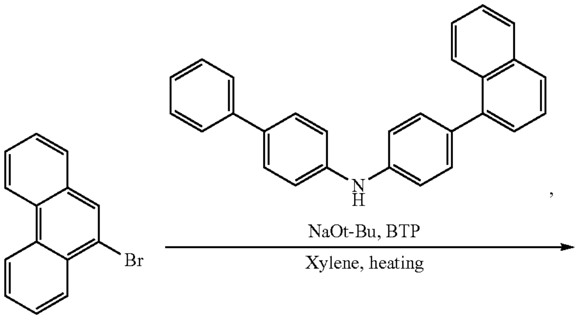

-continued
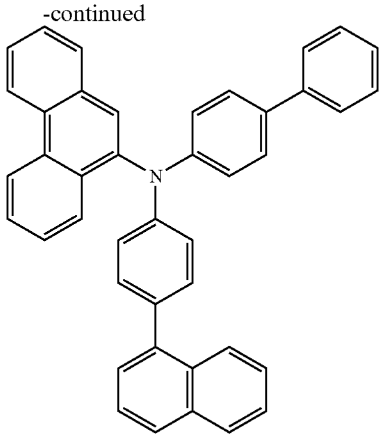
4
Compound 4 was prepared by performing synthesis in the same manner as in the synthesis of Compound 1, except that N-(4-(naphthalen-1-yl)phenyl)-[1,1'-biphenyl]-4-amine was used instead of N-([1,1'-biphenyl]-4-yl)-N-(9,9-diphenyl-9H-fluoren-2-yl)phenanthren-2-amine.
MS[M+H]$^+$=548.70
Synthesis of Compounds 5 to 7
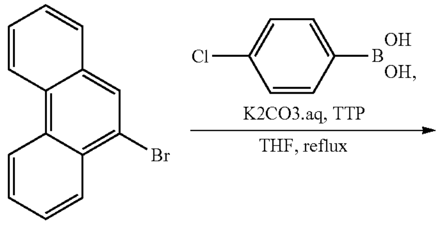
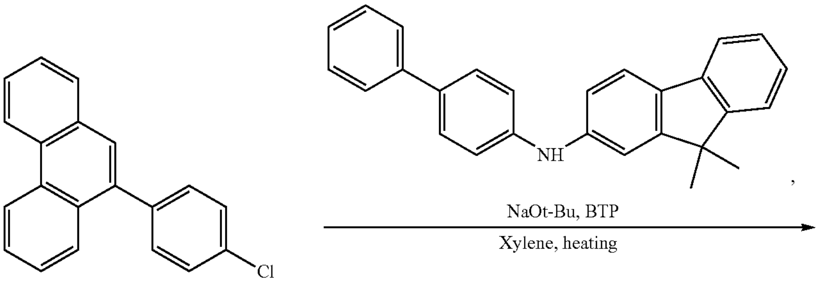
A1

-continued

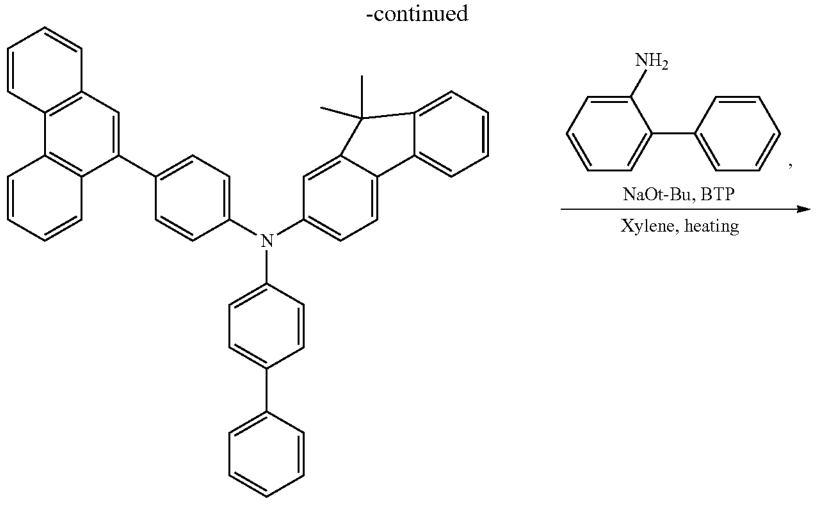

5

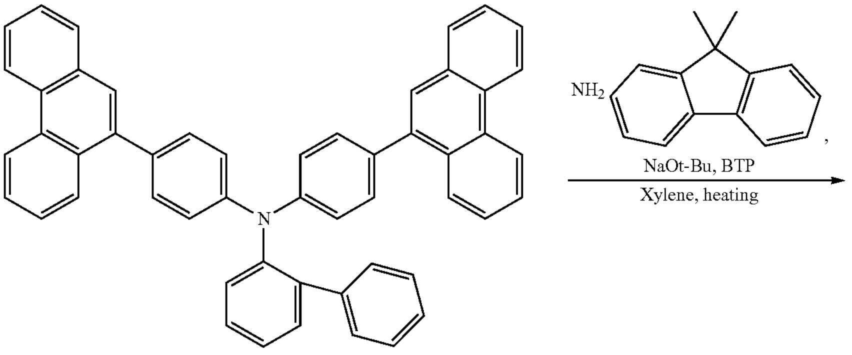

6

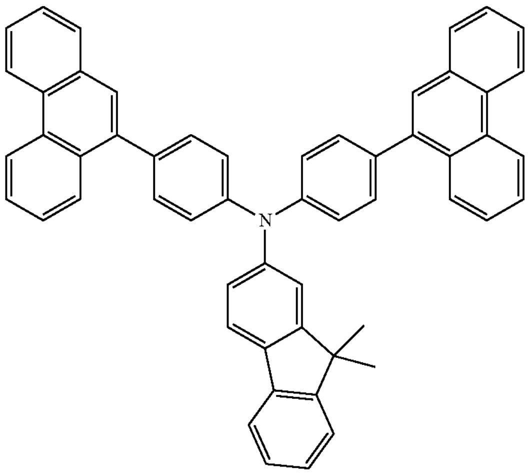

7

Synthesis of A1

After 9-bromophenanthrene (20 g, 52.7 mmol) and 4-chlorophenylboronic acid (8.66 g, 55.3 mmol) were added to tetrahydrofuran (300 ml), a 2M aqueous potassium carbonate solution (150 ml) was added thereto, tetrakistriphenyl-phosphinopalladium (1.21 g, 2 mol %) was added thereto, and then the resulting mixture was heated and stirred for 10 hours. After the temperature was lowered to normal temperature and the reaction was terminated, the aqueous potassium carbonate solution was removed to separate the layers. After the solvent was removed, a solid was recrystallized with ethyl acetate to prepare A1 (19.48 g, yield 90%).

$MS[M+H]^+=289.77$

Synthesis of Compound 5

Compound 5 was prepared by performing synthesis in the same manner as in the synthesis of Compound 1, except that A1 and N-([1,1'-diphenyl]-4-yl)-9,9-dimethyl-9H-fluoren-2-amine were used instead of 9-bromophenanthrene and N-([1,1'-biphenyl]-4-yl)-N-(9,9-diphenyl-9H-fluoren-2-yl)phenanthren-2-amine, respectively.

MS[M+H]$^+$=614.80

Synthesis of Compound 6

Compound 6 was prepared by performing synthesis in the same manner as in the synthesis of Compound 1, except that A1 and 2-aminobiphenyl were used instead of 9-bromophenanthrene and N-([1,1'-biphenyl]-4-yl)-N-(9,9-diphenyl-9H-fluoren-2-yl)phenanthren-2-amine, respectively.

MS[M+H]$^+$=674.86

Synthesis of Compound 7

Compound 7 was prepared by performing synthesis in the same manner as in the synthesis of Compound 1, except that A1 and 9,9-dimethyl-9H-fluoren-2-amine were used instead of 9-bromophenanthrene and N-([1,1'-biphenyl]-4-yl)-N-(9,9-diphenyl-9H-fluoren-2-yl)phenanthren-2-amine, respectively.

MS[M+H]$^+$=714.92

Synthesis of Compound 8

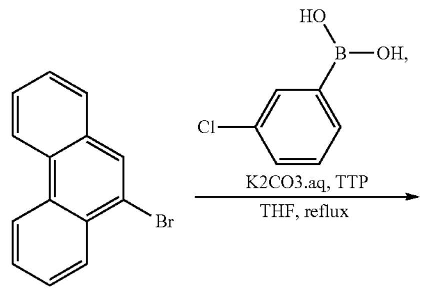

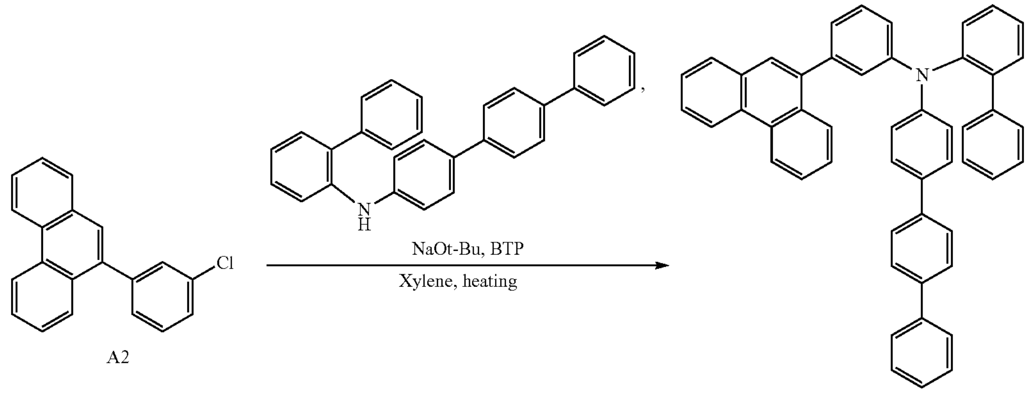

A2

8

Synthesis of A2

Compound A2 was prepared by performing synthesis in the same manner as in the synthesis of A1, except that 3-chlorophenylboronic acid was used instead of 4-chlorophenylboronic acid.

MS[M+H]$^+$=289.77

Synthesis of Compound 8

Compound 8 was prepared by performing synthesis in the same manner as in the synthesis of Compound 1, except that A2 and N-([1,1'-biphenyl]-2-yl)-[1,1':4',1"-terphenyl]-4-amine was used instead of 9-bromo-phenanthrene and N-([1,1'-biphenyl]-4-yl)-N-(9,9-diphenyl-9H-fluoren-2-yl)phenanthren-2-amine, respectively.

MS[M+H]$^+$=650.84

Synthesis of Compound 9

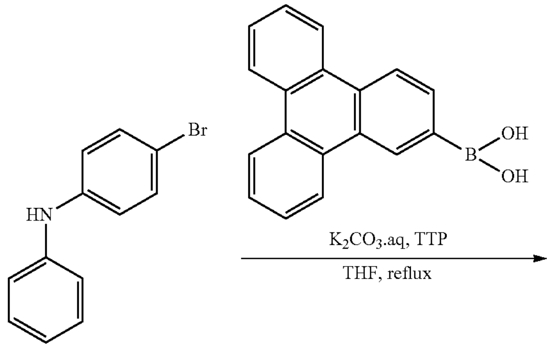

-continued

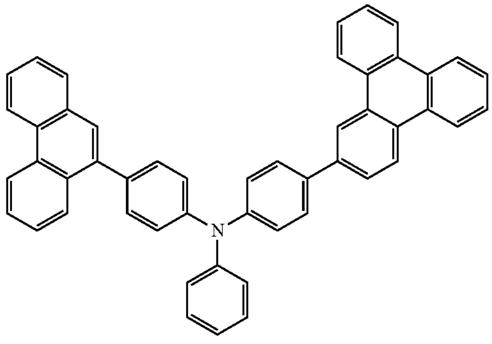

9

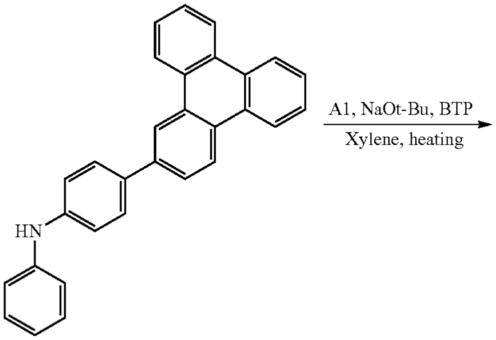

A3

Synthesis of A3

Compound A3 was prepared by performing synthesis in the same manner as in the synthesis of A1, except that 4-bromo-N-phenylaniline and triphenylene-2-ylboronic acid were used instead of 9-bromophenanthrene and 4-chlorophenylboronic acid, respectively.

MS[M+H]$^+$=396.51

Synthesis of Compound 9

Compound 9 was prepared by performing synthesis in the same manner as in the synthesis of Compound 1, except that A1 and A3 were used instead of 9-bromophenanthrene and N-([1,1'-biphenyl]-4-yl)-N-(9,9-diphenyl-9H-fluoren-2-yl)phenanthren-2-amine, respectively.

MS[M+H]$^+$=648.82

Synthesis of Compounds 10 to 12

Synthesis of A4 and A5

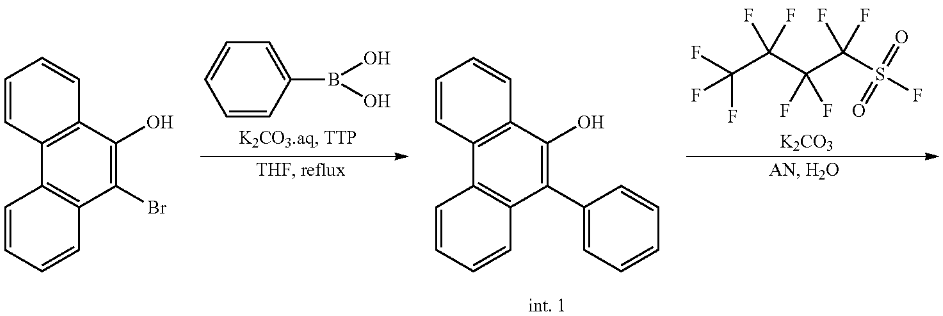

int. 1

-continued

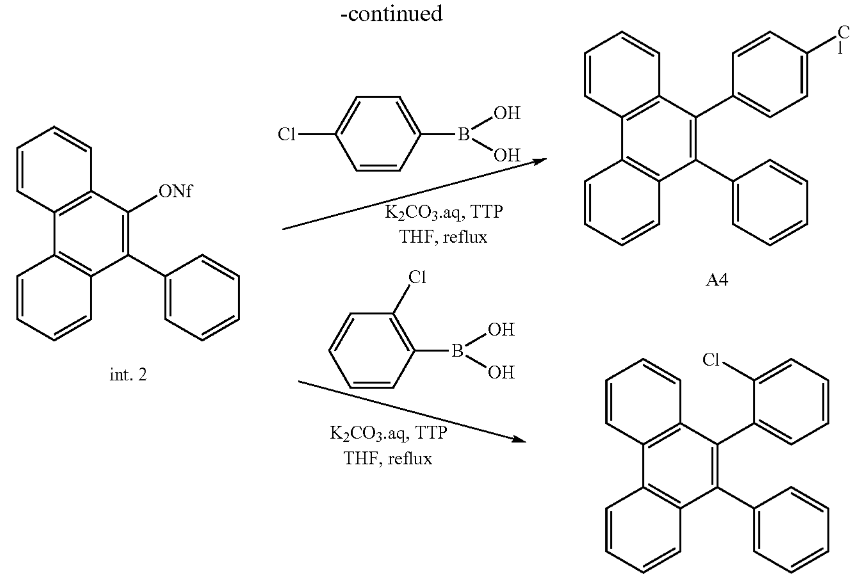

int. 2

A4

A5

Synthesis of Int.1

Int.1 was prepared by performing synthesis in the same manner as in the synthesis of A1, except that 9-bromo-10-hydroxyphenanthrene and phenylboronic acid were used instead of 9-bromophenanthrene and 4-chlorophenylboronic acid, respectively.

MS[M+H]$^+$=271.33

Synthesis of Int.2

The compound int.1 (15 g, 33.89 mmol) and potassium carbonate (7.0 g, 50.7 mmol) were put into acrylonitrile (AN) (200 ml) and $H_2O$ (50 ml), the resulting mixture was stirred, and then 2,2,3,3,4,4,5,5,5-nonafluoropentanonyl fluoride (NNF) (13.3 g, 44.05 mmol) was added thereto. After extraction was performed by using ethyl acetate and water and the solvent was removed, the residue was recrystallized with tetrahydrofuran and ethyl acetate to prepare int.2 (10.84 g, 75%).

MS[M+H]$^+$=553.41

Synthesis of A4

Compound A4 was prepared by performing synthesis in the same manner as in the synthesis of A1, except that int.2 was used instead of 9-bromophenanthrene.

MS[M+H]$^+$=365.87

Synthesis of A5

Compound A5 was prepared by performing synthesis in the same manner as in the synthesis of A1, except that int.2 and 2-chlorophenylboronic acid were used instead of 9-bromophenanthrene and 4-chlorophenylboronic acid, respectively.

MS[M+H]$^+$=365.87

Synthesis of Compound 10

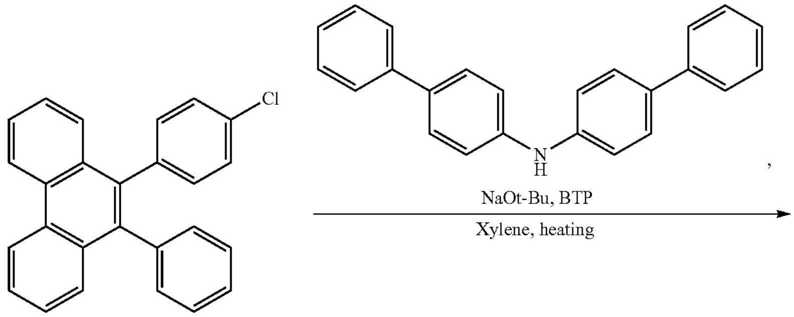

A4

-continued
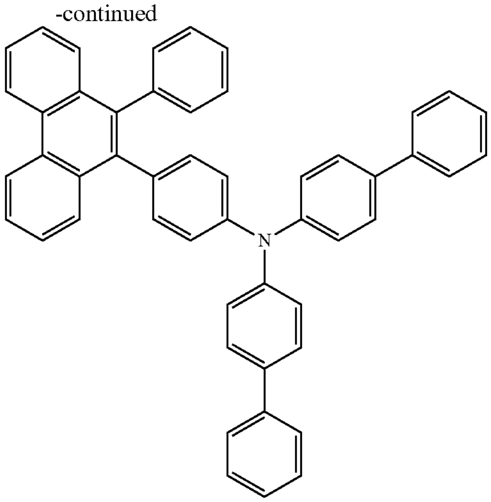
10
Compound 10 was prepared by performing synthesis in the same manner as in the synthesis of Compound 1, except that A4 and di([1,1'-biphenyl]-4-yl)amine were used instead of 9-bromophenanthrene and N-([1,1'-biphenyl]-4-yl)-N-(9,9-diphenyl-9H-fluoren-2-yl)-phenanthren-2-amine, respectively.
$MS[M+H]^+=650.84$
Synthesis of Compound 11
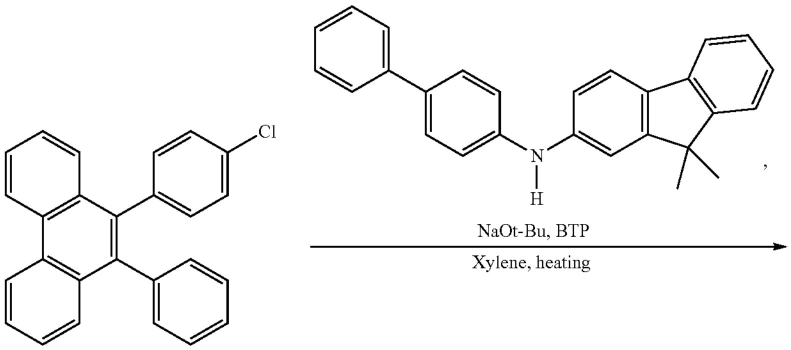
A4
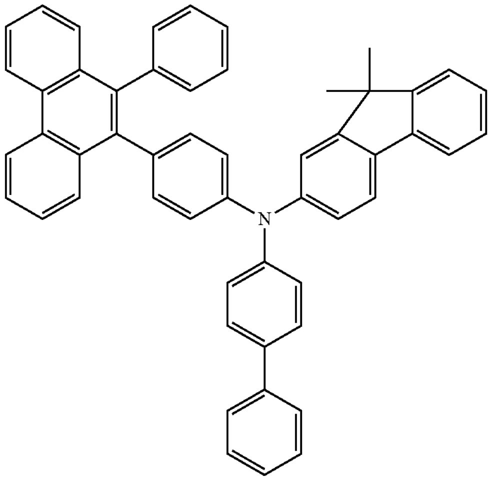
11

Compound 11 was prepared by performing synthesis in the same manner as in the synthesis of Compound 1, except that A4 and N-([1,1'-diphenyl]-4-yl)-9,9-dimethyl-9H-fluoren-2-amine were used instead of 9-bromophenanthrene and N-([1,1'-biphenyl]-4-yl)-N-(9,9-diphenyl-9H-fluoren-2-yl)phenanthren-2-amine.

MS[M+H]$^+$=690.90

Synthesis of Compound 12

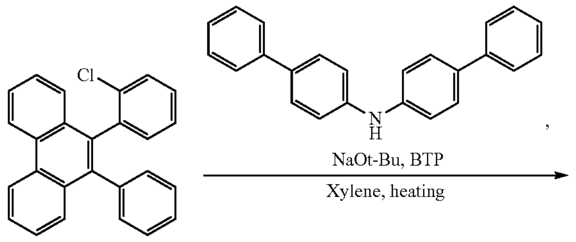

A5

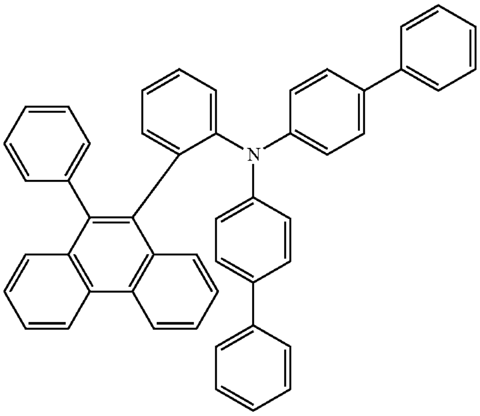

12

Compound 12 was prepared by performing synthesis in the same manner as in the synthesis of Compound 1, except that A5 and di([1,1'-biphenyl]-4-yl)amine were used instead of 9-bromophenanthrene and N-([1,1'-biphenyl]-4-yl)-N-(9,9-diphenyl-9H-fluoren-2-yl)phenanthren-2-amine, respectively.

MS[M+H]$^+$=650.84

Synthesis of Compound 13

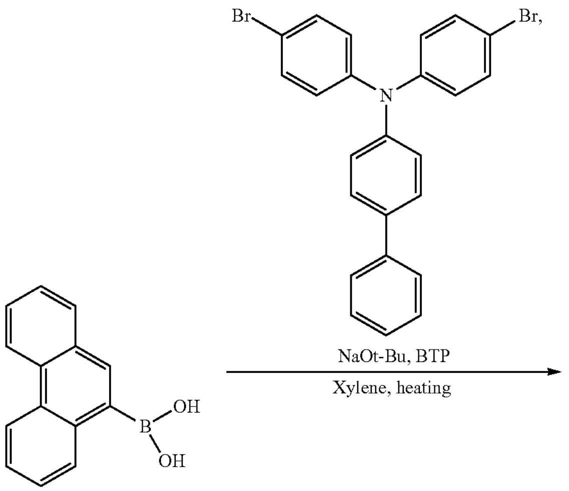

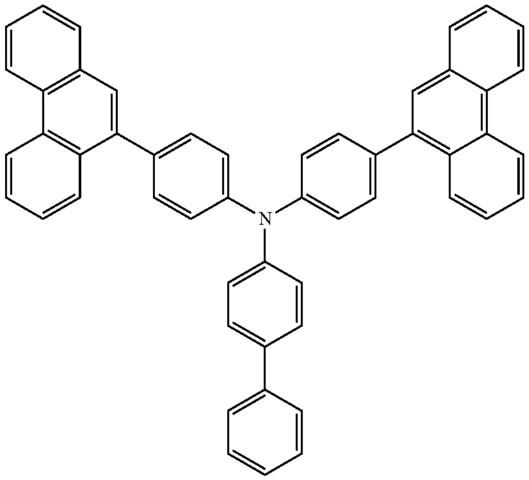

13

Compound 13 was prepared by performing synthesis in the same manner as in the synthesis of A1, except that phenanthrene-9-ylboronic acid and N,N-bis(4-bromophenyl)-[1,1'-biphenyl]-4-amine were used instead of 9-bromophenanthrene and 4-chlorophenylboronic acid, respectively.

MS[M+H]$^+$=674.86

[Preparation Example 2] Synthesis of Formula 2

Synthesis of Compound 14

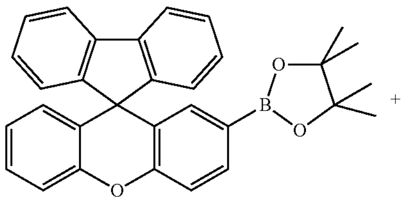

-continued

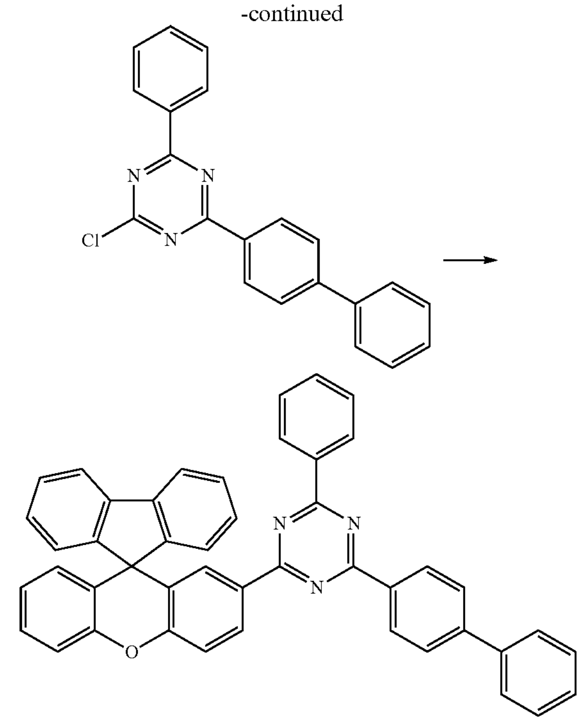

After the compounds 4,4,5,5-tetramethyl-2-(spiro-[fluorene-9,9'-xanthen]-2'-yl)-1,3,2-dioxaborolane (10.0 g, 21.8 mmol) and 2-([1,1'-biphenyl]-4-yl)-4-chloro-6-phenyl-1,3,5-triazine (7.5 g, 21.8 mmol) were completely dissolved in tetrahydrofuran (100 ml), potassium carbonate (9.0 g, 65.4 mmol) was dissolved in 50 ml of water, the resulting solution was added thereto, tetrakistriphenyl-phosphinopalladium (756 mg, 0.65 mmol) was added thereto, and then the resulting mixture was heated and stirred for 8 hours. The temperature was lowered to room temperature, the reaction was terminated, and then the potassium carbonate solution was removed to filter the white solid. The filtered white solid was washed each twice with tetrahydrofuran and ethyl acetate to prepare Compound 14 (12.6 g, yield 90%).

MS[M+H]$^+$=640

Synthesis of Compound 15

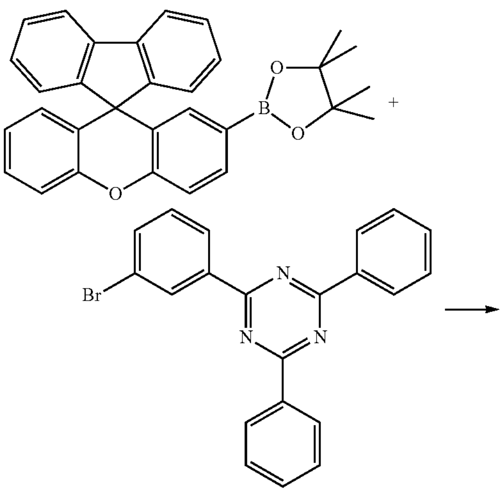

-continued

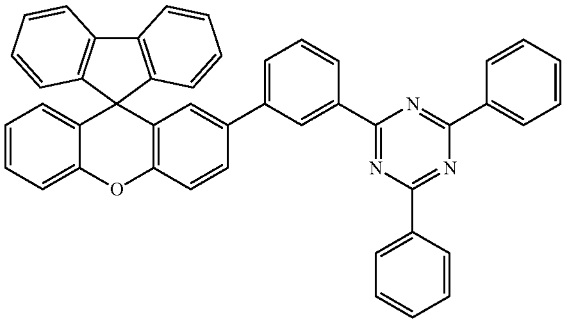

Compound 15 was prepared in the same manner as in Synthesis of Compound 14, except that 2-(3-bromophenyl)-4,6-diphenyl-1,3,5-triazine was used instead of 2-([1,1'-biphenyl]-4-yl)-4-chloro-6-phenyl-1,3,5-triazine.

MS[M+H]$^+$=640

Synthesis of Compound 16

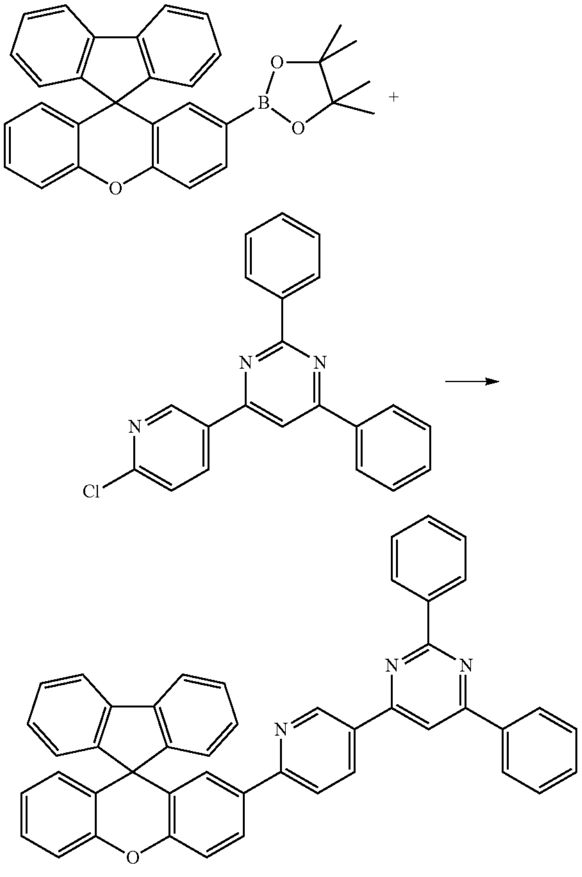

Compound 16 was prepared in the same manner as in Synthesis of Compound 14, except that 4-(6-chloro-pyridin-3-yl)-2,6-diphenylpyrimidine was used instead of 2-([1,1'-biphenyl]-4-yl)-4-chloro-6-phenyl-1,3,5-triazine.

MS[M+H]$^+$=640

Synthesis of Compound 17

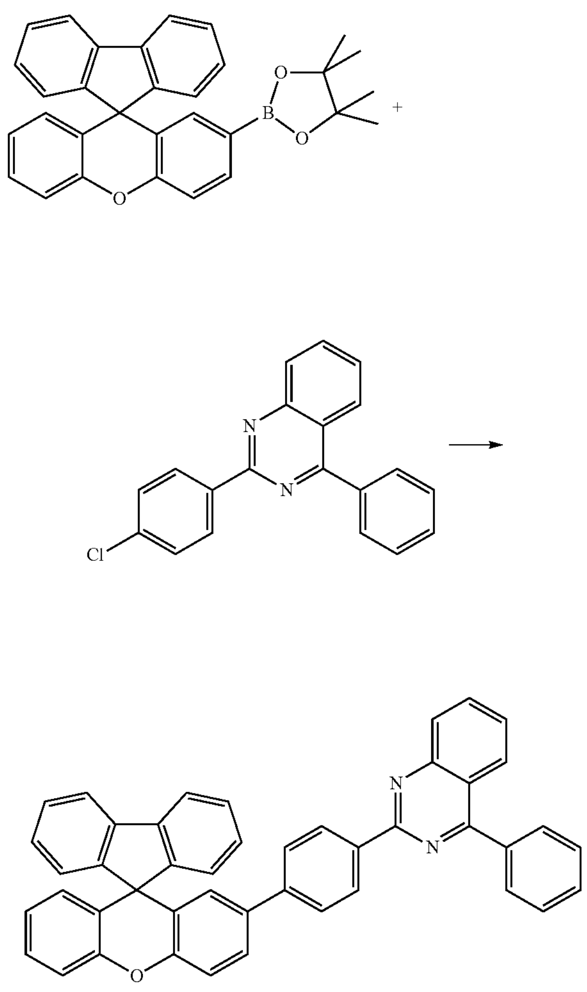

Compound 17 was prepared in the same manner as in Synthesis of Compound 14, except that 2-(4-chlorophenyl)-4-phenylquinazoline was used instead of 2-([1,1'-biphenyl]-4-yl)-4-chloro-6-phenyl-1,3,5-triazine.

MS[M+H]$^+$=613

Synthesis of Compound 18

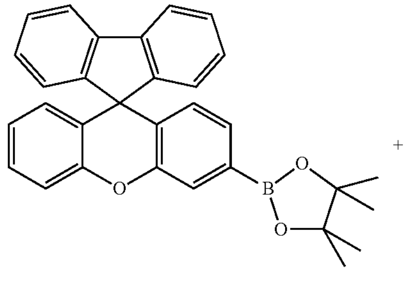

-continued

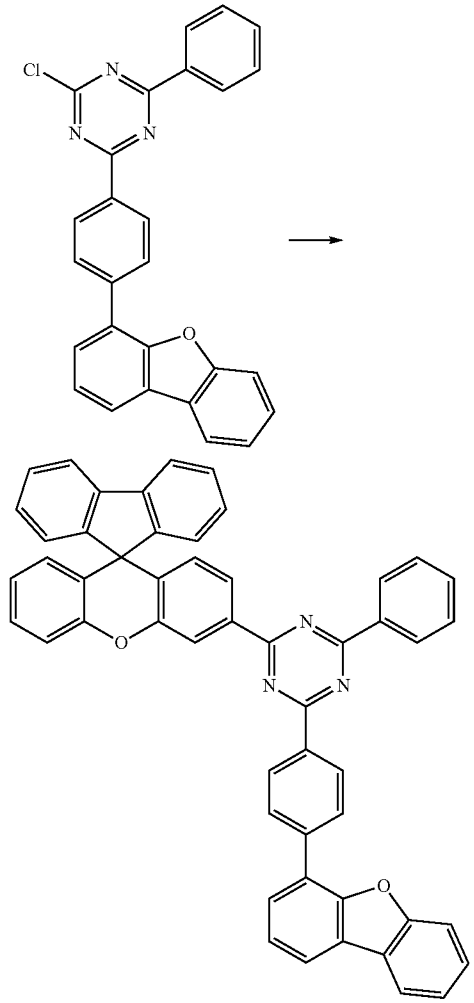

Compound 18 was prepared in the same manner as in Synthesis of Compound 14, except that 4,4,5,5-tetramethyl-2-(spiro[fluorene-9,9'-xanthen]-3'-yl)-1,3,2-dioxaborolane and 2-chloro-4-(4-(dibenzo[b,d]furan-4-yl)phenyl)-6-phenyl-1,3,5-triazine were used instead of 4,4,5,5-tetramethyl-2-(spiro[fluorene-9,9'-xanthen]-2'-yl)-1,3,2-dioxaborolane and 2-([1,1'-biphenyl]-4-yl)-4-chloro-6-phenyl-1,3,5-triazine, respectively.

MS[M+H]$^+$=730

Synthesis of Compound 19

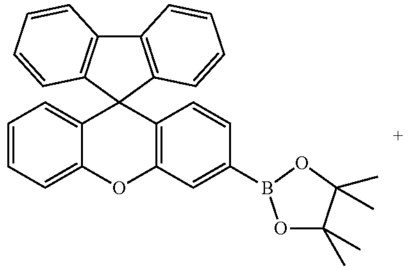

-continued

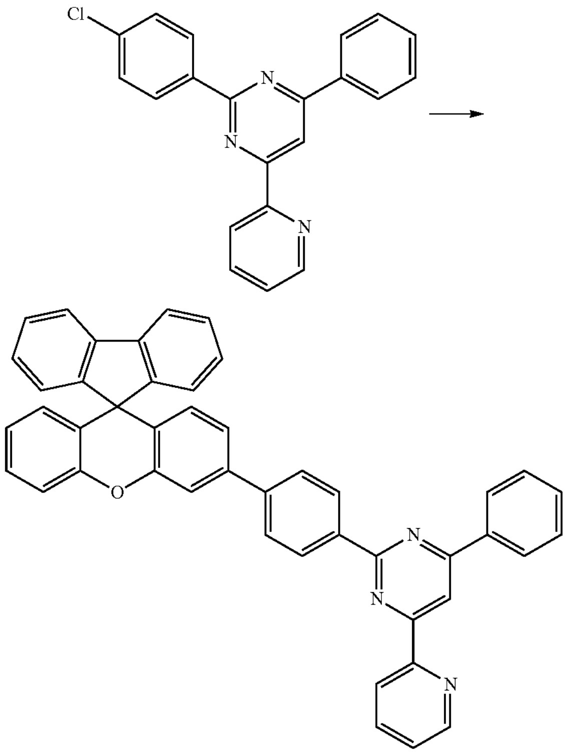

Compound 19 was prepared in the same manner as in Synthesis of Compound 18, except that 2-(4-chloro-phenyl)-4-phenyl-6-(pyridin-2-yl)pyrimidine was used instead of 2-chloro-4-(4-(dibenzo[b,d]furan-4-yl)phenyl)-6-phenyl-1,3,5-triazine.

MS[M+H]$^+$=640

Synthesis of Compound 20

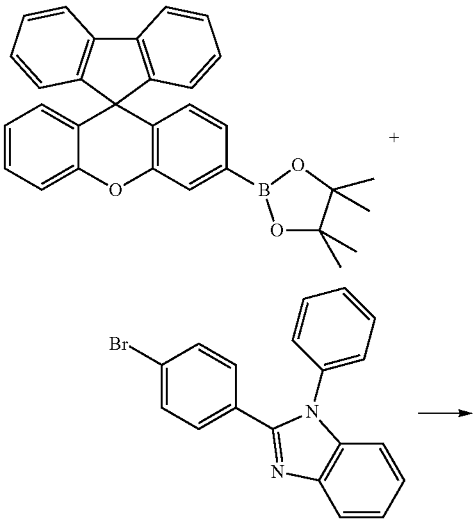

-continued

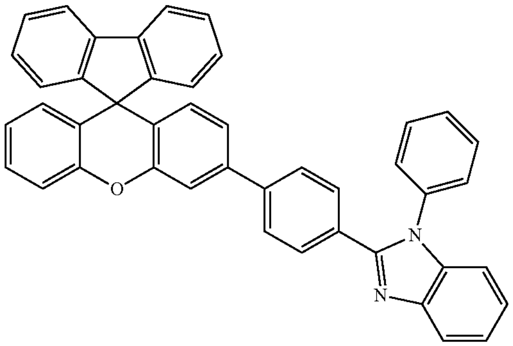

Compound 20 was prepared in the same manner as in Synthesis of Compound 18, except that 2-(4-bromophenyl)-1-phenyl-1H-benzo[d]imidazole was used instead of 2-chloro-4-(4-(dibenzo[b,d]furan-4-yl)phenyl)-6-phenyl-1,3,5-triazine.

MS[M+H]$^+$=601

Synthesis of Compound 21

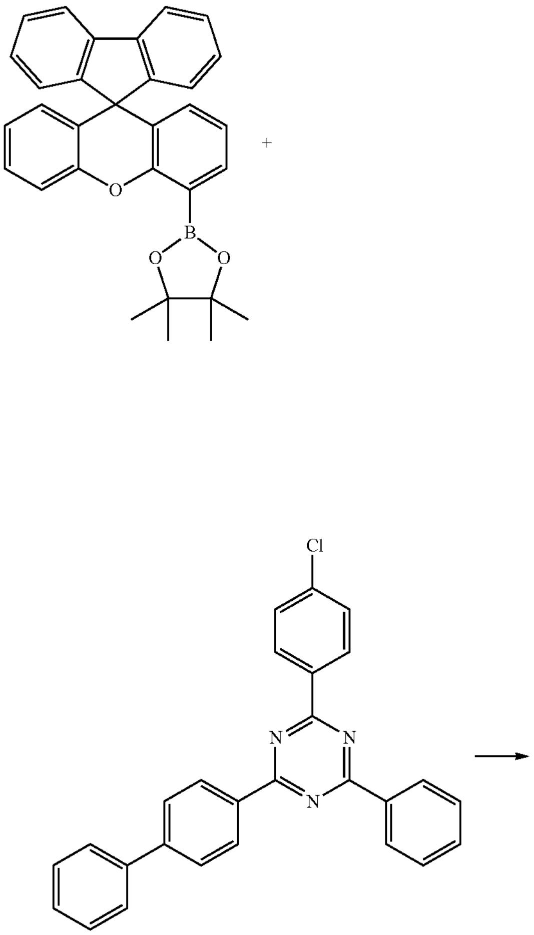

-continued

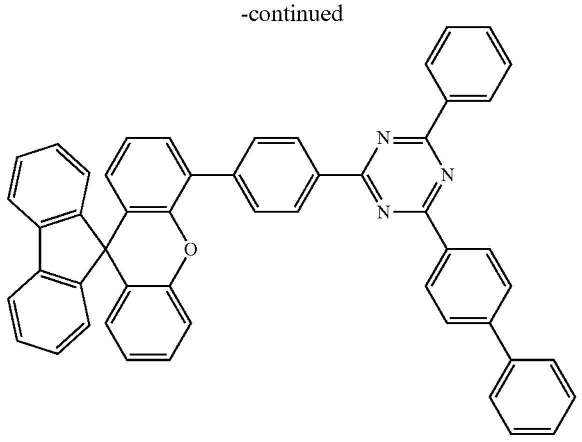

Compound 21 was prepared in the same manner as in Synthesis of Compound 14, except that 4,4,5,5-tetramethyl-2-(spiro[fluorene-9,9'-xanthen]-4'-yl)-1,3,2-dioxaborolane and 2-([1,1'-biphenyl]-4-yl)-4-(4-chlorophenyl)-6-phenyl-1,3,5-triazine were used instead of 4,4,5,5-tetramethyl-2-(spiro[fluorene-9,9'-xanthen]-2'-yl)-1,3,2-dioxaborolane and 2-([1,1'-biphenyl]-4-yl)-4-chloro-6-phenyl-1,3,5-triazine, respectively.

$MS[M+H]^+=716$

Synthesis of Compound 22

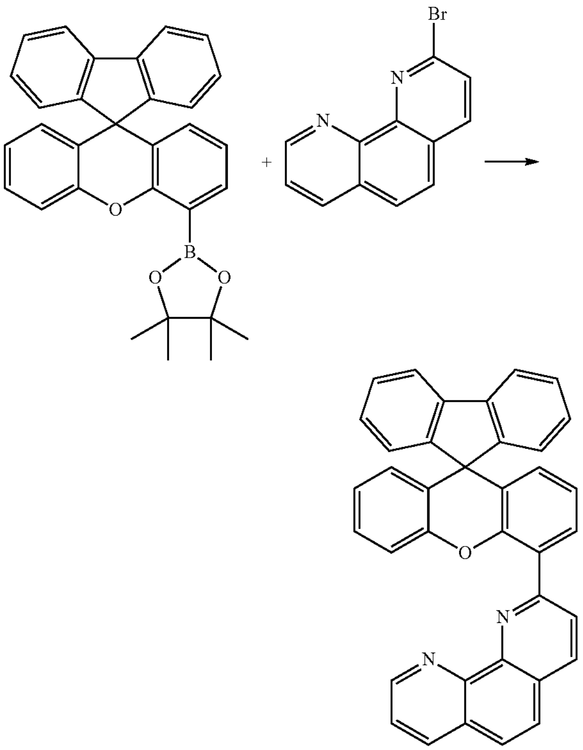

Compound 22 was prepared in the same manner as in Synthesis of Compound 21, except that 2-bromo-1,10-phenanthroline was used instead of 2-([1,1'-biphenyl]-4-yl)-4-(4-chlorophenyl)-6-phenyl-1,3,5-triazine.

$MS[M+H]^+=511$

Synthesis of Compound 23

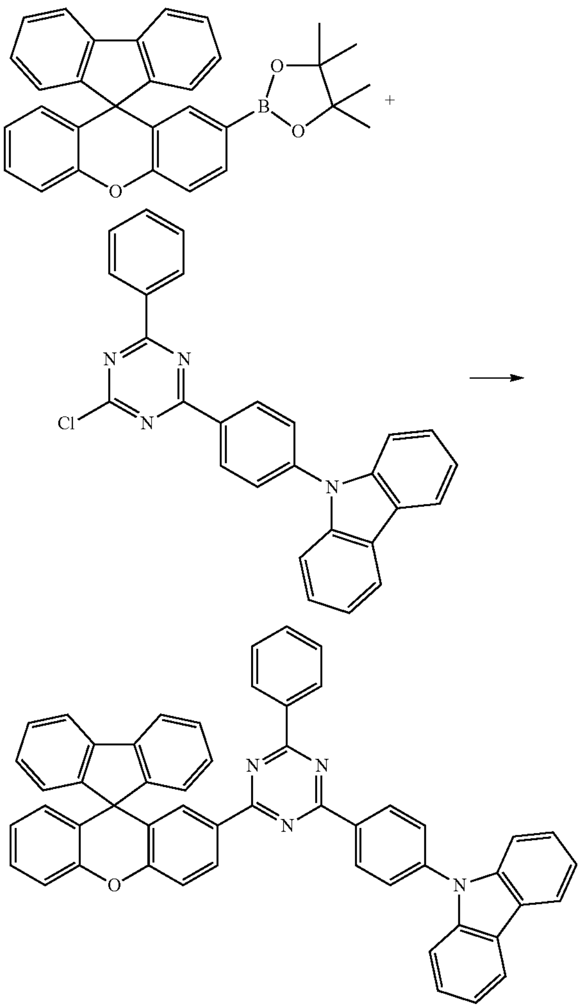

Compound 23 was prepared in the same manner as in Synthesis of Compound 14, except that 9-(4-(4-chloro-6-phenyl-1,3,5-triazin-2-yl)phenyl)-9H-carbazole was used instead of 2-([1,1'-biphenyl]-4-yl)-4-chloro-6-phenyl-1,3,5-triazine.

$MS[M+H]^+=729$

Synthesis of Compound 24

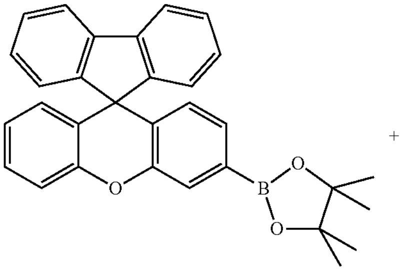

-continued

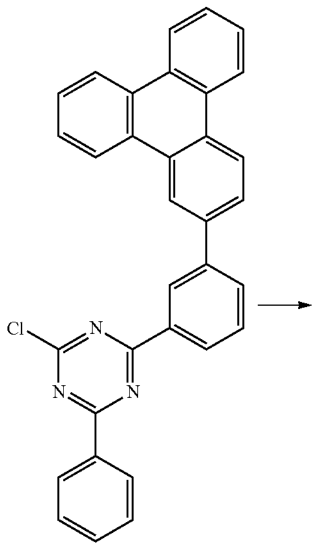

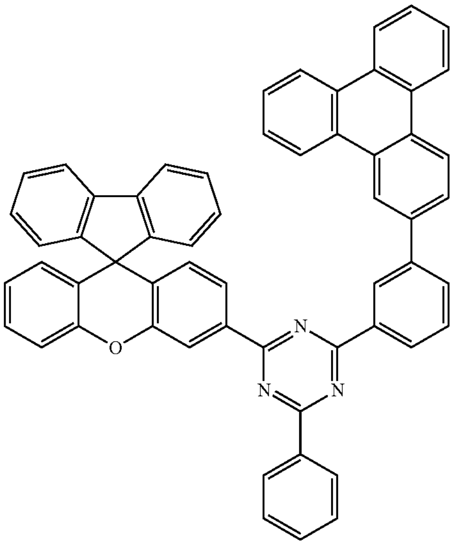

Compound 24 was prepared in the same manner as in Synthesis of Compound 18, except that 2-chloro-4-phenyl-6-(3-(triphenylen-2-yl)phenyl)-1,3,5-triazine was used instead of 2-chloro-4-(4-(dibenzo[b,d]furan-4-yl)phenyl)-6-phenyl-1,3,5-triazine.

MS[M+H]$^+$=790

Synthesis of Compound 25

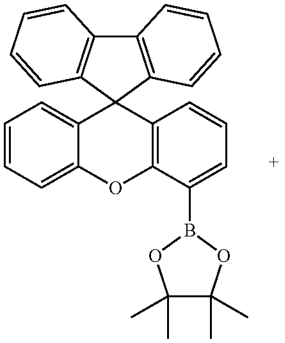

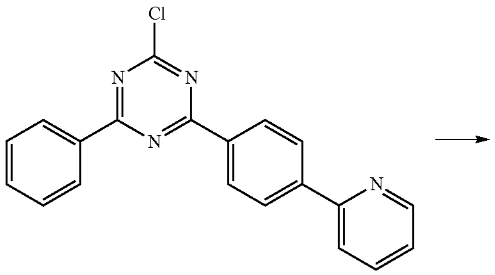

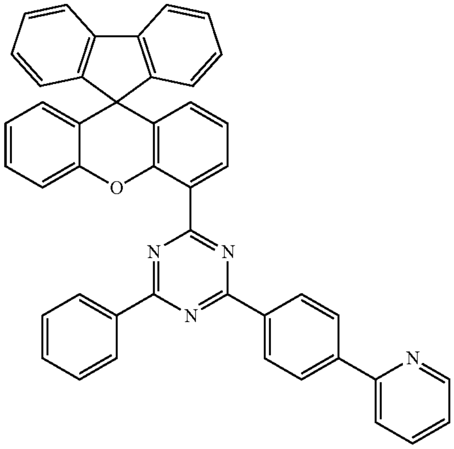

Compound 25 was prepared in the same manner as in Synthesis of Compound 21, except that 2-chloro-4-phenyl-6-(4-(pyridin-2-yl)phenyl)-1,3,5-triazine was used instead of 2-([1,1'-biphenyl]-4-yl)-4-(4-chlorophenyl)-6-phenyl-1,3,5-triazine.

MS[M+H]$^+$=641

Synthesis of Compound 26

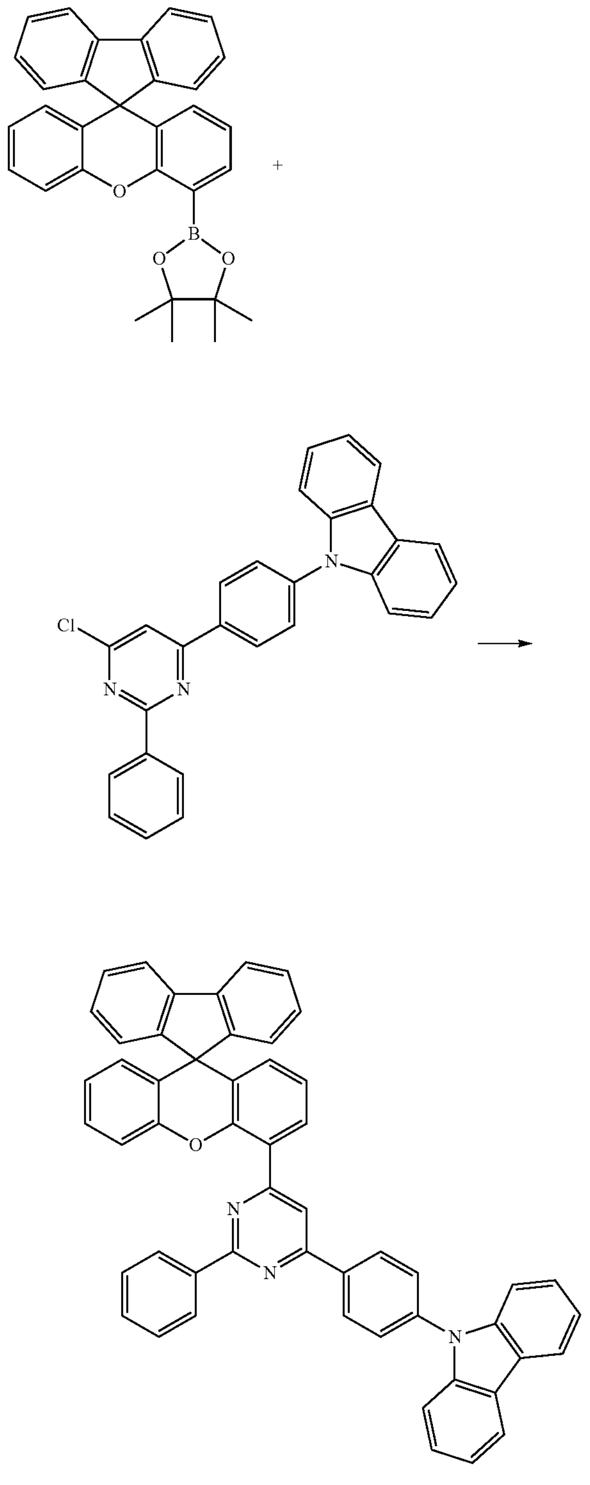 [SMILES: CC1(C)OB(c2cccc3c2Oc2ccccc2C32c3ccccc3-c3ccccc32)OC1(C)C ; Clc1cc(-c2ccc(-n3c4ccccc4c4ccccc43)cc2)nc(-c2ccccc2)n1 ; c1ccc(-c2nc(-c3ccc(-n4c5ccccc5c5ccccc54)cc3)cc(-c3cccc4c3Oc3ccccc3C43c4ccccc4-c4ccccc43)n2)cc1]

Compound 26 was prepared in the same manner as in Synthesis of Compound 21, except that 9-(4-(6-chloro-2-phenylpyridin-4-yl)phenyl)-9H-carbazole was used instead of 2-([1,1'-biphenyl]-4-yl)-4-(4-chlorophenyl)-6-phenyl-1,3,5-triazine.

MS$[M+H]^+$=728

Synthesis of Compound 27

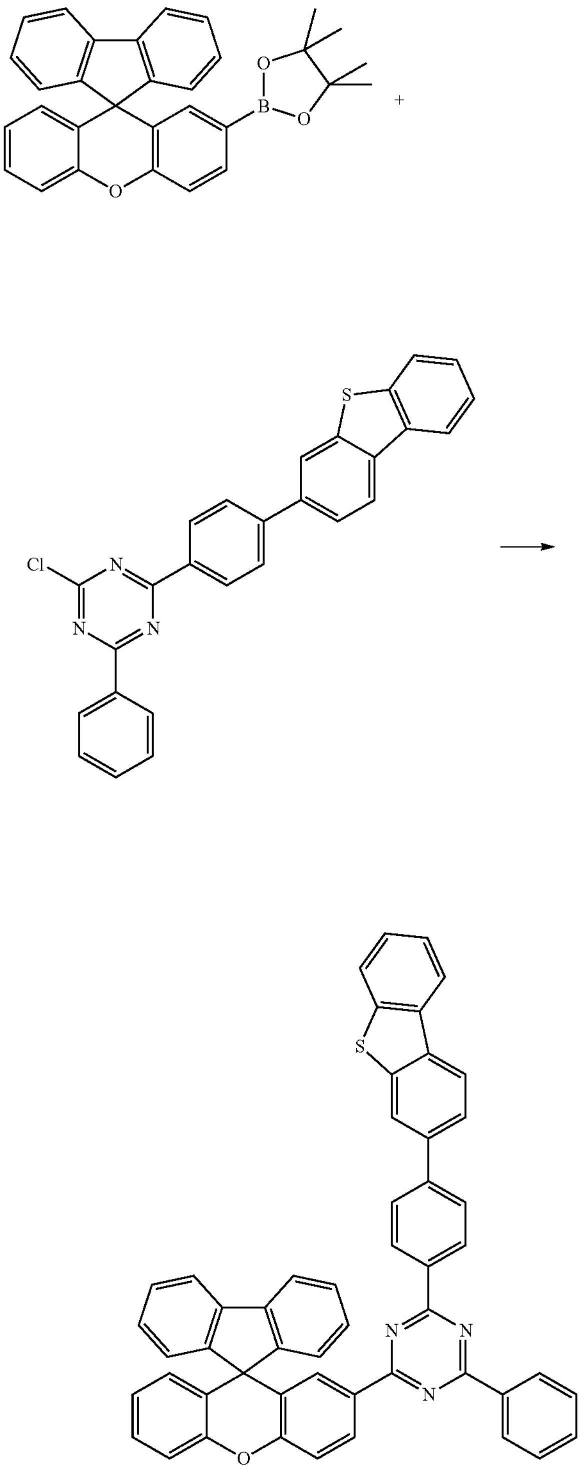

Compound 27 was prepared in the same manner as in Synthesis of Compound 14, except that 2-chloro-4-(4-(dibenzo[b,d]thiophene-3-yl)phenyl)-6-phenyl-1,3,5-triazine was used instead of 2-([1,1'-biphenyl]-4-yl)-4-chloro-6-phenyl-1,3,5-triazine.

MS$[M+H]^+$=746

Synthesis of Compound 28

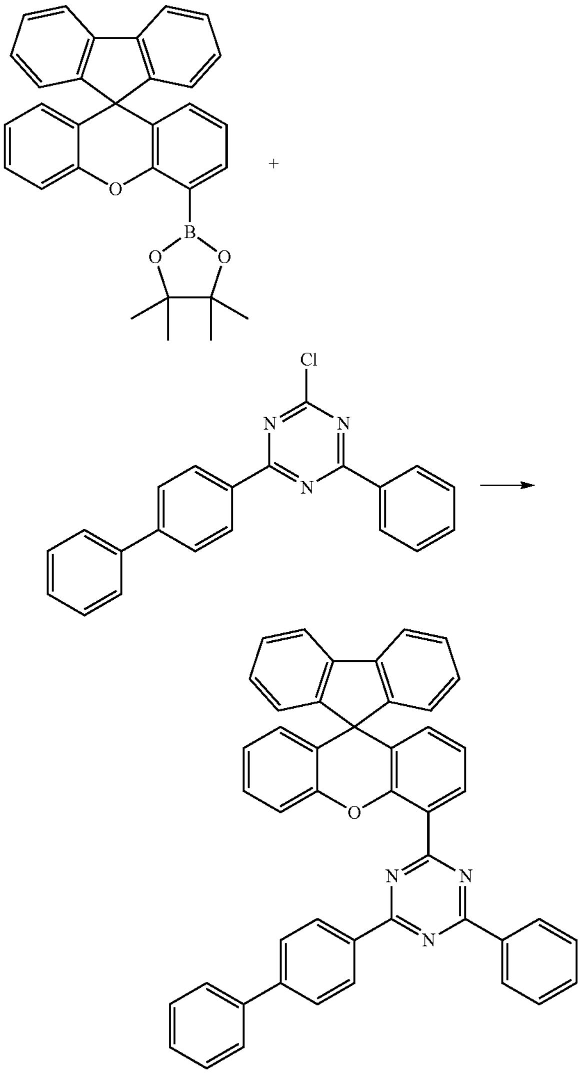

Compound 28 was prepared in the same manner as in Synthesis of Compound 21, except that 2-([1,1'-biphenyl]-4-yl)-4-chloro-6-phenyl-1,3,5-triazine was used instead of 2-([1,1'-biphenyl]-4-yl)-4-(4-chlorophenyl)-6-phenyl-1,3,5-triazine.

MS[M+H]$^+$=640

Synthesis of Compound 29

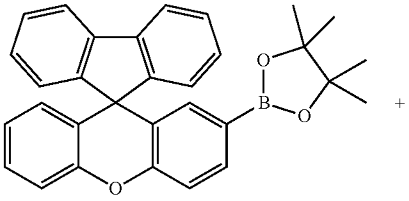

-continued

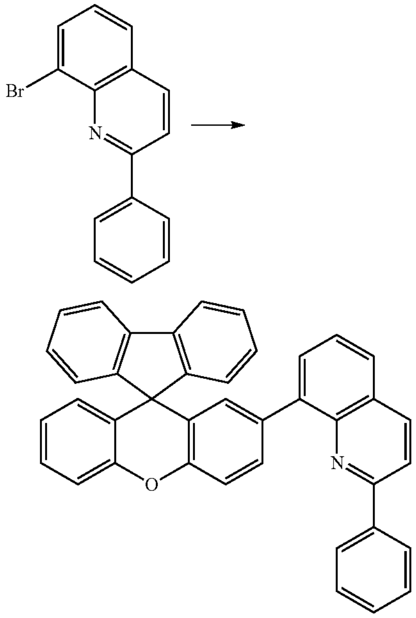

Compound 29 was prepared in the same manner as in Synthesis of Compound 14, except that each starting material was used as in the reaction formula.

MS[M+H]$^+$=536

Synthesis of Compound 30

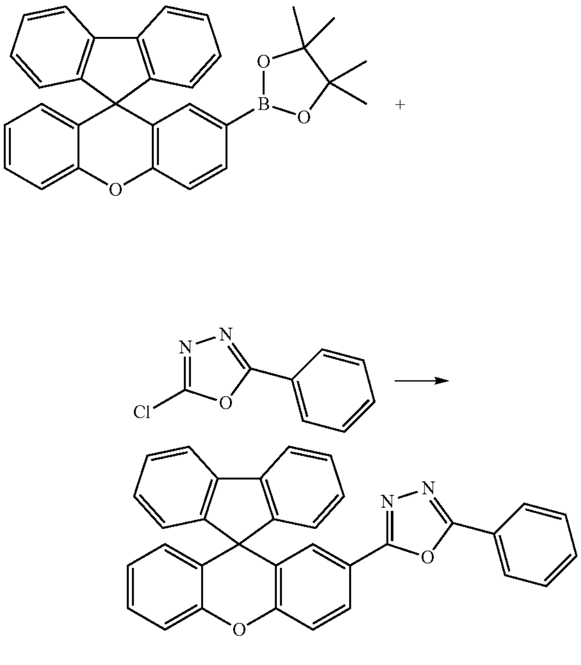

Compound 30 was prepared in the same manner as in Synthesis of Compound 14, except that each starting material was used as in the reaction formula.

MS[M+H]$^+$=477

Synthesis of Compound 31

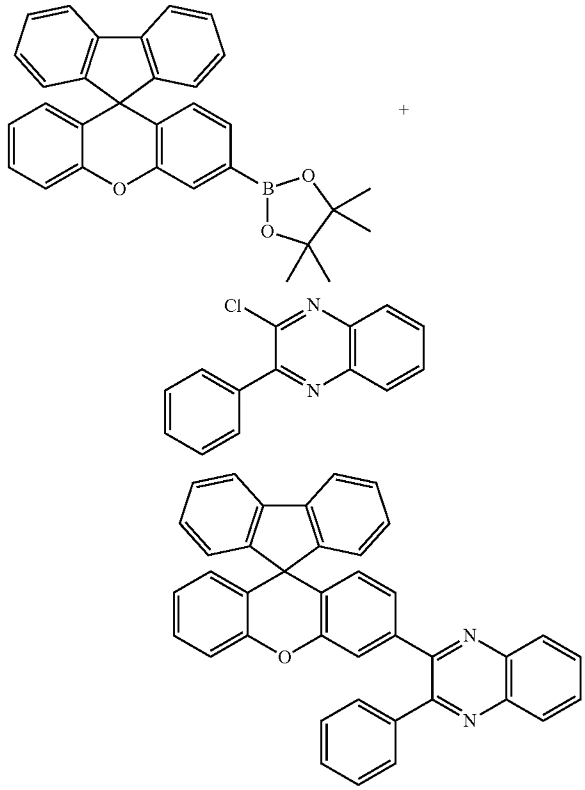

Compound 31 was prepared in the same manner as in Synthesis of Compound 18, except that each starting material was used as in the reaction formula.

MS[M+H]$^+$=537

Synthesis of Compound 32

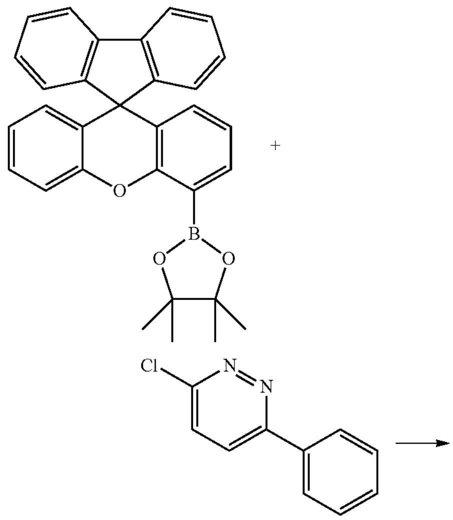

-continued

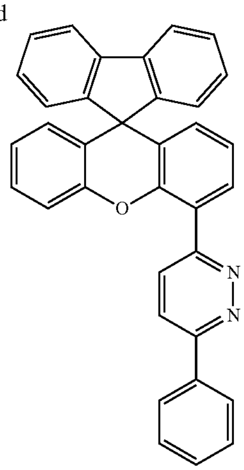

Compound 32 was prepared in the same manner as in Synthesis of Compound 21, except that each starting material was used as in the reaction formula.

MS[M+H]$^+$=487

Synthesis of Compound 33

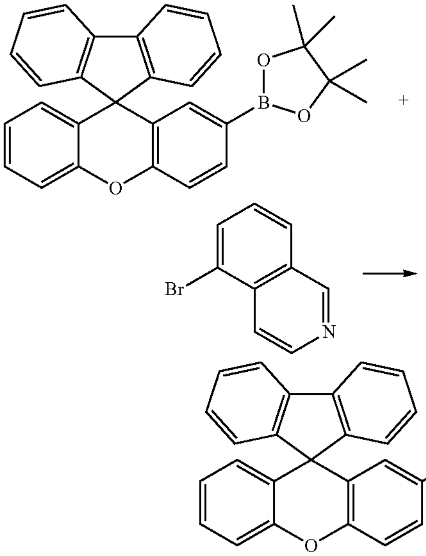

Compound 33 was prepared in the same manner as in Synthesis of Compound 14, except that each starting material was used as in the reaction formula.

MS[M+H]$^+$=460

Synthesis of Compound 34

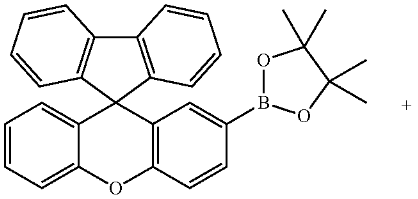

-continued

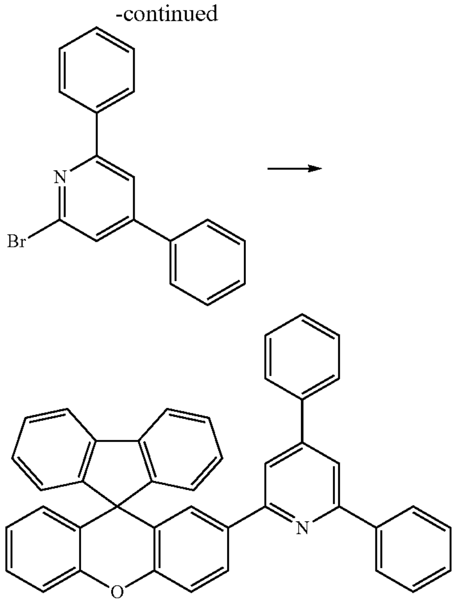

Compound 34 was prepared in the same manner as in Synthesis of Compound 14, except that each starting material was used as in the reaction formula.

MS[M+H]$^+$=562

Synthesis of Compound 35

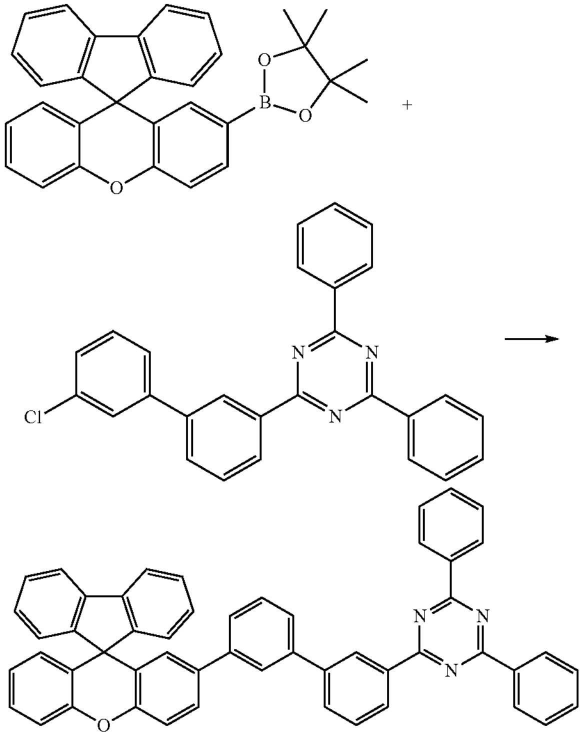

Compound 35 was prepared in the same manner as in Synthesis of Compound 14, except that each starting material was used as in the reaction formula.

MS[M+H]$^+$=716

Synthesis of Compound 36

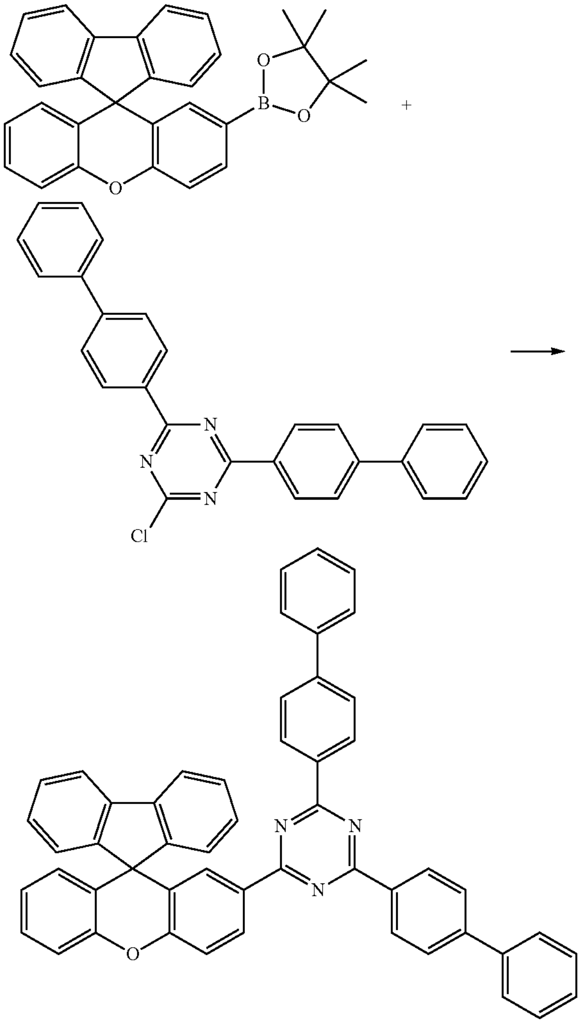

Compound 36 was prepared in the same manner as in Synthesis of Compound 14, except that each starting material was used as in the reaction formula.

MS[M+H]$^+$=716

Example 1

A glass substrate (Corning 7059 glass) thinly coated with indium tin oxide (ITO) to have a thickness of 1,000 Å was put into distilled water in which a detergent was dissolved, and ultrasonically washed. A product manufactured by Fischer Co., was used as the detergent, and distilled water twice filtered using a filter manufactured by Millipore Co., was used as the distilled water. After the ITO was washed for 30 minutes, ultrasonic washing was conducted twice repeatedly using distilled water for 10 minutes. After the washing using distilled water was completed, ultrasonic washing was conducted using isopropyl alcohol, acetone, and methanol solvents in this order, and drying was then conducted.

HI1 (hexanitrile hexaazatriphenylene) shown below was thermally vacuum deposited to have a thickness of 500 Å on a transparent ITO electrode thus prepared, thereby forming a hole injection layer. HT1 (1,100 Å), shown below and which is a material for transporting holes, was vacuum deposited thereon, and then Compound 1 synthesized in Preparation Example 1 was vacuum deposited to have a film thickness of 100 Å on the hole transport layer, thereby forming a hole adjusting layer. As a light emitting layer, a compound of host BH1 and dopant BD1 (25:1), both shown below, was vacuum deposited to have a thickness of 300 Å. Next, Compound 14 (50 Å) synthesized in Preparation Example 2 was formed as an electron adjusting layer, and then Compound ET1 (300 Å), shown below, and LiQ were deposited at a ratio of 2:1, thereby being sequentially thermally vacuum deposited as an electron transport layer. A negative electrode was formed by sequentially depositing lithium fluoride (LiF) and aluminum to have a thickness of 12 Å and 2,000 Å, respectively, on the electron transport layer, thereby manufacturing an organic light emitting device.

In the aforementioned procedure, the deposition rates of the organic material, lithium fluoride, and aluminum were maintained at 1 Å/sec, 0.2 Å/sec, and 3 to 7 Å/sec, respectively.

HI1

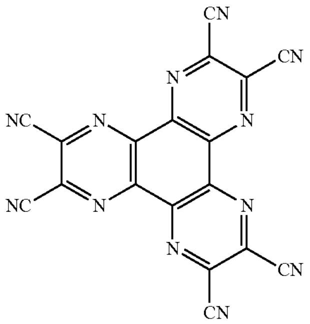

HI2

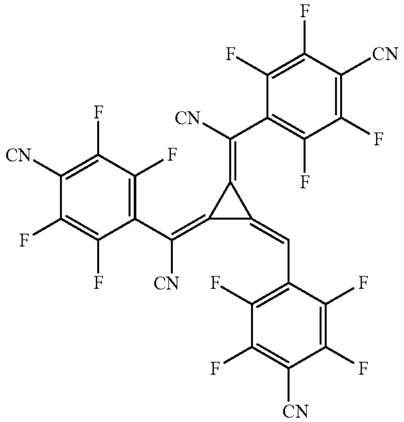

-continued

HT1

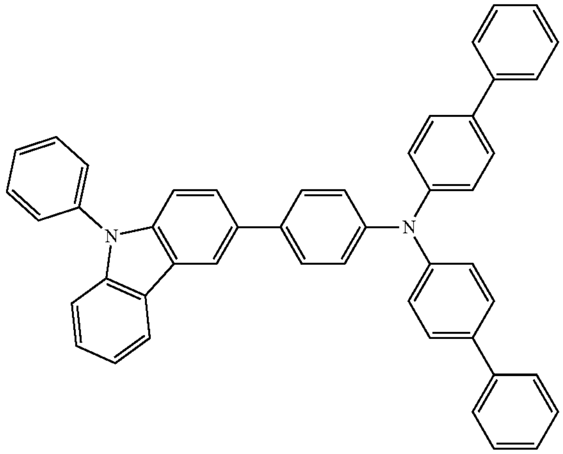

HT2

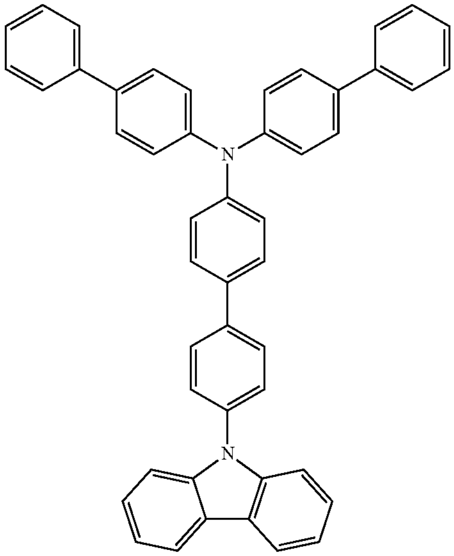

HT3

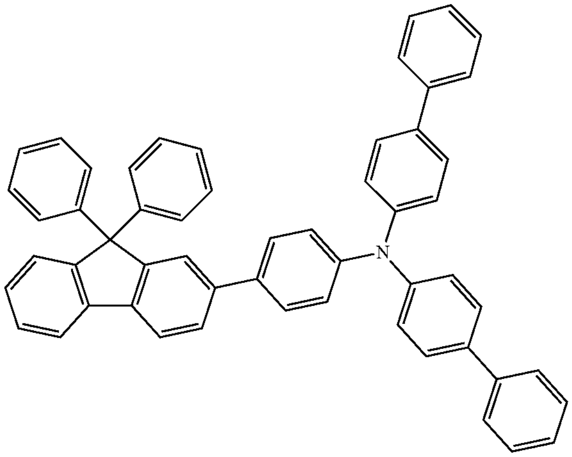

-continued

BH1

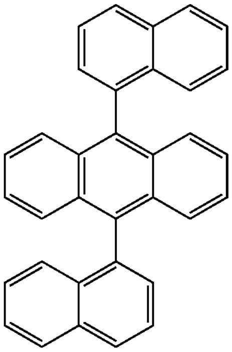

BD1

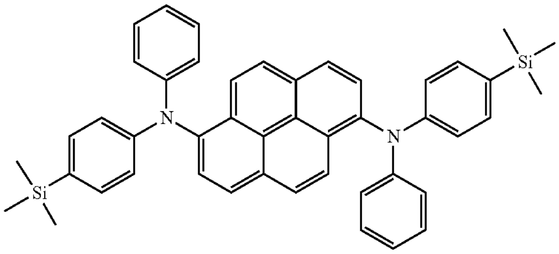

ET1

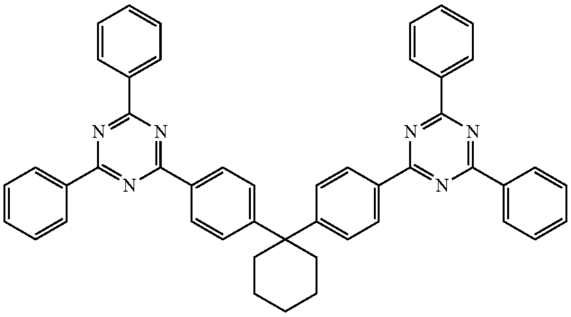

ET2

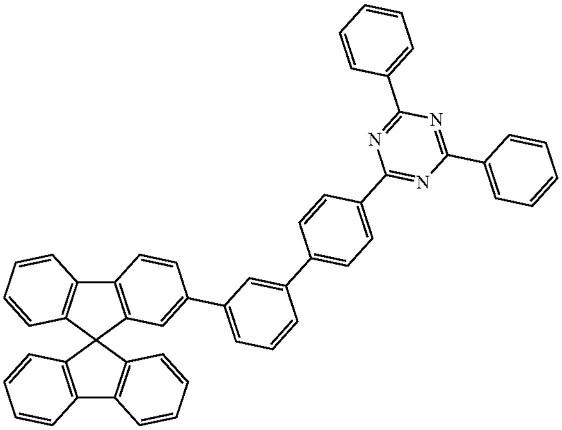

-continued

ET3

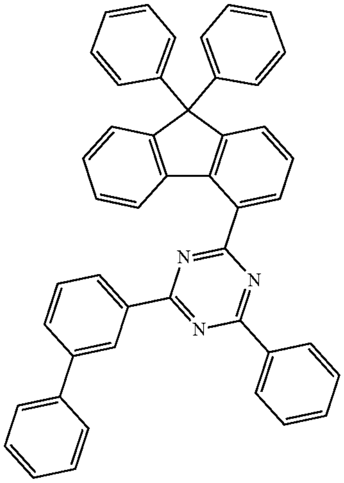

The results of experimenting an organic light emitting device manufactured by using each compound as a hole adjusting layer material and an electron adjusting layer material as in Examples 1 to 54 and Comparative Examples 1 to 6 of Tables 1 to 3 are shown in Tables 1 to 3.

TABLE 1

| Experimental Example 20 mA/cm² | Hole adjusting layer | Electron adjusting layer | Voltage (V) @20 mA/cm² | Cd/A @20 mA/cm² | Color coordinate (x, y) | Service life (T95, h) @20 mA/cm² |
|---|---|---|---|---|---|---|
| Example 1 | Compound 1 | Compound 14 | 3.51 | 6.71 | (0.135, 0.138) | 49.0 |
| Example 2 | Compound 1 | Compound 15 | 3.45 | 6.63 | (0.134, 0.137) | 50.2 |
| Example 3 | Compound 1 | Compound 19 | 3.41 | 6.58 | (0.135, 0.138) | 55.2 |
| Example 4 | Compound 1 | Compound 20 | 3.34 | 6.82 | (0.134, 0.138) | 51.2 |
| Example 5 | Compound 1 | Compound 25 | 3.42 | 6.72 | (0.136, 0.139) | 48.9 |
| Example 6 | Compound 1 | Compound 28 | 3.31 | 6.52 | (0.135, 0.138) | 48.5 |
| Example 7 | Compound 1 | Compound 33 | 3.50 | 6.69 | (0.133, 0.139) | 49.1 |
| Example 8 | Compound 2 | Compound 15 | 3.41 | 6.58 | (0.135, 0.138) | 55.2 |
| Example 9 | Compound 2 | Compound 18 | 3.34 | 6.82 | (0.134, 0.138) | 51.2 |
| Example 10 | Compound 2 | Compound 20 | 3.42 | 6.72 | (0.136, 0.139) | 48.9 |
| Example 11 | Compound 2 | Compound 22 | 3.41 | 6.77 | (0.134, 0.139) | 28.1 |
| Example 12 | Compound 2 | Compound 23 | 3.48 | 6.81 | (0.135, 0.138) | 21.0 |
| Example 13 | Compound 2 | Compound 31 | 3.42 | 6.75 | (0.134, 0.138) | 33.0 |
| Example 14 | Compound 3 | Compound 16 | 3.41 | 6.78 | (0.135, 0.138) | 55.2 |
| Example 15 | Compound 3 | Compound 17 | 3.35 | 6.77 | (0.134, 0.138) | 52.0 |
| Example 16 | Compound 3 | Compound 21 | 3.44 | 6.71 | (0.136, 0.139) | 50.0 |
| Example 17 | Compound 3 | Compound 26 | 3.38 | 6.69 | (0.136, 0.139) | 52.0 |

TABLE 2

| Experimental Example 20 mA/cm$^2$ | Hole adjusting layer | Electron adjusting layer | Voltage (V) @20 mA/cm$^2$ | Cd/A @20 mA/cm$^2$ | Color coordinate (x, y) | Service life (T95, h) @20 mA/cm$^2$ |
|---|---|---|---|---|---|---|
| Example 18 | Compound 3 | Compound 28 | 3.33 | 6.89 | (0.135, 0.138) | 52.0 |
| Example 19 | Compound 3 | Compound 30 | 3.52 | 6.79 | (0.134, 0.138) | 48.0 |
| Example 20 | Compound 3 | Compound 32 | 3.44 | 6.67 | (0.134, 0.138) | 46.8 |
| Example 21 | Compound 3 | Compound 33 | 3.45 | 6.58 | (0.137, 0.134) | 47.1 |
| Example 22 | Compound 4 | Compound 19 | 3.52 | 6.87 | (0.138, 0.138) | 42.5 |
| Example 23 | Compound 4 | Compound 24 | 3.38 | 6.82 | (0.135, 0.139) | 46.5 |
| Example 24 | Compound 4 | Compound 25 | 3.39 | 6.81 | (0.135, 0.138) | 49.7 |
| Example 25 | Compound 4 | Compound 26 | 3.51 | 6.71 | (0.135, 0.139) | 50.1 |
| Example 26 | Compound 4 | Compound 29 | 3.45 | 6.63 | (0.134, 0.138) | 49.8 |
| Example 27 | Compound 4 | Compound 33 | 3.41 | 6.58 | (0.134, 0.138) | 47.4 |
| Example 28 | Compound 4 | Compound 35 | 3.39 | 6.81 | (0.135, 0.138) | 49.7 |
| Example 29 | Compound 5 | Compound 16 | 3.45 | 6.66 | (0.134, 0.138) | 49.8 |
| Example 30 | Compound 5 | Compound 20 | 3.45 | 6.57 | (0.134, 0.138) | 47.4 |
| Example 31 | Compound 5 | Compound 27 | 3.41 | 6.66 | (0.134, 0.138) | 47.2 |
| Example 32 | Compound 5 | Compound 29 | 3.45 | 6.61 | (0.134, 0.138) | 49.8 |
| Example 33 | Compound 5 | Compound 30 | 3.41 | 6.77 | (0.134, 0.138) | 51.0 |
| Example 34 | Compound 5 | Compound 32 | 3.39 | 6.82 | (0.135, 0.138) | 49.7 |
| Example 35 | Compound 5 | Compound 36 | 3.51 | 6.72 | (0.135, 0.139) | 50.1 |

TABLE 3

| Experimental Example 20 mA/cm$^2$ | Hole adjusting layer | Electron adjusting layer | Voltage (V) @20 mA/cm$^2$ | Cd/A @20 mA/cm$^2$ | Color coordinate (x, y) | Service life (T95, h) @20 mA/cm$^2$ |
|---|---|---|---|---|---|---|
| Example 36 | Compound 6 | Compound 15 | 3.48 | 6.70 | (0.135, 0.138) | 50.0 |
| Example 37 | Compound 6 | Compound 19 | 3.52 | 6.76 | (0.134, 0.137) | 51.2 |
| Example 38 | Compound 6 | Compound 22 | 3.36 | 6.71 | (0.135, 0.138) | 54.0 |
| Example 39 | Compound 6 | Compound 24 | 3.44 | 6.59 | (0.134, 0.138) | 53.2 |
| Example 40 | Compound 6 | Compound 27 | 3.48 | 6.81 | (0.136, 0.139) | 55.0 |
| Example 41 | Compound 6 | Compound 31 | 3.56 | 6.66 | (0.135, 0.138) | 50.8 |
| Example 42 | Compound 6 | Compound 36 | 3.44 | 6.61 | (0.133, 0.139) | 51.4 |
| Example 43 | Compound 7 | Compound 14 | 3.41 | 6.71 | (0.135, 0.138) | 53.8 |
| Example 44 | Compound 7 | Compound 16 | 3.48 | 6.70 | (0.134, 0.138) | 54.0 |
| Example 45 | Compound 7 | Compound 18 | 3.57 | 6.81 | (0.136, 0.139) | 55.0 |
| Example 46 | Compound 7 | Compound 20 | 3.65 | 6.67 | (0.134, 0.139) | 59.5 |
| Example 47 | Compound 7 | Compound 26 | 3.66 | 6.65 | (0.135, 0.138) | 51.8 |

TABLE 3-continued

| Experimental Example 20 mA/cm$^2$ | Hole adjusting layer | Electron adjusting layer | Voltage (V) @20 mA/cm$^2$ | Cd/A @20 mA/cm$^2$ | Color coordinate (x, y) | Service life (T95, h) @20 mA/cm$^2$ |
|---|---|---|---|---|---|---|
| Example 48 | Compound 7 | Compound 29 | 3.51 | 6.48 | (0.134, 0.138) | 57.4 |
| Example 49 | Compound 7 | Compound 30 | 3.52 | 6.55 | (0.136, 0.139) | 60.0 |
| Example 50 | Compound 7 | Compound 33 | 3.49 | 6.57 | (0.134, 0.137) | 58.1 |
| Example 51 | Compound 8 | Compound 16 | 3.61 | 6.47 | (0.135, 0.138) | 59.1 |
| Example 52 | Compound 8 | Compound 18 | 3.55 | 6.78 | (0.134, 0.138) | 60.1 |
| Example 53 | Compound 8 | Compound 28 | 3.41 | 6.69 | (0.136, 0.139) | 54.8 |
| Example 54 | Compound 8 | Compound 29 | 3.39 | 6.70 | (0.136, 0.139) | 55.0 |
| Comparative Example 1 | HT2 | ET2 | 3.90 | 5.78 | (0.136, 0.139) | 48.9 |
| Comparative Example 21 | HT2 | ET3 | 3.88 | 5.48 | (0.135, 0.138) | 48.5 |
| Comparative Example 3 | HT3 | ET2 | 3.87 | 5.61 | (0.133, 0.139) | 49.1 |
| Comparative Example 4 | HT3 | ET3 | 3.90 | 5.31 | (0.134, 0.137) | 50.2 |
| Comparative Example 5 | Compound 3 | ET2 | 3.84 | 5.48 | (0.133, 0.139) | 49.1 |
| Comparative Example 6 | HT3 | Compound 20 | 3.88 | 5.53 | (0.134, 0.137) | 50.2 |

Example 55

A glass substrate (Corning 7059 glass) thinly coated with indium tin oxide (ITO) to have a thickness of 1,000 Å was put into distilled water in which a detergent was dissolved, and ultrasonically washed. A product manufactured by Fischer Co., was used as the detergent, and distilled water twice filtered using a filter manufactured by Millipore Co., was used as the distilled water. After the ITO was washed for 30 minutes, ultrasonic washing was conducted twice repeatedly using distilled water for 10 minutes. After the washing using distilled water was completed, ultrasonic washing was conducted using isopropyl alcohol, acetone, and methanol solvents in this order, and drying was then conducted.

HI2 and HT1 were doped at a ratio of (2:100) and thermally vacuum deposited to have a thickness of 100 Å on a transparent ITO electrode thus prepared, thereby forming a hole injection layer. HT1 (1,100 Å), which is a material for transporting holes, was vacuum deposited thereon, and then Compound 8 synthesized in Preparation Example 1 was vacuum deposited to have a film thickness of 100 Å on the hole transport layer, thereby forming a hole adjusting layer. As a light emitting layer, a compound of host BH1 and dopant BD1 (25:1) was vacuum deposited to have a thickness of 300 Å. Example 2 was formed as an electron adjusting layer, and then Compound ET1 (300 Å) and LiQ were deposited at a ratio of 2:1, thereby being sequentially thermally vacuum deposited as an electron transport layer. A negative electrode was formed by sequentially depositing lithium fluoride (LiF) and aluminum to have a thickness of 12 Å and 2,000 Å, respectively, on the electron transport layer, thereby manufacturing an organic light emitting device.

In the aforementioned procedure, the deposition rates of the organic material, lithium fluoride, and aluminum were maintained at 1 Å/sec, 0.2 Å/sec, and 3 to 7 Å/sec, respectively.

The results of experimental organic light emitting devices manufactured by using each compound as a hole adjusting layer material and an electron adjusting layer material as in Examples 55 to 95 and Comparative Examples 7 to 18 of Tables 4 to 6 are shown in Tables 4 to 6.

TABLE 4

| Experimental Example 20 mA/cm$^2$ | Hole adjusting layer | Electron adjusting layer | Voltage (V) @20 mA/cm$^2$ | Cd/A @20 mA/cm$^2$ | Color coordinate (x, y) | Service life (T95, h) @20 mA/cm$^2$ |
|---|---|---|---|---|---|---|
| Example 55 | Compound 8 | Compound 30 | 3.52 | 6.71 | (0.135, 0.138) | 51.0 |
| Example 56 | Compound 8 | Compound 32 | 3.48 | 6.63 | (0.134, 0.137) | 55.0 |
| Example 57 | Compound 8 | Compound 33 | 3.55 | 6.58 | (0.135, 0.138) | 53.1 |
| Example 58 | Compound 9 | Compound 16 | 3.42 | 6.72 | (0.136, 0.139) | 55.0 |
| Example 59 | Compound 9 | Compound 17 | 3.48 | 6.52 | (0.135, 0.138) | 51.0 |
| Example 60 | Compound 9 | Compound 22 | 3.34 | 6.69 | (0.133, 0.139) | 51.8 |
| Example 61 | Compound 9 | Compound 27 | 3.49 | 6.63 | (0.134, 0.137) | 55.8 |
| Example 62 | Compound 9 | Compound 28 | 3.41 | 6.58 | (0.135, 0.138) | 54.8 |
| Example 63 | Compound 9 | Compound 30 | 3.55 | 6.82 | (0.134, 0.138) | 55.9 |
| Example 64 | Compound 9 | Compound 31 | 3.48 | 6.72 | (0.136, 0.139) | 55.1 |
| Example 65 | Compound 9 | Compound 33 | 3.40 | 5.70 | (0.134, 0.139) | 54.9 |
| Example 66 | Compound 10 | Compound 20 | 3.33 | 5.81 | (0.135, 0.138) | 53.4 |
| Example 67 | Compound 10 | Compound 21 | 3.46 | 5.66 | (0.134, 0.138) | 55.1 |
| Example 68 | Compound 10 | Compound 23 | 3.63 | 5.82 | (0.136, 0.139) | 54.8 |
| Example 69 | Compound 10 | Compound 25 | 3.55 | 6.62 | (0.134, 0.137) | 53.3 |
| Example 70 | Compound 10 | Compound 27 | 3.59 | 6.41 | (0.135, 0.138) | 52.8 |
| Example 71 | Compound 10 | Compound 30 | 3.52 | 6.77 | (0.134, 0.138) | 56.3 |
| Example 72 | Compound 10 | Compound 34 | 3.48 | 6.71 | (0.136, 0.139) | 55.0 |

TABLE 5

| Experimental Example 20 mA/cm$^2$ | Hole adjusting layer | Electron adjusting layer | Voltage (V) @20 mA/cm$^2$ | Cd/A @20 mA/cm$^2$ | Color coordinate (x, y) | Service life (T95, h) @20 mA/cm$^2$ |
|---|---|---|---|---|---|---|
| Example 73 | Compound 11 | Compound 14 | 3.51 | 6.71 | (0.135, 0.138) | 49.0 |
| Example 74 | Compound 11 | Compound 16 | 3.45 | 6.76 | (0.134, 0.137) | 50.2 |
| Example 75 | Compound 11 | Compound 18 | 3.41 | 6.58 | (0.135, 0.138) | 55.2 |

TABLE 5-continued

| Experimental Example 20 mA/cm$^2$ | Hole adjusting layer | Electron adjusting layer | Voltage (V) @20 mA/cm$^2$ | Cd/A @20 mA/cm$^2$ | Color coordinate (x, y) | Service life (T95, h) @20 mA/cm$^2$ |
|---|---|---|---|---|---|---|
| Example 76 | Compound 11 | Compound 20 | 3.44 | 6.66 | (0.134, 0.138) | 51.2 |
| Example 77 | Compound 11 | Compound 21 | 3.42 | 6.72 | (0.136, 0.139) | 48.9 |
| Example 78 | Compound 11 | Compound 27 | 3.31 | 6.81 | (0.135, 0.138) | 48.5 |
| Example 79 | Compound 11 | Compound 30 | 3.48 | 6.69 | (0.133, 0.139) | 49.1 |
| Example 80 | Compound 11 | Compound 31 | 3.45 | 6.52 | (0.134, 0.137) | 50.2 |
| Example 81 | Compound 12 | Compound 18 | 3.57 | 6.58 | (0.135, 0.138) | 55.2 |
| Example 82 | Compound 12 | Compound 19 | 3.34 | 6.82 | (0.134, 0.138) | 51.2 |
| Example 83 | Compound 12 | Compound 21 | 3.42 | 6.72 | (0.136, 0.139) | 48.9 |
| Example 84 | Compound 12 | Compound 24 | 3.82 | 5.70 | (0.134, 0.139) | 28.1 |
| Example 85 | Compound 12 | Compound 28 | 3.94 | 6.67 | (0.135, 0.138) | 21.0 |
| Example 86 | Compound 12 | Compound 29 | 3.52 | 6.81 | (0.134, 0.138) | 33.0 |
| Example 87 | Compound 12 | Compound 33 | 3.88 | 6.65 | (0.136, 0.139) | 28.0 |
| Example 88 | Compound 13 | Compound 16 | 3.41 | 6.41 | (0.135, 0.138) | 55.2 |
| Example 89 | Compound 13 | Compound 20 | 3.35 | 6.77 | (0.134, 0.138) | 52.0 |
| Example 90 | Compound 13 | Compound 23 | 3.31 | 6.71 | (0.136, 0.139) | 50.0 |
| Example 91 | Compound 13 | Compound 26 | 3.38 | 6.70 | (0.136, 0.139) | 52.0 |

TABLE 6

| Experimental Example 20 mA/cm$^2$ | Hole adjusting layer | Electron adjusting layer | Voltage (V) @20 mA/cm$^2$ | Cd/A @20 mA/cm$^2$ | Color coordinate (x, y) | Service life (T95, h) @20 mA/cm$^2$ |
|---|---|---|---|---|---|---|
| Example 92 | Compound 13 | Compound 29 | 3.51 | 6.71 | (0.135, 0.138) | 49.0 |
| Example 93 | Compound 13 | Compound 30 | 3.45 | 6.58 | (0.134, 0.137) | 50.2 |
| Example 94 | Compound 13 | Compound 31 | 3.41 | 6.52 | (0.135, 0.138) | 55.2 |
| Example 95 | Compound 13 | Compound 36 | 3.34 | 6.79 | (0.134, 0.138) | 51.2 |
| Comparative Example 7 | HT2 | ET2 | 3.88 | 5.82 | (0.136, 0.139) | 48.9 |
| Comparative Example 8 | HT2 | ET3 | 3.79 | 5.68 | (0.135, 0.138) | 48.5 |
| Comparative Example 9 | HT3 | ET2 | 3.86 | 5.45 | (0.133, 0.139) | 49.1 |
| Comparative Example 10 | HT3 | ET3 | 3.81 | 5.55 | (0.134, 0.137) | 50.2 |
| Comparative Example 11 | HT2 | Compound 16 | 3.55 | 5.61 | (0.135, 0.138) | 55.2 |
| Comparative | HT2 | Compound 31 | 3.61 | 5.78 | (0.134, 0.138) | 51.2 |

TABLE 6-continued

| Experimental Example 20 mA/cm$^2$ | Hole adjusting layer | Electron adjusting layer | Voltage (V) @20 mA/cm$^2$ | Cd/A @20 mA/cm$^2$ | Color coordinate (x, y) | Service life (T95, h) @20 mA/cm$^2$ |
|---|---|---|---|---|---|---|
| Example 12 | | | | | | |
| Comparative Example 13 | HT3 | Compound 27 | 3.66 | 5.91 | (0.136, 0.139) | 48.9 |
| Comparative Example 14 | HT3 | Compound 36 | 3.78 | 5.88 | (0.134, 0.139) | 28.1 |
| Comparative Example 15 | Compound 1 | ET2 | 3.88 | 5.81 | (0.135, 0.138) | 21.0 |
| Comparative Example 16 | Compound 4 | ET2 | 3.68 | 5.70 | (0.134, 0.138) | 33.0 |
| Comparative Example 17 | Compound 8 | ET3 | 3.72 | 5.81 | (0.136, 0.139) | 28.0 |
| Comparative Example 18 | Compound 12 | ET3 | 3.69 | 5.66 | (0.134, 0.137) | 40.1 |

As can be seen in Tables 1 to 6, the compound derivative of the formula according to the present invention can serve to adjust holes and electrons in an organic electronic device including an organic light emitting device, and the device according to the present invention exhibits excellent characteristics in terms of efficiency, driving voltage, and stability through the balance of holes and electrons of the organic light emitting device according to the chemical structure.

The invention claimed is:

1. An organic light emitting device comprising:

a positive electrode;

a negative electrode provided to face the positive electrode;

a light emitting layer provided between the positive electrode and the negative electrode;

a hole injection layer and a hole transport layer successively provided between the positive electrode and the light emitting layer;

a first organic material layer provided between the hole transport layer and the light emitting layer;

an electron transport layer provided between the negative electrode and the light emitting layer; and a second organic material layer provided between the light emitting layer and the electron transport layer, wherein the first organic material layer comprises a compound of the following Formula 1, and the second organic material layer comprises a compound of the following Formula 2:

[Formula 1]

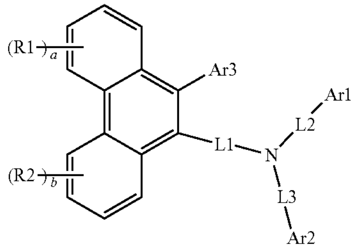

wherein in Formula 1:

L1 is a direct bond;

L2 and L3 are each independently a direct bond, a substituted or unsubstituted phenylene group, a substituted or unsubstituted biphenylene group, or a substituted or unsubstituted terphenylene group;

a) Ar1 is deuterium, a substituted or unsubstituted aryl group, or a substituted or unsubstituted heterocyclic group that is a dibenzofuran or a dibenzothiophene, and Ar2 is a substituted or unsubstituted heterocyclic group that is a dibenzothiophene; or b) Ar1 is a substituted or unsubstituted heterocyclic group that is a dibenzofuran or a dibenzothiophene, and Ar2 is deuterium, a substituted or unsubstituted aryl group, or a substituted or unsubstituted heterocyclic group that is a dibenzothiophene;

wherein when any of Ar1 and Ar2 of Formula 1 is a substituted or unsubstituted aryl group, the aryl group is a phenyl group, a biphenyl group, a terphenyl group, a quaterphenyl group, a fluorene group, a naphthyl group, or a triphenylene group;

Ar3 is a substituted or unsubstituted aryl group;

R1 and R2 are each independently hydrogen, deuterium, a halogen group, a cyano group, a nitro group, a substituted or unsubstituted alkyl group, a substituted or unsubstituted haloalkyl group, a substituted or unsubstituted haloalkoxy group, a substituted or unsubstituted cycloalkyl group, a substituted or unsubstituted alkenyl group, a substituted or unsubstituted aryl group, or a substituted or unsubstituted heterocyclic group;

a and b are each independently an integer from 0 to 4;

when a and b are each independently 2 or more, the substituents in the parentheses are the same as or different from each other;

[Formula 2]

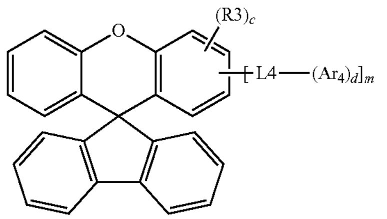

wherein in Formula 2:

L4 is a direct bond, a substituted or unsubstituted arylene group, or a substituted or unsubstituted divalent heterocyclic group;

Ar4 is a phenyl group substituted with —CN, a naphthylene group, or trifluoromethoxy group; a substituted or unsubstituted biphenyl group; a substituted or unsubstituted terphenyl group; a substituted or unsubstituted fluorene group; a substituted or unsubstituted phenanthrene group; a substituted or unsubstituted triphenylene group; a substituted or unsubstituted dibenzofuran group; a substituted or unsubstituted dibenzothiophene group; a substituted or unsubstituted benzocarbazole group; a triazine substituted with at least one of a biphenyl, phenyl-substituted naphthylene, dibenzofuran, dibenzothiophene, pyridine, terphenyl group, phenalene, fluorene, phenylpyridine, or dibenzofuran-substituted phenyl; a pyrimidine substituted with at least one of a biphenyl, phenyl-substituted naphthylene, dibenzofuran, dibenzothiophene, pyridine, terphenylene, phenalene, fluorene, or dibenzofuran-substituted phenyl; a quinazoline substituted with phenyl, biphenyl, or naphthyl; an isoquinoline substituted with phenyl; a 1,10-phenanthroline group; a pyridazine substituted with phenyl or naphthyl; a benzo [4,5] imidazo[1,2-f] phenanthridine group; a phenyl-substituted 1,3,4-oxadiazole; a phenyl-substituted 1,3,4-thiadiazole; a fluoranthene group; a dihydrophenoxazine group; or a dihydrophenothiazine group;

R3 is hydrogen, deuterium, a halogen group, a cyano group, a nitro group, a substituted or unsubstituted alkyl group, a substituted or unsubstituted haloalkyl group, a substituted or unsubstituted haloalkoxy group, a substituted or unsubstituted cycloalkyl group, a substituted or unsubstituted alkenyl group, a substituted or unsubstituted aryl group, or a substituted or unsubstituted heterocyclic group;

c is an integer from 0 to 3;

d is 1;

m is an integer from 1 to 4; and when c and m are each independently 2 or more, the substituents in the parentheses are the same as or different from each other, with the proviso that the compound of Formula 2 in the second organic material layer is not the following compound:

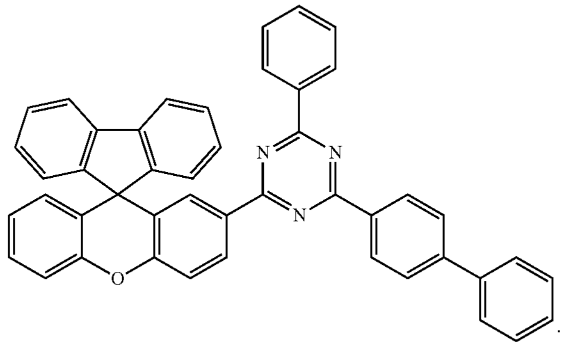 [SMILES: c1ccc(-c2ccc(-c3nc(-c4ccccc4)nc(-c4ccc5c(c4)C4(c6ccccc6O5)c5ccccc5-c5ccccc54)n3)cc2)cc1]

2. The organic light emitting device of claim 1, wherein when Ar3 of Formula 1 is a substituted or unsubstituted aryl group, the aryl group is a phenyl group, a biphenyl group, a terphenyl group, a quaterphenyl group, a fluorene group, a naphthyl group, a phenanthrene group, or a triphenylene group.

3. The organic light emitting device of claim 1, wherein Formula 2 is any one of the following Formulae 2-1 to 2-3:

[Formula 2-1]

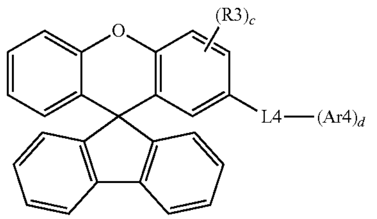

[Formula 2-2]

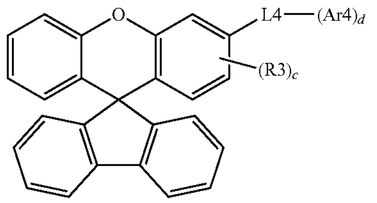

[Formula 2-3]

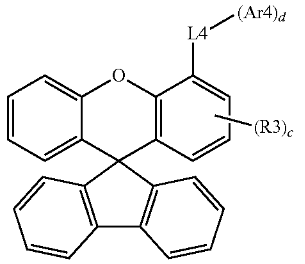

wherein in Formulae 2-1 to 2-3, R3, L4, Ar4, c, and d are the same as the definitions in Formula 2.

4. The organic light emitting device of claim 1, wherein L4 is a direct bond, a substituted or unsubstituted arylene group, or a substituted or unsubstituted divalent heterocyclic group comprising N.

5. The organic light emitting device of claim 1, wherein the compound of Formula 2 is selected from among the following compounds:

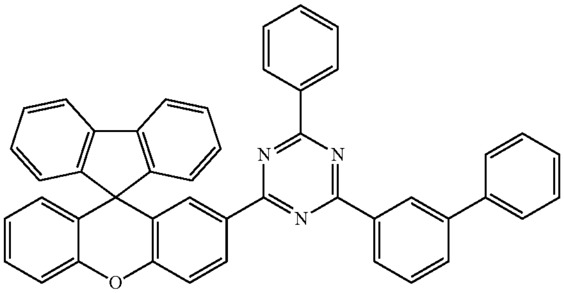
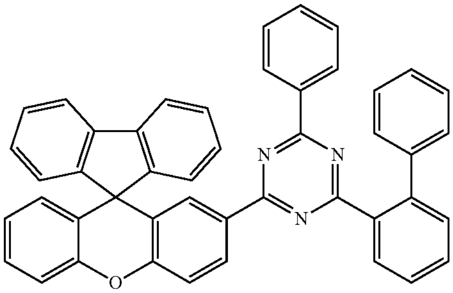
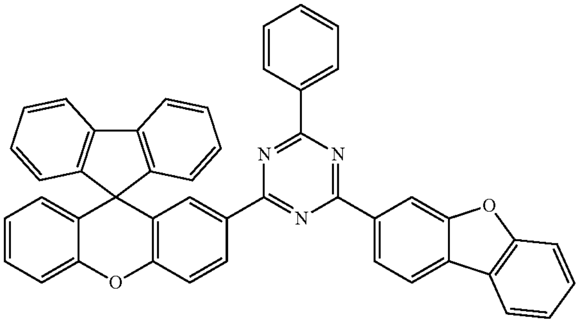
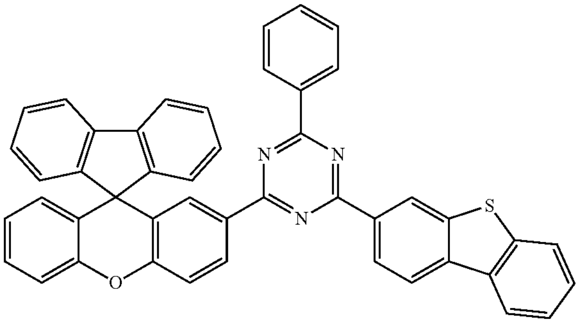
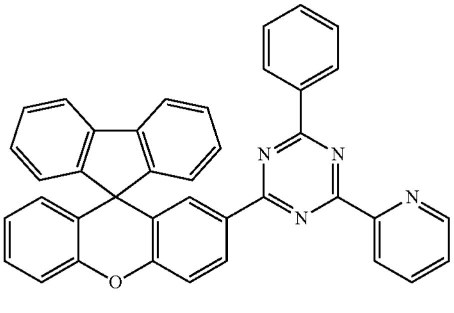
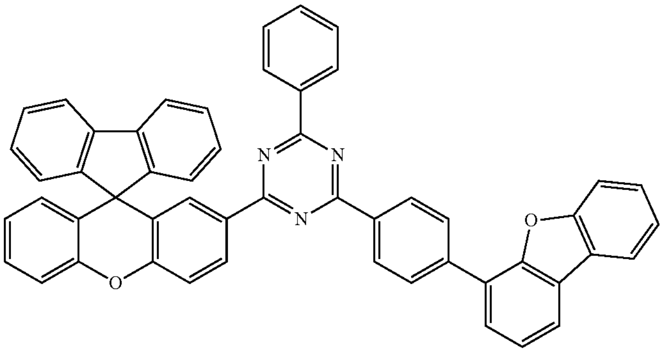
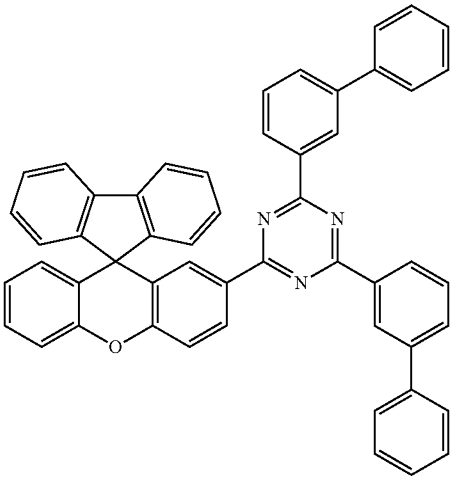

-continued
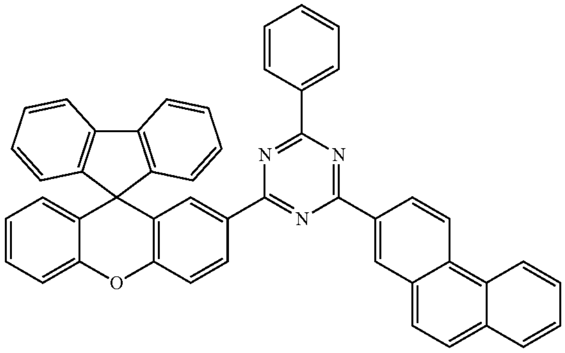
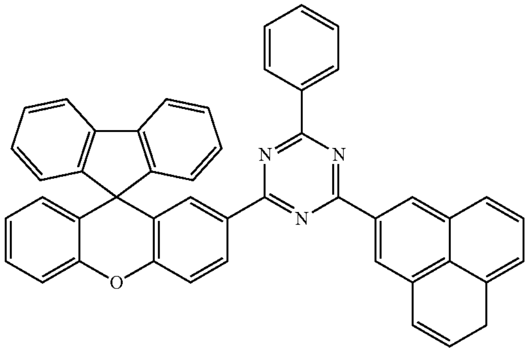
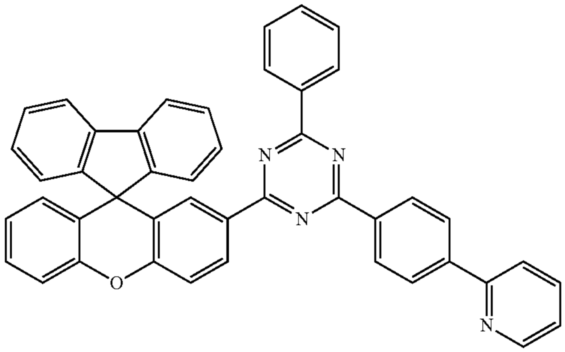
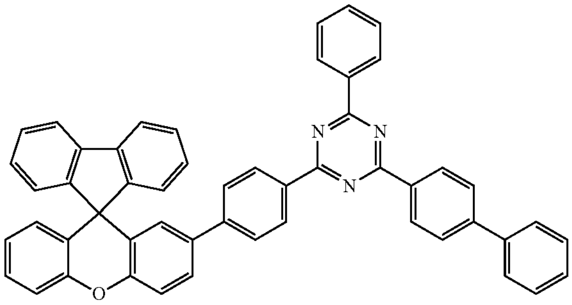
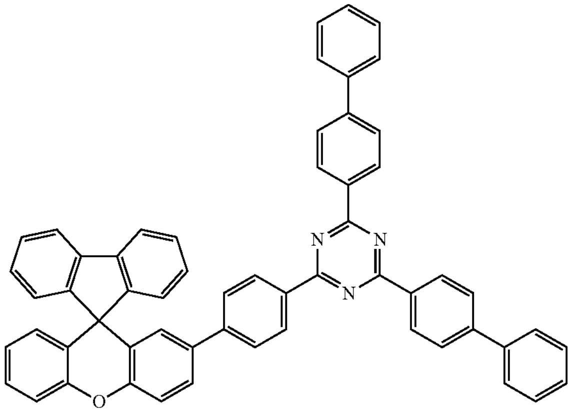
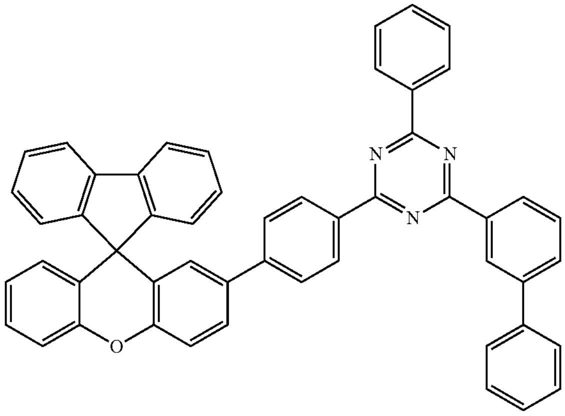
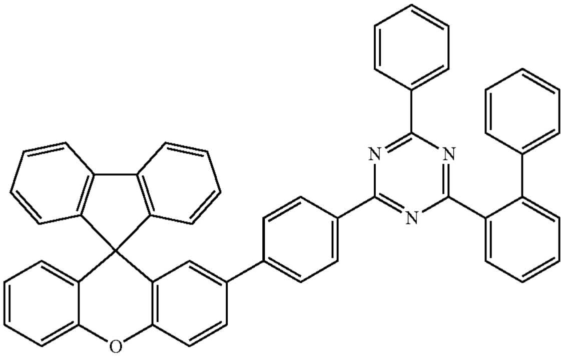

-continued
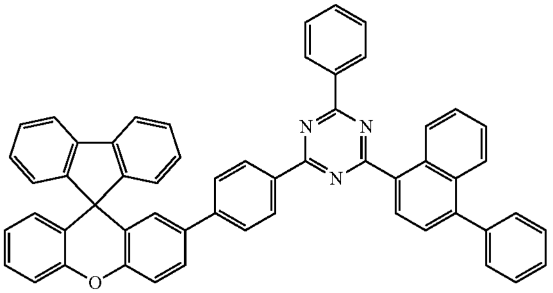
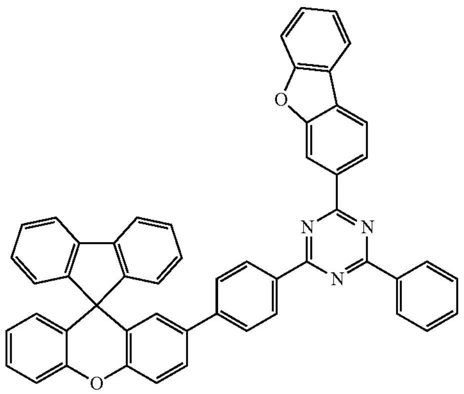
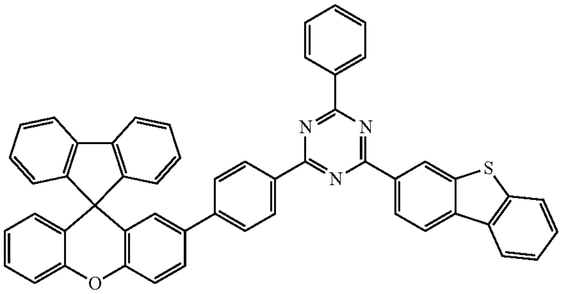
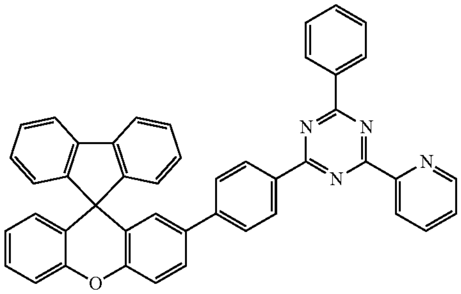
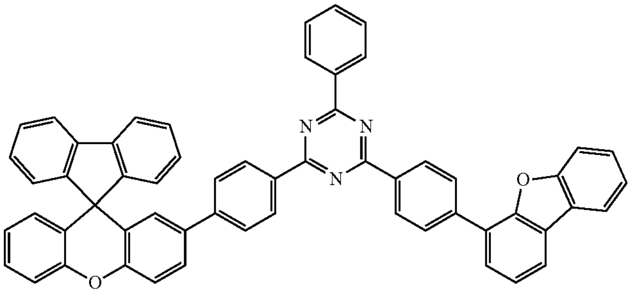
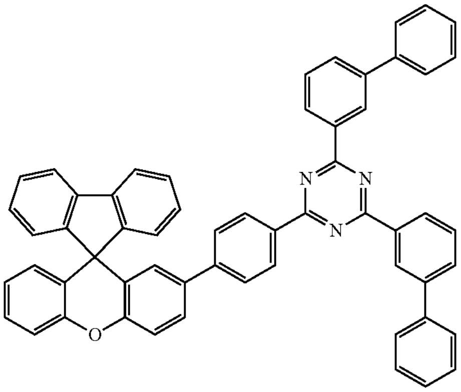
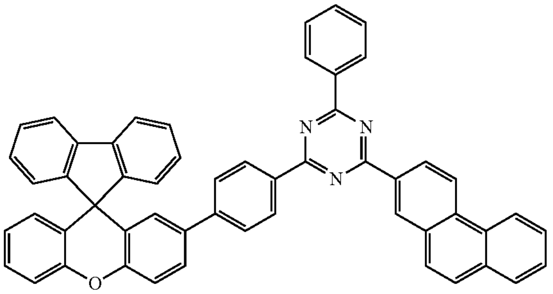
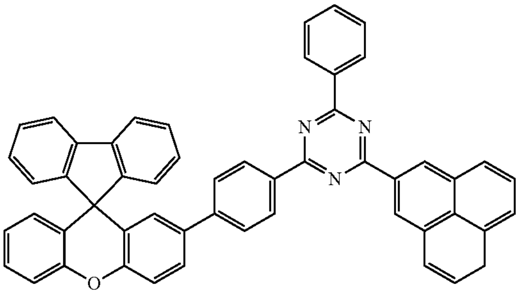

-continued
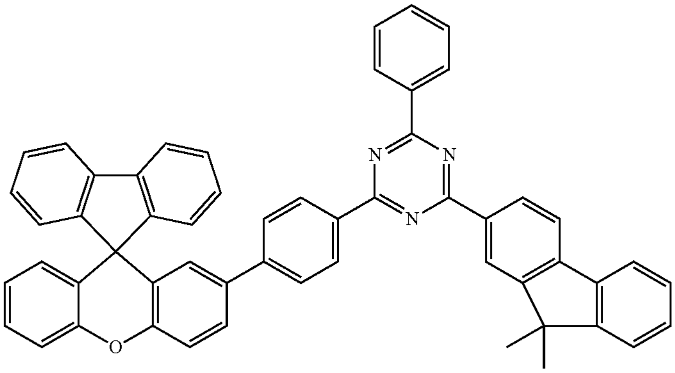
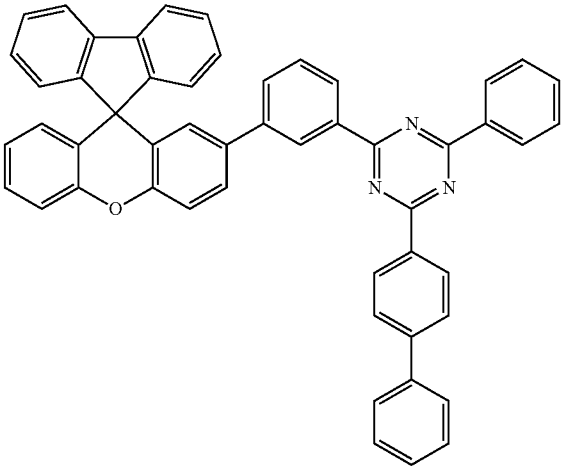
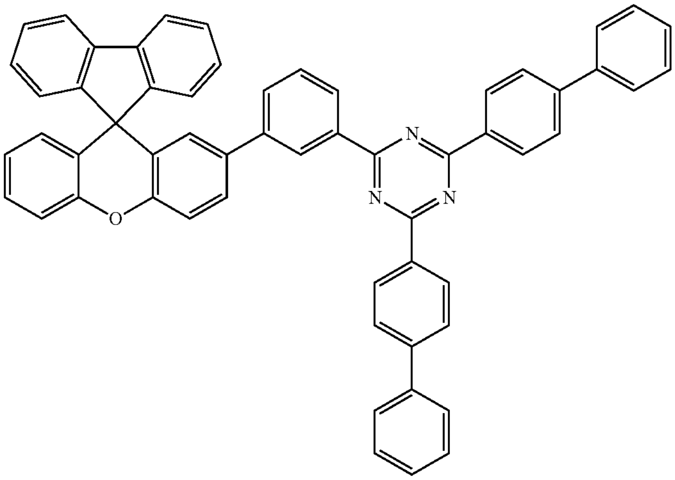
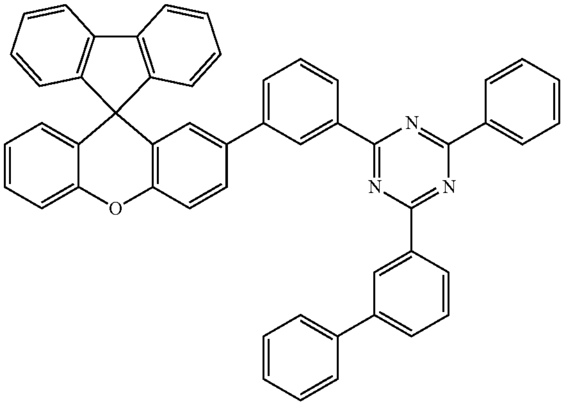
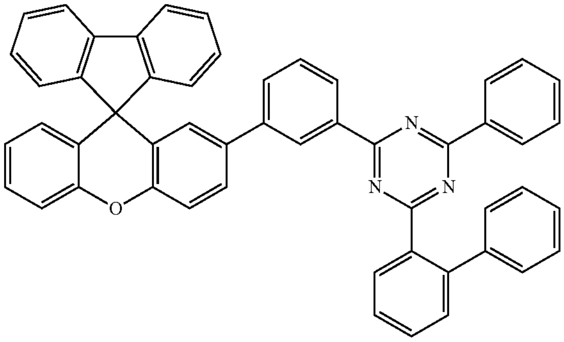

-continued
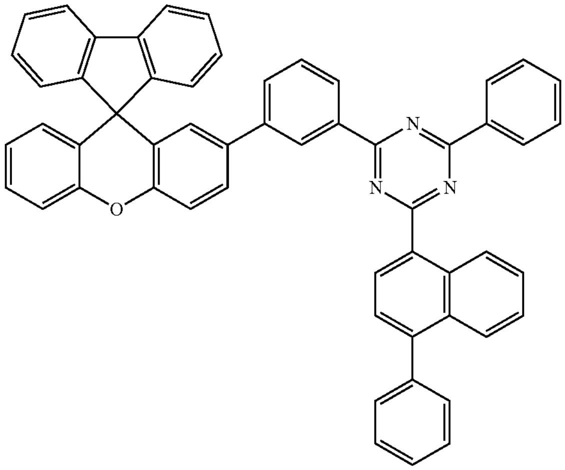
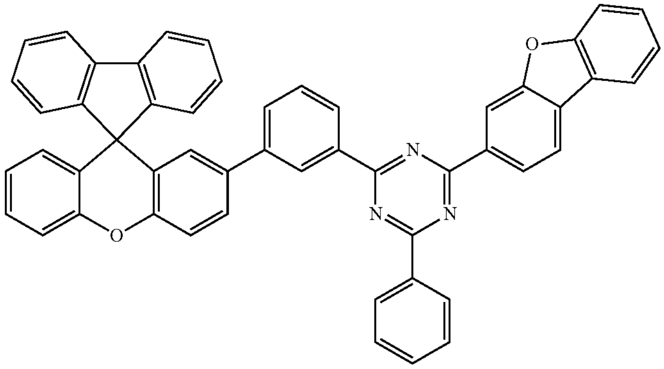
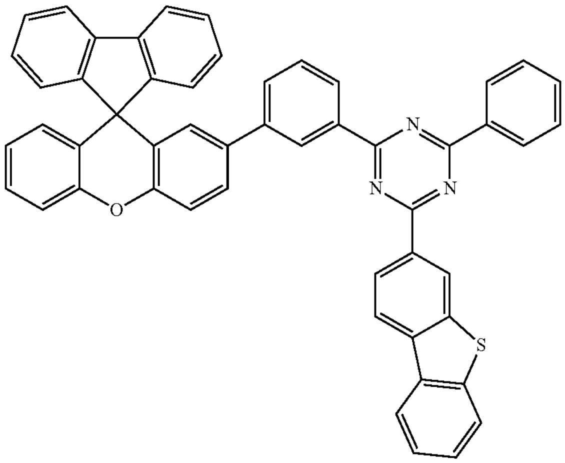
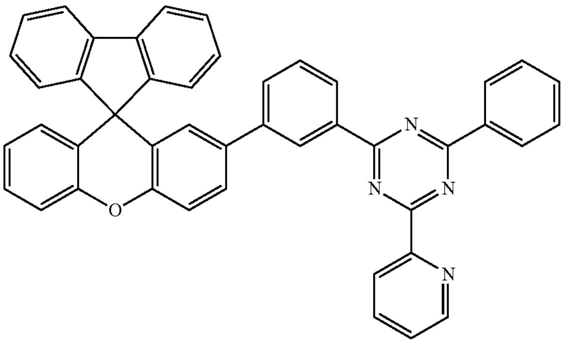
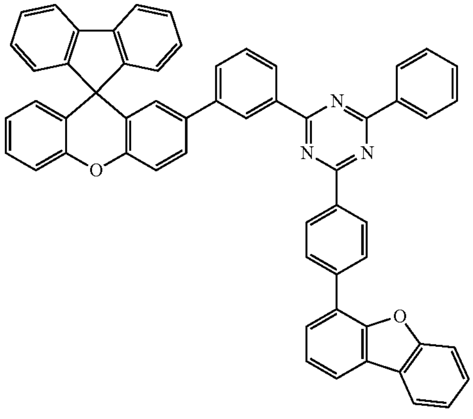
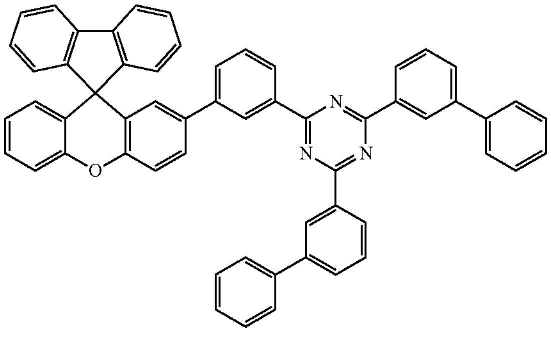

-continued
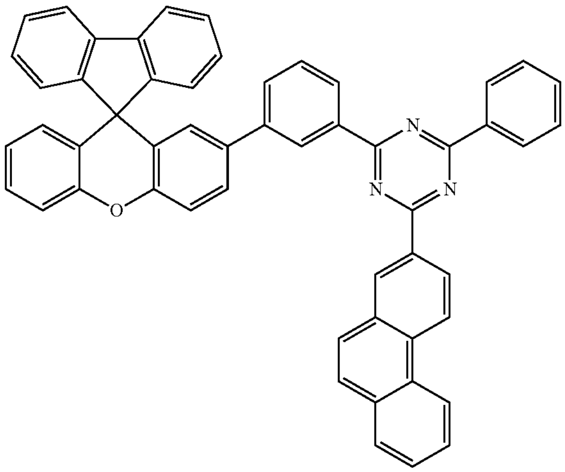
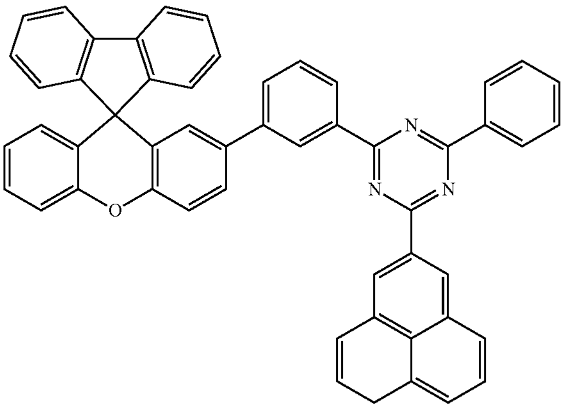
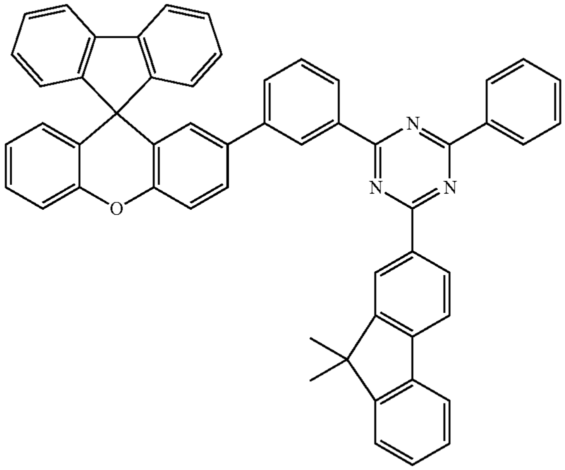
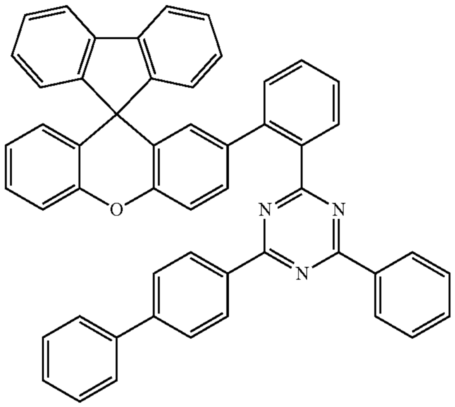
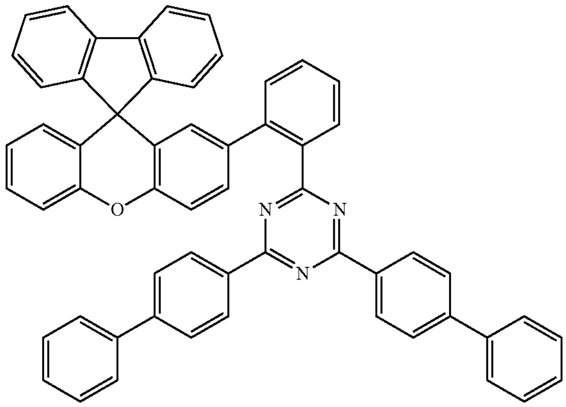

-continued
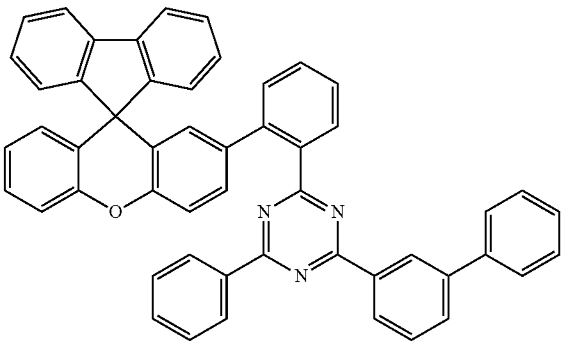
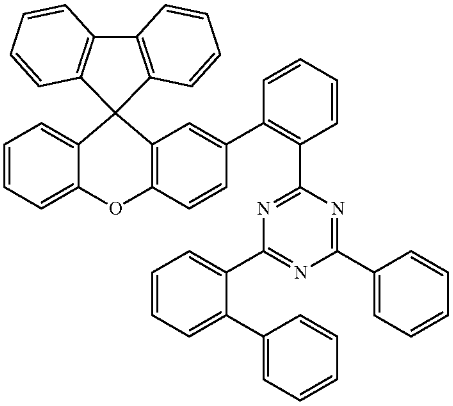
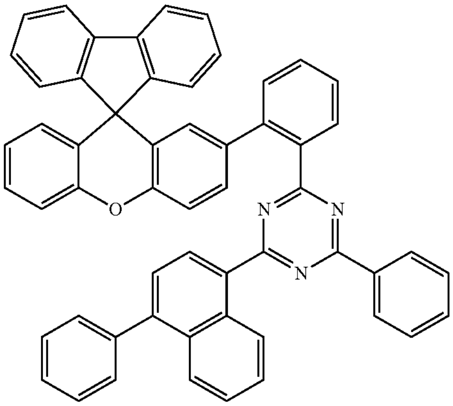
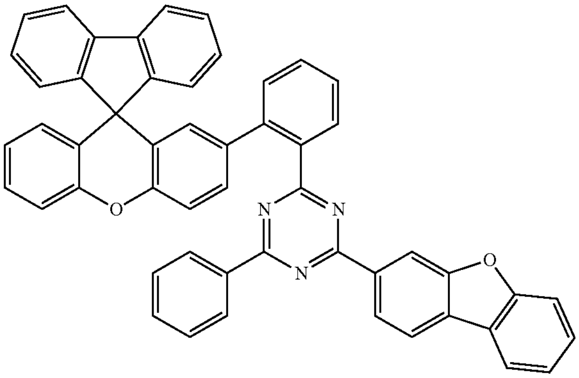
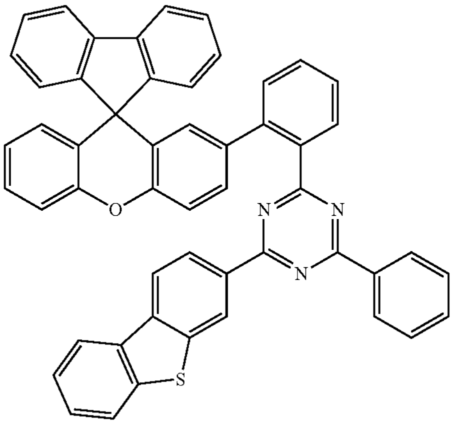
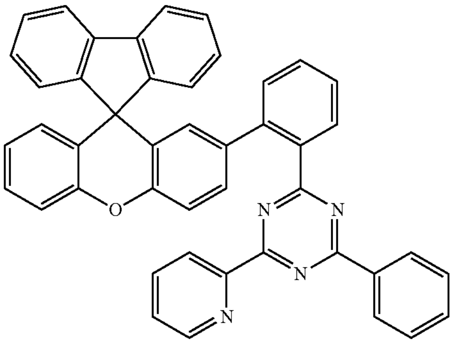

-continued
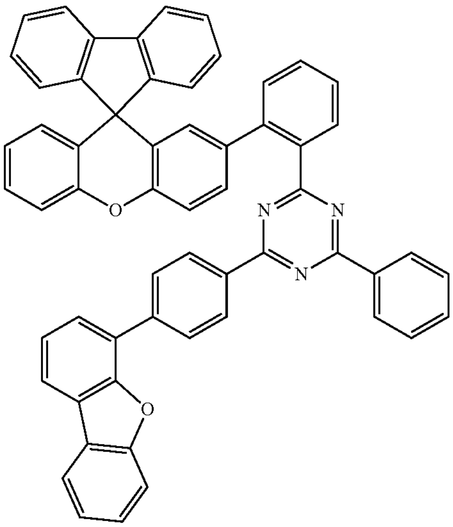
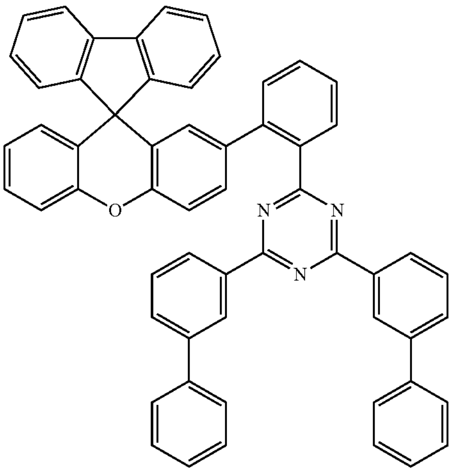
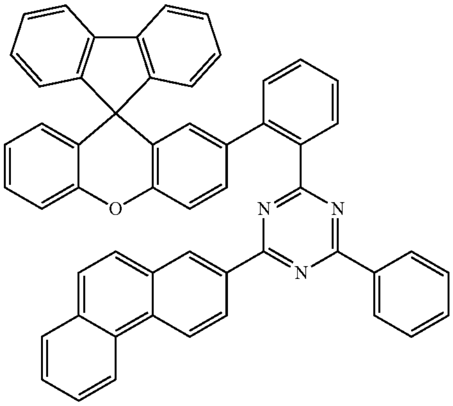
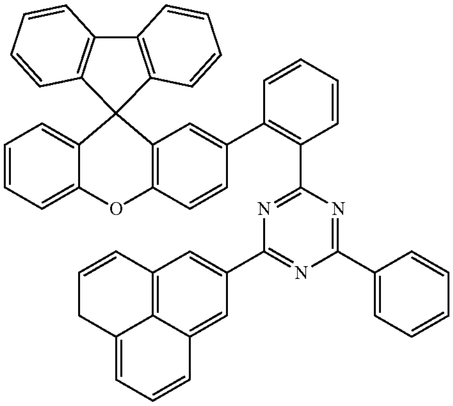
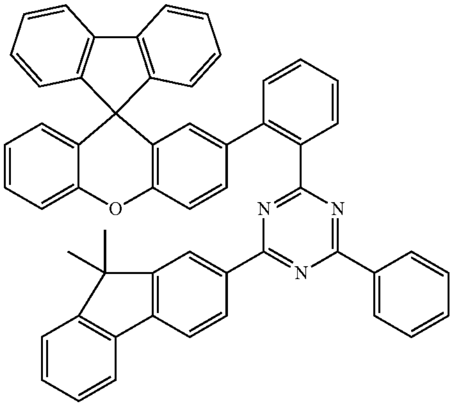
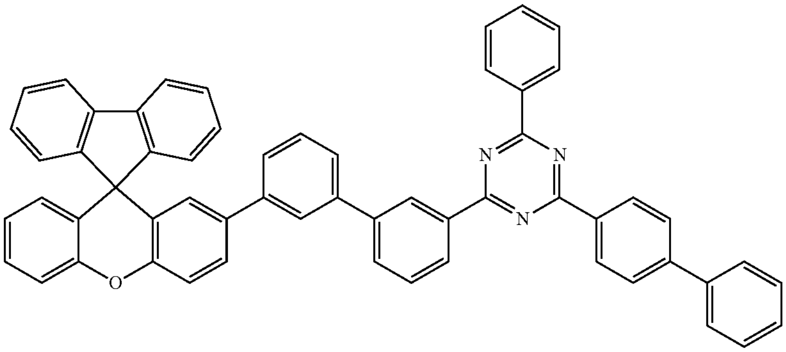

-continued
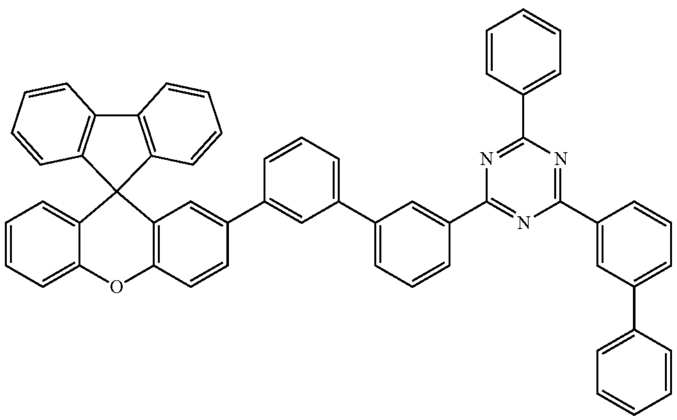
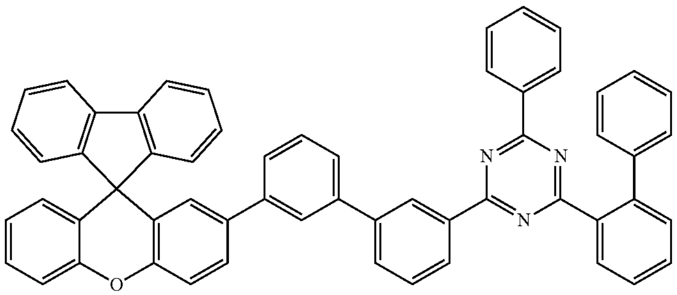
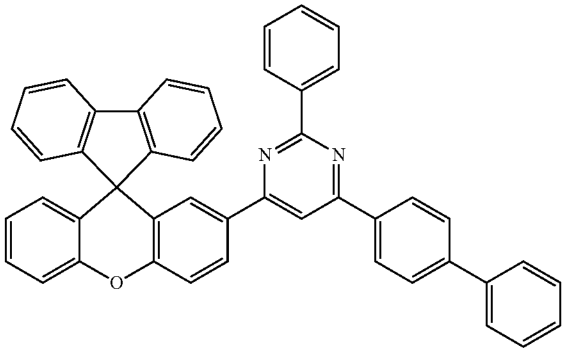
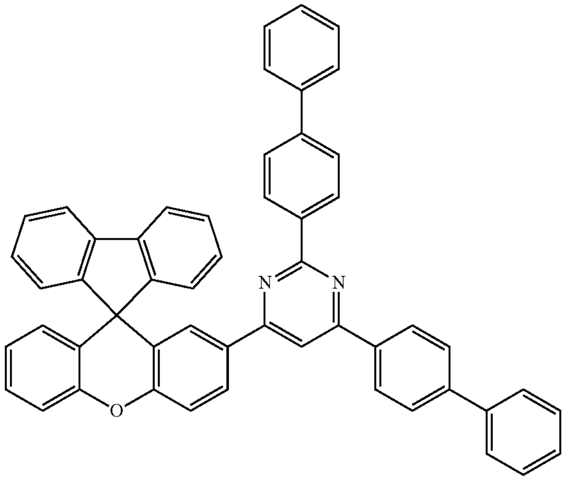
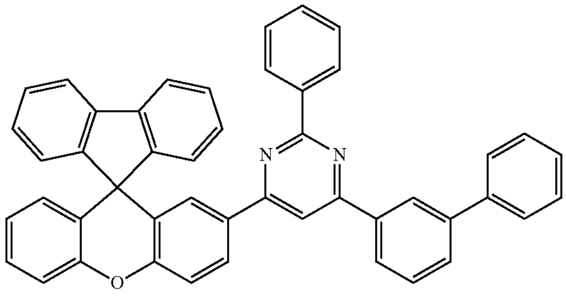

-continued
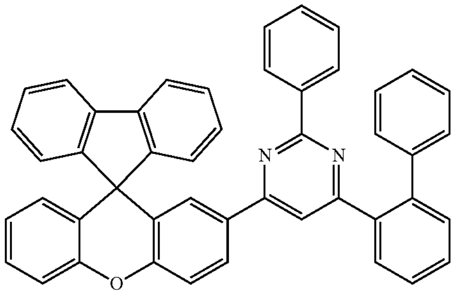
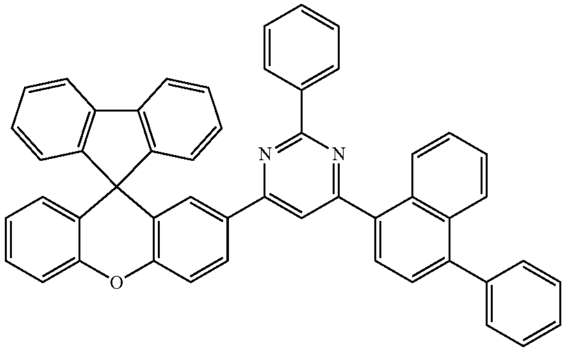
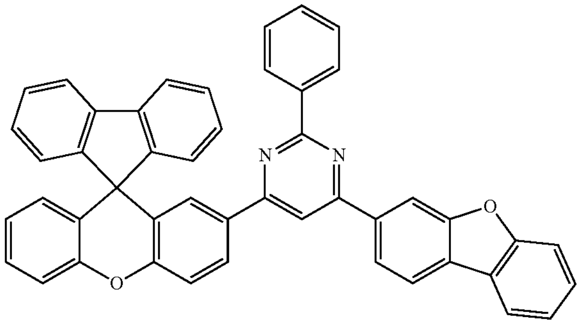
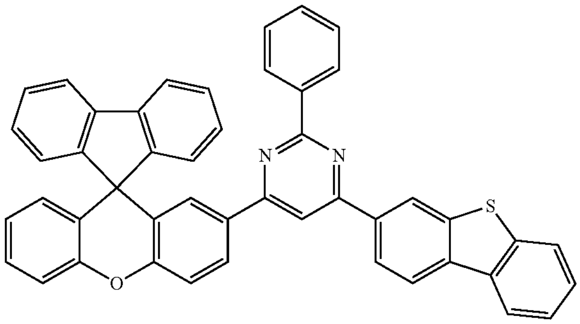
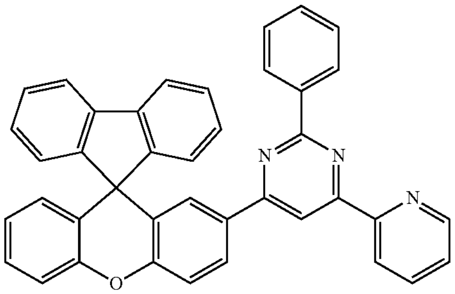

-continued
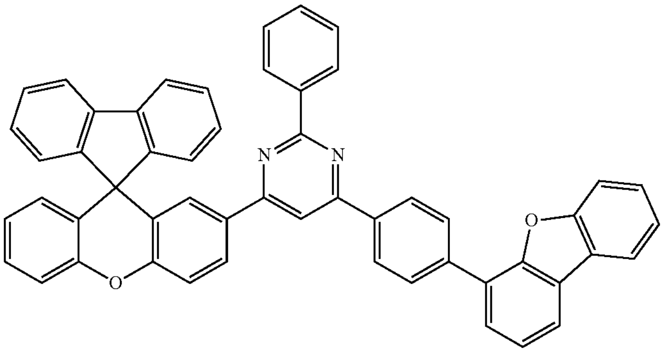
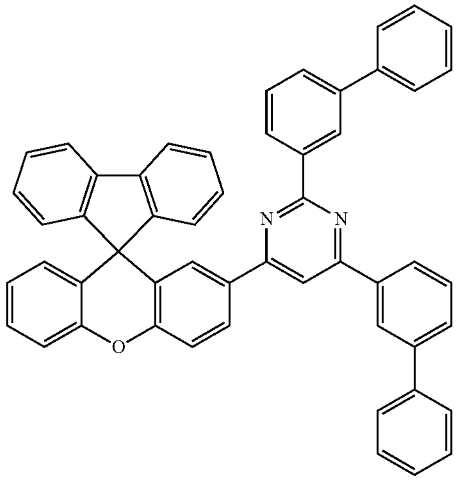
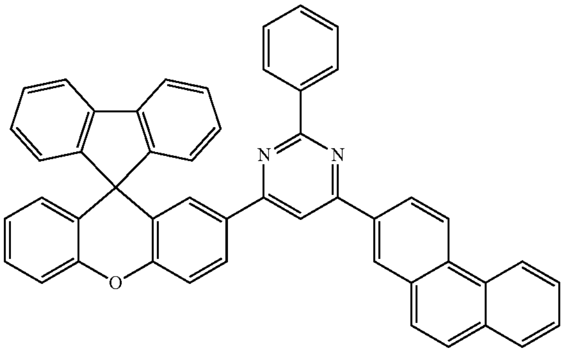
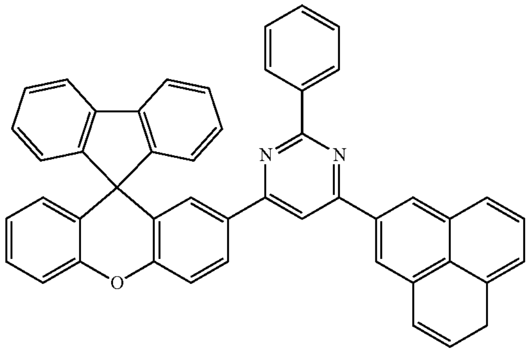
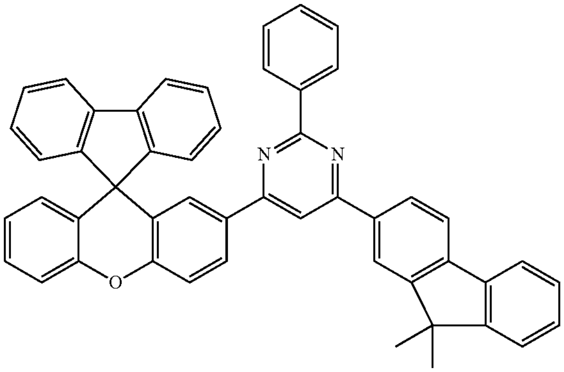
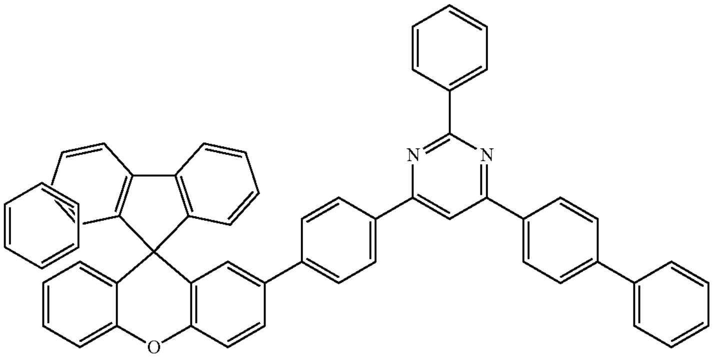

-continued
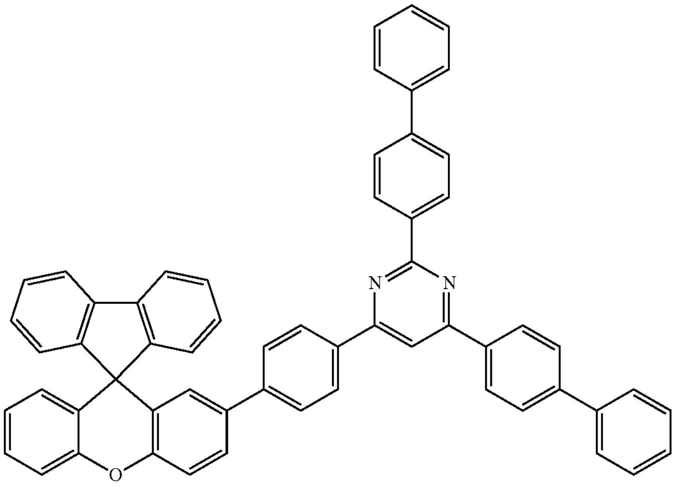
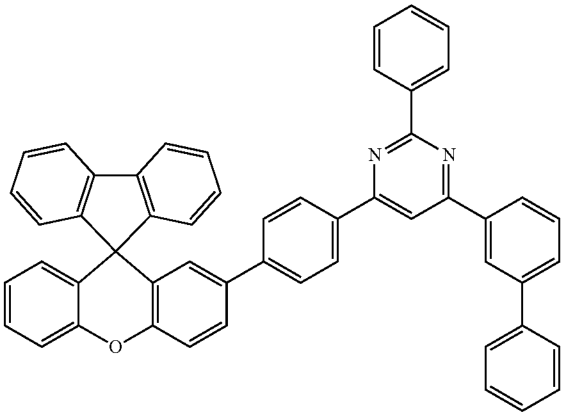
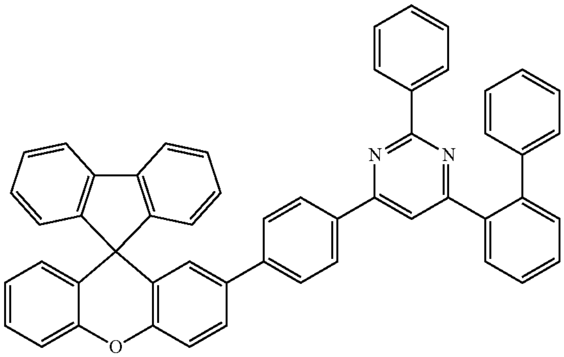
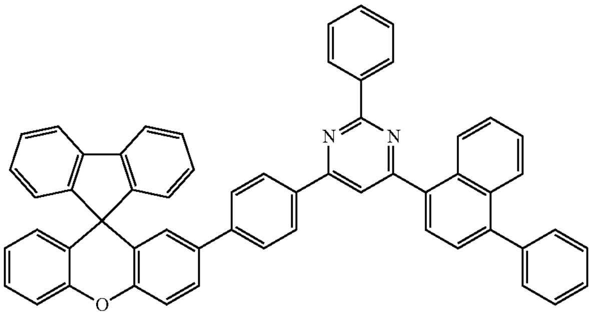
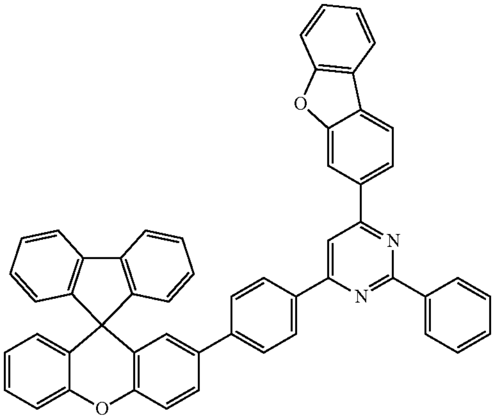
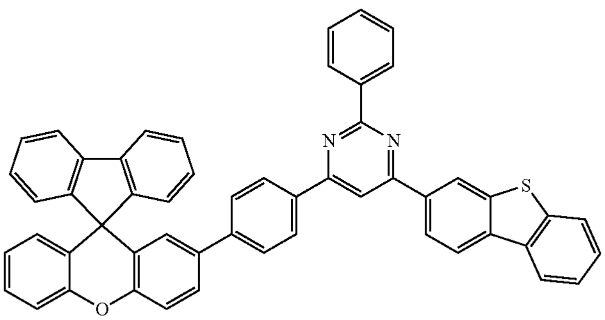
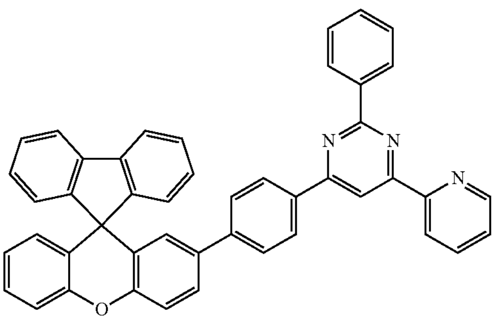

-continued
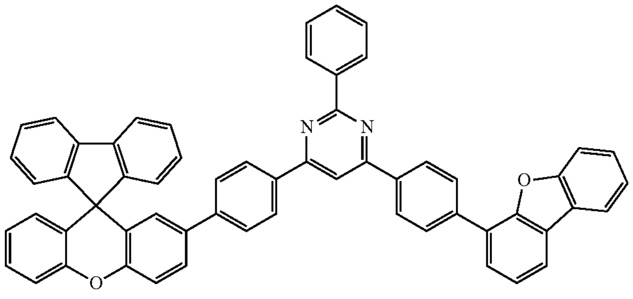
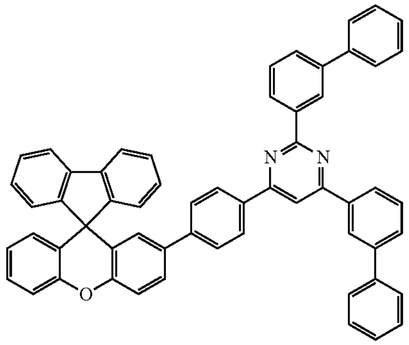
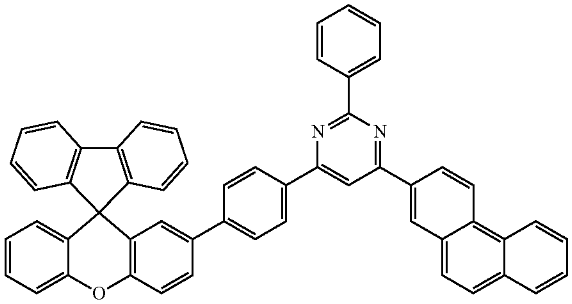
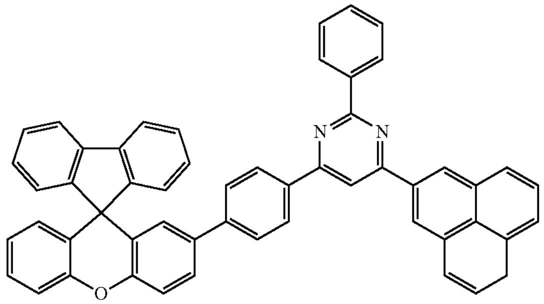
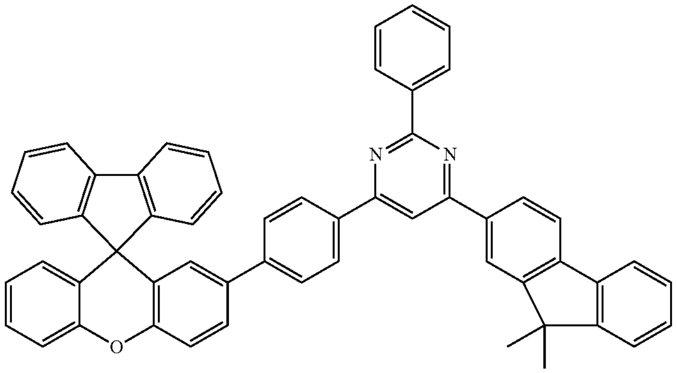
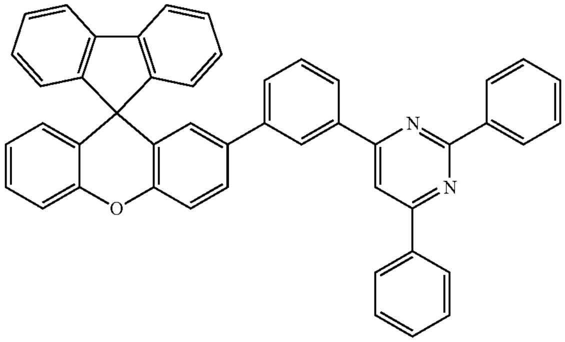
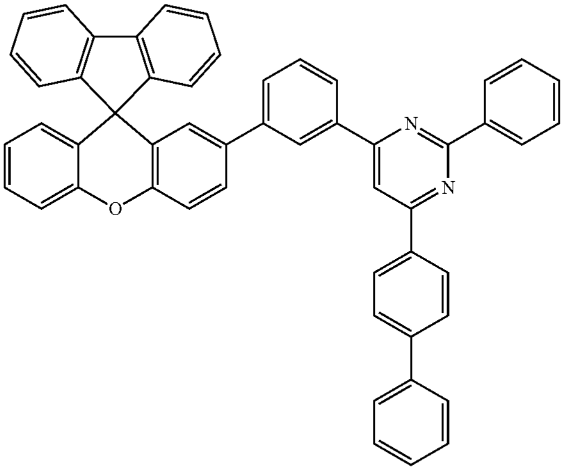

-continued
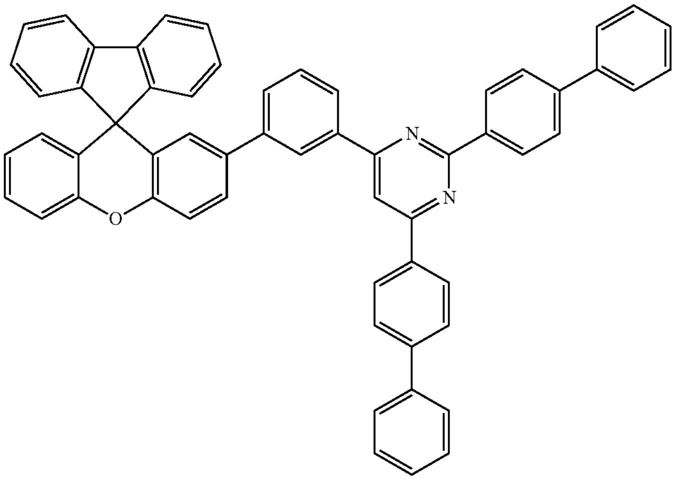
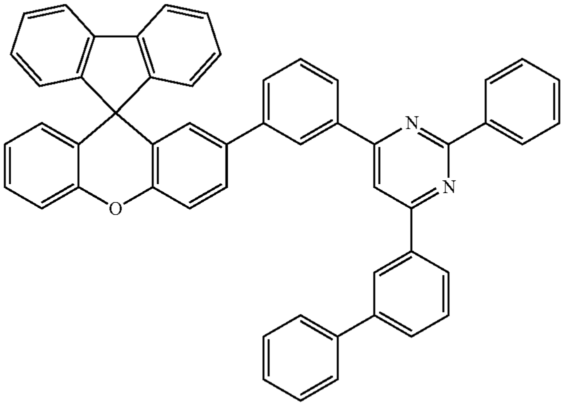
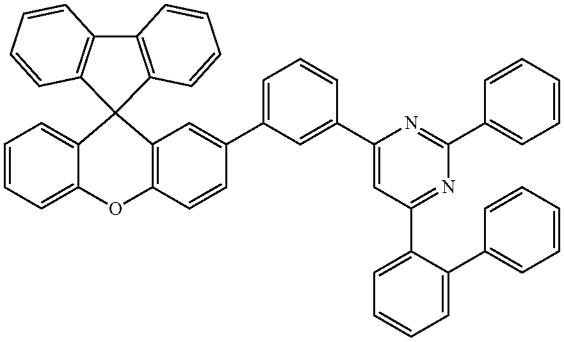
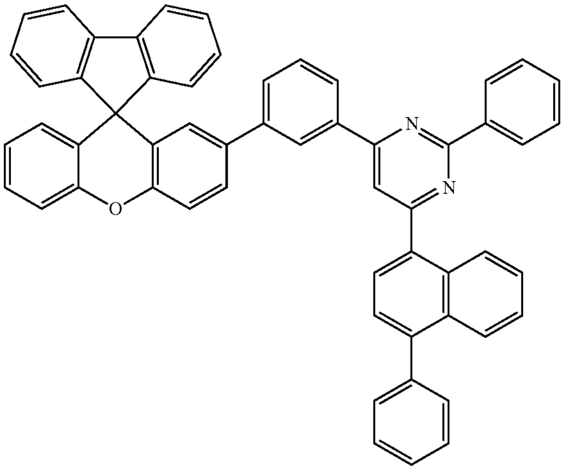
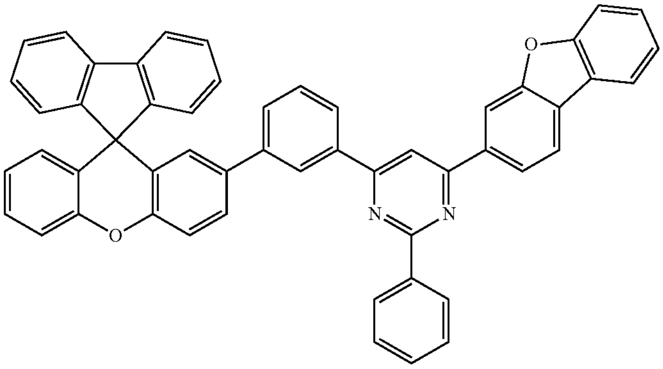

-continued
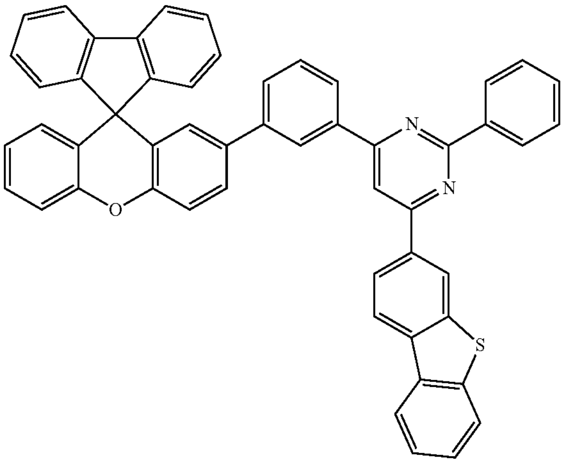
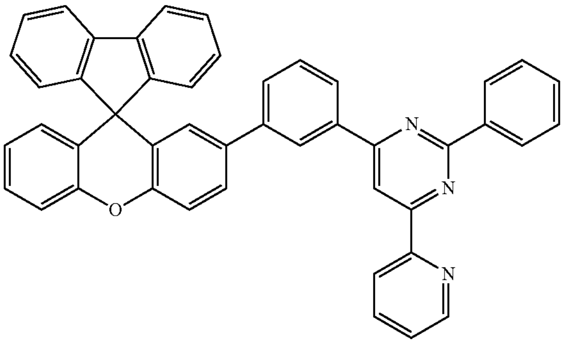
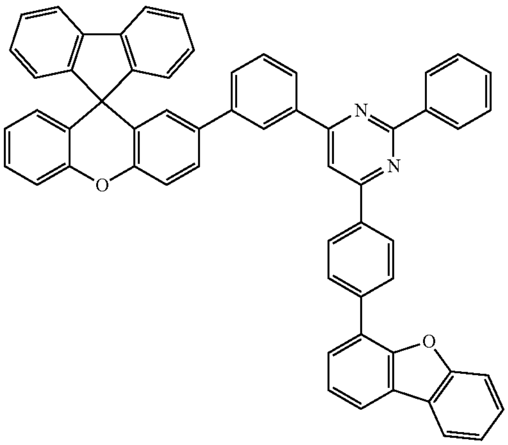
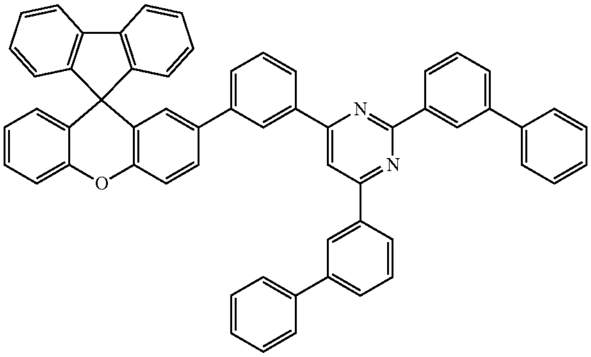
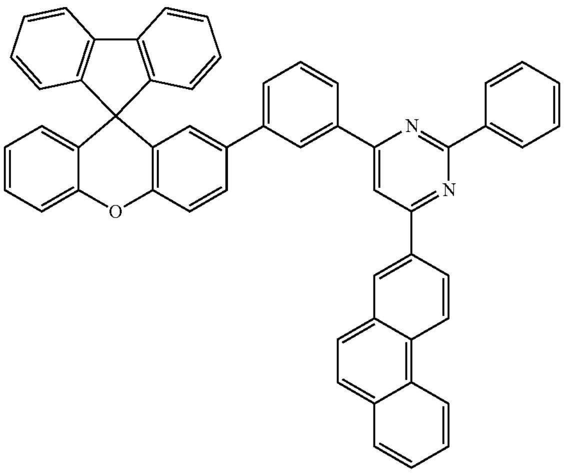
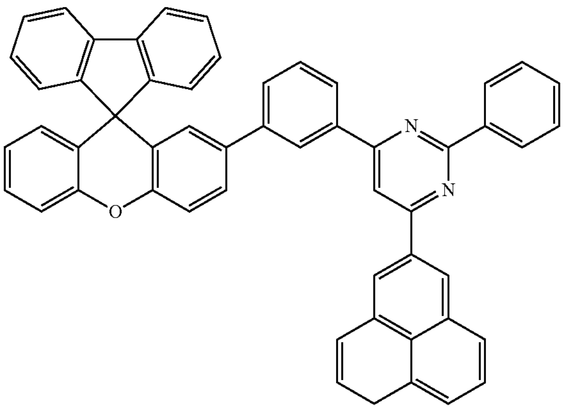

-continued
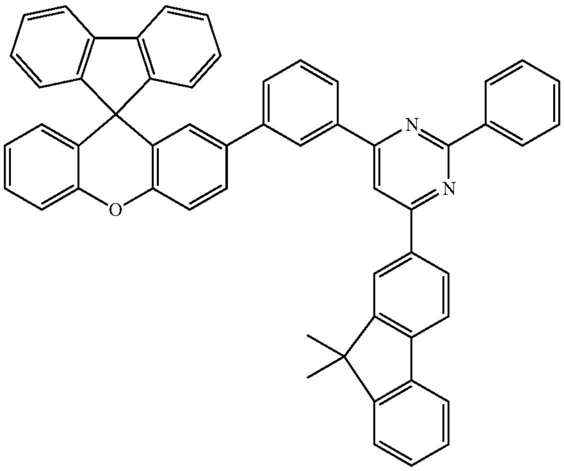
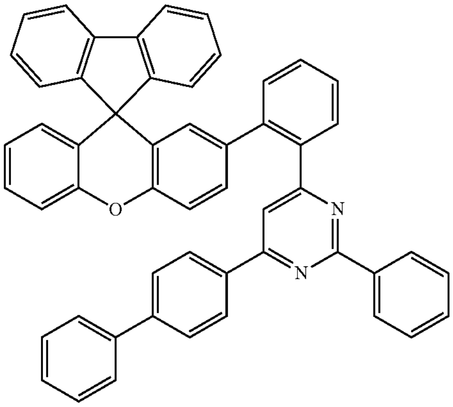
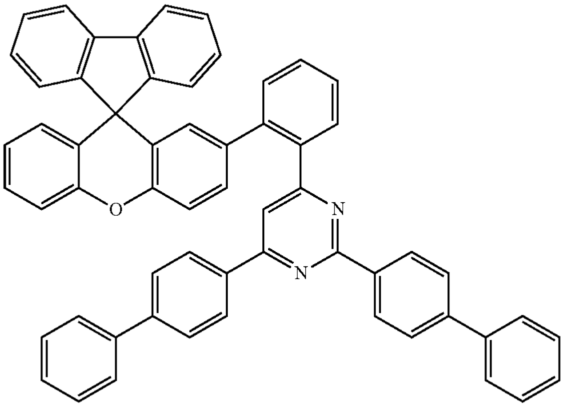
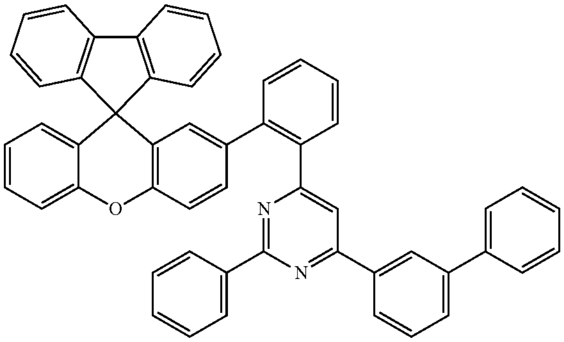
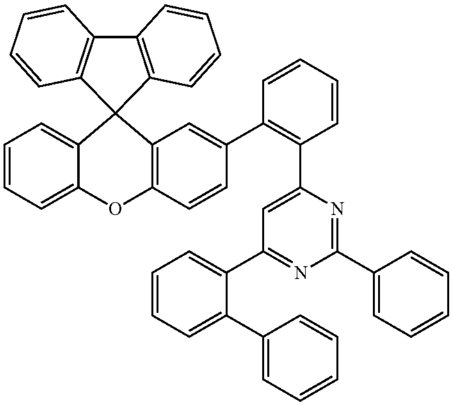
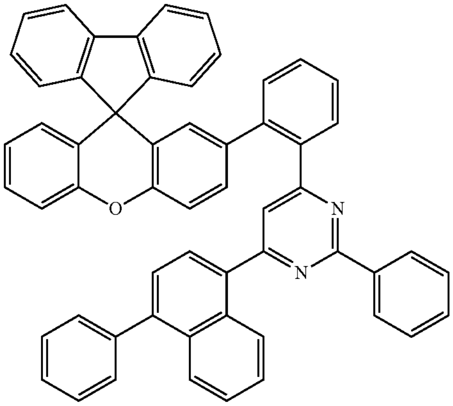
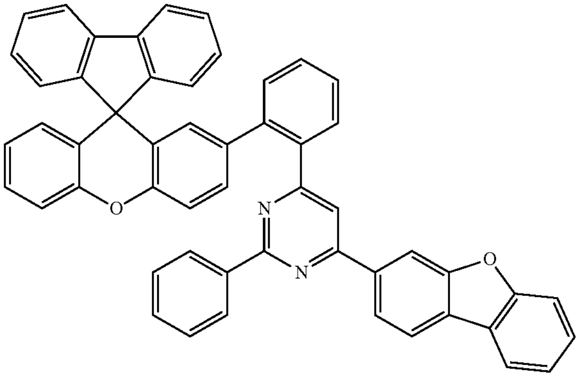

-continued
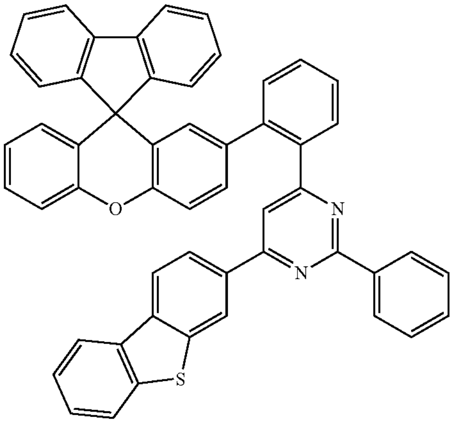
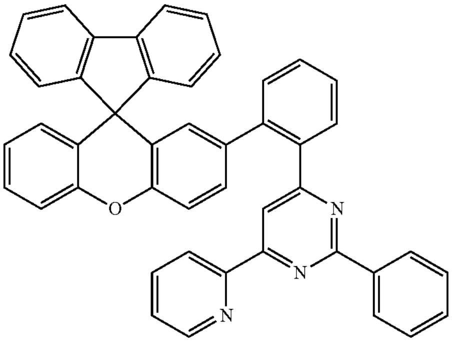
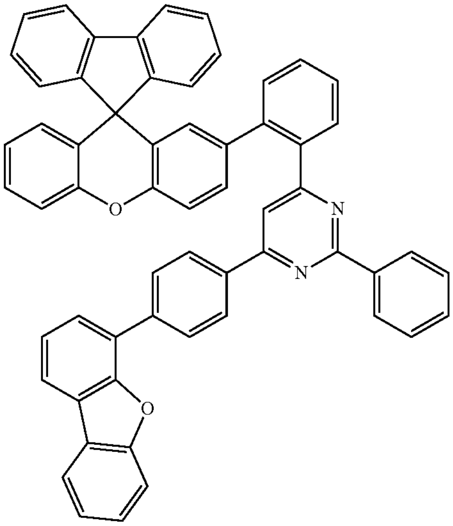
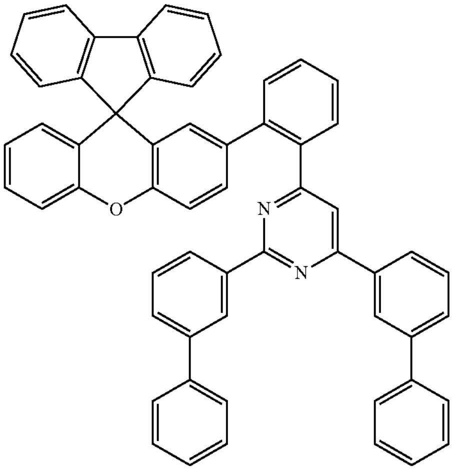
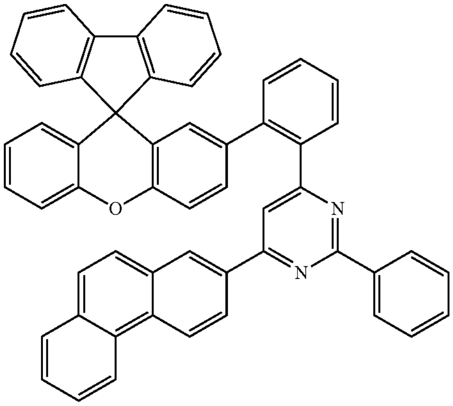
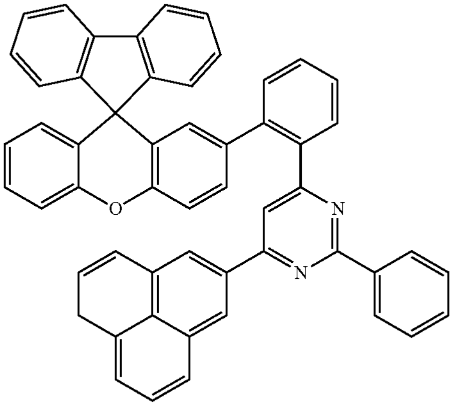

-continued
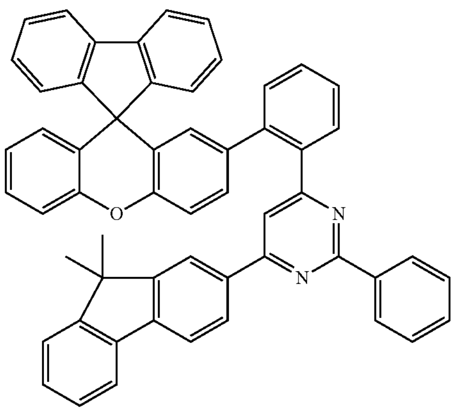
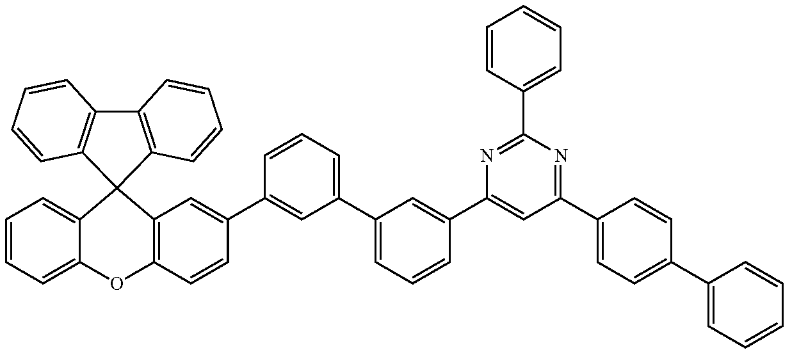
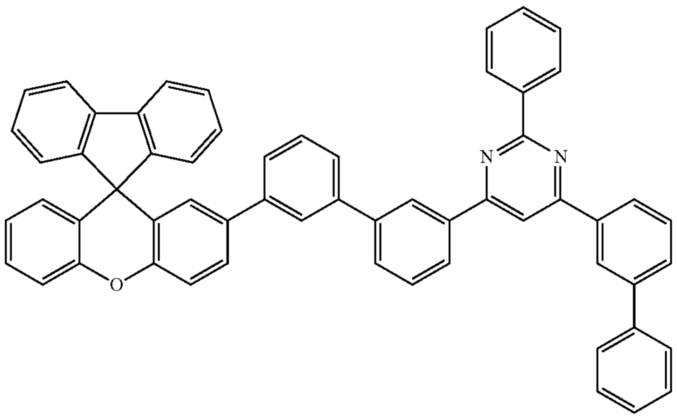
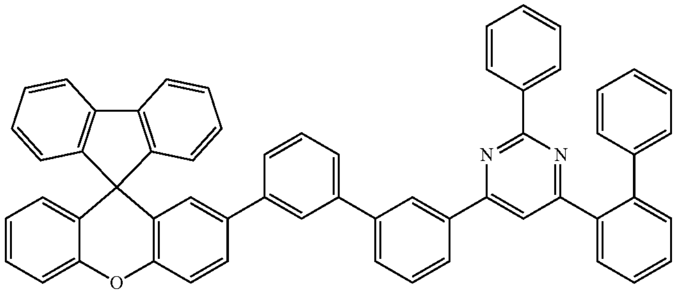 [SMILES: c1ccc(-c2nc(-c3cccc(-c4cccc(-c5ccc6c(c5)C5(c7ccccc7O6)c6ccccc6-c6ccccc65)c4)c3)cc(-c3ccccc3-c3ccccc3)n2)cc1]

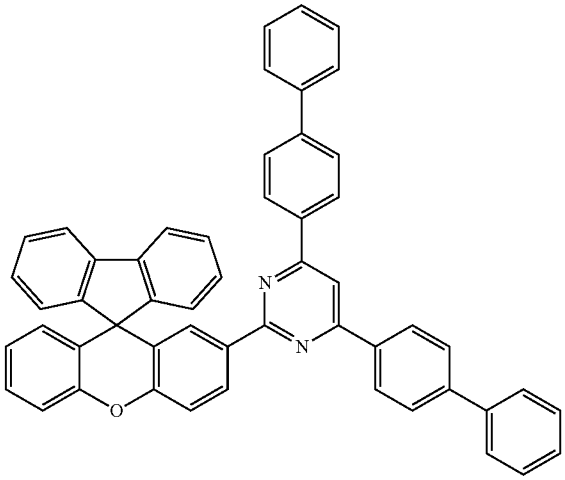
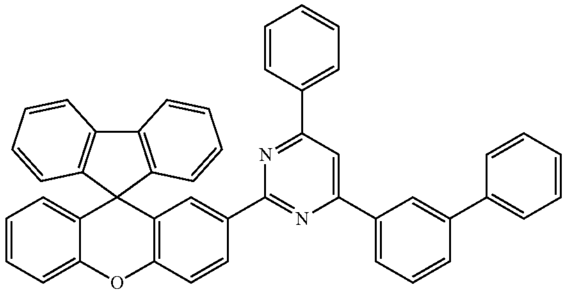
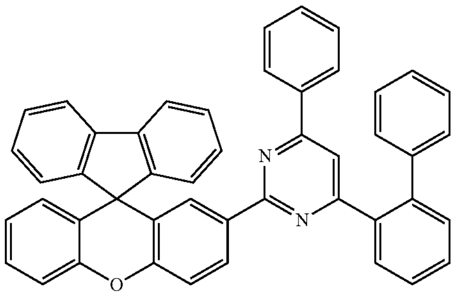
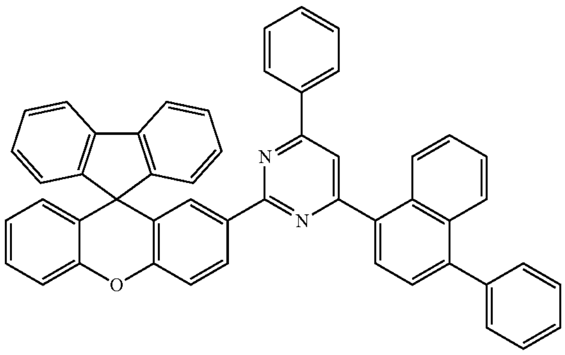
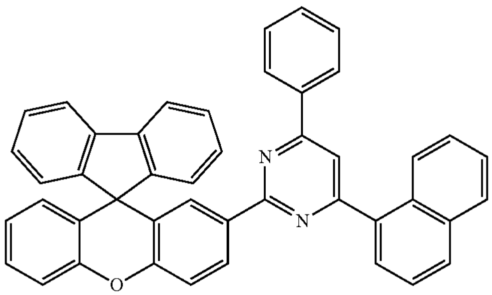
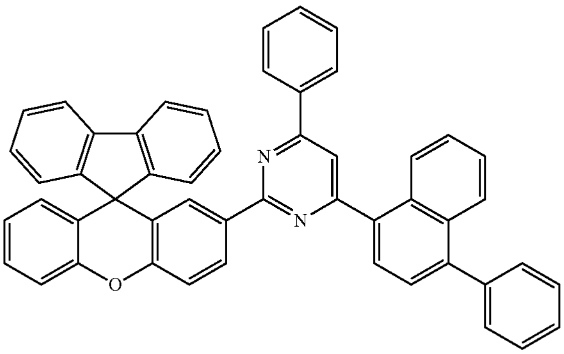

-continued
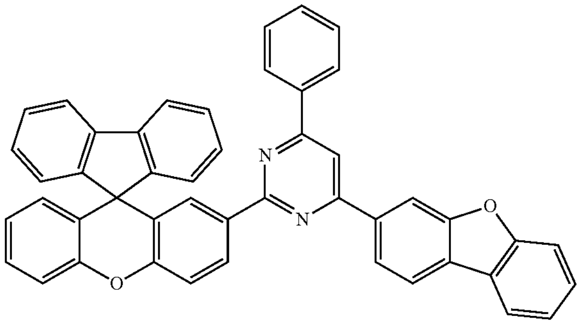
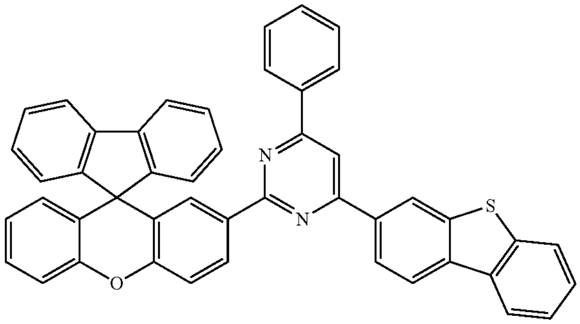
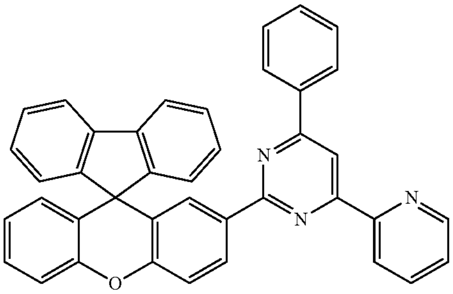
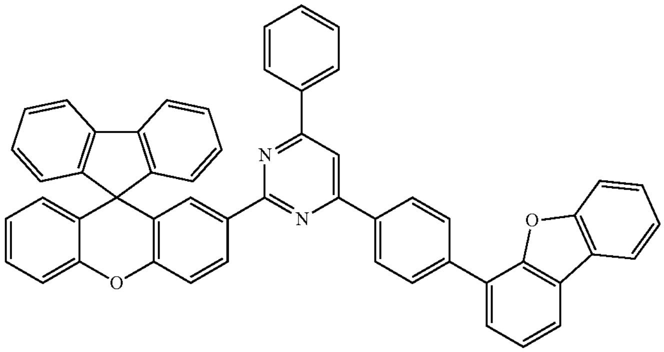
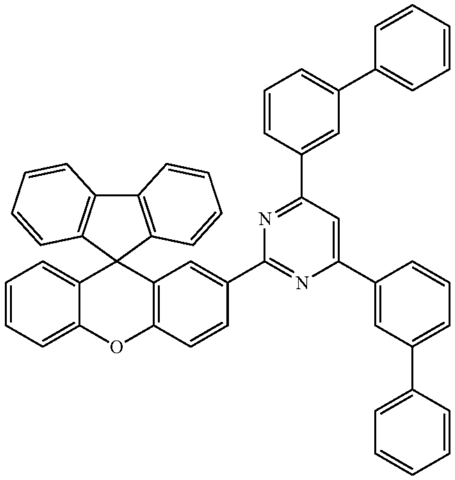
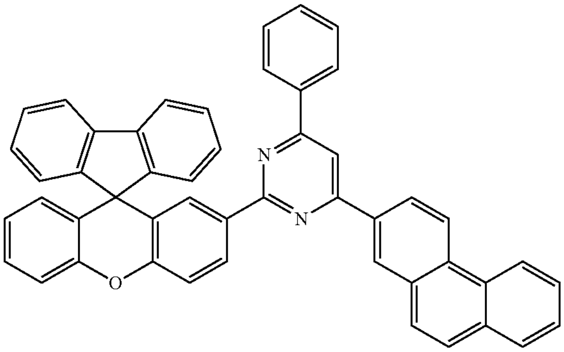

-continued
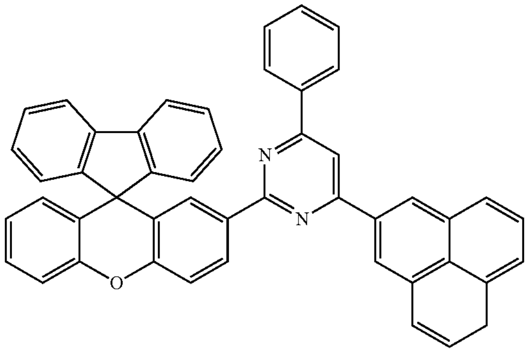
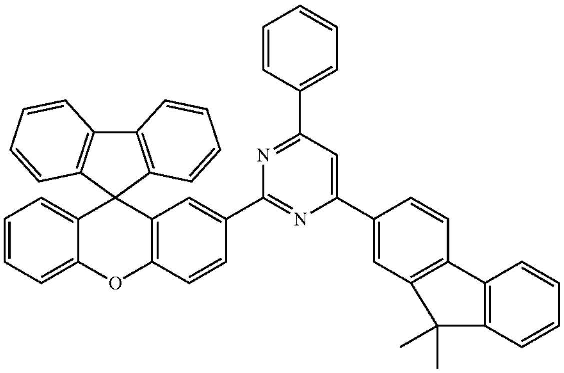
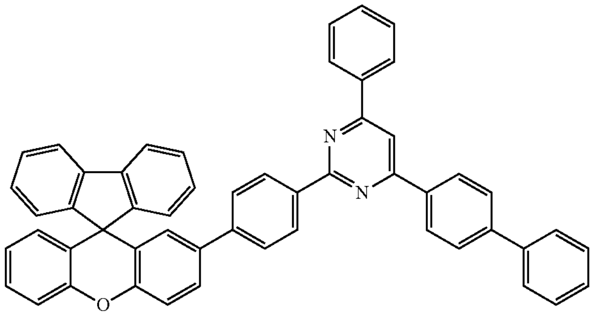
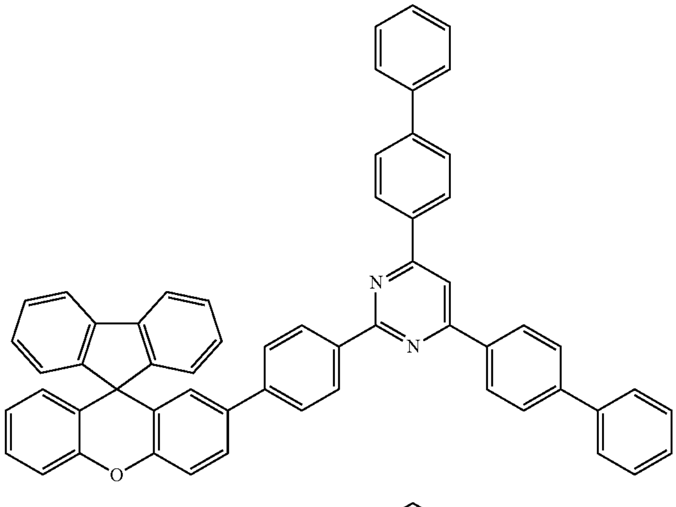
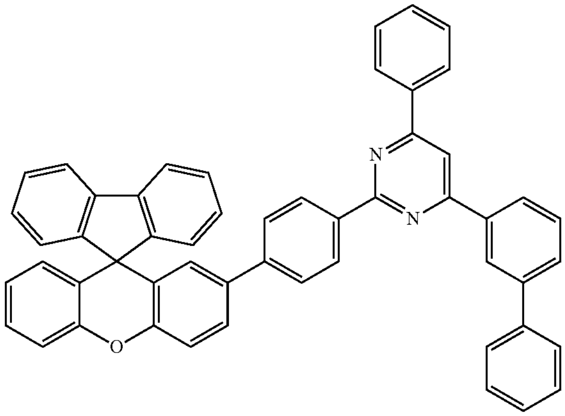
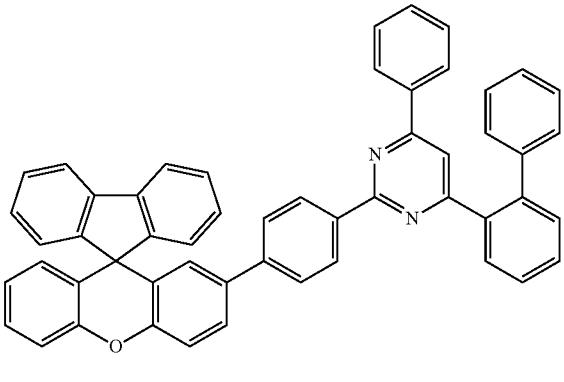

-continued
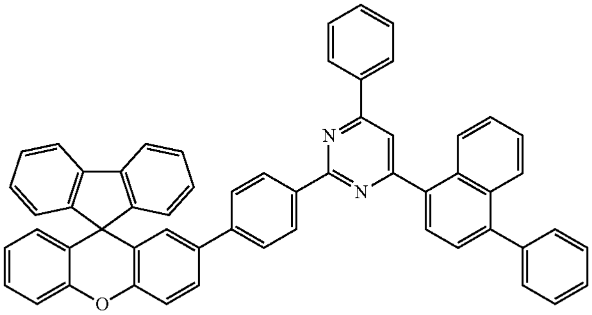
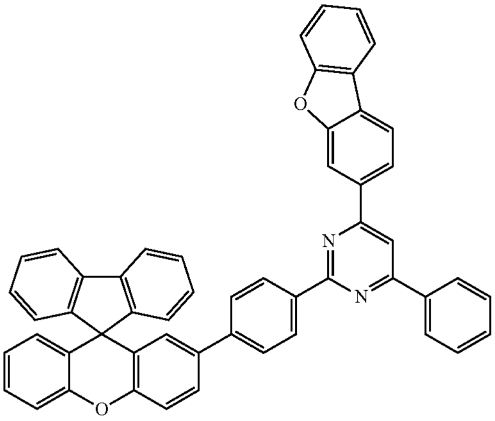
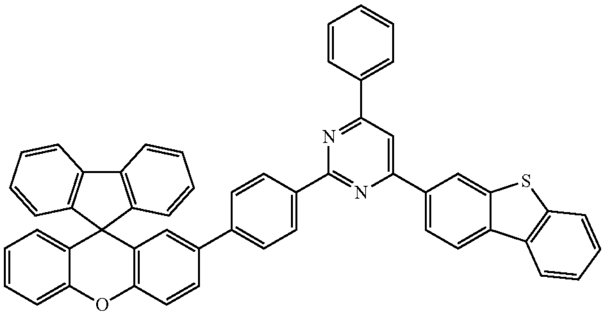
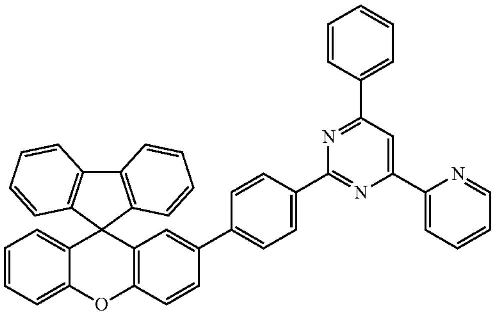
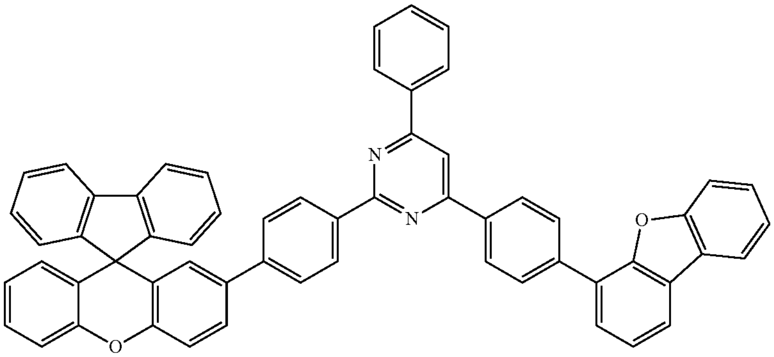
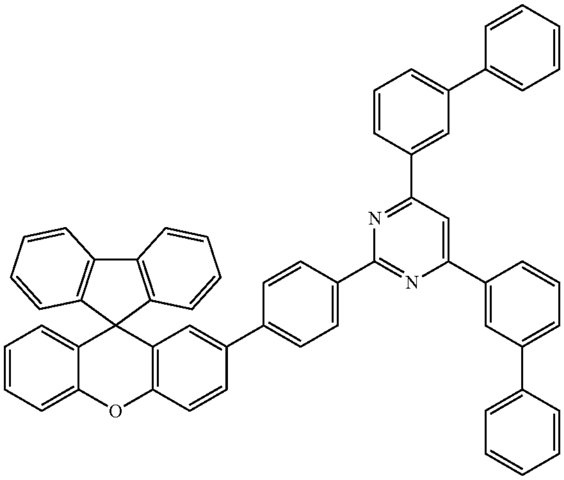

-continued
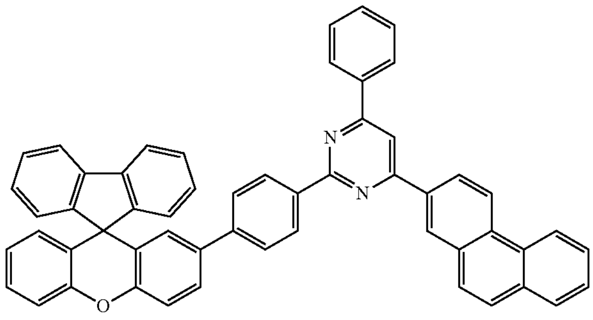
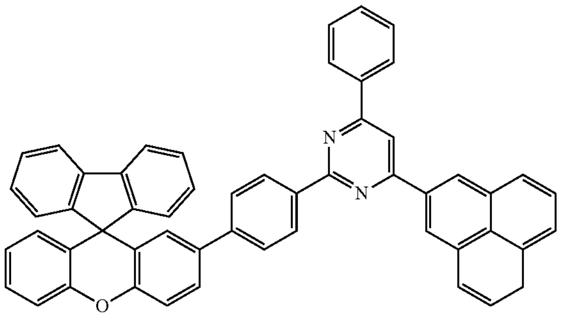
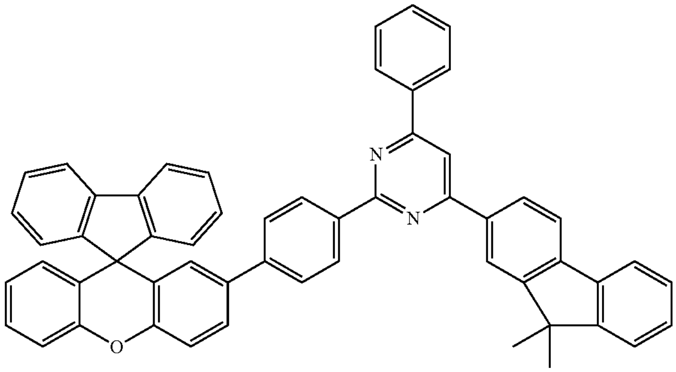
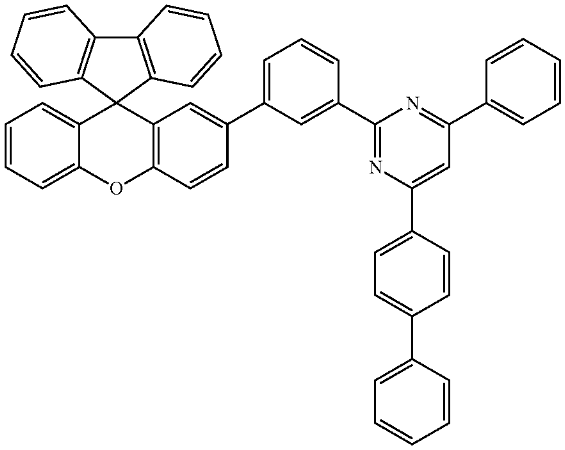
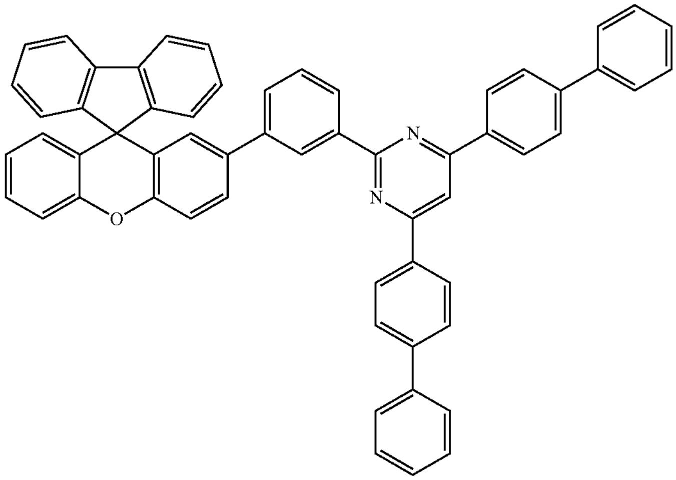

-continued
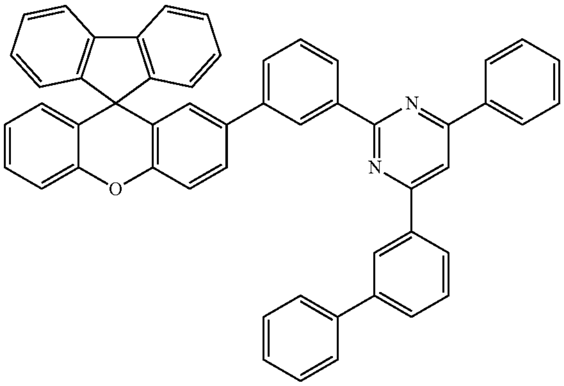
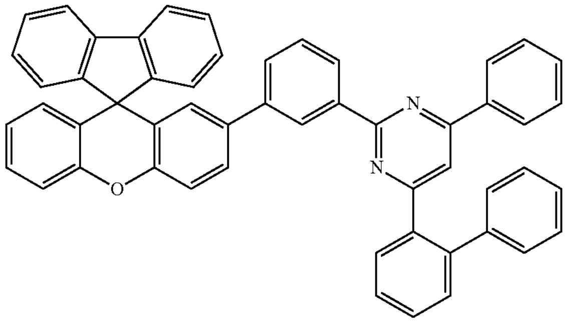
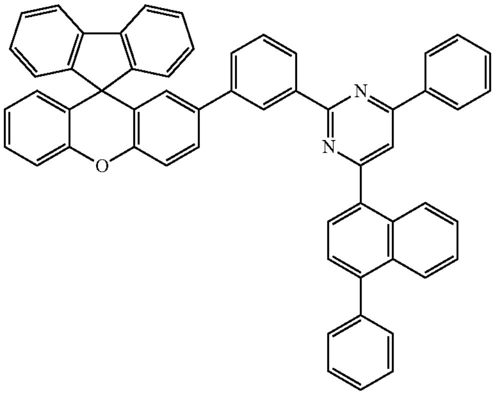
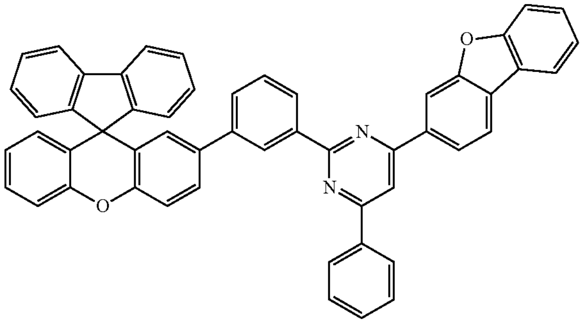
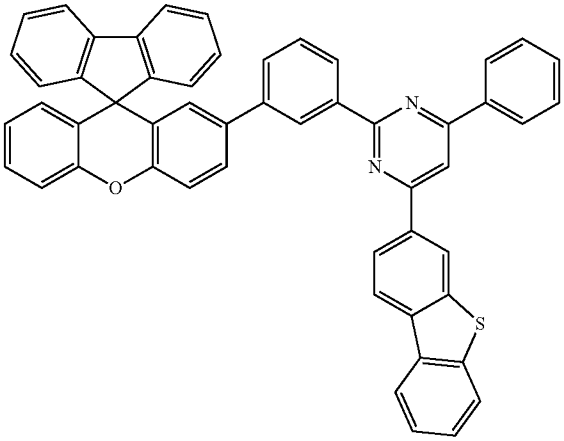
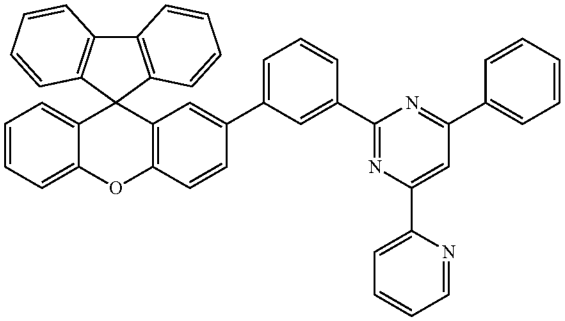
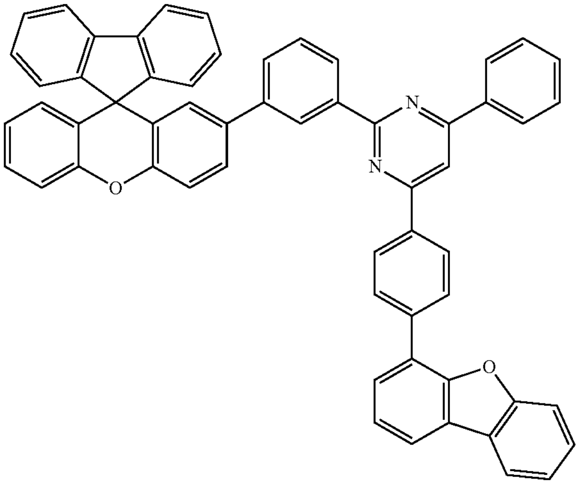

-continued
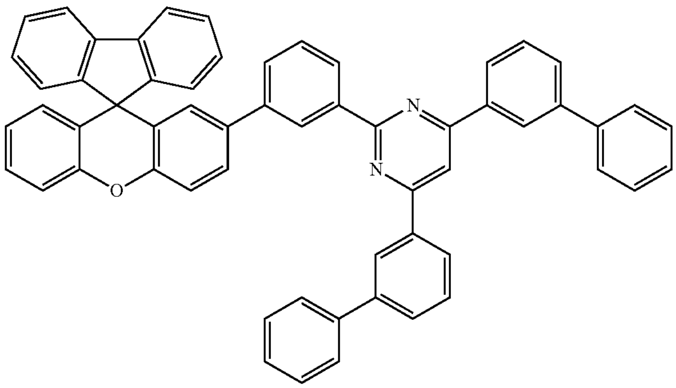
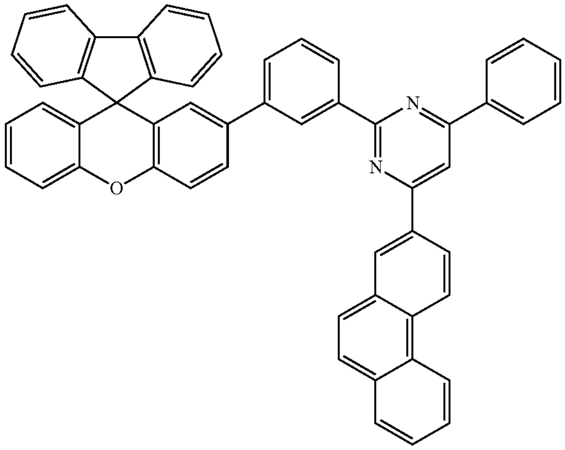
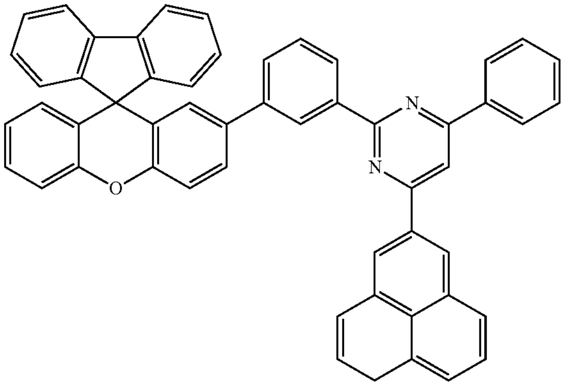
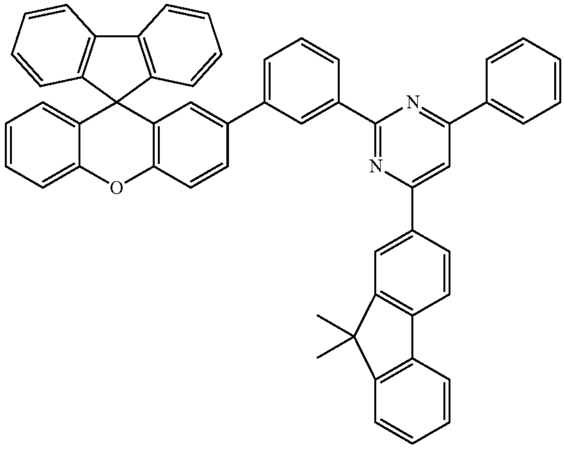
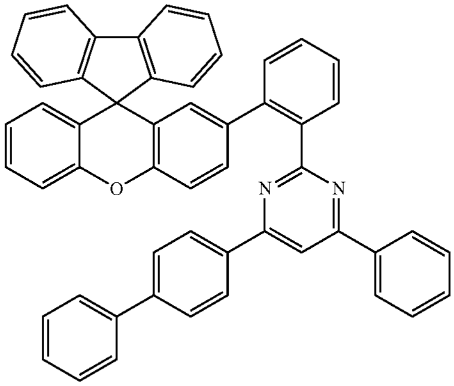
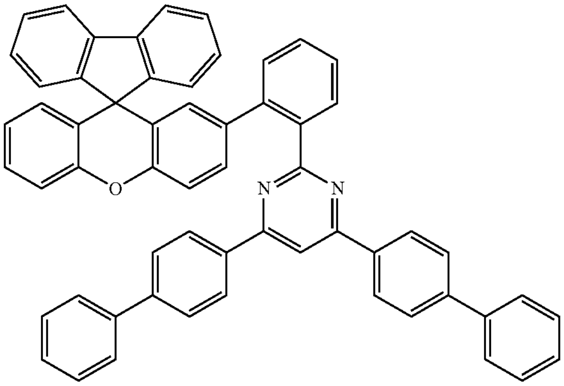

-continued
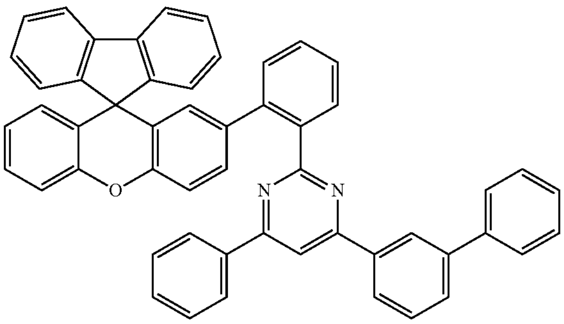
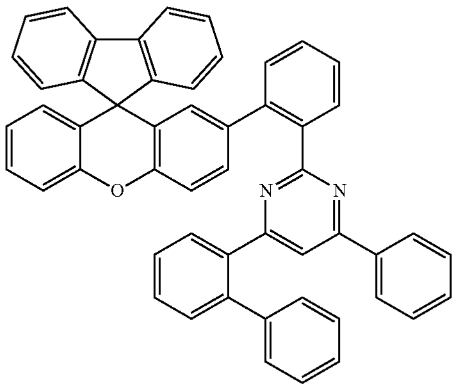
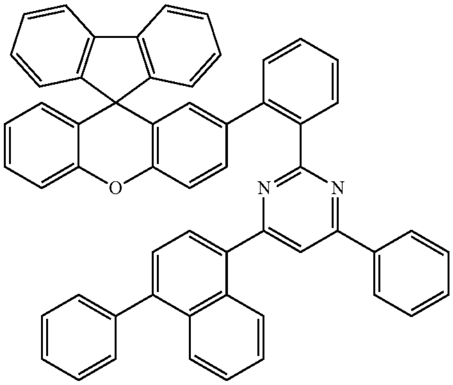
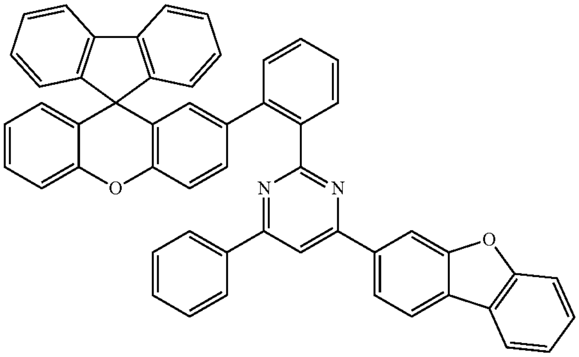
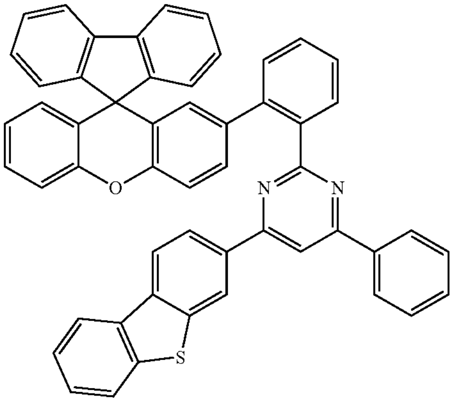
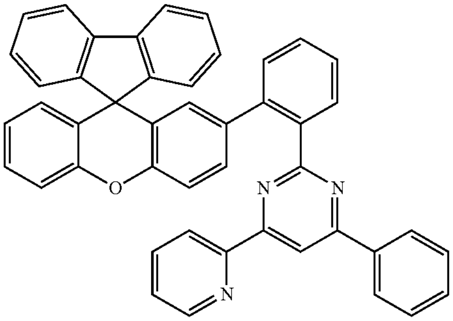
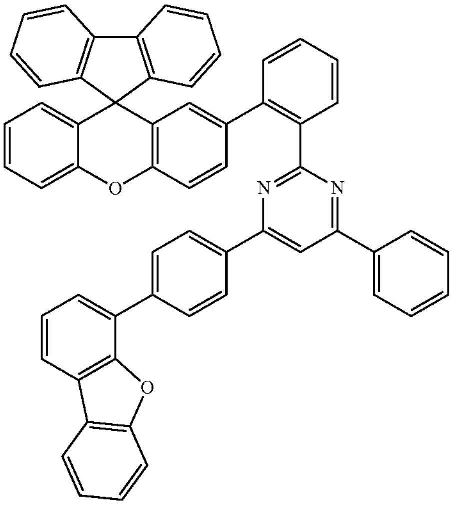
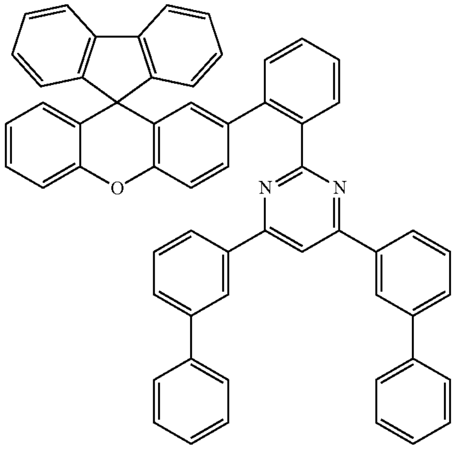

-continued
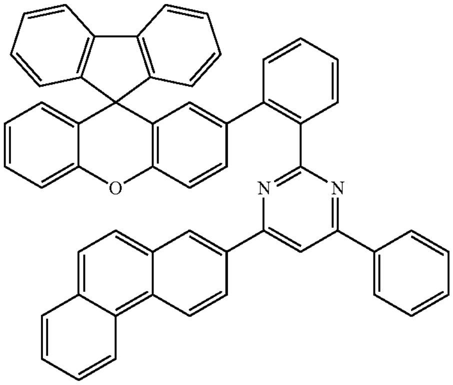
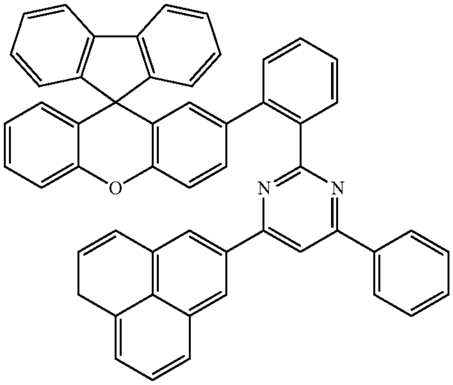
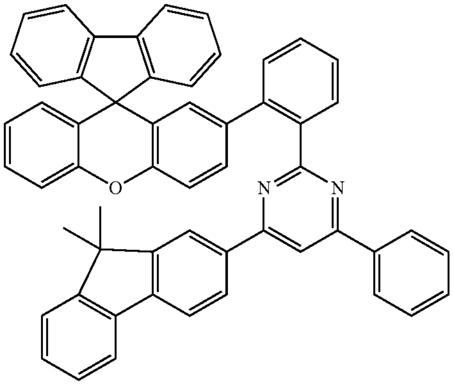
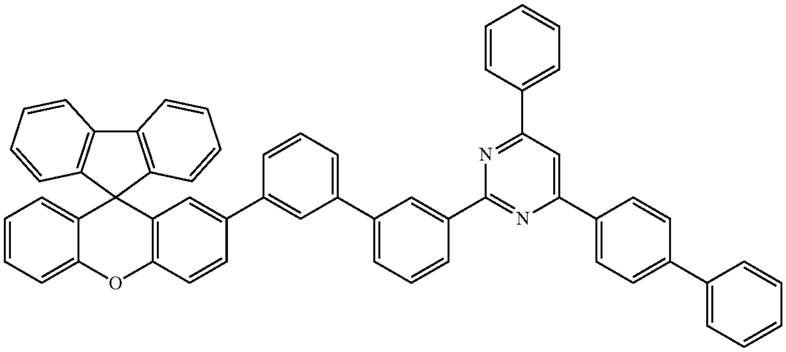
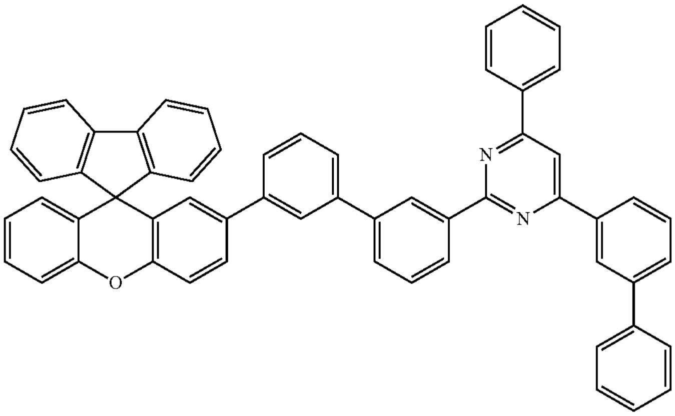

-continued
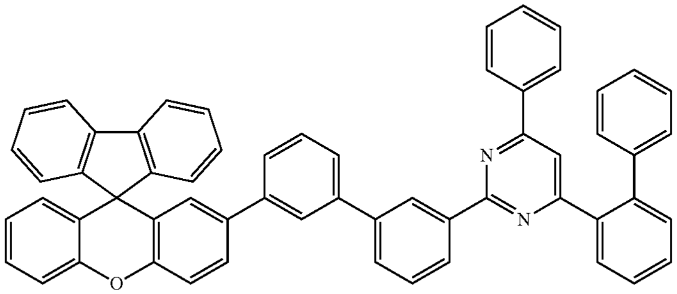 [SMILES: c1ccc(-c2cc(-c3ccccc3-c3ccccc3)nc(-c3cccc(-c4cccc(-c5ccc6c(c5)C5(c7ccccc7O6)c6ccccc6-c6ccccc65)c4)c3)n2)cc1]
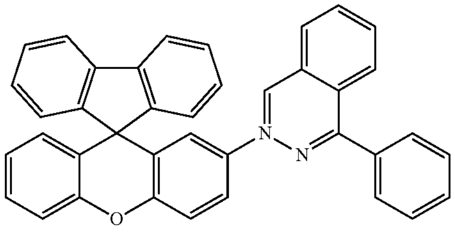
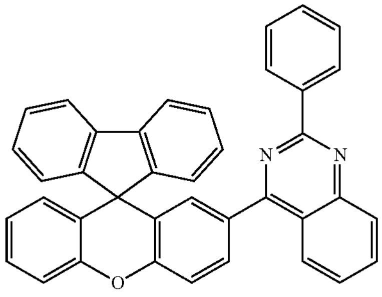
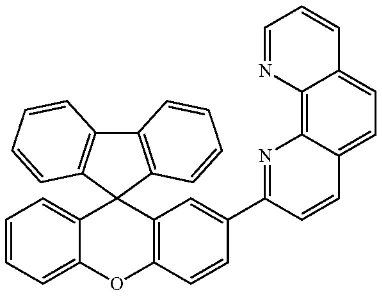
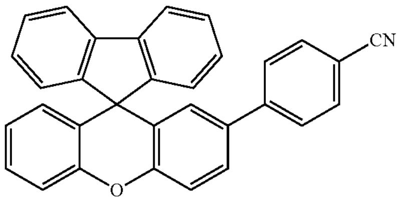
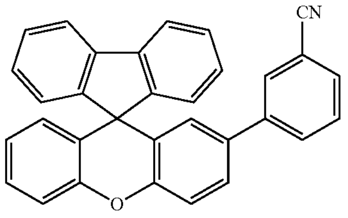
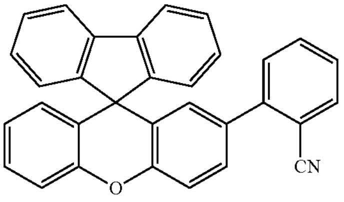
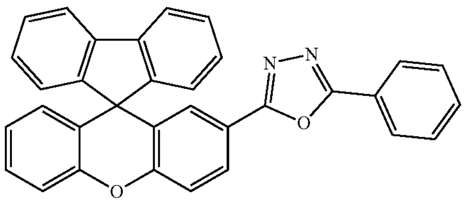
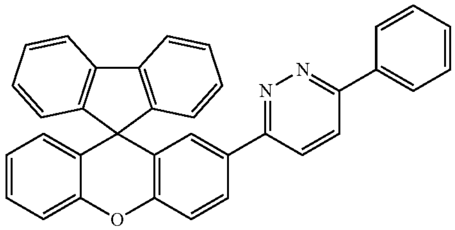
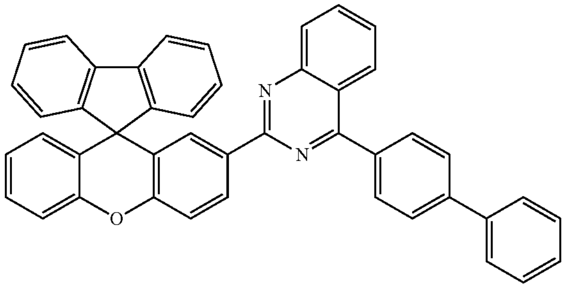
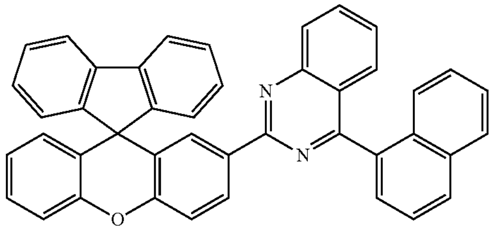

-continued
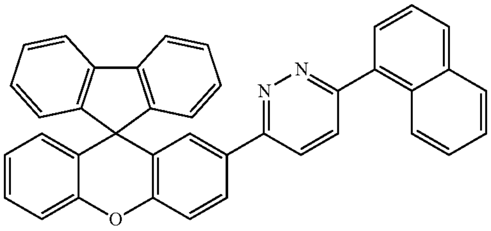
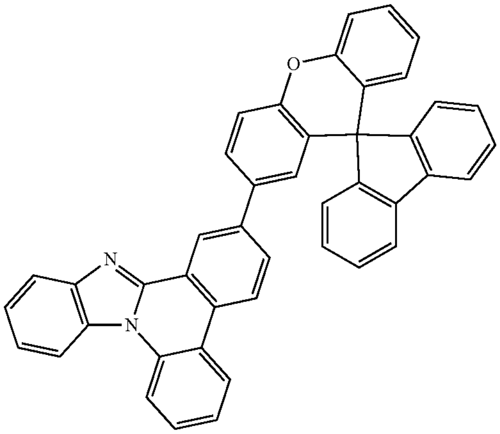
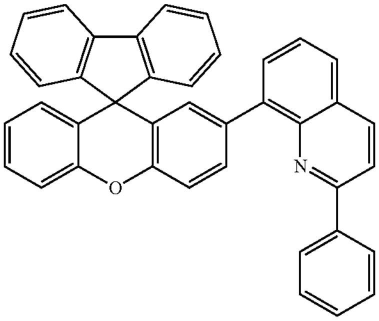
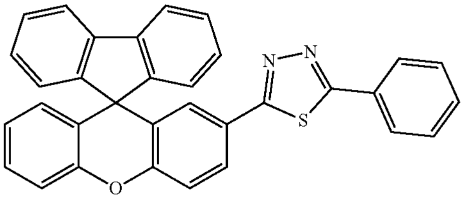
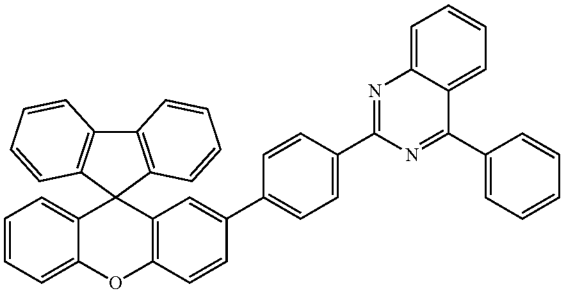
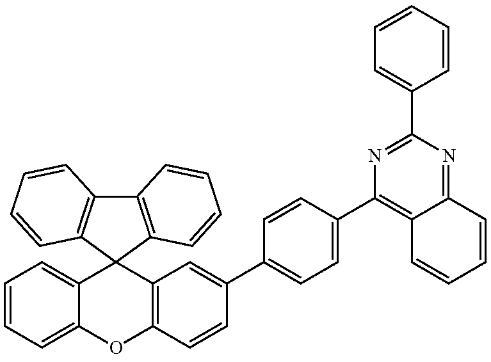
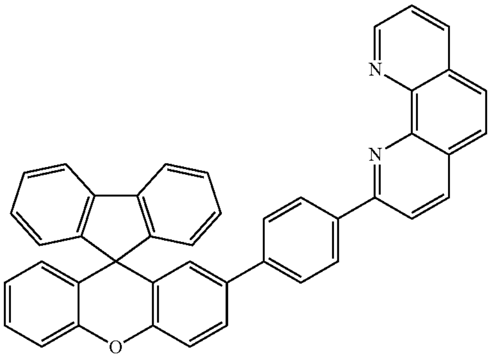

-continued
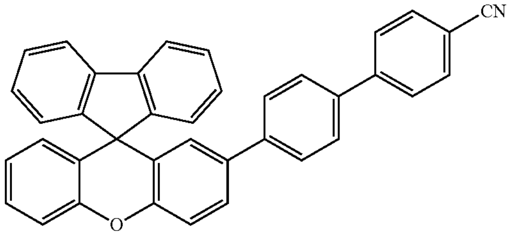
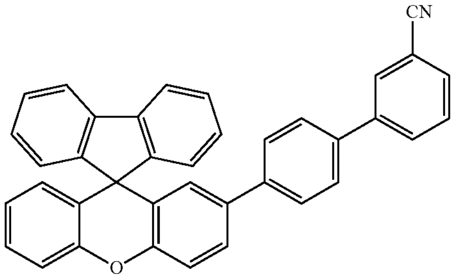
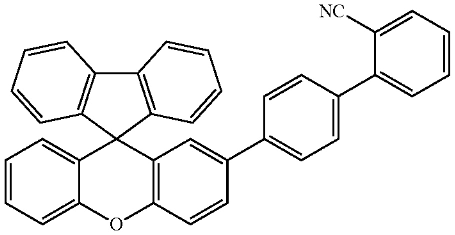
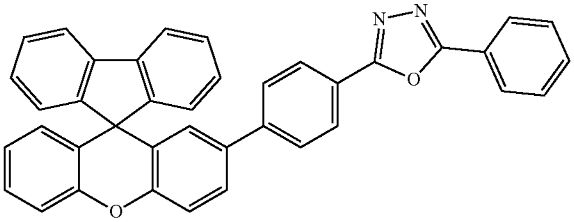
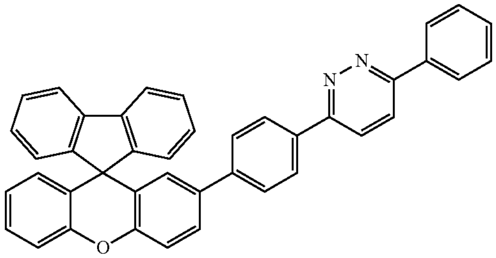
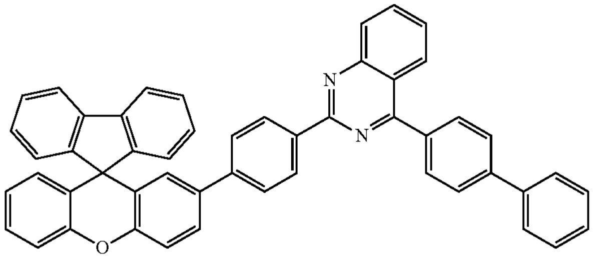
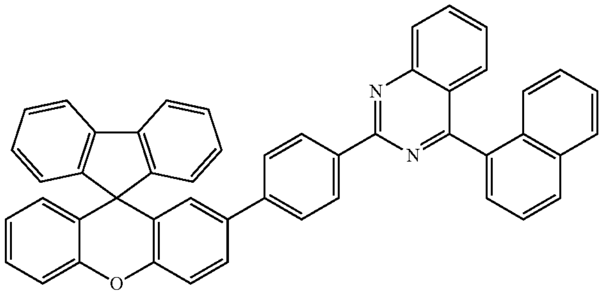
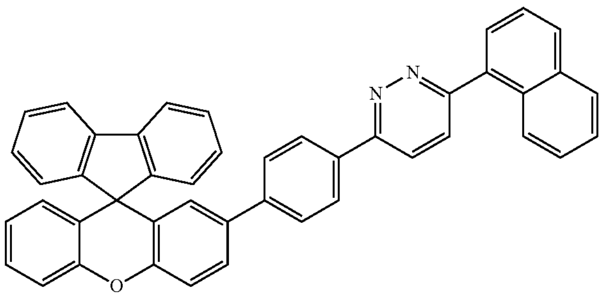
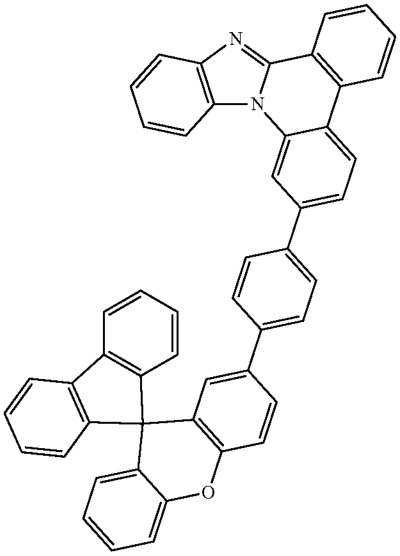

-continued
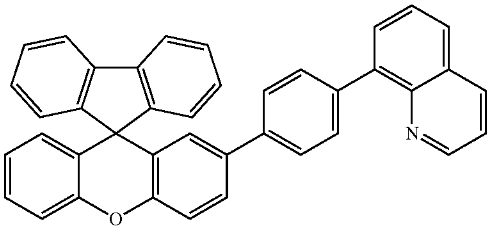
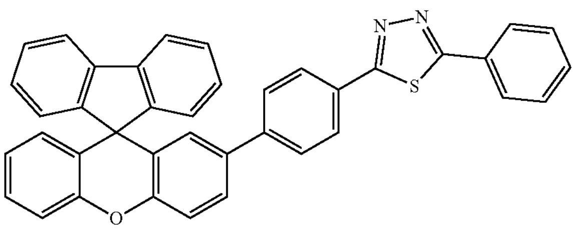
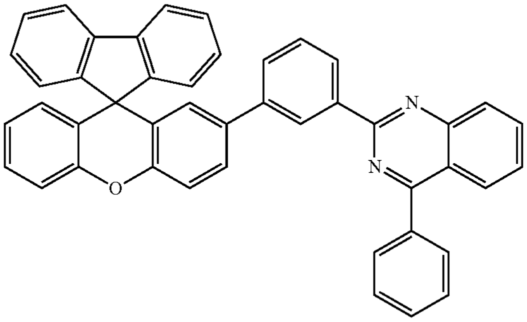
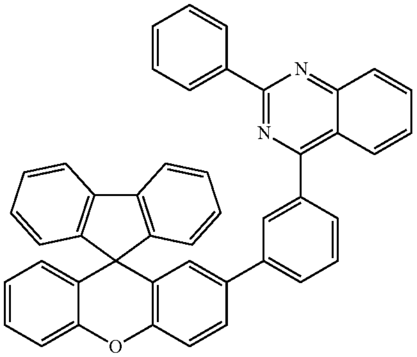
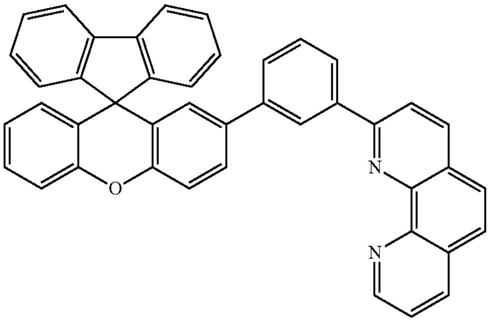
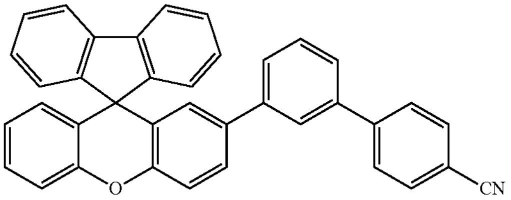
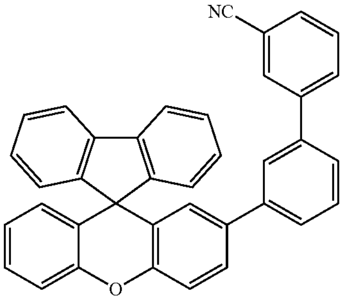
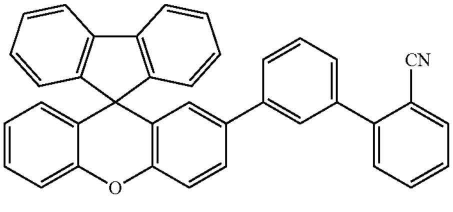
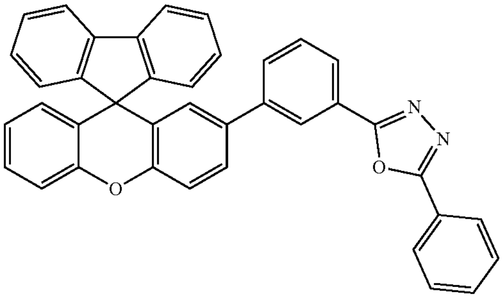
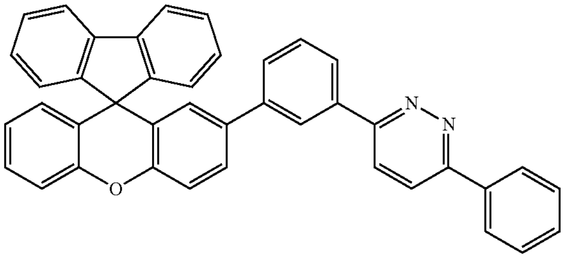

-continued
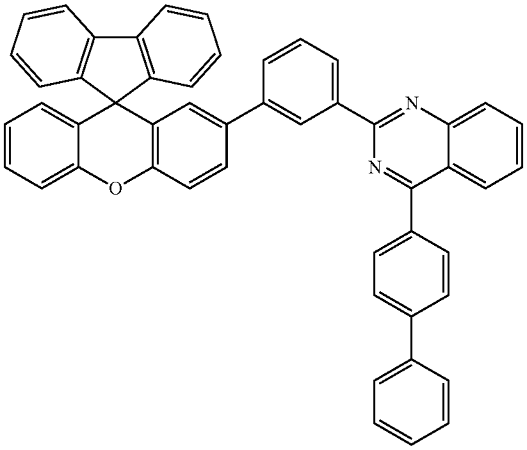
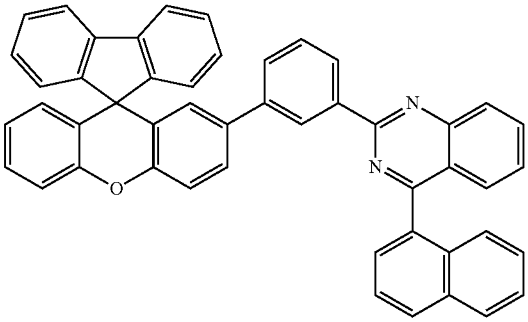
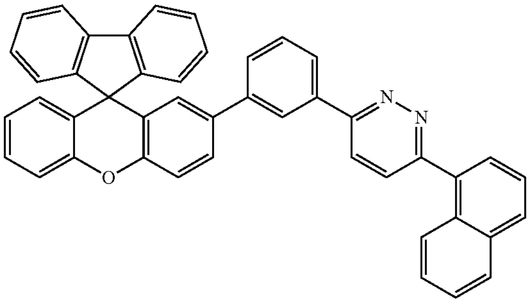
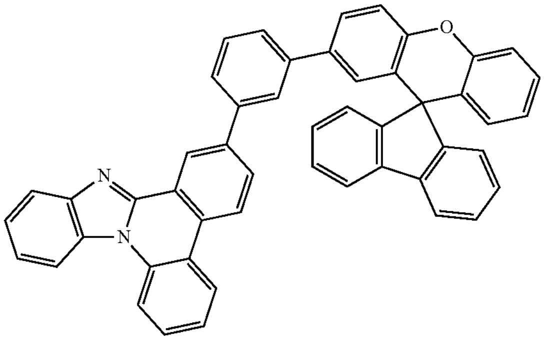
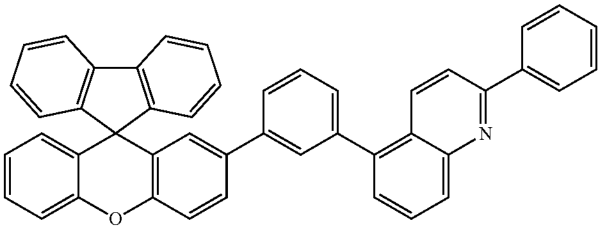
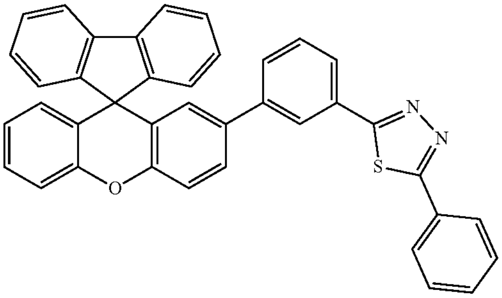
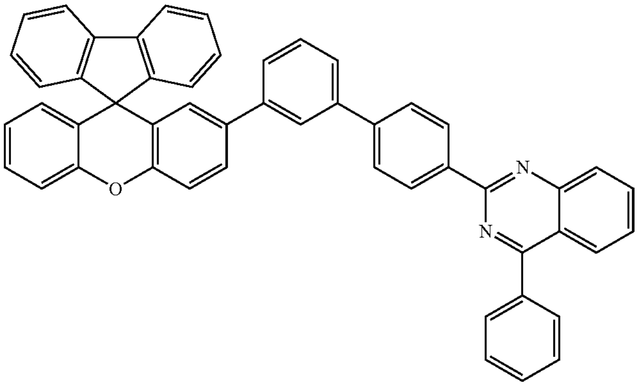
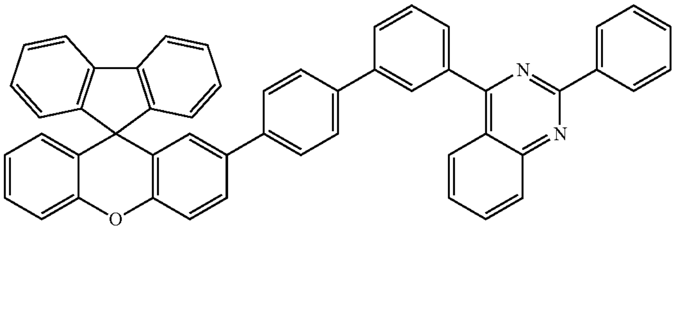

-continued
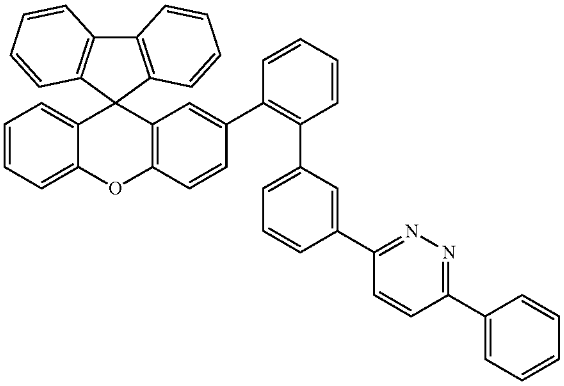
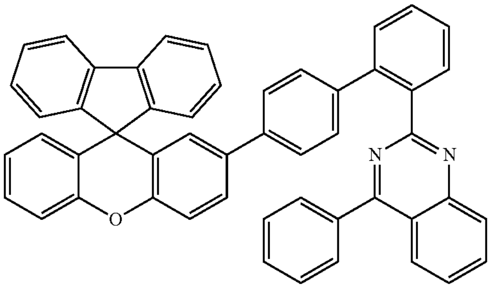
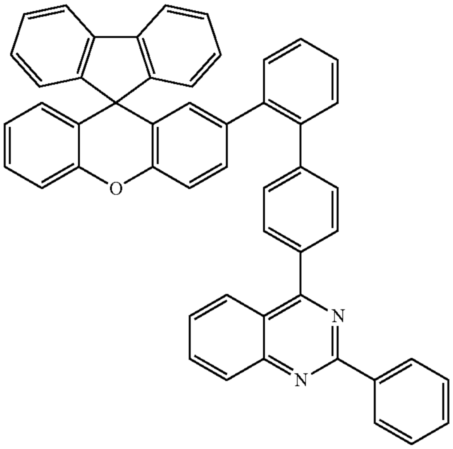
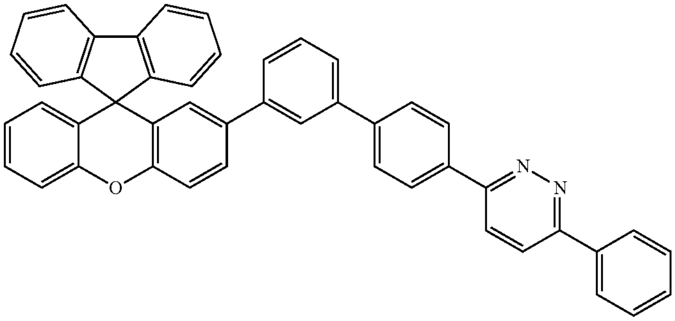
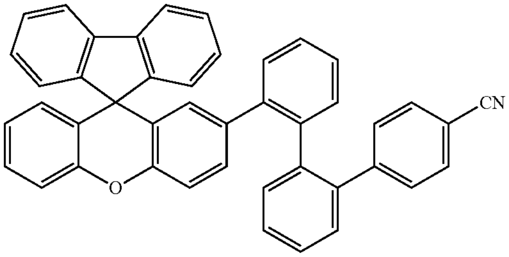

-continued
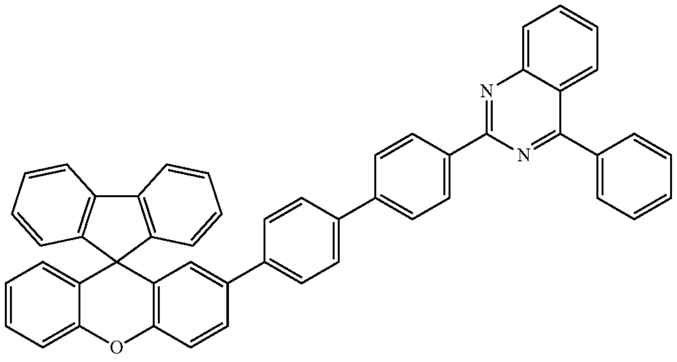
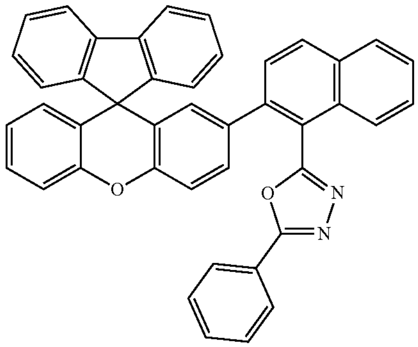
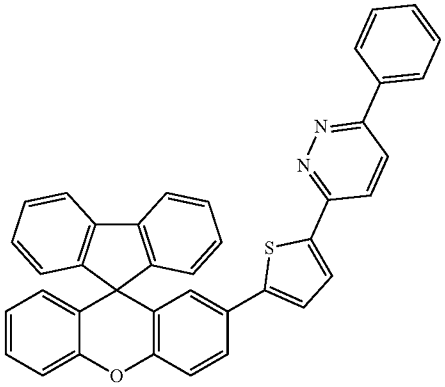
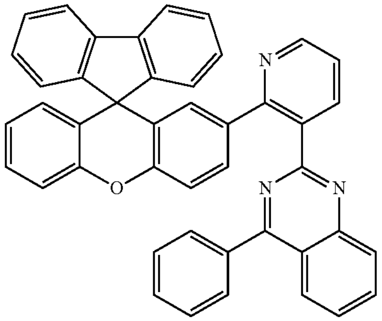
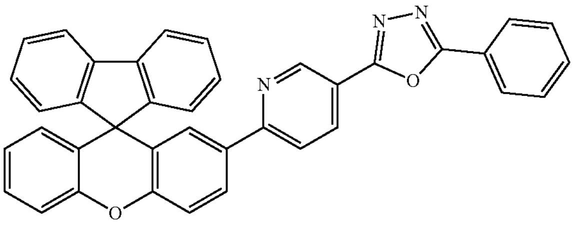
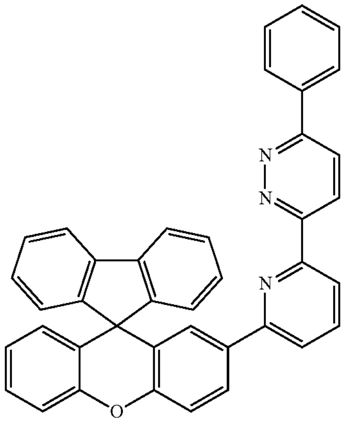
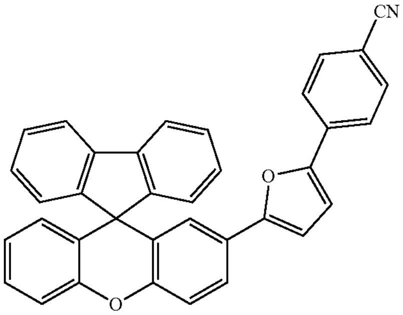

-continued
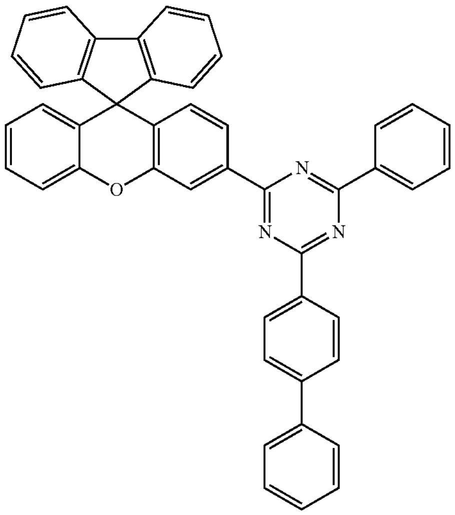
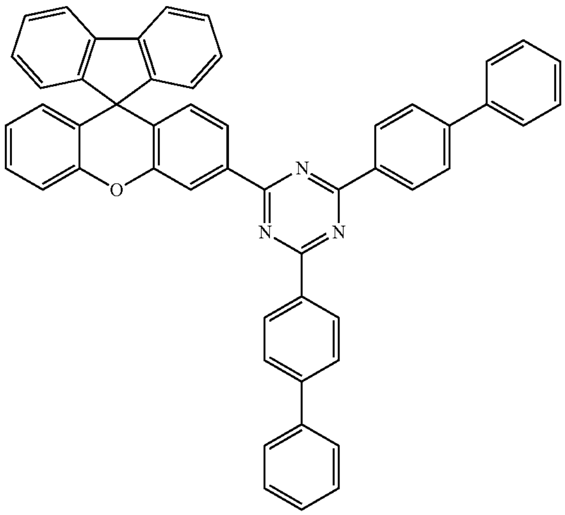
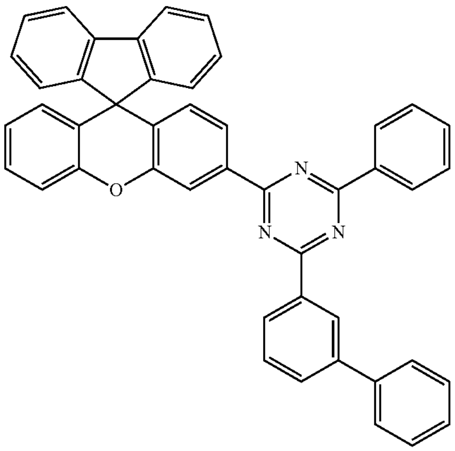
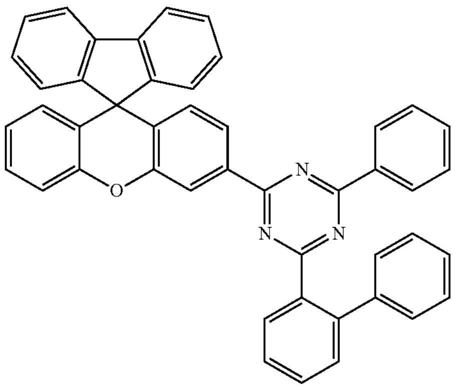

-continued
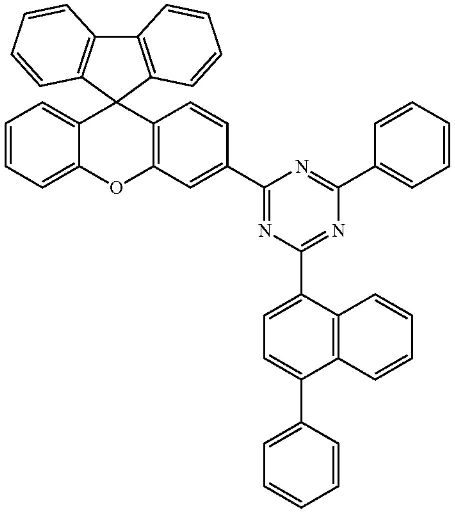
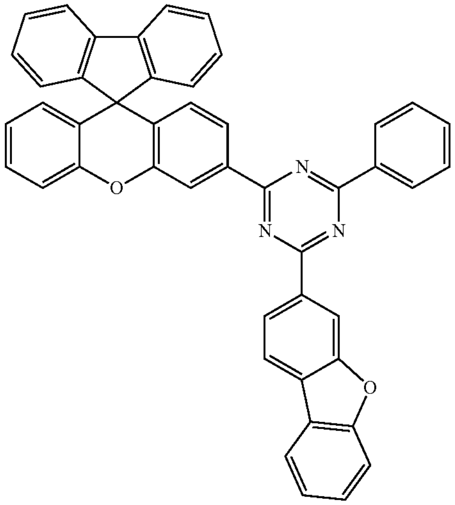
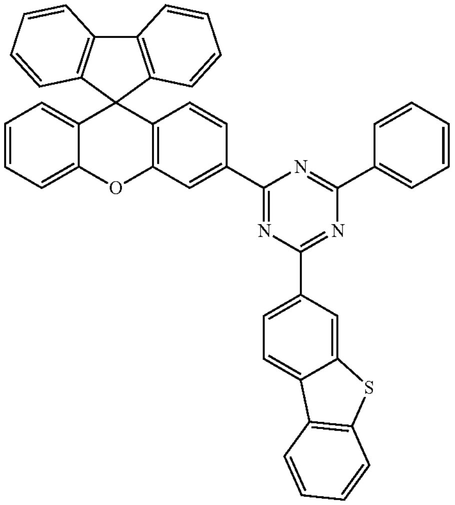
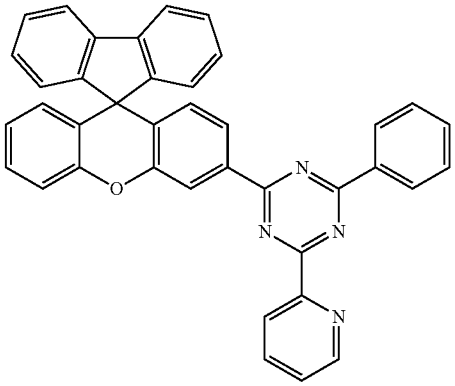
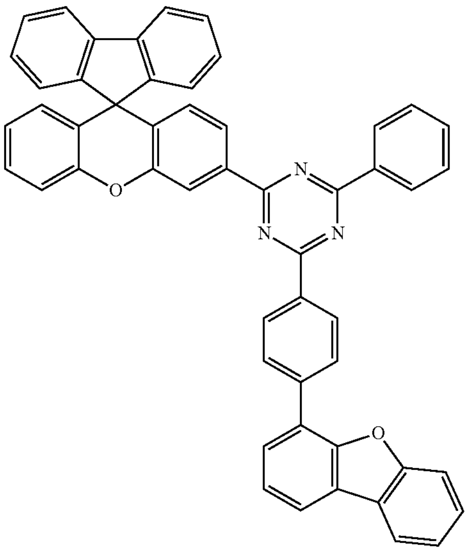

-continued
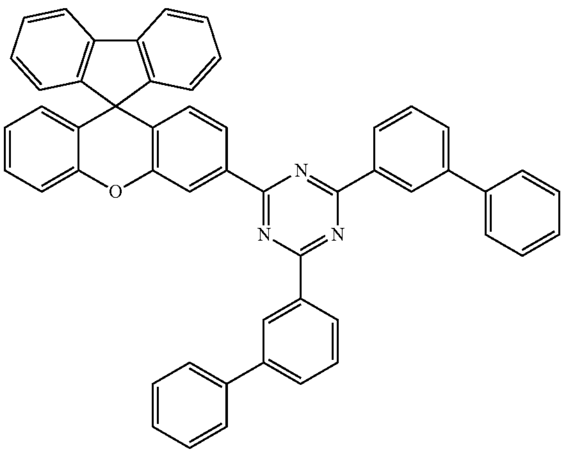
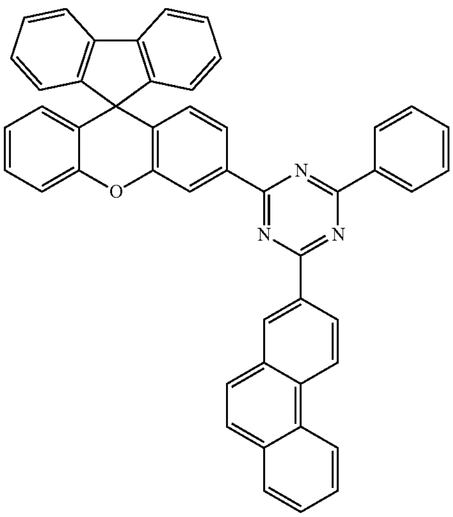
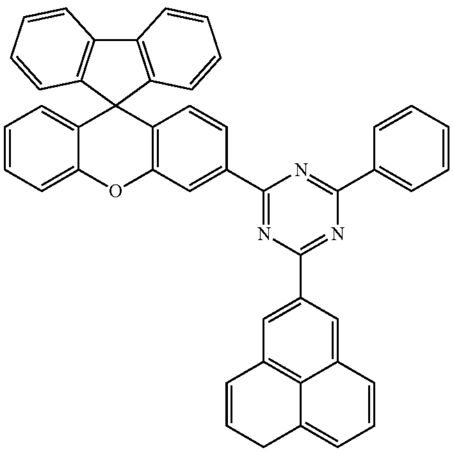
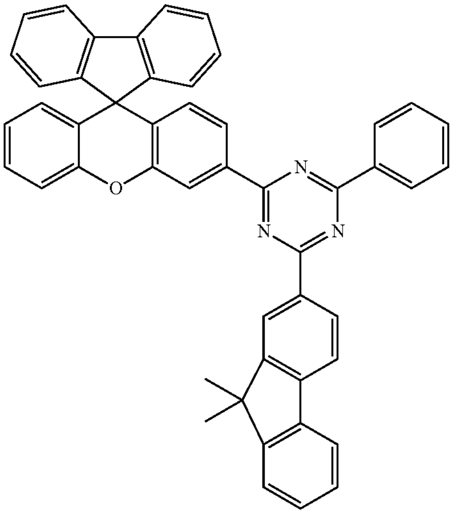
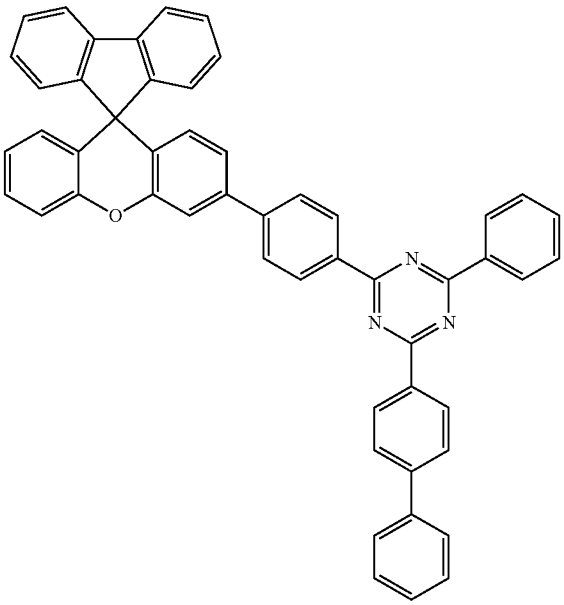

-continued
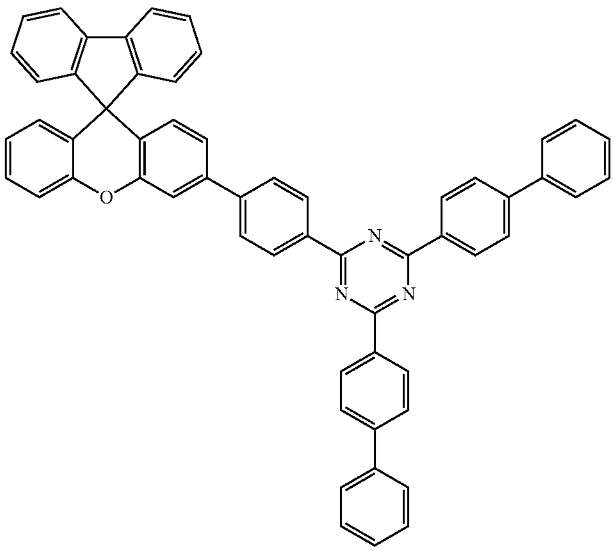
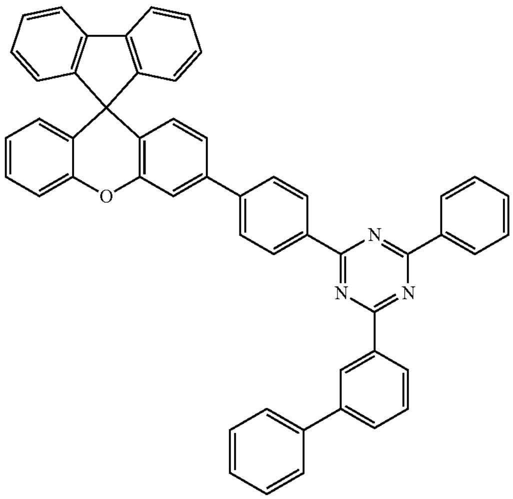
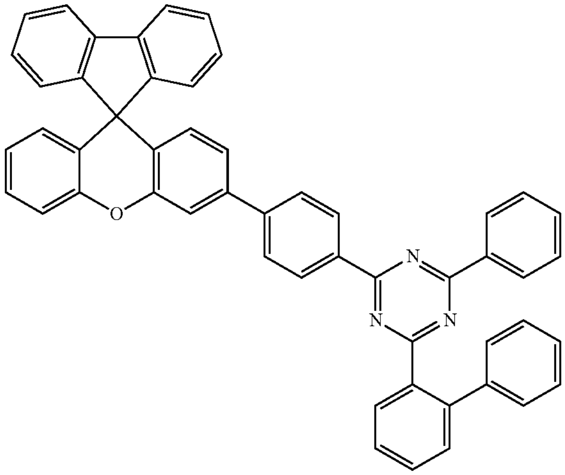 [SMILES: c1ccc(-c2nc(-c3ccc(-c4ccc5c(c4)Oc4ccccc4C54c5ccccc5-c5ccccc54)cc3)nc(-c3ccccc3-c3ccccc3)n2)cc1]

-continued
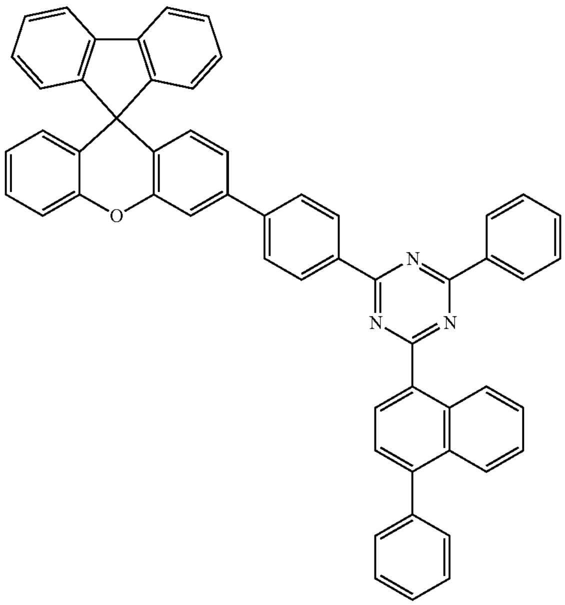 [SMILES: c1ccc(-c2nc(-c3ccc(-c4ccc5c(c4)Oc4ccccc4C54c5ccccc5-c5ccccc54)cc3)nc(-c3ccc(-c4ccccc4)c4ccccc34)n2)cc1]
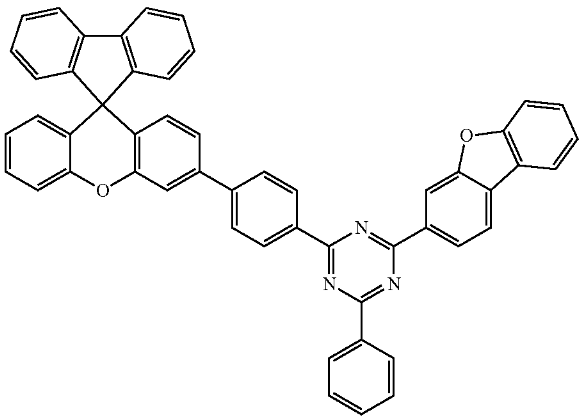
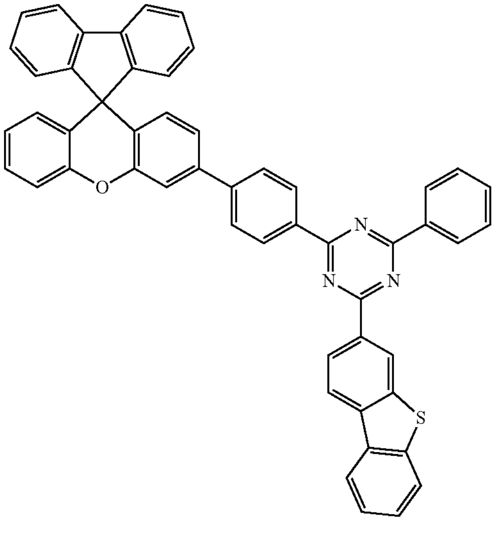

-continued
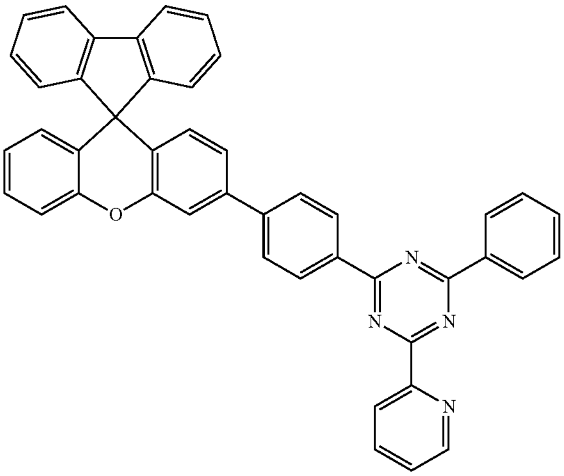
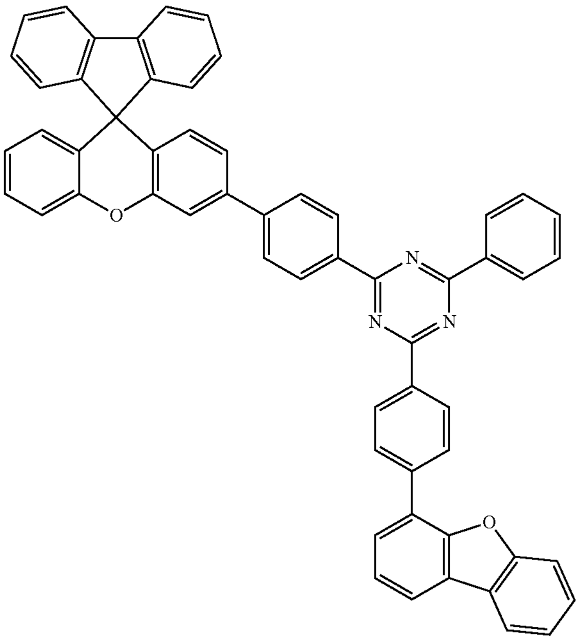
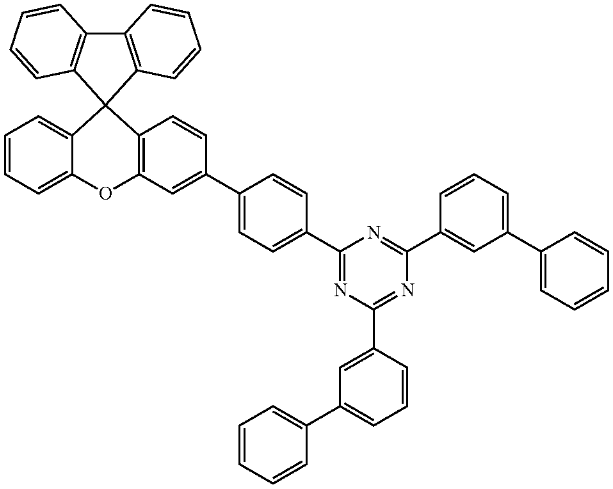
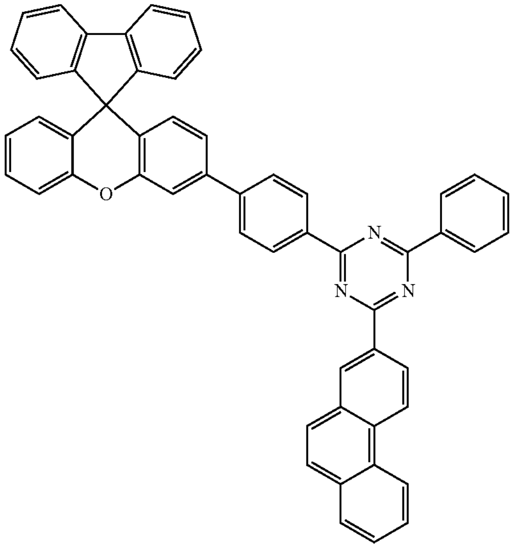

-continued
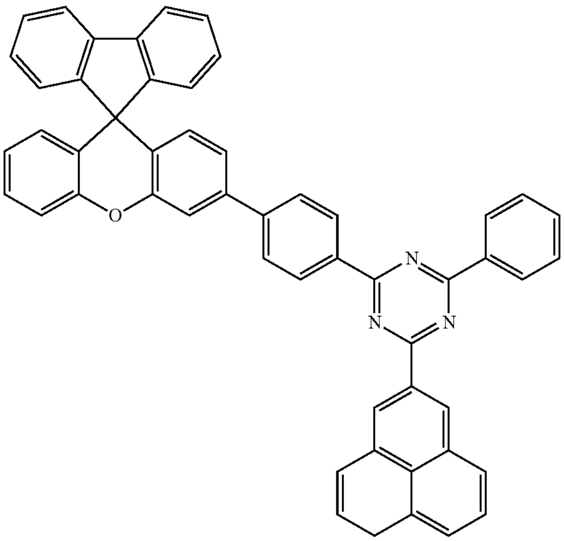
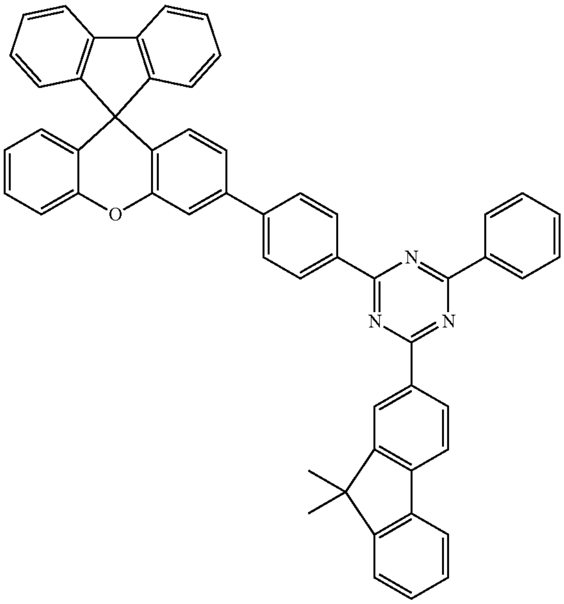
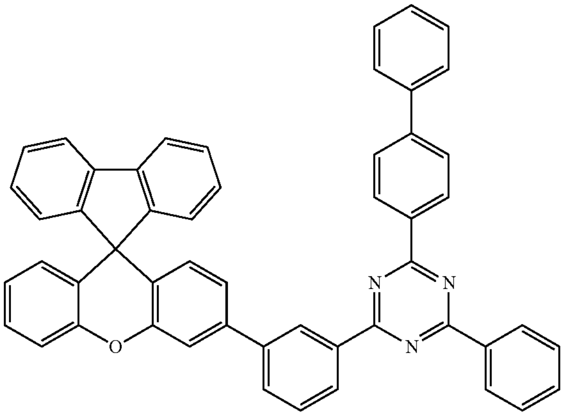
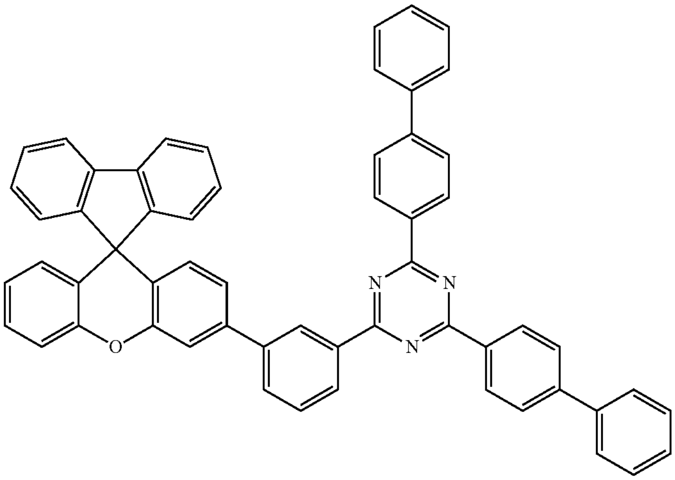
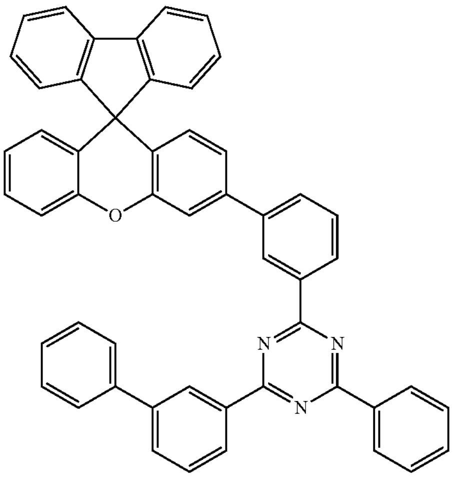

-continued
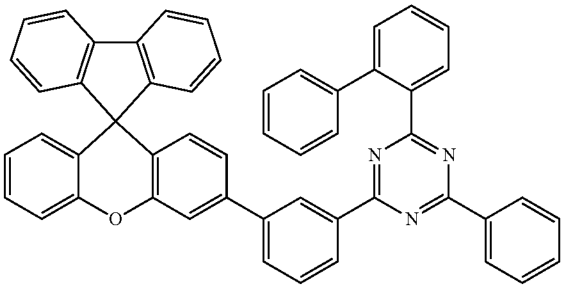
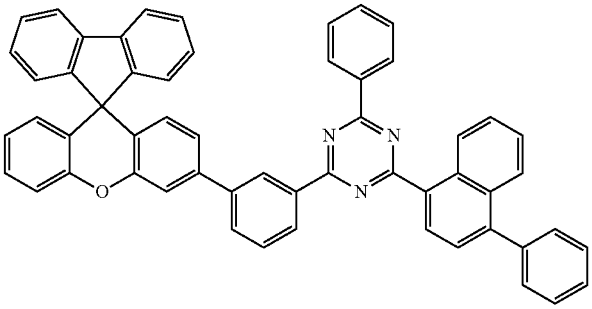
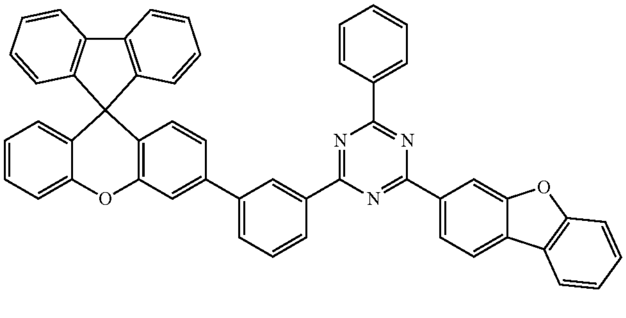
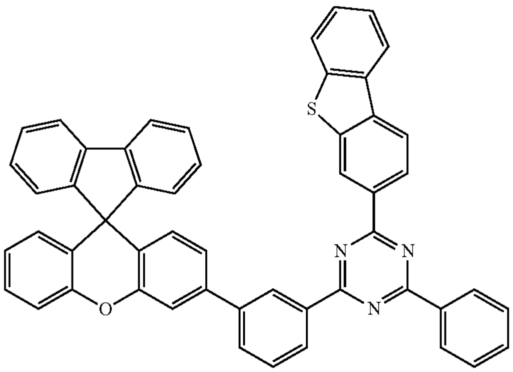
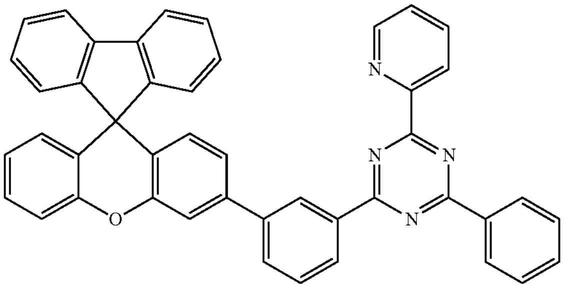
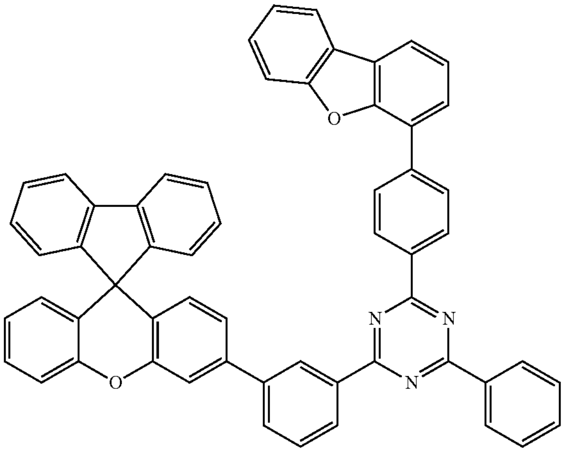

-continued
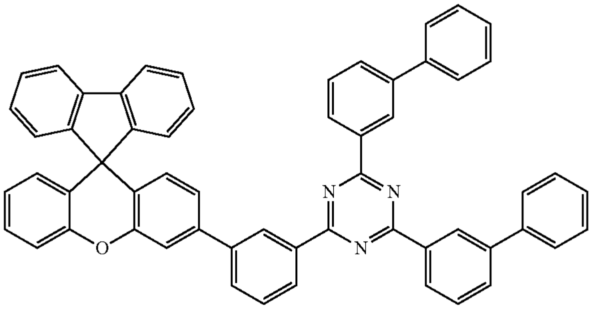
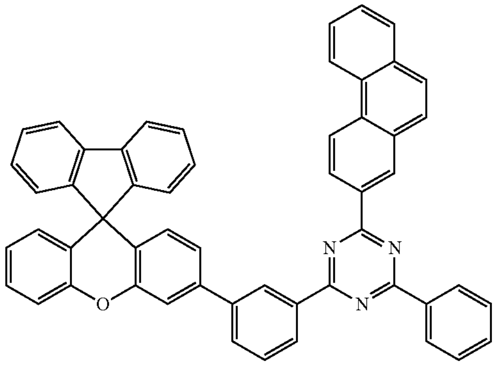
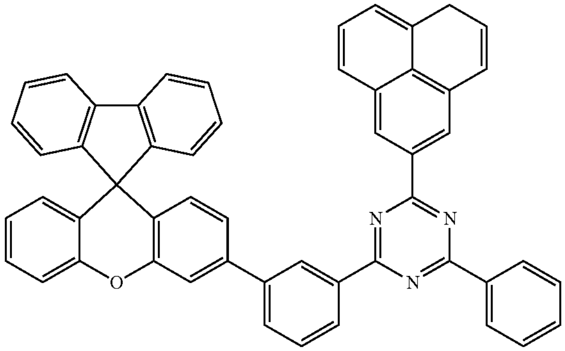
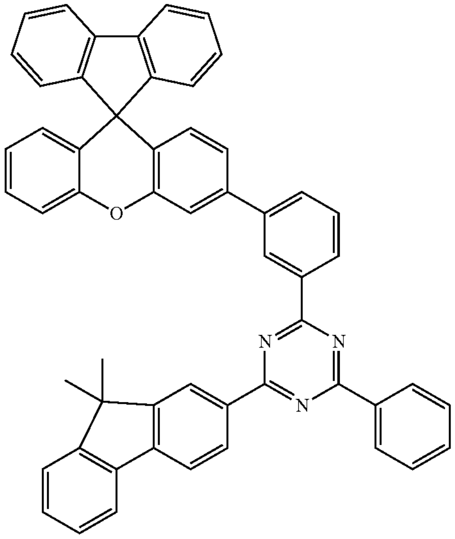
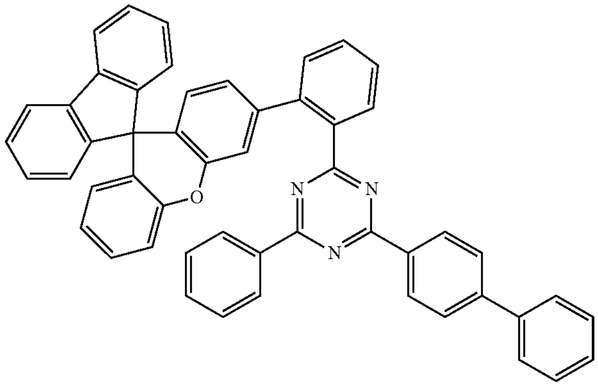
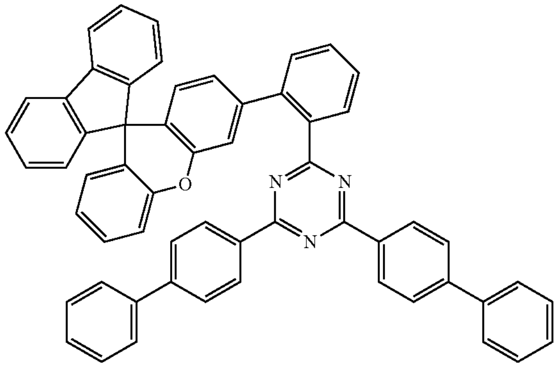
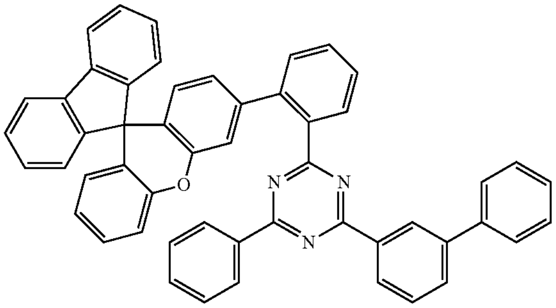

-continued
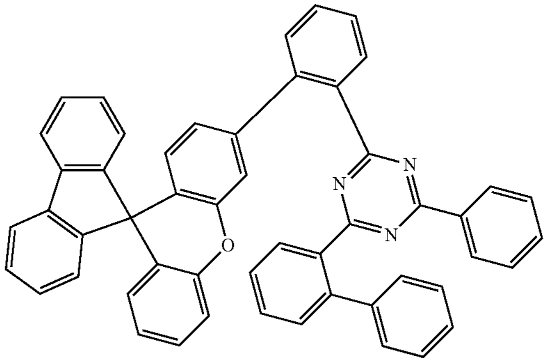
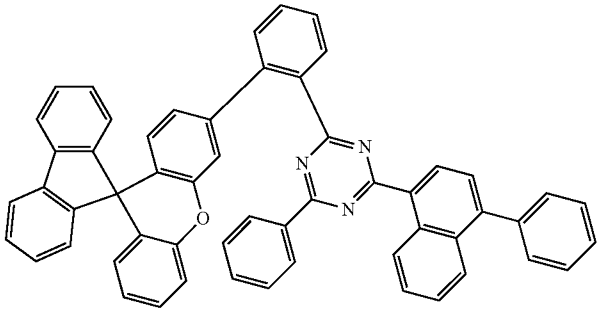
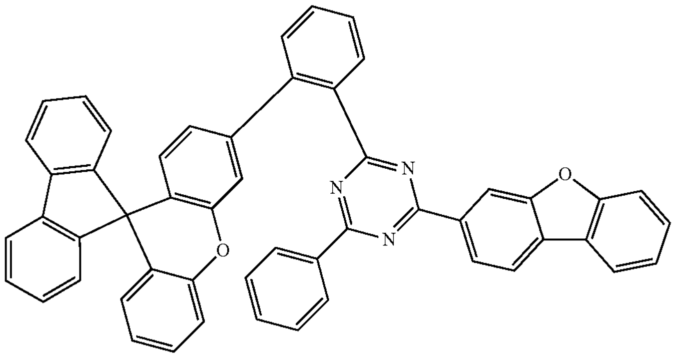
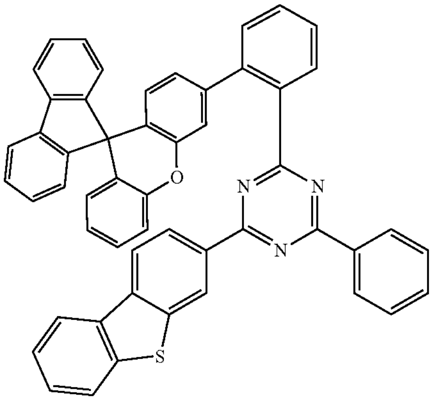
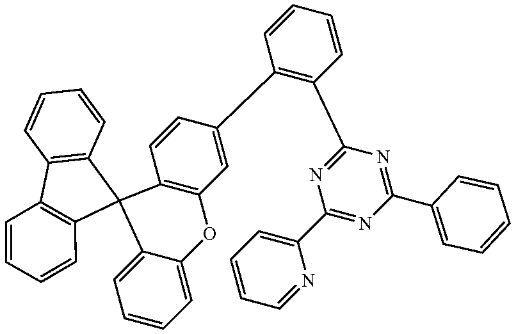
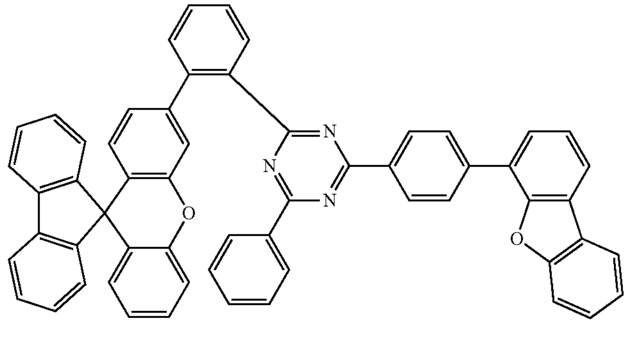

-continued
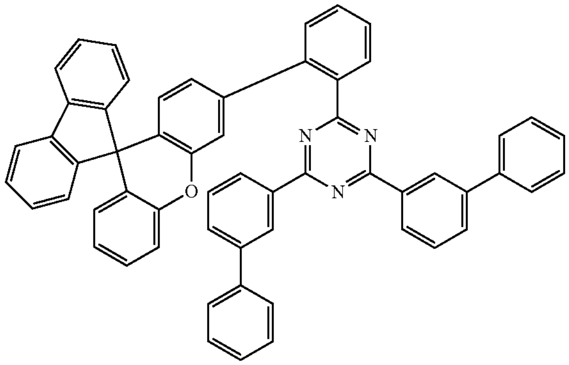
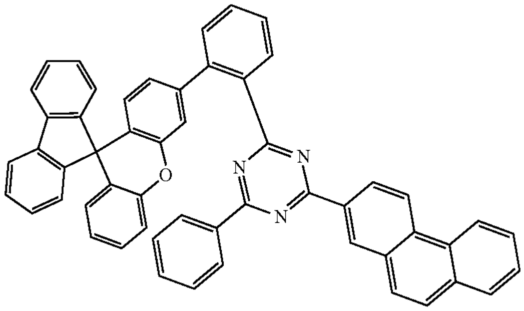
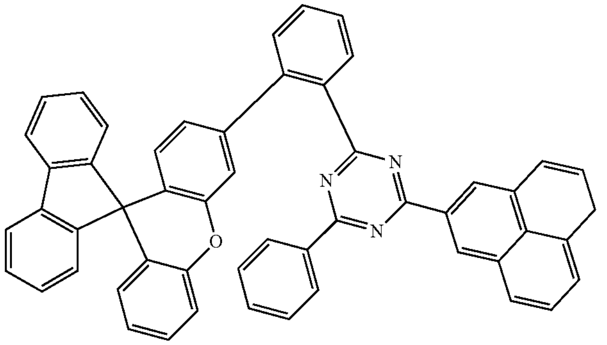
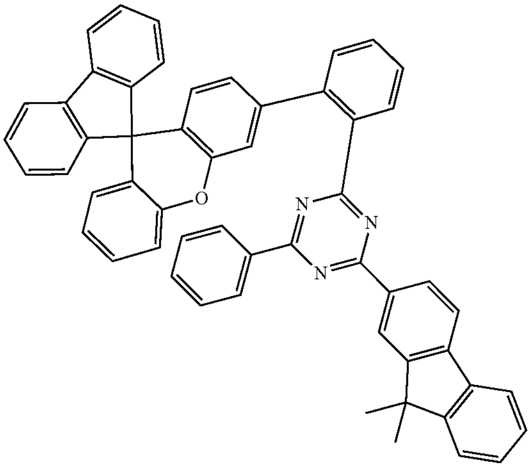
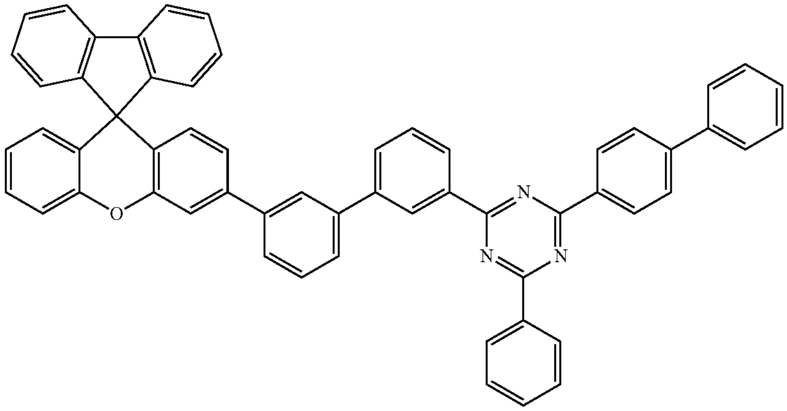
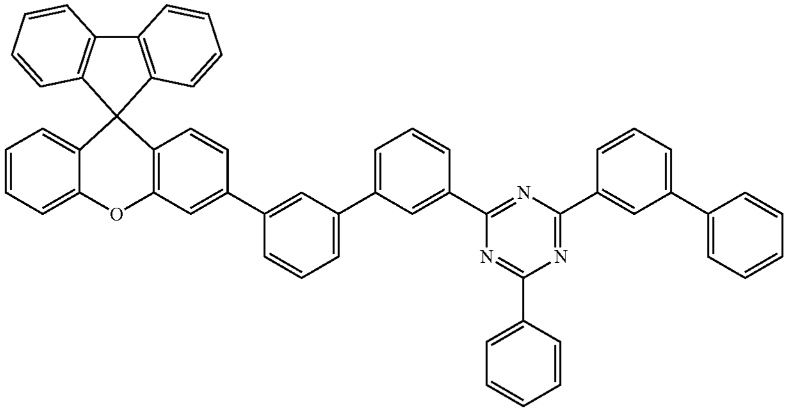

-continued
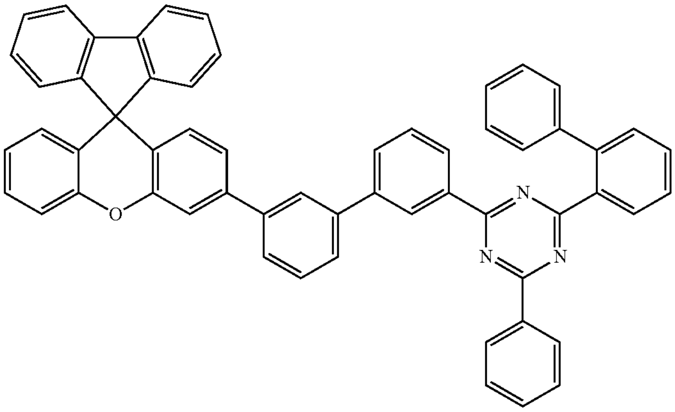 [SMILES: c1ccc(-c2nc(-c3cccc(-c4cccc(-c5ccc6c(c5)Oc5ccccc5C65c6ccccc6-c6ccccc65)c4)c3)nc(-c3ccccc3-c3ccccc3)n2)cc1]
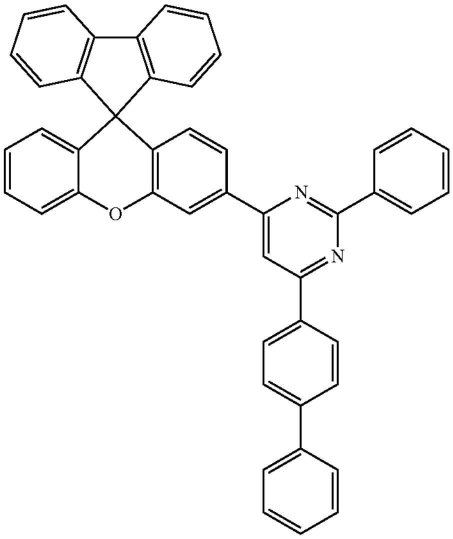
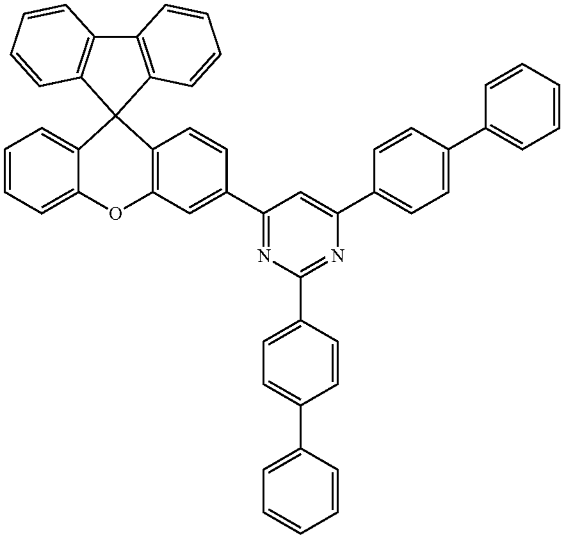
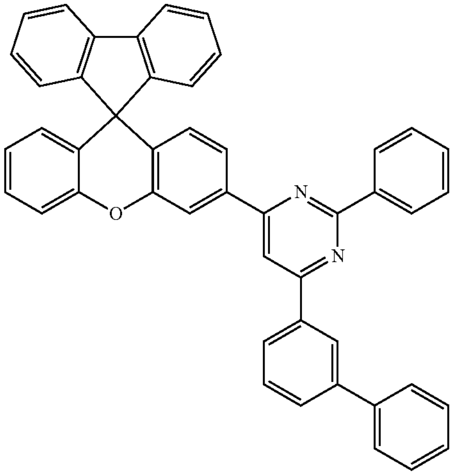

-continued
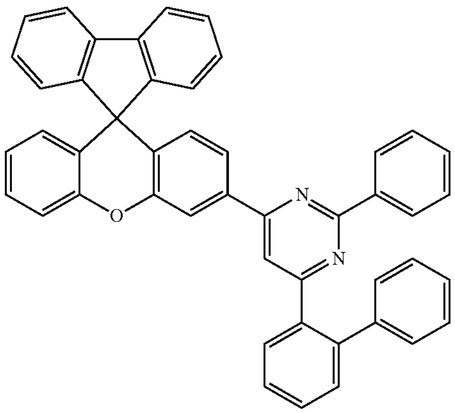
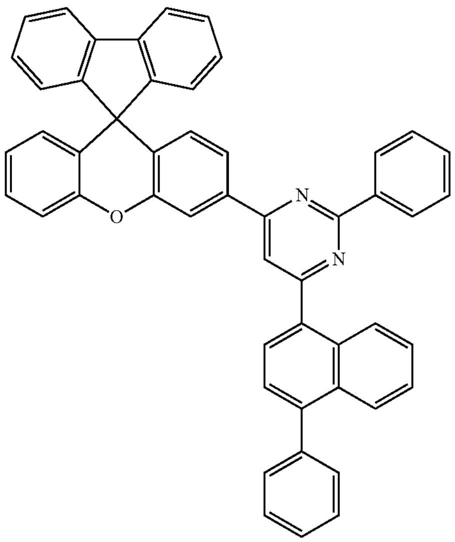
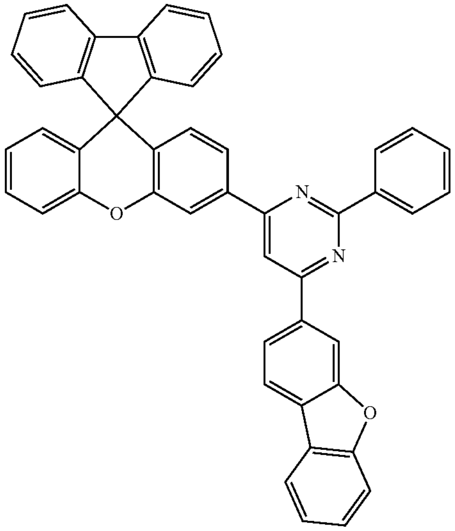
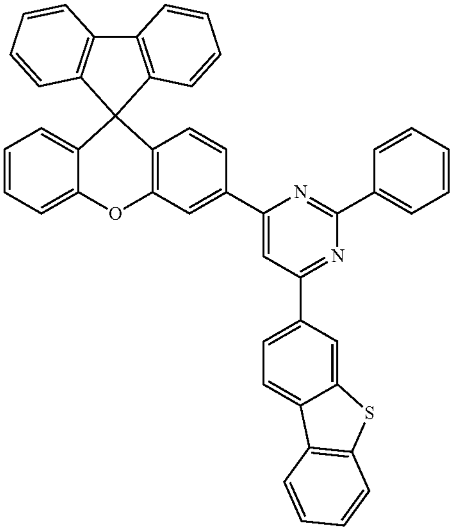

-continued
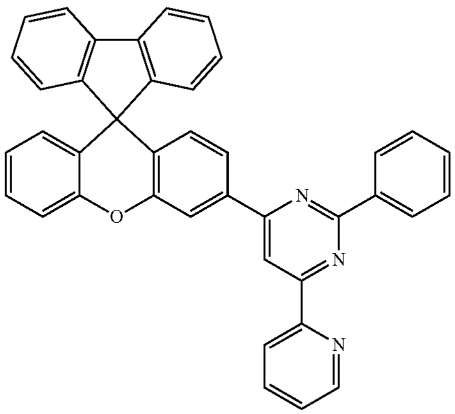
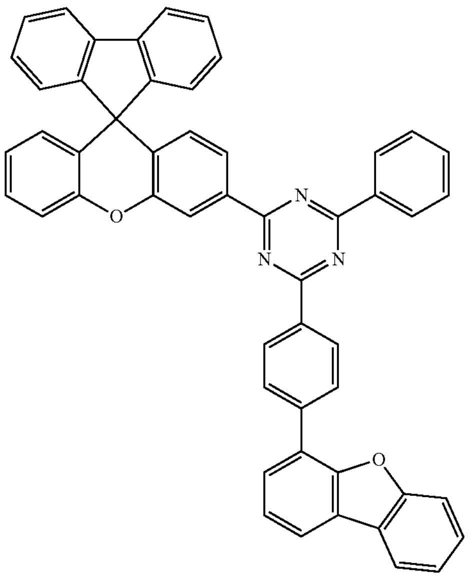
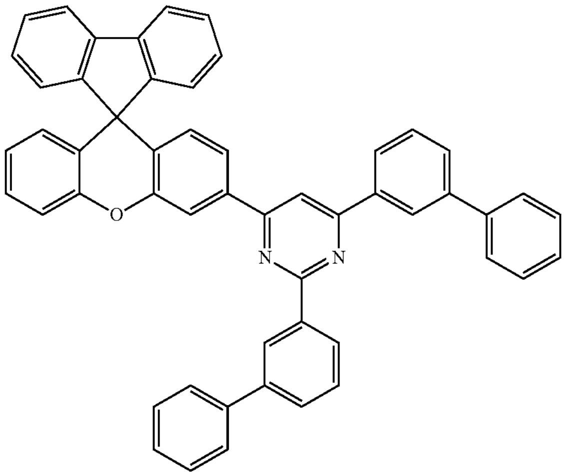
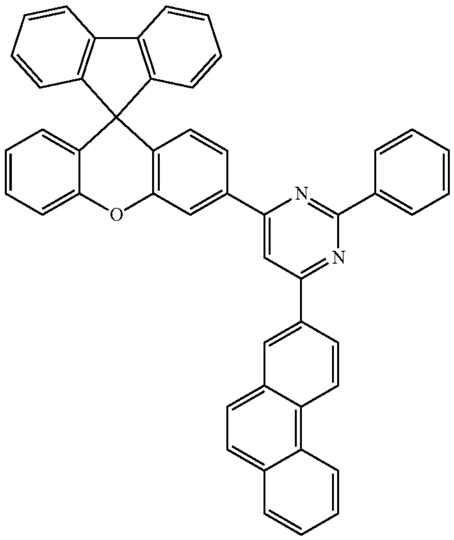
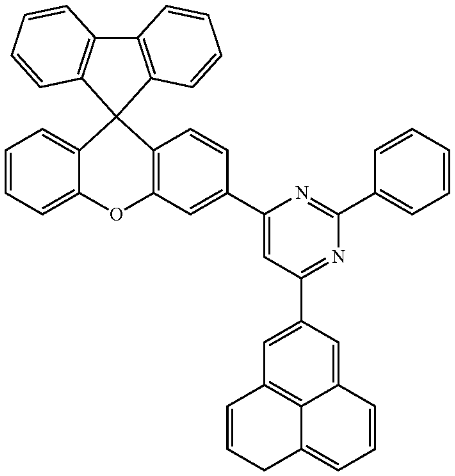
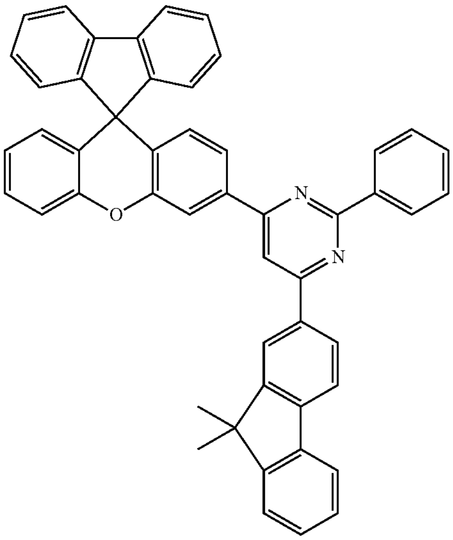

-continued
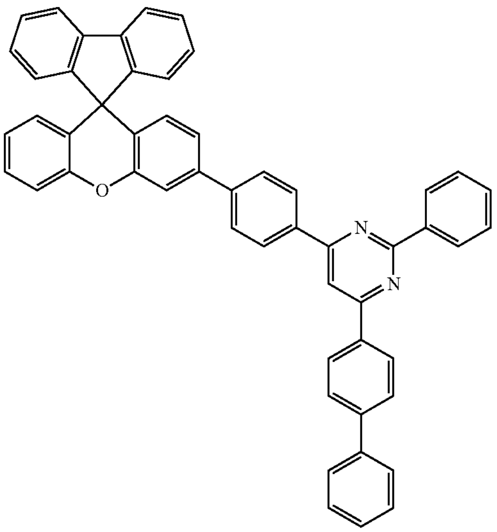
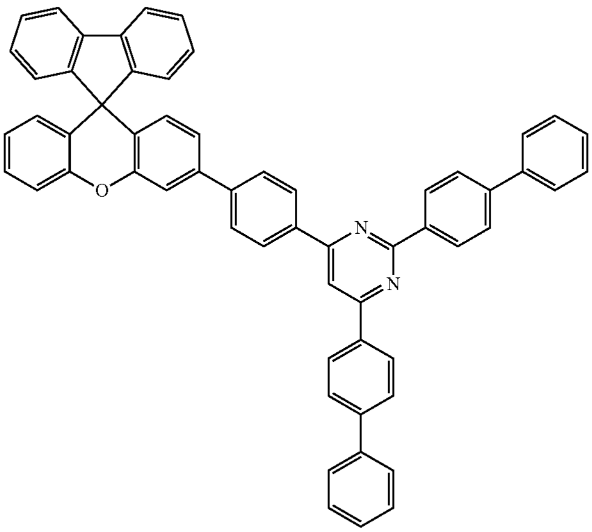
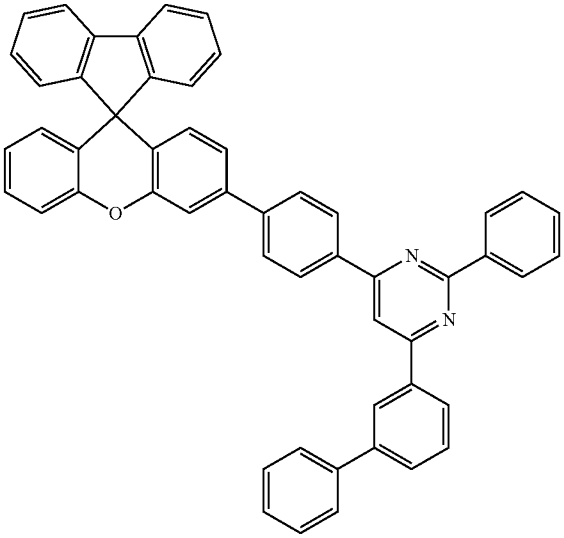
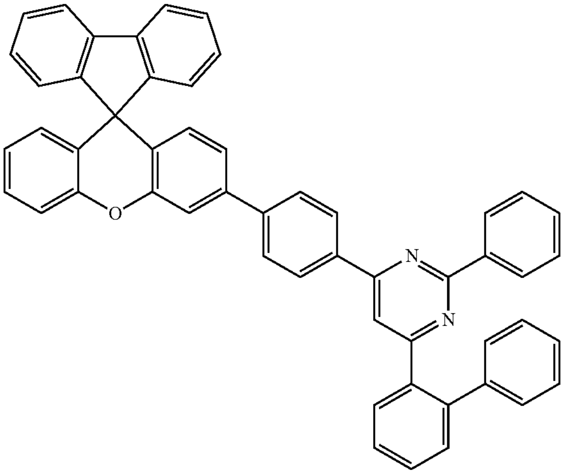
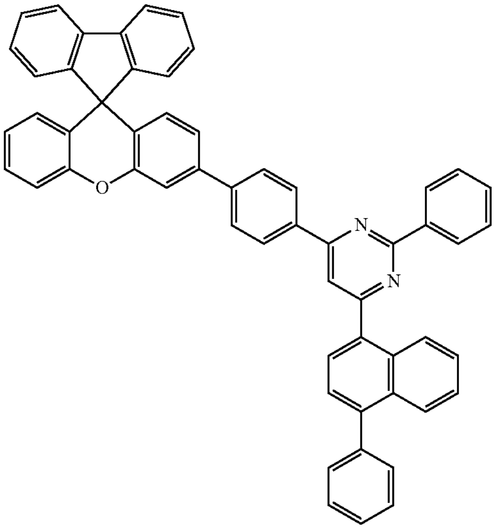
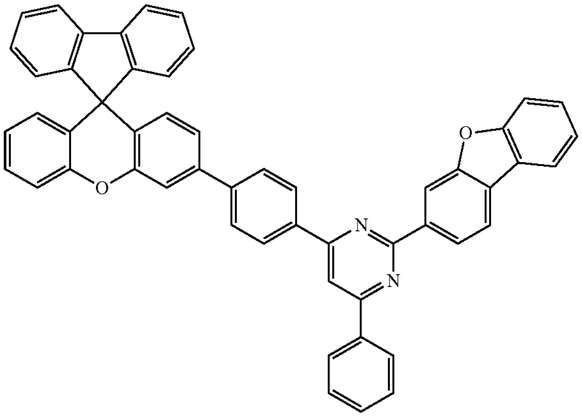

-continued
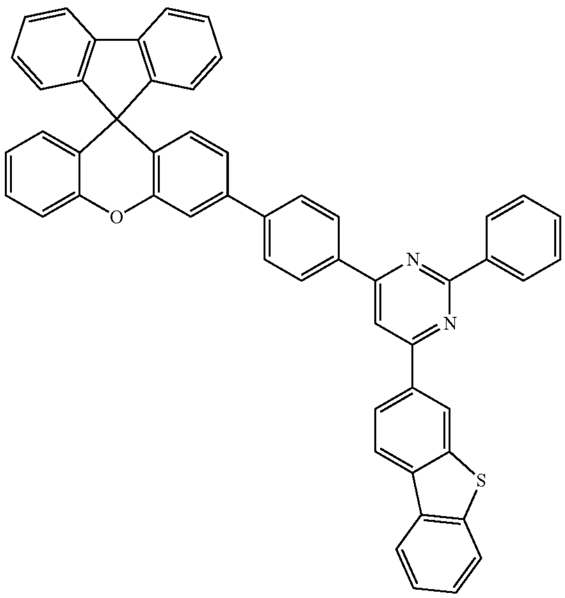
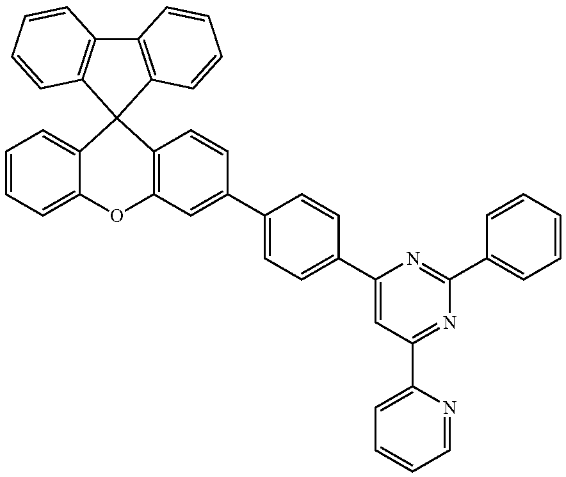
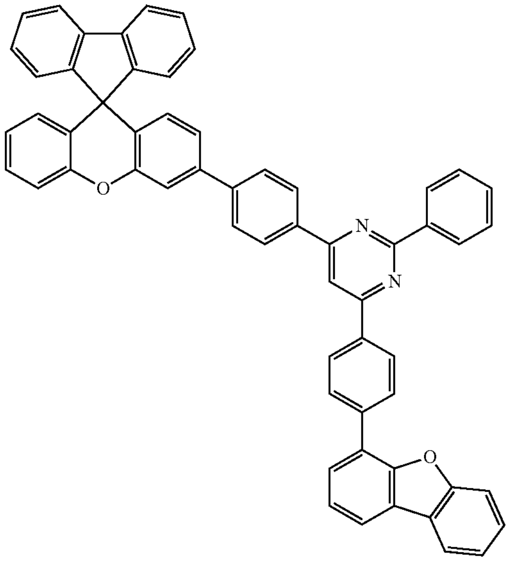
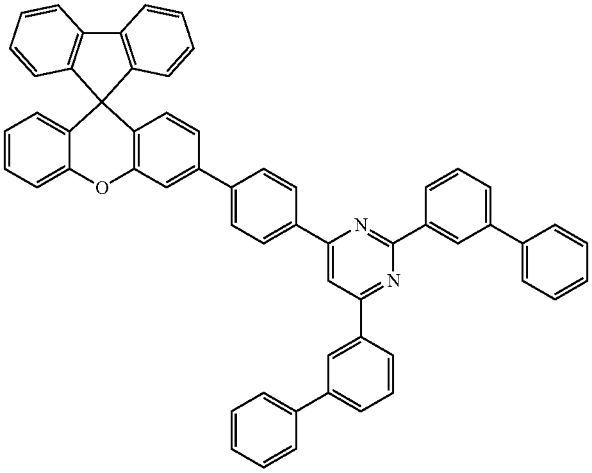

-continued
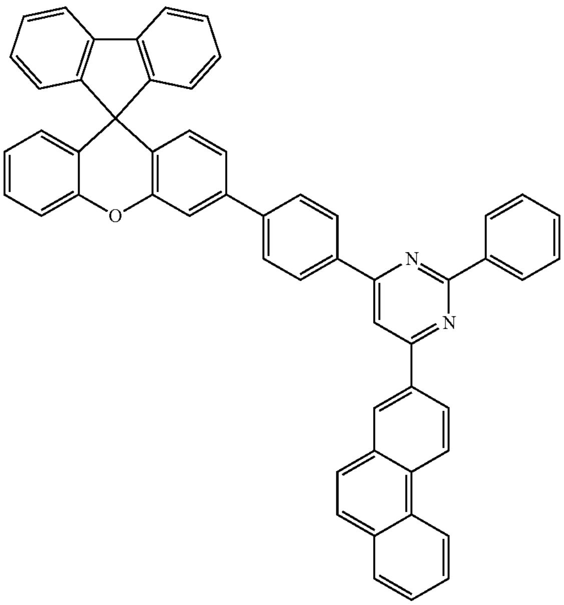
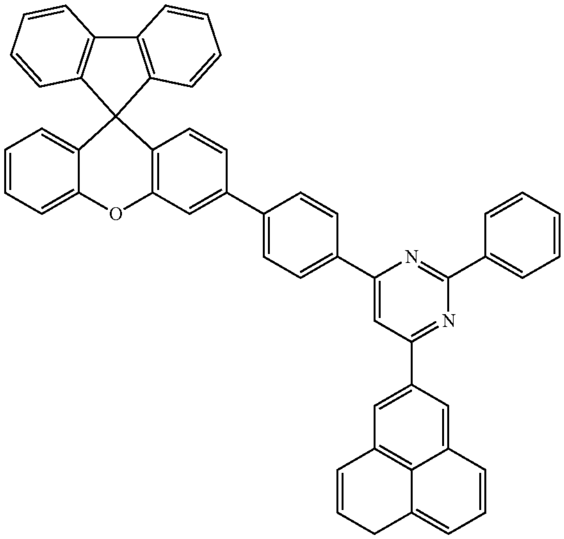
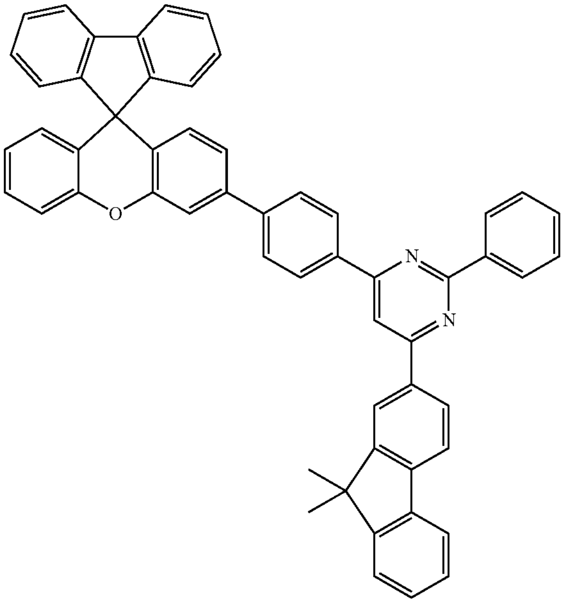
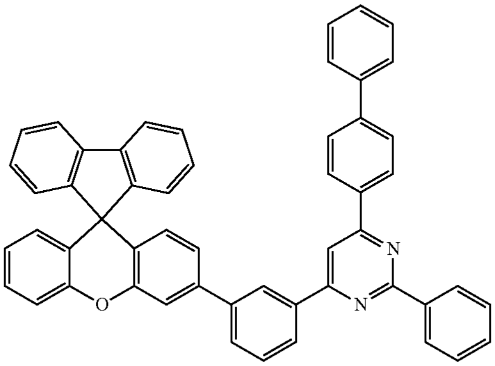
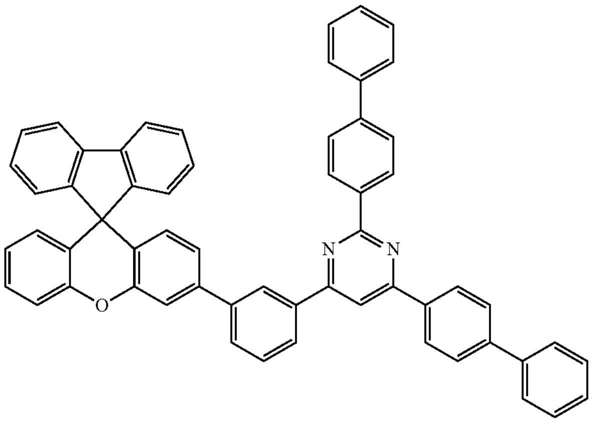

-continued
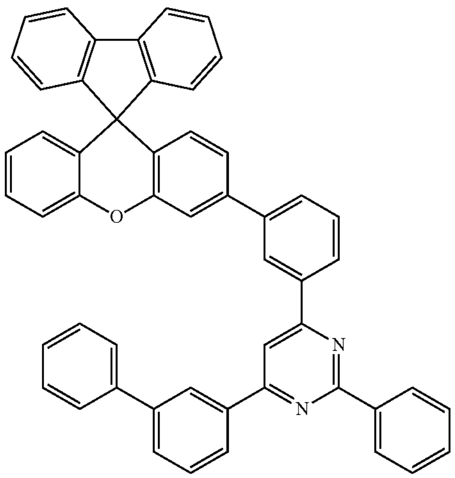
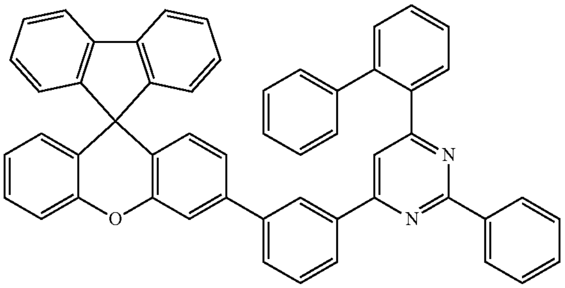
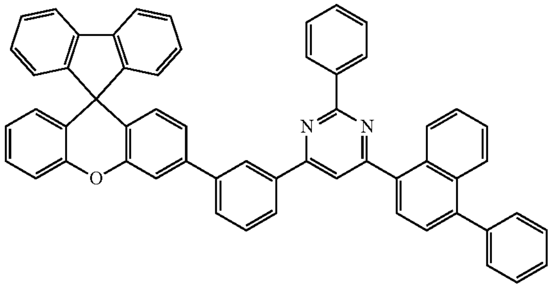
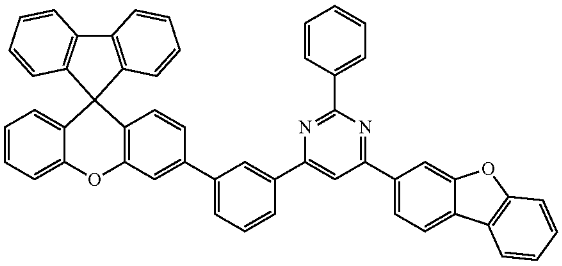
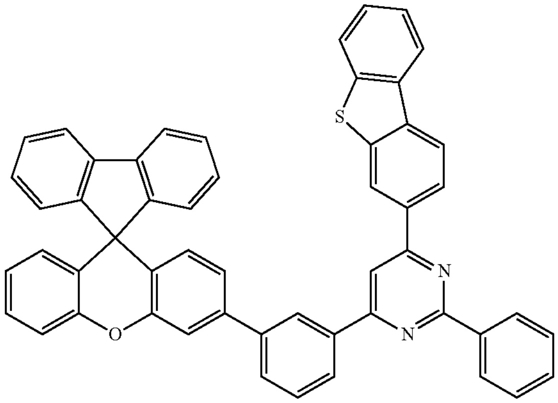
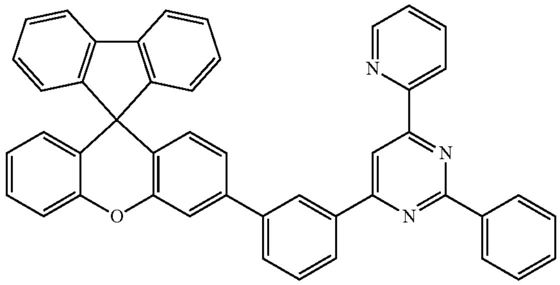
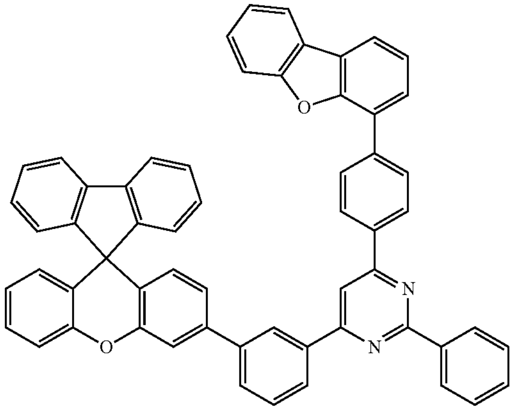
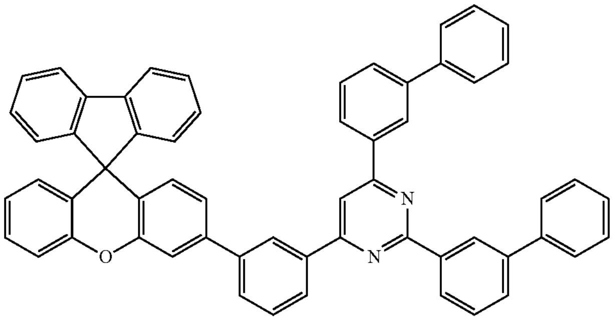

-continued
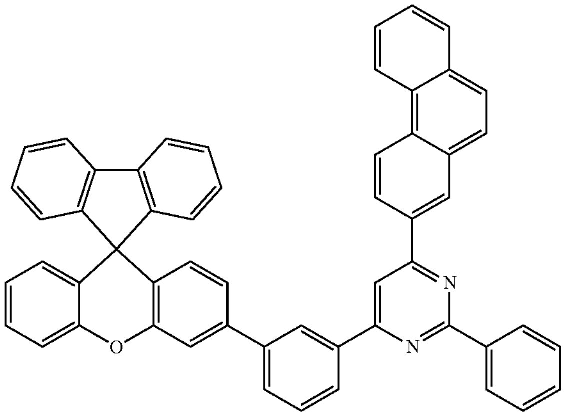
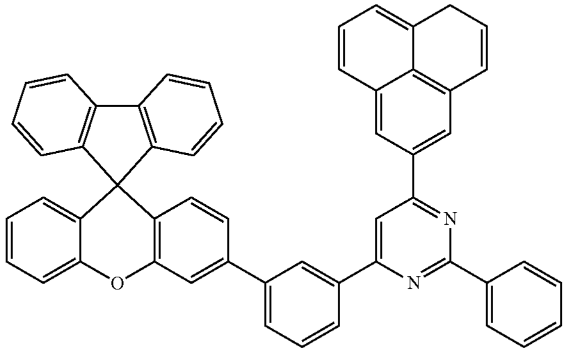
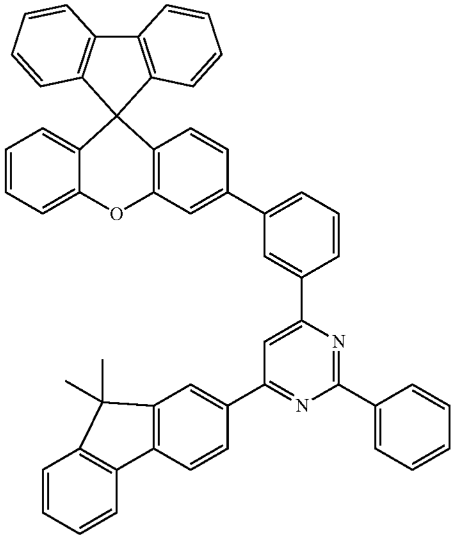
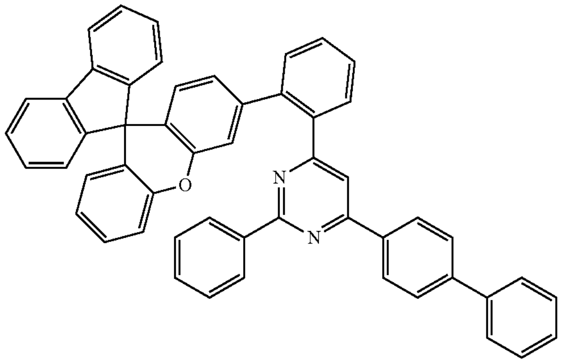
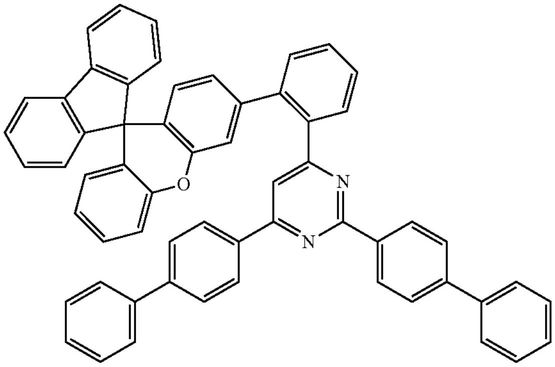
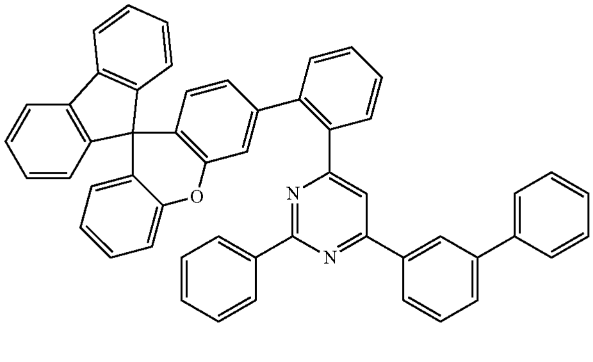
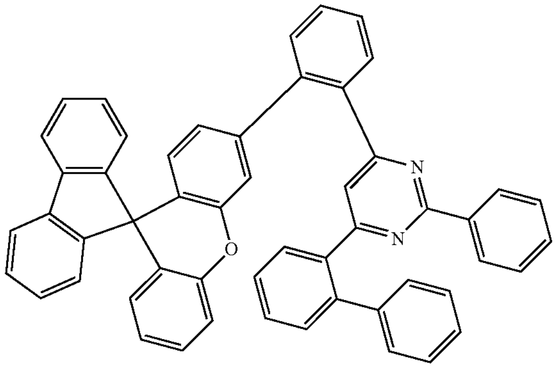

-continued
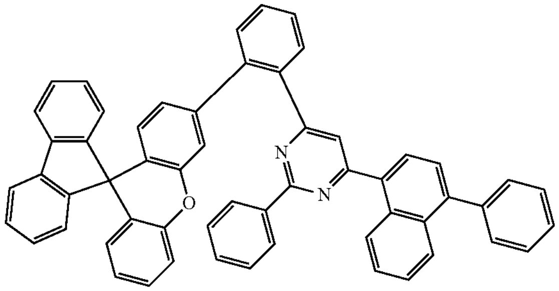
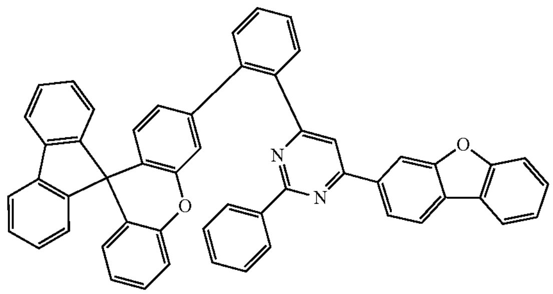
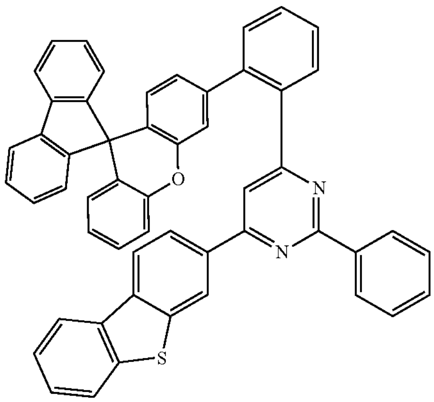
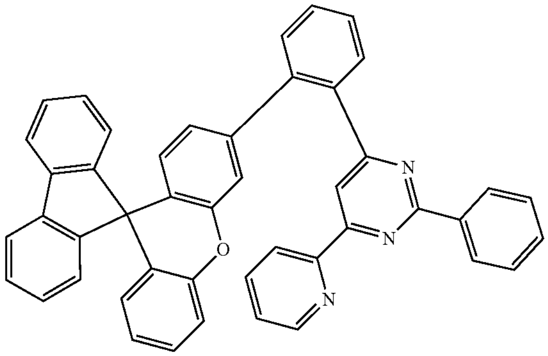
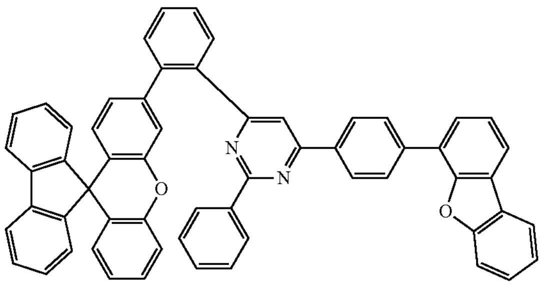
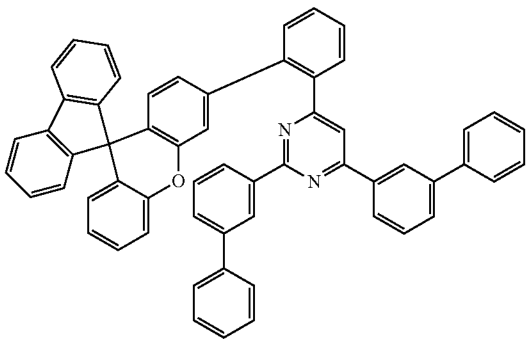
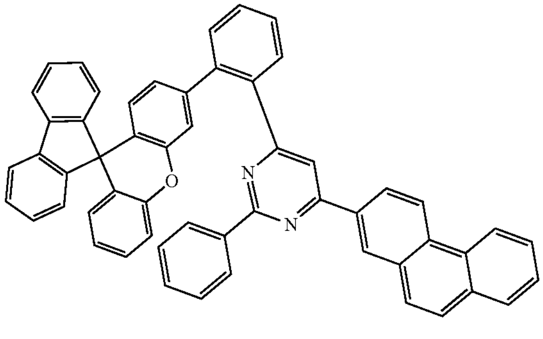
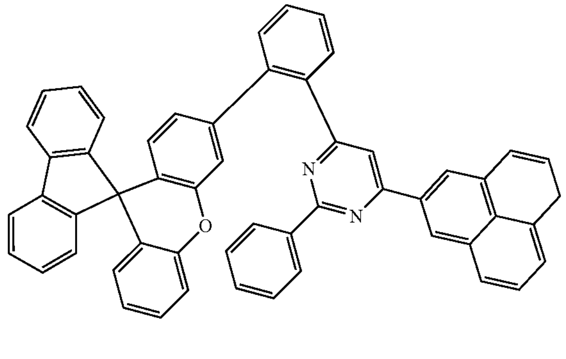

-continued
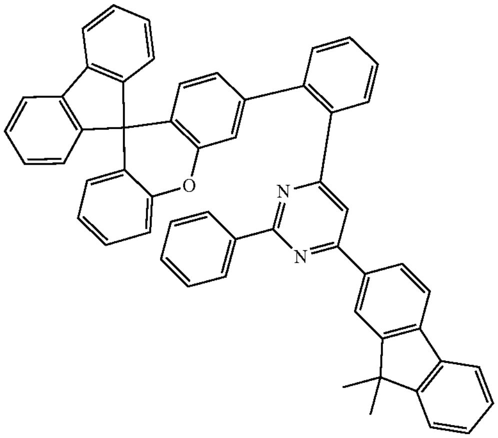
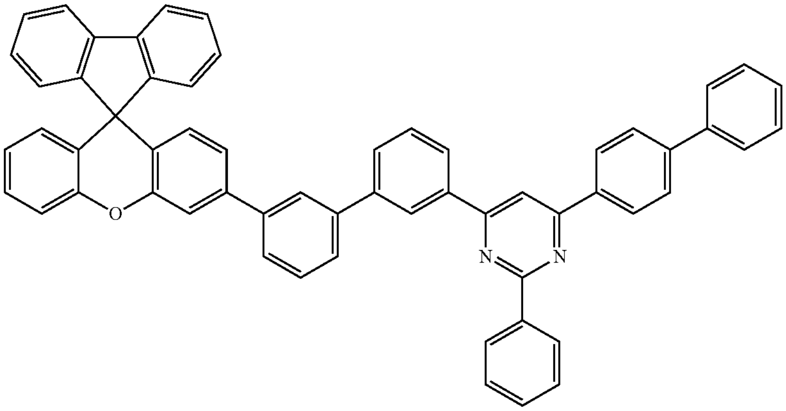 [SMILES: c1ccc(-c2ccc(-c3cc(-c4cccc(-c5cccc(-c6ccc7c(c6)Oc6ccccc6C76c7ccccc7-c7ccccc76)c5)c4)nc(-c4ccccc4)n3)cc2)cc1]
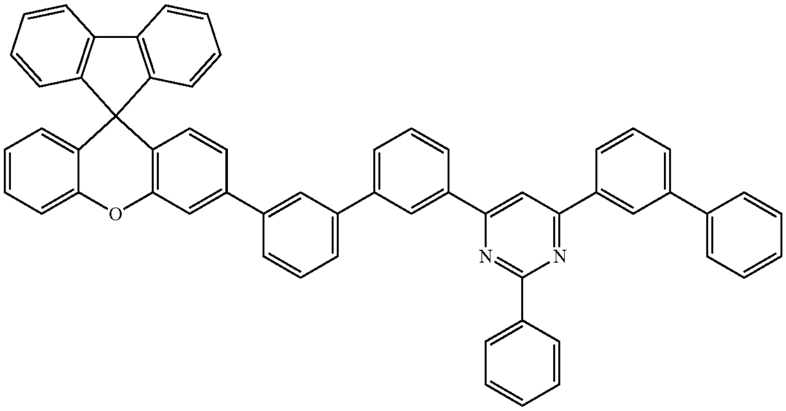
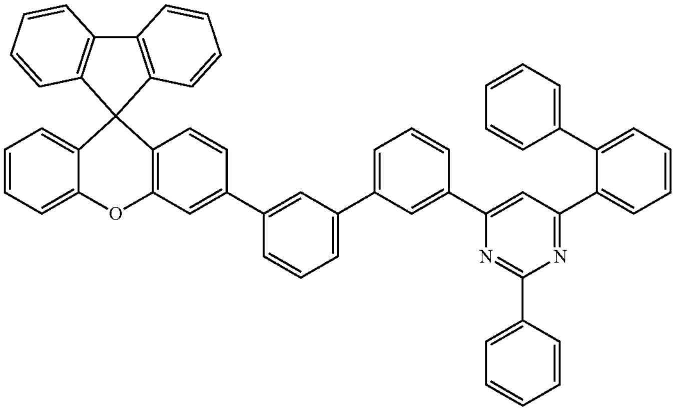 [SMILES: c1ccc(-c2nc(-c3cccc(-c4cccc(-c5ccc6c(c5)Oc5ccccc5C65c6ccccc6-c6ccccc65)c4)c3)cc(-c3ccccc3-c3ccccc3)n2)cc1]

-continued
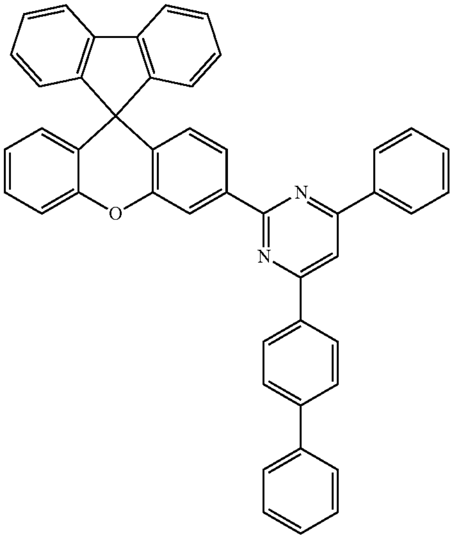
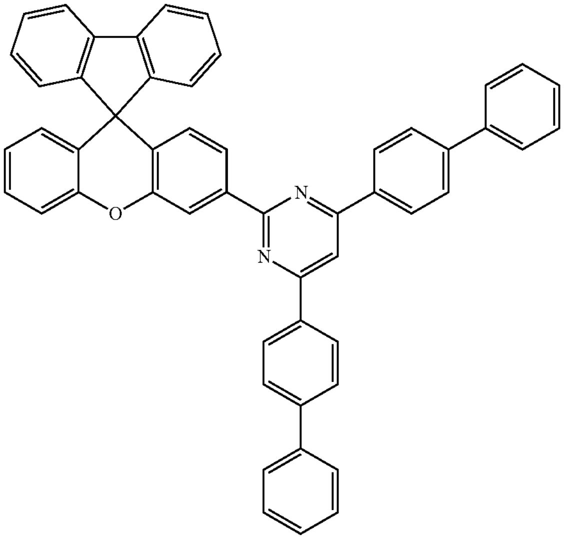
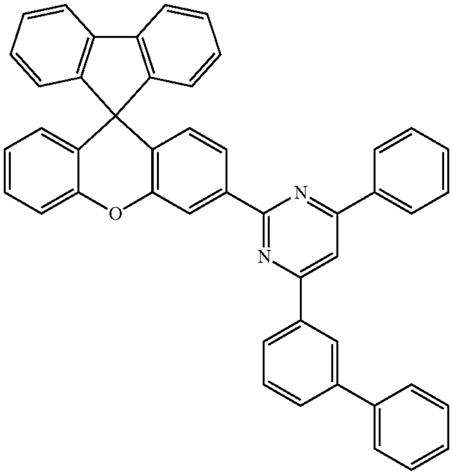
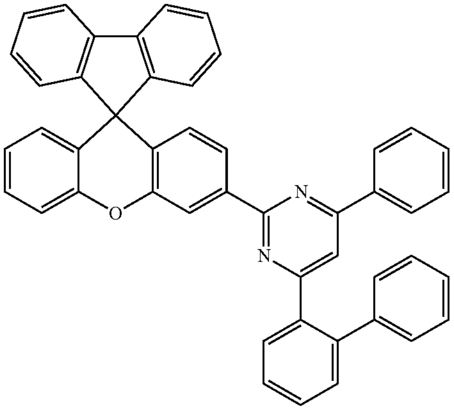

-continued
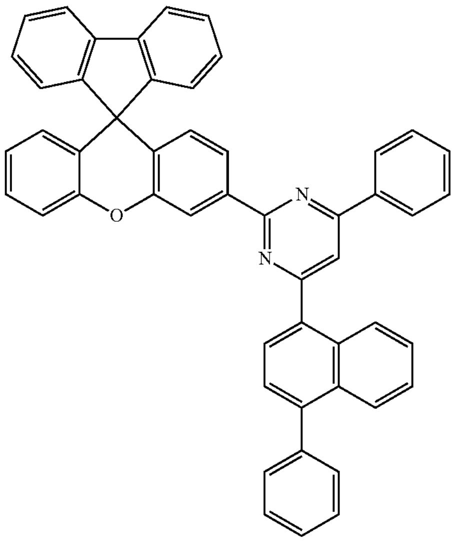
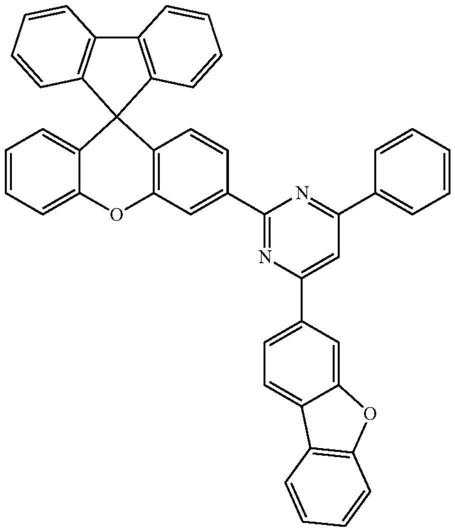
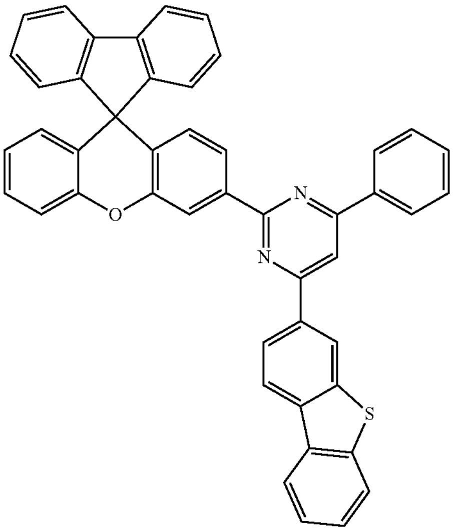
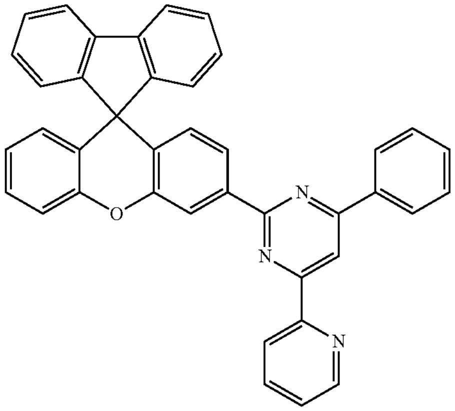
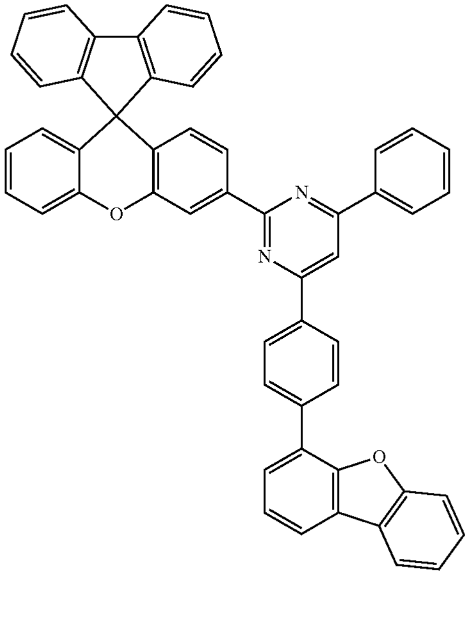

-continued
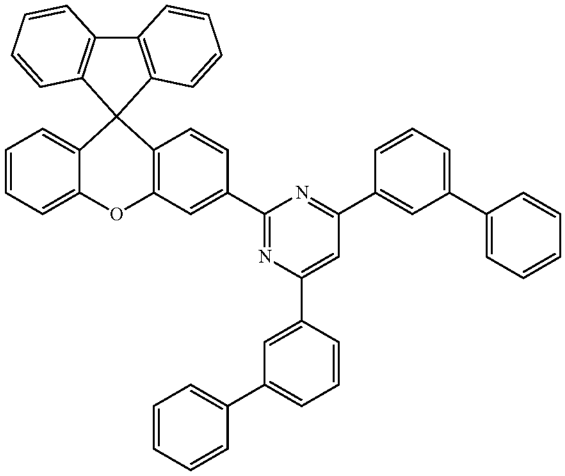
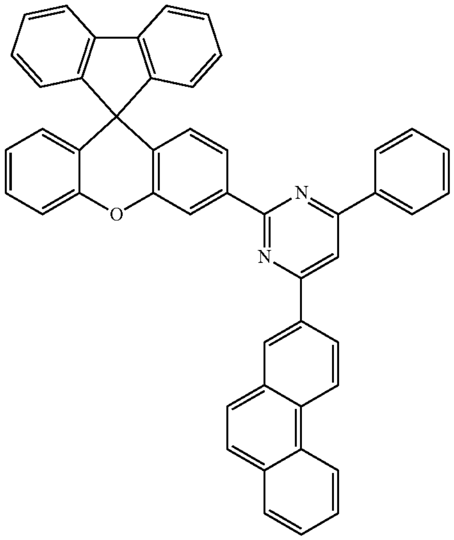
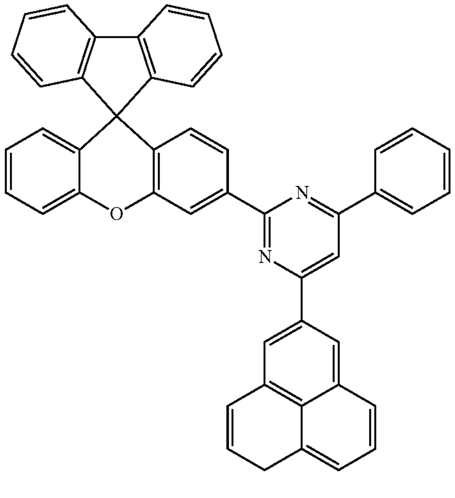
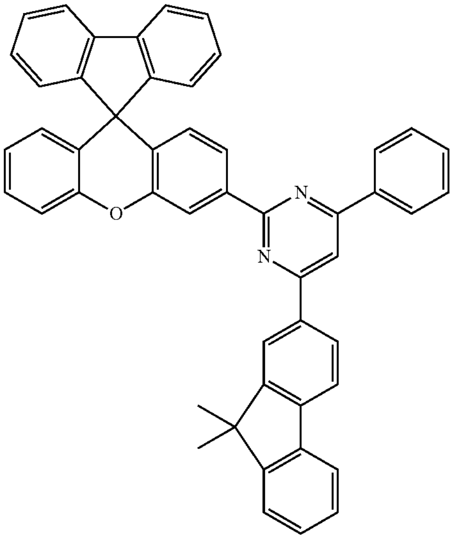

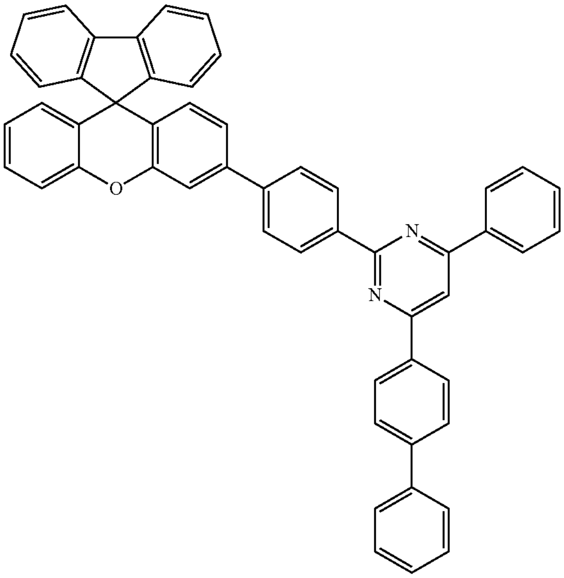
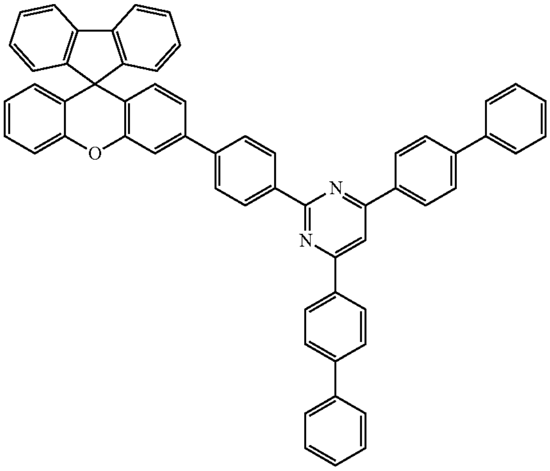
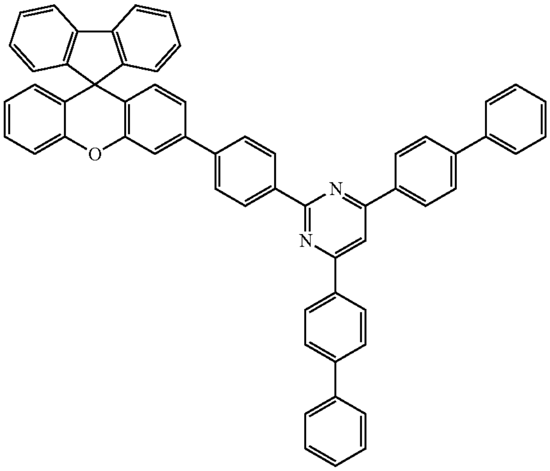
-continued
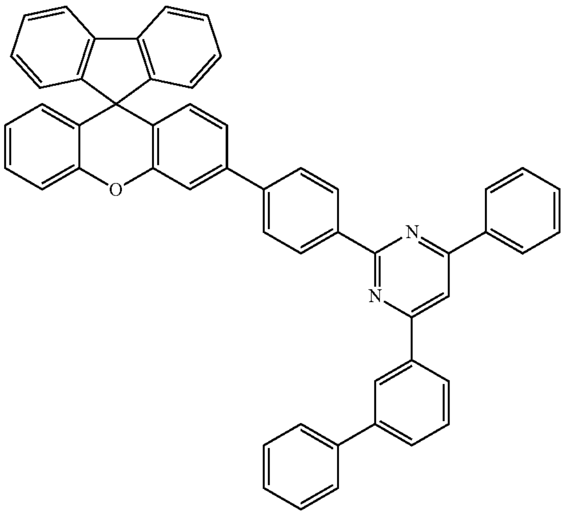
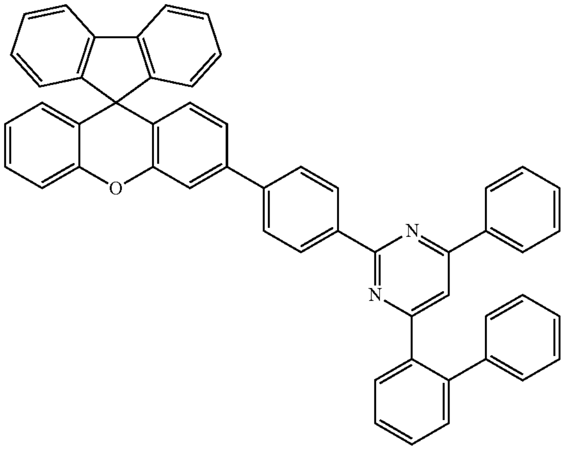
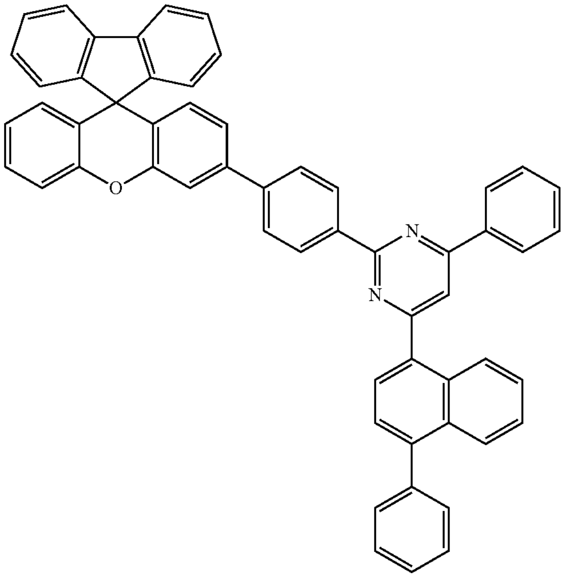

-continued
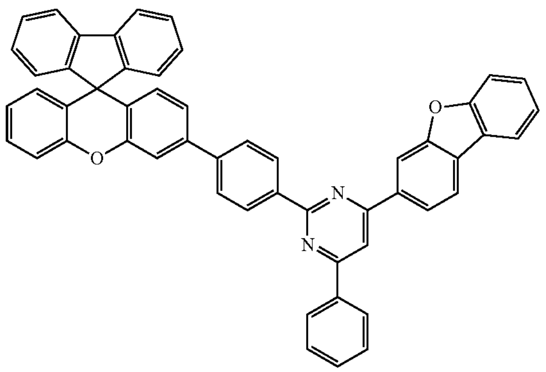
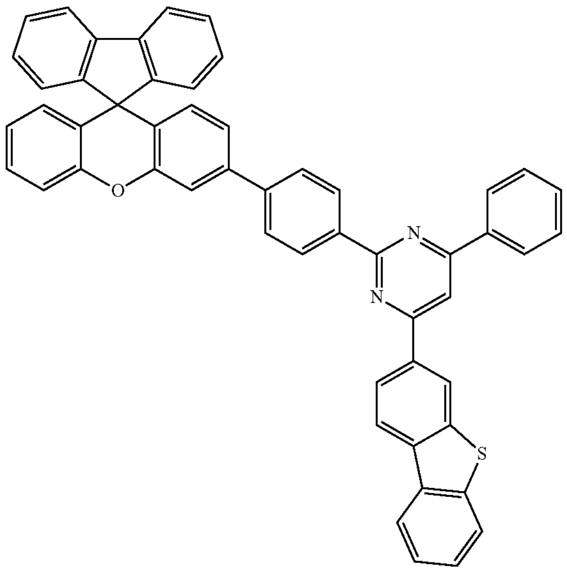
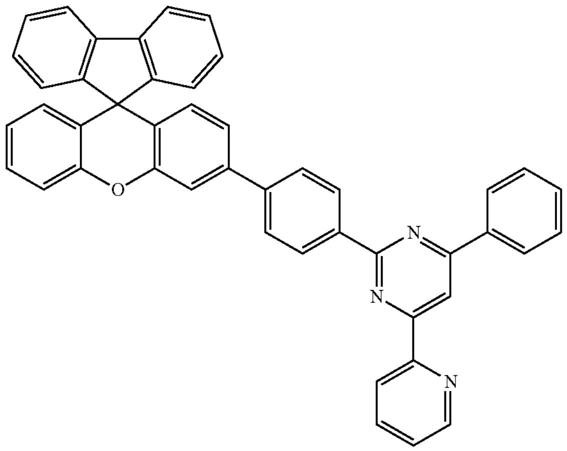
-continued
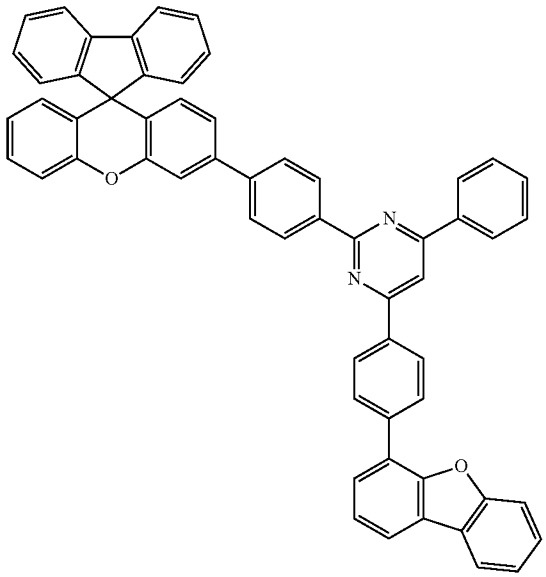
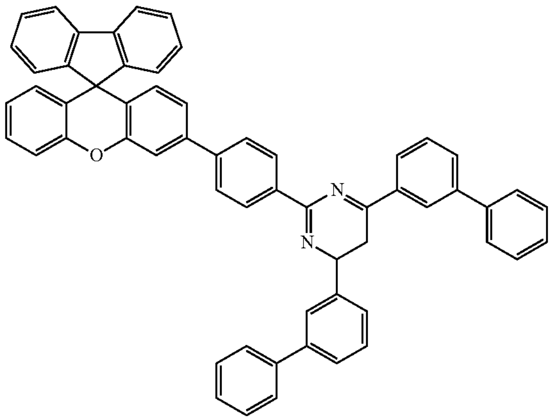
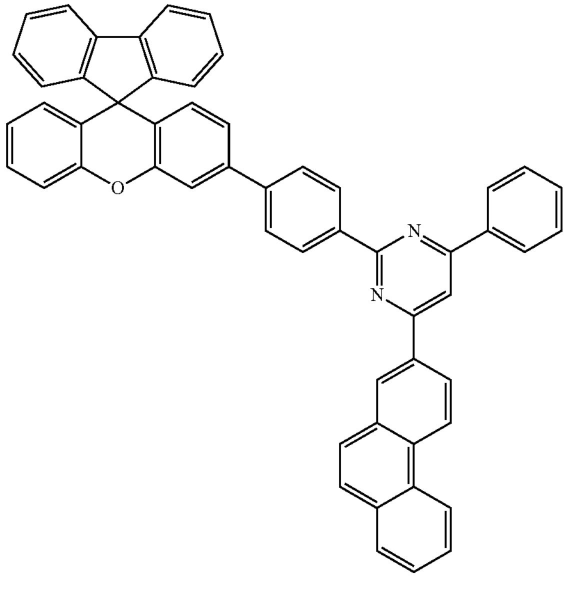

-continued
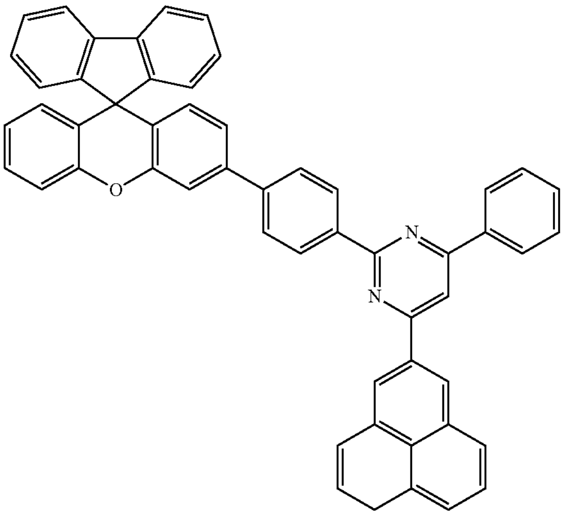
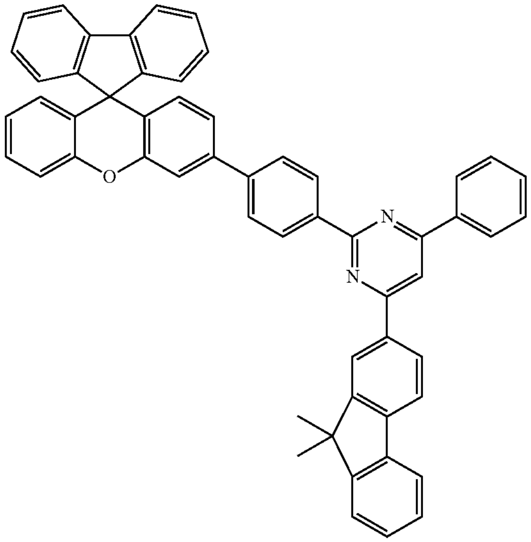
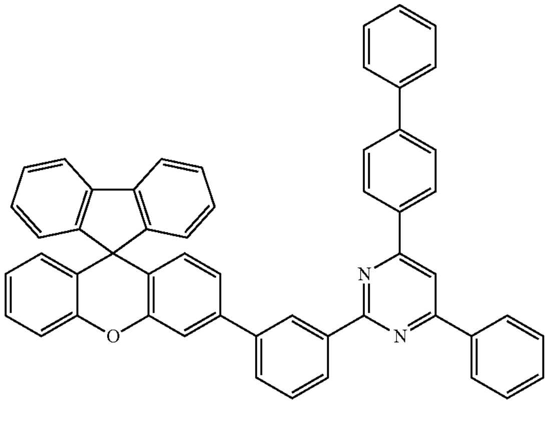
-continued
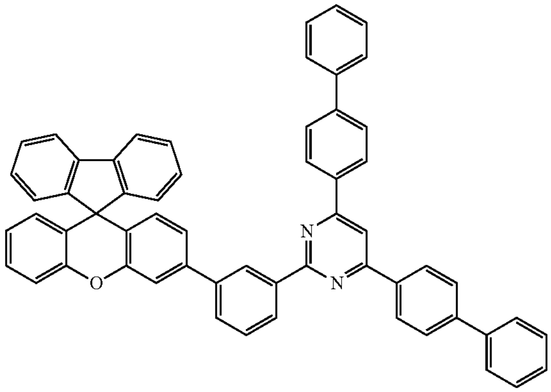
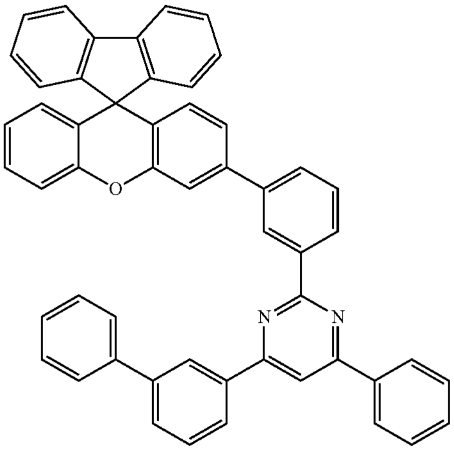
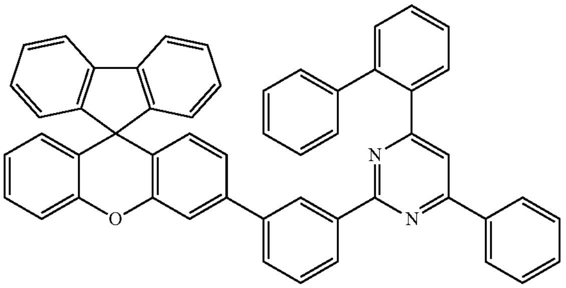
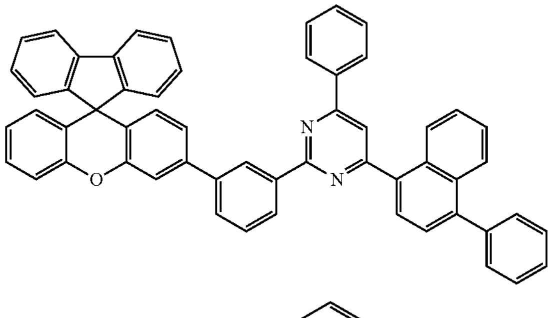
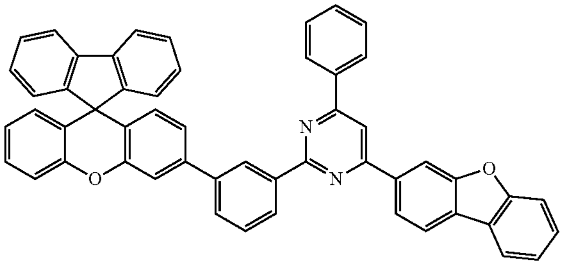

-continued
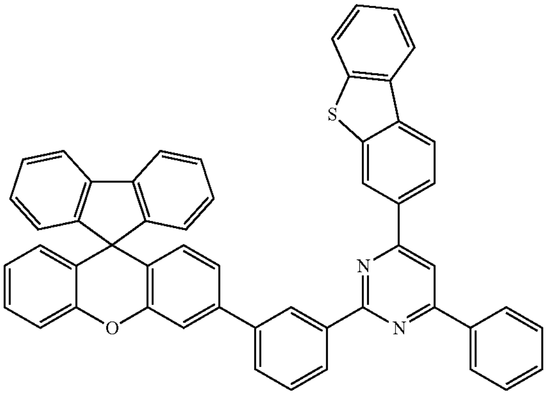
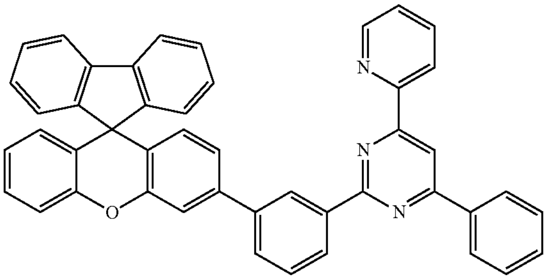
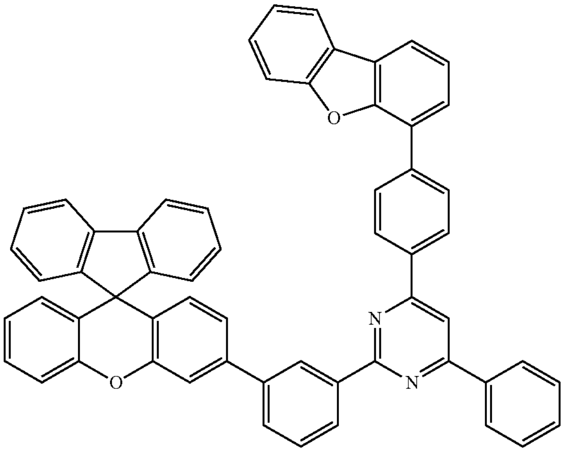
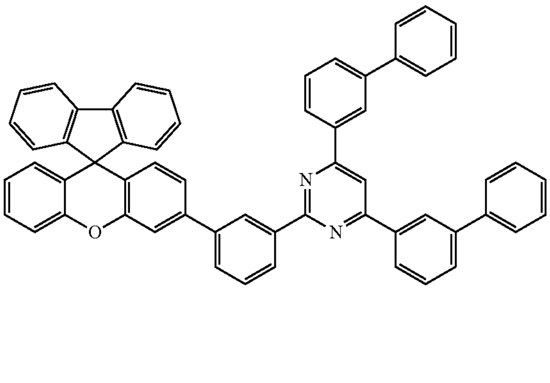
-continued
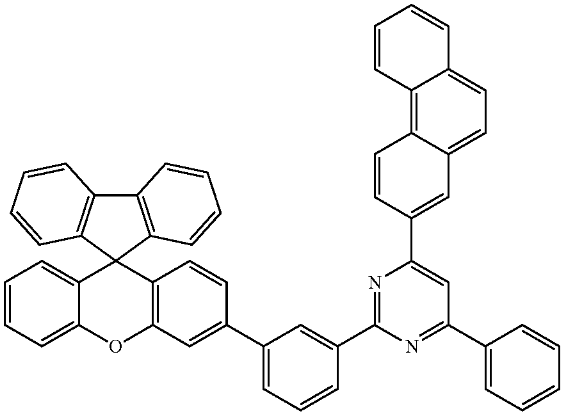
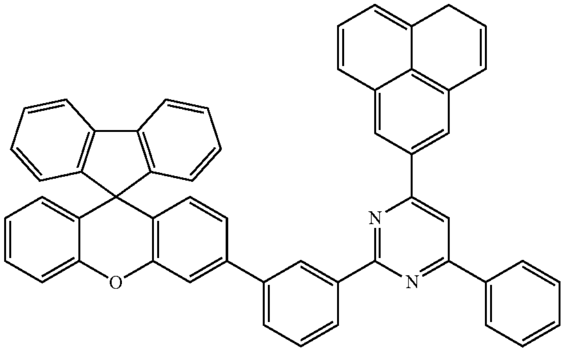
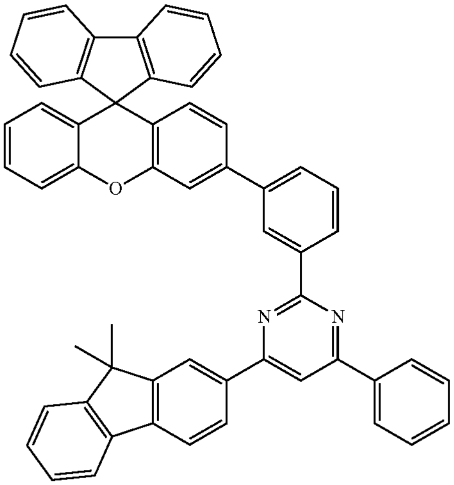
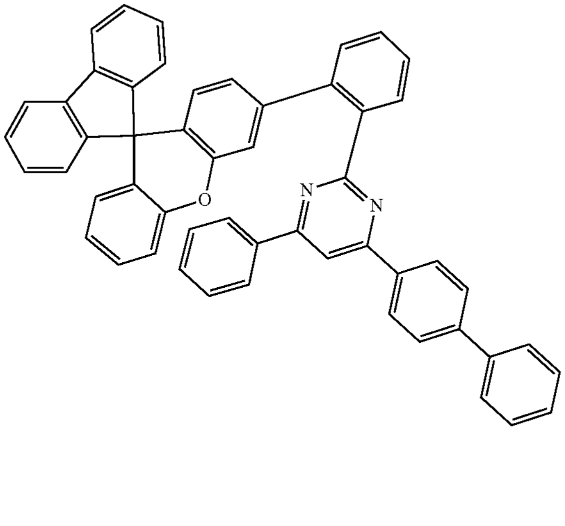

-continued
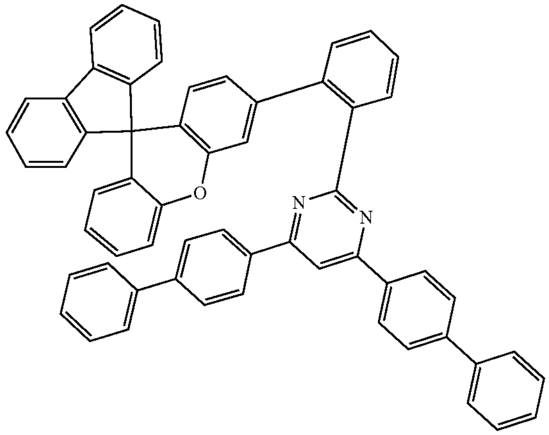
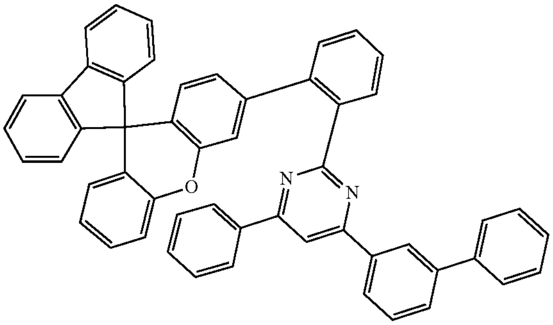
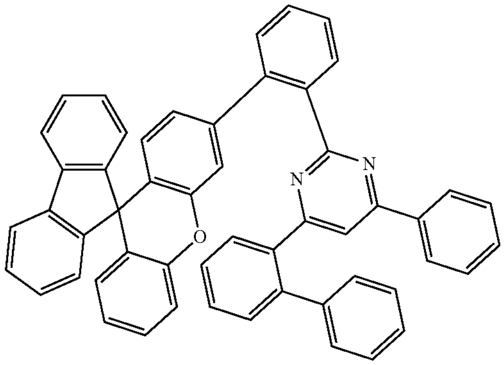
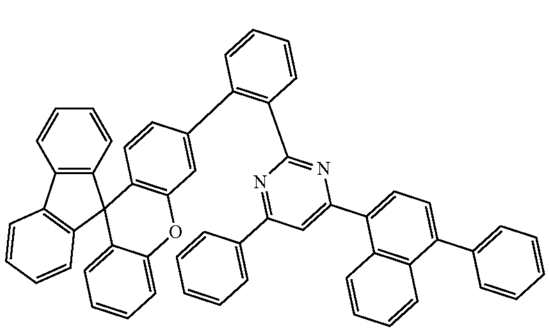
-continued
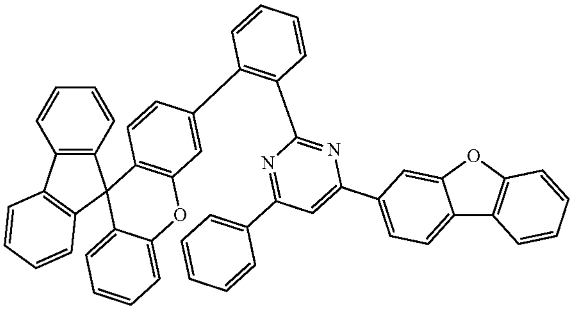
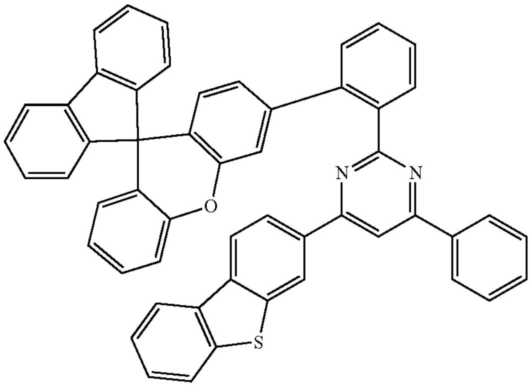
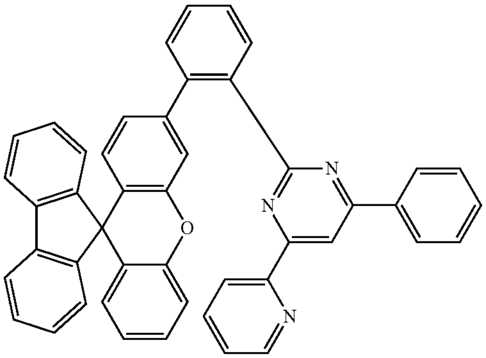
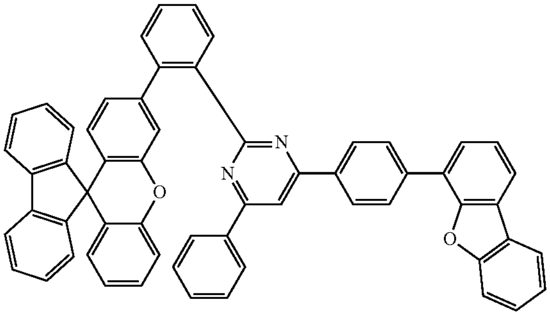

-continued
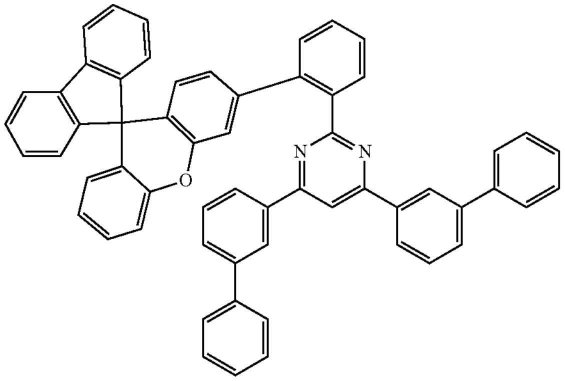
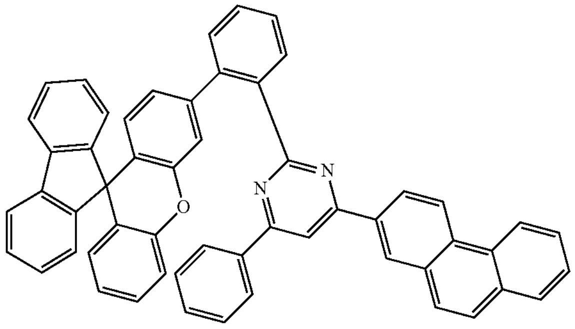
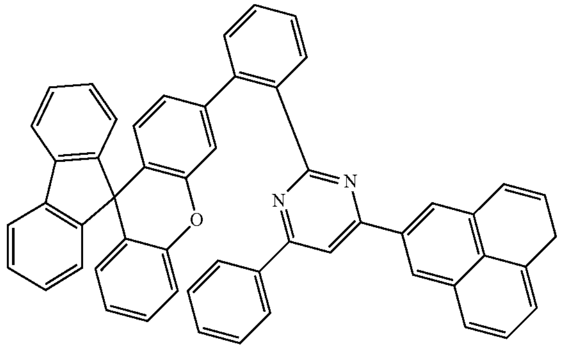
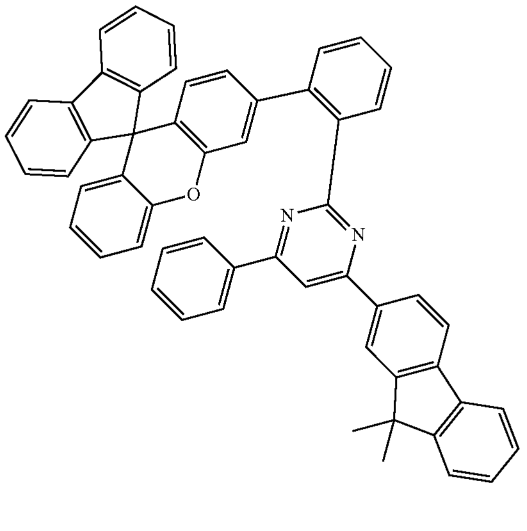
-continued
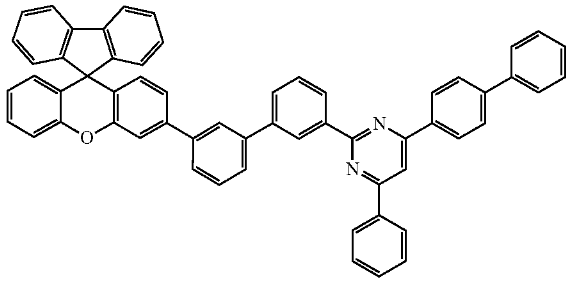
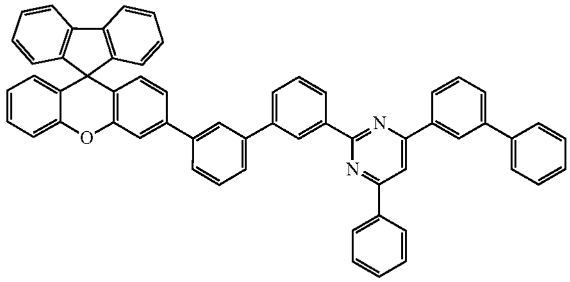
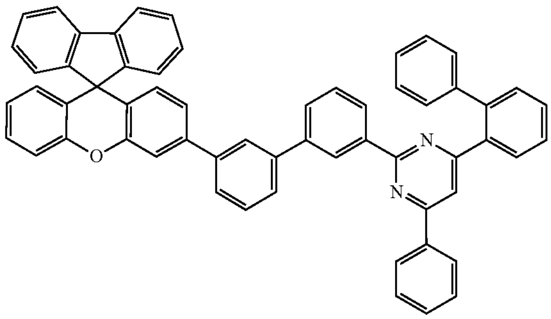 [SMILES: c1ccc(-c2cc(-c3ccccc3-c3ccccc3)nc(-c3cccc(-c4cccc(-c5ccc6c(c5)Oc5ccccc5C65c6ccccc6-c6ccccc65)c4)c3)n2)cc1]
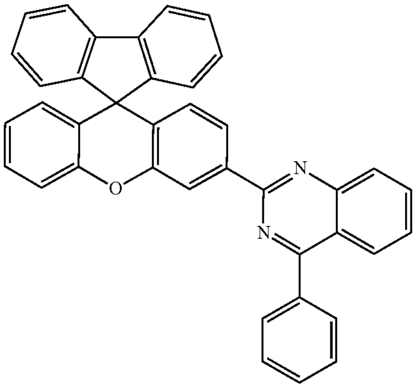
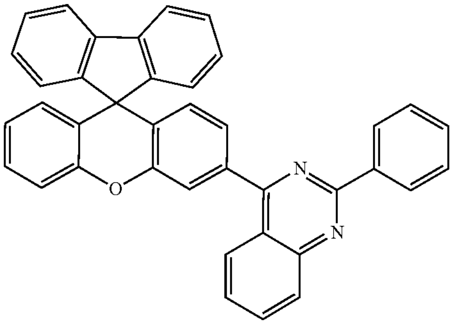

-continued
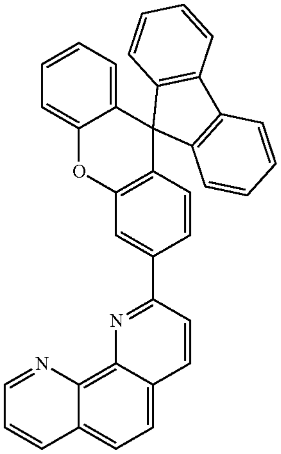
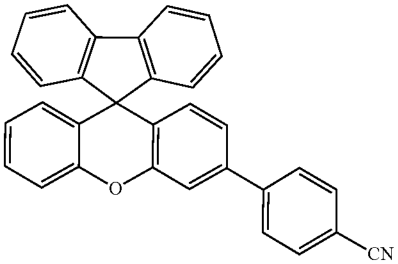
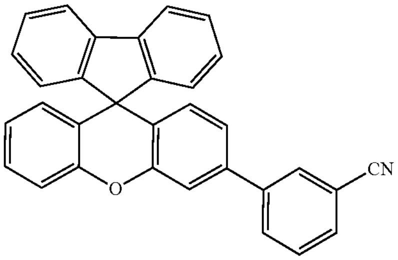
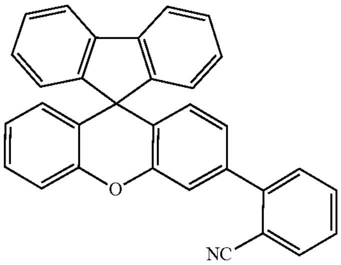
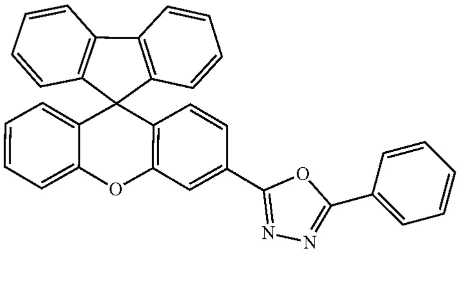
-continued
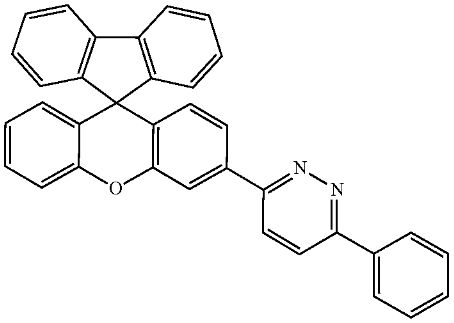
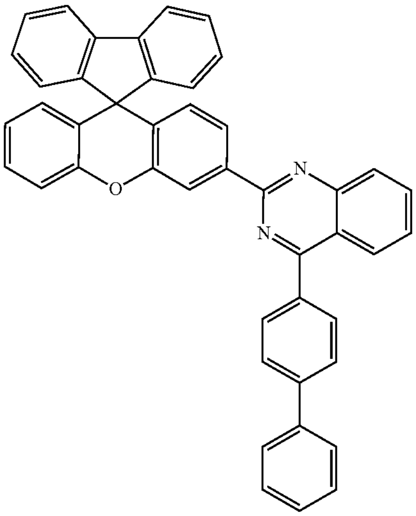
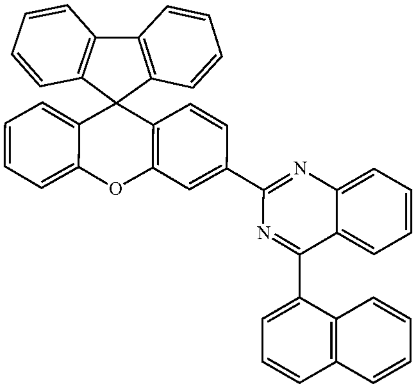
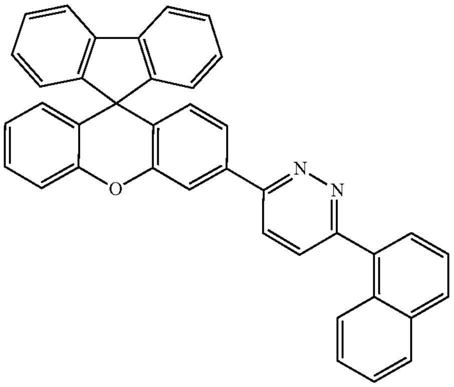

-continued
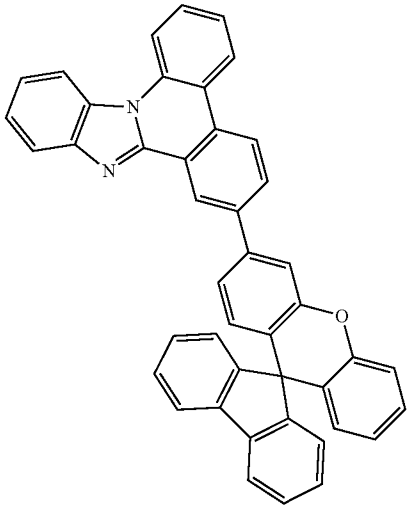
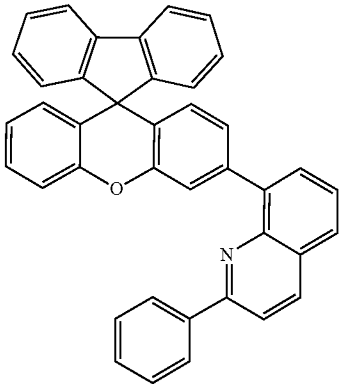
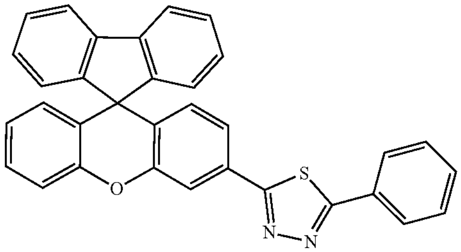
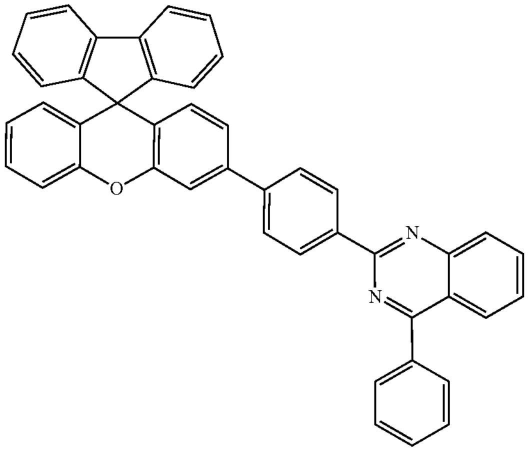
-continued
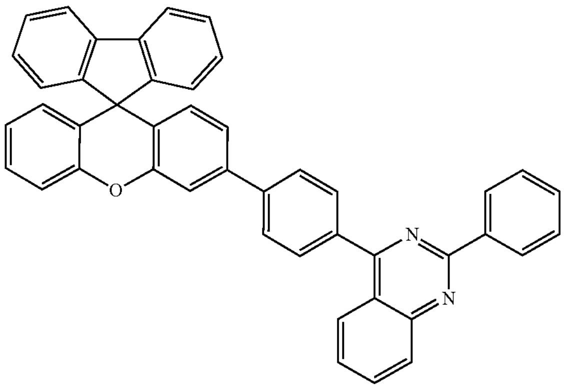
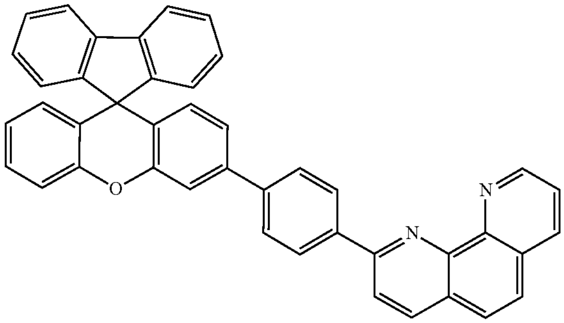
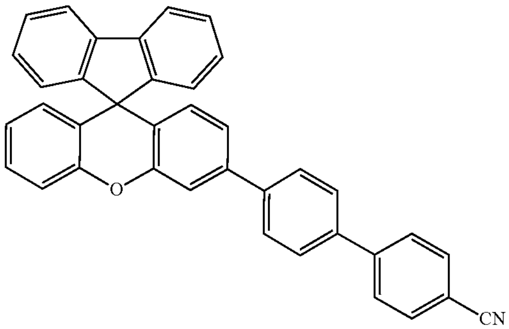
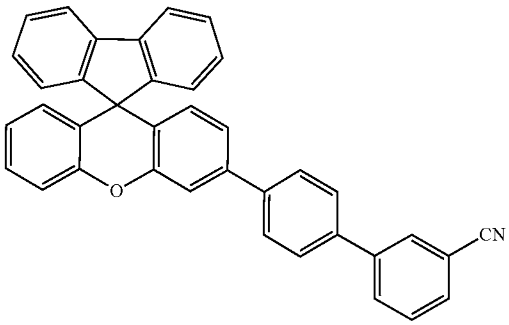
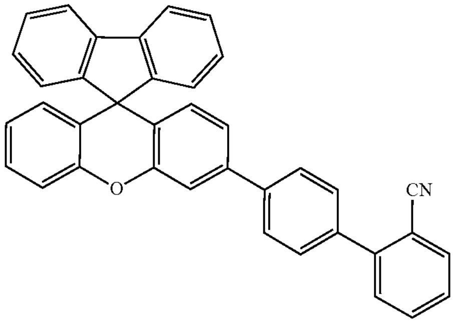

-continued
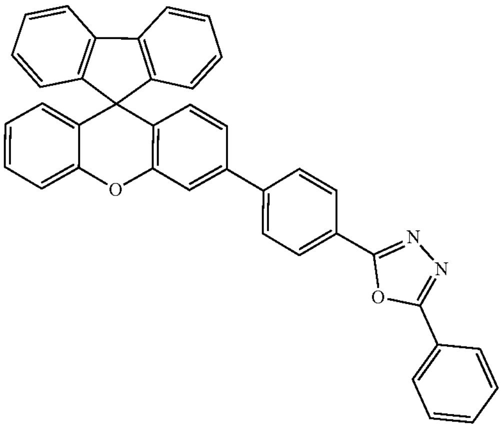
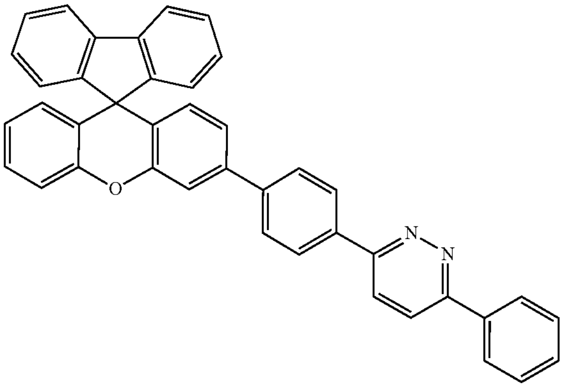
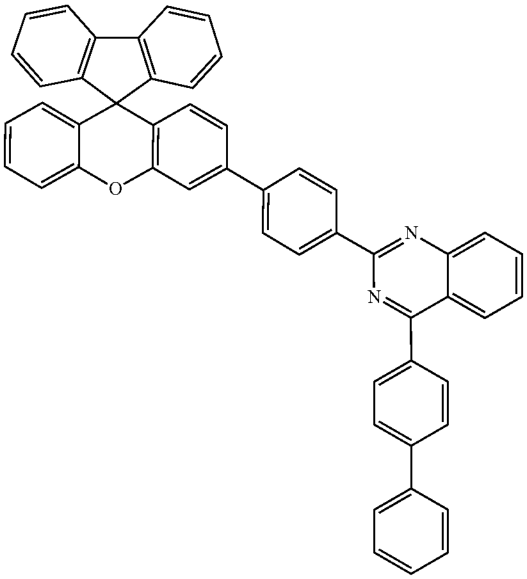
-continued
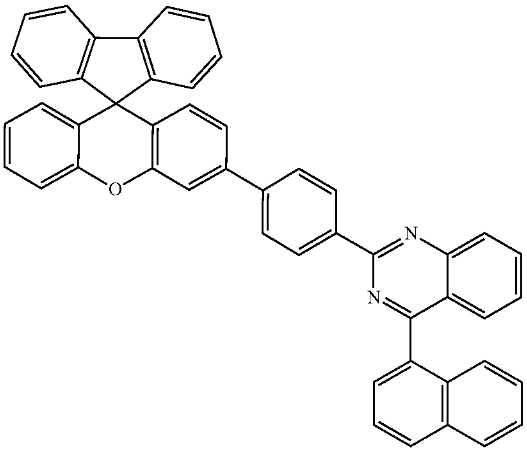
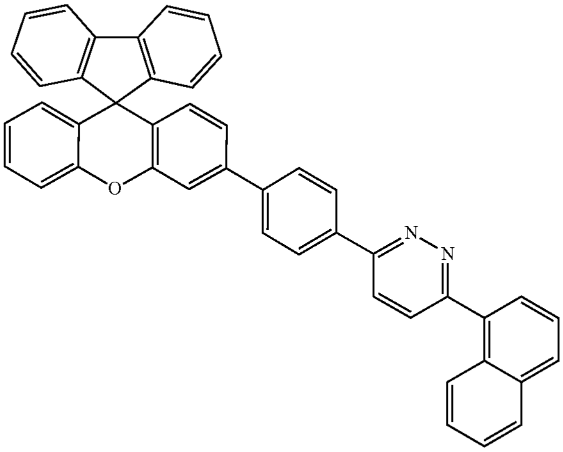
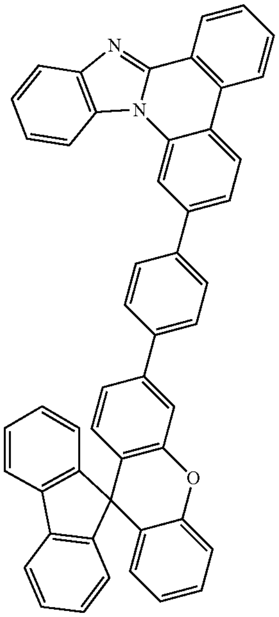

-continued
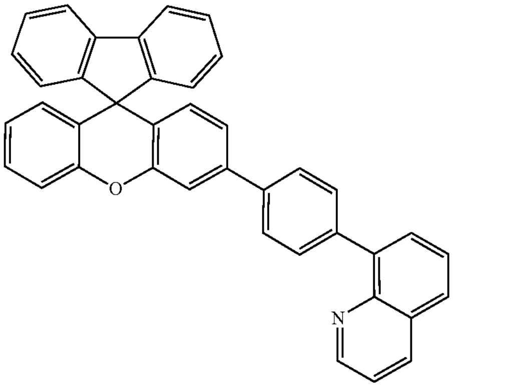
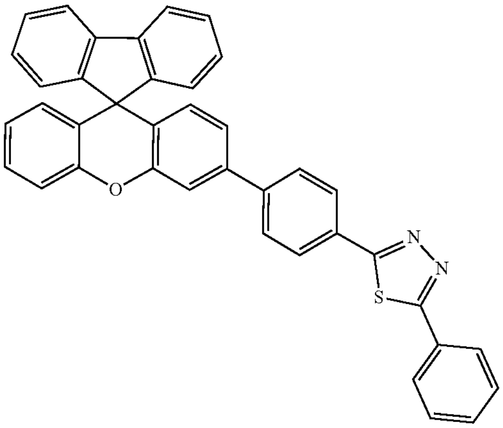
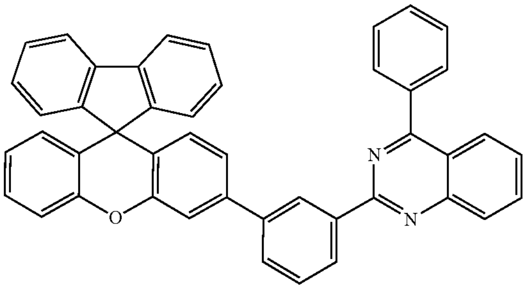
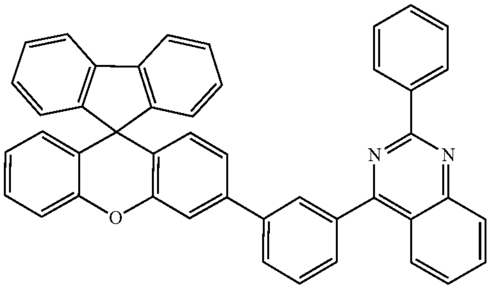
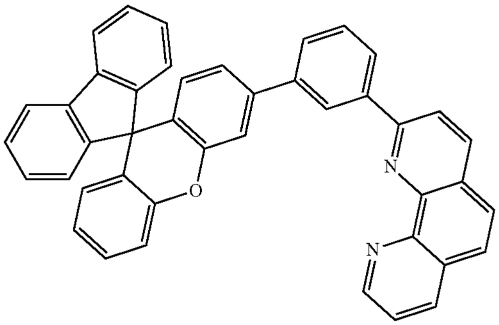
-continued
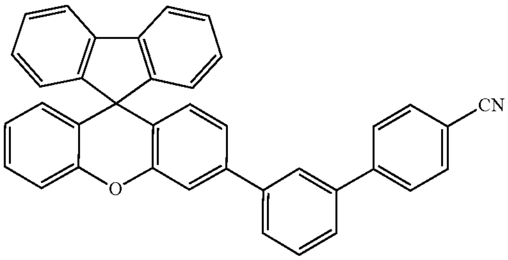
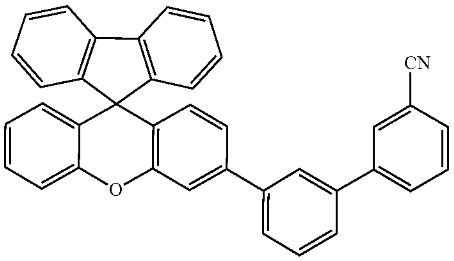
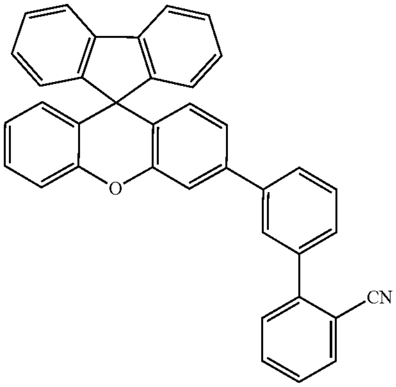
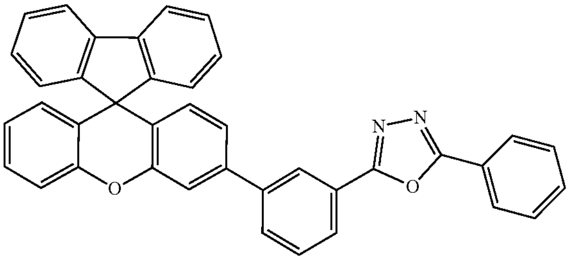
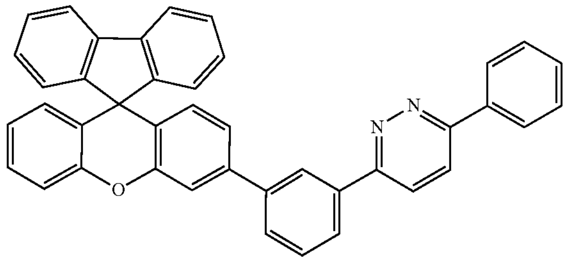

-continued
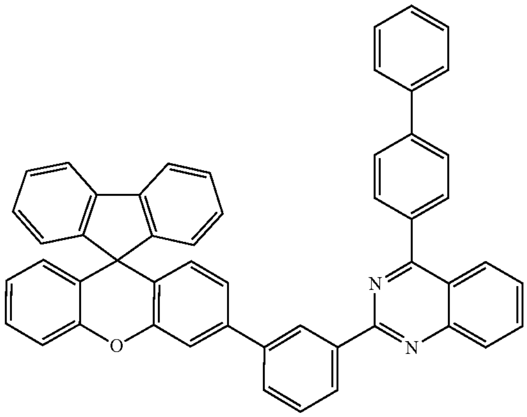
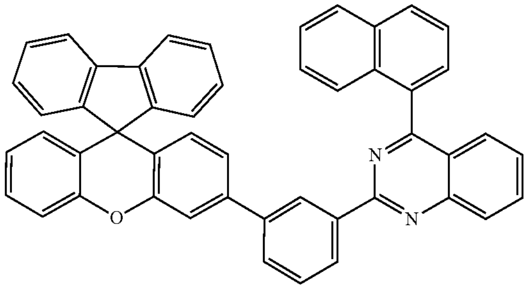
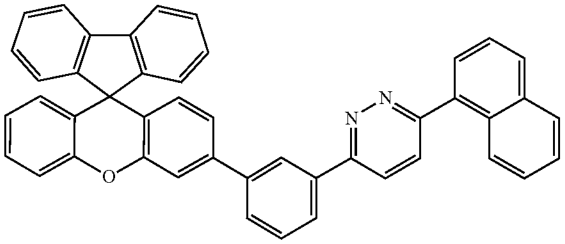
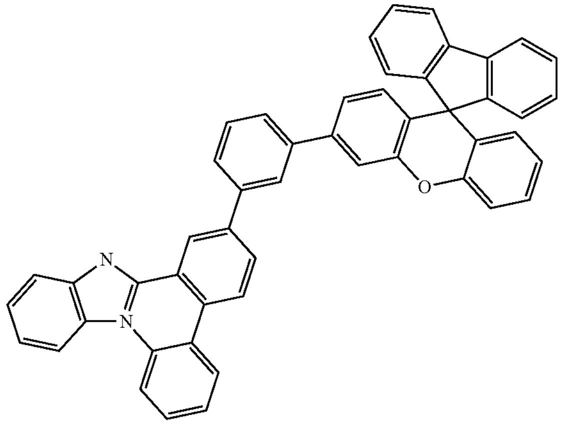
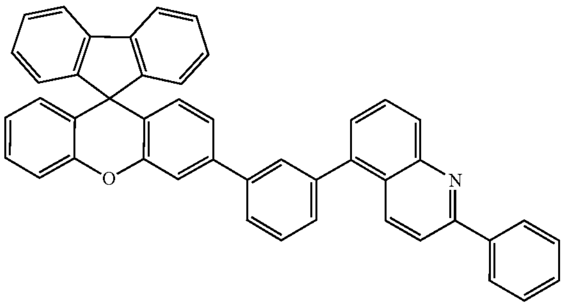
-continued
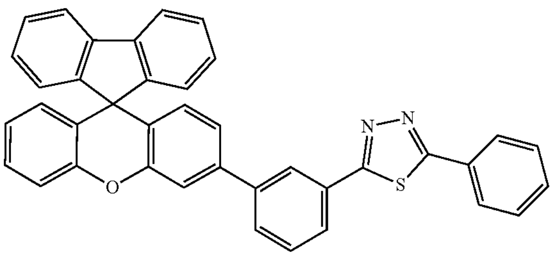
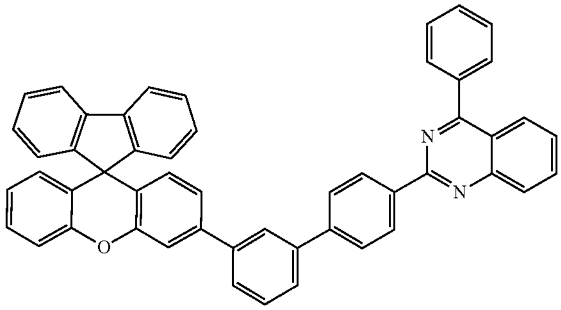
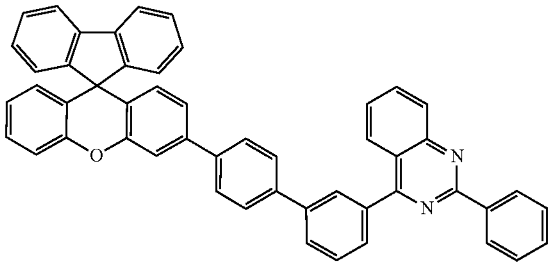
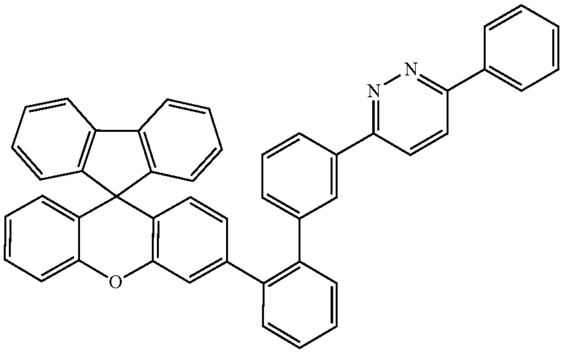
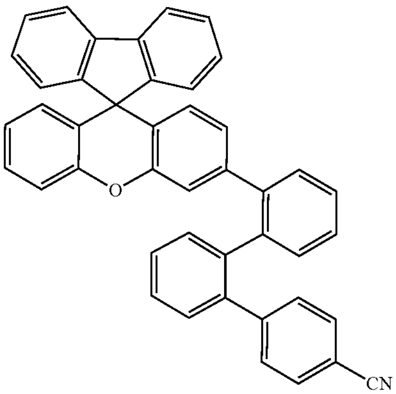

-continued
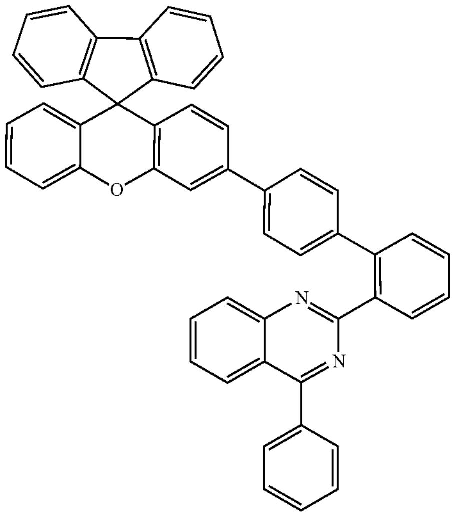
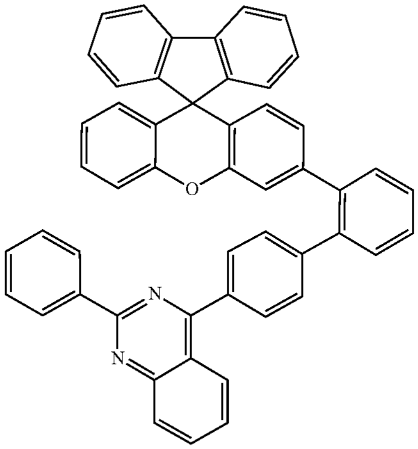
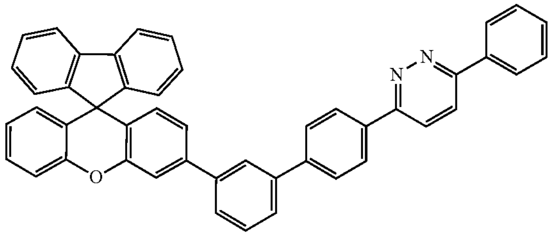
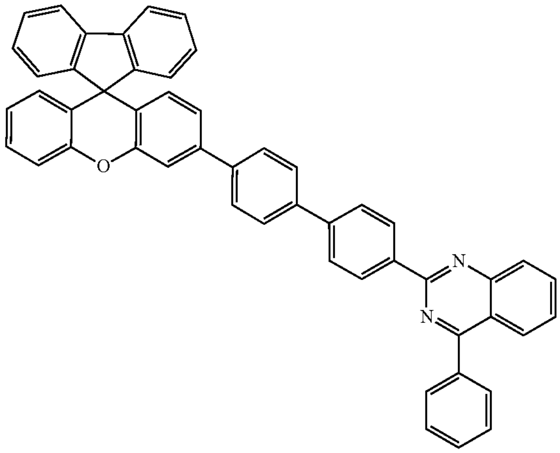
-continued
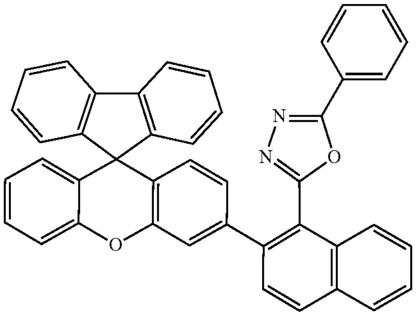
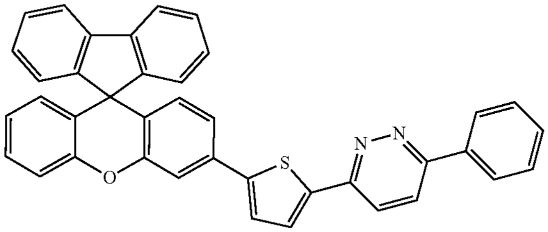
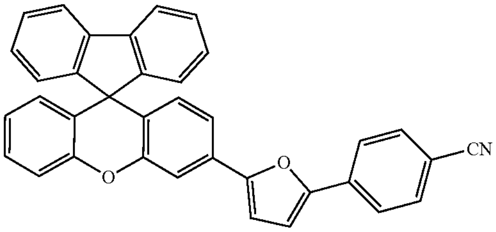
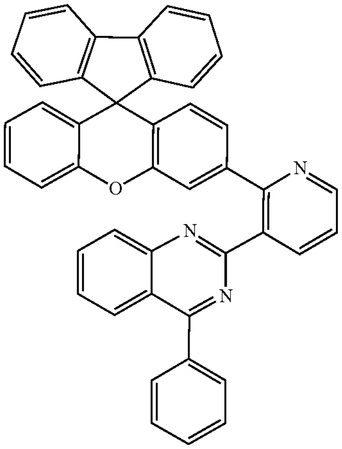
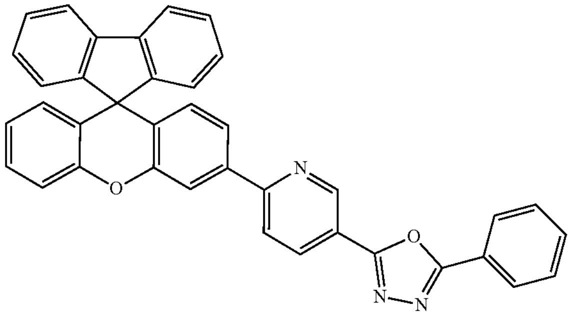

-continued
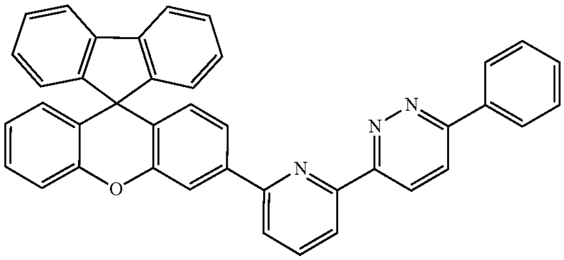
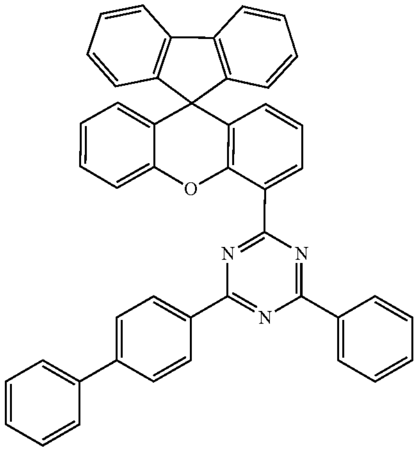
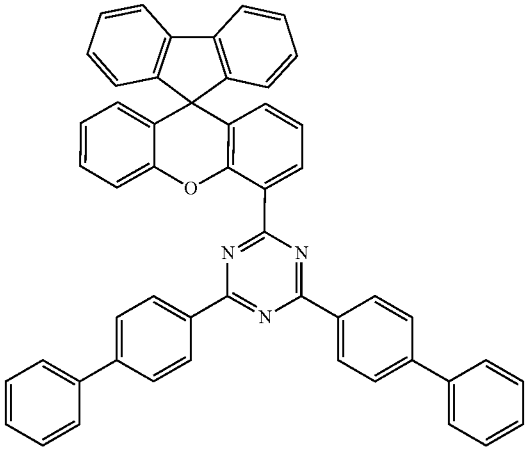
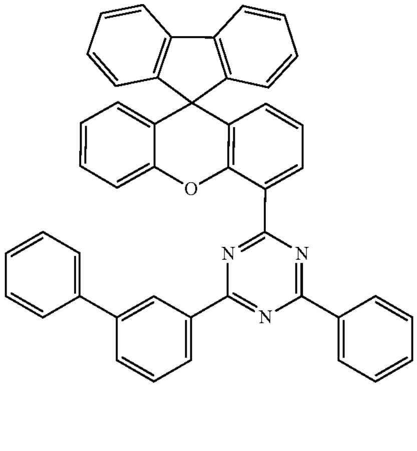
-continued
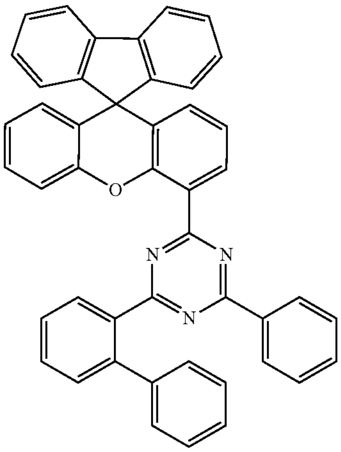
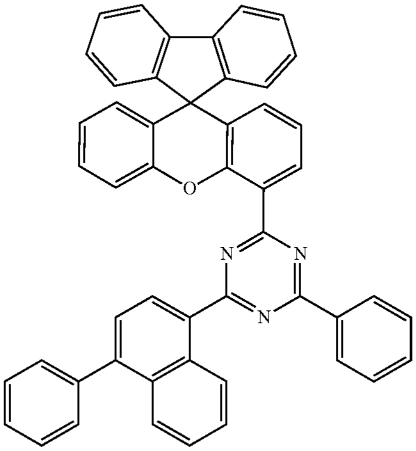
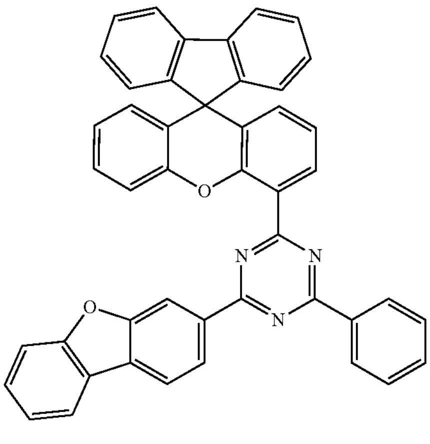

-continued
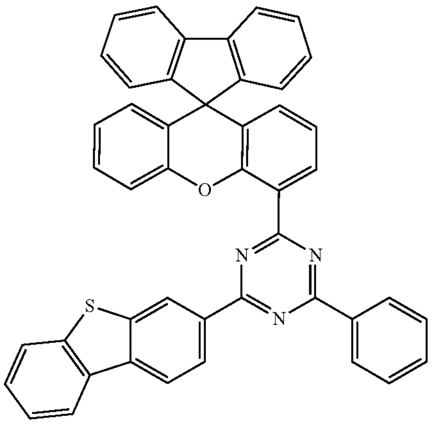
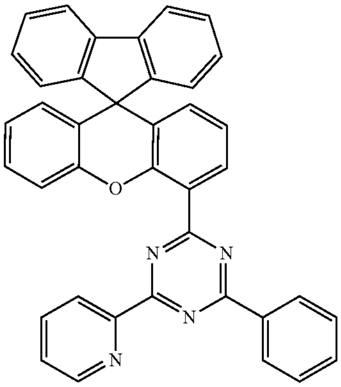
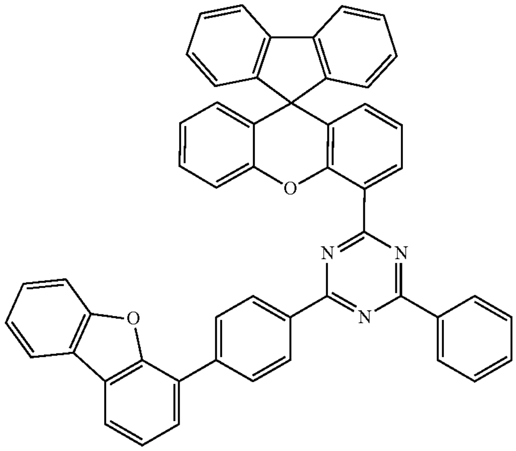
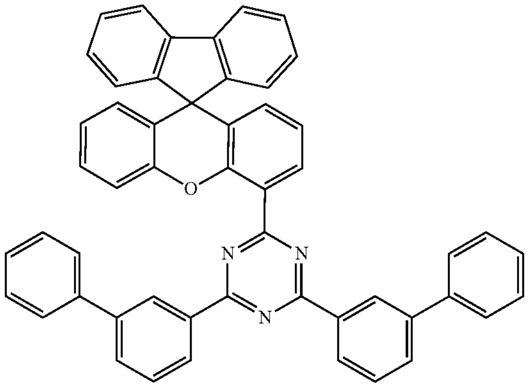
-continued
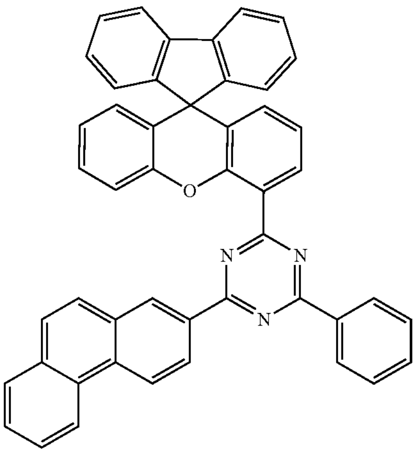
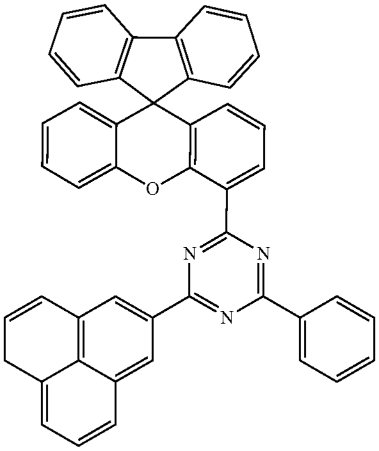
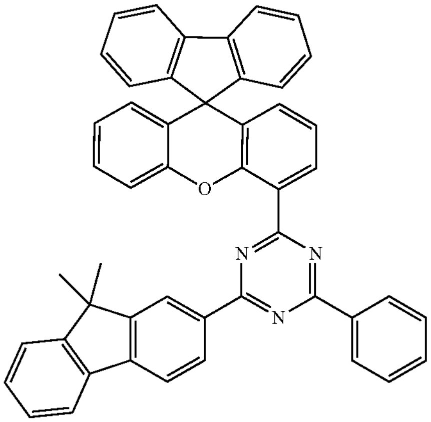

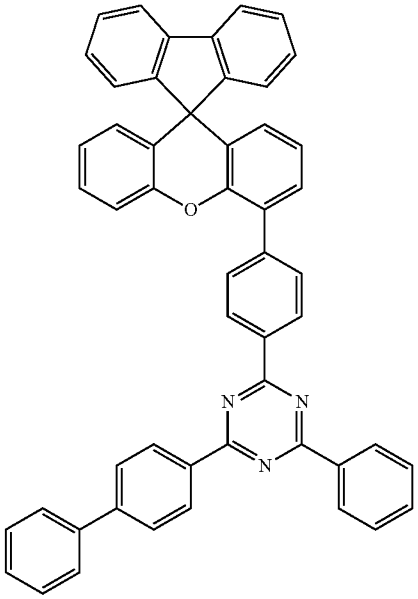
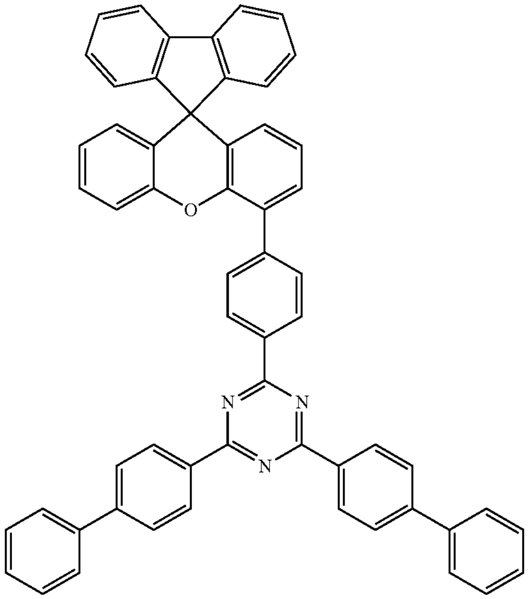
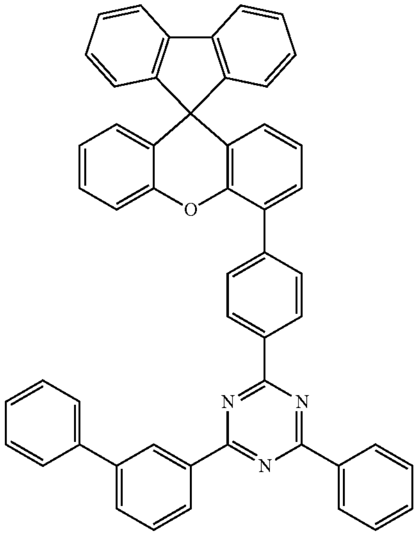
-continued
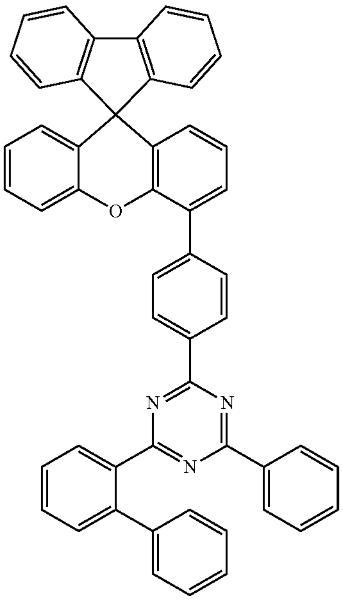
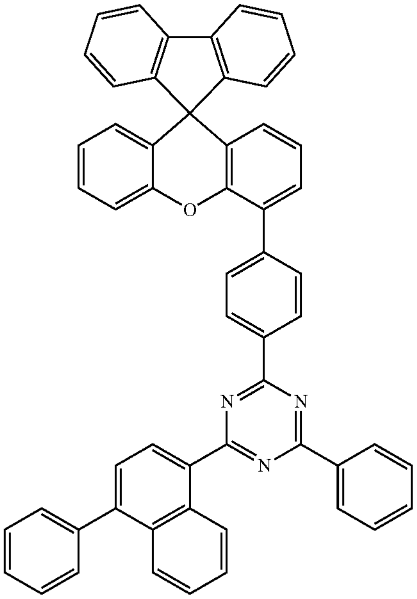

-continued
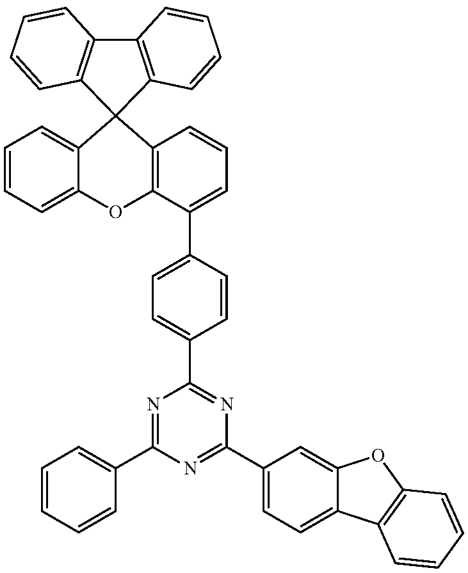
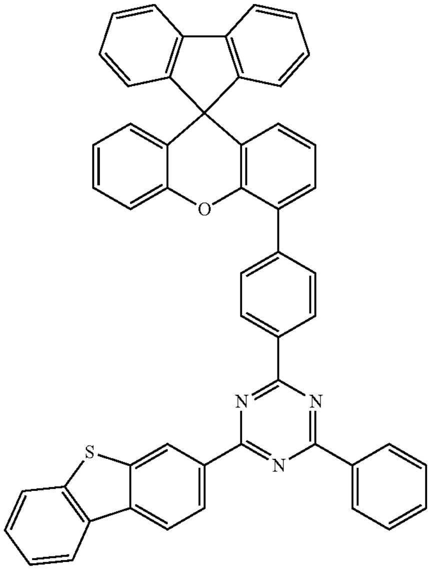
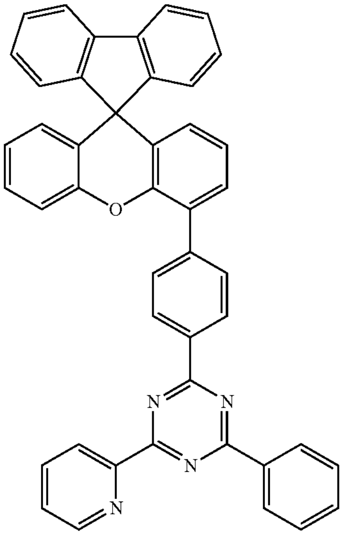
-continued
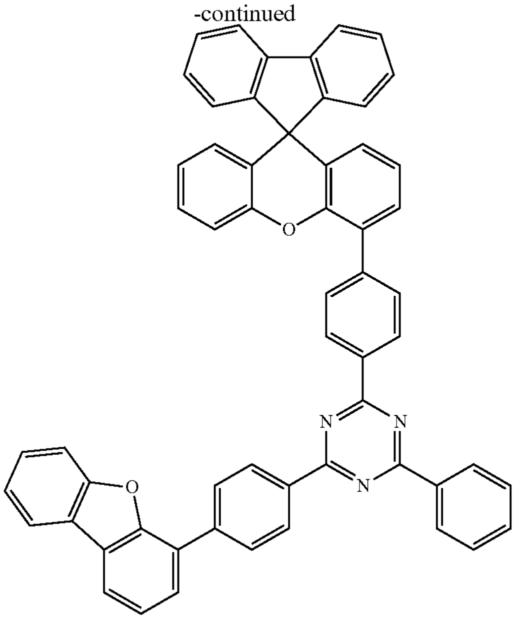
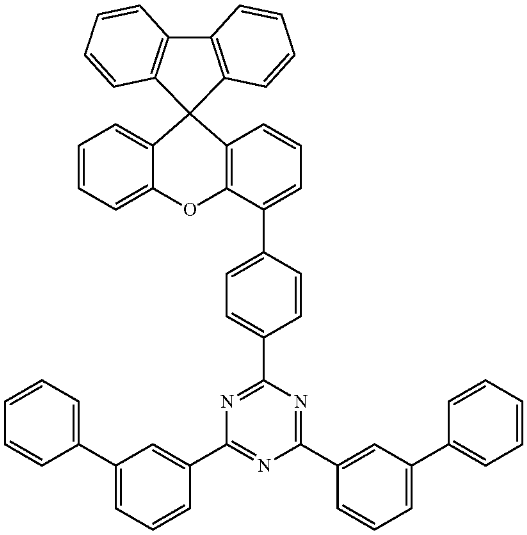
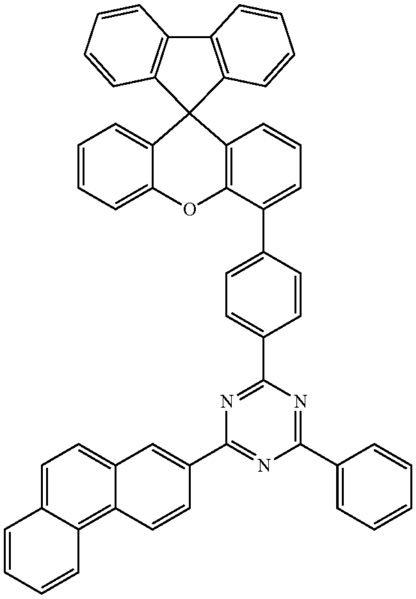

-continued
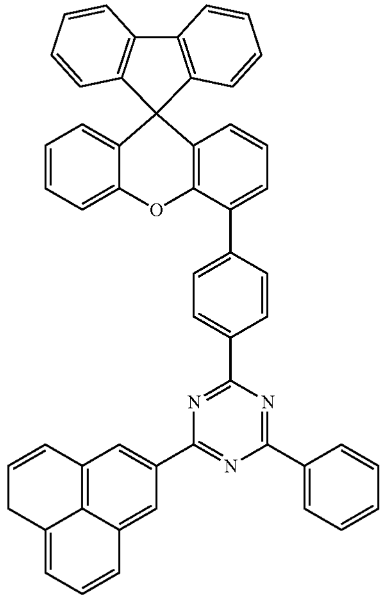
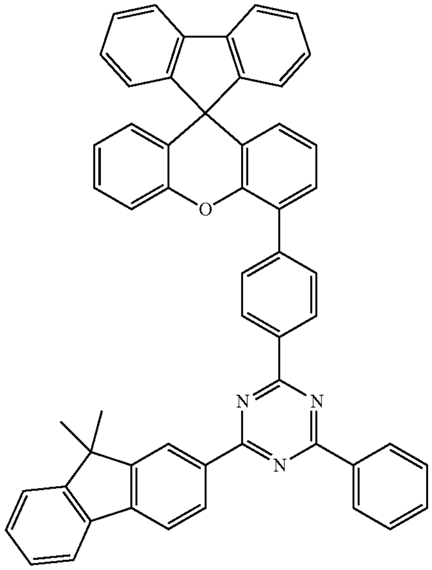
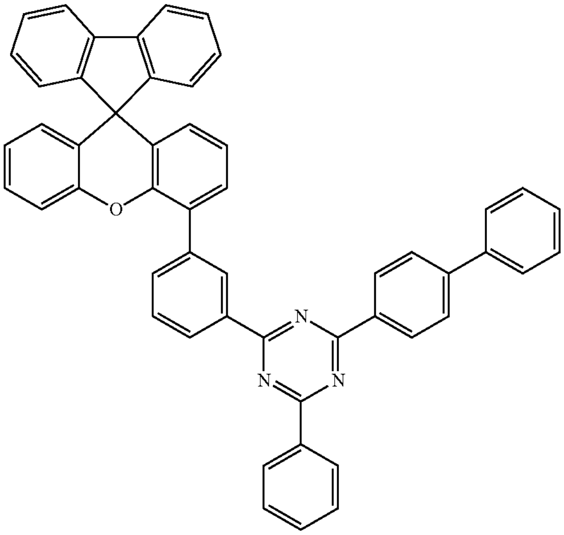
-continued
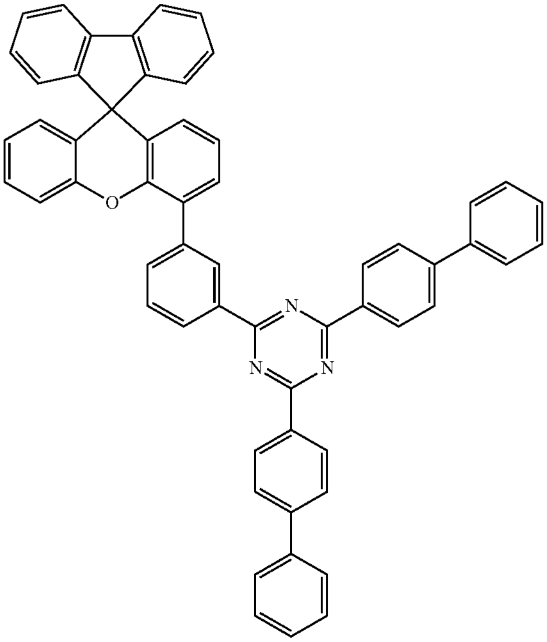
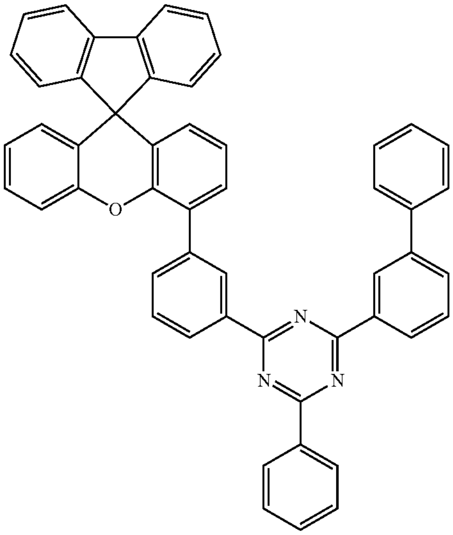
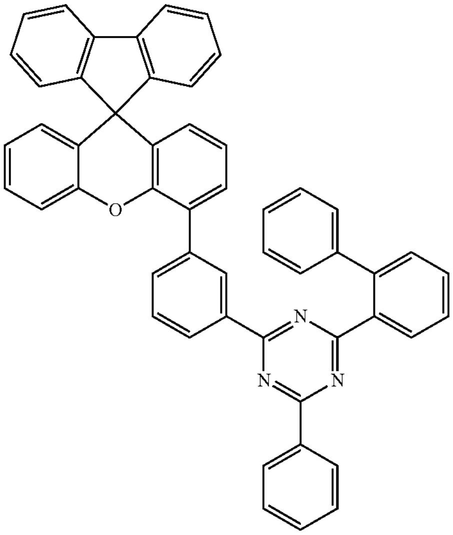

-continued
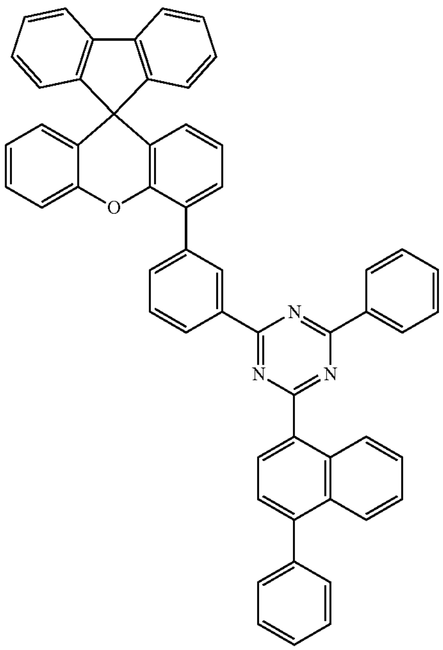
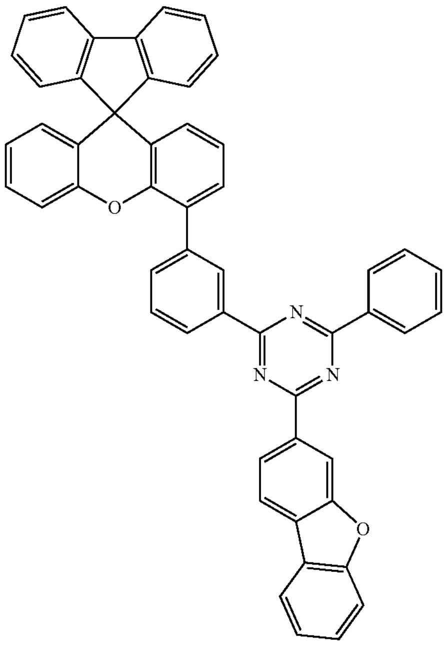
-continued
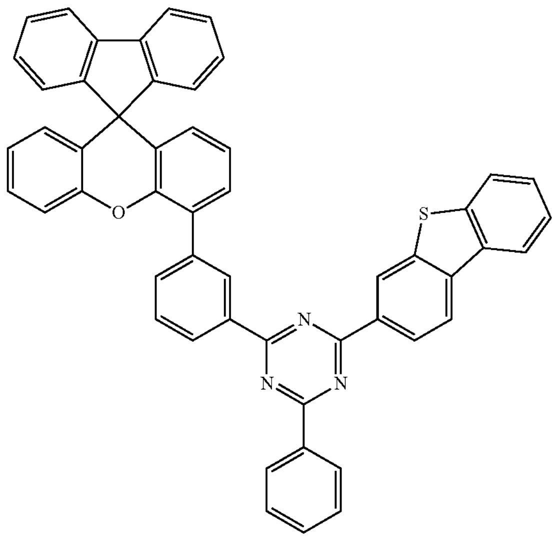
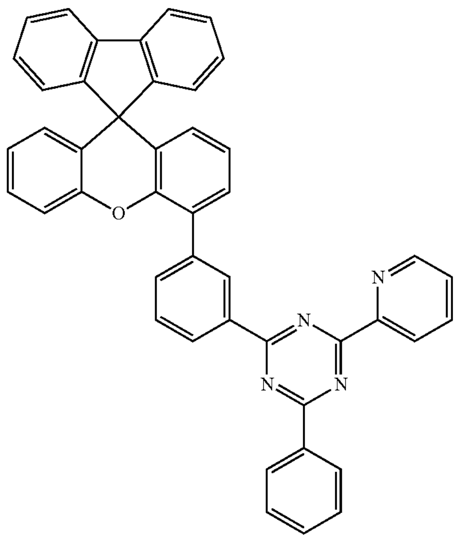
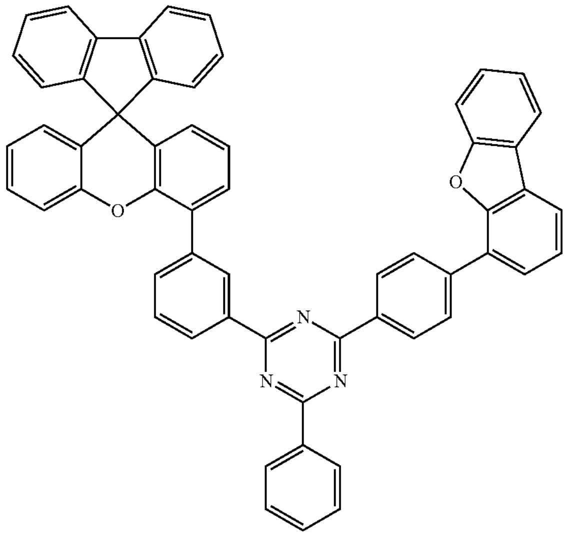

-continued
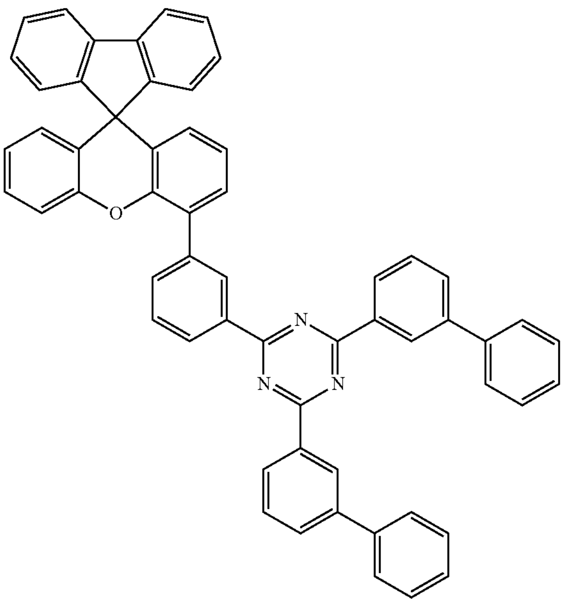
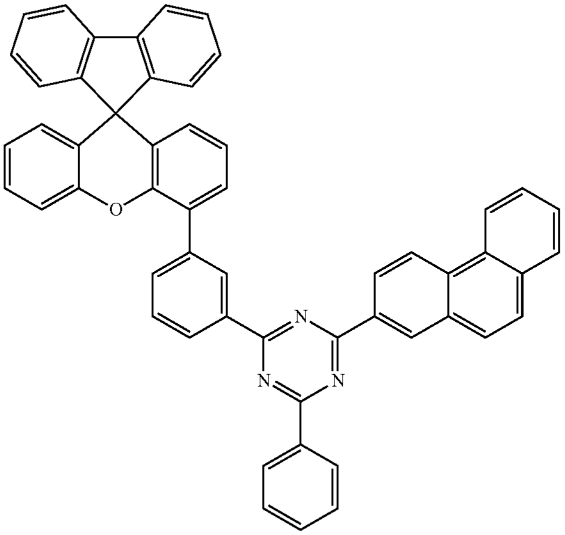
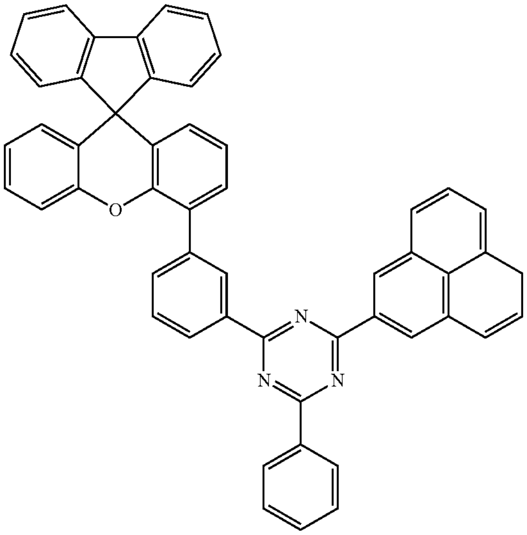
-continued
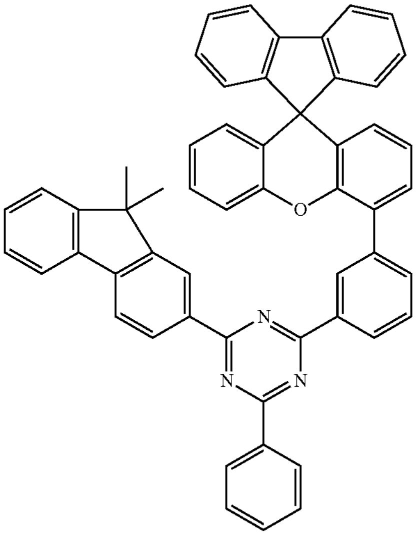
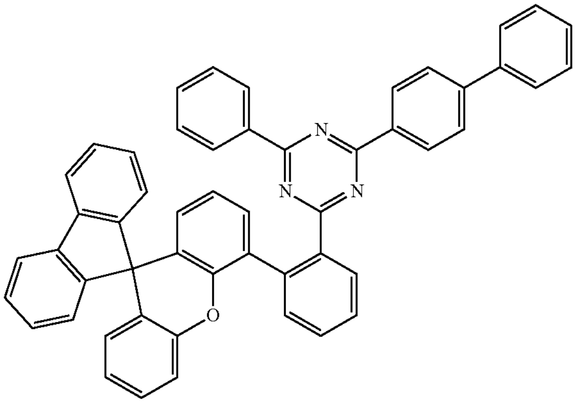
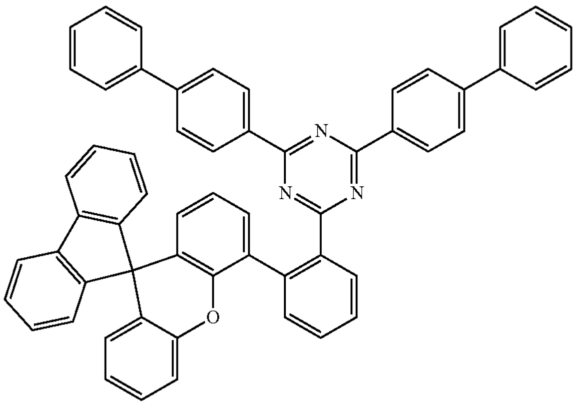

-continued
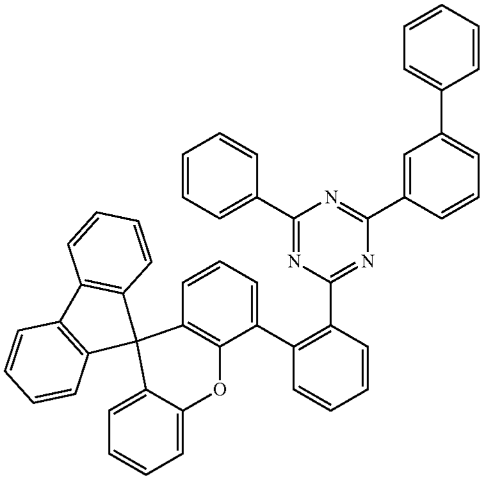
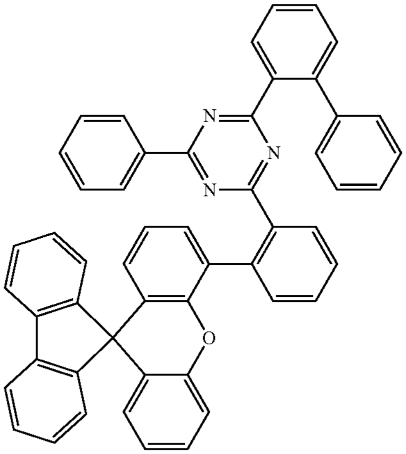
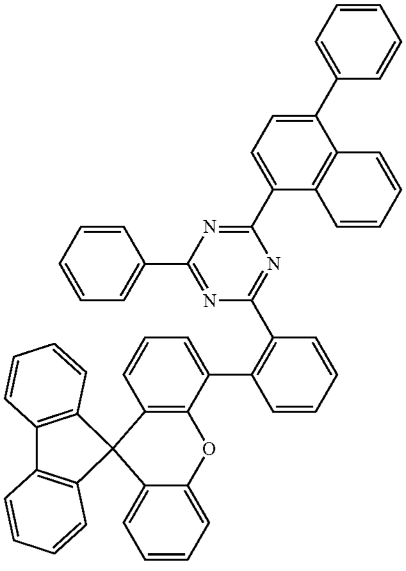 [SMILES: c1ccc(-c2nc(-c3ccccc3-c3cccc4c3Oc3ccccc3C43c4ccccc4-c4ccccc43)nc(-c3ccc(-c4ccccc4)c4ccccc34)n2)cc1]
-continued
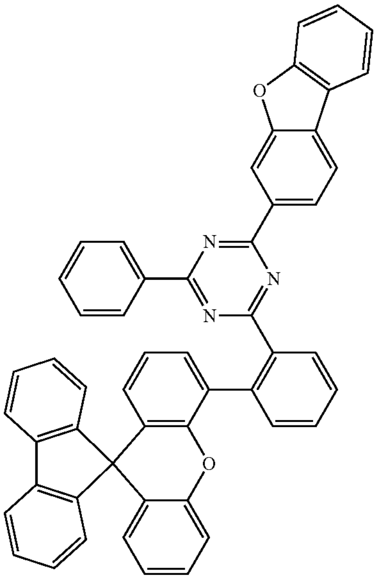
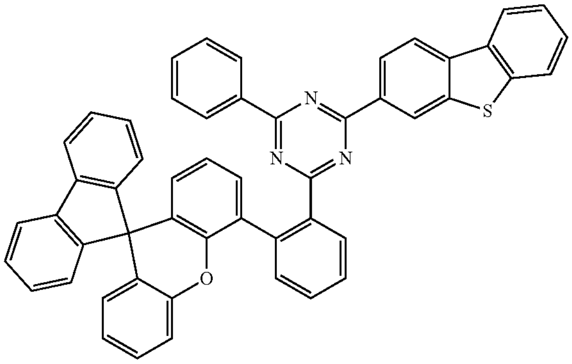
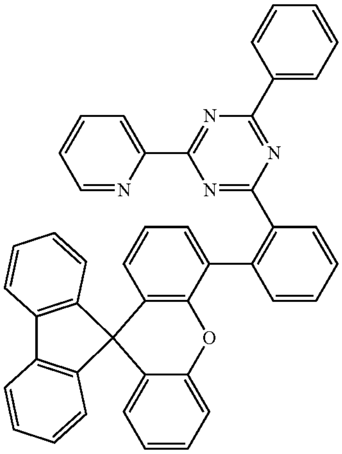

-continued
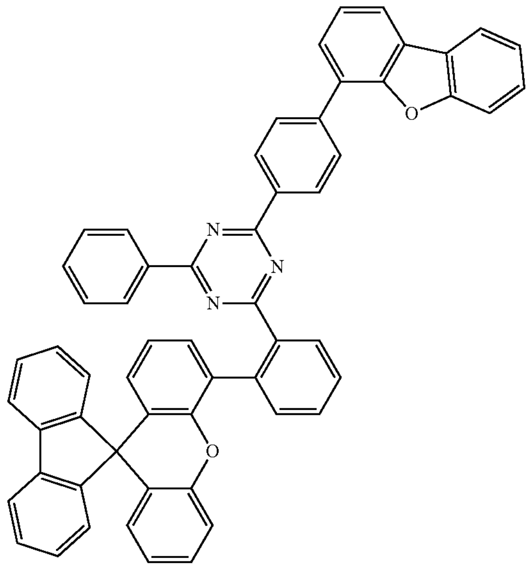
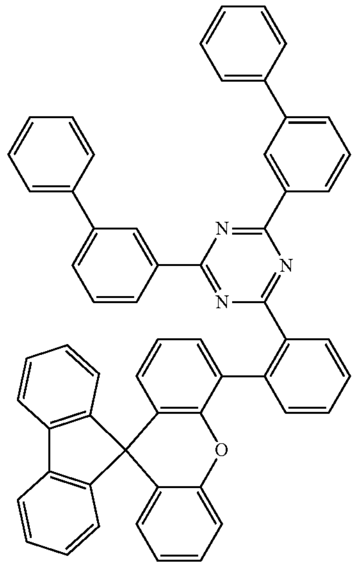
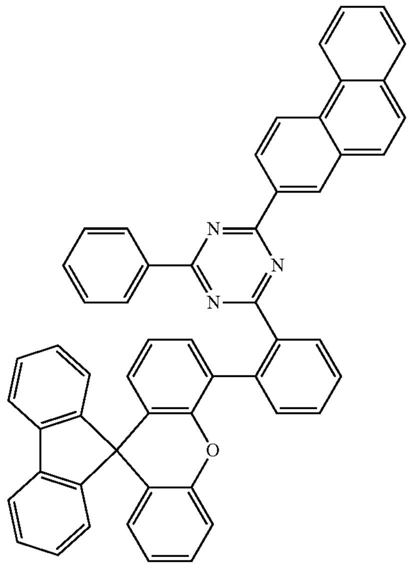
-continued
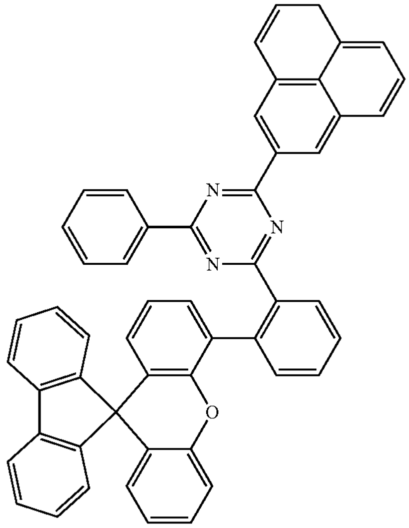
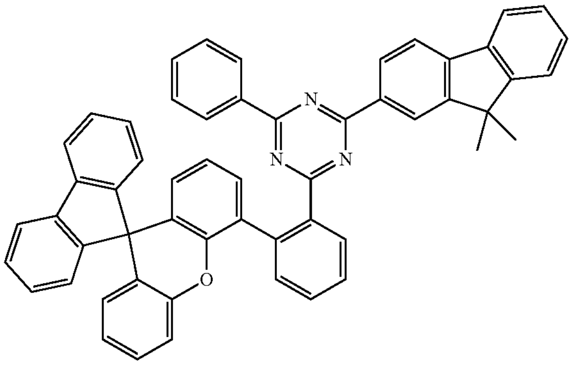
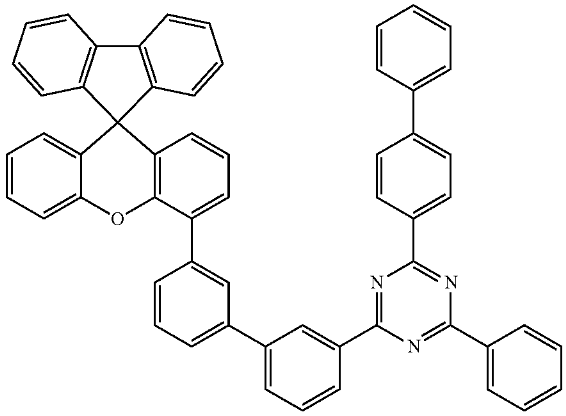
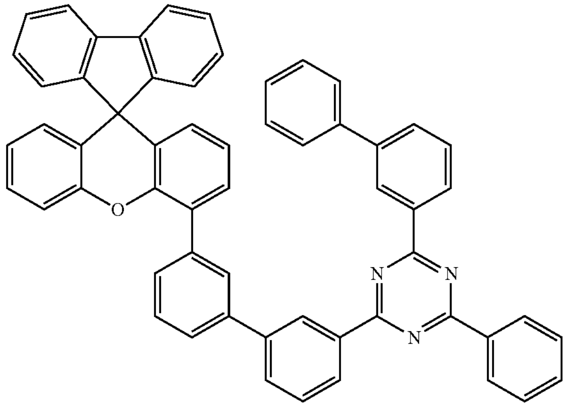

-continued
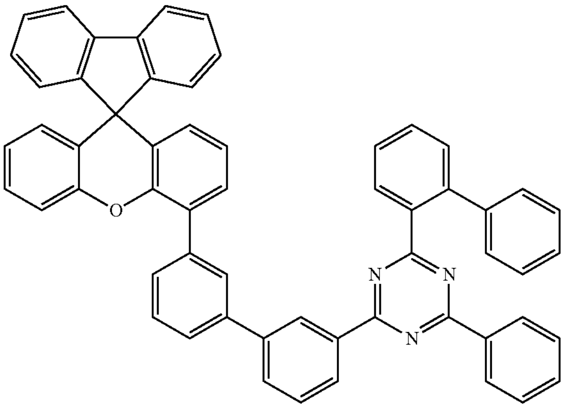
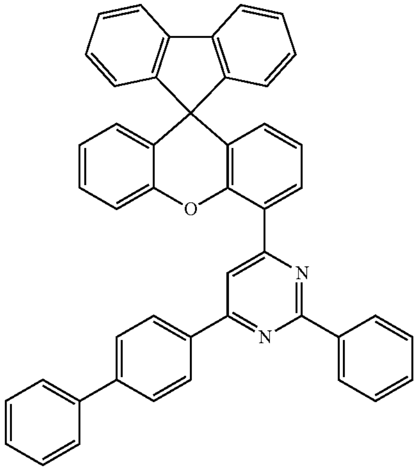
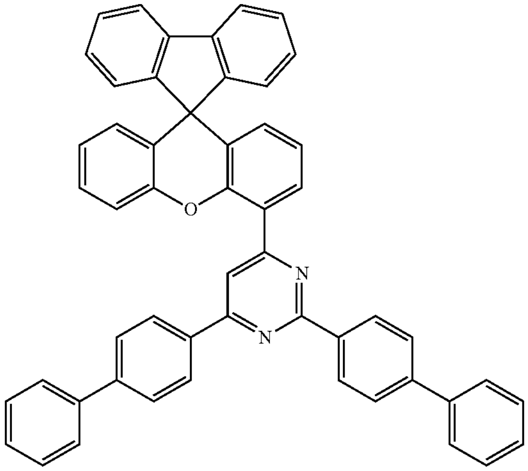
-continued
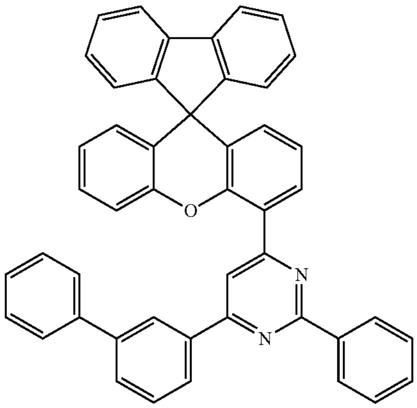
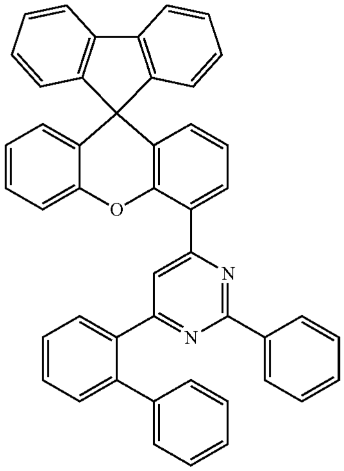 [SMILES: c1ccc(-c2nc(-c3ccccc3-c3ccccc3)cc(-c3cccc4c3Oc3ccccc3C43c4ccccc4-c4ccccc43)n2)cc1]
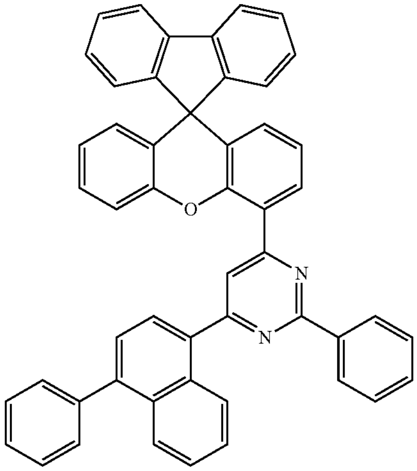

-continued
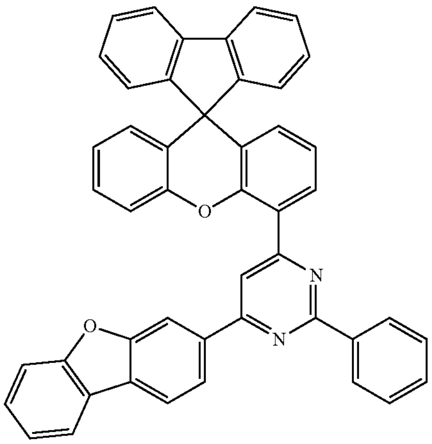
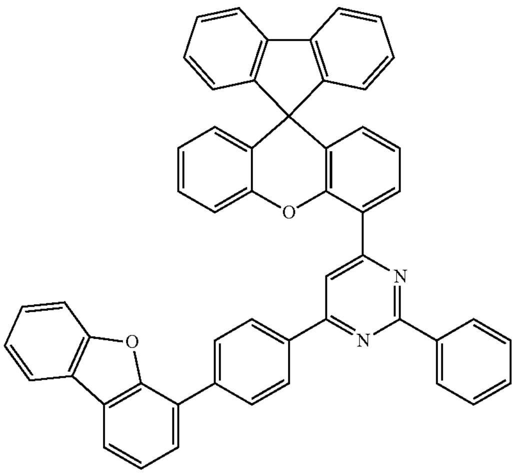
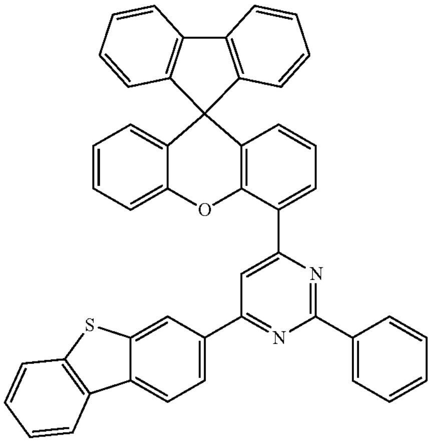
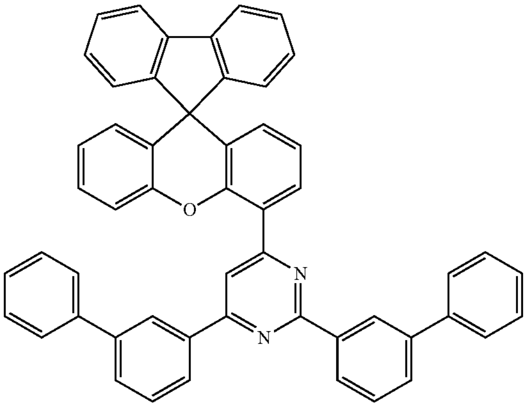
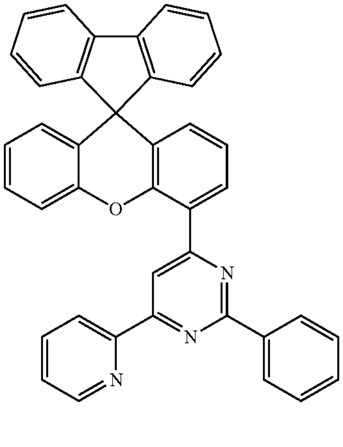
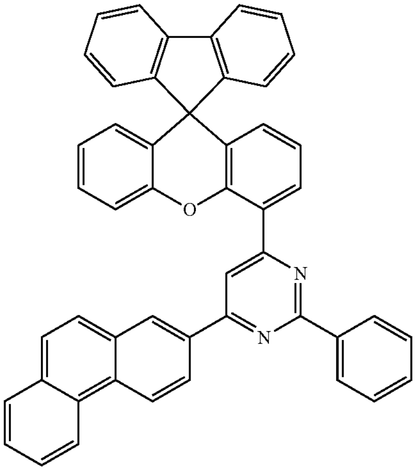
-continued -continued
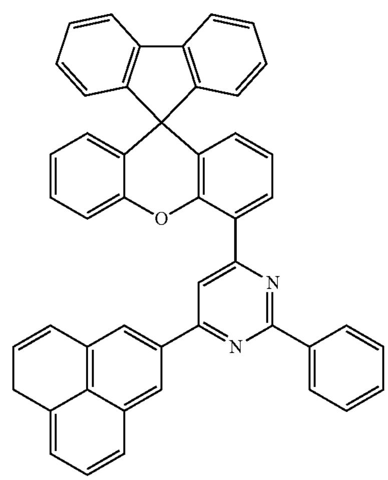
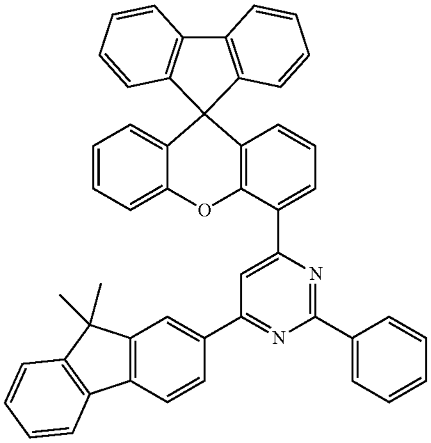
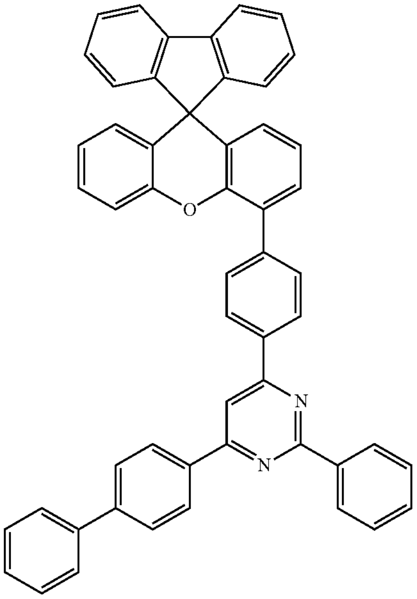
-continued
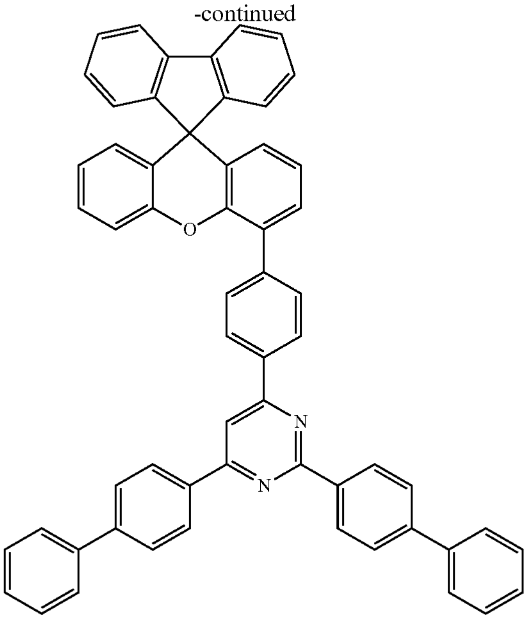
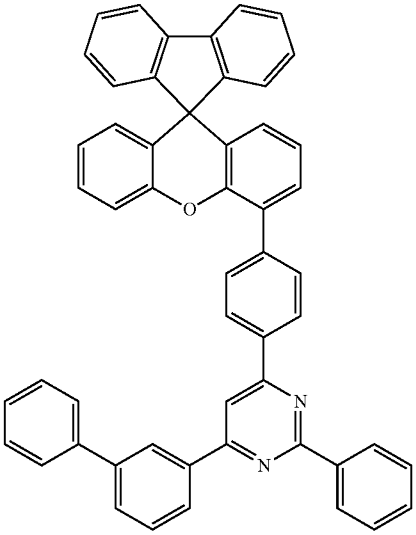
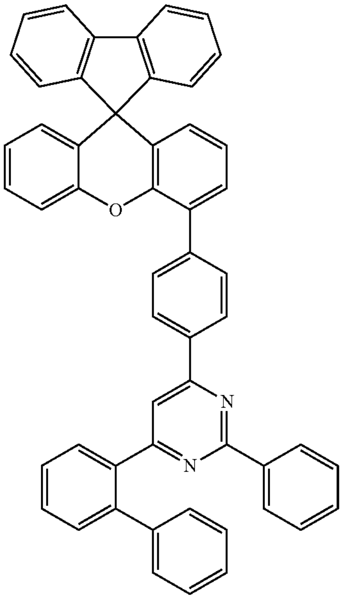 [SMILES: c1ccc(-c2nc(-c3ccc(-c4cccc5c4Oc4ccccc4C54c5ccccc5-c5ccccc54)cc3)cc(-c3ccccc3-c3ccccc3)n2)cc1]

-continued
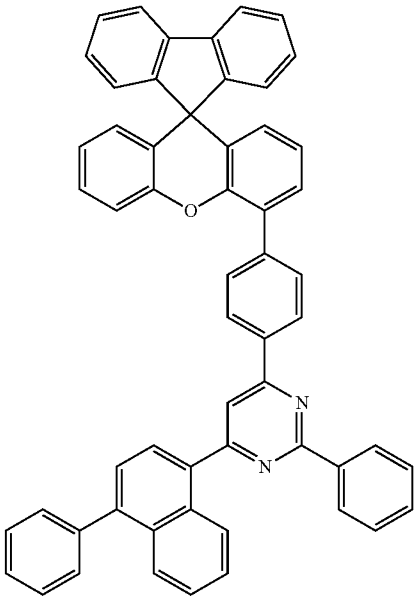
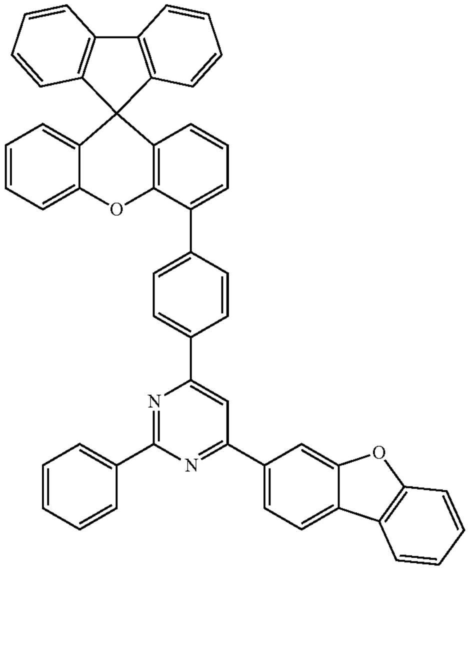
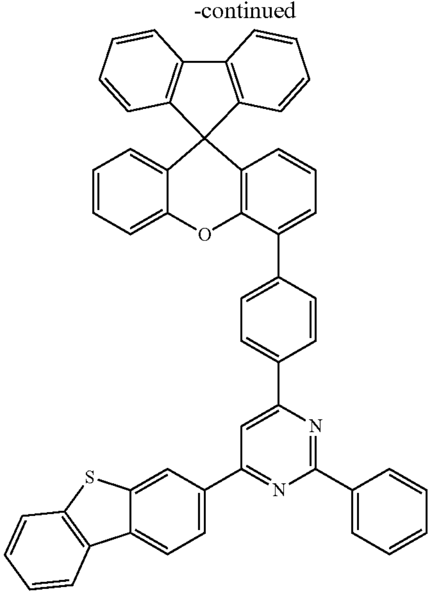
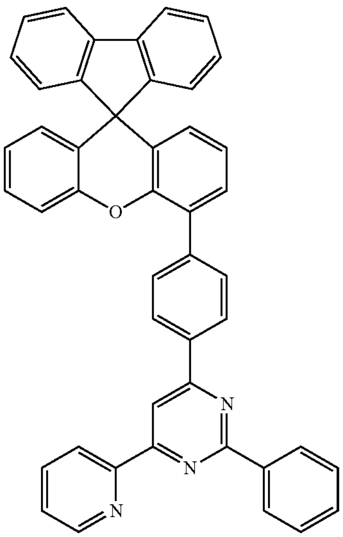
-continued
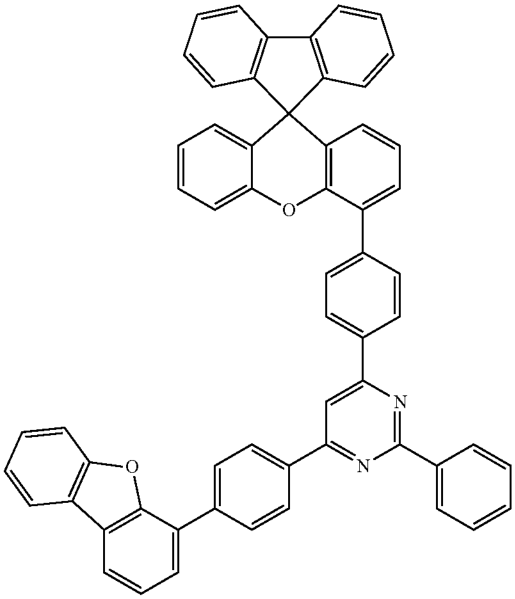

-continued
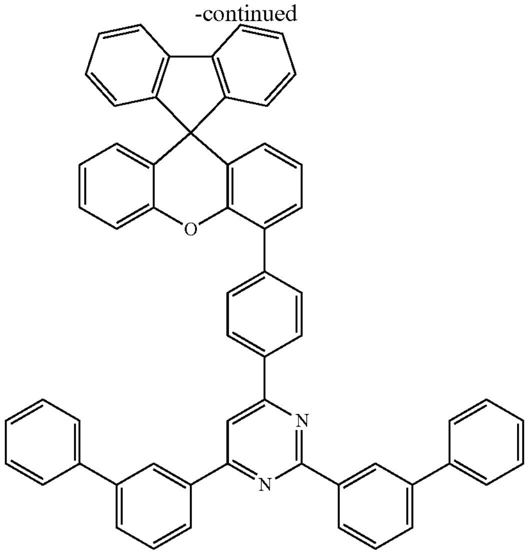
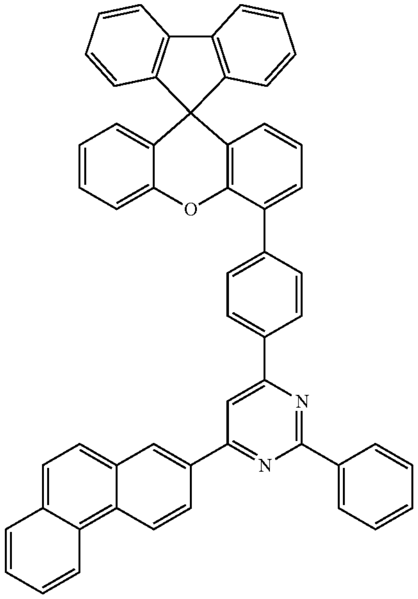
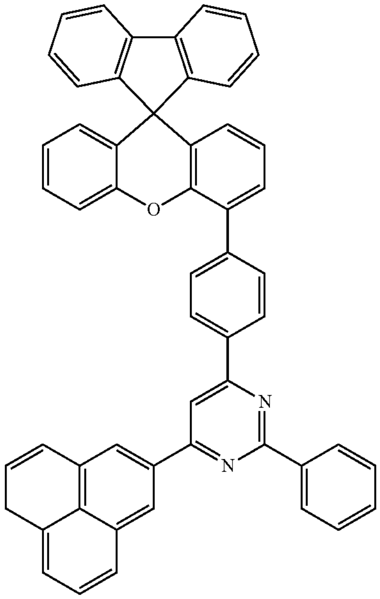
-continued
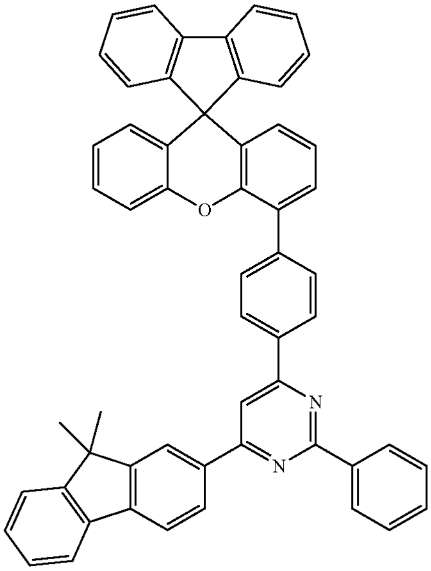
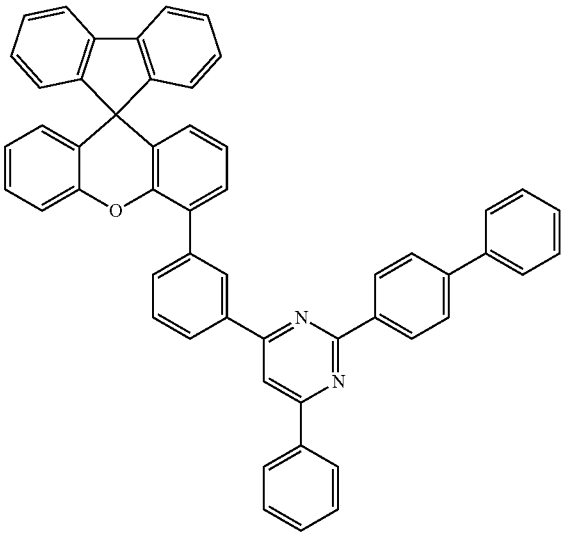

-continued
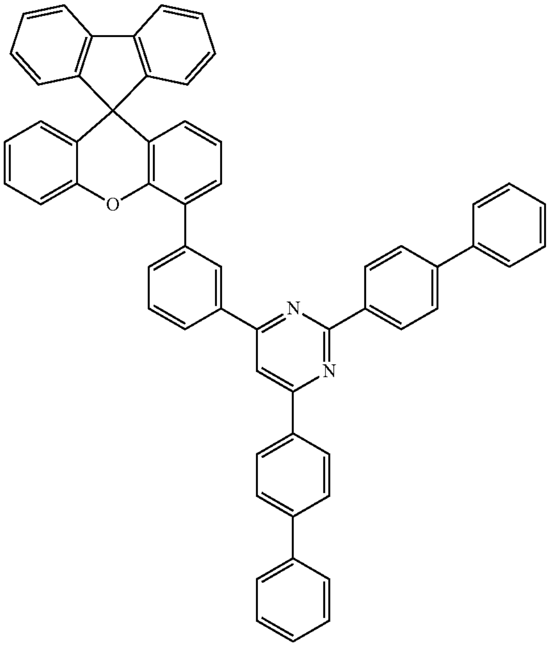
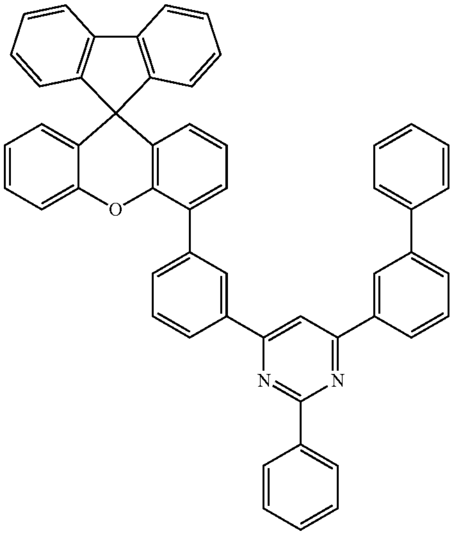
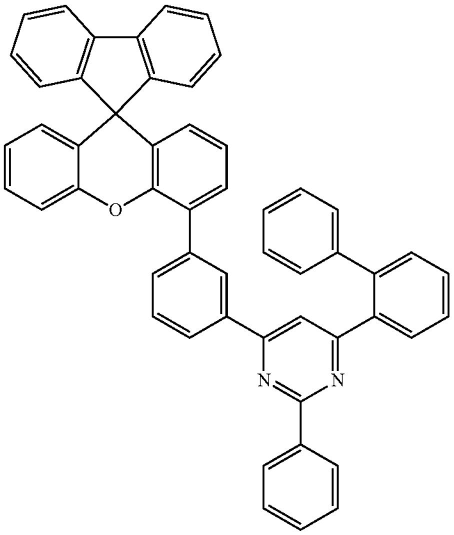
-continued
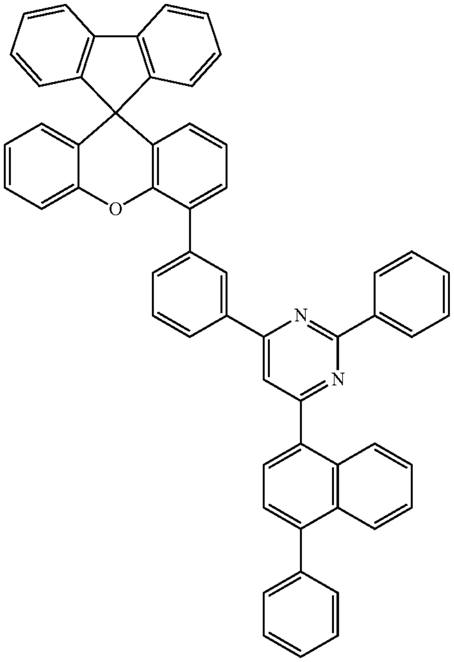
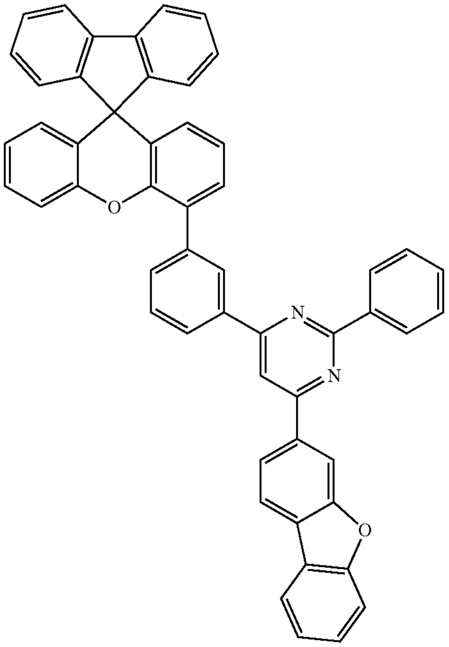

-continued
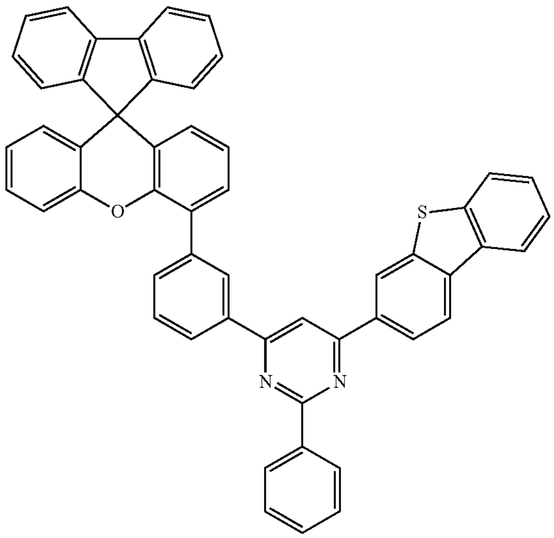
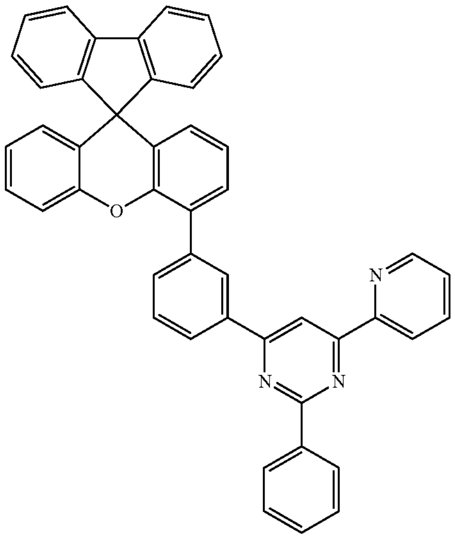
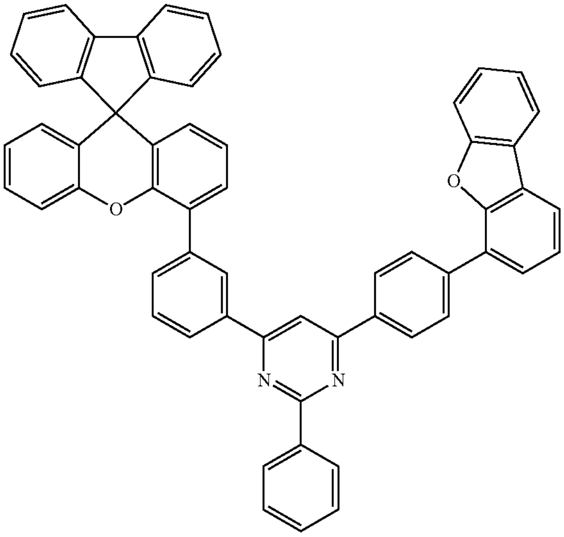
-continued
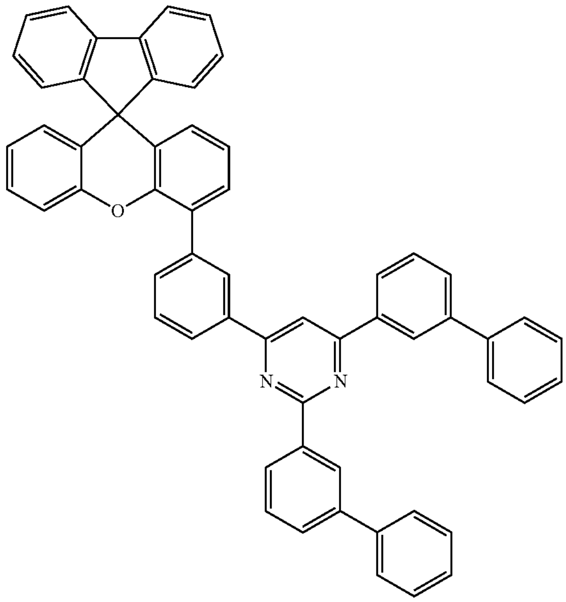
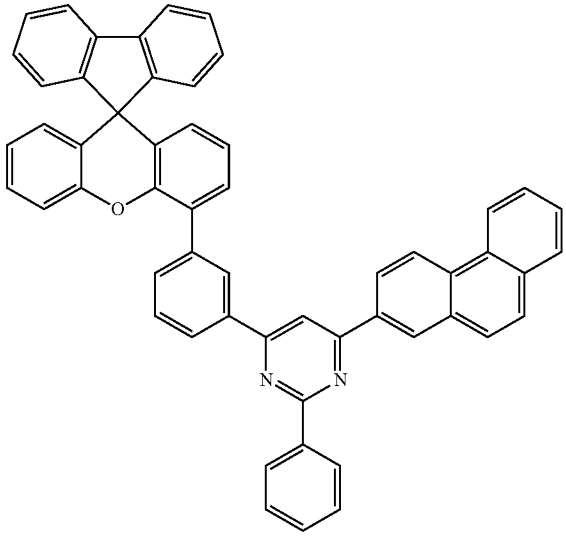
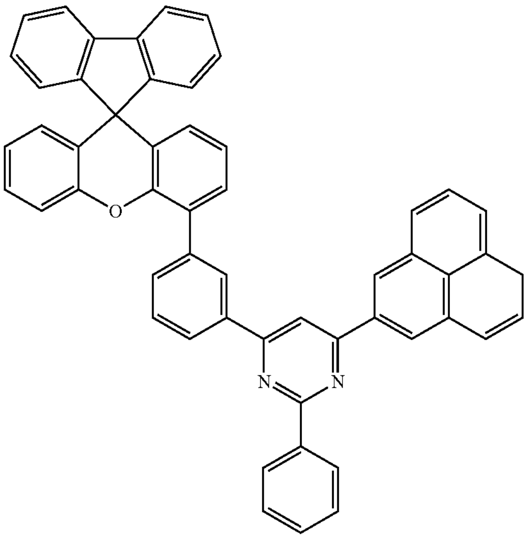

-continued
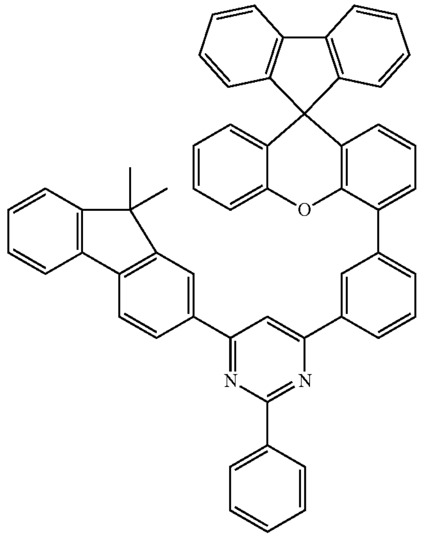
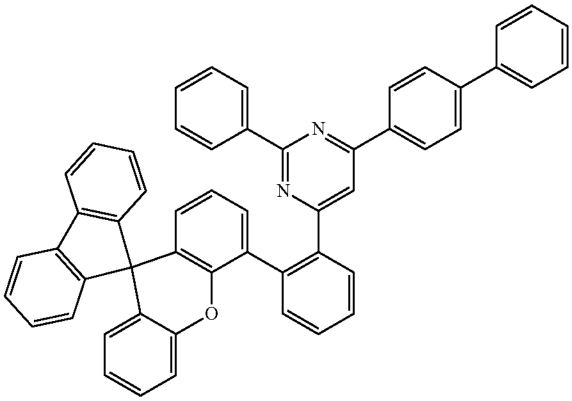
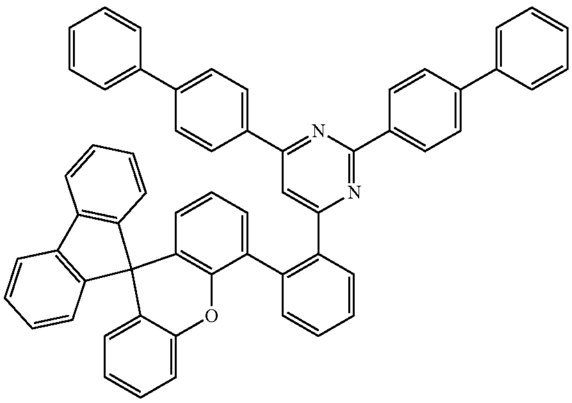
-continued
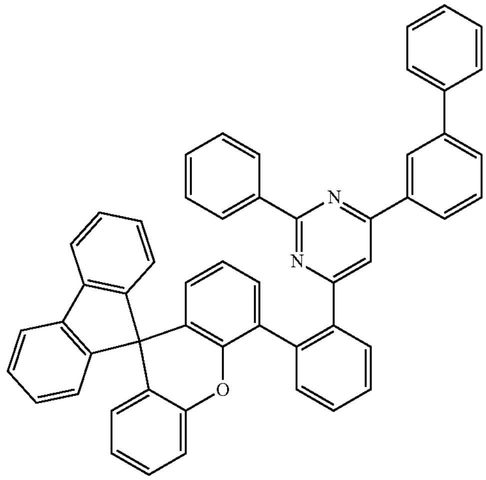
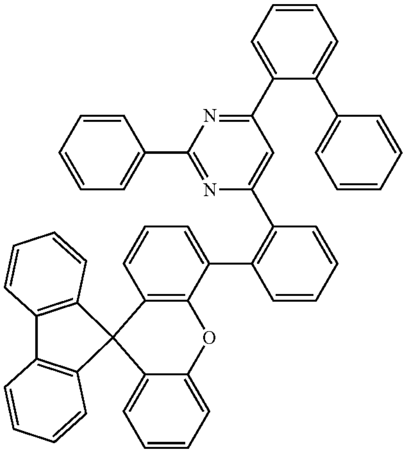
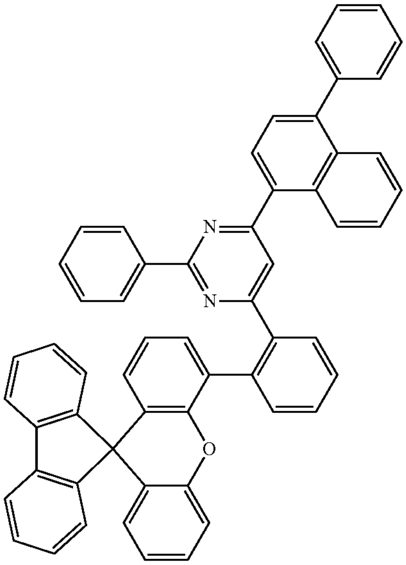 [SMILES: c1ccc(-c2nc(-c3ccccc3-c3cccc4c3Oc3ccccc3C43c4ccccc4-c4ccccc43)cc(-c3ccc(-c4ccccc4)c4ccccc34)n2)cc1]

-continued
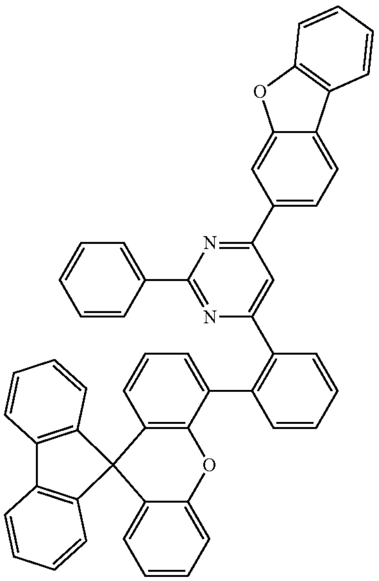
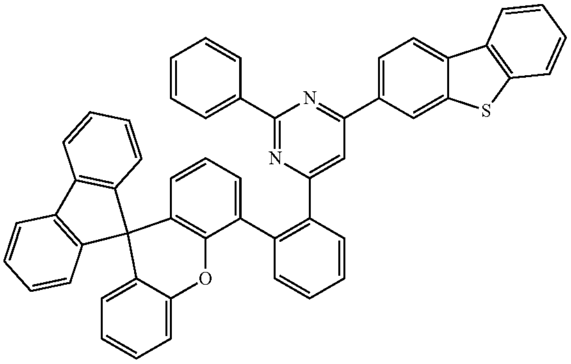
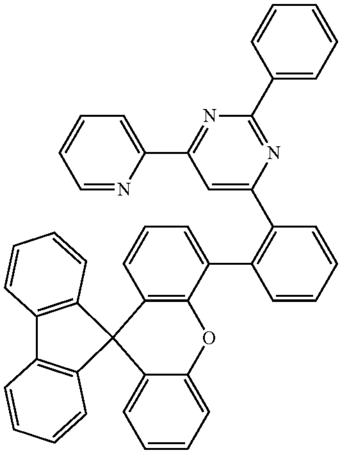
-continued
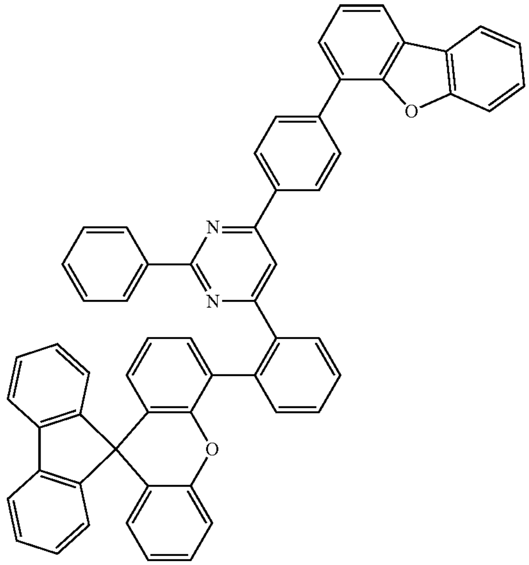
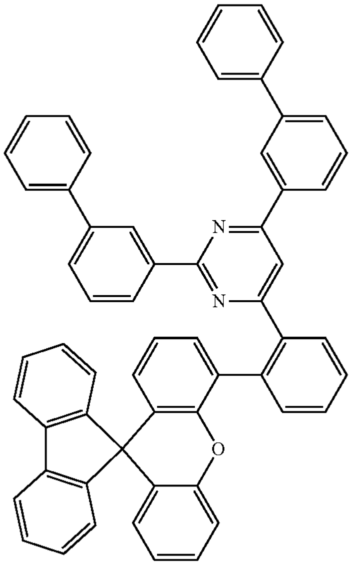
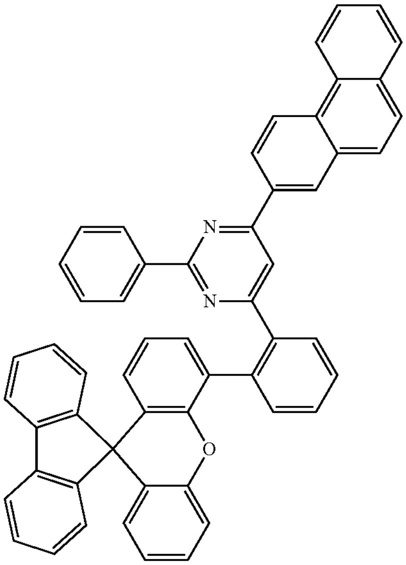

-continued
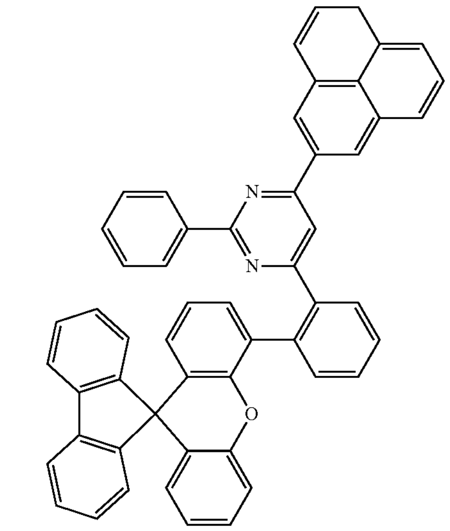
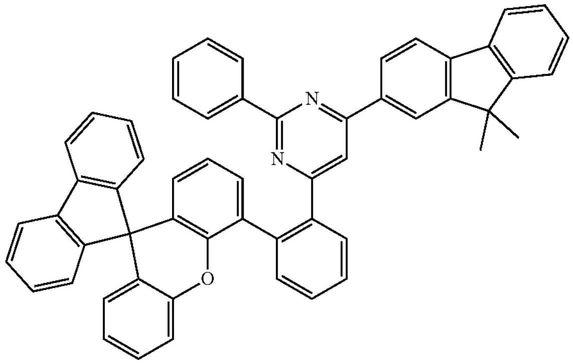
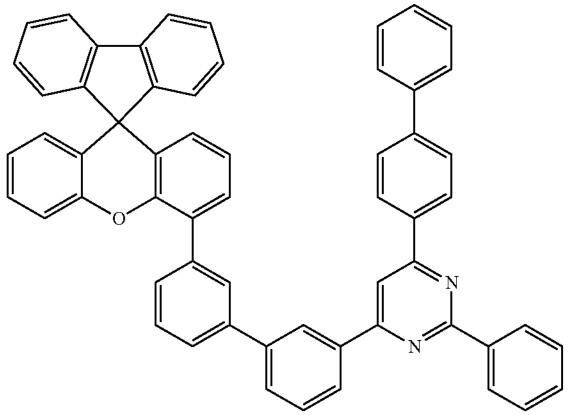
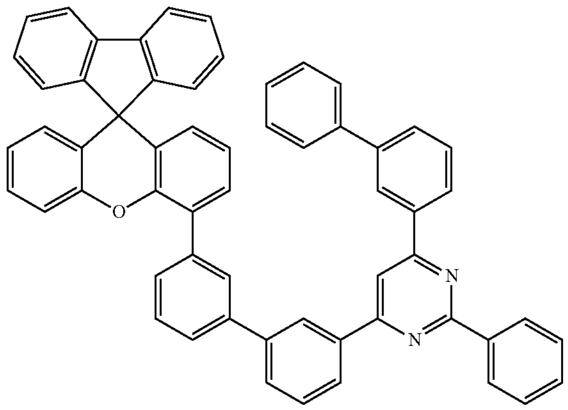
-continued
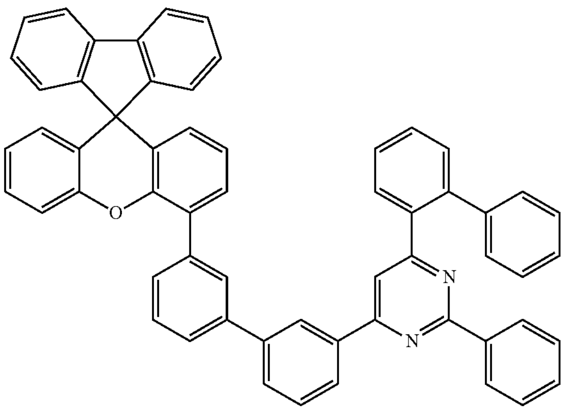 [SMILES: c1ccc(-c2nc(-c3cccc(-c4cccc(-c5cccc6c5Oc5ccccc5C65c6ccccc6-c6ccccc65)c4)c3)cc(-c3ccccc3-c3ccccc3)n2)cc1]
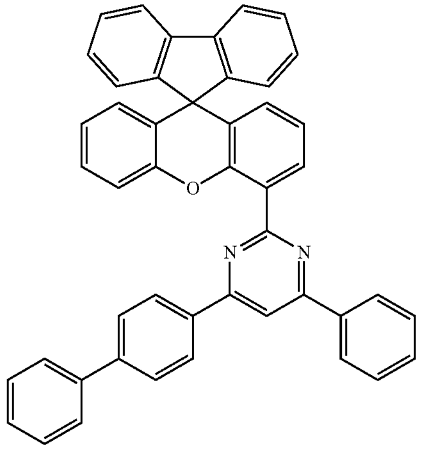
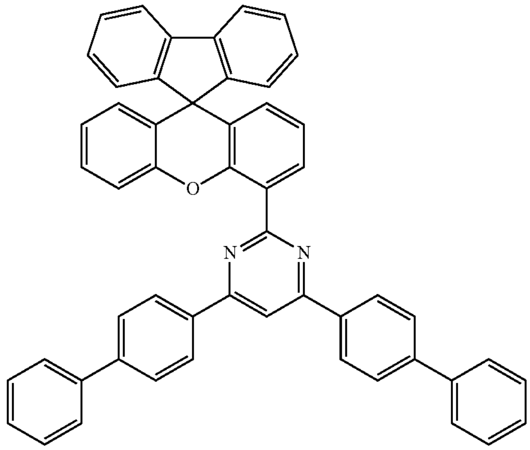

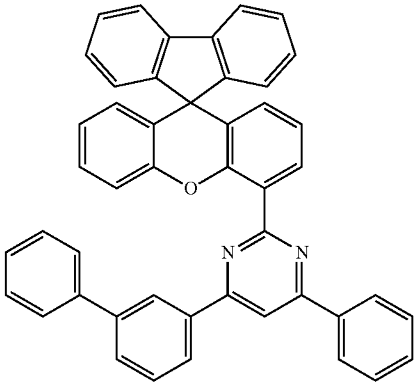
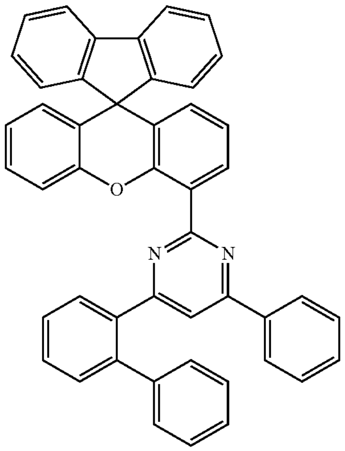
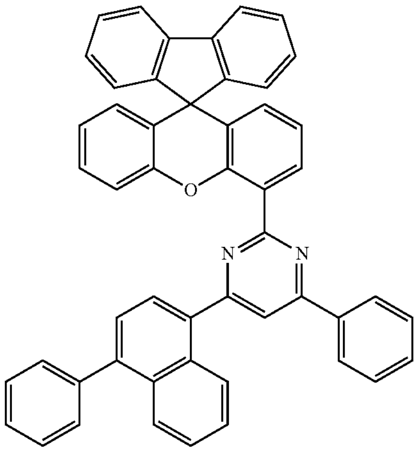
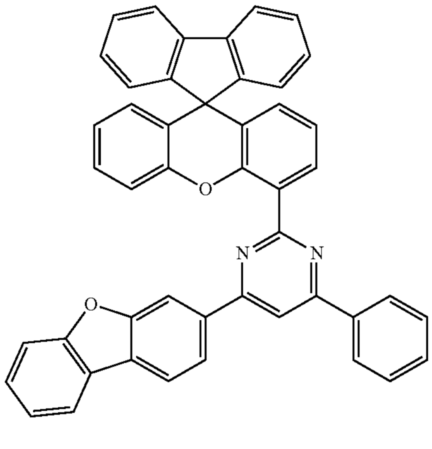
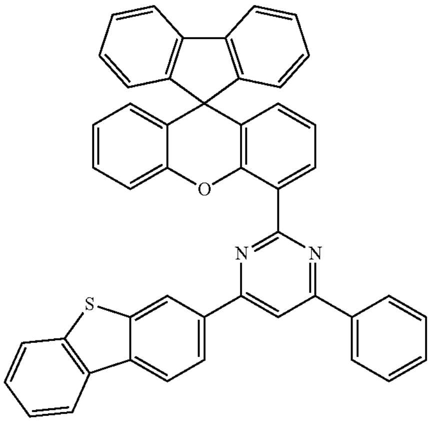
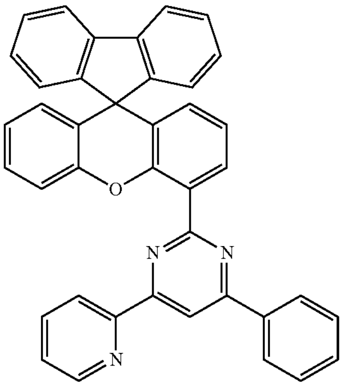
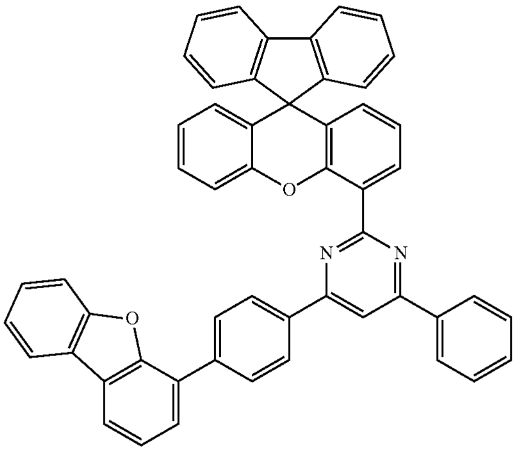
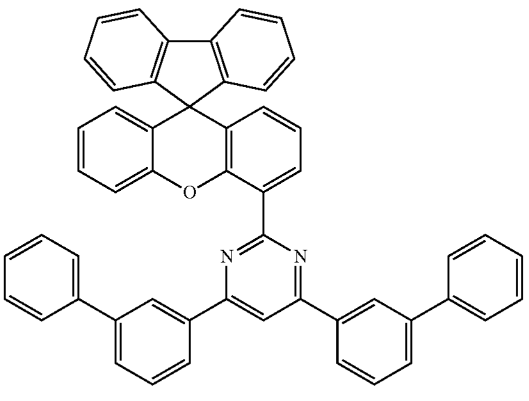

-continued
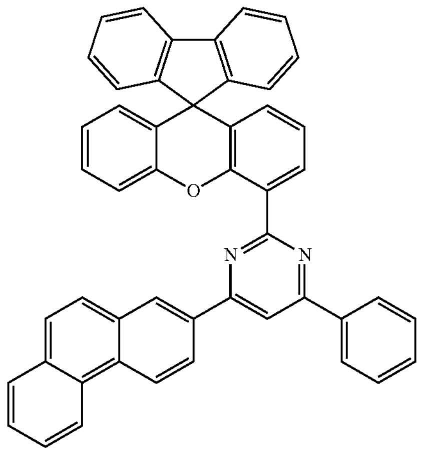
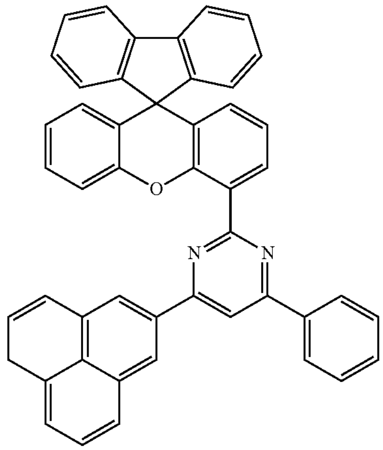
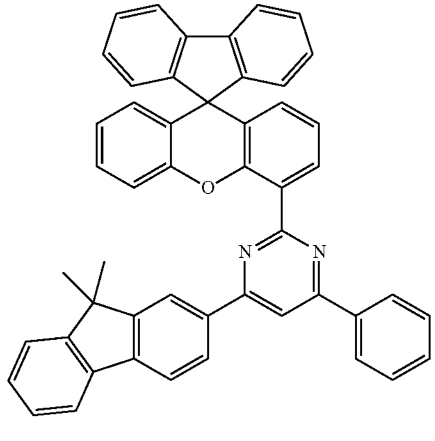
-continued
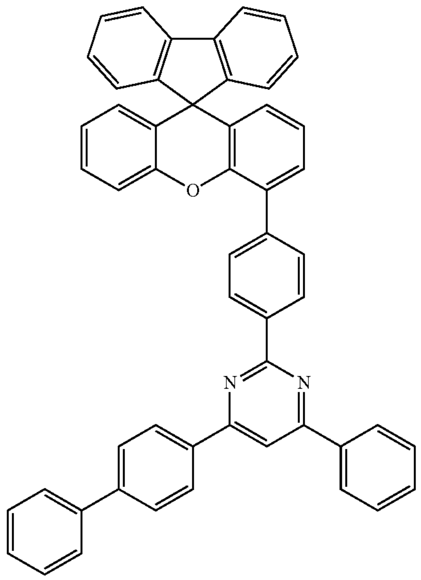
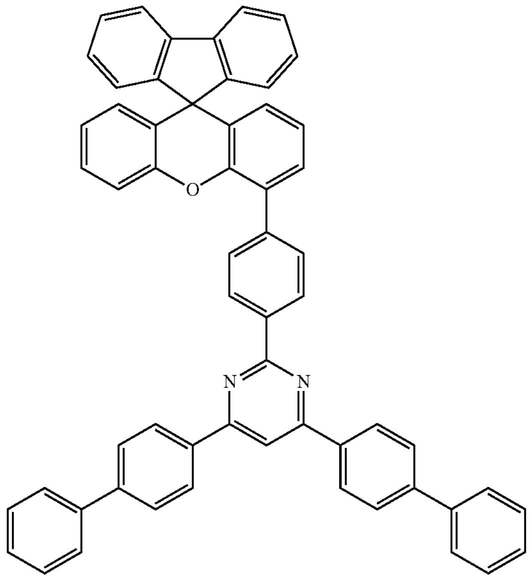
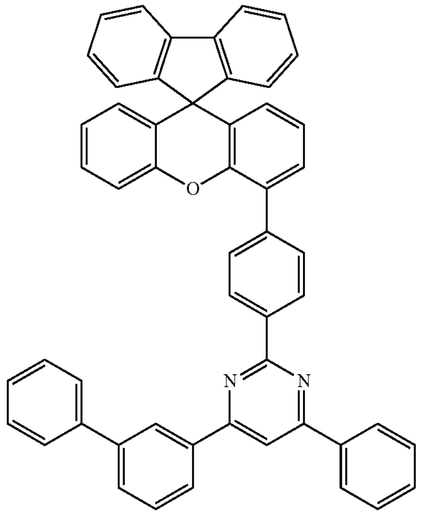

-continued
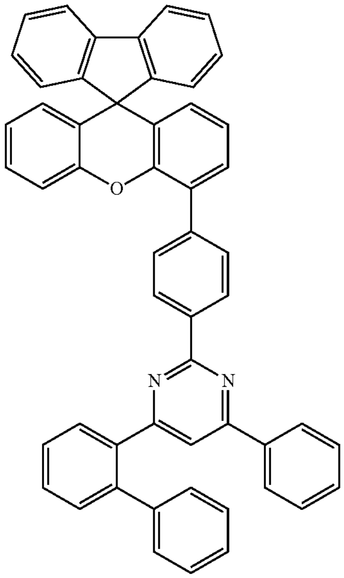
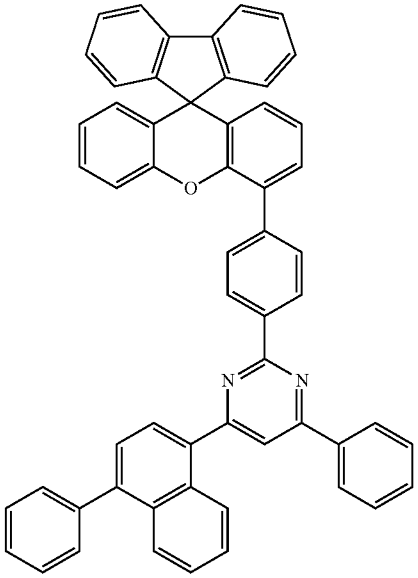
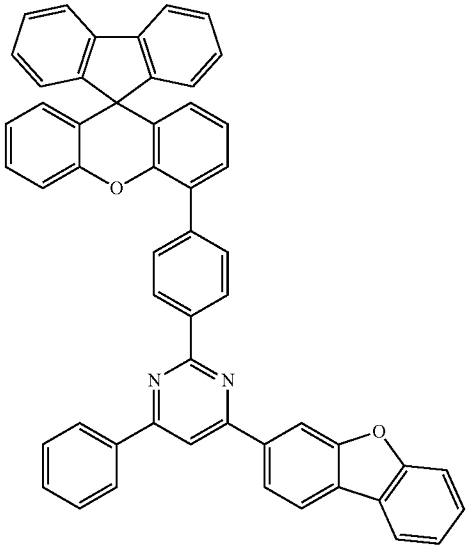
-continued
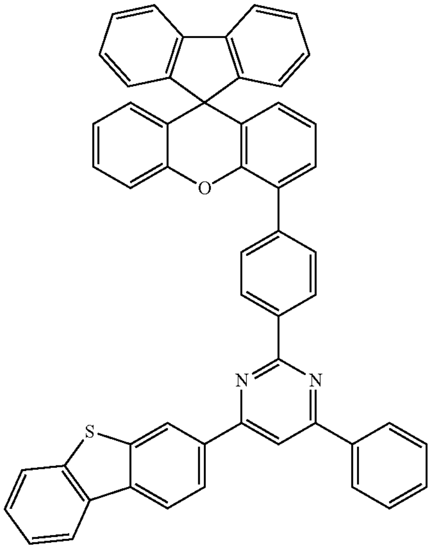
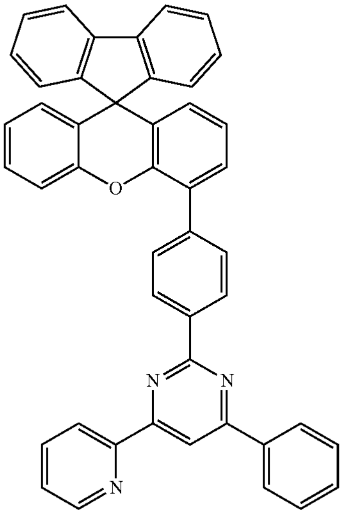
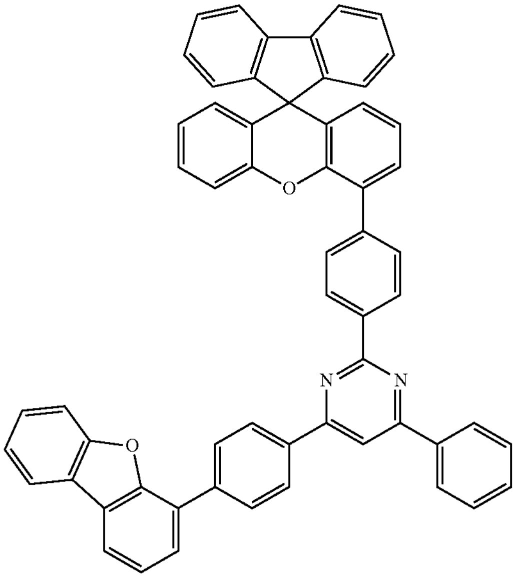

-continued
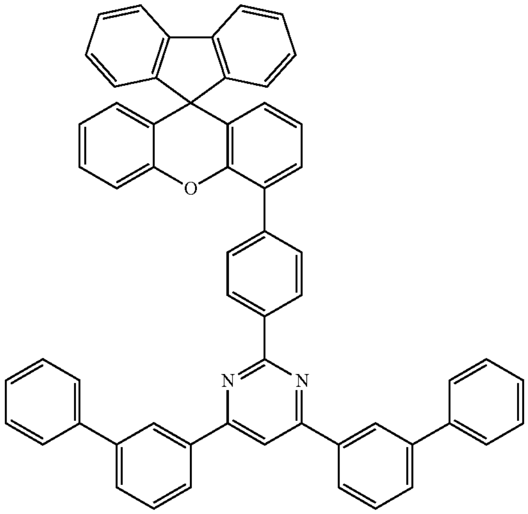
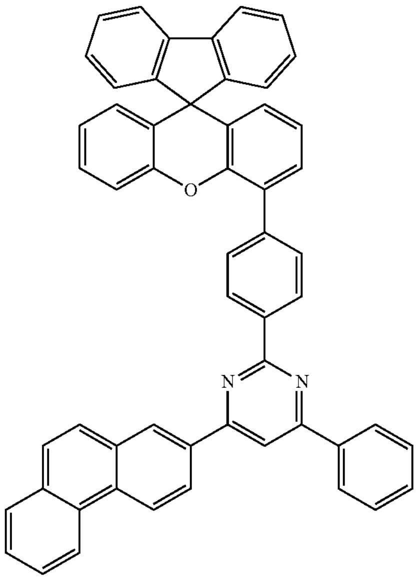
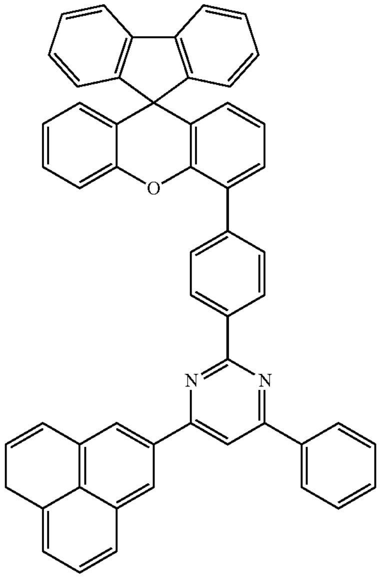
-continued
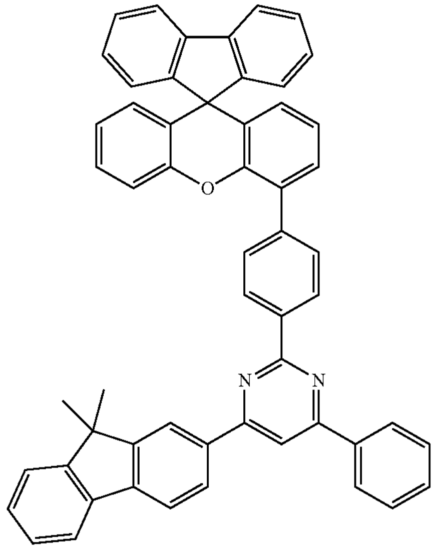
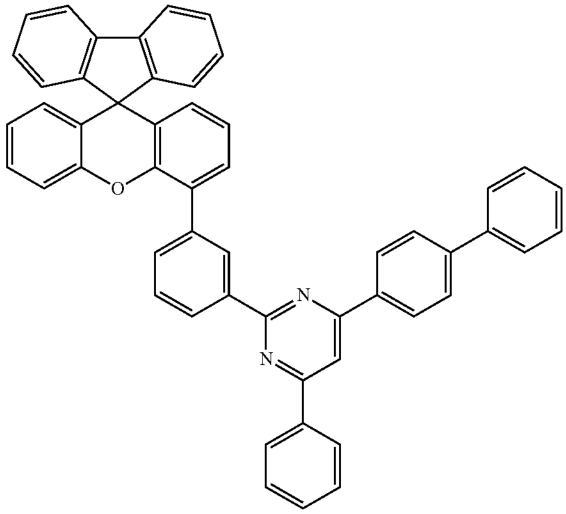
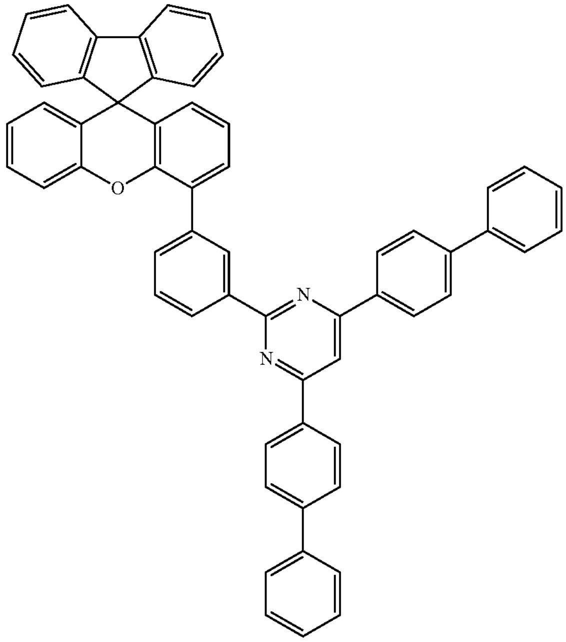

-continued
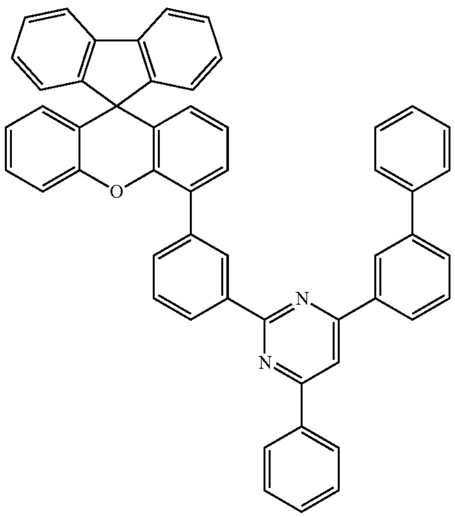
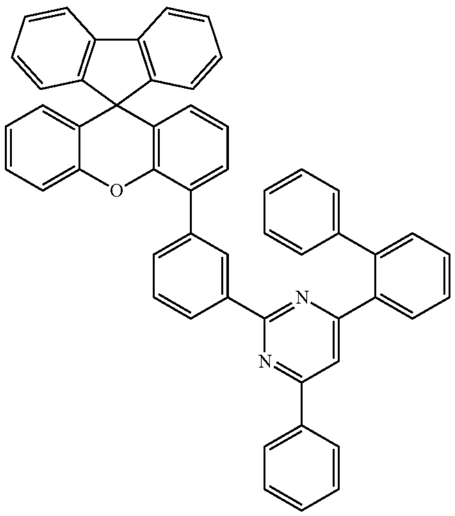
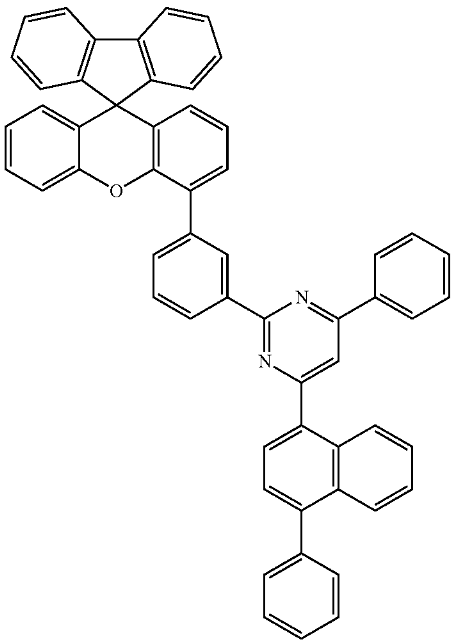
-continued
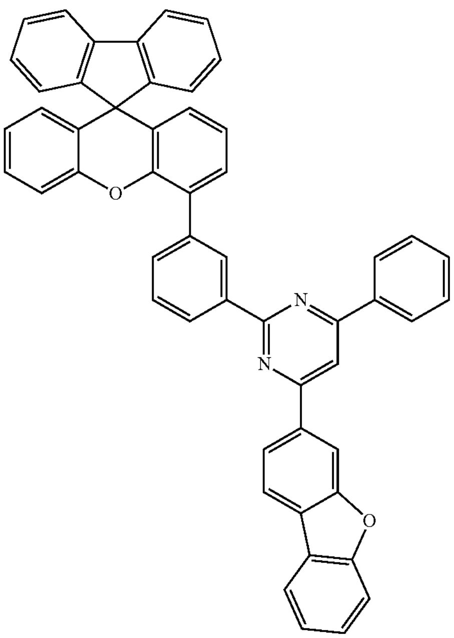
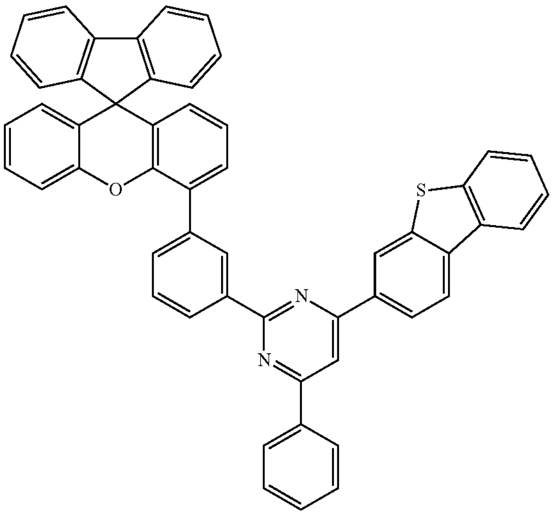
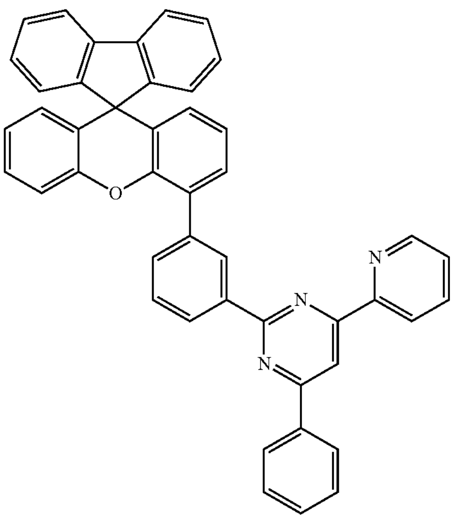

-continued
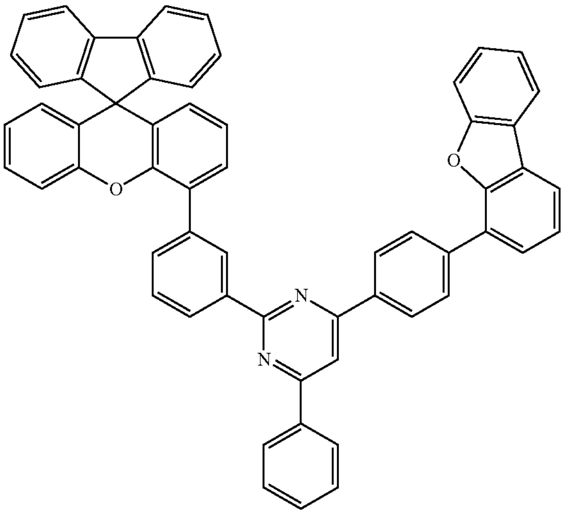
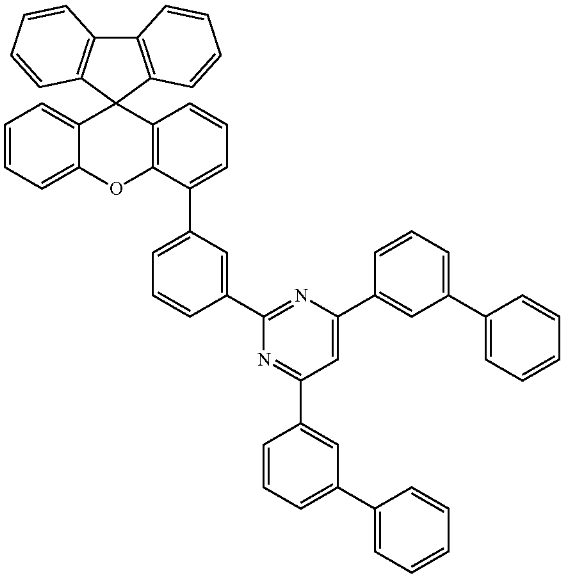
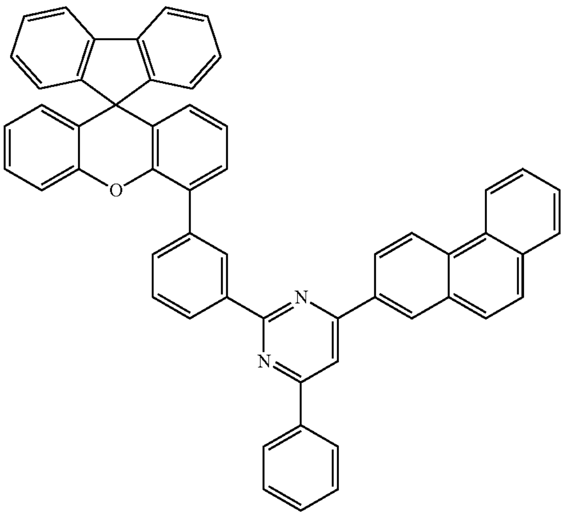
-continued
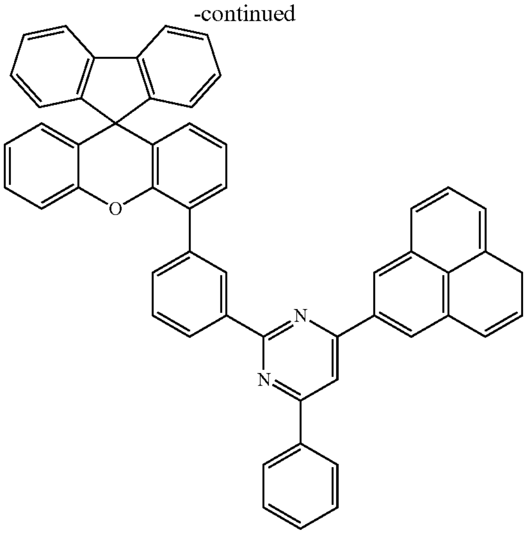
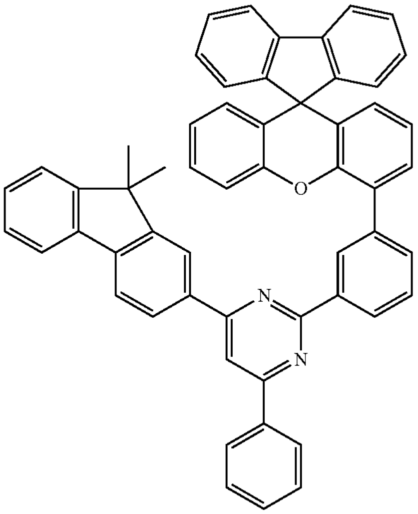
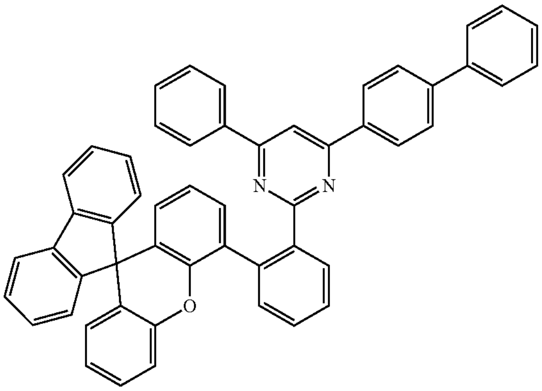

-continued
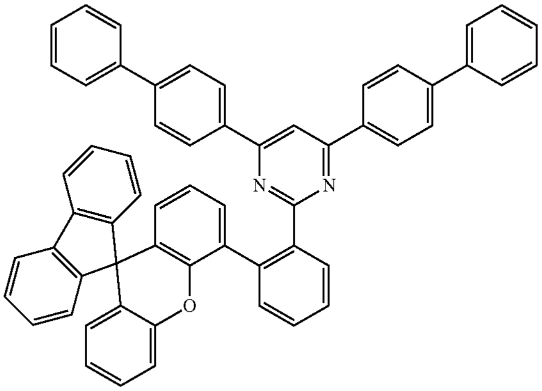
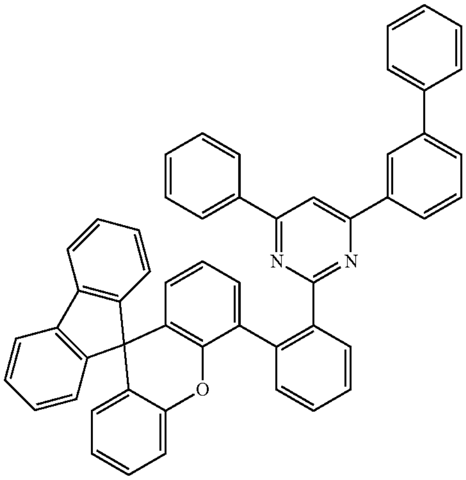
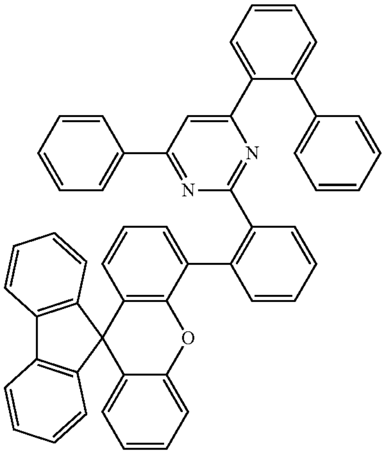
-continued
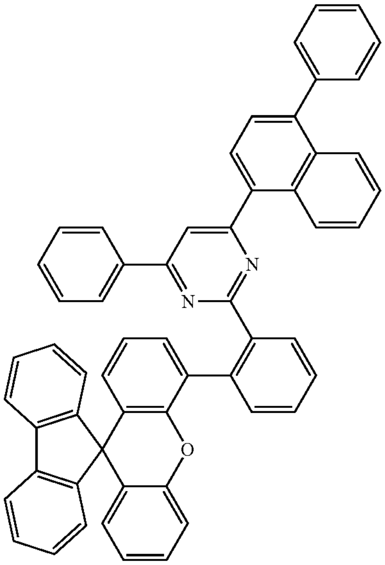
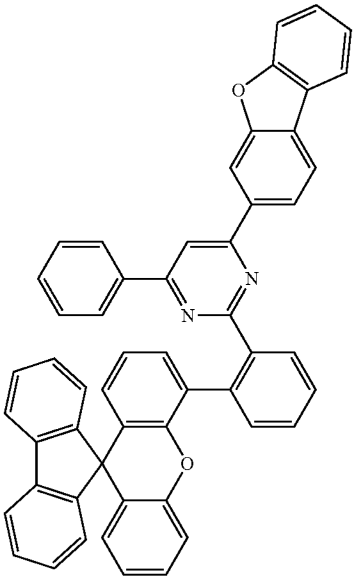
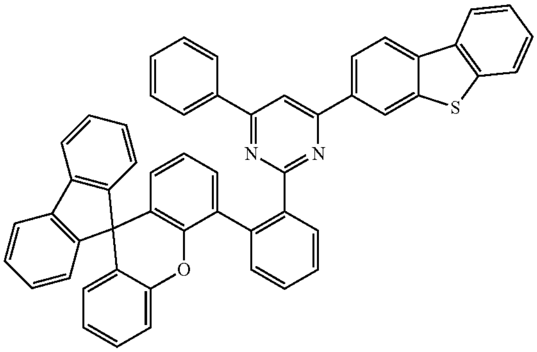

-continued
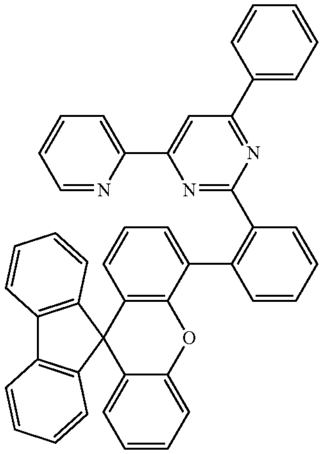
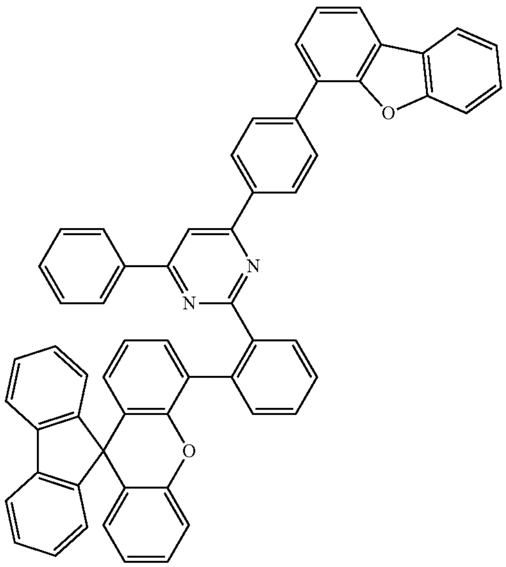
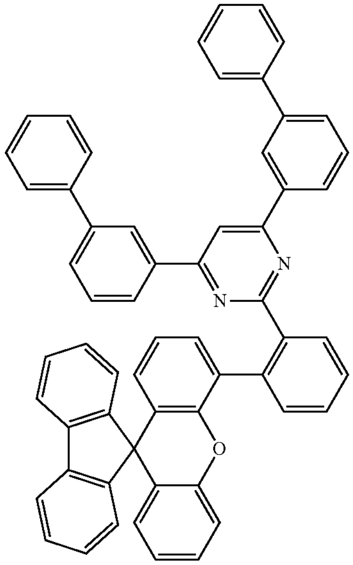
-continued
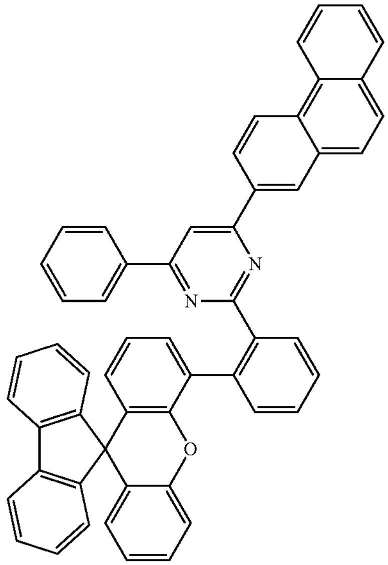
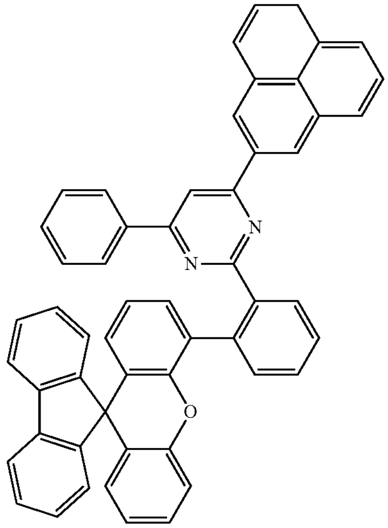
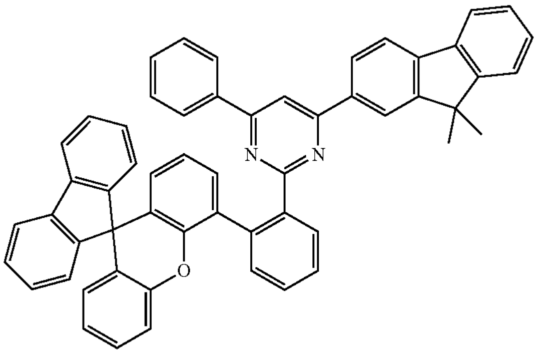

-continued
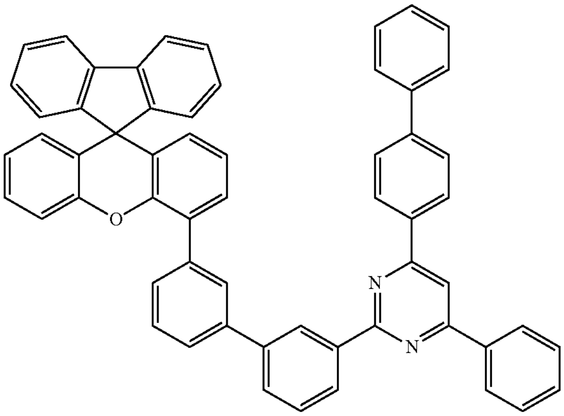
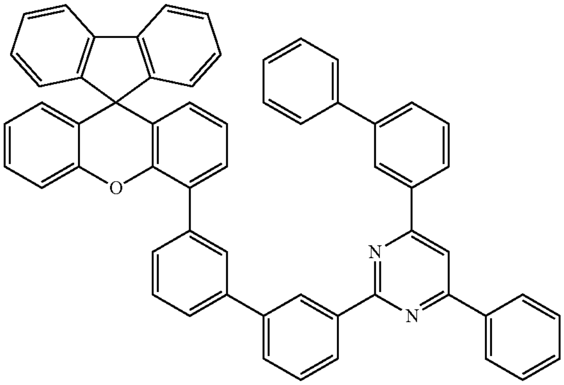
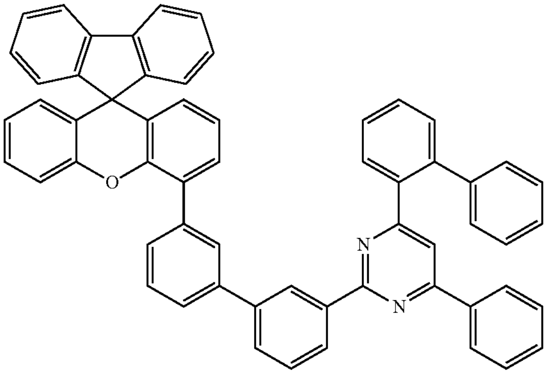
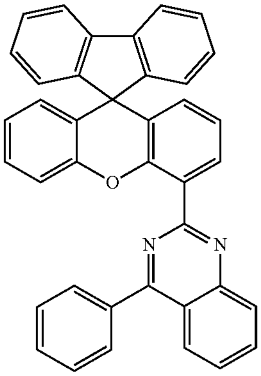
-continued
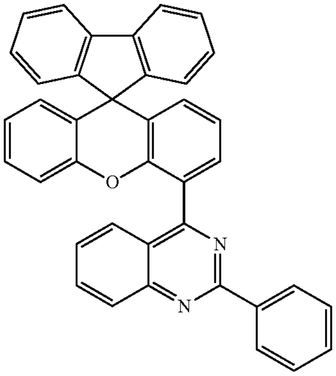
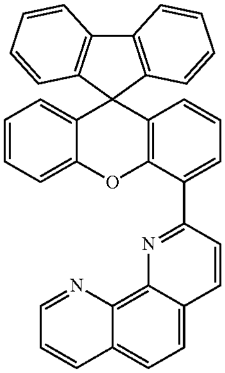
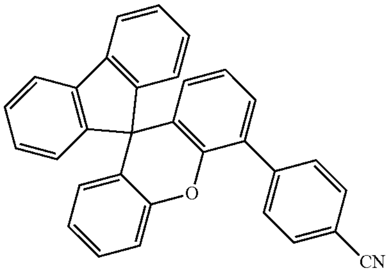
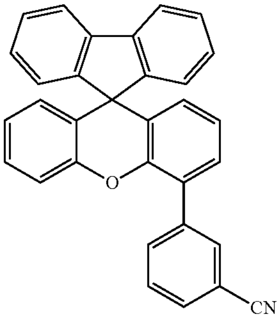
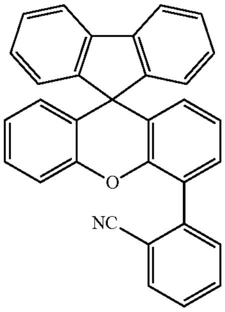
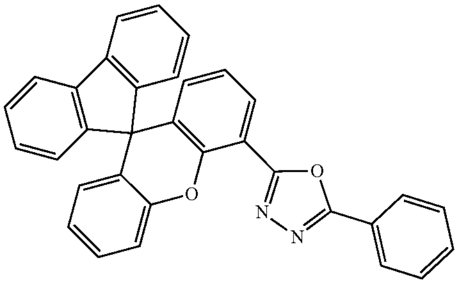

-continued
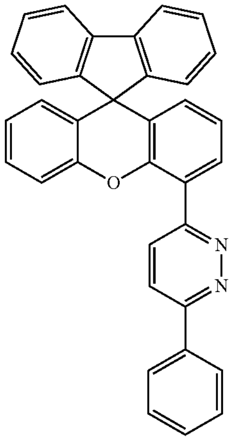
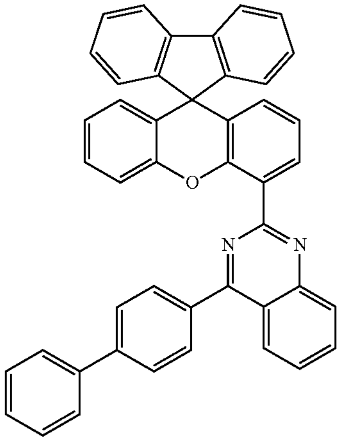
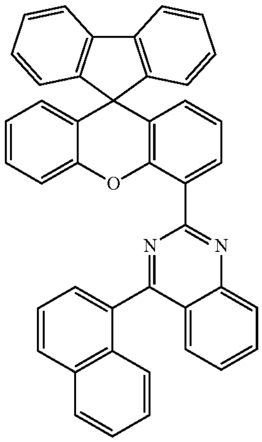
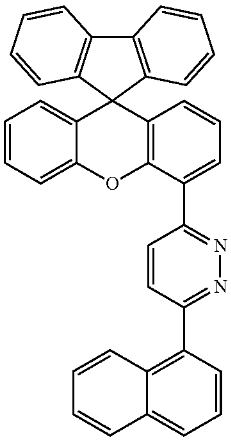
-continued
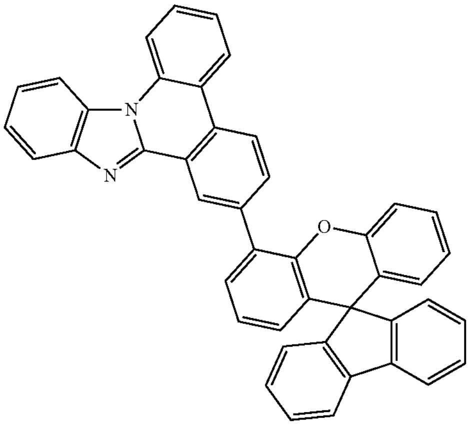 [SMILES: c1ccc2c(c1)Oc1c(-c3ccc4c5ccccc5n5c6ccccc6nc5c4c3)cccc1C21c2ccccc2-c2ccccc21]
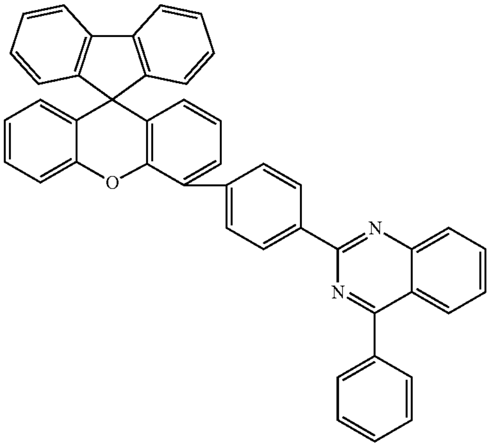
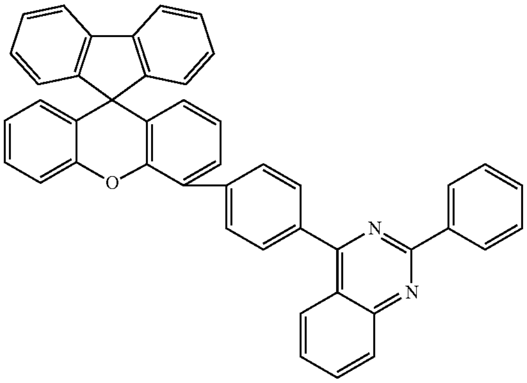
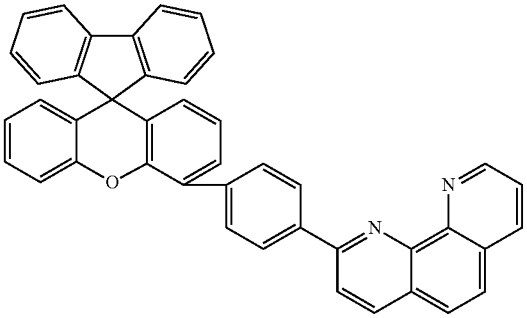

-continued
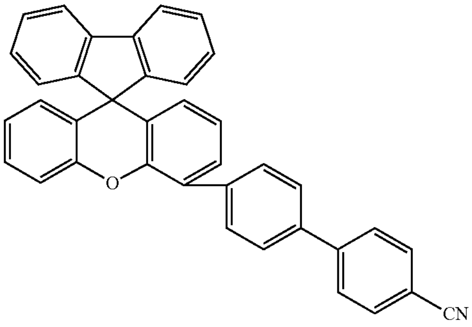
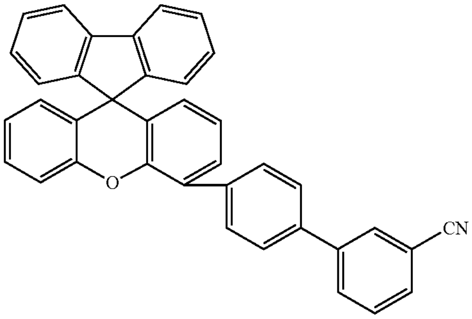
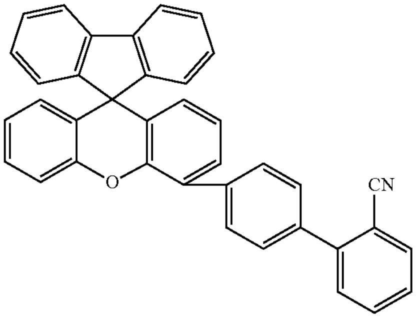
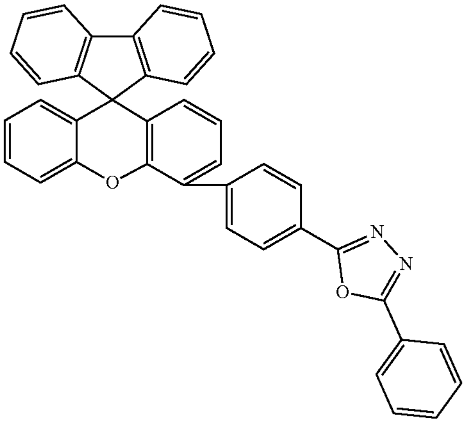
-continued
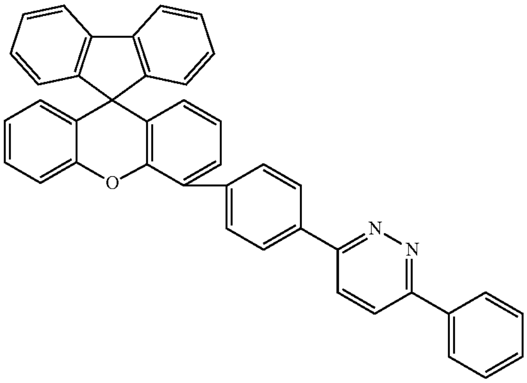
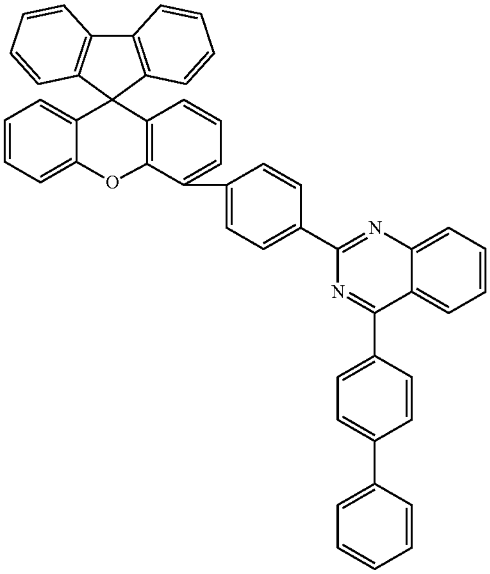
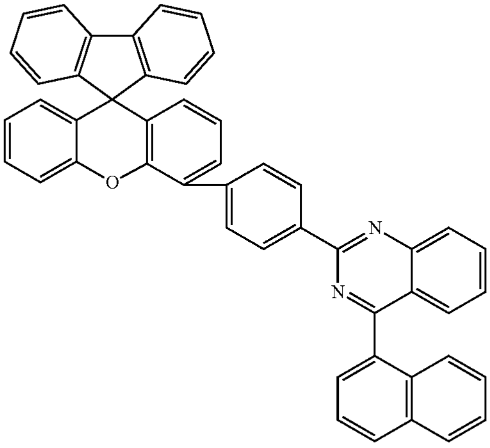

-continued
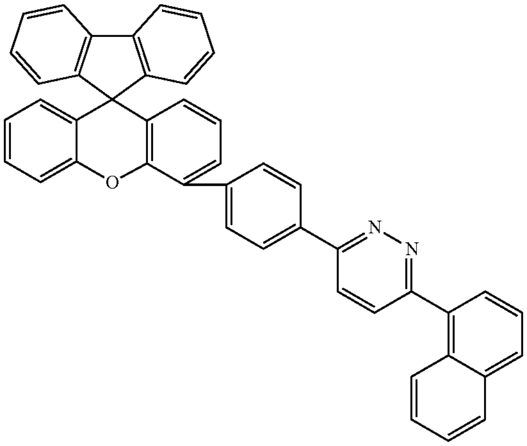
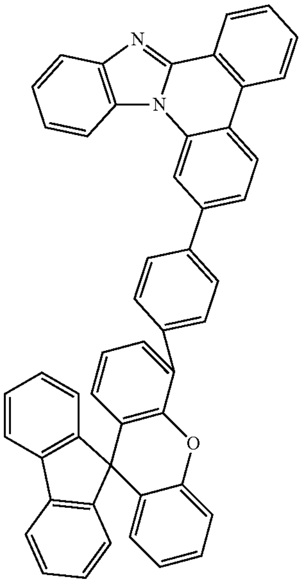
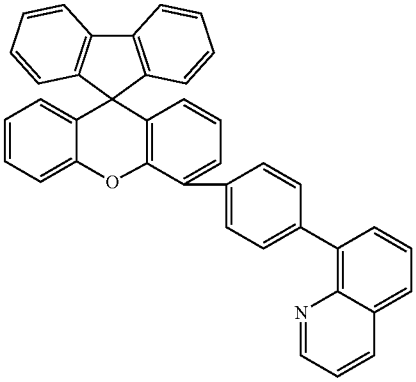
-continued
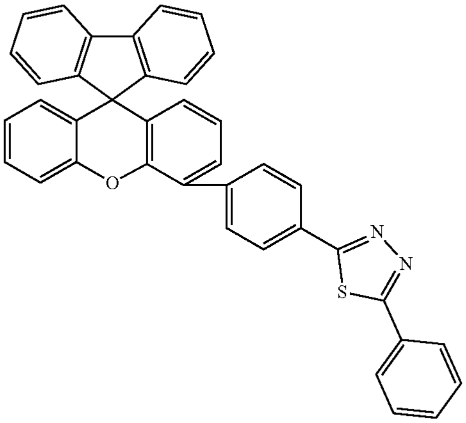
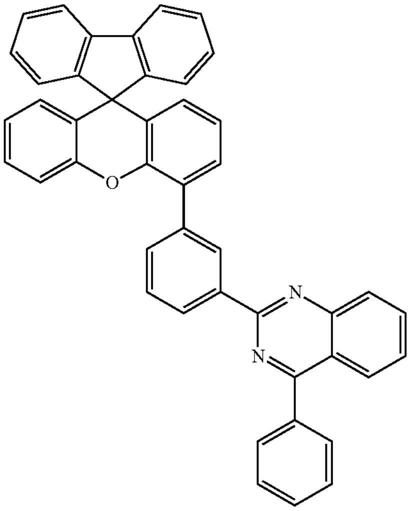
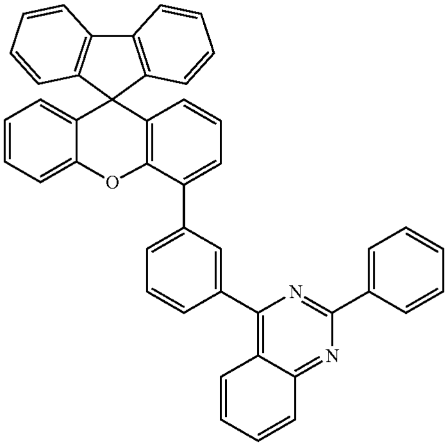

-continued
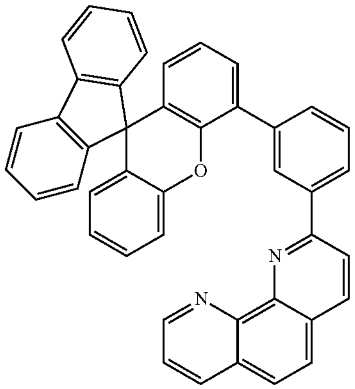
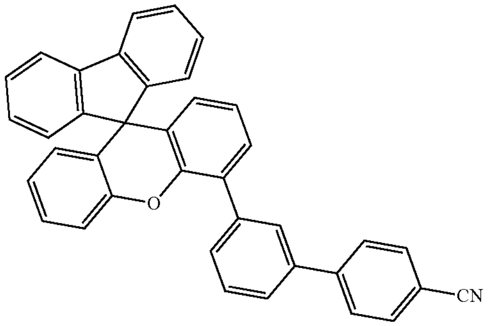
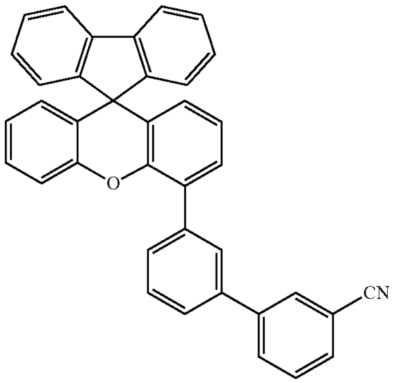
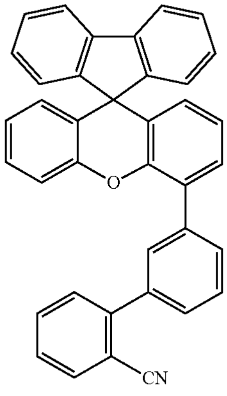
-continued
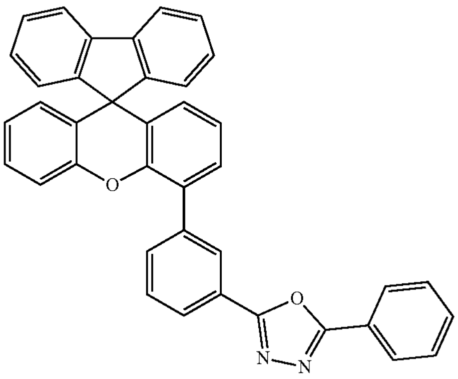
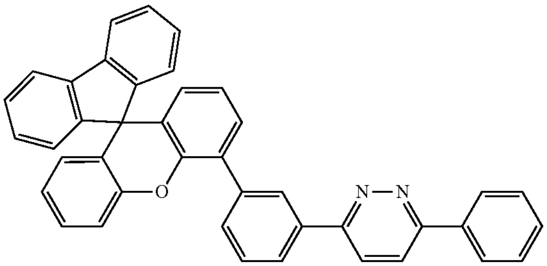
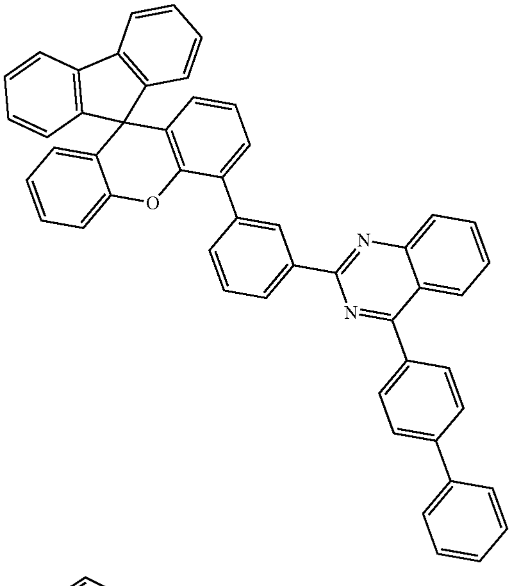
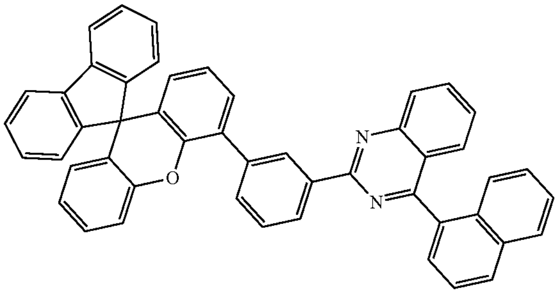

-continued
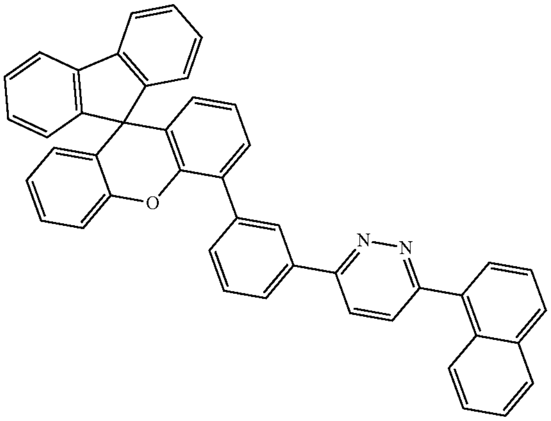
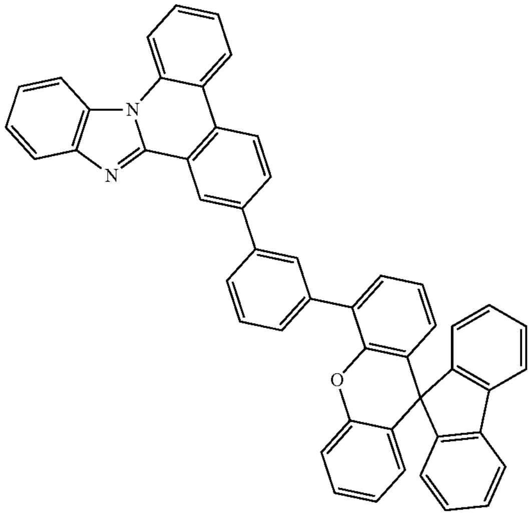
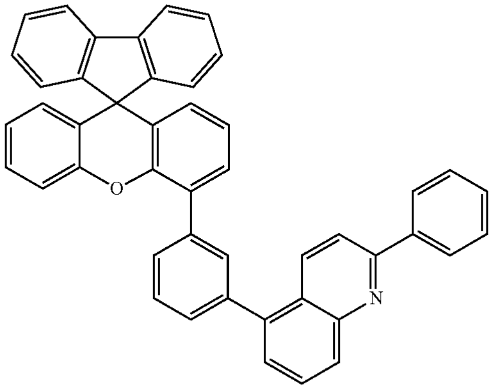
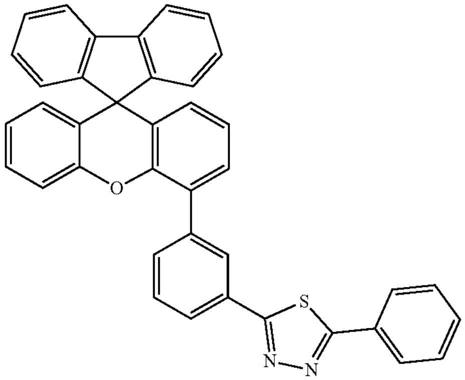
-continued
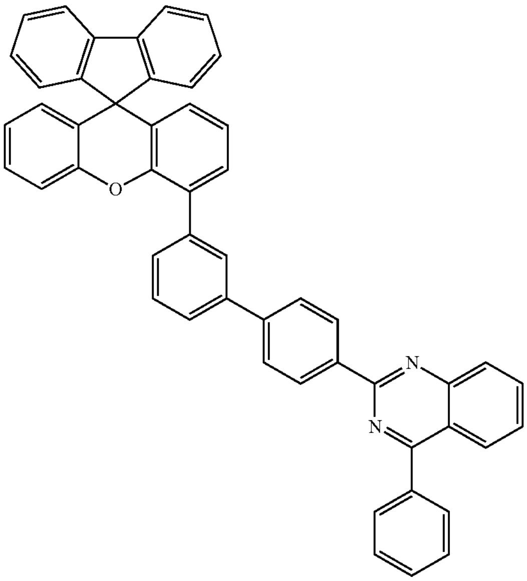
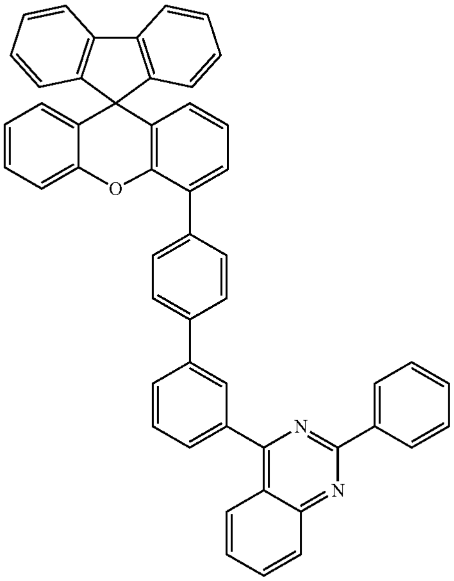
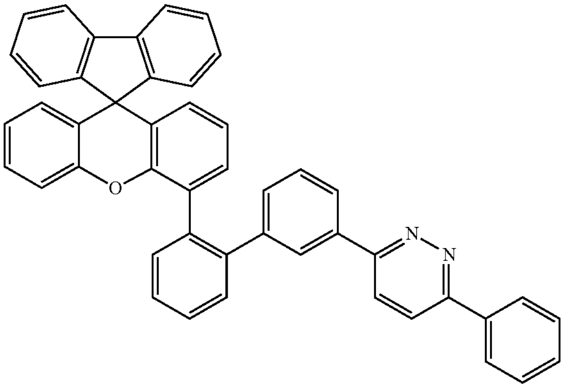

-continued
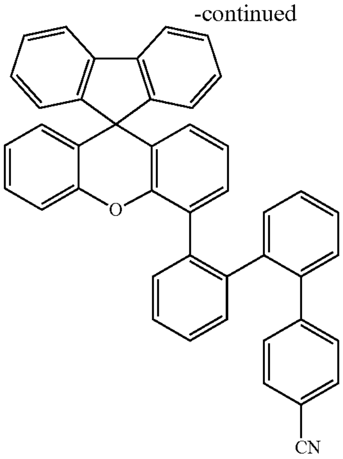
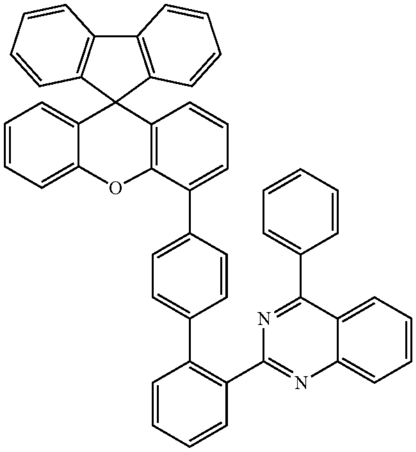
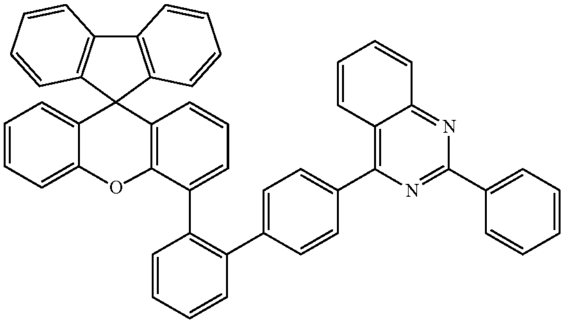
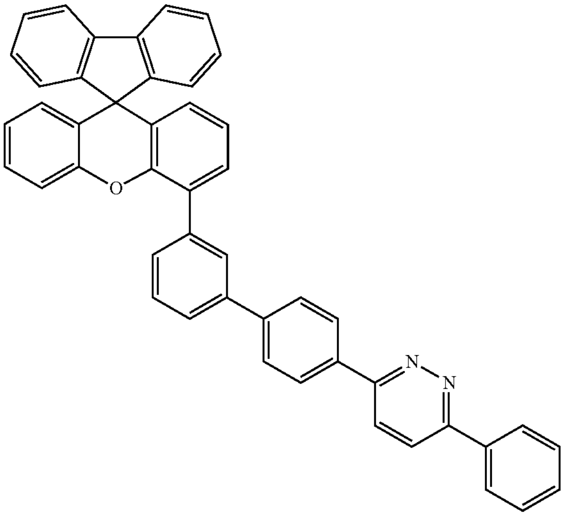
-continued
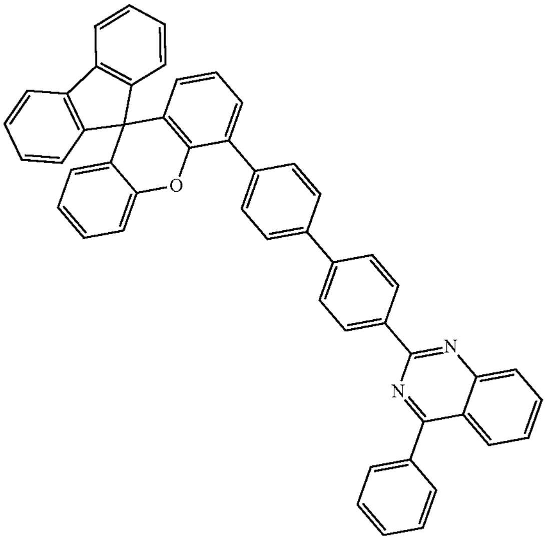
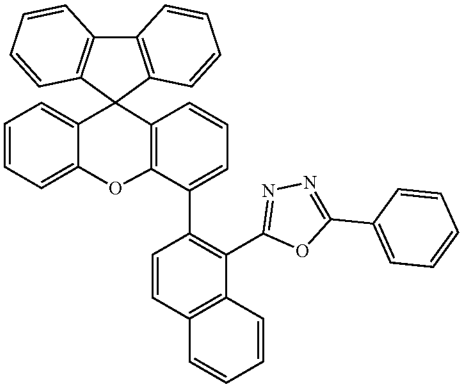
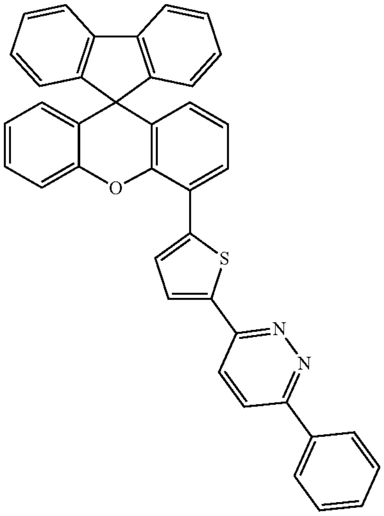

-continued
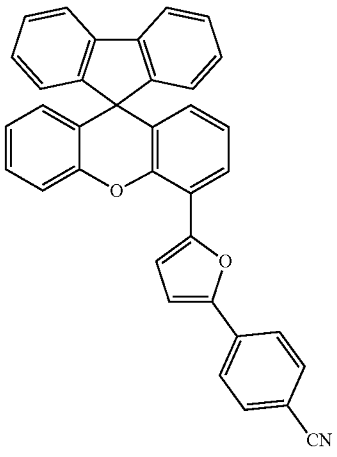
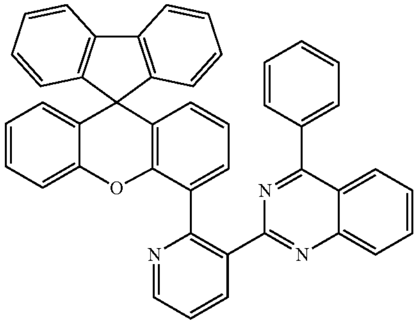
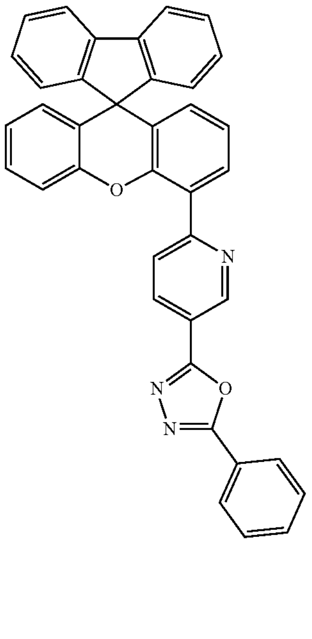
-continued
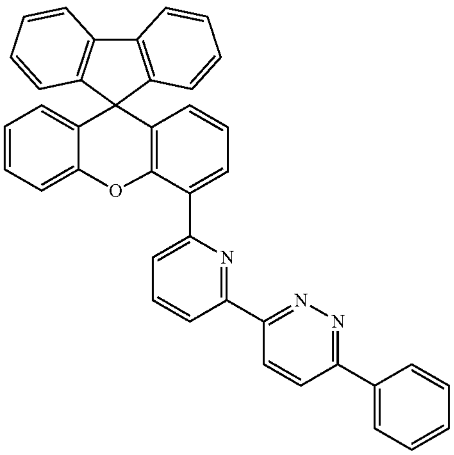 [SMILES: c1ccc(-c2ccc(-c3cccc(-c4cccc5c4Oc4ccccc4C54c5ccccc5-c5ccccc54)n3)nn2)cc1]
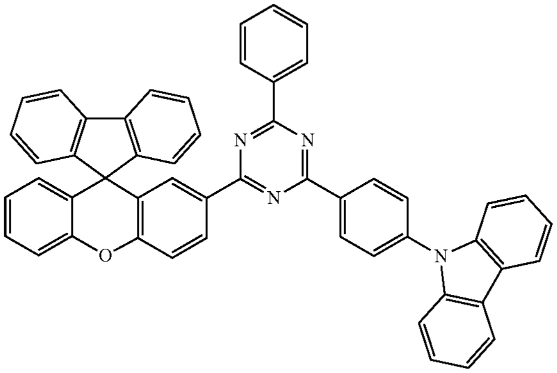
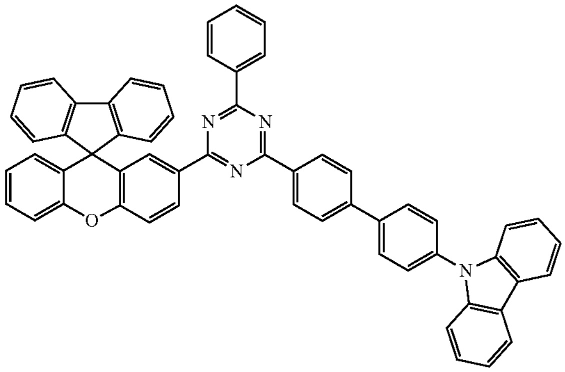
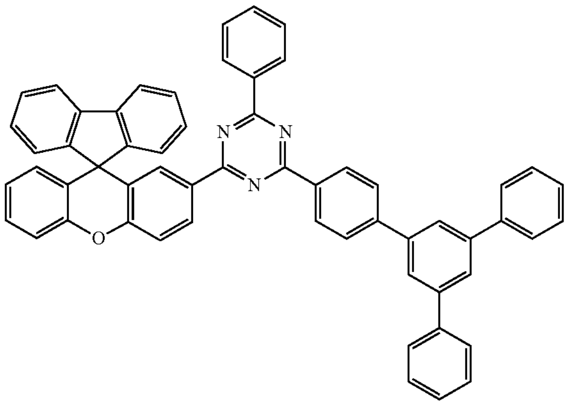

-continued
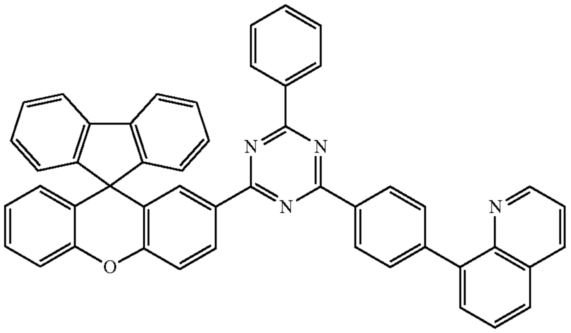
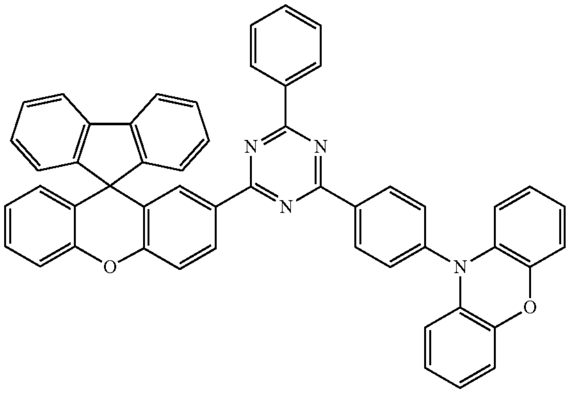
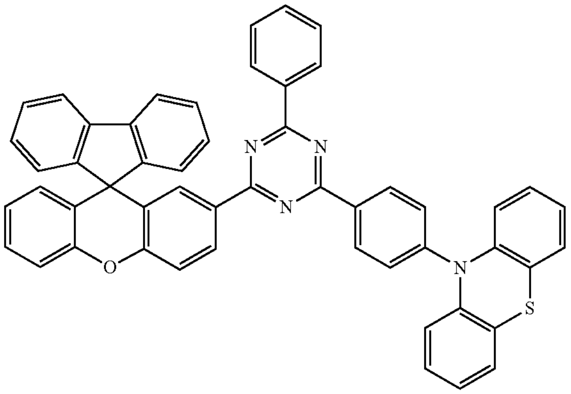
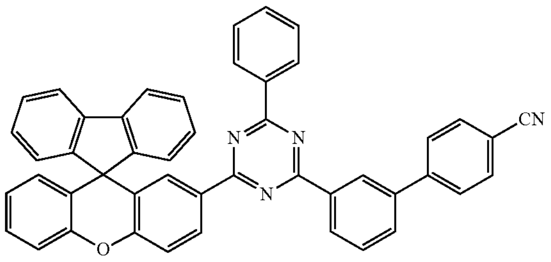
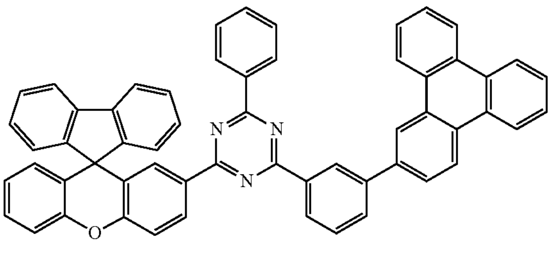
-continued
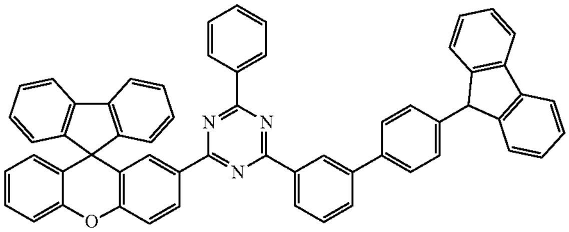
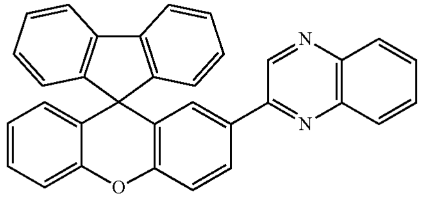
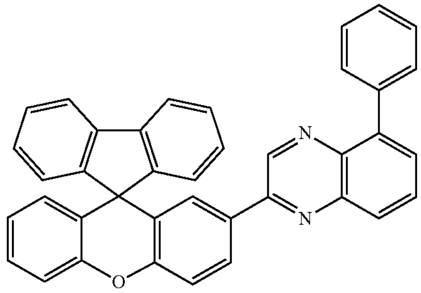
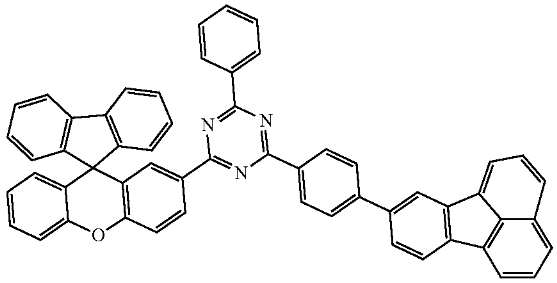
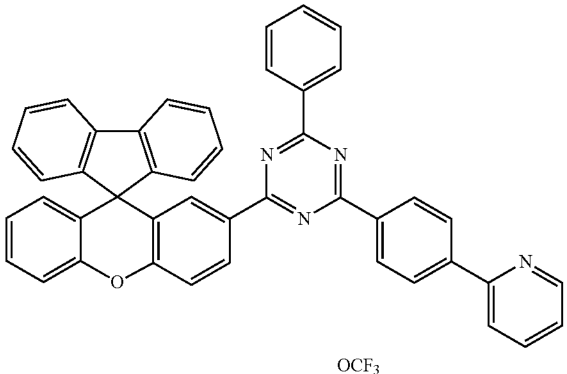
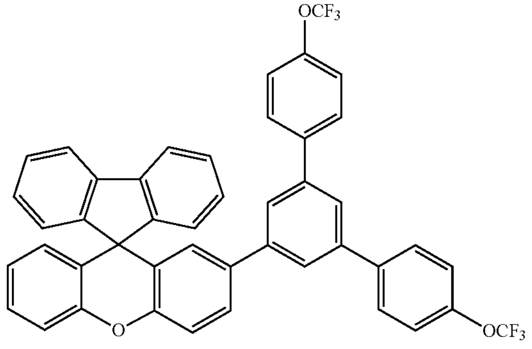

-continued
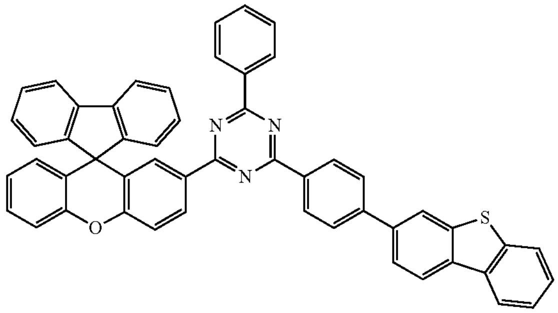
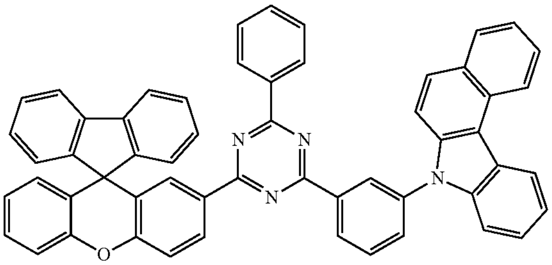
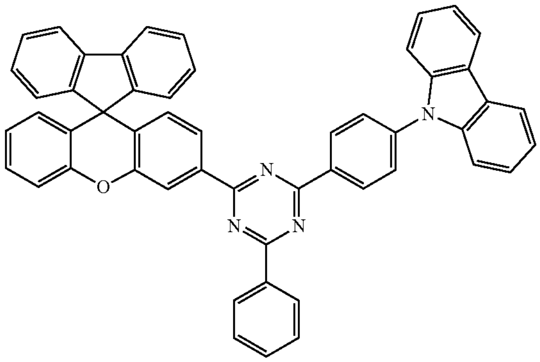
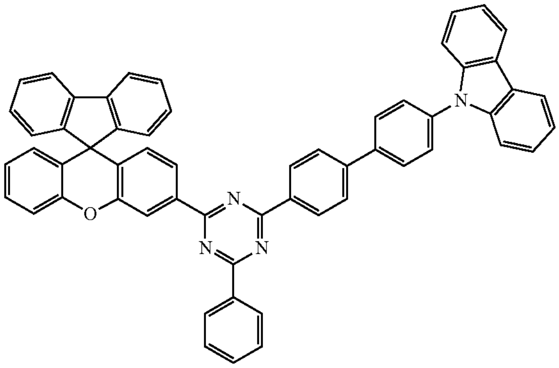
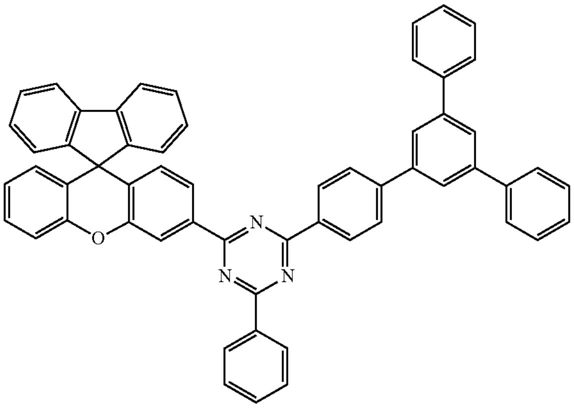
-continued
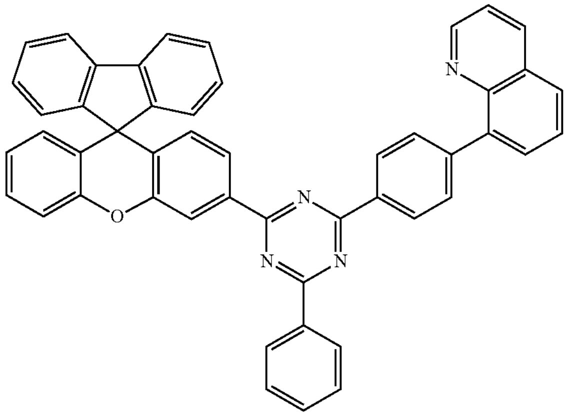
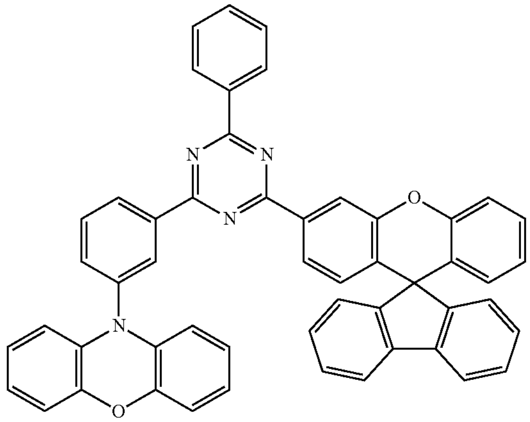
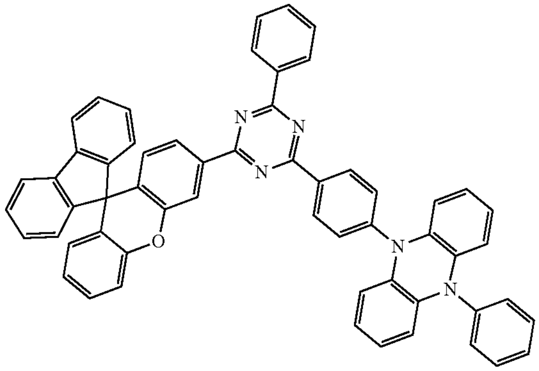
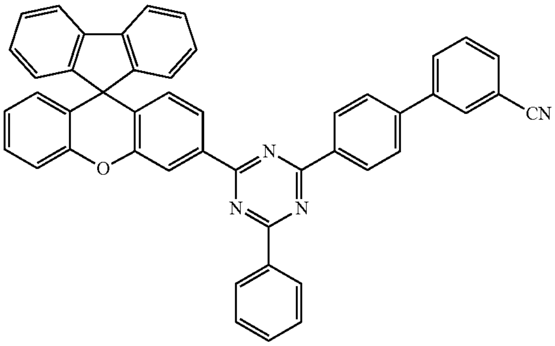

-continued
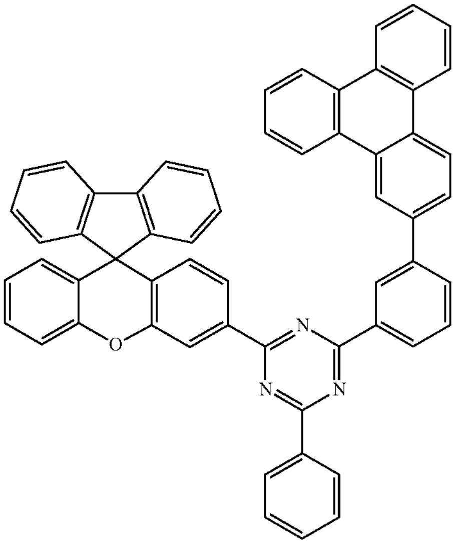
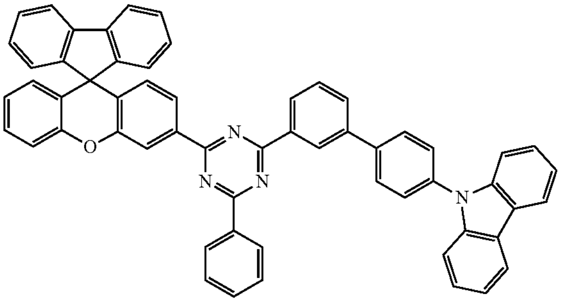
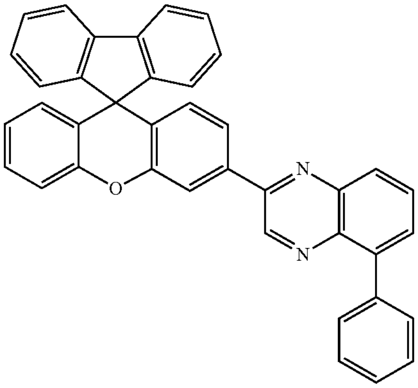
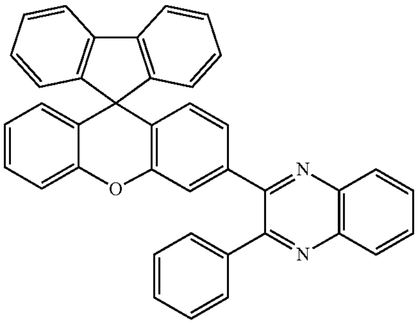
-continued
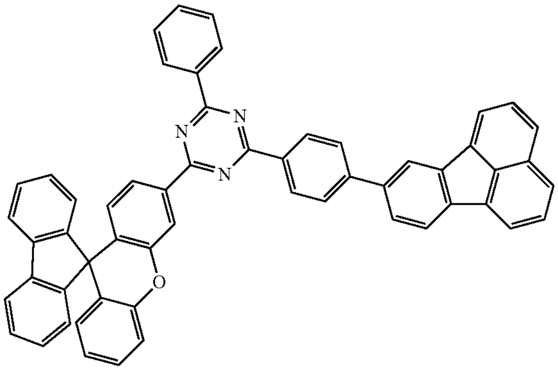
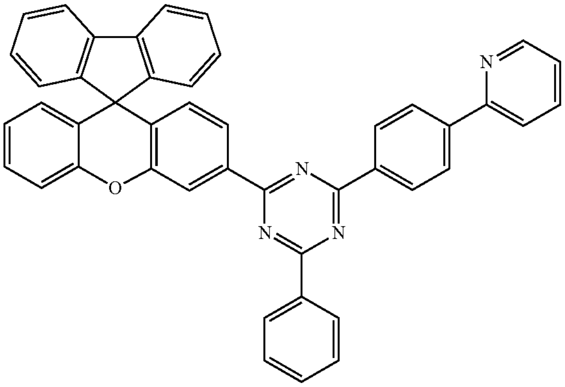
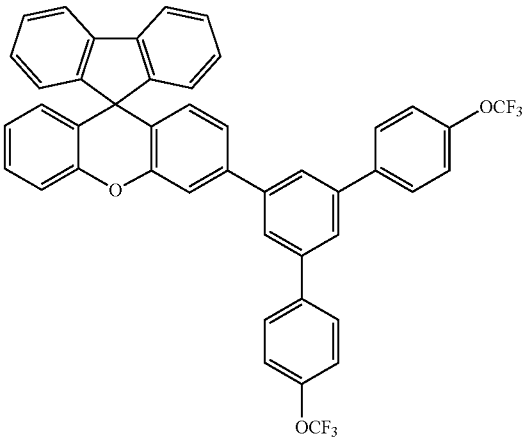
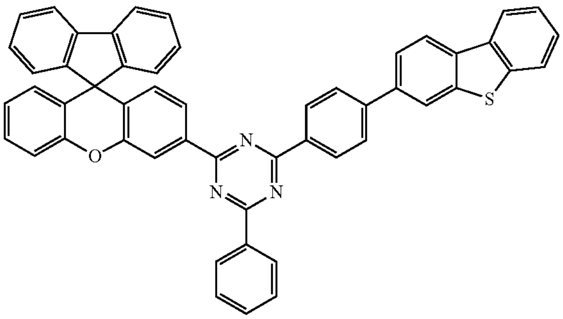

-continued
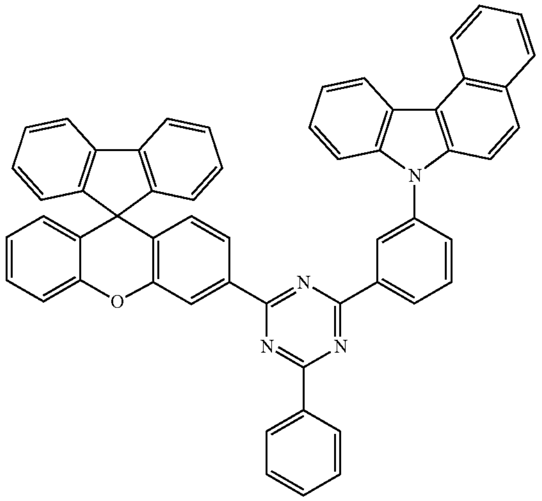
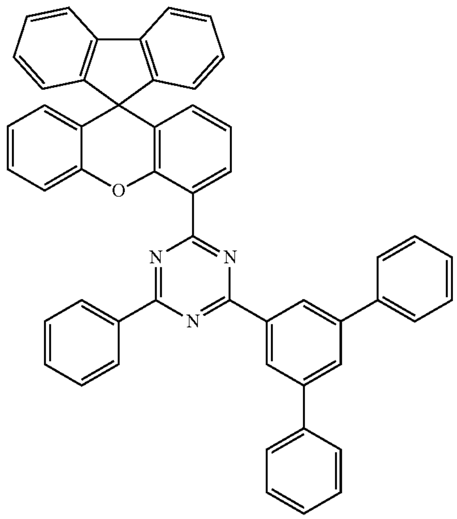
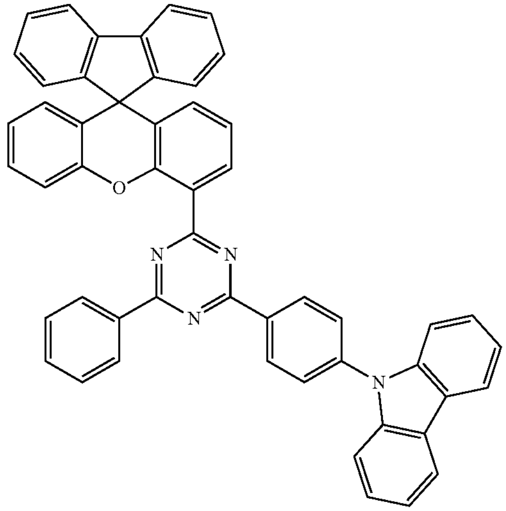
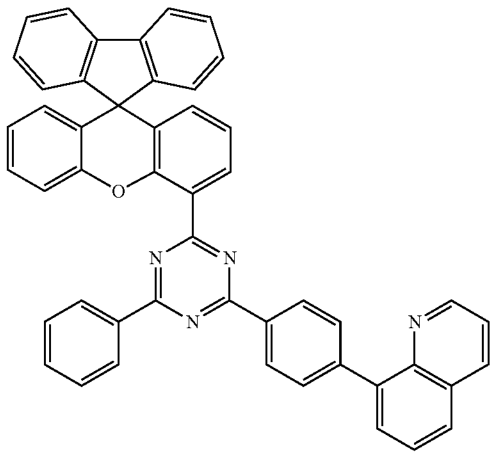
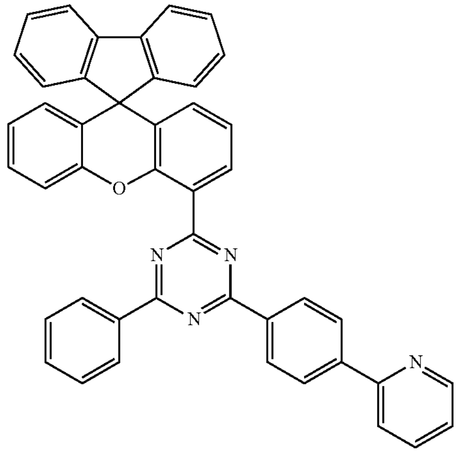
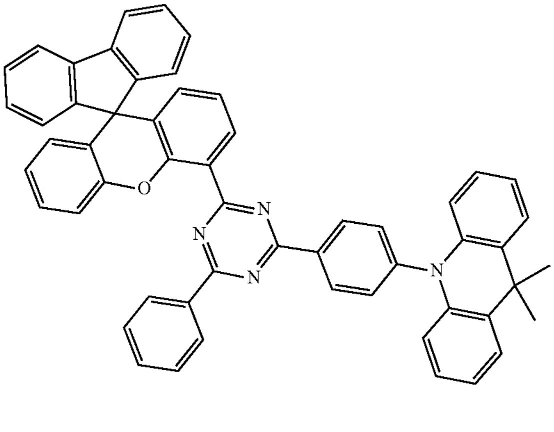
-continued -continued
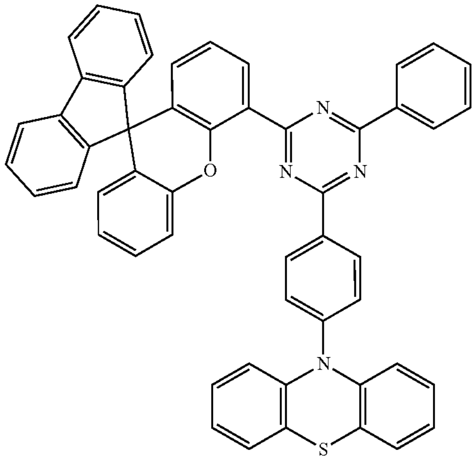
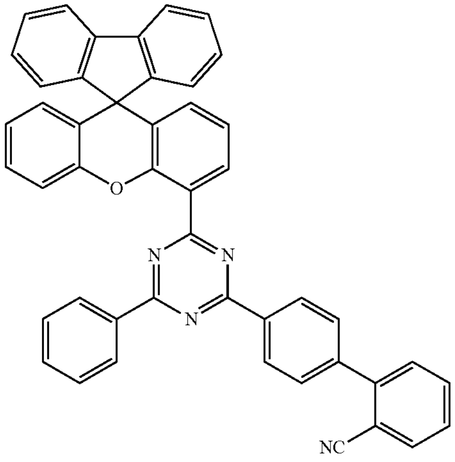
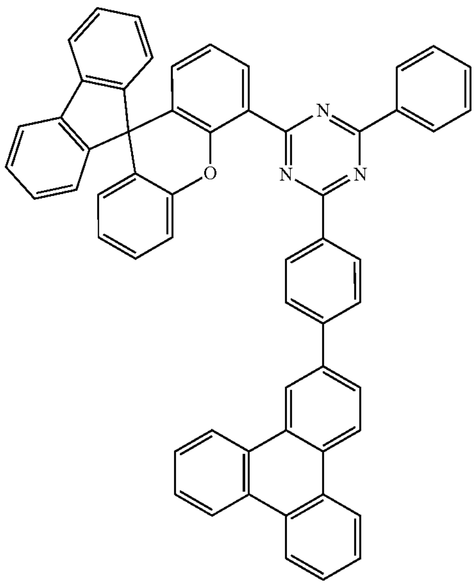
-continued
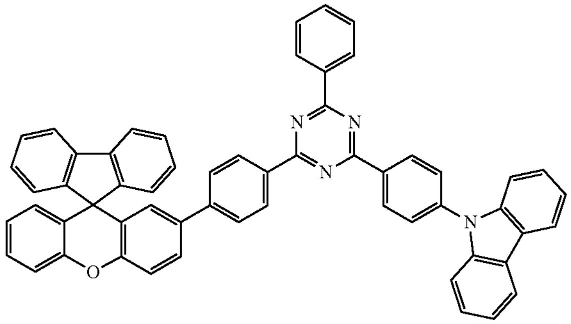
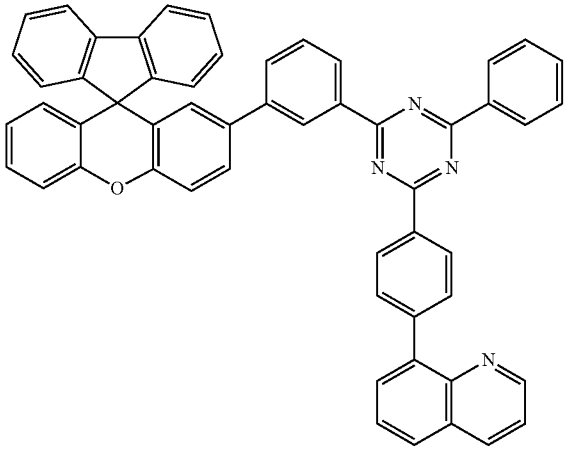
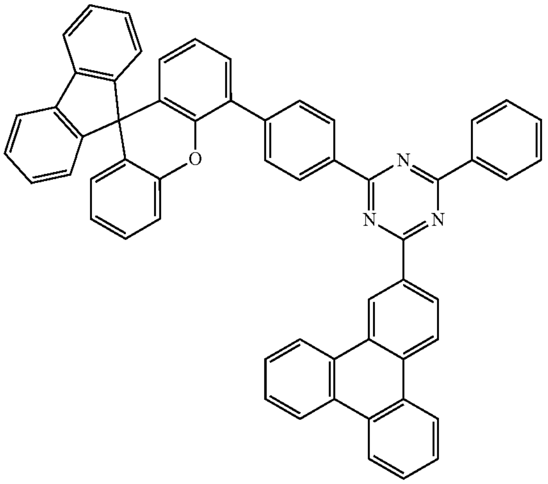
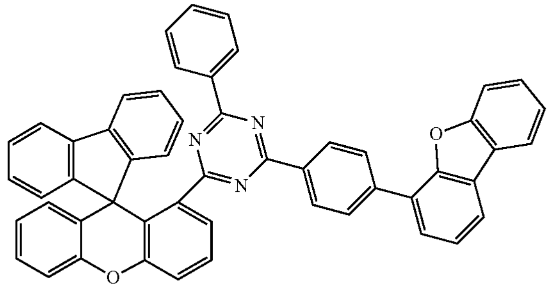

-continued
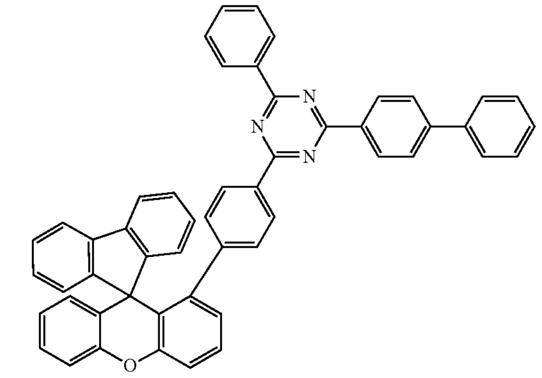
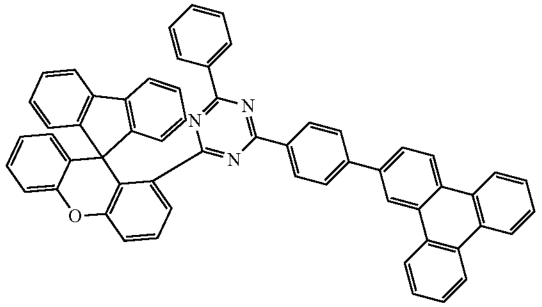
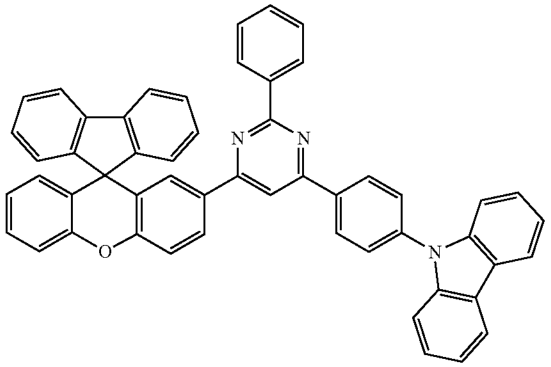
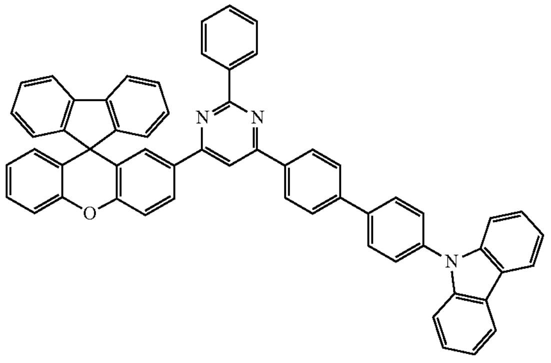
-continued
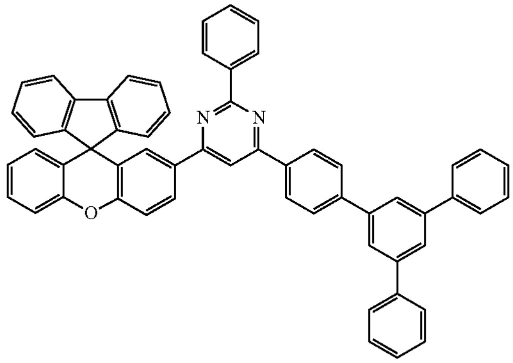
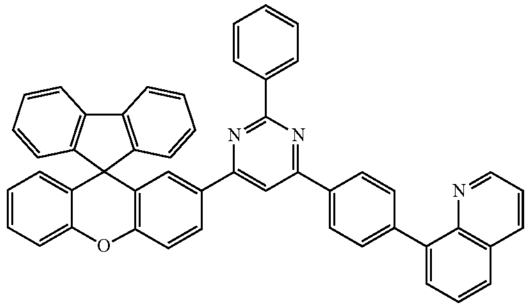
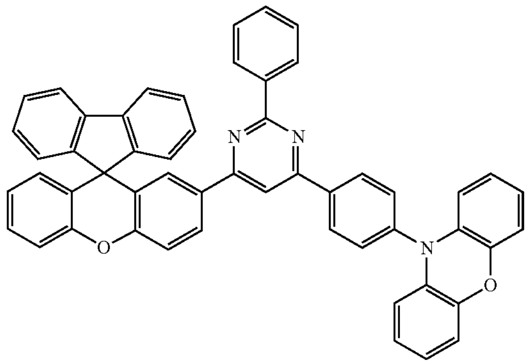
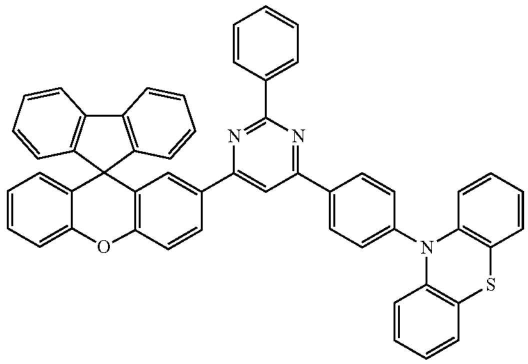
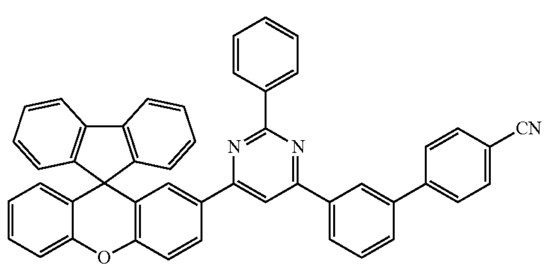

-continued
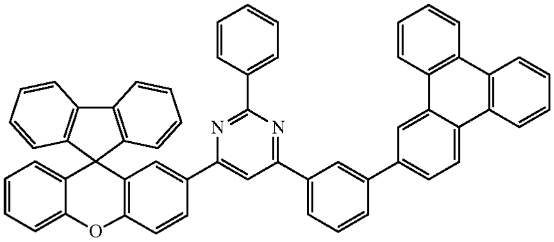
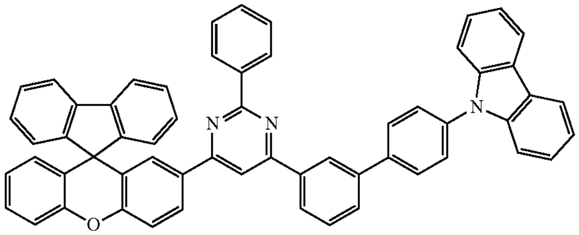
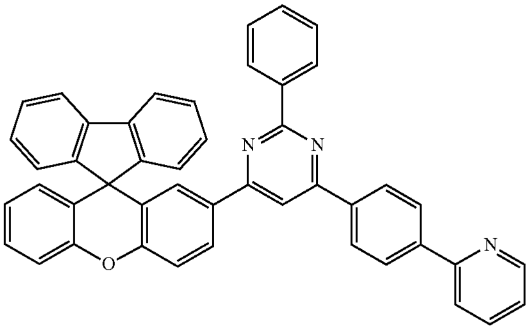
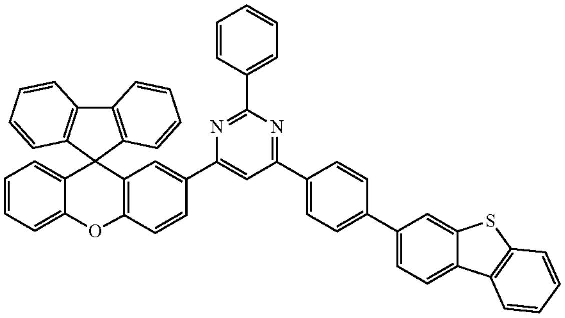
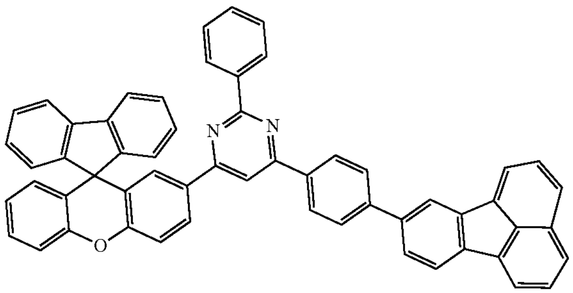
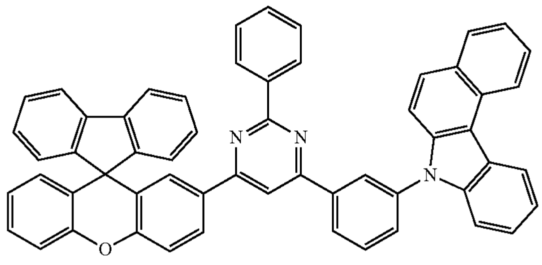
-continued
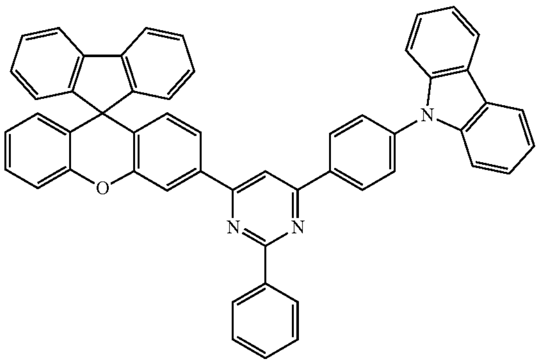
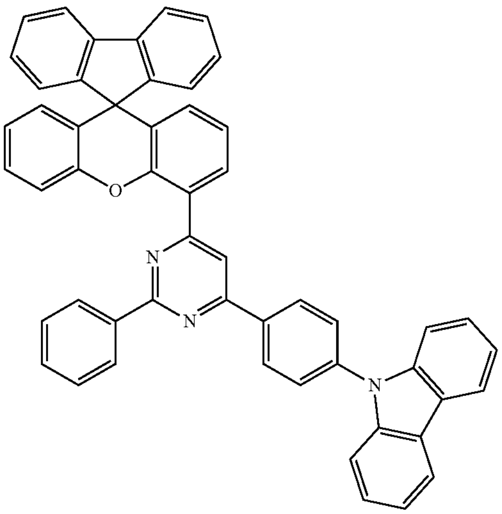
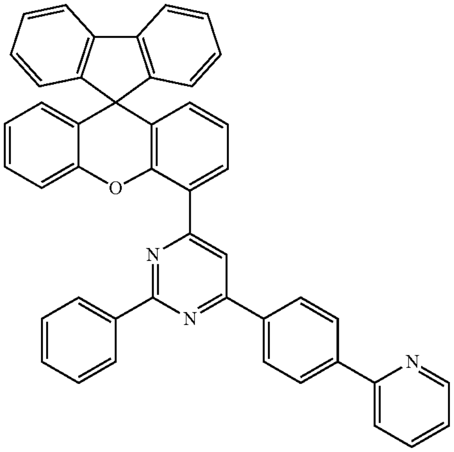
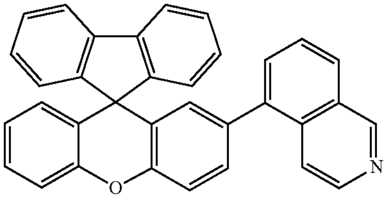

-continued

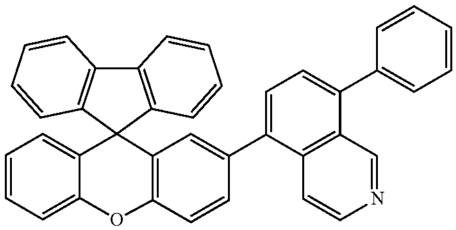

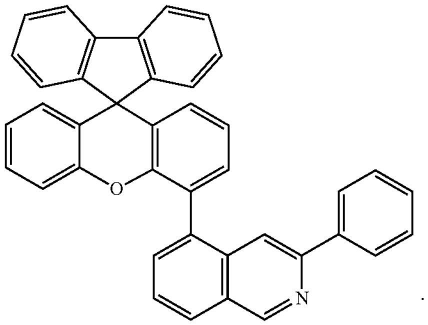 [SMILES: c1ccc(-c2cc3c(-c4cccc5c4Oc4ccccc4C54c5ccccc5-c5ccccc54)cccc3cn2)cc1]

6. The organic light emitting device of claim 1, wherein the first organic material layer is composed of one to three layers.

7. The organic light emitting device of claim 6, wherein:

the first organic material layer comprises a hole adjusting layer;

the hole adjusting layer comprises the compound of Formula 1; and when the hole adjusting layer is composed of two or more layers, the respective layers each independently include the compound of Formula 1 identically or differently.

8. The organic light emitting device of claim 1, wherein:

the second organic material layer comprises an electron adjusting layer; and the electron adjusting layer comprises the compound of Formula 2.

9. The organic light emitting device of claim 1, wherein the compound of Formula 1 is selected from among the following compounds:

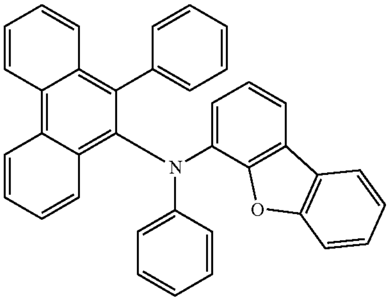

-continued

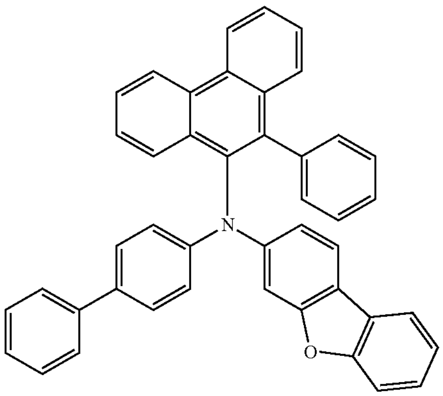

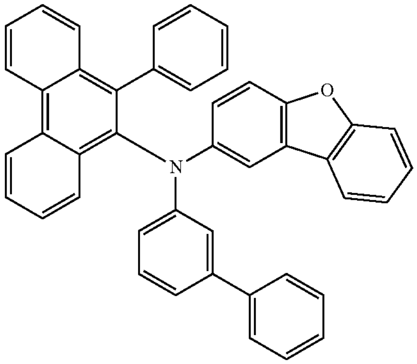

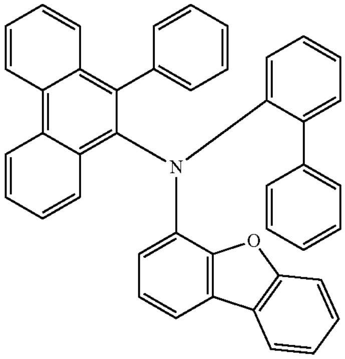

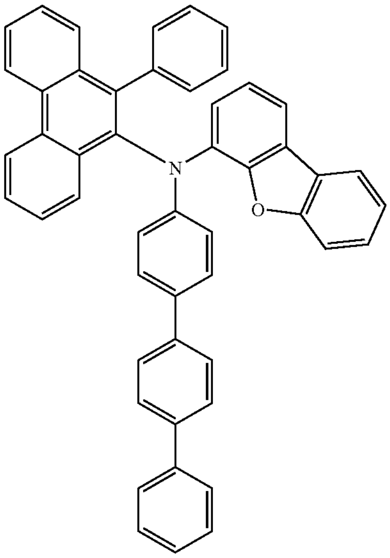

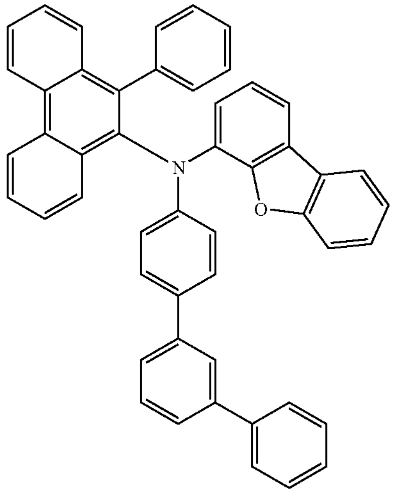
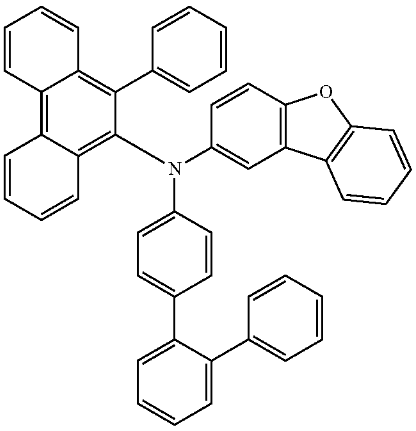
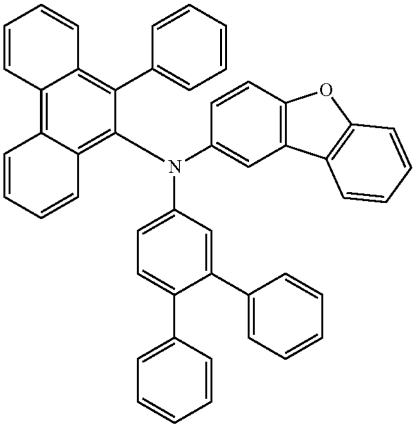
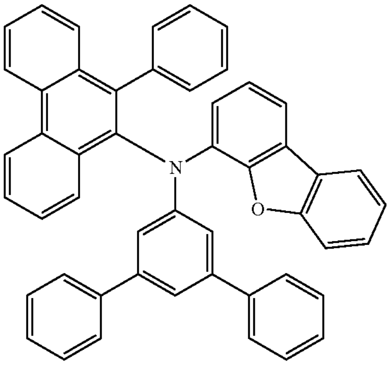
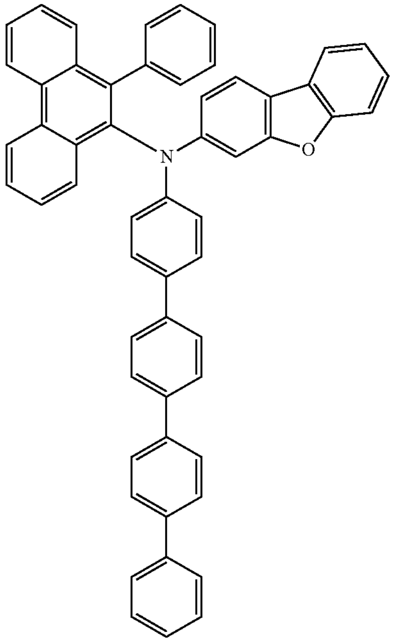
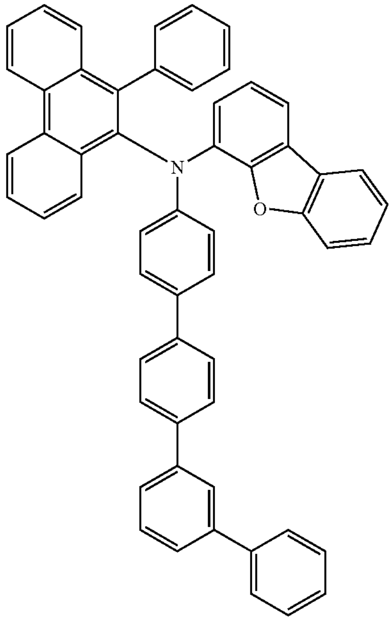

-continued
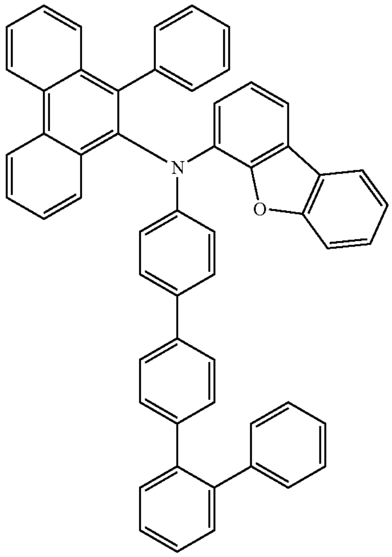
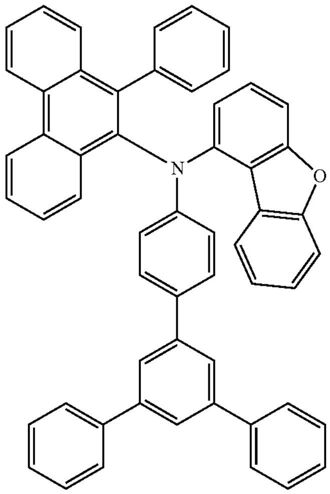
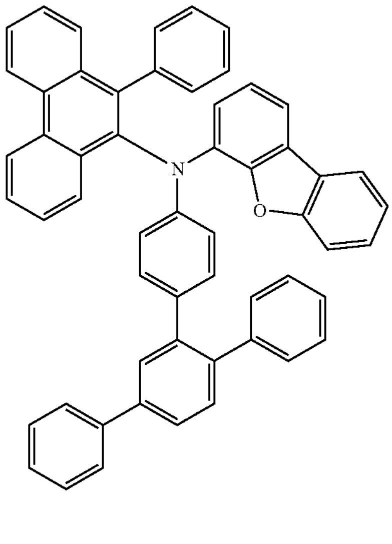
-continued
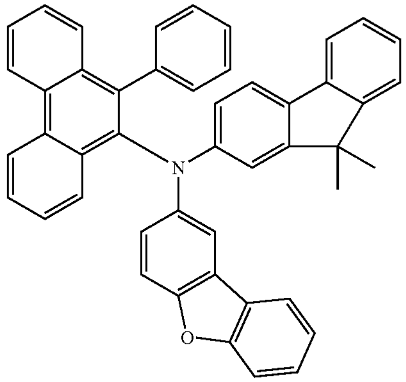
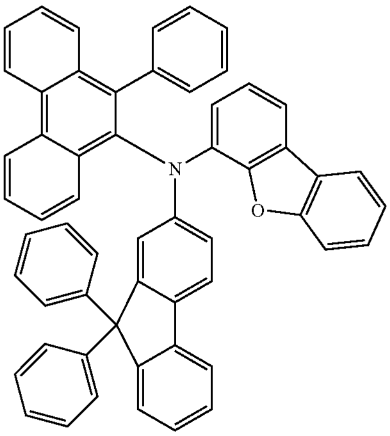
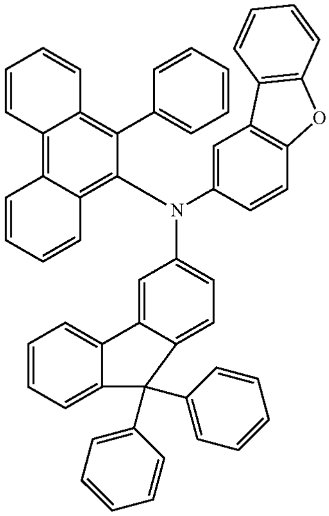
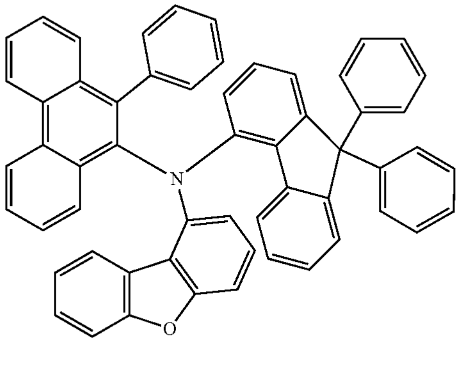

-continued
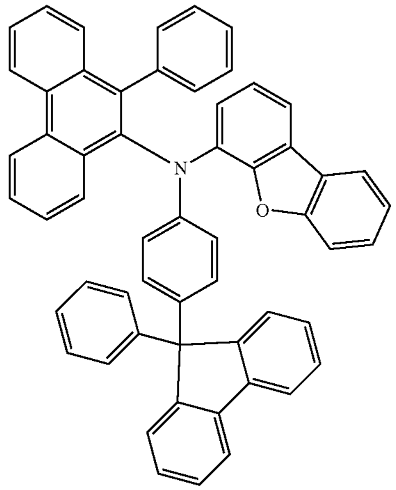 [SMILES: c1ccc(-c2c(N(c3ccc(C4(c5ccccc5)c5ccccc5-c5ccccc54)cc3)c3cccc4c3oc3ccccc34)c3ccccc3c3ccccc23)cc1]
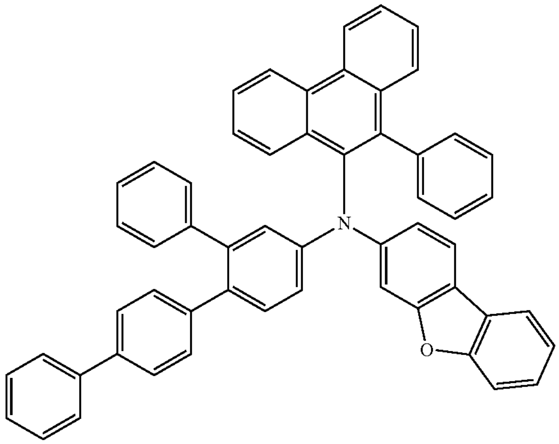 [SMILES: c1ccc(-c2ccc(-c3ccc(N(c4ccc5c(c4)oc4ccccc45)c4c(-c5ccccc5)c5ccccc5c5ccccc45)cc3-c3ccccc3)cc2)cc1]
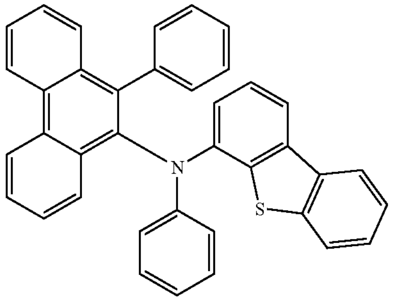
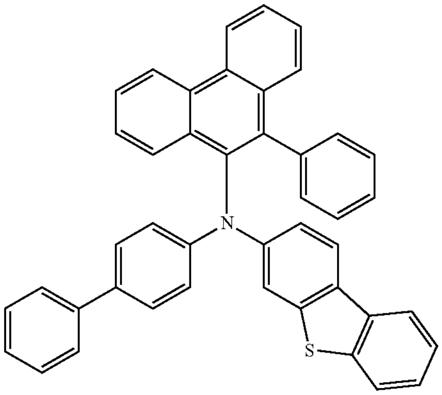
-continued
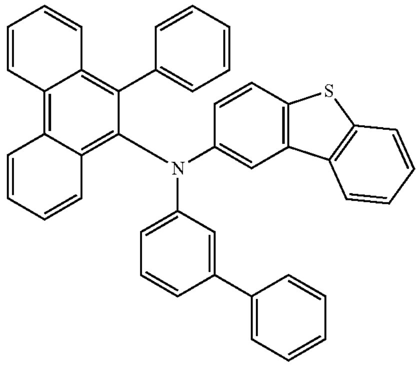
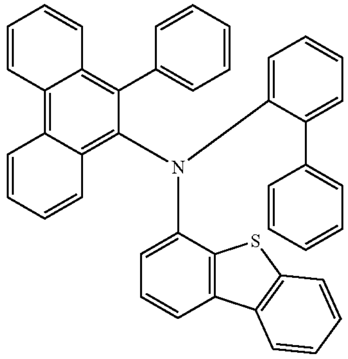
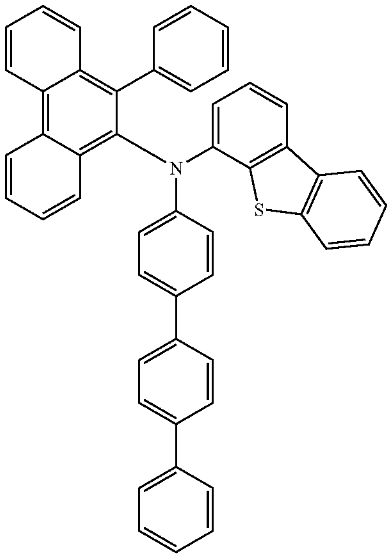

-continued
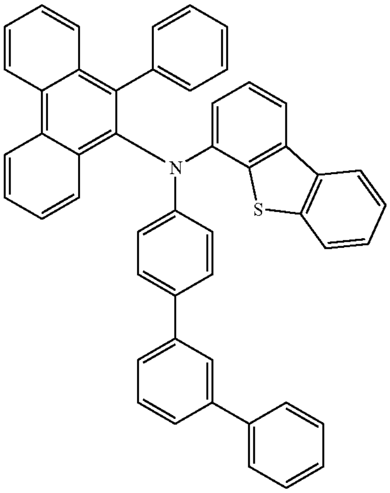
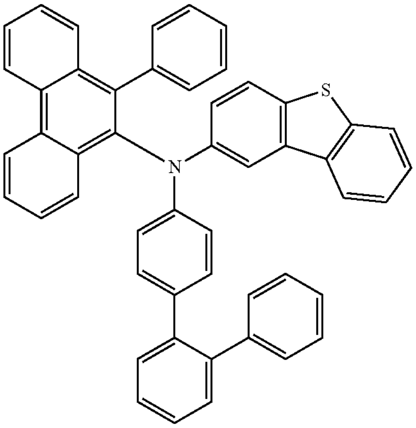
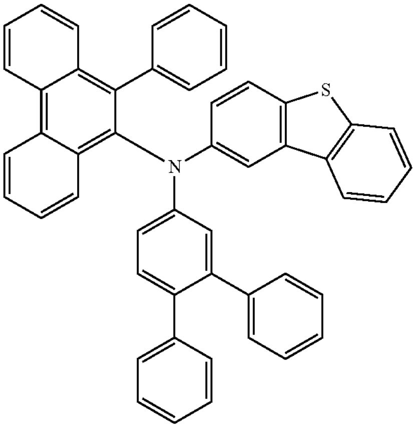
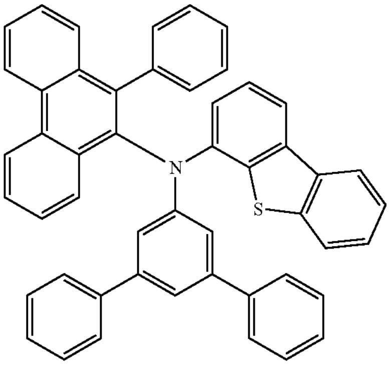
-continued
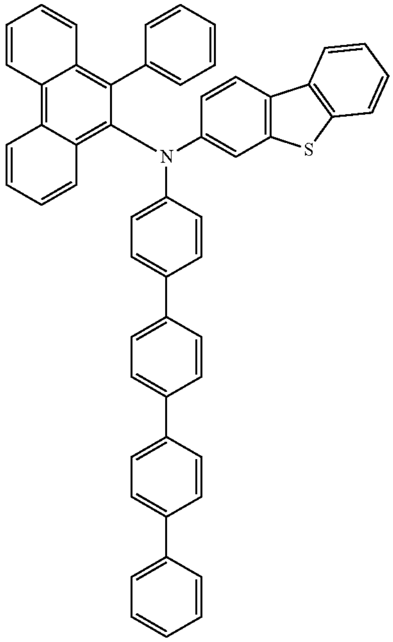
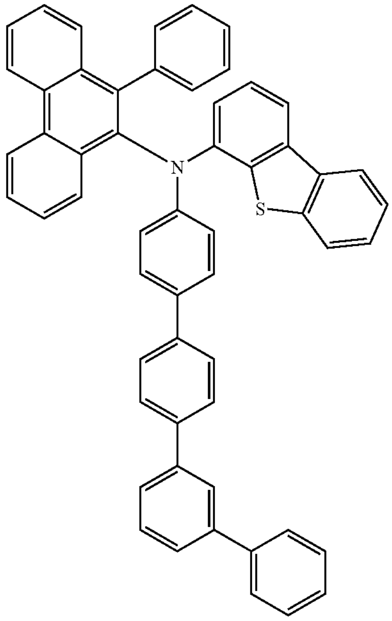

-continued
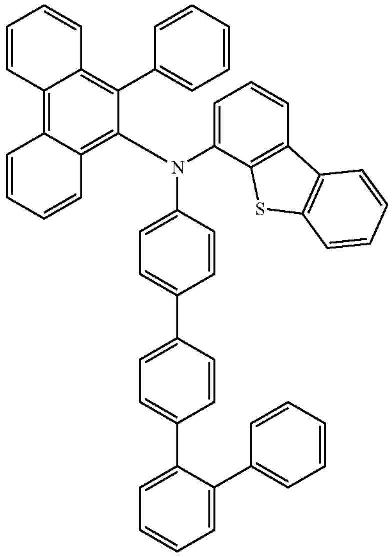
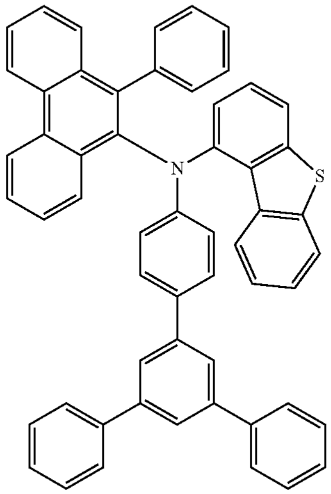
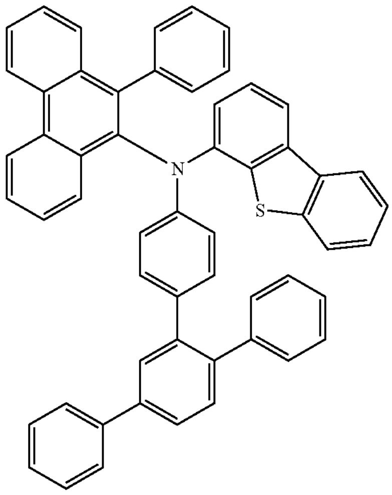
-continued
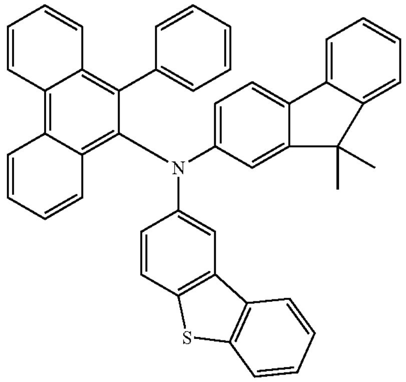
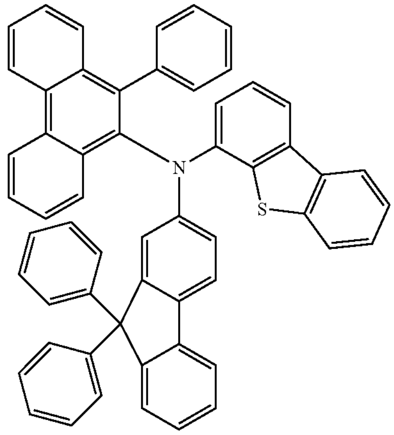
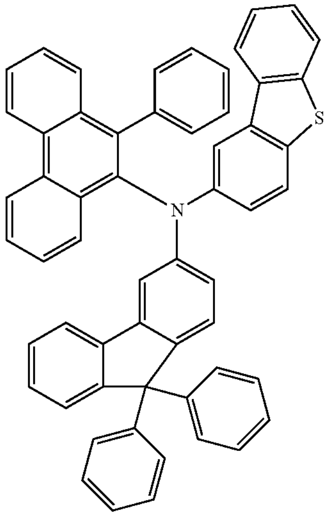
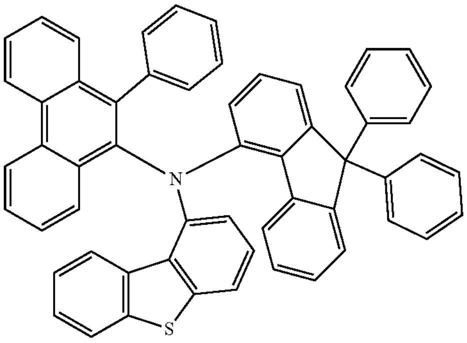

-continued
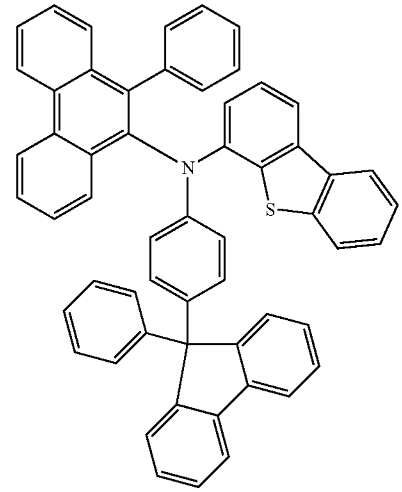
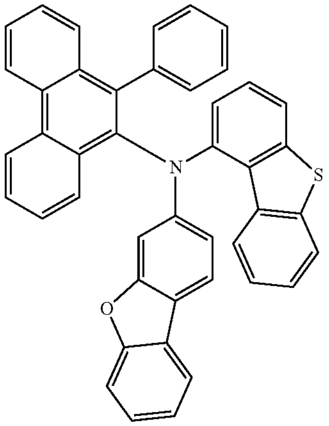
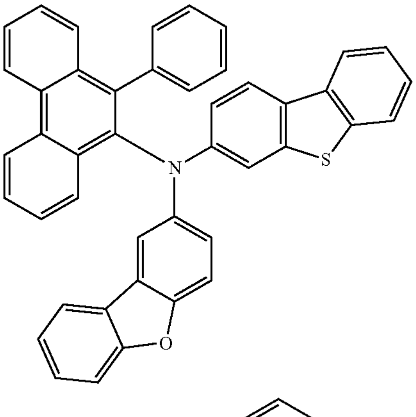
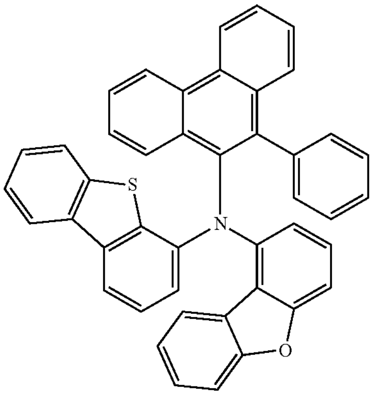
-continued
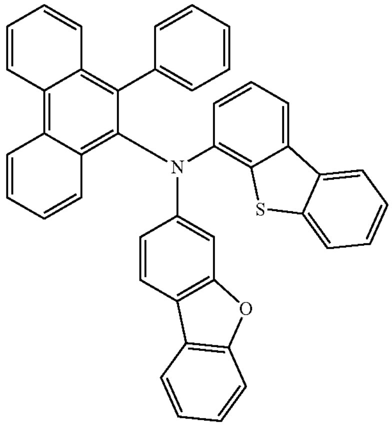
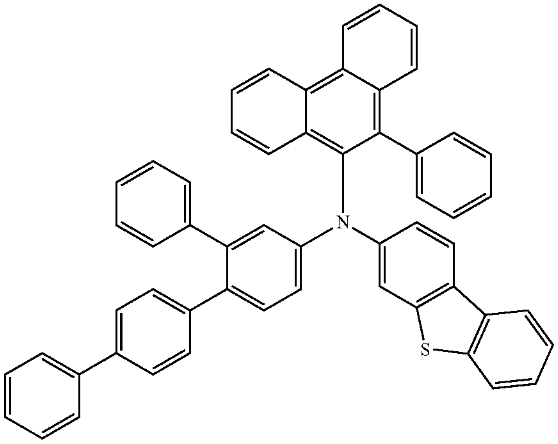
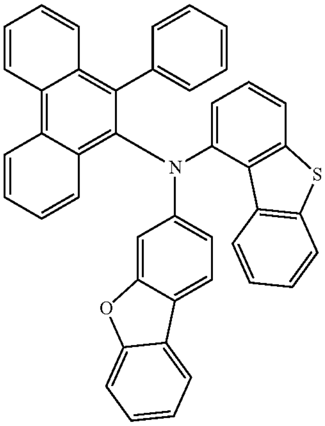
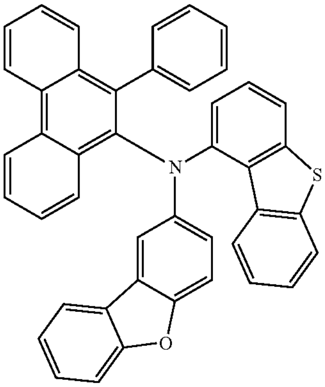

-continued
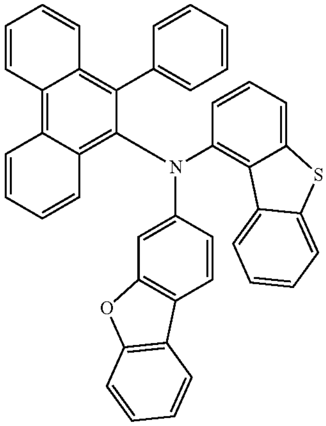
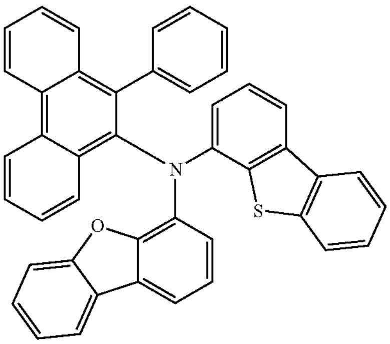
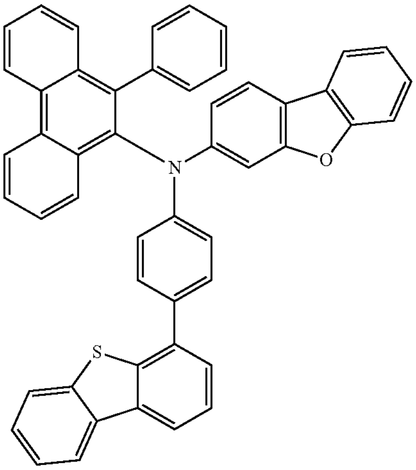
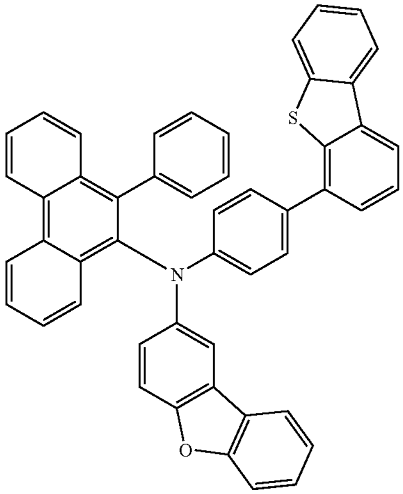
-continued
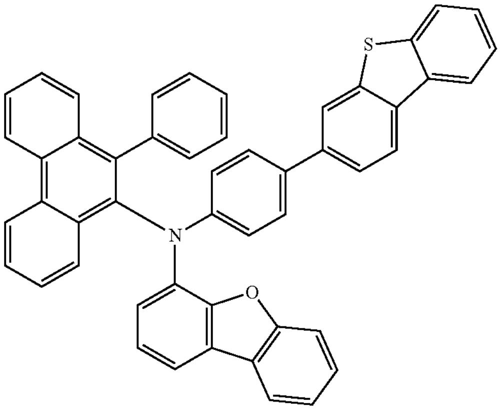
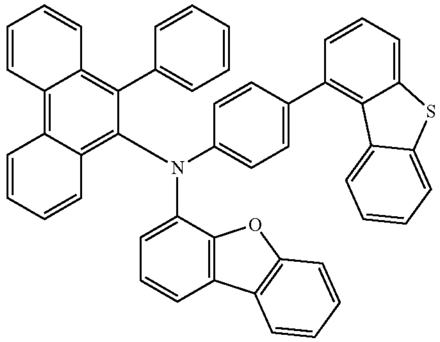
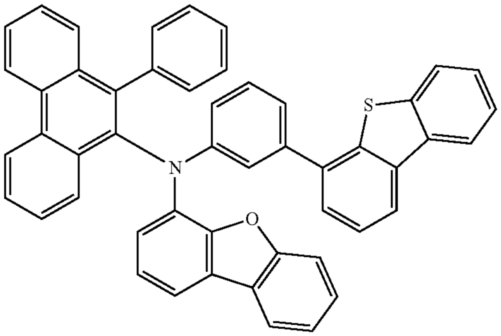
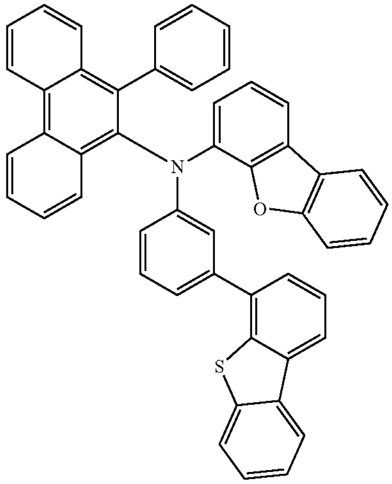

-continued
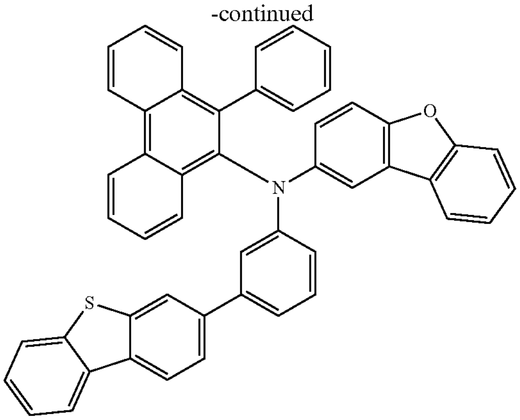
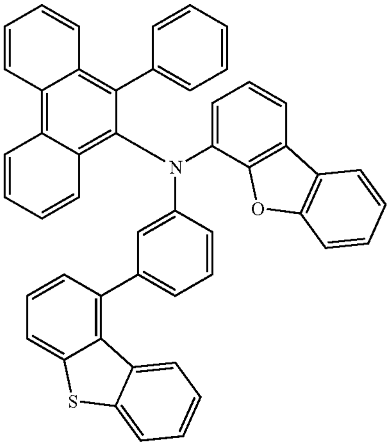
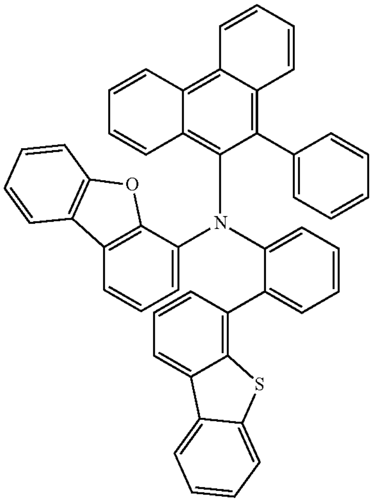
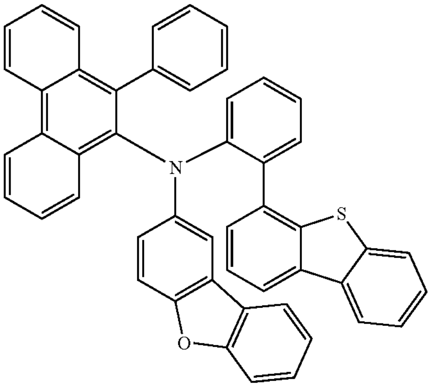
-continued
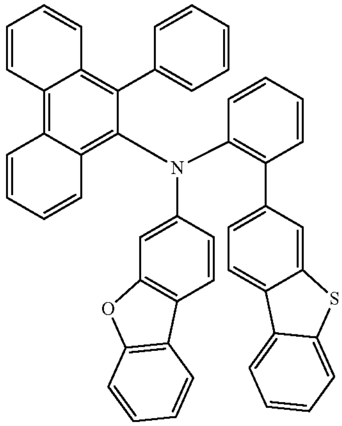
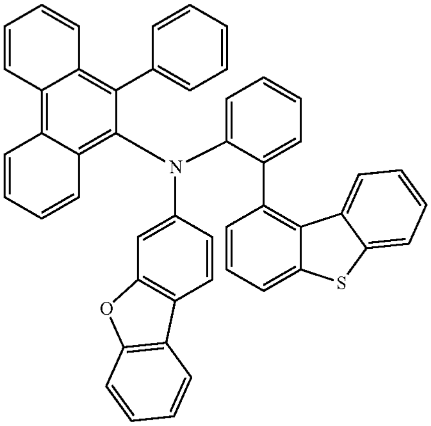
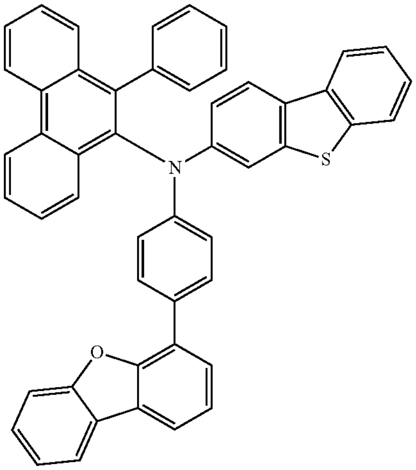

-continued
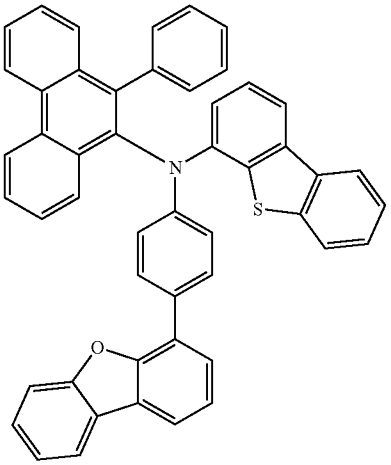
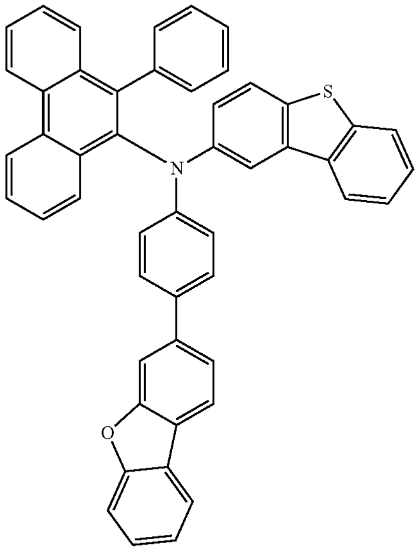
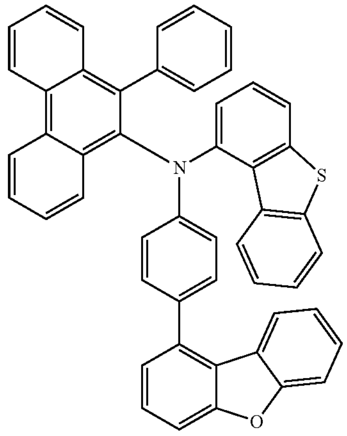
-continued
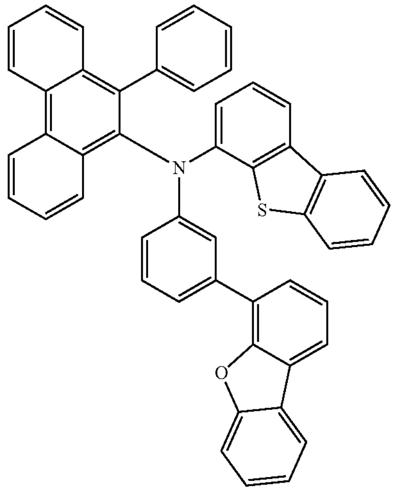
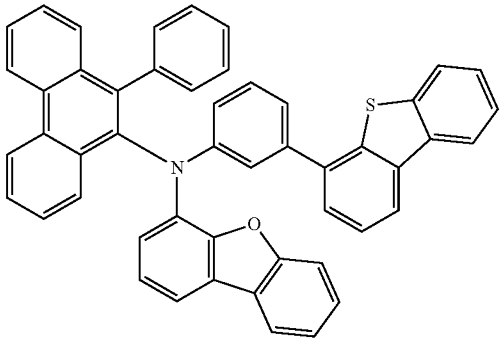
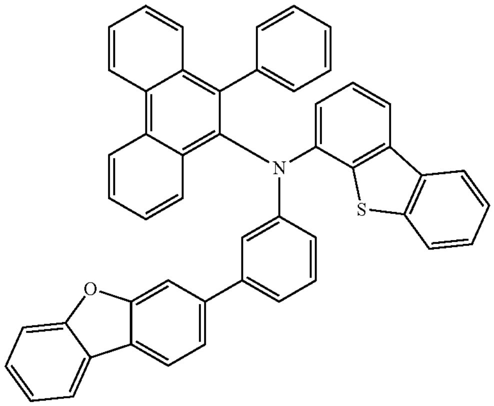
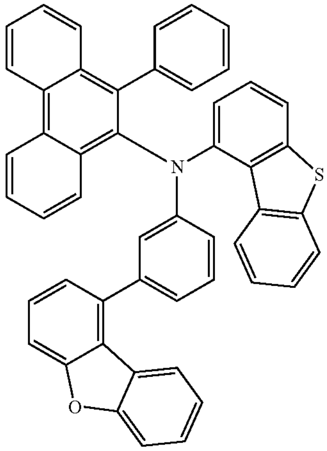

-continued
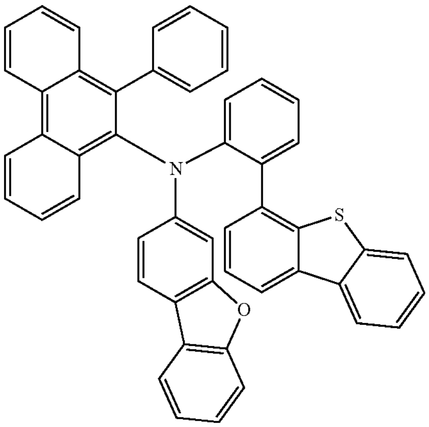
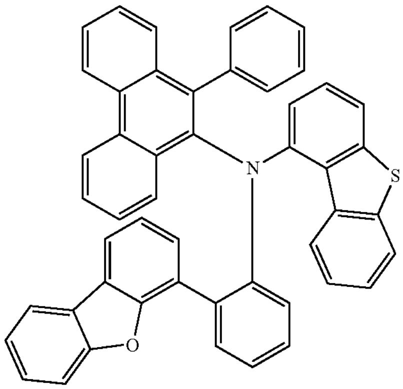
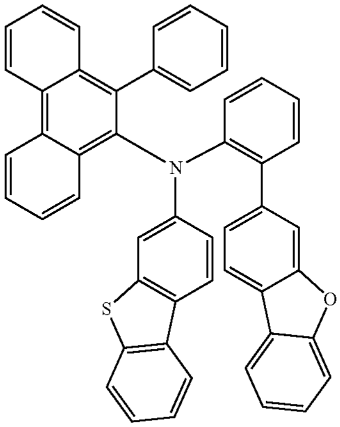
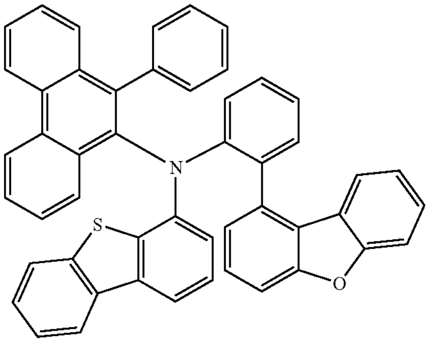
-continued
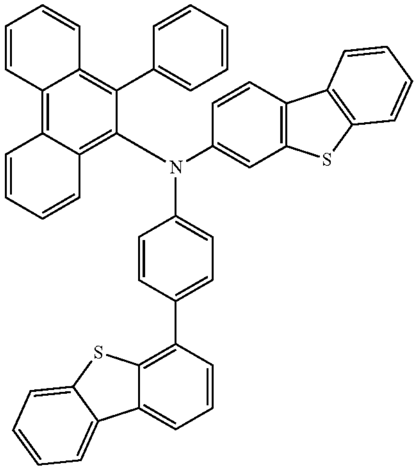
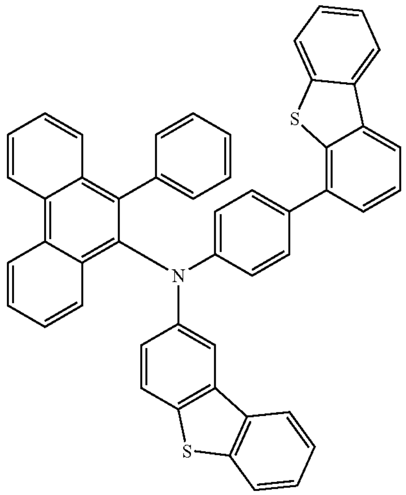
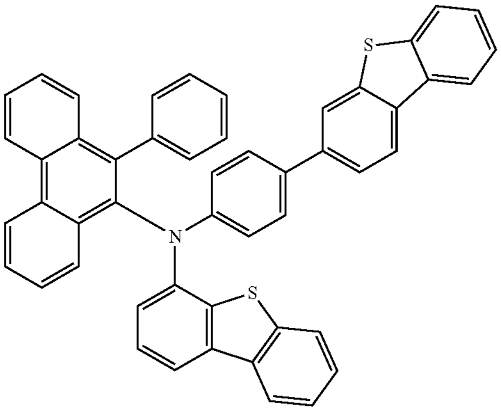
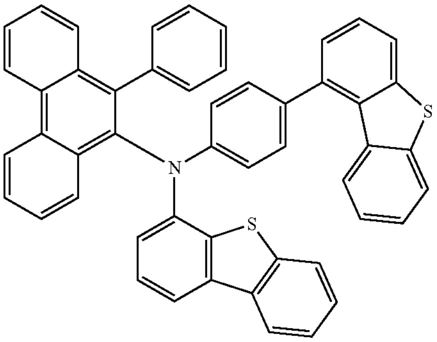

-continued
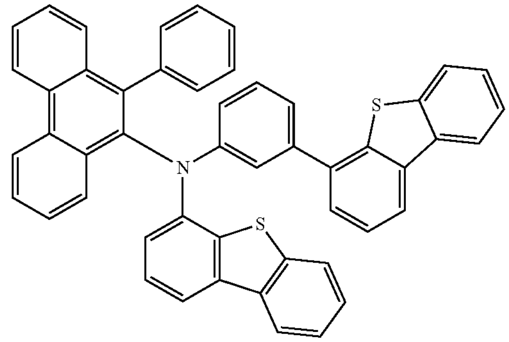
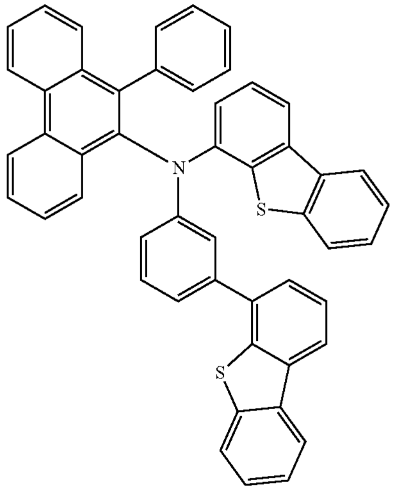
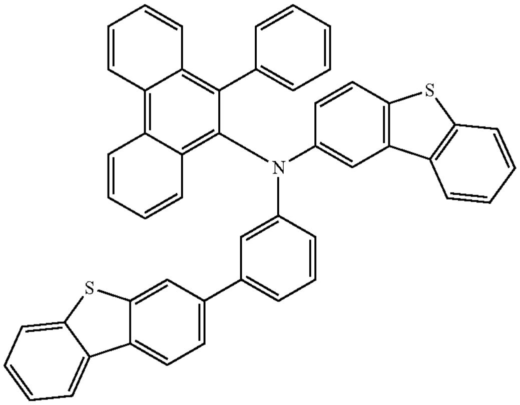
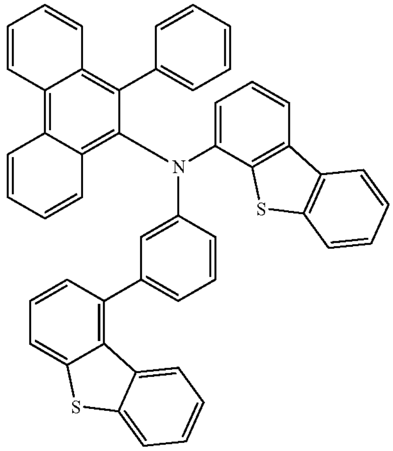
-continued
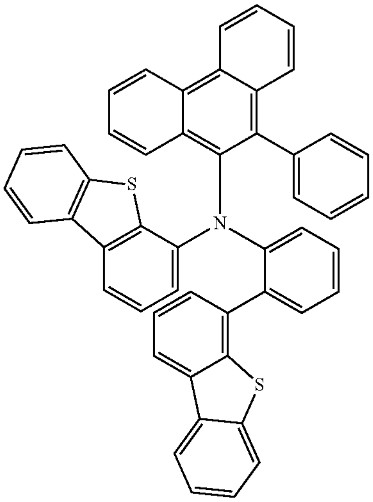
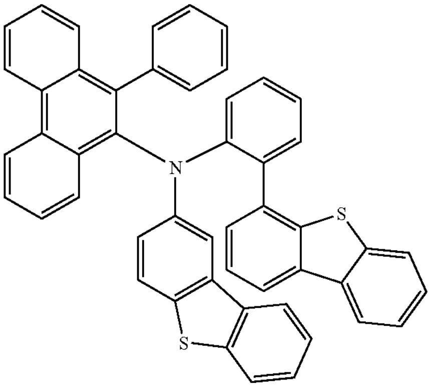
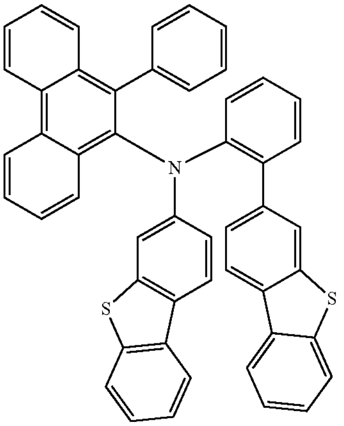

-continued
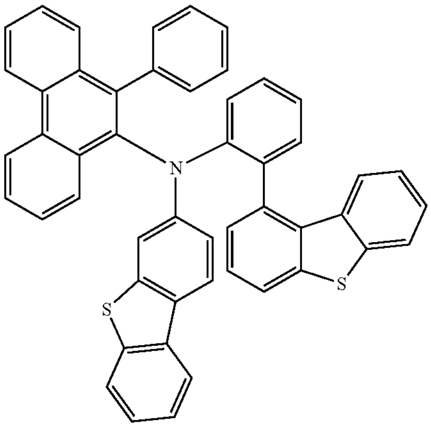
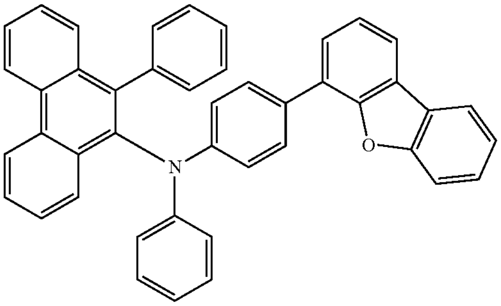
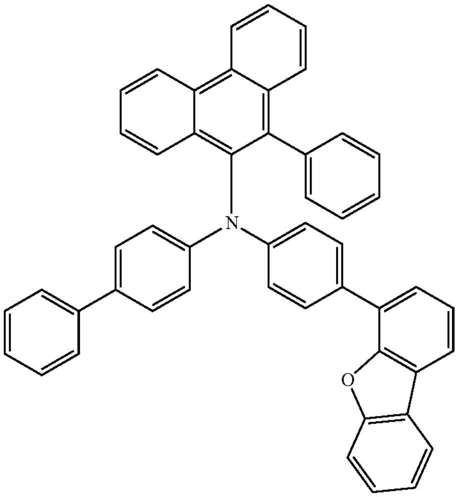
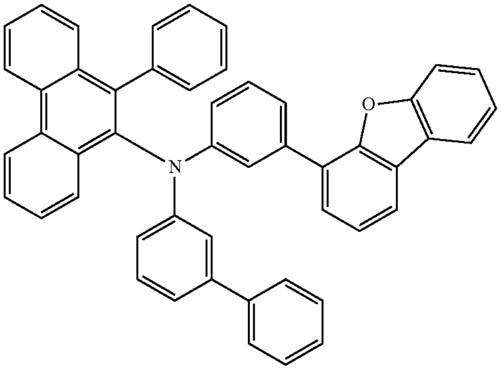
-continued
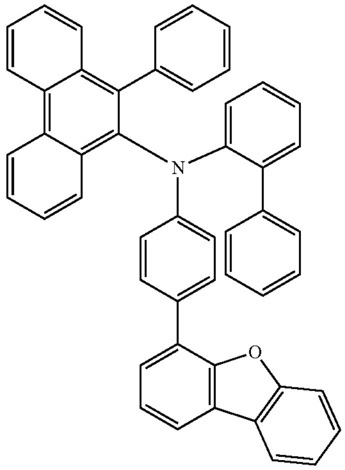
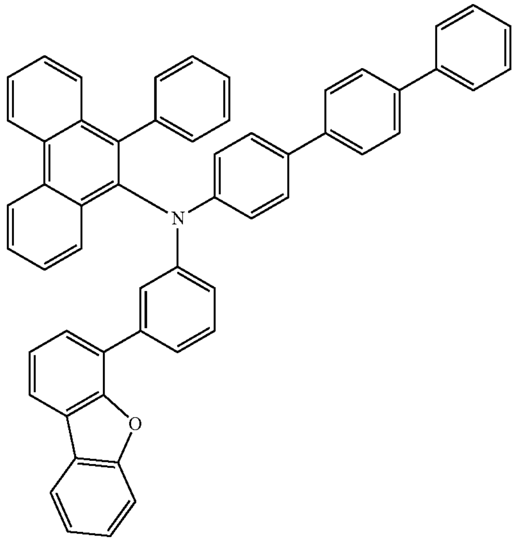
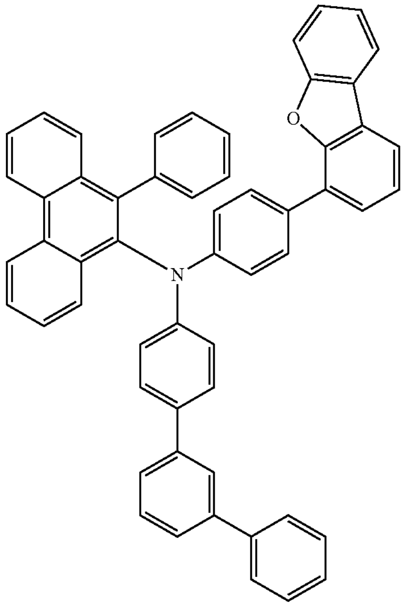

-continued
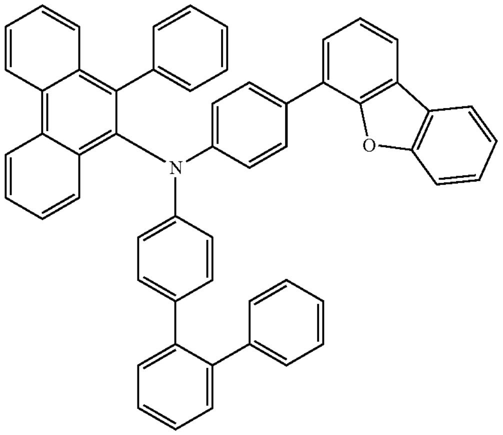
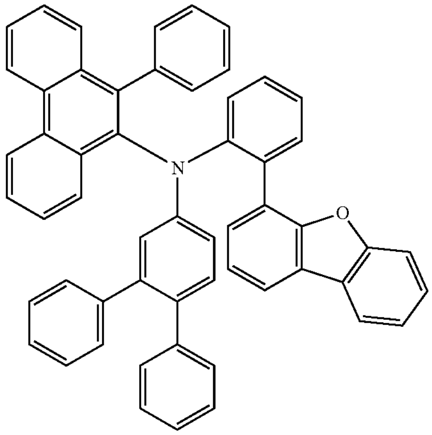
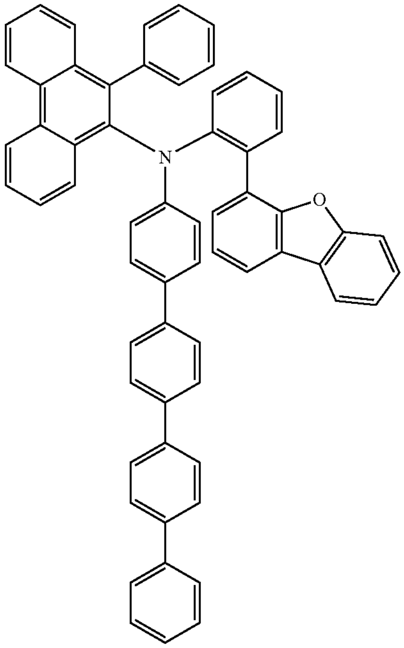
-continued
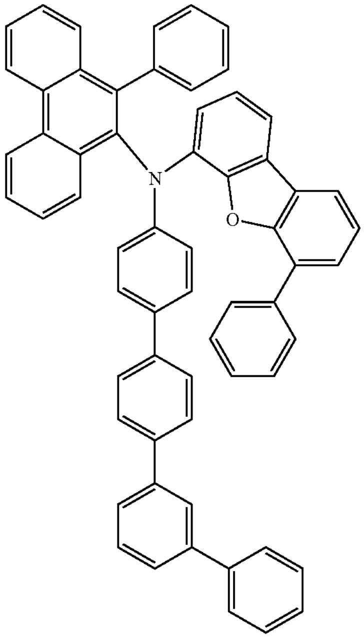
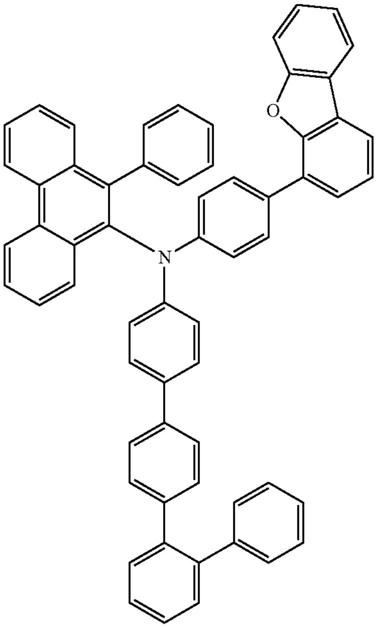

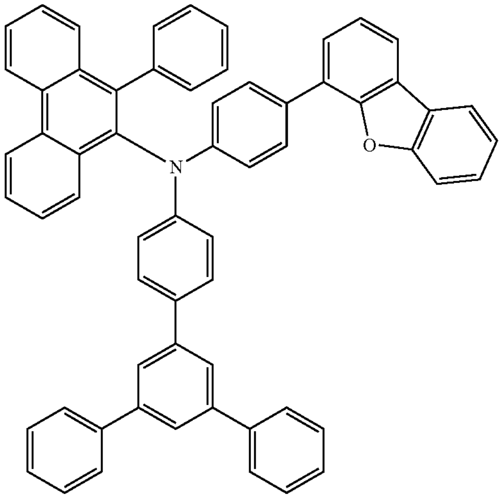
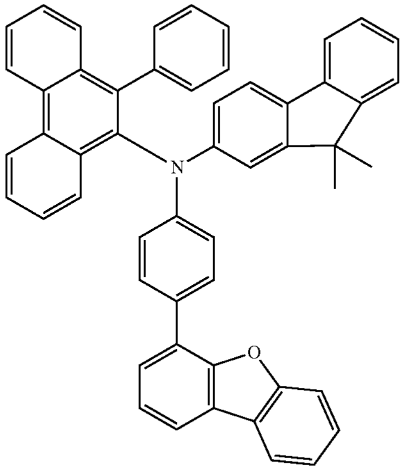
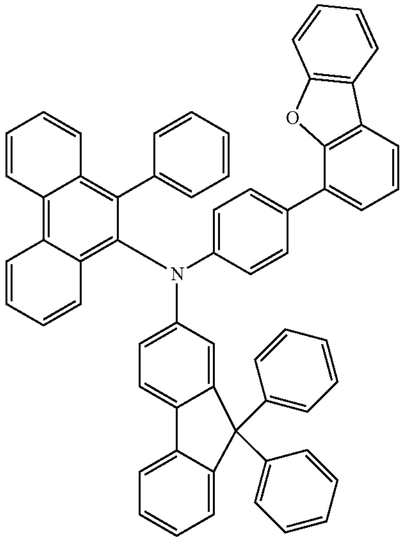
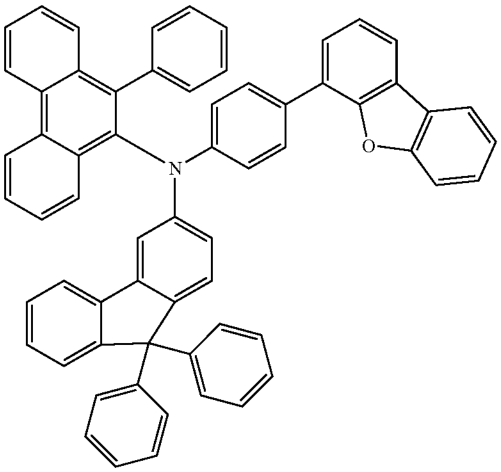
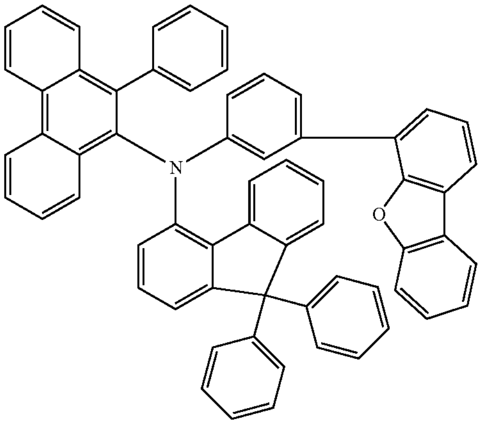
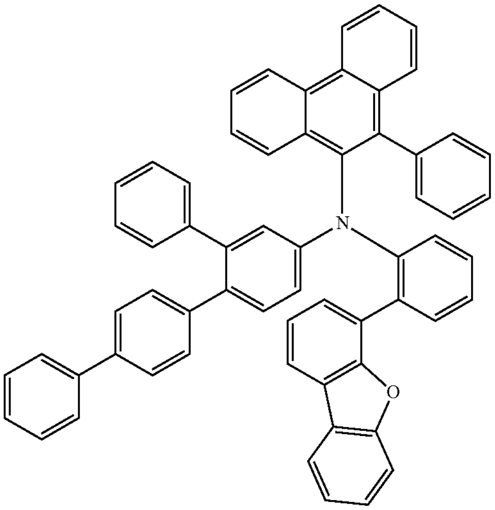

-continued
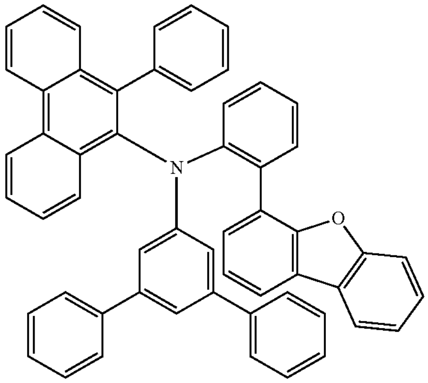
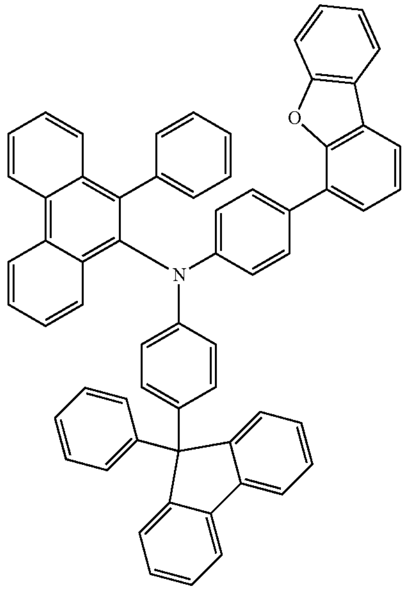
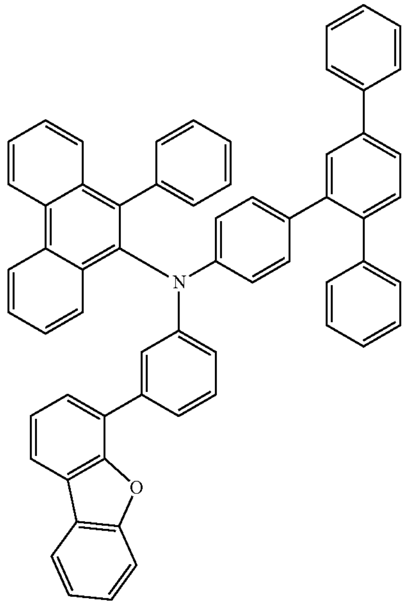 [SMILES: c1ccc(-c2ccc(-c3ccccc3)c(-c3ccc(N(c4cccc(-c5cccc6c5oc5ccccc56)c4)c4c(-c5ccccc5)c5ccccc5c5ccccc45)cc3)c2)cc1]
-continued
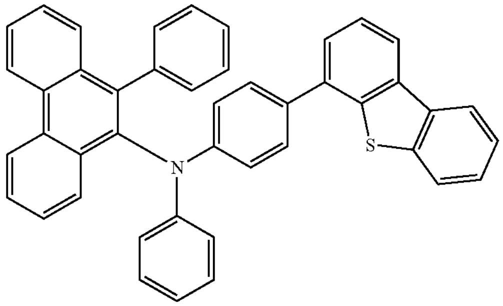
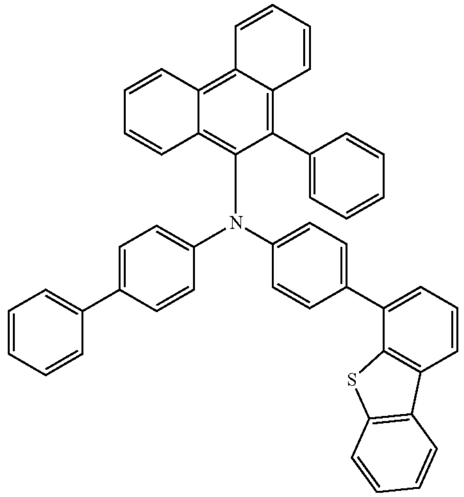
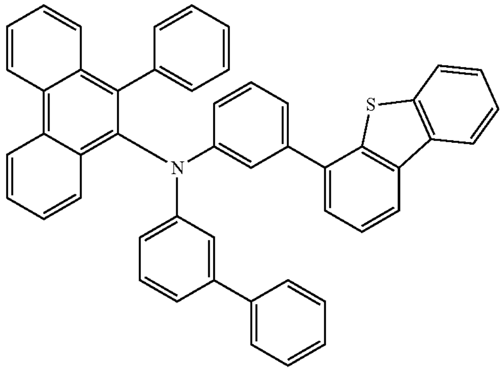
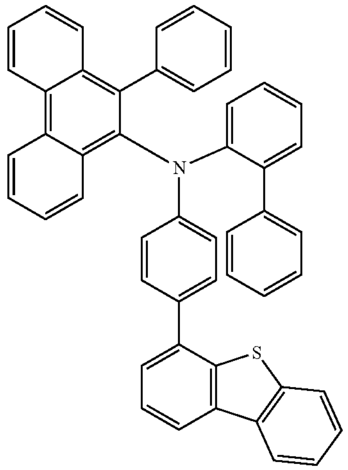

-continued
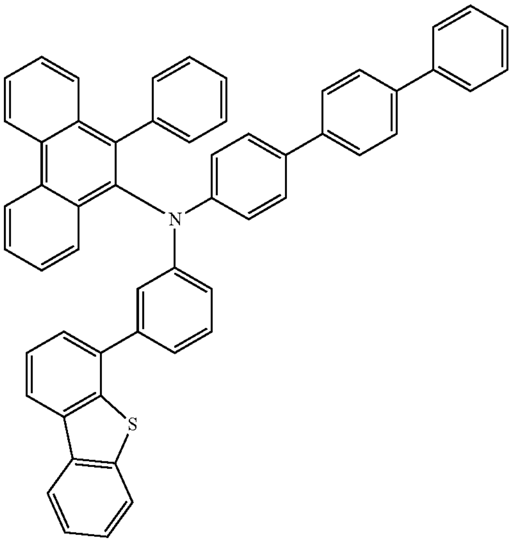
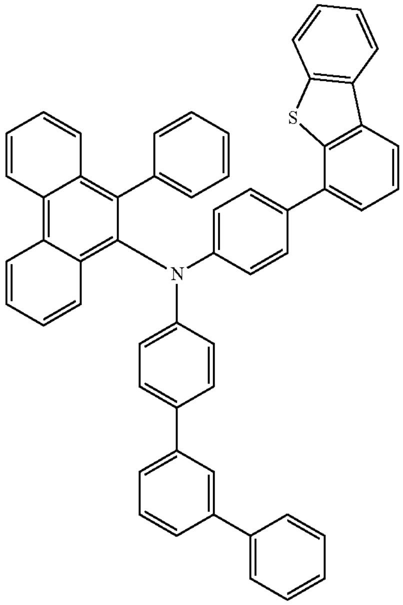
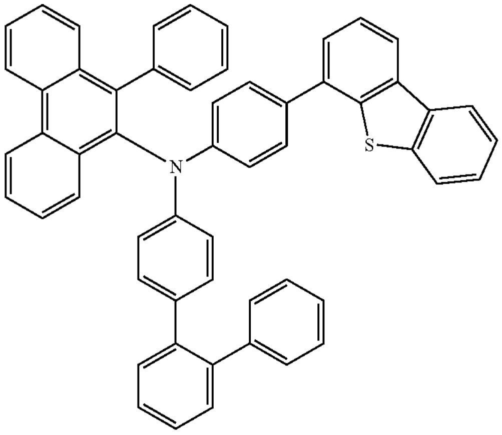
-continued
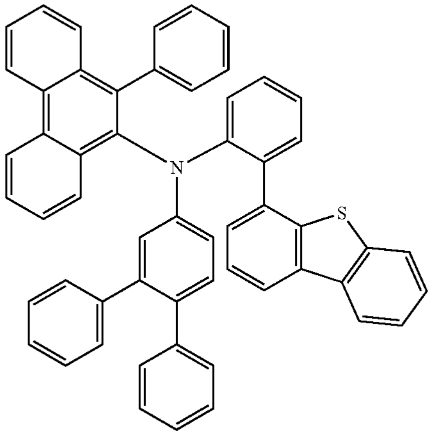
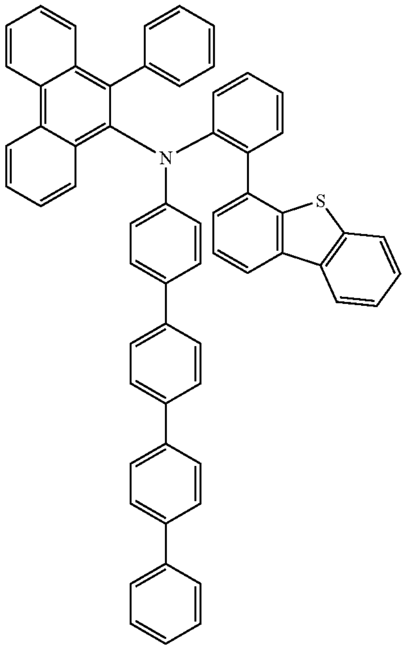
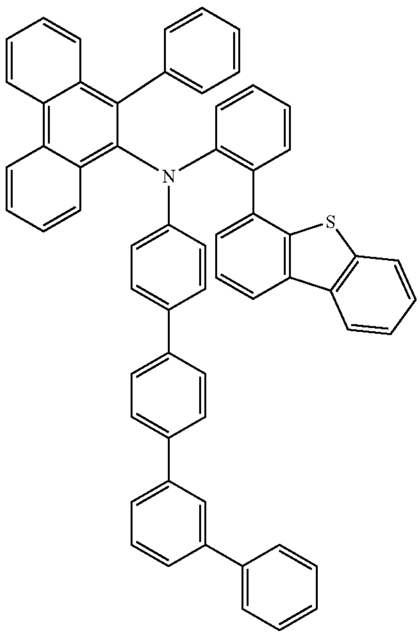

-continued
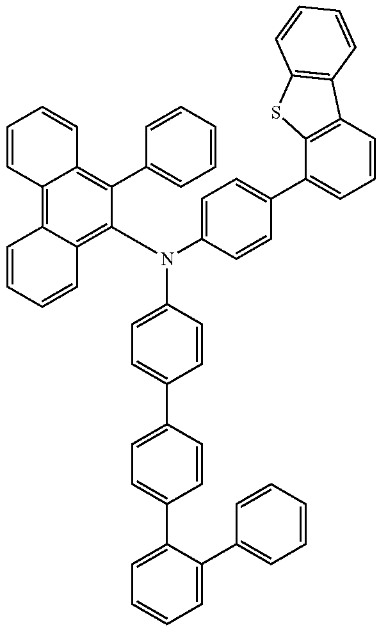
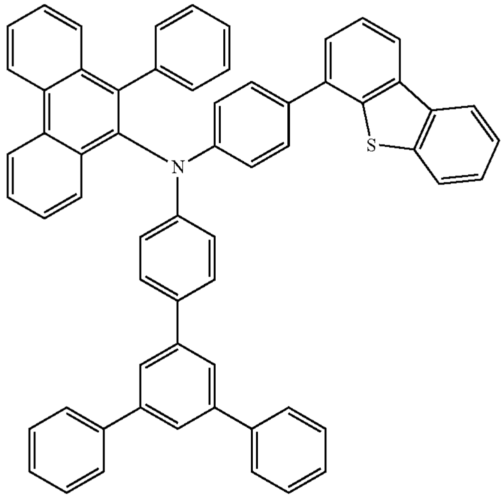
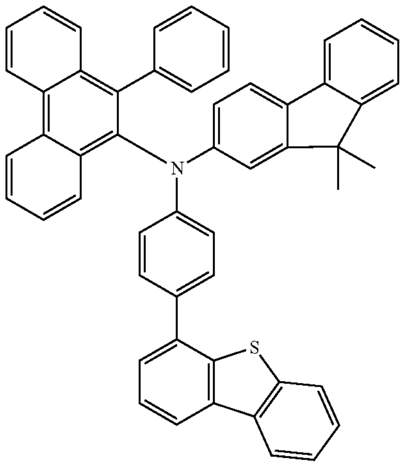
-continued
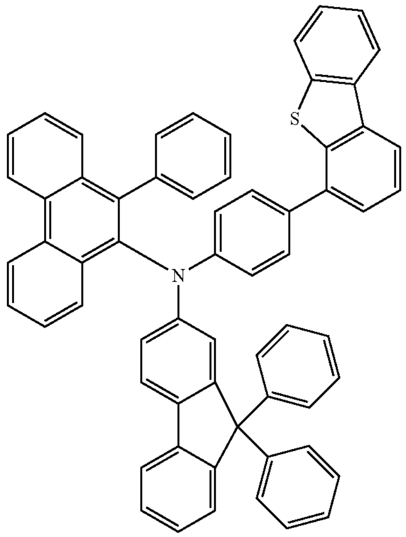
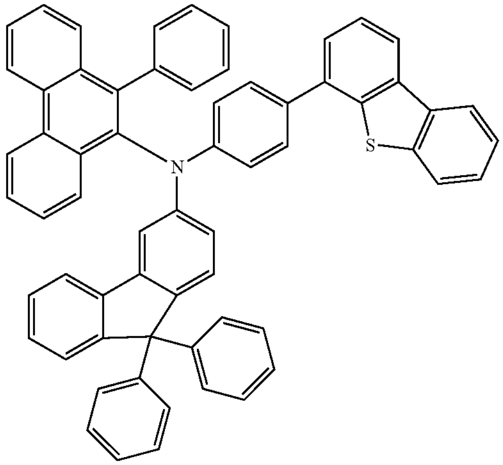
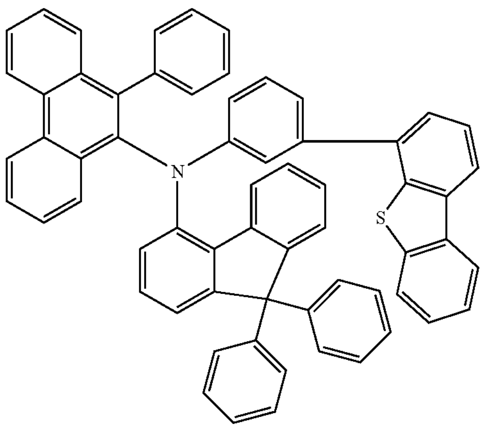

-continued
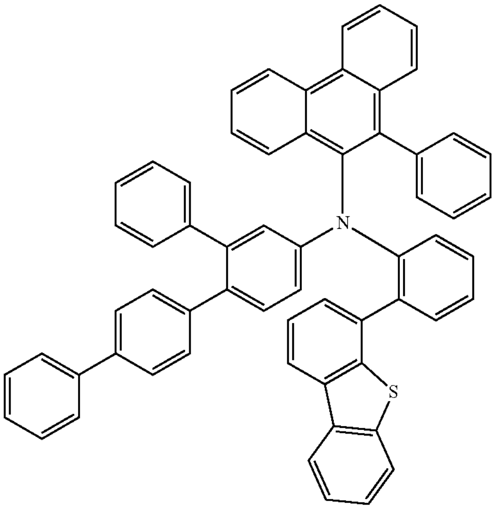
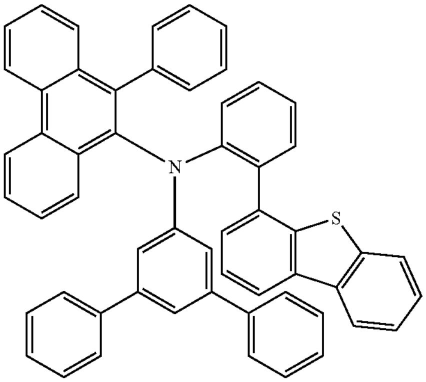
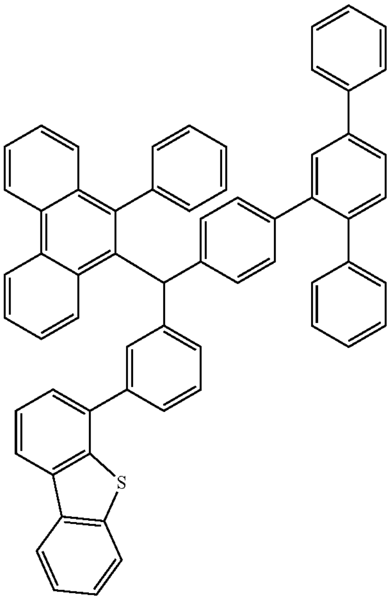
-continued
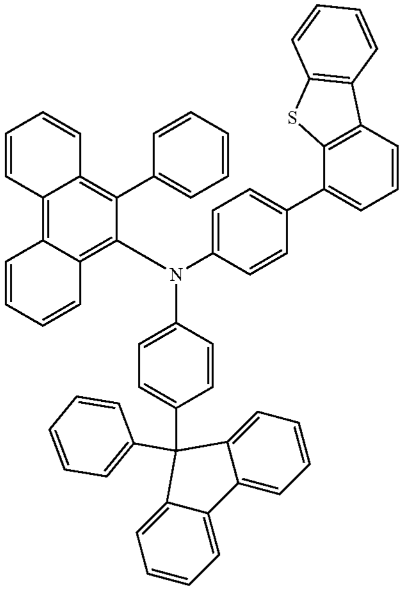 [SMILES: c1ccc(-c2c(N(c3ccc(-c4cccc5c4sc4ccccc45)cc3)c3ccc(C4(c5ccccc5)c5ccccc5-c5ccccc54)cc3)c3ccccc3c3ccccc23)cc1]
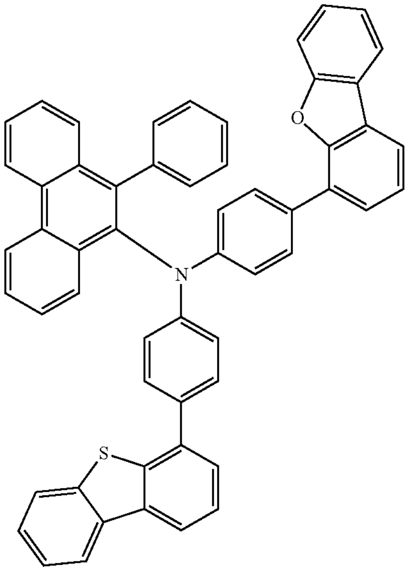
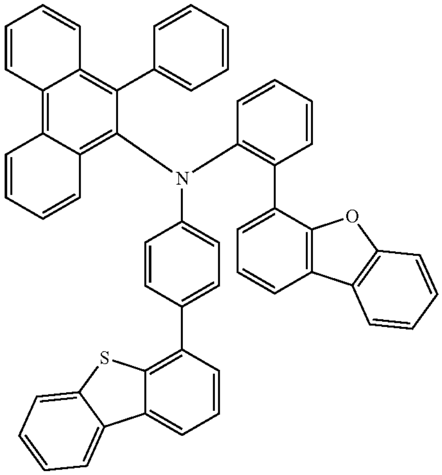

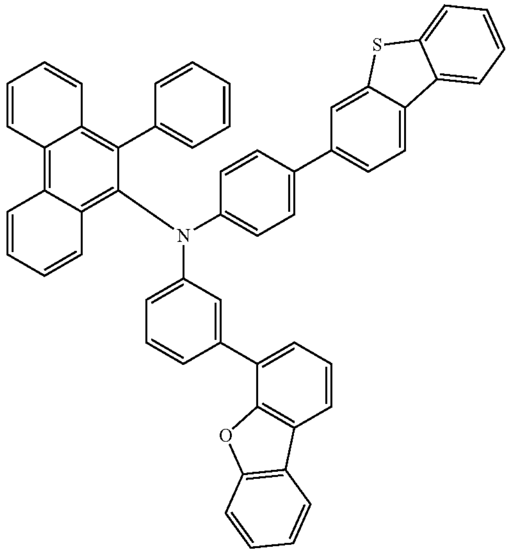
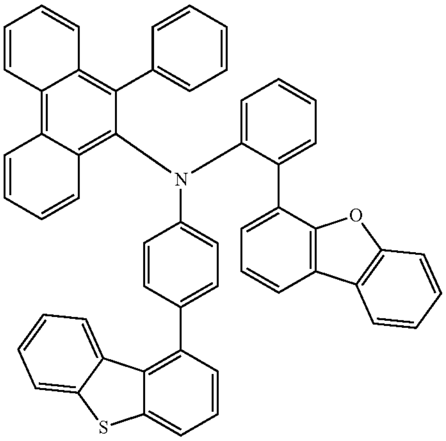
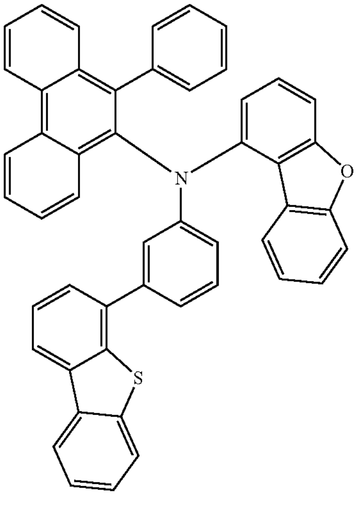
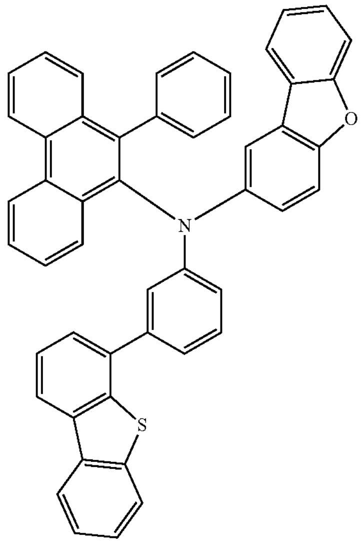
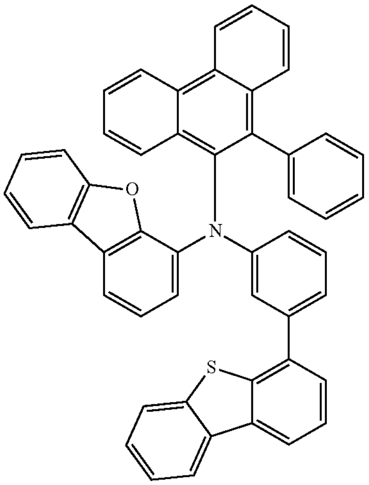 [SMILES: c1ccc(-c2c(N(c3cccc(-c4cccc5c4sc4ccccc45)c3)c3cccc4c3oc3ccccc34)c3ccccc3c3ccccc23)cc1]
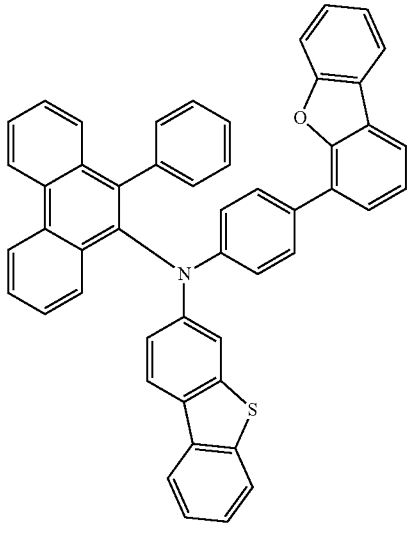

-continued
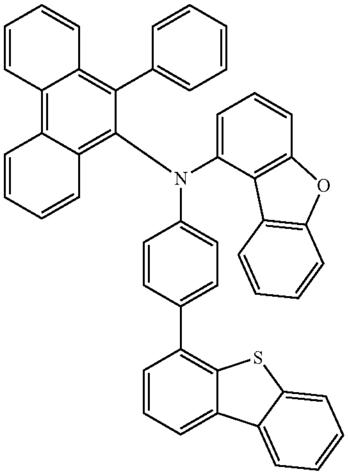
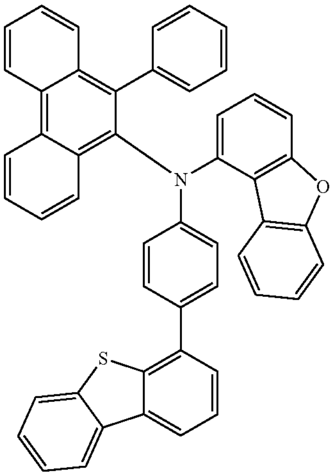
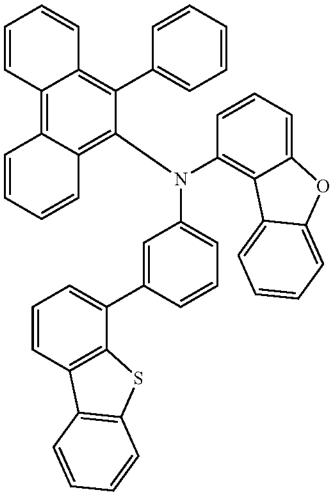
-continued
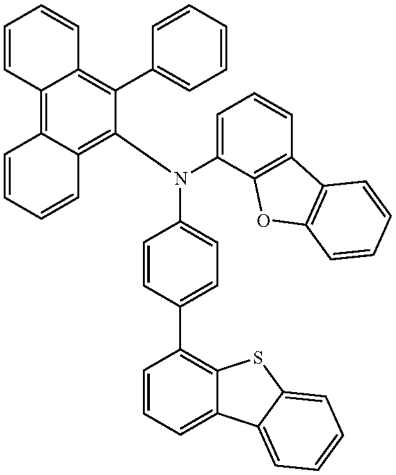
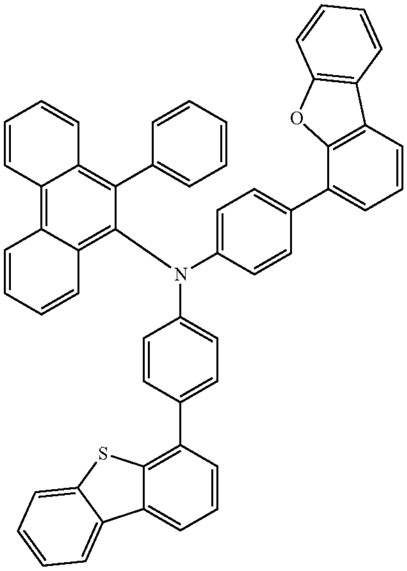
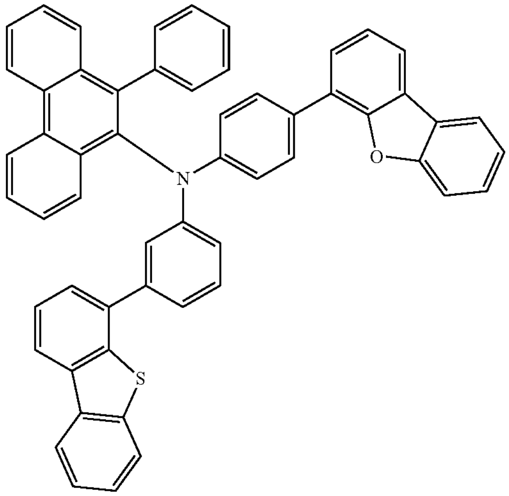

-continued
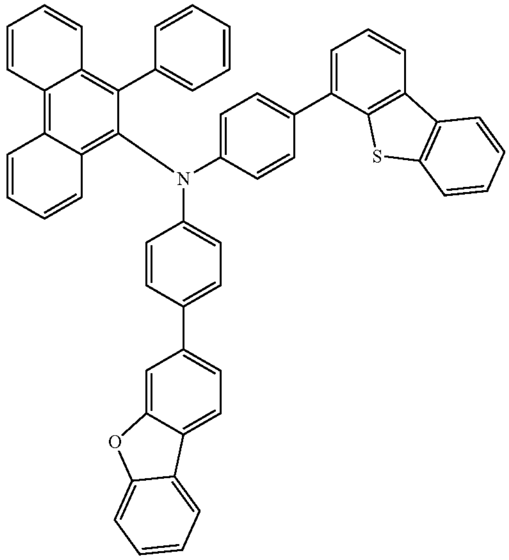
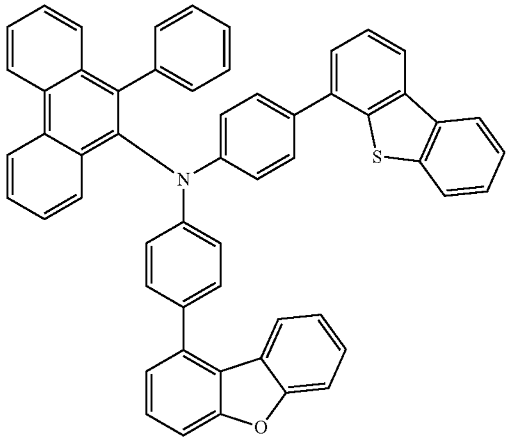
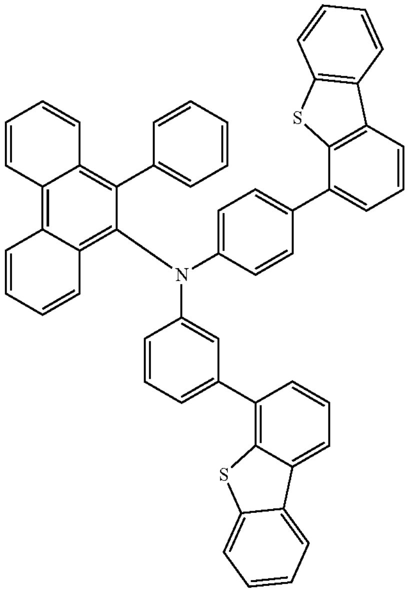
-continued
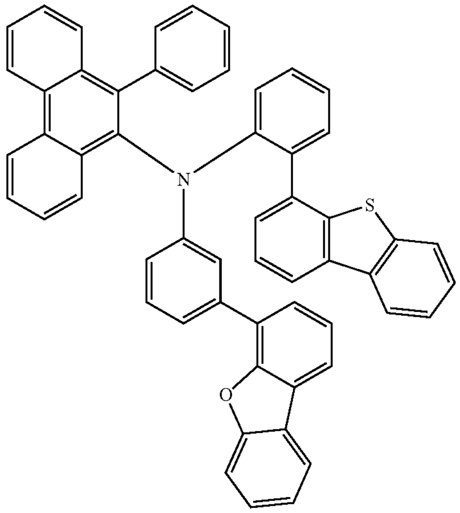
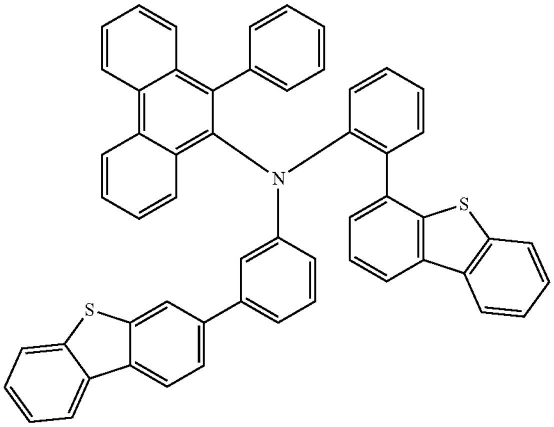
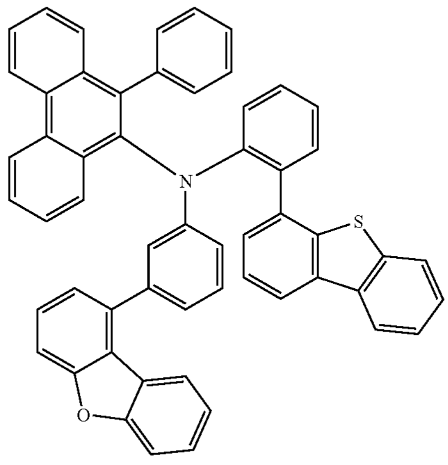

-continued
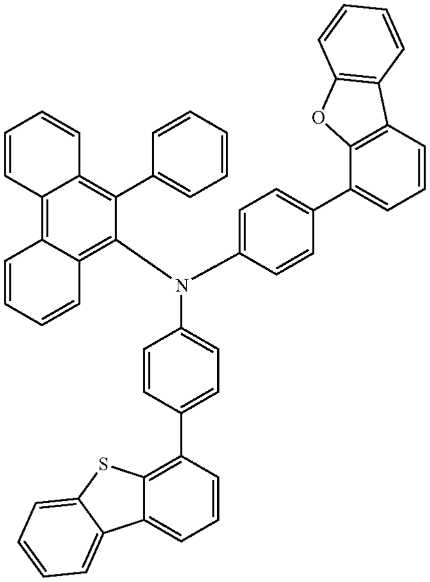
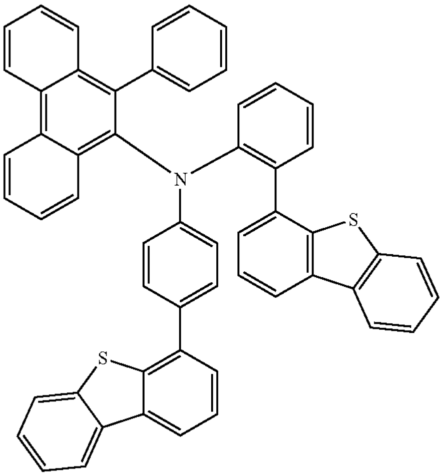
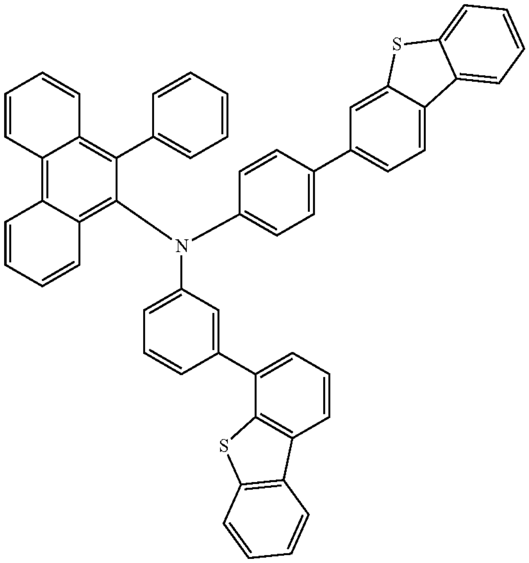
-continued
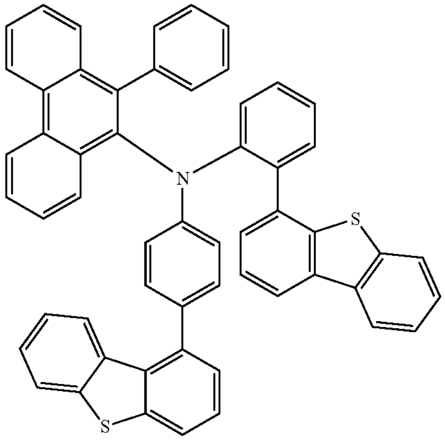
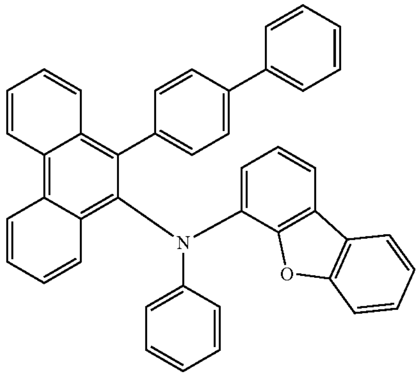
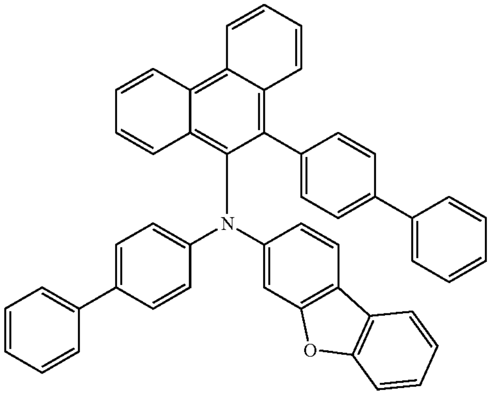
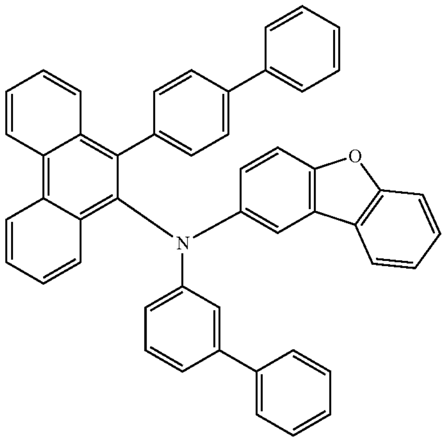

-continued
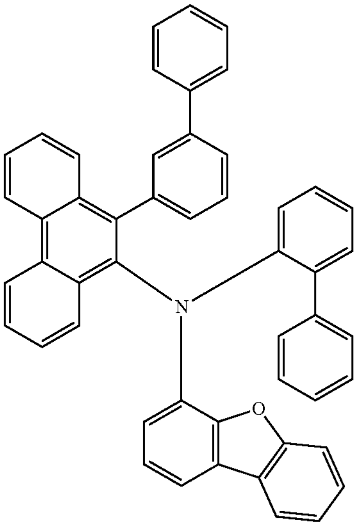
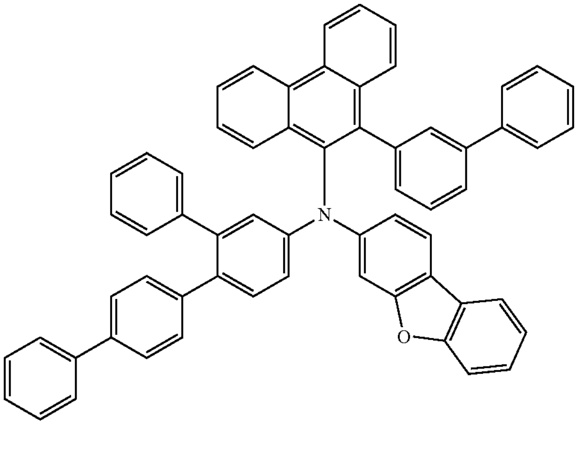
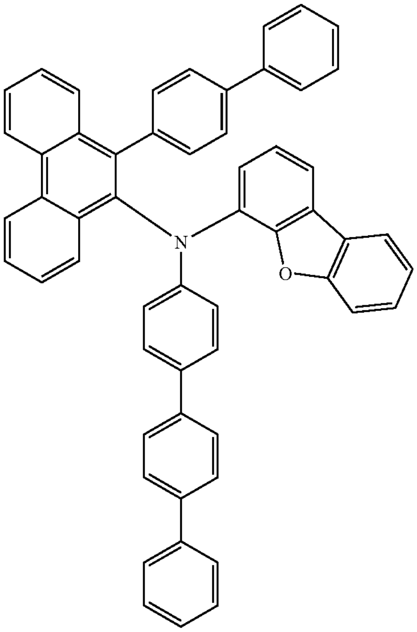
-continued
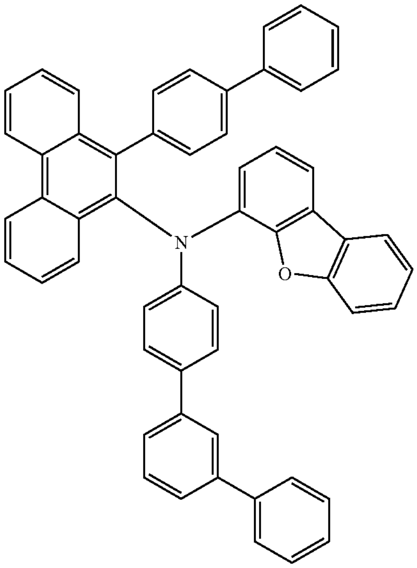
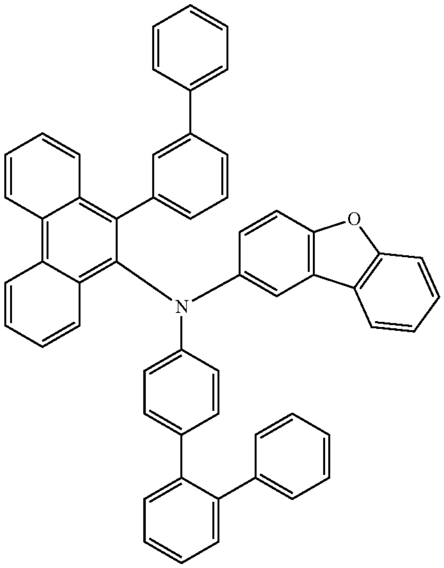
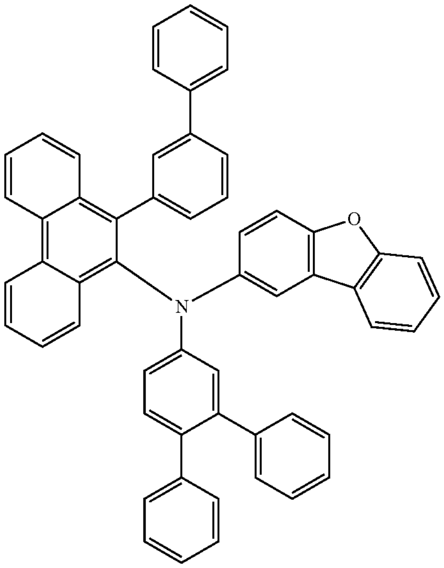

-continued
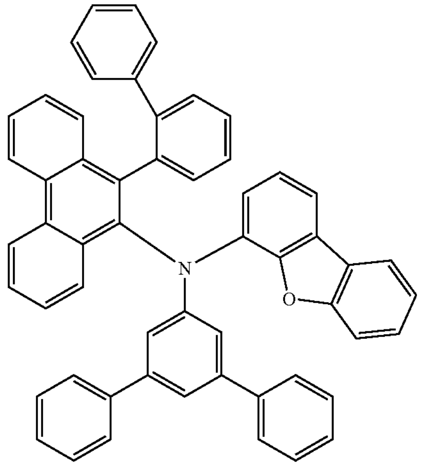
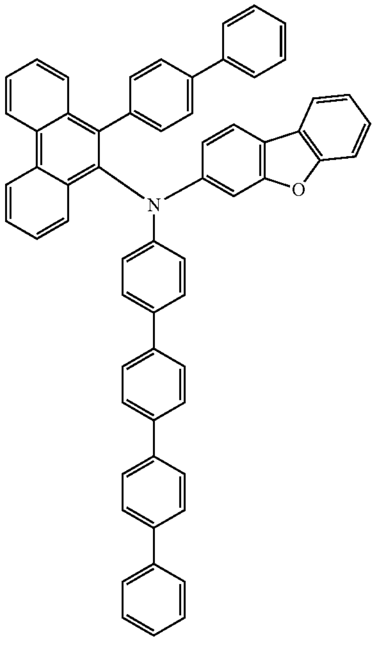
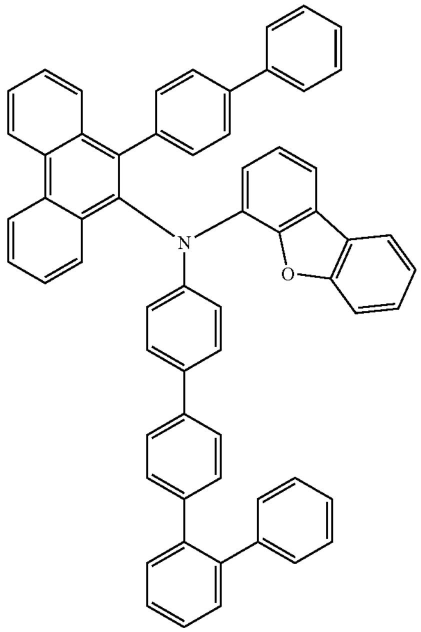
-continued
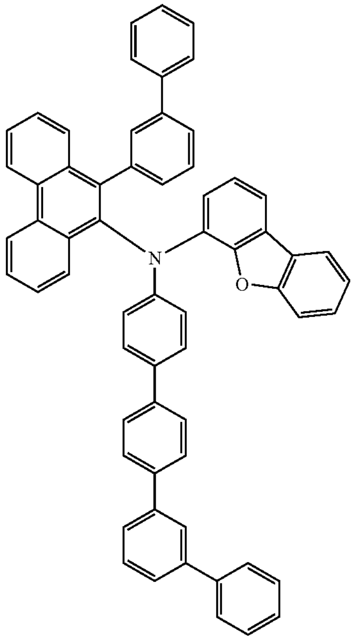

-continued
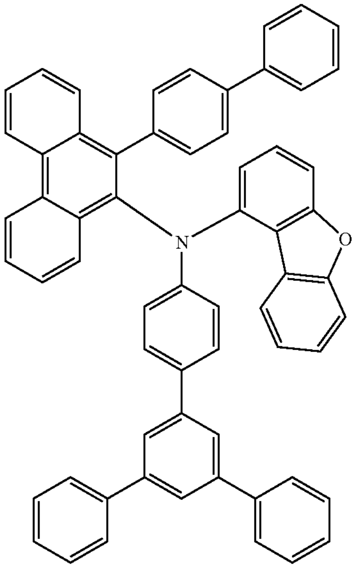
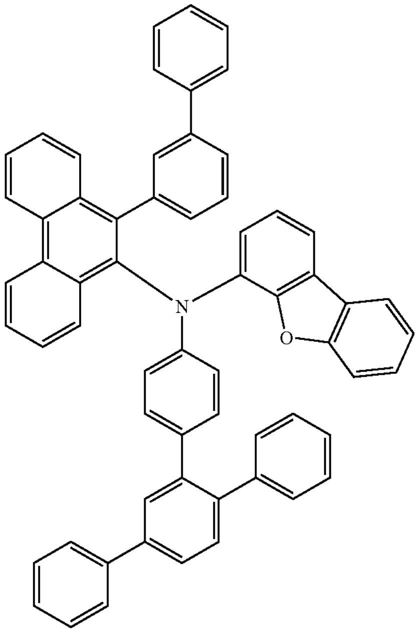
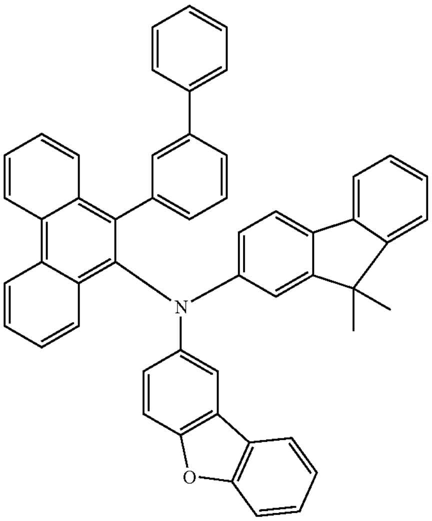
-continued
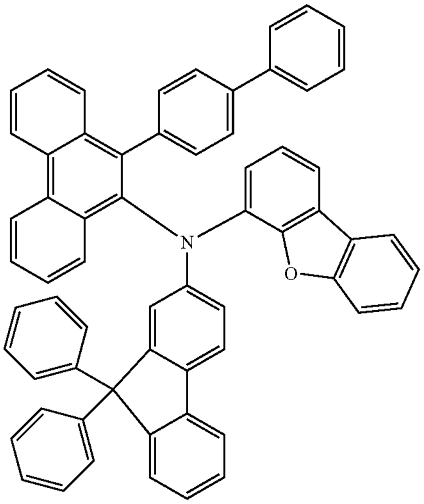
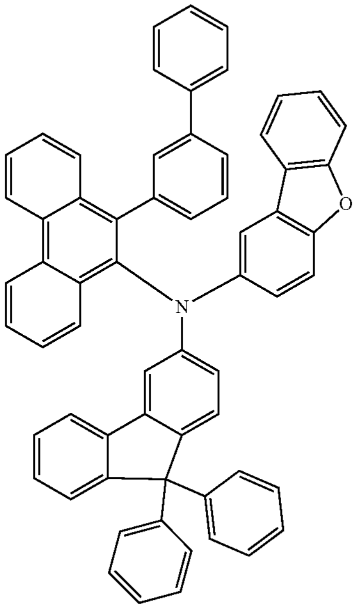
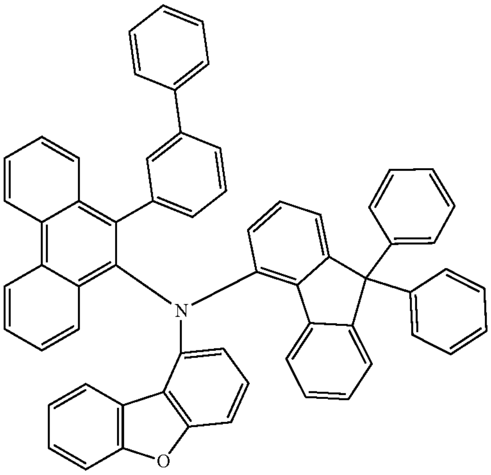

-continued
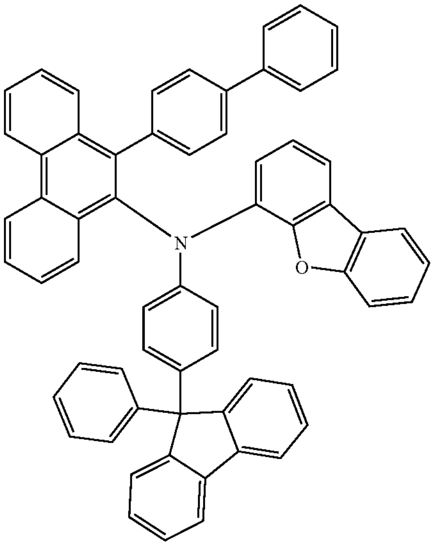
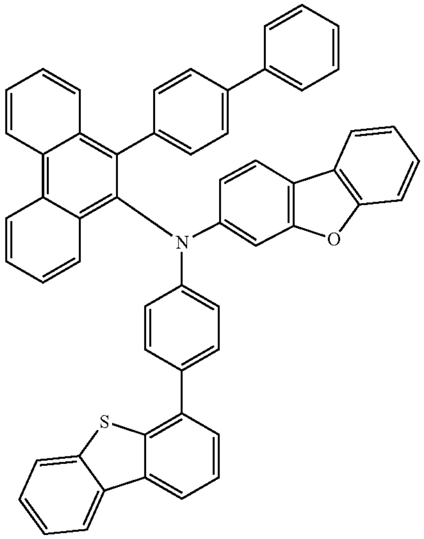
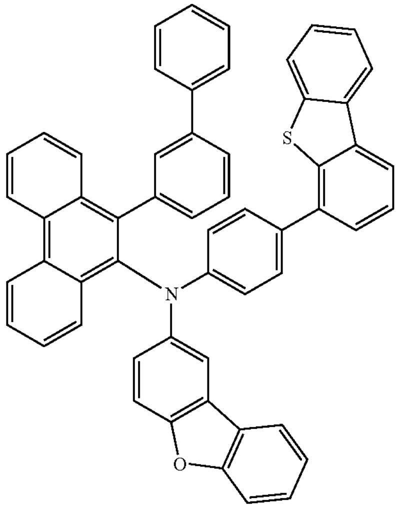
-continued
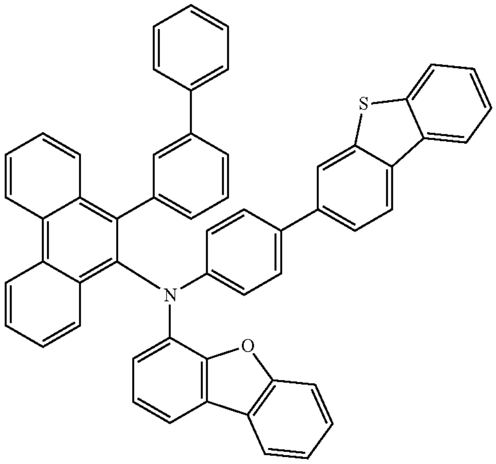
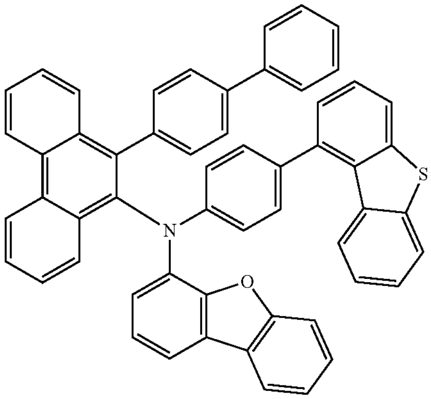
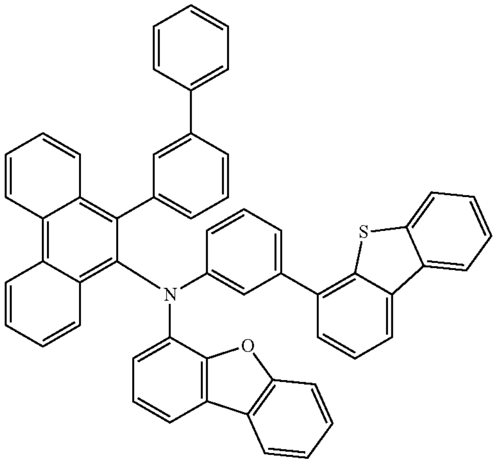

-continued
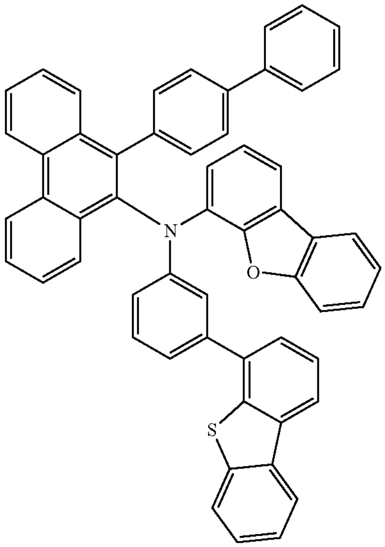
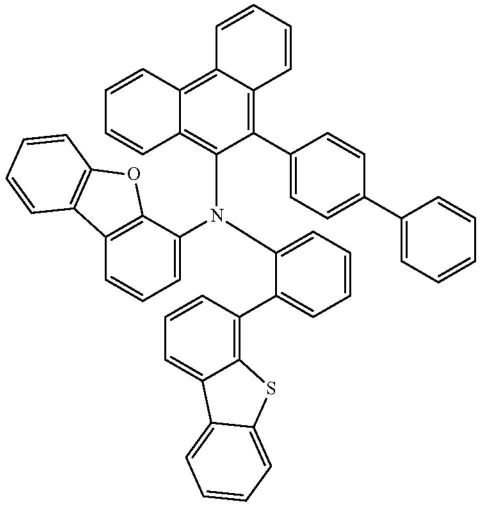
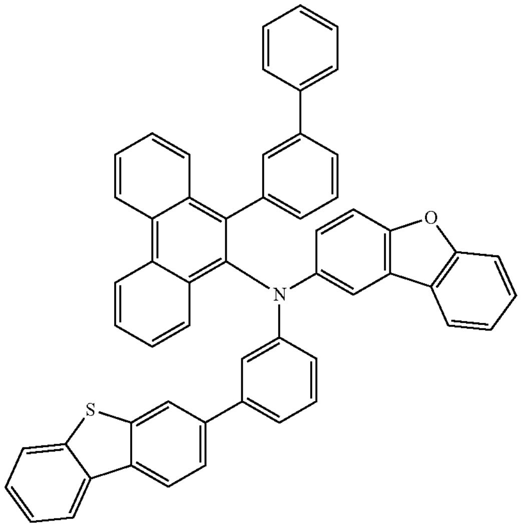
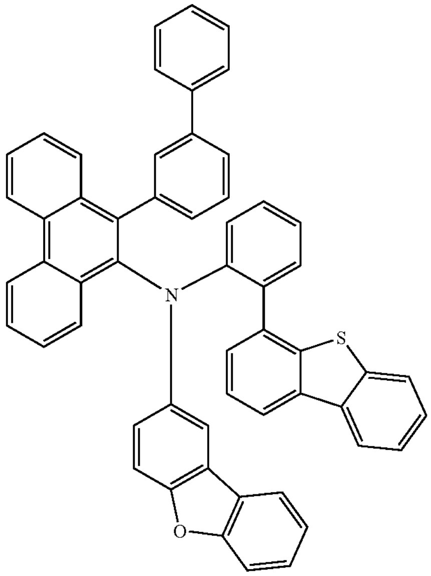
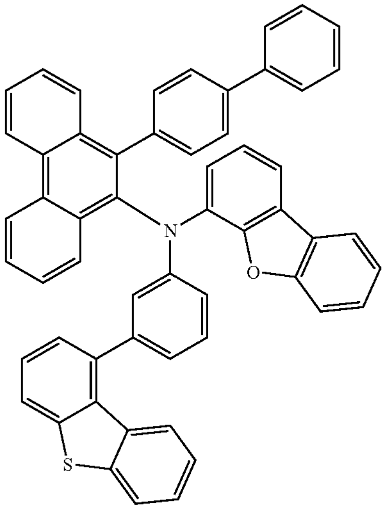
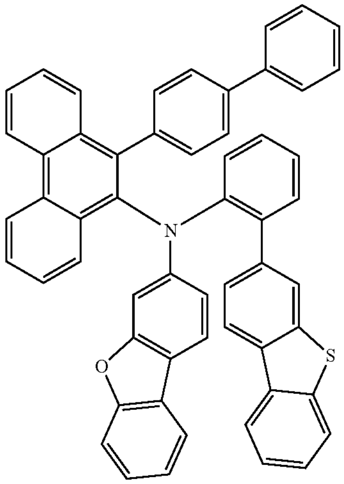
-continued -continued
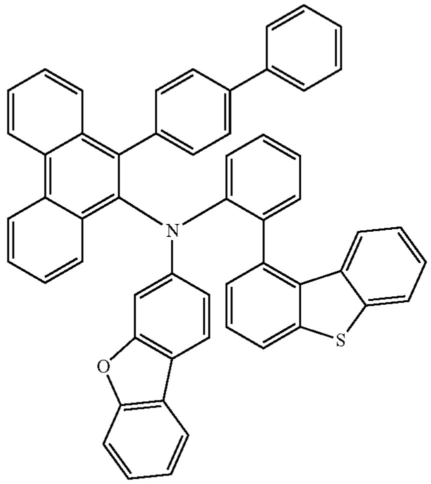
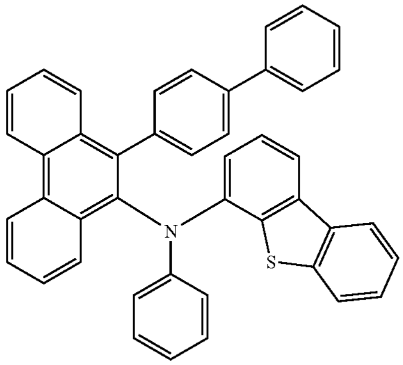
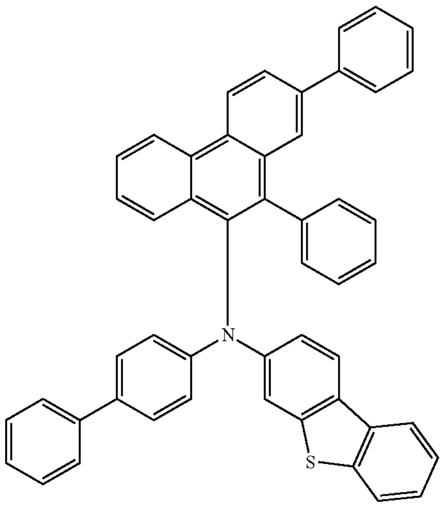
-continued
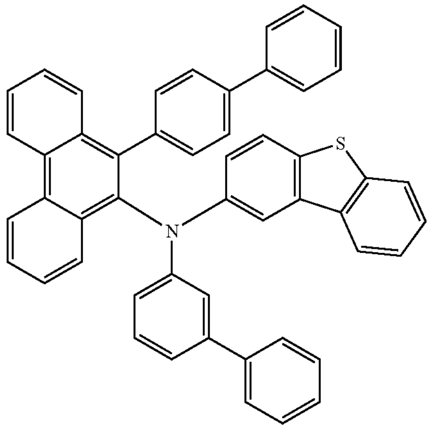
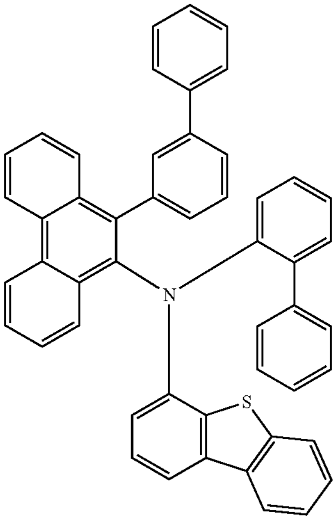
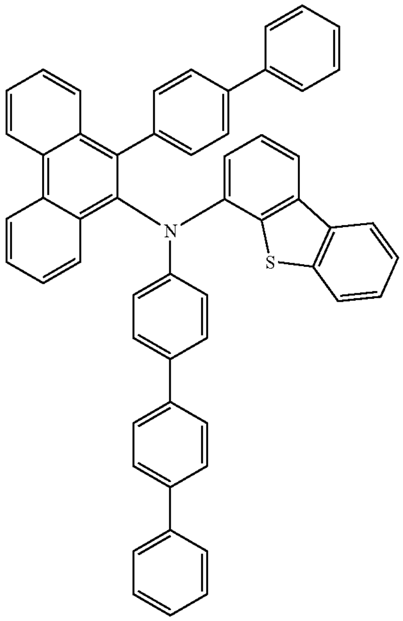

-continued
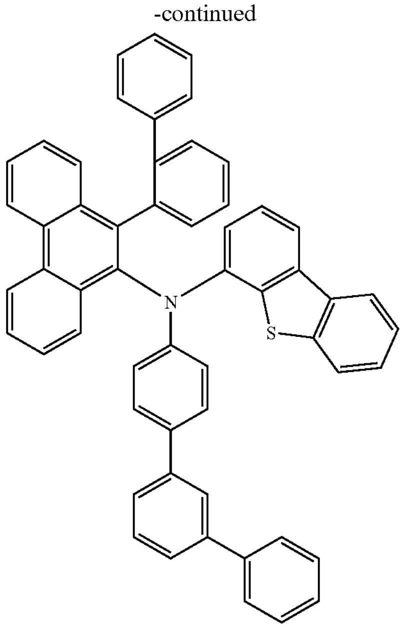
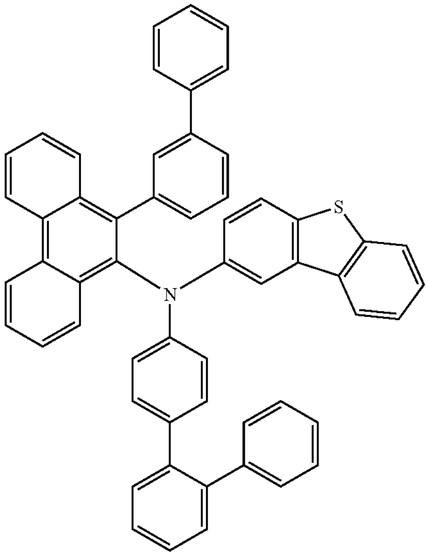
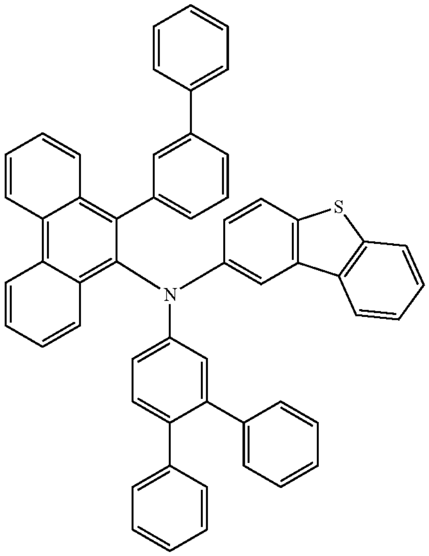
-continued
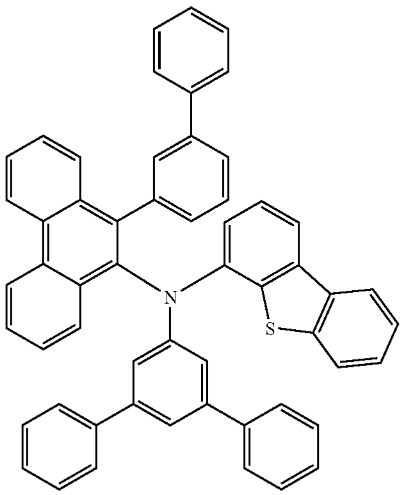
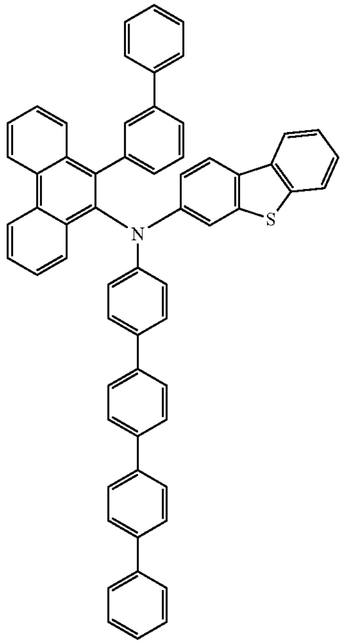

-continued
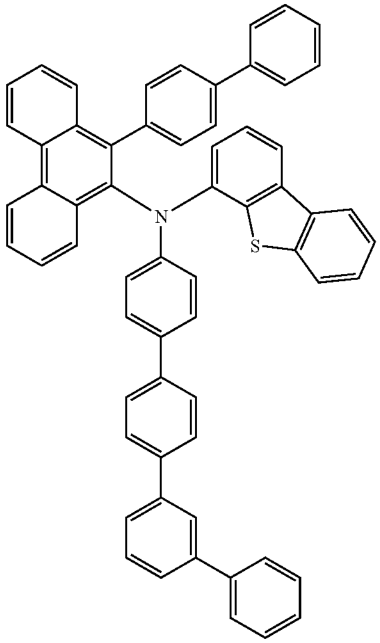
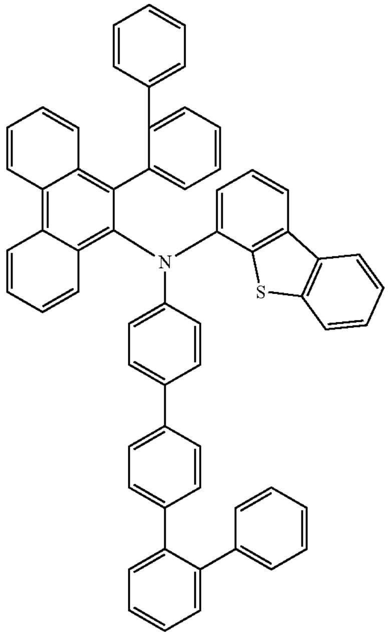
-continued
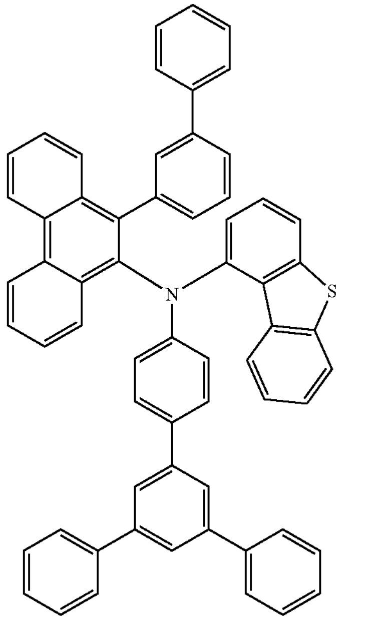
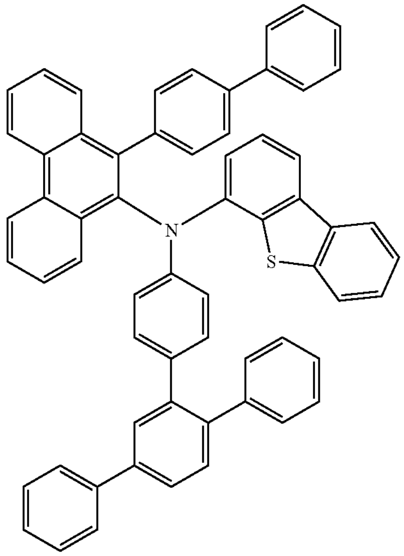
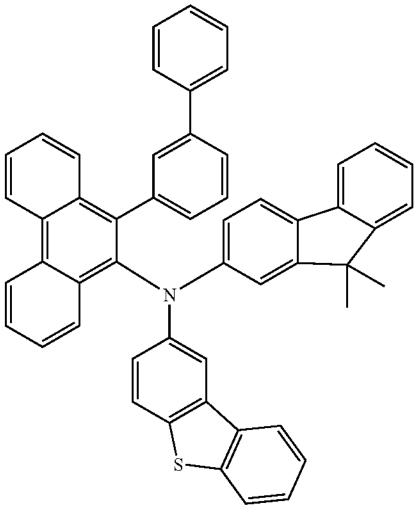

-continued
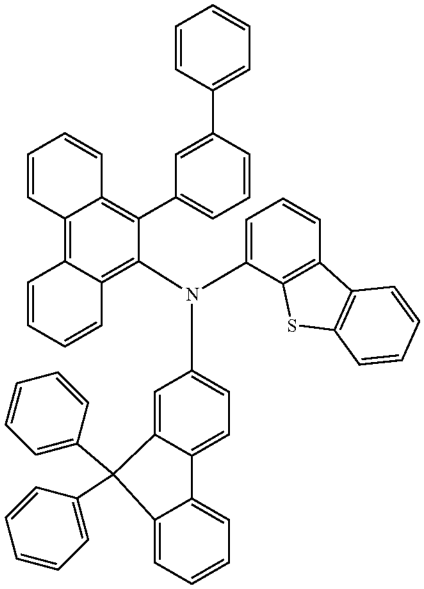
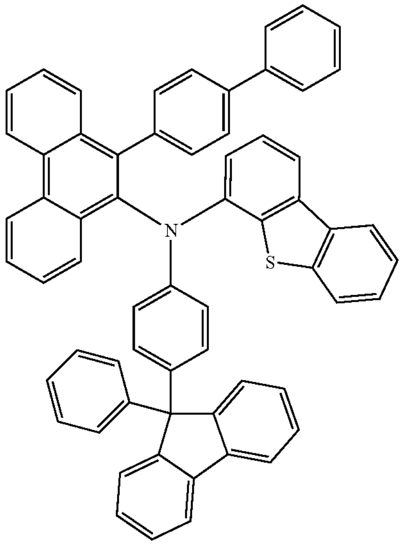
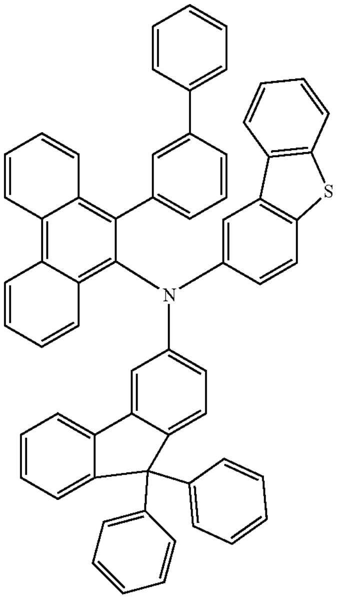
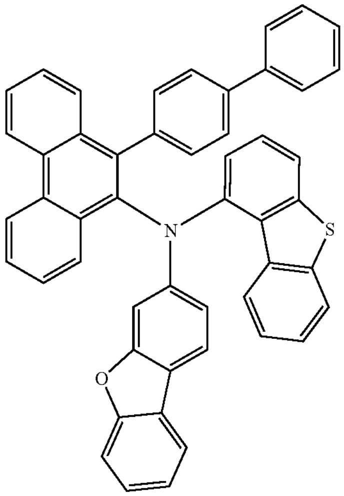
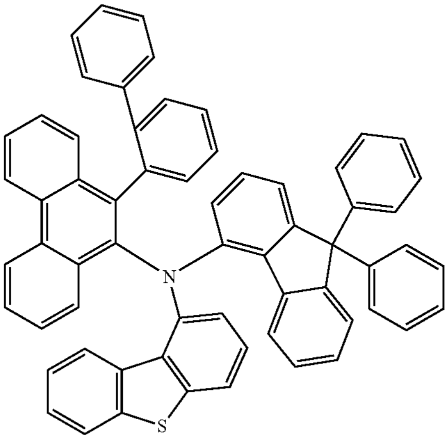
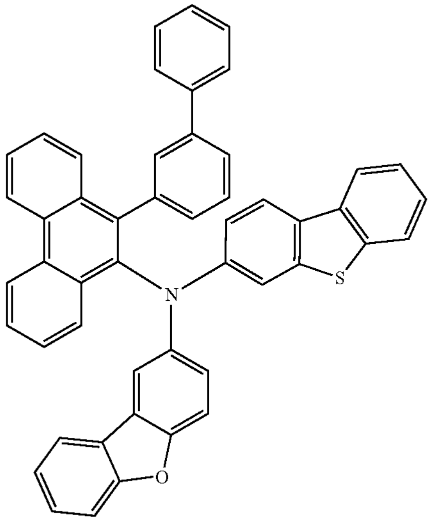
-continued

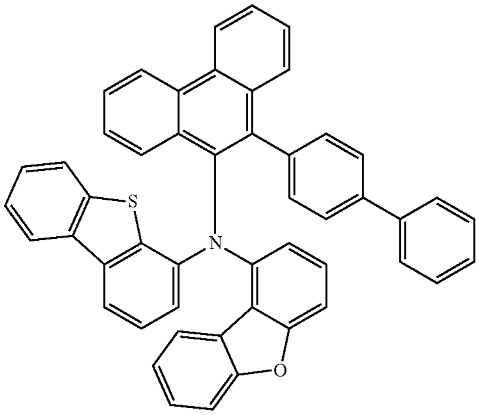
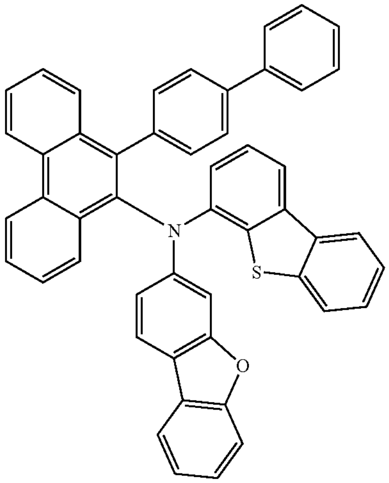
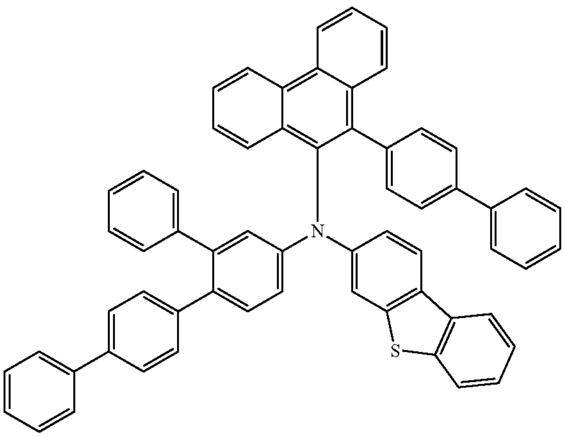
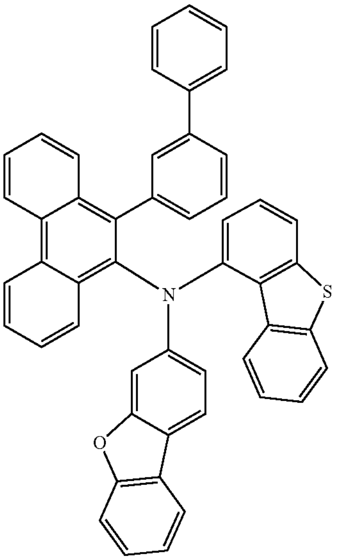
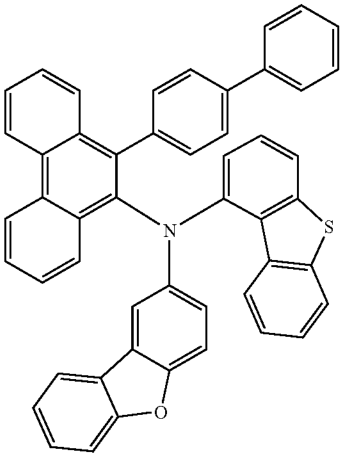
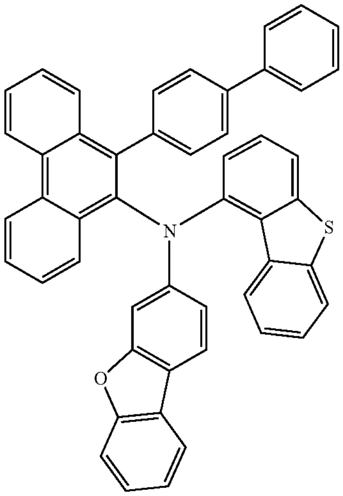

-continued
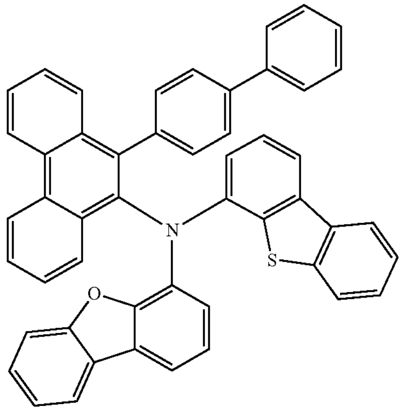
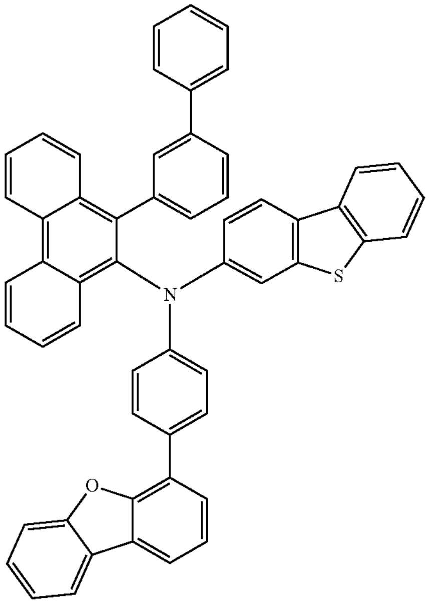
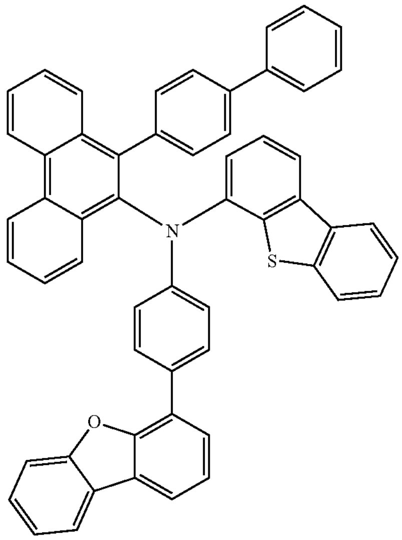
-continued
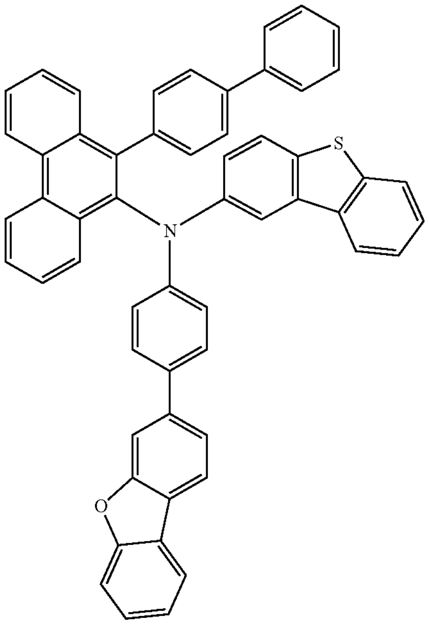
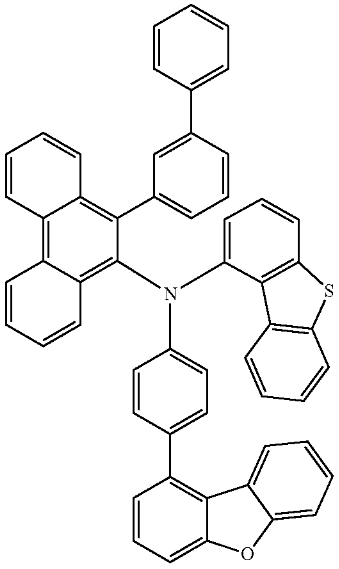

-continued
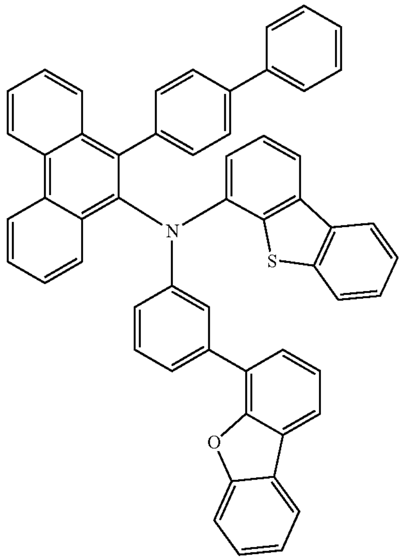
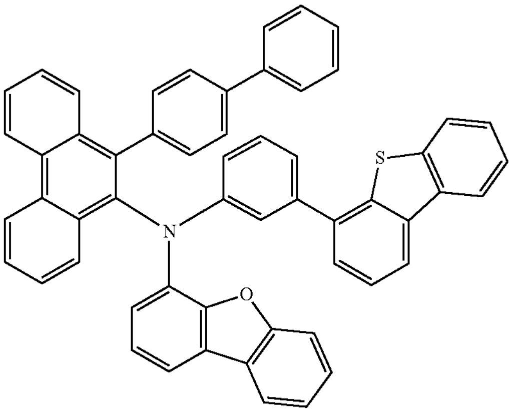
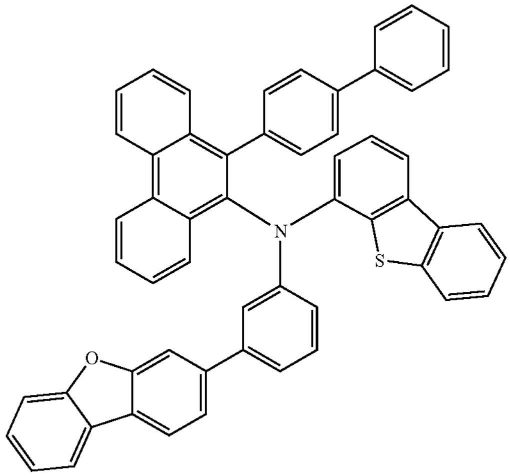
-continued
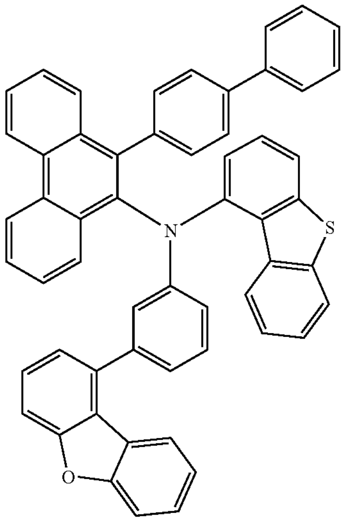
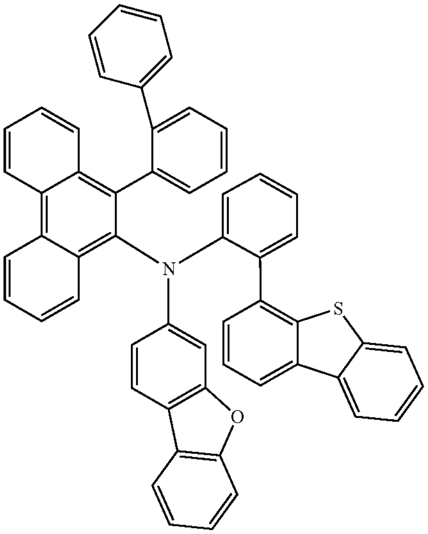
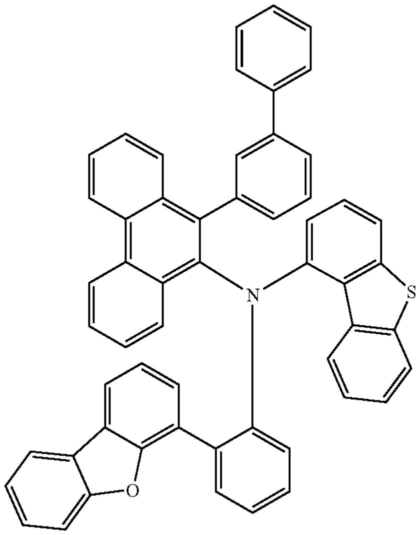

-continued
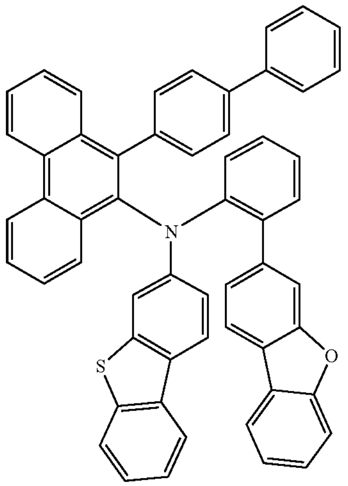
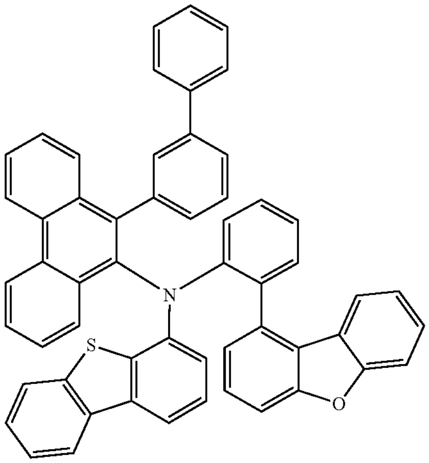
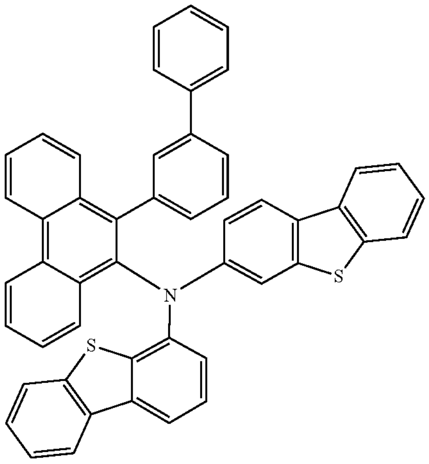
-continued
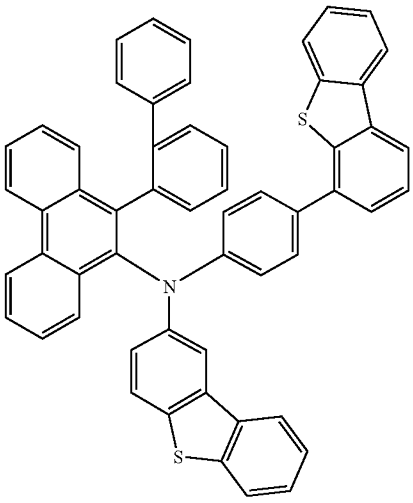
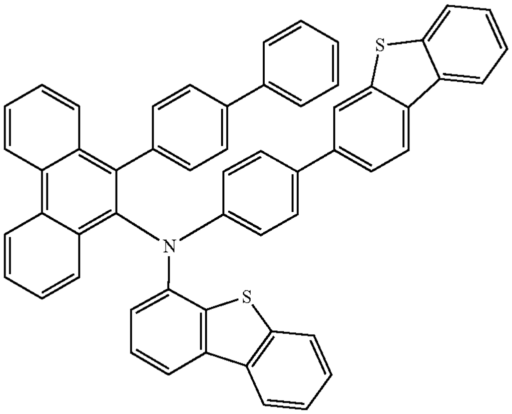
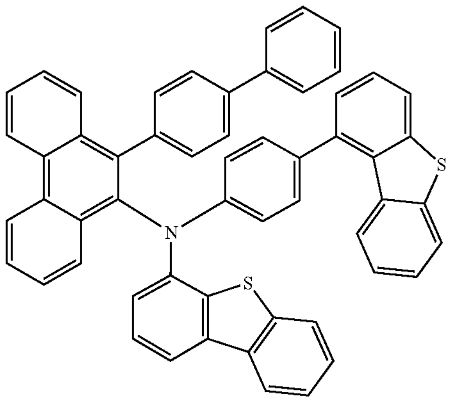

-continued
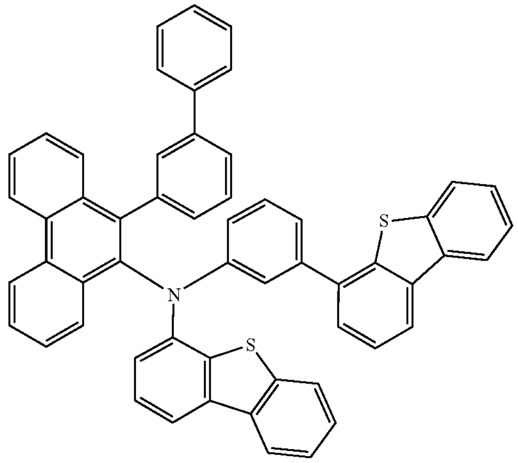
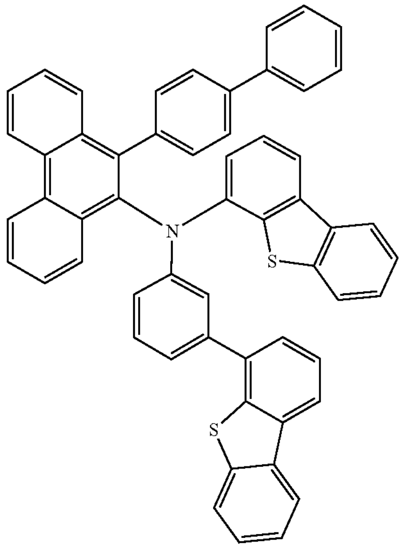
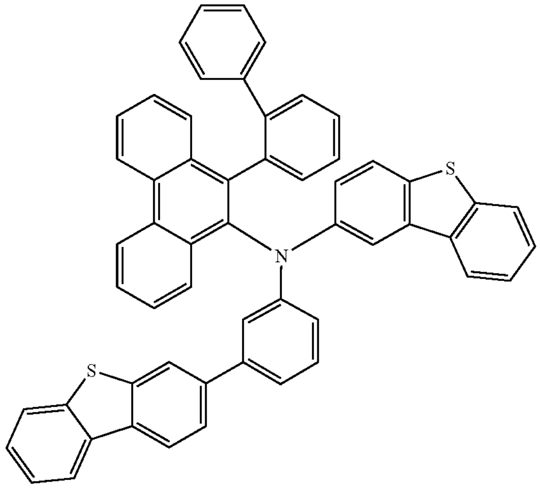
-continued
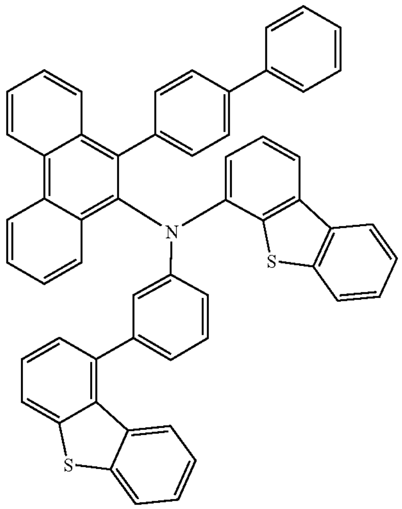
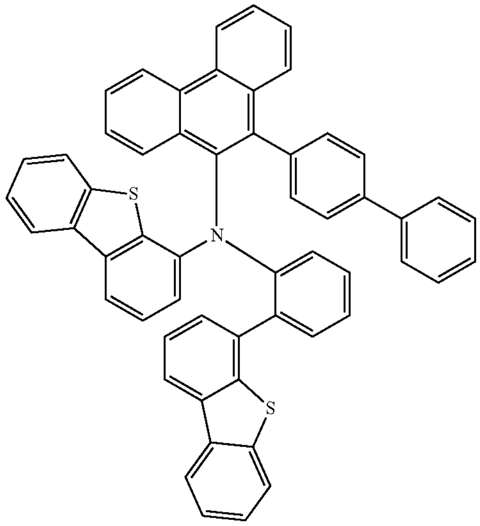
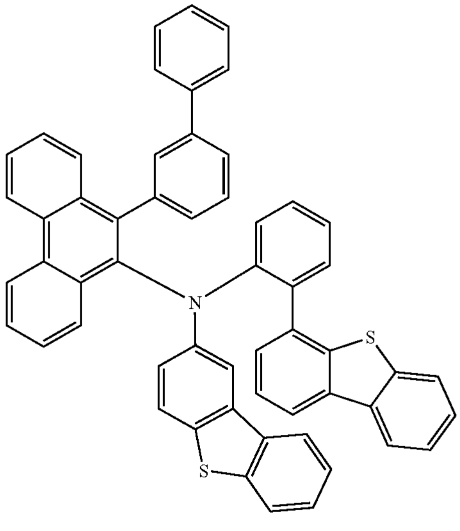

-continued
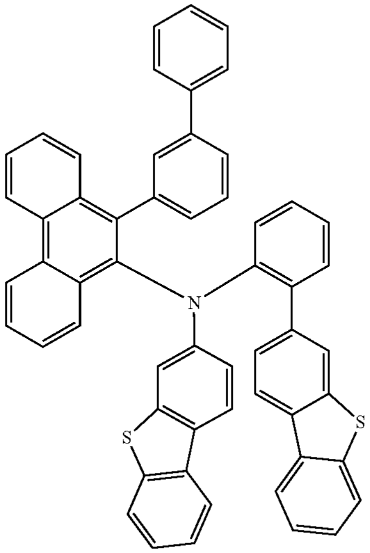
-continued
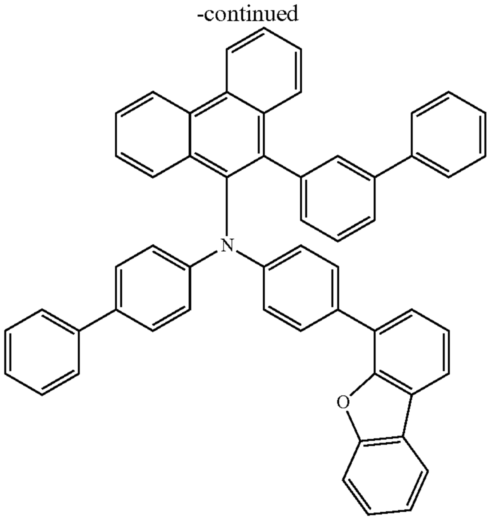
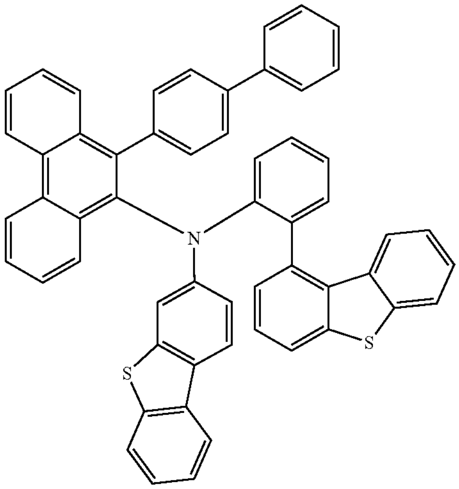 [SMILES: c1ccc(-c2ccc(-c3c(N(c4ccc5c(c4)sc4ccccc45)c4ccccc4-c4cccc5sc6ccccc6c45)c4ccccc4c4ccccc34)cc2)cc1]
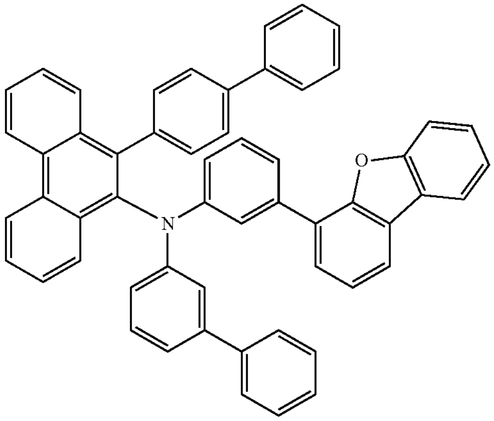
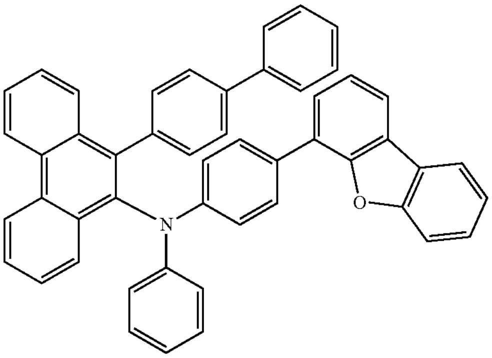
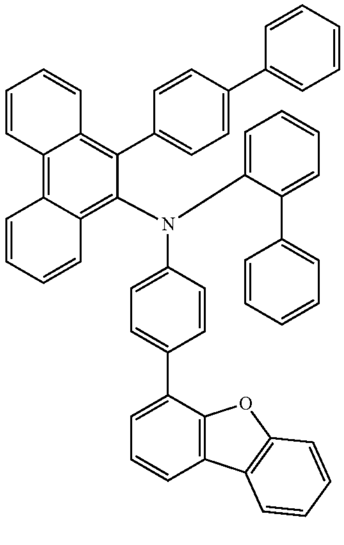

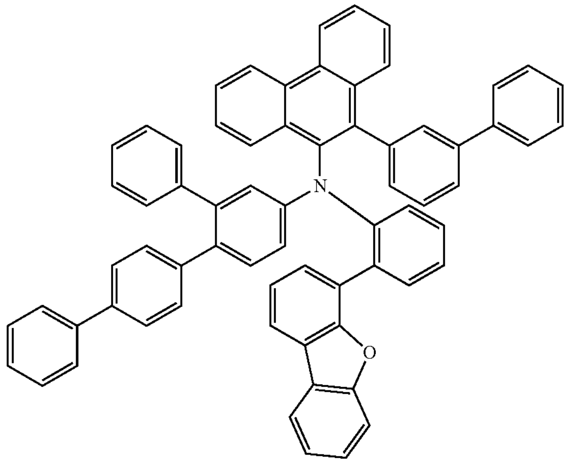
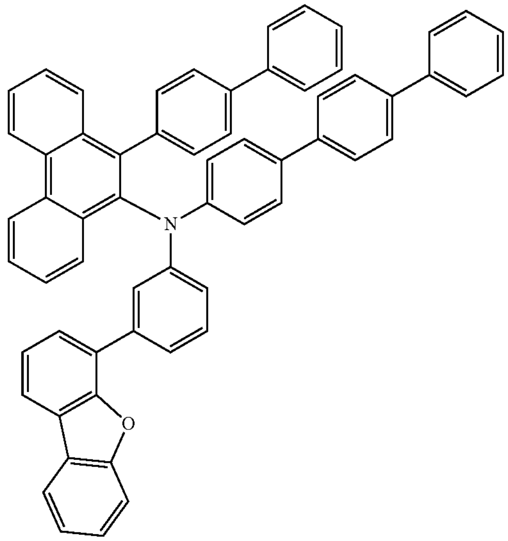
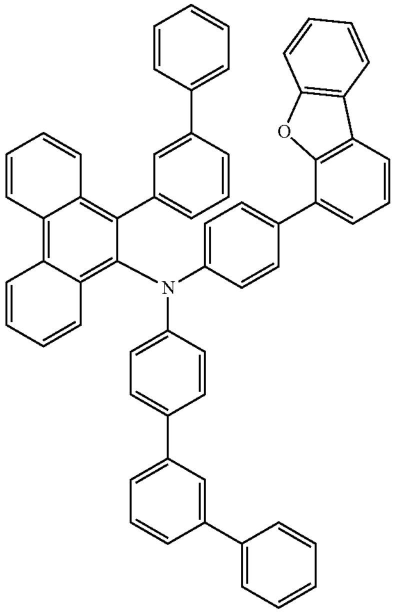
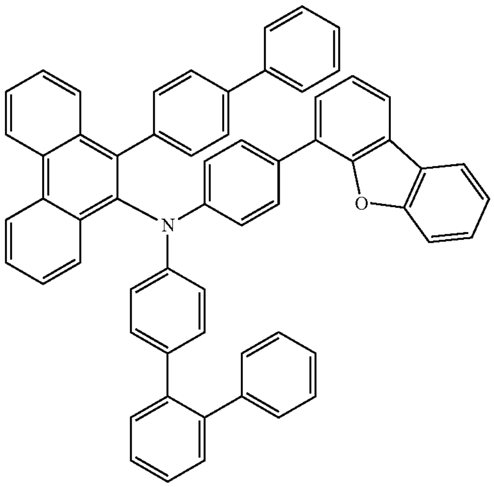
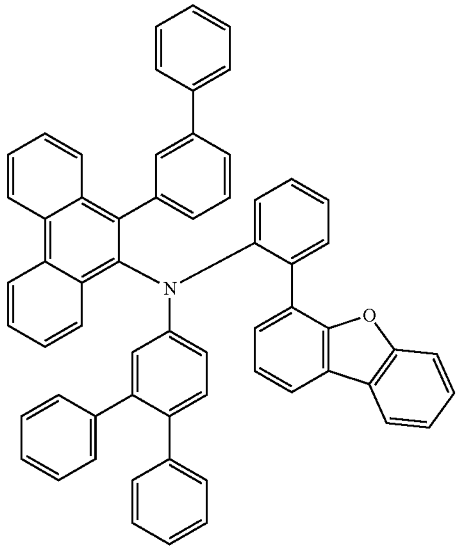
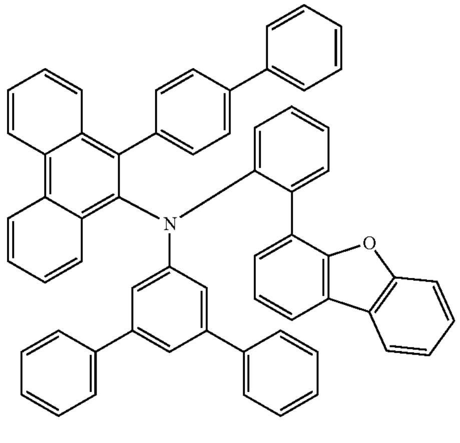

-continued
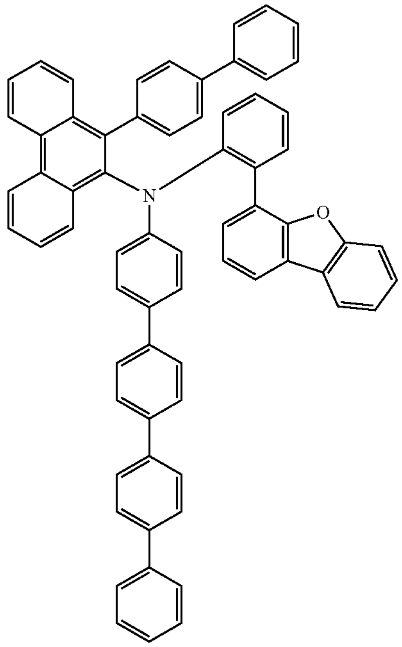
-continued
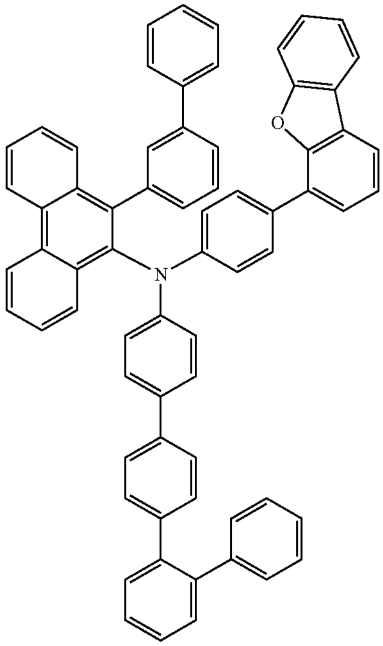
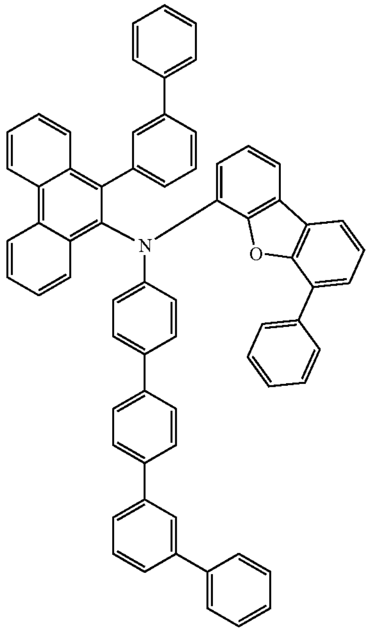
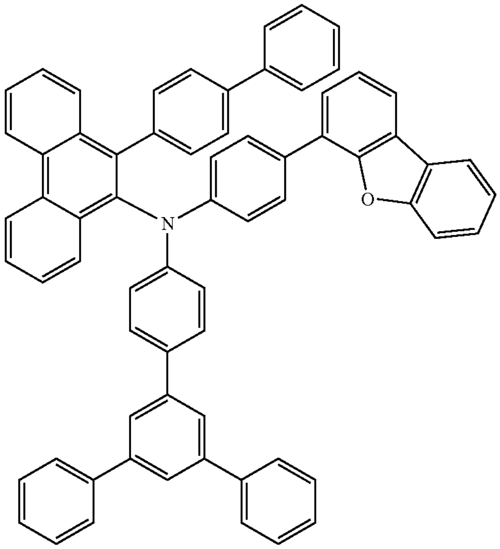

-continued
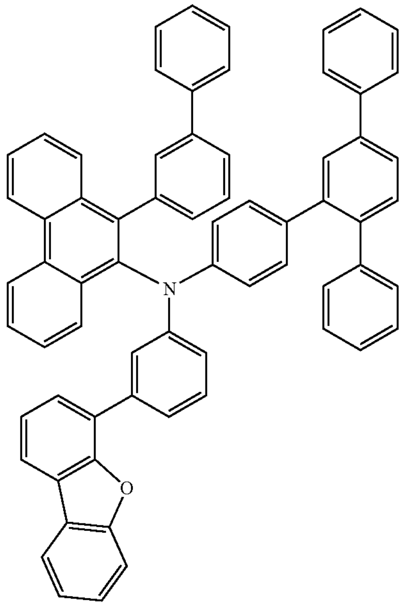
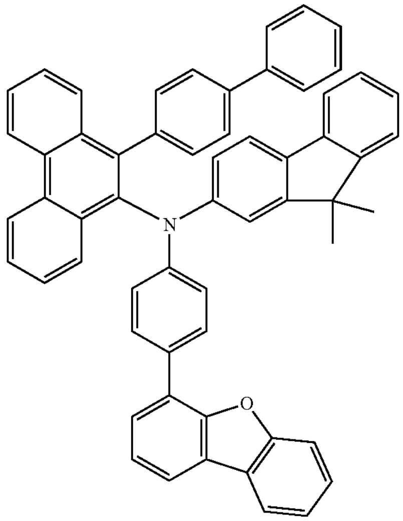
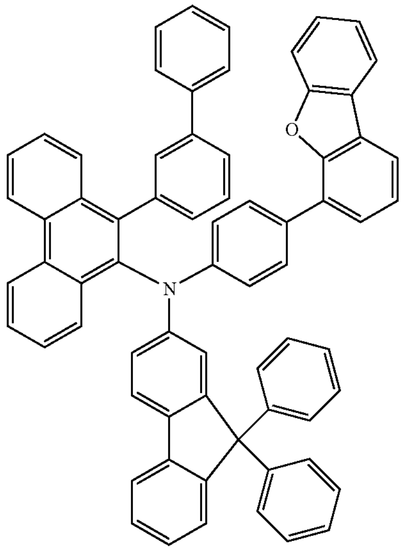
-continued
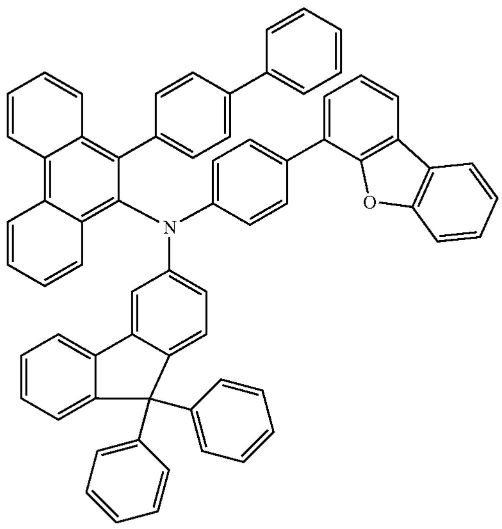
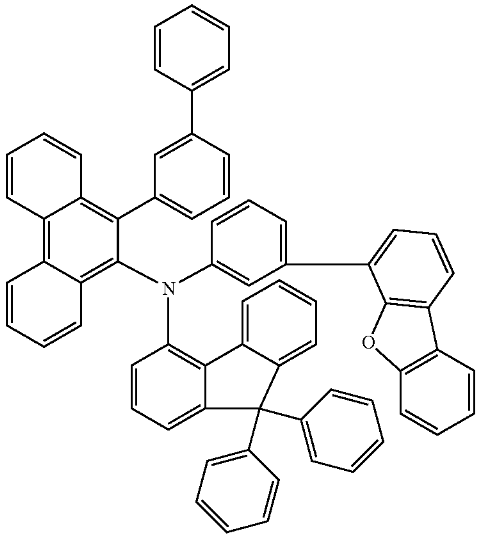
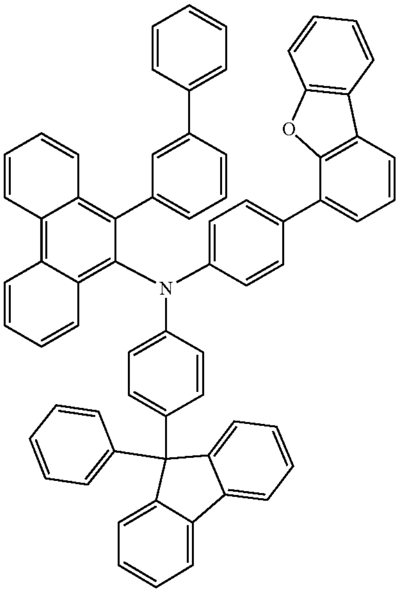

-continued
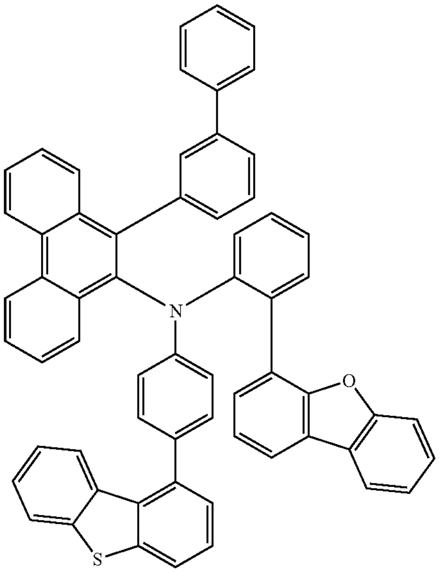
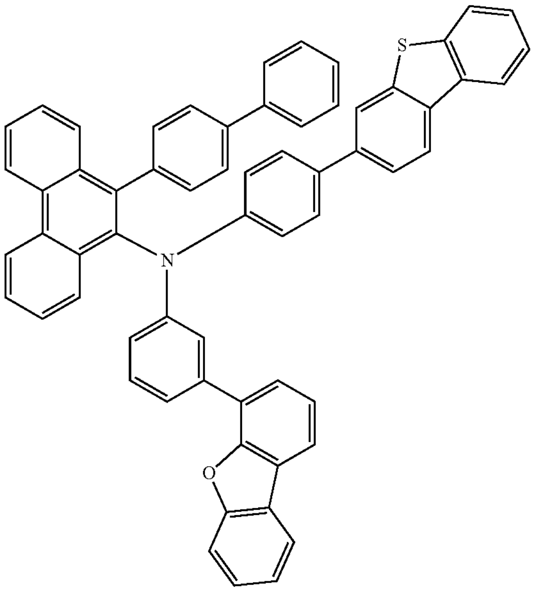
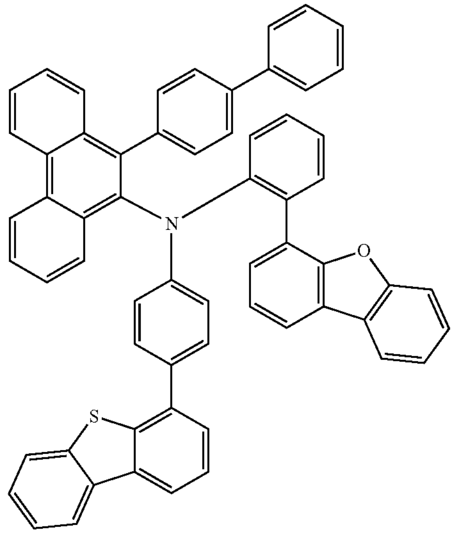
-continued
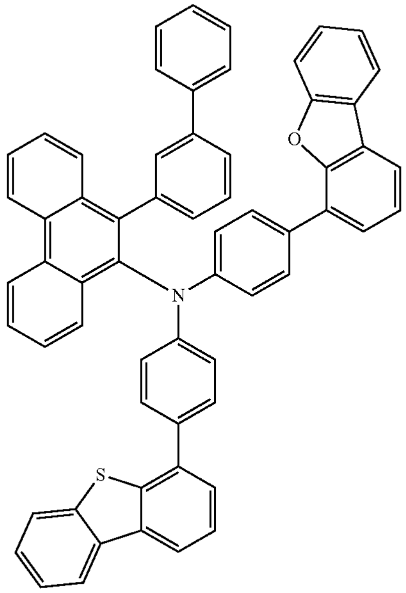
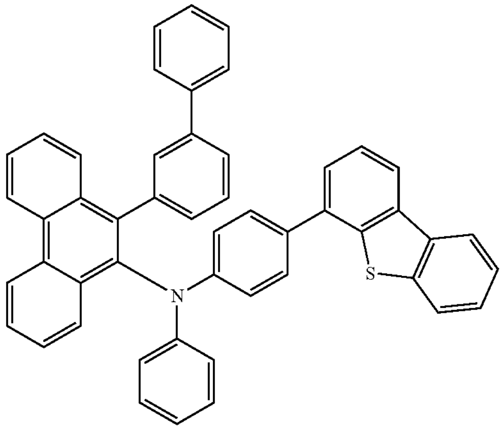
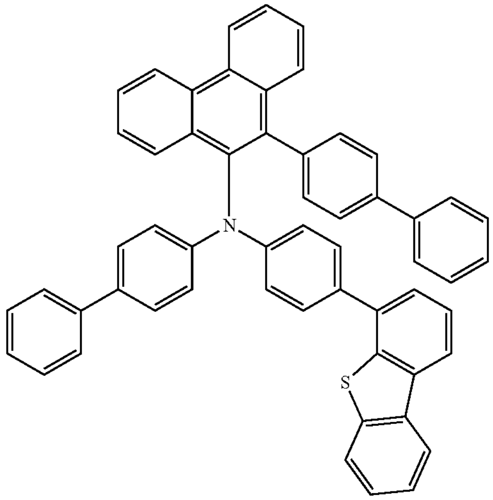

-continued
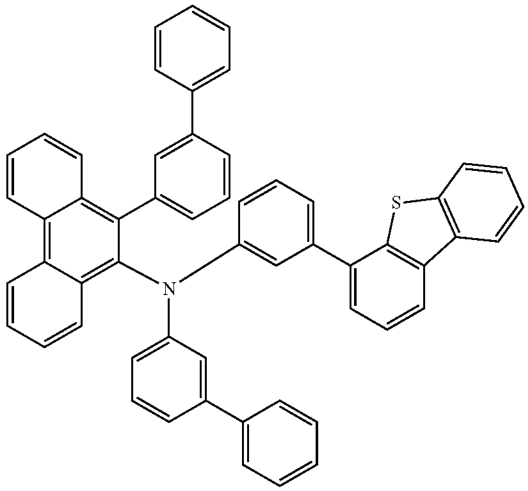
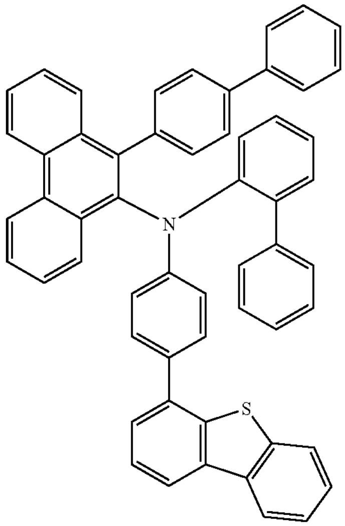
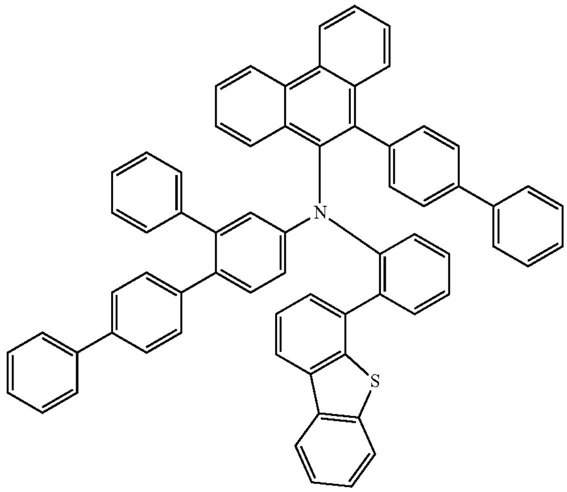
-continued
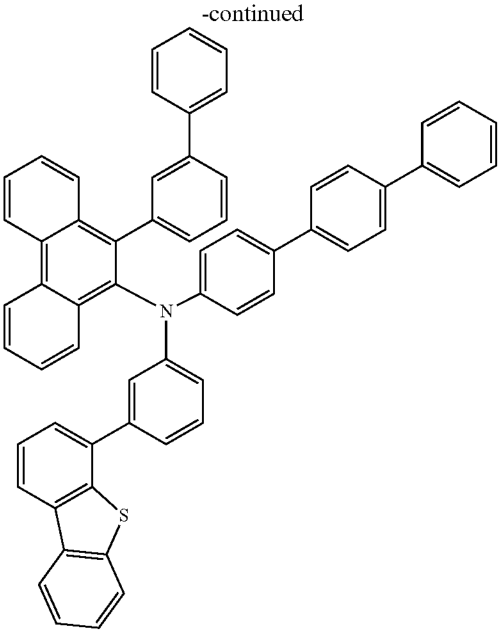
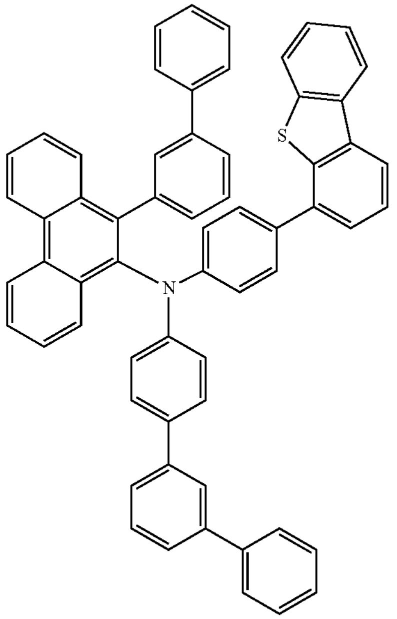
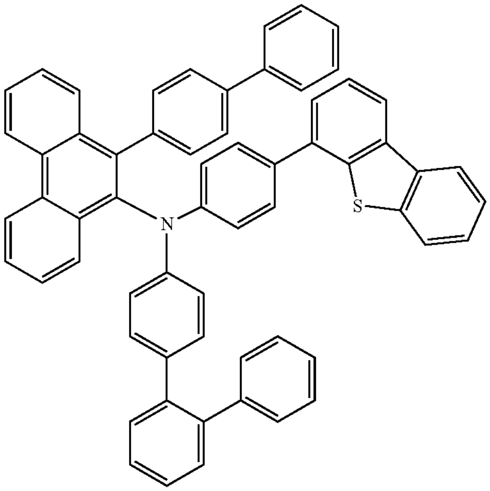

-continued
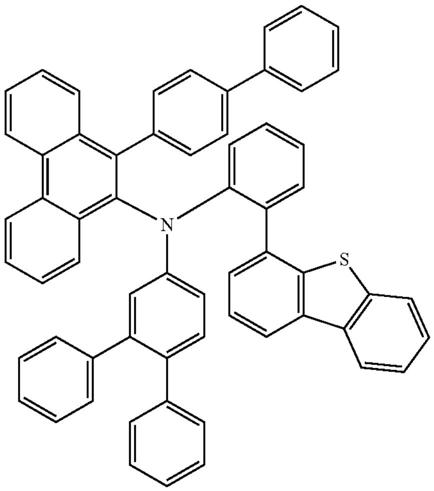
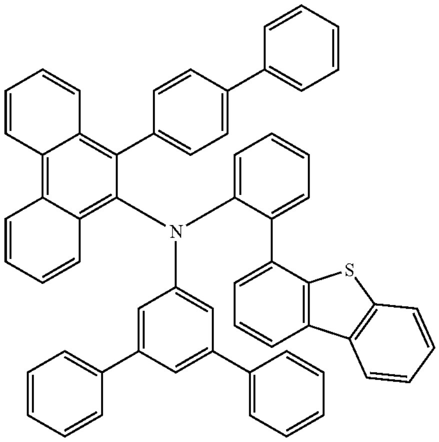
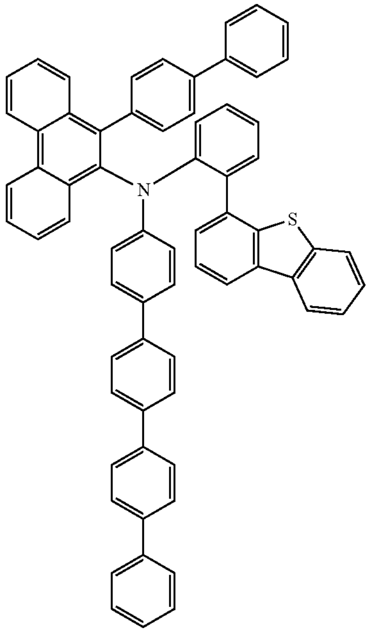
-continued
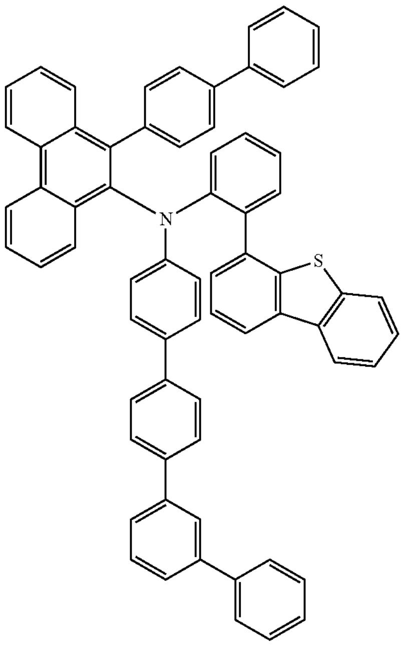
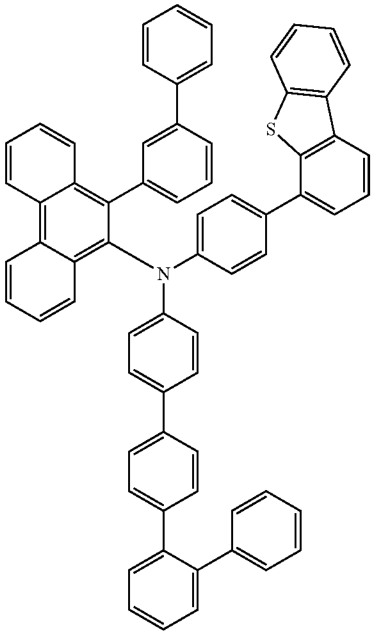

-continued
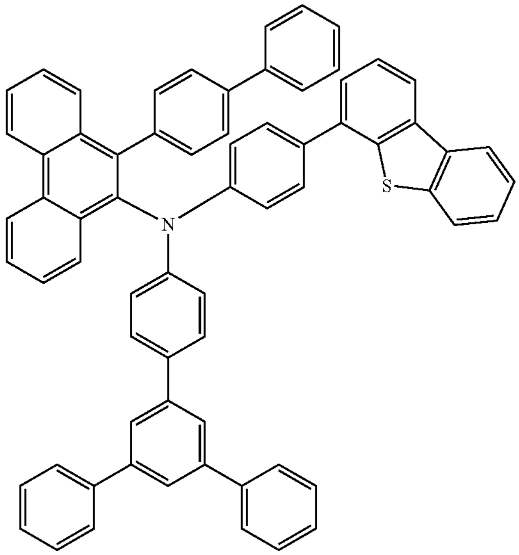
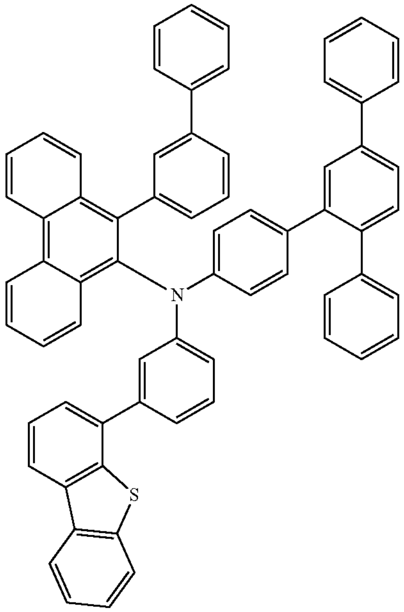
-continued
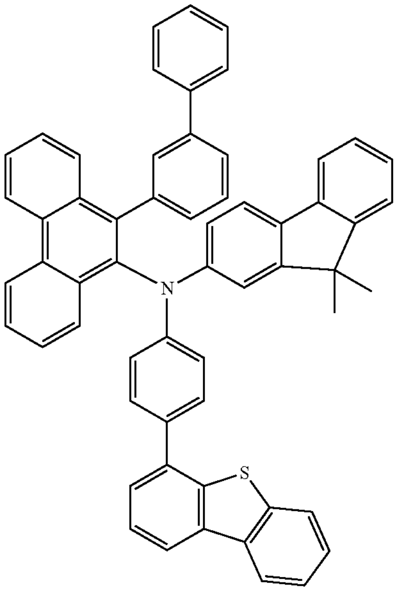
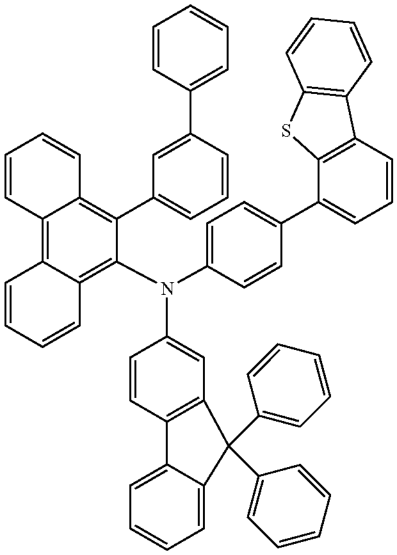

-continued
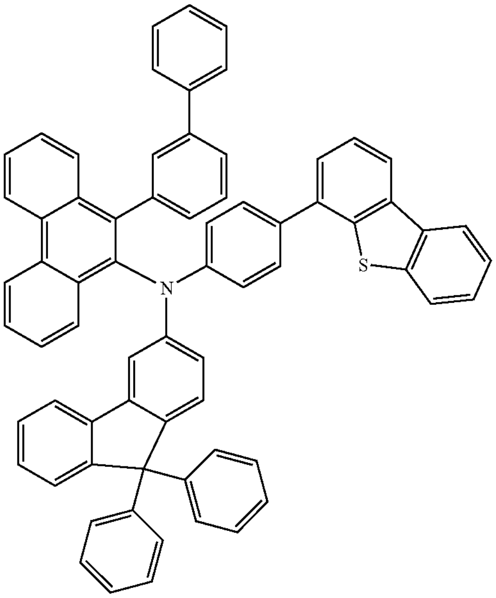
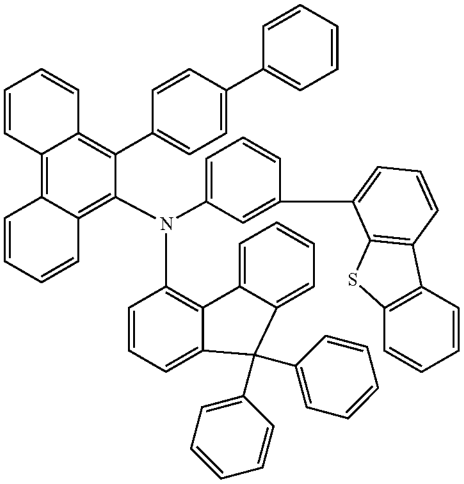
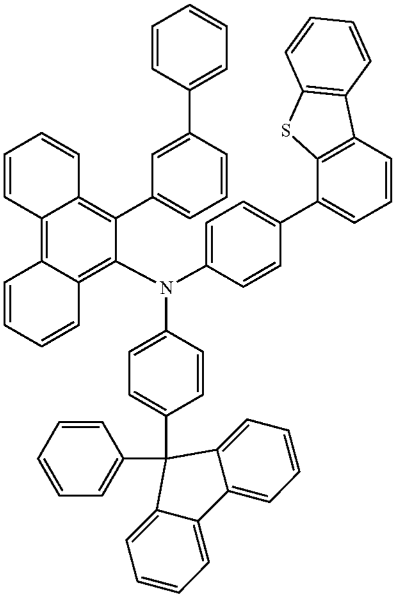
-continued
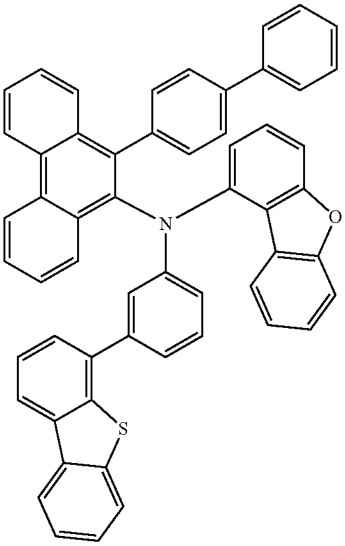
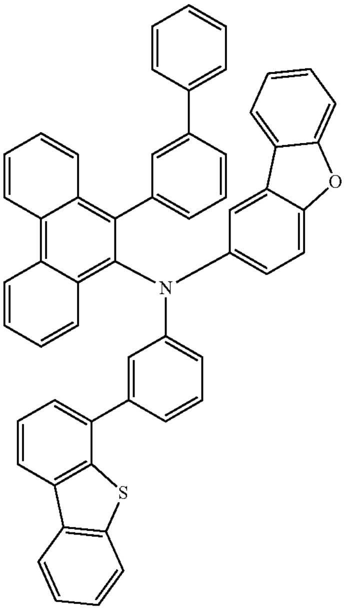
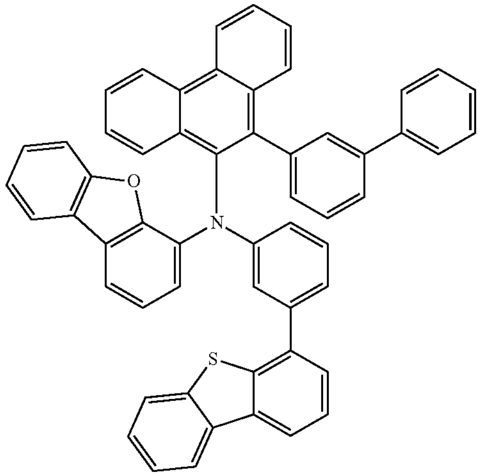

-continued
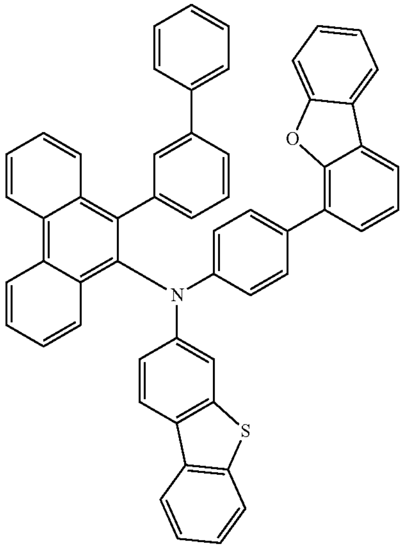
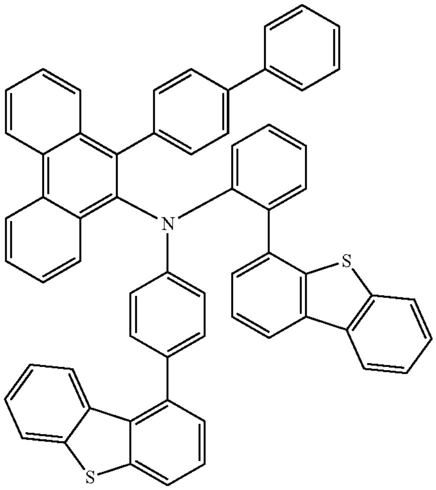
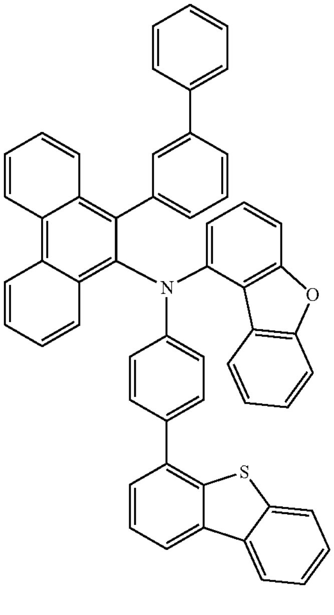
-continued
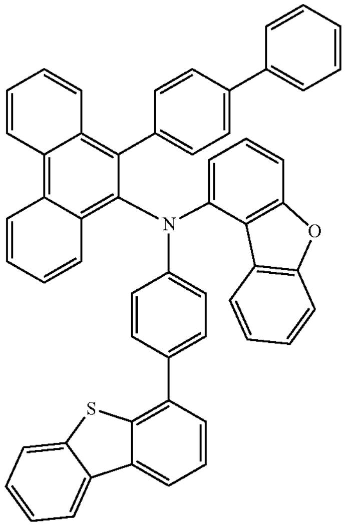
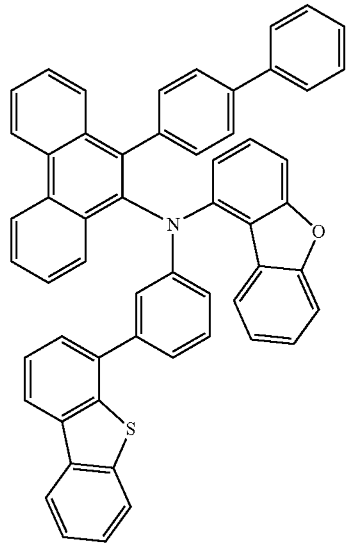
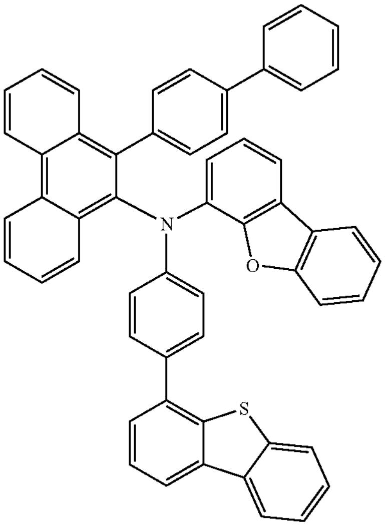

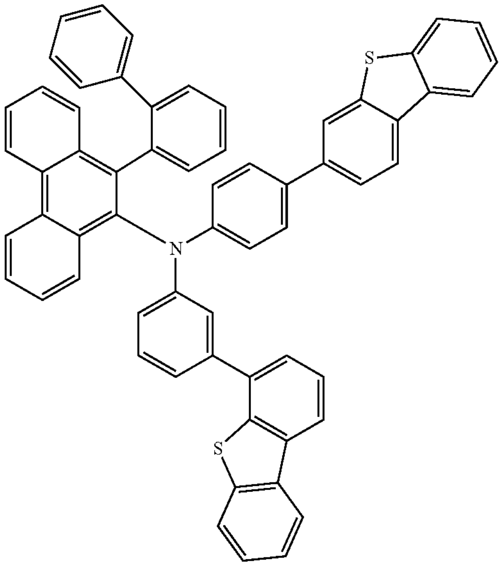
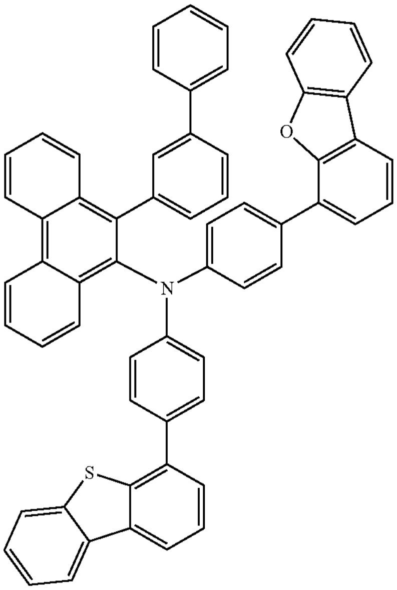
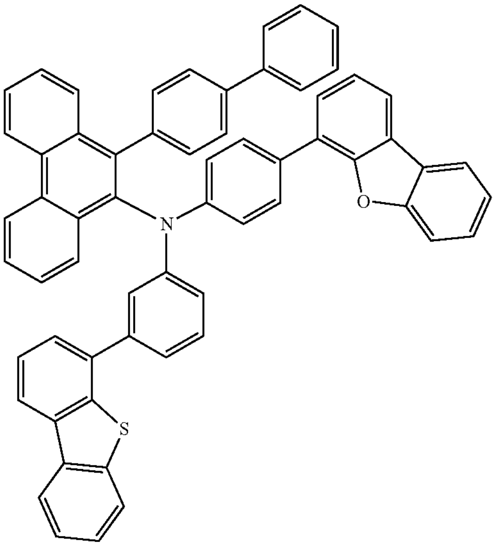
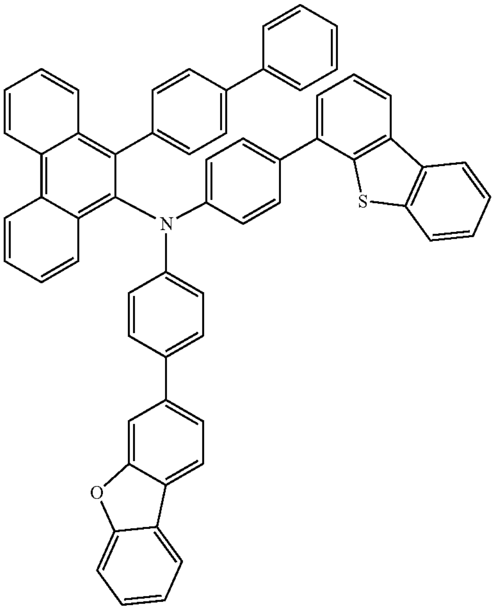
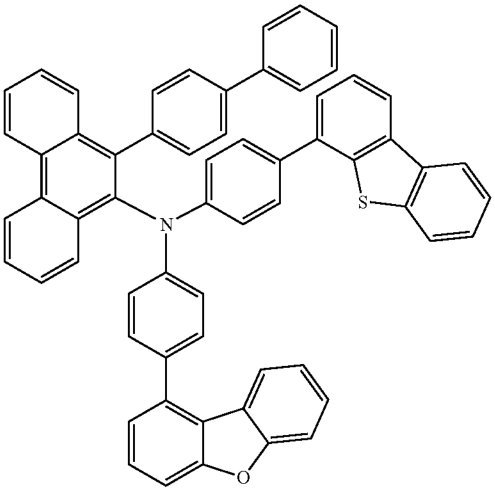
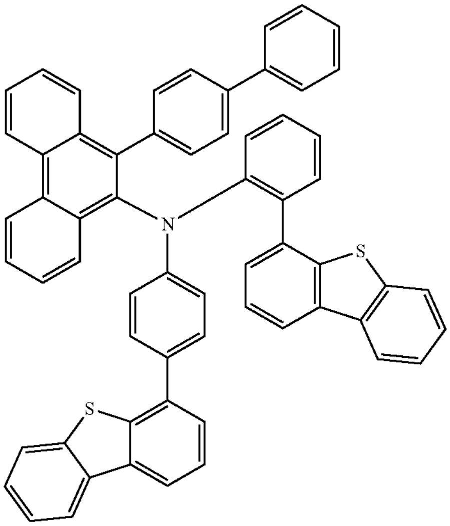

-continued
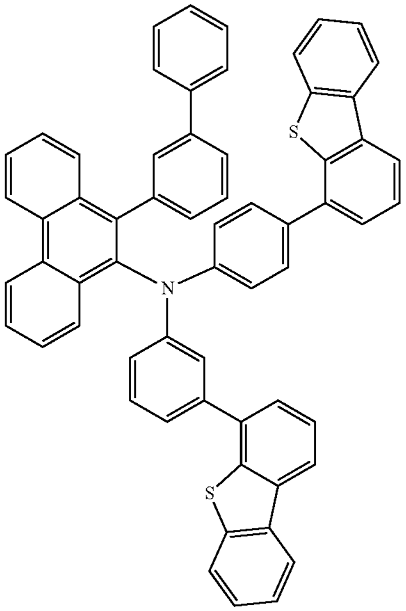
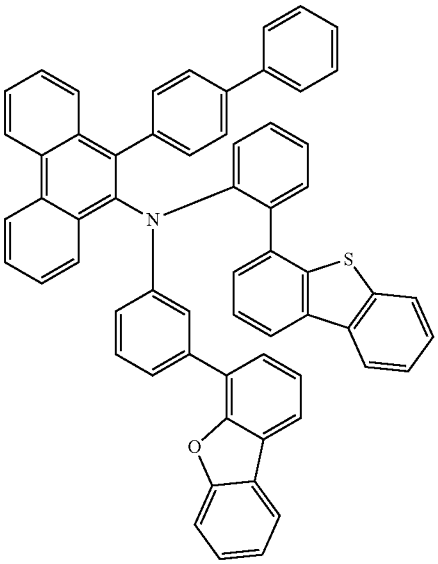
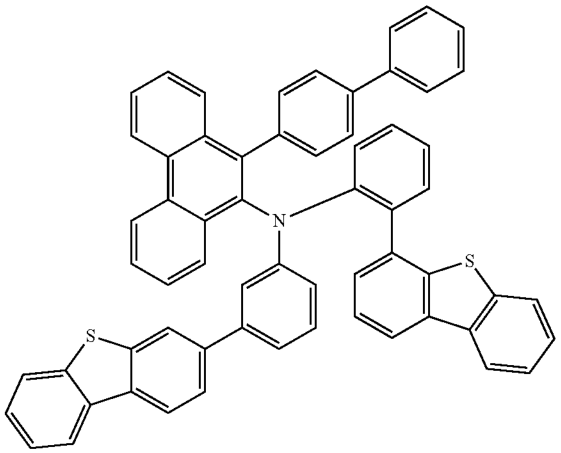
-continued
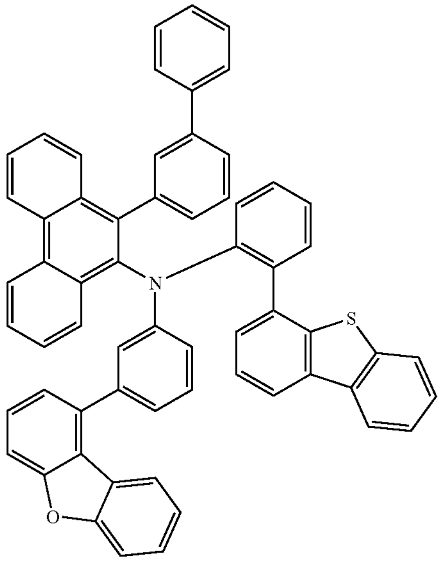
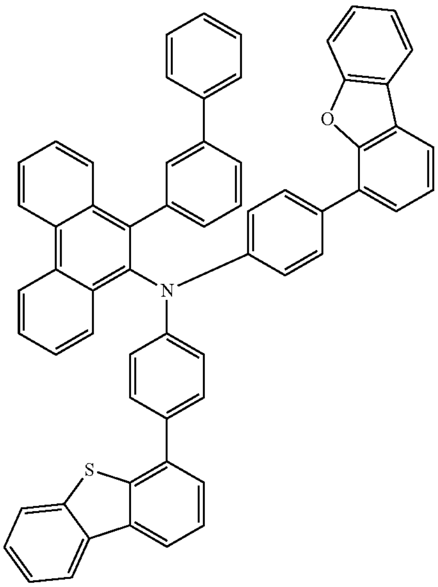
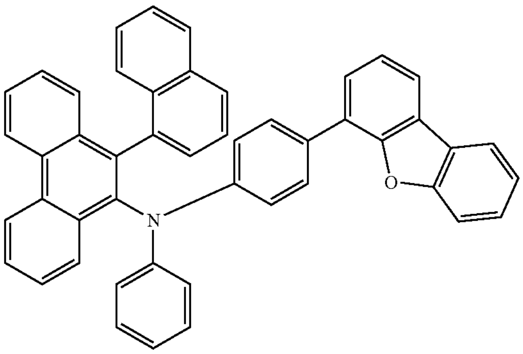

-continued
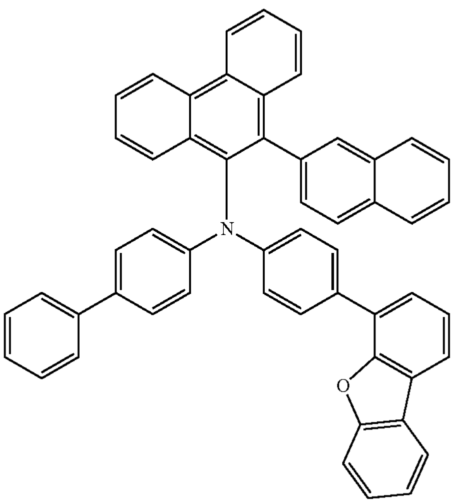
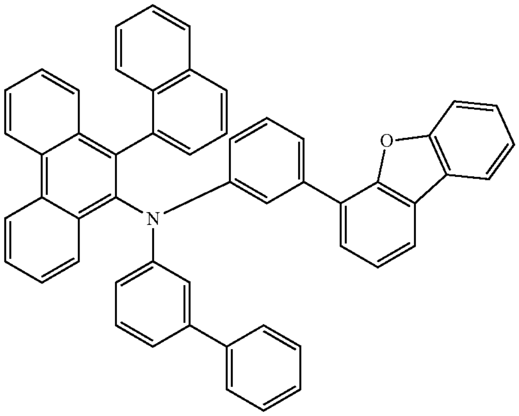
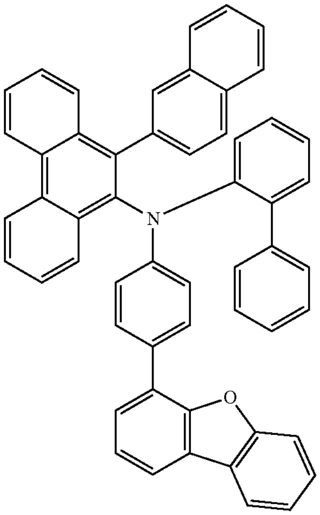
-continued
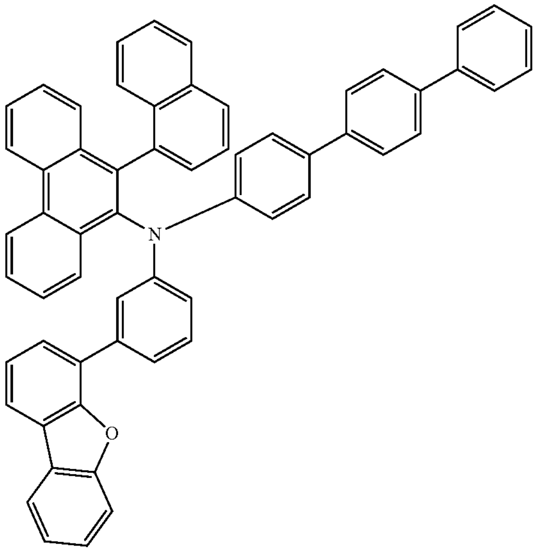
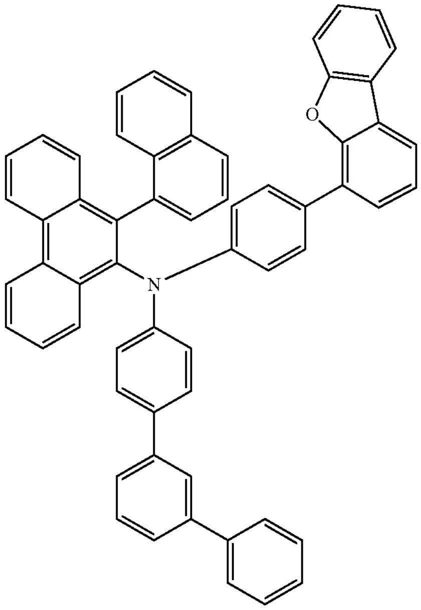
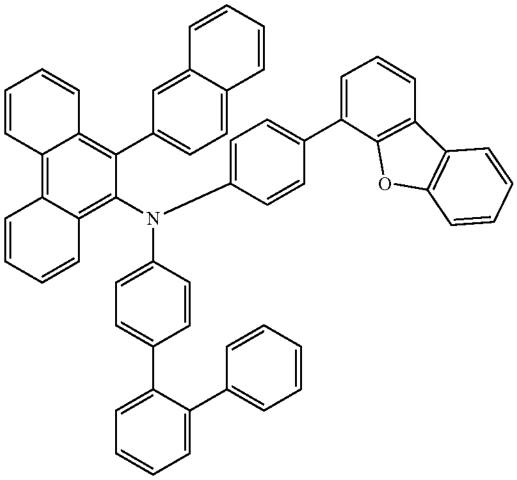

-continued
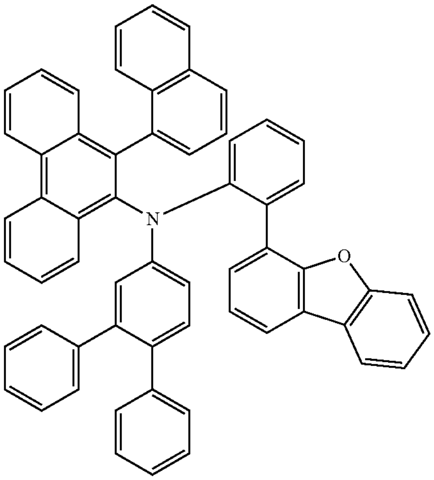
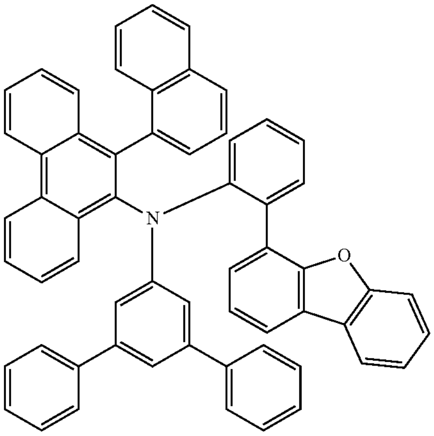
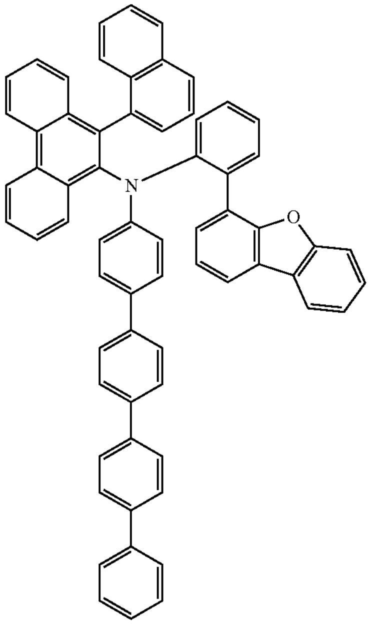
-continued
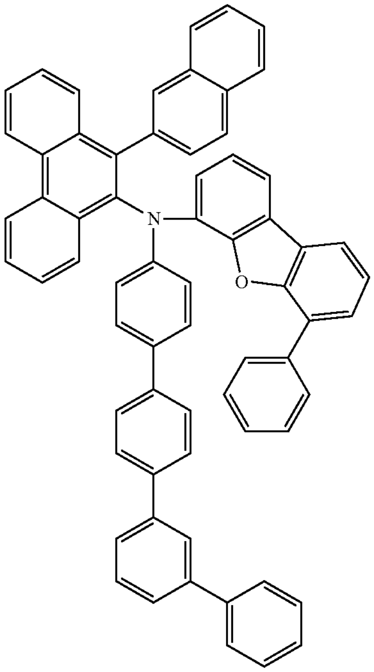
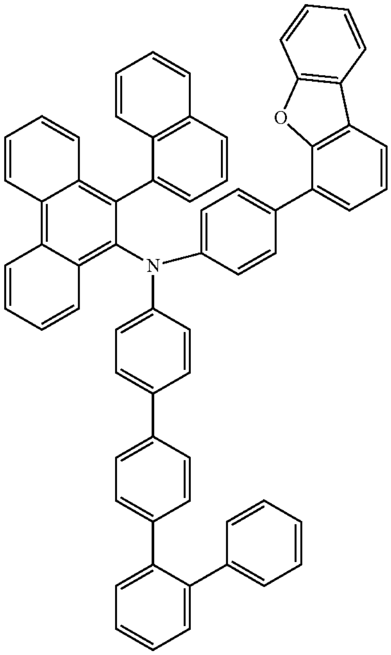

-continued
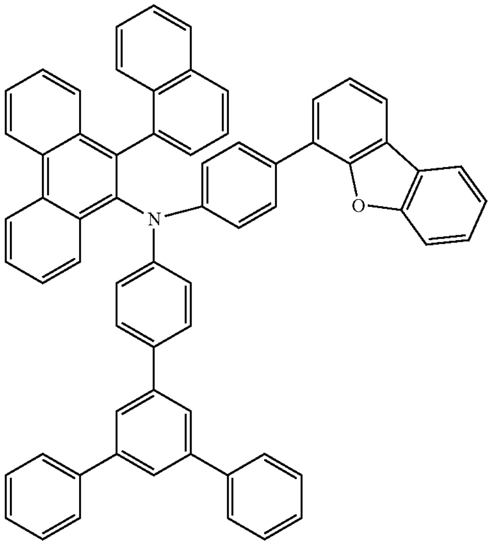
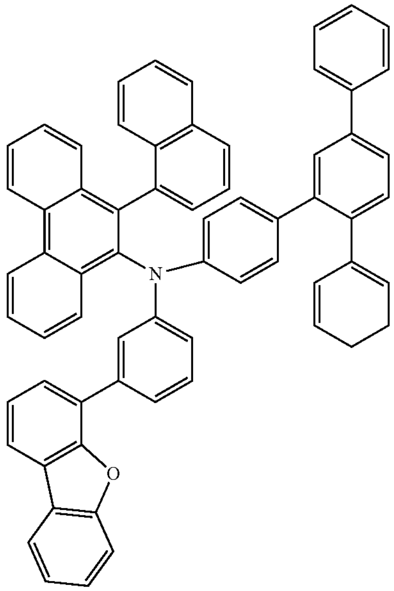
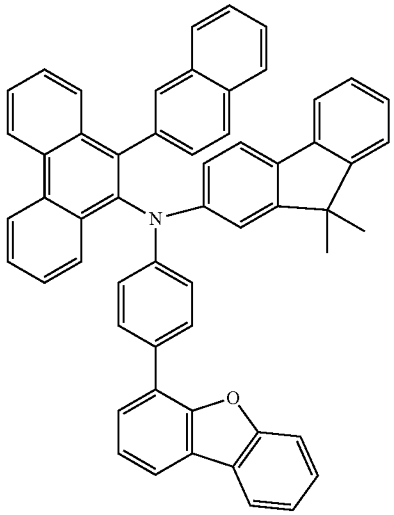
-continued
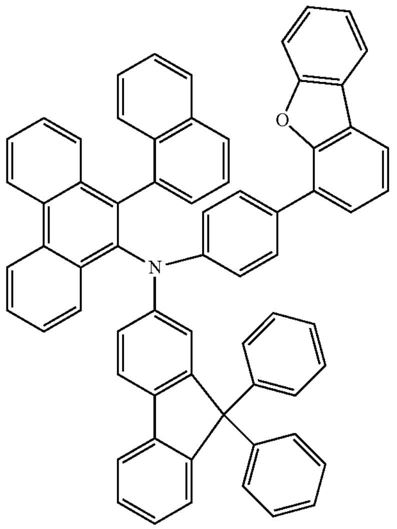
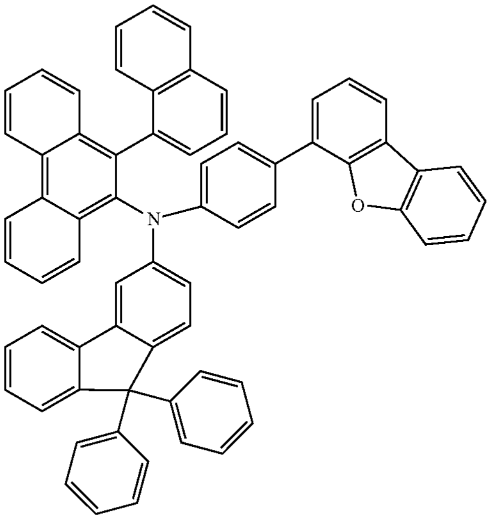
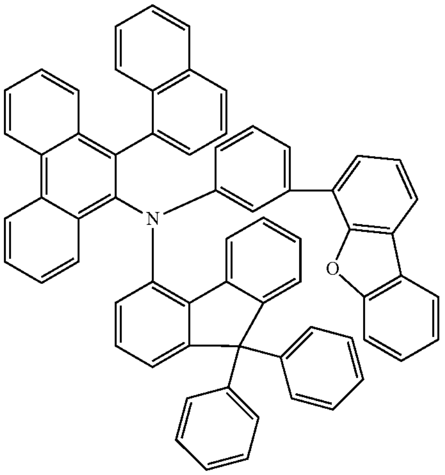

-continued
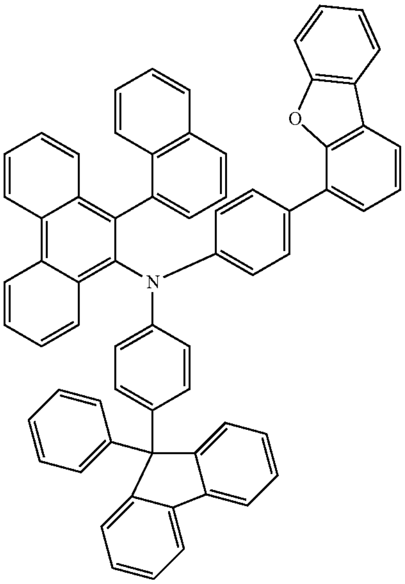
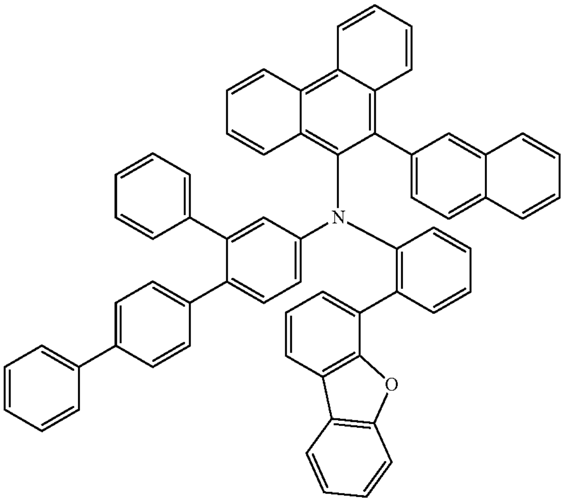
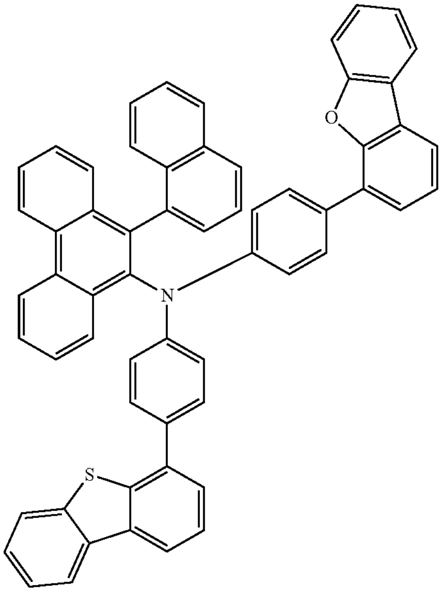
-continued
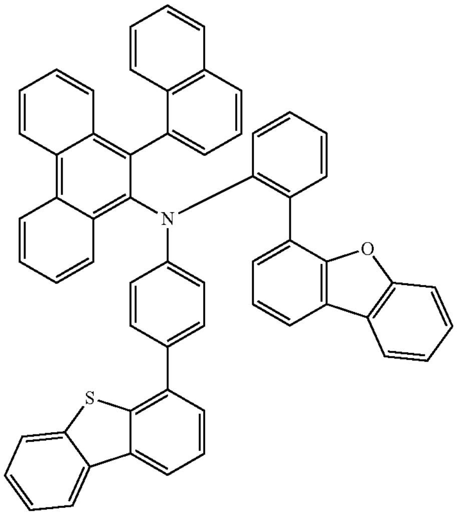
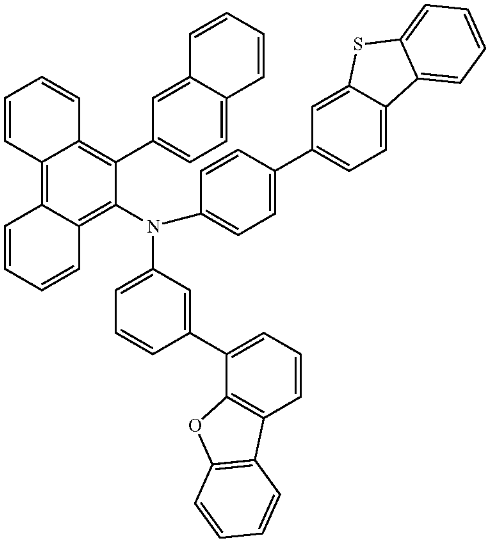
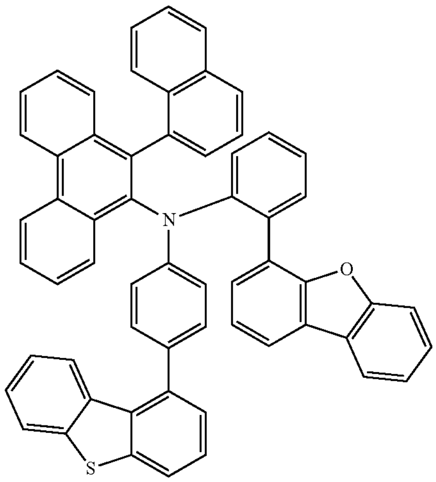

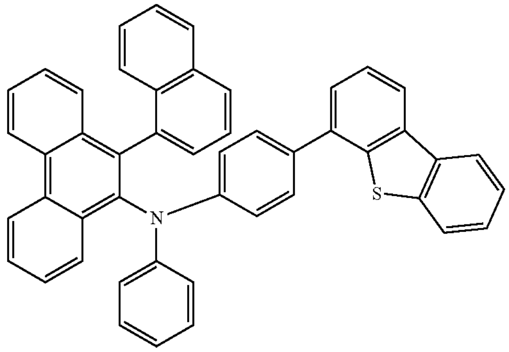
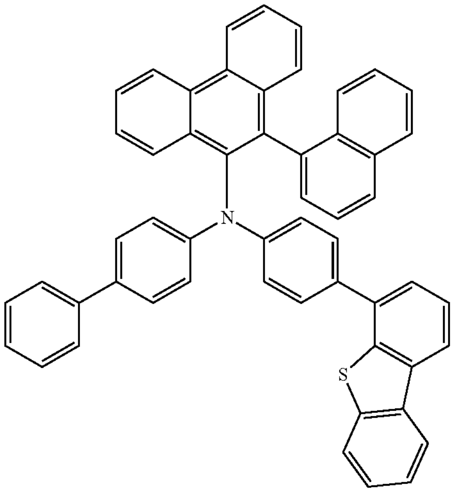
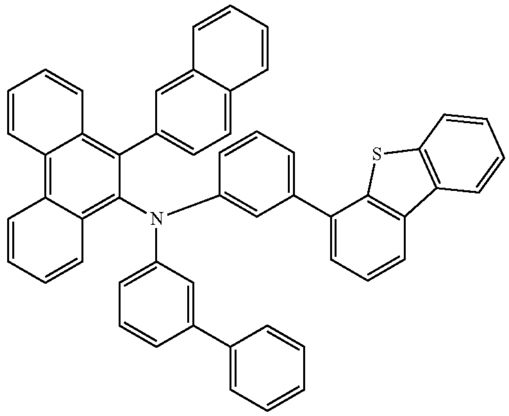
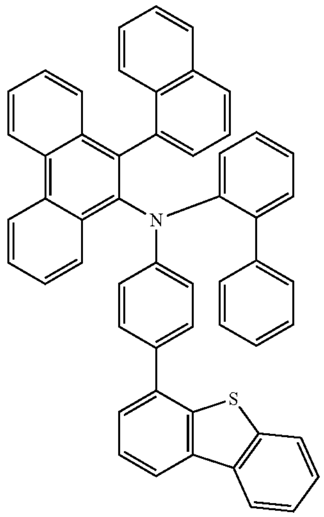
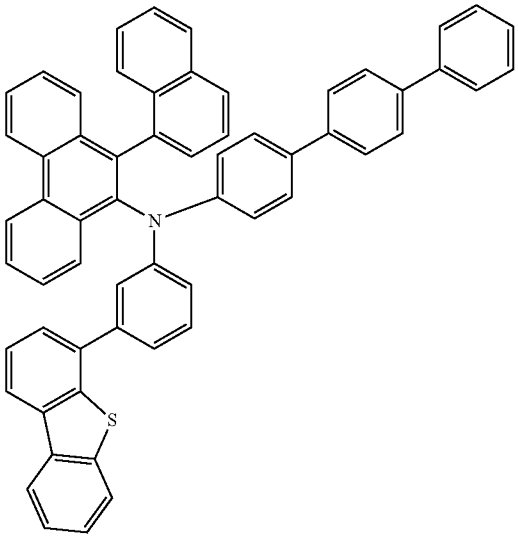
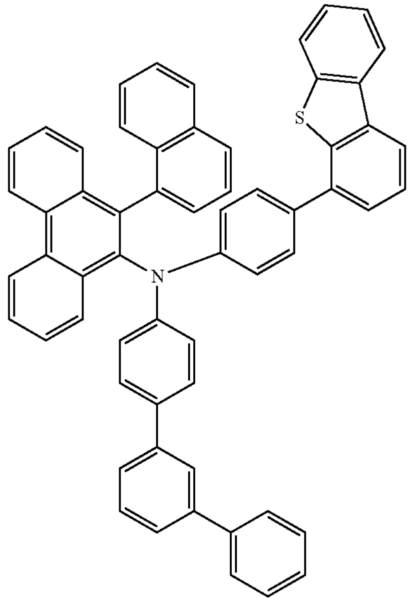

-continued
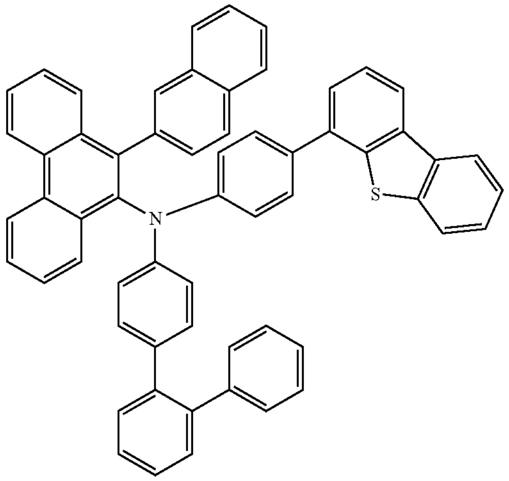
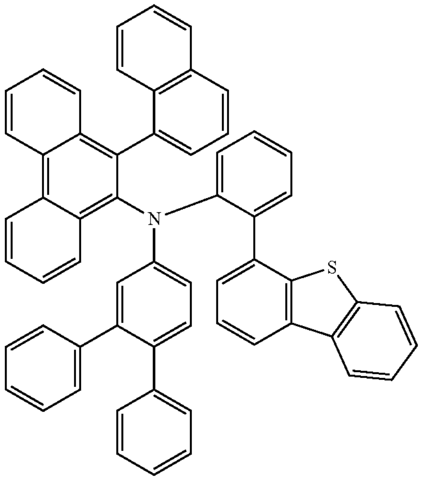
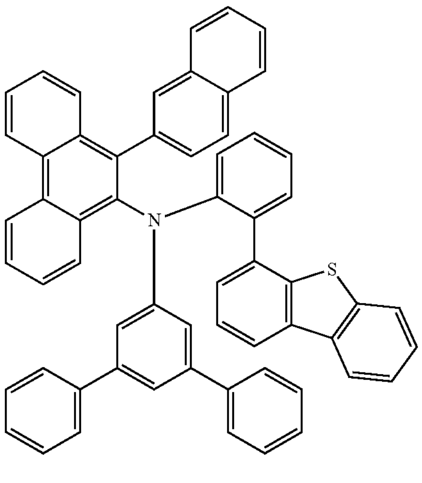
-continued
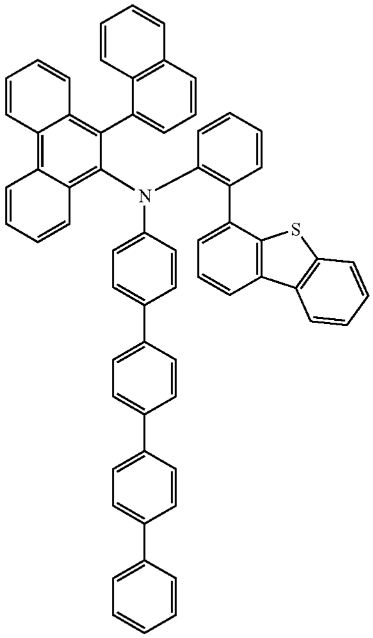
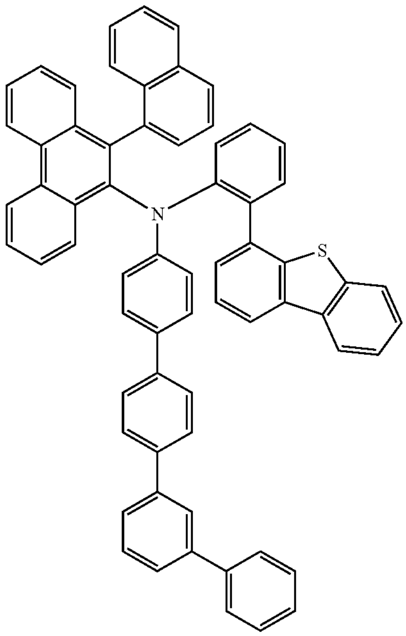

-continued
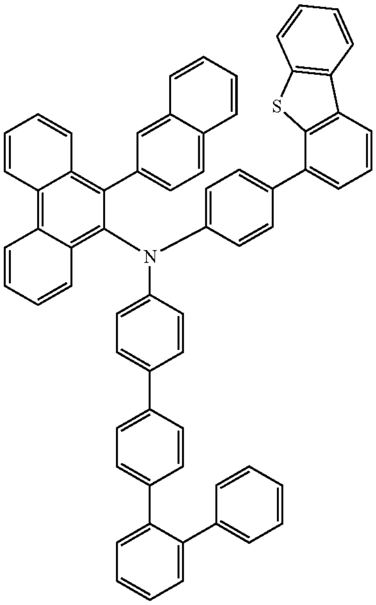
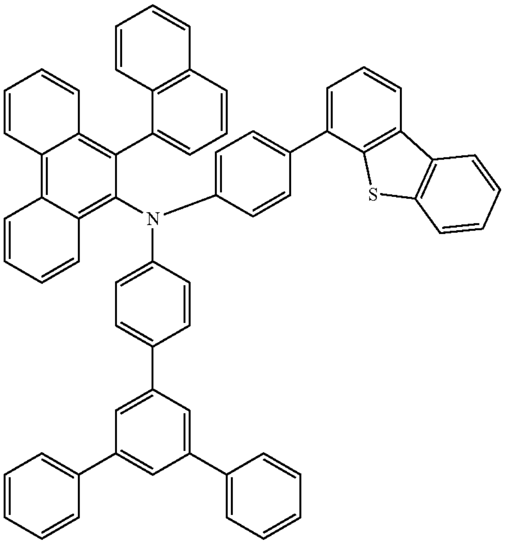
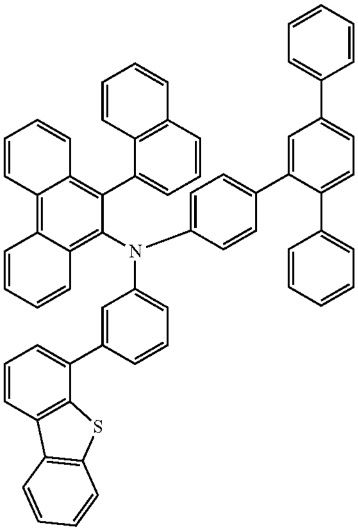
-continued
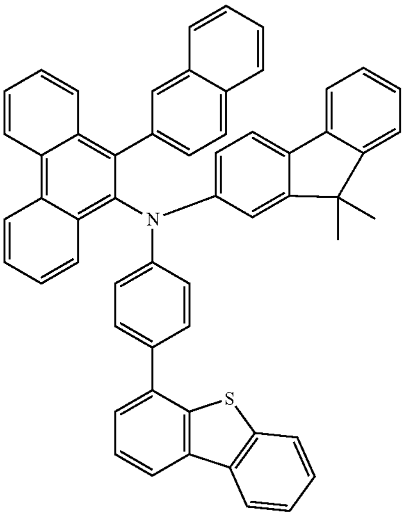
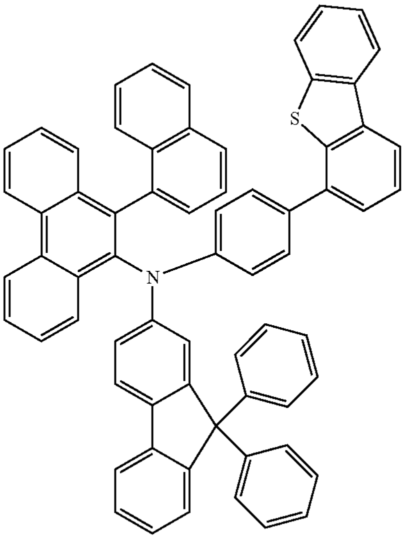
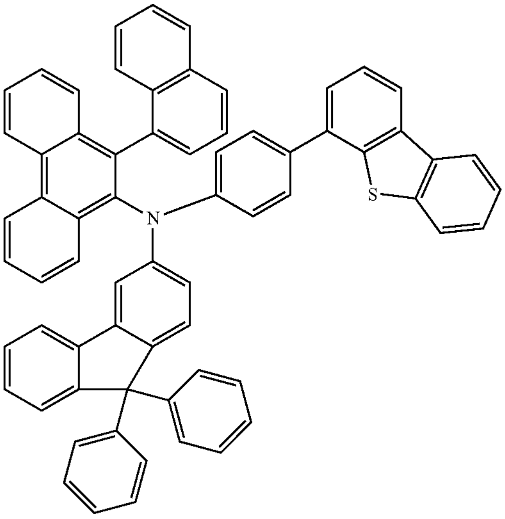

-continued
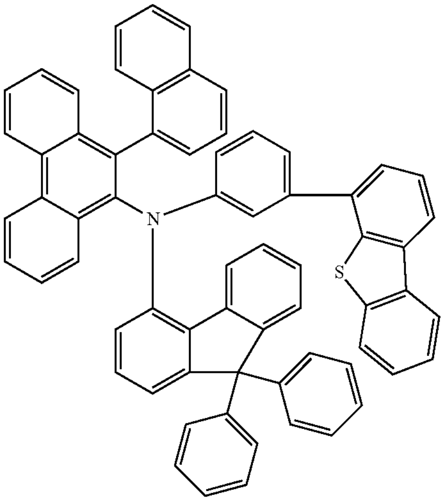
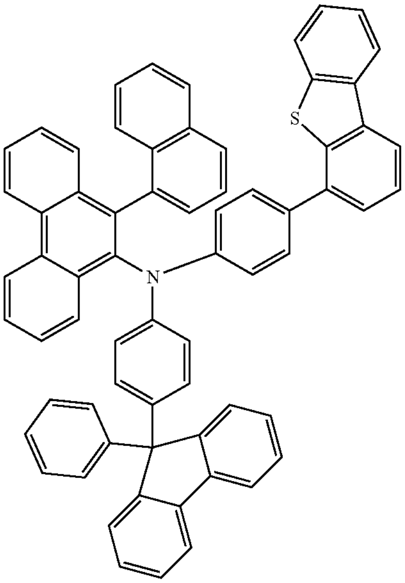
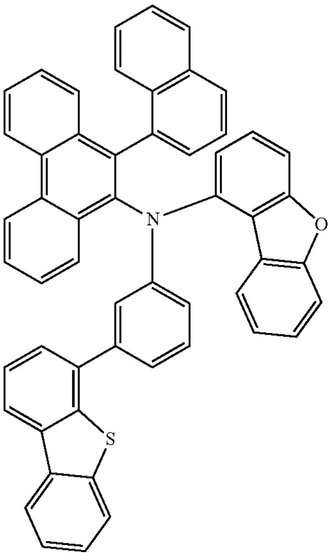
-continued
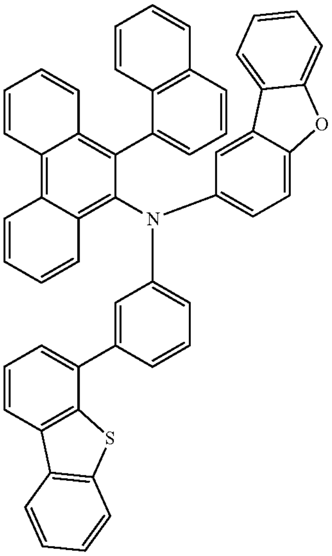
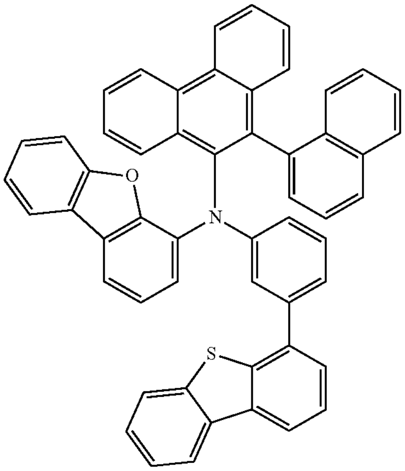
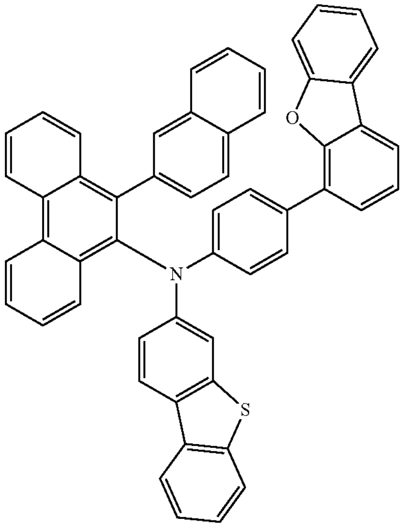

-continued
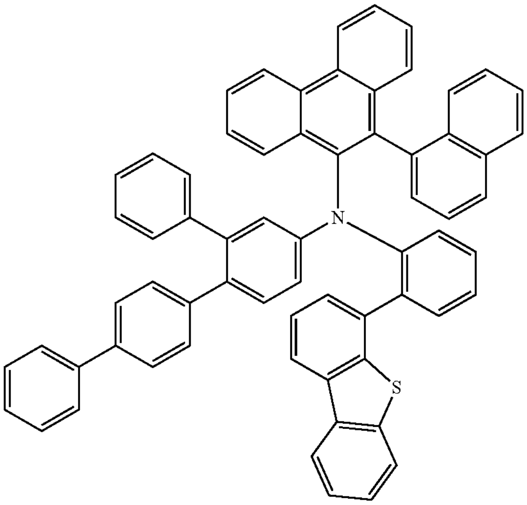
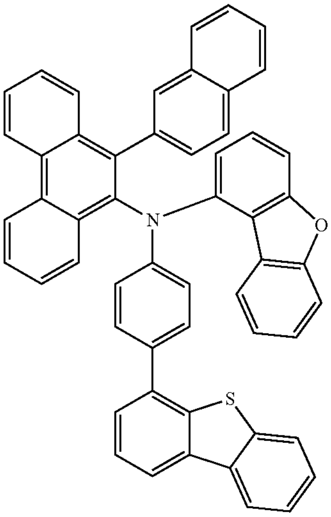
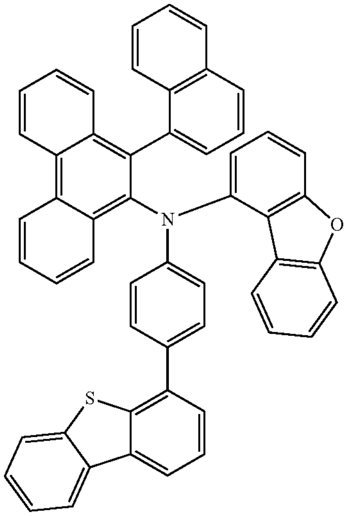
-continued
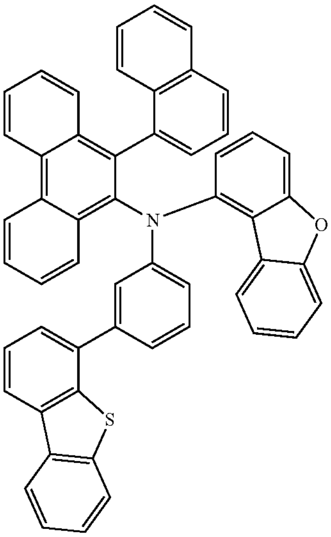
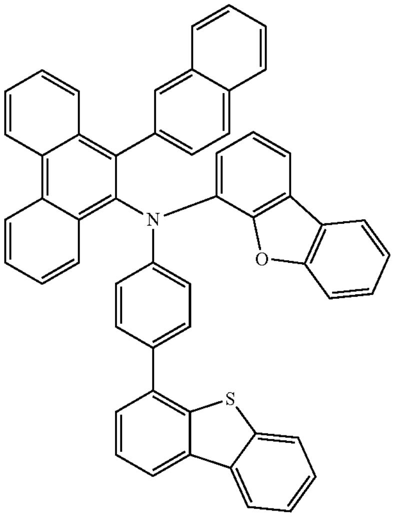
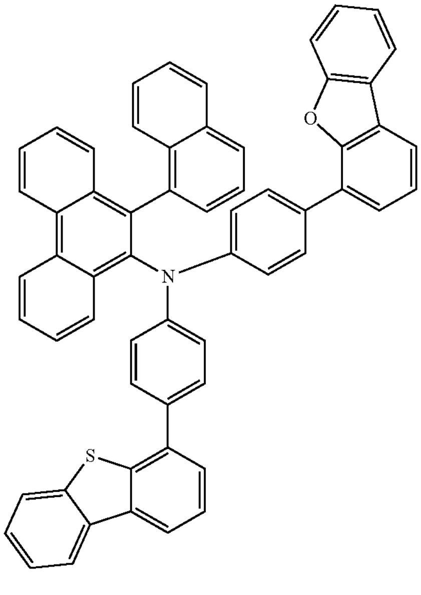

-continued
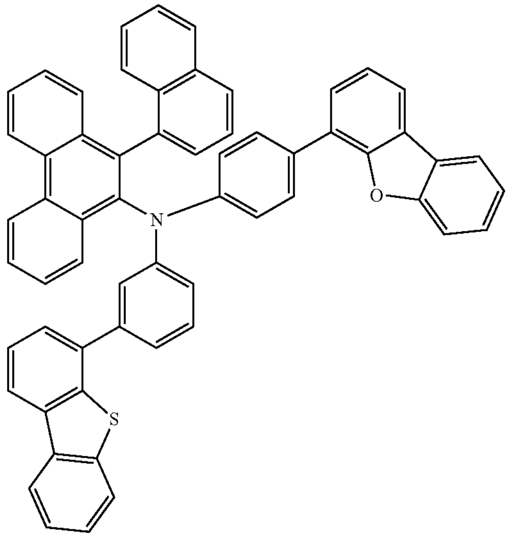
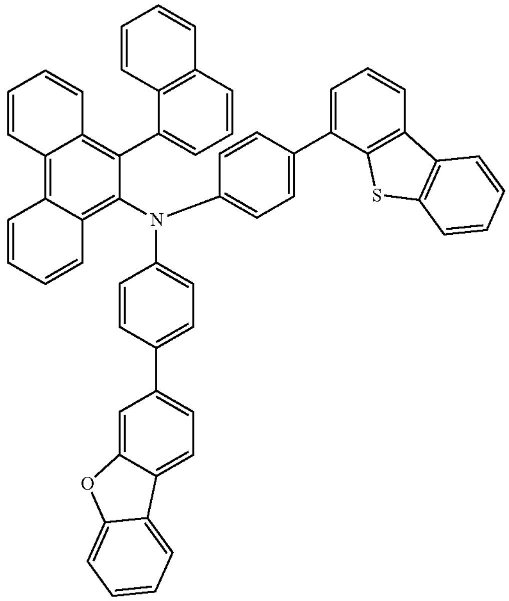
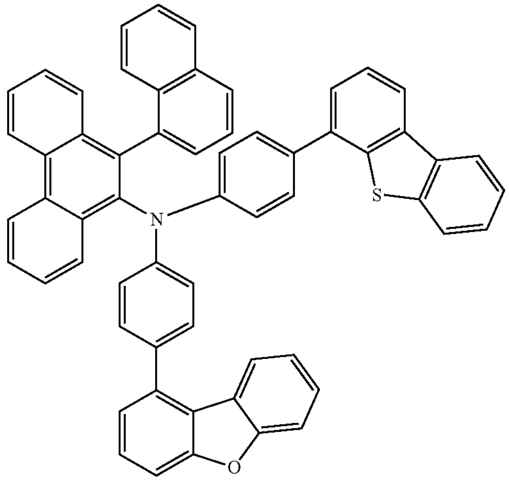
-continued
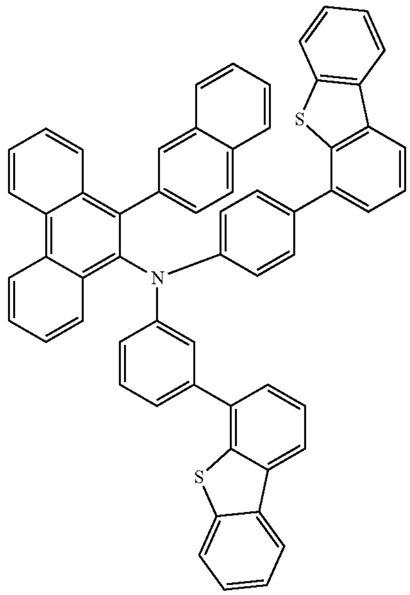
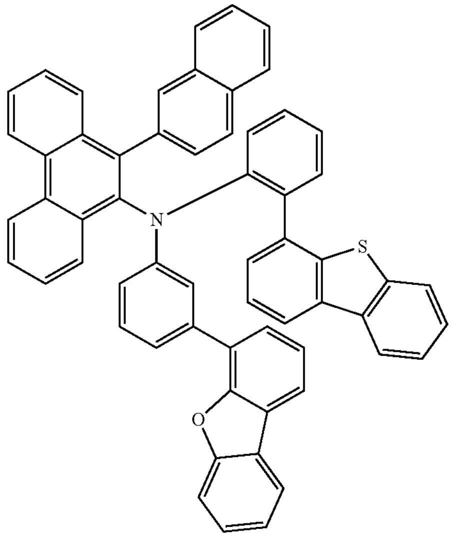
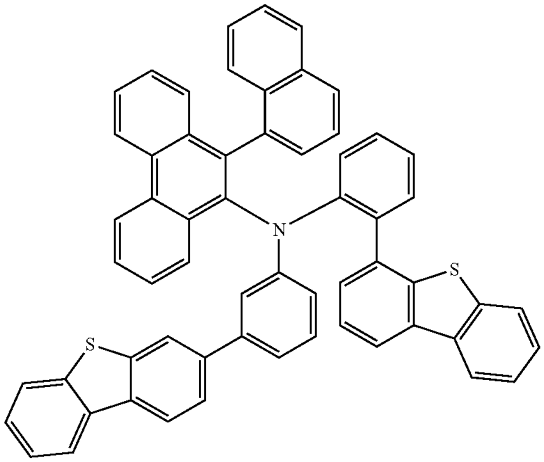

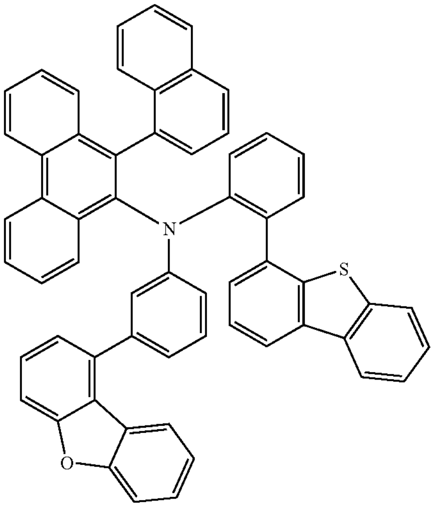
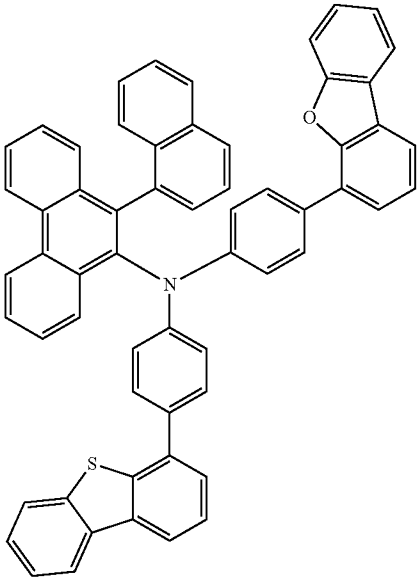
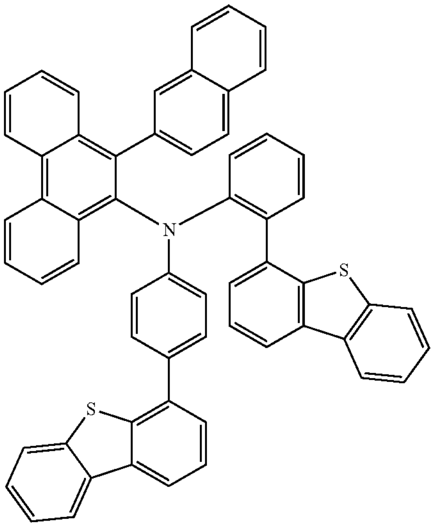
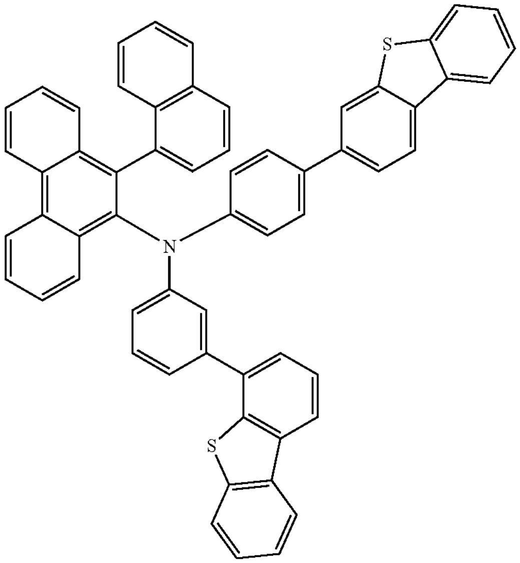
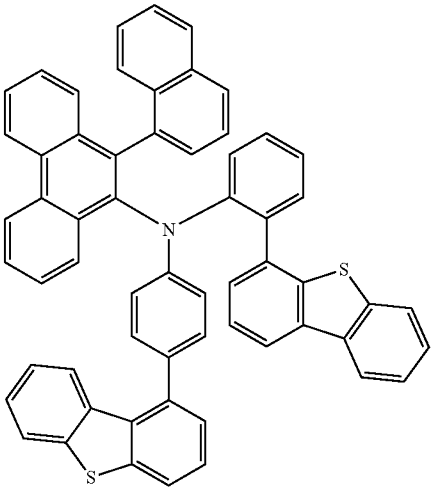
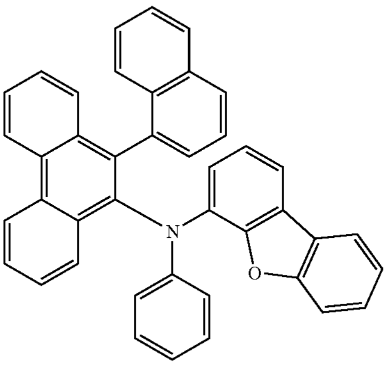

-continued
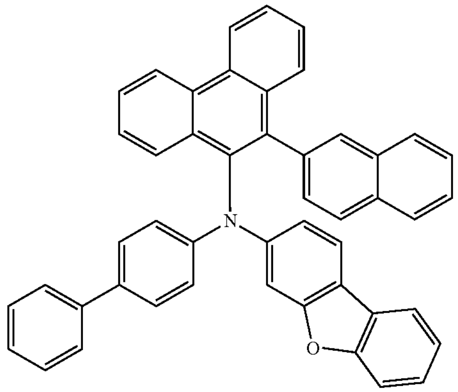
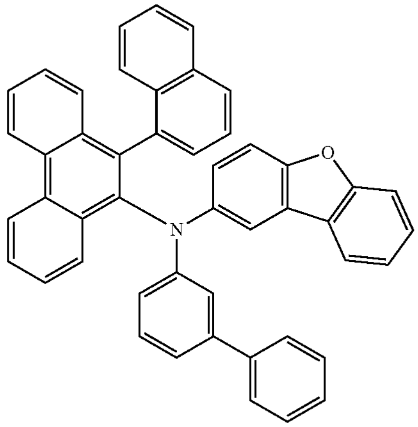
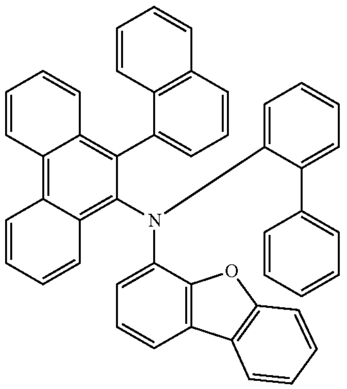
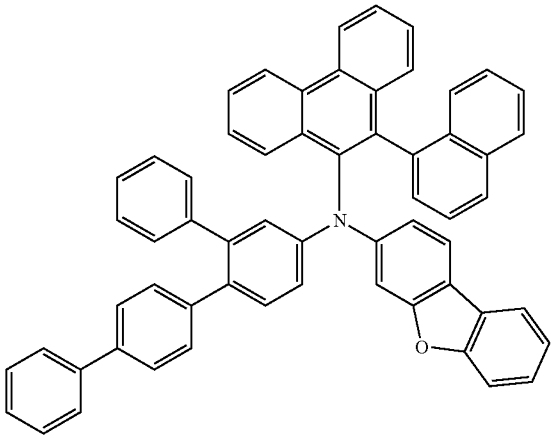
-continued
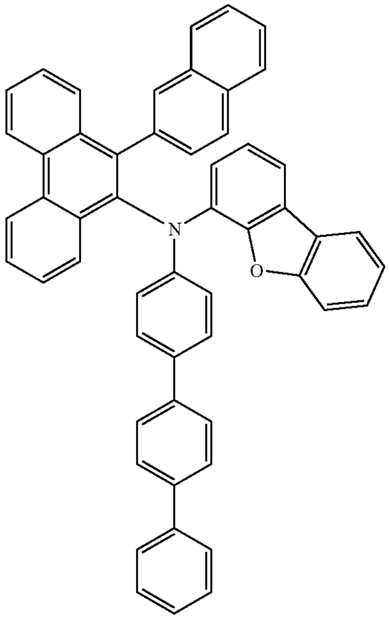
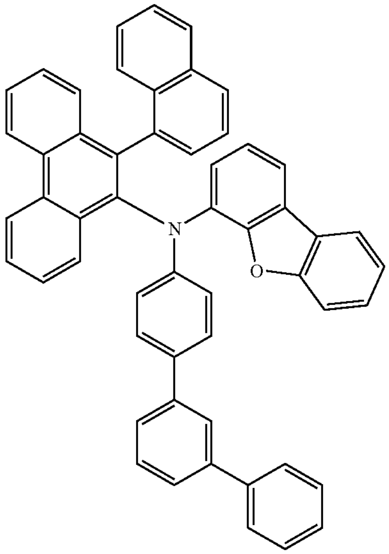
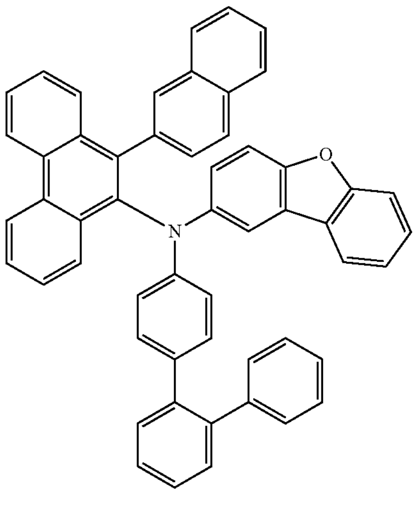

-continued
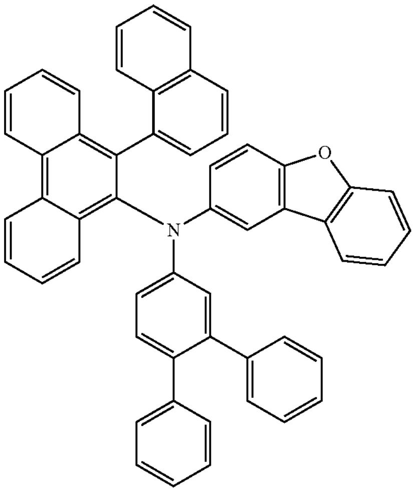
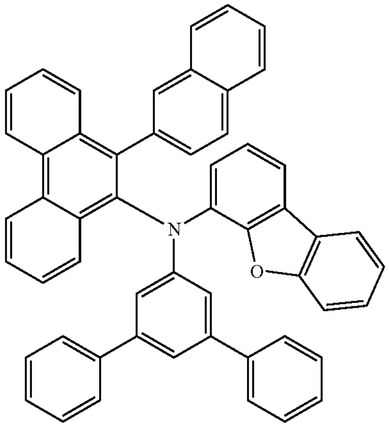
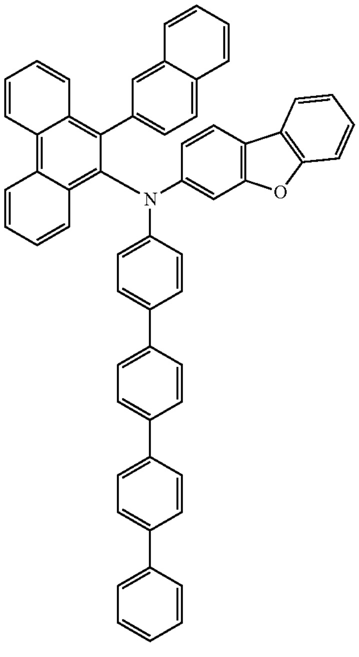
-continued
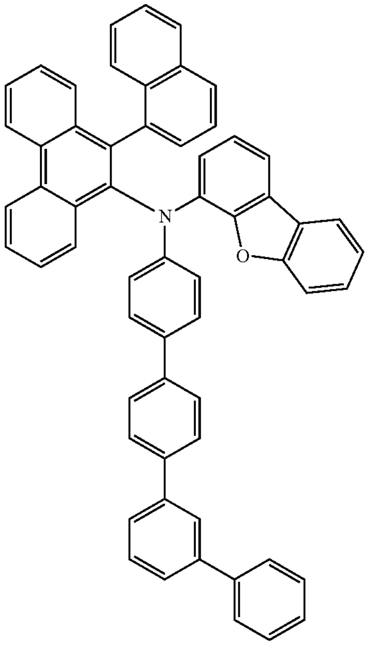
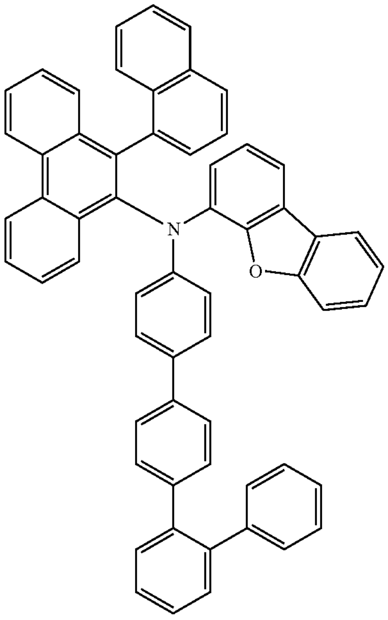

-continued
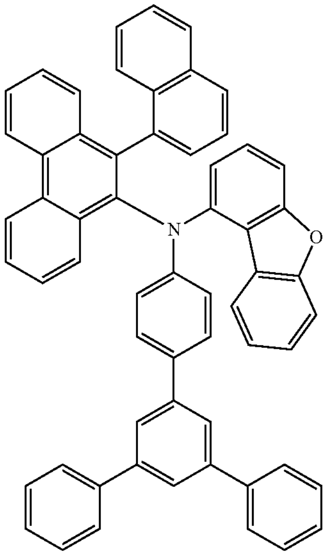
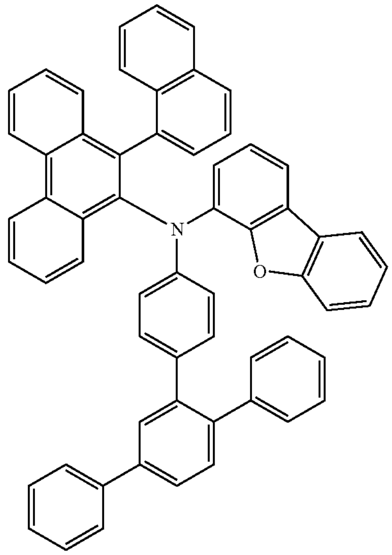
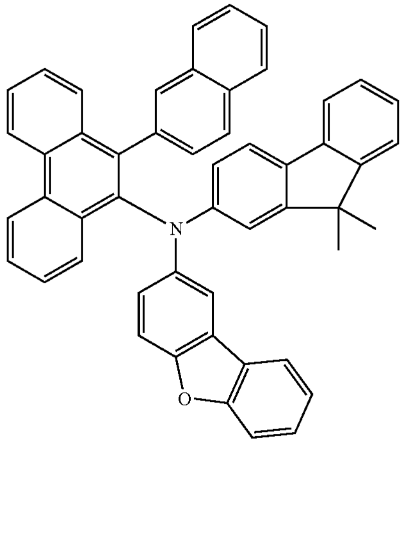
-continued
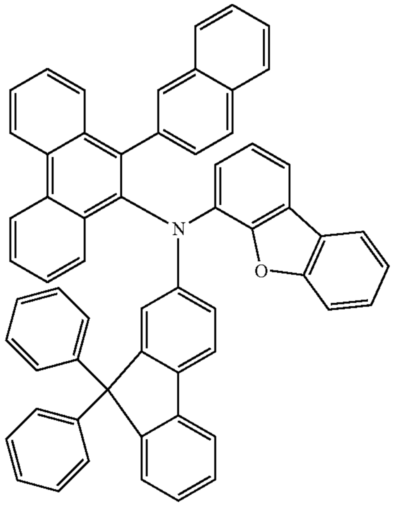
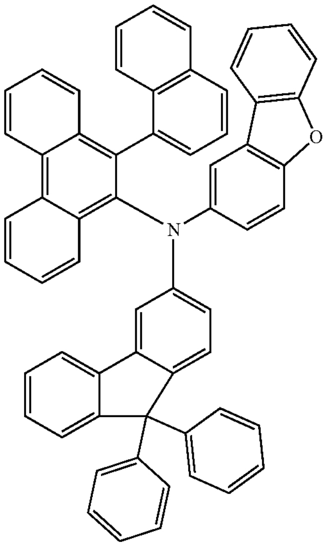
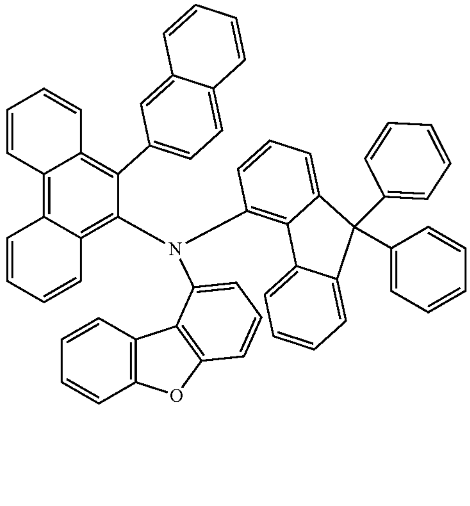

-continued
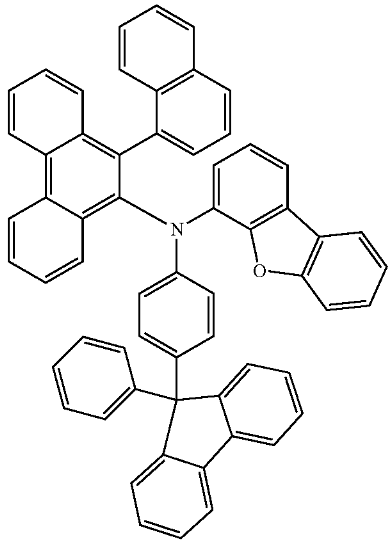
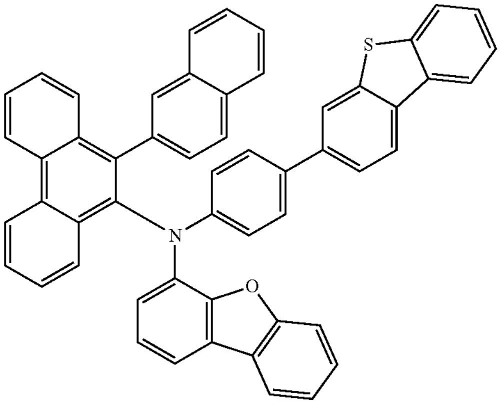
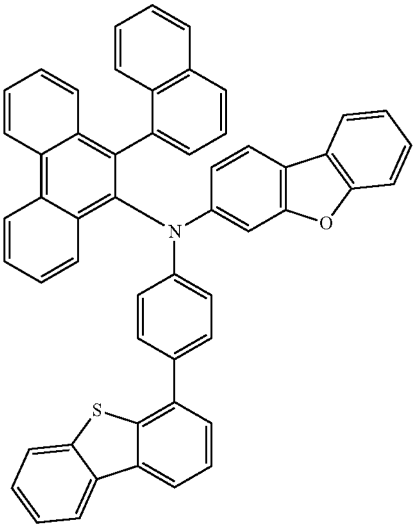
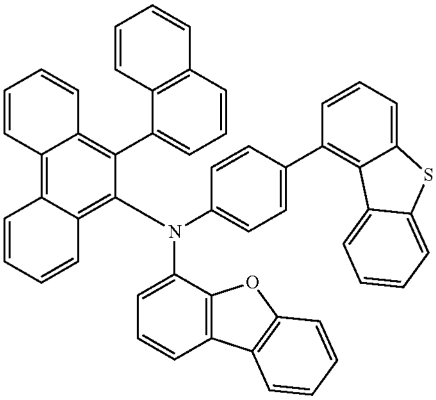
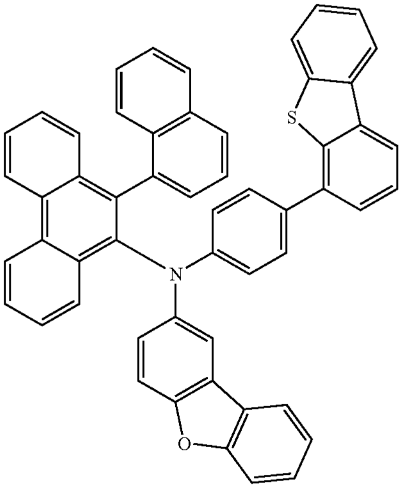
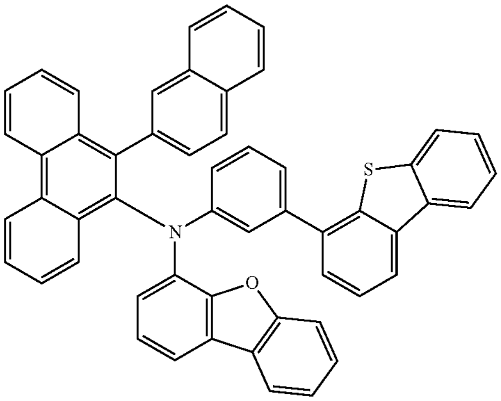

-continued
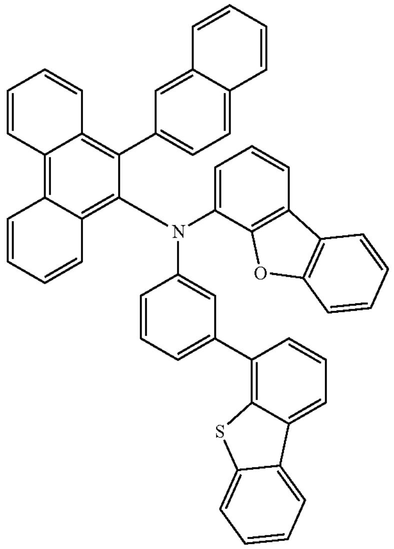
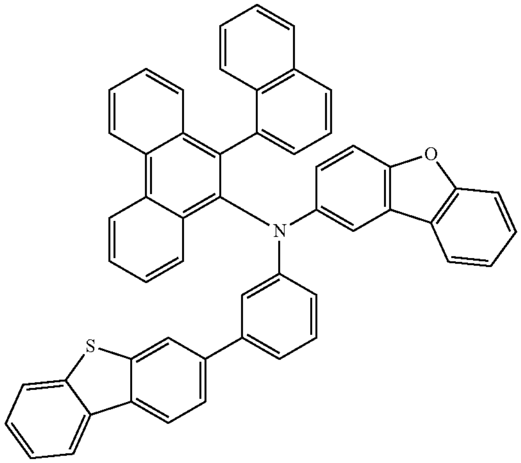
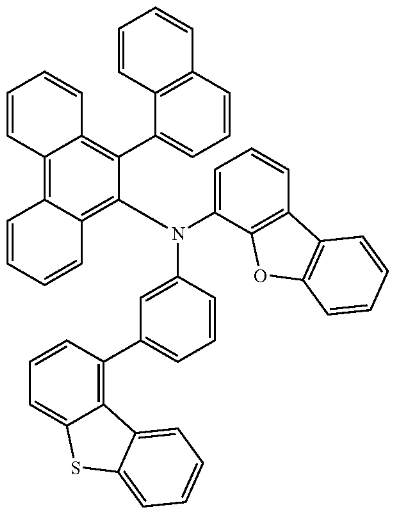
-continued
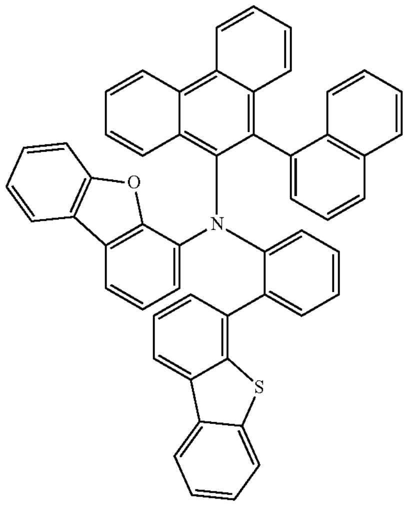
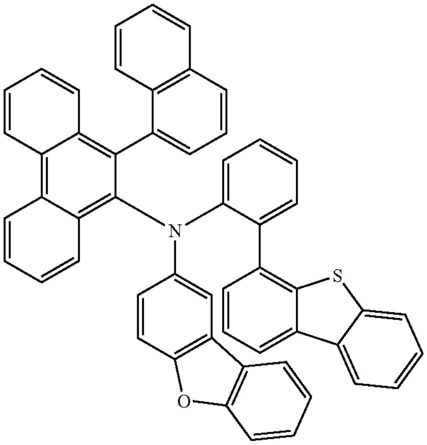
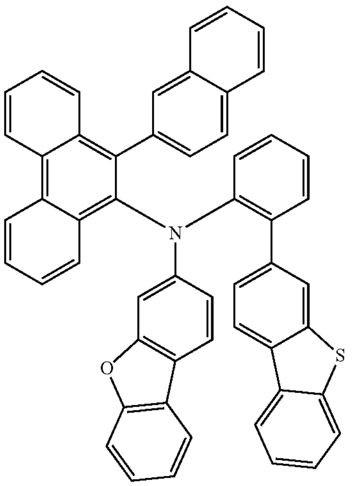

-continued
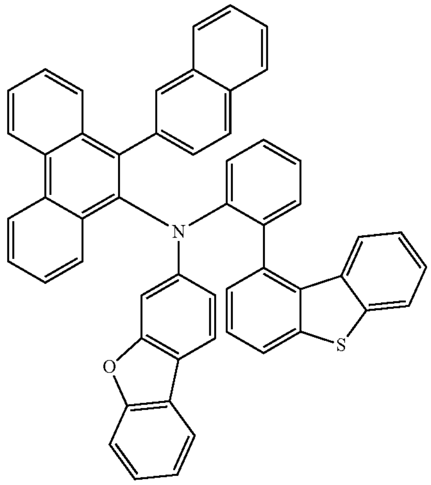
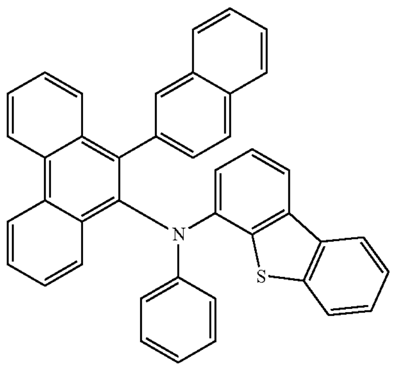
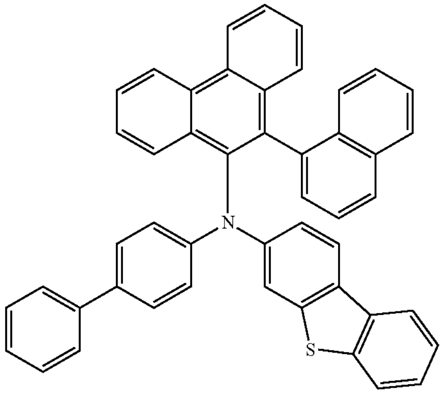
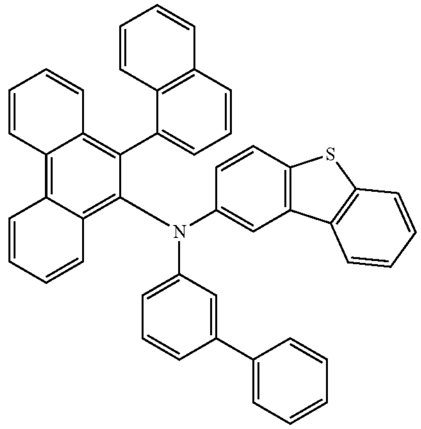
-continued
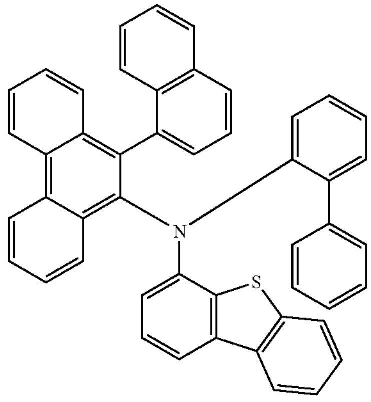
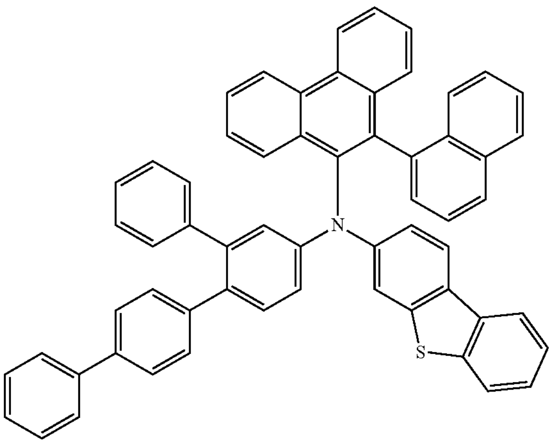
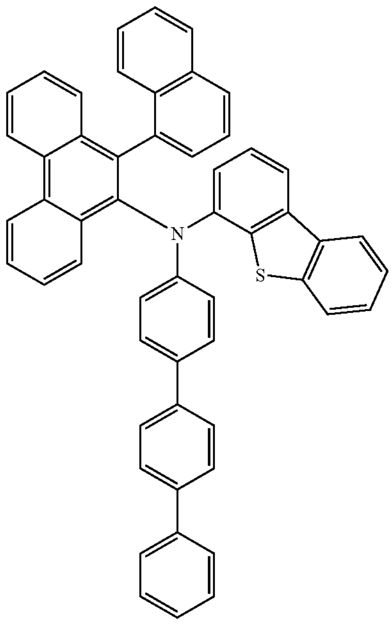

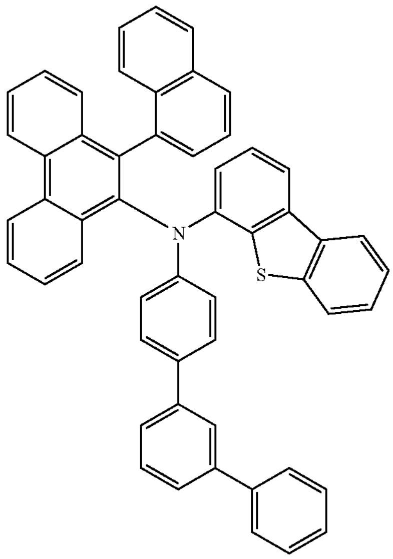
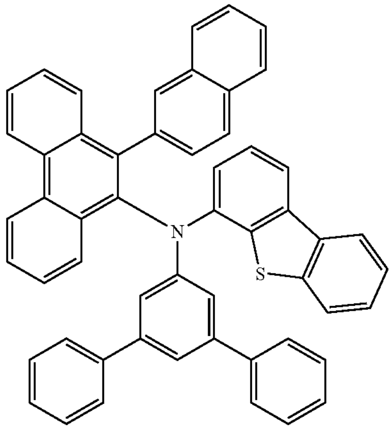
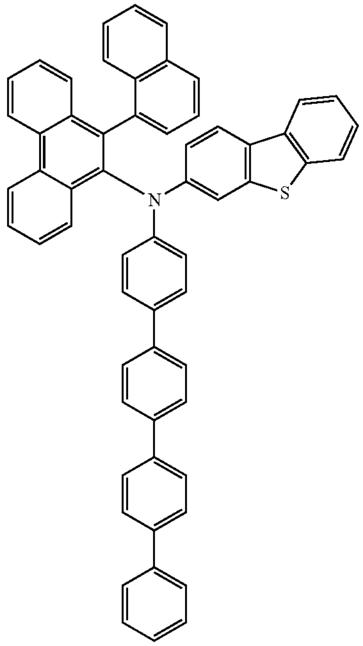
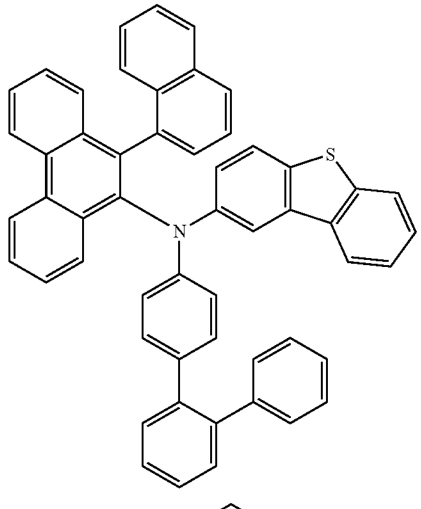
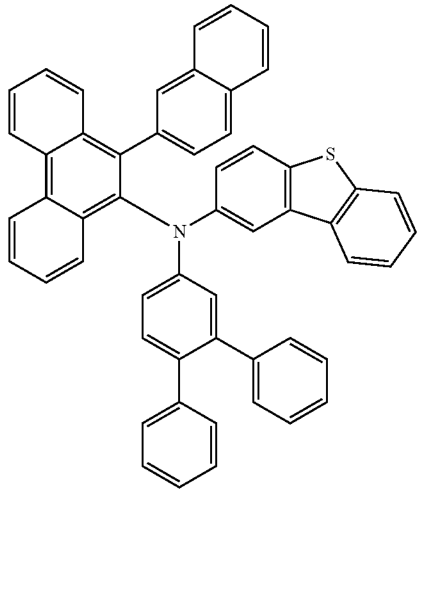
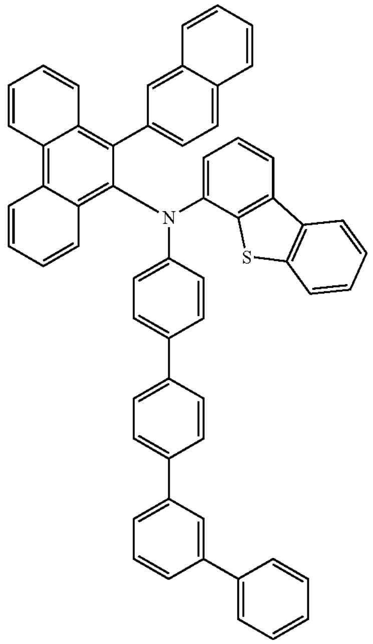

-continued
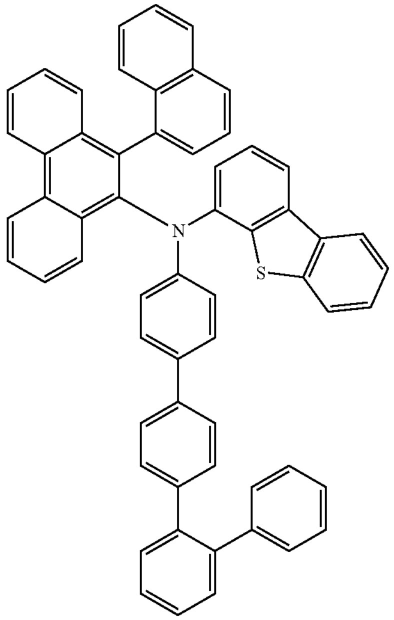
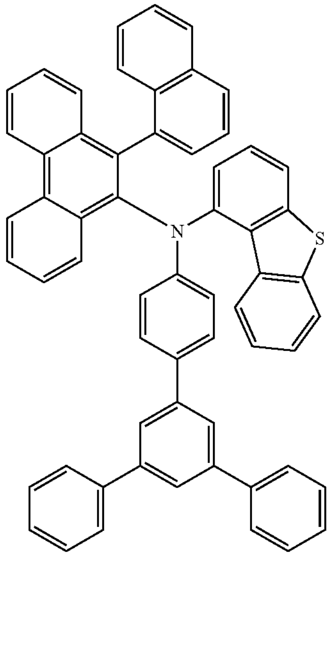
-continued
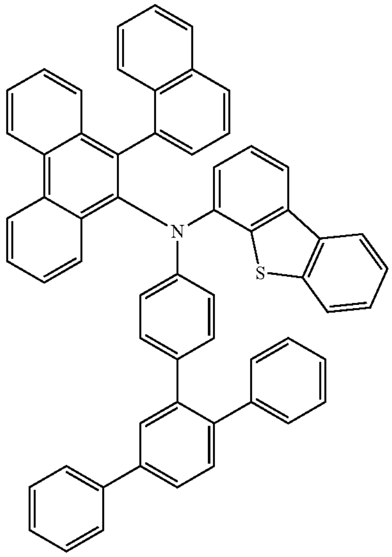
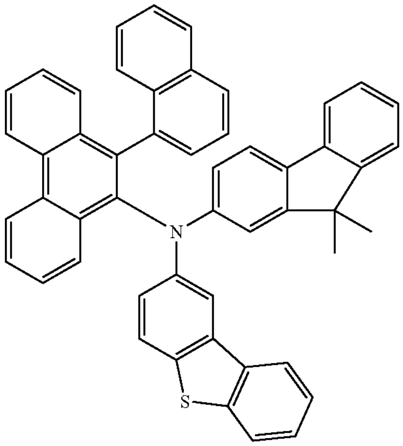
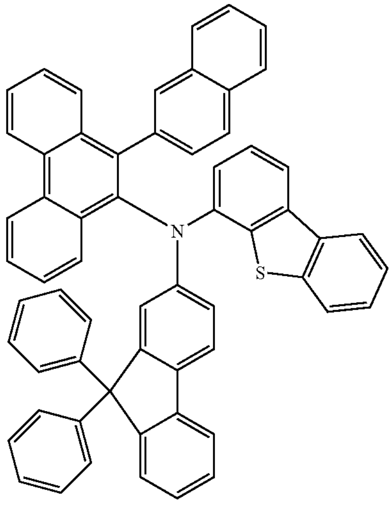

-continued
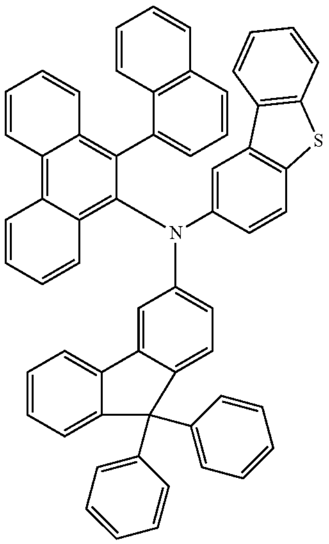
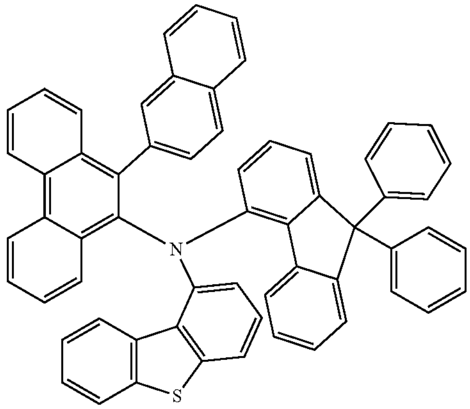
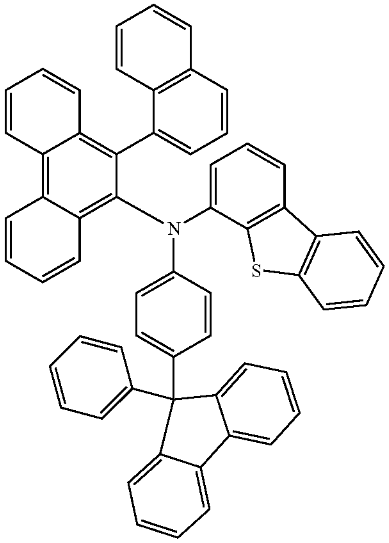
-continued
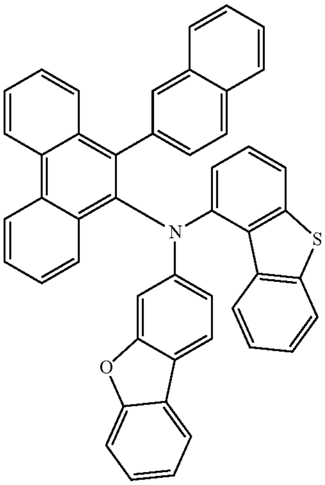
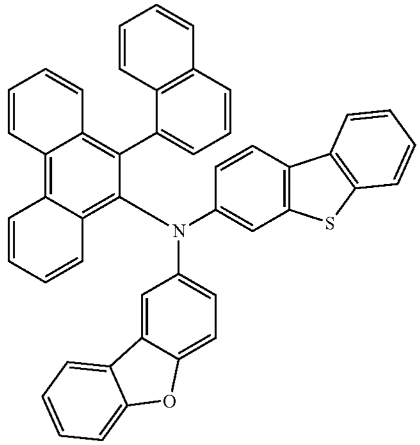
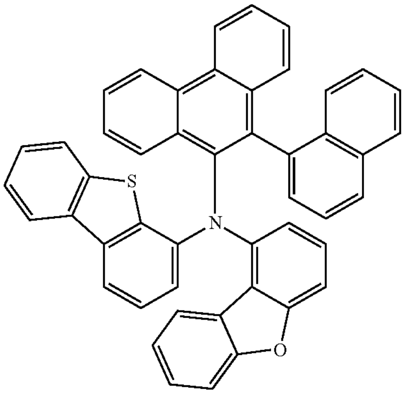

-continued
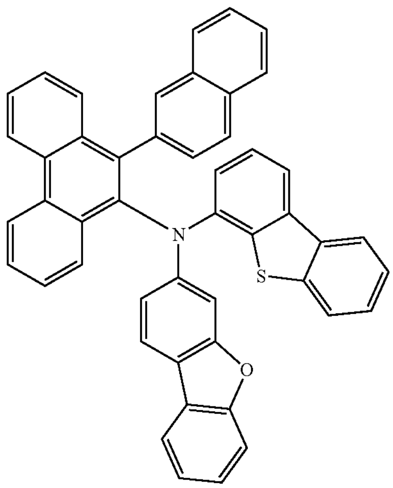
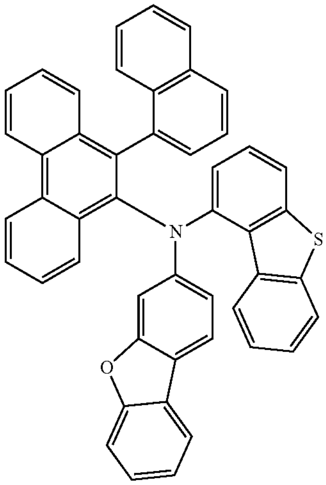
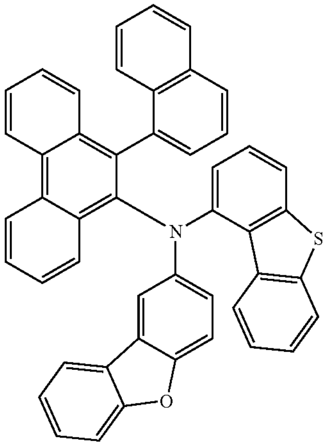
-continued
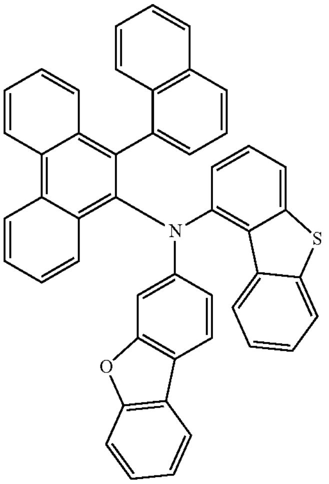
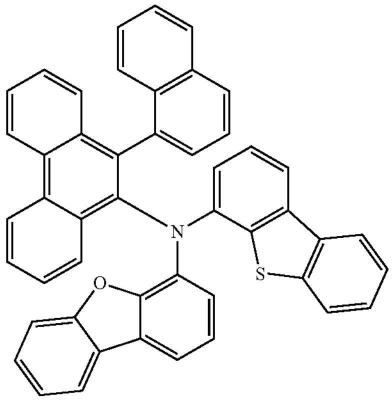
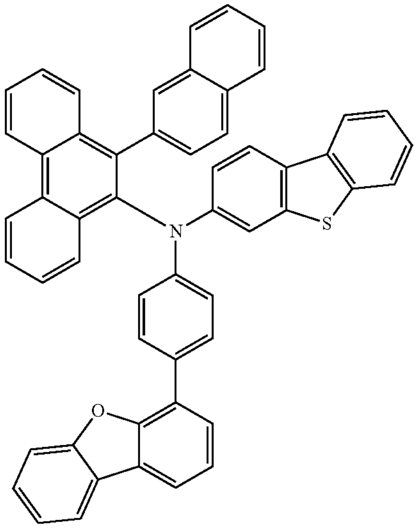

-continued
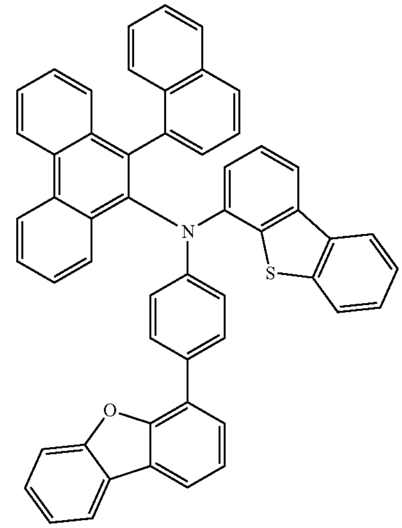
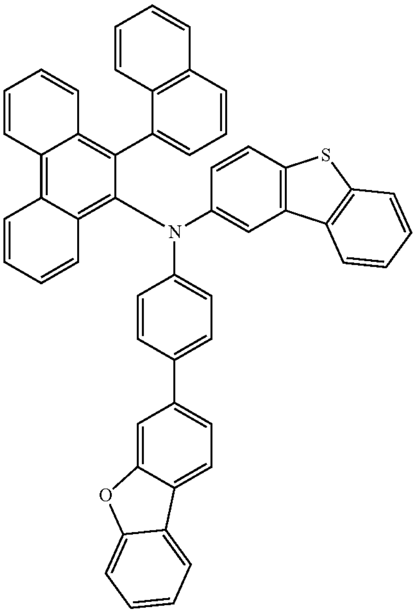
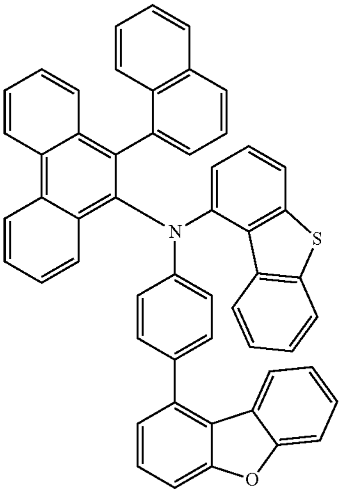
-continued
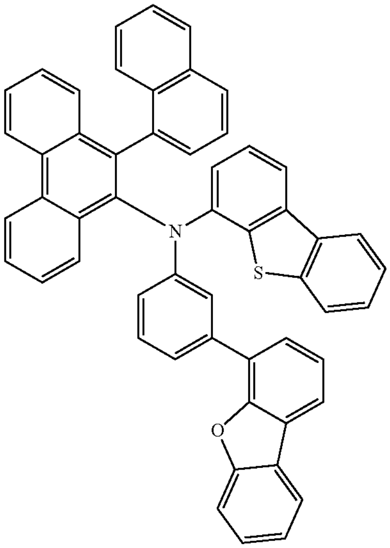
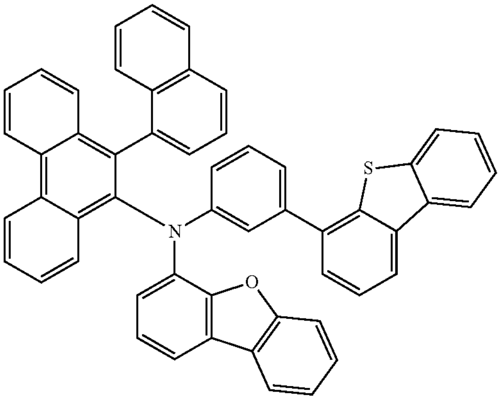
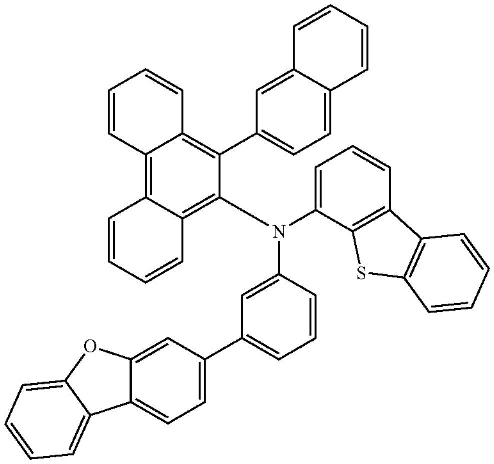

-continued
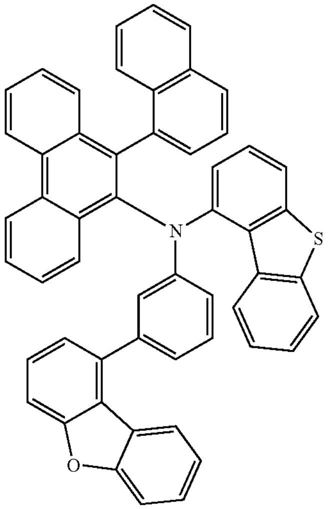
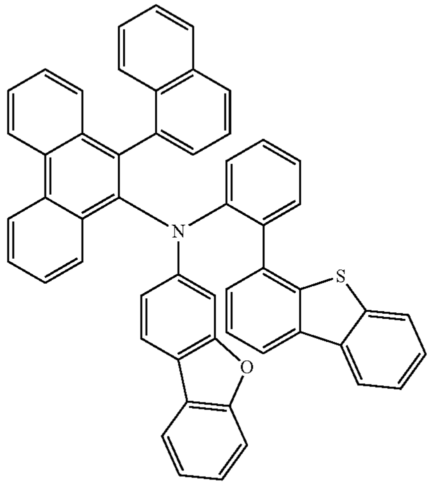
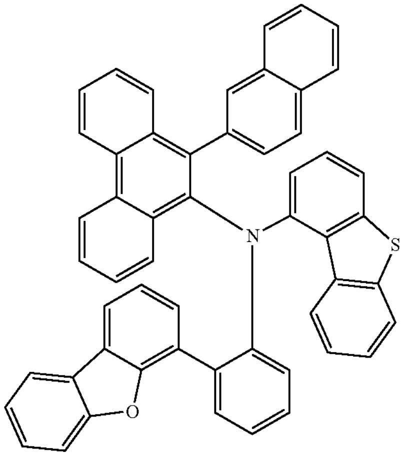
-continued
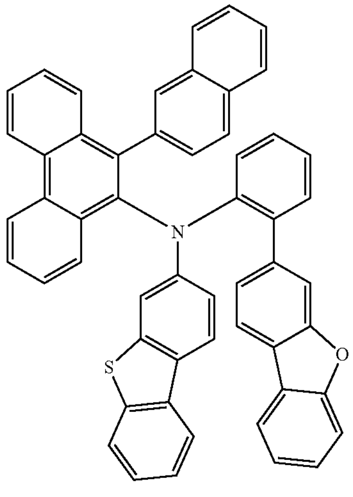
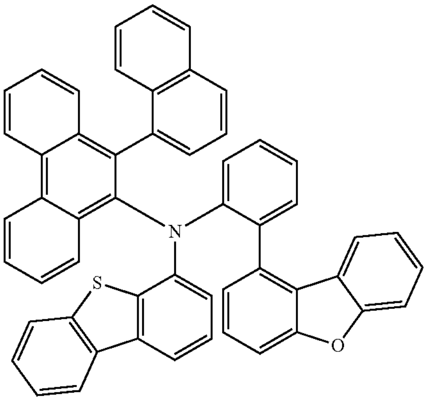
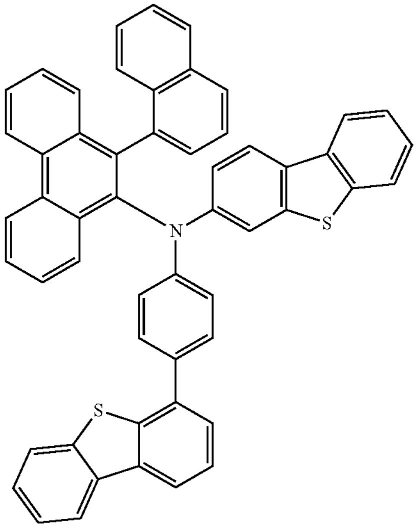

-continued
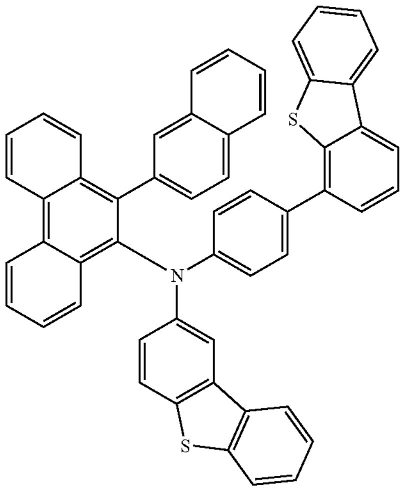
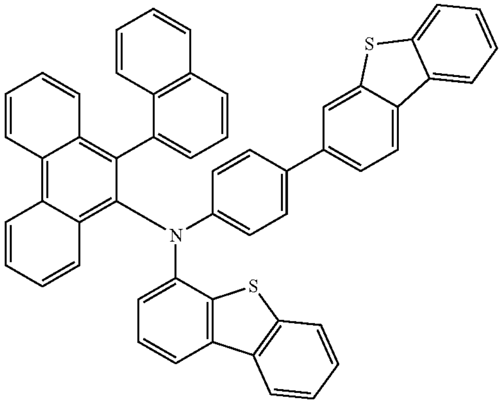
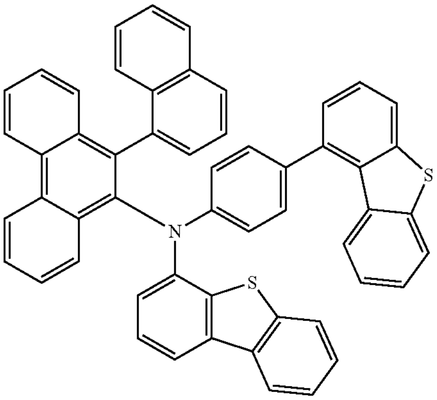
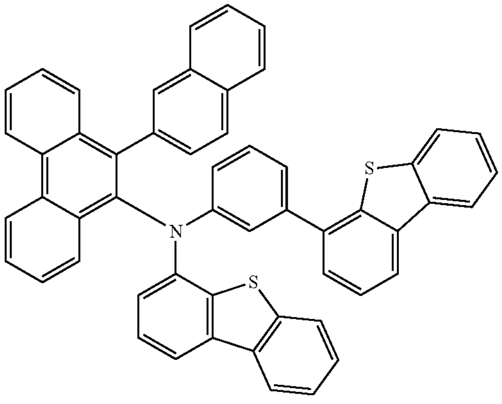
-continued
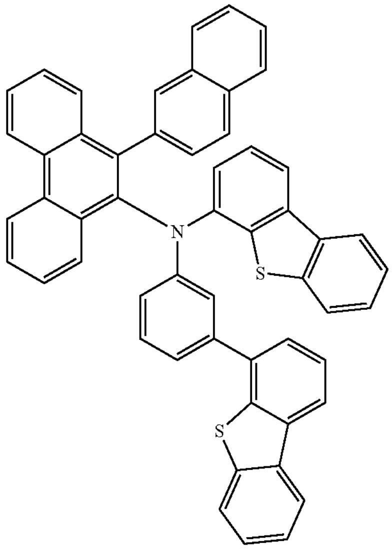
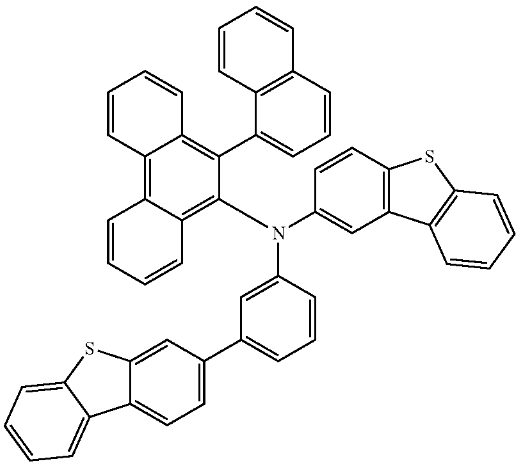
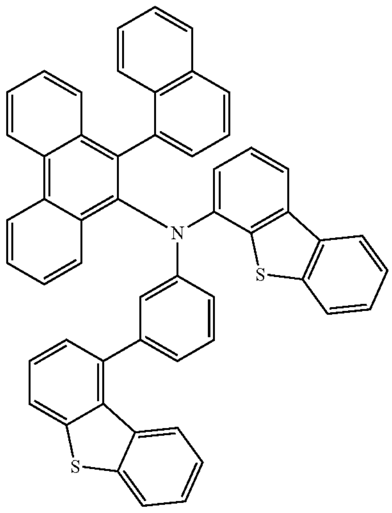

-continued

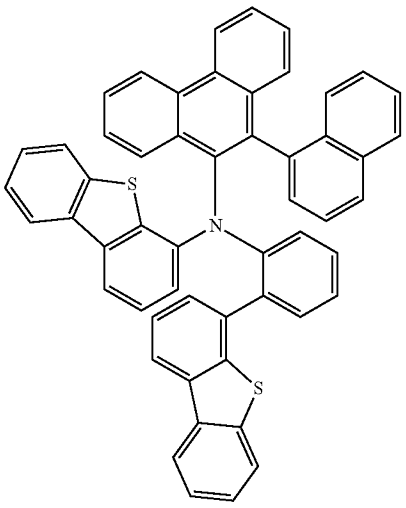

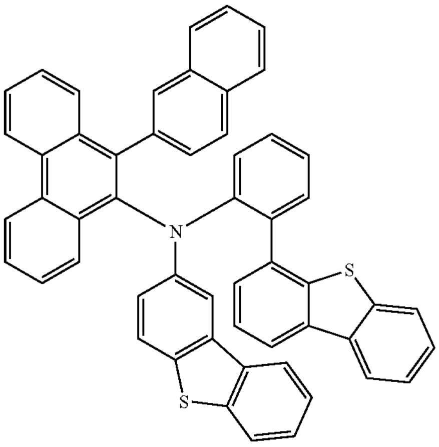

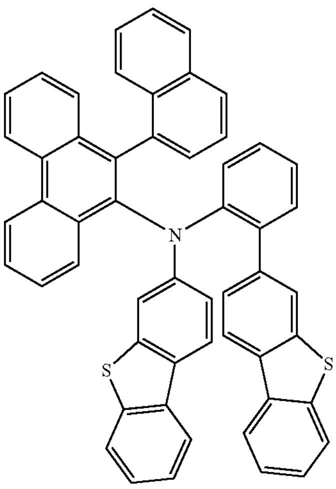

-continued

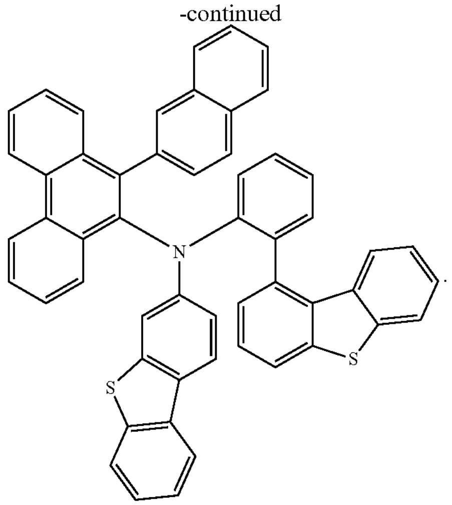

10. An organic light emitting device comprising:

a positive electrode:

a negative electrode provided to face the positive electrode;

a light emitting layer provided between the positive electrode and the negative electrode;

a hole injection layer and a hole transport layer successively provided between the positive electrode and the light emitting layer;

a first organic material layer provided between the hole transport layer and the light emitting layer;

an electron transport layer provided between the negative electrode and the light emitting layer; and a second organic material layer provided between the light emitting layer and the electron transport layer, wherein the second organic material layer comprises a compound of the following Formula 2:

[Formula 2]

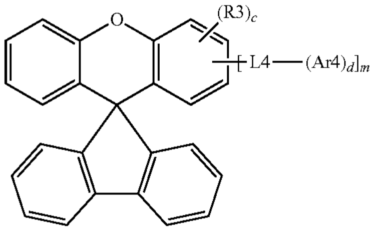

wherein in Formula 2:

L4 is a direct bond, a substituted or unsubstituted arylene group, or a substituted or unsubstituted divalent heterocyclic group;

Ar4 is a phenyl group substituted with —CN, a naphthylene group, or trifluoromethoxy group; a substituted or unsubstituted biphenyl group; a substituted or unsubstituted terphenyl group; a substituted or unsubstituted fluorene group; a substituted or unsubstituted phenanthrene group; a substituted or unsubstituted triphenylene group; a substituted or unsubstituted dibenzofuran group; a substituted or unsubstituted dibenzothiophene group; a substituted or unsubstituted benzocarbazole group; a triazine substituted with at least one of a biphenyl, phenyl-substituted naphthylene, dibenzofuran, dibenzothiophene, pyridine, terphenyl group, phenalene, fluorene, phenylpyridine, or dibenzofuran-substituted phenyl; a pyrimidine substituted with at least one of a biphenyl, phenyl-substituted naphthylene, dibenzofuran, dibenzothiophene, pyridine, terphenylene, phenalene, fluorene, or dibenzofuran-substituted phenyl; a quinazoline substituted with phenyl, biphenyl, or naphthyl: an isoquinoline substituted with phenyl: a 1,10-phenanthroline group; a pyridazine substituted with phenyl or naphthyl: a benzo [4,5] imidazo[1,2-f] phenanthridine group; a phenyl-substituted 1,3,4-oxadiazole; a phenyl-substituted 1,3,4-thiadiazole; a fluoranthene group; a dihydrophenoxazine group; or a dihydrophenothiazine group;

R3 is hydrogen, deuterium, a halogen group, a cyano group, a nitro group, a substituted or unsubstituted alkyl group, a substituted or unsubstituted haloalkyl group, a substituted or unsubstituted haloalkoxy group, a substituted or unsubstituted cycloalkyl group, a substituted or unsubstituted alkenyl group, a substituted or unsubstituted aryl group, or a substituted or unsubstituted heterocyclic group;

c is an integer from 0 to 3;

d is 1;

m is an integer from 1 to 4; and when c and m are each independently 2 or more, the substituents in the parentheses are the same as or different from each other, with the proviso that the compound of Formula 2 in the second organic material layer is not the following compound:

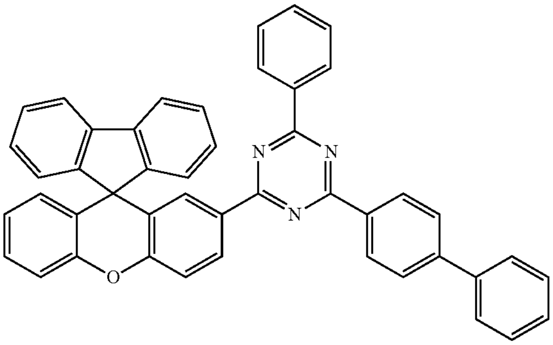 [SMILES: c1ccc(-c2ccc(-c3nc(-c4ccccc4)nc(-c4ccc5c(c4)C4(c6ccccc6O5)c5ccccc5-c5ccccc54)n3)cc2)cc1]

and wherein the first organic material layer comprises a compound selected from among the following compounds:

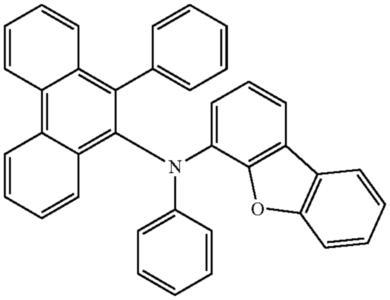

-continued

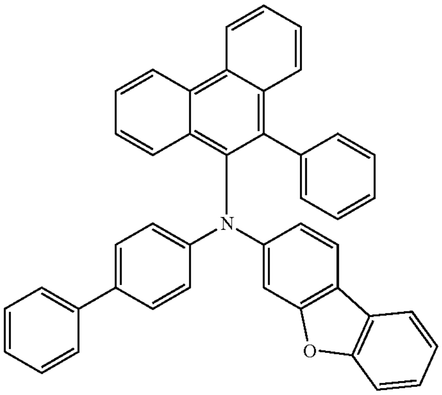

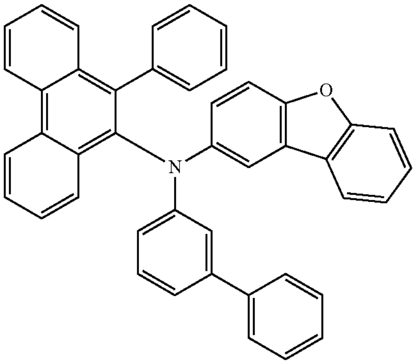

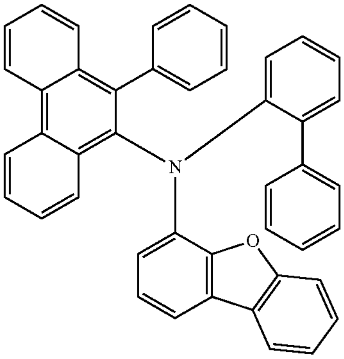

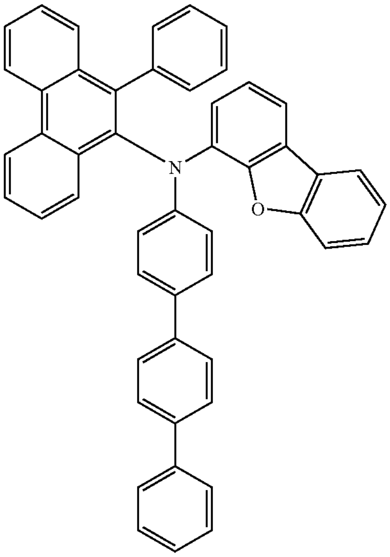

-continued
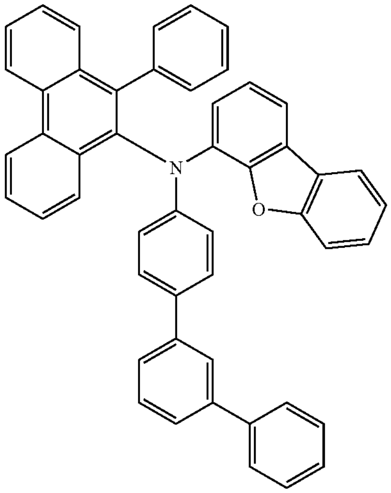
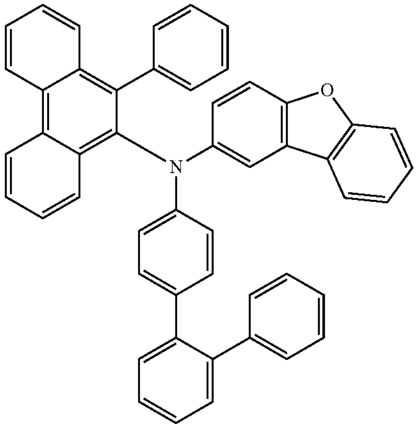
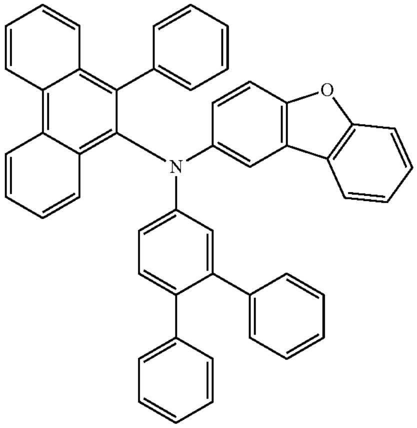
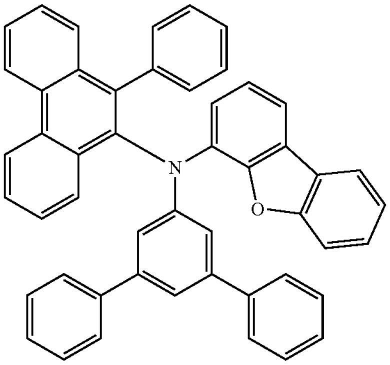
-continued
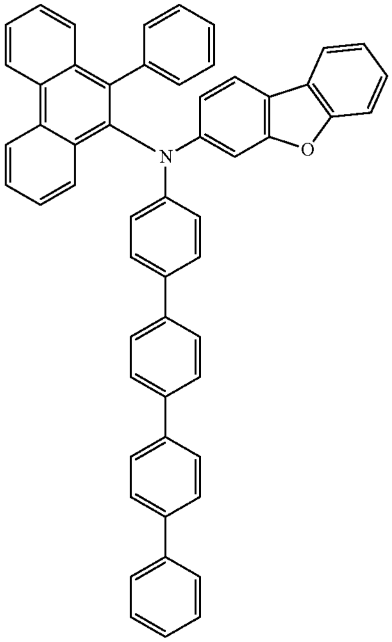
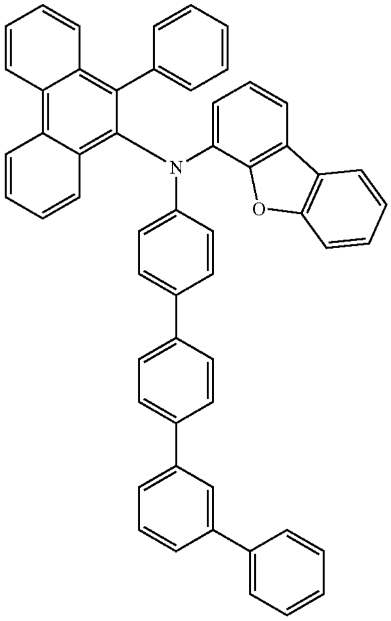

-continued
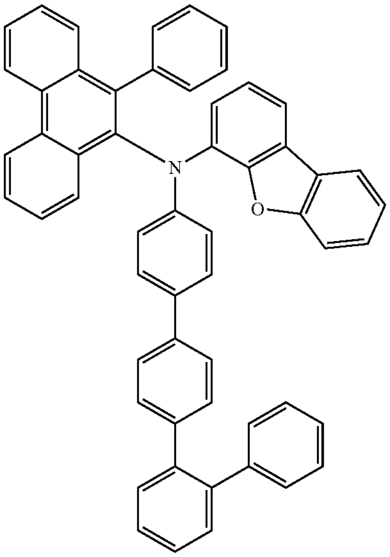
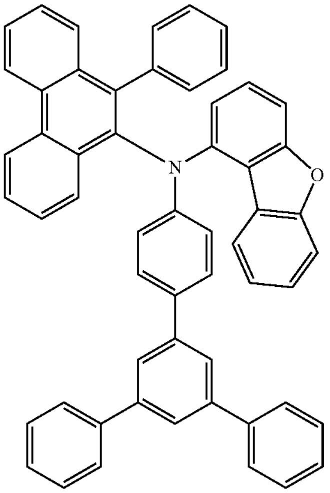
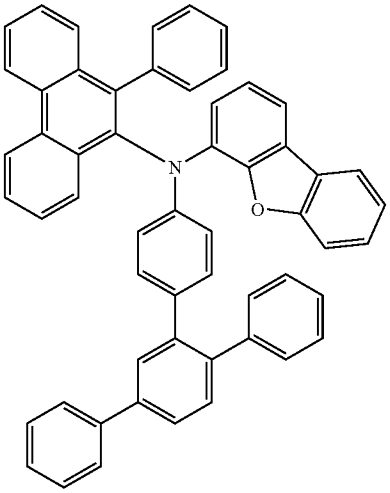
-continued
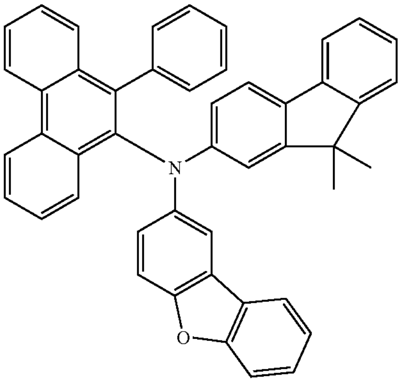
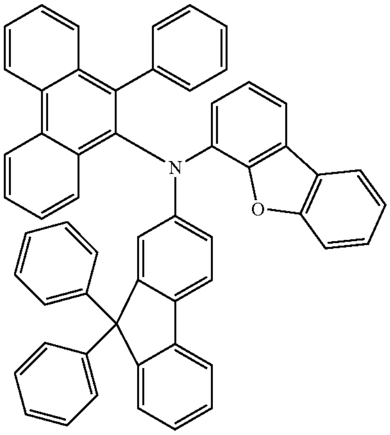
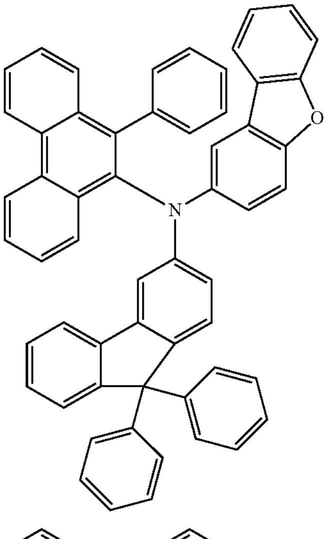
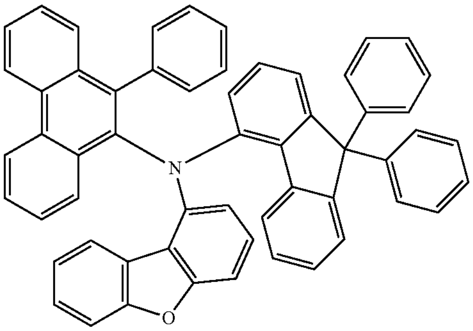

-continued
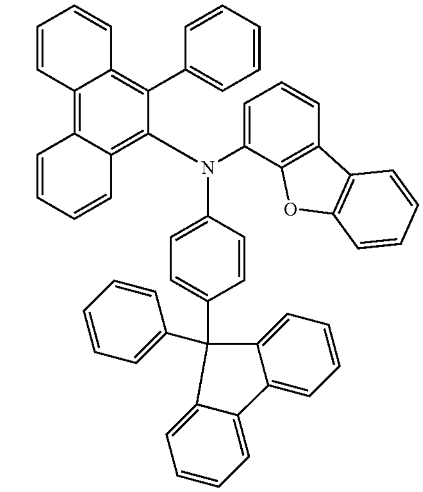 [SMILES: c1ccc(-c2c(N(c3ccc(C4(c5ccccc5)c5ccccc5-c5ccccc54)cc3)c3cccc4c3oc3ccccc34)c3ccccc3c3ccccc23)cc1]
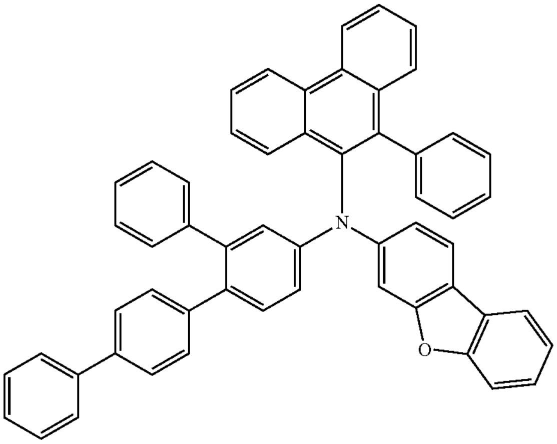 [SMILES: c1ccc(-c2ccc(-c3ccc(N(c4ccc5c(c4)oc4ccccc45)c4c(-c5ccccc5)c5ccccc5c5ccccc45)cc3-c3ccccc3)cc2)cc1]
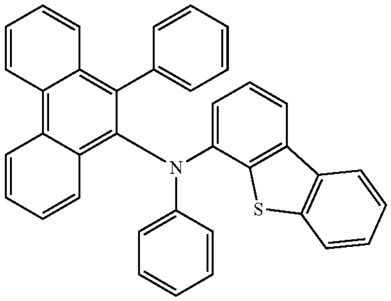
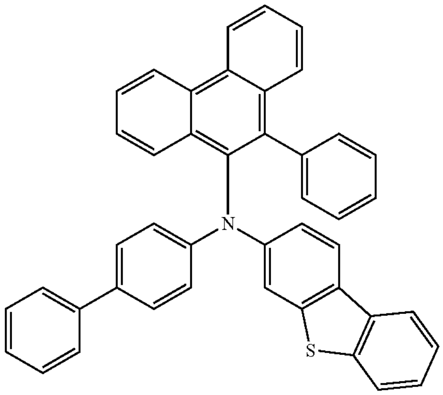
-continued
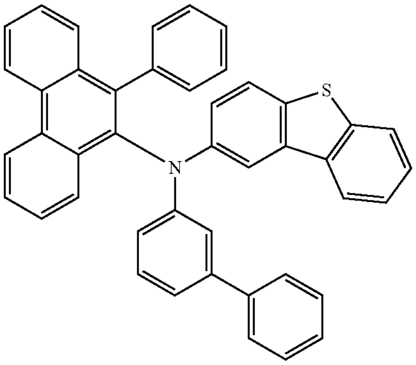
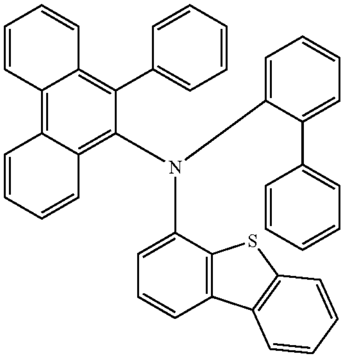
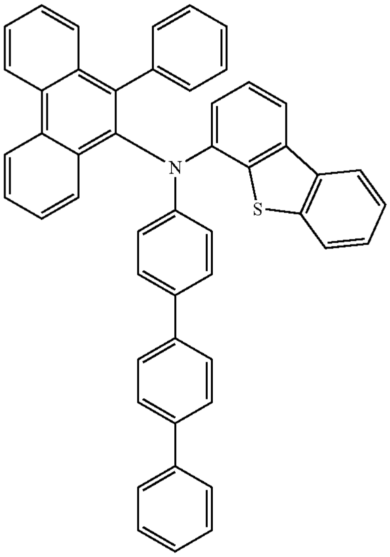

-continued
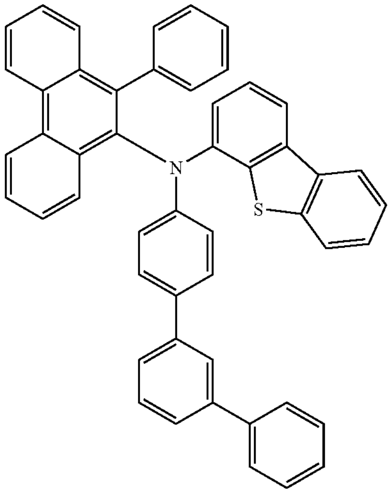
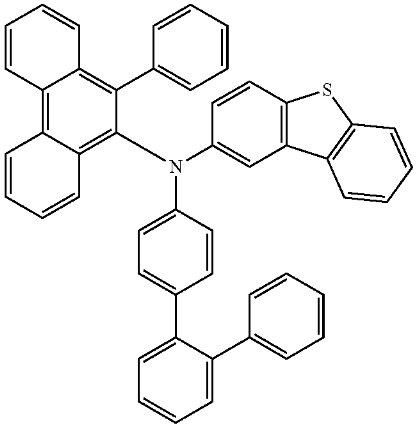
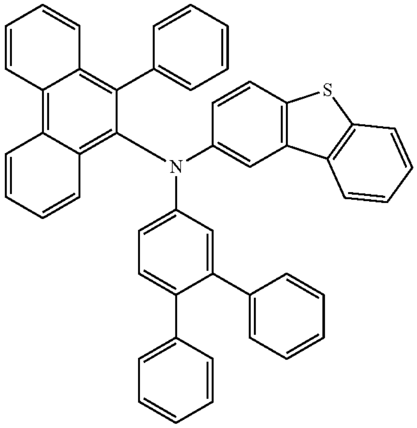
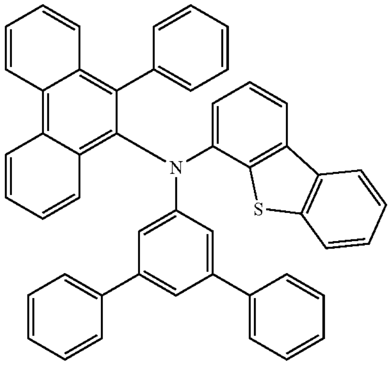
-continued
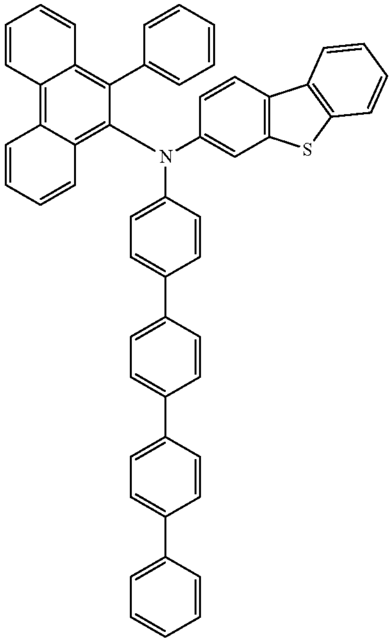
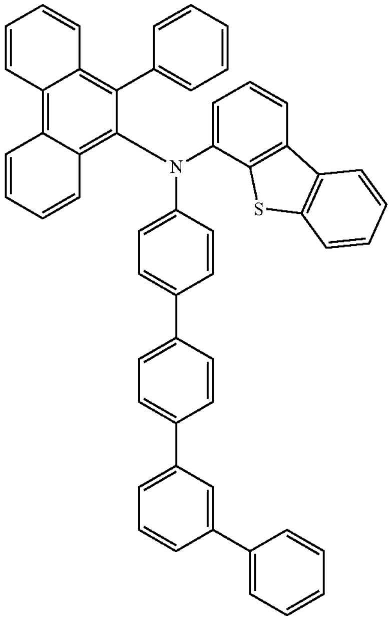

-continued
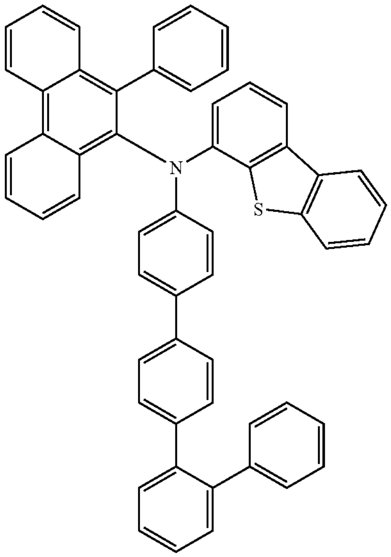
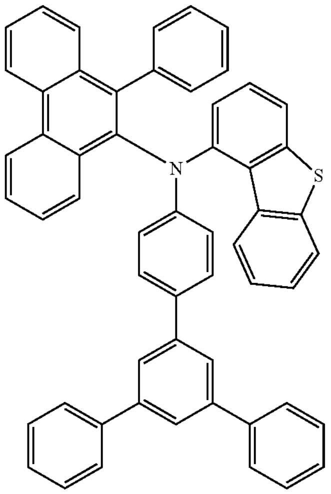
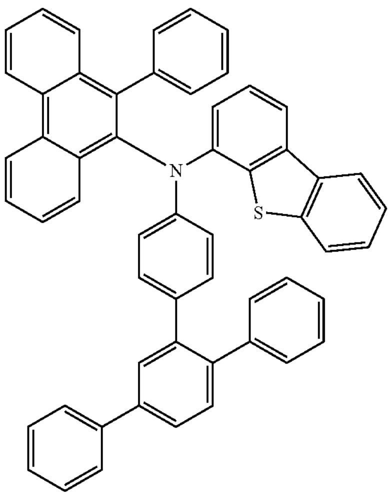
-continued
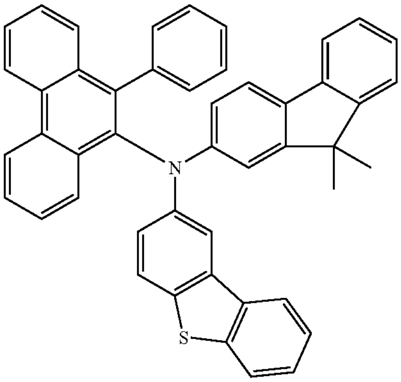
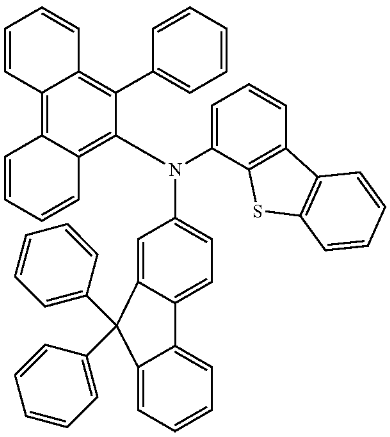
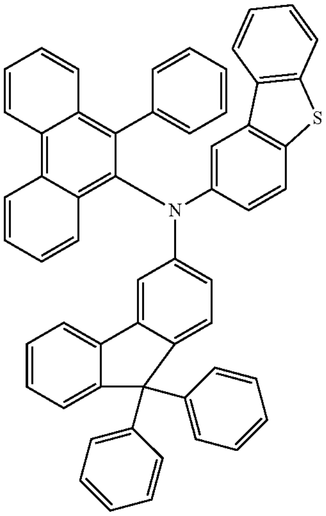
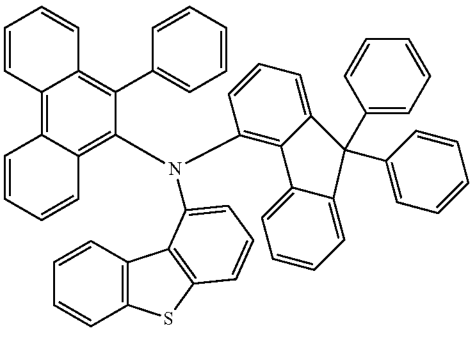

-continued
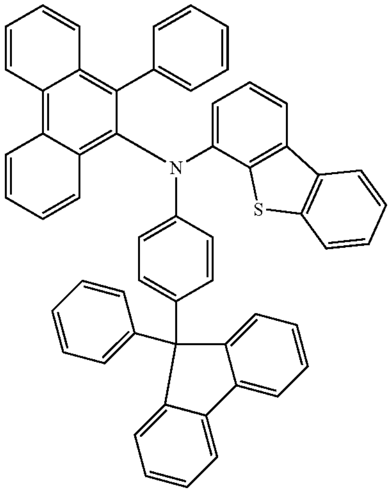
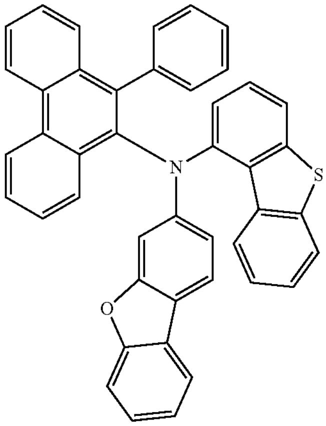
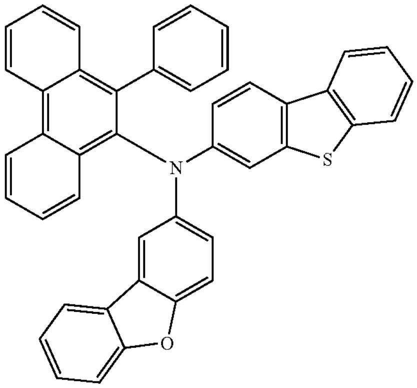
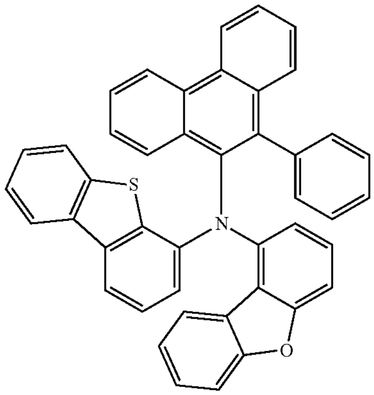
-continued
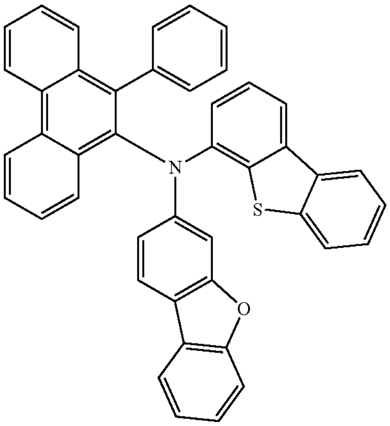
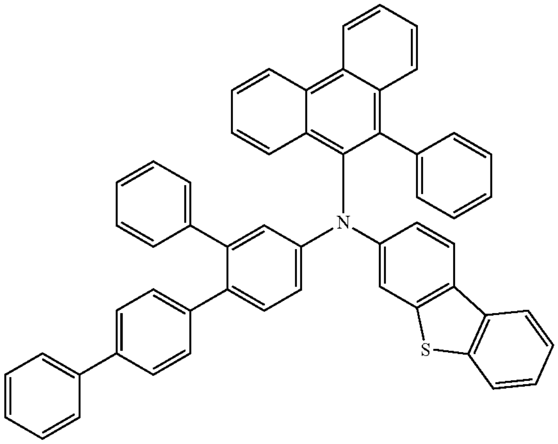
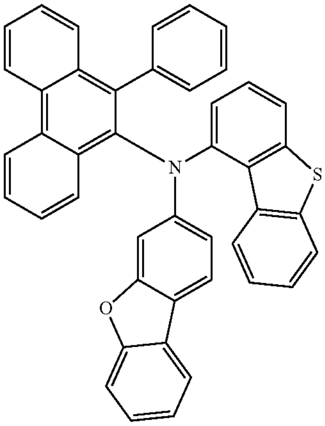
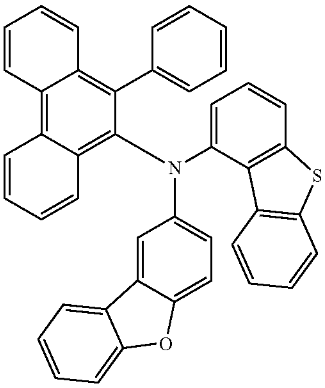

-continued
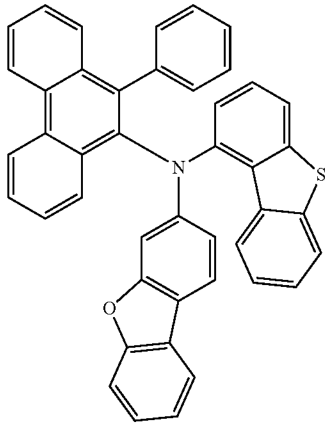
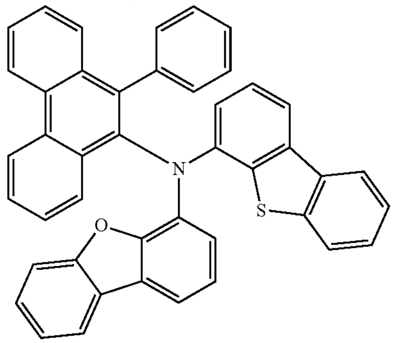
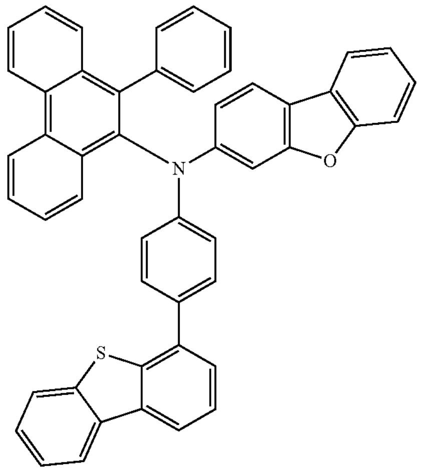
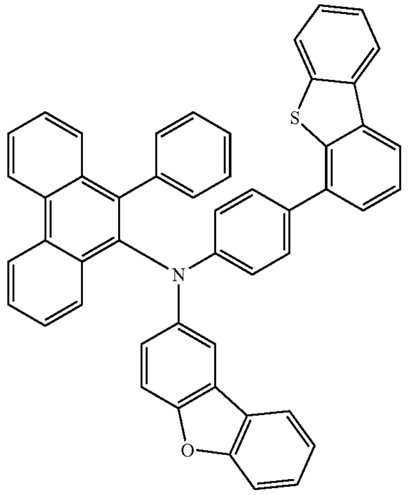
-continued
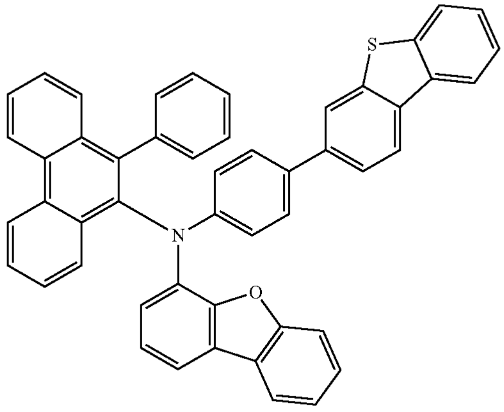
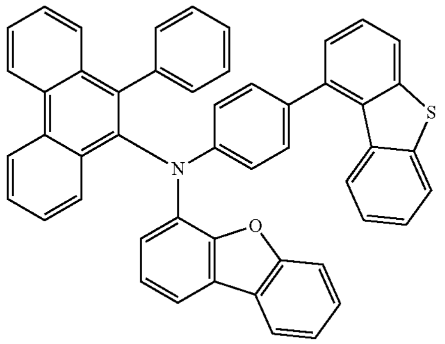
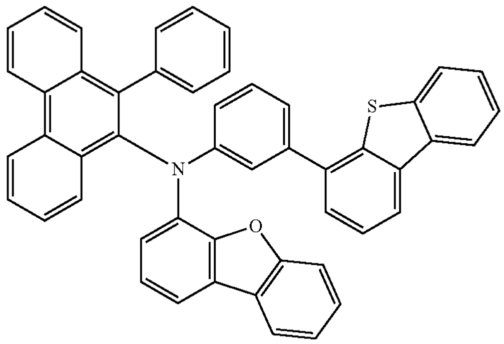
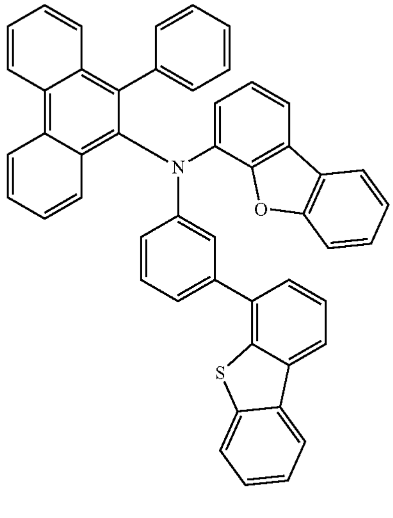

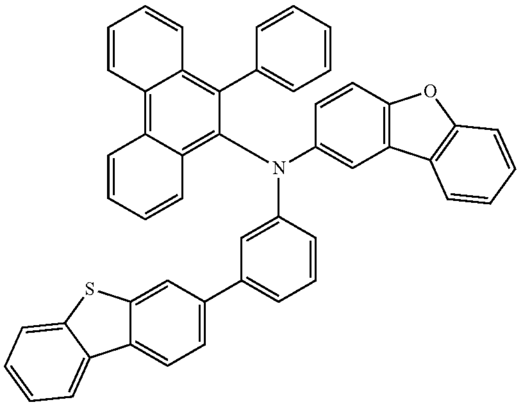
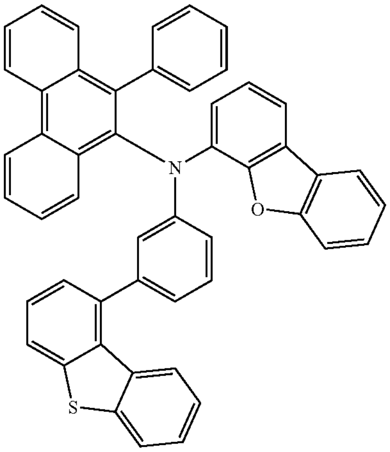
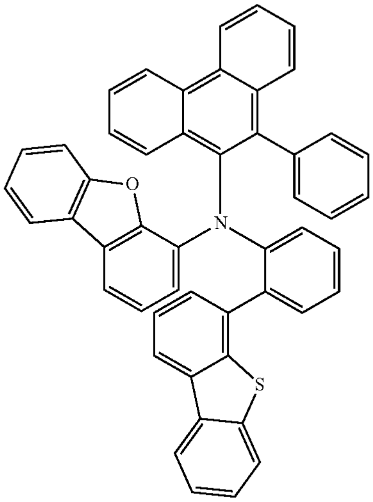
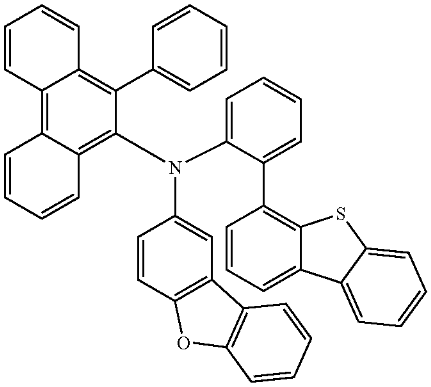
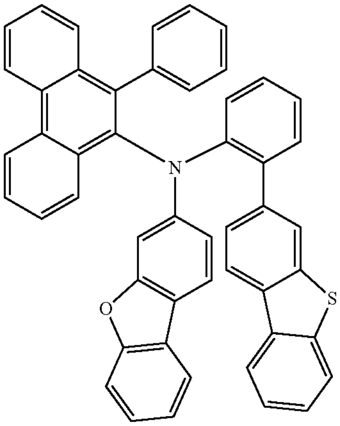
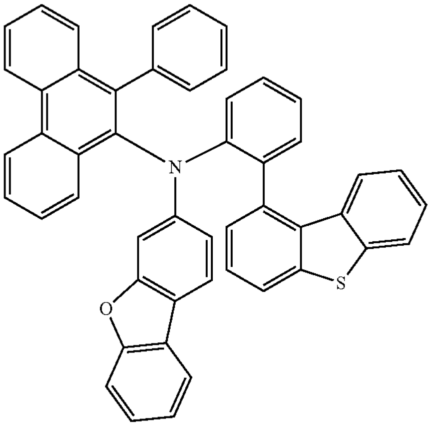
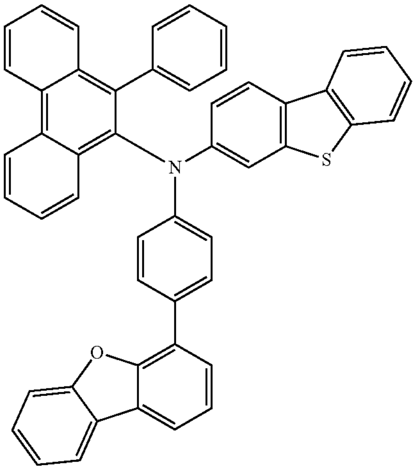

-continued
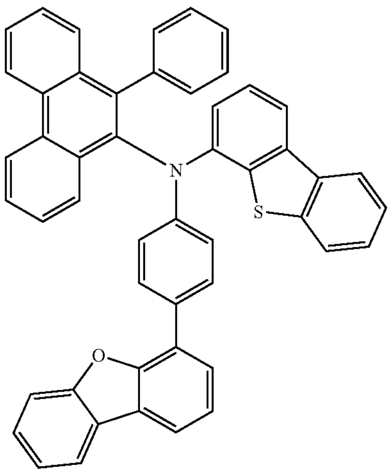
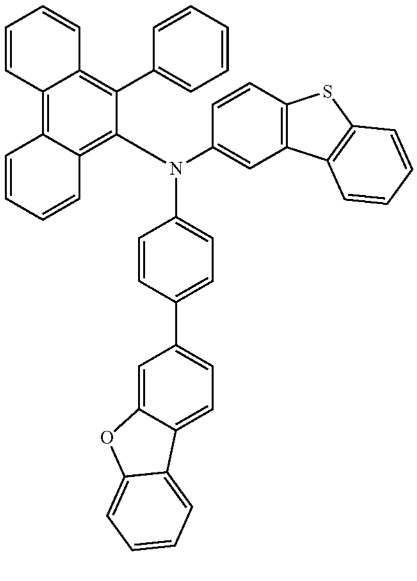
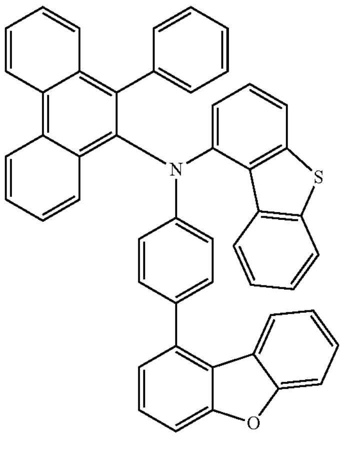
-continued
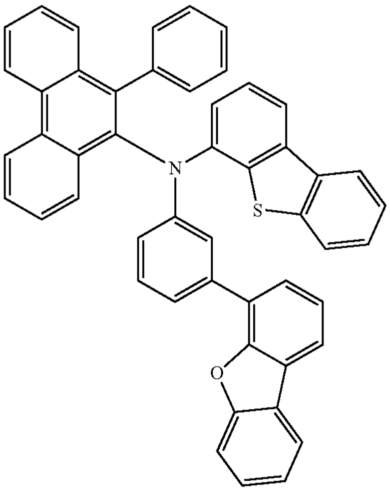
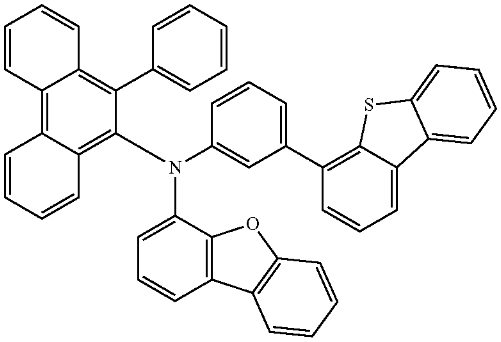
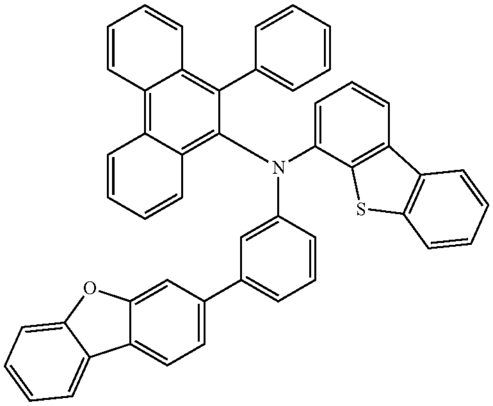
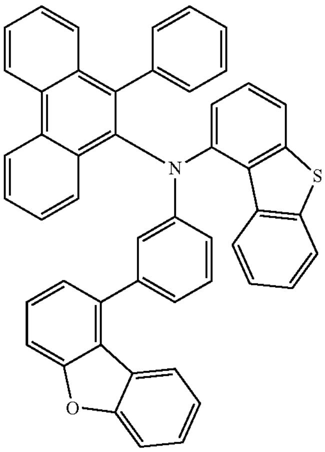

-continued
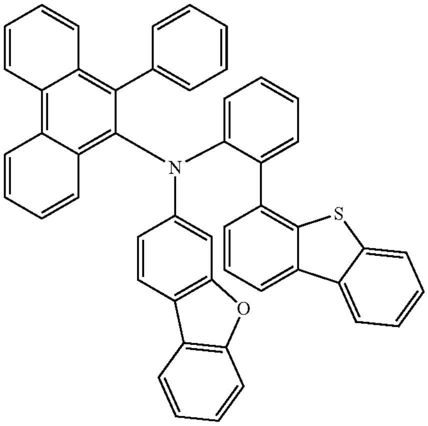
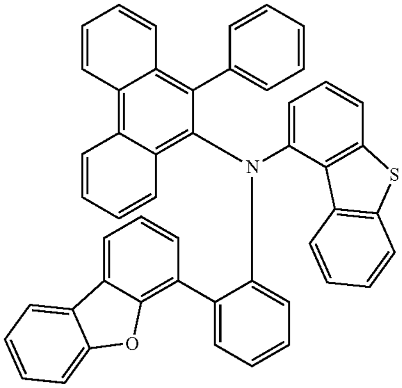
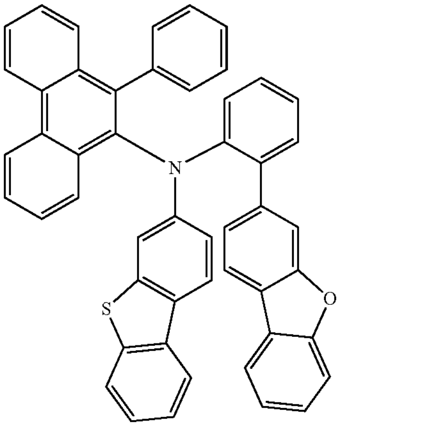
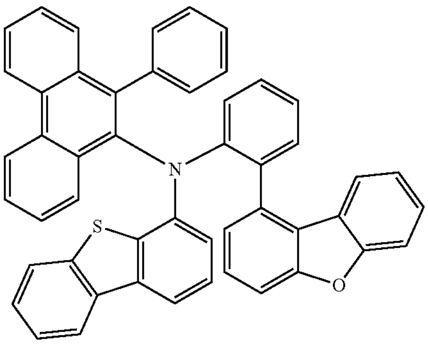
-continued
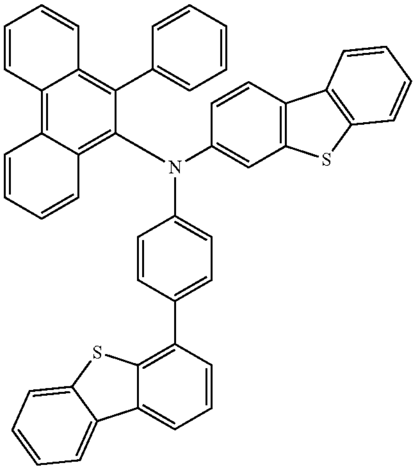
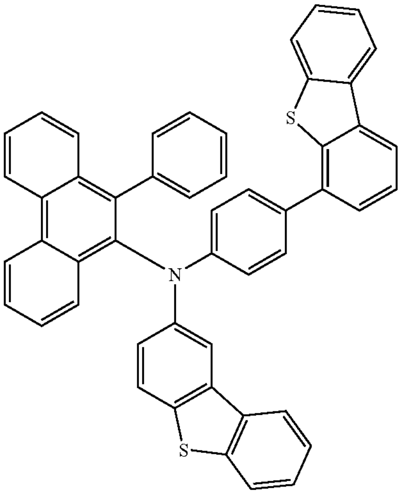
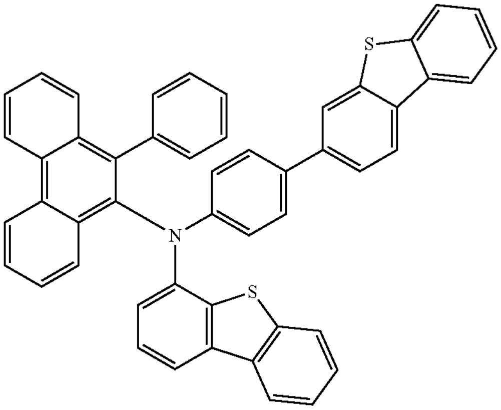
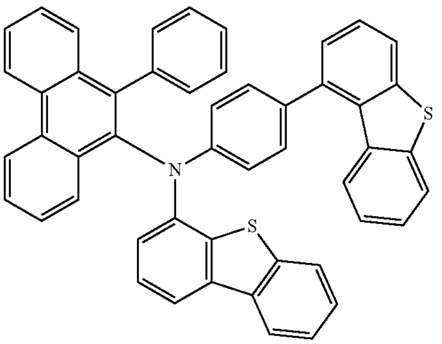

-continued
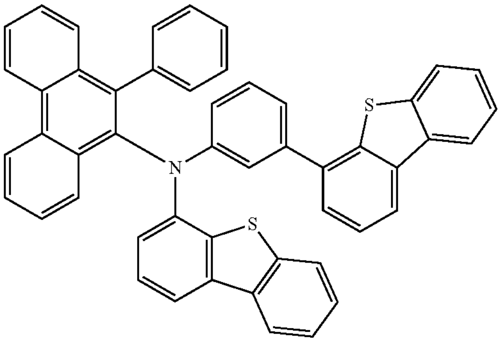
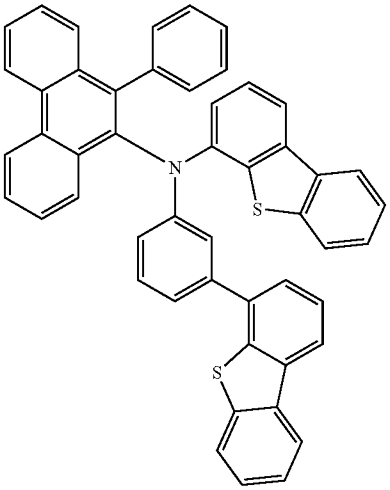
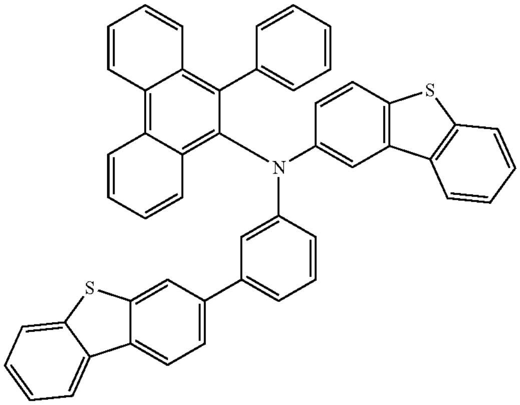
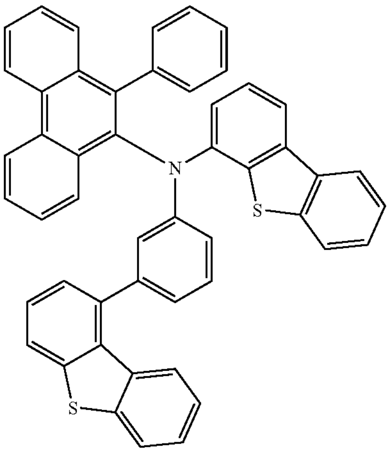
-continued
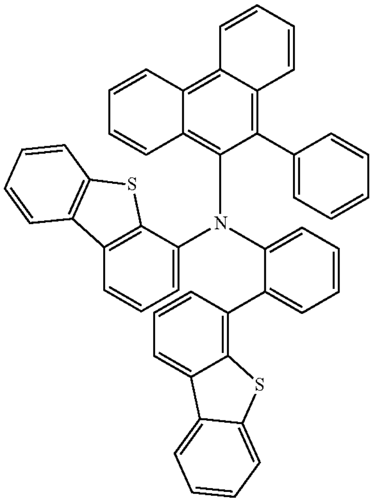
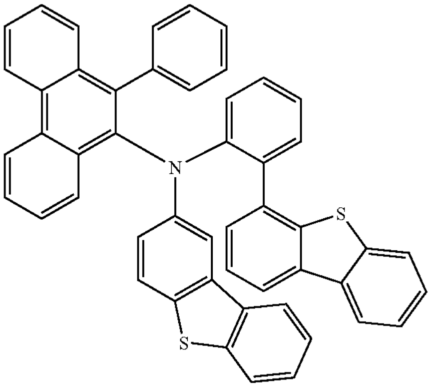
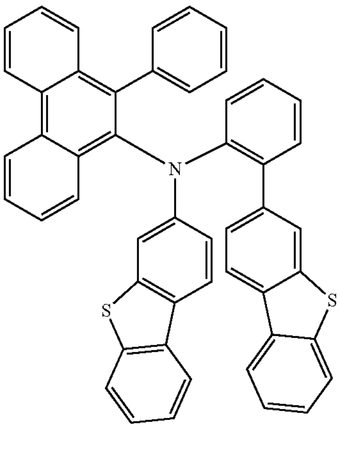

-continued
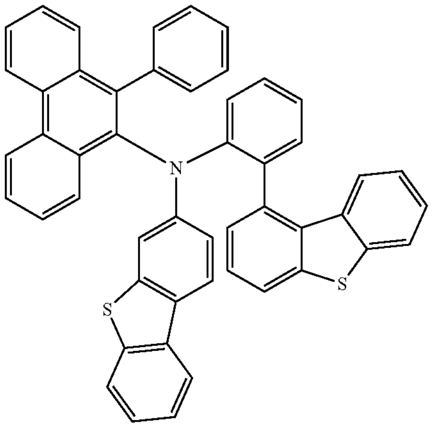
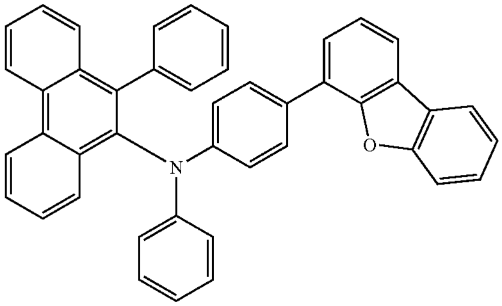
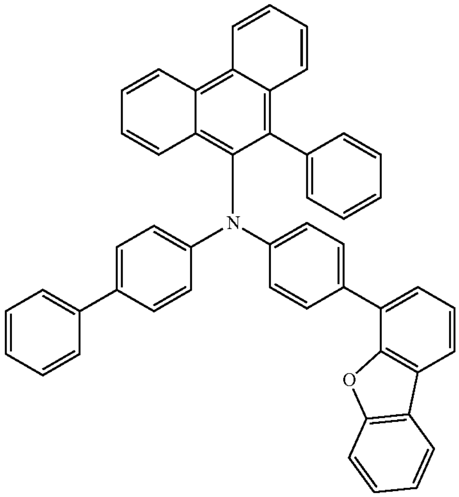
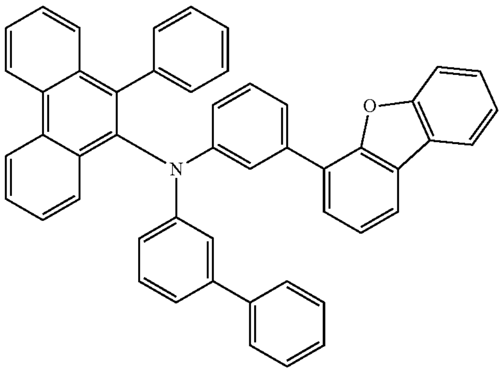
-continued
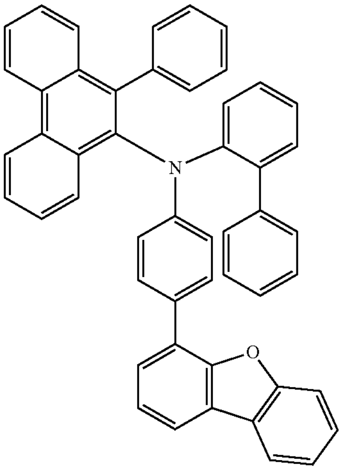
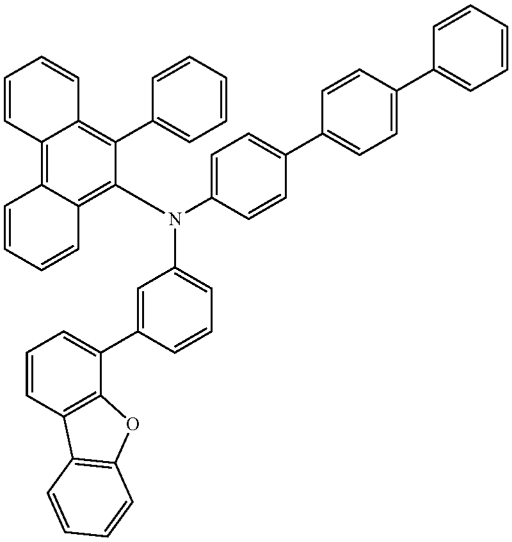
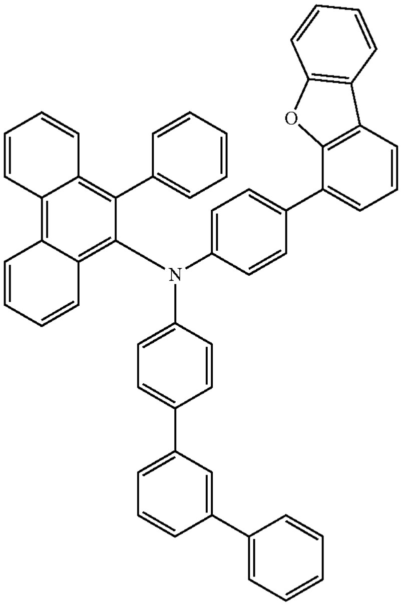

-continued
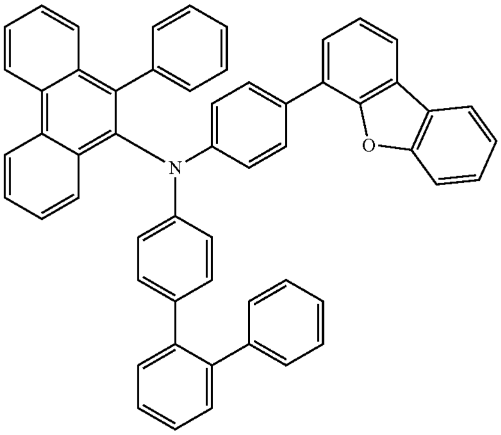
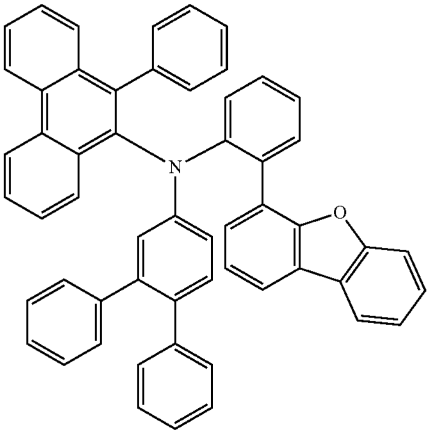
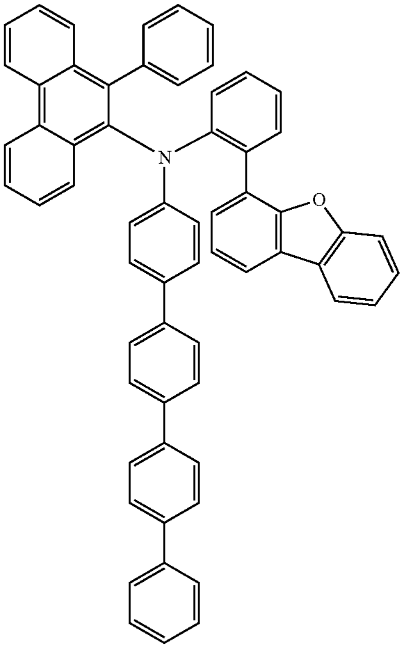
-continued
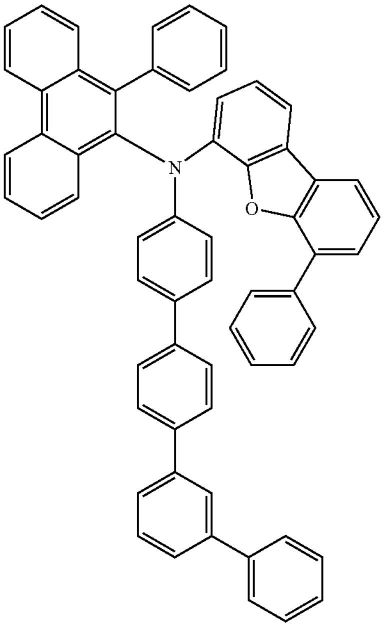
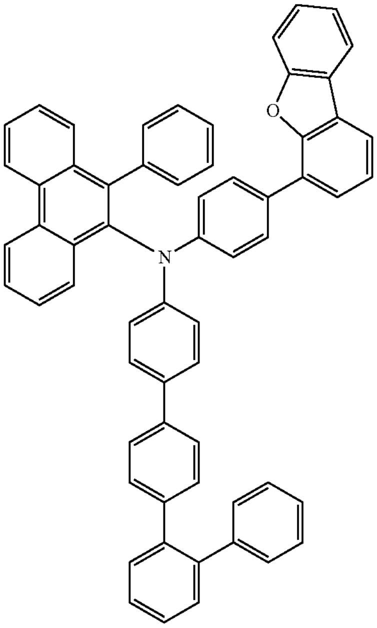

-continued
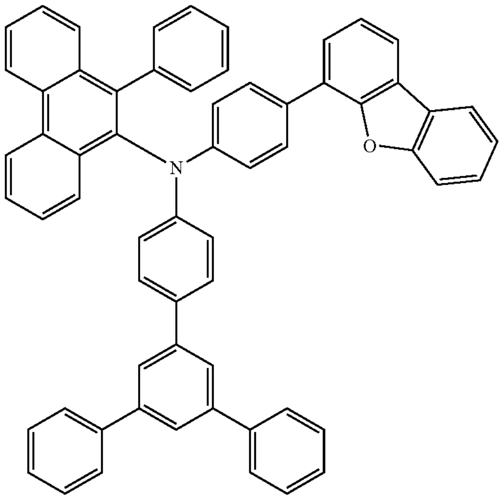
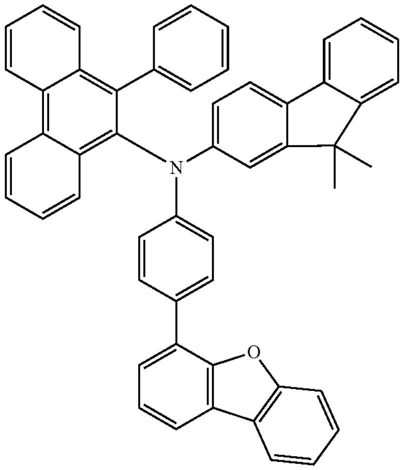
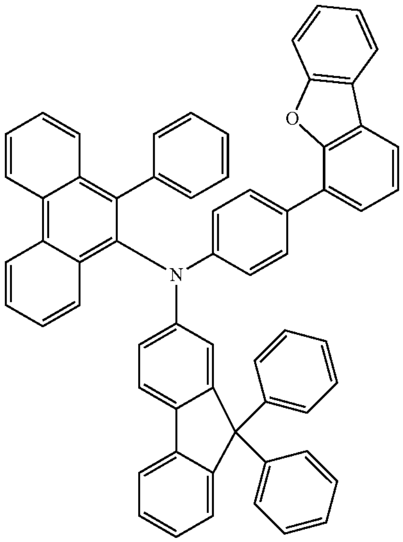
-continued
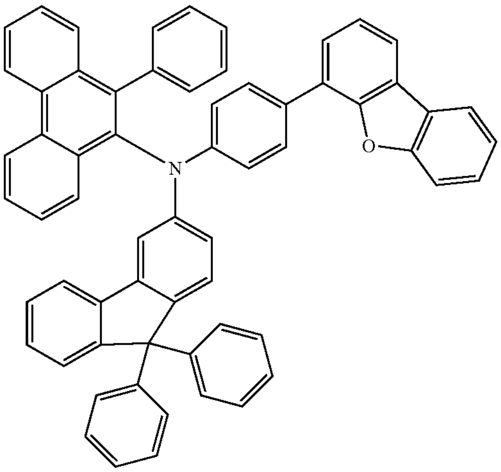
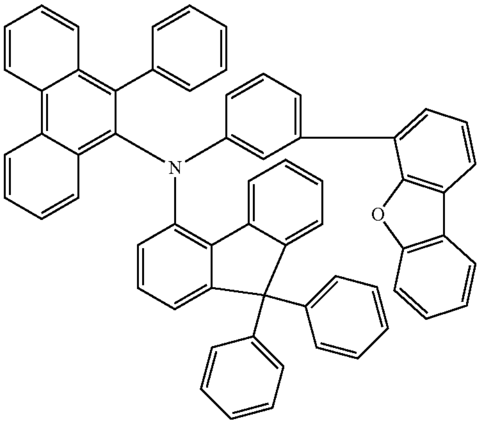
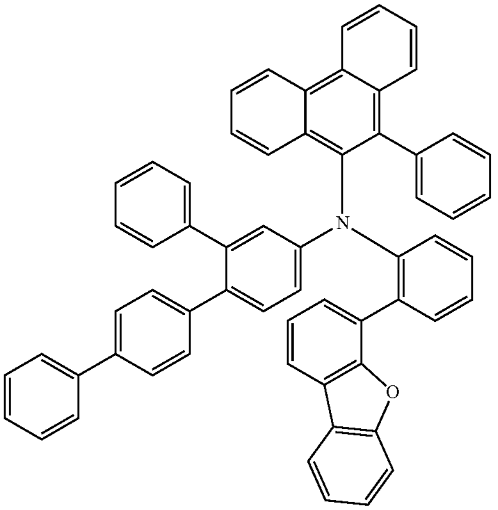

-continued
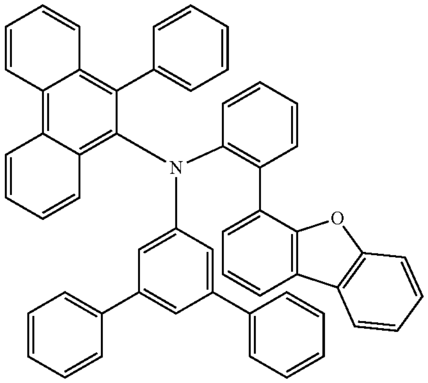
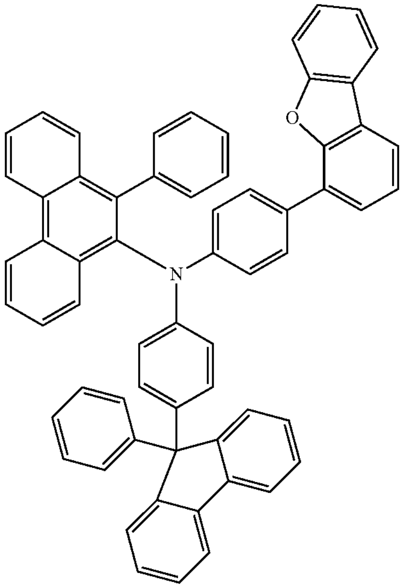
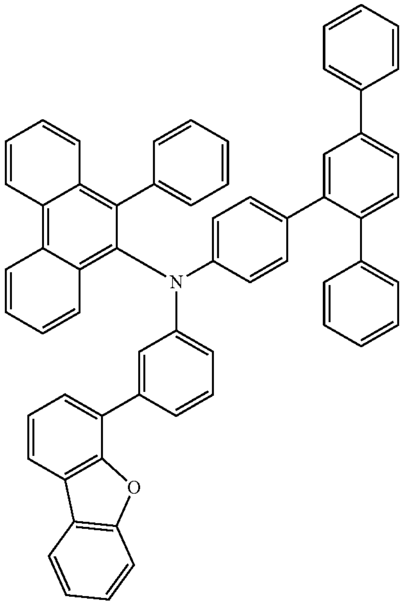 [SMILES: c1ccc(-c2ccc(-c3ccccc3)c(-c3ccc(N(c4cccc(-c5cccc6c5oc5ccccc56)c4)c4c(-c5ccccc5)c5ccccc5c5ccccc45)cc3)c2)cc1]
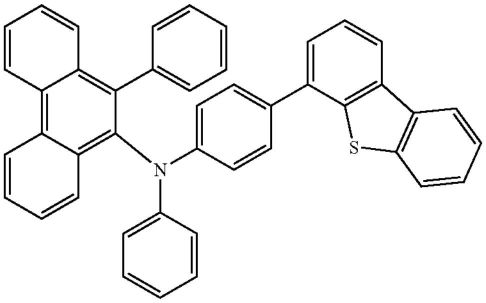
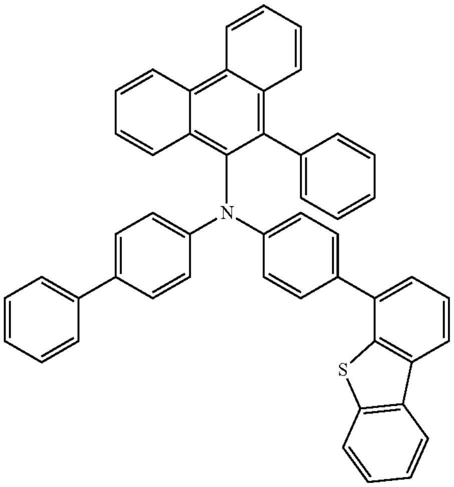
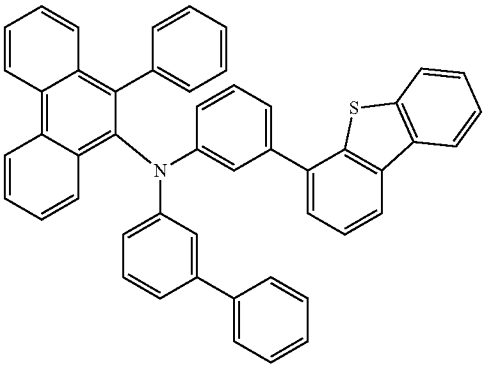
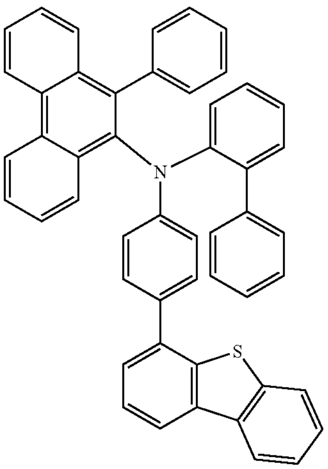

-continued
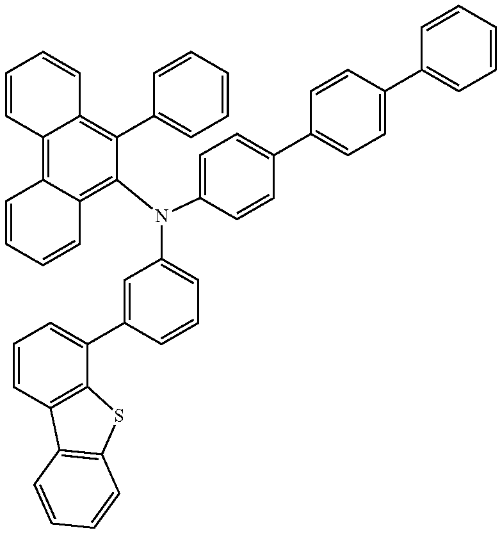
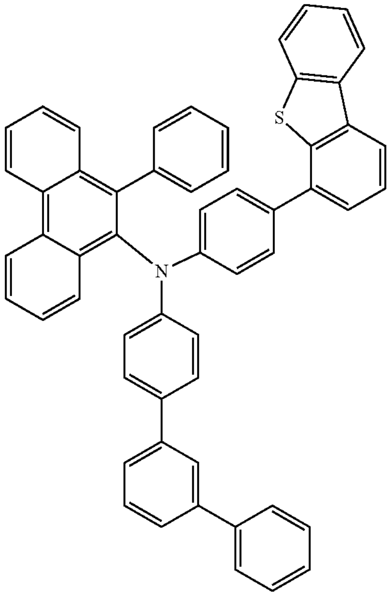
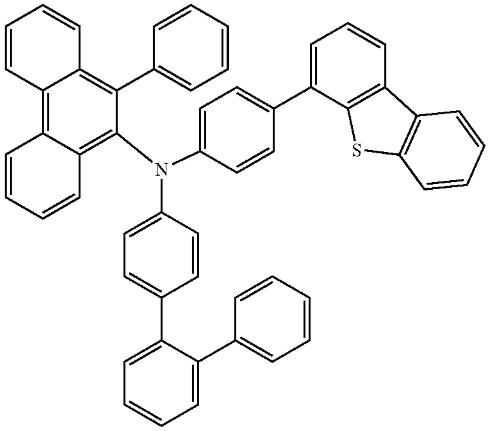
-continued
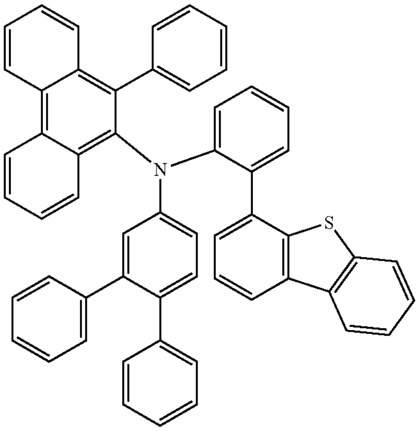
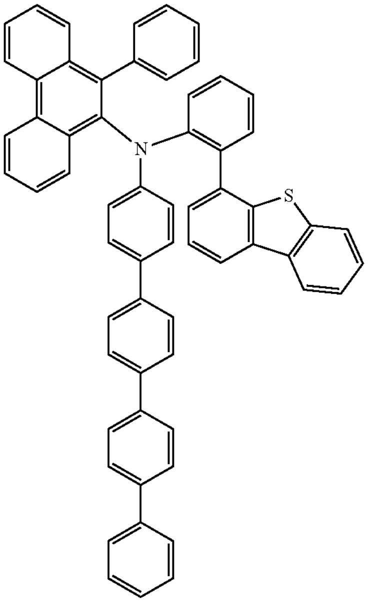
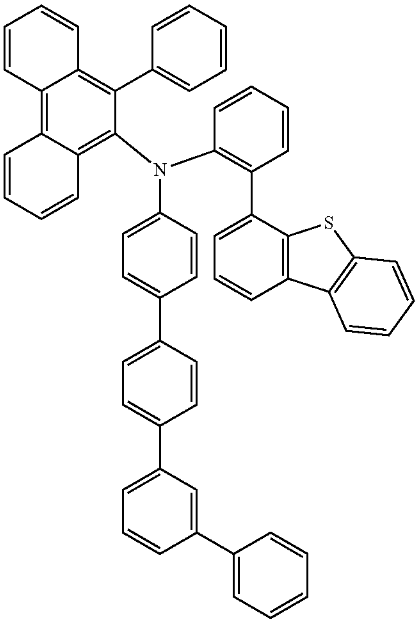

-continued
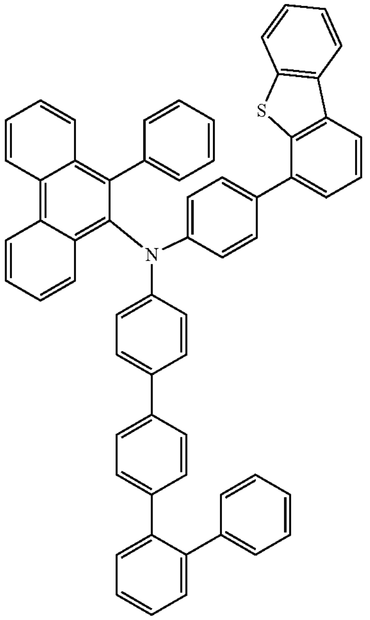
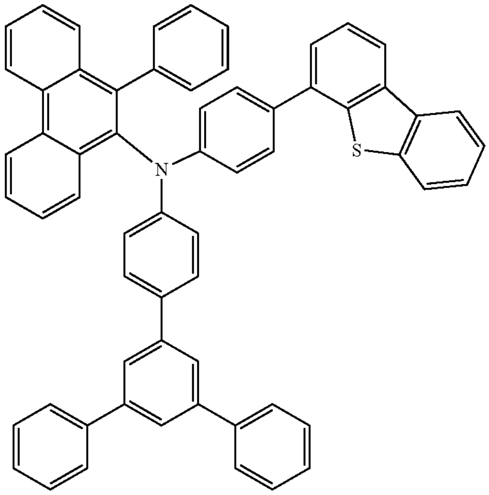
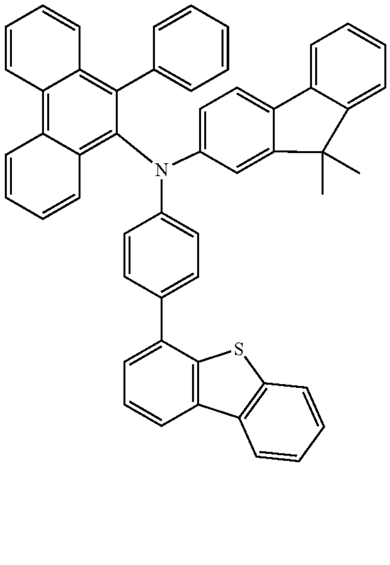
-continued
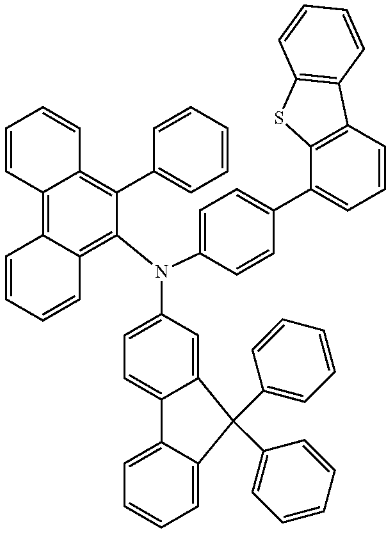
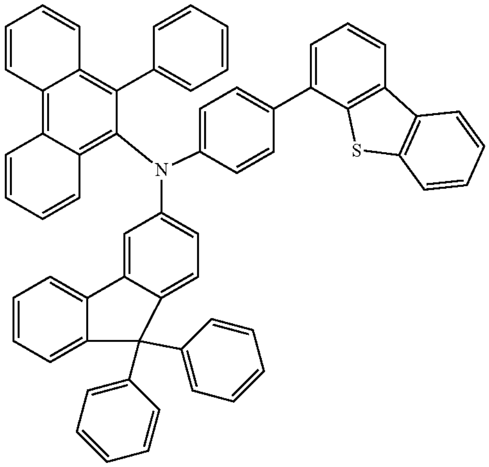
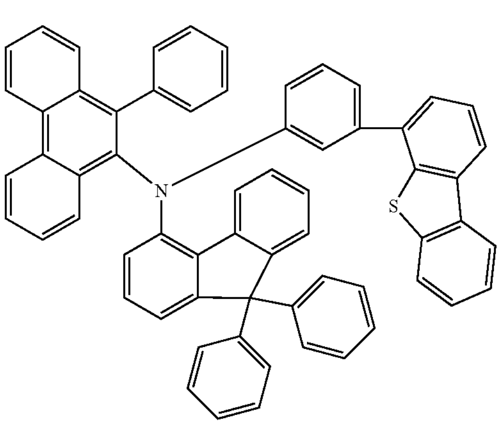

-continued
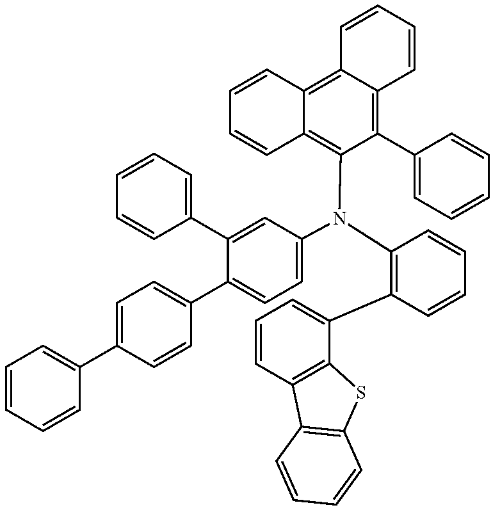
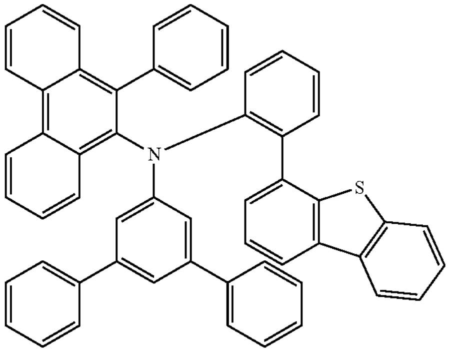
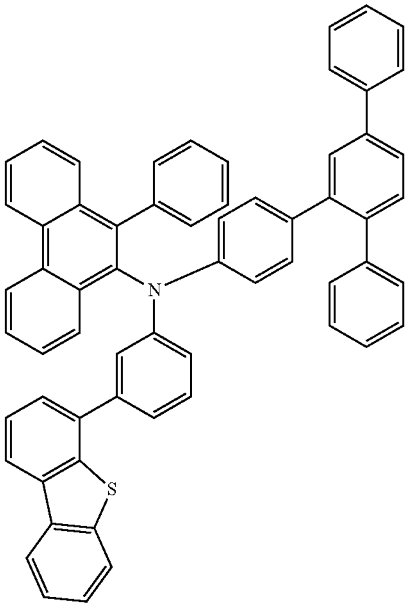
-continued
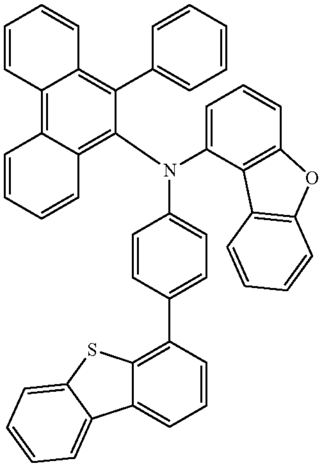 [SMILES: c1ccc(-c2c(N(c3ccc(-c4cccc5c4sc4ccccc45)cc3)c3cccc4oc5ccccc5c34)c3ccccc3c3ccccc23)cc1]
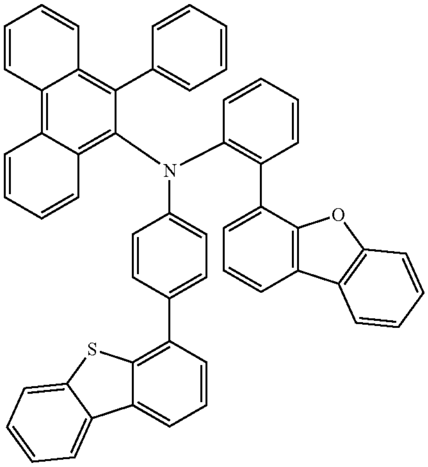
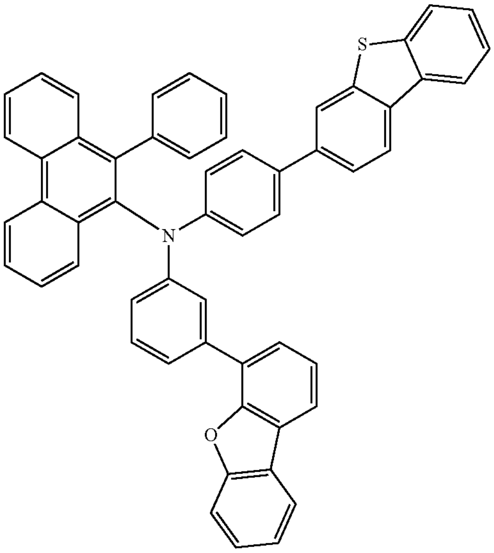

-continued
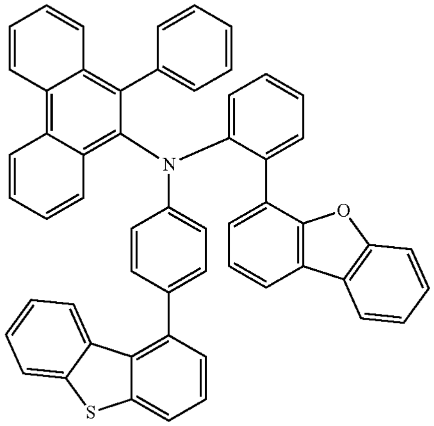
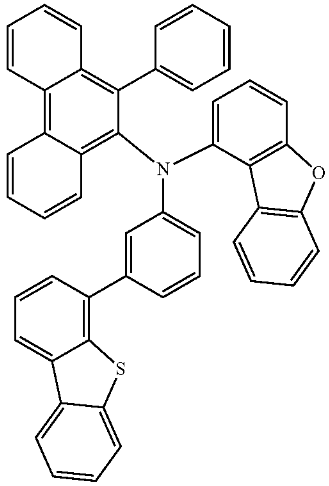
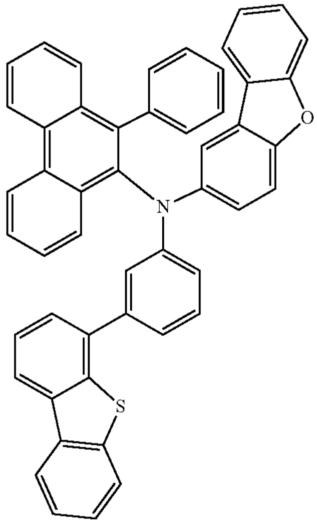
-continued
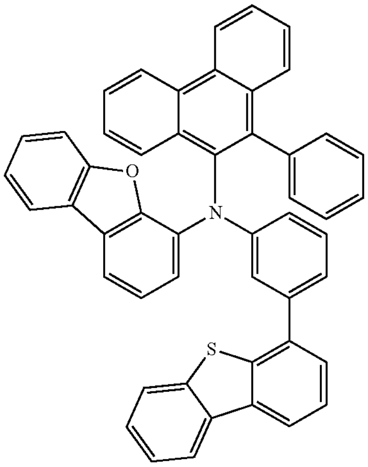
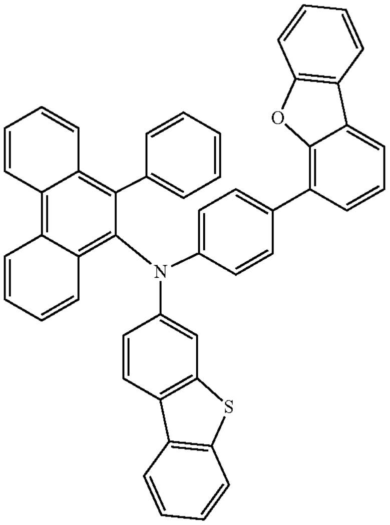
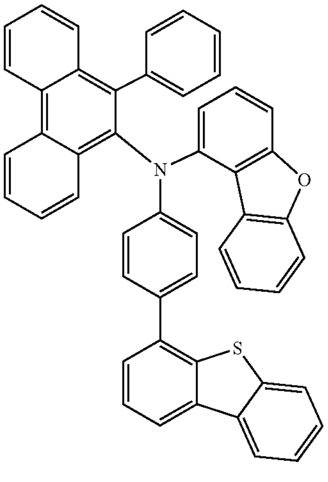

-continued
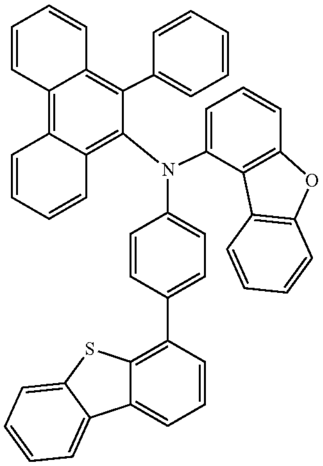
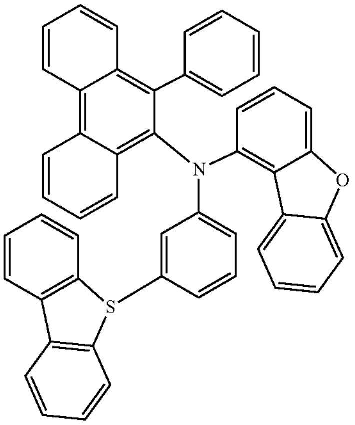
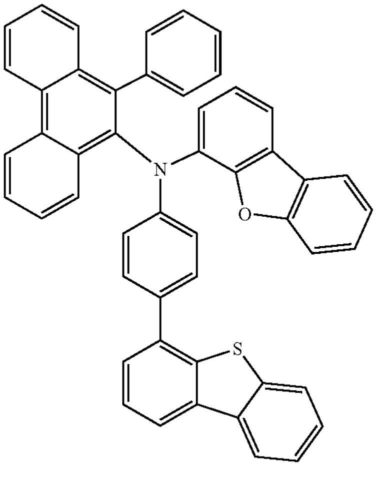
-continued
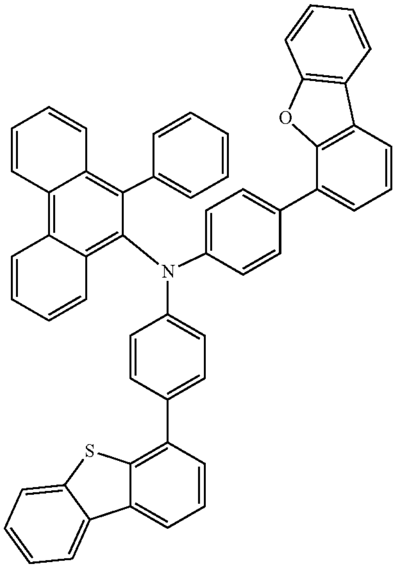
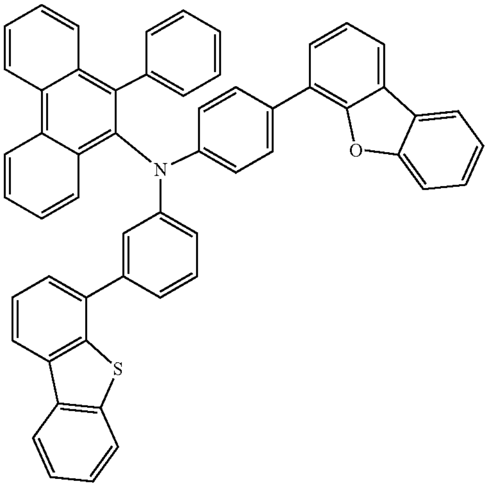
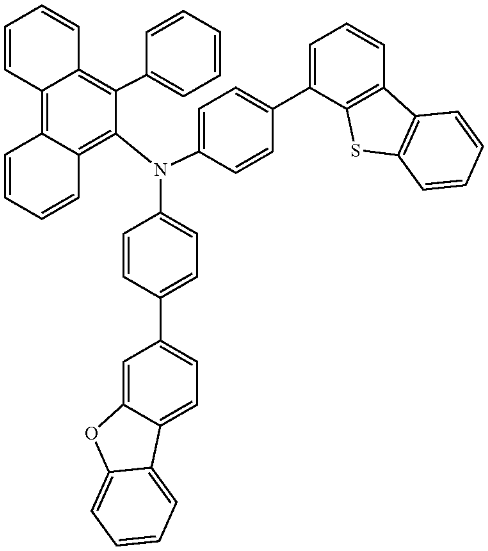

-continued
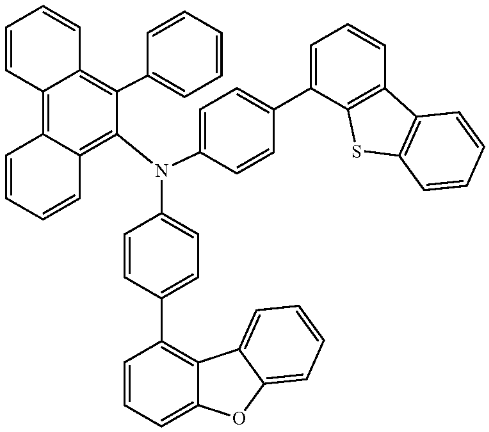
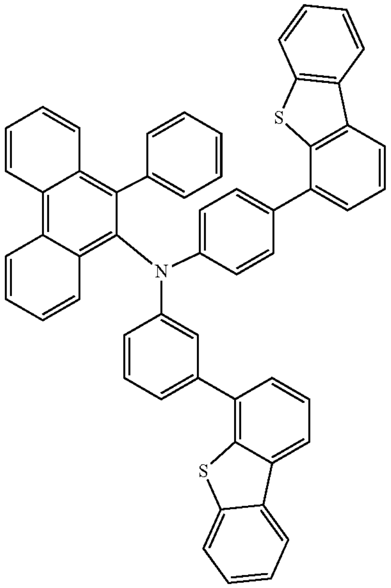
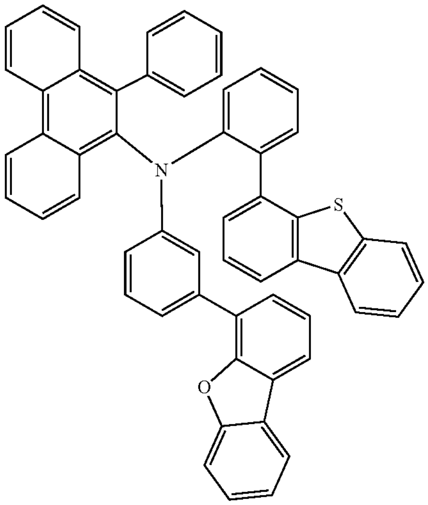
-continued
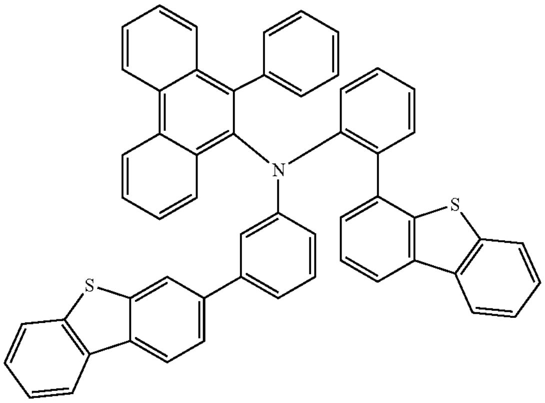
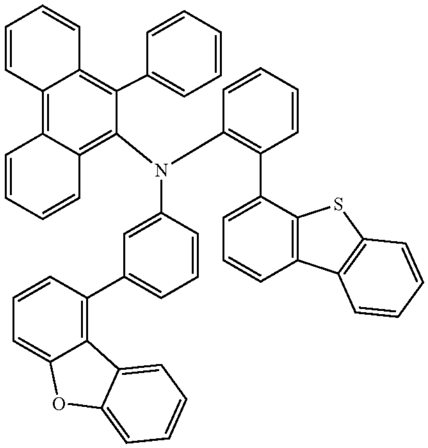
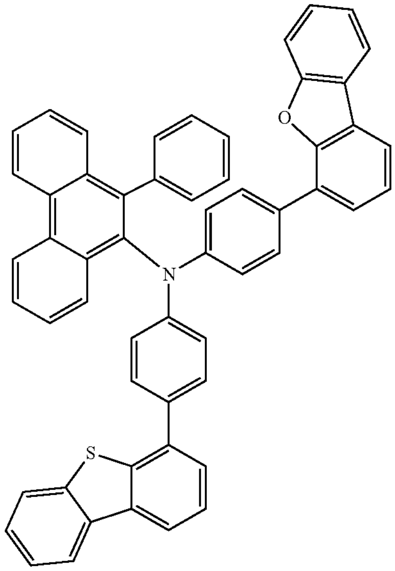

-continued
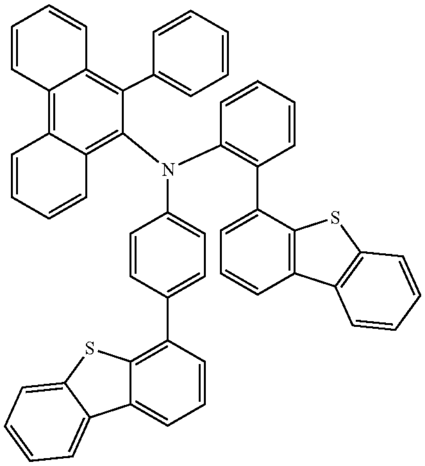
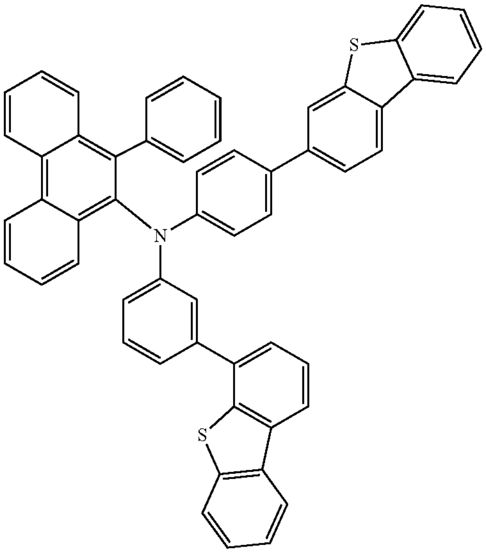
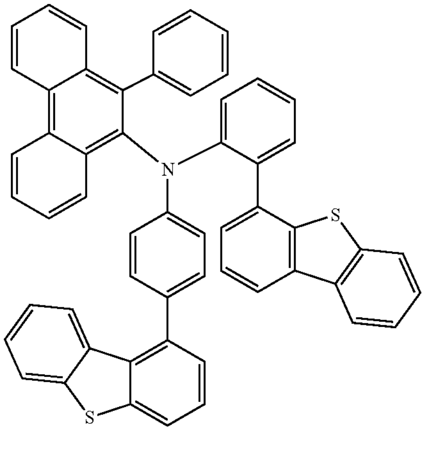
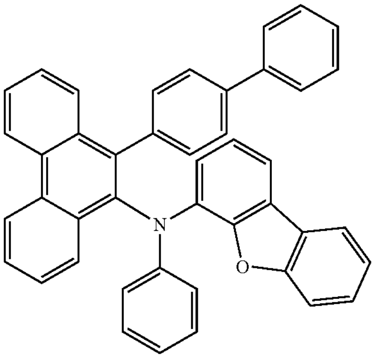
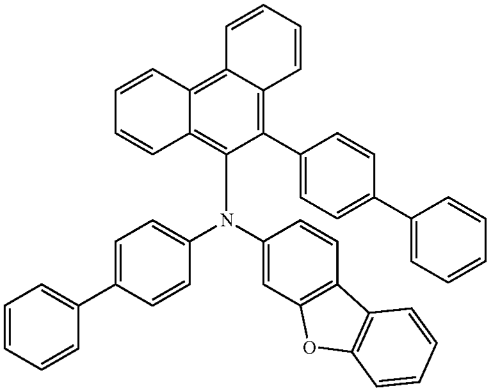
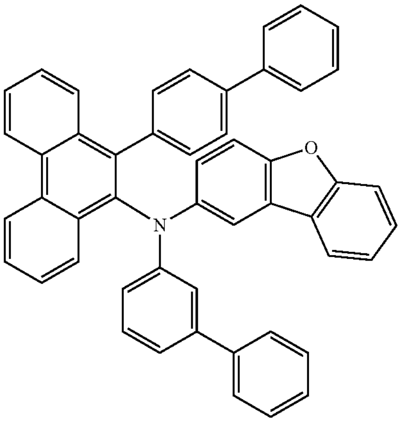
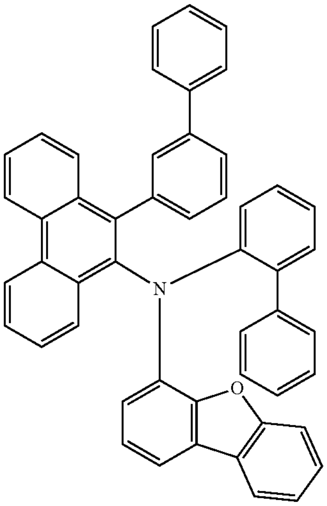

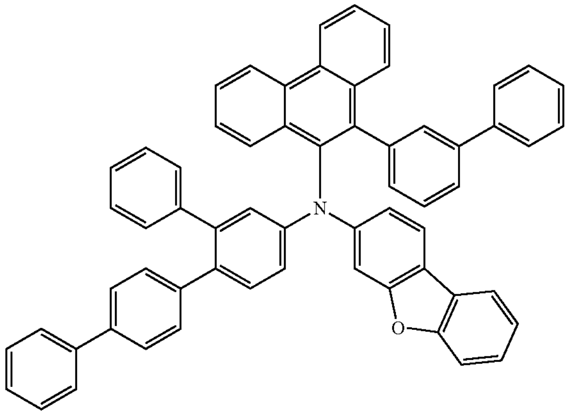
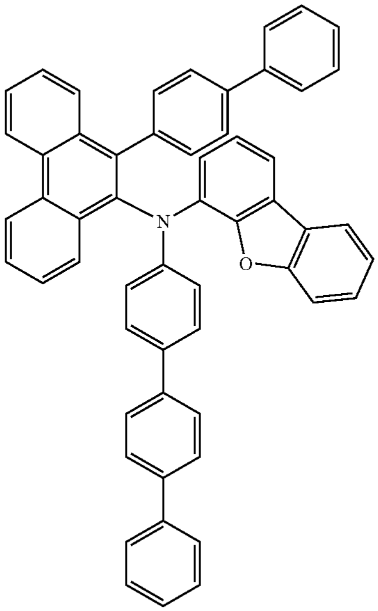
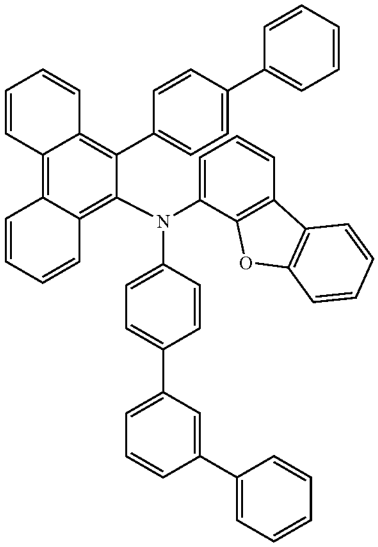
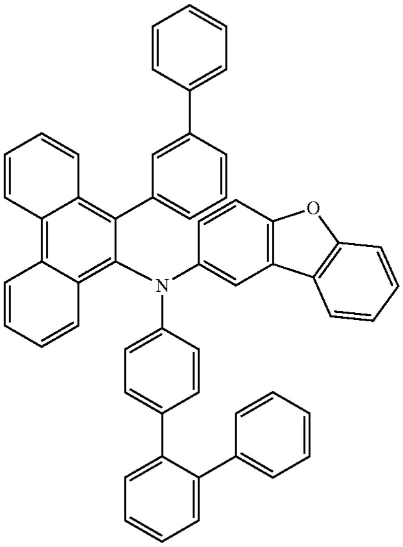
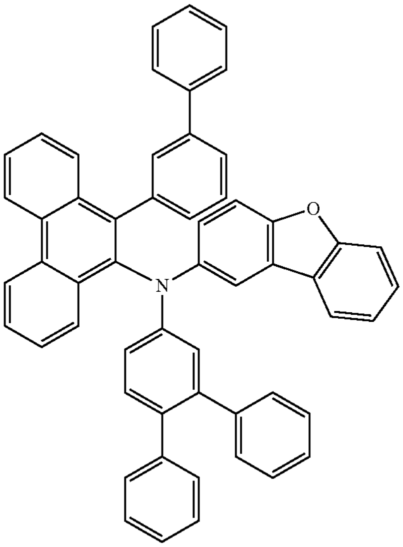
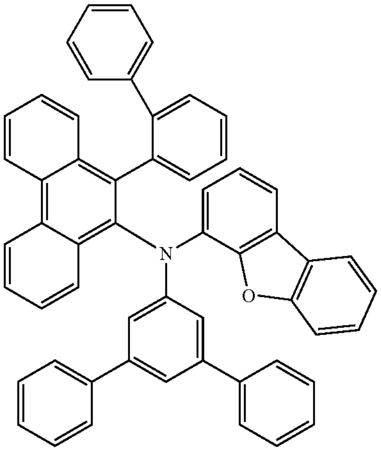

-continued
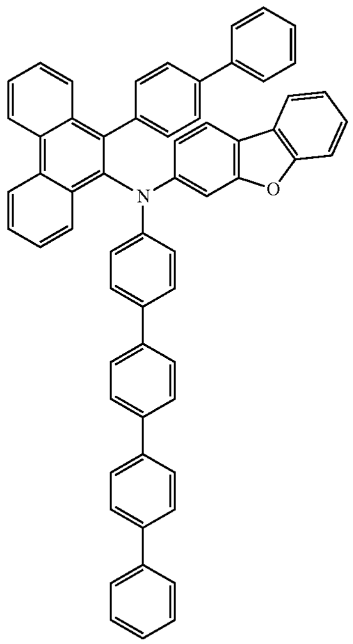
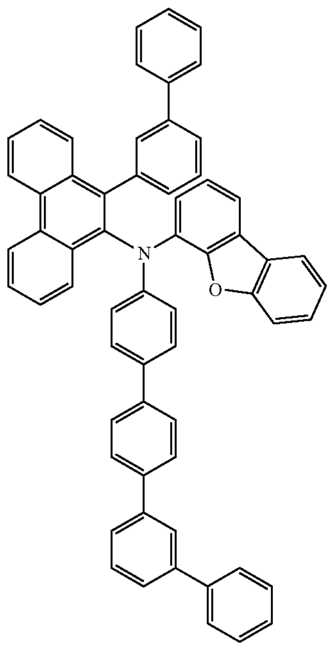
-continued
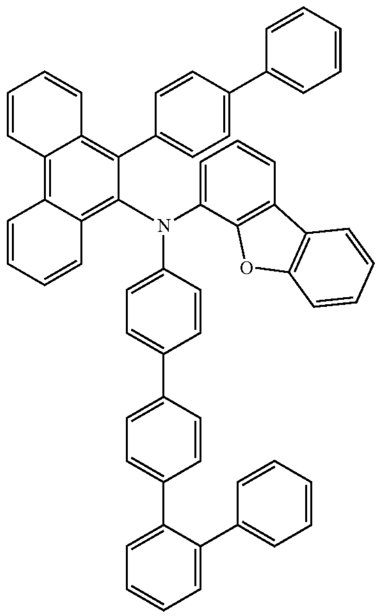
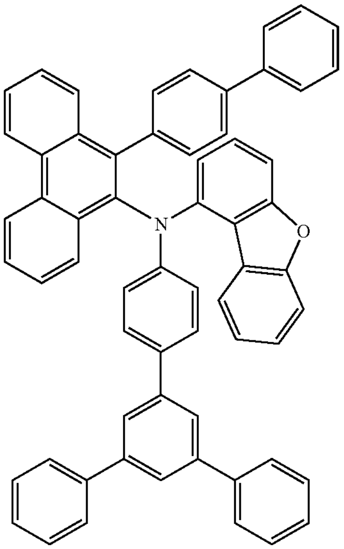

-continued
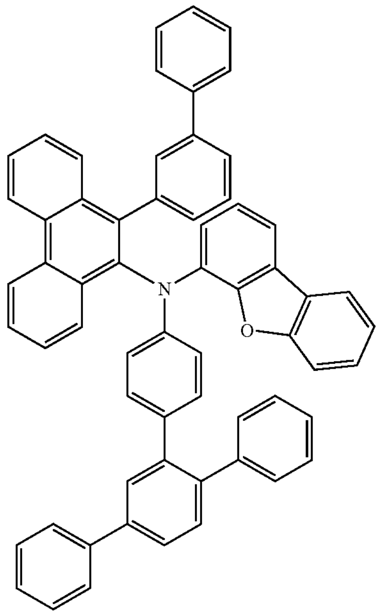
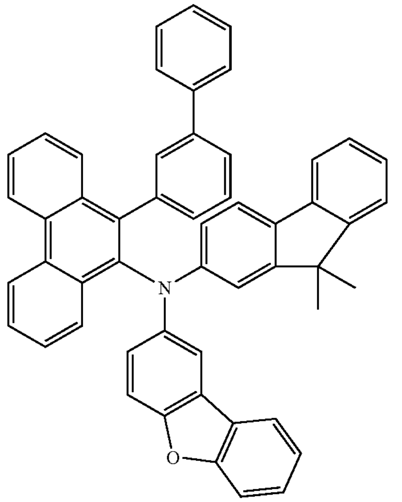
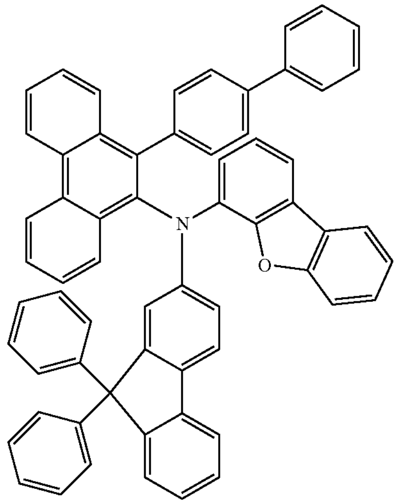
-continued
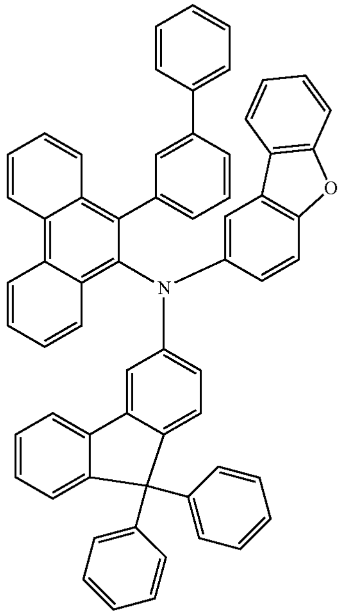
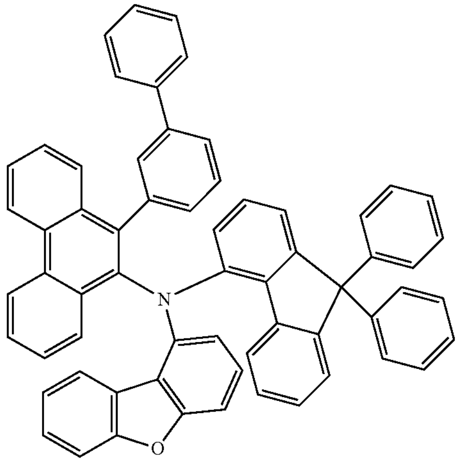
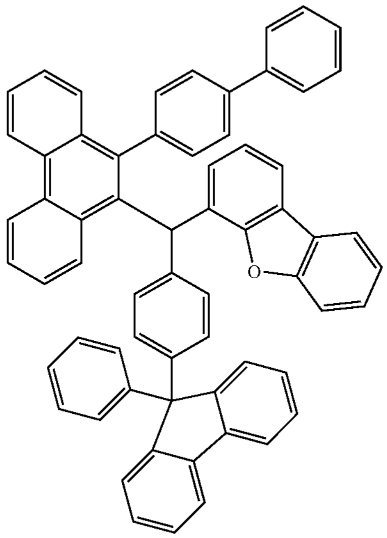

-continued
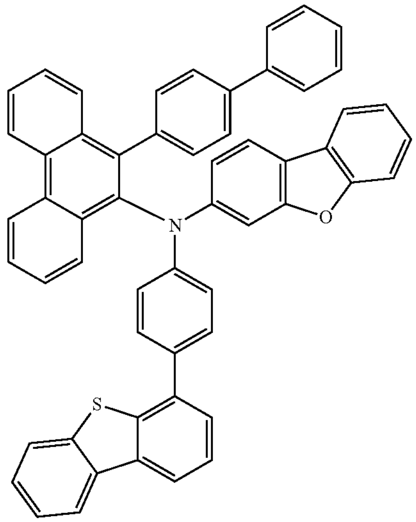
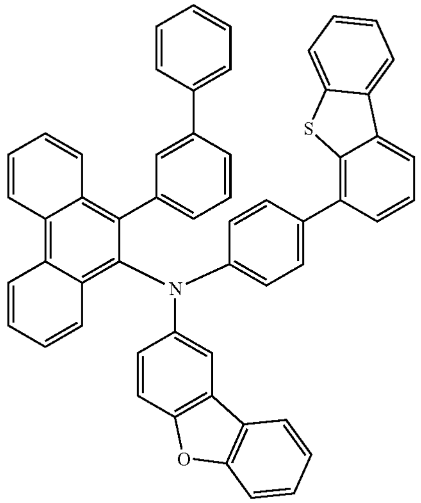
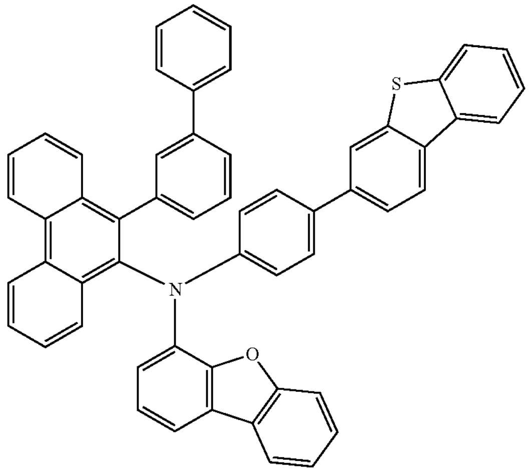
-continued
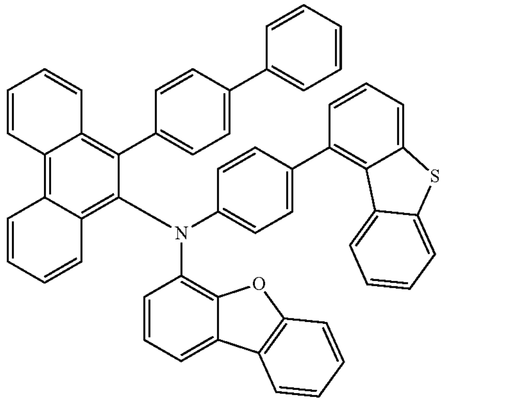
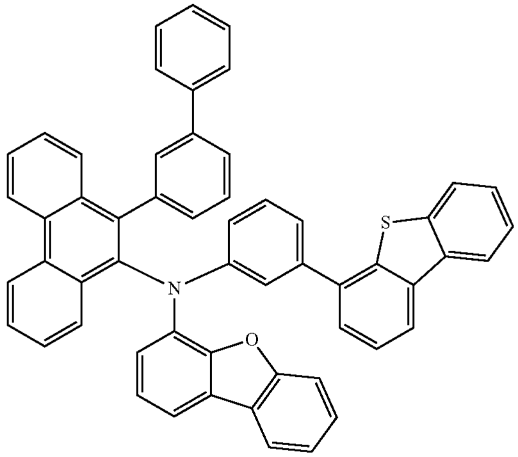
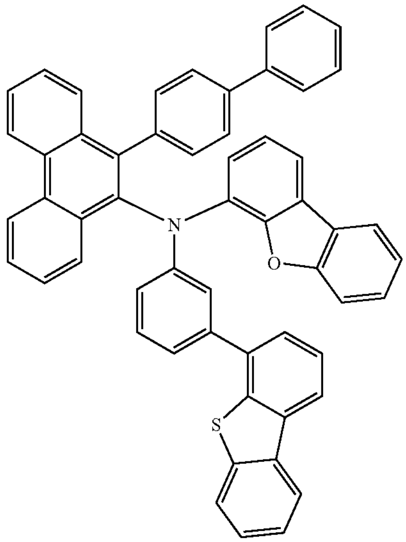

-continued
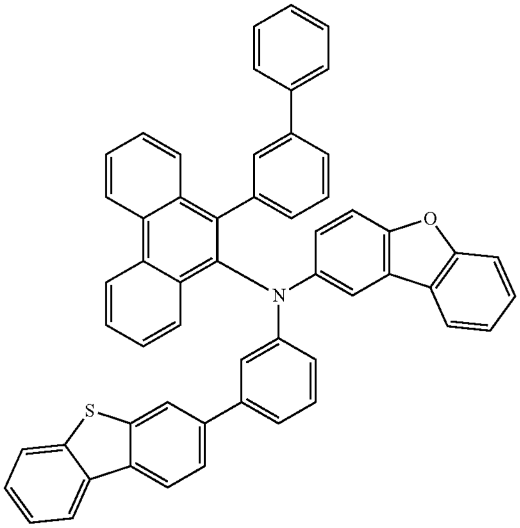
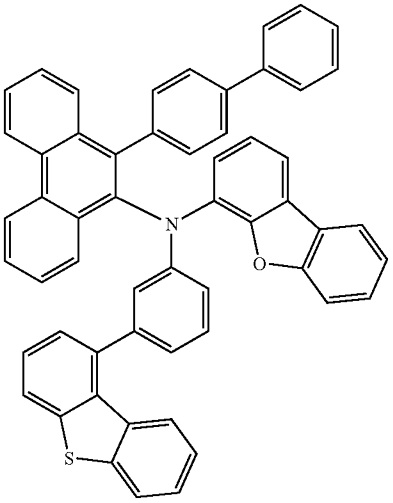
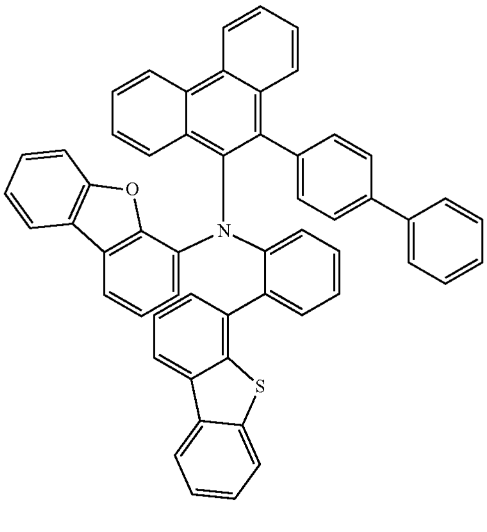
-continued
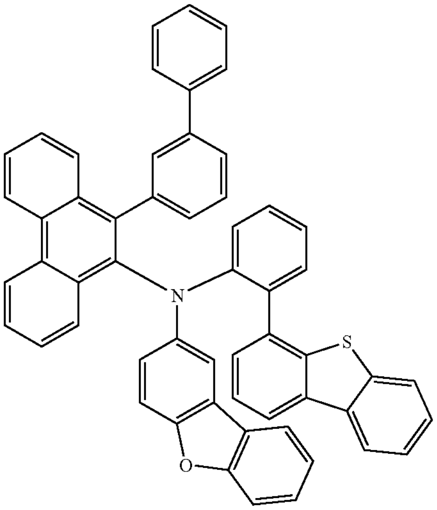
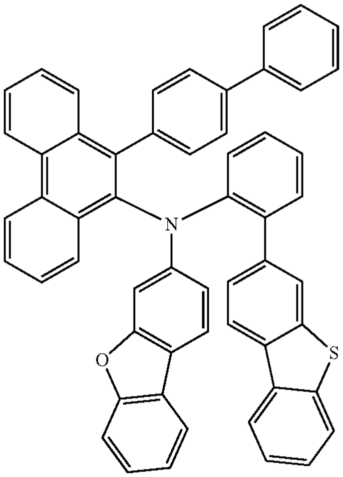
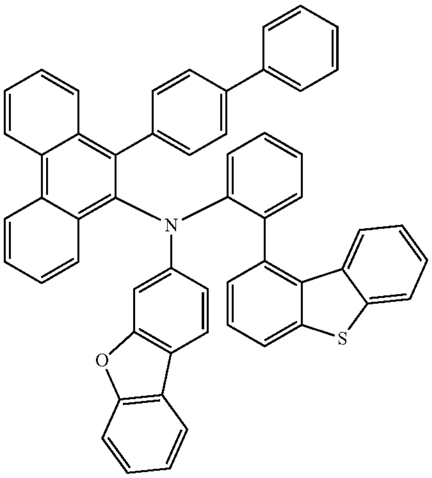

-continued
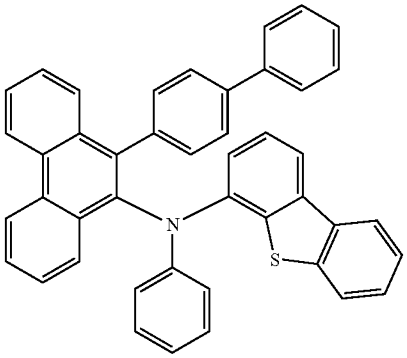
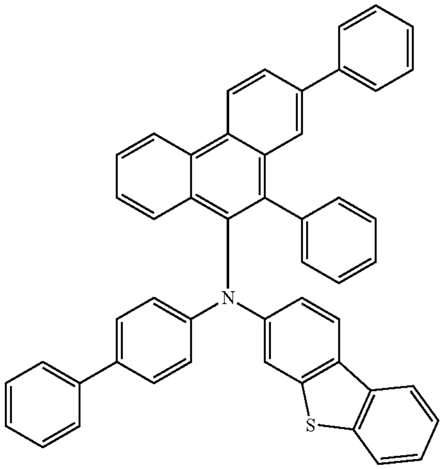
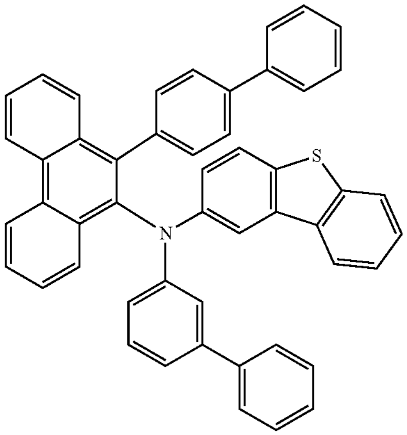
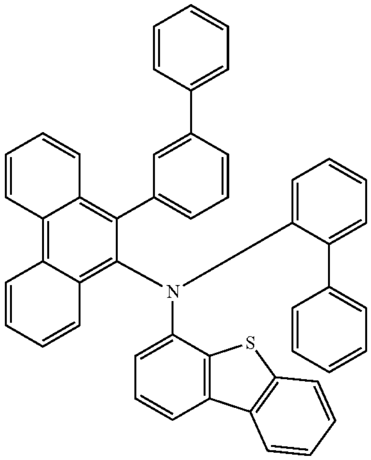
-continued
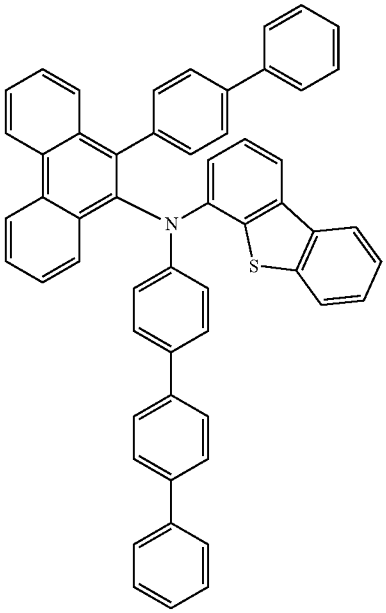
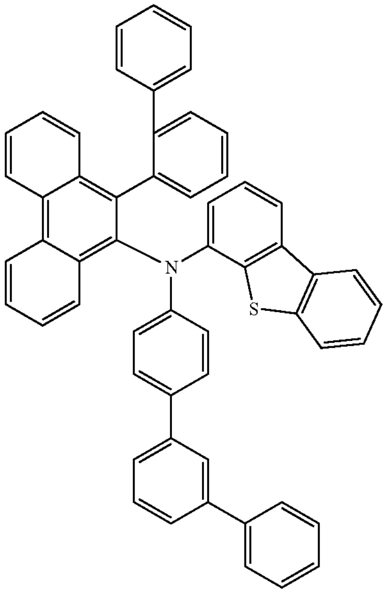

-continued
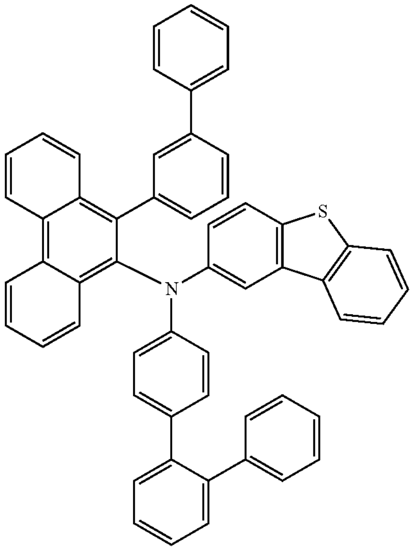
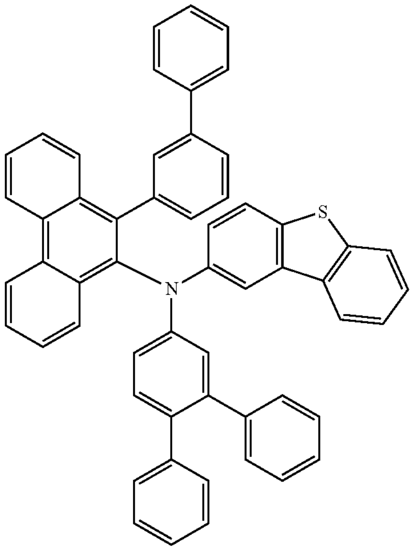
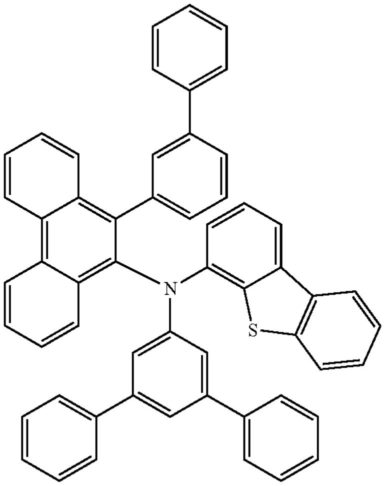
-continued
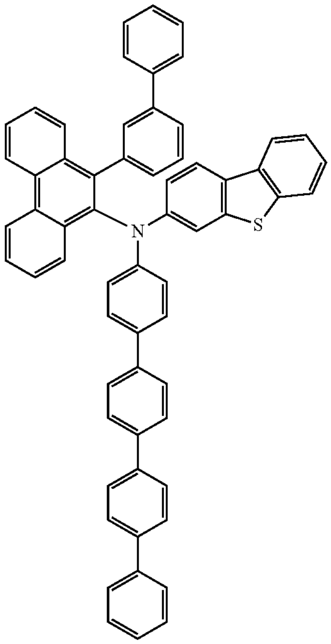
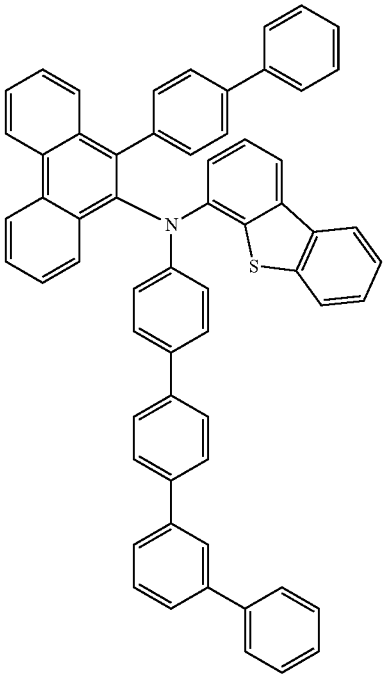

-continued
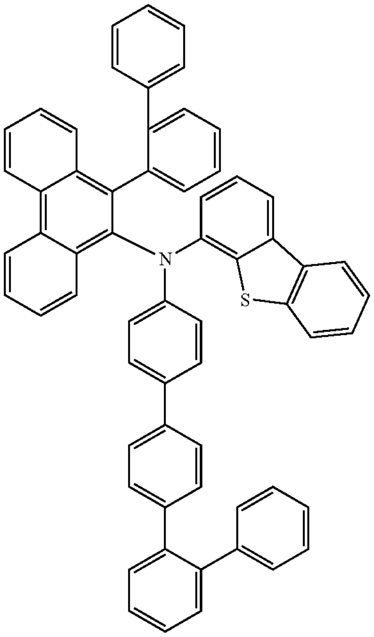
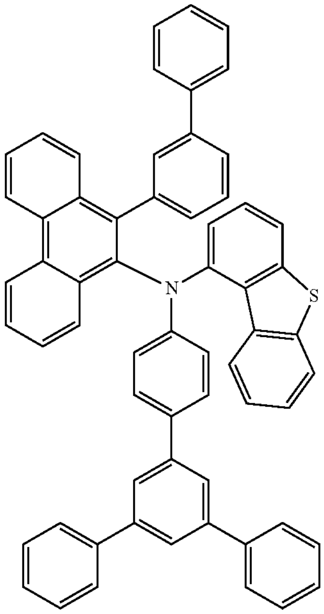
-continued
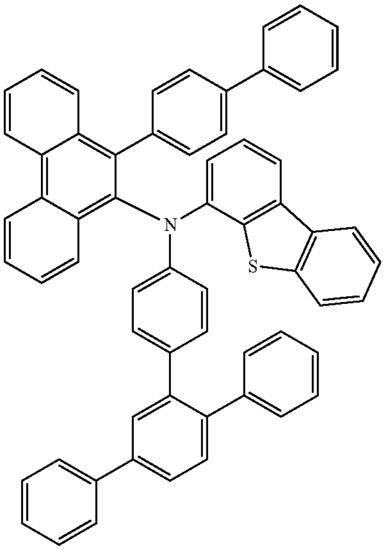
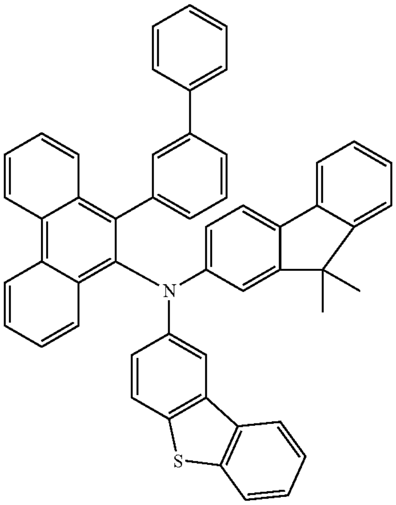
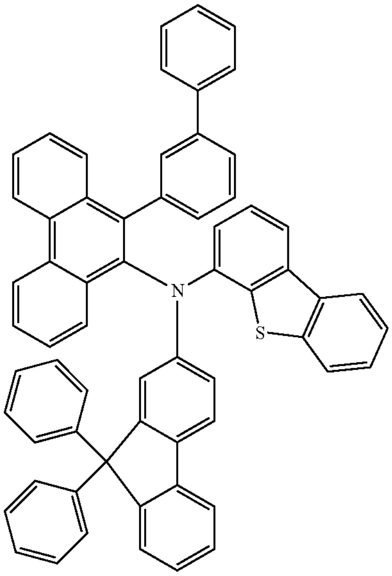

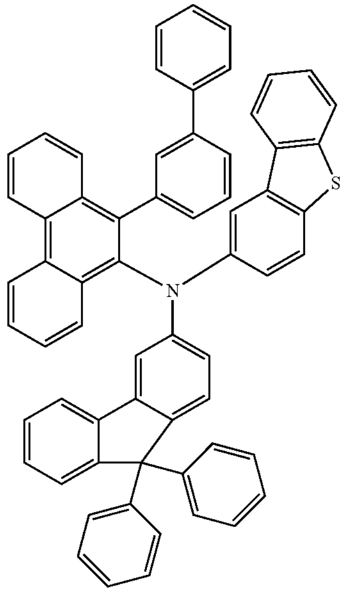
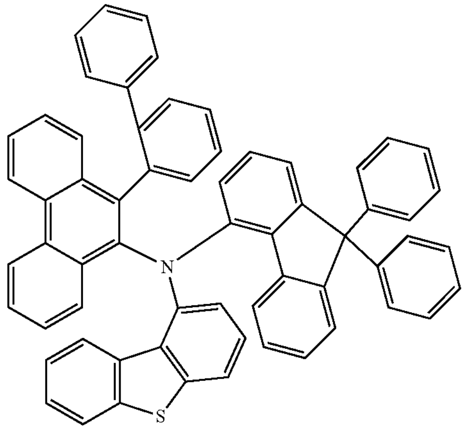
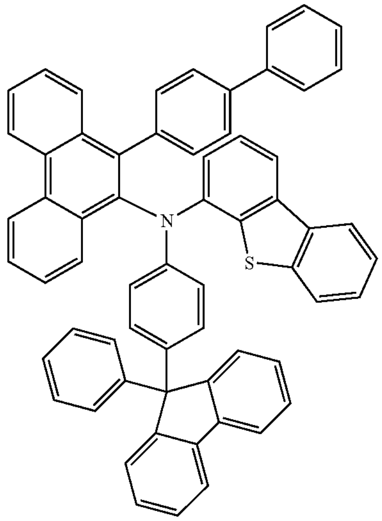
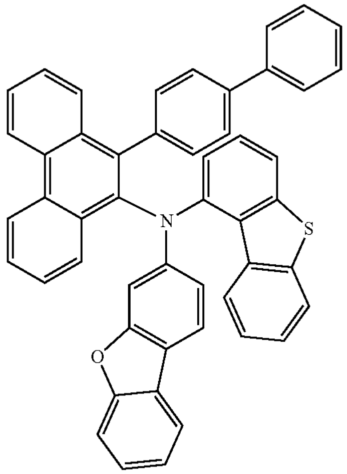
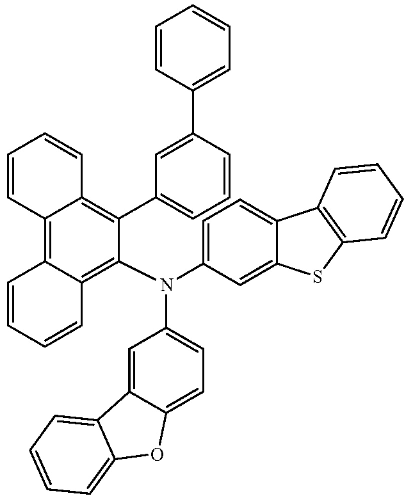
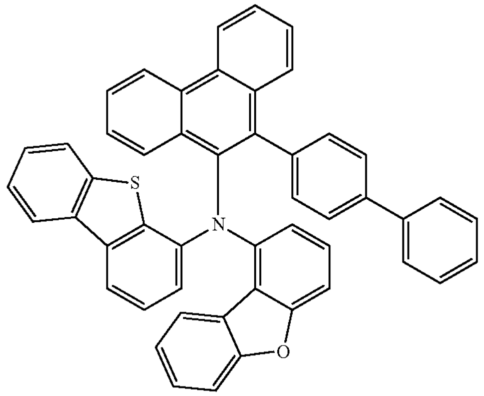

-continued
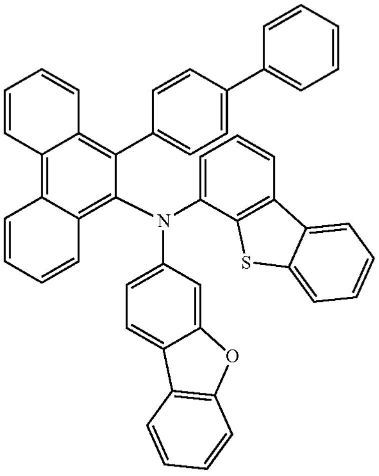
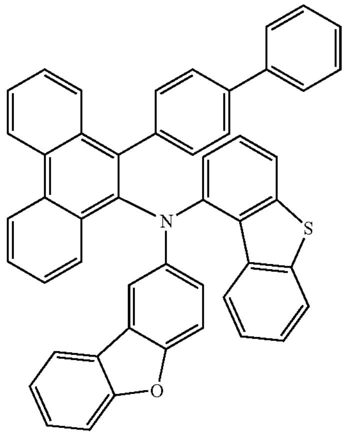
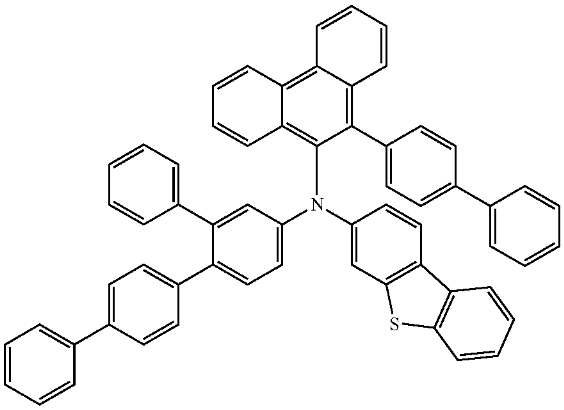
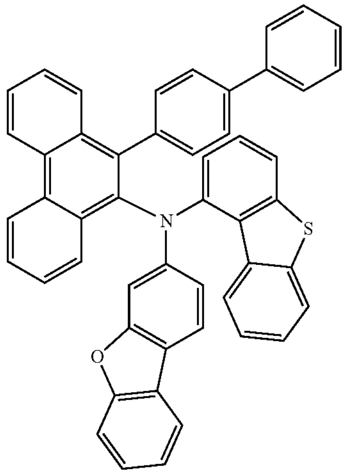
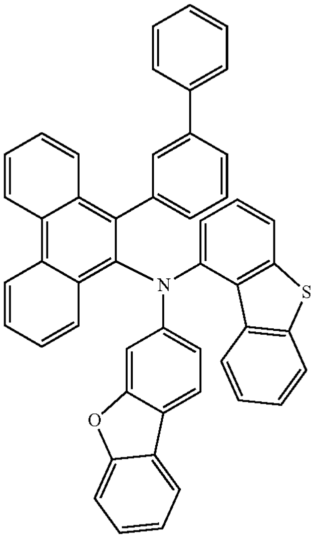
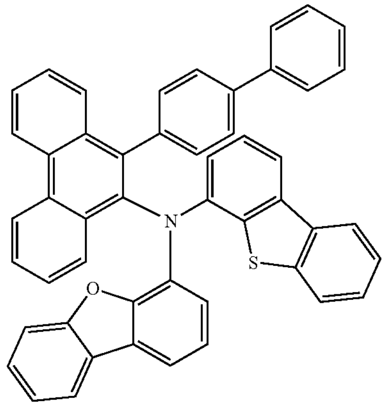
-continued -continued
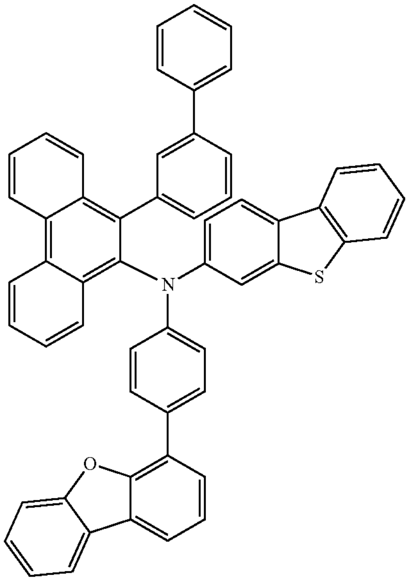
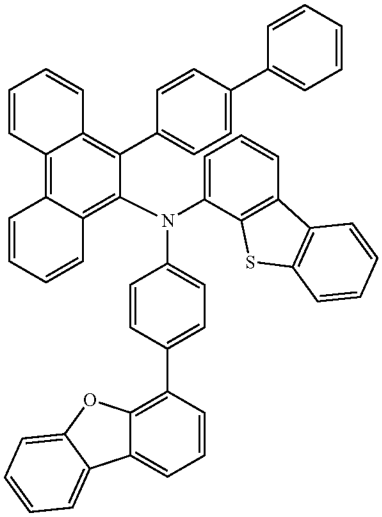
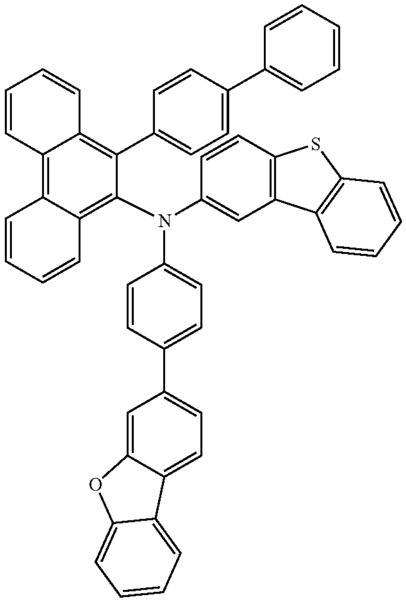
-continued
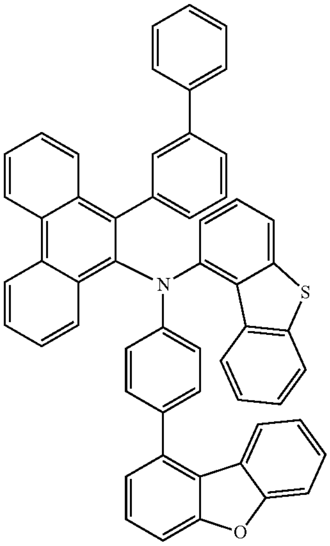
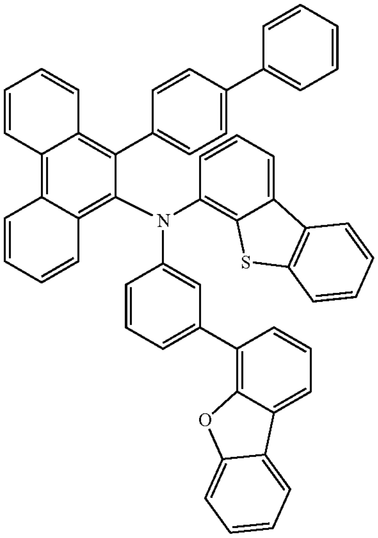
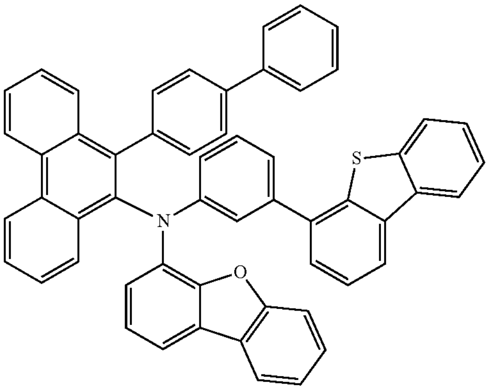

-continued
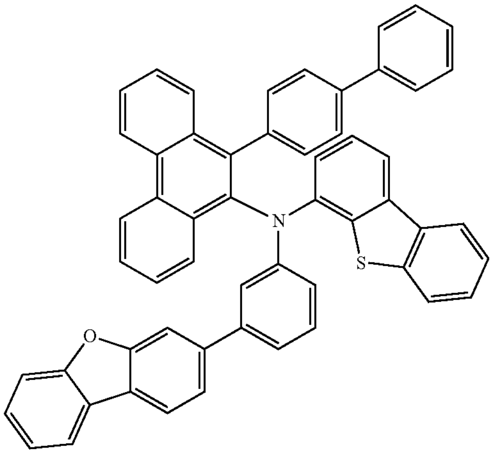
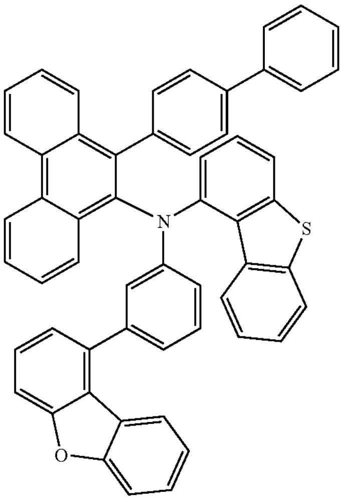
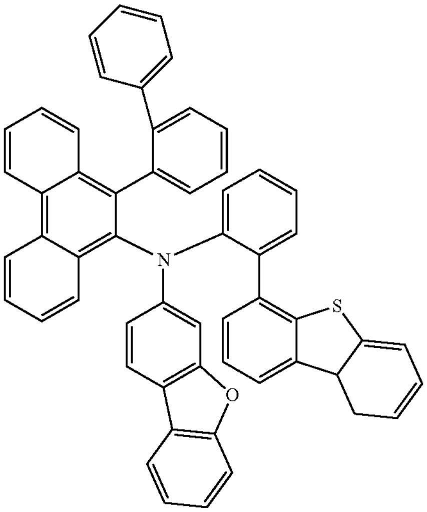
-continued
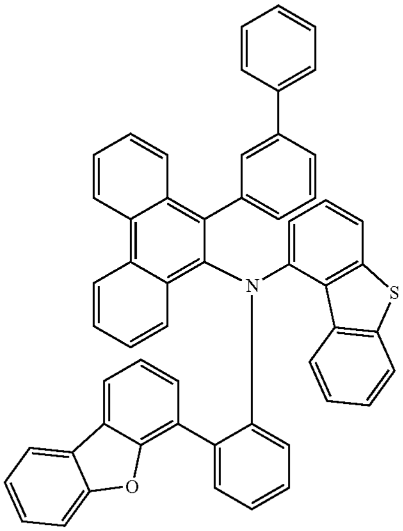
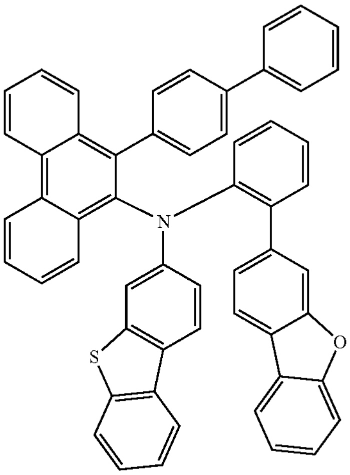
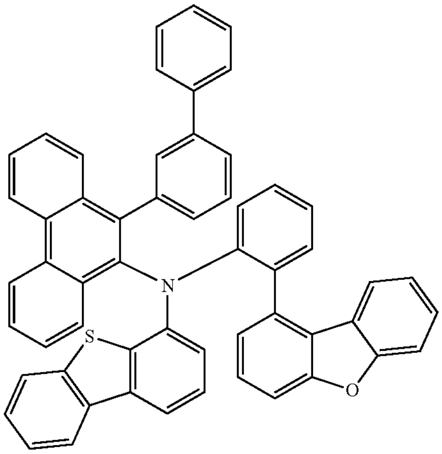

-continued
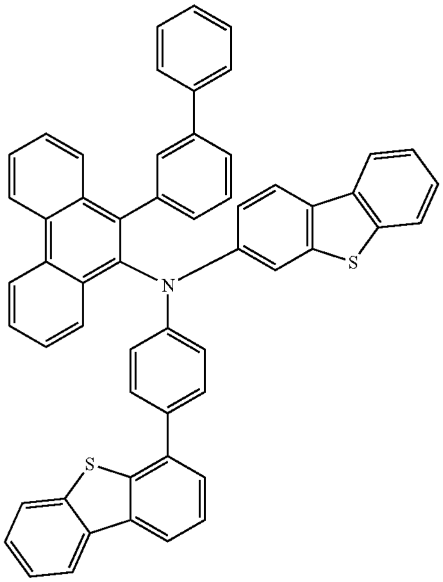
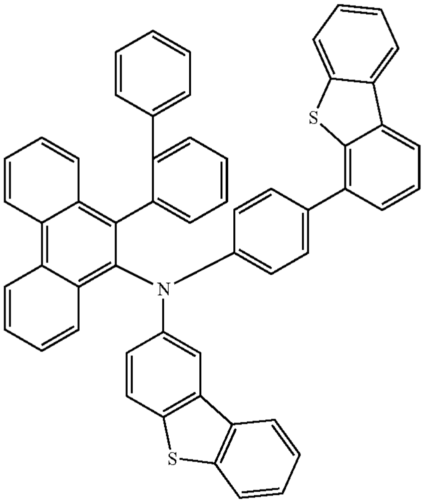
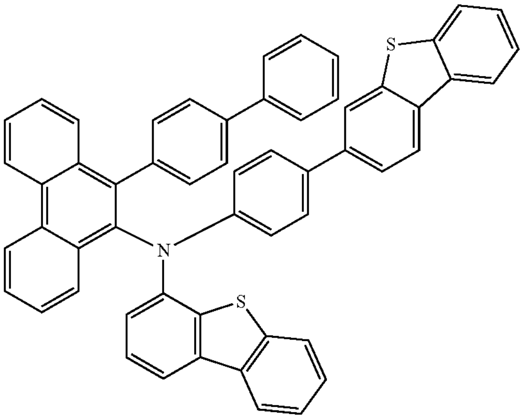
-continued
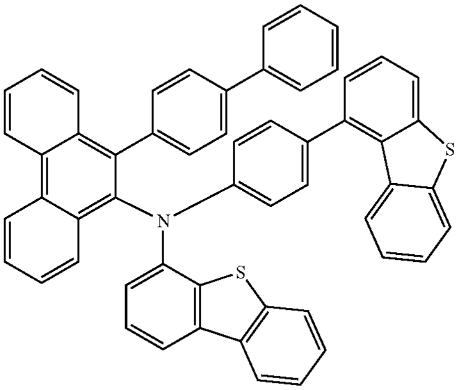
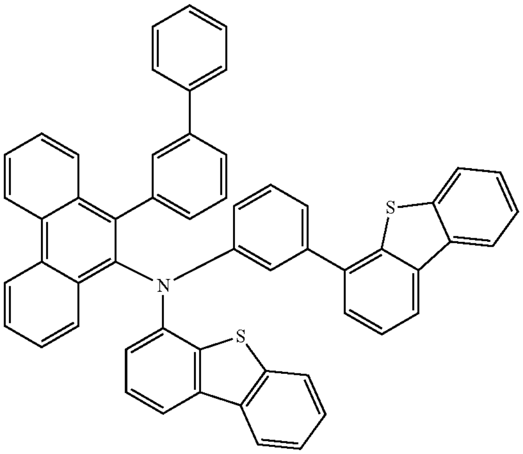
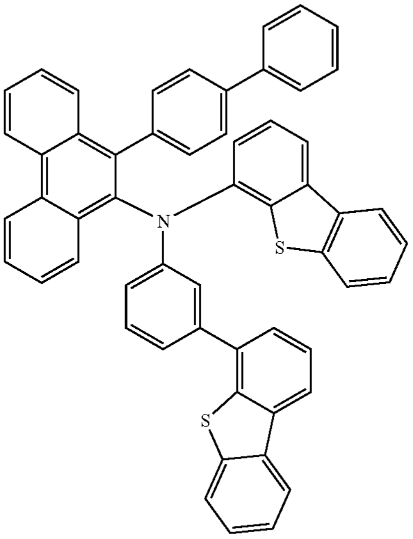

-continued
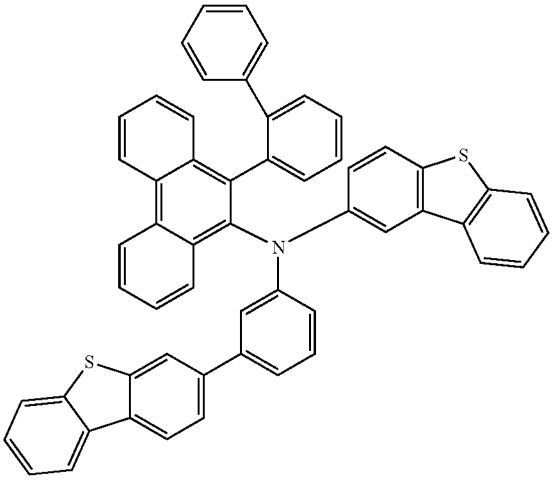
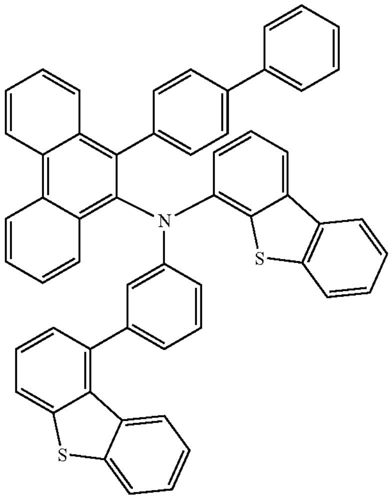
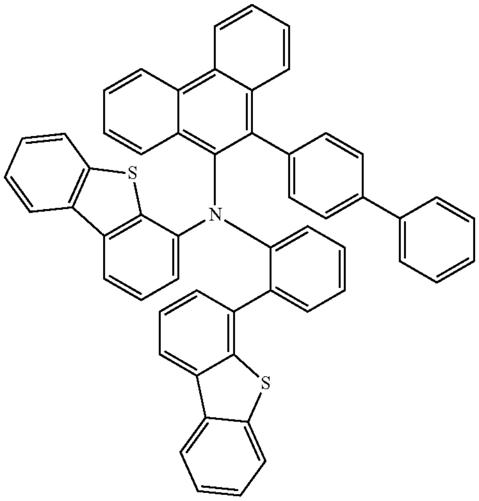
-continued
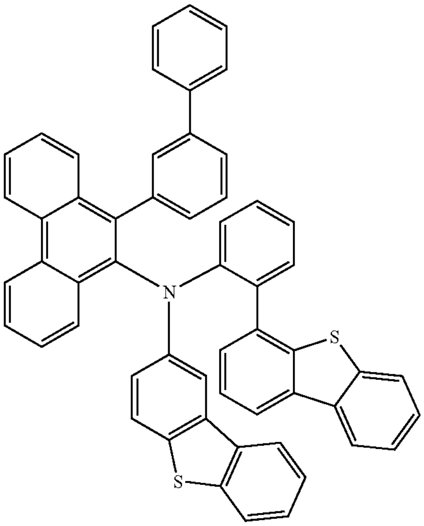
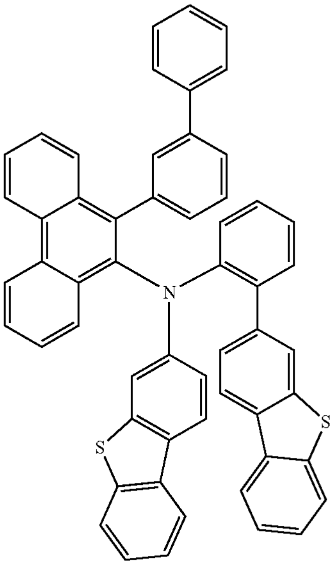
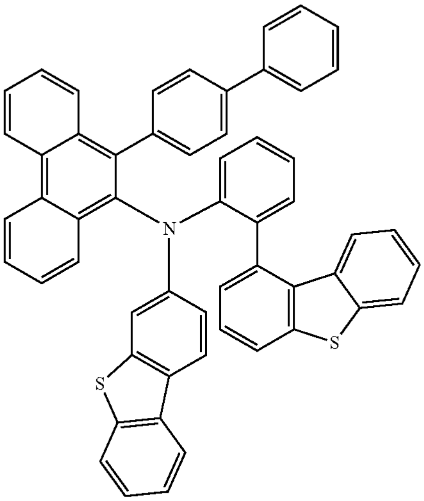

-continued
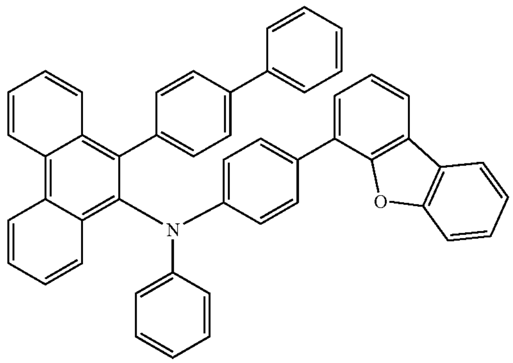
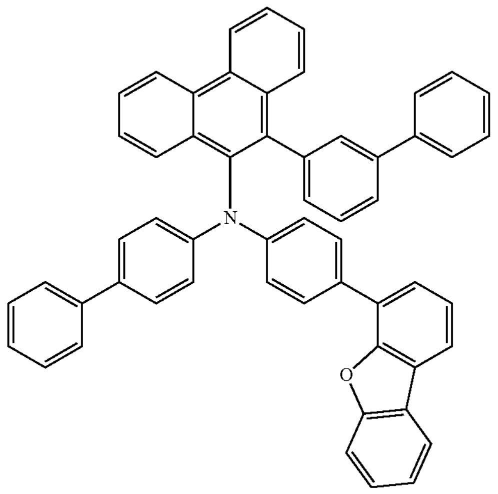
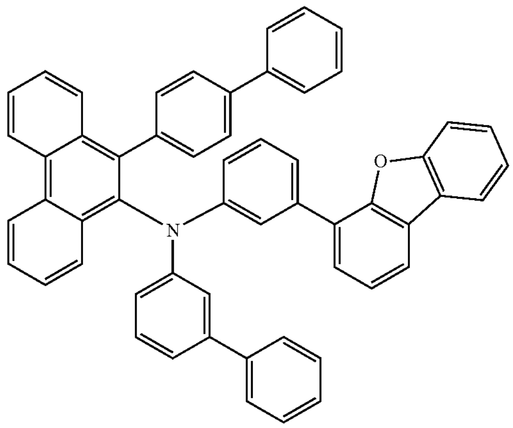
-continued
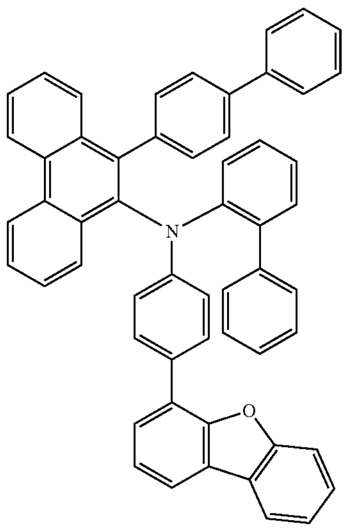
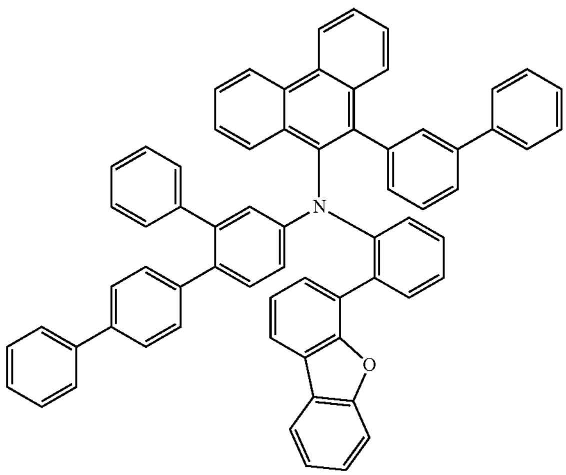
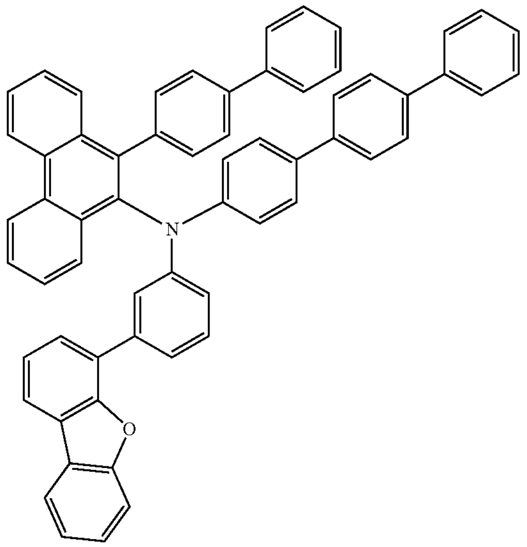

-continued
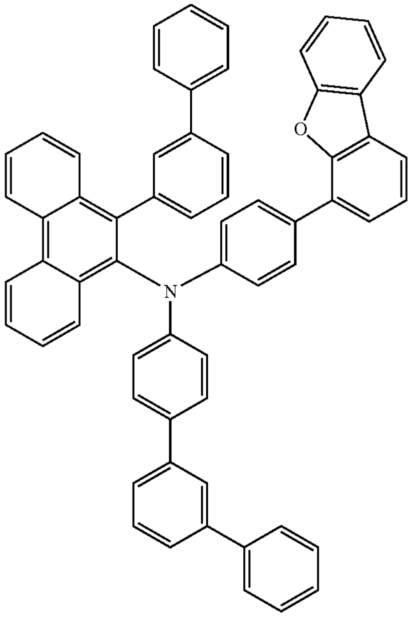
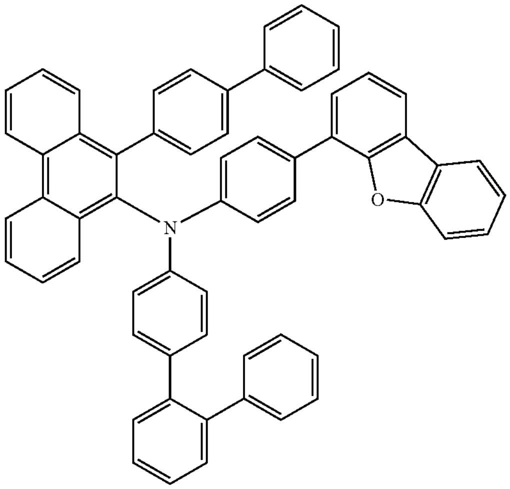
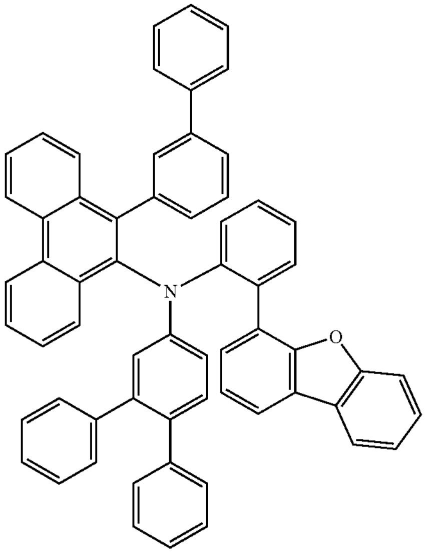
-continued
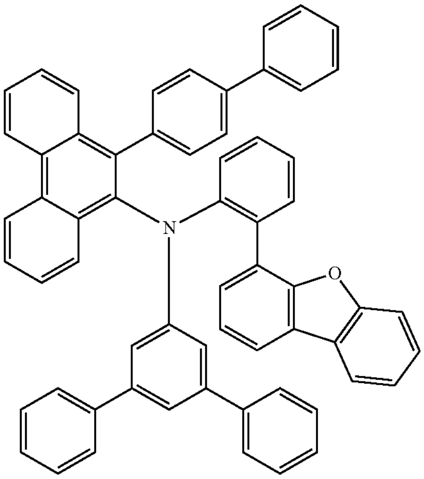
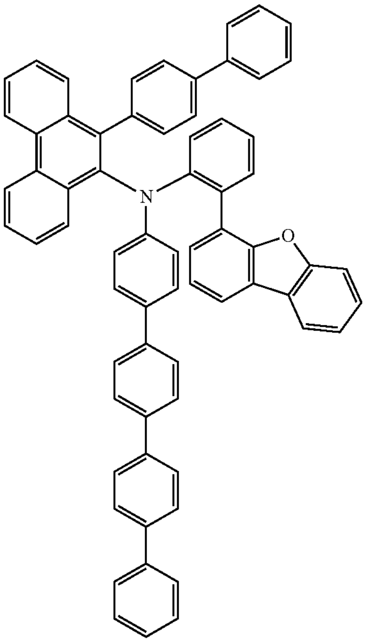

-continued
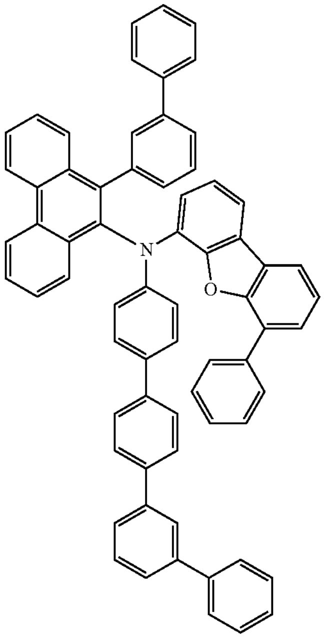
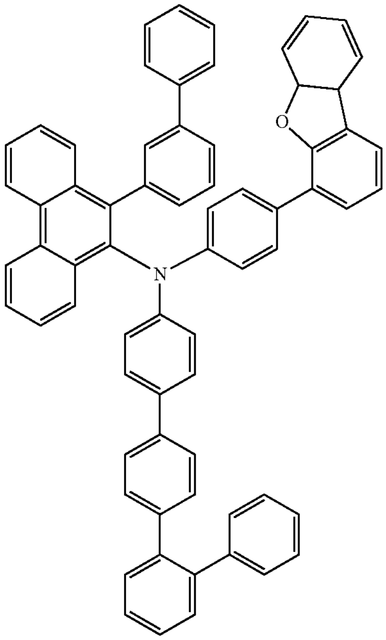
-continued
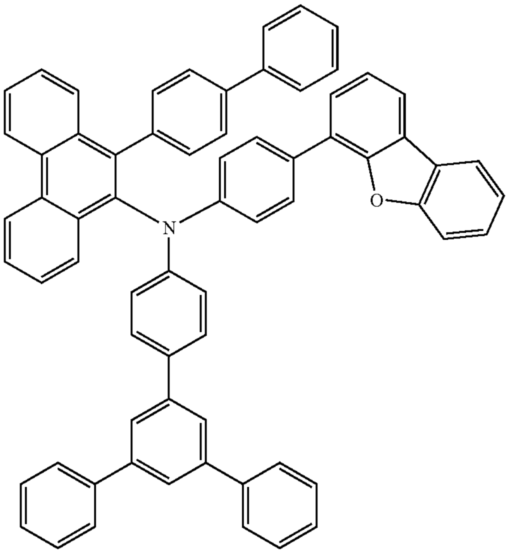
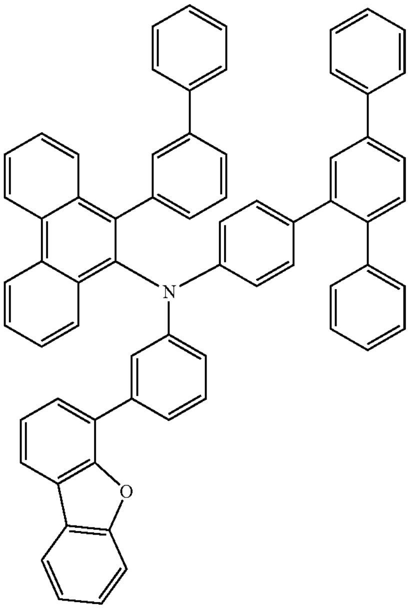
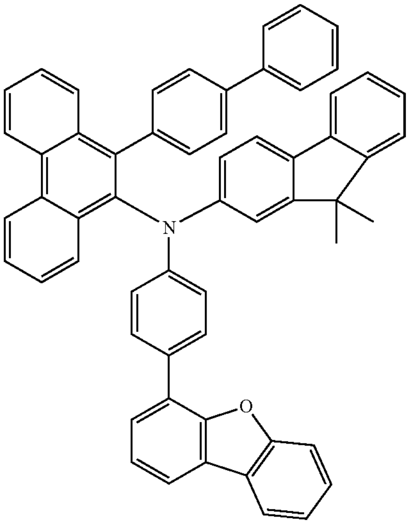

-continued
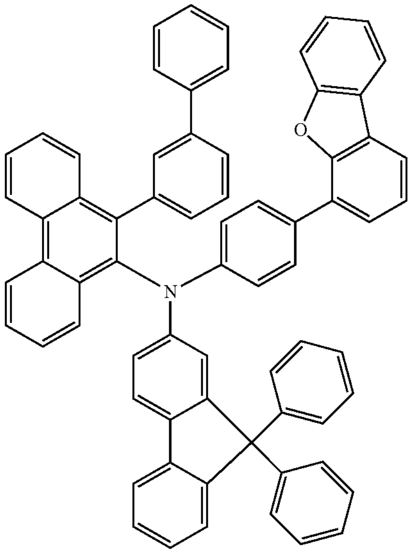
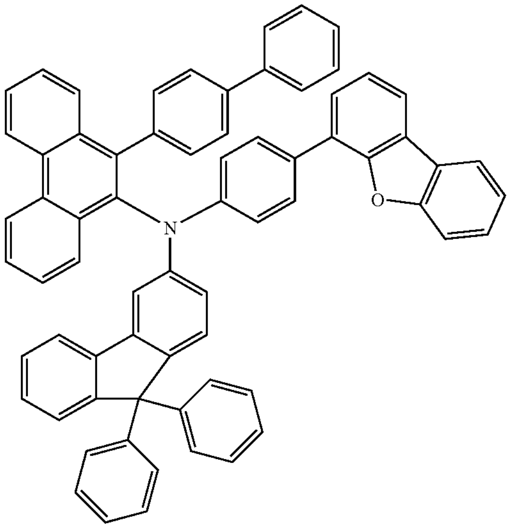
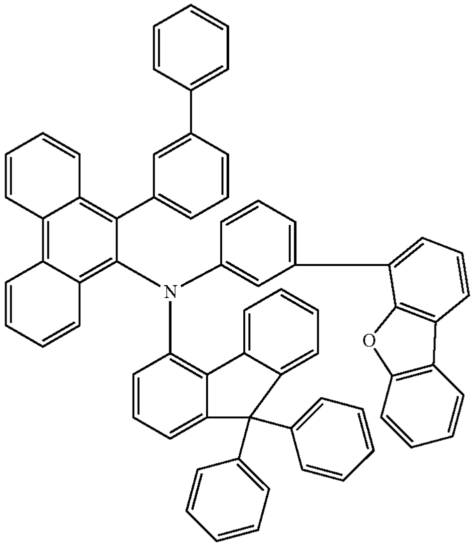
-continued
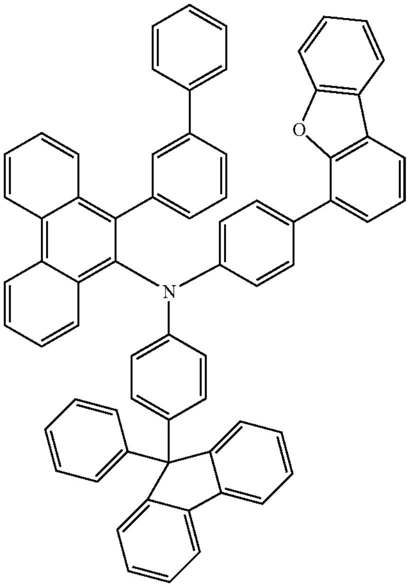
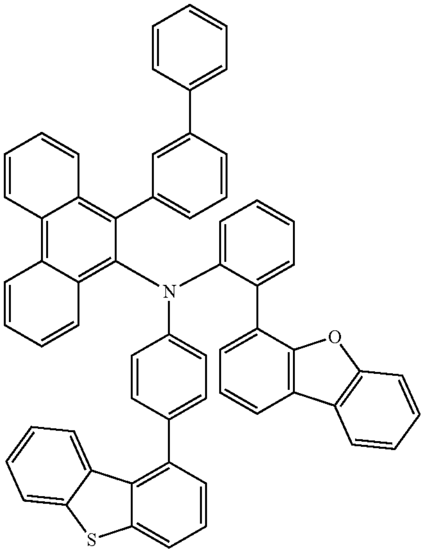 [SMILES: c1ccc(-c2cccc(-c3c(N(c4ccc(-c5cccc6sc7ccccc7c56)cc4)c4ccccc4-c4cccc5c4oc4ccccc45)c4ccccc4c4ccccc34)c2)cc1]
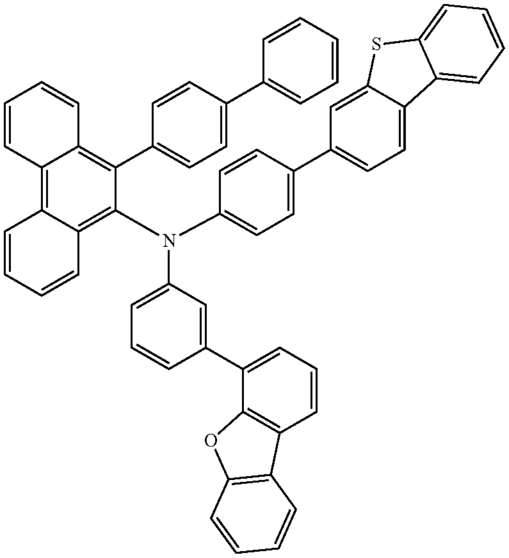 [SMILES: c1ccc(-c2ccc(-c3c(N(c4ccc(-c5ccc6c(c5)sc5ccccc56)cc4)c4cccc(-c5cccc6c5oc5ccccc56)c4)c4ccccc4c4ccccc34)cc2)cc1]

-continued
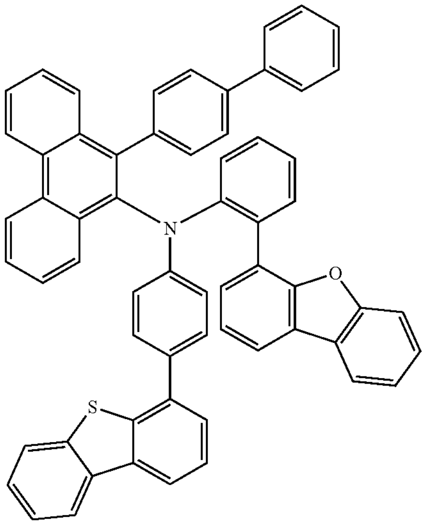 [SMILES: c1ccc(-c2ccc(-c3c(N(c4ccc(-c5cccc6c5sc5ccccc56)cc4)c4ccccc4-c4cccc5c4oc4ccccc45)c4ccccc4c4ccccc34)cc2)cc1]
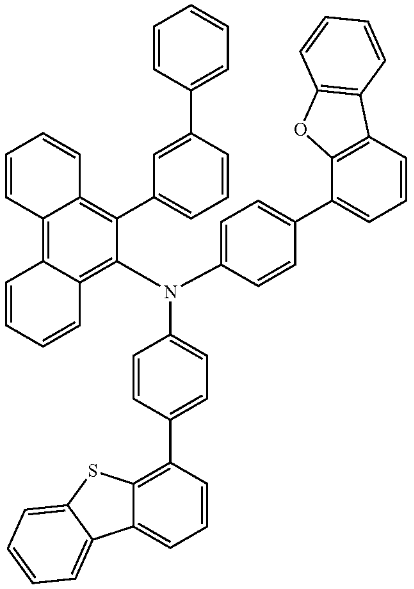 [SMILES: c1ccc(-c2cccc(-c3c(N(c4ccc(-c5cccc6c5oc5ccccc56)cc4)c4ccc(-c5cccc6c5sc5ccccc56)cc4)c4ccccc4c4ccccc34)c2)cc1]
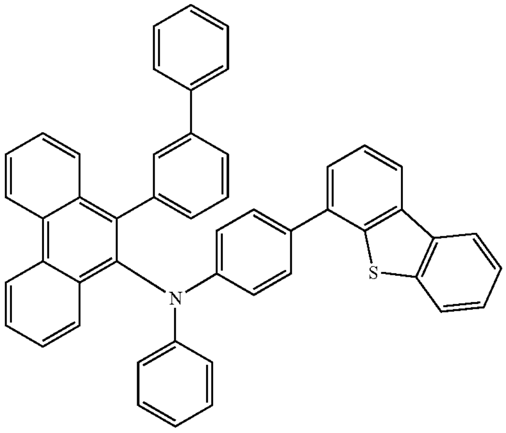
-continued
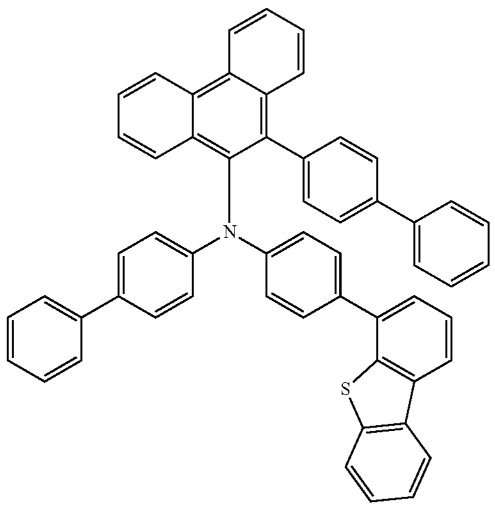
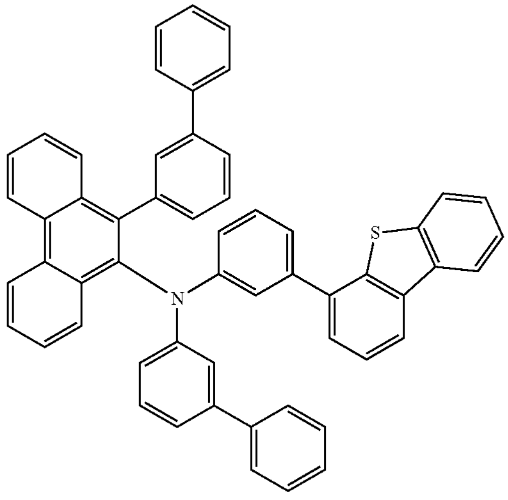
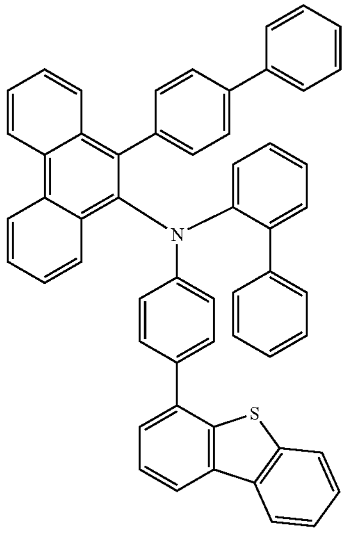

-continued
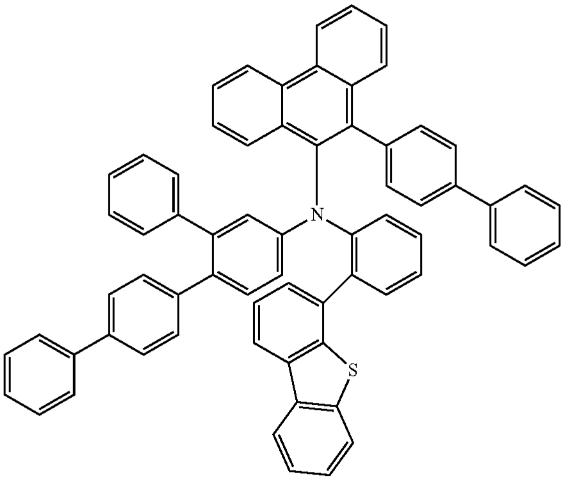
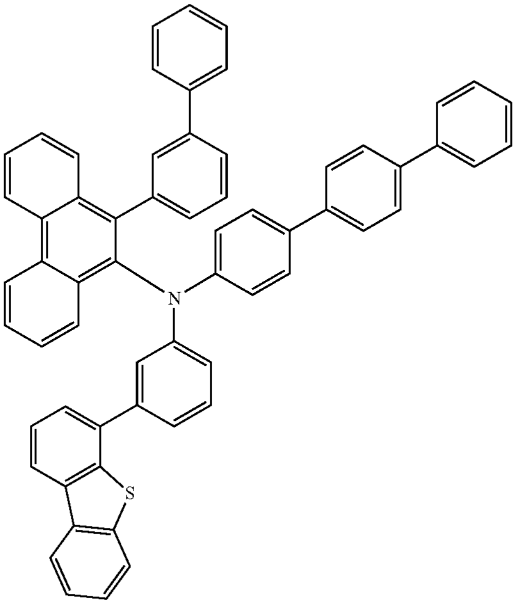
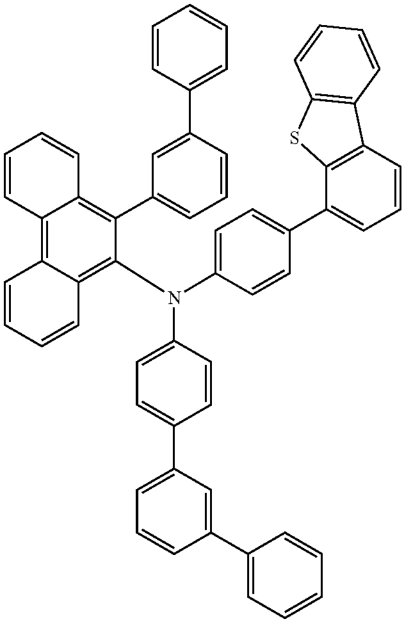
-continued
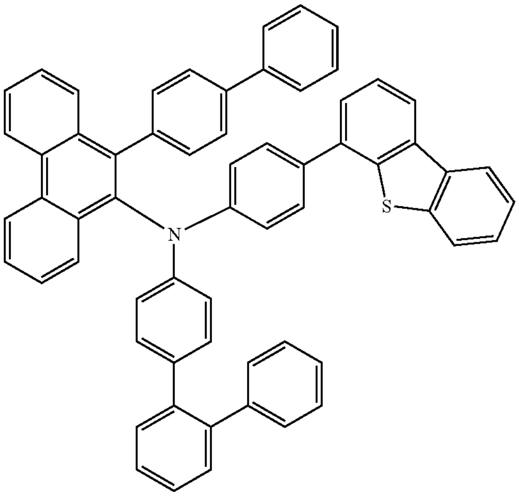
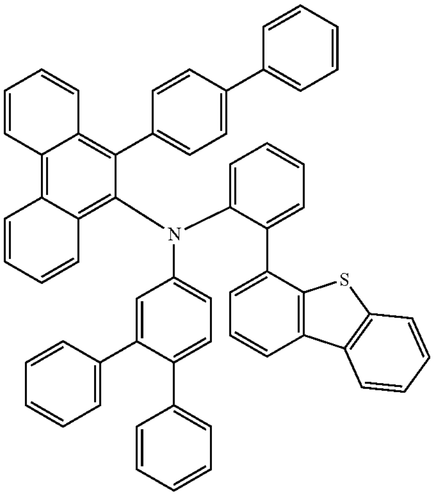
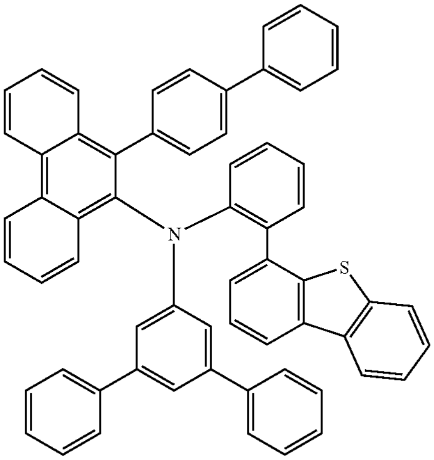

-continued
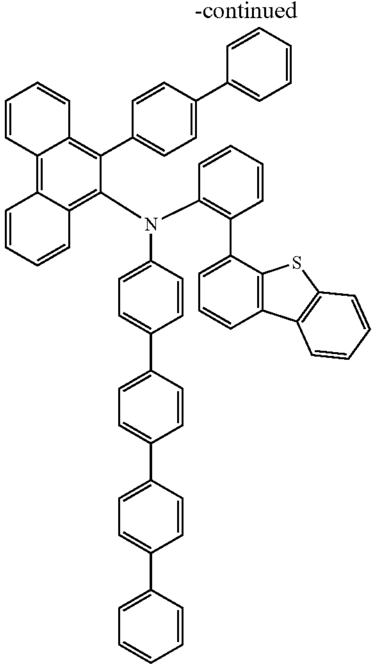
-continued
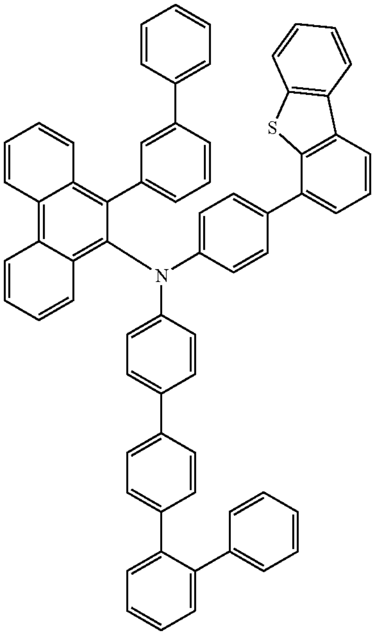
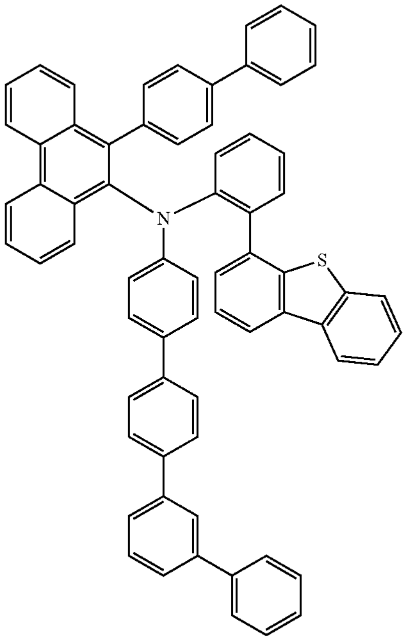
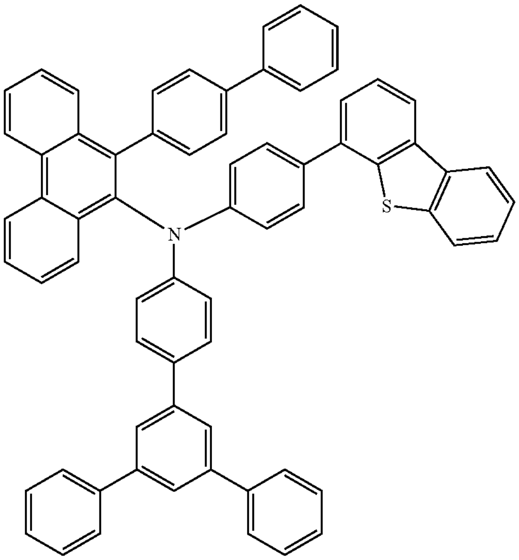

-continued
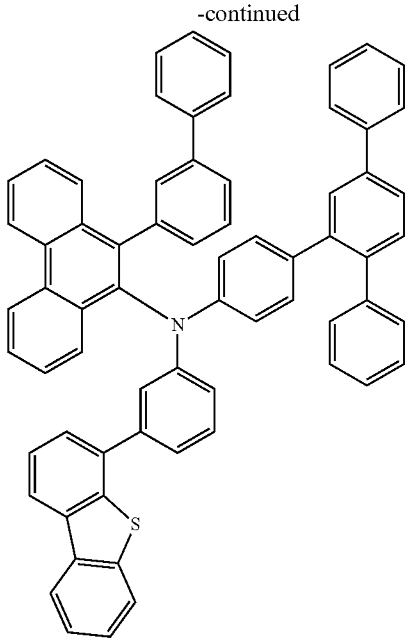
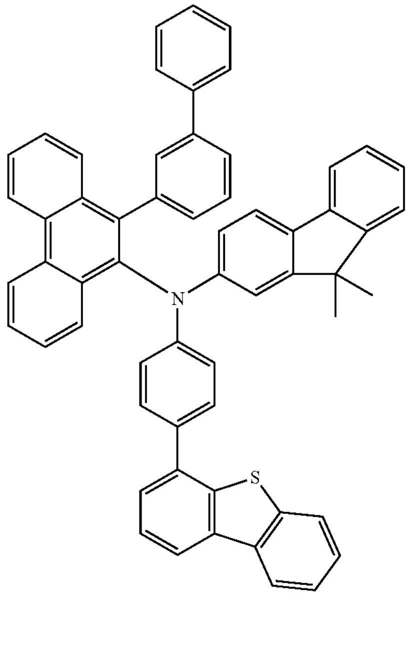
-continued
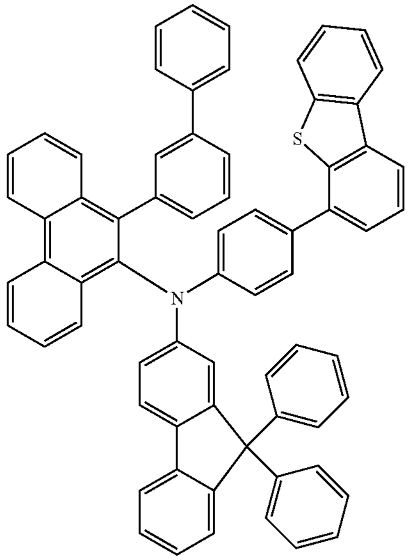
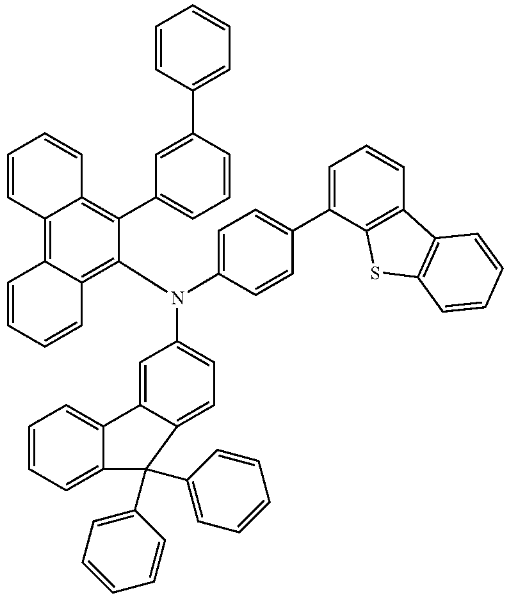
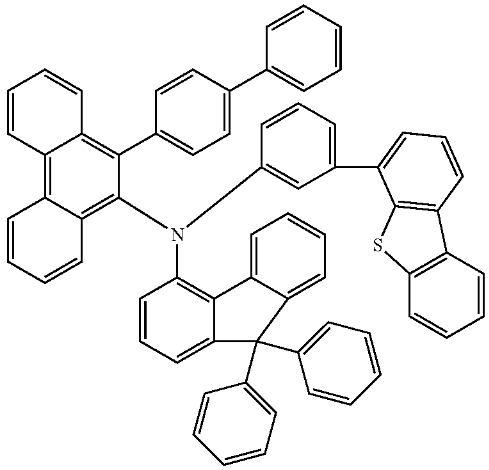

-continued
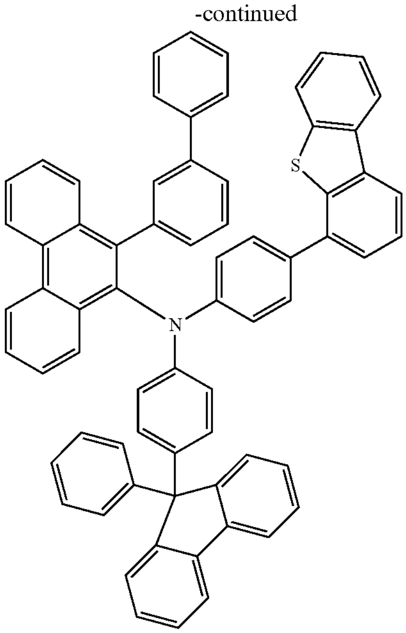
-continued
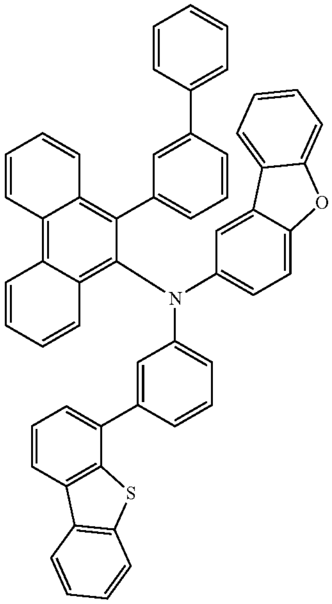
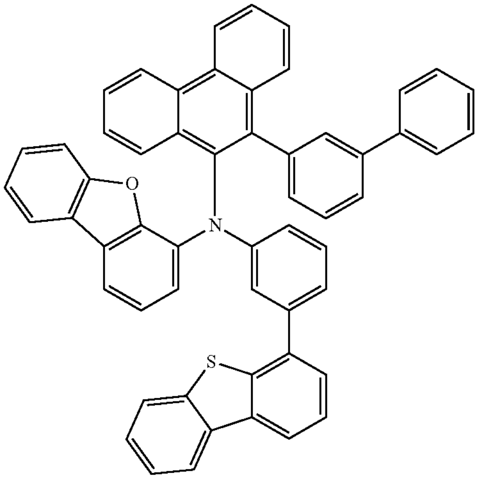
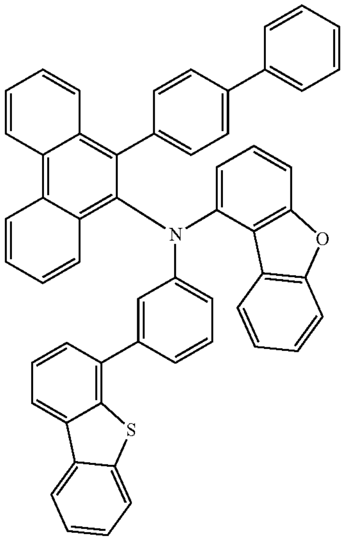
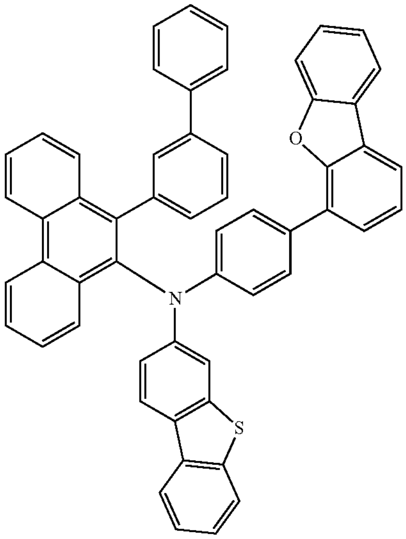

-continued
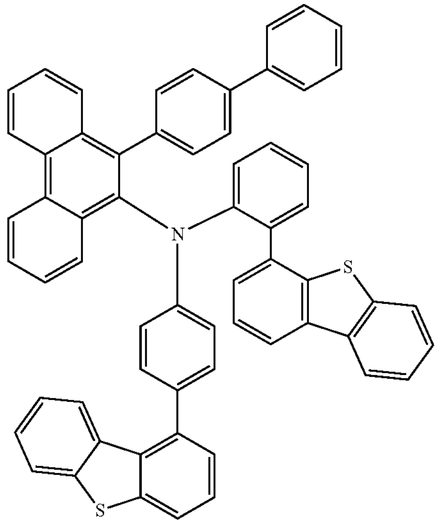
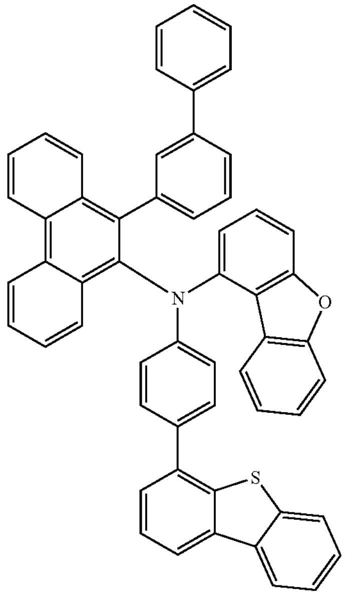
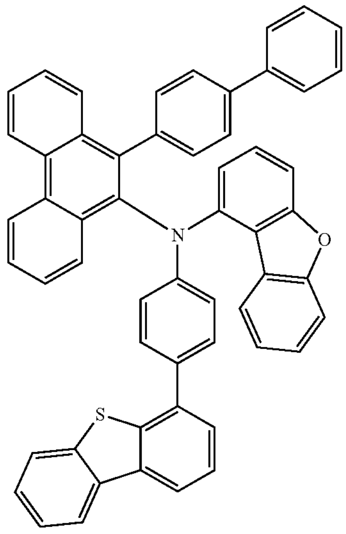
-continued
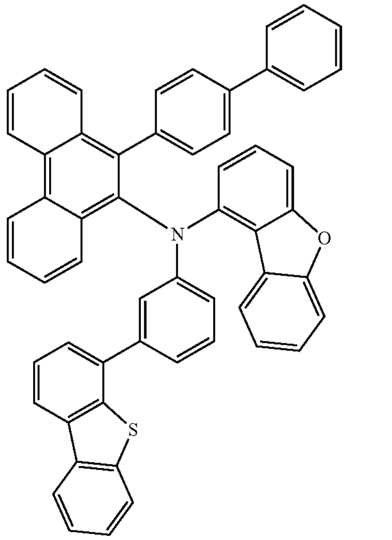
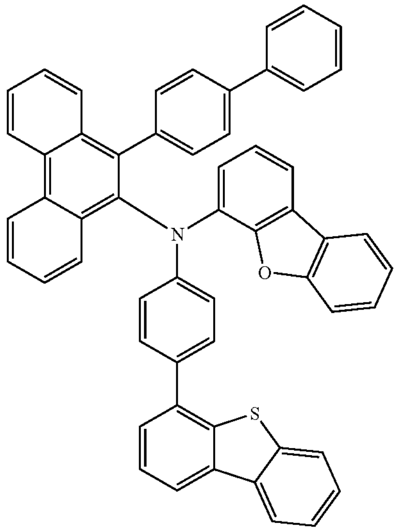
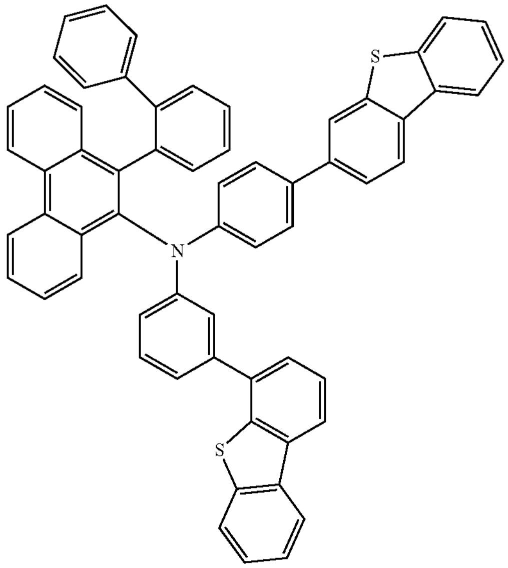

-continued
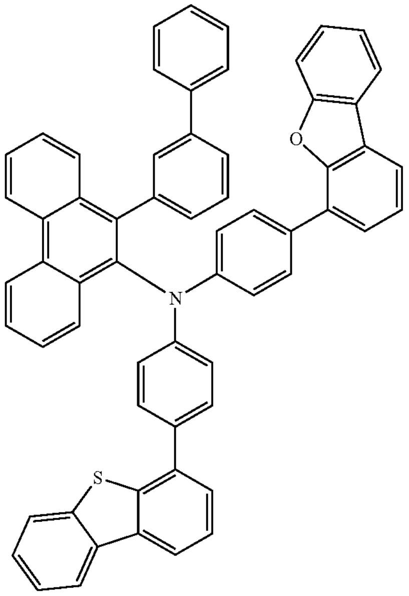
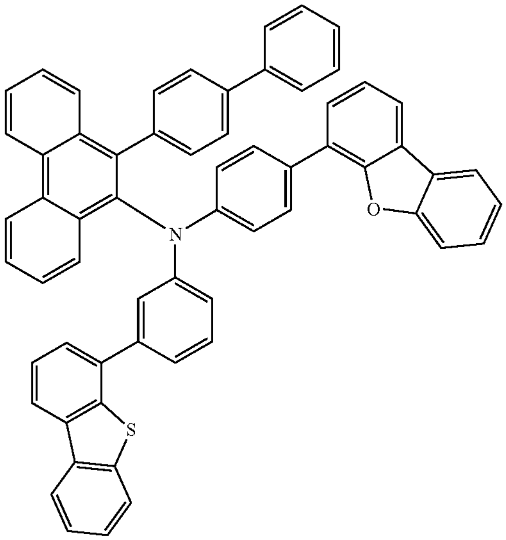
-continued
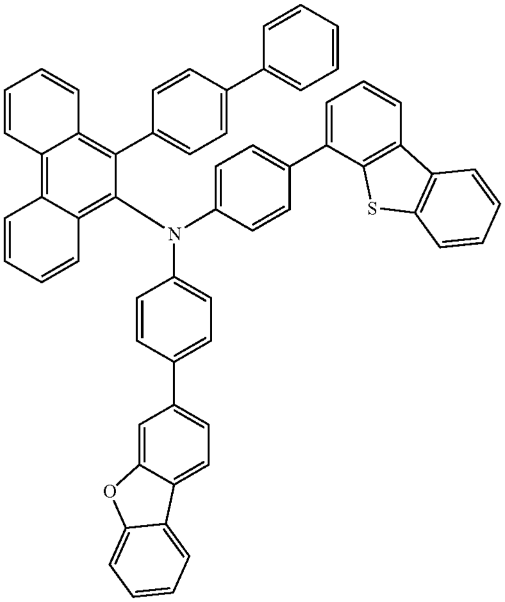
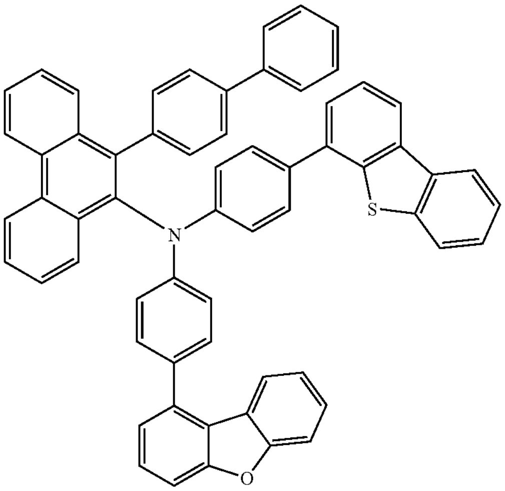
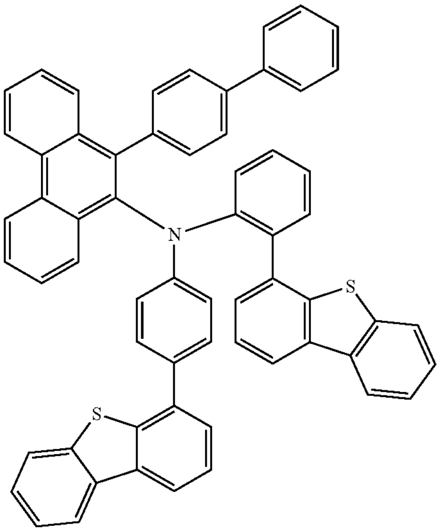

-continued
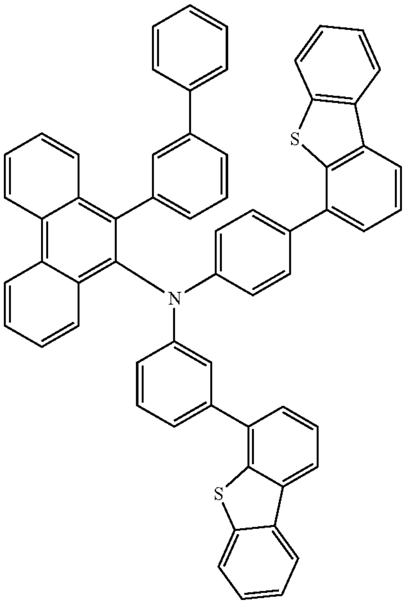
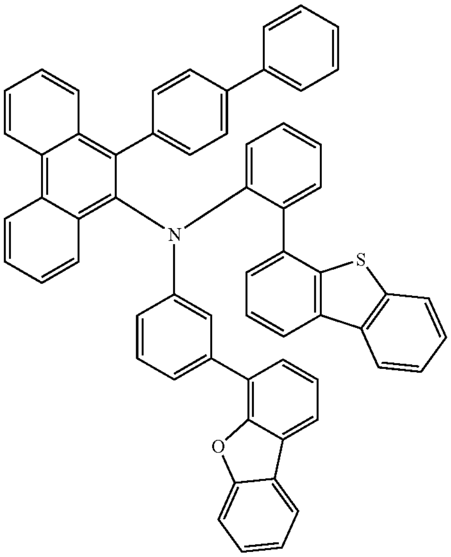
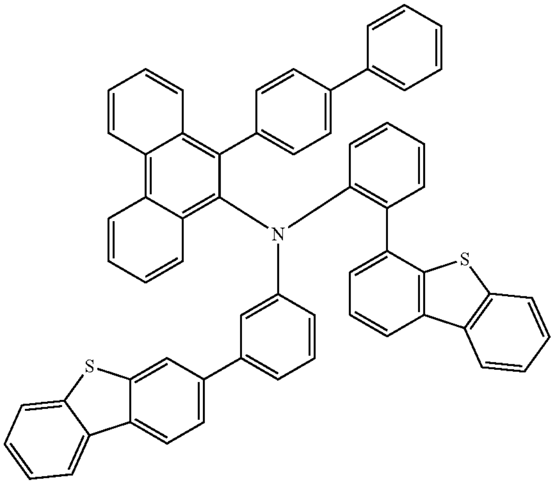
-continued
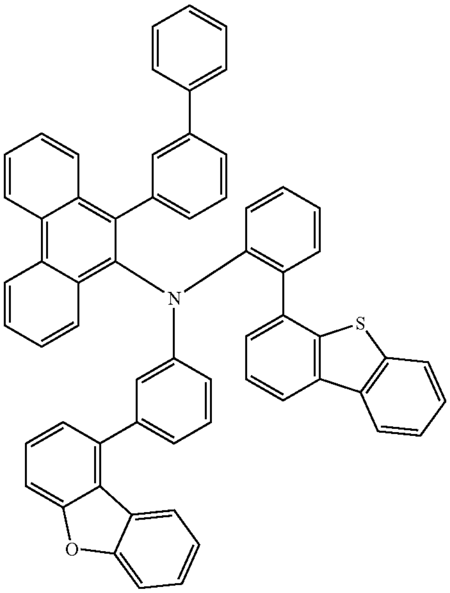
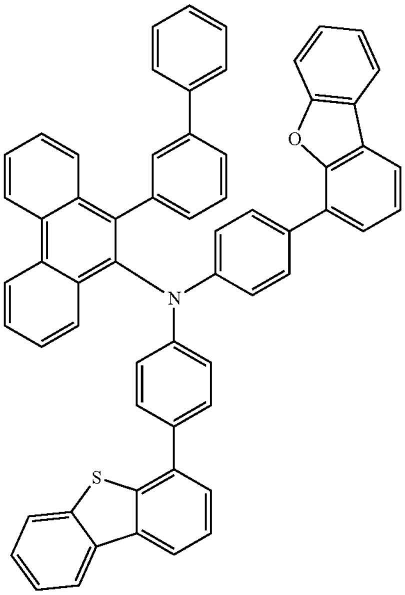
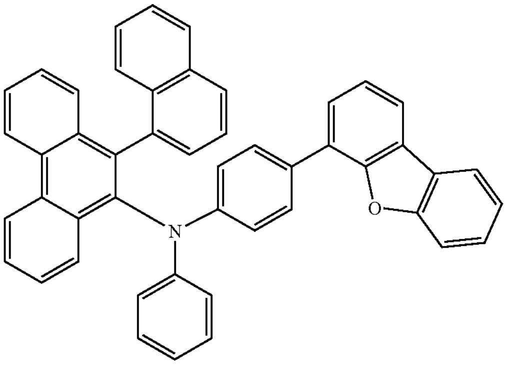

-continued
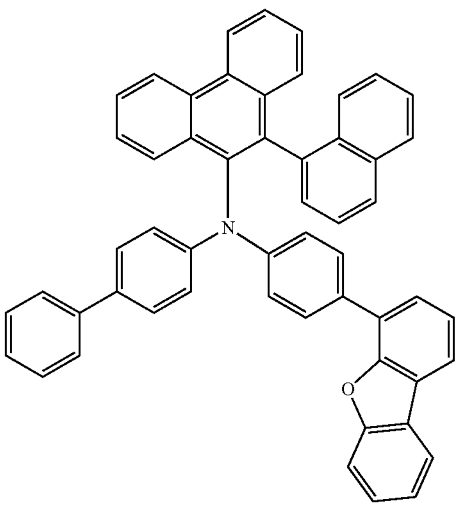
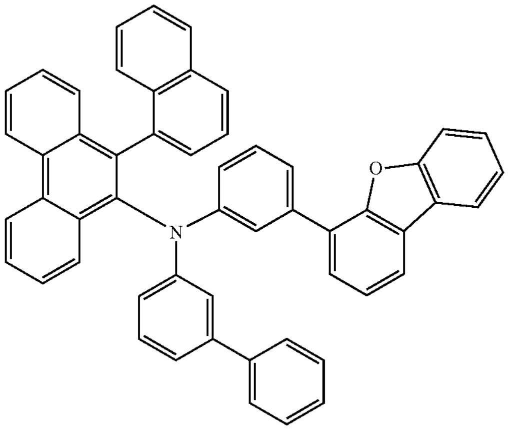
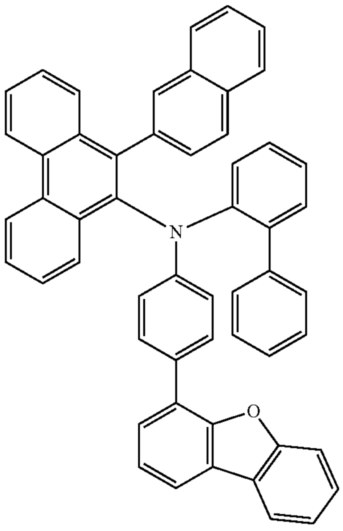
-continued
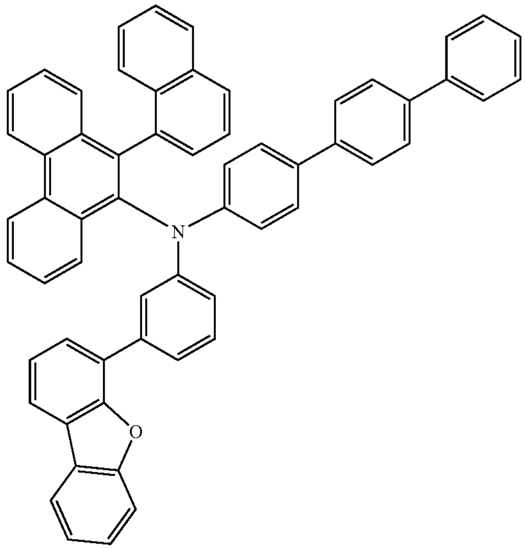
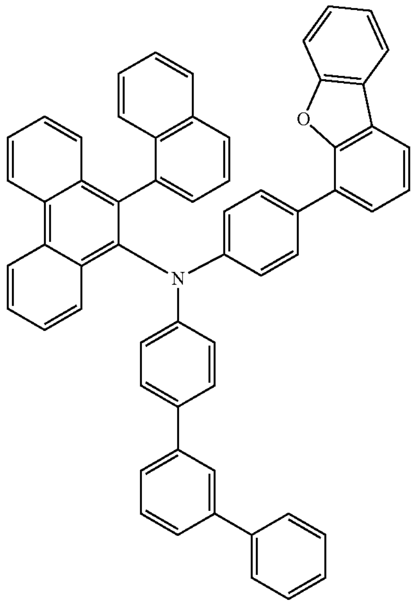
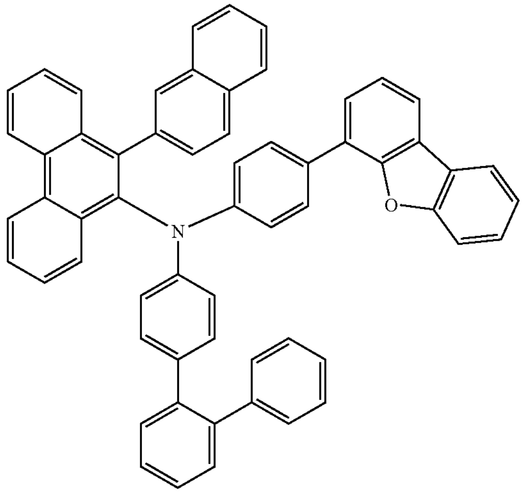

-continued
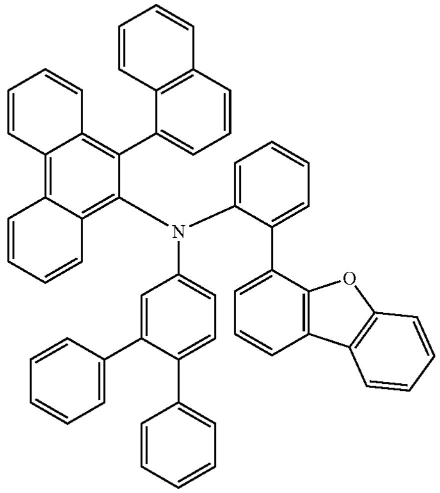
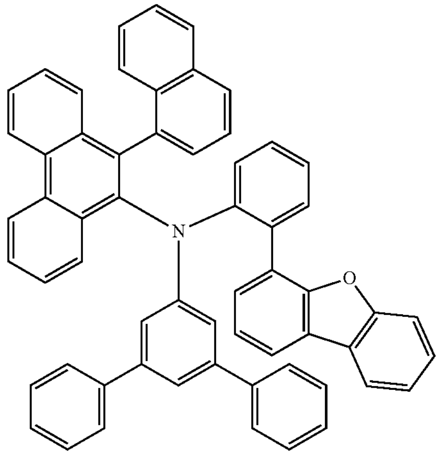
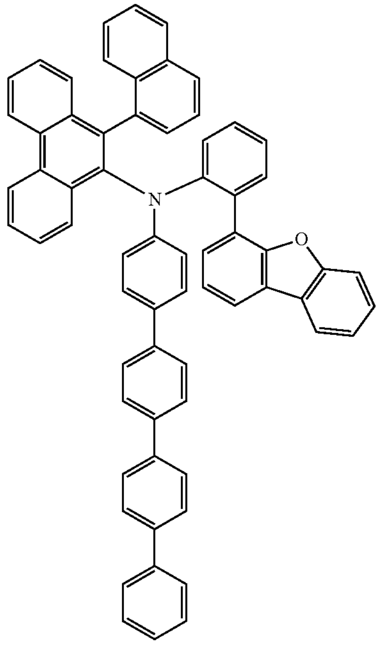 [SMILES: c1ccc(-c2ccc(-c3ccc(-c4ccc(N(c5ccccc5-c5cccc6c5oc5ccccc56)c5c(-c6cccc7ccccc67)c6ccccc6c6ccccc56)cc4)cc3)cc2)cc1]
-continued
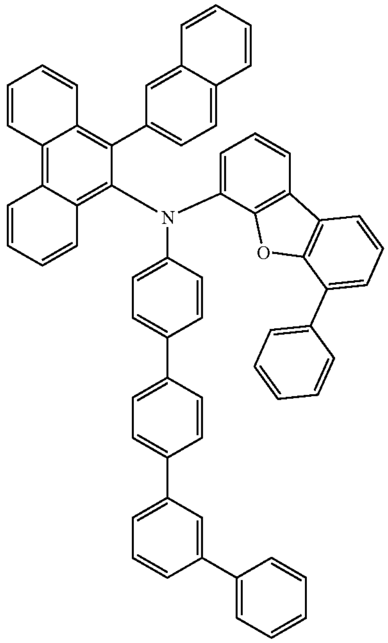
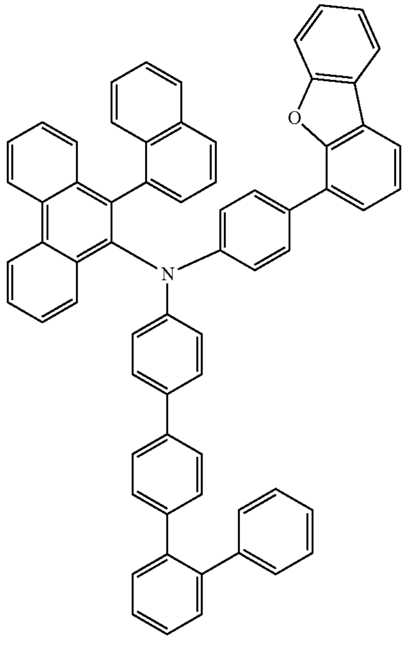

-continued
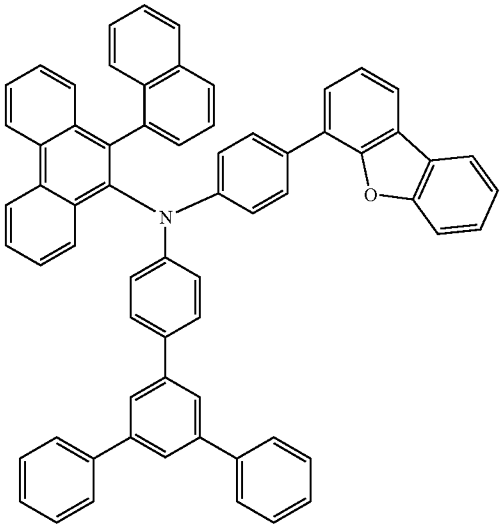
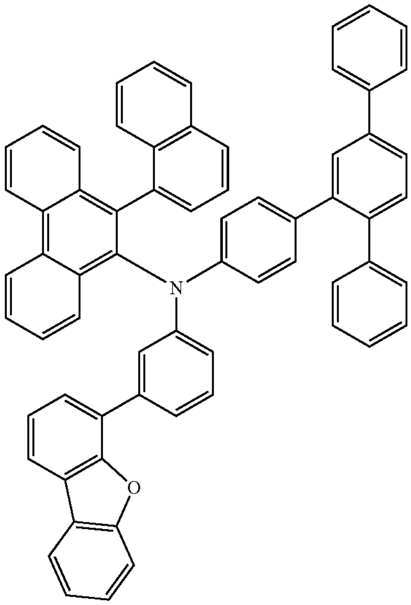
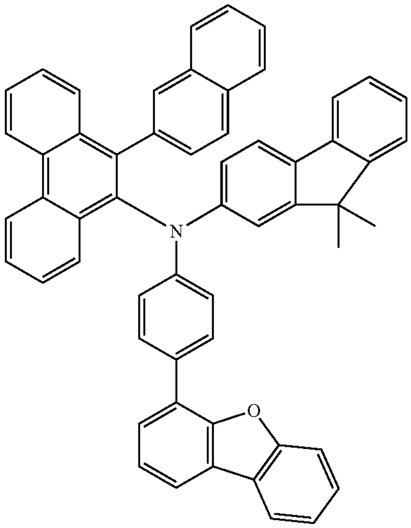
-continued
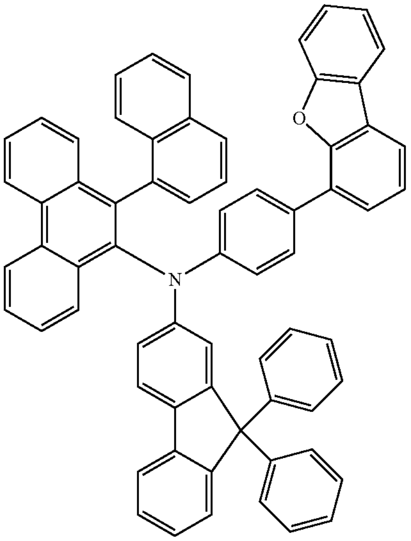
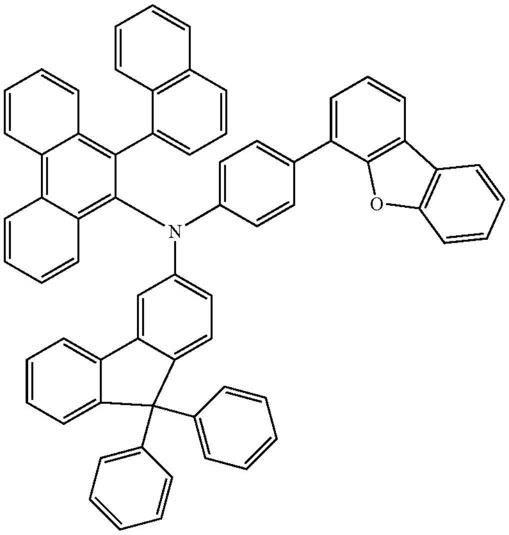
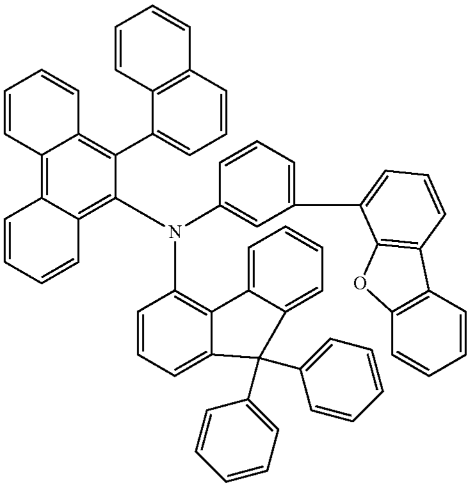

-continued
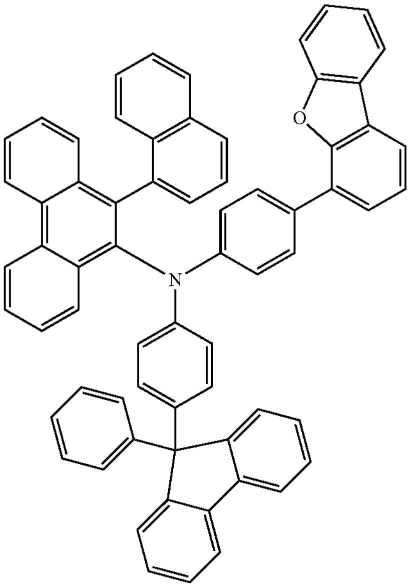
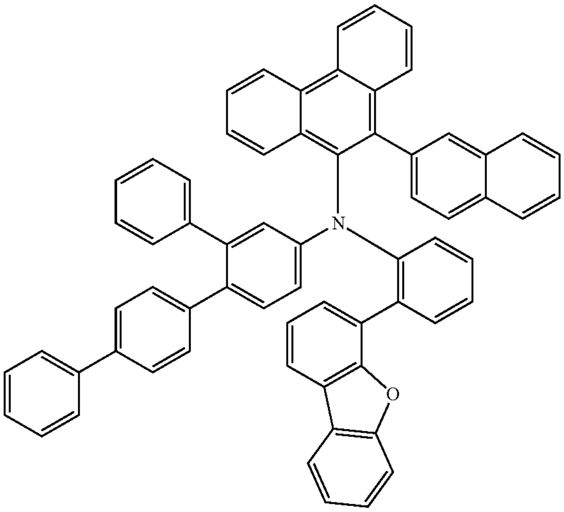 [SMILES: c1ccc(-c2ccc(-c3ccc(N(c4ccccc4-c4cccc5c4oc4ccccc45)c4c(-c5ccc6ccccc6c5)c5ccccc5c5ccccc45)cc3-c3ccccc3)cc2)cc1]
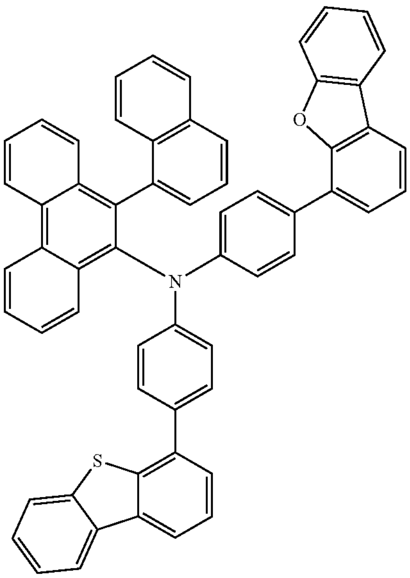
-continued
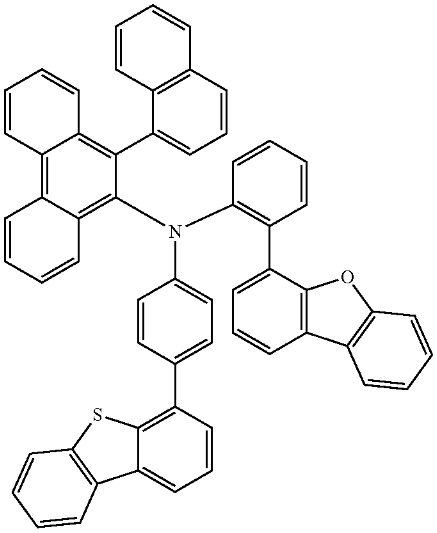
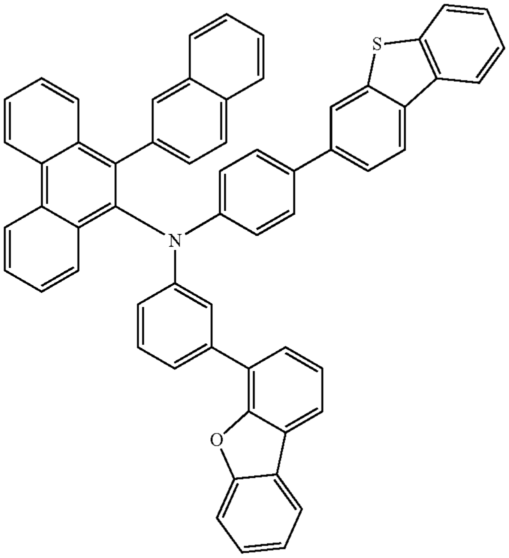
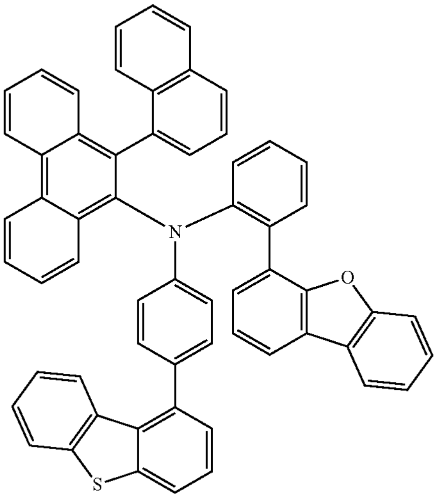

-continued
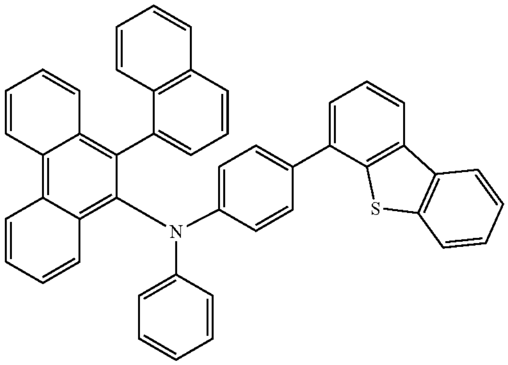
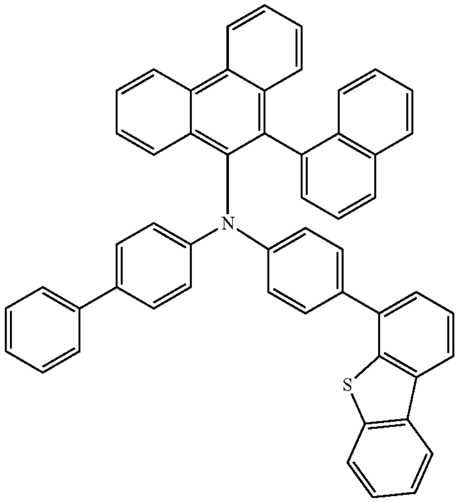
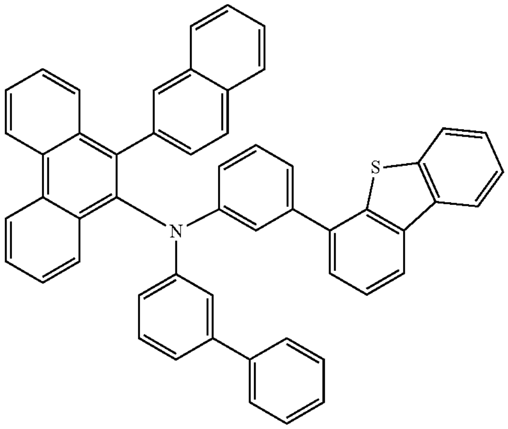
-continued
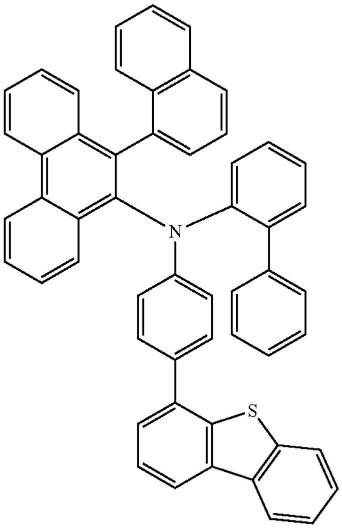
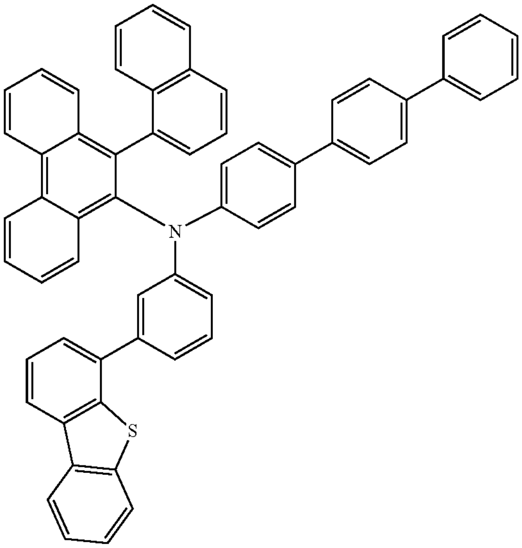
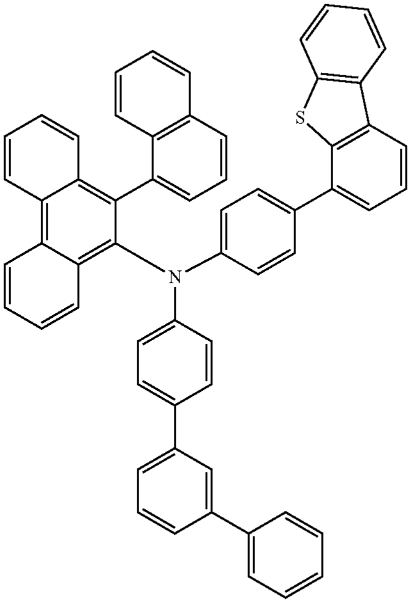

-continued
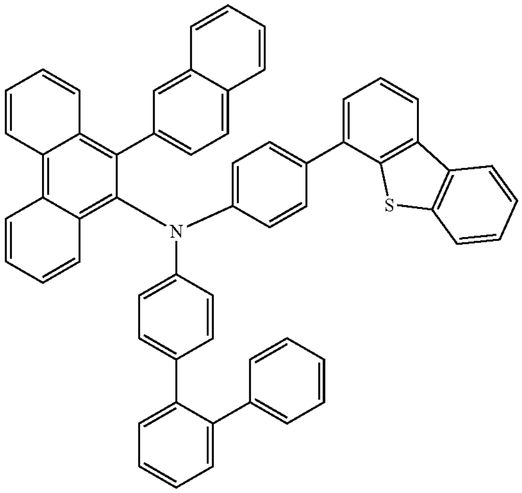
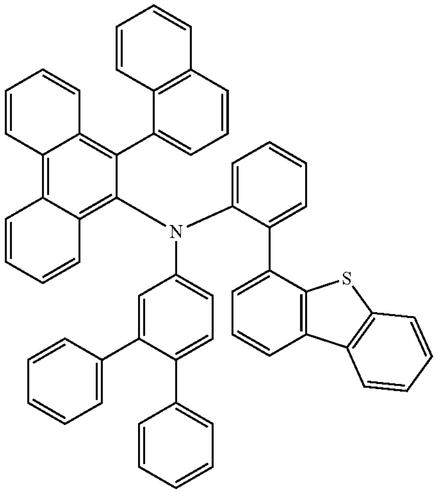
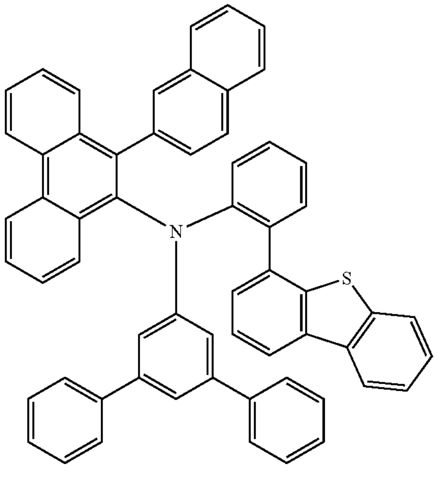
-continued
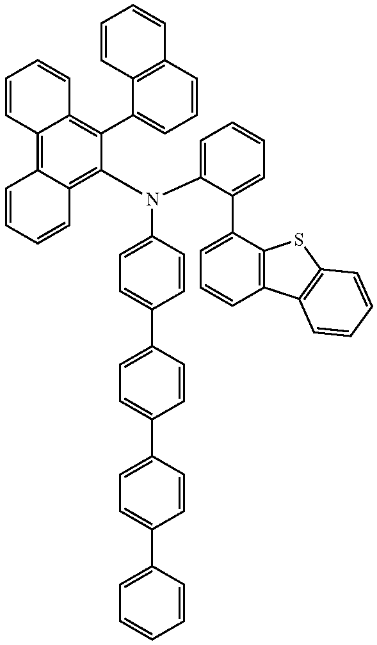
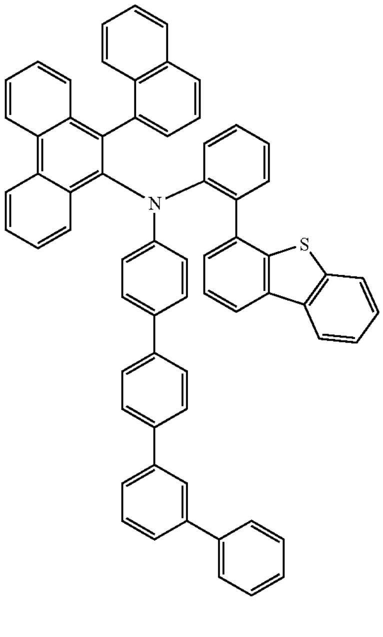

-continued
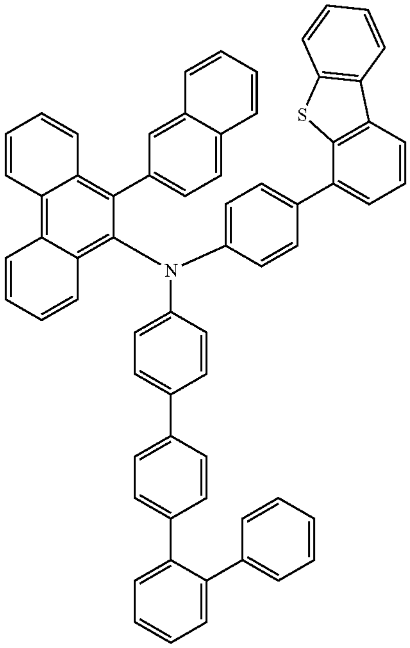
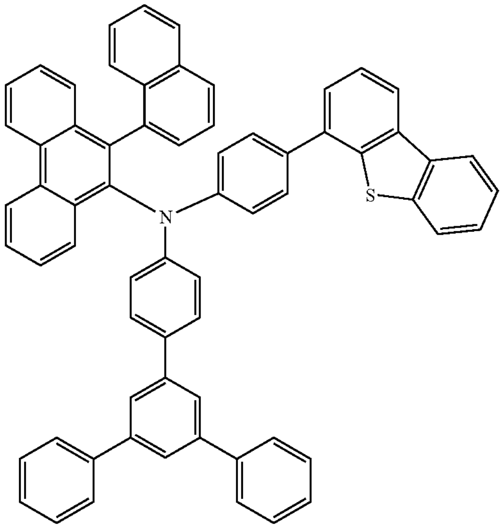
-continued
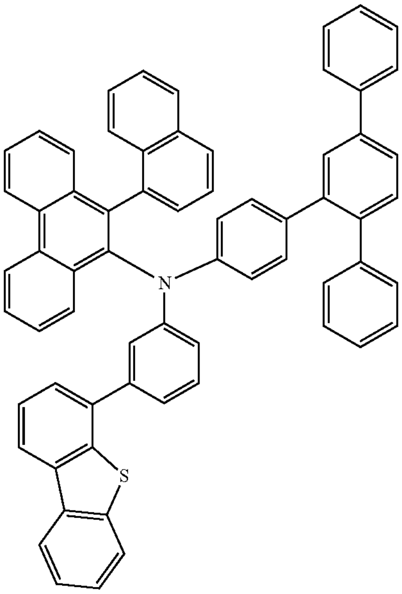
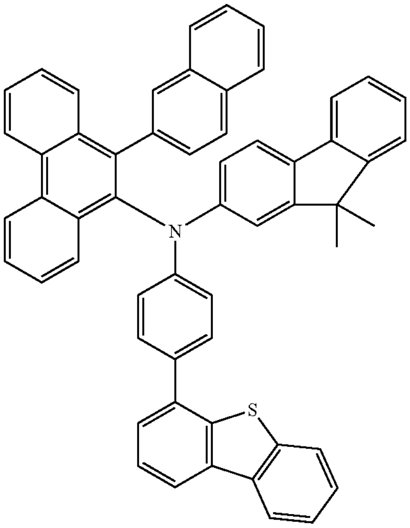
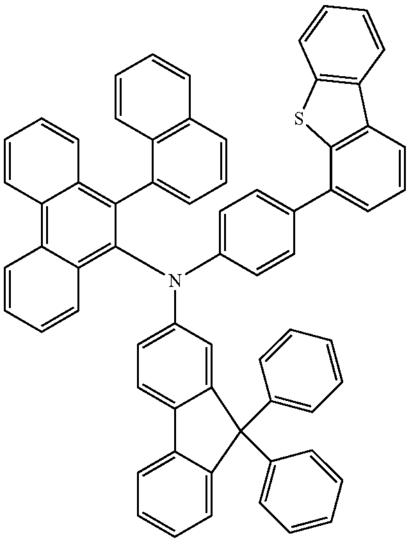

-continued
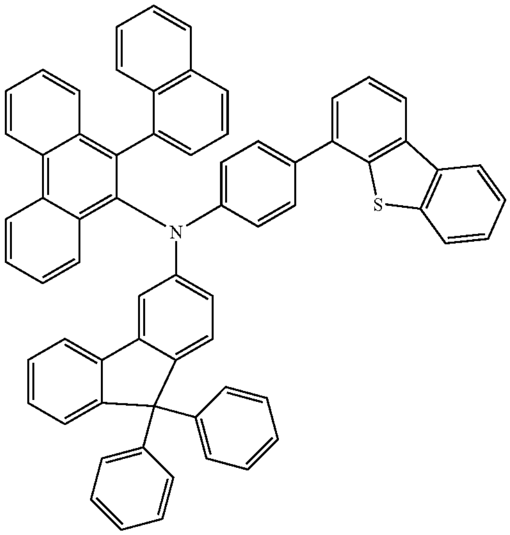
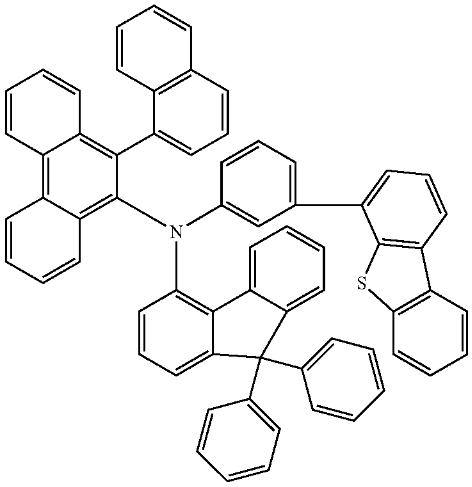
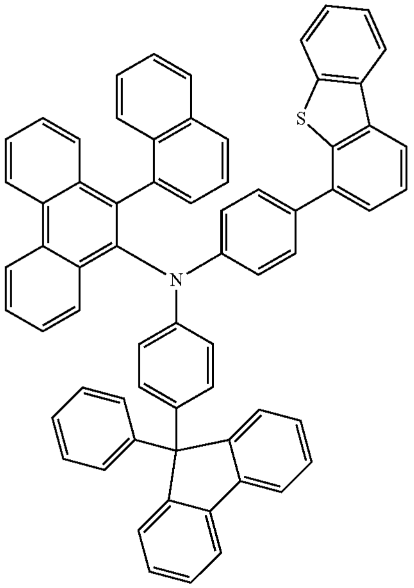
-continued
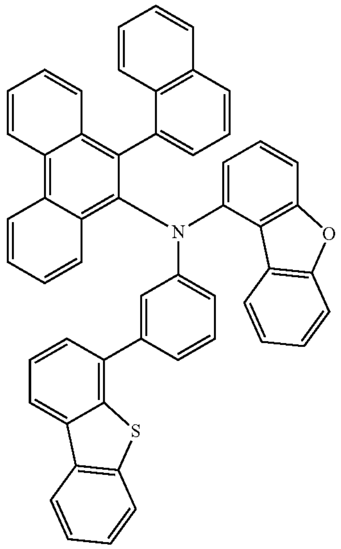 [SMILES: c1cc(-c2cccc3c2sc2ccccc23)cc(N(c2c(-c3cccc4ccccc34)c3ccccc3c3ccccc23)c2cccc3oc4ccccc4c23)c1]
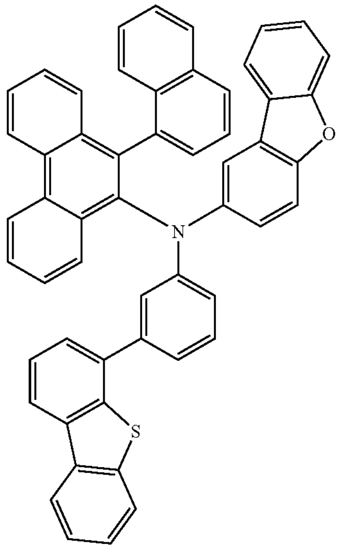
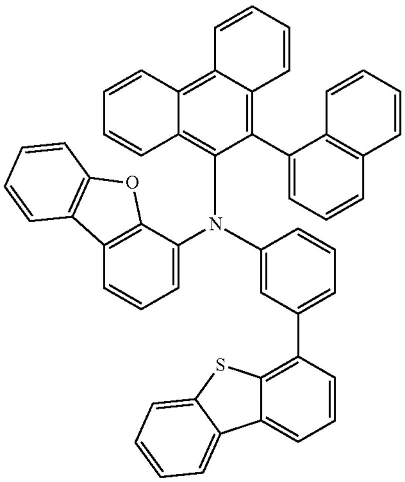

-continued
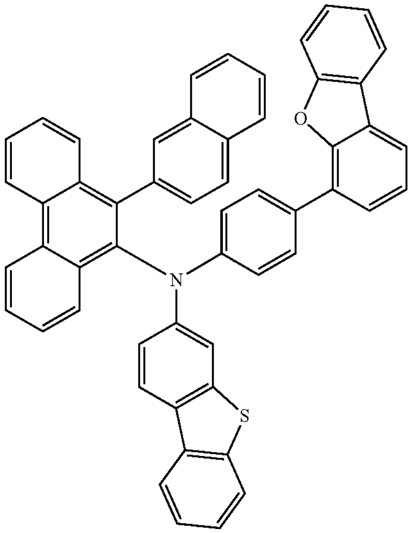
-continued
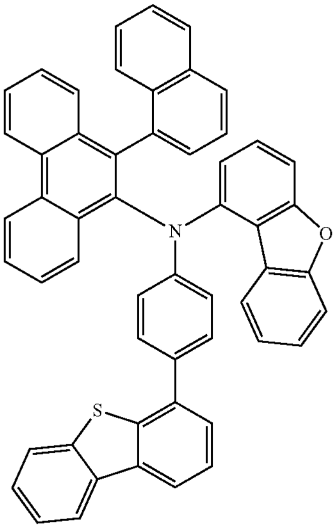
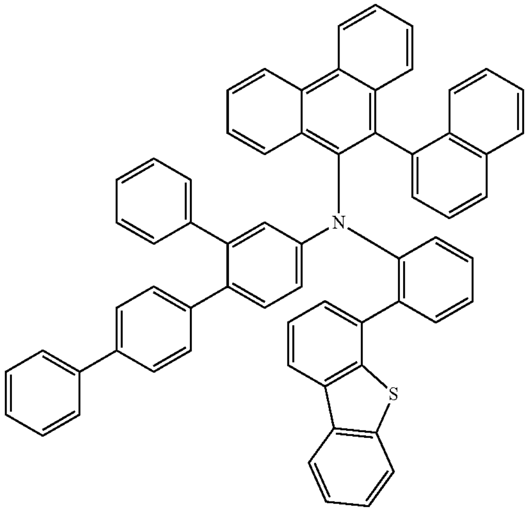
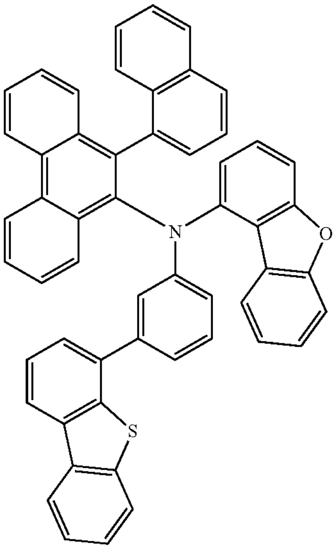
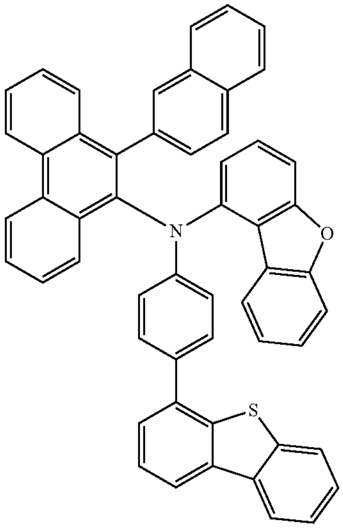
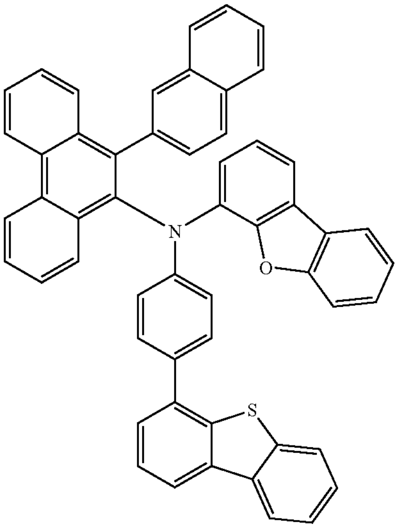

-continued
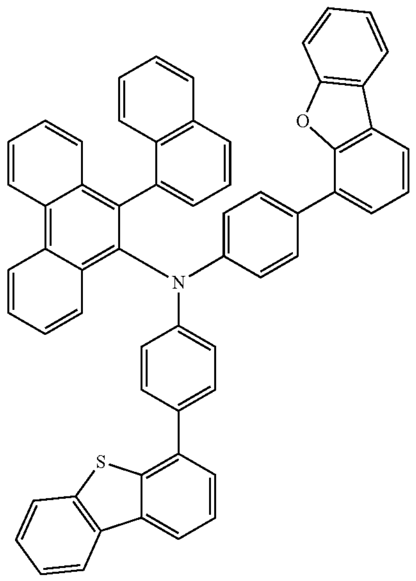
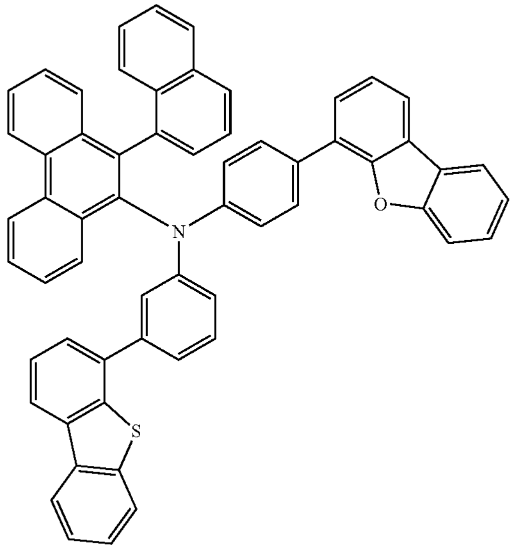
-continued
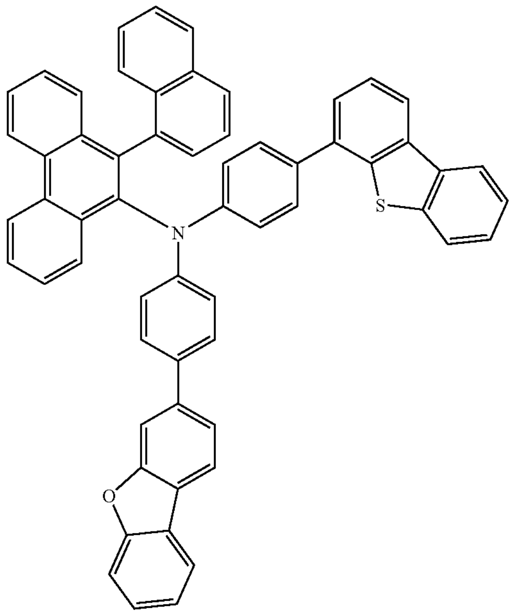
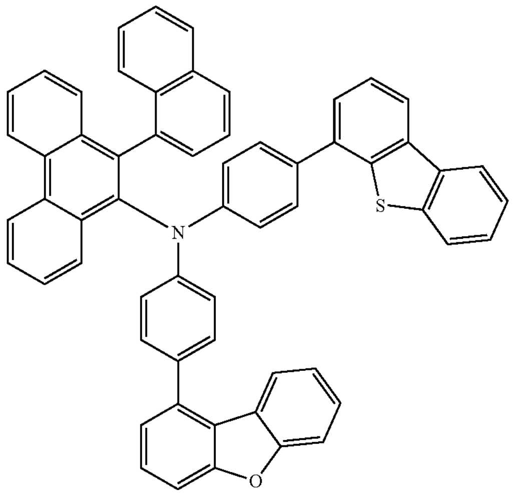
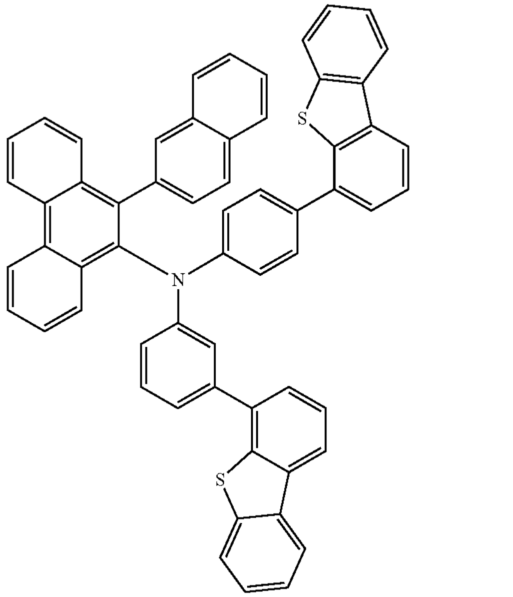

-continued
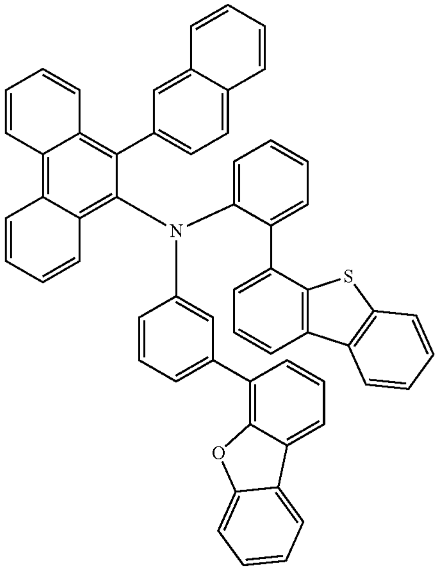
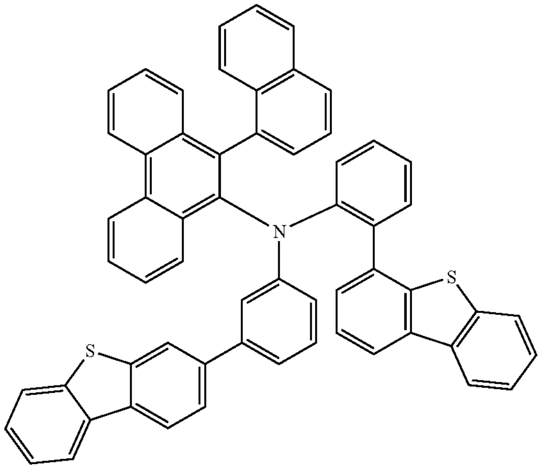
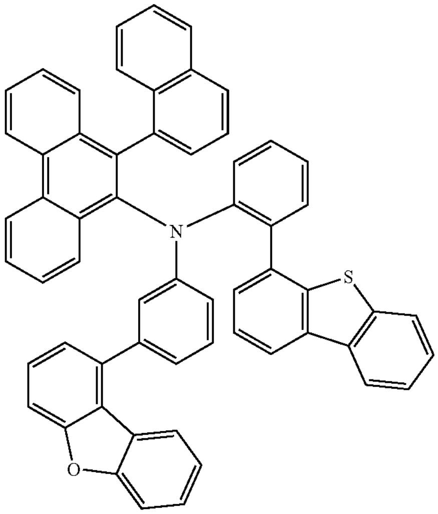
-continued
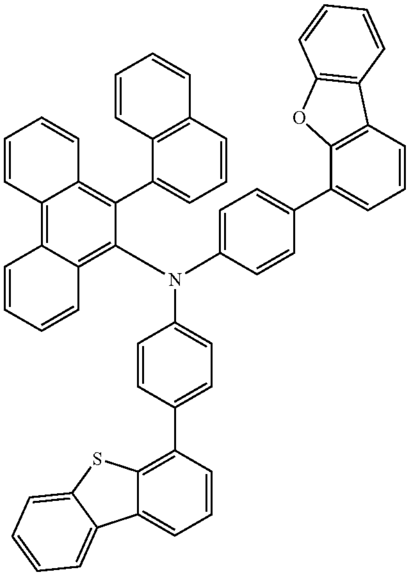
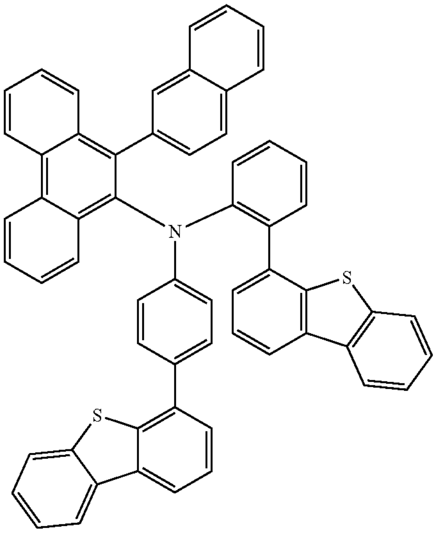
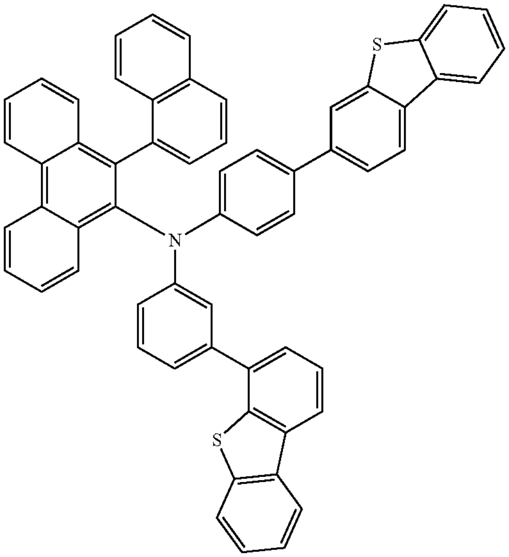

-continued
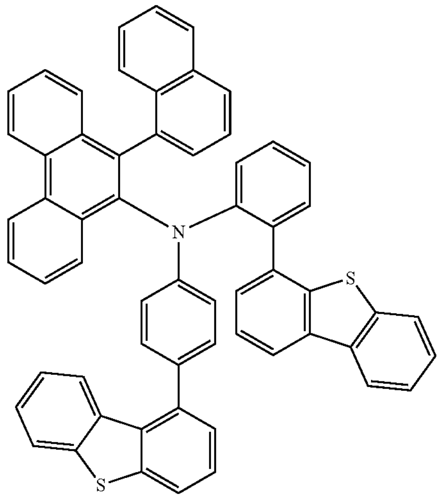
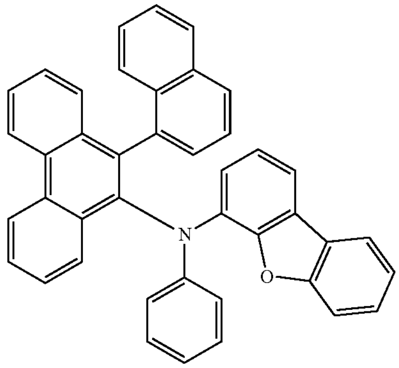
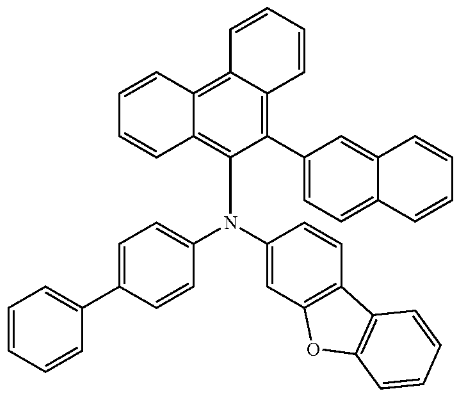
-continued
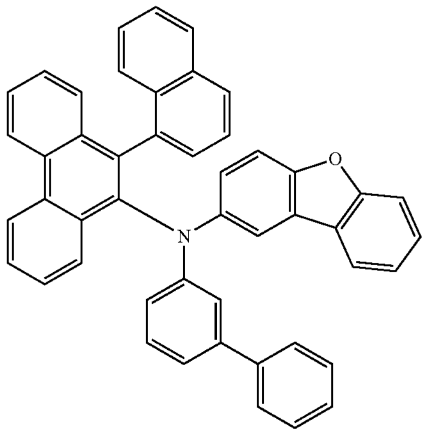
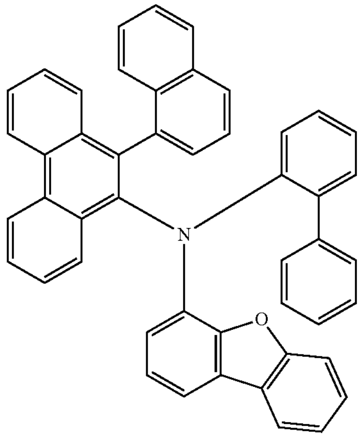
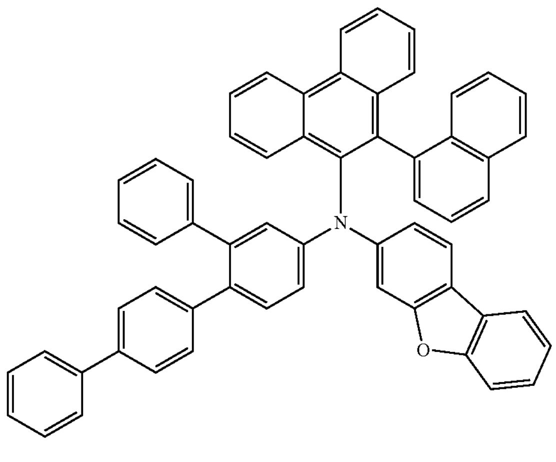

-continued
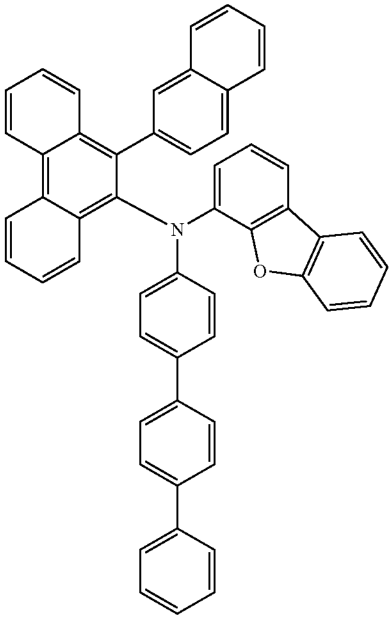
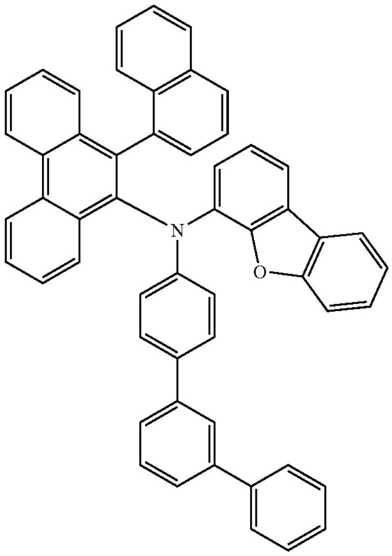
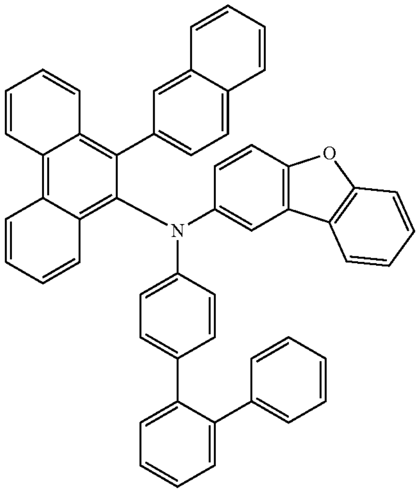
-continued
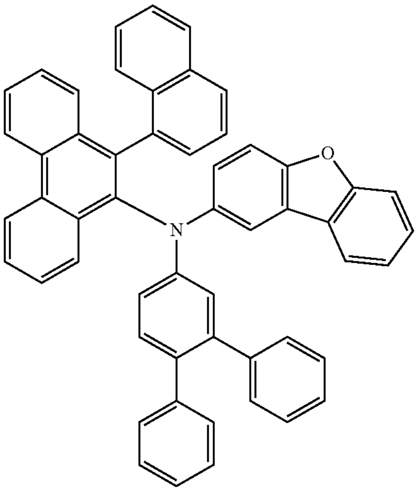
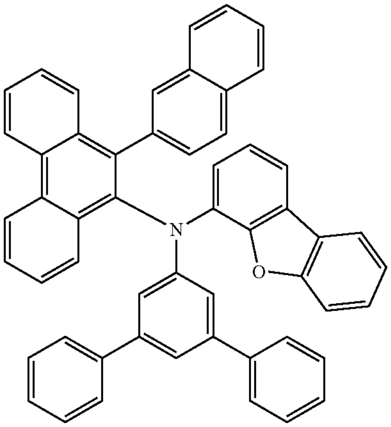
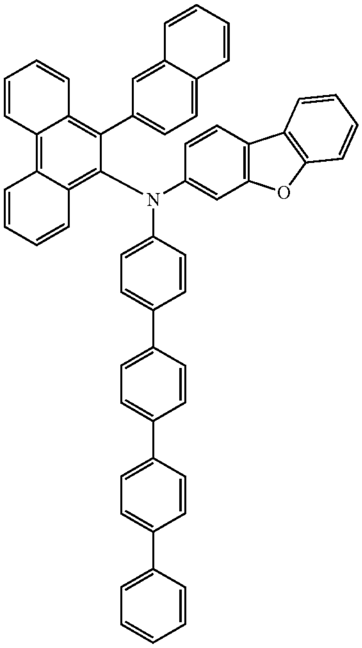

-continued
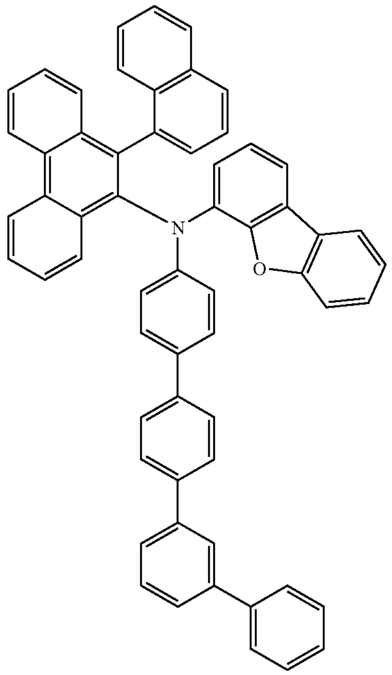
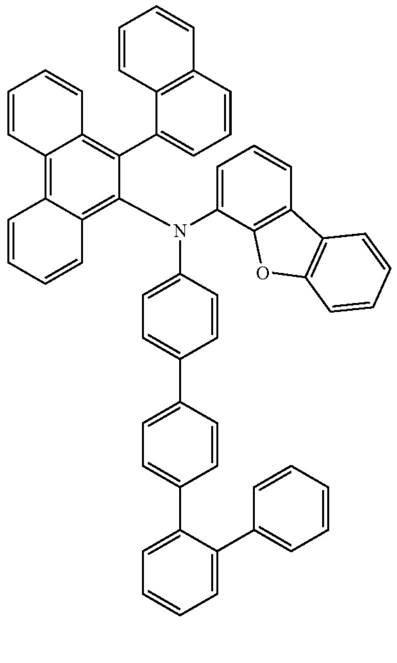
-continued
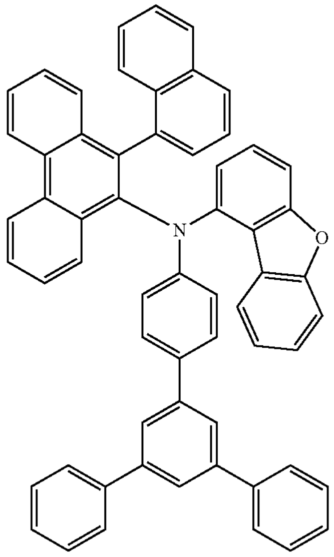
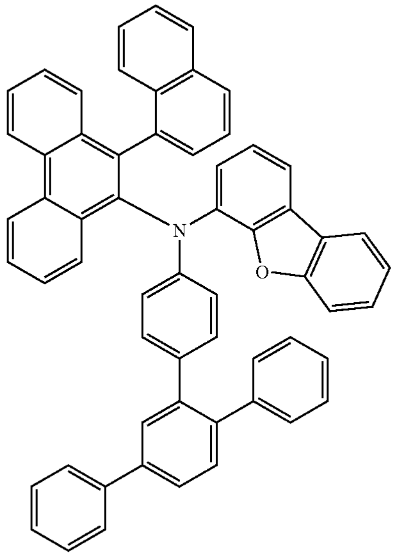
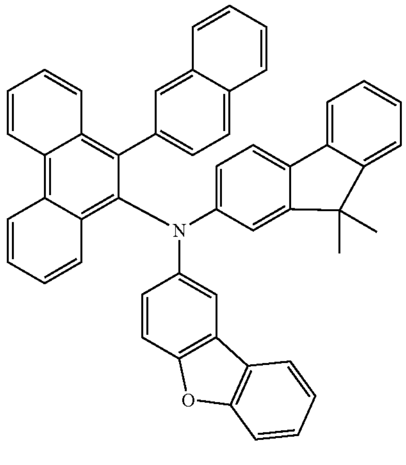

-continued
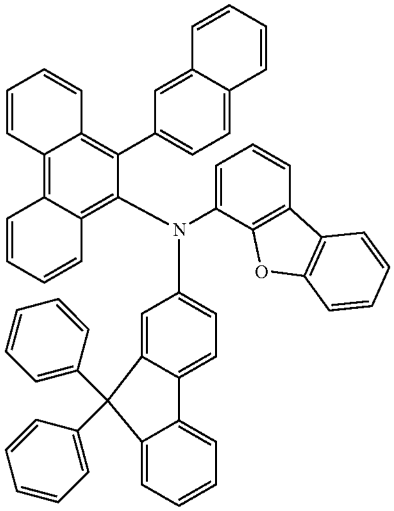
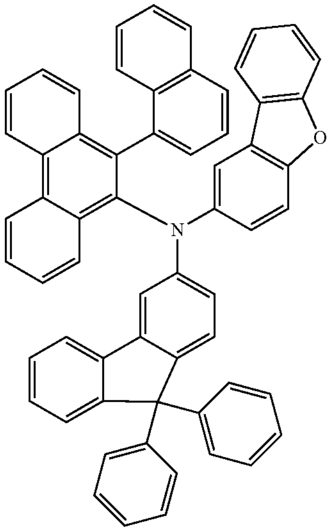
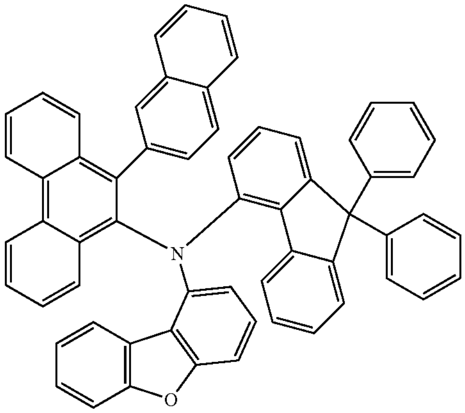
-continued
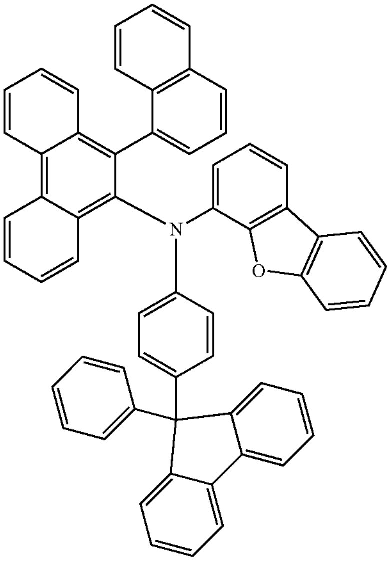 [SMILES: c1ccc(C2(c3ccc(N(c4c(-c5cccc6ccccc56)c5ccccc5c5ccccc45)c4cccc5c4oc4ccccc45)cc3)c3ccccc3-c3ccccc32)cc1]
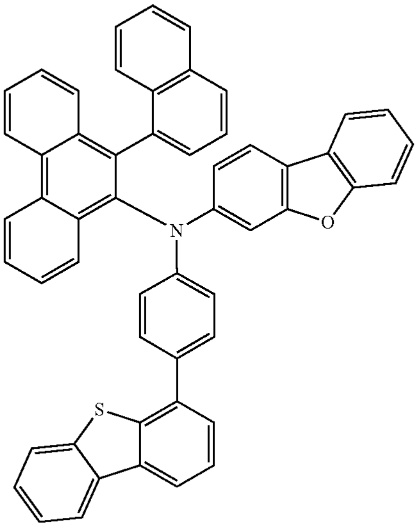
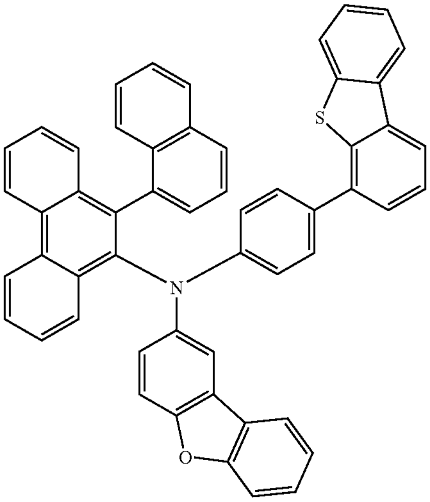

-continued
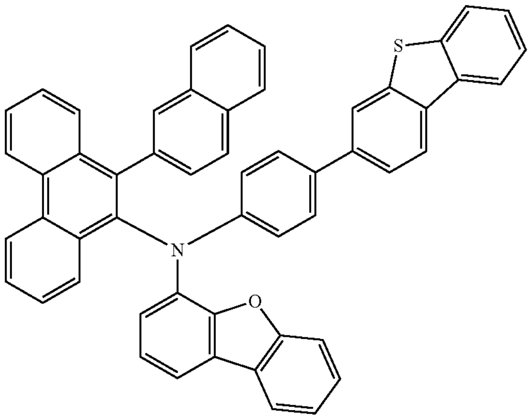
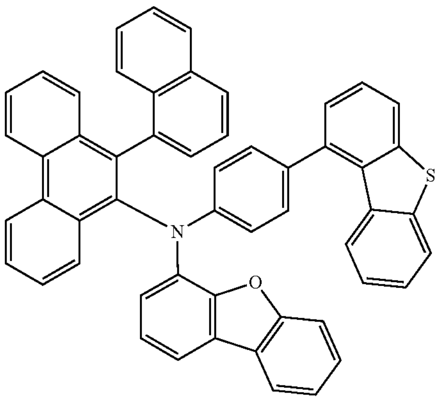
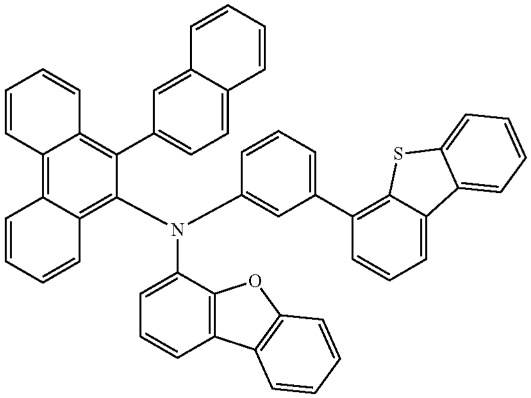
-continued
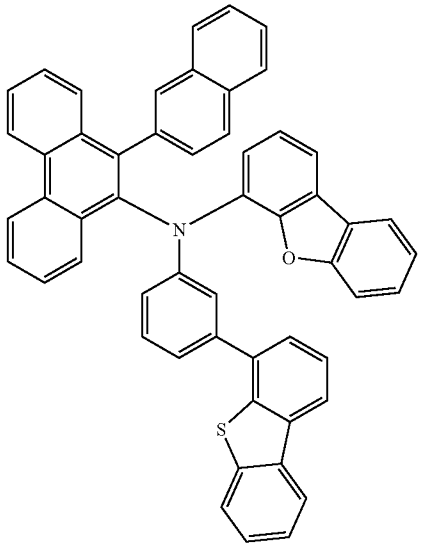
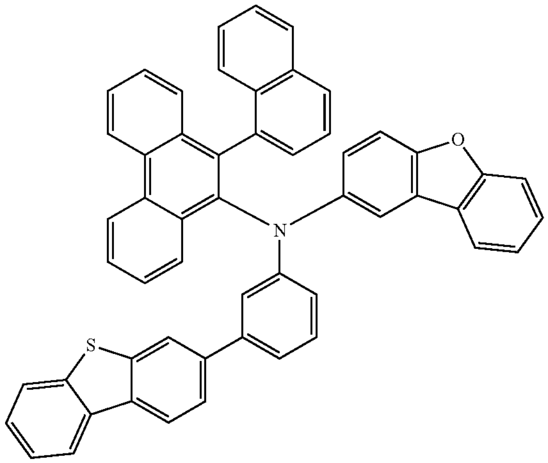
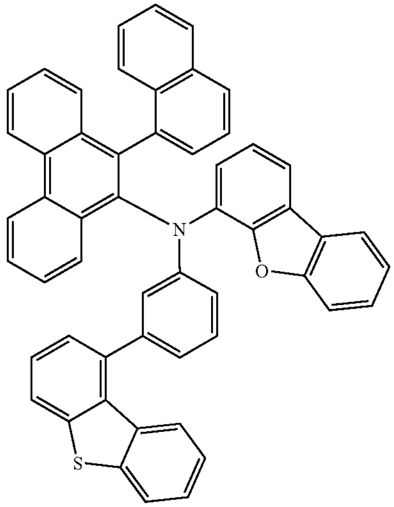

-continued
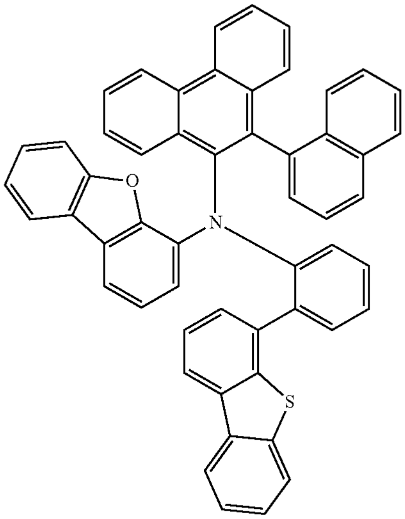
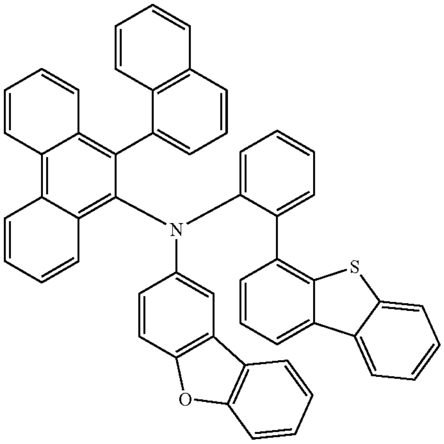
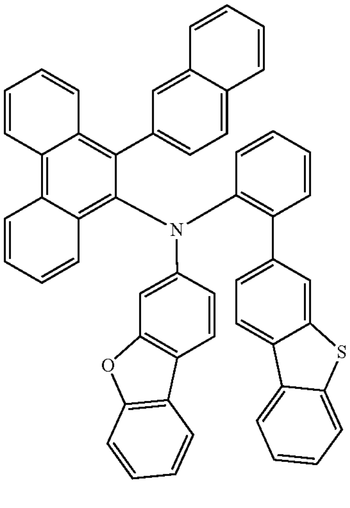
-continued
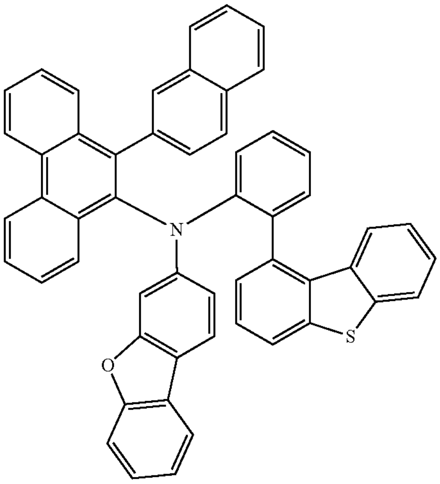
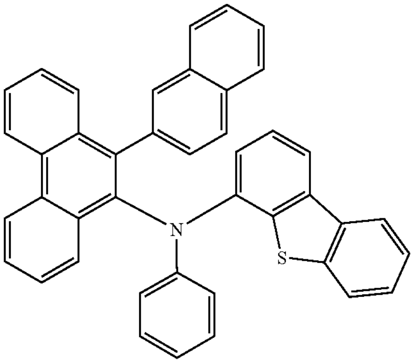
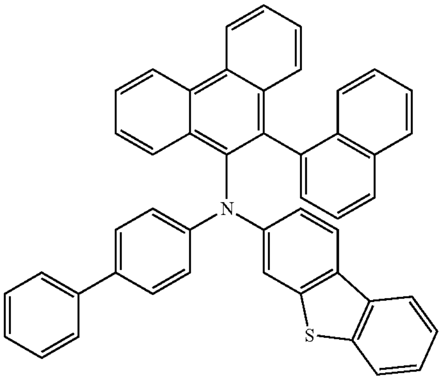
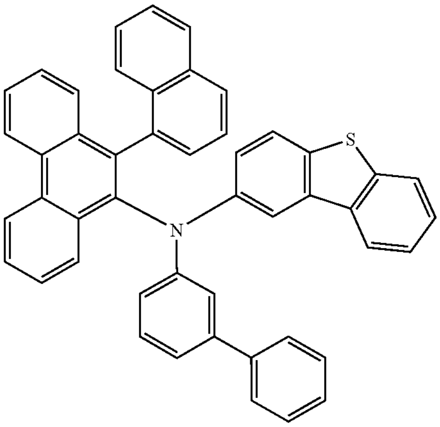

-continued
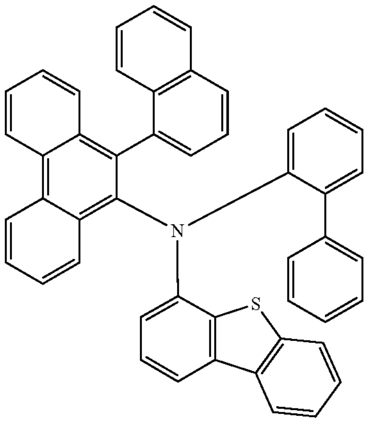
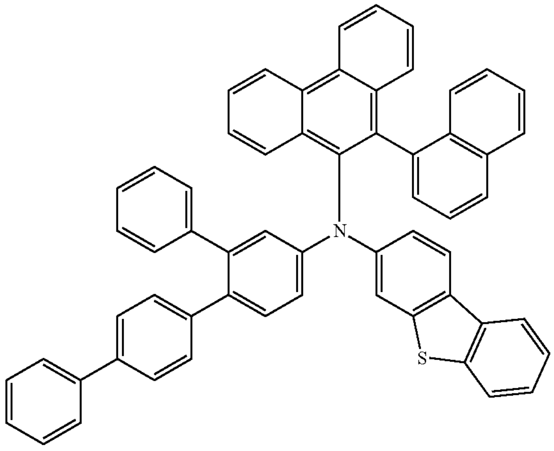
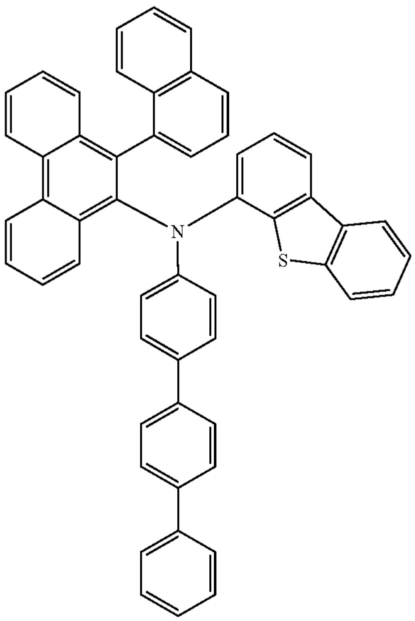
-continued
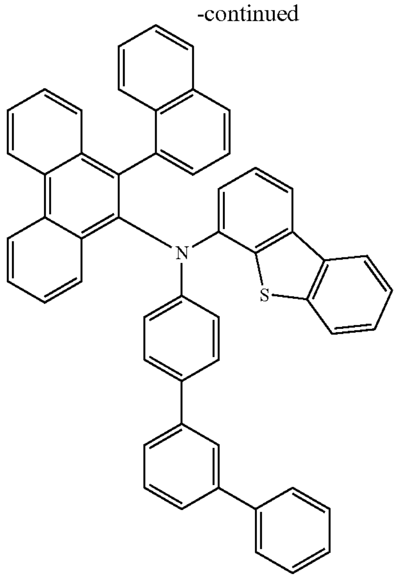
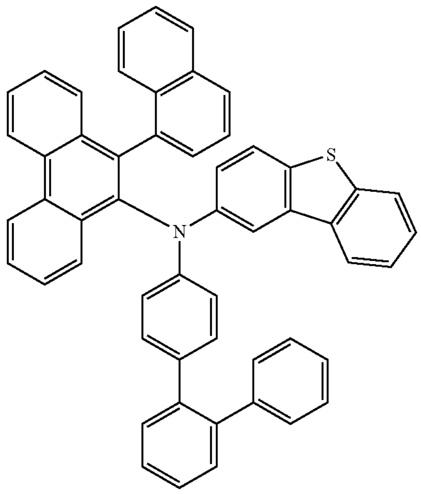
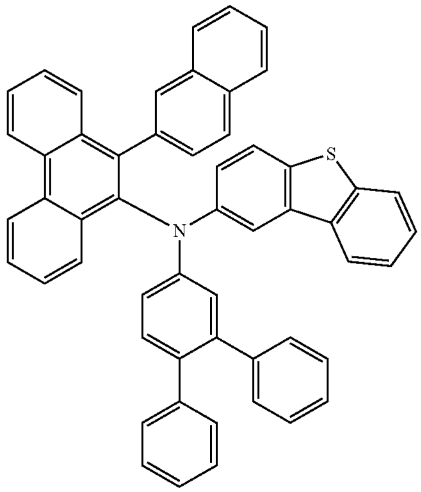

-continued
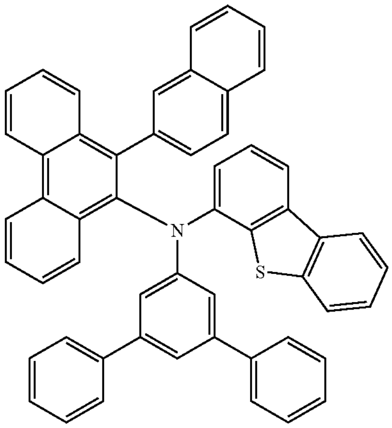
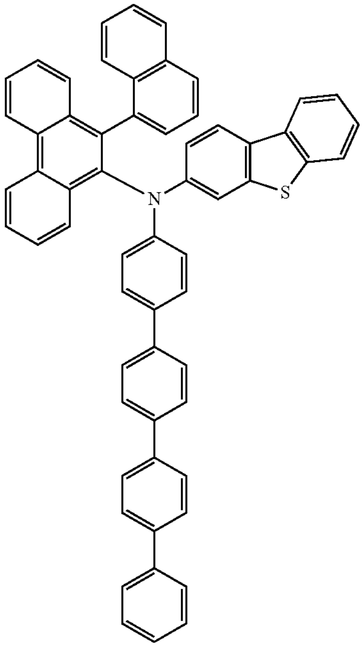
-continued
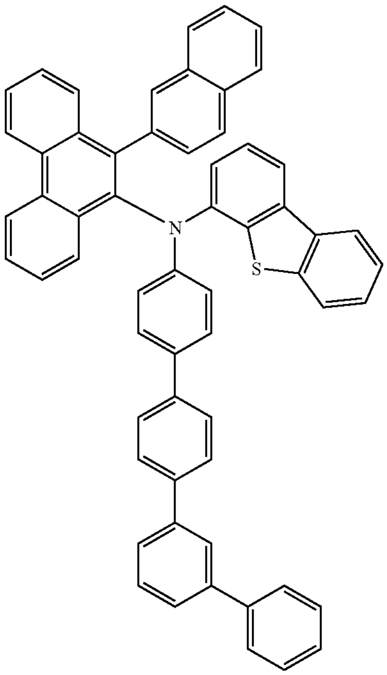
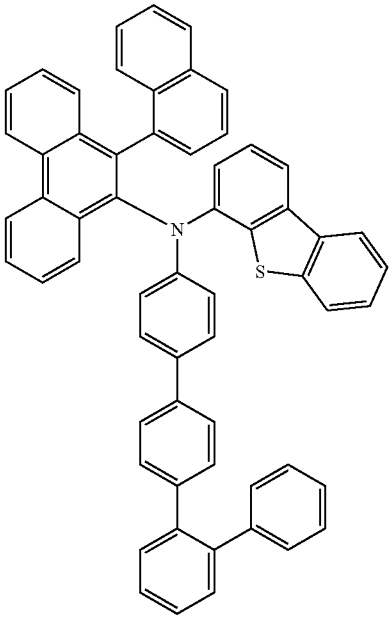

-continued
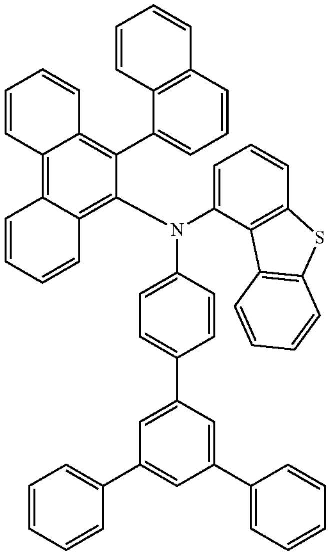
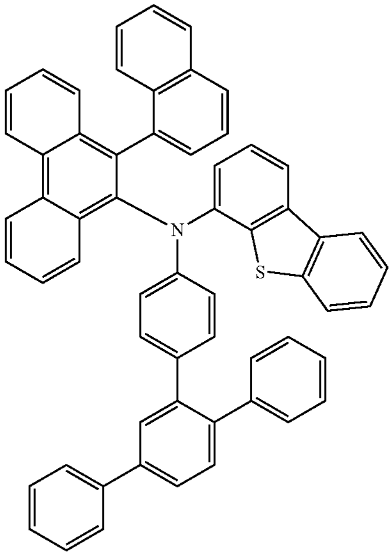
-continued
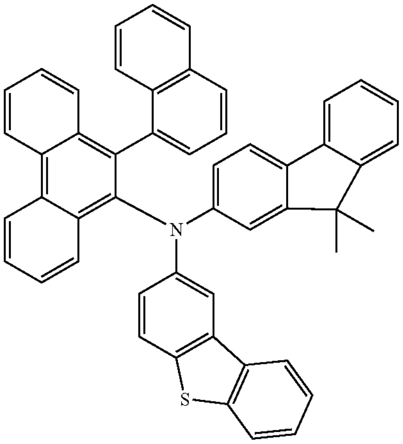
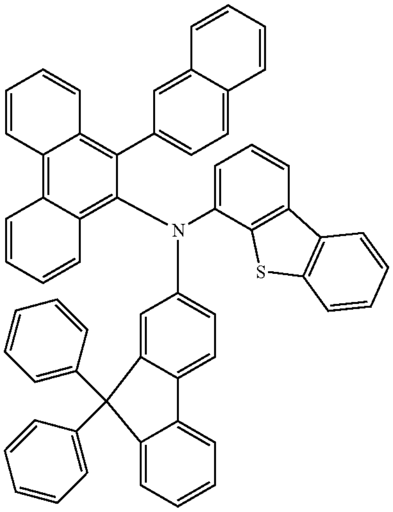
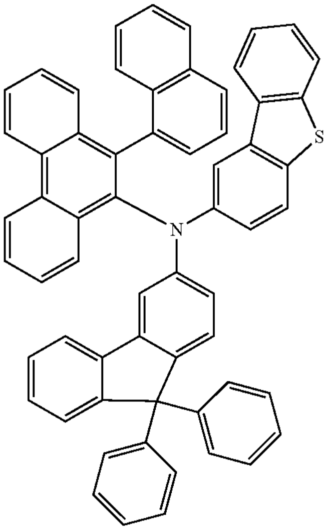

-continued
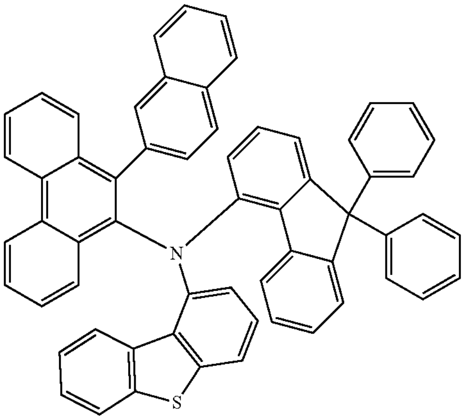
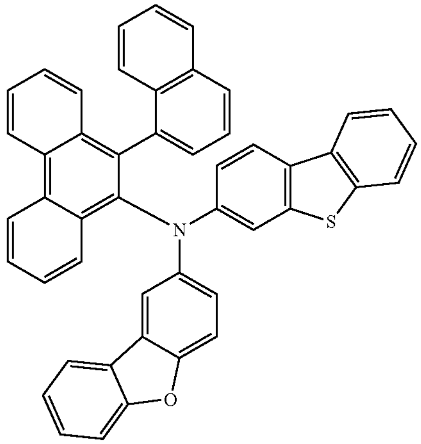
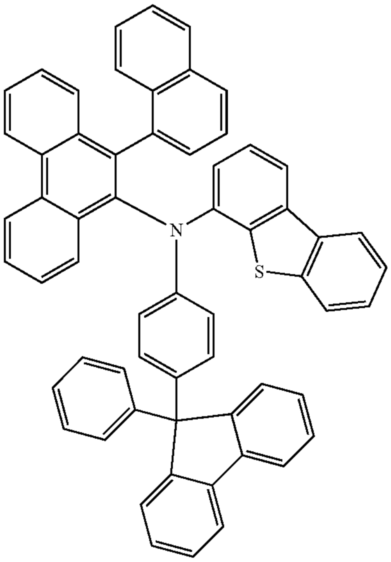
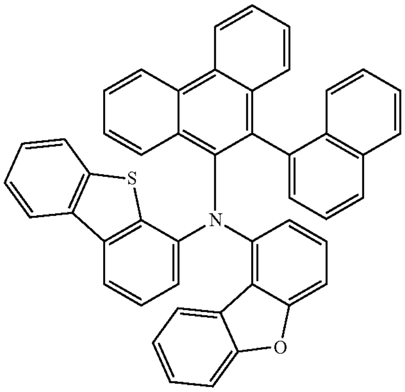
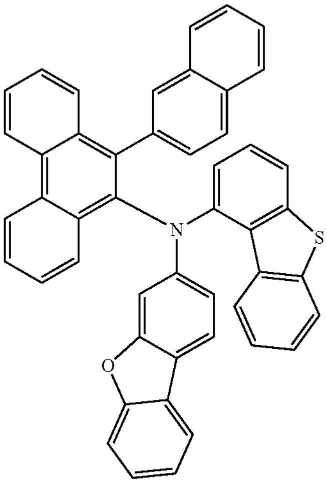
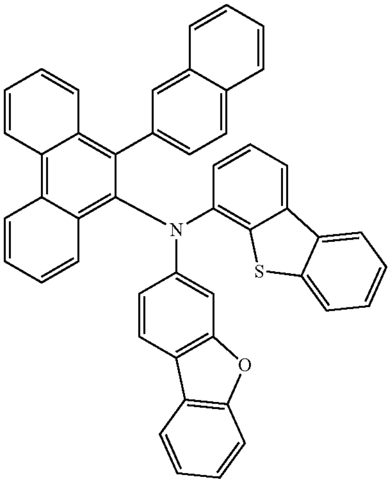
-continued -continued
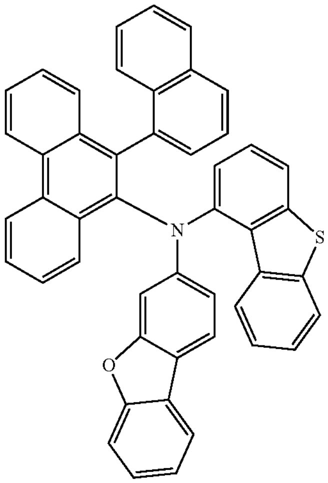
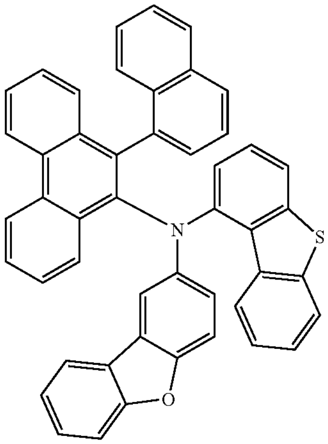
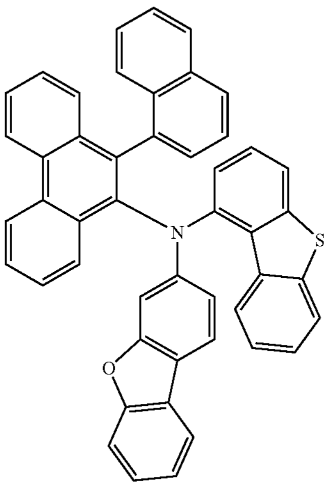
-continued
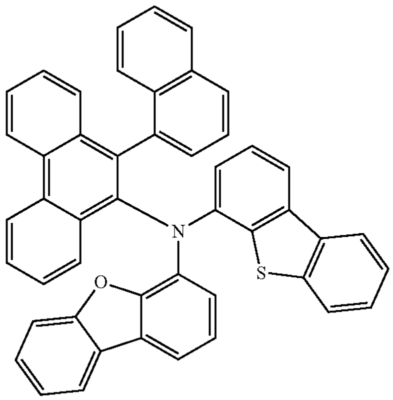
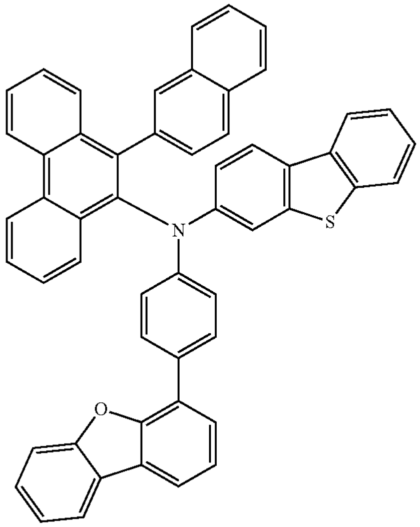
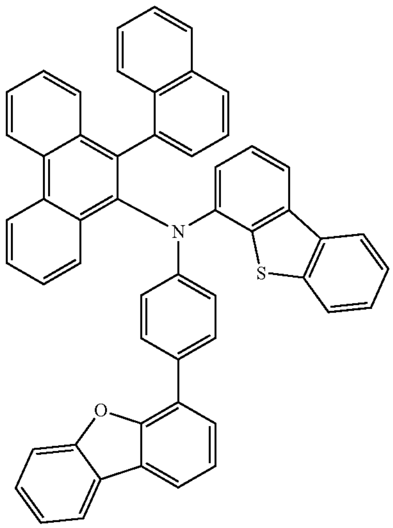

-continued
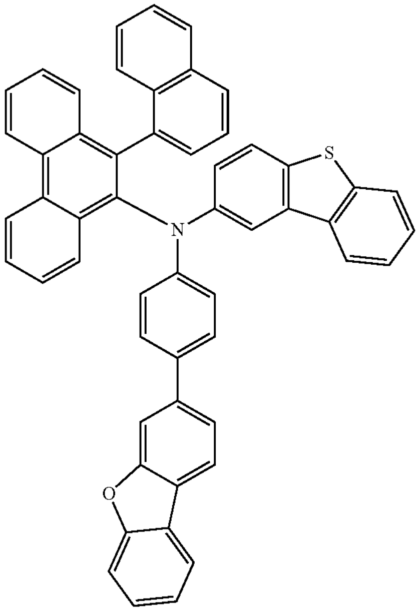
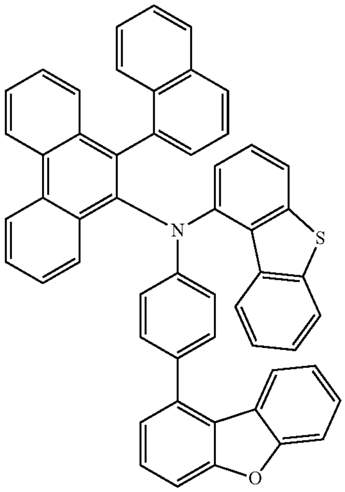
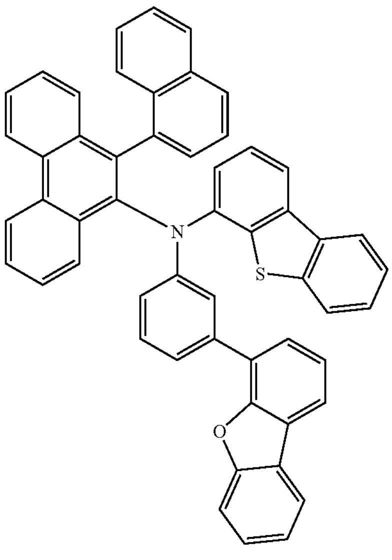
-continued
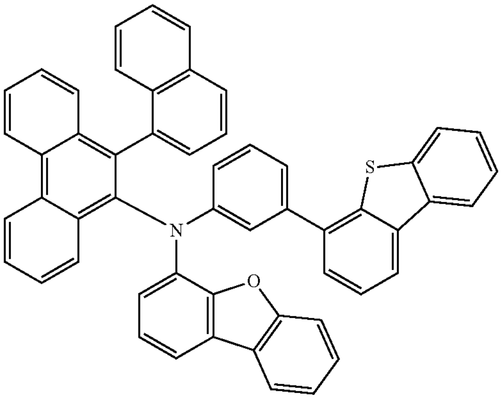
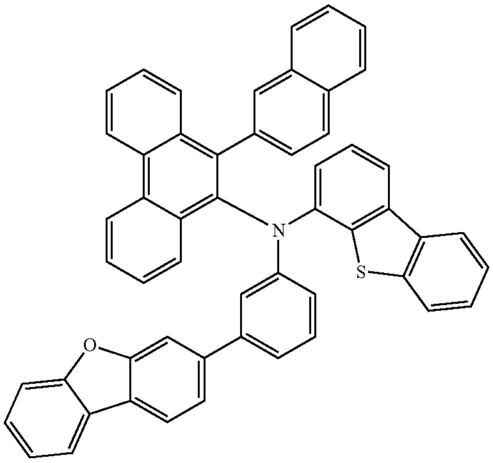
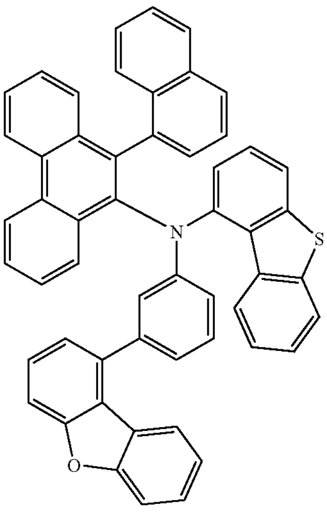

-continued
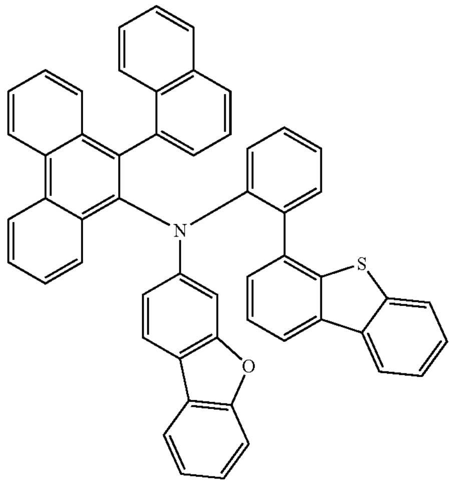
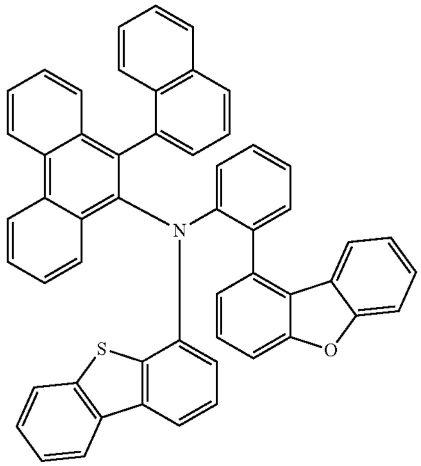
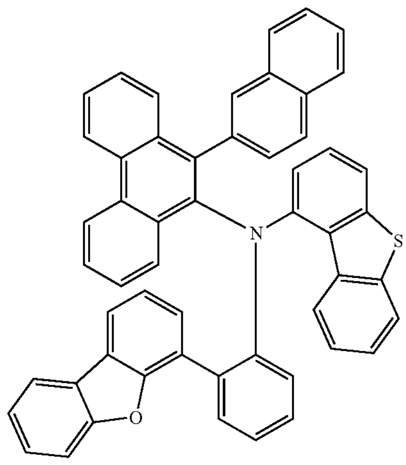
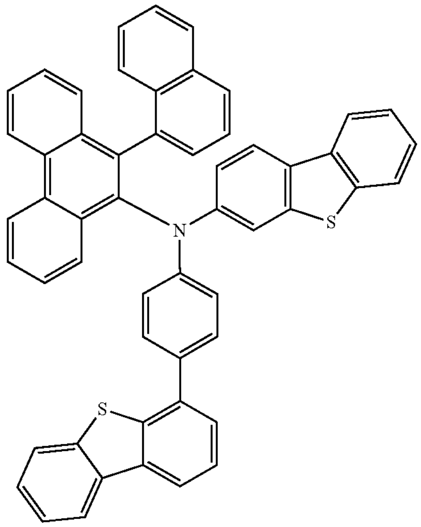
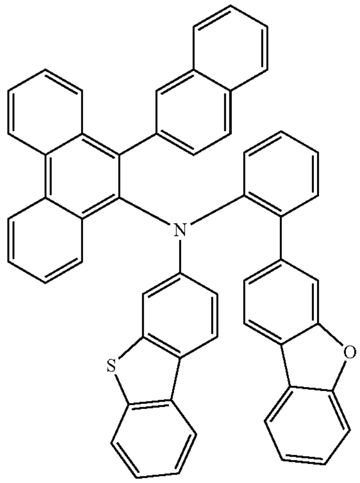
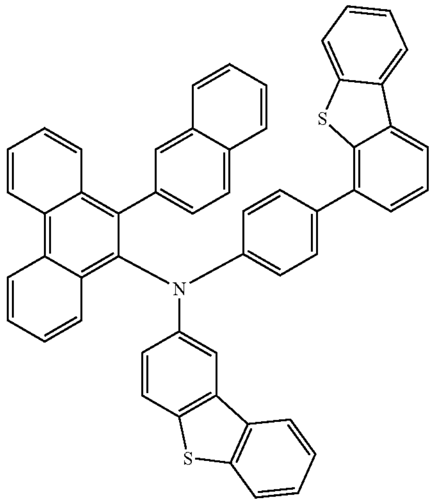
-continued -continued
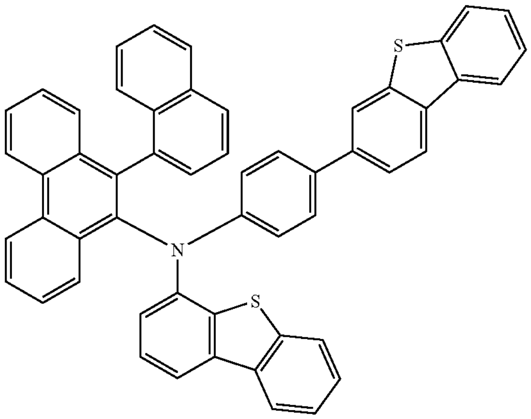
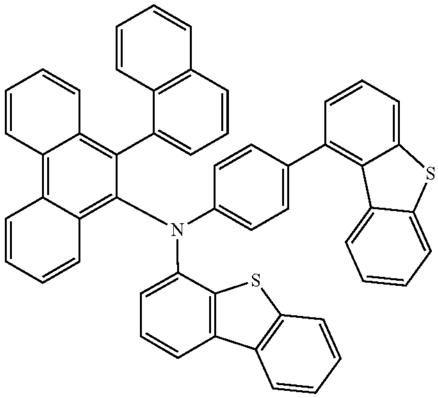
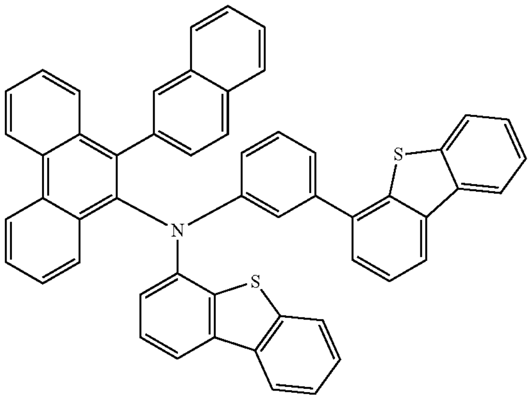
-continued
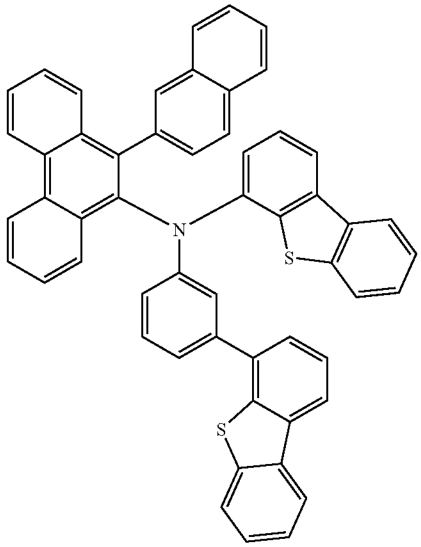
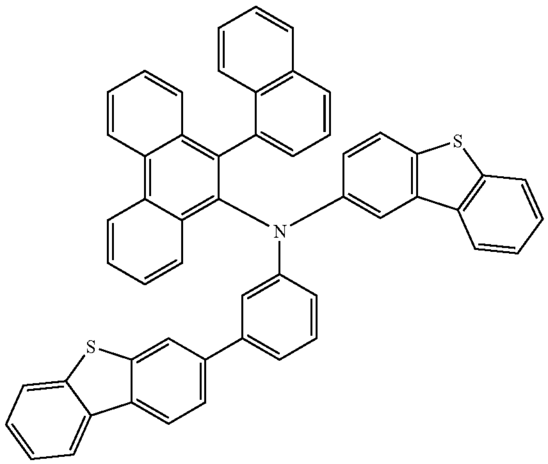
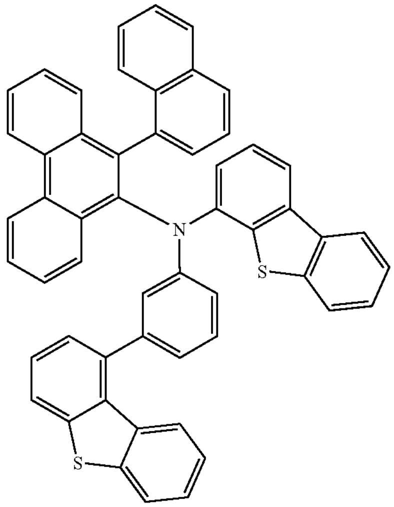

-continued
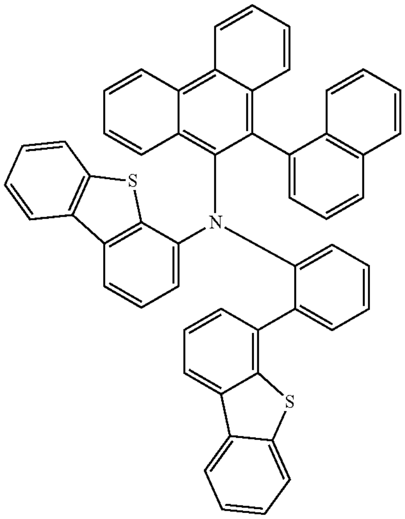
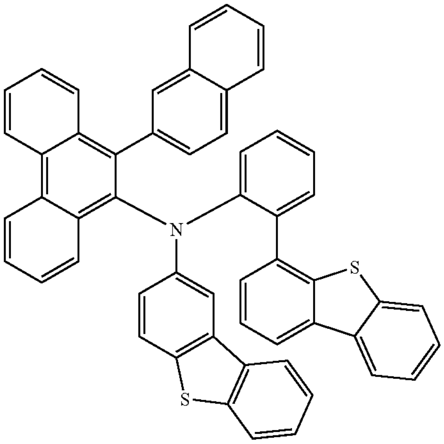
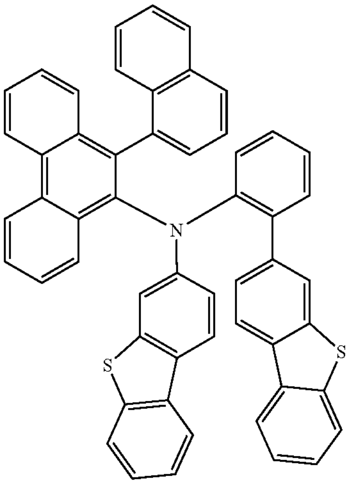
-continued
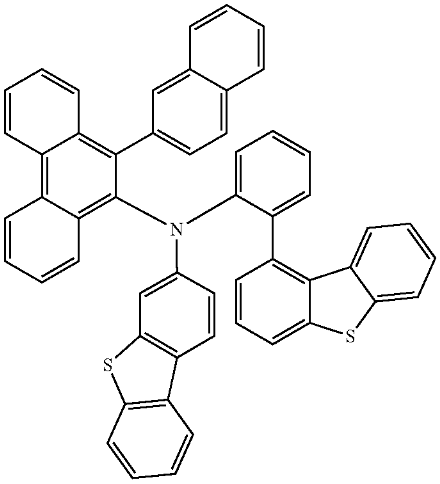
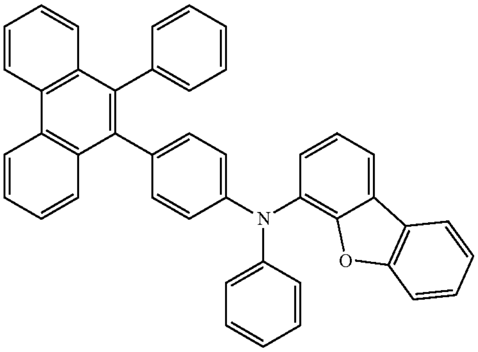
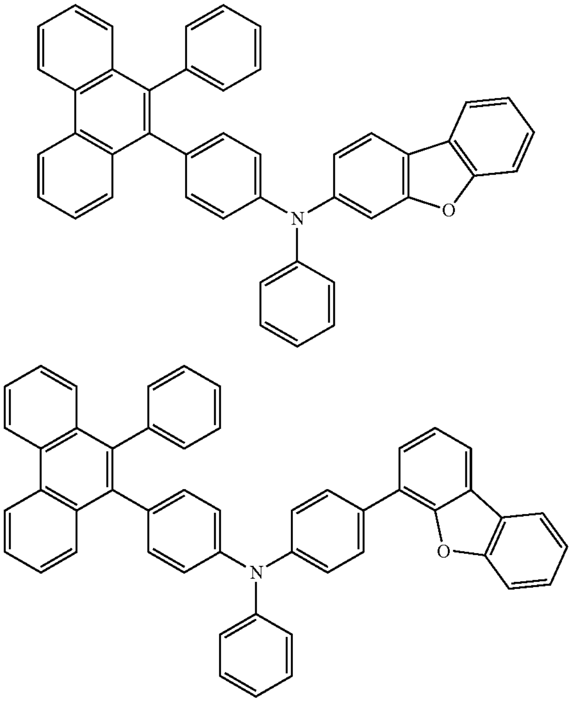

-continued
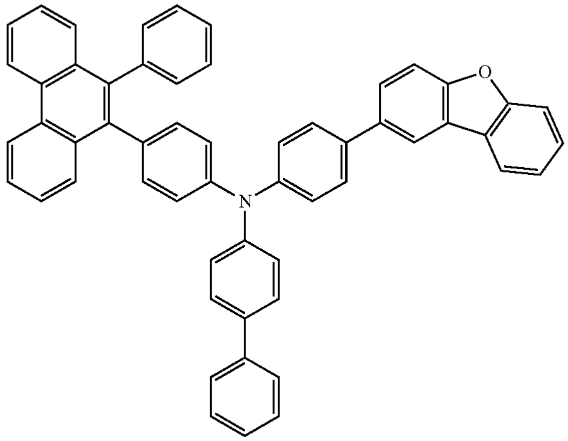
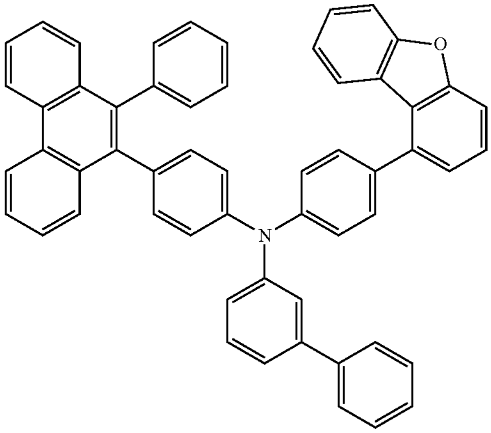
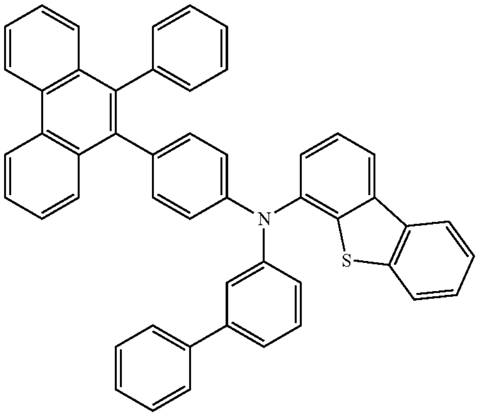
-continued
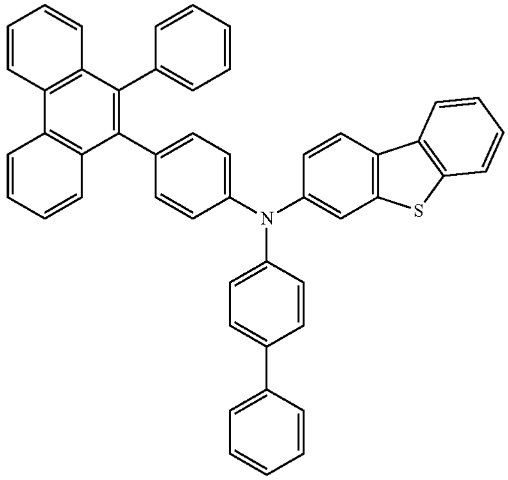
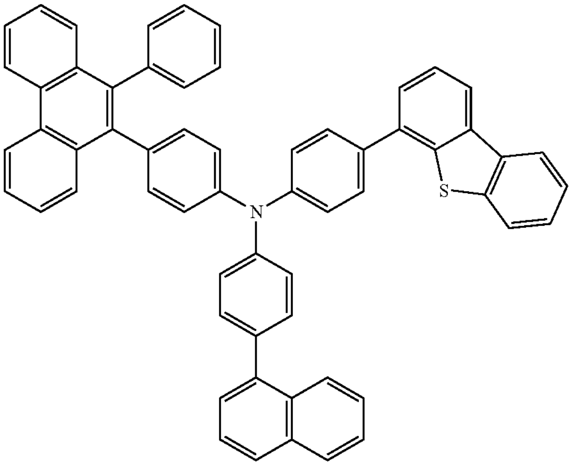
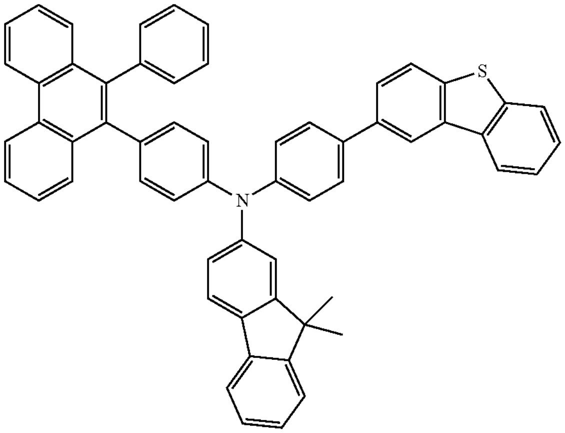

-continued
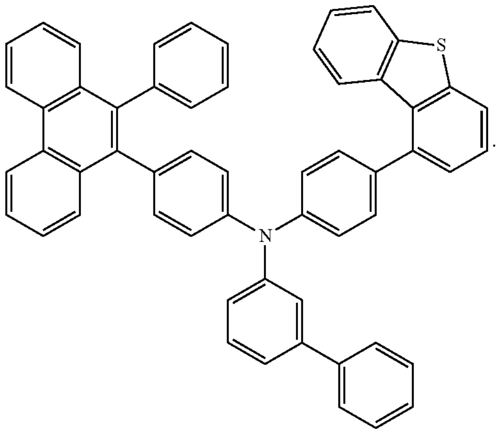
11. The organic light emitting device of claim 10, wherein the compound of Formula 2 is selected from among the following compounds:
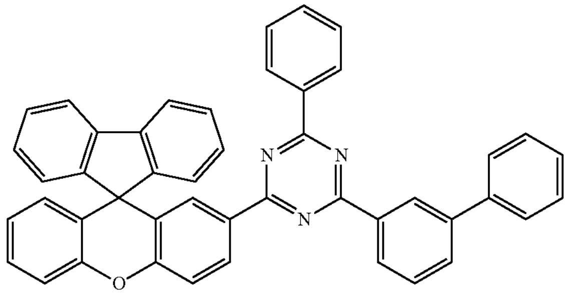
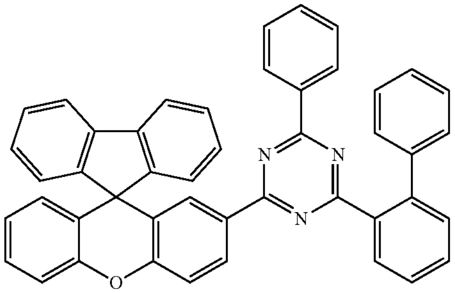
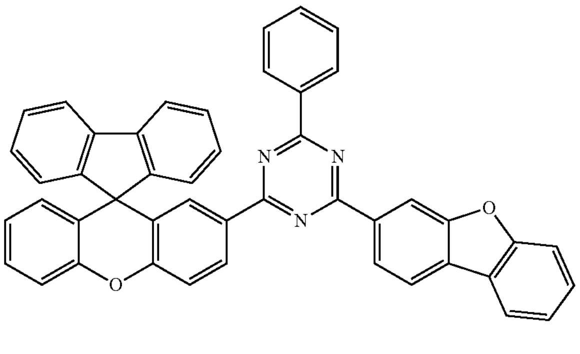
-continued
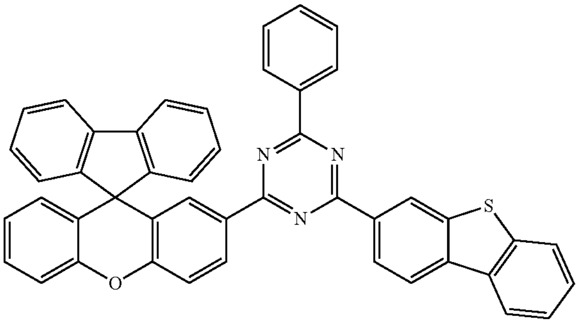
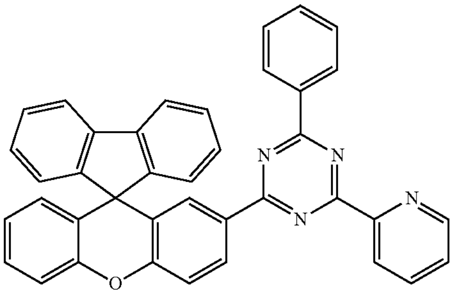
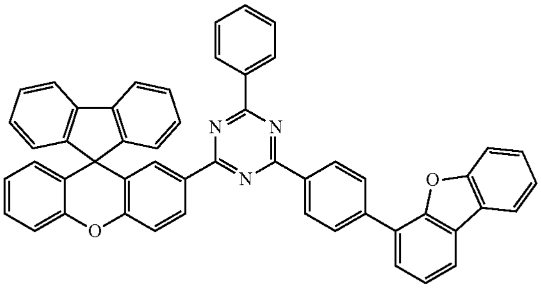
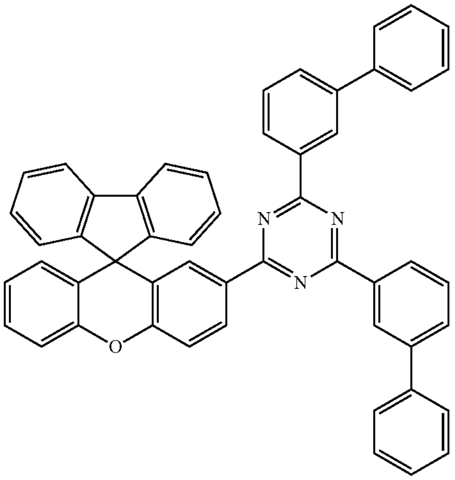

-continued
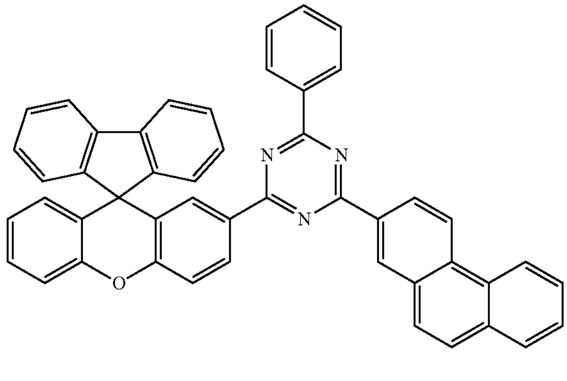
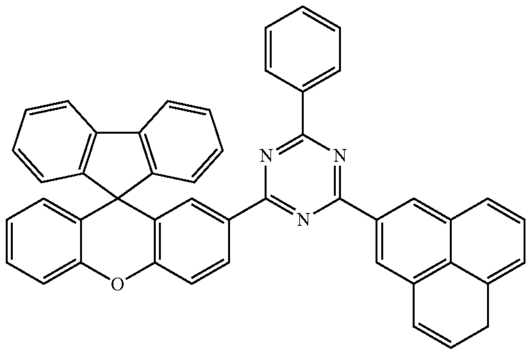
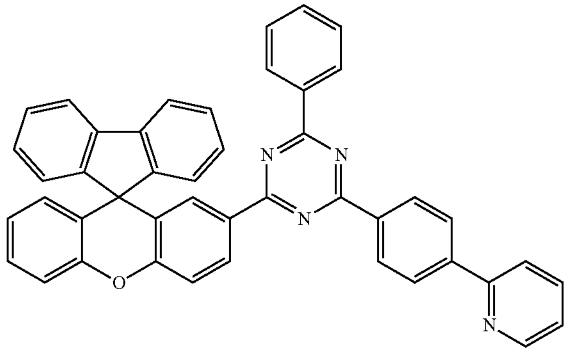
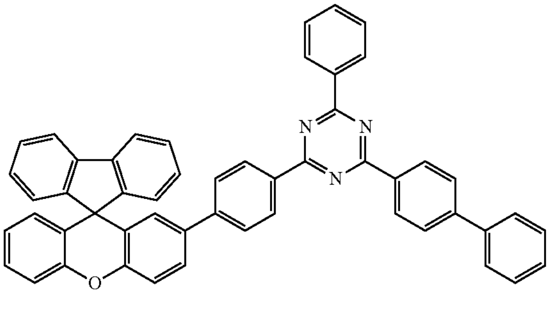
-continued
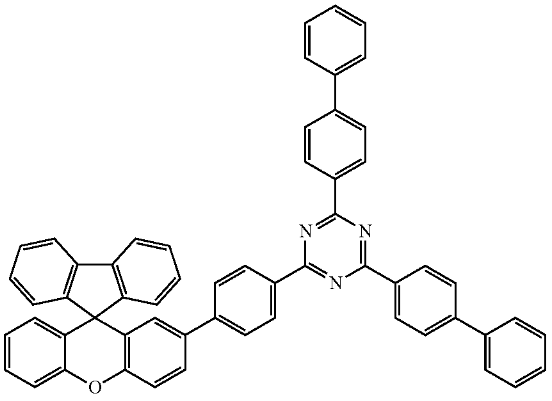
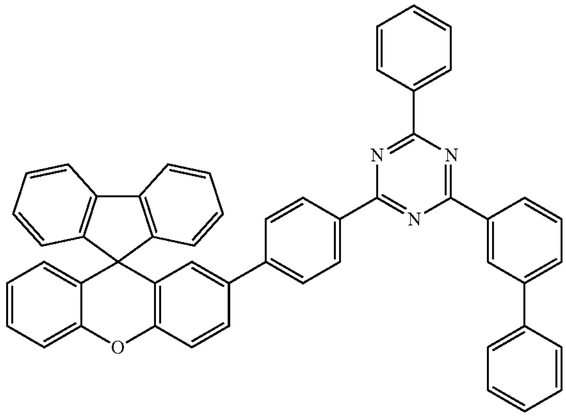
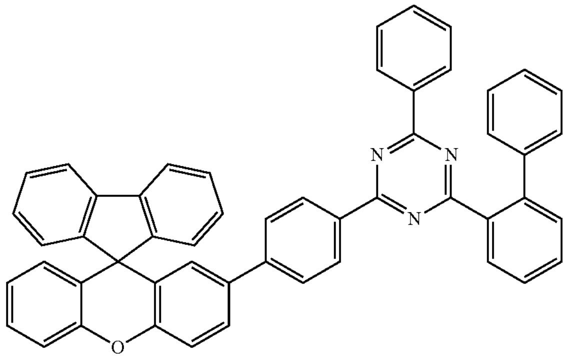
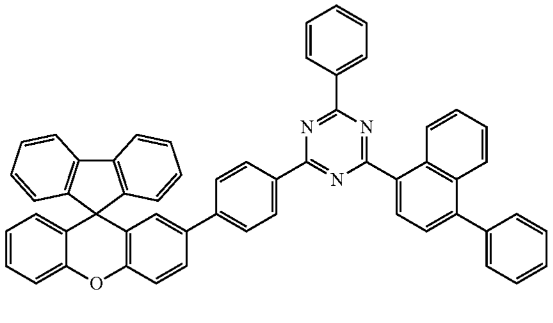

-continued
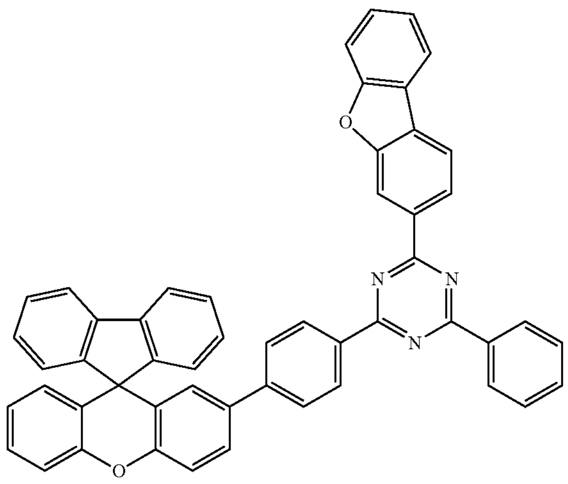
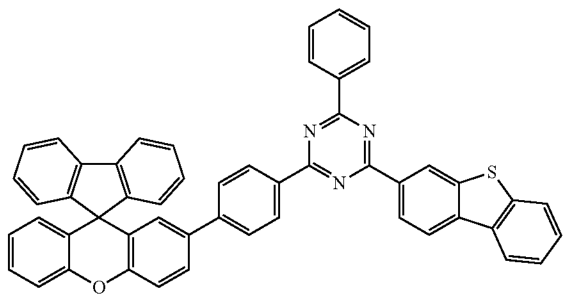
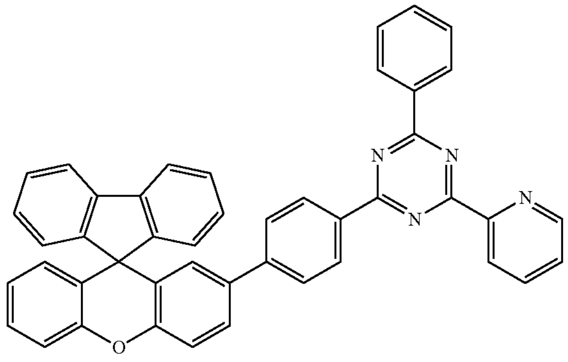
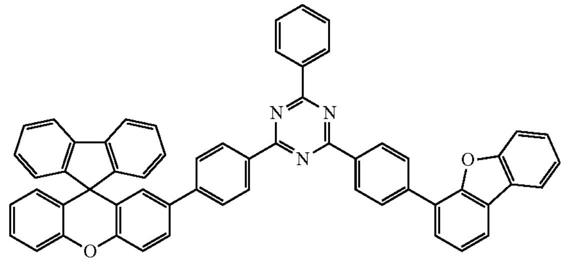
-continued
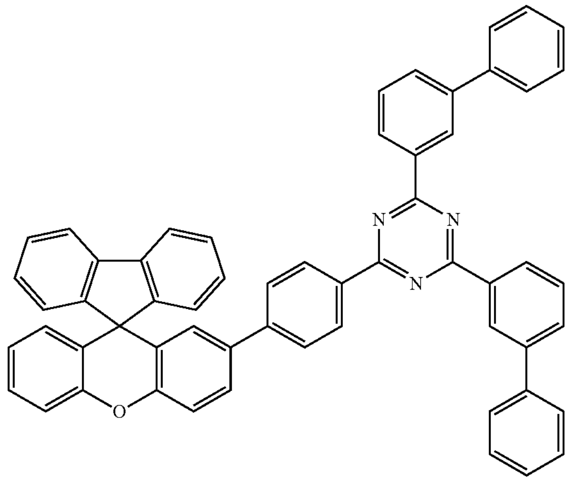
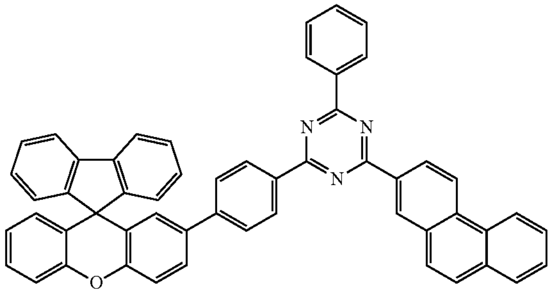
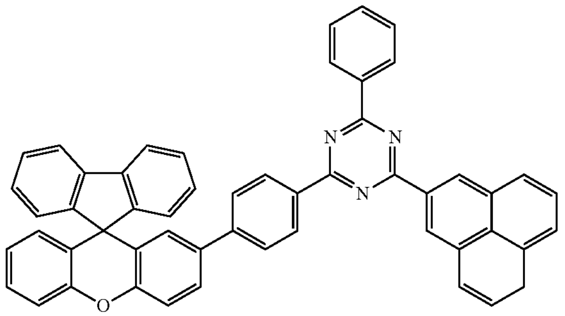
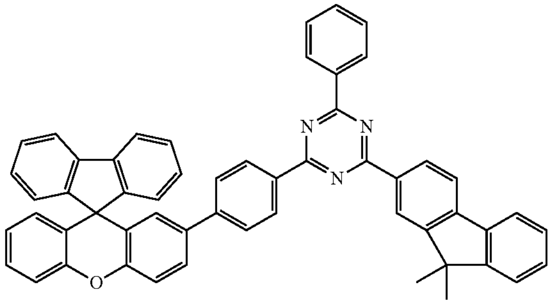
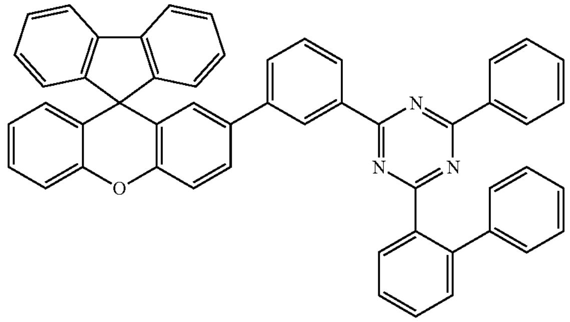

-continued
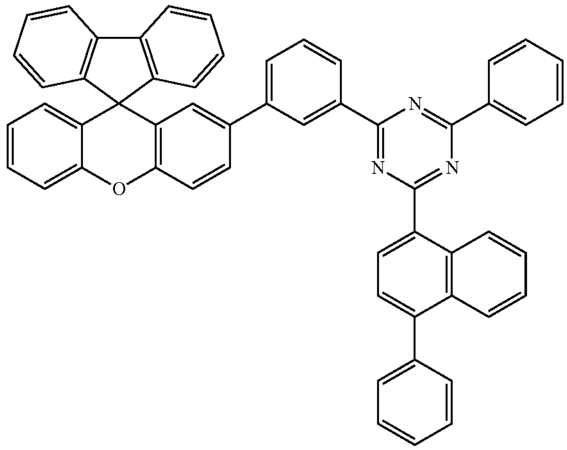
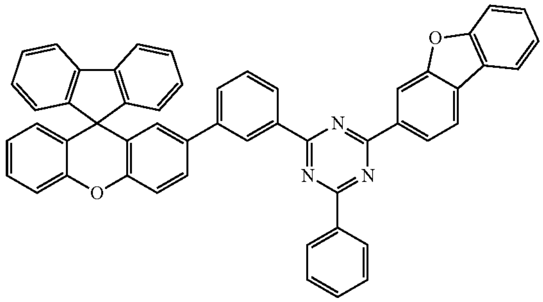
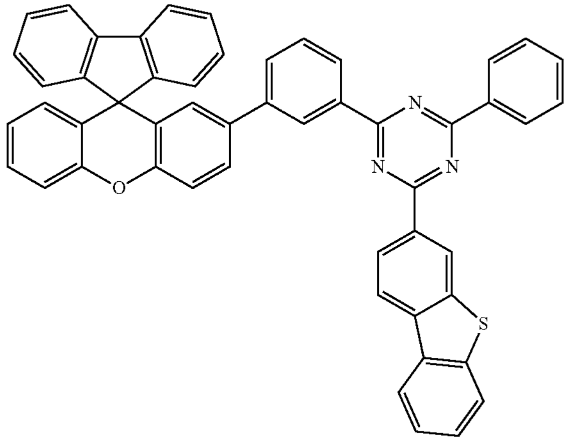
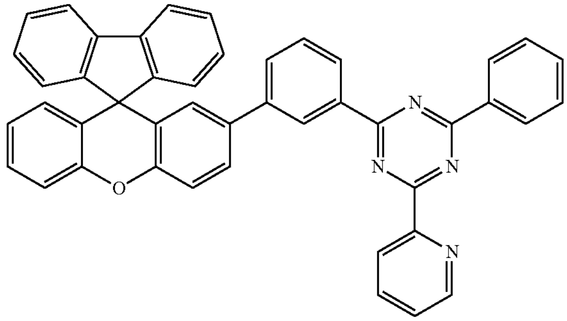
-continued
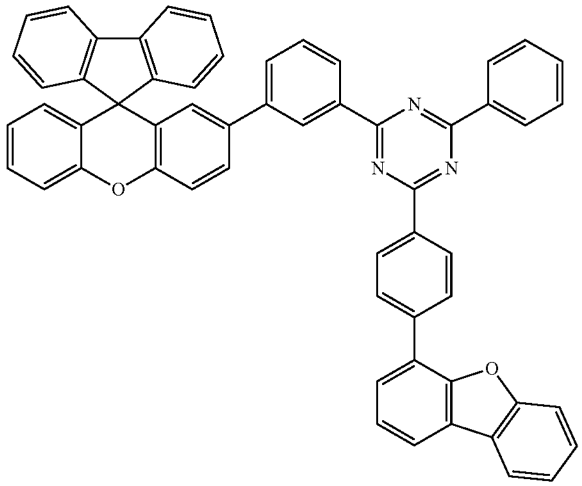
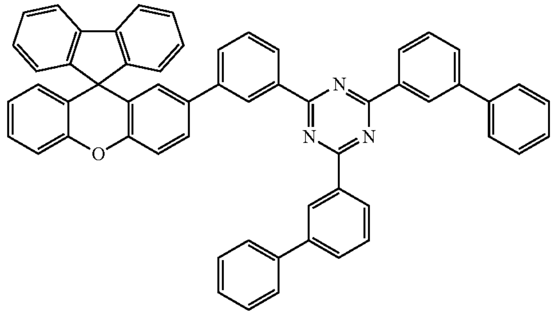
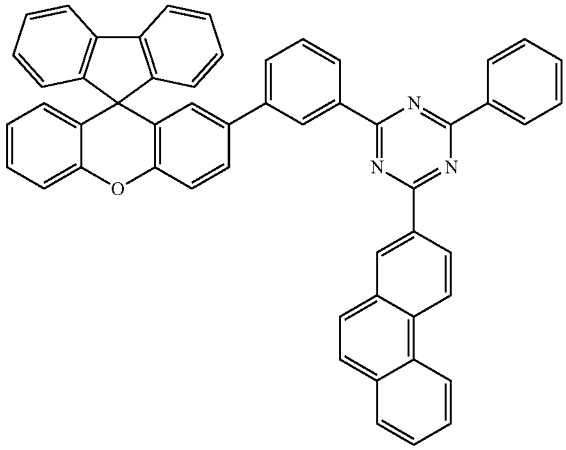
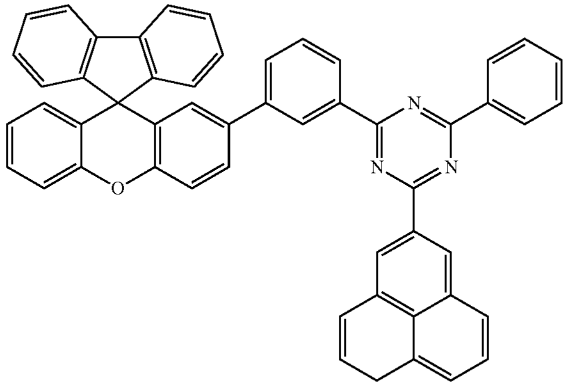

-continued
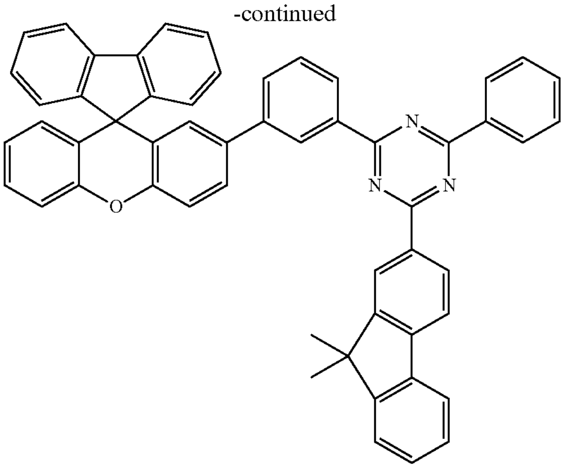
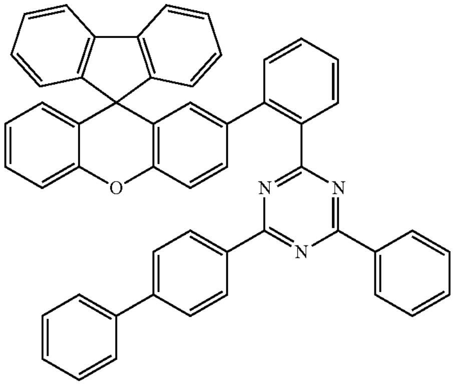
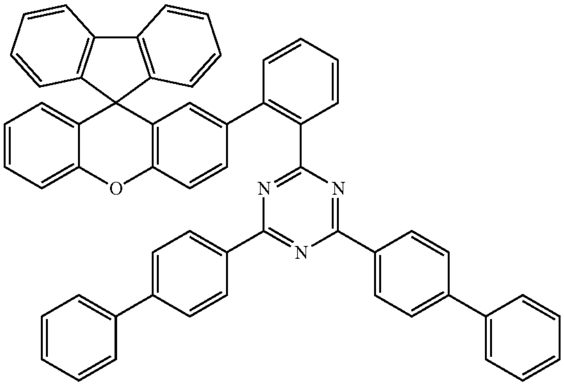
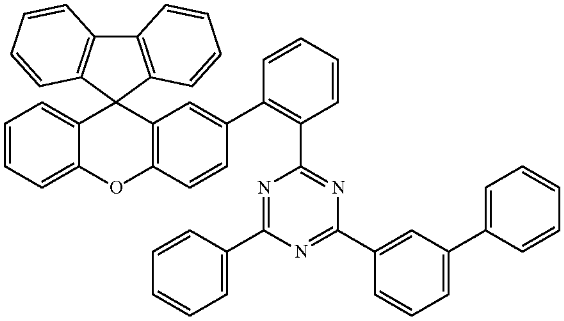
-continued
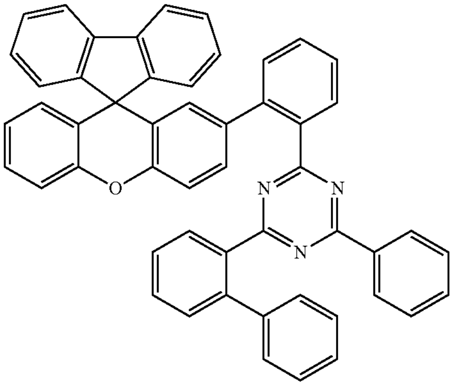
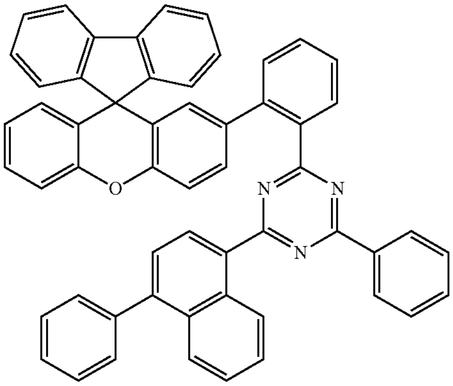
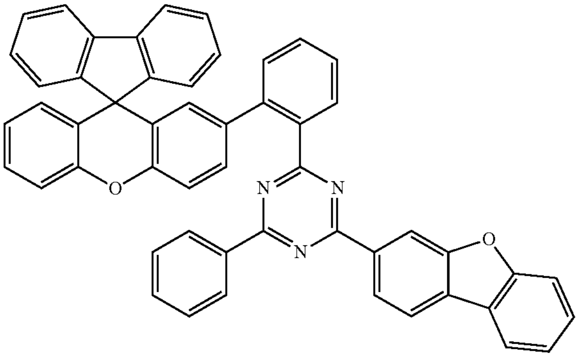
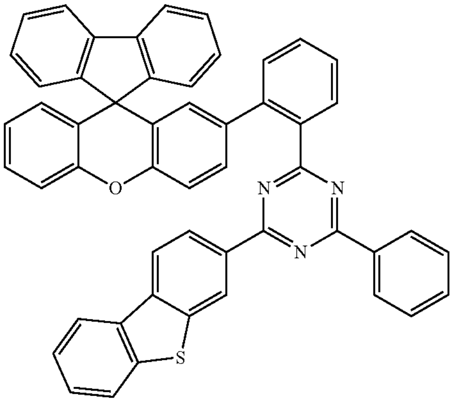

-continued
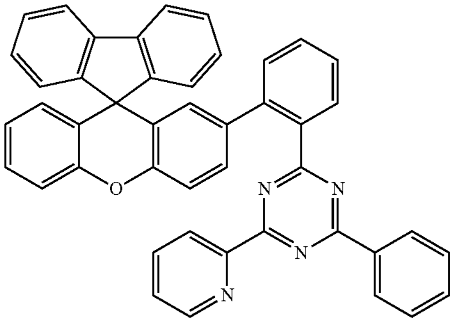
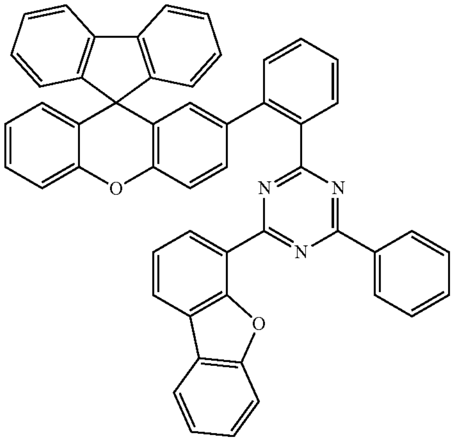
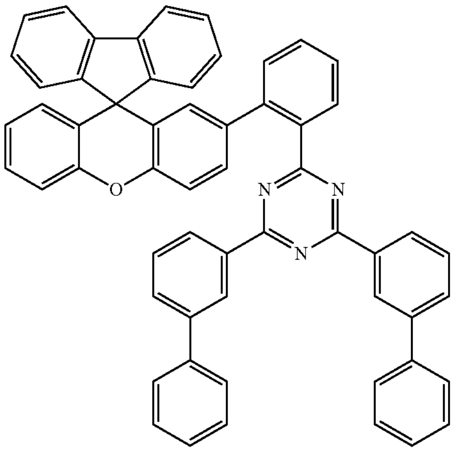
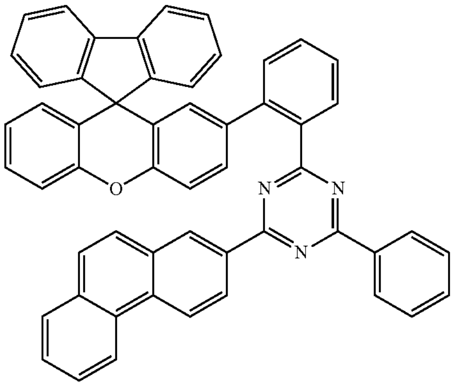
-continued
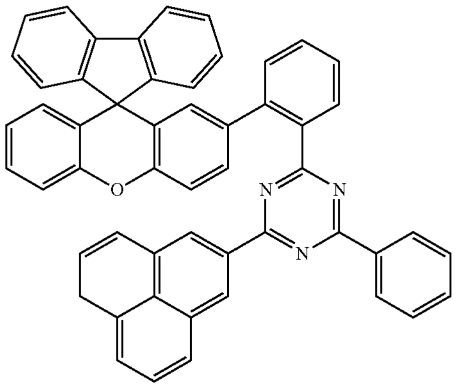
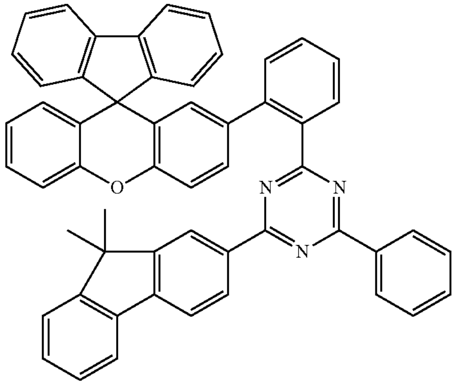
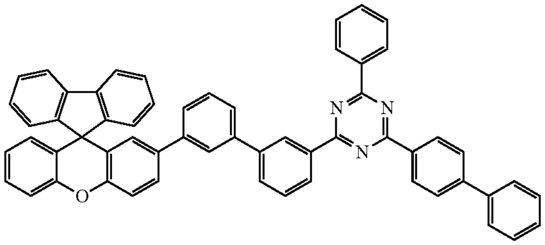
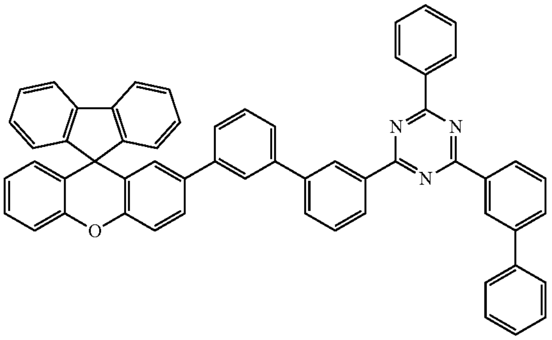
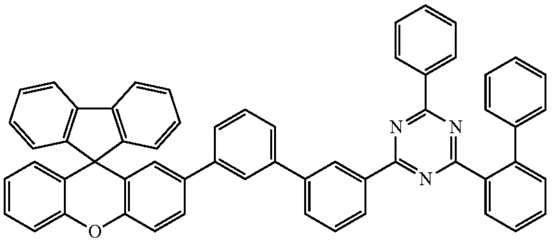

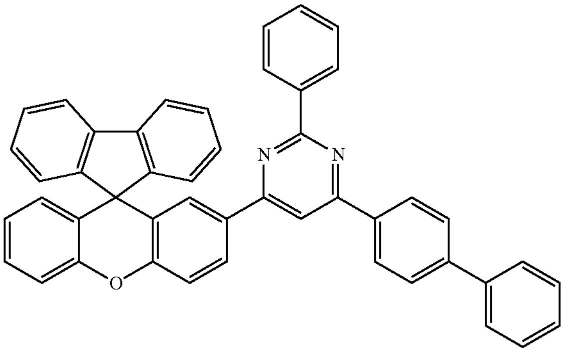
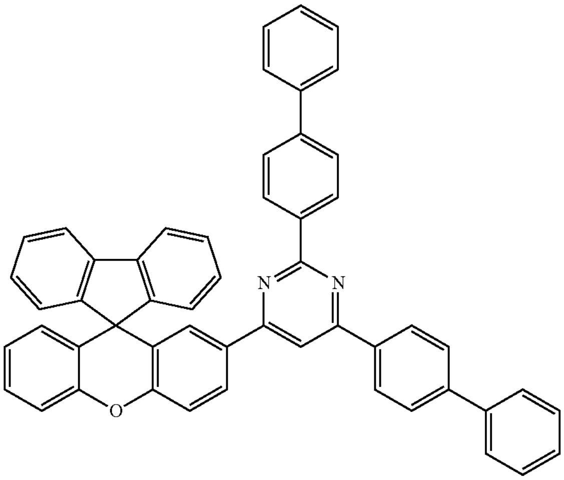
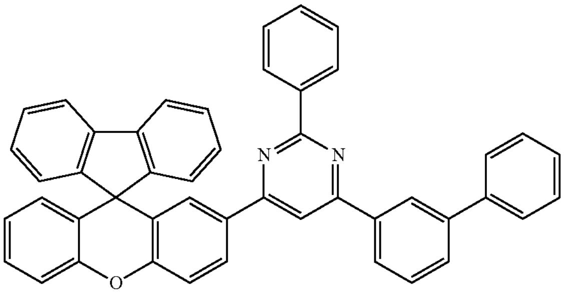
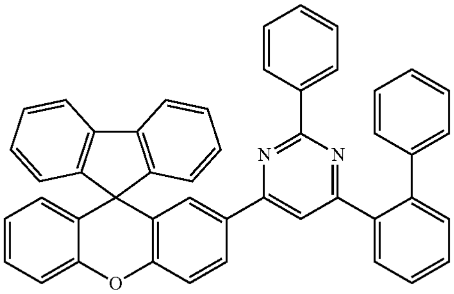
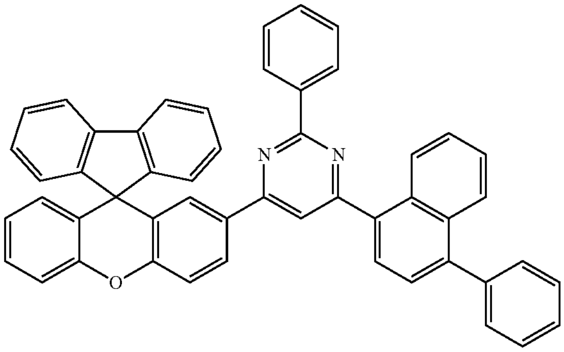
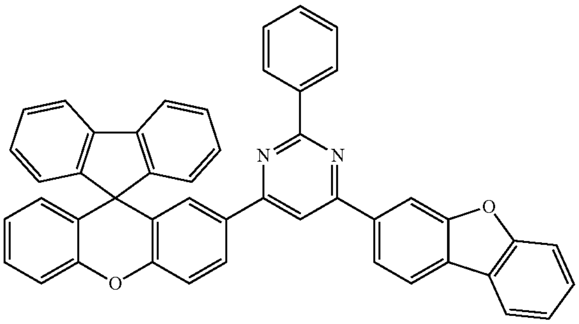
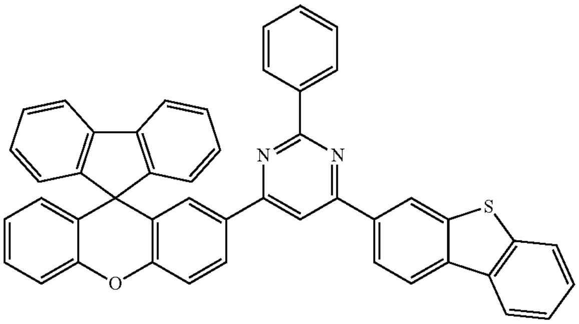
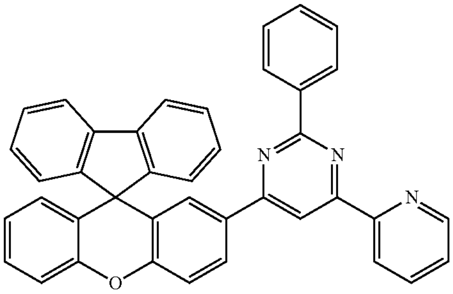
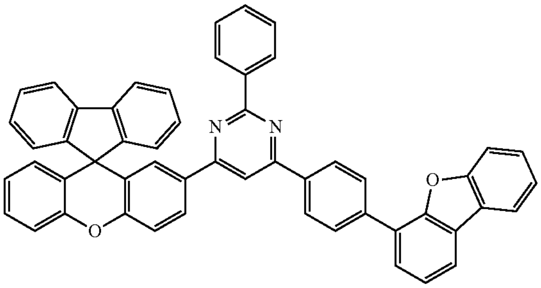

-continued
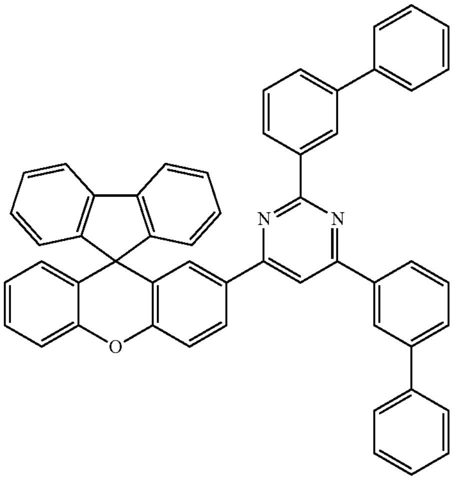
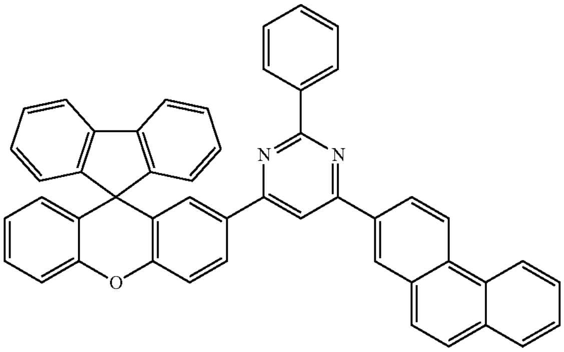
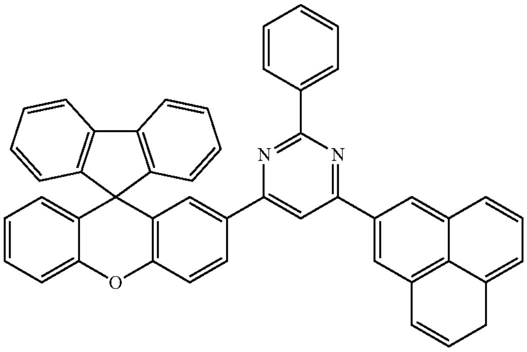
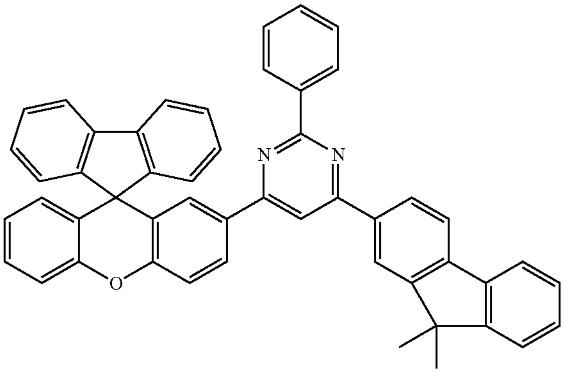
-continued
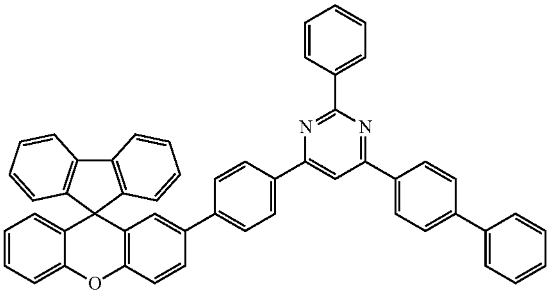
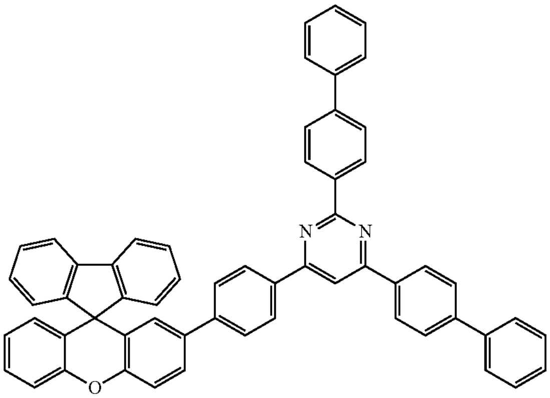
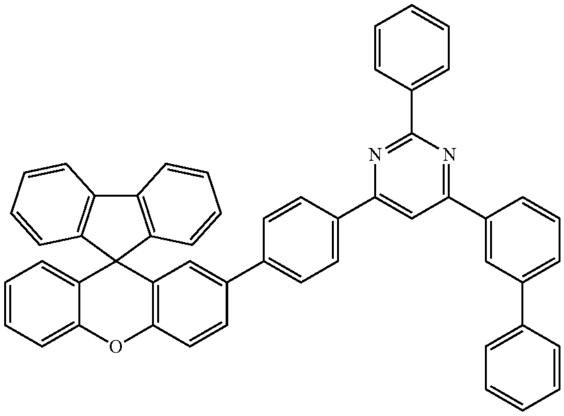
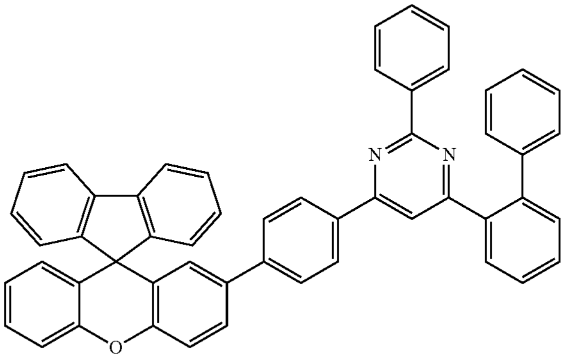

-continued
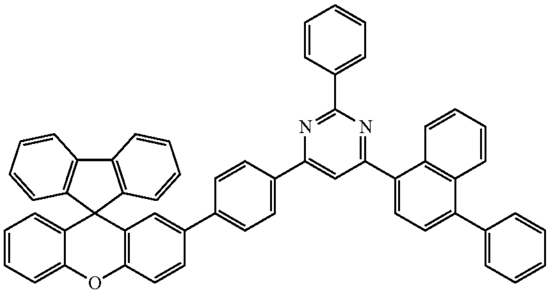
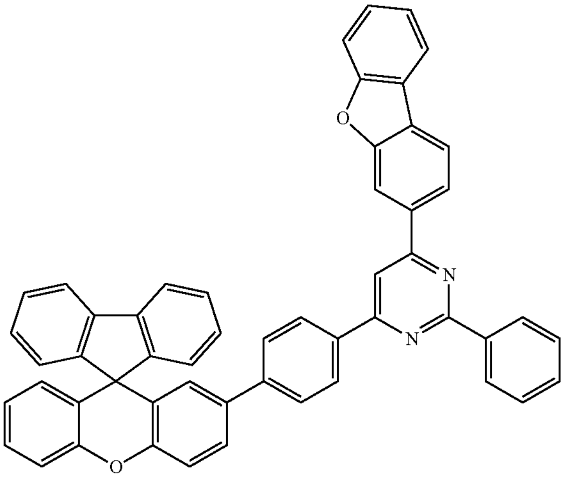
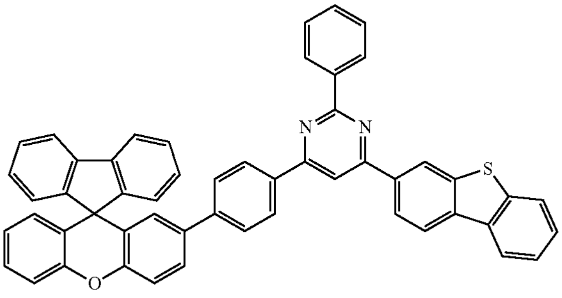
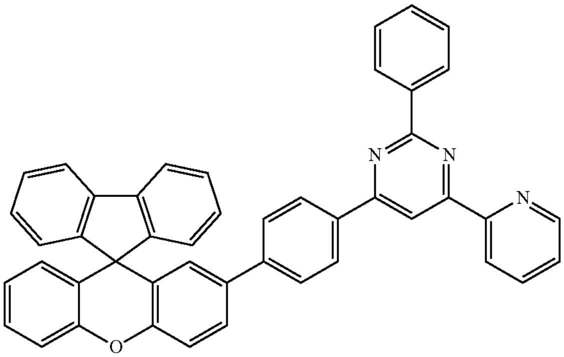
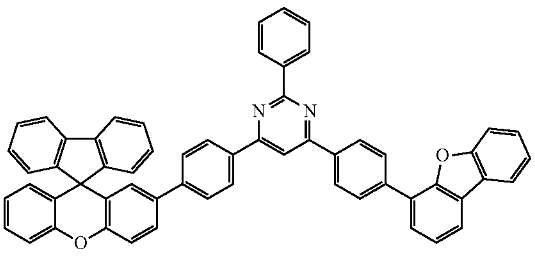
-continued
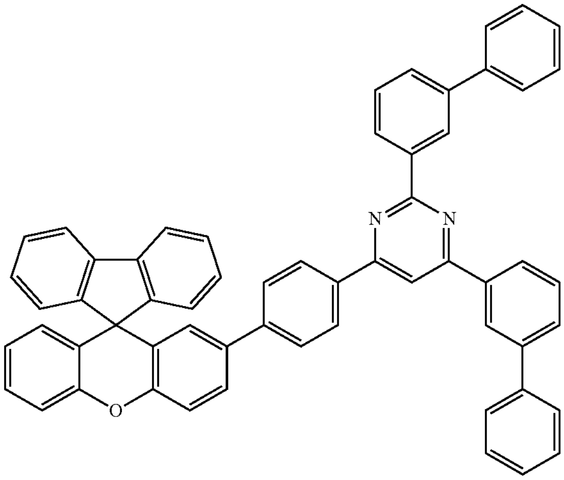
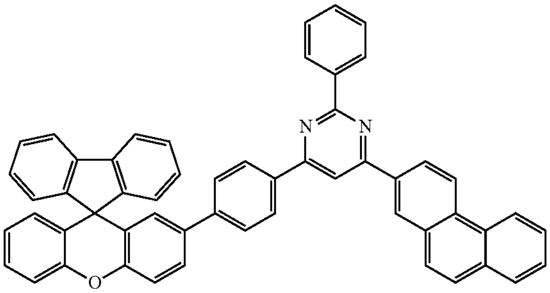
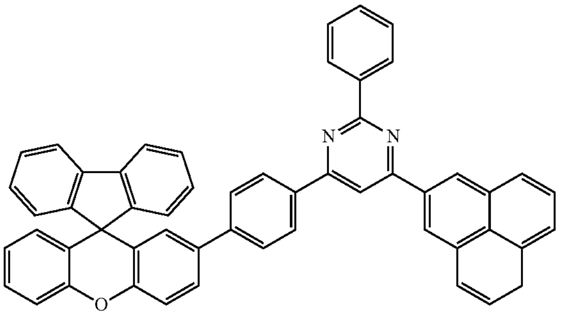
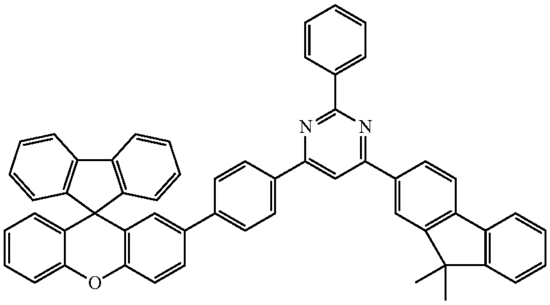
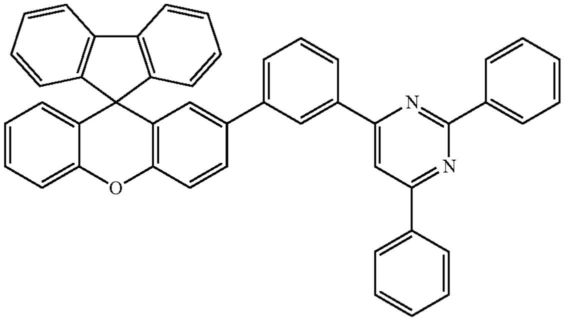

-continued
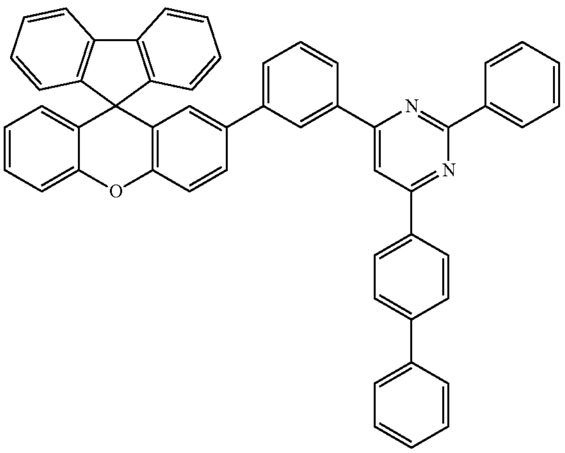
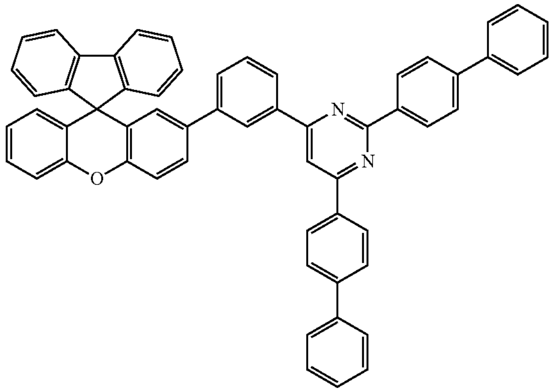
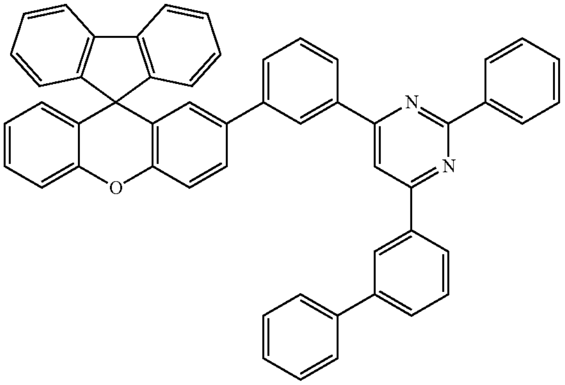
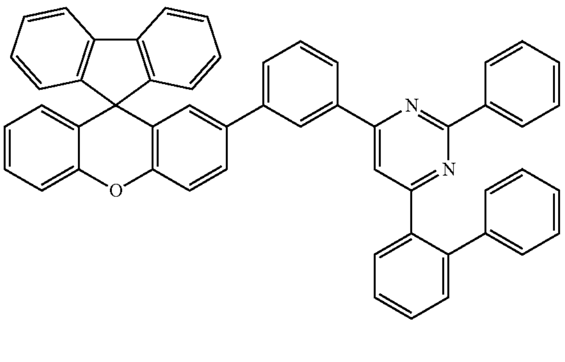
-continued
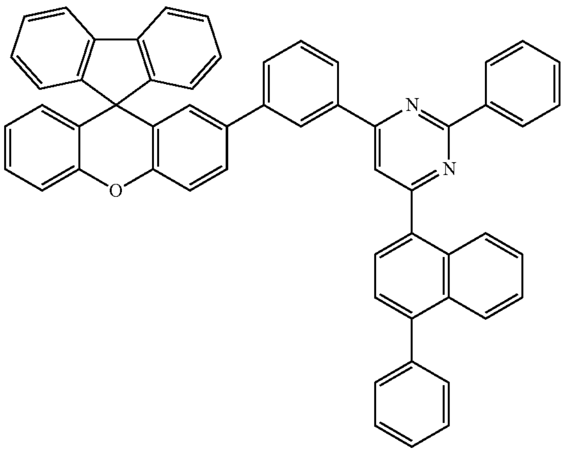
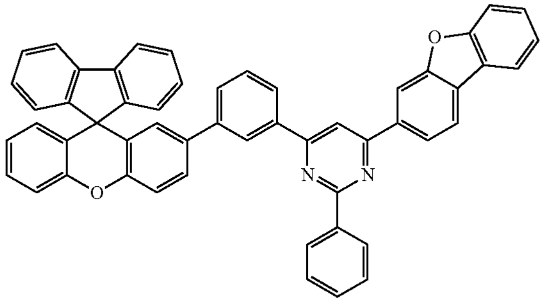
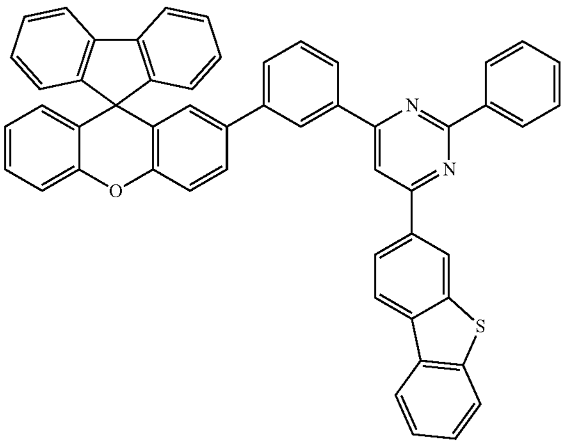
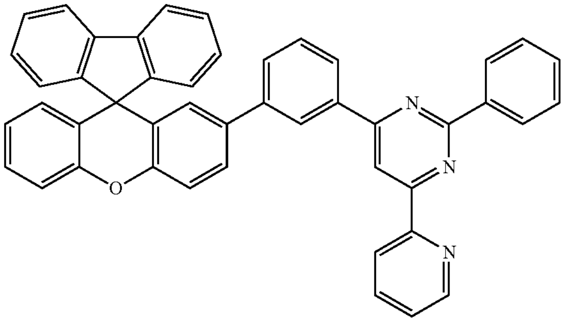

-continued
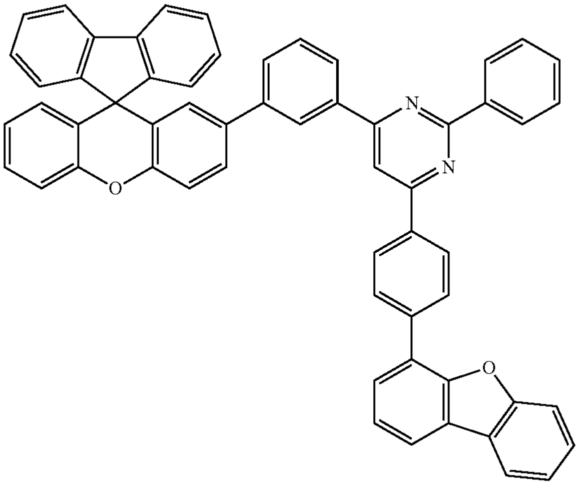
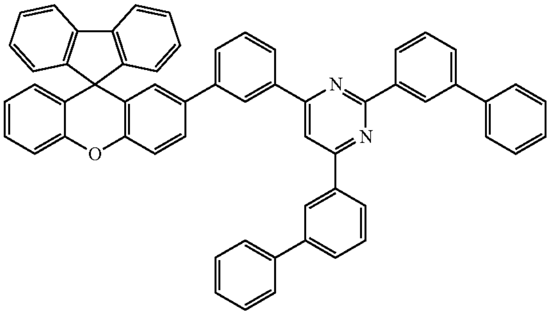
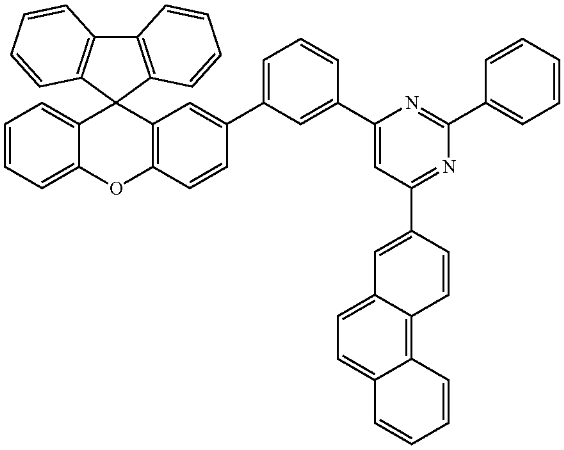
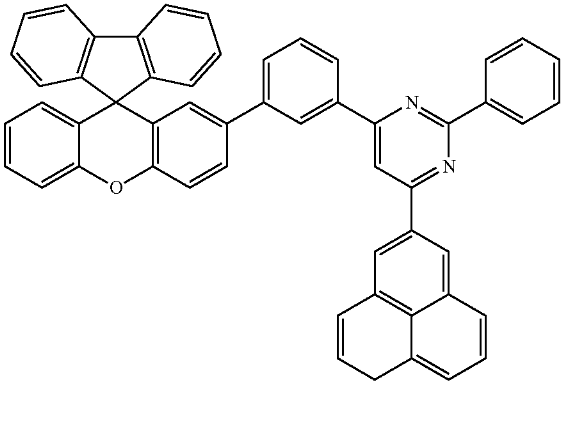
-continued
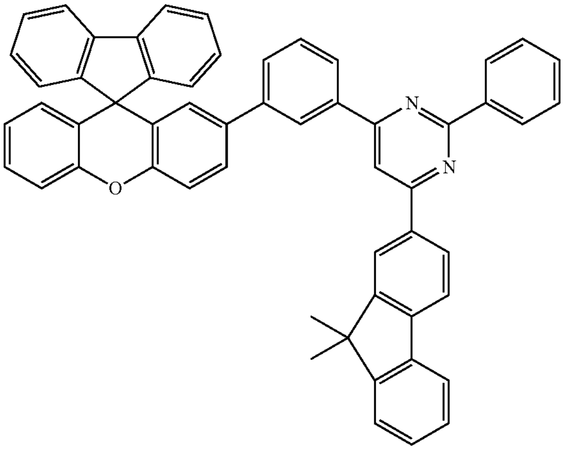
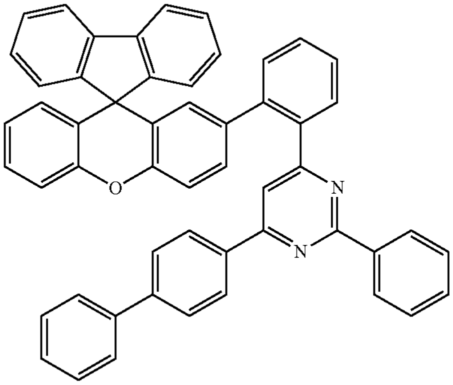
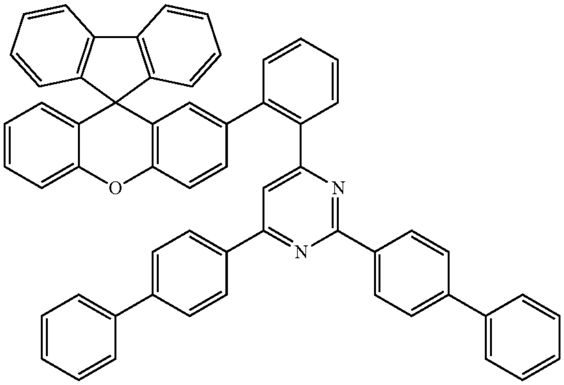
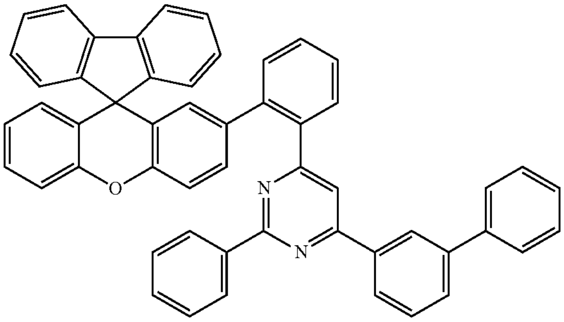

-continued
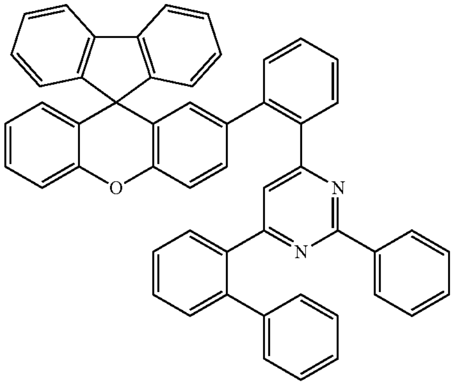
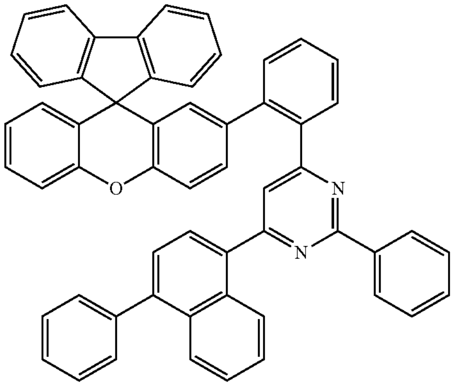
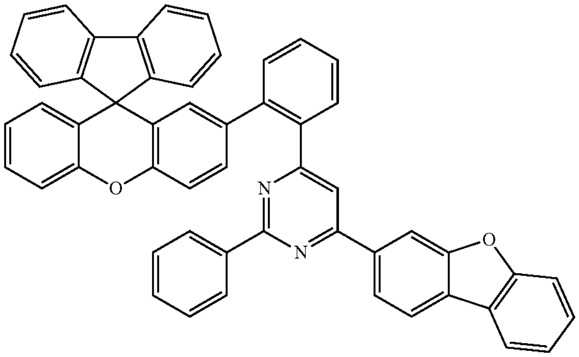
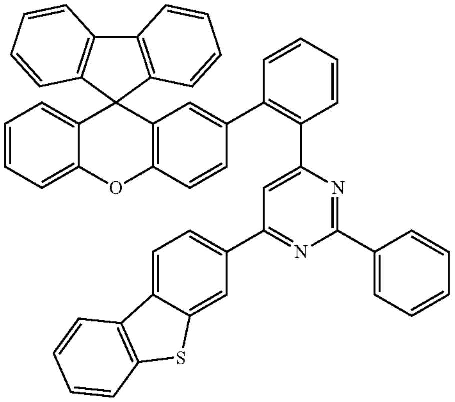
-continued
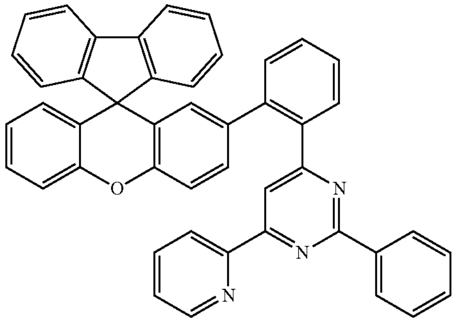
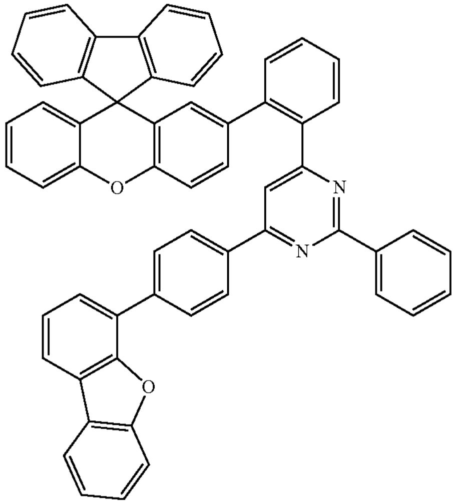
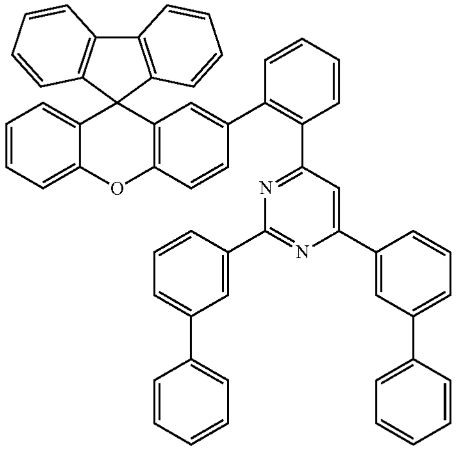
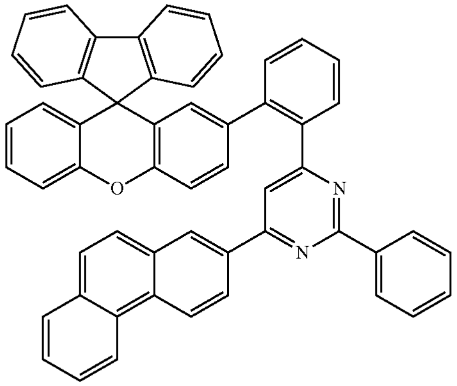

-continued
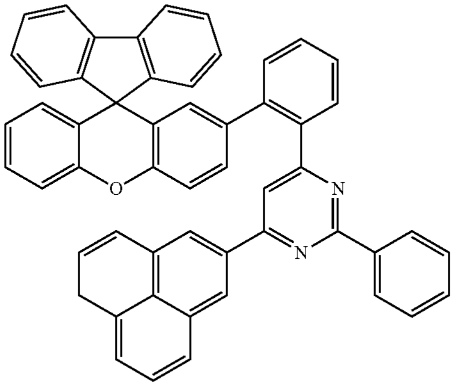
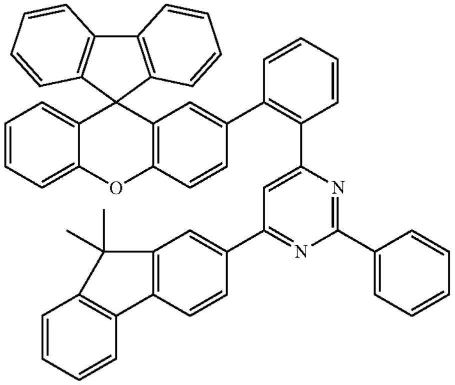
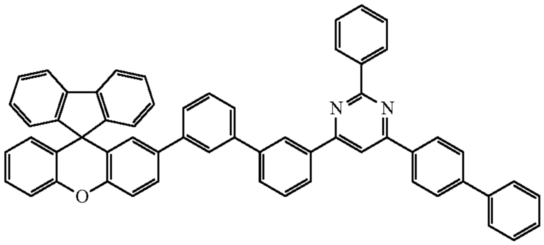
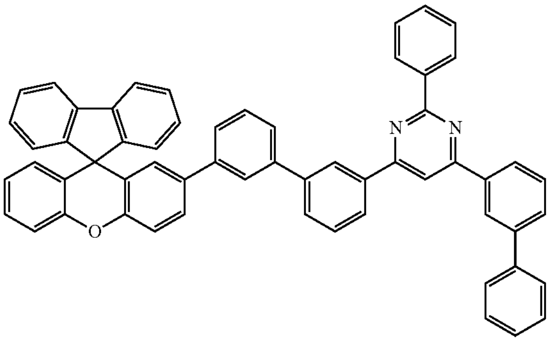
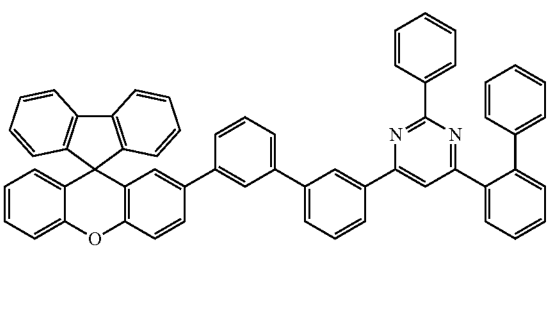
-continued
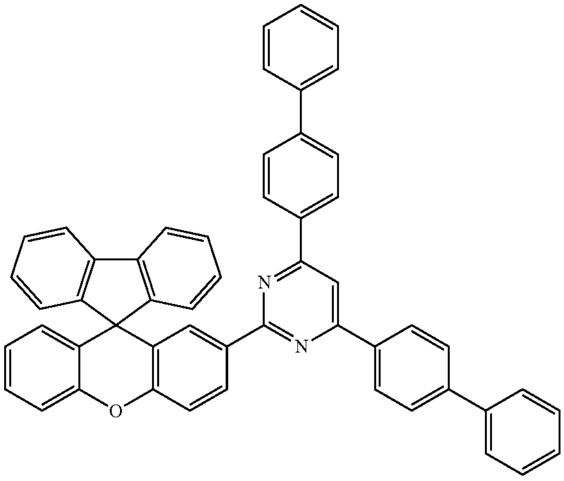
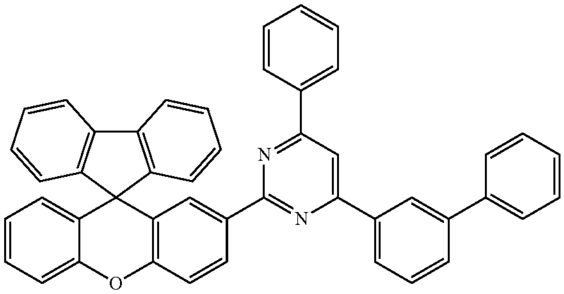
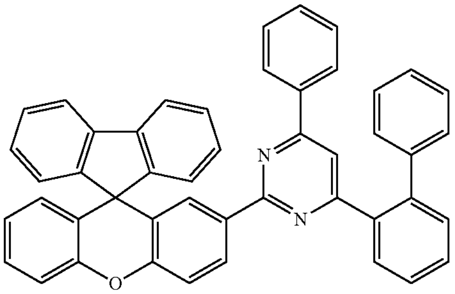
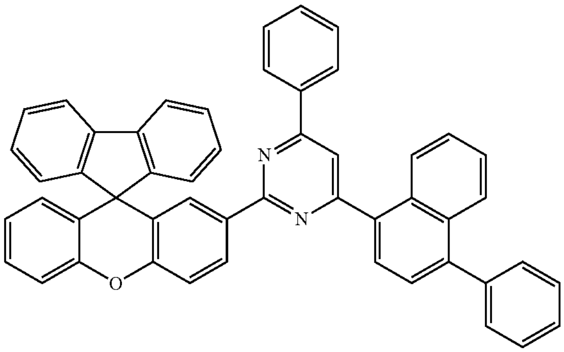

-continued
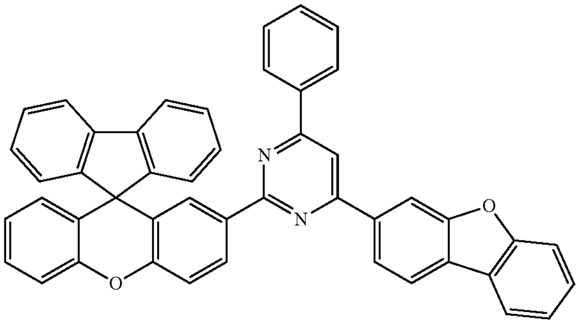
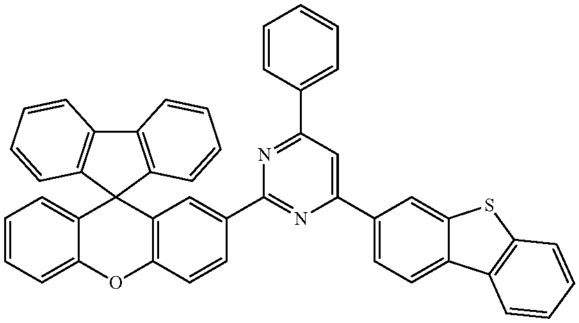
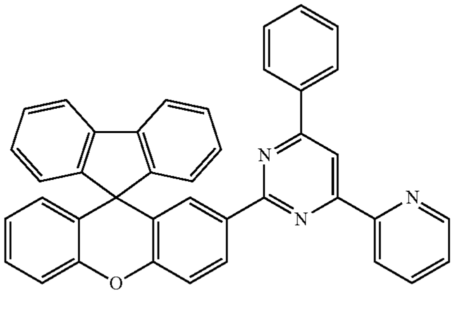
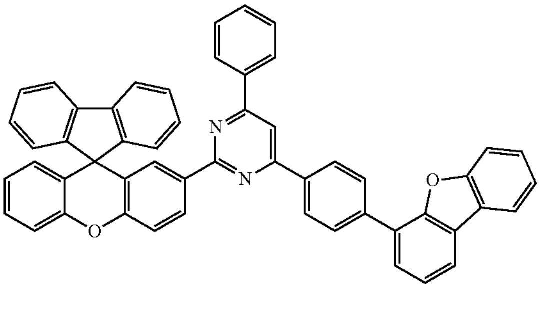
-continued
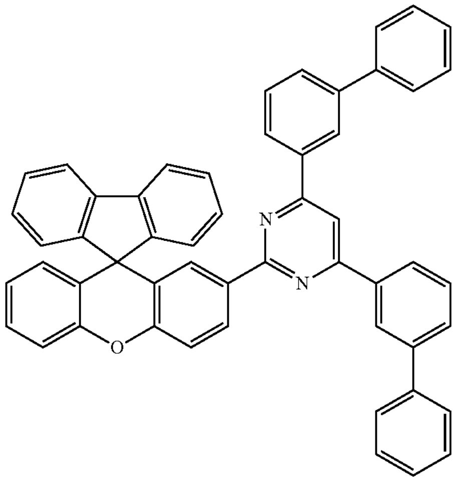
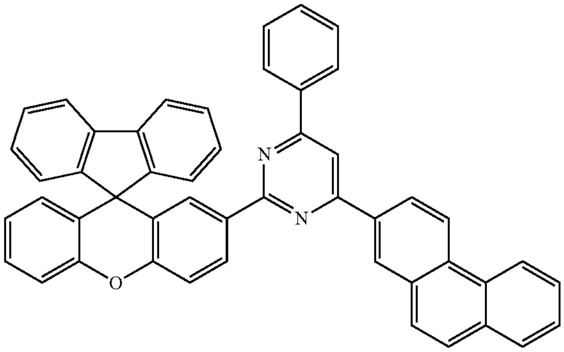
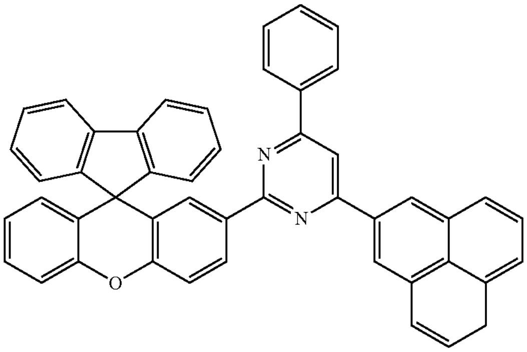
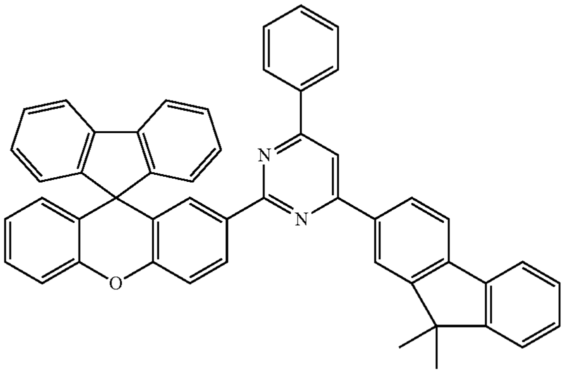

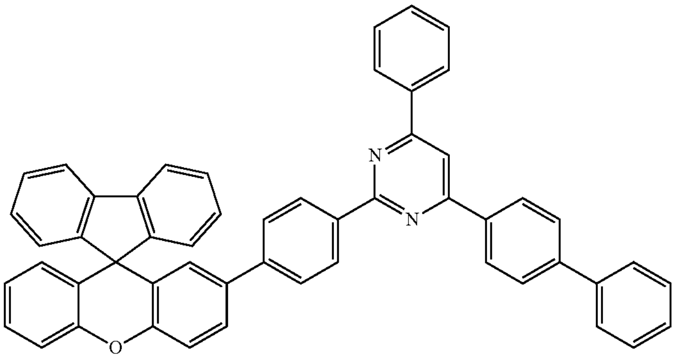
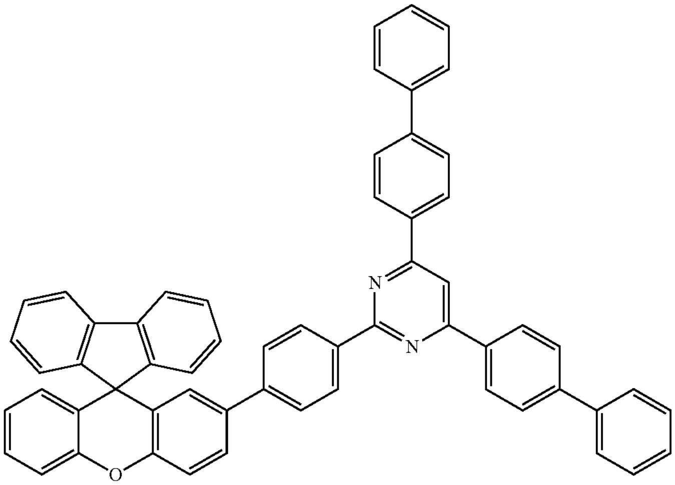
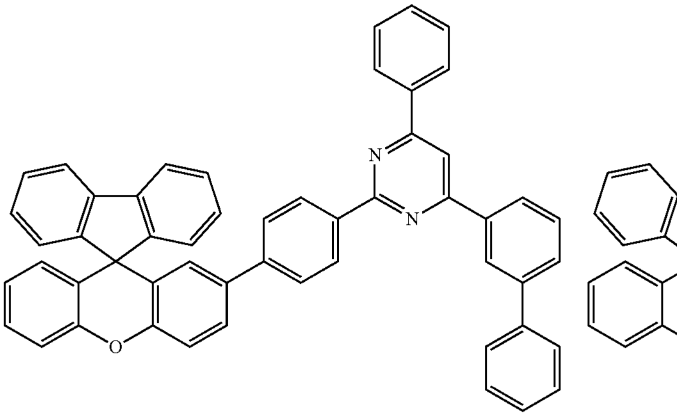
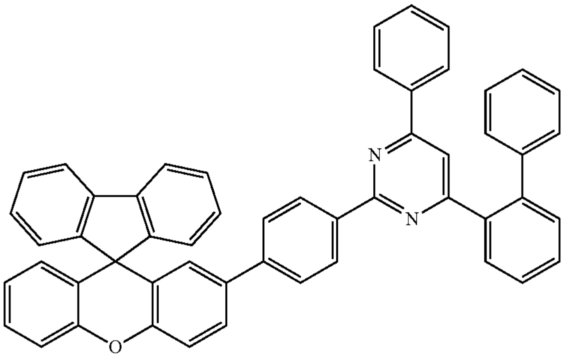
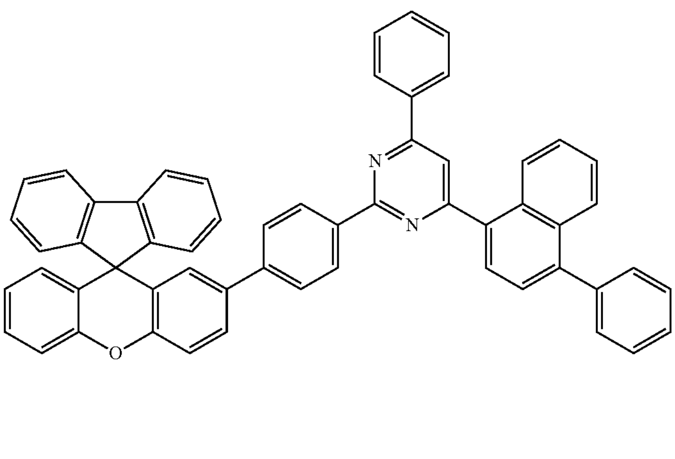

-continued
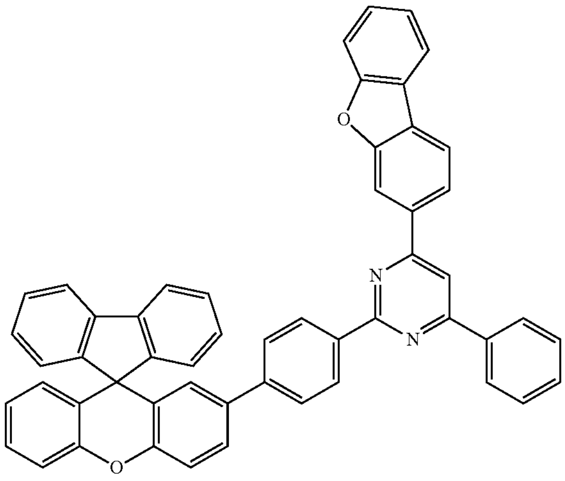
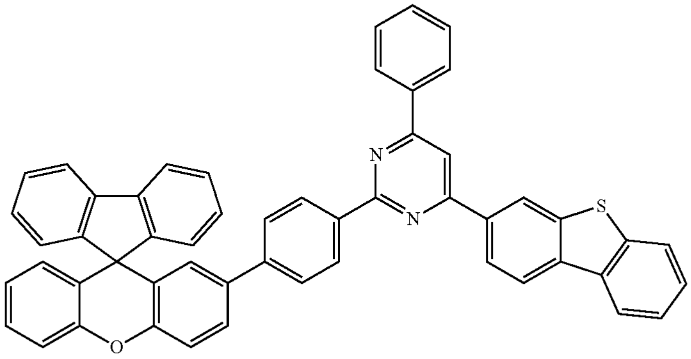
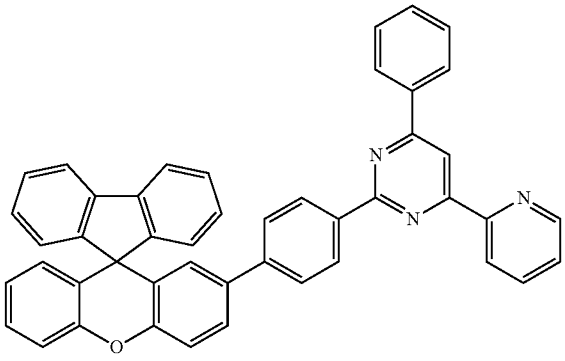
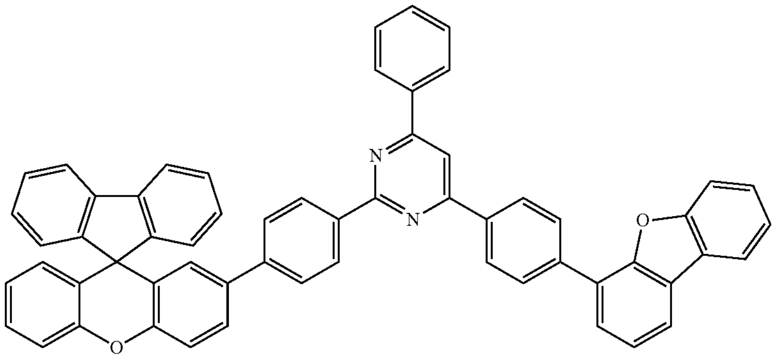

-continued
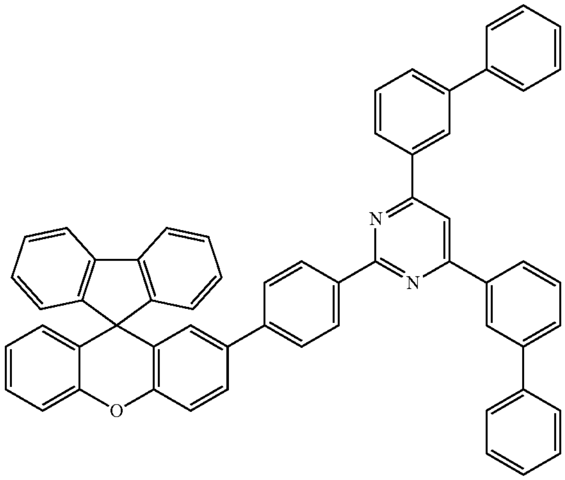
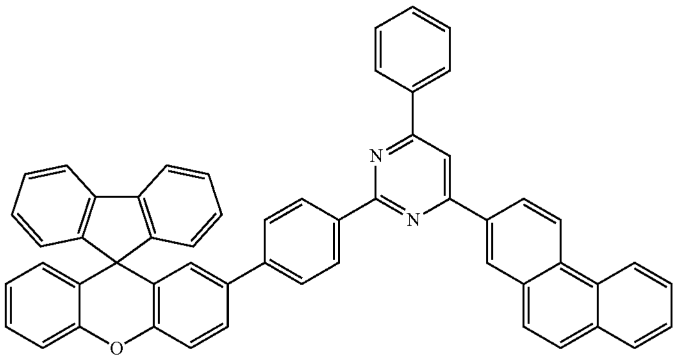
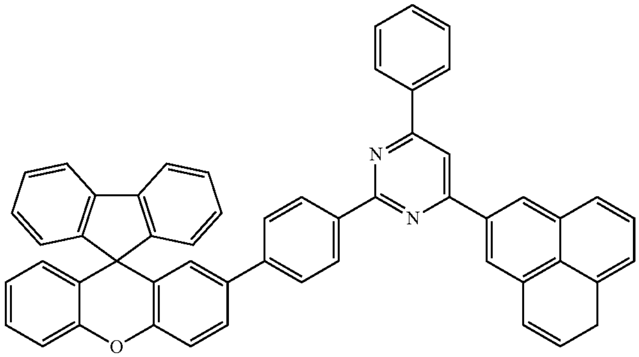
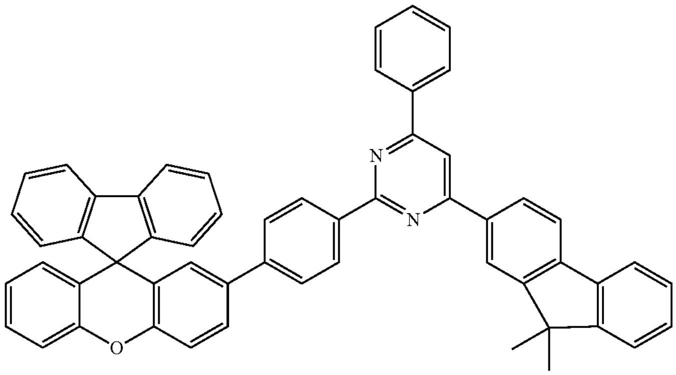

-continued
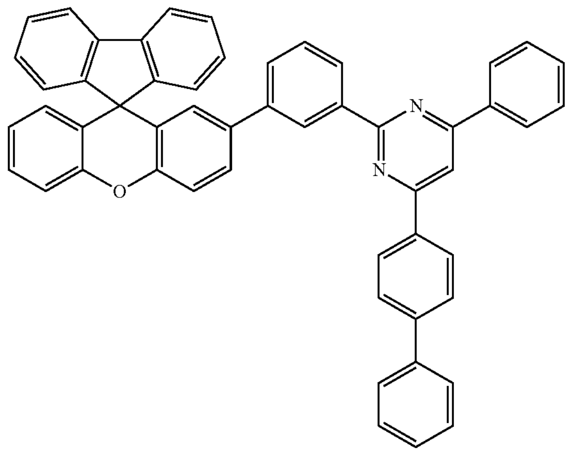
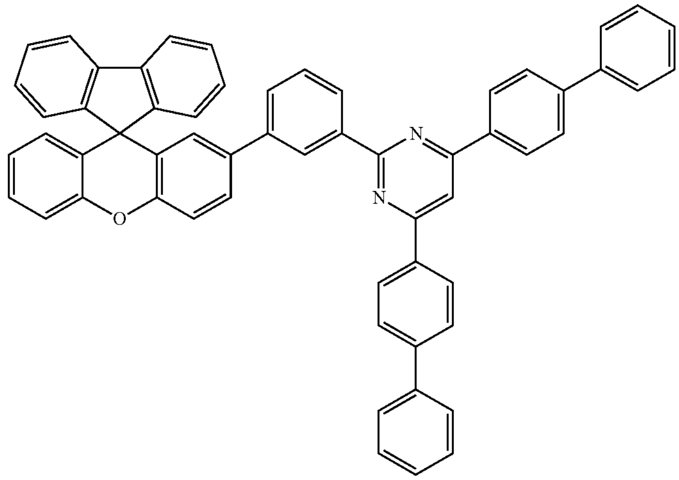
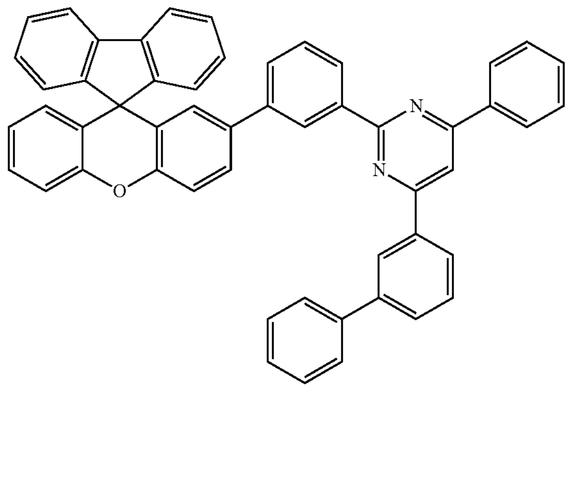
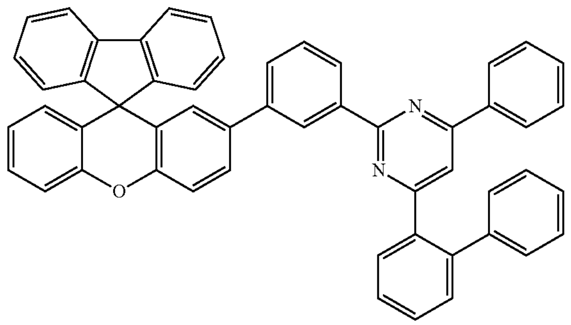

-continued
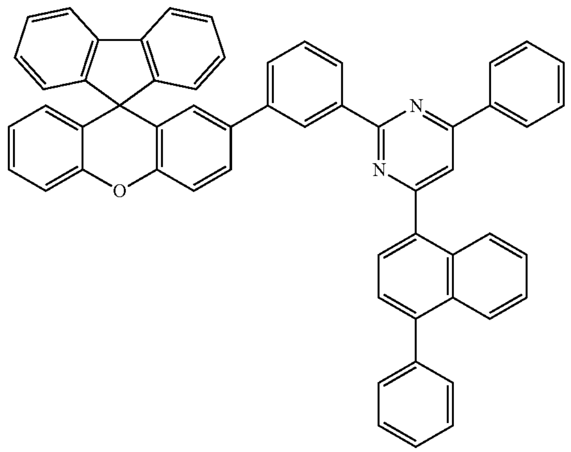
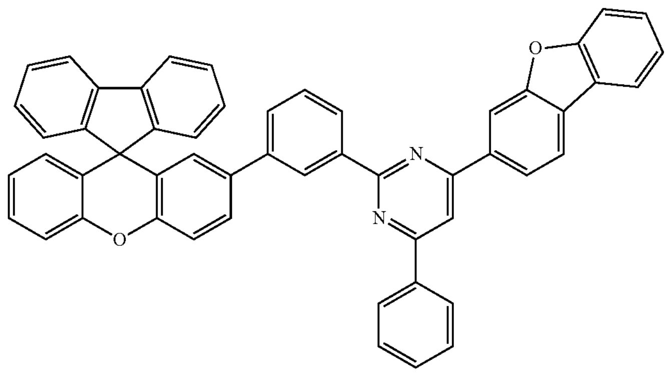
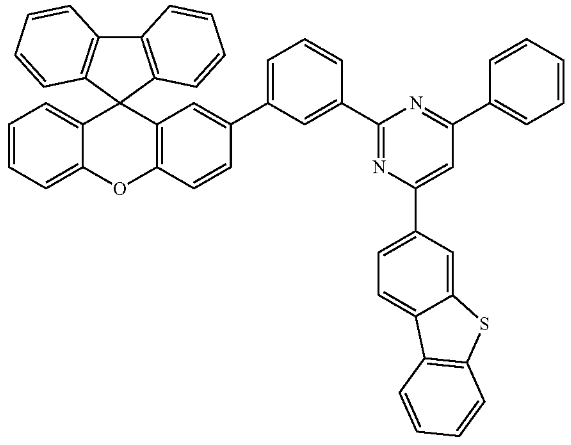
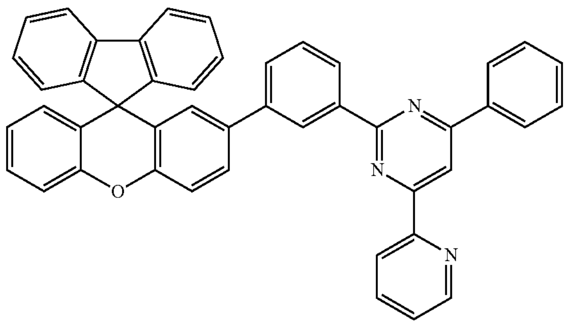

-continued
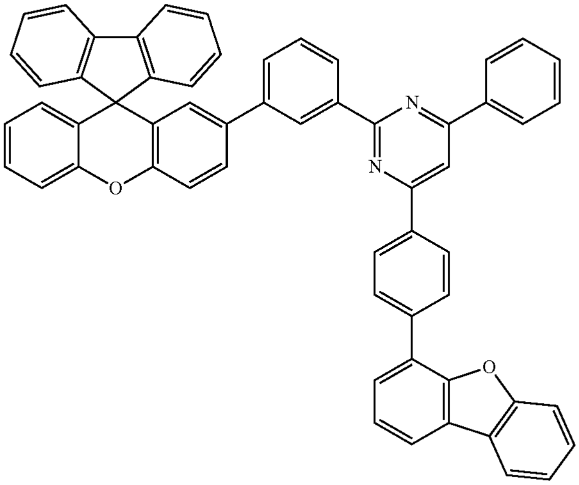
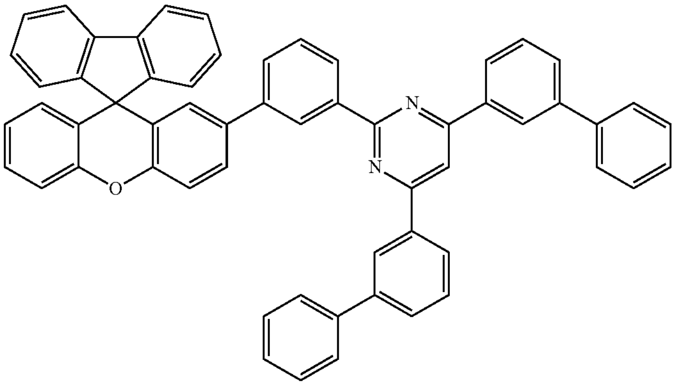
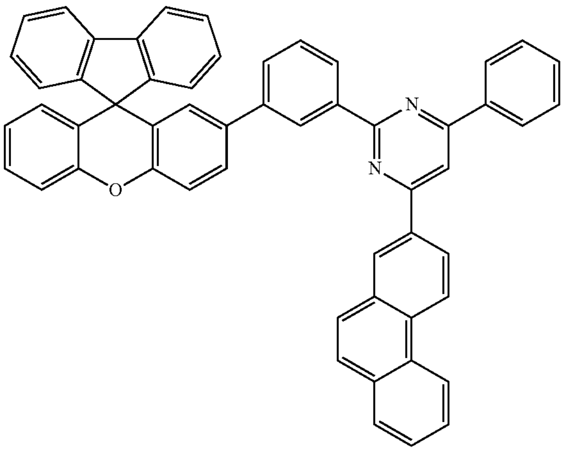
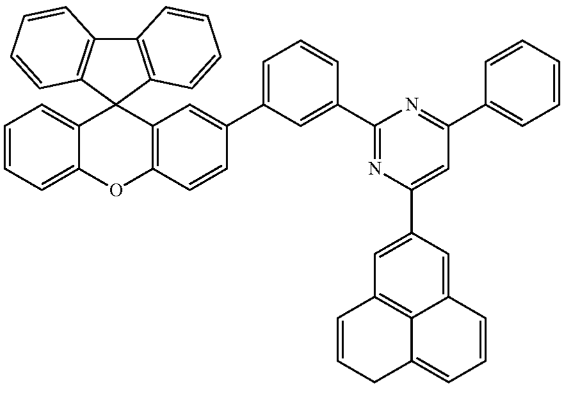

-continued
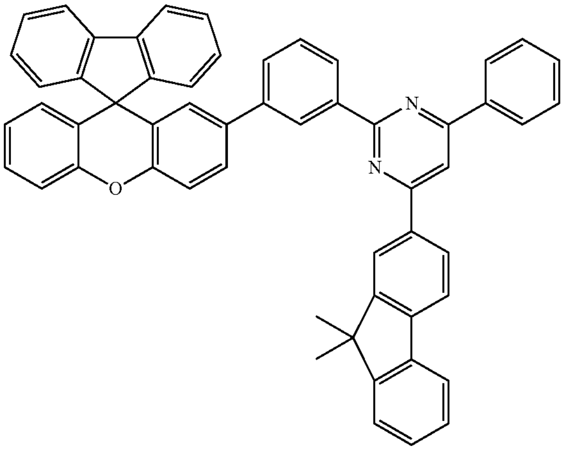
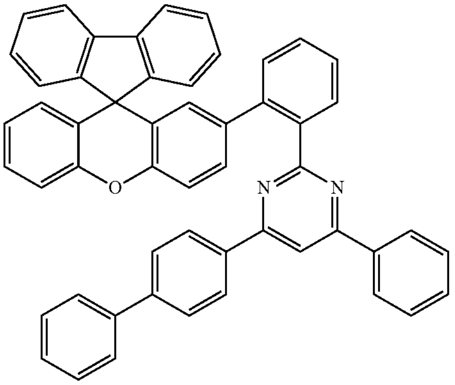
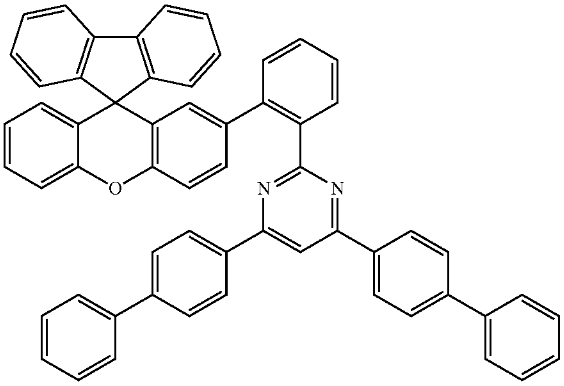
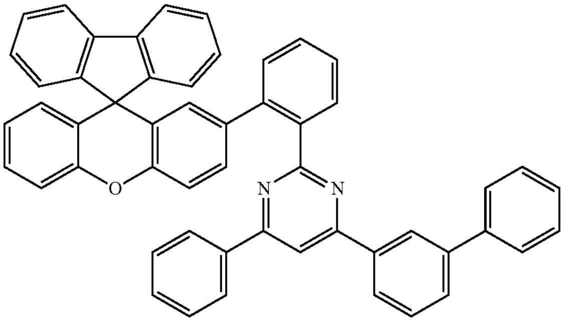
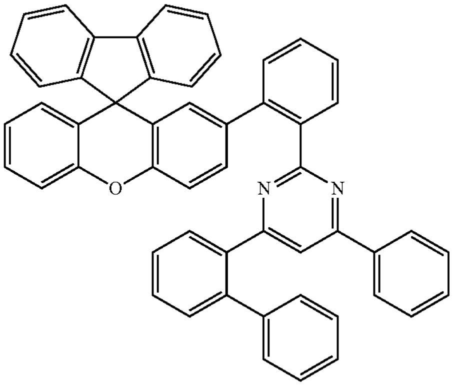
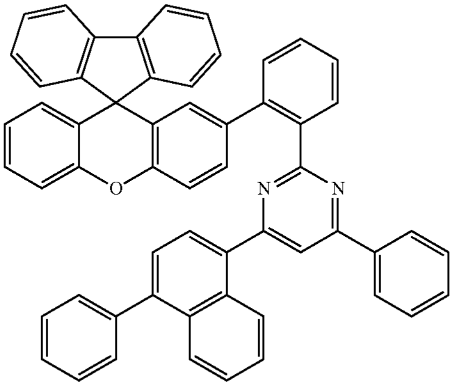
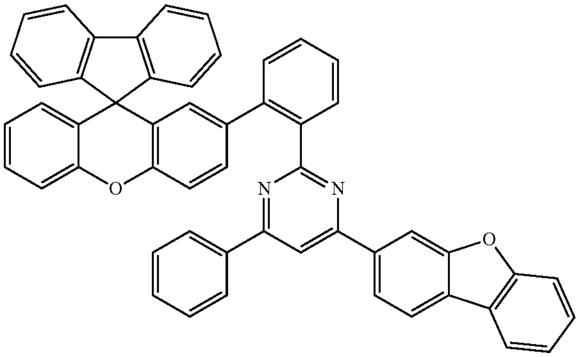
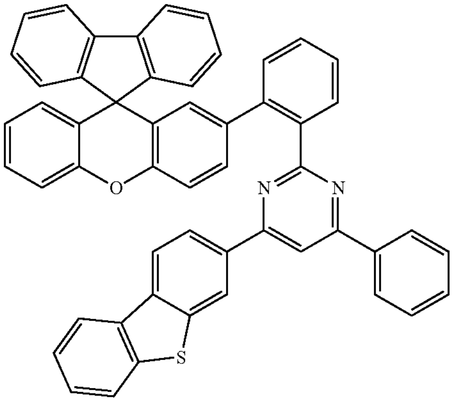

-continued
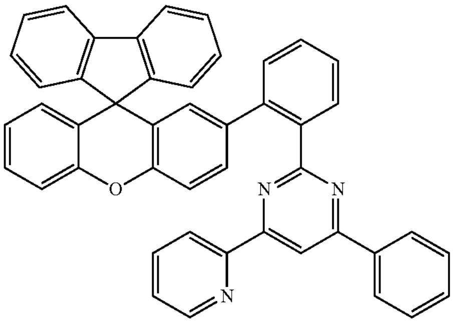
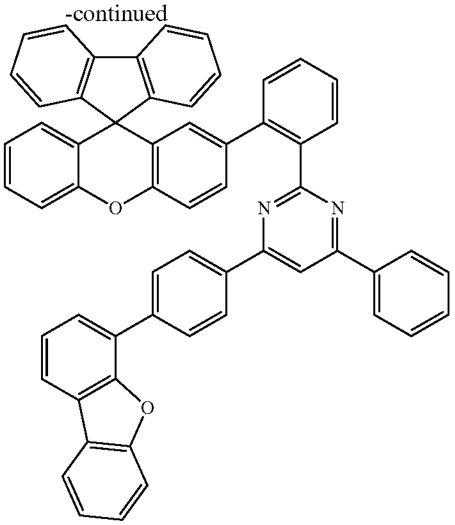
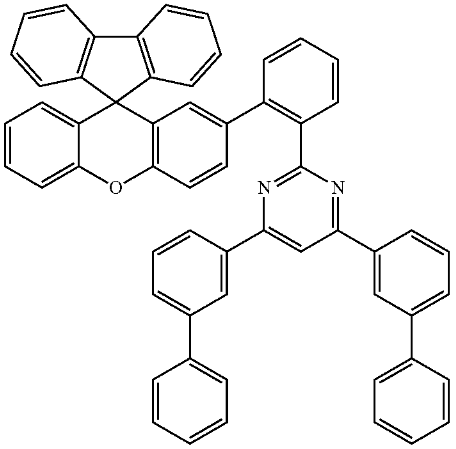
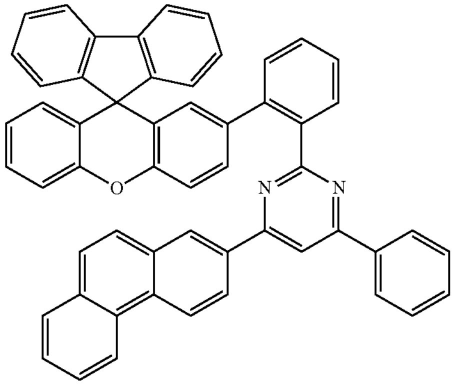
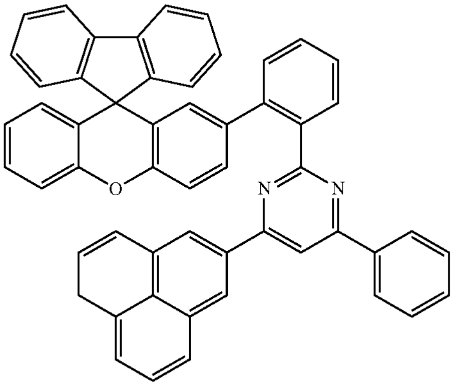
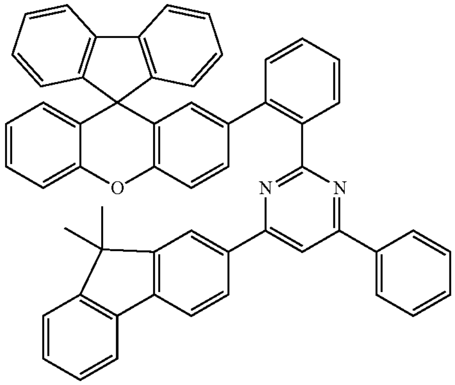
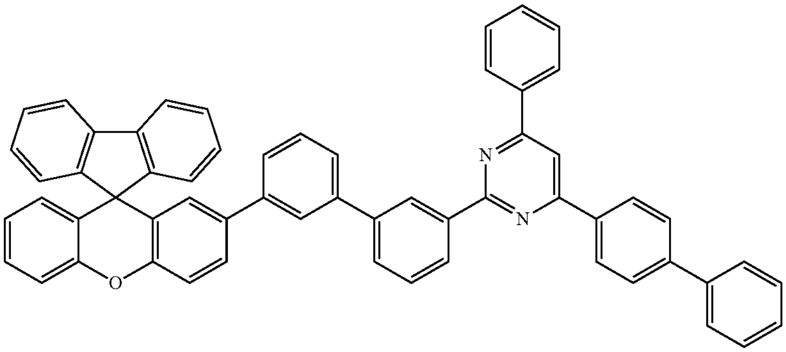

-continued
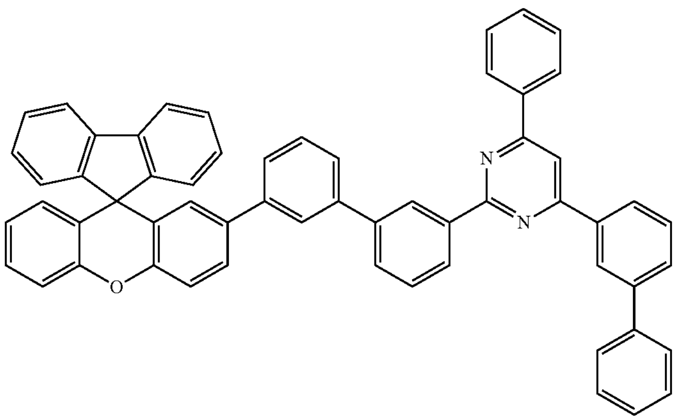
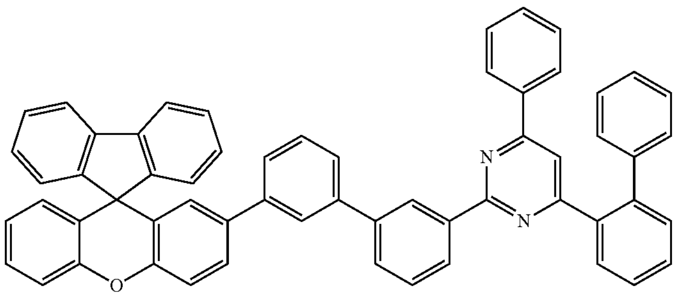
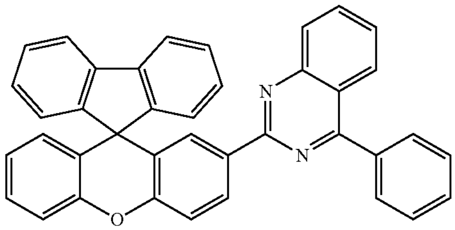
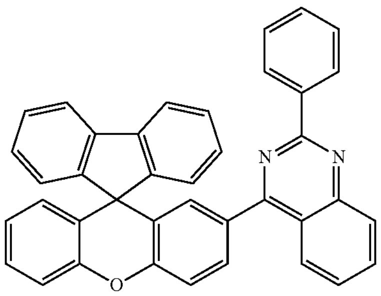
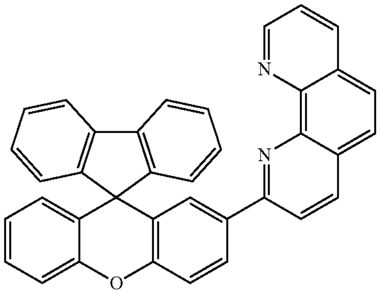
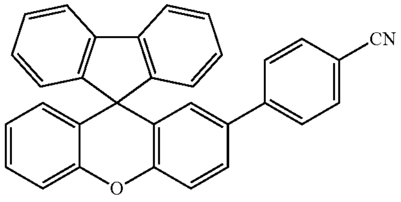
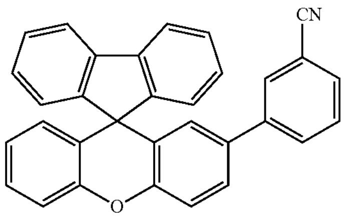
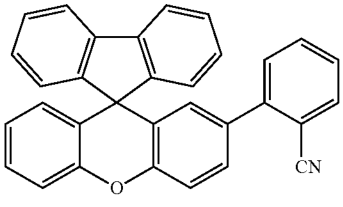
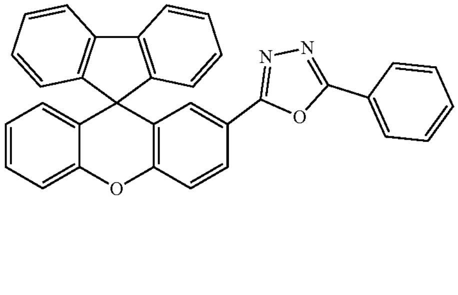
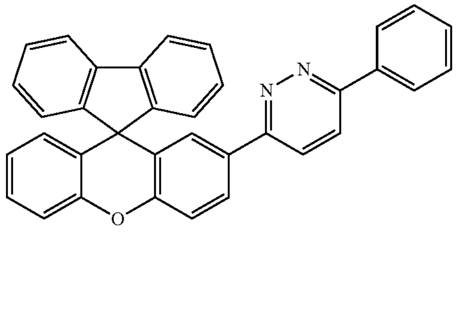

-continued
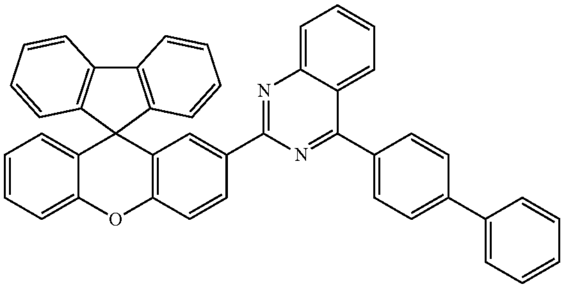
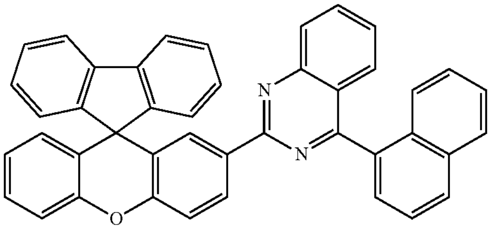
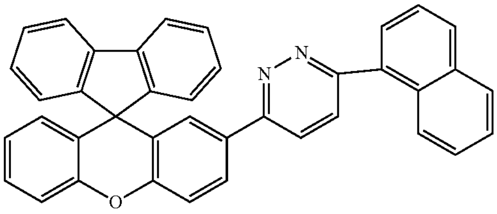
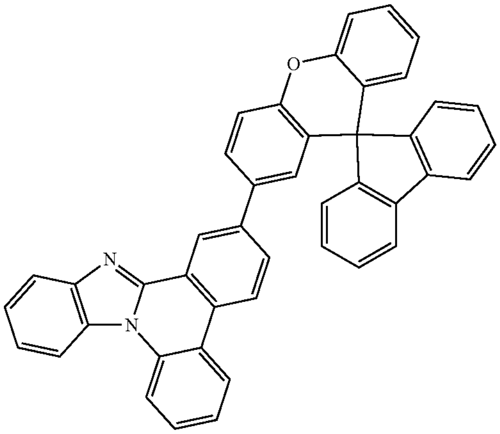
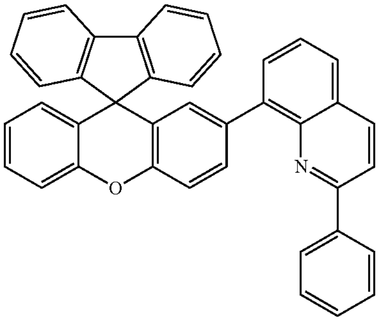
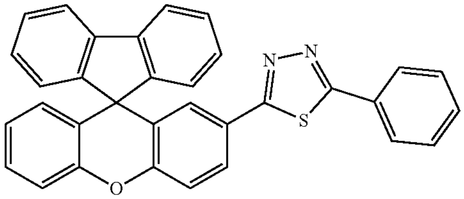
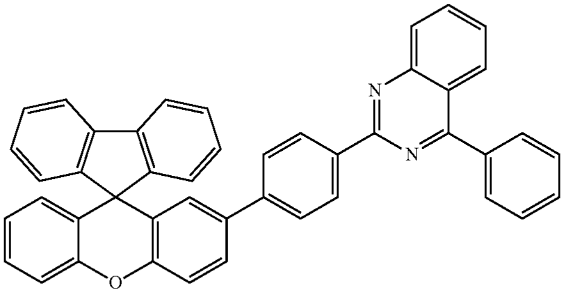
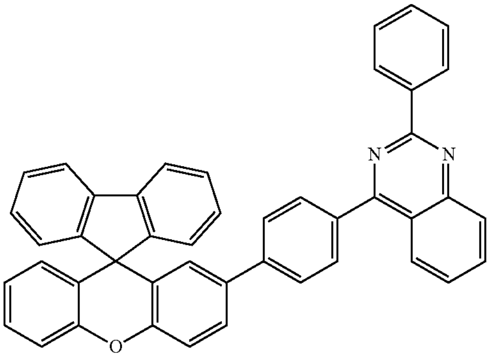

-continued
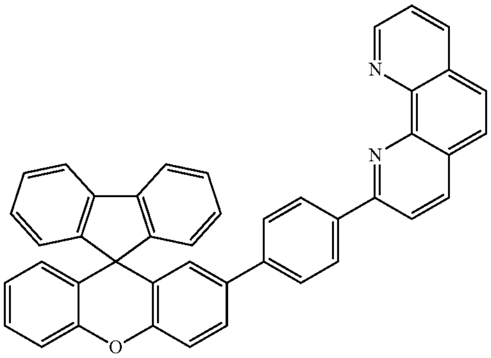
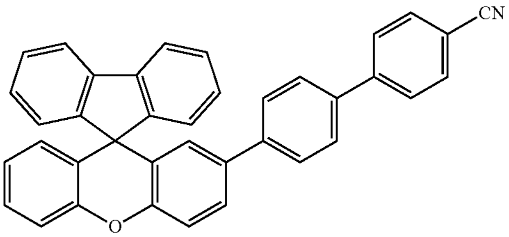
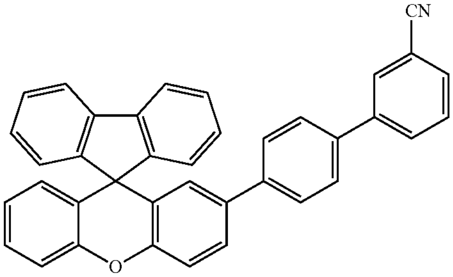
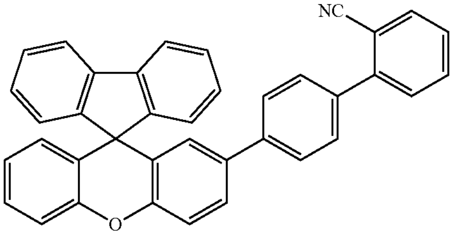
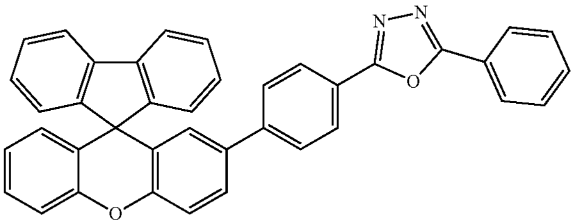
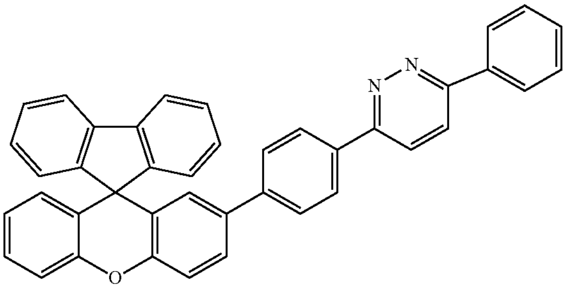
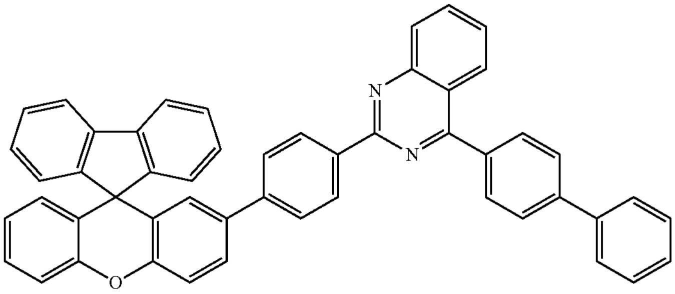
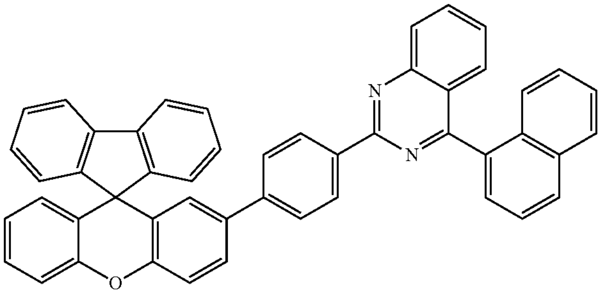

-continued
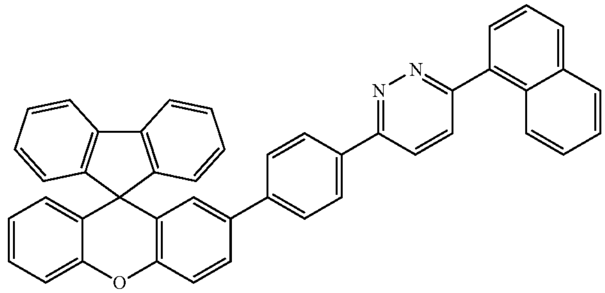
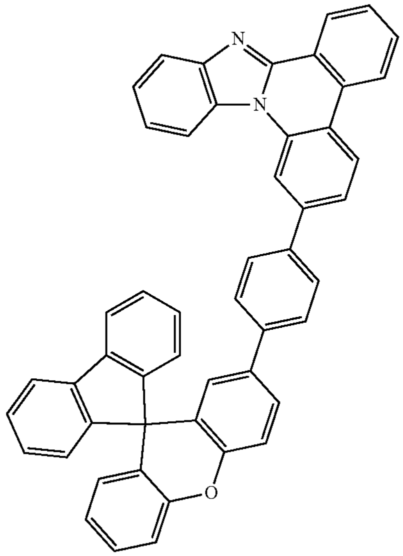
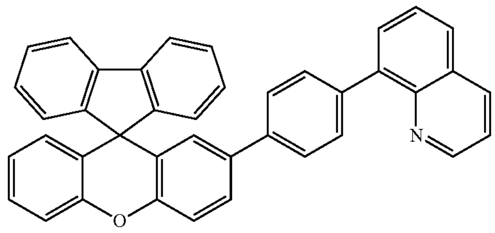
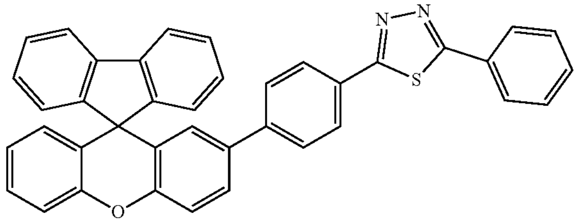
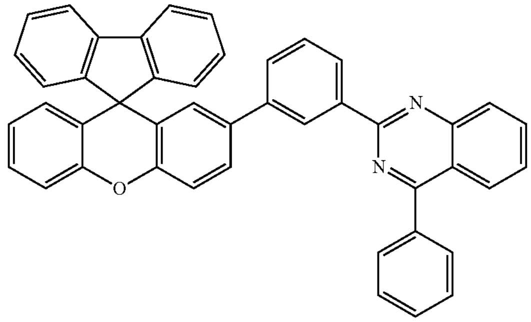
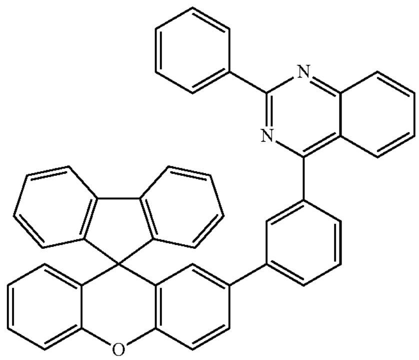
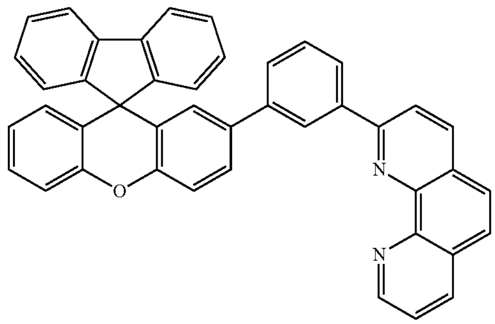
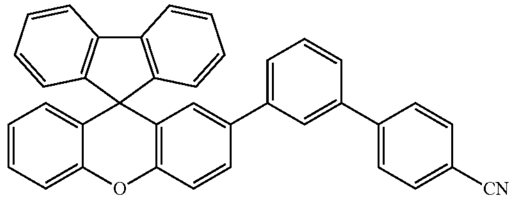

-continued
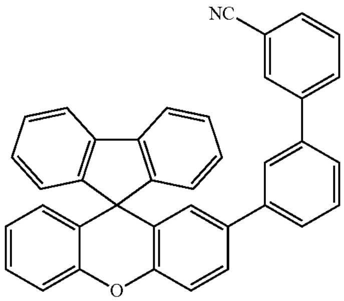
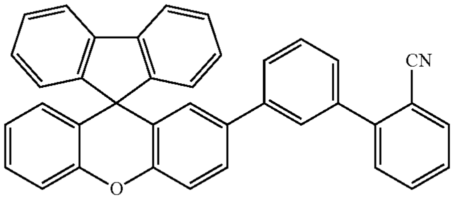
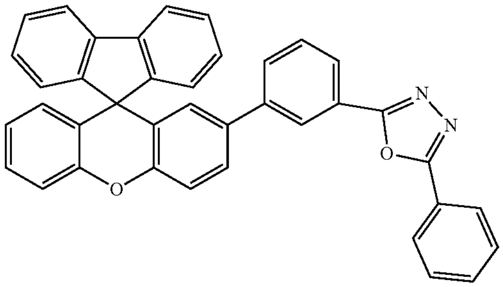
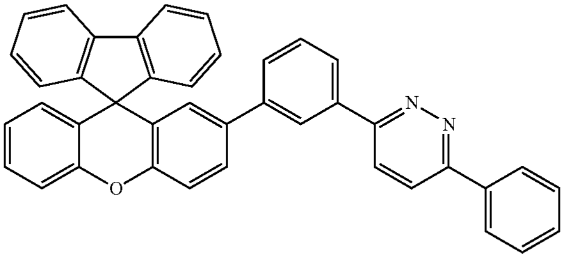
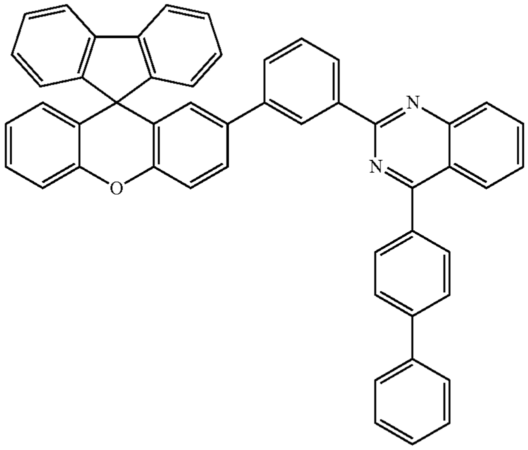
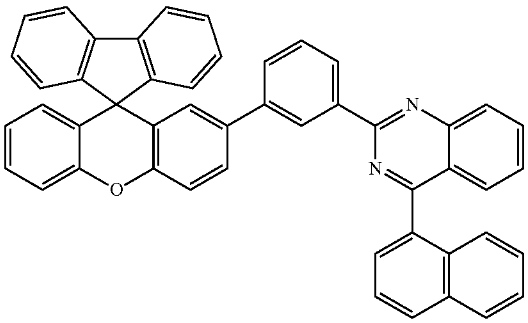
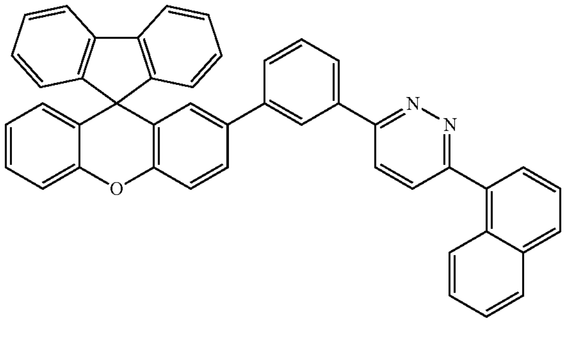
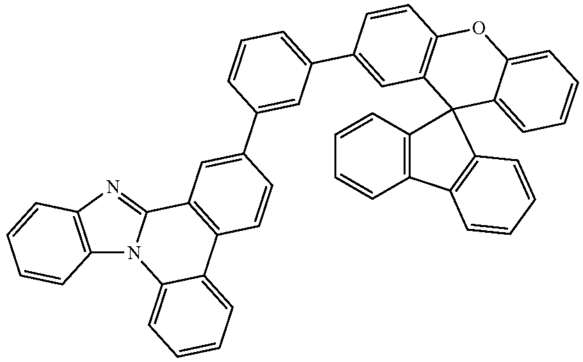
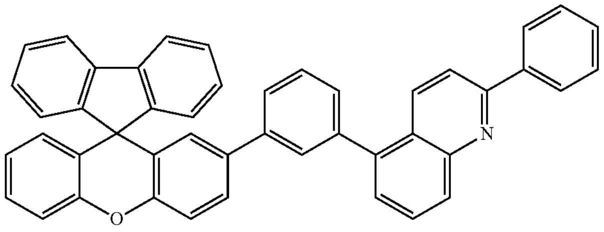
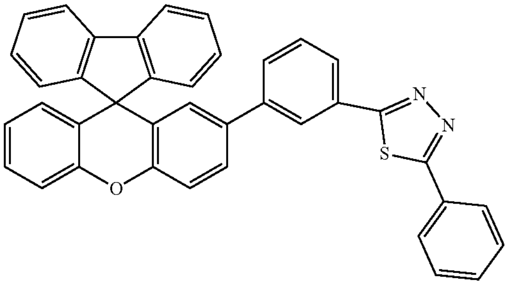

-continued
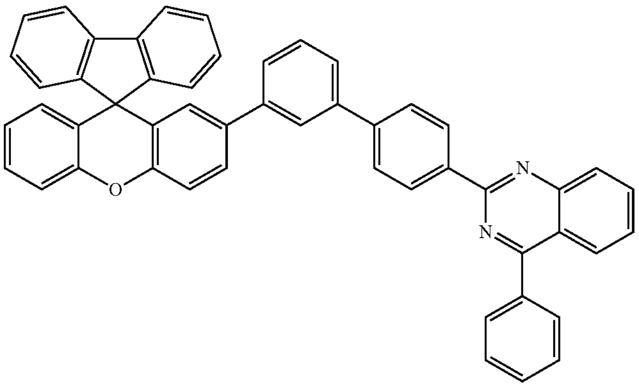
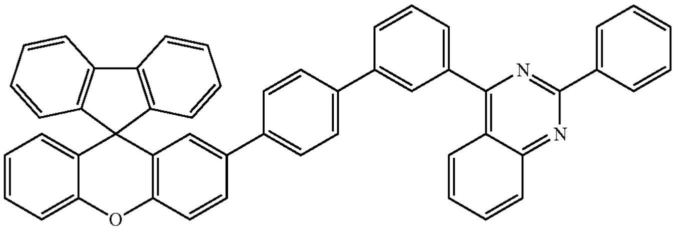
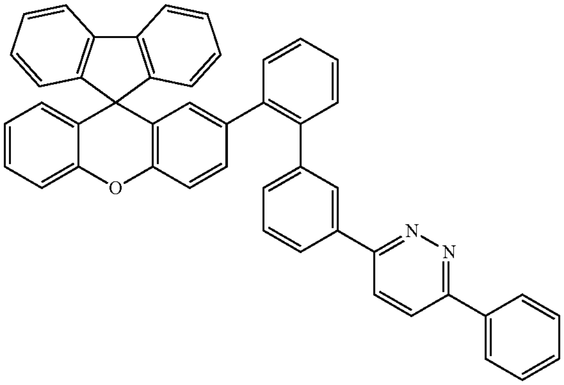
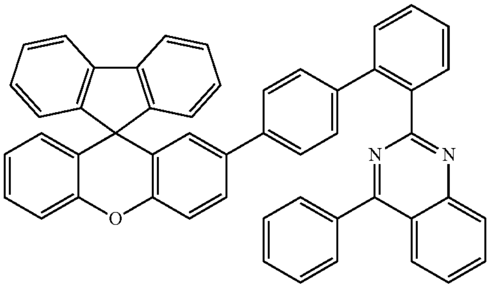
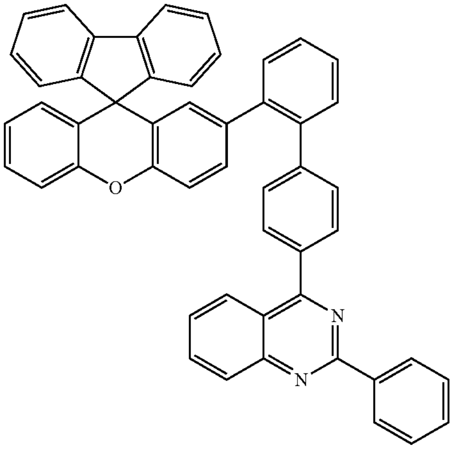
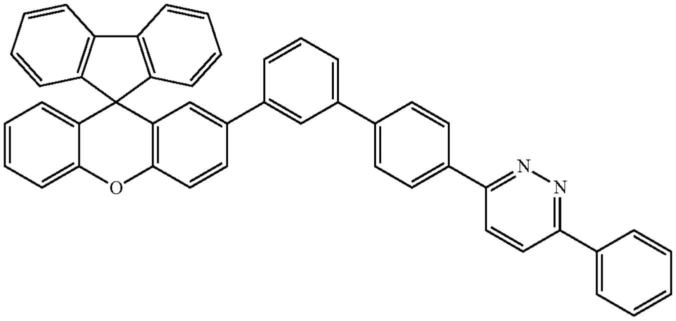

-continued
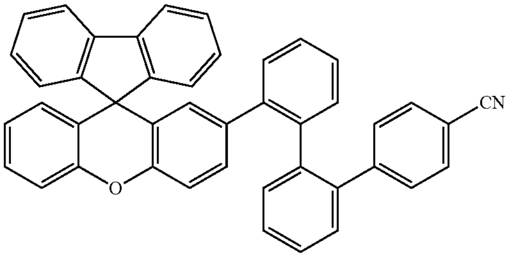
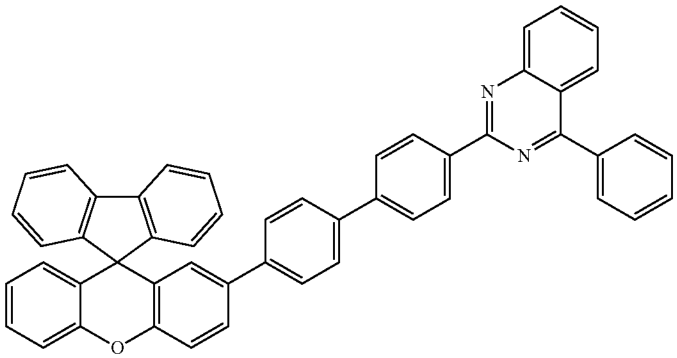
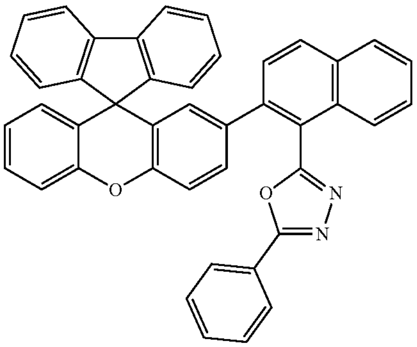
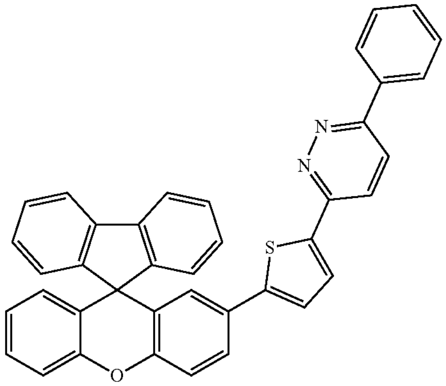
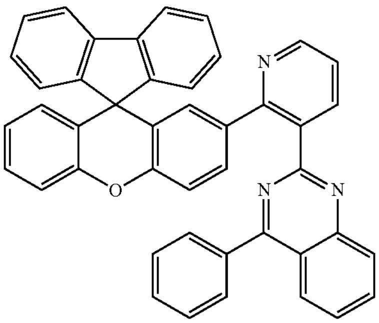
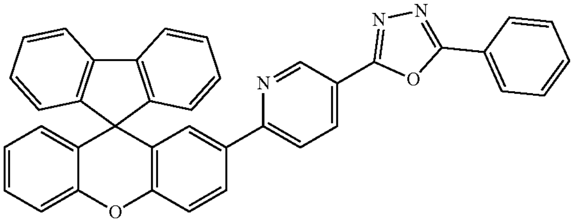
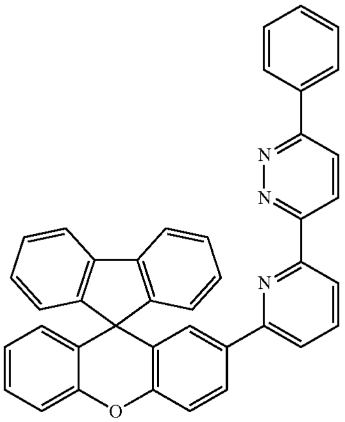
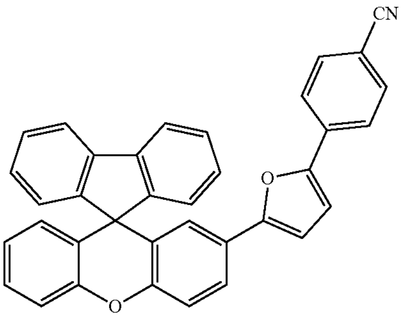

-continued
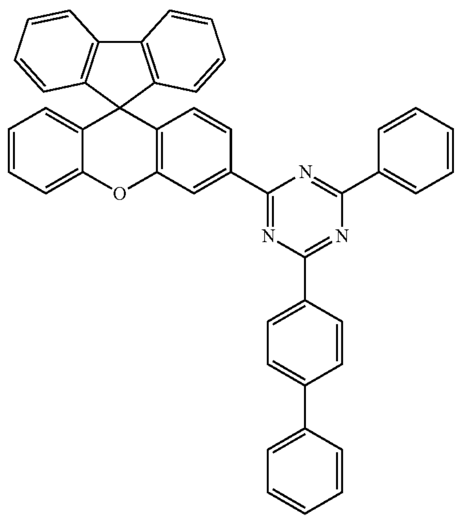
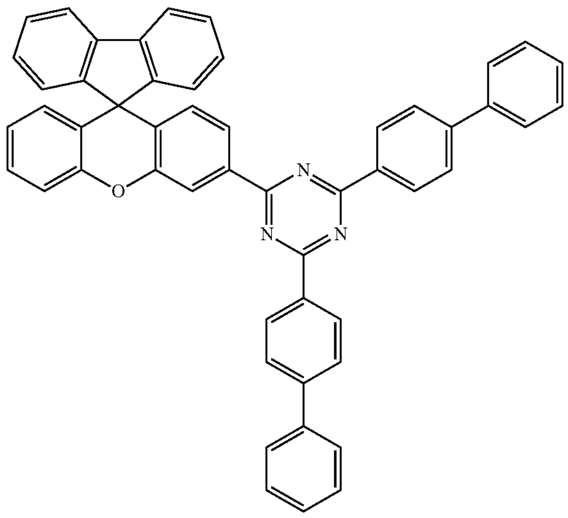
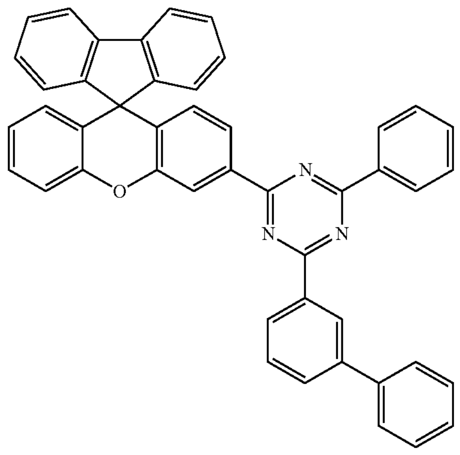
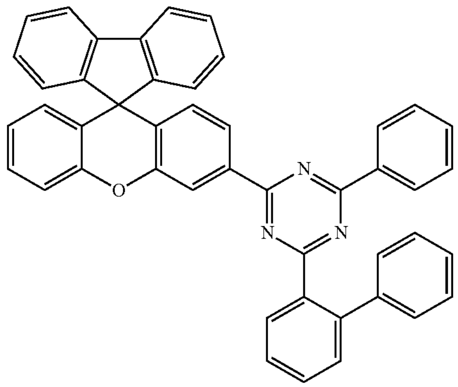
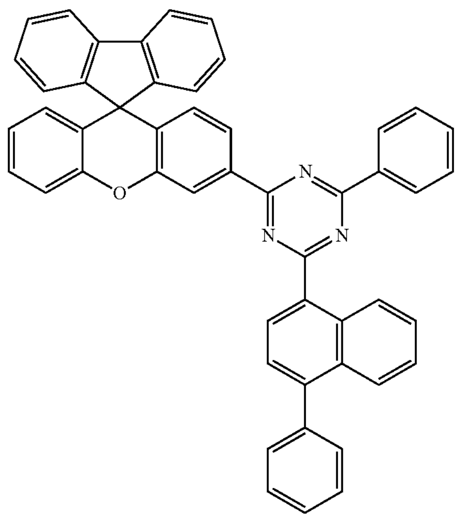
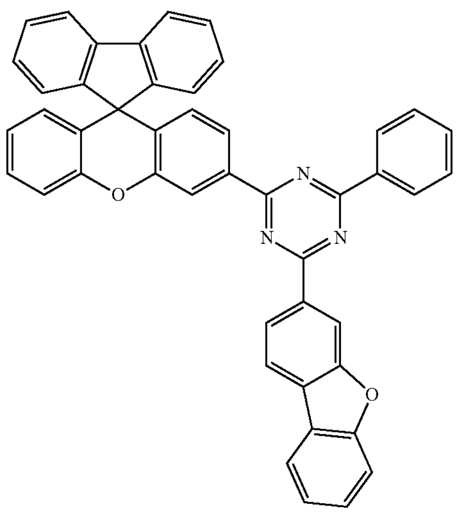

-continued
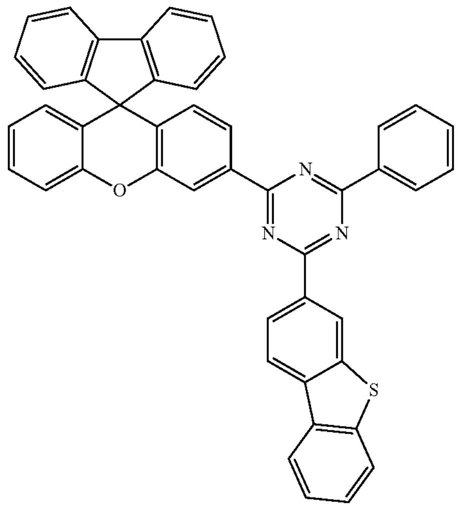
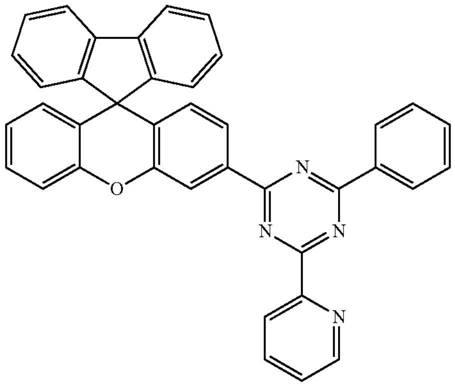
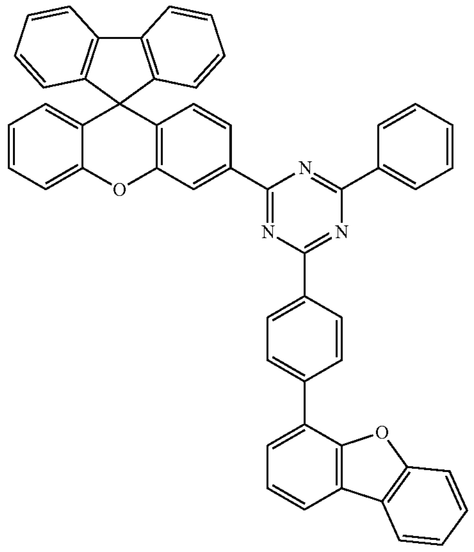
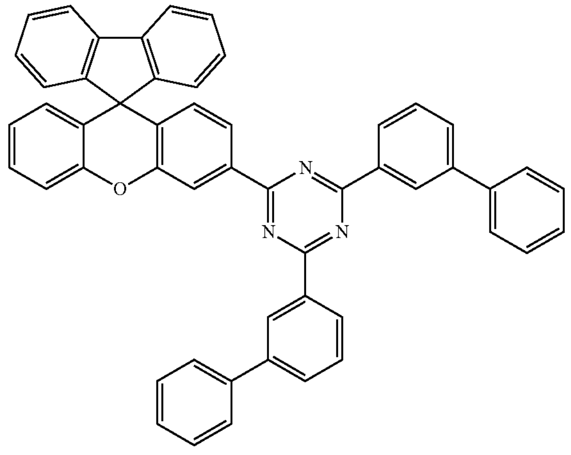
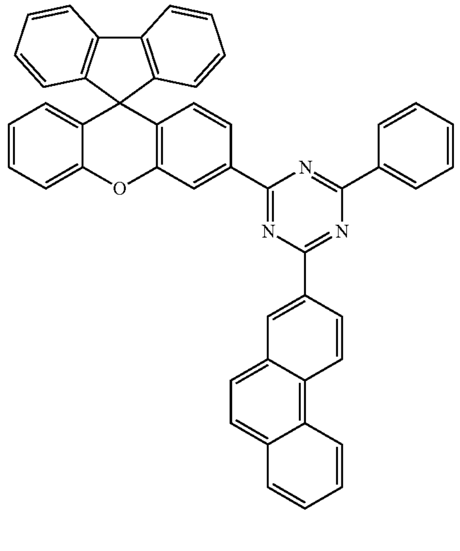
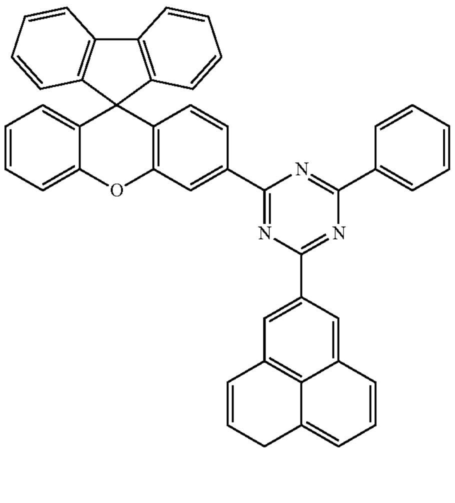

-continued
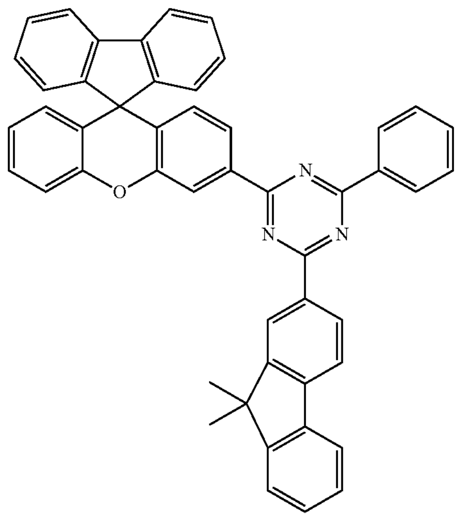
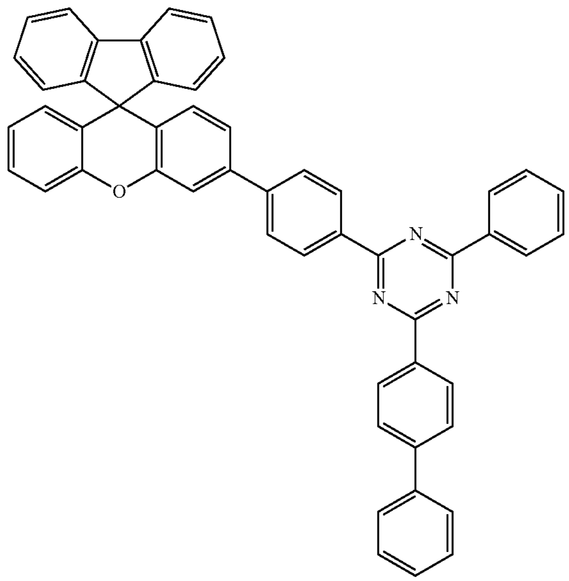
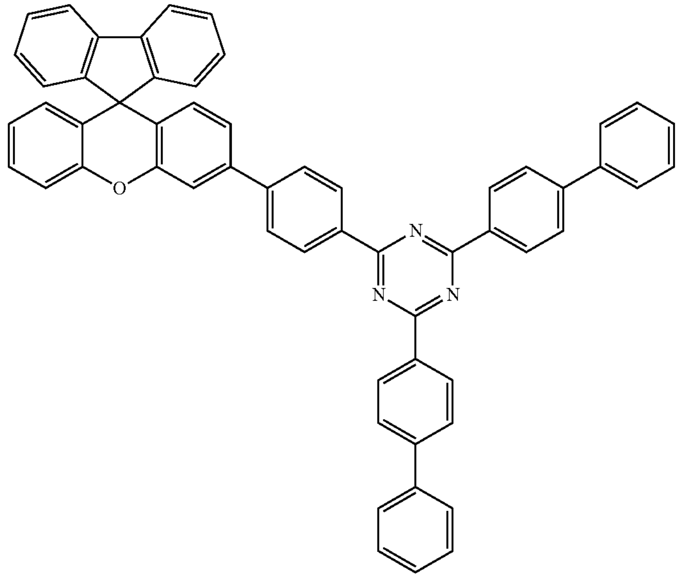
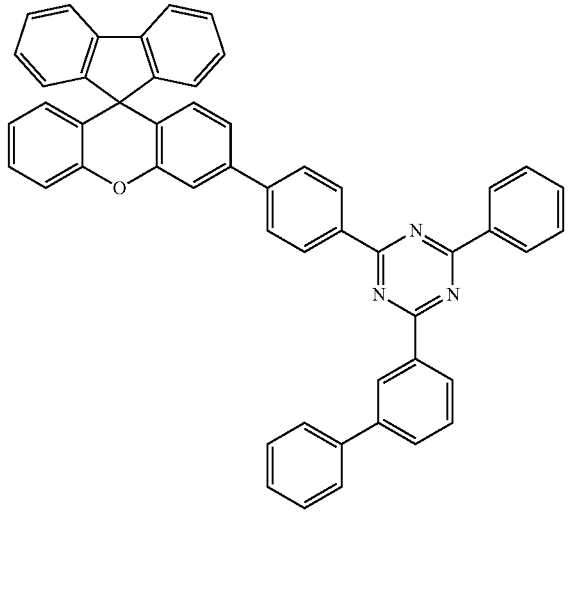

-continued
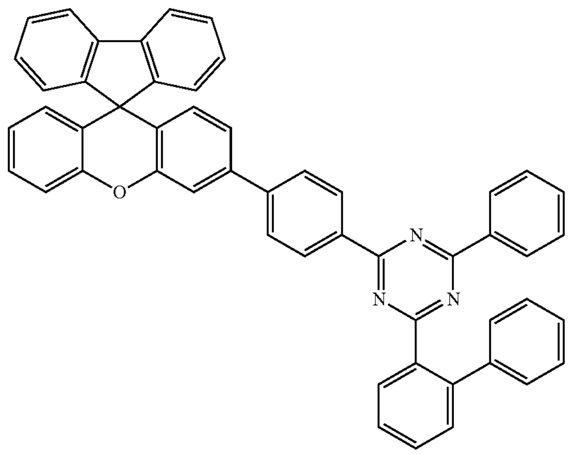
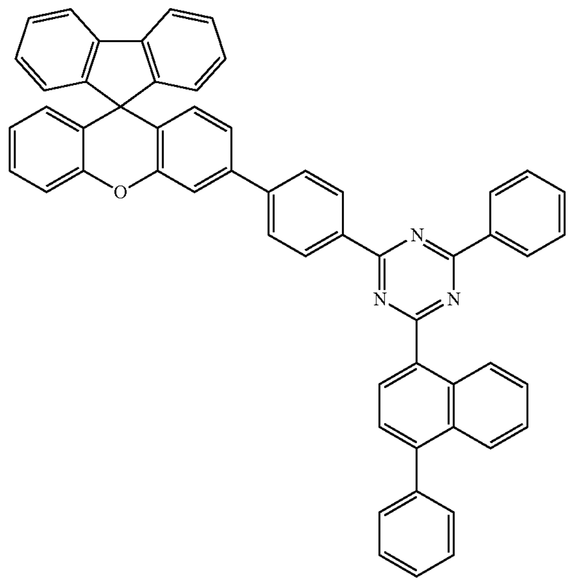
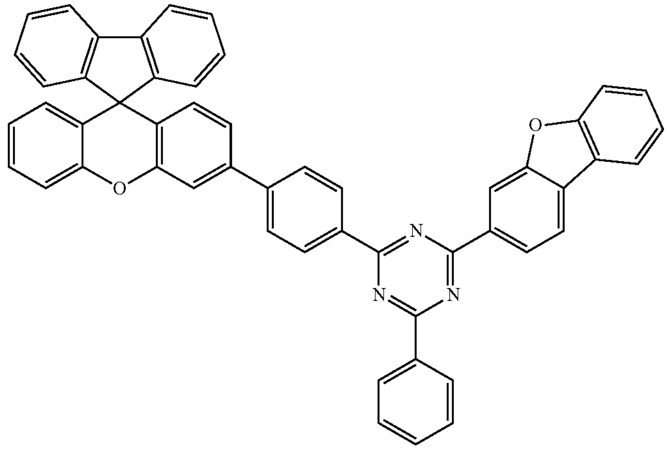
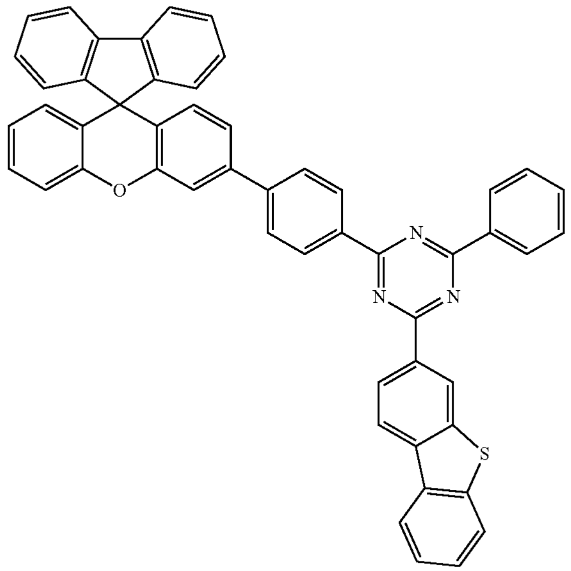
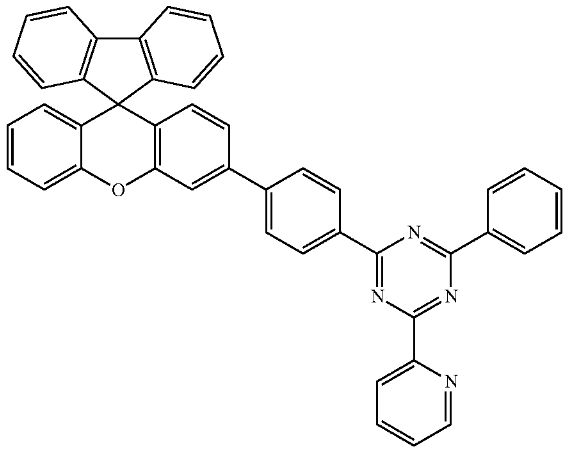

-continued
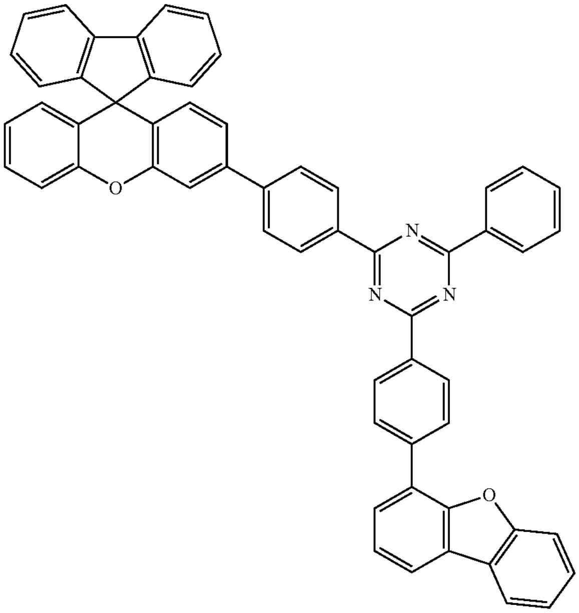
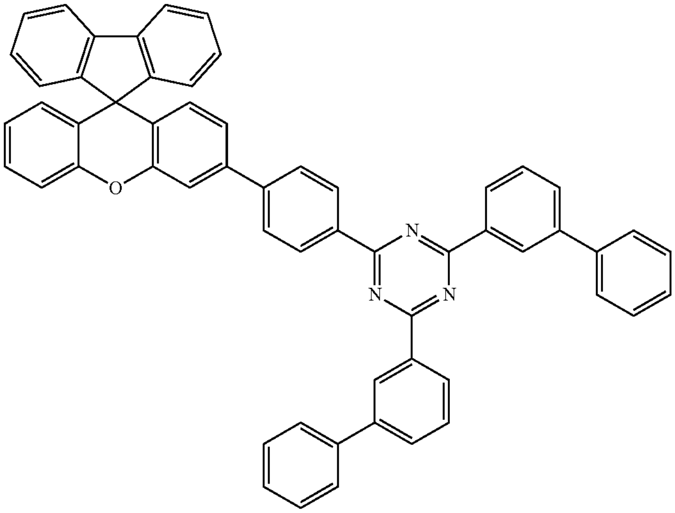
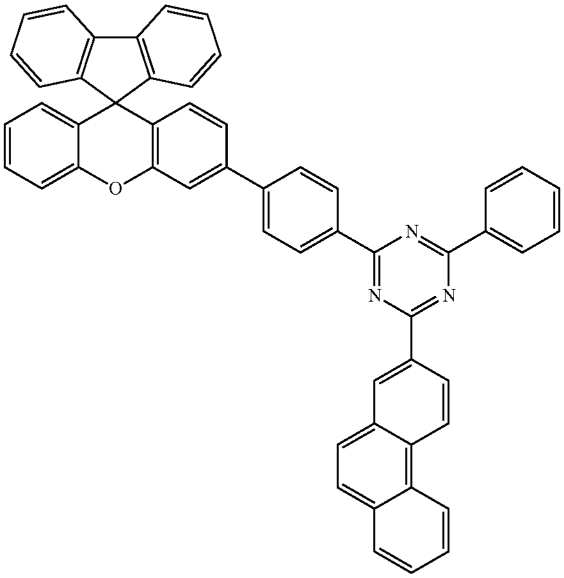
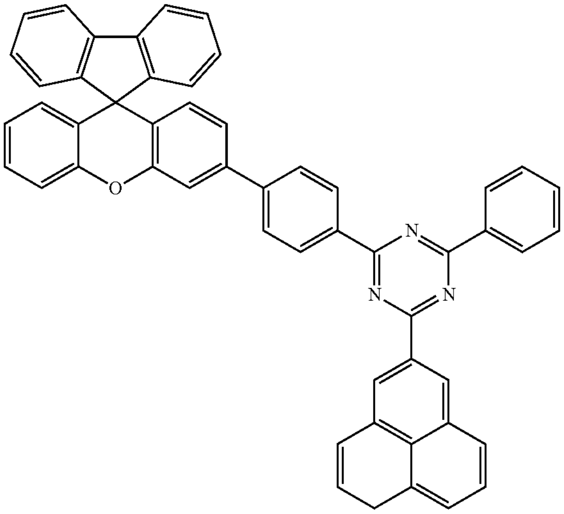

-continued
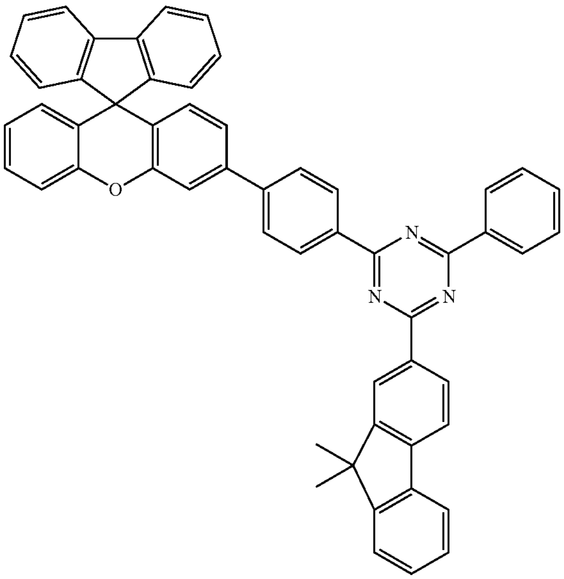
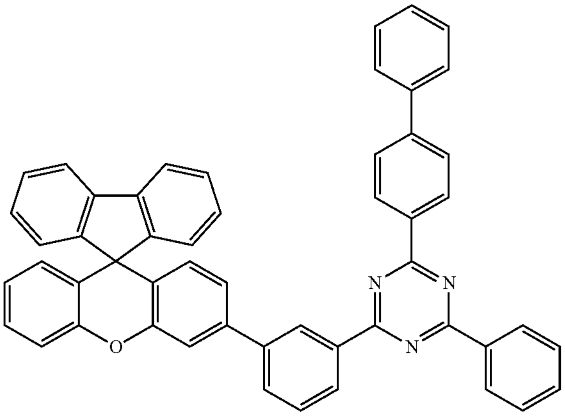
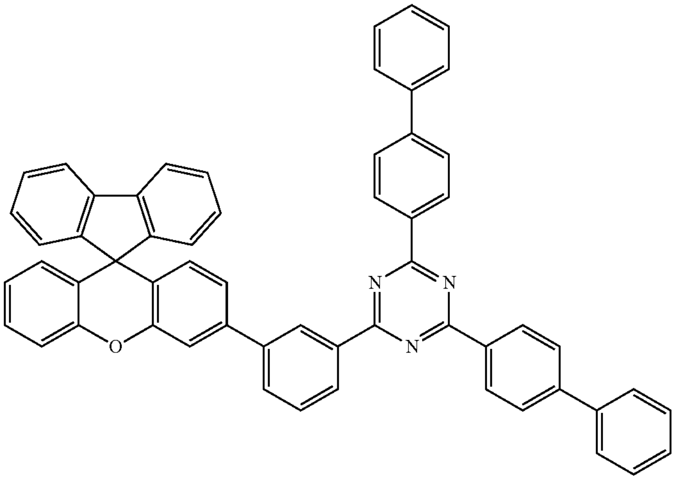
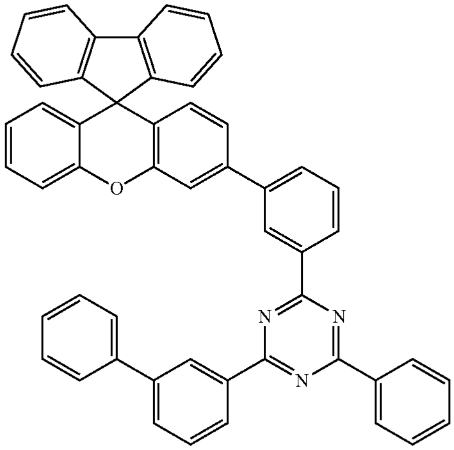
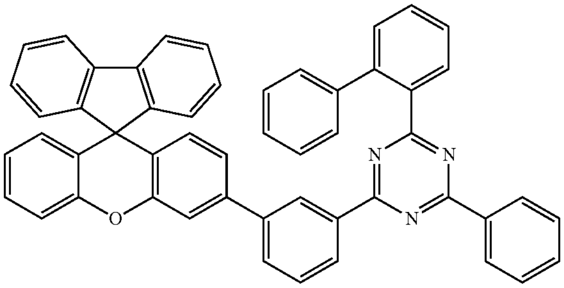
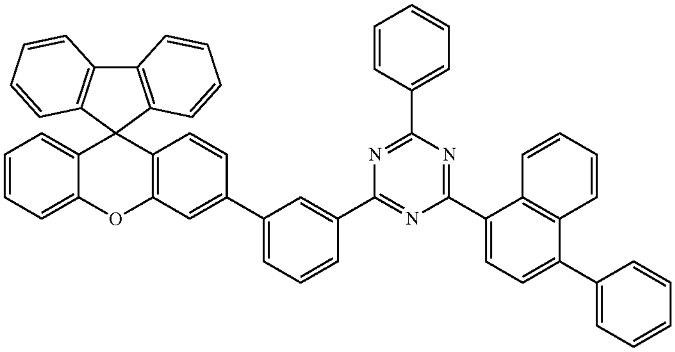

-continued
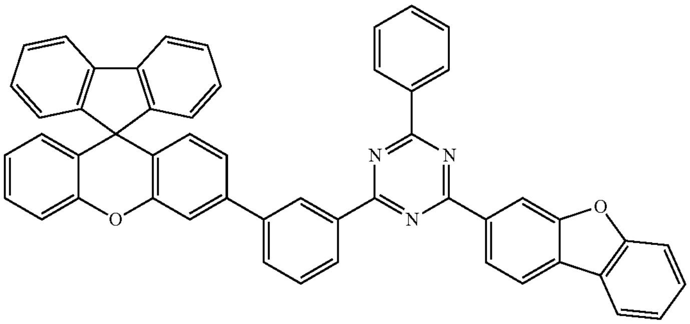
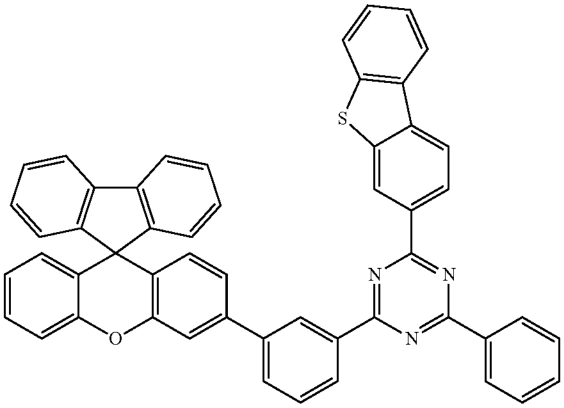
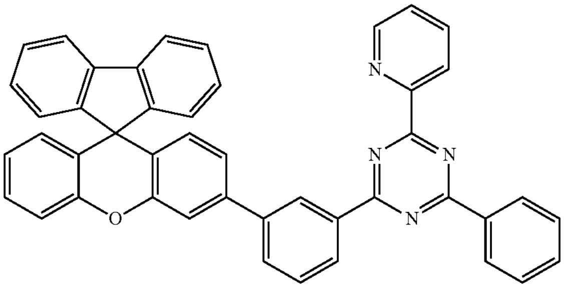
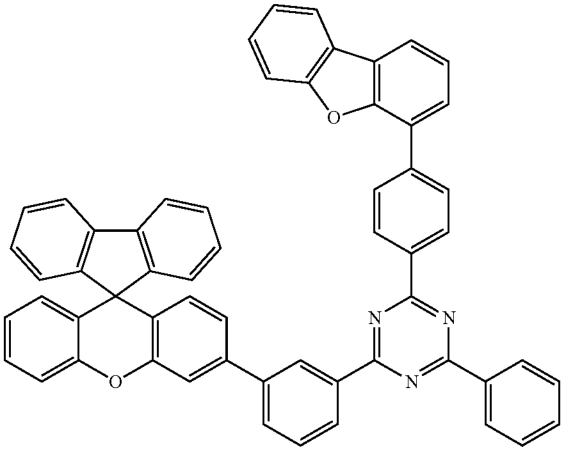
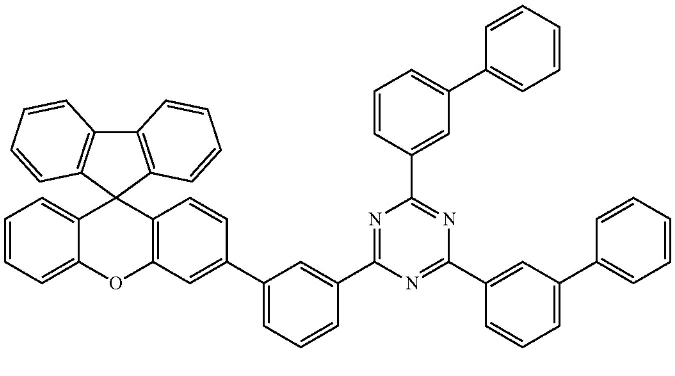

-continued
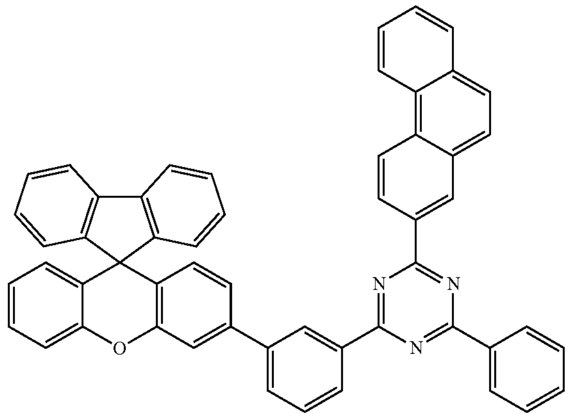
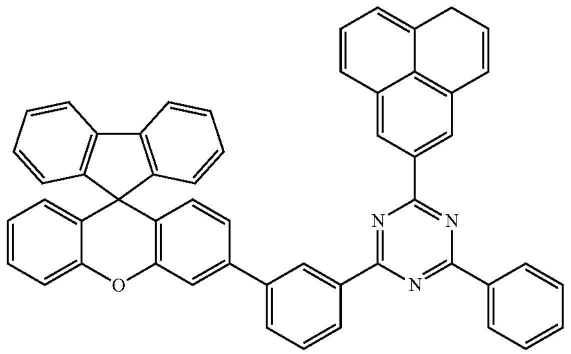
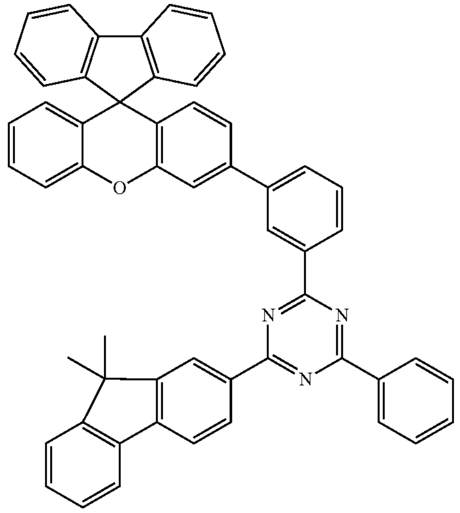
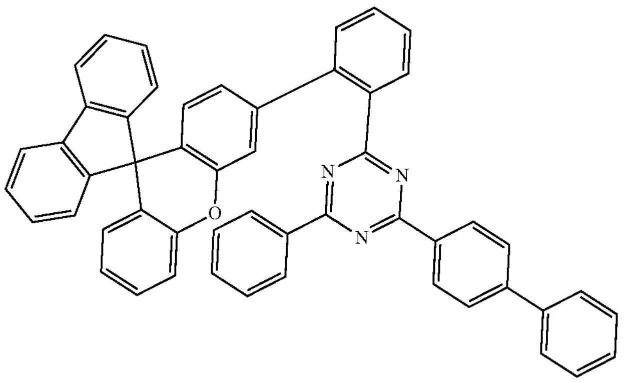
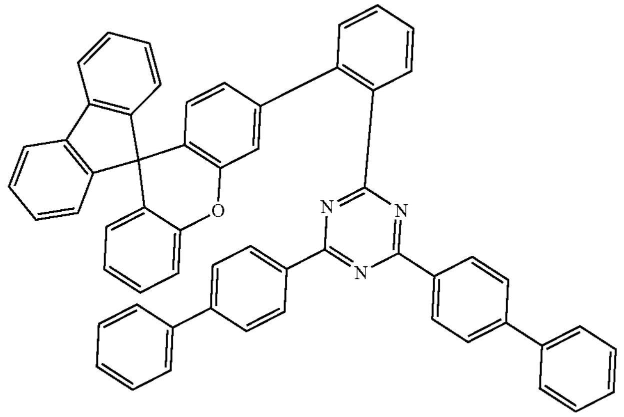

-continued
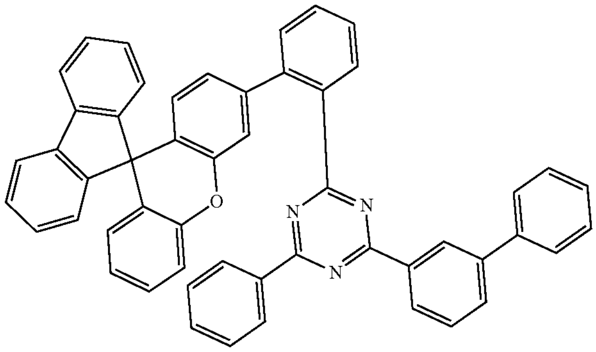
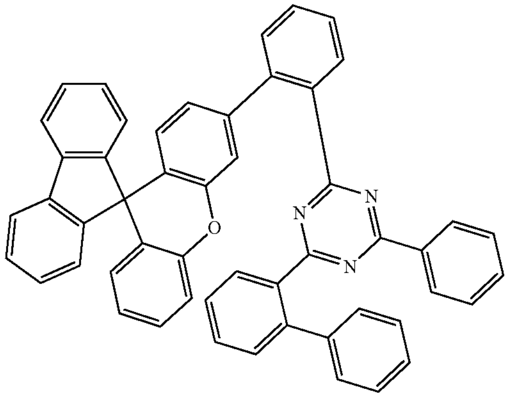
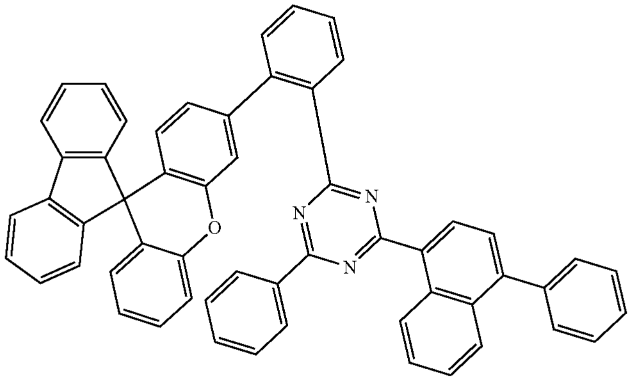
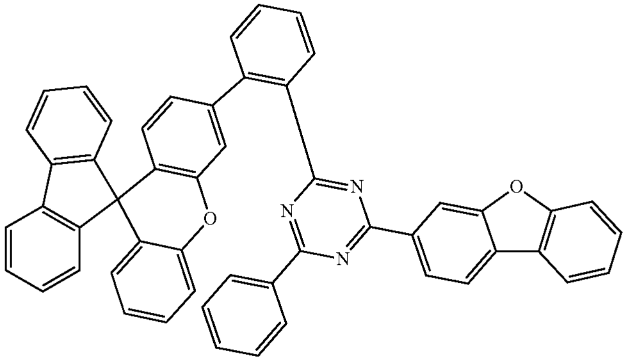
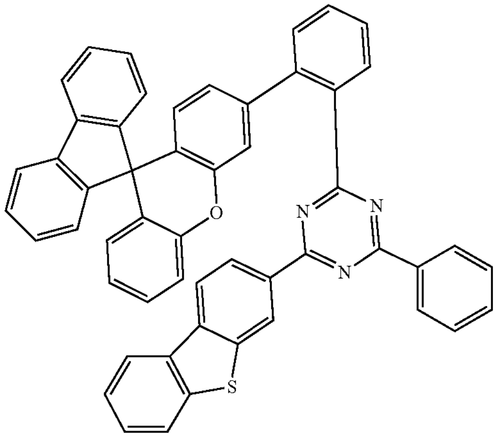
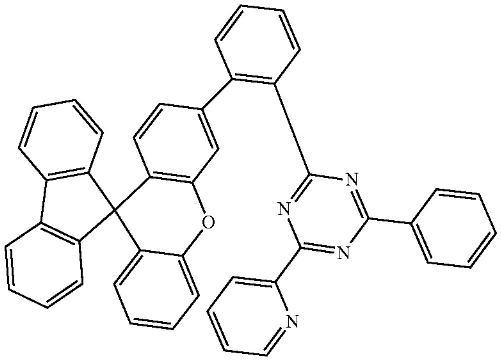
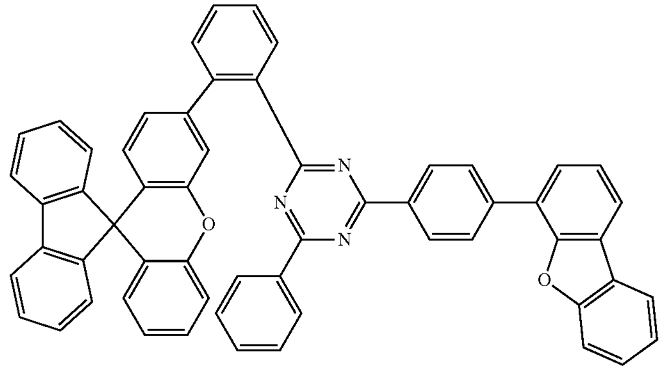

-continued
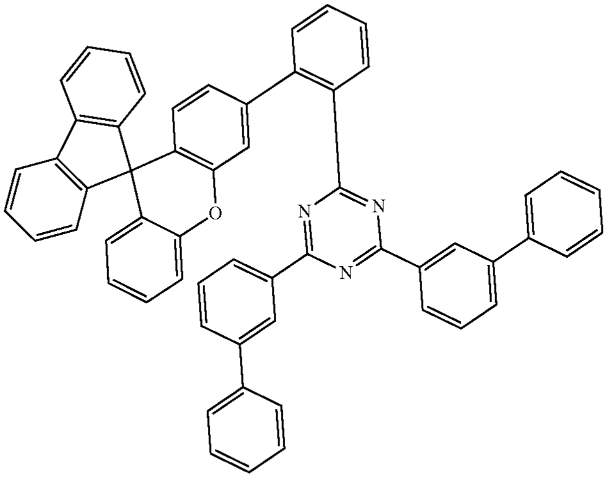
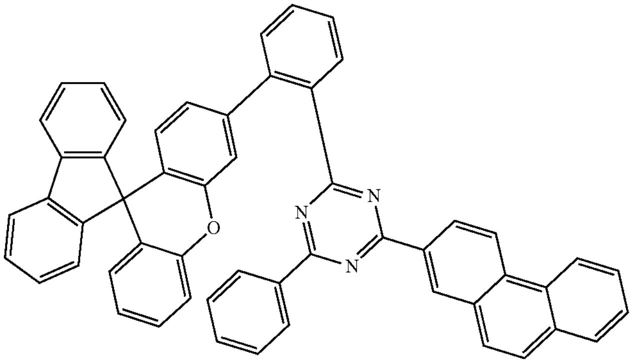
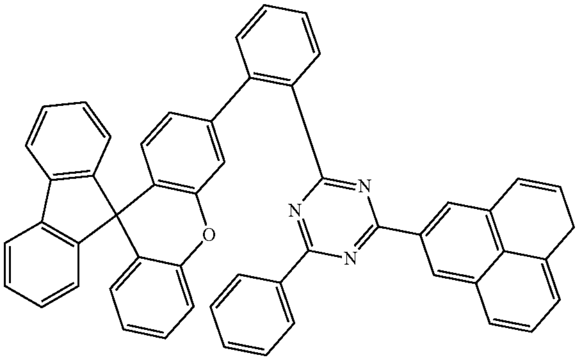
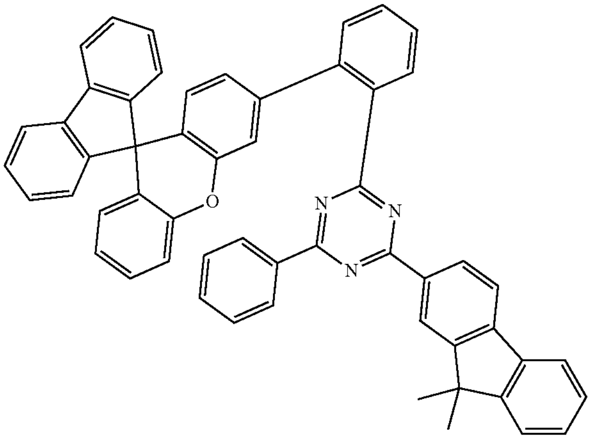

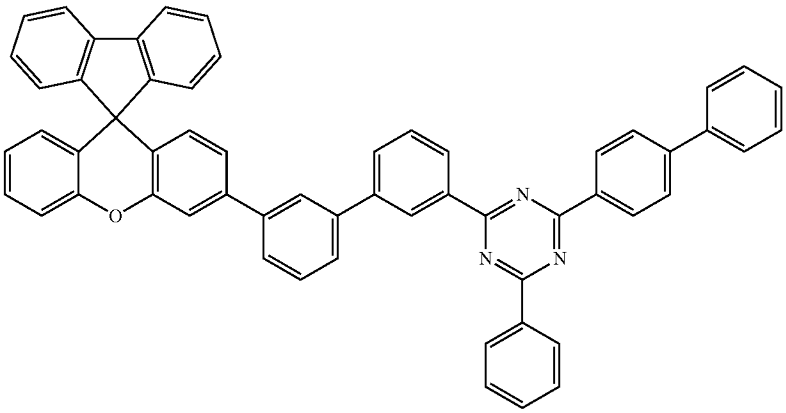
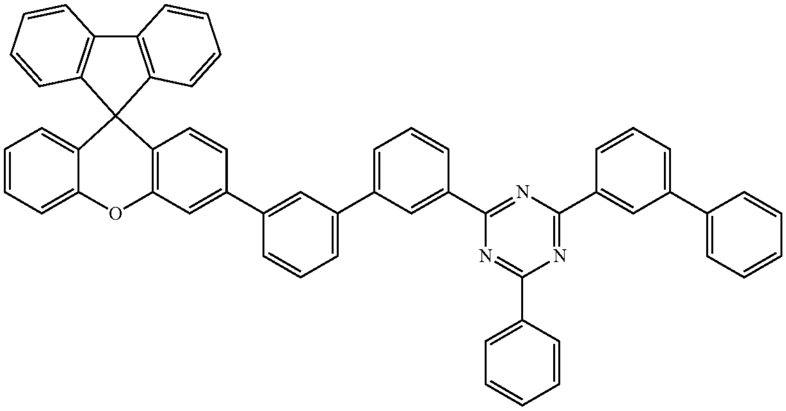
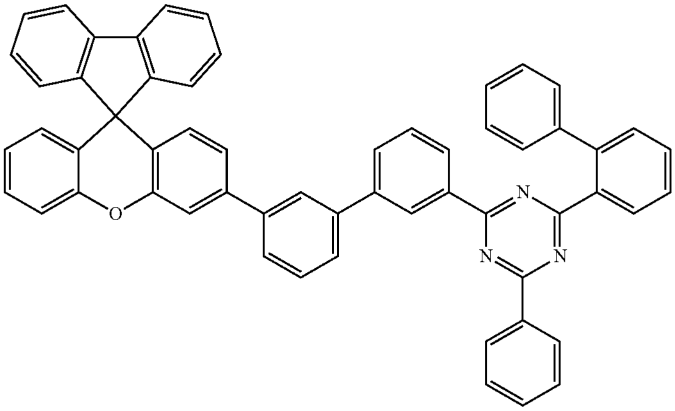

-continued
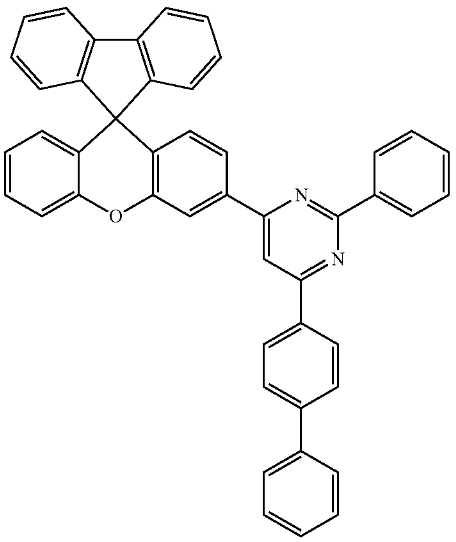
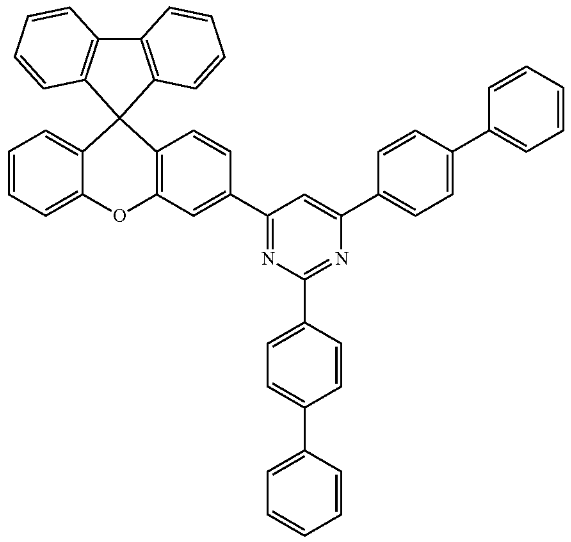
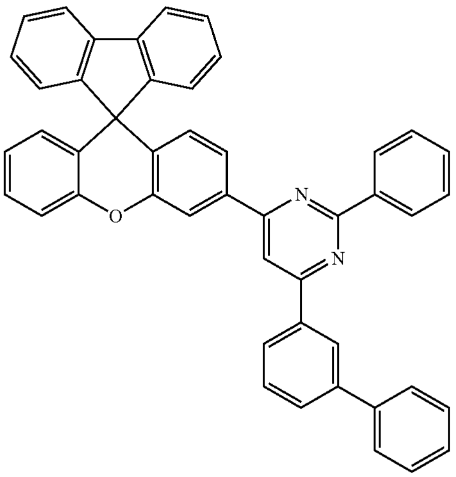
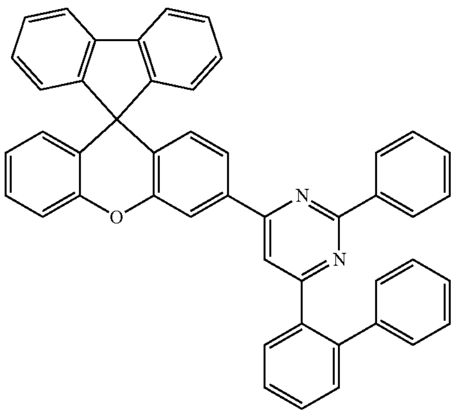
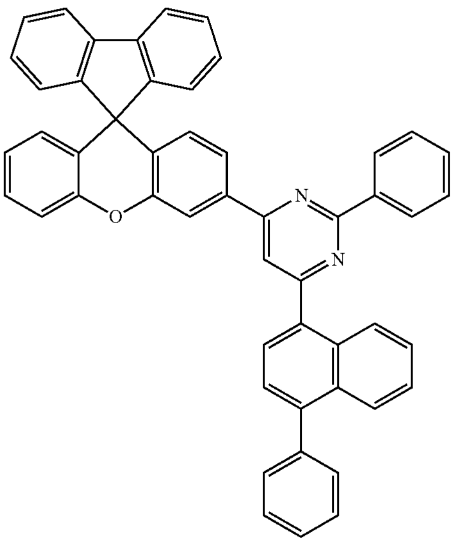
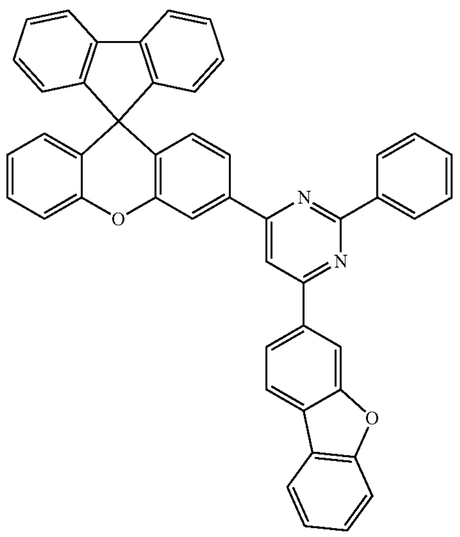

-continued
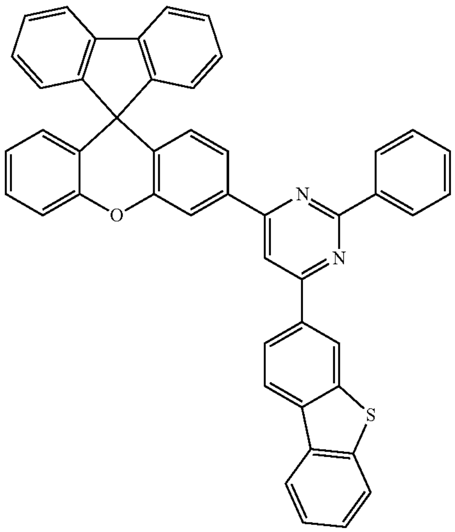
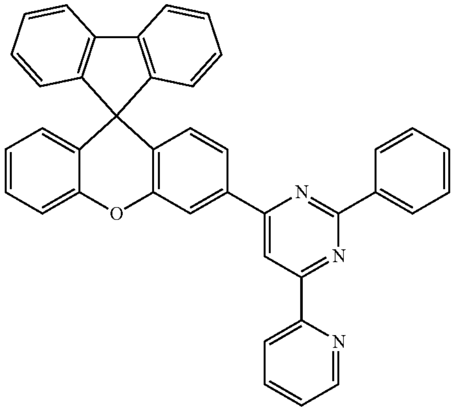
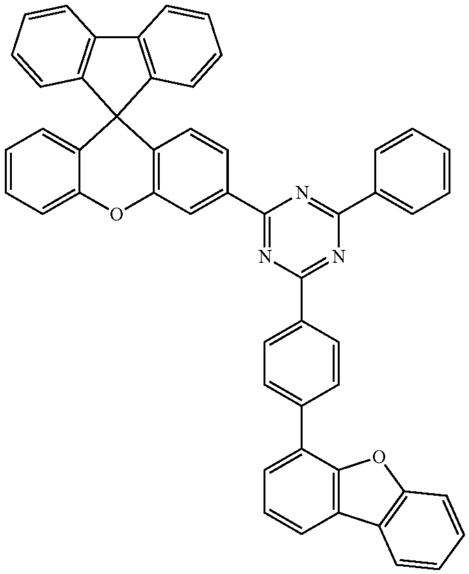
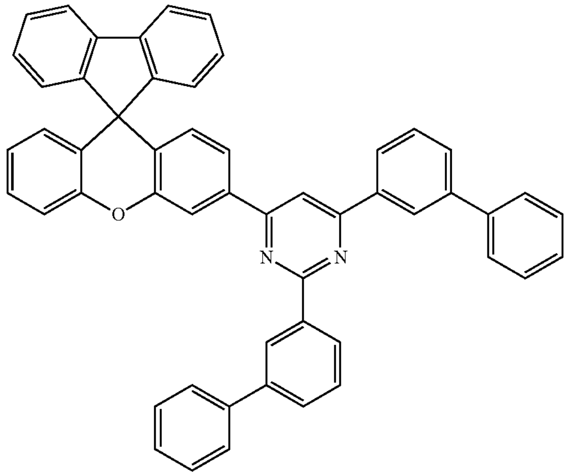
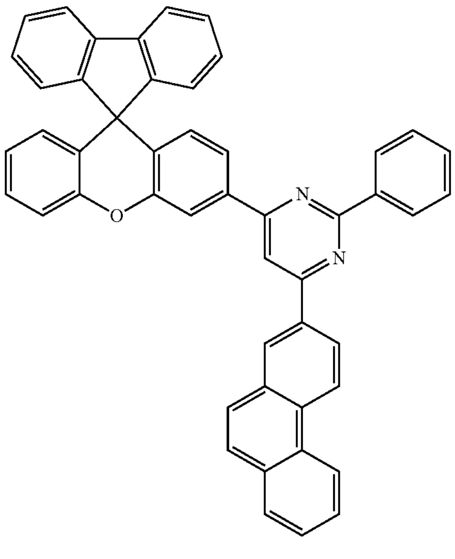
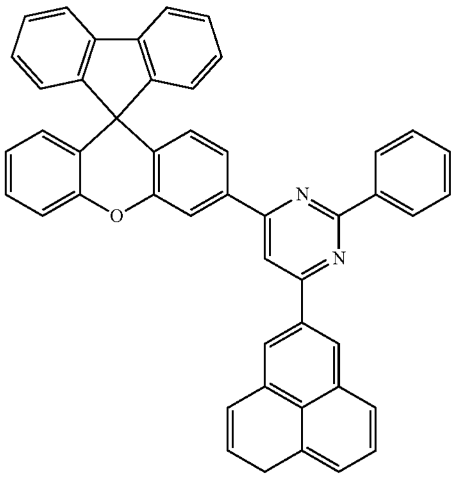

-continued
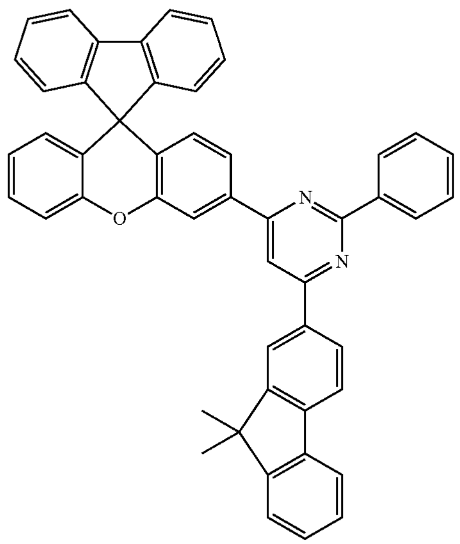
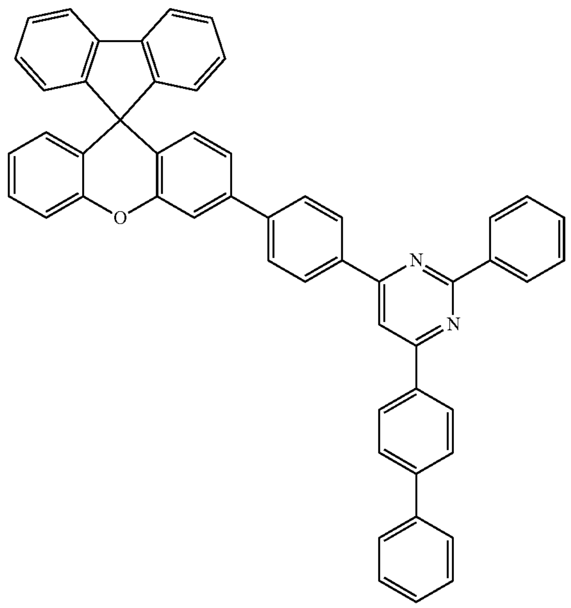
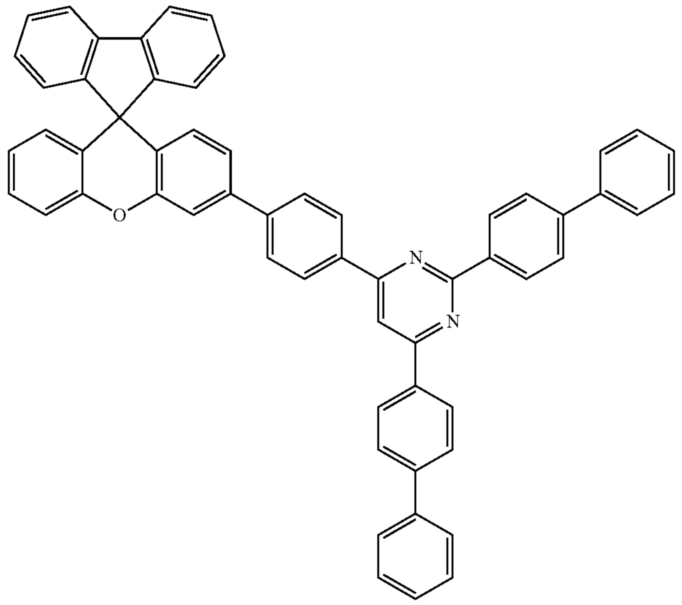

-continued
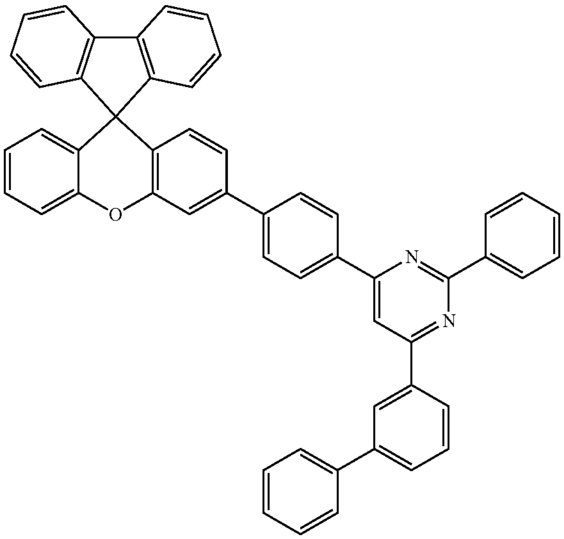
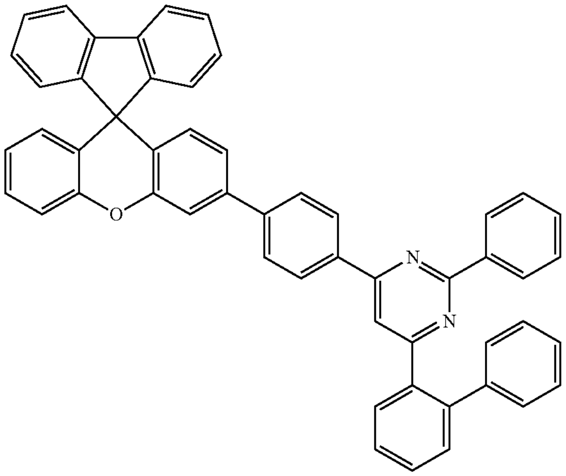
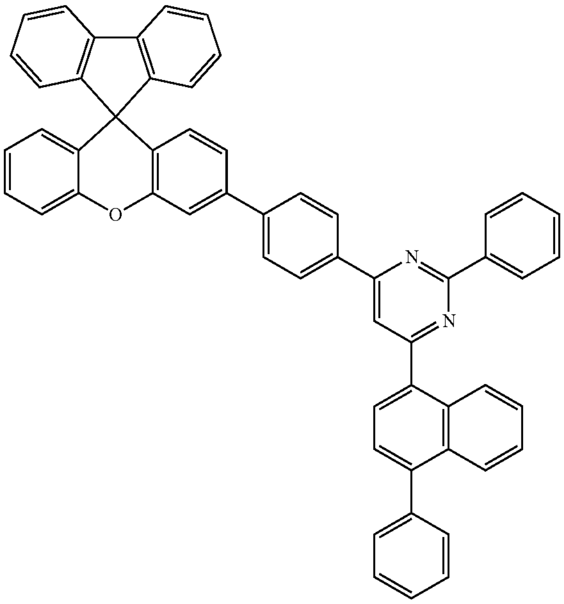
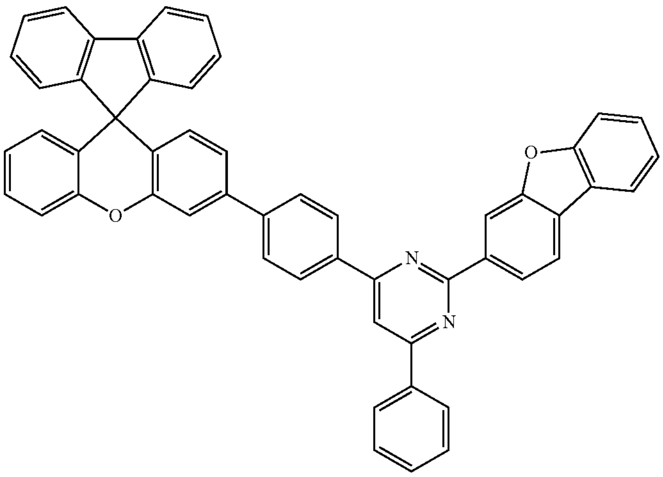

-continued
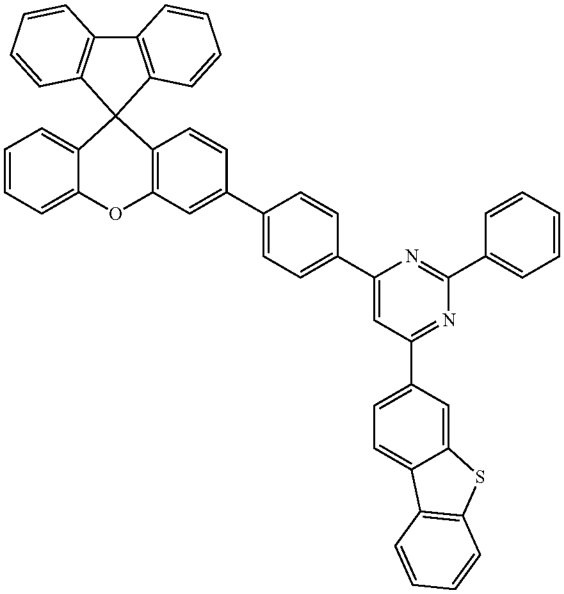
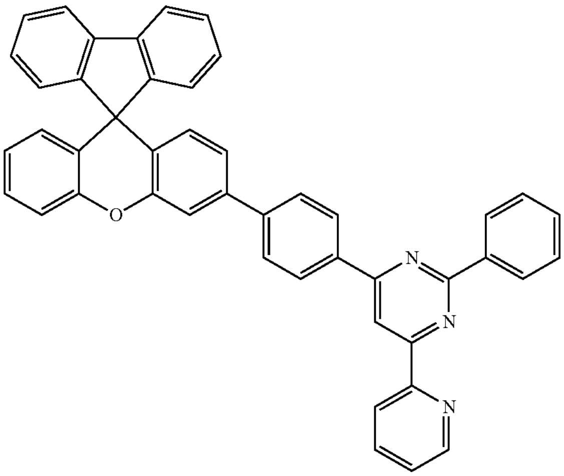
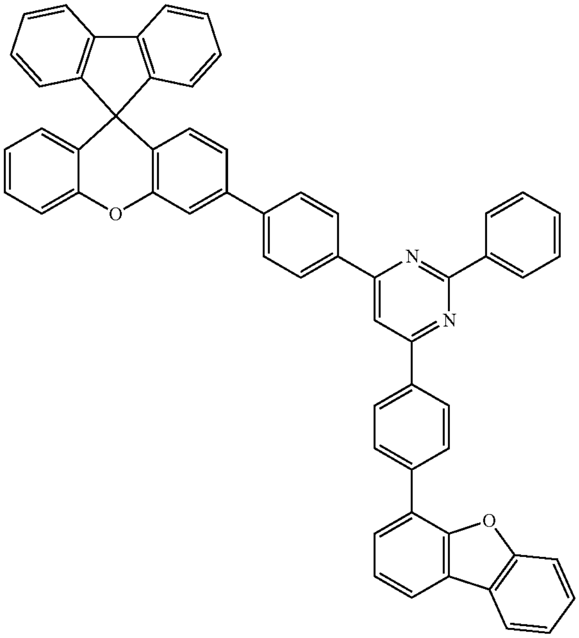

-continued
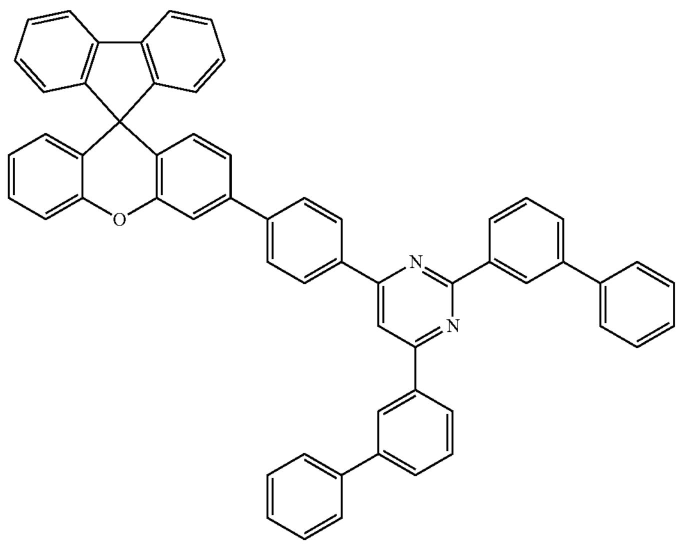
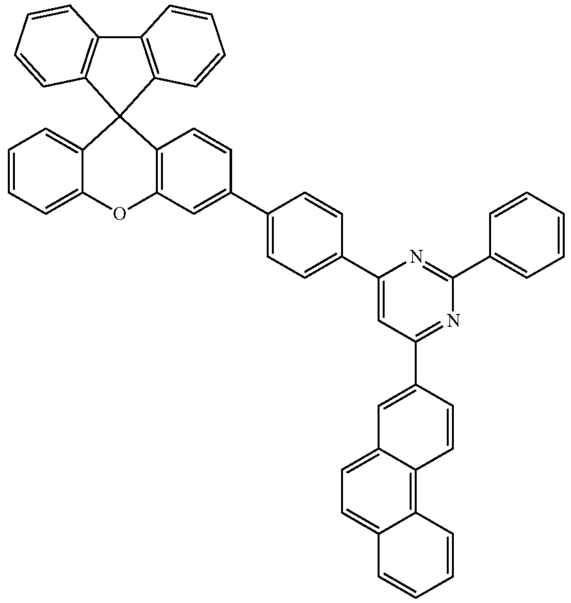
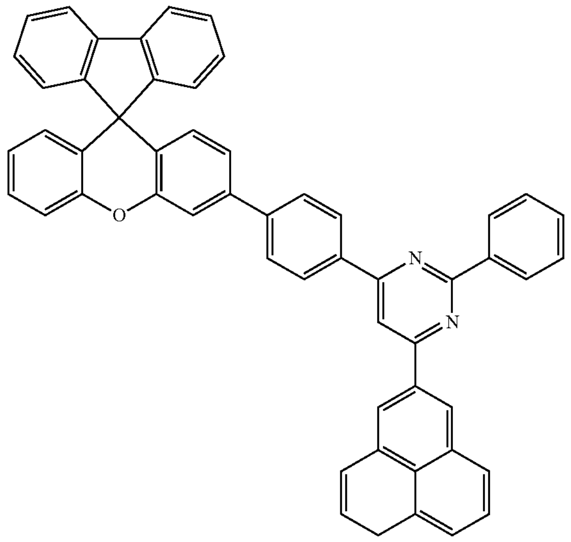

-continued
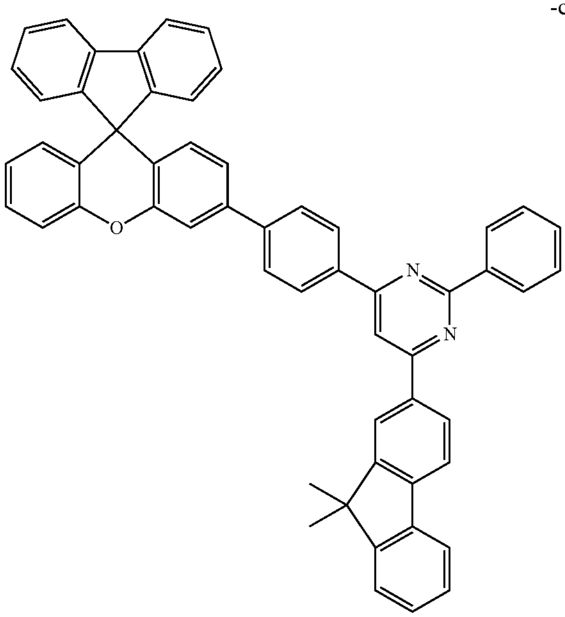
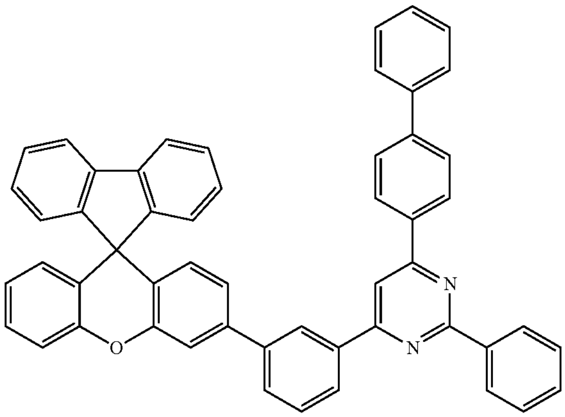
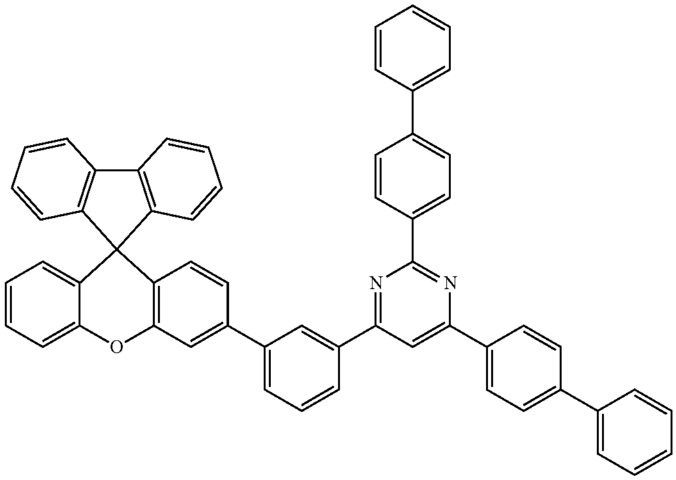
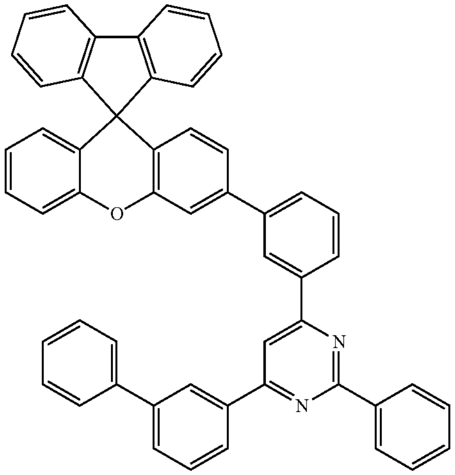
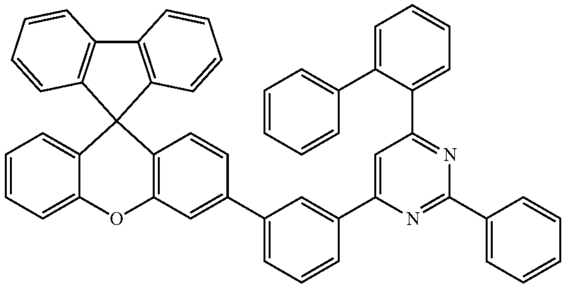
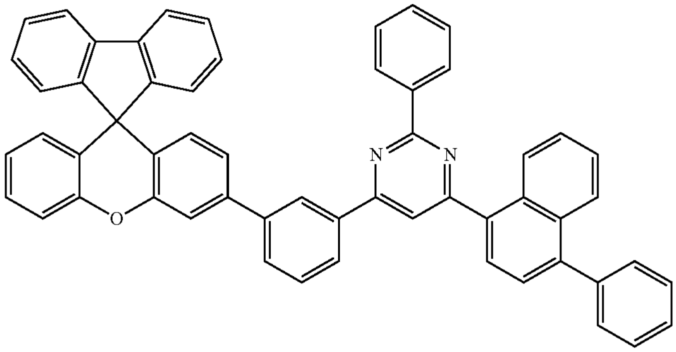

-continued
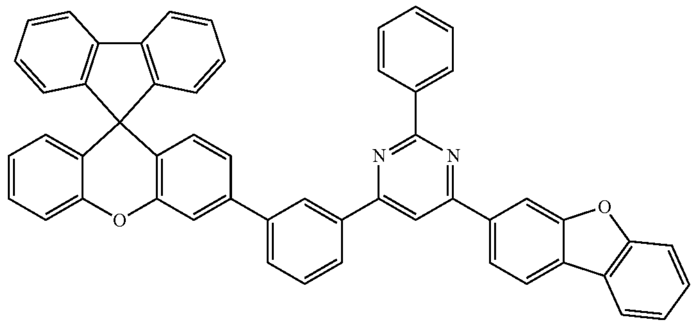
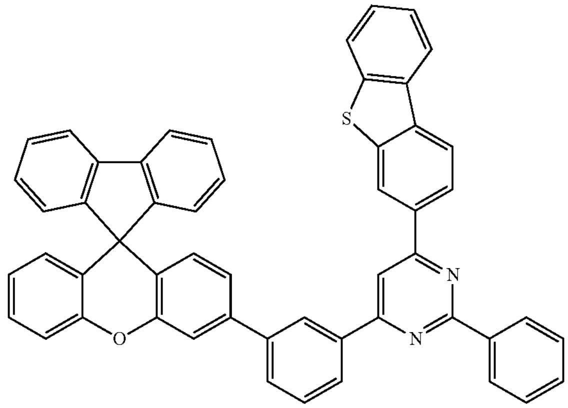
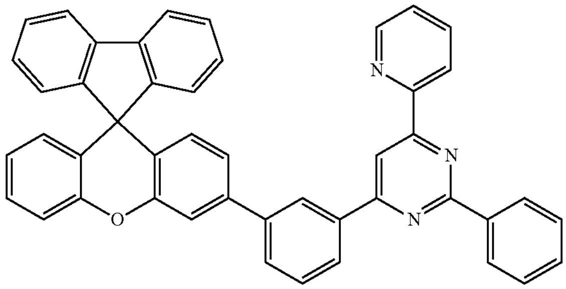
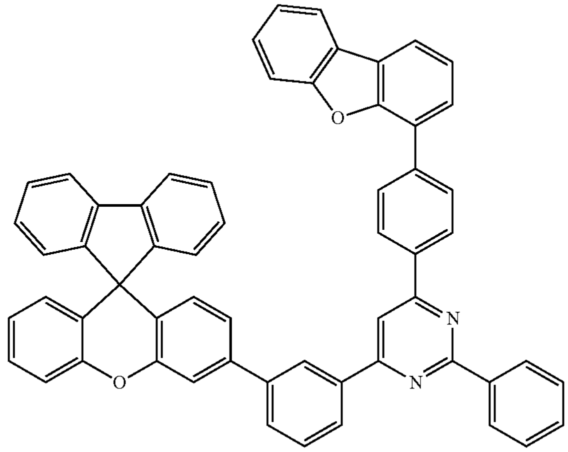
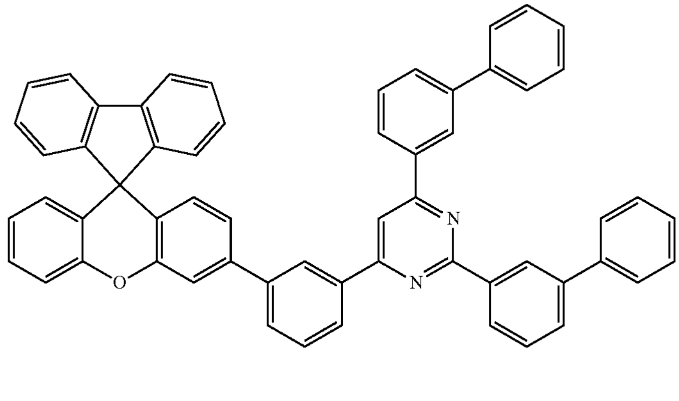

-continued
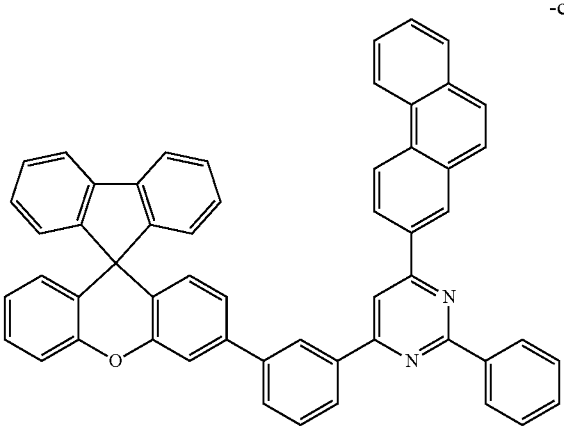
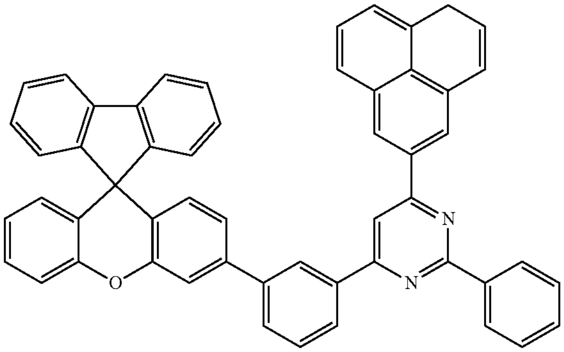
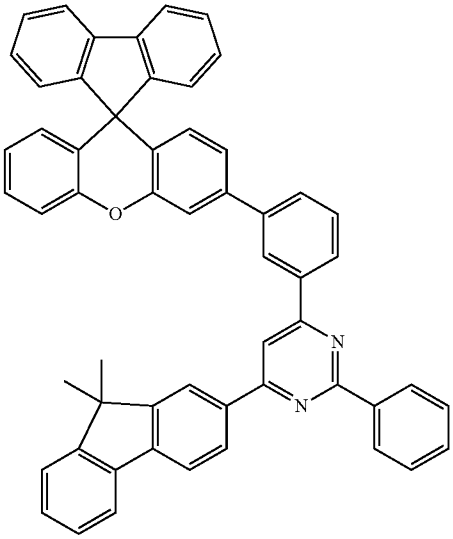
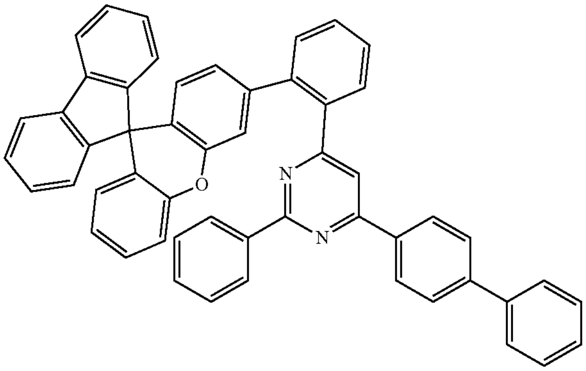
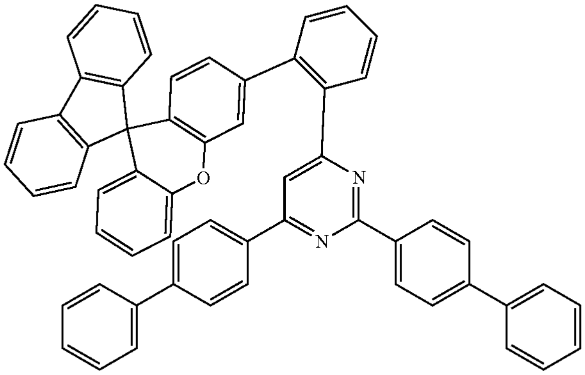
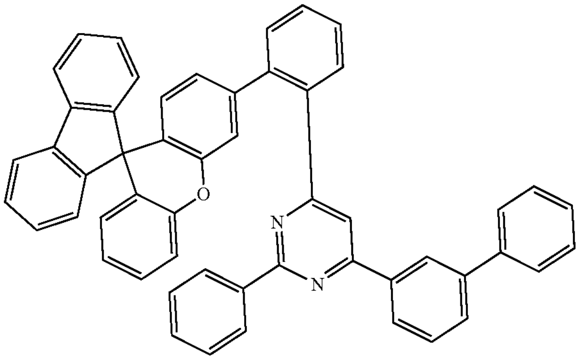
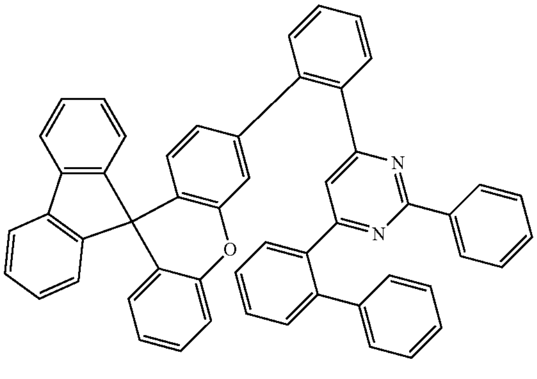
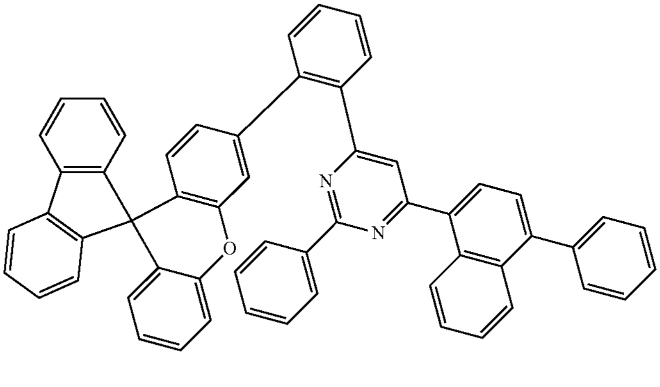

-continued
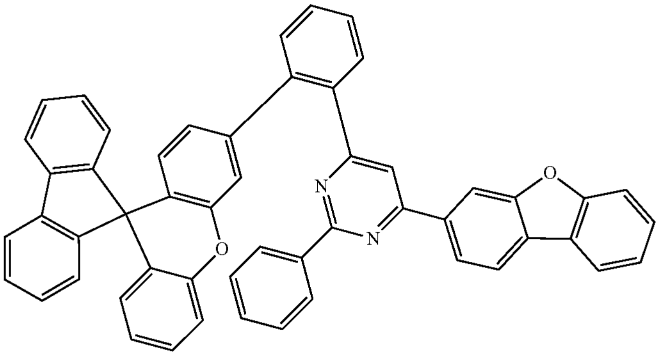
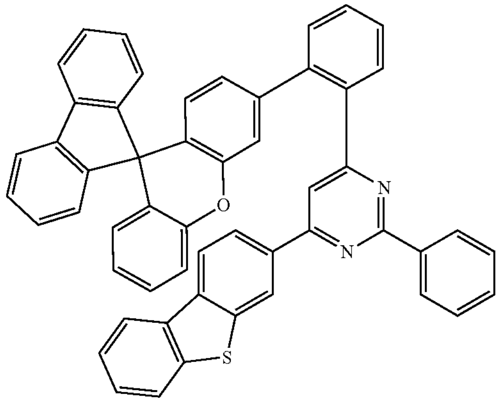
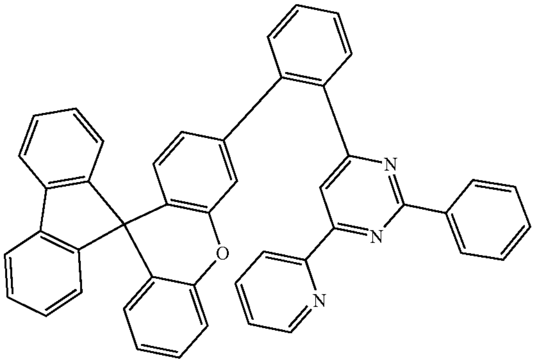
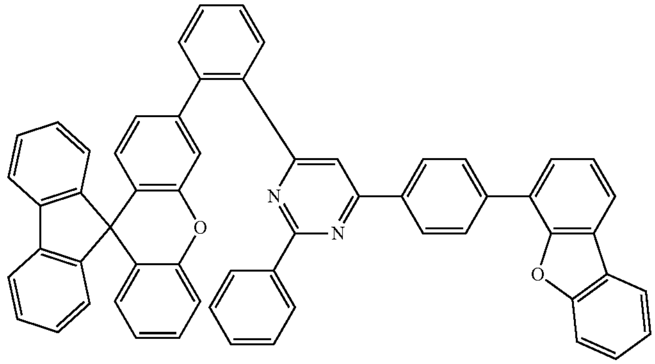
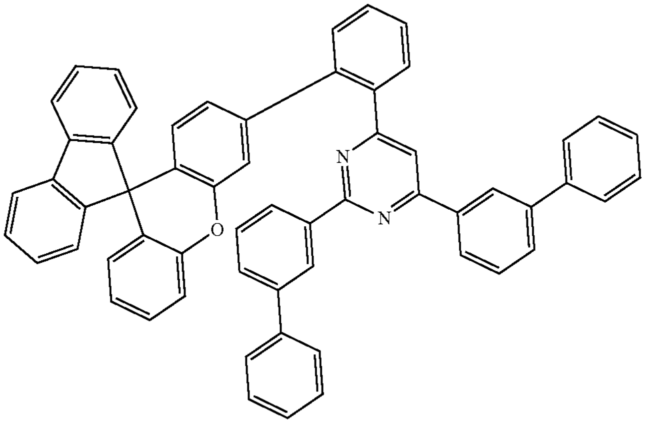
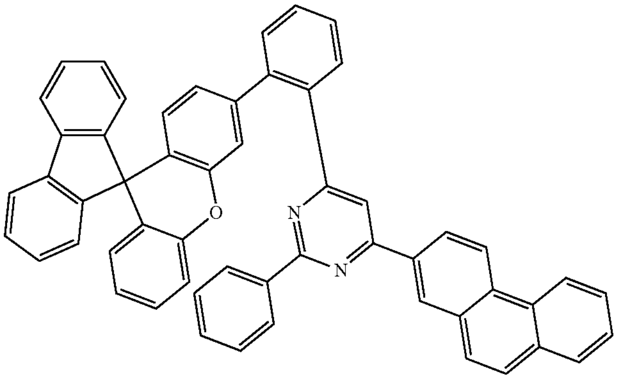

-continued
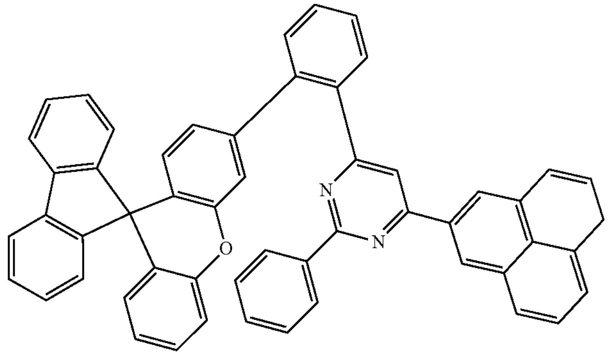
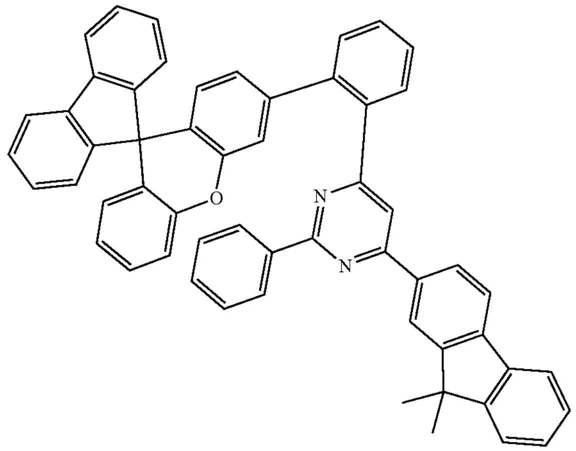
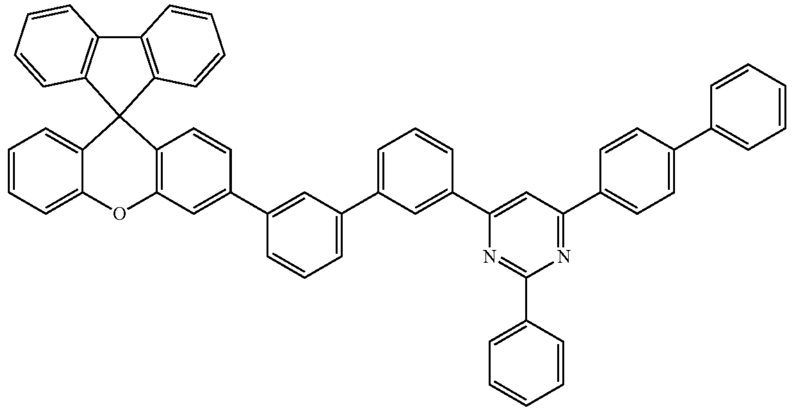
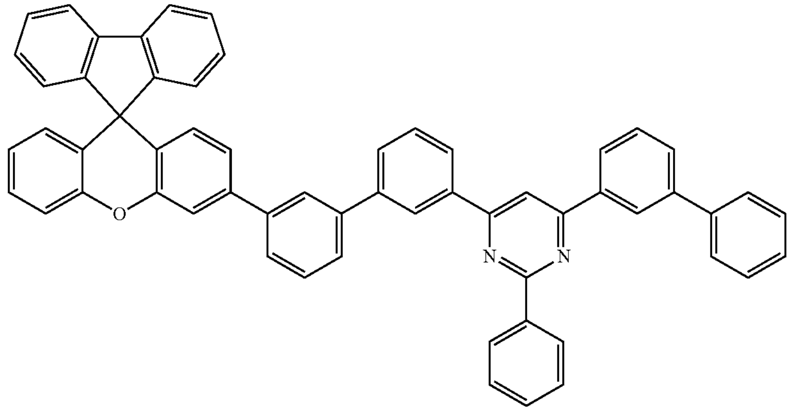 [SMILES: c1ccc(-c2cccc(-c3cc(-c4cccc(-c5cccc(-c6ccc7c(c6)Oc6ccccc6C76c7ccccc7-c7ccccc76)c5)c4)nc(-c4ccccc4)n3)c2)cc1]
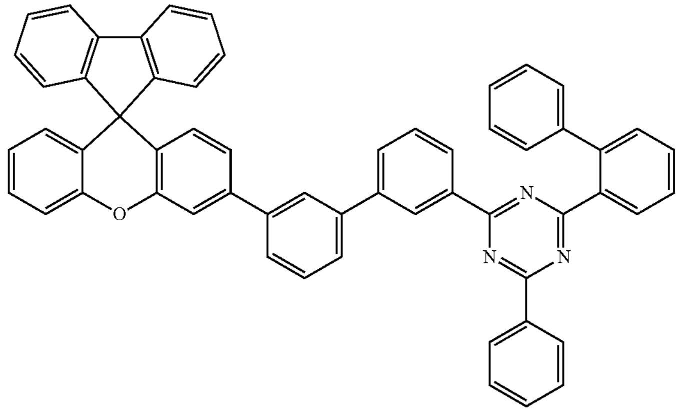 [SMILES: c1ccc(-c2nc(-c3cccc(-c4cccc(-c5ccc6c(c5)Oc5ccccc5C65c6ccccc6-c6ccccc65)c4)c3)nc(-c3ccccc3-c3ccccc3)n2)cc1]

-continued
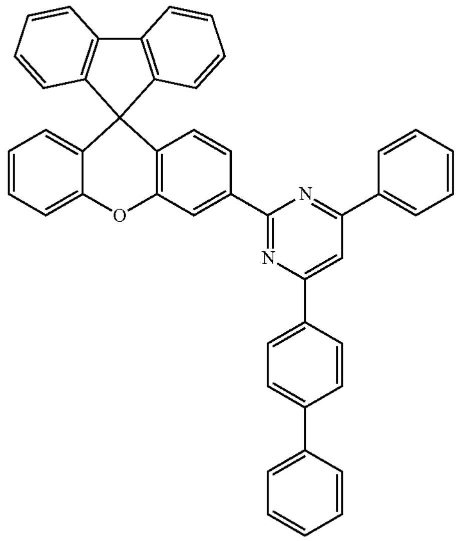
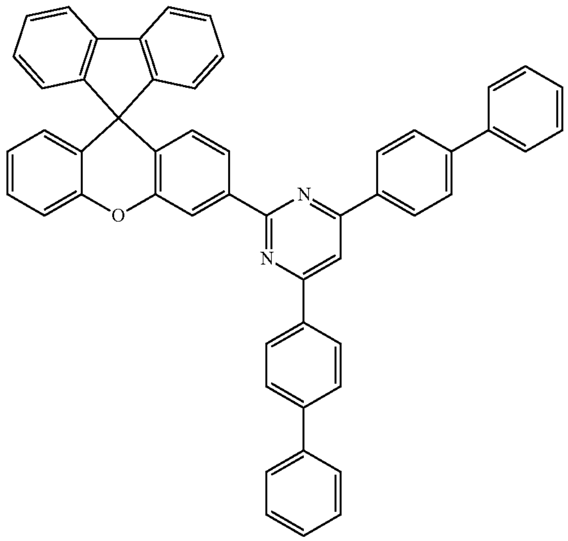
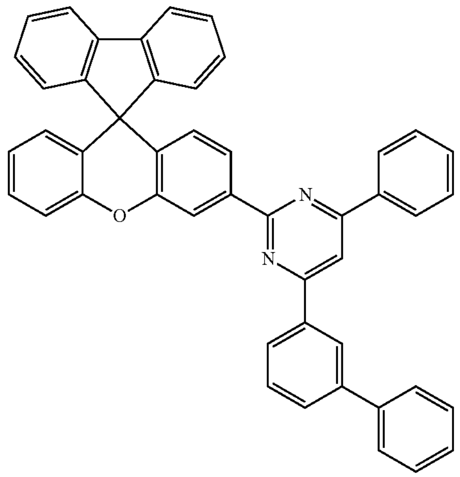
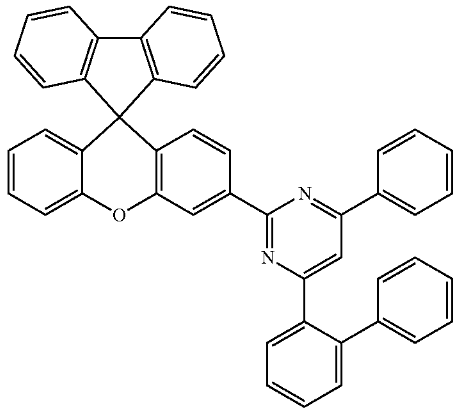
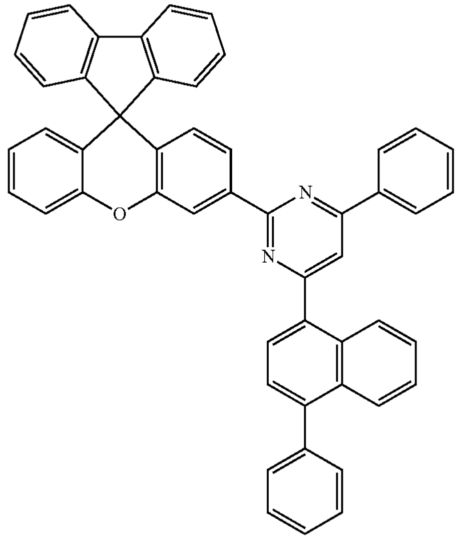
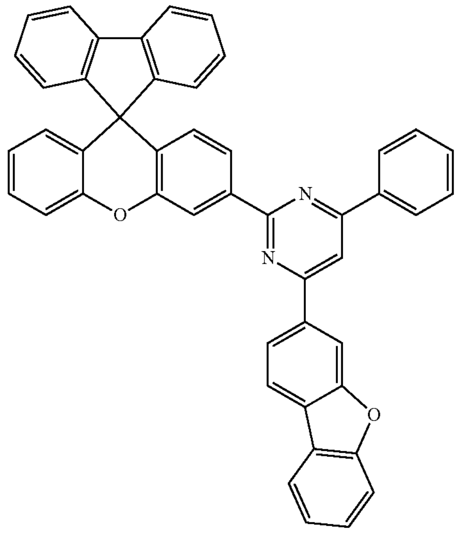

-continued
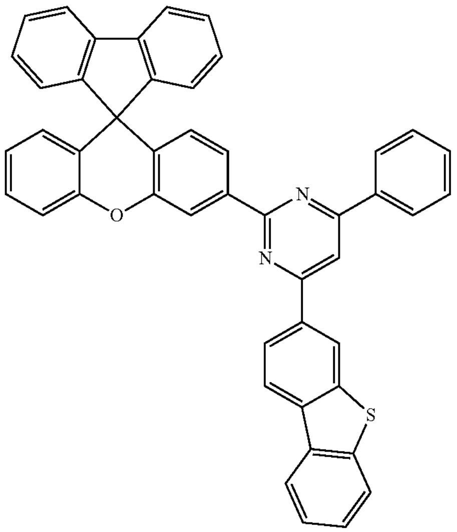
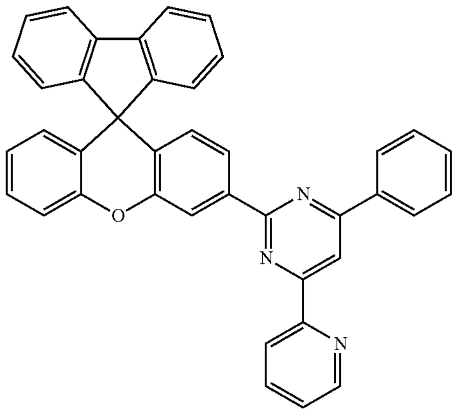
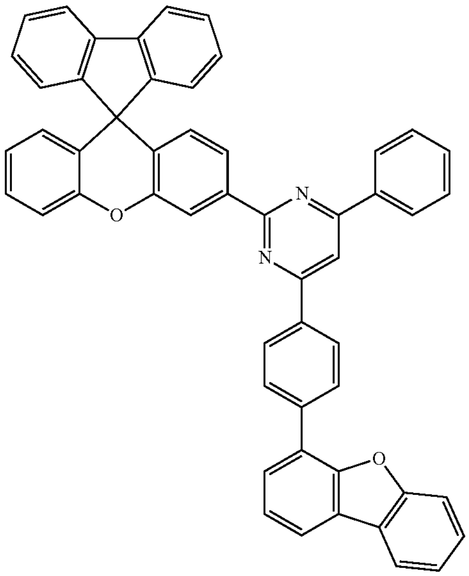
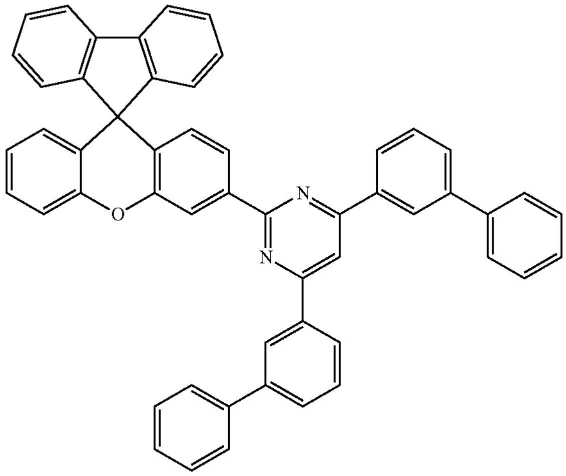
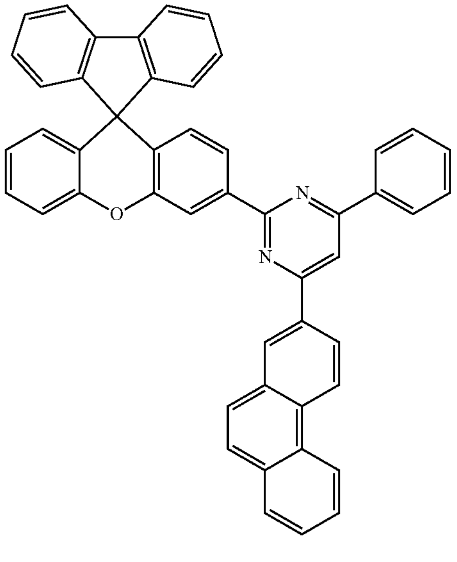
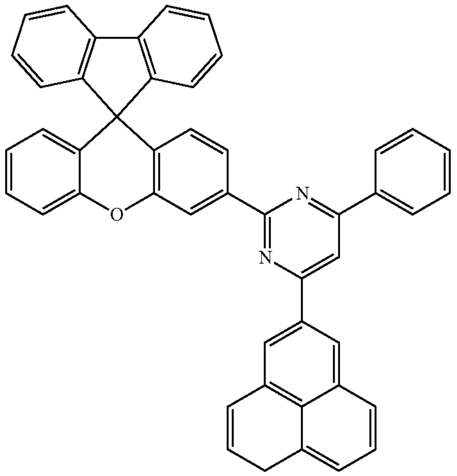

-continued
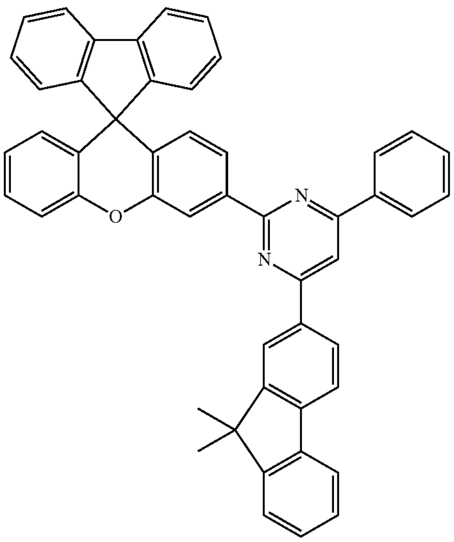
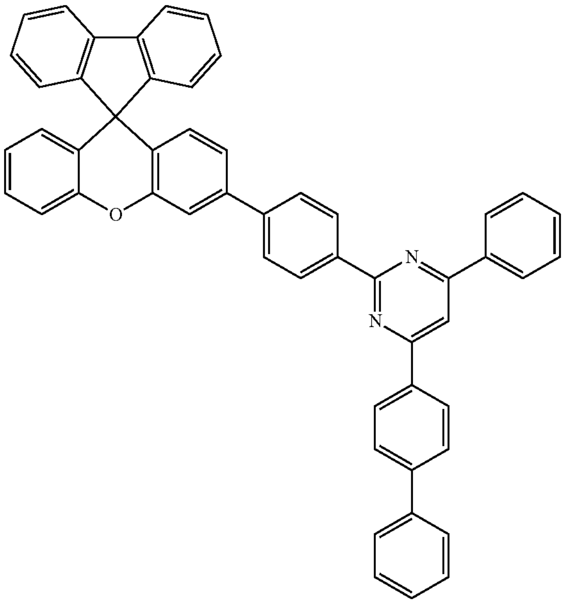
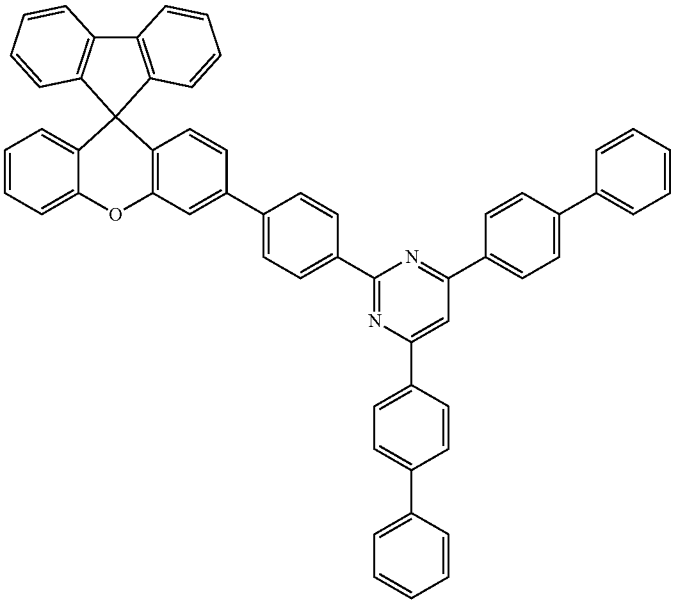

-continued
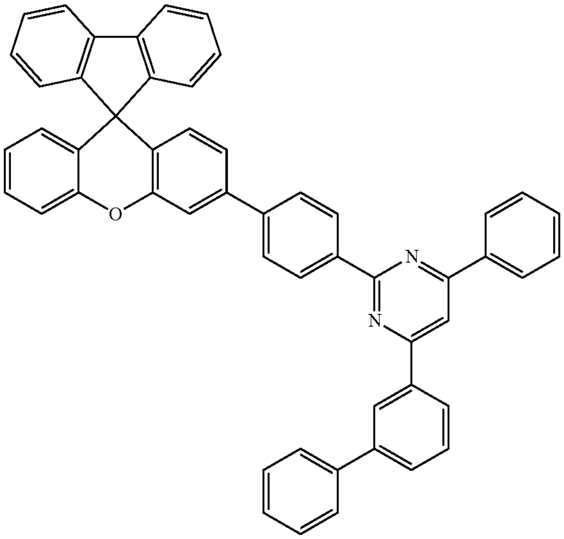
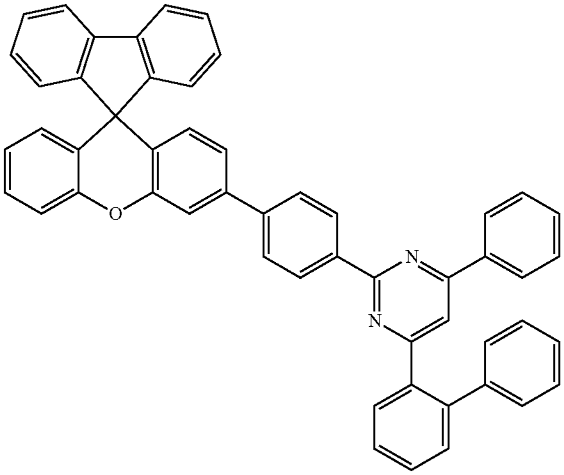
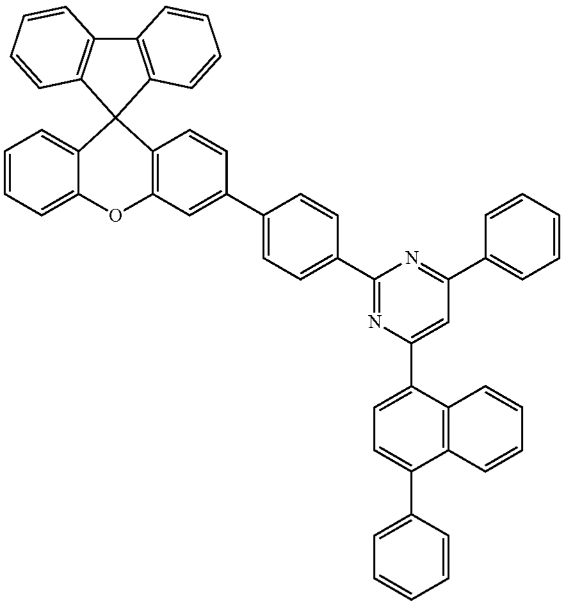
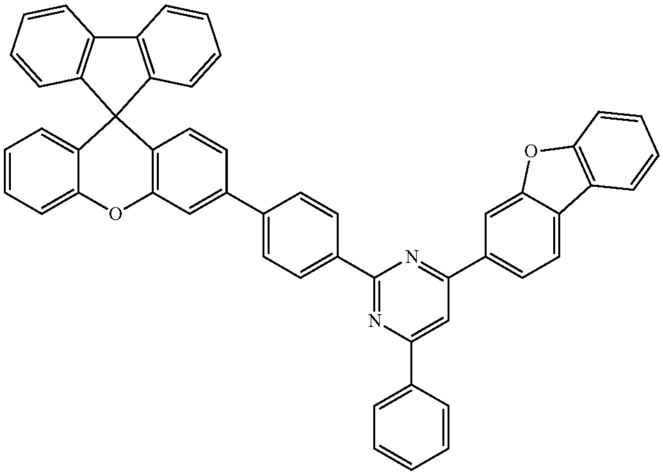

-continued
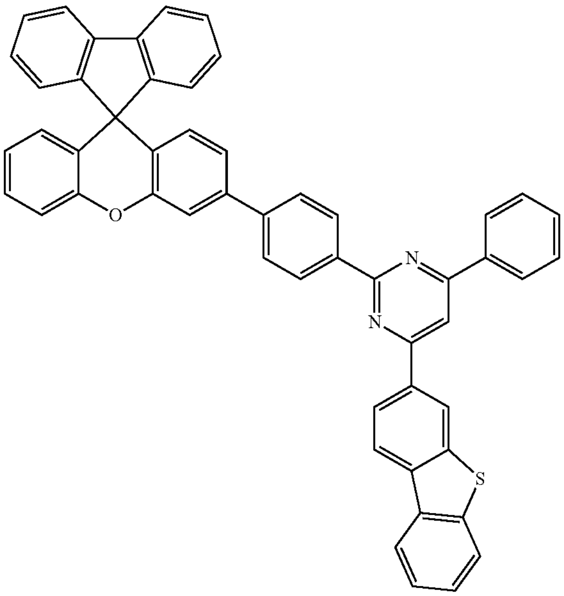
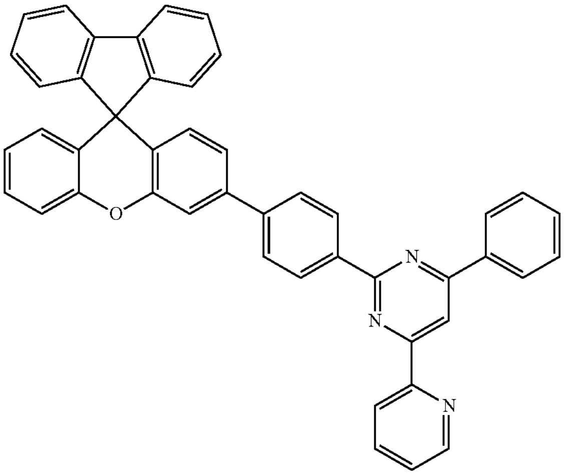
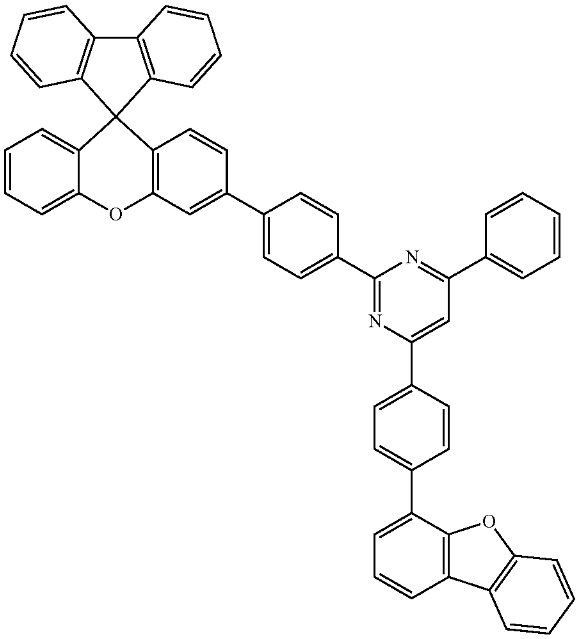

-continued
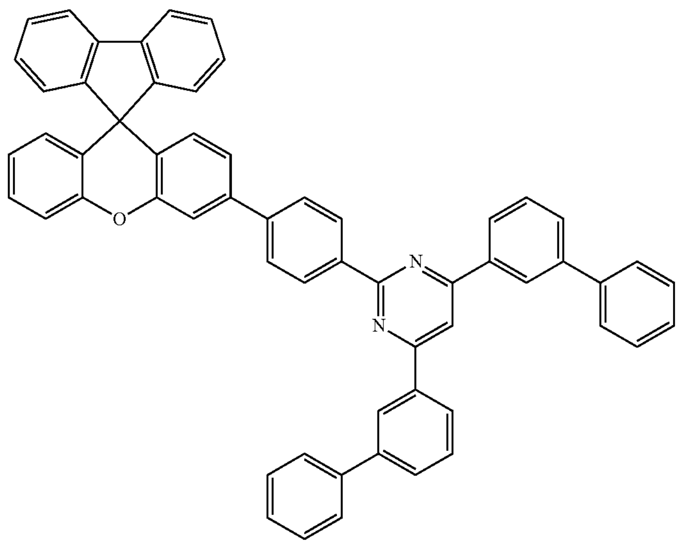
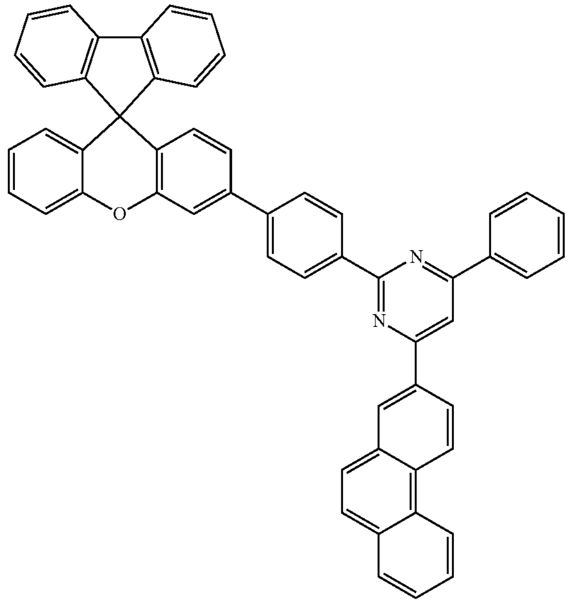
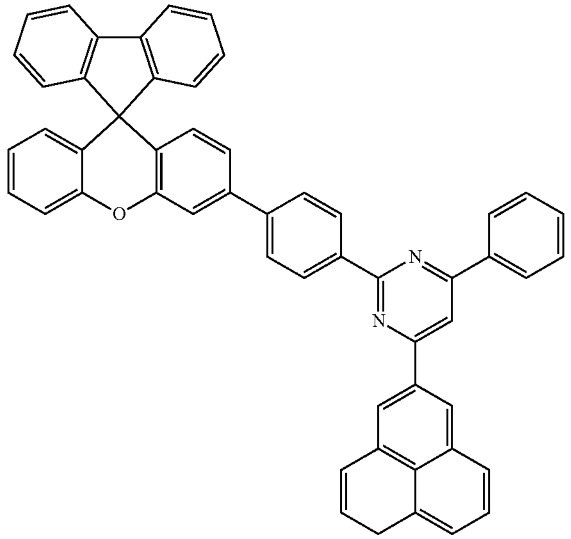

-continued
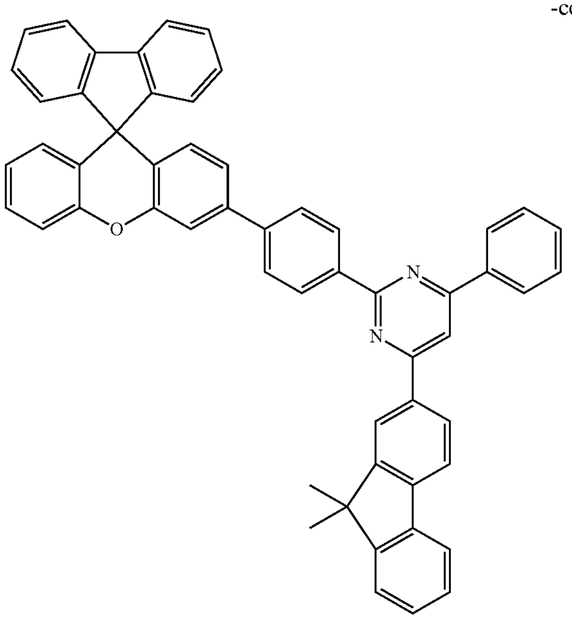
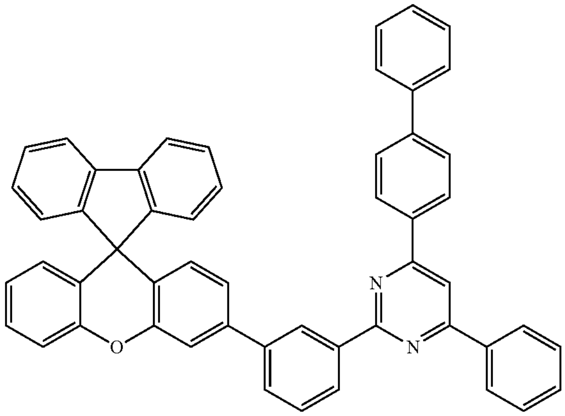
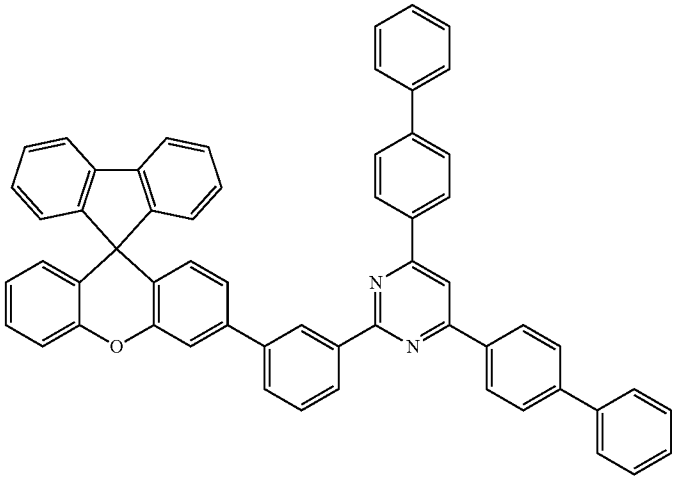
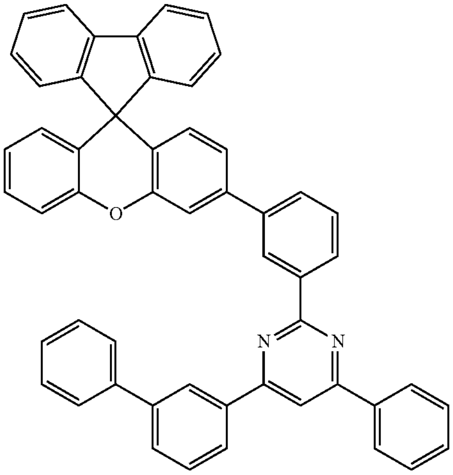
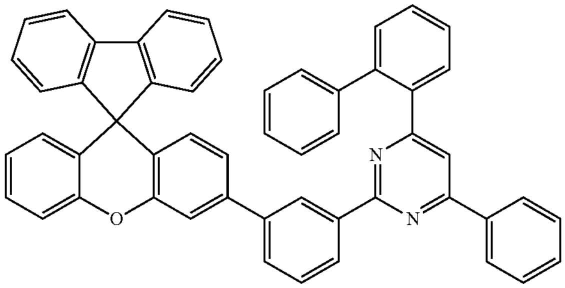
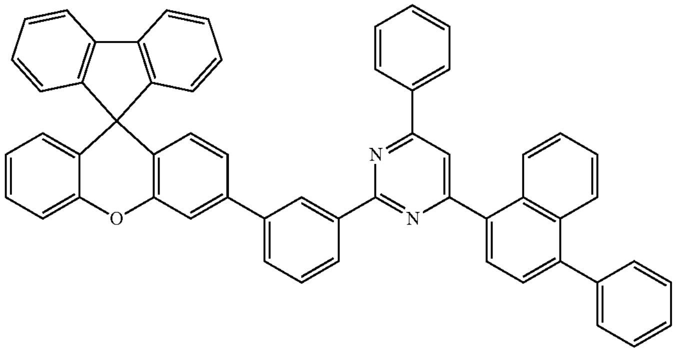

-continued
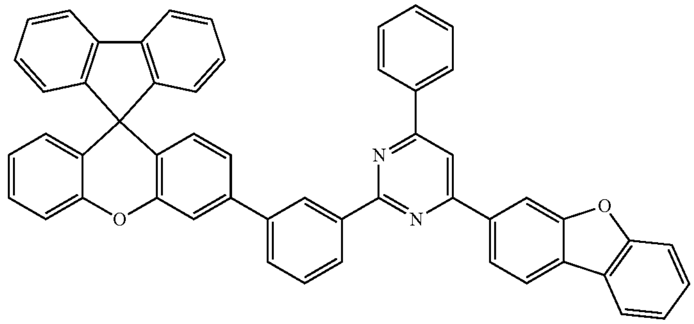
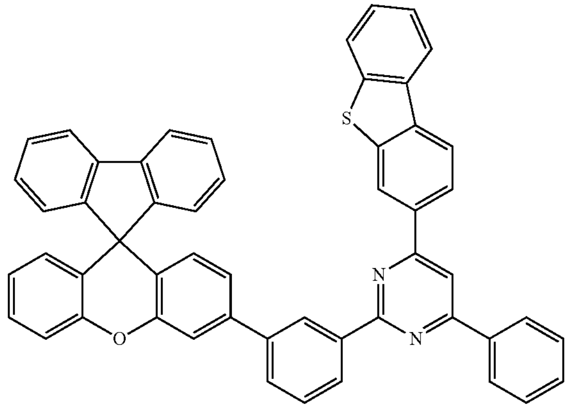
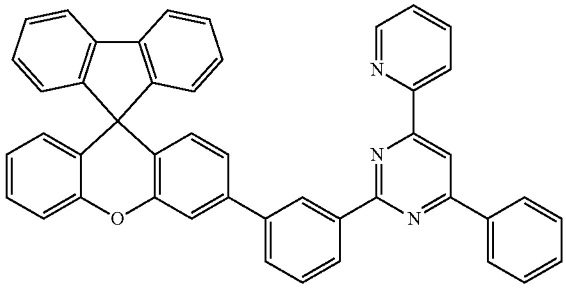
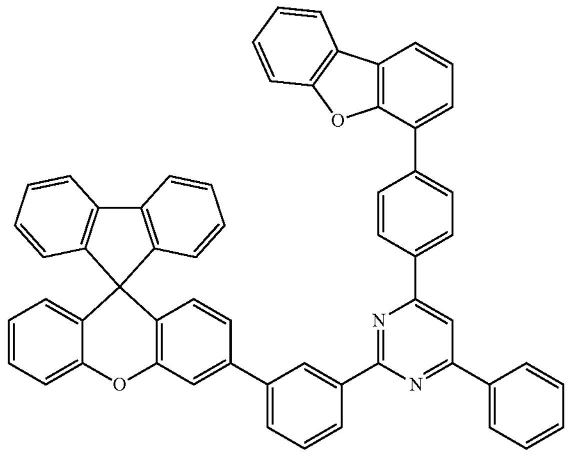
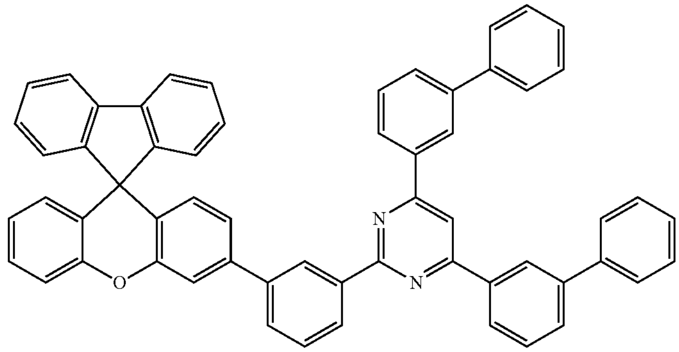

-continued
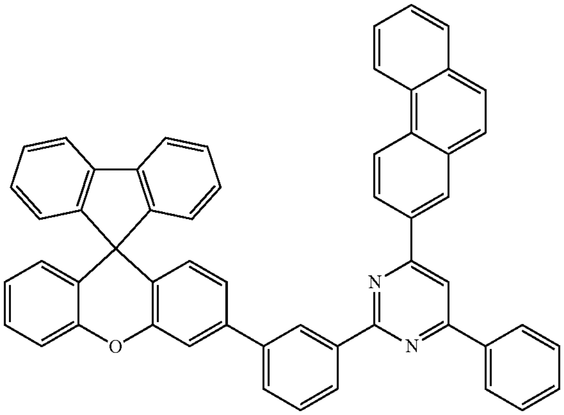
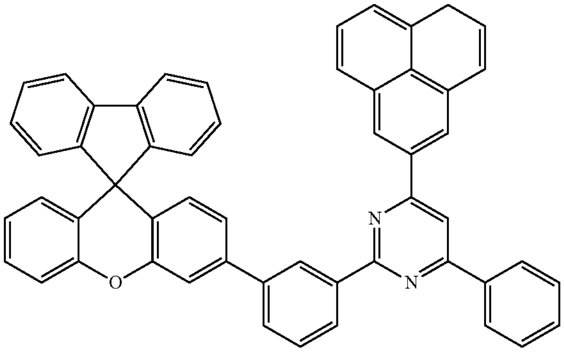
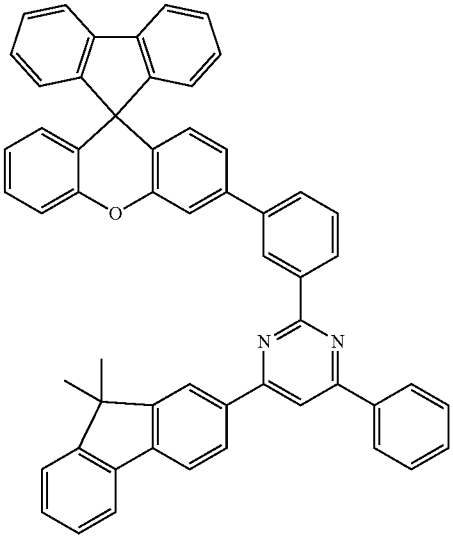
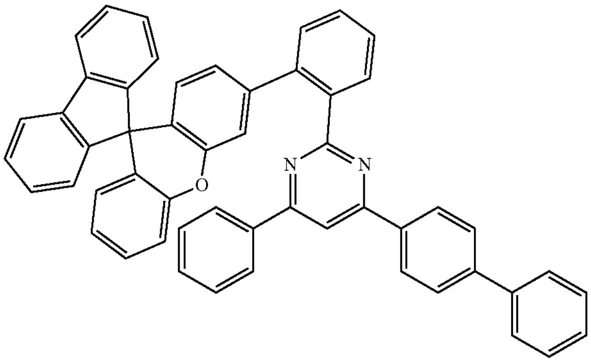
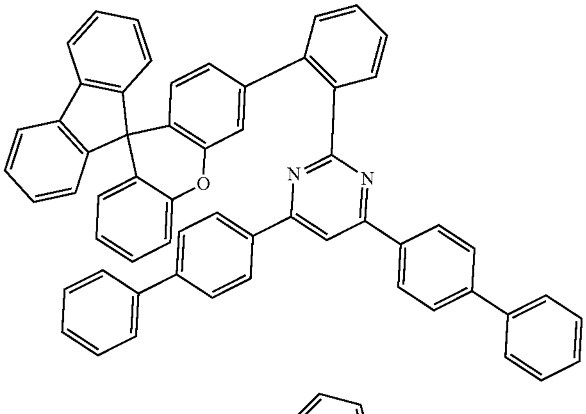
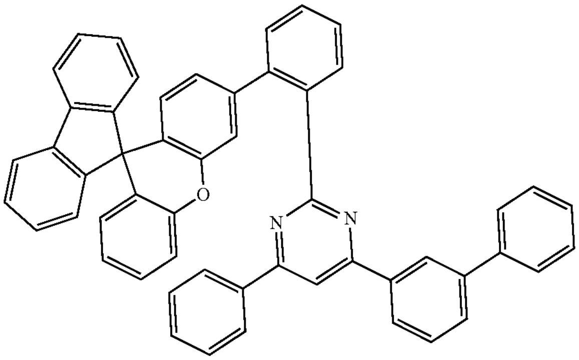
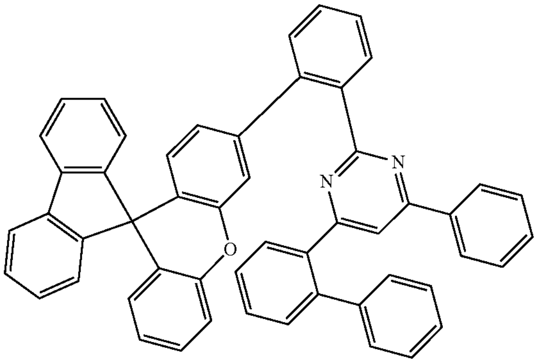
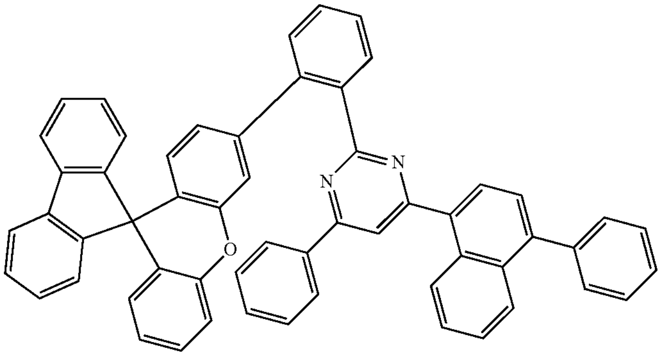

-continued
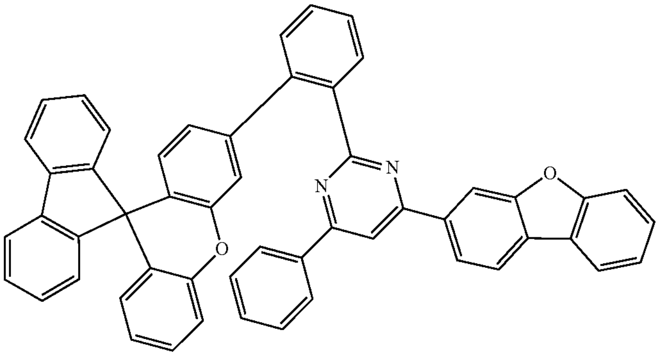
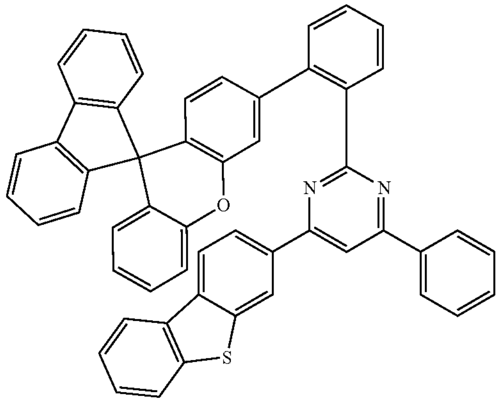
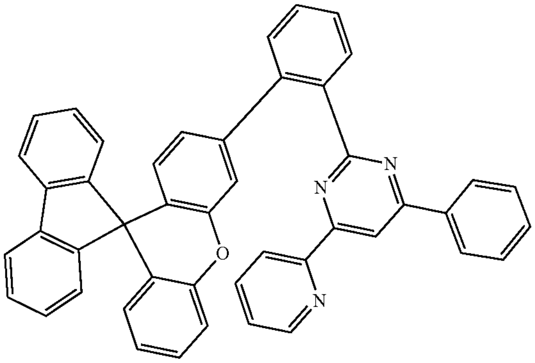
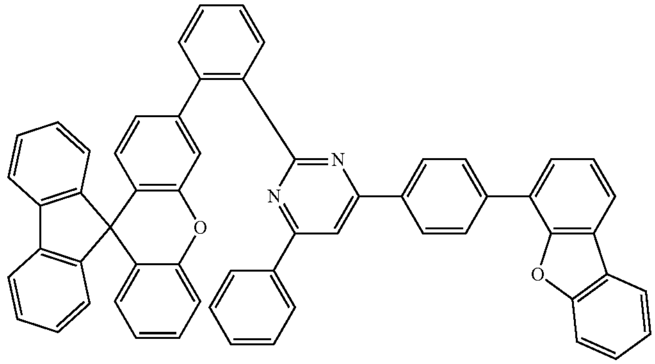
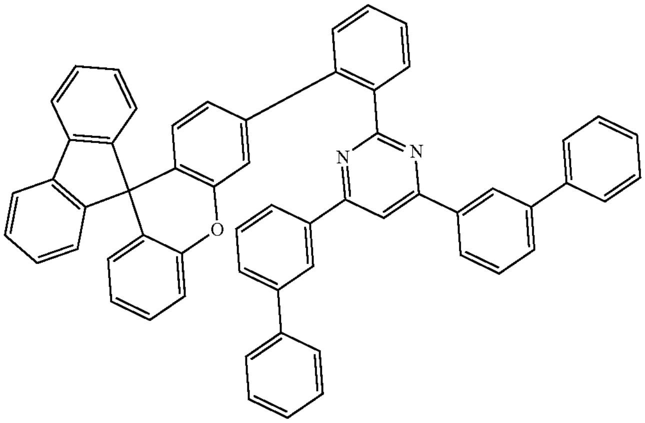
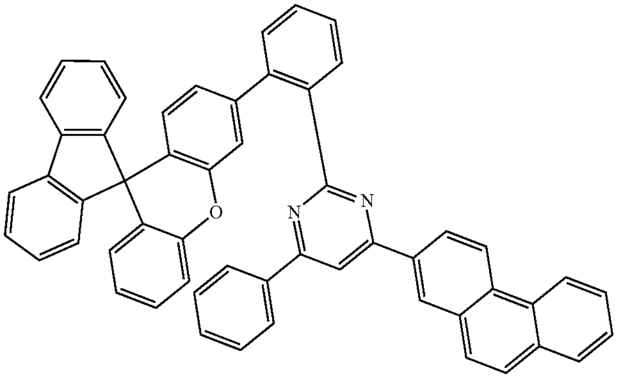

-continued
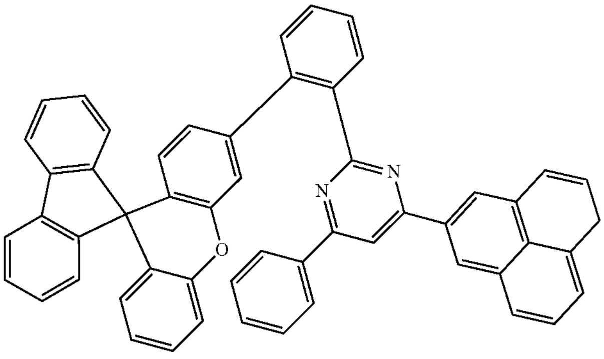
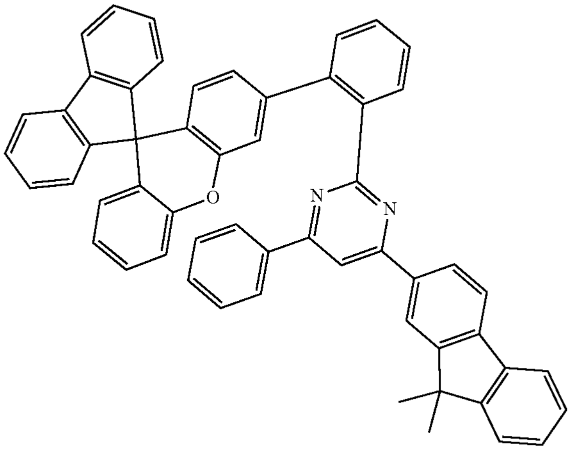
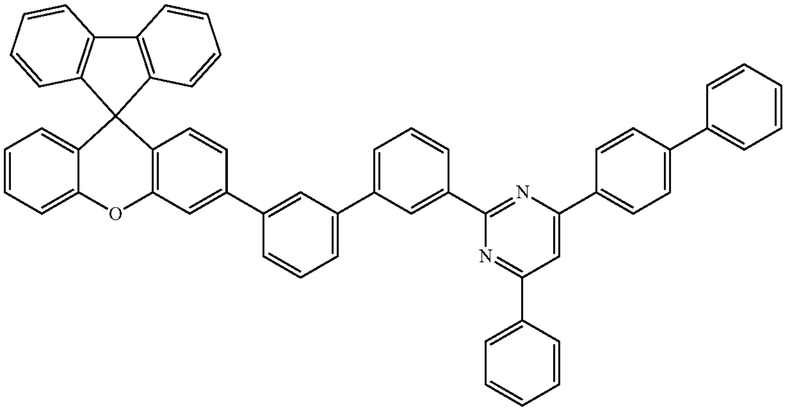 [SMILES: c1ccc(-c2ccc(-c3cc(-c4ccccc4)nc(-c4cccc(-c5cccc(-c6ccc7c(c6)Oc6ccccc6C76c7ccccc7-c7ccccc76)c5)c4)n3)cc2)cc1]
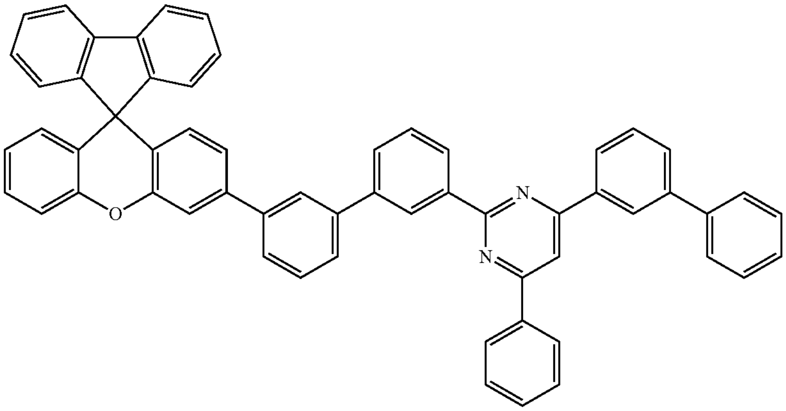 [SMILES: c1ccc(-c2cccc(-c3cc(-c4ccccc4)nc(-c4cccc(-c5cccc(-c6ccc7c(c6)Oc6ccccc6C76c7ccccc7-c7ccccc76)c5)c4)n3)c2)cc1]
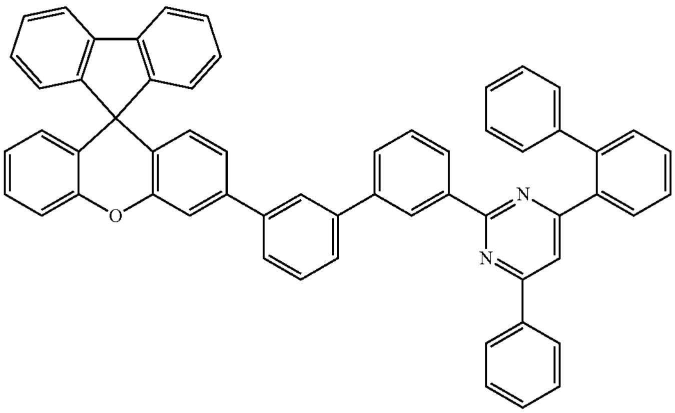
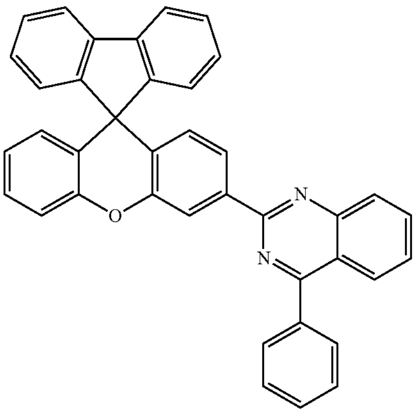

-continued
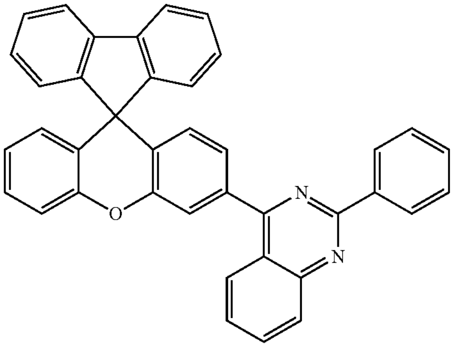
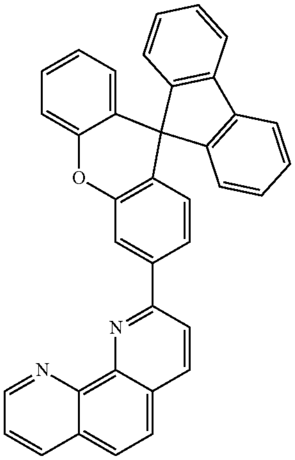
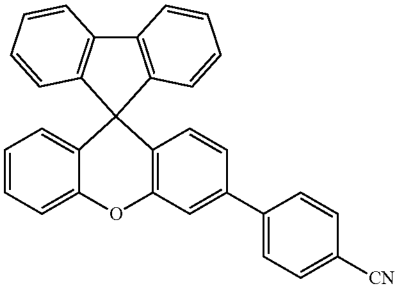
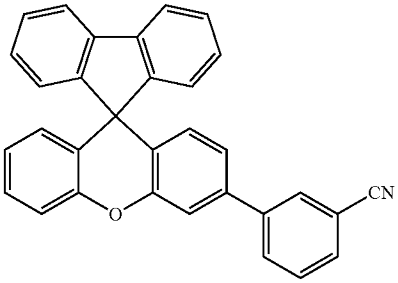
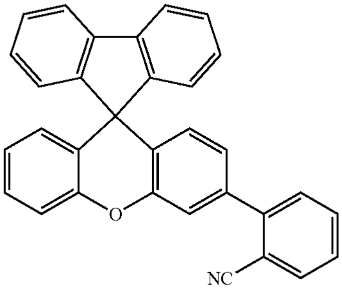
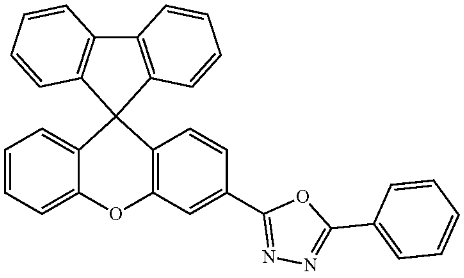
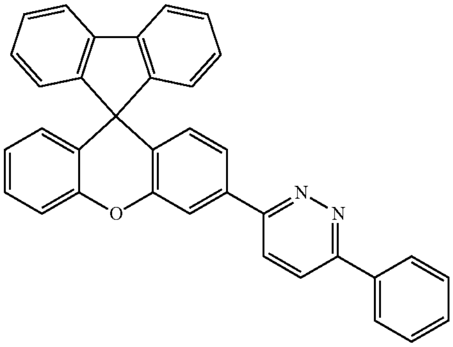
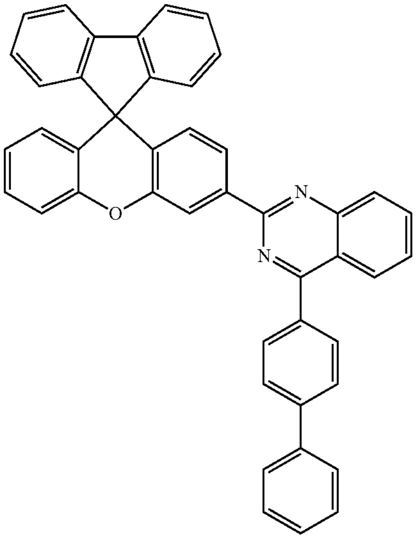
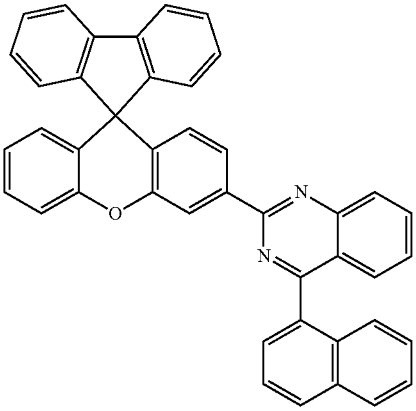

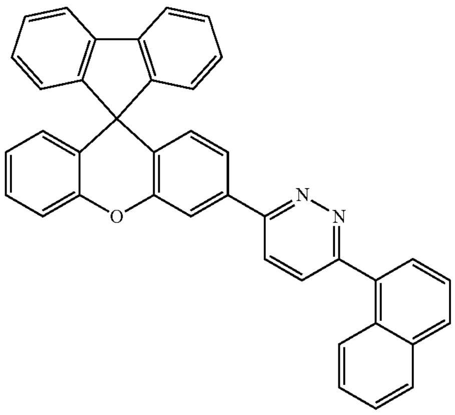
-continued
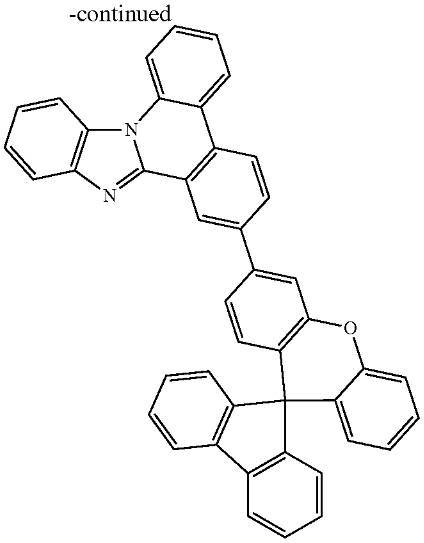
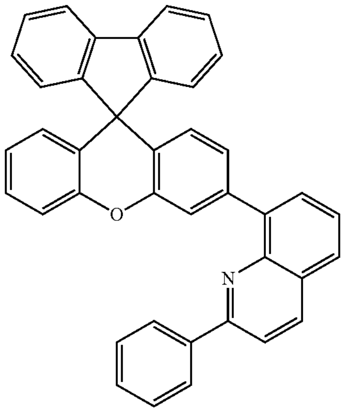
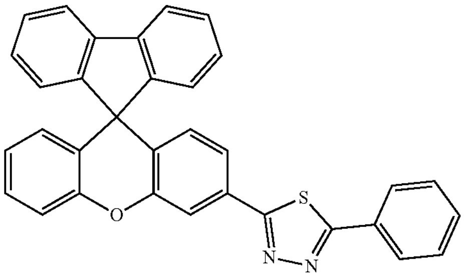
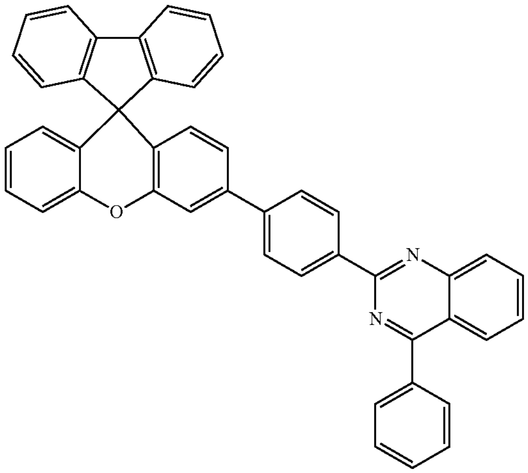
-continued
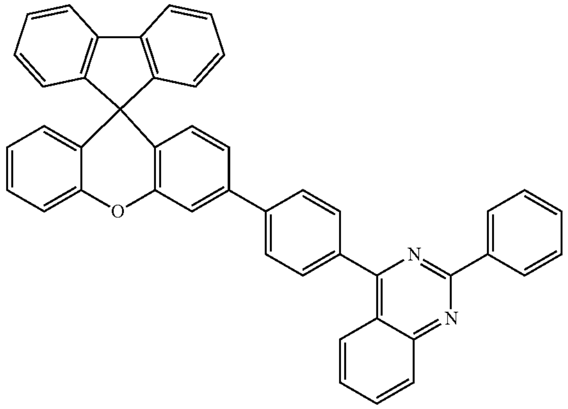

-continued
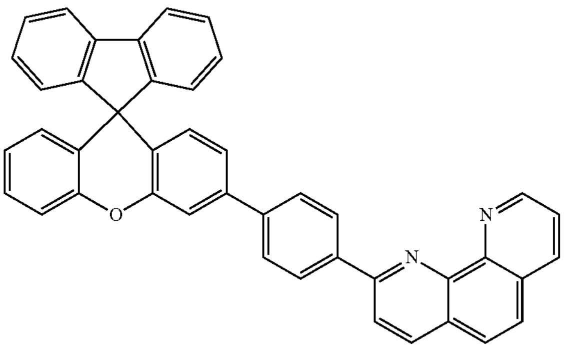
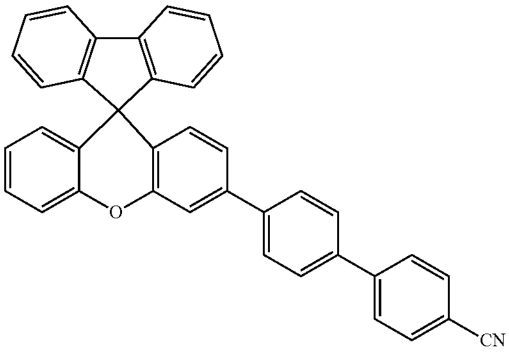
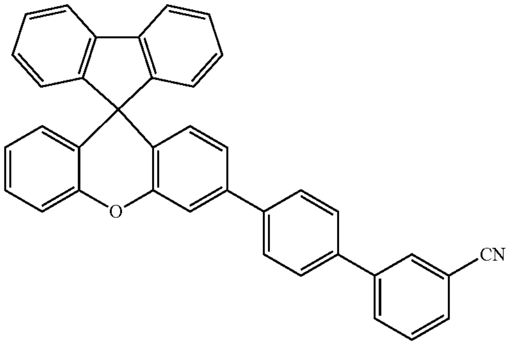
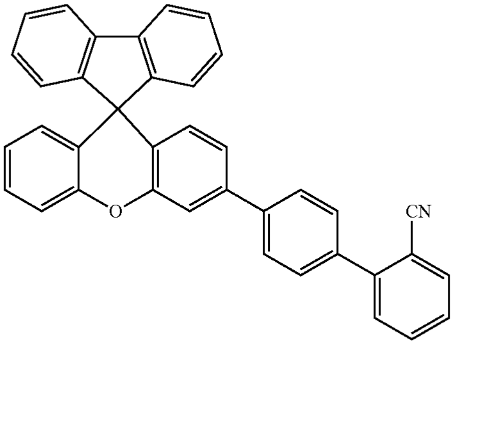
-continued
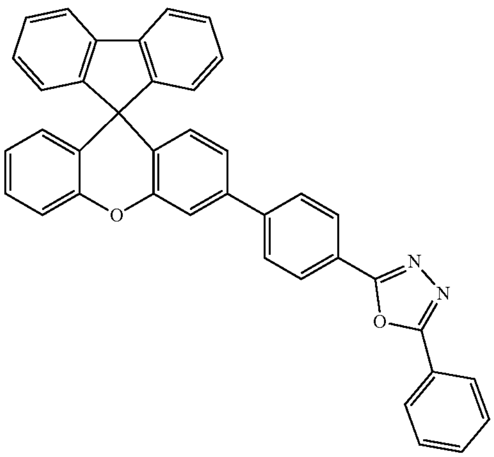
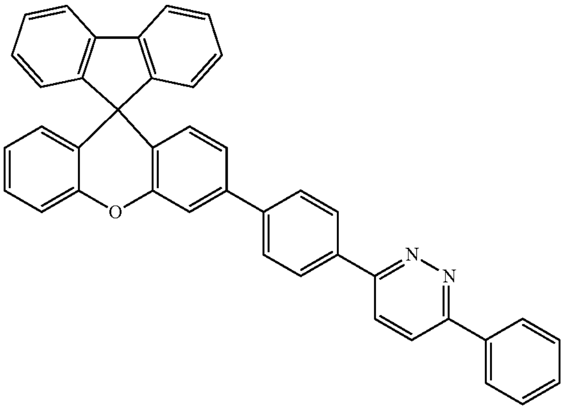
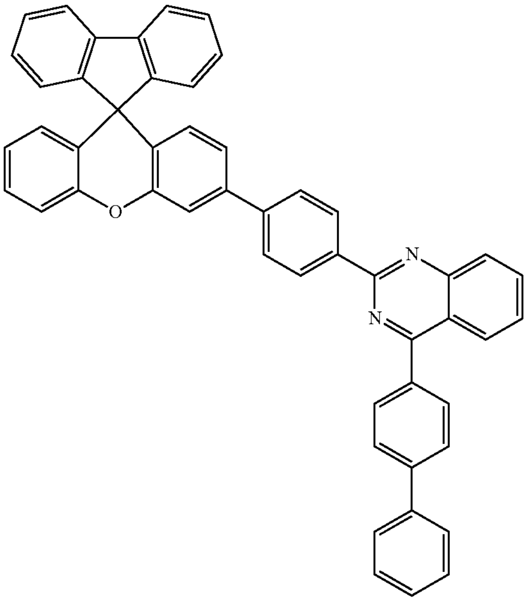

-continued
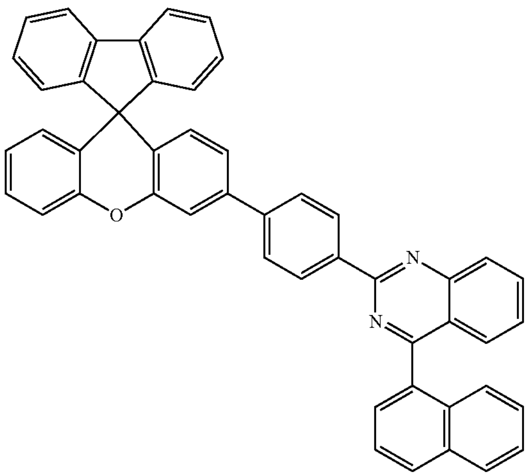
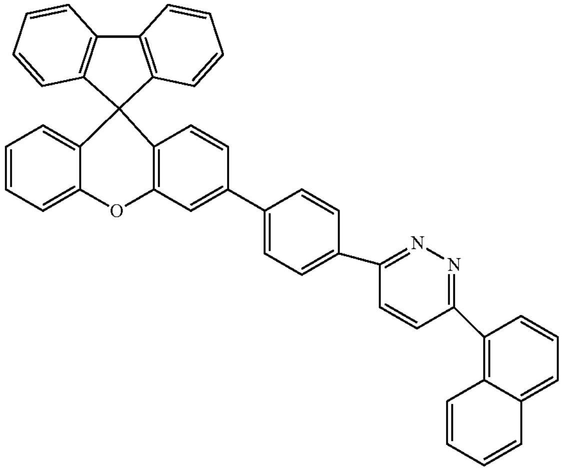
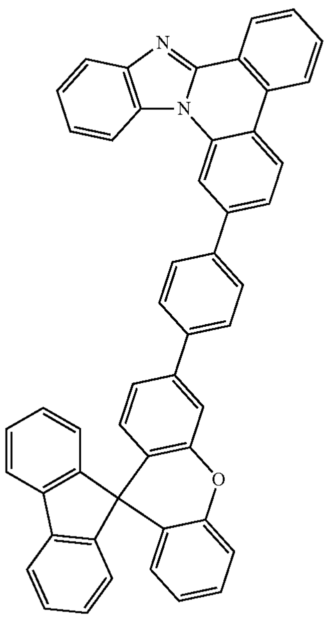
-continued
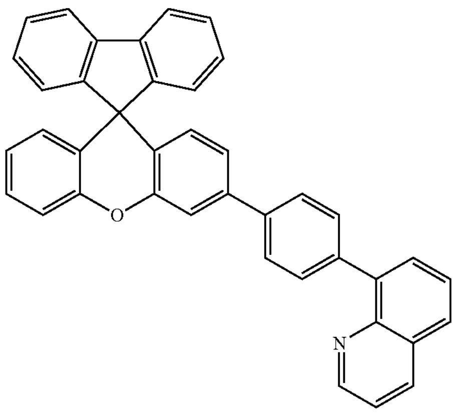
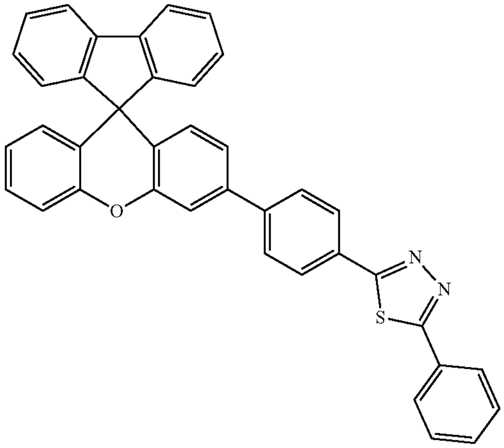
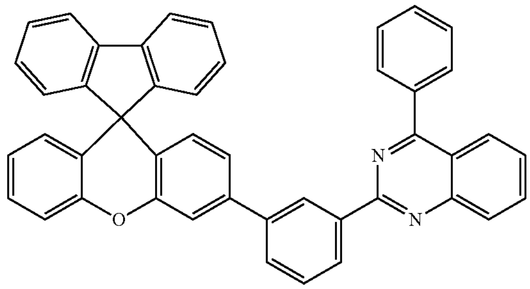
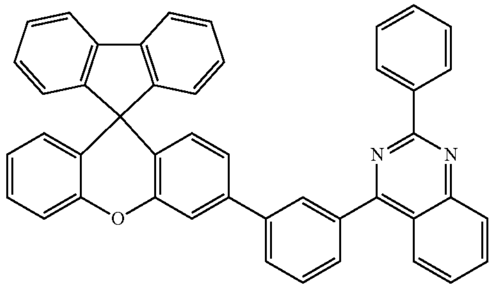

-continued
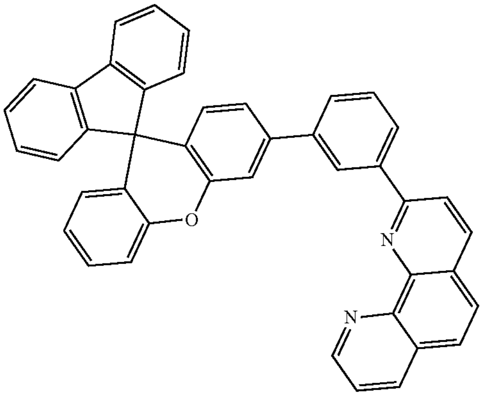
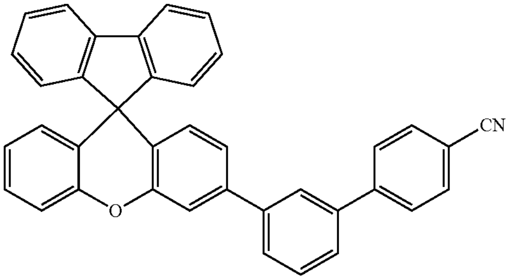
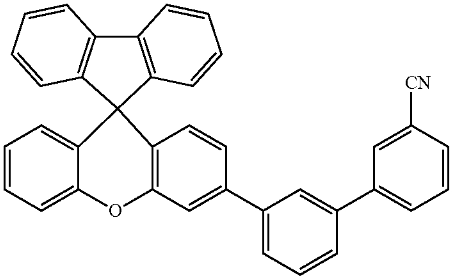
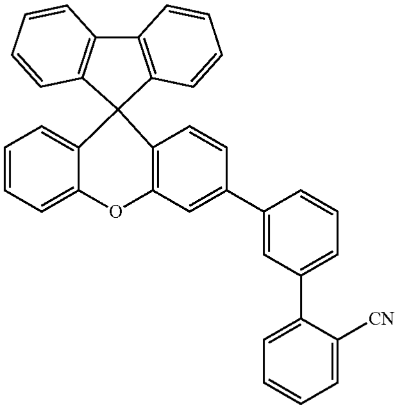
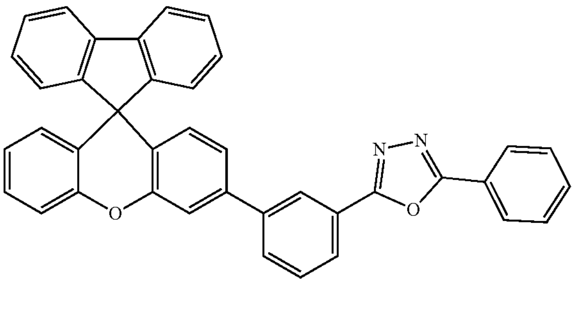
-continued
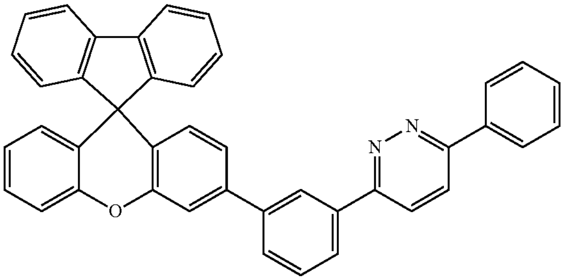
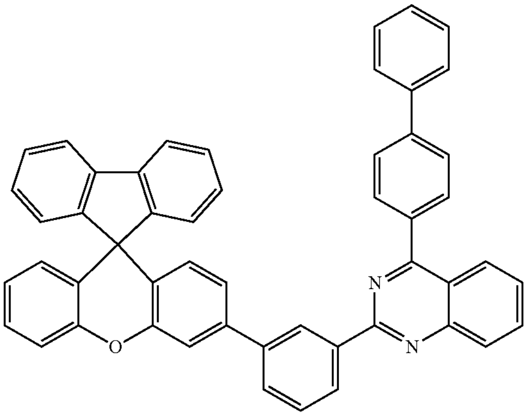
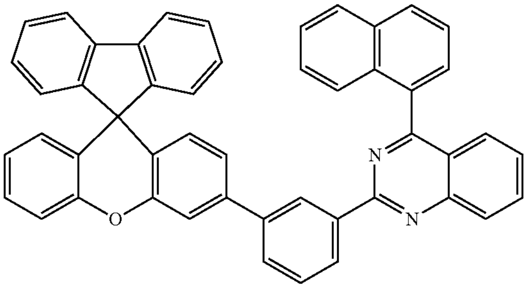
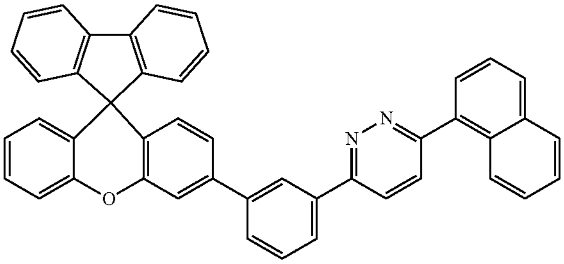
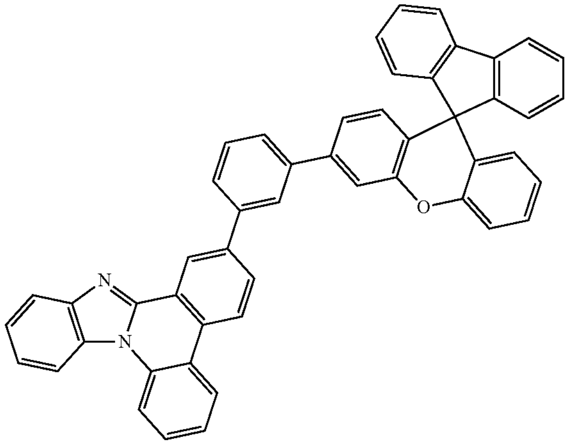

-continued
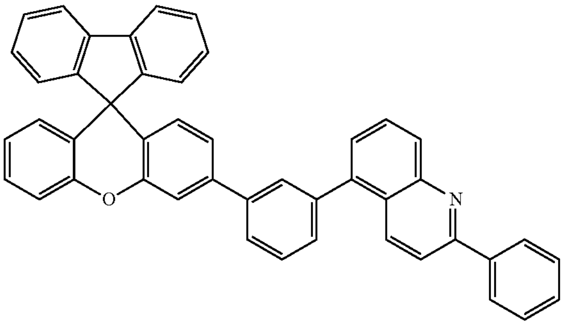
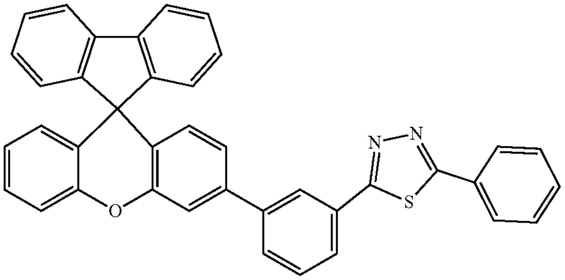
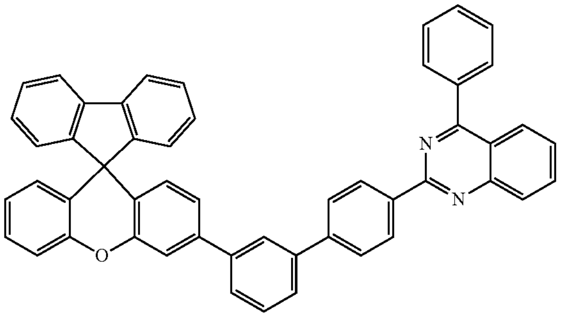
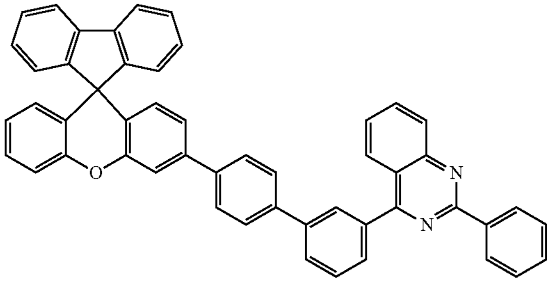
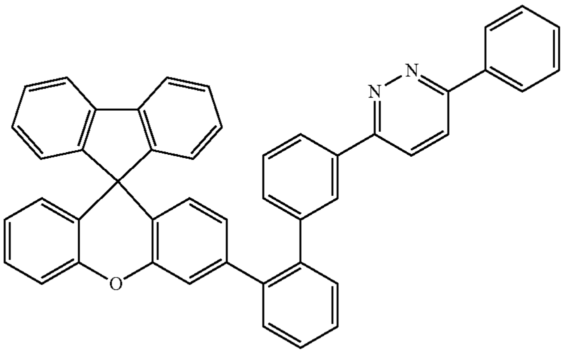
-continued
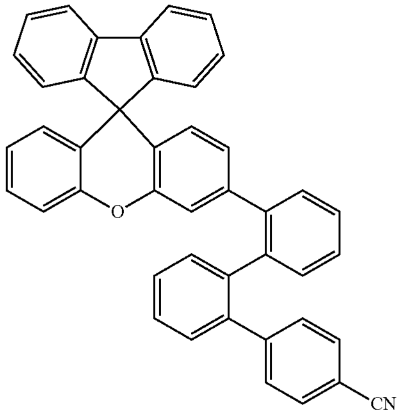
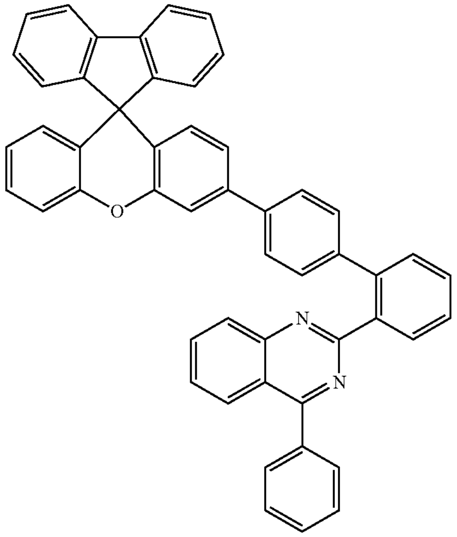
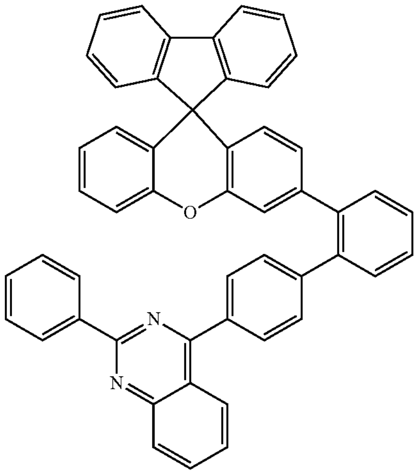
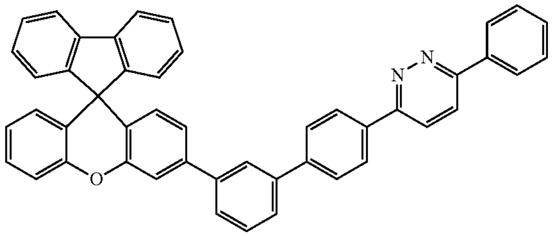

-continued
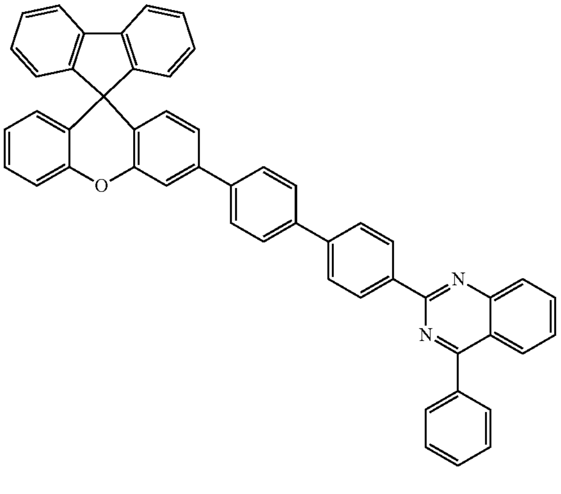
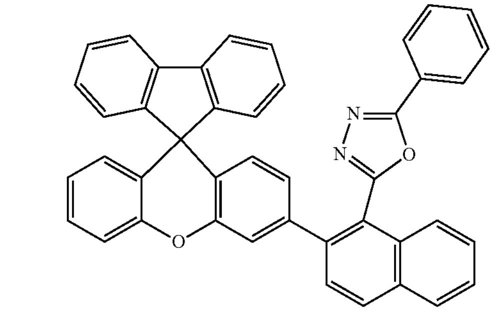
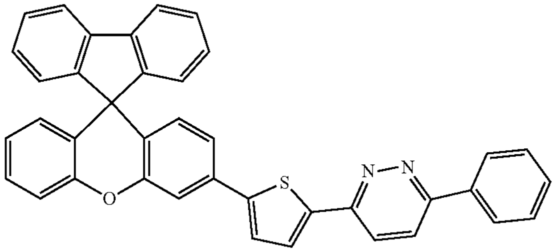
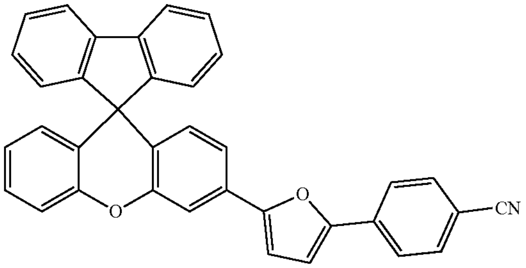
-continued
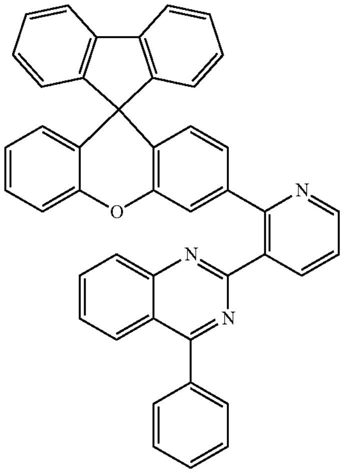
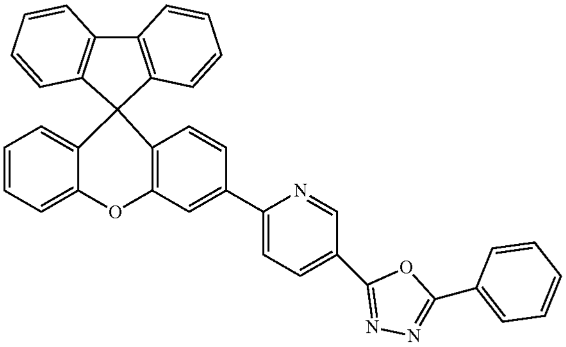
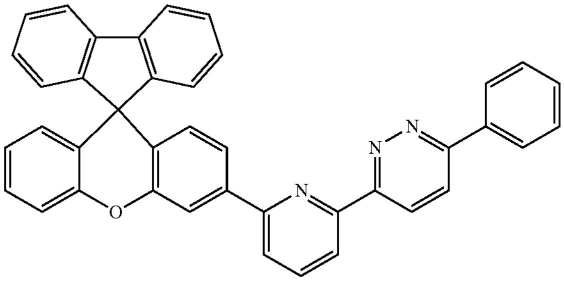
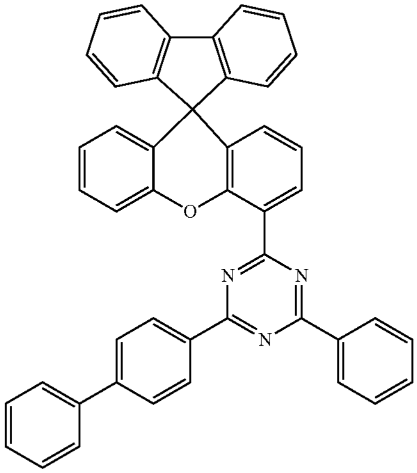

-continued
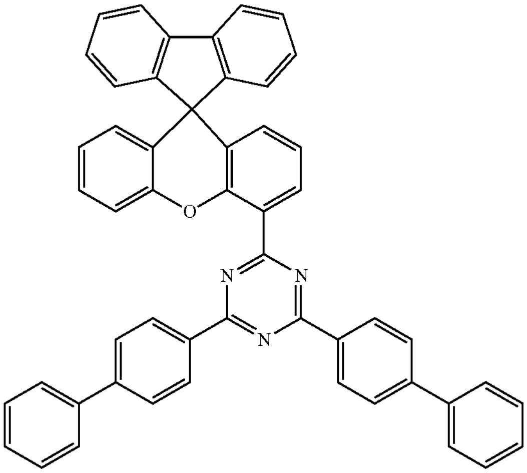
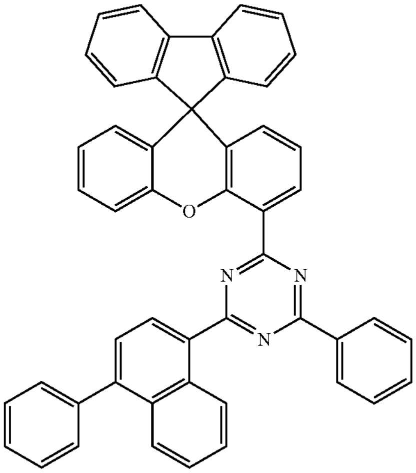
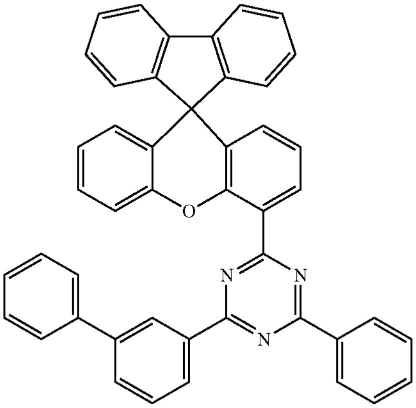
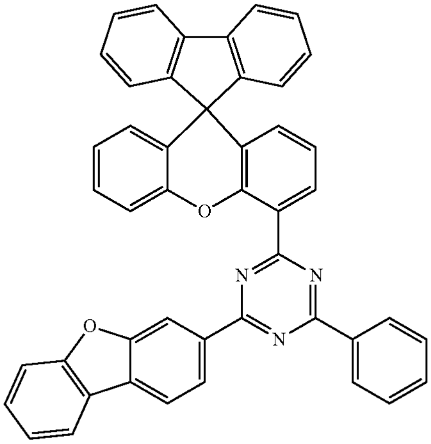
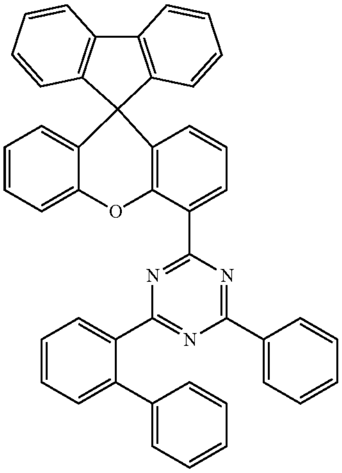
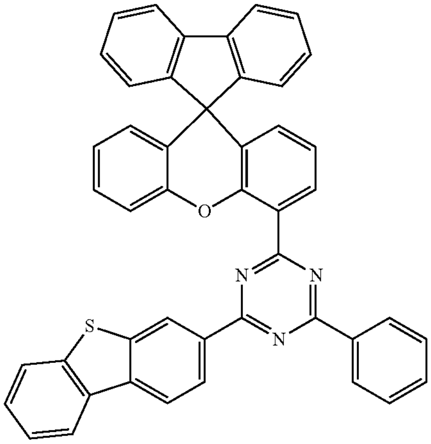
-continued -continued
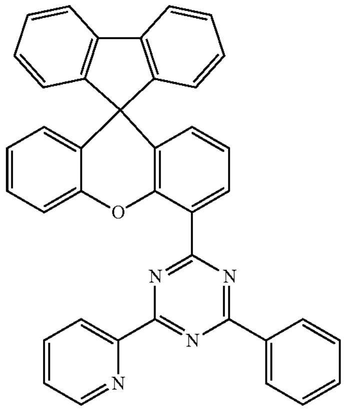
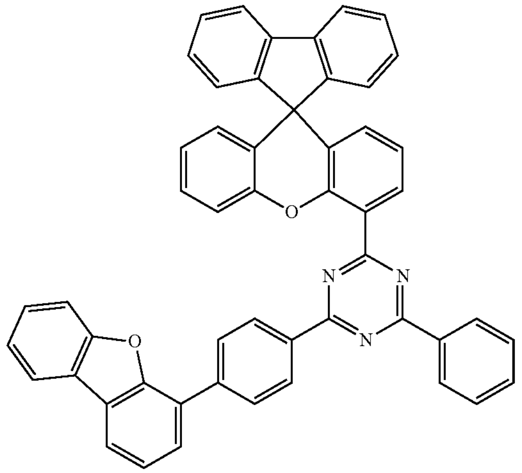
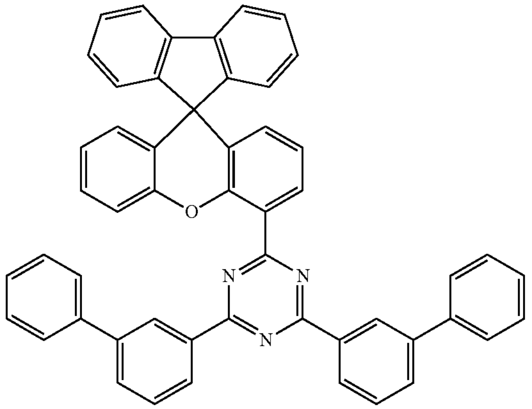
-continued
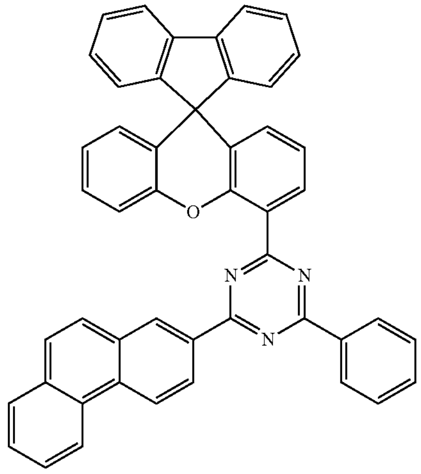
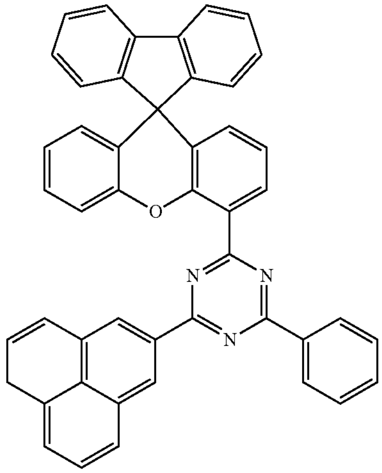
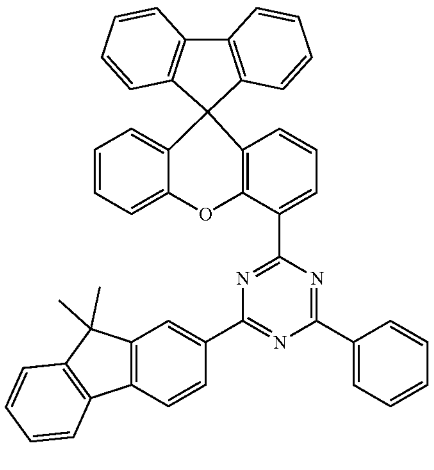

-continued
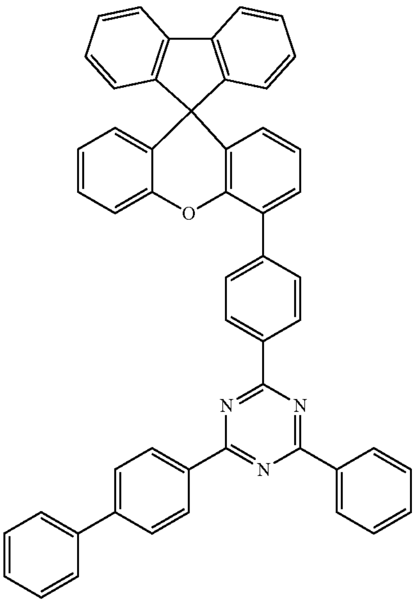
-continued
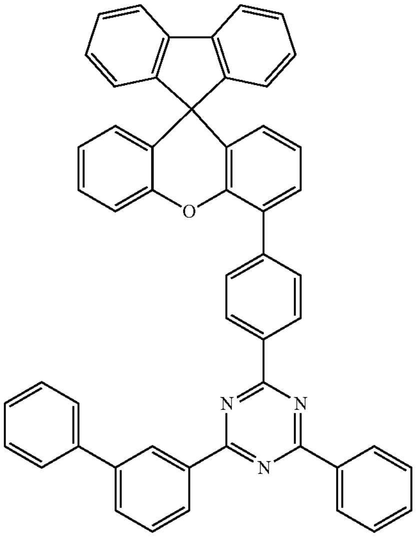
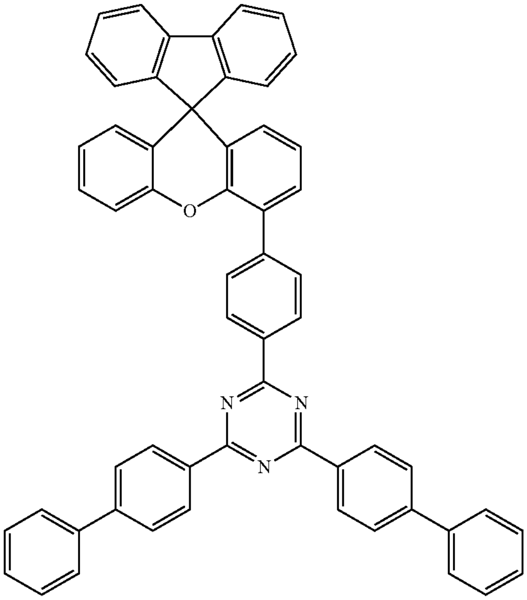
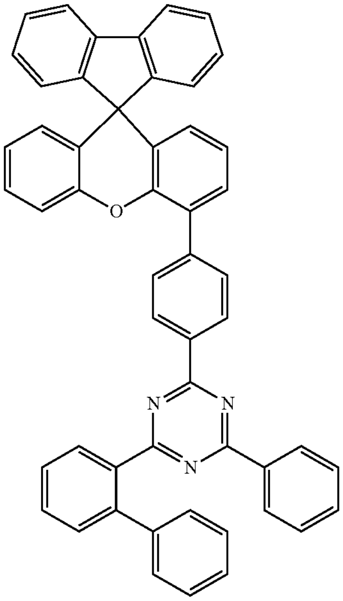

-continued
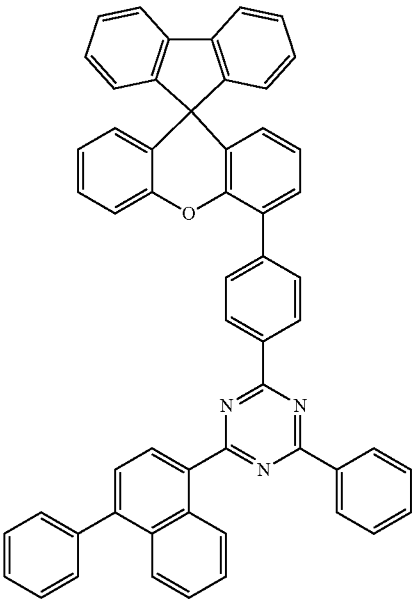
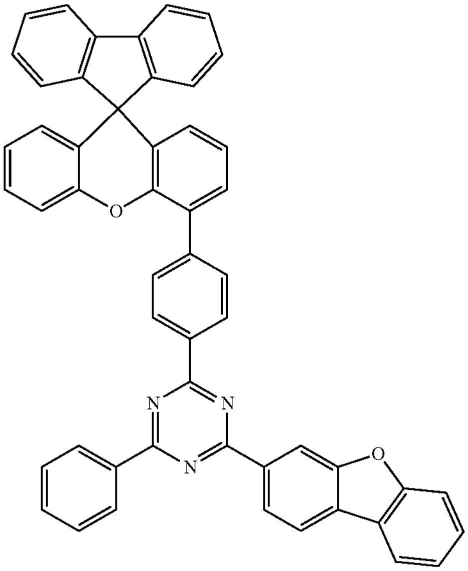
-continued
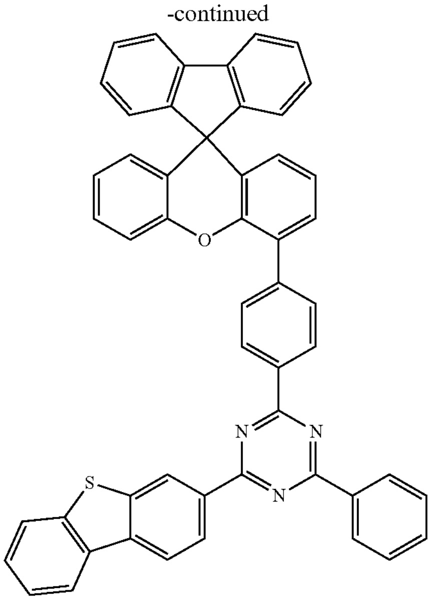
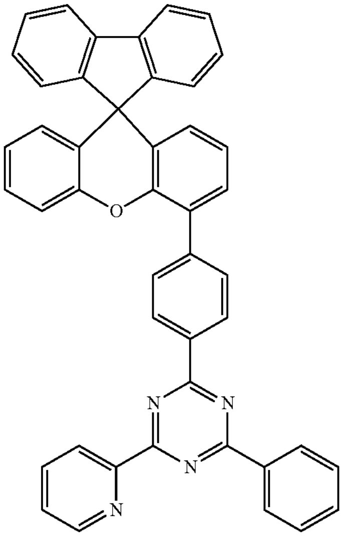
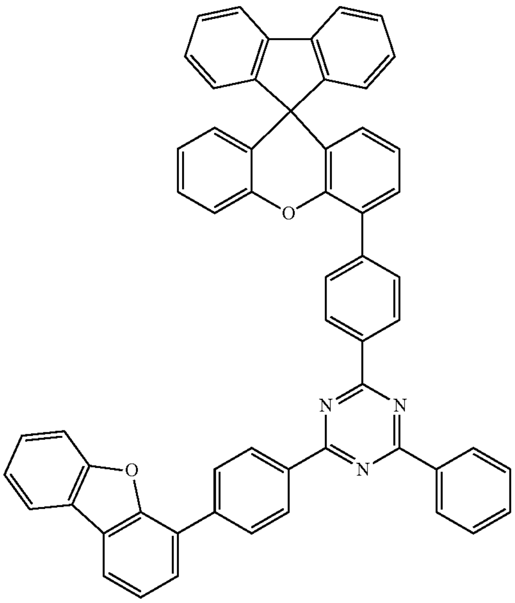

-continued
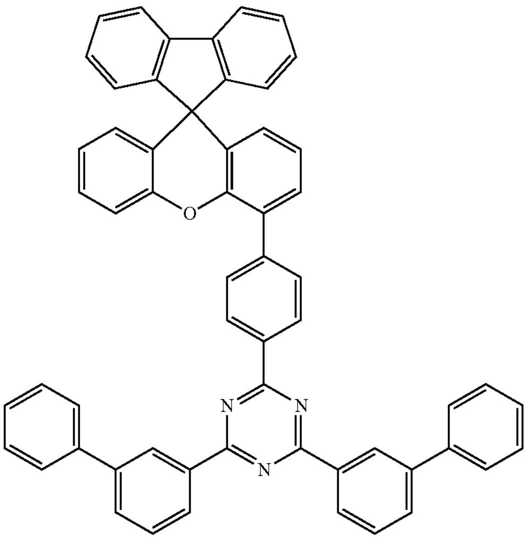
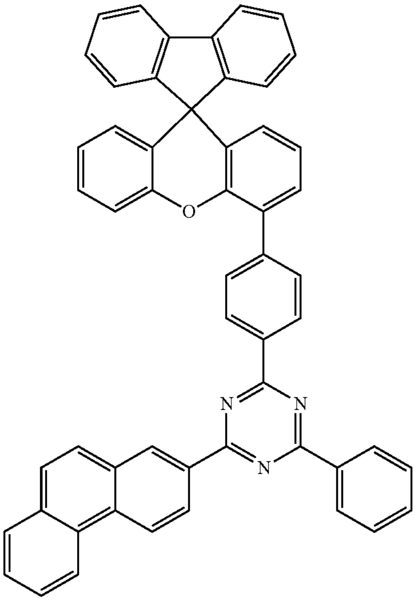
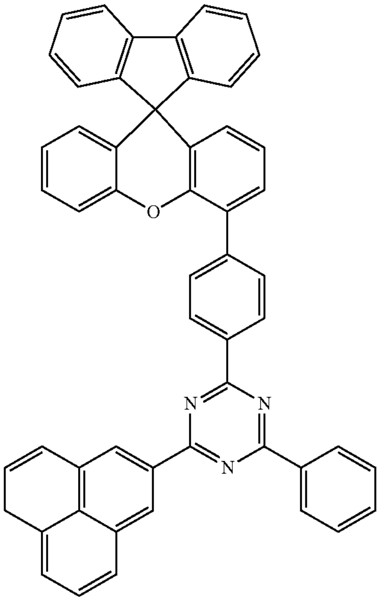
-continued
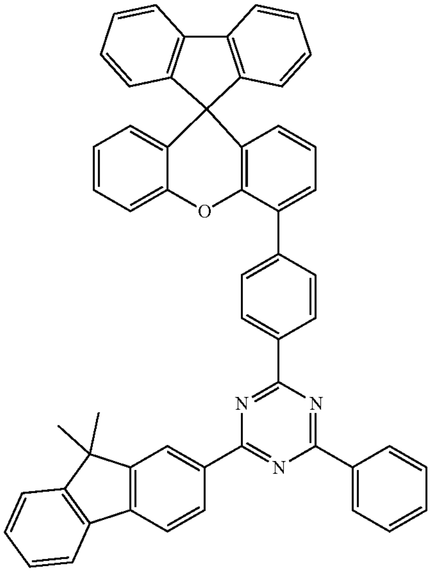
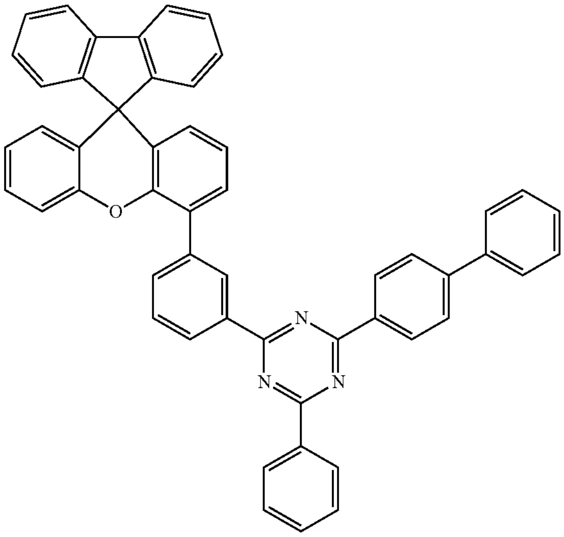

-continued
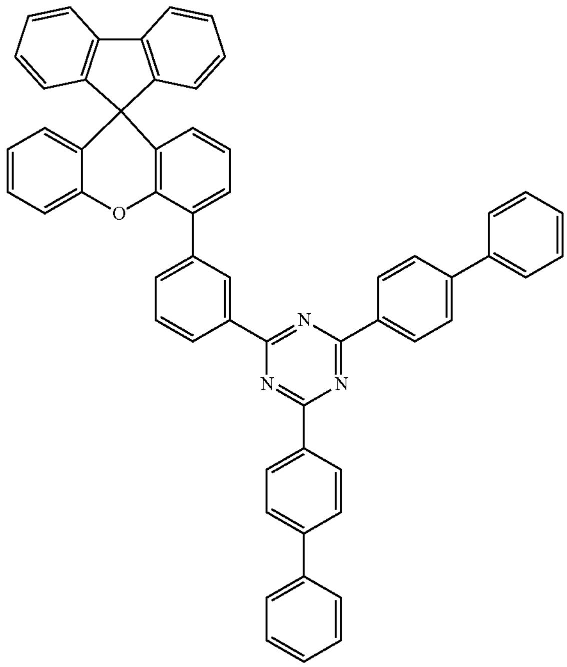
-continued
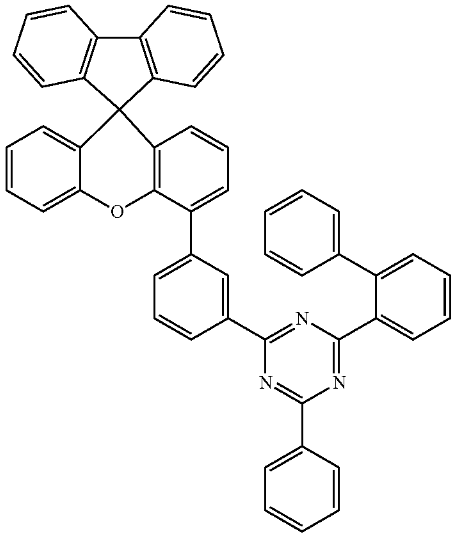
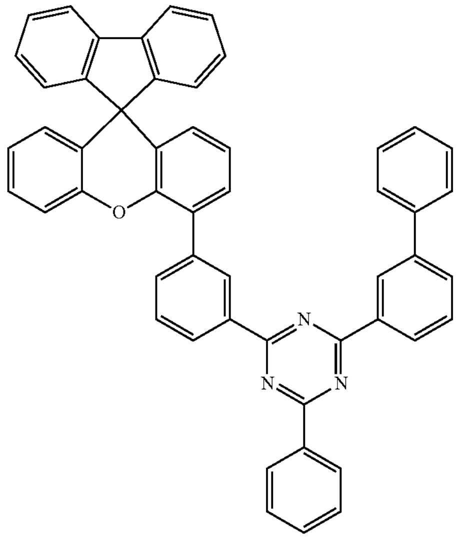
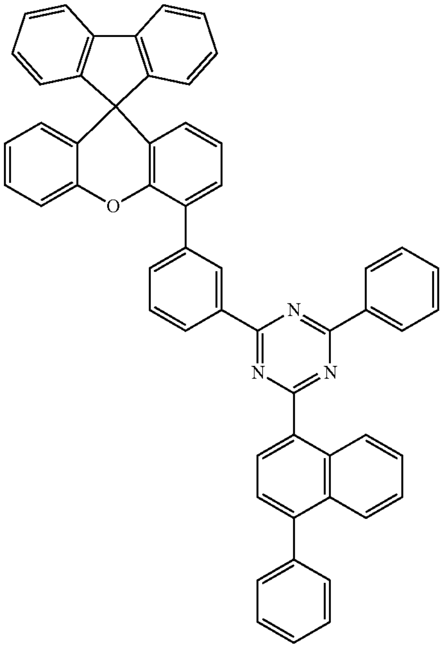

-continued
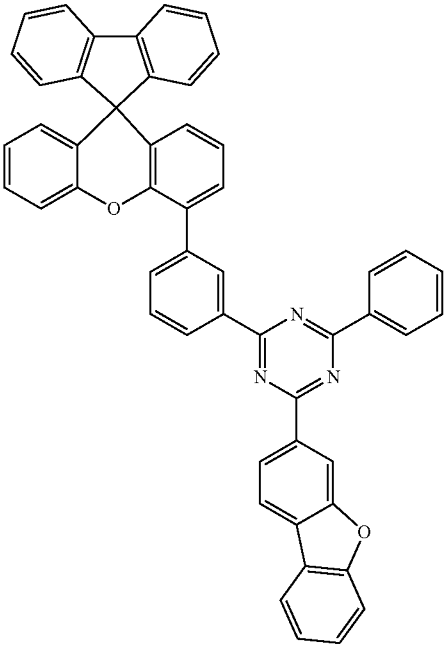
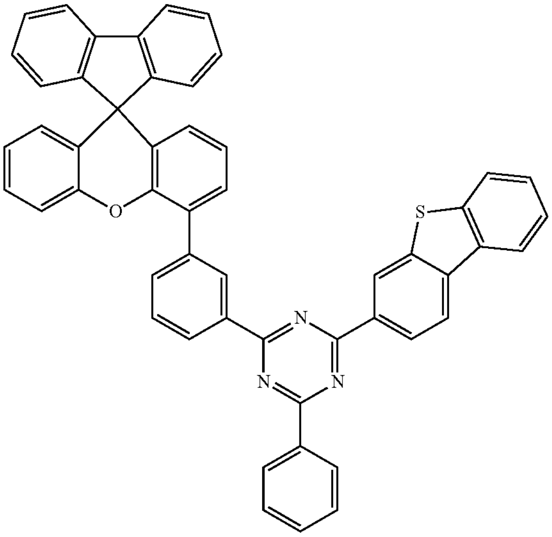
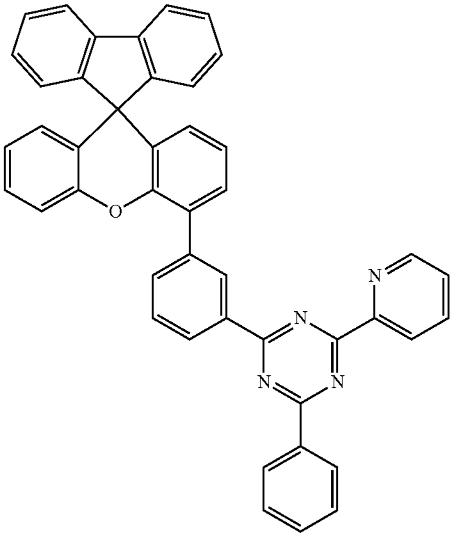
-continued
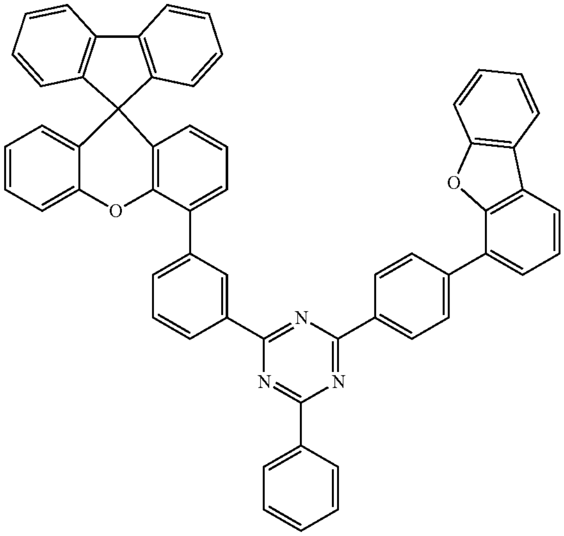
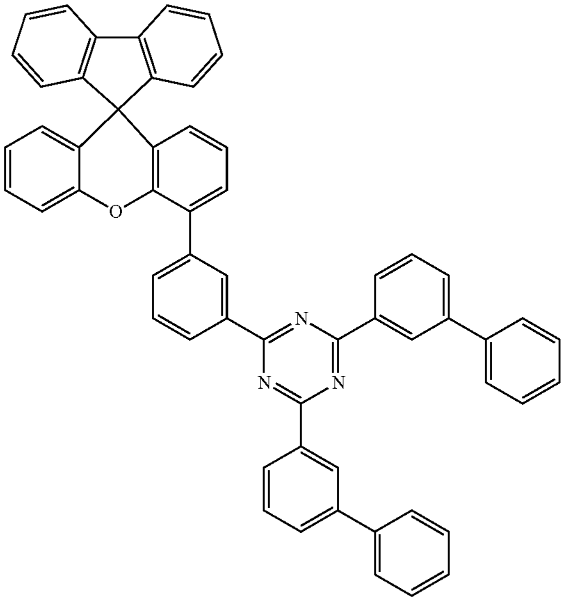
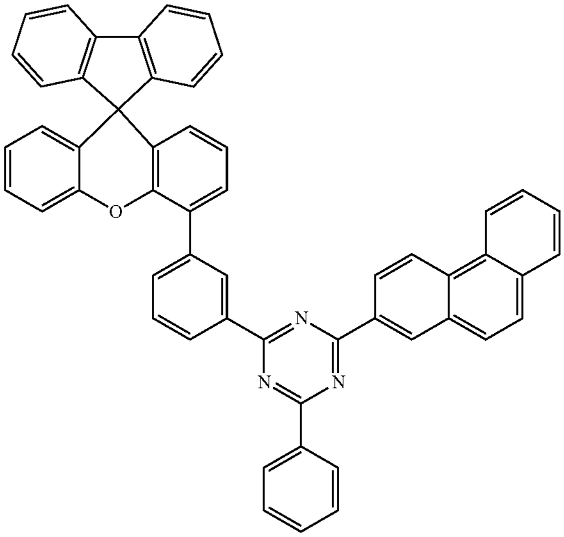

-continued
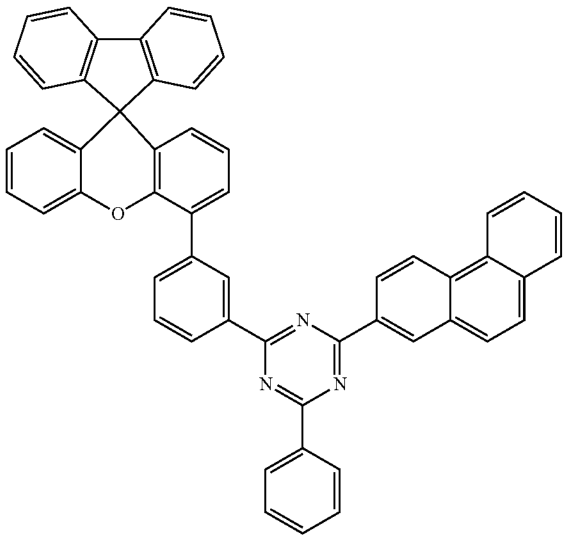
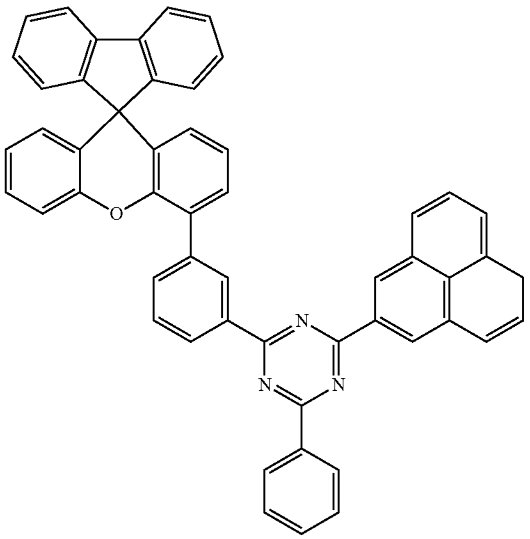
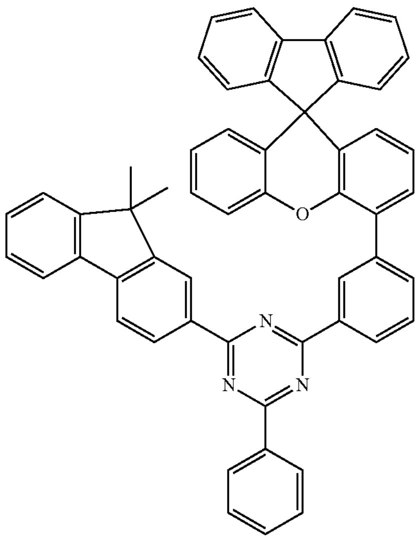
-continued
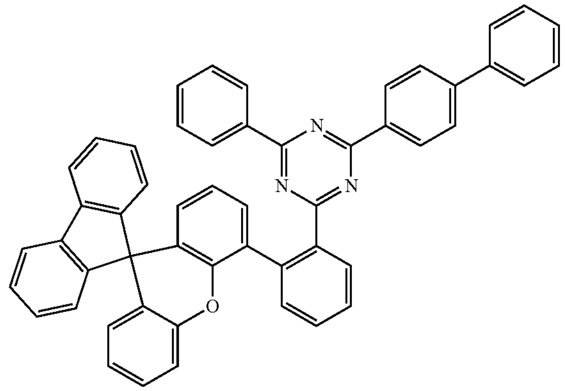
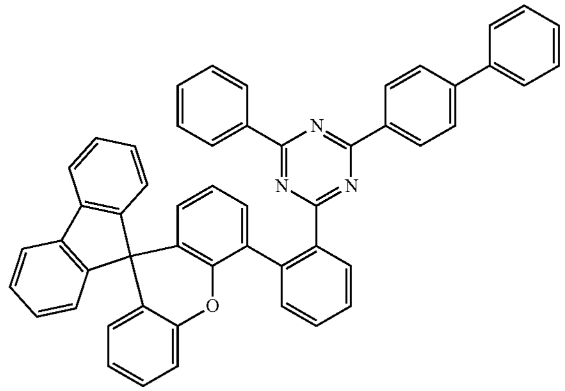
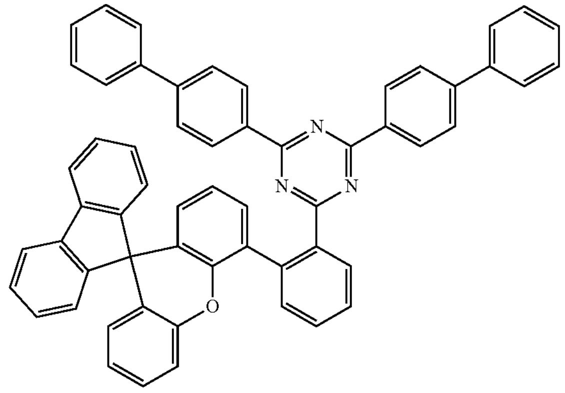
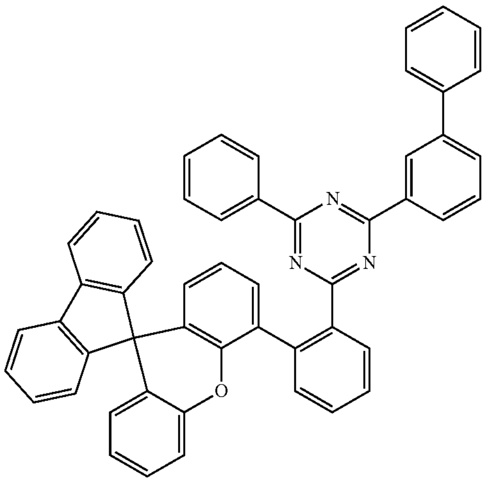

-continued
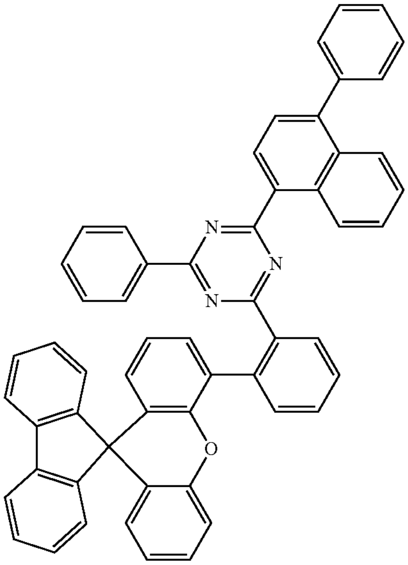
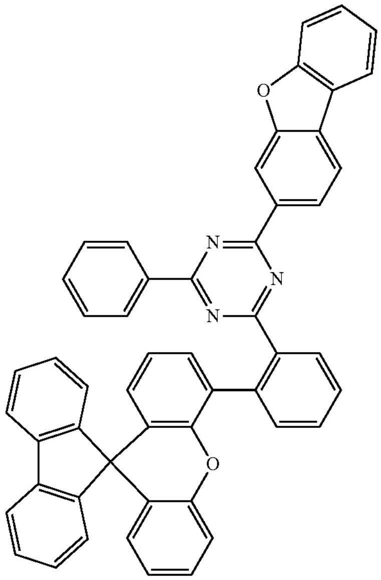
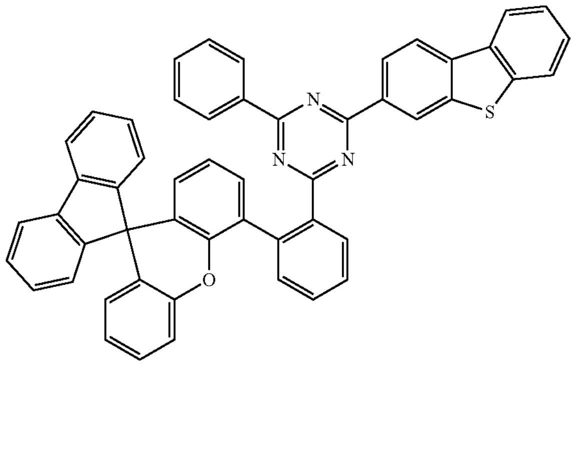
-continued
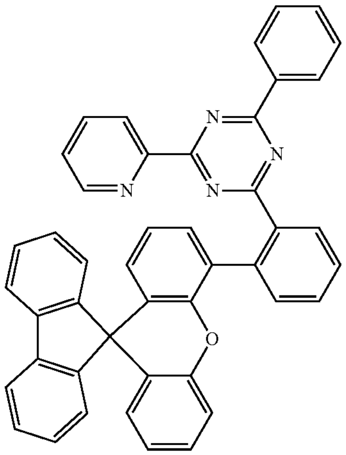
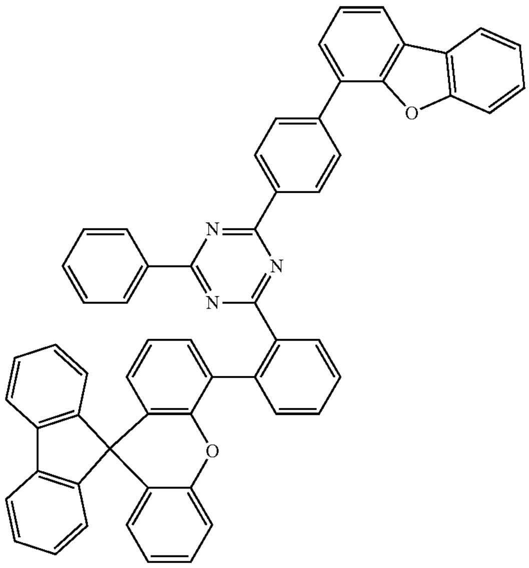
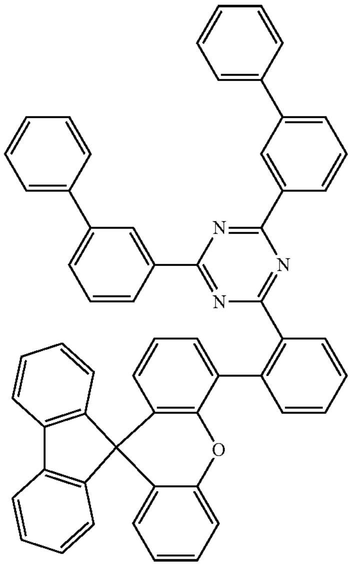

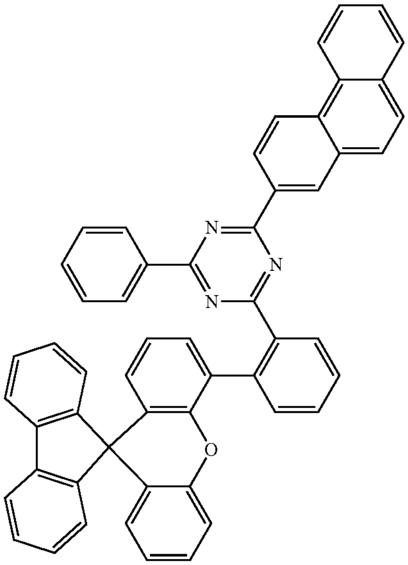
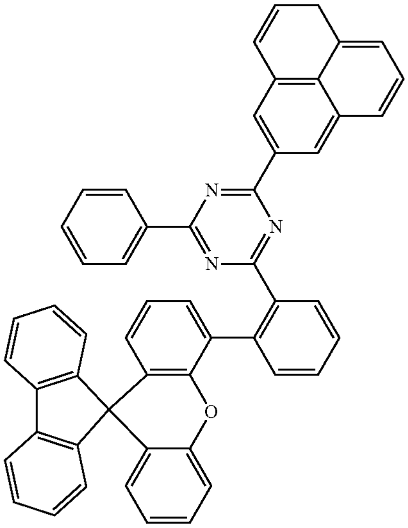
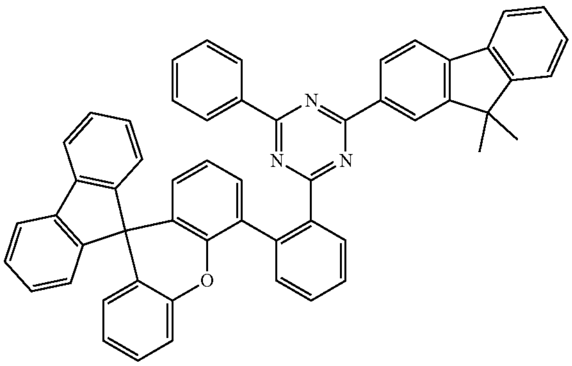
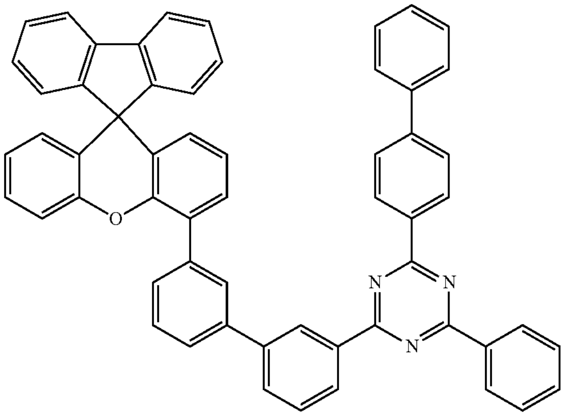
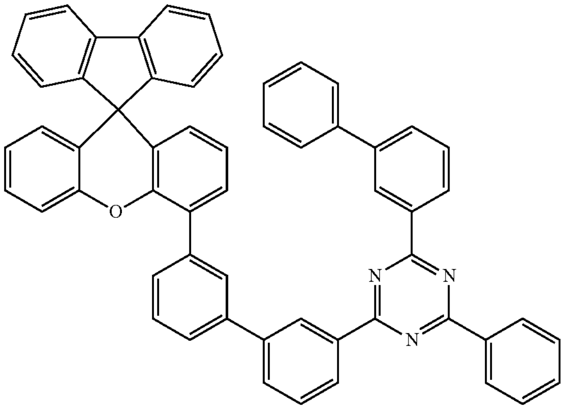
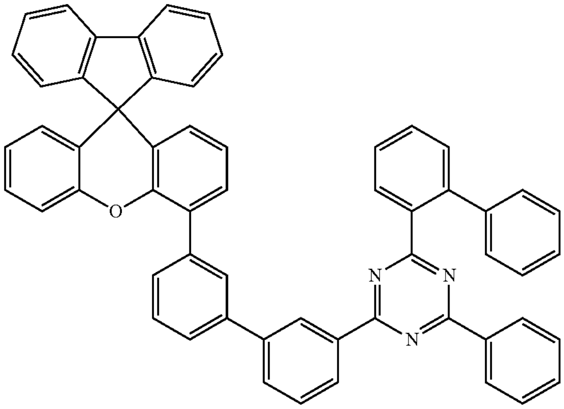

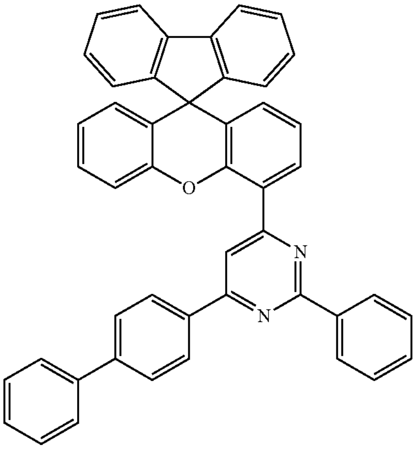
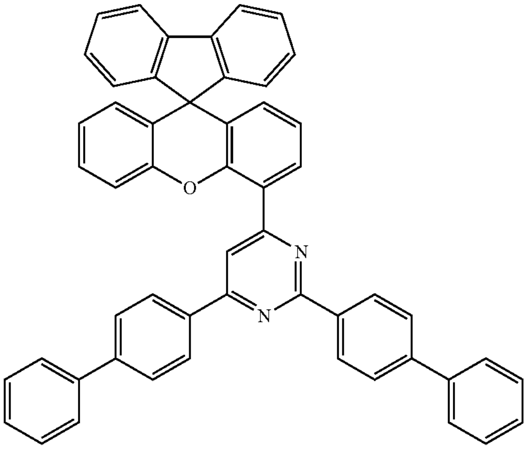
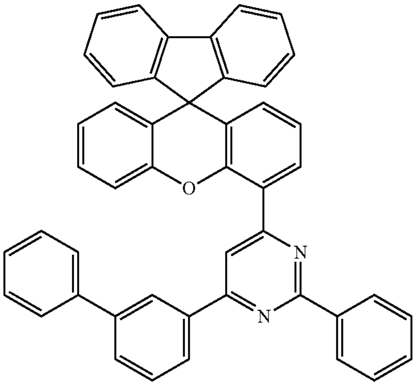
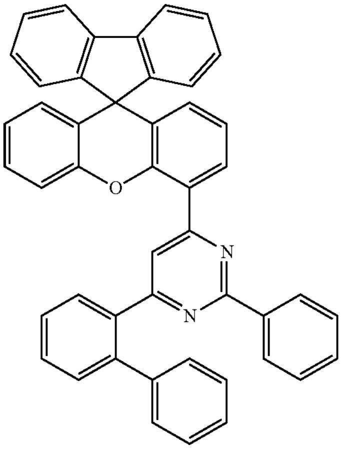
-continued
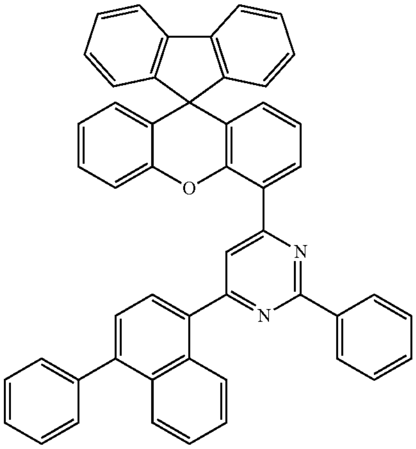
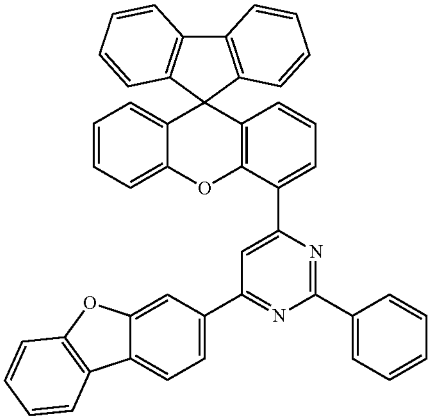
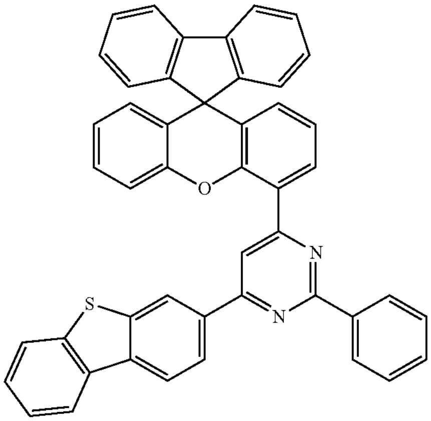
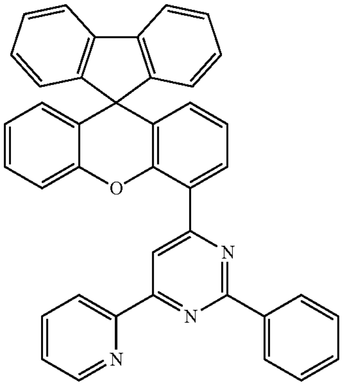

-continued
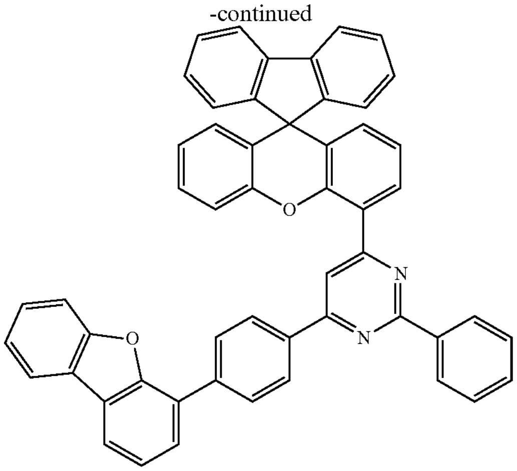
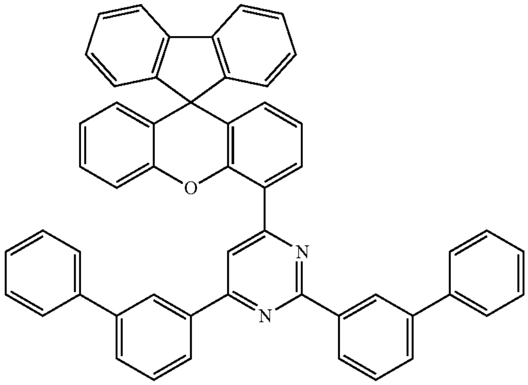
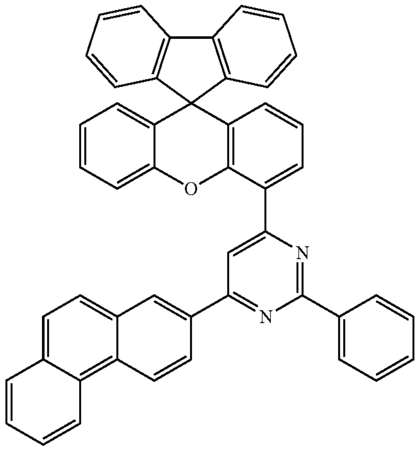
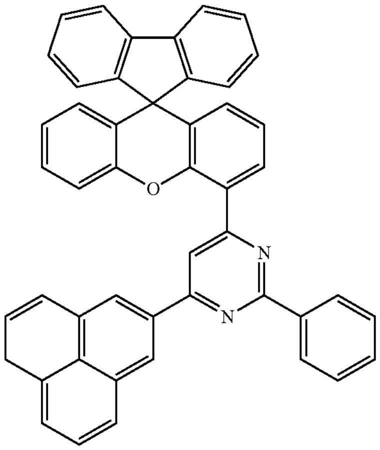
-continued
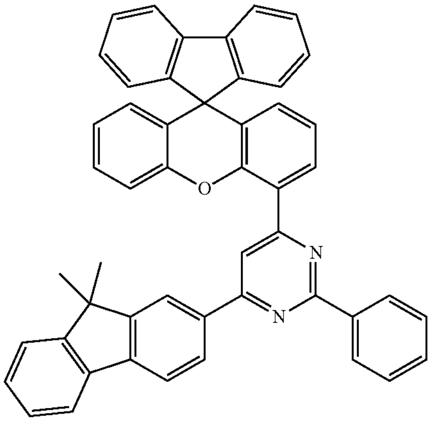
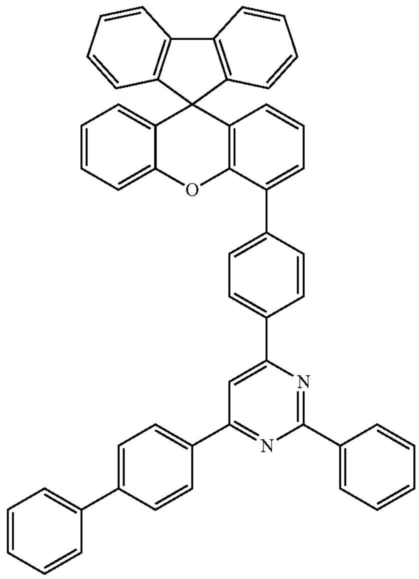
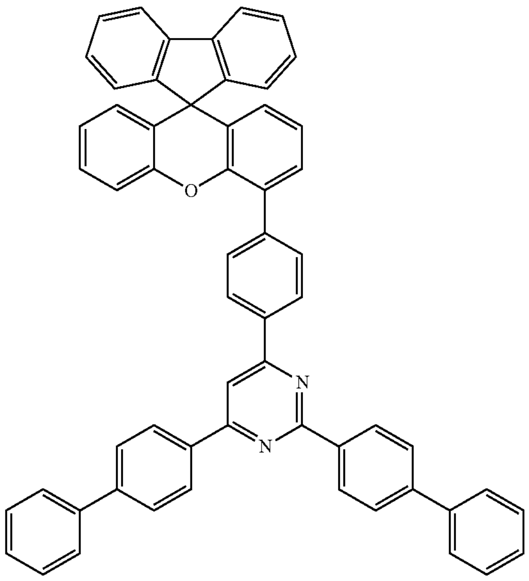

-continued
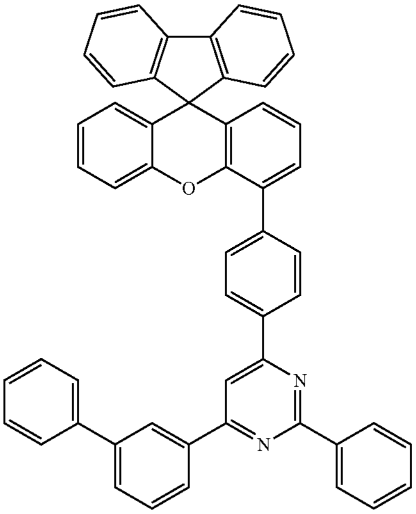
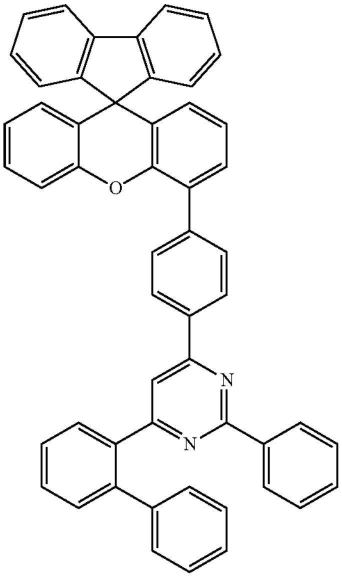
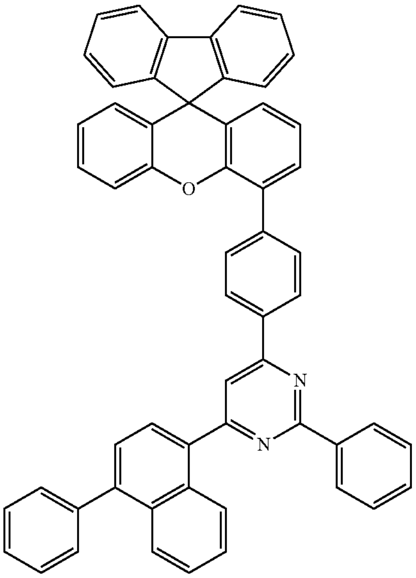
-continued
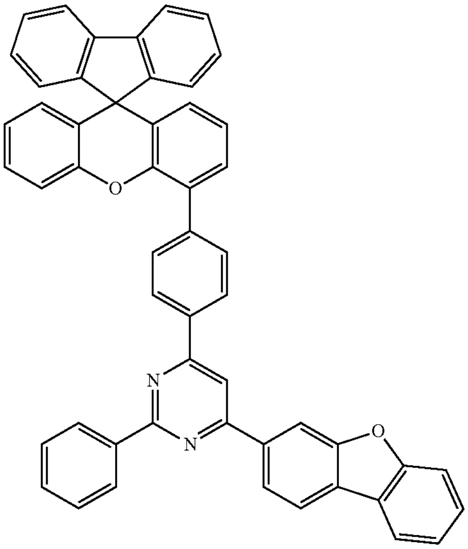
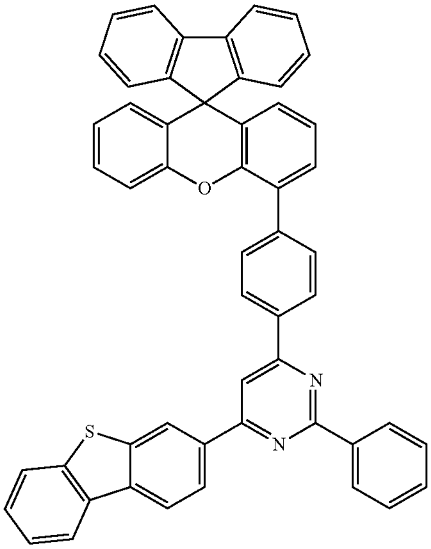
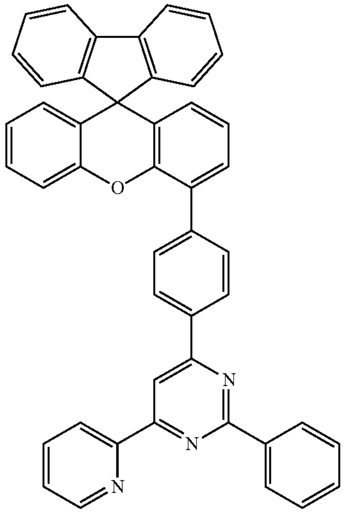

-continued
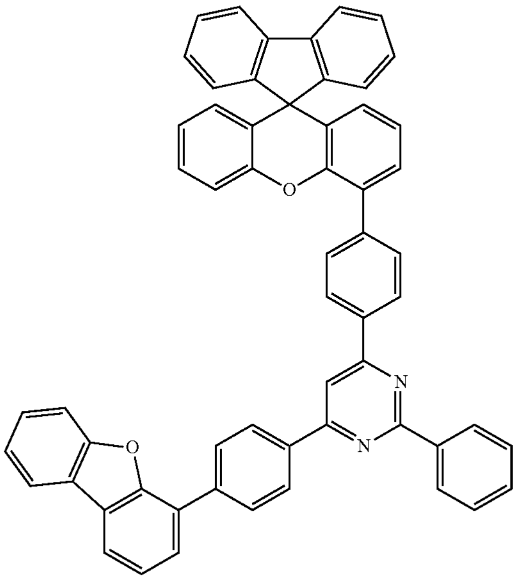
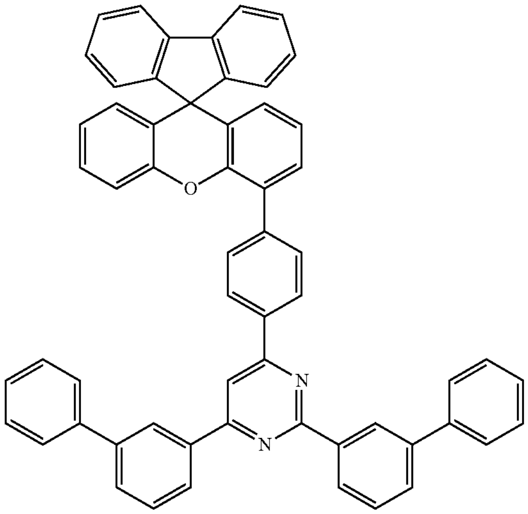
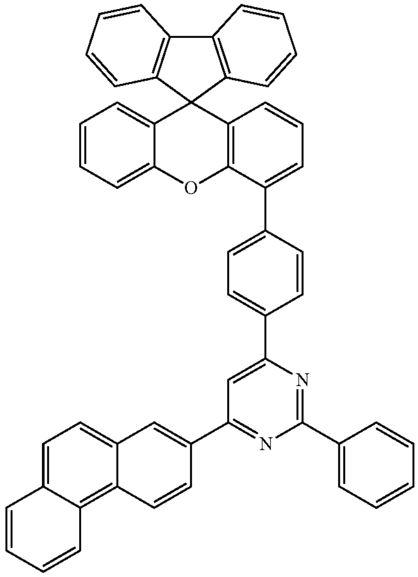
-continued
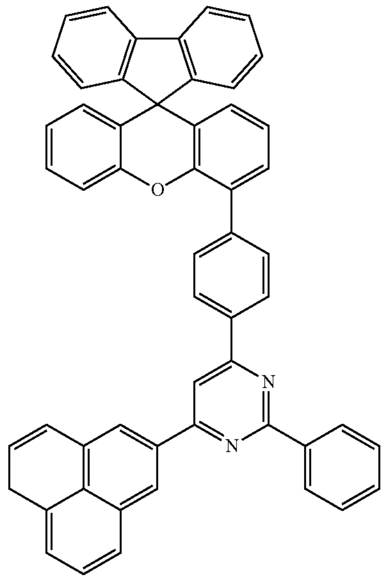
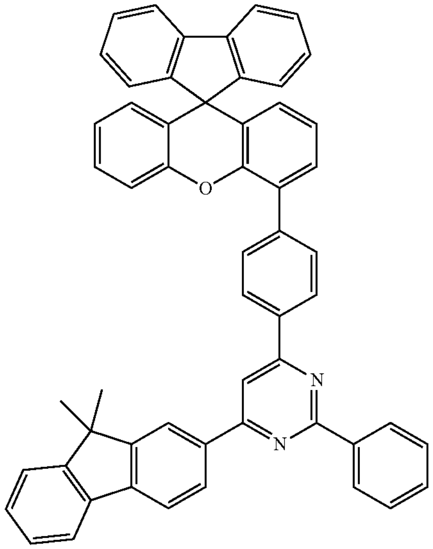
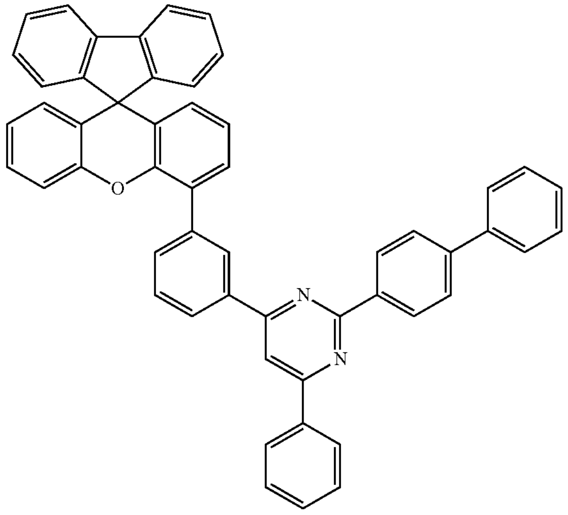

-continued
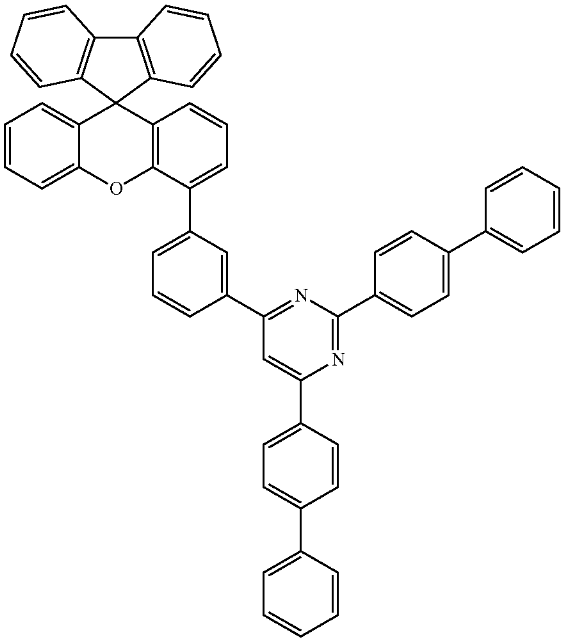
-continued
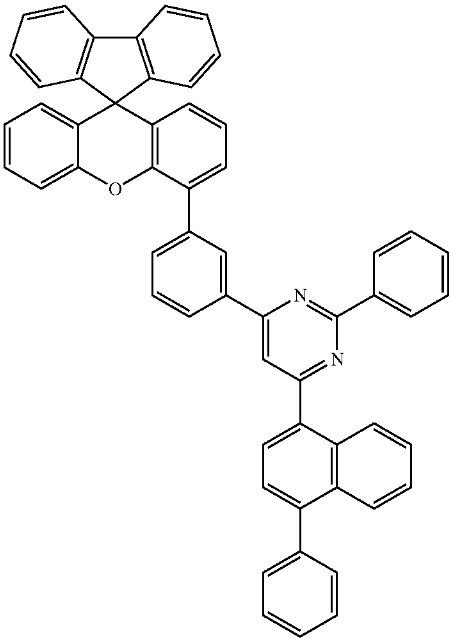 [SMILES: c1ccc(-c2nc(-c3cccc(-c4cccc5c4Oc4ccccc4C54c5ccccc5-c5ccccc54)c3)cc(-c3ccc(-c4ccccc4)c4ccccc34)n2)cc1]
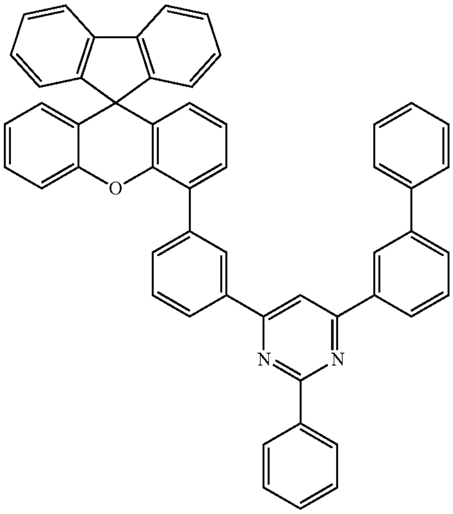
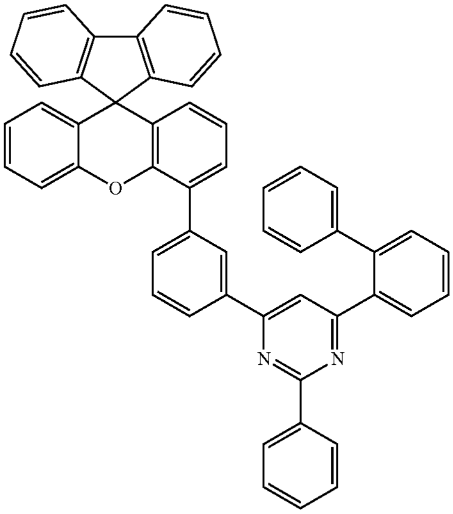
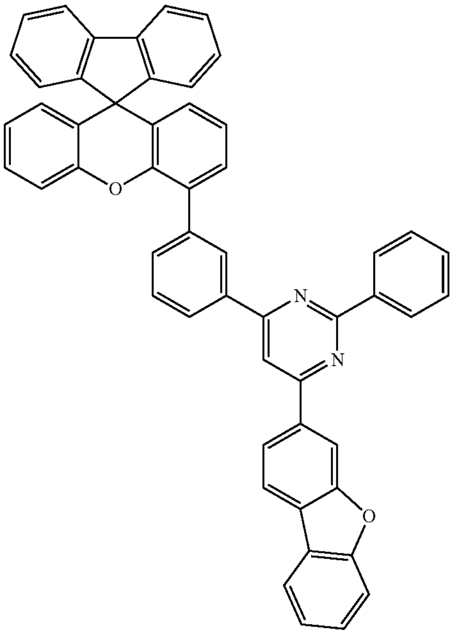

-continued
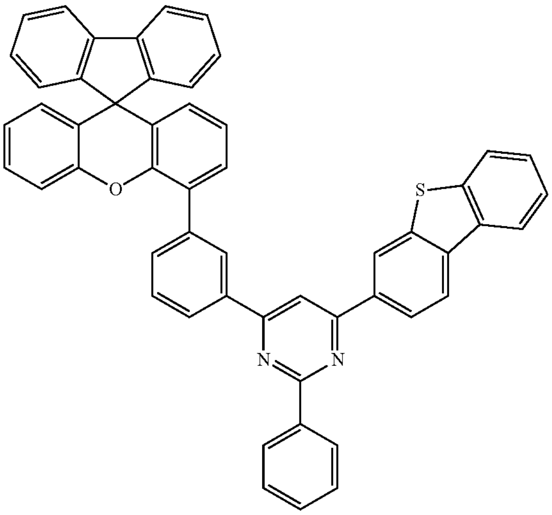
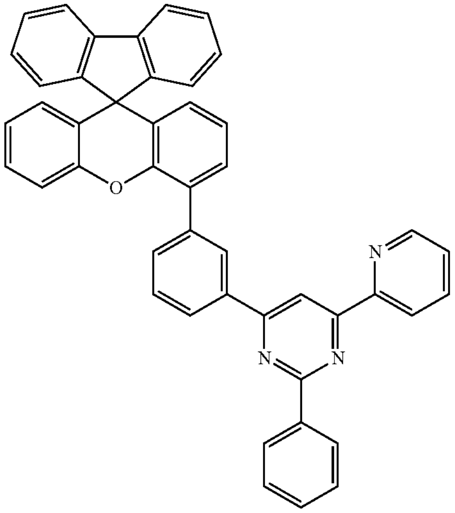
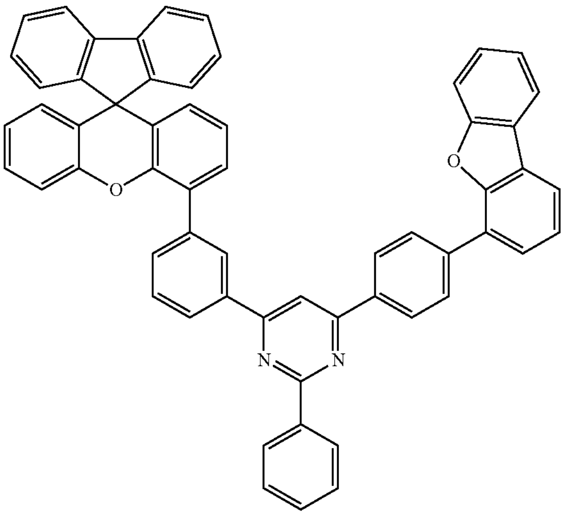
-continued
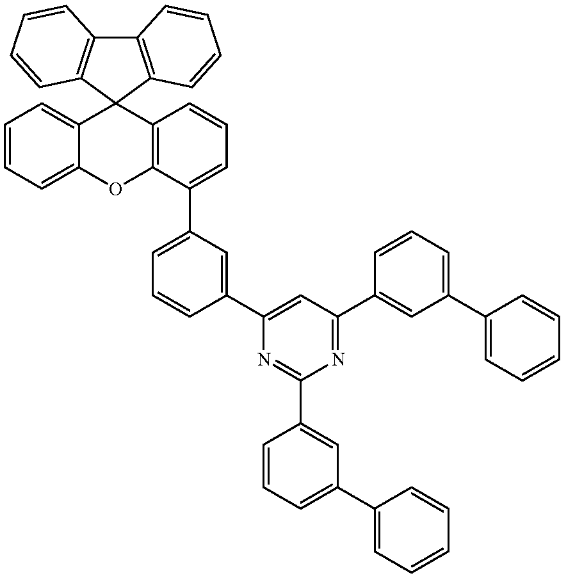
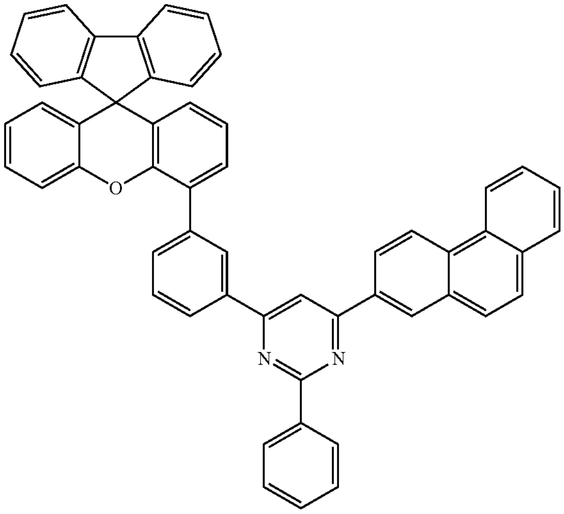
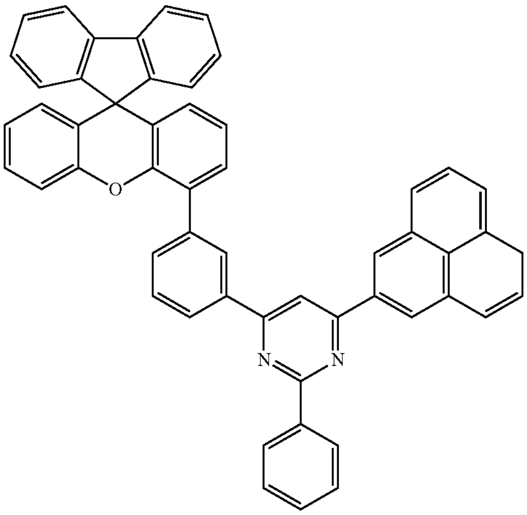

-continued
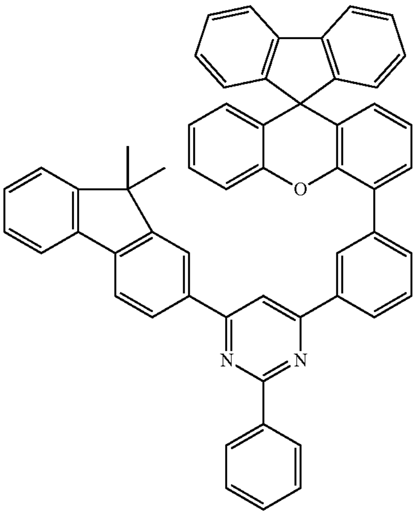
-continued
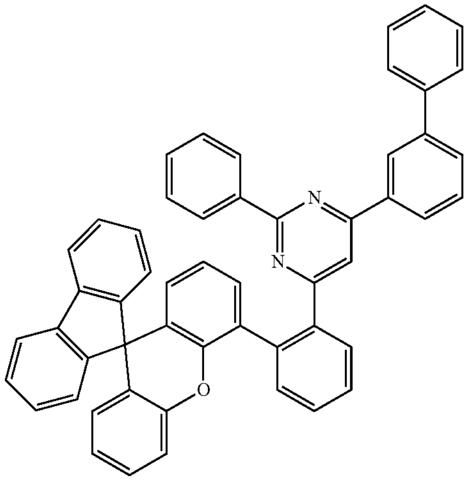
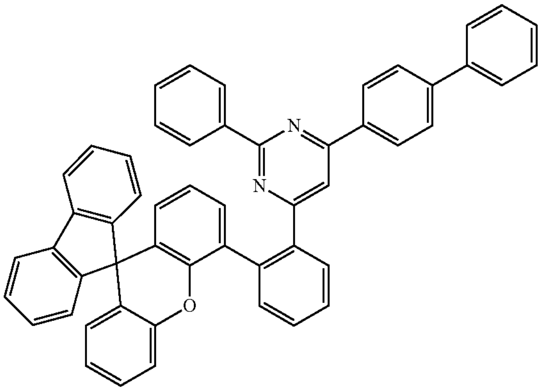
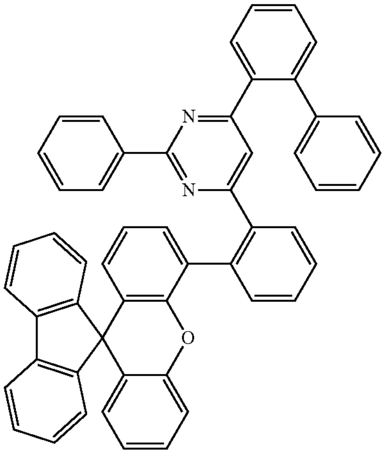
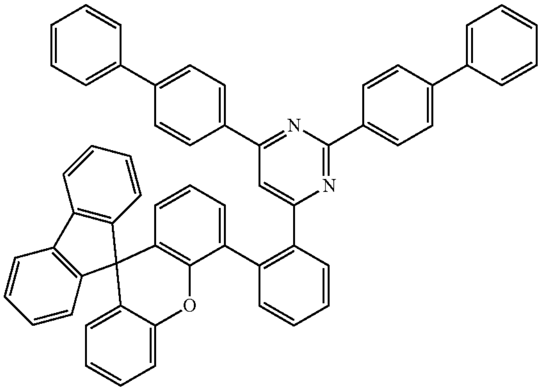
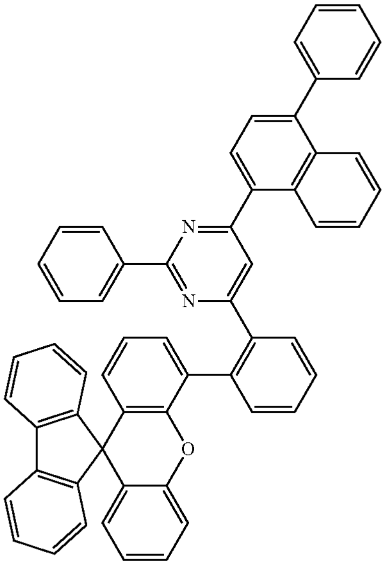

-continued
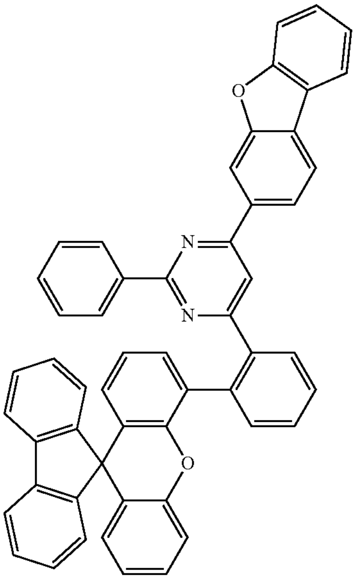
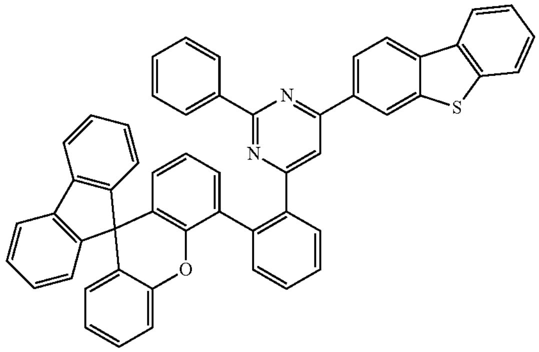
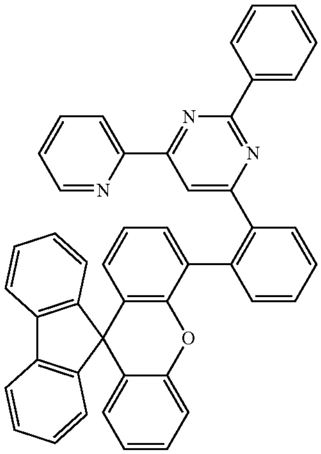
-continued
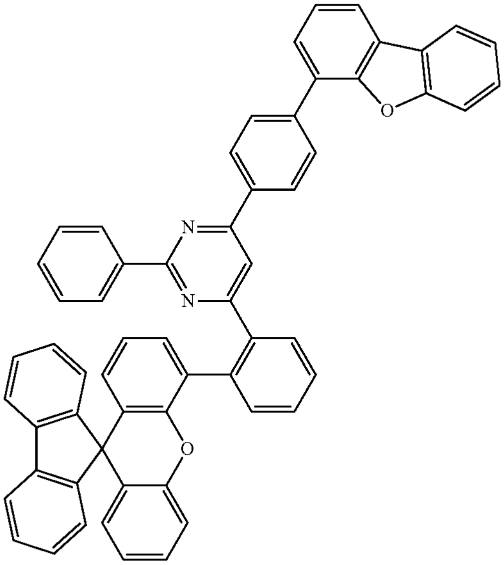
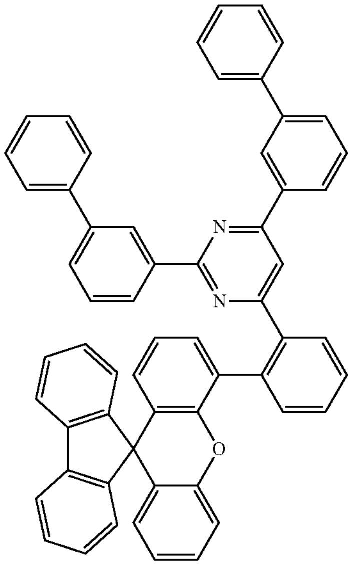
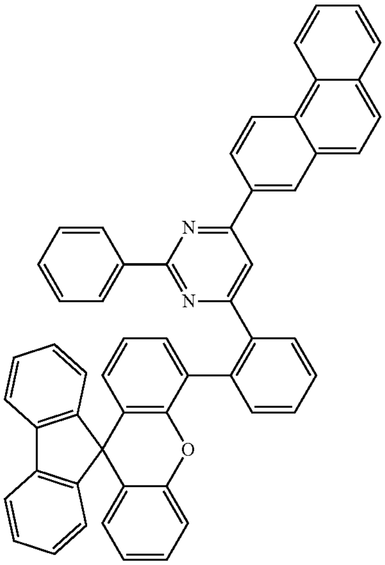

-continued
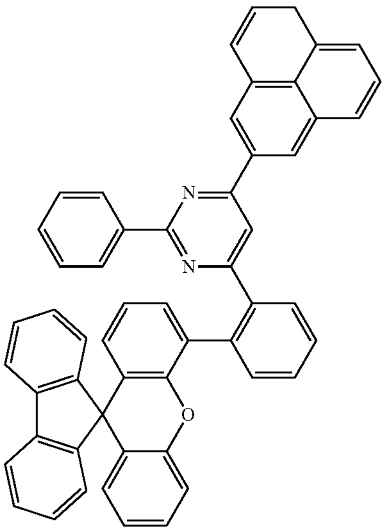
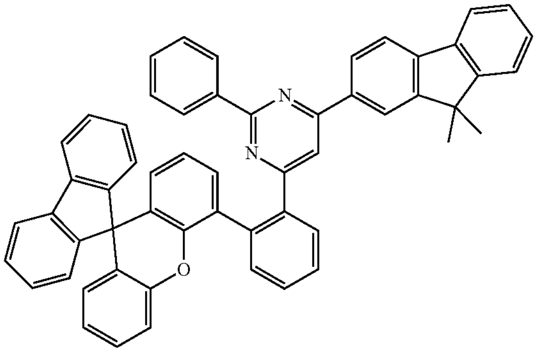
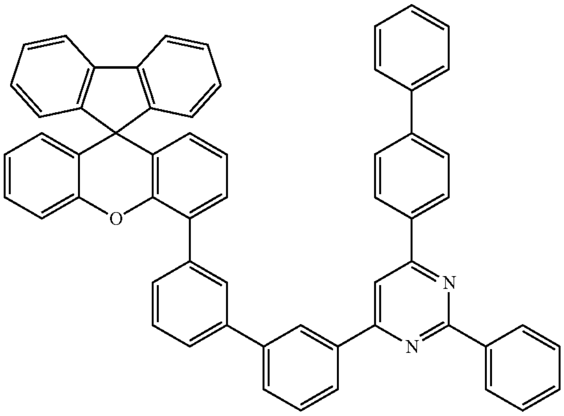
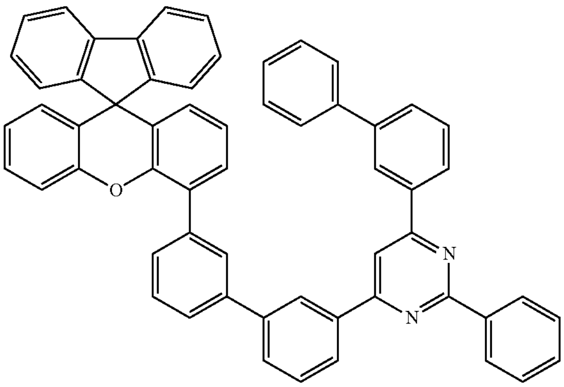
-continued
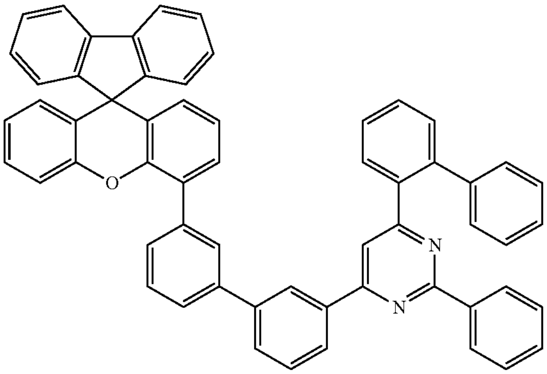 [SMILES: c1ccc(-c2nc(-c3cccc(-c4cccc(-c5cccc6c5Oc5ccccc5C65c6ccccc6-c6ccccc65)c4)c3)cc(-c3ccccc3-c3ccccc3)n2)cc1]
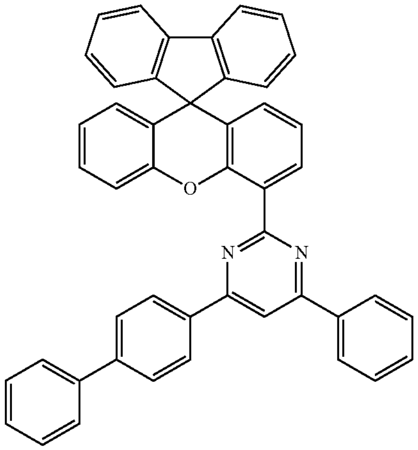
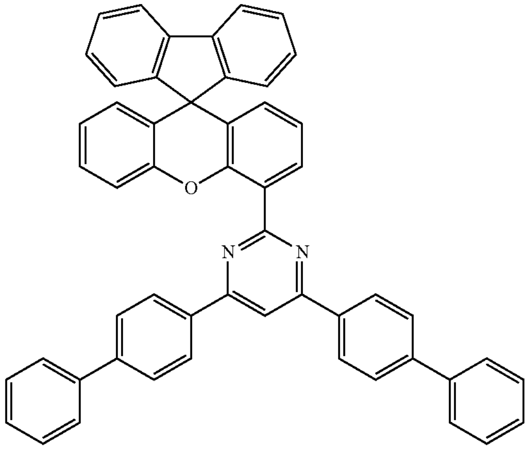
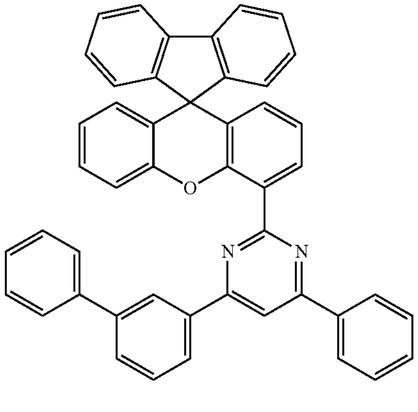

-continued
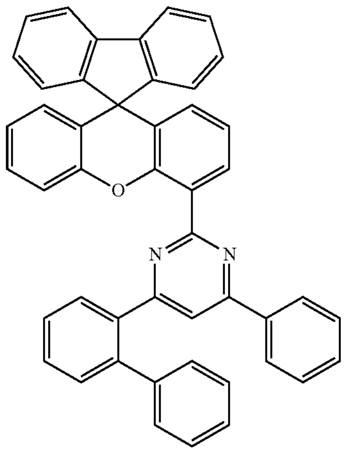
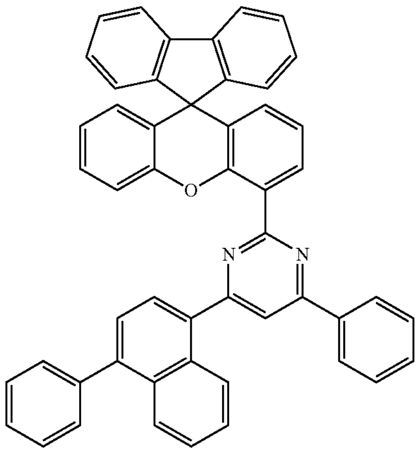
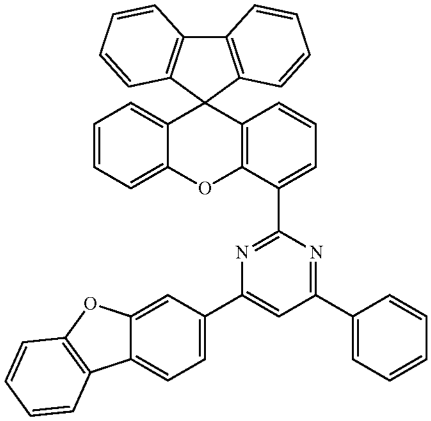
-continued
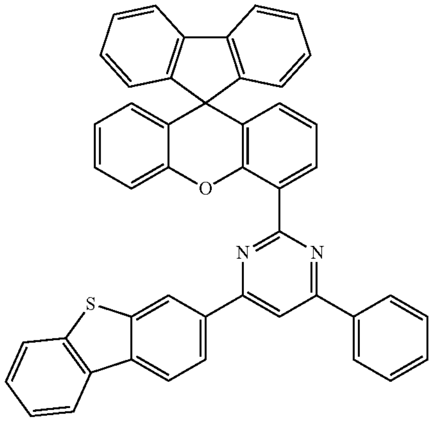
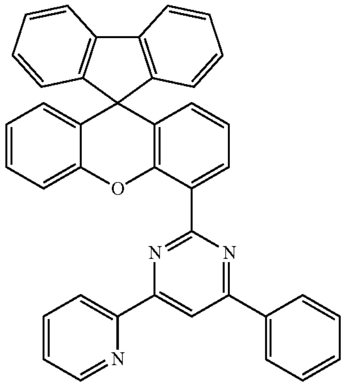
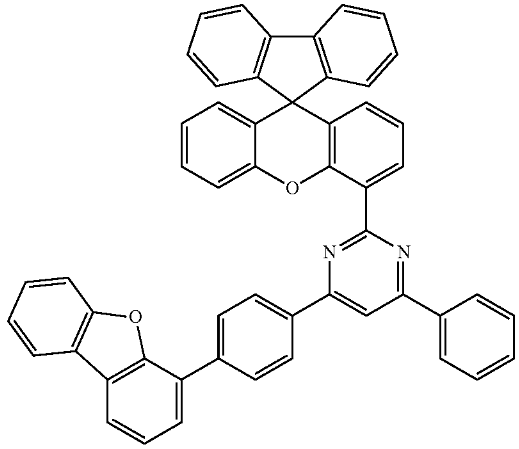
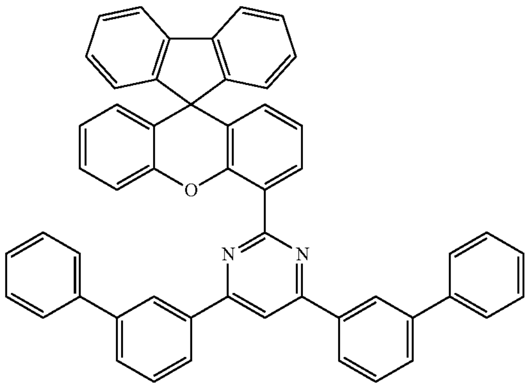

-continued
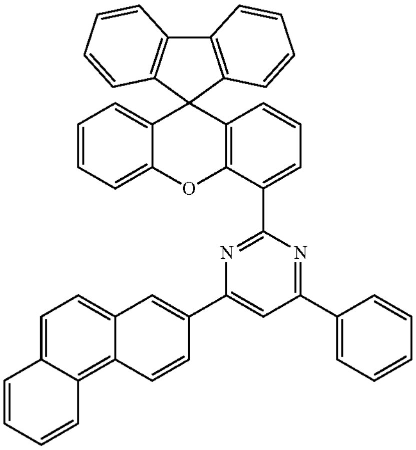
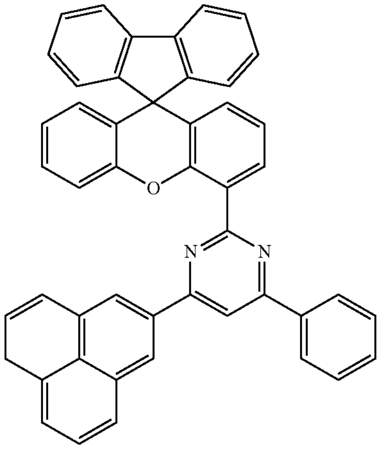
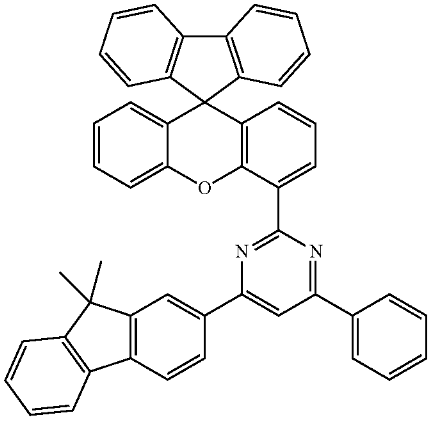
-continued
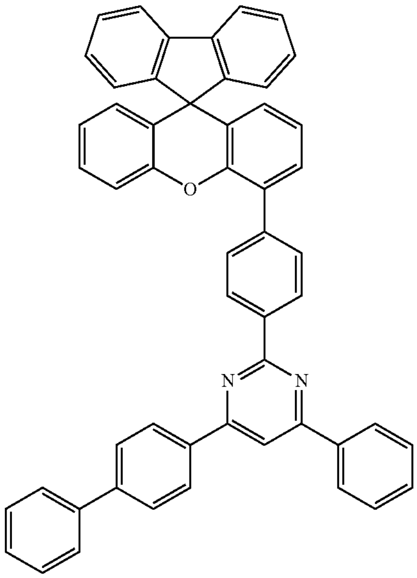
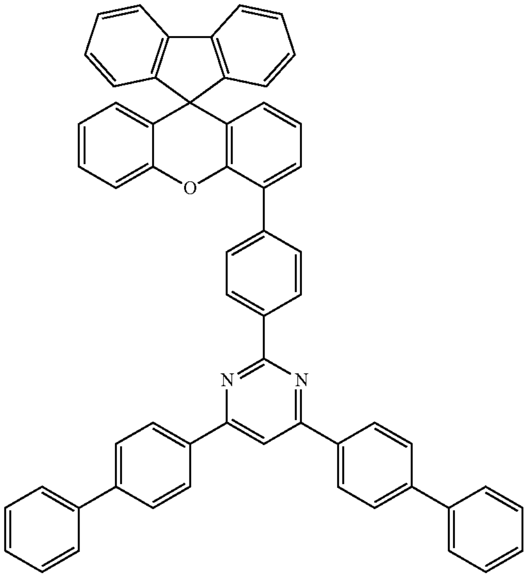
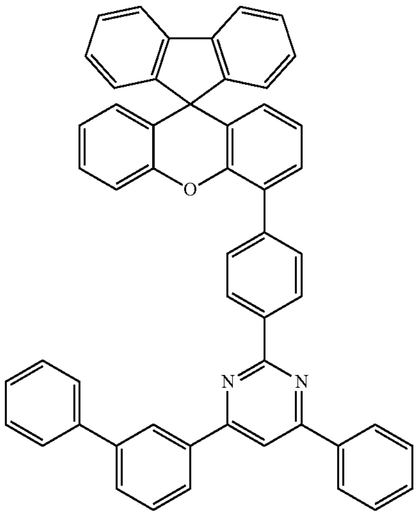

-continued
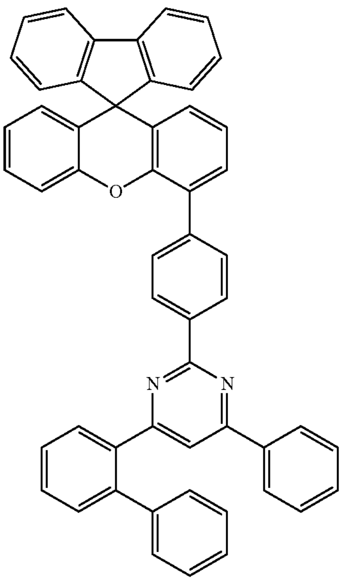
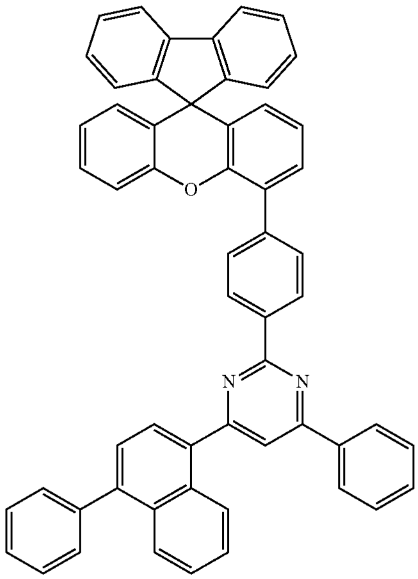
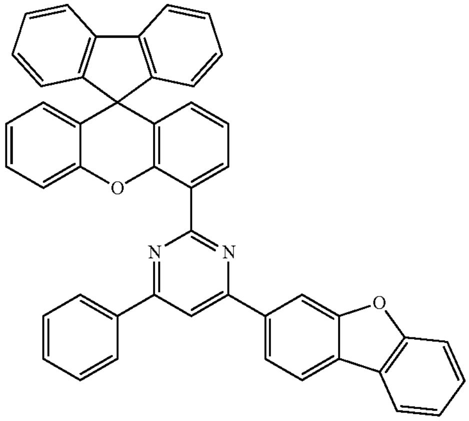
-continued
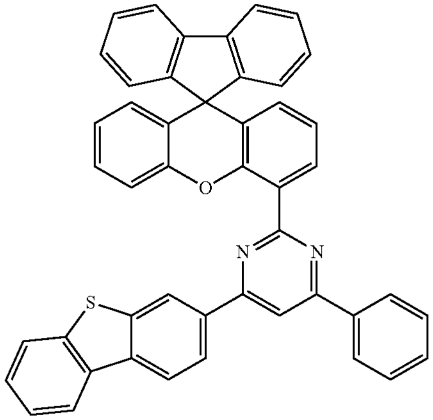
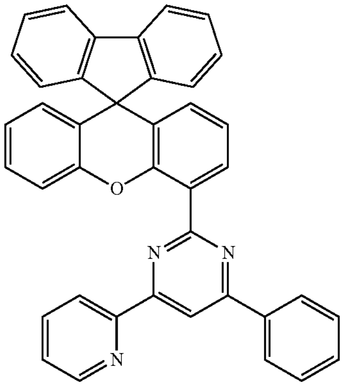
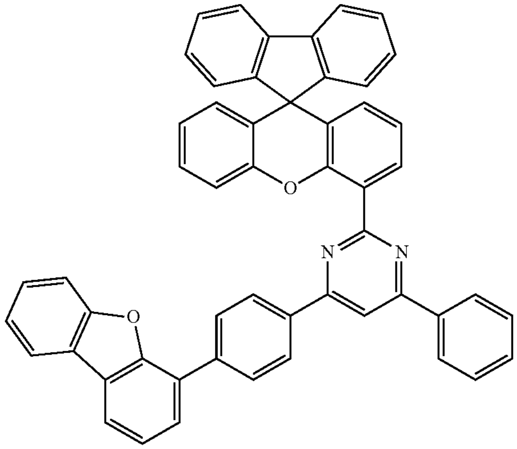
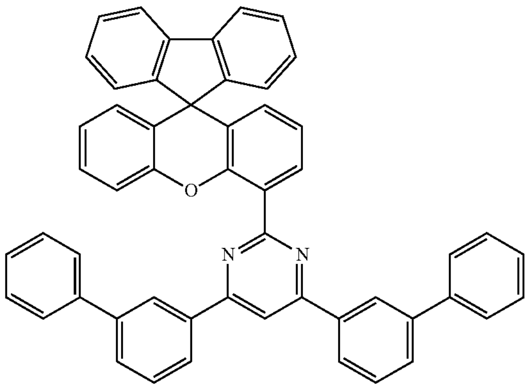

-continued
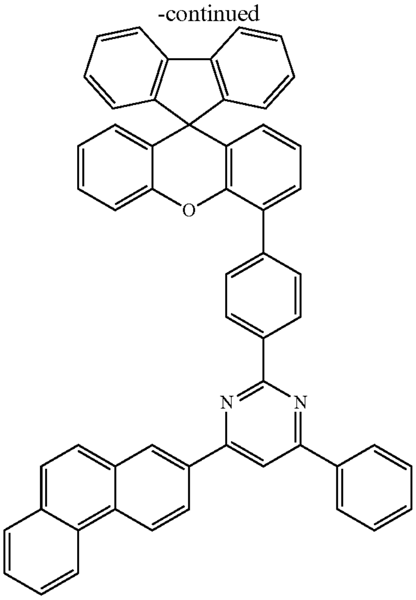
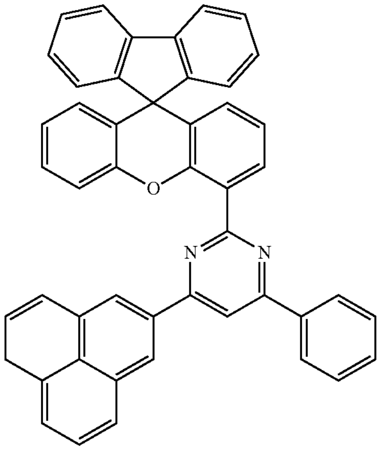
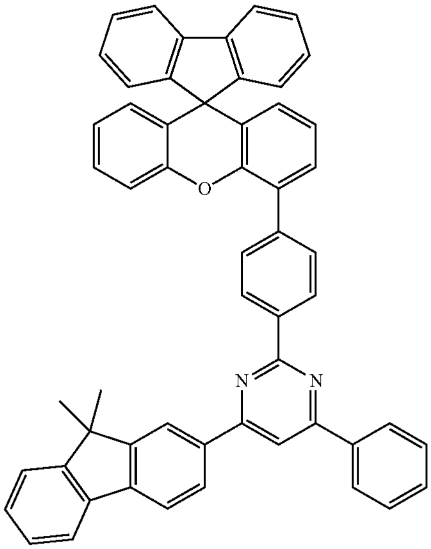 [SMILES: CC1(C)c2ccccc2-c2ccc(-c3cc(-c4ccccc4)nc(-c4ccc(-c5cccc6c5Oc5ccccc5C65c6ccccc6-c6ccccc65)cc4)n3)cc21]
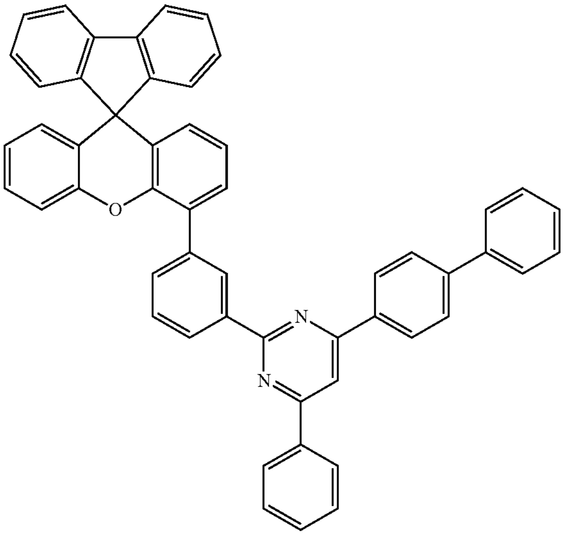
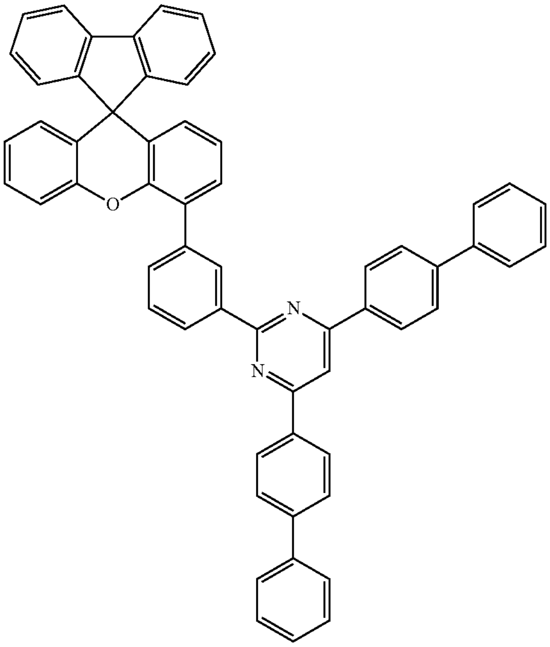
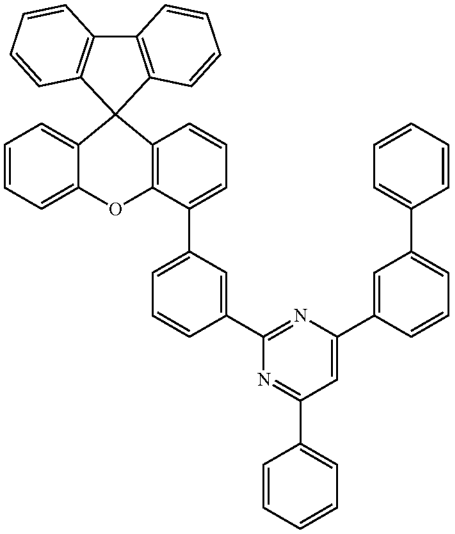

-continued
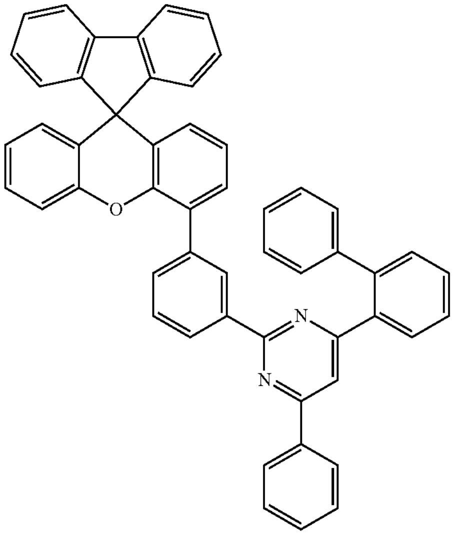
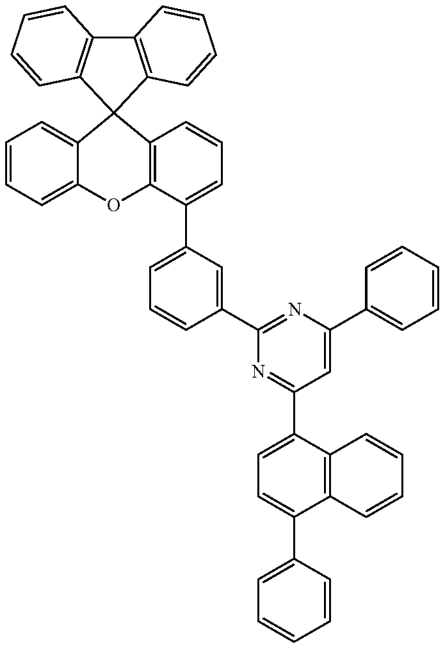
-continued
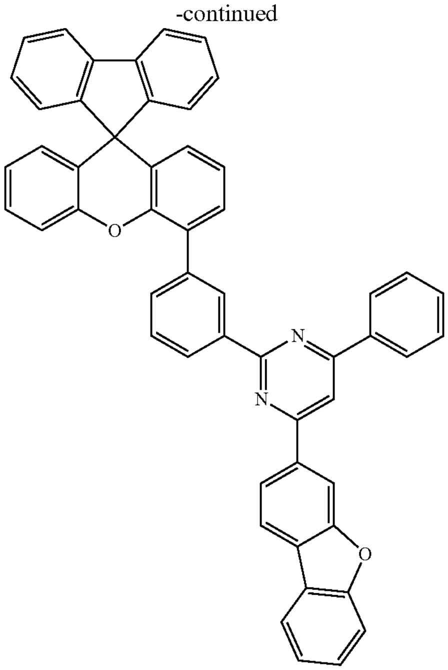
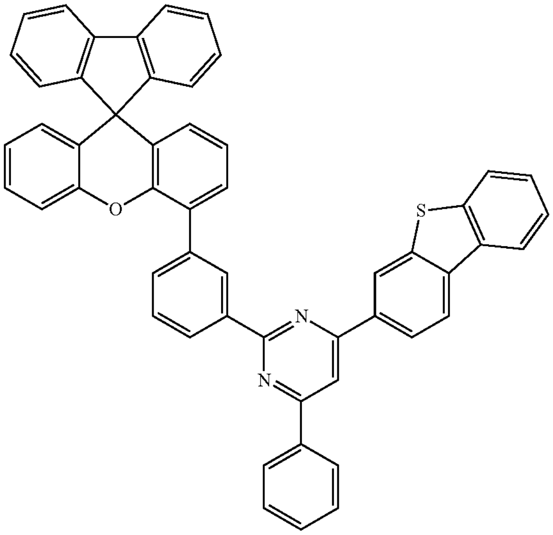
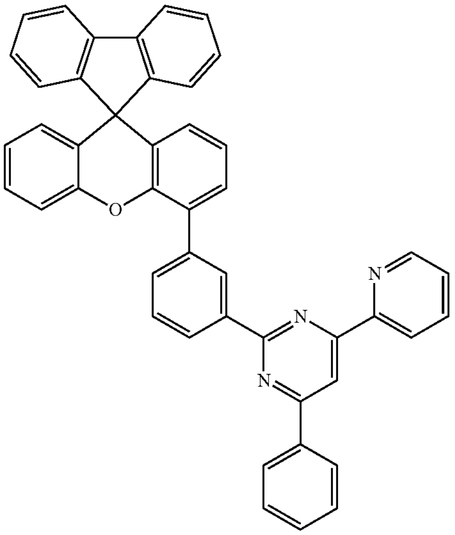

-continued
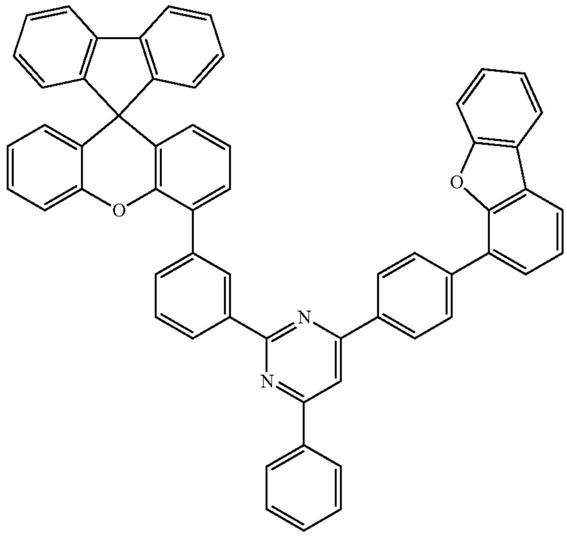
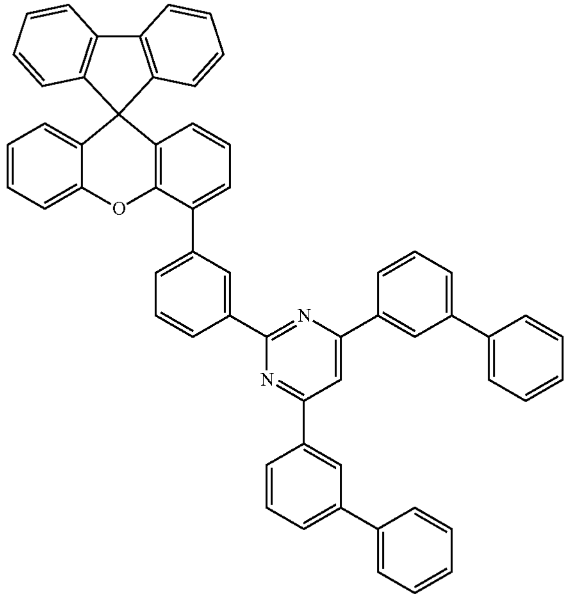
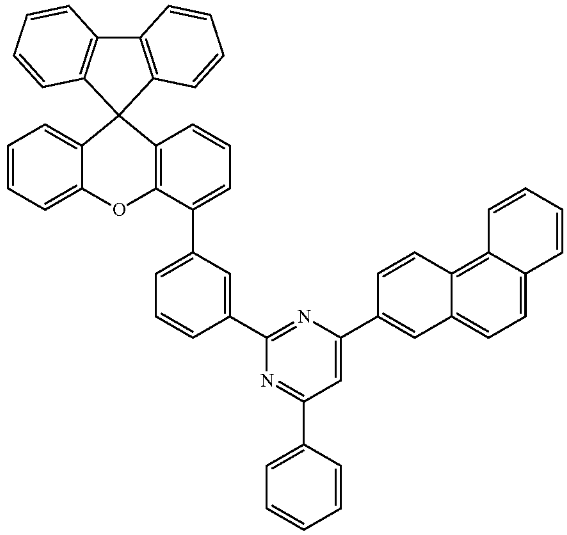
-continued
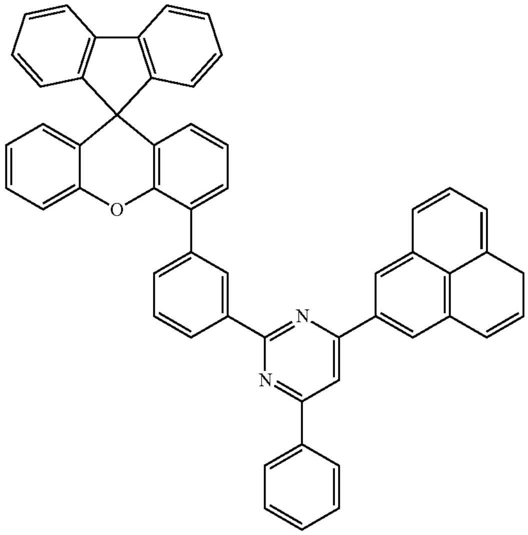
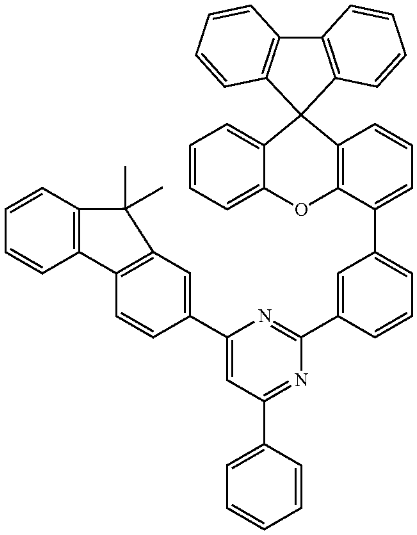
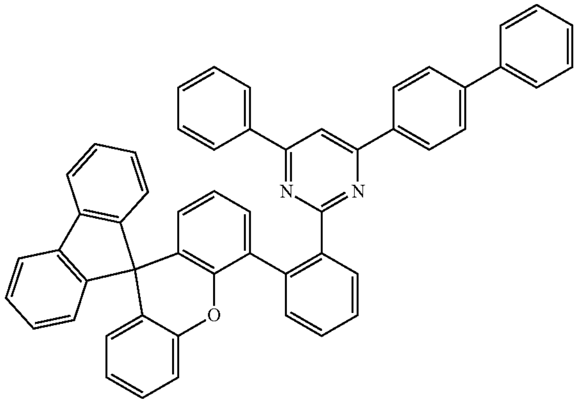

-continued
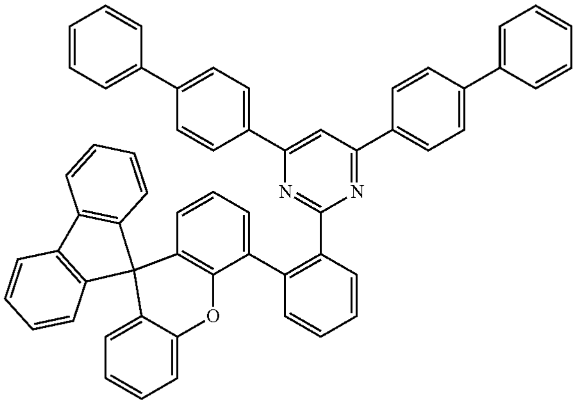
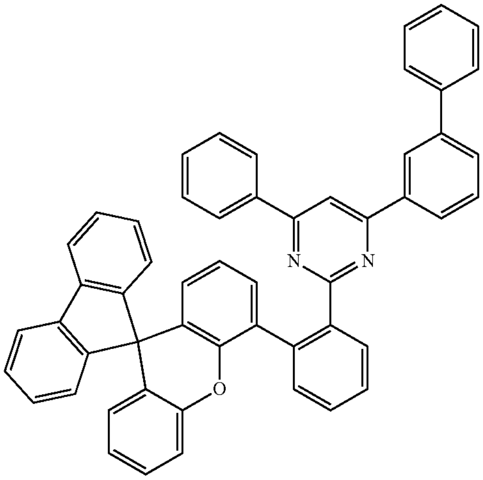
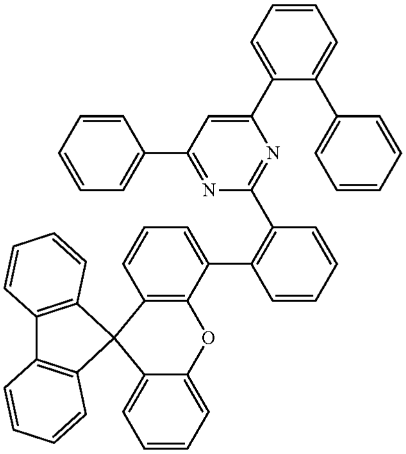
-continued
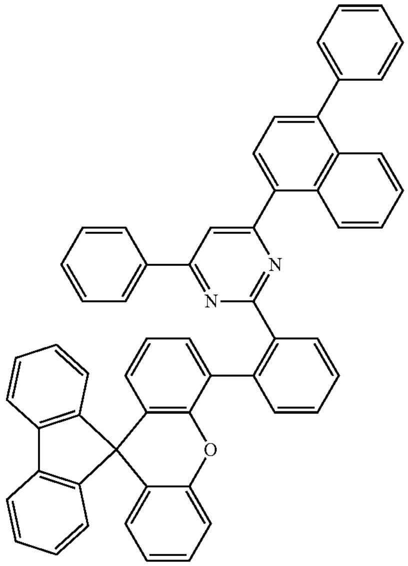
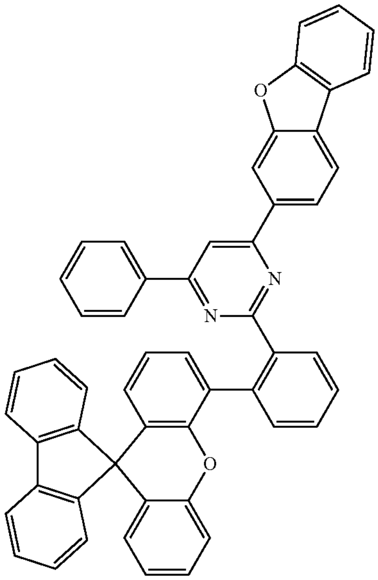
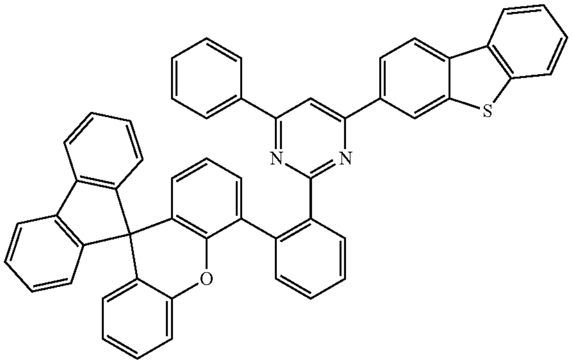

-continued
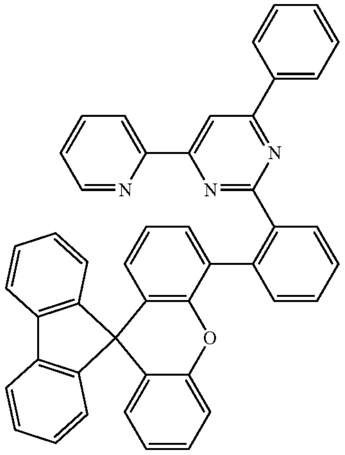
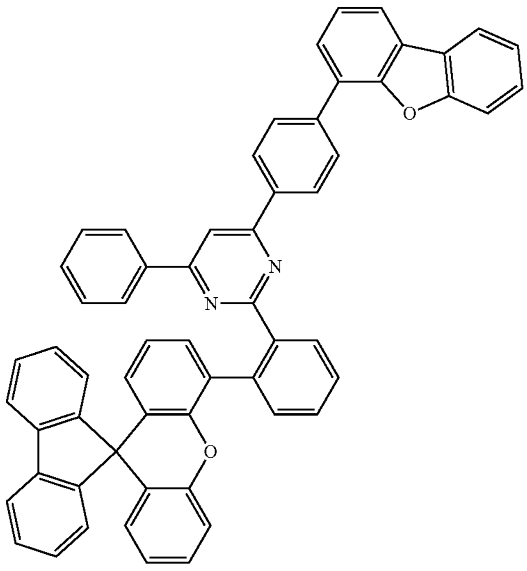
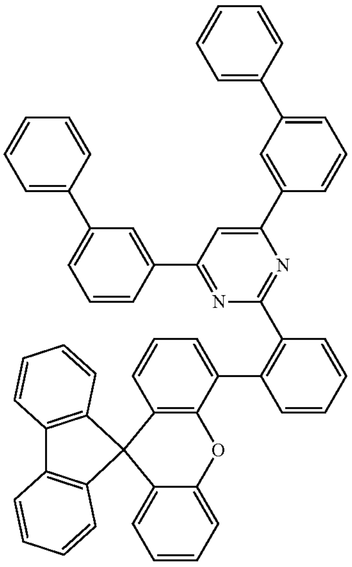
-continued
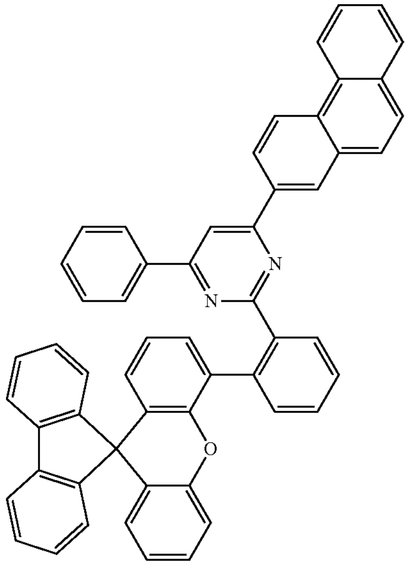
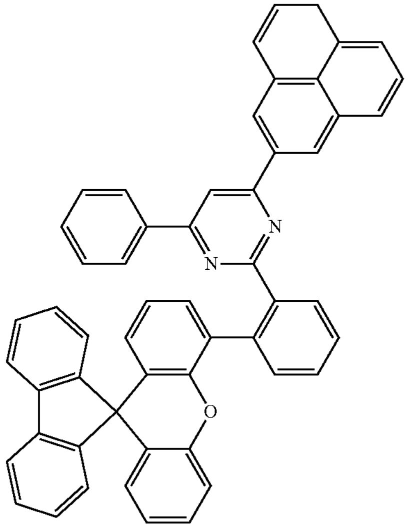
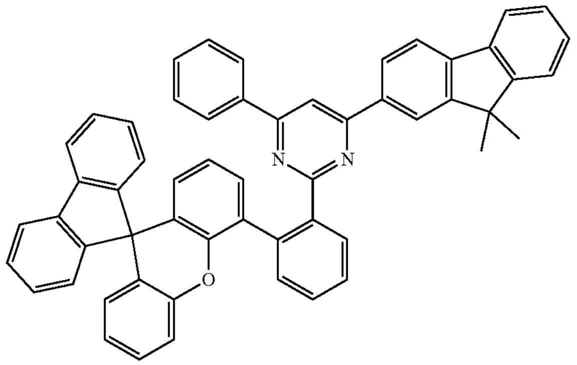

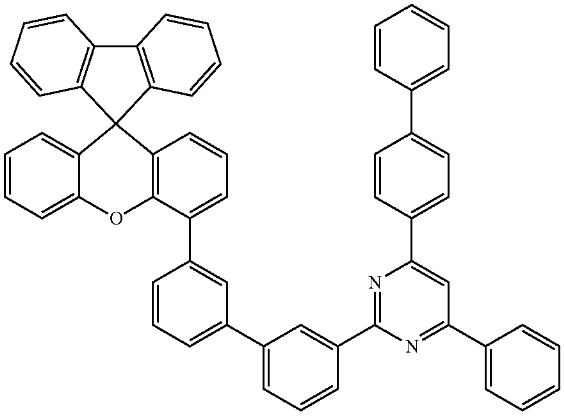
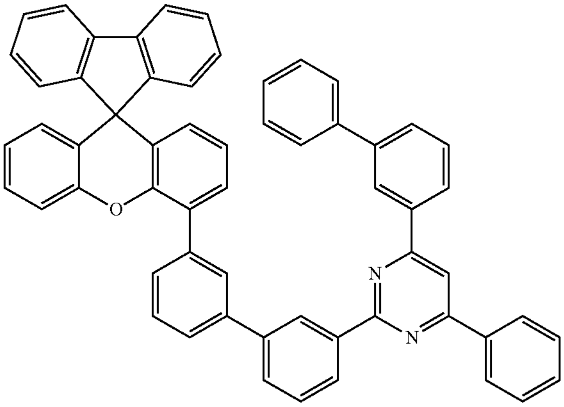
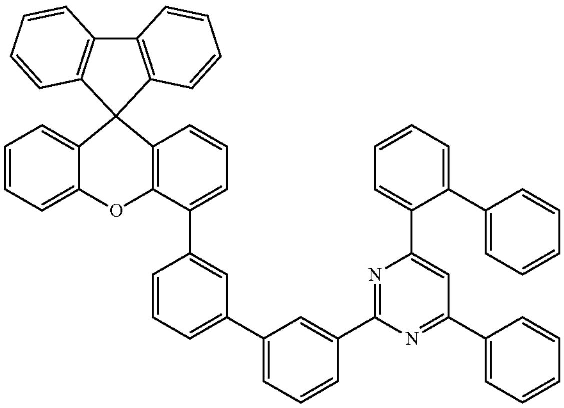
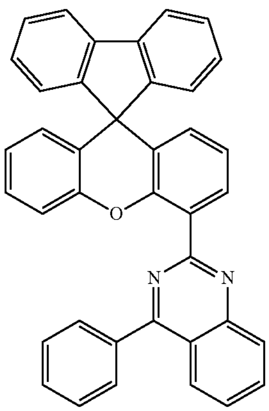
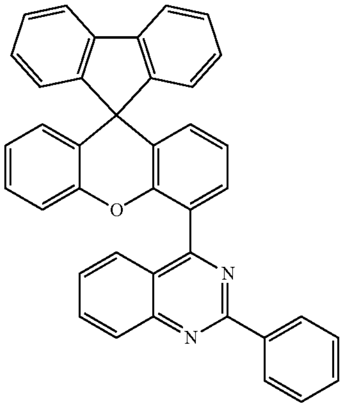
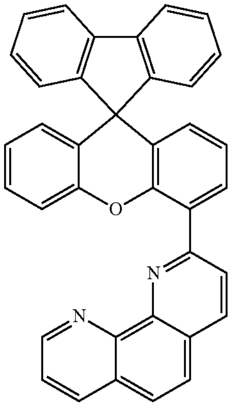
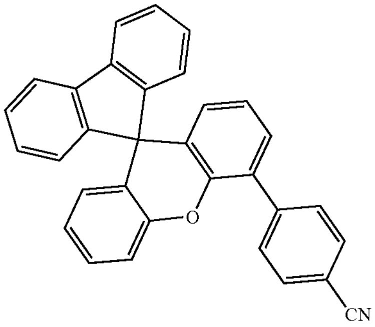
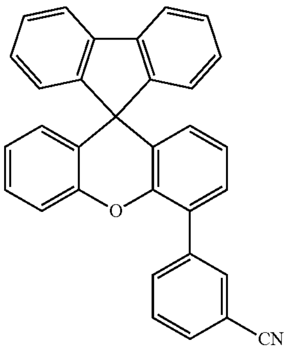
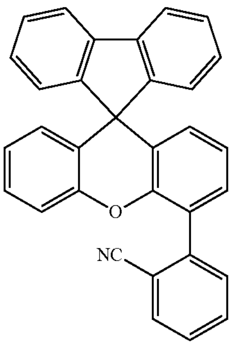

-continued
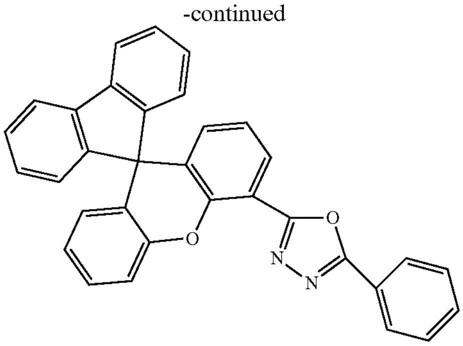
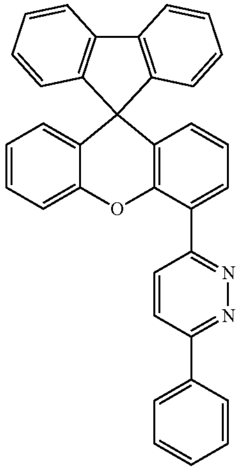
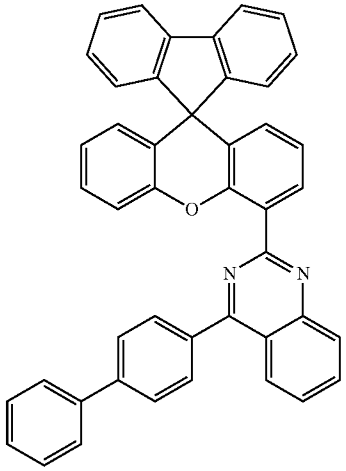
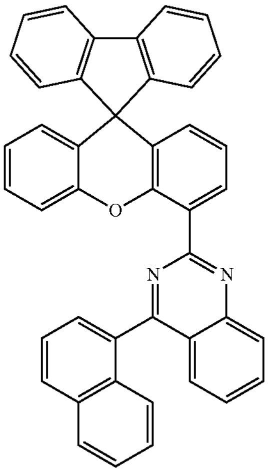
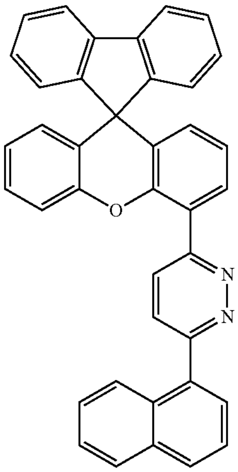
-continued
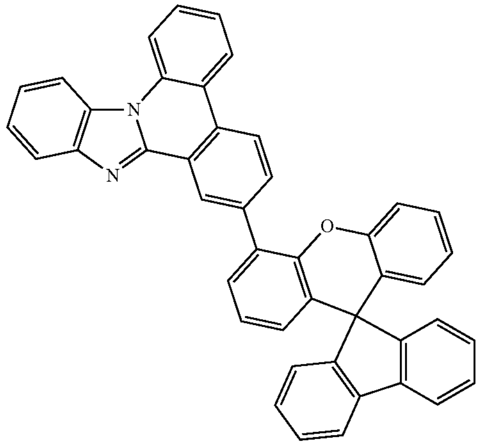
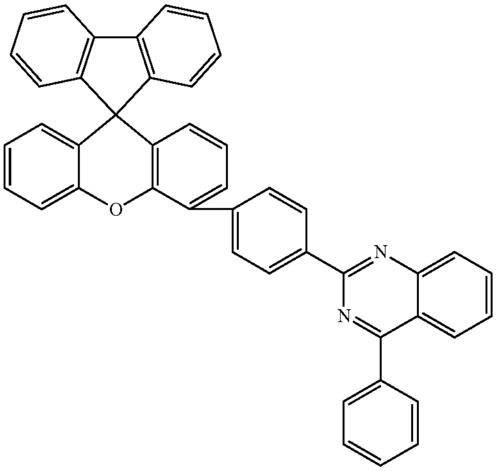
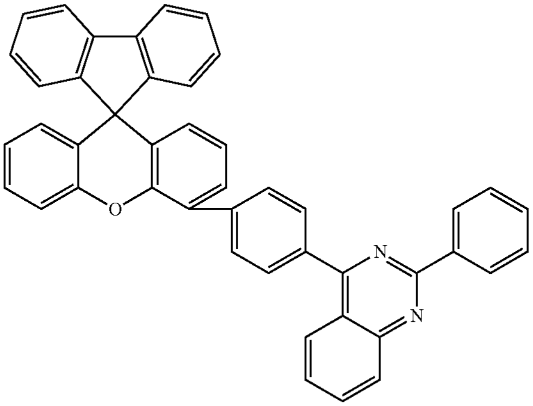
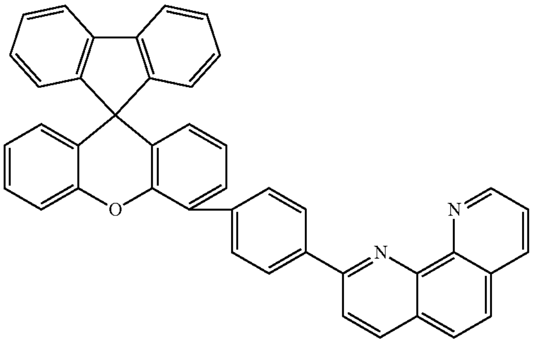

-continued
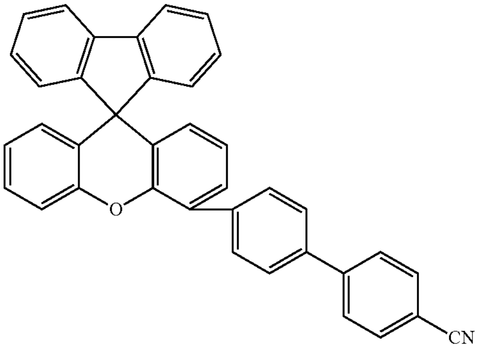
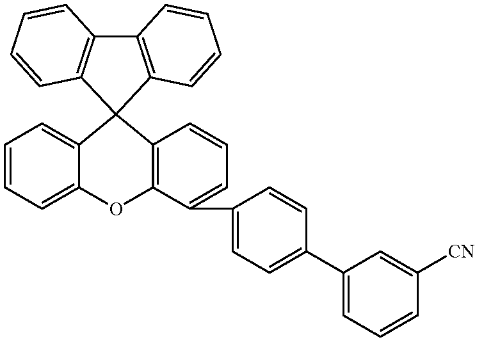
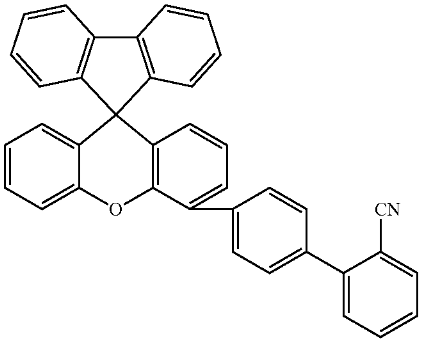
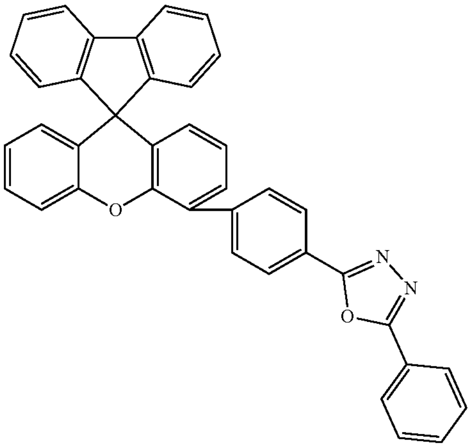
-continued
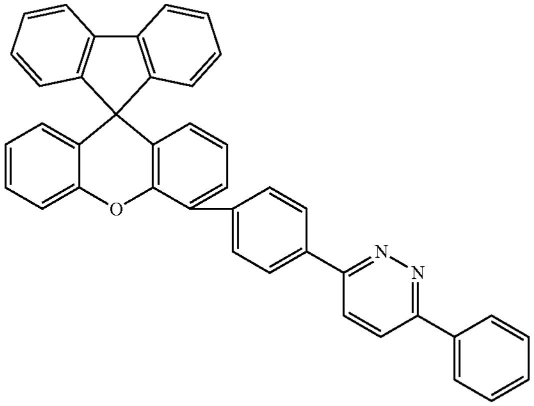
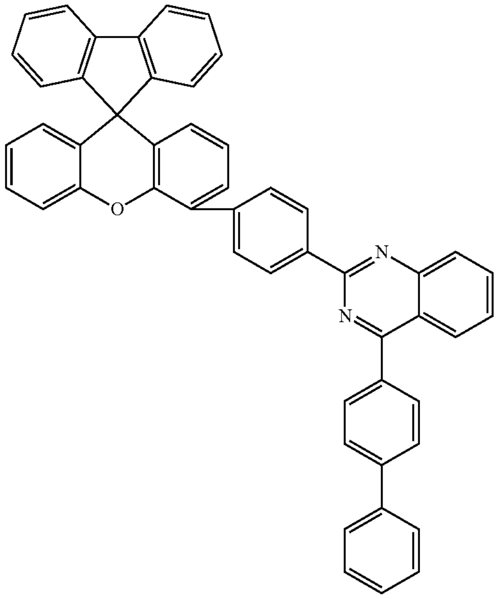
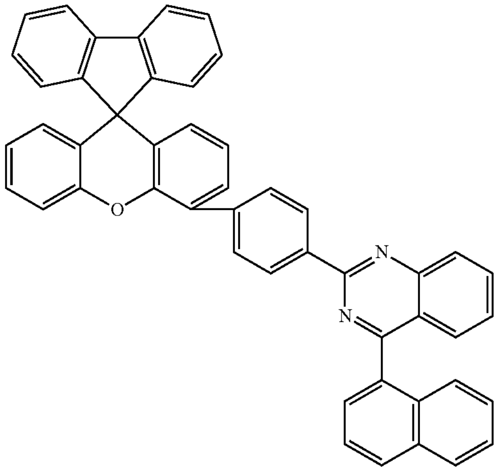

-continued
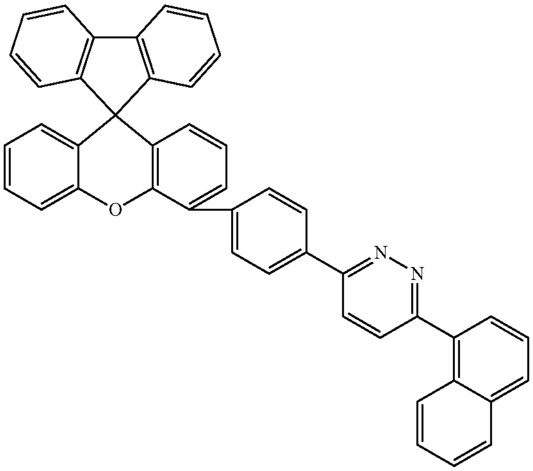
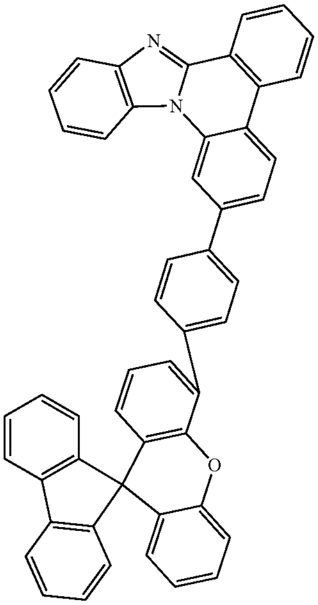
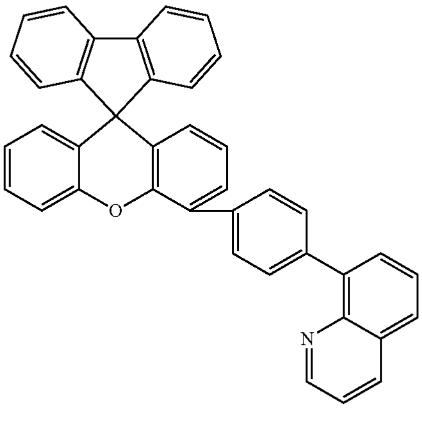
-continued
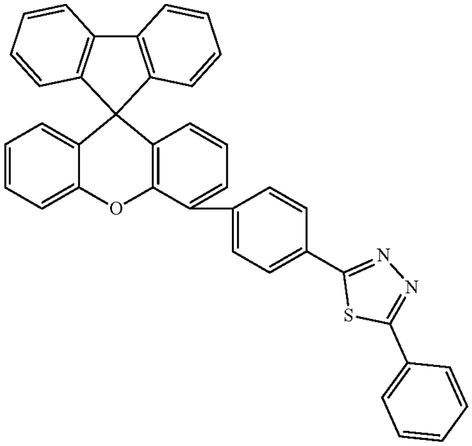
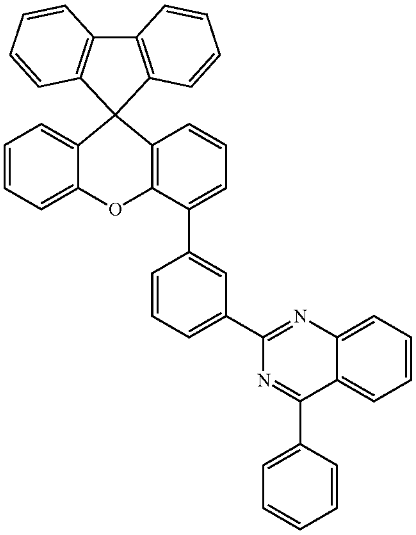
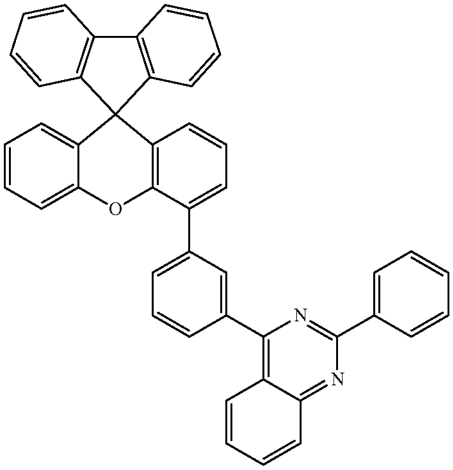

-continued
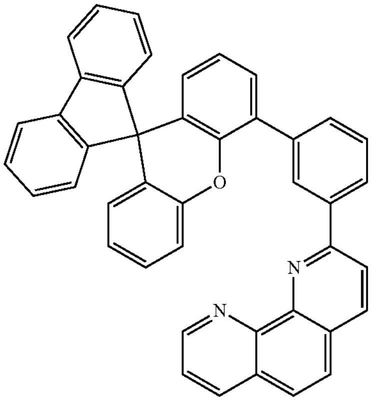
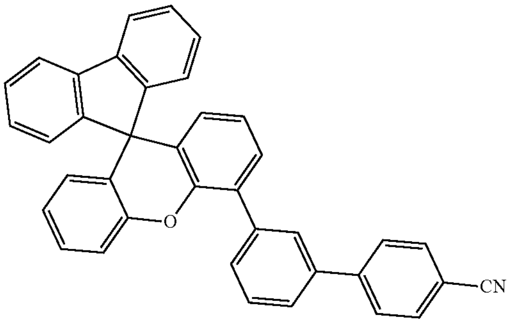
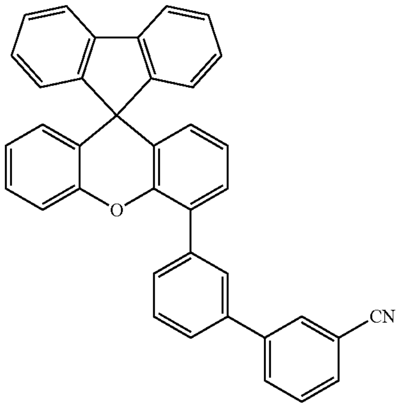
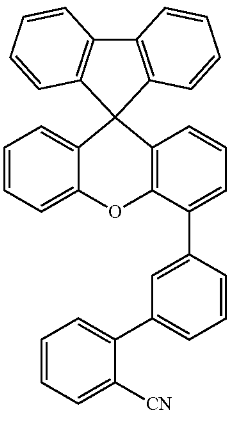
-continued
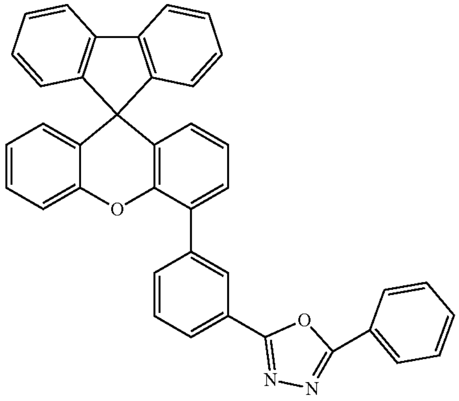
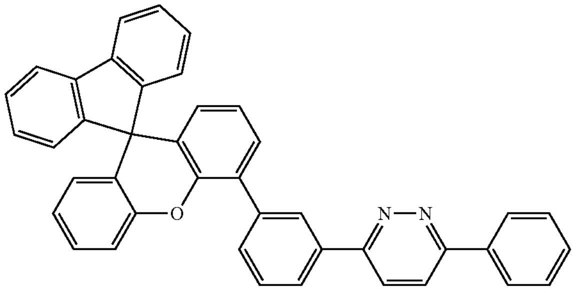
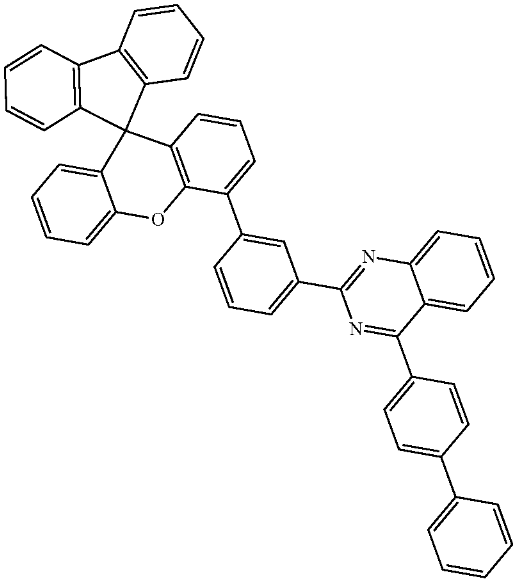
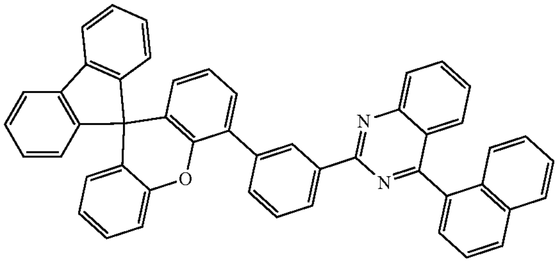

-continued
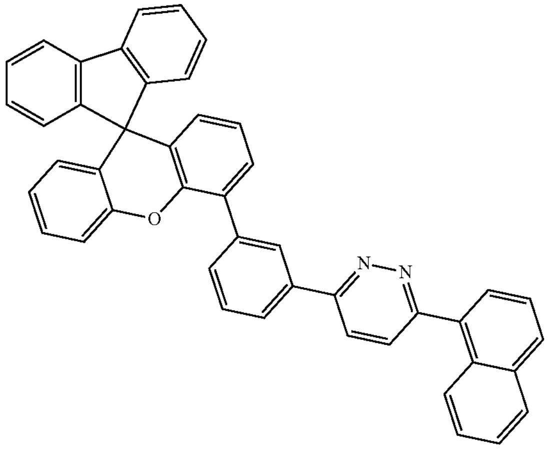
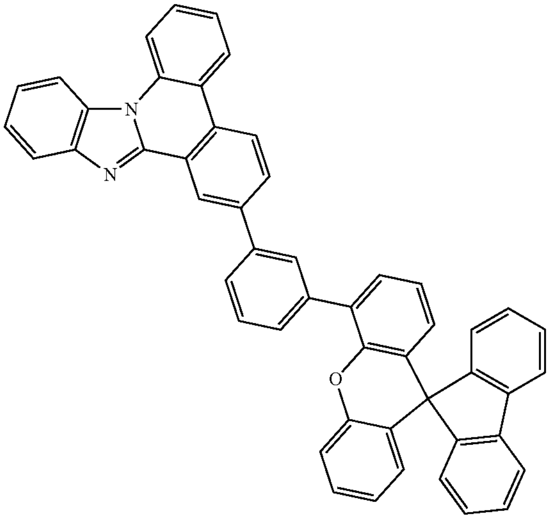
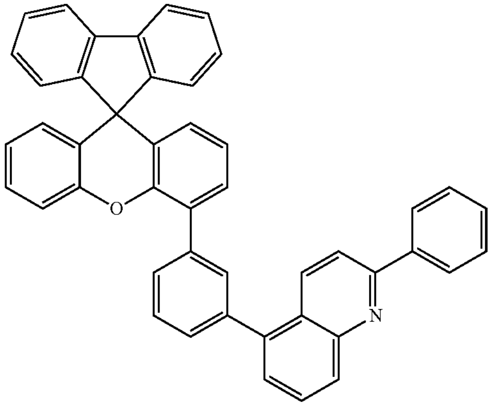
-continued
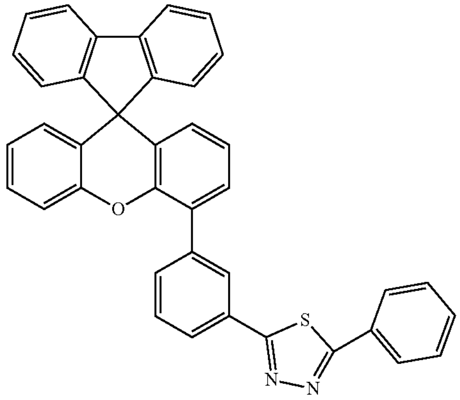
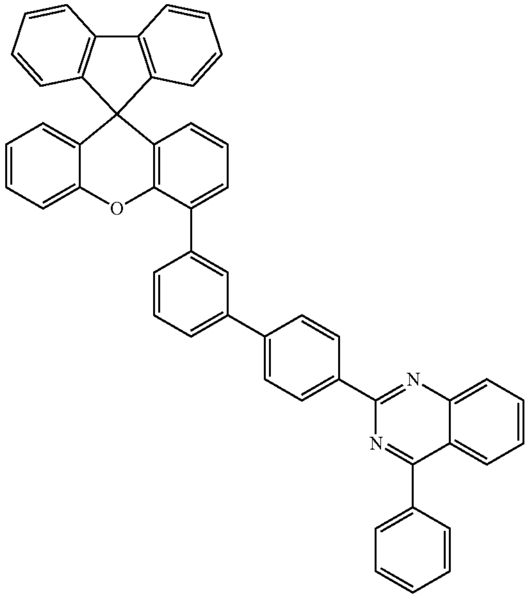
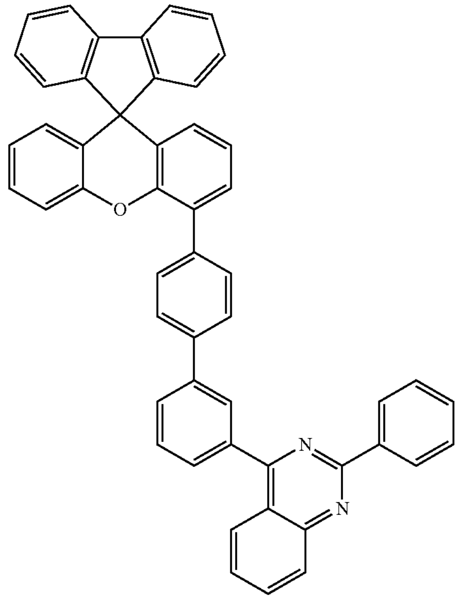

-continued
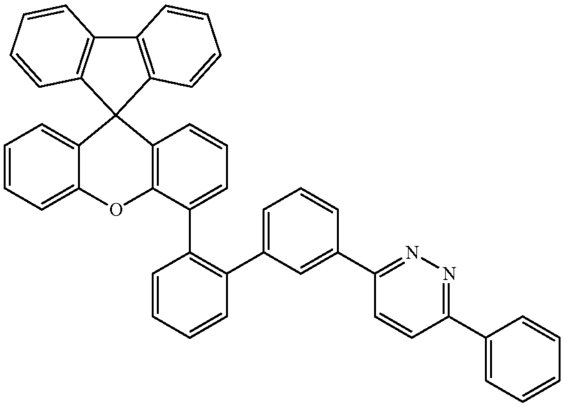
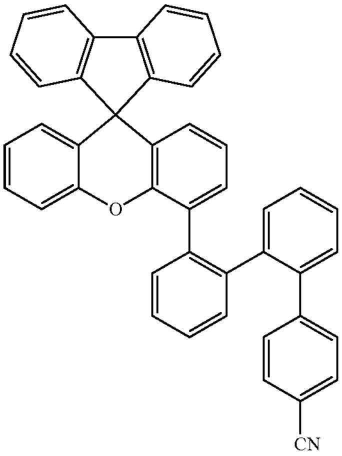
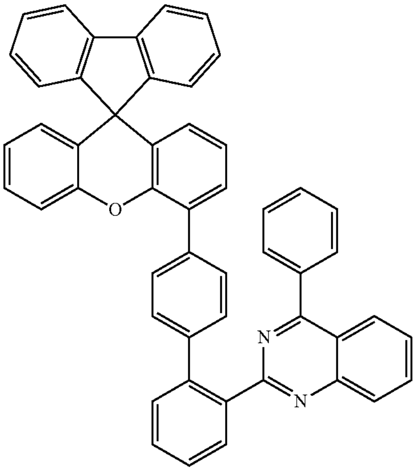
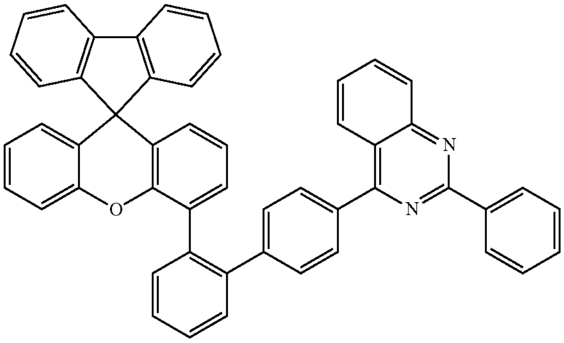
-continued
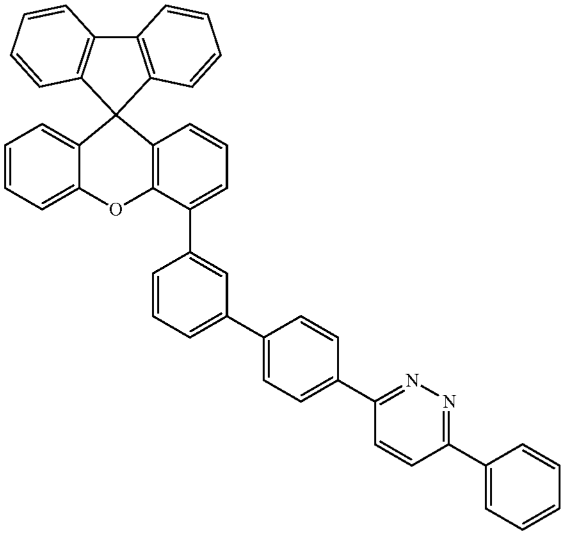
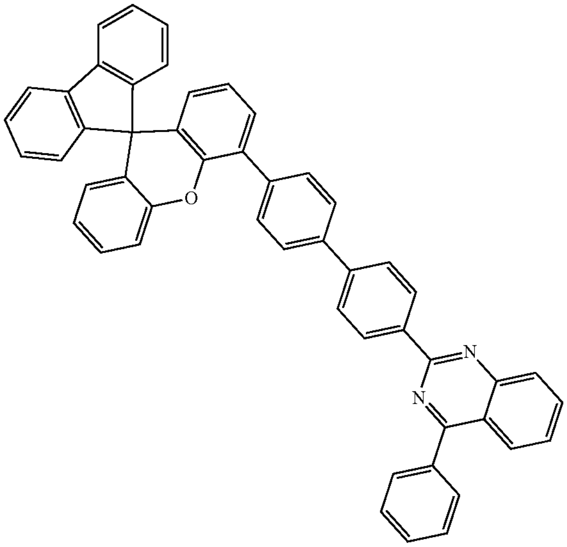
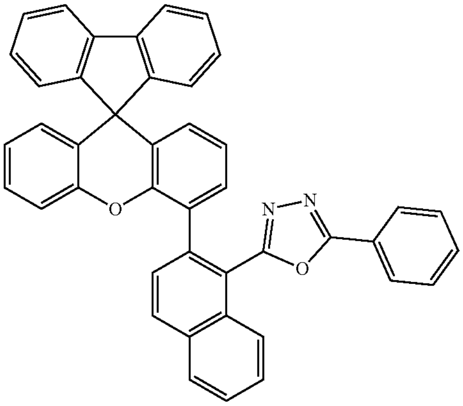

-continued
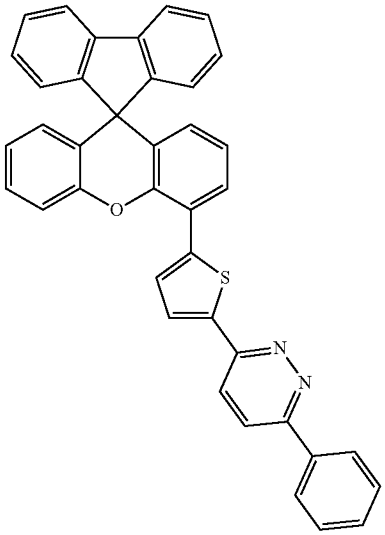
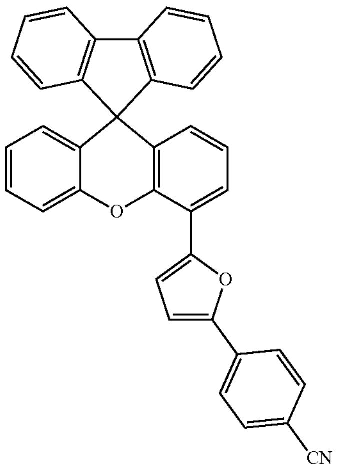
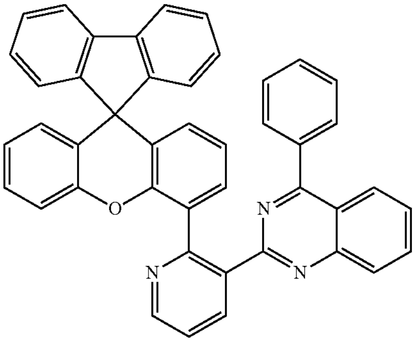
-continued
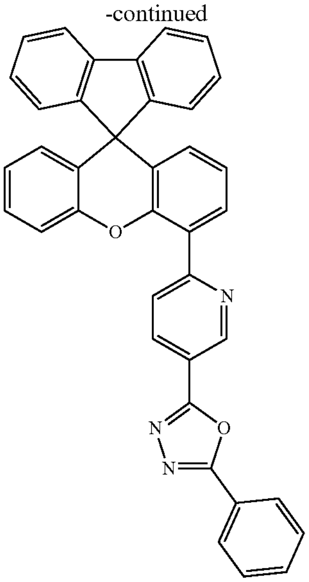
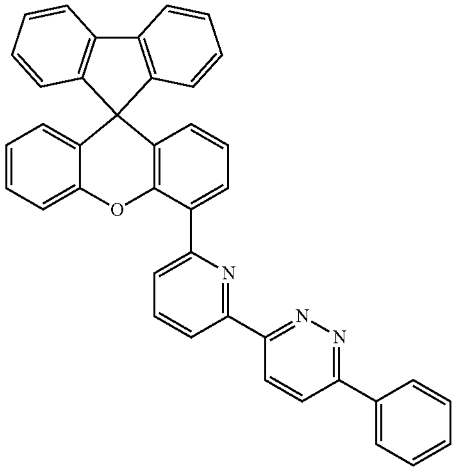
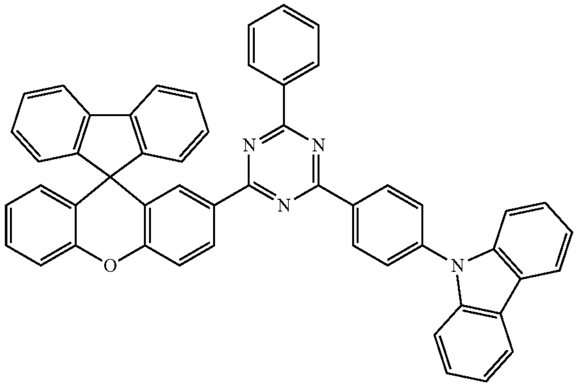

-continued
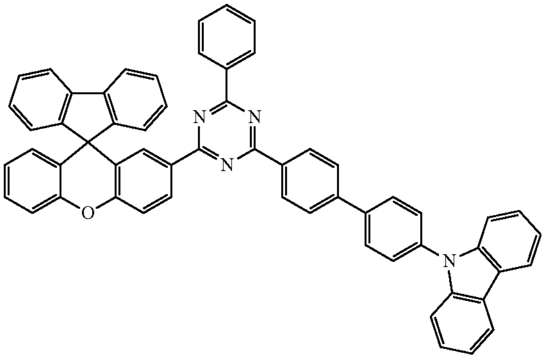
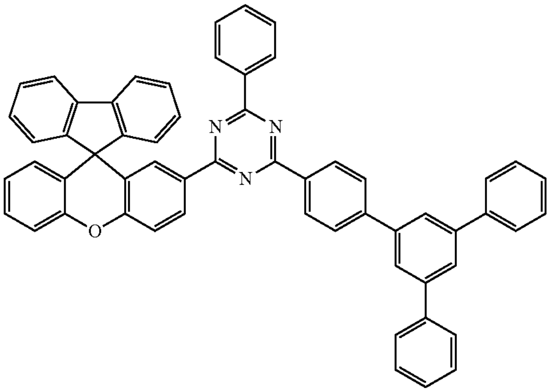
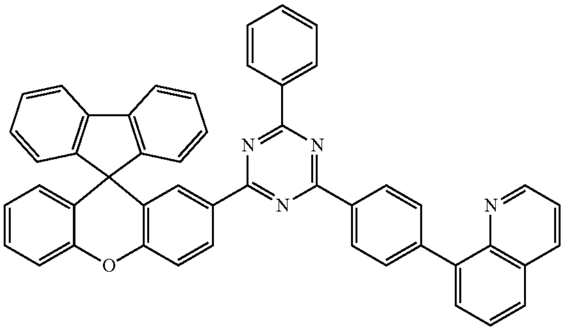
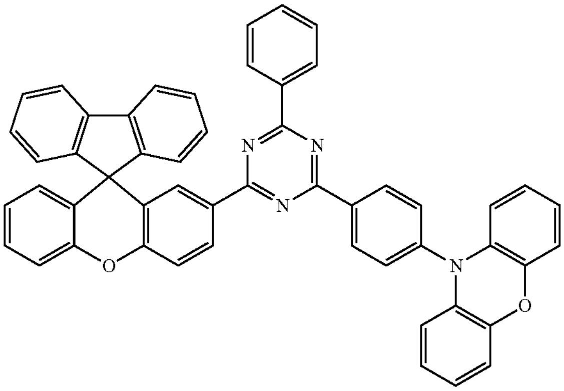
-continued
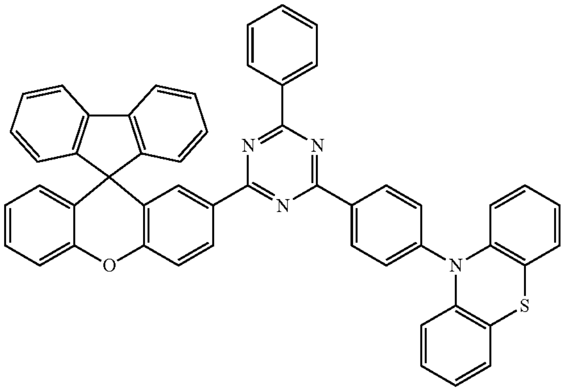
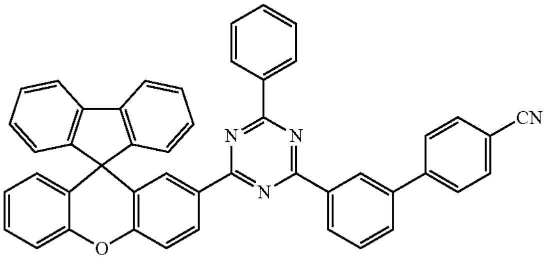
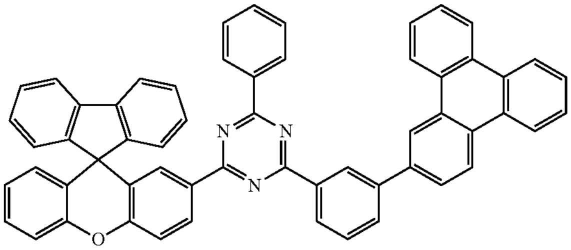
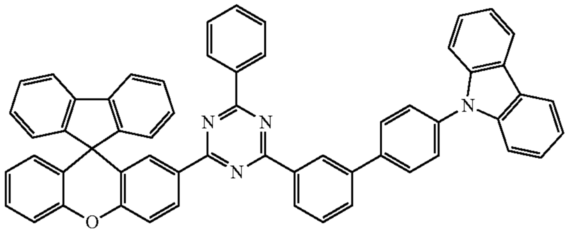
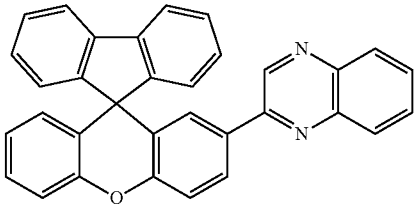
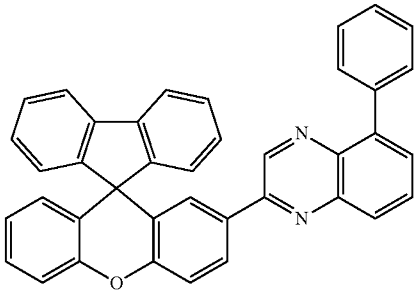

-continued
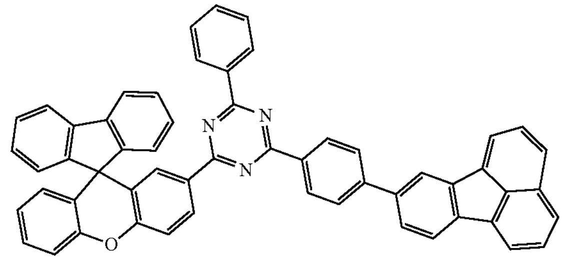
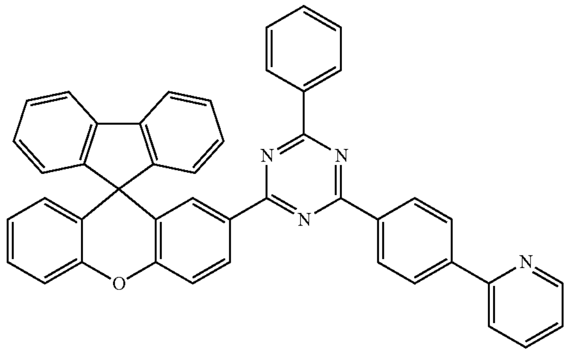
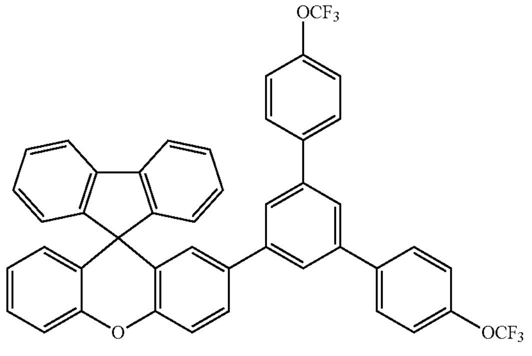
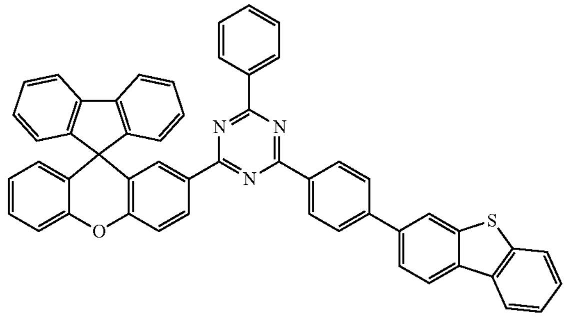
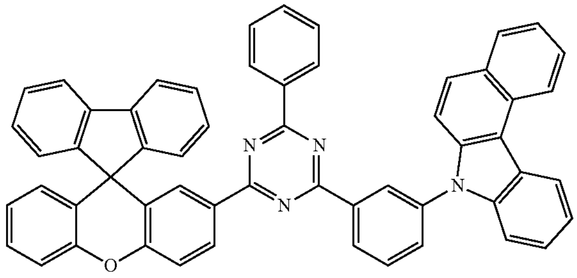
-continued
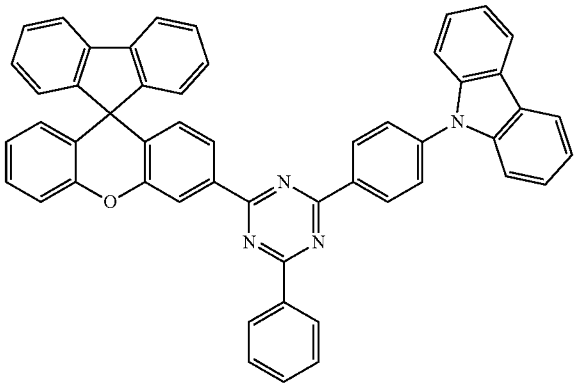
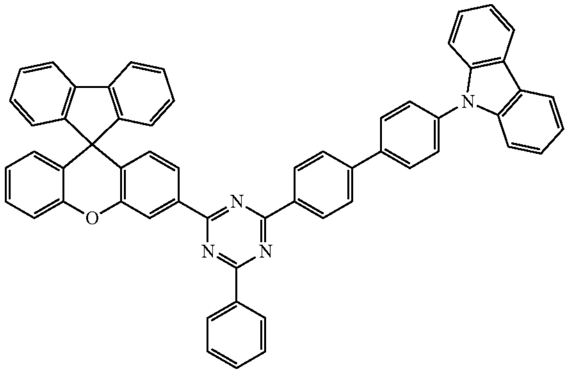
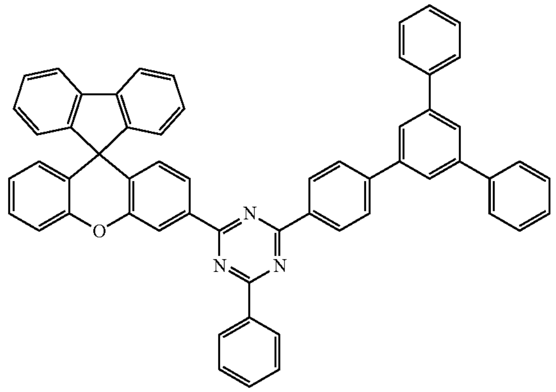
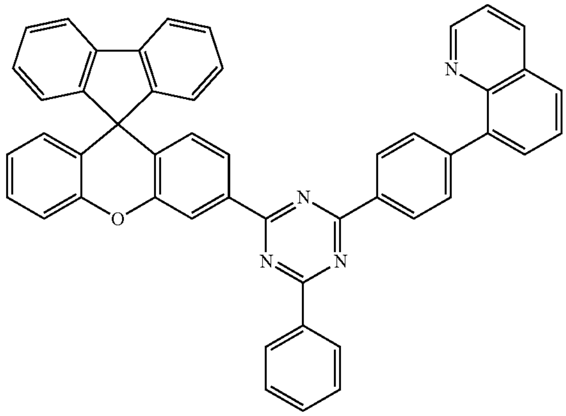

-continued
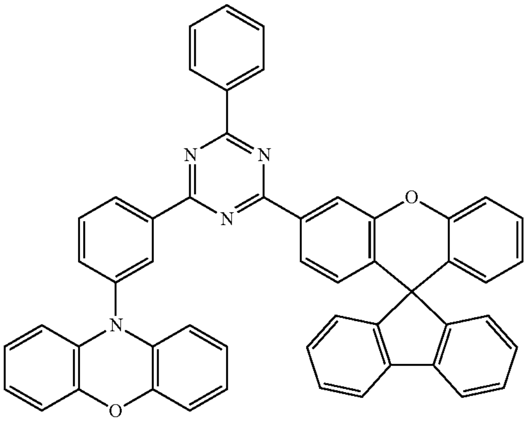
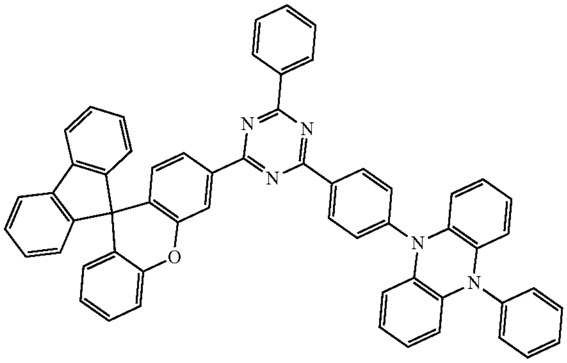
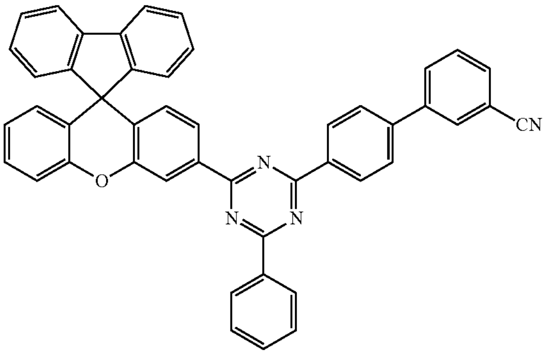
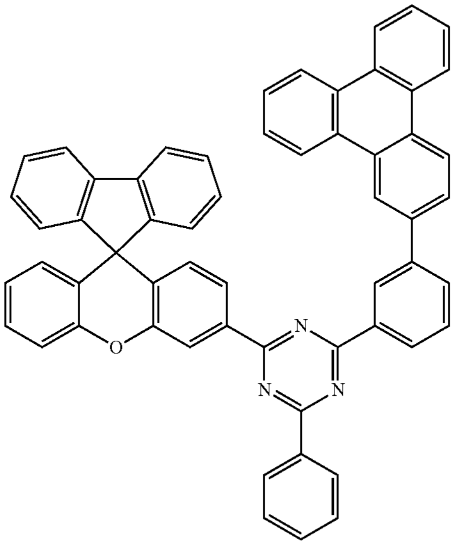
-continued
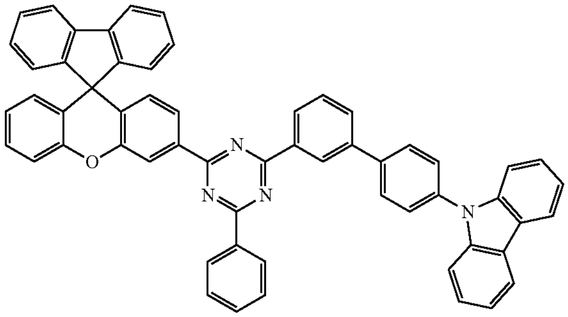
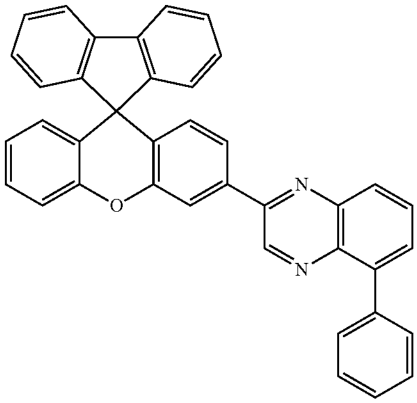
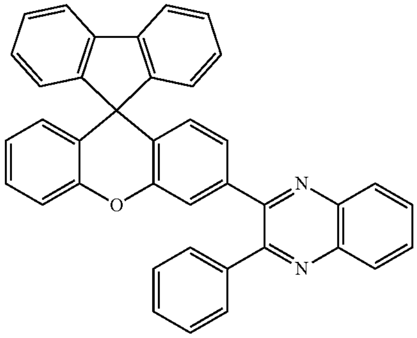
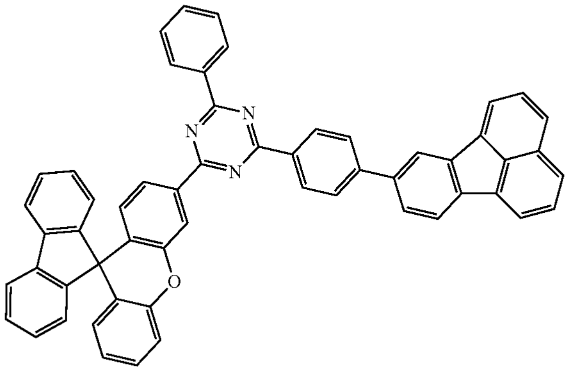

-continued
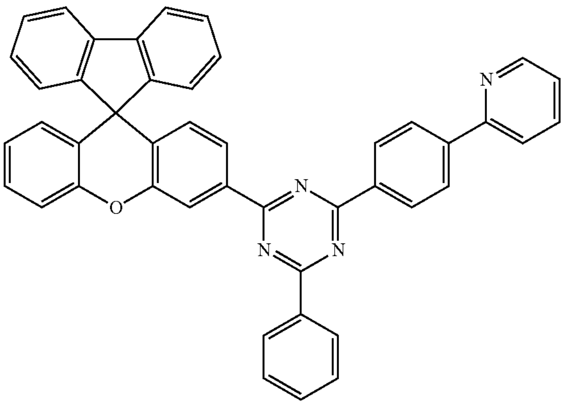
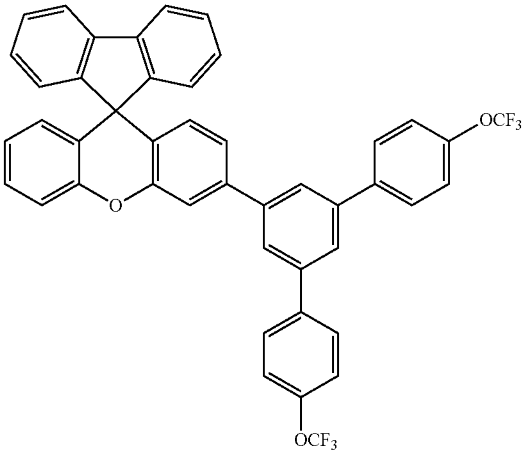
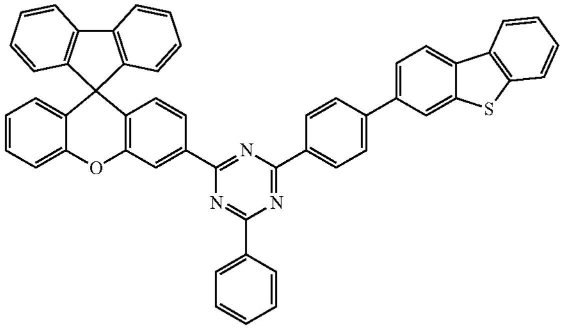
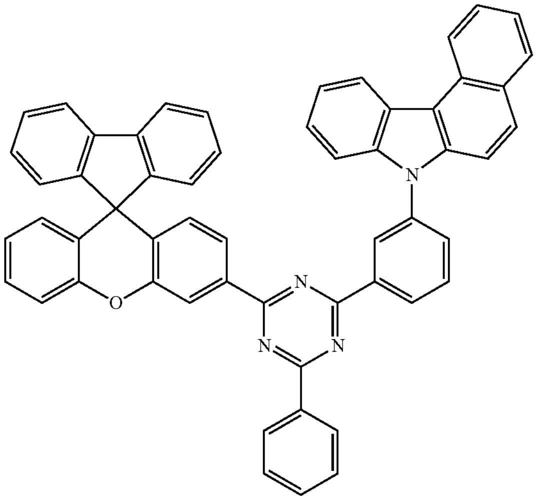
-continued
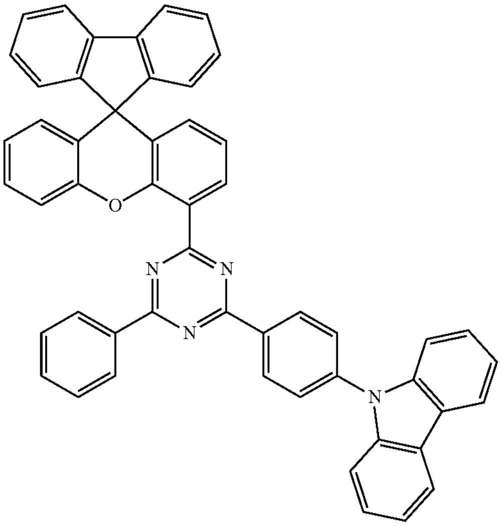
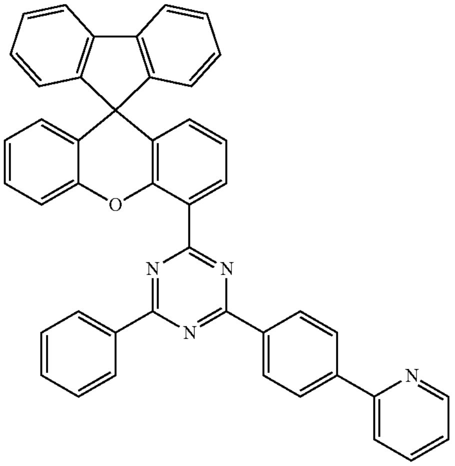
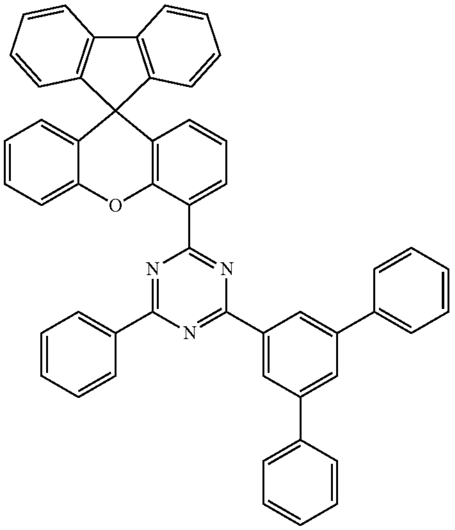

-continued
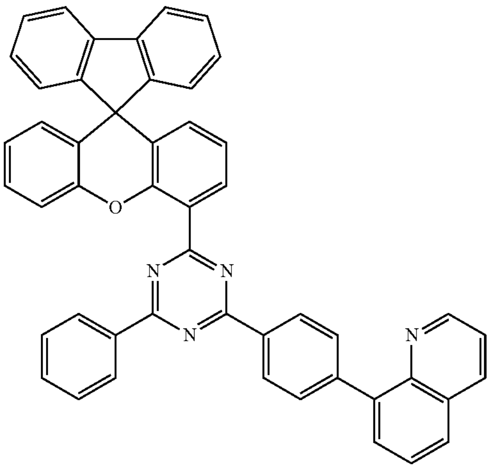
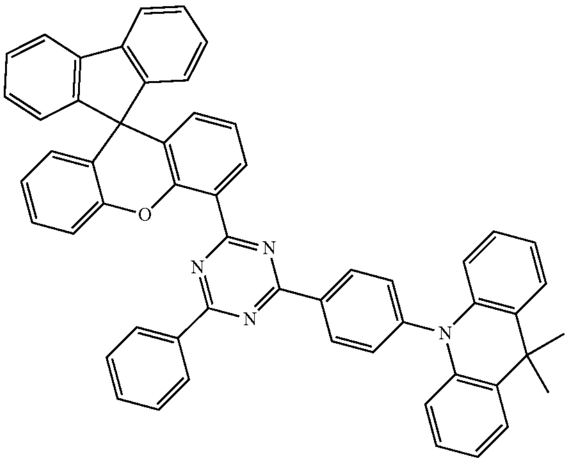
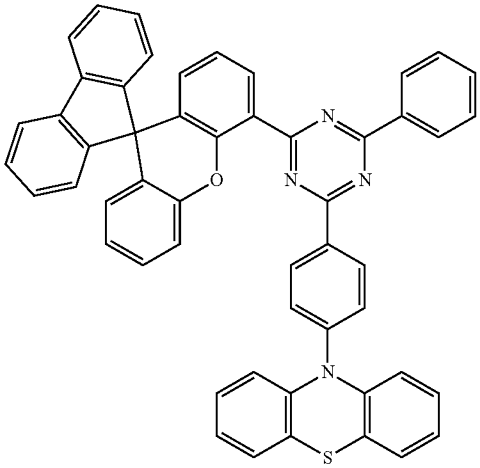
-continued
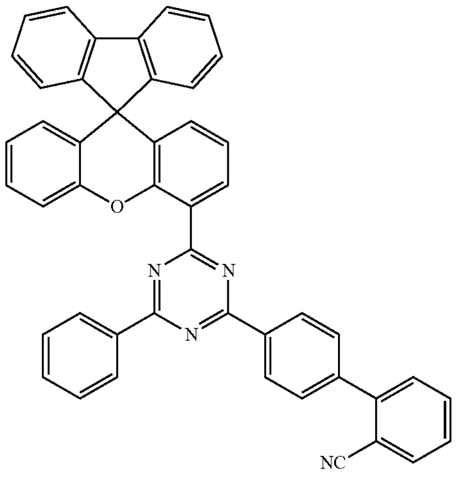
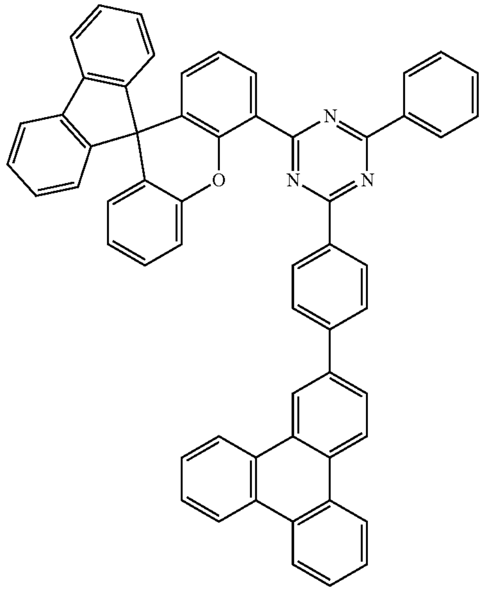
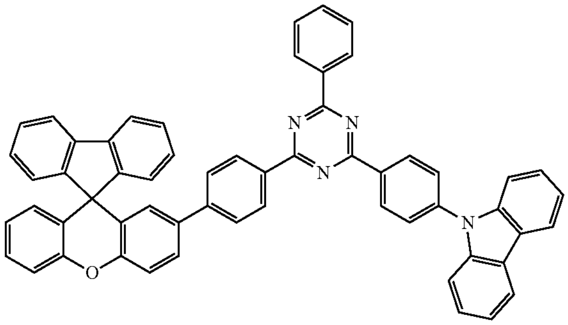

-continued
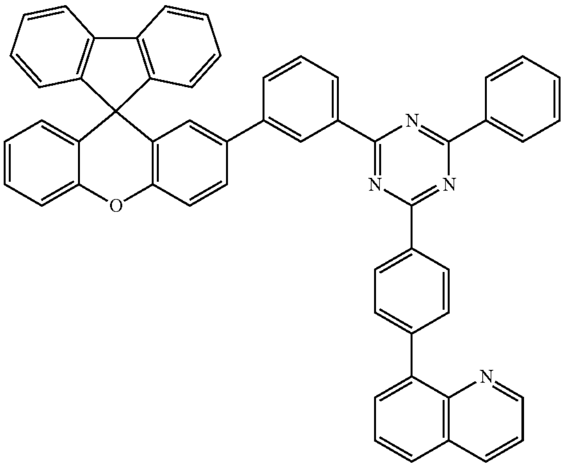
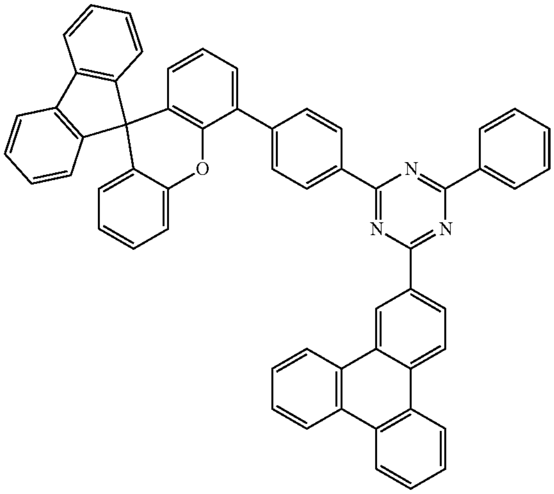
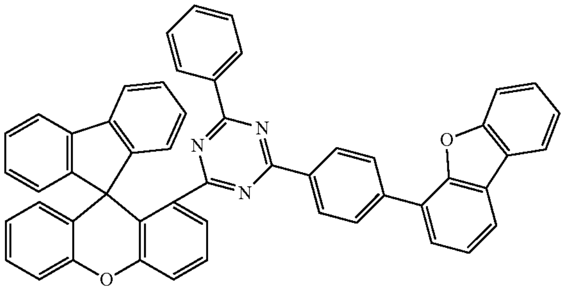
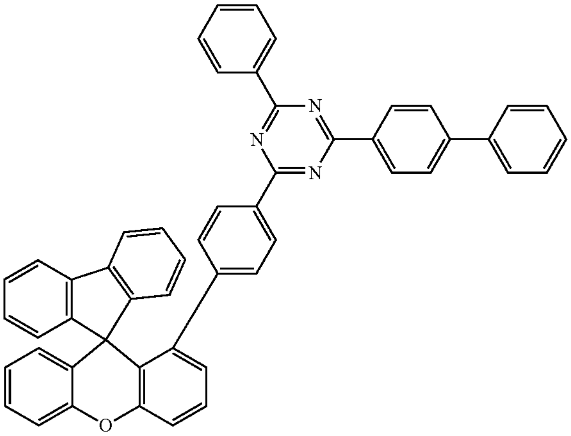
-continued
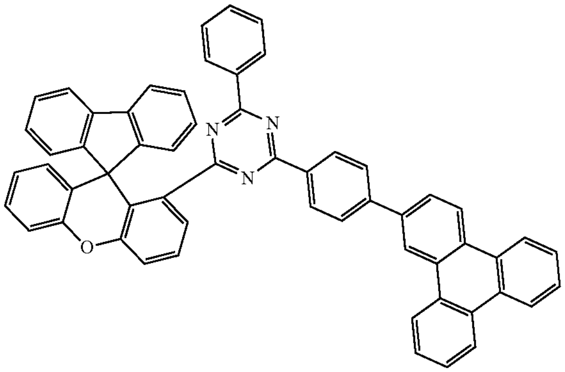
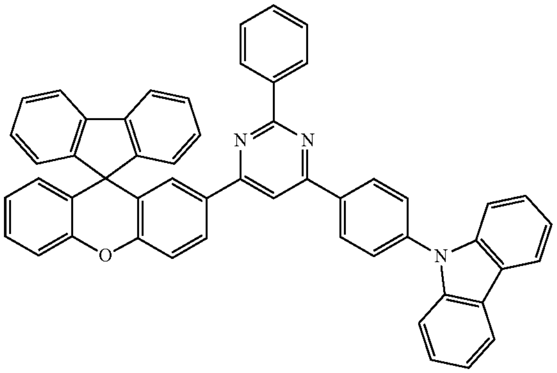
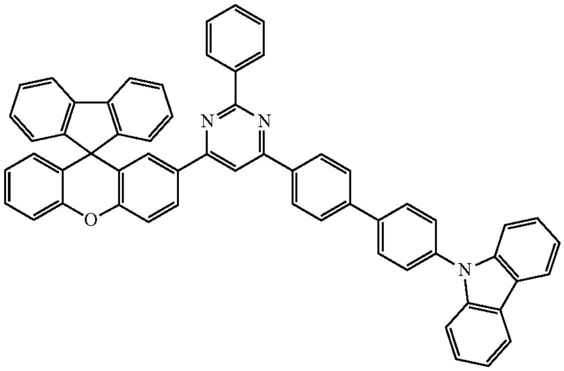
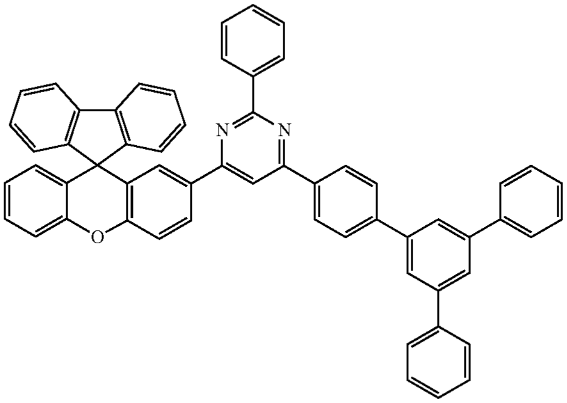

-continued
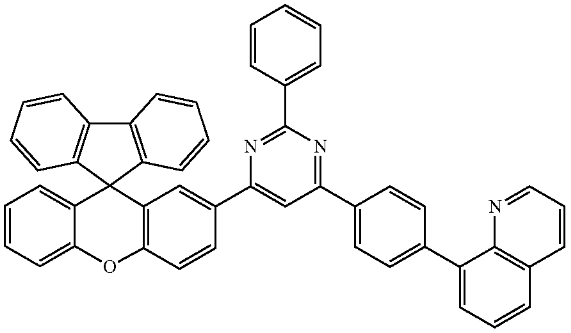
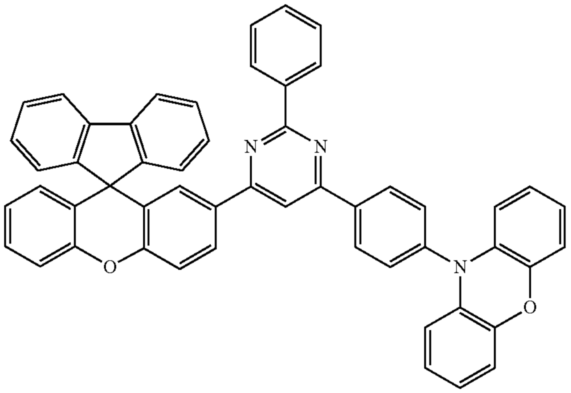
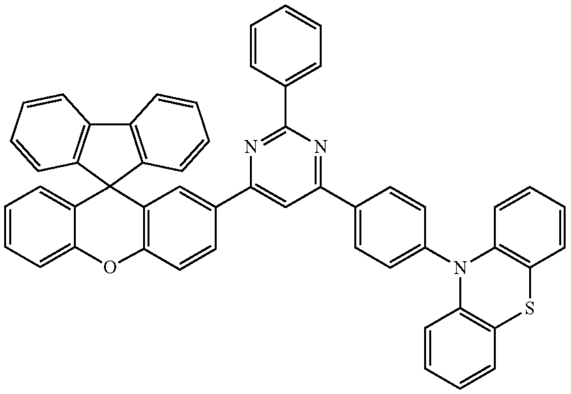
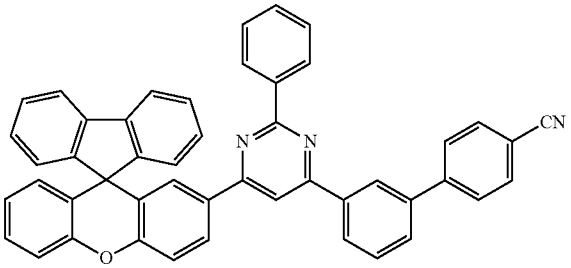
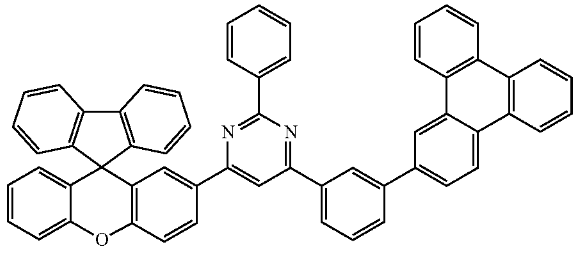
-continued
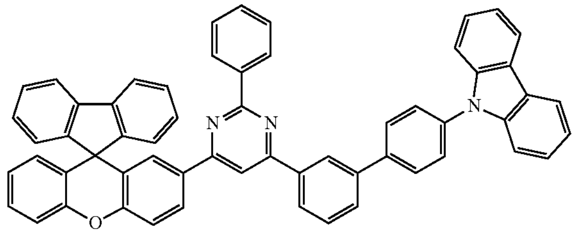
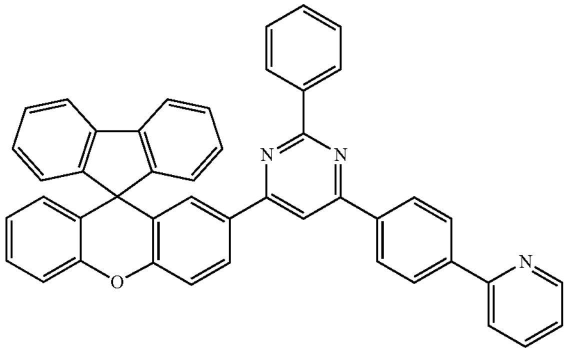
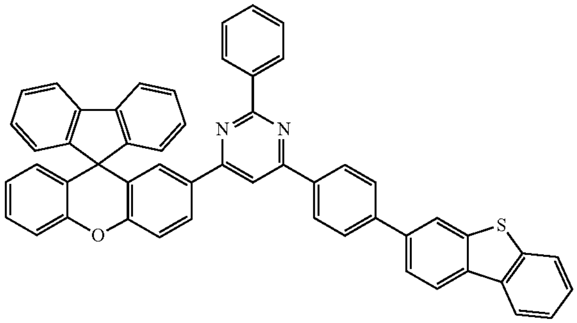
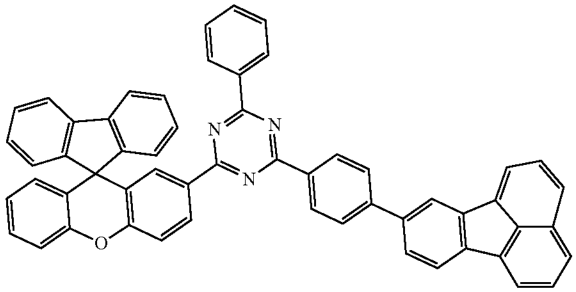
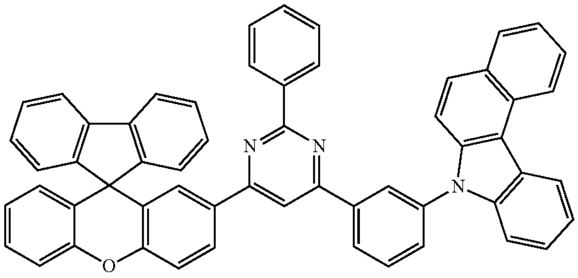 [SMILES: c1ccc(-c2nc(-c3cccc(-n4c5ccccc5c5c6ccccc6ccc54)c3)cc(-c3ccc4c(c3)C3(c5ccccc5O4)c4ccccc4-c4ccccc43)n2)cc1]

-continued

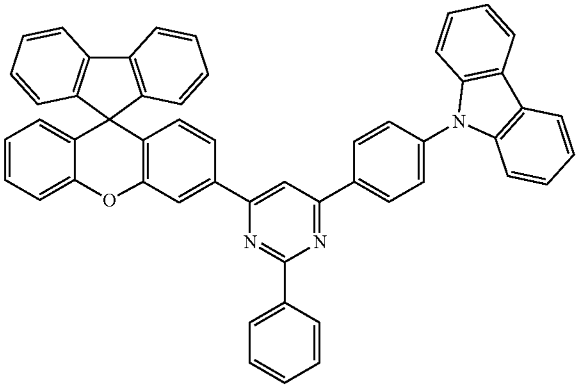 [SMILES: c1ccc(-c2nc(-c3ccc(-n4c5ccccc5c5ccccc54)cc3)cc(-c3ccc4c(c3)Oc3ccccc3C43c4ccccc4-c4ccccc43)n2)cc1]

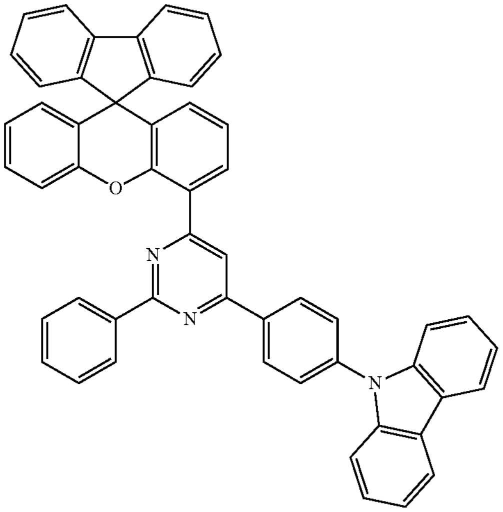

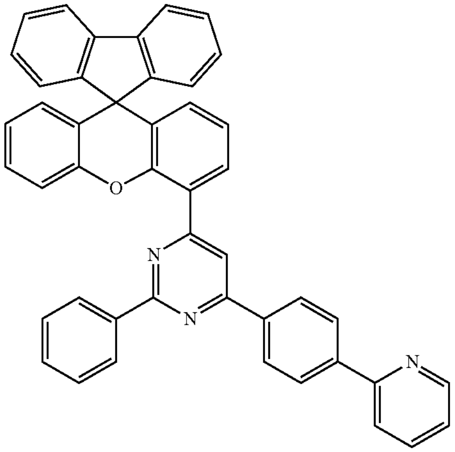

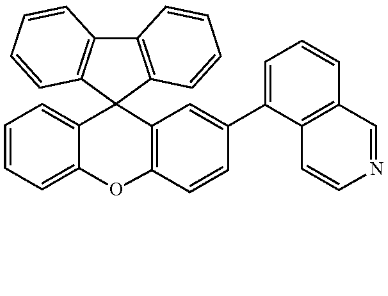

-continued

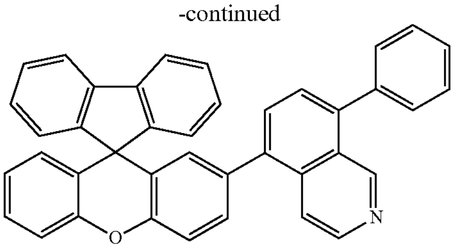

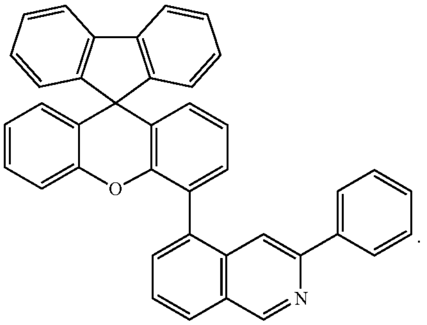

12. An organic light emitting device comprising:

a positive electrode;

a negative electrode provided to face the positive electrode;

a light emitting layer provided between the positive electrode and the negative electrode;

a hole injection layer and a hole transport layer successively provided between the positive electrode and the light emitting layer;

a first organic material layer provided between the hole transport layer and the light emitting layer;

an electron transport layer provided between the negative electrode and the light emitting layer; and a second organic material layer provided between the light emitting layer and the electron transport layer, the second organic material layer comprises a compound of the following Formula 2:

[Formula 2]

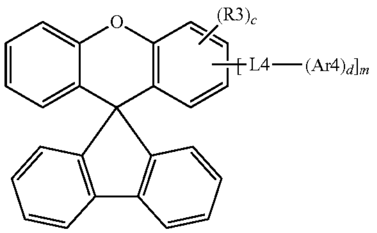

wherein in Formula 2:

L4 is a direct bond, a substituted or unsubstituted arylene group, or a substituted or unsubstituted divalent heterocyclic group;

Ar4 is a phenyl group substituted with —CN, a naphthylene group, or trifluoromethoxy group; a substituted or unsubstituted biphenyl group; a substituted or unsubstituted terphenyl group; a substituted or unsubstituted fluorene group; a substituted or unsubstituted phenanthrene group; a substituted or unsubstituted triphenylene group; a substituted or unsubstituted dibenzofuran group; a substituted or unsubstituted dibenzothiophene group; a substituted or unsubstituted benzocarbazole group; a triazine substituted with at least one of a biphenyl, phenyl-substituted naphthylene, dibenzofuran, dibenzothiophene, pyridine, terphenyl group, phenalene, fluorene, phenylpyridine, or dibenzofuran-substituted phenyl; a pyrimidine substituted with at least one of a biphenyl, phenyl-substituted naphthylene, dibenzofuran, dibenzothiophene, pyridine, terphenylene, phenalene, fluorene, or dibenzofuran-substituted phenyl; a quinazoline substituted with phenyl, biphenyl, or naphthyl; an isoquinoline substituted with phenyl; a 1,10-phenanthroline group; a pyridazine substituted with phenyl or naphthyl; a benzo [4,5] imidazo[1,2-f] phenanthridine group; a phenyl-substituted 1,3,4-oxadiazole; a phenyl-substituted 1,3,4-thiadiazole; a fluoranthene group; a dihydrophenoxazine group; or a dihydrophenothiazine group;

R3 is hydrogen, deuterium, a halogen group, a cyano group, a nitro group, a substituted or unsubstituted alkyl group, a substituted or unsubstituted haloalkyl group, a substituted or unsubstituted haloalkoxy group, a substituted or unsubstituted cycloalkyl group, a substituted or unsubstituted alkenyl group, a substituted or unsubstituted aryl group, or a substituted or unsubstituted heterocyclic group;

c is an integer from 0 to 3;

d is 1;

m is an integer from 1 to 4; and when c and m are each independently 2 or more, the substituents in the parentheses are the same as or different from each other, with the proviso that the compound of Formula 2 in the second organic material layer does not include following compound:

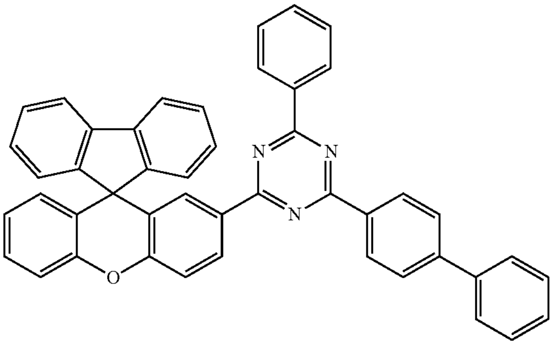 [SMILES: c1ccc(-c2ccc(-c3nc(-c4ccccc4)nc(-c4ccc5c(c4)C4(c6ccccc6O5)c5ccccc5-c5ccccc54)n3)cc2)cc1]

and wherein the first organic material layer comprises a compound selected from among the following compounds:

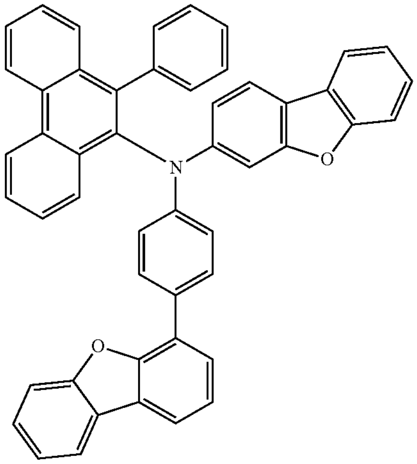

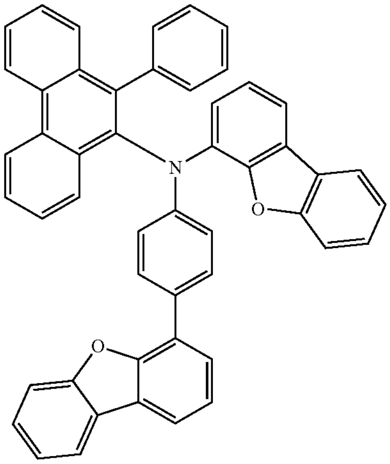

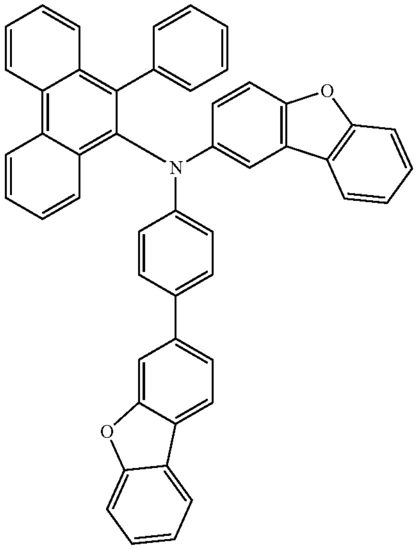

-continued
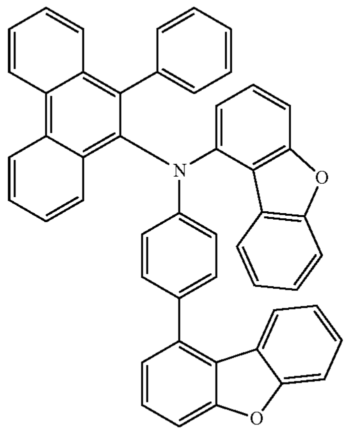
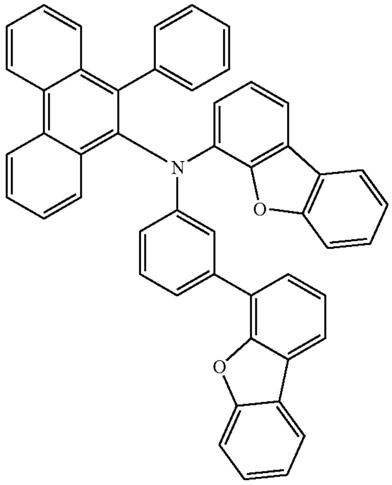
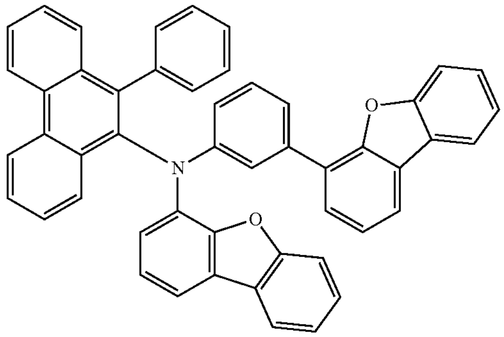
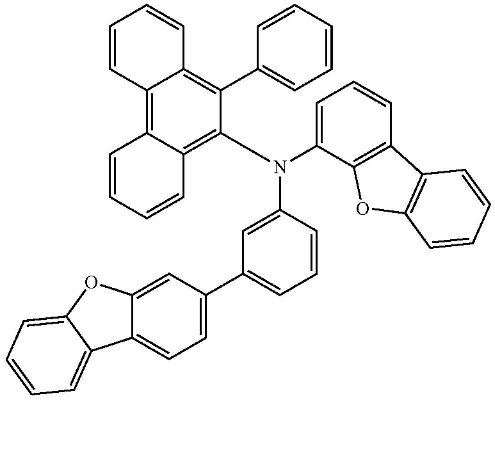
-continued
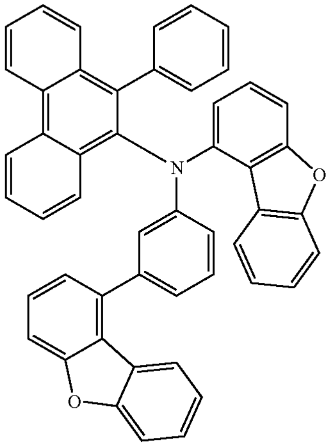
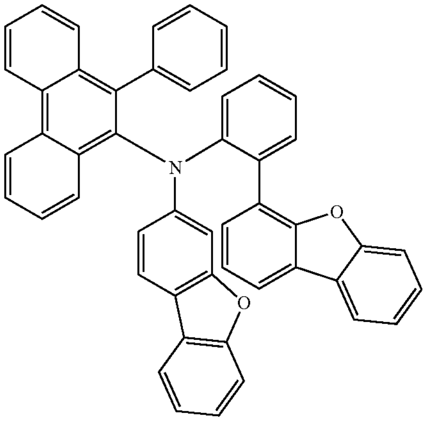
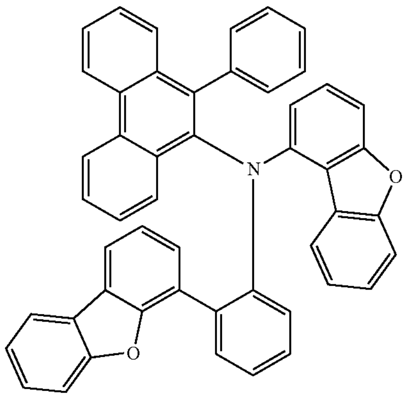
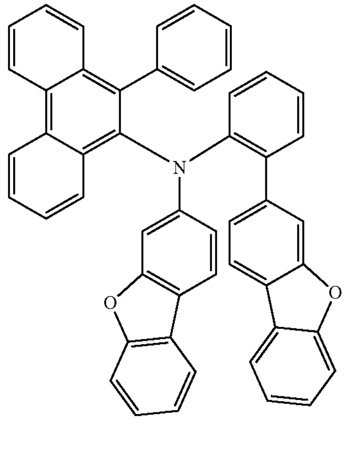

-continued
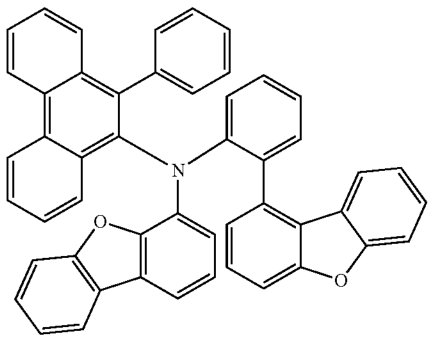
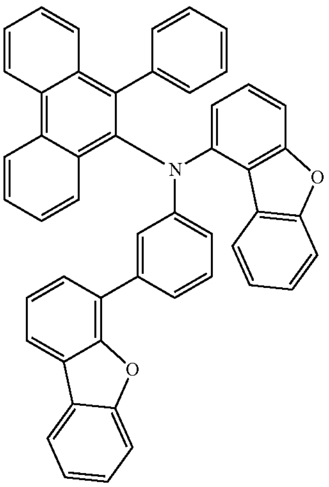
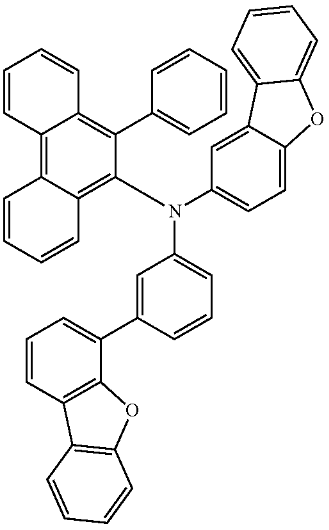
-continued
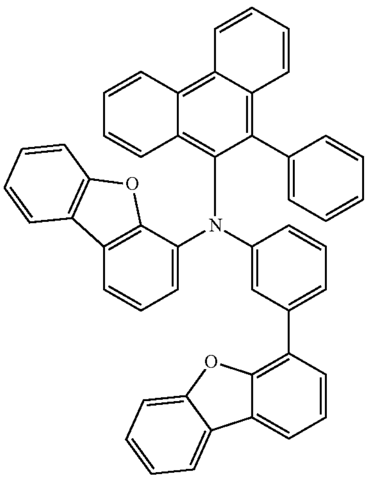
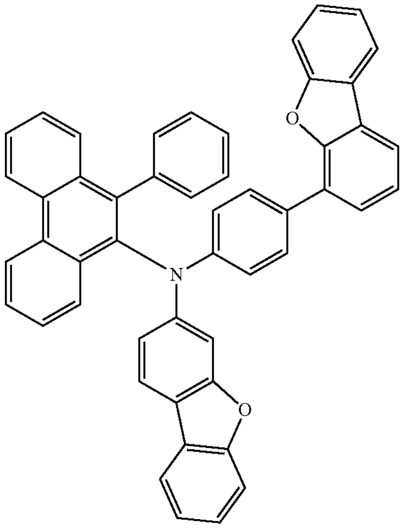
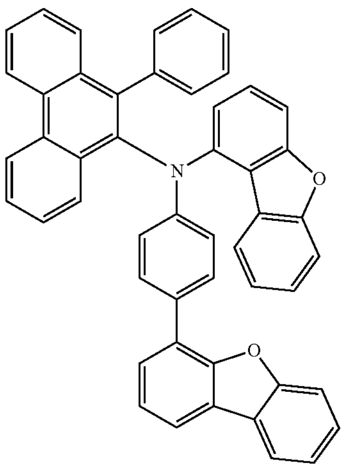

-continued
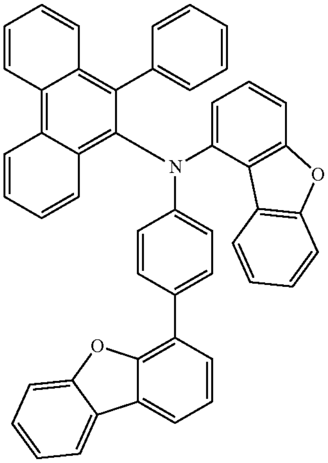
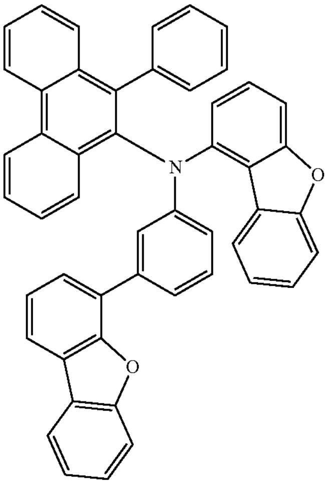
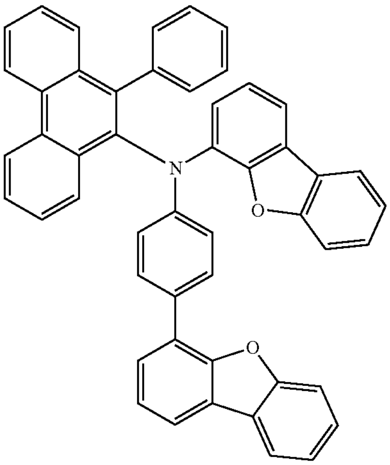
-continued
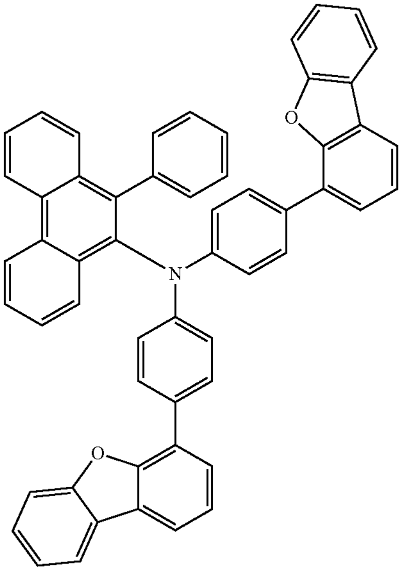
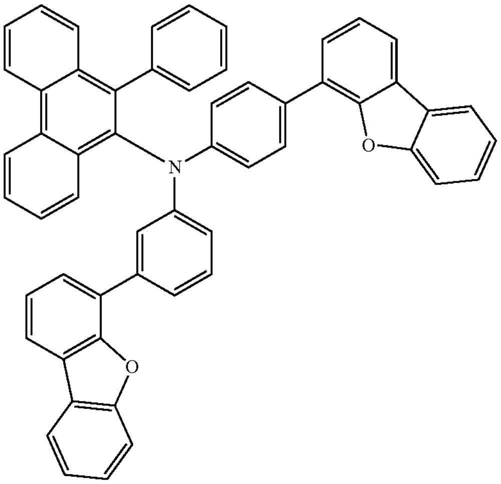
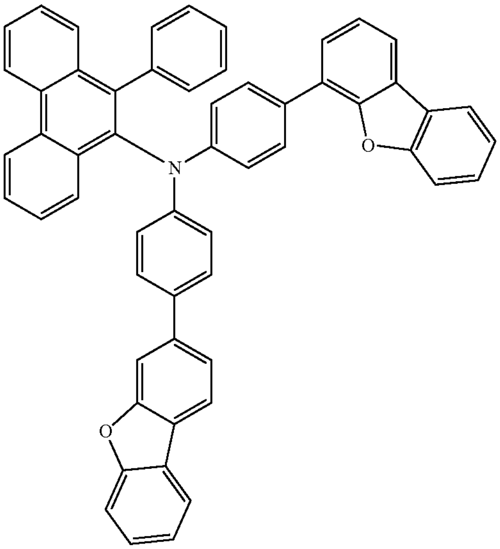

-continued
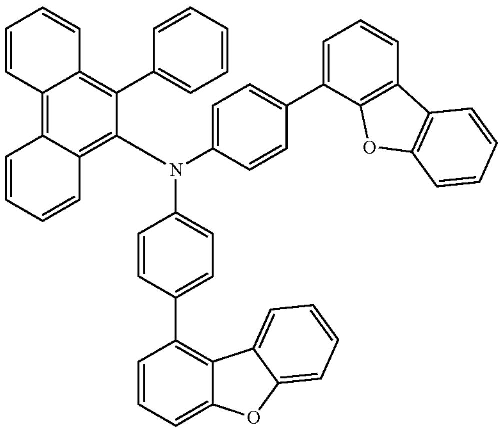
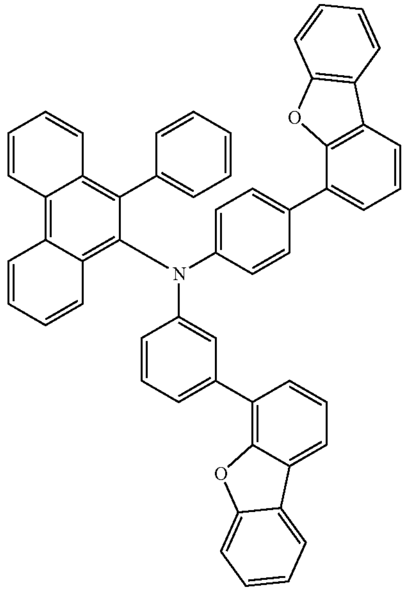
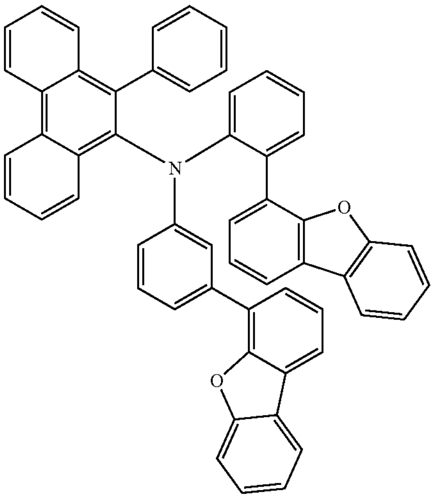
-continued
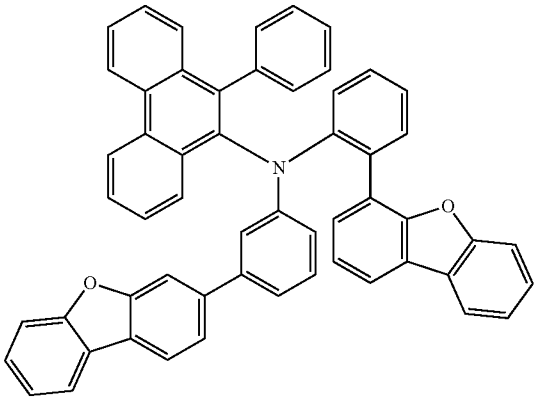
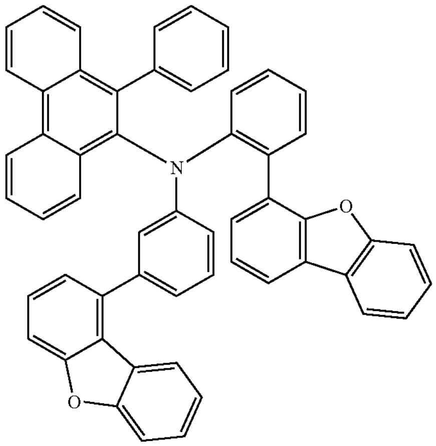
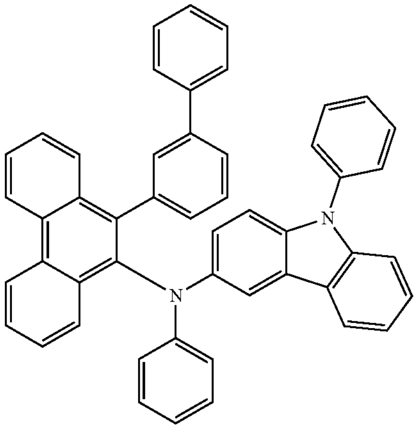

-continued
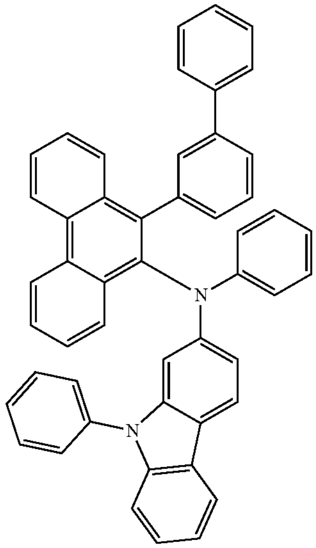
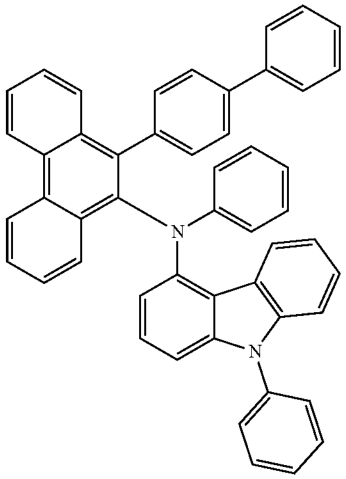
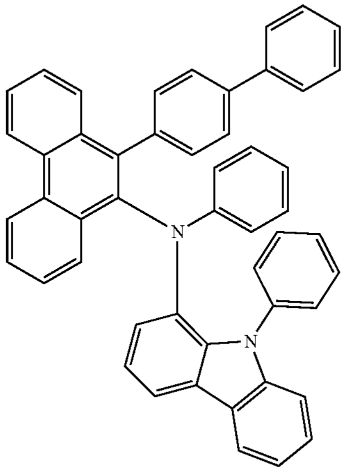
-continued
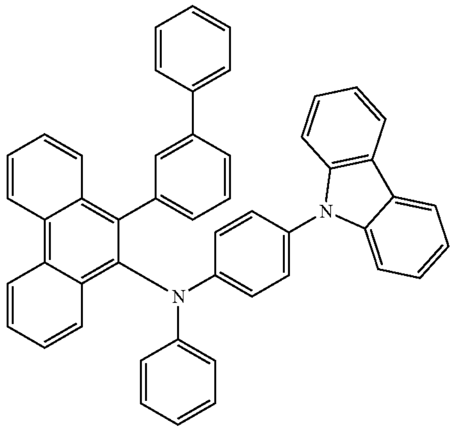
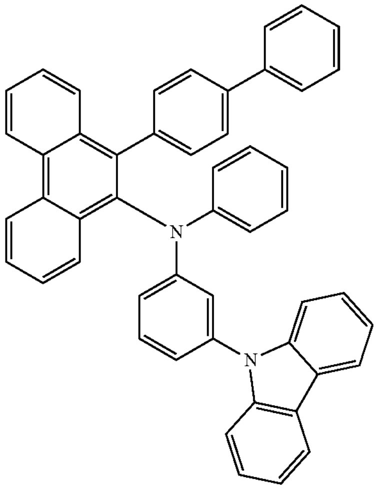
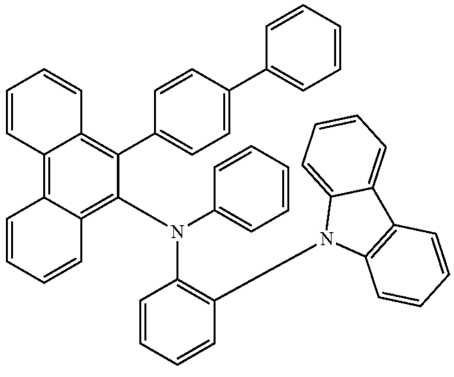

-continued
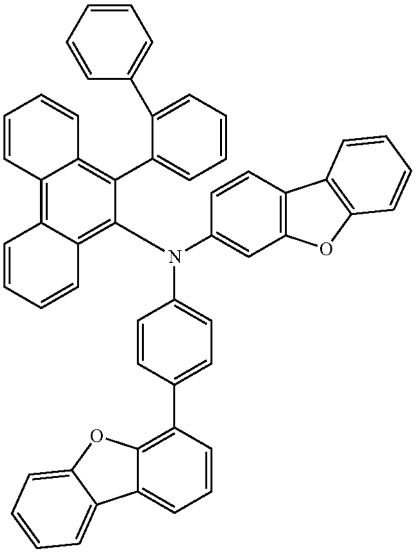
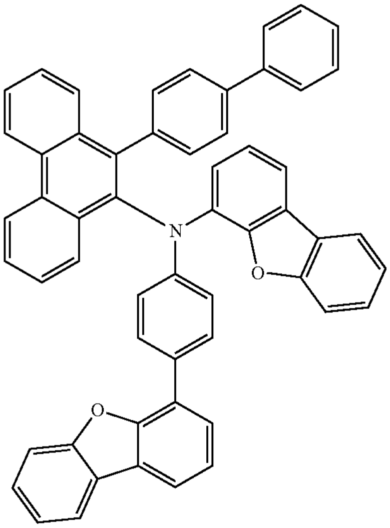
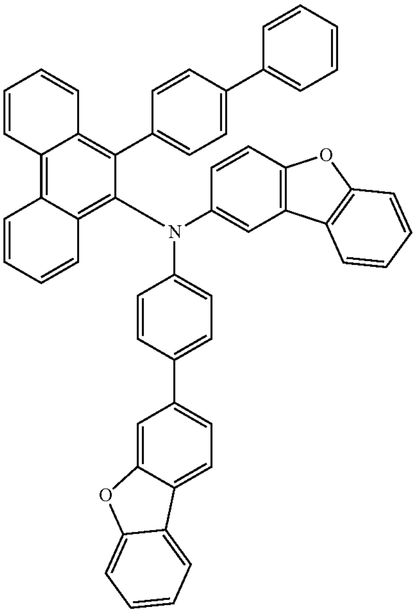
-continued
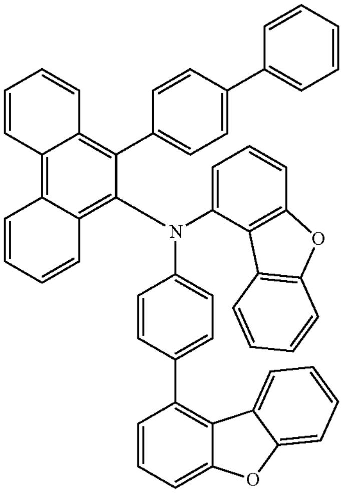
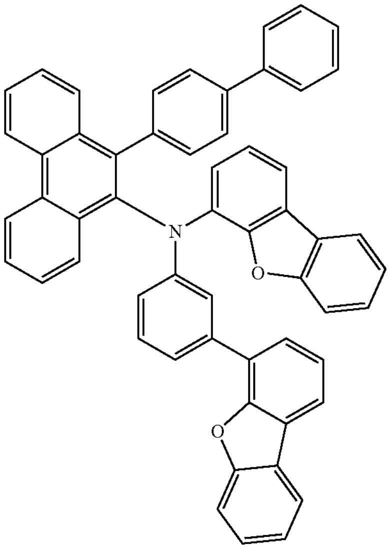
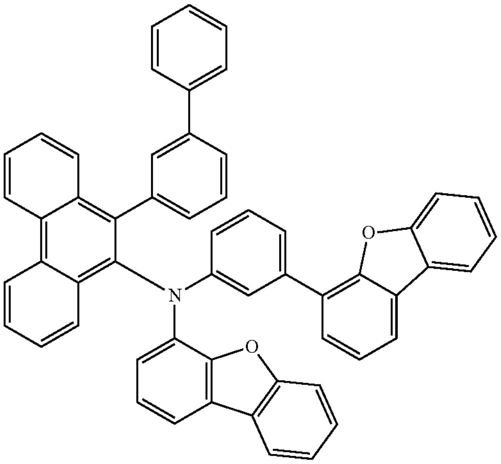

-continued
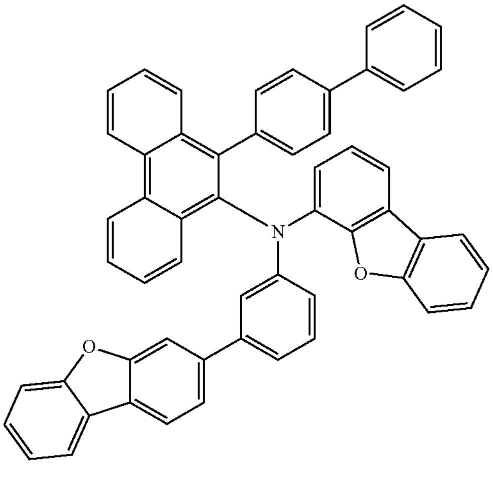
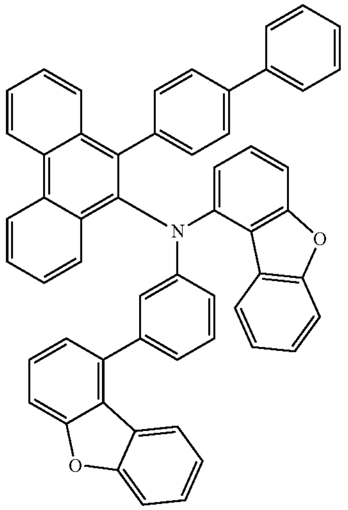
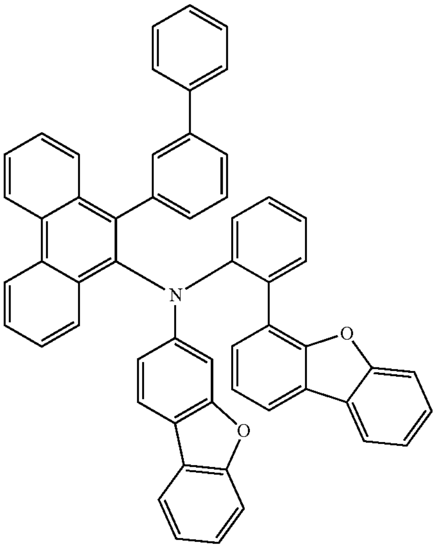
-continued
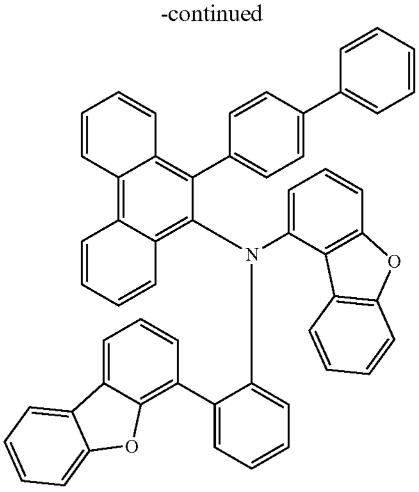
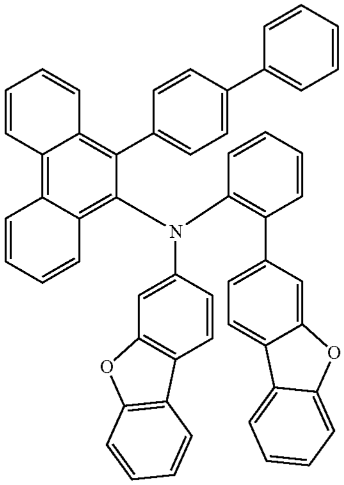
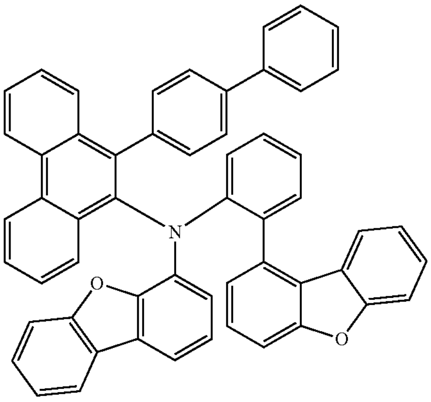

-continued
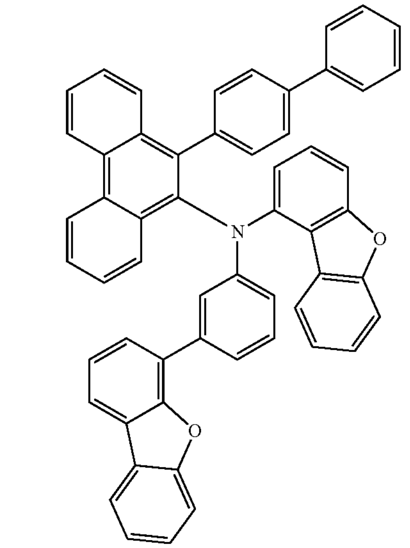
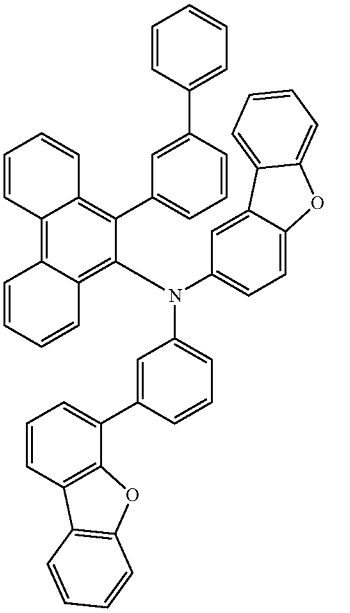
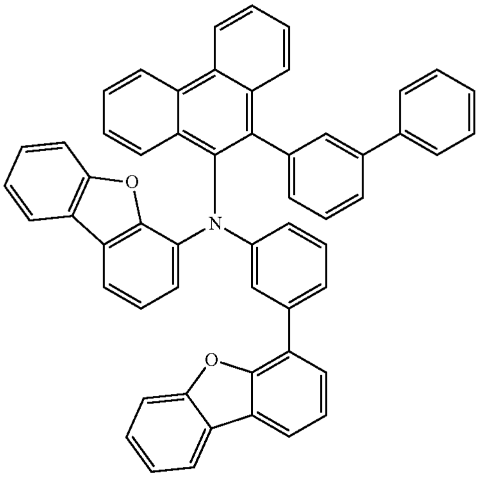
-continued
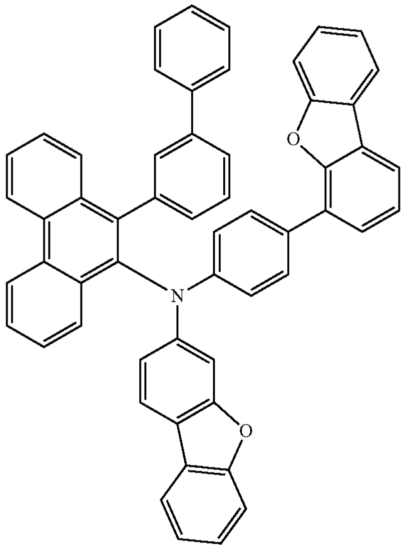
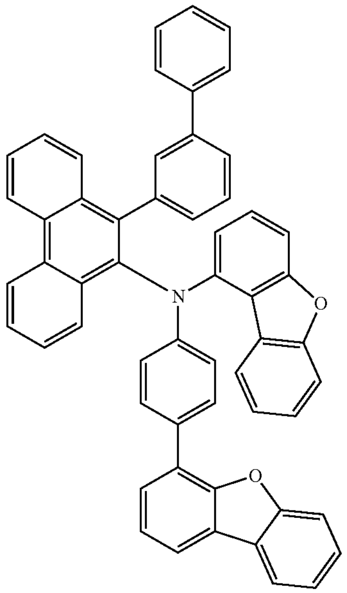
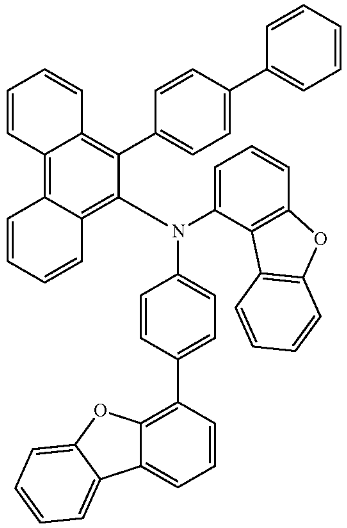

-continued
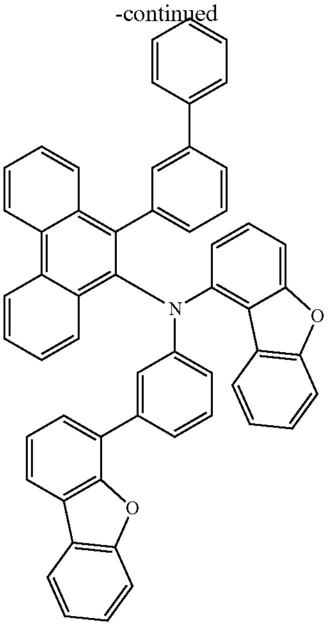
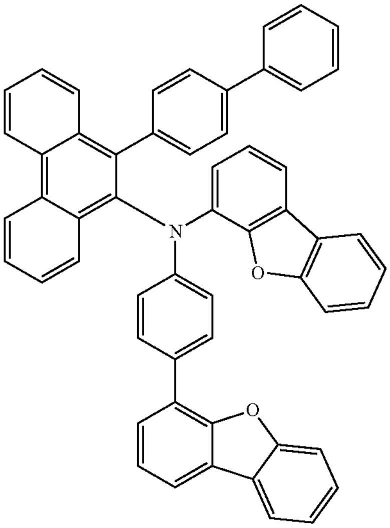
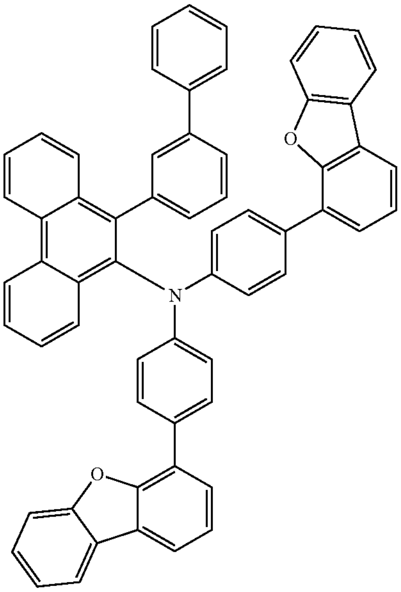
-continued
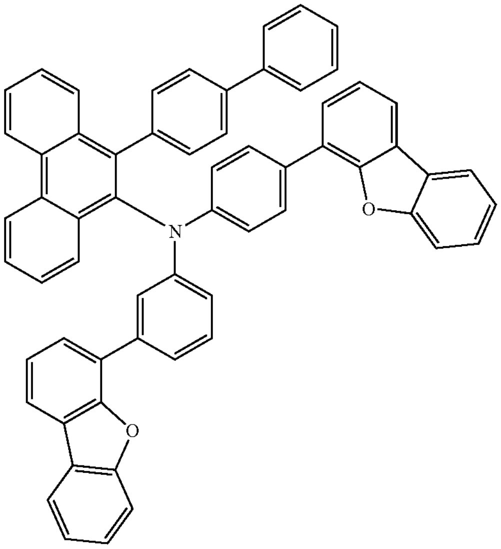
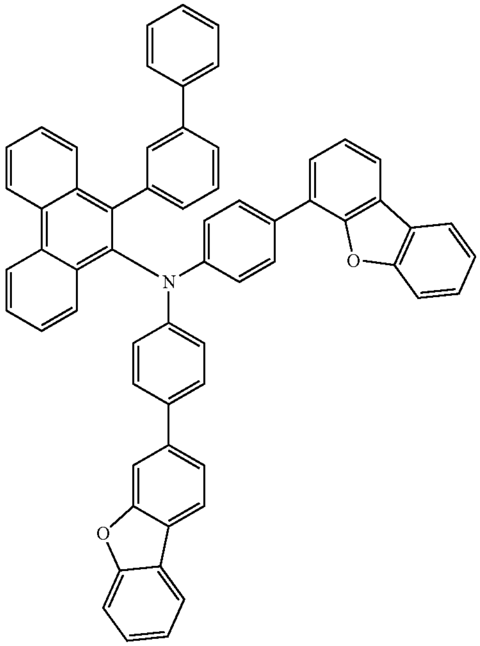

-continued
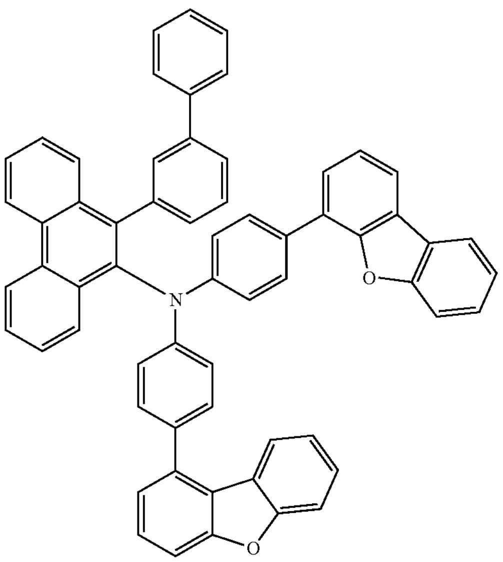
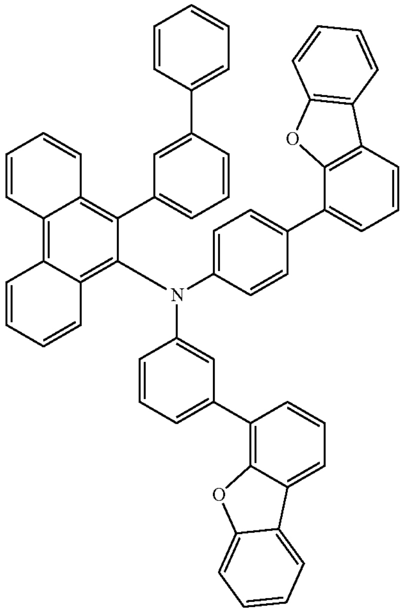
-continued
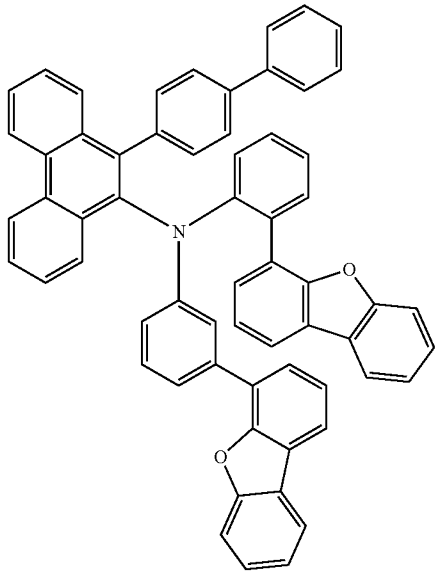
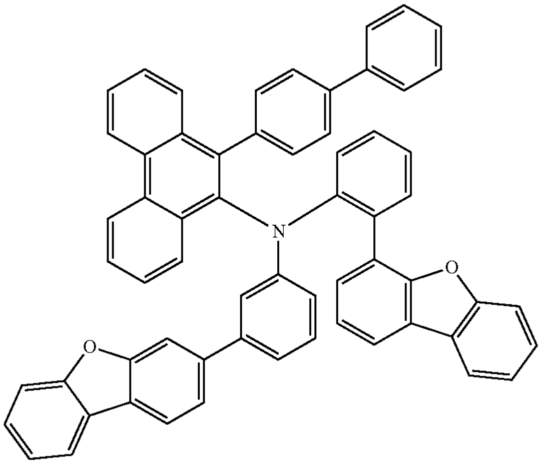
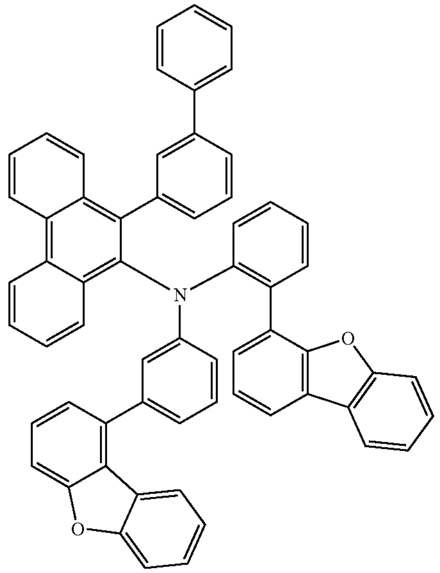

-continued
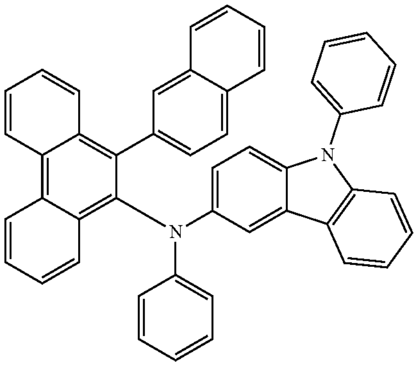
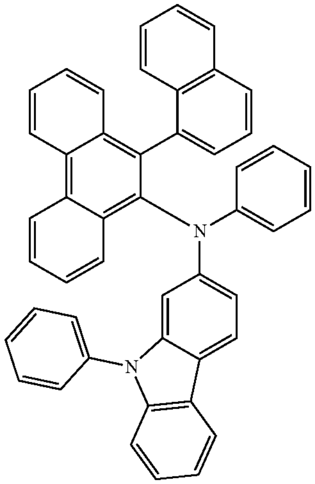
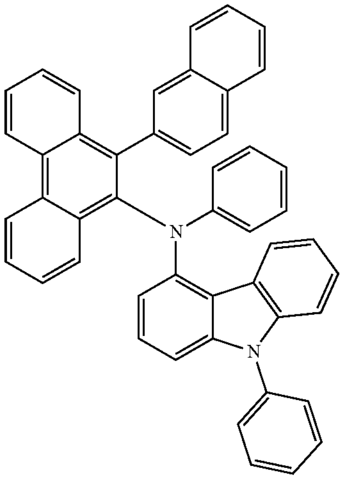
-continued
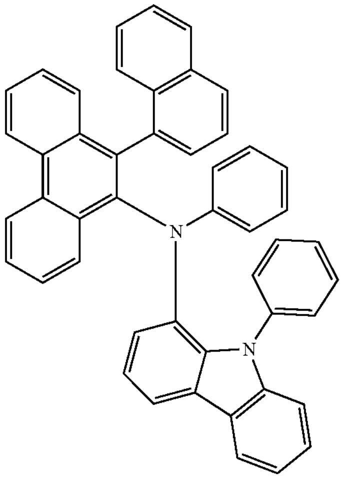
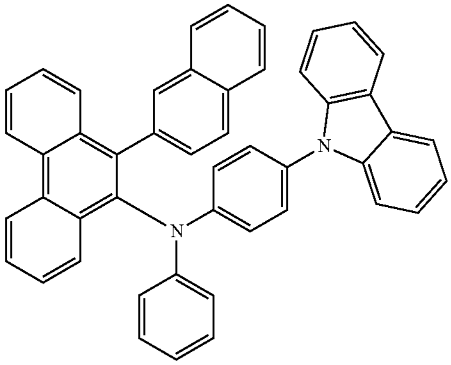
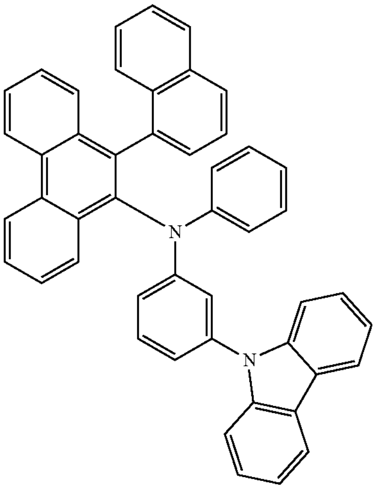
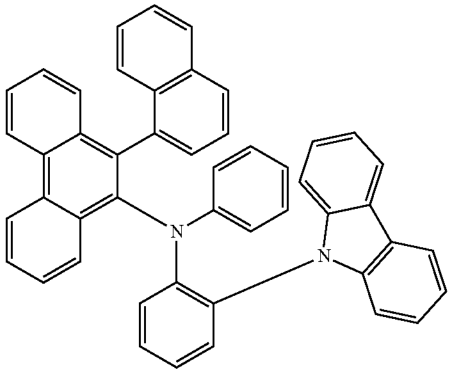

-continued
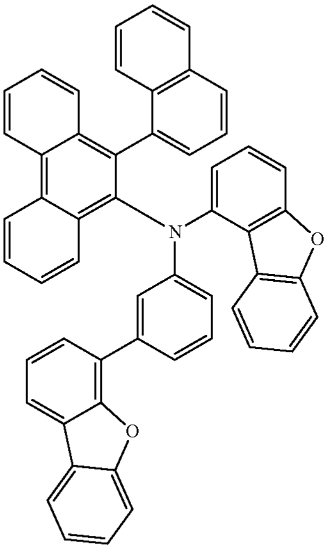
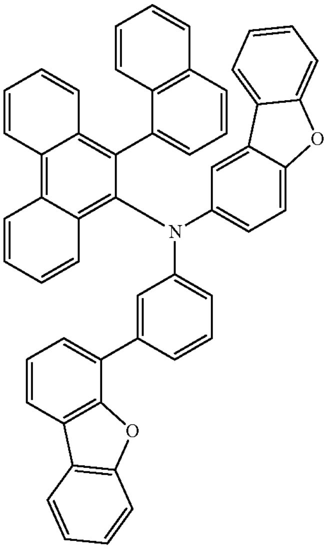
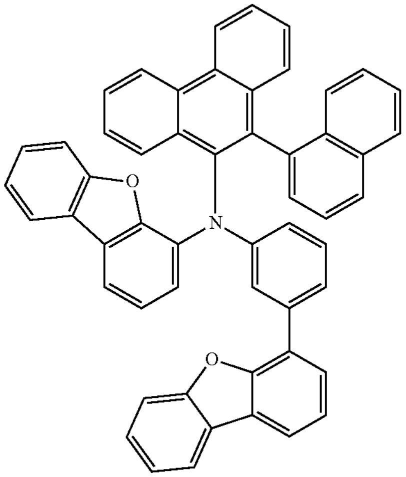
-continued
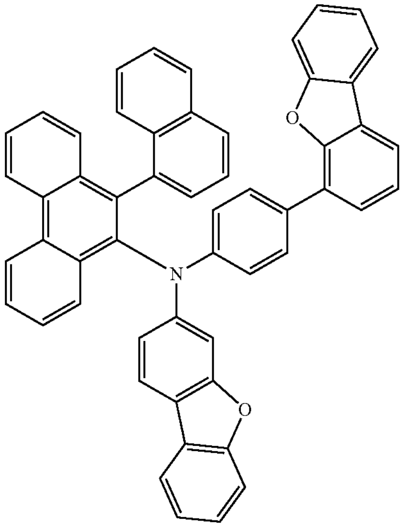
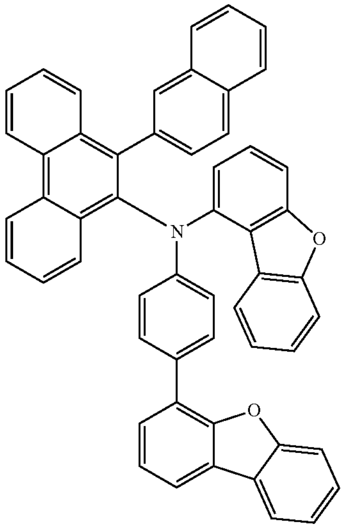
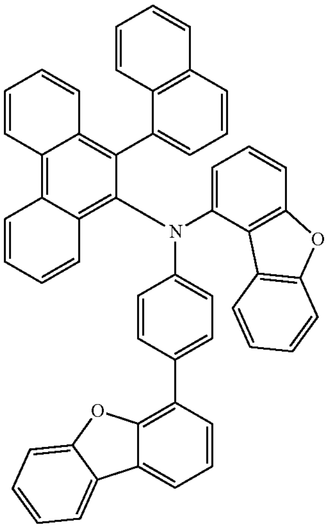

-continued
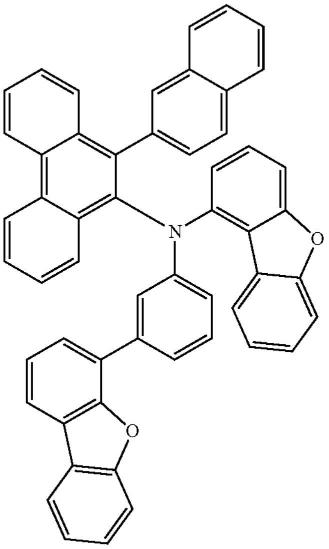
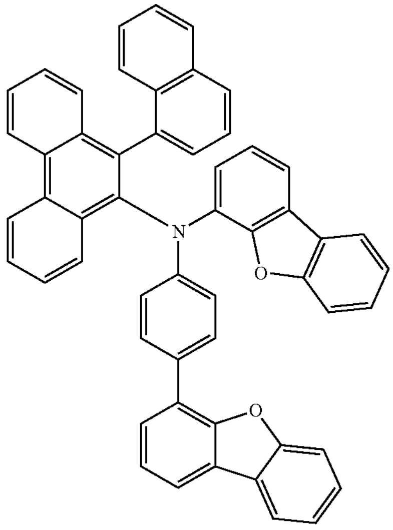
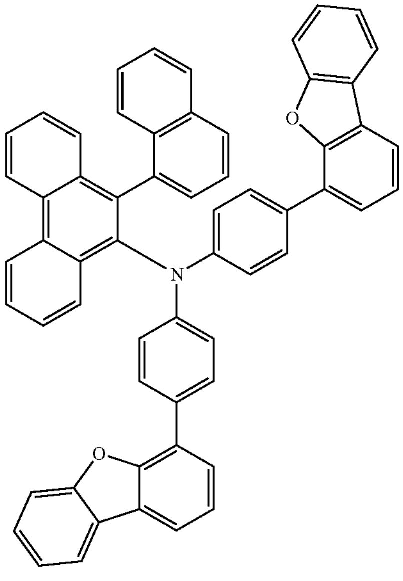
-continued
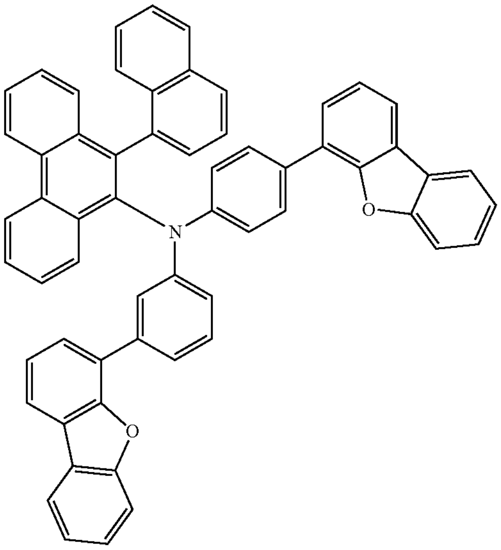
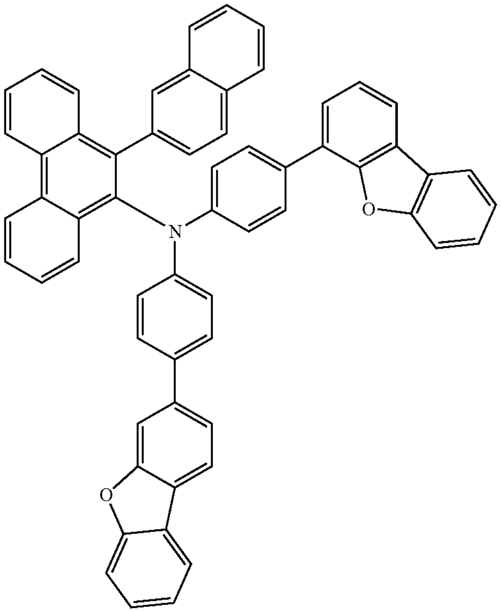
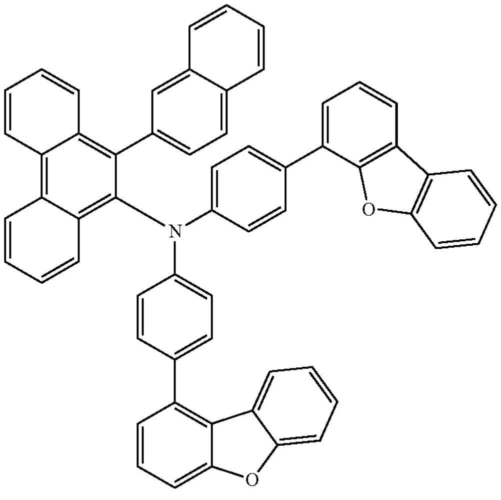

-continued
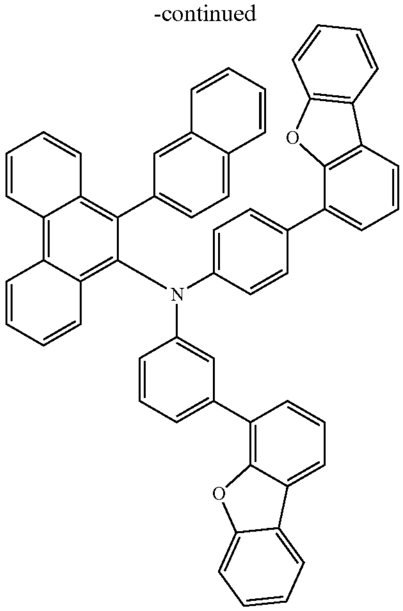
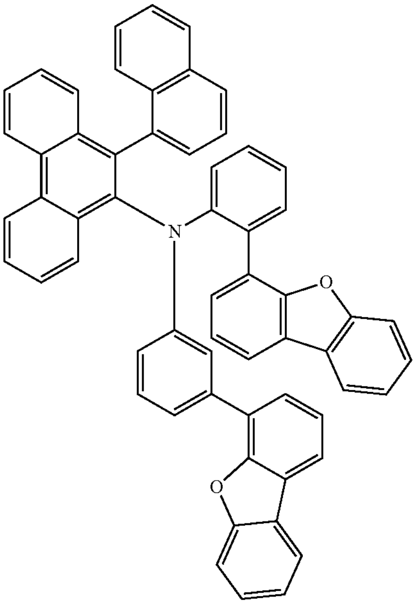
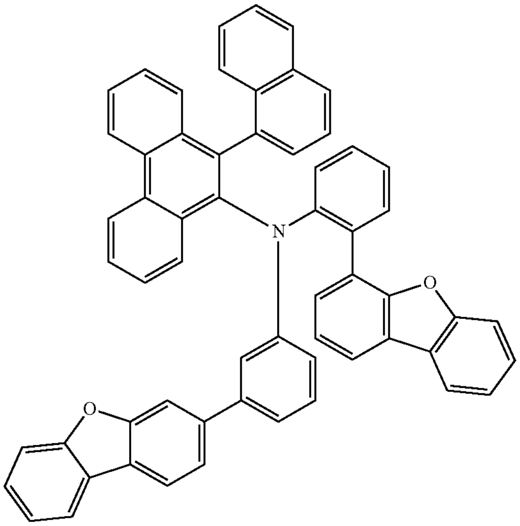
-continued
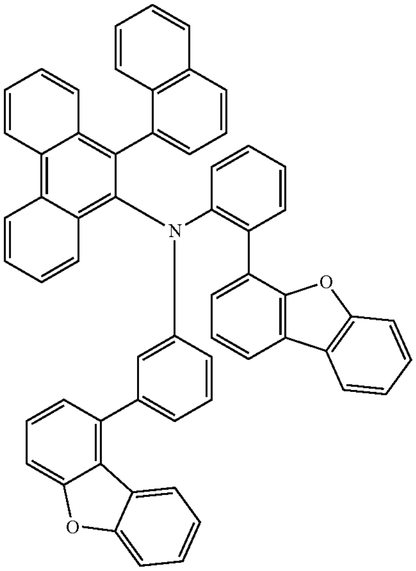
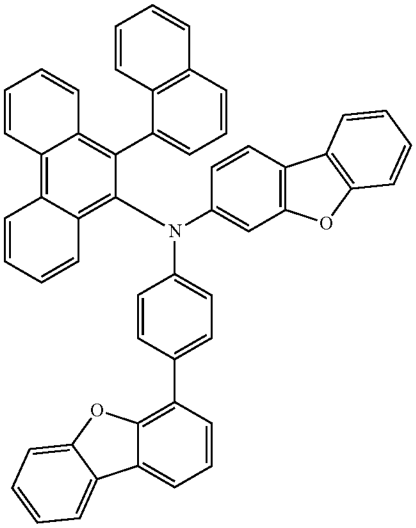
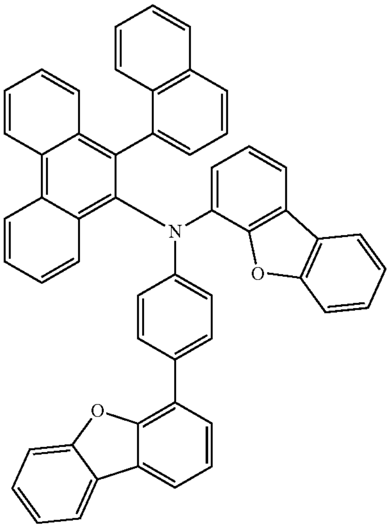

-continued
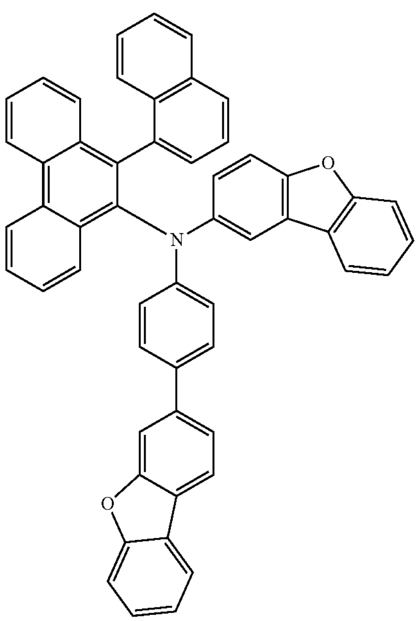
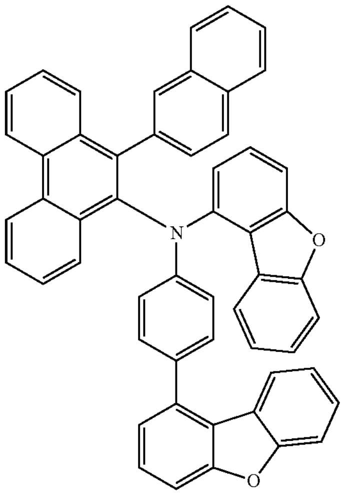
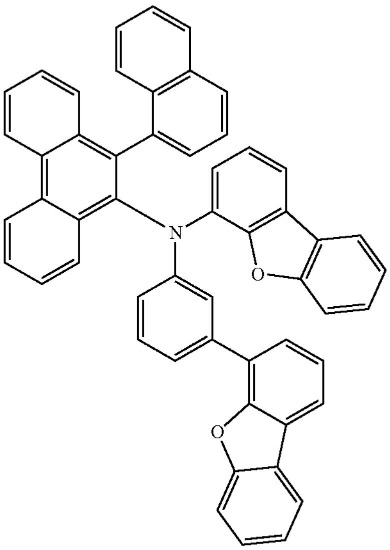
-continued
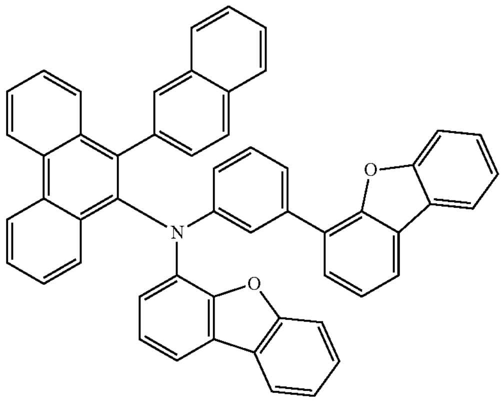
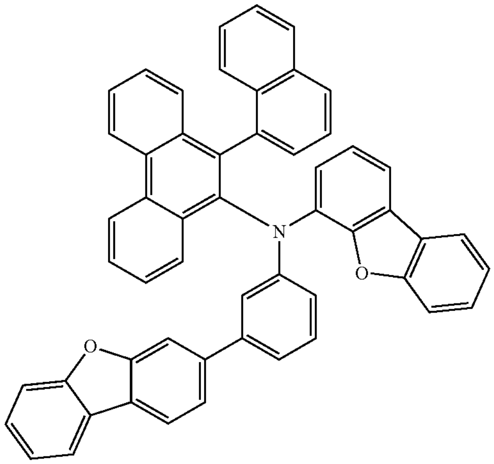
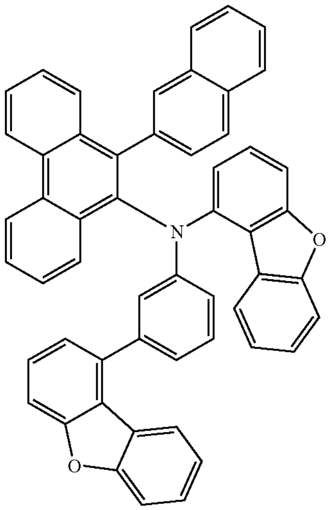

-continued
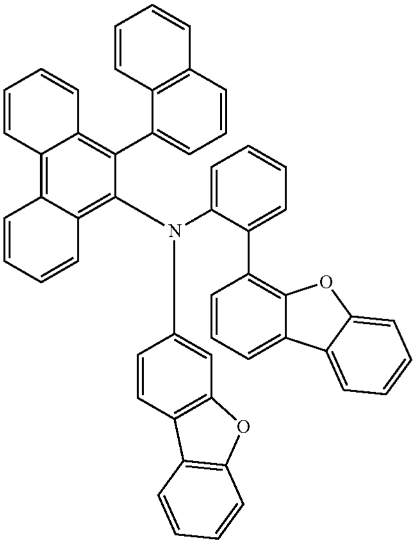
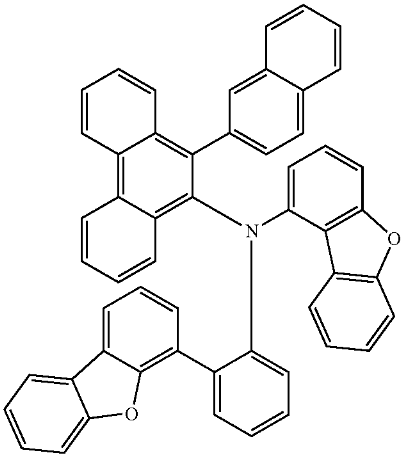
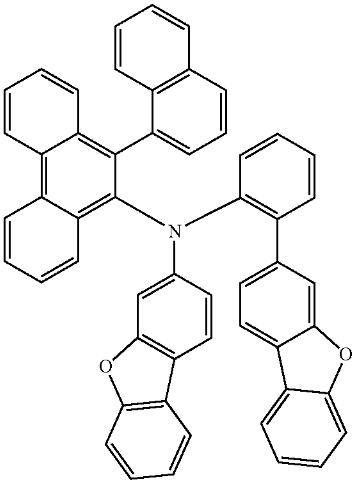
-continued
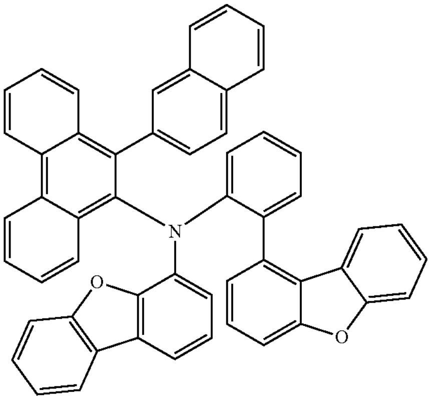
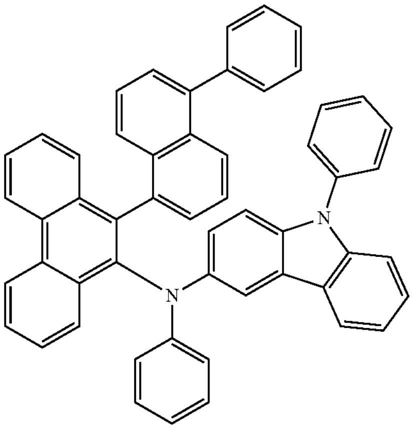
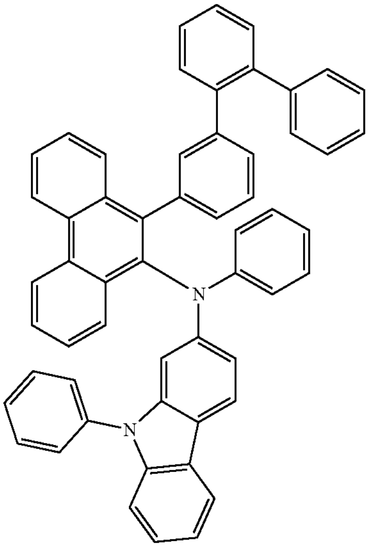

-continued
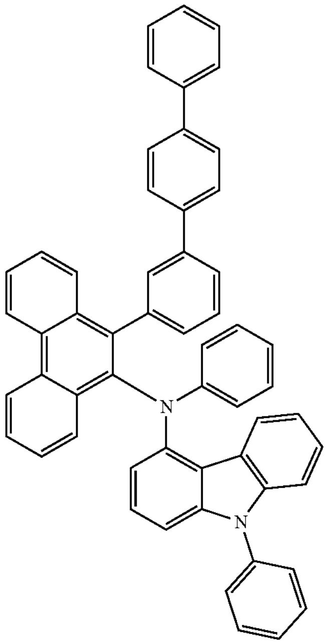
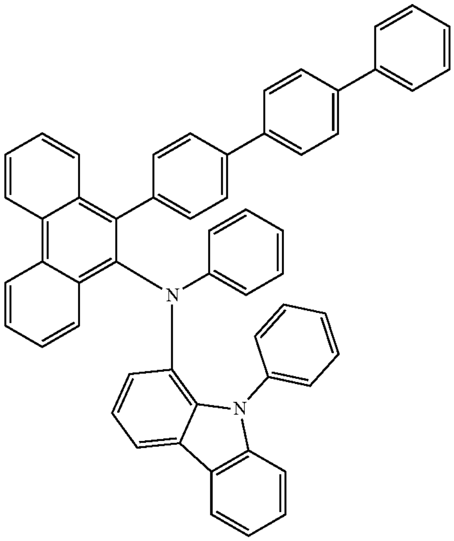
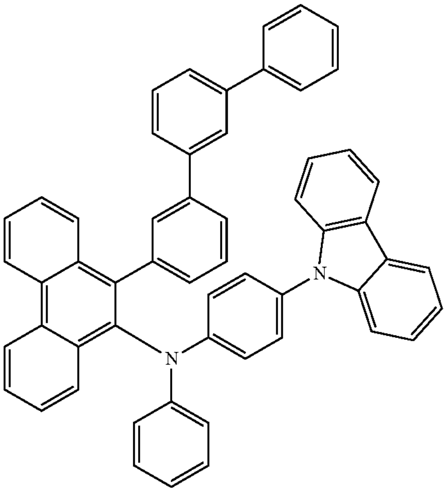
-continued
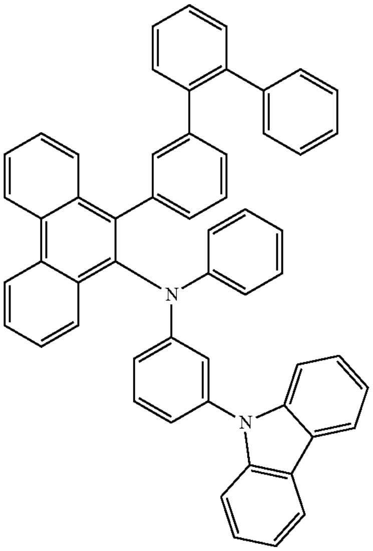
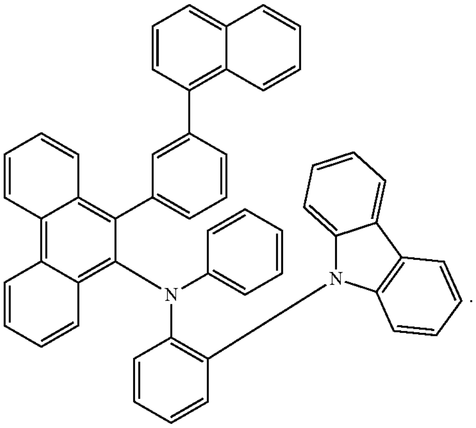 [SMILES: c1ccc(N(c2ccccc2-n2c3ccccc3c3ccccc32)c2c(-c3cccc(-c4cccc5ccccc45)c3)c3ccccc3c3ccccc23)cc1]
13. The organic light emitting device of claim 12, wherein Formula 2 is any one of the following Formulae 2-1 to 2-3:
[Formula 2-1]
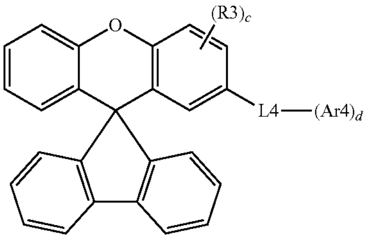
[Formula 2-2]
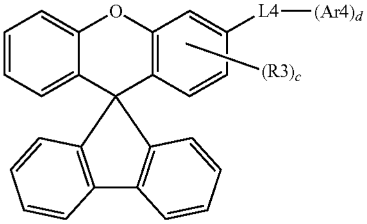

-continued

[Formula 2-3]

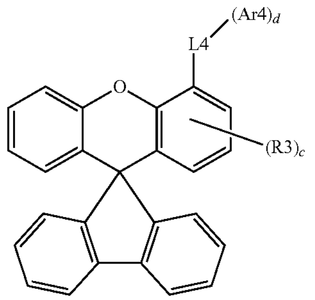

wherein in Formulae 2-1 to 2-3, R3, L4, Ar4, c, and d are the same as the definitions in Formula 2.

14. The organic light emitting device of claim 12, wherein L4 is a direct bond, a substituted or unsubstituted arylene group, or a substituted or unsubstituted divalent heterocyclic group comprising N.

15. The organic light emitting device of claim 12, wherein the compound of Formula 2 is selected from among the following compounds:

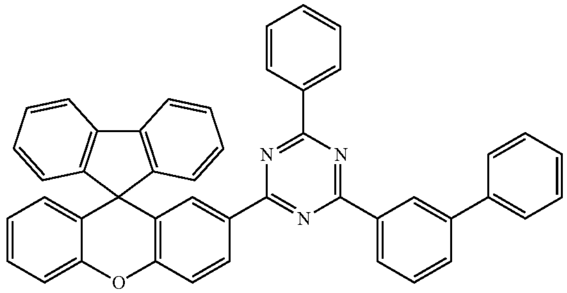

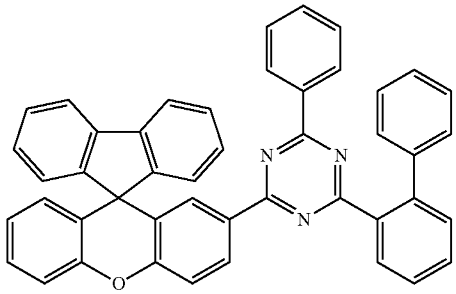

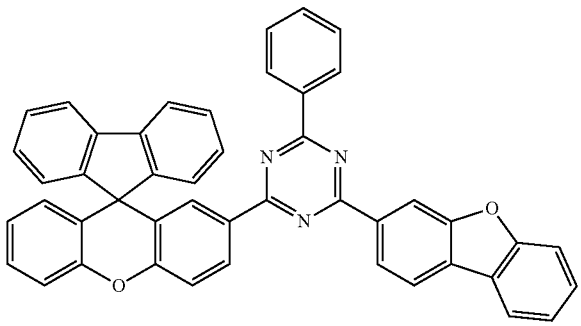

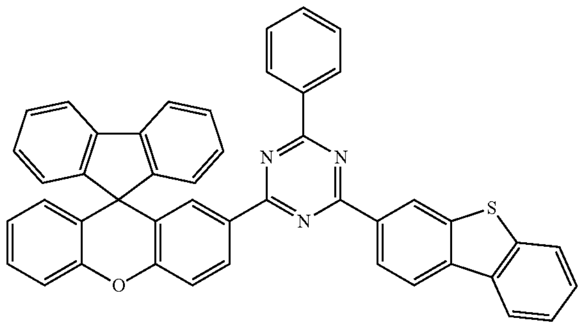

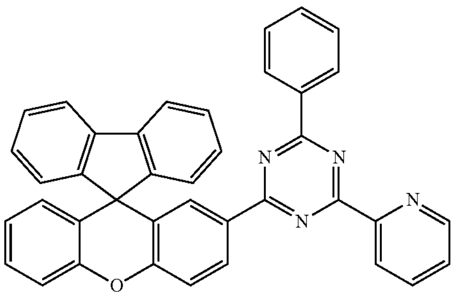

-continued
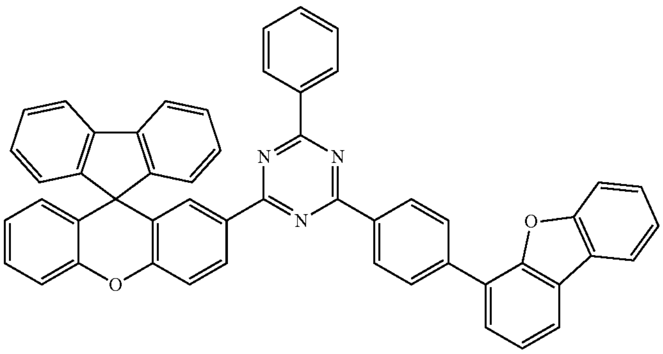
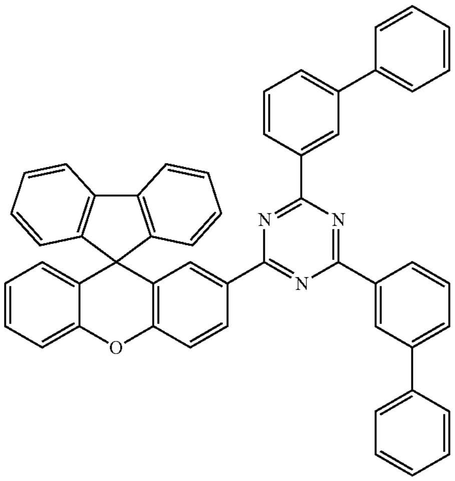
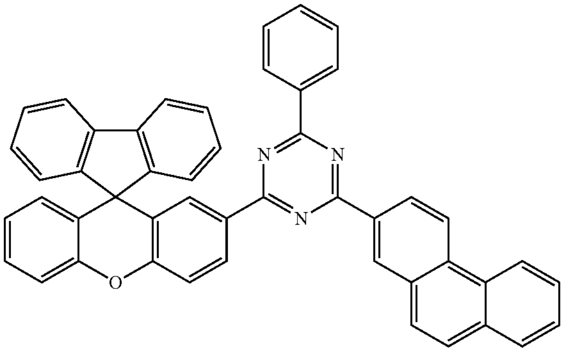
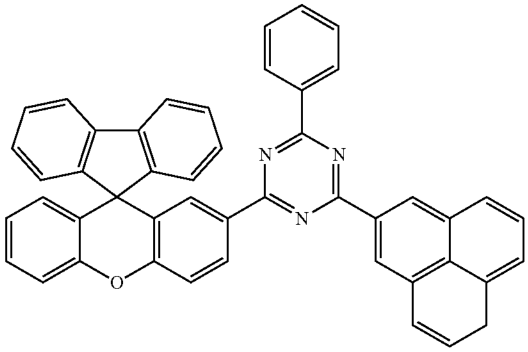
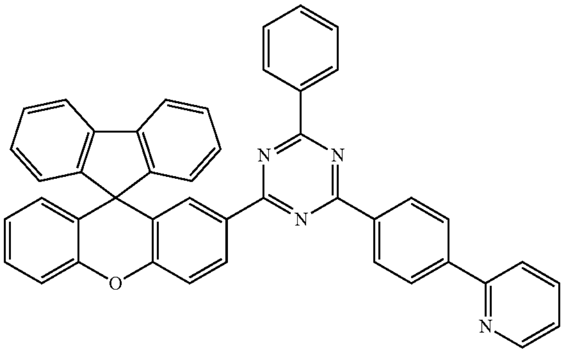
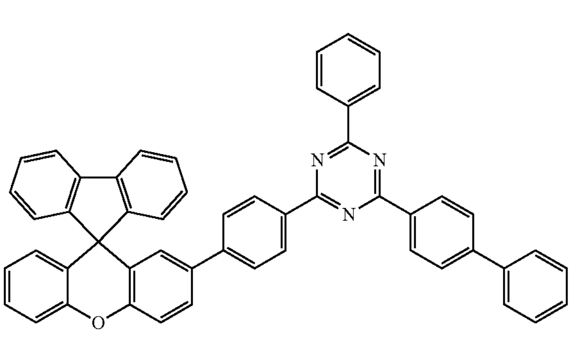
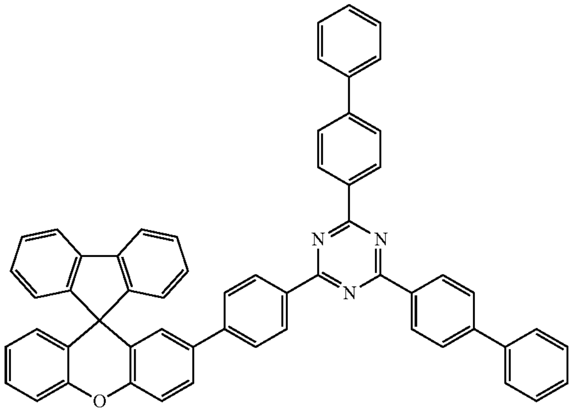

-continued
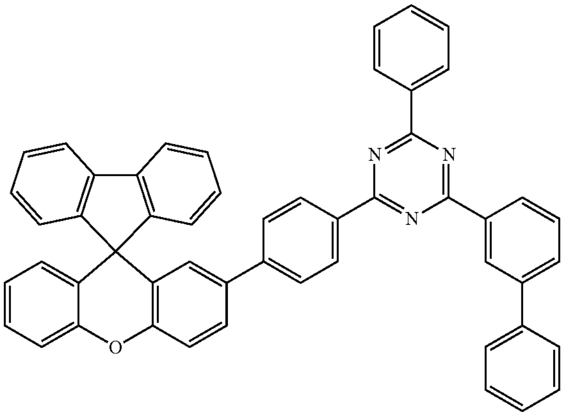
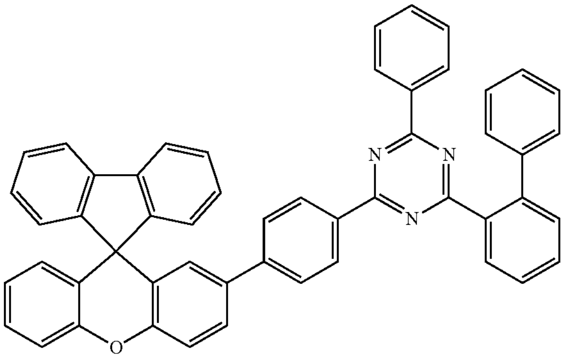
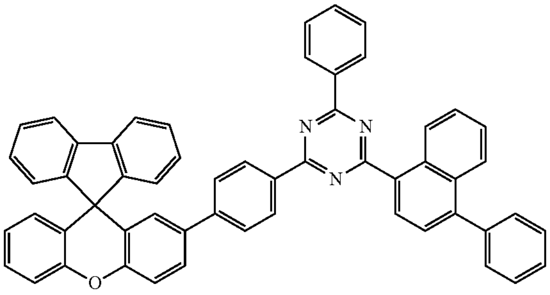
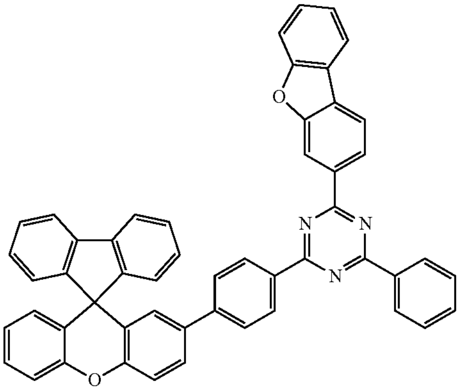
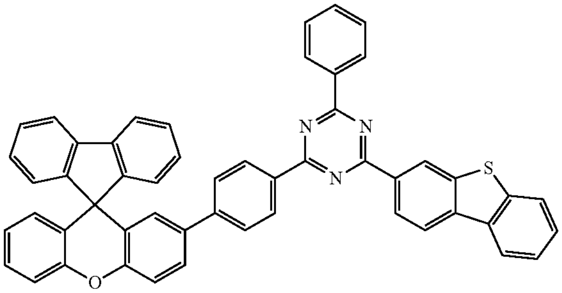
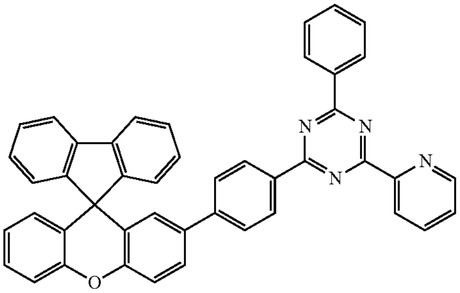
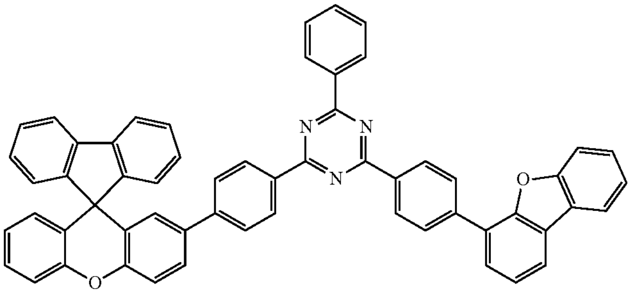
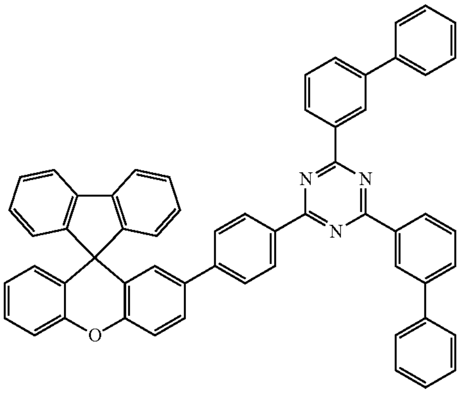

-continued
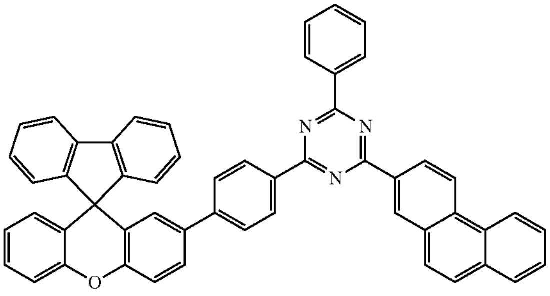
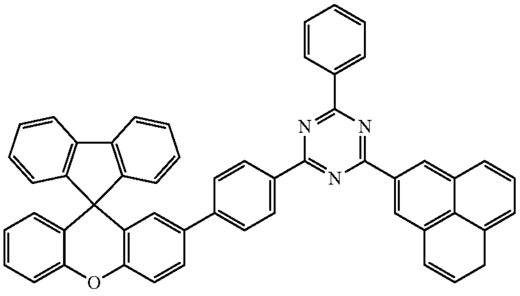
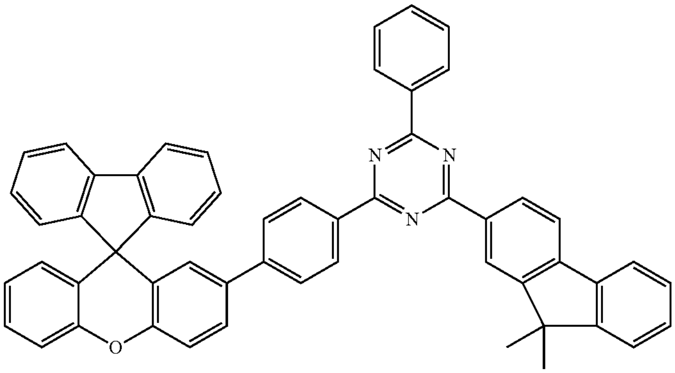
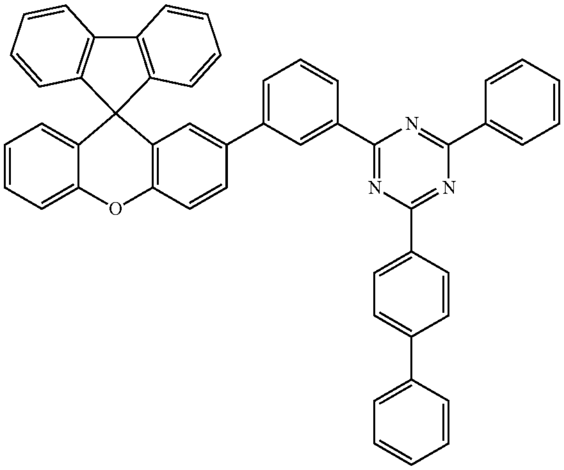
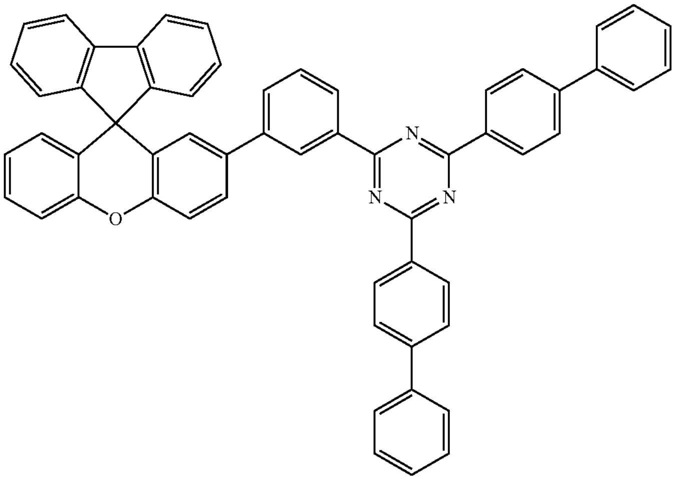

-continued
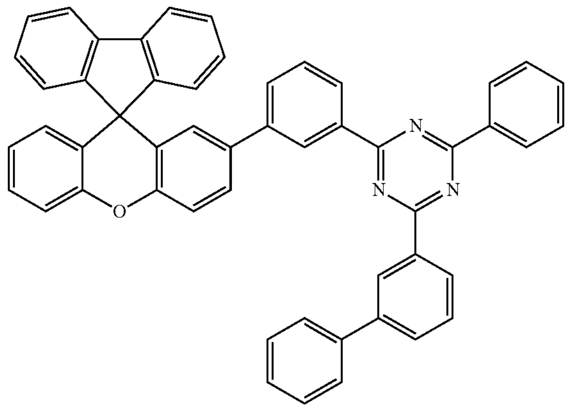
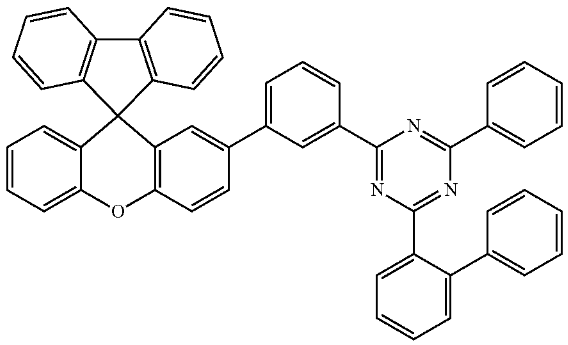
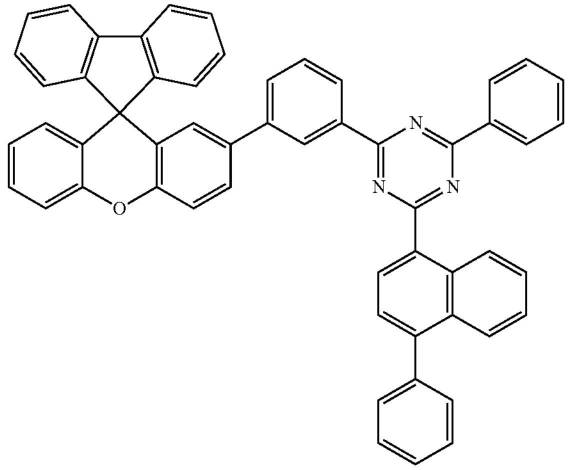
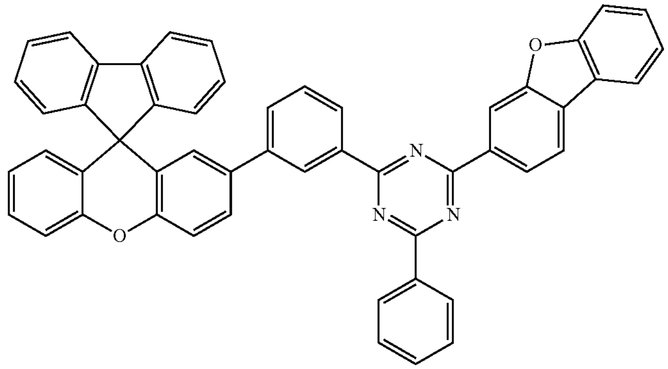
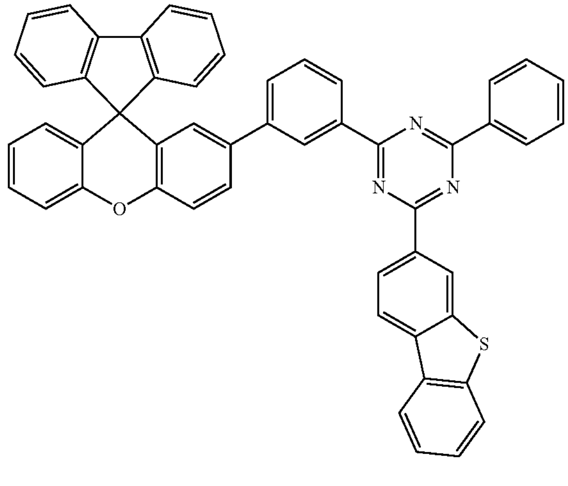
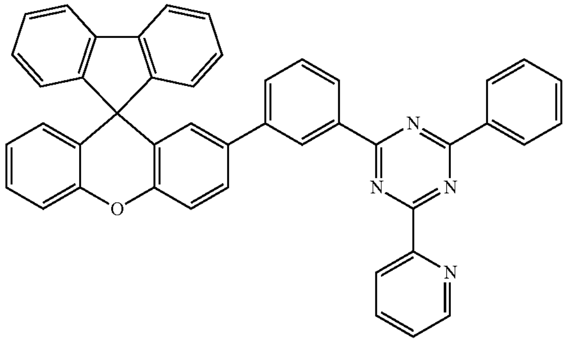

-continued
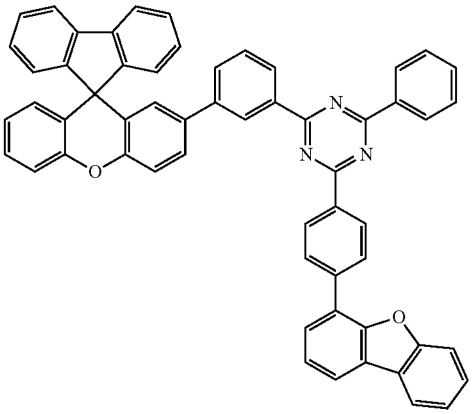
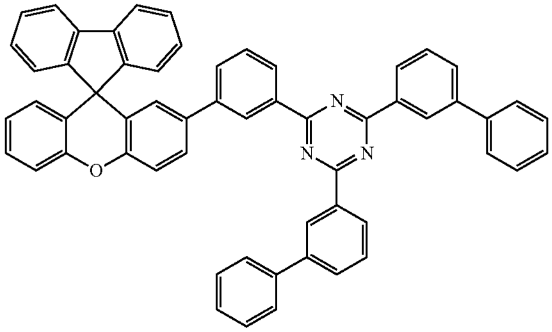
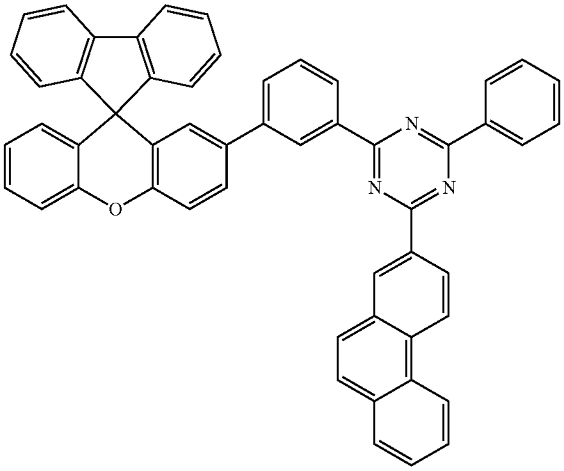
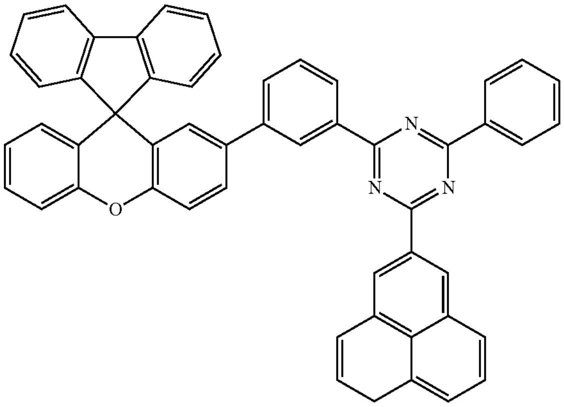
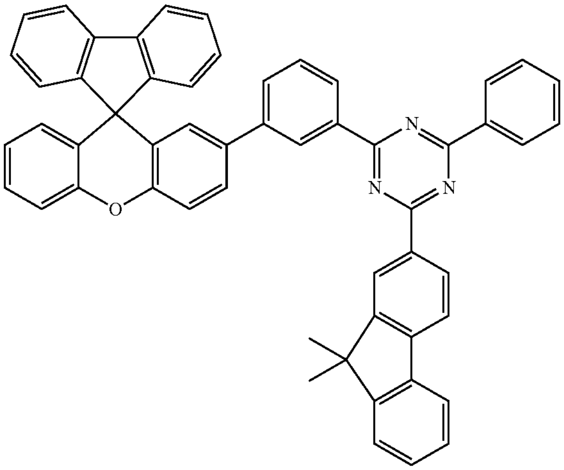

-continued
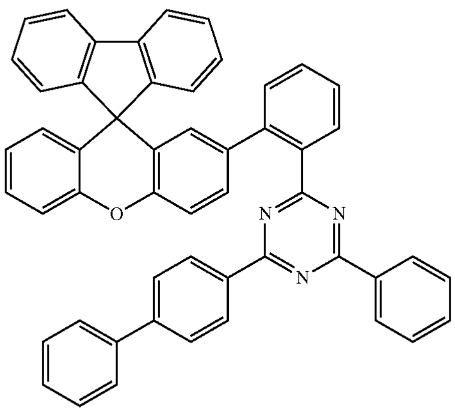
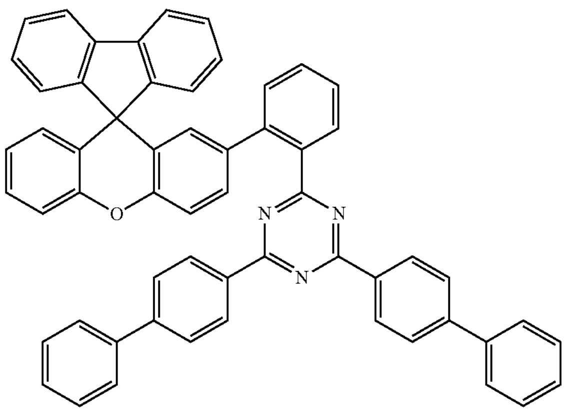
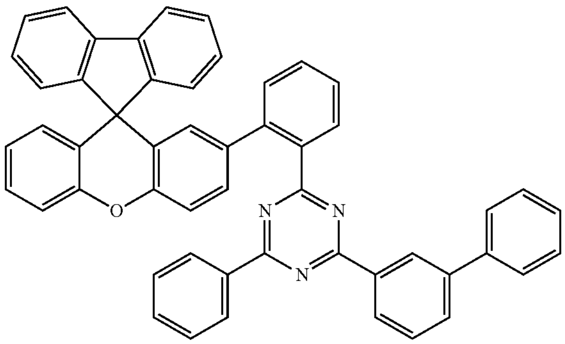
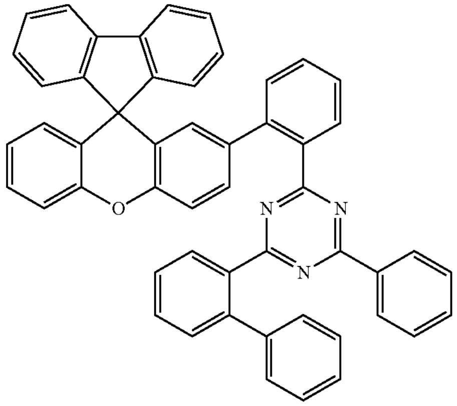
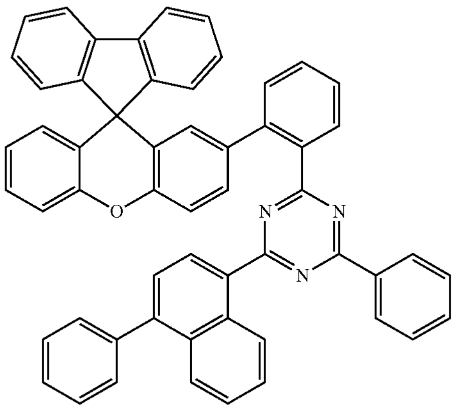
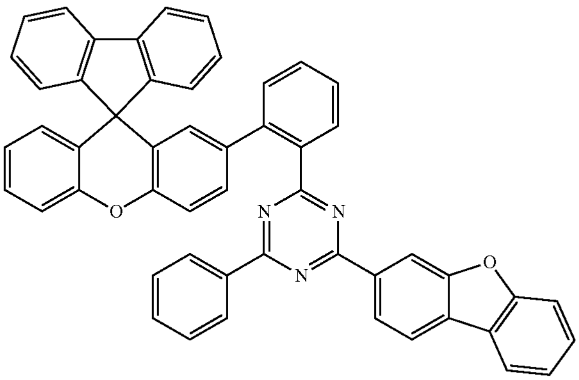
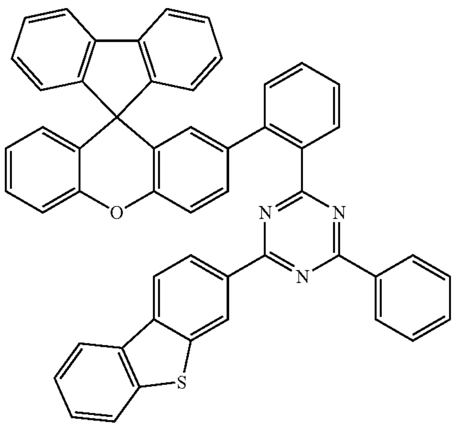
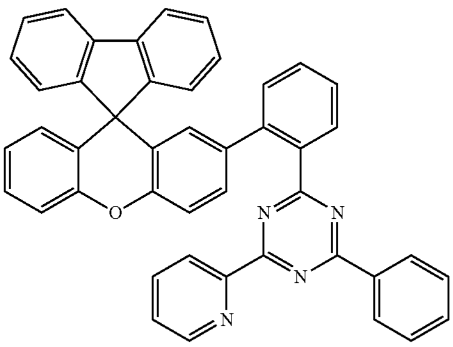

-continued
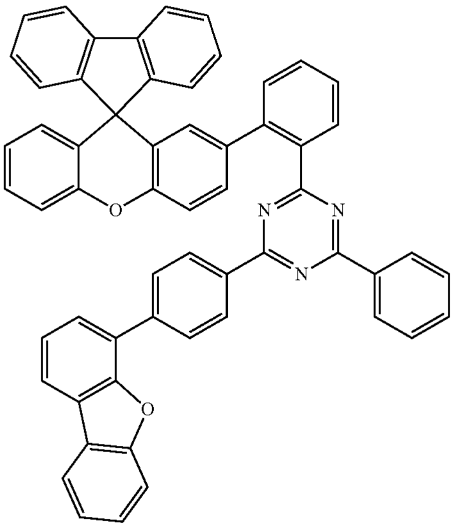
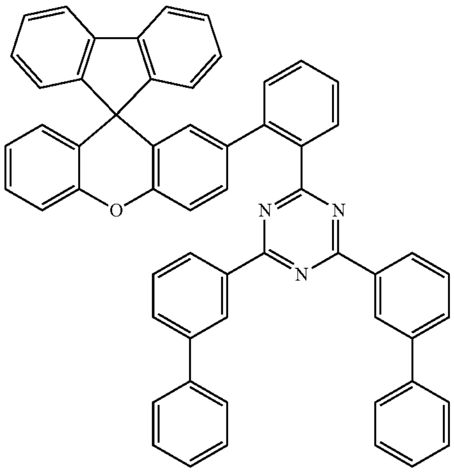
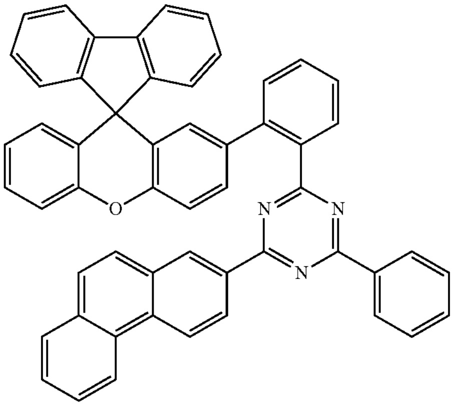
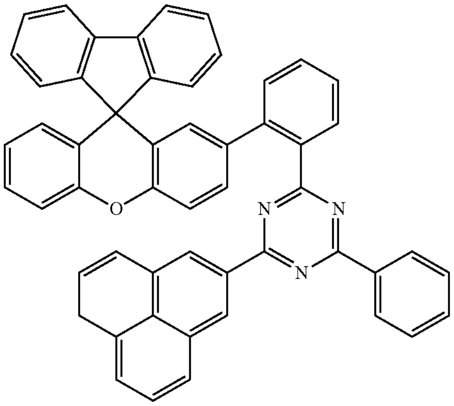
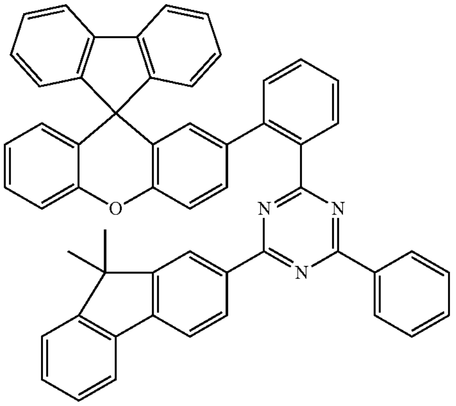
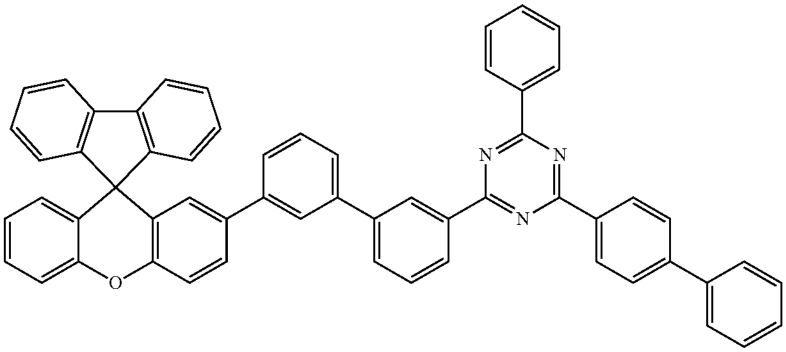

-continued
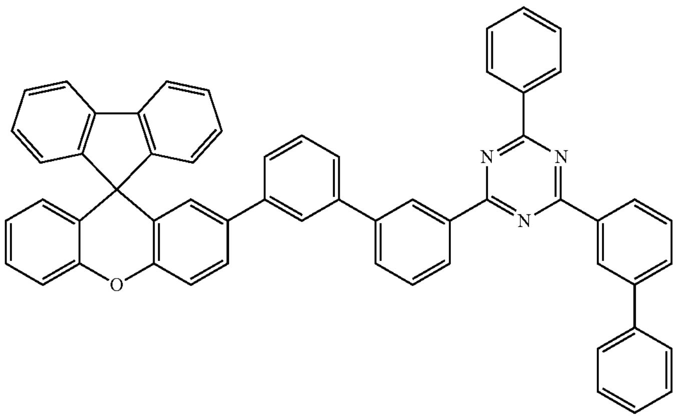
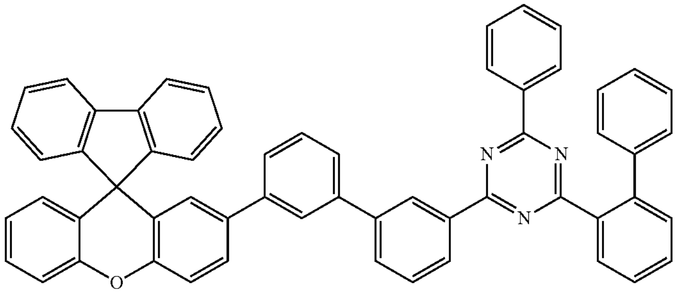 [SMILES: c1ccc(-c2nc(-c3cccc(-c4cccc(-c5ccc6c(c5)C5(c7ccccc7O6)c6ccccc6-c6ccccc65)c4)c3)nc(-c3ccccc3-c3ccccc3)n2)cc1]
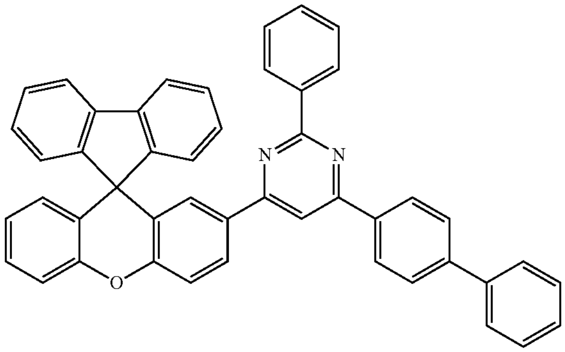
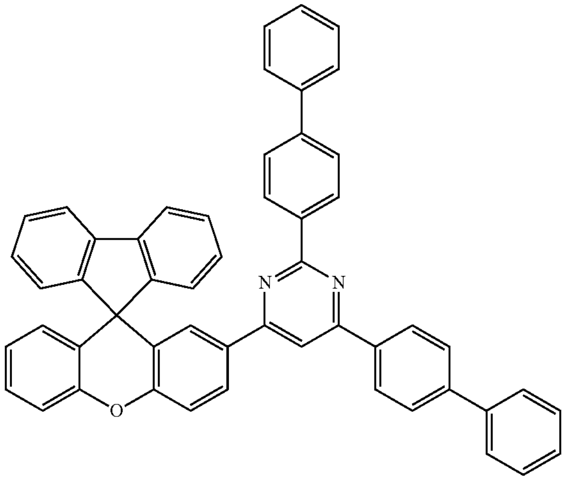
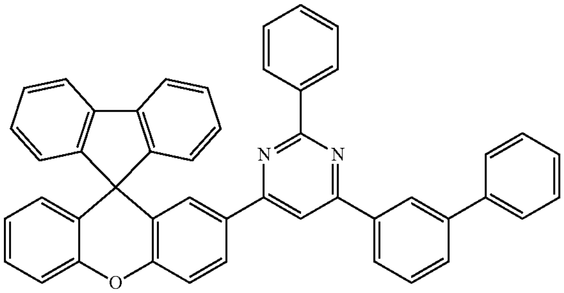

-continued
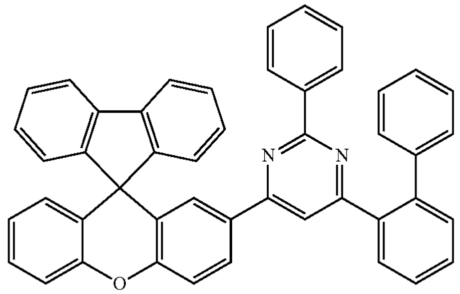
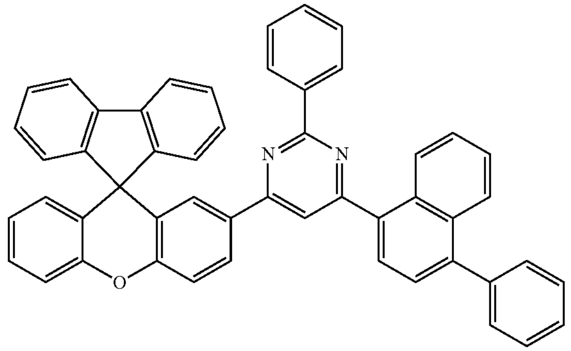
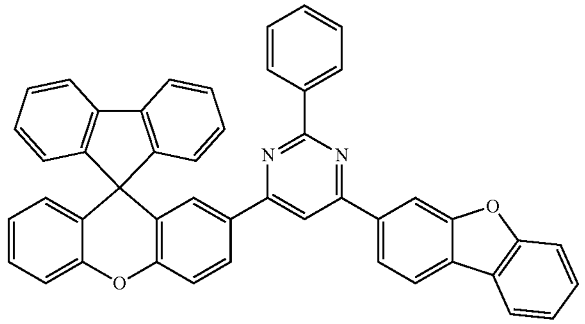
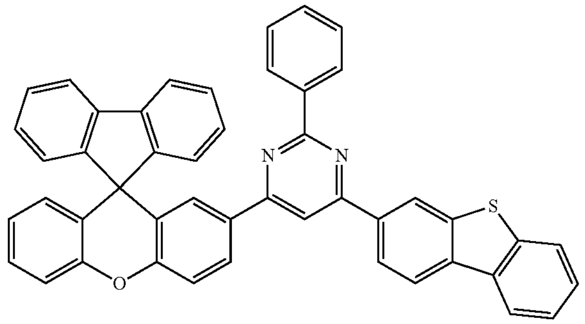
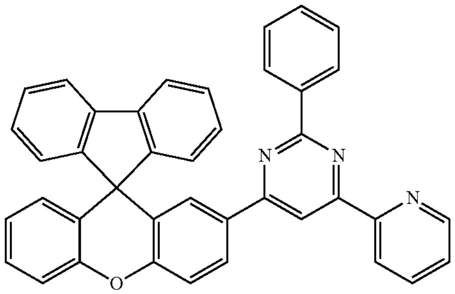

-continued
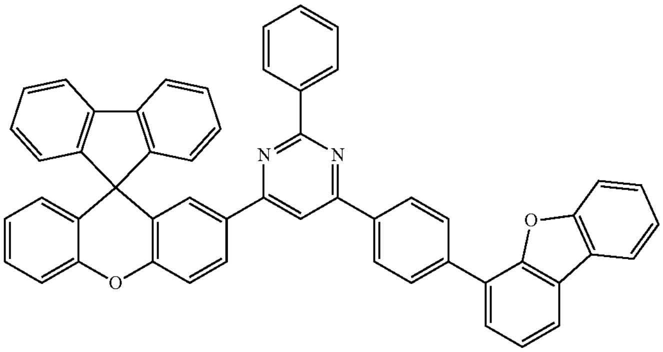
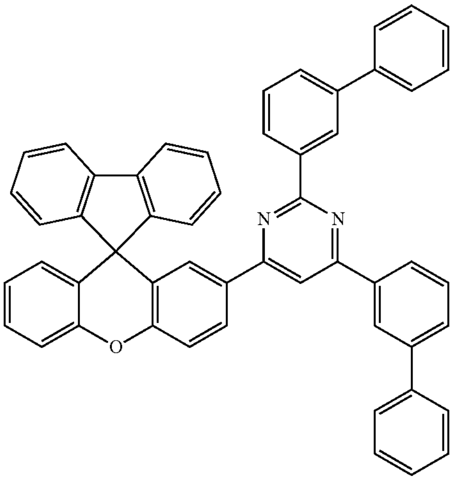
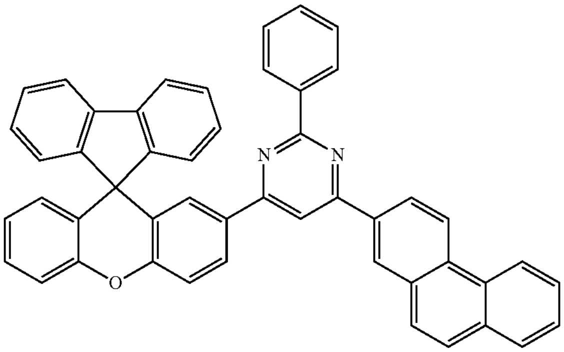
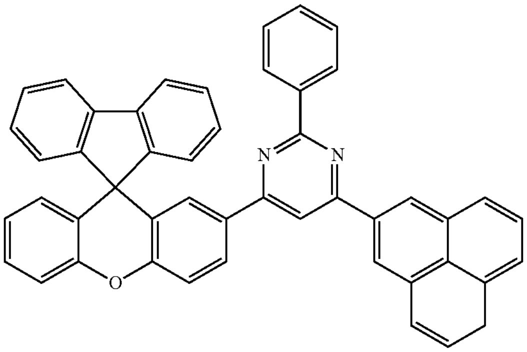
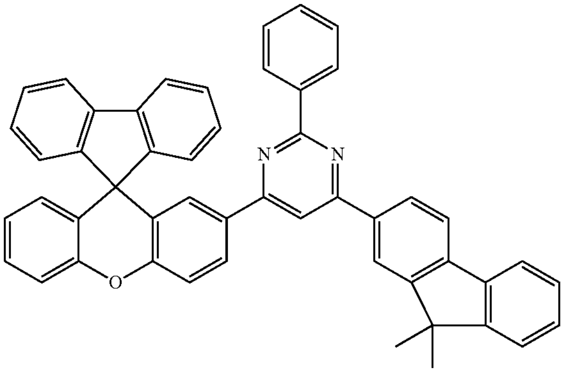
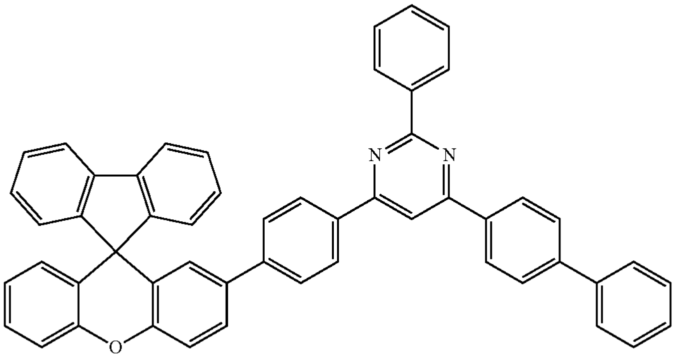

-continued
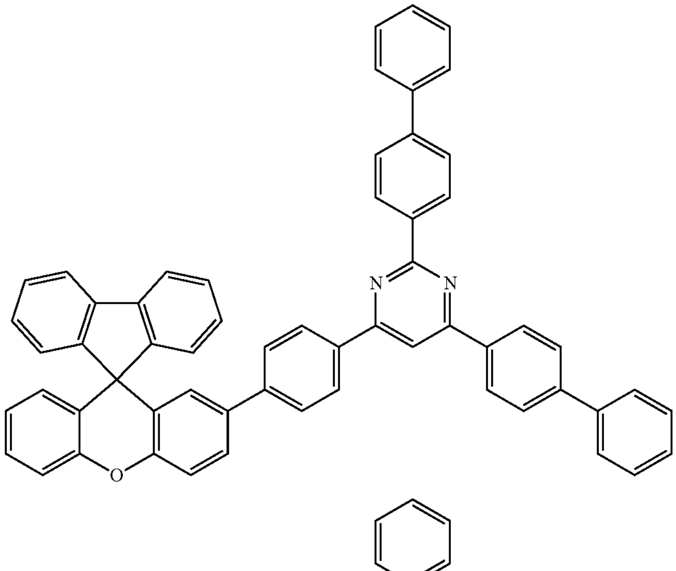
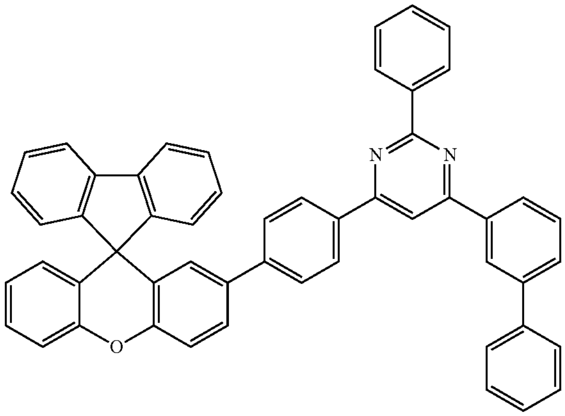
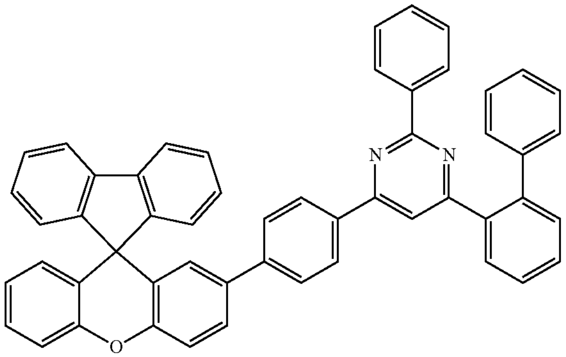
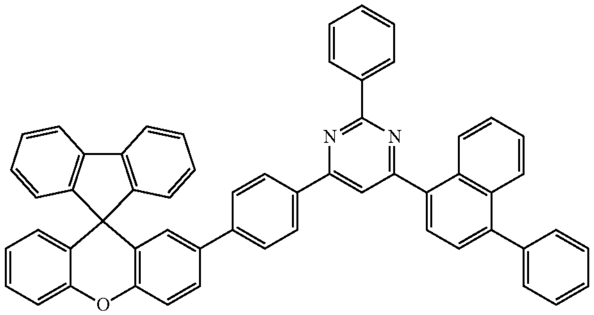
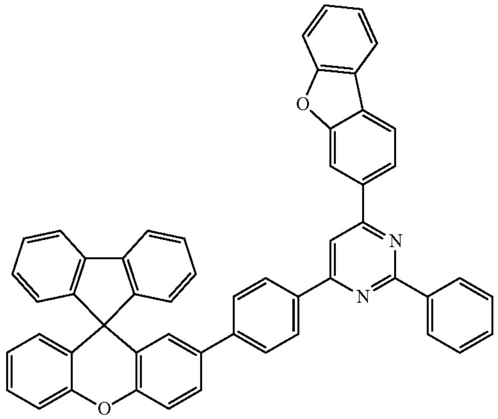
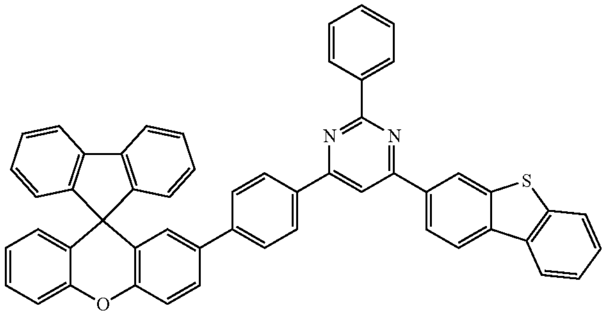
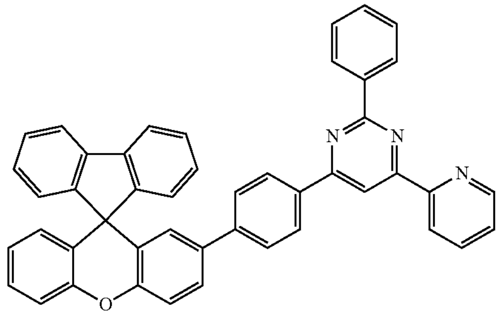

-continued
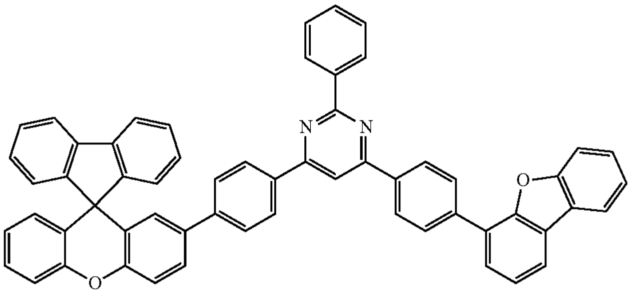
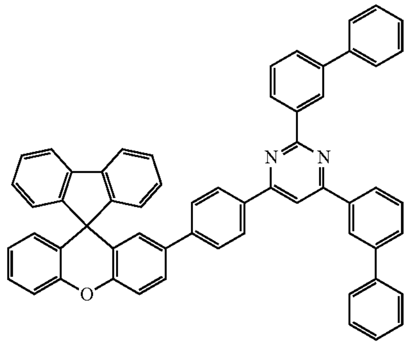
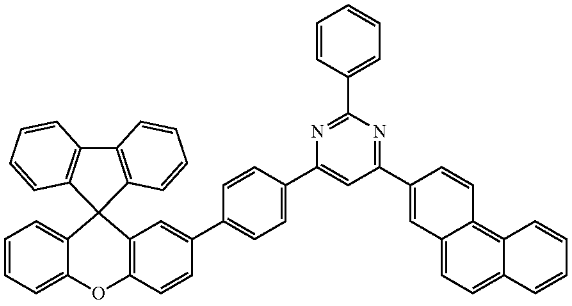
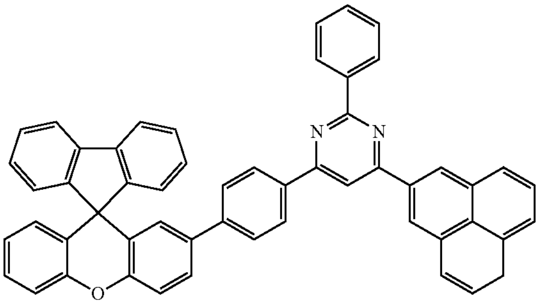
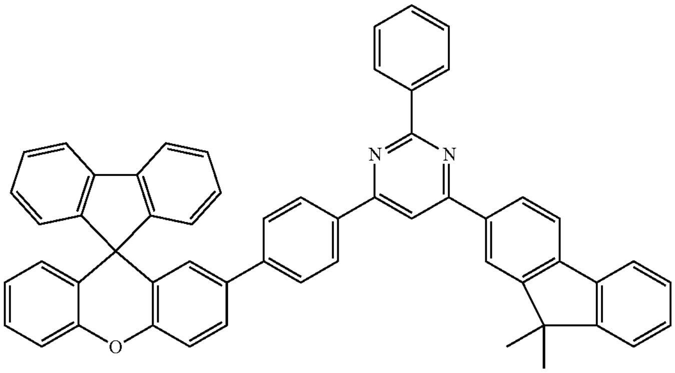
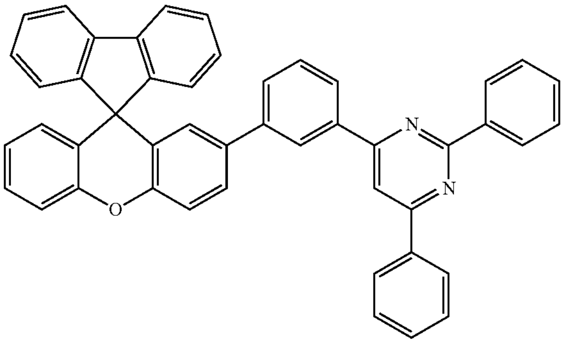
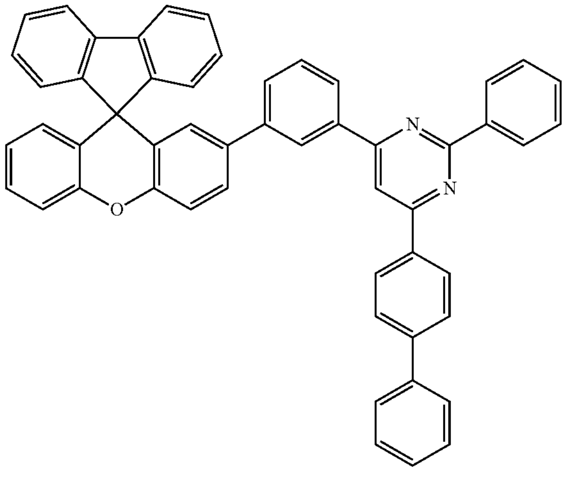

-continued
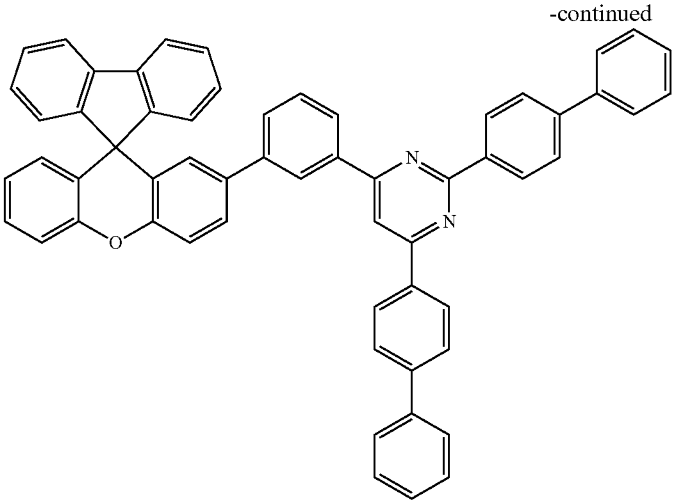
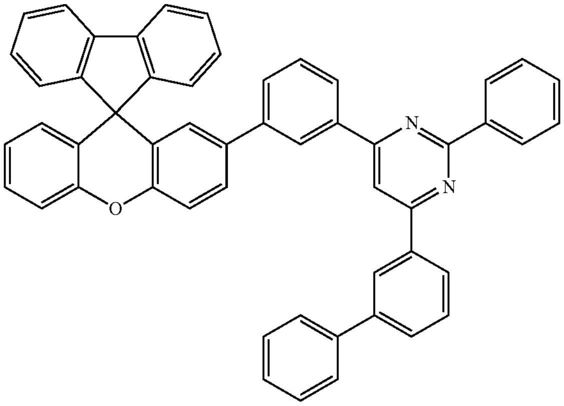
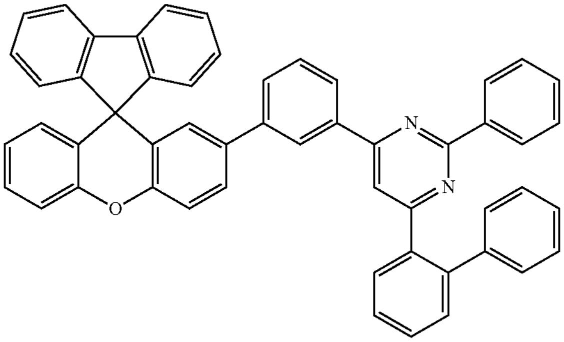
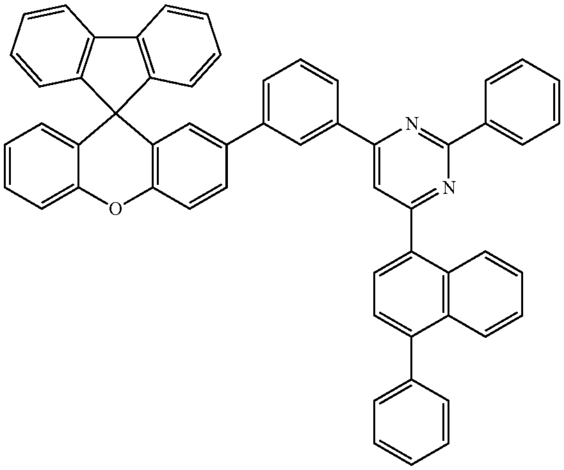
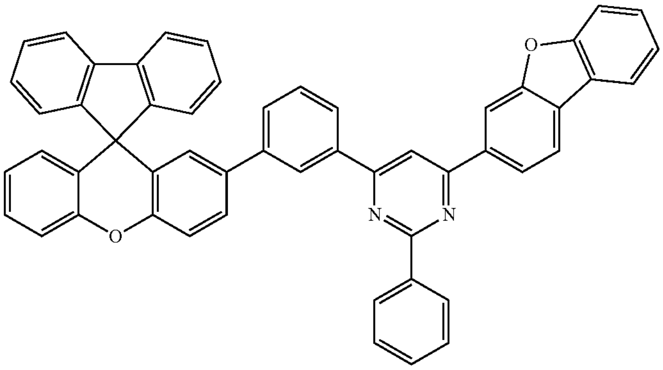

-continued
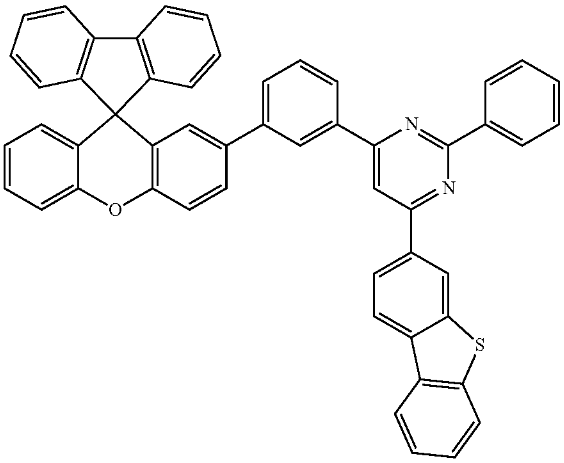
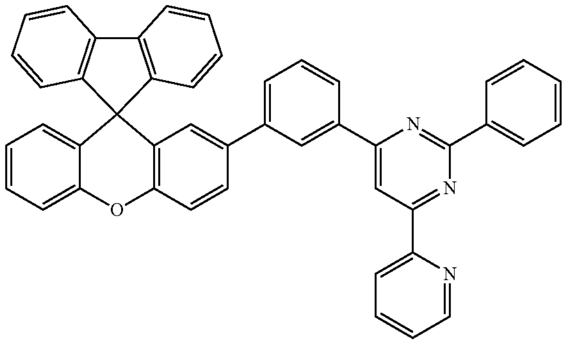
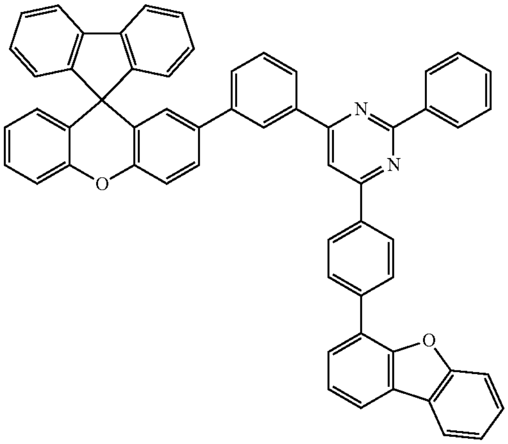
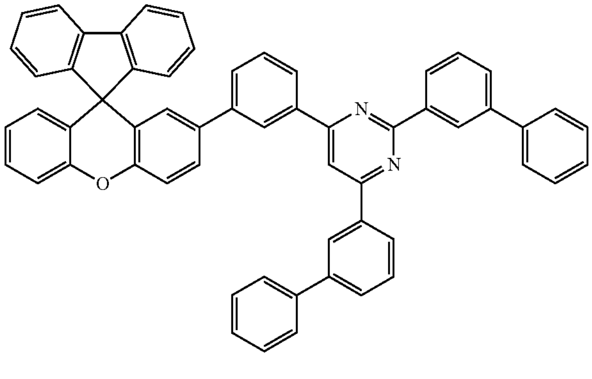
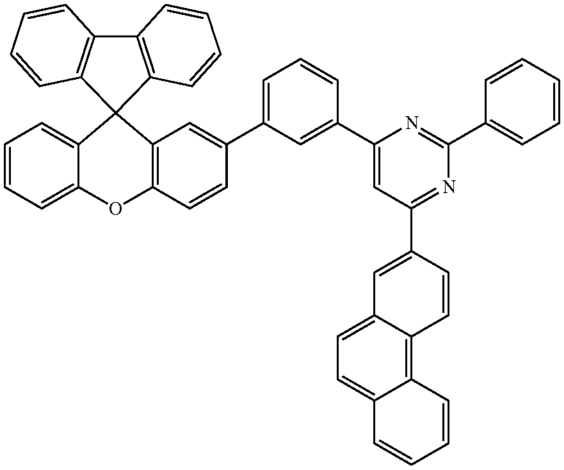
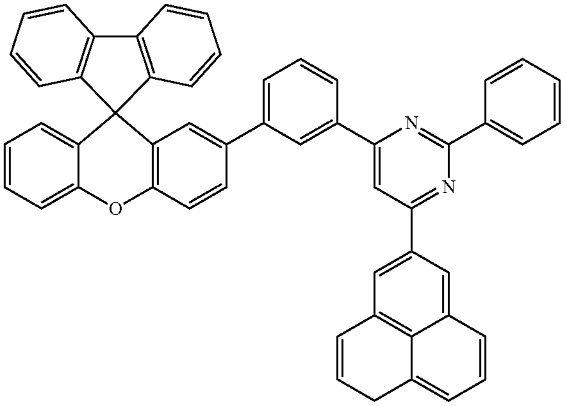

-continued
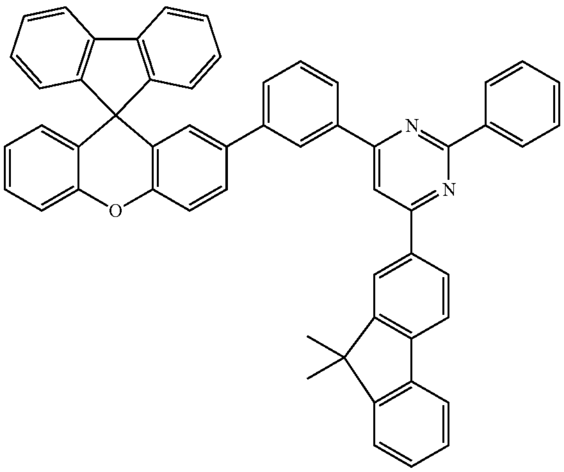
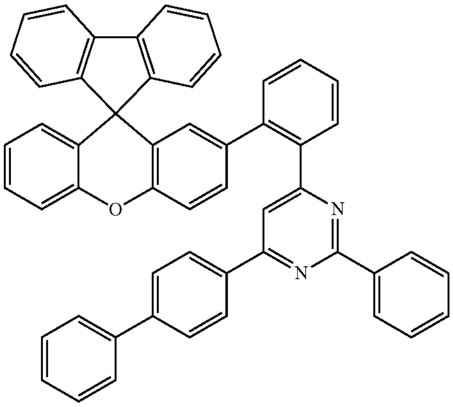
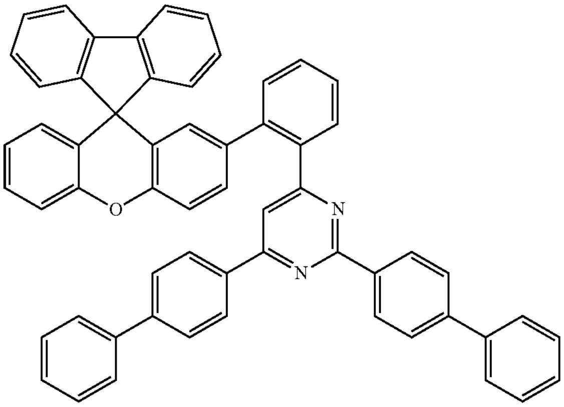
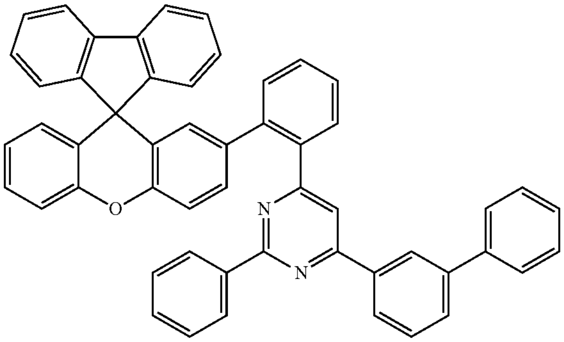
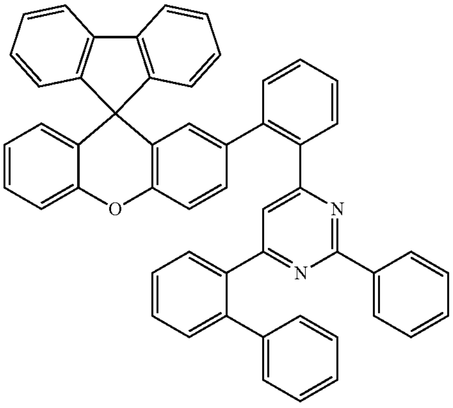
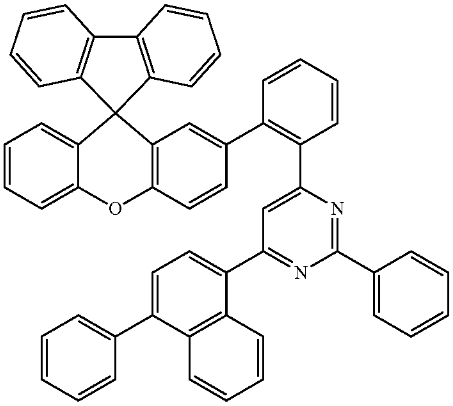
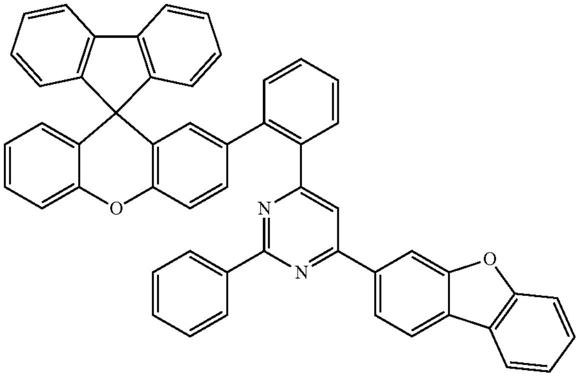

-continued
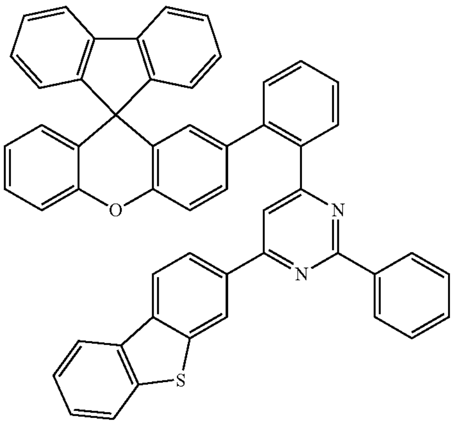
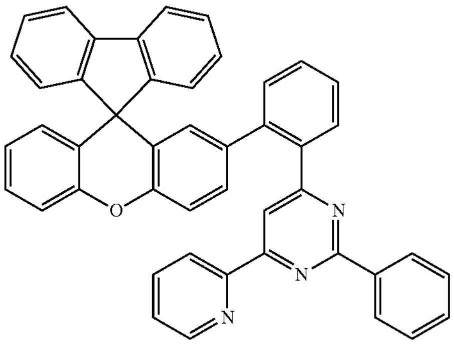
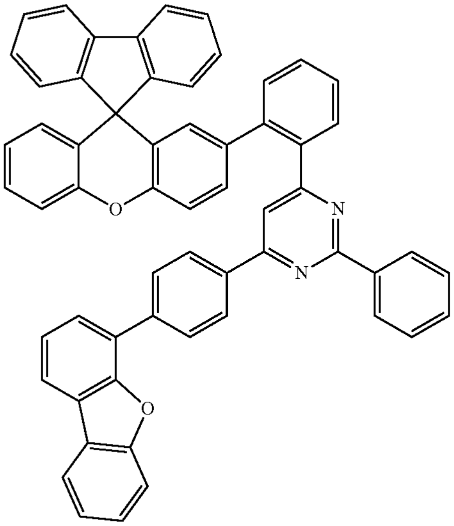
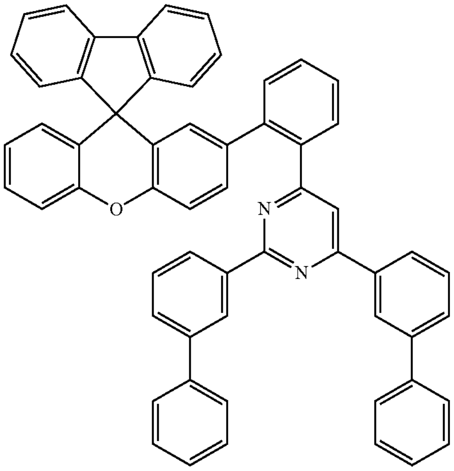
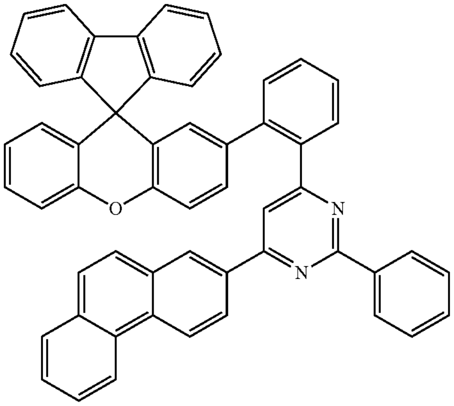
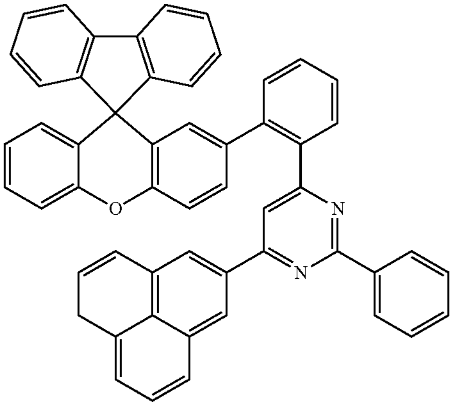

-continued
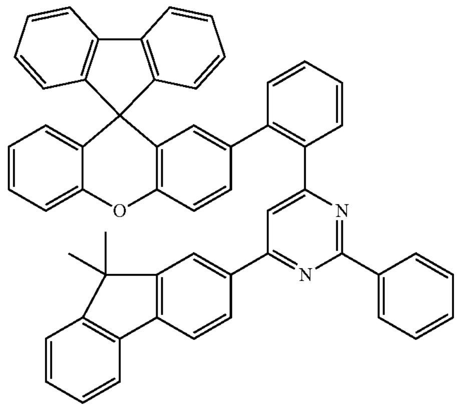
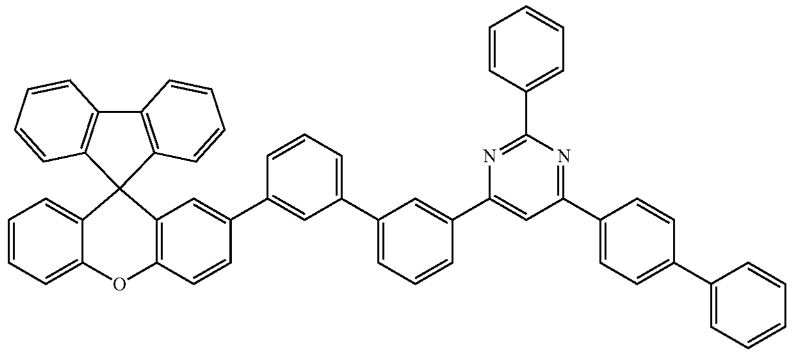
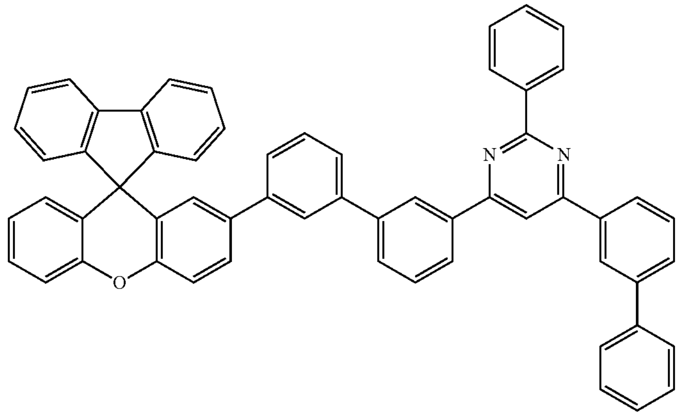
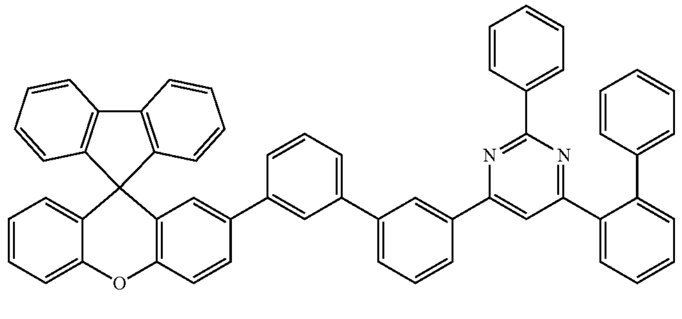

-continued
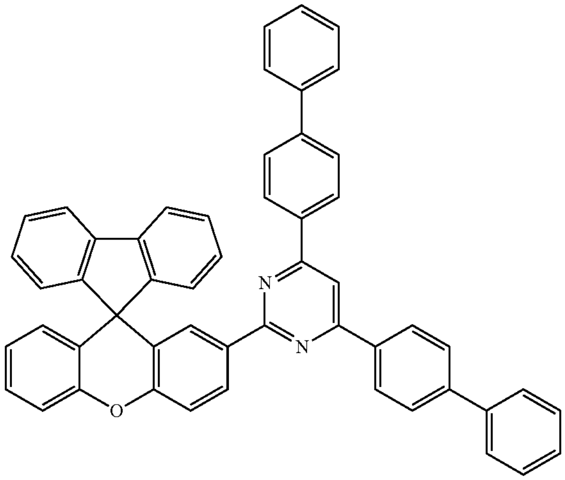
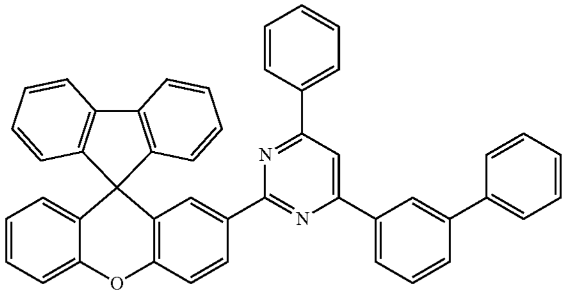
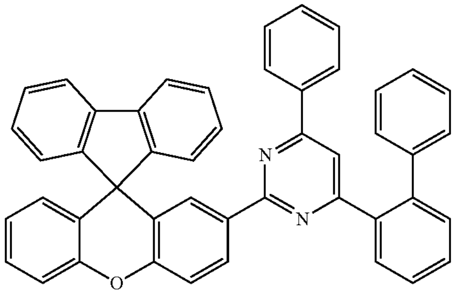
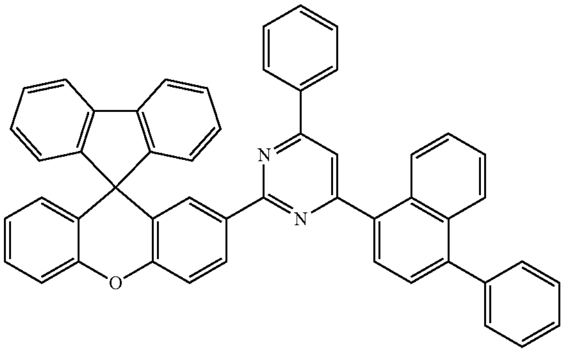
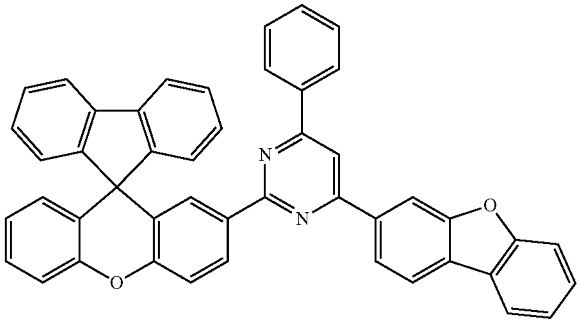
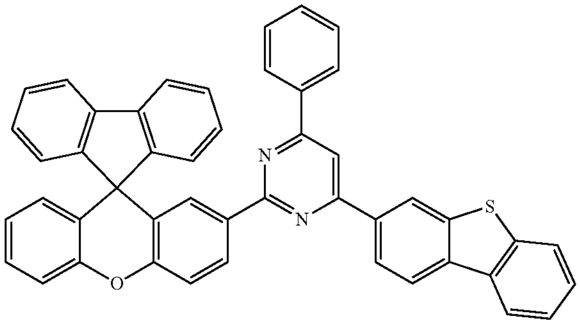
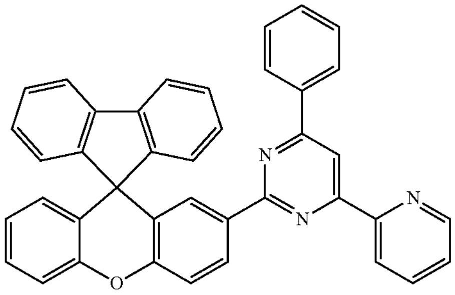
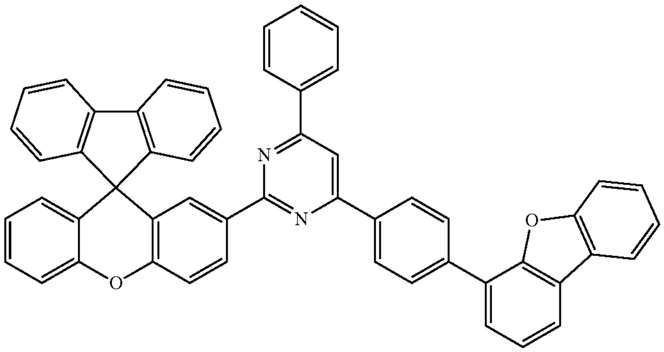

-continued
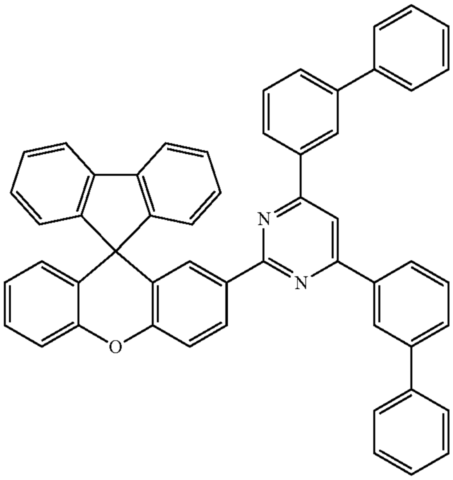
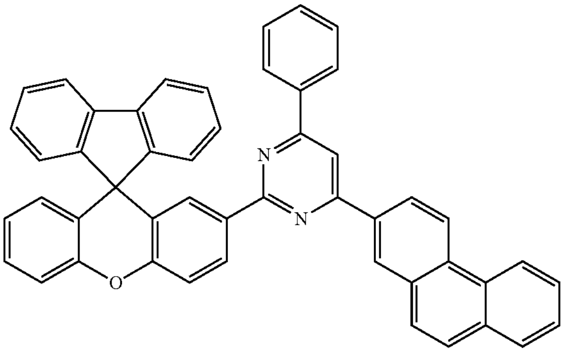
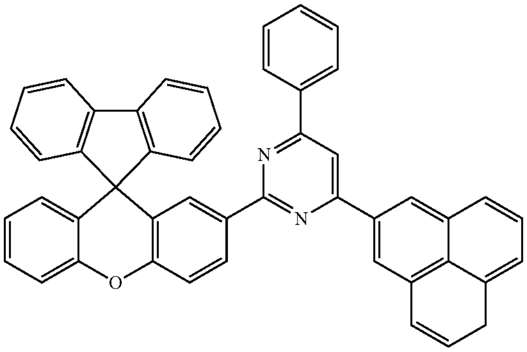
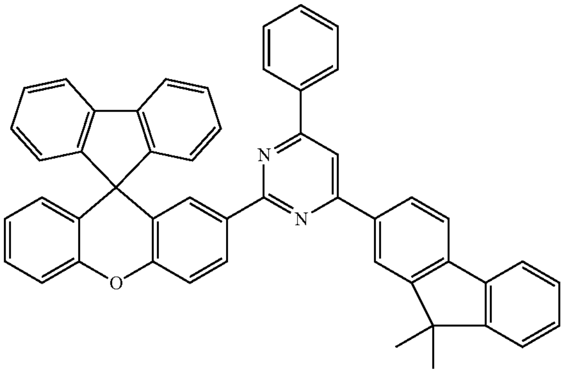
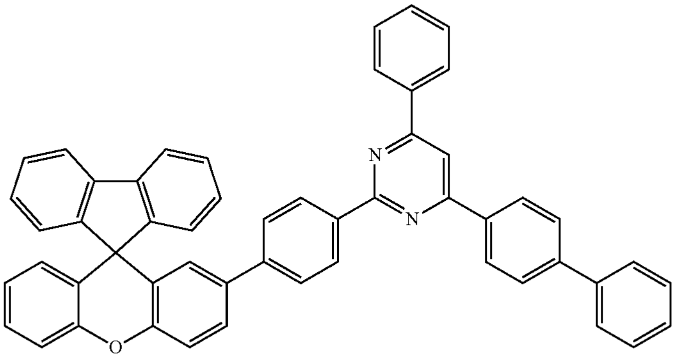

-continued
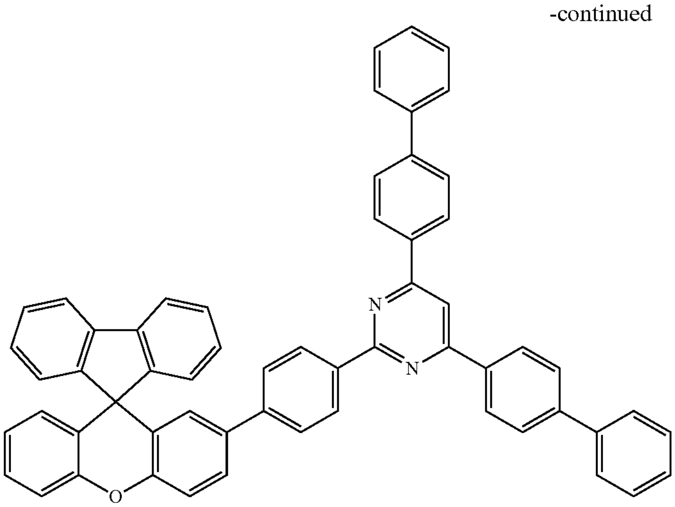
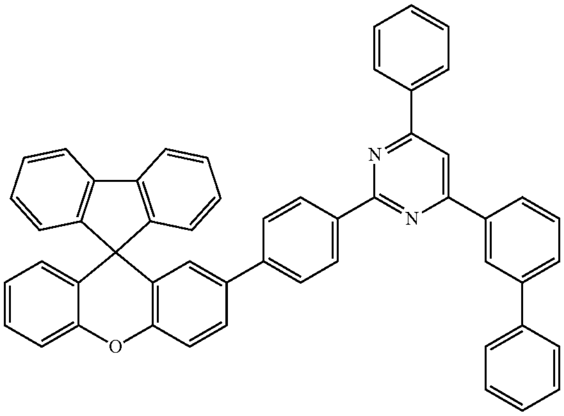
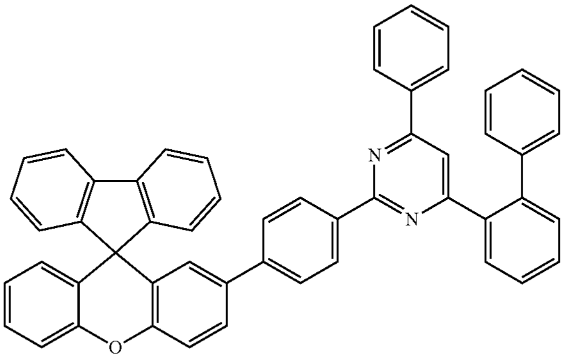
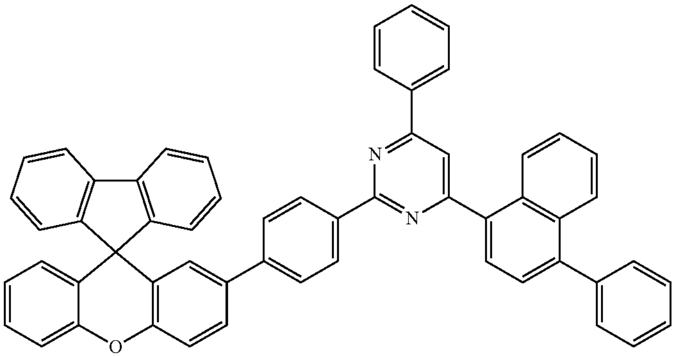
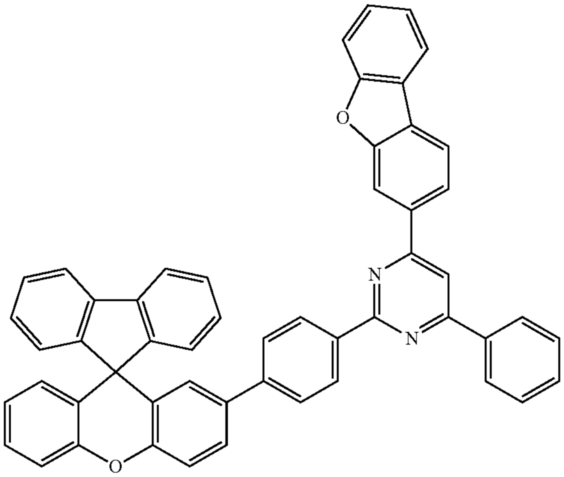

-continued
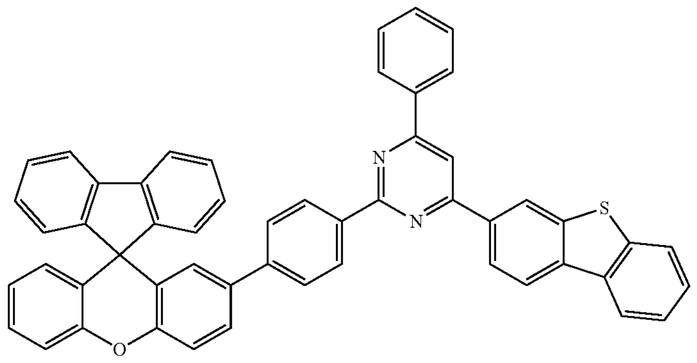
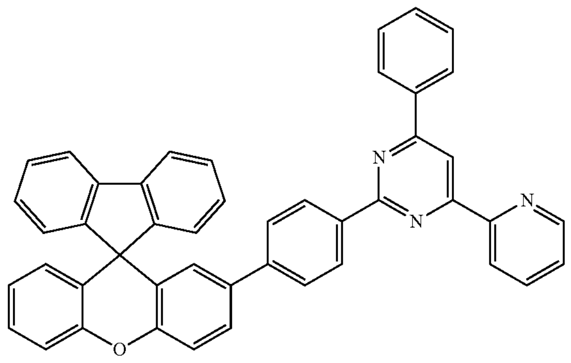
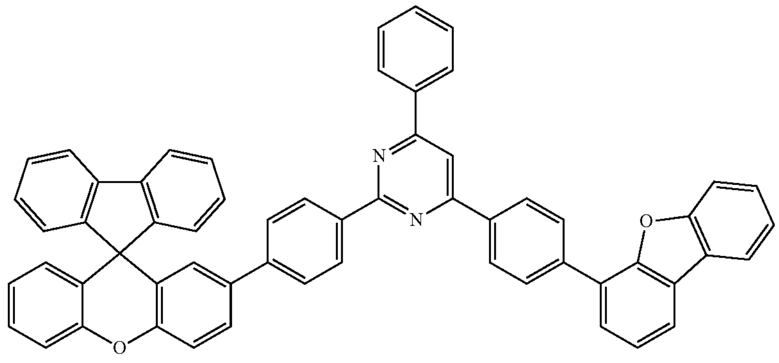
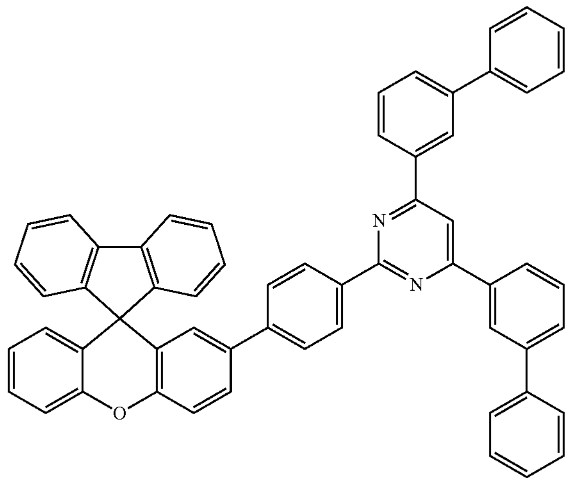

-continued
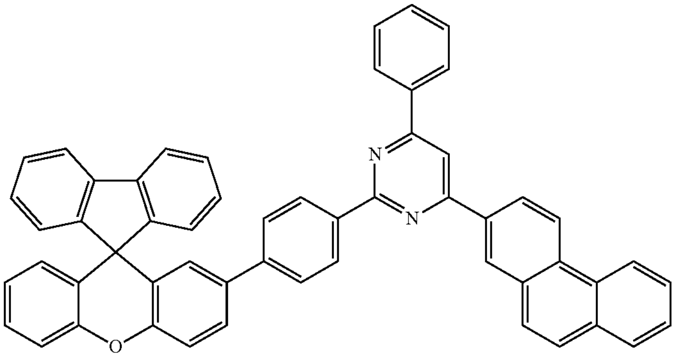
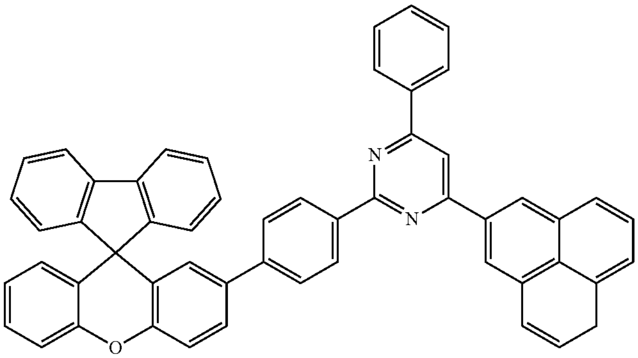
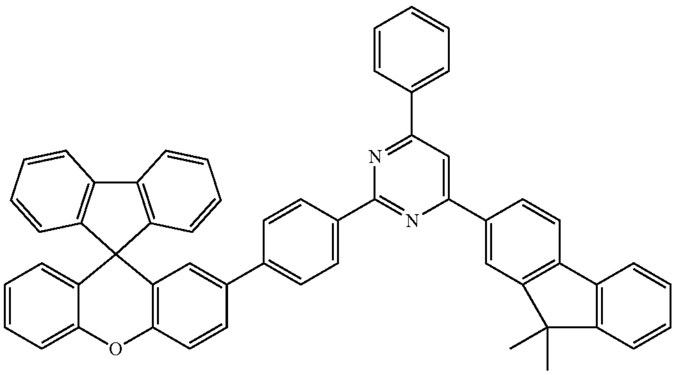
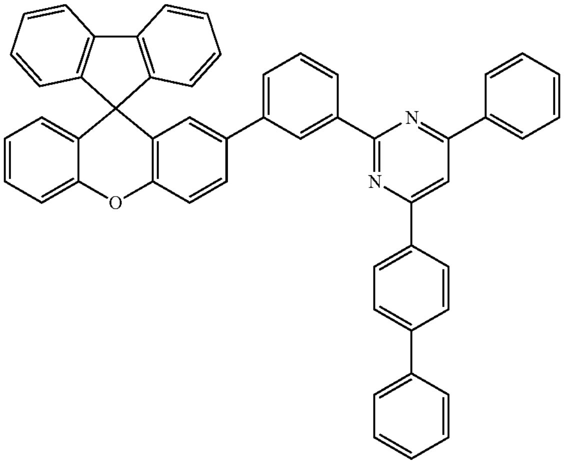

-continued
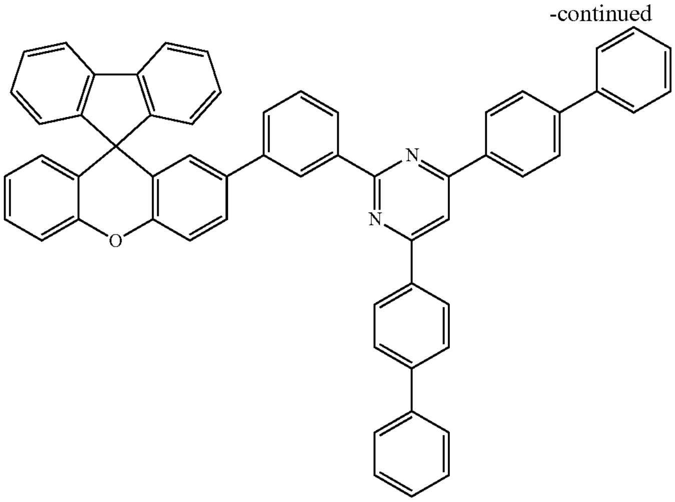
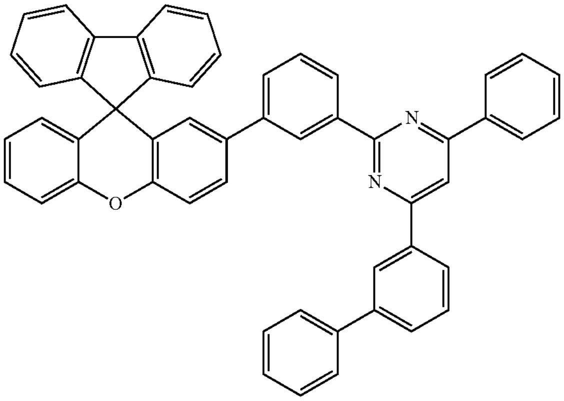
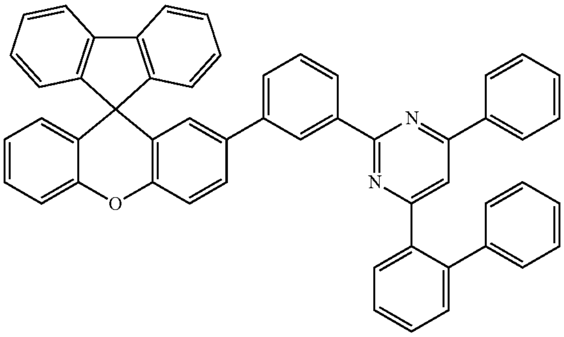
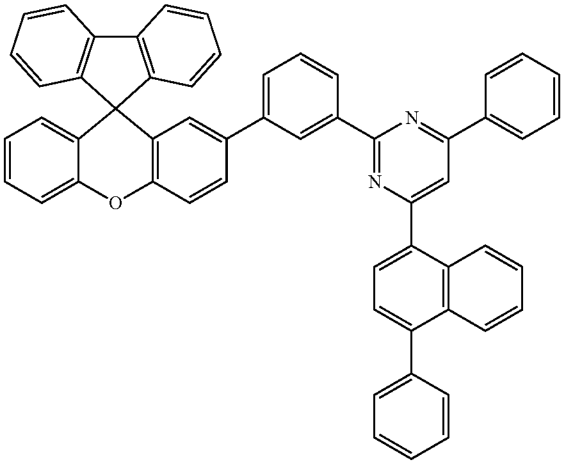
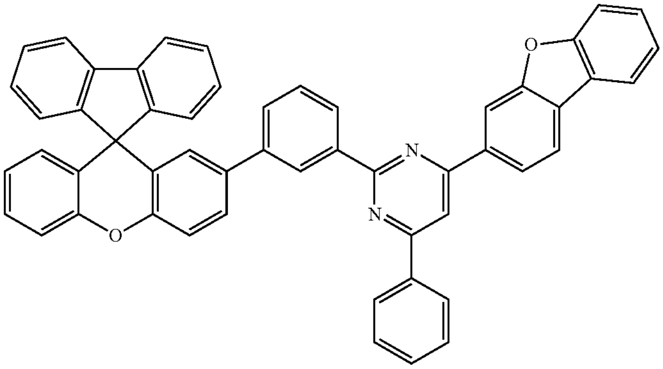

-continued
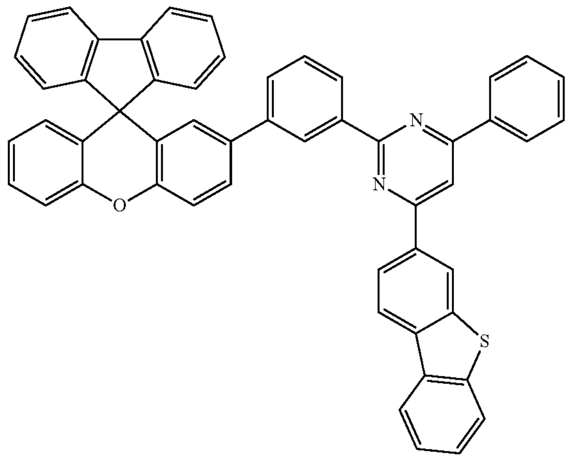
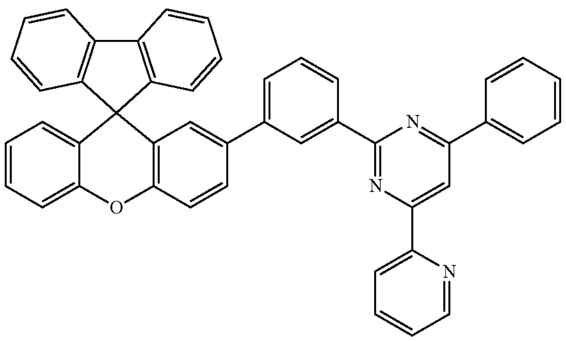
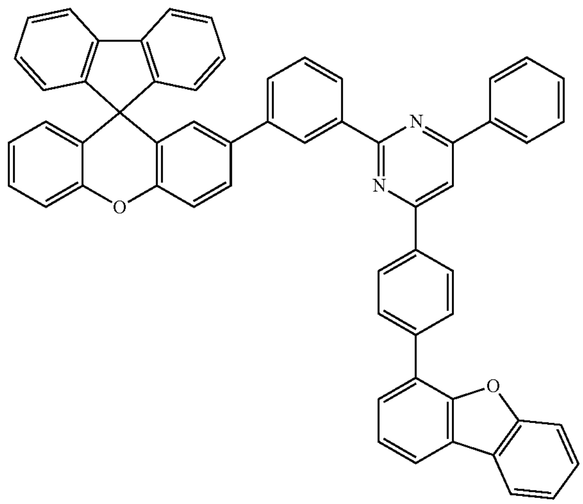
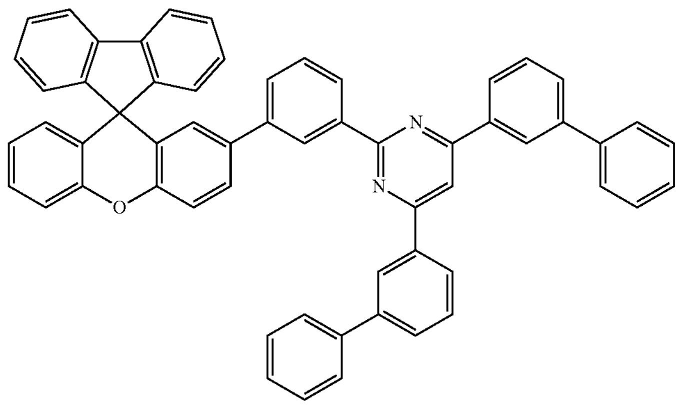

-continued
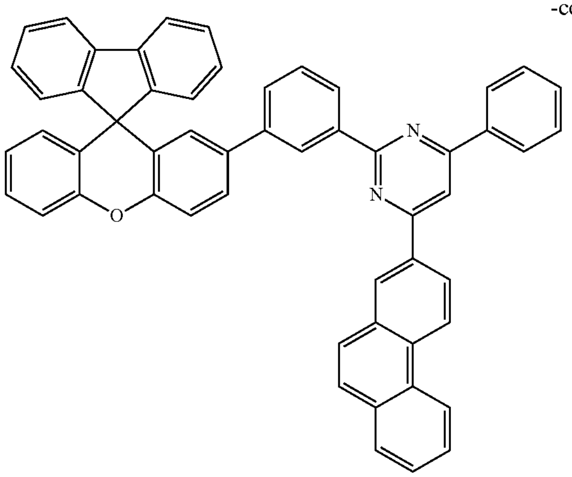
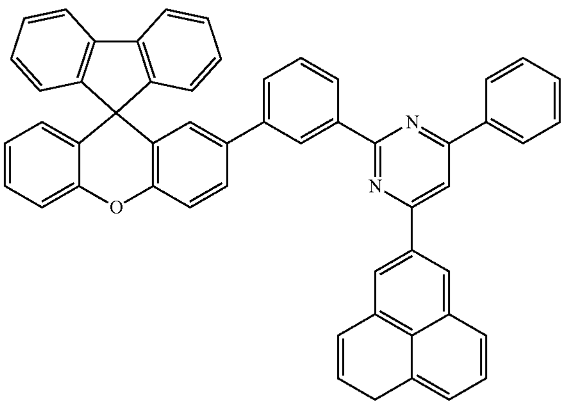
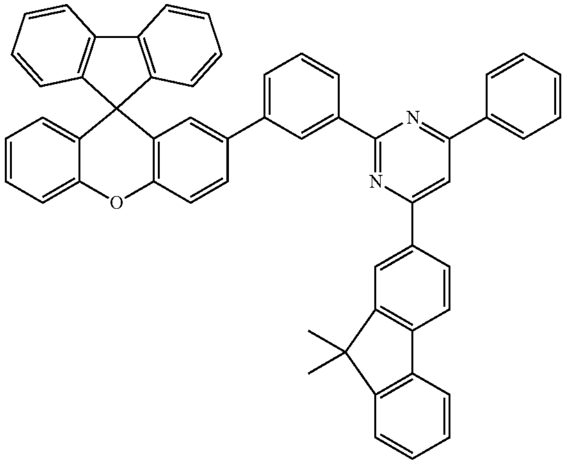
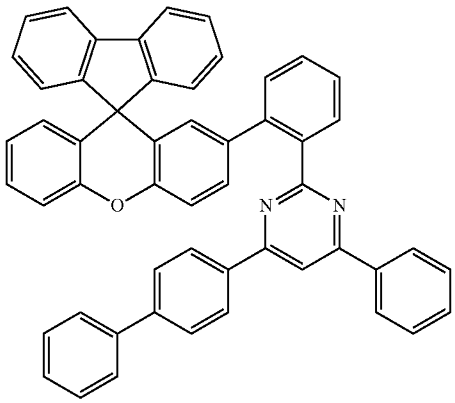
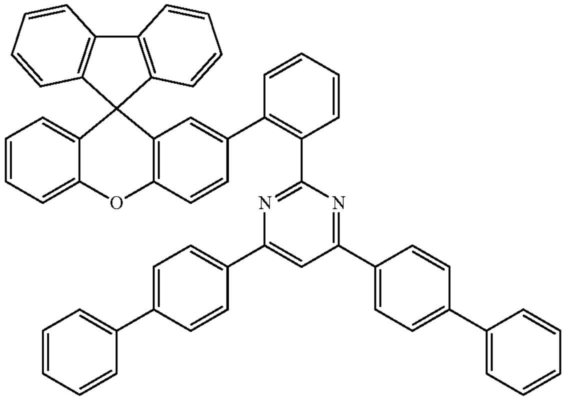
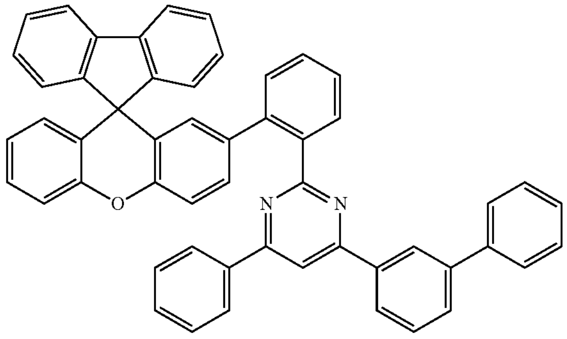
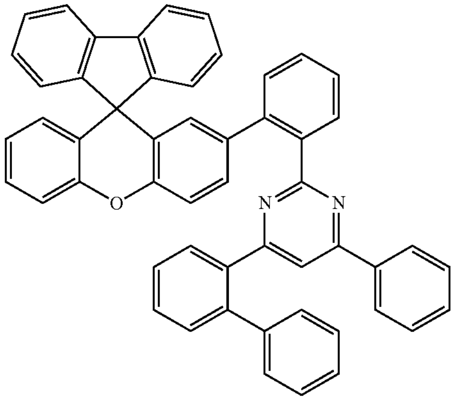
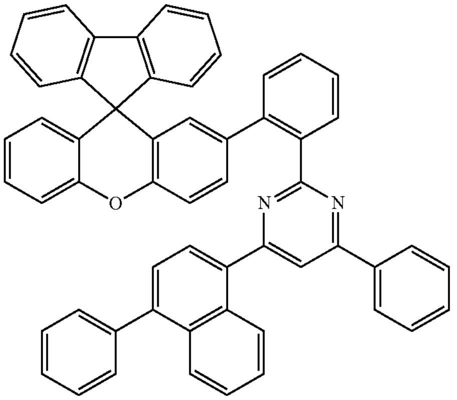

-continued
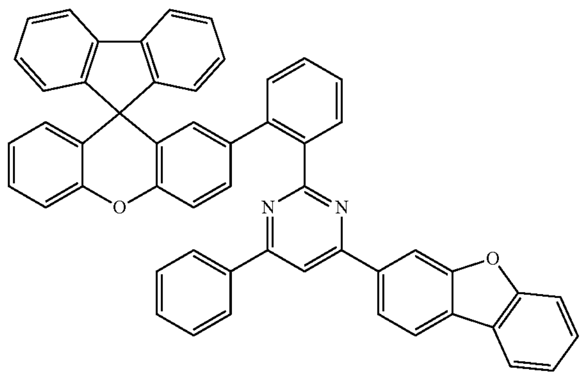
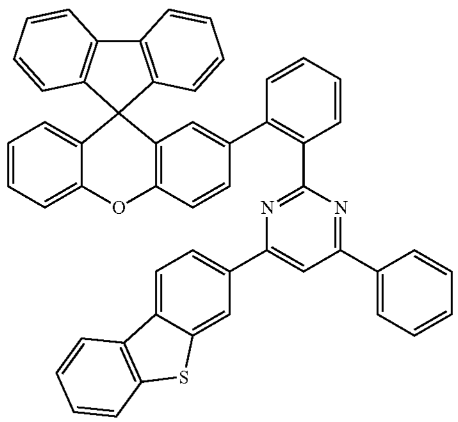
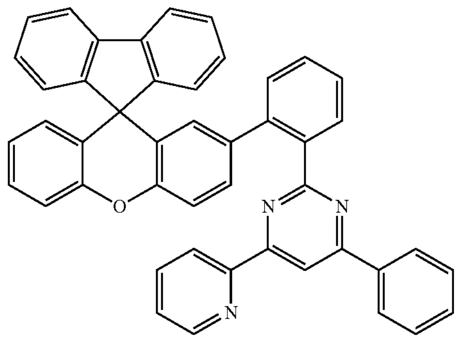
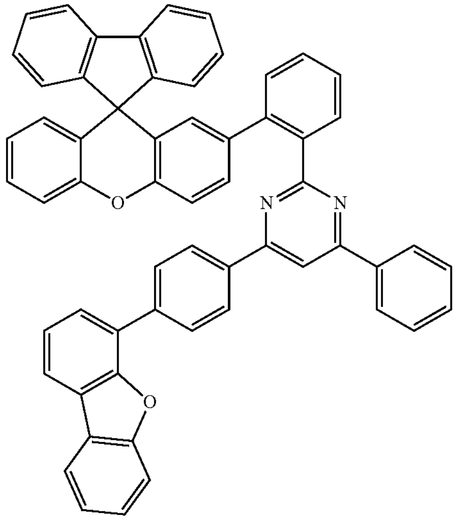
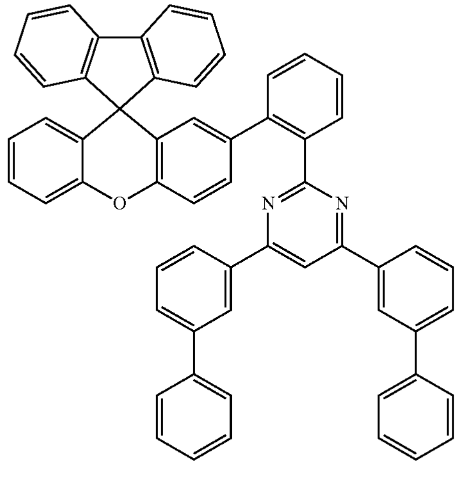
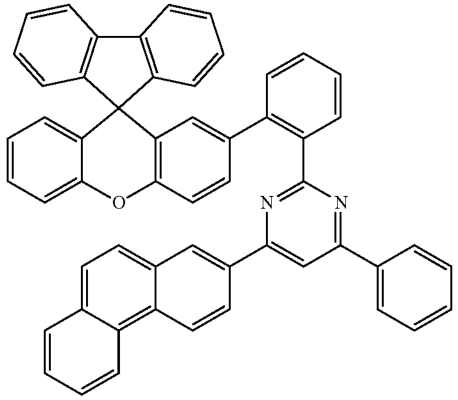

-continued
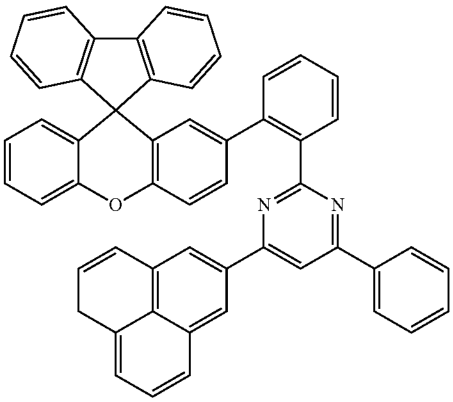
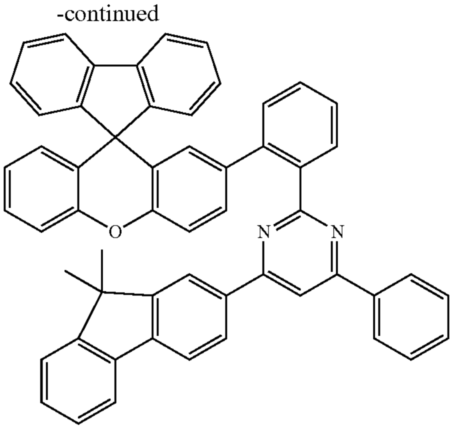
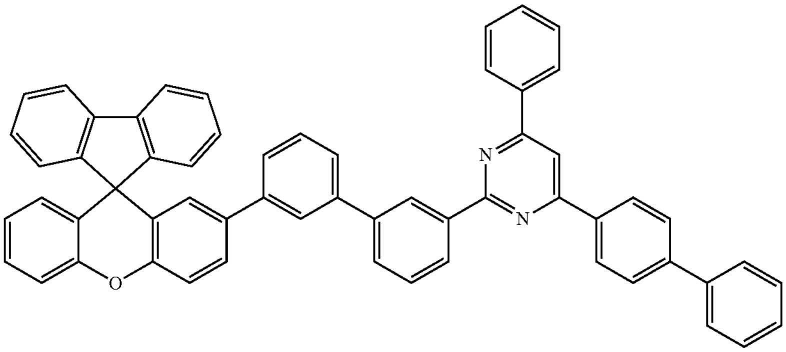
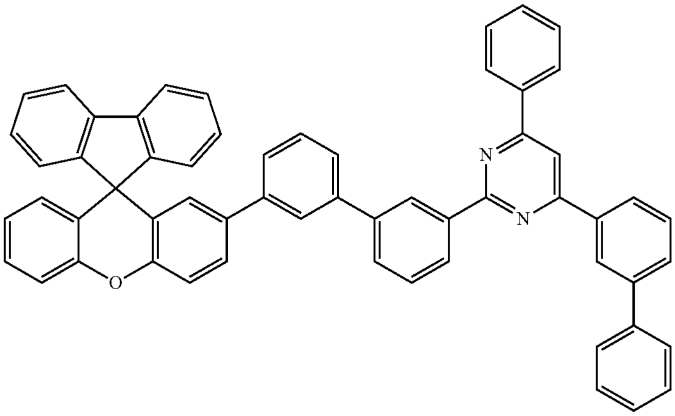
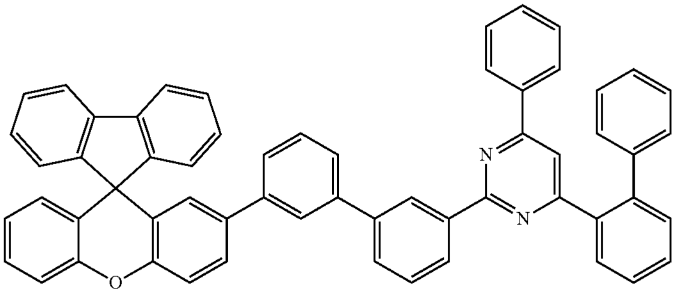

-continued
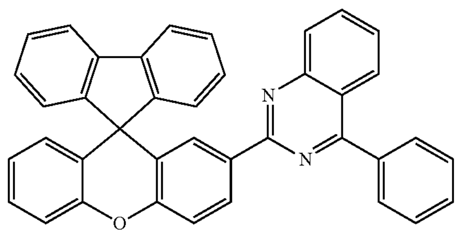
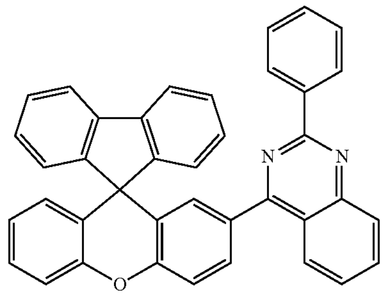
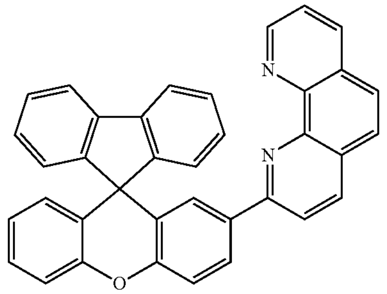
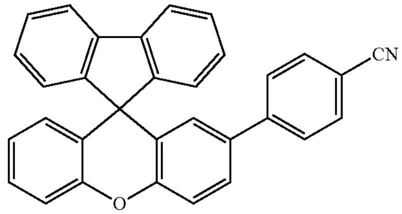
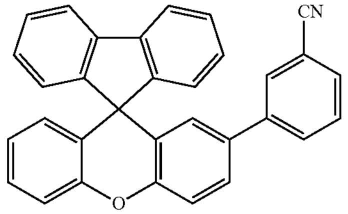
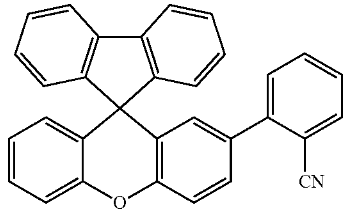
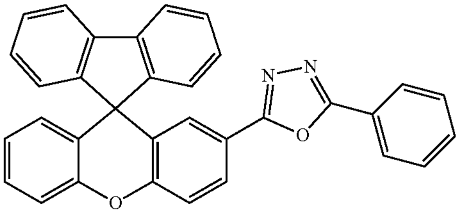
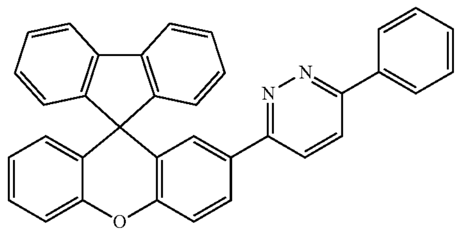
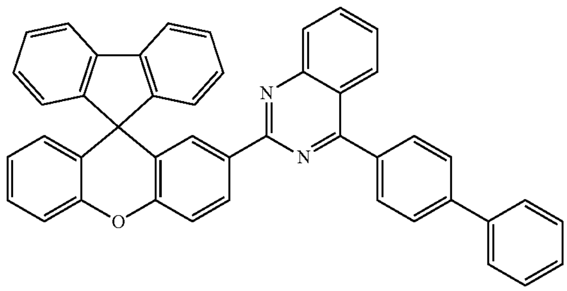
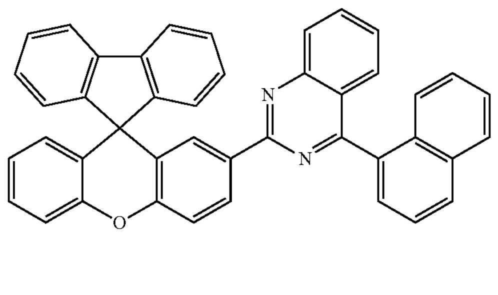
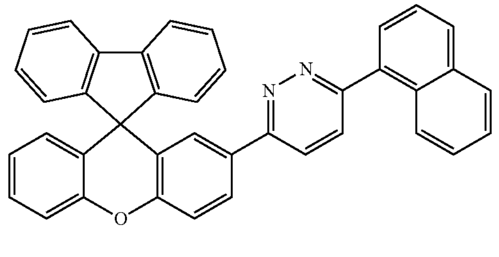

-continued
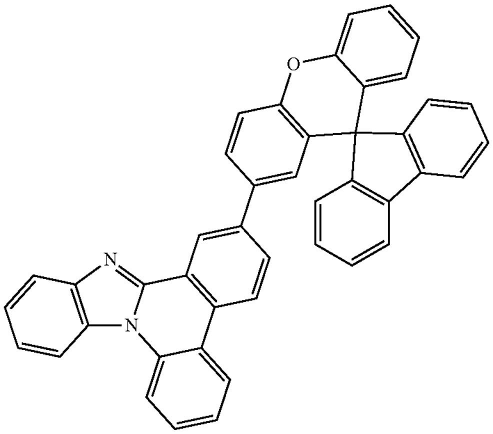
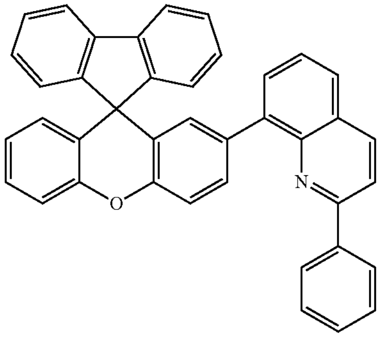
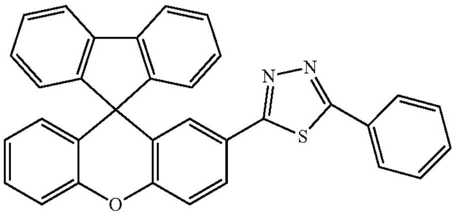
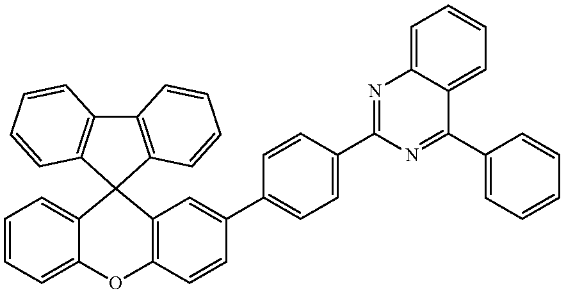
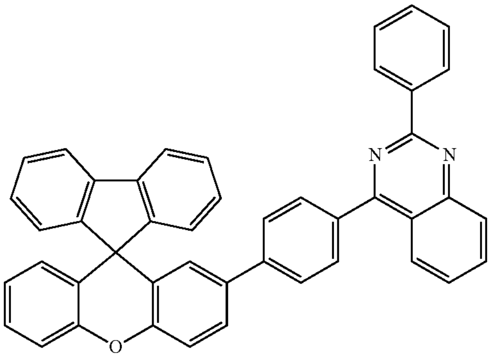
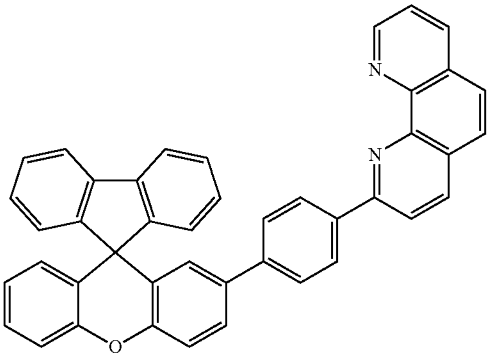
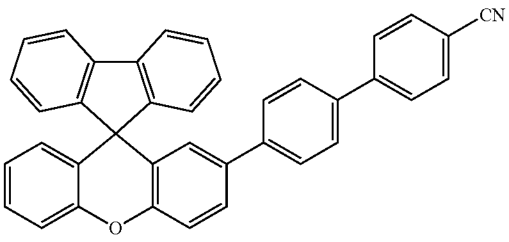
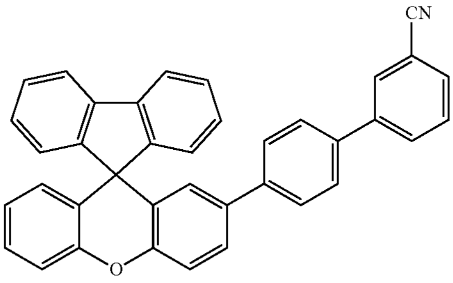
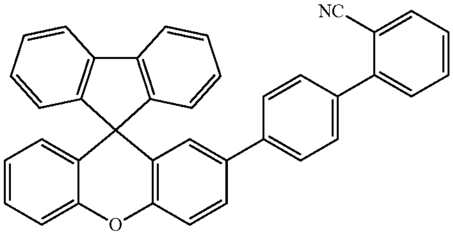
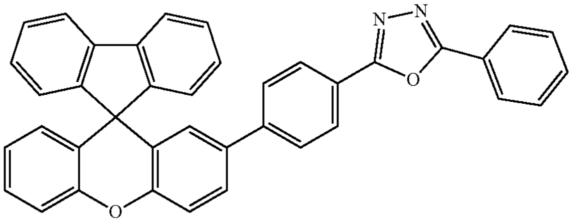

-continued
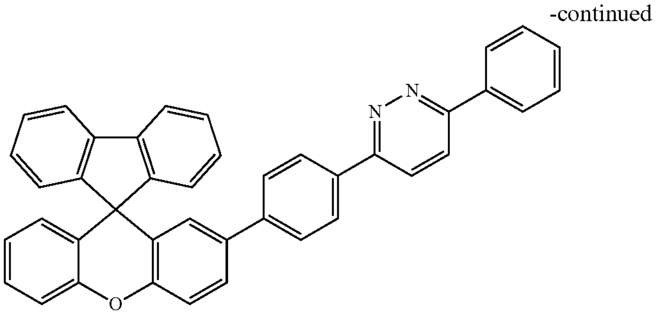
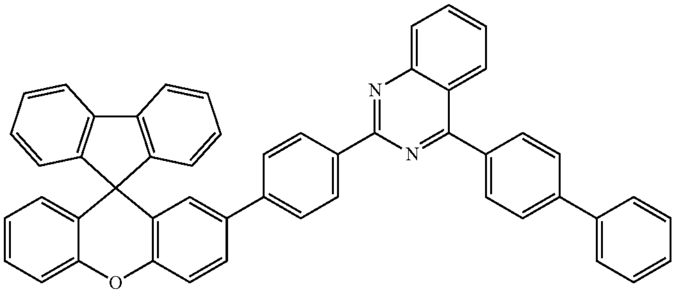
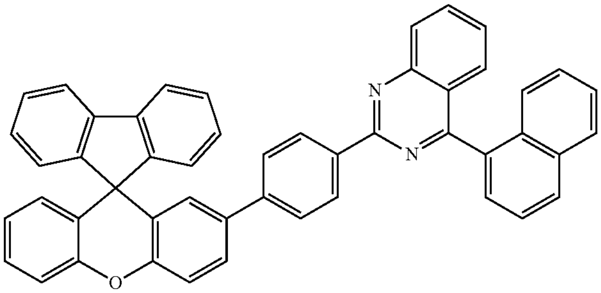
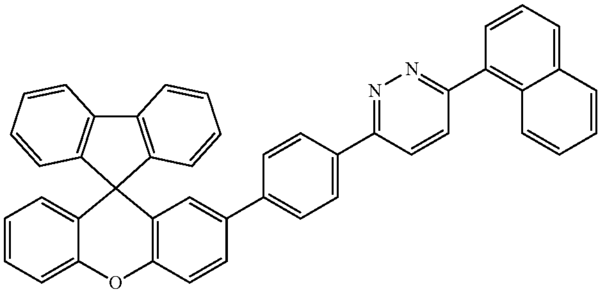
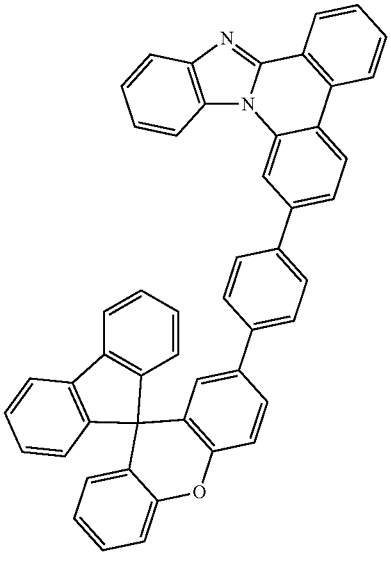
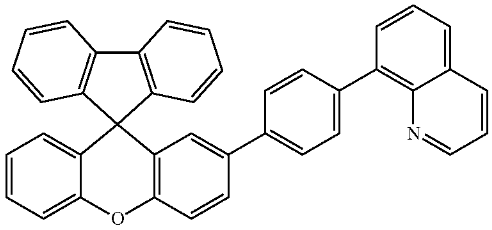

-continued
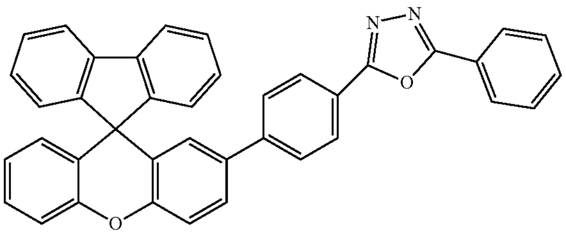
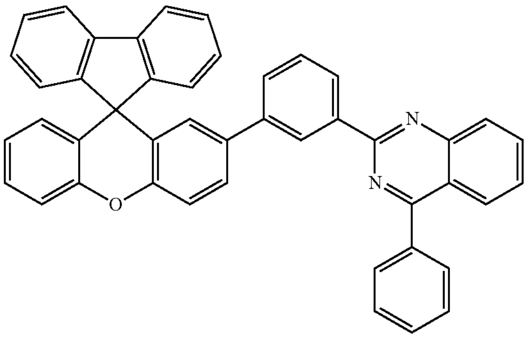
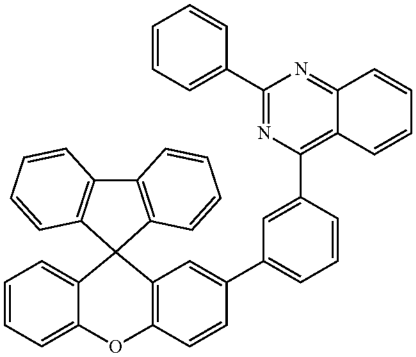
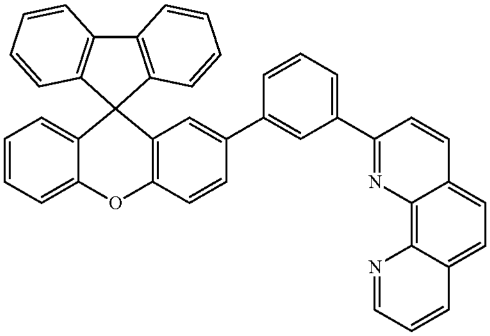
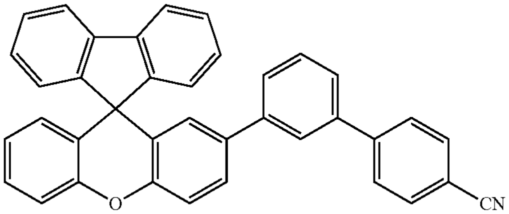
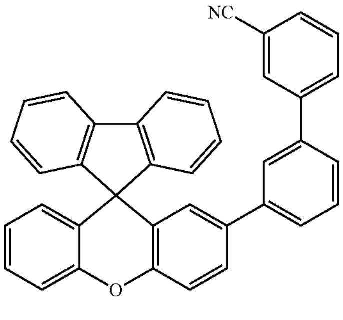
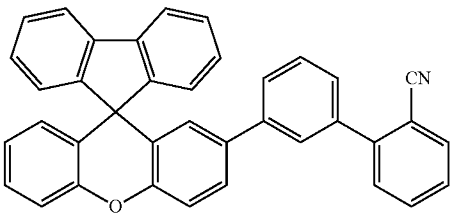
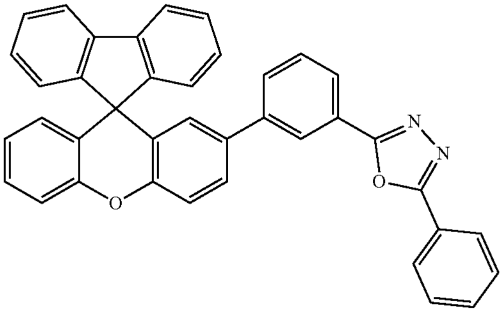

-continued
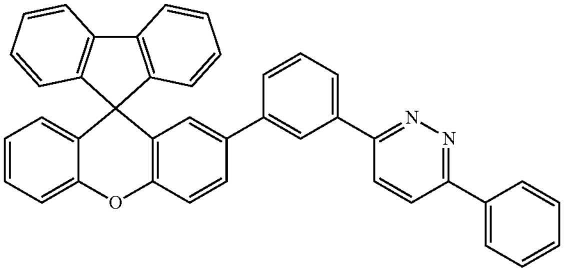
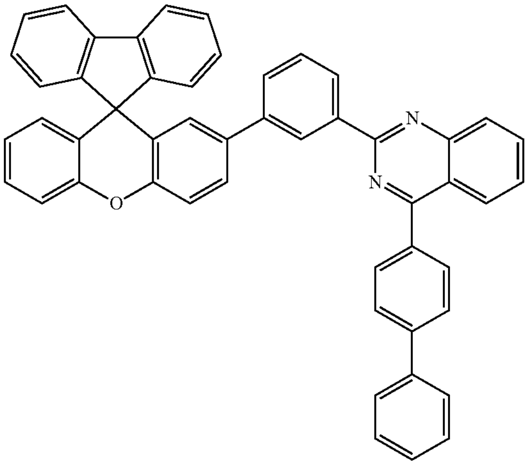
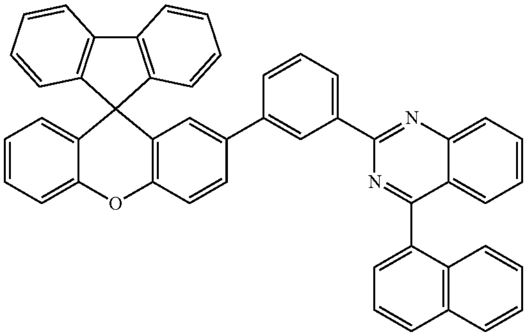
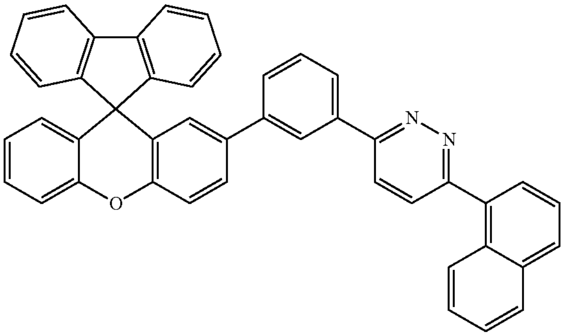
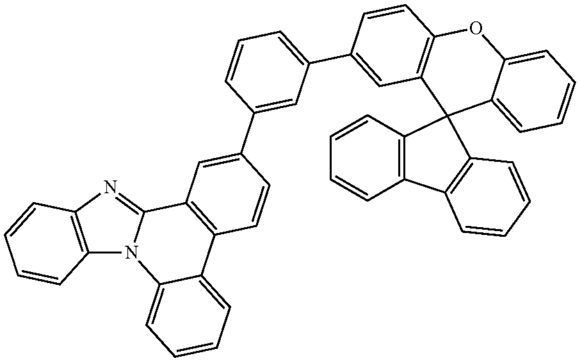
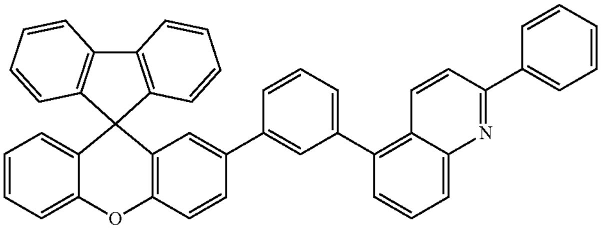
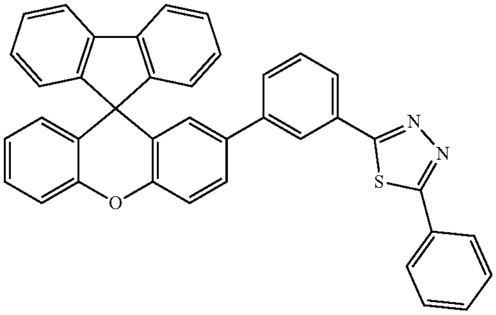
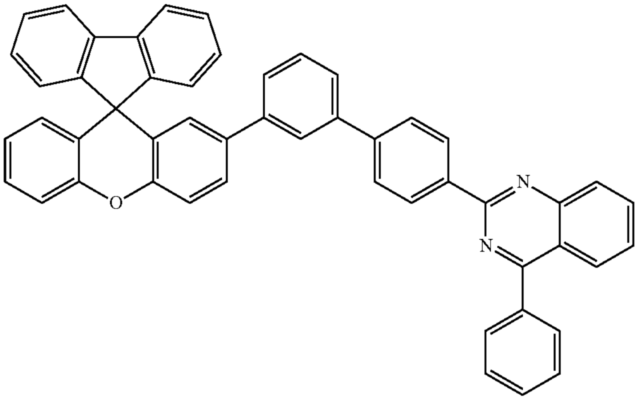

-continued
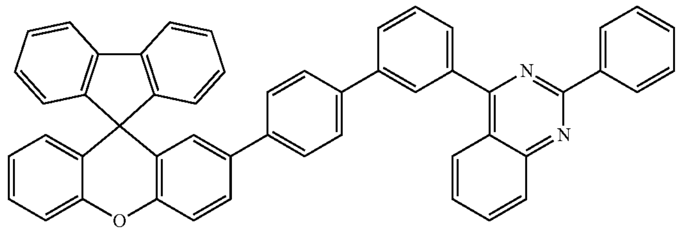
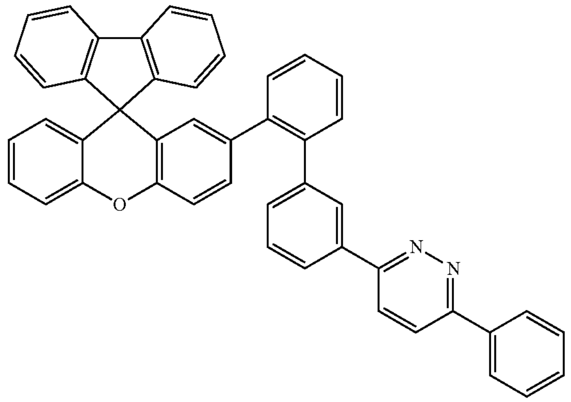
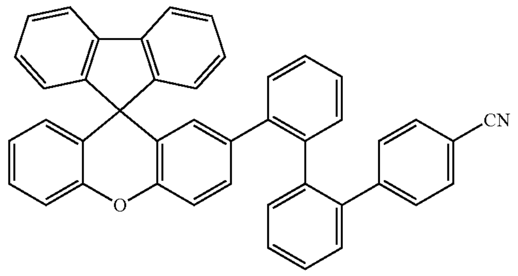
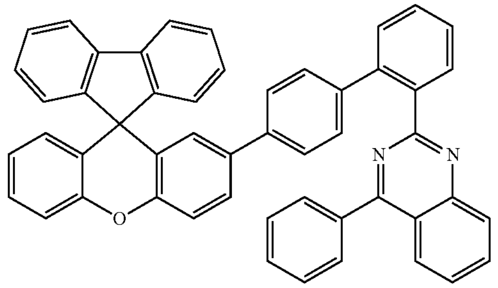
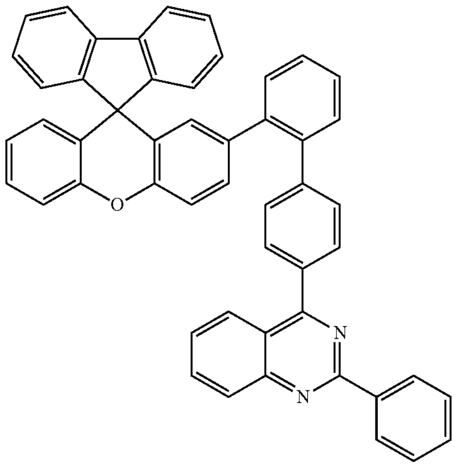
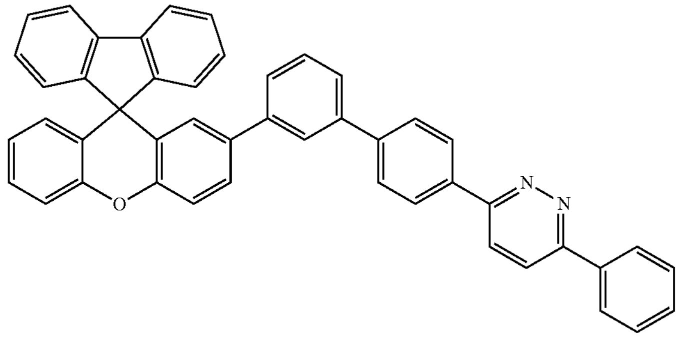

-continued
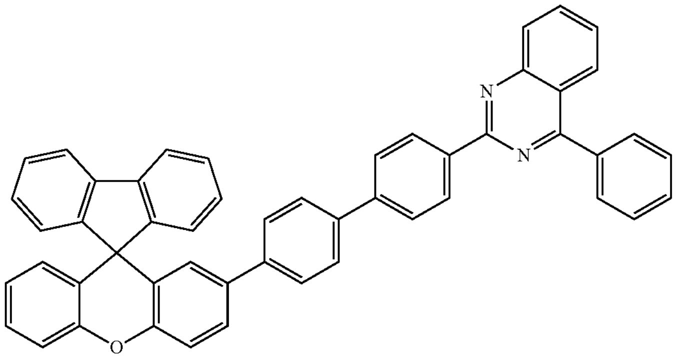
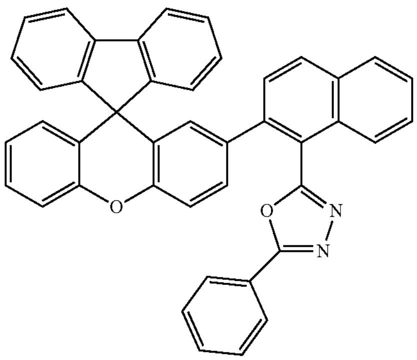
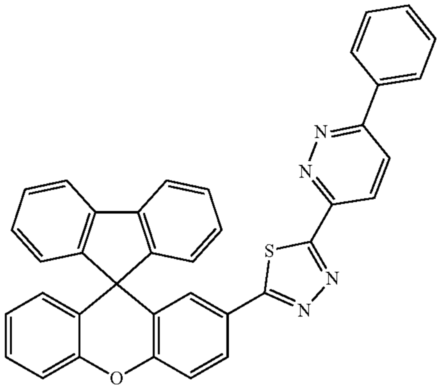
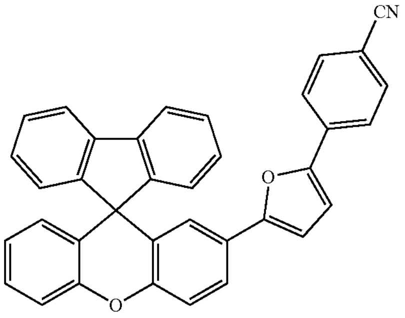
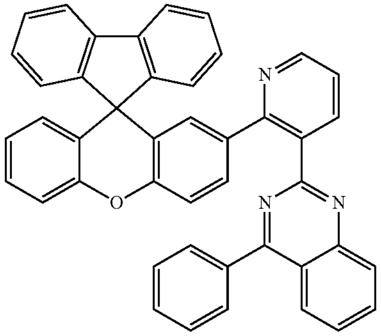
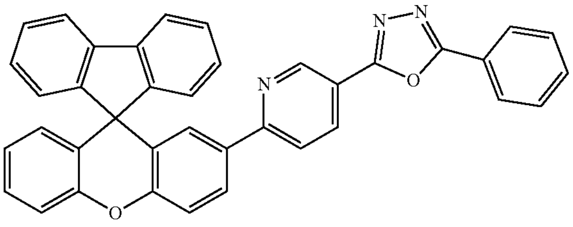
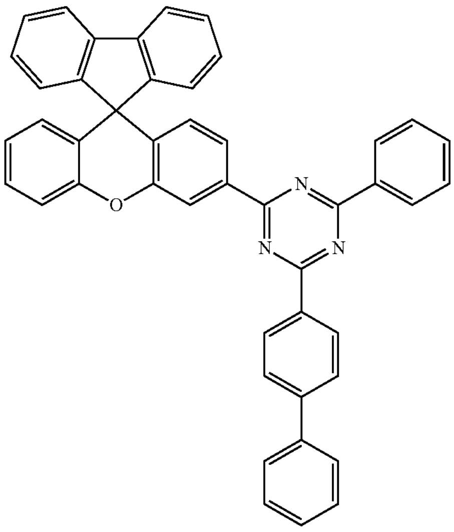
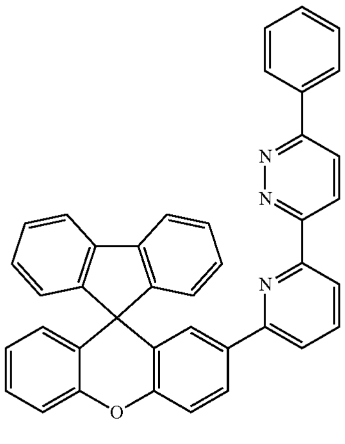

-continued
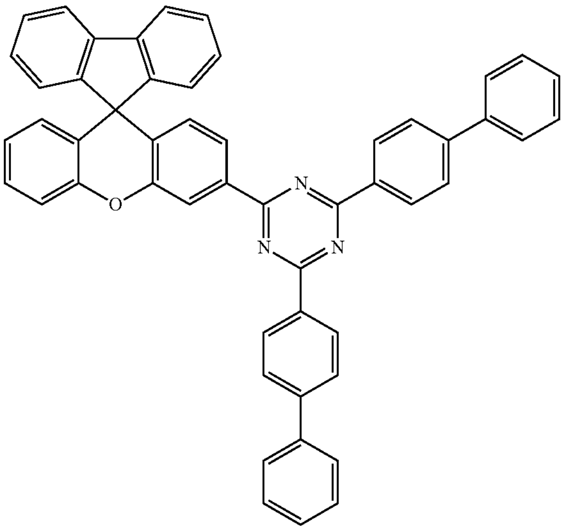
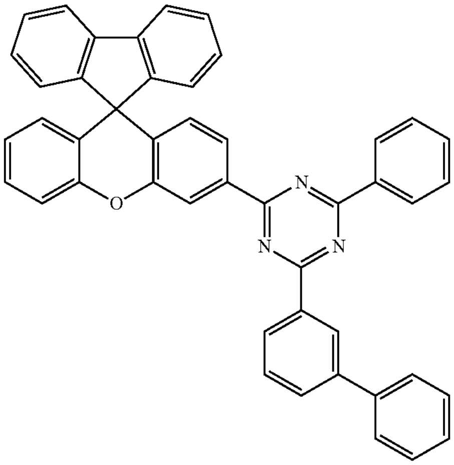
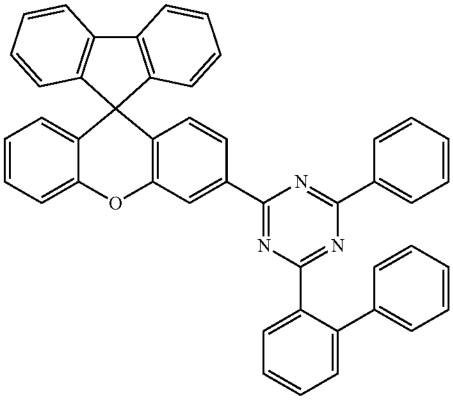
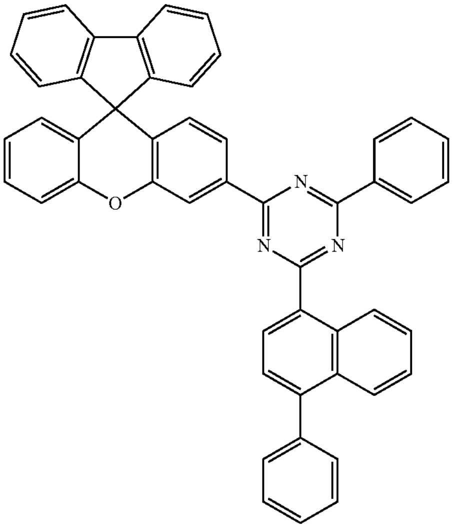
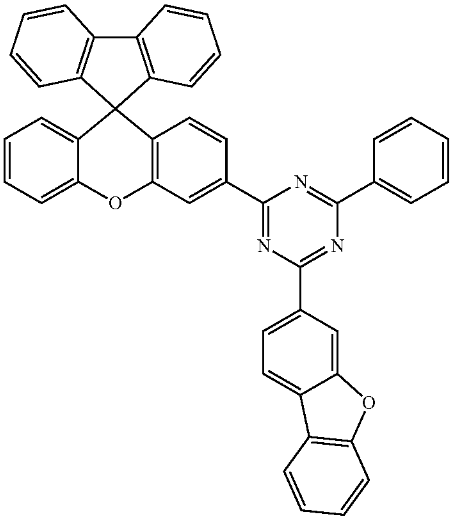
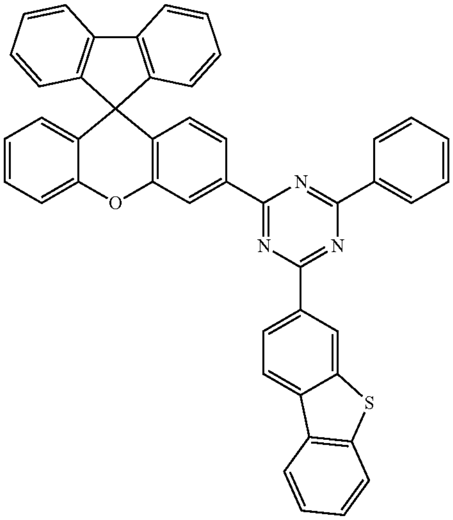

-continued
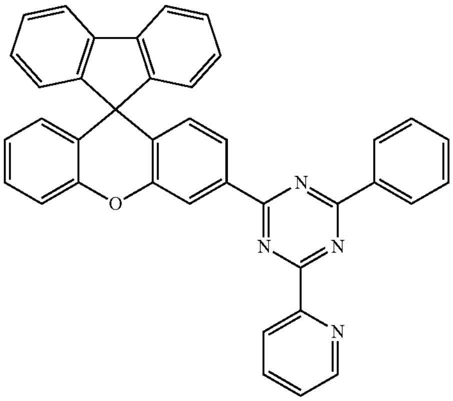
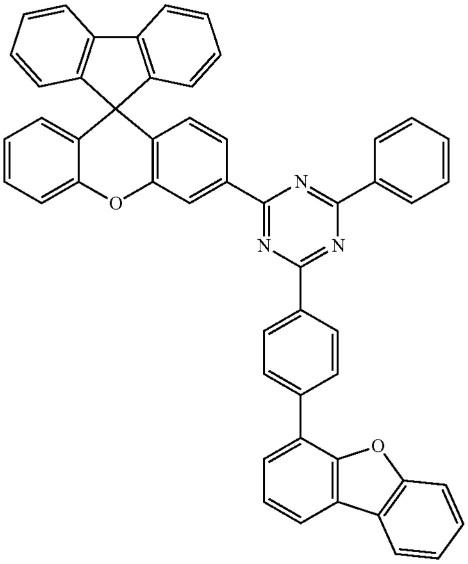
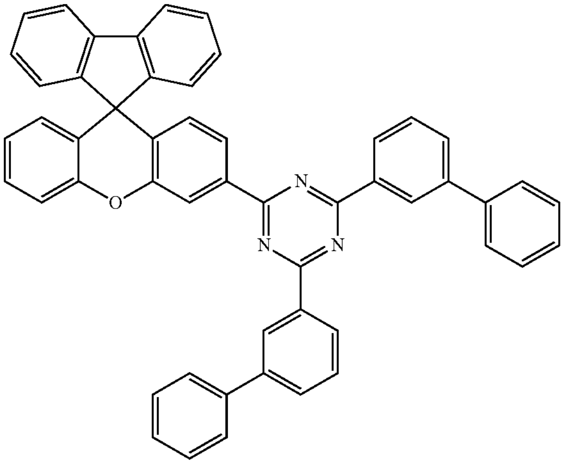
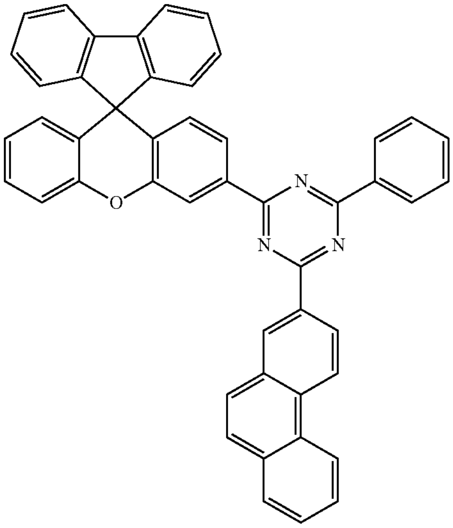
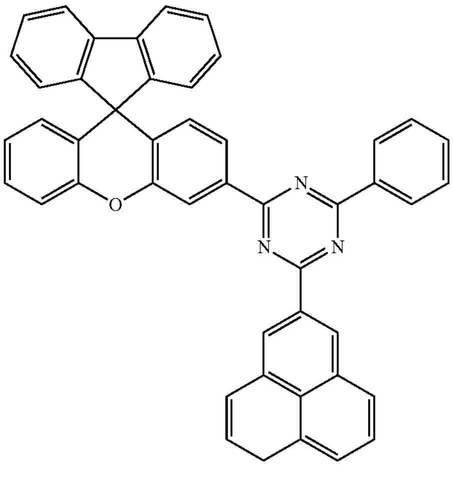
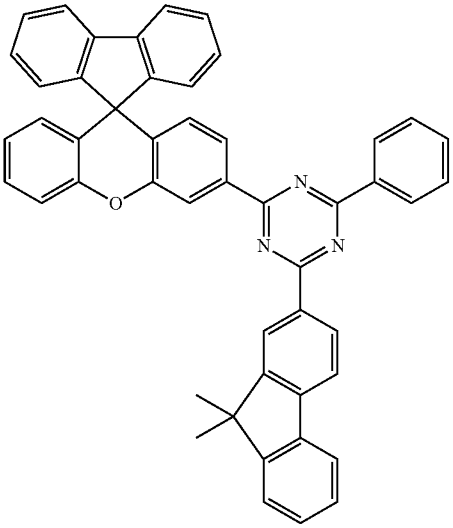

-continued
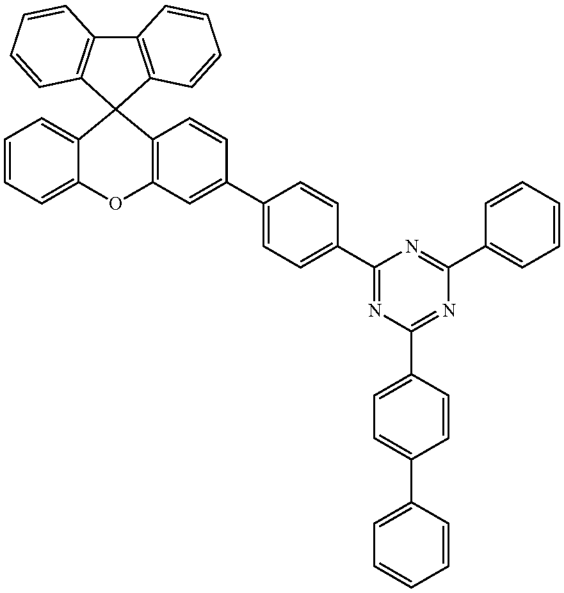
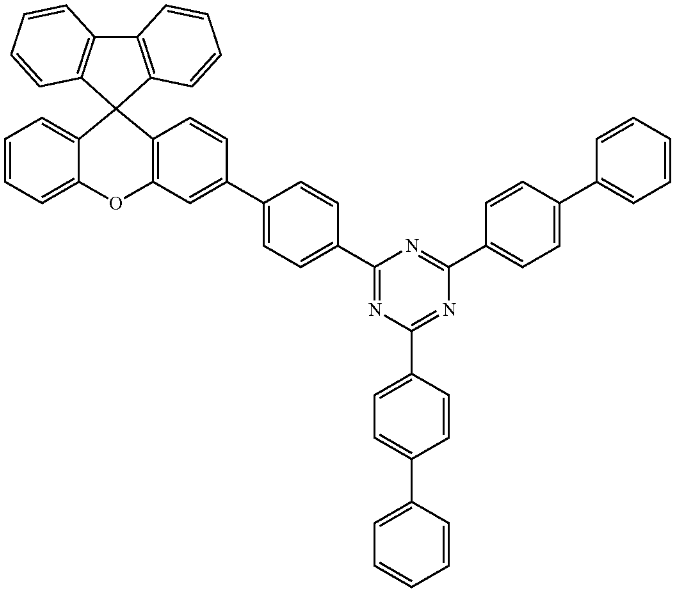
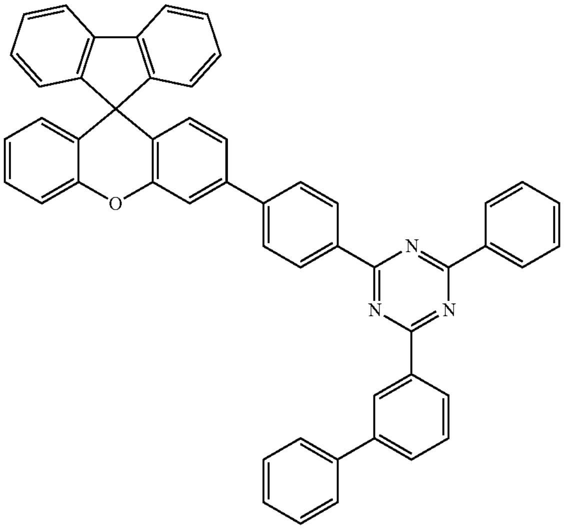
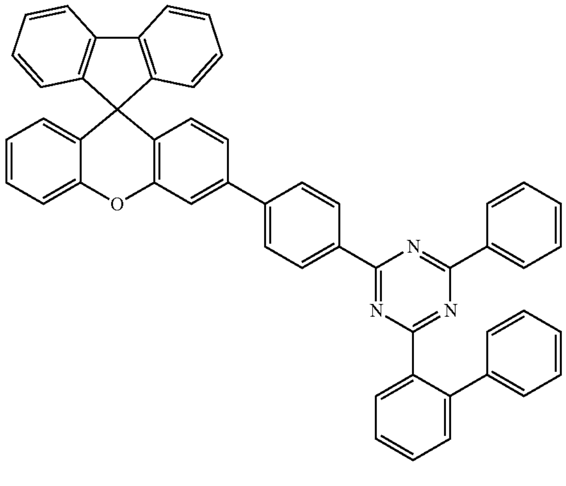

-continued
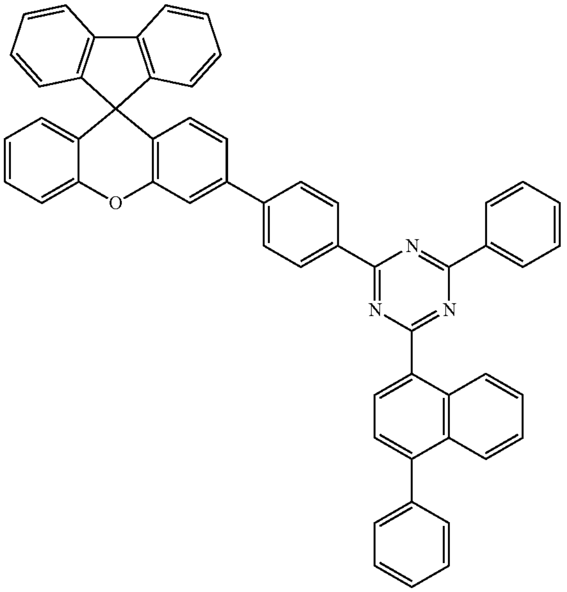
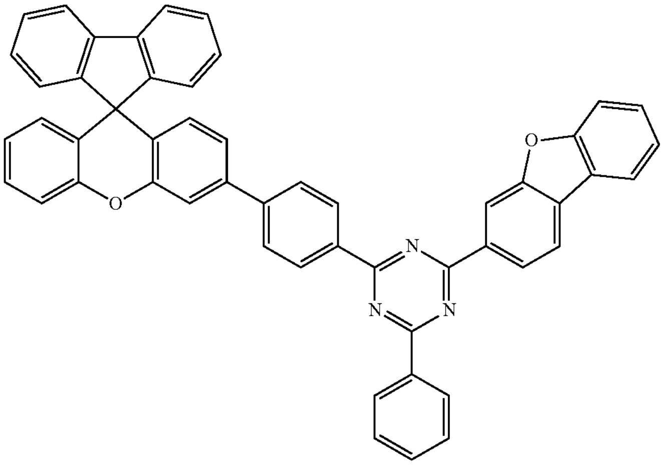
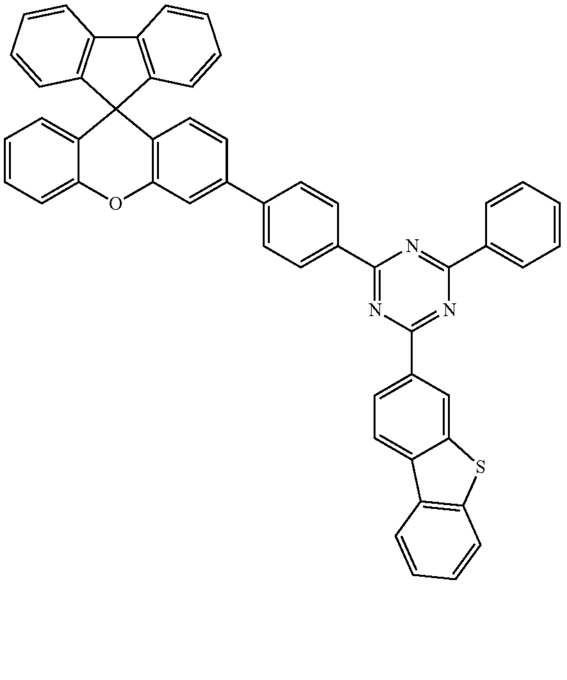
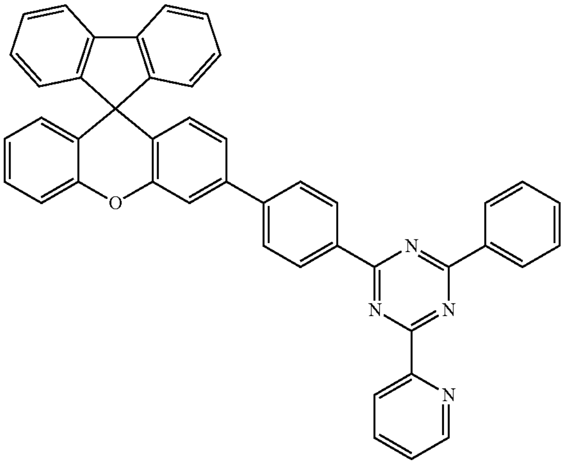

-continued
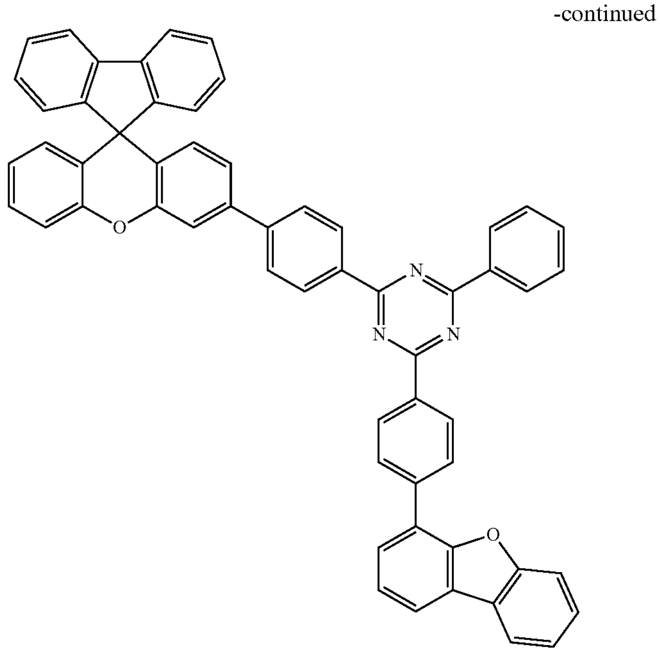
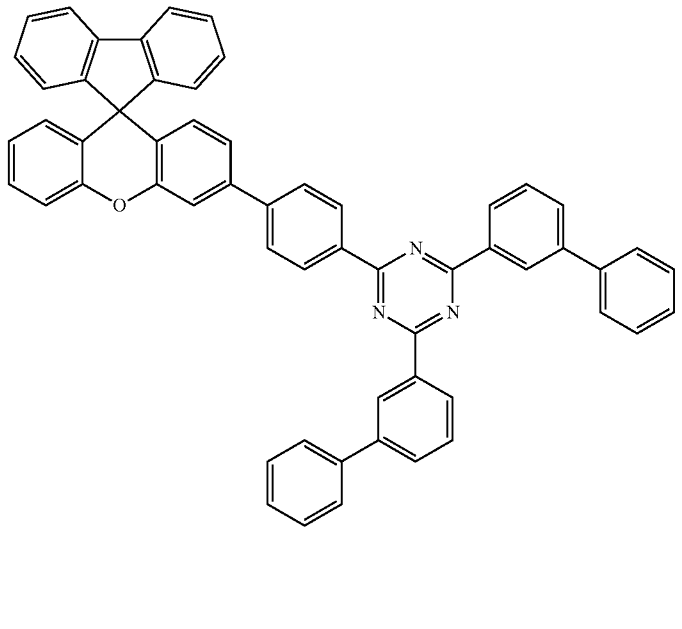

-continued
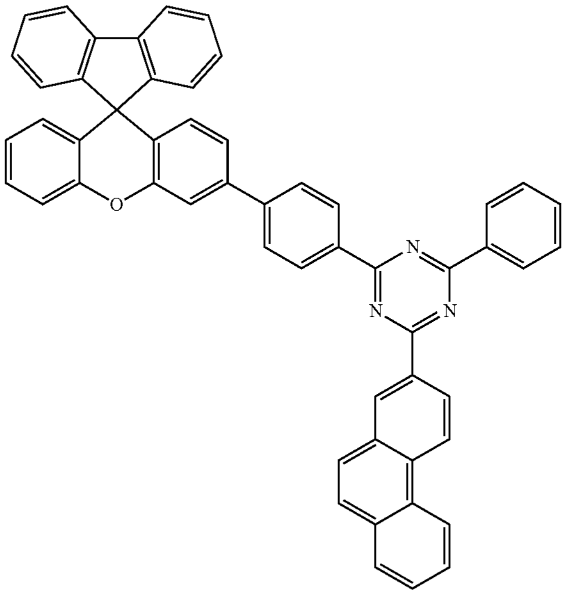
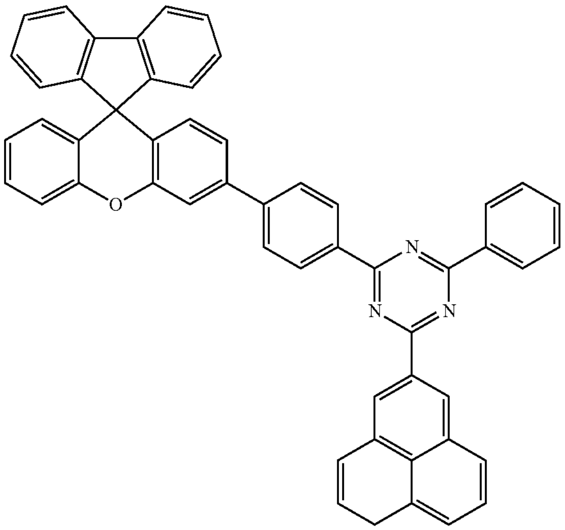
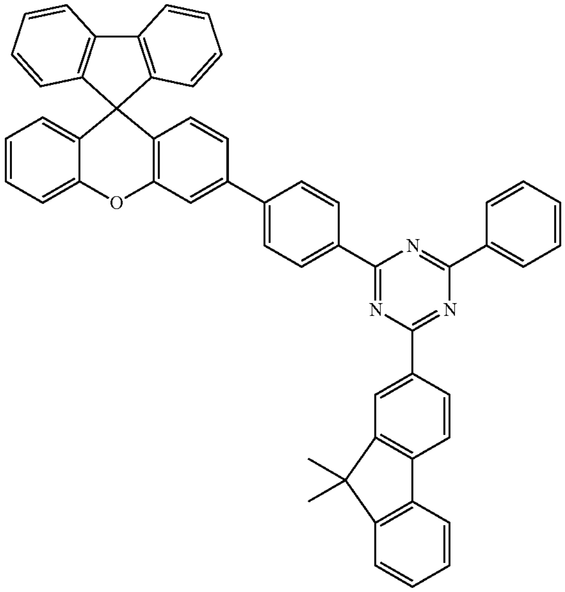
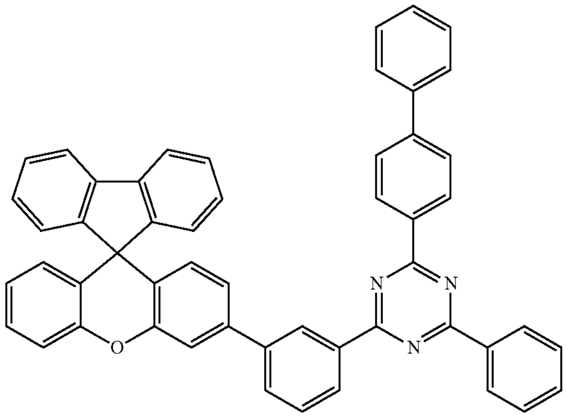
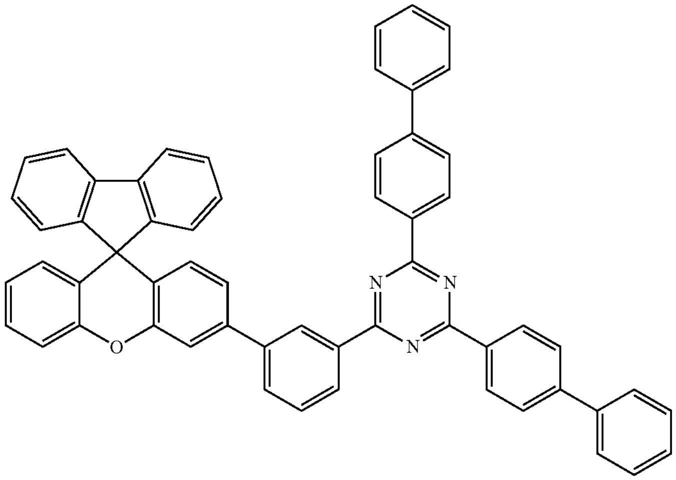
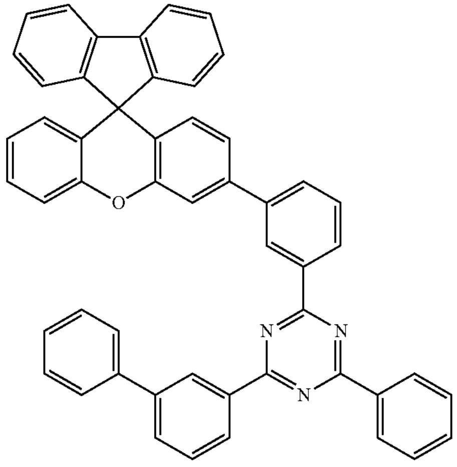

-continued
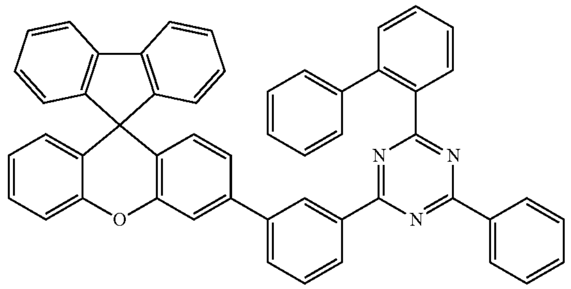
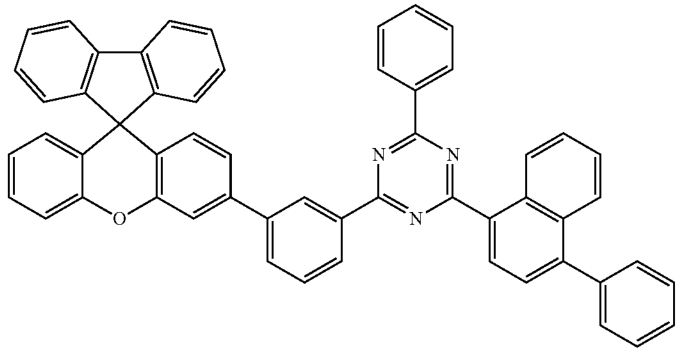
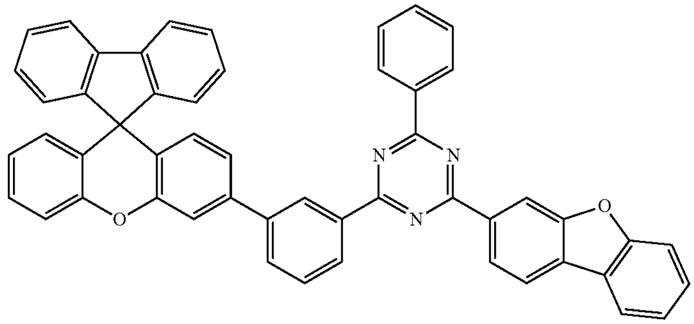
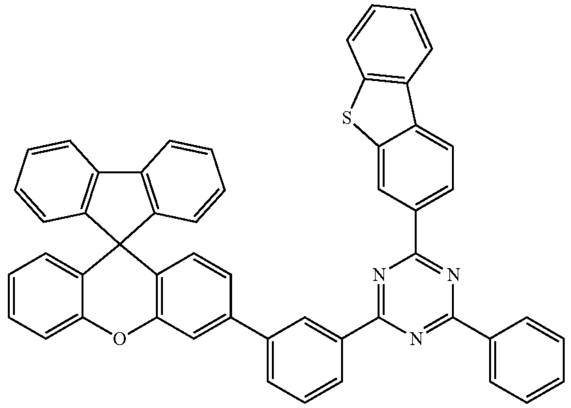
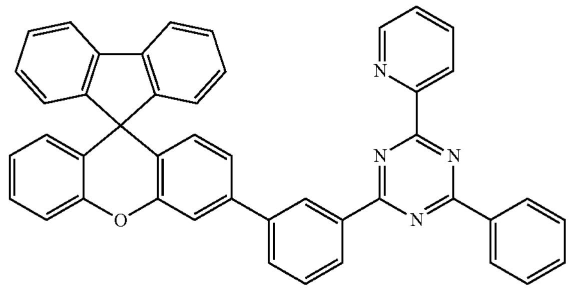

-continued
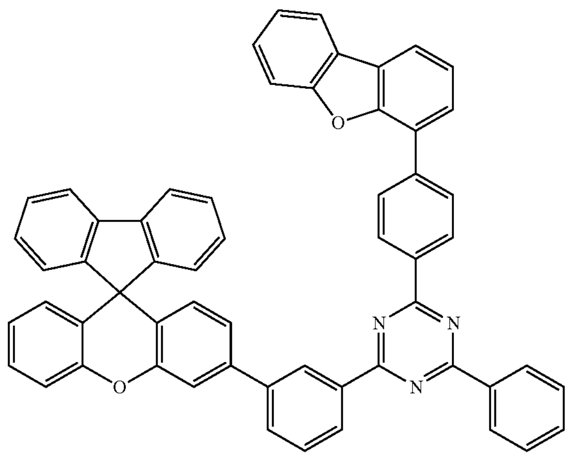
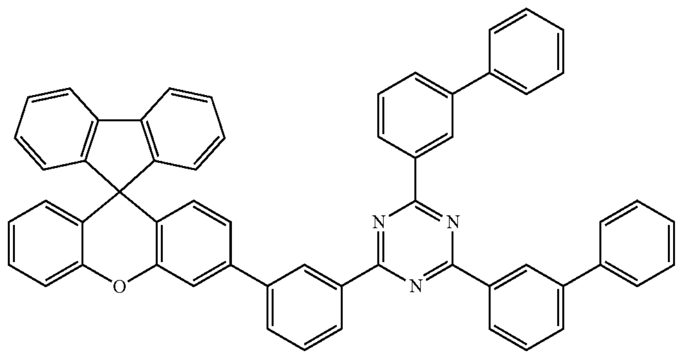
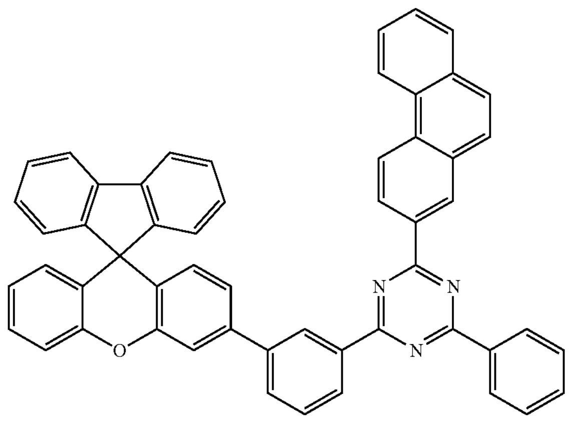
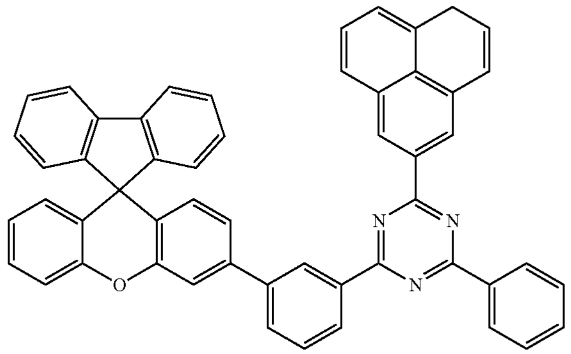

-continued
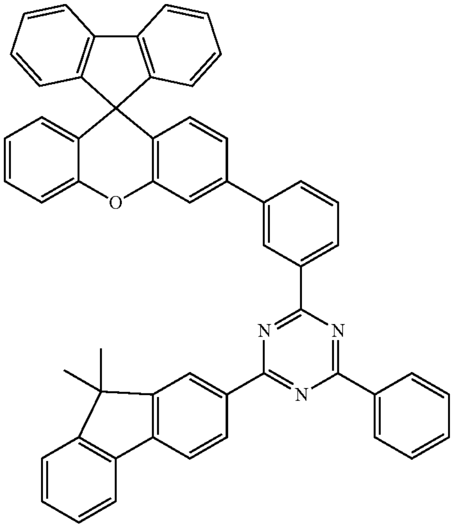
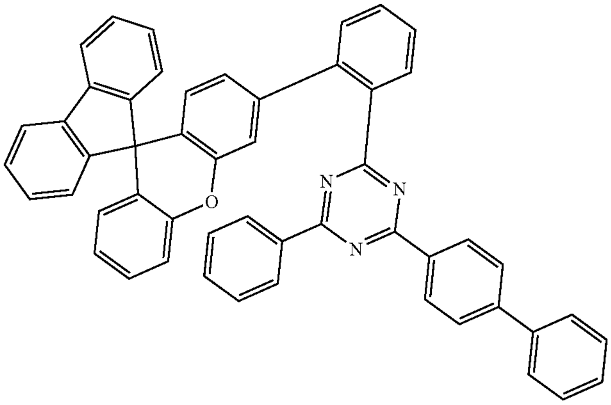
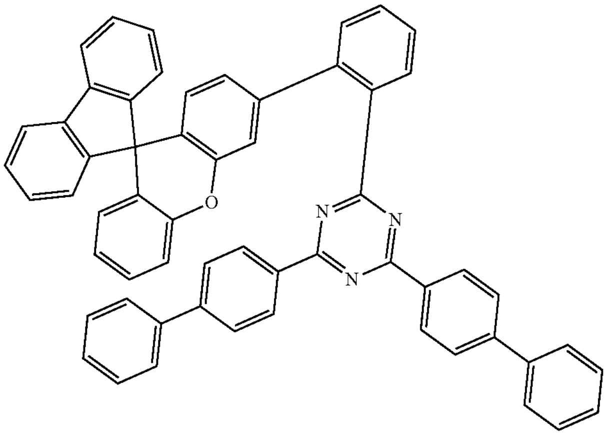
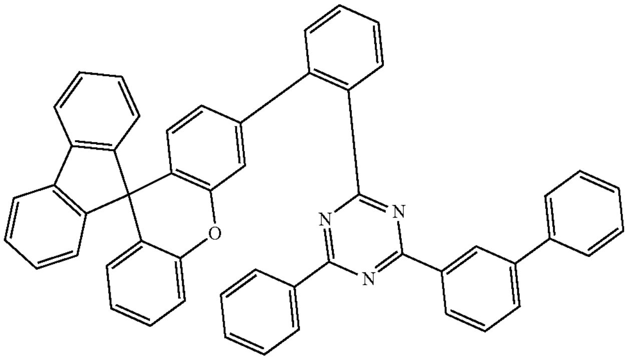
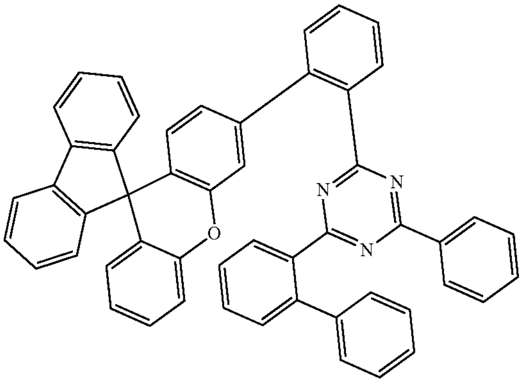
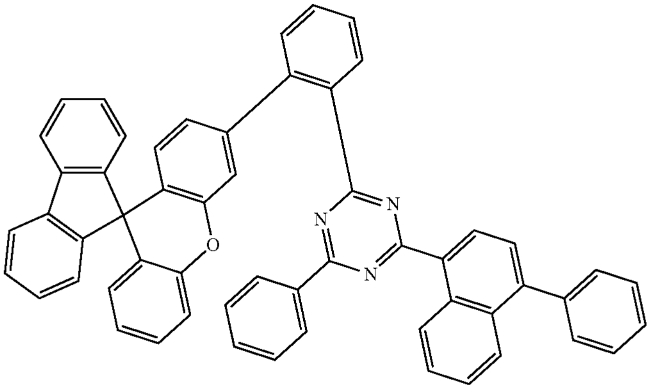

-continued
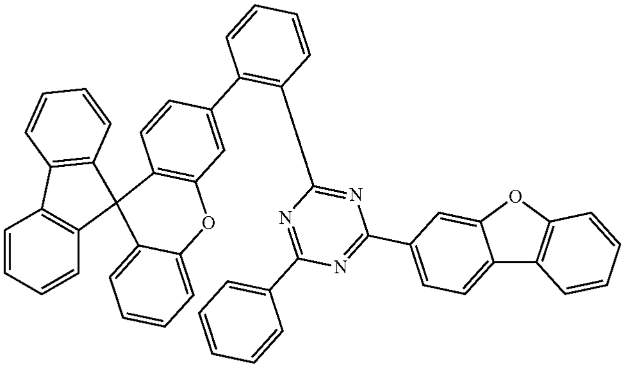
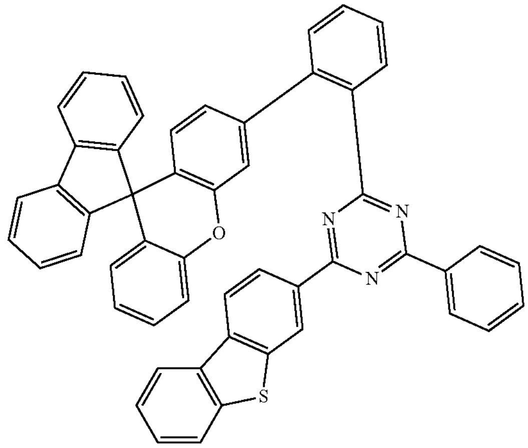
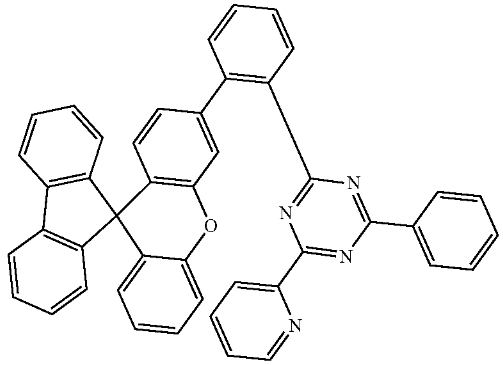
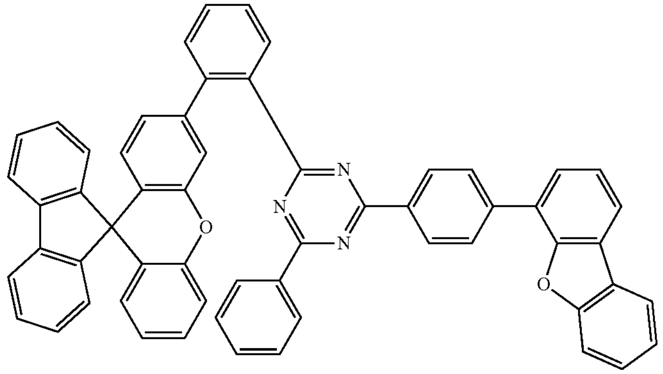
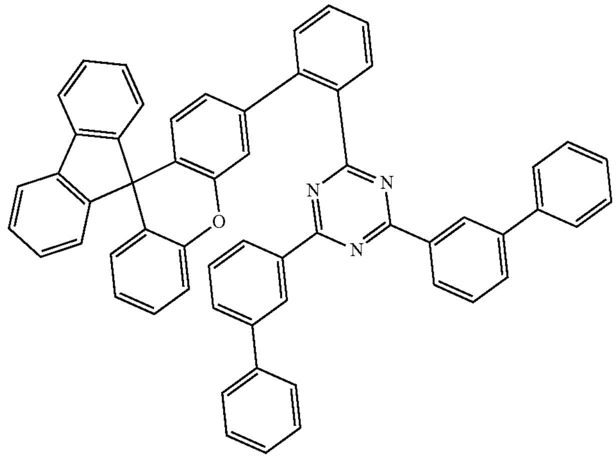
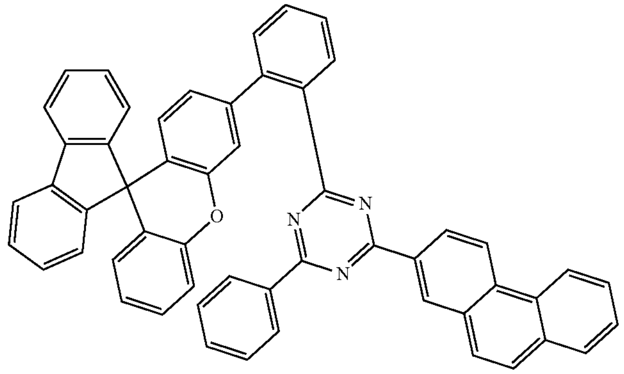

-continued
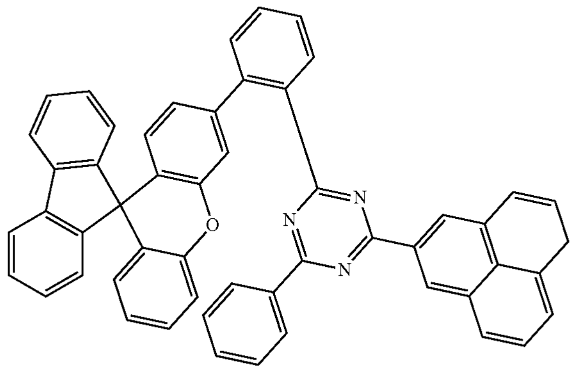
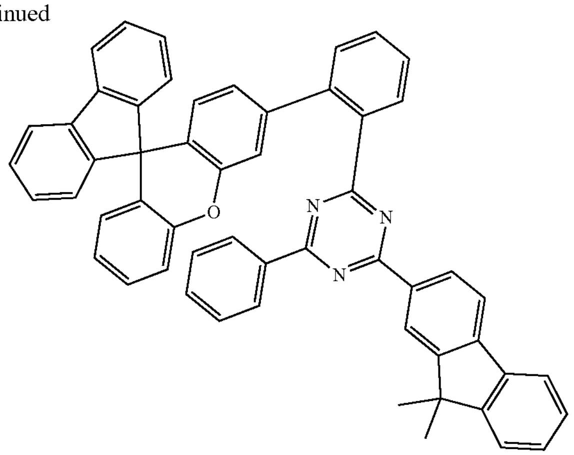
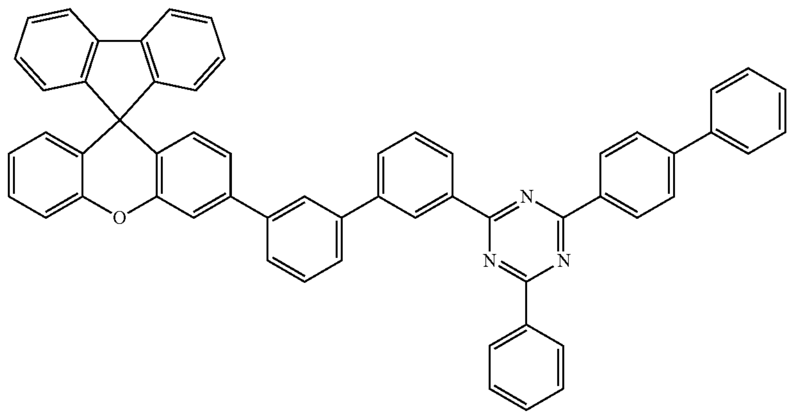
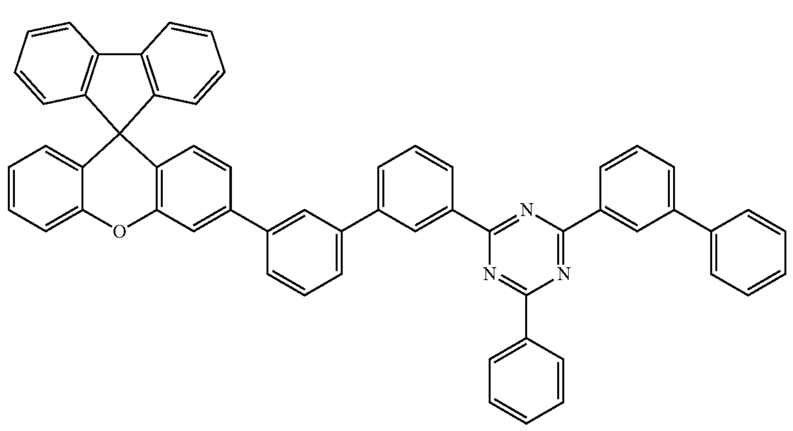

-continued
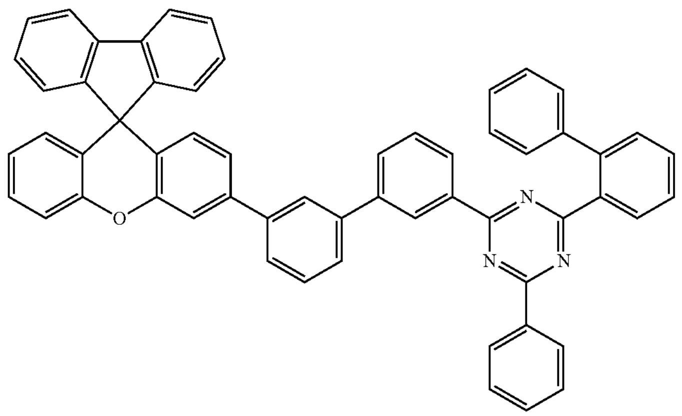
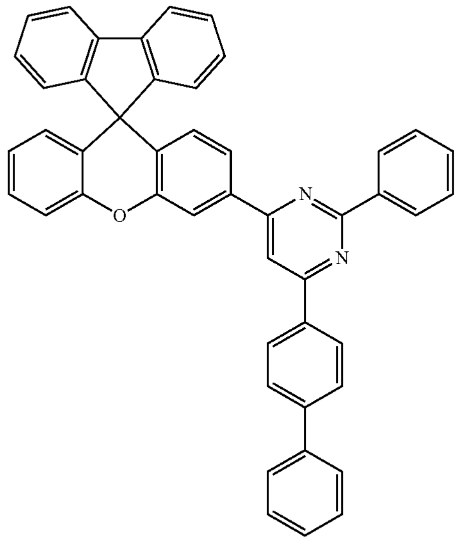
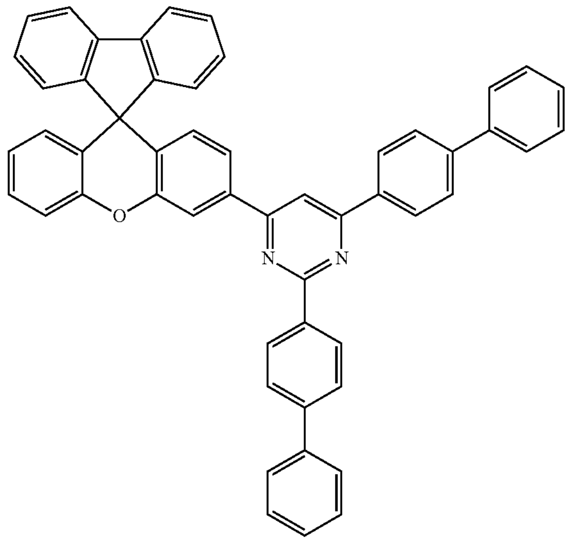
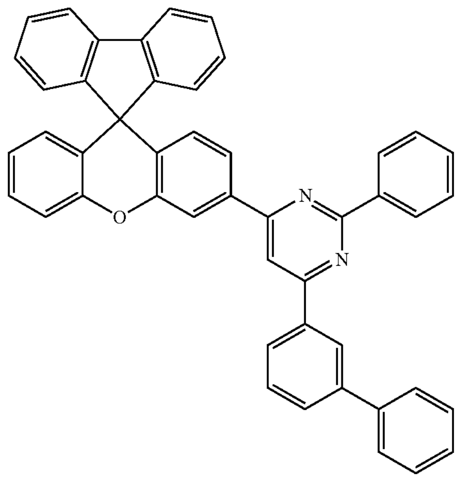
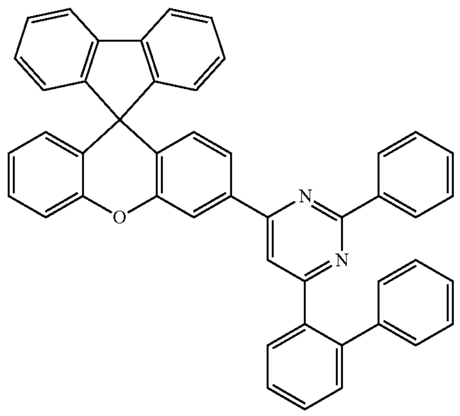

-continued
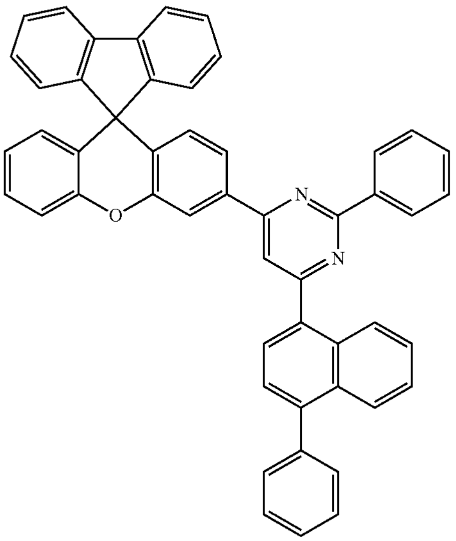
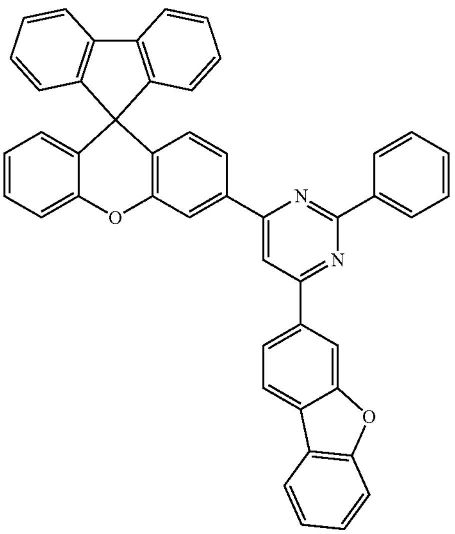
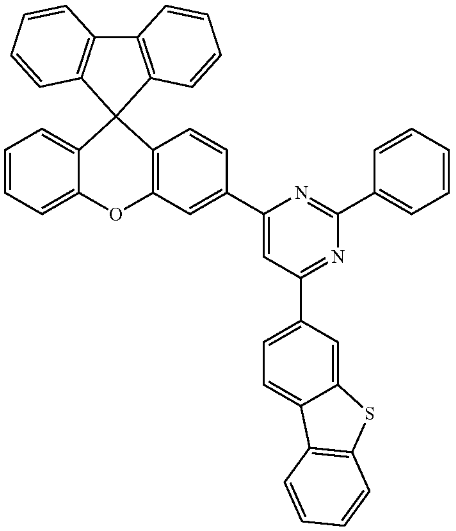
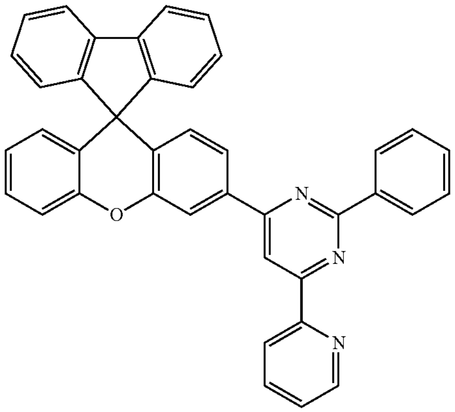
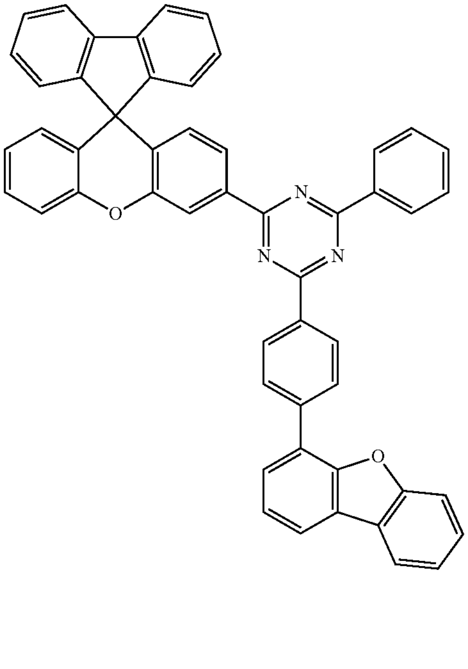
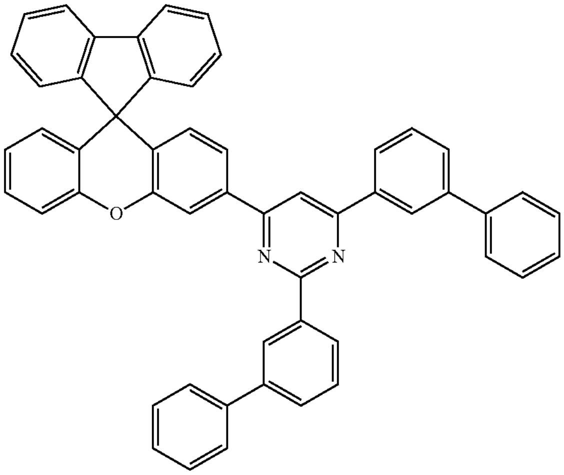

-continued
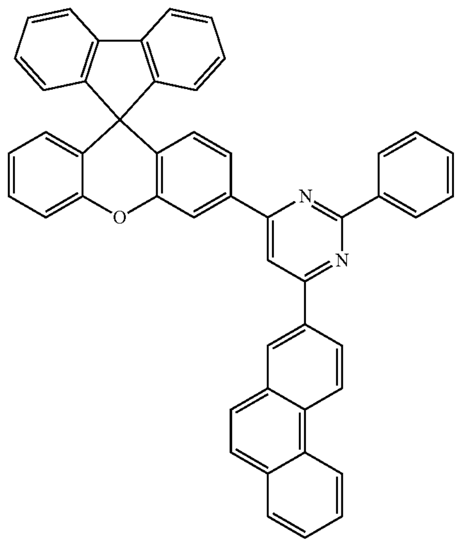
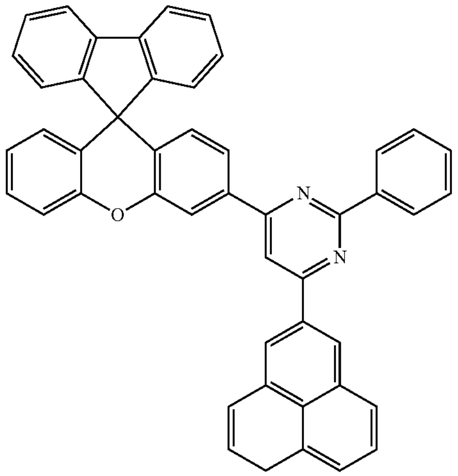
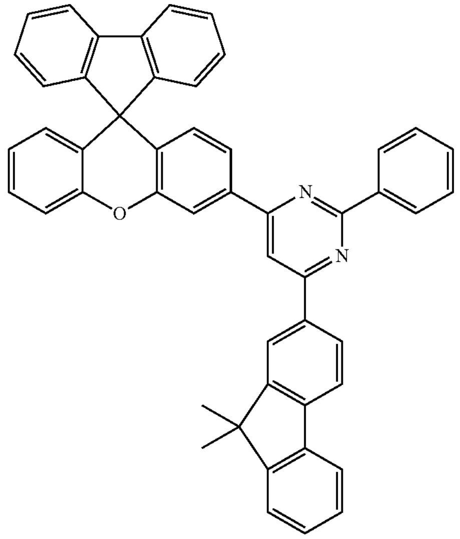
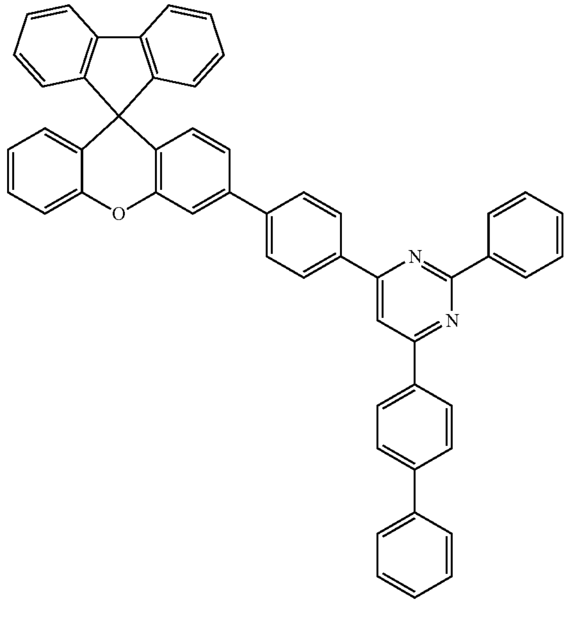

-continued
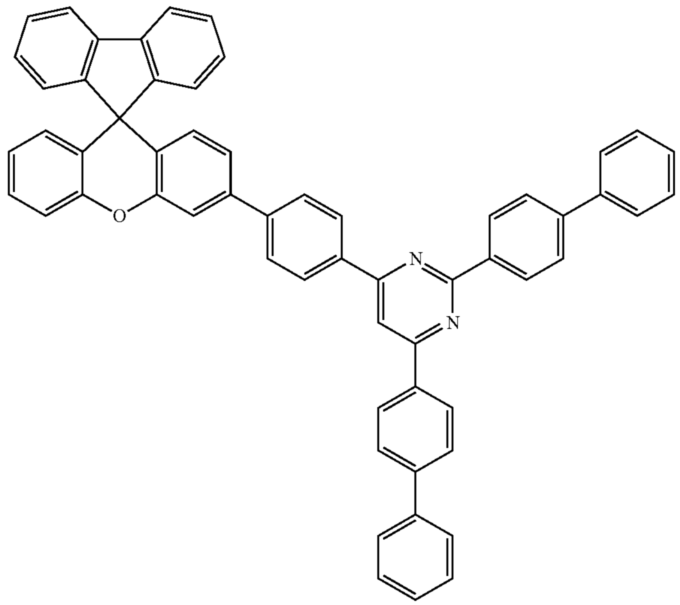
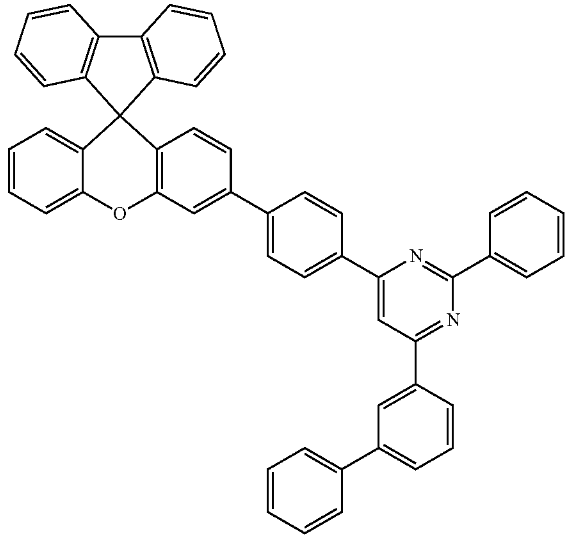
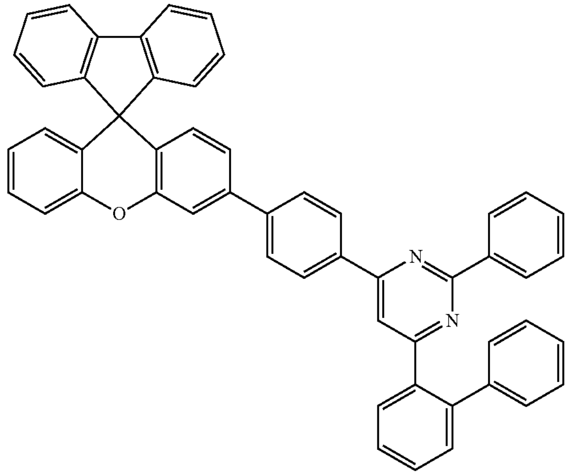

-continued
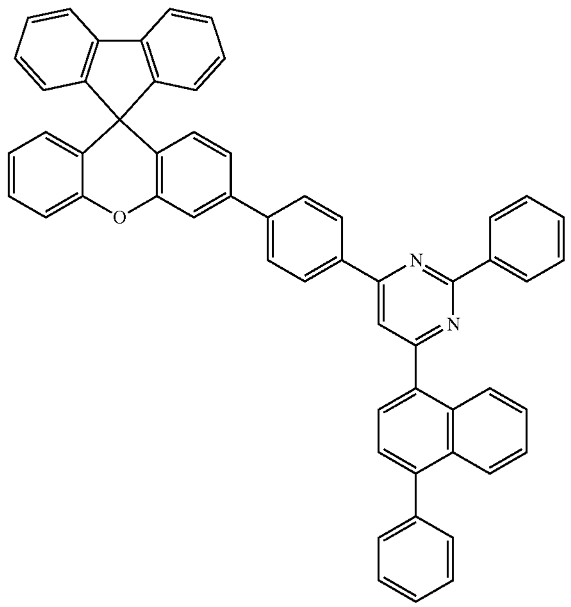
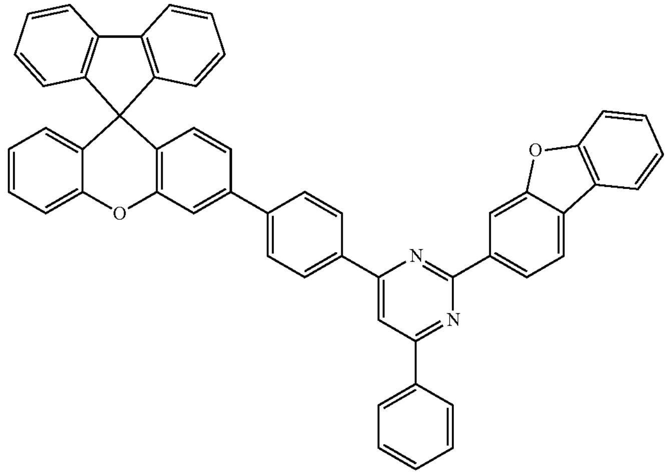
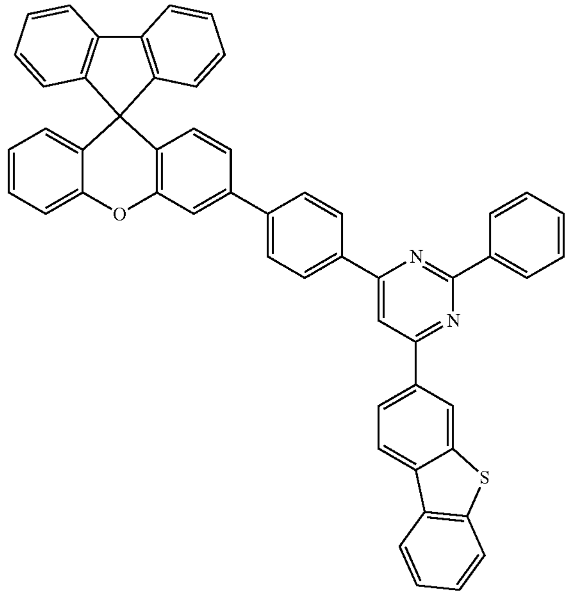
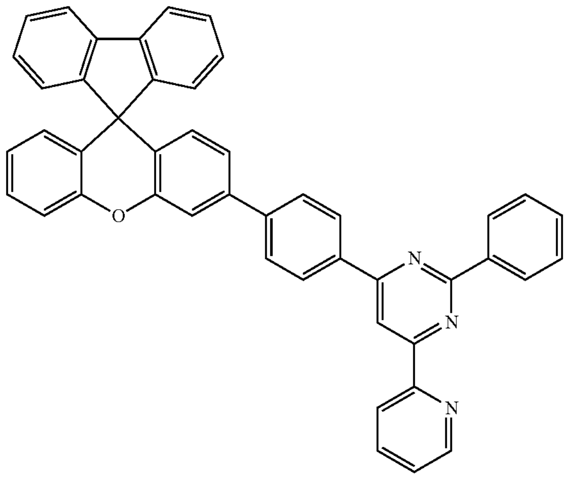

-continued
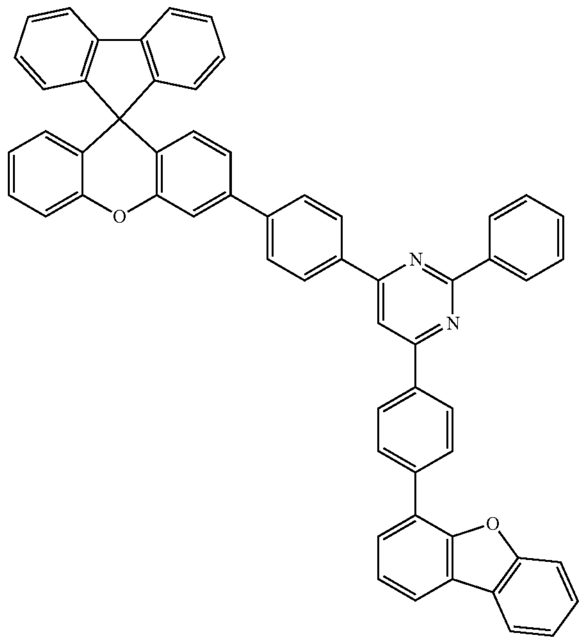
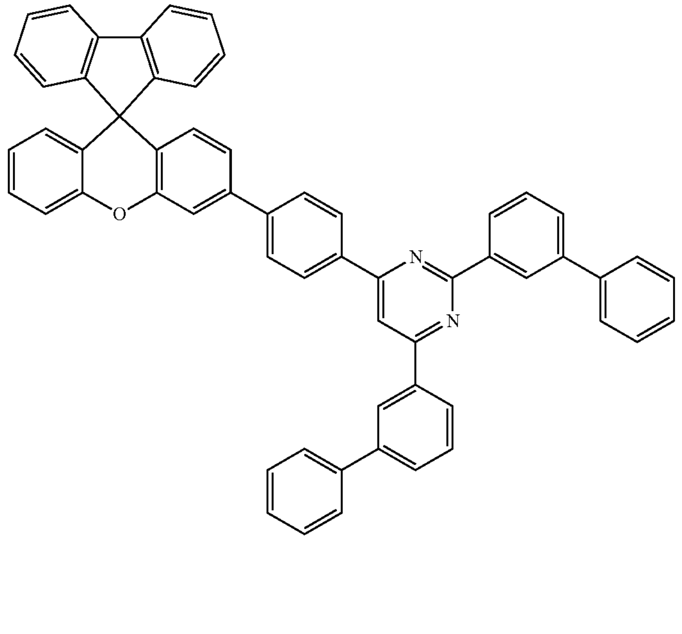

-continued
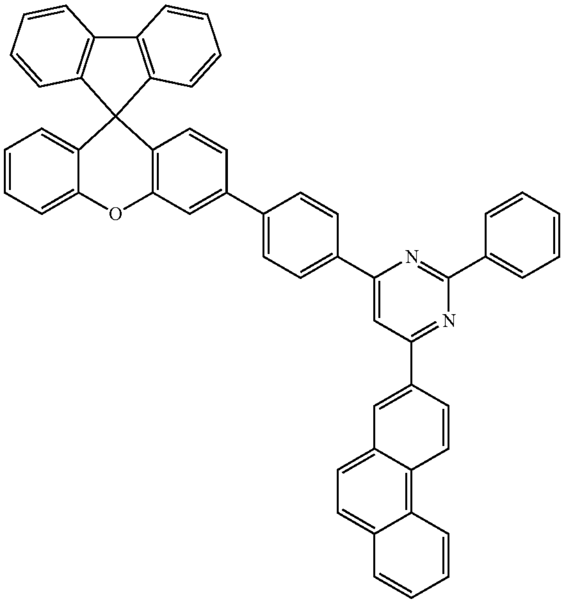
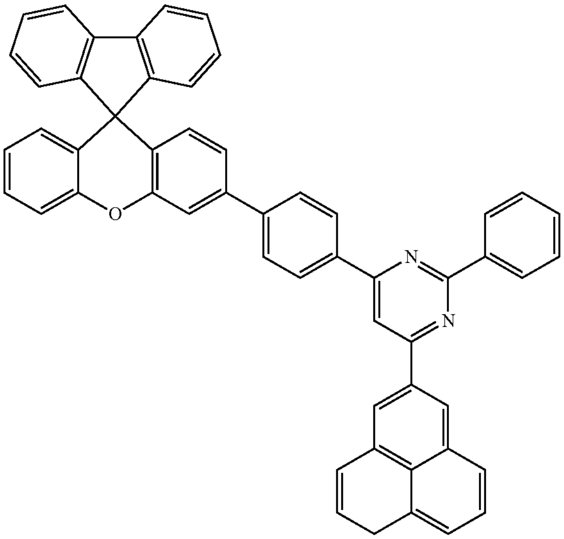
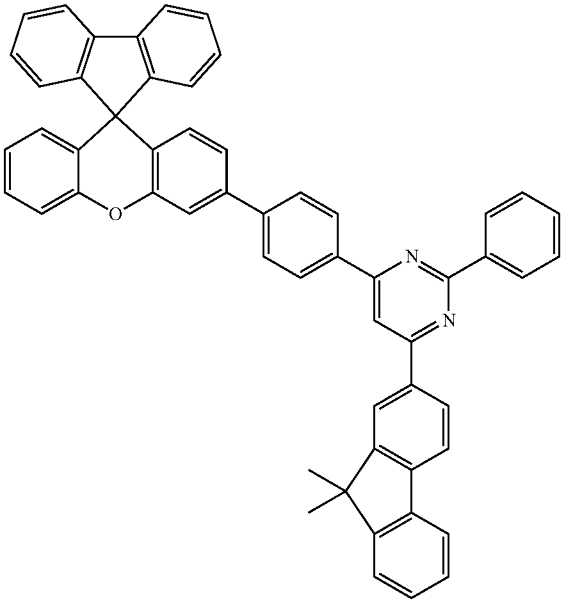
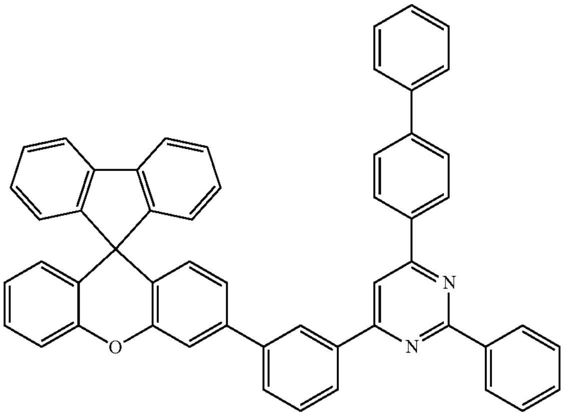
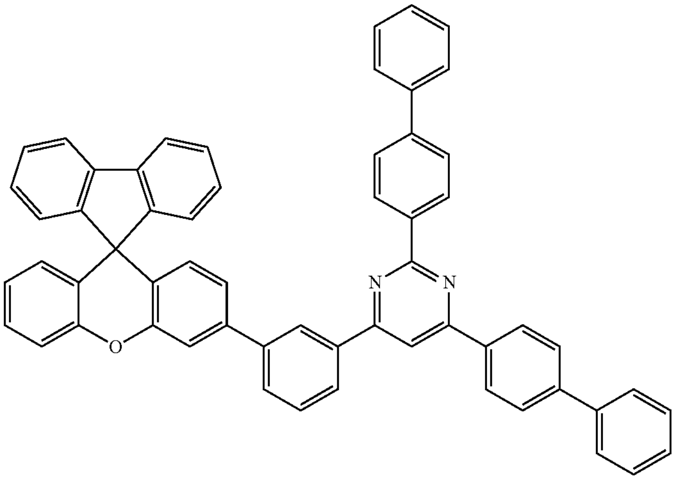
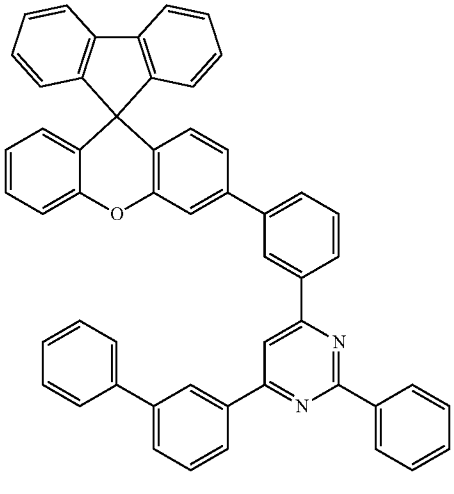

-continued
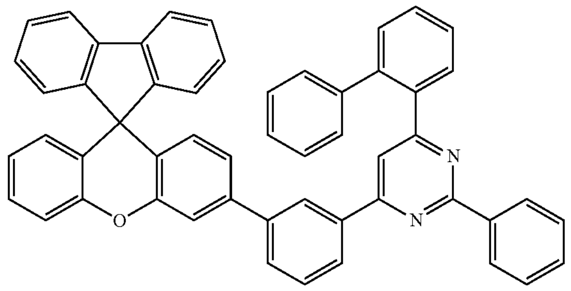
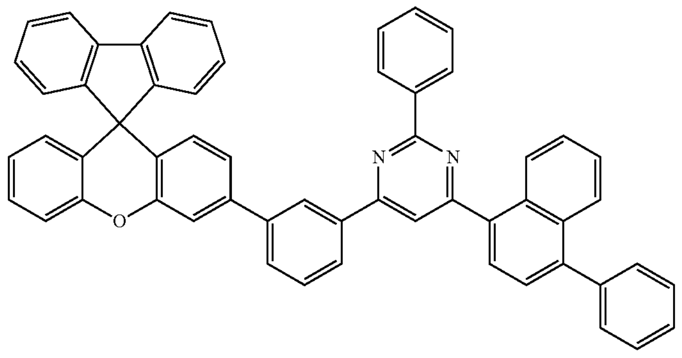
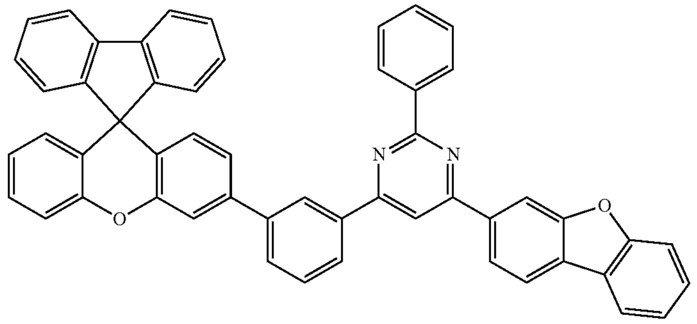
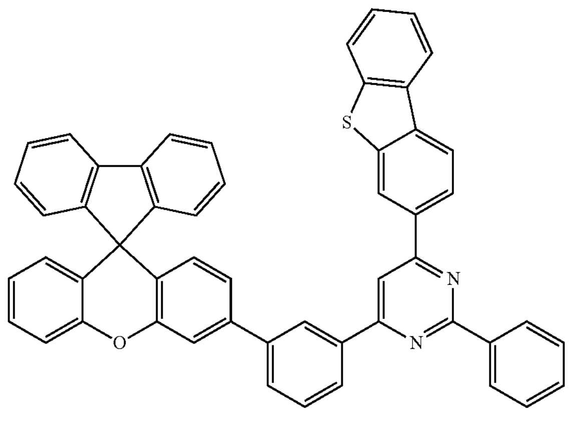
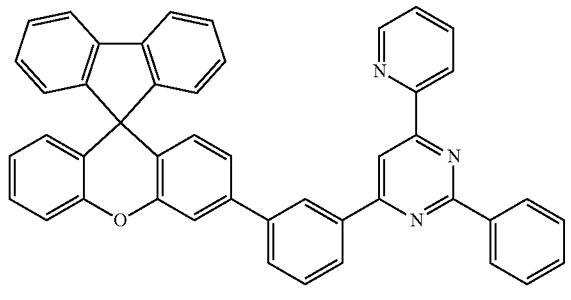

-continued
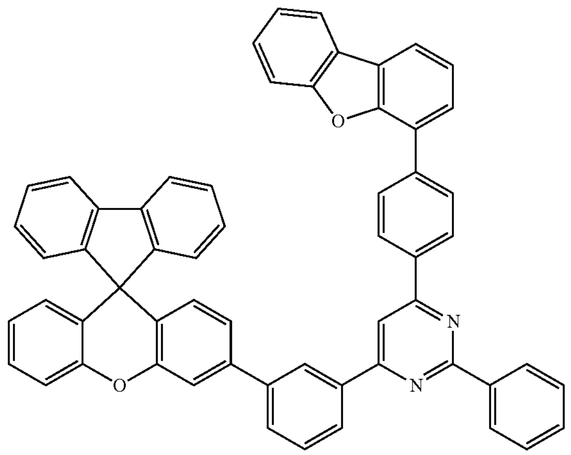
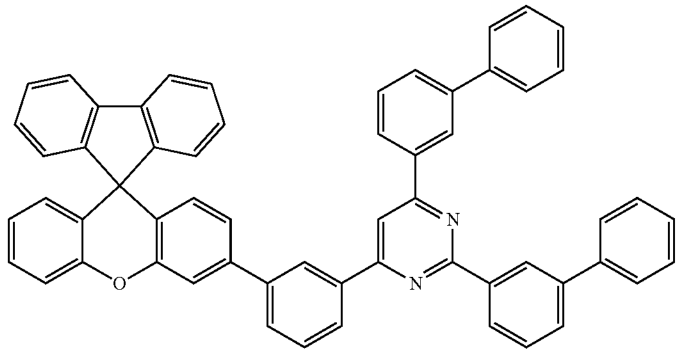
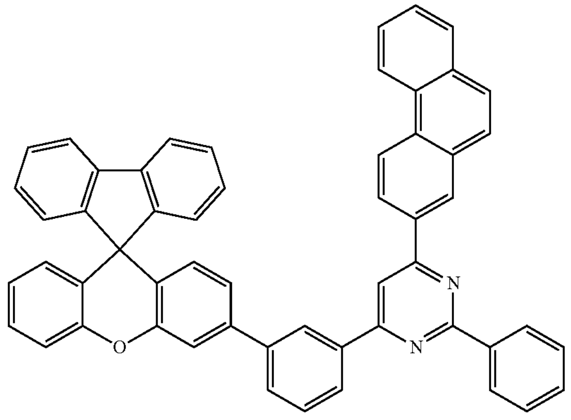
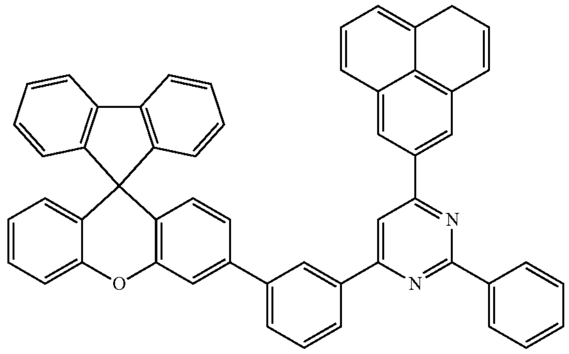

-continued
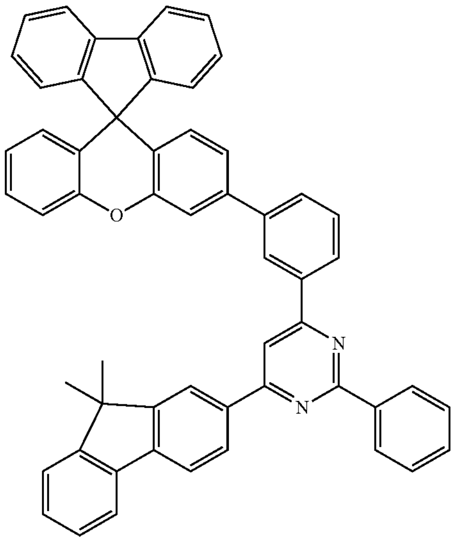
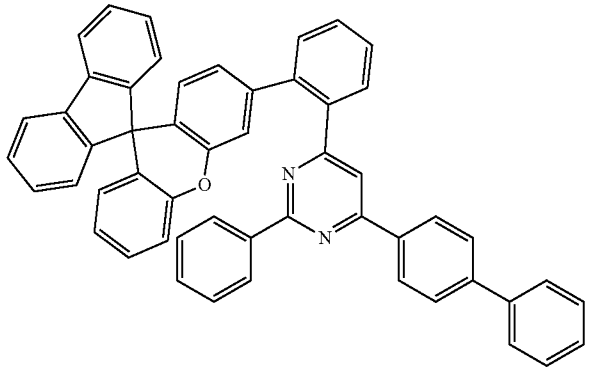
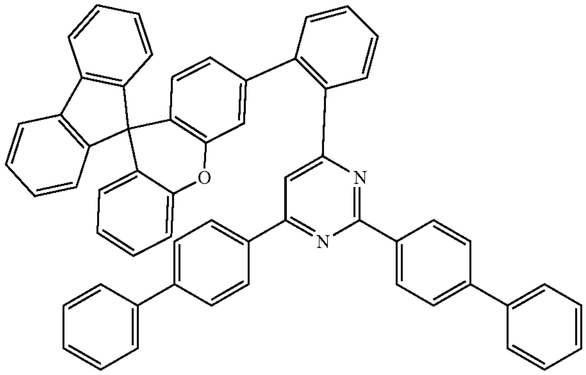
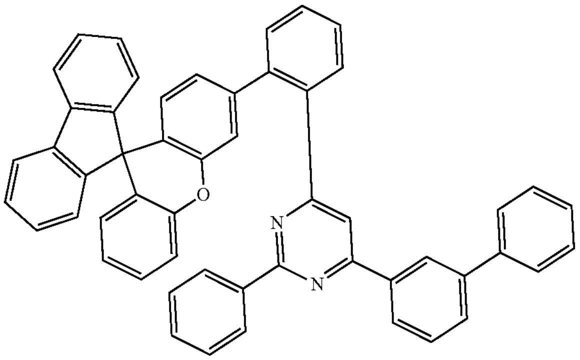
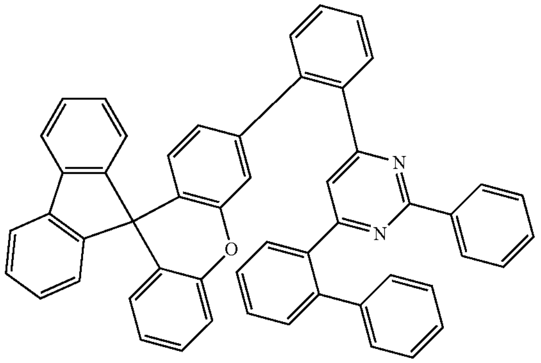
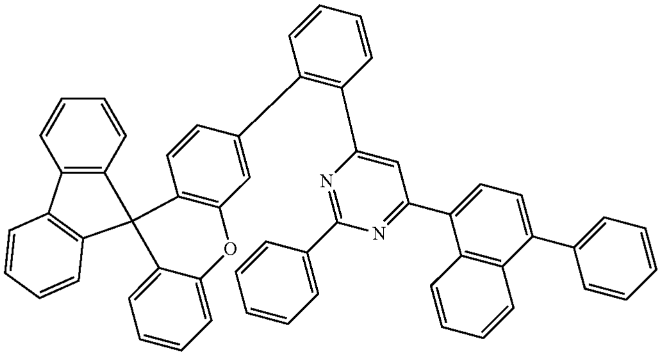
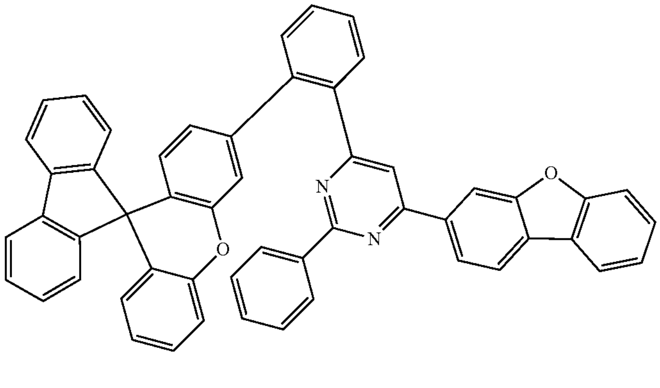
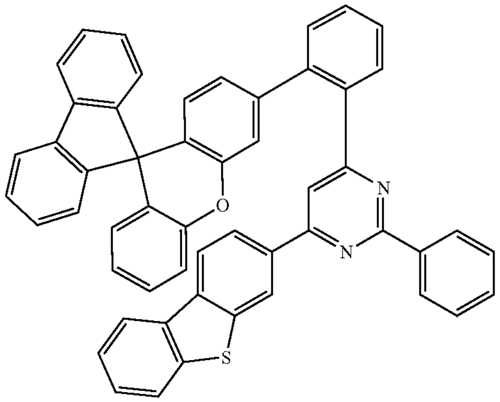

-continued
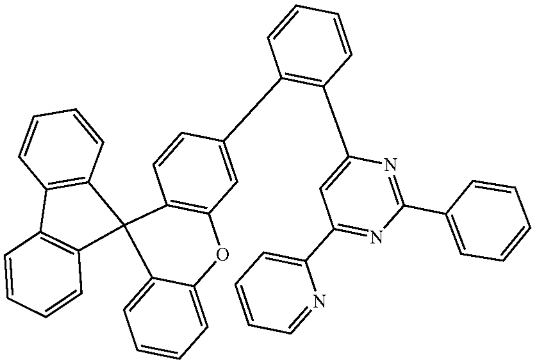
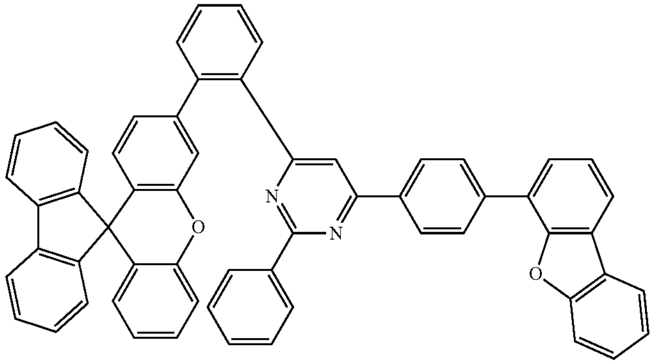
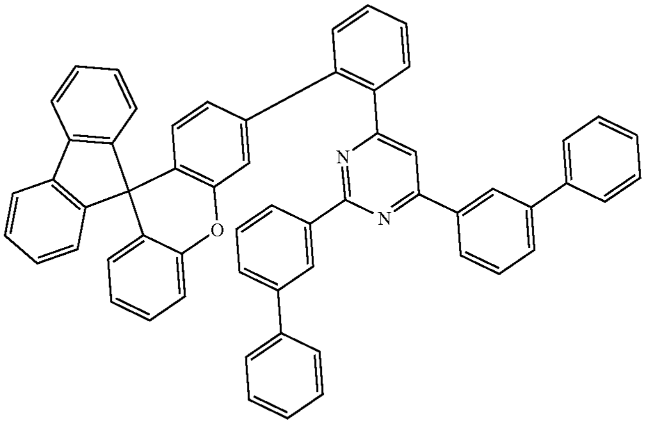
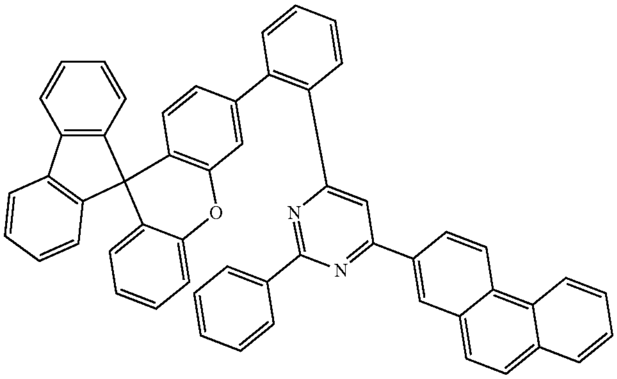
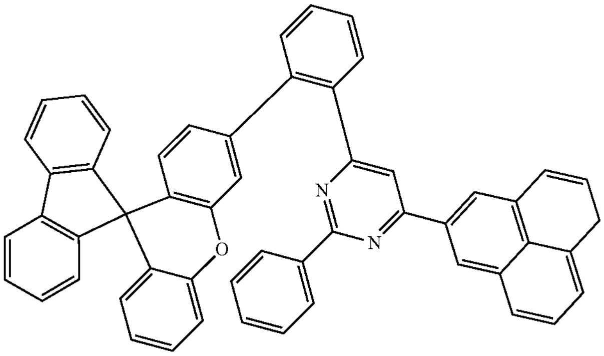
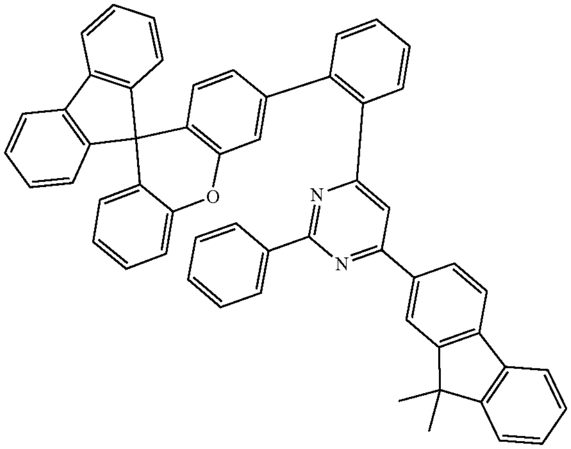

-continued
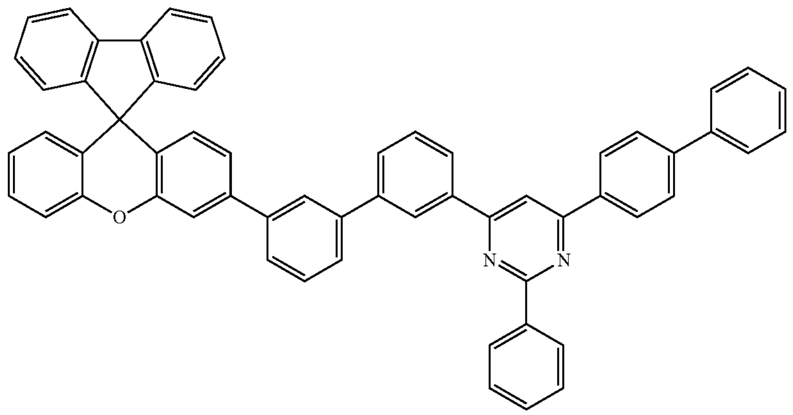
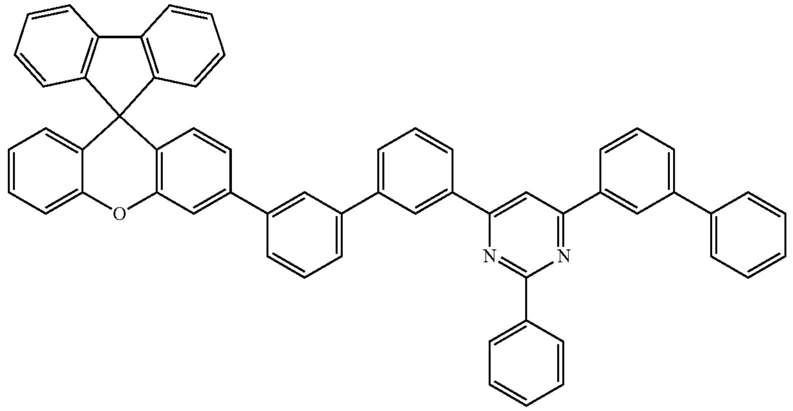
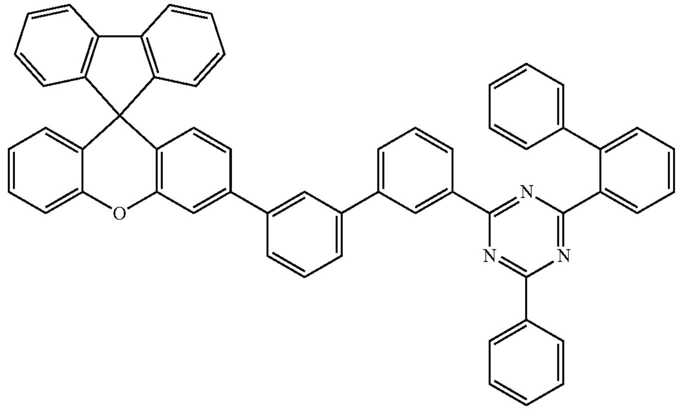 [SMILES: c1ccc(-c2nc(-c3cccc(-c4cccc(-c5ccc6c(c5)Oc5ccccc5C65c6ccccc6-c6ccccc65)c4)c3)nc(-c3ccccc3-c3ccccc3)n2)cc1]

-continued
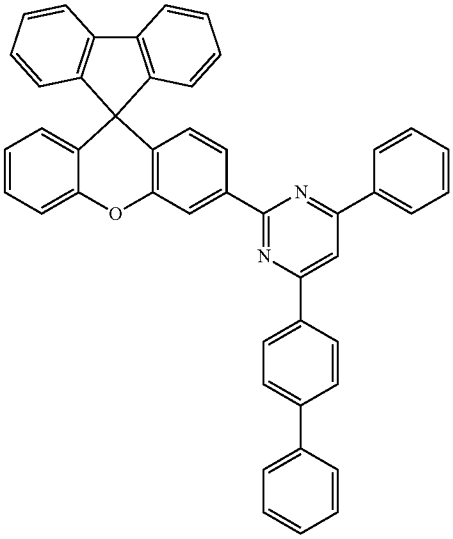
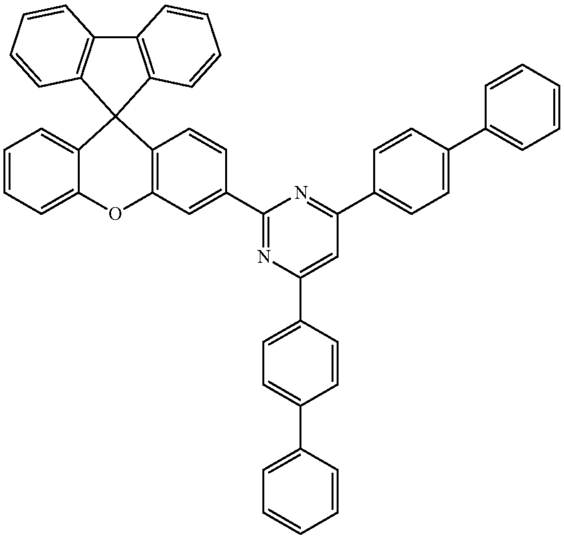
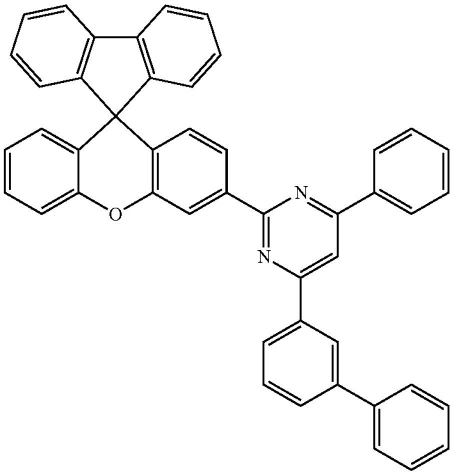
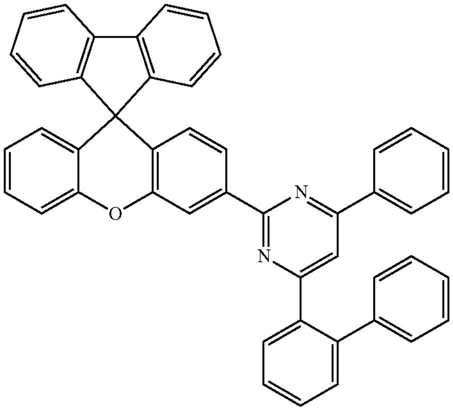
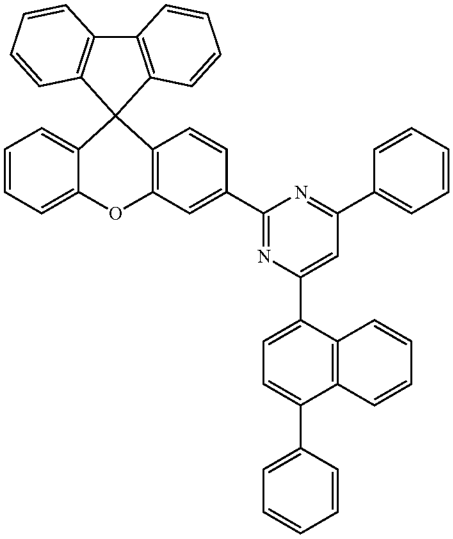
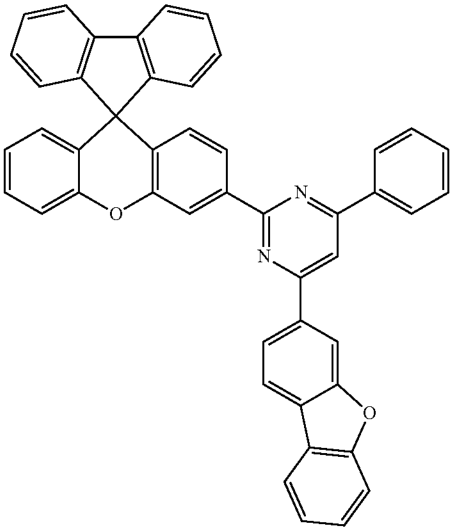

-continued
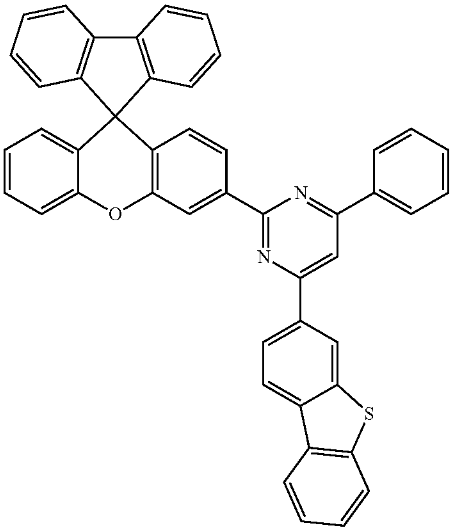
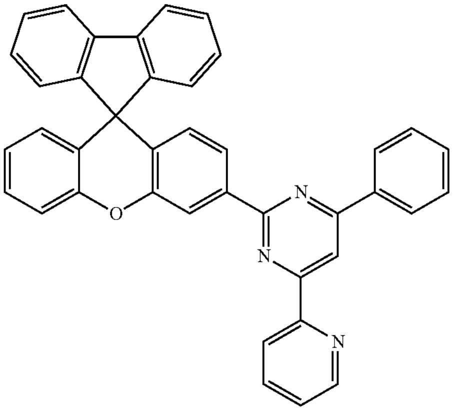
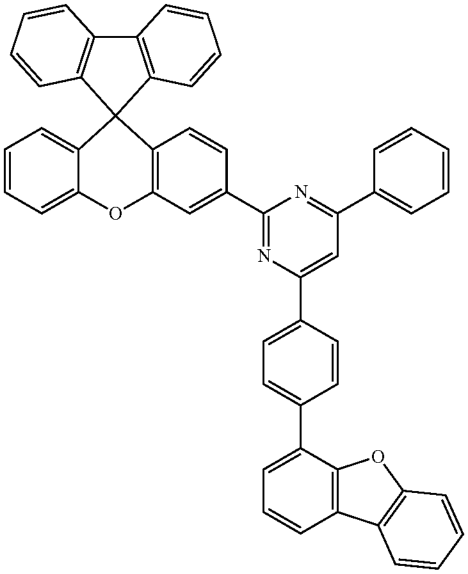
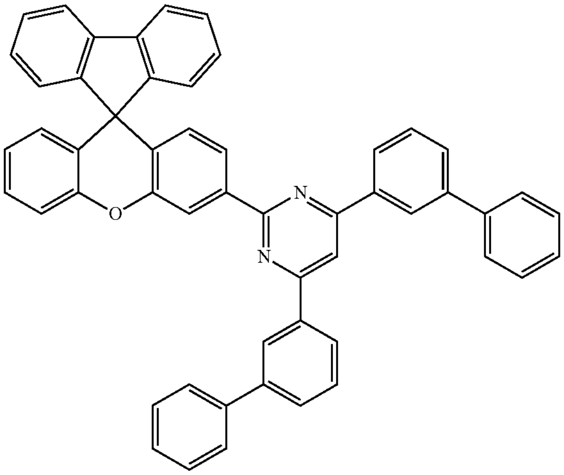
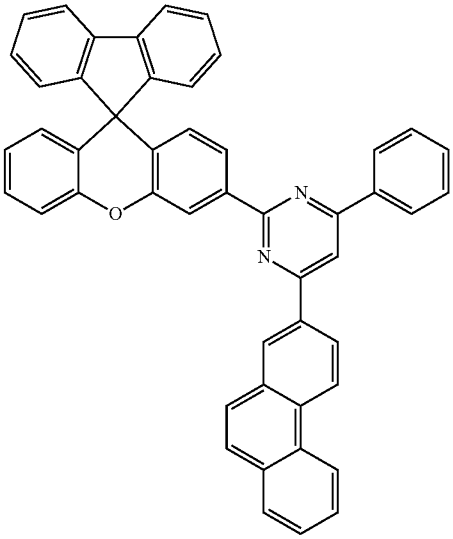
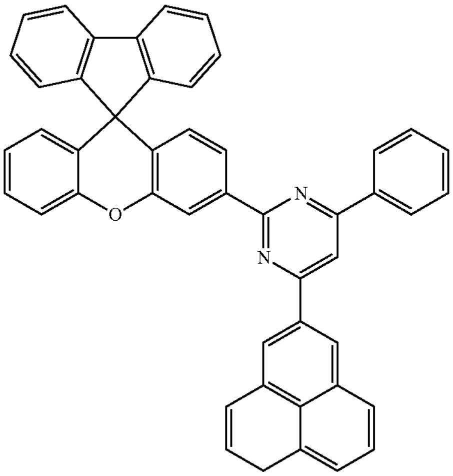

-continued
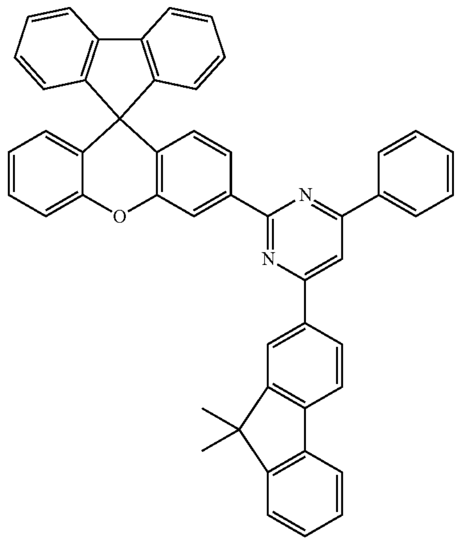
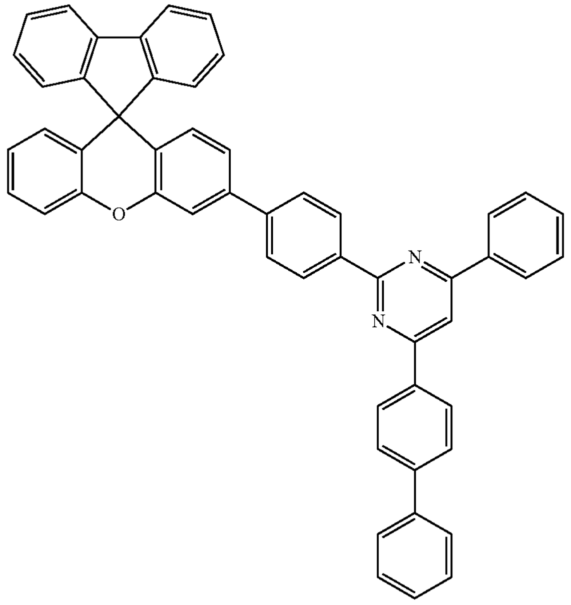
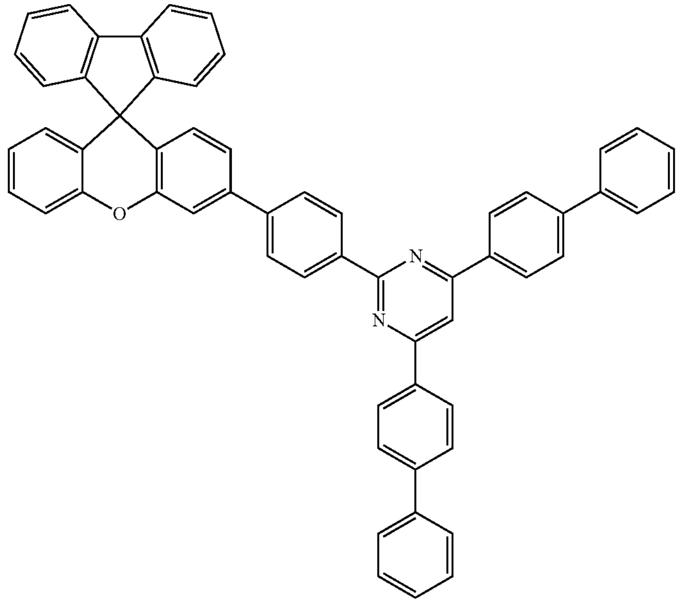

-continued
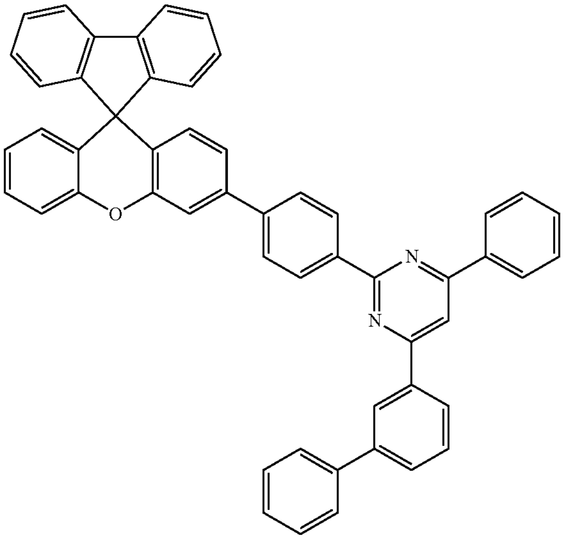
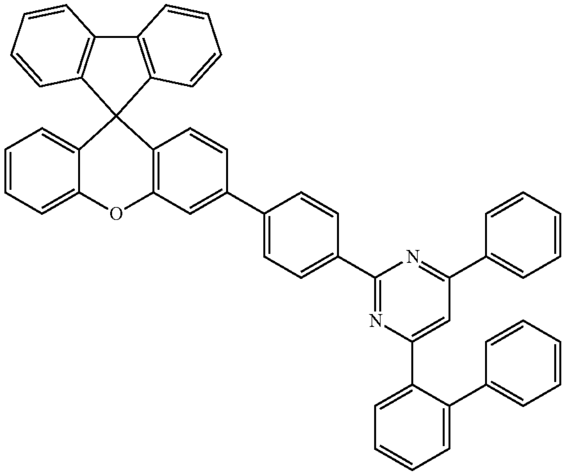
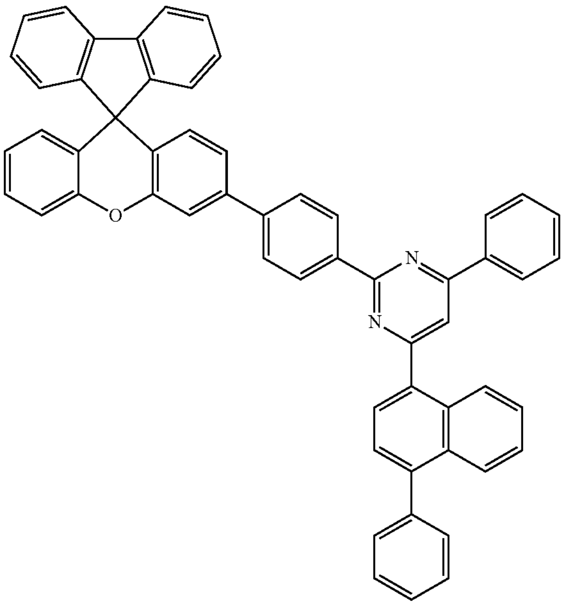
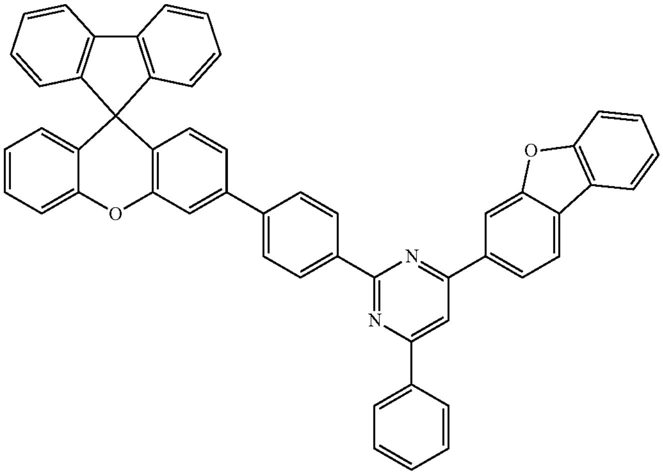

-continued
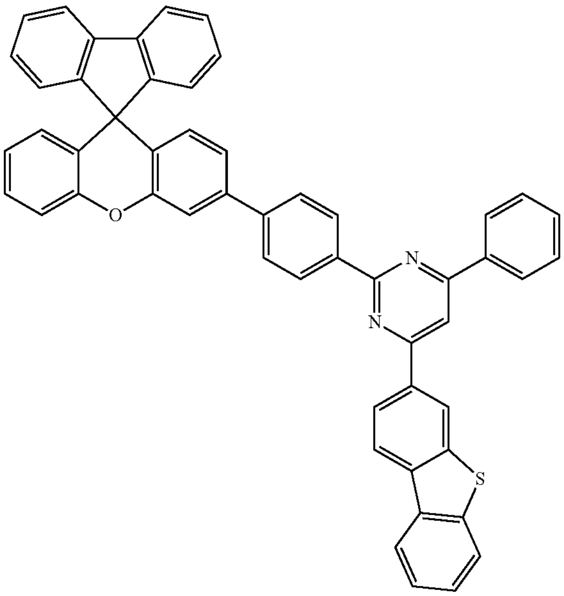
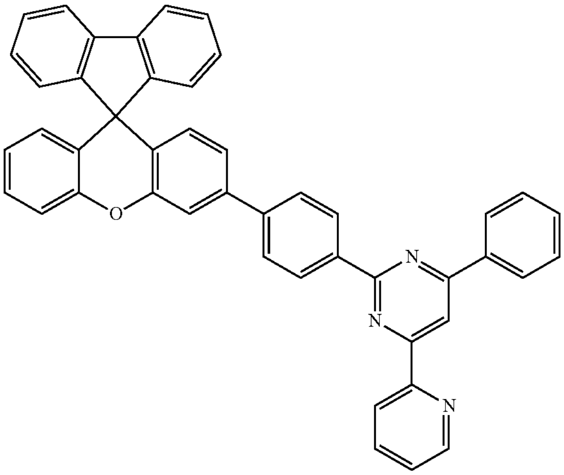
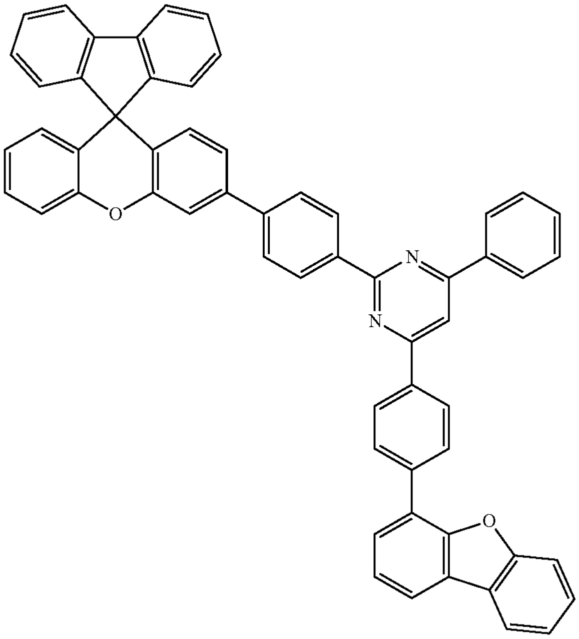

-continued
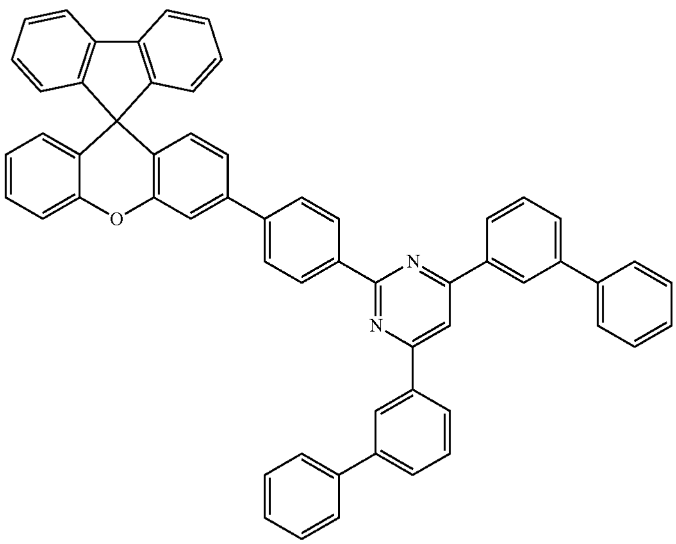
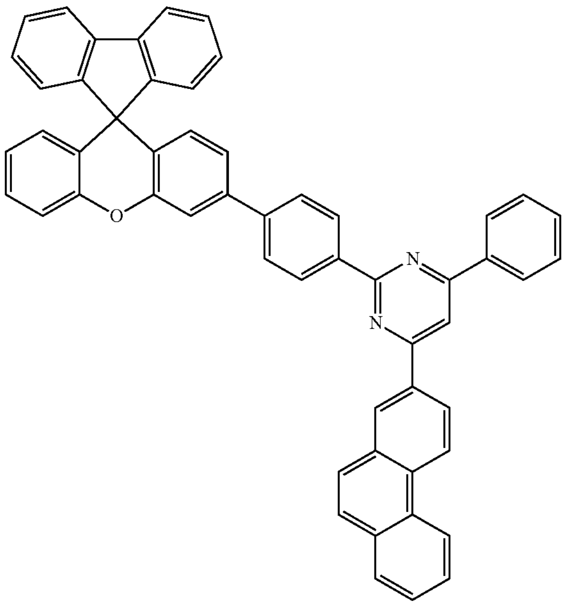
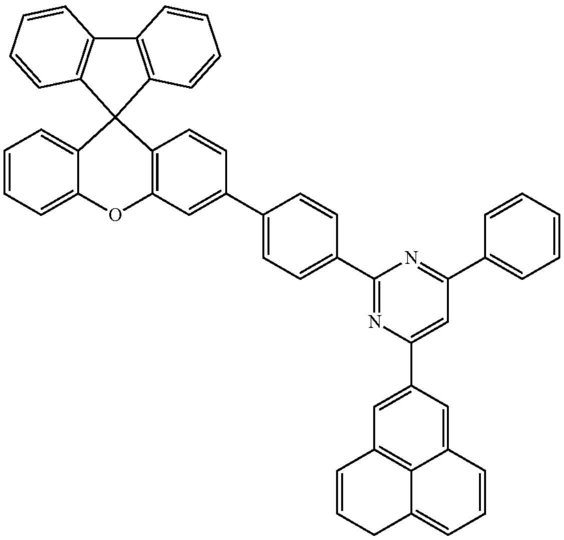

-continued
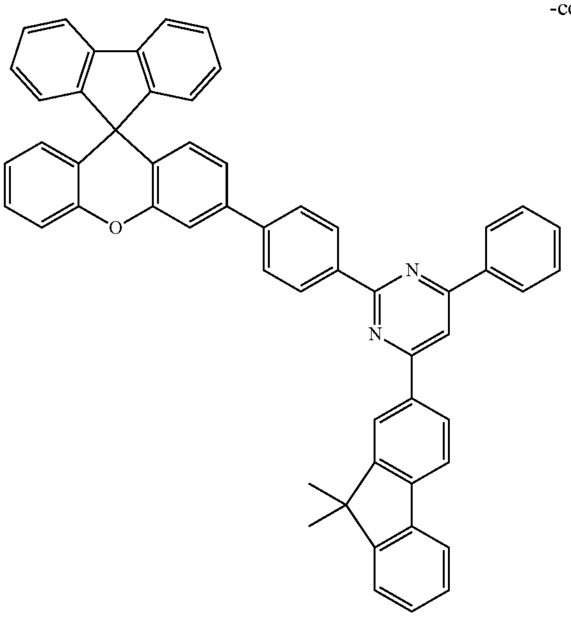
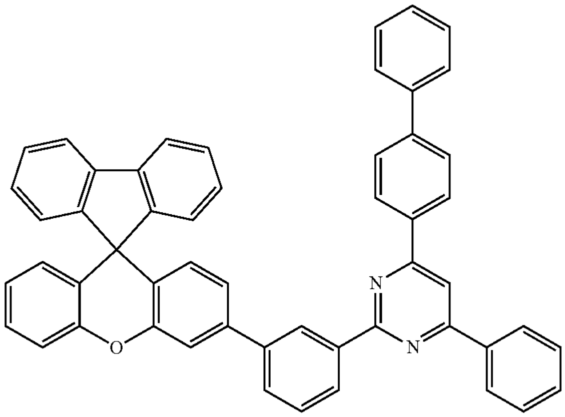
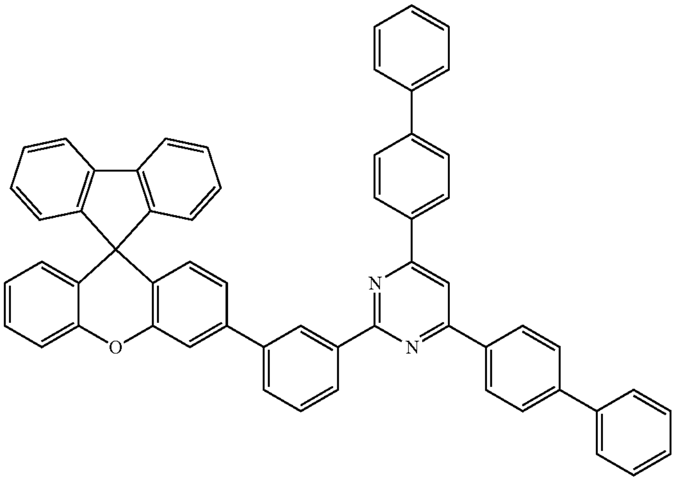
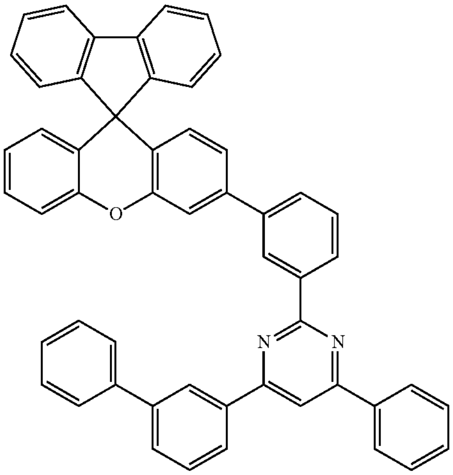
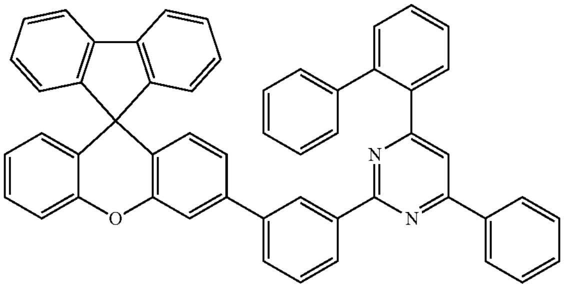
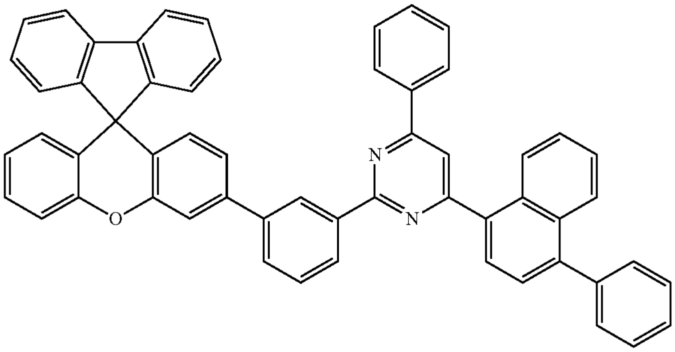

-continued
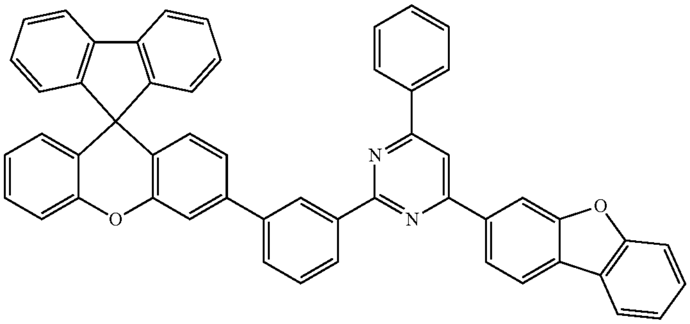
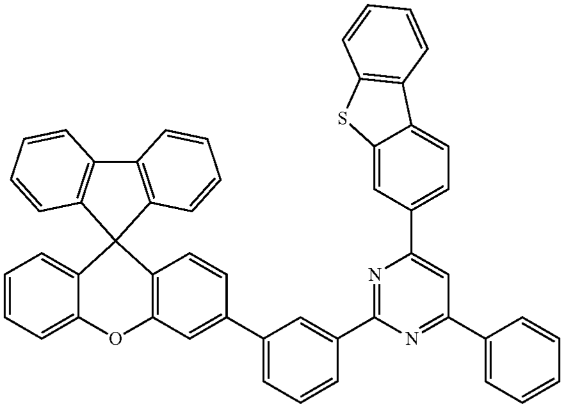
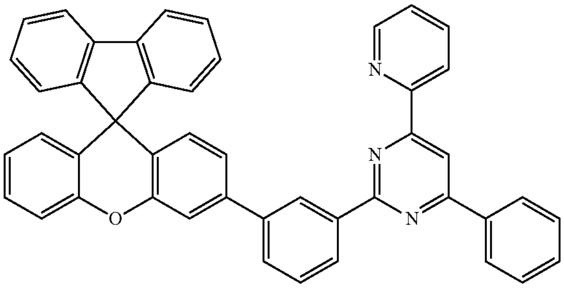
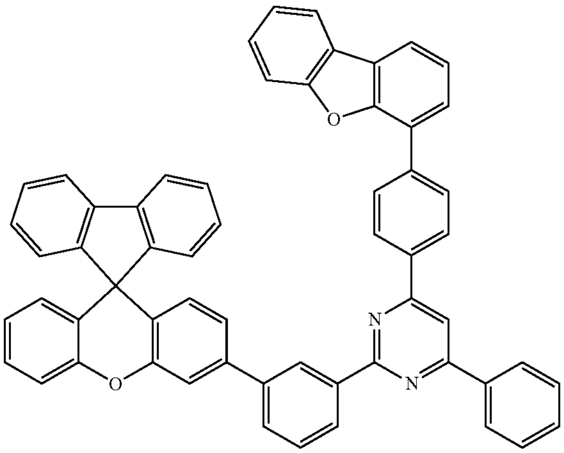
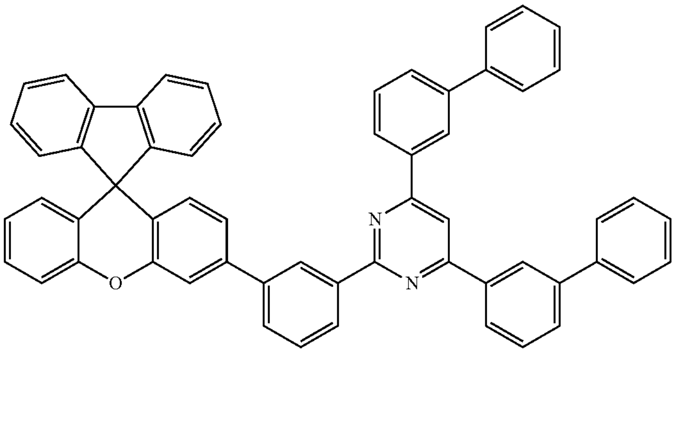

-continued
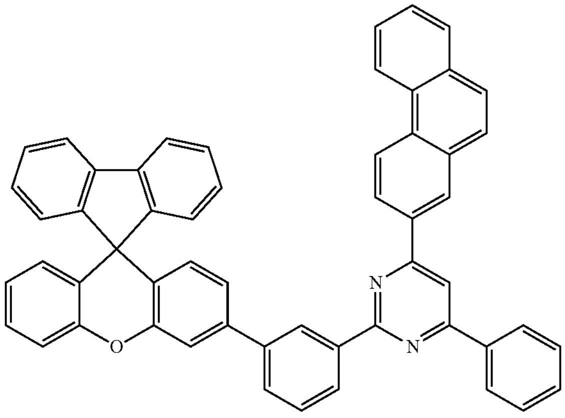
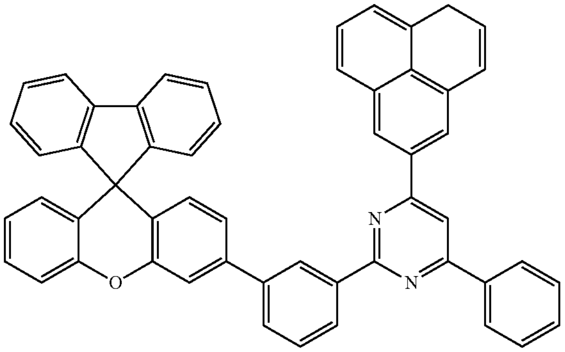
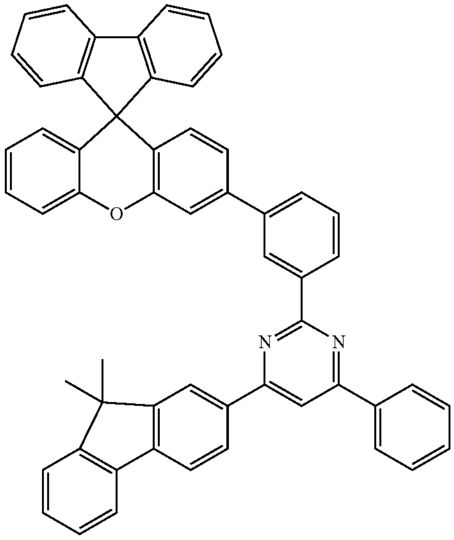
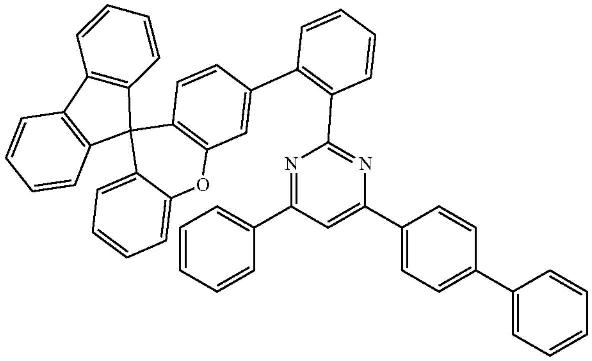
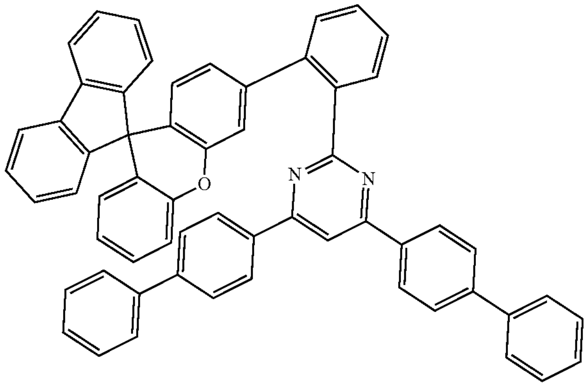
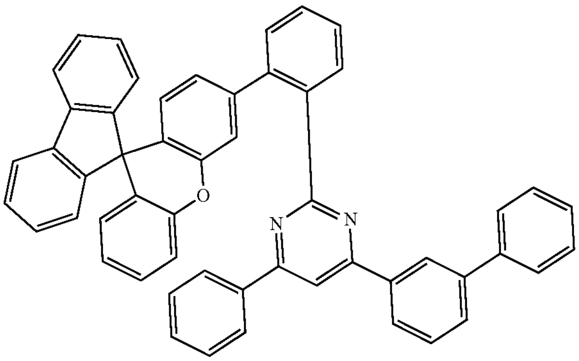
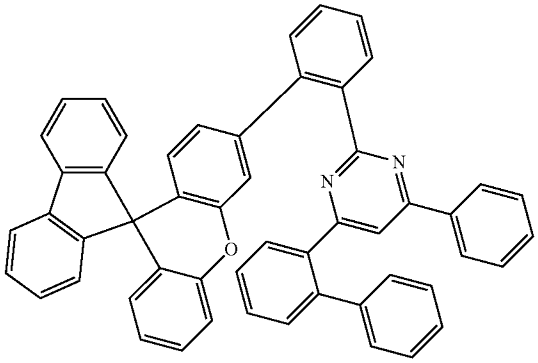
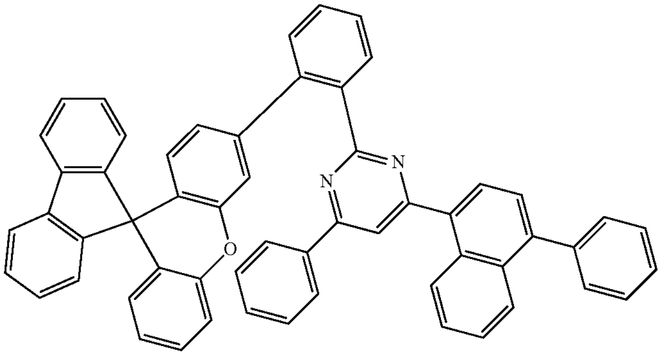

-continued
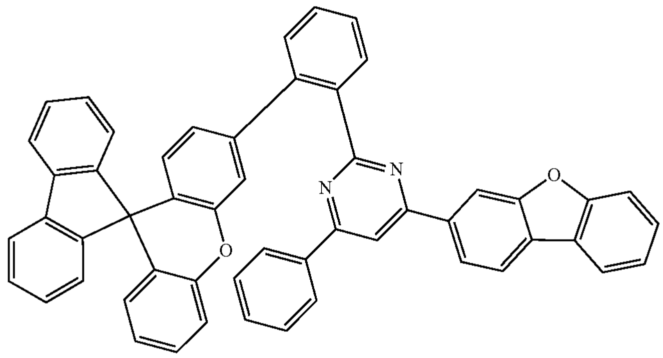
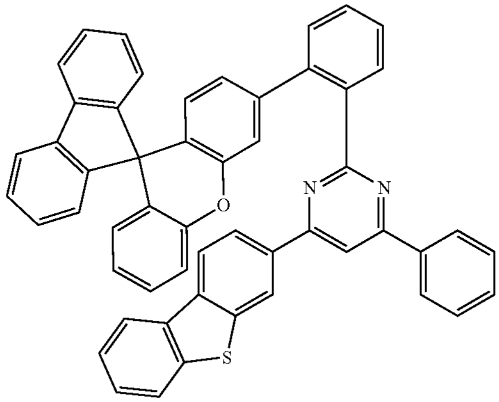
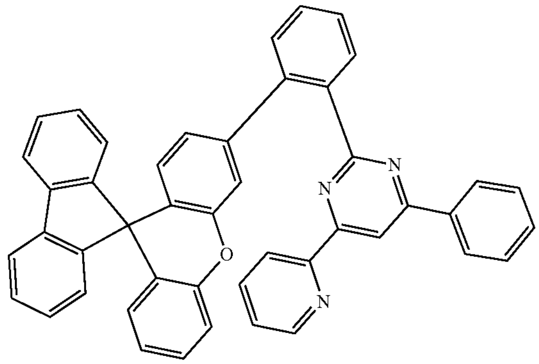
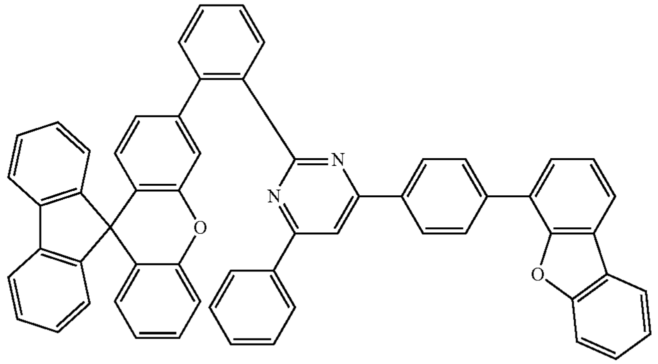
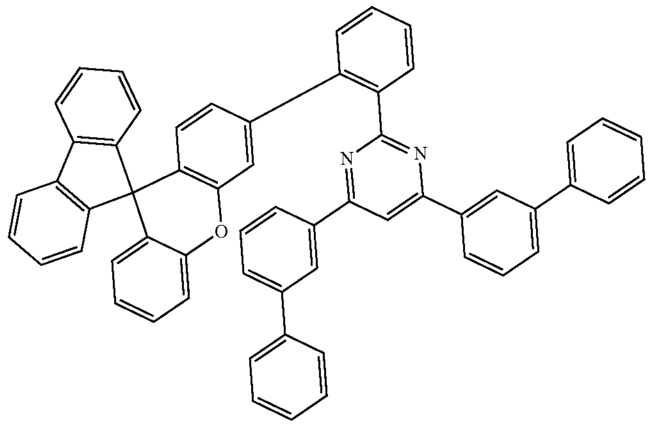
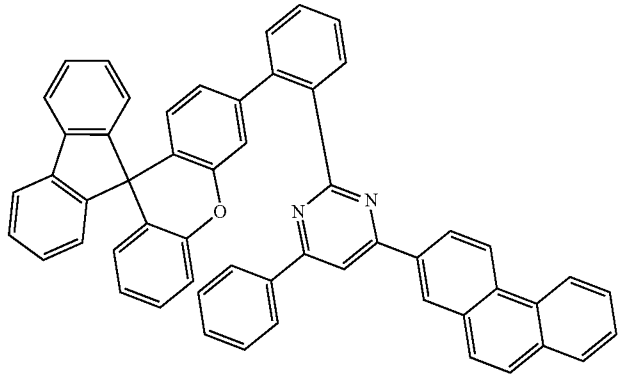

-continued
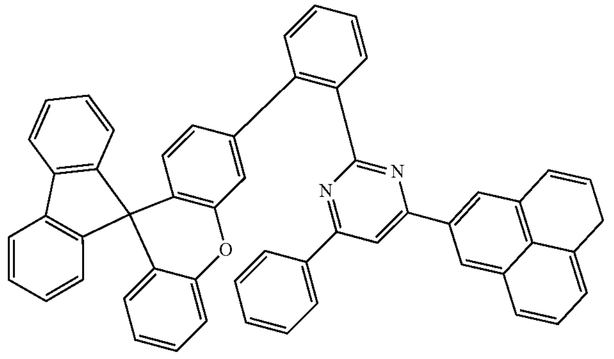
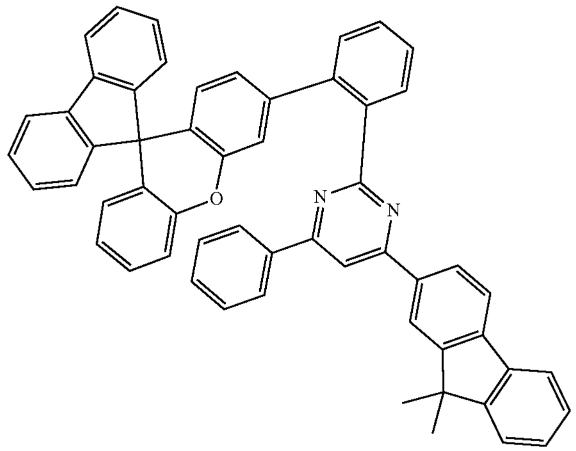
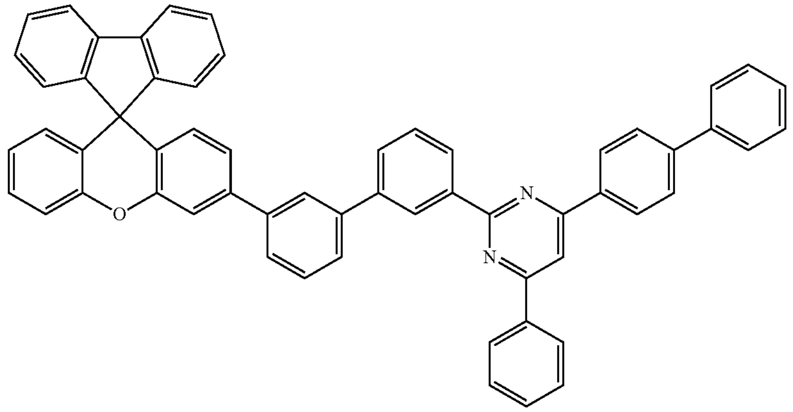
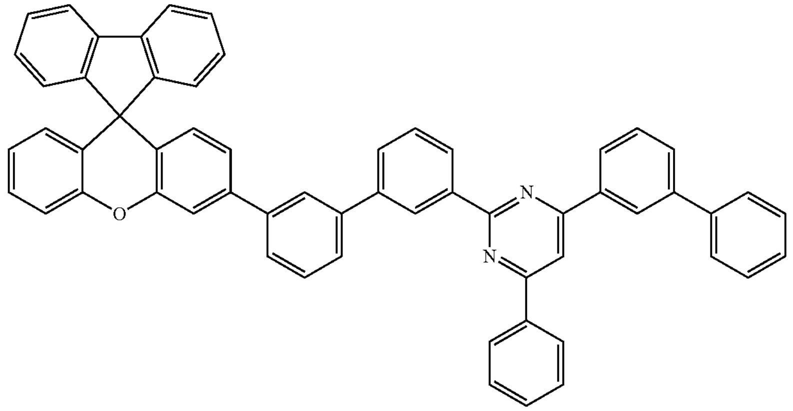 [SMILES: c1ccc(-c2cccc(-c3cc(-c4ccccc4)nc(-c4cccc(-c5cccc(-c6ccc7c(c6)Oc6ccccc6C76c7ccccc7-c7ccccc76)c5)c4)n3)c2)cc1]
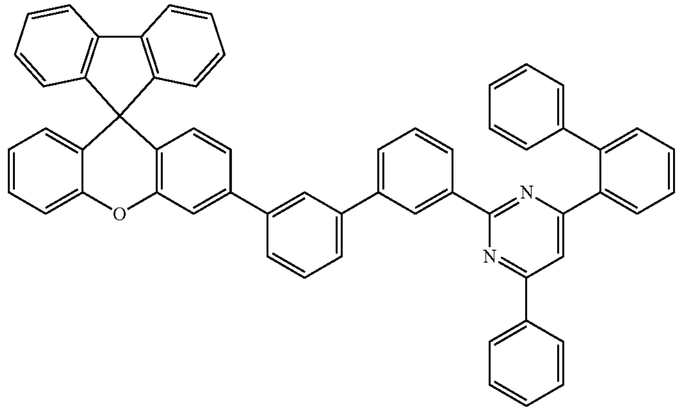
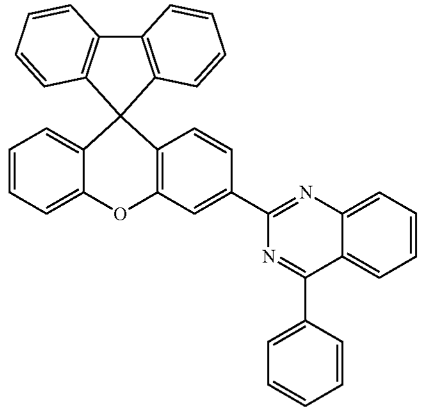

-continued
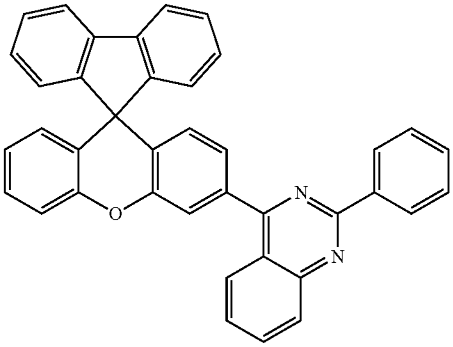
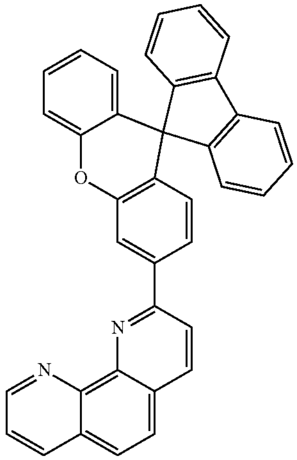
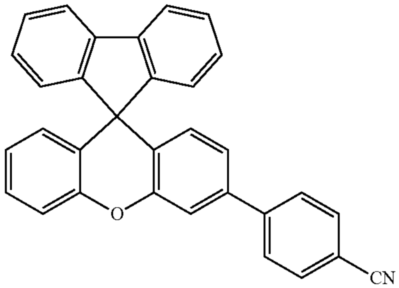
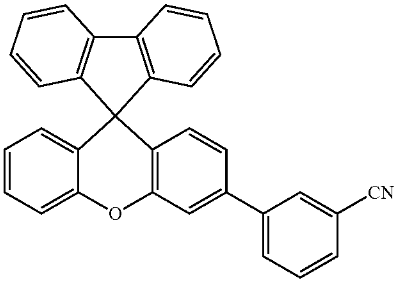
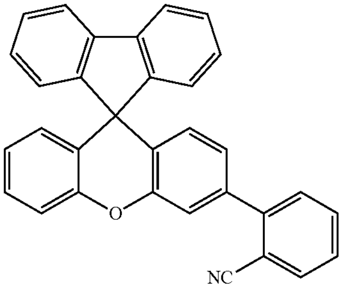
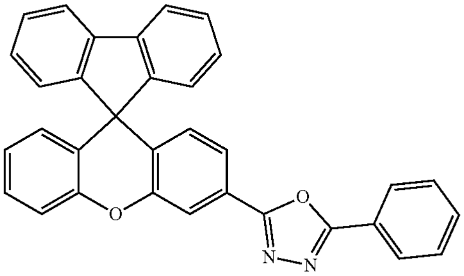
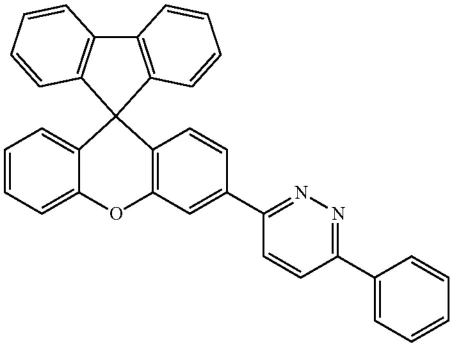
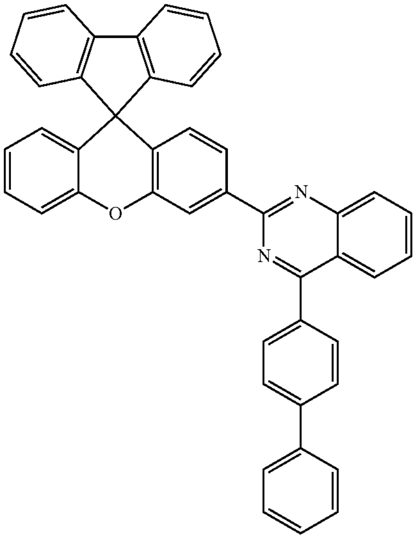
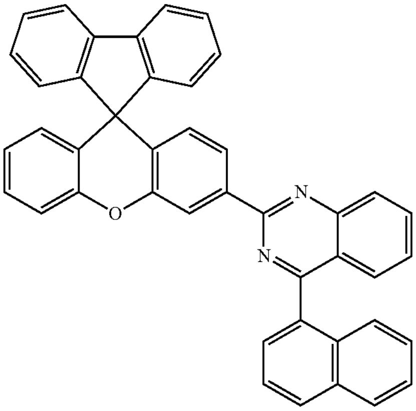

-continued
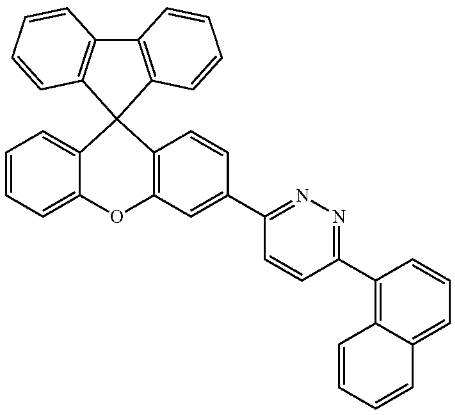
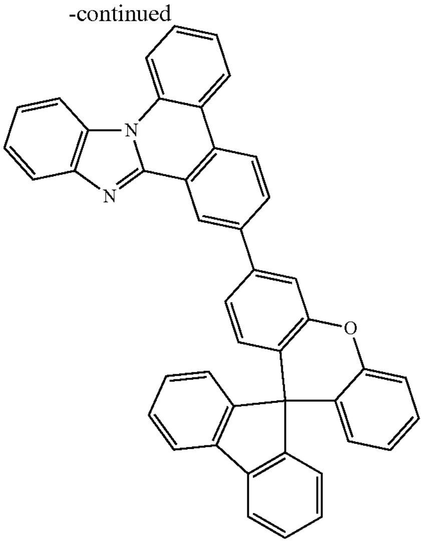
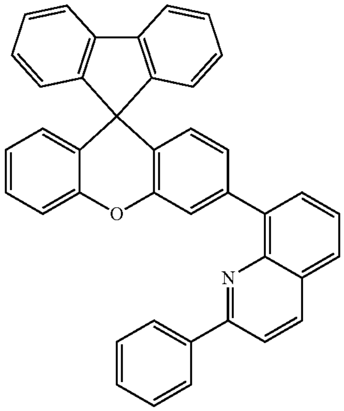
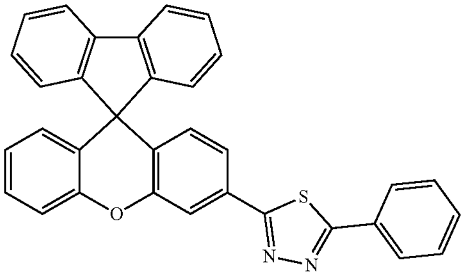
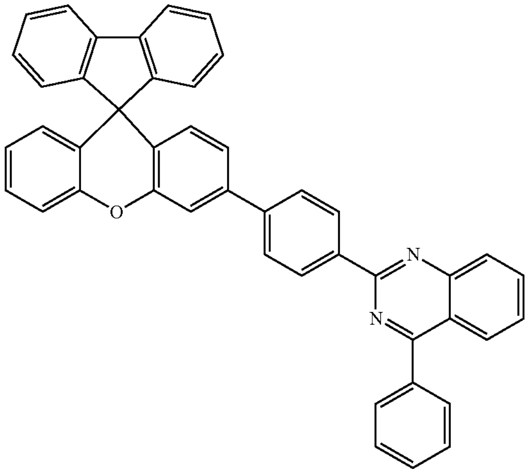
-continued
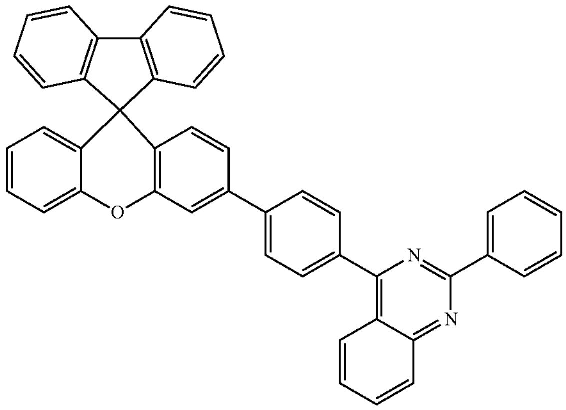

-continued
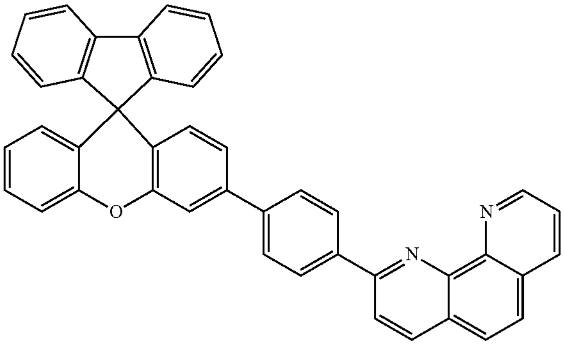
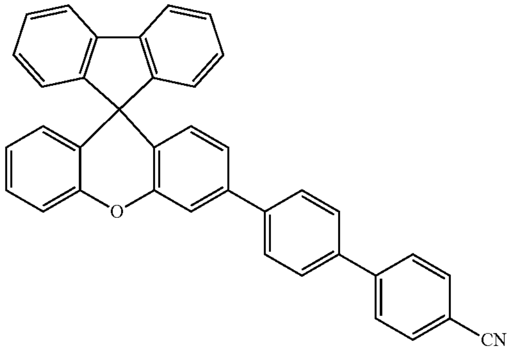
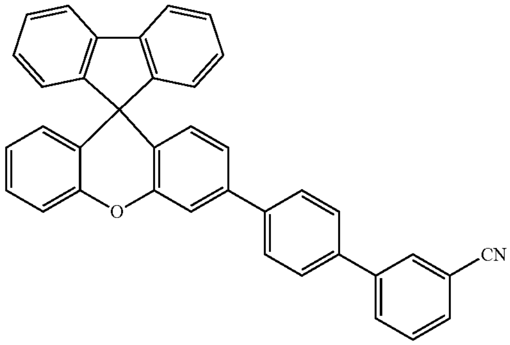
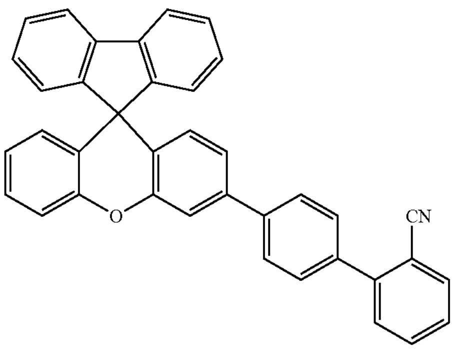
-continued
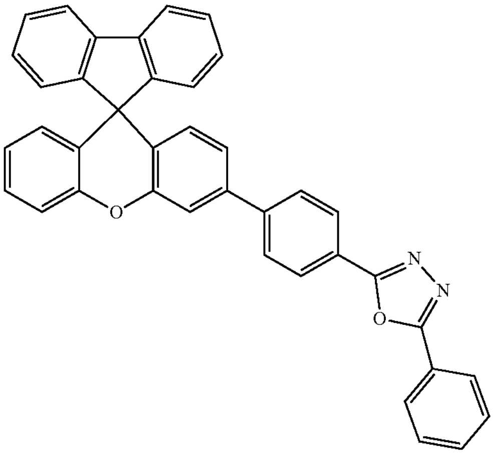
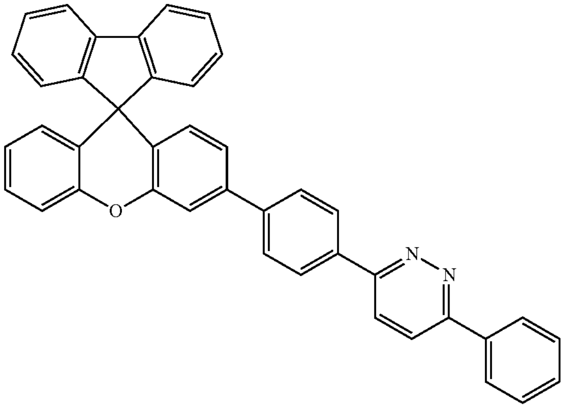
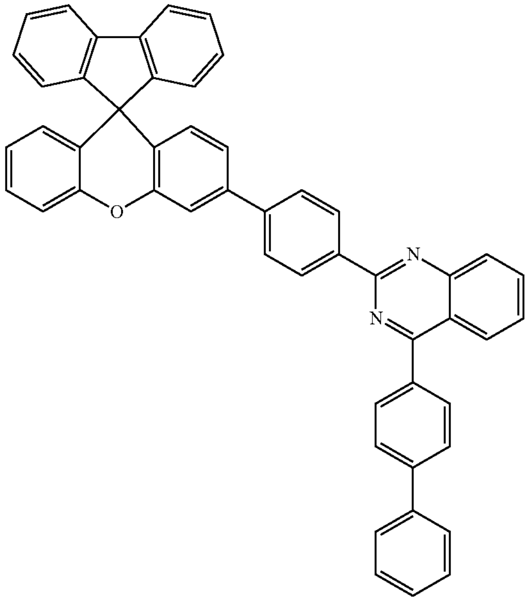

-continued
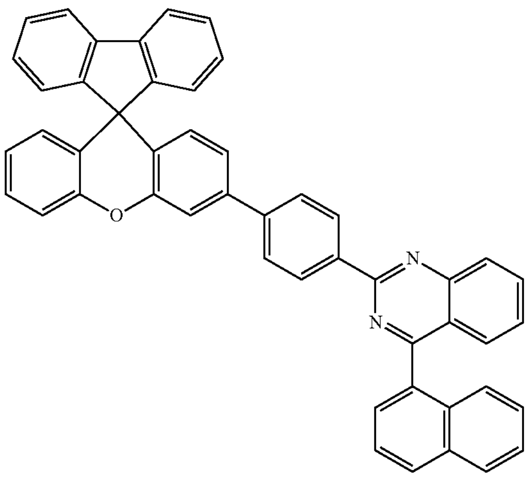
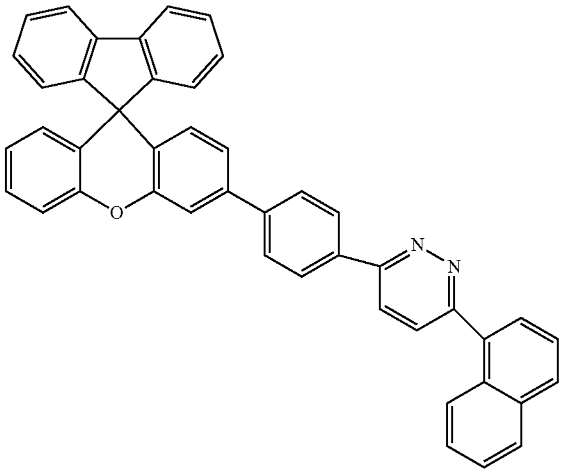
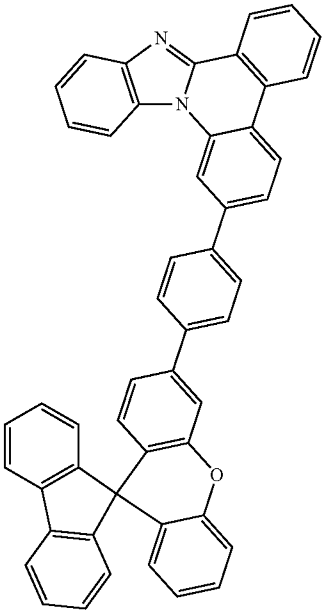
-continued
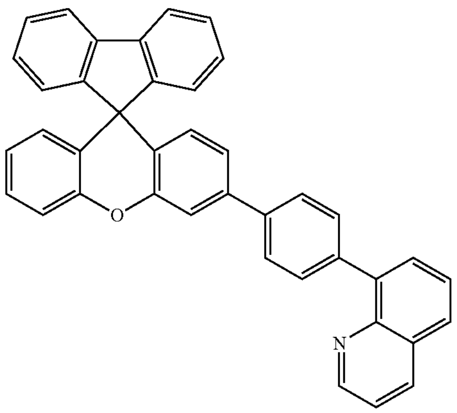
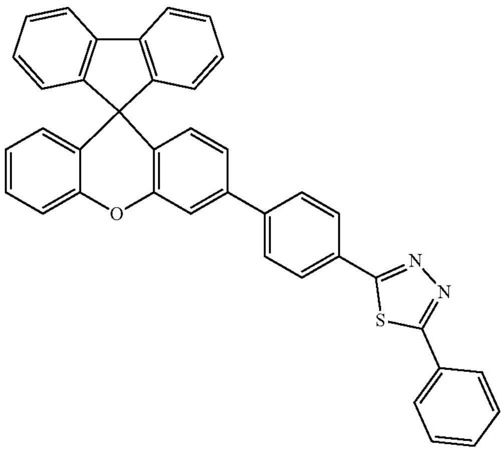
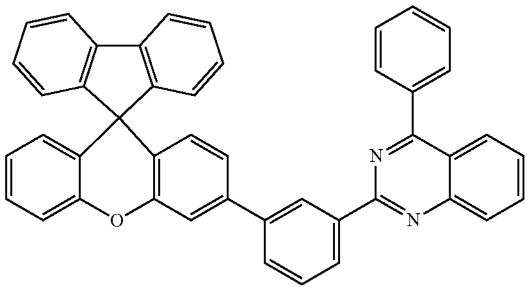
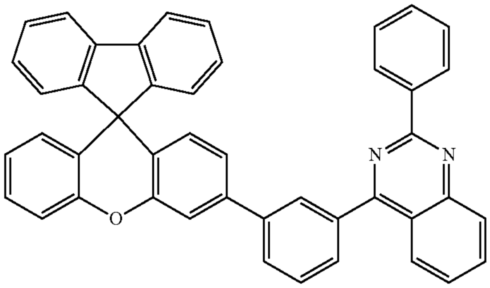

-continued
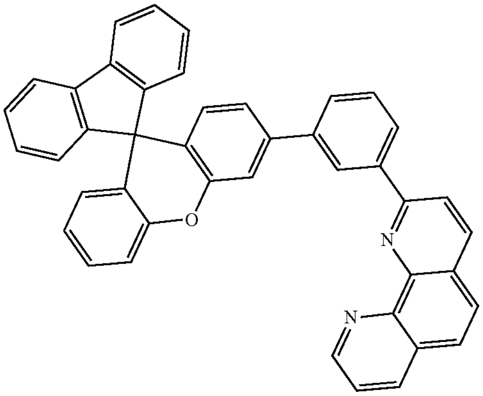
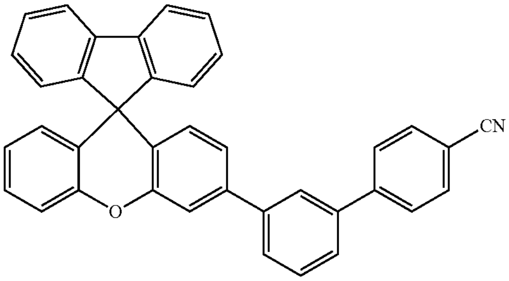
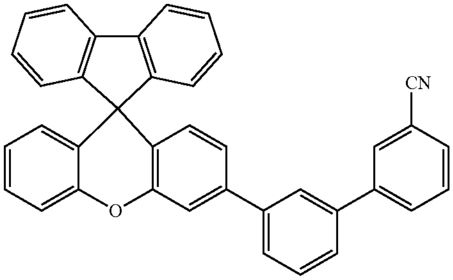
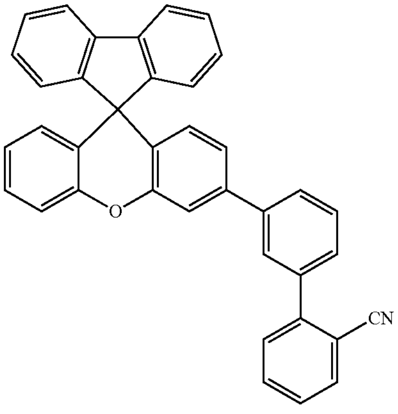
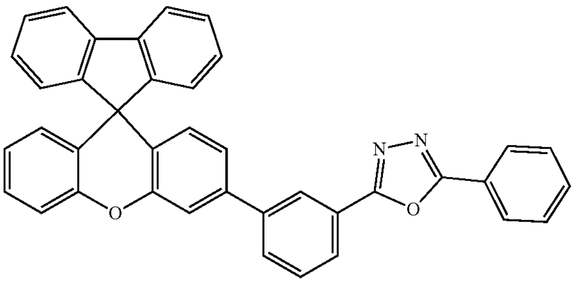
-continued
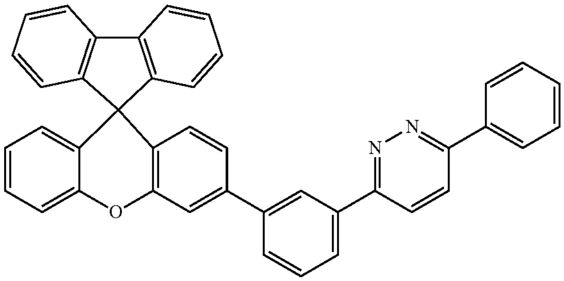
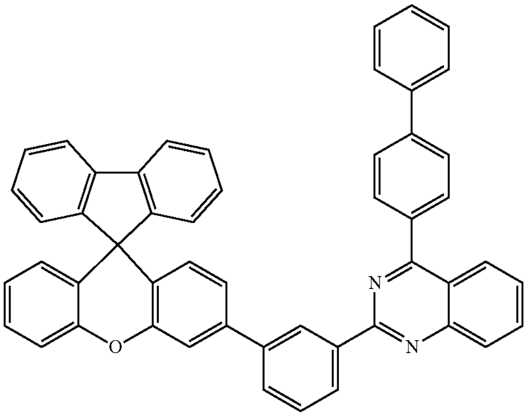
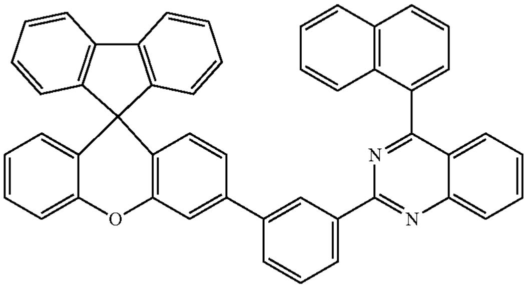
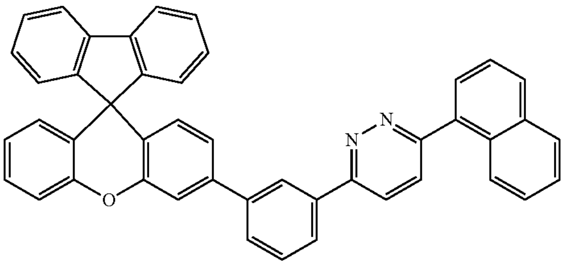
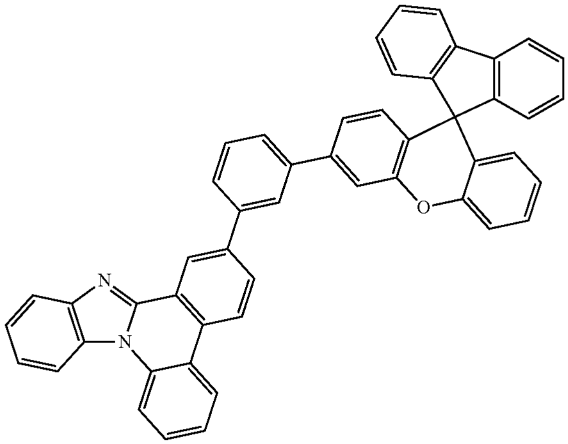

-continued
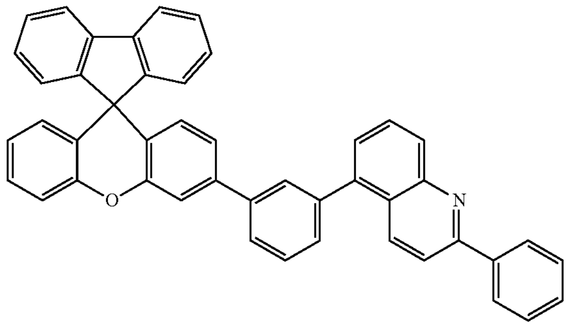
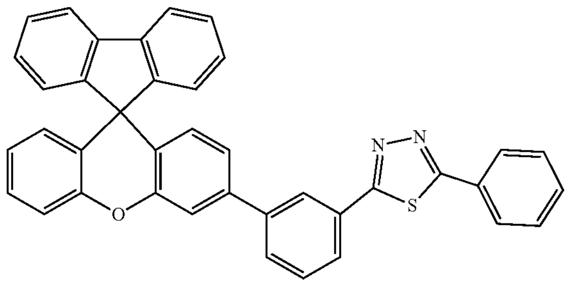
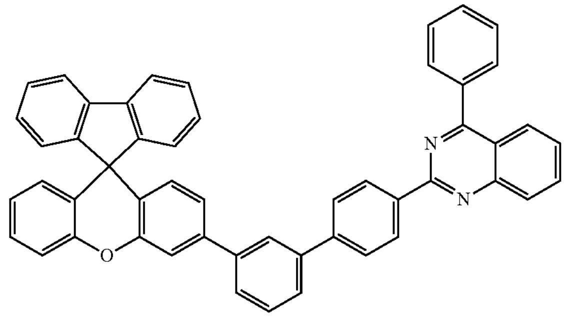
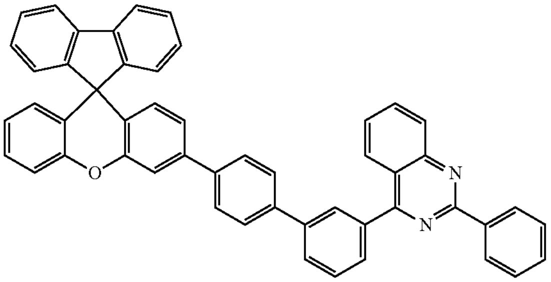
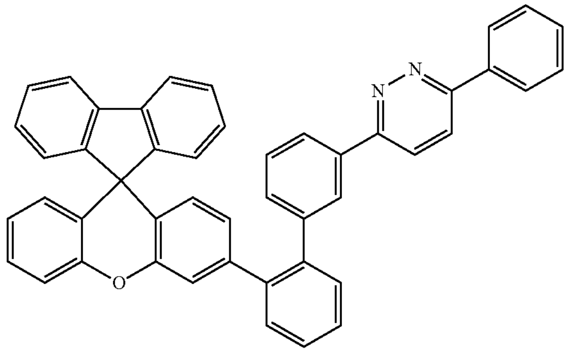
-continued
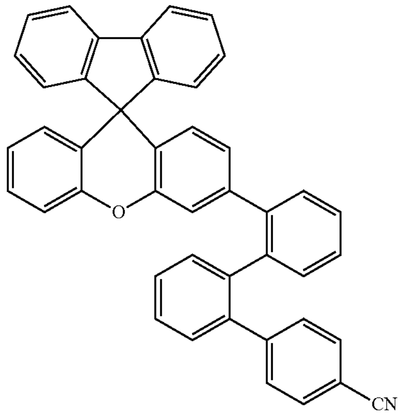
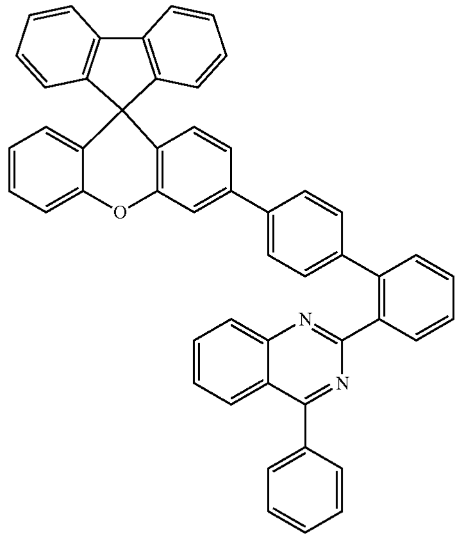
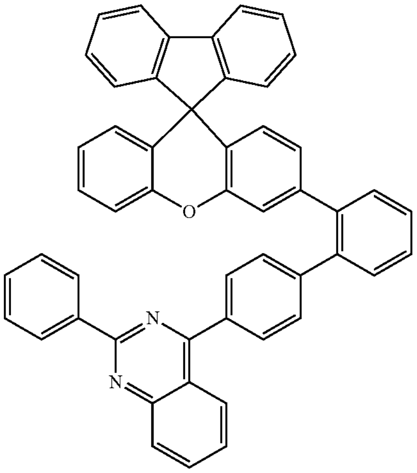
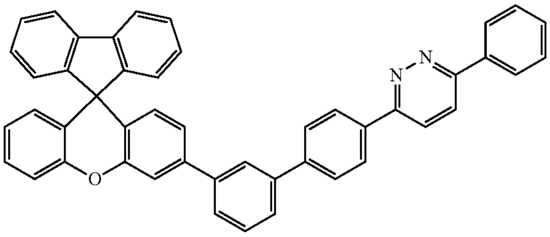

-continued
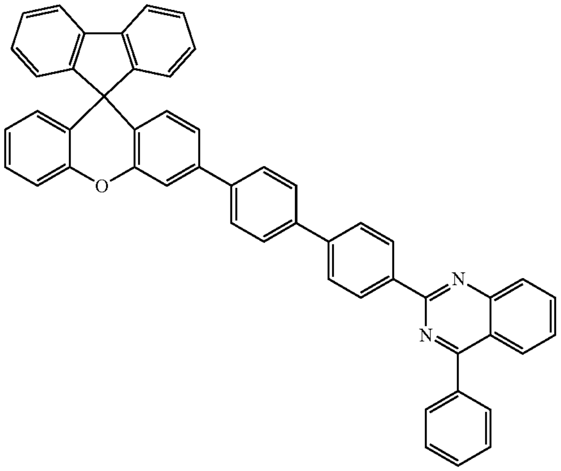
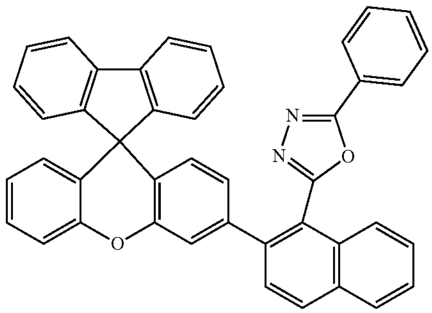
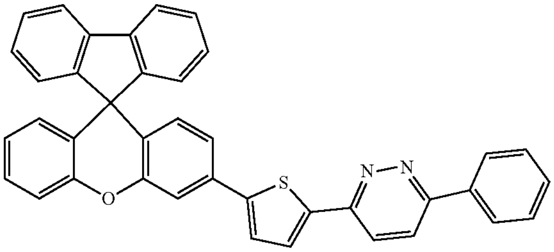
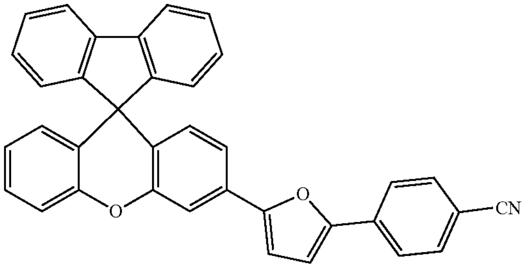
-continued
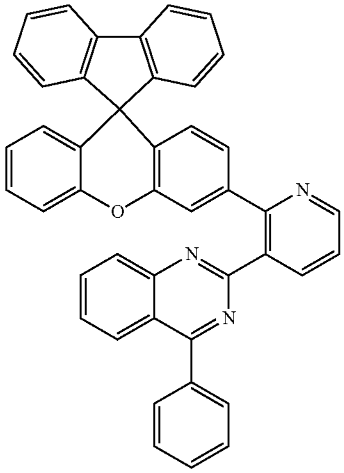
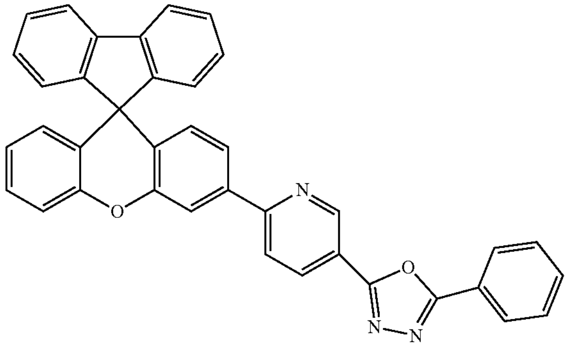
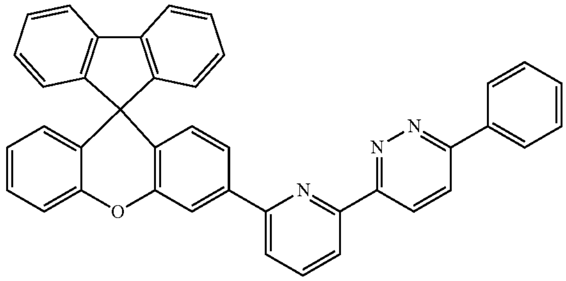
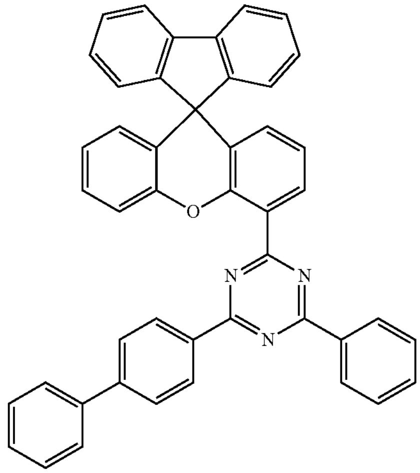

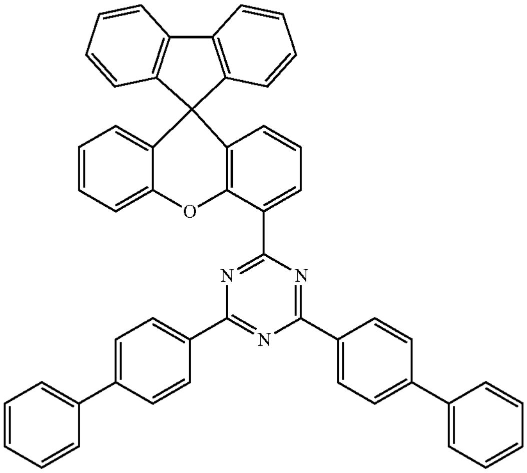
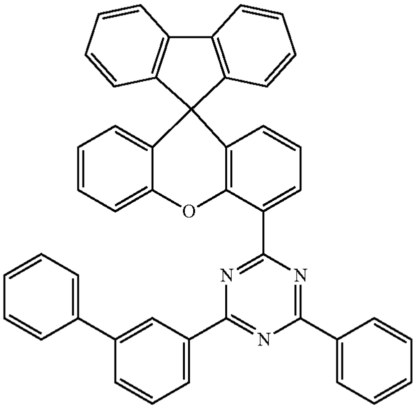
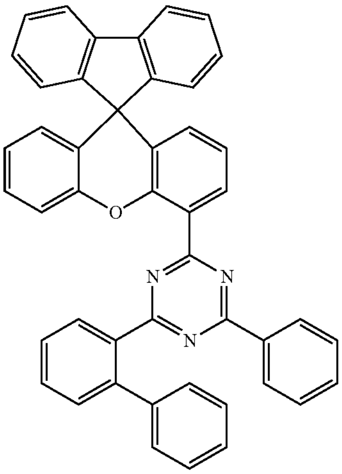
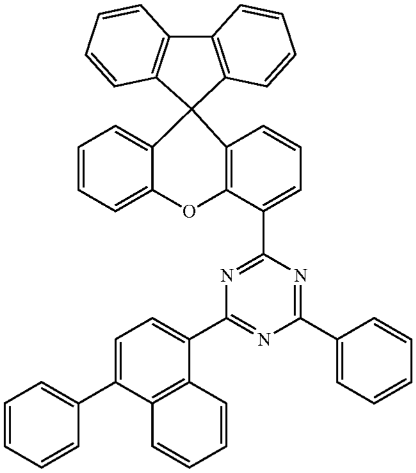
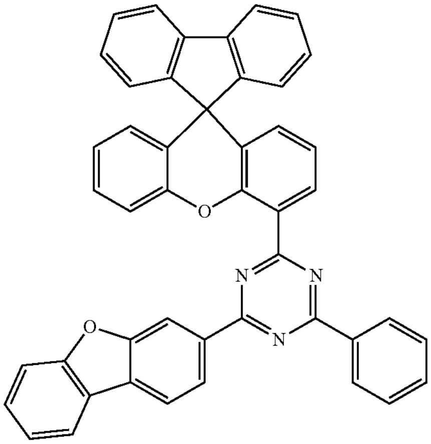
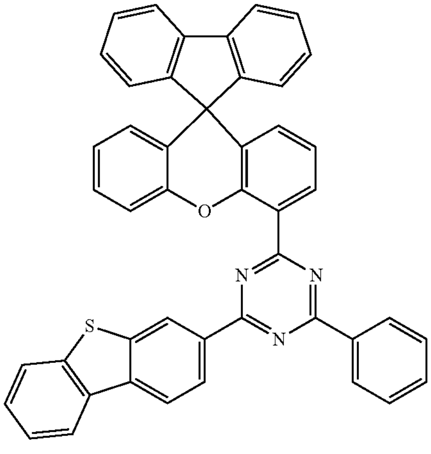

-continued
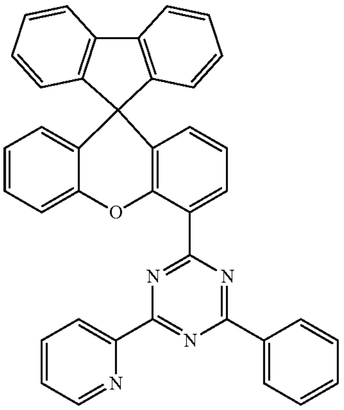
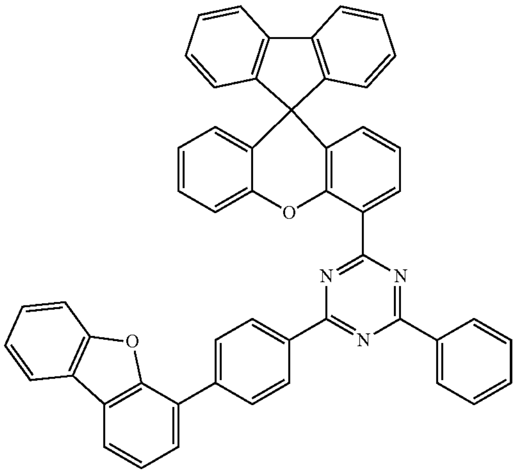
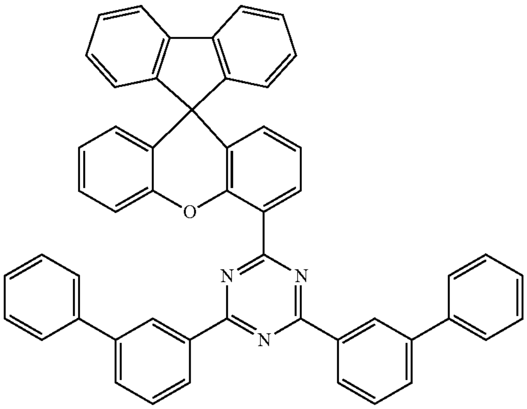
-continued
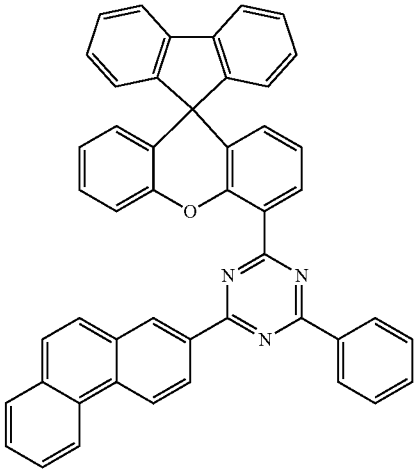
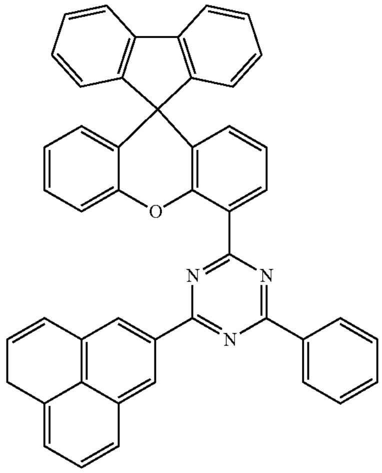
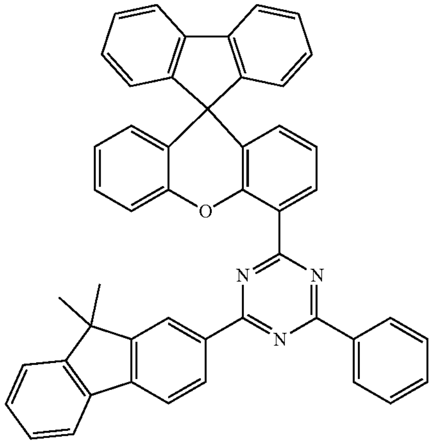

-continued
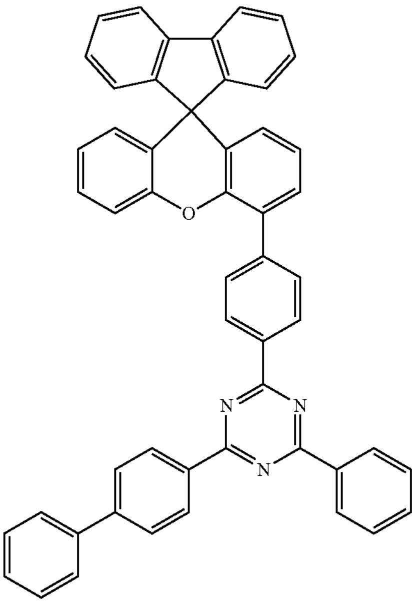
-continued
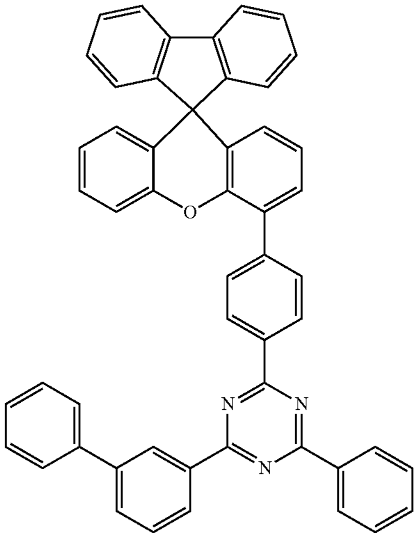
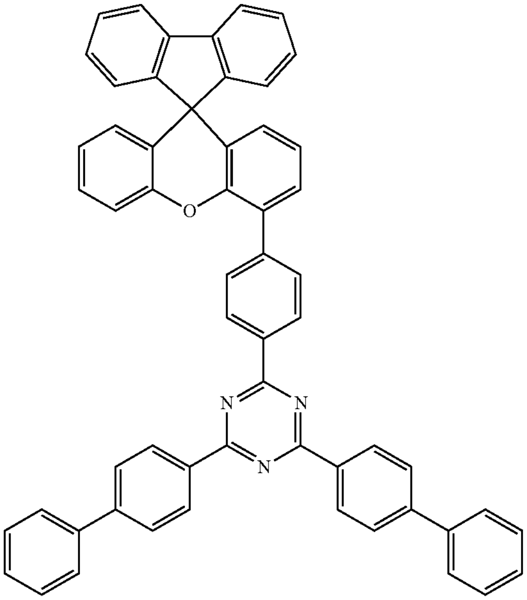
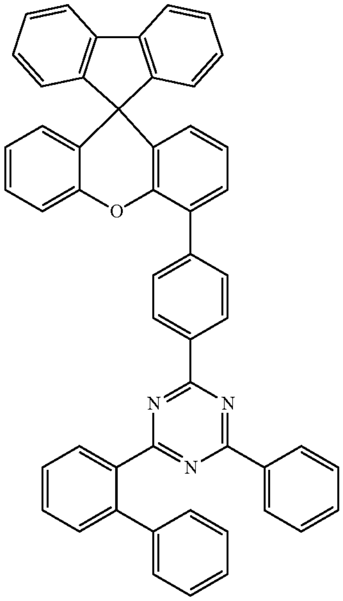

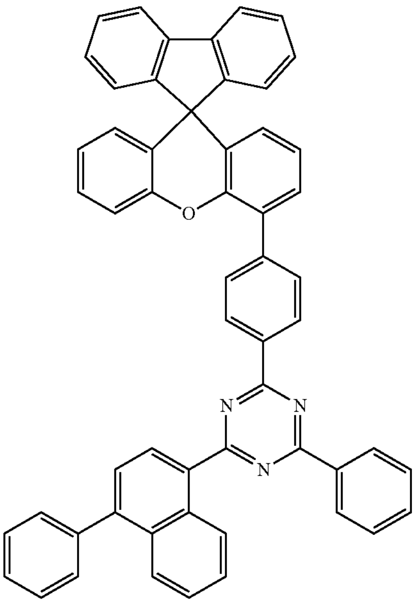
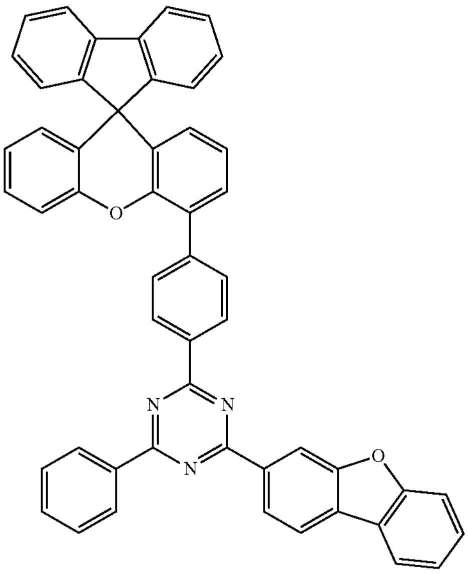
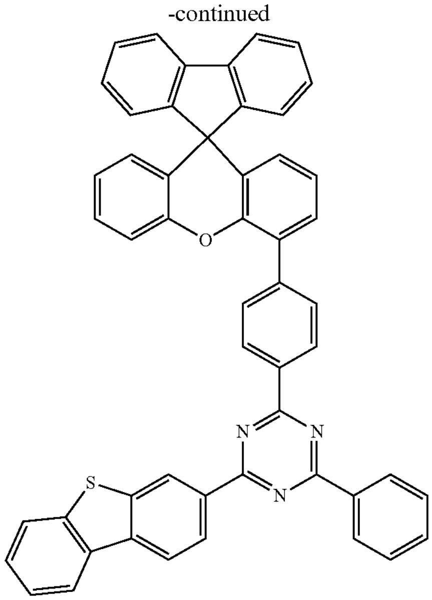
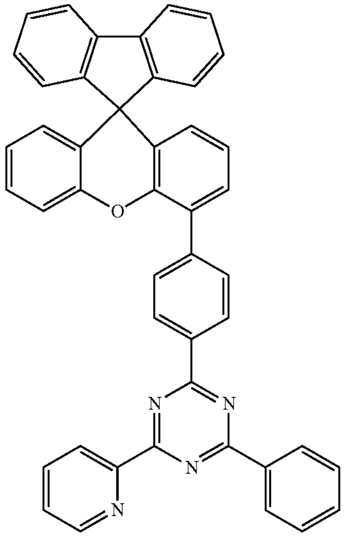
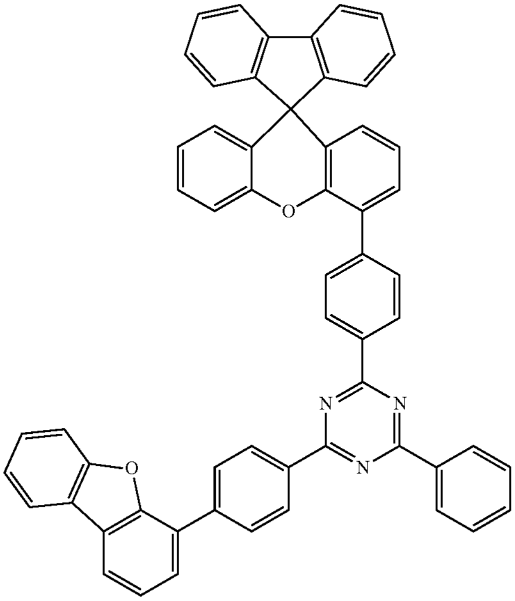

-continued
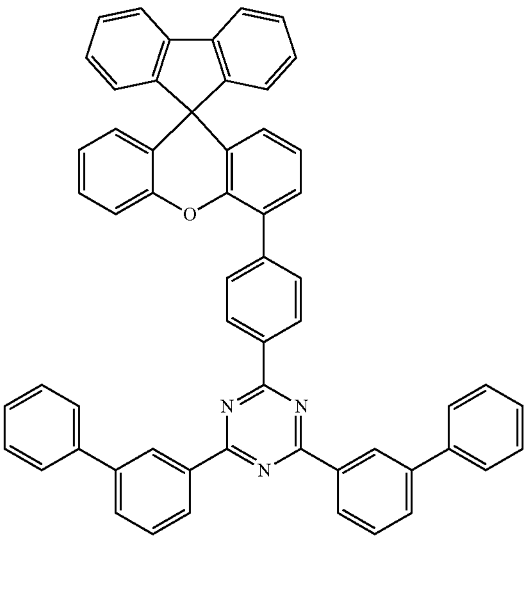
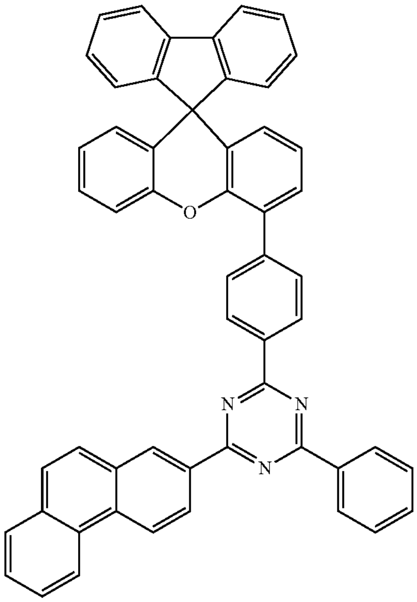
-continued
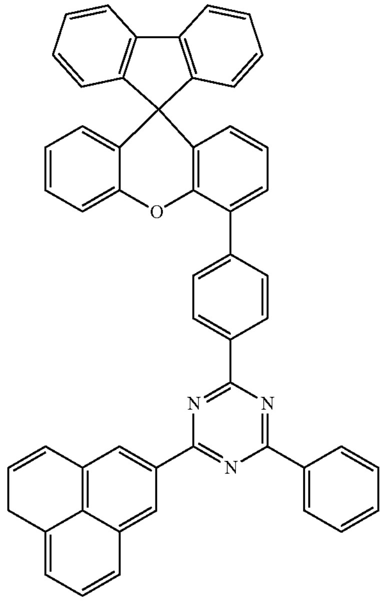
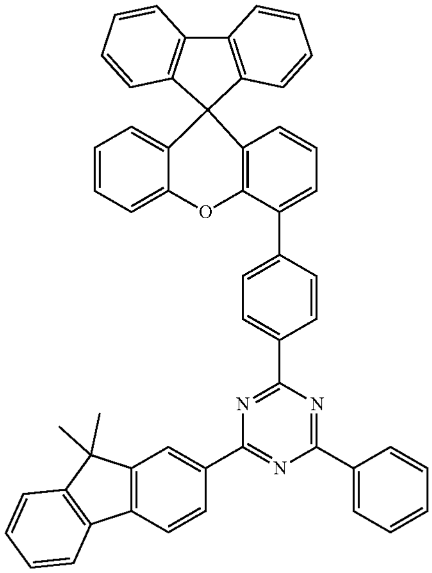
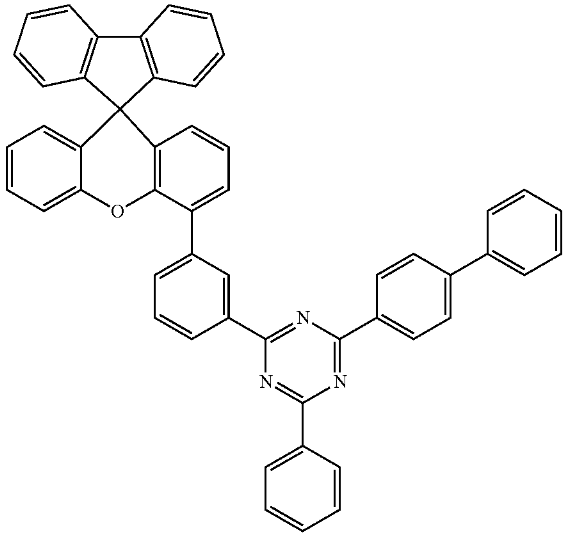

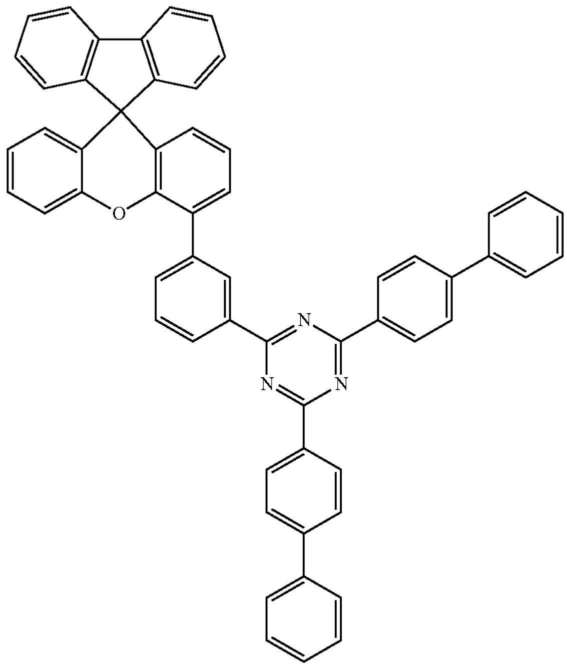
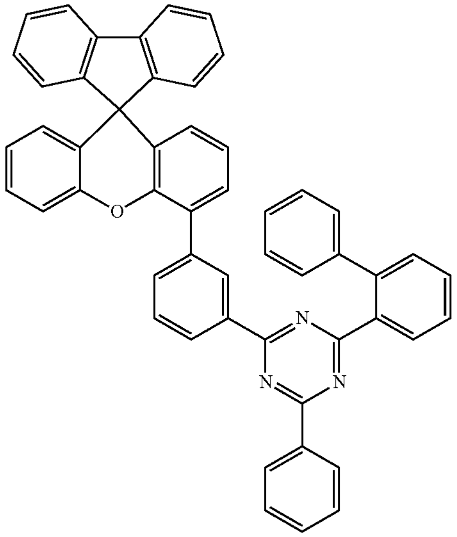
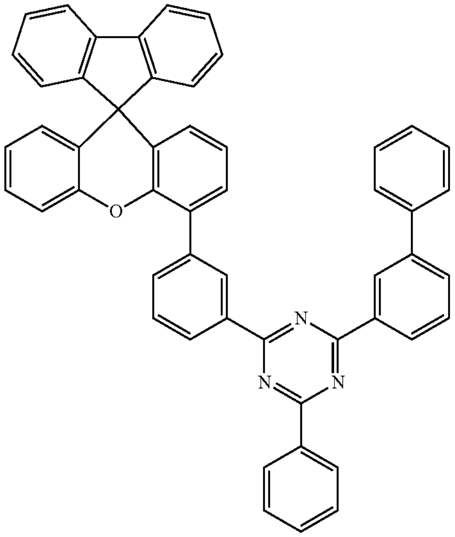
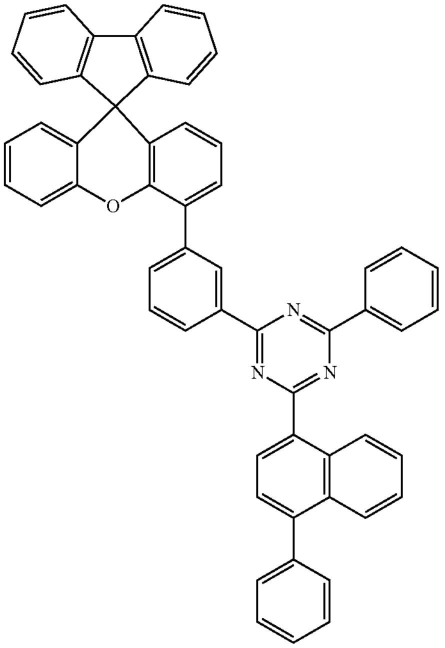

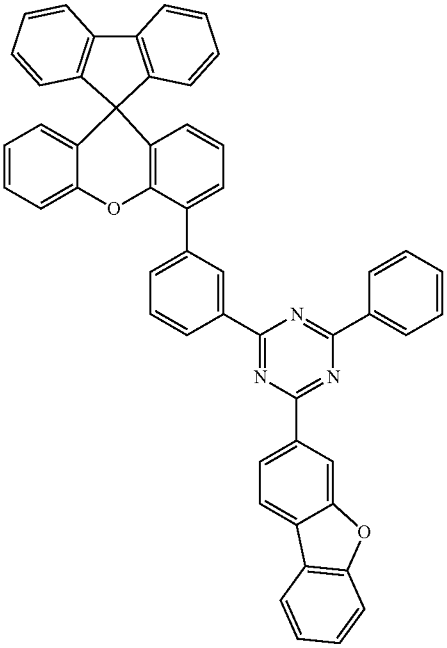
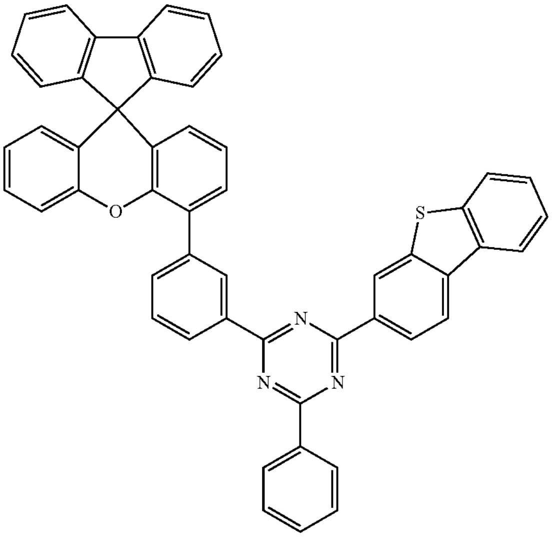
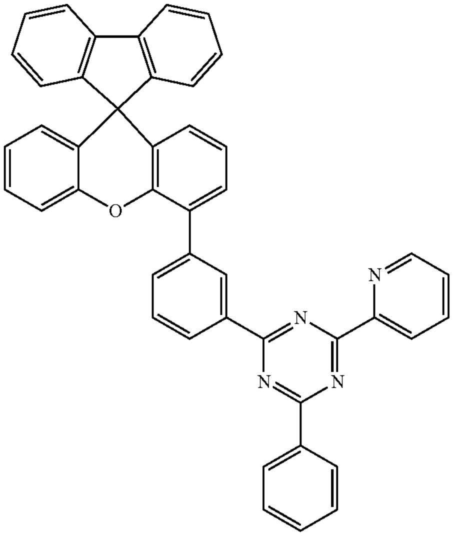
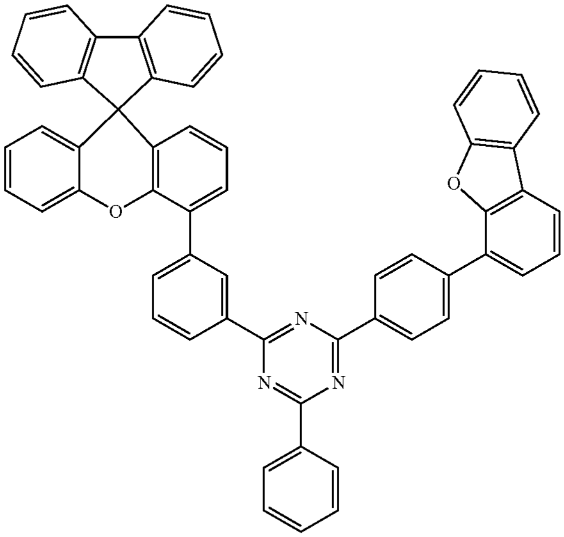
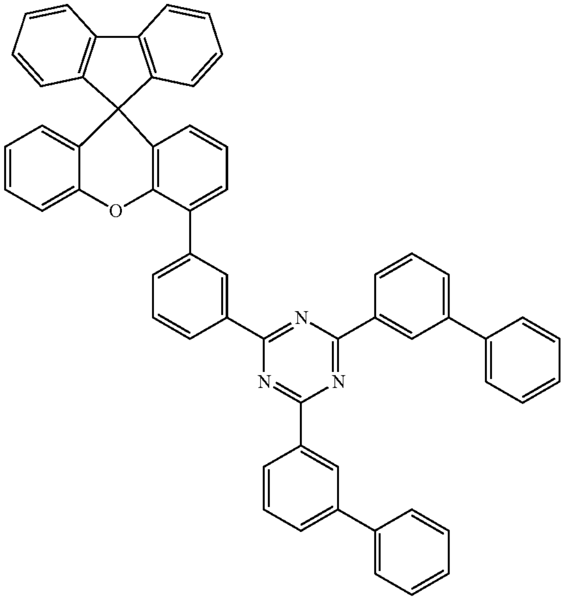
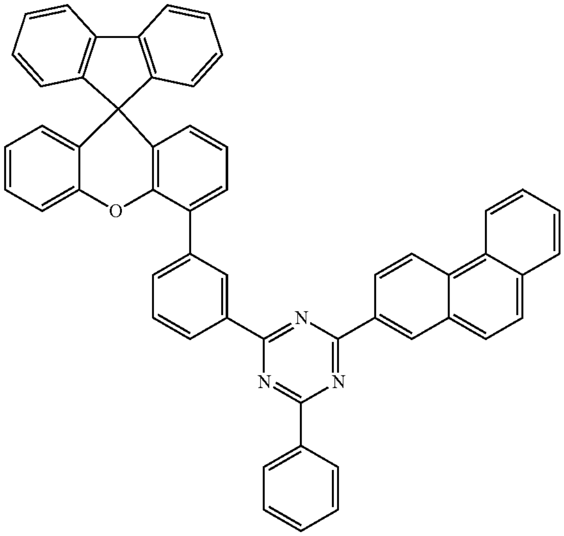

-continued
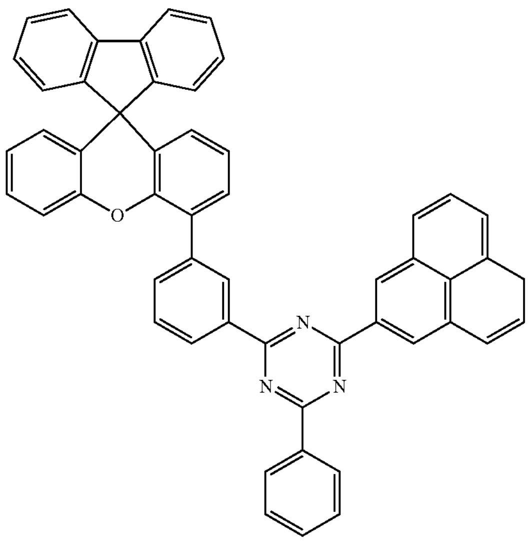
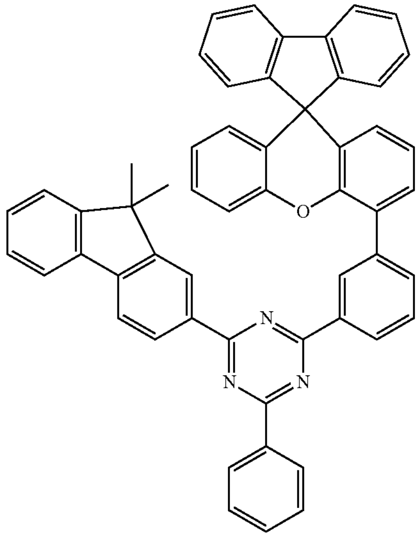
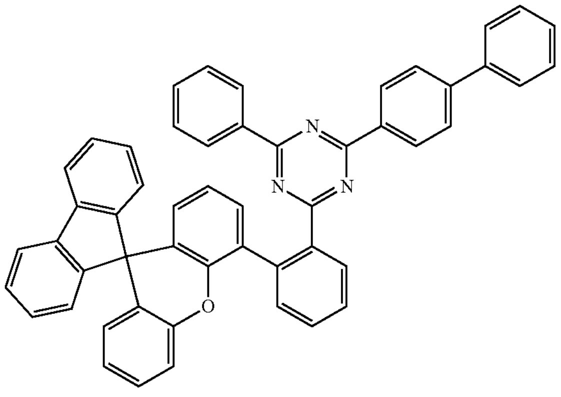
-continued
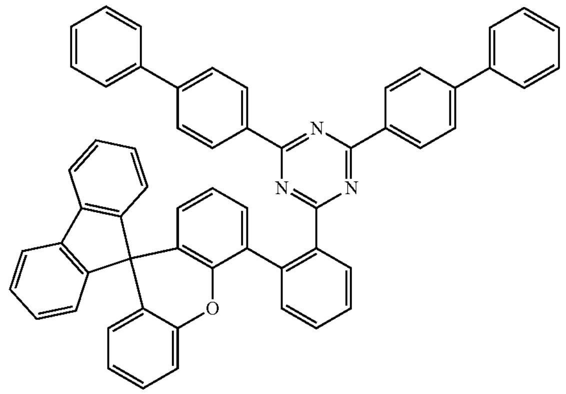
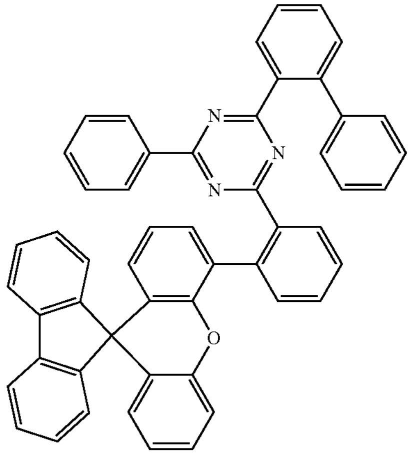
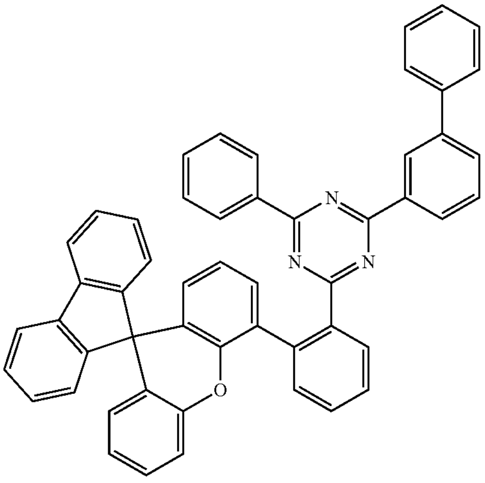

-continued
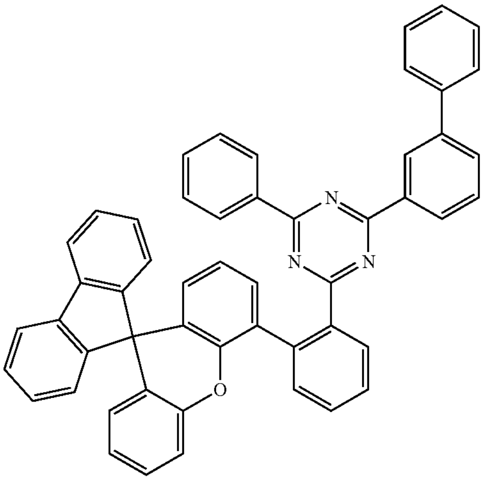
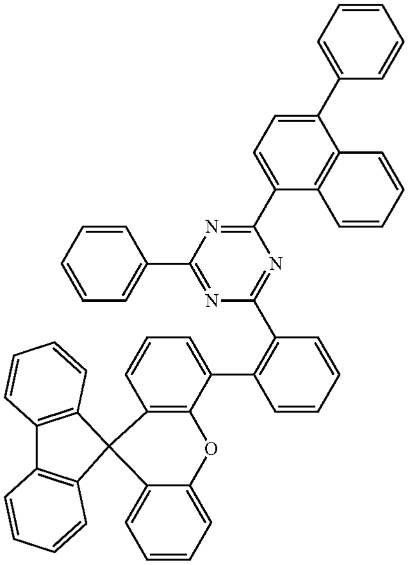
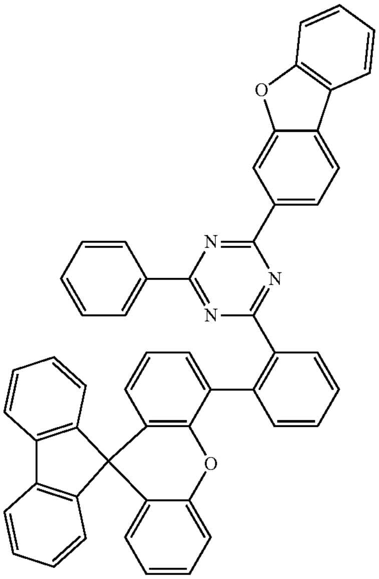
-continued
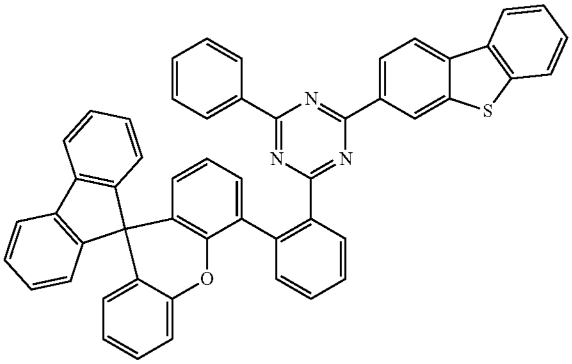
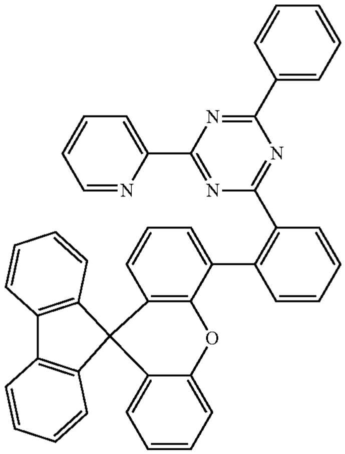
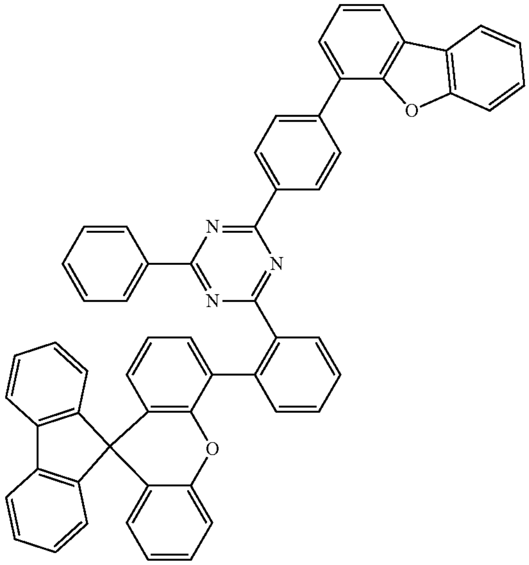

-continued
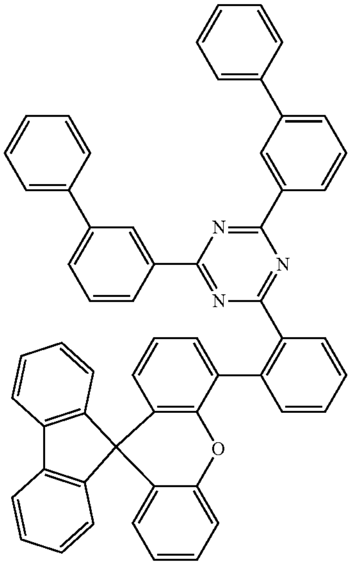
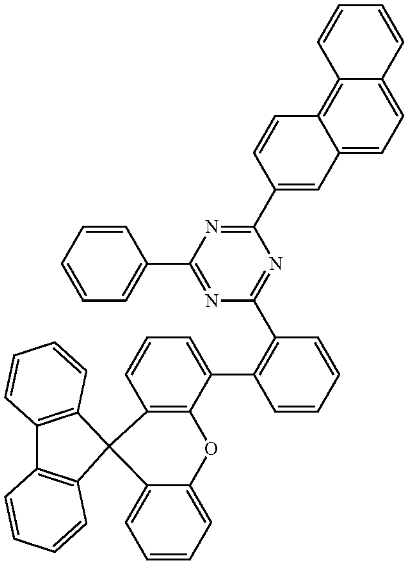
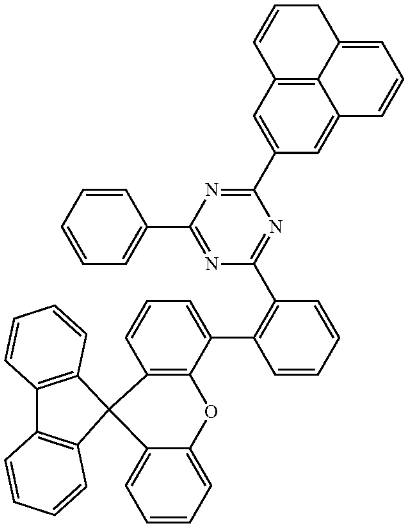
-continued
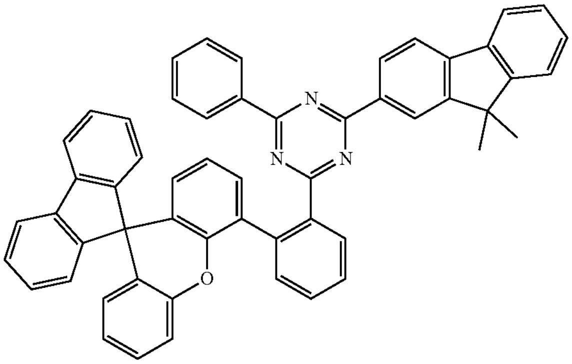
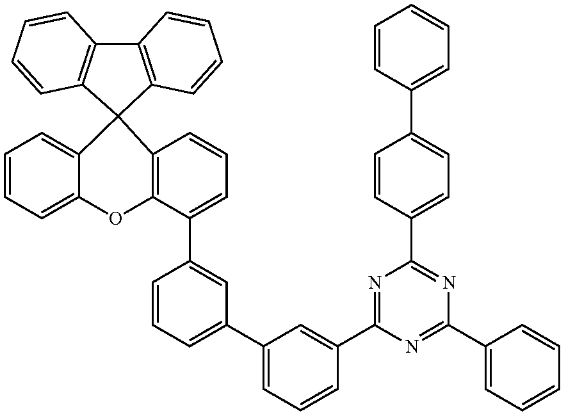
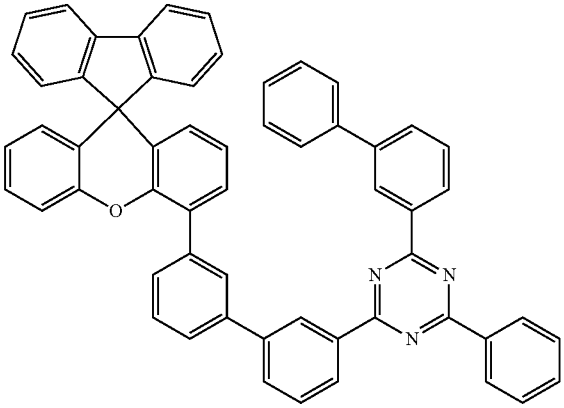
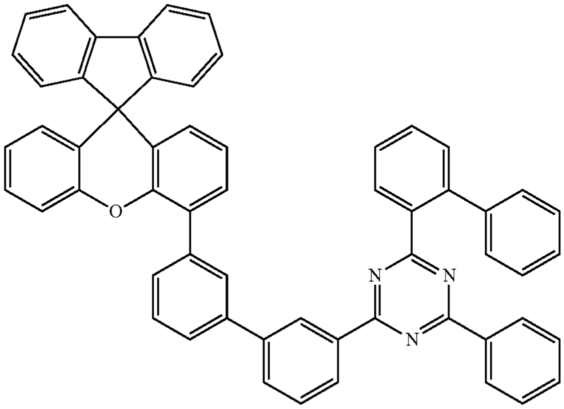

-continued
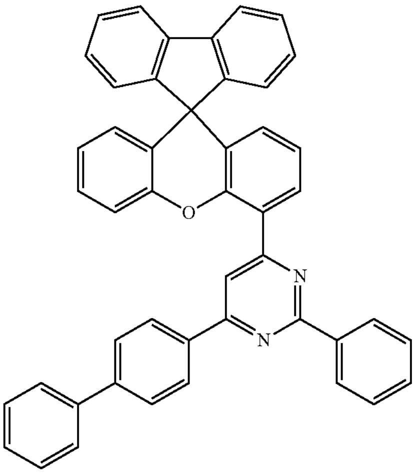
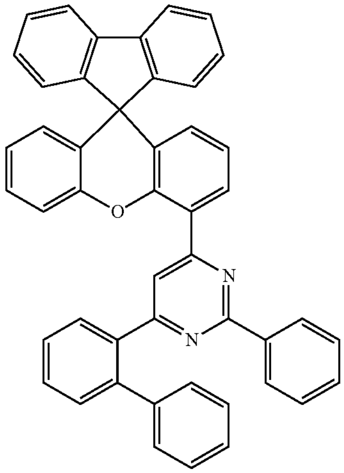
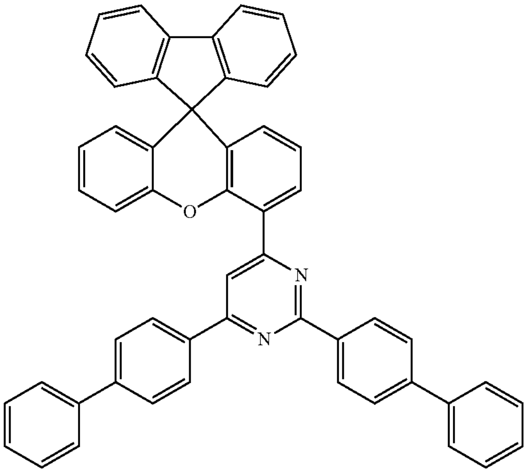
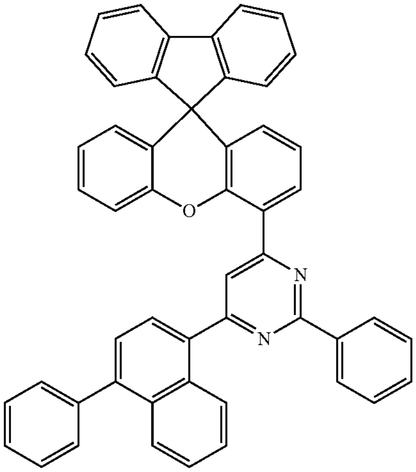
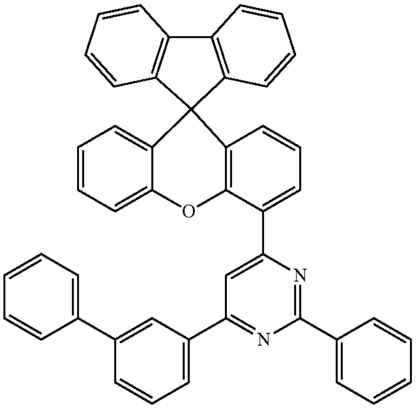
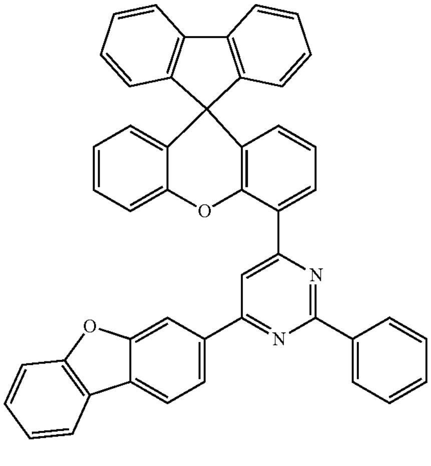

-continued
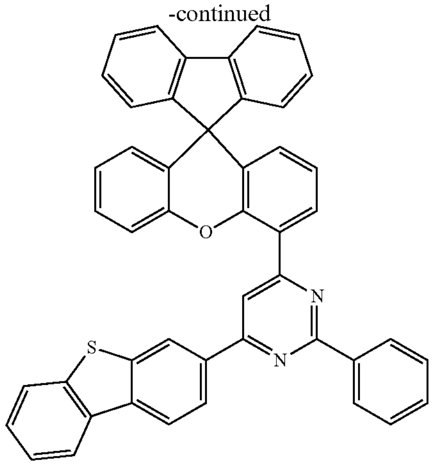
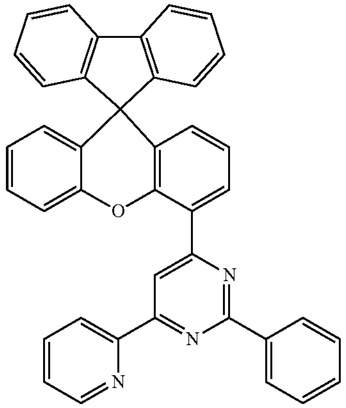
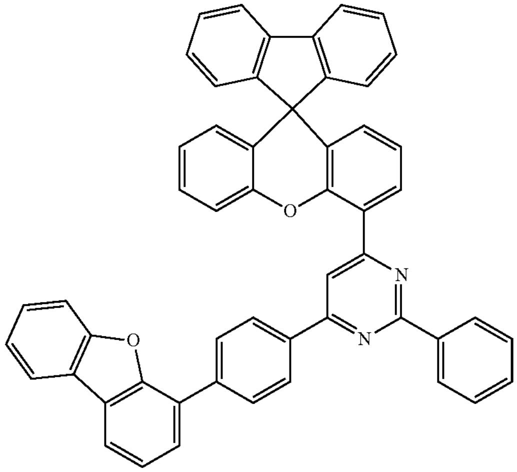
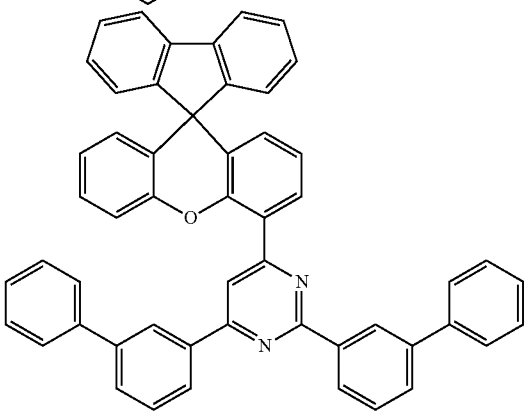
-continued
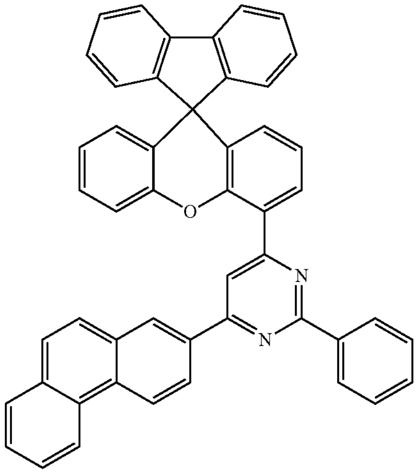
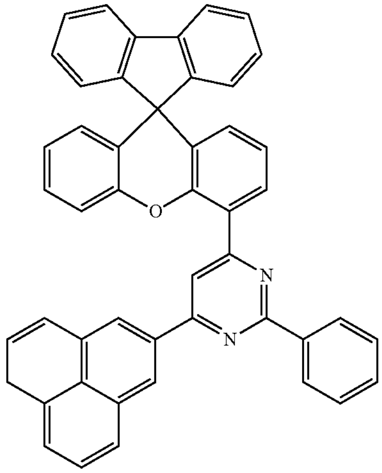
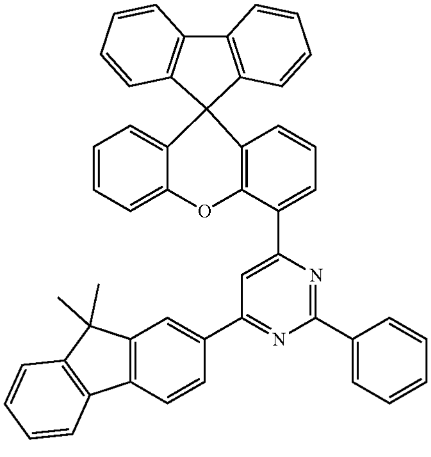 [SMILES: CC1(C)c2ccccc2-c2ccc(-c3cc(-c4cccc5c4Oc4ccccc4C54c5ccccc5-c5ccccc54)nc(-c4ccccc4)n3)cc21]

-continued
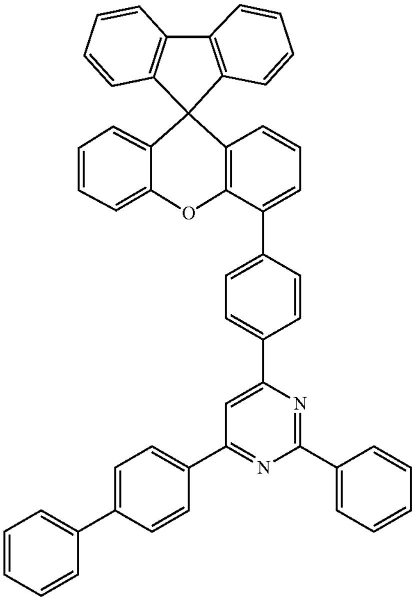
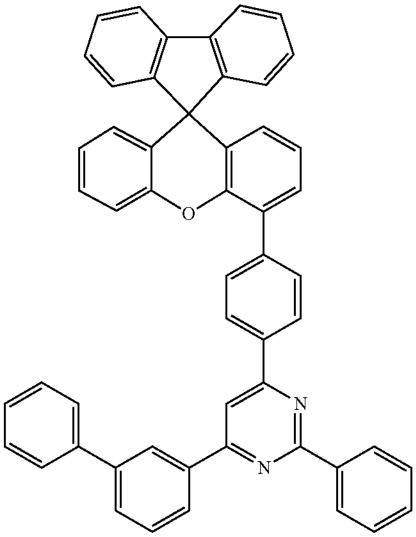
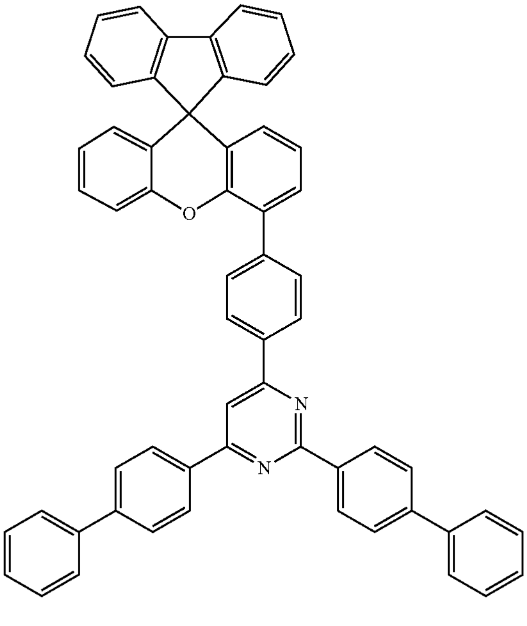
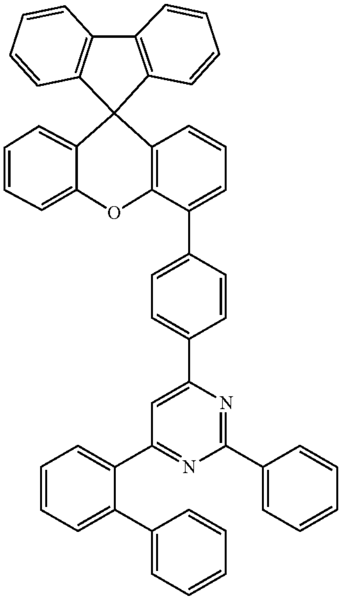

-continued
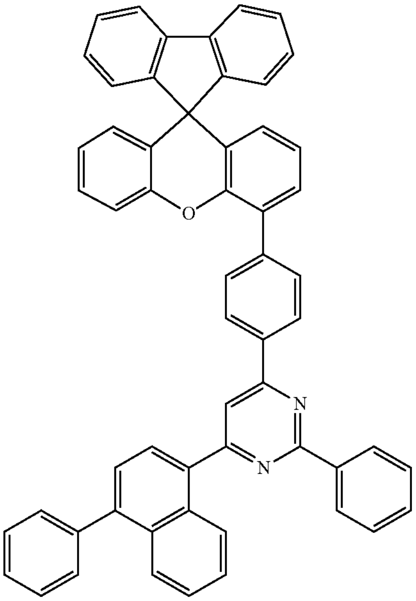
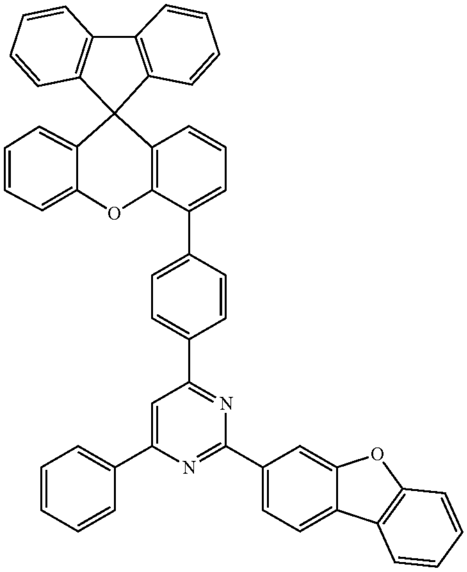
-continued
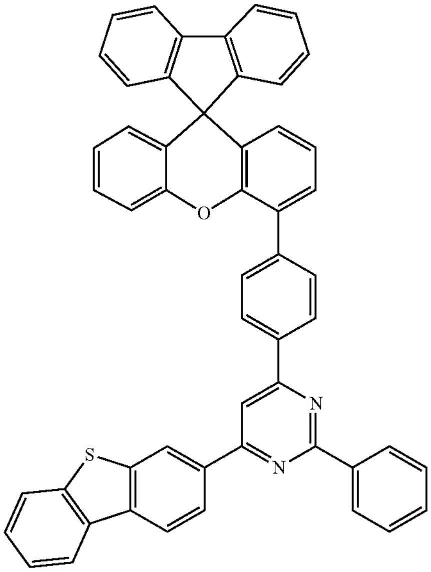
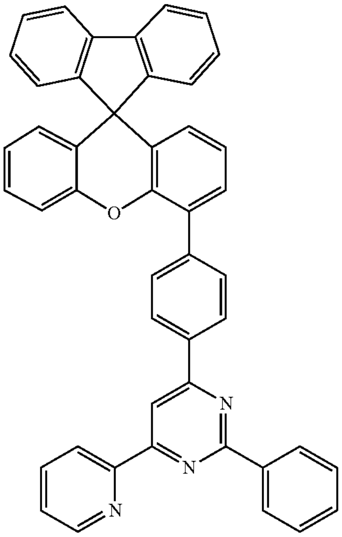
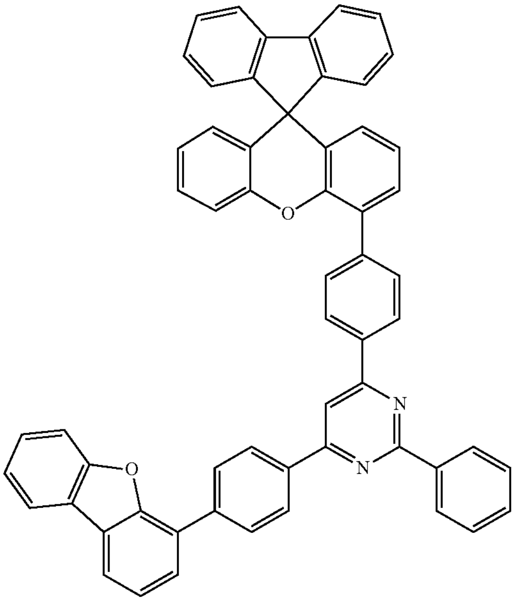

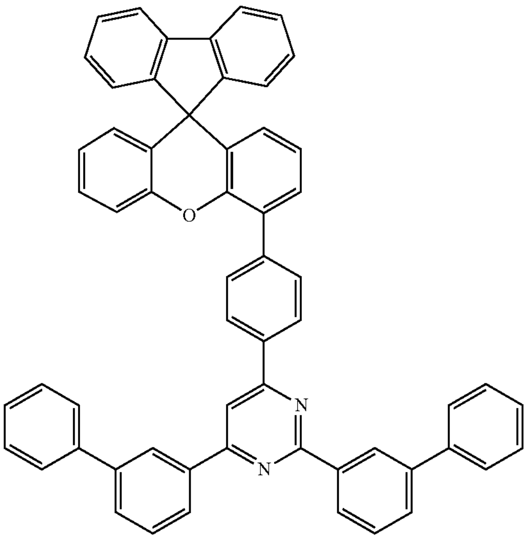
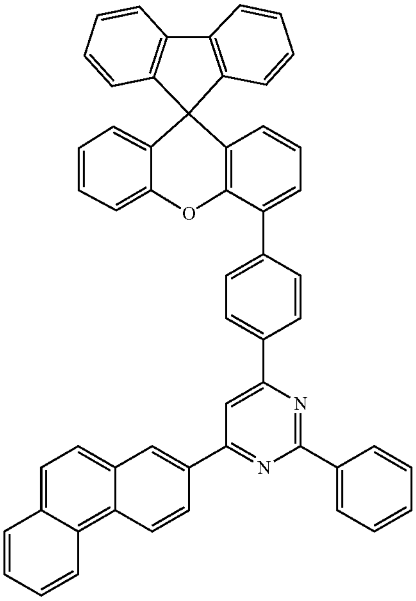
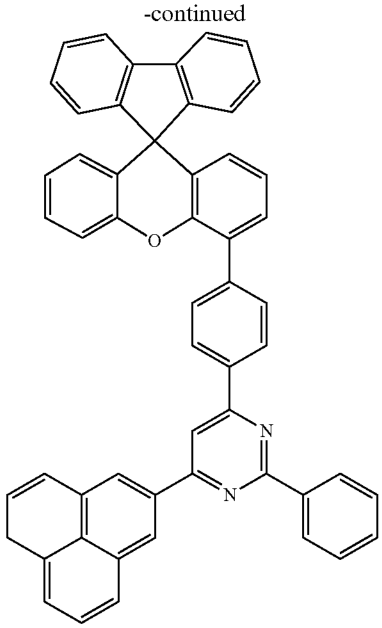
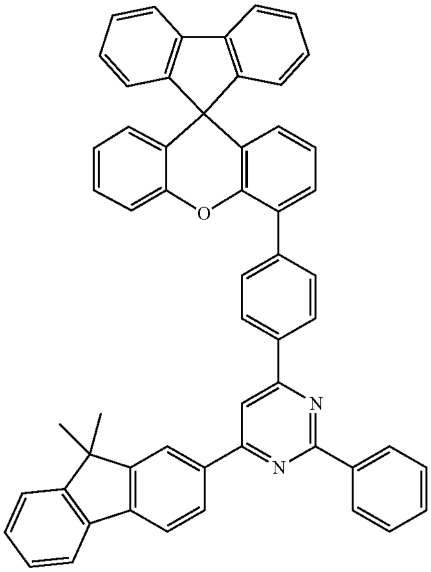
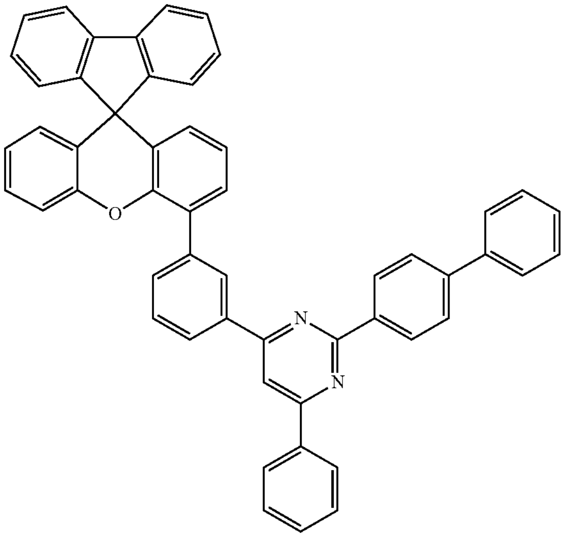

-continued
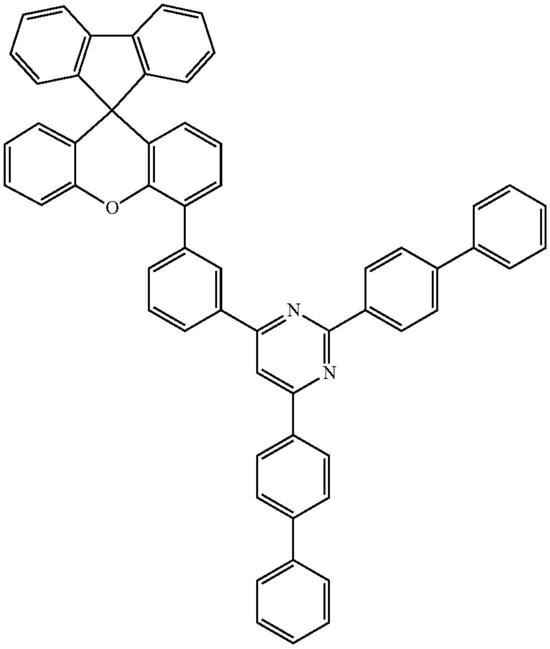
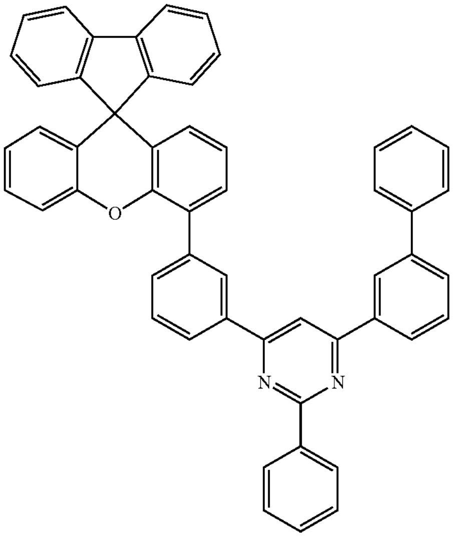
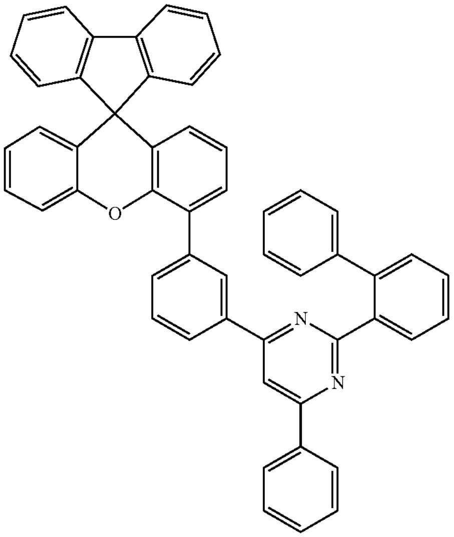
-continued
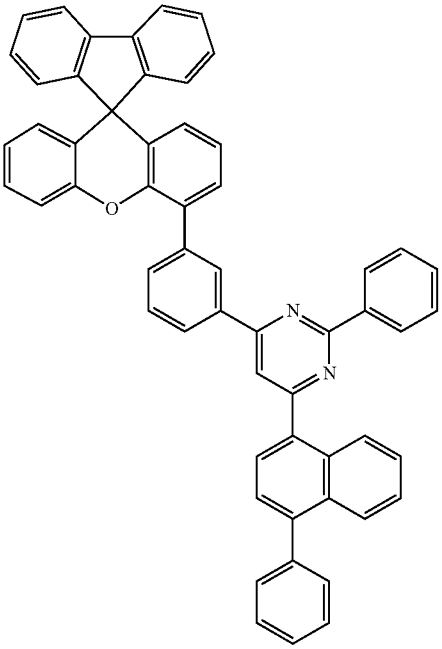
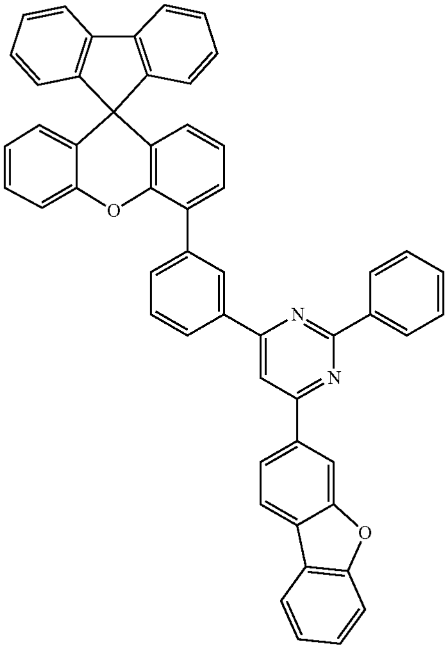

-continued
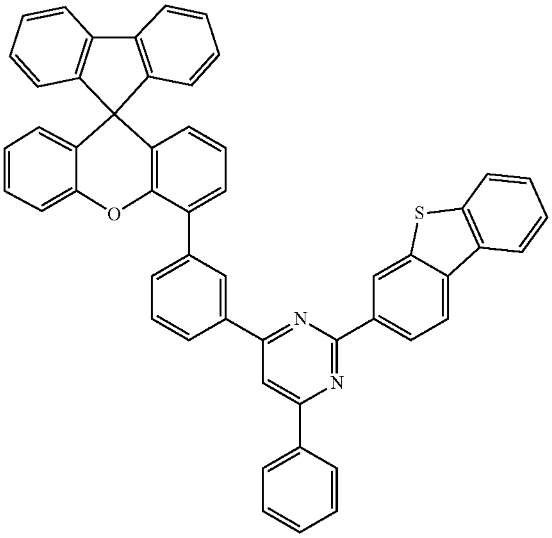
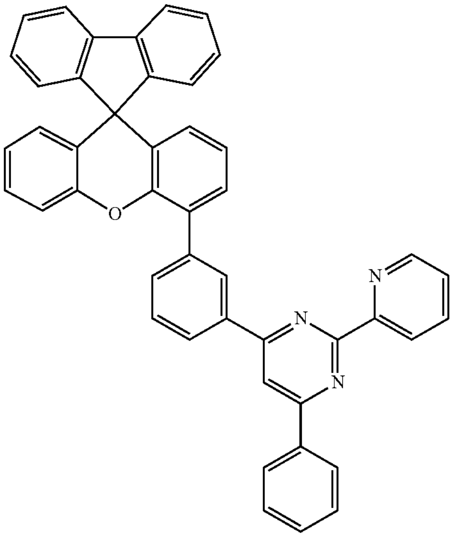
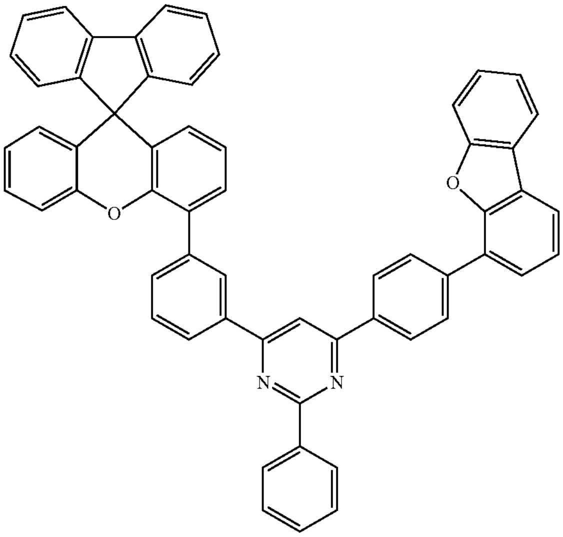
-continued
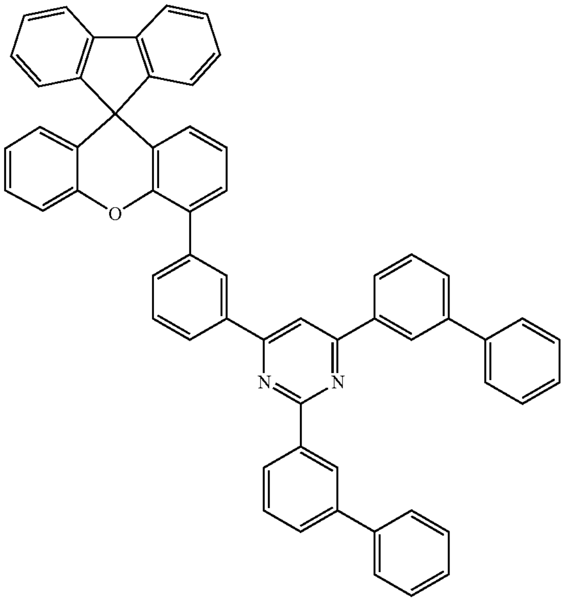
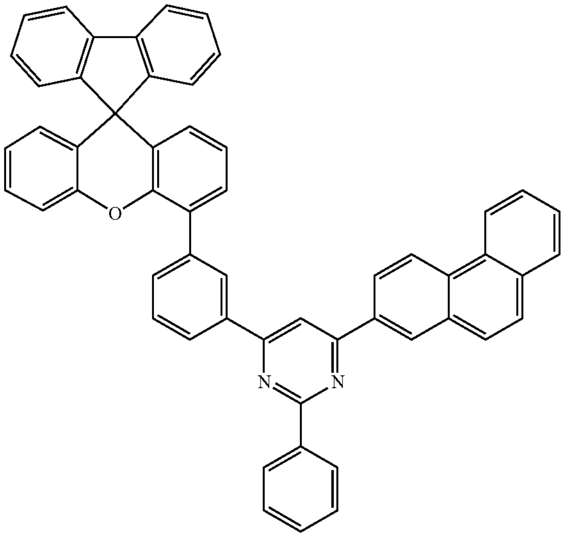
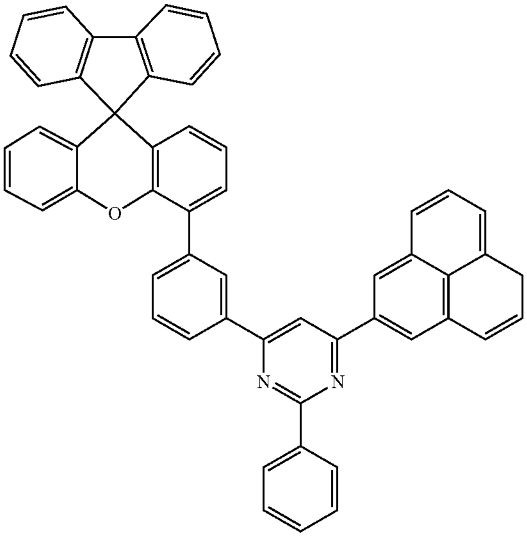

-continued
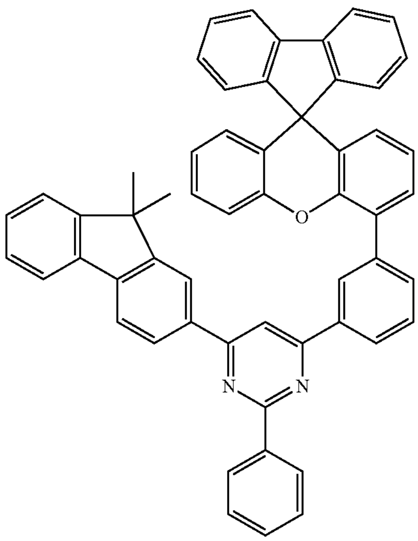
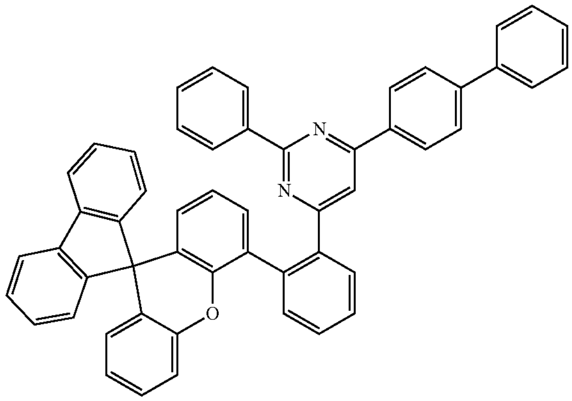
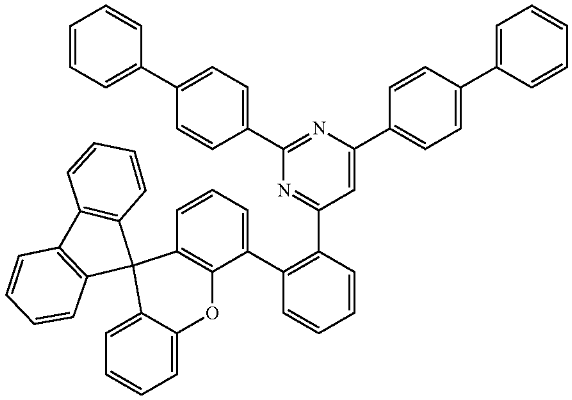
-continued
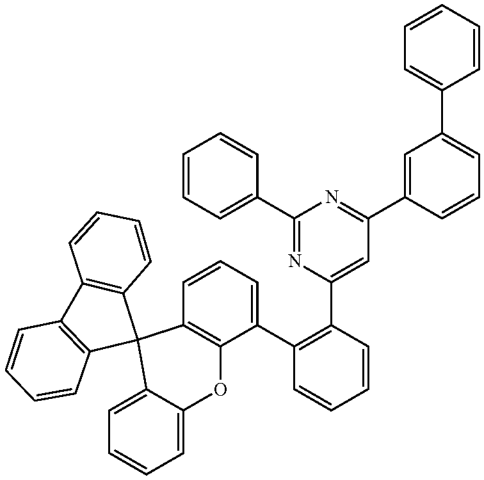
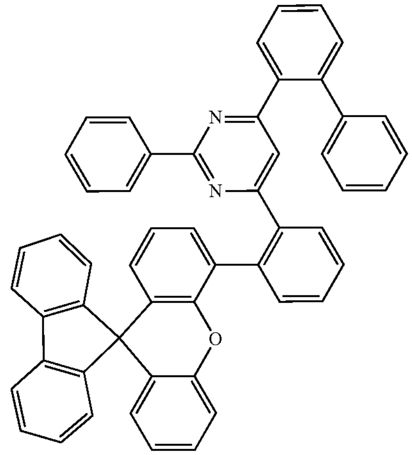
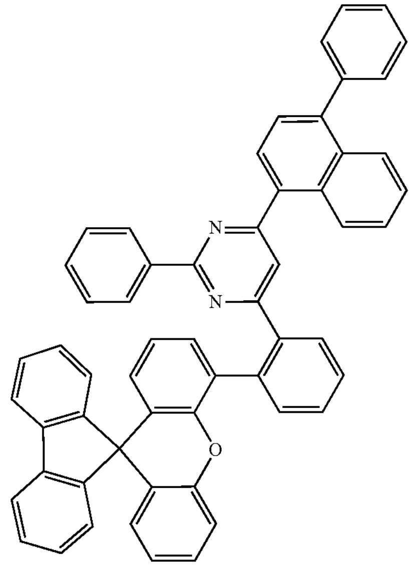

-continued
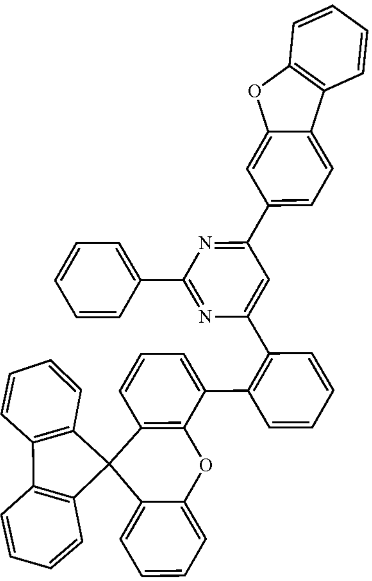
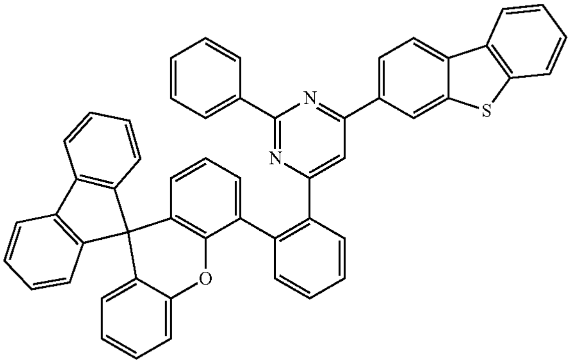
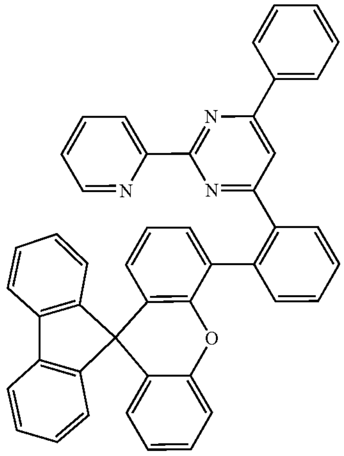
-continued
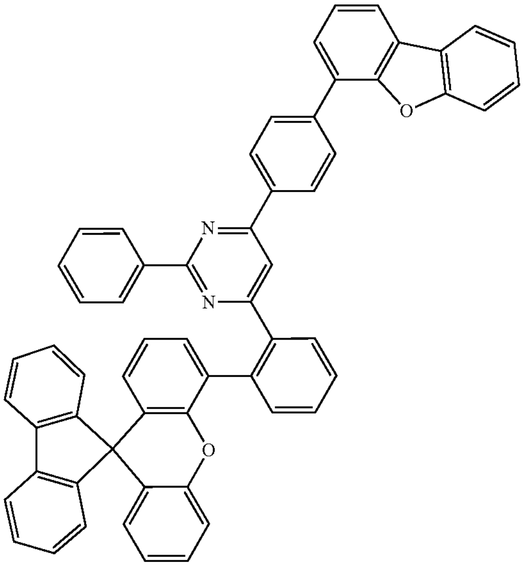
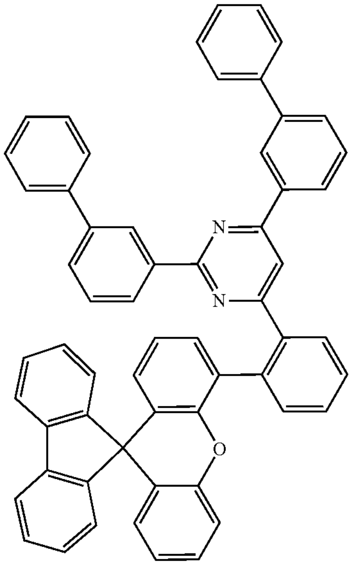
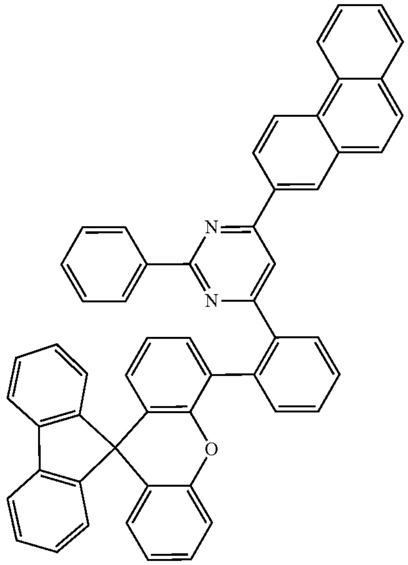

-continued
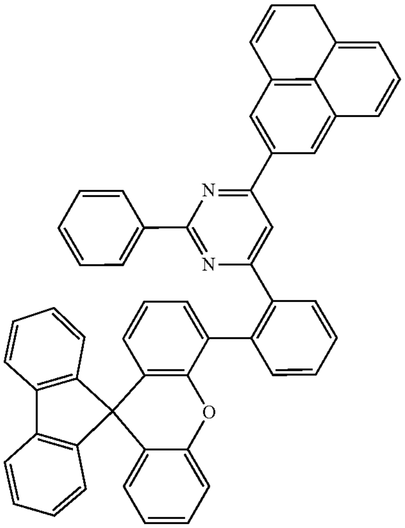
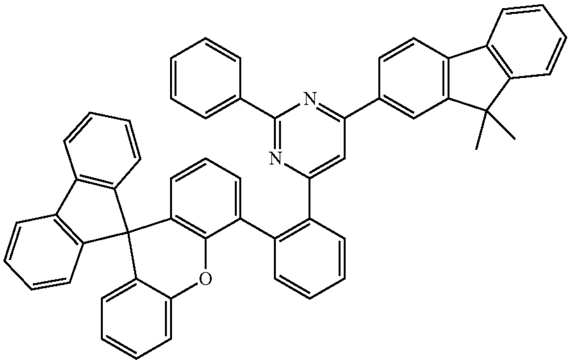
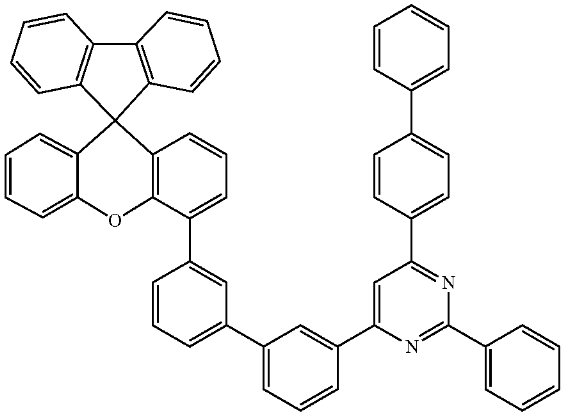
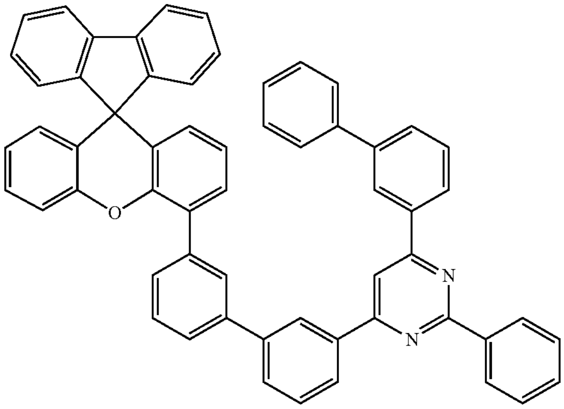
-continued
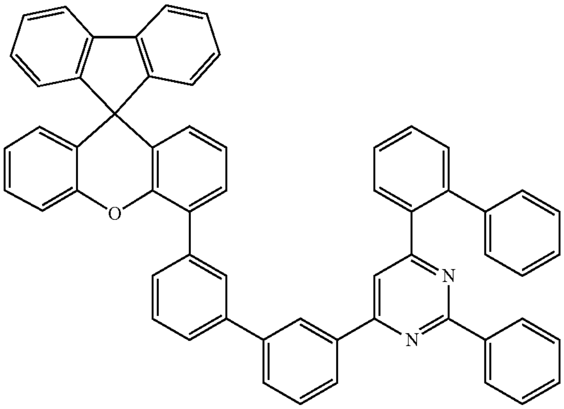
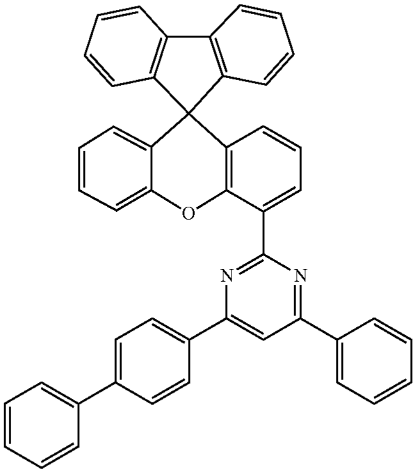
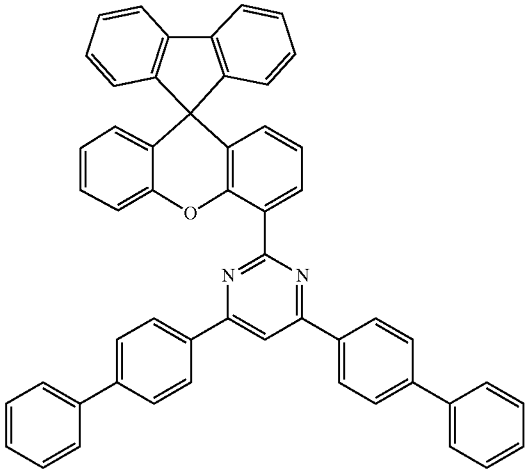

-continued
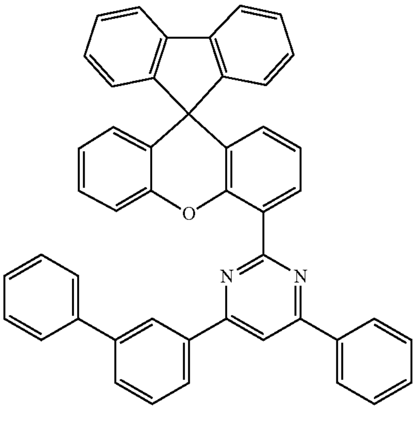
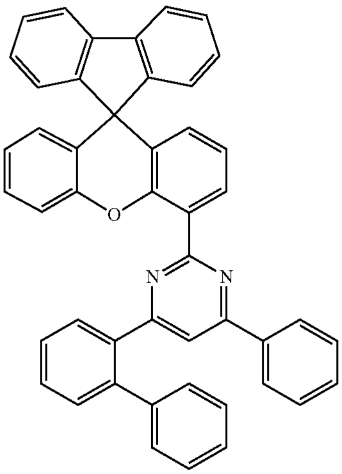
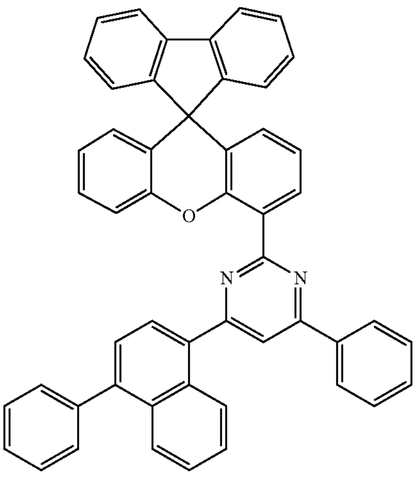
-continued
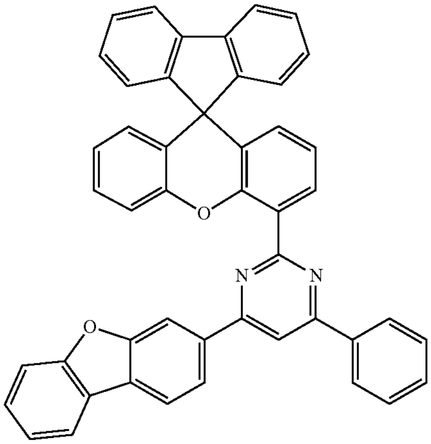
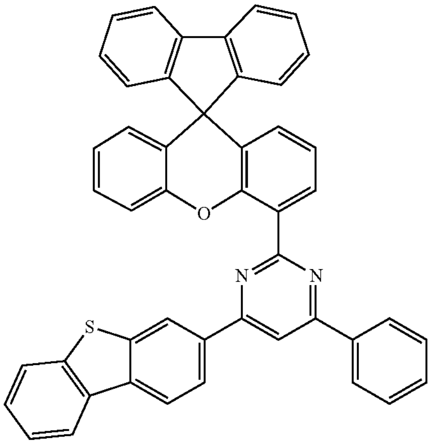
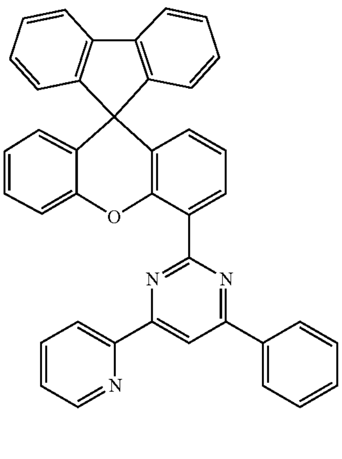

-continued
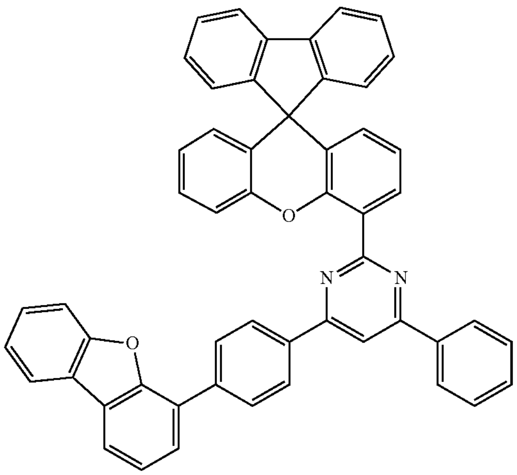
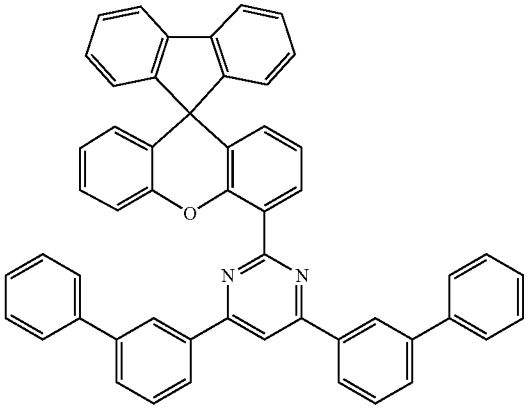
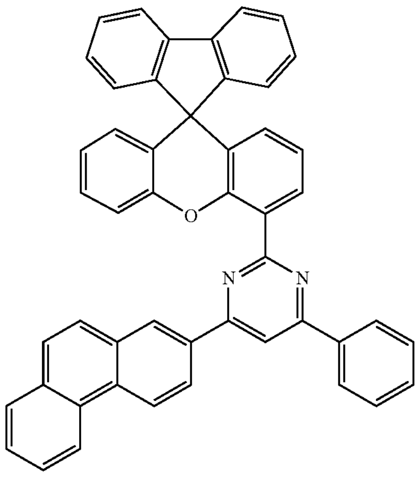
-continued
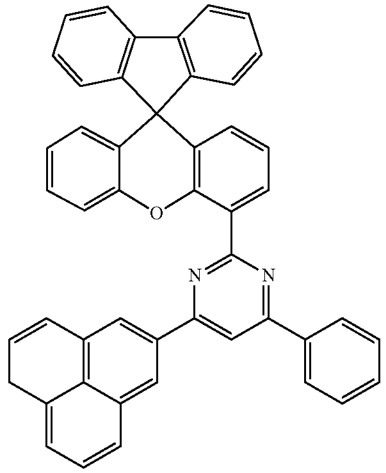
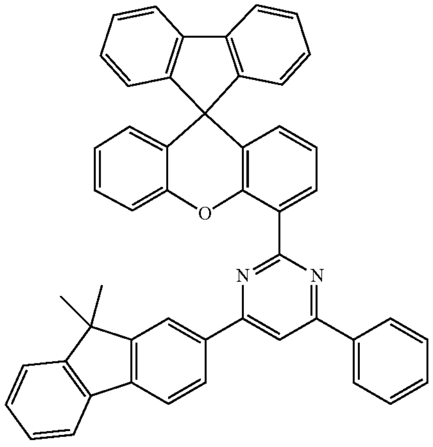
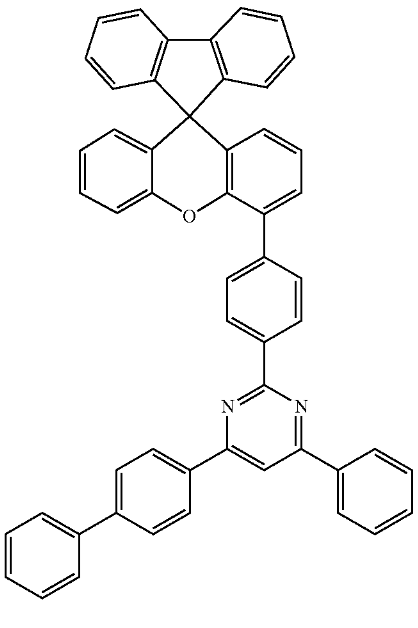

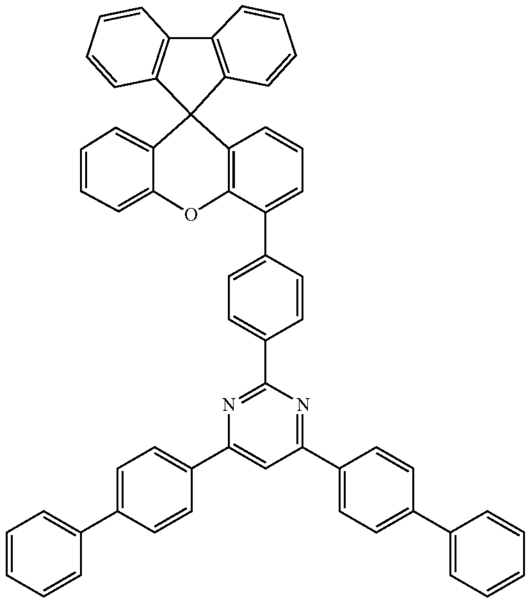
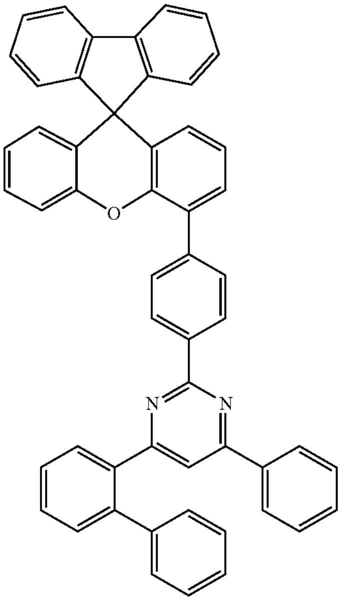
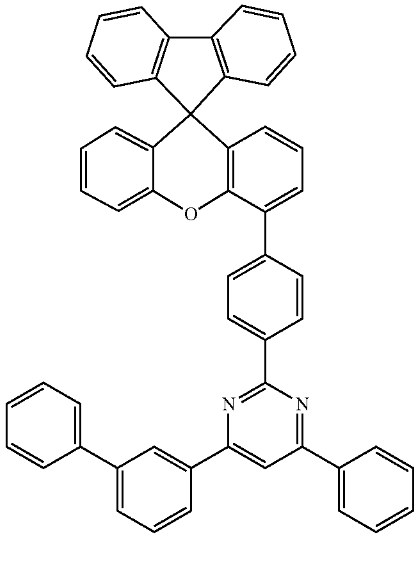
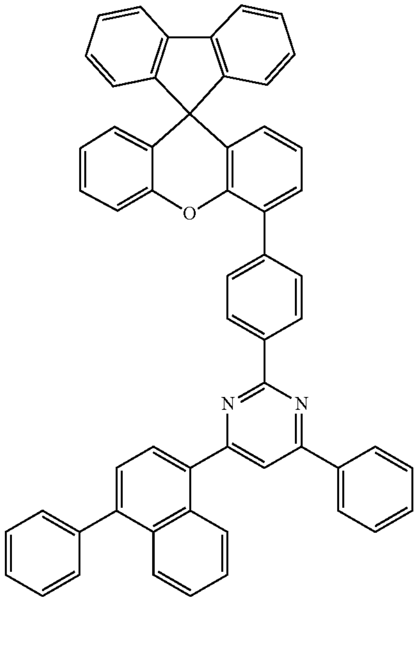

-continued
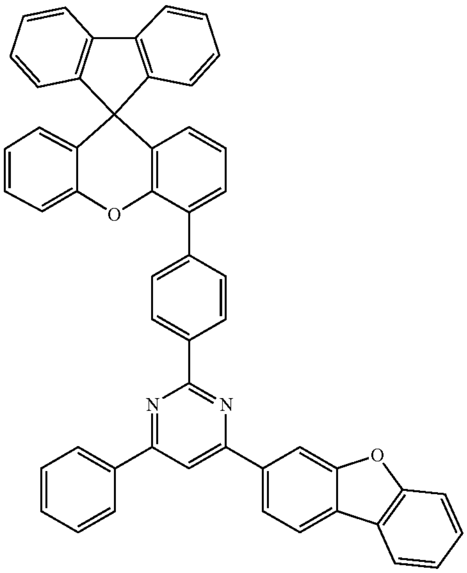
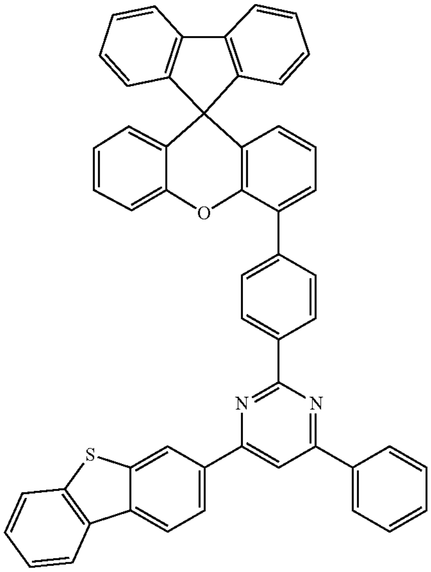
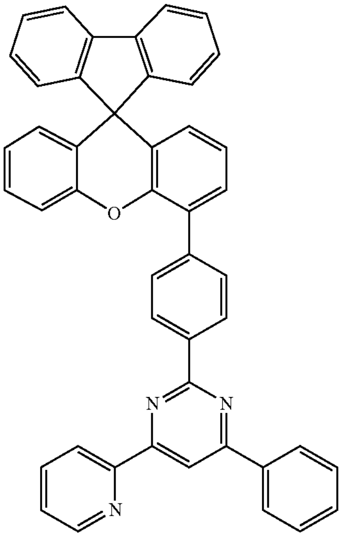
-continued
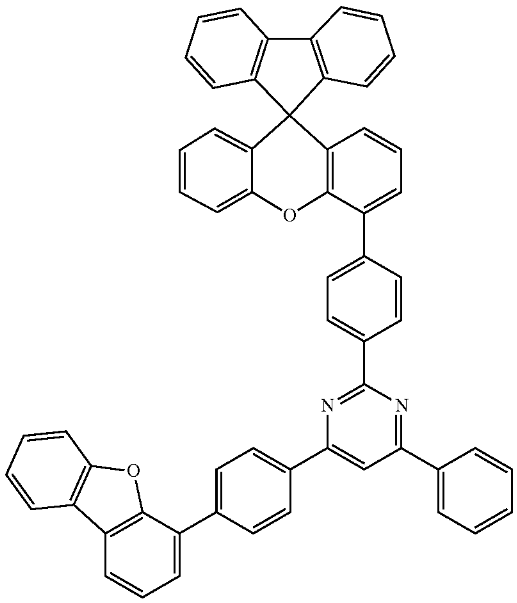
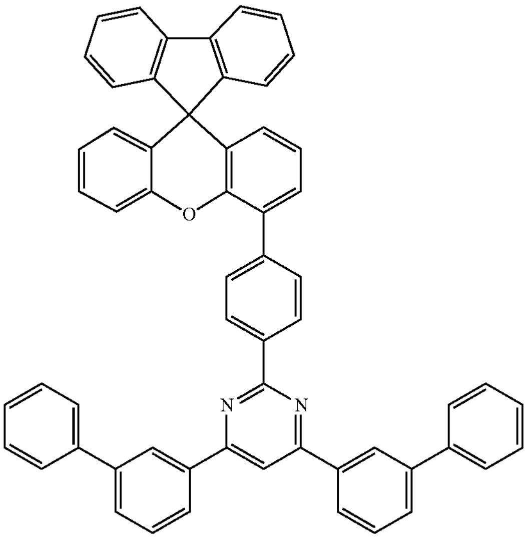

-continued
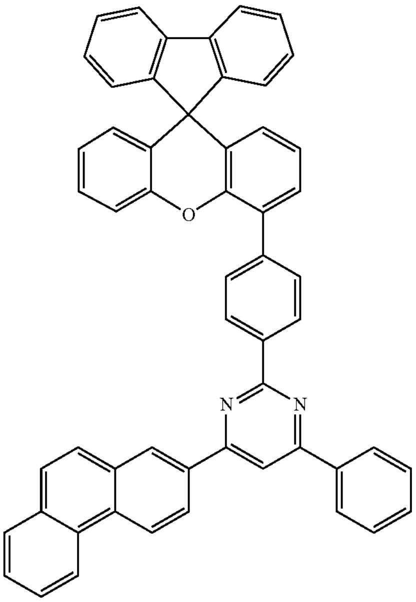
-continued
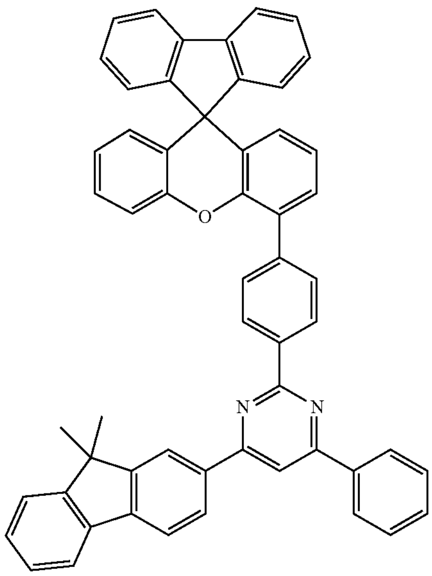
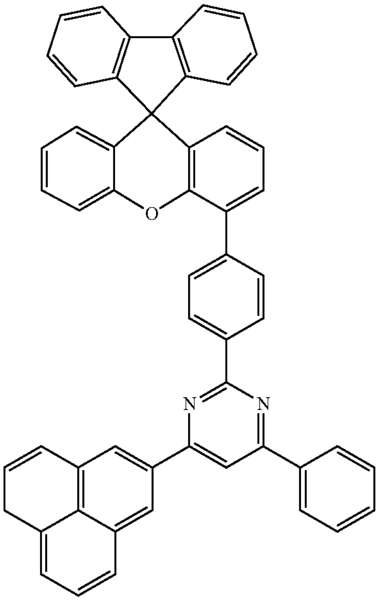
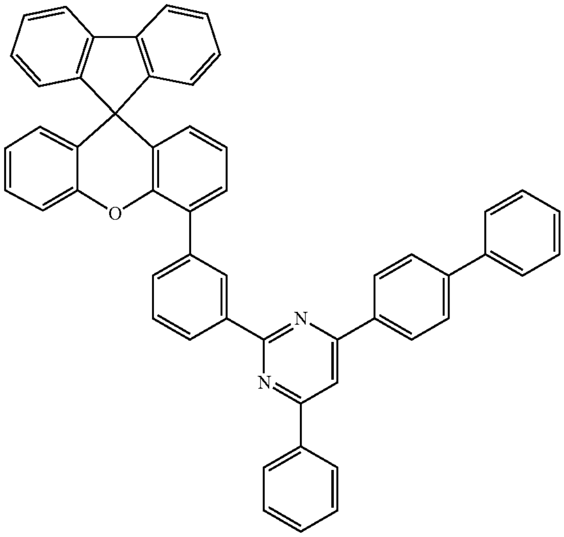

-continued
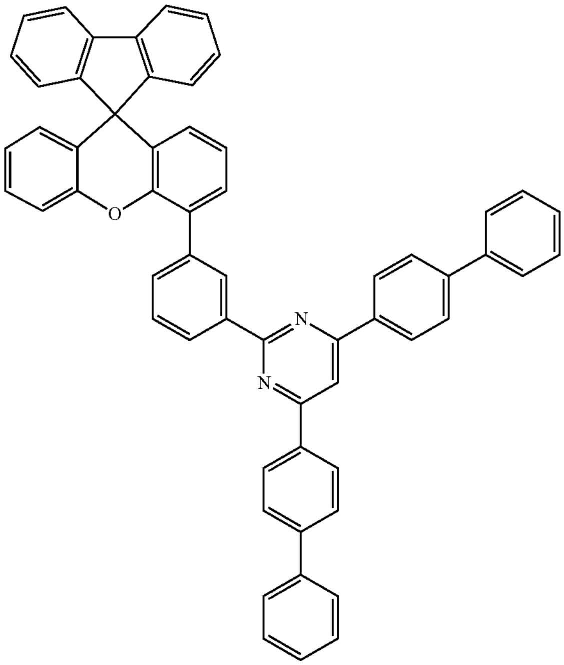
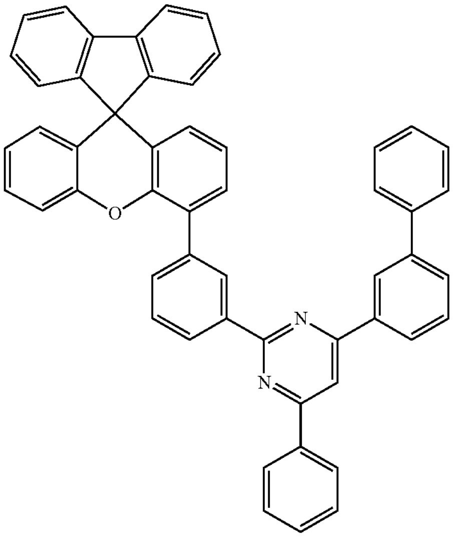
-continued
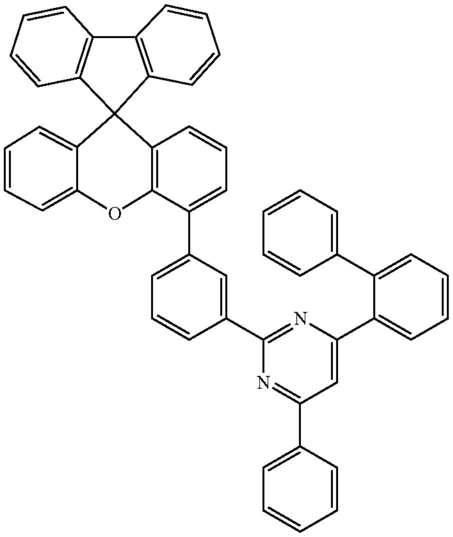
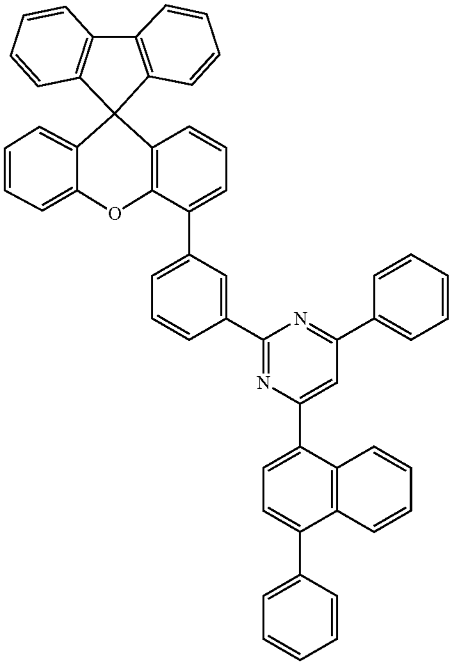

-continued
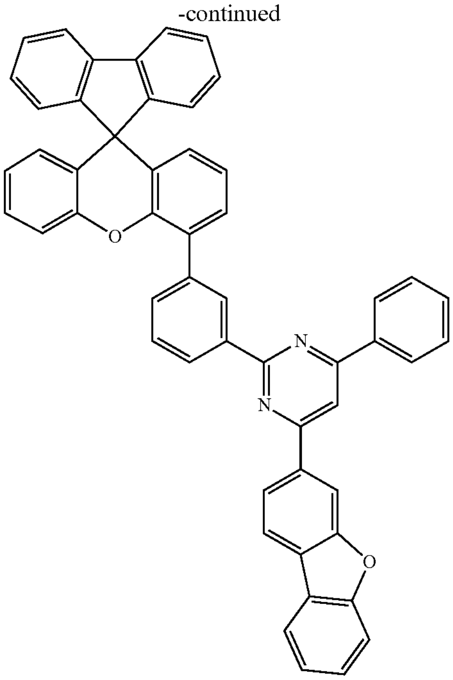
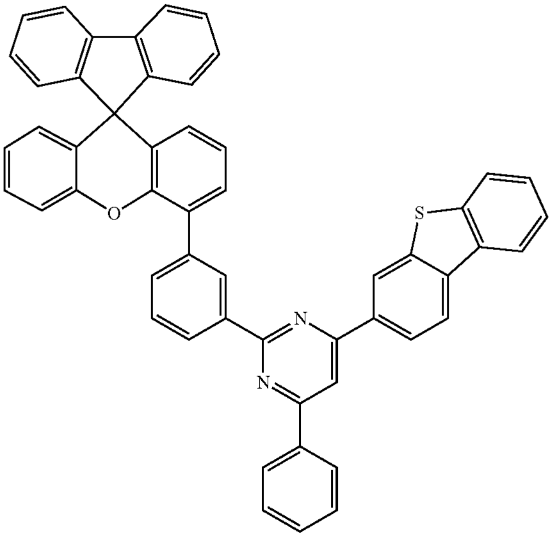
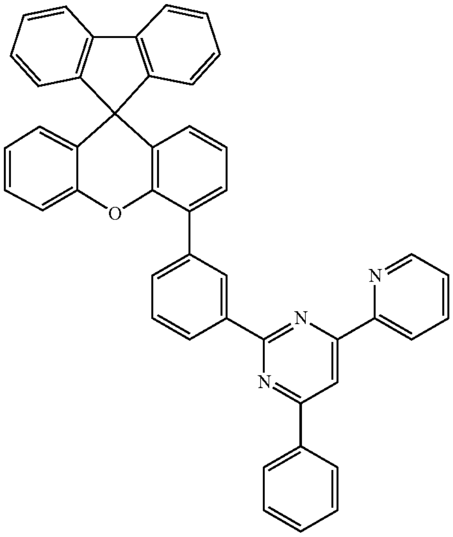
-continued
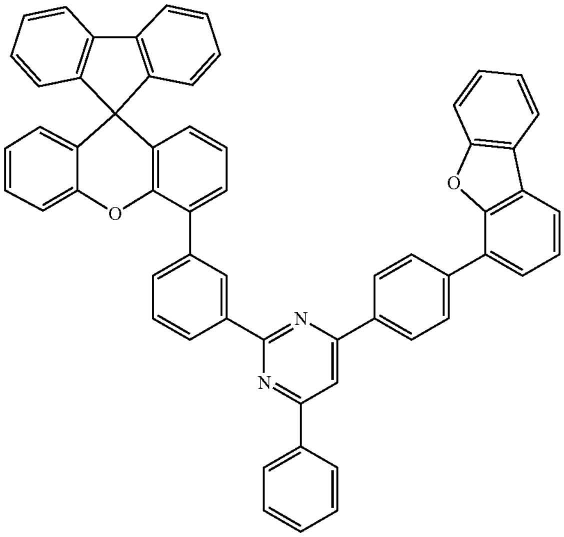
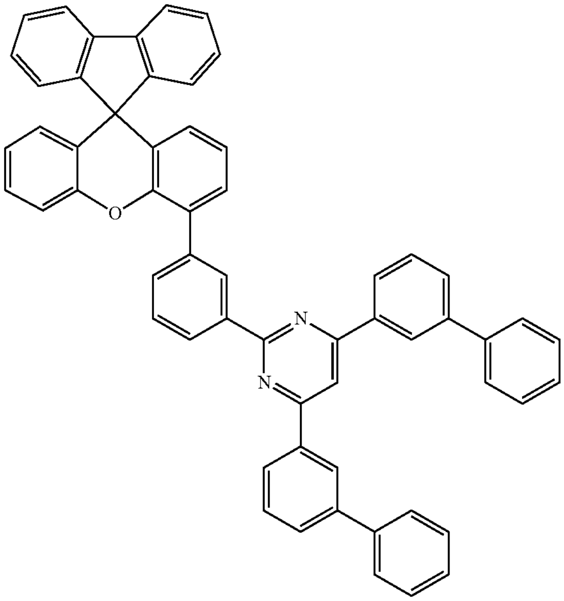
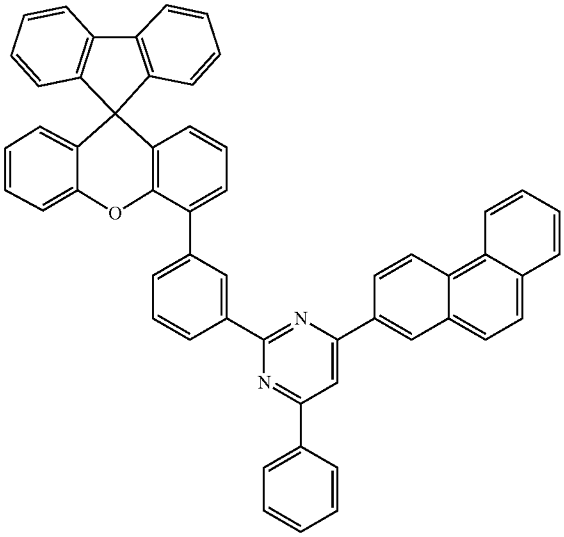

-continued
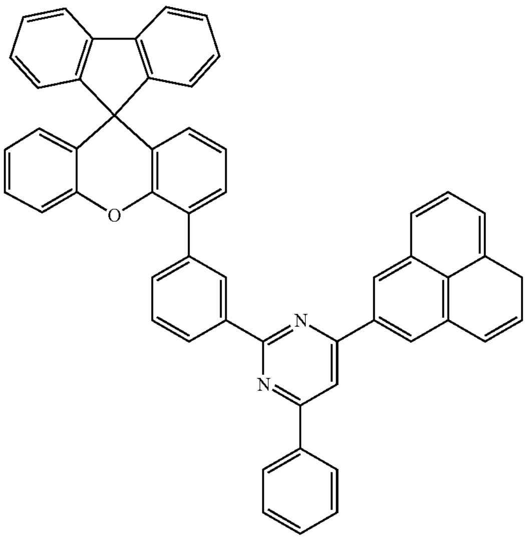
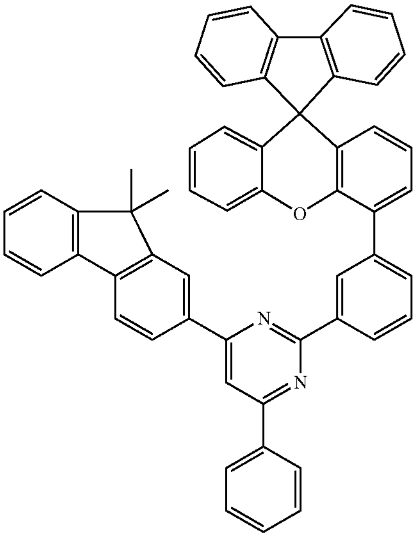
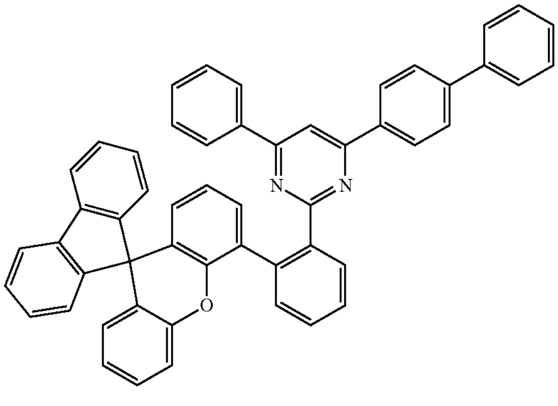
-continued
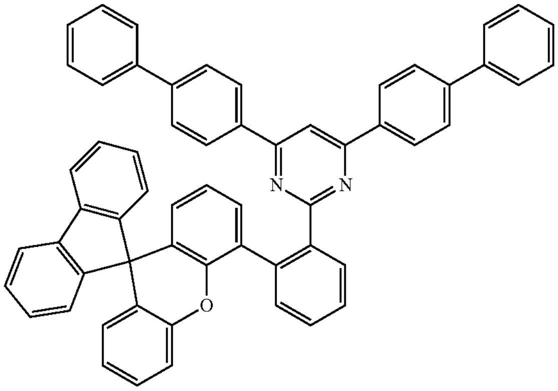
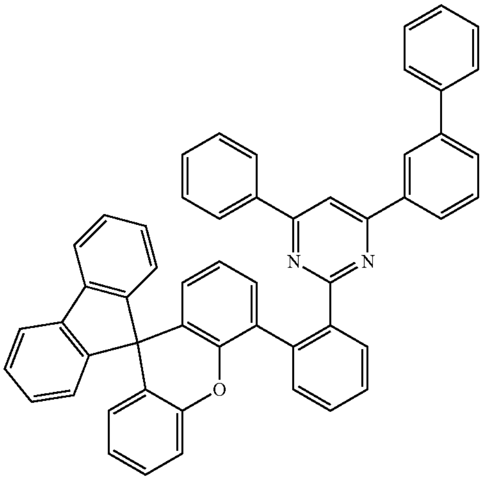
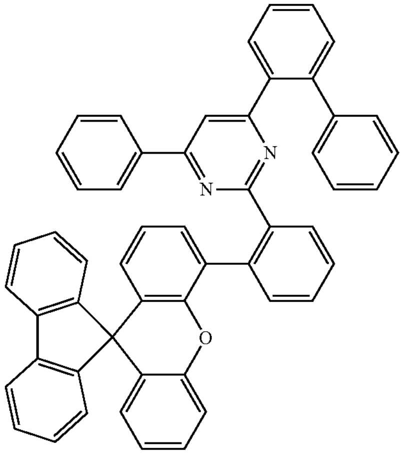

-continued
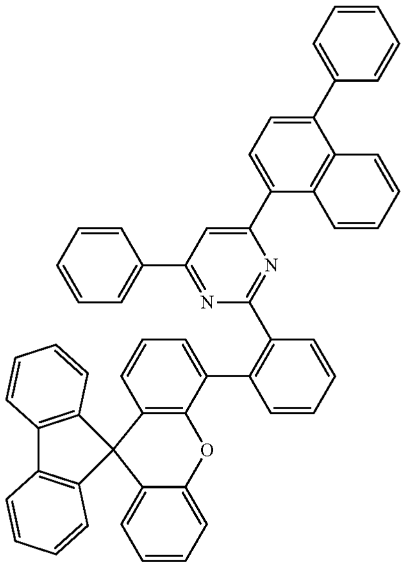
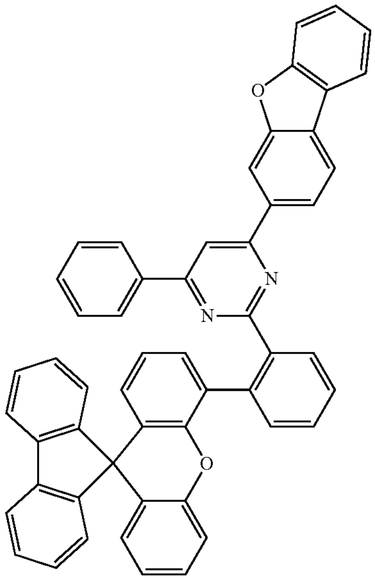
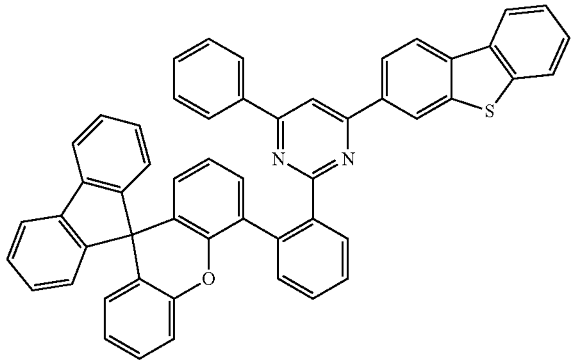
-continued
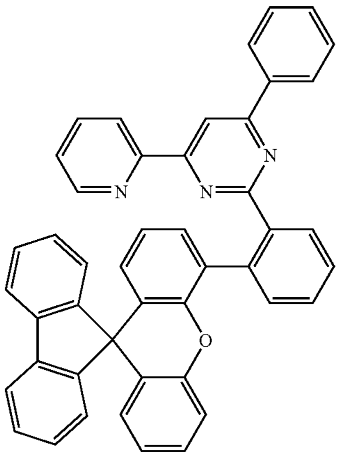
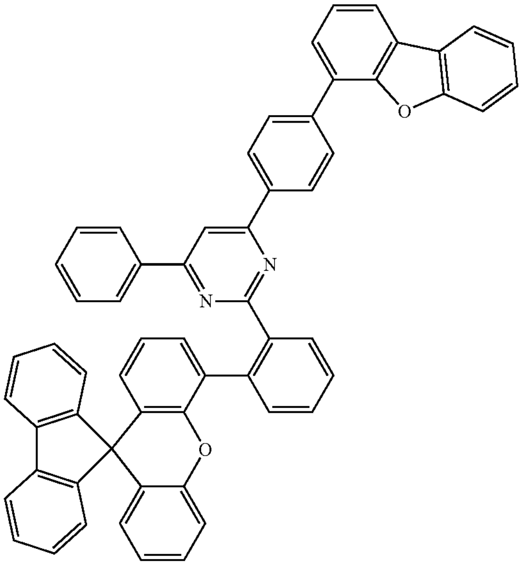
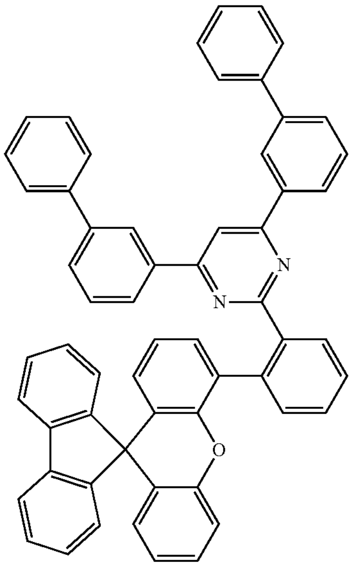

-continued
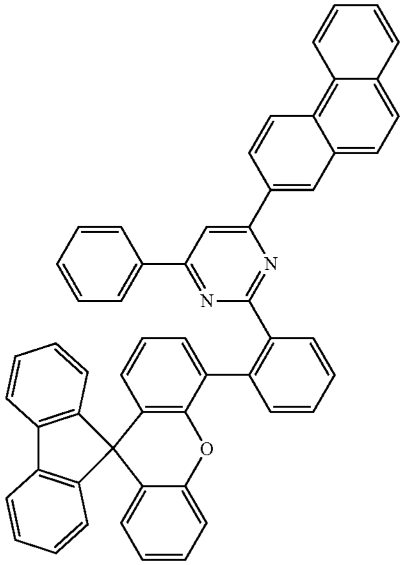
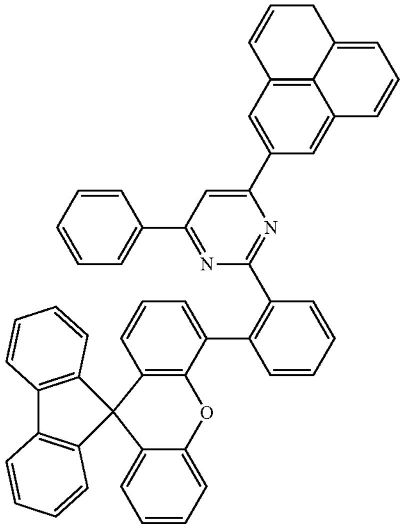
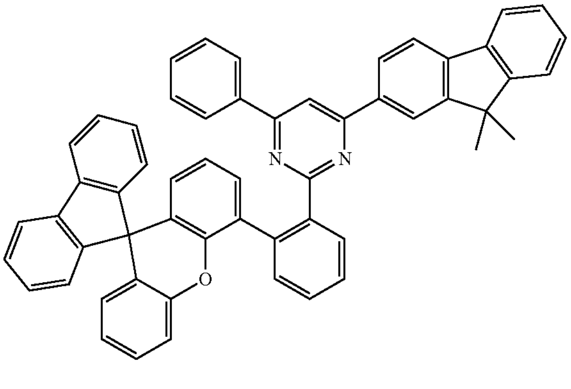
-continued
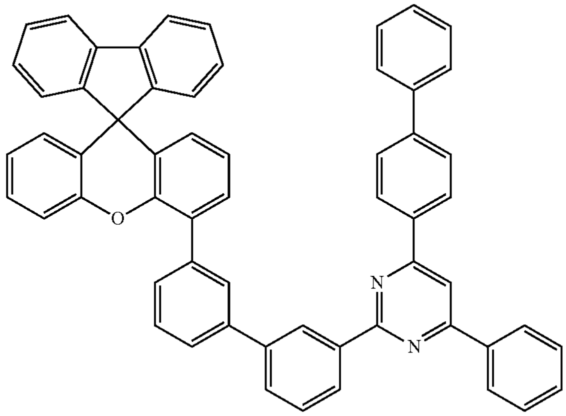
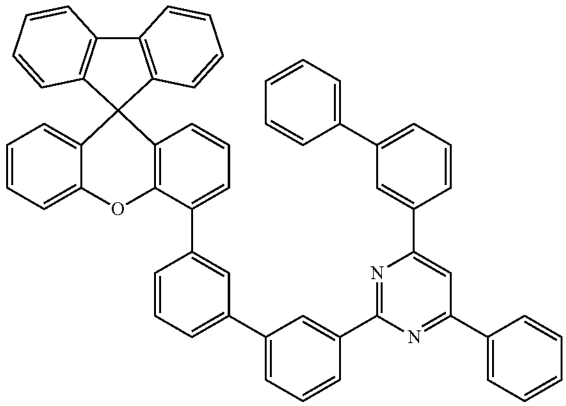
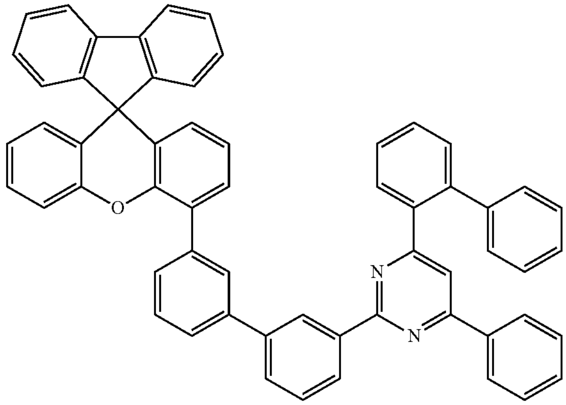
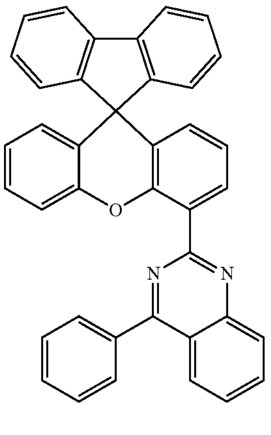

-continued
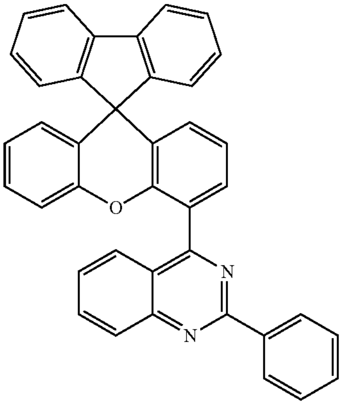
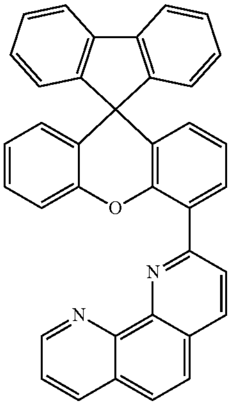
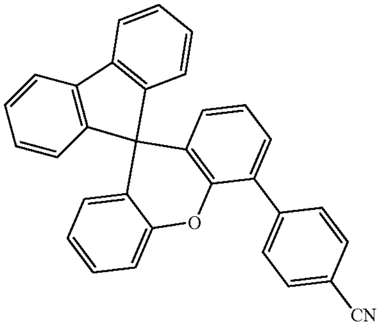
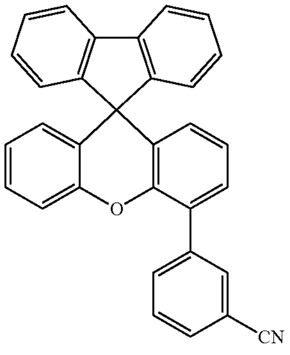
-continued
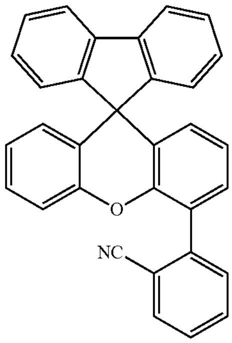
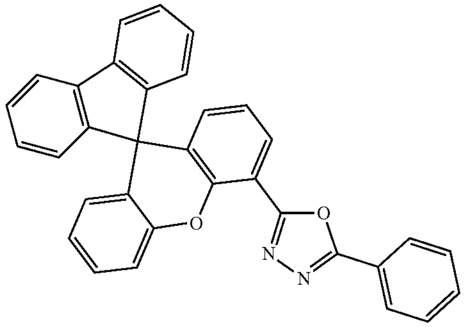
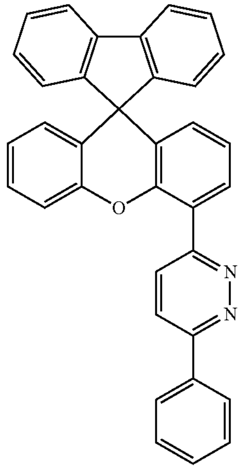
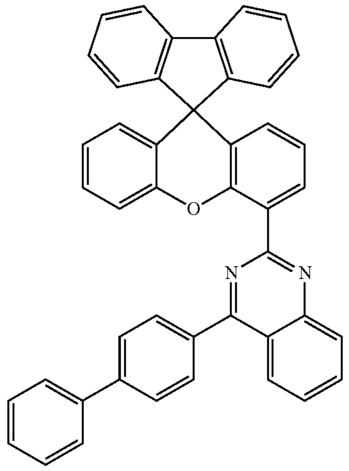

-continued
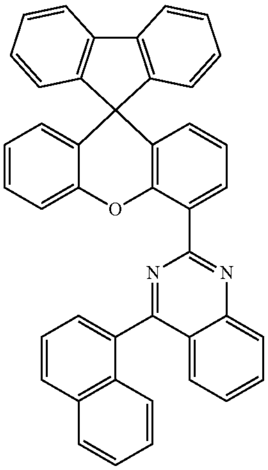
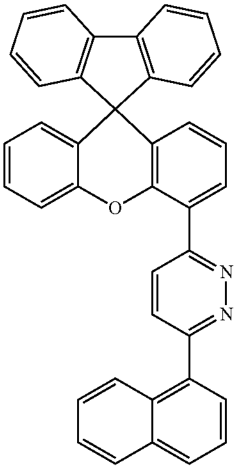
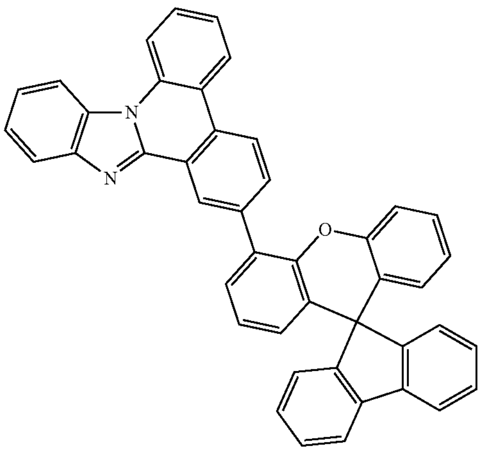
-continued
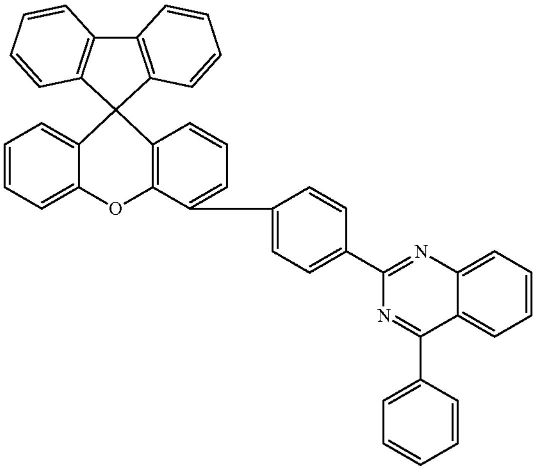
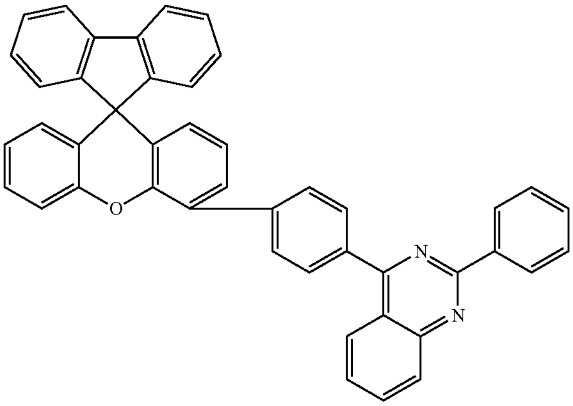
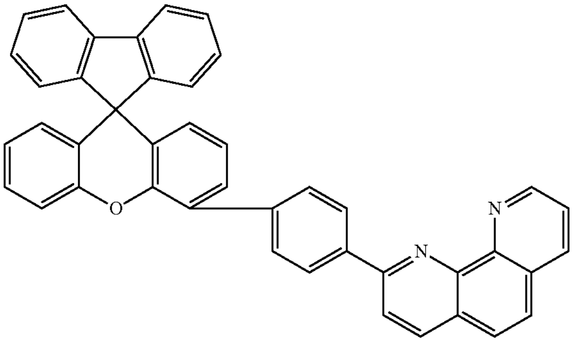
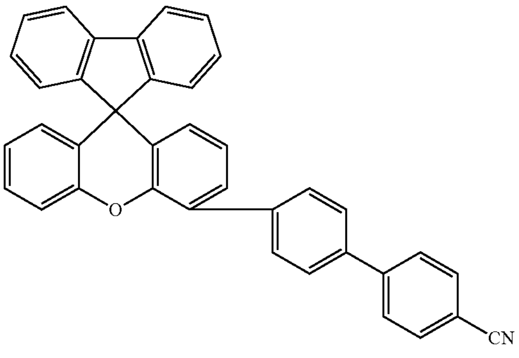

-continued
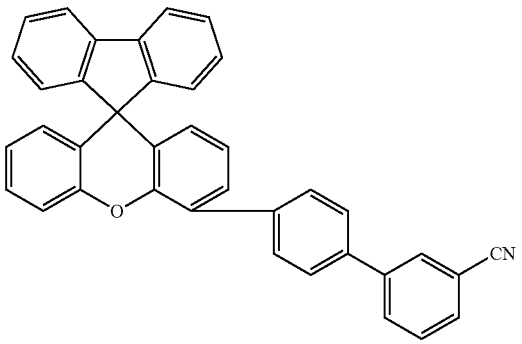
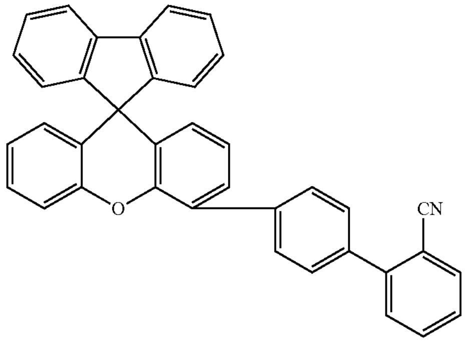
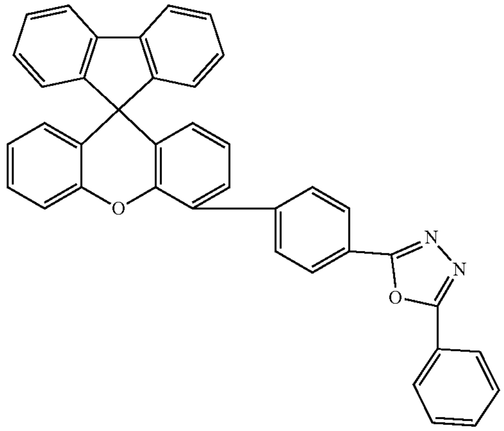
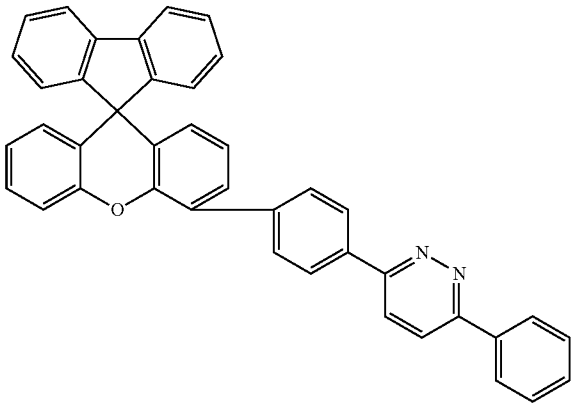
-continued
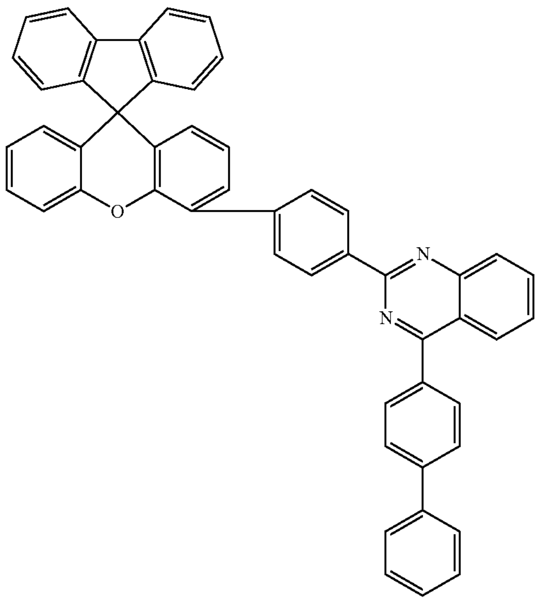
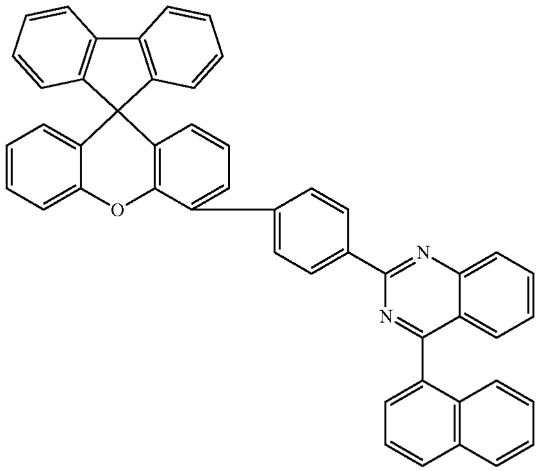
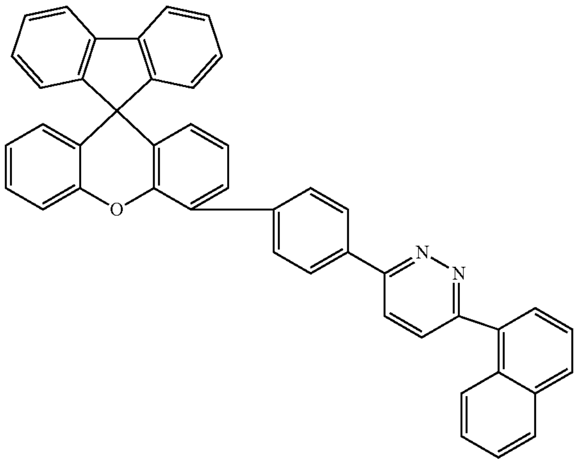

-continued
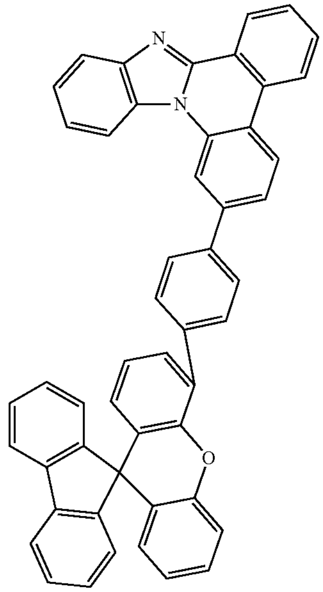
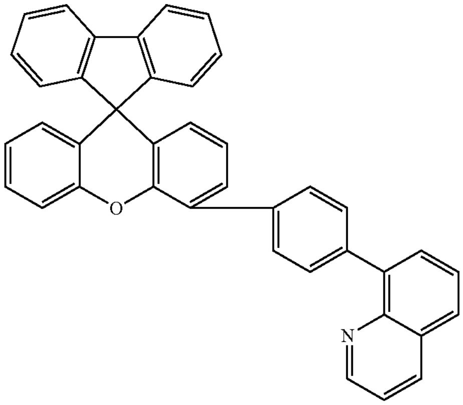
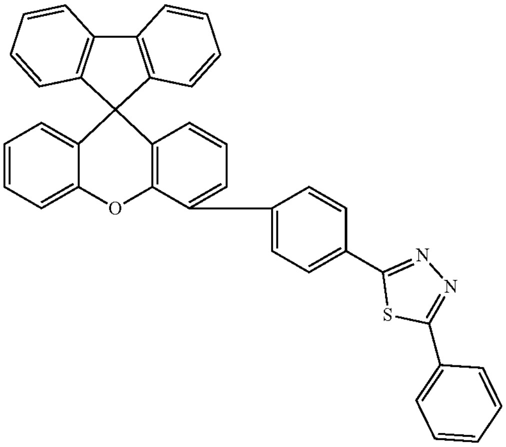
-continued
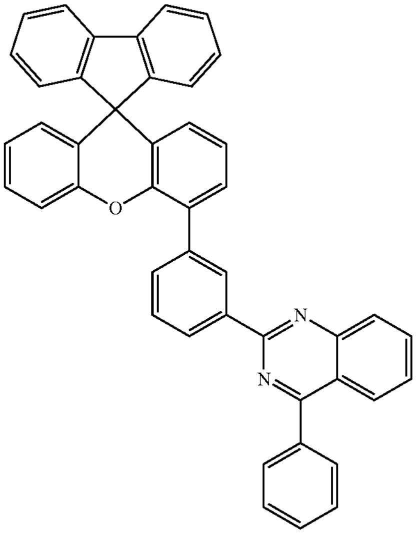
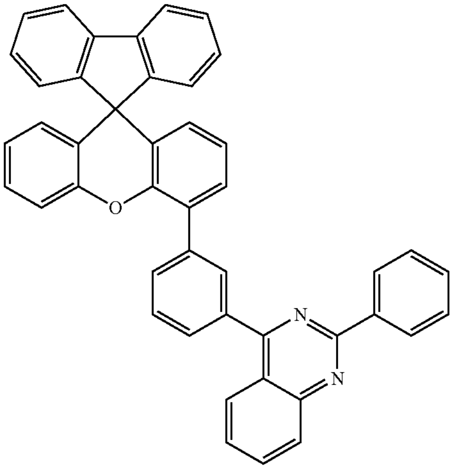
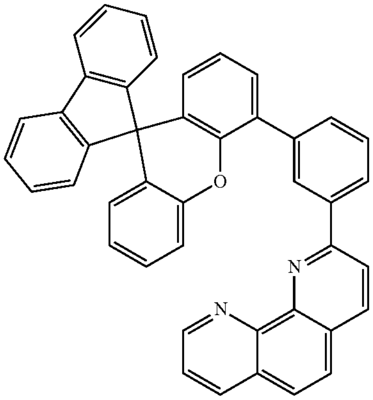

-continued
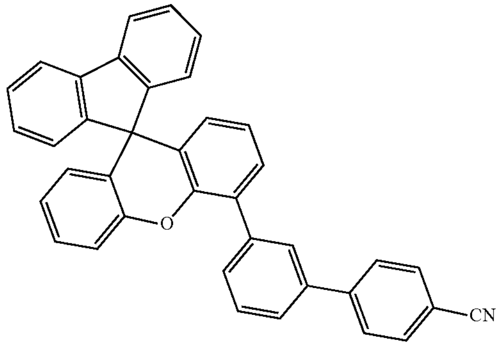
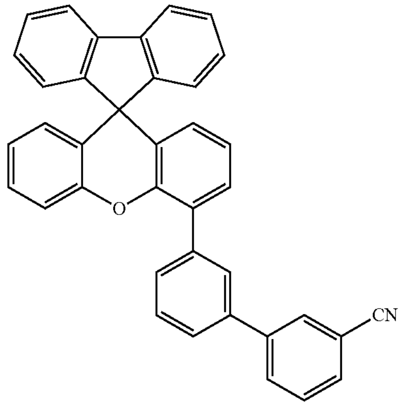
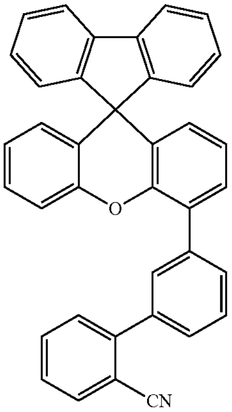
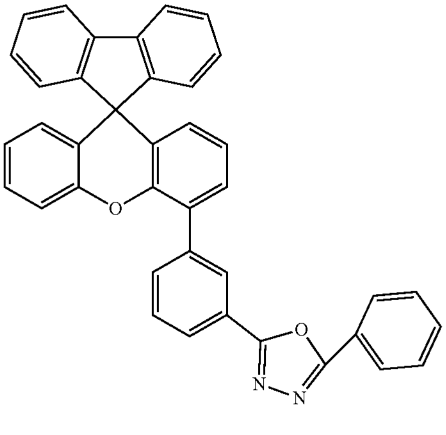
-continued
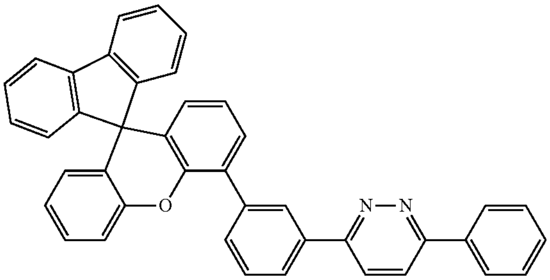
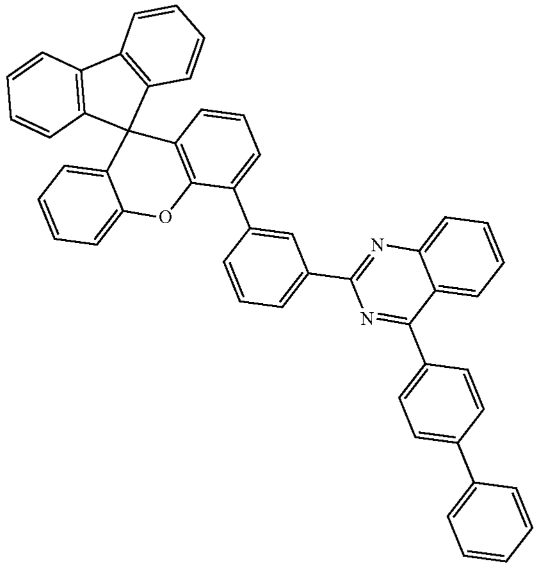
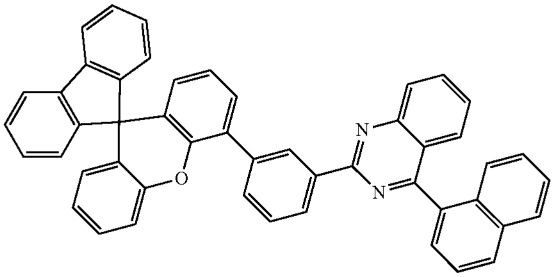
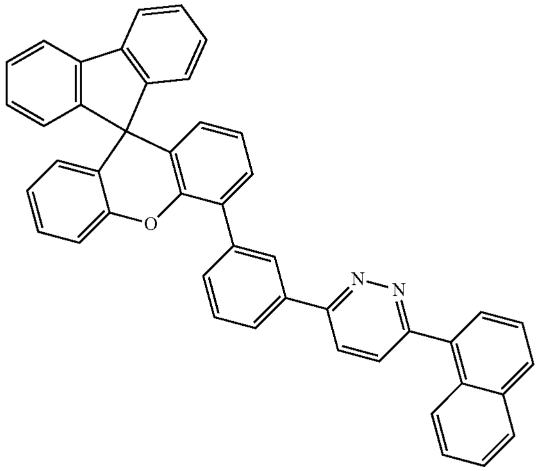

-continued
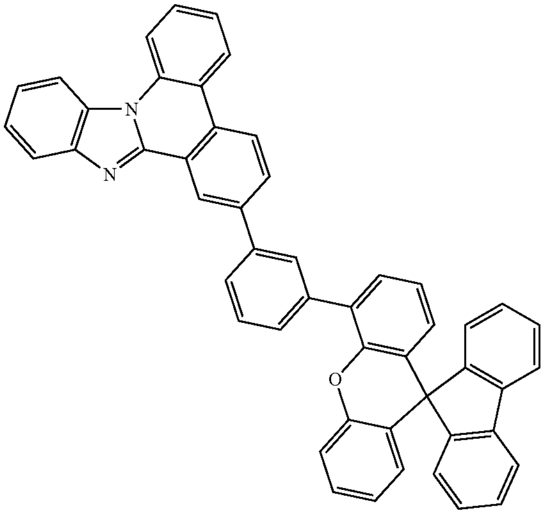
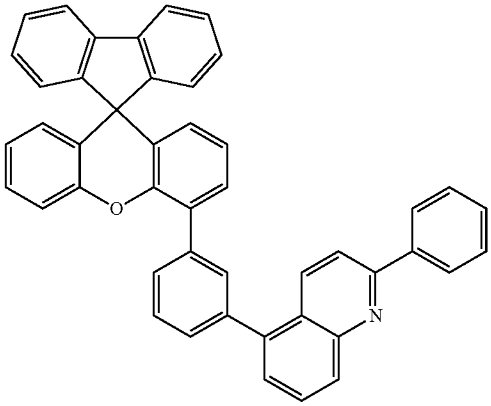
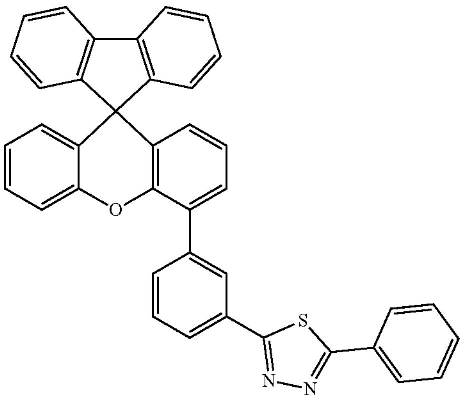
-continued
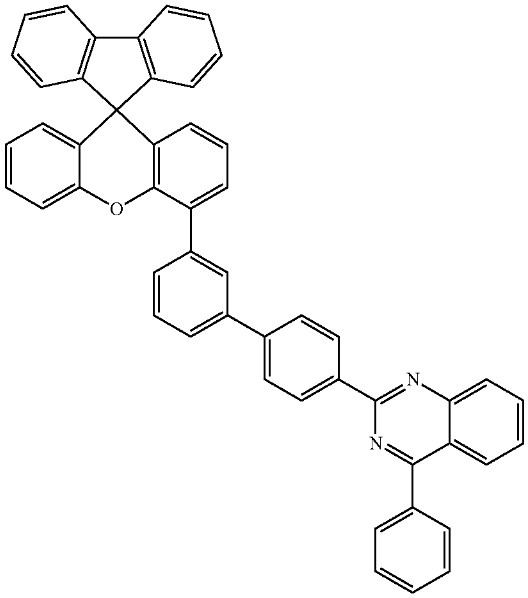
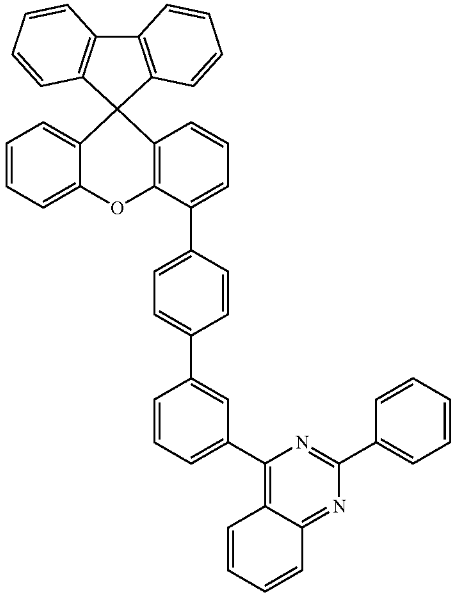
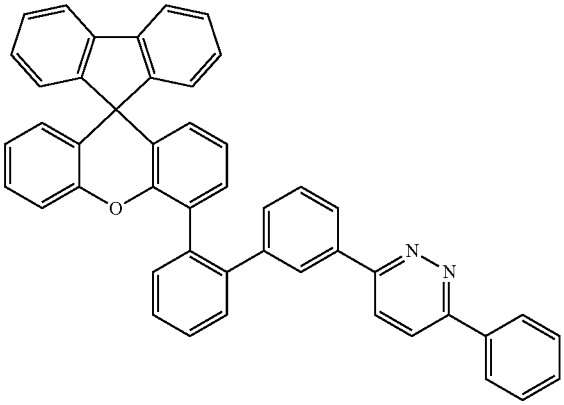

-continued
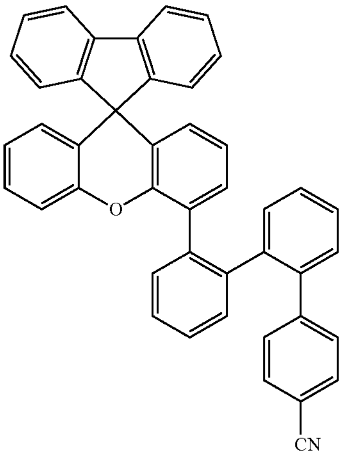
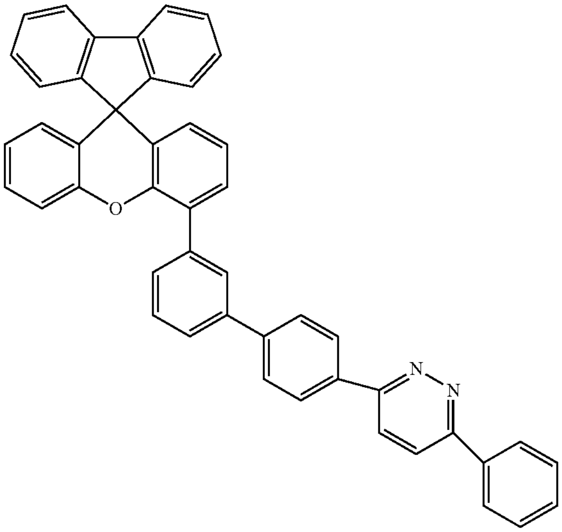
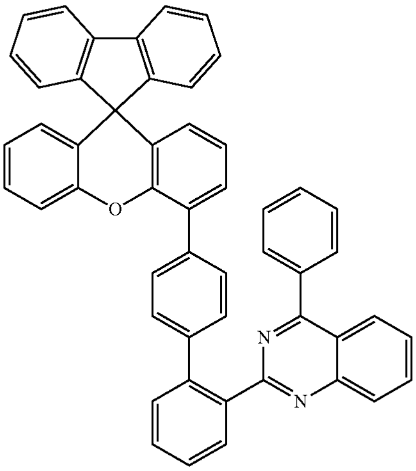
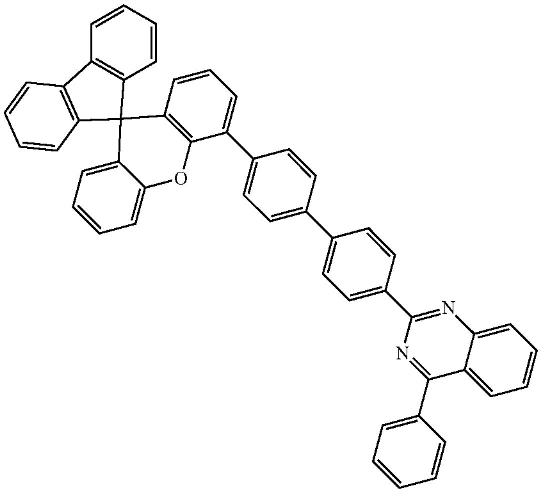
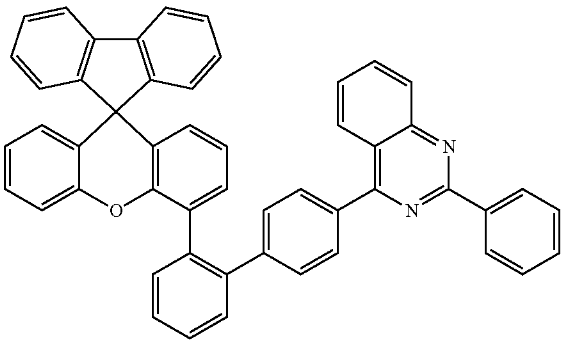
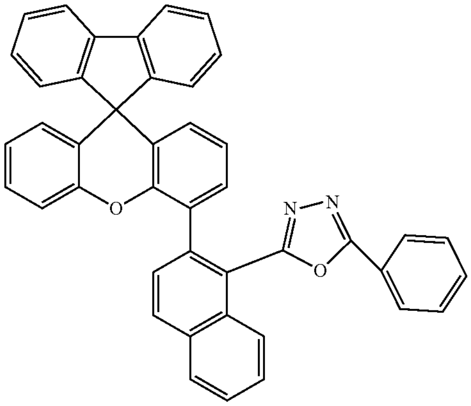
-continued -continued
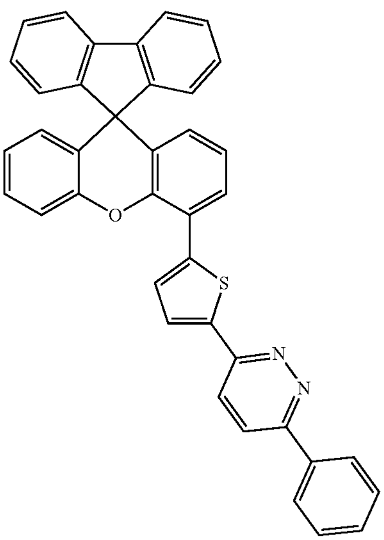
-continued
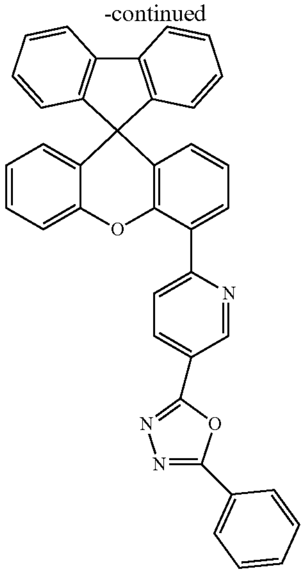
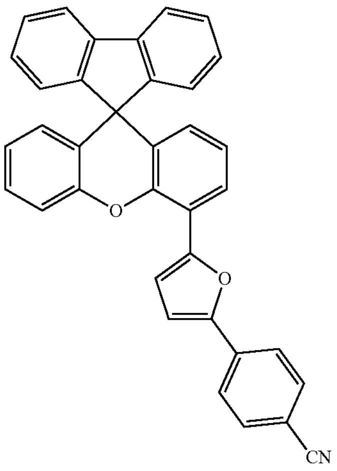
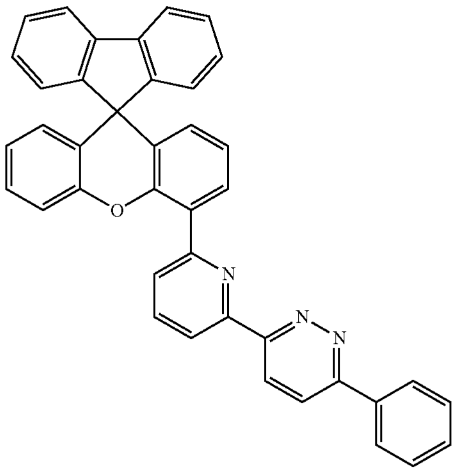
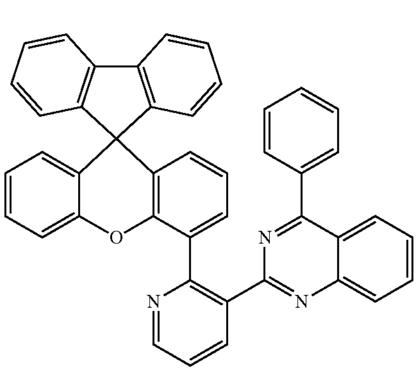
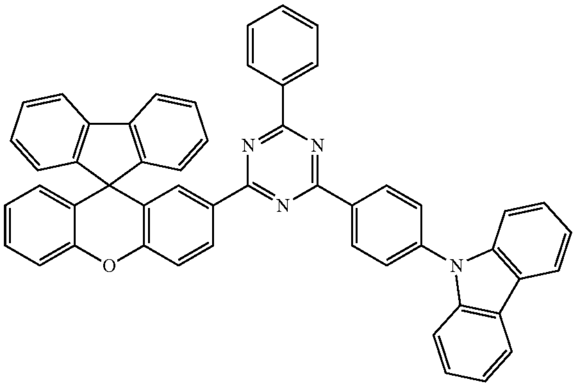

-continued
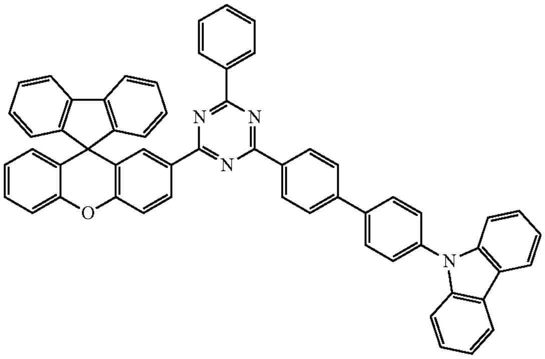
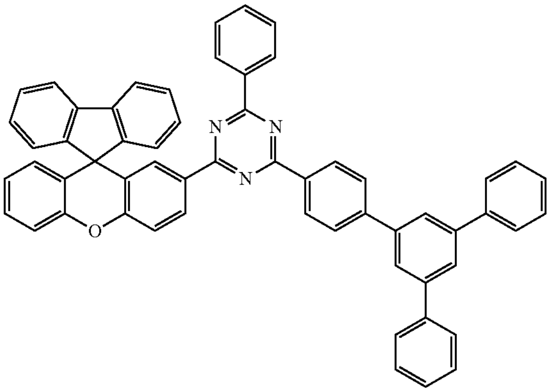
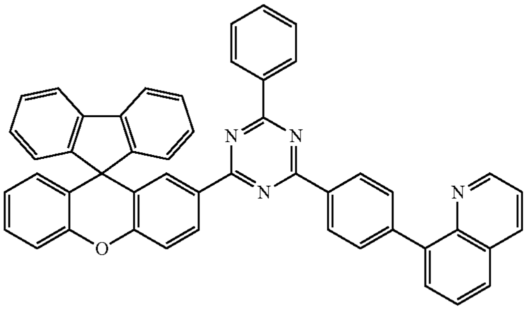
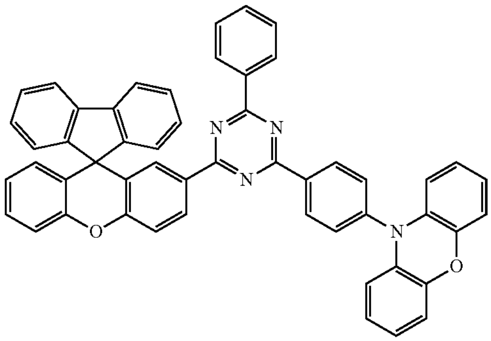
-continued
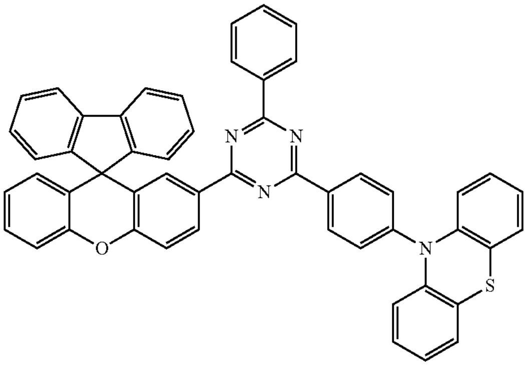
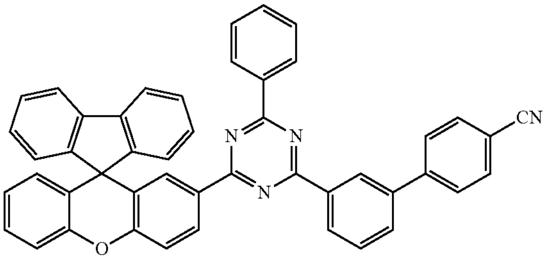
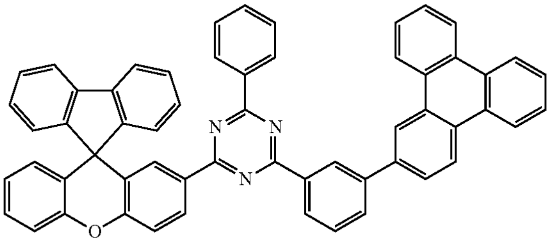
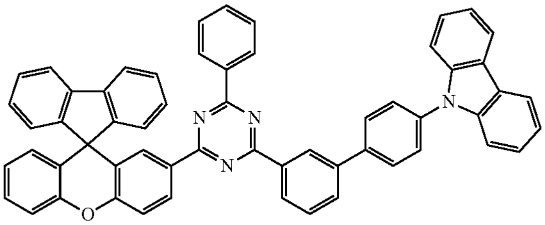
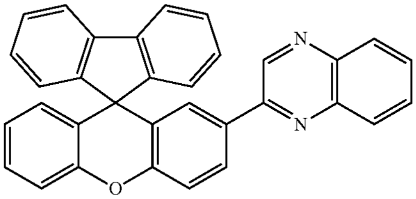
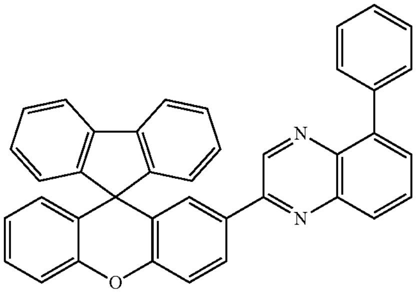

-continued
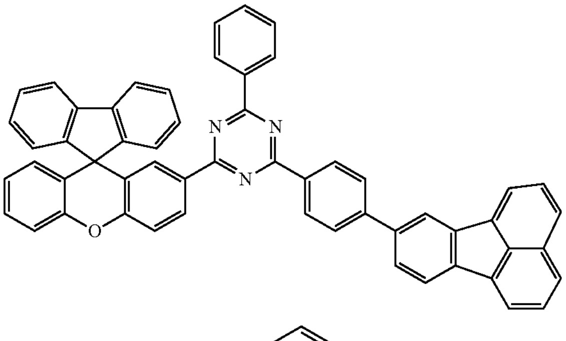
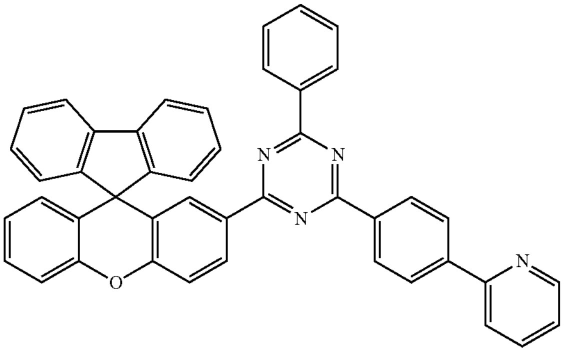
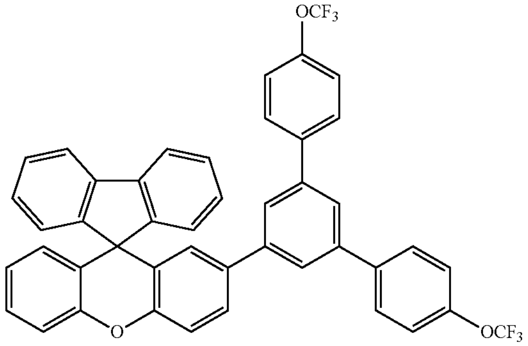
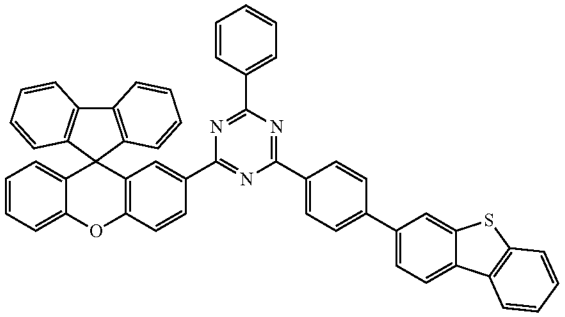
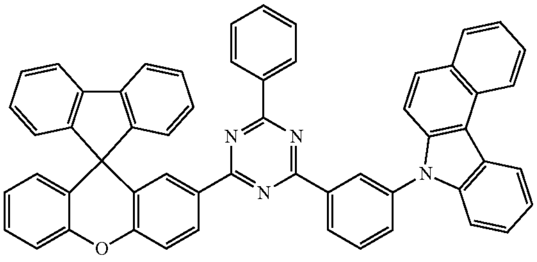
-continued
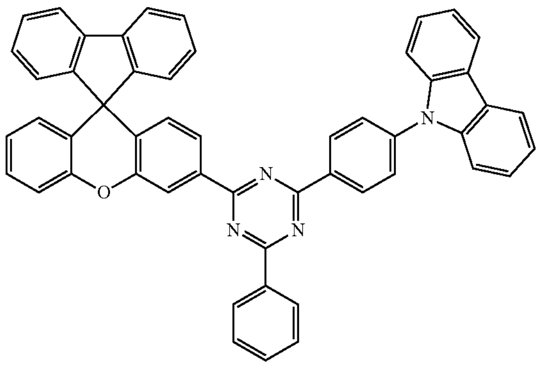
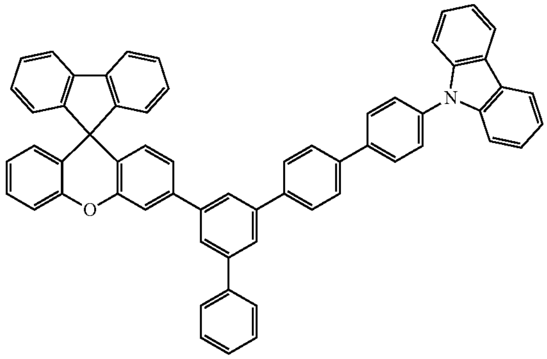
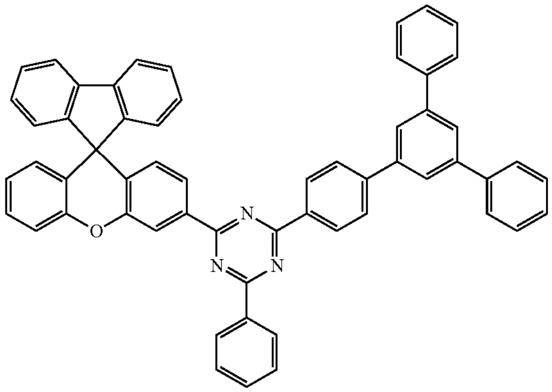
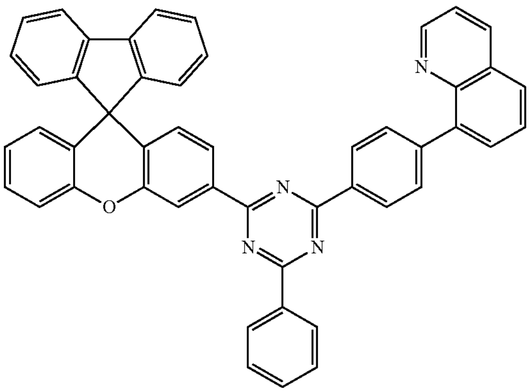

-continued
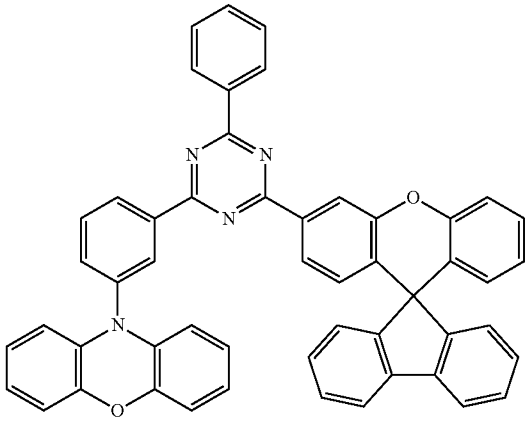
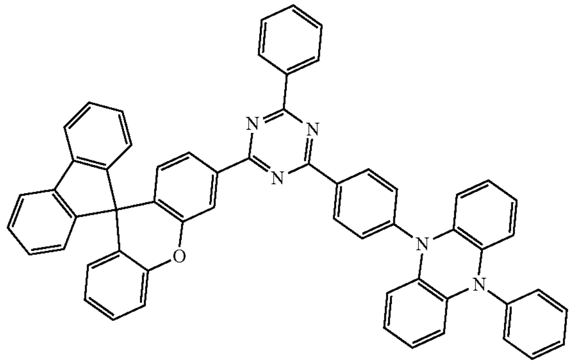
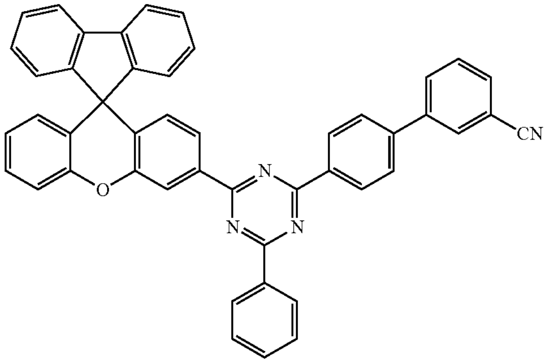
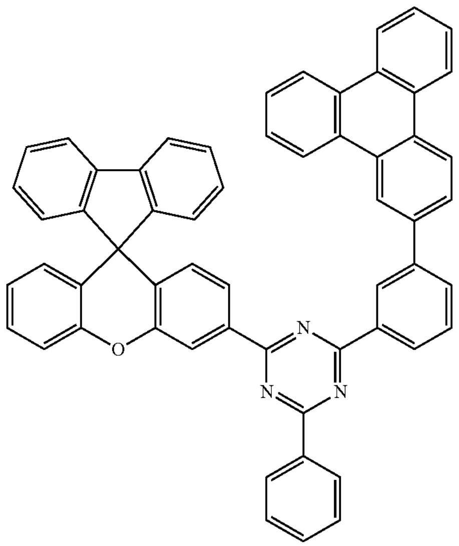
-continued
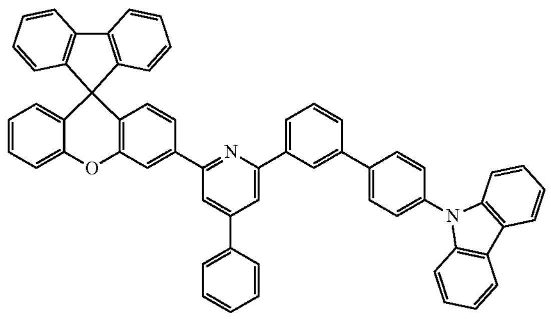
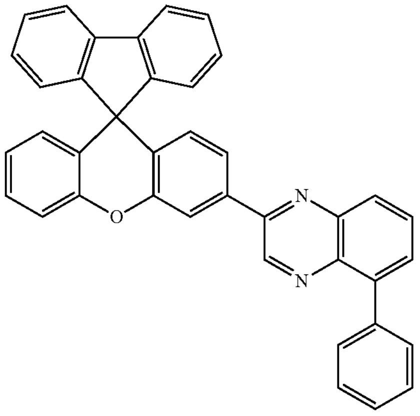
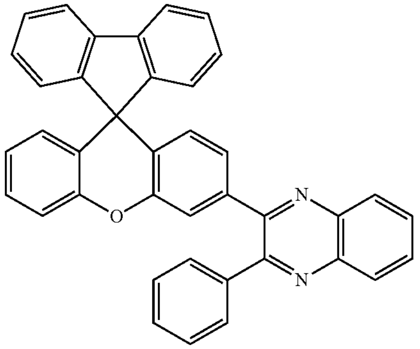
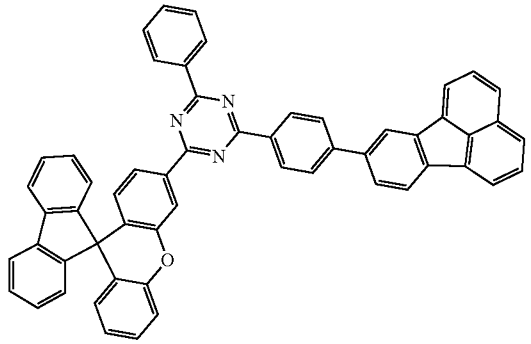

-continued
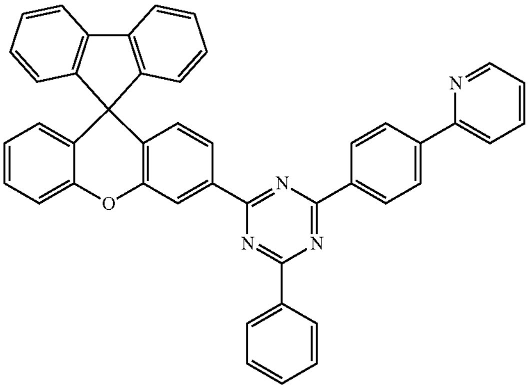
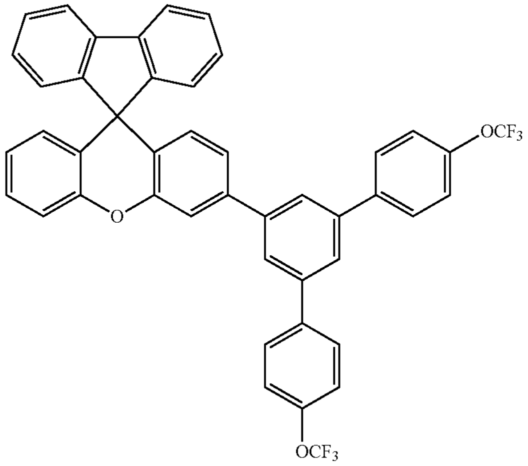
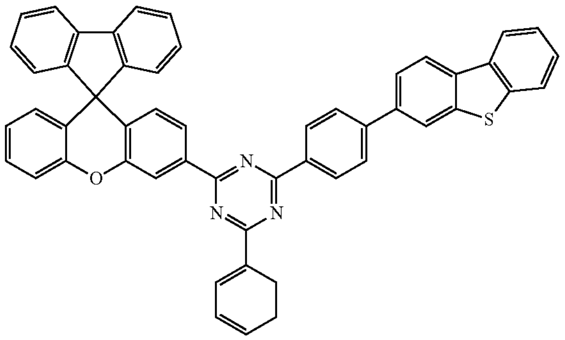
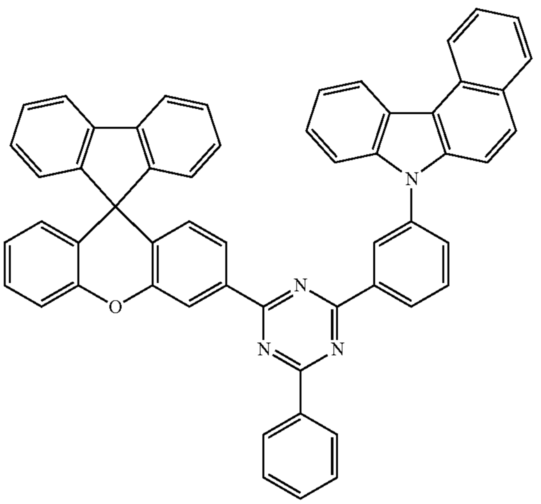
-continued
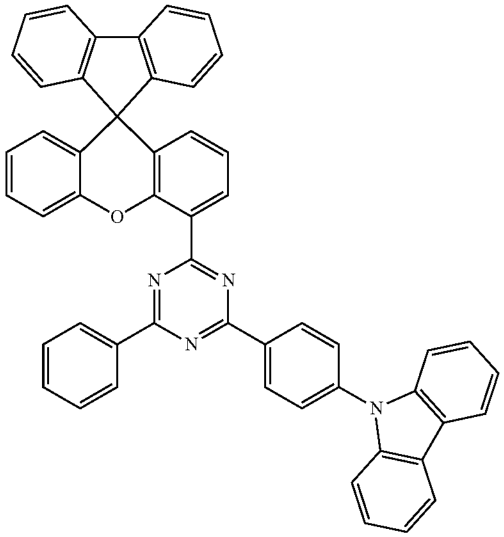
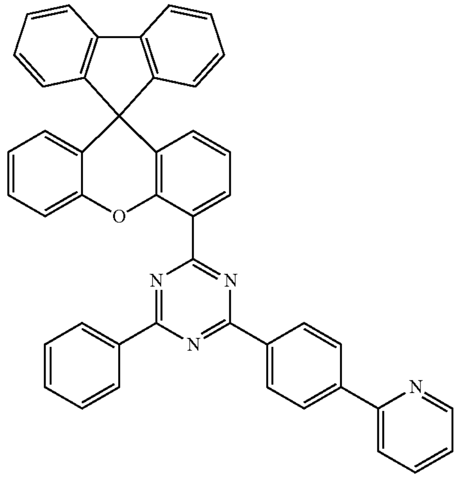
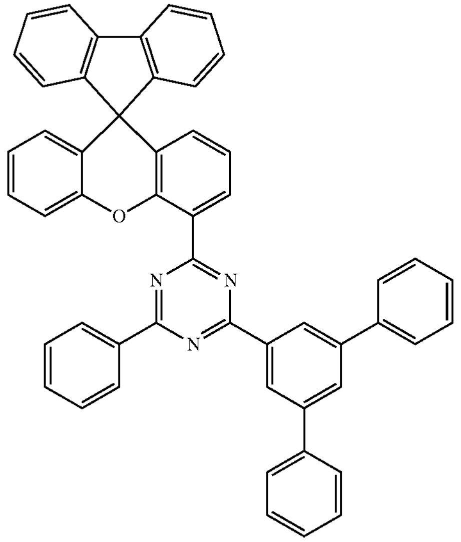

-continued
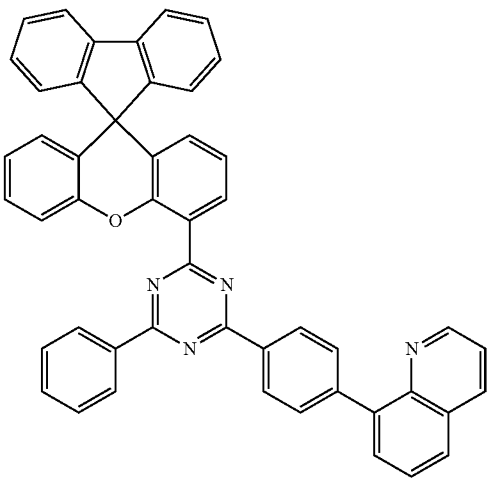
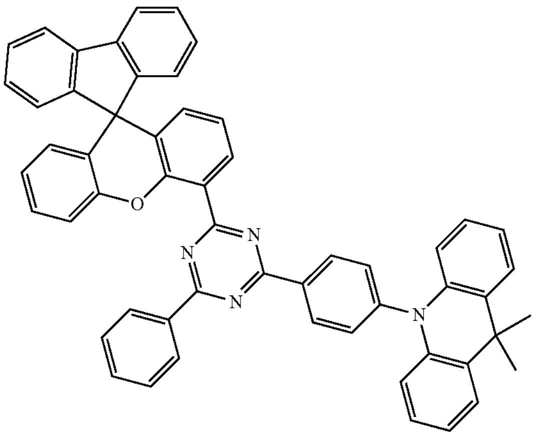
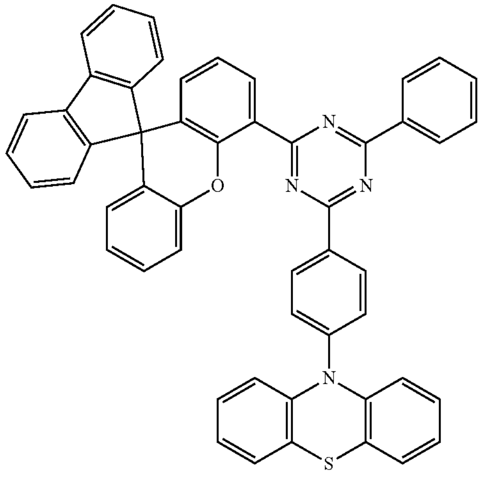
-continued
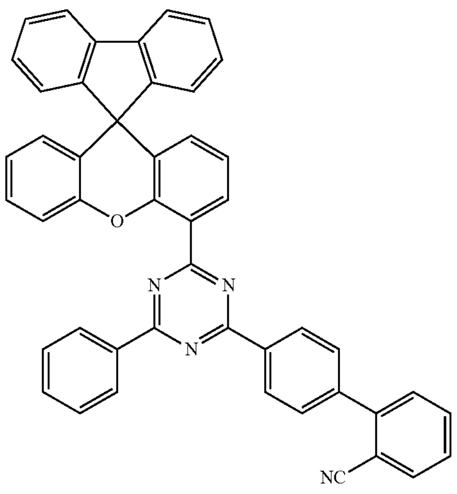
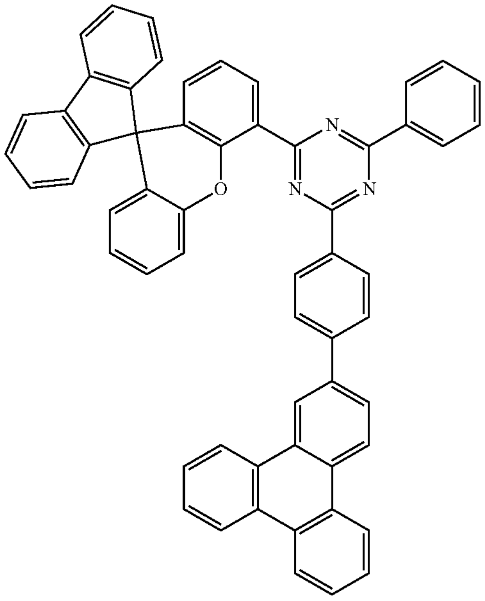
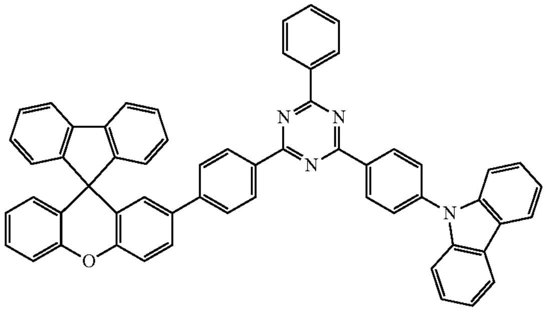

-continued
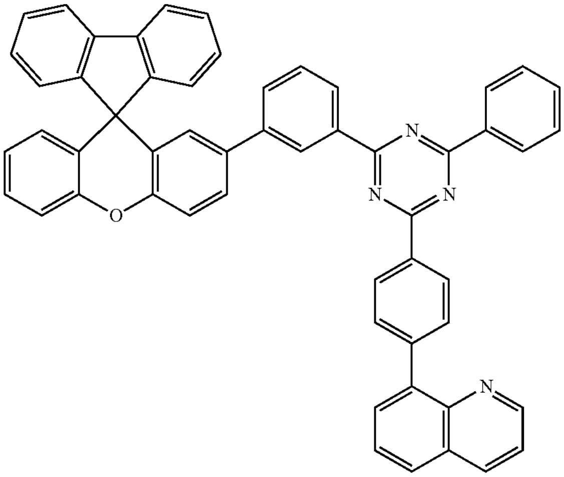
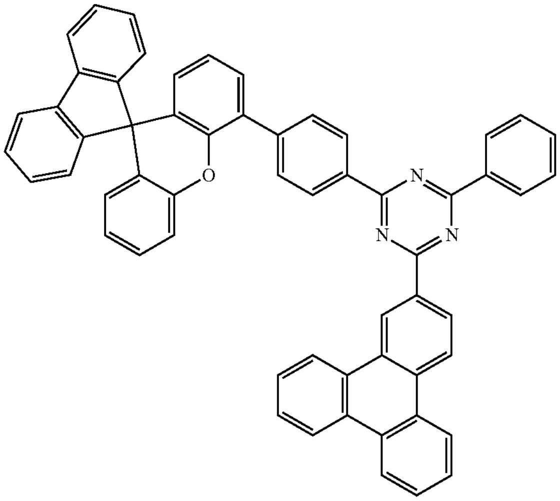
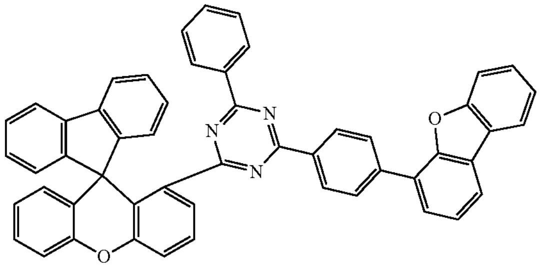
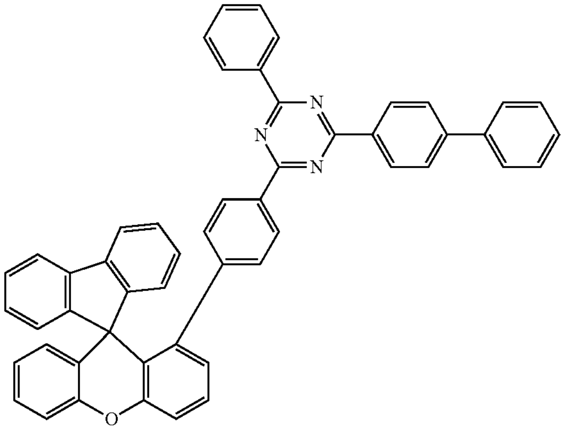
-continued
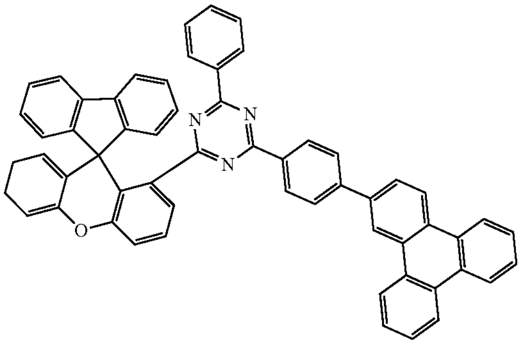
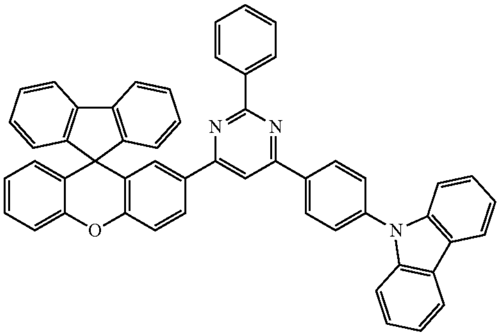
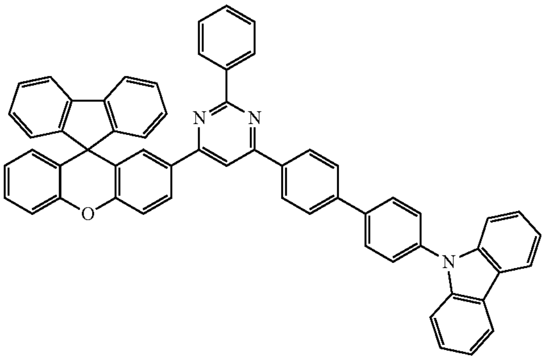
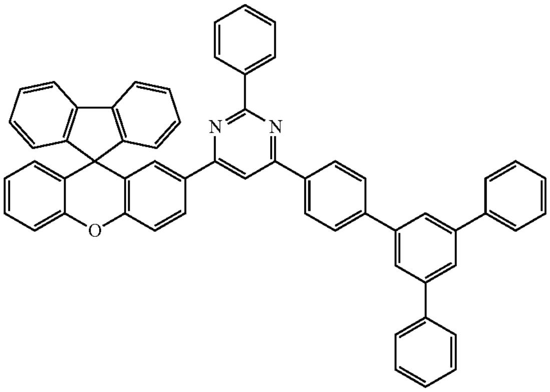

-continued
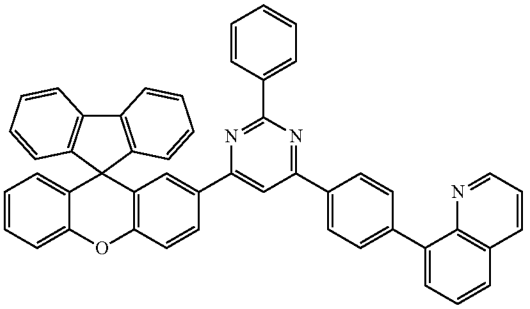
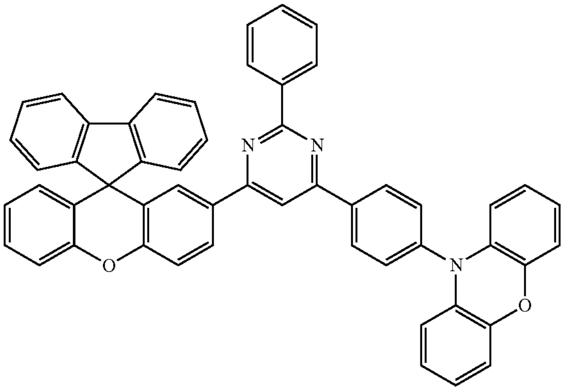
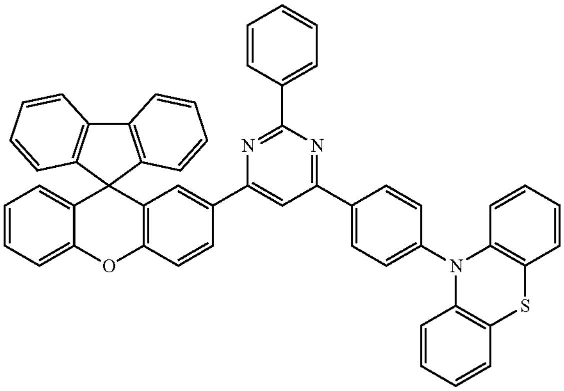
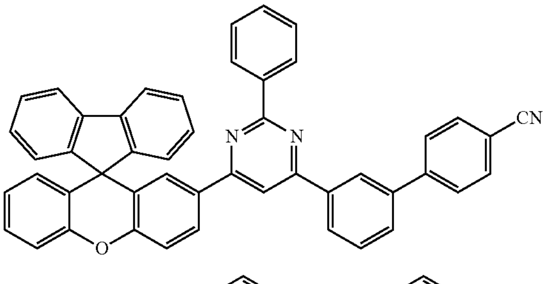
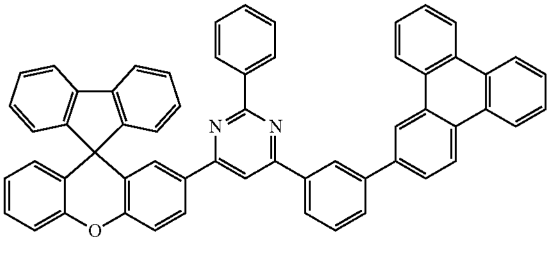
-continued
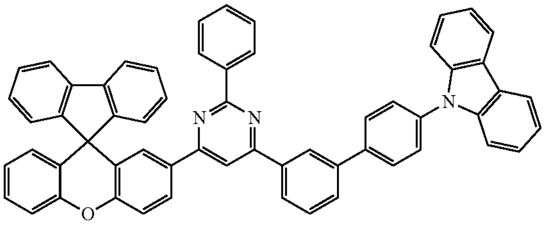
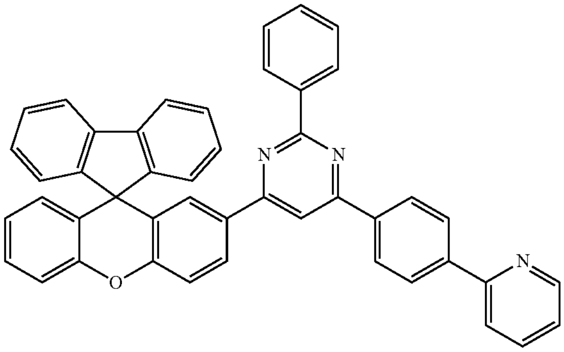
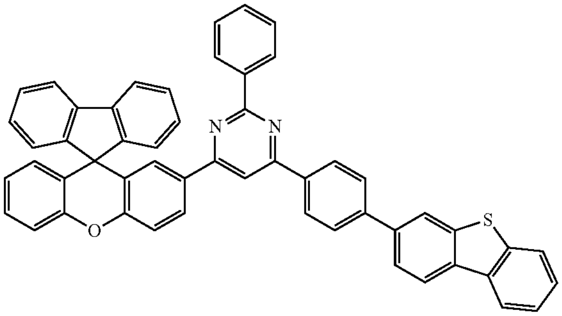
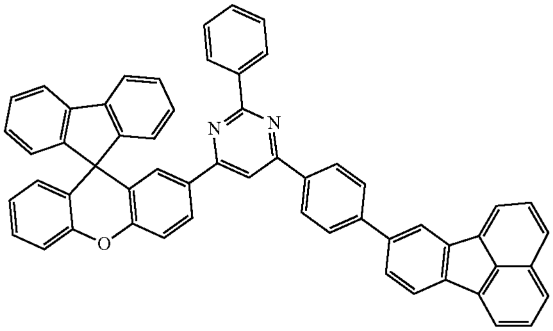
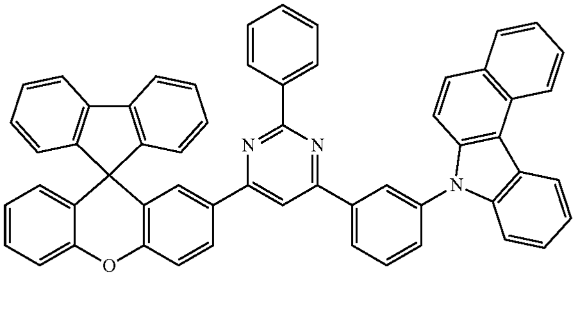

-continued

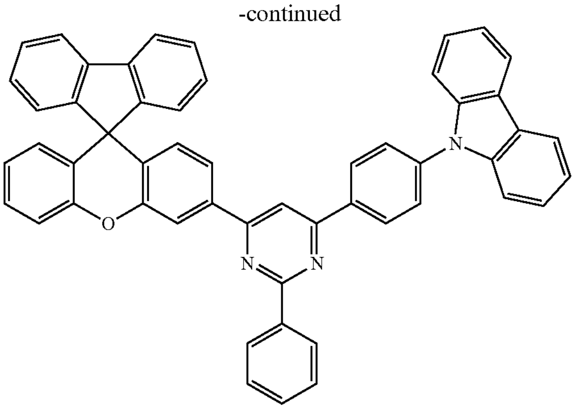

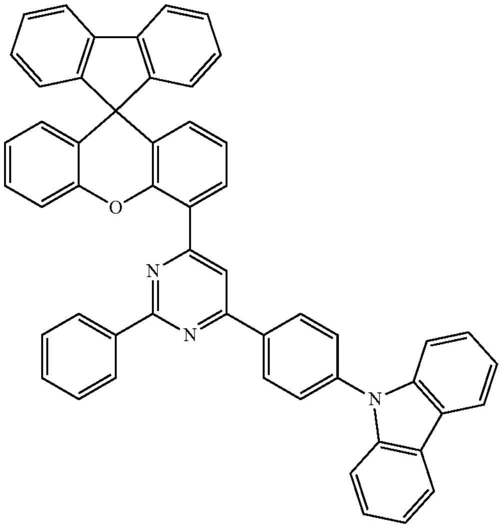

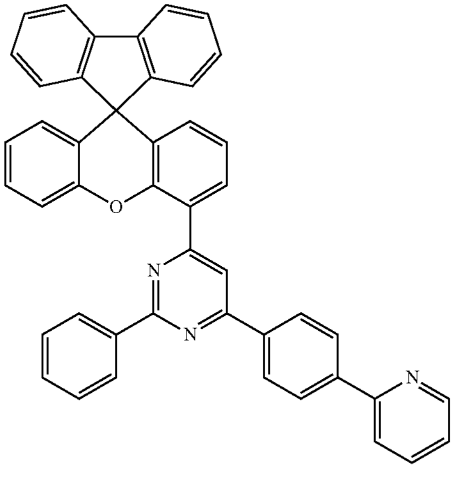

-continued

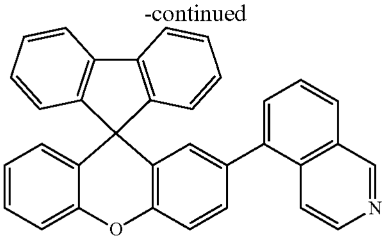

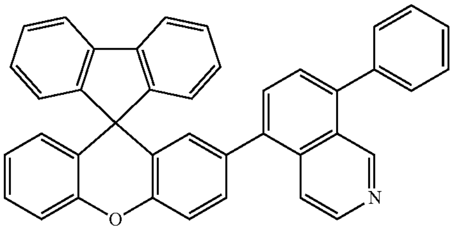

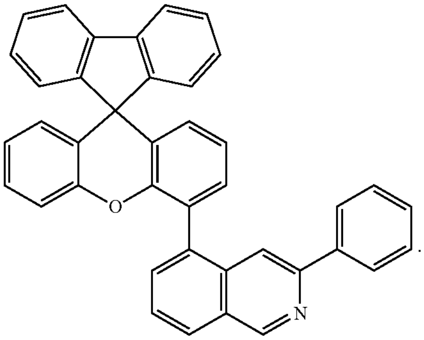

16. The organic light emitting device of claim 12, wherein the first organic material layer is composed of one to three layers.

17. The organic light emitting device of claim 16, wherein:

the first organic material layer comprises a hole adjusting layer;

the hole adjusting layer comprises the compound of Formula 1; and when the hole adjusting layer is composed of two or more layers, the respective layers each independently include the compound of Formula 1 identically or differently.

18. The organic light emitting device of claim 17, wherein:

the second organic material layer comprises an electron adjusting layer; and the electron adjusting layer comprises the compound of Formula 2.

* * * * *